US011726184B2

(12) United States Patent
Ferreira et al.

(10) Patent No.: US 11,726,184 B2
(45) Date of Patent: Aug. 15, 2023

(54) COMPONENT FOR A LIDAR SENSOR SYSTEM, LIDAR SENSOR SYSTEM, LIDAR SENSOR DEVICE, METHOD FOR A LIDAR SENSOR SYSTEM AND METHOD FOR A LIDAR SENSOR DEVICE

(71) Applicant: LeddarTech Inc., Quebec (CA)

(72) Inventors: Ricardo Ferreira, Ottobrunn (DE); Stefan Hadrath, Falkensee (DE); Peter Hoehmann, Berlin (DE); Herbert Kaestle, Traunstein (DE); Florian Kolb, Jena (DE); Norbert Magg, Berlin (DE); Jiye Park, Munich (DE); Tobias Schmidt, Garching (DE); Martin Schnarrenberger, Berlin (DE); Norbert Haas, Langenau (DE); Helmut Horn, Achberg (DE); Bernhard Siessegger, Unterschleissheim (DE); Guido Angenendt, Munich (DE); Charles Braquet, Munich (DE); Gerhard Maierbacher, Munich (DE); Oliver Neitzke, Berlin (DE); Sergey Khrushchev, Regensburg (DE)

(73) Assignee: LeddarTech Inc., Quebec (CA)

( * ) Notice: Subject to any disclaimer, the term of this patent is extended or adjusted under 35 U.S.C. 154(b) by 559 days.

(21) Appl. No.: 16/809,587

(22) Filed: Mar. 5, 2020

(65) Prior Publication Data

US 2020/0284883 A1 Sep. 10, 2020

(30) Foreign Application Priority Data

Mar. 8, 2019 (DE) ..................... 10 2019 203 175.7
Apr. 16, 2019 (DE) ..................... 10 2019 205 514.1

(Continued)

(51) Int. Cl.
*G01S 7/481* (2006.01)
*G01S 17/931* (2020.01)
*G01S 7/484* (2006.01)

(52) U.S. Cl.
CPC ........... *G01S 7/4817* (2013.01); *G01S 7/484* (2013.01); *G01S 7/4811* (2013.01);
(Continued)

(58) Field of Classification Search
CPC .... G01S 7/4817; G01S 7/4811; G01S 7/4815; G01S 7/4816; G01S 7/484; G01S 17/931;
(Continued)

(56) References Cited

U.S. PATENT DOCUMENTS

2013/0234029 A1* 9/2013 Bikumandla ......... H01L 25/043 257/432
2015/0362587 A1* 12/2015 Rogan .................. G01S 7/4972 702/104

(Continued)

FOREIGN PATENT DOCUMENTS

CN 109541569 A 3/2019
DE 102017208052 A1 11/2018

(Continued)

OTHER PUBLICATIONS

Knoll, Bernhard, International Search Report and Written Opinion of the International Searching Authority, for counterpart application PCT/EP2020/055774, datedAug. 19, 2020, European Patent Office, Rijswijk, The Netherlands, 6 pages.

(Continued)

*Primary Examiner* — Jared Walker
(74) *Attorney, Agent, or Firm* — Fish & Richardson P.C.

(57) ABSTRACT

The present disclosure relates to various embodiments of an optical component for a LIDAR Sensor System. The optical component may include an optical element having a first (Continued)

main surface and a second main surface opposite to the first main surface, a first lens array formed on the first main surface, and/or a second lens array formed on the second main surface. The optical element has a curved shape in a first direction of the LIDAR Sensor System.

26 Claims, 321 Drawing Sheets

(30) Foreign Application Priority Data

| | | |
|---|---|---|
| May 14, 2019 | (DE) | 10 2019 206 939.8 |
| Jun. 12, 2019 | (DE) | 10 2019 208 489.3 |
| Jul. 17, 2019 | (DE) | 10 2019 210 528.9 |
| Sep. 2, 2019 | (DE) | 10 2019 213 210.3 |
| Sep. 23, 2019 | (DE) | 10 2019 214 455.1 |
| Oct. 24, 2019 | (DE) | 10 2019 216 362.9 |
| Nov. 6, 2019 | (DE) | 10 2019 217 097.8 |
| Nov. 22, 2019 | (DE) | 10 2019 218 025.6 |
| Dec. 17, 2019 | (DE) | 10 2019 219 775.2 |
| Jan. 24, 2020 | (DE) | 10 2020 200 833.7 |
| Feb. 10, 2020 | (DE) | 10 2020 201 577.5 |
| Feb. 17, 2020 | (DE) | 10 2020 201 900.2 |
| Feb. 25, 2020 | (DE) | 10 2020 202 374.3 |

(52) U.S. Cl.
CPC .......... *G01S 7/4815* (2013.01); *G01S 7/4816* (2013.01); *G01S 17/931* (2020.01)

(58) Field of Classification Search
CPC ...... G01S 7/4863; G01S 7/4914; G01S 17/10; G01S 17/36; G01S 17/86; G01S 17/894; G01S 7/4865; H01L 27/14645; H01L 27/14649; H01L 27/14665
See application file for complete search history.

(56) References Cited

U.S. PATENT DOCUMENTS

| | | | | |
|---|---|---|---|---|
| 2015/0378012 | A1* | 12/2015 | Sayyah | G01S 17/89 438/25 |
| 2017/0307736 | A1* | 10/2017 | Donovan | G01S 7/4815 |
| 2017/0307759 | A1* | 10/2017 | Pei | B60R 11/04 |
| 2017/0372602 | A1* | 12/2017 | Gilliland | G01S 17/86 |
| 2018/0095304 | A1* | 4/2018 | Irish | G01J 3/44 |
| 2018/0329065 | A1* | 11/2018 | Pacala | H01L 31/107 |

FOREIGN PATENT DOCUMENTS

| | | | |
|---|---|---|---|
| DE | 102017213298 | A1 | 2/2019 |
| DE | 102017213465 | A1 | 2/2019 |
| DE | 102017216198 | A1 | 3/2019 |
| DE | 102017127963 | A1 | 5/2019 |
| DE | 102019001005 | A1 | 8/2019 |
| WO | 2017024121 | A1 | 2/2017 |

OTHER PUBLICATIONS

Takemoto, Y., et al., "Multi-Storied Photodiode CMOS Image Sensor for Multiband Imaging with 3D Technology", 2015 IEEE International Electron Devices Meeting (IEDM), IEEE, Dec. 7, 2015 (Dec. 7, 2015), XP032865656 (4 pages).
Vornicu, et al., "A CMOS Imager for Time-of-Flight and Photon Counting Based on Single Photon Avalanche Diodes and In-Pixel Time-to-Digital Converters," Romanian Journal of Information Science and Technology, vol. 17, No. 4, 2014, 353-371 (19 pages).
Foveon X3 Sensor, Wikipedia, https://en.wikipedia.org/wiki/Foveon_X3_sensor, downloaded May 5, 2020 (7 pages).
The Digitalization of Light Can Be Experienced Live, Hellar Press Release, Sep. 12, 2017, available at https://www.hella.com/hella-com/en/press/Technology-Products-12-09-2017-15966.html (2 pages).
Jeong, et al., "Review of CMOS Integrated Circuit Technologies for High-Speed Photo-Detection," Sensors 17 (9):1962, 2017 (39 pages).
Machine Translation of 109541569CN.
Machine Translation of 102017127963DE.
Machine Translation of 102017208052DE.
Machine Translation of 102017213298DE.
Machine Translation of 102017213465DE.
Machine Translation of 102017216198DE.
Machine Translation of 102019001005DE.

* cited by examiner

14714

| Frequency [MHz] | Wave5 (14704) | Wave6 (14706) | Wave7 (14708) | Wave8 (14710) |
|---|---|---|---|---|
| 1.22 | Y | Y | Y | Y |
| 2.44 | Y | Y | Y | Y |
| 3.62 | Y | Y | Y | Y |
| 4.88 | Y | Y | Y | Y |
| 6.10 | Y | Y | Y | Y |
| 7.32 | Y | Y | Y | Y |
| 8.54 | N | Y | N | Y |
| 9.76 | N | Y | N | Y |
| 10.99 | Y | Y | N | N |
| 12.21 | Y | Y | N | Y |
| 13.43 | N | Y | N | Y |
| 14.65 | N | Y | N | Y |
| 15.87 | N | Y | N | Y |
| 17.09 | N | Y | N | Y |
| 18.31 | N | Y | N | Y |
| 19.53 | N | Y | N | Y |

FIG. 147C 14728 14718 14720 14722 14724

| Frequency [MHz] | Wave10 | Wave11 | Wave12 | Wave13 |
|---|---|---|---|---|
| 1.22 | Y | Y | Y | Y |
| 2.44 | Y | Y | Y | Y |
| 3.62 | Y | Y | Y | Y |
| 4.88 | Y | Y | Y | Y |
| 6.10 | N | Y | N | Y |
| 7.32 | Y | Y | Y | Y |
| 8.54 | Y | Y | Y | Y |
| 9.76 | Y | Y | Y | Y |
| 10.99 | Y | Y | Y | Y |
| 13.43 | Y | Y | Y | Y |
| 14.65 | Y | Y | Y | Y |
| 15.87 | Y | Y | Y | Y |
| 17.09 | Y | Y | Y | Y |
| 18.31 | Y | Y | Y | Y |
| 19.53 | Y | Y | Y | Y |
| 20.75 | N | Y | N | Y |
| 24.41 | N | Y | N | Y |
| 25.63 | N | Y | N | Y |
| 30.52 | N | Y | N | Y |
| 31.74 | N | Y | N | Y |
| 32.96 | N | Y | N | Y |
| 34.18 | N | N | N | Y |

| Frequency [MHz] | Wave14 (14732) | Wave15 (14734) | Wave16 (14736) | Wave17 (14738) | Wave18 (14740) | Wave19 (14742) |
|---|---|---|---|---|---|---|
| 1.22 | Y | Y | Y | Y | Y | Y |
| 2.44 | Y | Y | Y | Y | Y | Y |
| 3.62 | Y | Y | Y | Y | Y | Y |
| 4.88 | Y | Y | Y | Y | Y | Y |
| 6.10 | N | N | Y | Y | Y | N |
| 7.32 | Y | Y | Y | Y | Y | Y |
| 8.54 | Y | Y | Y | Y | Y | Y |
| 9.76 | Y | Y | Y | Y | Y | Y |
| 10.99 | Y | Y | N | Y | Y | Y |
| 12.21 | N | N | Y | N | Y | N |
| 13.43 | Y | Y | Y | Y | Y | Y |
| 14.65 | Y | Y | Y | Y | Y | Y |
| 15.87 | Y | Y | Y | Y | Y | Y |
| 17.09 | Y | Y | Y | Y | Y | Y |
| 18.31 | Y | Y | Y | Y | Y | Y |
| 19.53 | Y | N | N | Y | Y | Y |
| 20.75 | N | N | N | N | N | Y |
| 21.97 | N | N | Y | Y | Y | Y |
| 23.19 | N | N | Y | N | Y | N |

| Frequency [MHz] | Wave14 (14732) | Wave15 (14734) | Wave16 (14736) | Wave17 (14738) | Wave18 (14740) | Wave19 (14742) |
|---|---|---|---|---|---|---|
| 2.85 | Y | Y | Y | Y | Y | Y |
| 5.55 | Y | Y | Y | Y | Y | Y |
| 8.40 | Y | Y | Y | Y | Y | Y |
| 11.25 | Y | Y | Y | Y | Y | Y |
| 14.10 | Y | Y | Y | Y | Y | Y |
| 16.80 | Y | Y | Y | Y | Y | Y |
| 19.25 | Y | Y | Y | Y | Y | Y |
| 22.50 | Y | Y | Y | Y | Y | Y |
| 25.35 | N | Y | Y | Y | Y | Y |
| 28.05 | Y | Y | Y | Y | Y | Y |
| 30.90 | Y | Y | N | Y | Y | Y |
| 33.75 | Y | Y | Y | Y | Y | Y |
| 36.45 | Y | Y | Y | Y | Y | Y |
| 39.30 | N | N | Y | Y | Y | Y |
| 42.15 | N | N | N | N | N | Y |
| 45.00 | N | N | N | N | N | Y |
| 47.70 | Y | Y | Y | Y | Y | Y |
| 50.55 | Y | Y | Y | Y | Y | Y |
| 53.40 | N | N | N | Y | Y | Y |
| 56.25 | N | N | Y | N | N | N |
| 61.80 | N | N | N | Y | N | Y |

| | 0 |
|---|---|
| 8 | 0 |
| 9 | 0 |
| 10 | 10 |
| 11 | 45 |
| 12 | 135 |
| 13 | 325 |
| 14 | 900 |
| 15 | 1000 |
| 16 | 700 |
| 17 | 400 |
| 18 | 200 |
| 19 | 80 |
| 20 | 20 |
| 21 | 0 |
| 22 | 0 |

17802-2, 17802v $L_1$=

| | 0 |
|---|---|
| 8 | 0 |
| 9 | 0 |
| 10 | 10 |
| 11 | 300 |
| 12 | 900 |
| 13 | 1000 |
| 14 | 800 |
| 15 | 500 |
| 16 | 400 |
| 17 | 450 |
| 18 | 650 |
| 19 | 450 |
| 20 | 0 |
| 21 | 0 |
| 22 | 0 |

17802-3, 17802v $L_2$=

| | 0 |
|---|---|
| 8 | 0 |
| 9 | 0 |
| 10 | 50 |
| 11 | 200 |
| 12 | 800 |
| 13 | 1000 |
| 14 | 800 |
| 15 | 400 |
| 16 | 800 |
| 17 | 1000 |
| 18 | 800 |
| 19 | 200 |
| 20 | 50 |
| 21 | 0 |
| 22 | 0 |

17802-4, 17802v $L_3$=

| | 0 |
|---|---|
| 8 | 0 |
| 9 | 0 |
| 10 | 10 |
| 11 | 400 |
| 12 | 650 |
| 13 | 450 |
| 14 | 400 |
| 15 | 700 |
| 16 | 900 |
| 17 | 1000 |
| 18 | 850 |
| 19 | 350 |
| 20 | 50 |
| 21 | 0 |
| 22 | 0 |

17802-5, 17802v $L_4$=

| | 0 |
|---|---|
| 8 | 0 |
| 9 | 0 |
| 10 | 10 |
| 11 | 100 |
| 12 | 500 |
| 13 | 1000 |
| 14 | 780 |
| 15 | 600 |
| 16 | 470 |
| 17 | 360 |
| 18 | 290 |
| 19 | 220 |
| 20 | 170 |
| 21 | 140 |
| 22 | 100 |

17802-6, 17802v $L_5$=

| | 0 |
|---|---|
| 8 | 0 |
| 9 | 10 |
| 10 | 45 |
| 11 | 135 |
| 12 | 325 |
| 13 | 605 |
| 14 | 880 |
| 15 | 1000 |
| 16 | 880 |
| 17 | 605 |
| 18 | 325 |
| 19 | 135 |
| 20 | 45 |
| 21 | 10 |
| 22 | 2 |

| | 0 |
|---|---|
| 8 | 0 |
| 9 | 0 |
| 10 | 0 |
| 11 | 273 |
| 12 | 818 |
| 13 | 909 |
| 14 | 727 |
| 15 | 455 |
| 16 | 364 |
| 17 | 409 |
| 18 | 591 |
| 19 | 409 |
| 20 | 0 |
| 21 | 0 |
| 22 | 0 |

18002

18002c

18002r

D

| | 0 | 1 | 2 | 3 | 4 | 5 |
|---|---|---|---|---|---|---|
| 7 | 0 | 0 | 0 | 0 | 0 | 0 |
| 8 | 0 | 0 | 0 | 0 | 0 | 0 |
| 9 | 0 | 0 | 0 | 0 | 0 | 10 |
| 10 | 10 | 10 | 50 | 10 | 10 | 45 |
| 11 | 45 | 300 | 200 | 400 | 100 | 135 |
| 12 | 135 | 900 | 800 | 650 | 500 | 325 |
| 13 | 325 | 1000 | 1000 | 450 | 1000 | 605 |
| 14 | 900 | 800 | 800 | 400 | 780 | 880 |
| 15 | 1000 | 500 | 400 | 700 | 600 | 1000 |
| 16 | 700 | 400 | 800 | 900 | 470 | 880 |
| 17 | 400 | 450 | 1000 | 1000 | 360 | 605 |
| 18 | 200 | 650 | 800 | 850 | 290 | 325 |
| 19 | 80 | 450 | 200 | 350 | 220 | 135 |
| 20 | 20 | 0 | 50 | 50 | 170 | 45 |
| 21 | 0 | 0 | 0 | 0 | 140 | 10 |
| 22 | 0 | 0 | 0 | 0 | 100 | 2 |
| 23 | 0 | 0 | 0 | 0 | 80 | 0 |
| 24 | 0 | 0 | 0 | 0 | 64 | 0 |

FIG. 180A 18004-1, 18004v $P_0 =$

| | 0 |
|---|---|
| 10 | -12 |
| 11 | 36 |
| 12 | -35 |
| 13 | 76 |
| 14 | -145 |
| 15 | 60 |
| 16 | 36 |
| 17 | 2 |
| 18 | -42 |
| 19 | 37 |
| 20 | 114 |
| 21 | 98 |
| 22 | 70 |
| 23 | 56 |
| 24 | 45 |

18004-2, 18004v $P_1 =$

| | 0 |
|---|---|
| 8 | 0 |
| 9 | 1 |
| 10 | 30 |
| 11 | -149 |
| 12 | -109 |
| 13 | 115 |
| 14 | 39 |
| 15 | -178 |
| 16 | 99 |
| 17 | 167 |
| 18 | -60 |
| 19 | -209 |
| 20 | 48 |
| 21 | 24 |
| 22 | 17 |

18004-3, 18004v $P_2 =$

| | 0 |
|---|---|
| 15 | 2 |
| 16 | 33 |
| 17 | -12 |
| 18 | -38 |
| 19 | -3 |
| 20 | -27 |
| 21 | -24 |
| 22 | -21 |
| 23 | -18 |
| 24 | -15 |
| 25 | -11 |
| 26 | -9 |
| 27 | -7 |
| 28 | -5 |
| 29 | -3 |

18004-4, 18004v $P_3 =$

| | 0 |
|---|---|
| 9 | 0 |
| 10 | 4 |
| 11 | 133 |
| 12 | -92 |
| 13 | -524 |
| 14 | -365 |
| 15 | 42 |
| 16 | 330 |
| 17 | 450 |
| 18 | 270 |
| 19 | -30 |
| 20 | -52 |
| 21 | -77 |
| 22 | -55 |
| 23 | -44 |

18004-5, 18004v $P_4 =$

| | 0 |
|---|---|
| 11 | -166 |
| 12 | -508 |
| 13 | -314 |
| 14 | 359 |
| 15 | 692 |
| 16 | 282 |
| 17 | -165 |
| 18 | -409 |
| 19 | -188 |
| 20 | 11 |
| 21 | 8 |
| 22 | 3 |
| 23 | 2 |
| 24 | 1 |
| 25 | 1 |

18004-6, 18004v $P_5 =$

| | 0 |
|---|---|
| 10 | 58 |
| 11 | 501 |
| 12 | 1402 |
| 13 | 1811 |
| 14 | 1829 |
| 15 | 1656 |
| 16 | 1701 |
| 17 | 1613 |
| 18 | 1330 |
| 19 | 597 |
| 20 | 132 |
| 21 | 54 |
| 22 | 37 |
| 23 | 29 |
| 24 | 23 |

FIG. 180B

COMPONENT FOR A LIDAR SENSOR SYSTEM, LIDAR SENSOR SYSTEM, LIDAR SENSOR DEVICE, METHOD FOR A LIDAR SENSOR SYSTEM AND METHOD FOR A LIDAR SENSOR DEVICE

RELATED APPLICATIONS

The present application claims priority from German Application No.: 10 2019 205 514.1, filed on Apr. 16, 2019, German Application No.: 10 2019 214 455.1, filed on Sep. 23, 2019, German Application No.: 10 2019 216 362.9, filed on Oct. 24, 2019, German Application No.: 10 2020 201 577.5, filed on Feb. 10, 2020, German Application No.: 10 2019 217 097.8, filed on Nov. 6, 2019, German Application No.: 10 2020 202 374.3, filed on Feb. 25, 2020, German Application No.: 10 2020 201 900.2, filed on Feb. 17, 2020, German Application No.: 10 2019 203 175.7, filed on Mar. 8, 2019, German Application No.: 10 2019 218 025.6, filed on Nov. 22, 2019, German Application No.: 10 2019 219 775.2, filed on Dec. 17, 2019, German Application No.: 10 2020 200 833.7, filed on Jan. 24, 2020, German Application No.: 10 2019 208 489.3, filed on Jun. 12, 2019, German Application No.: 10 2019 210 528.9, filed on Jul. 17, 2019, German Application No.: 10 2019 206 939.8, filed on is May 14, 2019, and German Application No.: 10 2019 213 210.3, filed on Sep. 2, 2019, the contents of each of the above-identified applications are incorporated herein by reference in their entirety.

TECHNICAL FIELD

The technical field of the present disclosure relates generally to light detection and ranging (LIDAR) systems and methods that use light detection and ranging technology. This disclosure is focusing on Components for LIDAR Sensor Systems, LIDAR Sensor Systems, LIDAR Sensor Devices and on Methods for LIDAR Sensor Systems or LIDAR Sensor Devices.

BACKGROUND

There are numerous studies and market forecasts, which predict that future mobility and transportation will shift from vehicles supervised by a human operator to vehicles with an increasing level of autonomy towards fully autonomous, self-driving vehicles. This shift, however, will not be an abrupt change but rather a gradual transition with different levels of autonomy, defined for example by SAE International (Society of Automotive Engineers) in SAE J3016 in-between. Furthermore, this transition will not take place in a simple linear manner, advancing from one level to the next level, while rendering all previous levels dispensable. Instead, it is expected that these levels of different extent of autonomy will co-exist over longer periods of time and that many vehicles and their respective sensor systems will be able to support more than one of these levels.

Depending on various factors, a human operator may actively switch for example between different SAE levels, depending on the vehicle's capabilities, or the vehicles operation system may request or initiate such a switch, typically with a timely information and acceptance period to possible human operators of the vehicles. These factors may include internal factors such as individual preference, level of driving experience or the biological state of a human driver and external factors such as a change of environmental conditions like weather, traffic density or unexpected traffic complexities.

It is important to note that the above-described scenario for a future is not a theoretical, far-away eventuality. In fact, already today, a large variety of so-called Advanced Driver Assistance Systems (ADAS) has been implemented in modern vehicles, which clearly exhibit characteristics of autonomous vehicle control. Current ADAS systems may be configured for example to alert a human operator in dangerous situations (e.g. lane departure warning) but in specific driving situations, some ADAS systems are able to takeover control and perform vehicle steering operations without active selection or intervention by a human operator. Examples may include convenience-driven situations such as adaptive cruise control but also hazardous situations like in the case of lane keep assistants and emergency break assistants.

The above-described scenarios all require vehicles and transportation systems with a tremendously increased capacity to perceive, interpret and react on their surroundings. Therefore, it is not surprising that remote environmental sensing systems will be at the heart of future mobility.

Since modern traffic can be extremely complex due to a large number of heterogeneous traffic participants, changing environments or insufficiently mapped or even unmapped environments, and due to rapid, interrelated dynamics, such sensing systems will have to be able to cover a broad range of different tasks, which have to be performed with a high level of accuracy and reliability. It turns out that there is not a single "one fits all" sensing system that can meet all the required features relevant for semi-autonomous or fully autonomous vehicles. Instead, future mobility requires different sensing technologies and concepts with different advantages and disadvantages. Differences between sensing systems may be related to perception range, vertical and horizontal field of view (FOV), spatial and temporal resolution, speed of data acquisition, etc. Therefore, sensor fusion and data interpretation, possibly assisted by Deep Neuronal Learning (DNL) methods and other Neural Processor Units (NFU) methods for more complex tasks, like judgment of a traffic situation and generation of derived vehicle control functions, may be necessary to cope with such complexities. Furthermore, driving and steering of autonomous vehicles may require a set of ethical rules and commonly accepted traffic regulations.

Among these sensing systems, LIDAR sensing systems are expected to play a vital role, as well as camera-based systems, possibly supported by radar and ultrasonic systems. With respect to a specific perception task, these systems may operate more or less independently of each other. However, in order to increase the level of perception (e.g. in terms of accuracy and range), signals and data acquired by different sensing systems may be brought together in so-called sensor fusion systems. Merging of sensor data is not only necessary to refine and consolidate the measured results but also to increase the confidence in sensor results by resolving possible inconsistencies and contradictories and by providing a certain level of redundancy. Unintended spurious signals and intentional adversarial attacks may play a role in this context as well.

For an accurate and reliable perception of a vehicle's surrounding, not only vehicle-internal sensing systems and measurement data may be considered but also data and information from vehicle-external sources. Such vehicle-external sources may include sensing systems connected to other traffic participants, such as preceding and oncoming vehicles, pedestrians and cyclists, but also sensing systems mounted on road infrastructure elements like traffic lights, traffic signals, bridges, elements of road construction sites and central traffic surveillance structures. Furthermore, data and information may come from far-away sources such as traffic teleoperators and satellites of global positioning systems (e.g. GPS).

Therefore, apart from sensing and perception capabilities, future mobility will also heavily rely on capabilities to communicate with a wide range of communication partners. Communication may be unilateral or bilateral and may include various wireless transmission technologies, such as WLAN, Bluetooth and communication based on radio frequencies and visual or non-visual light signals. It is to be noted that some sensing systems, for example LIDAR sensing systems, may be utilized for both sensing and communication tasks, which makes them particularly interesting for future mobility concepts. Data safety and security and unambiguous identification of communication partners are examples where light-based technologies have intrinsic advantages over other wireless communication technologies. Communication may need to be encrypted and tamper-proof.

From the above description, it becomes clear also that future mobility has to be able to handle vast amounts of data, as several tens of gigabytes may be generated per driving hour. This means that autonomous driving systems have to acquire, collect and store data at very high speed, usually complying with real-time conditions. Furthermore, future vehicles have to be able to interpret these data, i.e. to derive some kind of contextual meaning within a short period of time in order to plan and execute required driving maneuvers. This demands complex software solutions, making use of is advanced algorithms. It is expected that autonomous driving systems will including more and more elements of artificial intelligence, machine and self-learning, as well as Deep Neural Networks (DNN) for certain tasks, e.g. visual image recognition, and other Neural Processor Units (NFU) methods for more complex tasks, like judgment of a traffic situation and generation of derived vehicle control functions, and the like. Data calculation, handling, storing and retrieving may require a large amount of processing power and hence electrical power.

In an attempt to summarize and conclude the above paragraphs, future mobility will involve sensing systems, communication units, data storage devices, data computing and signal processing electronics as well as advanced algorithms and software solutions that may include and offer various ethical settings. The combination of all these elements is constituting a cyber-physical world, usually denoted as the Internet of things (IoT). In that respect, future vehicles represent some kind of IoT device as well and may be called “Mobile IoT devices”.

Such “Mobile IoT devices” may be suited to transport people and cargo and to gain or provide information. It may be noted that future vehicles are sometimes also called “smartphones on wheels”, a term which surely reflects some of the capabilities of future vehicles. However, the term implies a certain focus towards consumer-related new features and gimmicks. Although these aspects may certainly play a role, it does not necessarily reflect the huge range of future business models, in particular data-driven business models, that can be envisioned only at the present moment of time but which are likely to center not only on personal, convenience driven features but include also commercial, industrial or legal aspects.

New data-driven business models will focus on smart, location-based services, utilizing for example self-learning and prediction aspects, as well as gesture and language processing with Artificial Intelligence as one of the key drivers. All this is fueled by data, which will be generated in vast amounts in automotive industry by a large fleet of future vehicles acting as mobile digital platforms and by connectivity networks linking together mobile and stationary IoT devices.

New mobility services including station-based and free-floating car sharing, as well as ride-sharing propositions have already started to disrupt traditional business fields. This trend will continue, finally providing robo-taxi services and sophisticated Transportation-as-a-Service (TaaS) and Mobility-as-a-Service (MaaS) solutions.

Electrification, another game-changing trend with respect to future mobility, has to be considered as well. Hence, future sensing systems will have to pay close attention to system efficiency, weight and energy-consumption aspects. In addition to an overall minimization of energy consumption, also context-specific optimization strategies, depending for example on situation-specific or location-specific factors, may play an important role.

Energy consumption may impose a limiting factor for autonomously driving electrical vehicles. There are quite a number of energy consuming devices like sensors, for example RADAR, LIDAR, camera, ultrasound, Global Navigation Satellite System (GNSS/GPS), sensor fusion equipment, processing power, mobile entertainment equipment, heater, fans, Heating, Ventilation and Air Conditioning (HVAC), Car-to-Car (C2C) and Car-to-Environment (C2X) communication, data encryption and decryption, and many more, all leading up to a high power consumption. Especially data processing units are very power hungry. Therefore, it is necessary to optimize all equipment and use such devices in intelligent ways so that a higher battery mileage can be sustained.

Besides new services and data-driven business opportunities, future mobility is expected also to provide a significant reduction in traffic-related accidents. Based on data from the Federal Statistical Office of is Germany (Destatis, 2018), over 98% of traffic accidents are caused, at least in part by humans. Statistics from other countries display similarly clear correlations.

Nevertheless, it has to be kept in mind that automated vehicles will also introduce new types of risks, which have not existed before. This applies to so far unseen traffic scenarios, involving only a single automated driving system as well as for complex scenarios resulting from dynamic interactions between a plurality of automated driving system. As a consequence, realistic scenarios aim at an overall positive risk balance for automated driving as compared to human driving performance with a reduced number of accidents, while tolerating to a certain extent some slightly negative impacts in cases of rare and unforeseeable driving situations. This may be regulated by ethical standards that are possibly implemented in soft- and hardware.

Any risk assessment for automated driving has to deal with both, safety and security related aspects: safety in this context is focusing on passive adversaries for example due to malfunctioning systems or system components, while security is focusing on active adversaries for example due to intentional attacks by third parties.

In the following a non-exhaustive enumeration is given for safety-related and security-related factors, with reference to “Safety first for Automated Driving”, a white paper published in 2019 by authors from various Automotive OEM, Tier-1 and Tier-2 suppliers.

Safety assessment: to meet the targeted safety goals, methods of verification and validation have to be implemented and executed for all relevant systems and components. Safety assessment may include safety by design principles, quality audits of the development and production processes, the use of redundant sensing and analysis components and many other concepts and methods.

Safe operation: any sensor system or otherwise safety-related system might be prone to degradation, i.e. system performance may decrease over time or a system may even fail completely (e.g. being unavailable). To ensure safe operation, the system has to be able to compensate for such performance losses for example via redundant sensor systems. In any case, the system has to be configured to transfer the vehicle into a safe condition with acceptable risk. One possibility may include a safe transition of the vehicle control to a human vehicle operator.

Operational design domain: every safety-relevant system has an operational domain (e.g. with respect to environmental conditions such as temperature or weather conditions including rain, snow and fog) inside which a proper operation of the system has been specified and validated. As soon as the system gets outside of this domain, the system has to be able to compensate for such a situation or has to execute a safe transition of the vehicle control to a human vehicle operator.

Safe layer: the automated driving system needs to recognize system limits in order to ensure that it operates only within these specified and verified limits. This includes also recognizing limitations with respect to a safe transition of control to the vehicle operator.

User responsibility: it must be clear at all times which driving tasks remain under the user's responsibility. In addition, the system has to be able to determine factors, which represent the biological state of the user (e.g. state of alertness) and keep the user informed about their responsibility with respect to the user's remaining driving tasks.

Human Operator-initiated handover: there have to be clear rules and explicit instructions in case that a human operator requests an engaging or disengaging of the automated driving system.

Vehicle-initiated handover: requests for such handover operations have to be clear and manageable by the human operator, including a sufficiently long time period for the operator to adapt to the current traffic situation. In case it turns out that the human operator is not available or not capable of a safe takeover, the automated driving system must be able to perform a minimal-risk maneuver.

Behavior in traffic: automated driving systems have to act and react in an easy-to-understand way so that their behavior is predictable for other road users. This may include that automated driving systems have to observe and follow traffic rules and that automated driving systems inform other road users about their intended behavior, for example via dedicated indicator signals (optical, acoustic).

Security: the automated driving system has to be protected against security threats (e.g. cyber-attacks), including for example unauthorized access to the system by third party attackers. Furthermore, the system has to be able to secure data integrity and to detect data corruption, as well as data forging. Identification of trustworthy data sources and communication partners is another important aspect. Therefore, security aspects are, in general, strongly linked to cryptographic concepts and methods.

Data recording: relevant data related to the status of the automated driving system have to be recorded, at least in well-defined cases. In addition, traceability of data has to be ensured, making strategies for data management a necessity, including concepts of bookkeeping and tagging. Tagging may comprise, for example, to correlate data with location information, e.g. GPS-information.

In the following disclosure, various aspects are disclosed which may be related to the technologies, concepts and scenarios presented in this chapter "BACKGROUND INFORMATION". This disclosure is focusing on LIDAR Sensor Systems, Controlled LIDAR Sensor Systems and LIDAR Sensor Devices as well as Methods for LIDAR Sensor Management. As illustrated in the above remarks, automated driving systems are extremely complex systems including a huge variety of interrelated sensing systems, communication units, data storage devices, data computing and signal processing electronics as well as advanced algorithms and software solutions.

SUMMARY

LIDAR Sensor System and LIDAR Sensor Device

The LIDAR Sensor System according to the present disclosure may be combined with a LIDAR Sensor Device for illumination of an environmental space connected to a light control unit.

The LIDAR Sensor System may comprise at least one light module. Said one light module has a light source and a driver connected to the light source. The LIDAR Sensor System further has an interface unit, in particular a hardware interface, configured to receive, emit, and/or store data signals. The interface unit may connect to the driver and/or to the light source for controlling the operation state of the driver and/or the operation of the light source.

The light source may be configured to emit radiation in the visible and/or the non-visible spectral range, as for example in the far-red range of the electromagnetic spectrum. It may be configured to emit monochromatic laser light. The light source may be an integral part of the LIDAR Sensor System as well as a remote yet connected element. It may be placed in various geometrical patterns, distance pitches and may be configured for alternating of color or wavelength emission or intensity or beam angle. The LIDAR Sensor System and/or light sources may be mounted such that they are moveable or can be inclined, rotated, tilted etc. The LIDAR Sensor System and/or light source may be configured to be installed inside a LIDAR Sensor Device (e.g. vehicle) or exterior to a LIDAR Sensor Device (e.g. vehicle). In particular, it is possible that the LIDAR light source or selected LIDAR light sources are mounted such or adapted to being automatically controllable, in some implementations remotely, in their orientation, movement, light emission, light spectrum, sensor etc.

The light source may be selected from the following group or a combination thereof: light emitting diode (LED), super-luminescent laser diode (LD), VSECL laser diode array.

In some embodiments, the LIDAR Sensor System may comprise a sensor, such as a resistive, a capacitive, an inductive, a magnetic, an optical and/or a chemical sensor. It may comprise a voltage or current sensor. The sensor may connect to the interface unit and/or the driver of the LIDAR light source.

In some embodiments, the LIDAR Sensor System and/or LIDAR Sensor Device comprise a brightness sensor, for example for sensing environmental light conditions in proximity of vehicle objects, such as houses, bridges, sign posts, and the like. It may be used for sensing daylight conditions and the sensed brightness signal may e.g. be used to improve surveillance efficiency and accuracy. That way, it may be enabled to provide the environment with a required amount of light of a predefined wavelength.

In some embodiments, the LIDAR Sensor System and/or LIDAR Sensor Device comprises a sensor for vehicle movement, position and orientation. Such sensor data may allow a better prediction, as to whether the vehicle steering conditions and methods are sufficient.

The LIDAR Sensor System and/or LIDAR Sensor Device may also comprise a presence sensor. This may allow to adapt the emitted light to the presence of another traffic participant including pedestrians in order to provide sufficient illumination, prohibit or minimize eye damage or skin irritation or such due to illumination in harmful or invisible wavelength regions, such as UV or IR. It may also be enabled to provide light of a wavelength that may warn or frighten away unwanted presences, e.g. the presence of animals such as pets or insects.

In some embodiments, the LIDAR Sensor System and/or LIDAR Sensor Device comprises a sensor or multi-sensor for predictive maintenance and/or operation of the LIDAR Sensor System and/or LIDAR Sensor Device failure.

In some embodiments, the LIDAR Sensor System and/or LIDAR Sensor Device comprises an operating hour meter. The operating hour meter may connect to the driver.

The LIDAR Sensor System may comprise one or more actuators for adjusting the environmental surveillance conditions for the LIDAR Sensor Device (e.g. vehicle). For instance, it may comprise actuators that allow adjusting for instance, laser pulse shape, temporal length, rise- and fall times, polarization, laser power, laser type (IR-diode, VCSEL), Field of View (FOV), laser wavelength, beam changing device (MEMS, DMD, DLP, LCD, Fiber), beam and/or sensor aperture, sensor type (PN-diode, APD, SPAD).

While the sensor or actuator has been described as part of the LIDAR Sensor System and/or LIDAR Sensor Device, it is understood, that any sensor or actuator may be an individual element or may form part of a different element of the LIDAR Sensor System. As well, it may be possible to provide an additional sensor or actuator, being configured to perform or performing any of the described activities as individual element or as part of an additional element of the LIDAR Sensor System.

In some embodiments, the LIDAR Sensor System and/or LIDAR Light Device further comprises a light control unit that connects to the interface unit.

The light control unit may be configured to control the at least one light module for operating in at least one of the following operation modes: dimming, pulsed, PWM, boost, irradiation patterns, including illuminating and non-illuminating periods, light communication (including C2C and C2X), synchronization with other elements of the LIDAR Sensor System, such as a second LIDAR Sensor Device.

The interface unit of the LIDAR Sensor System and/or LIDAR Sensor Device may comprise a gateway, such as a wireless gateway, that may connect to the light control unit. It may comprise a beacon, such as a Bluetooth™ beacon.

The interface unit may be configured to connect to other elements of the LIDAR Sensor System, e.g. one or more other LIDAR Sensor Systems and/or LIDAR Sensor Devices and/or to one or more sensors and/or one or more actuators of the LIDAR Sensor System.

The interface unit may be configured to be connected by any wireless or wireline connectivity, including radio and/or optical connectivity.

The LIDAR Sensor System and/or LIDAR Sensor Device may be configured to enable customer-specific and/or vehicle-specific light spectra. The LIDAR Sensor Device may be configured to change the form and/or position and/or orientation of the at least one LIDAR Sensor System. Further, the LIDAR Sensor System and/or LIDAR Sensor Device may be configured to change the light specifications of the light emitted by the light source, such as direction of emission, angle of emission, beam divergence, color, wavelength, and intensity as well as other characteristics like laser pulse shape, temporal length, rise- and fall times, polarization, pulse synchronization, pulse synchronization, laser power, laser type (IR-diode, VCSEL), Field of View (FOV), laser wavelength, beam changing device (MEMS, DMD, DLP, LCD, Fiber), beam and/or sensor aperture, sensor type (PN-diode, APD, SPAD).

In some embodiments, the LIDAR Sensor System and/or LIDAR Sensor Device may comprise a data processing unit. The data processing unit may connect to the LIDAR light driver and/or to the interface unit. It may be configured for data processing, for data and/or signal conversion and/or data storage. The data processing unit may advantageously be provided for communication with local, network-based or web-based platforms, data sources or providers, in order to transmit, store or collect relevant information on the light module, the road to be travelled, or other aspects connected with the LIDAR Sensor System and/or LIDAR Sensor Device.

In some embodiments, the LIDAR Sensor Device can encompass one or many LIDAR Sensor Systems that themselves can be comprised of infrared or visible light emitting modules, photoelectric sensors, optical components, interfaces for data communication, actuators, like MEMS mirror systems, computing and data storage devices, software and software databank, communication systems for communication with IoT, edge or cloud systems.

The LIDAR Sensor System and/or LIDAR Sensor Device can further include light emitting and light sensing elements that can be used for illumination purposes, like road lighting, or for data communication purposes, for example car-to-car, car-to-environment (for example drones, pedestrian, traffic signs, traffic posts etc.).

The LIDAR Sensor Device can further comprise one or more LIDAR Sensor Systems as well as other sensor systems, like optical camera sensor systems (CCD; CMOS), RADAR sensing system, and ultrasonic sensing systems.

The LIDAR Sensor Device can be functionally designed as vehicle headlight, rear light, side light, daytime running light (DRL), corner light etc. and comprise LIDAR sensing functions as well as visible illuminating and signaling functions.

The LIDAR Sensor System may further comprise a control unit (Controlled LIDAR Sensor System). The control unit may be configured for operating a management system. It is configured to connect to one or more LIDAR Sensor Systems and/or LIDAR Sensor Devices. It may connect to a data bus. The data bus may be configured to connect to an interface unit of an LIDAR Sensor Device. As part of the management system, the control unit may be configured for controlling an operating state of the LIDAR Sensor System and/or LIDAR Sensor Device.

The LIDAR Sensor Management System may comprise a light control system which may comprise any of the following elements: monitoring and/or controlling the status of the at least one LIDAR Sensor System and/or LIDAR Sensor Device, monitoring and/or controlling the use of the at least one LIDAR Sensor System and/or LIDAR Sensor Device, scheduling the lighting of the at least one LIDAR Sensor System and/or LIDAR Sensor Device, adjusting the light spectrum of the at least one LIDAR Sensor System and/or LIDAR Sensor Device, defining the light spectrum of the at least one LIDAR Sensor System and/or LIDAR Sensor Device, monitoring and/or controlling the use of at least one sensor of the at least one LIDAR Sensor System and/or LIDAR Sensor Device.

In some embodiments, the method for LIDAR Sensor System can be configured and designed to select, operate and control, based on internal or external data input, laser power, pulse shapes, pulse length, measurement time windows, wavelength, single wavelength or multiple wavelength approach, day and night settings, sensor type, sensor fusion, as well as laser safety functions according to relevant safety regulations.

The method for LIDAR Sensor Management System can be configured to initiate data encryption, data decryption and data communication protocols.

LIDAR Sensor System, Controlled LIDAR Sensor System, LIDAR Sensor Management System and Software In a Controlled LIDAR Sensor System according to the present disclosure, the computing device may be locally based, network based, and/or cloud-based. That means, the computing may be performed in the Controlled LIDAR Sensor System or on any directly or indirectly connected entities. In the latter case, the Controlled LIDAR Sensor System is provided with some connecting means, which allow establishment of at least a data connection with such connected entities.

In some embodiments, the Controlled LIDAR Sensor System comprises a LIDAR Sensor Management System connected to the at least one hardware interface. The LIDAR Sensor Management System may comprise one or more actuators for adjusting the surveillance conditions for the environment. Surveillance conditions may, for instance, be vehicle speed, vehicle road density, vehicle distance to other objects, object type, object classification, emergency situations, weather conditions, day or night conditions, day or night time, vehicle and environmental temperatures, and driver biofeedback signals.

The present disclosure further comprises an LIDAR Sensor Management Software. The present disclosure further comprises a data storage device with the LIDAR Sensor Management Software, wherein the data storage device is enabled to run the LIDAR Sensor Management Software. The data storage device may either comprise be a hard disk, a RAM, or other common data storage utilities such as USB storage devices, CDs, DVDs and similar.

The LIDAR Sensor System, in particular the LIDAR Sensor Management Software, may be configured to control the steering of Automatically Guided Vehicles (AGV).

In some embodiments, the computing device is configured to perform the LIDAR Sensor Management Software.

The LIDAR Sensor Management Software may comprise any member selected from the following group or a combination thereof: software rules for adjusting light to outside conditions, adjusting the light intensity of the at least one LIDAR Sensor System and/or LIDAR Sensor Device to environmental conditions, adjusting the light spectrum of the at least one LIDAR Sensor System and/or LIDAR Sensor Device to environmental conditions, adjusting the light spectrum of the at least one LIDAR Sensor System and/or LIDAR Sensor Device to traffic density conditions, adjusting the light spectrum of the at least one LIDAR Sensor System and/or LIDAR Sensor Device according to customer specification or legal requirements.

According to some embodiments, the Controlled LIDAR Sensor System further comprises a feedback system connected to the at least one hardware interface. The feedback system may comprise one or more sensors for monitoring the state of surveillance for which the Controlled LIDAR Sensor System is provided. The state of surveillance may for example, be assessed by at least one of the following: road accidents, required driver interaction, Signal-to-Noise ratios, driver biofeedback signals, close encounters, fuel consumption, and battery status.

The Controlled LIDAR Sensor System may further comprise a feedback software.

The feedback software may in some embodiments comprise algorithms for vehicle (LIDAR Sensor Device) steering assessment on the basis of the data of the sensors.

The feedback software of the Controlled LIDAR Sensor System may in some embodiments comprise algorithms for deriving surveillance strategies and/or lighting strategies on the basis of the data of the sensors.

The feedback software of the Controlled LIDAR Sensor System may in some embodiments of the present disclosure comprise LIDAR lighting schedules and characteristics depending on any member selected from the following group or a combination thereof: road accidents, required driver interaction, Signal-to-Noise ratios, driver biofeedback signals, close encounters, road warnings, fuel consumption, battery status, other autonomously driving vehicles.

The feedback software may be configured to provide instructions to the LIDAR Sensor Management Software for adapting the surveillance conditions of the environment autonomously.

The feedback software may comprise algorithms for interpreting sensor data and suggesting corrective actions to the LIDAR Sensor Management Software.

In some embodiments of the LIDAR Sensor System, the instructions to the LIDAR Sensor Management Software are based on measured values and/or data of any member selected from the following group or a combination thereof: vehicle (LIDAR Sensor Device) speed, distance, density, vehicle specification and class.

The LIDAR Sensor System therefore may have a data interface to receive the measured values and/or data. The data interface may be provided for wire-bound transmission or wireless transmission. In particular, it is possible that the measured values or the data are received from an intermediate storage, such as a cloud-based, web-based, network-based or local type storage unit.

Further, the sensors for sensing environmental conditions may be connected with or interconnected by means of cloud-based services, often also referred to as Internet of Things.

In some embodiments, the Controlled LIDAR Sensor System comprises a software user interface (UI), particularly a graphical user interface (GUI). The software user interface may be provided for the light control software and/or the LIDAR Sensor Management Software and/or the feedback software.

The software user interface (UI) may further comprise a data communication and means for data communication for an output device, such as an augmented and/or virtual reality display.

The user interface may be implemented as an application for a mobile device, such as a smartphone, a tablet, a mobile computer or similar devices.

The Controlled LIDAR Sensor System may further comprise an application programming interface (API) for controlling the LIDAR Sensing System by third parties and/or for third party data integration, for example road or traffic conditions, street fares, energy prices, weather data, GPS.

In some embodiments, the Controlled LIDAR Sensor System comprises a software platform for providing at least one of surveillance data, vehicle (LIDAR Sensor Device) status, driving strategies, and emitted sensing light.

In some embodiments, the LIDAR Sensor System and/or the Controlled LIDAR Sensor System can include infrared or visible light emitting modules, photoelectric sensors, optical components, interfaces for data communication, and actuators, like MEMS mirror systems, a computing and data storage device, a software and software databank, a communication system for communication with IoT, edge or cloud systems.

The LIDAR Sensor System and/or the Controlled LIDAR Sensor System can include light emitting and light sensing elements that can be used for illumination or signaling purposes, like road lighting, or for data communication purposes, for example car-to-car, car-to-environment.

In some embodiments, the LIDAR Sensor System and/or the Controlled LIDAR Sensor System may be installed inside the driver cabin in order to perform driver monitoring functionalities, such as occupancy-detection, eye-tracking, face recognition, drowsiness detection, access authorization, gesture control, etc.) and/or to communicate with a Head-up-Display HUD).

The software platform may cumulate data from one's own or other vehicles (LIDAR Sensor Devices) to train machine learning algorithms for improving surveillance and car steering strategies.

The Controlled LIDAR Sensor System may also comprise a plurality of LIDAR Sensor Systems arranged in adjustable groups.

The present disclosure further refers to a vehicle (LIDAR Sensor Device) with at least one LIDAR Sensor System. The vehicle may be planned and build particularly for integration of the LIDAR Sensor System. However, it is also possible, that the Controlled LIDAR Sensor System was integrated in a pre-existing vehicle. According to the present disclosure, both cases as well as a combination of these cases shall be referred to.

Method for a LIDAR Sensor System

According to yet another aspect of the present disclosure, a method for a LIDAR Sensor System is provided, which comprises at least one LIDAR Sensor System. The method may comprise the steps of controlling the light emitted by the at least one LIDAR Sensor System by providing light control data to the hardware interface of the Controlled LIDAR Sensor System and/or sensing the sensors and/or controlling the actuators of the Controlled LIDAR Sensor System via the LIDAR Sensor Management System.

According to yet another aspect of the present disclosure, the method for LIDAR Sensor System can be configured and designed to select, operate and control, based on internal or external data input, laser power, pulse shapes, pulse length, measurement time windows, wavelength, single wavelength or multiple wavelength approach, day and night settings, sensor type, sensor fusion, as well as laser safety functions according to relevant safety regulations.

The method according to the present disclosure may further comprise the step of generating light control data for adjusting the light of the at least one LIDAR Sensor System to environmental conditions.

In some embodiments, the light control data is generated by using data provided by the daylight or night vision sensor.

According to some embodiments, the light control data is generated by using data provided by a weather or traffic control station.

The light control data may also be generated by using data provided by a utility company in some embodiments.

Advantageously, the data may be gained from one data source, whereas that one data source may be connected, e.g. by means of Internet of Things devices, to those devices. That way, data may be pre-analyzed before being released to the LIDAR Sensor System, missing data could be identified, and in further advantageous developments, specific pre-defined data could also be supported or replaced by "best-guess" values of a machine learning software.

In some embodiments, the method further comprises the step of using the light of the at least one LIDAR Sensor Device for example during the time of day or night when traffic conditions are the best. Of course, other conditions for the application of the light may also be considered.

In some embodiments, the method may comprise a step of switching off the light of the at least one LIDAR Sensor System depending on a predetermined condition. Such condition may for instance occur, if the vehicle (LIDAR Sensor Device) speed or a distance to another traffic object is lower than a pre-defined or required safety distance or safety condition.

The method may also comprise the step of pushing notifications to the user interface in case of risks or fail functions and vehicle health status.

In some embodiments, the method comprises analyzing sensor data for deducing traffic density and vehicle movement.

The LIDAR Sensor System features may be adjusted or triggered by way of a user interface or other user feedback data. The adjustment may further be triggered by way of a machine learning process, as far as the characteristics, which are to be improved or optimized are accessible by sensors. It is also possible that individual users adjust the surveillance conditions and or further surveillance parameters to individual needs or desires.

The method may also comprise the step of uploading LIDAR sensing conditions to a software platform and/or downloading sensing conditions from a software platform.

In at least one embodiment, the method comprises a step of logging performance data to an LIDAR sensing note book.

The data cumulated in the Controlled LIDAR Sensor System may, in a step of the method, be analyzed in order to directly or indirectly determine maintenance periods of the LIDAR Sensor System, expected failure of system components or such.

According to another aspect, the present disclosure comprises a computer program product comprising a plurality of program instructions, which when executed by a computer system of a LIDAR Sensor System, cause the Controlled LIDAR Sensor System to execute the method according to the present disclosure. The disclosure further comprises a data storage device.

Yet another aspect of the present disclosure refers to a data storage device with a computer program adapted to execute at least one of a method for a LIDAR Sensor System or a LIDAR Sensor Device.

Preferred embodiments can be found in the independent and dependent claims and in the entire disclosure, wherein in the description and representation of the features is not always differentiated in detail between the different claim categories; In any case implicitly, the disclosure is always directed both to the method and to appropriately equipped motor vehicles (LIDAR Sensor Devices) and/or a corresponding computer program product.

BRIEF DESCRIPTION OF THE DRAWING

The detailed description is described with reference to the accompanying figures. The use of the same reference number in different instances in the description and the figure may indicate a similar or identical item. The drawings are not necessarily to scale, emphasis instead generally being placed upon illustrating the principles of the present disclosure.

In the following description, various embodiments of the present disclosure are described with reference to the following drawings, in which:

FIG. 37B shows another side view of an optical system for a

LIDAR Sensor System in accordance with various embodiments.

Figure 37A:
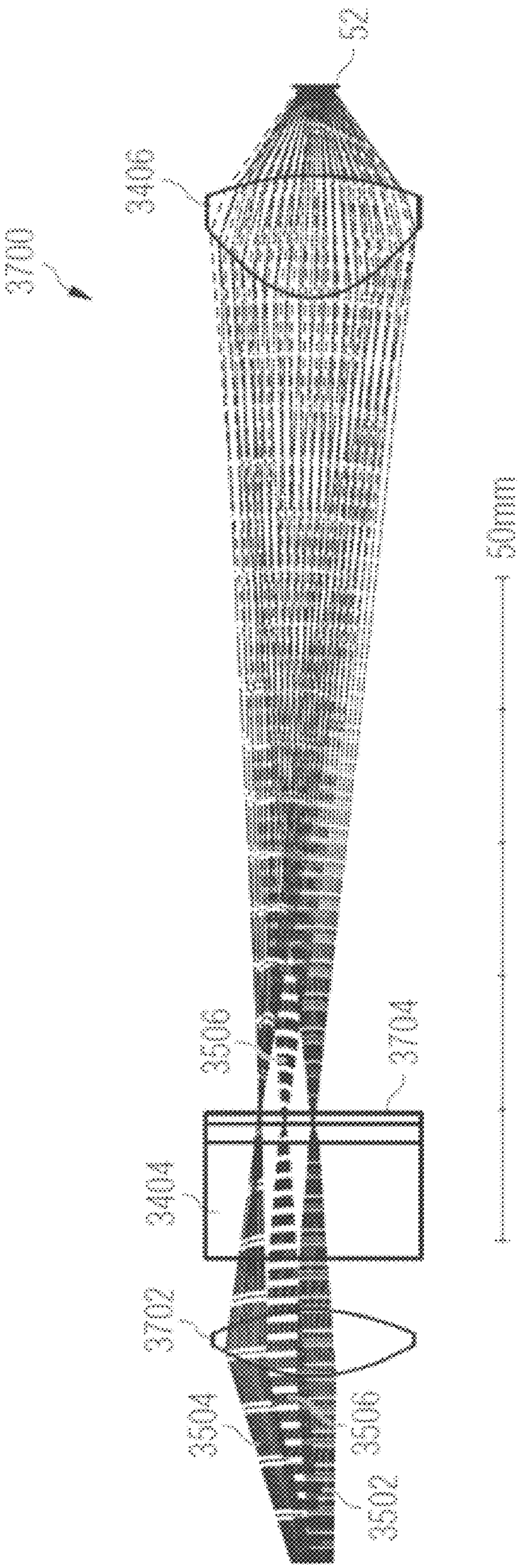
FIG. 37A shows a top view of an optical system for a LIDAR Sensor System in accordance with various embodiments.
Figure 37B:
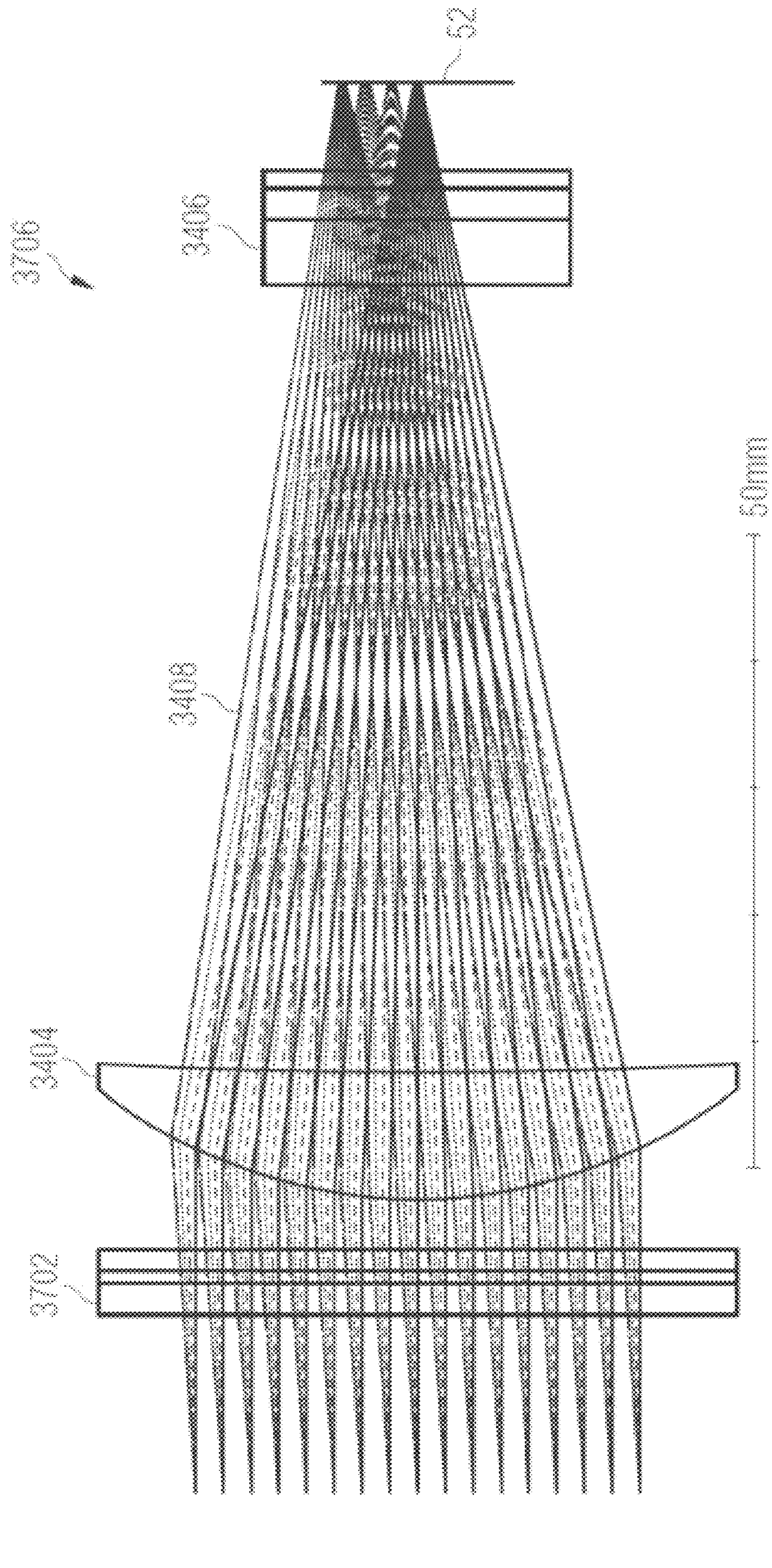
Figure 37C:
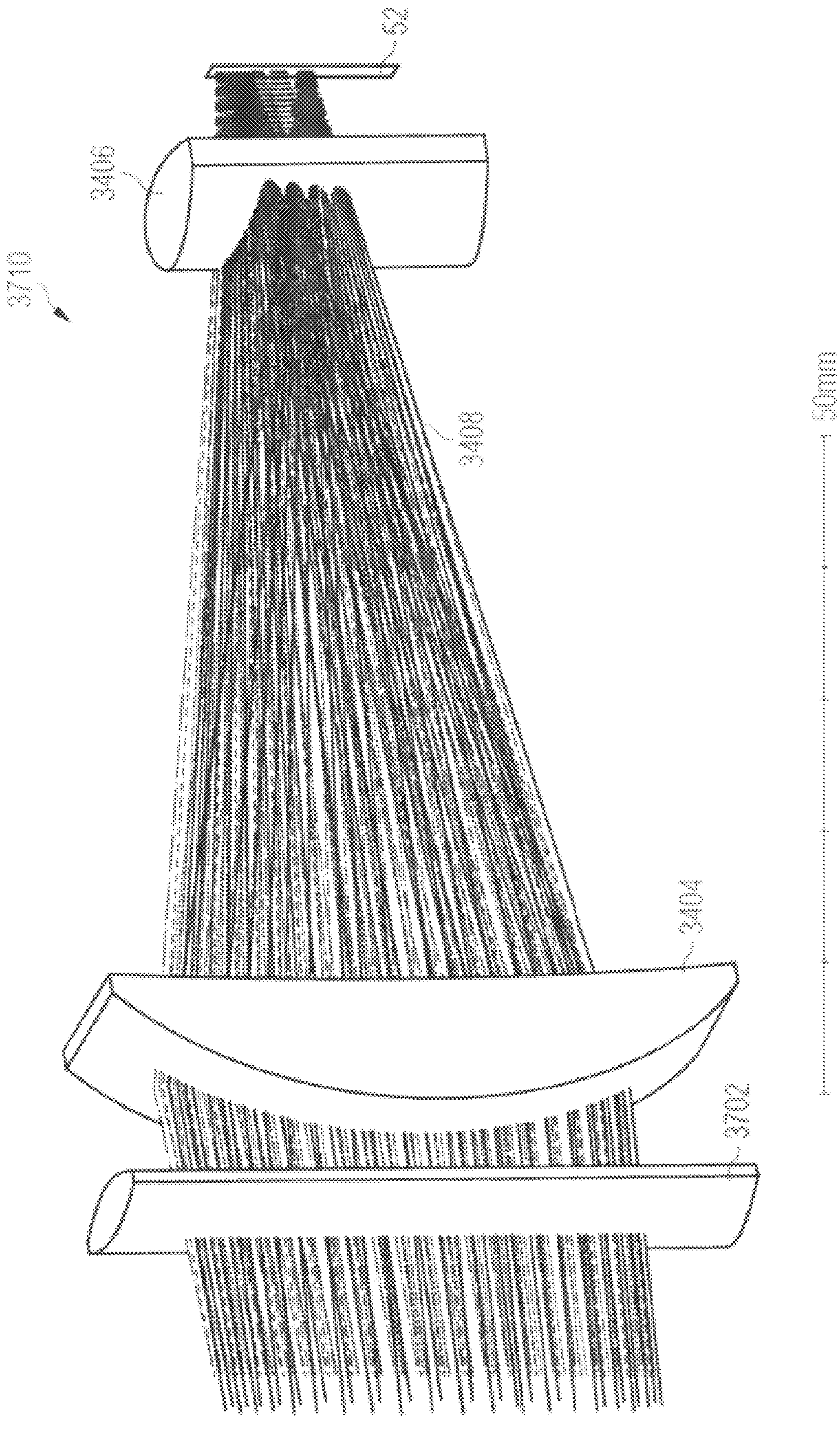

FIG. 37C shows a three-dimensional view of an optical system for a LIDAR Sensor System in accordance with various embodiments.

Figure 37D:
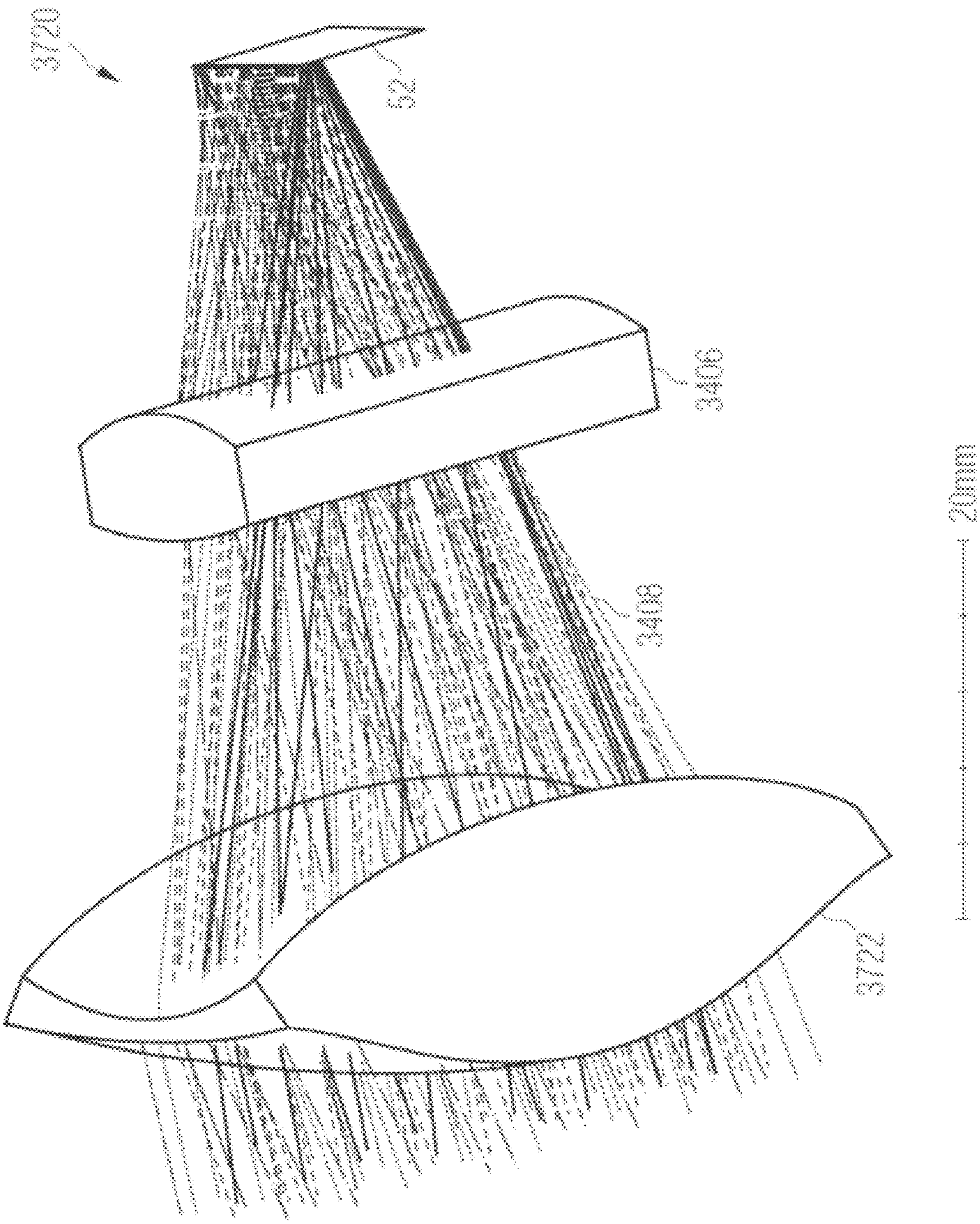

FIG. 37D shows a three-dimensional view of an optical system for a LIDAR Sensor System in accordance with various embodiments.

Figure 37F:
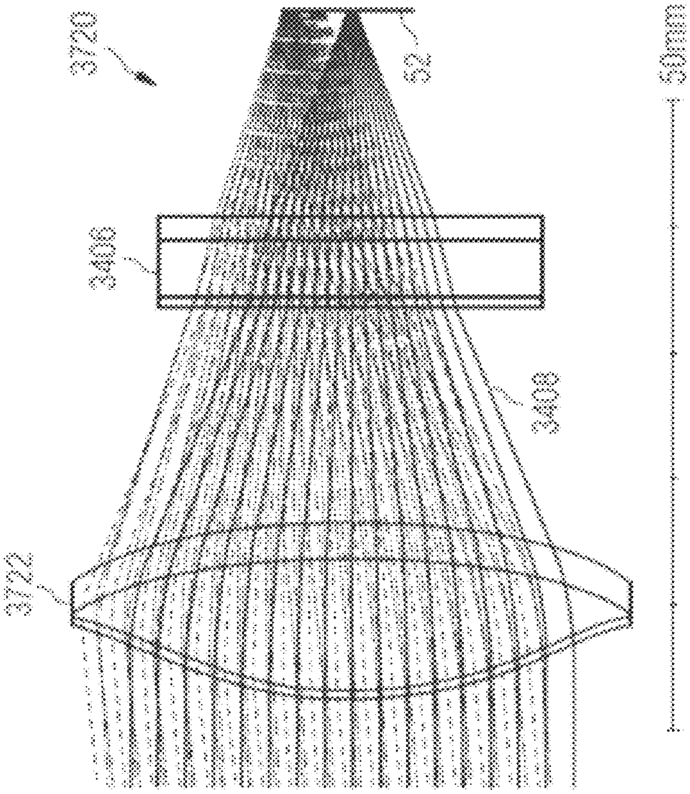
Figure 37E:
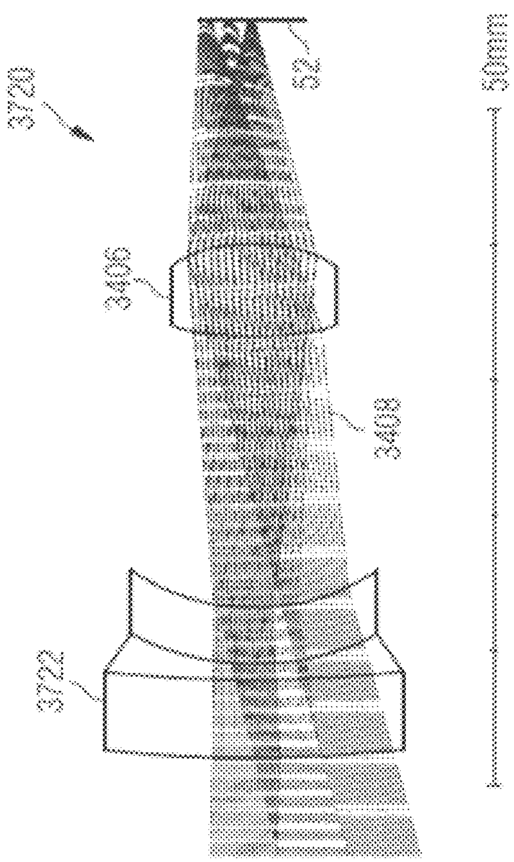

FIG. 37E shows a top view of an optical system for a LIDAR Sensor System in accordance with various embodiments.

FIG. 37F shows another side view of an optical system for a LIDAR Sensor System in accordance with various embodiments.

Figure 38:
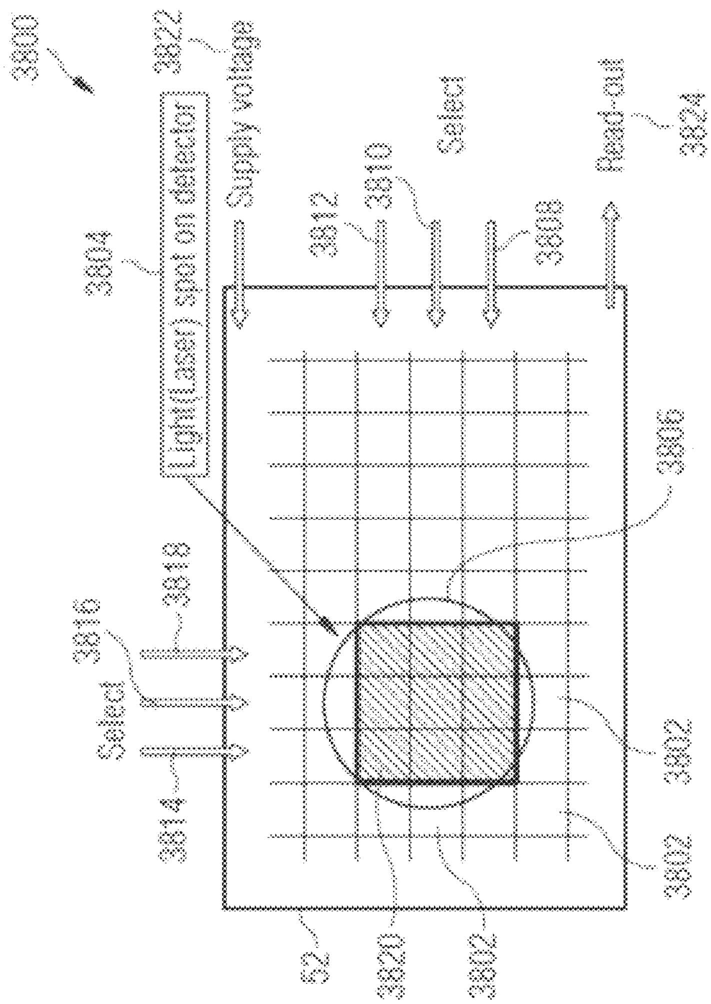

FIG. 38 shows a portion of a sensor in accordance with various embodiments.

Figure 39:
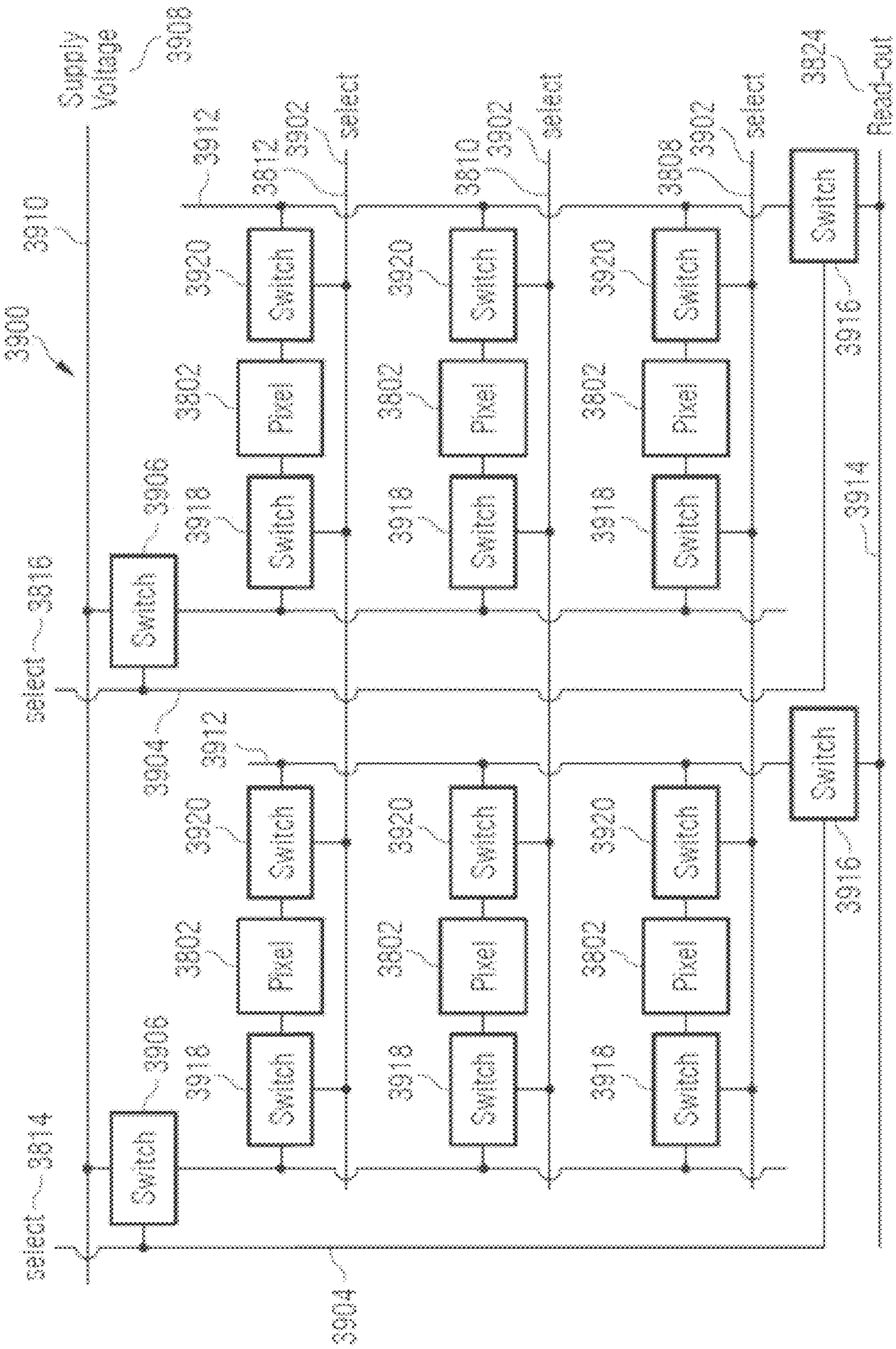

FIG. 39 shows a portion of a sensor in accordance with various embodiments in more detail.

Figure 40:
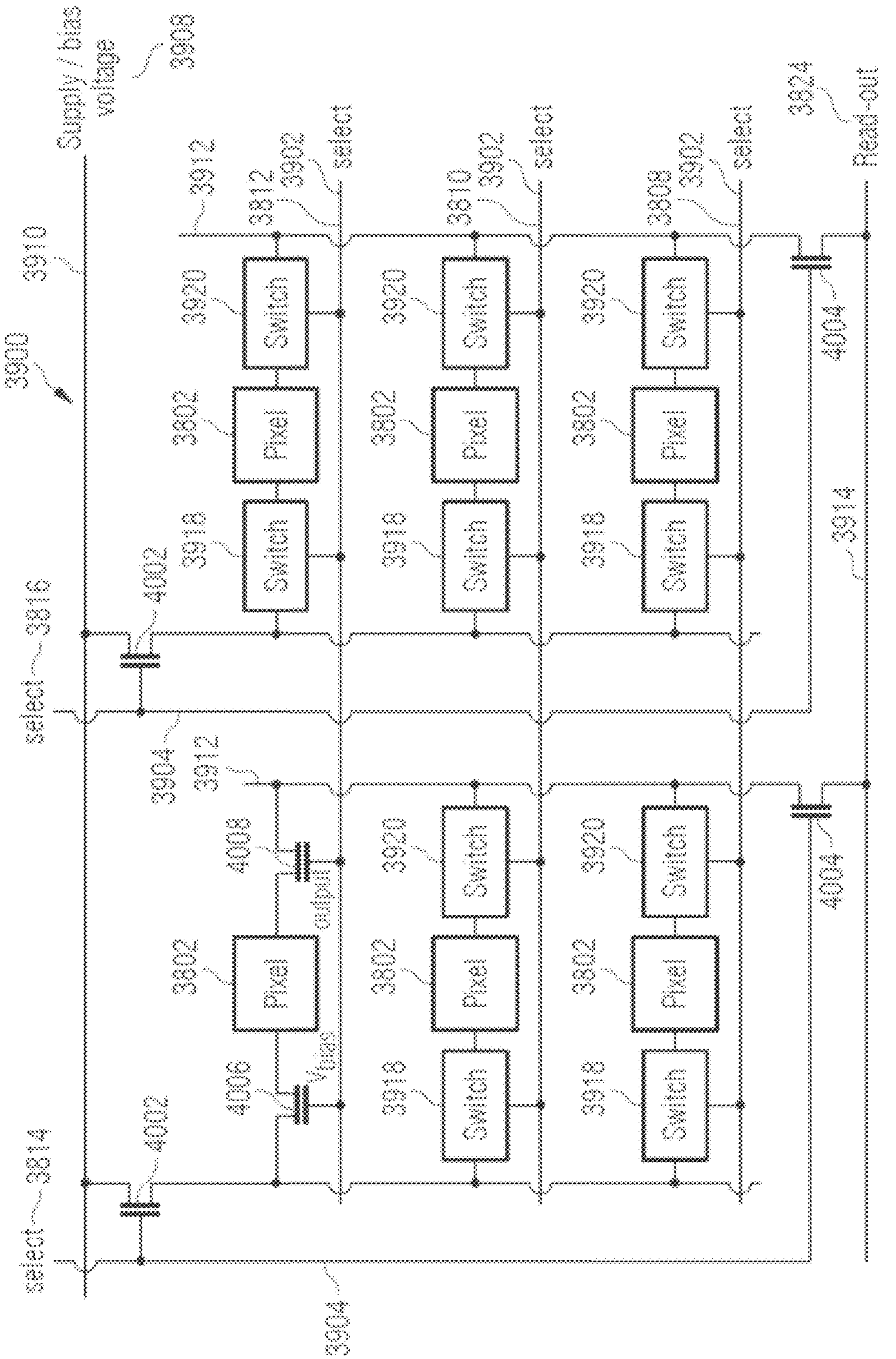

FIG. 40 shows a portion of a sensor in accordance with various embodiments in more detail.

Figure 41:
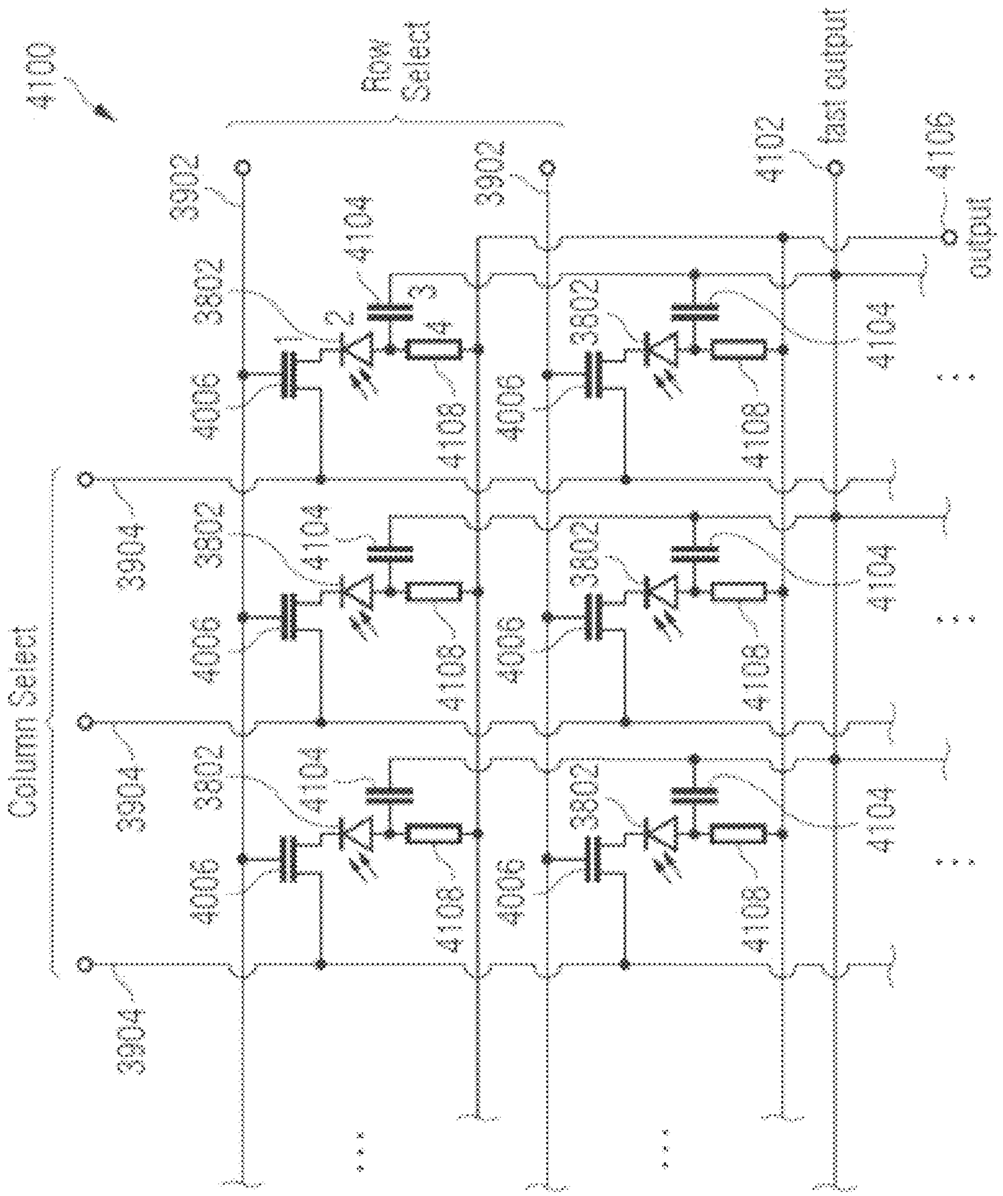

FIG. 41 shows a portion of a sensor in accordance with various embodiments in more detail.

Figure 42:
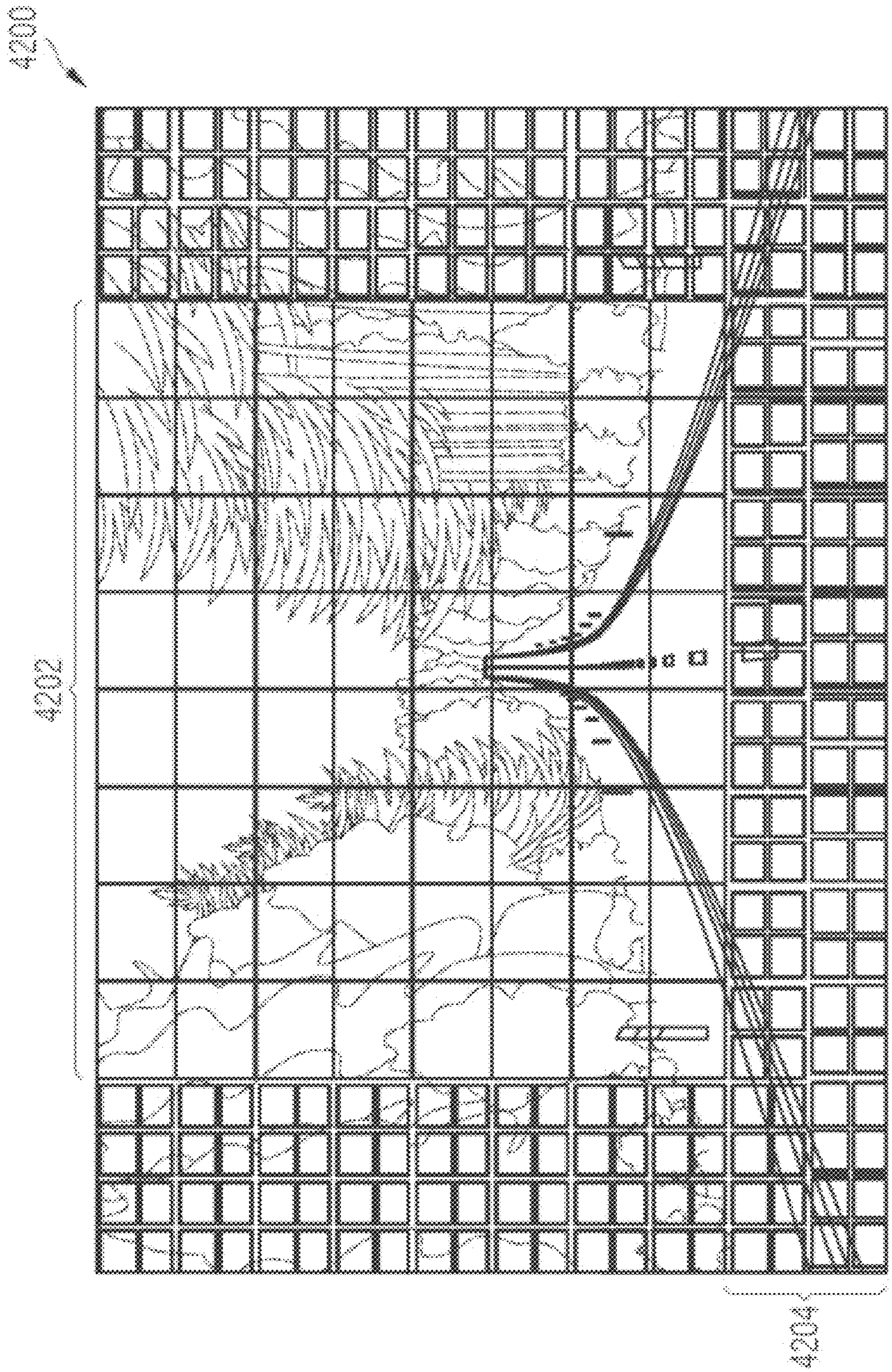

FIG. 42 shows a recorded scene and the sensor pixels used to detect the scene in accordance with various embodiments in more detail.

Figure 43:
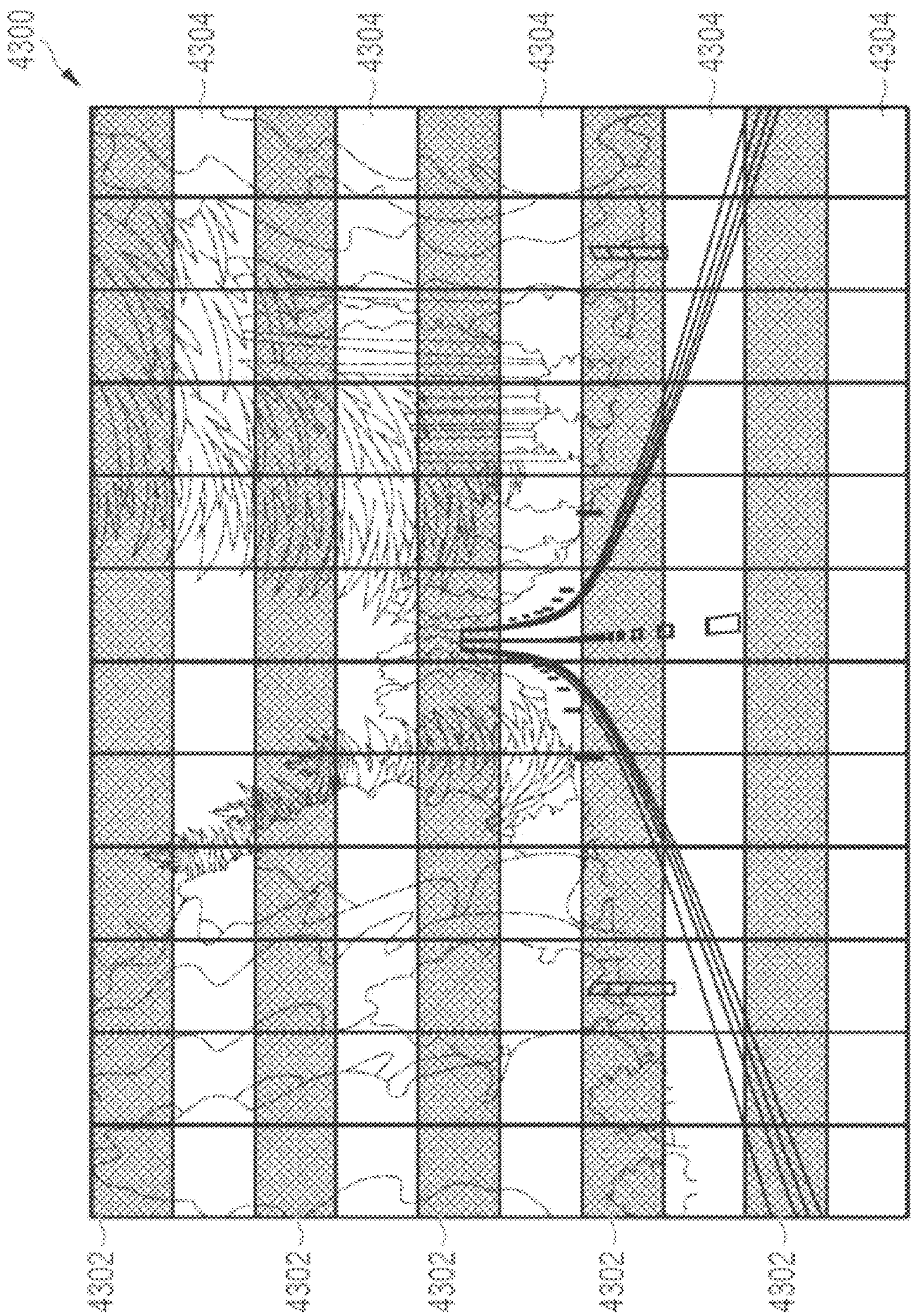

FIG. 43 shows a recorded scene and the sensor pixels used to detect the scene in accordance with various embodiments in more detail.

Figure 44:
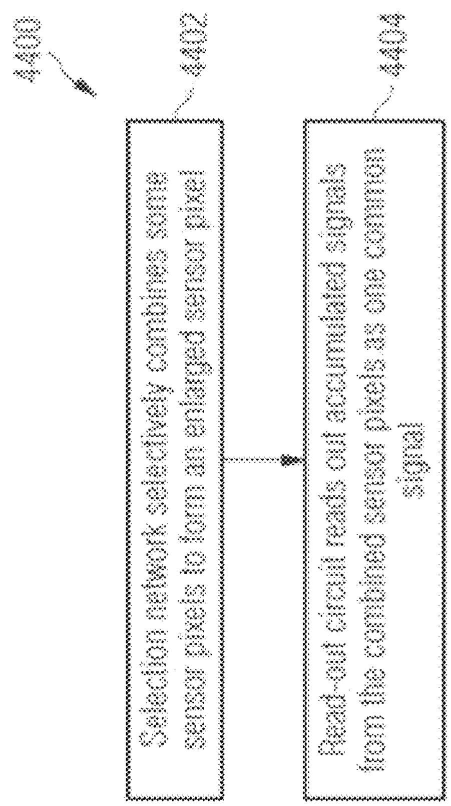

FIG. 44 shows a flow diagram illustrating a method for a LIDAR Sensor System in accordance with various embodiments in more detail.

Figure 45:
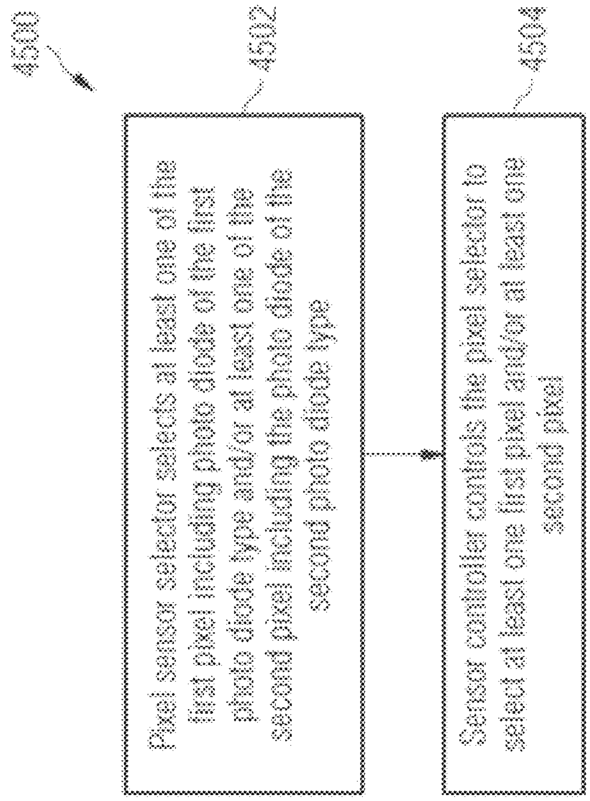

FIG. 45 shows a flow diagram illustrating another method for a LIDAR Sensor System in accordance with various embodiments in more detail.

Figure 46:
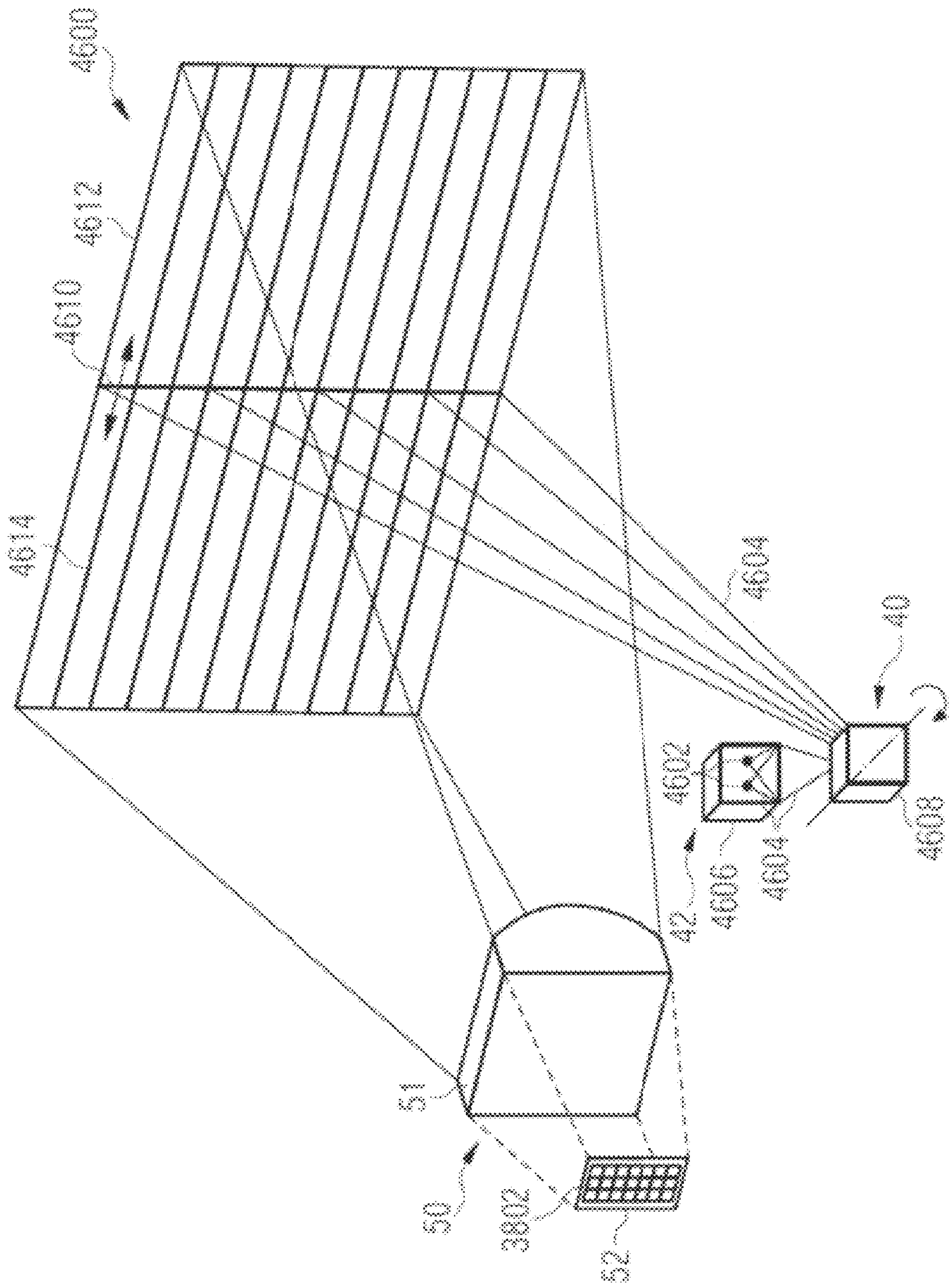

FIG. 46 shows a portion of the LIDAR Sensor System in accordance with various embodiments.

Figure 47:
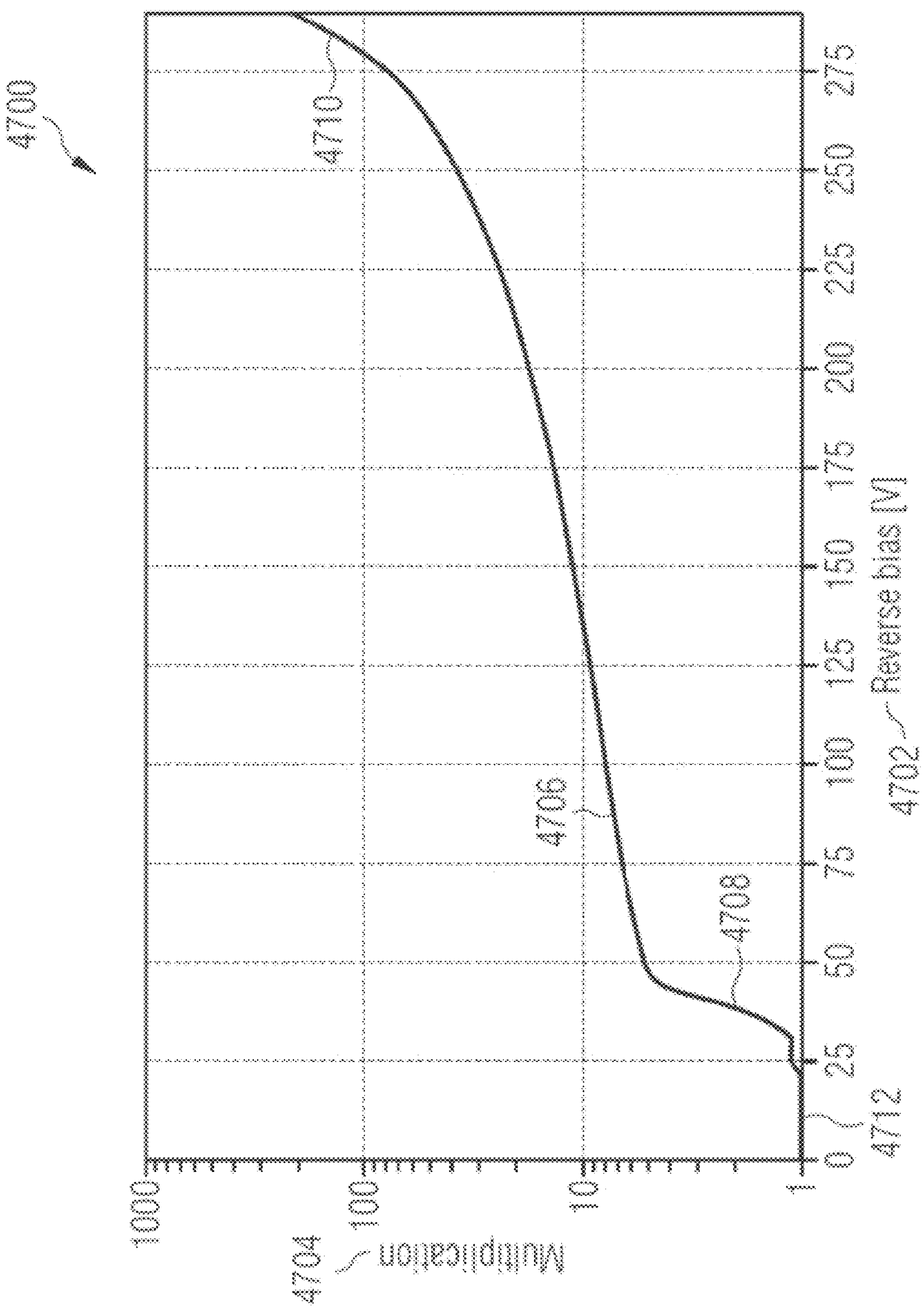

FIG. 47 shows a diagram illustrating an influence of a reverse bias voltage applied to an avalanche-type photo diode on the avalanche effect.

Figure 48:
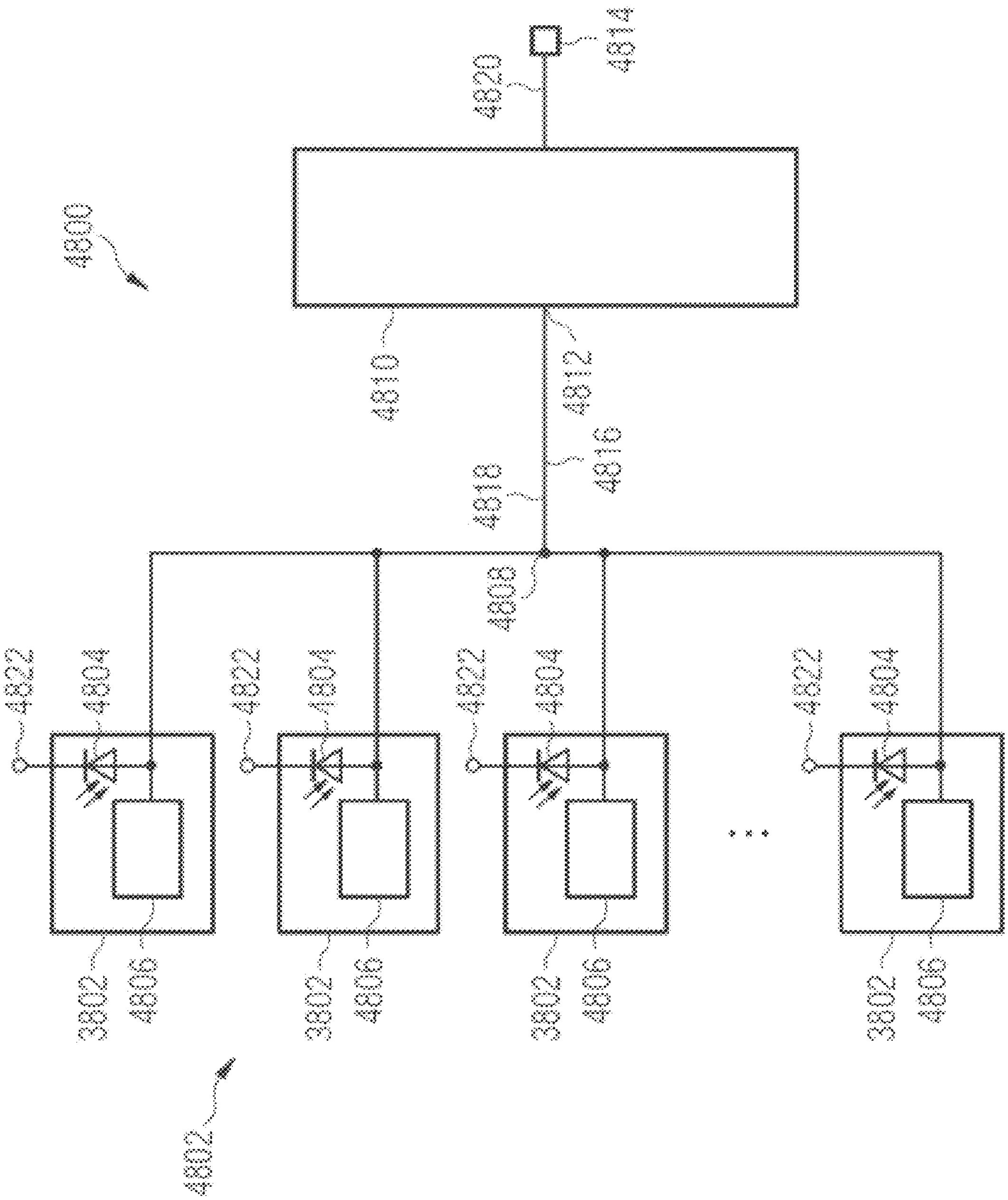

FIG. 48 shows a circuit in accordance with various embodiments.

Figure 49:
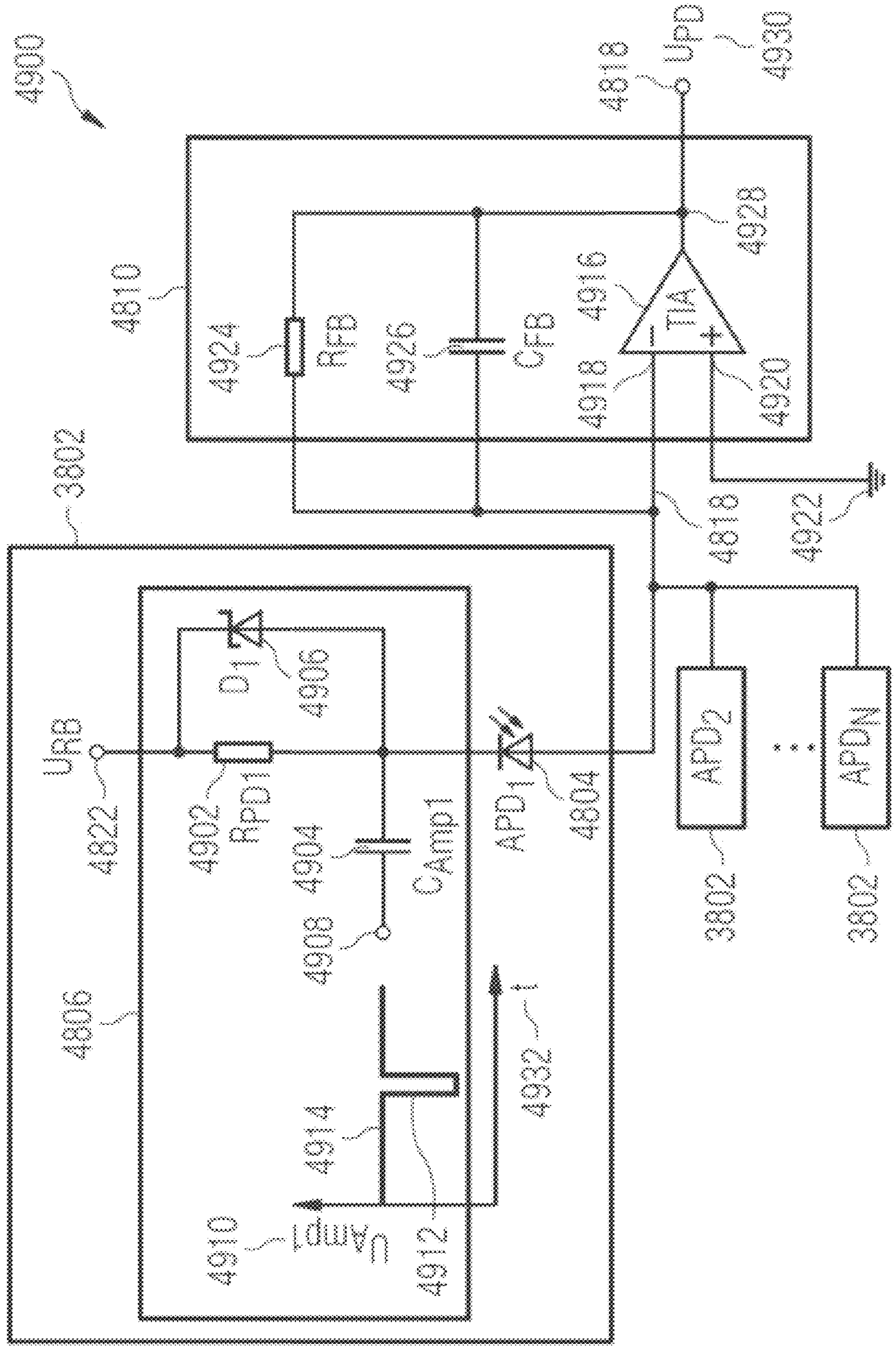

FIG. 49 shows a circuit in accordance with various embodiments in more detail.

Figure 50:
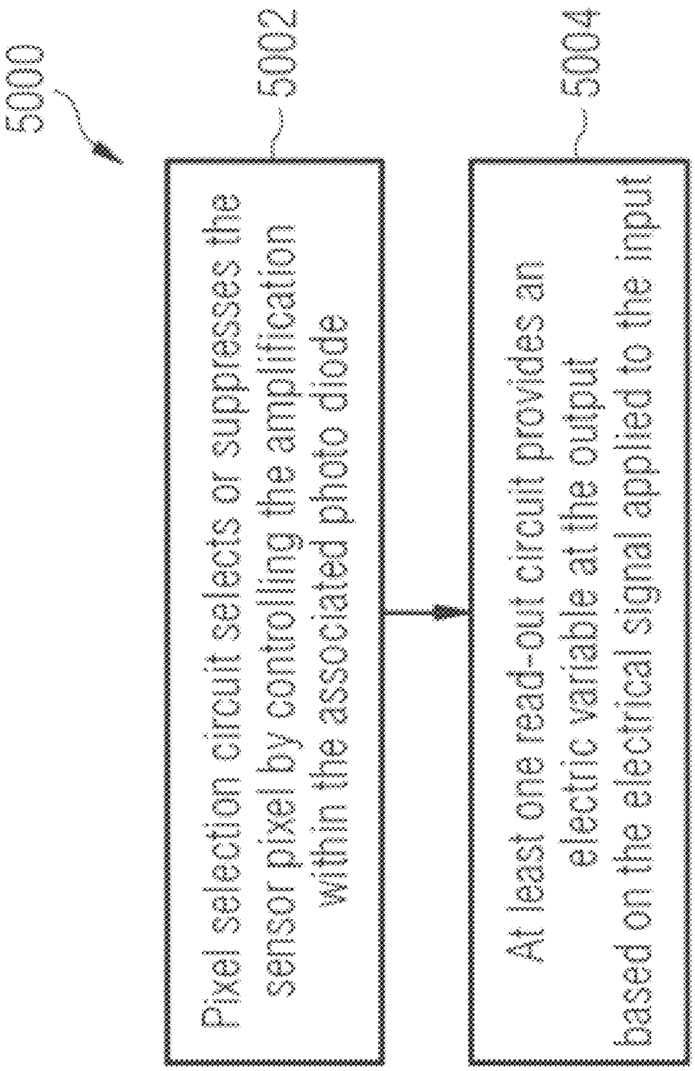

FIG. 50 shows a flow diagram illustrating a method in accordance with various embodiments.

Figure 51:
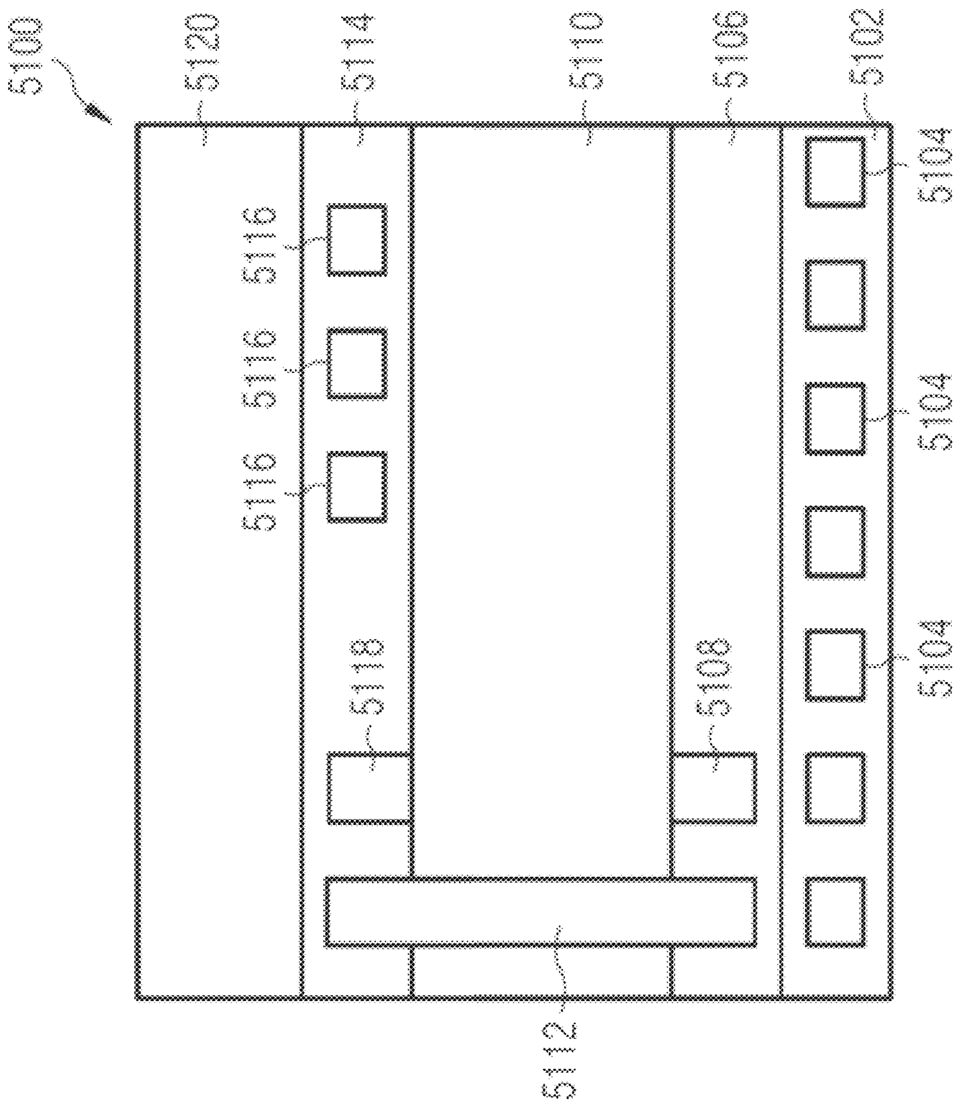

FIG. 51 shows a cross sectional view of an optical component for a LIDAR Sensor System in accordance with various embodiments.

Figure 52A:
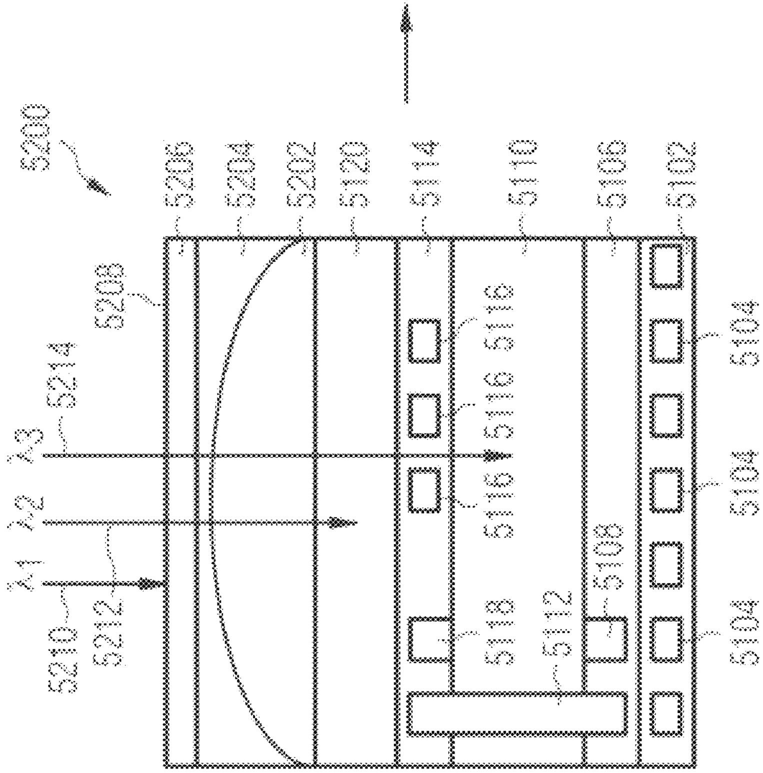
Figure 52B:
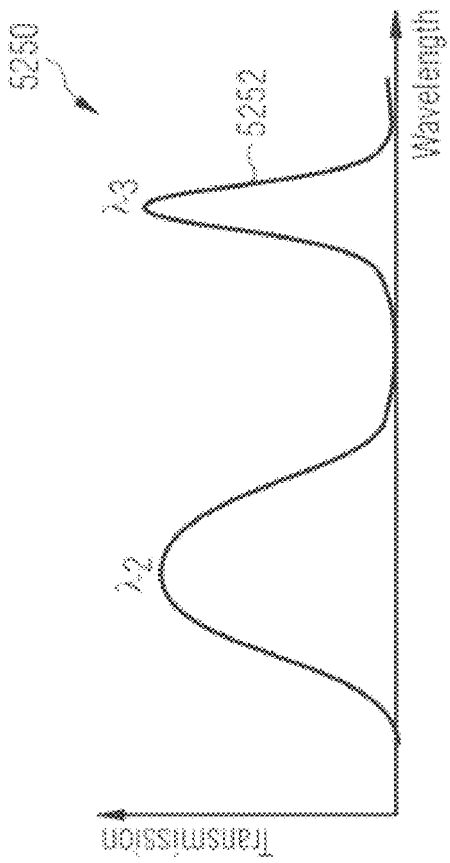

FIGS. 52A and 52B show a cross sectional view of an optical component for a LIDAR Sensor System (FIG. 52A) and a corresponding wavelength/transmission diagram (FIG. 52B) in accordance with various embodiments.

Figure 53B:
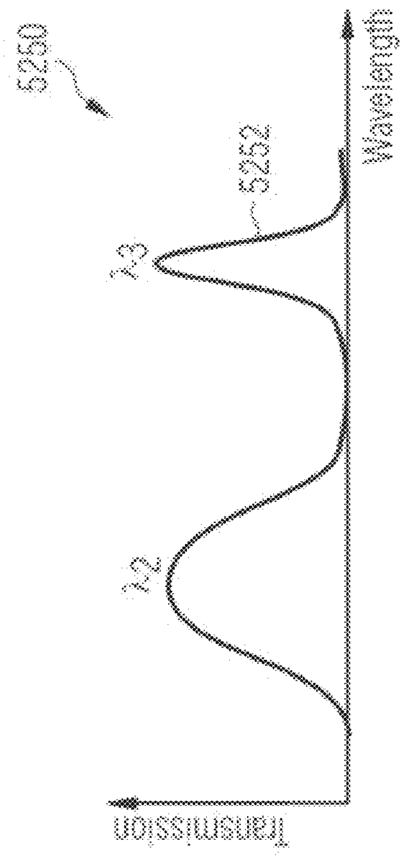
Figure 53A:
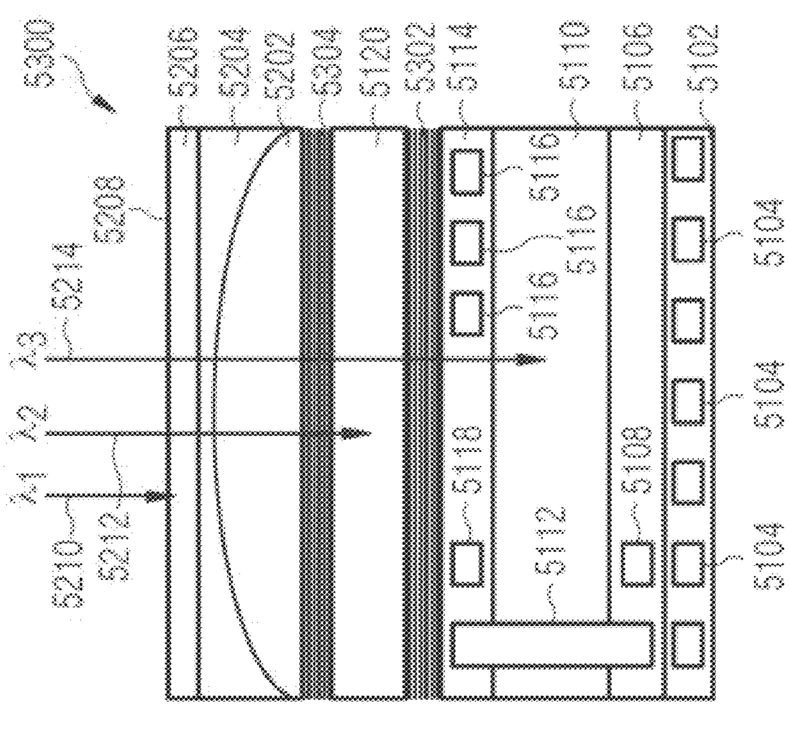

FIGS. 53A and 53B show a cross sectional view of an optical component for a LIDAR Sensor System (FIG. 53A) and a corresponding wavelength/transmission diagram (FIG. 53B) in accordance with various embodiments.

Figure 54:
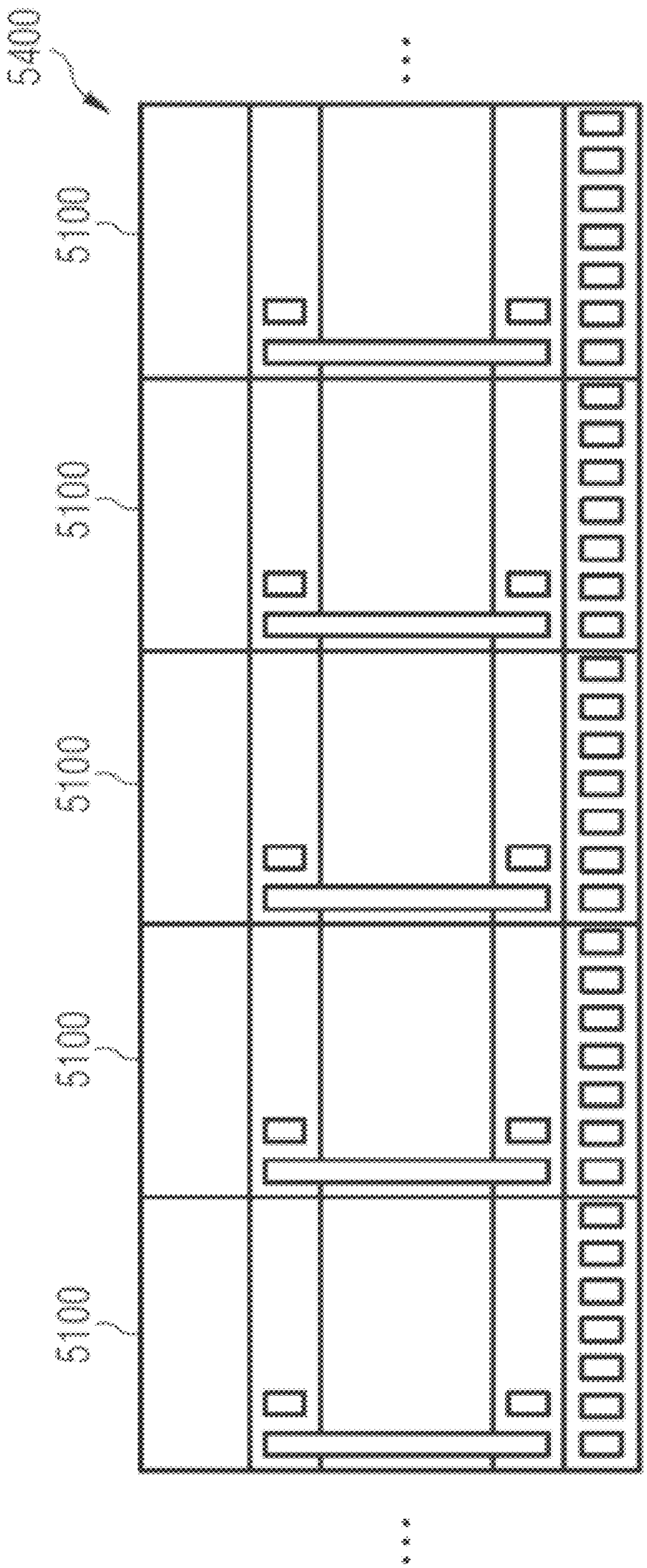

FIG. 54 shows a cross sectional view of a sensor for a LIDAR Sensor System in accordance with various embodiments.

Figure 55:
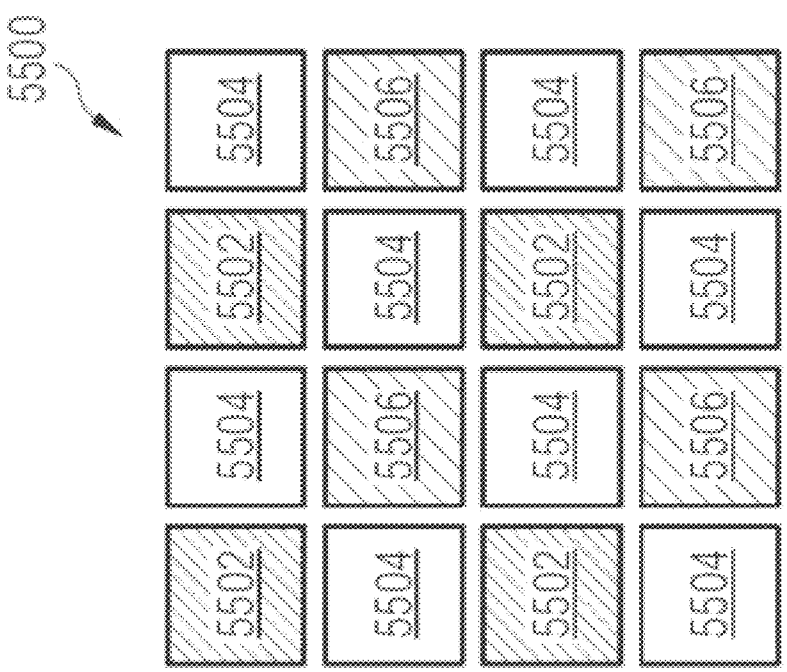

FIG. 55 shows a top view of a sensor for a LIDAR Sensor System in accordance with various embodiments.

Figure 56:
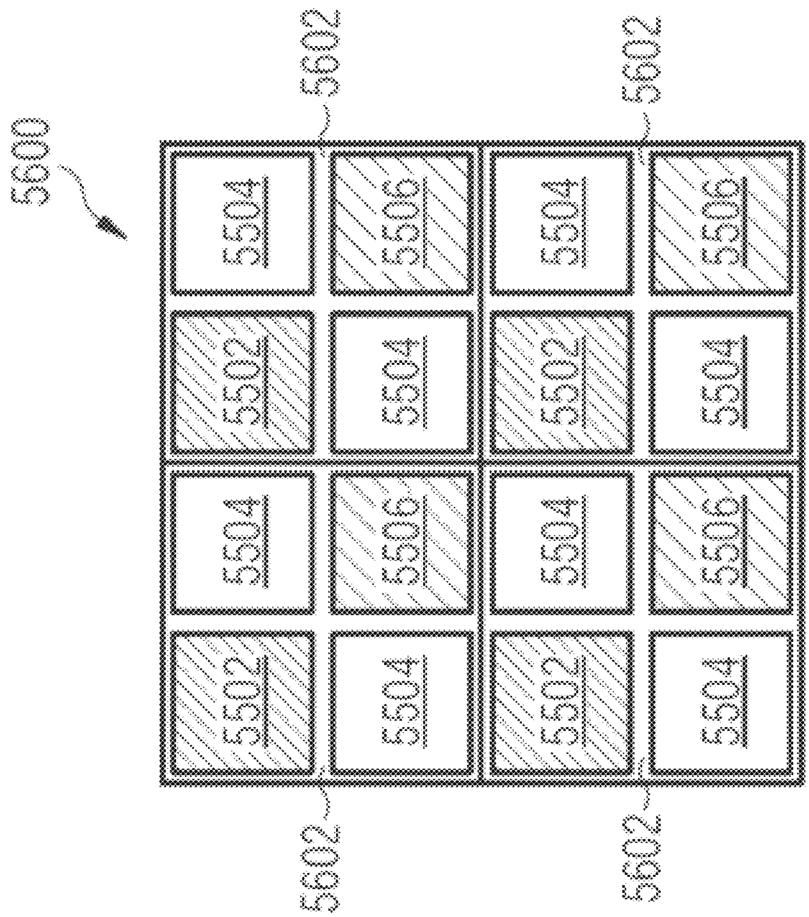

FIG. 56 shows a top view of a sensor for a LIDAR Sensor System in accordance with various embodiments.

Figure 57:
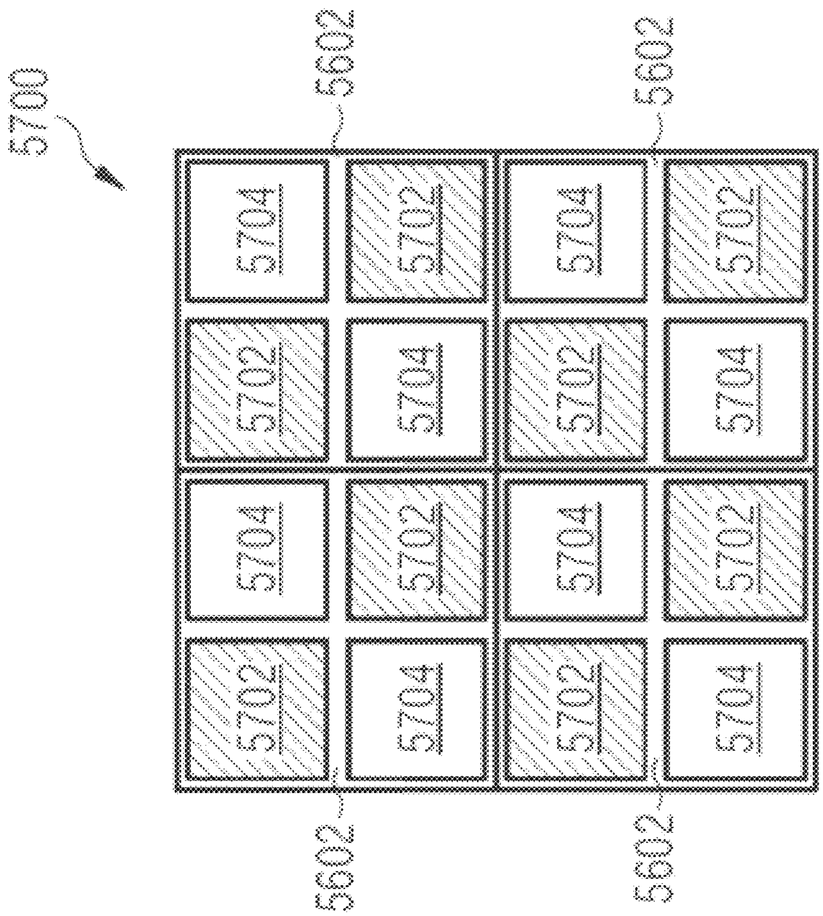

FIG. 57 shows a top view of a sensor for a LIDAR Sensor System in accordance with various embodiments.

Figure 58:
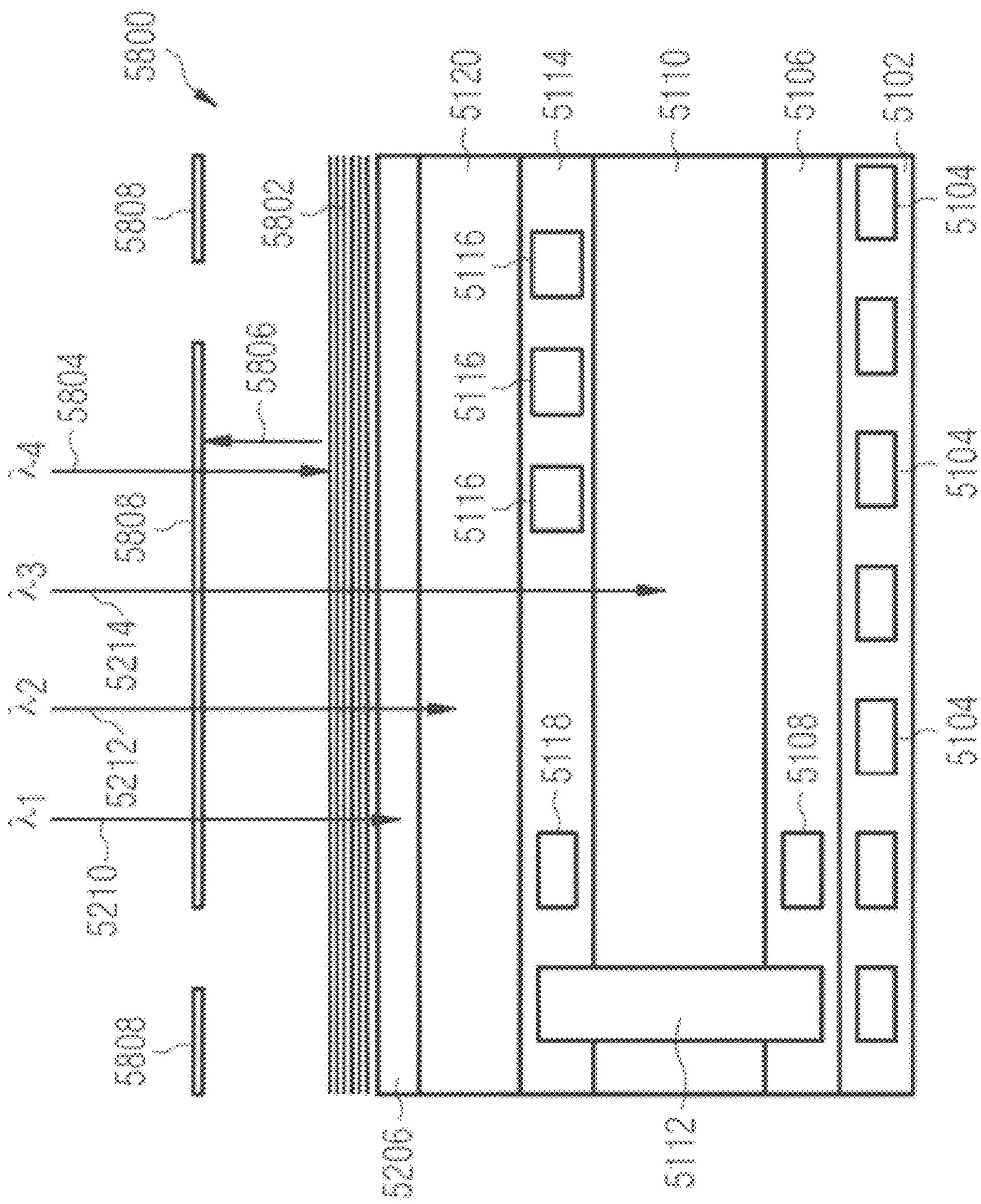

FIG. 58 shows a cross sectional view of an optical component for a LIDAR Sensor System in accordance with various embodiments.

Figure 59:
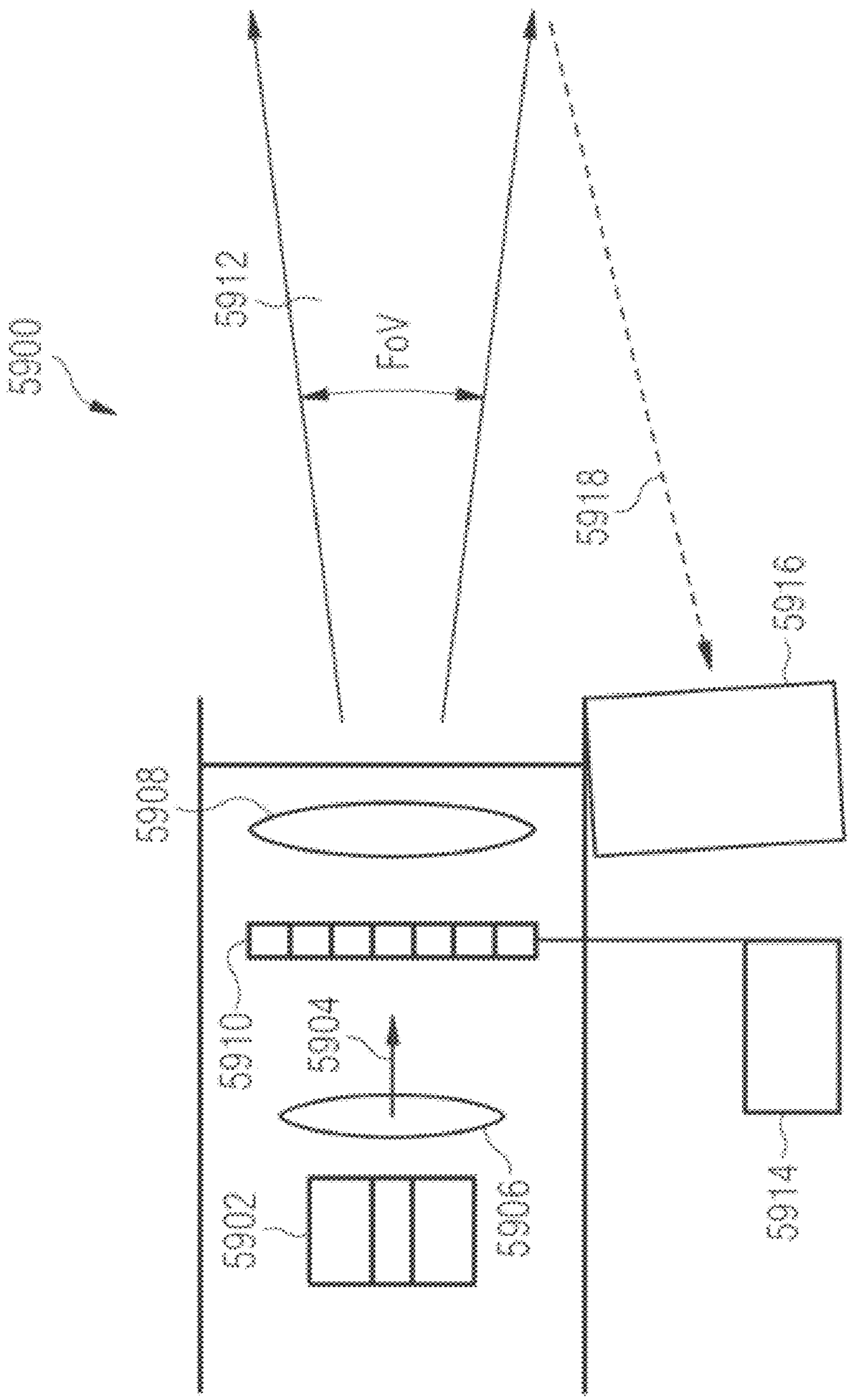

FIG. 59 shows a LIDAR Sensor System in accordance with various embodiments.

Figure 60:
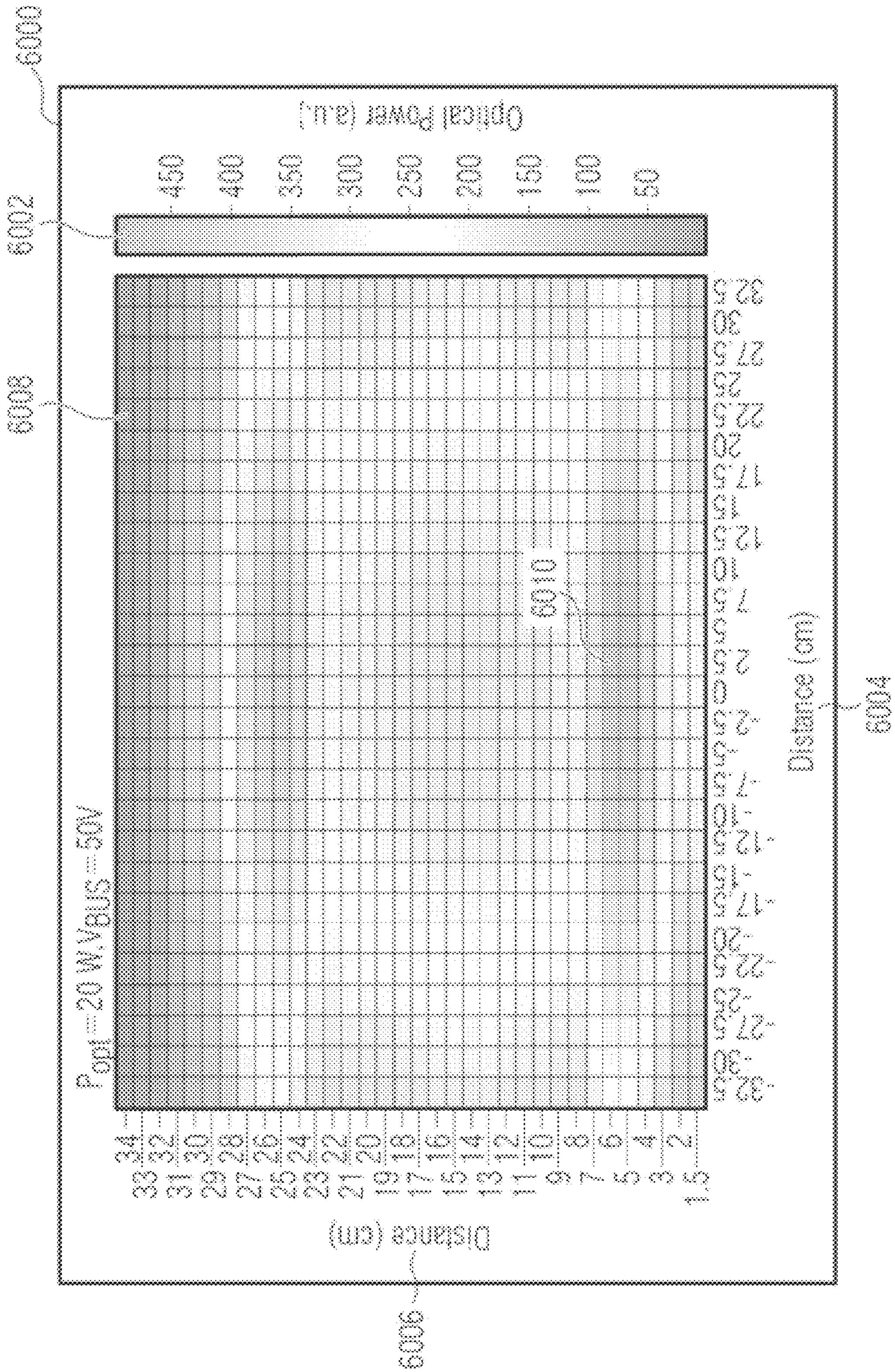

FIG. 60 shows an optical power grid in accordance with various embodiments.

Figure 61:
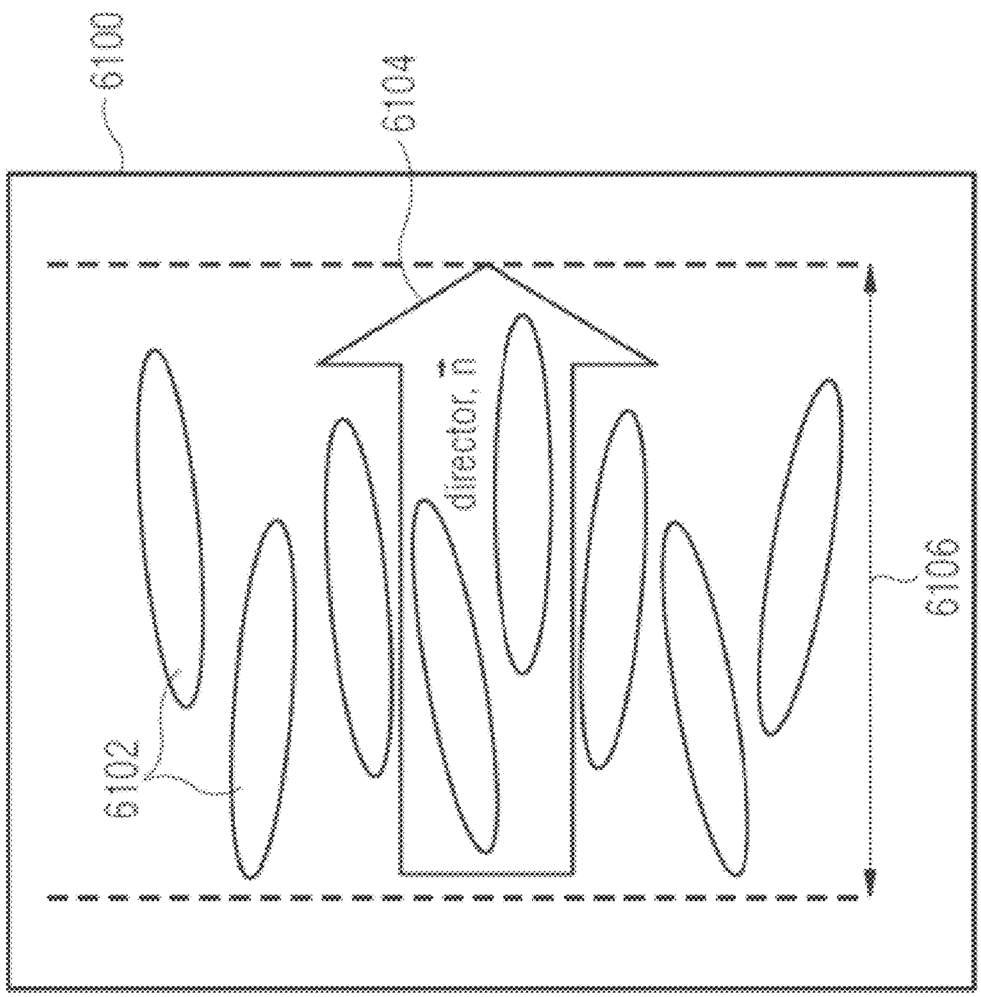

FIG. 61 shows a liquid crystal device in accordance with various embodiments.

Figure 62:
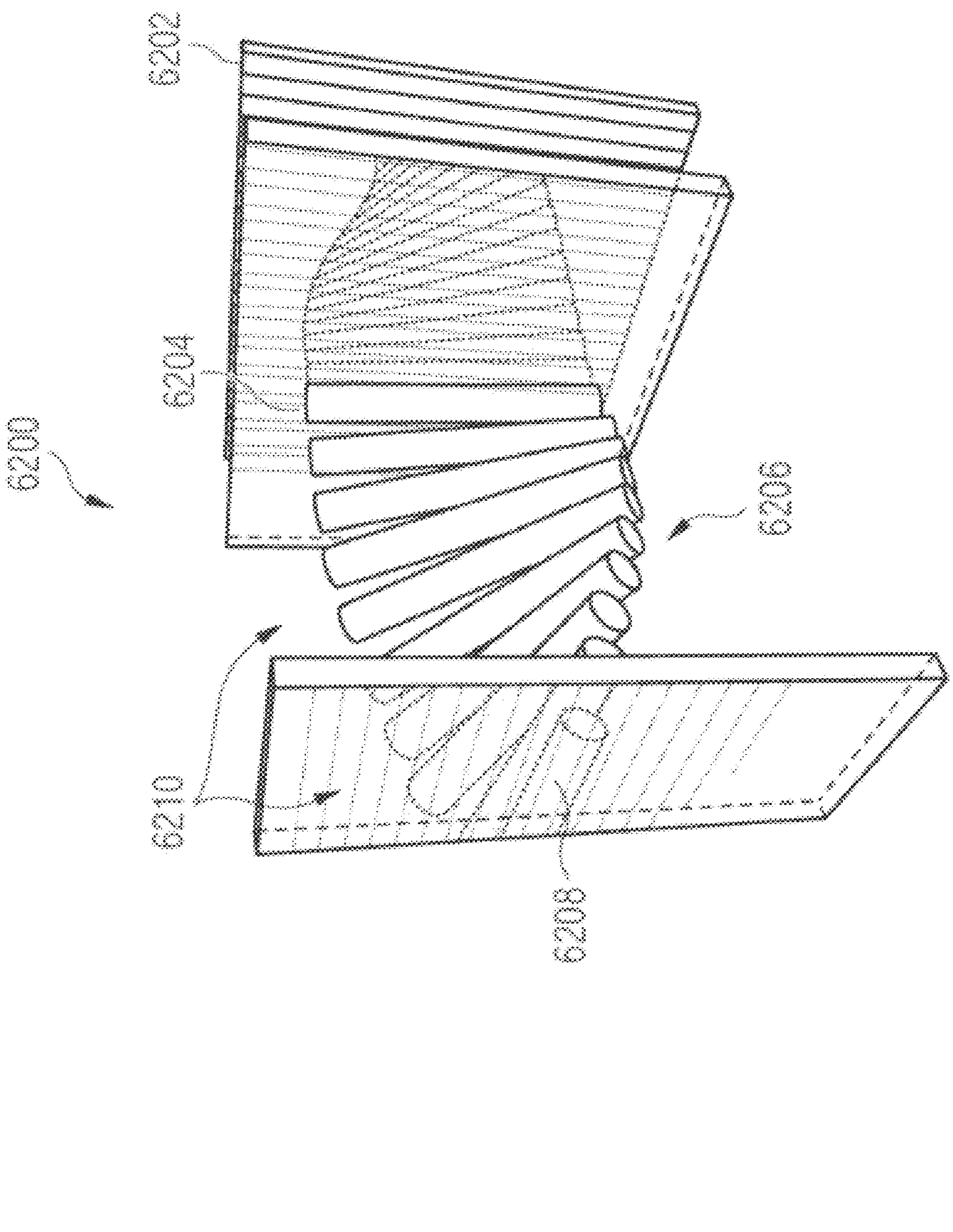

FIG. 62 shows a polarization device in accordance with various embodiments.

Figure 63:
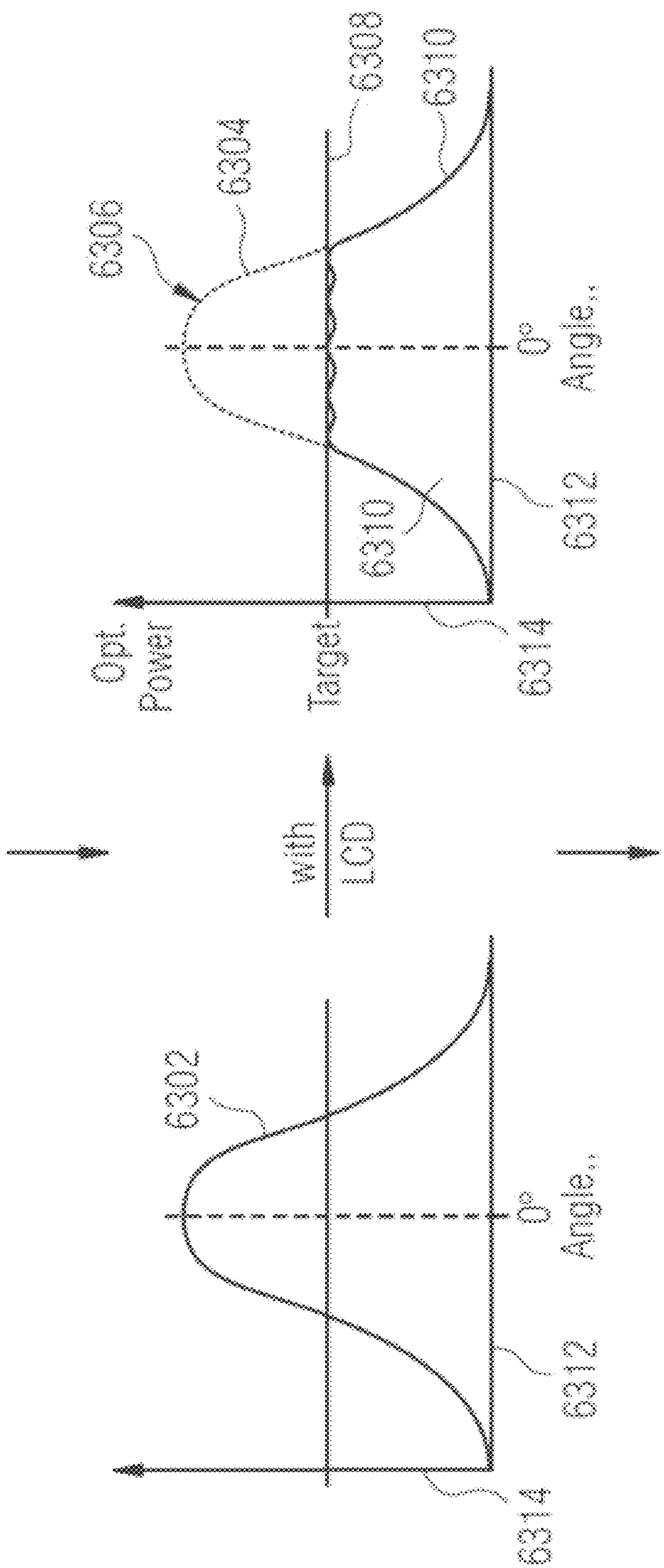

FIG. 63 shows optical power distributions in accordance with various embodiments.

Figure 64:
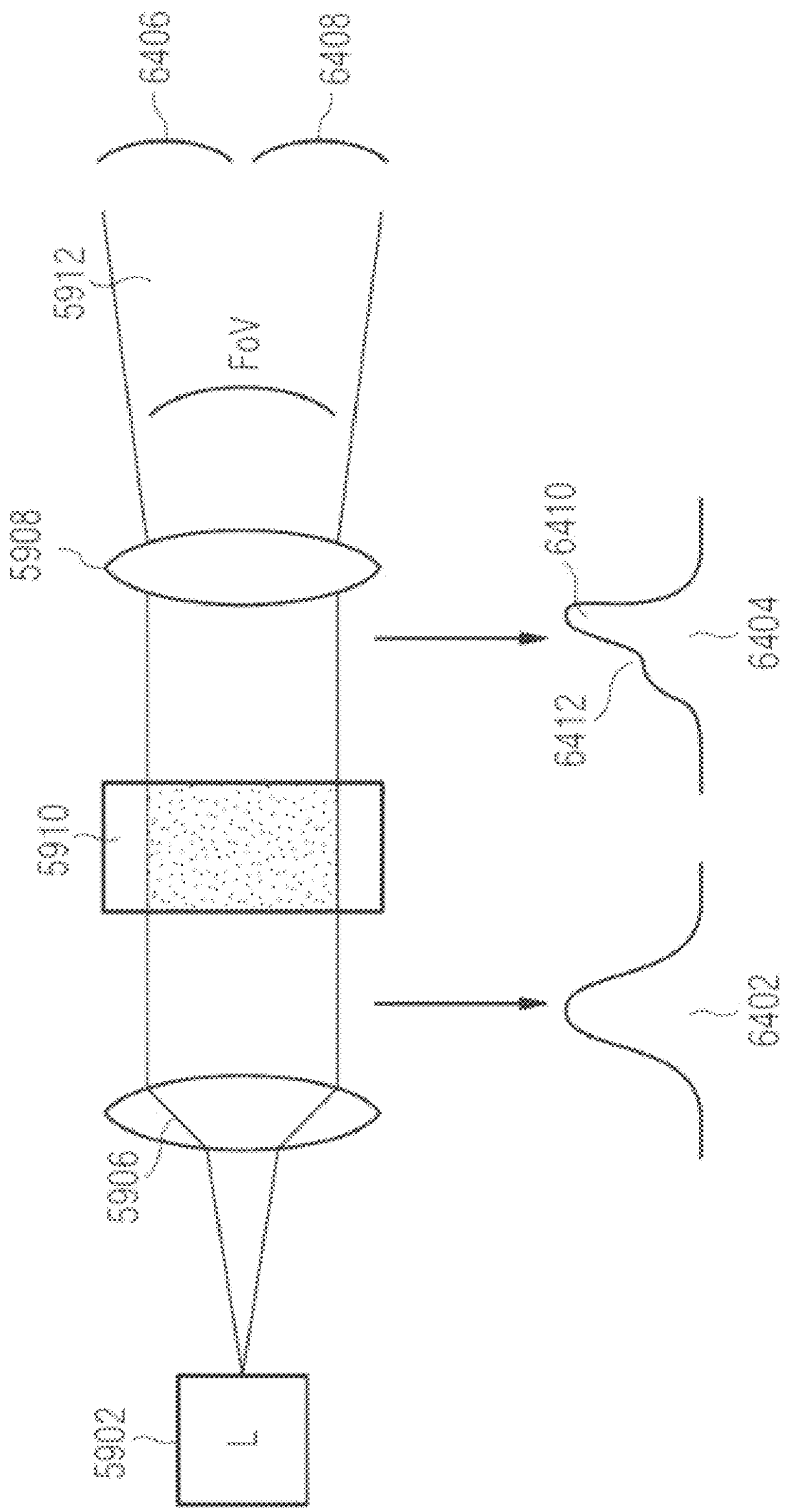

FIG. 64 shows laser beam profile shaping in accordance with various embodiments.

Figure 65:
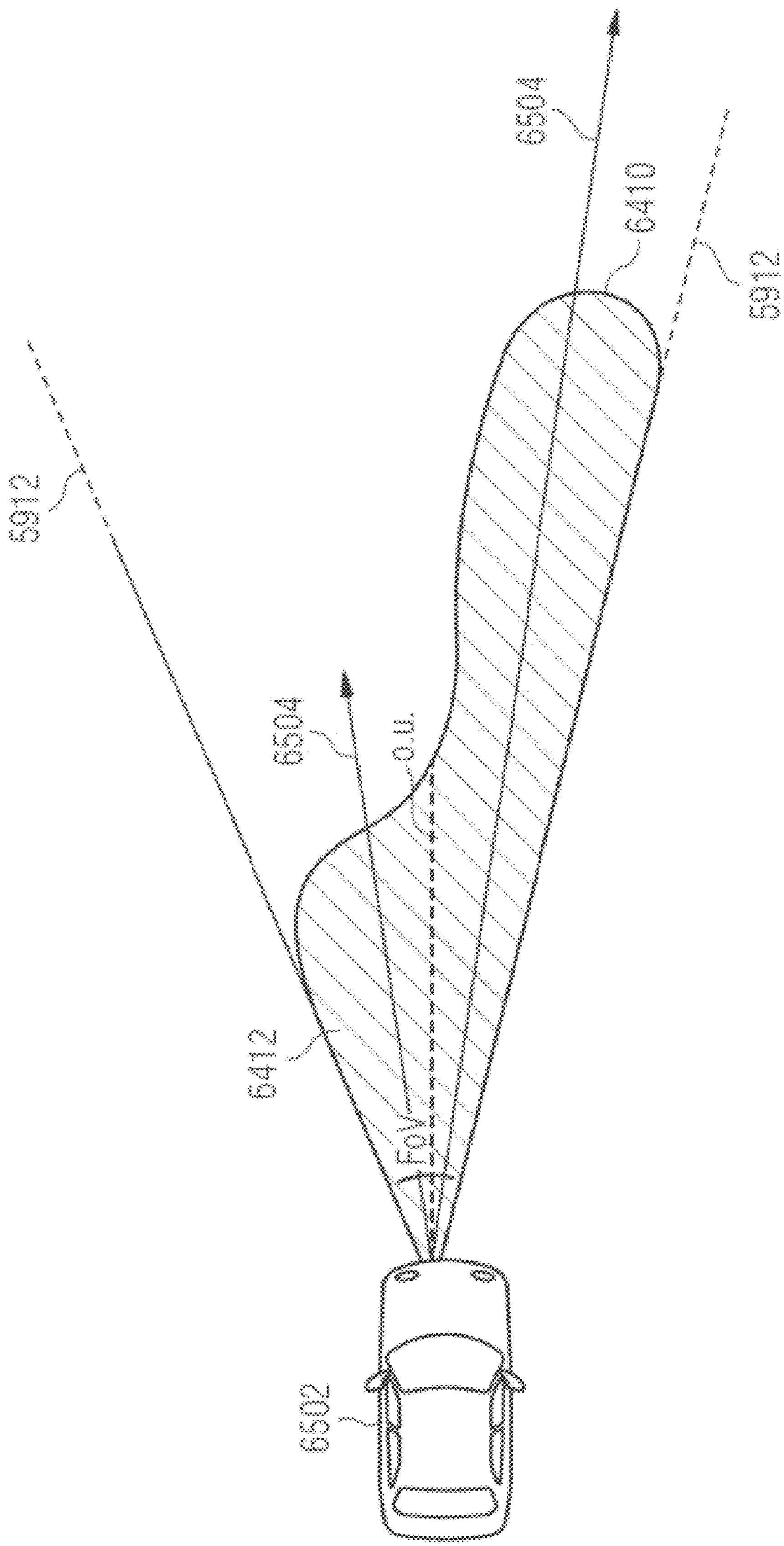

FIG. 65 shows a LIDAR vehicle and field of view in accordance with various embodiments.

Figure 66:
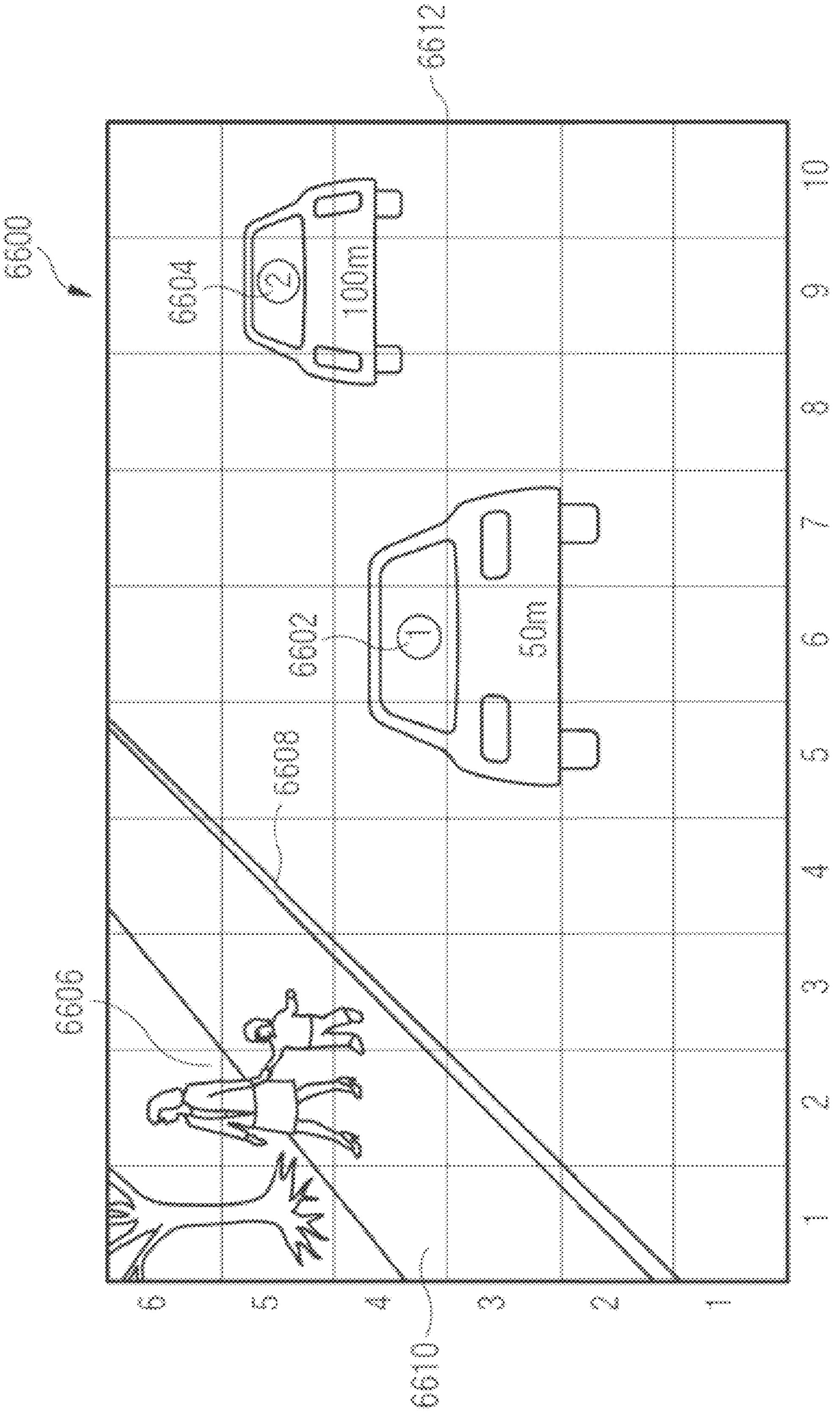

FIG. 66 shows a LIDAR field of view in accordance with various embodiments.

Figure 67:
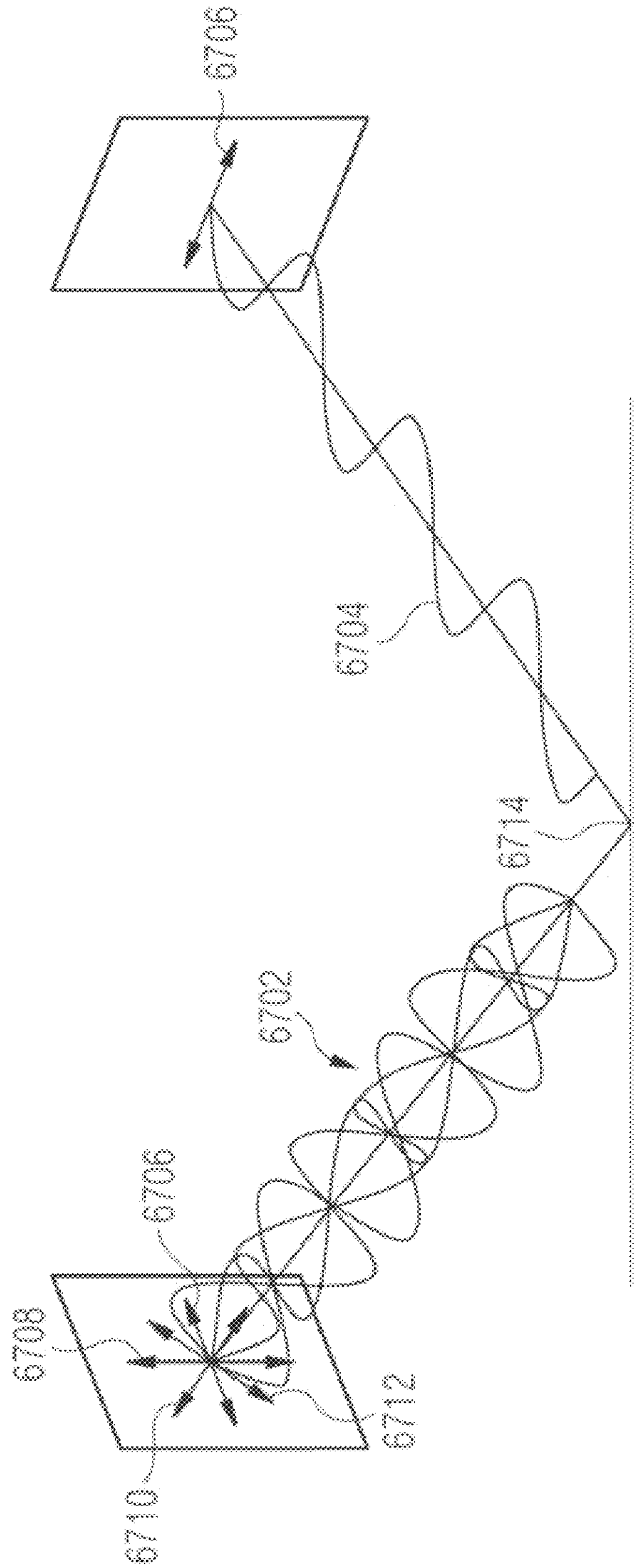

FIG. 67 shows light vibrations and polarizations in accordance with various embodiments.

Figure 68:
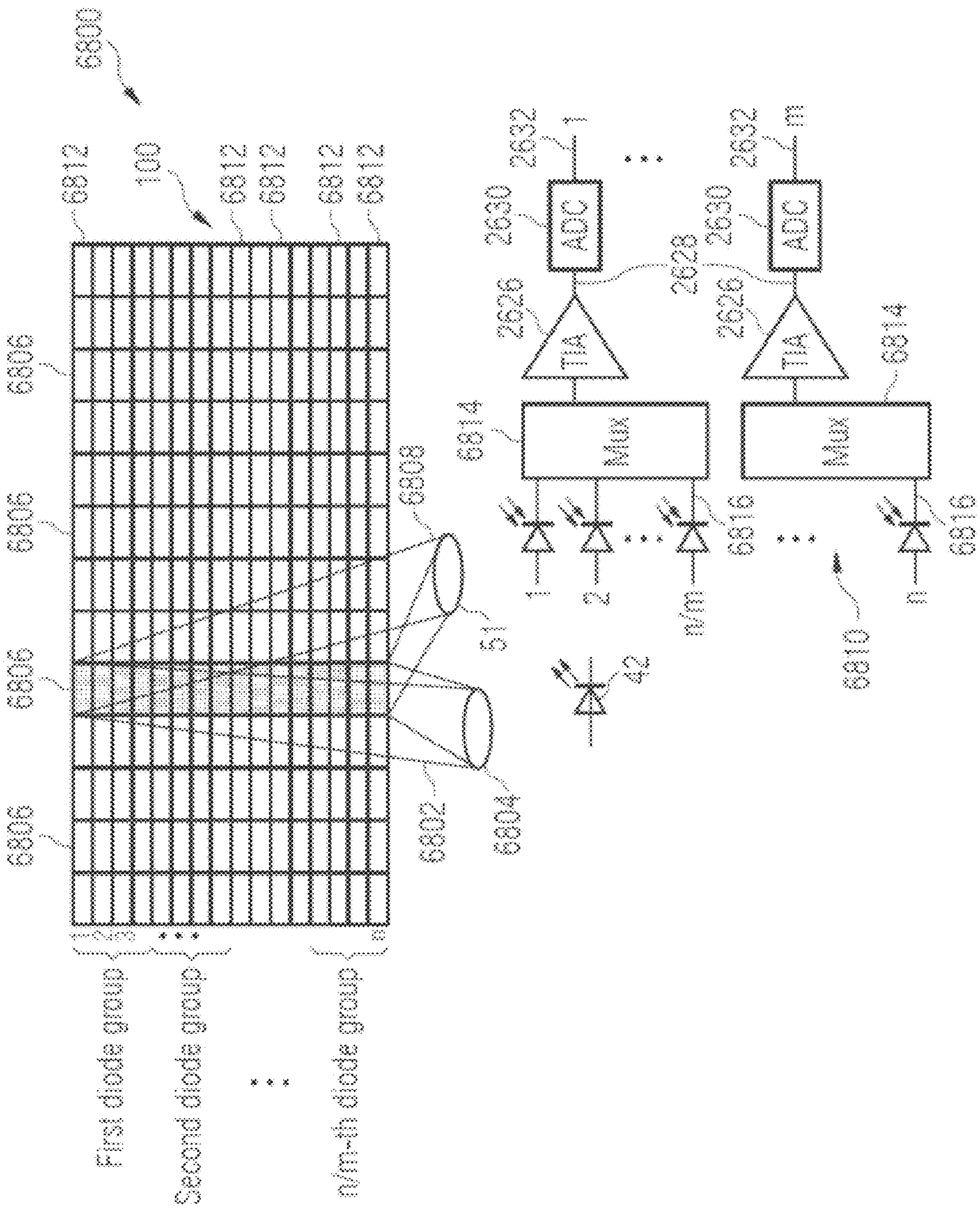

FIG. 68 shows an overview of a portion of the LIDAR Sensor System.

Figure 69:
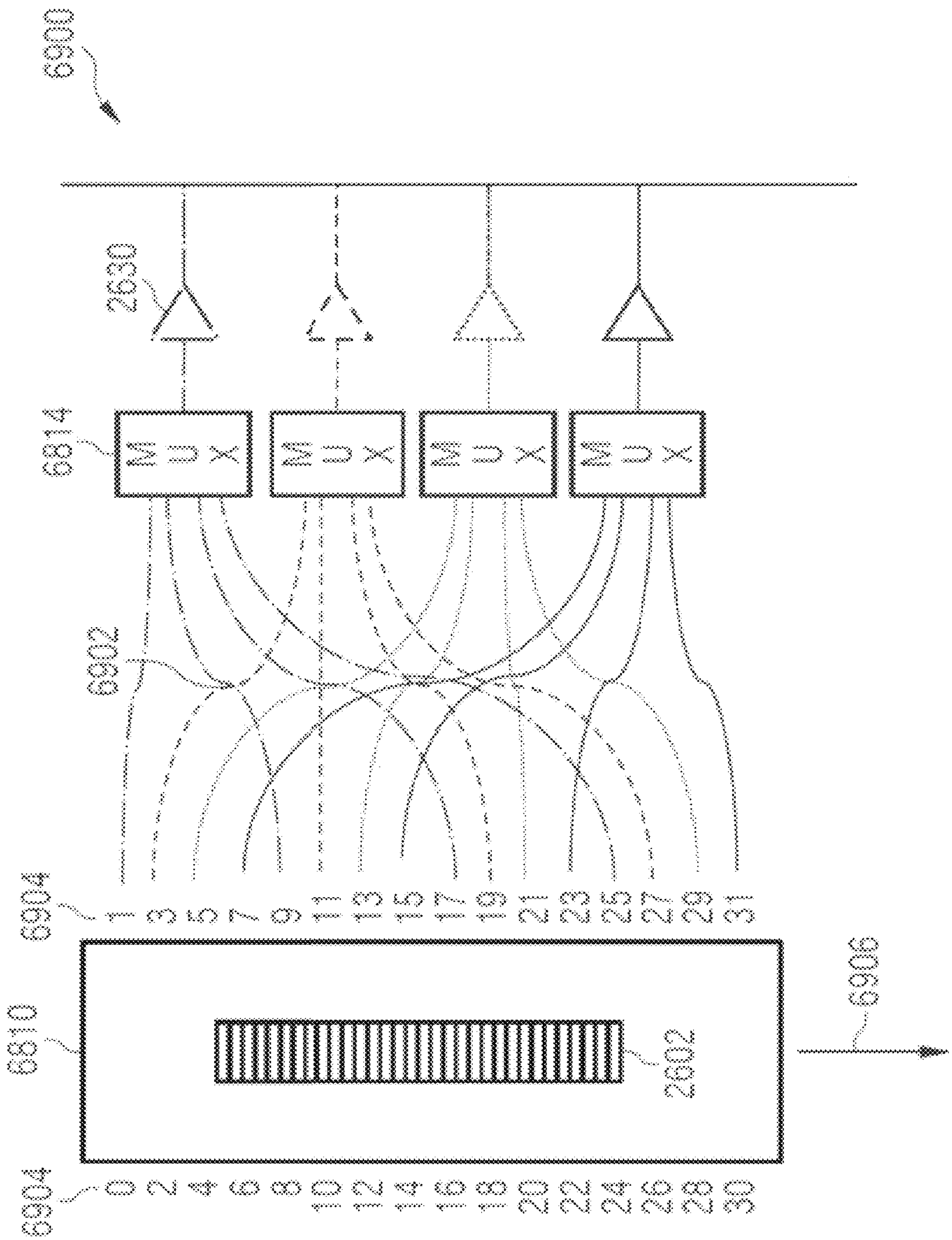

FIG. 69 illustrates a wiring scheme where the majority of crossing connections is between connecting structures of the receiver photo diode array and inputs of the multiplexers.

Figure 70:
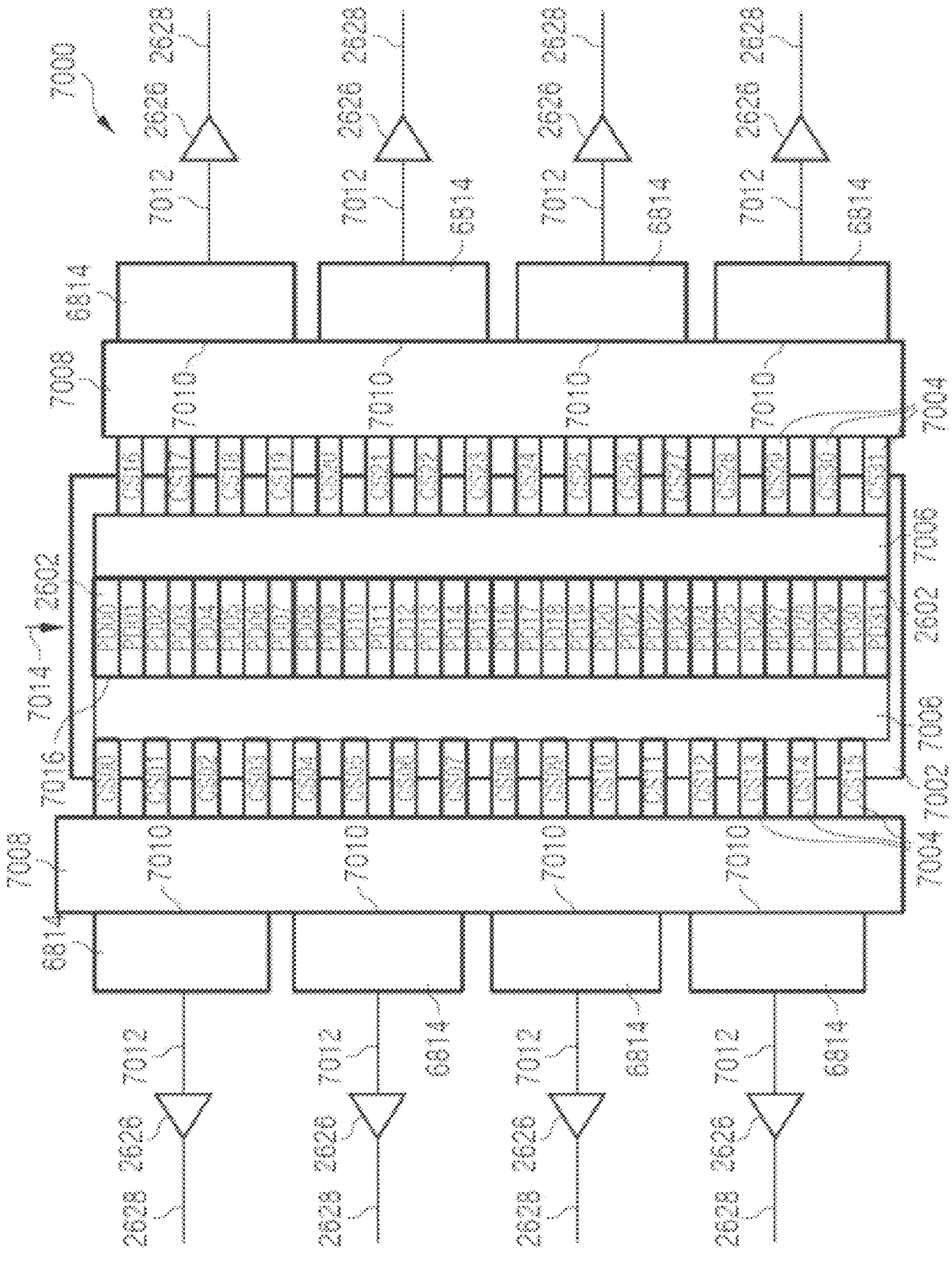

FIG. 70 shows an overview of a portion of the LIDAR Sensor is System illustrating a wiring scheme in accordance with various embodiments.

Figure 71:
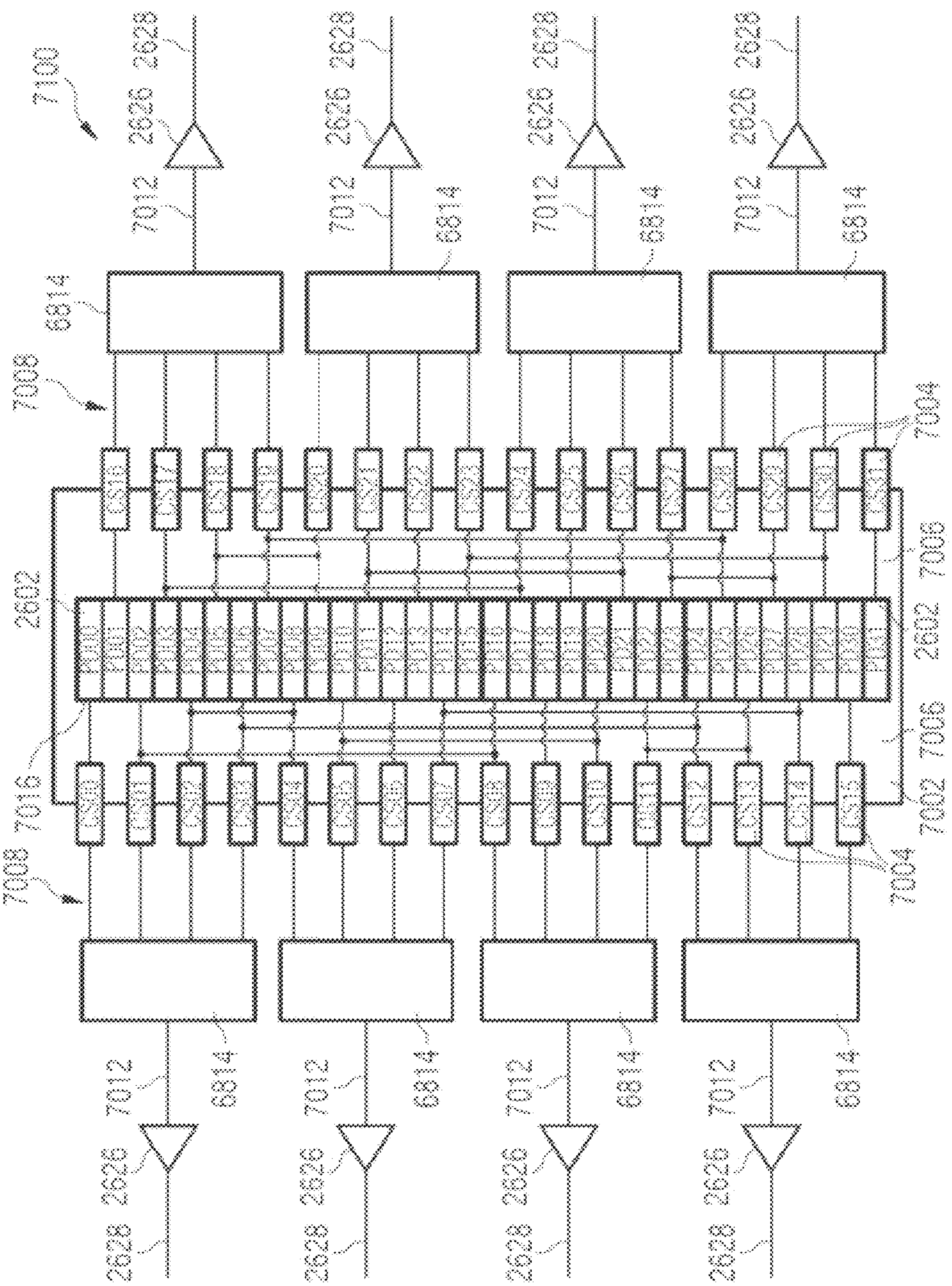

FIG. 71 shows an overview of a portion of the LIDAR Sensor System illustrating a wiring scheme in accordance with various embodiments in more detail.

Figure 72:
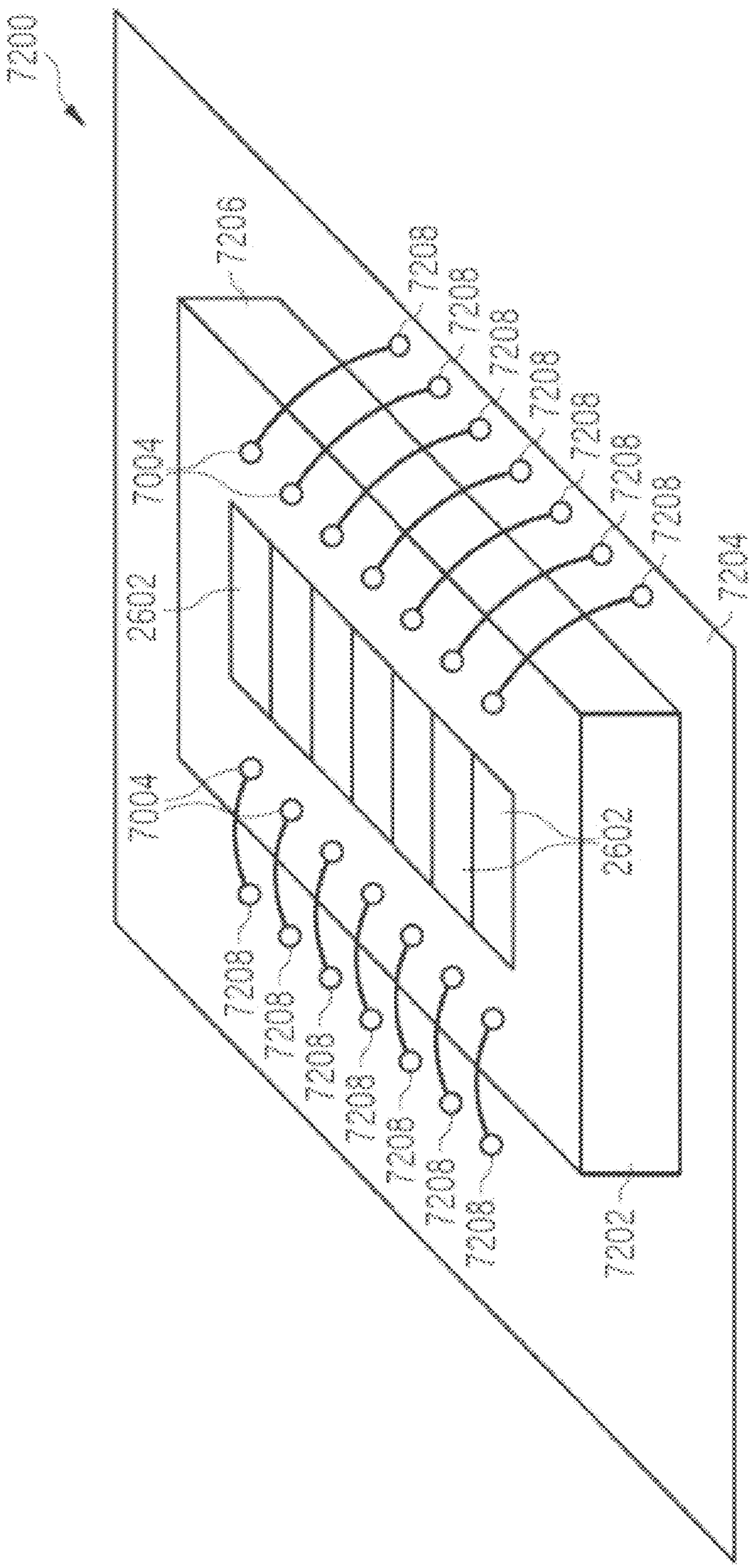

FIG. 72 shows a receiver photo diode array implemented as a chip-on-board photo diode array.

Figure 73:
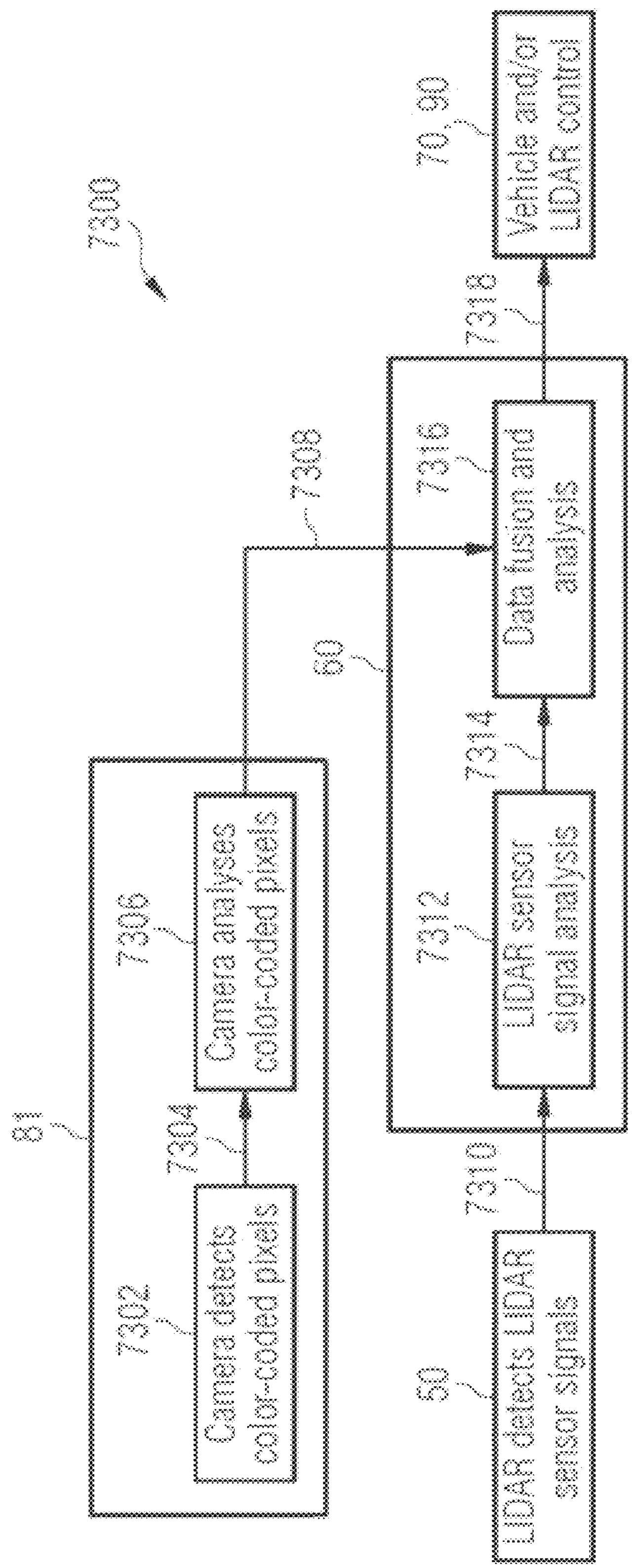

FIG. 73 shows a portion of the LIDAR Sensor System in accordance with various embodiments.

Figure 74:
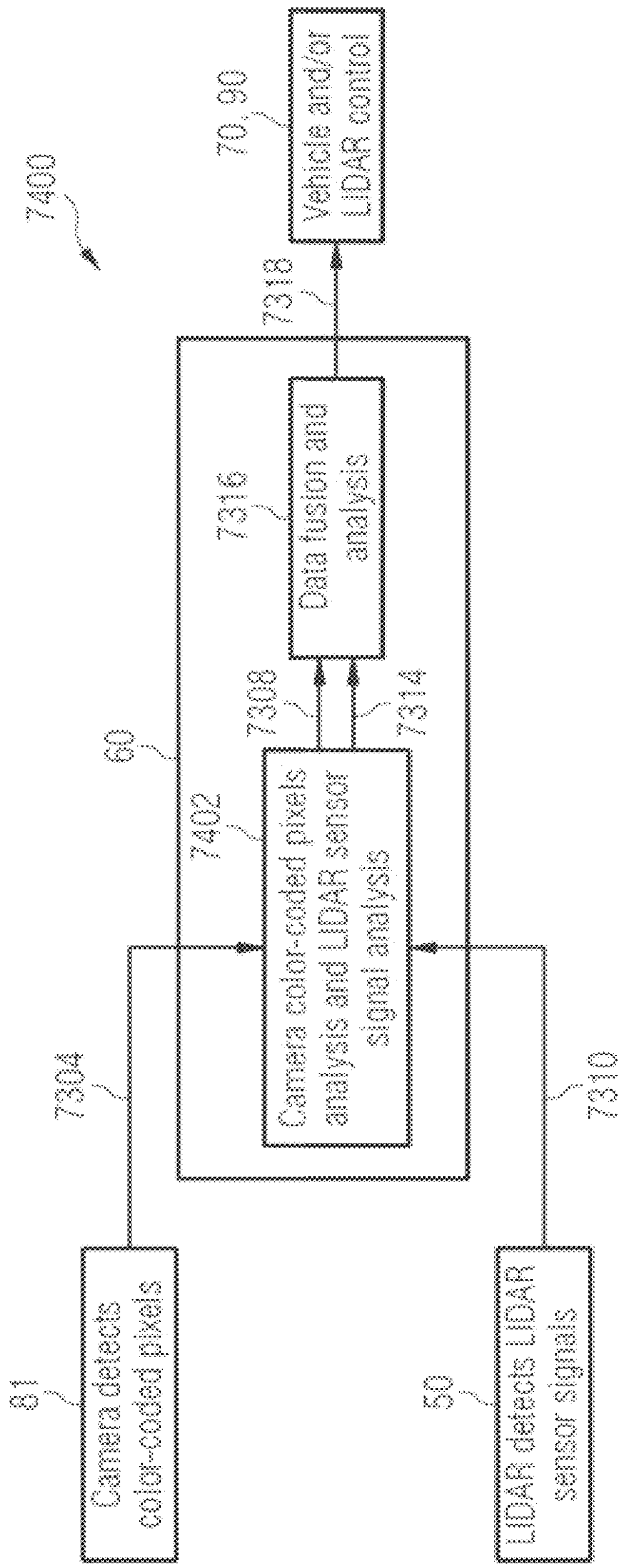

FIG. 74 shows a portion of the LIDAR Sensor System in accordance with various embodiments.

Figure 75:
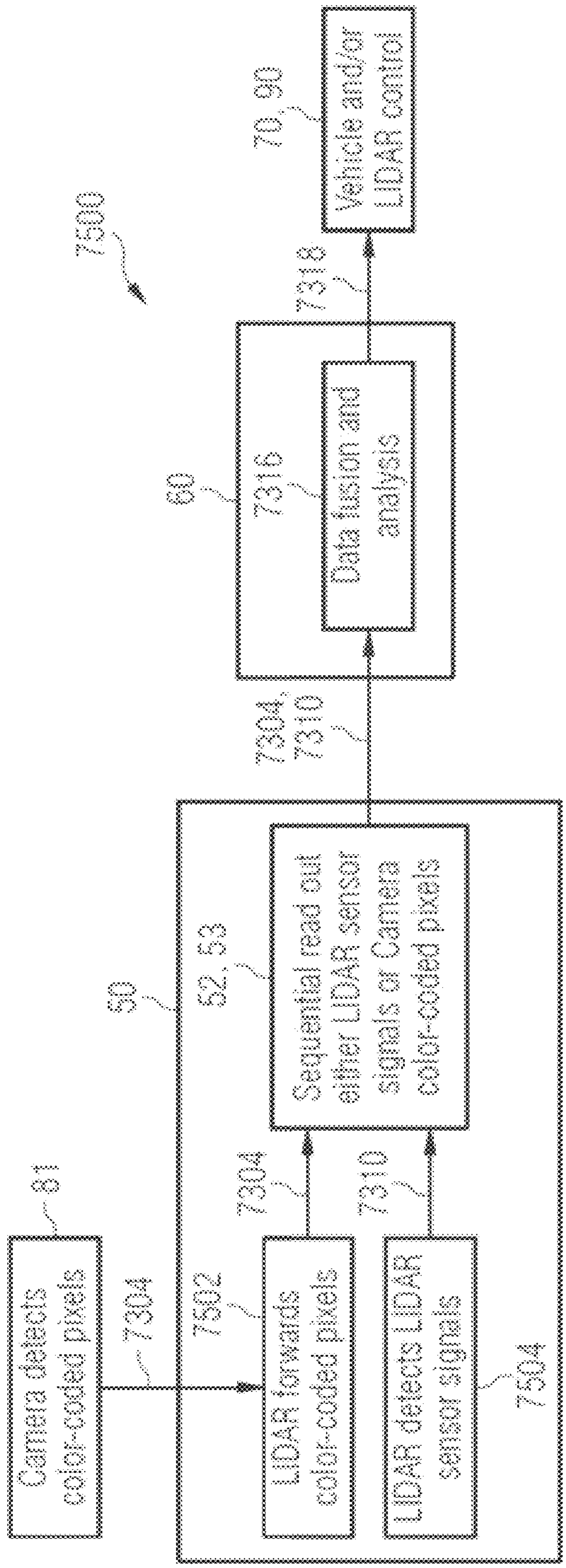

FIG. 75 shows a portion of the LIDAR Sensor System in accordance with various embodiments.

Figure 76:
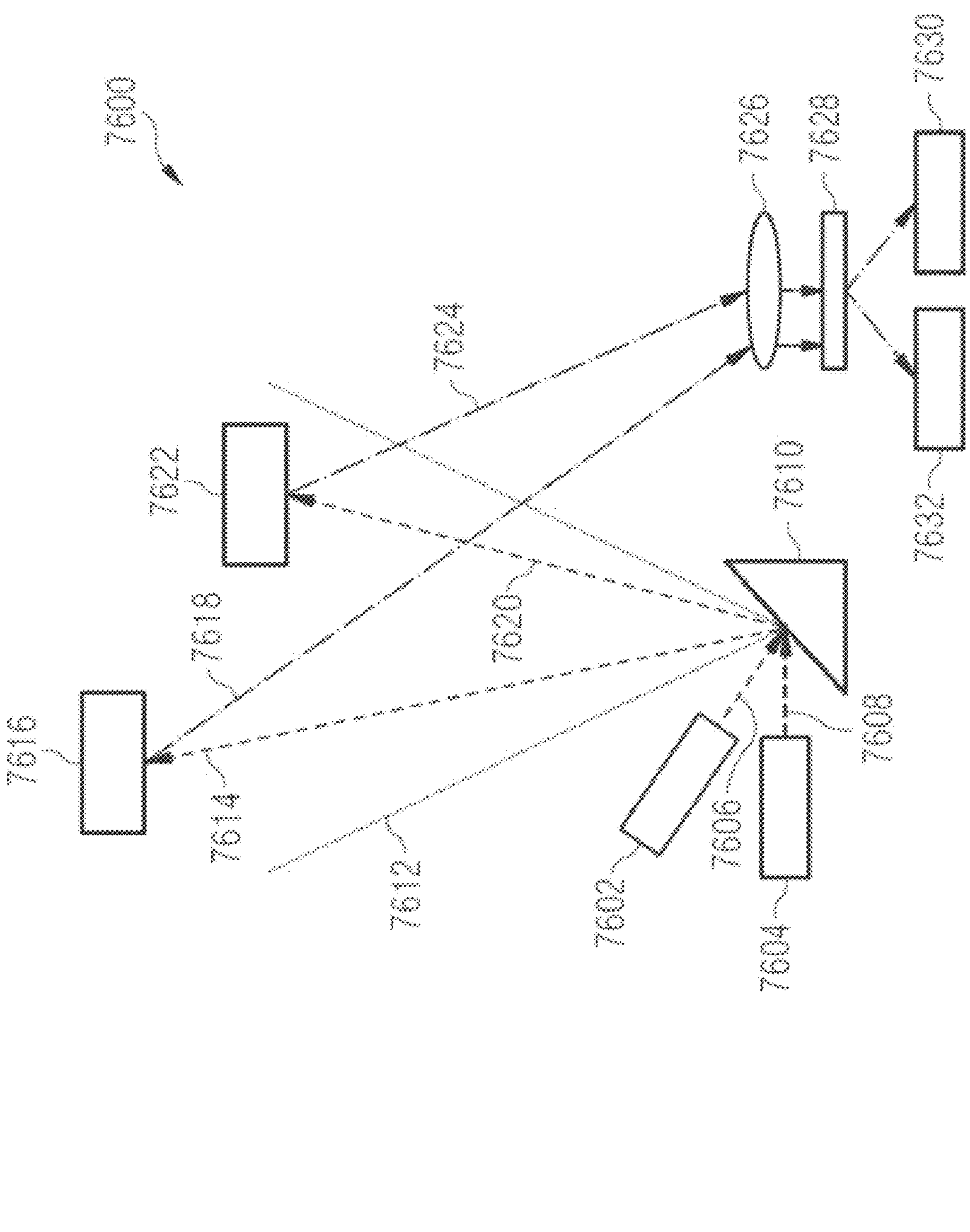

FIG. 76 shows a portion of a LIDAR Sensor System in accordance with various embodiments.

Figure 77:
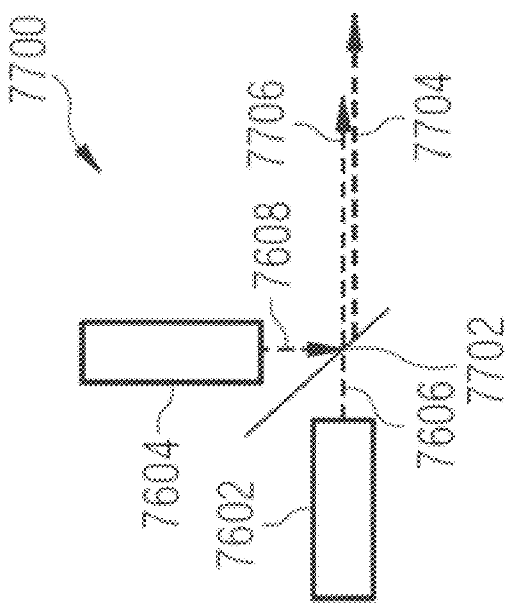

FIG. 77 shows a portion of a LIDAR Sensor System in accordance with various embodiments.

Figure 78:
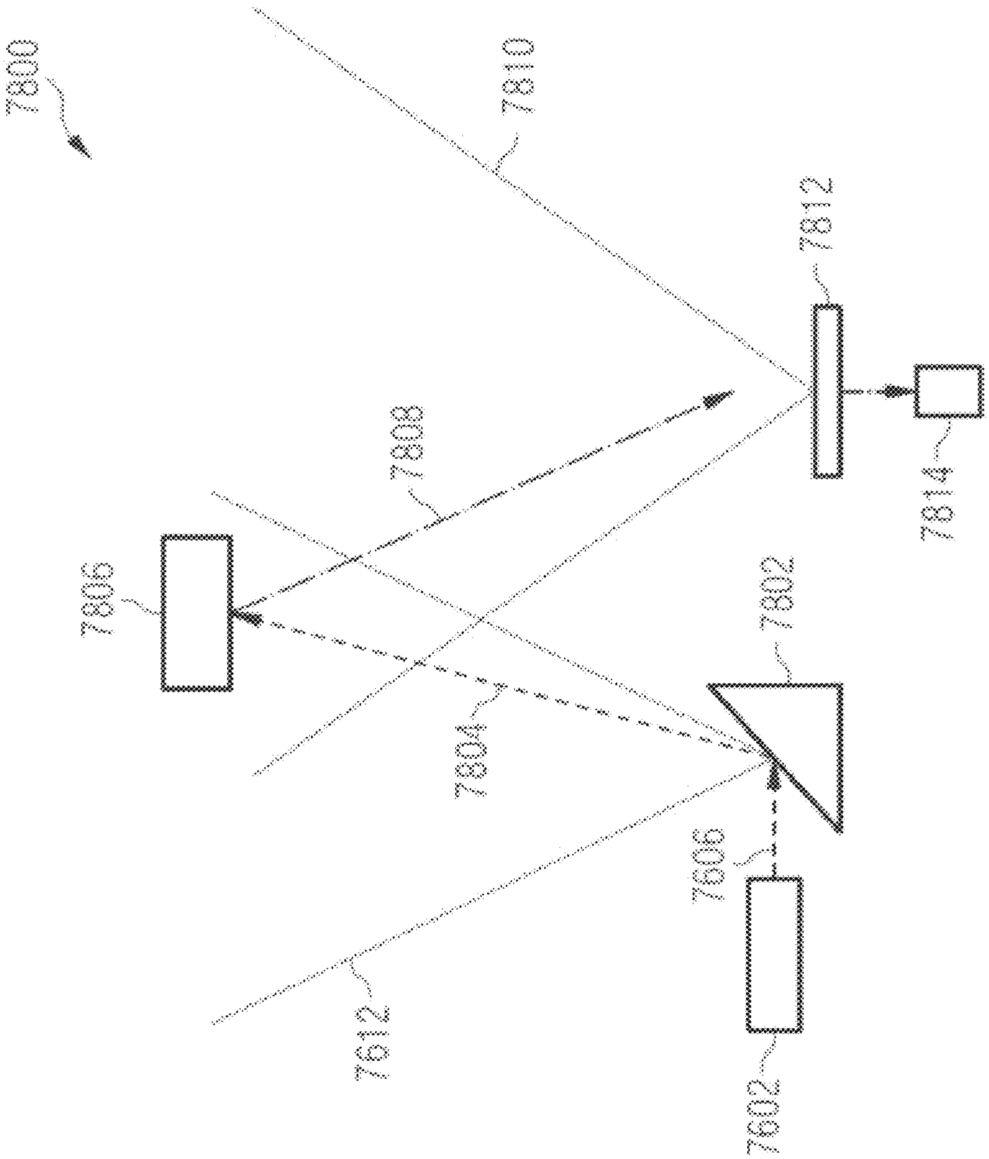

FIG. 78 shows a portion of a LIDAR Sensor System in accordance with various embodiments.

Figure 79:
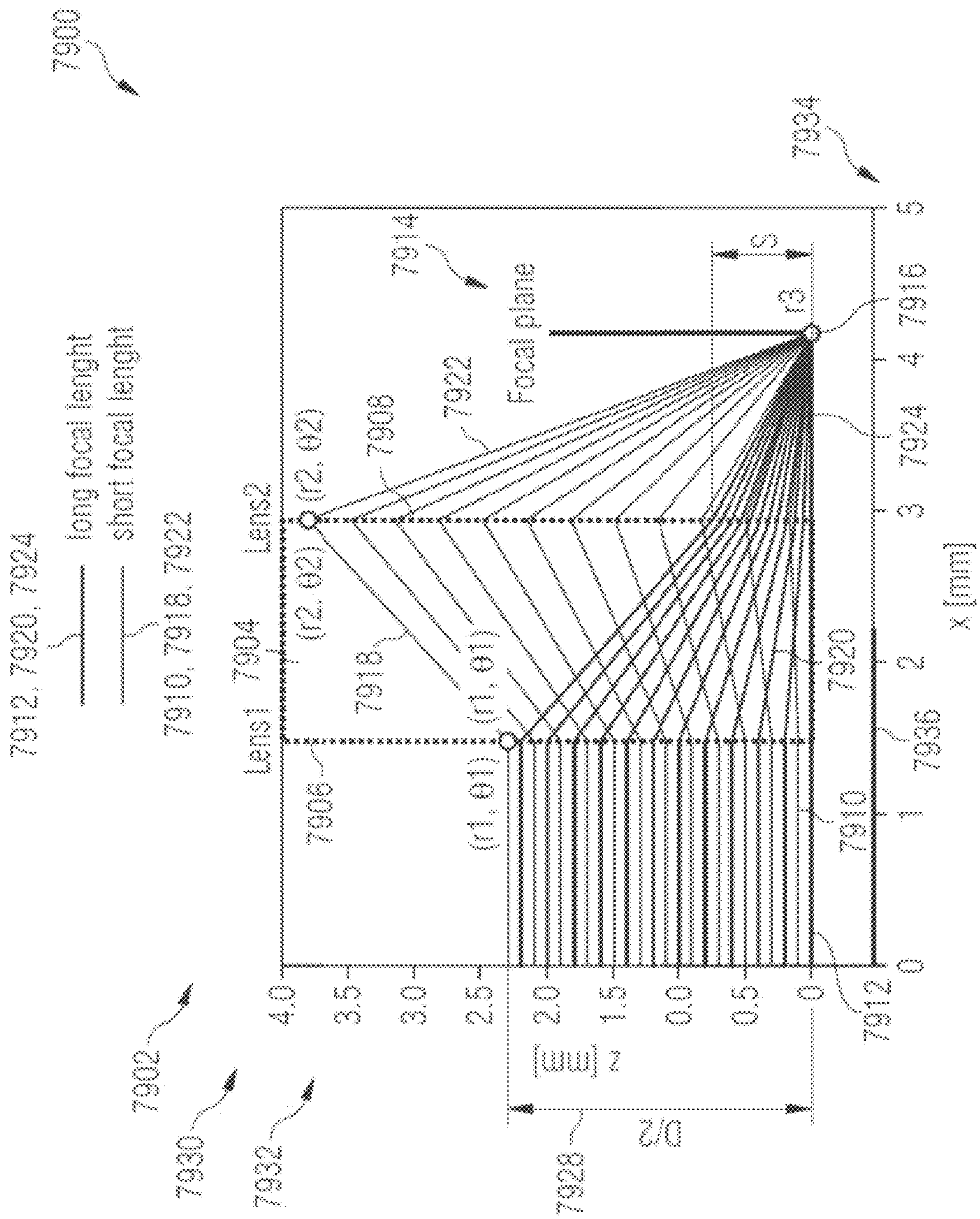

FIG. 79 shows a setup of a dual lens with two metasurfaces in accordance with various embodiments.

Figure 80:
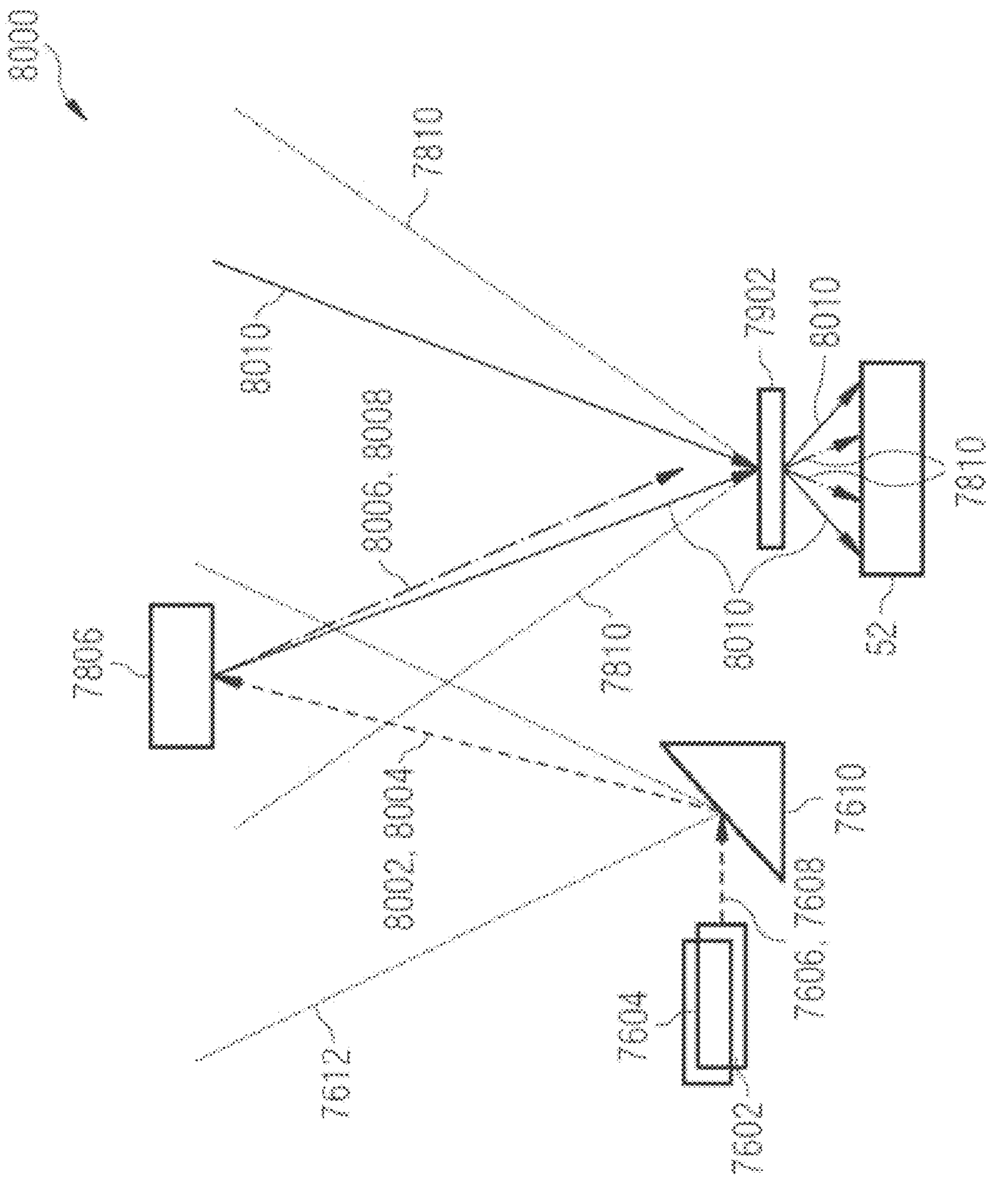

FIG. 80 shows a portion of a LIDAR Sensor System in accordance with various embodiments.

Figure 81:
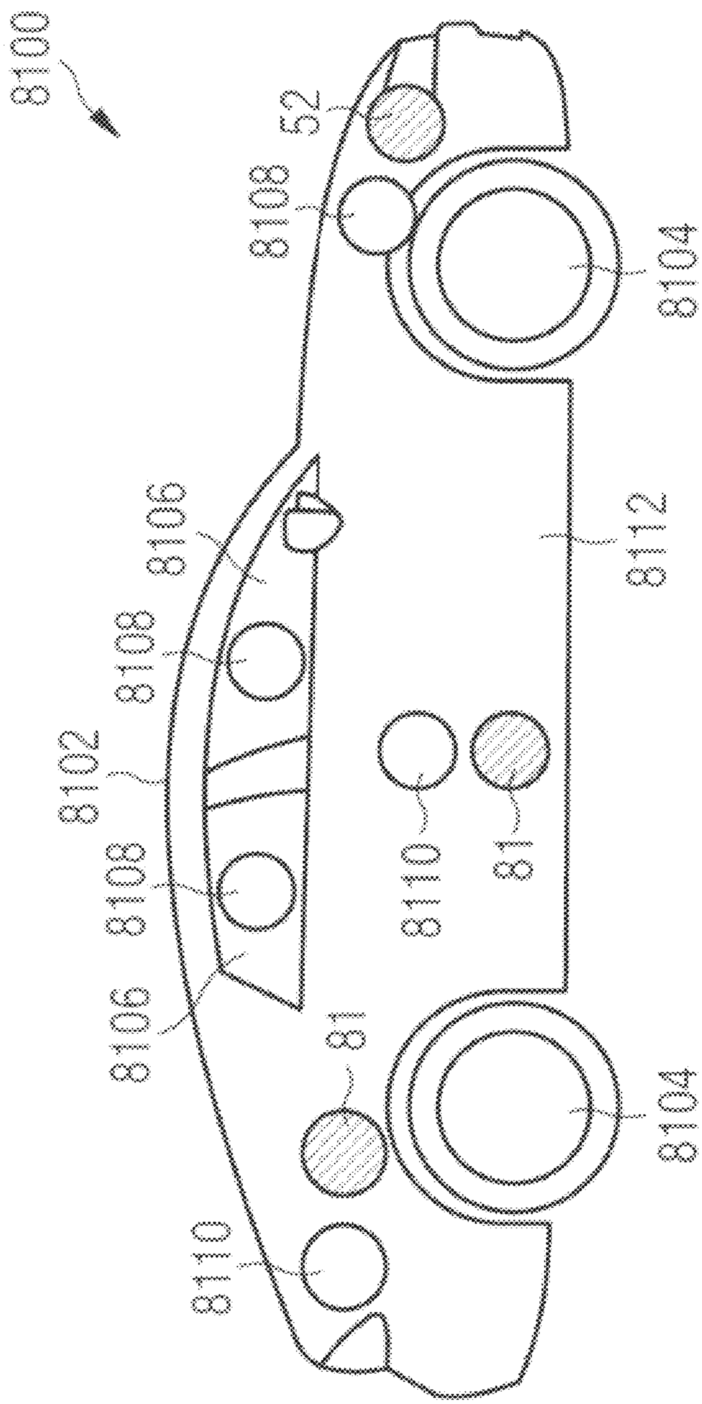

FIG. 81 shows a side view of a vehicle in accordance with various embodiments.

Figure 82:
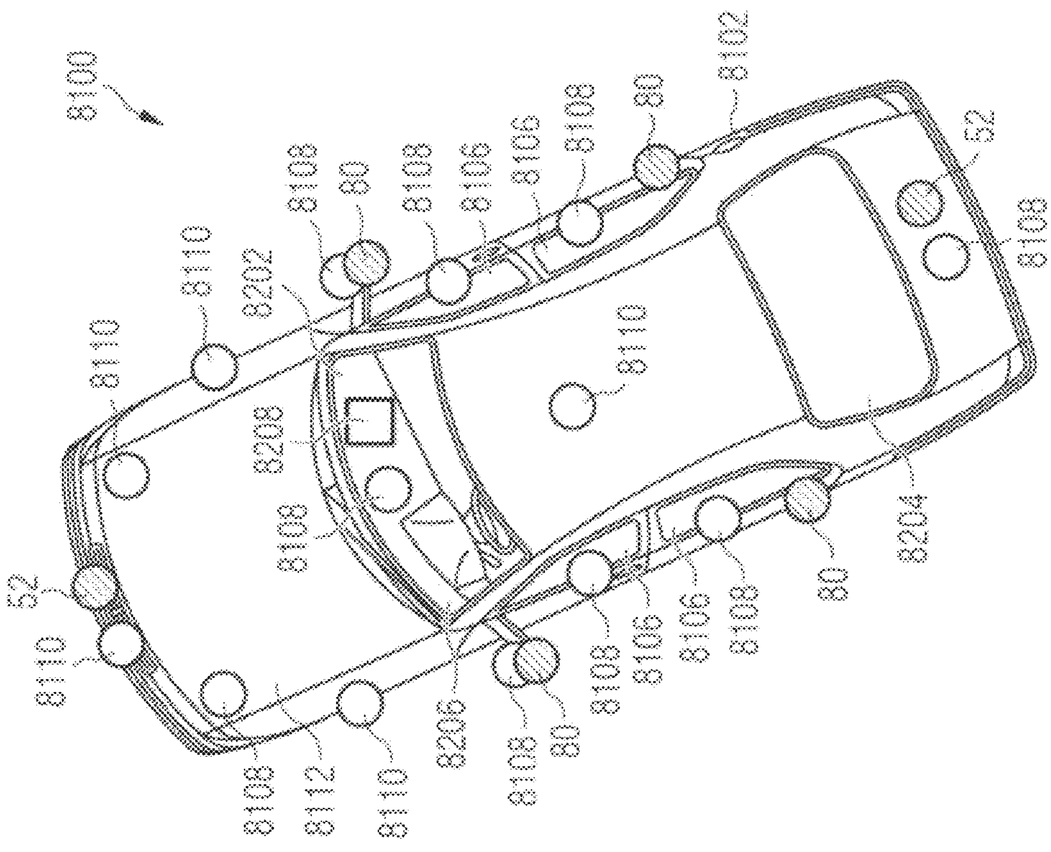

FIG. 82 shows a top view of the vehicle of FIG. 81.

Figure 83:
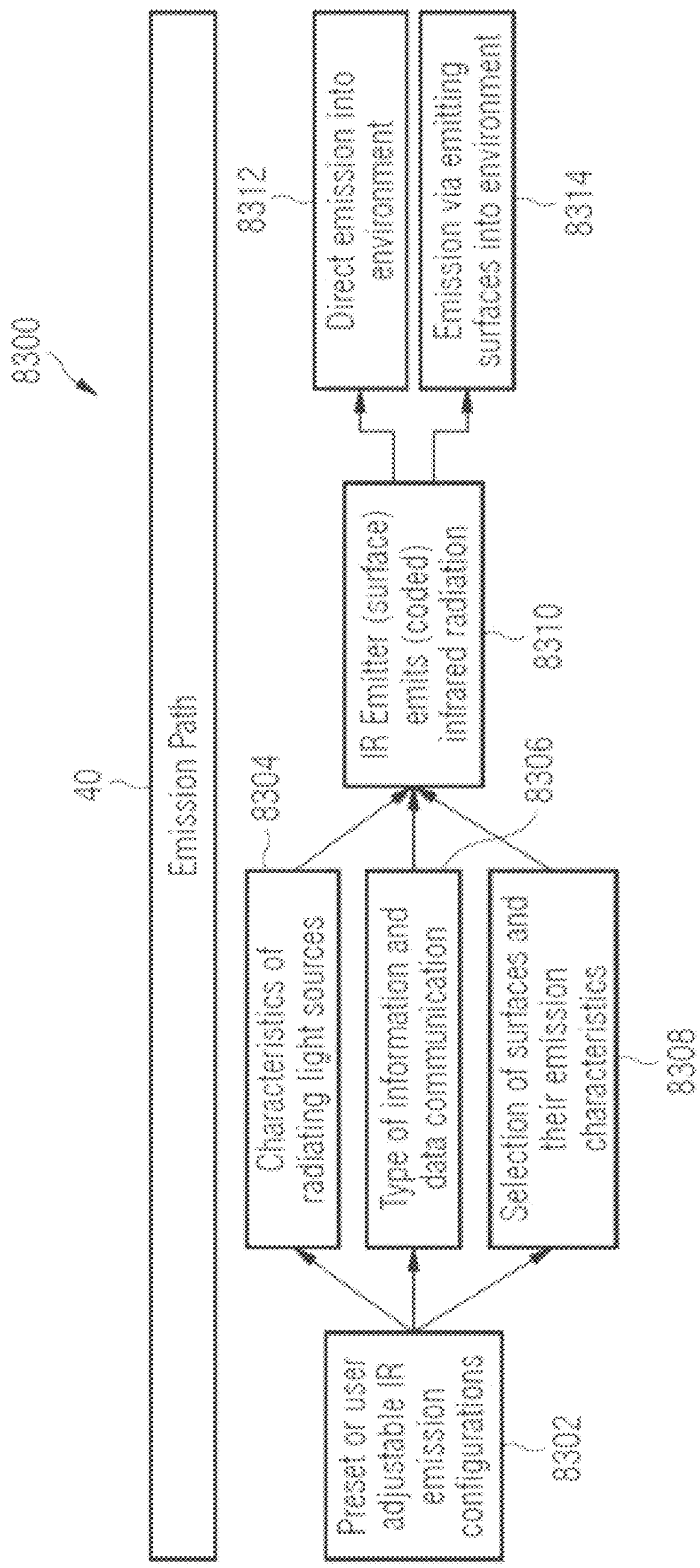

FIG. 83 shows a flow diagram illustrating a process performed in the First LIDAR Sensor System in accordance with various embodiments.

Figure 84:
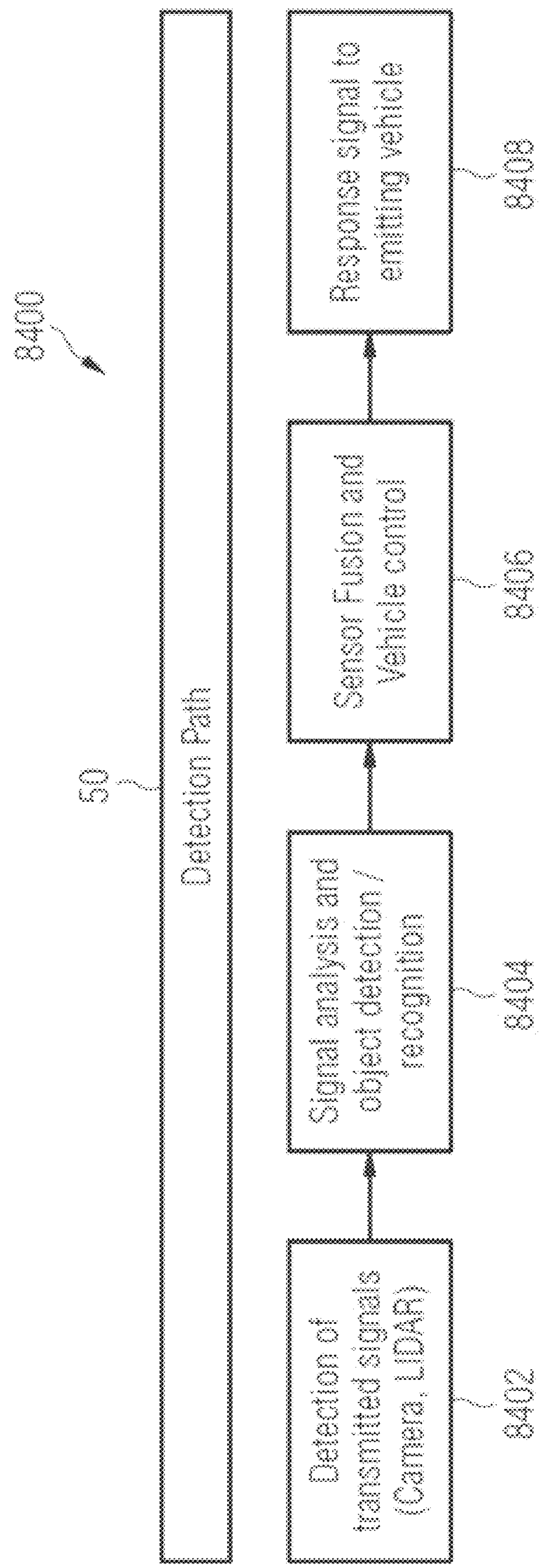

FIG. 84 shows a flow diagram illustrating a process performed in the Second LIDAR Sensor System in accordance with various embodiments.

Figure 85:
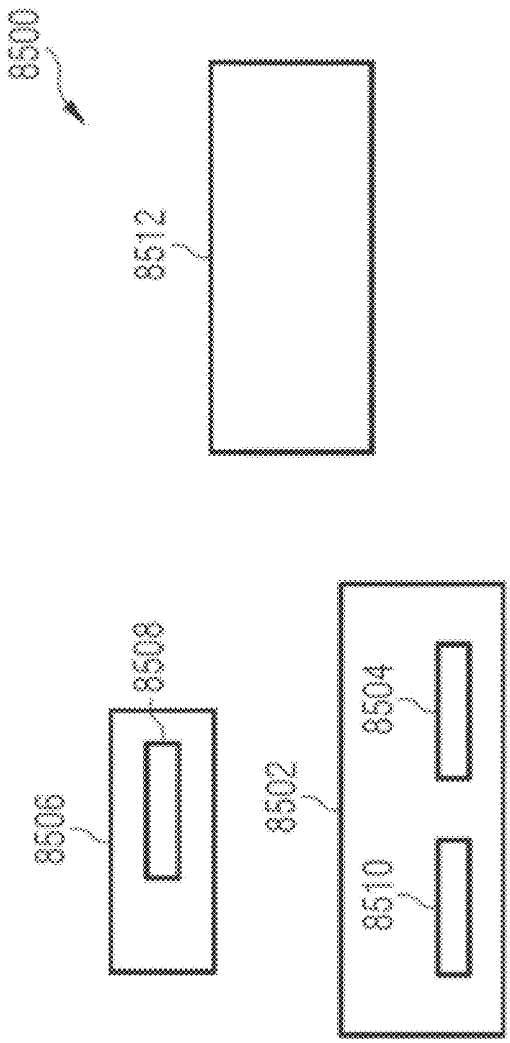

FIG. 85 shows a system including a vehicle, a vehicle sensor system, and an external object in accordance with various embodiments.

Figure 86:
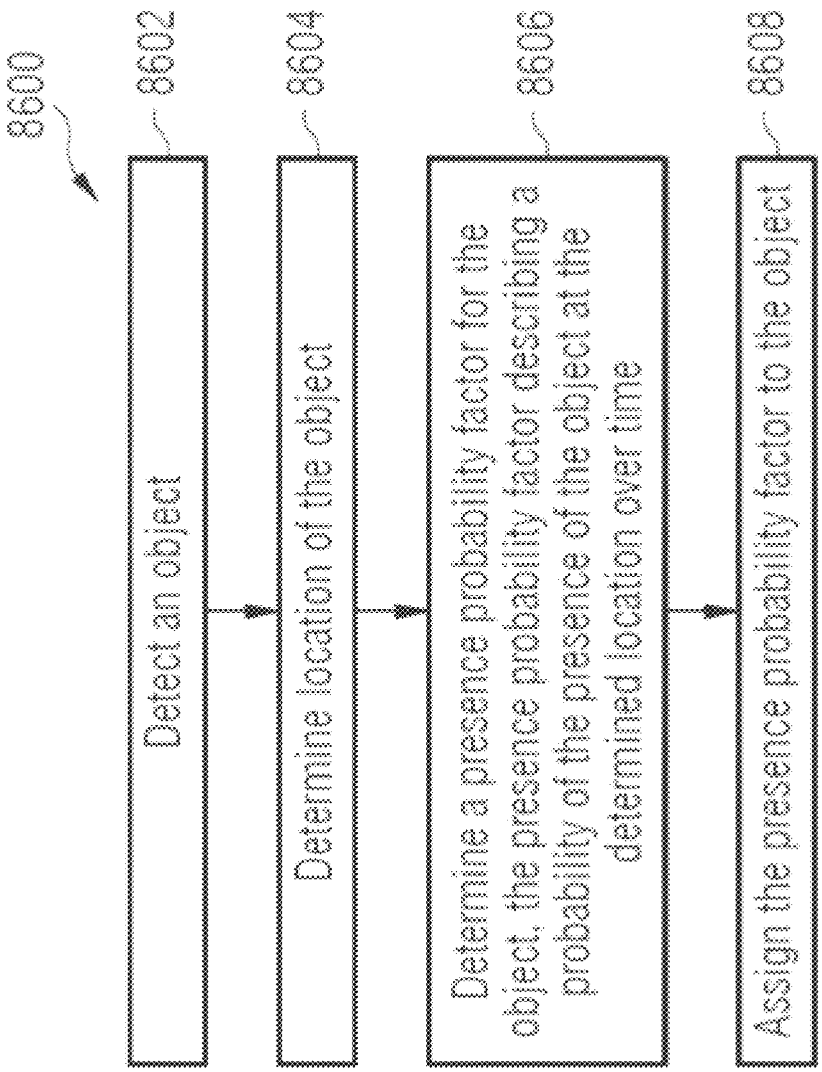

FIG. 86 shows a method in accordance with various embodiments.

Figure 87:
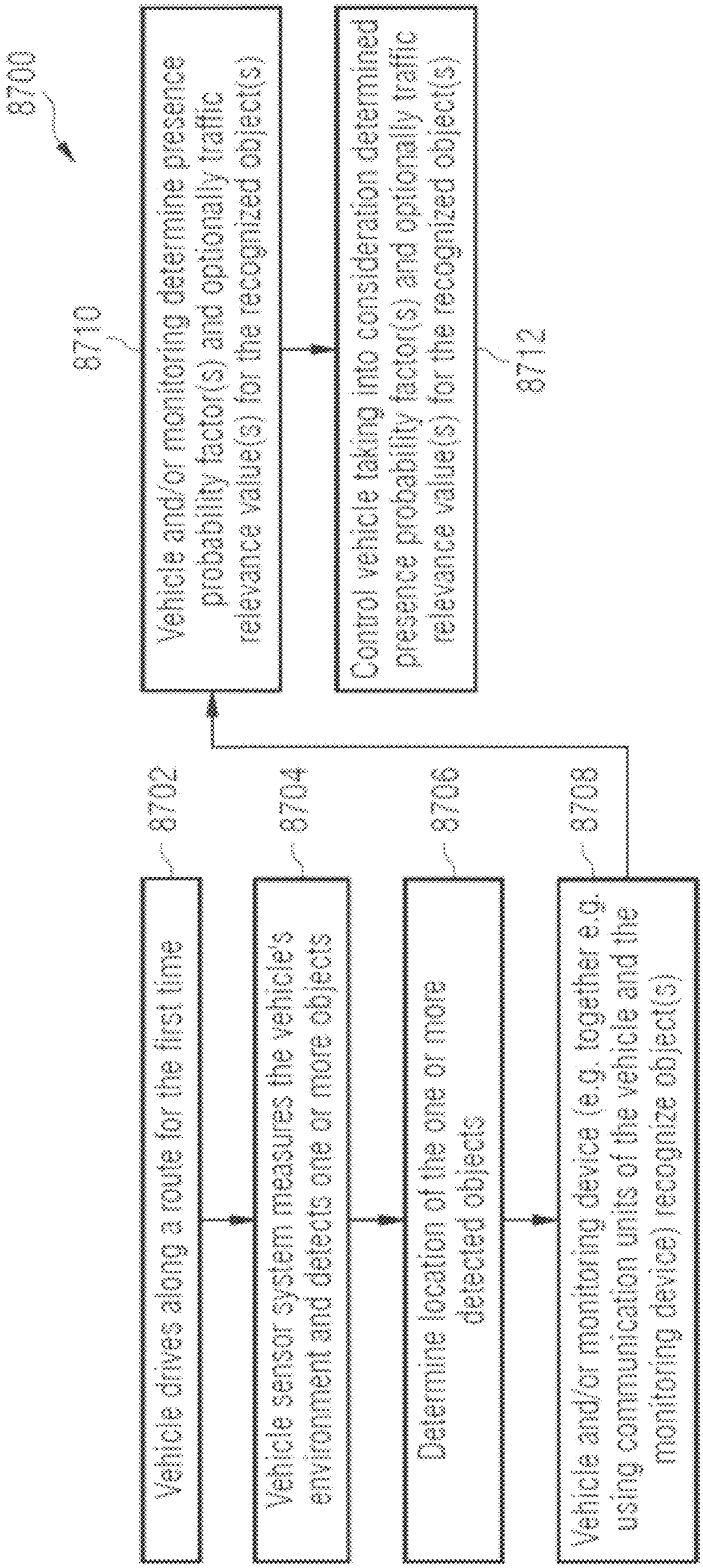

FIG. 87 shows a method in accordance with various embodiments in more detail.

Figure 88:
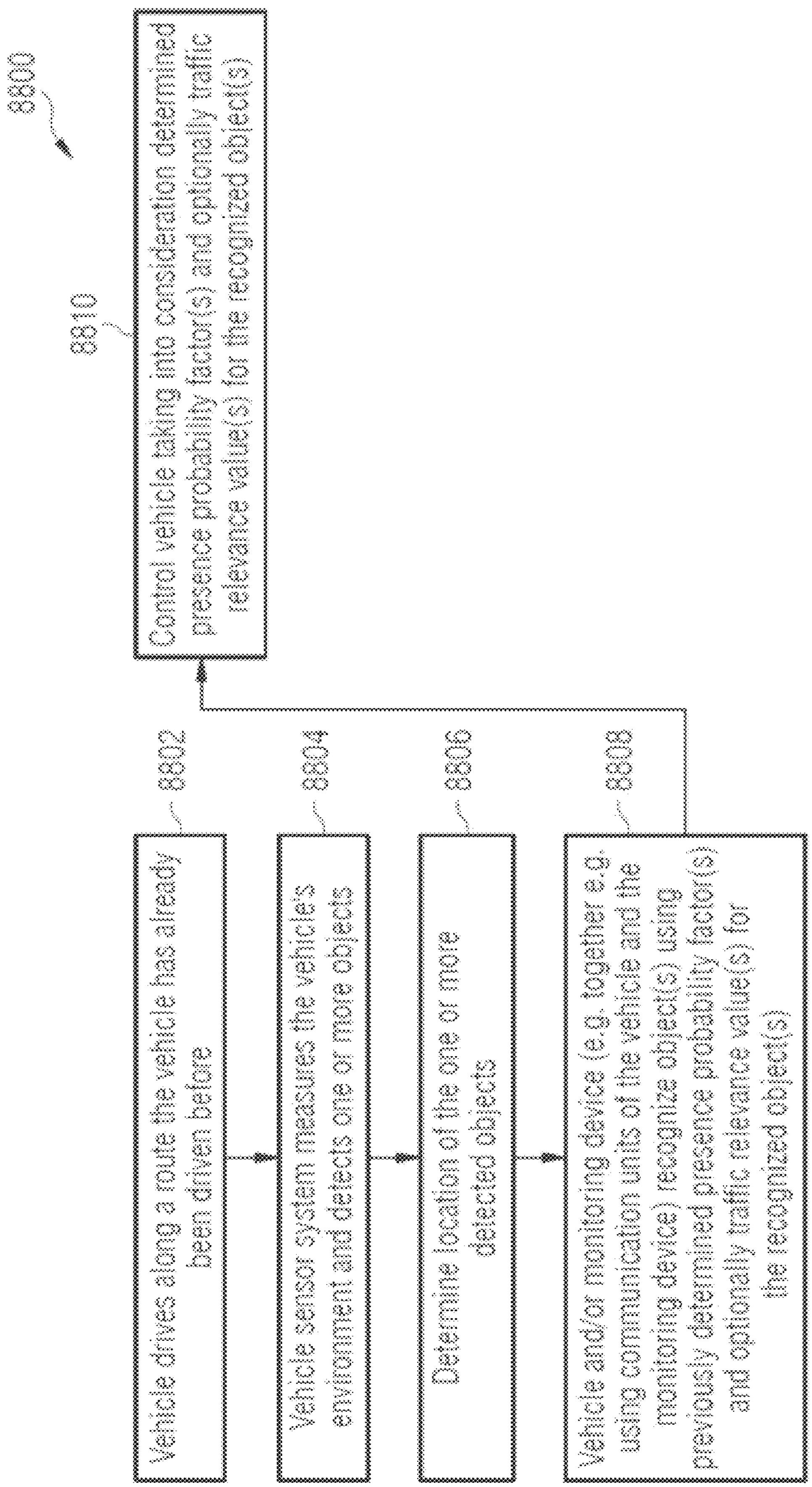

FIG. 88 shows a method in accordance with various embodiments in more detail.

Figure 89:
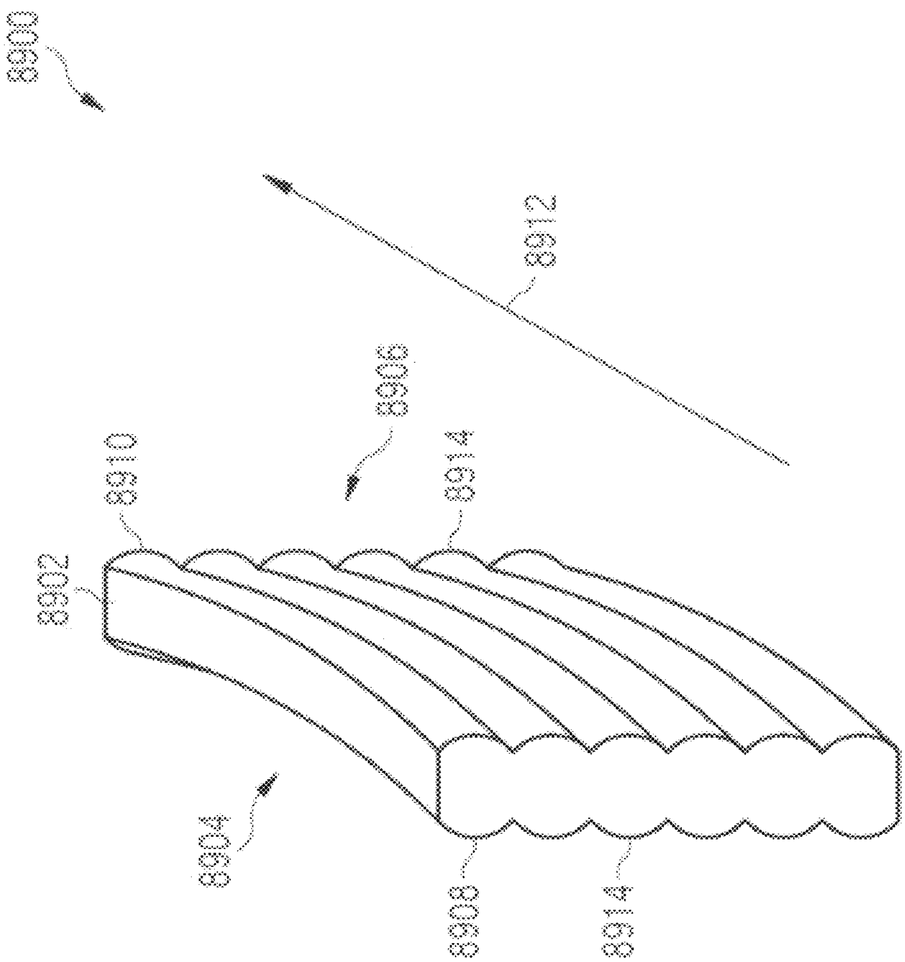

FIG. 89 shows an optical component in accordance with various embodiments.

Figure 90:
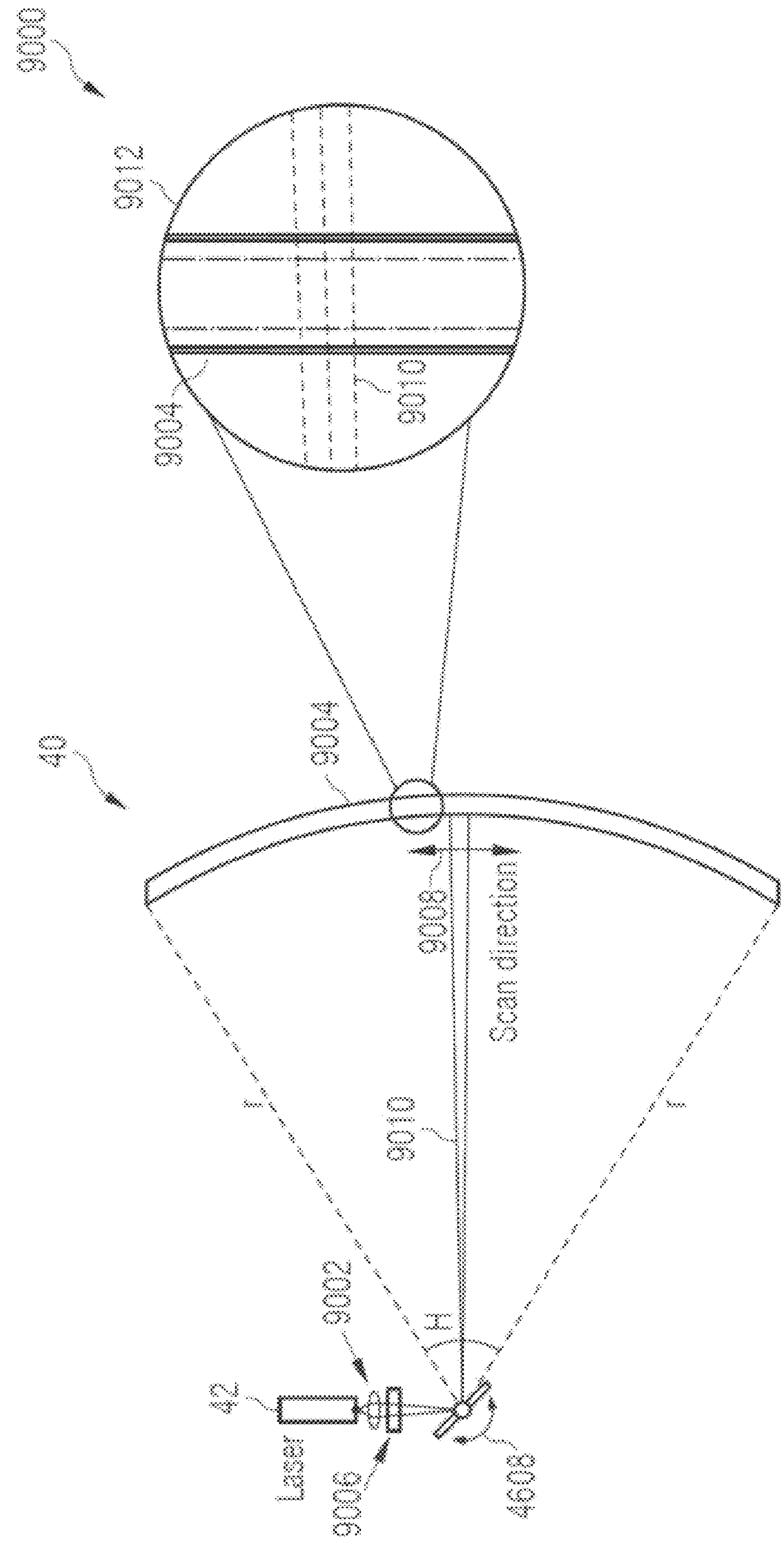

FIG. 90 shows a top view of the First LIDAR Sensing System in accordance with various embodiments.

Figure 91:
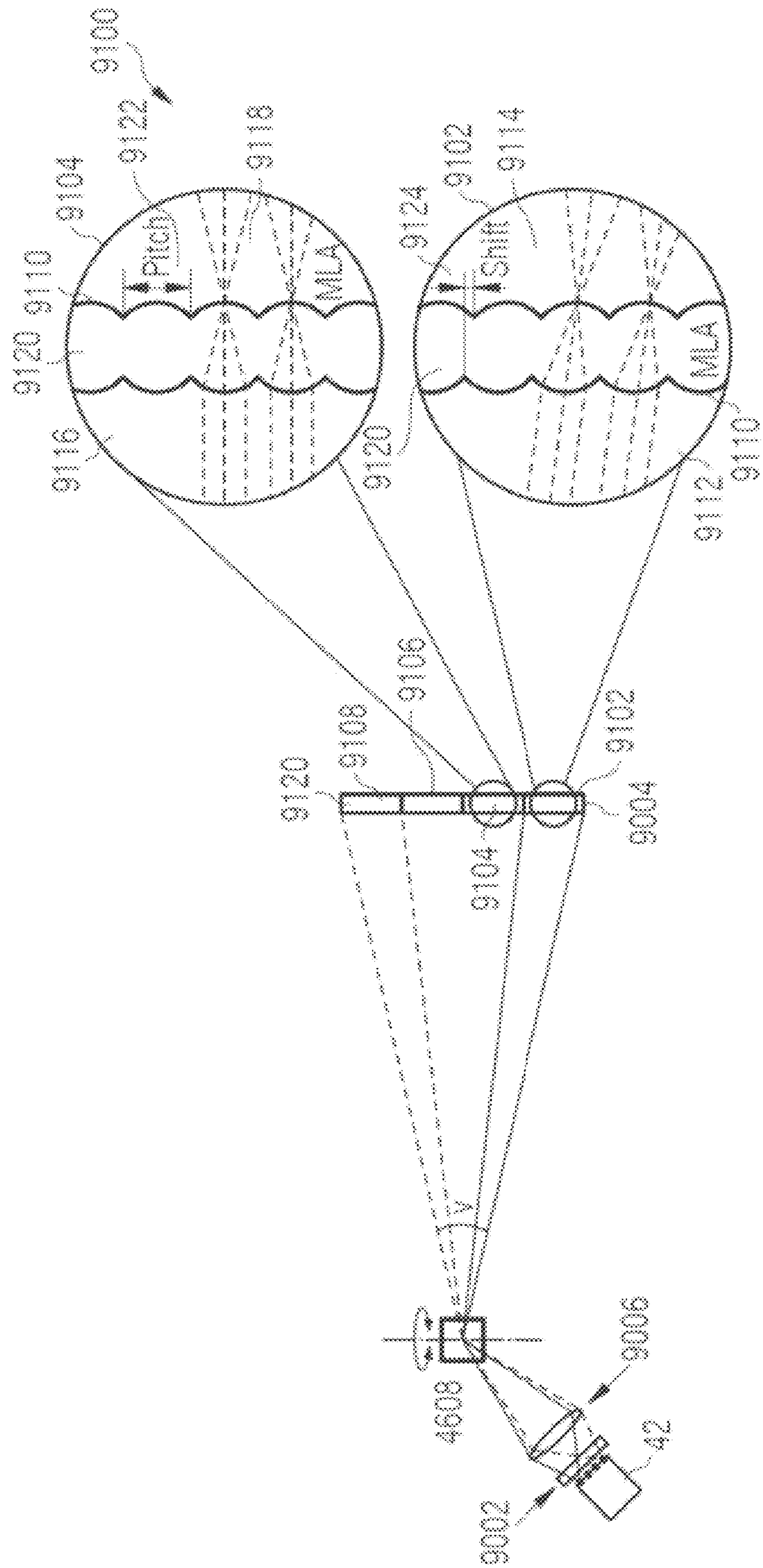

FIG. 91 shows a side view of the First LIDAR Sensing System in accordance with various embodiments.

Figure 92:
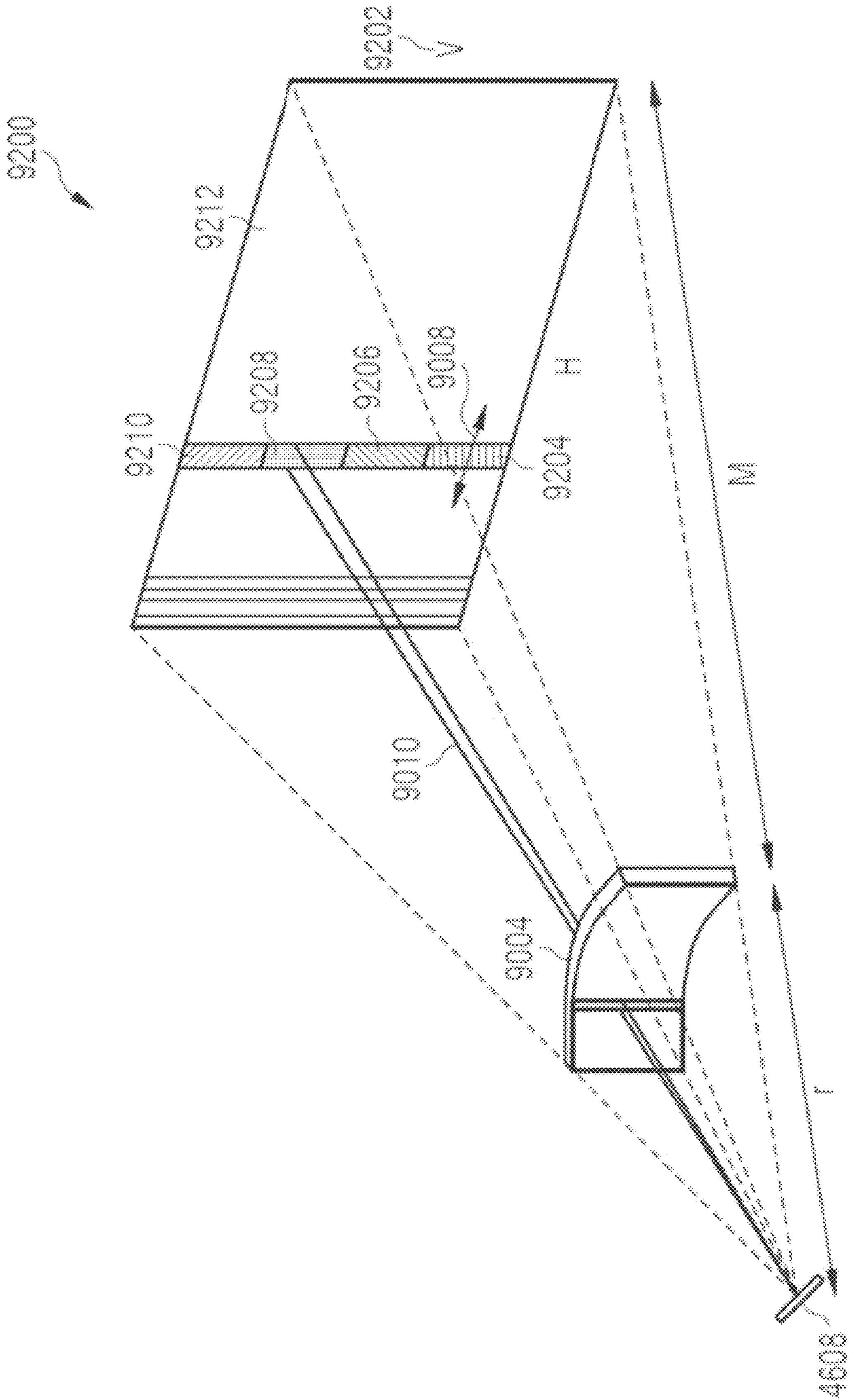

FIG. 92 shows a side view of a portion of the First LIDAR Sensing System in accordance with various embodiments.

FIGS. 93A to 93D show the angular intensity distribution for a double sided MLA with four zones is shown.

Figure 94:
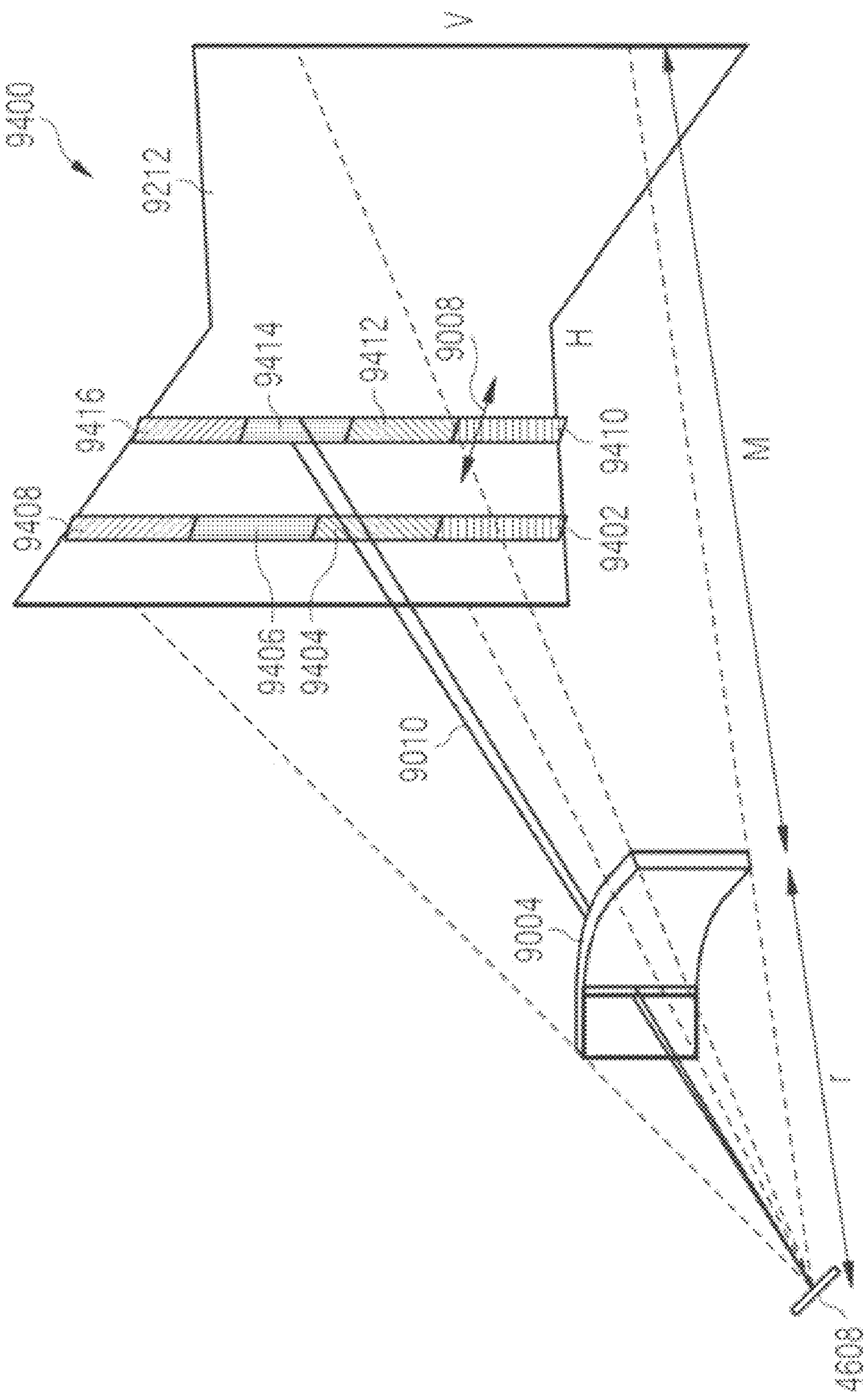

FIG. 94 shows a side view of a portion of the First LIDAR Sensing System in accordance with various embodiments.

Figure 93D:
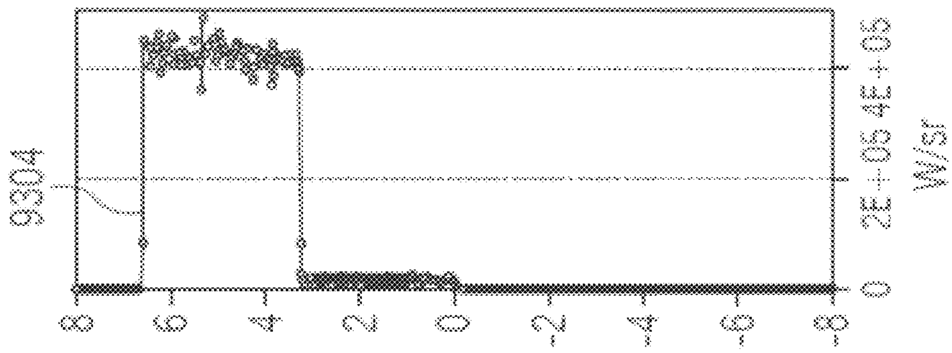
Figure 93C:
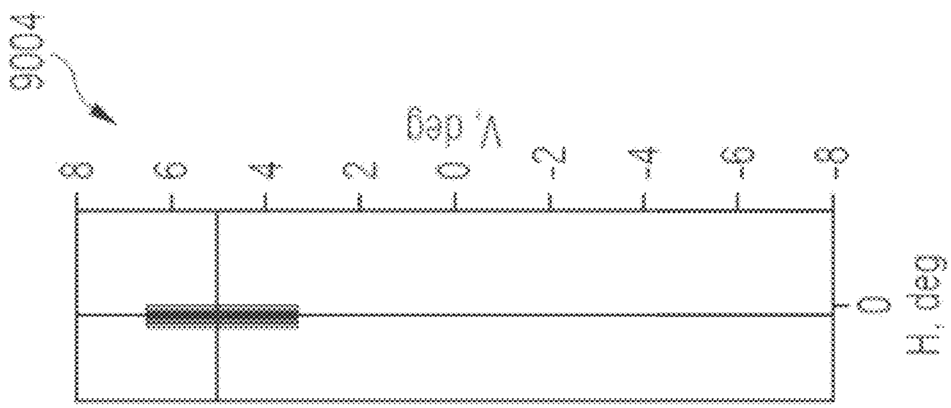
Figure 95C:
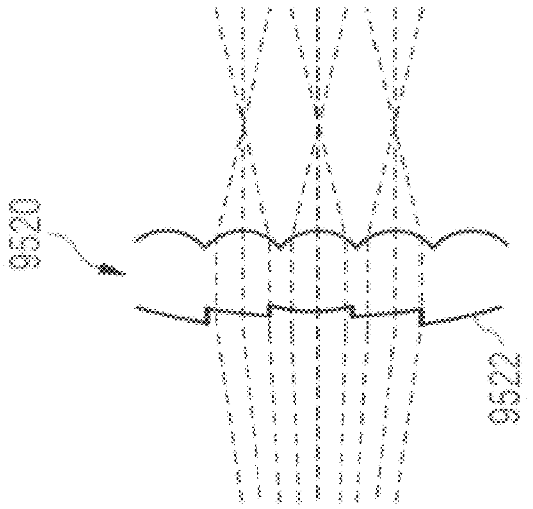
Figure 95B:
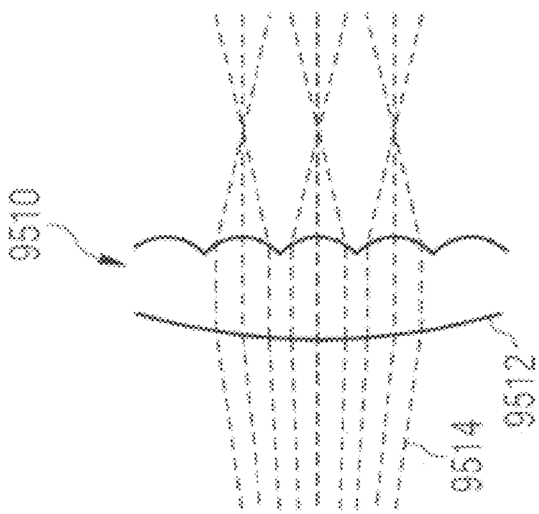
Figure 95A:
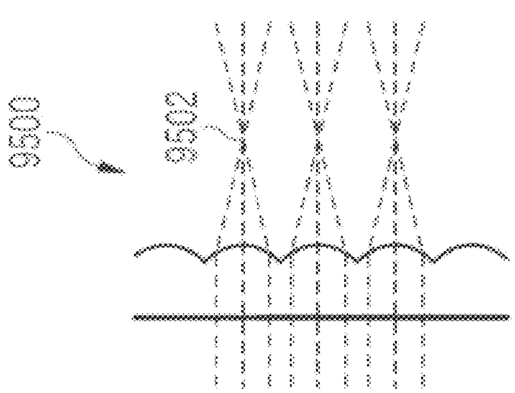

FIGS. 95A to 93C show various examples of a single-sided MLA in accordance with various embodiments.

Figure 96B:
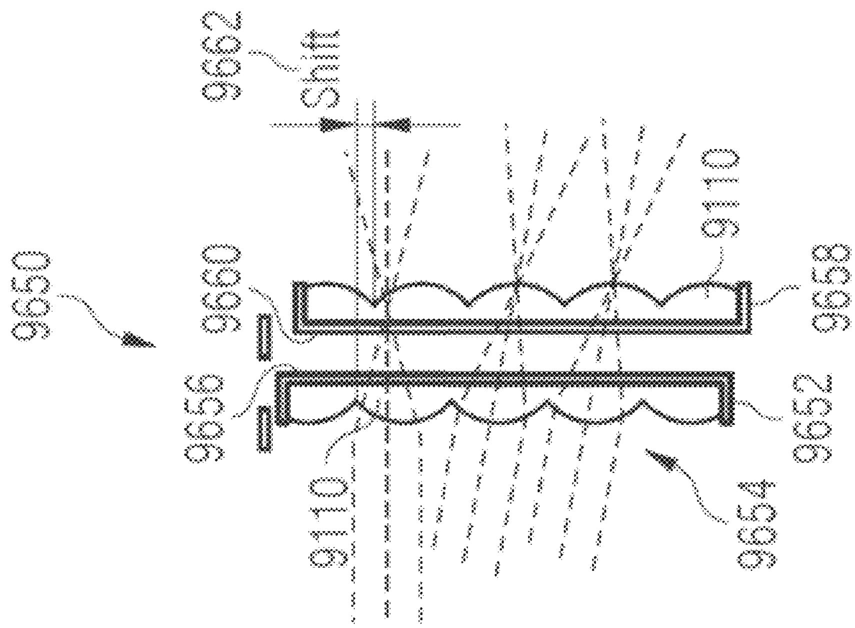
Figure 96A:
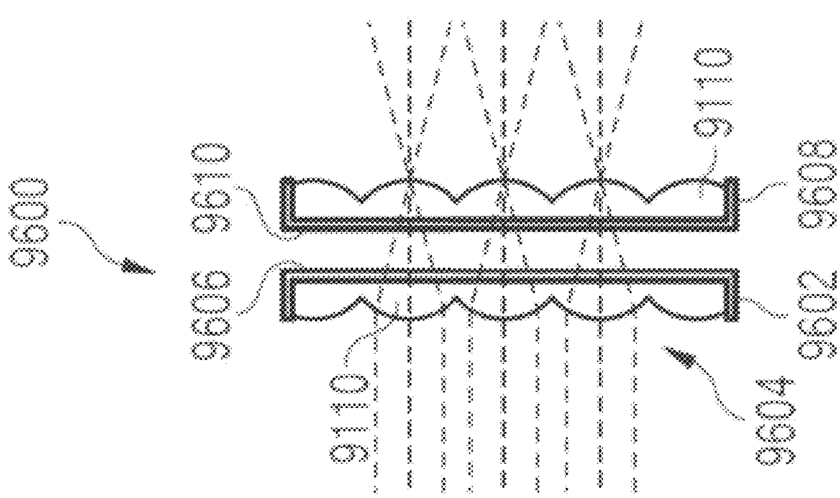

FIGS. 96A and 96B show various examples of a combination of respective single-sided MLA to form a two piece double-sided MLA in accordance with various embodiments.

Figure 97:
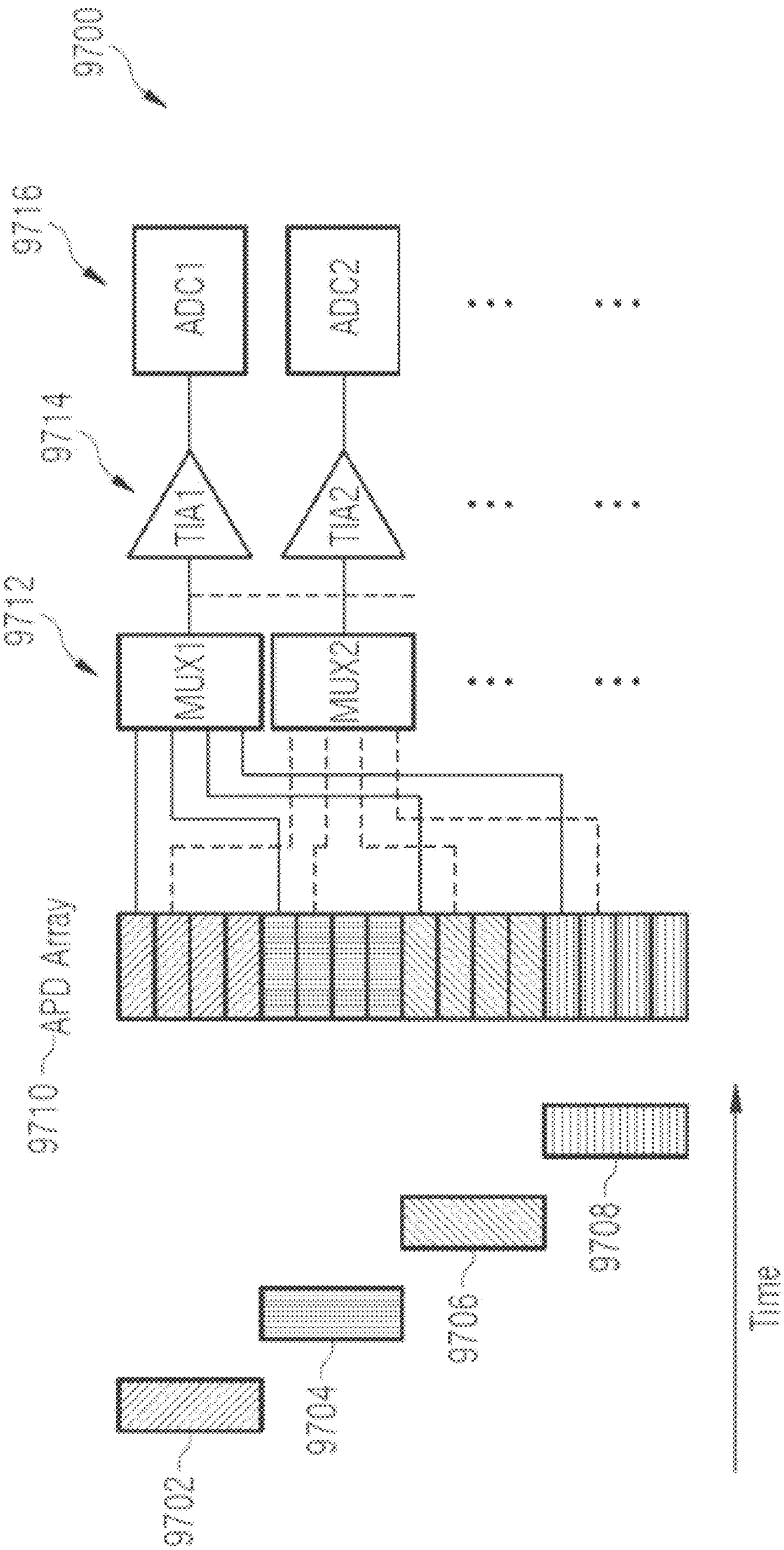

FIG. 97 shows a portion of the Second LIDAR Sensing System in accordance with various embodiments.

Figure 98:
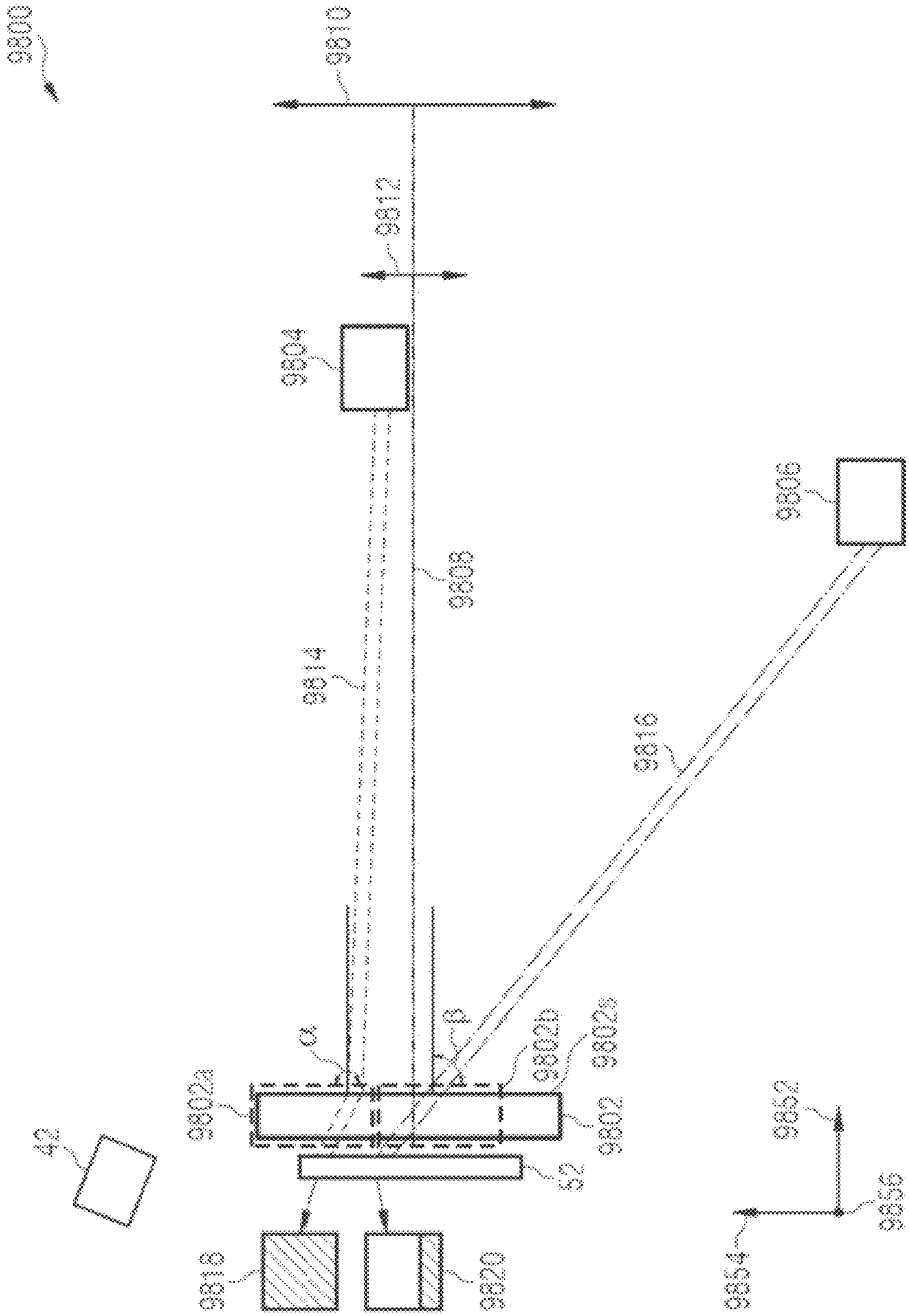

FIG. 98 shows a top view of a system including an optics arrangement in a schematic view in accordance with various embodiments.

Figure 99:
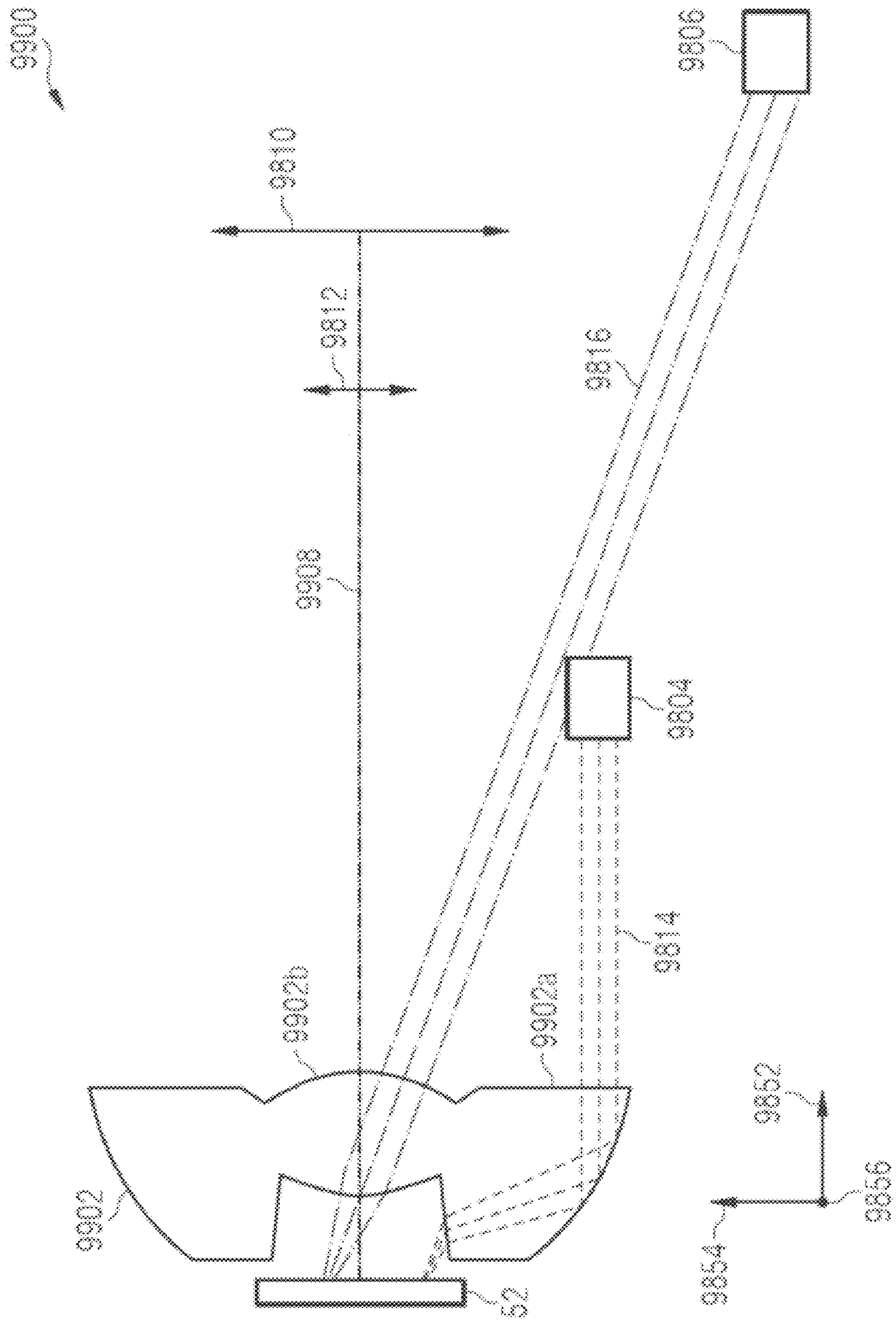

FIG. 99 shows a top view of a system including an optics arrangement in a schematic view in accordance with various embodiments.

Figure 100A:
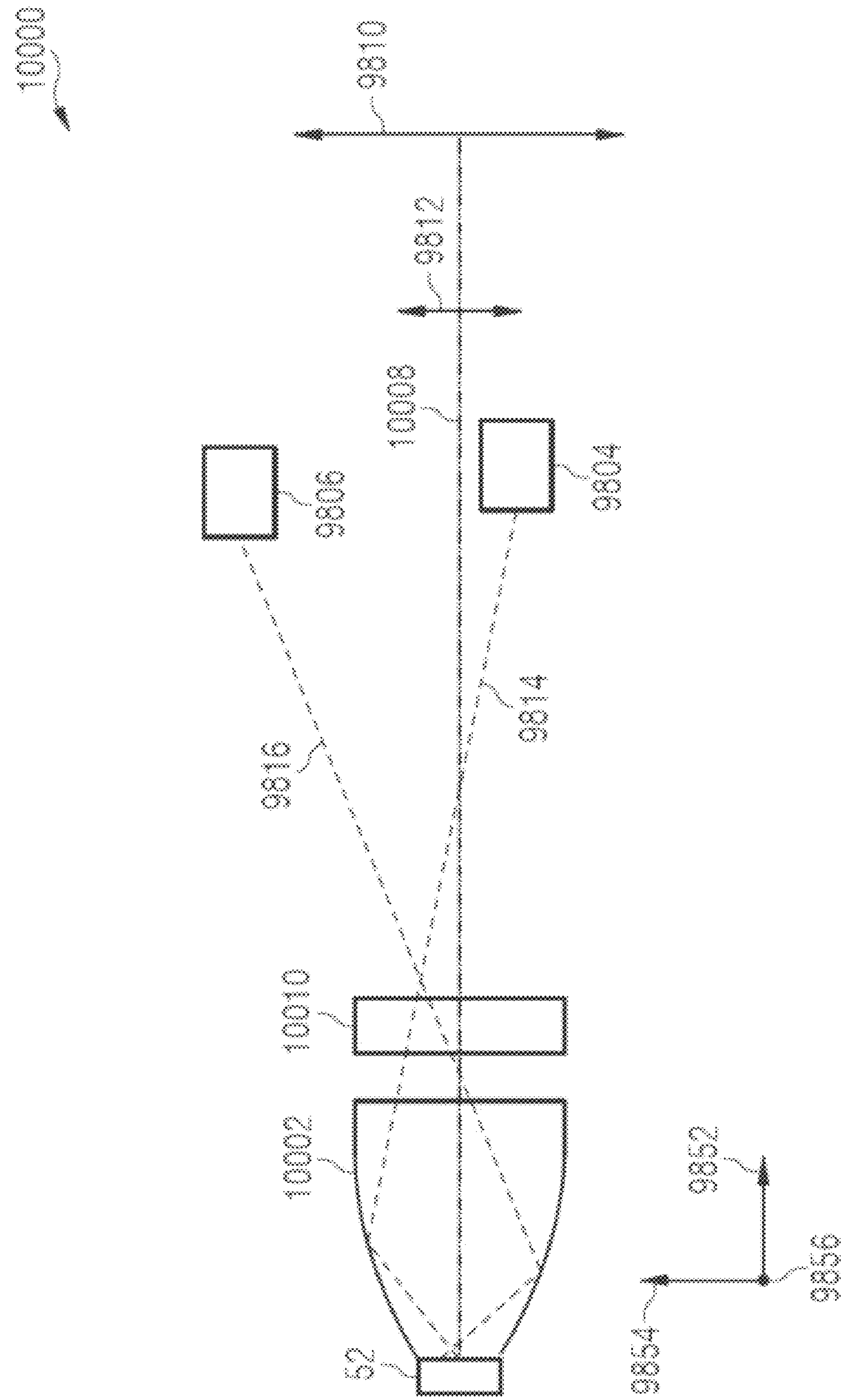

FIG. 100A shows a top view of a system including an optics arrangement in a schematic view in accordance with various embodiments.

Figure 100B:
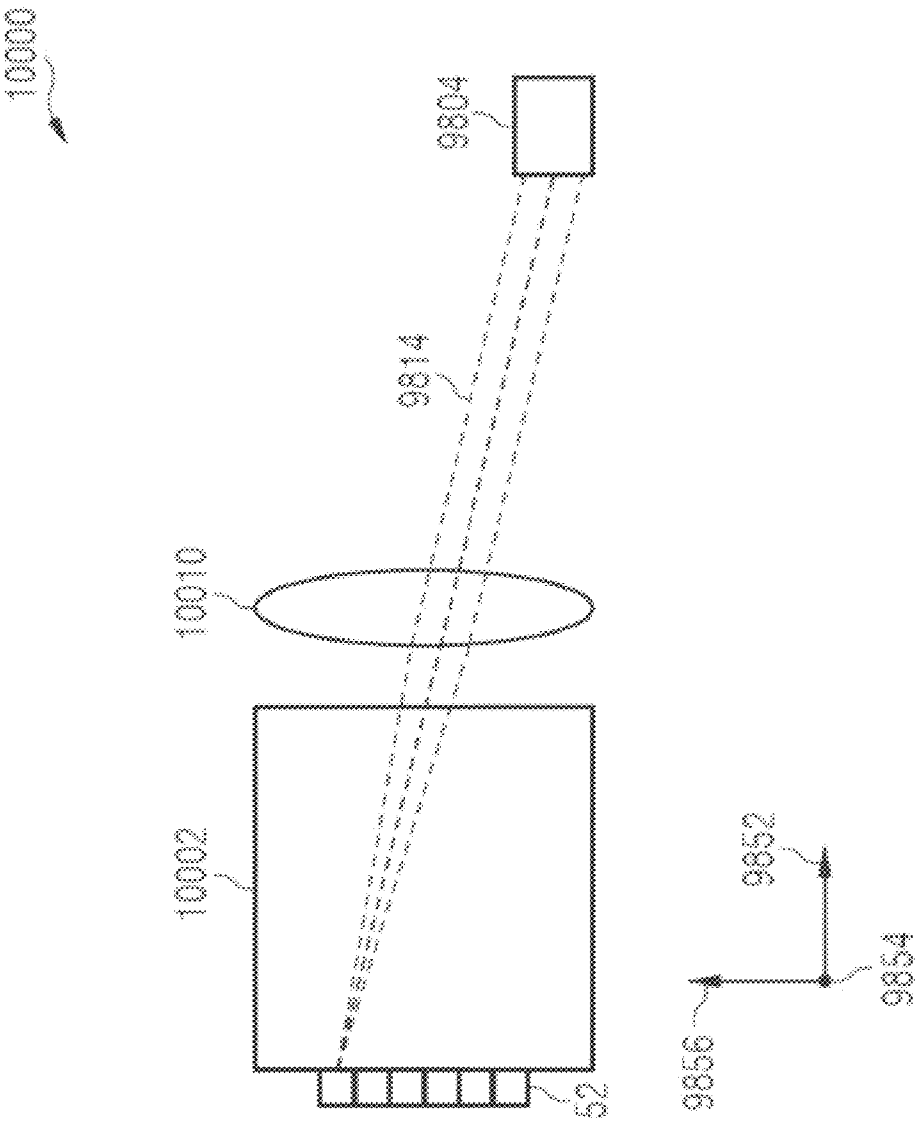

FIG. 100B shows a side view of a system including an optics arrangement in a schematic view in accordance with various embodiments.

Figure 101A:
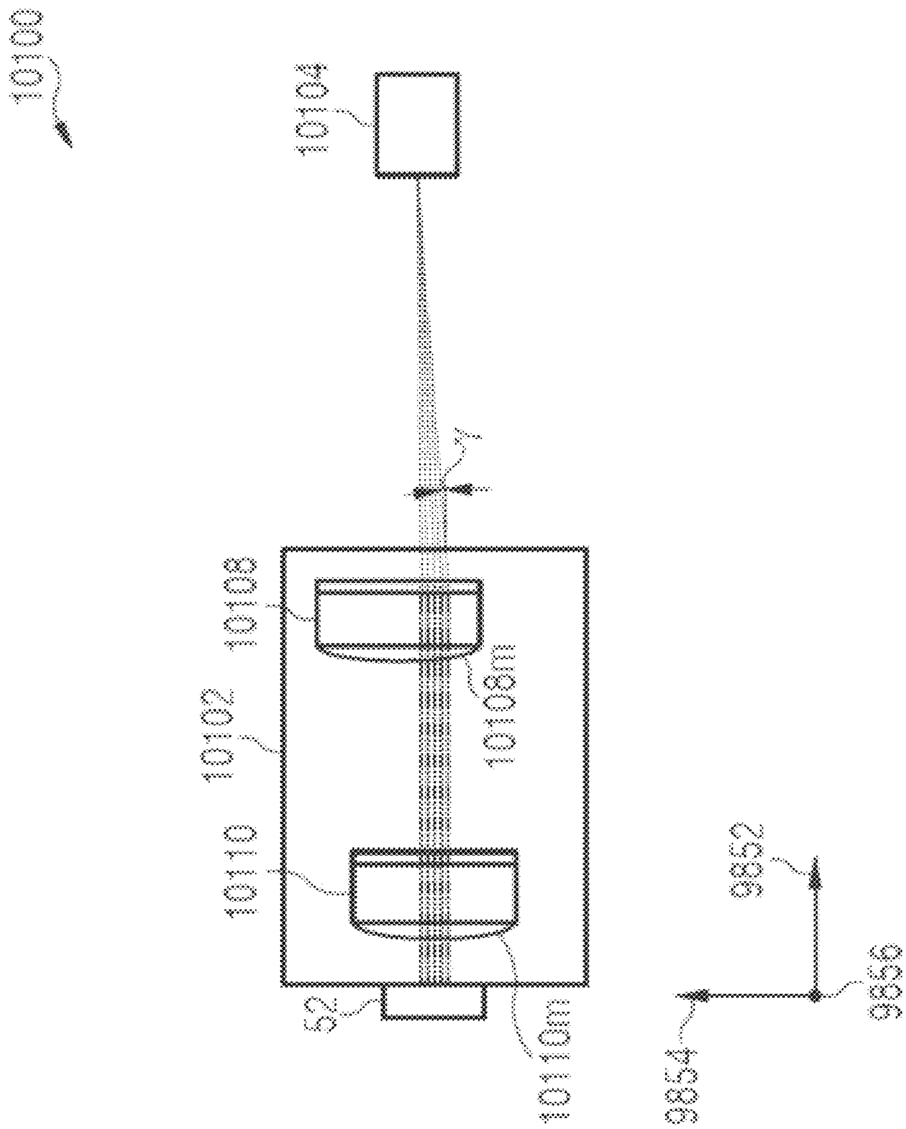
Figure 101B:
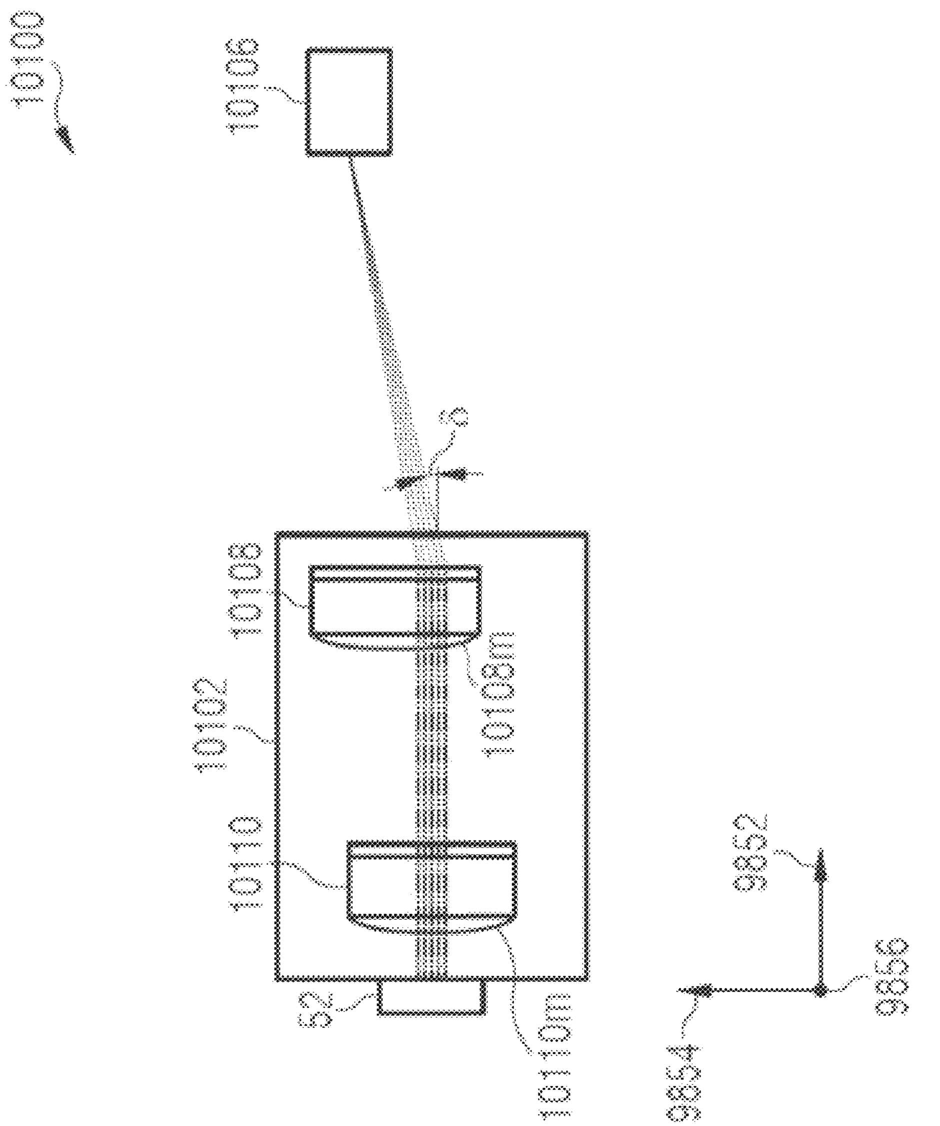

FIG. 101A and FIG. 101B show a top view of a system including an optics arrangement in a schematic view in accordance with various embodiments.

Figure 102A:
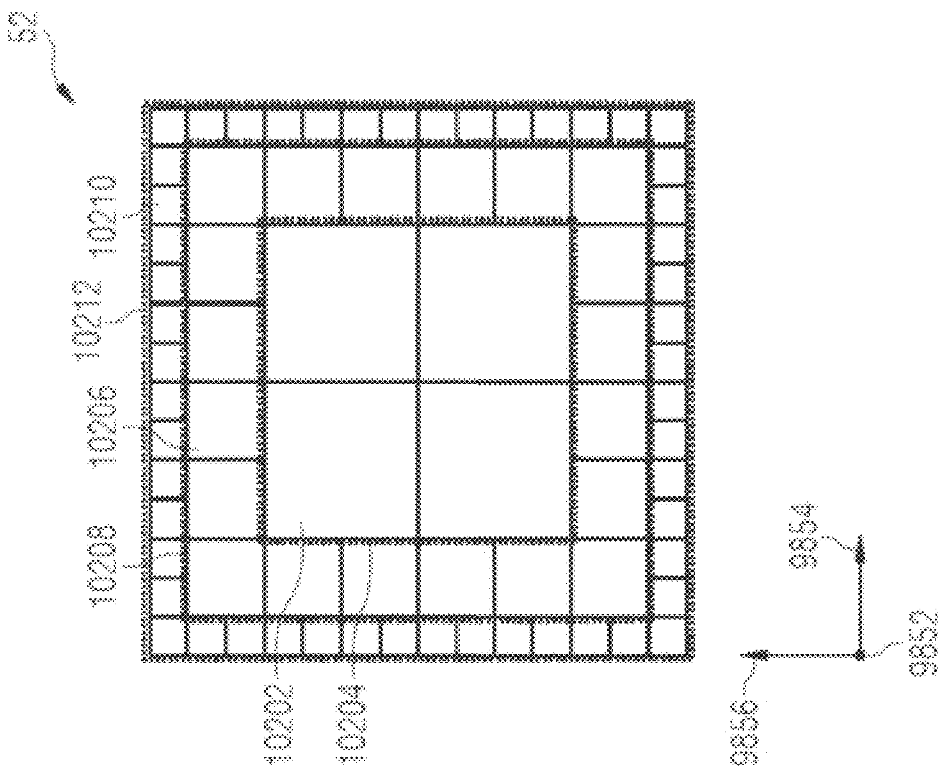

FIG. 102A shows a sensor in a schematic view in accordance with various embodiments.

Figure 102B:
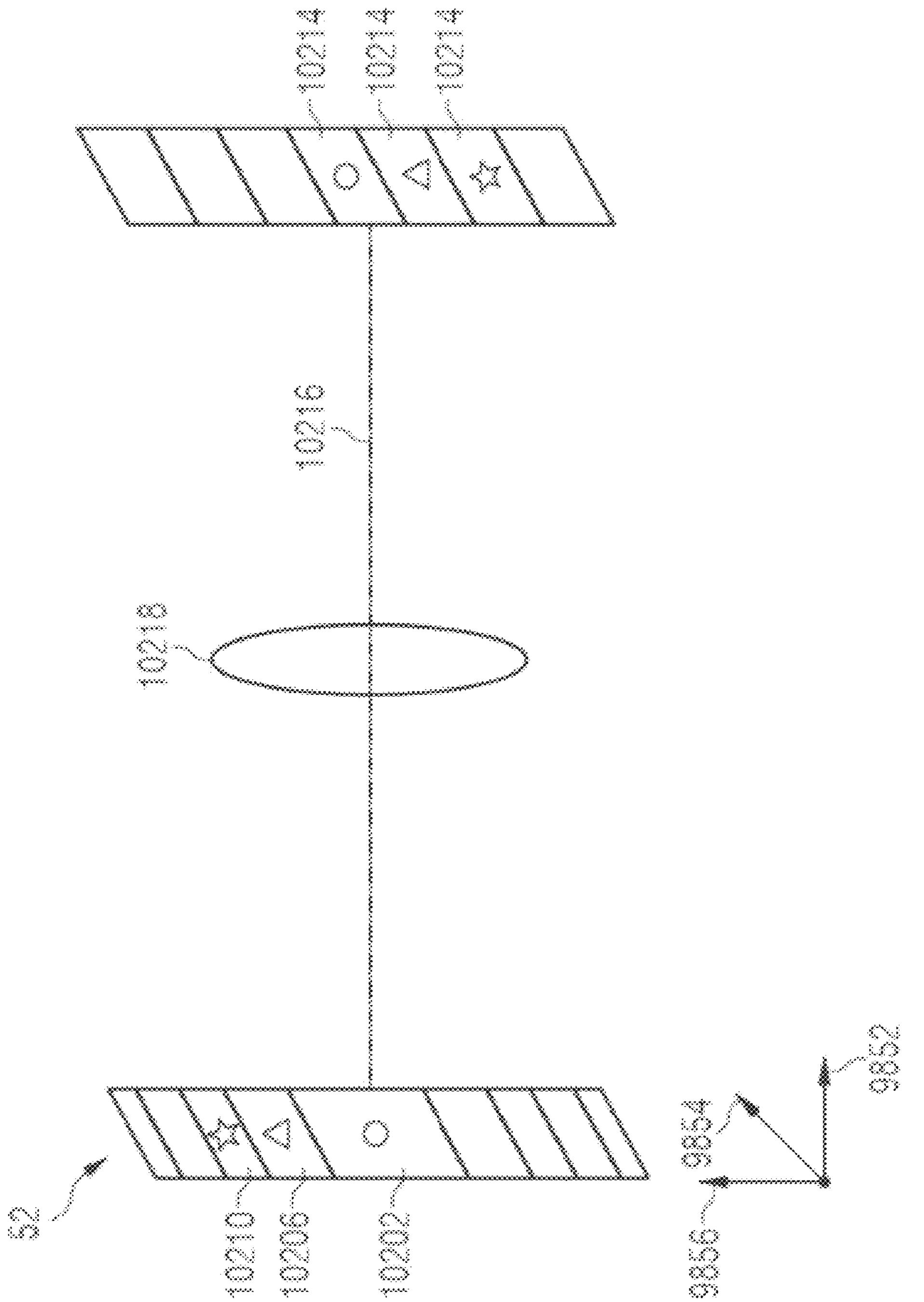

FIG. 102B shows a schematic representation of an imaging process in accordance with various embodiments.

Figure 103:
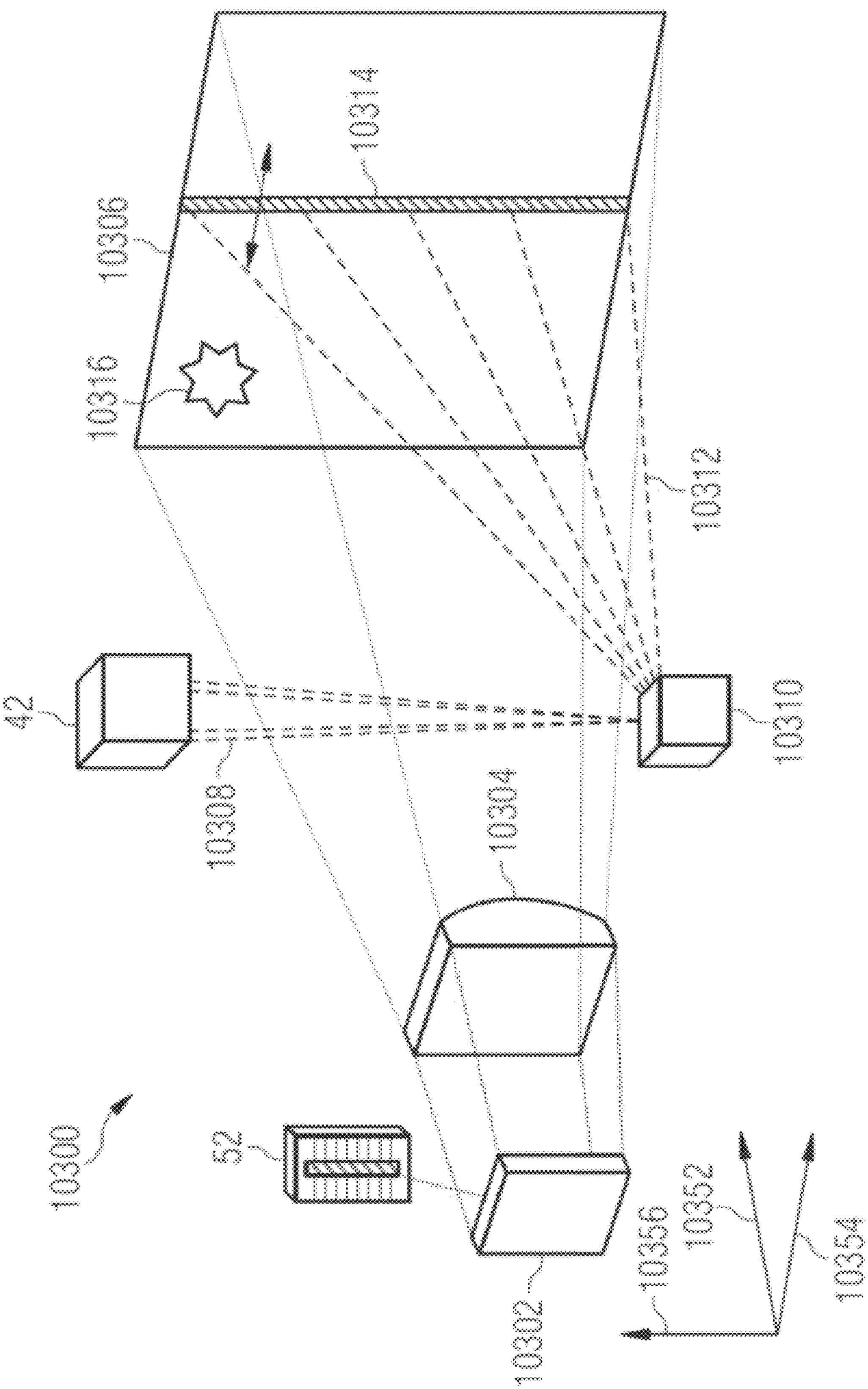

FIG. 103 shows a system including an optical device in a schematic view in accordance with various embodiments.

Figure 104A:
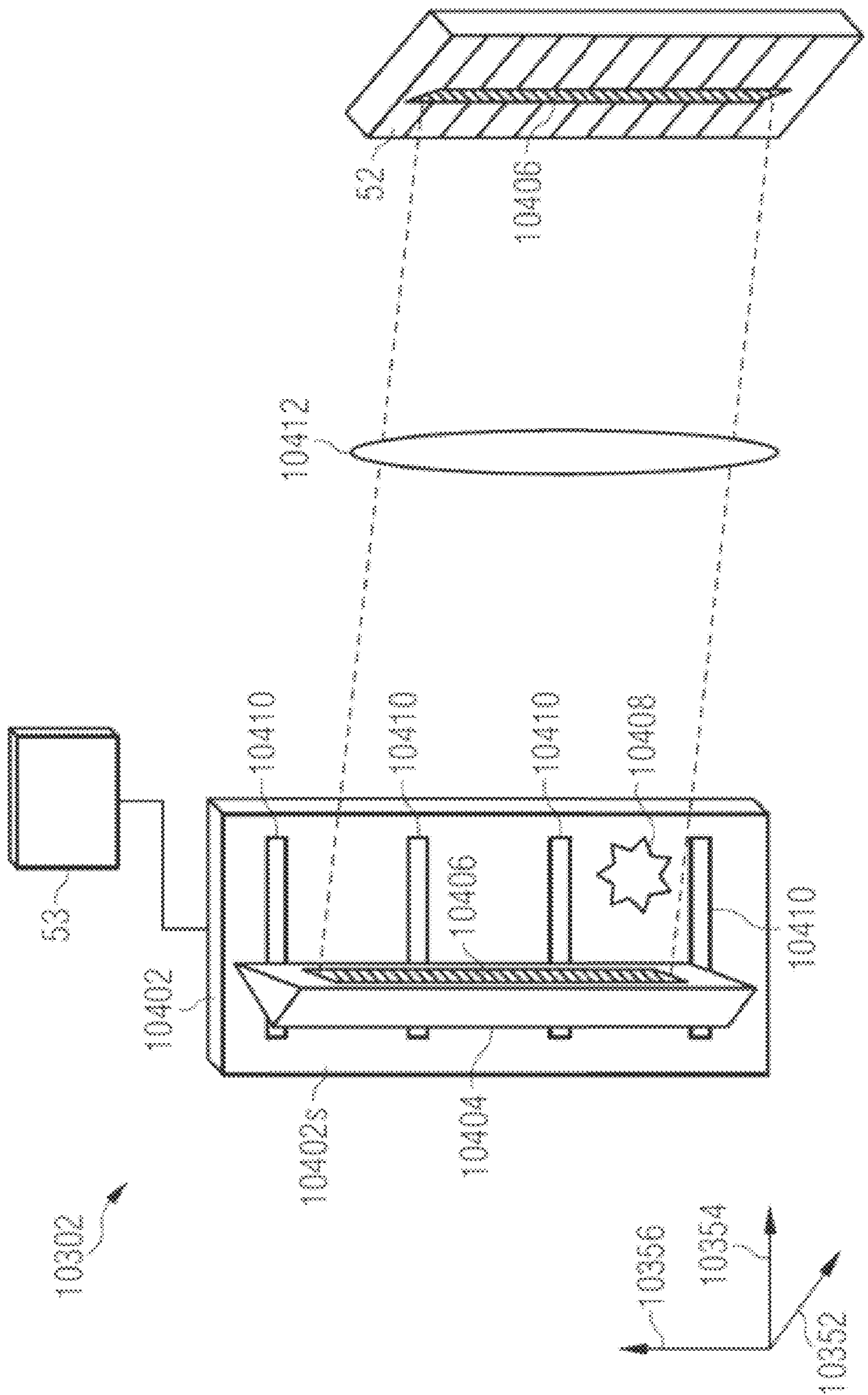
Figure 104B:
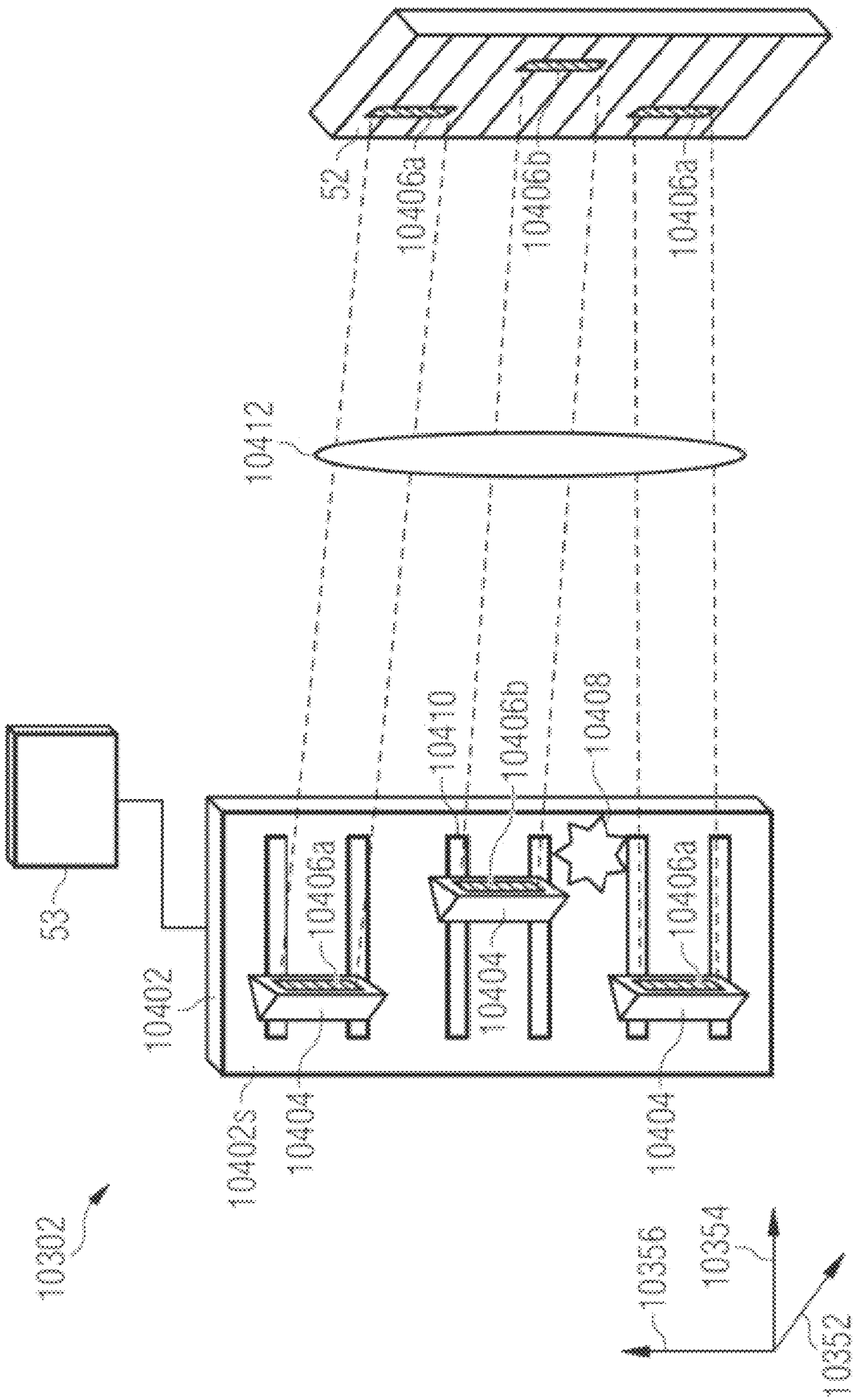

FIG. 104A and FIG. 104B show each an optical device in a schematic view in accordance with various embodiments.

Figure 105A:
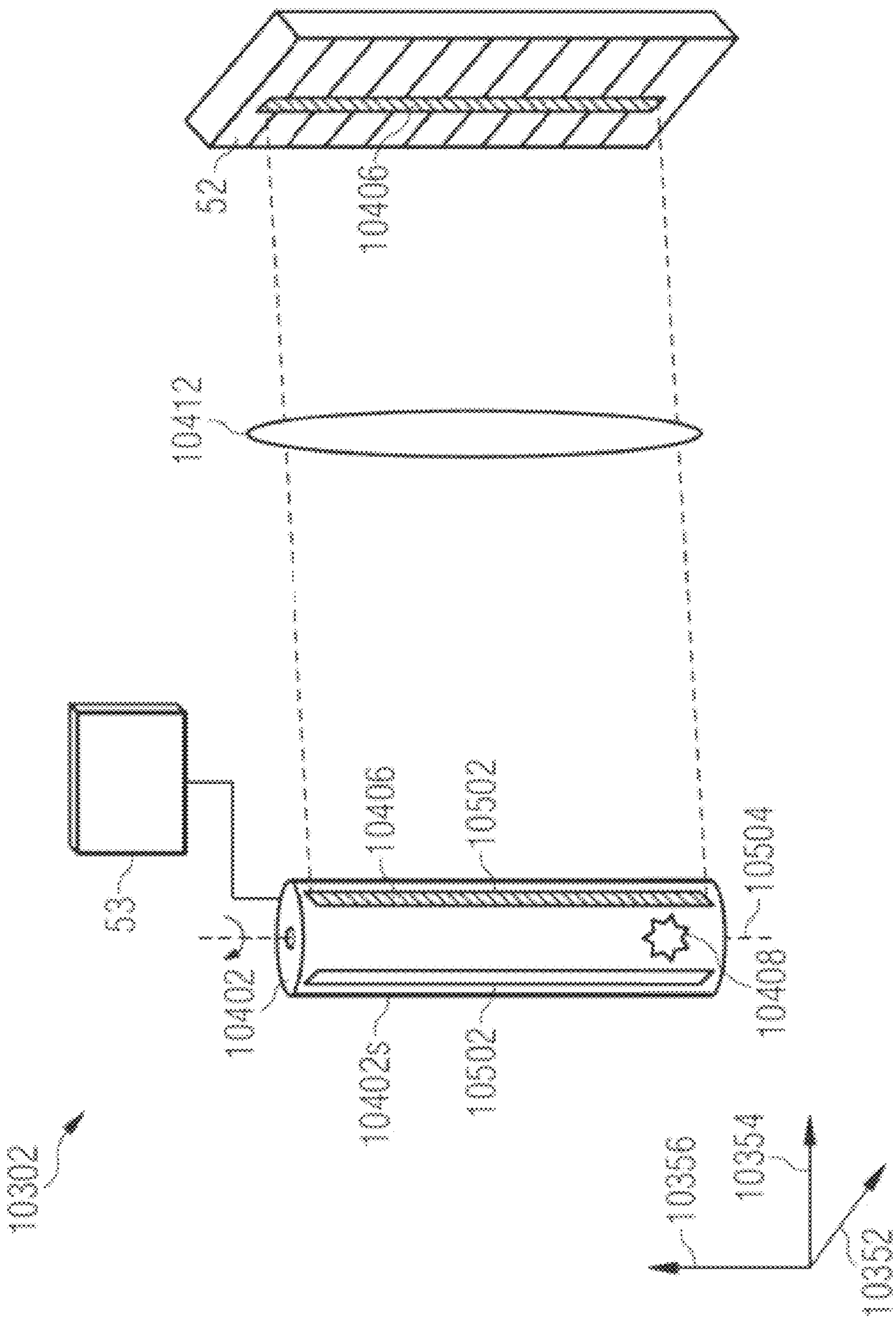

FIG. 105A shows an optical device in a schematic view in accordance with various embodiments.

Figure 105B:
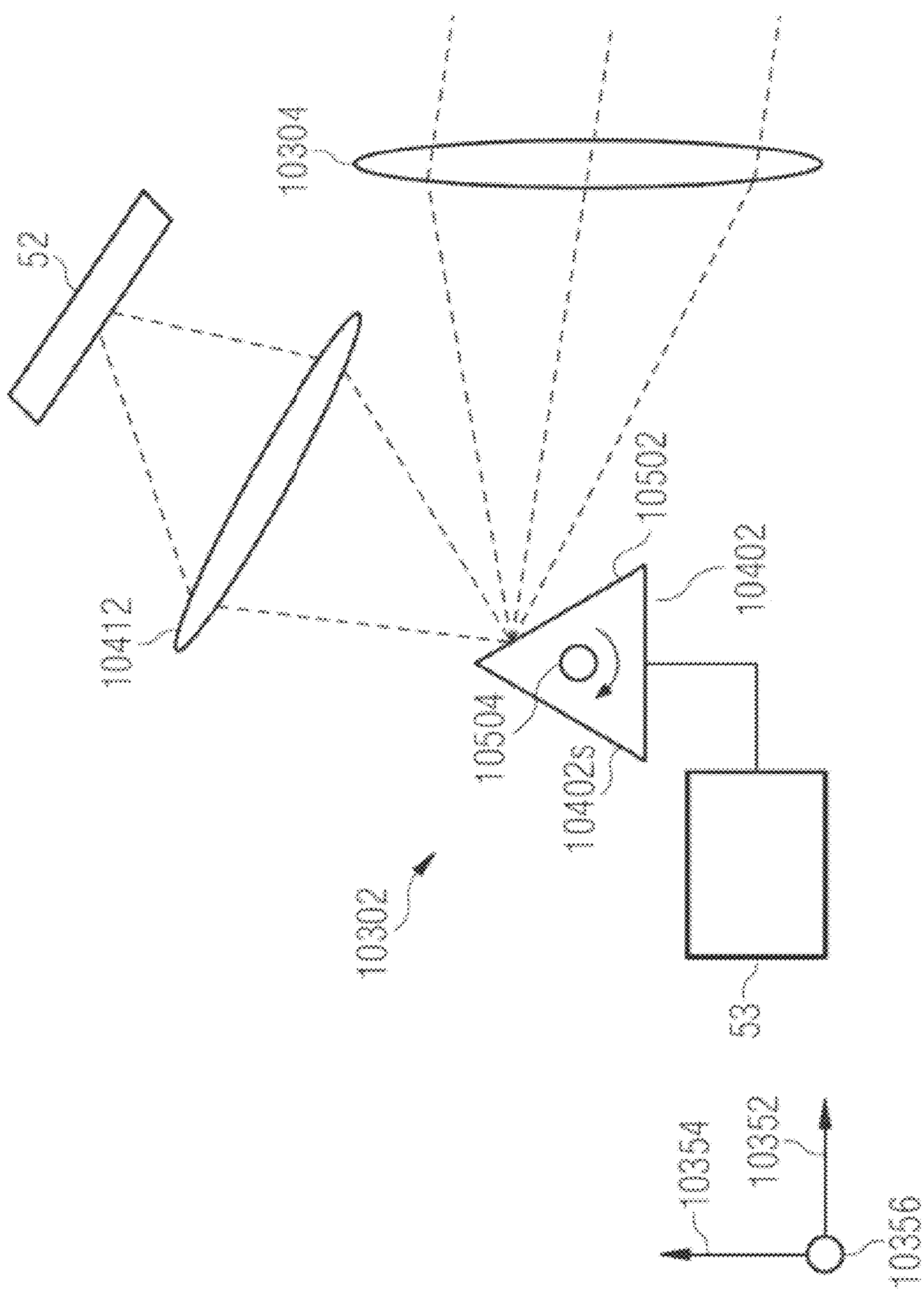
Figure 105C:
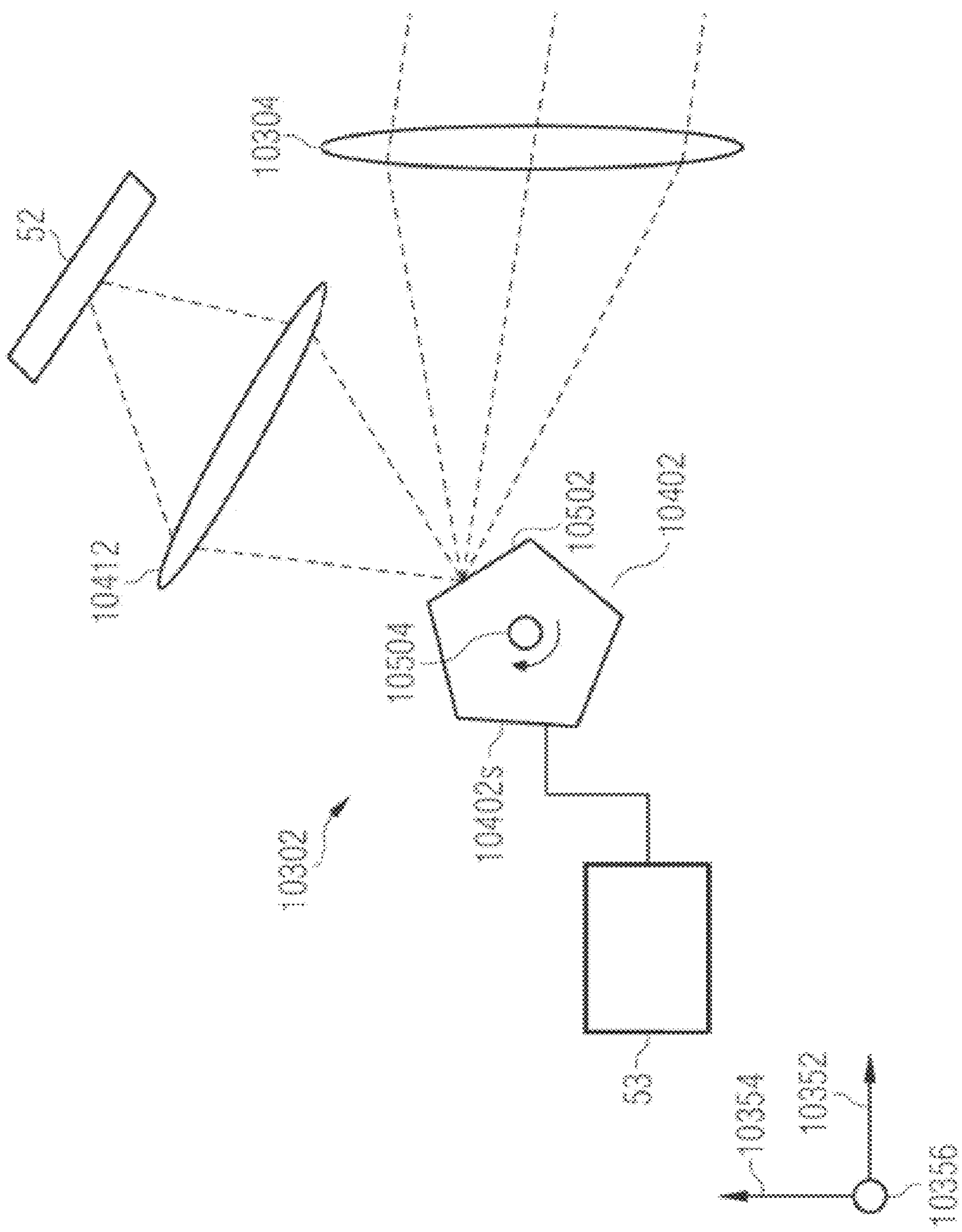
Figure 105D:
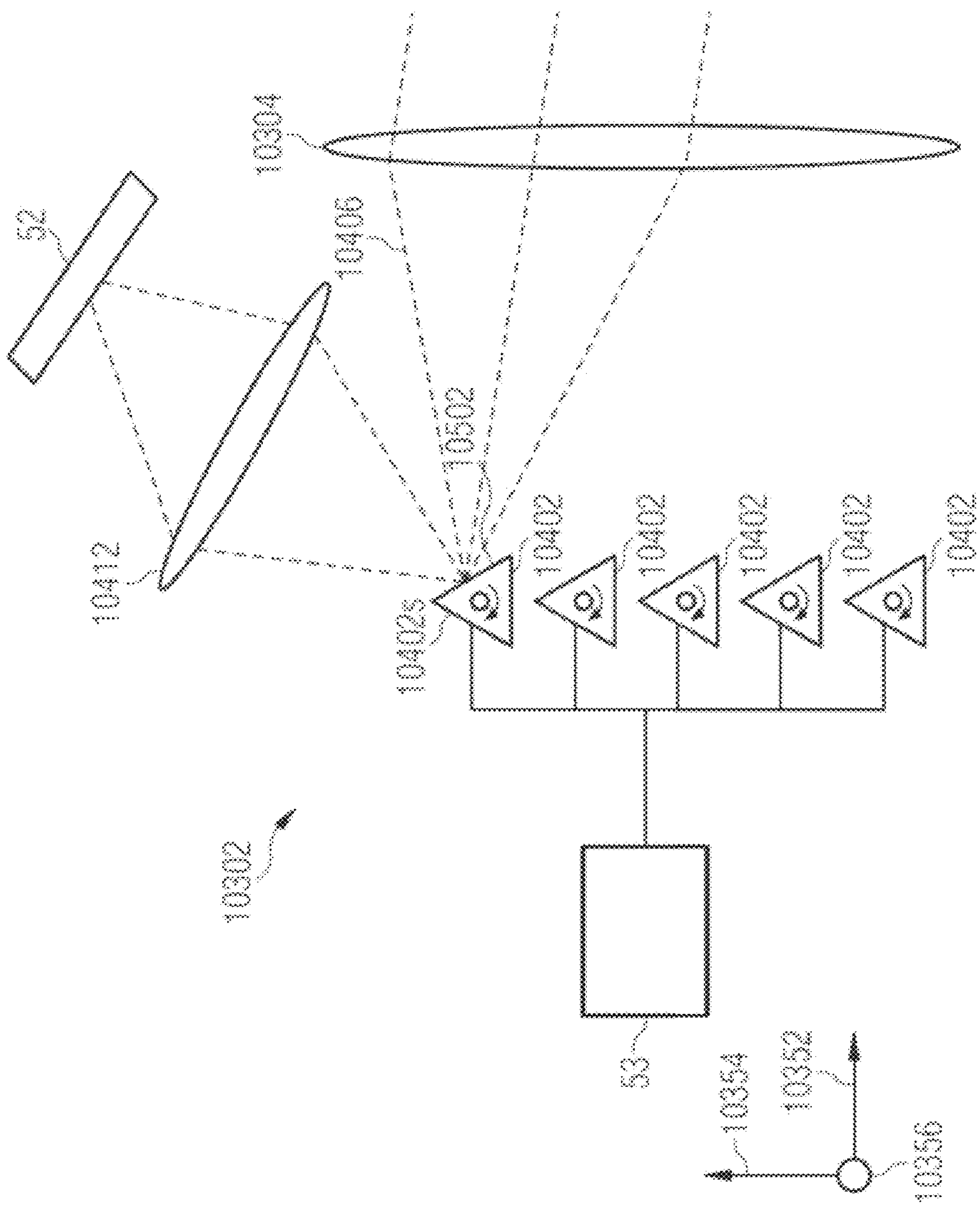

FIG. 105B, FIG. 105C, and FIG. 105D show each a part of a system including an optical device in a schematic view in accordance with various embodiments.

Figure 105F:
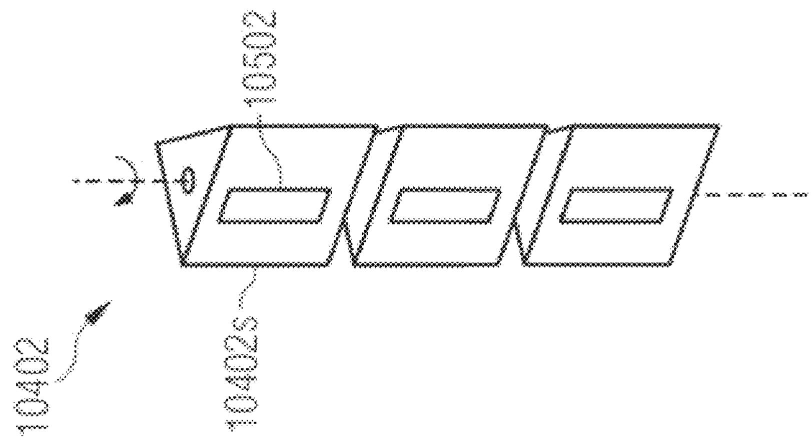
Figure 105E:
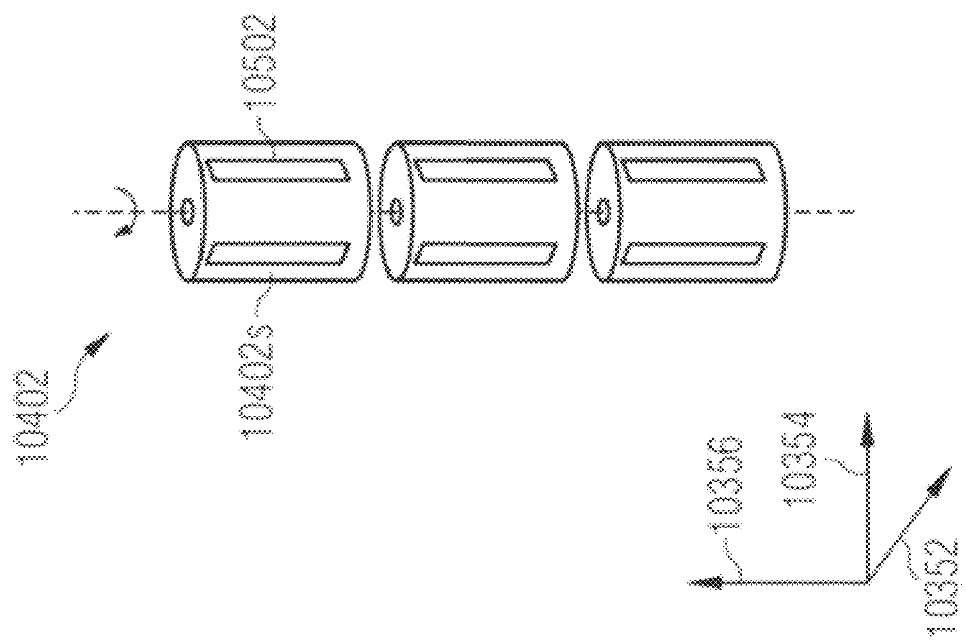

FIG. 105E and FIG. 105F show each a part of an optical device in a schematic view in accordance with various embodiments.

Figure 106B:
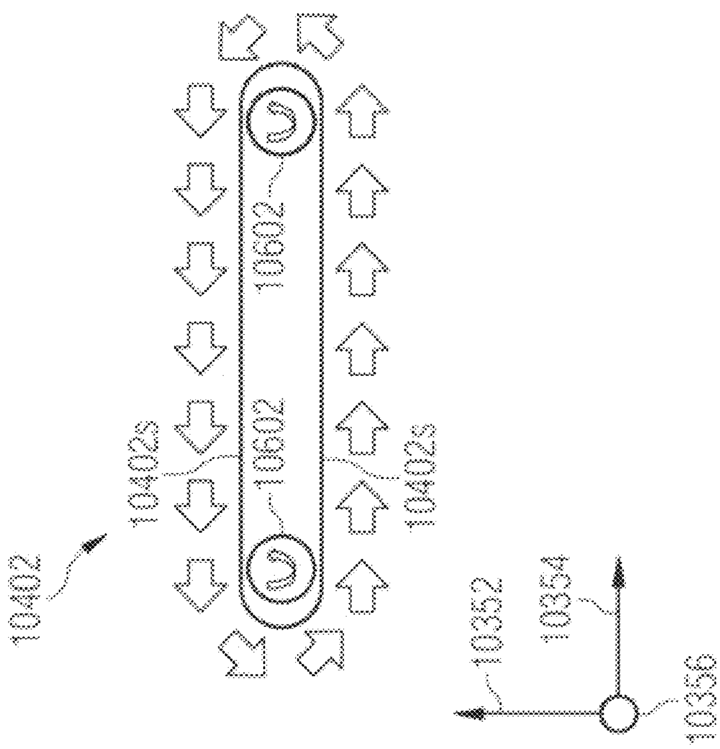
Figure 106A:
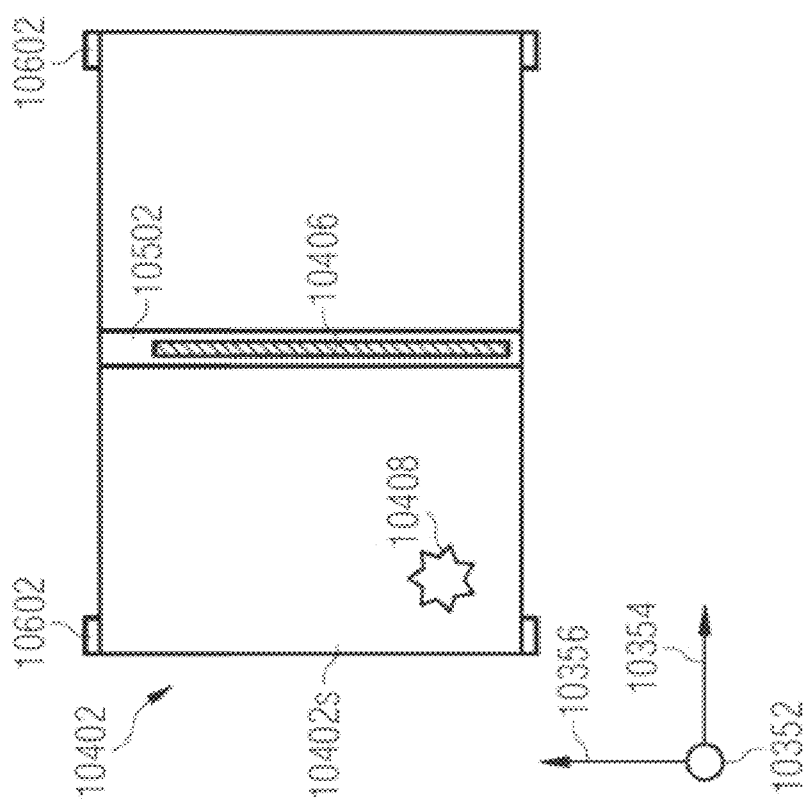

FIG. 106A and FIG. 1066 show each a part of an optical device in a schematic view in accordance with various embodiments.

Figure 107:
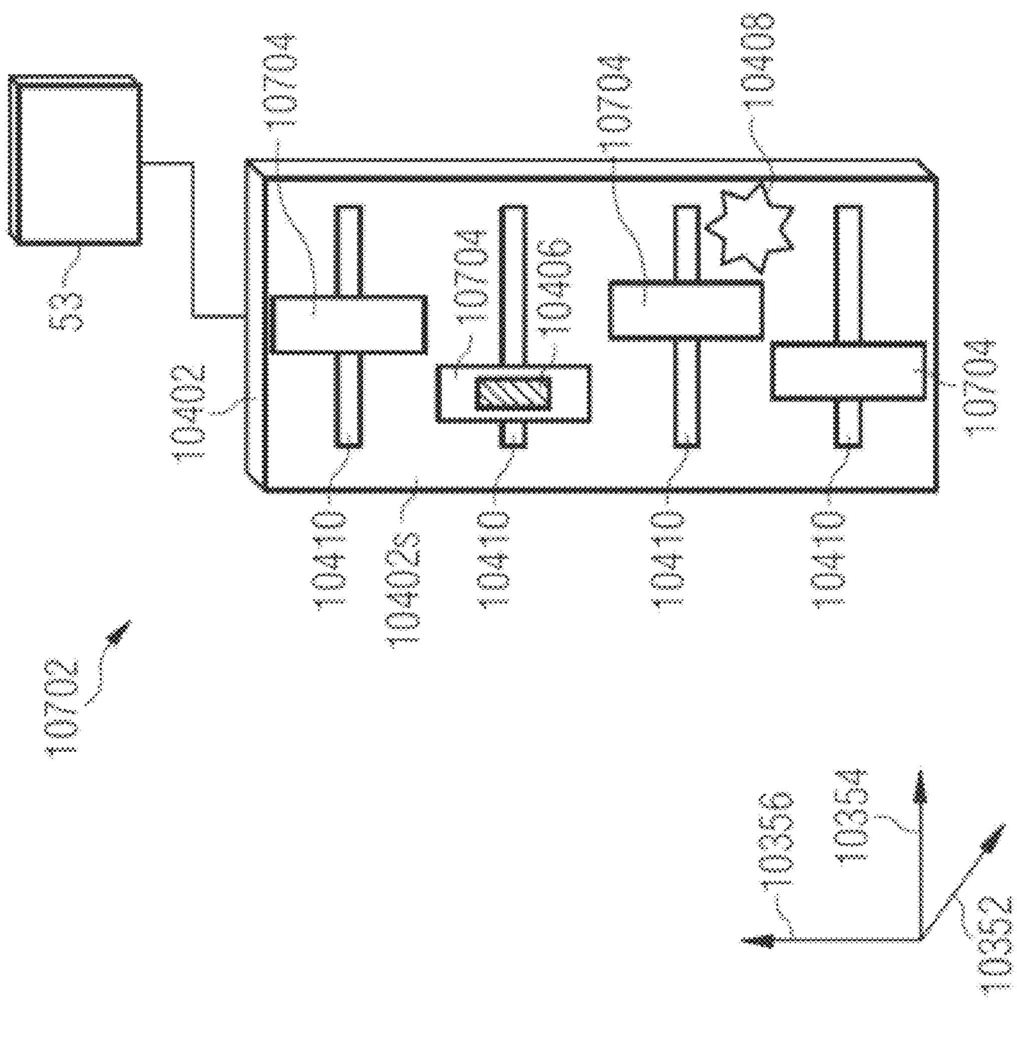

FIG. 107 shows a sensor device in a schematic view in accordance with various embodiments.

Figure 108:
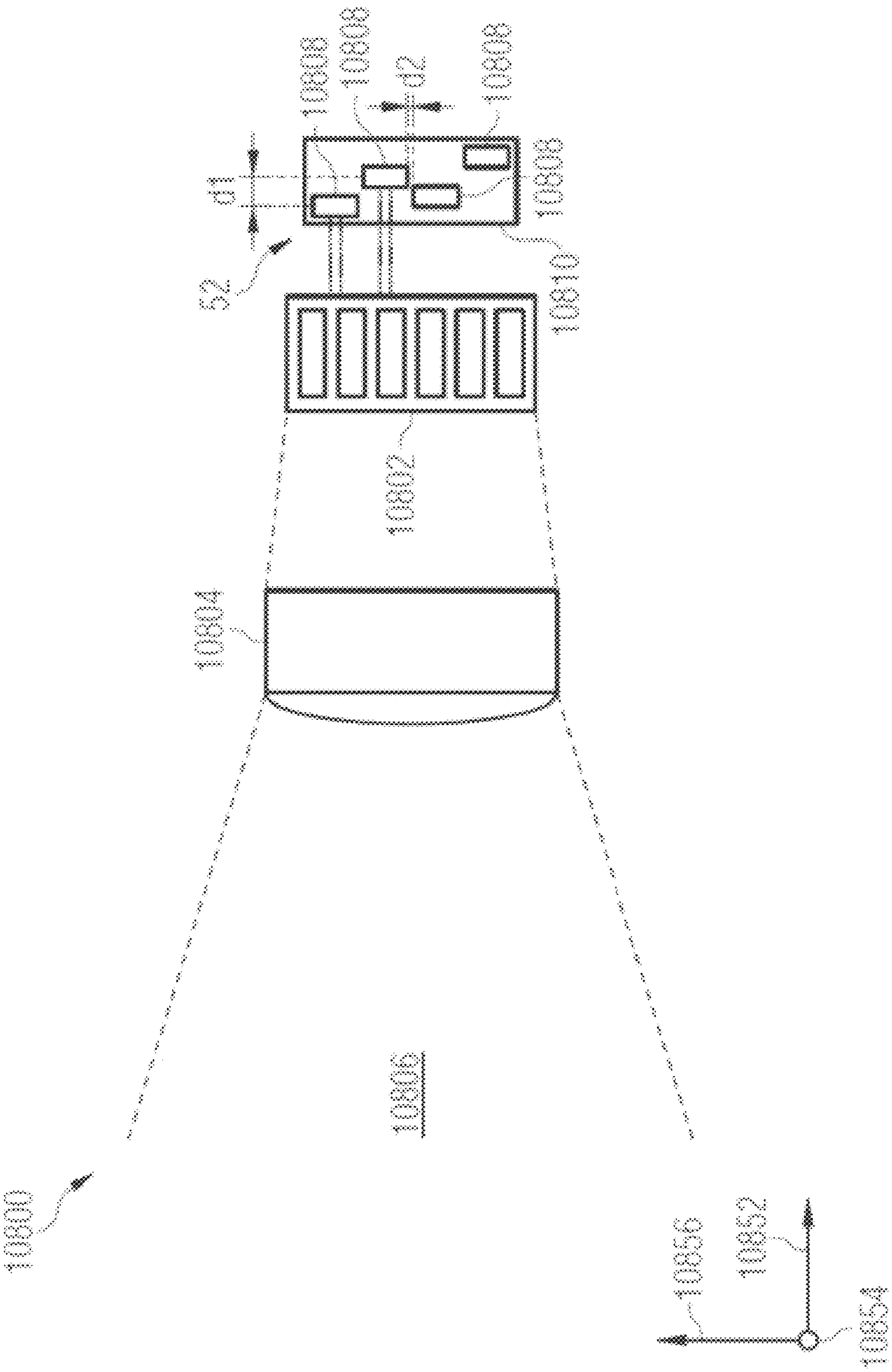

FIG. 108 shows a portion of a LIDAR system in a schematic view, in accordance with various embodiments.

Figure 109:
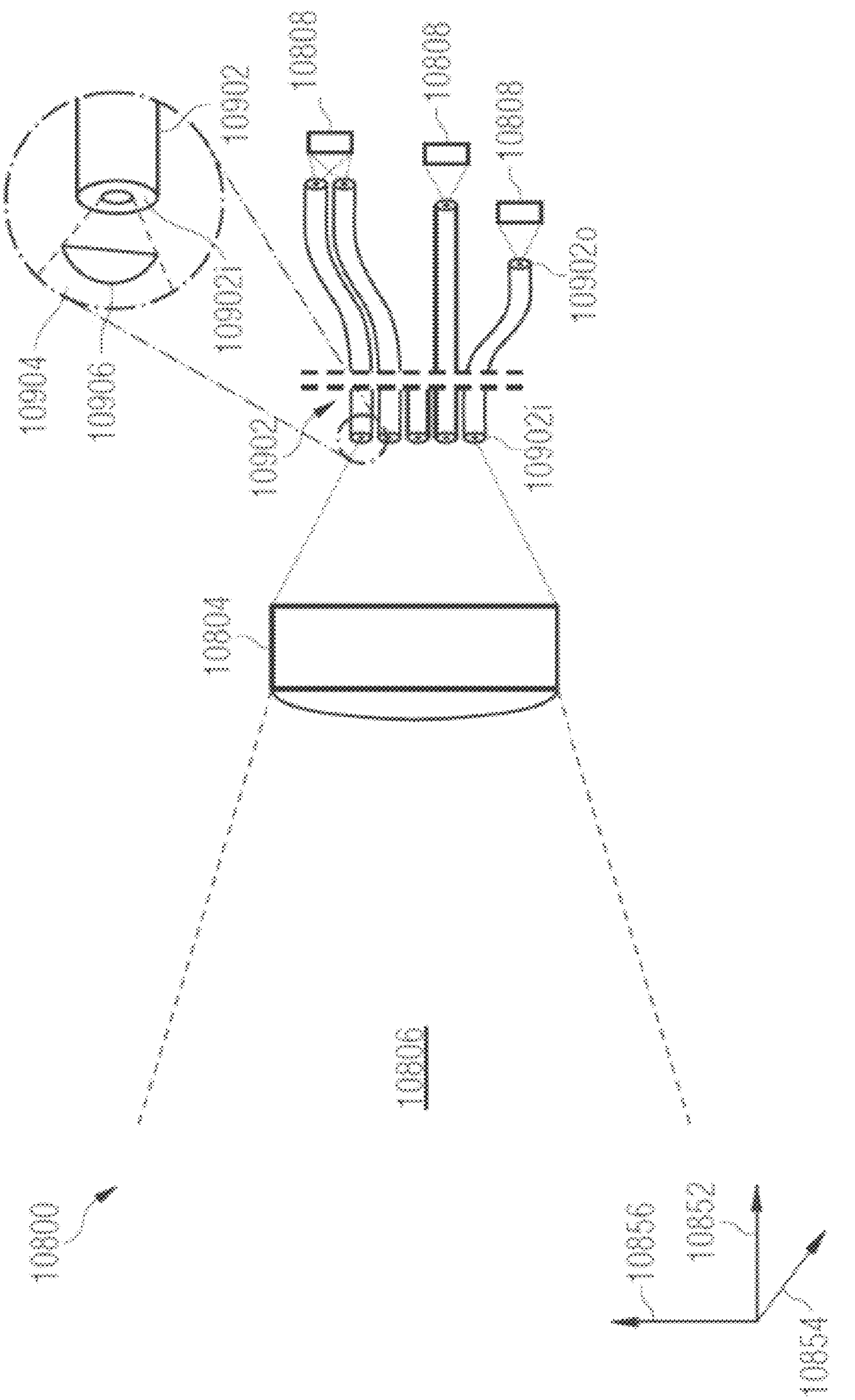

FIG. 109 shows a portion of a LIDAR system in a schematic view, in accordance with various embodiments.

Figure 110:
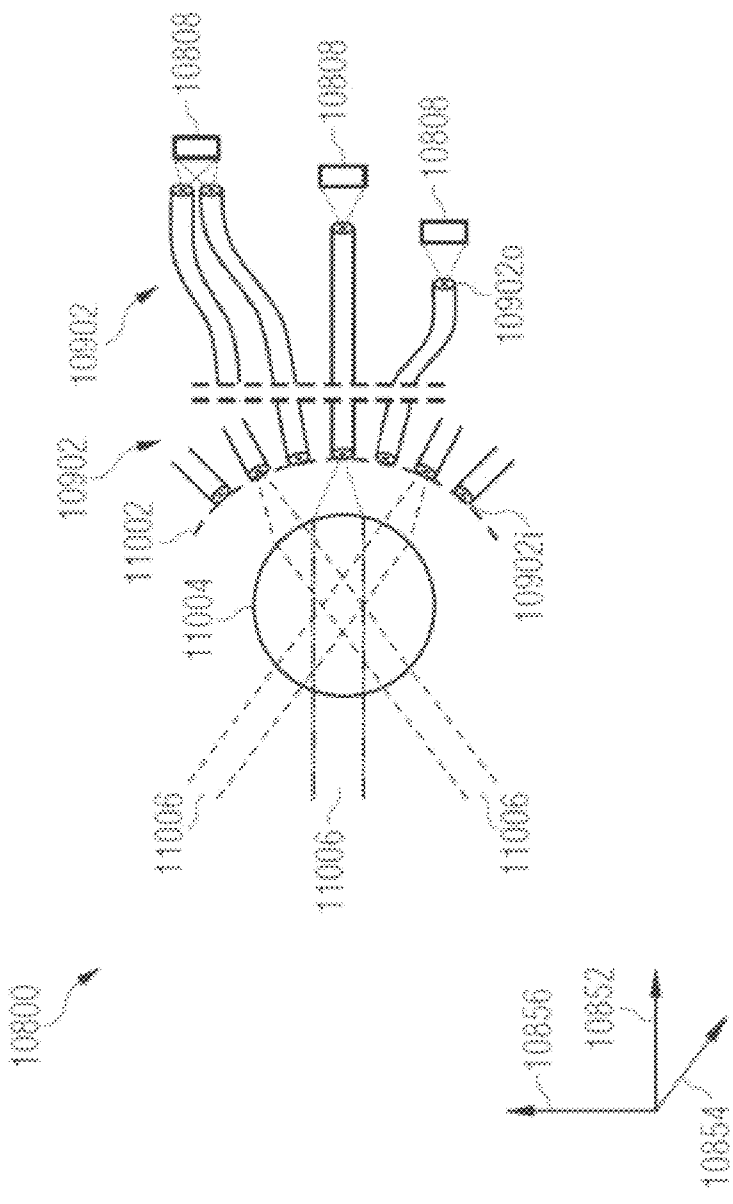

FIG. 110 shows a portion of a LIDAR system in a schematic view, in accordance with various embodiments.

Figure 111:
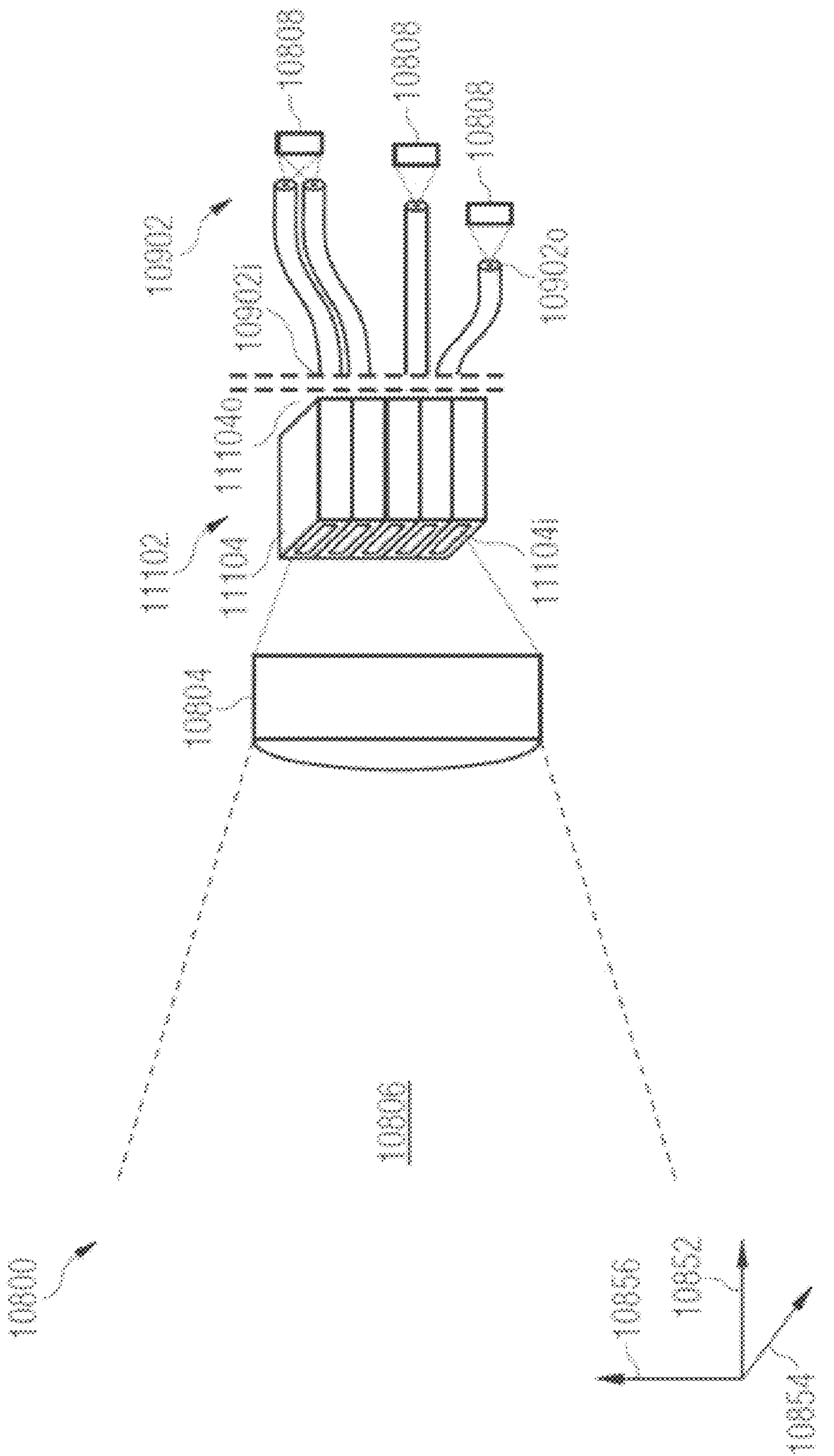

FIG. 111 shows a portion of a LIDAR system in a schematic view, in accordance with various embodiments.

Figure 112A:
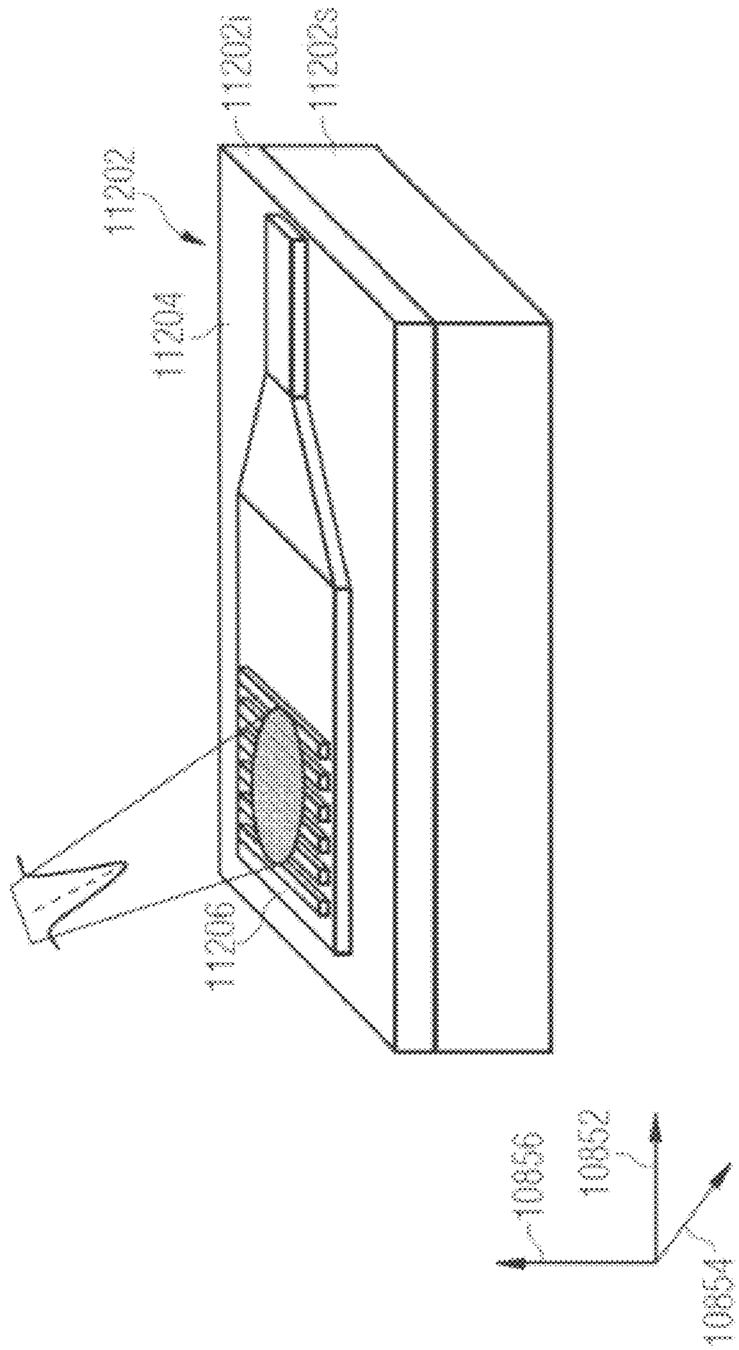

FIG. 112A shows an optical component in a schematic view, in accordance with various embodiments.

Figure 112B:
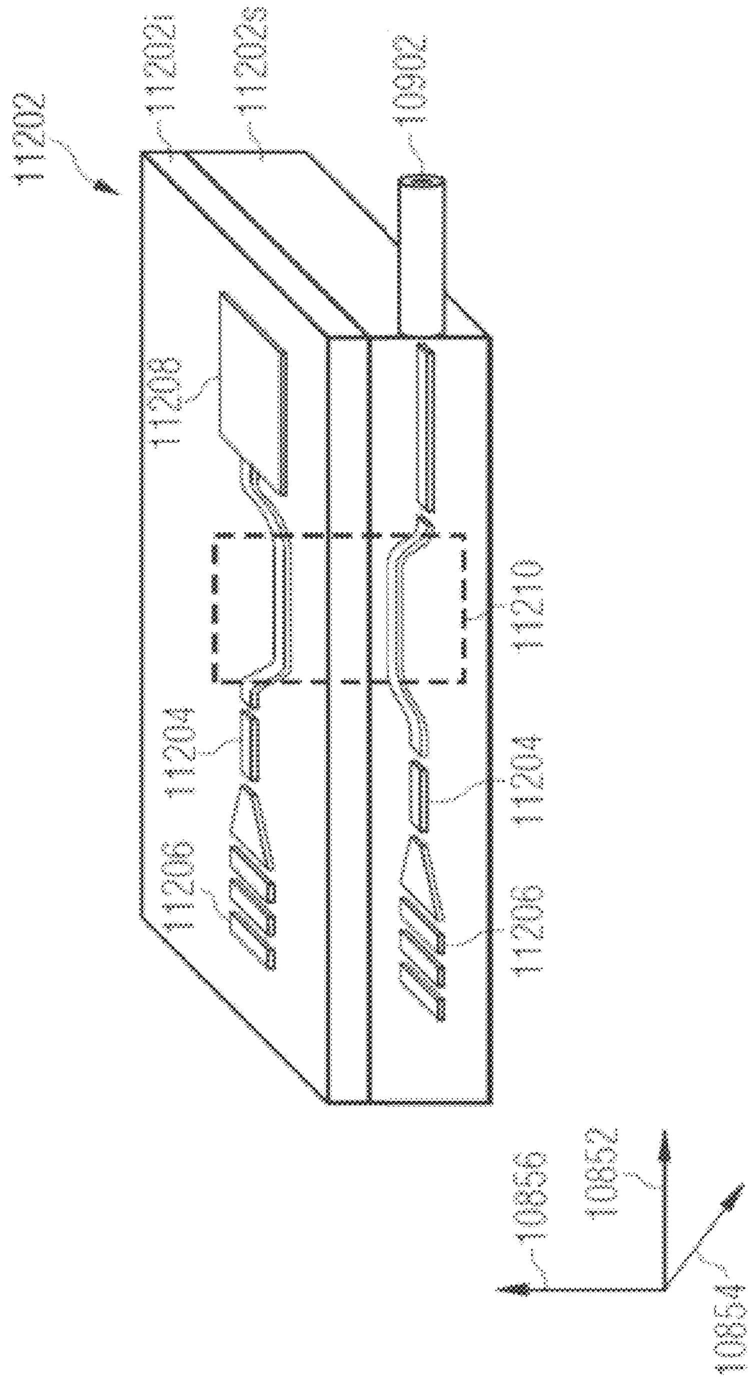

FIG. 112B shows an optical component in a schematic view, in accordance with various embodiments.

Figure 113:
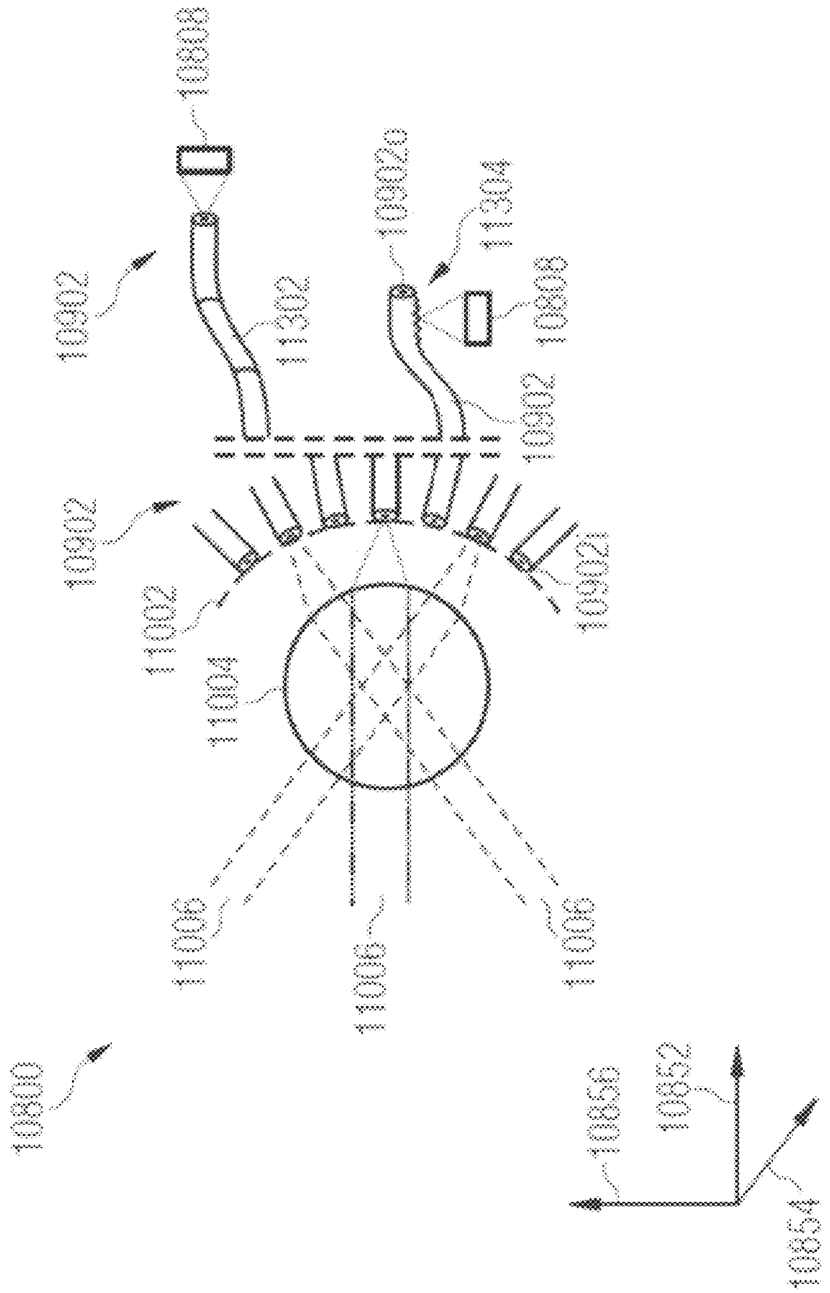

FIG. 113 shows a portion of a LIDAR system in a schematic view, in accordance with various embodiments.

Figure 114:
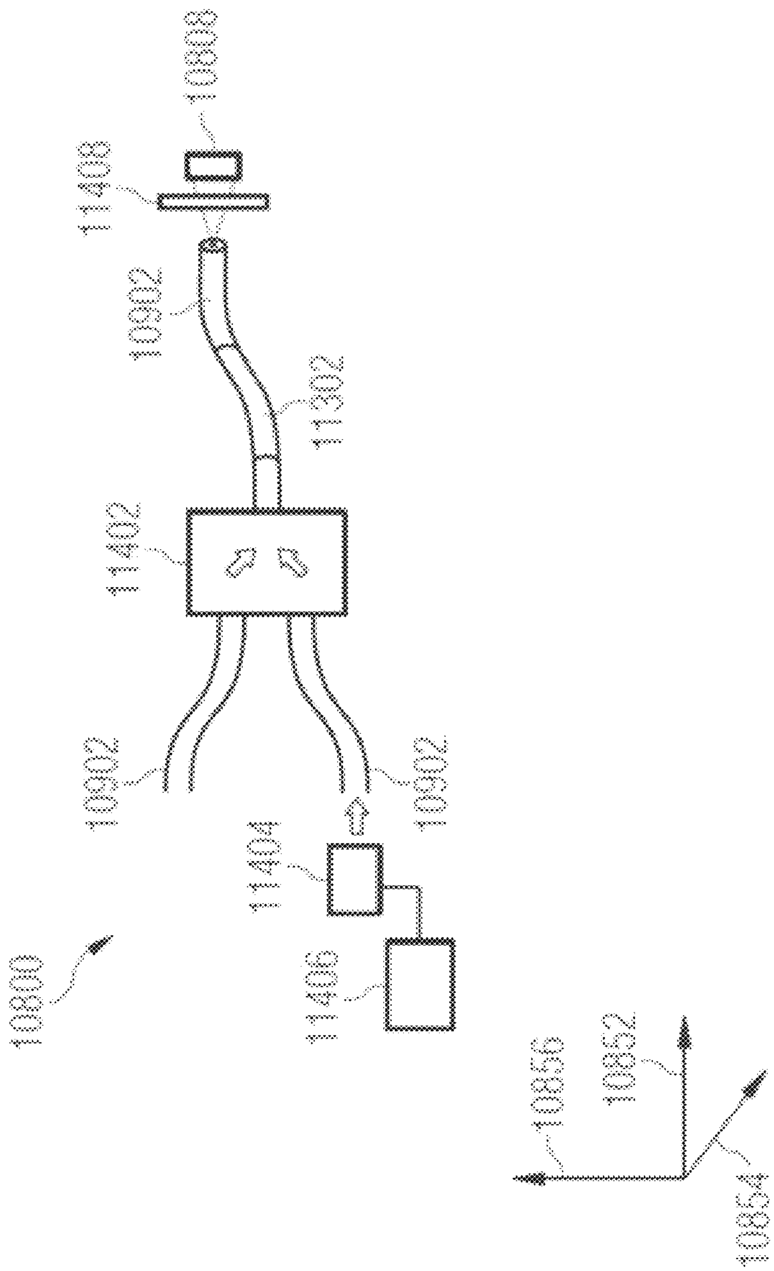

FIG. 114 shows a portion of a LIDAR system in a schematic view, in accordance with various embodiments.

Figure 115:
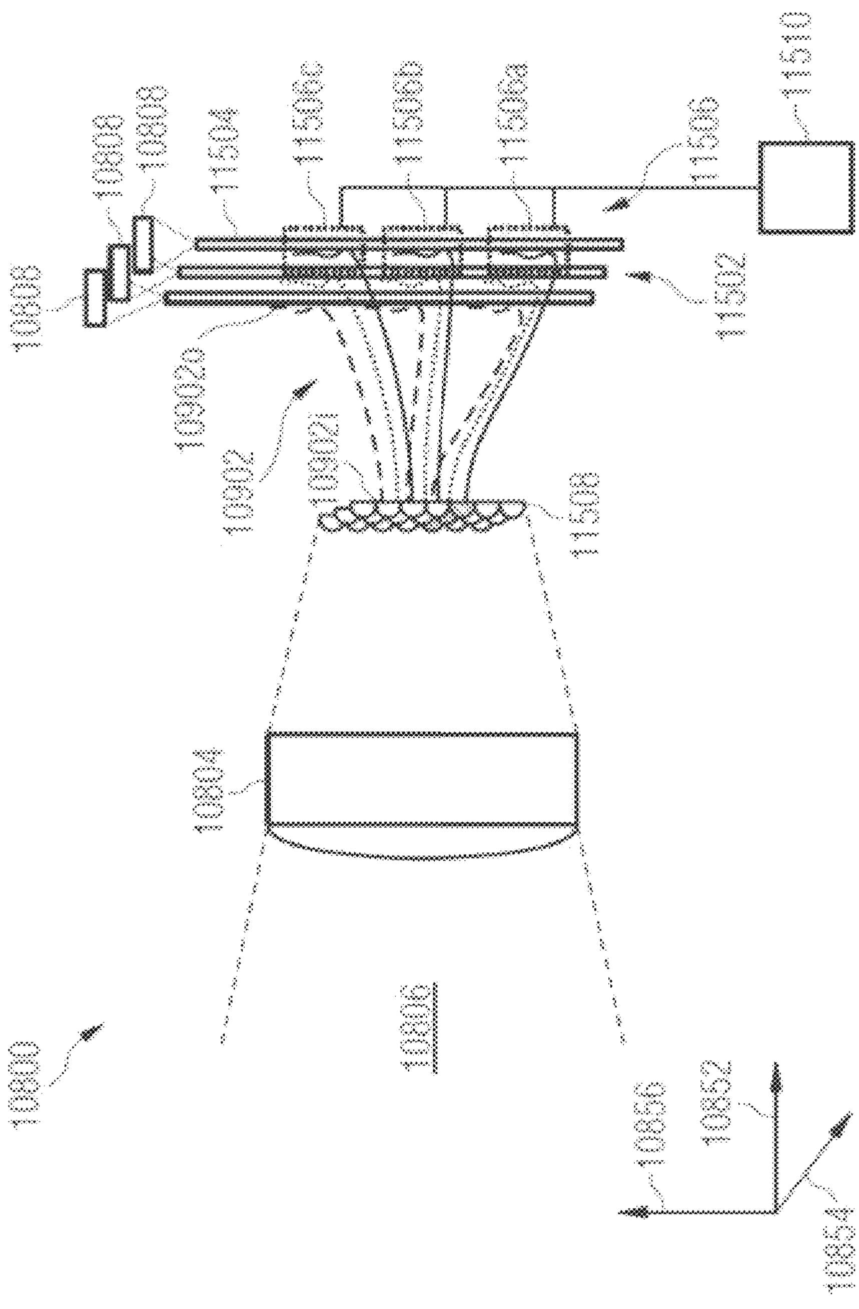

FIG. 115 shows a portion of a LIDAR system in a schematic view, in accordance with various embodiments.

Figure 116A:
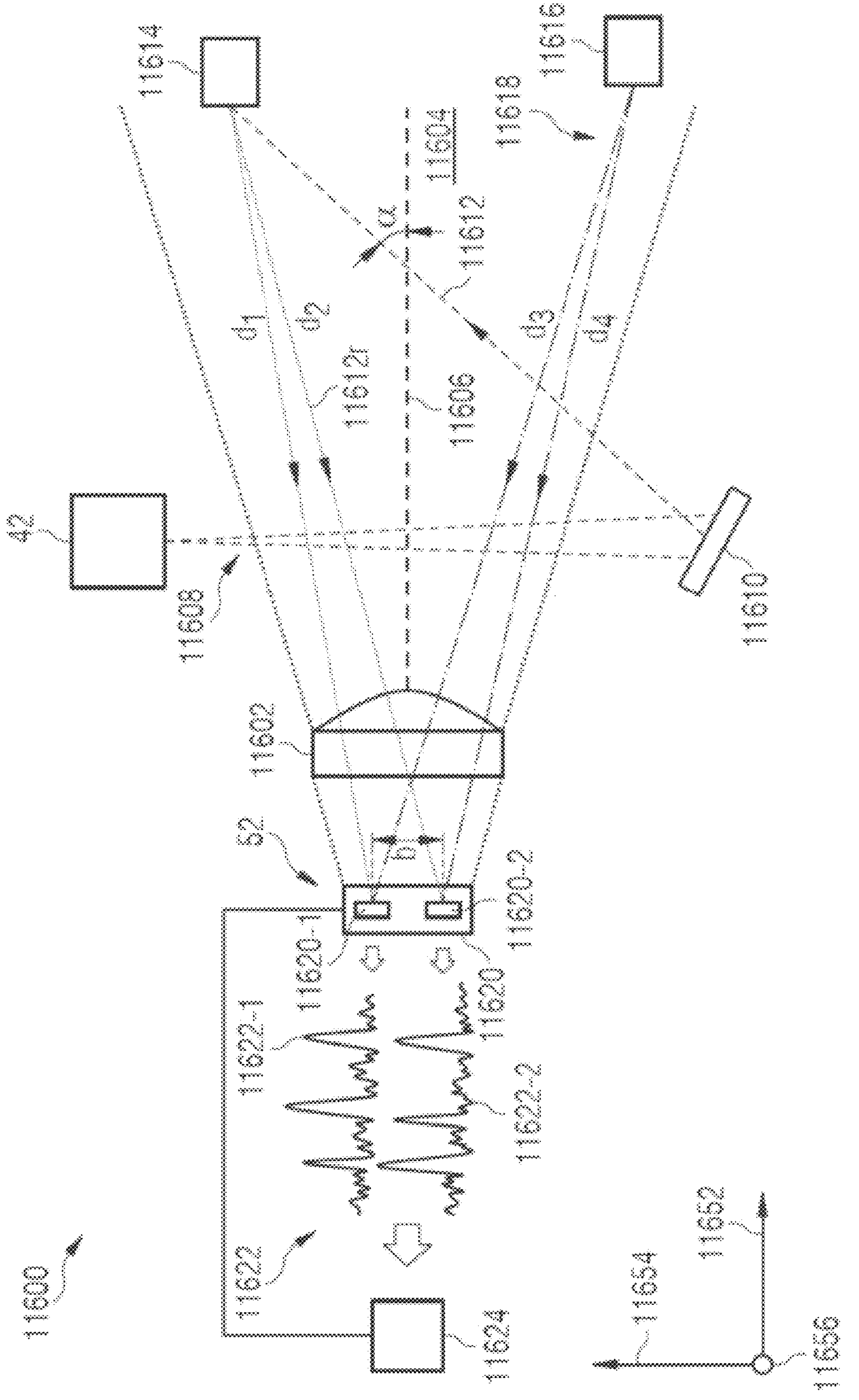

FIG. 116A shows a LIDAR system in a schematic view, in accordance with various embodiments.

Figure 116B:
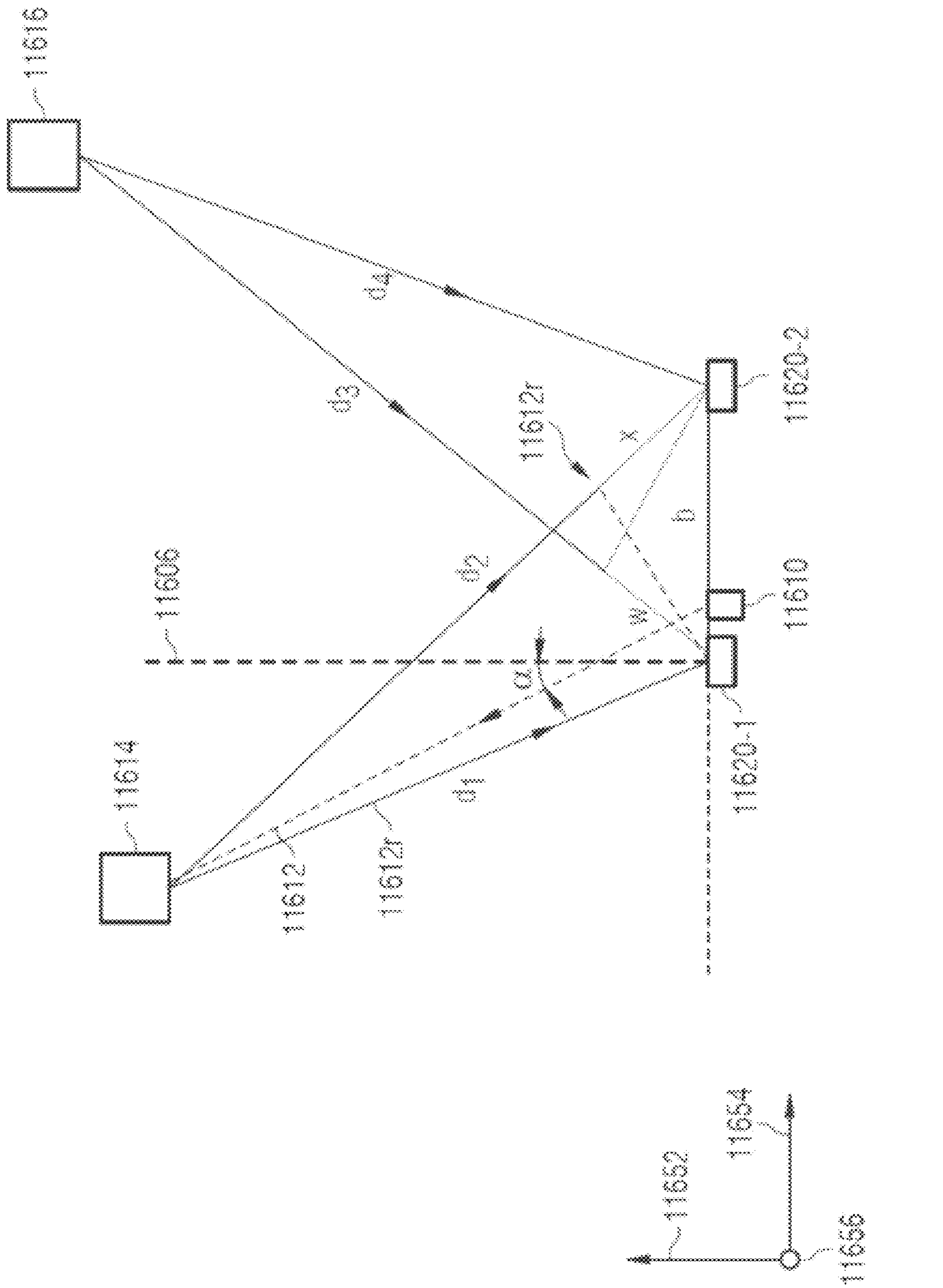

FIG. 116B shows a portion of a LIDAR system in a schematic view, in accordance with various embodiments.

Figure 116C:
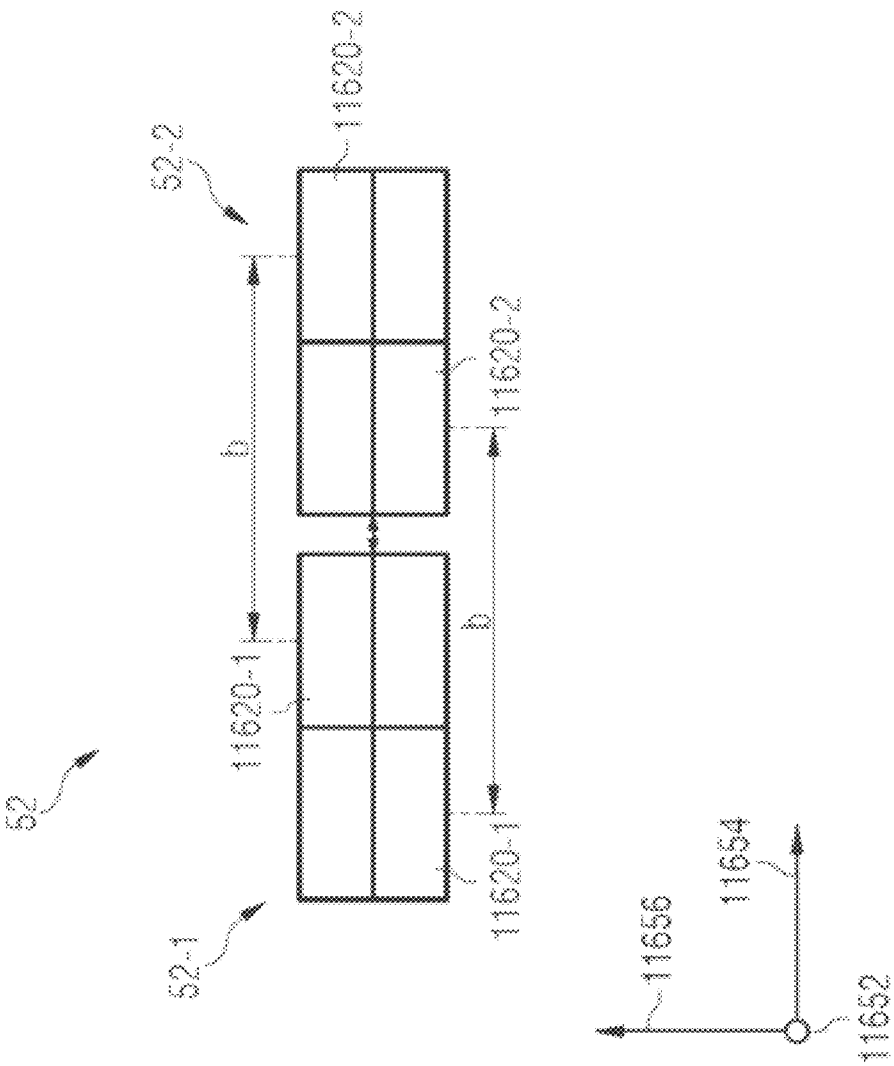
Figure 116D:
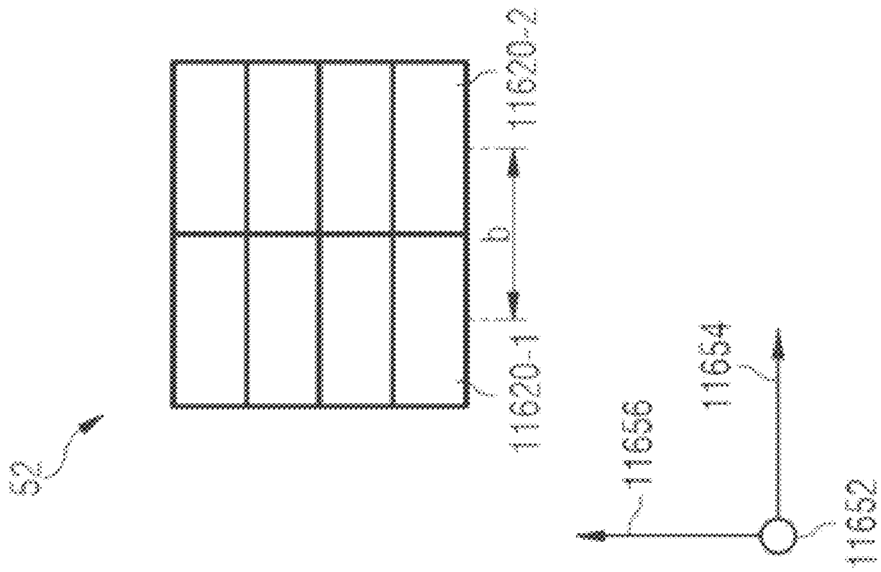

FIG. 116C and FIG. 116D show each a sensor in a schematic view, in accordance with various embodiments.

Figure 117:
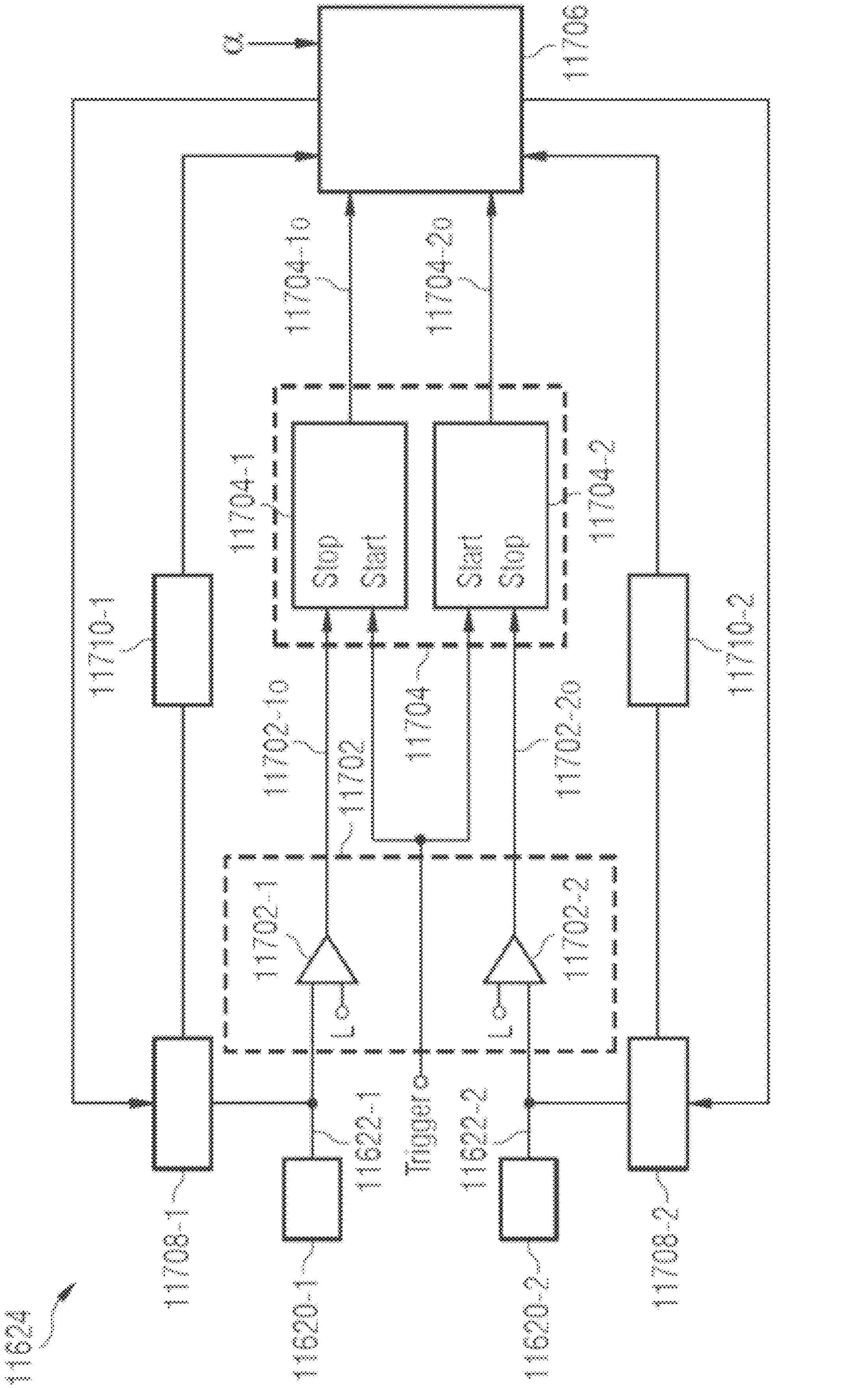

FIG. 117 shows a circuit in a schematic representation, in accordance with various embodiments.

Figure 118:
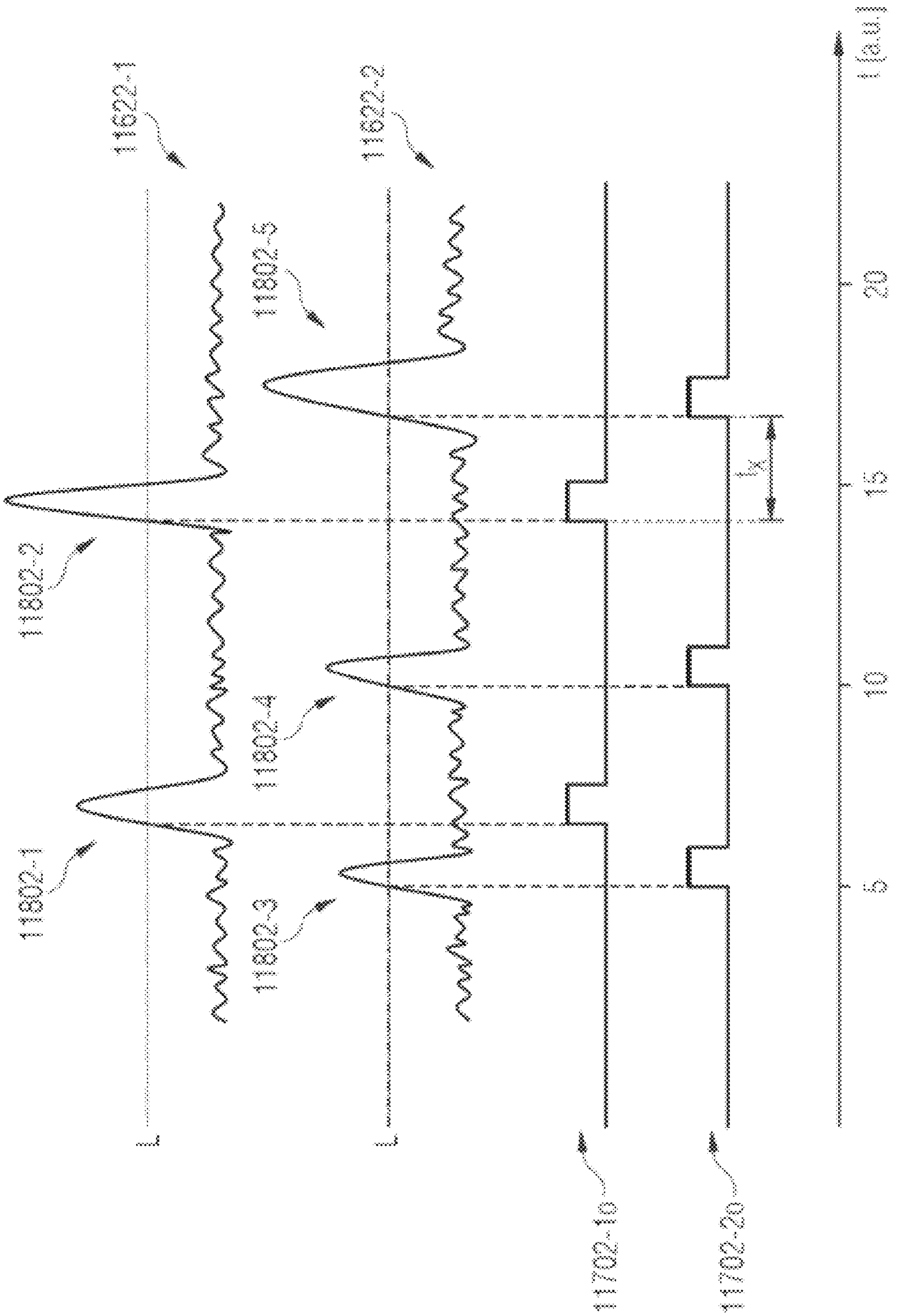

FIG. 118 shows signal processing in a schematic representation, in accordance with various embodiments.

Figure 119:
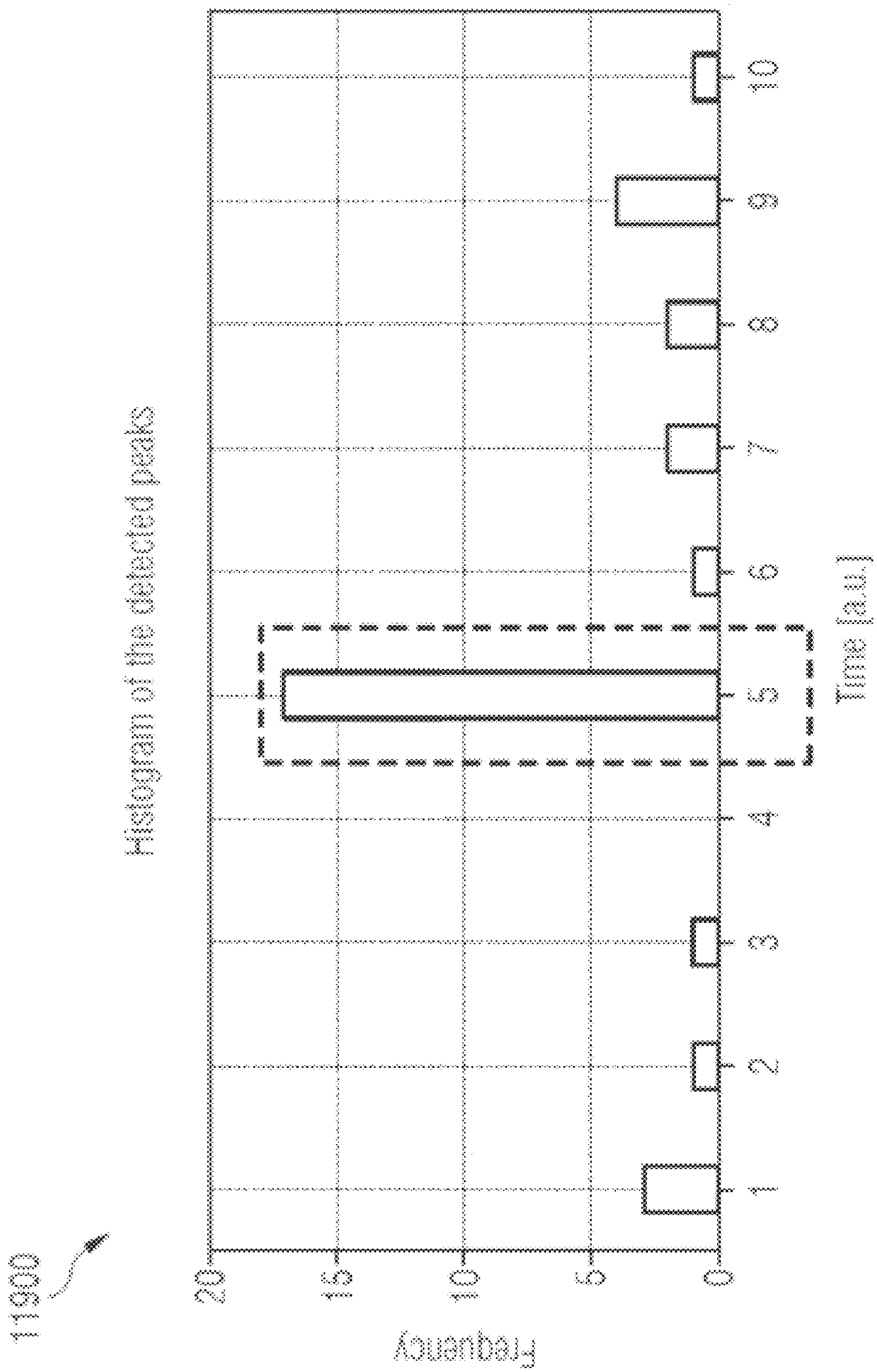

FIG. 119 shows a chart related to signal processing, in accordance with various embodiments.

Figure 120:
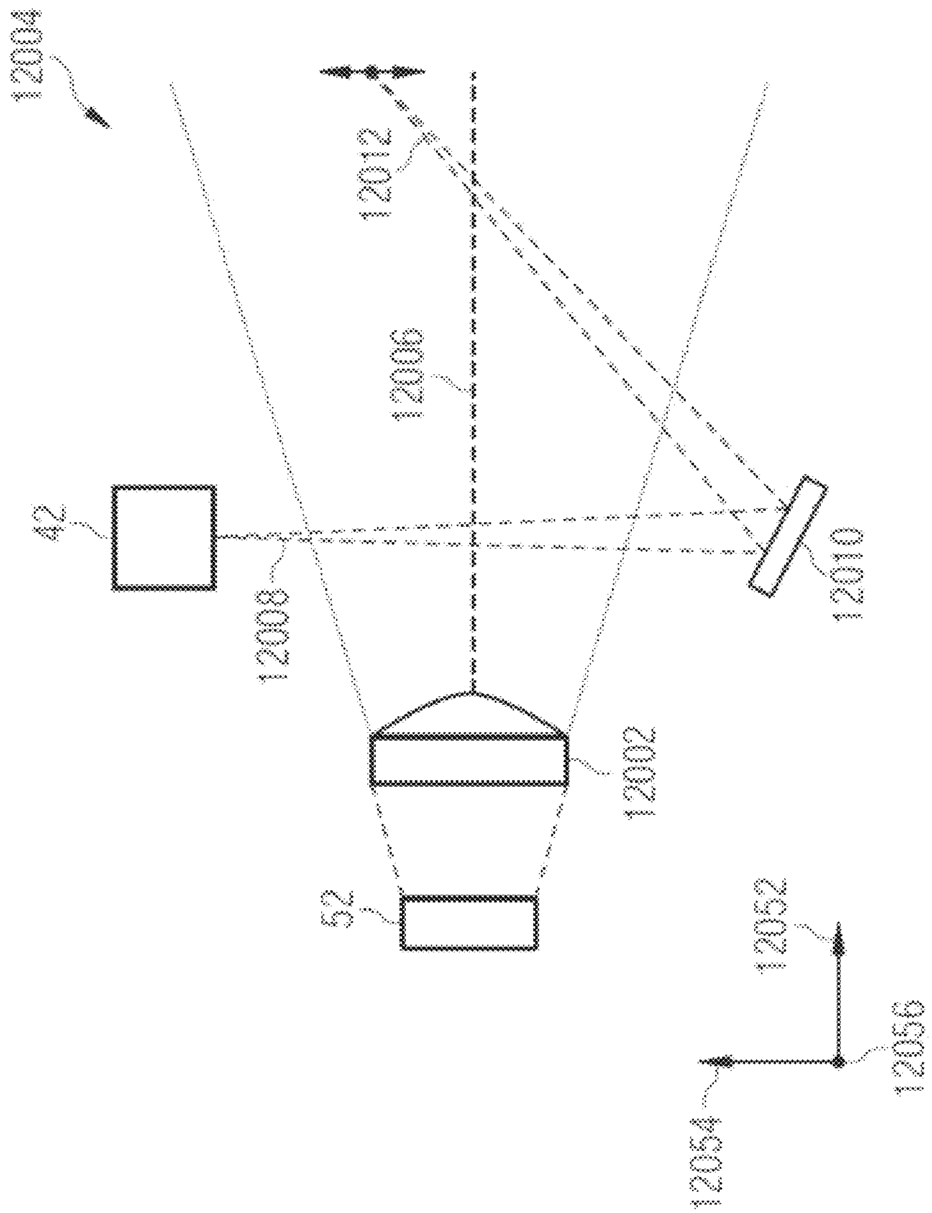

FIG. 120 shows a top view of a LIDAR system in a schematic view, in accordance with various embodiments.

FIG. 121A to FIG. 121D show each a sensor in a schematic view, in accordance with various embodiments.

Figure 122:
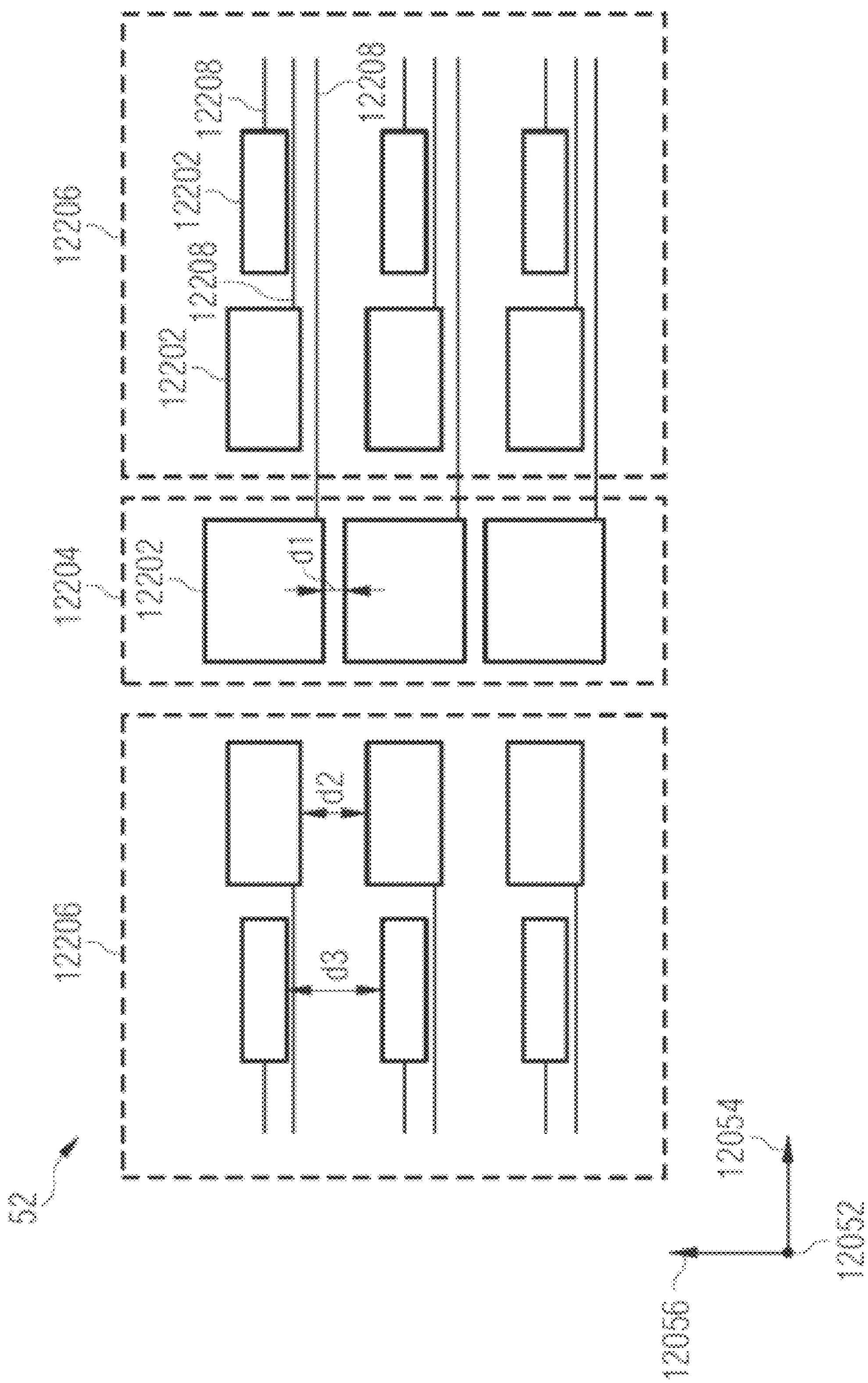

FIG. 122 shows a sensor in a schematic view, in accordance with various embodiments.

Figure 123:
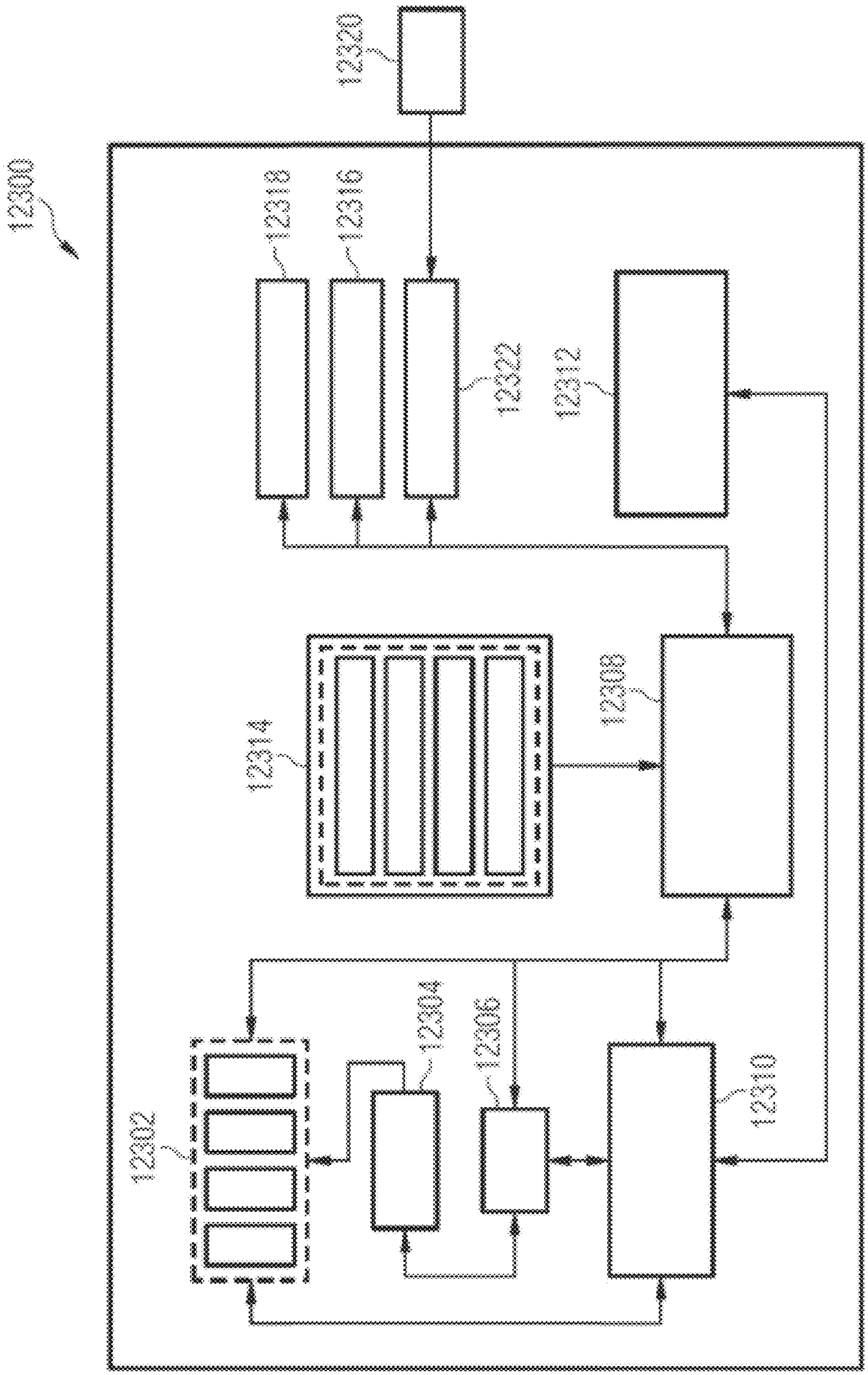

FIG. 123 shows a vehicle in a schematic view, in accordance with various embodiments.

Figure 124:
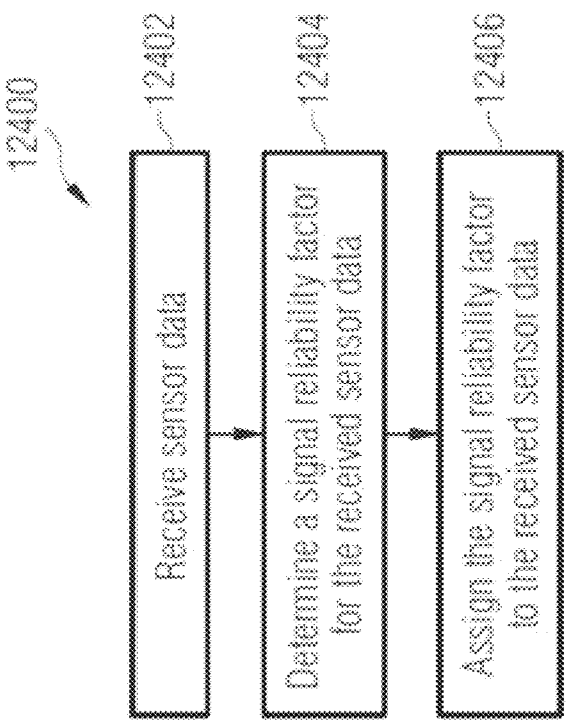

FIG. 124 shows a method in accordance with various embodiments.

Figure 125A:
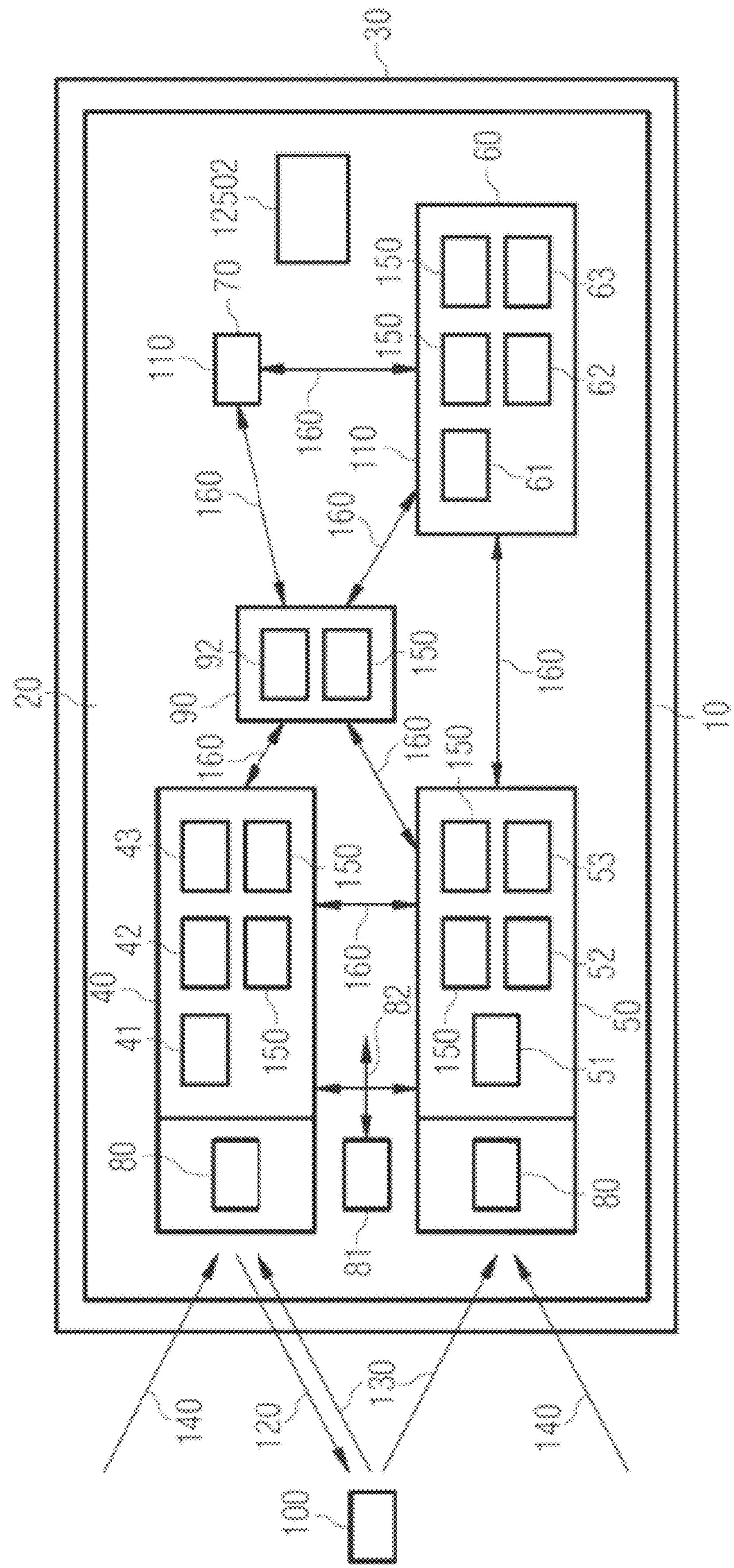
Figure 125B:
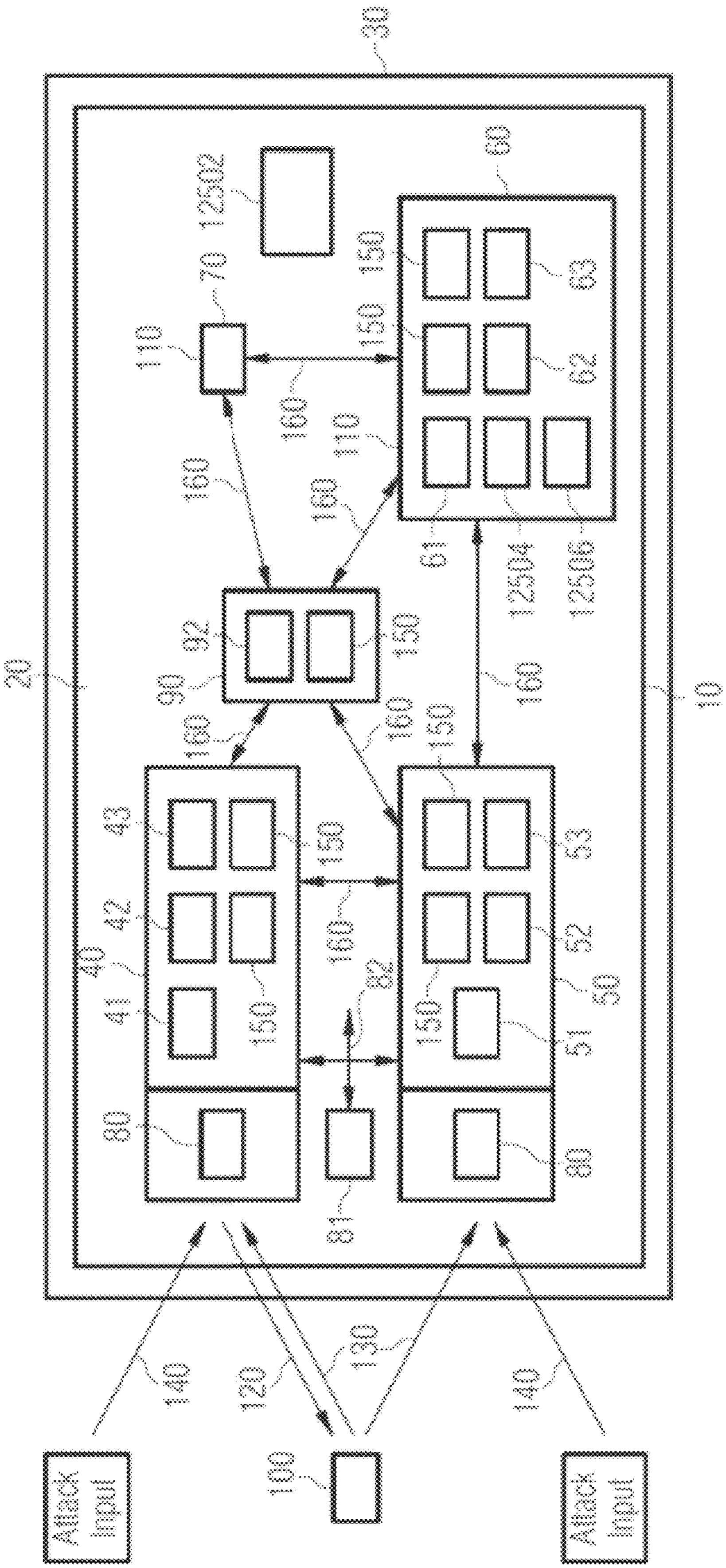

FIG. 125A and FIG. 125B show each a system in a schematic view in accordance with various embodiments.

Figure 126:
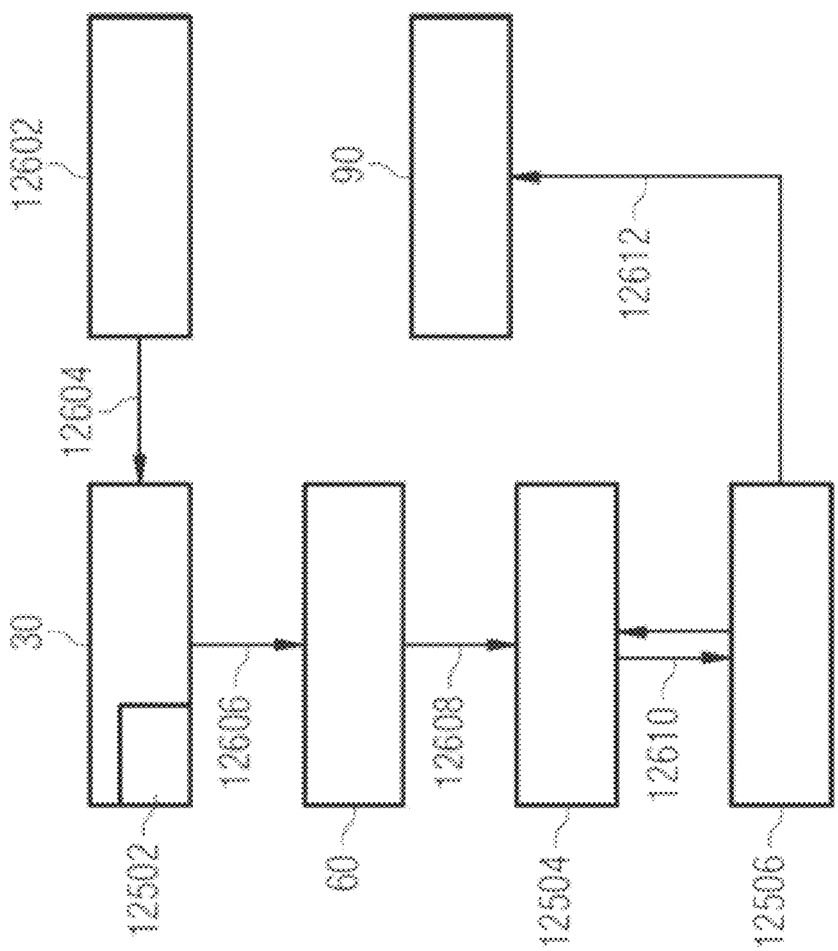

FIG. 126 shows a system and a signal path in a schematic view in accordance with various embodiments.

Figure 127:
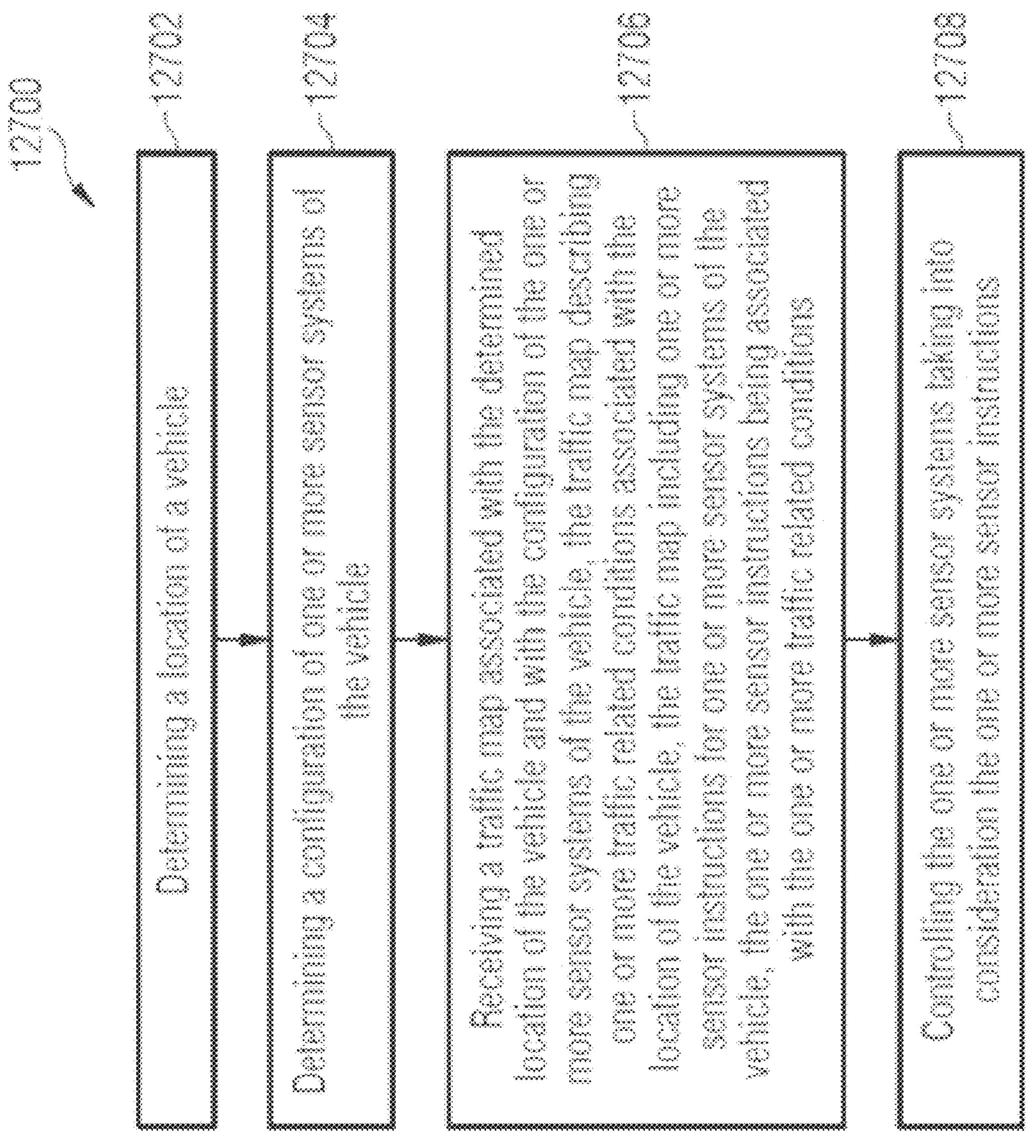

FIG. 127 shows a method in accordance with various embodiments.

Figure 128:
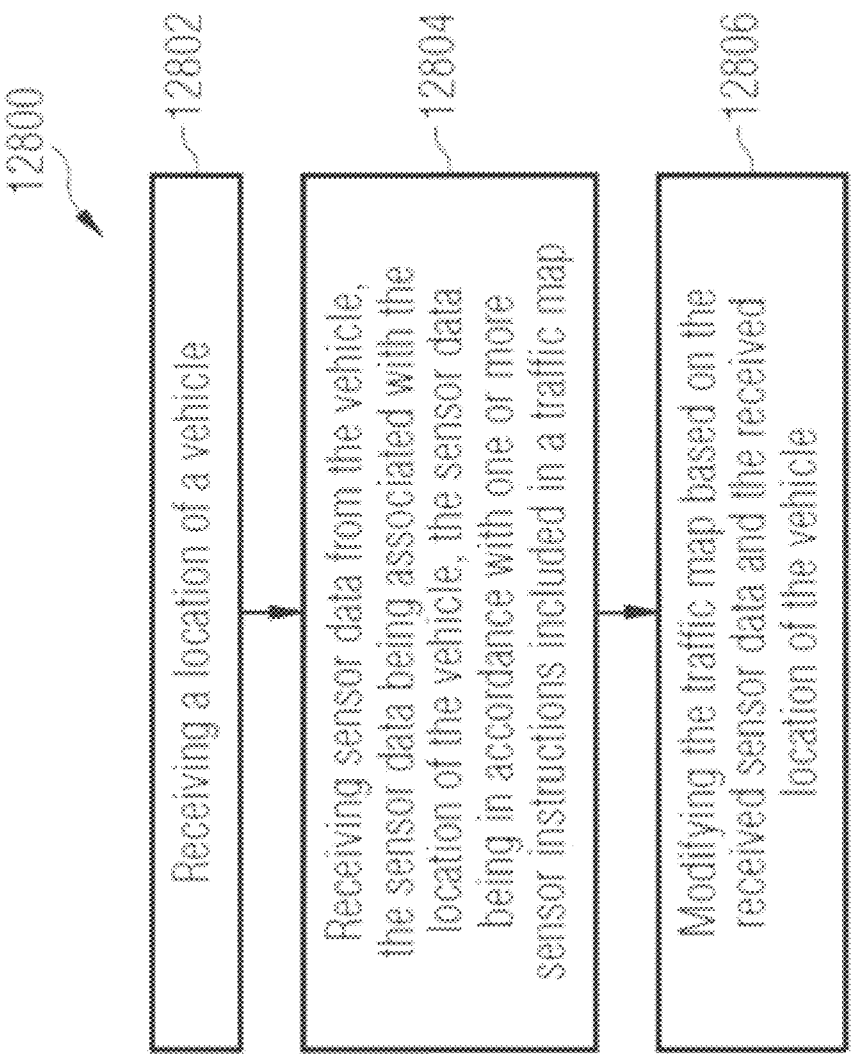

FIG. 128 shows a method in accordance with various embodiments.

Figure 129A:
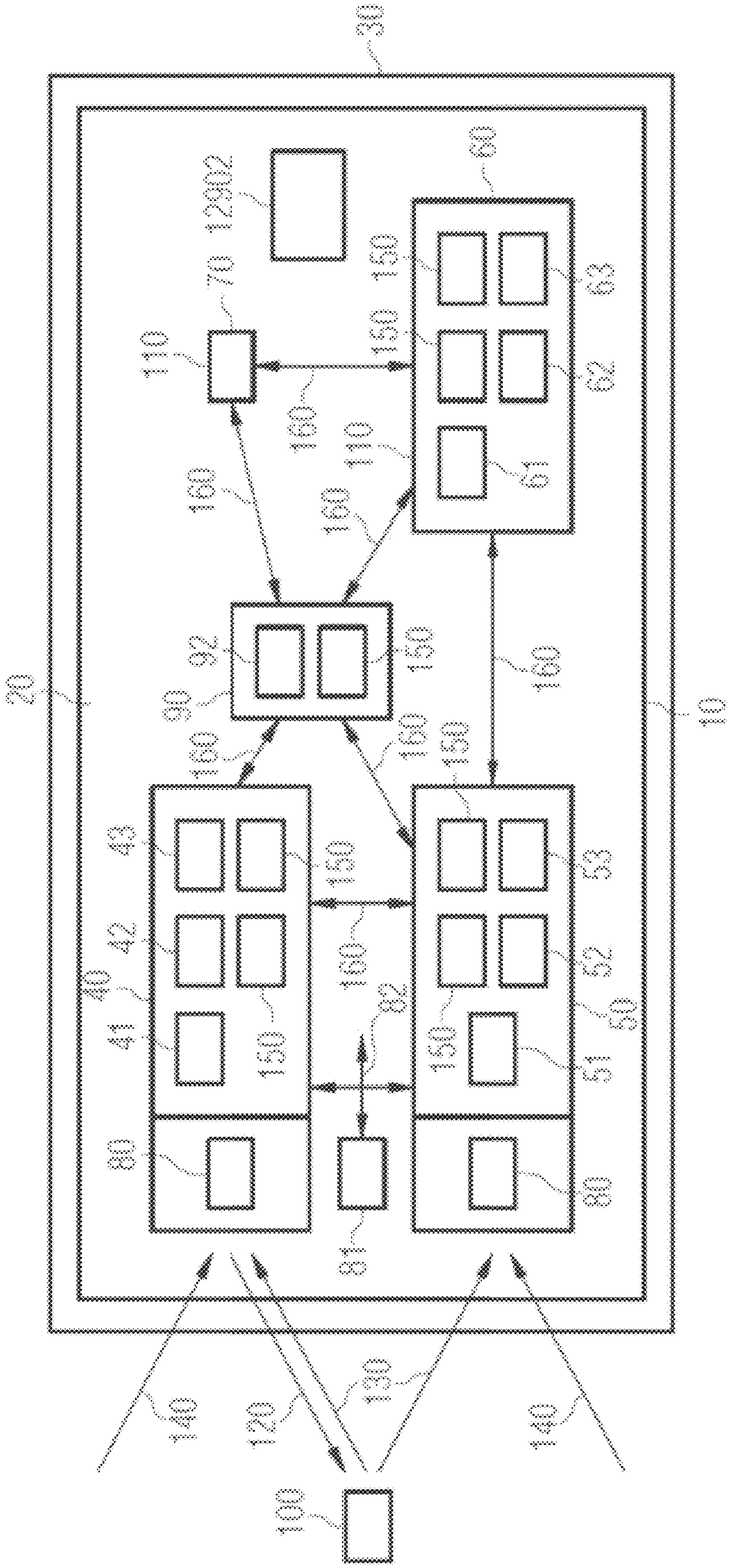
Figure 129B:
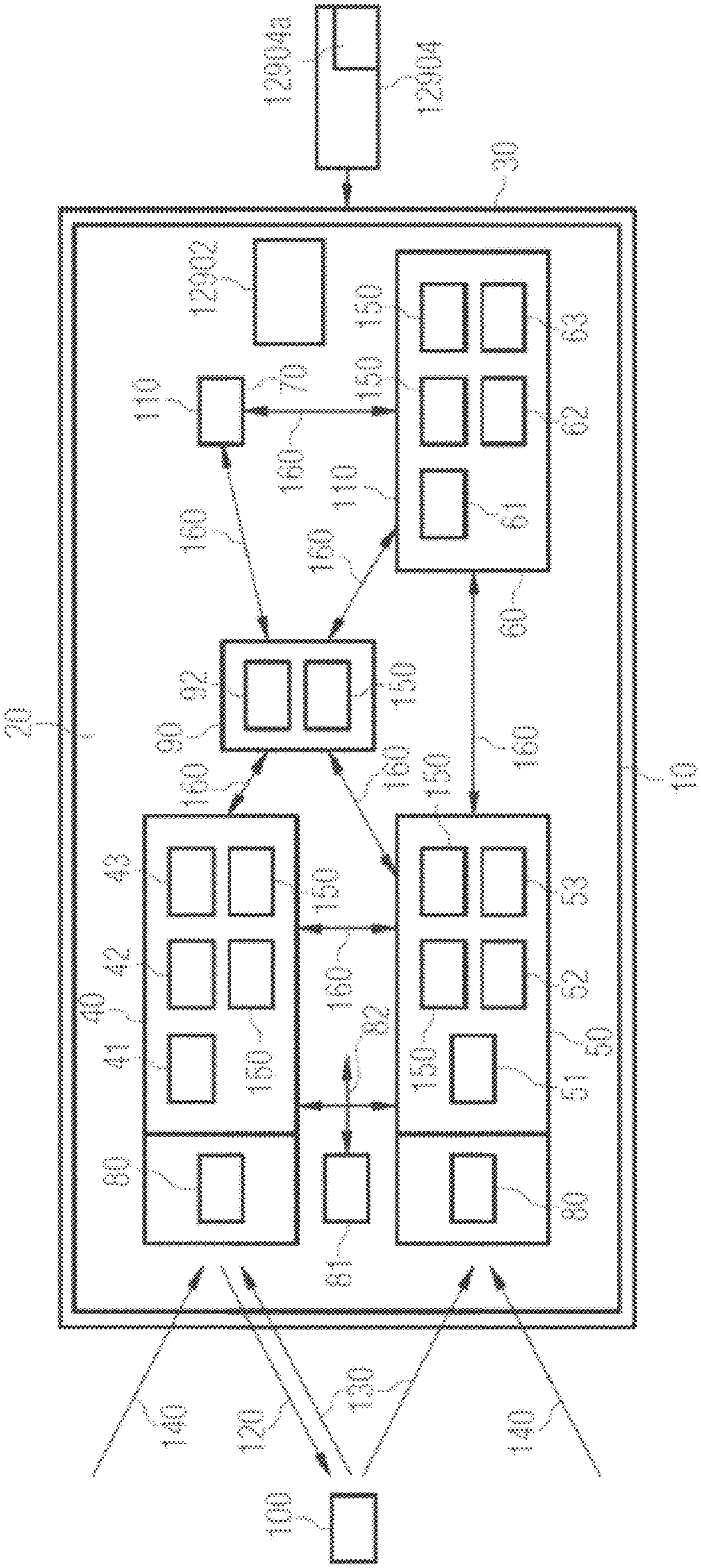

FIG. 129A and FIG. 129B show each a system in a schematic view in accordance with various embodiments.

Figure 130:
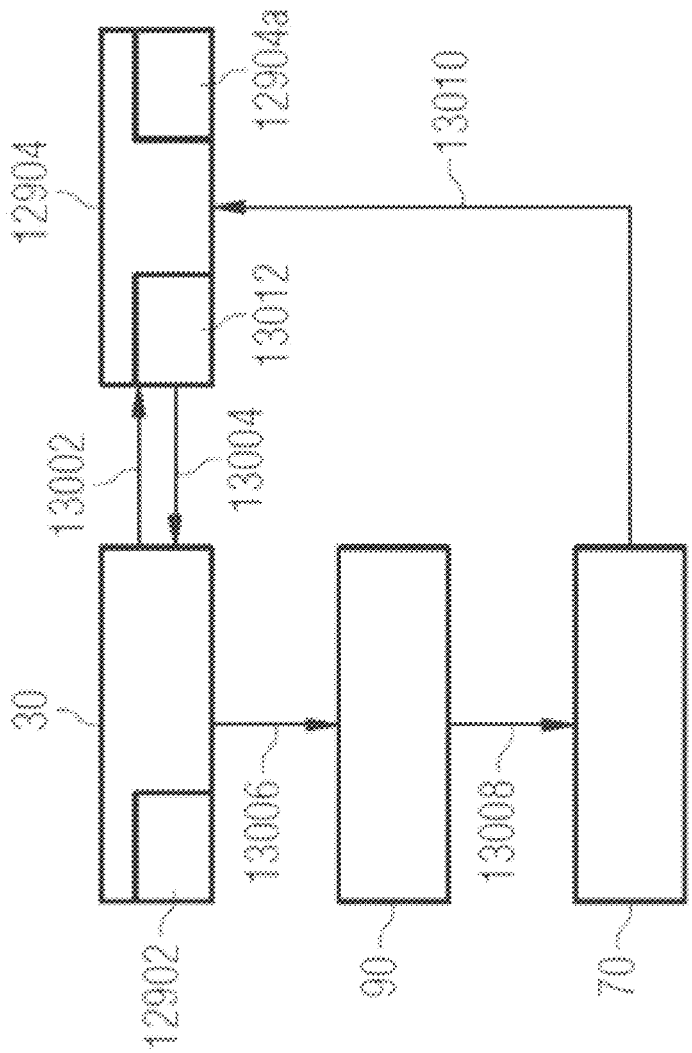

FIG. 130 shows a system and a signal path in a schematic view in accordance with various embodiments.

FIG. 131A to FIG. 131G show each a frame or a frame portion in a schematic representation in accordance with various embodiments.

Figure 132A:
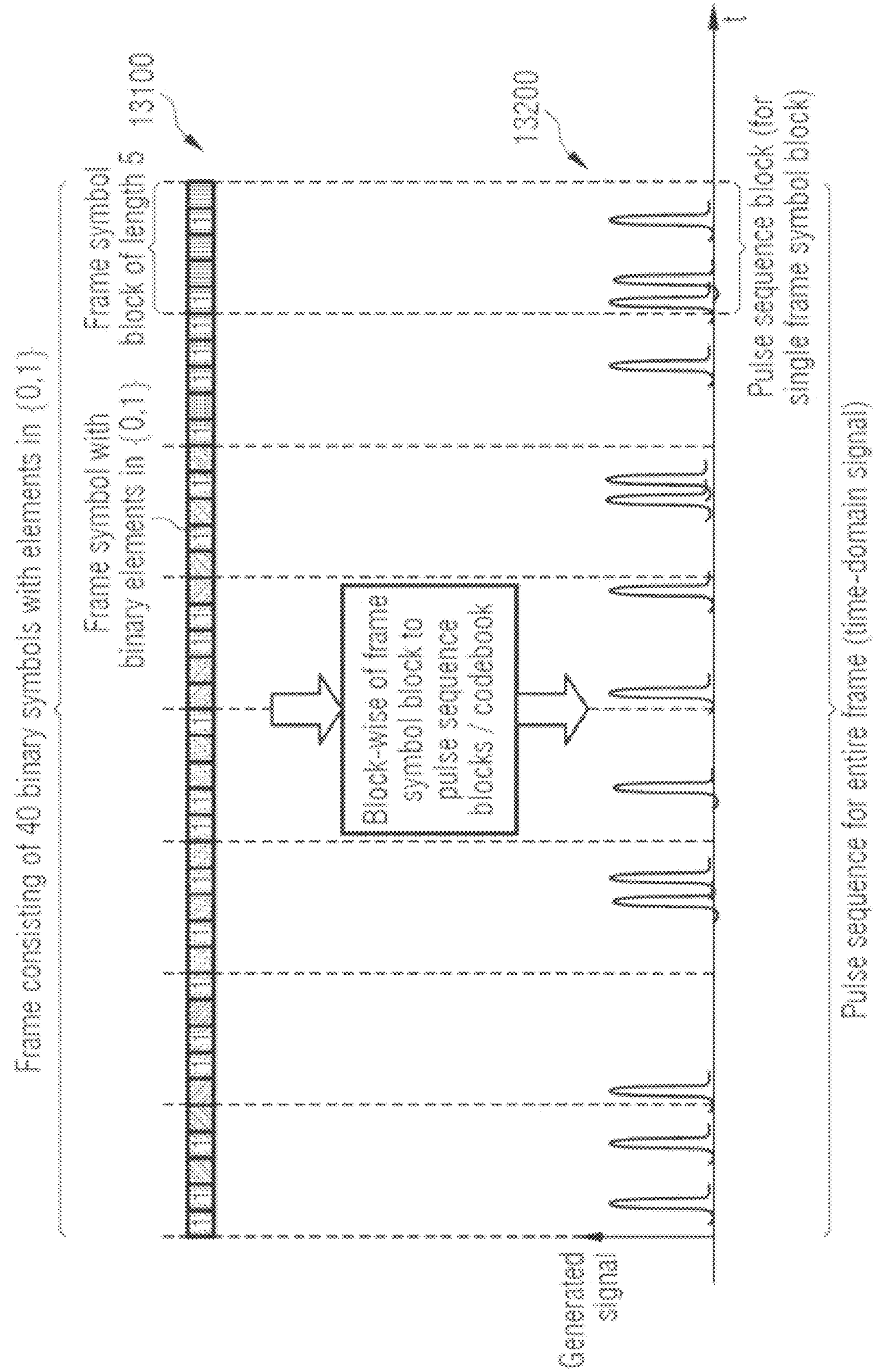

FIG. 132A shows a mapping of a frame onto a time-domain signal in a schematic representation in accordance with various embodiments.

Figure 132B:
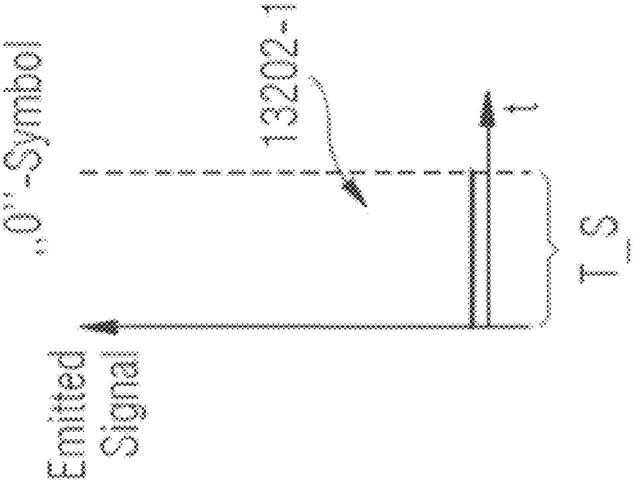
Figure 132C:
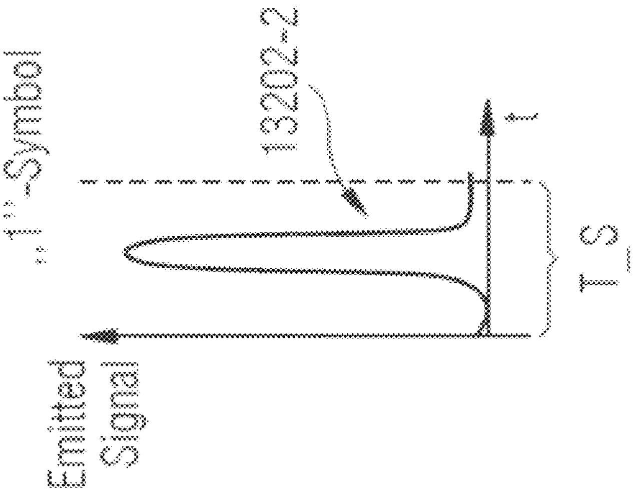

FIG. 132B and FIG. 132C show each a time-domain pulse in a schematic representation in accordance with various embodiments.

Figure 133A:
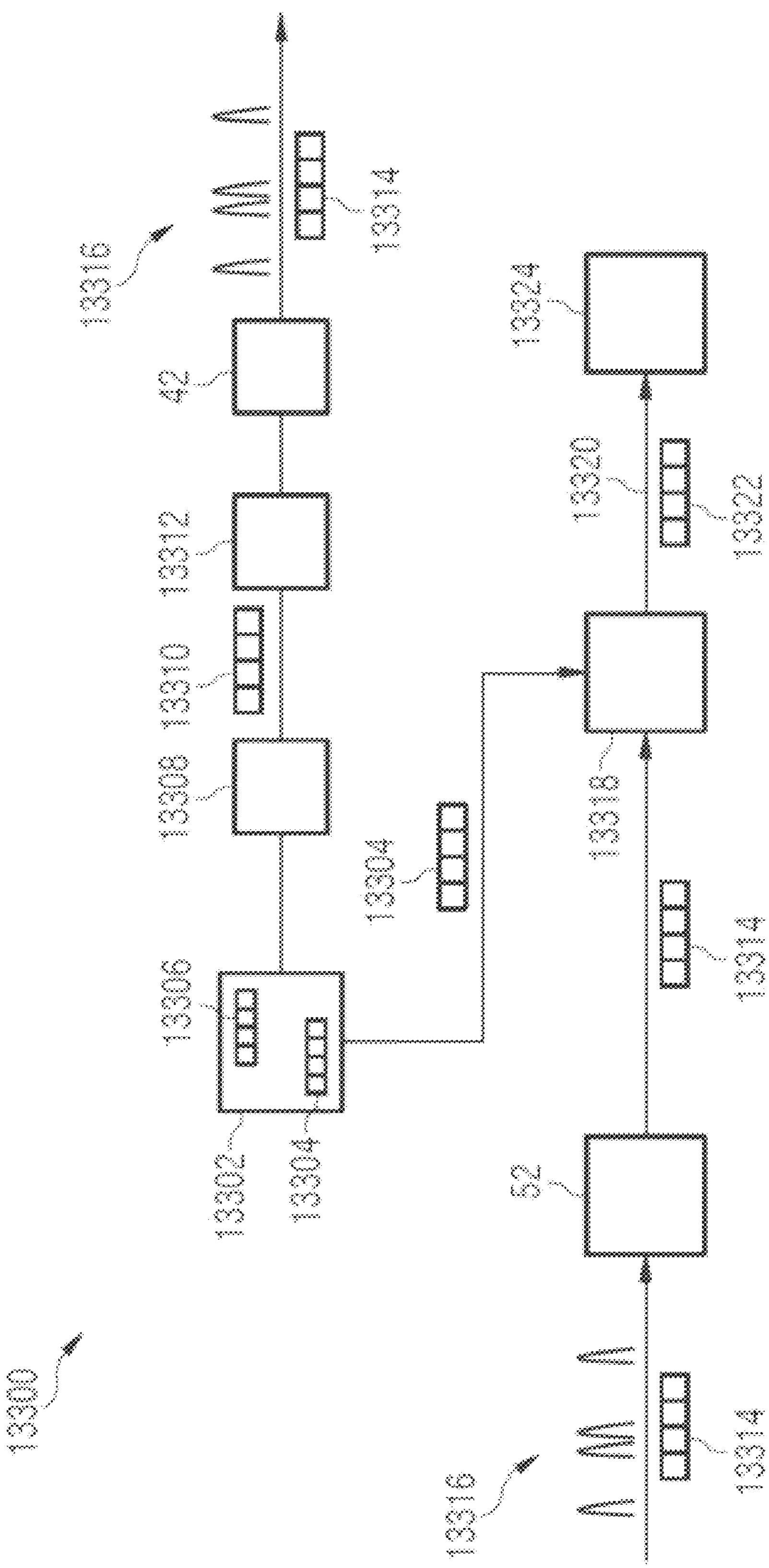

FIG. 133A shows a ranging system in a schematic representation in accordance with various embodiments.

Figure 133B:
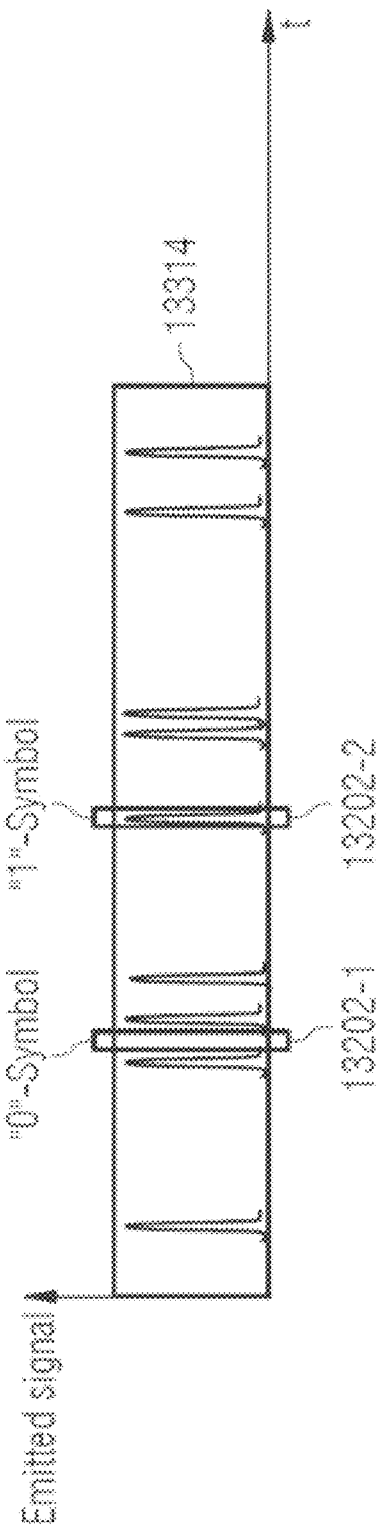
Figure 133C:
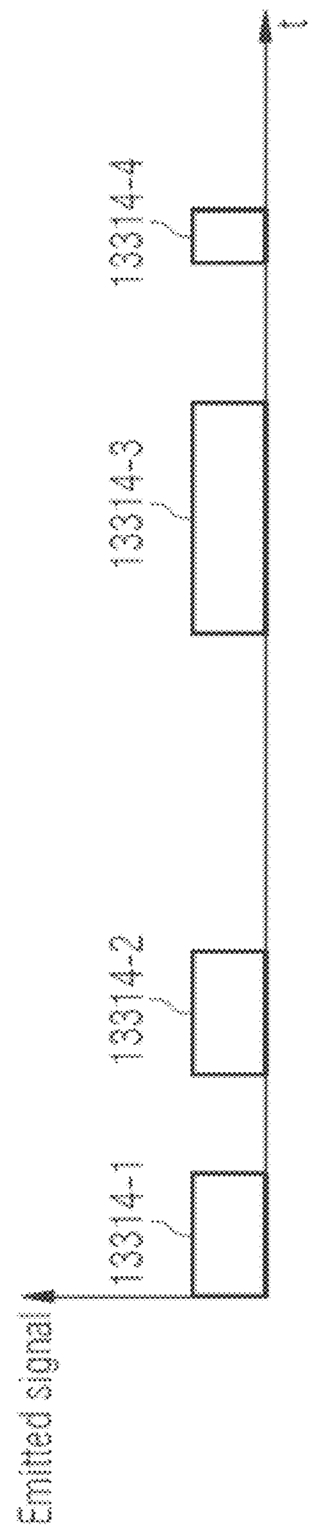

FIG. 133B and FIG. 133C show one or more frames emitted by a ranging system in a schematic representation in accordance with various embodiments.

Figure 133D:
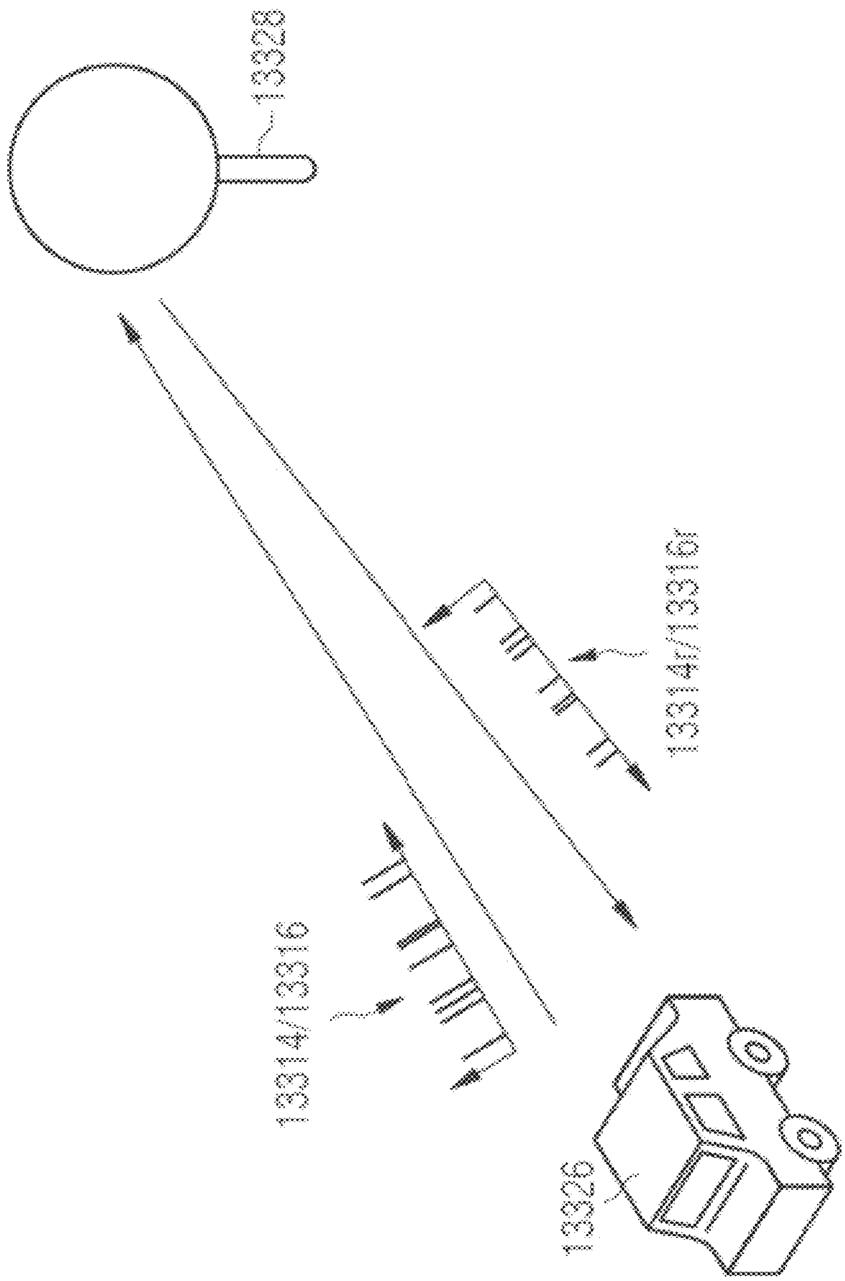

FIG. 133D shows the emission and the reception of a light signal by a ranging system in a schematic representation in accordance with various embodiments.

Figure 133E:
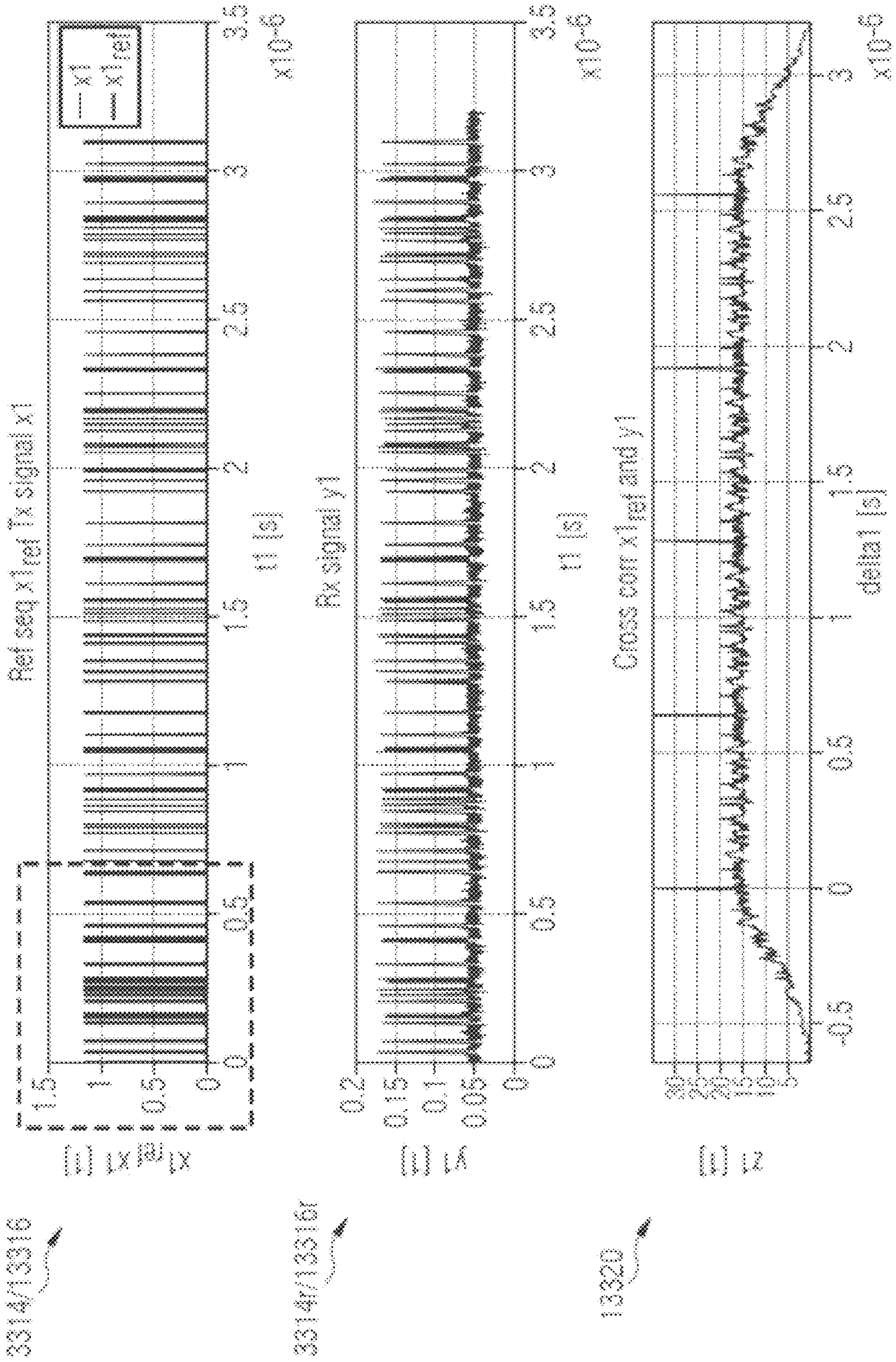

FIG. 133E shows the evaluation of an auto-correlation and/or cross-correlation between two signals in a schematic representation in accordance with various embodiments.

Figure 133F:
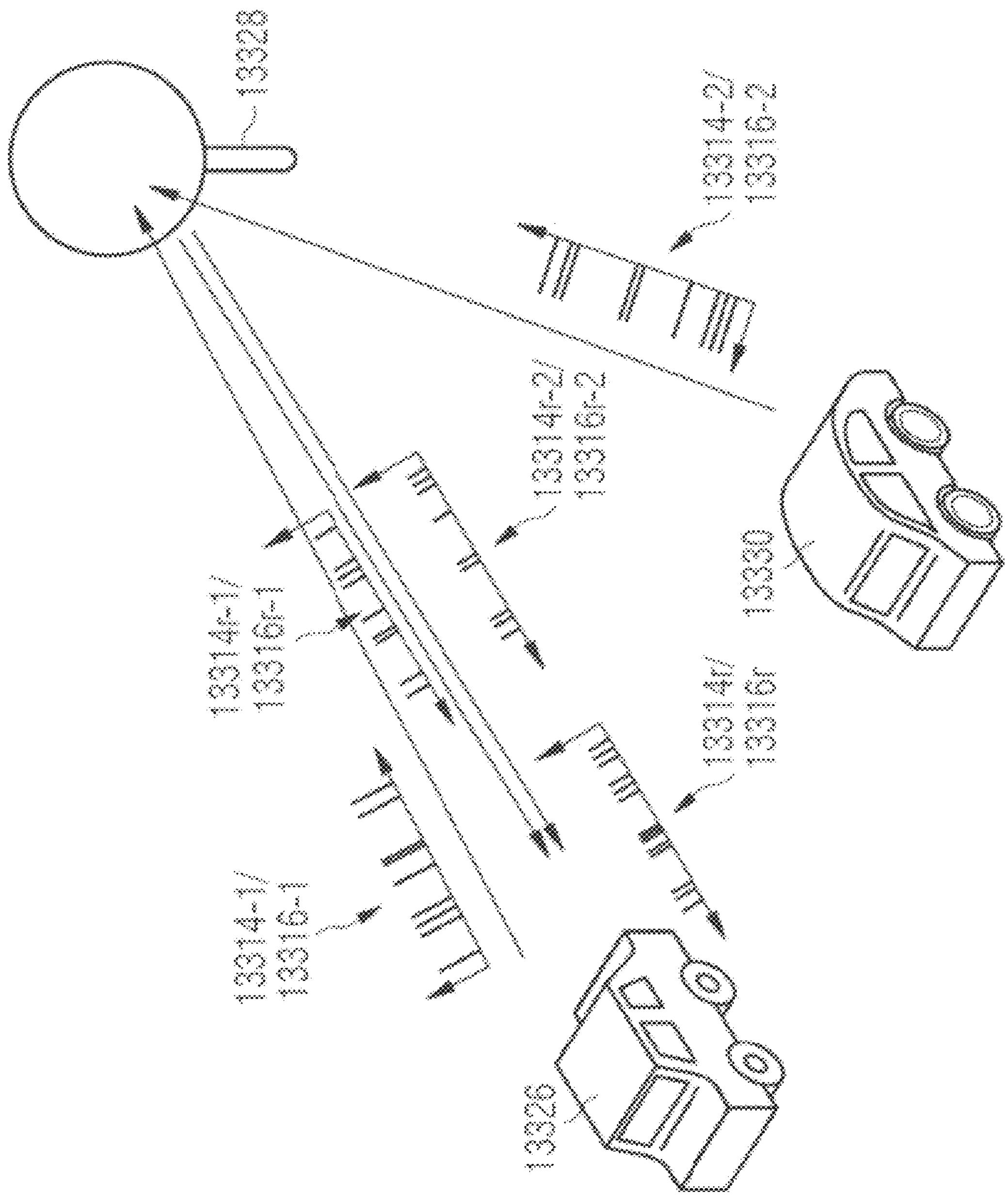

FIG. 133F shows the emission and the reception of a light signal by a ranging system in a schematic representation in accordance with various embodiments.

Figure 133G:
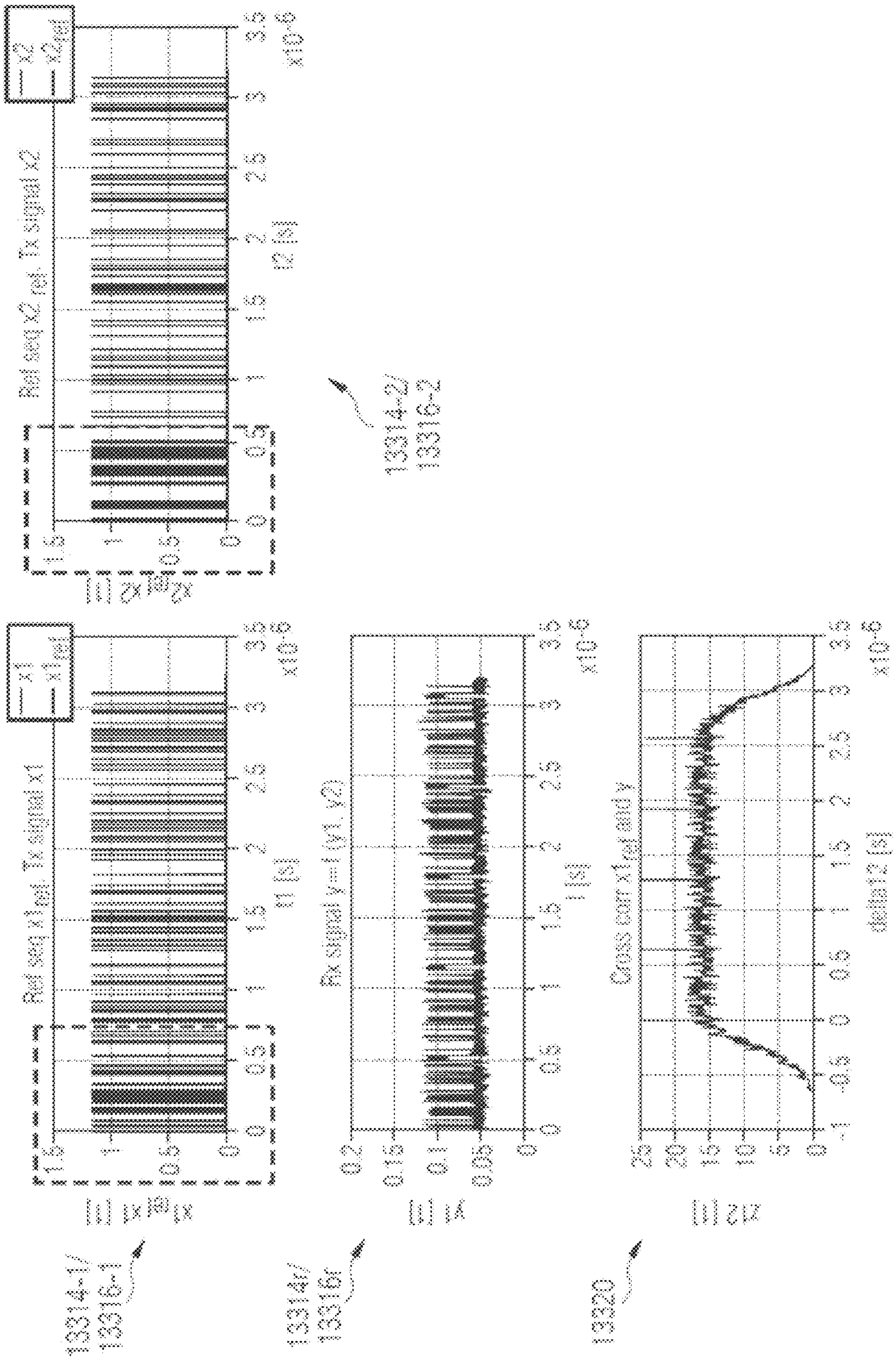

FIG. 133G shows the evaluation of an auto-correlation and/or cross-correlation between two signals in a schematic representation in accordance with various embodiments.

Figure 134A:
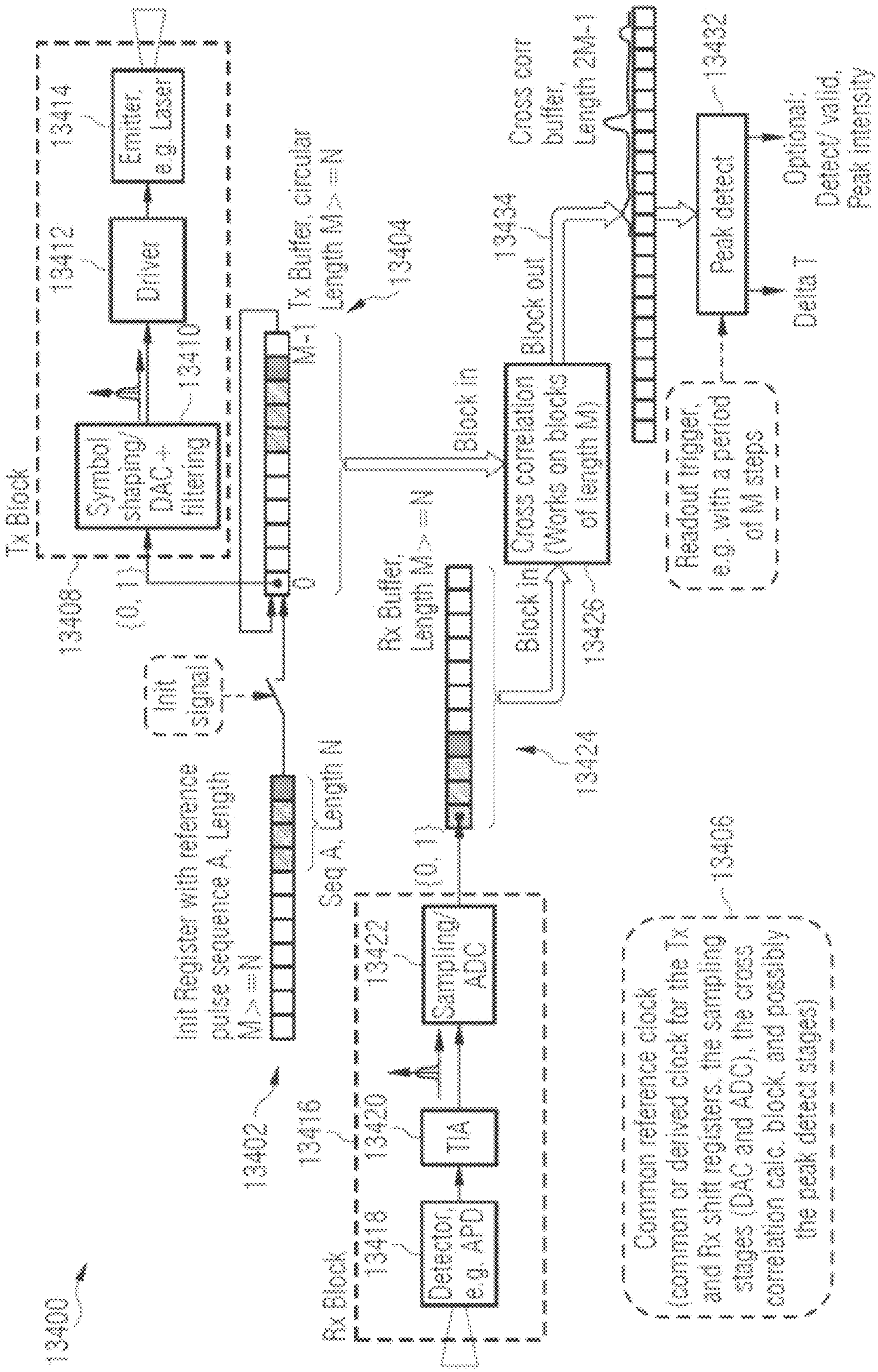
Figure 134B:
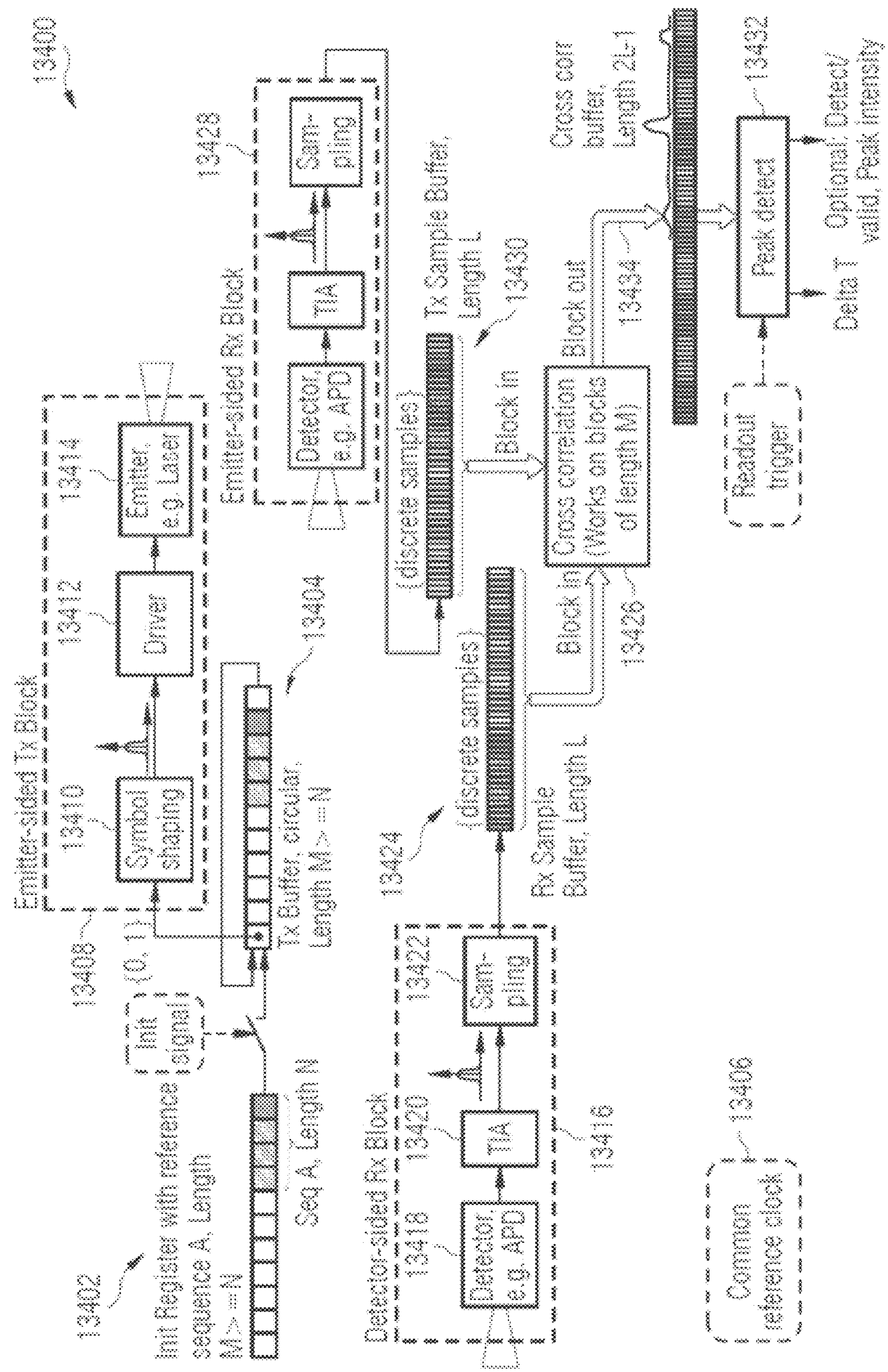
Figure 134C:
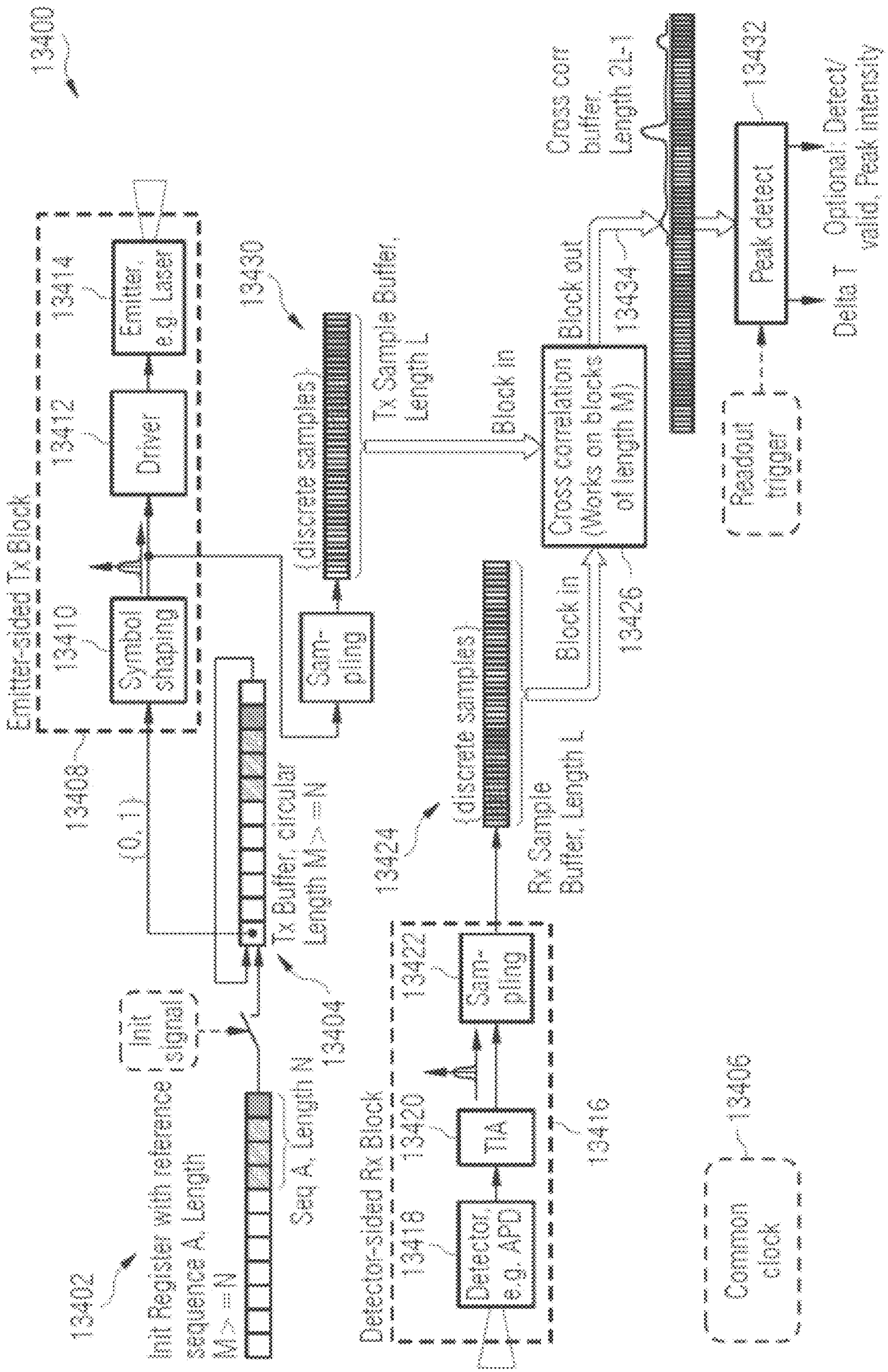

FIG. 134A to FIG. 134C show each a ranging system in a schematic representation in accordance with various embodiments.

FIG. 135A to FIG. 135F show each one or more portions of a ranging system in a schematic representation in accordance with various embodiments.

Figure 135A:
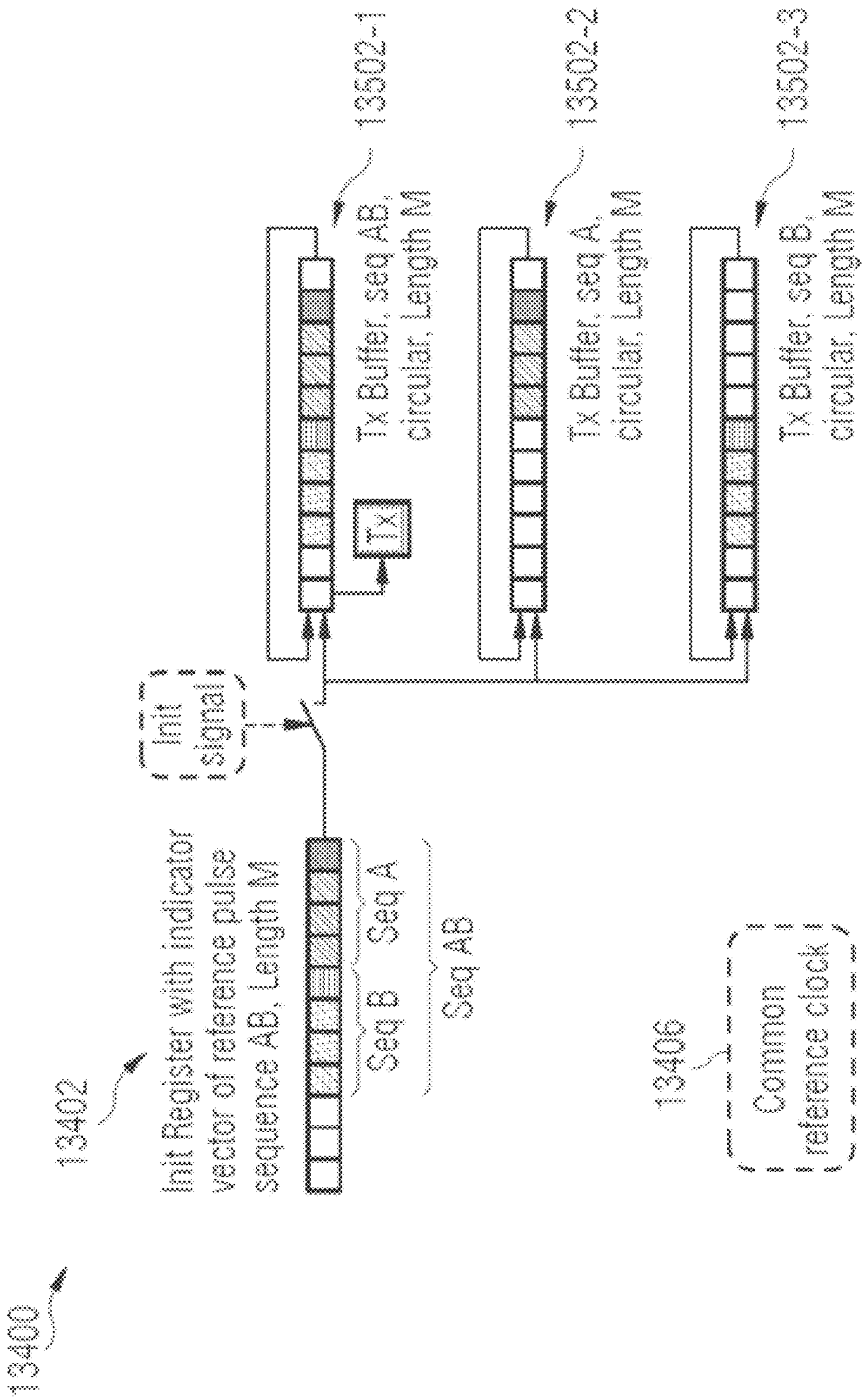
Figure 135B:
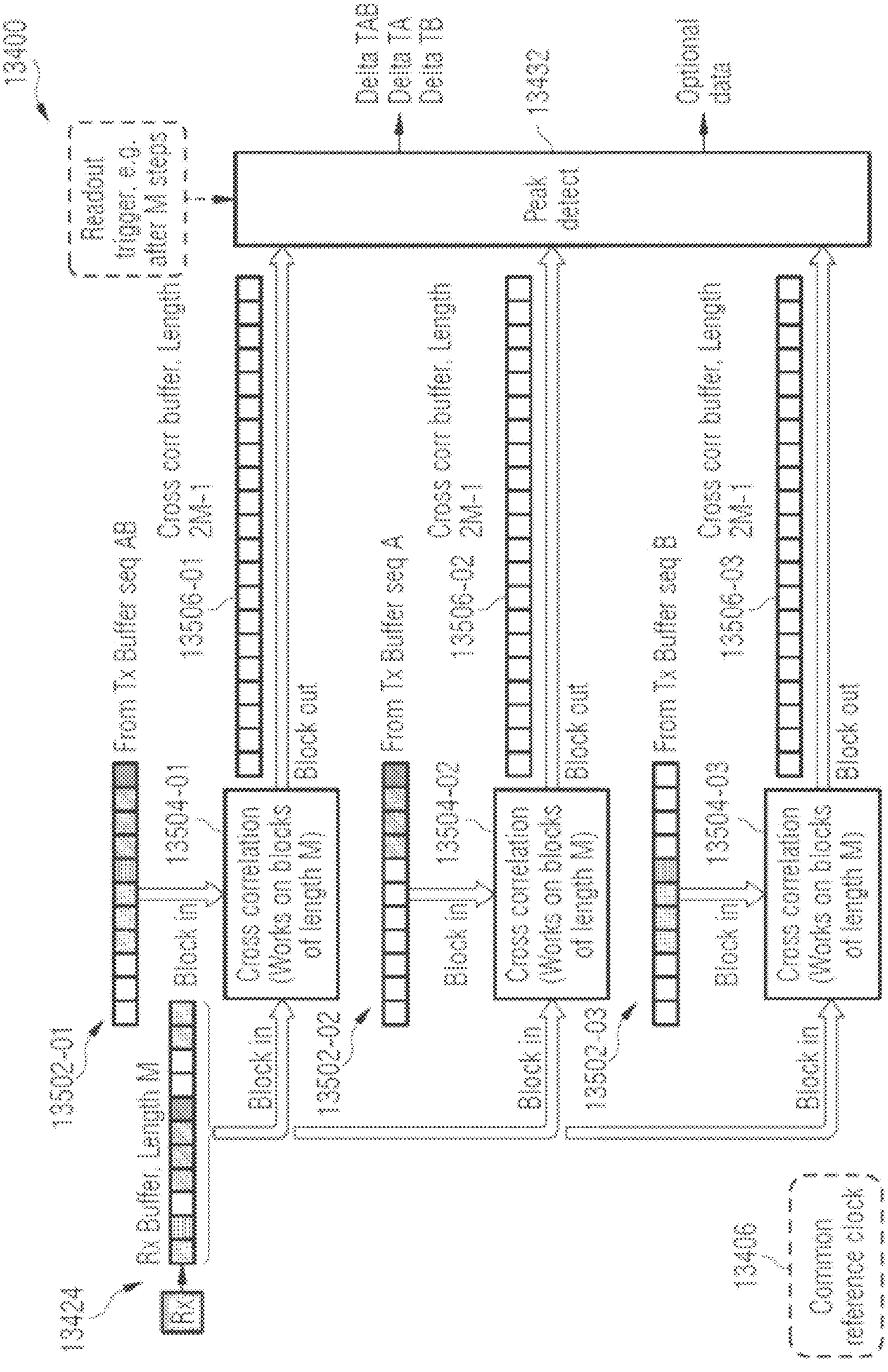
Figure 135C:
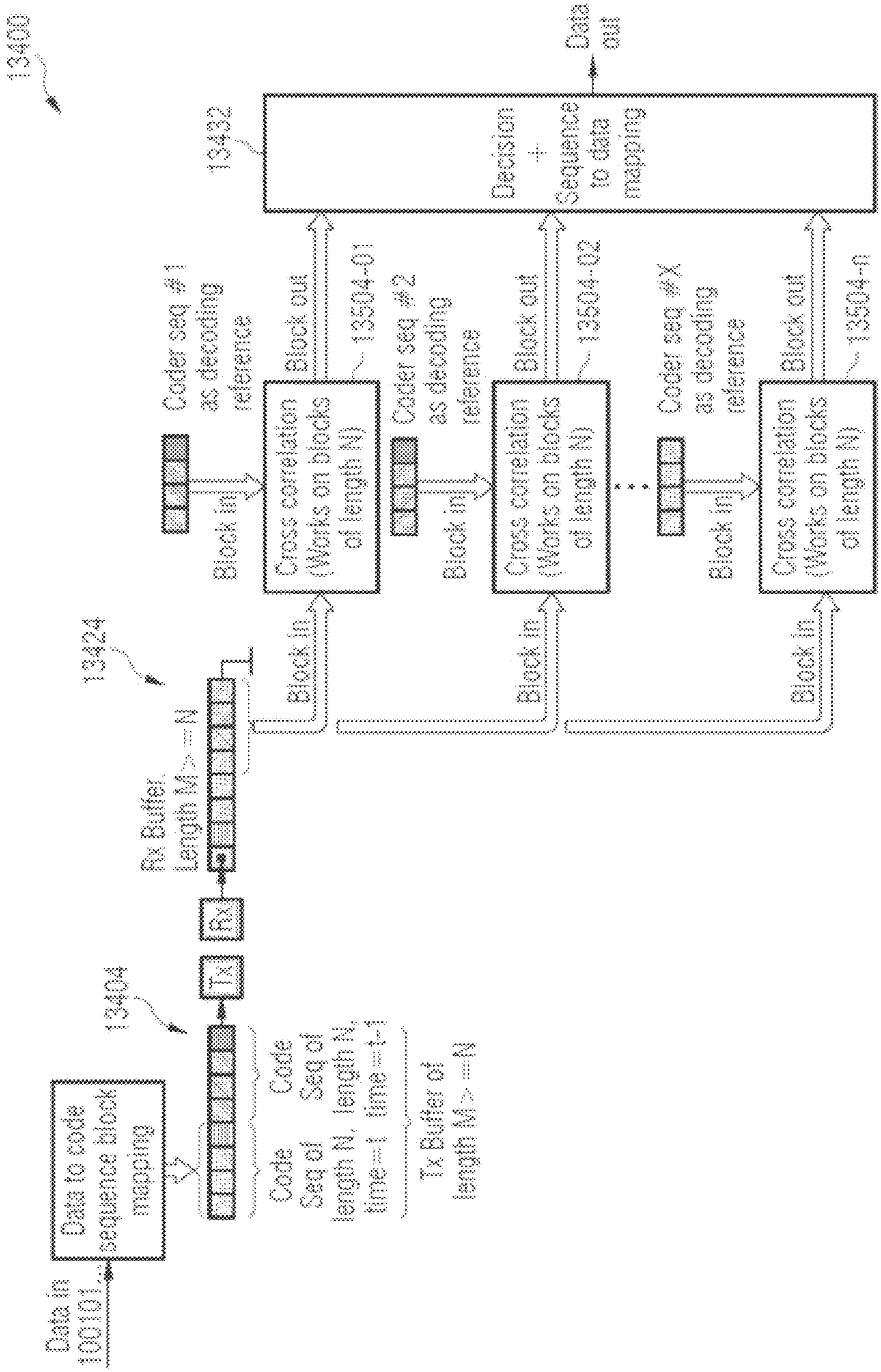
Figure 135D:
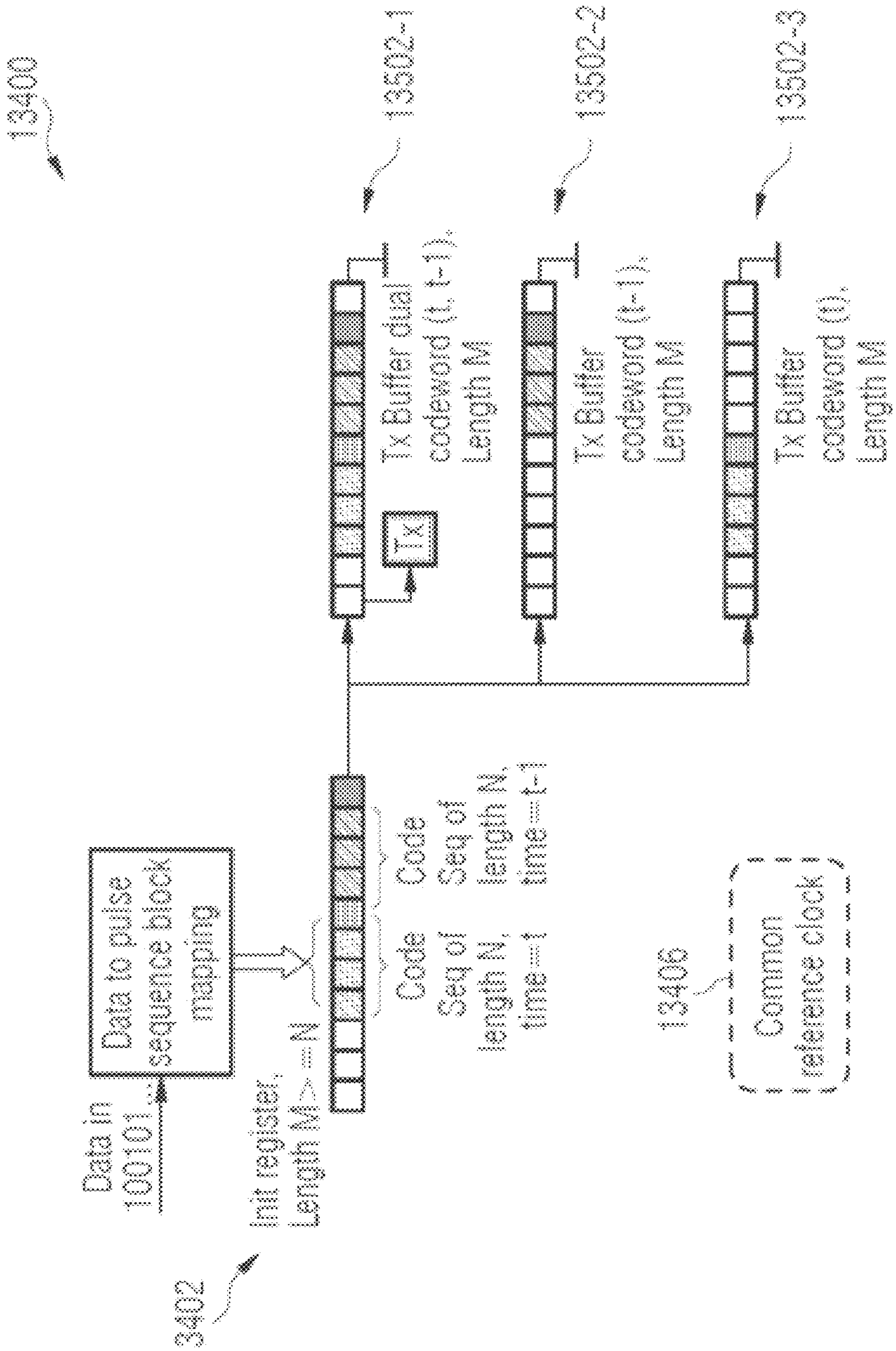
Figure 135E:
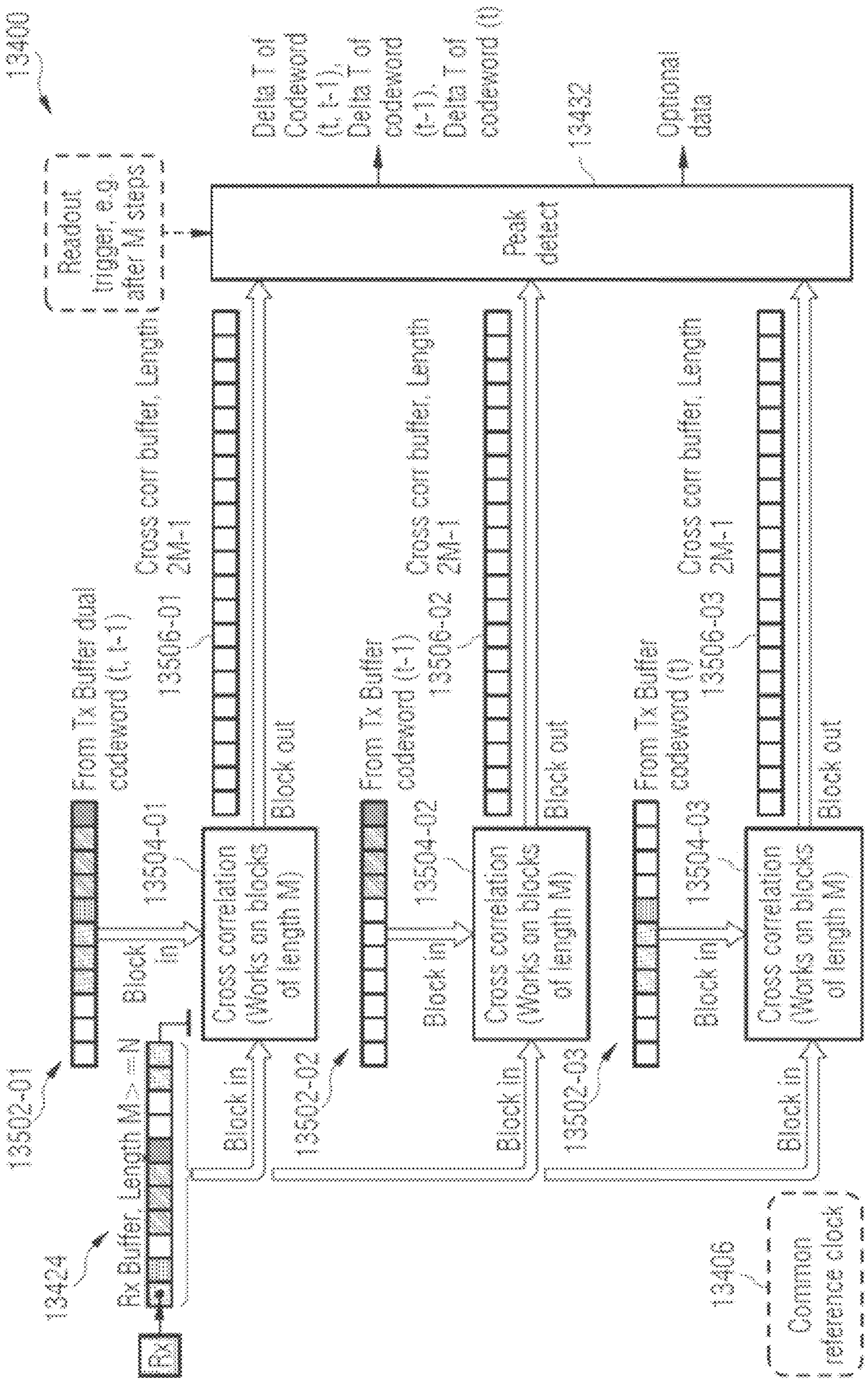
Figure 135F:
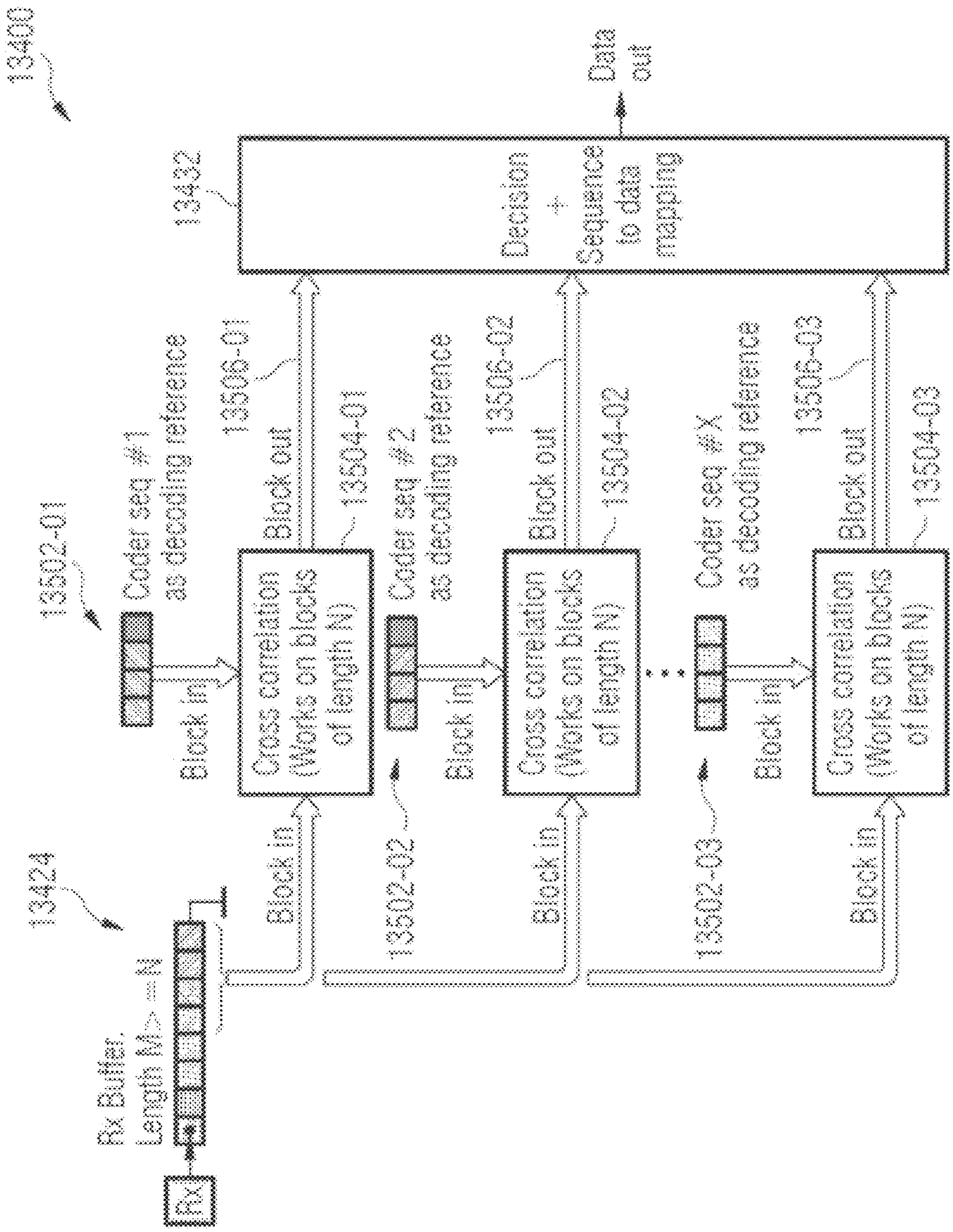
Figure 135G:
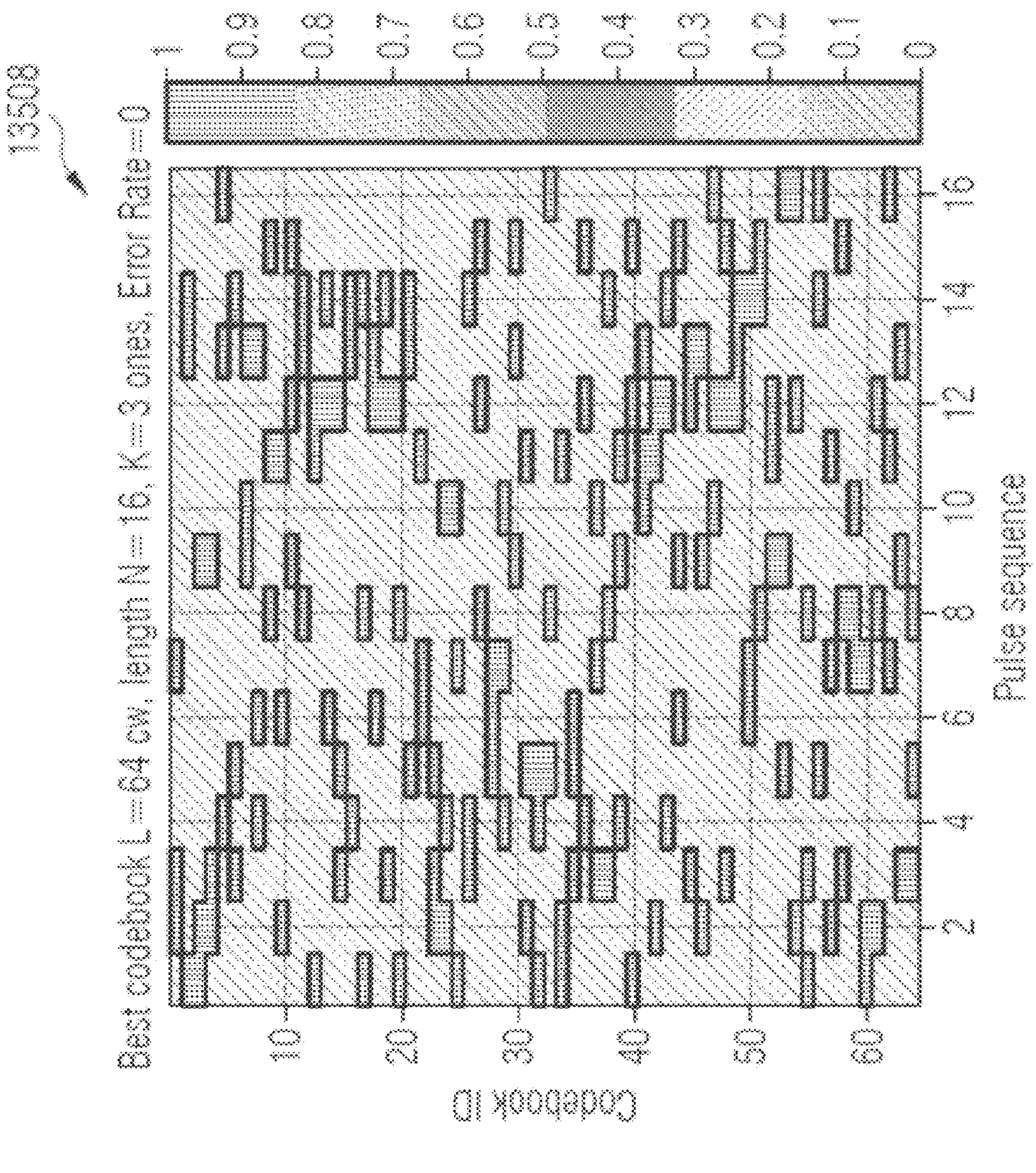

FIG. 135G shows a codebook in a schematic representation in accordance with various embodiments.

FIG. 136A to FIG. 136D show each one or more indicator is vectors in a schematic representation in accordance with various embodiments.

Figure 137:
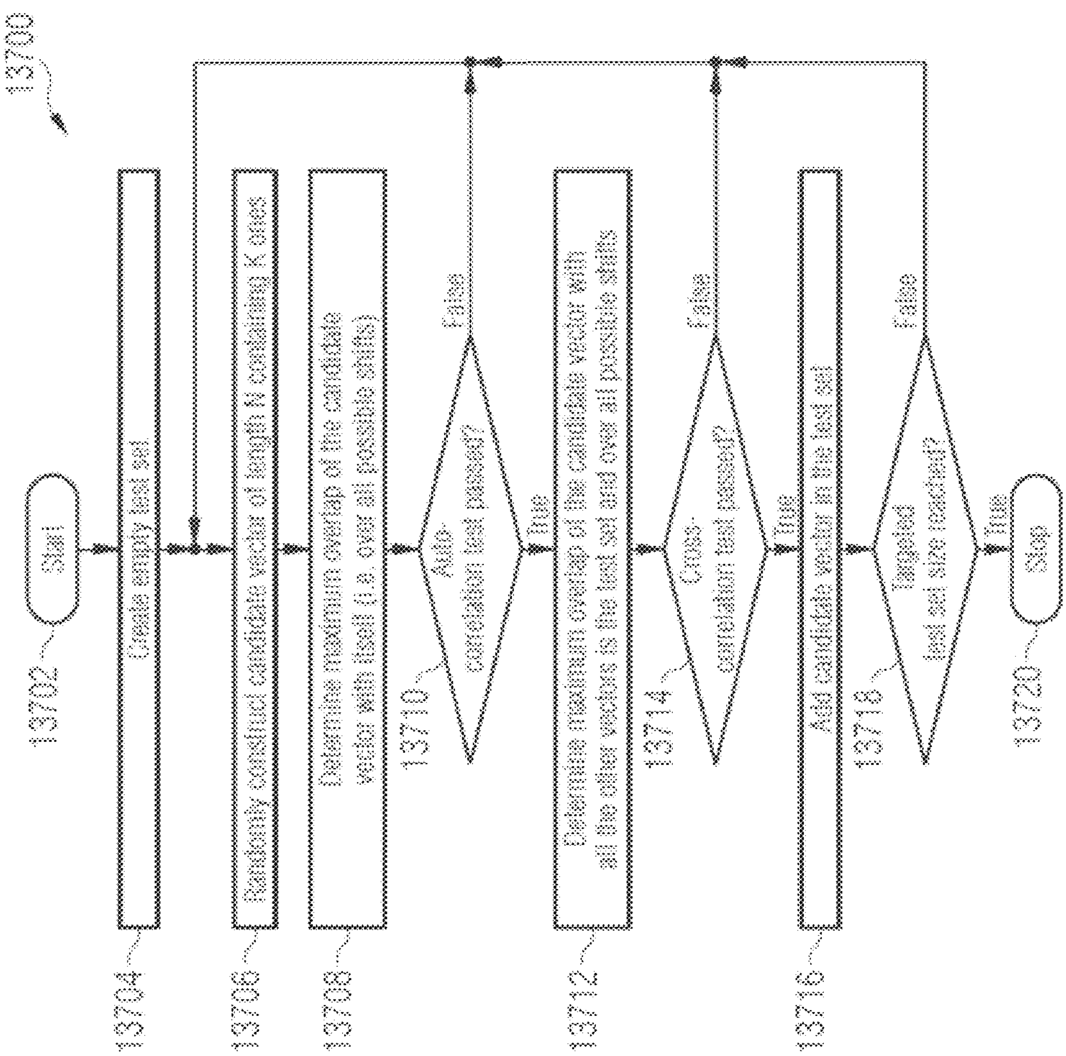

FIG. 137 shows a flow diagram of an algorithm in accordance with various embodiments.

Figure 138:
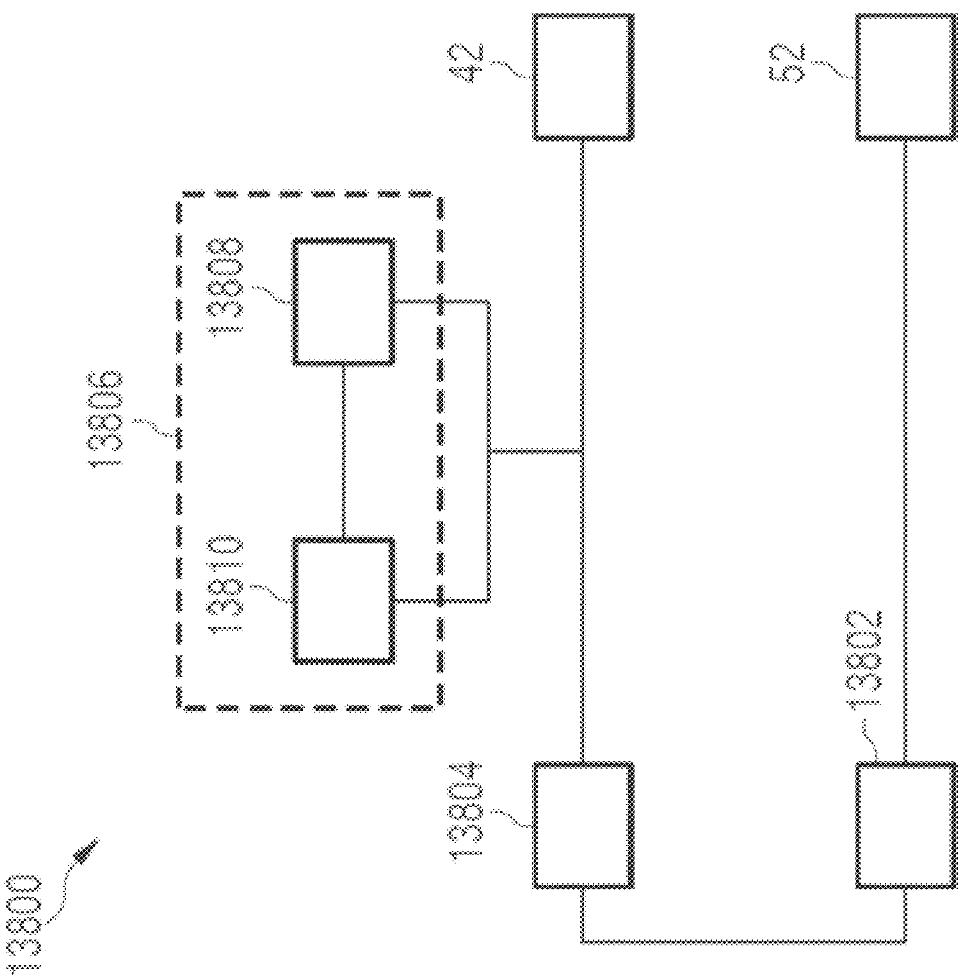

FIG. 138 shows a portion of a ranging system in a schematic view in accordance with various embodiments.

Figure 139A:
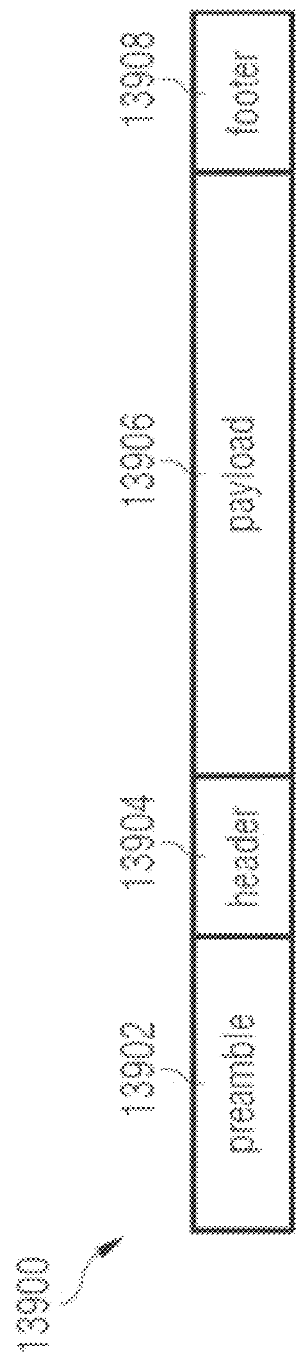

FIG. 139A and FIG. 1396 show each the structure of a frame in a schematic representation in accordance with various embodiments.

Figure 139B:
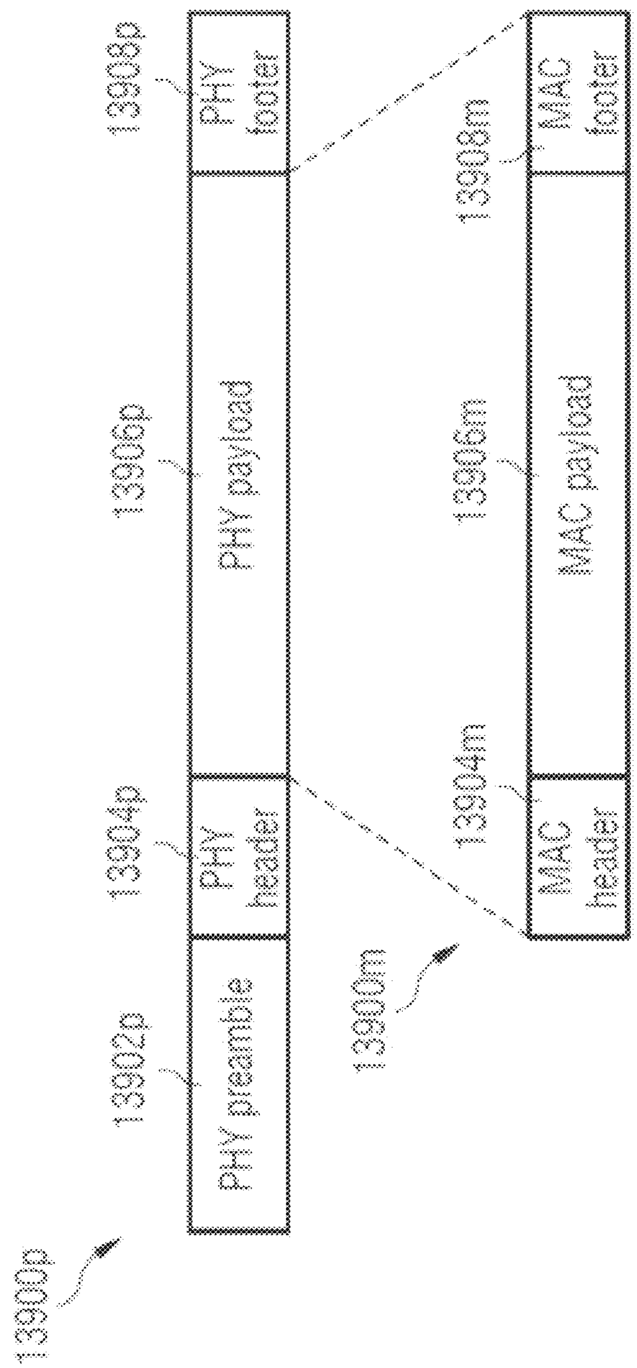
Figure 139C:
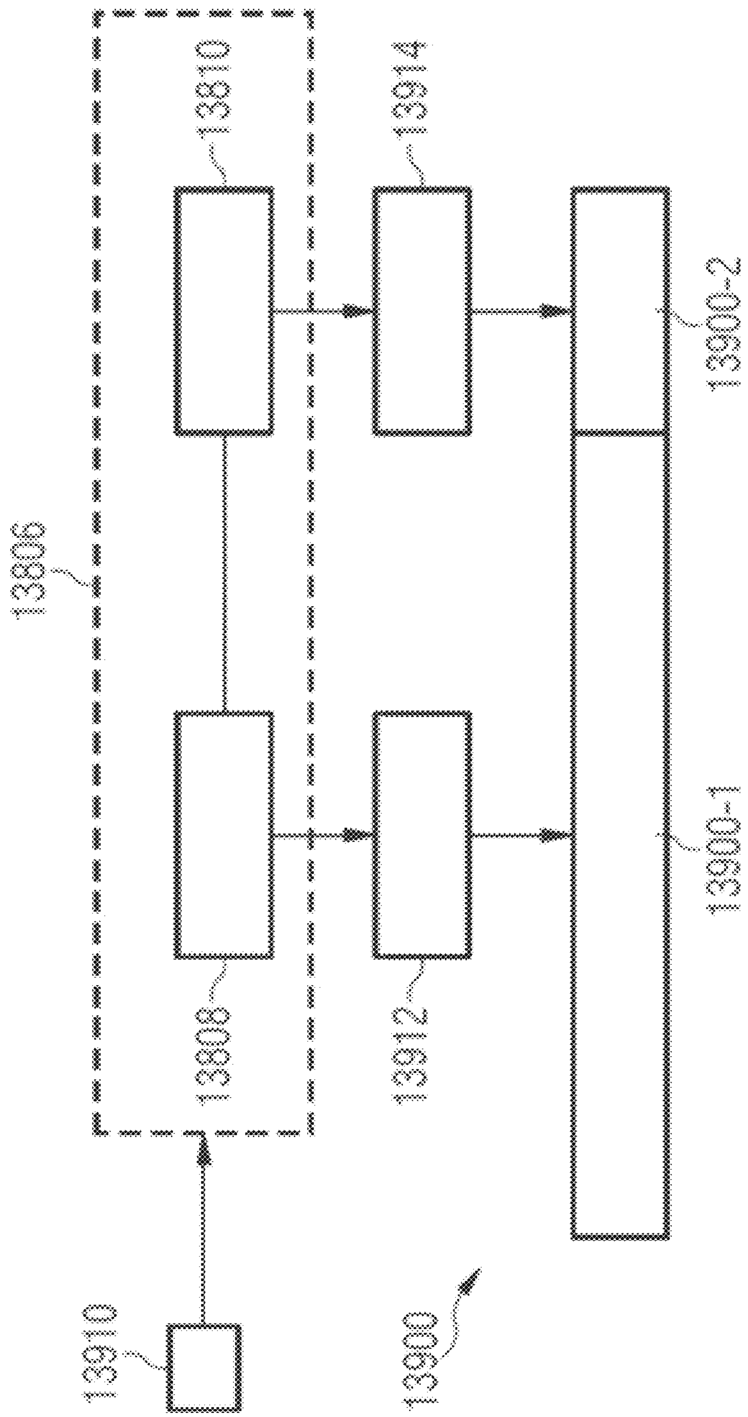

FIG. 139C shows an operation of the ranging system in relation to a frame in a schematic representation in accordance with various embodiments.

Figure 140A:
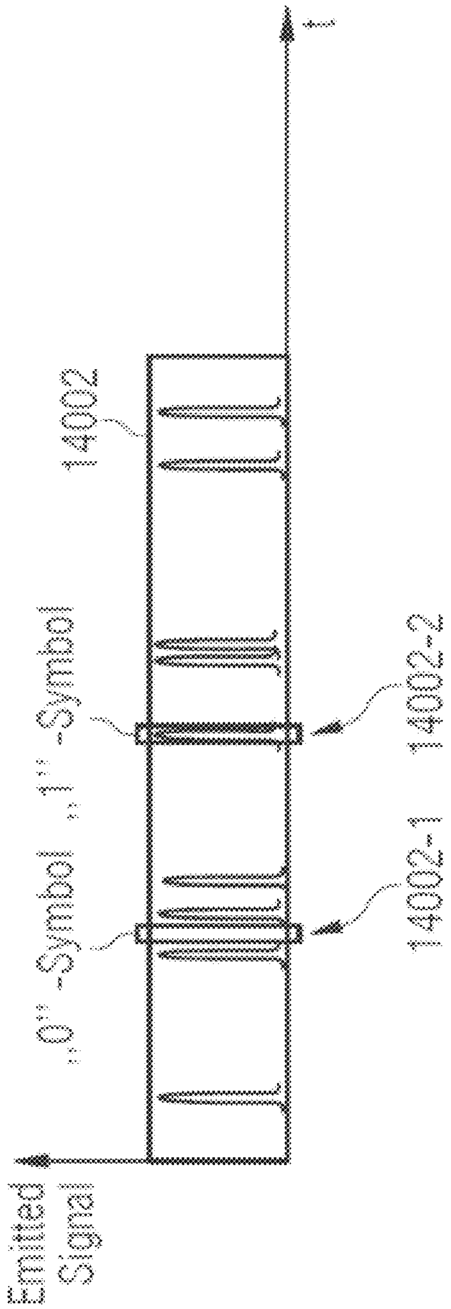

FIG. 140A shows a time-domain representation of a frame in a schematic view in accordance with various embodiments.

Figure 140B:
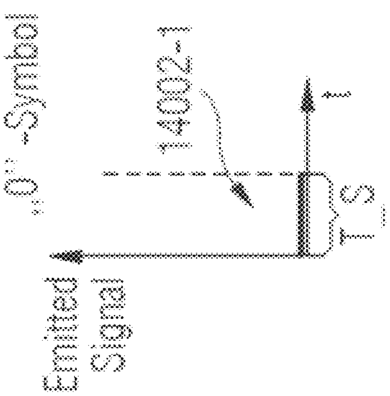
Figure 140C:
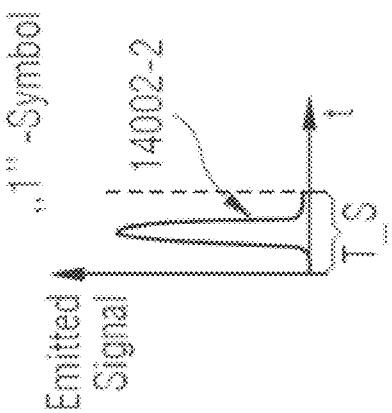

FIG. 140B and FIG. 140C show each a time-domain representation of a frame symbol in a schematic view in accordance with various embodiments.

Figure 140D:
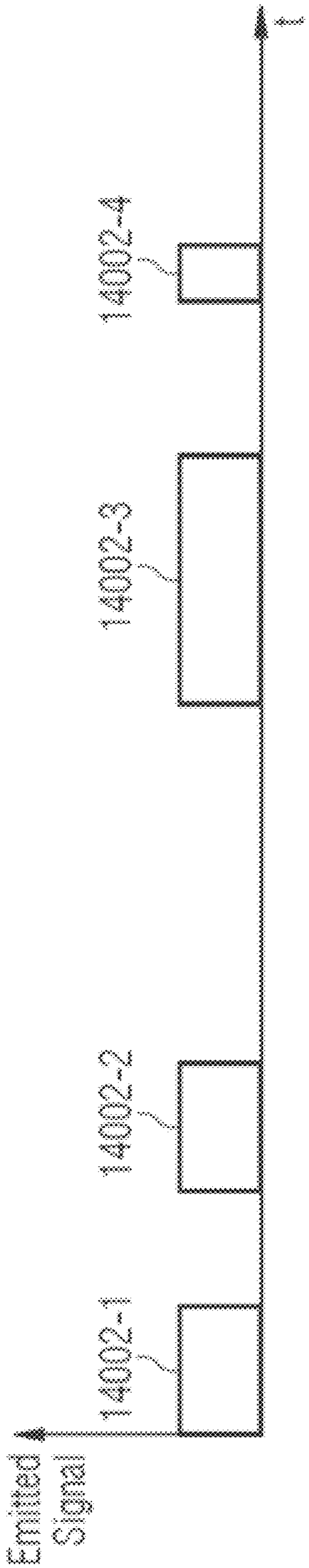

FIG. 140D shows a time-domain representation of multiple frames in a schematic view in accordance with various embodiments.

Figure 141A:
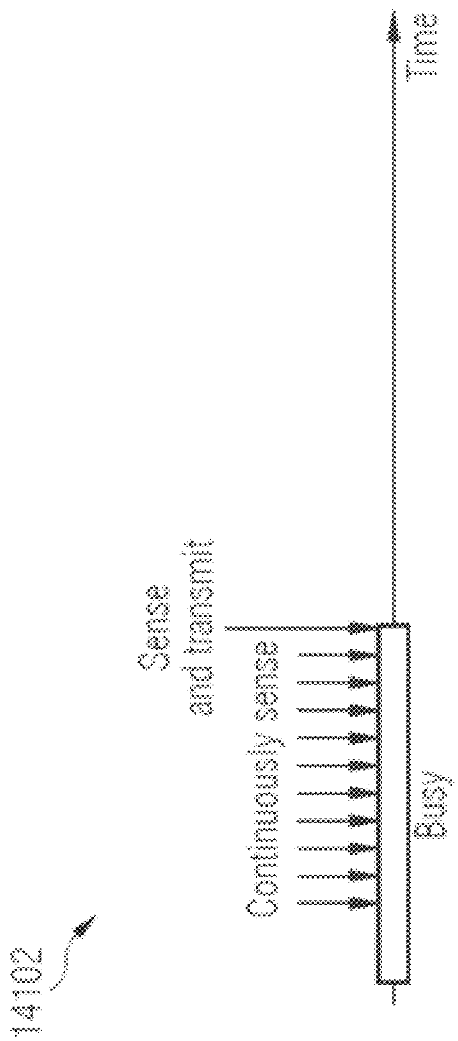

FIG. 141A shows a graph related to a 1-persistent light emission scheme in accordance with various embodiments.

Figure 141B:
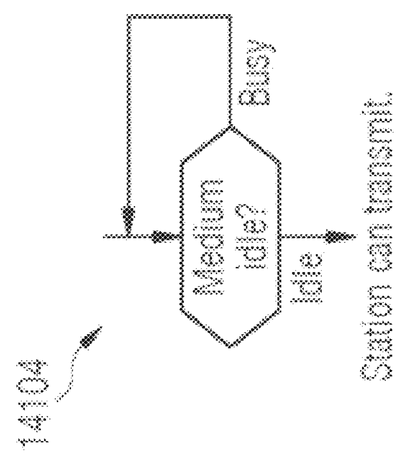

FIG. 141B shows a flow diagram related to a 1-persistent light emission scheme in accordance with various embodiments.

Figure 141C:
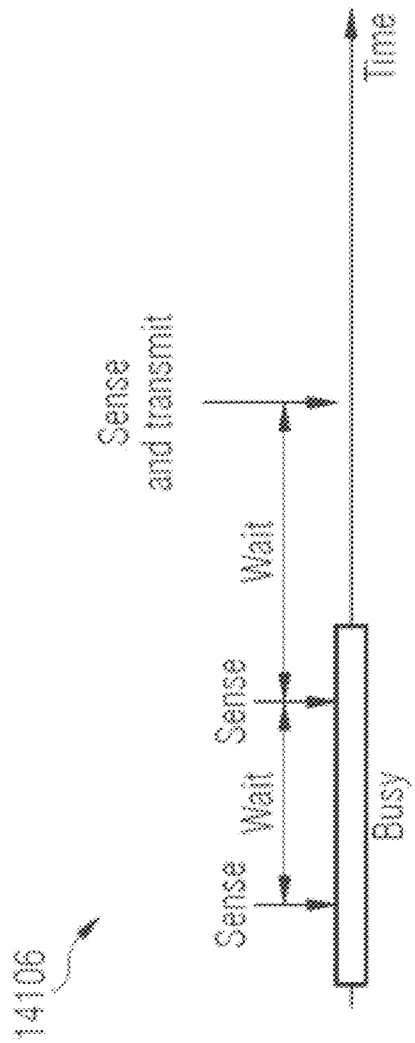

FIG. 141C shows a graph related to a non-persistent light emission scheme in accordance with various embodiments.

Figure 141D:
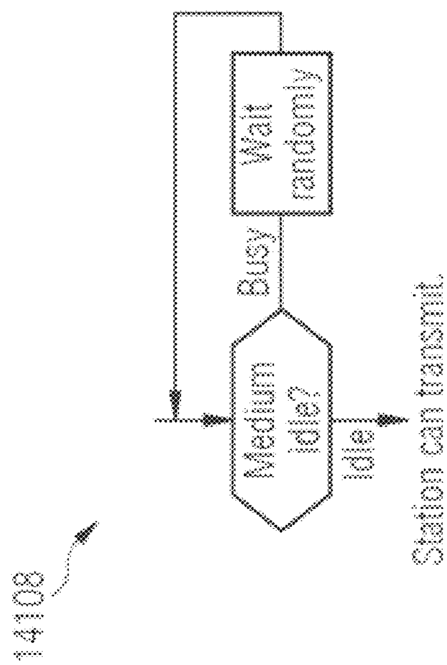

FIG. 141D shows a flow diagram related to a non-persistent light emission scheme in accordance with various embodiments.

Figure 141E:
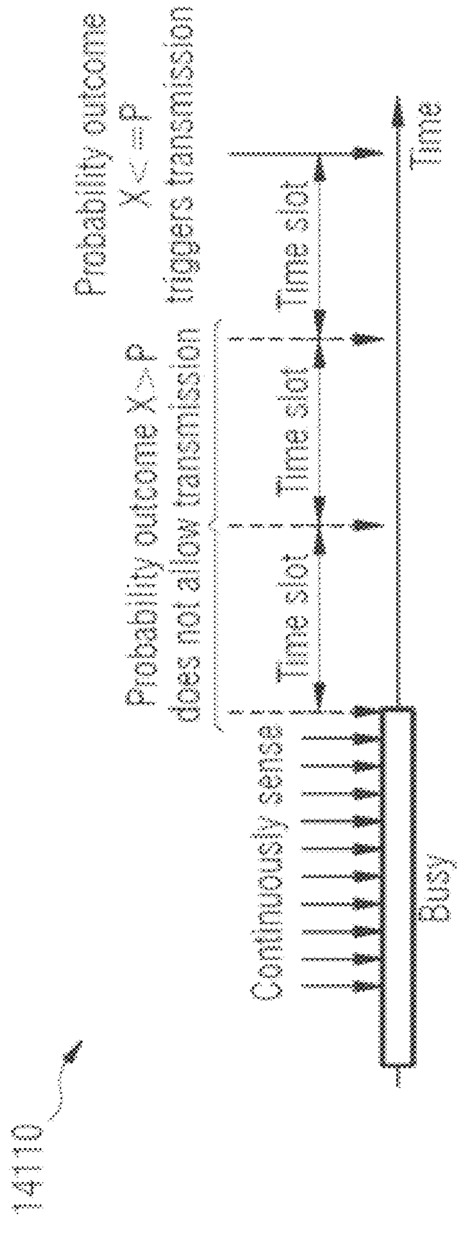

FIG. 141E shows a graph related to a p-persistent light emission scheme in accordance with various embodiments.

Figure 141F:
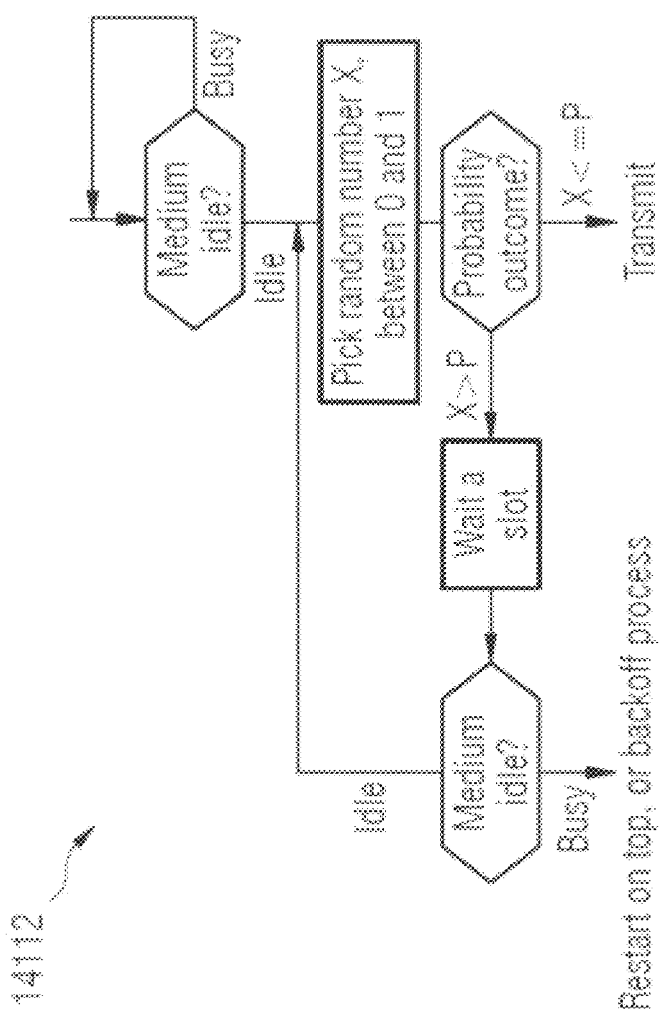

FIG. 141F shows a flow diagram related to a p-persistent light emission scheme in accordance with various embodiments.

Figure 141G:
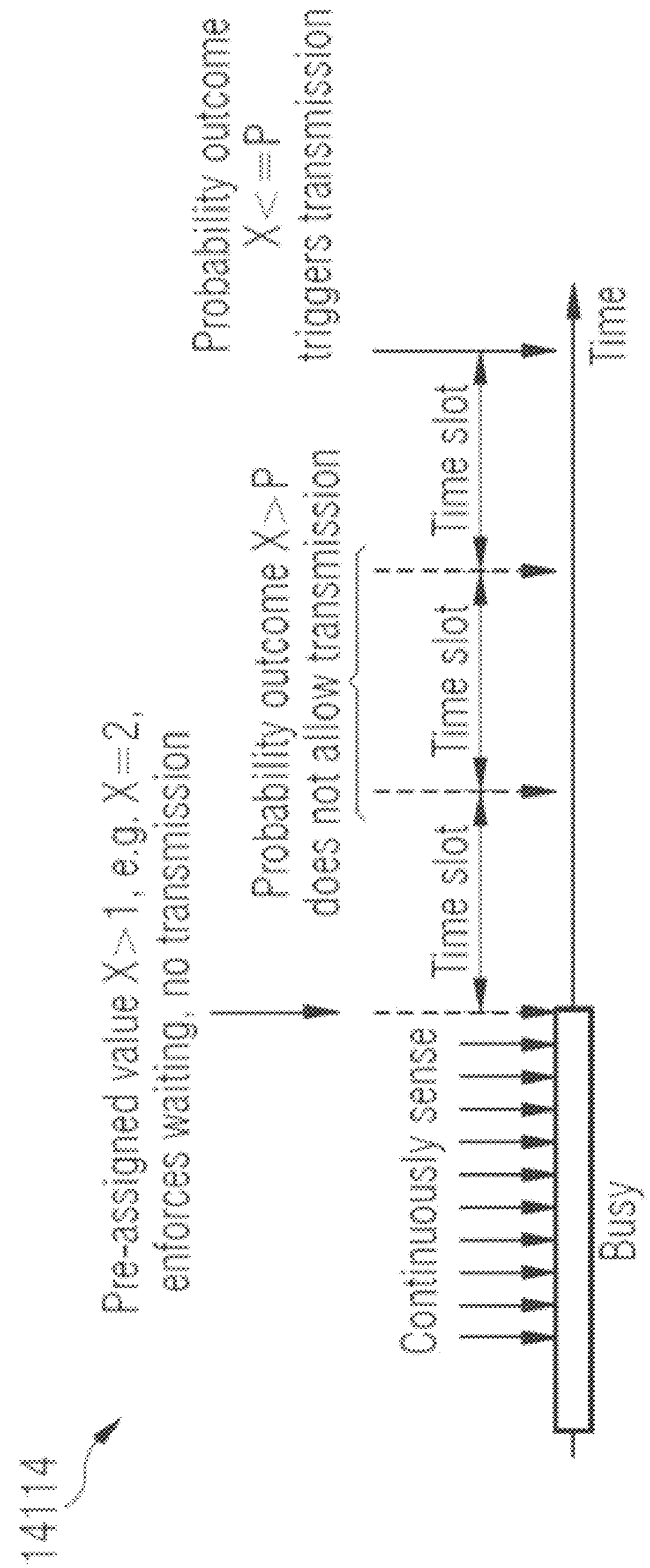

FIG. 141G shows a graph related to an enforced waiting time persistent light emission scheme in accordance with various embodiments.

Figure 141H:
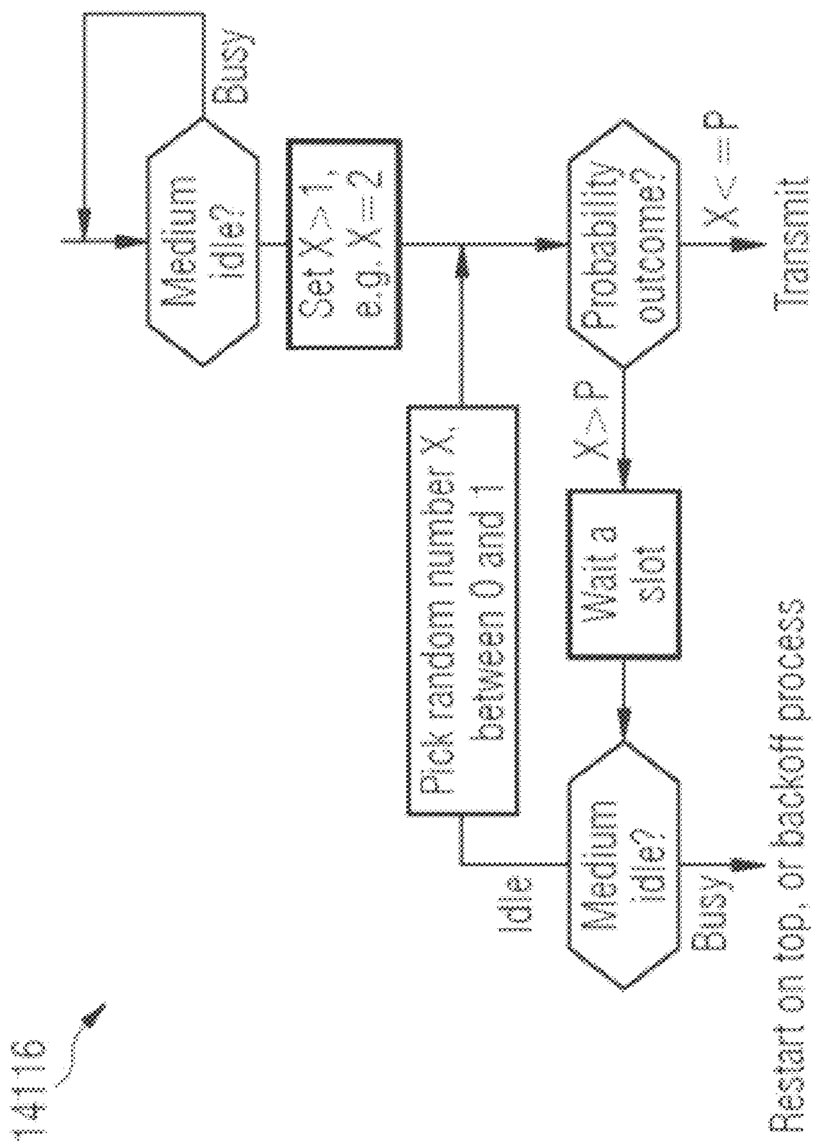

FIG. 141H shows a flow diagram related to an enforced waiting time persistent light emission scheme in accordance with various embodiments.

Figure 142A:
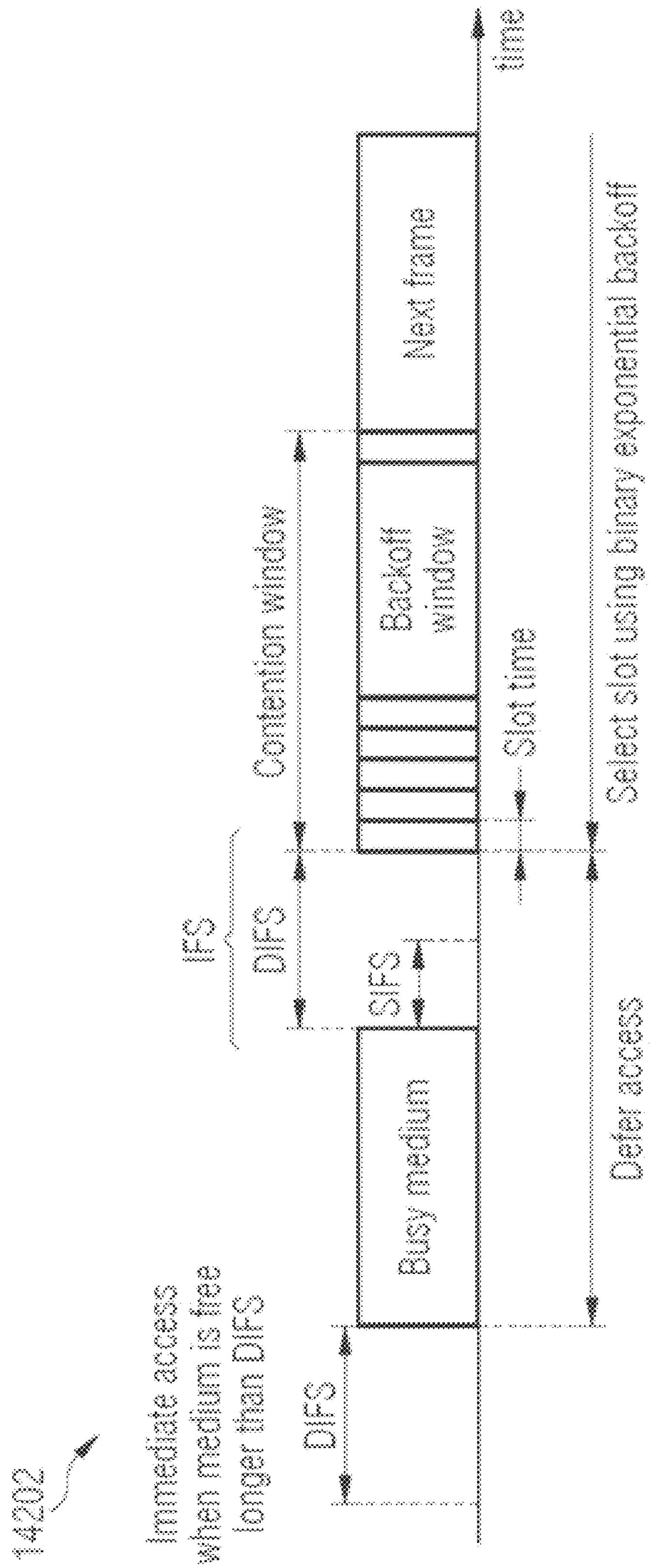

FIG. 142A shows a graph related to a light emission scheme including a back-off time in accordance with various embodiments.

Figure 142B:
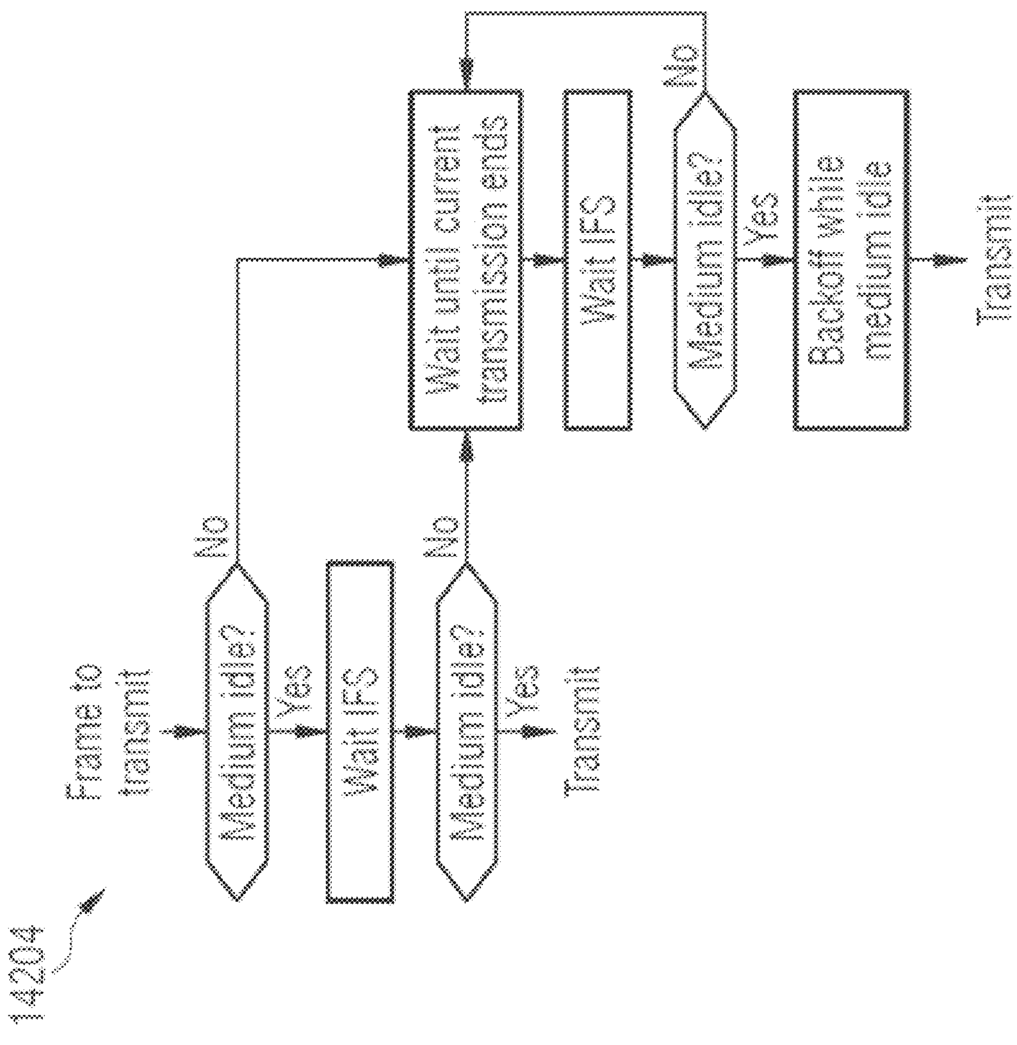

FIG. 142B shows a flow diagram related to a light emission scheme including a back-off time in accordance with various embodiments.

Figure 143A:
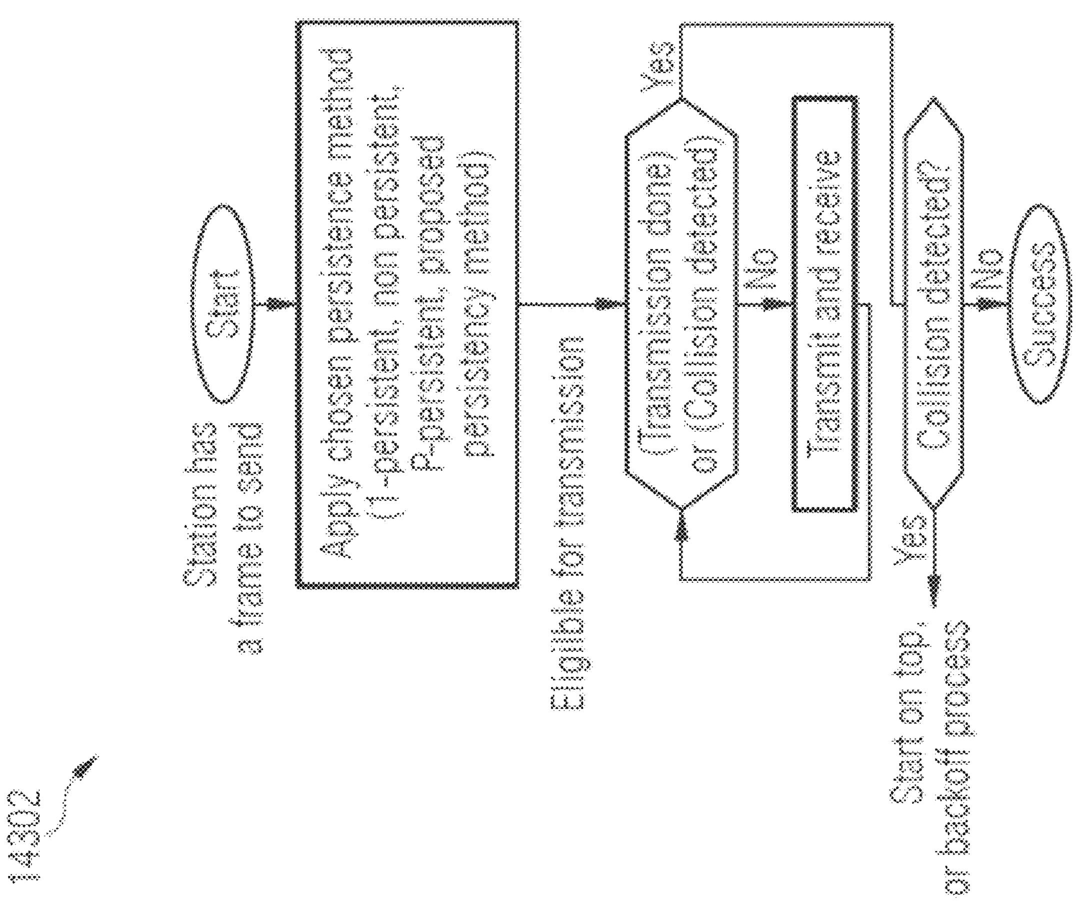

FIG. 143A shows a flow diagram related to a light emission scheme including collision detection in accordance with various embodiments.

Figure 143B:
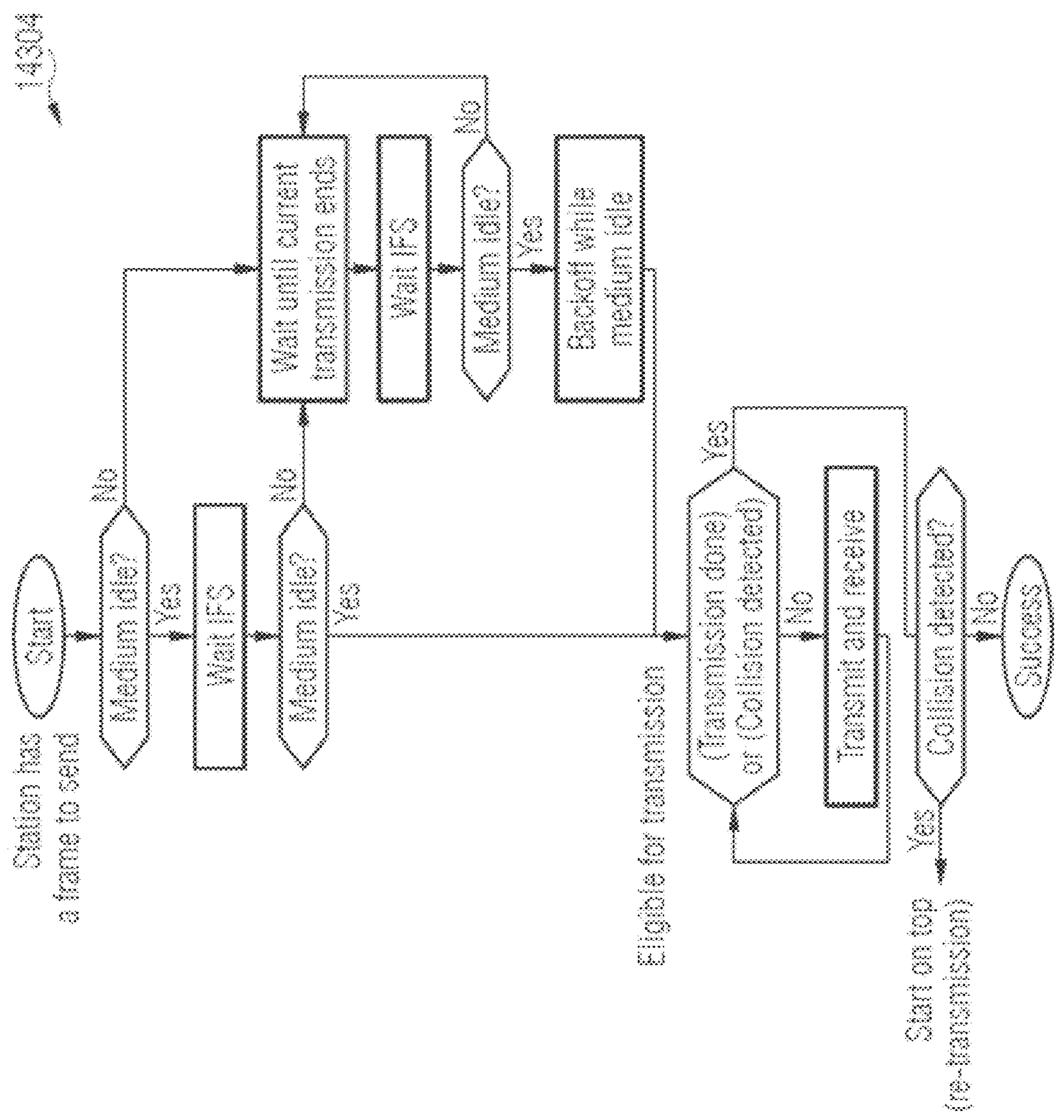

FIG. 143B shows a flow diagram related to a light emission scheme including a back-off time and collision detection in accordance with various embodiments.

Figure 144:
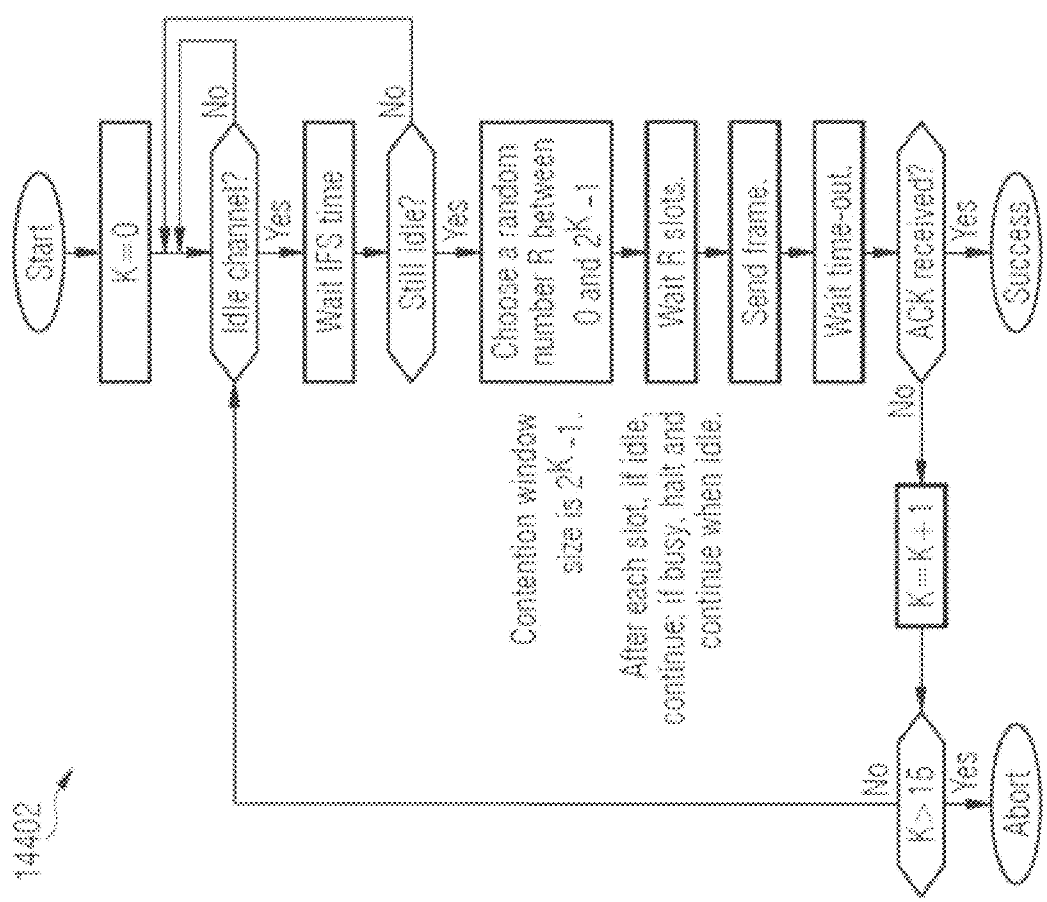

FIG. 144 shows a flow diagram related to a light emission scheme including an error detection protocol in accordance with various embodiments.

Figure 145B:
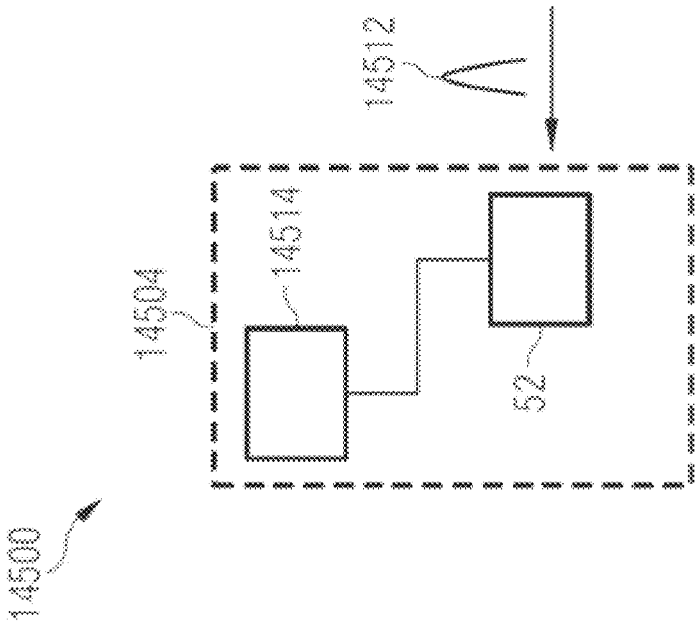
Figure 145A:
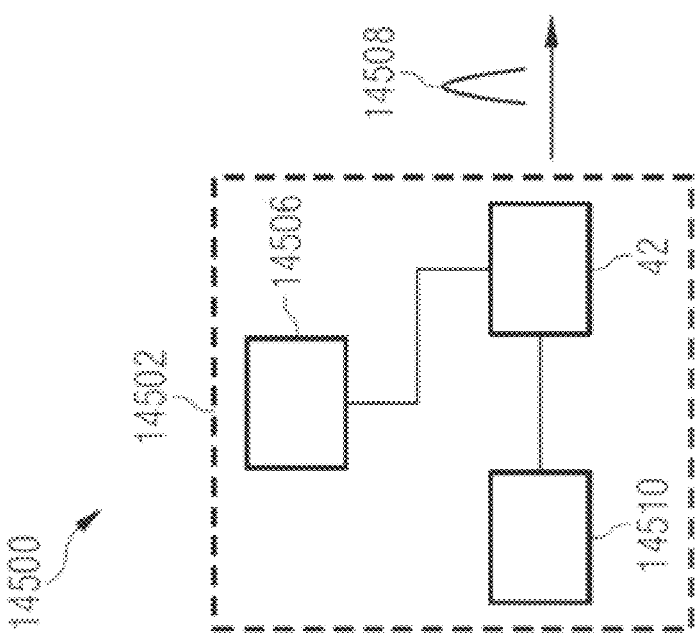

FIG. 145A and FIG. 145B show each a ranging system in a schematic representation in accordance with various embodiments.

Figure 145C:
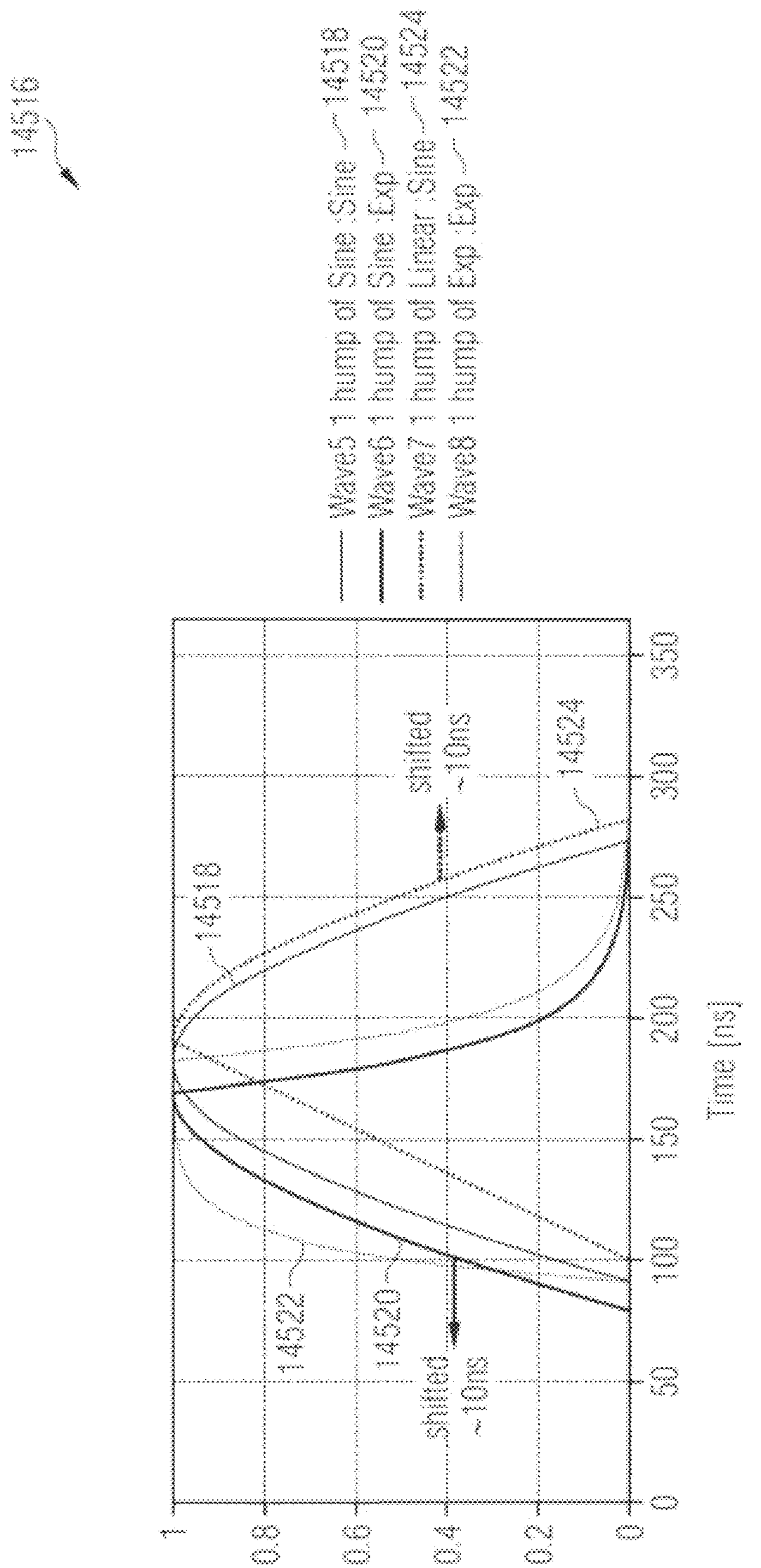

FIG. 145C shows a graph including a plurality of waveforms in accordance with various embodiments.

Figure 145D:
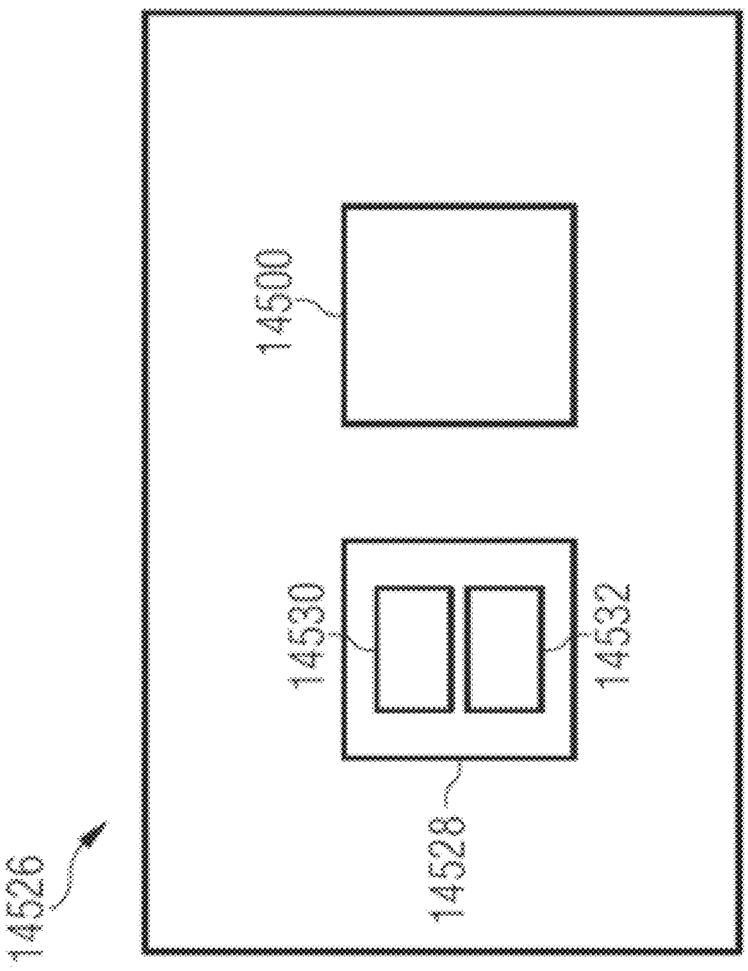

FIG. 145D shows a communication system in a schematic representation in accordance with various embodiments.

Figure 145F:
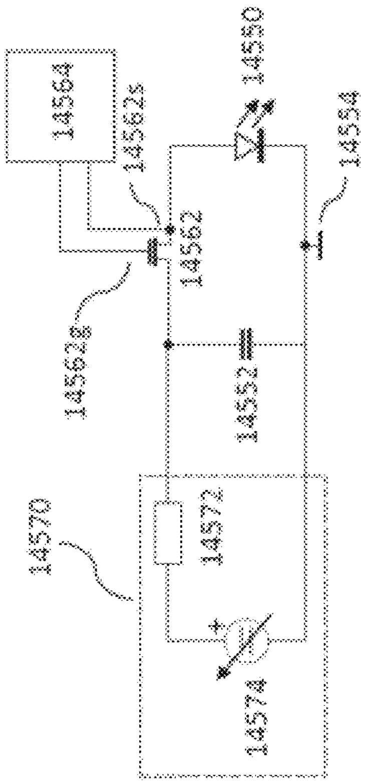
Figure 145E:
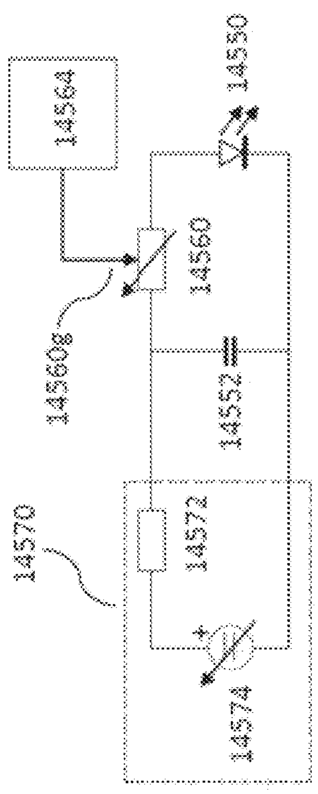
Figure 145G:
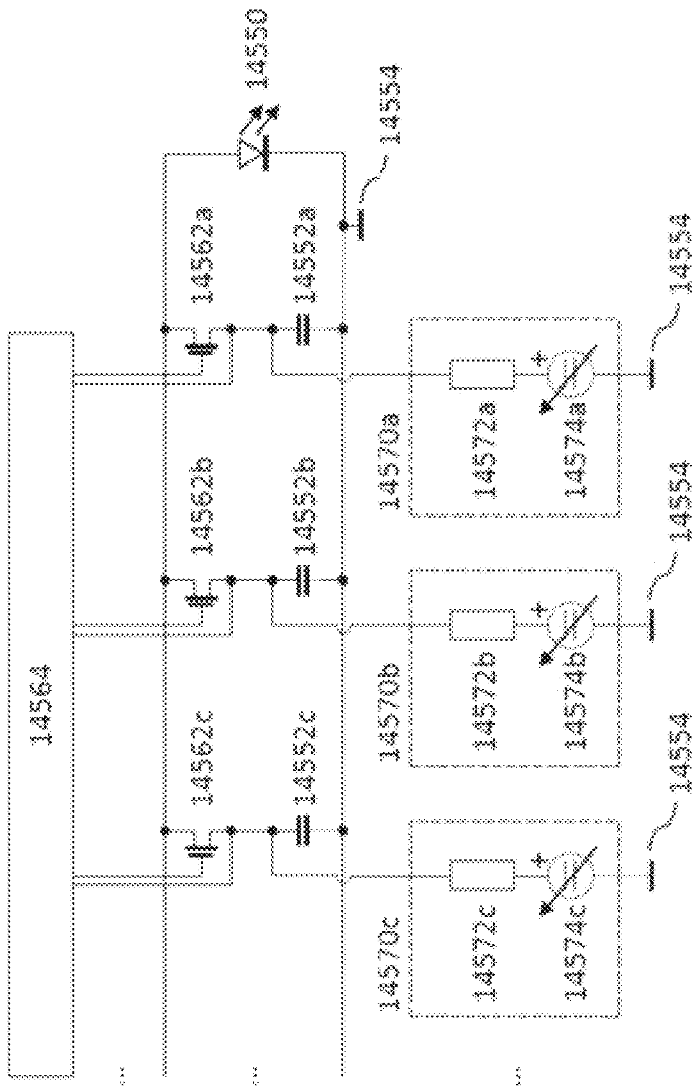

FIG. 145E to FIG. 145G show each an electrical diagram in accordance with various embodiments.

Figure 146:
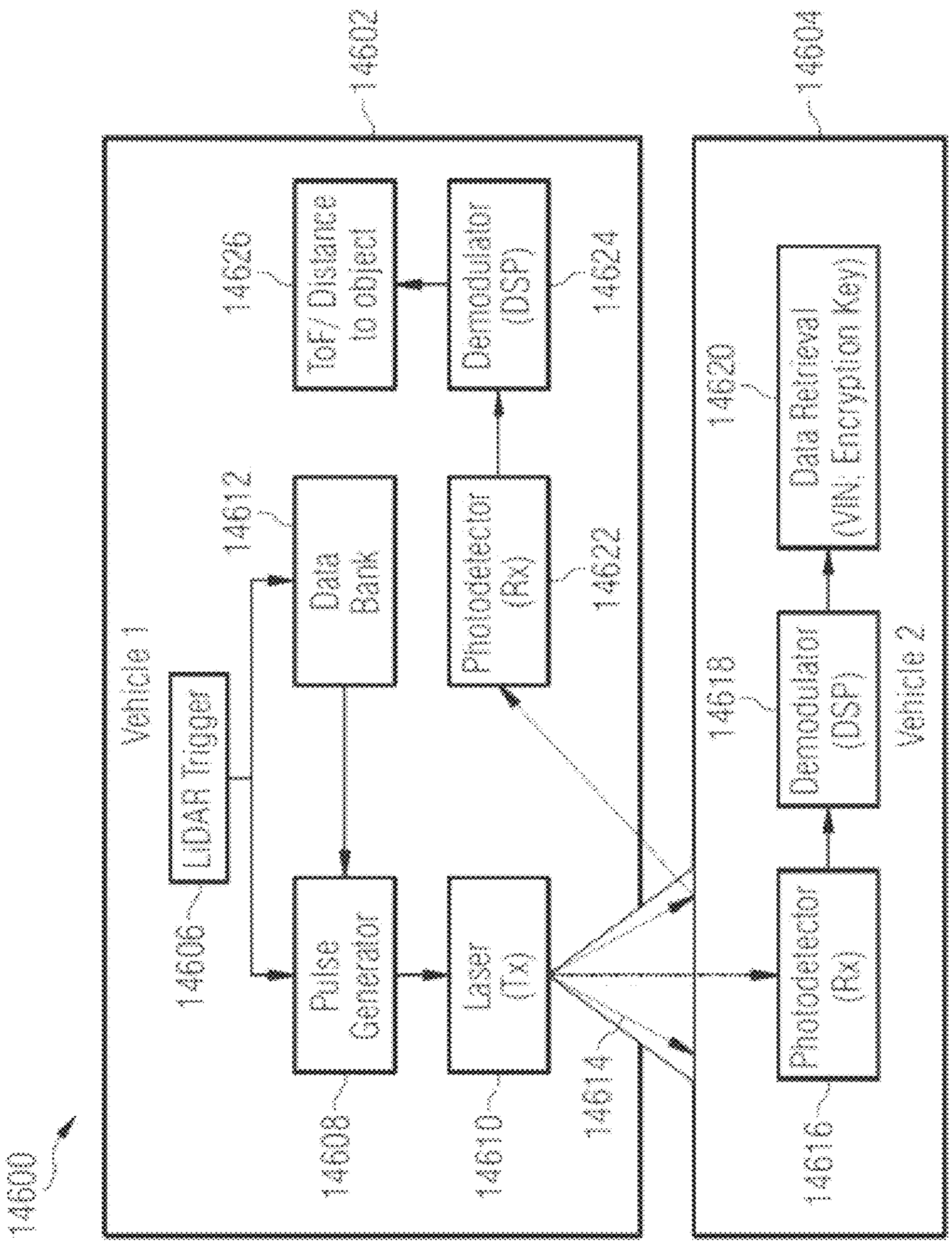

FIG. 146 shows a system including two vehicles in a schematic representation in accordance with various embodiments.

Figure 147A:
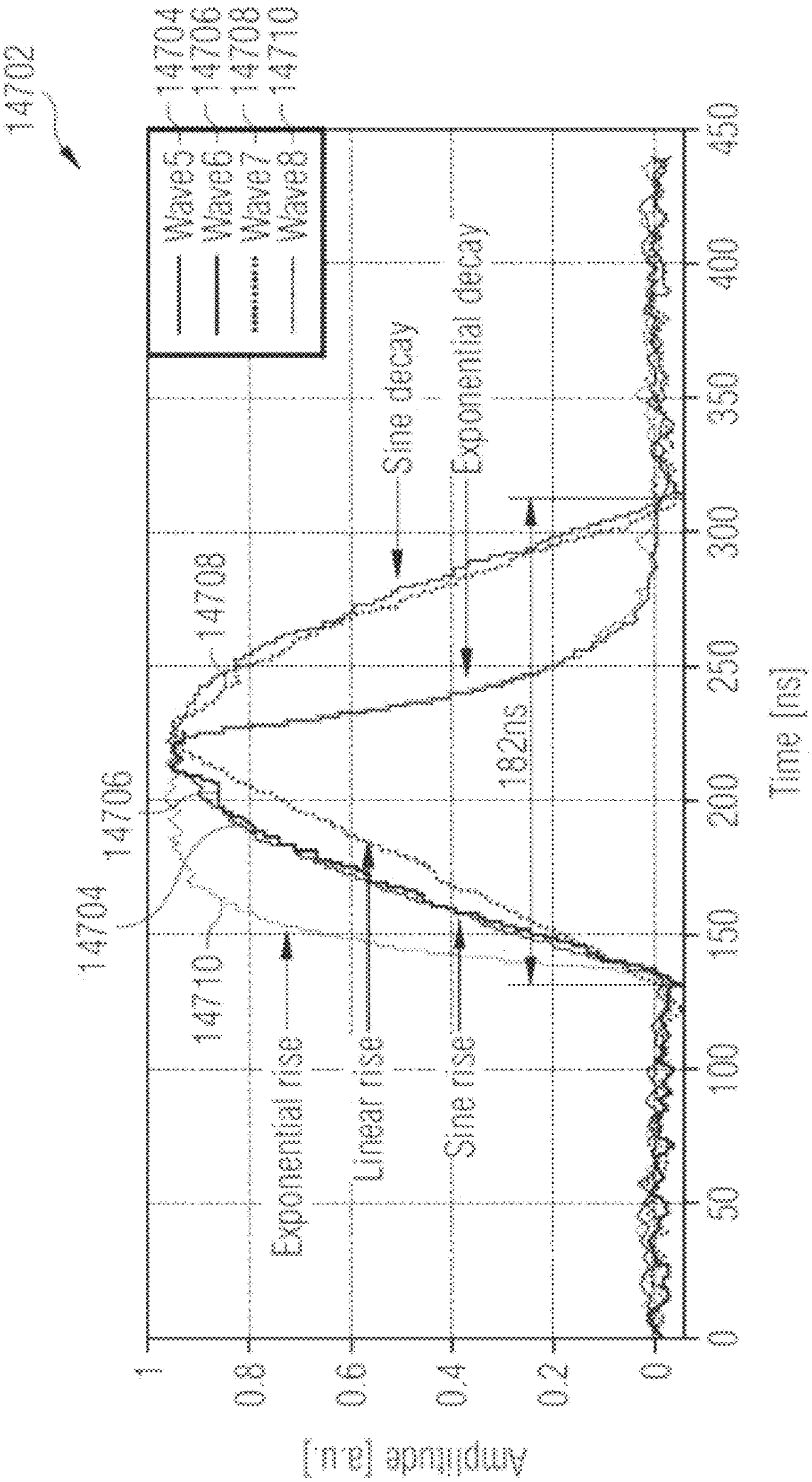

FIG. 147A shows a graph in the time-domain including a plurality of waveforms in accordance with various embodiments.

Figure 147B:
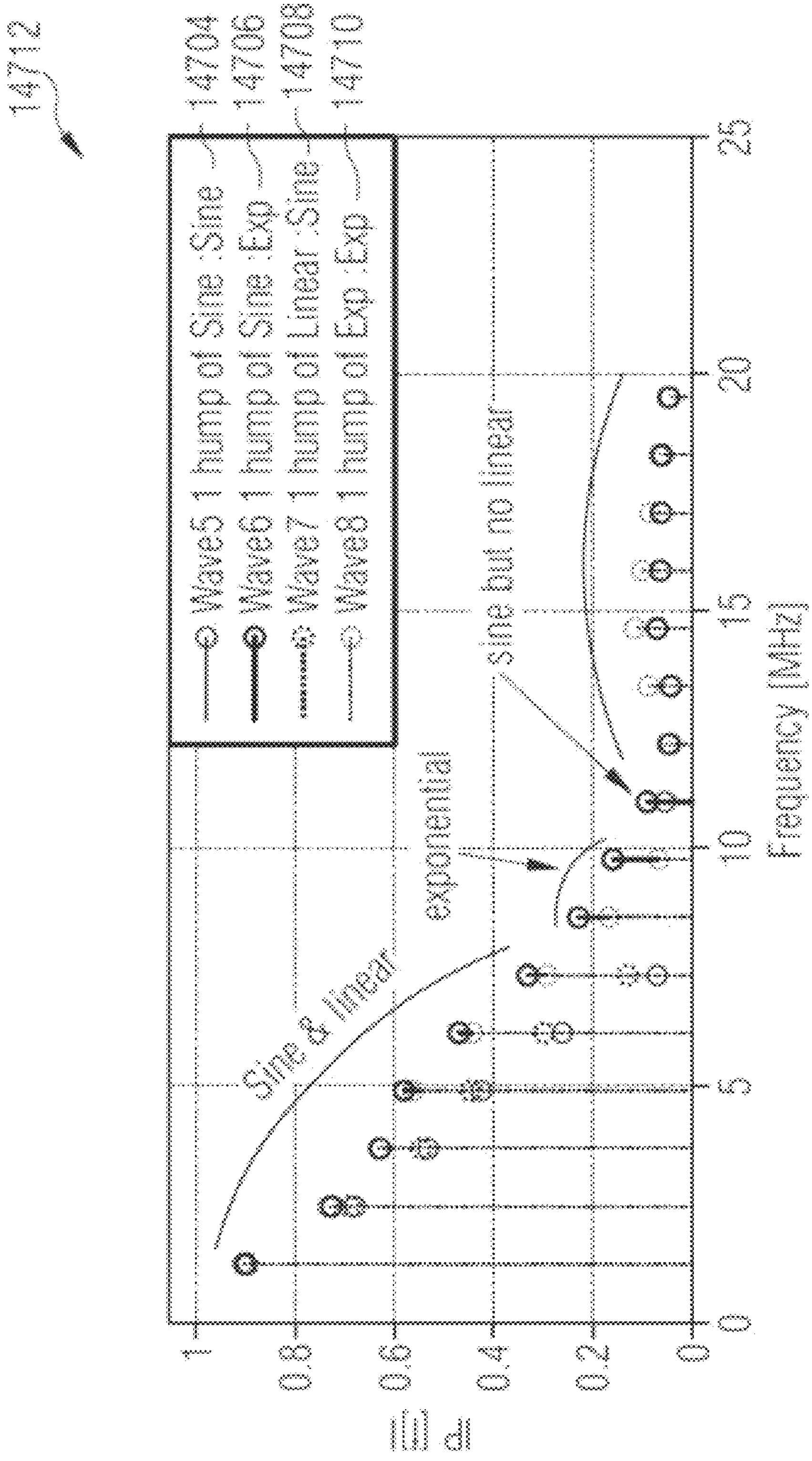

FIG. 147B shows a graph in the frequency-domain including a plurality of frequency-domain signals in accordance with various embodiments.

FIG. 147C shows a table describing a plurality of frequency-domain signals in accordance with various embodiments.

Figure 147D:
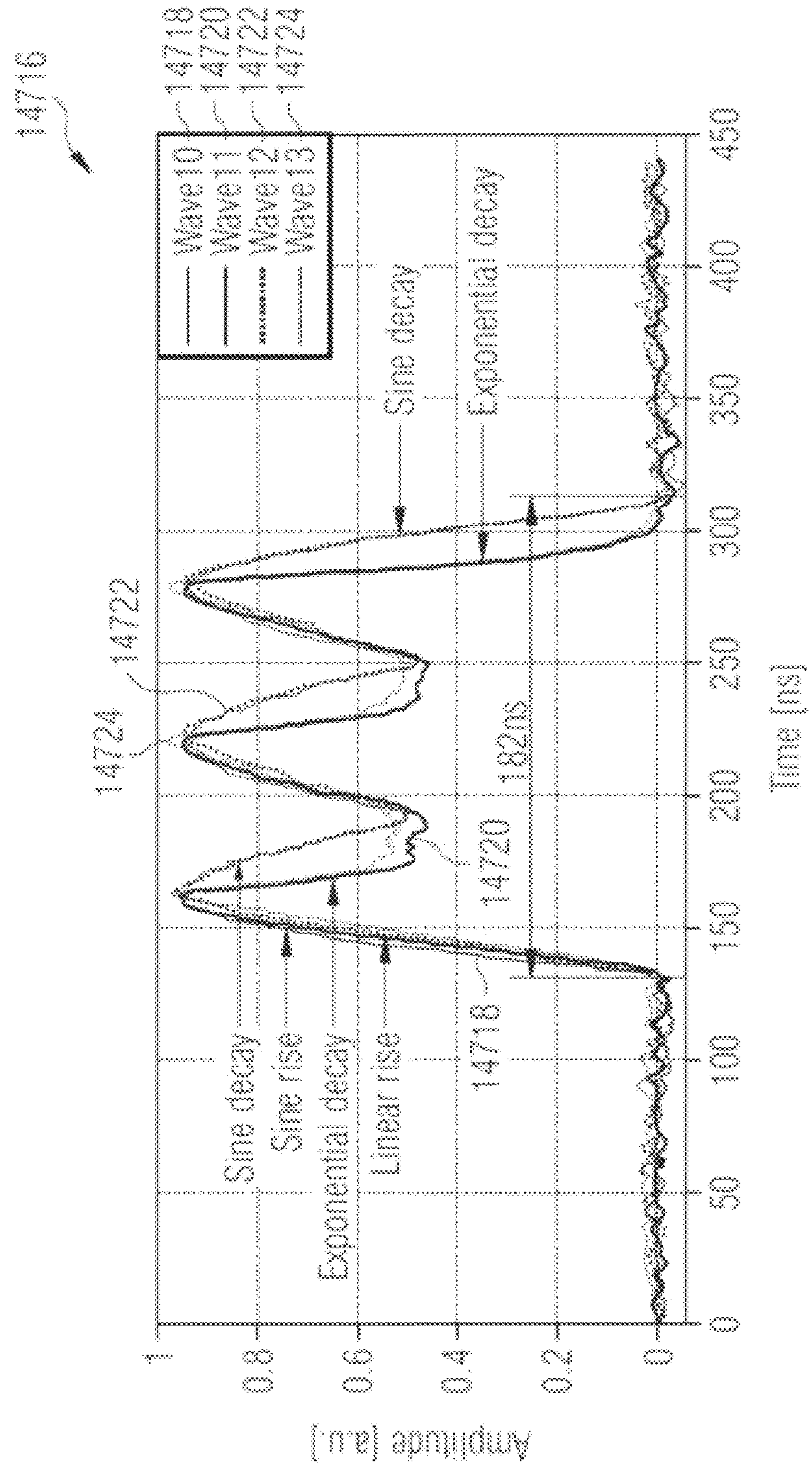

FIG. 147D shows a graph in the time-domain including a plurality of waveforms in accordance with various embodiments.

Figure 147E:
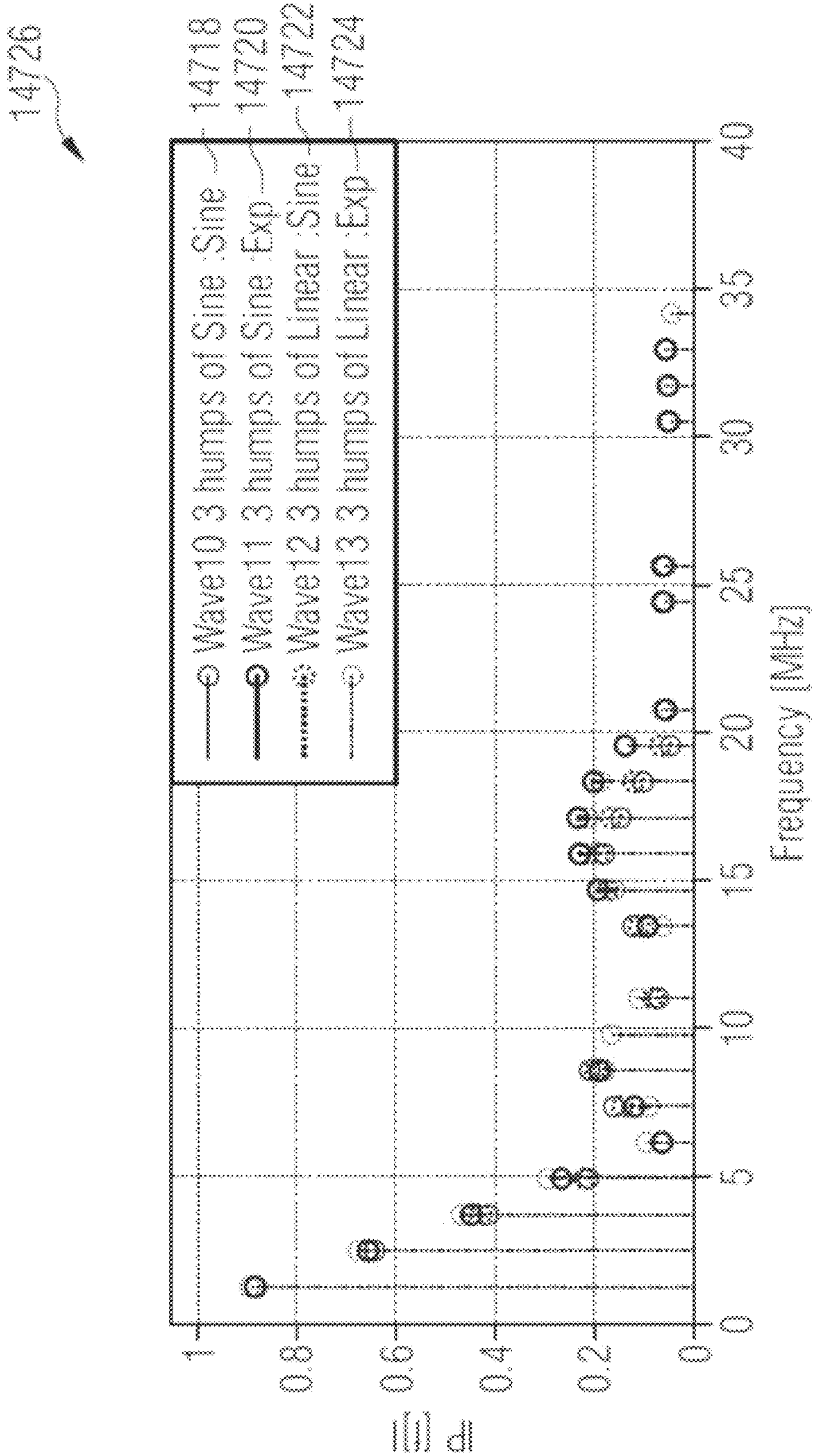

FIG. 147E shows a graph in the frequency-domain including a plurality of frequency-domain signals in accordance with various embodiments.

FIG. 147F shows a table describing a plurality of frequency-domain signals in accordance with various embodiments.

Figure 147G:
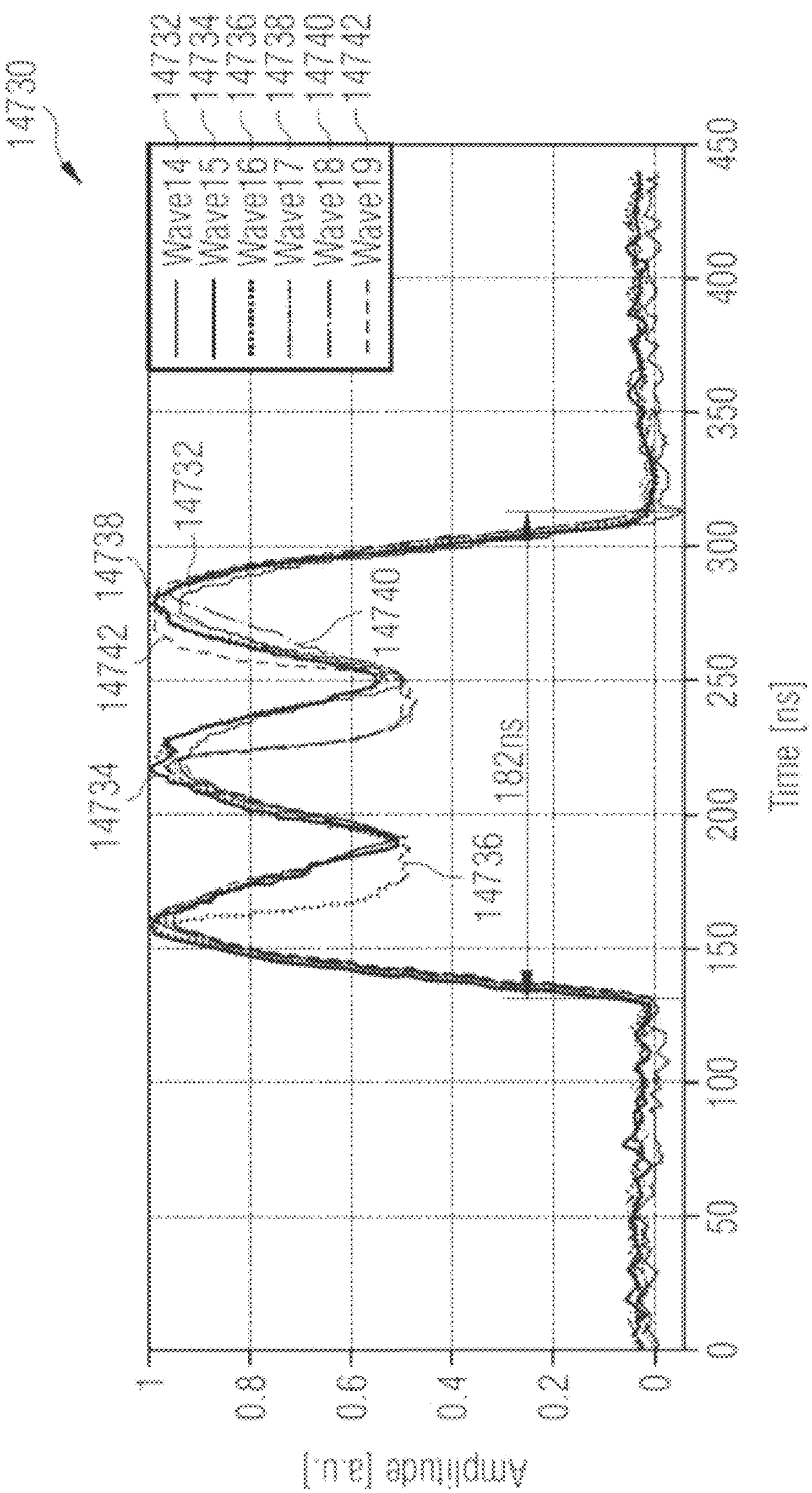

FIG. 147G shows a graph in the time-domain including a plurality of waveforms in accordance with various embodiments.

Figure 147H:
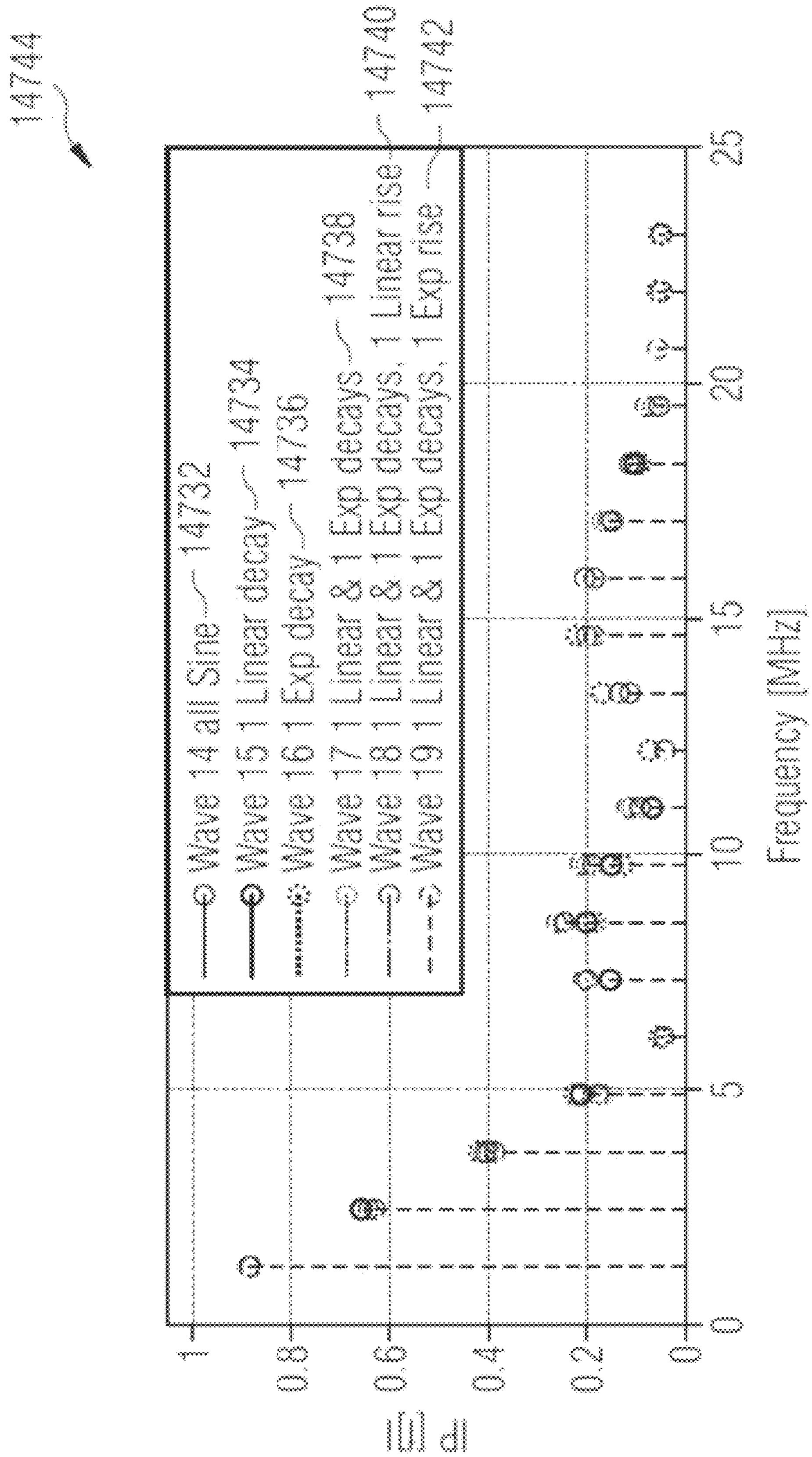

FIG. 147H shows a graph in the frequency-domain including a plurality of frequency-domain signals in accordance with various embodiments.

FIG. 147I shows a table describing a plurality of frequency-domain signals in accordance with various embodiments.

Figure 148A:
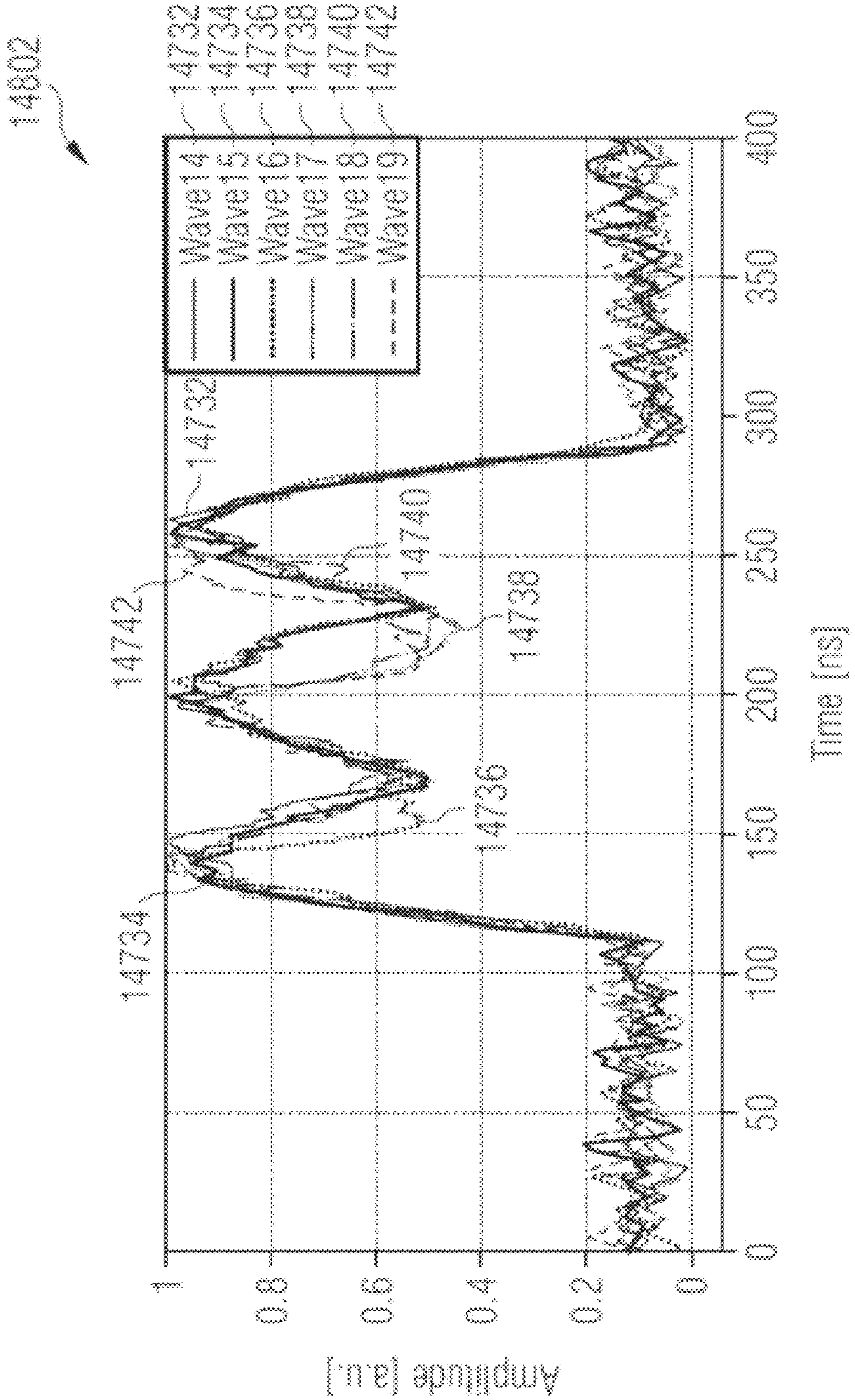

FIG. 148A shows a graph in the time-domain including a plurality of waveforms in accordance with various embodiments.

Figure 148B:
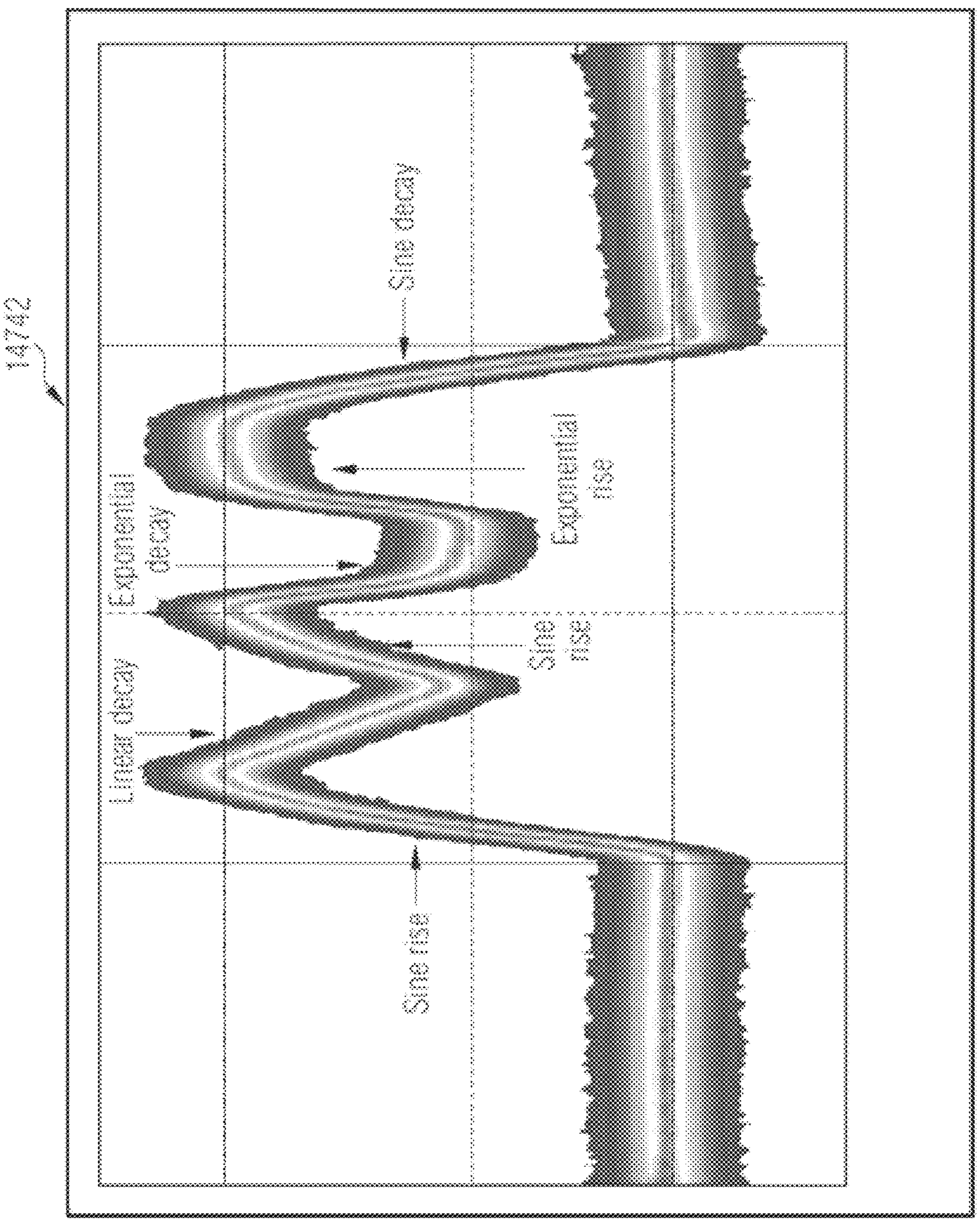

FIG. 148B shows an oscilloscope image including a waveform in accordance with various embodiments.

Figure 148C:
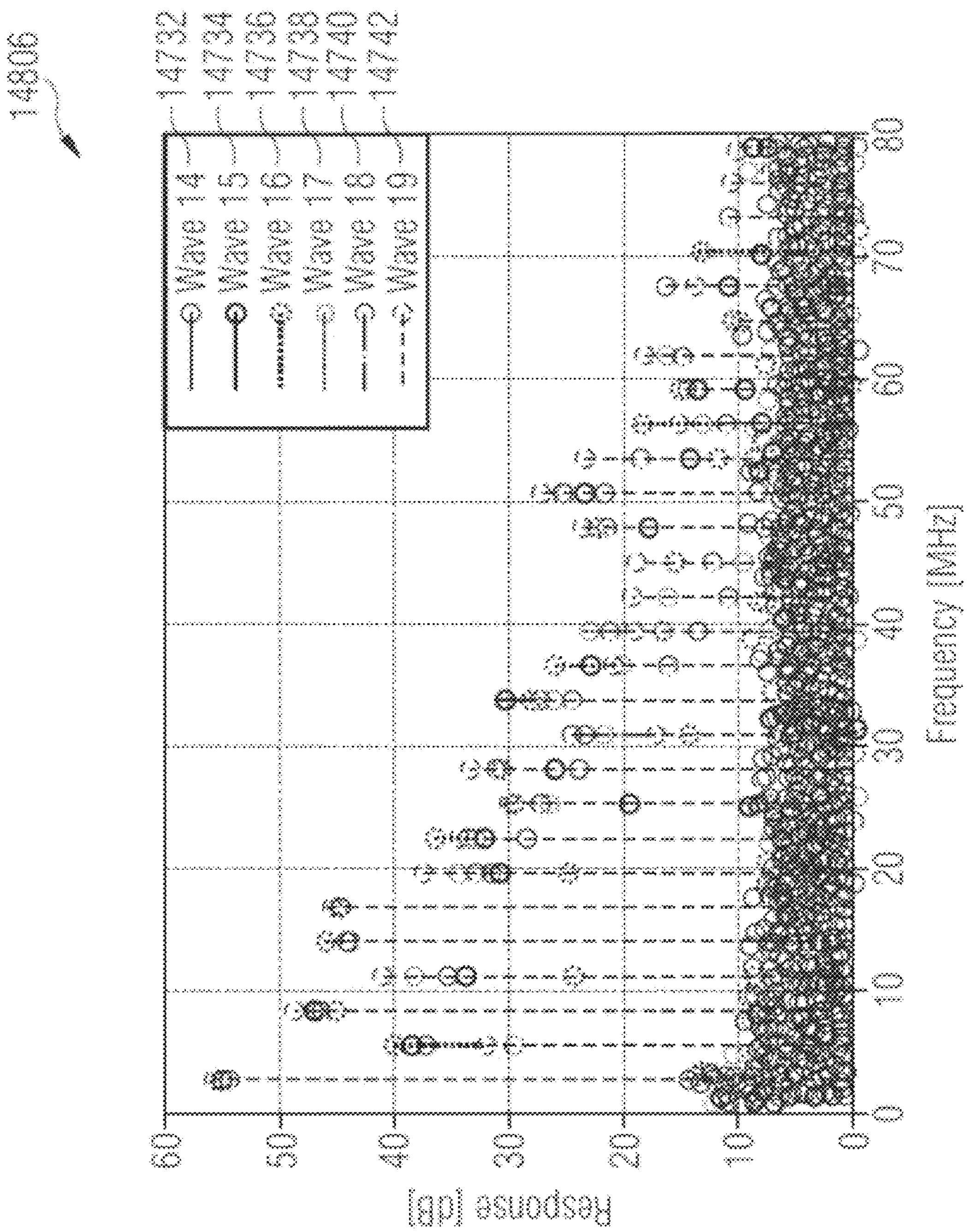
Figure 148D:
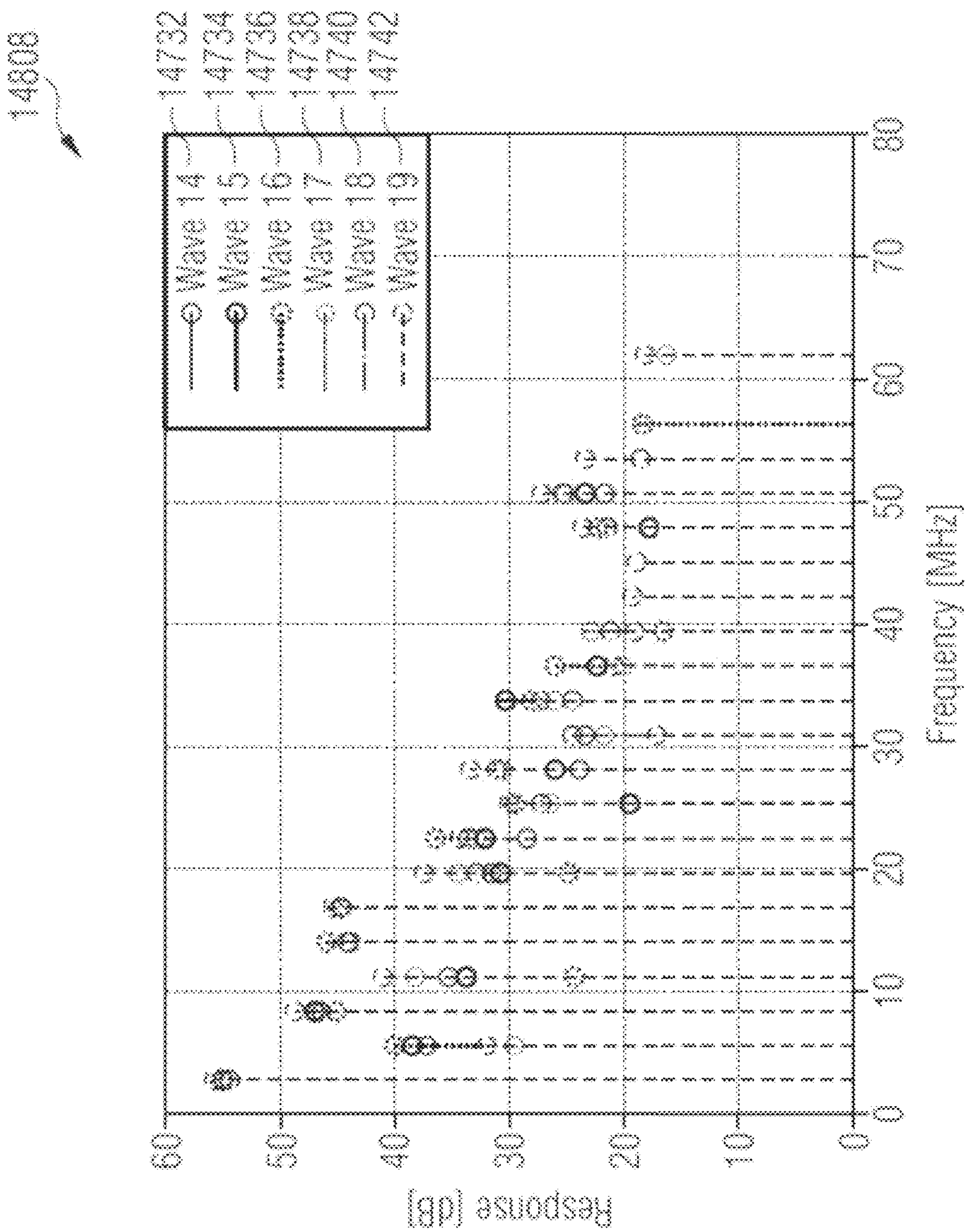

FIG. 148C and FIG. 148D show each a graph in the frequency-domain including a plurality of frequency-domain signals in accordance with various embodiments.

FIG. 148E shows a table describing a plurality of frequency-domain signals in accordance with various embodiments.

Figure 149A:
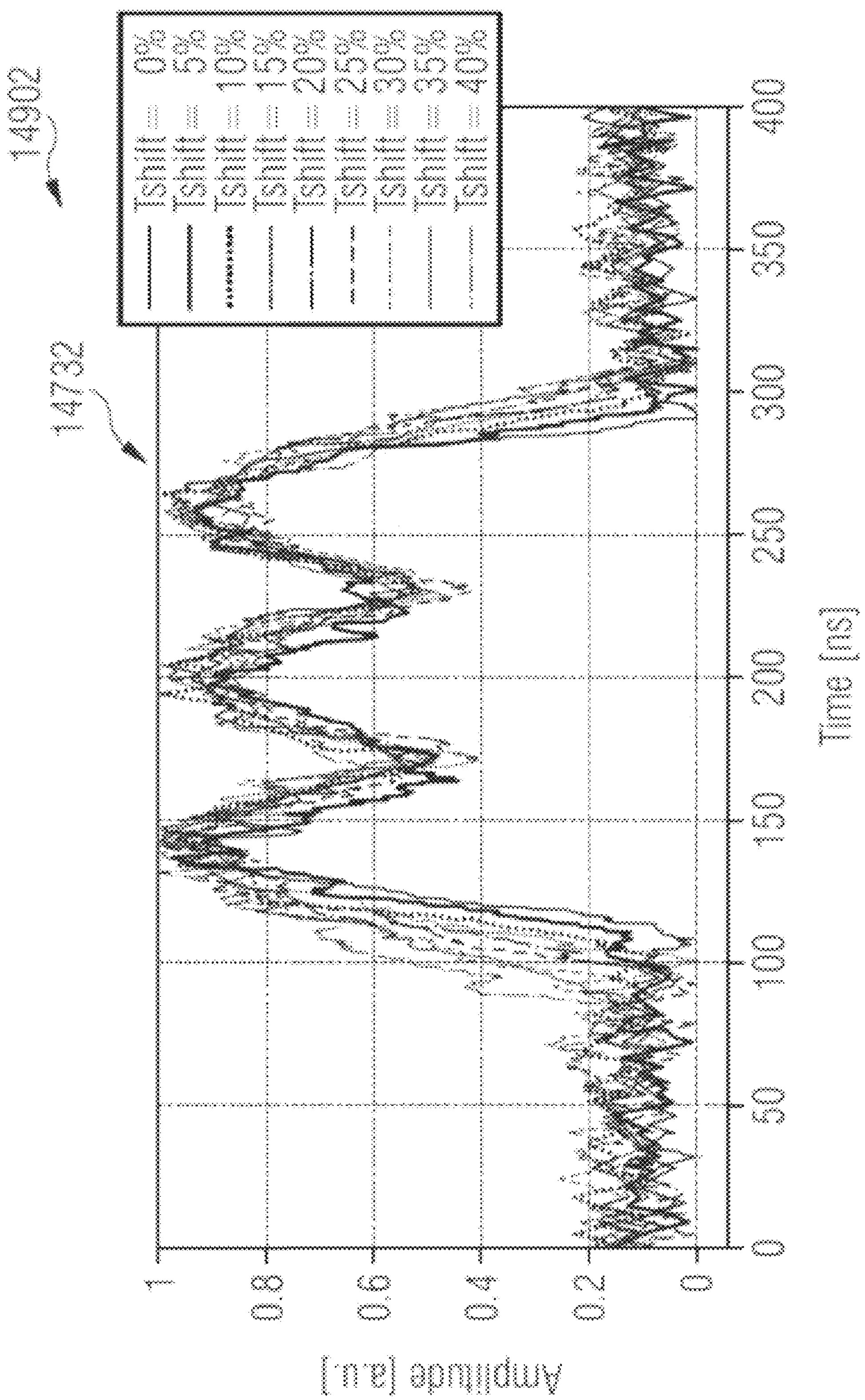

FIG. 149A shows a graph in the time-domain including a plurality of waveforms in accordance with various embodiments.

Figure 149B:
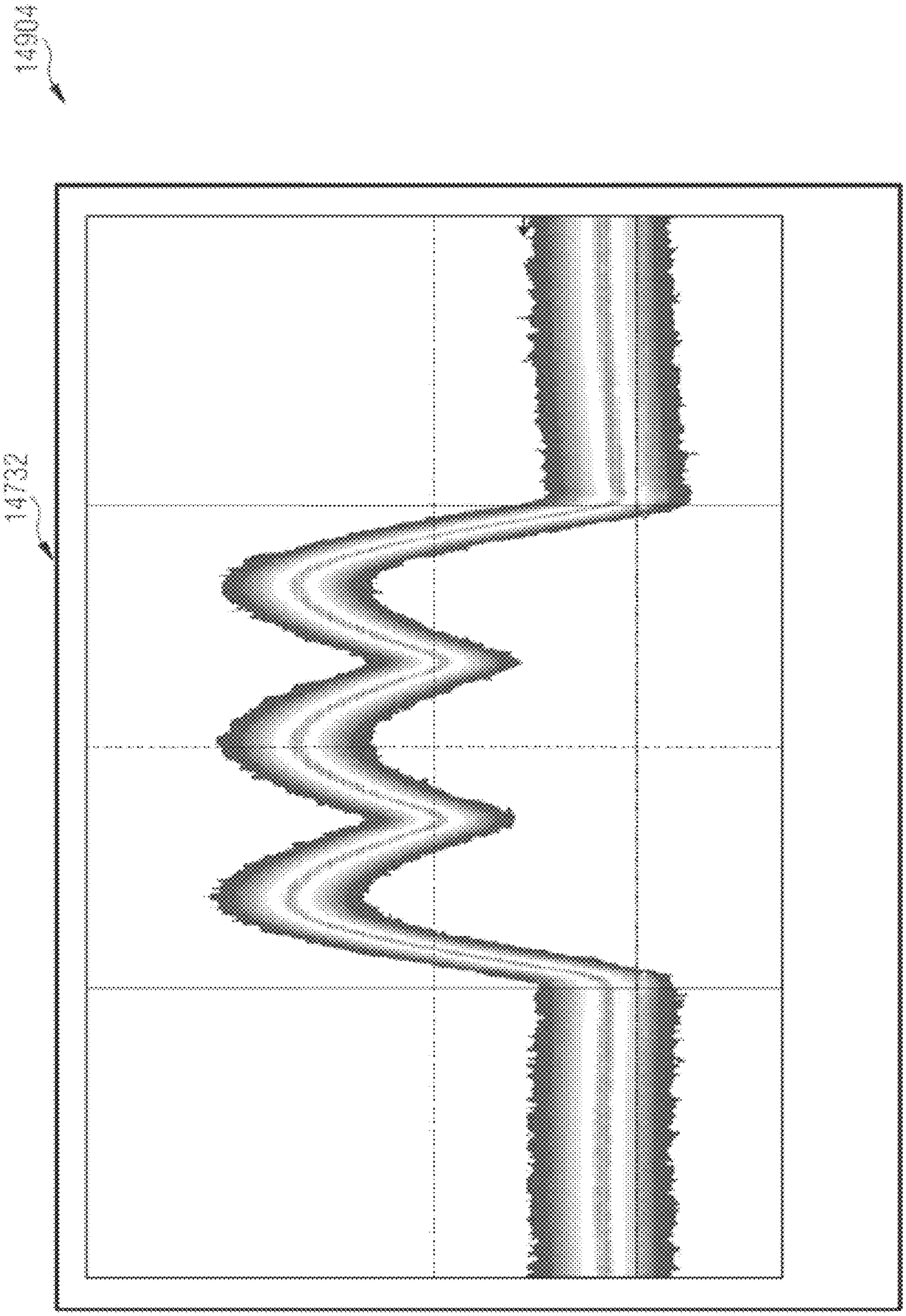

FIG. 149B shows an oscilloscope image including a waveform in accordance with various embodiments.

Figure 149C:
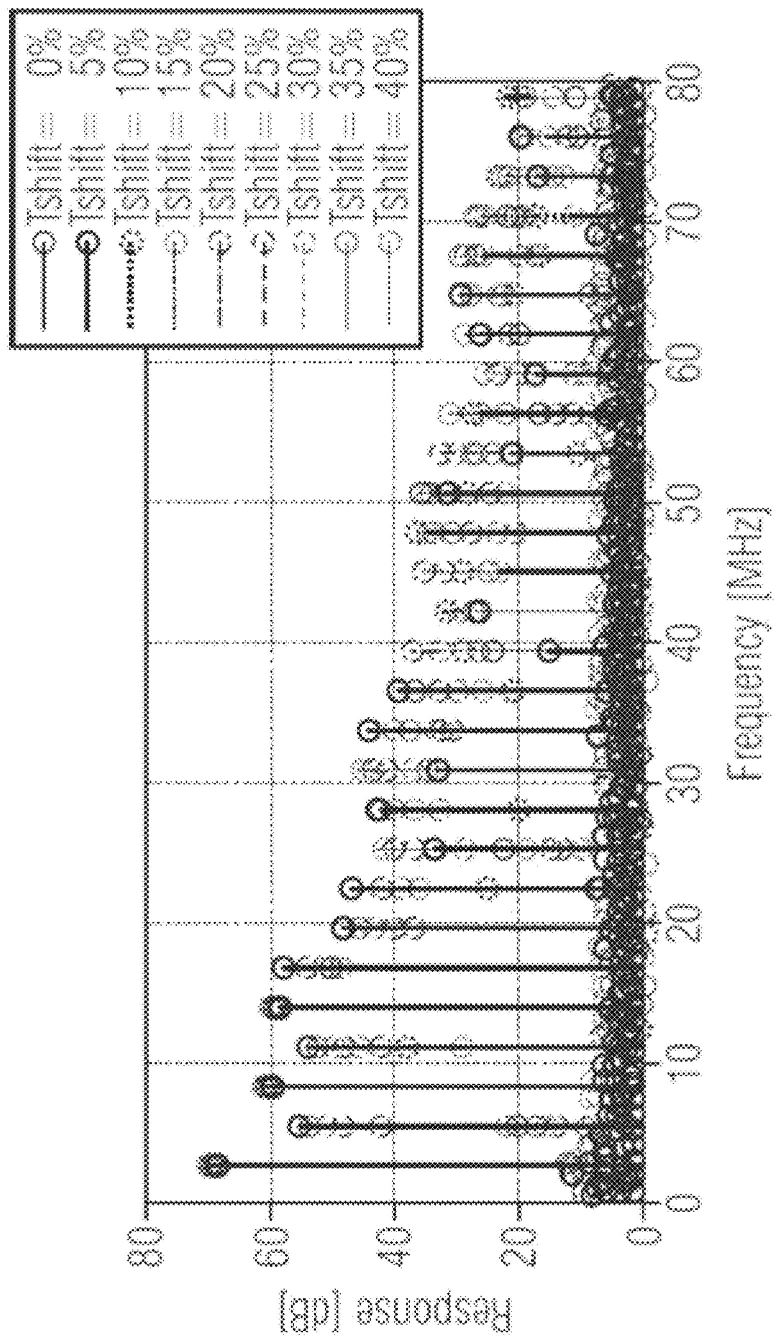

FIG. 149C shows a graph in the frequency-domain including a plurality of frequency-domain signals in accordance with various embodiments.

Figure 149D:
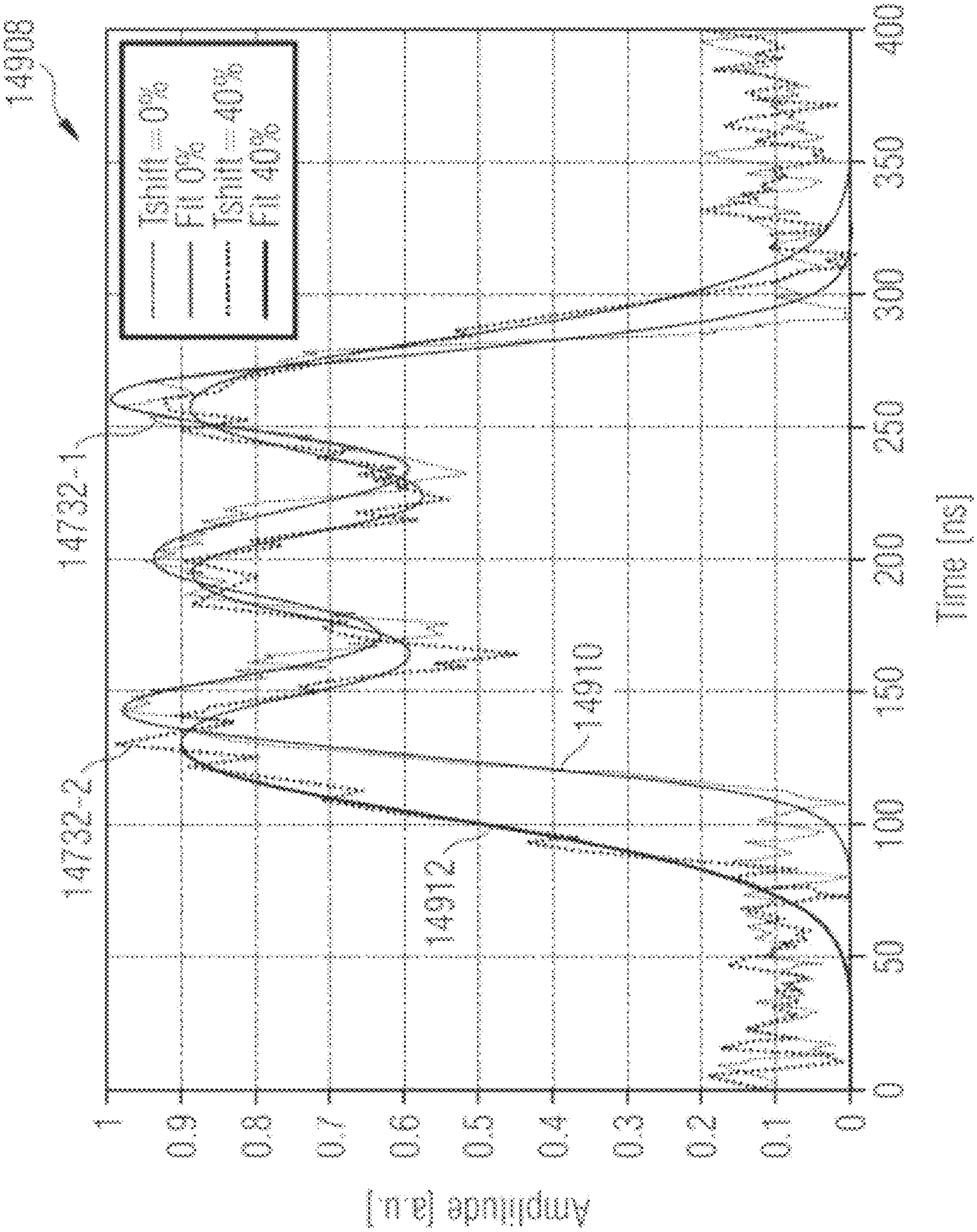

FIG. 149D shows a graph in accordance with various embodiments.

Figure 149E:
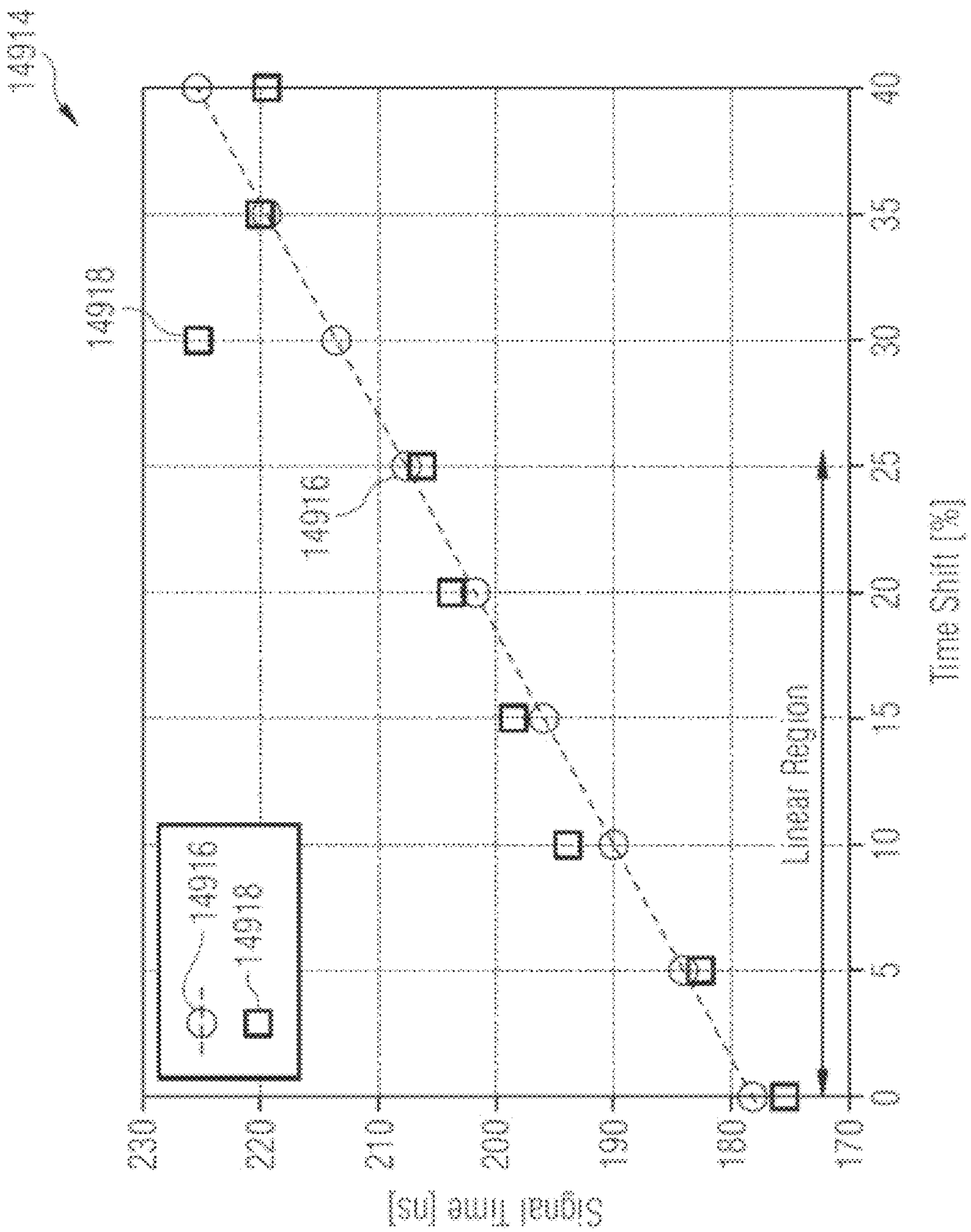

FIG. 149E shows a graph in accordance with various embodiments.

Figure 150A:
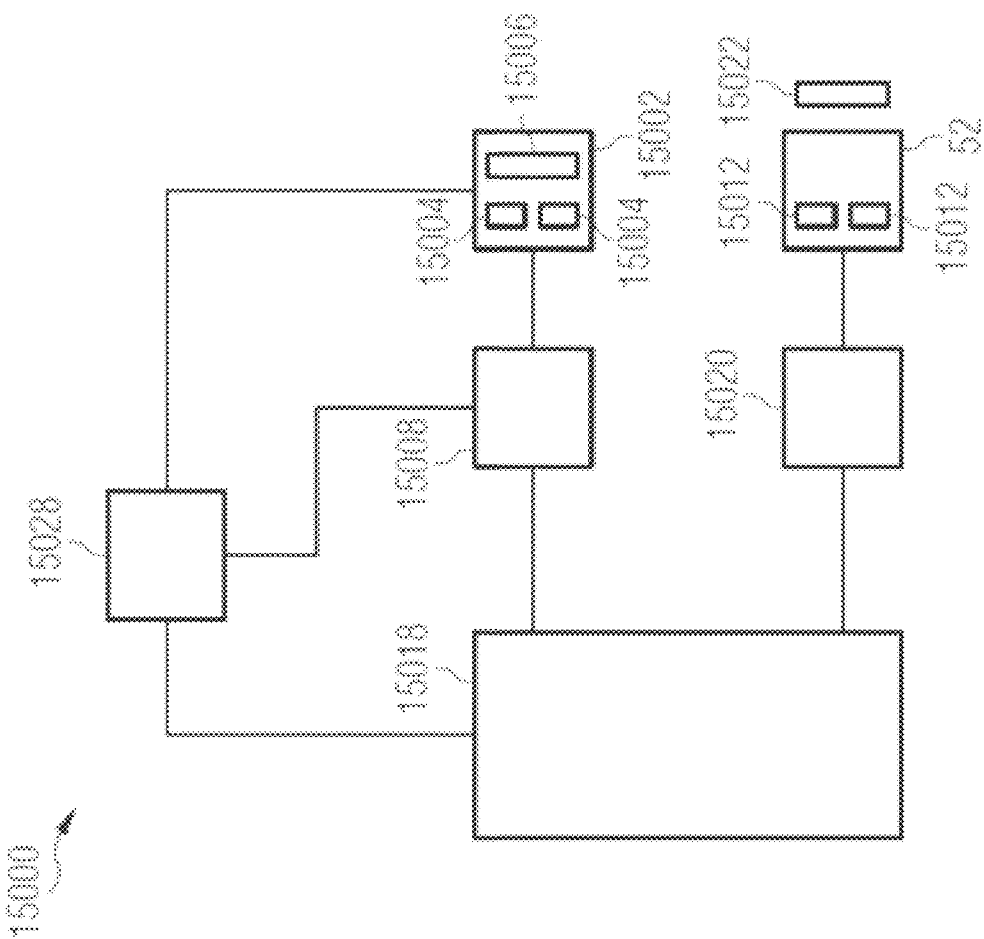

FIG. 150A shows a LIDAR system in a schematic representation in accordance with various embodiments.

FIG. 1506 shows an operation of the LIDAR system in a schematic representation in accordance with various embodiments.

Figure 150B:
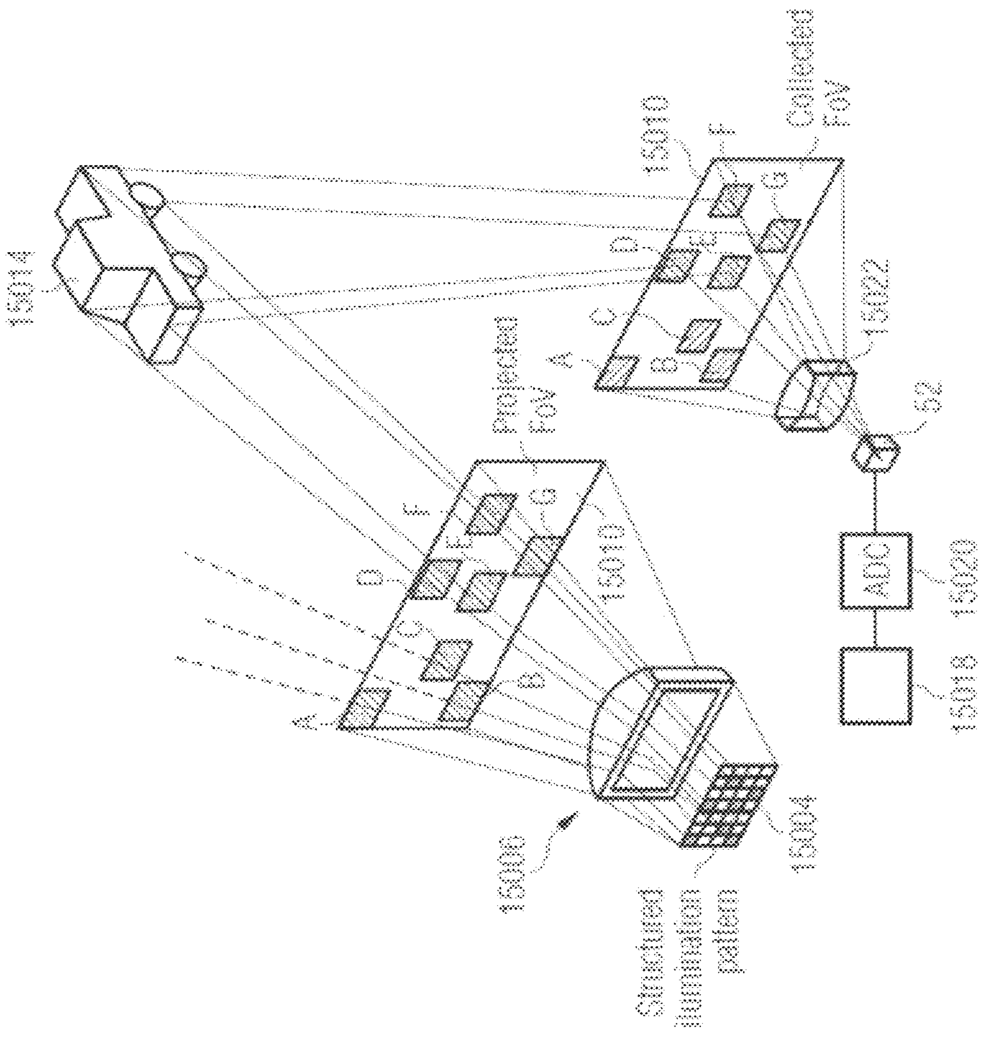
Figure 150C:
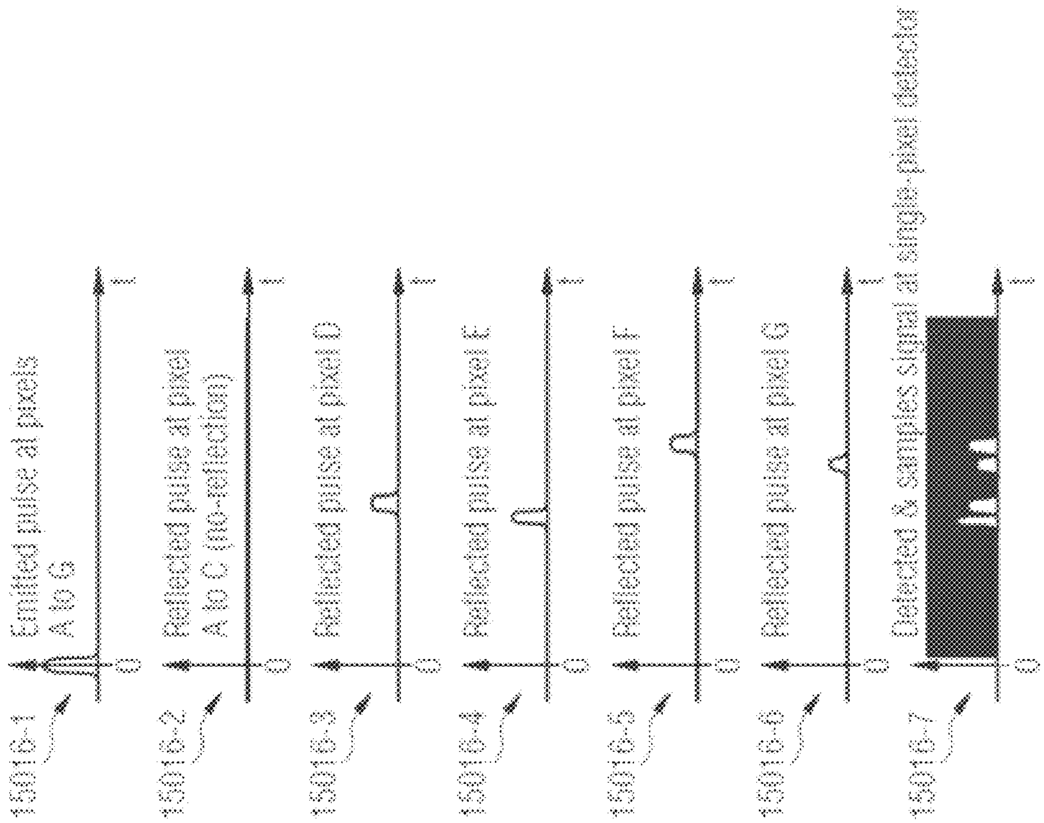

FIG. 150C shows graphs describing an operation of the LIDAR system in accordance with various embodiments.

Figure 150D:
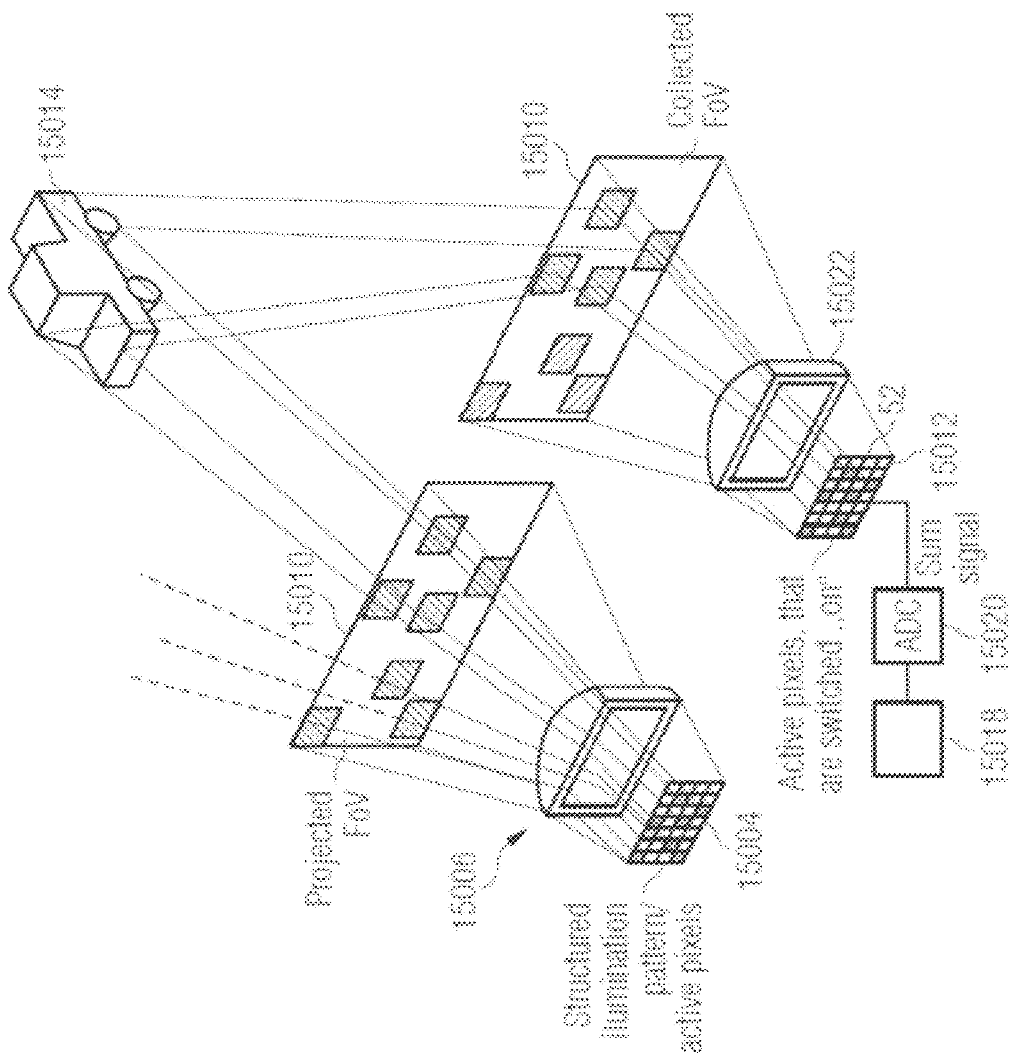

FIG. 150D shows an operation of the LIDAR system in a schematic representation in accordance with various embodiments.

Figure 150F:
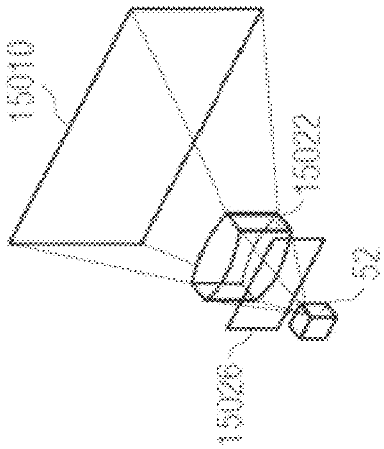
Figure 150E:
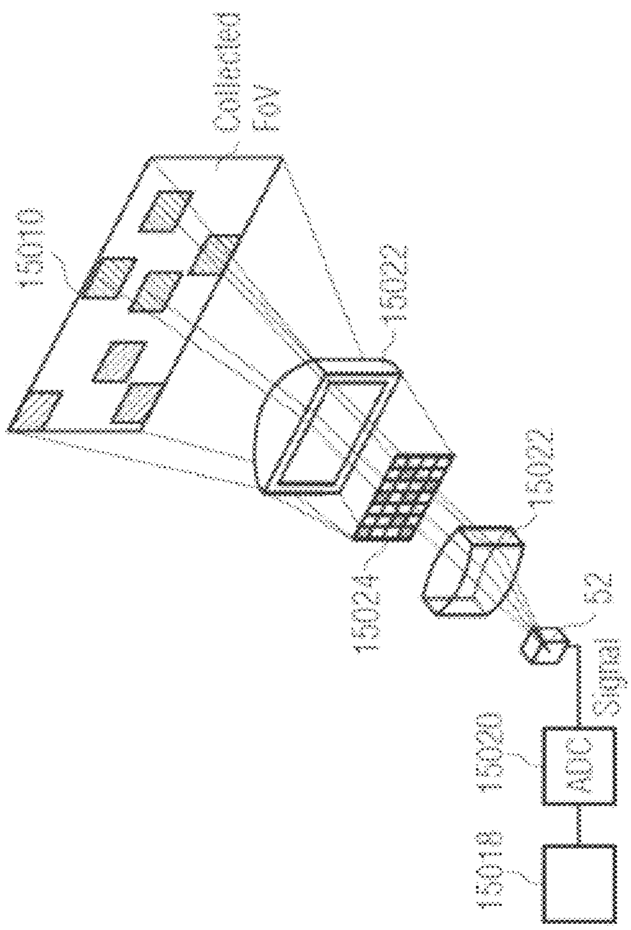

FIG. 150E shows an operation of a portion of the LIDAR system in a schematic representation in accordance with various embodiments.

FIG. 150F shows a portion of the LIDAR system in a schematic representation in accordance with various embodiments.

FIG. 151A, FIG. 151B, FIG. 151C, and FIG. 151D show each a segmentation of a field of view of the LIDAR system in a schematic representation in accordance with various embodiments.

Figure 152A:
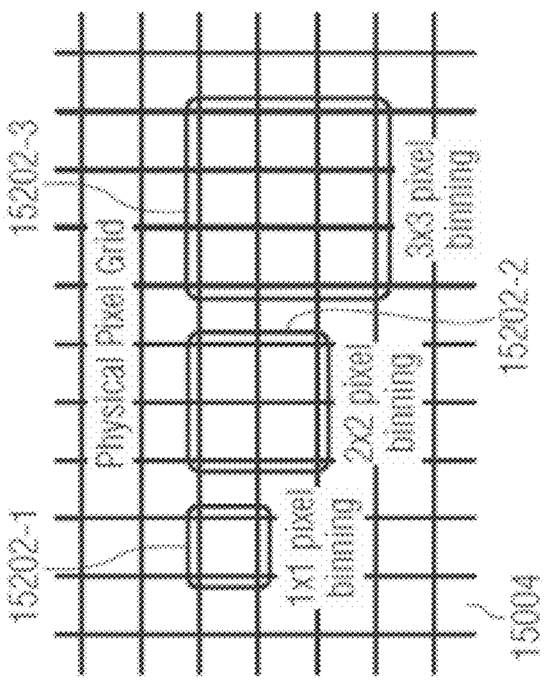
Figure 152B:
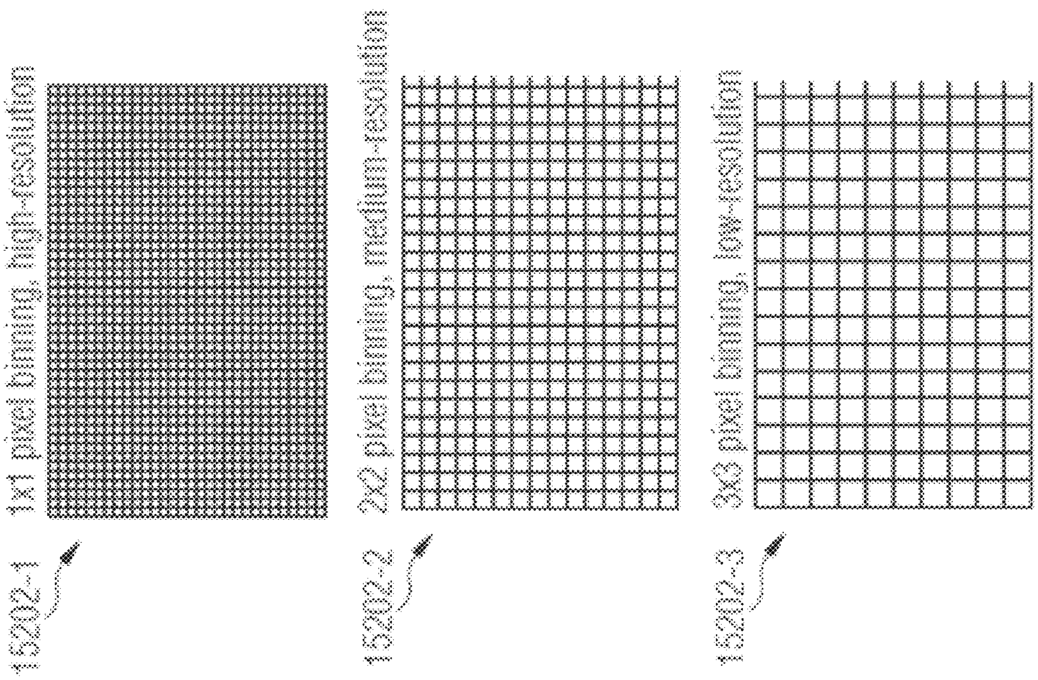

FIG. 152A and FIG. 152B show each a binning of light emitters in a schematic representation in accordance with various embodiments.

Figure 152E:
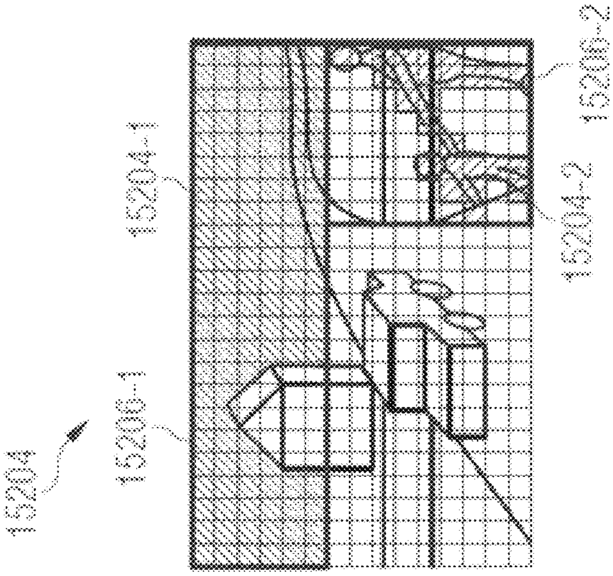
Figure 152D:
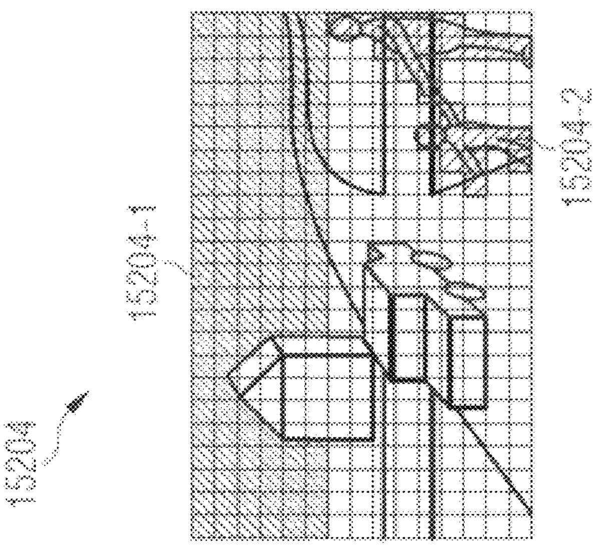
Figure 152C:
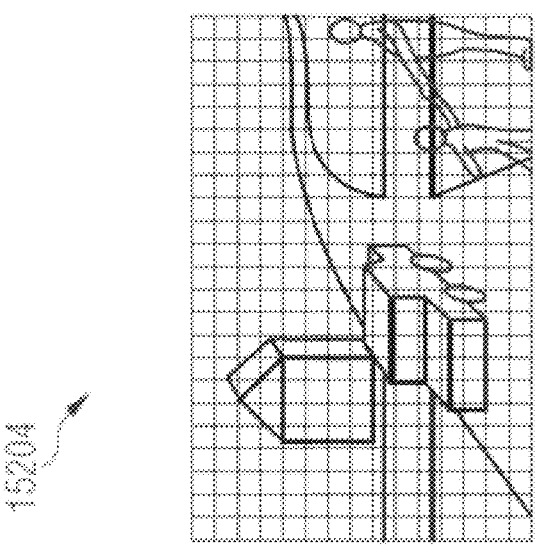

FIG. 152C, FIG. 152D, and FIG. 152E show the identification of regions of interest in an overview shot in a schematic representation in accordance with various embodiments.

Figure 152F:
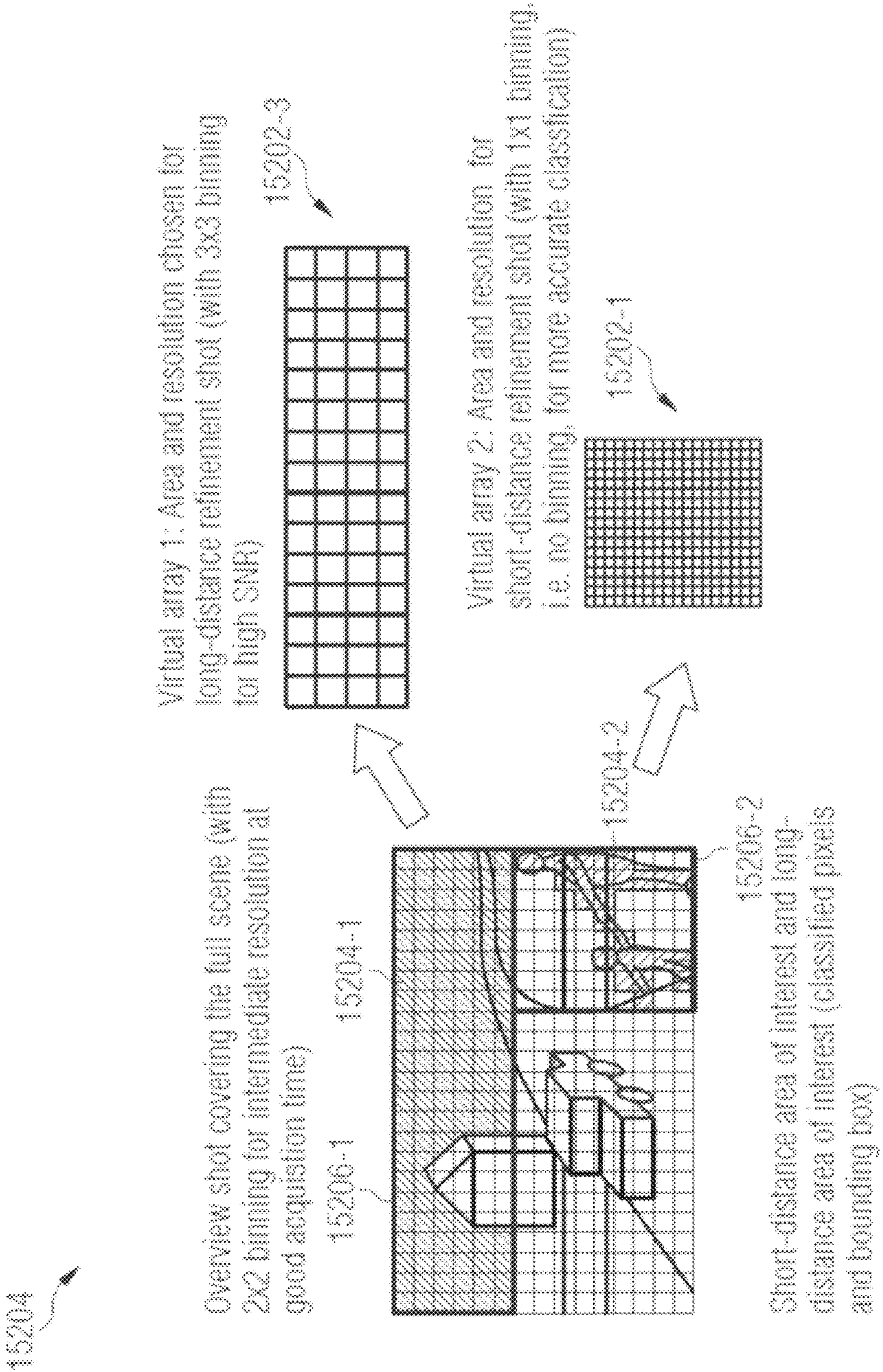

FIG. 152F shows a binning of the light emitters in association with the regions of interest in a schematic representation in accordance with various embodiments.

Figure 152G:
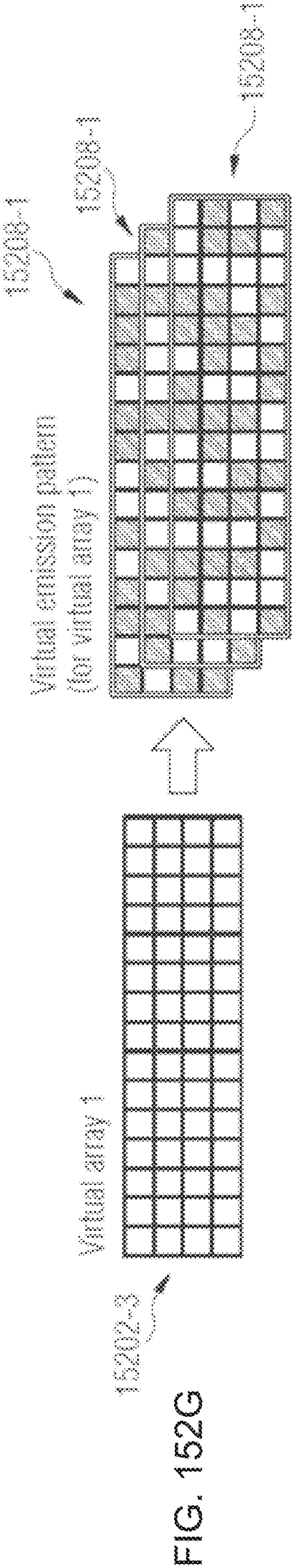
Figure 152H:
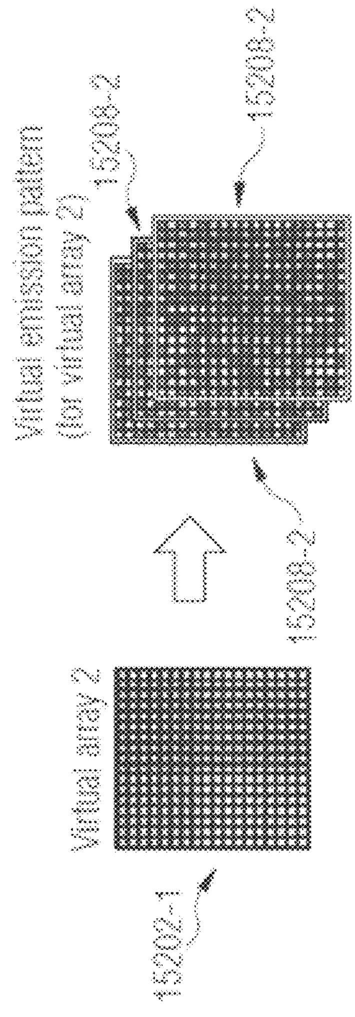

FIG. 152G and FIG. 152H show each a generation of virtual emission patterns in a schematic representation in accordance with various embodiments.

Figure 152I:
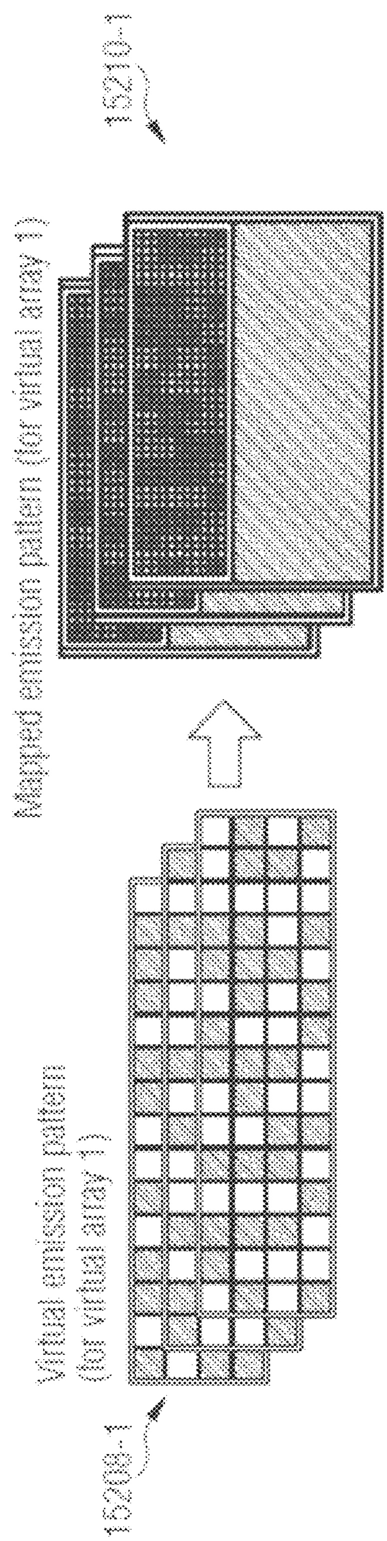
Figure 152J:
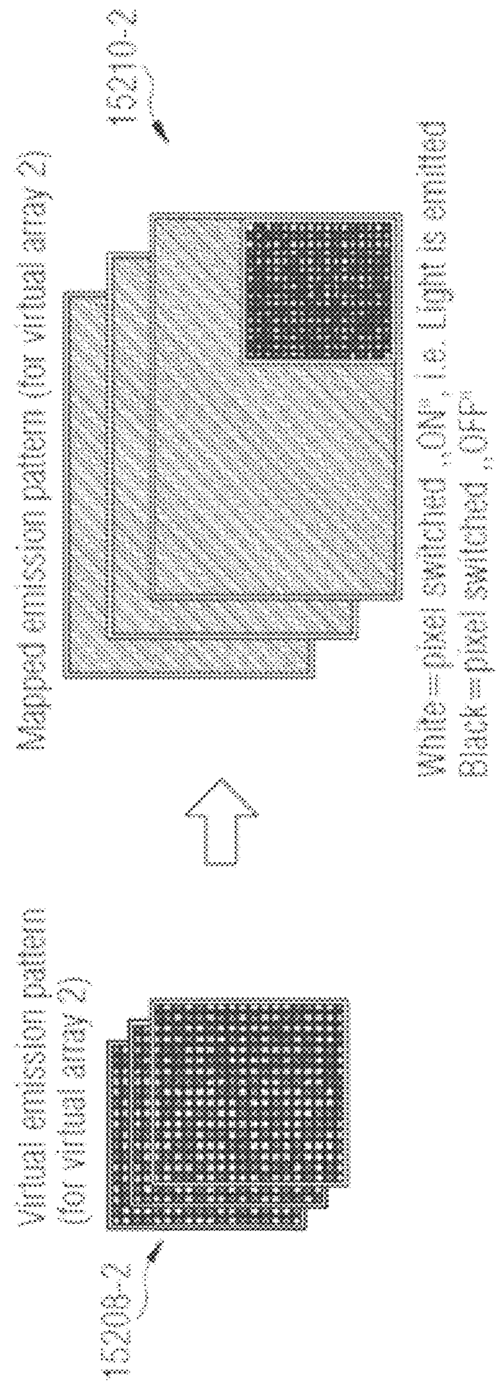

FIG. 152I and FIG. 152J show each a generation of emission patterns in a schematic representation in accordance with various embodiments.

Figure 152K:
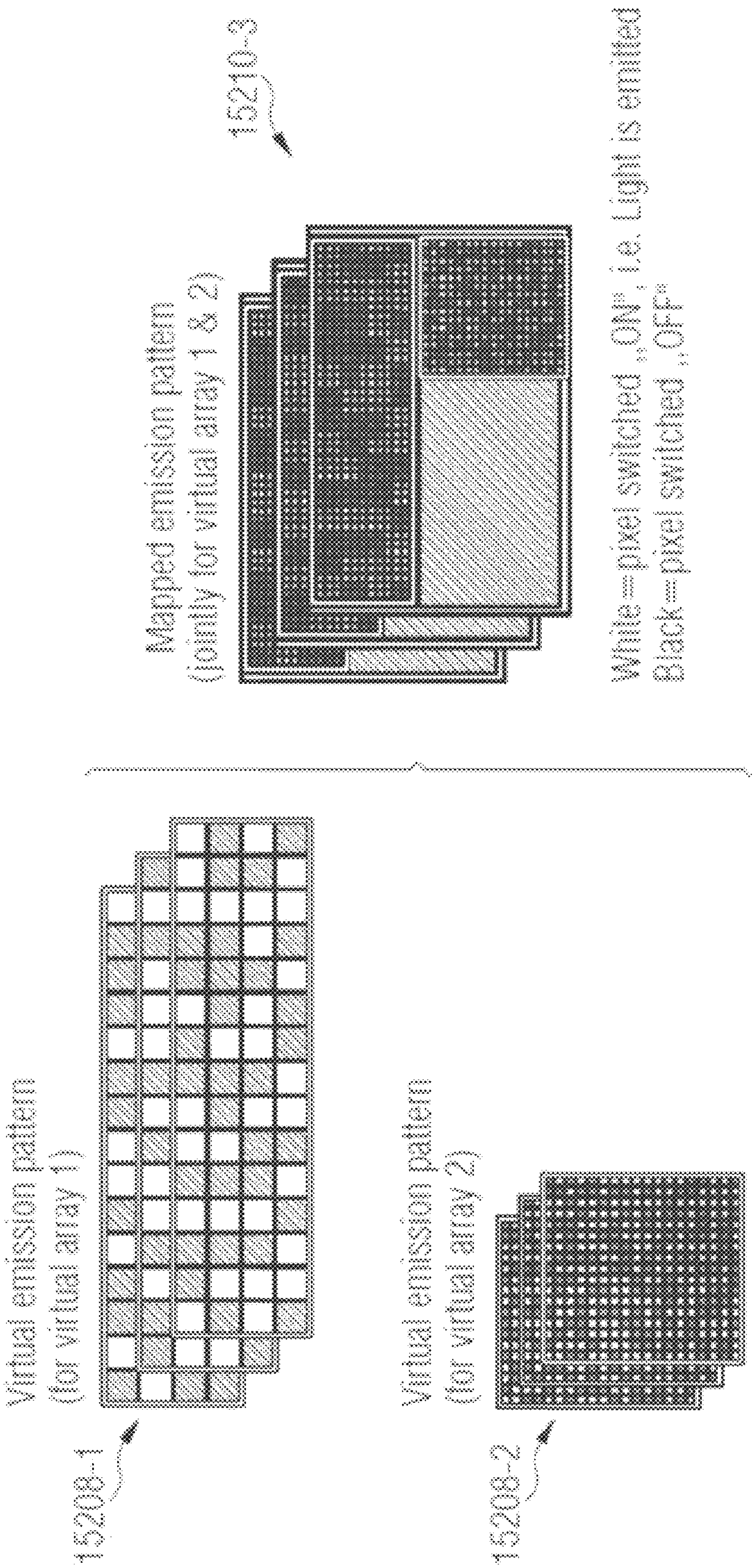

FIG. 152K shows a generation of a combined emission pattern in a schematic representation in accordance with various embodiments.

Figure 153:
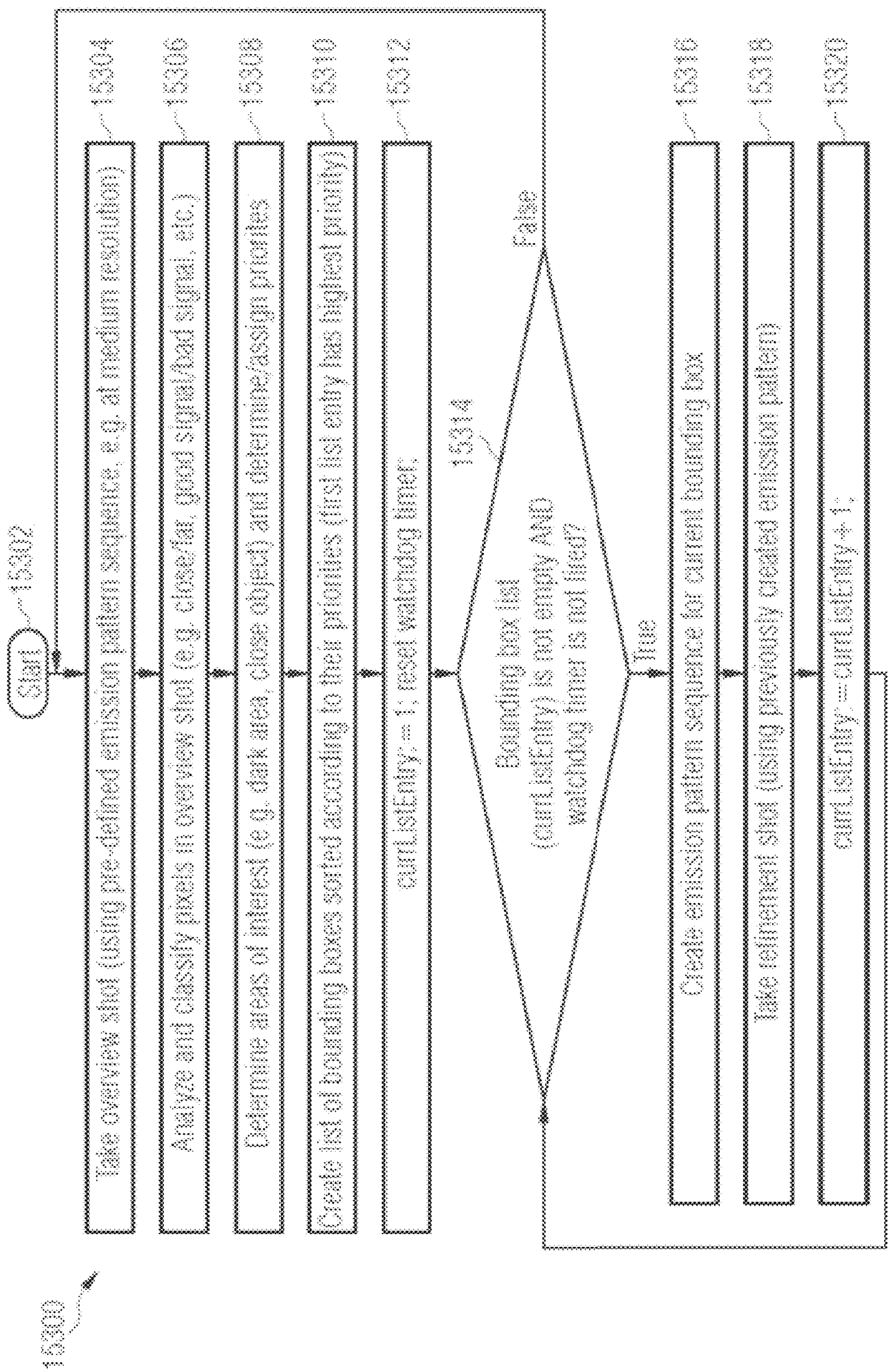

FIG. 153 shows a flow diagram for an adaptive compressed sensing algorithm in accordance with various embodiments.

Figure 154A:
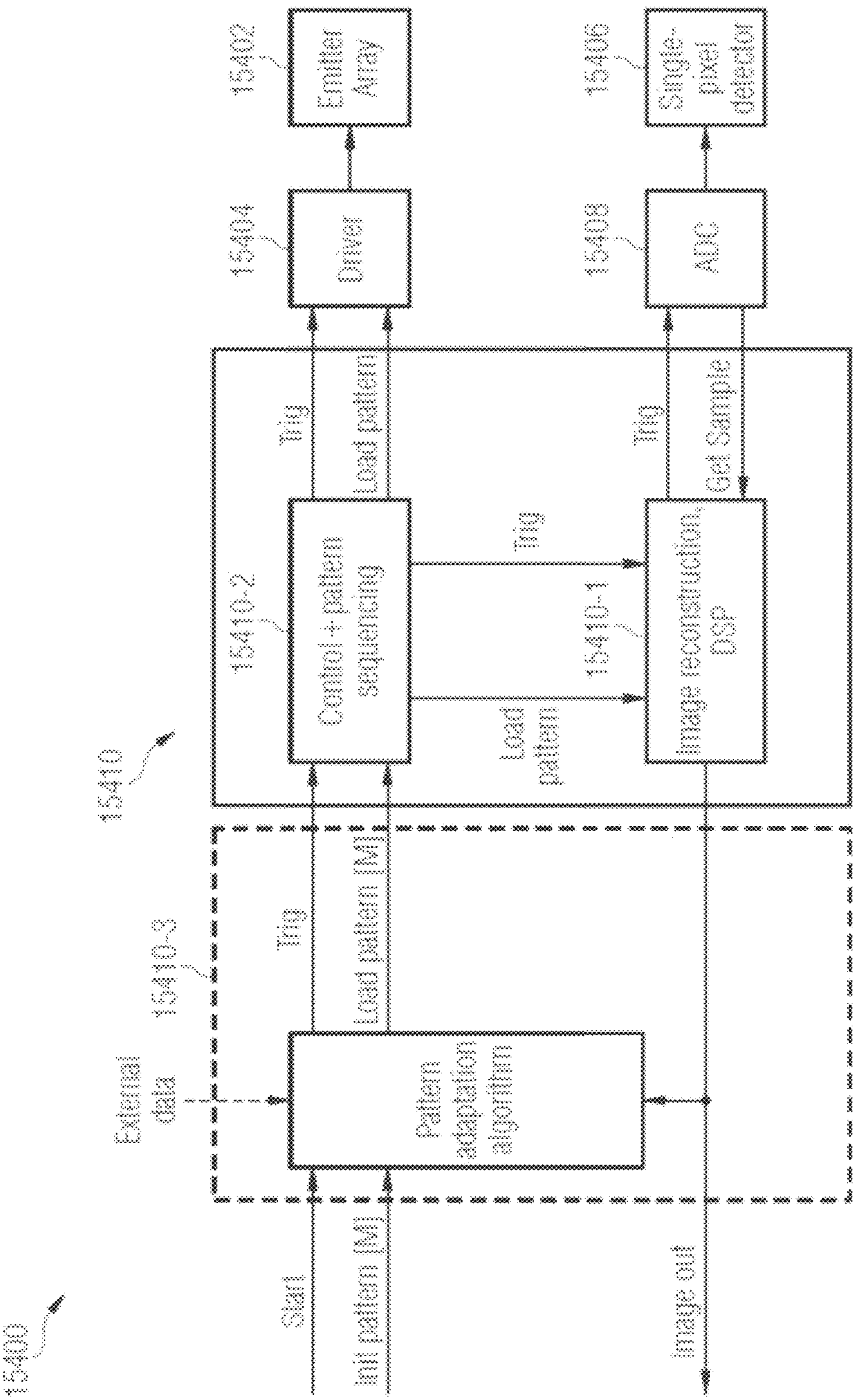
Figure 154B:
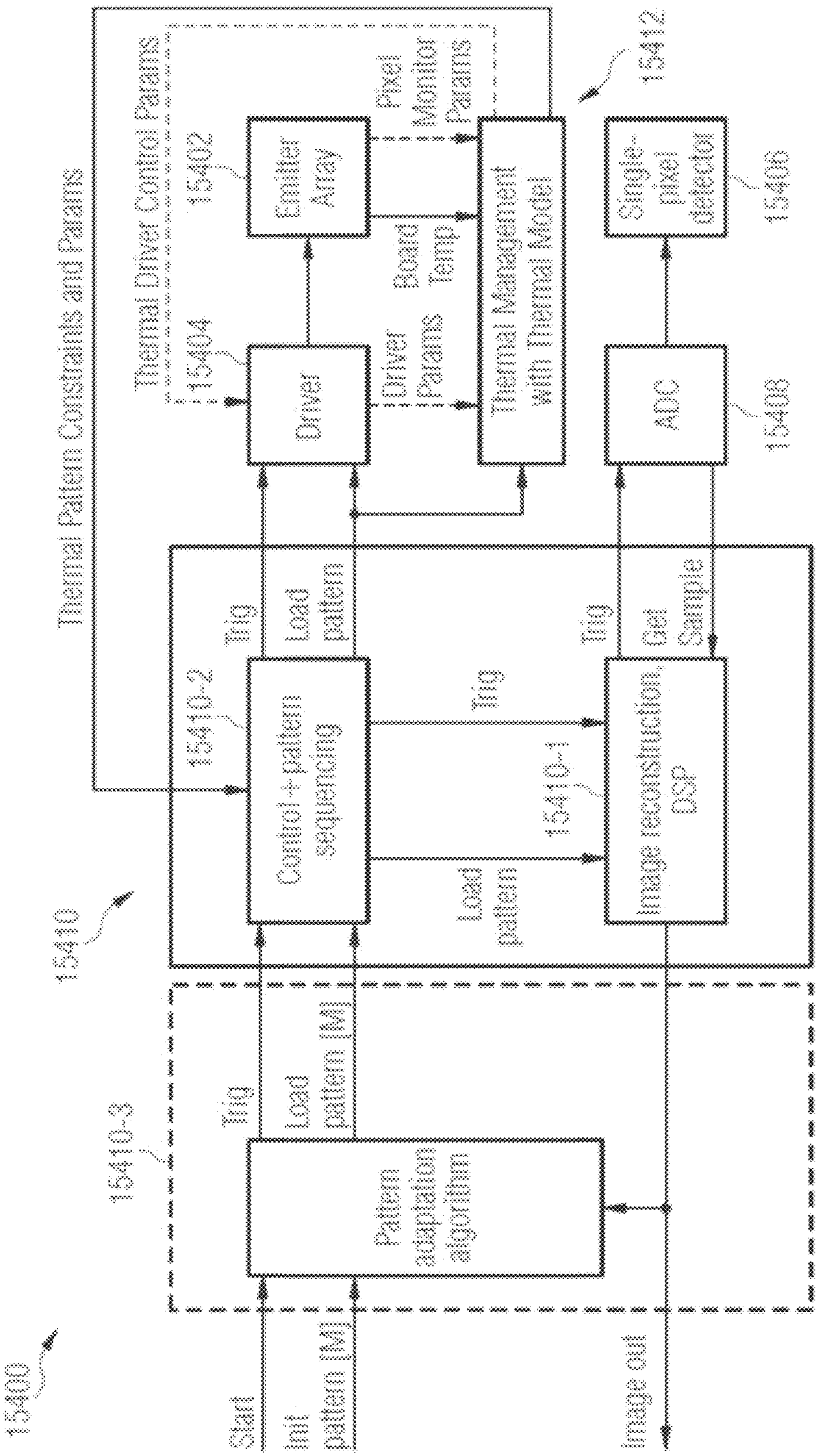

FIG. 154A and FIG. 154B show each a LIDAR system in a schematic representation in accordance with various embodiments.

Figure 155A:
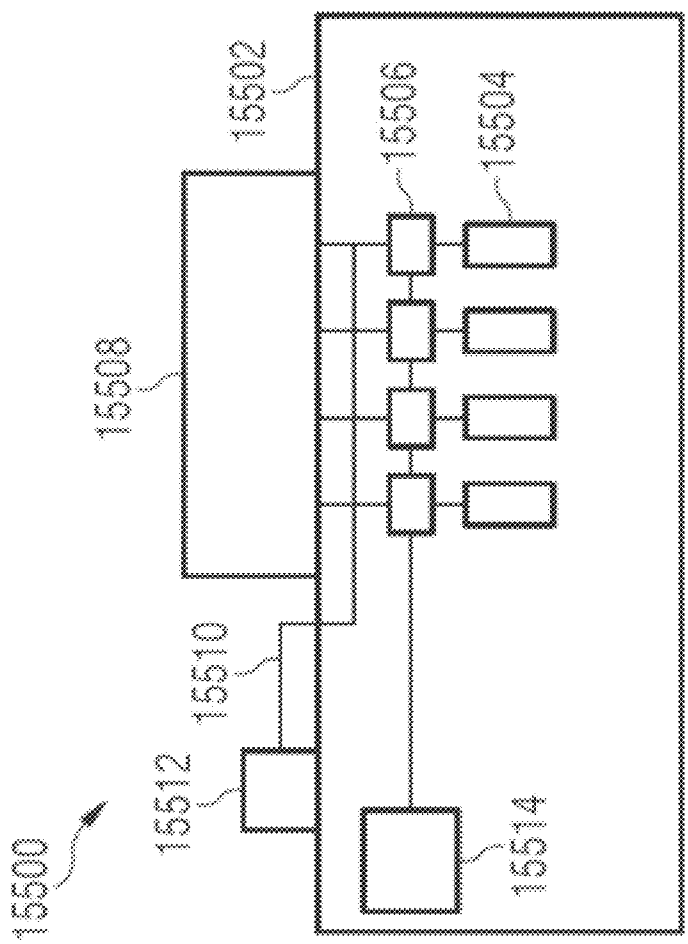

FIG. 155A shows a side view of an optical package in a schematic representation in accordance with various embodiments.

Figure 155C:
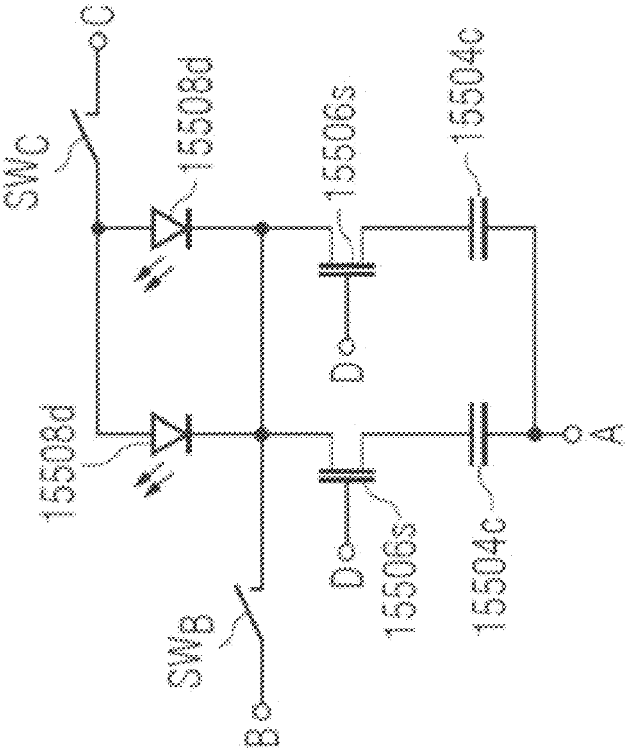
Figure 155B:
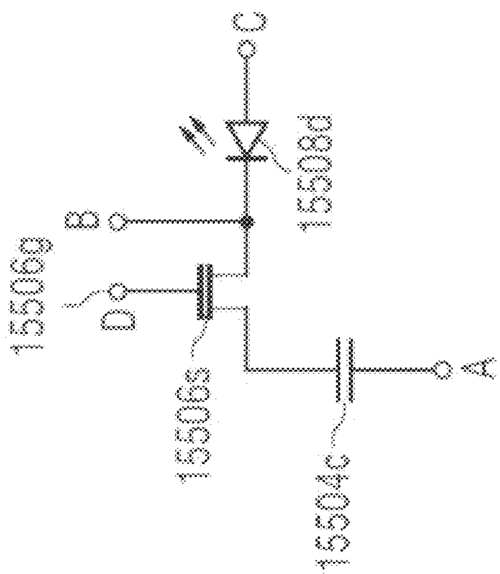

FIG. 155B shows a circuit equivalent in a schematic representation in accordance with various embodiments.

FIG. 155C shows a circuit equivalent in a schematic representation in accordance with various embodiments.

Figure 156:
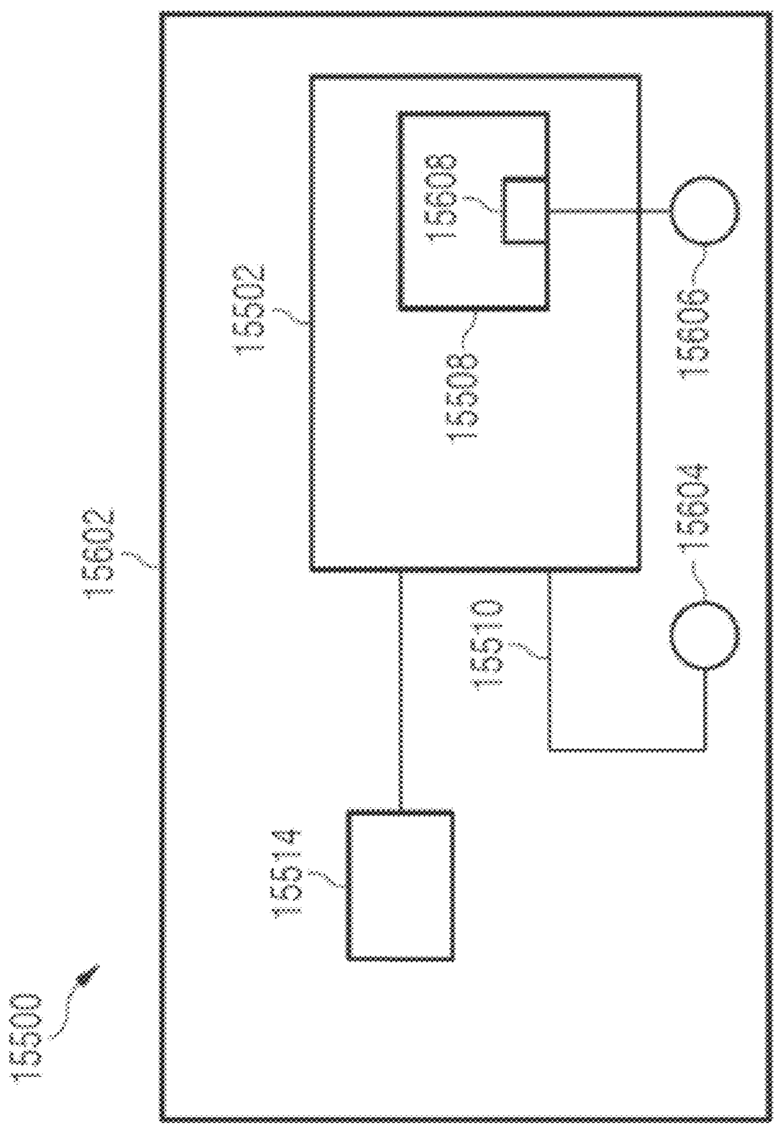

FIG. 156 shows a top view of an optical package in a schematic representation in accordance with various embodiments.

Figure 157A:
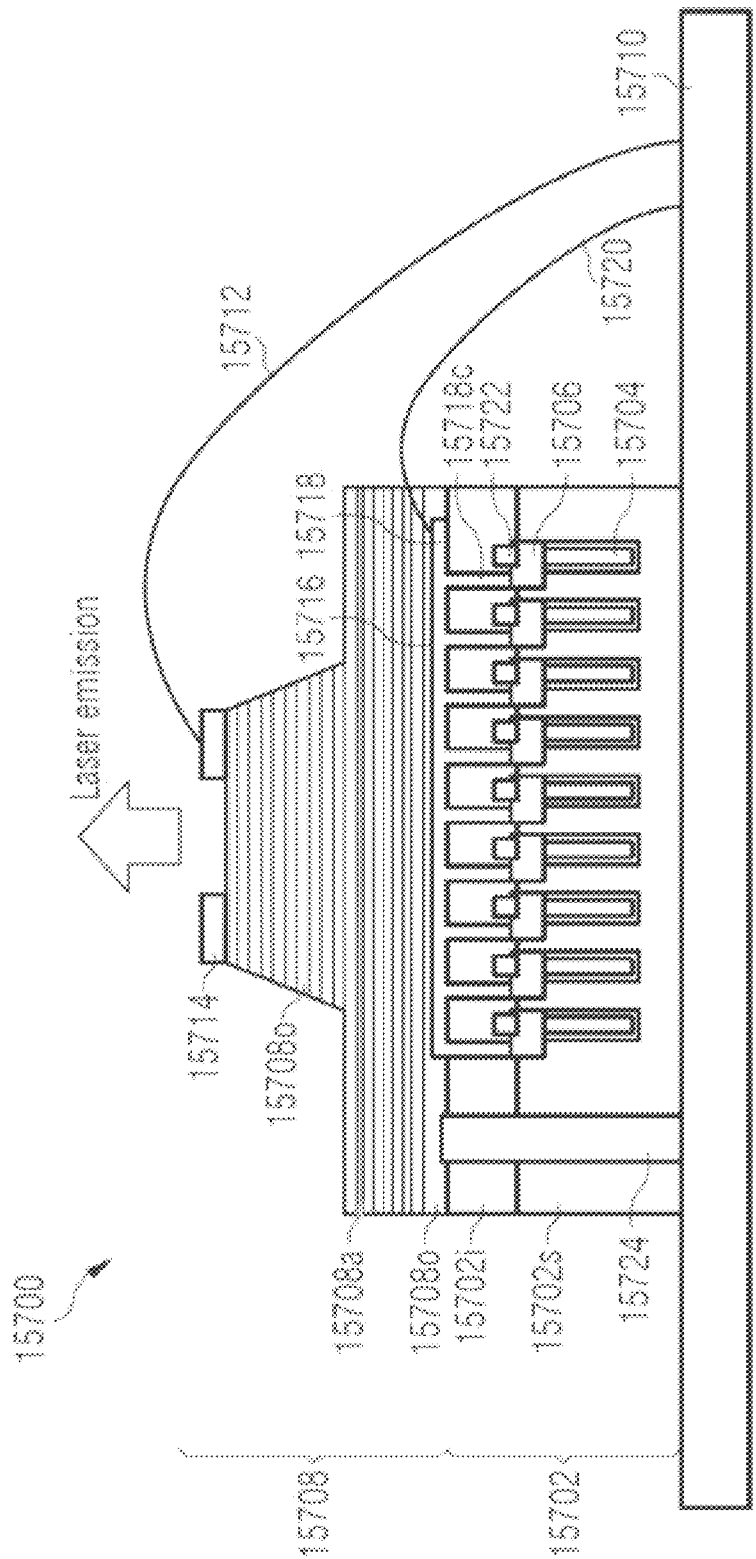

FIG. 157A shows a side view of an optical package in a schematic representation in accordance with various embodiments.

Figure 157B:
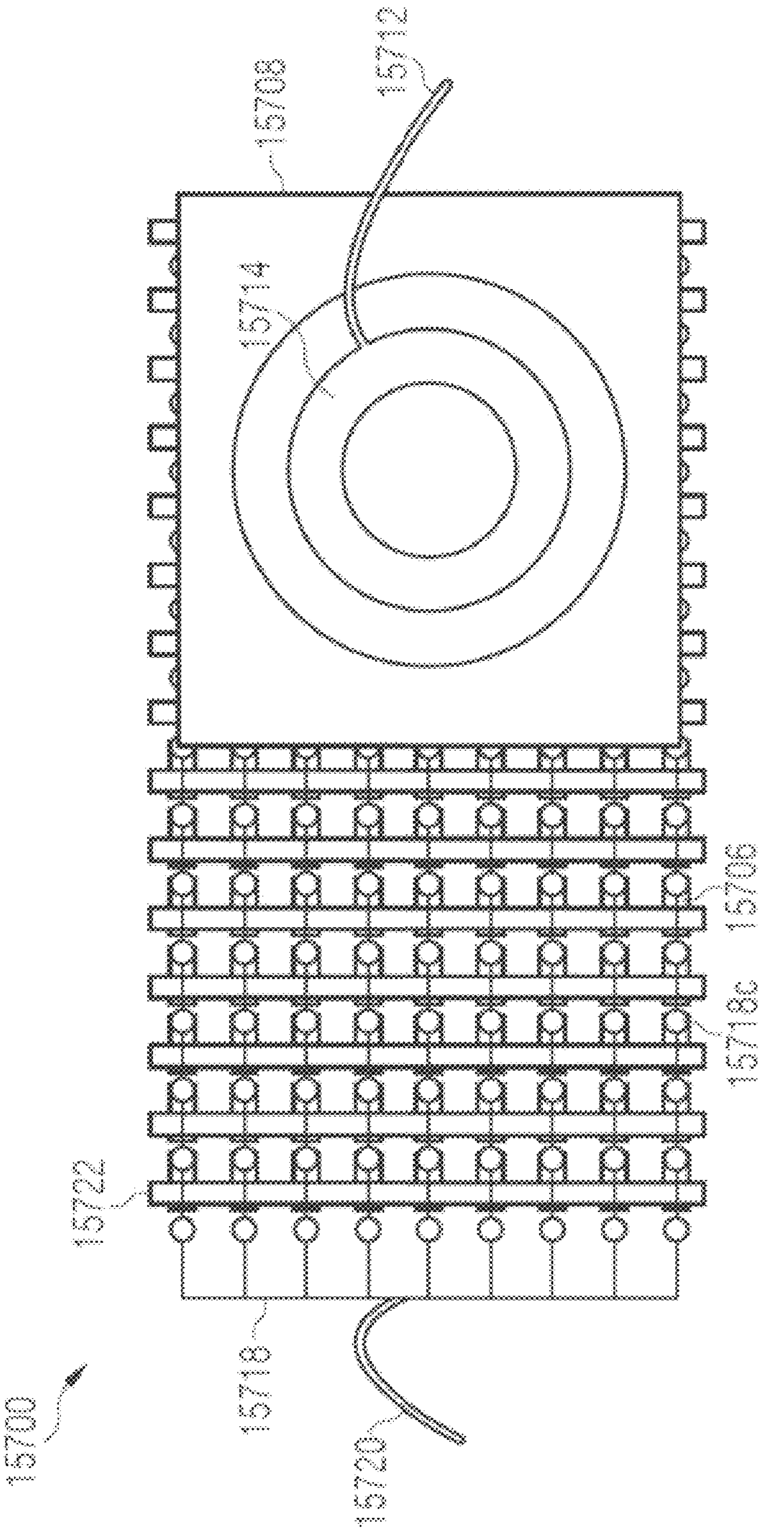

FIG. 157B shows a top view of an optical package in a schematic representation in accordance with various embodiments.

Figure 158:
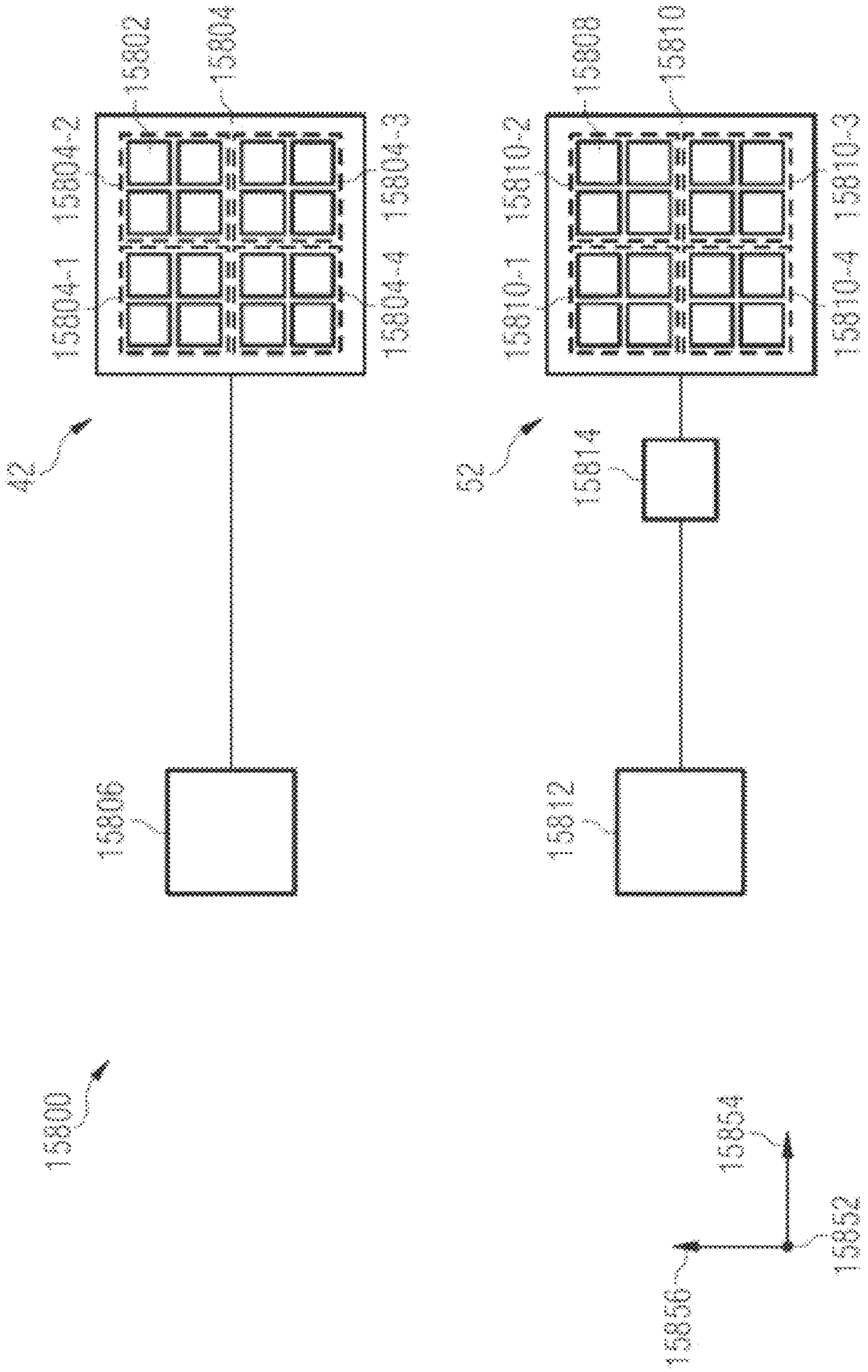

FIG. 158 shows a LIDAR system in a schematic representation in accordance with various embodiments.

Figure 159:
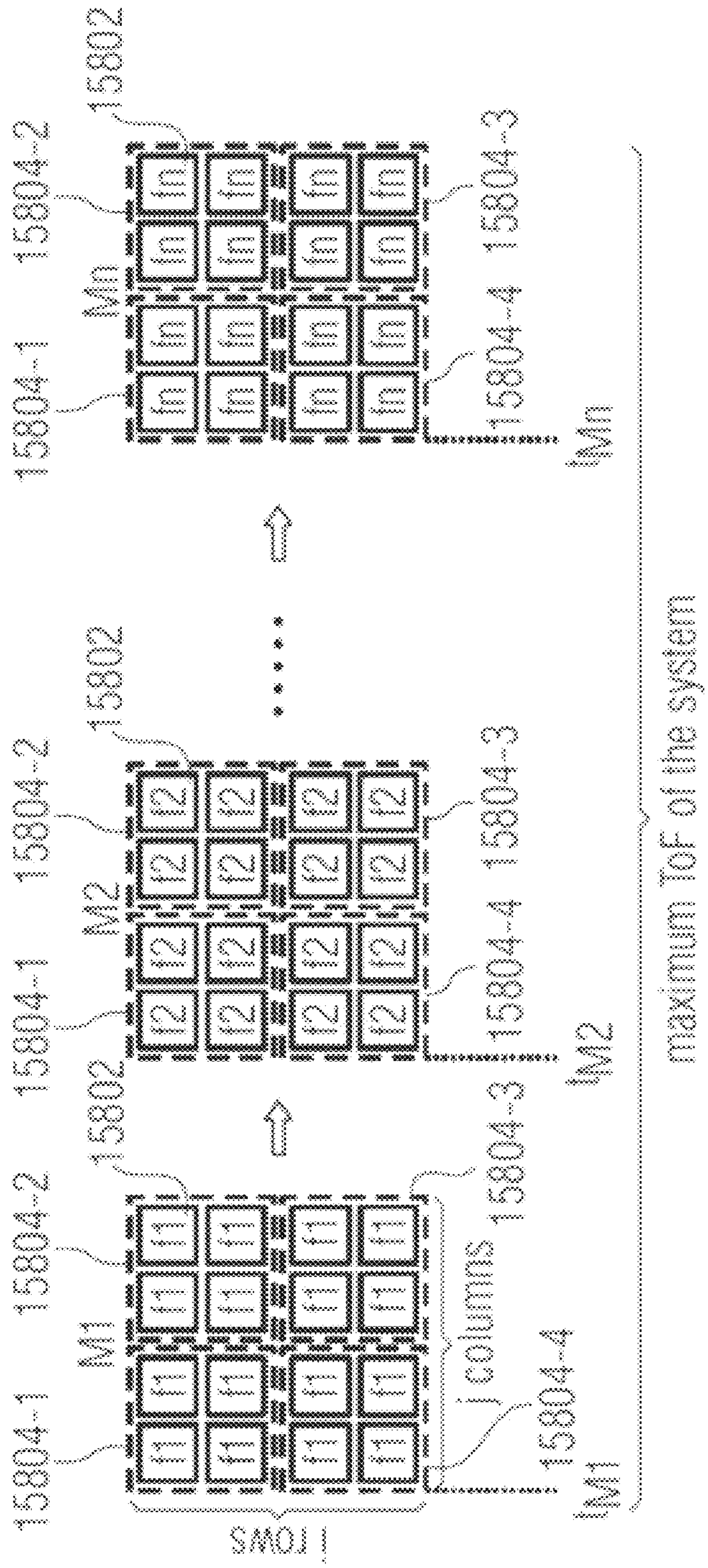

FIG. 159 shows a light emission scheme in a schematic representation in accordance with various embodiments.

Figure 160A:
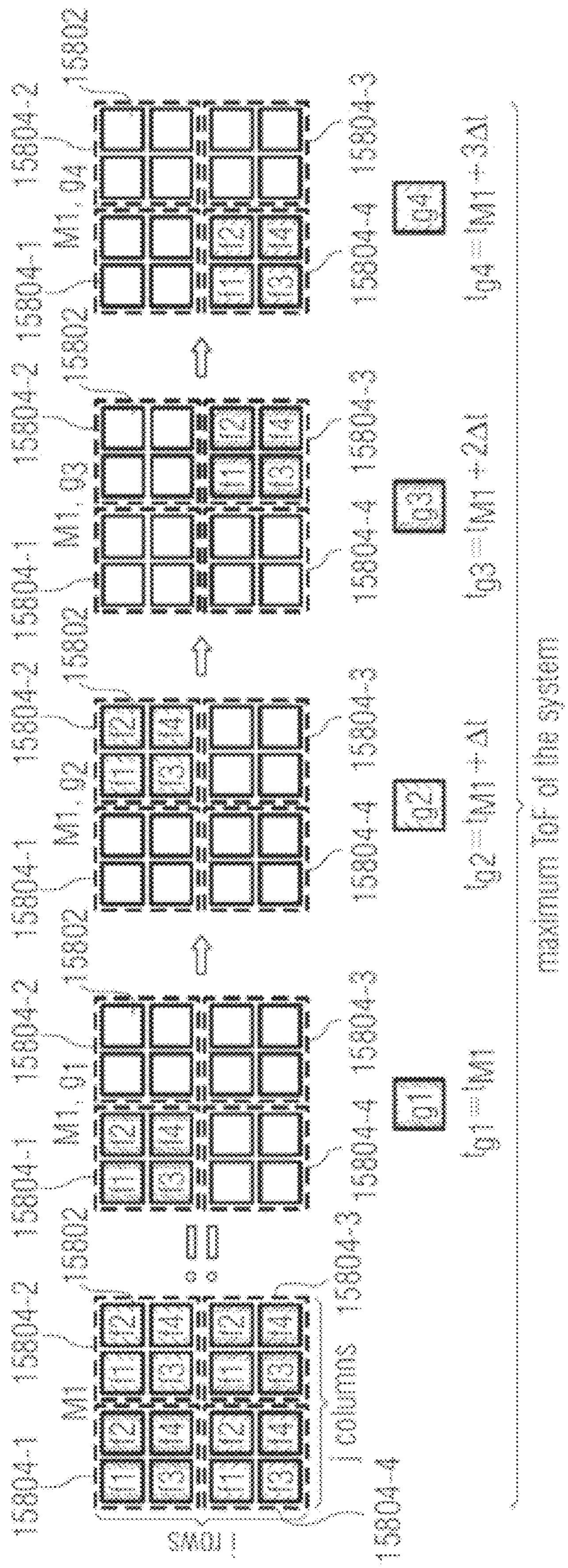

FIG. 160A shows a light emission scheme in a schematic representation in accordance with various embodiments.

Figure 160B:
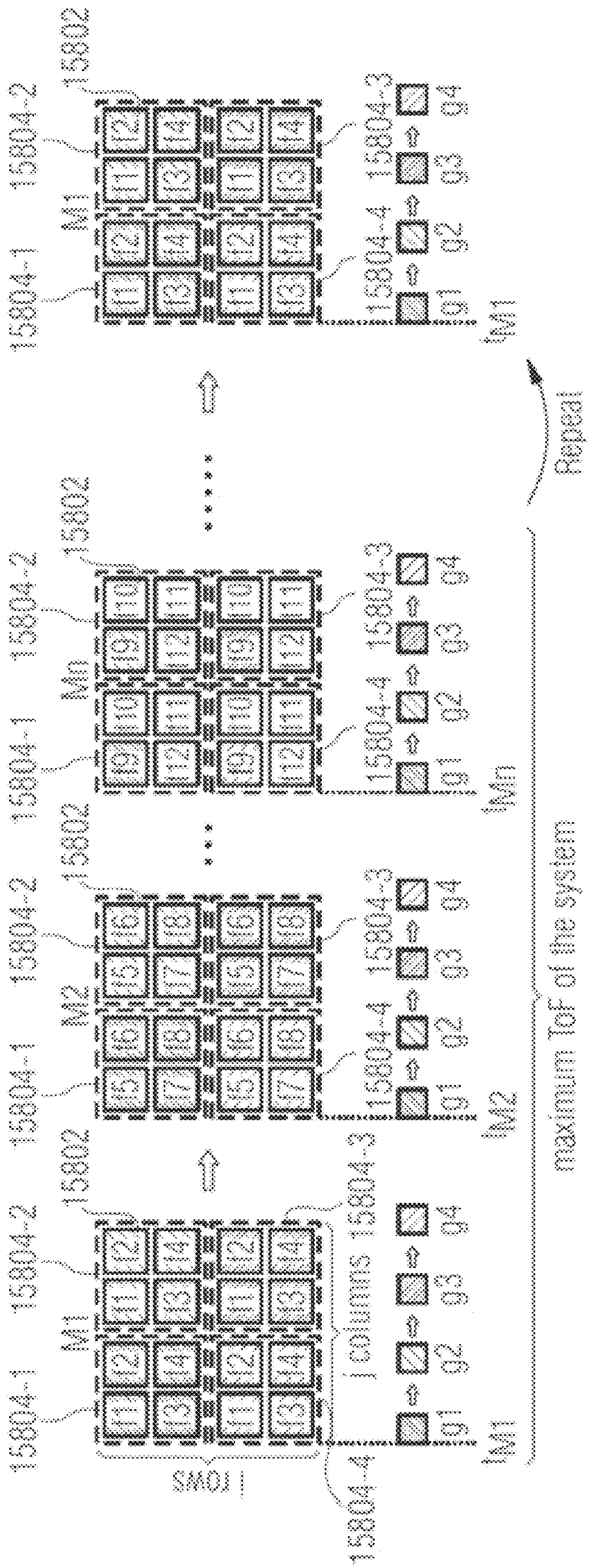

FIG. 160B shows a light emission scheme in a schematic representation in accordance with various embodiments.

Figure 160D:
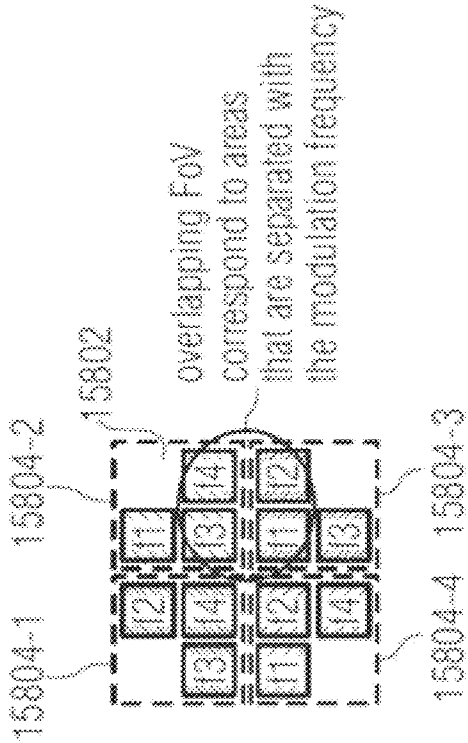
Figure 160C:
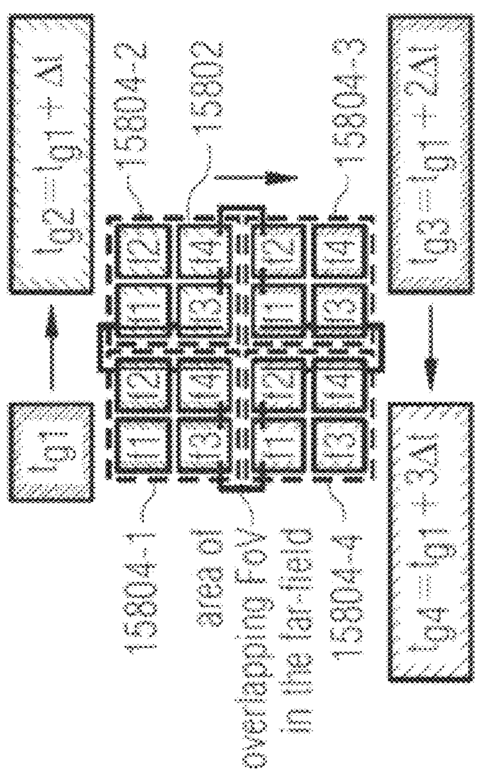

FIG. 160C and FIG. 160D show each an aspect of a light emission scheme in a schematic representation in accordance with various embodiments.

Figure 160F:
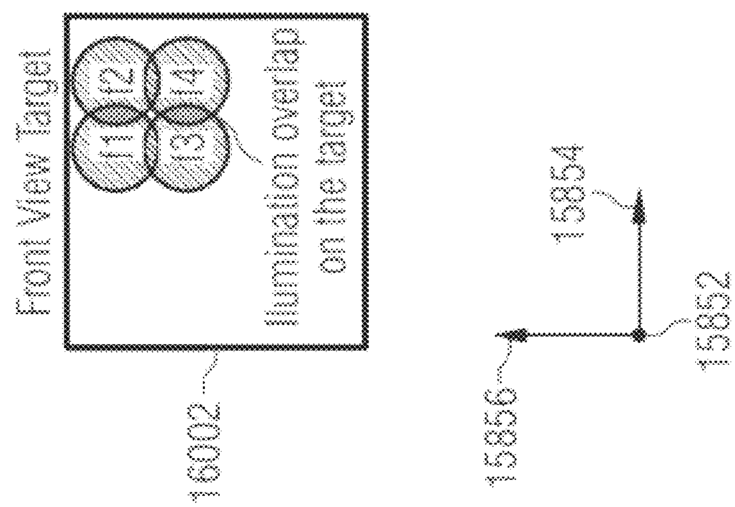
Figure 160E:
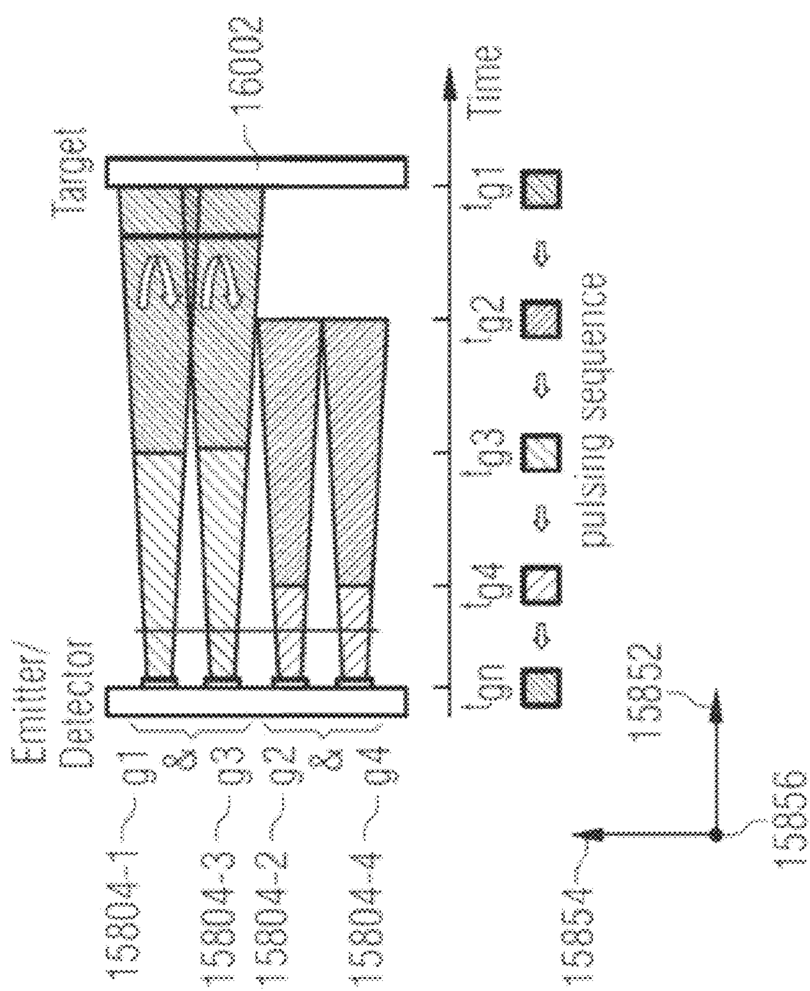

FIG. 160E shows a light emission in accordance with a light emission scheme in a schematic representation in accordance with various embodiments.

FIG. 160F shows a target illuminated by emitted light in a schematic representation in accordance with various embodiments.

Figure 161A:
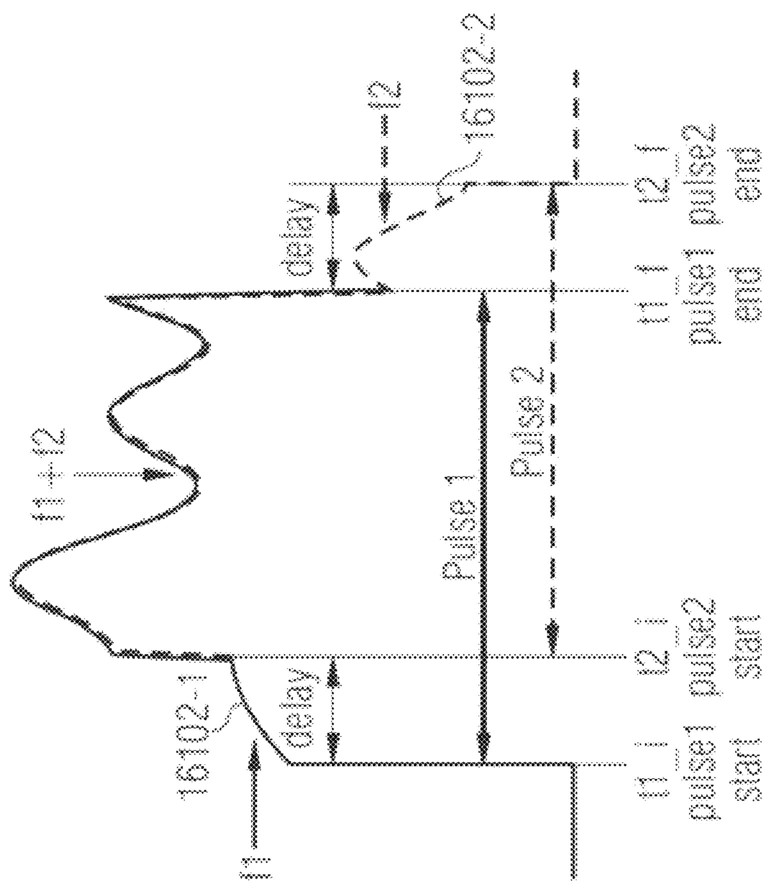

FIG. 161A shows a light pulse identification in a schematic representation in accordance with various embodiments.

Figure 161B:
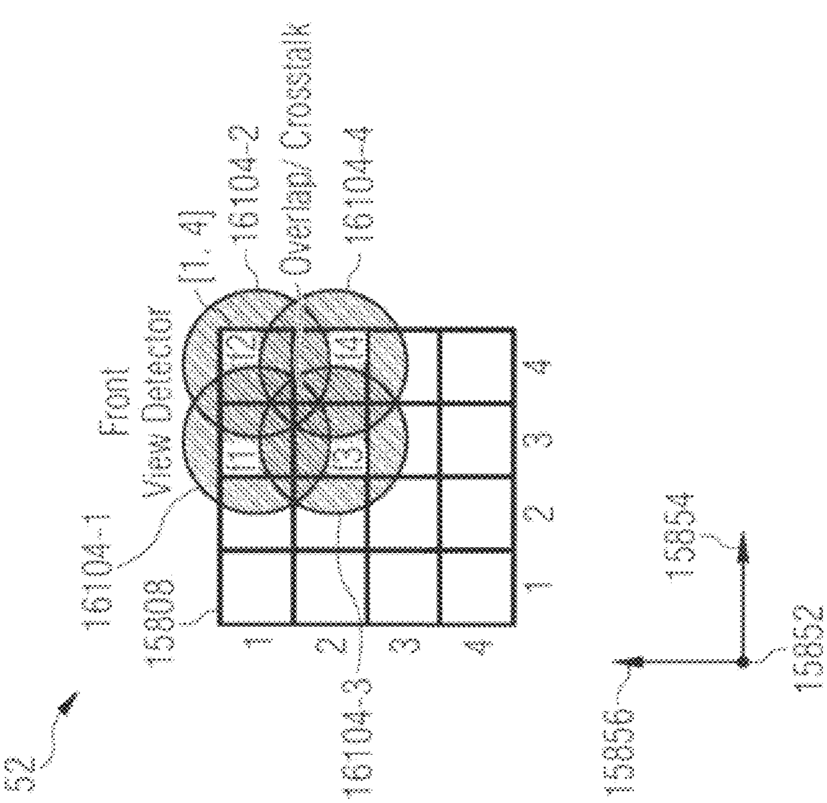

FIG. 161B shows a sensor receiving light in a schematic representation in accordance with various embodiments.

Figure 161C:
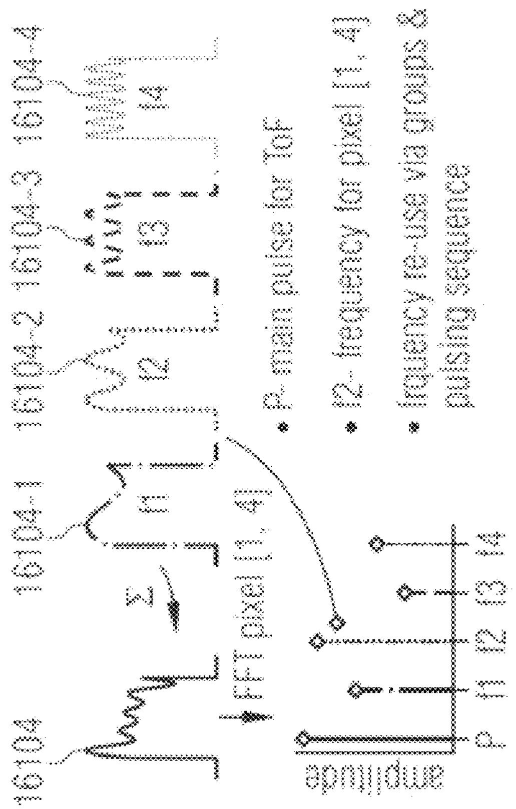

FIG. 161C shows a received light pulse in a schematic representation in accordance with various embodiments.

Figure 162A:
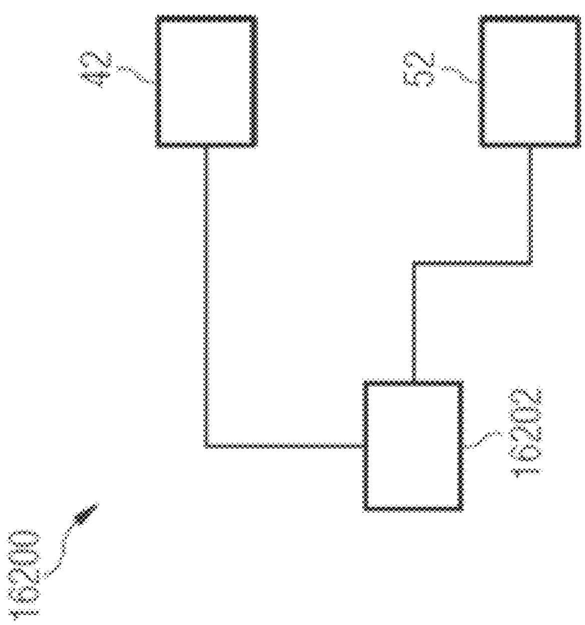

FIG. 162A shows a LIDAR system in a schematic representation in accordance with various embodiments.

Figure 162C:
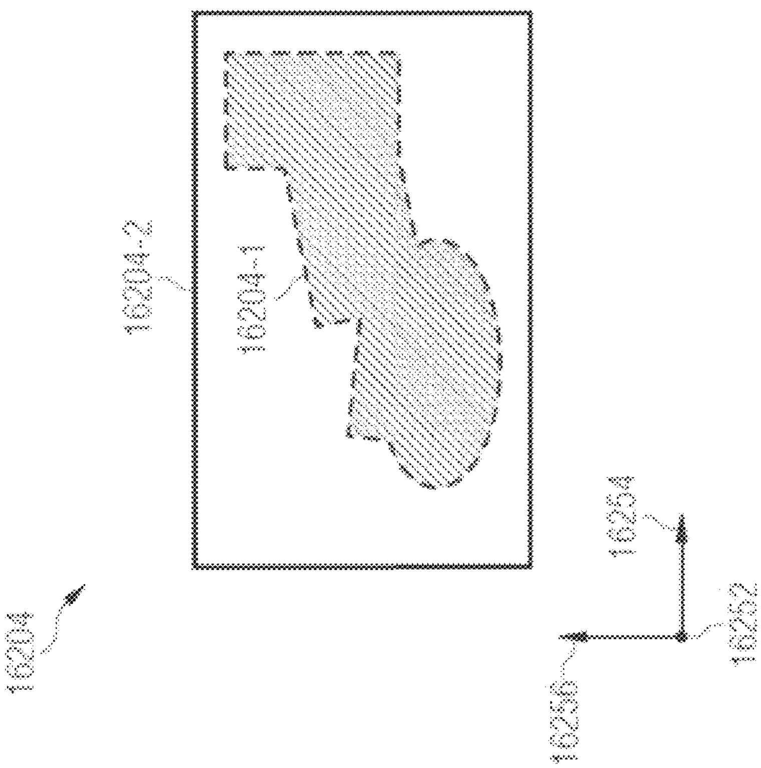
Figure 162B:
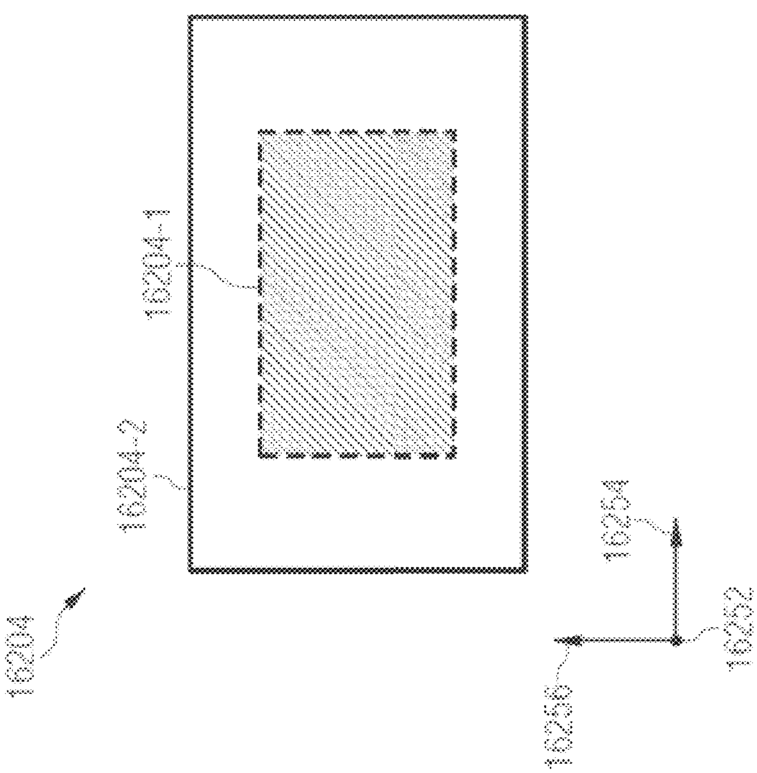

FIG. 162B and FIG. 162C show each a sensor data representation in a schematic representation in accordance with various embodiments.

FIG. 163A to FIG. 163D show each an aspect of a determination of the regions in a sensor data representation in a schematic representation in accordance with various embodiments.

Figure 164A:
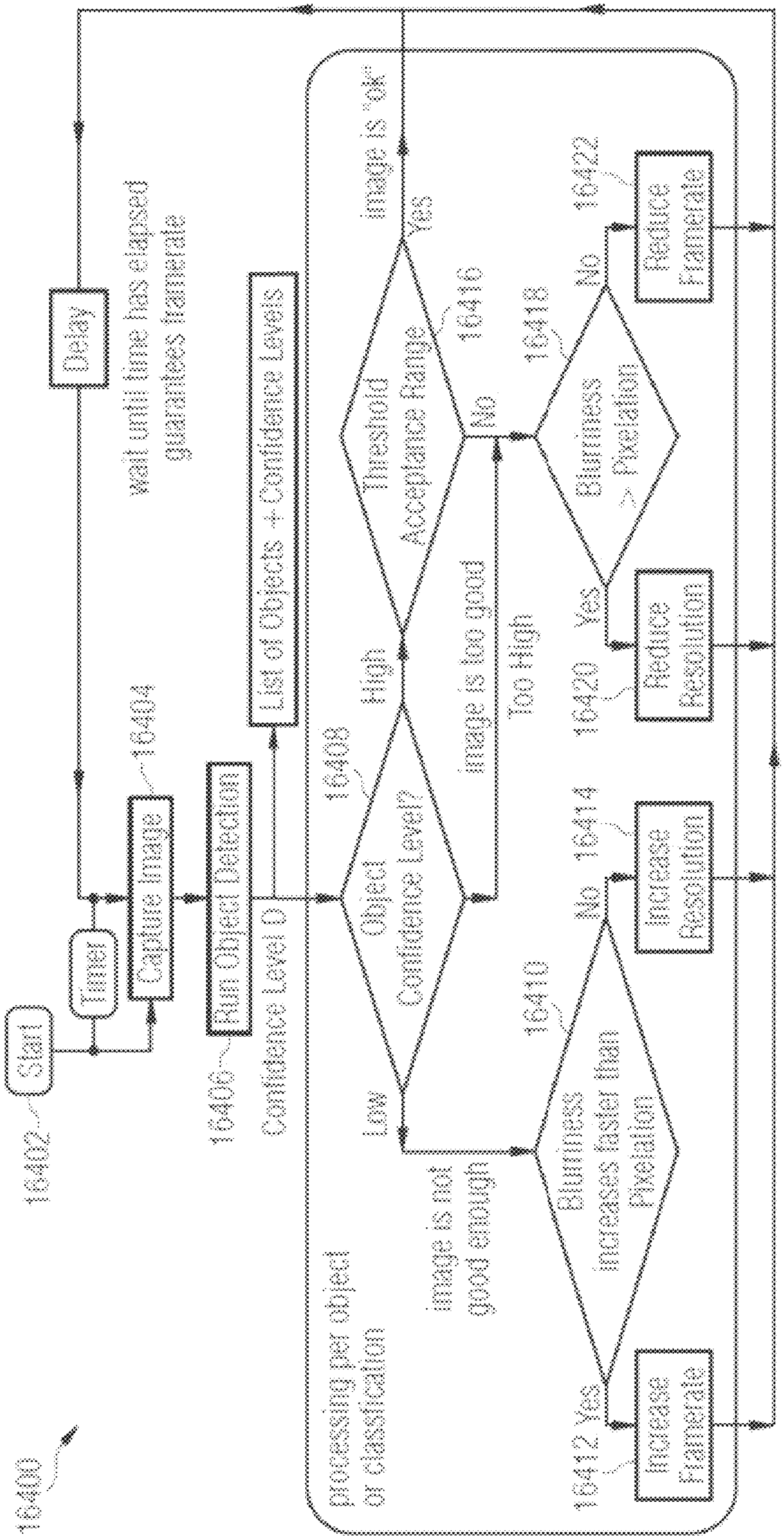
Figure 164B:
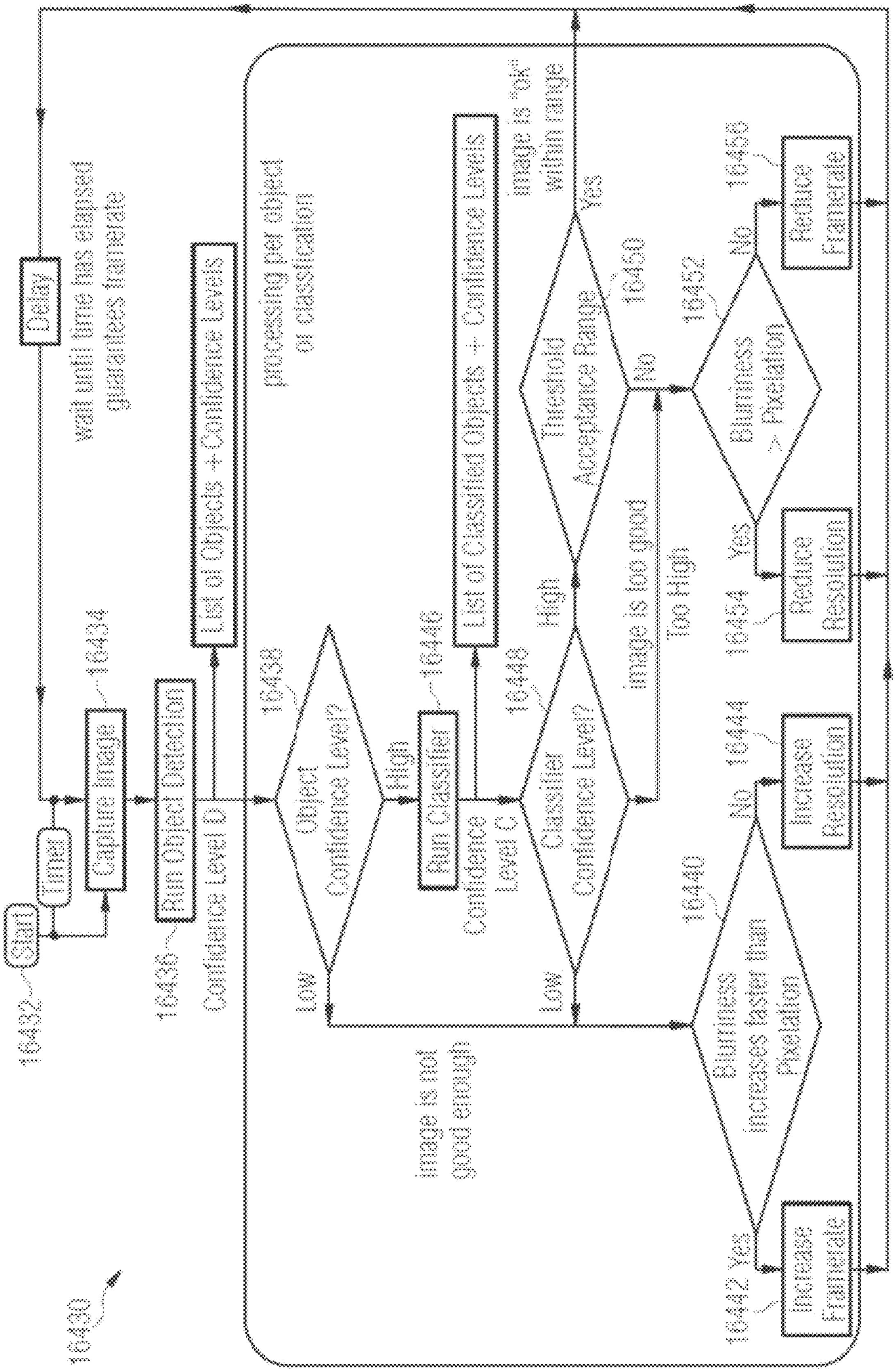

FIG. 164A and FIG. 164B show each a flow diagram of an algorithm in accordance with various embodiments.

Figure 164C:
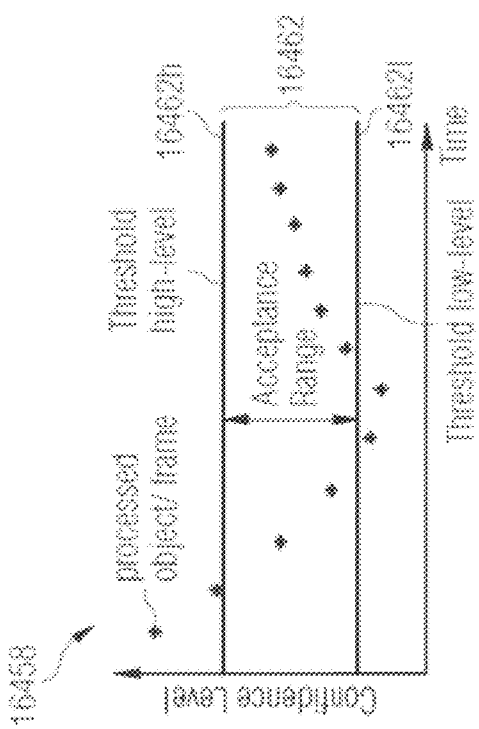

FIG. 164C shows a graph describing a confidence level over time in accordance with various embodiments.

Figure 164D:
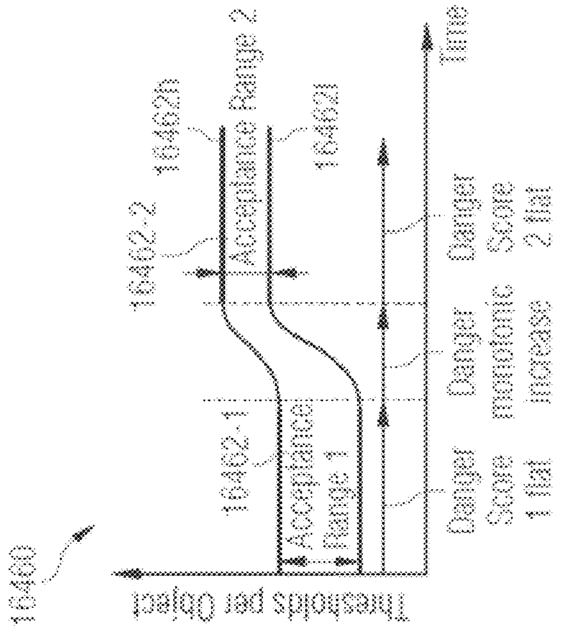

FIG. 164D shows a graph describing a threshold acceptance range over time in accordance with various embodiments.

Figure 164E:
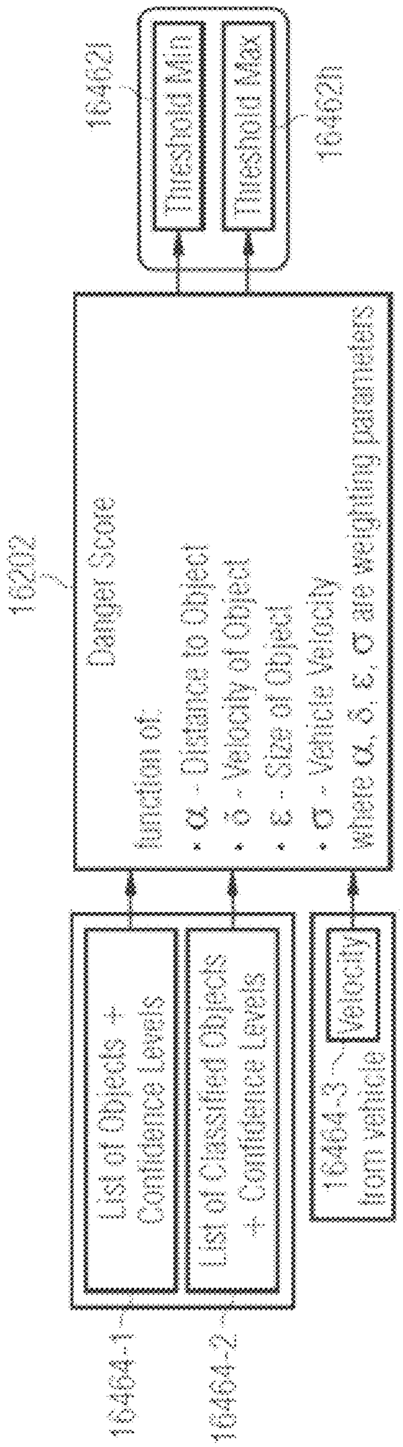

FIG. 164E shows a determination of a threshold acceptance range in a schematic representation in accordance with various embodiments.

Figure 165A:
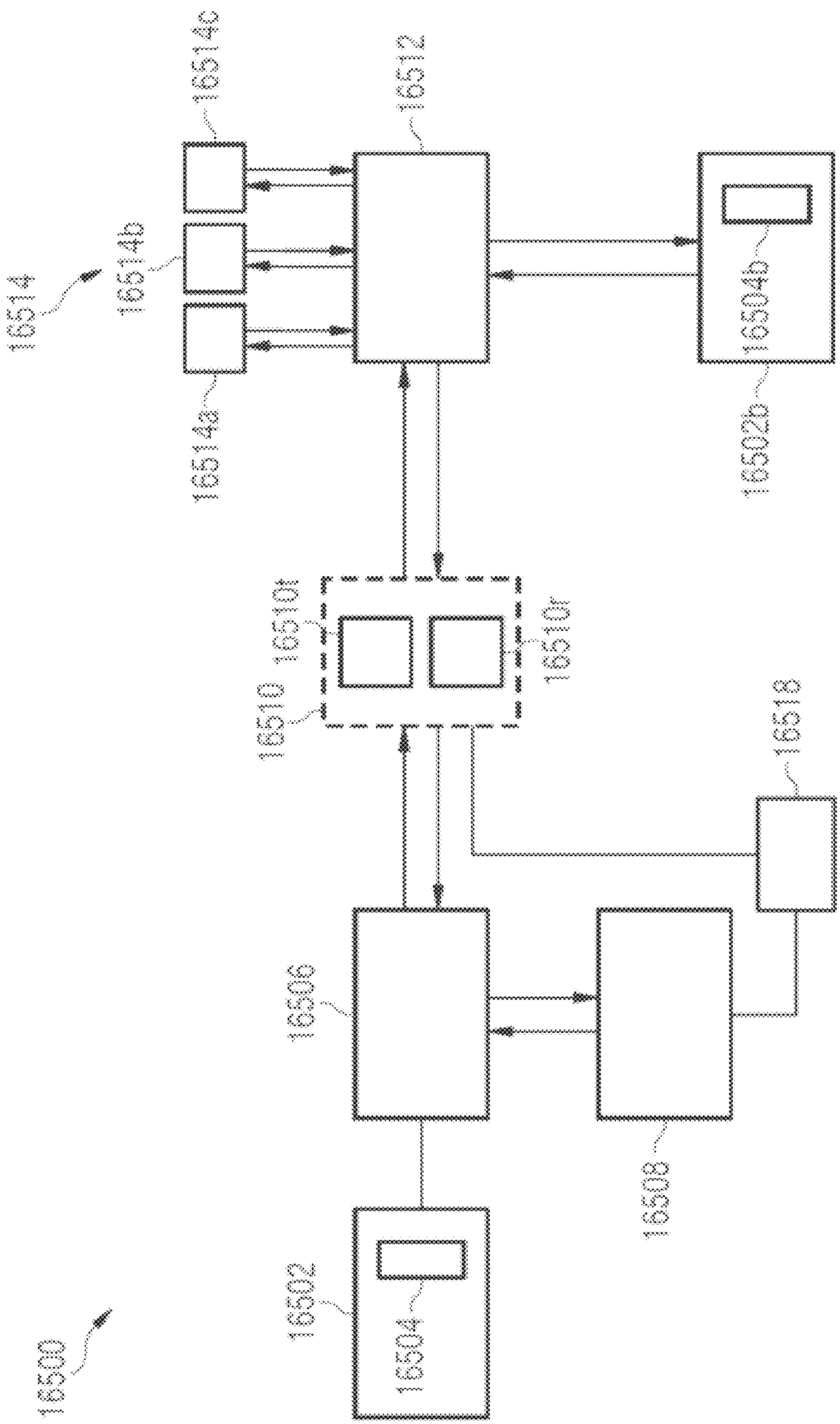
Figure 165B:
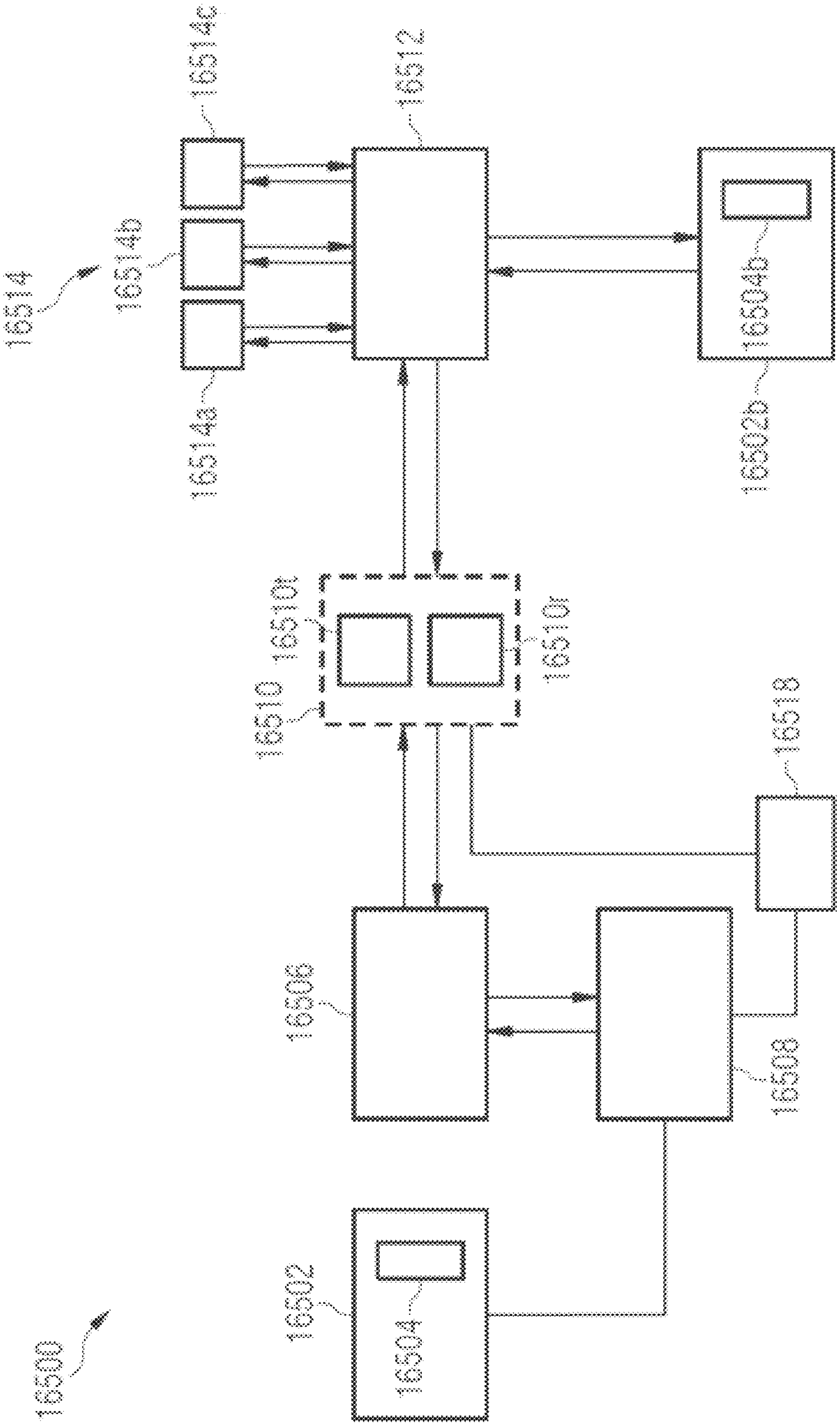
Figure 165C:
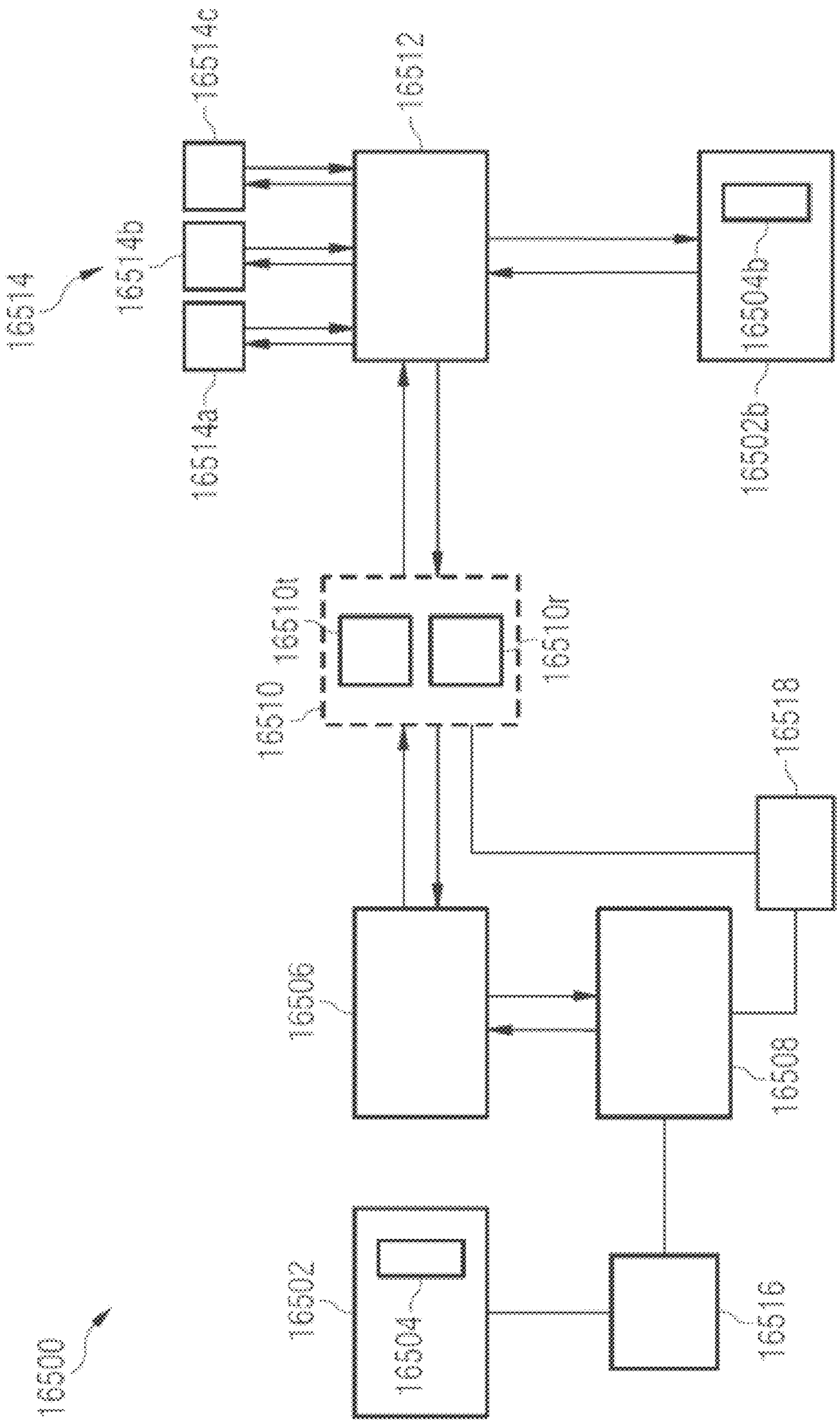

FIG. 165A to FIG. 165C show each a sensor system in a schematic representation in accordance with various embodiments.

FIG. 166A to FIG. 166D show each a sensor system in a schematic representation in accordance with various embodiments.

Figure 167:
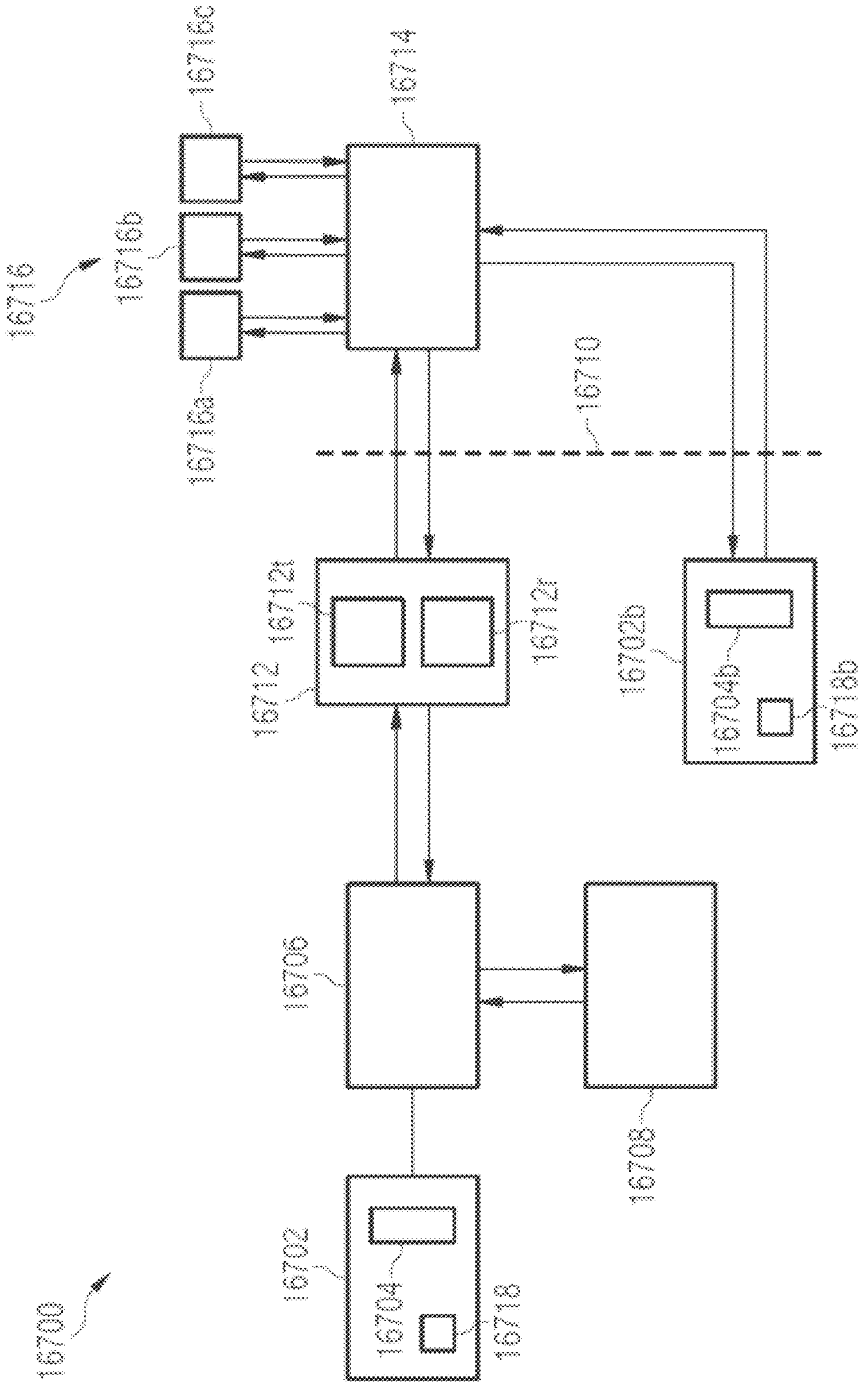

FIG. 167 shows a sensor system in a schematic representation in accordance with various embodiments.

Figure 168A:
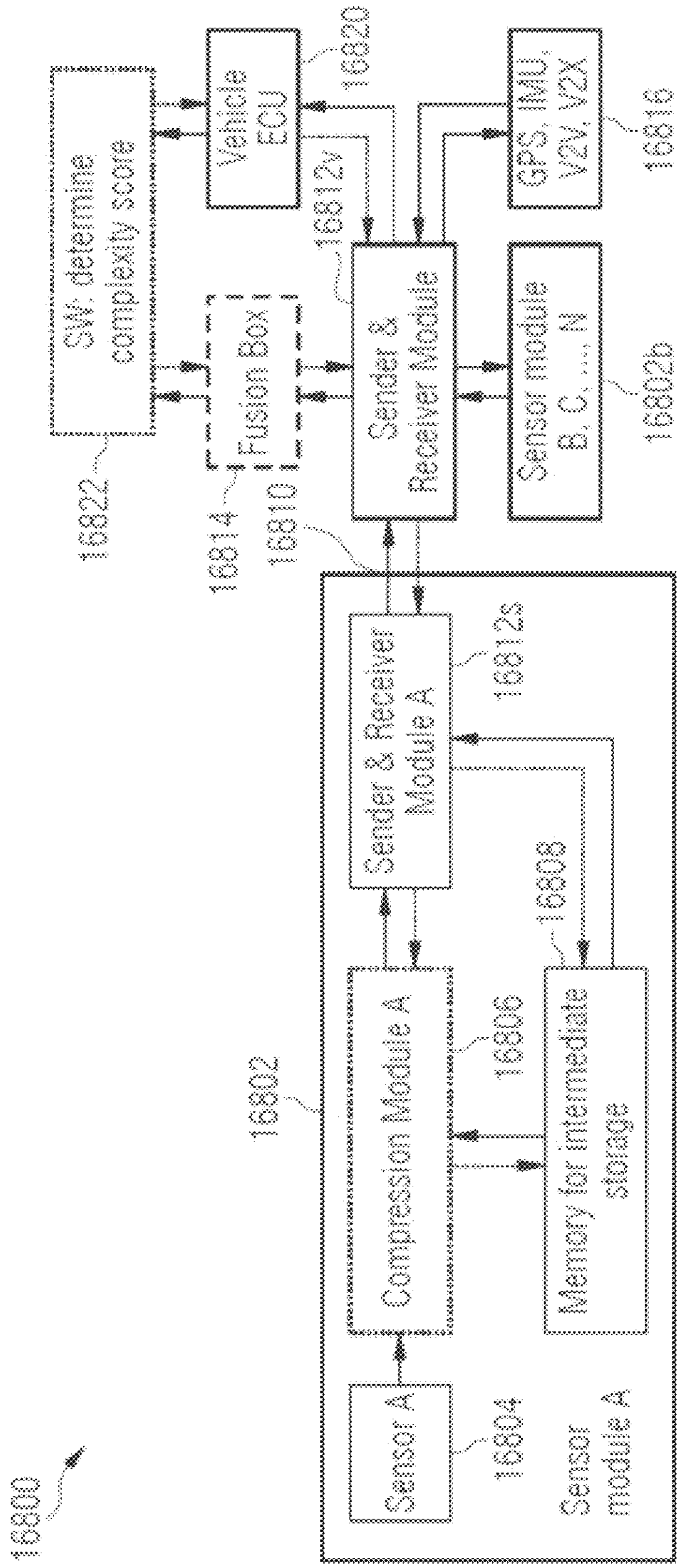

FIG. 168A shows a sensor system in a schematic representation in accordance with various embodiments.

Figure 168B:
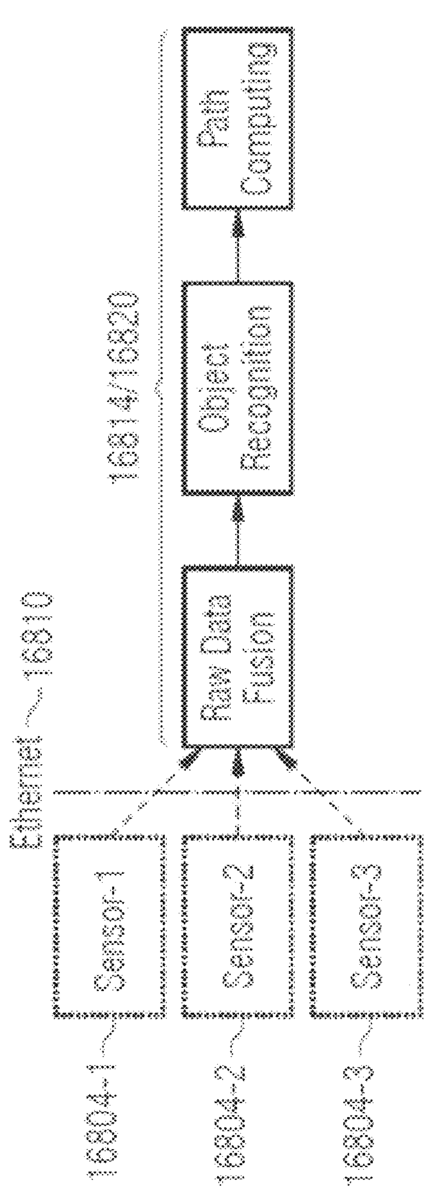
Figure 168C:
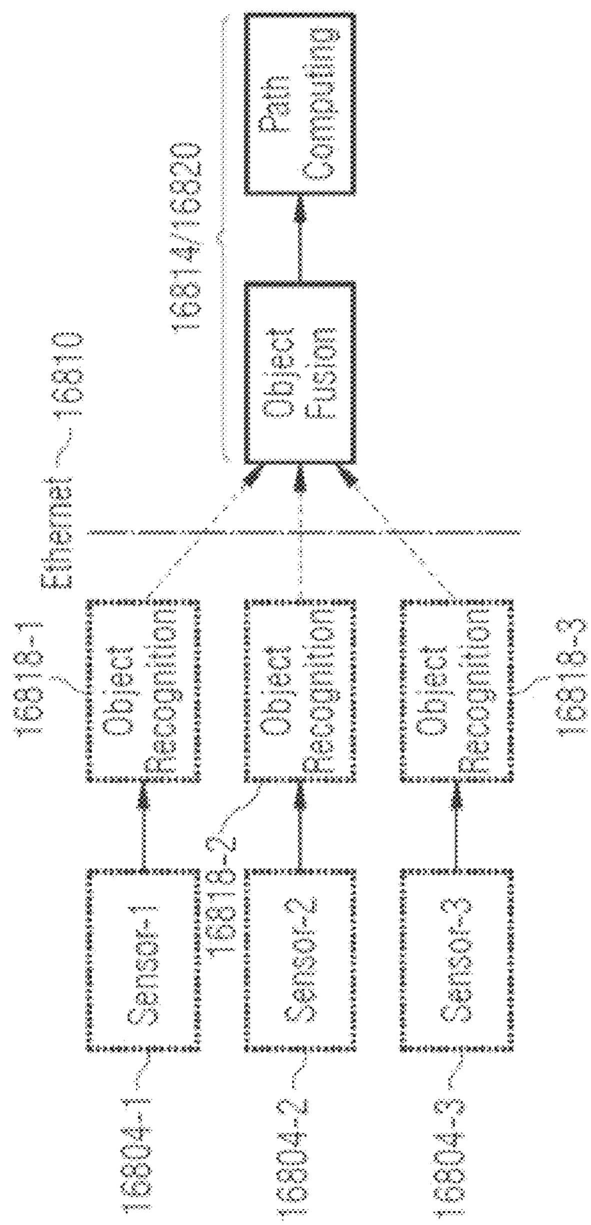

FIG. 168B and FIG. 168C show each a possible configuration of a sensor system in a schematic representation in accordance with various embodiments.

Figure 169A:
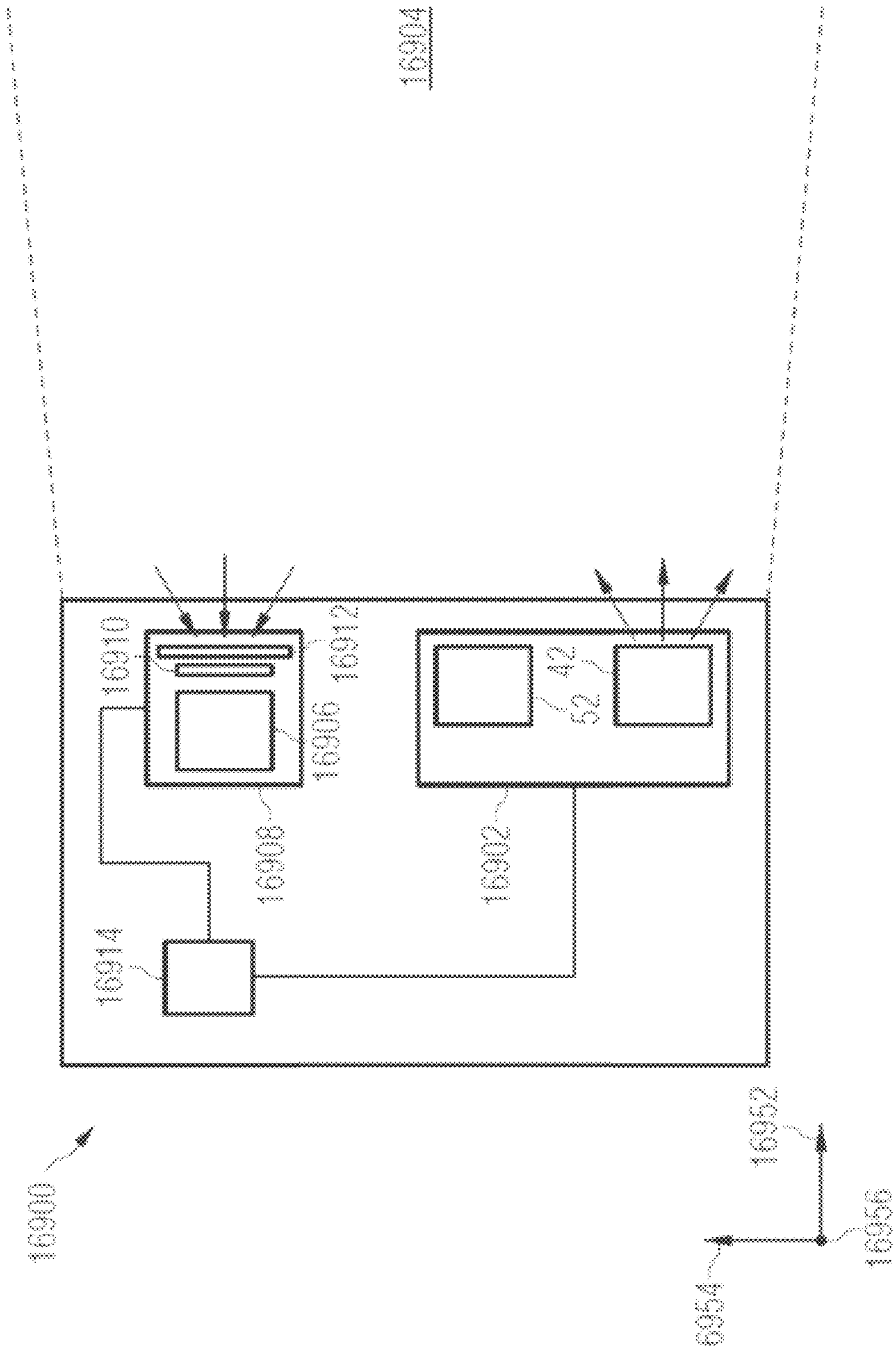

FIG. 169A shows a sensor device in a schematic representation in accordance with various embodiments.

Figure 169B:
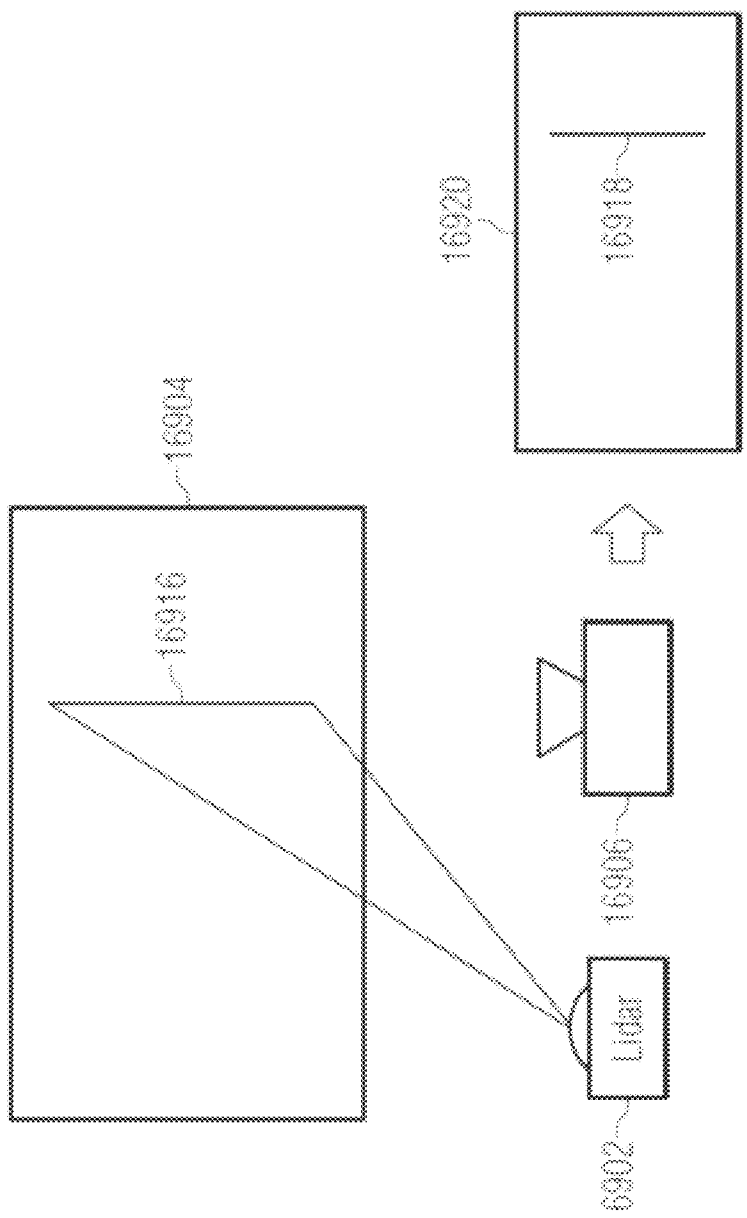

FIG. 169B shows a detection of infra-red light in a schematic representation in accordance with various embodiments.

Figure 169C:
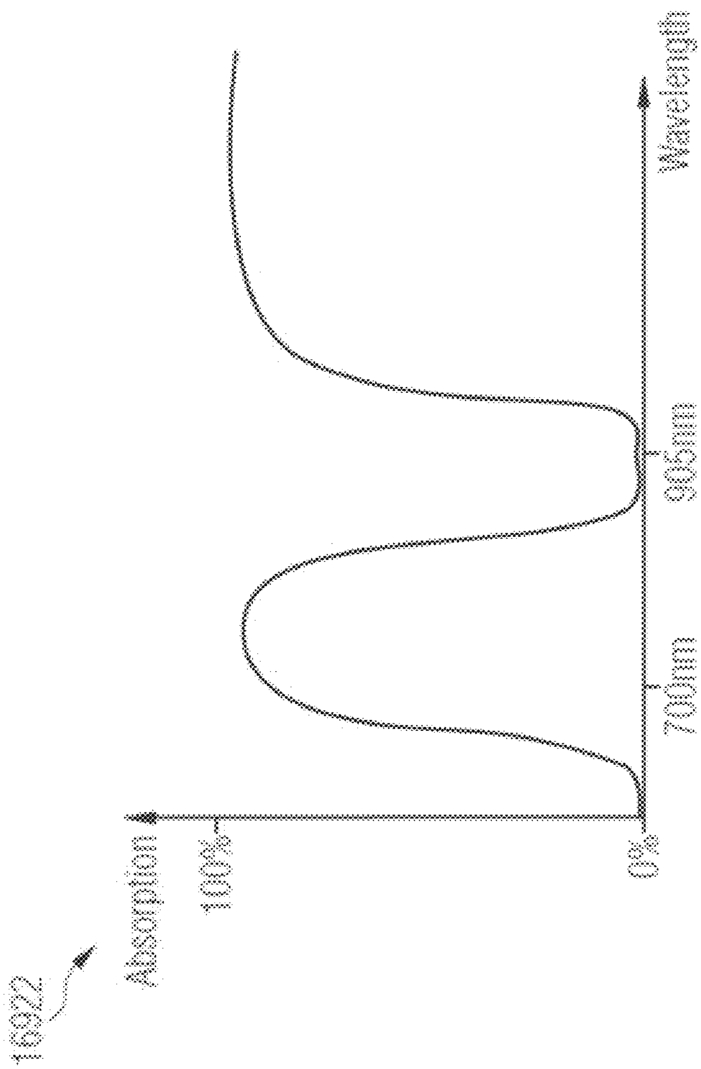

FIG. 169C shows a graph showing a configuration of an infra-red filter in accordance with various embodiments.

FIG. 169D to FIG. 169G show each an infra-red image in a schematic representation in accordance with various embodiments.

Figure 170:
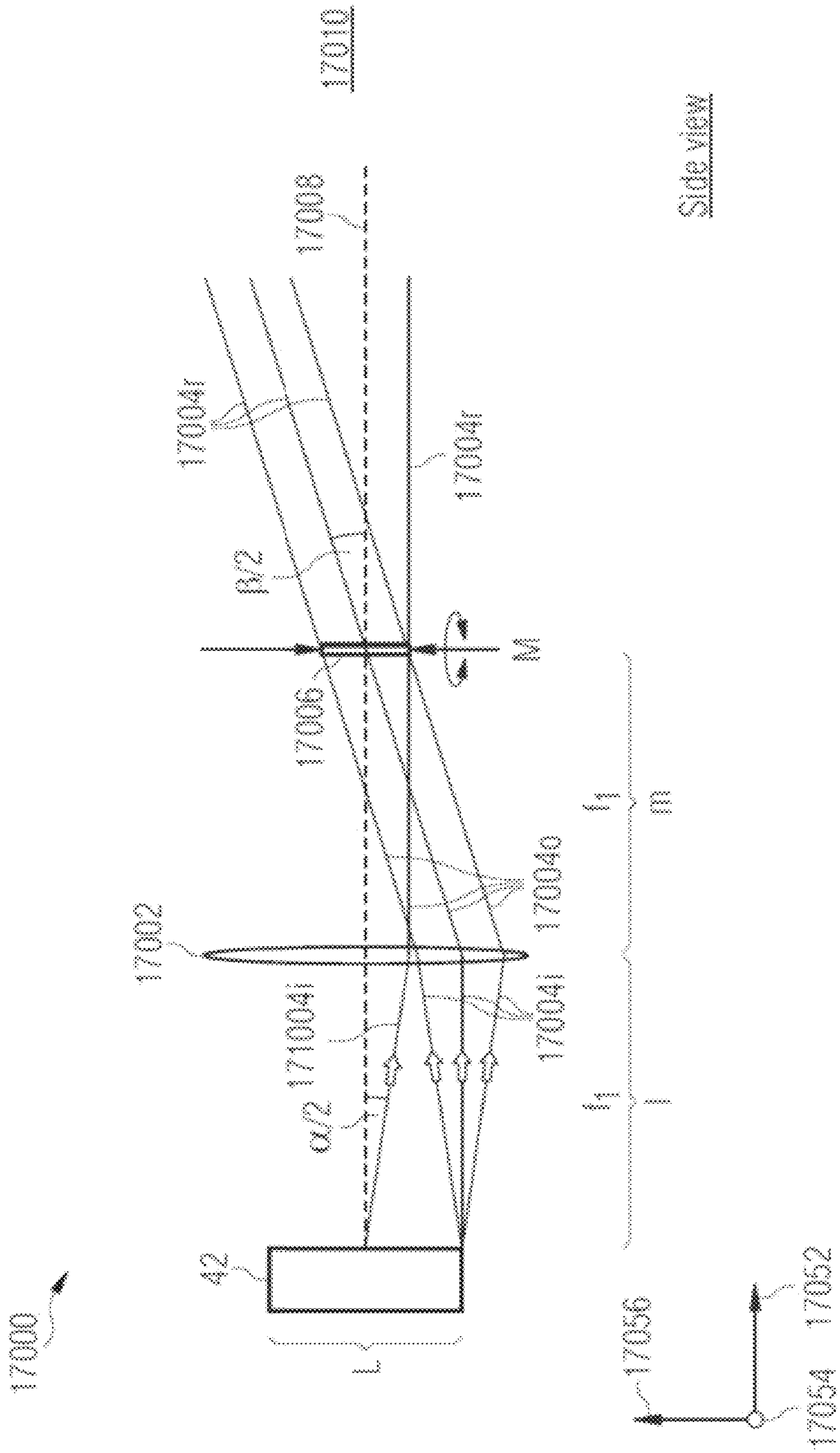

FIG. 170 shows a side view of an optics arrangement in a schematic representation in accordance with various embodiments.

Figure 171A:
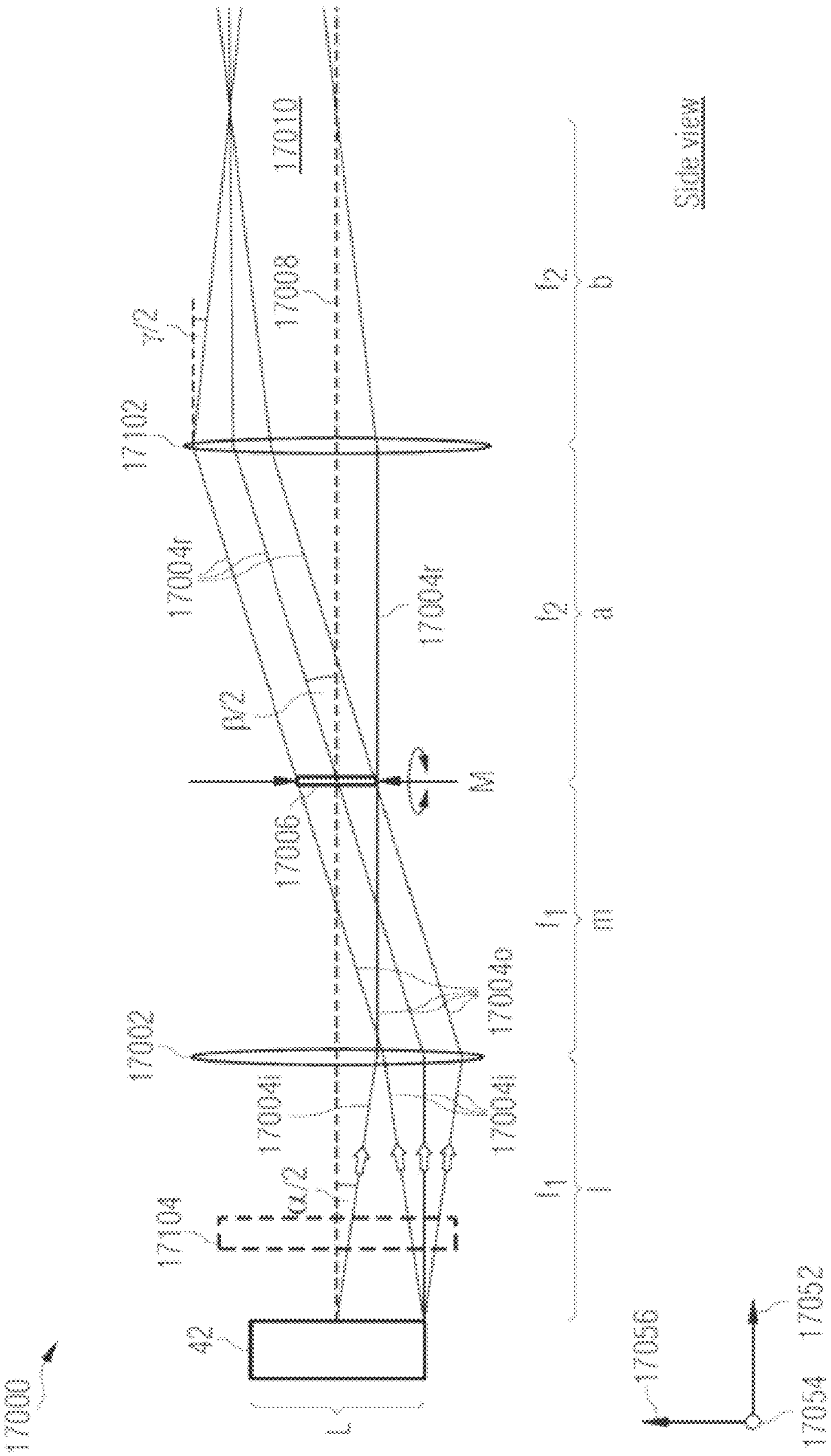

FIG. 171A shows a side view of an optics arrangement in a schematic representation in accordance with various embodiments.

Figure 171B:
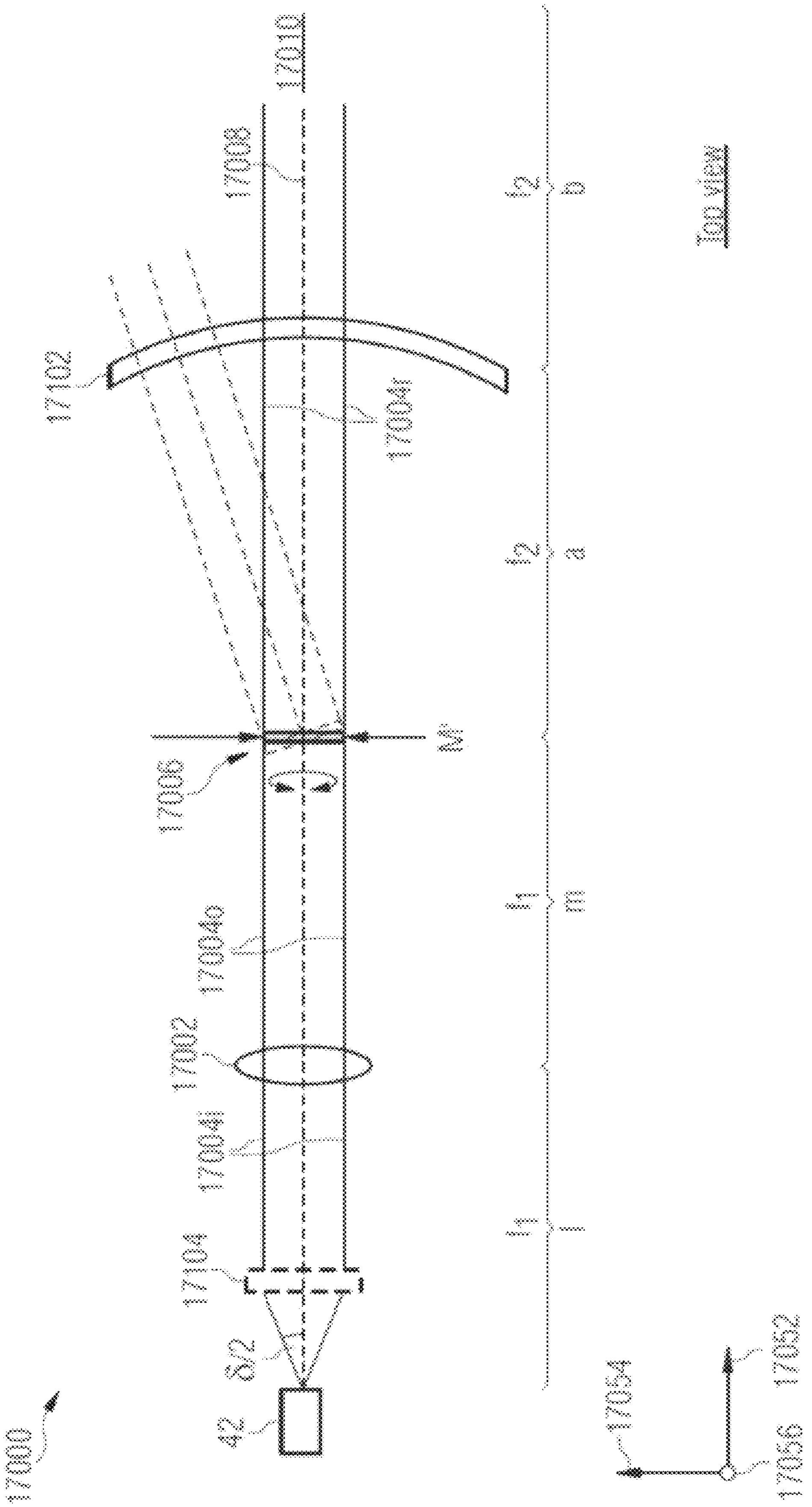

FIG. 171B shows a top view of an optics arrangement in a schematic representation in accordance with various embodiments.

Figure 171C:
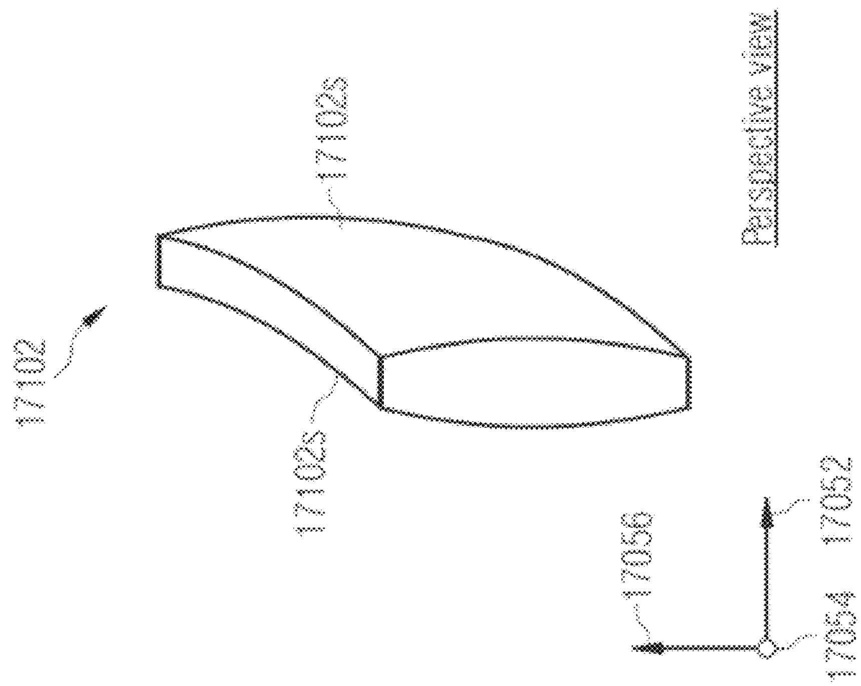

FIG. 171C shows a correction lens in a perspective view in a schematic representation in accordance with various embodiments.

Figure 172A:
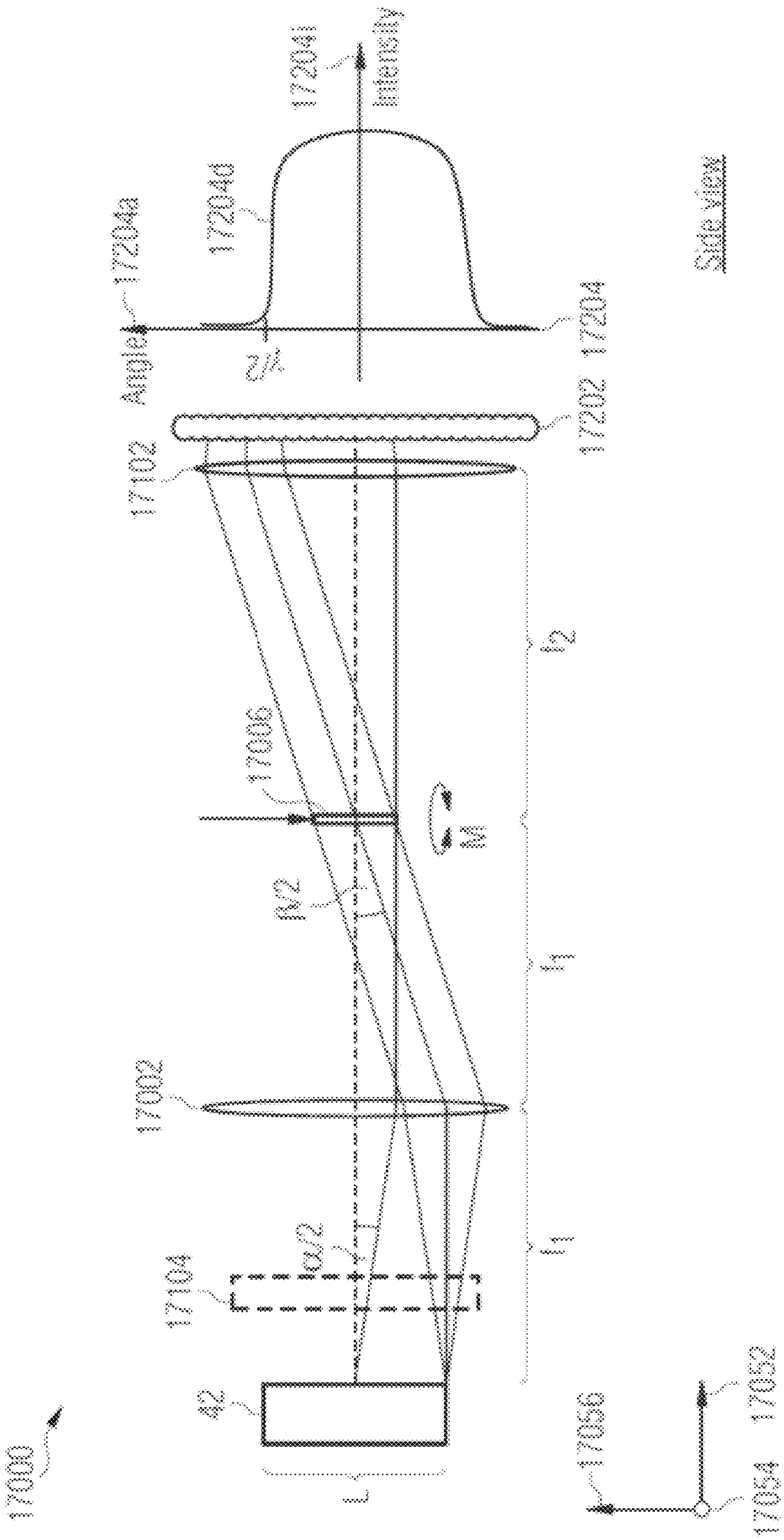
Figure 172B:
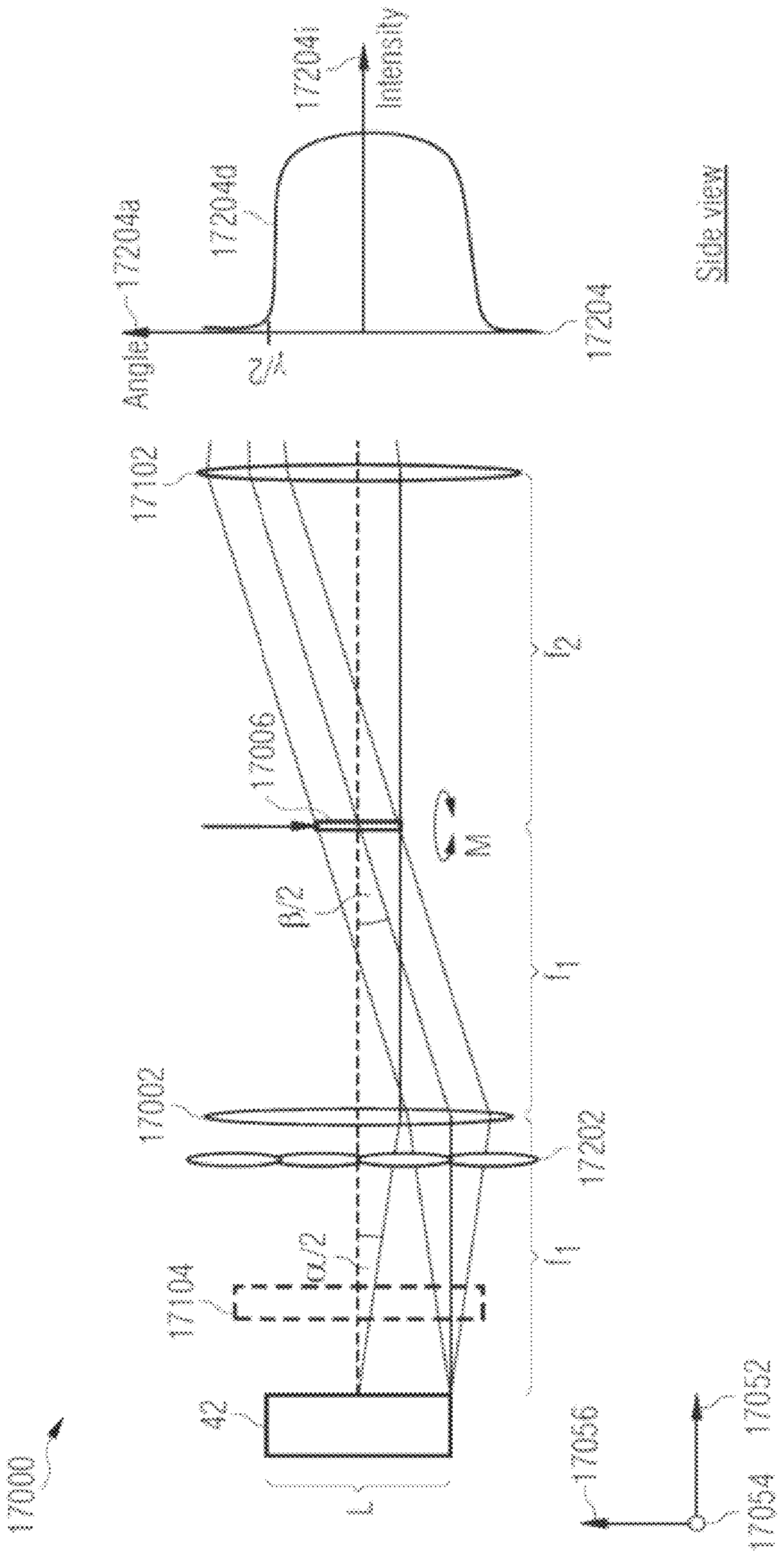
Figure 172C:
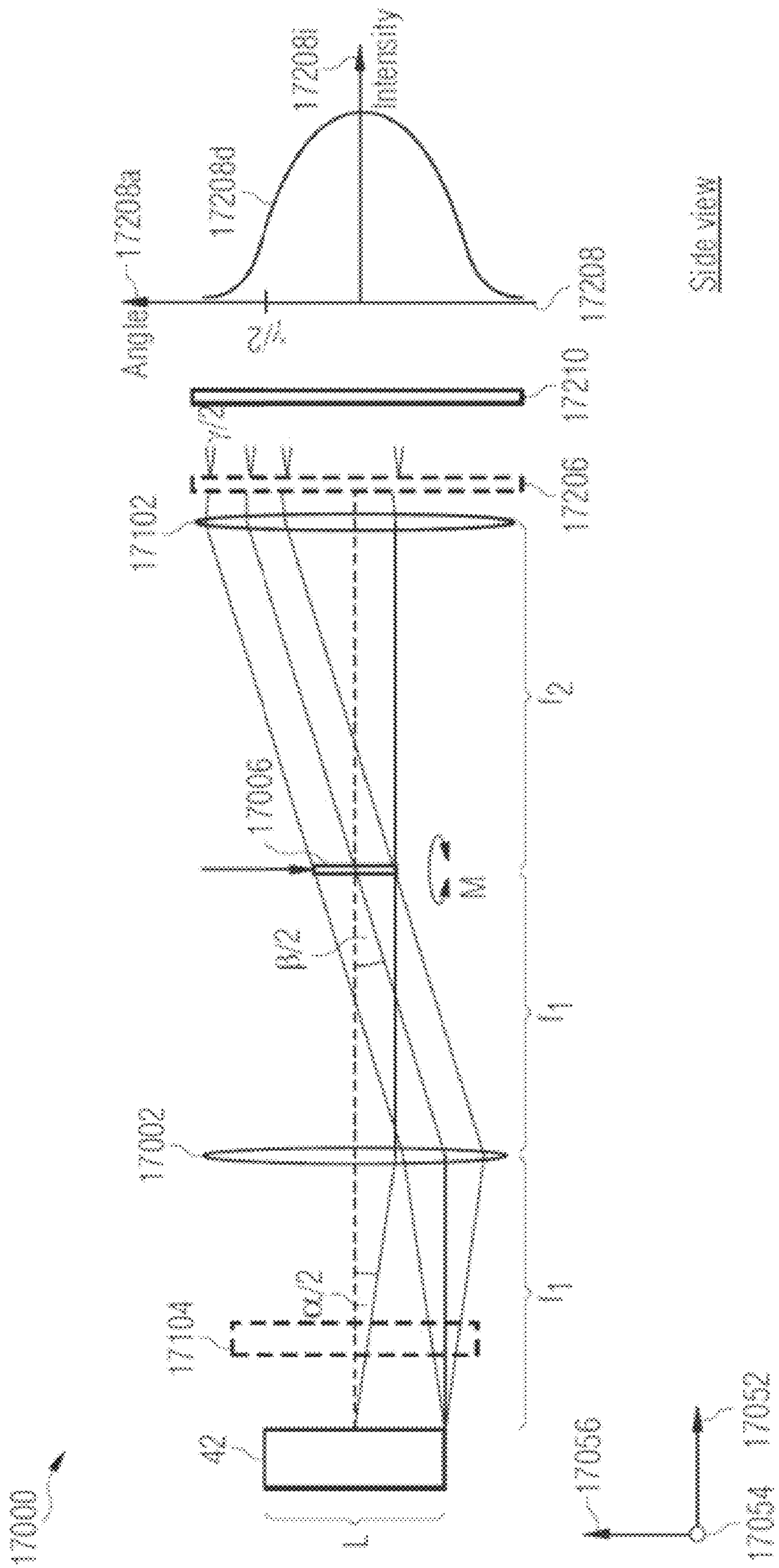

FIG. 172A to FIG. 172C show each a side view of an optics arrangement in a schematic representation in accordance with various embodiments.

Figure 173A:
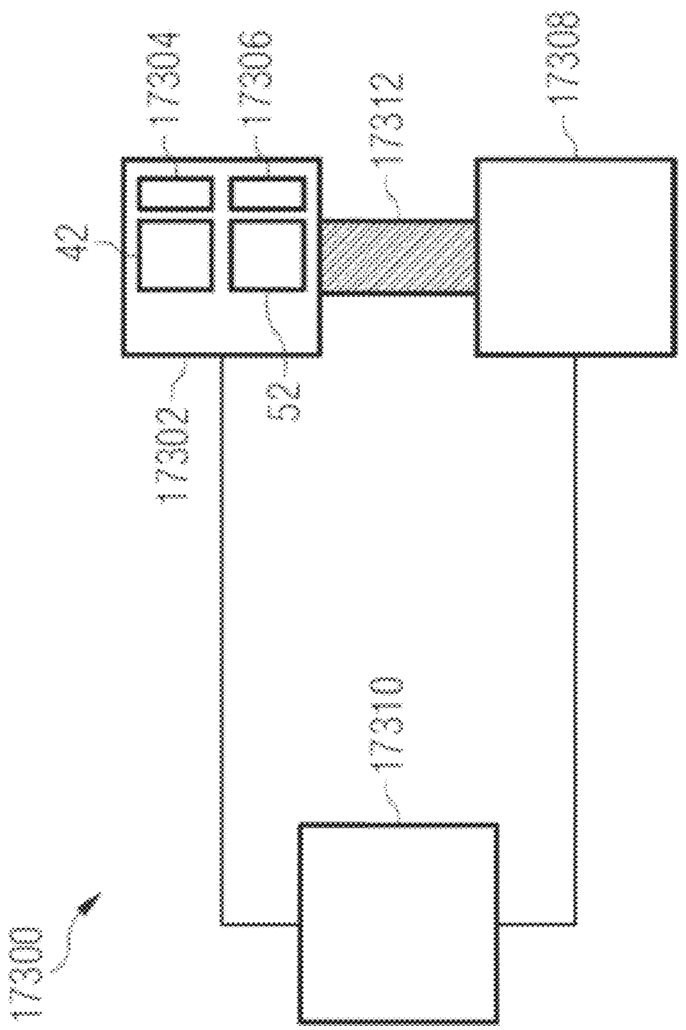

FIG. 173A shows an illumination and sensing system in a schematic representation in accordance with various embodiments.

Figure 173B:
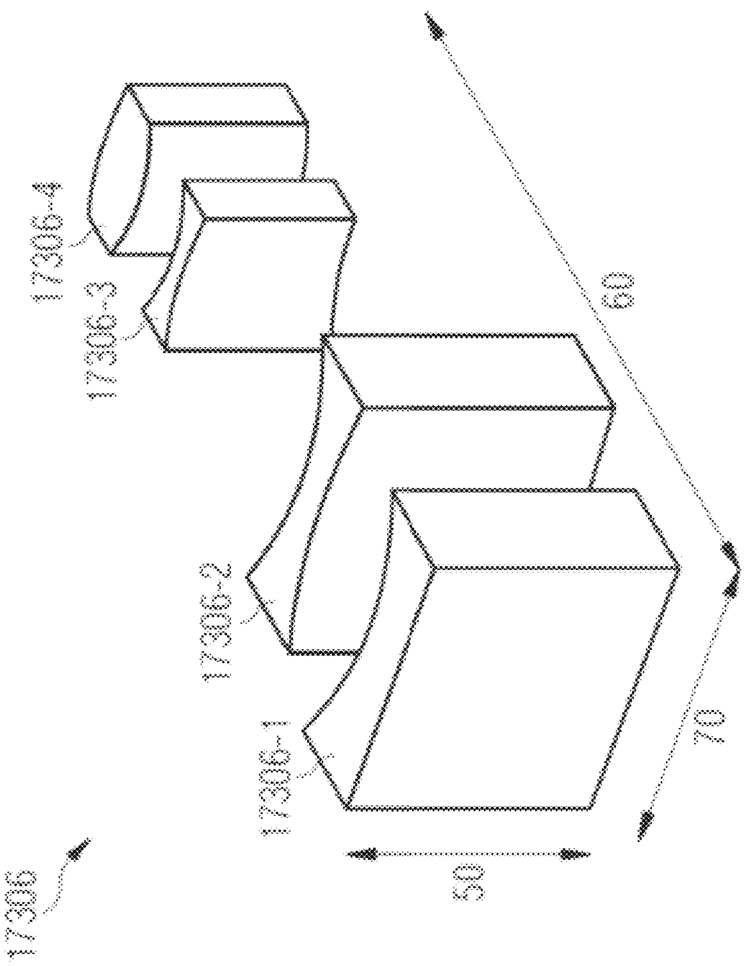

FIG. 173B shows a receiver optics arrangement in a schematic representation in accordance with various embodiments.

Figure 173C:
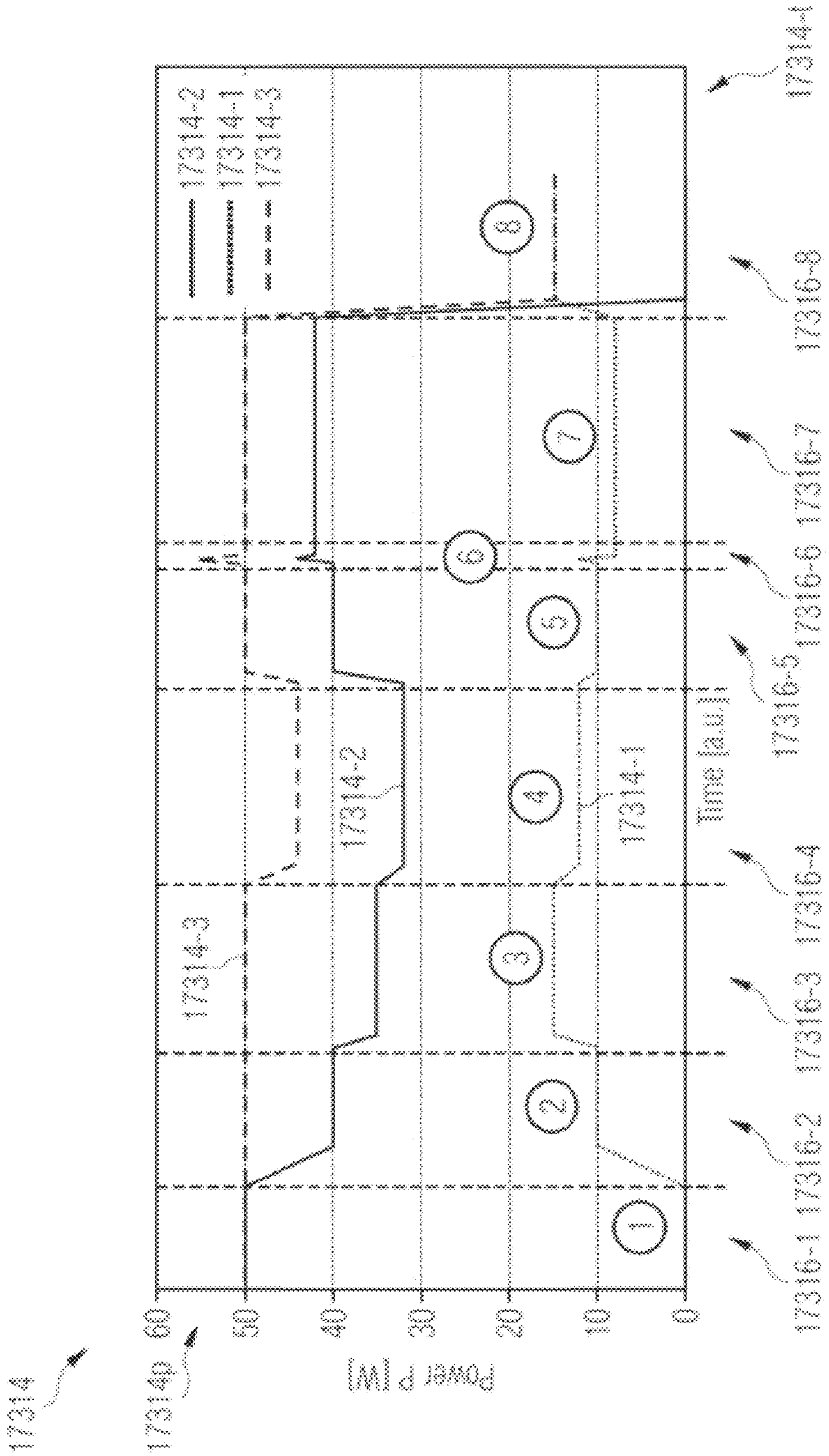

FIG. 173C shows a time diagram illustrating an operation of a light emission controller in accordance with various embodiments.

Figure 174B:
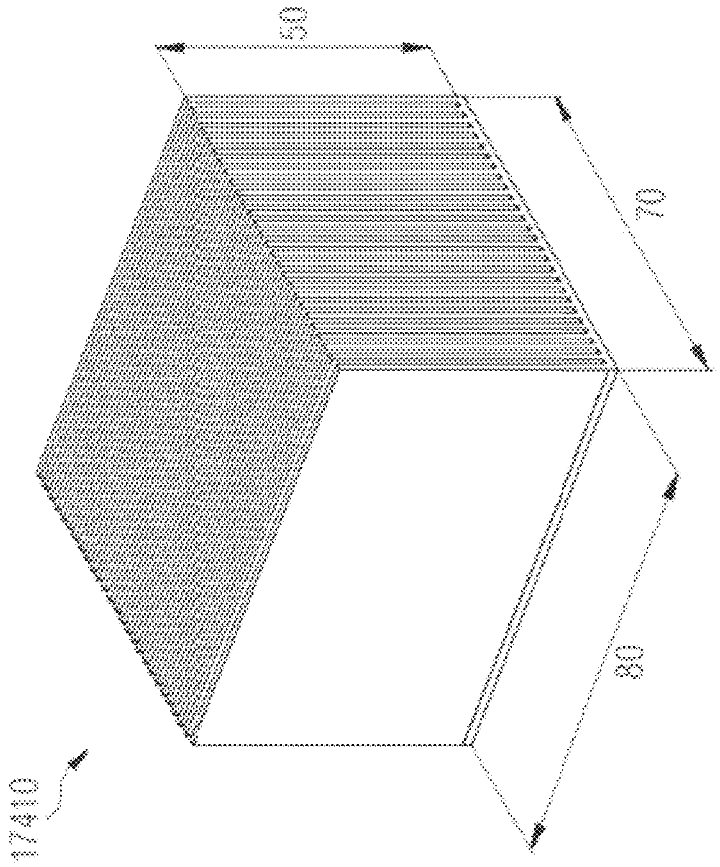
Figure 174A:
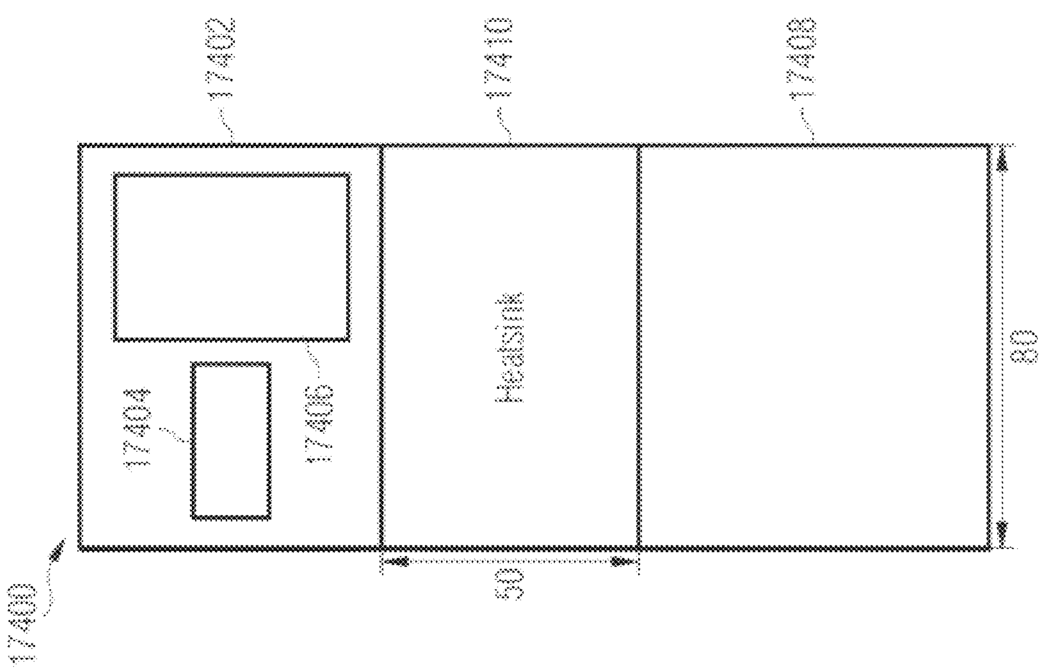

FIG. 174A shows a front view of an illumination and sensing system in a schematic representation in accordance with various embodiments.

FIG. 174B shows a perspective view of a heatsink in a schematic representation in accordance with various embodiments.

Figure 174D:
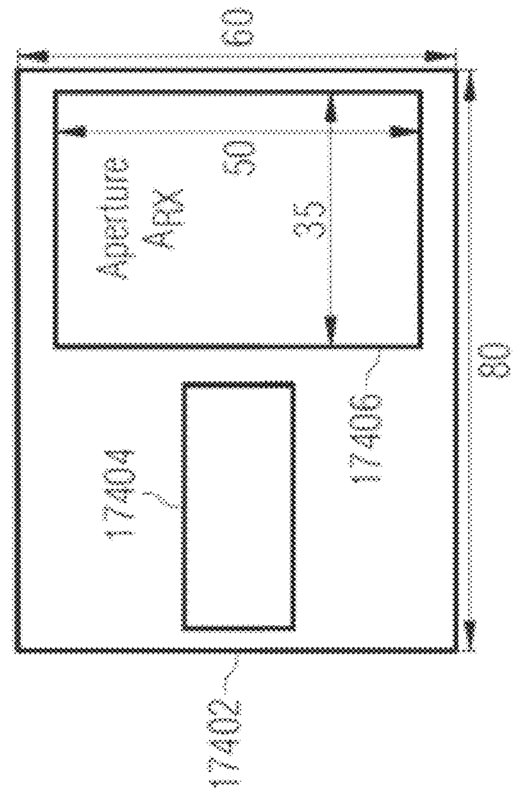
Figure 174C:
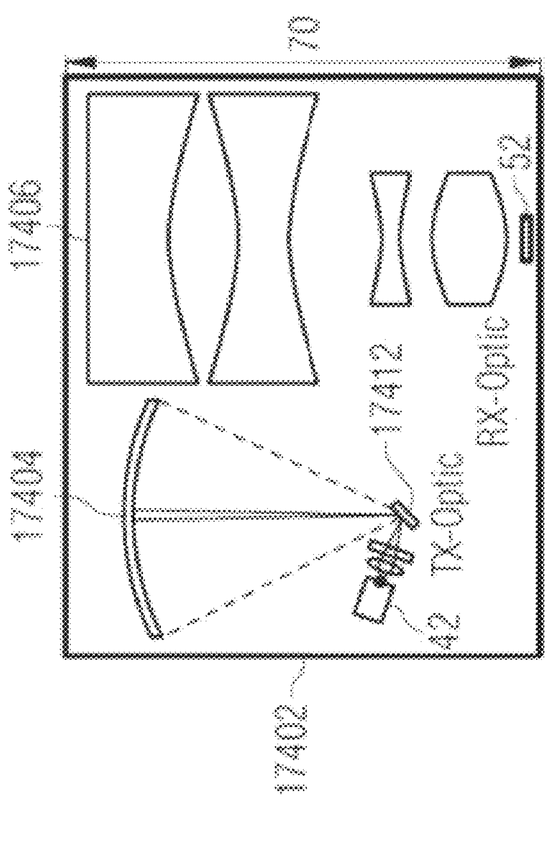

FIG. 174C shows a top view of an emitter side and a receiver side of a LIDAR system in a schematic representation in accordance with various embodiments.

FIG. 174D shows a front view of an emitter side and a receiver side of a LIDAR system in a schematic representation in accordance with various embodiments.

Figure 174E:
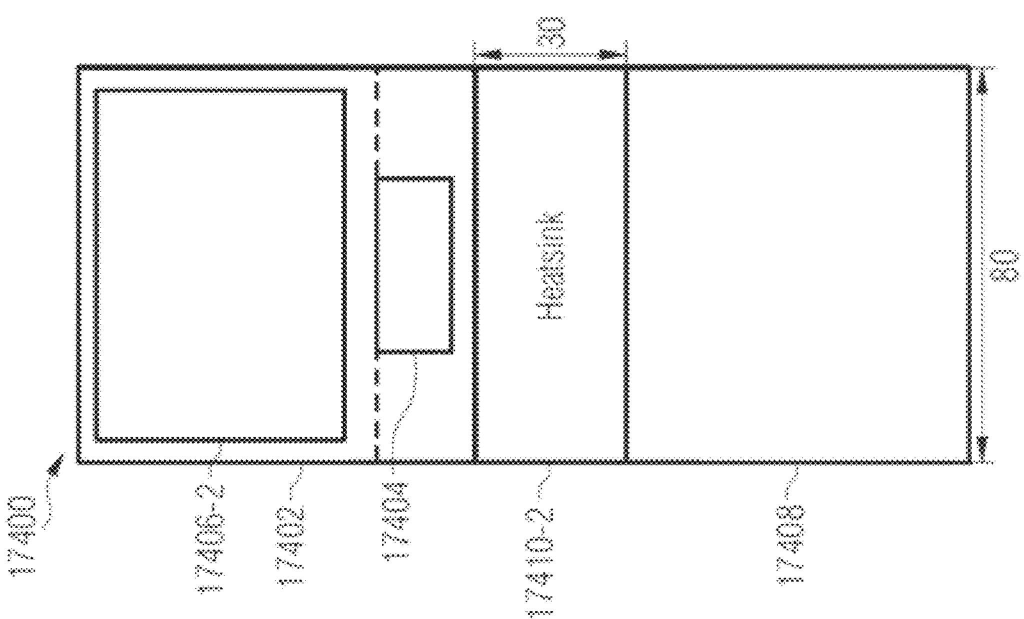

FIG. 174E shows a front view of an illumination and sensing system in a schematic representation in accordance with various embodiments.

Figure 174F:
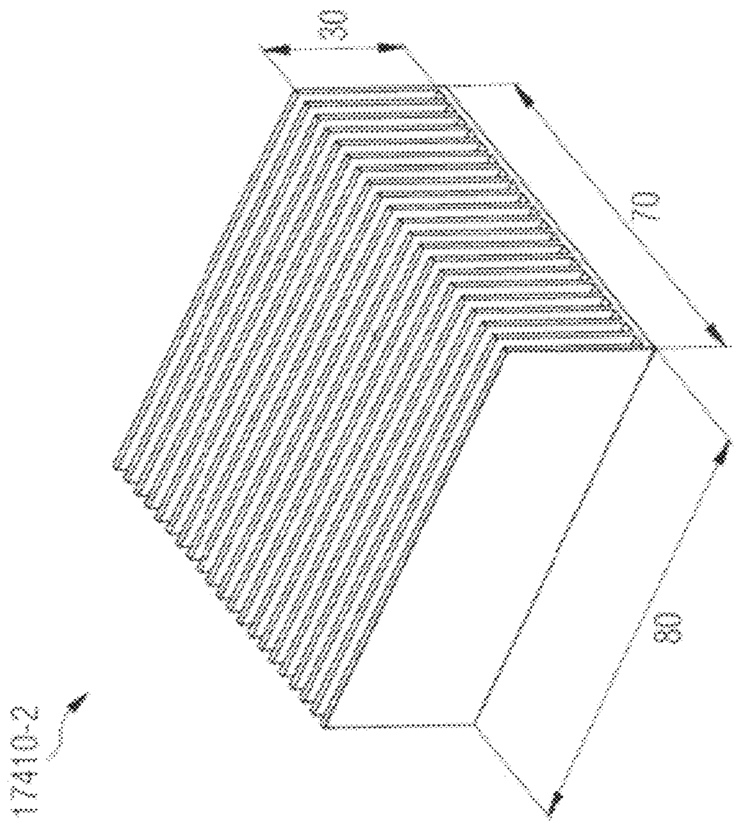

FIG. 174F shows a perspective view of a heatsink in a schematic representation in accordance with various embodiments.

Figure 174G:
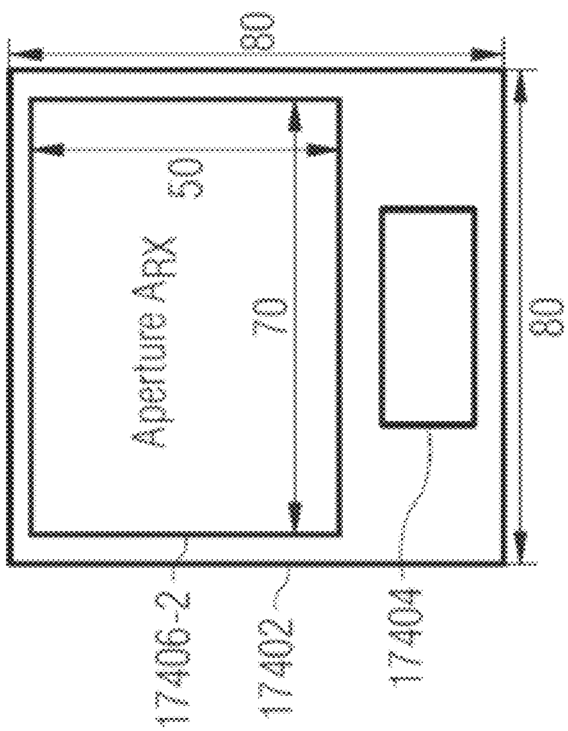

FIG. 174G shows a front view of an emitter side and a receiver side of a LIDAR system in a schematic representation in accordance with various embodiments.

Figure 175:
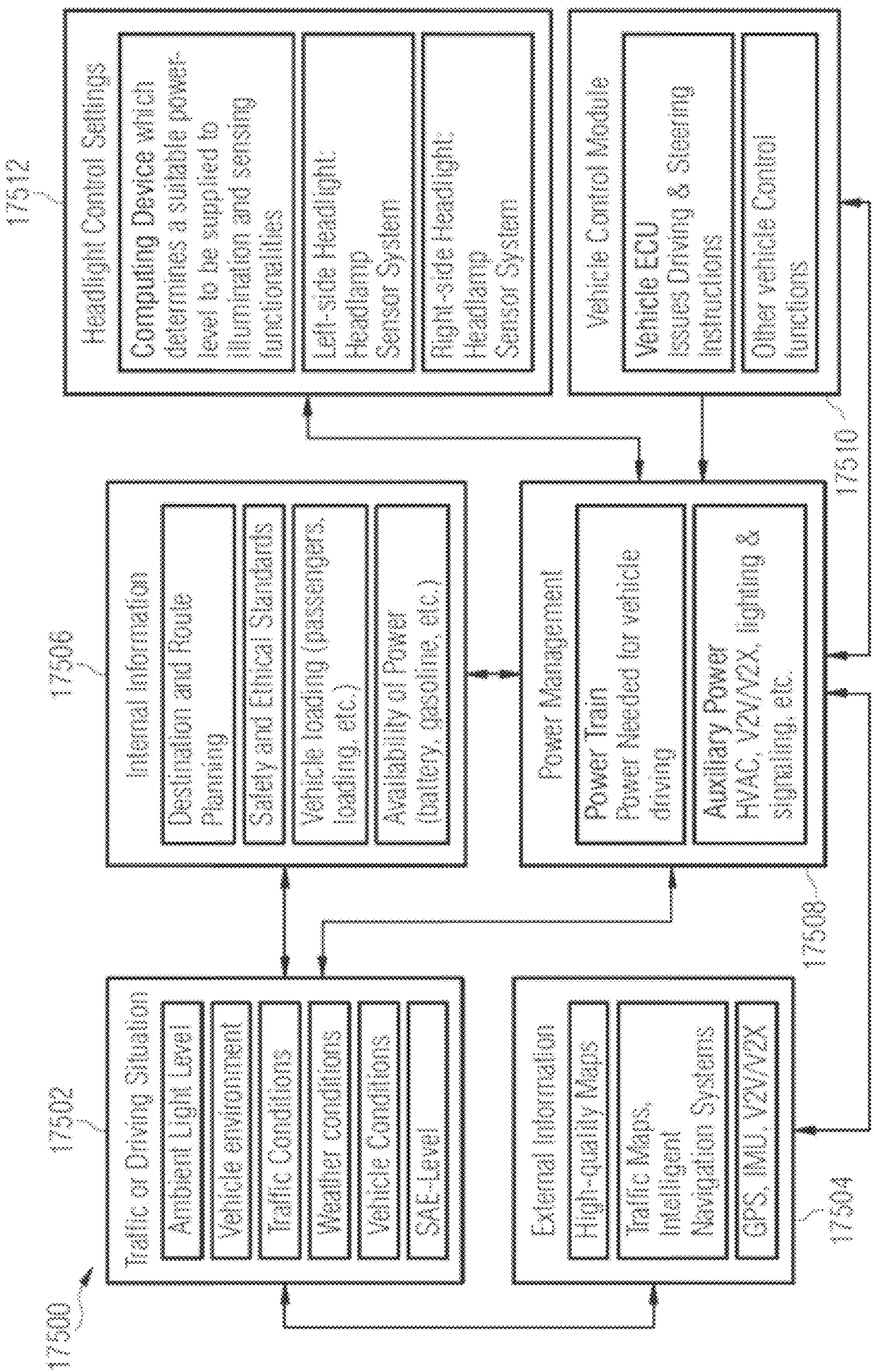

FIG. 175 shows a vehicle information and control system in a schematic representation in accordance with various embodiments.

Figure 176:
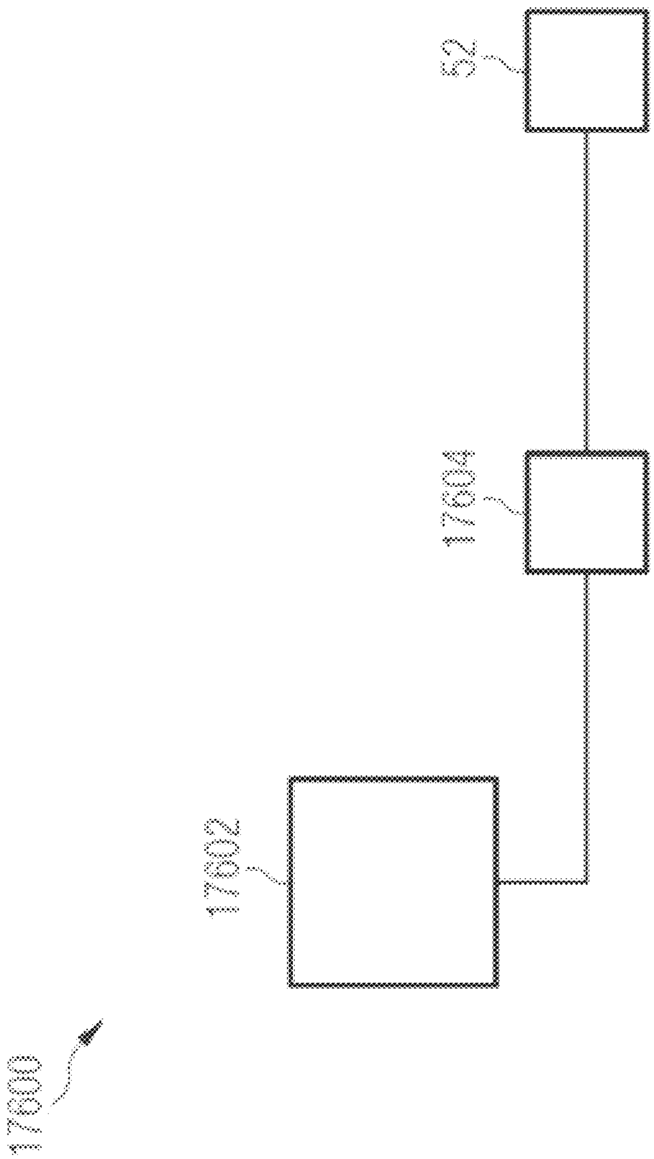

FIG. 176 shows a LIDAR system in a schematic representation in accordance with various embodiments.

Figure 177A:
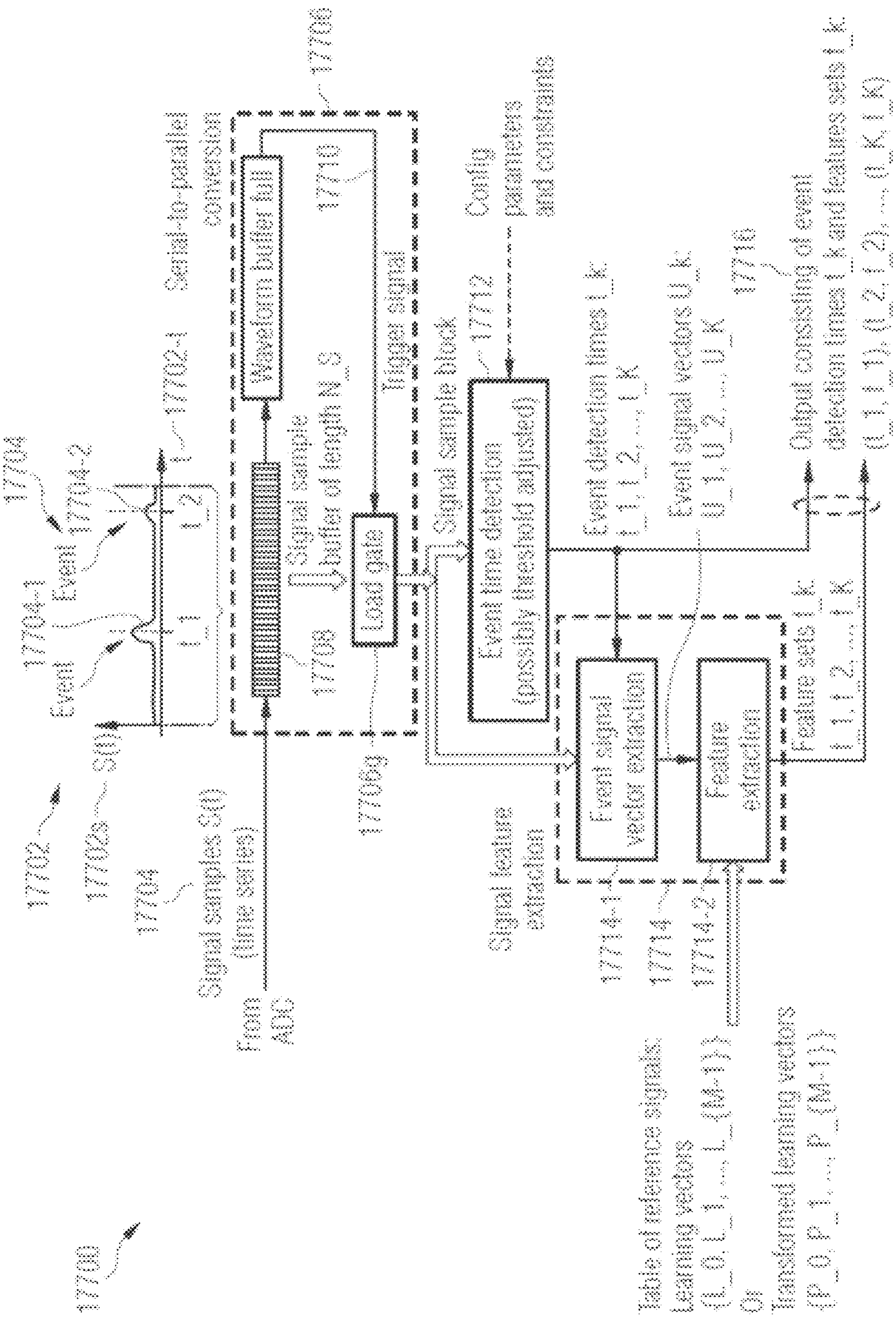

FIG. 177A shows a processing entity in a schematic representation in accordance with various embodiments.

FIG. 1776 shows an extraction of an event signal vector in a schematic representation in accordance with various embodiments.

Figure 177B:
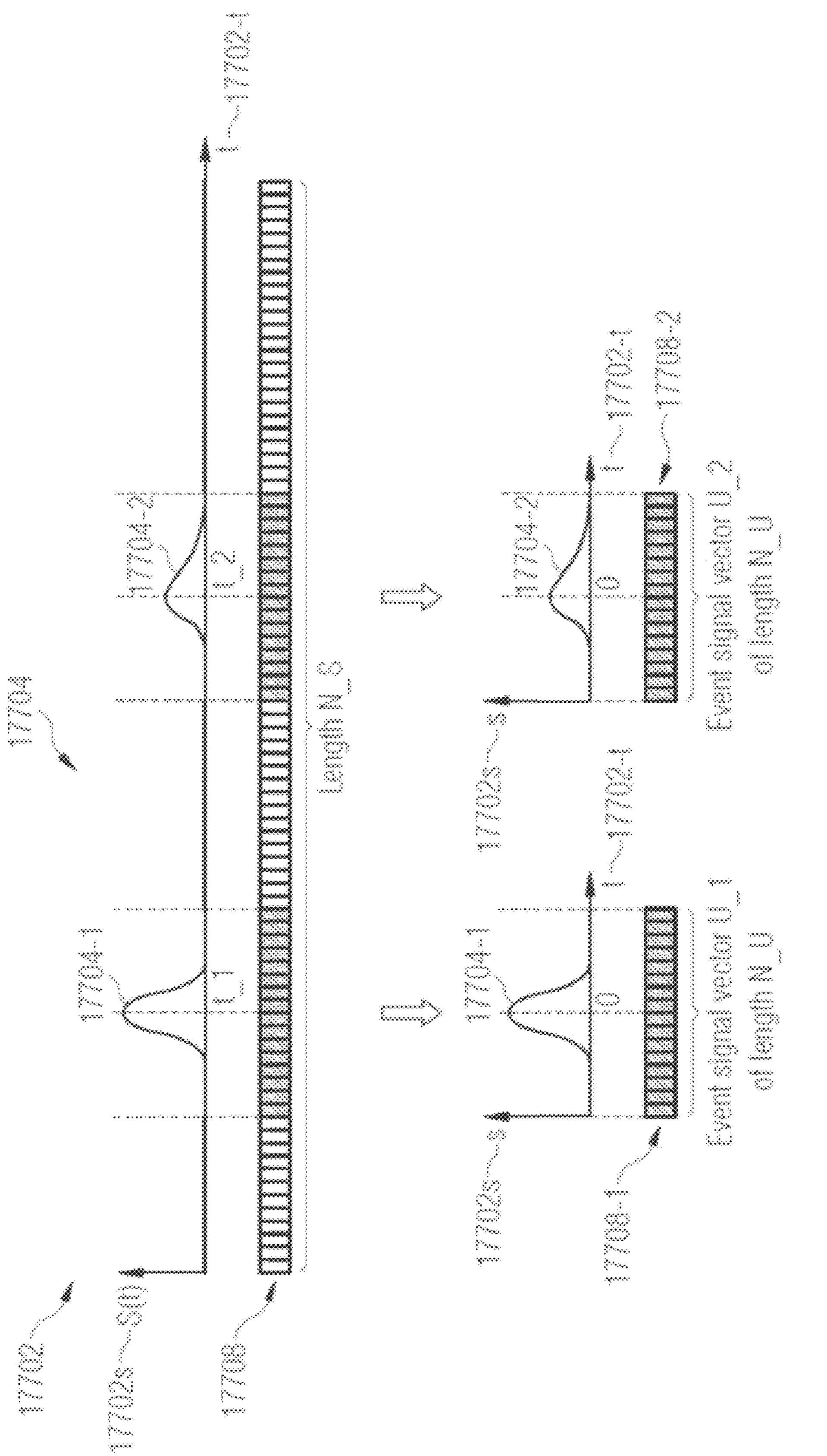
Figure 177C:
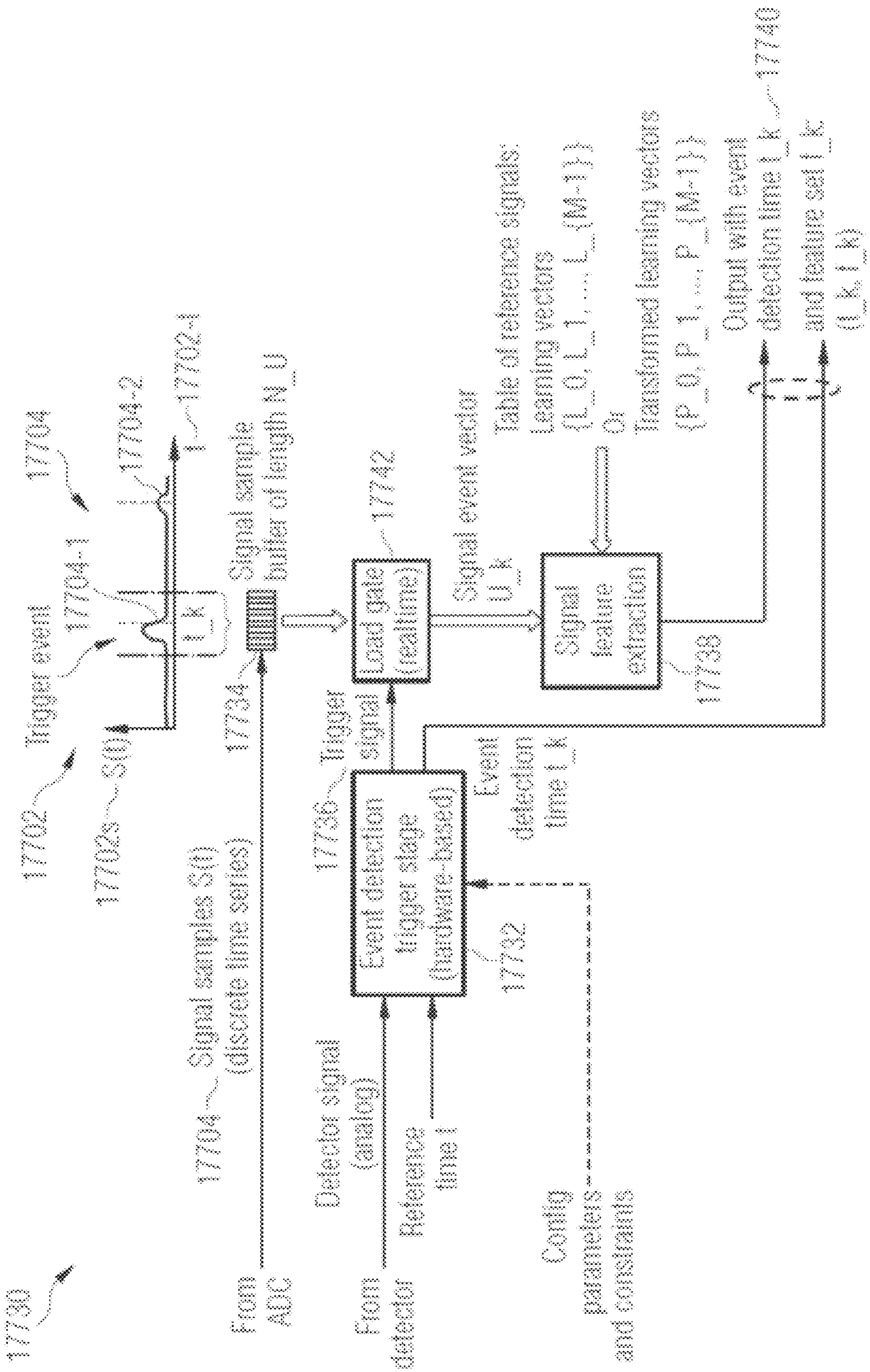

FIG. 177C shows a processing entity in a schematic representation in accordance with various embodiments.

Figure 178B:
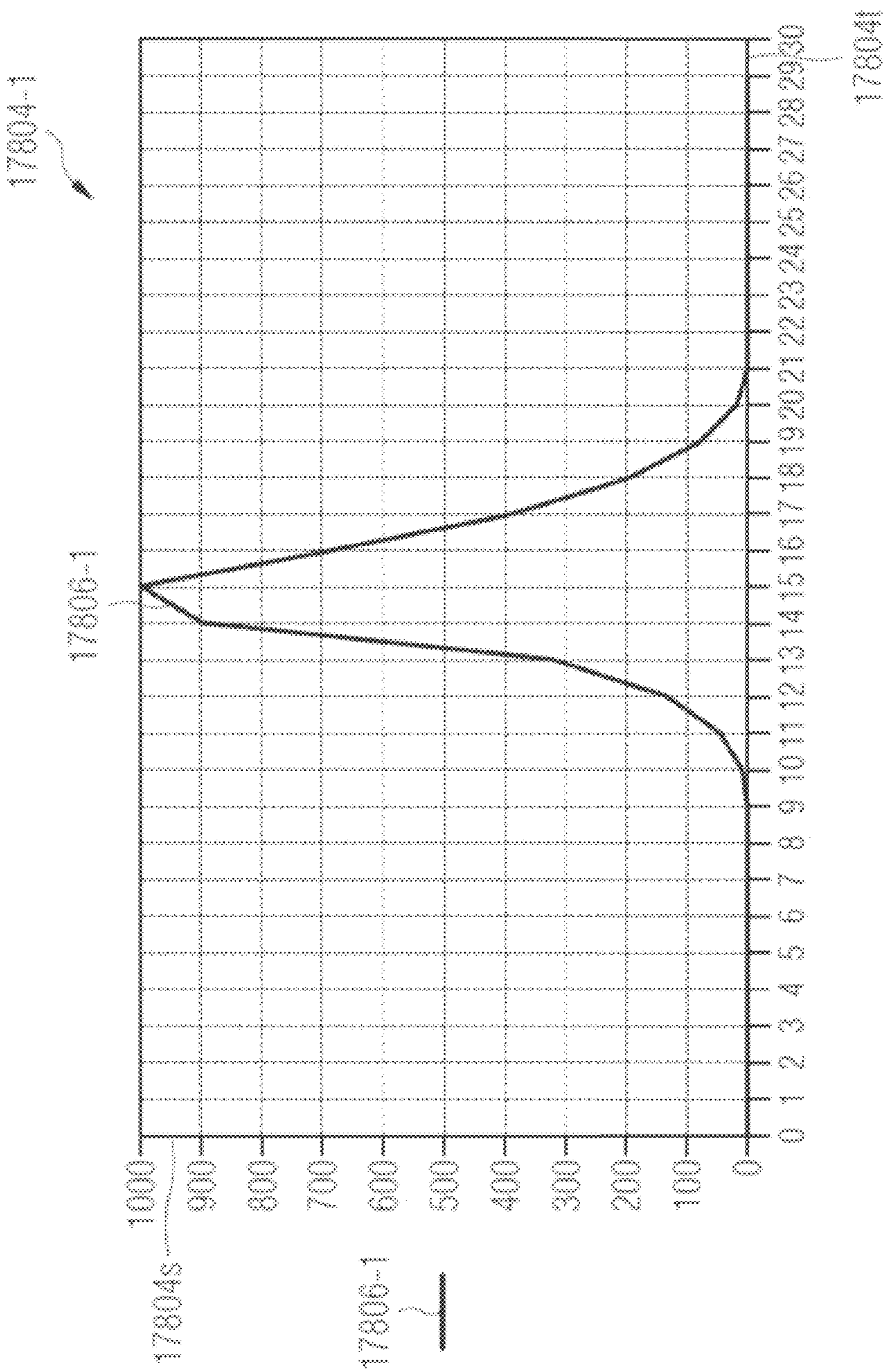
Figure 178C:
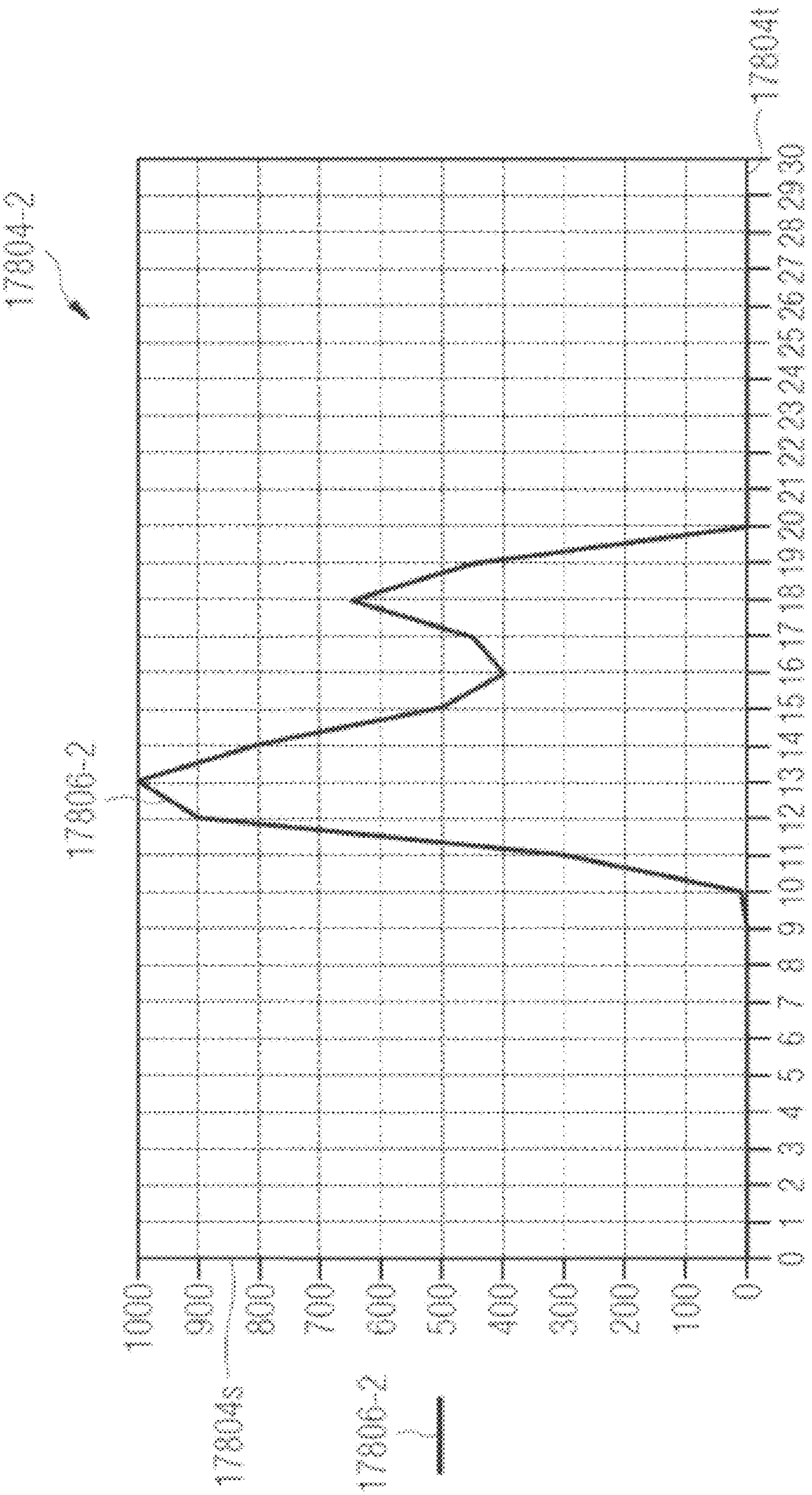
Figure 178D:
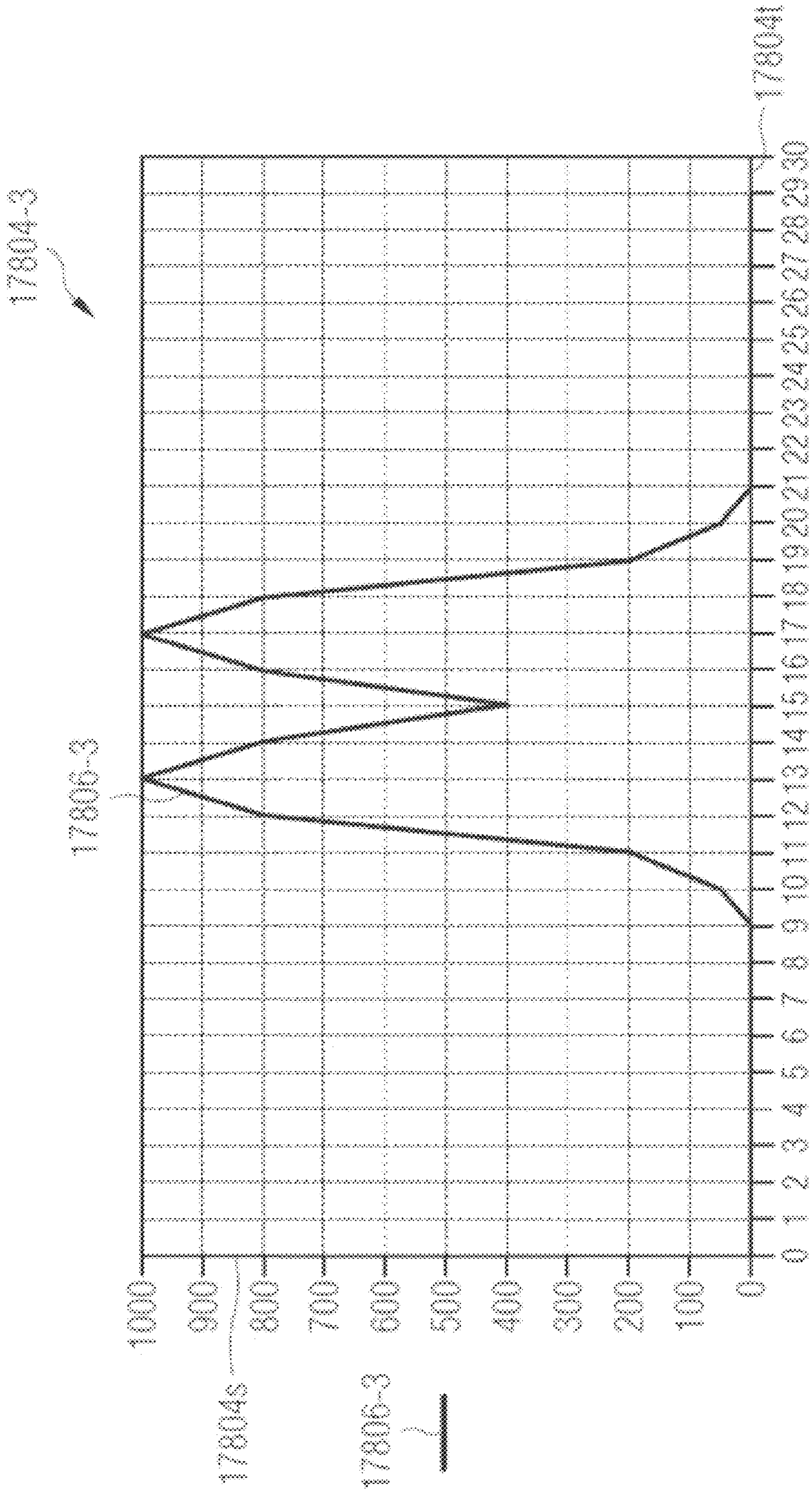
Figure 178E:
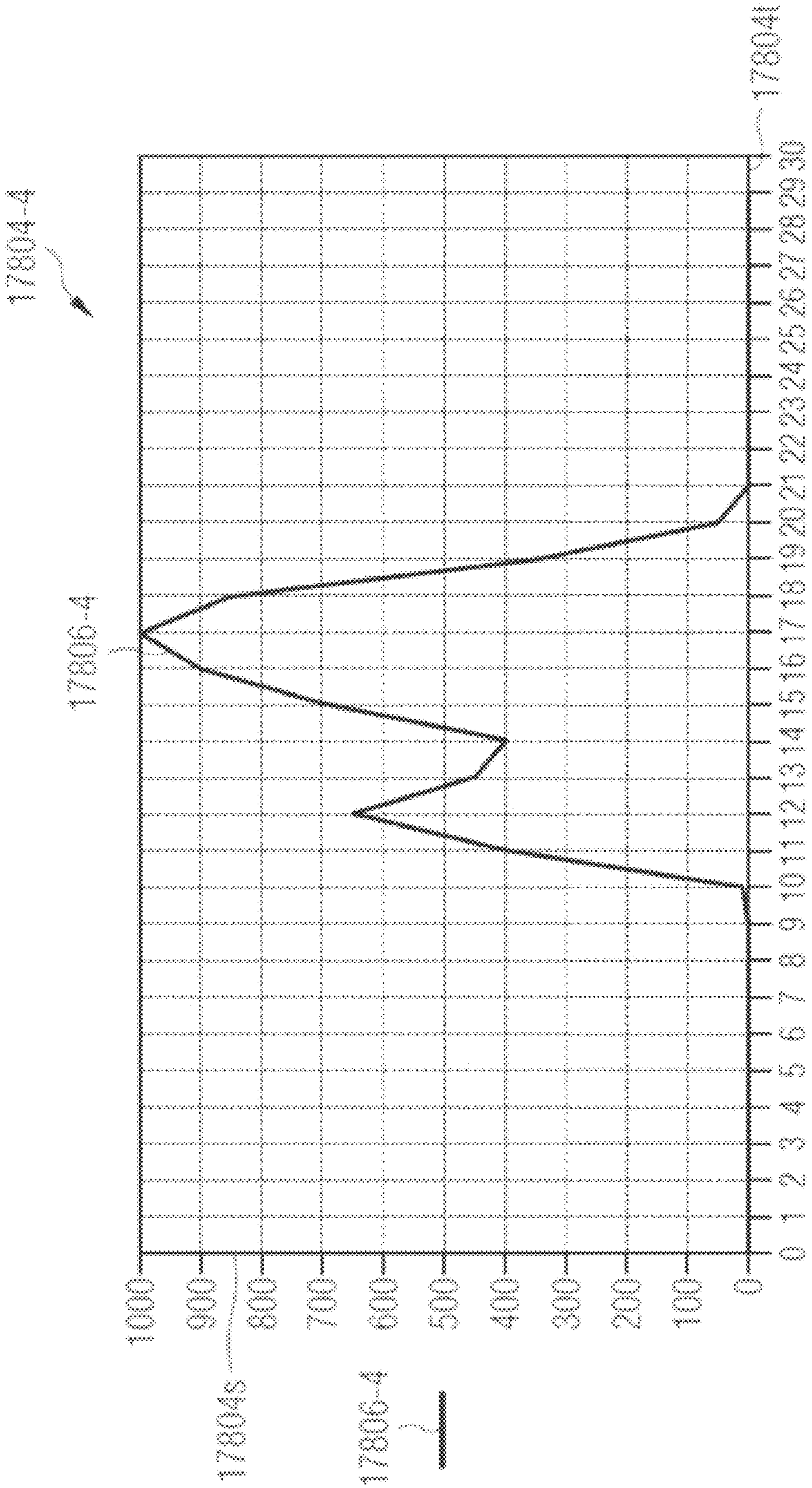
Figure 178F:
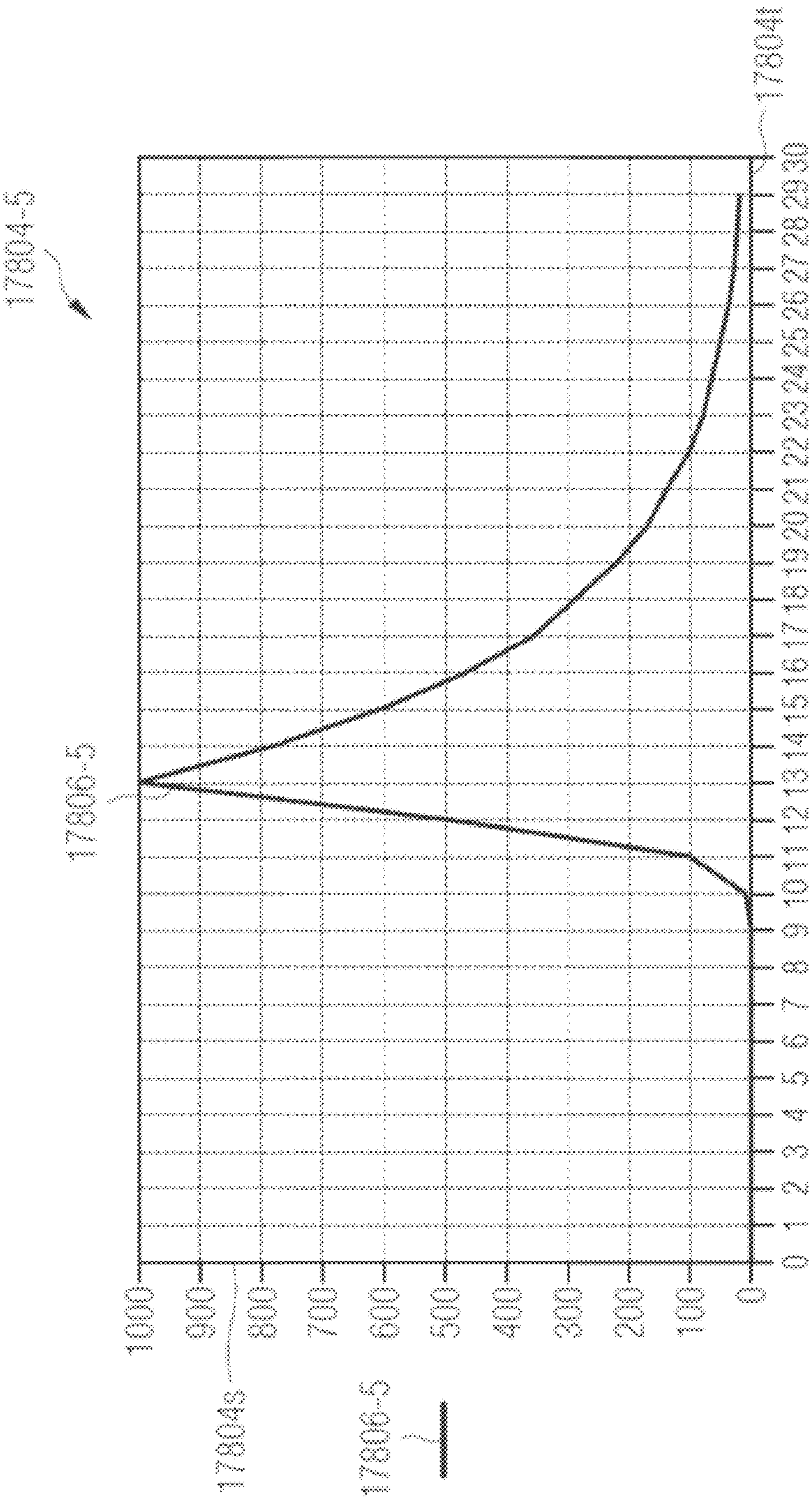

FIG. 178A shows a table storing learning vectors in a schematic representation in accordance with various embodiments.

Figure 178G:
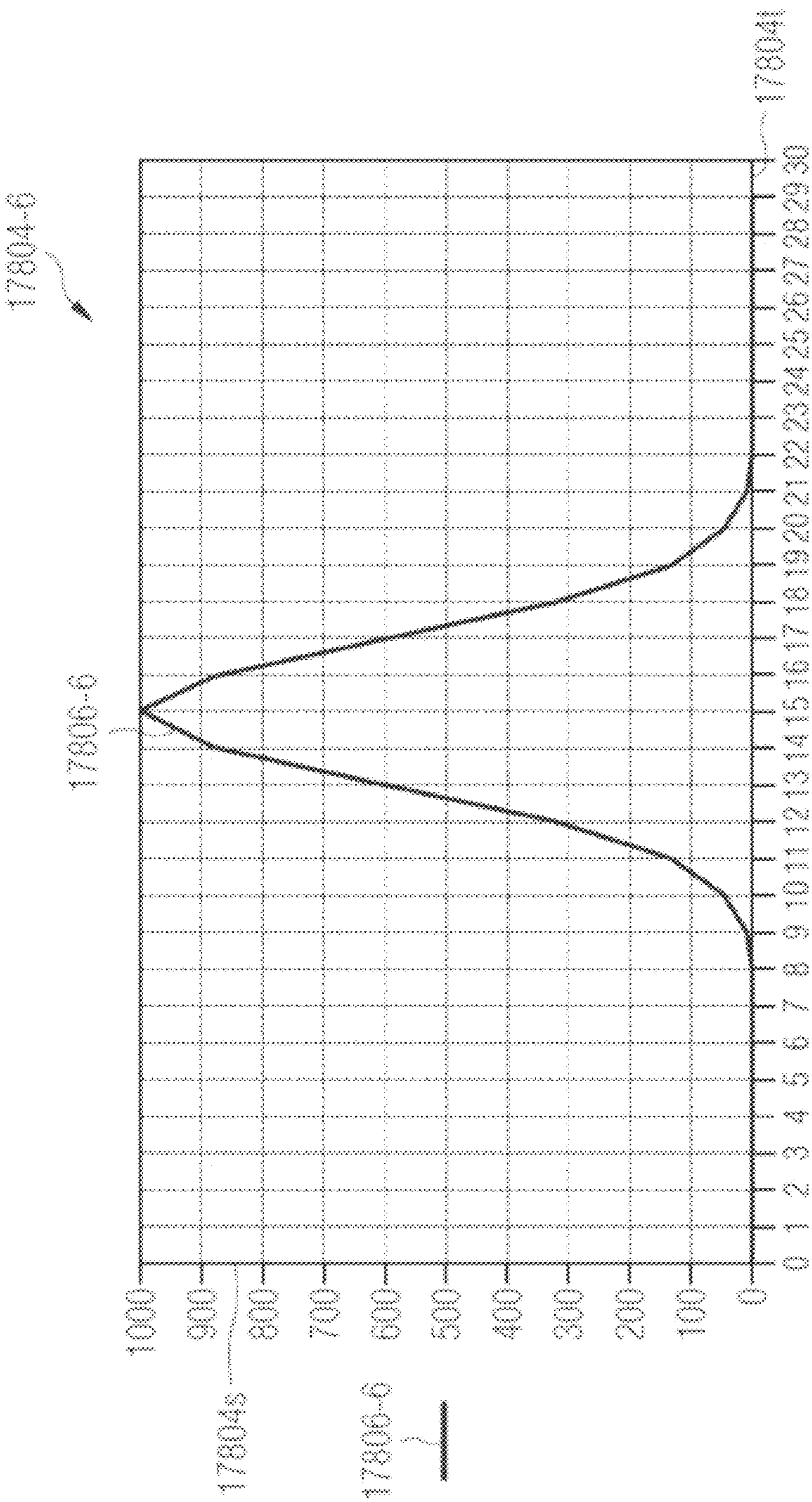

FIG. 1786 to FIG. 178G show each a representation of a respective learning vector in accordance with various embodiments.

Figure 179A:
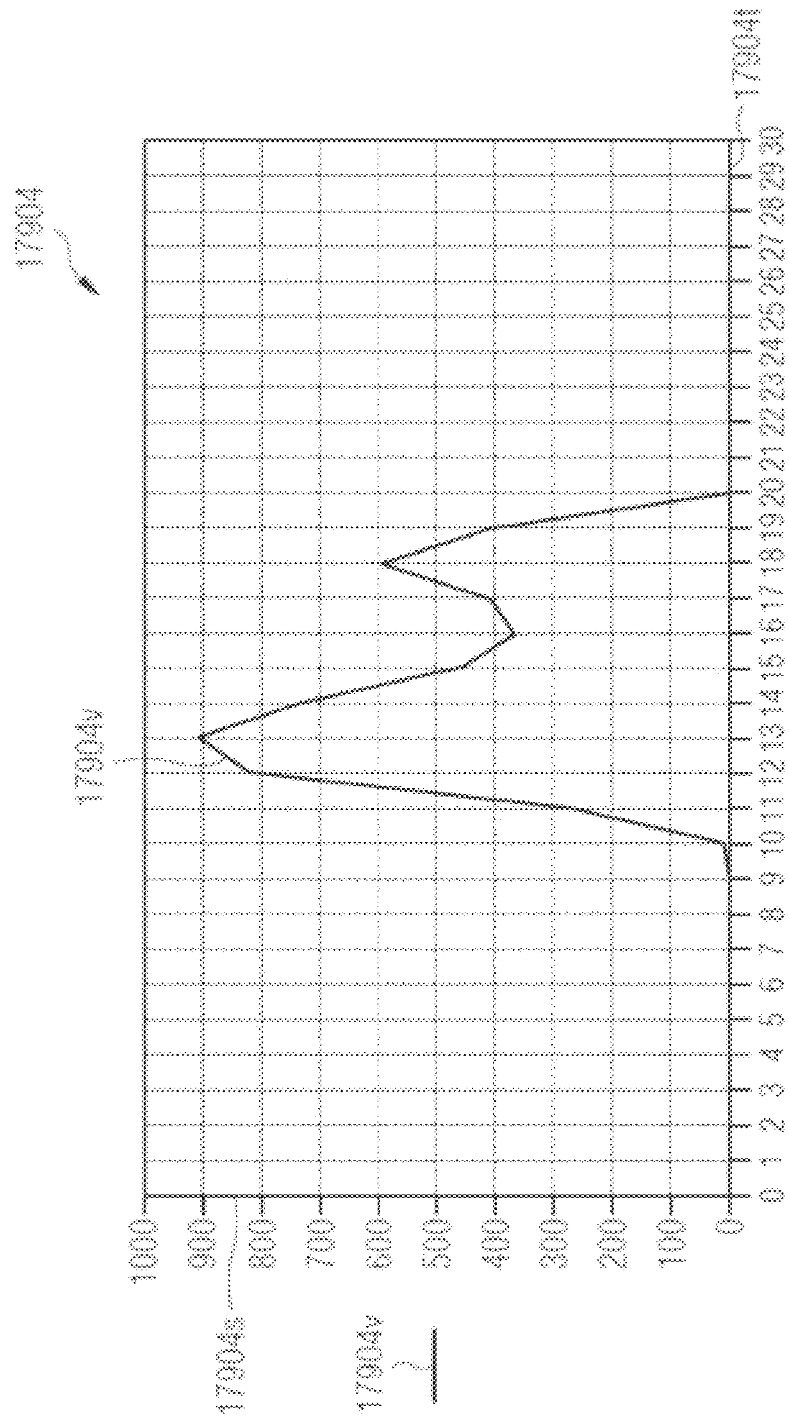

FIG. 179A shows an extracted event signal vector in a schematic representation in accordance with various embodiments.

Figure 179B:
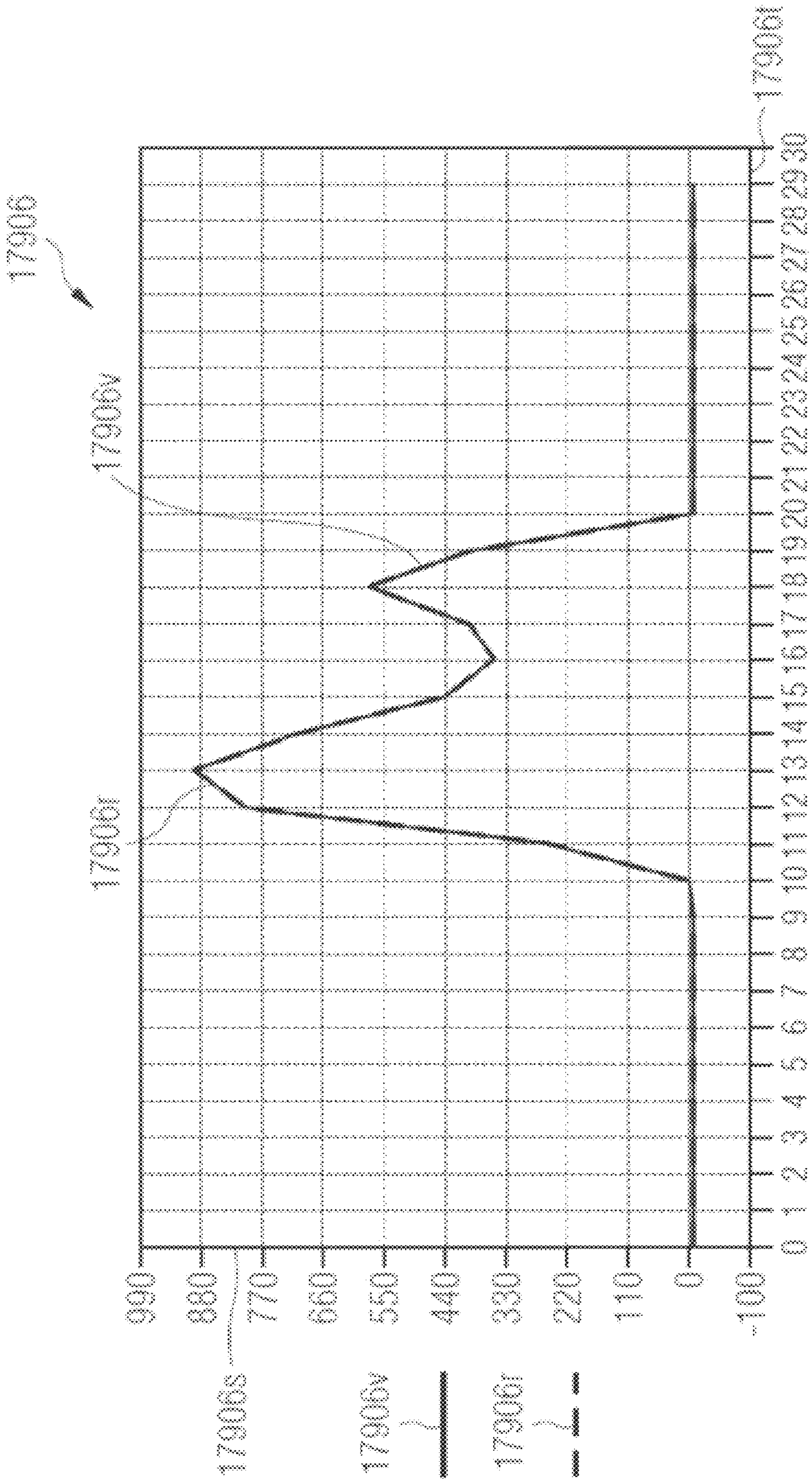

FIG. 179B shows a reconstructed event signal vector in comparison to an originally extracted event signal vector in a schematic representation in accordance with various embodiments.

Figure 179C:
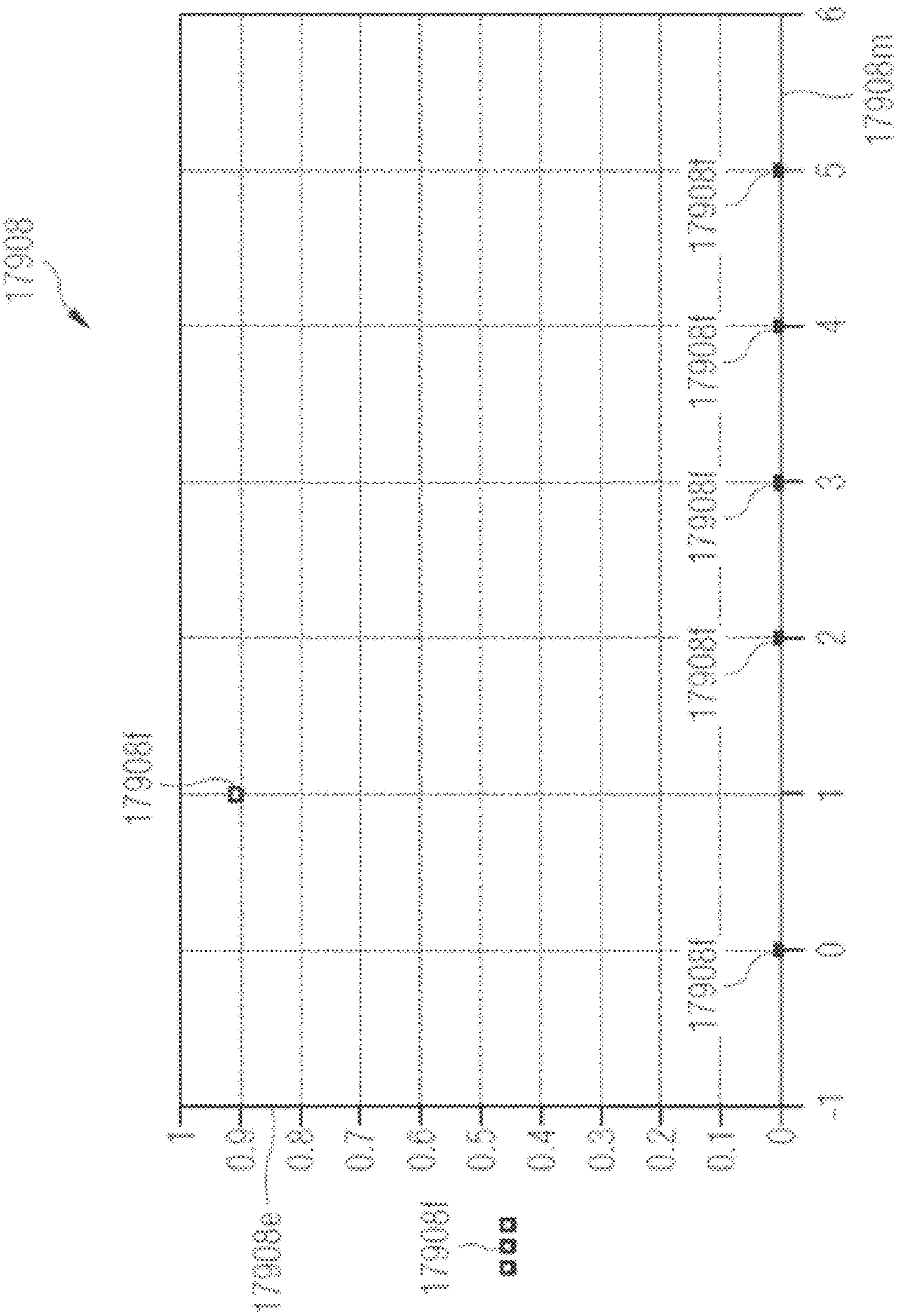

FIG. 179C shows a distance spectrum vector in a schematic representation in accordance with various embodiments.

Figure 179D:
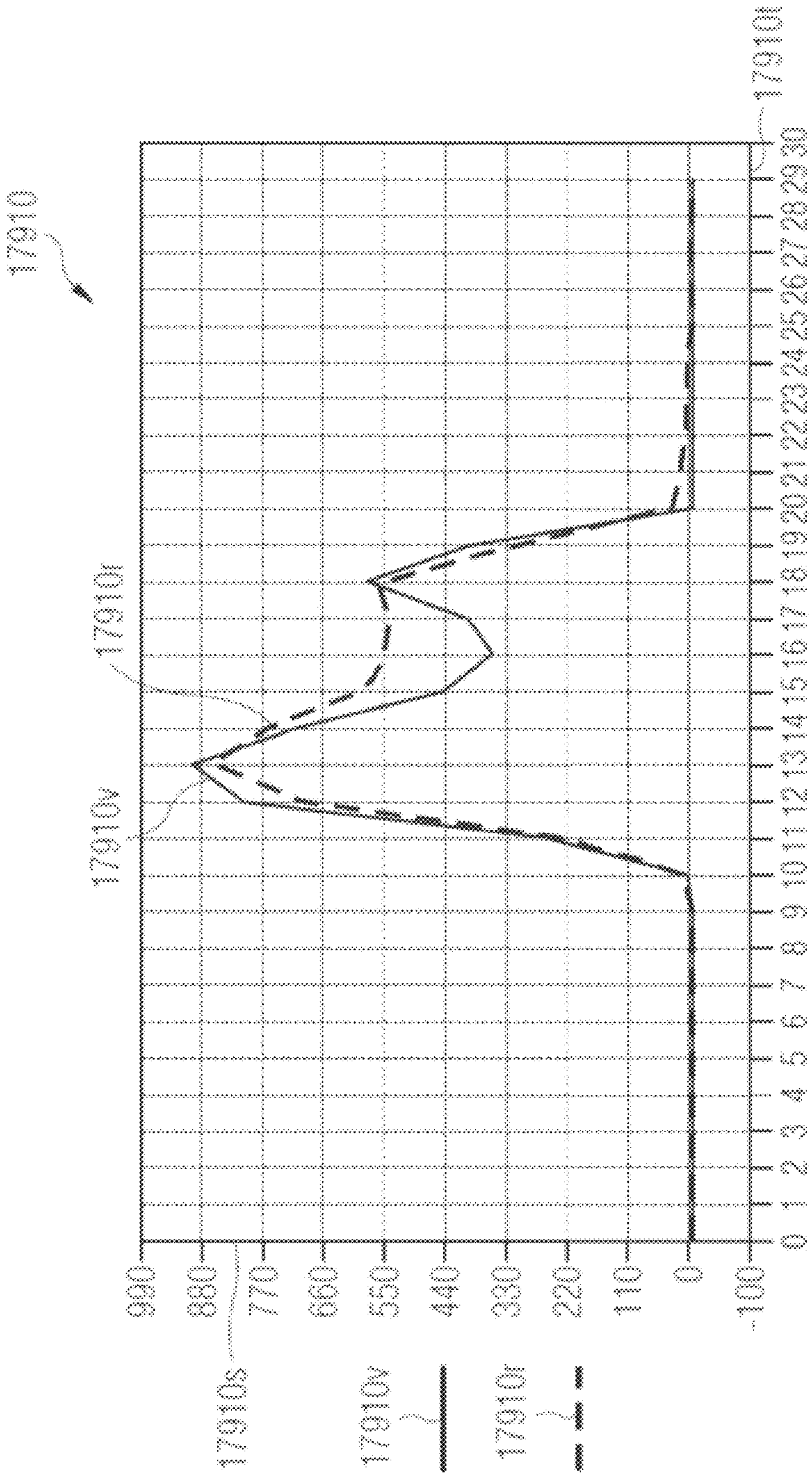

FIG. 179D shows a reconstructed event signal vector in comparison to an originally extracted event signal vector in a schematic representation in accordance with various embodiments.

Figure 180C:
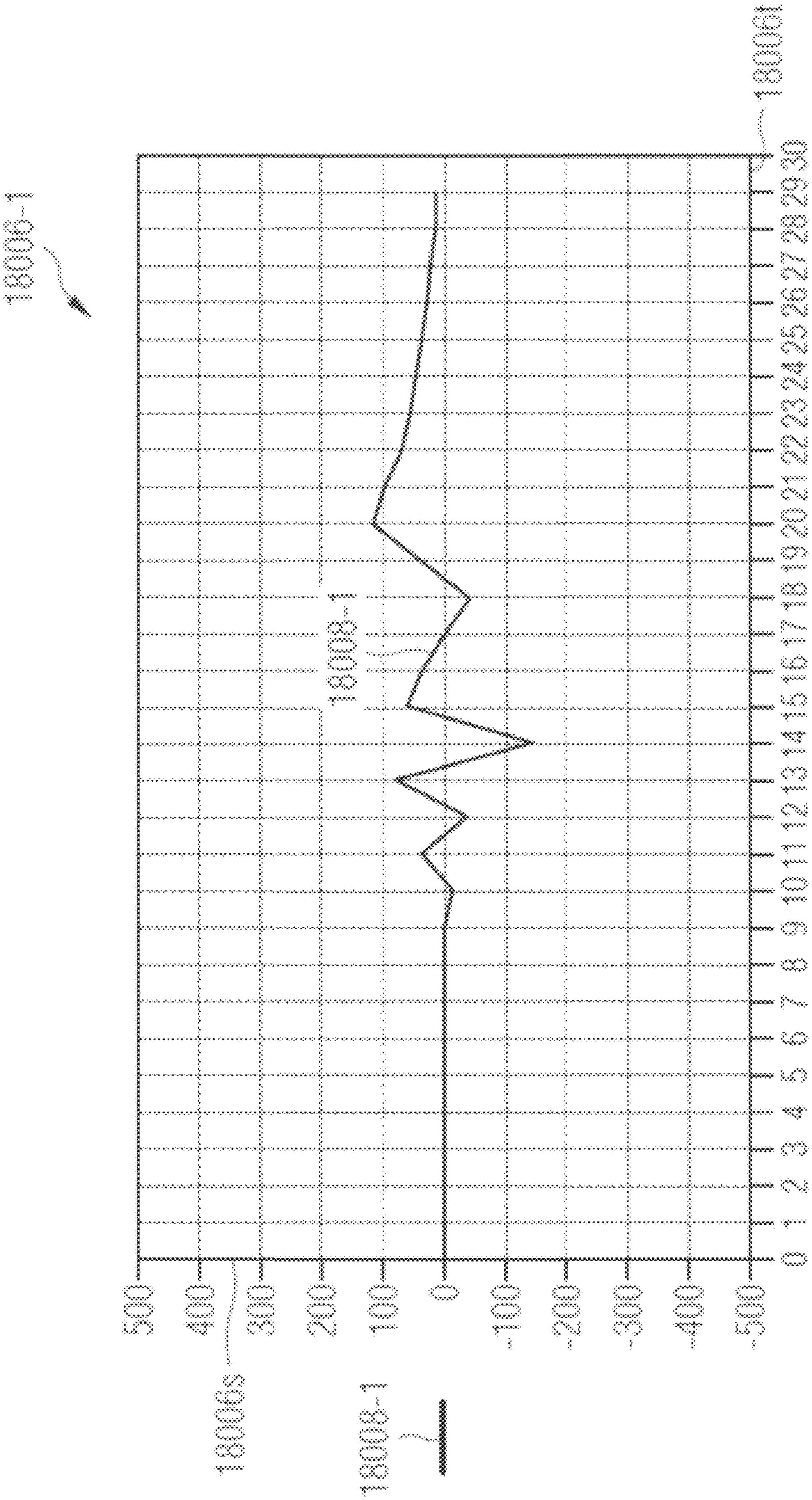
Figure 180D:
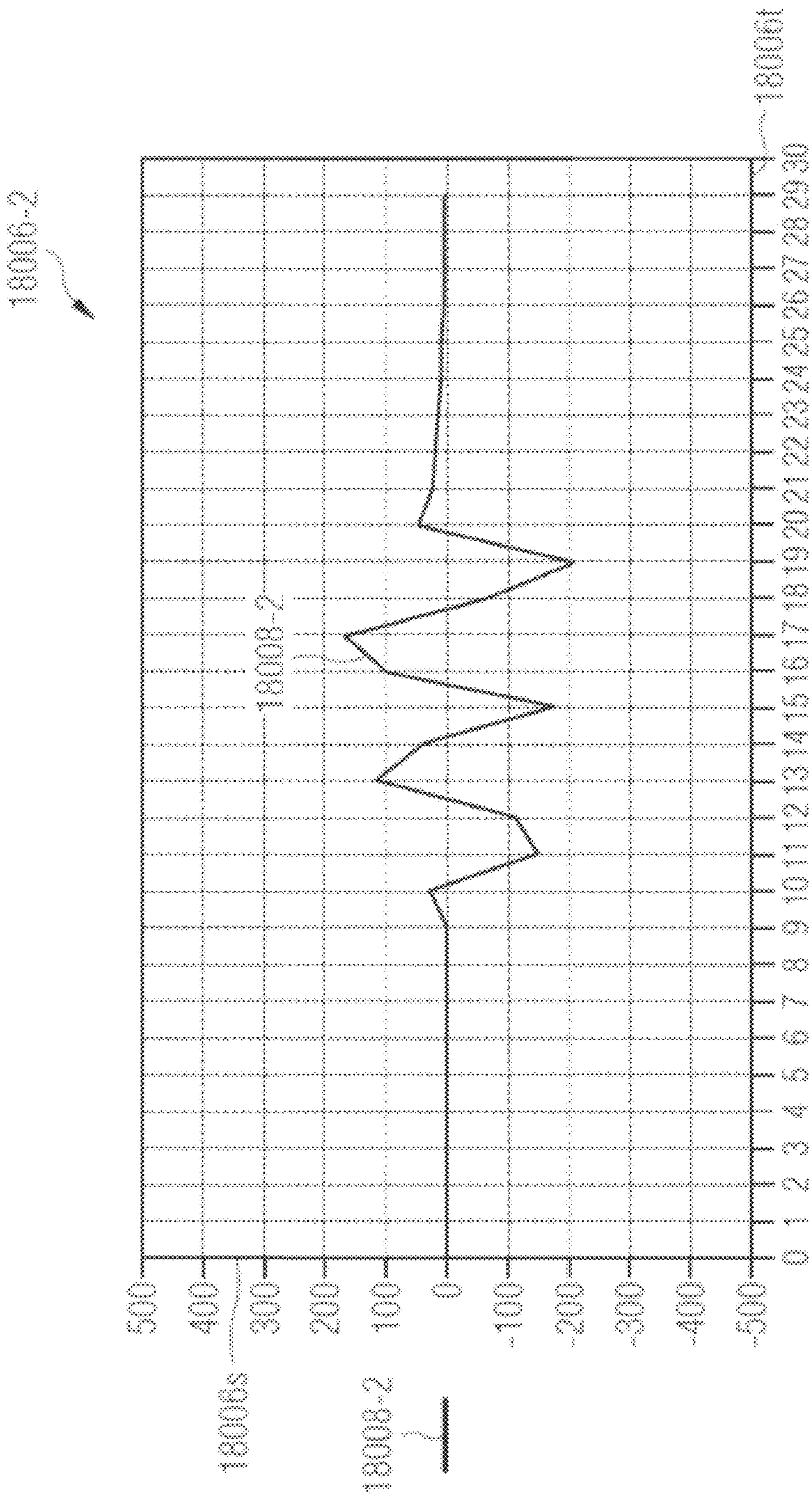
Figure 180E:
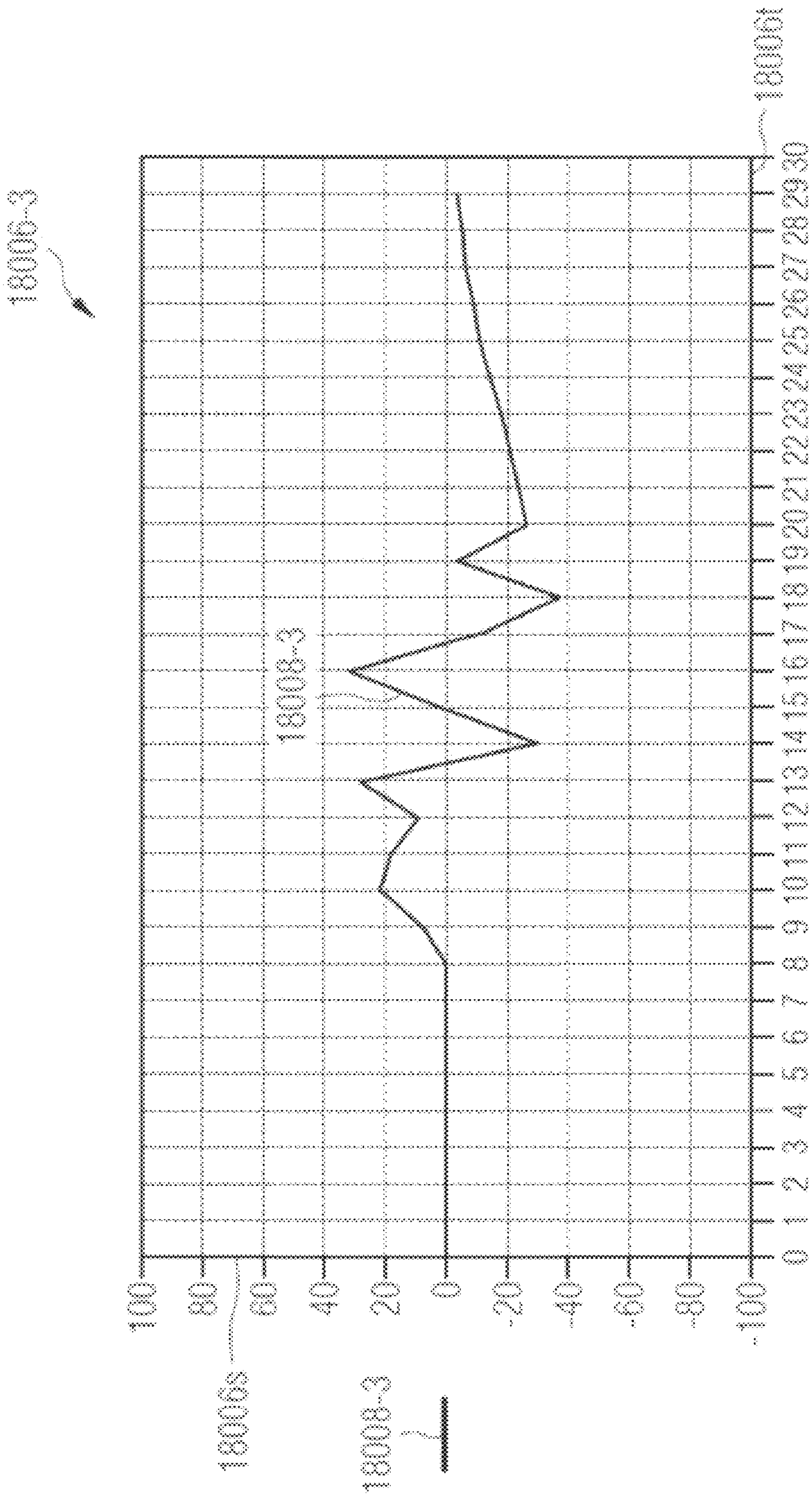
Figure 180F:
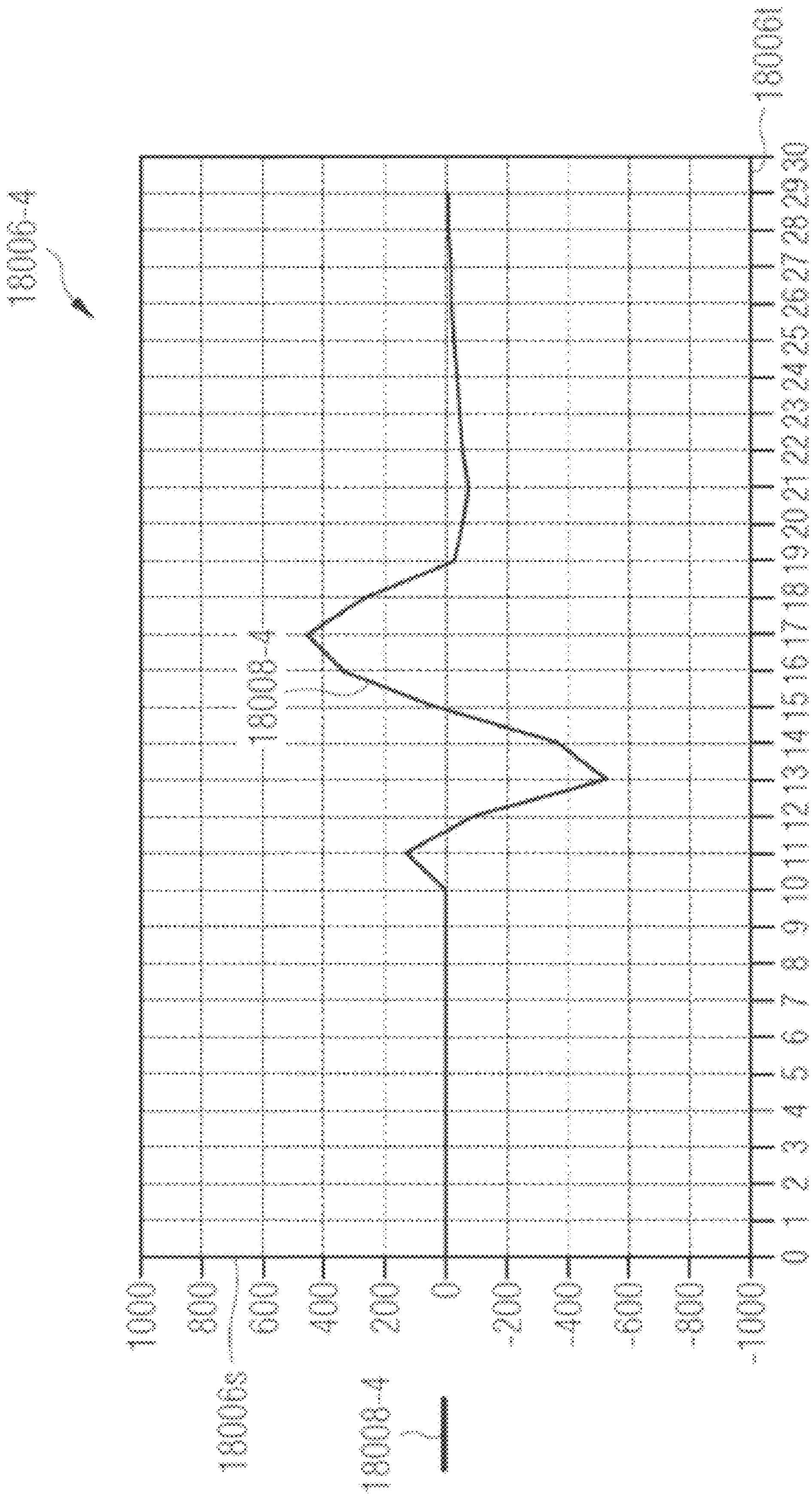

FIG. 180A shows a deviation matrix in a schematic representation in accordance with various embodiments.

FIG. 180B shows transformed learning vectors in a schematic representation in accordance with various embodiments.

FIG. 180C to FIG. 180H show each a representation of a transformed learning vector in accordance with various embodiments.

Figure 181A:
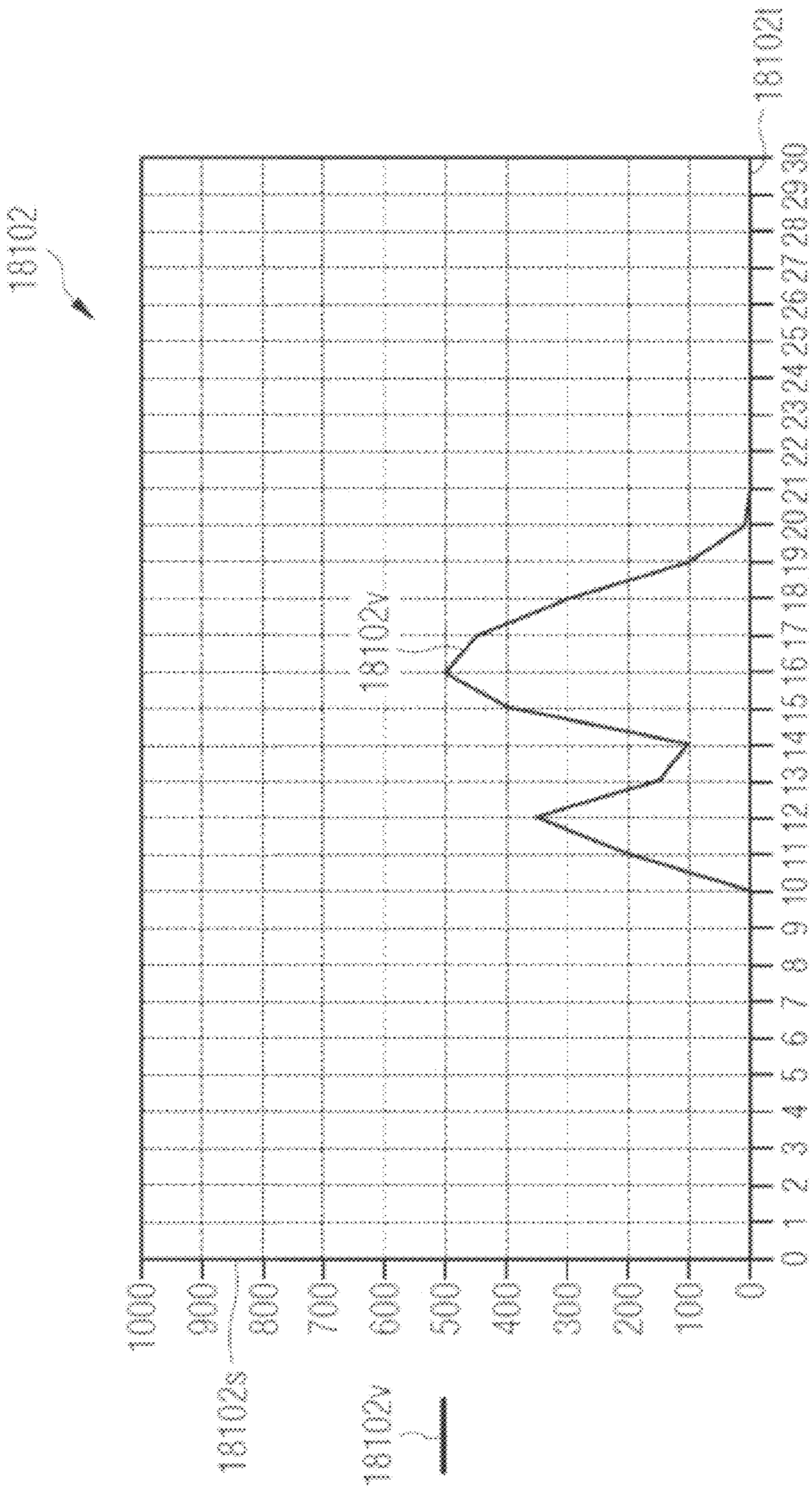

FIG. 181A shows an extracted event signal vector in a schematic representation in accordance with various embodiments.

Figure 181B:
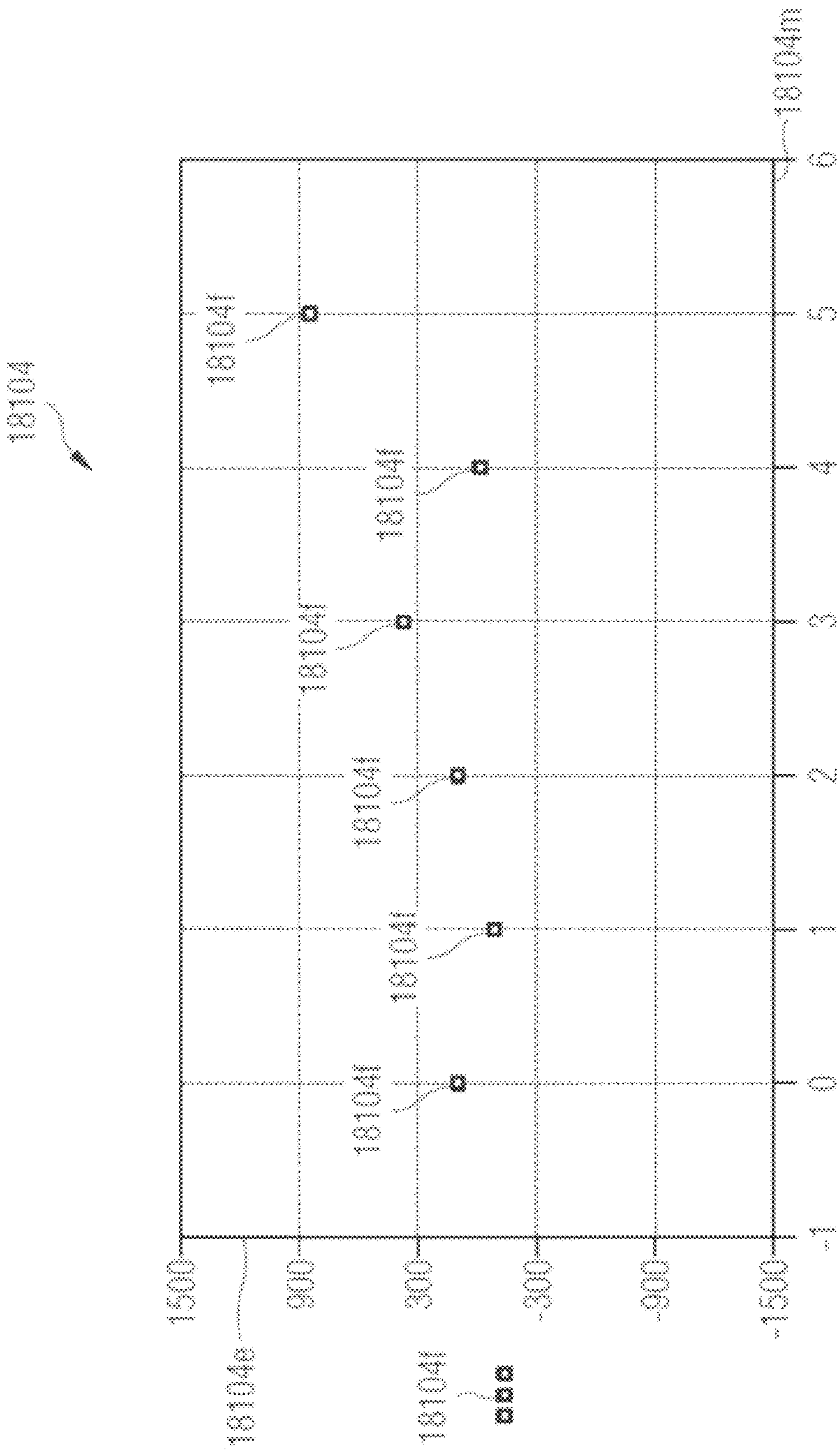

FIG. 181B shows a feature vector in a schematic representation in accordance with various embodiments.

Figure 181C:
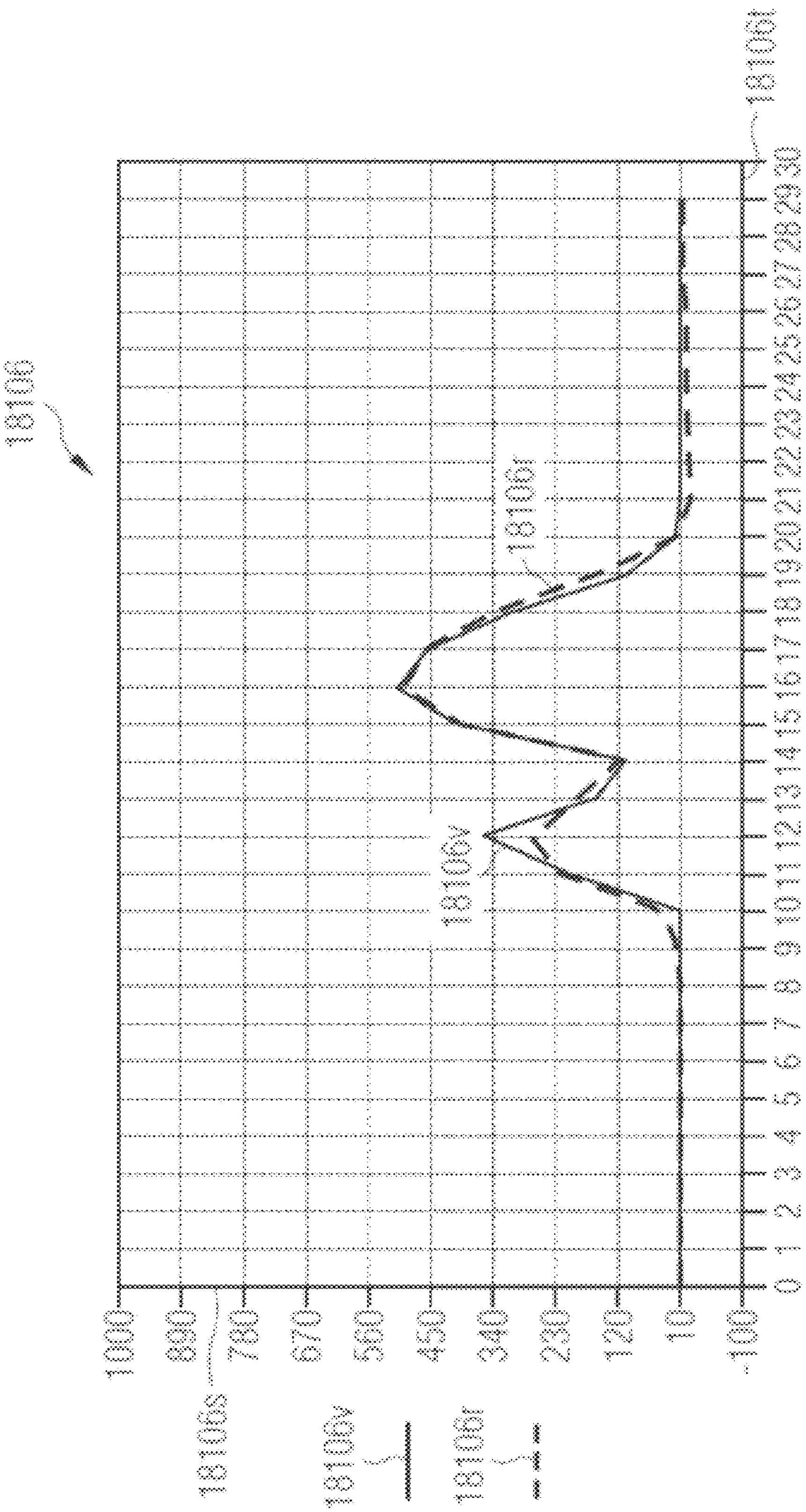

FIG. 181C shows a reconstructed event signal vector in comparison to an originally extracted event signal vector in a schematic representation in accordance with various embodiments.

Figure 182:
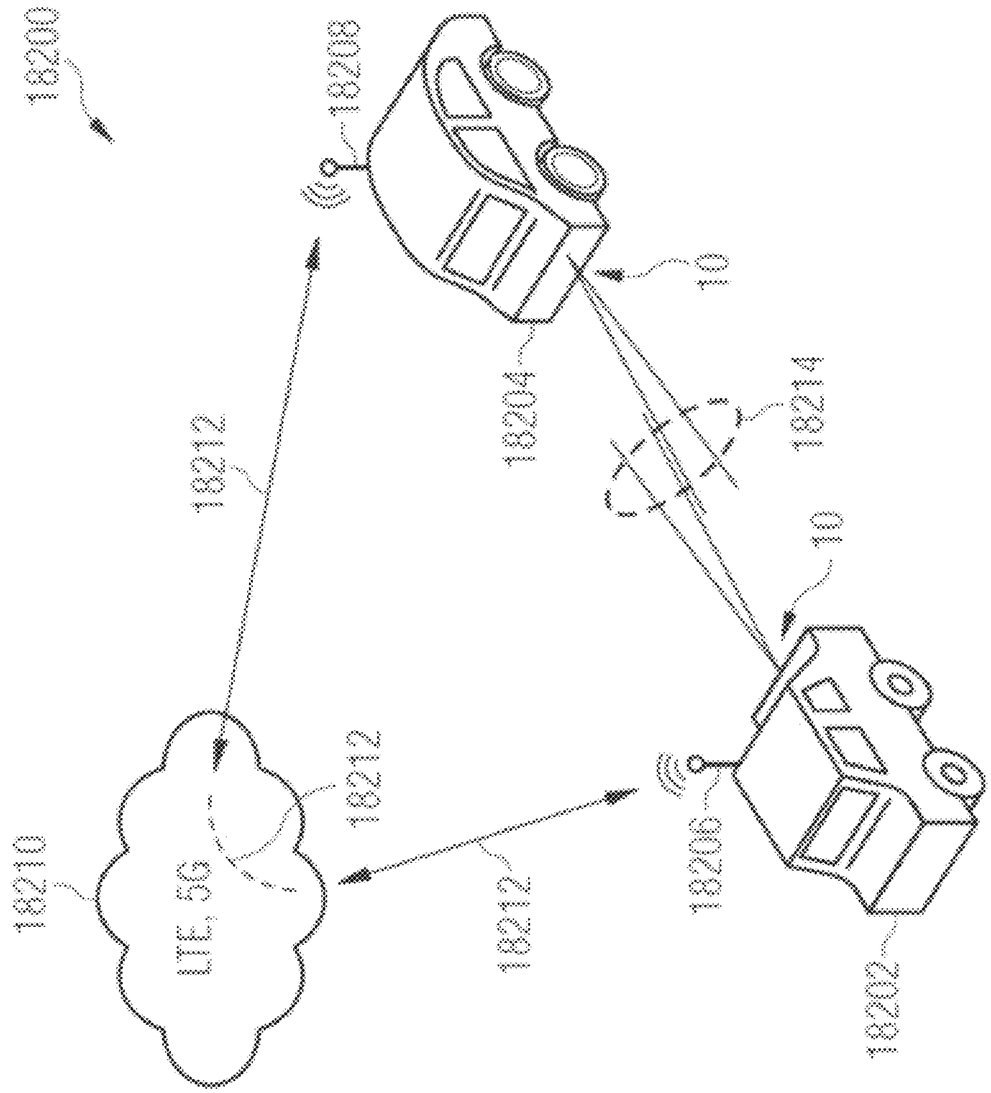

FIG. 182 shows a communication system including two vehicles and two established communication channels in accordance with various embodiments.

Figure 183:
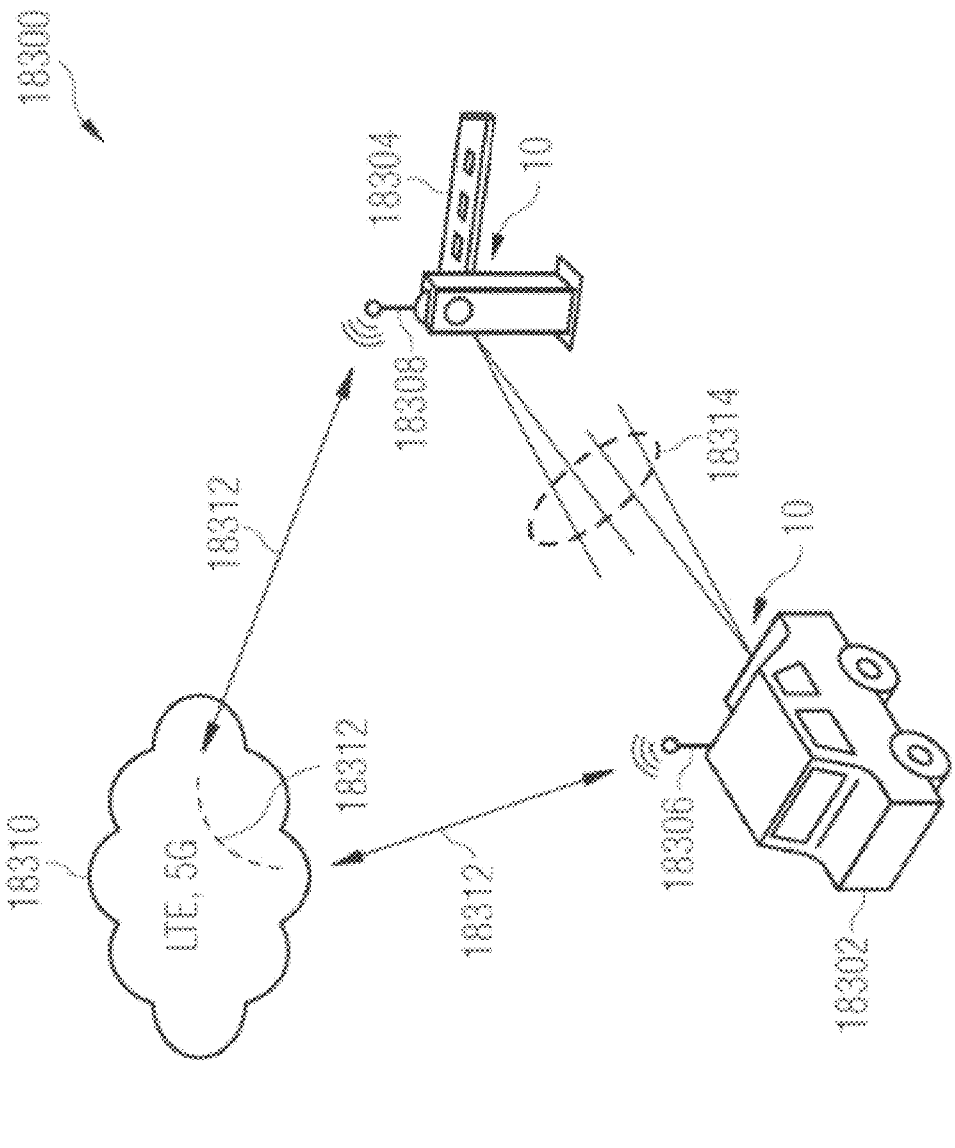

FIG. 183 shows a communication system including a vehicle and a traffic infrastructure and two established communication channels in accordance with various embodiments.

Figure 184:
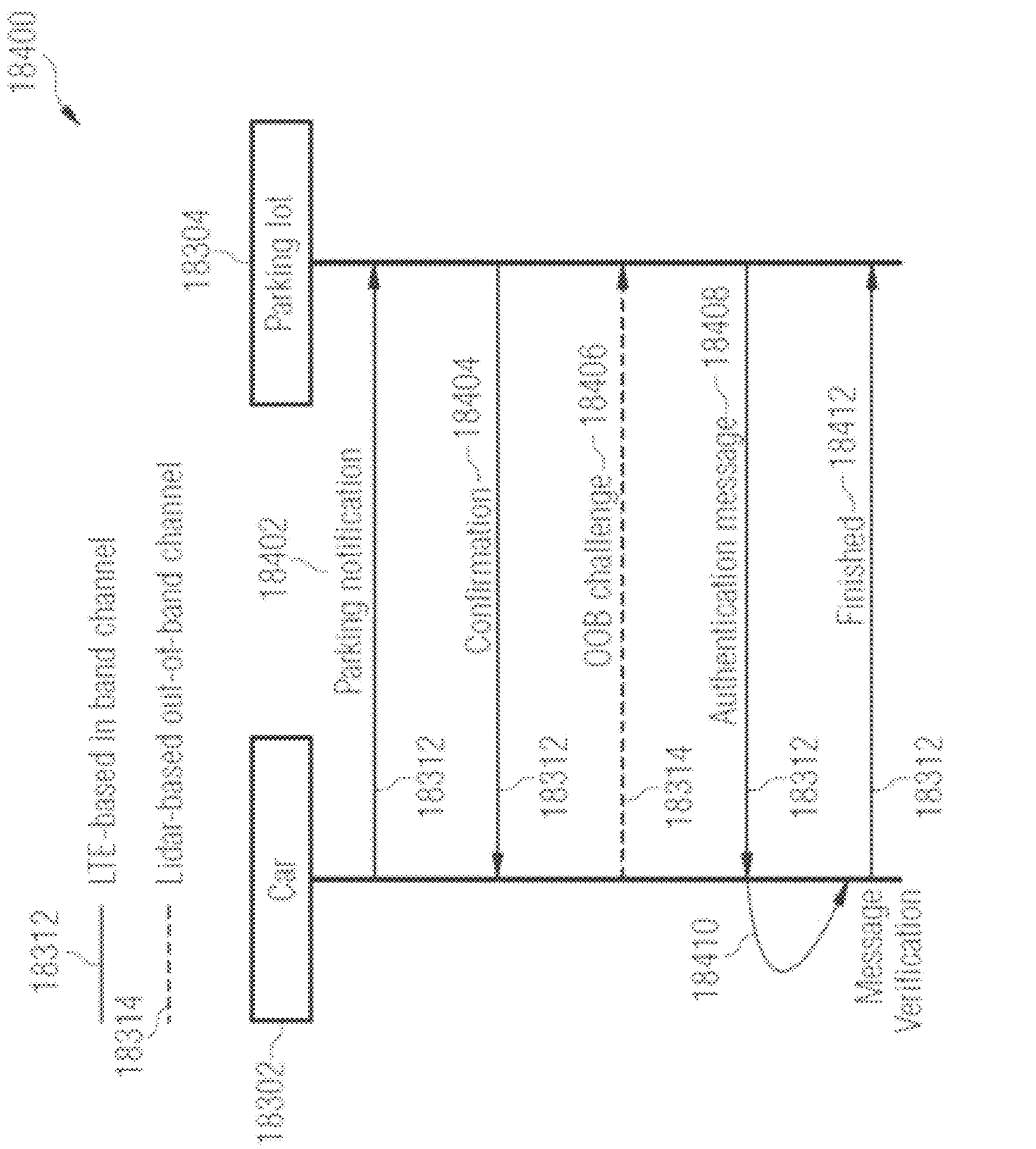

FIG. 184 shows a message flow diagram illustrating a one-way two factor authentication process in accordance with various embodiments.

Figure 185:
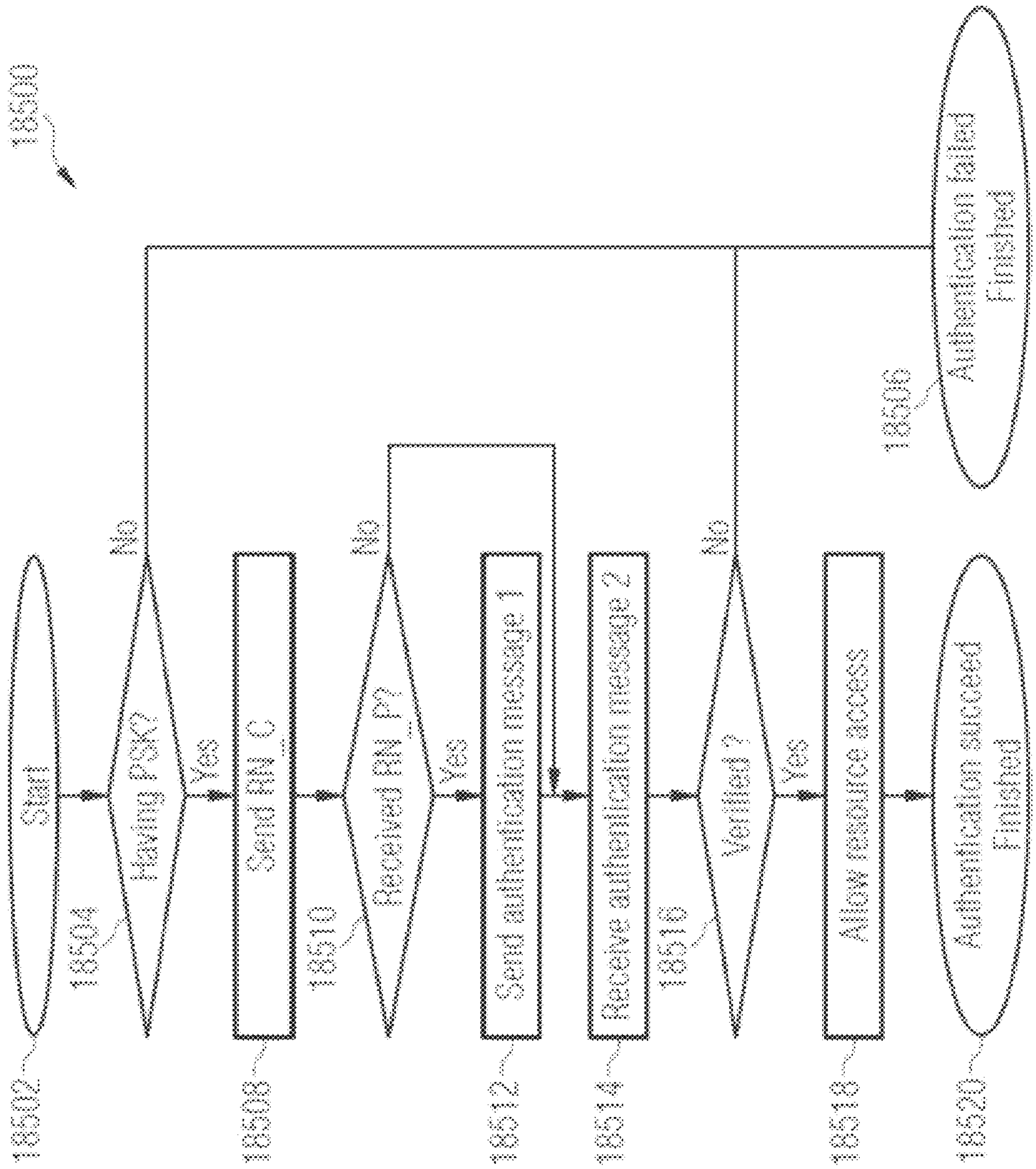

FIG. 185 shows a flow diagram illustrating a mutual two factor authentication process in accordance with various embodiments.

Figure 186:
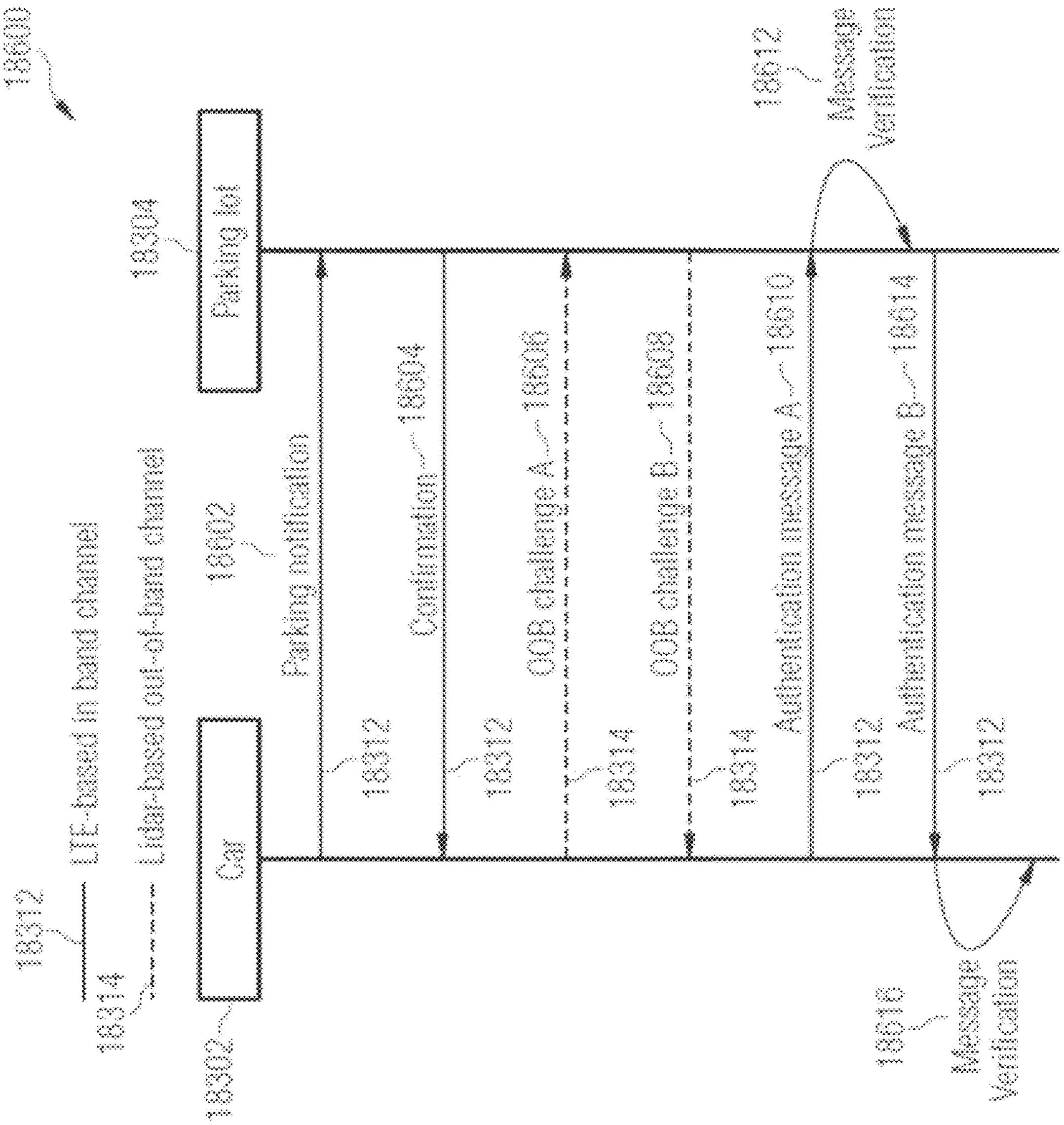

FIG. 186 shows a message flow diagram illustrating a mutual two factor authentication process in accordance with various embodiments.

Figure 187:
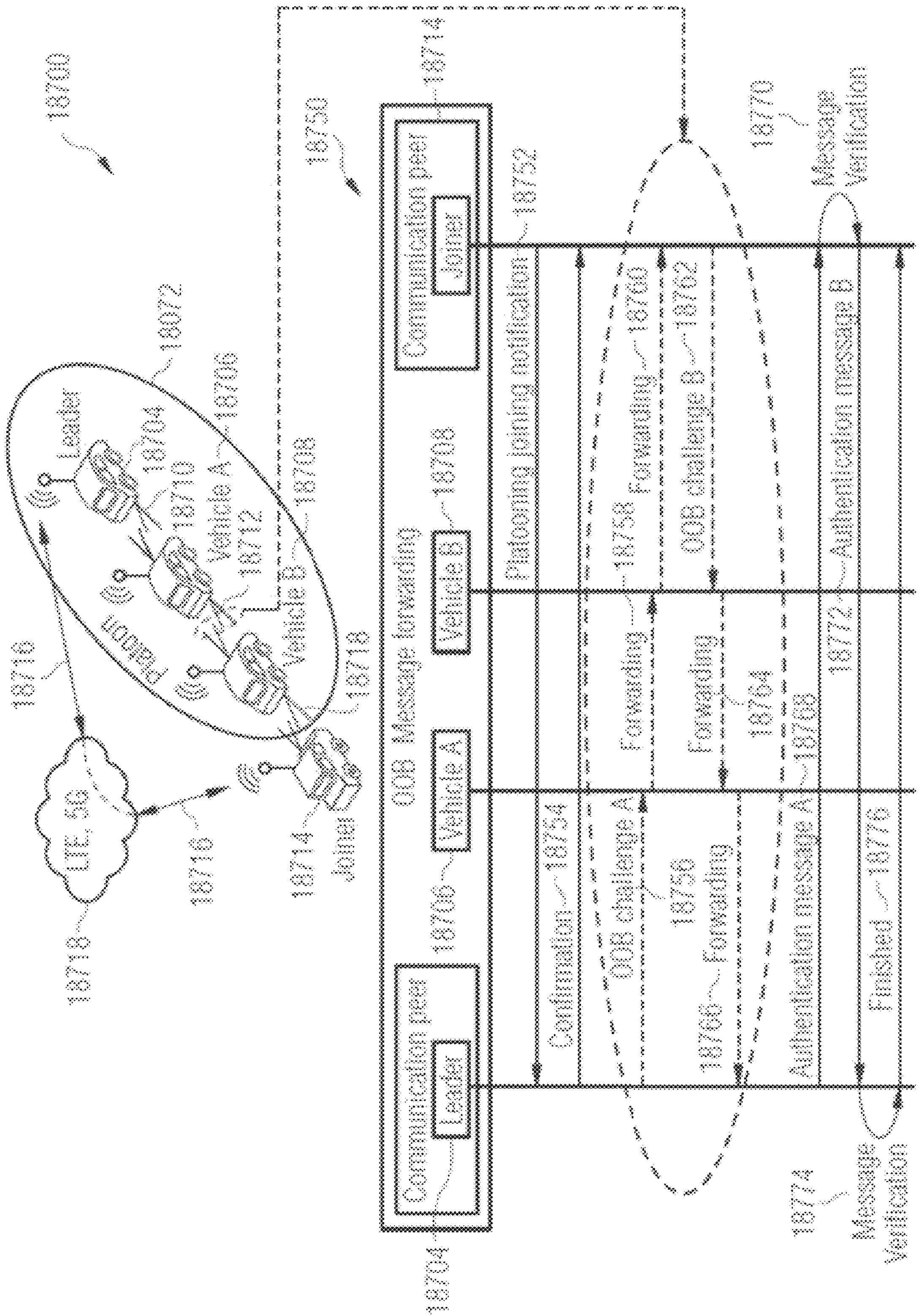

FIG. 187 shows a mutual authentication scenario and a message flow diagram in Platooning in accordance with various embodiments.

Figure 188:
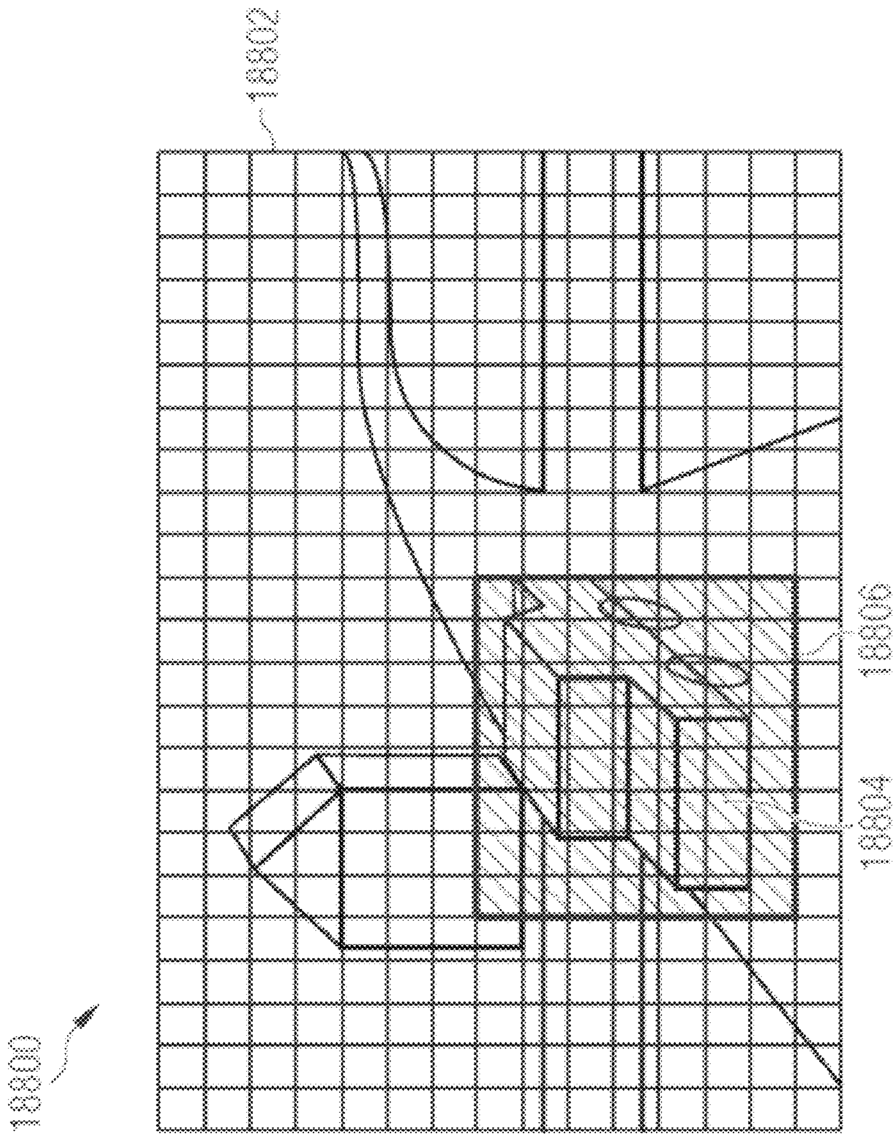

FIG. 188 shows a FoV of a LIDAR Sensor System illustrated by a grid including an identified intended communication partner (vehicle shown in FIG. 188) in accordance with various embodiments.

DETAILED DESCRIPTION

Introduction

Autonomously driving vehicles need sensing methods that detect objects and map their distances in a fast and reliable manner. Light detection and ranging (LIDAR), sometimes called Laser Detection and Ranging (LADAR), Time of Flight measurement device (TOF), Laser Scanners or Laser Radar—is a sensing method that detects objects and maps their distances. The technology works by illuminating a target with an optical pulse and measuring the characteristics of the reflected return signal. The width of the optical-pulse can range from a few nanoseconds to several microseconds.

In order to steer and guide autonomous cars in a complex driving environment, it is adamant to equip vehicles with fast and reliable sensing technologies that provide high-resolution, three-dimensional information (Data Cloud) about the surrounding environment thus enabling proper vehicle control by using on-board or cloud-based computer systems.

For distance and speed measurement, a light-detection-and-ranging LIDAR Sensor Systems is known from the prior art. With LIDAR Sensor Systems, it is possible to quickly scan the environment and detect speed and direction of movement of individual objects (vehicles, pedestrians, static objects). LIDAR Sensor Systems are used, for example, in partially autonomous vehicles or fully autonomously driving prototypes, as well as in aircraft and drones. A high-resolution LIDAR Sensor System emits a (mostly infrared) laser beam, and further uses lenses, mirrors or micro-mirror systems, as well as suited sensor devices.

The disclosure relates to a LIDAR Sensor System for environment detection, wherein the LIDAR Sensor System is designed to carry out repeated measurements for detecting the environment, wherein the LIDAR Sensor System has an emitting unit (First LIDAR Sensing System) which is designed to perform a measurement with at least one laser pulse and wherein the LIDAR system has a detection unit (Second LIDAR Sensing Unit), which is designed to detect an object-reflected laser pulse during a measurement time window. Furthermore, the LIDAR system has a control device (LIDAR Data Processing System/Control and Communication System/LIDAR Sensor Management System), which is designed, in the event that at least one reflected beam component is detected, to associate the detected beam component on the basis of a predetermined assignment with a solid angle range from which the beam component originates. The disclosure also includes a method for operating a LIDAR Sensor System.

The distance measurement in question is based on a transit time measurement of emitted electromagnetic pulses. The electromagnetic spectrum should range from the ultraviolet via the visible to the infrared, including violet and blue radiation in the range from 405 to 480 nm. If these hit an object, the pulse is proportionately reflected back to the distance-measuring unit and can be recorded as an echo pulse with a suitable sensor. If the emission of the pulse takes place at a time t0 and the echo pulse is detected at a later time t1, the distance d to the reflecting surface of the object over the transit time ΔtA=t1−t0 can be determined according Eq. 1.

$$d=\Delta tA\ c/2 \qquad \text{Eq. 1}$$

Since these are electromagnetic pulses, c is the value of the speed of light. In the context of this disclosure, the word electromagnetic comprises the entire electromagnetic spectrum, thus including the ultraviolet, visible and infrared spectrum range.

The LIDAR method is usefully working with light pulses which, for example, using semiconductor laser diodes having a wavelength between about 850 nm to about 1600 nm, which have a FWHM pulse width of 1 ns to 100 ns (FWHM=Full Width at Half Maximum). Also conceivable in general are wavelengths up to, in particular approximately, 8100 nm.

Furthermore, each light pulse is typically associated with a measurement time window, which begins with the emission of the measurement light pulse. If objects that are very far away are to be detectable by a measurement, such as, for example, objects at a distance of 300 meters and farther, this measurement time window, within which it is checked whether at least one reflected beam component has been received, must last at least two microseconds. In addition, such measuring time windows typically have a temporal distance from each other.

The use of LIDAR sensors is now increasingly used in the automotive sector. Correspondingly, LIDAR sensors are increasingly installed in motor vehicles.

The disclosure also relates to a method for operating a LIDAR Sensor System arrangement comprising a First LIDAR Sensor System with a first LIDAR sensor and at least one Second LIDAR Sensor System with a second LIDAR sensor, wherein the first LIDAR sensor and the second LIDAR sensor repeatedly perform respective measurements, wherein the measurements of the first LIDAR Sensor are performed in respective first measurement time windows, at the beginning of which a first measurement beam is emitted by the first LIDAR sensor and it is checked whether at least one reflected beam component of the first measurement beam is detected within the respective first measurement time window. Furthermore, the measurements of the at least one second LIDAR sensor are performed in the respective second measurement time windows, at the beginning of which a second measurement beam is emitted by the at least one second LIDAR sensor, and it is checked whether within the respective second measurement time window at least one reflected beam portion of the second measuring beam is detected. The disclosure also includes a LIDAR Sensor System arrangement with a first LIDAR sensor and at least one second LIDAR sensor.

A LIDAR (light detection and ranging) Sensor System is to be understood in particular as meaning a system which, in addition to one or more emitters for emitting light beams, for example in pulsed form, and a detector for detecting any reflected beam components, may have further devices, for example optical elements such as lenses and/or a MEMS mirror.

The oscillating mirrors or micro-mirrors of the MEMS (Micro-Electro-Mechanical System) system, in some embodiments in cooperation with a remotely located optical system, allow a field of view to be scanned in a horizontal angular range of e.g. 60° or 120° and in a vertical angular range of e.g. 30°. The receiver unit or the sensor can measure the incident radiation without spatial resolution. The receiver unit can also be spatial angle resolution measurement device. The receiver unit or sensor may comprise a photodiode, e.g. an avalanche photo diode (APD) or a single photon avalanche diode (SPAD), a PIN diode or a photomultiplier. Objects can be detected, for example, at a distance of up to 60 m, up to 300 m or up to 600 m using the LIDAR system. A range of 300 m corresponds to a signal path of 600 m, from which, for example, a measuring time window or a measuring duration of 2 μs can result.

As already described, optical reflection elements in a LIDAR Sensor System may include micro-electrical mirror systems (MEMS) and/or digital mirrors (DMD) and/or digital light processing elements (DLP) and/or a galvo-scanner for control of the emitted laser beam pulses and/or reflection of an object-back-scattered laser pulses onto a sensor surface. Advantageously, a plurality of mirrors is provided. These may particularly be arranged in some implementations in the manner of a matrix. The mirrors may be individually and separately, independently of each other rotatable or movable.

The individual mirrors can each be part of a so-called micro mirror unit or "Digital Micro-Mirror Device" (DMD). A DMD can have a multiplicity of mirrors, in particular micro-mirrors, which can be rotated at high frequency between at least two positions. Each mirror can be individually adjustable in its angle and can have at least two stable positions, or with other words, in particular stable, final states, between which it can alternate. The number of mirrors can correspond to the resolution of a projected image, wherein a respective mirror can represent a light pixel on the area to be irradiated. A "Digital Micro-Mirror Device" is a micro-electromechanical component for the dynamic modulation of light.

Thus, the DMD can for example provide suited illumination for a vehicle low and/or a high beam. Furthermore, the DMD may also serve projection light for projecting images, logos, and information on a surface, such as a street or surrounding object. The mirrors or the DMD can be designed as a micro-electromechanical system (MEMS). A movement of the respective mirror can be caused, for example, by energizing the MEMS. Such micro-mirror arrays are available, for example, from Texas Instruments. The micro-mirrors are in particular arranged like a matrix, e.g. for example, in an array of 854×480 micro-mirrors, as in the DLP3030-Q1 0.3-inch DMP mirror system optimized for automotive applications by Texas Instruments, or a 1920×1080 micro-mirror system designed for home projection applications 4096×2160 Micro-mirror system designed for 4K cinema projection applications, but also usable in a vehicle application. The position of the micro-mirrors is, in particular, individually adjustable, for example with a clock rate of up to 32 kHz, so that predetermined light patterns can be coupled out of the headlamp by corresponding adjustment of the micro-mirrors.

In some embodiments, the used MEMS arrangement may be provided as a 1D or 2D MEMS arrangement. In a 1D MEMS, the movement of an individual mirror takes place in a translatory or rotational manner about an axis. In 2D MEMS, the individual mirror is gimballed and oscillates about two axes, whereby the two axes can be individually employed so that the amplitude of each vibration can be adjusted and controlled independently of the other.

Furthermore, a beam radiation from the light source can be deflection through a structure with at least one liquid crystal element, wherein one molecular orientation of the at least one liquid crystal element is adjustable by means of an electric field. The structure through which the radiation to be aligned is guided can comprise at least two sheet-like elements coated with electrically conductive and transparent coating material. The plate elements are in some embodiments transparent and spaced apart from each other in parallel. The transparency of the plate elements and the electrically conductive coating material allows transmission of the radiation. The electrically conductive and transparent coating material can at least partially or completely made of a material with a high electrical conductivity or a small electrical resistance such as indium tin oxide (ITO) and/or of a material with a low electrical conductivity or a large electrical resistance such as poly-3,4-ethylenedioxythiophene (PEDOT).

The generated electric field can be adjustable in its strength. The electric field can be adjustable in particular by applying an electrical voltage to the coating material or the coatings of the plate elements. Depending on the size or height of the applied electrical voltages on the coating materials or coatings of the plate elements formed as described above, differently sized potential differences and thus a different electrical field are formed between the coating materials or coatings.

Depending on the strength of the electric field, that is, depending on the strength of the voltages applied to the coatings, the molecules of the liquid crystal elements may align with the field lines of the electric field.

Due to the differently oriented liquid crystal elements within the structure, different refractive indices can be achieved. As a result, the radiation passing through the structure, depending on the molecular orientation, moves at different speeds through the liquid crystal elements located between the plate elements. Overall, the liquid crystal elements located between the plate elements have the function of a prism, which can deflect or direct incident radiation. As a result, with a correspondingly applied voltage to the electrically conductive coatings of the plate elements, the radiation passing through the structure can be oriented or deflected, whereby the deflection angle can be controlled and varied by the level of the applied voltage.

Furthermore, a combination of white or colored light sources and infrared laser light sources is possible, in which the light source is followed by an adaptive mirror arrangement, via which radiation emitted by both light sources can be steered or modulated, a sensor system being used for the infrared light source intended for environmental detection. The advantage of such an arrangement is that the two light systems and the sensor system use a common adaptive mirror arrangement. It is therefore not necessary to provide for the light system and the sensor system each have their own mirror arrangement. Due to the high degree of integration space, weight and in is particular costs can be reduced.

In LIDAR systems, differently designed transmitters and receiver concepts are also known in order to be able to record the distance information in different spatial directions. Based on this, a two-dimensional image of the environment is then generated, which contains the complete three-dimensional coordinates for each resolved spatial point. The different LIDAR topologies can be abstractly distinguished based on how the image resolution is displayed. Namely, the resolution can be represented either exclusively by an angle-sensitive detector, an angle-sensitive emitter, or a combination of both. A LIDAR system, which generates its resolution exclusively by means of the detector, is called a Flash LIDAR. It includes of an emitter, which illuminates as homogeneously as possible the entire field of vision. In contrast, the detector in this case includes of a plurality of individually readable and arranged in a matrix segments or pixels. Each of these pixels is correspondingly assigned a solid angle range. If light is received in a certain pixel, then the light is correspondingly derived from the solid angle region assigned to this pixel. In contrast to this, a raster or scanning LIDAR has an emitter which emits the measuring pulses selectively and in particular temporally sequentially in different spatial directions. Here a single sensor segment is sufficient as a detector. If, in this case, light is received by the detector in a specific measuring time window, then this light comes from a solid angle range into which the light was emitted by the emitter in the same measuring time window.

To improve Signal-to-Noise Ratio (SNR), a plurality of the above-described measurements or single-pulse measurements can be netted or combined with each other in a LIDAR Sensor System, for example to improve the signal-to-noise ratio by averaging the determined measured values.

The radiation emitted by the light source is in some embodiments infrared (IR) radiation emitted by a laser diode in a wavelength range of 600 nm to 850 nm. However, wavelengths up to 1064 nm, up to 1600 nm, up to 5600 nm or up to 8100 nm are also possible. The radiation of the laser diode can be emitted in a pulse-like manner with a frequency between 1 kHz and 1 MHz, in some implementations with a frequency between 10 kHz and 100 kHz. The laser pulse duration may be between 0.1 ns and 100 ns, in some implementations between 1 ns and 2 ns. As a type of the IR radiation emitting laser diode, a VCSEL (Vertical Cavity Surface Emitting Laser) can be used, which emits radiation with a radiation power in the “milliwatt” range. However, it is also possible to use a VECSEL (Vertical External Cavity Surface Emitting Laser), which can be operated with high pulse powers in the wattage range. Both the VCSEL and the VECSEL may be in the form of an array, e.g. 15×20 or 20×20 laser diodes may be arranged so that the summed radiation power can be several hundred watts. If the lasers pulse simultaneously in an array arrangement, the largest summed radiation powers can be achieved. The emitter units may differ, for example, in their wavelengths of the respective emitted radiation. If the receiver unit is then also configured to be wavelength-sensitive, the pulses can also be differentiated according to their wavelength.

Further embodiments relating to the functionality of various components of a LIDAR Sensor System, for example light sources, sensors, mirror systems, laser driver, control equipment, are described in Chapter "Components".

Other embodiments are directed towards how to detect measure and analyze LIDAR measurement data as provided by the components described in Chapter "Components". These embodiments are described in Chapter "Detection System".

Other embodiments are directed to data analysis and data usage and are described in Chapter "Data Usage".

The appendix "EXPLANATIONS AND GLOSSARY" describes further aspects of the referenced and used technical terms It is an object of the disclosure to propose improved components for a LIDAR Sensor System and/or to propose improved solutions for a LIDAR Sensor System and/or for a LIDAR Sensor Device and/or to propose improved methods for a LIDAR Sensor System and/or for a LIDAR Sensor Device.

The object is achieved according to the features of the independent claims. Further aspects of the disclosure are given in the dependent claims and the following description.

Figure 1:
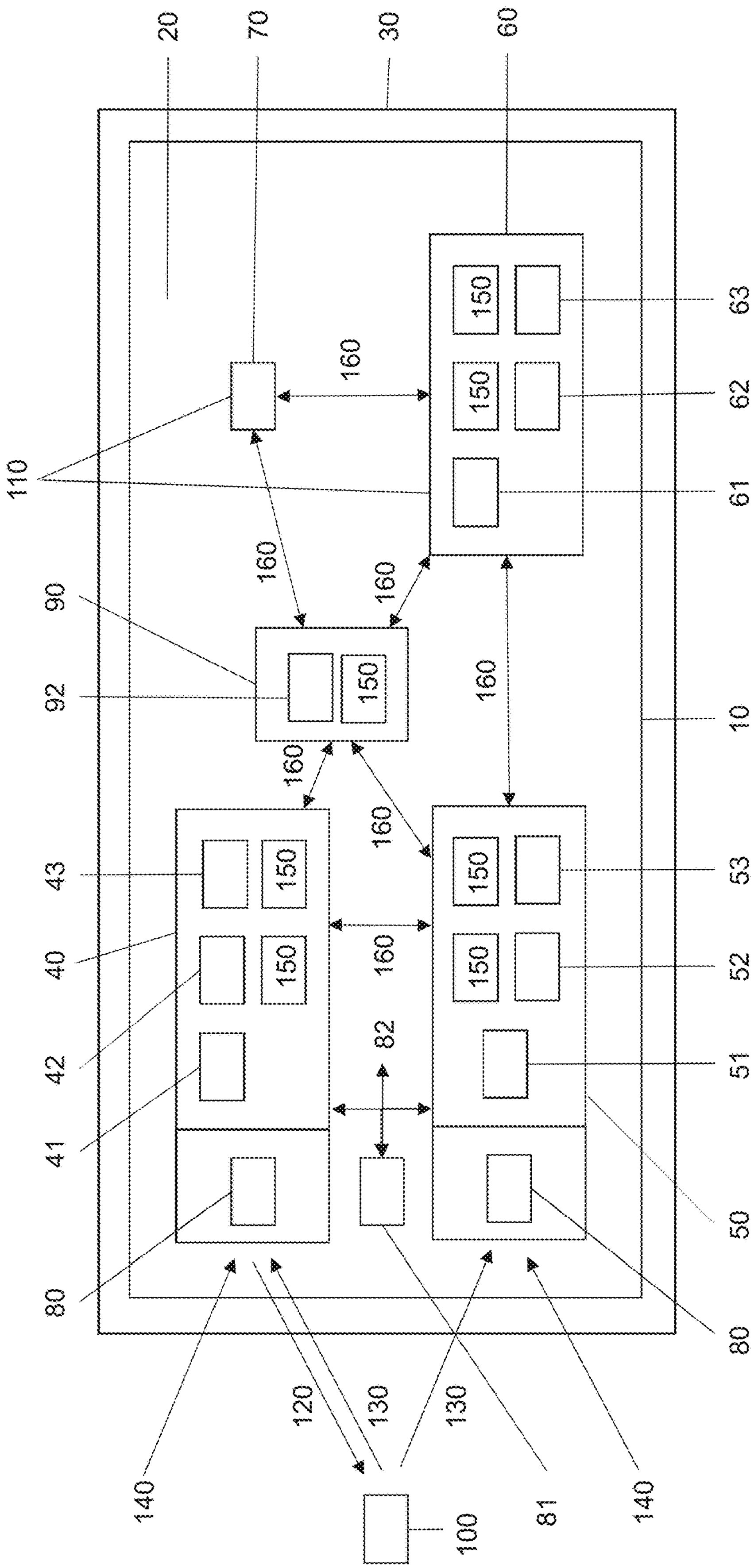
FIG. 1 shows schematically an embodiment of the proposed to LIDAR Sensor System, Controlled LIDAR Sensor System and LIDAR Sensor Device

FIG. 1 shows schematically an embodiment of the proposed LIDAR Sensor System, Controlled LIDAR Sensor System and LIDAR Sensor Device.

The LIDAR Sensor System 10 comprises a First LIDAR Sensing System 40 that may comprise a Light Source 42 configured to emit electro-magnetic or other radiation 120, in particular a continuous-wave or pulsed laser radiation in the blue and/or infrared wavelength range, a Light Source Controller 43 and related Software, Beam Steering and Modulation Devices 41, in particular light steering and reflection devices, for example Micro-Mechanical Mirror Systems (MEMS), with a related control unit 150, Optical components 80, for example lenses and/or holographic elements, a LIDAR Sensor Management System 90 configured to manage input and output data that are required for the proper operation of the First LIDAR Sensing System 40.

The First LIDAR Sensing System 40 may be connected to other LIDAR Sensor System devices, for example to a Control and Communication System 70 that is configured to manage input and output data that are required for the proper operation of the First LIDAR Sensor System 40.

The LIDAR Sensor System 10 may include a Second LIDAR Sensing System 50 that is configured to receive and measure electromagnetic or other radiation, using a variety of Sensors 52 and Sensor Controller 53.

The Second LIDAR Sensing System may comprise Detection Optics 82, as well as Actuators for Beam Steering and Control 51.

The LIDAR Sensor System 10 may further comprise a LIDAR Data Processing System 60 that performs Signal Processing 61, Data Analysis and Computing 62, Sensor Fusion and other sensing Functions 63.

The LIDAR Sensor System 10 may further comprise a Control and Communication System 70 that receives and outputs a variety of signal and control data 160 and serves as a Gateway between various functions and devices of the LIDAR Sensor System 10.

The LIDAR Sensor System 10 may further comprise one or many Camera Systems 81, either stand-alone or combined with another Lidar Sensor System 10 component or embedded into another Lidar Sensor System 10 component, and data-connected to various other devices like to components of the Second LIDAR Sensing System 50 or to components of the LIDAR Data Processing System 60 or to the Control and Communication System 70.

The LIDAR Sensor System 10 may be integrated or embedded into a LIDAR Sensor Device 30, for example a housing, a vehicle, a vehicle headlight.

The Controlled LIDAR Sensor System 20 is configured to control the LIDAR Sensor System 10 and its various components and devices, and performs or at least assists in the navigation of the LIDAR Sensor Device 30. The Controlled LIDAR Sensor System 20 may be further configured to communicate for example with another vehicle or a communication networks and thus assists in navigating the LIDAR Sensor Device 30.

As explained above, the LIDAR Sensor System 10 is configured to emit electro-magnetic or other radiation in order to probe the environment 100 for other objects, like cars, pedestrians, road signs, and road obstacles. The LIDAR Sensor System 10 is further configured to receive and measure electromagnetic or other types of object-reflected or object-emitted radiation 130, but also other wanted or unwanted electromagnetic radiation 140, in order to generate signals 110 that can be used for the environmental mapping process, usually generating a point cloud that is representative of the detected objects.

Various components of the Controlled LIDAR Sensor System 20 use Other Components or Software 150 to accomplish signal recognition and processing as well as signal analysis. This process may include the use of signal information that come from other sensor devices.

Chapter "Components"

Vehicle headlights can employ a variety of light sources. One option is to use a LARP (Laser Activated Remote Phosphor) Light Source that is comprised of an excitation light source, for example a blue laser, and a partially blue light transmissive conversion element, for example a yellow emitting Cer:YAG ceramic phosphor. The combination of (unchanged) transmitted blue excitation radiation and yellow conversion lights results in a white light that can be used as low beam, high beam, spot beam, and the like. Such a phosphor can also be transmissive for other than blue wavelength, for example infrared laser radiation. One aspect of this disclosure is to let infrared IR-laser radiation from a second source in the wavelength range from 850 to 1600 nm impinge on the phosphor and use the transmitted infrared laser beam as infrared source for a LIDAR sensing function.

Another aspect of the disclosure is that not only infrared laser radiation can be used for LIDAR sensing purposes but also other wavelength, in particular, monochromatic violet or blue wavelength emitted by a laser in the wavelength range from 405 to about 480 nm. The advantage of using a blue LIDAR pulse is that the typically used silicon based detection sensor elements are more sensitive to such wavelengths because blue radiation has a shorter depth of penetration into the sensor material than infrared. This allows reducing the blue laser beam power and/or sensor pixel size while maintaining a good Signal-to-Noise-Ratio (SNR). It is further advantageous to include such a blue LIDAR Sensor System into a vehicle headlight that emits white light for road illumination purposes. White light can be generated by down-conversion of a blue excitation radiation, emitted from an LED or laser, into yellow conversion light, for example by using a Cer:YAG phosphor element. This method allows the use of blue laser emitter radiation for both purposes, that is, vehicle road illumination and blue LIDAR sensing. It is also advantageous to employ at least two LIDAR Sensor Systems per vehicle that have different wavelengths, for example, as described here, blue and infrared. Both LIDAR laser pulses can be synchronized (time sequentially of time synchronically) and be used for combined distance measurement thus increasing the likeliness of a correct object recognition.

Vehicle headlights employing MEMS or DMD/DLP light processing mirror devices can be used for projection of visible road light (road illumination, like low beam, high beam) but also for projection of information and images onto the surface of a road or an object and/or for the projection of infrared radiation for LIDAR Sensor System purposes. It is advantageous to use a light processing mirror device for some or all of the before mentioned purposes. In order to do so, the (usually white) road illuminating light and/or the (usually colored) light for information projection and/or the infrared LIDAR laser light are optically combined by a beam combiner, for example a dichroic mirror or an X-cube dichroic mirror, that is placed upstream of the mirror device. The visible and the infrared light sources are then operatively multiplexed so that their radiation falls on the mirror device in a sequential manner thus allowing individually controlled projection according to their allotted multiplex times. Input for the sequential projection can be internal and external sensor data, like Camera, Ultrasound, Street Signs and the like.

It is advantageous to use VCSEL-laser arrays that emit infrared radiation (IR-VCSEL radiation). Such a VCSEL array can contain a multitude of surface emitting laser diodes, also called laser pixels, for example up to 10,000, each of them emitting infrared radiation with a selected, same or different, wavelength in the range from 850 to 1600 nm. Alternatively, fiber light sources can be used instead of laser diodes.

Orientation of the emission direction by tilting some of the laser pixels and/or by using diffractive optics, for example an array of microlenses, allows a distributed emission into the desired Field-of-View (FOV). Each of these minute laser pixels can be controlled individually in regard to pulse power, pulse timing, pulse shape, pulse length, Pulse Width FWHM, off-time between subsequent pulses and so on. It is advantageous when each of the laser pixels emit their light onto a corresponding micro-lens system and are then emitted into the Field-of-View (FOV). Using the above mentioned laser controller allows changing of laser power and other characteristics of each of the laser pixels. Such a VCSEL infrared light source can be used as light source for a LIDAR Sensor System.

Furthermore, it is possible to combine some of the miniature laser pixels into a group and apply the chosen electrical setting to this particular group. The laser pixels of this group can be adjacent or remote to each other. It is thereby possible to generate a variety of such groups that can be similar in pixel number and/or geometrical layout as another group, or different. A selected laser pixel grouping can be changed according to the needs, in particular their power setting.

Such a group can also show a geometrical pattern, for example a cross, diamond, triangle, and so on. The geometrical pattern can be changed according to the illumination needs (see below). The entire VCSEL and/or the VCSEL-subgroups can be sequentially operated one after the other, in particular in a successive row of adjacently placed laser pixels. Thus it is possible to adjust the emitted infrared power of one or some of such pixel-groups for example as a function of distance and/or relative velocity to another object and/or type of such object (object classification), for example using a lower infrared power when a pedestrian is present (photo-biological safety), or a higher power setting for remote object recognition. A LIDAR Sensor System can employ many of such VCSEL-laser arrays, all individually controllable. The various VCSEL arrays can be aligned so that their main optical axis are parallel but they can also be inclined or tilted or rotated to each other, for example in order to increase FOV or to emit desired infrared-patterns into certain parts (voxels) of the FOV.

It is advantageous to adjust the emission power of infrared laser diodes used in a LIDAR Sensor System according to certain requirements or conditions such a photo biological safety, object classification, and object distance. A LIDAR Sensor System can for example emit a first infrared test beam in order to measure object distance, object type, object reflectivity for visible, UV or IR radiation and so on, and then regulate laser power according to (pre-)defined or recognized scenarios and operational or environmental settings.

It is advantageous when the information about a detected object is provided by another sensor system, for example a visual or infrared camera or an ultrasound sensing system, since such sensors can be more sensitive and/or reliable for the detection of certain object types and positions at certain distances. Such auxiliary sensing system can be mounted to the same vehicle that also carries the discussed LIDAR Sensor System, but can also be located externally, for example, mounted to another vehicle or being placed somewhere along the road.

Additional regulating parameters for the LIDAR Sensor System can be vehicle speed, load, and other actual technical vehicle conditions, as well as external conditions like night, day, time, rain, location, snow, fog, vehicle road density, vehicle platooning, building of vehicle swarms, level of vehicle autonomy (SAE level), vehicle passenger behavior and biological driver conditions.

Furthermore, a radiation of the light source can be passed through a structure containing at least one liquid crystal element, wherein an, in particular molecular, orientation of the at least one liquid crystal element is adjustable by means of an electric field. The structure through which the radiation to be aligned or deflected is passed through may comprise at least two plate elements coated with electrically conductive and transparent coating material, in particular in sections, e.g. Glass plates. The radiation of the light source to be aligned or deflected is in some embodiments perpendicular to one of the plate elements. The plate elements are in some embodiments transparent and spaced apart in parallel. The transparency of the plate elements and the electrically conductive coating material allows transmission of the radiation. The electrically conductive and transparent coating material may be at least partially or entirely made of a material with a high electrical conductivity or a small electrical resistance such as indium tin oxide (ITO) and/or of a material with a low electrical conductivity or a large electrical resistance such as poly-3,4-ethylenedioxythiophene (PEDOT) exist.

The electric field thus generated can be adjustable in its strength. The electric field can be adjustable in its strength in particular by applying an electrical voltage to the coating material, i.e. the coatings of the plate elements. Depending on the applied electrical voltages on the coating to materials or coatings of the plate elements as described above, different potential differences and thus a differently strong electric field are formed between the coating materials or coatings.

Depending on the strength of the electric field, i.e. depending on the strength of the voltages applied to the coatings, the molecules of the is liquid crystal elements can align according to the field lines of the electric field.

Due to the differently oriented liquid crystal elements within the structure, different refractive indices can be achieved. As a result, the radiation passing through the structure, depending on the molecular orientation, moves at different speeds through the liquid crystal elements located between the plate elements. Overall, the liquid crystal elements located between the plate elements have the function of a prism, which can deflect or direct incident radiation. As a result, with a correspondingly applied voltage to the electrically conductive coatings of the plate elements, the radiation passing through the structure can be oriented or deflected, whereby the deflection angle can be controlled and varied by the level of the applied voltage.

LIDAR laser emitter (Light Source) need to be operated so that they can emit infrared radiation with short pulses (ns), short rise times until full power, high power, for example higher than 40 A, and low inductivity. In order to accomplish this task it is advantageous to connect an energy storage device, for example a capacitor using silicon materials, a transistor, for example an FET transistor, and a laser diode, with a least one interconnection that has an inductivity lower than 100 pH. The advantageous solution employs at least one electrical connection with either a joint connection or a solder connection or a glue connection. It is further advantageous to establish such a low inductivity connection for all electrical connections. It is further advantageous when a laser emitter and an energy storing capacitor are placed adjacent to each other on the same substrate and whereby the transistor is mounted using the Flip-Chip-Technology on top of the capacitor and on top of the laser diode.

It is advantageous to place the laser emitter, for example a side emitter or a VCSEL array, an optical device for beam steering, for example a lens or a MEMS or a fiber, and a sensing unit for the detection of back scattered laser pulses, directly or in a stapled fashion onto a joint substrate. A sensing unit can be configured as a PIN-Diode, an APD Avalanche Photo Diode or a SPAD (Single Photon APD). The photodiodes can be read using a logic module. It is even more advantageous to also place the logic module, for example a programmable microcontroller (ASIC), onto the same substrate, for example an FR4-lead frame or a substrate based on semiconductor material, like a silicon substrate, or a metallic substrate. In some embodiments, the programmable microcontroller is configured as application specific standard product (ASSP) using a mixed-Signal-ASIC.

It is further advantageous to thermally decouple, at least partially, the logic device and the sensor unit (with photo-diodes) by providing a cut-out through the substrate that de-couples the two components thus decreasing thermal noise of the photo-diodes and therefore increasing their SNR-value. The combination of all these advantageous solutions allows building a very compact LIDAR Sensor System.

It is advantageous if the Laser sensor system is built in a compact manner since it allows for easy integration into a head light or another electro-optical module. It is further advantageous to use the laser pulse beam steering optical system also as optical system for back-scattered laser pulse in order to direct these onto a sensor device. It is further advantageous to use a deflection mirror, for example a metallic reflector, or a dichroic-coated prismatic device or a TIR-lens, to out-couple the laser beam through the before mentioned optical system into the field-of-view. It is further advantageous to miniaturize such a deflecting mirror and place it directly onto the sensor surface (PIN-Diode, APD Avalanche Photo Diode, SPAD Single Photon APD) thus further compactifying the LIDAR Sensor Device. It is also possible to use more than one laser emitter and emitter-specific deflection mirrors that can then have different mechanical and optical features like surface shape (flat, convex, concave), material composition, inclination of the reflective mirror side in regard to the incoming laser beam, dichroic coating, as well as the placement position on the sensor surface. It is further advantageous if such a mirror device is monolithically integrated or manufactured together with the sensing device.

It is advantageous if an array of individually formed optical lenses (1-dimensional or 2-dimensional lens array) collect backscattered LIDAR radiation from solid angles of the Field-of-View that differentiate in regard to their angle and spatial orientation. The various lenses can be standalone and individually placed or they can be formed as a connected lens array. Each of these lenses project backscattered infrared light onto dedicated sensor surfaces. It is further advantageous, that lenses that are related to more central sections of the FOV collect radiation from smaller solid angles than lenses placed on the outer edge of a lens array, collection radiation from larger solid angles. The lenses can have asymmetric surfaces that furthermore can be adaptively adjustable depending on a laser feedback signal (TOF, object detection) and other internal or external input signals. Adaptively adjustable can mean to change lens form and shape, for example by using fluid lenses, or by changing lens position and lens inclination by using mechanical actuators. All this increases the likeliness of a reliable object recognition even under changing environmental and traffic conditions.

Another advantageous aspect of the disclosure is to collect back-scattered LIDAR pulse radiation from defined spatial segments of the Field-of-View by using a mirror system, for example a MEMS or a pixelated DMD mirror system, where each mirror element is correlated with a distinct spatial segment of the FOV, that directs backscattered light onto distinct areas of a sensor surface depending on the individually adjustable mirror position. DMD mirror pixels can be grouped together in order to allow a higher reflection of back-scattered laser light from corresponding FOV-segments onto a sensor surface thus increasing signal strength and SNR-value.

Another advantageous aspect of the disclosure is that in a scanning LIDAR Sensor System a sensor surface is divided into at least two is individually addressable segments whose dividing line is inclined with respect to a (horizontal) scan line thus leading to two sensor signals. The multiple sensor surface segments can be arranged in a way that corresponds a translational movement leading to a complete tessellation of the entire sensor surface, or they can be mirror-symmetric but still covering the entire sensor surface area. The edge-surface of two facing sensor surface segments can be smooth or jagged and therefore the dividing line between two facing sensor surfaces can be smooth or jagged. Jagged edge surface allow for signal dithering. The use of multiple sensor segments enables signal processing (mean values, statistical correlation with surface shapes, statistical correlation with angle of the dividing line, as well as surface shapes signal dithering) thus increasing object detection reliably and SNR-value. In another aspect, the dividing line between two sensor surface part only needs to be partially inclined, but can otherwise have vertical or horizontal dividing sections.

The LIDAR Sensor System according to the present disclosure can be combined with a LIDAR Sensor Device for illuminating and sensing of an environmental space connected to a light (radiation) control unit. The LIDAR Sensor System and the LIDAR Sensor Device may be configured to emit and sense visible and/or infrared radiation. The infrared radiation may be in the wavelength range from 780 nm to 1600 nm.

Photodetector response times can be between 100 μs (InGaAs avalanche photo diode; InGaAs-APD) and 10 ns (Silicon pn-Diode; Si-PN), depending on the photodetector technologies that are used. These ultra-short LIDAR pulses require short integration times and suitable detectors with low noise and fast read-out capability. Depending on object reflectivity, attainable object distance and eye safety regulation (IEC 60825-1), LIDAR Sensor Systems need to employ highly sensitive photo-detector and/or high power ultrashort pulse lengths. One semiconductor technology used to create such ultra-short LIDAR pulses is utilizing Gallium-Nitride semiconductor switches respectively GaN-FETs. In order to suppress ambient noise each of the following methods can be employed: reducing the laser pulse time while increasing pulse peak power, limiting the detection-aperture, or narrowing the wavelength filtering of the emitted laser light at the detector, and/or employ statistical correlation methods. Design and operation of a photosensitive SPAD-element may be optimized, for example, via a pn-junction with high internal charge amplification, a CMOS-based SPAD array, a time-gated measurement of the detector signal for evaluating the TOF signals, an architecture of APD and SPAD sensor pixel with detached receiver electronics based on Chip-on-board technology (CoB), an architecture of CMOS-embedded SPAD elements for in pixel solutions, and a mixed signal based pixel architecture design with optimized In-pixel-TDC (TDC: time-to-digital converter) architecture.

In various embodiments, a time-resolved detection of backscattered LIDAR signals is provided by means of high-resolution optical sensor chips. A (e.g. discrete) electronic setup for evaluation of single pixel (picture element) arrangements in conjunction with MEMS-based scanning LIDAR topologies is disclosed. In more detail, mixed signal analog and digital circuitries are provided for detecting and analyzing LIDAR ToF signals both for common bulk-substrate integrated circuits (common sub-micron based CMOS chip fabrication technology) as well as for heterogeneous integration in 3D wafer-level architecture and stacked 3D IC fabrication with short interconnection technology as through-silicon-via (TSV) for a system in package (SIP). The compact and robust solid-state LIDAR concepts which will be described in more detail below are suitable e.g. both for automotive applications as well as for example for a general application in spectroscopy, face recognition, and detection of object morphologies.

With reference to Eq. 1, the time lapse (transit time) of a light pulse from the emitter to a remote object and back to a sensor depends on the object's distance d and is given by $$\Delta t = 2d/c. \quad \text{Eq. 2}$$

The temporal resolution (time stamping precision) of the transit time is limited by the width of the emitted light pulse Tpulse rather than by the integration time of the sensor itself which directly translates to a depth accuracy of:

$$2\Delta d = c\, T\text{pulse}, \quad \text{Eq. 3}$$

$$\Delta d = (c/2)T\text{pulse}. \quad \text{Eq. 4}$$

The effective width of the emitted laser pulse is determined either by the pulse width of the Laser pulse or by the least charge-collection time (integration time) for signal generation in the sensor, e.g. implemented as a photosensitive receiver element, e.g. including a photo diode. For optical ranging application the imaging sensors should allow for a timing resolution in the range of ns (nanoseconds) and sub-ns such as ps (picoseconds).

Typical rise-times of different photodetector technologies, e.g. photo diodes are:

| | |
|---|---|
| Silicon pn diode (Si-PN) | 2 ns to 10 ns |
| Silicon pin diode (Si-PIN) | 70 ps |
| InGaAs pin diode (InGaAs-PIN) | 5 ps |
| InGaAs avalanche photo diode (InGaAs-APD) | 100 ps |
| Germanium pn diode (Ge-PN) | 1 ns |

Considering the signal rise time of the typical optical receiver devices, the width of the transmitted laser pulse can be set to as short as possible, e.g. in the lower 10 ns range (<5 ns) which still gives adequate integration time for collecting the photo generated charge along with reasonable time-stamping for a TDC-application in LIDAR. It is also to be mentioned as a side effect that the short charge integration time inherently suppresses the influence of the ambient background light from the sun with adequate is pulse peak power.

As an example for a total depth accuracy of Δd=1 m the duration of the light pulse has to be less than $T\text{pulse} < 2 \cdot \Delta d/c = 6.6$ ns. For a total range accuracy of Δd=0.3 m the maximal pulse duration has to be less than $T\text{pulse} < 2 \cdot \Delta d/c = 2$ ns. A depth precision in the cm-range demands a timing precision of less than 1 ns. Light pulses on that short time scales with ns time discrimination capability lead to short integrations times for collecting the photo-electric generated charge and therefore may require sensors of high bandwidth with low noise and fast read-out capability.

The high bandwidth of the detection, however, tends to show higher noise floors which compete with the weakness of the received signals.

The optical sensor (light-pulse receiver) provided in various embodiments may be an avalanche photodiode, which produces a small current or charge signal proportional to the receiving power of the backscattered light signal. As an alternative, the optical sensor provided in various embodiments may be a single photon avalanche diode (SPAD), which produces a small current peak, which is triggered by the return signal.

Due to the shortness of the emitted and backscattered light pulse, the effective integration time on the sensor side for collecting the photo generated charge is also short and has to be compensated by adequate laser peak power (pulse irradiance power) while the received return signal needs to be adequately amplified and processed for determination of the light transient time (time lapse) and the object's distance. Typical responsivity values for the sensitive/for conventional photo-receivers are in the range of 1 A/W=1 nA/nW.

In various embodiments, the amplified return signal is measured and processed to conduct a distance measurement. For high-speed applications as in autonomous vehicle, the LIDAR sensor system may be configured to detect an object with 10% reflectivity at a distance of 300 m and is distinguish between objects of 30 cm in size with adequate latency time of less than 20 msec.

Various embodiments may provide a LIDAR design that has a front-facing FoV of 100°×25° with 0.15° resolution which has to be illuminated by an average optical power of less than 5 W and a laser pulse repetition rate that allow for a >25 Hz total refresh rate.

Since a laser transmitting in the near-IR (NIR) may cause eye damage, the average emitted power of the LIDAR sensor system has to be limited to fulfil the IEC60825-1 safety specification which is based on the maximum permissible exposure limit (MPE) for the human eye, as already outlined above. The MPE is defined as the highest average power in W/cm$^2$ of a light source that is considered to be safe. The free parameter of a LIDAR sensor system to circumvent the constraints of the MPE may be either to increase the sensitivity of the sensor which can be rated as PEmin in at-toJ/pulse or in nW during peak time or to increase the optical peak-power by reducing the length of a laser pulse while keeping the average optical scene illumination power fixed. The detailed requirement of the LIDAR sensor systems with an optical average power of 5 W then translates to a transmitted laser pulse power of less than 2.5 kW at 2 ns width at a repetition rate of less than 1 MHz for a Scanning LIDAR sensor system or to a laser peak power of less than 100 MW at 2 ns width at the repetition rate of less than 25 Hz for a Flash LIDAR sensor system.

To achieve such timing requirements, the appropriate semiconductor technology may be gallium-nitride and GaN-FETs for pulse laser generation. This may provide for fast high-power switching in the ns range.

Figure 11:
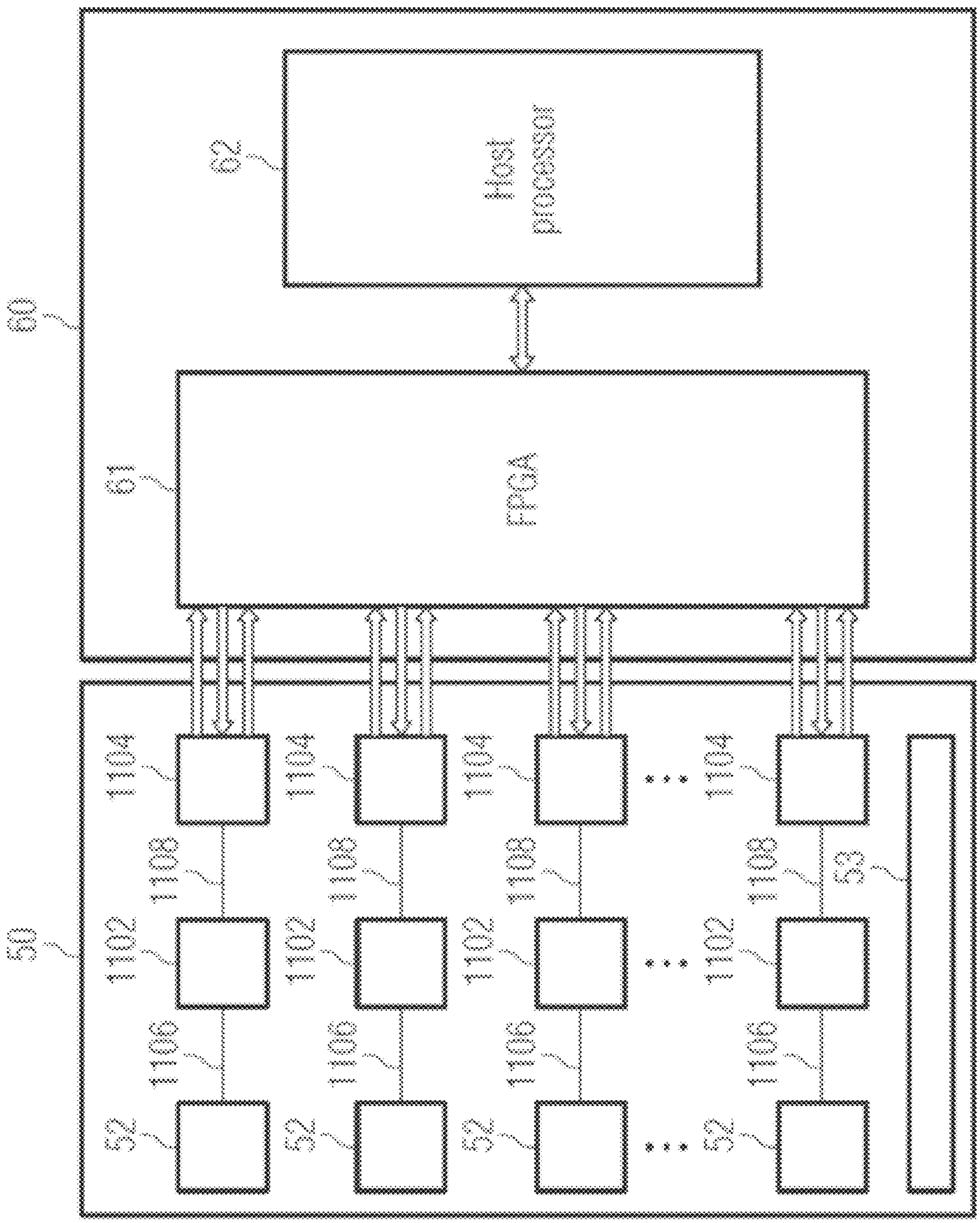
FIG. 11 shows an embodiment of a portion of the proposed LIDAR Sensor System with mixed signal processing.

FIG. 11 shows the Second LIDAR Sensing System 50 and the LIDAR Data Processing System 60 in more detail. In various embodiments, the Second LIDAR Sensing System 50 includes a plurality of sensor elements 52 (which may also be referred to as pixels or sensor pixels), a plurality of energy storage circuits 1102, a plurality of read-out circuitries 1104, and the sensor controller 53. Downstream coupled to the plurality of read-out circuitries 1104, the advanced signal processing circuit 61 may be provided, implemented e.g. by a field programmable gate array (FPGA). Downstream coupled to the advanced signal processing circuit 61, the host processor 62 may be provided.

The plurality of sensor elements 52 may be arranged in a regular or an irregular array, e.g. in a matrix array or in a circular array or in any other desired type of array, and they may be positioned both on the same and on different substrates, and these substrates may be in the same plane or laterally and/or vertically shifted so that the substrates are not positioned on a common plane. Furthermore, the plurality of sensor elements 52 may all have the same size and/or shape or at least some of them may have a different sizes and/or different shapes. By way of example, some sensor elements 52 of the plurality of sensor elements 52 arranged in the center of an array may have a larger size than other sensor elements 52 of the plurality of sensor elements 52 arranged further away from the center, or vice versa. Each sensor element 52 of the plurality of sensor elements 52 may include one or more photo diodes such as e.g. one or more avalanche photo diodes (APD), e.g. one or more single photon avalanche diodes (SPAD) and/or a SiPM (Silicon Photomultipliers) and/or a CMOS sensors (Complementary metal-oxide-semiconductor) and/or a CCD (Charge-Coupled Device) and/or a stacked multilayer photodiode. Each sensor element 52 may e.g. have a size in the range of about 1 μm$^2$ (1 μm*1 μm) to about 10,000 μm$^2$ (100 μm*100 μm), e.g. in the range of about 100 μm$^2$ (10 μm*10 μm) to about 1,000 μm$^2$ (10 μm*100 μm). It is to be noted that other sizes and arbitrary shapes of the sensor elements 52 may be provided.

The SPAD is a photosensitive (e.g. silicon based) pn-junction element with high internal charge amplification and the capability to detect single photons due to the internal amplification of the initially generated photoelectrons up to macroscopic charge values in the fC-range to pC-range which can be measured by suitable conventional electronics, which will be explained in more detail below. A basic characteristics of the SPAD is the avalanche triggering probability which is driven by the shape of the internal electric field and which can be optimized by profiling the electrical field distribution in the pn-junction. Graded field profiles are usually superior to stepped field profiles. SPAD based pixels may enable timing resolution in the ps range with jitter values of <50 ps, while due to the low activation energy of <0.5 eV, the SPAD's dark count rate DCR is typically high and poses the main limiting factor for the valid minimum achievable detectable light signal. Despite the uniform voltage biasing in SPAD pixel arrays, the DCR behavior may show less uniformity with variation even in the magnitude range and for general quality analysis, the temperature dependent DCR should be measured over the whole sensor array. Afterpulsing in SPAD pixels may give rise to correlated noise related to the initial signal pulse and it may be minimized by the design of suitable quenching circuitries of fast avalanche extinction capability since afterpulsing leads to measurement distortions in time resolved applications. Optical cross-talk is a parameter in SPAD arrays which is caused by the emission of optical photons during the avalanche amplification process itself and can be minimized by the introduction of deep trench isolation to the adjacent pixel elements.

Figure 12B:
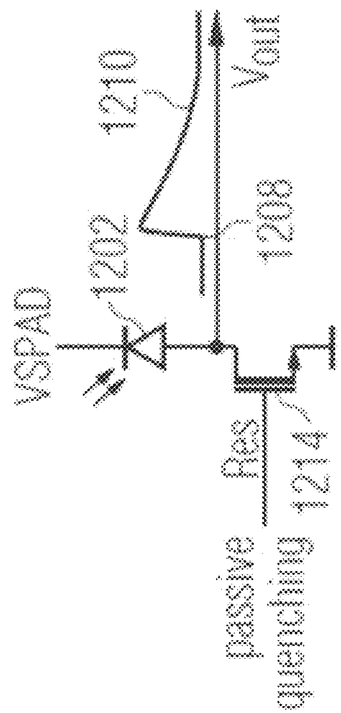
FIGS. 12A to 12C illustrate the operation and application principle of a single photon avalanche diode (SPAD) in accordance with various embodiments.
Figure 12A:
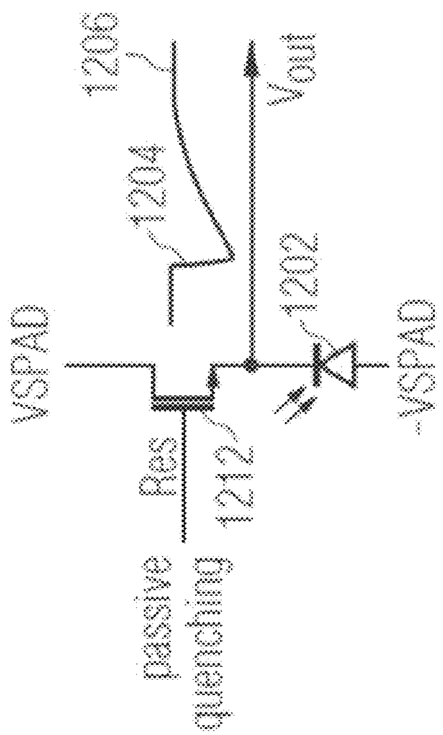
Figure 12C:
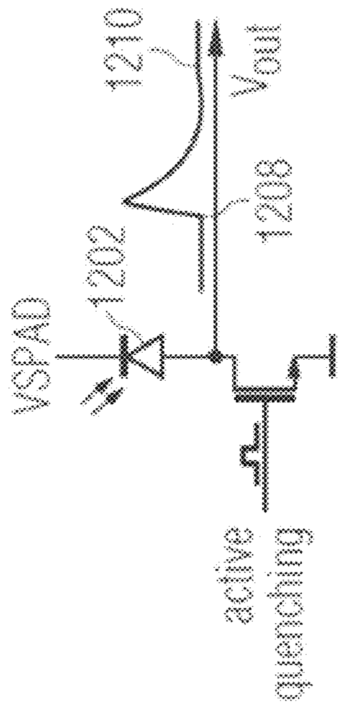
Figure 13A:
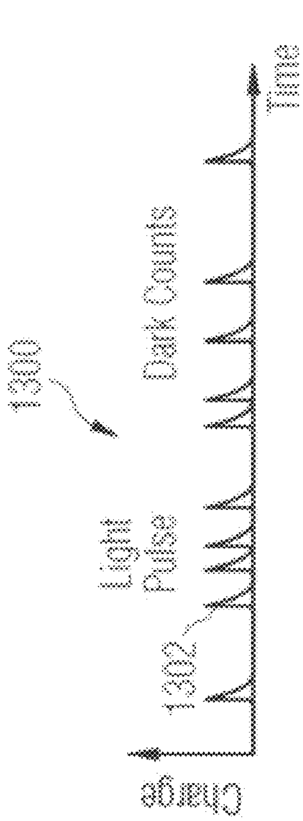
FIGS. 13A to 13D illustrate the various SPAD event detector diagrams in accordance with various embodiments.
Figure 13B:
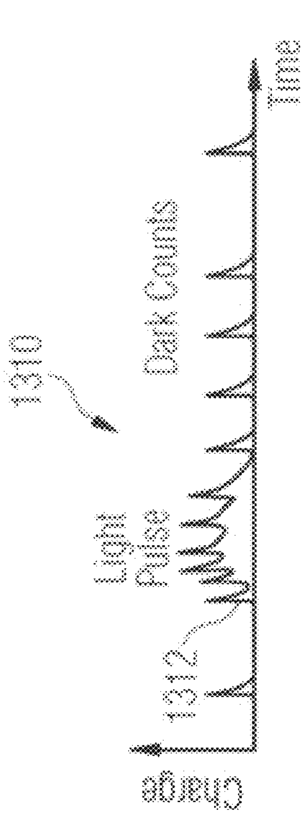
Figure 13C:
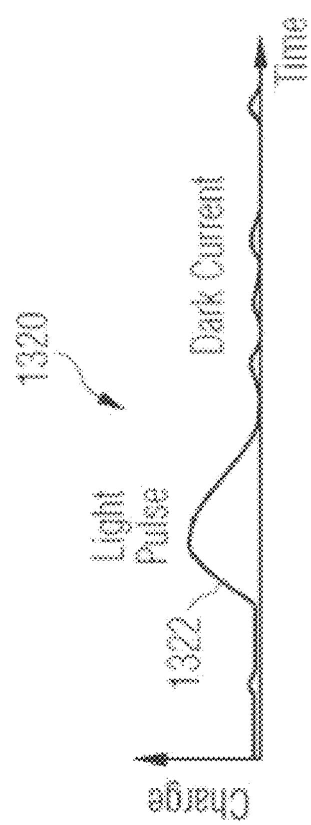
Figure 13D:
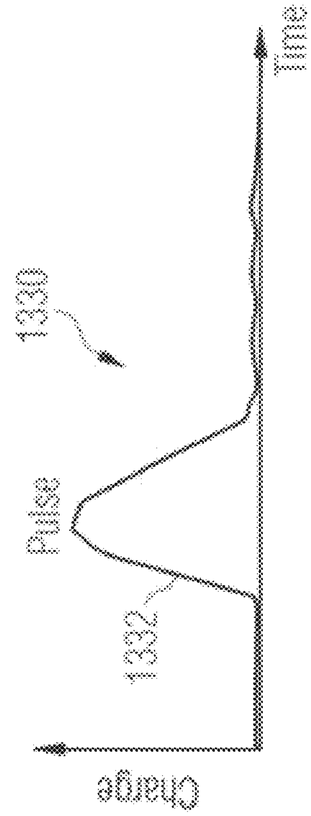

FIG. 12A to FIG. 12C illustrate the operation and application principle of a single photon avalanche diode (SPAD) 1202 in accordance with various embodiments. The SPAD 1202 is a pn-junction which may be biased above the breakdown, i.e. in the so-called Geiger mode, to detect single photons. SPADs 1202 may be provided both in Si-SOI (silicon-on-insulator) technology as well as in standard CMOS-technology. A cathode of the SPAD 1202 may be biased above the breakdown voltage at e.g. ~25V. A falling edge 1204 of a SPAD signal 1206 (FIG. 12A) or a rising edge 1208 of a SPAD signal 1210 (FIG. 12B and FIG. 12C) marks the detection time of a photon and may be used for being connected to a conventional digital counter circuit or to a stop-input of a digital time of arrival circuit (TAC), as will be described further below. A passive quenching may be implemented by a serial resistor 1212, 1214 to stop the triggered charge avalanche, while active quenching may be implemented by a switch which is activated by an automatic diode reset circuit (ADR) (not shown) after the event detection itself (quenching-strategy) (FIG. 12C). Fast quenching/recharge techniques with tunable dead-time may be applied to improve the temporal event resolution. The recovery time of Vcath after the event is determined by the time constant of the quenching resistor and the intrinsic junction capacity, which typically results in a dead time of e.g. approximately 100 ns for passive quenching and down to e.g. approximately 10 ns for active quenching.

The SPAD 1202 is configured to detect the appearance of single photons at arrival time in the ps range. The intensity of a received light (photon flux=number of photons/time) may be encoded in the count rate of detector diagrams 1300, 1310, 1320, 1330 as illustrated in FIG. 13A to FIG. 13D. The light intensity at a certain point of time can be determined by evaluating the count rate from a counter signal 1302, 1312, 1322, 1332 received by a counter coupled downstream to a respective SPAD in a certain time window. Low light condition provides a low count rate which has its minimum at the dark count rate DCR and which can be considered as a basic background noise floor (see low light counter signal 1302 in FIG. 13A), while with higher light intensities the counter's count is driven to its maximum count rate capability (max. count rate value) which is limited by the dead-time of the SPAD element itself (see medium light counter signal 1312 in FIG. 13B, higher light counter signal 1322 in FIG. 13C and high light counter signal 1332 in FIG. 13D). The dead-time of a single SPAD is determined by the quenching mechanism for stopping the self-sustained charge avalanche of the SPAD. Since the dead-time of SPADs are usually in the range of about >10 ns up to 100 ns which usually is higher than the targeted time resolution, a count-rate analysis may be performed either in a statistical sense by repetitive measurements within the given time window or by implementing a multitude of SPADs (e.g. more than 1000 SPADs) into one single pixel cell array in order to decrease the effective dead-time of the parallel SPADs to meet desired targeted requirements of the gate time resolution. The internal dead-time of a pixel element=<10 nsec (recent measurement). In SiPM-SPAD pixel elements as well as in APDs, the magnitude of the diode's output signal is proportional to the intensity of the detected light (i.e. the number of photons, which arrived at the diode's photosensitive layer), while for SPADs, the output-signal is a well-defined current pulse peak which is saturated due to the avalanche amplification in the overcritical biased pn-junction (biasing beyond the nominal avalanche breakdown voltage). Since SPAD pixels are intrinsically digital devices they provide fast and high signal output and they may be coupled directly to digital ICs (integrated circuits) for combining high sensitive photon-counting capability with digital TDC counters for time-stamping functionality or gated counts' measurement within a given time window (gated count rate analysis). For interconnecting the different unit technologies of the SPAD based sensor element 52 and the conventional CMOS based digital electronics Flip-chip-technique on die-level or chip-package level is one possible solution to meet RF (radio frequency) timing requirements. Imaging behavior of a single-photon counting SPAD for low light condition and for high light intensities are shown. For a low light condition (see FIG. 13A), the SPAD may resolve the appearance of the single photons and the light intensity is encoded in the observed count rate, which can be measured by conventional counter logic, as will be explained in more detail below. For the medium light condition (see FIG. 13B), the increasing rate of the single photons already leads to pile-up effects and the SPAD may already respond with a mix of discrete charge counts and a continuous charge signal. For a high light condition (see FIG. 13C), the high rate of photons may lead to a continuous accumulation of photo generated charge at the SPAD's internal pn-capacity which then may be measured by a conventional transimpedance amplifier (TIA) of adequate timing capability. For a SiPM-pixel cell (see FIG. 13D) the summed output of the multitudes of parallel SPADs may lead to an analog charge signal, which reflects the intensity of the incoming light pulse on top of a continuous noise floor due to the background light level.

It is to be noted that Lidar imaging applications require a high uniformity over an entire pixel array. The exploitation of CMOS technology for SPAD arrays may offer the possibility to implement time-resolved image mechanism at pixel level (CIS process) whereby mostly customized analog solutions may be deployed.

For a time-resolved imaging application, the timing information may be generated and stored on pixel level in order to reduce the amount of data and bandwidth needed for the array read-out. For storing the timing information on the pixel level either in-pixel time-gating or time-tagging may be provided. The operations for gating and time-tagging may be performed with minimum area overhead to maintain a small pixel pitch with a high fill factor. Single-photon imaging sensors on CMOS level (CMOS-based SPADs) are suitable for low-light level imaging as well.

Figure 14:
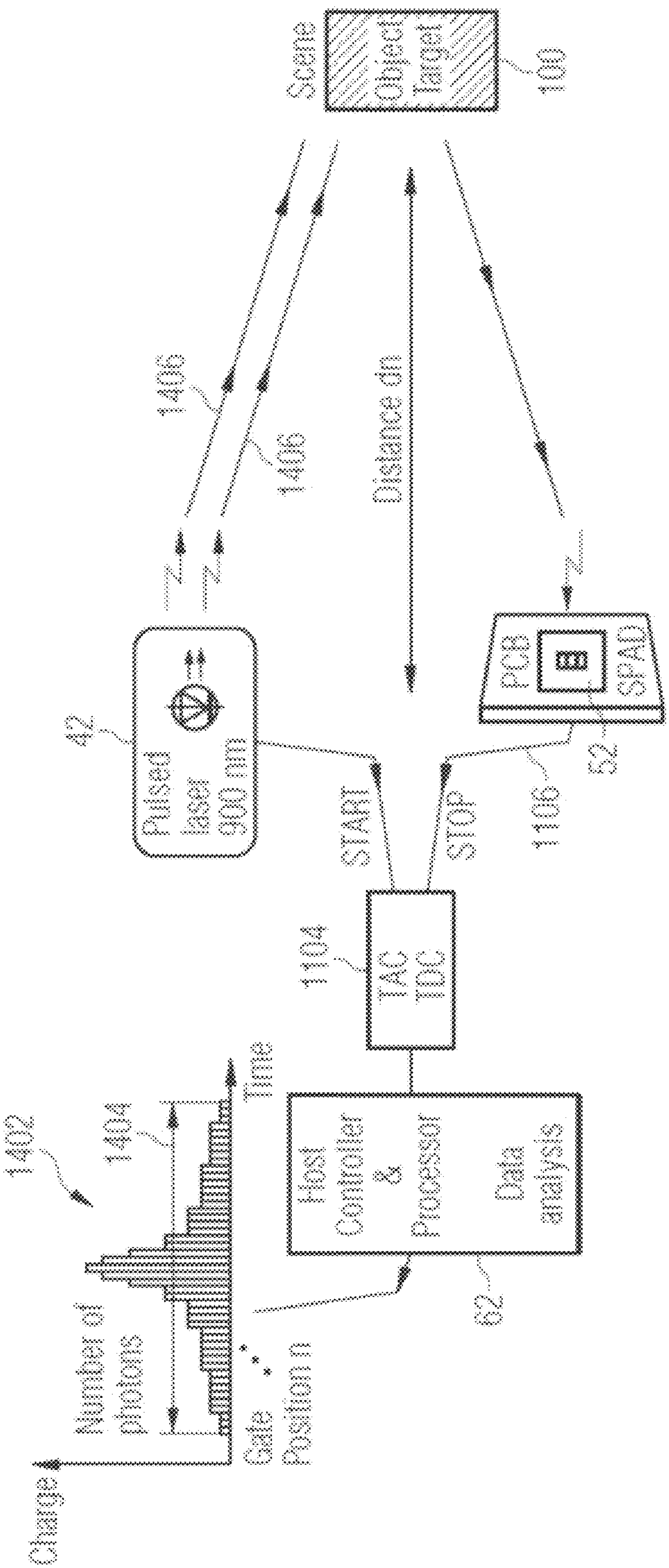
FIG. 14 shows a block diagram of a LIDAR setup for time gated measurement based on statistical photon count evaluation at different time window positions during the transient time of the laser pulse in accordance with various embodiments.

Referring now to FIG. 11 and FIG. 14, each sensor element 52 of the plurality of sensor elements 52 may include one or more SPADs as described above and may thus provide an SPAD signal 1106 to a respectively assigned and downstream coupled energy storage circuit 1102 of the plurality of energy storage circuits 1102 (not shown in FIG. 14). A further downstream coupled read-out circuitry 1104 may be configured to read out and convert the analog energy signal into a digital signal.

Illustratively, a solution to determine the prevailing SPAD count rate is simply to integrate the current peaks of the incoming events at a given point of time to derive the collected charge as an intensity value of the incoming light level (boxcar-integrator) (see charge diagram 1402 in FIG. 14), whereby the predefined position of the active time gate determines the event-time of the measured light pulse (see as an example a gate window (also referred to as time gate or time window) 1404 schematically illustrated in association with the charge diagram 1402 in FIG. 14). The concept of the time-gated measurement for ToF analysis is shown in FIG. 14. The position of the time gate 1404 with reference to the front edge of a laser pulse 1406 correlates to the distance do of the object 100 in the scene and the gate-width determines the depth resolution of the measurement. A gate-time of less than 5 ns may be adequate for many applications and the length of the emitted laser pulse 1406 should ideally be in the same range for a faster retrieval of signal significance in the targeted time window 1404. Alternatively the position of the gate window 1404 can be set automatically on appearance of a valid detector signal (event-driven gating). A representative timing signal from the detector's raw signal can be derived by applying analog threshold circuities (as will be described in more detail below) or by simple capacitive-coupling of the SPAD signal which is suitable for providing stop signals to steer either analog TAC-converter or digital TDC of adequate temporal resolution prior to measuring the time lapse from the laser pulse 1406 emission until the detection at event arrival. It is to be noted that the threshold values could also be a function of day/night, i.e. ambient light level. In general, the threshold setting may be controlled by the backend, i.e. for example by the LIDAR Date Processing System 60 or by the sensor controller 53 where the data are evaluated and classified. In the backend are best perspectives to decide about the reasoning for threshold setting. The backend can also decide best whether and how the thresholds can be adapted to the various light conditions (day/night).

FIG. 14 shows a block diagram of a LIDAR setup for time gated measurement on base of statistical photon count evaluation at different time window positions during the transient time of the laser pulse. The position of the gated window 1404 which correlates to the distance do of the observed (in other words targeted) object 100 may be set and scanned either by the host controller 62 itself or by the trigger-based pre-evaluation of the incoming detector signal (event-based measuring). The predefined width of the gate window 1404 determines the temporal resolution and therefore the resolution of the objects' 100 depth measurement. For data analysis and post processing, the resulting measurements in the various time windows 1404 can be ordered in a histogram which then represents the backscattered intensity in correlation with the depth, in other words, as a function of depth. To maximize the detection efficiency of the gated measurement the length of the laser pulse 1406 should be set slightly larger than the width of the gate window 1404. A dead time of the SPAD 52 should be shorter than the targeted gate 1404, however, longer dead times in the range of >1 ns (typically >10 ns) can be compensated by repetitive measurement to restore the statistical significance of the acquired photon counts or by the application of SiPM-detectors where the effective dead time is decreased by the multitude of parallel SPADs 52 in one pixel cell. In case of low intensities of the backscattered light, the signal strength can be determined by evaluating the count rate of the discrete single-photon signals 1106 from the detector during the gate time 1404.

An example of a laser (e.g. a Triggered Short Pulse Laser) 42 with a pulse width of less than 5 ns and high enough power would be: Teem Photonic-STG-03E−1x0−Pulse duration: 500 ps/Q-switched−Peak power: 6 kW−Average power: 12 mW−Wavelength: 532 nm−Linewidth: 0.8 μm.

SPAD 52 wafers may be processed in a silicon-on-insulator (SOI) technology of reduced leakage current which shows low epitaxial compatibility to standard electronic CMOS-fabrication technology. In various embodiments, the back illuminated photonic components may be implemented on a separate structure (Photonic-IC), while the read-out electronic (e.g. the read-out circuitries 1104) in standard CMOS technology can be either implemented together with the SPAD 52 or an interconnection can be facilitated by C4-flip-chip technique. In case of SPAD 52 based sensor arrays, the heterogeneous combination of SPADs 52 and standard CMOS technology has lower impact on the fill factor if the connection is facilitated on the rear side of the sensor.

The sensors 52 like PDs, APDs and SPADs or SiPMs deliver analog photo current signals 1106 which need to be converted by a transimpedance amplifier (TIA) to a voltage to be further amplified in order to trigger the required logic control pulses (thresholds) for prober time-resolved imaging. Most often leading edge discriminator stages or constant fraction discriminator stages (CFD) were used to retrieve the required logical event signals for TDC based time lapse measurement or ADC based intensity conversion. In case the photo detector element (sensor) 52 only provides an analog output signal, the analog output signal is pre-amplified by an adequate TIA circuit and the ToF measurements are performed on the basis of the extracted logic control signals (Event-Trigger-generation) prior to stopping the digital-based ToF measurement by TDC or prior to stopping the analog-based ToF measurement by TAC (TAC=Time to analog converter) or prior to triggering the analog measurement via digital conversion by the ADC(s). This will be explained in more detail further below.

In various embodiments, for the digital based TDC measurement, a digital counter of high enough accuracy is set up to acquire the time lapse starting from the initial laser pulse and stopping by the arrival of the event signal, whereby the remaining content of the counter represents the ToF value. For the analog based TAC measurement, an analog current source of high enough precision is set up to charge a well-defined capacitor by being started from the initial laser pulse and stopped on the arrival of the event signal, and the remaining voltage value at the capacitor represents the measured ToF value. As the pure analog solutions can be performed with a relatively low parts count in close proximity to the event detector's SPAD 52 element, the consecutive ADC-stage for digital conversion has about the same parts complexity as the TDC chip in the pure digital solution. ADC-conversion is provided to digitize the measured analog value both for the intensity signal from the TIA amplifier as well as from the TAC amplifier if used. It is to be mentioned that SPAD-based detectors may deliver both analog intensity signals as well as fast signal outputs of high time precisions which can be fed directly to the TDC-input for digital ToF-measurement. This provides a circuitry with a low power consumption and with a very low amount of produced digital sensor data to be forwarded to the advanced signal processing circuit (such as FPGA 61).

Figure 15A:
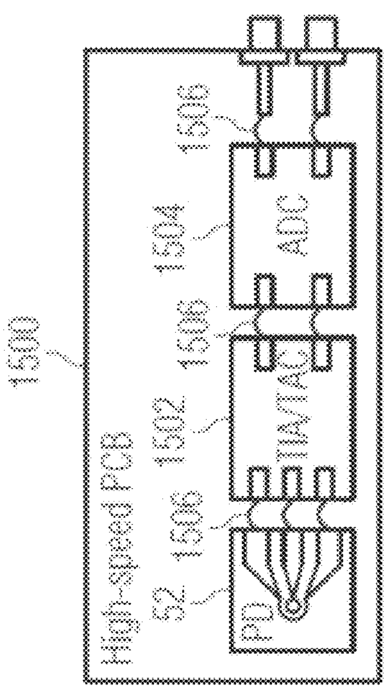
FIGS. 15A to 15D illustrate the interconnection between a Photonic-IC (PIC) (as a sensor element) and the standard Electronic-IC (EIC) in accordance with various embodiments.
Figure 15B:
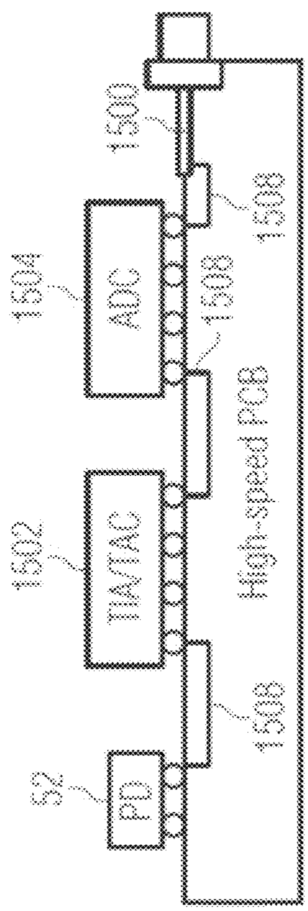
Figure 15C:
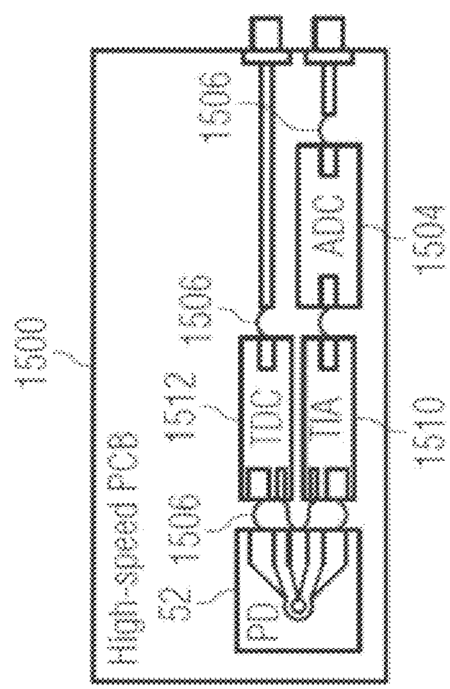
Figure 15D:
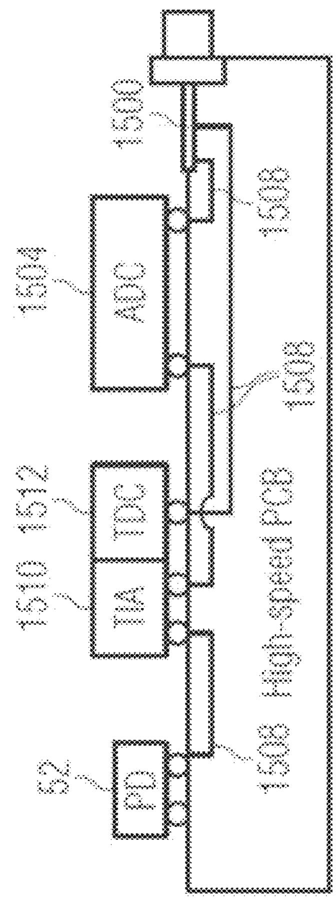

For pixel architectures with detached photonic detector the analog output of the PD 52 may be wire-bonded (by bond wires 1506 as shown in FIG. 15A) or C4-connected (by PCB traces 1508 as shown in FIG. 15B) to a TIA chip 1502 which itself is connected to the traces on the printed circuit board (PCB) 1500 prior to interface with the end connectors to a consecutive ADC-circuit 1504 as shown in FIG. 15A and FIG. 15B, where the chip packages of the photosensitive photo-element and the read-out electronic are fixed on a High-Speed-PCB 1500 as a detector board. FIG. 15A and FIG. 15B thus illustrate the interconnection between a detached Photonic-IC (PIC) and the standard Electronic-IC (EIC) both in wire-bonded technique (FIG. 15A) as well as in flip-chip-technique (FIG. 15B). The PD chip 52 and the TIA/TAC chip 1502 are mounted onto the common high speed carrier PCB 1500 through which the high-speed interlink is made. FIG. 15C and FIG. 15D illustrates the interconnection between the detached Photonic-IC (PIC) and the standard Electronic-IC (EIC) both in wire-bonded technique (FIG. 15C) as well as in flip-chip-technique (FIG. 15D). The PD chip 52, a TIA chip 1510, and a digital TDC-chip 1512 are mounted onto the common high speed carrier PCB 1500 through which the high-speed interlink is made.

SPAD structures with adequate photon detection efficiency may be developed in standard CMOS technologies. A SPAD implemented in standard CMOS technology may enable the design of high-speed electronics in close proximity to the sensitive photo optical components on the same chip and enables the development of low-cost ToF chip technology both for LIDAR application and for general application as spectroscopy as well. CMOS technology also allows for the fabrication of 2D-SPAD array with time gating resolutions in the sub-ns range and to derive the depth-image of the entire scene in one shot. Various embodiments of APD and SPAD elements may be built on p-type substrate by using a p+/deep nwell guard ring to separate the SPAD element from the substrate. A PN-SPAD is implemented on top of the deep nwell layer, while the anode and cathode terminals are directly accessible at the high voltage node for capacitive coupling to the low voltage read-out electronic. Higher RED sensitivity and NIR sensitivity may be obtained with a deeper nwell/deep nwell junction. For achieving dense parts integration, the read-out electronics and the active quenching network can be implemented and partitioned next to the SPAD on the same deep nwell layer. In the deep nwell layer only n-type MOSFETs are feasible for building up the low voltage read-out electronic, while p-type transistors were not available.

For Flash LIDAR application a photo sensor array should provide a high spatial resolution with high efficiency which is in accordance with small pixels of high fill factor. Hence, the area occupation of the circuitry should be kept as small as possible. To keep the electronic area in the pixel as small as possible, analog solutions as analog TIAs and analog TACs are provided as will be explained in more detail below. Various techniques for realizing small pixels of good fill factor are to minimize the electronic section by employing simple active-pixel read-out circuitries with source follower and selection switch by making use of parasitic capacitances for charge storage and by reusing of the transistors for different purposes.

If the output of the sensor element 52 is too small for supplying a pulse directly to a time-pickoff unit (TAC, TDC), the sensor element 52 output should be amplified and shaped (pulse shaping). A possible technique for generating analog signals with extended bandwidth capabilities may be cascoded amplifier topologies which work as pure transconductance-amplifier (I2I-converter) with low feedback coupling and high bandwidth capability. Any appropriate cascoded amplifier topology may be chosen to adapt best to the prevailing use case.

Low level timing discriminators and event-threshold extraction for marking the arrival time of the signal work in an identical manner as fast amplifiers, whereby precision and consistency is required to compensate the different timing walk of different signal heights. Leading-edge discriminators (threshold triggering) and Constant-Fraction discriminators (constant fraction triggering) are designed to produce accurate timing information, whereby the simple leading-edge threshold triggering is less preferred, since it causes time walks as the trigger timing depends on the signal's peak height. CFD's in contrast are more precise, since they are designed to produce accurate timing information from analog signals of varying heights but the same rise time.

Time delays may be introduced into circuitries for general timing adjustment, prior to correcting the delays of different charge collection times in different detectors or prior to compensating for the propagation times in amplifier stages.

The basic circuitries for time-resolved imaging are analog TIAs and/or TACs, which should be of a low parts count for in-pixel implementation (in other words for a monolithical integration with the photo diode such as SPAD).

Figure 16:
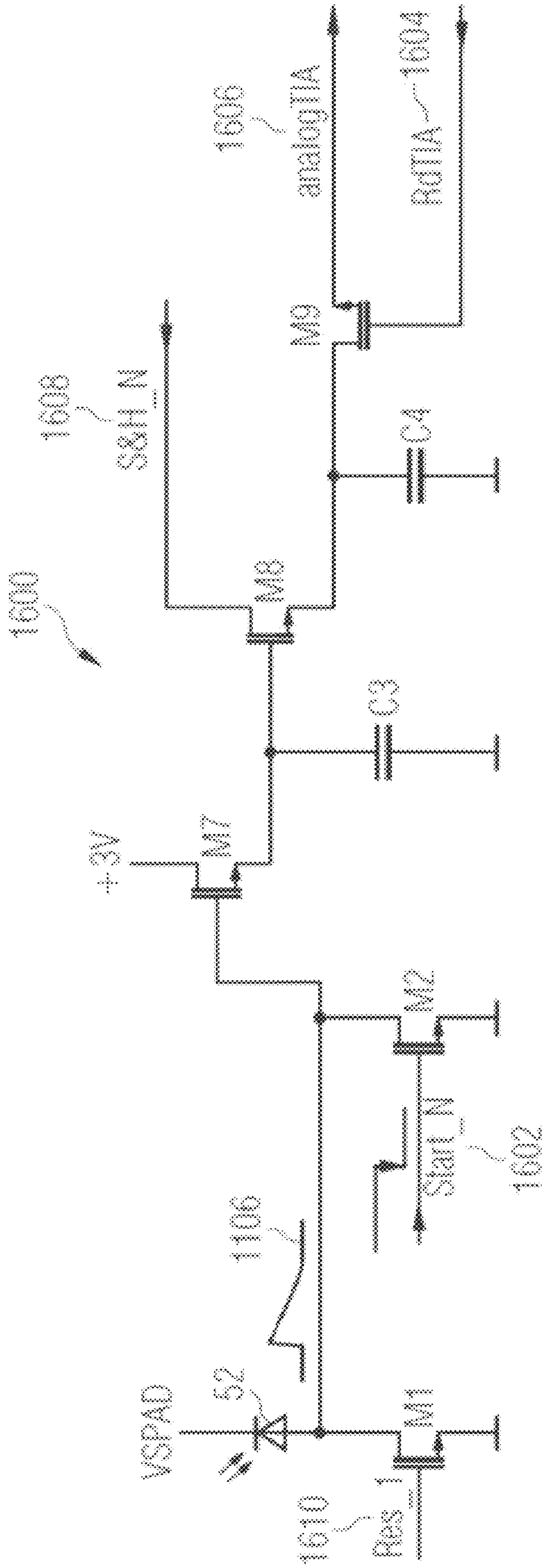
FIG. 16 shows an implementation of a TIA in accordance with various embodiments.

A transimpedance amplifier (TIA) 1600 as an example of a portion of the energy storage circuit 1102 in accordance with various embodiments is shown in FIG. 16. The TIA 1600 is configured to collect the injected charge signal from the photosensitive SPAD 52 and to store it on a memory capacitor for being read out from the backend on command. FIG. 16 shows a compact implementation of the TIA 1600 in an NMOS-based front end pixel.

An imaging MOSFET (e.g. NMOSFET) M7 becomes active upon appearance of a Start_N signal 1602 (provided e.g. by the sensor controller 53) to a Start-MOSFET (e.g. NMOSFET) M2 and collects a charge signal from the SPAD 52 (e.g. the SPAD signal 1106) onto the analog current memory at a first storage capacitor C3. A first node of the first storage capacitor C3 may be coupled to the ground potential (or to another reference potential) and a second node of the first storage capacitor C3 may be coupled to the source terminal of an Imaging-MOSFET M7 and to the gate terminal of a Probe-MOSFET M8. The gate terminal of the Start-MOSFET M2 is coupled to receive the Start_N signal 1602. Furthermore, the source terminal of the Start-MOSFET M2 is coupled to a reference potential such as ground potential, and the drain terminal of the Start-MOSFET M2 is directly electrically conductively coupled to the gate terminal of the Imaging-MOSFET M7. The SPAD 52 provides the SPAD signal 1106 to the gate terminal of the Imaging-MOSFET M7. The anode of the SPAD 52 may be on the same electrical potential (may be the same electrical node) as the drain terminal of the Start-MOSFET M2 and the gate terminal of the Imaging-MOSFET M7. The cathode of the SPAD 52 may be coupled to a SPAD potential VSPAD. Since the first storage capacitor C3 dynamically keeps the actual TIA-value, it can be probed by the Probe-MOSFET (e.g. NMOSFET) M8 by an external command (also referred to as sample-and-hold-signal S&H_N 1608) (e.g. provided by a sample-and-hold circuit as will be described later below) applied to the drain terminal of the Probe-MOSFET M8 for being stored at a second storage capacitor C4 and may be read out via a Read-out-MOSFET (e.g. NMOSFET) M9 to the backend for ADC conversion at a suitable desired time. A first node of the second storage capacitor C4 may be coupled to ground potential (or to another reference potential) and a second node of the second storage capacitor C4 may be coupled to the source terminal of the Probe-MOSFET M8 and to the drain terminal of the Read-out-MOSFET M9. The sample-and-hold-signal S&H_N 1608 may be applied to the drain terminal of the Probe-MOSFET M8. A TIA read-out signal RdTIA 1604 may be applied to the gate terminal of the Read-out-MOSFET M9. Furthermore, the Read-out-MOSFET M9 provides an analog TIA signal analogTIA 1606 to another external circuit (e.g. to the read-out circuitry 1104). The analog TIA signal analogTIA 1606 is one example of a TIA signal 1108 as shown in FIG. 11. FIG. 16 further shows a first Resistor-MOSFET (e.g. NMOSFET) M1 to provide a resistor for active quenching in response to a first resistor signal RES_1 1610. The first resistor signal RES_1 1610 is a voltage potential and serves to operate the first Resistor-MOSFET (e.g. NMOSFET) M1 to become a defined resistor.

Figure 17:
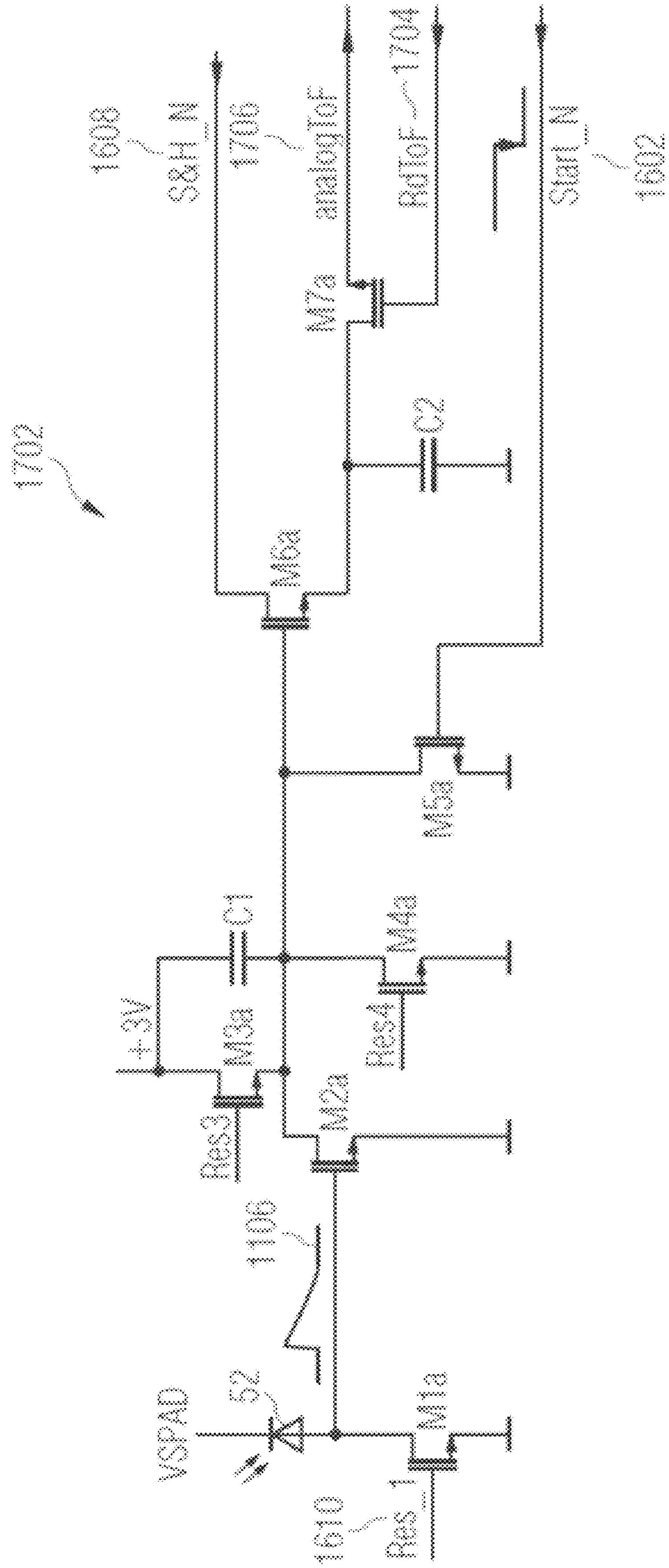
FIG. 17 shows an implementation of a TAC in accordance with various embodiments.
Figure 18:
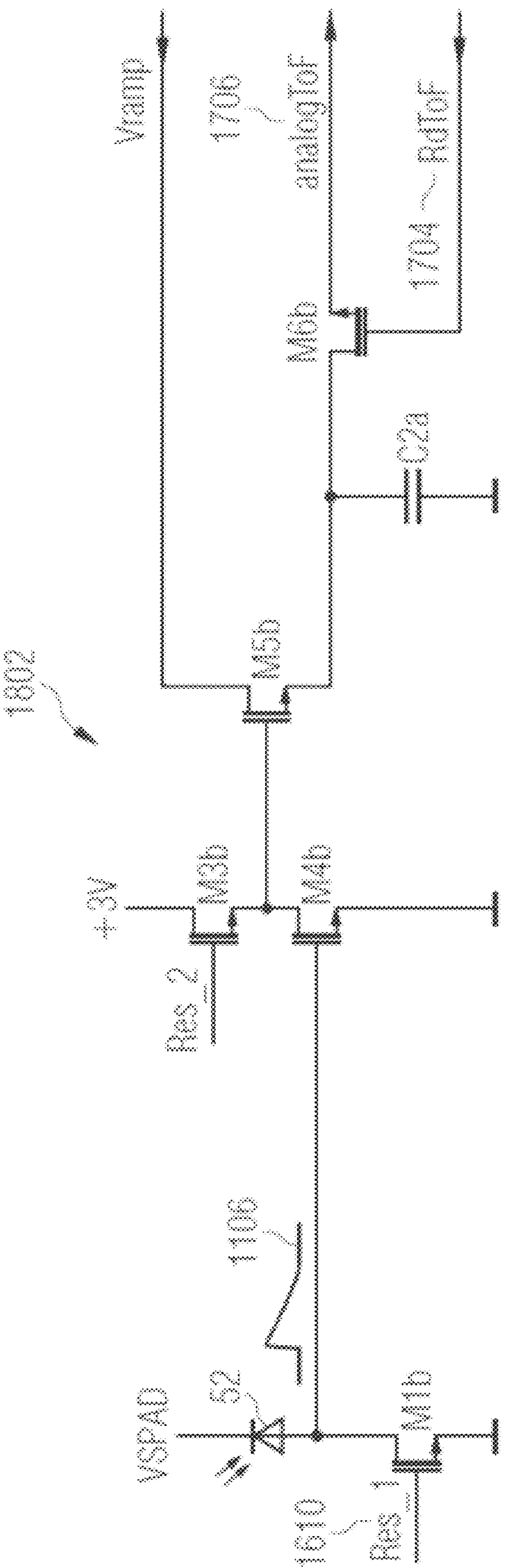
FIG. 18 shows another implementation of a TAC in accordance with various embodiments.

Each energy storage circuit 1102 may further include a first time to analog converter (TAC) 1702 as shown in FIG. 17. An alternative second TAC 1802 is shown in FIG. 18. The first TAC 1702 may be configured to measure the time lapse from the initial Start-signal Start_N 1602 until the arrival of the SPAD event by integrating the current of a precisely defined current source and the collected charge is stored in an analog current memory such as e.g. at a third capacitor C1 for being read-out from the backend on command. FIG. 17 and FIG. 18 show compact implementations of the TAC1702, 1802 in an NMOS-based front end pixel.

The first TAC 1702 includes a current source implemented by a first Current-Source-MOSFET (e.g. NMOSFET) M3*a* and a second Current-Source-MOSFET (e.g. NMOSFET) M4*a*. The current source becomes active upon appearance of the start signal Start_N signal 1602 at a TAC-Start-MOSFET (e.g. NMOSFET) M5*a* and will be stopped upon the occurrence of an event signal (e.g. SPAD signal 1106) from the SPAD 52 at an Event-MOSFET (e.g. NMOSFET) M2*a*. Since a charge memory (e.g. the third capacitor C1) keeps the actual TAC-value, it can be probed by a further Probe-MOSFET (e.g. NMOSFET) M6*a* on external command (e.g. the sample-and-hold-signal S&H_N 1608) to store the representing TAC-value on a fourth capacitor C2 for being read out via a ToF-Read-out-MOSFET (e.g. NMOSFET) M7*a* to the backend for ADC conversion at a suitable desired time. A ToF read-out signal RdToF 1704 may be applied to the gate terminal of the ToF-Read-out-MOSFET M7*a*. Furthermore, the ToF-Read-out-MOSFET M7*a* provides an analog ToF signal analogToF 1706 to another external circuit (e.g. to the read-out circuitry 1104). The analog ToF signal analogToF 1706 is another example of a TIA signal 1108 as shown in FIG. 11. Thus, the TIA signal 1108 may include a plurality of signals. Furthermore, FIG. 17 shows a further first Resistor-MOSFET (e.g. NMOSFET) M1*a* to provide a resistor for active quenching in response to the first resistor signal RES_1 1610. The first resistor signal RES_1 1610 is a voltage potential and serves to operate the further first Resistor-MOSFET (e.g. NMOSFET) M1 to become a defined resistor.

Alternatively, in the second TAC 1802, the sample-and-hold-signal S&H_N 1608 may be replaced by an analog voltage ramp Vramp which is fed in from an external circuit (e.g. from the sensor controller 53) and encodes the time lapse from a respective cycle-start. The analog voltage ramp Vramp may be applied to the drain terminal of a Ramp-MOSFET (e.g. NMOSFET) M5*b*, the gate terminal of which is coupled to the output terminal of the inverter stage, and the source terminal which is coupled to a first terminal of a TAC storage capacitor C2*a* and to the drain terminal of the further Probe-MOSFET M6*b*. A second terminal of the TAC storage capacitor C2*a* may be coupled to the ground potential or any other desired reference potential. Upon the occurrence of an event signal (e.g. SPAD signal 1106) from the SPAD 52, the inverter stage including a first Inverter-MOSFET (e.g. NMOSFET) M3*b* and a second Inverter-MOSFET (e.g. NMOSFET) M4*b* disconnects the actual analog voltage ramp Vramp from a TAC storage capacitor C2*a*. The voltage at the TAC storage capacitor C2*a* then represents the actual ToF value. In a more sophisticated version a quenching-resistor at the further first Resistor-MOSFET (e.g. NMOSFET) M1*b* can be actively controlled by an ADR-circuitry (not shown) which should be derived from the occurring SPAD signal 1106 (active quenching).

Referring back again to FIG. 11, in the mixed signal pixel architecture, the photosensitive element (e.g. the photo diode, e.g. the SPAD), i.e. the sensor 52, and the read-out electronics may be implemented on a common sub-micron based CMOS chip technology pixel and thus on a common die or chip or substrate. A mixed-signal integrated circuit may combine both analog and digital circuits on a single semiconductor die which are more difficult to design as scalable chips for manufacturing which is adaptable both for different process-technology as well as for keeping its functionality specification. As information encoding in analog circuitries in the voltage domain is different to information encoding of digital electronics in the time domain both technologies have different requirements for supply voltages and for special guard-ring decoupling topologies which has to be counterbalanced in the general chip design. One effect of the analog-mixed-signal system on-a-chip is to combine the analog based sensing in close proximity to the digital based data processing in order to achieve a high integration density and performance reliability. One effect of the digital signal processing as compared with analog signal processing may be seen in its inherent robustness against external noise coupling and the inherent robustness of digital circuits against process variations. Photosensitive pixel elements for the high speed LIDAR application are ideally suited for profitable application of mixed signal technology. The photosensitive element may include a single SPAD 52 or an SiPM-cell and the read-out electronics may include one or more TIAs, CFDs, TDCs and ADCs. For the in-pixel event analysis, the results as light transit time and light intensity may then be transferred with a high data rate to the FPGA 61 for being sent to the backend host processor 62 after pre-evaluation and adequate data formatting. The design of the pixel array may include or essentially consist of a customized mixed signal ASIC with the photosensitive elements as SiPM-cells and the mixed signal read-out circuit on the same wafer substrate, while the FPGA 61 may facilitate the fast data transfer between the sensor-pixel 50 and the backend host-processor 62.

Figure 25A:
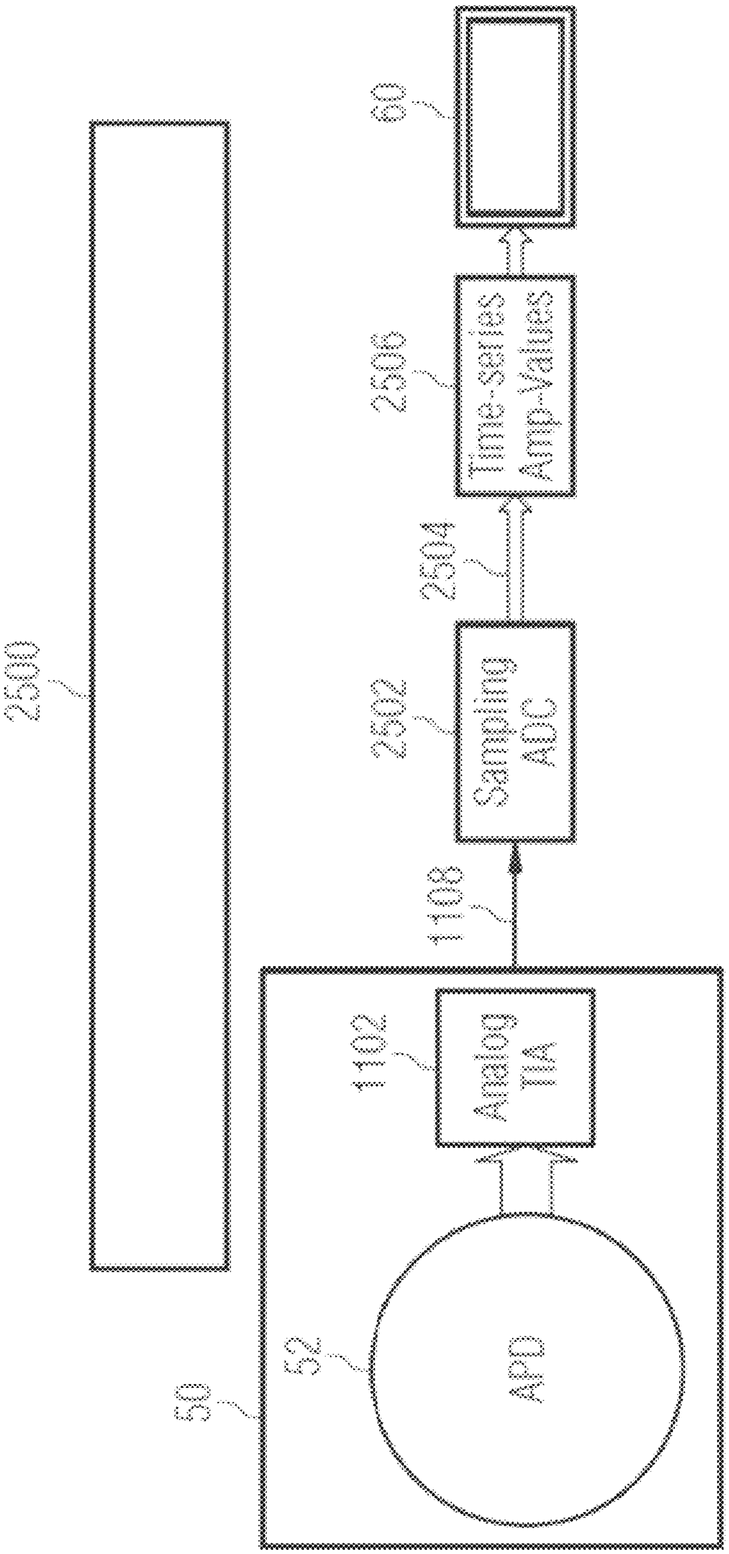
FIG. 25A shows a circuit architecture for continuous waveform capturing.

FIG. 25A shows a circuit architecture 2500 for continuous waveform capturing. In more detail FIG. 25A shows a top-level diagram for a LIDAR application.

The photosensitive pixel element (in other words e.g. the second LIDAR sensing system 50) may accommodate the transimpedance amplifier TIA and the ADC-based and TDC based read-out electronics on a common substrate, while the backend may be realized by a customized FPGA chip 61 for fast digital read-out and primal event preprocessing before transferring the detected events to the host processor 62 for final analysis and display. It is to be noted that there is no hardware-based trigger element provided in the waveform mode. However, in various embodiments, the sensor 52 and the other components may be individual chips or one or more of the electronic components which are described in this disclosure may be monolithically integrated on the same chip or die or substrate. By way of example, the sensor and the TIA 1102 and/or the TAC may be monolithically integrated on a common chip or die or substrate. The TIA signal 1108 may be a continuous analog electrical signal provided by the TIA 1102. The TIA signal 1108 may be supplied to a sampling analog-to-digital converter 2502 coupled downstream to the output of the TIA 1102 and which is continuously sampling of a LIDAR trace. The continuous analog electrical TIA signal 1102 is converted into a digitized TIA signal 2504 including a plurality of succeeding digital TIA voltage values forming a time series of TIA voltage values 2506. The time series of TIA voltage values 2506 is then supplied to the LIDAR Data Processing System 60, e.g. to the FPGA 61 for further signal processing and analysis (e.g. by means of software and/or hardware based signal processing and analysis). Thus, there is a continuous signal load on the signal connections between the TIA 1102 and the LIDAR Data Processing System 60.

Figure 19A:
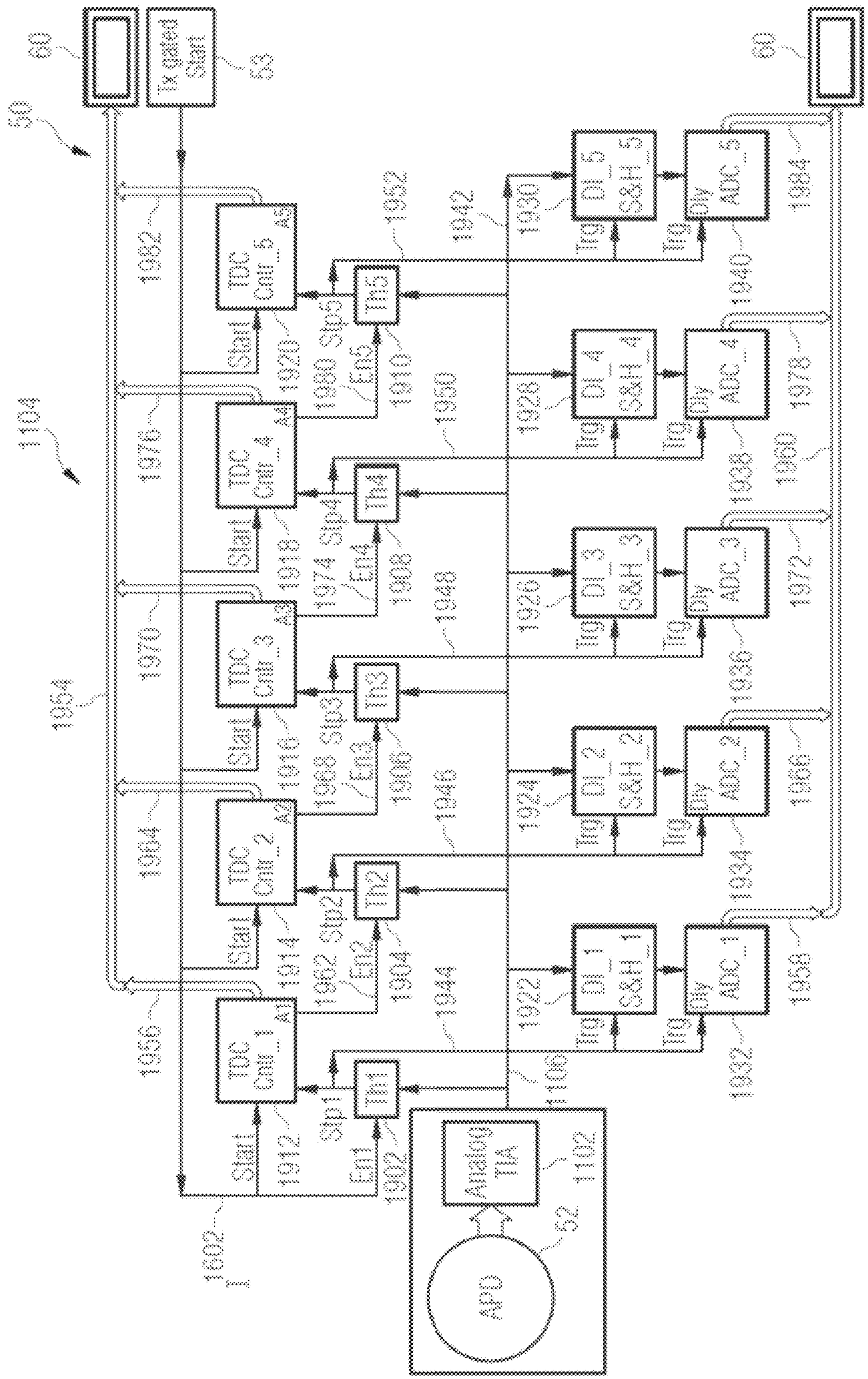
FIGS. 19A to 19C show various implementations of a readout circuit in accordance with various embodiments.
Figure 19B:
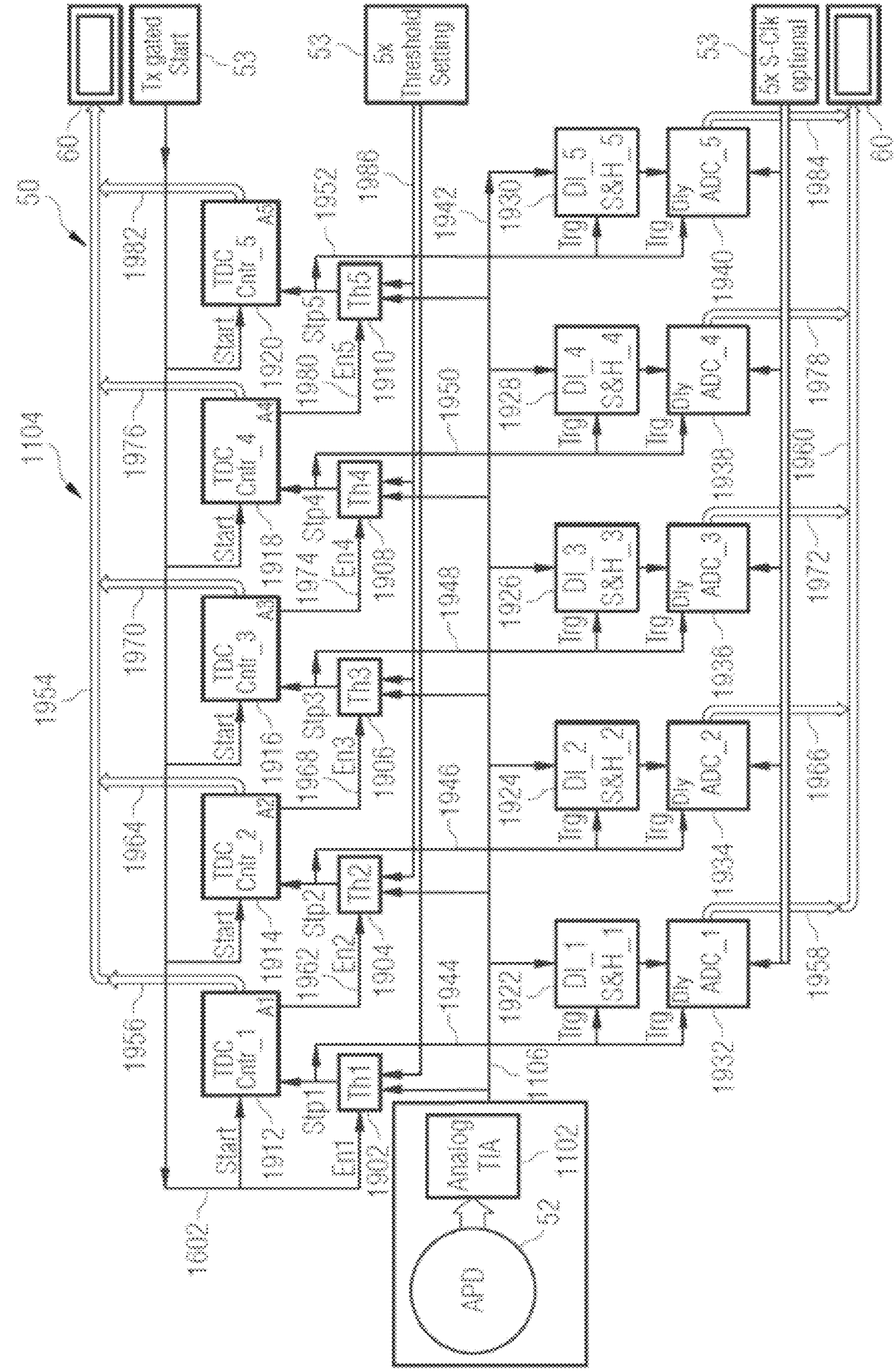
Figure 19C:
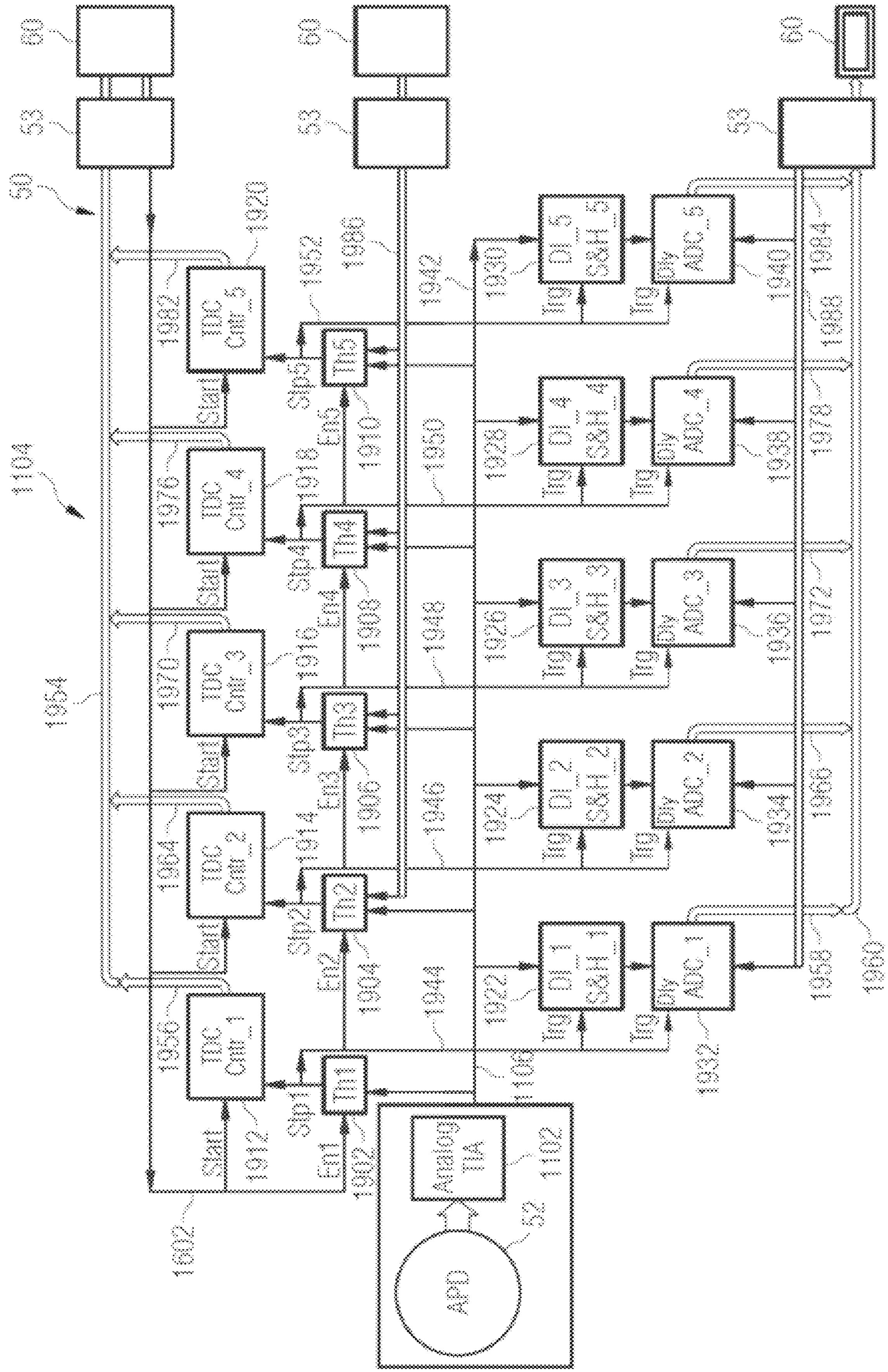

FIGS. 19A to 19C show various implementations of a readout circuit in accordance with various embodiments. FIG. 19A shows an implementation of the second LIDAR sensing system 50 and the read-out circuit 1104 thereof in accordance with various embodiments.

In more detail FIG. 19A shows a top-level diagram for a TDC- and ADC based pixel architecture for a LIDAR application. The photosensitive pixel element (in other words the second LIDAR sensing system 50) may accommodate the trigger electronics and the ADC-based and TDC based read-out electronics on a common substrate, while the backend may be realized by a customized FPGA chip 61 for fast digital read-out and primal event preprocessing before transferring the detected events to the host processor 62 for final analysis and display. However, in various embodiments, the sensor 52 and the other components may be individual chips or one or more of the electronic components which are described in this disclosure may be monolithically integrated on the same chip or die or substrate. By way of example, the sensor and the TIA and/or the TAC may be monolithically integrated on a common chip or die or substrate.

The functional block diagram of the in-pixel read-out electronics as shown in FIG. 19A includes or essentially consists of several cascaded read-out units, which enable the analysis and storage of several consecutive sensor events of one ToF trace, while the interface to the adjacent FPGA 61 includes a plurality of electrical connections, e.g. signal lines, as will be described in more detail below. Illustratively, cascaded read-out units and thus a cascaded sensor event analysis mechanism to detect multi-target echoes may be provided.

The read-out circuitry 1104 may include one or more readout units. Although FIG. 19A shows five read-out units, any number of readout units may be provided in accordance with the respective application.

Each read-out unit may include:

- an event detector (FIG. 19A to FIG. 19C shows a first event detector 1902, a second event detector 1904, a third event detector 1906, a fourth event detector 1908, and a fifth event detector 1910) configured to provide a trigger signal if an analog electrical characteristic representing the electrical energy stored in the energy storage circuit fulfills a predefined trigger criterion; the electrical characteristic may be the amount of energy or the voltage of the electrical voltage signal 1106 provided by the (associated) energy storage circuit 1102; the event detector may include a determiner configured to determine whether the analog electrical characteristic exceeds a predefined threshold as the predefined trigger criterion; the determiner may further be configured to compare the electrical current read from the energy storage circuit 1102 as the analog electrical characteristic with a predefined voltage threshold as the predefined threshold; the event detector may be implemented as a threshold detector configured to determine whether the amount of current or the voltage of the electrical voltage signal 1106 is equal to or larger than a respective predefined threshold value; by way of example, the event detector may be implemented as a comparator circuit; in other words, the determiner may include or may essentially consist of a comparator circuit configured to compare the electrical voltage read from the energy storage circuit with the predefined voltage threshold;
- a timer circuit (FIG. 19A to FIG. 19C shows a first timer circuit 1912, a second timer circuit 1914, a third timer circuit 1916, a fourth timer circuit 1918, and a fifth timer circuit 1920) configured to provide a digital time information; the timer circuit may be implemented as a time-to-digital converter (TDC) circuit as will be described in more detail below; the TDC may include one or more internal digital counters as well;
- optionally a sample and hold circuit (FIG. 19A to FIG. 19C shows a first sample and hold circuit 1922, a second sample and hold circuit 1924, a third sample and hold circuit 1926, a fourth sample and hold circuit 1928, and a fifth sample and hold circuit 1930) configured to store the electrical energy read from the energy storage circuit and to provide the stored electrical energy to an analog-to-digital converter; and
- an analog-to-digital converter (FIG. 19A to FIG. 19C shows a first analog-to-digital converter 1932, a second analog-to-digital converter 1934, a third analog-to-digital converter 1936, a fourth analog-to-digital converter 1938, and a fifth analog-to-digital converter 1940) configured to convert the analog electrical characteristic (e.g. the amount of the electrical current or the voltage) into a digital electrical characteristic value (e.g. a current value or a voltage value).

It should be noted that in all embodiments, one or more differentiators (one D circuit to detect the local minima or maxima of the TIA signal; two D circuits to detect the inflection point to determine the "center point" between respective adjacent minima and maxima) may be provided upstream an event detector. This may allow a simple reconstruction of the entire temporal progression of the TIA signal.

Figure 20A:
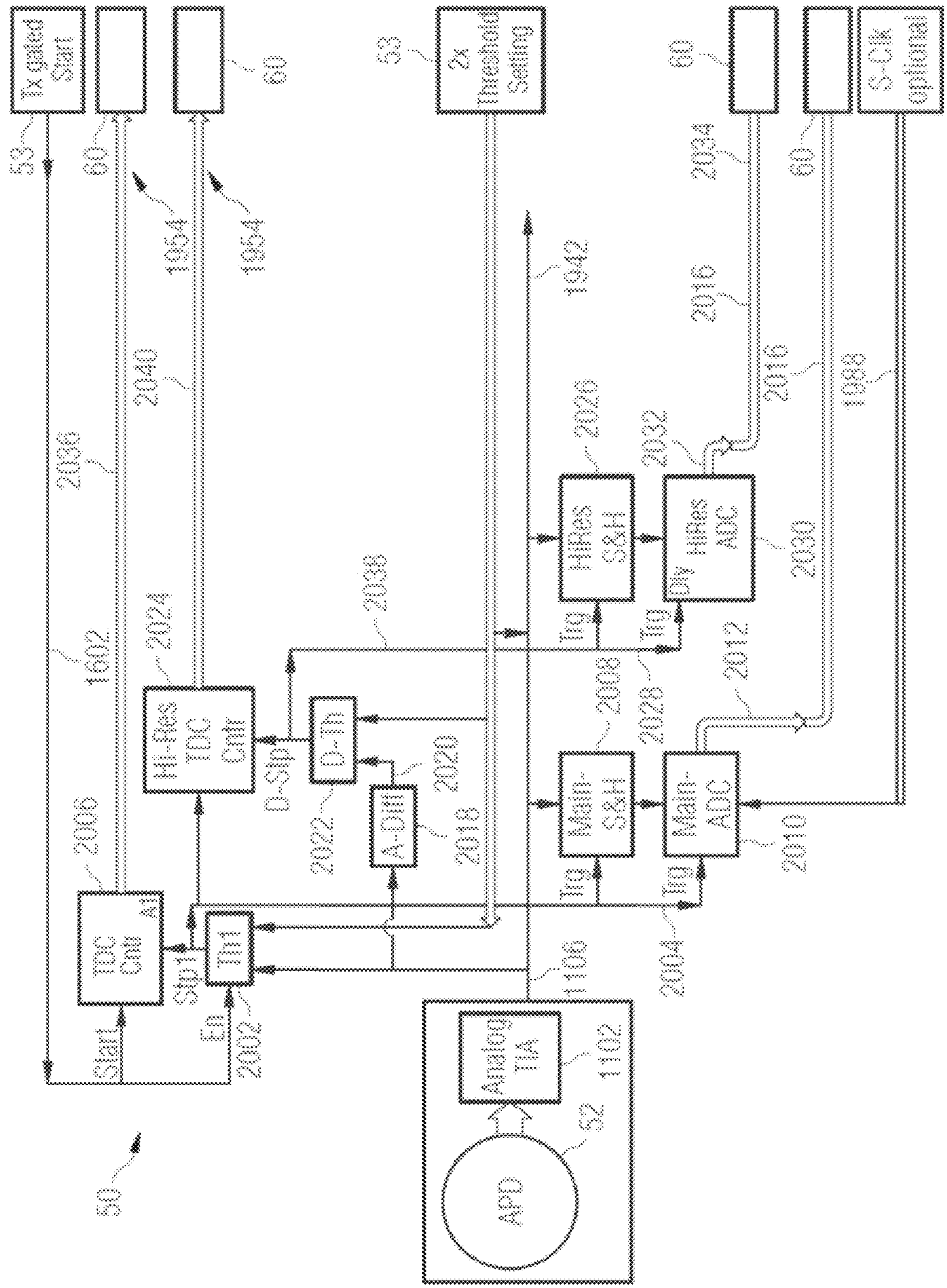
FIGS. 20A and 20B show various implementations of a readout circuit in accordance with various embodiments.
Figure 20B:
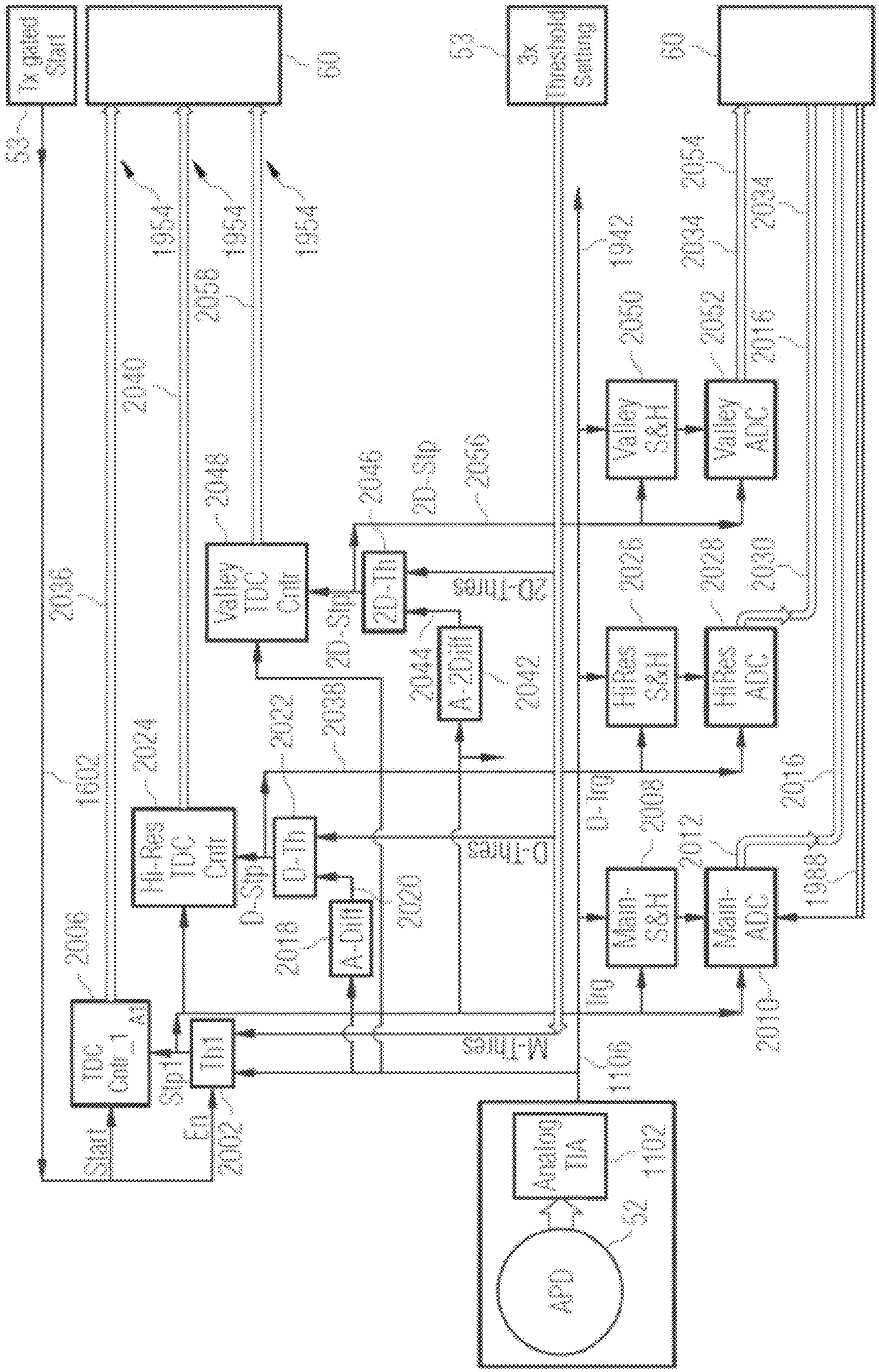

Thus, three configurations may be provided in various embodiments as shown in FIG. 19A to FIG. 19C as well as in FIG. 20A and FIG. 20B:

- no differentiator (D circuit) upstream a respective event detector (FIG. 19A to FIG. 19C);
- exactly one differentiator (D circuit) upstream a respective event detector (FIG. 20A); and
- exactly two differentiators (D circuits) upstream a respective event detector (FIG. 20B).

In a concrete exemplary implementation, two configuration bits may be provided to loop in no, one or two D circuits.

Furthermore, one or more signal lines 1942 are provided, e.g. implemented as a signal bus. The one or more signal lines 1942 are coupled to the output of the energy storage circuits 1102, e.g. to the output of the TIA 1600 to receive the analog TIA signal 1606 or any other TIA amplifier. Furthermore, the one or more signal lines 1942 may be directly electrically conductively coupled to an input of the event detector 1902, 1904, 1906, 1908, 1910 and to an input of the sample and hold circuits 1922, 1924, 1926, 1928, 1930. It is to be noted that in this particular case, a free-running TIA amplifier may be provided which does not require any external commands. A TDC element may not be required in this context, since the TDC detection will be carried out later in the downstream coupled circuits or components.

Each event detector 1902, 1904, 1906, 1908, 1910 is configured to deactivate the associated timer circuit 1912, 1914, 1916, 1918, 1920 and to activate the associated analog-to-digital converter 1932, 1934, 1936, 1938, 1940 (and optionally to also activate the associated sample and hold circuit 1922, 1924, 1926, 1928, 1930 depending on the trigger signal). In more detail, each event detector 1902, 1904, 1906, 1908, 1910 may be configured to deactivate the associated timer circuit 1912, 1914, 1916, 1918, 1920 in case the trigger criterion is fulfilled. Furthermore, the event detector 1902, 1904, 1906, 1908, 1910 may be configured to activate the associated analog-to-digital converter 1932, 1934, 1936, 1938, 1940 (and optionally to also activate the associated sample and hold circuit 1922, 1924, 1926, 1928, 1930) in case the trigger criterion is fulfilled. Illustratively, the other electronic components (the timer circuit 1912, 1914, 1916, 1918, 1920, the analog-to-digital converter 1932, 1934, 1936, 1938, 1940, and optionally the sample and hold circuit 1922, 1924, 1926, 1928, 1930) may be deactivated or activated by the event detector 1902, 1904, 1906, 1908, 1910 based on whether the trigger criterion is fulfilled or not fulfilled.

In other words, each event detector 1902, 1904, 1906, 1908, 1910 may be configured to deactivate (stop) the associated timer circuit 1912, 1914, 1916, 1918, 1920 in case the trigger criterion is fulfilled. The timer circuit 1912, 1914, 1916, 1918, 1920 (e.g. all timer circuits 1912, 1914, 1916, 1918, 1920) may be activated and thus active (running) during the read-out process (when the read-out process is in an active state). The sensor controller 53 may be configured to control the read-out process e.g. by providing a read-out control signal, e.g. the Start_N signal 1602, to the event detector(s) 1902, 1904, 1906, 1908, 1910 and to the timer circuit(s) 1912, 1914, 1916, 1918, 1920. Thus, the sensor controller 53 may activate or deactivate the event detector(s) 1902, 1904, 1906, 1908, 1910 and the timer circuit 1912, 1914, 1916, 1918, 1920 using one common signal at the same time. In other words, the controller 53 may be configured to provide a signal to switch the read-out process into the active state or the inactive state, and to activate or deactivate the event detector 1902, 1904, 1906, 1908, 1910 (and optionally also the timer circuit 1912, 1914, 1916, 1918, 1920) accordingly. It is to be noted that the event detector 1902, 1904, 1906, 1908, 1910 and the timer circuit 1912, 1914, 1916, 1918, 1920 may be activated or deactivated independent from each other using two different control signals.

By way of example, assuming that the sensor controller 53 has started the read-out process (and thus has activated (started) the first event detector 1902) and the first event detector 1902 detects that the SPAD signal 1106 provided on one signal line 1942 of the one or more signal lines 1942 fulfils the trigger criterion (in other words, a first sensor event (e.g. a first SPAD event) is detected), then the first event detector 1902 (in response to the determination of the fulfillment of the trigger criterion upon meeting the criterion) generates a first trigger signal 1944 to stop the first timer circuit (e.g. the first TDC) 1912. The counter value stored in the counter of the first TDC 1912 when stopped represents a digital time code indicating the time of occurrence of the SPAD detection event (and in the LIDAR application a digitized ToF representing the distance of the object 100). By way of example, the stopped first timer circuit 1912 outputs "its" digitized and thus first digital ToF value 1956 to one or more output lines 1954 to the LIDAR Data Processing System 60, e.g. to a digital processor, e.g. to the FPGA 61 for digital signal processing.

Furthermore, in various embodiments, the first trigger signal 1944 generated in case that the SPAD signal (photo signal)1106 provided on one signal line 1942 of the one or more signal lines 1942 fulfils the trigger criterion, may activate the (up to that time) deactivated first analog-to-digital converter 1932 (and optionally to also activate the (up to that time) deactivated first sample and hold circuit 1922). Thus, the now active first sample and hold circuit 1922 stores the respective voltage signal 1106 (in general the respective energy signal) being present on the one or more signal lines 1942 and provides the same as an analog voltage signal to the (also now active) first analog-to-digital converter 1932. The first analog-to-digital converter 1932 converts the analog voltage signal into a first digital ToF value 1956 and outputs the digital voltage value (intensity value) 1958 to one or more further output lines 1960. The one or more output lines 1954 and the one or more further output lines 1960 may form at least one common digital interface being connected to the LIDAR Data Processing System 60, e.g. to the FPGA 61.

Moreover, the first timer circuit 1912 may generate a first timer circuit output signal 1962 and supplies the same to an enabling input of the second event detector 1904. In various embodiments, the first timer circuit output signal 1962 in this case may activate the (up to the receipt of this signal 1962 deactivated) second event detector 1904. Now, the first event detector 1902 is inactive and the second event detector 1904 is active and observes the electrical characteristic of a signal present on the one or more signal lines 1942. It is to be noted that at this time, the second analog-to-digital converter 1934 as well as the optional second sample and hold circuit 1924 are still inactive, as well as all other further downstream connected analog-to-digital converters 1936, 1938, 1940 and other sample and hold circuits 1926, 1928, 1930. Thus, no "unnecessary" data is generated by these components and the amount of digital data transmitted to the LIDAR Data Processing System 60 may be substantially reduced.

Furthermore, assuming that the now active second event detector 1904 detects that the SPAD signal 1106 provided on one signal line 1942 of the one or more signal lines 1942 fulfils the trigger criterion again (in other words, a second sensor event (e.g. a second SPAD event) (e.g. a second LIDAR event) is detected), then the second event detector 1904 (in response to the determination of the fulfillment of the trigger criterion) generates a second trigger signal 1946 to stop the second timer circuit (e.g. the second TDC) 1914. The counter value stored in the counter of the second TDC 1914 when stopped represents a digital time code indicating the time of occurrence of the second SPAD (detection) event (and in the LIDAR application a digitized ToF representing the distance of the object 100). By way of example, the stopped second timer circuit 1914 outputs "its" digitized and thus second digital ToF value 1964 to the one or more output lines 1954 to the LIDAR Data Processing System 60, e.g. to a digital processor, e.g. to the FPGA 61 for digital signal processing.

Furthermore, in various embodiments, the second trigger signal 1946 generated in case the SPAD signal 1106 provided on one signal line 1942 of the one or more signal lines 1942 fulfils the trigger criterion, may activate the (up to that time) deactivated second analog-to-digital converter 1934 (and optionally to also activate the (up to that time) deactivated second sample and hold circuit 1924). Thus, the now active second sample and hold circuit 1924 stores the respective voltage signal (in general the respective energy signal) being present on the one or more signal lines 1942 and provides the same as an analog voltage signal (intensity signal) to the (also now active) second analog-to-digital converter 1934. The second analog-to-digital converter 1934 converts the analog voltage signal into a second digital voltage value 1966 and outputs the second digital voltage value 1966 to one or more further output lines 1960.

Moreover, the second timer circuit 1914 generates a second timer circuit output signal 1968 and supplies the same to an enabling input of the third event detector 1906. In various embodiments, the second timer circuit output signal 1968 in this case may activate the (up to the receipt of this signal 1968 deactivated) third event detector 1906. Now, the first and second event detectors 1902, 1904 are inactive and the third event detector 1906 is active and observes the electrical characteristic of a signal present on the one or more signal lines 1942. It is to be noted that at this time, the third analog-to-digital converter 1936 as well as the optional third sample and hold circuit 1926 are still inactive, as well as all other further downstream connected analog-to-digital converters 1938, 1940 and other sample and hold circuits 1928, 1930. Thus, no "unnecessary" data is generated by these components and the amount of digital data transmitted to the LIDAR Data Processing System 60 may be substantially reduced. Thus, a second sensor event (e.g. a second single photon detection) can be detected by this read-out circuitry 1104.

Furthermore, assuming that the now active third event detector 1906 detects that the SPAD signal 1106 provided on one signal line 1942 of the one or more signal lines 1942 fulfils the trigger criterion again (in other words, a third sensor event (e.g. a third SPAD event) is detected), then the third event detector 1906 (in response to the determination of the fulfillment of the trigger criterion) generates the third trigger signal 1948 to stop the third timer circuit (e.g. the third TDC) 1916. The counter value stored in the counter of the third TDC 1916 when stopped represents a digital time code indicating the time of occurrence of the third SPAD (detection) event (and in the LIDAR application a digitized ToF representing the distance of the object 100). By way of example, the stopped third timer circuit 1916 outputs "its" digitized and thus third digital ToF value 1970 to the one or more output lines 1954 to the LIDAR Data Processing System 60, e.g. to a digital processor, e.g. to the FPGA 61 for digital signal processing.

Furthermore, in various embodiments, the third trigger signal 1948 generated in case the SPAD signal 1106 provided on one signal line 1942 of the one or more signal lines 1942 fulfils the trigger criterion, may activate the (up to that time) deactivated third analog-to-digital converter 1936 (and optionally to also activate the (up to that time) deactivated third sample and hold circuit 1926). Thus, the now active third sample and hold circuit 1926 stores the respective voltage signal being present on the one or more signal lines 1942 and provides the same as an analog voltage signal to the (also now active) third analog-to-digital converter 1936. The third analog-to-digital converter 1936 converts the analog voltage signal into a third digital voltage value 1972 and outputs the third digital voltage value 1972 to one or more further output lines 1960.

Moreover, the third timer circuit 1916 generates a third timer circuit output signal 1974 and supplies the same to an enabling input of the fourth event detector 1908. In various embodiments, the third timer circuit output signal 1974 in this case may activate the (up to the receipt of this signal 1974 deactivated) fourth event detector 1908. Now, the first, second and third event detectors 1902, 1904, 1906 are inactive and the fourth event detector 1908 is active and observes the electrical characteristic of a signal present on the one or more signal lines 1942. It is to be noted that at this time, the fourth analog-to-digital converter 1938 as well as the optional fourth sample and hold circuit 1928 are still inactive, as well as all other further downstream connected analog-to-digital converters 1940 and other sample and hold circuits 1930. Thus, no "unnecessary" data is generated by these components and the amount of digital data transmitted to the LIDAR Data Processing System 60 may be substantially reduced. Thus, an individual third sensor event (e.g. a third single photon detection) can be detected by this read-out circuitry 1104.

Furthermore, assuming that the now active fourth event detector 1908 detects that the SPAD signal 1106 provided on one signal line 1942 of the one or more signal lines 1942 fulfils the trigger criterion again (in other words, a fourth sensor event (e.g. a fourth SPAD event) is detected), then the fourth event detector 1908 (in response to the determination of the fulfillment of the trigger criterion) generates the fourth trigger signal 1950 to stop the fourth timer circuit (e.g. the fourth TDC) 1918. The counter value stored in the counter of the fourth TDC 1918 when stopped represents a digital time code indicating the time of occurrence of the fourth SPAD (detection) event (and in the LIDAR application a digitized ToF representing the distance of the object 100). By way of example, the stopped fourth timer circuit 1918 outputs "its" digitized and thus fourth digital ToF value 1976 to the one or more output lines 1954 to the LIDAR Data Processing System 60, e.g. to a digital processor, e.g. to the FPGA 61 for digital signal processing.

Furthermore, in various embodiments, the fourth trigger signal 1950 generated in case the SPAD signal 1106 provided on one signal line 1942 of the one or more signal lines 1942 fulfils the trigger criterion, may activate the (up to that time) deactivated fourth analog-to-digital converter 1938 (and optionally to also activate the (up to that time) deactivated fourth sample and hold circuit 1928). Thus, the now active fourth sample and hold circuit 1928 stores the respective voltage signal being present on the one or more signal lines 1942 and provides the same as an analog voltage signal to the (also now active) fourth analog-to-digital converter 1938. The fourth analog-to-digital converter 1938 converts the analog voltage signal into a fourth digital voltage value 1978 and outputs the fourth digital voltage value 1978 to one or more further output lines 1960.

Moreover, the fourth timer circuit 1918 generates a fourth timer circuit output signal 1980 and supplies the same to an enabling input of the fifth event detector 1910. In various embodiments, the fourth timer circuit output signal 1980 in this case may activate the (up to the receipt of this signal 1980 deactivated) fifth event detector 1910.

Now, the first, second, third and fourth event detectors 1902, 1904, 1906, 1908 are inactive and the fifth event detector 1910 is active and observes the electrical characteristic of a signal present on the one or more signal lines 1942. It is to be noted that at this time, the fifth analog-to-digital converter 1940 as well as the optional fifth sample and hold circuit 1930 are still inactive, as well as all optional other further downstream connected analog-to-digital converters (not shown) and optional other sample and hold circuits (not shown). Thus, no "unnecessary" data is generated by these components and the amount of digital data transmitted to the LIDAR Data Processing System 60 may be substantially reduced. Thus, an individual third sensor event (e.g. a second single phonton detection) can be detected by this read-out circuitry 1104.

Furthermore, assuming that the now active fifth event detector 1910 detects that the SPAD signal 1106 provided on one signal line 1942 of the one or more signal lines 1942 fulfils the trigger criterion again (in other words, a fifth sensor event (e.g. a fifth SPAD event) is detected), then the fifth event detector 1910 (in response to the determination of the fulfillment of the trigger criterion) generates the fifth trigger signal 1952 to stop the fifth timer circuit (e.g. the fifth TDC) 1920. The counter value stored in the counter of the fifth TDC 1920 when stopped represents a digital time code indicating the time of occurrence of the fifth SPAD (detection) event (and in the LIDAR application a digitized ToF representing the distance of the object 100). By way of example, the stopped fifth timer circuit 1920 outputs "its" digitized ToF value 1982 to the one or more output lines 1954 to the LIDAR Data Processing System 60, e.g. to a digital processor, e.g. to the FPGA 61 for digital signal processing.

Furthermore, in various embodiments, the fifth trigger signal 1952 generated in case the SPAD signal 1106 provided on one signal line 1942 of the one or more signal lines 1942 fulfils the trigger criterion, may activate the (up to that time) deactivated fifth analog-to-digital converter 1940 (and optionally to also activate the (up to that time) deactivated fifth sample and hold circuit 1930). Thus, the now active fifth sample and hold circuit 1930 stores the respective voltage signal being present on the one or more signal lines 1942 and provides the same as an analog voltage signal to the (also now active) fifth analog-to-digital converter 1940. The fifth analog-to-digital converter 1940 converts the analog voltage signal into a fifth digital voltage value 1984 and outputs the fifth digital voltage value 1984 to one or more further output lines 1960.

It is to be noted that the read-out circuitry 1102 may include more or less than these five read-out units as described above and thus may detect more or less than five individual photon detection events at the sensor 50.

The pixel architecture for digital based event timing both for TDC applications and ADC applications is shown in FIG. 19. Illustratively, the trigger channel generates the control signals for the TDC circuit as well as for triggering the ADC circuits. Several read-out units are cascaded which are sequentially enabled to eliminated detrimental dead time in case of consecutive sensor event appearances in short succession with low temporal spacing. Depending on the internal reference clock for the TDCs and the ADCs, the architecture allows for gating precisions in the ns range.

FIG. 19B shows an implementation of the second LIDAR sensing system 50 and the read-out circuit 1104 thereof in accordance with various embodiments.

The implementation as shown in FIG. 19B is very similar to the implementation as shown in FIG. 19A. Therefore, only the differences will be described in more detail below. With respect to the similar features, reference is made to the explanations with respect to FIG. 19A above.

The first, second, third, fourth, and fifth event detectors 1902, 1904, 1906, 1908, 1910 may be coupled to the sensor controller 53 via a communication connection 1986 such as one or more bus lines. The sensor controller 53 may be configured to set the threshold values th1, th2, th3, th4, th5 within the first, second, third, fourth, and fifth event detectors 1902, 1904, 1906, 1908, 1910 which may be equal or different values. It is to be noted that the threshold values th1, th2, th3, th4, th5 may also be provided by another processor than the sensor controller, e.g. by or via the LIDAR Data Processing System 60.

As described above, the second LIDAR sensing system 50 includes an in-pixel readout electronic and may include or essentially consist of several cascaded readout units, which enables the analysis and storage of several consecutive events of one ToF-trace, while the interface to the adjacent FPGA 62.

Illustratively, the trigger channel (i.e. e.g. the event detectors 1902, 1904, 1906, 1908, 1910) generates control signals for the TDC circuit as well as for triggering the ADCs. The trigger settings may be controlled by the digital backend circuits (e.g. the host processor 62). The S-Clk (system clock) provided e.g. by the host processor 62 may be provided for an optional enabling of a continuous waveform-sampling mode. Several readout units may be cascaded which are sequentially enabled to eliminated detrimental dead time in case of consecutive event appearances in short succession with low temporal distance. Depending on the internal reference clock for the TDCs and the ADCs, various embodiments may allow for gating precisions in the ns range.

FIG. 19C shows an implementation of the second LIDAR sensing system 50 and the read-out circuit 1104 thereof in accordance with various embodiments.

The implementation as shown in FIG. 19C is very similar to the implementation as shown in FIG. 19B. Therefore, only the differences will be described in more detail below. With respect to the similar features, reference is made to the explanations with respect to FIG. 19B above.

A difference of the implementation as shown in FIG. 19C with respect to FIG. 19B is that in the implementation as shown in FIG. 19C the additional timer circuit output signals 1962, 1968, 1974, 1980 and the associates terminals of the timer circuits 1912, 1914, 1916, 19180 1920 may be omitted. Illustrately, a direct and successive threshold activation of the event detectors 1902, 1904, 1906, 1908, 1910 is provided. In more detail, in various embodiments, the trigger signals 1944, 1946, 1948, 1950 are directly supplied to the downstream coupled "next" event detectors 1904, 1906, 1908, 1910 and are used to activate the same. Furthermore, optionally, the sensor controller 53 (or another processor) may be configured to generate a system clock signal and provide the same via another communication connection 1988 to the analog-to-digital converters 1932, 1934, 1936, 1938, 1940. The system clock signal may be the same for all analog-to-digital converters 1932, 1934, 1936, 1938, 1940 or they may be different for at least some of them.

In various embodiments, the trigger channel may generate control signals for the TDC as well as for triggering the ADCs. The trigger channels may be directly enabled in a successive order. The S-Clk (system clock), e.g. provided from the controller (e.g. from the sensor controller 53) may be provided for an optional enabling of a continuous waveform-sampling mode. The trigger settings may be controlled by the Digital Backend (e.g. the host processor 62). Several readout units may be cascaded which are sequentially enabled to eliminated detrimental dead time in case of consecutive event appearances in short succession with low temporal distance. Depending on the internal reference clock for the TDCs and the ADCs, various embodiments allow for gating precisions in the ns range.

FIG. 20A shows a pixel architecture for advanced event timing both for TDC-application and ADC control. The enhanced sampling to scheme is based on the application of differentiated ToF signals (also referred to as time derivatives of the ToF signal), which enables increased temporal resolution for analyzing overlapping double peaks in the ToF trace.

FIG. 20A shows another implementation of the second LIDAR sensing system and the read-out circuit 1104 thereof in accordance is with various embodiments.

In more detail FIG. 20A shows a top-level diagram for a TDC- and ADC based pixel architecture for a LIDAR application. The photosensitive pixel element (in other words the second LIDAR sensing system 50) may accommodate the trigger electronics and the ADC-based and TDC based read-out electronics on a common substrate, while the backend is realized by a customized FPGA chip 61 for fast digital read-out and primal event preprocessing before transferring the detected events to the host processor (e.g. host computer) 62 for final analysis and display. However, in various embodiments, the sensor 52 and the other components may be individual chips or one or more of the electronic components which are described in this disclosure may be monolithically integrated on the same chip or die or substrate. By way of example, the sensor 52 and the TIA and or the TAC may be monolithically integrated on a common chip or die or substrate.

The functional block diagram of the in-pixel read-out electronics as shown in FIG. 20 includes a main read-out unit and a high resolution unit, which may allow for an increased resolution. The read-out circuitry 1104 may include one or more main and/or high resolution read-out units. Although FIG. 20A shows one main and one high resolution read-out units, any number of read-out units may be provided in accordance with the respective application.

The main read-out unit may include:

a main event detector 2002 configured to provide a trigger signal 2004 if an analog electrical characteristic representing the electrical energy stored in the energy storage circuit fulfills a predefined trigger criterion; the electrical characteristic may be the amount of current or the voltage of the electrical voltage signal 1106 provided by the (associated) energy storage circuit 1102;

the main event detector 2002 may include a determiner configured to determine whether the analog electrical characteristic exceeds a predefined threshold as the predefined trigger criterion; the determiner may further be configured to compare the electrical voltage read from the energy storage circuit as the analog electrical characteristic with a predefined voltage threshold as the predefined threshold; the main event detector 2002 may be implemented as a threshold detector configured to determine whether the amount of current or the voltage of the electrical voltage signal 1106 is equal to or larger than a respective predefined threshold value; by way of example, the main event detector 2002 may be implemented as a comparator circuit; in other words, the determiner may include or essentially consist of a comparator circuit configured to compare the electrical voltage read from the energy storage circuit with the predefined voltage threshold.

a main timer circuit 2006 configured to provide a digital time information; the main timer circuit 2006 may be implemented as a time-to-digital converter (TDC) circuit as will be described in more detail below; the main TDC may include one or more digital counters;

optionally a main sample and hold circuit 2008 configured to store the electrical voltage read from the energy storage circuit 1102 and to provide the stored electrical voltage to a main analog-to-digital converter 2010; and the main analog-to-digital converter 2010 configured to convert the analog electrical characteristic (e.g. the amount of the electrical current or the voltage) into a digital electrical characteristic value 2012 (e.g. a digital current value or a digital voltage value).

The high resolution read-out unit may include:

a differentiator 2018 configured to differentiate the electrical voltage signal 1106 to generate a differentiated electrical voltage signal 2020; the differentiator 2018 may include a capacitor or a D element and/or an resistor-capacitor-circuit configures as a high-pass filter or a DT1 element to generate and/or to approximate a first-order time-derivative of its input signal at its output;

a high resolution event detector 2022 configured to provide a high resolution trigger signal 2022 if an analog electrical characteristic representing the electrical energy stored in the energy storage circuit fulfills a predefined trigger criterion; the electrical characteristic may be the amount of current or the voltage of the electrical energy signal (e.g. electrical voltage signal) 1106 provided by the (associated) energy storage circuit 1102; the high resolution event detector 2022 may include a determiner configured to determine whether the analog electrical characteristic exceeds a predefined threshold as the predefined trigger criterion; the determiner may further be configured to compare the electrical voltage read from the energy storage circuit as the analog electrical characteristic with a predefined current threshold as the predefined threshold; the high resolution event detector 2022 may be implemented as a threshold event detector configured to determine whether the amount of current or the voltage of the electrical voltage signal 1106 is equal to or larger than a respective predefined threshold value; by way of example, the high resolution event detector 2022 may be implemented as a comparator circuit; in other words, the determiner may include or essentially consist of a comparator circuit configured to compare the electrical voltage read from the energy storage circuit with the predefined voltage threshold;

a high resolution timer circuit 2024 configured to provide a digital time information; the high resolution timer circuit 2024 may be implemented as a time-to-digital converter (TDC) circuit as will be described in more detail below; the high resolution TDC may include one or more digital counters;

optionally, a high resolution sample and hold circuit 2026 configured to store the electrical energy (e.g. electrical voltage) read from the energy storage circuit 1102 and to provide the stored electrical energy (e.g. electrical voltage) to a high resolution analog-to-digital converter 2028; and the high resolution analog-to-digital converter 2028 configured to convert the high resolution analog electrical characteristic (e.g. the amount of the electrical current or the voltage) into a high resolution digital electrical characteristic value 2030 (e.g. a digital current value or a digital voltage value).

Furthermore, one or more signal lines 1942 are provided, e.g. implemented as a signal bus. The one or more signal lines 1942 are coupled to the output of the energy storage circuits 1102, e.g. to the output of the TIA 1600 to receive the analog TIA signal analog TIA 1606, and/or to the output of the TAC 1702. Furthermore, the one or more signal lines 1942 may be directly electrically conductively coupled to an input of the main event detector 2002, to an input of the main sample and hold circuit 2008, to an input of the differentiator 2018 and to an input of the high resolution sample and hold circuit 2026.

The main event detector 2002 is configured to deactivate the main timer circuit 2006 and to activate the main analog-to-digital converter 2010 (and optionally to also activate the main sample and hold circuit 2008 depending on the main trigger signal 2004). In more detail, the main event detector 2002 may be configured to deactivate the main timer circuit 2006 in case the trigger criterion is fulfilled. Furthermore, the main event detector 2002 may be configured to activate the main analog-to-digital converter 2010 (and optionally to also activate the main sample and hold circuit 2008) in case the trigger criterion is fulfilled. Illustratively, the high resolution electronic components (the high resolution timer circuit 2024, the high resolution analog-to-digital converter 2028, and optionally the high resolution sample and hold circuit 2026) may be activated by the high resolution event detector 2022 based on whether a high resolution trigger criterion is fulfilled or not fulfilled.

By way of example and referring to FIG. 20A again, the first event detector 2002 may be configured to activate (in other words starts) the high resolution timer circuit 2024, which may then be stopped upon the arrival of the second peak via the differentiator 2018 and the high resolution event detector 2022. The time distance (time lapse) from the main peak to the succeeding secondary peak will then be stored as the high resolution time value in the high resolution timer circuit 2024.

In other words, the high resolution event detector 2022 may be configured to deactivate (stop) the high resolution timer circuit 2024 in case that the high resolution trigger criterion is fulfilled (e.g. the differentiated electrical characteristic is equal to or exceeds a high resolution threshold). The high resolution timer circuit 2024 may be activated and thus active (running) during the read-out process (when the read-out process is in an active state). The sensor controller 53 may be configured to control the read-out process e.g. by providing a read-out control signal, e.g. the Start_N signal

1602 (in general any kind of start signal) to the main event detector 2002 and to the main timer circuit 2006. Thus, the sensor controller 53 may activate or deactivate (in the sense of not activate) the main event detector 2002 and the main timer circuit 2006 using one common signal at the same time. In other words, the controller 53 may be configured to provide a signal to switch the read-out process into the active state or the inactive state, and to activate or deactivate the main event detector 2002 (and optionally also the main timer circuit 2006) accordingly. It is to be noted that the main event detector 2002 and the main timer circuit 2006 may be activated or deactivated independent from each other using two different control signals. It is to be noted that in case a respective timer circuit has not been activated (e.g. using the Start signal), it remains inactive. In other words, in general, no explicit deactivation may be performed, but the non-activated timer circuits may just remain inactive.

By way of example, assuming that the sensor controller 53 has started the read-out process (and thus has activated (started) the main event detector 2002) and the main event detector 2002 detects that the SPAD signal 1106 provided on one signal line 1942 of the one or more signal lines 1942 fulfils the trigger criterion (in other words, a first sensor event (e.g. a first SPAD event) is detected), then the main event detector 2002 (in response to the determination of the fulfillment of the trigger criterion) generates a main trigger signal 2004 to stop the main timer circuit (e.g. the main TDC) 2006. The counter value stored in the counter of the main TDC 2006 when stopped represents a digital time code indicating the time of occurrence of the SPAD detection event (and in the LIDAR application a digitized ToF representing the distance of the object 100). By way of example, the stopped main timer circuit 2006 outputs "its" digitized ToF value 2036 to one or more output lines 1954 to the LIDAR Data Processing System 60, e.g. to a digital processor, e.g. to the FPGA 61 for digital signal processing.

Furthermore, in various embodiments, the main trigger signal 2004 generated in case the SPAD signal 1106 provided on one signal line 1942 of the one or more signal lines 1942 fulfils the trigger criterion, may activate the (up to that time) deactivated main analog-to-digital converter 2010 (and optionally to also activate the (up to that time) deactivated main sample and hold circuit 2008). Thus, the now active main sample and hold circuit 2008 stores the respective voltage signal being present on the one or more signal lines 1942 and provides the same as an analog voltage signal to the (also now active) main analog-to-digital converter 2010. The main analog-to-digital converter 2010 converts the analog voltage signal into a digital voltage value 2012 and outputs the digital voltage value 2012 to the one or more further output lines 2016. The one or more output lines 2036 and the one or more further output lines 2016 may form at least one digital interface being connected to the LIDAR Data Processing System 60, e.g. to the FPGA 61.

Moreover, the main trigger signal 2004 activates the high resolution timer circuit 2024 which starts counting. Furthermore, the SPAD signal (in general a photo signal) 1106 provided on one signal line 1942 of the one or more signal lines 1942 is also applied to the differentiator 2018, which differentiates the SPAD signal 1106 over time. The differentiated SPAD signal 2020 is supplied to an input of the high resolution event detector 2022. If the high resolution event detector 2022 detects that the differentiated SPAD signal 2020 provided by the differentiator 2018 fulfils a high resolution trigger criterion, then the high resolution event detector 2022 (in response to the determination of the fulfillment of the high resolution trigger criterion) generates a high resolution trigger signal 2038 to stop the high resolution timer circuit (e.g. the high resolution TDC) 2024. Illustratively, the differentiated SPAD signal 2020 represents the gradient of the SPAD signal 1106 and thus, the high resolution event detector 2022 observes the gradient of the SPAD signal 1106 and provides the high resolution trigger signal 2038 e.g. if the gradient of the SPAD signal 1106 is equal to or exceeds a gradient threshold. In other words, the high resolution components serve to provide additional information about the SPAD signal 1106 to provide a higher resolution thereof if needed, e.g. in case the SPAD signal 1106 changes very fast. The counter value stored in the counter of the high resolution TDC 2024 when stopped represents a digital time code indicating the time of occurrence of the differentiated SPAD signal detection event. By way of example, the stopped high resolution timer circuit 2024 outputs "its" digitized and thus digital differentiated ToF value 2040 to one or more output lines 1954 to the LIDAR Data Processing System 60, e.g. to a digital processor, e.g. to the FPGA 61 for digital signal processing. The digital differentiated ToF value 2040 carries the relative time delay from the main trigger signal 2004 to the occurrence of the high resolution trigger signal 2038 which represents the time delay of the occurrence of the foremost main event detector 2002 and the consecutive non-leading high resolution event at 2022.

Furthermore, in various embodiments, the high resolution trigger signal 2038 generated in case the differentiated SPAD signal 2020 provided by the differentiator 2018 fulfils the high resolution trigger criterion, is may activate the (up to that time) deactivated high resolution analog-to-digital converter 2028 (and optionally to also activate the (up to that time) deactivated high resolution sample and hold circuit 2026). Thus, the now active high resolution sample and hold circuit 2026 stores the respective voltage signal (intensity signal) being present on the one or more signal lines 1942 and provides the same as an analog voltage signal to the (also now active) high resolution analog-to-digital converter 2028. The high resolution analog-to-digital converter 2028 converts the analog voltage signal into the digital high resolution voltage value 2030 and outputs the digital high resolution voltage value 2030 to one or more further output lines 2034. The one or more output lines 1954 and the one or more further output lines 2016 may form at least one digital interface being connected to the LIDAR Data Processing System 60, e.g. to the FPGA 61.

Illustratively, various embodiments providing an enhanced sampling scheme may be based on the application of the differentiated ToF signals. which enables increased temporal resolution for analyzing overlapping double peaks in the ToF trace. The trigger settings may be controlled by the digital backend (e.g. the host processor 62). The S-Clk (system clock) from the controller (e.g. the sensor controller 53) may be provided for optional enabling of the continuous waveform-sampling mode.

FIG. 20B shows an implementation of a read-out circuit in accordance with various embodiments.

The implementation as shown in FIG. 20B is very similar to the implementation as shown in FIG. 20A. Therefore, only the differences will be described in more detail below. With respect to the similar features, reference is made to the explanations with respect to FIG. 20A above.

Various embodiments providing an enhanced sampling scheme is based on the application of the dual differentiated ToF signals which enables increased temporal resolution for analyzing overlapping double peaks in close vicinity and the valleys in between. The trigger settings is may be controlled by the digital backend (e.g. the host processor 62). The S-Clk (system clock) from the controller (e.g. the sensor controller 53) may be provided for an optional enabling of the continuous waveform-sampling mode.

The implementation as shown in FIG. 20B may include a second differentiator 2042 configured to differentiate the electrical voltage signal 1106 to generate a second differentiated electrical voltage signal 2044;

a valley event detector 2046 configured to provide a valley trigger signal 2056 if an analog electrical characteristic representing the electrical energy stored in the energy storage circuit fulfills a predefined valley-trigger criterion. The valley event detector 2046 may include a determiner configured to determine whether the analog electrical characteristic exceeds a predefined threshold as the predefined trigger criterion. The determiner of the valley event detector 2046 may further be configured to compare the electrical voltage read from the energy storage circuit as the analog electrical characteristic with a predefined current threshold as the predefined threshold. The valley event detector 2046 may be implemented as a threshold event detector configured to determine whether the amount of the second derivative from the second-derivate-differentiator 2042, which presents the the temporal current or the voltage of the electrical voltage signal 1106 is equal to or larger than a respective predefined threshold value. The valley event detector 2046 may be implemented as a comparator circuit; in other words, the determiner may include or essentially consist of a comparator circuit configured to compare the electrical voltage read from the second-derivate-differentiator 2042 which represents the second derivative of the temporal current or the voltage of the electrical voltage signal 1106 with the predefined voltage threshold, e.g. provided by the sensor controller 53.

a valley timer circuit (Valley-TDC-Counter) 2048 is activated (triggered) by the trigger signal 2004 of the main event detector 2002 and is configured to provide a digital time information of the valley event with respect to the main event. The valley timer circuit 2048 may be implemented as a time-to-digital converter (TDC) circuit as will be described in more detail below; the valley TDC may include one or more digital counters. The valley timer circuit (Valley-TDC-Counter) 2048 will be deactivated by 2056;

optionally, a valley sample and hold circuit 2050 configured to store the electrical energy (e.g. electrical voltage) read from the energy storage circuit 1102 and to provide the stored electrical energy during the valley-event-time (e.g. electrical voltage) to a valley analog-to-digital converter 2052; and the valley analog-to-digital converter 2052 configured to convert the valley analog electrical characteristic (e.g. the amount of the electrical current or the voltage during the valley-event-time) into a valley digital electrical characteristic value 2054 (e.g. a digital valley current value or a digital valley voltage value).

Furthermore, the one or more signal lines (1106) 1942 (main-charge-signal) may further be directly electrically conductively coupled to an input of the second-derivative-differentiator 2042;

Furthermore, the output 2044 of the second-derivative-differentiator 2042 may be directly electrically conductively coupled to the input of the valley event detector 2046

Furthermore, the output 2056 the valley event detector 2046 may be directly electrically conductively coupled to the deactivation-input of the valley timer circuit (Valley-TDC-Counter) 2048 and to the trigger input of the valley sample and hold circuit 2050 as well as to the trigger input of the valley analog-to-digital converter 2052.

Illustratively, the valley electronic components (the valley timer circuit 2048, the valley sample and hold circuit 2050 and the valley analog-to-digital converter 2052) may be activated by the valley event detector 2056 based on whether a valley trigger criterion is fulfilled or not fulfilled.

In other words, the valley event detector 2046 may be configured to deactivate (stop) valley timer circuit 2048 in case that the valley trigger criterion is fulfilled (e.g. the double differentiated signal characteristic 2044 is equal to or exceeds a valley threshold). The sensor controller 53 may be configured to control the read-out process e.g. by providing a read-out control signal, e.g. the Start_N signal 1602 (in general any kind of start signal) to the main timer circuit 2006.

The amount of current or the voltage of the electrical energy signal (e.g. electrical voltage signal) 1106 provided by the (associated) energy storage circuit 1102 may be applied to input of the second-derivative-differentiator 2042.

The Valley-TDC-Counter 2048 may be triggered and activated by the main trigger signal 2004. The valley event detector 2046 may triggered by the second differentiator 2042 (if the second differentiator criterion is fulfilled, e.g. if the second derivative of the SPAD signal 1106 becomes "low"). The valley event detector 2046 in turn releases an Valley-Event-trigger-signal 2056 prior to deactivate the Valley-TDC-Counter 2048 and prior to activated the Valley-Sample-and-Hold-Circuit 2050 and prior to activate the valley analog-to-digital converter 2052. The valley timer circuit 2048 may be deactivated by the valley event detector 2046 respectively by the valley trigger signal 2056. The valley timer circuit 2048 may be stopped by the second differentiator 2042 so that the relative time value (time lapse) from the beginning of the event until the receipt of a signal indicating a valley is held in the valley timer circuit 2048.

By way of example, assuming that the sensor controller 53 has started the read-out process (and thus has activated (started) the main event detector 2002 and the main event detector 2002 detects that the SPAD signal 1106 provided on one signal line 1942 of the one or more signal lines 1942 fulfils the trigger criterion (in other words, a first sensor event (e.g. a first SPAD event) is detected), then the main event detector 2002 (in response to the determination of the fulfillment of the trigger criterion) generates the main trigger signal 2004, which in turn activates the high resolution timer circuit 2024 and the Valley-TDC-Counter 2048. Furthermore, the SPAD signal 1106 may activate the differentiator 2018 and the valley timer circuit 2048. The High resolution trigger signal 2038 may stop the high resolution timer circuit (Hi-Res-TDC-Counter) 2024. The counter value stored in the counter of Hi-Res-TDC-Counter 2024 when stopped represents a digital time code indicating the time of occurrence of the SPAD detection event (and in the LIDAR application a digitized ToF) representing the distance difference of two objects 100 in close proximity. By way of example, the stopped Hi-Res-TDC-Counter 2024 outputs "its" digitized valley ToF value 2024 to one or more output lines 2040 (1954) to the LIDAR Data Processing System 60, e.g. to a digital processor, e.g. to the FPGA 61 for digital signal processing. The valley trigger signal 2056 may stop the valley timer circuit (e.g. the valley TDC) 2048. The valley TDC counter value stored in the counter of the valley TDC 2048 when stopped represents a digital time code indicating the time of occurrence of the SPAD detection event (and in the LIDAR application a digitized ToF) representing the distance to the separation point of two objects 100 in close proximity. By way of example, the stopped valley timer circuit 2048 outputs "its" digitized valley ToF value 2058 to one or more output lines 1954 to the LIDAR Data Processing System 60, e.g. to a digital processor, to e.g. to the FPGA 61 for digital signal processing.

Furthermore, in various embodiments, the main trigger signal 2004 generated in case the SPAD signal 1106 provided on one signal line 1942 of the one or more signal lines 1942 fulfils the trigger criterion of the valley event detector 2046, the then generated valley trigger signal 2056 may is activate the (up to that time) deactivated valley analog-to-digital converter 2052 (and optionally to also activate the (up to that time) deactivated valley sample and hold circuit 2050). Thus, the now active valley sample and hold circuit 2050 stores the respective voltage signal being present on the one or more signal lines 1942 and provides the same as an analog voltage signal to the (also now active) valley analog-to-digital converter 2052. The valley analog-to-digital converter 2052 converts the analog voltage signal into a digital voltage value 2054 and outputs the digital voltage value 2054 to the one or more further output lines 2034. The one or more output lines 2036 and the one or more further output lines 2034 may form at least one digital interface being connected to the LIDAR Data Processing System 60, e.g. to the FPGA 61.

Moreover, the main trigger signal 2004 activates the valley timer circuit 2048 which starts counting. Furthermore, the SPAD signal (in general a photo signal) 1106 provided on one signal line 1942 of the one or more signal lines 1942 is also applied to the second differentiator 2042, which differentiates the SPAD signal 1106 over time twice. The second differentiated SPAD signal 2044 is supplied to an input of the valley event detector 2046. If the valley event detector 2046 detects that the second differentiated SPAD signal 2044 provided by the second differentiator 2042 fulfils a valley trigger criterion, then the valley event detector 2046 (in response to the determination of the fulfillment of the high resolution trigger criterion) generates a valley trigger signal 2056 to stop the valley timer circuit (e.g. the valley TDC) 2048. Illustratively, the second differentiated SPAD signal 2044 represents the curvature of the SPAD signal 1106 and thus, the valley event detector 2046 observes the curvature of the SPAD signal 1106 and provides the valley trigger signal 2056 e.g. if the curvature of the SPAD signal 1106 is equal to or exceeds a curvature threshold (e.g. the value "0"). In other words, the valley components serve to provide additional information about the SPAD signal 1106 to provide a valley and curvature information thereof if desired. The counter value stored in the counter of the valley TDC 2048 when stopped represents a digital time code indicating the time of occurrence of the second differentiated SPAD signal detection event with respect to the occurrence of the main trigger signal 2004.

By way of example, the stopped valley timer circuit 2048 outputs "its" digitized and thus digital second differentiated ToF value 2058 to one or more output lines 1954 to the LIDAR Data Processing System 60, e.g. to a digital processor, e.g. to the FPGA 61 for digital signal processing. The second digital differentiated ToF value 2058 carries the relative time delay from the main trigger signal 2004 to the occurrence of the valley trigger signal 2056 which represents the time delay of the occurrence of the foremost main event detector 2002 and the consecutive non-leading valley event at 2046.

Furthermore, in various embodiments, the valley trigger signal 2056 generated in case the second differentiated SPAD signal 2044 provided by the second differentiator 2042 fulfils the valley trigger criterion, may activate the (up to that time) deactivated valley analog-to-digital converter 2052 (and optionally to also activate the (up to that time) deactivated valley sample and hold circuit 2050). Thus, the now active valley sample and hold circuit 2050 stores the respective voltage signal (intensity signal) being present on the one or more signal lines 1942 and provides the same as an analog voltage signal to the (also now active) valley analog-to-digital converter 2052. The valley analog-to-digital converter 2052 converts the analog voltage signal into the digital valley voltage value 2054 and outputs the digital valley voltage value 2054 to one or more further output lines 2034. The one or more output lines 1954 and the one or more further output lines 2034 may form at least one digital interface being connected to the LIDAR Data Processing System 60, e.g. to the FPGA 61.

Figure 21A:
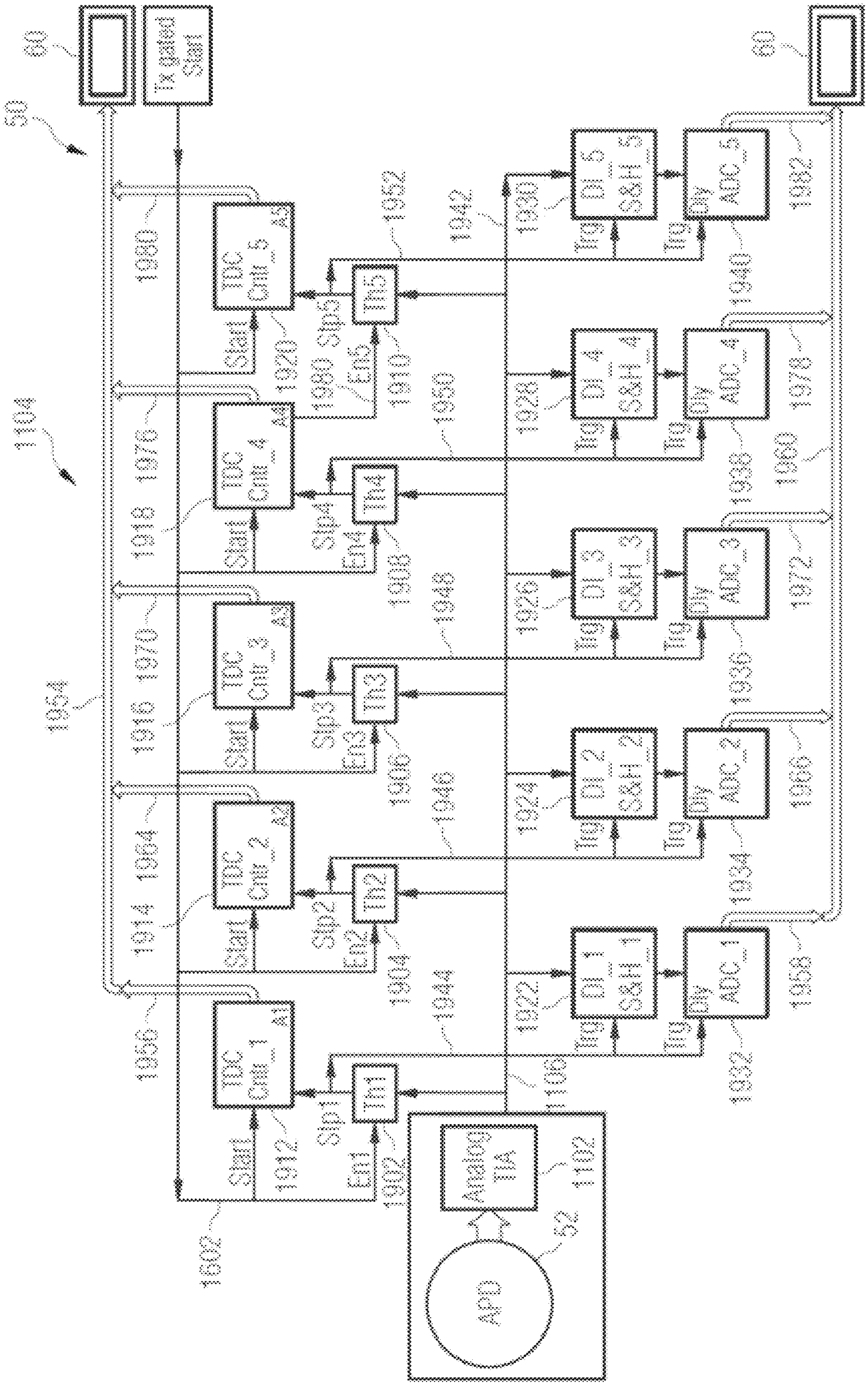
FIGS. 21A and 21B show various implementations of a readout circuit in accordance with various embodiments.

FIG. 21A shows another implementation of a read-out circuit in accordance with various embodiments.

The implementation as shown in FIG. 21 is very similar to the implementation as shown in FIG. 19. Therefore, only the differences will be described in more detail below. With respect to the similar features, reference is made to the explanations with respect to FIG. 19 above.

One difference of the implementation shown in FIG. 21A is that in the implementation shown in FIG. 19A only allows to detect the time of occurrence of an individual sensor event, but not the course of time of the sensor signal of an individual sensor event. This, however, is achieved with the implementation shown in FIG. 21A. Thus, the implementation shown in FIG. 21A allows an in pixel classification of ToF-pulses based on the course of time of the sensor signal of an individual sensor event.

In more detail, in the implementation shown in FIG. 21A, the following connections of the implementation shown in FIG. 19A are not provided:

- a connection between the first timer circuit 1912 and the enabling input of the second event detector 1904; thus, no first timer circuit output signal 1962 is provided by the first timer circuit 1912 and supplied to the enabling input of the second event detector 1904;
- a connection between the second timer circuit 1914 and the enabling input of the third event detector 1906; thus, no second timer circuit output signal 1968 is provided by the second timer circuit 1914 and supplied to the enabling input of the third event detector 1906;
- a connection between the third timer circuit 1916 and the enabling input of the fourth event detector 1908; thus, no third timer circuit output signal 1974 is provided by the third timer circuit 1916 and supplied to the enabling input of the fourth event detector 1908.

Instead, in the implementation shown in FIG. 21, the Start_N signal 1602 is not only supplied to all timer circuits 1912, 1914, 1916, 1918, 1920 to start the counters running at the same time, but the Start_N signal 1602 is also supplied to the respective enabling input of the first event detector 1902, the enabling input of the second event detector 1904, the enabling input of the third event detector 1906, and the enabling input of the fourth event detector 1908.

In other words, the first, second, third and fourth event detectors 1902, 1904, 1906, 1908 are activated substantially at the same time, while the fifth event detector 1910 remains still deactivated, although the fifth timer circuit 1920 has already been activated and is running.

In an alternative implementation, the first, second, third and fourth event detectors 1902, 1904, 1906, 1908 are activated substantially at the same time, but by at least one other signal than the Start_N signal 1602.

In the implementation shown in FIG. 21A, first, second, third and fourth event detectors 1902, 1904, 1906, 1908 may have different predefined threshold values (in general, they check against different trigger criterions). Thus, first, second, third and fourth event detectors 1902, 1904, 1906, 1908 are activated for the detection of the same sensor event and allow the determination of the course (in other words the temporal progression or the pulse shape signature) of the sensor signal.

Assuming that the trigger criterion is simply a voltage threshold (in general, any other and more complex trigger criterion may be implemented), and th1<th2<th3<th4 (th1 is the voltage threshold value of the first event detector 1902, th2 is the voltage threshold value of the second event detector 1904, th3 is the voltage threshold value of the third event detector 1906, and th4 is the voltage threshold value of the fourth event detector 1908), the event detectors 1902, 1904, 1906, 1908 may detect the gradient of the voltage sensor signal 1106 on the one or more signal lines 1942.

By way of example,

- a first measurement time of the sensor signal 1106 may be the time instant (represented by the counter value of the first timer circuit 1912) when the first event detector 1902 determines that the voltage is equal to or exceeds the first threshold value th1;
- a second measurement time of the sensor signal 1106 may be the time instant (represented by the counter value of the second timer circuit 1914) when the second event detector 1904 determines that the voltage is equal to or exceeds the second threshold value th2;
- a third measurement time of the sensor signal 1106 may be the time instant (represented by the counter value of the third timer circuit 1916) when the third event detector 1906 determines that the voltage is equal to or exceeds the third threshold value th3; and
- a fourth measurement time of the sensor signal 1106 may be the time instant (represented by the counter value of the third timer circuit 1916) when the fourth event detector 1906 determines that the voltage is equal to or exceeds the fourth threshold value th4.

Moreover, the fourth timer circuit 1918 generates a fourth timer circuit output signal 1980 and supplies the same to an enabling input of the fifth event detector 1910. In various embodiments, the fourth timer circuit output signal 1980 in this case may activate the (up to the receipt of this signal 1980 deactivated) fifth event detector 1910 to detect a second sensor event.

Illustratively, in the implementation shown in FIG. 21A, four data points (determined by a respective digital amplified current value and the associated TDC value) may be provided for one single sensor event describing the course of time of this sensor signal 1106.

Since e.g. the threshold values can be arbitrarily defined, it is possible to detect the course of time of the sensor signal with very high accuracy.

In various embodiments, the first to fourth event detectors 1902, 1904, 1906, 1908 may be provided with a predefined pattern of threshold values, which, in order to detect a predefined pulse shape, may be activated one after the other during an active SPAD pulse, for example. This concept illustratively corresponds to an event selection with higher granularity in the form of a conditioned event trigger generation.

As an alternative to provide information about the shape the detected sensor signal, the implementation shown in FIG. 19A may remain unchanged with respect to the detector structure and connections. However, in various embodiments, one respective trigger event may be used as a trigger for the associated analog-to-digital converter (and optionally the associated sample-and-hold-circuit) not only to sample and generate one digital sensor signal value, but to sample and generate a plurality (e.g. a burst) of successive digitized and thus digital sensor signal values and to provide the same to the digital backend (i.e. the digital interface) for further digital signal processing. The pulse analysis or pulse classification may then be implemented in the digital domain.

Figure 21B:
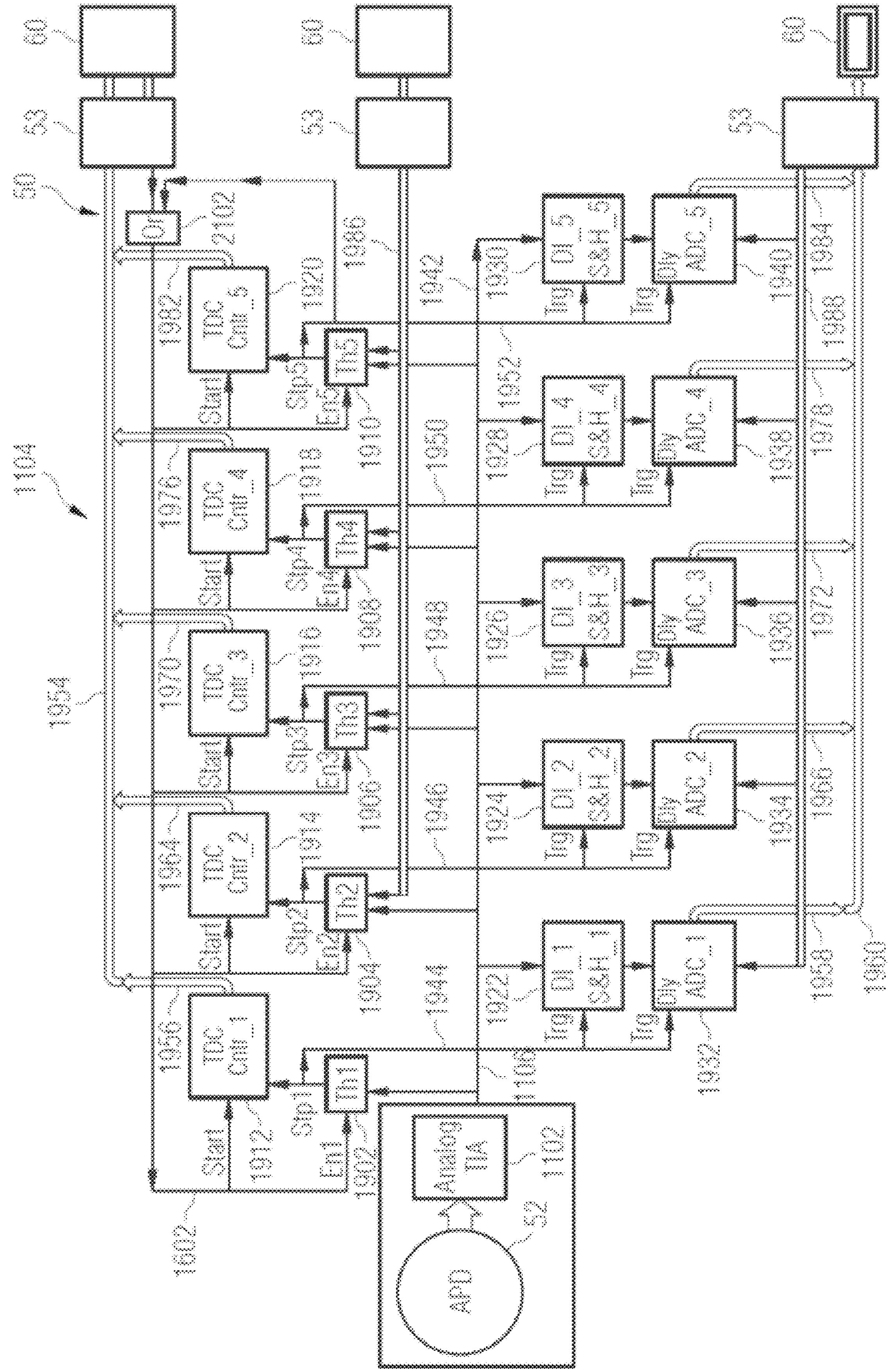

FIG. 21B shows another implementation of a read-out circuit in accordance with various embodiments.

The implementation as shown in FIG. 21B is very similar to the implementation as shown in FIG. 21A. Therefore, only the differences will be described in more detail below. With respect to the similar features, reference is made to the explanations with respect to FIG. 21A above.

FIG. 21B shows a pixel architecture for an individual pulse shape sampling with conditional trigger settings for enabling the coherent detection of predefined LIDAR signal types. The validity of a detected event can be decided in the backend (e.g. by the FPGA 61 or the host processor 62) by comparing the received results of the various TDC and ADC value pairs with predefined expected values (this may be referred to as coherent LIDAR analysis). The Trigger-Settings may also be controlled by the digital backend (e.g. the host processor 62). The optional S-Clk (system clock) 1988 from the controller (e.g. the sensor controller 53) may be provided for an optional enabling of the continuous waveform-sampling mode.

The second LIDAR sensing system 50 may further include an OR-gate 2102. A first input of the OR-gate 2102 may be coupled to the sensor controller 53 and/or the LIDAR Data Processing System 60, e.g. to the FPGA 61 which may supply the start signal Start_N 1602 thereto, for example. A second input of the OR-gate 2102 may be coupled to an enabling output of the fifth event detector 1910, which may also provide a signal used as a start signal for starting a read out process.

Illustratively, when the fifth timer circuit 1920 has been stopped, the detection procedure to detect the current event will also be stopped. The next trigger chain will now be started again to detect the next incoming event. This may be achieved by "recycling" or overwriting the start signal 1602 in order to bring the system into its initial state again. The OR-gate 2102 is one possible implementation to achieve this.

Figure 22:
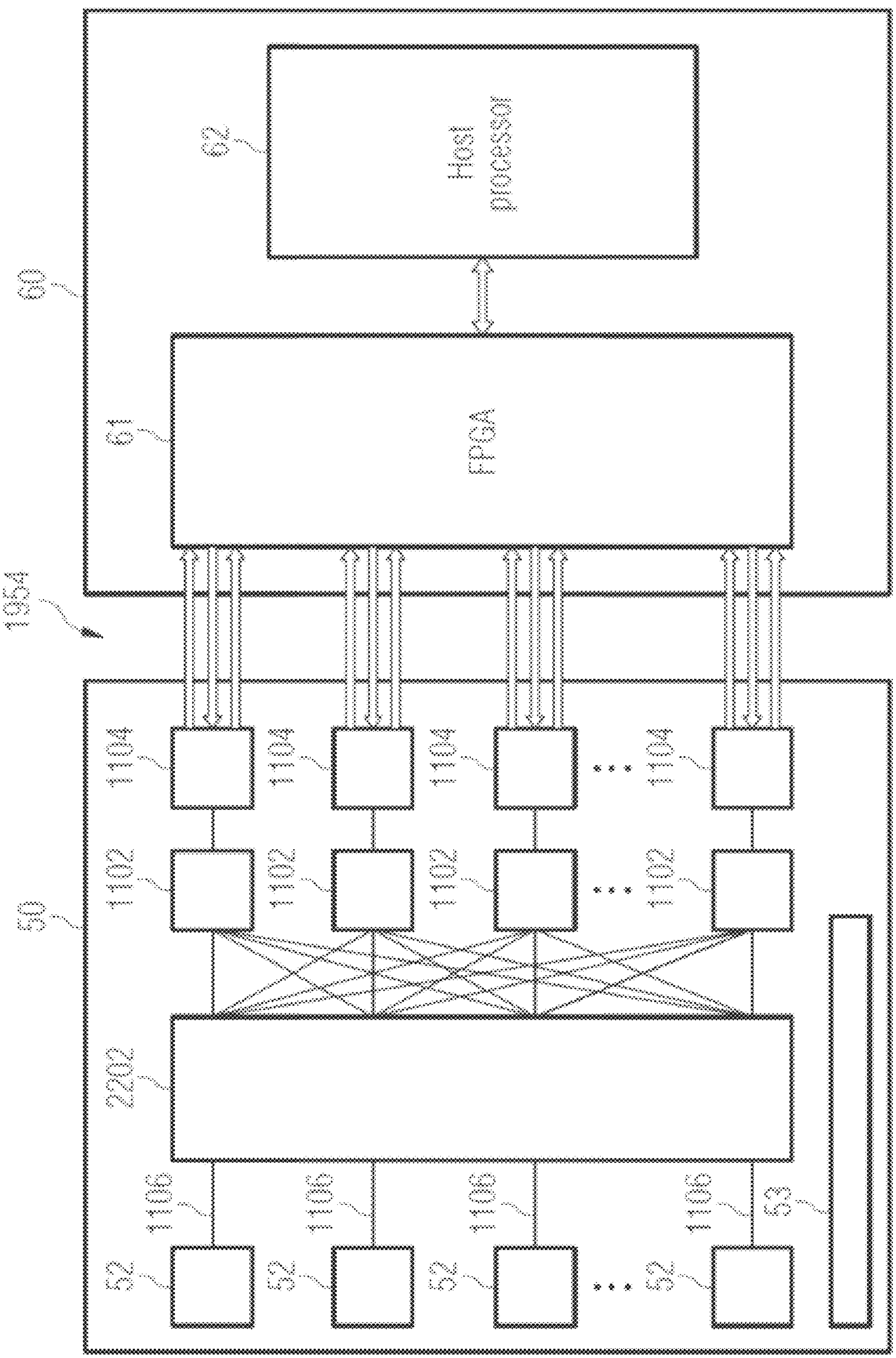
FIG. 22 shows an embodiment of a portion of the proposed LIDAR Sensor System with mixed signal processing.

FIG. 22 shows an embodiment of a portion of the proposed LIDAR Sensor System with mixed signal processing.

The implementation as shown in FIG. 22 is very similar to the implementation as shown in FIG. 11. Therefore, only the differences will be described in more detail below. With respect to the similar features, reference is made to the explanations with respect to FIG. 11 above.

One difference of the implementation shown in FIG. 22 is that in the implementation shown in FIG. 11 provides for a fixed static assignment of one energy storage circuit 1102 of the plurality of energy storage circuits 1102 to a respective one sensor element 52 of the plurality of sensor elements 52. In contrast thereto, the implementation shown in FIG. 22 includes a first multiplexer 2202 connected between the outputs of the plurality of sensor elements 52 and the inputs of the plurality of energy storage circuits 1102. The first multiplexer 2202 receives a multiplexer control signal (not shown) from the sensor controller 53 and selects one or more through connections between e.g. (exactly) one sensor element 52 of the plurality of sensor elements 52 and (exactly) one energy storage circuit 1102 of the plurality of energy storage circuits 1102. Thus, a dynamic assignment of an energy storage circuit 1102 to a sensor element 52 is provided.

In the implementation shown in FIG. 22, the number of energy storage circuits 1102 is equal to the number of sensor elements 52. However, the first multiplexer 2202 and the associated dynamic assignment of the energy storage circuits 1102 allows to reduce the number of provided energy storage circuits 1102, since in various implementations, not all of the sensor elements may be active at the same time. Thus, in various implementations, the number of provided energy storage circuits 1102 is smaller than the number of sensor elements 52.

Figure 23:
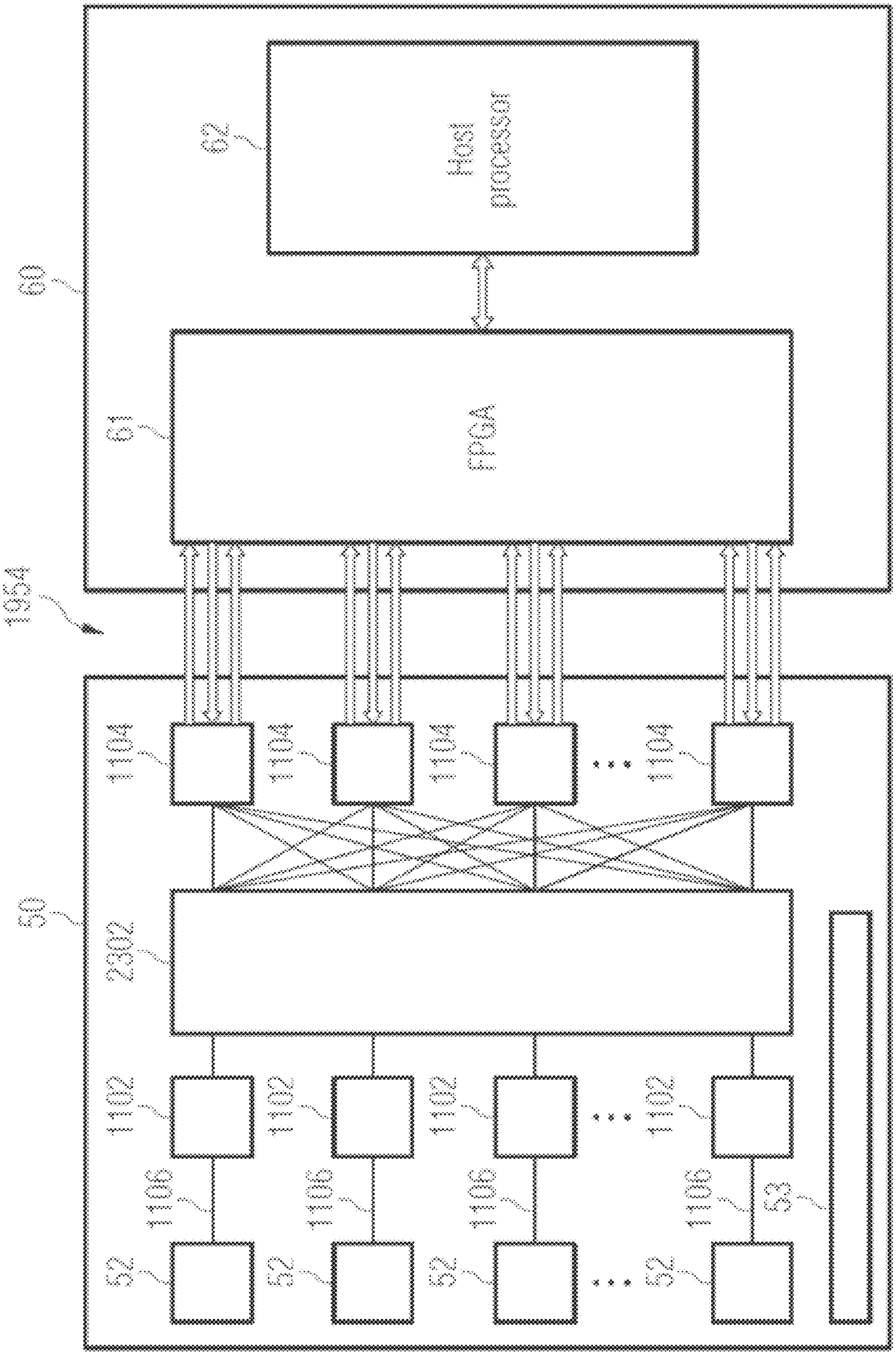
FIG. 23 shows an embodiment of a portion of the proposed LIDAR Sensor System with mixed signal processing.

FIG. 23 shows an embodiment of a portion of the proposed LIDAR Sensor System with mixed signal processing.

The implementation as shown in FIG. 23 is very similar to the implementation as shown in FIG. 11. Therefore, only the differences will be described in more detail below. With respect to the similar features, reference is made to the explanations with respect to FIG. 11 above.

One difference of the implementation shown in FIG. 23 is that the implementation shown in FIG. 11 provides for a fixed static assignment of one read-out circuitry 1104 of the plurality of read-out circuitries 1104 to a respective one sensor element 52 of the plurality of sensor elements 52 (and of one energy storage circuit 1102 of the plurality of energy storage circuits 1102). In contrast thereto, the implementation shown in FIG. 23 includes a second multiplexer 2302 connected between the outputs of the energy storage circuits 1102 and the inputs of the plurality of energy storage circuits 1102. The second multiplexer 2302 receives a further multiplexer control signal (not shown) from the sensor controller 53 and selects one or more through connections between e.g. (exactly) one energy storage circuit 1102 of the plurality of energy storage circuits 1102 and (exactly) one read-out circuitry 1104 of the plurality of read-out circuitries 1104. Thus, a dynamic assignment of a read-out circuitry 1104 to an energy storage circuit 1102 is provided.

In the implementation shown in FIG. 23, the number of readout circuitries 1104 is equal to the number of energy storage circuits 1102. However, the second multiplexer 2302 and the associated dynamic assignment of the read-out circuitries 1104 allows to reduce the number of provided read-out circuitries 1104, since in various implementations, not all of the sensor elements 52 and thus not all of the energy storage circuits 1102 may be active at the same time. Thus, in various implementations, the number of provided read-out circuitries 1104 is smaller than the number of energy storage circuits 1102.

In various embodiments, the implementation shown in FIG. 22 may be combined with the implementation shown in FIG. 23. Thus, the first multiplexer 2202 and the second multiplexer 2302 may be provided in one common implementation.

Moreover, various embodiments may provide an in-pixel-TDC architecture. One approach of analog TDCs=TACs may illustratively be based on a two step approach by translating the time interval into a voltage and this voltage into a digital value. Digital based TDCs for interval measurement are counter based approaches. TDC are digital counters for precise time-interval measurement. The simplest technique to quantize a time interval is to count the cycles of a reference clock during the targeted time interval. The time interval is defined by a start signal and a stop signal. Since in general the respective time interval is asynchronous to the reference clock, a first systematic measurement error ΔTstart appears already at the beginning of the time interval and a second systematic measurement error appears ΔTstop at the end of the time interval. The measurement accuracy can be increased by a higher reference clock frequency, which in general leads to a higher power consumption for clock generation and clock distribution. CMOS based oscillators generators are limited in their frequencies and for frequency values higher than 1 GHz CML or external LC oscillators are required (CML=Current mode logic). For a 65 nm technology the maximum frequency is limited typically to 5 GHz-10 GHz Higher resolution than the underlying reference clock is achieved by subdividing the reference clock period asynchronously into smaller time intervals. The capability to divide an external reference clock in subdivisions is the enhanced functionally of a TDC in contrast to a regular digital counter. Hence with a given global reference clock, the TDC's provides a higher temporal resolution than a regular digital counter with same external reference clock. The techniques for subdividing the reference clock ranges from the standard interpolation to the application of internal ring oscillators till to the setup of digital delay chains. The resolution is the criterion that distinguishes a TDC from a counter.

For a precise time interval measurement the digital TDC is stopped on arrival of the global stop event and the time lapse from the arrival of the previous reference clock cycle is measured by the internal phase interpotation technique which finally provides a higher accuracy of the elapsed time from the start-signal of a global reference clock. An example for an integrated TDC-circuit in CMOS technology may be as follows: In-pixel TDC area: 1740 $\mu m^2$ (standard 0.18 μm CMOS-technology)—In-pixel TDC power consumption: 9 μW—In-pixel TDC time resolution: 0.15 ns from 0.8 GHz reference-clock—In-pixel TDC-jitter: 100 ps.

In various embodiments, the second multiplexer may be omitted and the number of read-out circuitries 1104 nevertheless may be smaller than the number of sensors 52. To reduce the number of read-out circuitries 1104, a limited set of read-out circuitries 1104, e.g. a limited set of ADCs (e.g. an EDC bank) may be provided, globally for all sensor elements of the entire array. If the detector 1902, 1904, 1906, 1908, 1910 detects an event in one of the plurality of pixels, then the TDC/ADC control signals may be provided to a sensor-external circuit. The then next (in other words following, consecutive) released read-out circuitry 1104 may be dynamically and temporally assigned to the respective sensor element 52 for a specific digitization. By way of example, a ratio of N pixels (N sensor elements 52, N being an integer larger than 0) to M ADCs (M analog-to-digital converters, M being an integer larger than 0) may be about 10. In the simplest case, the read-out circuitry 1104 may consist of only (exactly) one ADC. The associated time of conversion may in this case be provided by the so-called time information signal. The TIA lines of the individual pixel may then specifically be addressed via a multiplexer system.

Furthermore, various embodiments may individually select various sensor regions, e.g. by a specific activation or deactivation of individual or several pixels of the sensor array. A basis for this selection may be a priori information determined e.g. by a complementary sensor (e.g. a camera unit). This a priori information may be stored and it may later be used to determine regions of the array which may not need to be activated in a specific context or at a specific time. By way of example, it may be determined that only a specific partial region of the sensor, e.g. the LIDAR sensor may be of interest in a specific application scenario and that thus only the sensor included in that specific partial region may then be activated. The other sensors may remain deactivated. This may be implemented by a decoder configured to distribute a global digital start signal to the individual pixels.

Figure 24:
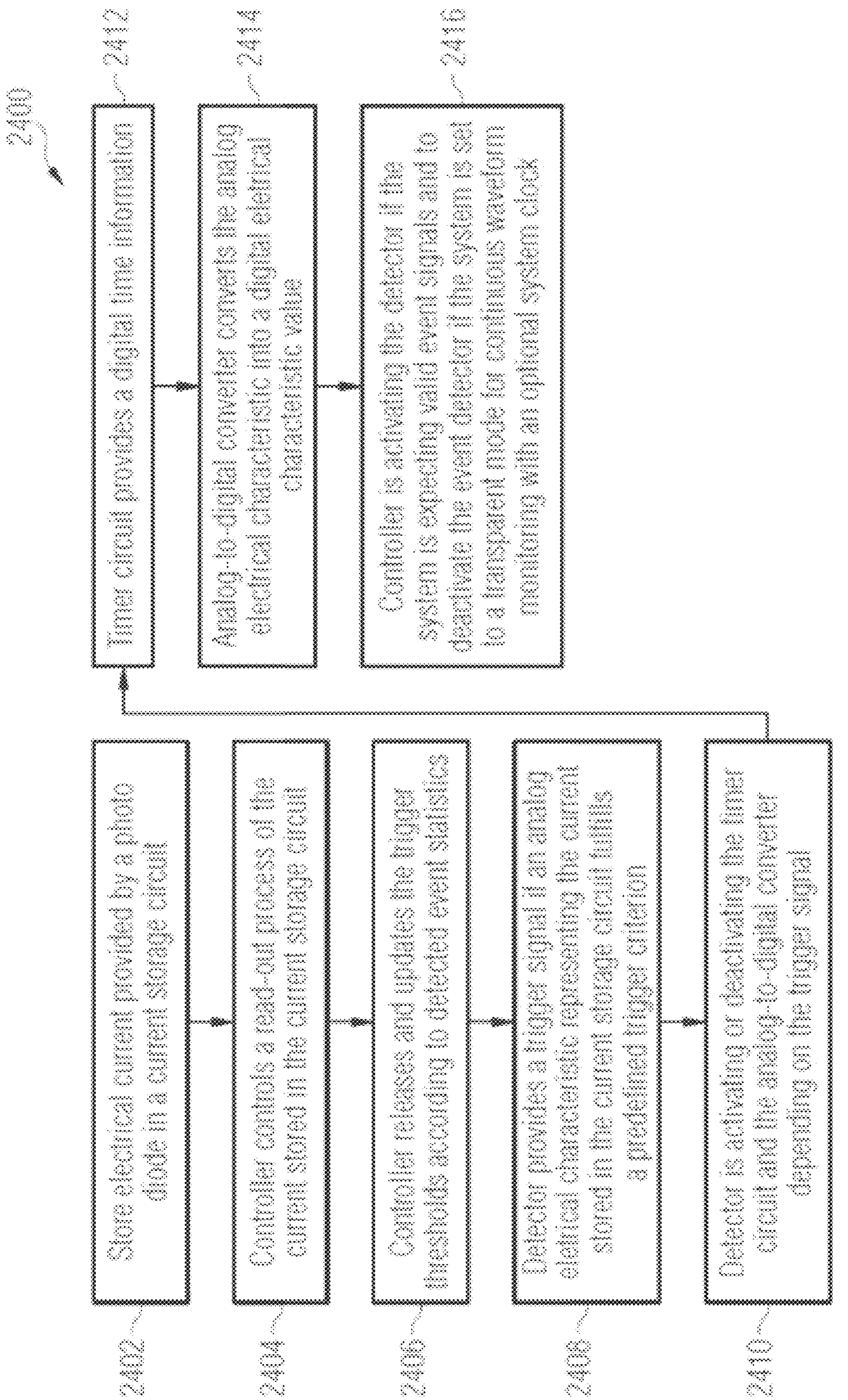
FIG. 24 shows a flow diagram illustrating a method for operating a LIDAR sensor system.

FIG. 24 shows a flow diagram 2400 illustrating a method for operating a LIDAR sensor system.

The method includes, in 2402, storing electrical current provided by a photo diode in an energy storage circuit, in 2404, a controller controlling a read-out process of the electrical energy stored in the energy storage circuit, in 2406, the controller releasing and updating the trigger thresholds according to (e.g. predetermined) detected event statistics, in 2408, an event detector providing a trigger signal if an analog electrical characteristic representing the electrical energy stored in the energy storage circuit fulfils a predefined trigger criterion. In 2410, the event detector is activating or deactivating the timer circuit and the analog-to-digital converter depending on the trigger signal. Furthermore, in 2412, a timer circuit may provide a digital time information, and in 2414, the analog-to-digital converter converts the analog electrical characteristic into a digital electrical characteristic value. Furthermore, in 2416, the controller is activating the event detector if the read-out 3*o* process is in an active state and is deactivating the event detector if the readout process is in an inactive state. In other words, in 2416, the controller is activating the event detector if the system is expecting valid event signals and is deactivating the event detector if the system is set to a transparent mode for continuous waveform monitoring with an optional system clock.

It is understood that the LIDAR Sensor System and the LIDAR Sensor Device as described above and below in the various aspects of this disclosure may be configured to emit and sense visible and infrared radiation. The infrared radiation may be in the wavelength range from 780 nm to 1600 nm. This means, there may be a variety of light sources emitting in various wavelength ranges, and a variety of different sensing elements configured to sense radiation in various wavelength ranges. A sensor element, e.g. as part of a sensor array, as described above and below, may be comprised of such wavelength sensitive sensors, either by design or by using specific spectral filters, for example NIR narrow-band spectral filters. It should be noted that the LIDAR Sensor System may be implemented using any desired wavelength (the eye safety rules have to be complied with for any wavelength). Various embodiments may use the wavelengths in the infrared region. This may even be efficient during rainy or foggy weather. In the near infrared (NIR) region, Si based sensors may still be used. In the wavelength region of approximately 1050 nm, InGa sensors which should be provided with additional cooling, may be the appropriate sensor type.

Furthermore, it should be noted that the read-out mechanism to read out the TDCs and the ADCs is generally not associated with (and not bound to) the activity state of the measurement system. This is due to the fact that die digital data provided by the TDC and/or ADC may be stored in a buffer memory and may be streamed in a pipeline manner therefrom independent from the activity state of the measurement system. As long as there are still data stored in the pipeline, the LIDAR Data Processing System 60, e.g. the FPGA 61, may read and process these data values. If there are no data stored in the pipeline anymore, the LIDAR Data Processing System 60, e.g. the FPGA 61, may simply no longer read and process any data values. The data values (which may also be referred to as data words) provided by the TDC and ADC may be tagged and may be associated with each other in a pair-wise manner.

In various embodiments (which may be referred to as "continuous waveform streaming"), the event detectors may generally be deactivated. Instead, the sample and hold circuits and/or the ADCs may be configured to continuously convert the incoming data present on the one or more lines 1942, for example (e.g. using a clock of 150 MHz or 500 MHz). The to ADC may then supply the resulting continuous data stream of digitized data values to the LIDAR Data Processing System 60, e.g. the FPGA 61. This continuous data stream may represent the continuous waveform of the LIDAR signal. The event selection or the event evaluation may then be carried out completely in the digital backend (e.g. in the LIDAR Data Processing is System 60, e.g. in the FPGA 61 or in the host processor 62) by means of software. These embodiments and the mode described therein are optional.

Figure 25B:
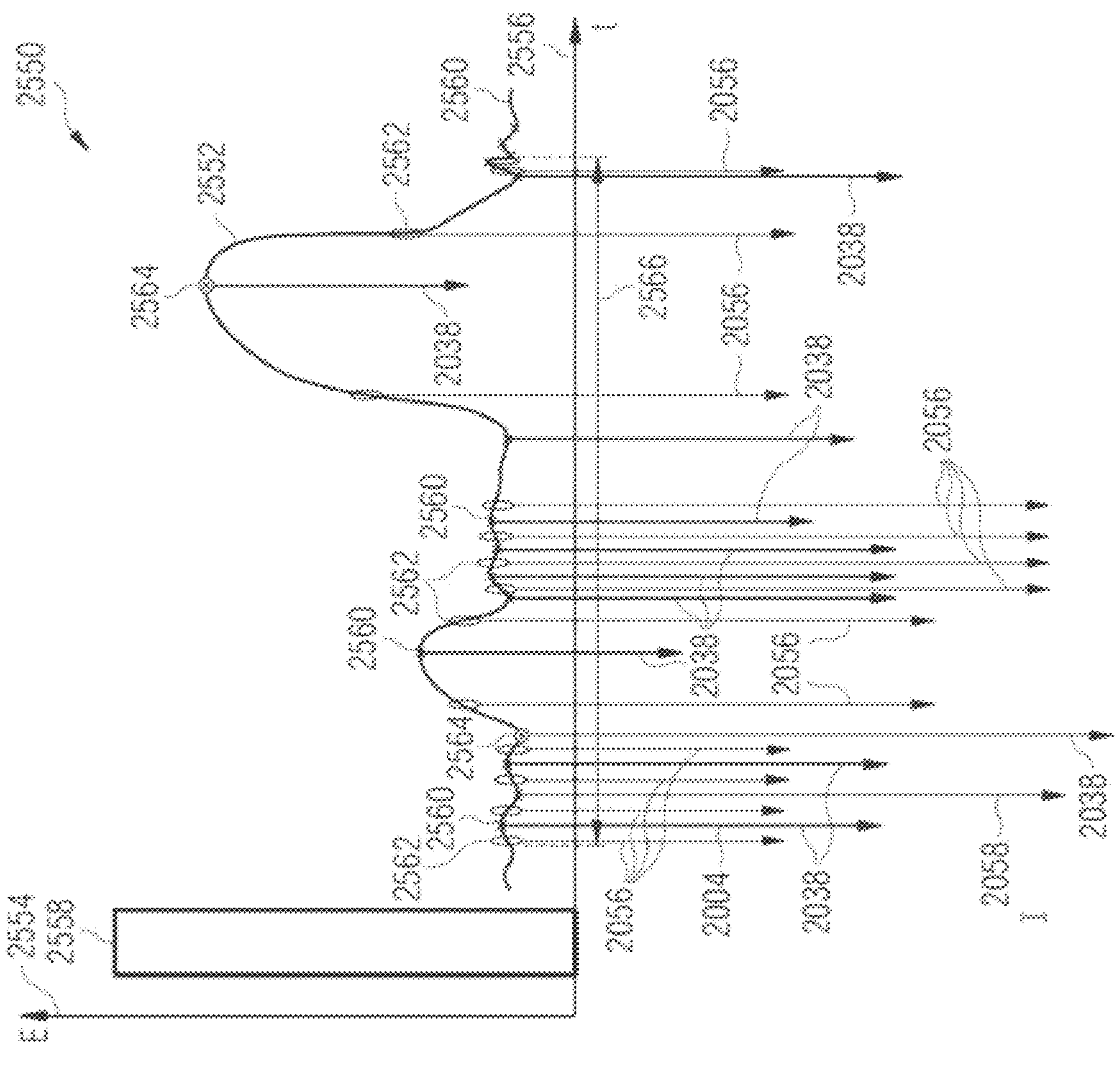
FIG. 25B shows an example waveform of the signal received by a single pixel over time and the respective trigger events created by the event detector in accordance with various embodiments.

FIG. 25B shows an example waveform 2552 of the signal received by a single pixel over time and the respective trigger events created by the respective event detector in accordance with various embodiments.

In more detail, the waveform 2552 is shown in an energy E 2554 vs. time t 2556 diagram 2550. The diagram 2550 also shows an emitted light (e.g. laser) pulse 2558. Upon the release of the emitted light (e.g. laser) pulse 2558 the TDC-Counters (Main-TDC-Counters) 1912 to 1920 may be started and activated. The waveform 2552 illustratively represents the waveform representing the received signal by one pixel due to the emitted light (e.g. laser) pulse 2558. The waveform 2552 includes minima and maxima (where the first derivative of the waveform 2552 has the value "0") symbolized in FIG. 25B by the symbol "X" 2560. FIG. 25B further shows a time period 2566 (also referred to as gated window), during which the waveform 2552 is detected by the pixel (in other words, during which the pixel is activated). At each time the waveform 2552 (1942,1106) has a (local or global) minimum or a (local or global) maximum.

Whenever the waveform 2552 (1942,1106) provides a first global or local maximum, the main event detector 2002 generates main trigger signal 2004 and starts (activate) both the high resolution timer circuit 2024 and the valley event timer circuit 2048.

Furthermore, the waveform 2552 also includes points at which it changes its curvature (where the second derivative of the waveform 2552 has the value "0") symbolized in FIG. 25B by an ellipse as a symbol 2562. It is to be noted that the second differentiator 2042 may be configured to respond faster than the differentiator 2018.

At each time the waveform 2552 has a change in its curvature, the valley event detector 2046 generates the valley trigger signal 2056 to stop (deactivate) the valley TDC 2048 (and optionally to also activate the is (up to that time) deactivated valley sample and hold circuit 2050) and to start (activate) the (up to that time) deactivated valley analog-to-digital converter 2052.

An encircled symbol "X" 2564 indicate the global minimum and global maximum used for calibration and verification purposes.

Whenever the waveform 2552 (1942,1106) provides a first global or local minimum (valley), the valley event detector 2046 generates a valley-event trigger signal 2058 and stops (deactivates) the valley-event TDC 2048 and in turn activates both the valley-event sample and hold circuit 2050 and the valley-event analog-to-digital converter 2052.

At each time the waveform 1106, 1942 (2552) reaches consecutively a second maximum, the Hi-Res-Event detector 2022 generates the Hi-Res-Event-trigger signal 2038 to stop (deactivate) the Hi-Res-TDC-Counter 2024. The High resolution event detector 2022 generates the high resolution trigger signal 2038 to stop (deactivate) the high resolution timer circuit 2024 and to start (activate) the (up to that time) deactivated high resolution analog-to-digital converter 2028 (and optionally to also activate the (up to that time) deactivated high resolution sample and hold circuit 2026 and also to activate the (up to that time) deactivated Hi-Res-ADC 2028). It is to be noted again that the differentiator 2018 responds slower than the second differentiator 2042.

Whenever the waveform 2552 (1942,1106) provides a second global or local minimum (Hi-Res-Peak), high resolution event detector 2022 generates a high resolution trigger signal 2038 and stops (deactivate) the high-resolution TDC 2024 and in turn activates both the high resolution sample and hold circuit 2026 and the high resolution analog-to-digital converter 2028 (Hi Res Peak detection—second local maximum).

In various embodiments, the LIDAR sensor system as described with reference to FIG. 11 to FIG. 25B may, in addition or as an alternative, be configured to determine the amplitude of the detected signal.

In the following, various aspects of this disclosure will be illustrated:

Example 1a is a LIDAR Sensor System. The LIDAR Sensor System includes at least one photo diode, an energy storage circuit configured to store electrical energy provided by the photo diode, a controller configured to control a read-out process of the electrical energy stored in the energy storage circuit, and at least one read-out circuitry. The at least one readout circuitry includes an event detector configured to provide a trigger signal if an analog electrical characteristic representing the electrical energy stored in the energy storage circuit fulfills a predefined trigger criterion, a timer circuit configured to provide a digital time information, and an analog-to-digital converter configured to convert the analog electrical characteristic into a digital electrical characteristic value. The event detector is configured to deactivate the timer circuit and to activate the analog-to-digital converter depending on the trigger signal.

In Example 2a, the subject matter of Example 1a can optionally include that the controller (53) is further configured to activate the event detector (1902, 1904, 1906, 1908, 1910) if valid event signals are expected and to deactivate the event detector (1902, 1904, 1906, 1908, 1910) if the system is set to a transparent mode for continuous waveform monitoring.

In Example 3a, the subject matter of any one of Examples 1a or 2a can optionally include that the controller is further configured to activate the event detector if the read-out process is in an active state and to deactivate the event detector if the read-out process is in an inactive state.

In Example 4a, the subject matter of any one of Examples 1a to 3a can optionally include that the at least one photo diode includes an avalanche photo diode (APD) and/or a SiPM (Silicon Photomultipliers) and/or a CMOS sensors (Complementary metal-oxide-semiconductor and/or a CCD (Charge-Coupled Device) and/or a stacked multilayer photodiode.

In Example 5a, the subject matter of Example 4a can optionally include that the at least one avalanche photo diode includes a single-photon avalanche photo diode (SPAD).

In Example 6a, the subject matter of any one of Examples 1a to 5a can optionally include that the energy storage circuit includes a transimpedance amplifier (TIA).

In Example 7a, the subject matter of Example 6a can optionally include that the transimpedance amplifier includes a memory capacitor configured to store the electrical current provided by the photo diode and to provide the electrical current when the read-out process is in the active state.

In Example 8a, the subject matter of any one of Examples 1a to 7a can optionally include that the controller is further configured to provide a signal to switch the read-out process into the active state or the inactive state, and to activate or deactivate the event detector accordingly.

In Example 9a, the subject matter of any one of Examples 1a to 8a can optionally include that the event detector includes a determiner configured to determine whether the analog electrical characteristic exceeds or falls below a predefined threshold as the predefined trigger criterion. The predefined threshold may be fixed or programmable. By way of example, a processor in the digital backend, such as the FPGA or the host processor may adapt the threshold value(s) dynamically, e.g. in case no meaningful image can be reconstructed.

In Example 10a, the subject matter of Example 9a can optionally include that the determiner is further configured to compare the electrical voltage read from the energy storage circuit as the analog electrical characteristic with a predefined voltage threshold as the predefined threshold.

In Example 11a, the subject matter of Example 10a can optionally include that the determiner includes a comparator circuit configured to compare the electrical voltage read from the energy storage circuit with the predefined voltage threshold.

In Example 12a, the subject matter of any one of Examples 1a to 11a can optionally include that the timer circuit includes a digital counter.

In Example 13a, the subject matter of any one of Examples 1a to 12a can optionally include that the timer circuit includes a time-to-digital converter (TDC).

In Example 14a, the subject matter of any one of Examples 1a to 13a can optionally include that the event detector is configured to provide the trigger signal to deactivate the timer circuit if the predefined trigger criterion is fulfilled.

In Example 15a, the subject matter of any one of Examples 1a to 14a can optionally include that the timer circuit is configured to provide the trigger signal to activate the analog-to-digital converter to convert the electrical voltage read from the energy storage circuit into a digital voltage value if the predefined trigger criterion is fulfilled.

In Example 16a, the subject matter of any one of Examples 1a to 15a can optionally include that the LIDAR Sensor System further includes a sample and hold circuit configured to store the electrical voltage read from the energy storage circuit and to provide the stored electrical voltage to the analog-to-digital converter.

In Example 17a, the subject matter of any one of Examples 10a to 16a can optionally include that the timer circuit is further configured to provide the trigger signal to activate the sample and hold circuit to sample and hold the electrical voltage read from the energy storage circuit if the predefined trigger criterion is fulfilled.

In Example 18a, the subject matter of any one of Examples 1a to 17a can optionally include that the LIDAR Sensor System further includes a digital processor configured to process the digital time information and the digital electrical characteristic value.

In Example 19a, the subject matter of Example 18a can optionally include that the digital processor includes a field programmable gate array.

In Example 20a, the subject matter of any one of Examples 18a or 19a can optionally include that the digital processor is further configured to provide a pre-processing of the digital time information and the digital electrical characteristic value and to provide the pre-processing result for a further analysis by another processor.

In Example 21a, the subject matter of any one of Examples 1a to 19a can optionally include that the photo diode and the energy storage circuit are monolithically integrated in at least one sensor element.

In Example 22a, the subject matter of any one of Examples 1a to 21a can optionally include that the at least one sensor element includes a plurality of sensor elements, and that an energy storage circuit is provided for each sensor element.

In Example 23a, the subject matter of Example 22a can optionally include that the at least one read-out circuitry includes a plurality of read-out circuitries.

In Example 24a, the subject matter of Example 23a can optionally include that a first read-out circuitry of the plurality of read-out circuitries is configured to provide an activation signal to an event detector of a second read-out circuitry of the plurality of read-out circuitries to activate the event detector of the second read-out circuitry of the plurality of read-out circuitries if the timer circuit is deactivated.

In Example 25a, the subject matter of any one of Examples 23a or 24a can optionally include that a read-out circuitry of the plurality of read-out circuitries is selectively assigned to a respective sensor element and energy storage circuit.

In Example 26a, the subject matter of any one of Examples 1a to 25a can optionally include that the LIDAR Sensor System further includes: a first differentiator configured to determine a first derivative of the analog electrical characteristic, a further event detector configured to provide a further trigger signal if the first derivative of the analog electrical characteristic fulfills a predefined further trigger criterion; a further timer circuit configured to provide a further digital time information; optionally a further analog-to-digital converter configured to convert the actual prevailing electrical voltage signal of the SPAD signal rather the electrical energy stored in the energy storage circuit into a digital first derivative electrical characteristic value; wherein the further event detector is configured to deactivate the further timer circuit and to activate the further analog-to-digital converter depending on the further trigger signal.

In Example 27a, the subject matter of any one of Examples 1a to 26a can optionally include that the LIDAR Sensor System further includes: a second differentiator configured to determine a second derivative of the analog electrical characteristic, a second further event detector configured to provide a second further trigger signal if the second derivative of the analog electrical characteristic fulfills a predefined second further trigger criterion; a second further timer circuit configured to provide a second further digital time information; optionally a second further analog-to-digital converter configured to convert the actual prevailing electrical voltage signal of the SPAD signal rather the electrical energy stored in the energy storage circuit into a digital first derivative electrical characteristic value; wherein the second further event detector is configured to deactivate the second further timer circuit and to activate the second further analog-to-digital converter depending on the second further trigger signal.

Example 28a is a method for operating a LIDAR Sensor System. The method includes storing electrical energy provided by at least one photo diode in an energy storage circuit, a controller controlling a read-out process of the electrical energy stored in the energy storage circuit, an event detector providing a trigger signal if an analog electrical characteristic representing the electrical energy stored in the energy storage circuit fulfills a predefined trigger criterion, a timer circuit providing a digital time information, and an analog-to-digital converter converting the analog electrical characteristic into a digital electrical characteristic value. The event detector is activating or deactivating the timer circuit and the analog-to-digital converter depending on the trigger signal.

In Example 29a, the subject matter of Example 28a can optionally include that the method further comprises activating the event detector if valid event signals are expected and deactivating the event detector if the system is set to a transparent mode for continuous waveform monitoring.

In Example 30a, the subject matter of any one of Examples 28a or 29a can optionally include that the method further comprises activating the event detector if the read-out process is in an active state and deactivating the event detector if the read-out process is in an inactive state.

In Example 31a, the subject matter of any one of Examples 28a to 30a can optionally include that the at least one photo diode includes an avalanche photo diode (APD) and/or a SiPM (Silicon Photomultipliers) and/or a CMOS sensors (Complementary metal-oxide-semiconductor and/or a CCD (Charge-Coupled Device) and/or a stacked multilayer photodiode.

In Example 32a, the subject matter of any one of Examples 28a to 31a can optionally include that the at least one avalanche photo diode includes a single-photon avalanche photo diode (SPAD).

In Example 33a, the subject matter of any one of Examples 28a to 32a can optionally include that the energy storage circuit includes a transimpedance amplifier (TIA).

In Example 34a, the subject matter of Example 33a can optionally include that the transimpedance amplifier includes a memory capacitor storing the electrical voltage provided by the photo diode and providing the electrical current when the read-out process is in the active state.

In Example 35a, the subject matter of any one of Examples 28a to 34a can optionally include that the controller further provides a signal to switch the read-out process into the active state or the inactive state, and to activate or deactivate the event detector accordingly.

In Example 36a, the subject matter of any one of Examples 28a to 35a can optionally include that the method further includes: the event detector determining whether the analog electrical characteristic exceeds or falls below a predefined threshold as the predefined trigger criterion.

In Example 37a, the subject matter of Example 36a can optionally include that the determination includes comparing the electrical voltage read from the energy storage circuit as the analog electrical characteristic with a predefined voltage threshold as the predefined threshold.

In Example 38a, the subject matter of Example 37a can optionally include that the determination includes comparing the electrical voltage read from the energy storage circuit with the predefined voltage threshold.

In Example 39a, the subject matter of any one of Examples 28a to 38a can optionally include that the timer circuit includes a digital counter.

In Example 40a, the subject matter of any one of Examples 28a to 39a can optionally include that the timer circuit includes a time-to-digital converter (TDC).

In Example 41a, the subject matter of any one of Examples 28a to 40a can optionally include that the timer circuit provides the trigger signal to deactivate the timer circuit if the predefined trigger criterion is fulfilled.

In Example 42a, the subject matter of any one of Examples 28a to 41a can optionally include that the timer circuit provides the trigger signal to activate the analog-to-digital converter to convert the electrical voltage read from the energy storage circuit into a digital voltage value if the predefined trigger criterion is fulfilled.

In Example 43a, the subject matter of any one of Examples 28a to 42a can optionally include that the method further includes storing the electrical voltage read from the energy storage circuit in a sample and hold circuit and providing the stored electrical voltage to the analog-to-digital converter.

In Example 44a, the subject matter of any one of Examples 37a to 43a can optionally include that the event detector provides the trigger signal to activate the sample and hold circuit to sample and hold the electrical voltage read from the energy storage circuit if the predefined trigger criterion is fulfilled.

In Example 45a, the subject matter of any one of Examples 28a to 44a can optionally include that the method further includes: a digital processor processing the digital time information and the digital electrical characteristic value.

In Example 46a, the subject matter of Example 45a can optionally include that the digital processor includes a field programmable gate array.

In Example 47a, the subject matter of any one of Examples 45a or 46a can optionally include that the digital processor provides a preprocessing of the digital time information and the digital electrical characteristic value and provides the pre-processing result for a further analysis by another processor.

In Example 48a, the subject matter of any one of Examples 28a to 47a can optionally include that the at least one sensor element and the energy storage circuit are monolithically integrated.

In Example 49a, the subject matter of any one of Examples 28a to 48a can optionally include that the at least one sensor element includes a plurality of sensor elements, and that an energy storage circuit is provided for each sensor element.

In Example 50, the subject matter of Example 49a can optionally include that the at least one read-out circuitry includes a plurality of read-out circuitries.

In Example 51a, the subject matter of Example 50a can optionally include that a first read-out circuitry of the plurality of read-out circuitries provides an activation signal to an event detector of a second read-out circuitry of the plurality of read-out circuitries to activate the event detector of the second read-out circuitry of the plurality of read-out circuitries if the timer circuit is deactivated.

In Example 52a, the subject matter of any one of Examples 50a or 51a can optionally include that a read-out circuitry of the plurality of read-out circuitries is selectively assigned to a respective sensor element and energy storage circuit.

In Example 53a, the subject matter of any one of Examples 28a to 52a can optionally include that the method further includes: determining a first derivative of the analog electrical characteristic, providing a further trigger signal if the first derivative of the analog electrical characteristic fulfills a predefined further trigger criterion; a further timer circuit providing a further digital time information; a further analog-to-digital converter configured to convert the actual prevailing electrical voltage signal of the SPAD signal rather the electrical energy stored in the energy storage circuit into a digital first derivative electrical characteristic value; wherein the further event detector deactivates the further timer circuit and activates the further analog-to-digital converter depending on the further trigger signal.

In Example 54a, the subject matter of any one of Examples 28a to 53a can optionally include that the method further includes: determining a second derivative of the analog electrical characteristic, providing a second further trigger signal if the second derivative of the analog electrical characteristic fulfills a predefined second further trigger criterion; a second further timer circuit providing a second further digital time information; a second further analog-to-digital converter configured to convert the actual prevailing electrical voltage signal of the SPAD signal rather the electrical energy stored in the energy storage circuit into a digital first derivative electrical characteristic value; wherein the second further event detector deactivates the second further timer circuit and activates the second further analog-to-digital converter depending on the second further trigger signal.

Example 55a is a computer program product. The computer program product includes a plurality of program instructions that may be embodied in non-transitory computer readable medium, which when executed by a computer program device of a LIDAR Sensor System according to any one of Examples 1a to 27a, cause the Controlled LIDAR Sensor System to execute the method according to any one of the Examples 28a to 54a.

Example 56a is a data storage device with a computer program that may be embodied in non-transitory computer readable medium, adapted to execute at least one of a method for LIDAR Sensor System according to any one of the above method Examples, an LIDAR Sensor System according to any one of the above Controlled LIDAR Sensor System Examples.

A scanning LIDAR Sensor System based on a scanning mirror beam steering method needs to employ a rather small-sized laser deflection mirror system in order to reach a high oscillation frequency, resulting in a high image frame rate and/or resolution. On the other hand, it also needs to employ a sensor surface and a sensor aperture that is as large as possible in order to collect as much as possible the back-scattered LIDAR laser pulses, thus leading to contradiction if the same optics as for the emission path is to be used. This can at least partially be overcome by employing a pixelated sensor detection system. It may be advantageous to use a Silicon-Photomultiplier (SiPM)-Array and multiplex the pixel readouts of each row and column. Multiplexing further allows combining multiple adjacent to and/or non-adjacent sensor pixels in groups and measuring their combined time-resolved sensor signal. Furthermore, depending on the angular position of the mirror (MEMS) or another suitable beam deflection or steering device, an FPGA, ASIC or other kind of electronic control unit is programmed to select which of the sensor pixels will be read out and/or what combination of is pixels of the pixel array is/are best suited regarding detection sensitivity and angular signal information. This multiplexing method also allows measurement of back-scattered laser pulses from one or more objects that have different distances to the LIDAR Sensor System within the same or different measurement time periods, of object surface reflectivity corresponding to signal strength, and of object surface roughness that is correlated with pulse width and/or pulse form distribution. The method can also be used in combination with other beam deflecting or steering systems, like Spatial Light Modulator (SLM), Optical Phased Array (OPA), Fiber-based laser scanning, or a VCSEL-array employing functions of an Optical Phased Array.

One problem in the context of a (scanning) LIDAR sensor may be seen in that the size of the deflection mirror configured to deflect the emission beam should be designed as small as possible in order to achieve a high oscillation frequency of the deflection mirror due to the moment of inertia of the deflection mirror. However, in order to achieve a good Signal-to-Noise Ratio (SNR) and consequently a large maximum detection range, the light reflected from the target object (e.g. object 100) should be collected via a large receiver optics. Using the same scan mirror for receiving the light as for sending it out ensures that the receiver detects only the illuminated region of the target object and that background light from other non-illuminated regions of the target object and/or coming from other areas of the Field-of-View (FoV), does not impinge on the sensor which would otherwise decrease the signal-to-noise ratio. While a maximum detection range might require a large receiver aperture, in a setup with a shared send/receive mirror this contradicts the above desire for a small deflection mirror for the emission beam.

There are several possible conventional approaches to meet the above described goals.

A large deflection mirror resulting in a rather low scan/image rate but a rather large detection range. An implementation of such a scanning mirror, for example into a 360°-rotating LIDAR system, may be disadvantageous in view of its mechanical robustness.

A small deflection mirror and an optical arrangement which detects the entire field of view of the beam deflection at the same time. This may result in a rather high scan/image rate but a rather small detection range, since the background light of the entire field of view is collected in this case. Furthermore, such an optical arrangement is in principle not efficient.

A combination of a small deflection mirror with a single-photon photo diode (e.g. a single-photon avalanche photo diode, SPAD) detector array with microlenses may be provided. A separate time measurement exists for each photo diode, however, the angular resolution is usually limited due to the number of rows and columns of the detector array. Moreover, the Signal-to-Noise Ratio (SNR) may be low during the detection due to the single-photon principle and it may be difficult to perform a sufficiently acceptable analysis of the received signal waveform.

A combination of a small deflection mirror with an SPAD detector array may be provided such that the received laser beam is spreaded over a plurality of SPAD pixels (e.g. by means of controlled defocussing of the receiver optics) and this time measurement of a plurality of pixels may be used for the detection process. In this case, the angular information may be determined using the position of the deflection mirror.

In various embodiments, a combination of a small deflection mirror or any other well-suited beam steering arrangement with a silicon photo multiplier (SiPM) detector array is provided (having the same optical path or separate optical paths). The output signals provided by those SiPM pixels of the sensor 52 of the second LIDAR sensing system 50 onto which the light beam reflected by the target object (e.g. object 100) impinges may then be combined with each other, at least in some time intervals (e.g. by one or more multiplexers, e.g. by a row multiplexer and a column multiplexer) and will then be forwarded to an amplifier, as will be described in more detail further below. Depending on the number of pixels in the SiPM detector array, which are covered by the light spot, for example one, two, or four pixels may be connected together for its evaluation. It is to be noted that, in general, any number of pixels in the SiPM detector array may be connected together depending inter alia on the size and coverage of the pixels in the SiPM detector array by the light spot. The sensor controller 53 (e.g. implemented as a controller FPGA) may determine the pixel or pixels of the SiPM detector array which should be selected for sensor signal read out and evaluation. This may be performed taking into consideration the angular information about the beam deflection. All other pixels (i.e. those pixels which are not selected) will either not be read out or e.g. will not even be provided with operating voltage.

The provision of the SiPM detector array in combination with a multiplexer system not only allows to register the impinging of single photons, but even to process the progression over time of the optical pulse detected by the SiPM detector array. This may be implemented by analog electronics circuitry configured to generate a trigger signal to be supplied to a time-to-digital converter (TDC). As an alternative, the voltage signal representing the optical pulse provided by an amplifier (e.g. a transimpedance amplifier) may be digitized by an analog-to-digital converter (ADC) and then may be analyzed using digital signal processing. The capabilities of the digital signal processing may be used to implement a higher distance measurement accuracy. Furthermore, a detection of a plurality of optical pulses at the receiver for exactly one emitted laser pulse train may be provided, e.g. in case the emitted laser pulse train hits a plurality of objects which are located at a distance from each other resulting in different light times of flight (ToFs) for the individual reflections. Various embodiments may allow the measurement of the intensity of the laser pulse reflected by the target object and thus may allow the determination of the reflectivity of the surface of the target object. Furthermore, the pulse waveform may be analyzed so that secondary parameters like the unevenness of the object surface may be derived therefrom. Due to the separation of the transmitter optics from the receiver optics, while at the same time enabling suppression of background light from unilluminated areas of the scene, the LIDAR sensor system may in principle achieve a high scanning speed and a large detection range at the same time. An optional configuration of a SiPM pixel of the SiPM detector array including a plurality of individual SPADs connected in parallel furthermore allows to compensate for a deviation of the characteristics from one pixel to the next pixel due to manufacturing variances. As an alternative to a beam deflection based on a micromirror (also referred to as MEMS mirror), a beam deflection based on a spatial light modulator, a (e.g. passive) optical phased array, a fiber-based scanning device, or a VCSEL emitter array (e.g. implemented as an optical phased array) may be provided.

Figure 26:
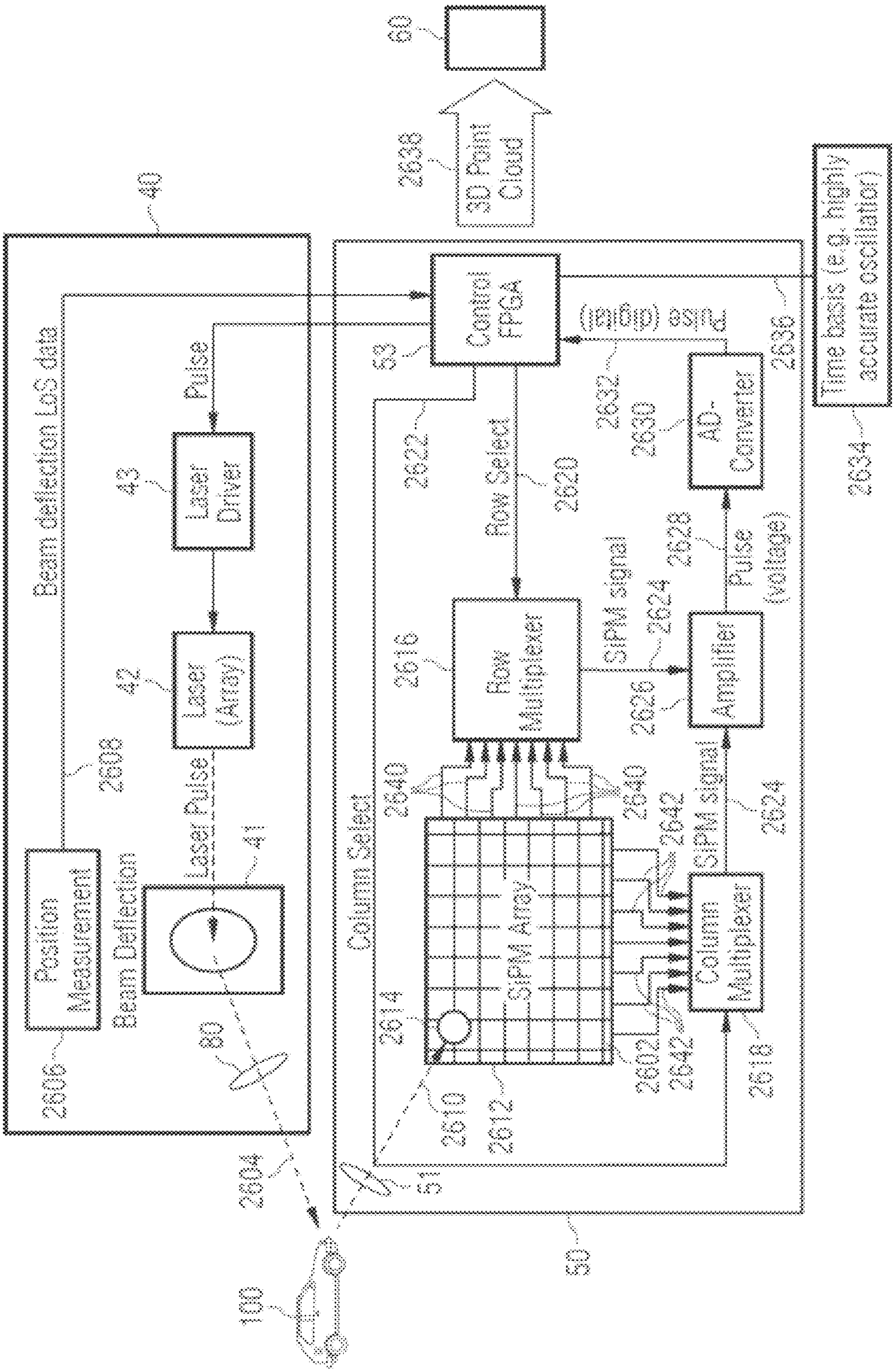
FIG. 26 shows a portion of the LIDAR Sensor System in accordance with various embodiments.

FIG. 26 shows a portion of the LIDAR Sensor System 10 in accordance with various embodiments.

The LIDAR sensor system 10 includes the first LIDAR sensing system 40 and the second LIDAR sensing system 50.

The first LIDAR sensing system 40 may include the one or more light sources 42 (e.g. one or more lasers 42, e.g. arranged in a laser array). Furthermore, a light source driver 43 (e.g. a laser driver) may be configured to control the one or more light sources 42 to emit one or more light pulses (e.g. one or more laser pulses). The sensor controller 53 may be configured to control the light source driver 43. The one or more light sources 42 may be configured to emit a substantially constant light waveform or a varying (modulated) waveform. The waveform may be modulated in its amplitude (modulation in amplitude) and/or pulse length (modulation in time) and/or in the length of time between two succeeding light pulses. The use of different modulation patterns (which should be unique) for different light sources 42 may be provided to allow a receiver to distinguish the different light sources 42 by adding the information about the light generating light source 42 as identification information to the modulation scheme. Thus, when the receiver demodulates the received sensor signals, it receives the information about the light source which has generated and emitted the received one or more light (e.g. laser) pulses. In various embodiments, the first LIDAR sensing system 40 may be configured as a scanning LIDAR sensing system and may thus include a light scanner with an actuator for beam steering and control 41 including one or more scanning optics having one or more deflection mirrors 80 to scan a predetermined scene. The actuator for beam steering and control 41 actuates the one or more deflection mirrors 80 in accordance with a scanning control program carried out by the actuator for beam steering and control 41. The light (e.g. a train of laser pulses (modulated or not modulated) emitted by the one or more light sources 42 will be deflected by the deflection mirror 80 and then emitted out of the first LIDAR sensing system 40 as an emitted light (e.g. laser) pulse train 2604. The first LIDAR sensing system 40 may further include a position measurement circuit 2606 configured to measure the position of the deflection mirror 80 at a specific time. The measured mirror position data may be transmitted by the first LIDAR sensing system 40 as beam deflection angular data 2608 to the sensor controller 53.

The photo diode selector (e.g. the sensor controller 53) may be configured to control the at least one row multiplexer and the at least one column multiplexer to select a plurality of photo diodes (e.g. a plurality of photo diodes of one row and a plurality of photo diodes of one column) of the silicon photo multiplier array to be at least at some time commonly evaluated during a read-out process based on the angular information of beam deflection applied to light emitted by a light source of an associated LIDAR Sensor System (e.g. based on the supplied beam deflection angular data).

If the emitted light (e.g. laser) pulse 2604 hits an object with a reflective surface (e.g. object 100), the emitted light (e.g. laser) pulse 2604 is reflected by the surface of the object (e.g. object 100) and a reflected light (e.g. laser) pulse 2610 may be received by the second LIDAR sensing system 50 via the detection optic 51. It is to be noted that the reflected light pulse 2610 may further include scattering portions. Furthermore, it is to be noted that the one or more deflection mirrors 80 and the detection optic 51 may be one single optics or they may be implemented in separate optical systems.

The reflected light (e.g. laser) pulse 2610 may then impinge on the surface of one or more sensor pixels (also referred to as one or more pixels) 2602 of the SiPM detector array 2612. The SiPM detector array 2612 includes a plurality of sensor pixels and thus a plurality of photo diodes (e.g. avalanche photo diodes, e.g. single-photon avalanche photo diodes) arranged in a plurality of rows and a plurality of columns within the SiPM detector array 2612. In various embodiments, it is assumed that the reflected light (e.g. laser) pulse 2610 hits a plurality of adjacent sensor pixels 2602 (symbolized by a circle 2614 in FIG. 26) as will be described in more detail below. One or more multiplexers such as a row multiplexer 2616 and a column multiplexer 2618 may be provided to select one or more rows (by the row multiplexer 2616) and one or more columns (by the column multiplexer 2618) of the SiPM detector array 2612 to read out one or more sensor pixels during a read out process. The sensor controller 53 (which in various embodiments may operate as a photo diode selector; it is to be noted that the photo diode selector may also be implemented by another individual circuit that controls the read out process to read out sensor signal(s) provided by the selected sensor pixels 2602 of the SiPM detector array 2612. By way of example, the sensor controller 53 applies a row select signal 2620 to the row multiplexer 2616 to select one or more rows (and thus the sensor pixels connected to the one or more rows) of the SiPM detector array 2612 and a column select signal 2622 to the column multiplexer 2618 to select one or more columns (and thus the sensor pixels connected to the one or more columns) of the SiPM detector array 2612. Thus, the sensor controller 53 selects those sensor pixels 2602 which are connected to the selected one or more rows and to the selected one or more columns. The sensor signals (also referred to as SiPM signals) 2624 detected by the selected sensor pixels 2602 are supplied to one or more amplifiers (e.g. one or more transimpedance amplifiers, TIA) 2626 which provide one or more corresponding voltage signals (e.g. one or more voltage pulses) 2628. Illustratively, the one or more amplifiers 2626 may be configured to amplify a signal (e.g. the SiPM signals 2624) provided by the selected plurality of photo diodes of the silicon photo multiplier array 2612 to be at least at some time commonly evaluated during the read-out process. An analog-to-digital converter (ADC) 2630 is configured to convert the supplied voltage signals 2628 into digitized voltage values (e.g. digital voltage pulse values) 2632. The ADC 2630 transmits the digitized voltage values 2632 to the sensor controller 53. Illustratively, the photo diode selector (e.g. the sensor controller 53) is configured to control the at least one row multiplexer 2616 and the at least one column multiplexer 2618 to select a plurality of photo diodes 2602 of the silicon photo multiplier array 2612 to be at least at some time commonly evaluated during a read-out process, e.g. by the LIDAR Data Processing System 60.

Furthermore, a highly accurate oscillator 2634 may be provided to supply the sensor controller with a highly accurate time basis clock signal 2636.

The sensor controller 53 receives the digitized voltage values 2632 and forwards the same individually or partially or completely collected over a predetermined time period as dataset 2638 to the LIDAR Data Processing System 60.

Figure 27:
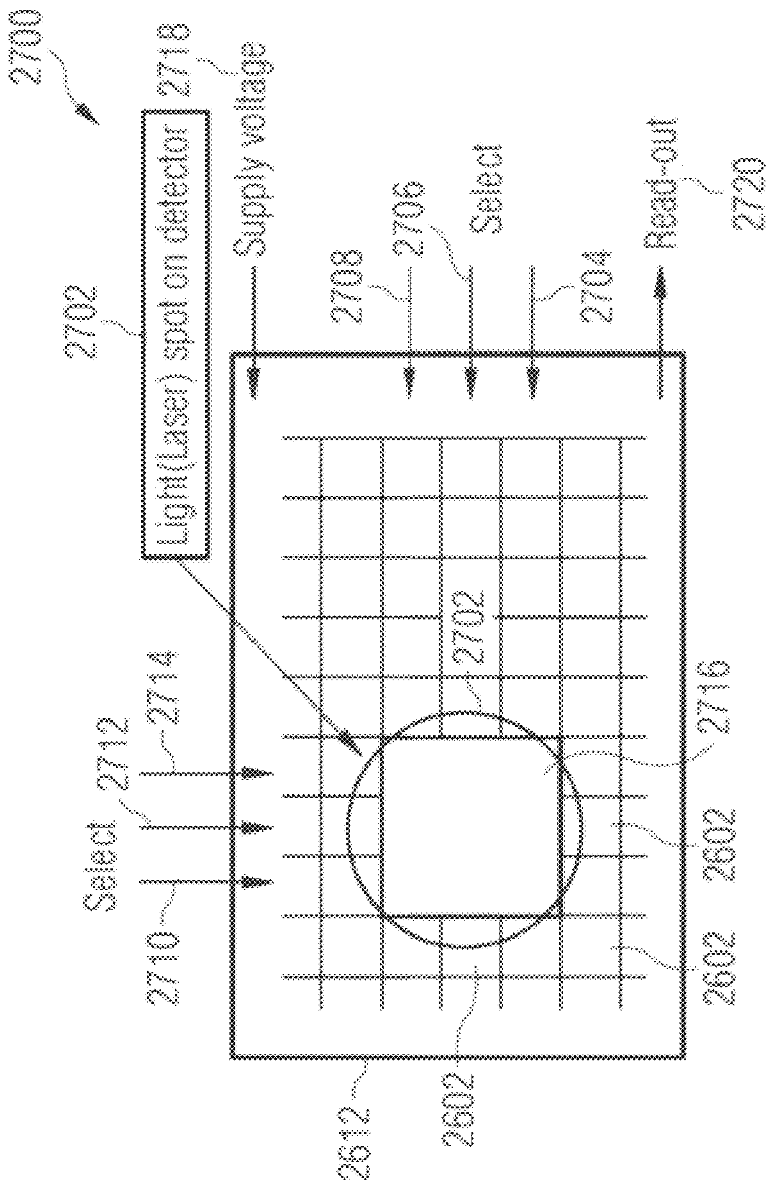
FIG. 27 shows a portion of a surface of a sensor in accordance with various embodiments.

FIG. 27 shows a portion 2700 of a surface of the SiPM detector array 2612 in accordance with various embodiments. A light (laser) spot 2702 impinging on the surface of the portion 2700 of the SiPM detector array 2612 is symbolized in FIG. 27 by a circle 2702. The light (laser) spot 2702 covers a plurality of sensor pixels 2602. The row multiplexer 2616 applies a plurality of row select signals 2704, 2706, 2708 (the number of row select signals may be equal to the number of rows of the SiPM detector array 2612) to select the sensor pixels of the respectively selected row. The column multiplexer 2618 applies a plurality of column select signals 2710, 2712, 2714 (the number of column select signals may be equal to the number of columns of the SiPM detector array 2612) to select the sensor pixels of the respectively selected column. FIG. 27 illustrates nine selected sensor pixels 2716 selected by the plurality of row select signals 2704, 2706, 2708 and the plurality of column select signals 2710, 2712, 2714. The light (laser) spot 2702 covers the nine selected sensor pixels 2716. Furthermore, the sensor controller 53 may provide a supply voltage 2718 to the SiPM detector array 2612. The sensor signals 2720 provided by the selected sensor pixels 2716 are read out from the SiPM detector array 2612 and supplied to the one or more amplifiers 2626 via the multiplexers 2616, 2618. In general, the number of selected sensor pixels 2716 may be arbitrary, e.g. up to 100, more than 100, 1000, more than 1000, 10.000, more than 10.000. The size and/or shape of each sensor pixel 2602 may also vary. The size of each sensor pixel 2602 may be in the range from about 1 μm to about 1000 μm, or in the range from about 5 μm to about 50 μm. The laser spot 2702 may cover an area of, for example, 4 to 9 pixels 2716, but could be, depending on pixel size and laser spot diameter, up to approximately 100 pixels.

The individual selectability of each sensor pixel 2602 in a manner comparable with a selection mechanism of memory cells in a Dynamic Random Access Memory (DRAM) allows a simple and thus cost efficient sensor circuit architecture to quickly and reliably select one or more sensor pixels 2602 to obtain an evaluation of a plurality of sensor pixels at the same time. This may improve the reliability of the sensor signal evaluation of the second LIDAR sensor system 50.

Figure 28:
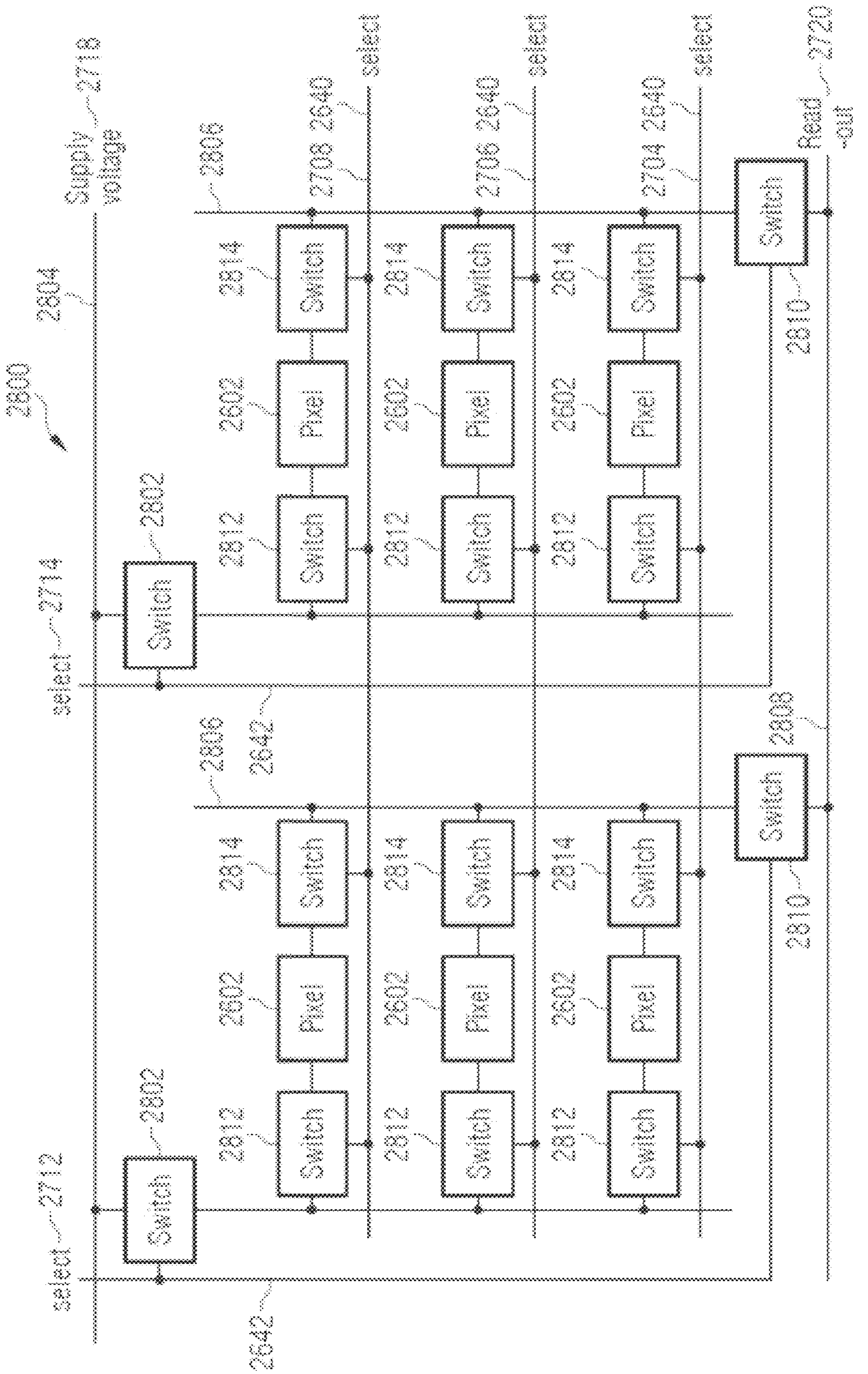
FIG. 28 shows a portion of an SiPM detector array in accordance with various embodiments.

FIG. 28 shows a portion 2800 of the SiPM detector array 2612 in accordance with various embodiments.

The SiPM detector array 2612 may include a plurality of row selection lines 2640, each row selection line 2640 being coupled to an input of the row multiplexer 2616. The SiPM detector array 2612 may further include a plurality of column selection lines 2642, each column selection line 2642 being coupled to an input of the column multiplexer 2618. A respective column switch 2802 is coupled to respectively to one of the column selection lines 2642 and is connected to couple the electrical supply voltage present on a supply voltage line 2804 to the sensor pixels coupled to the respective column selection line 2642 or to decouple the electrical supply voltage therefrom. Each sensor pixel 2602 may be coupled to a column read out line 2806, which is in turn coupled to a collection read out line 2808 via a respective column read out switch 2810. The column read out switches 2810 may be part of the column multiplexer 2618. The sum of the current of the selected sensor pixels, in other words the sensor signals 2720, may be provided on the read out line 2808. Each sensor pixel 2602 may further be coupled downstream of an associated column selection line 2642 via a respective column pixel switch 2812 (in other words, a respective column pixel switch 2812 is connected between a respective associated column selection line 2642 and an associated sensor pixel 2602). Moreover, each sensor pixel 2602 may further be coupled upstream of an associated column read out line 2806 via a respective column pixel read out switch 2814 (in other words, a respective column pixel read out switch 2814 is connected between a respective associated column read out line 2806 and an associated sensor pixel 2602). Each switch in the SiPM detector array 2612 may be implemented by a transistor such as a field effect transistor (FET), e.g. a MOSFET. A control input (e.g. the gate terminal of a MOSFET) of each column pixel switch 2812 and of each column pixel read out switch 2814 may be electrically conductively coupled to an associated one of the plurality of row selection lines 2640. Thus, the row multiplexer 2616 "activates" the column pixel switches 2812 and the pixel read out switches 2814 via an associated row selection line 2640. In case a respective column pixel switch 2812 and the associated pixel read out switch 2814 are activated, the associated column switch 2802 finally activates the respective sensor pixel by applying the supply voltage 2718 e.g. to the source of the MOSFET and (since e.g. the associated column pixel switch 2812 is closed), the supply voltage is also applied to the respective sensor pixel. A sensor signal detected by the "activated" selected sensor pixel 2602 can be forwarded to the associated column read out line 2806 (since e.g. the associated column pixel read out switch 2814 is also closed), and, if also the associated column read out switch 2810 is closed, the respective sensor signal is transmitted to the read out line 2808 and finally to an associated amplifier (such as an associated TIA) 2626.

Figures 29A, 29B, 29C:
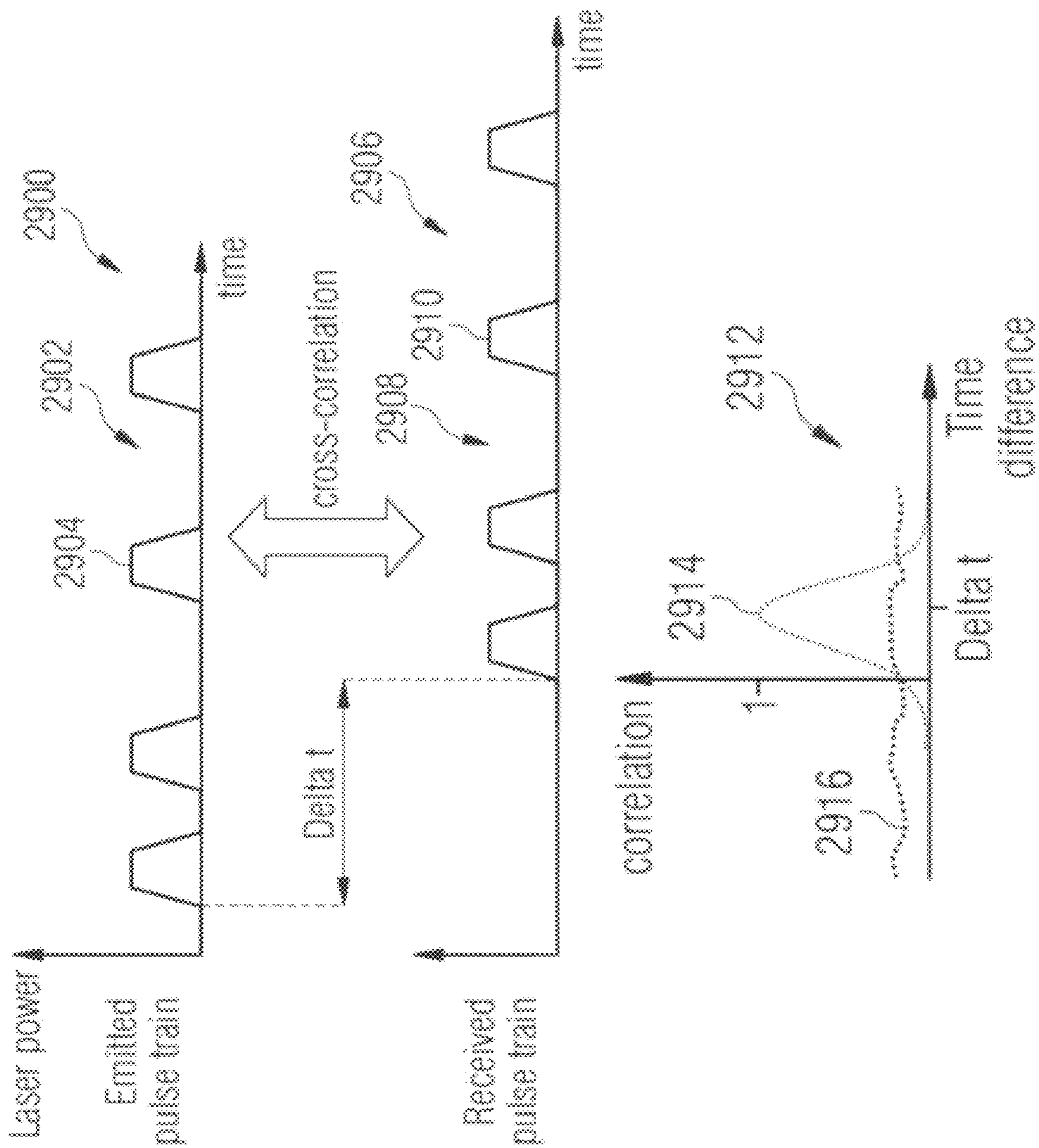
FIGS. 29A to 29C show an emitted pulse train emitted by the First LIDAR Sensing System (FIG. 29A), a received pulse train received by the Second LIDAR Sensing System (FIG. 29B) and a diagram illustrating a cross-correlation function for the emitted pulse train and the received pulse train (FIG. 29C) in accordance with various embodiments.

FIGS. 29A to 29C show an emitted pulse train emitted by the First LIDAR Sensing System (FIG. 29A), a received pulse train received by the Second LIDAR Sensing System (FIG. 29B) and a diagram illustrating a cross-correlation function for the emitted pulse train and the received pulse train (FIG. 29C) in accordance with various embodiments. This cross-correlation function is equivalent to the cross-correlation of a signal with itself.

It should be noted that the cross-correlation aspects of this disclosure may be provided as independent embodiments (i.e. independent from the selection and combination of a plurality of sensor pixels for a common signal evaluation, for example) or in combination with the above-described aspects.

FIG. 29A shows an emitted laser pulse train 2902 including a plurality of laser pulses 2904 in a first laser output power vs. time diagram 2900 as one example of the emitted light (e.g. laser) pulse 2604.

As described above, the light source (e.g. the laser array 42) may emit a plurality of (modulated or unmodulated) laser pulses 2904, which may be received (in other words detected) by the SiPM detector array 2612. A received laser pulse train 2908 including a plurality of laser pulses 2910 in a second laser power/time diagram 2906 as one example of the reflected light (e.g. laser) pulse 2610 is shown in FIG. 29B. As illustrated in FIG. 29A and FIG. 29B, the received laser pulse train 2908 may be very similar (depending on the transmission channel conditions) to the emitted laser pulse train 2902, but may be shifted in time (e.g. received with a latency Δt). In various embodiments, the LIDAR Data Processing System 60, e.g. the FPGA 61 or the host processor 62 may determine a respectively received laser pulse train 2908 by applying a cross-correlation function to the received sensor signals (e.g. to the received digital voltage values) and the emitted laser pulse train 2902. A received laser pulse of the respectively received laser pulse train 2908 is identified if a determined cross-correlation value exceeds a predefined threshold value, which may be selected based on experiments during a calibration phase. FIG. 29C shows two cross-correlation functions 2914, 2916 in a cross-correlation diagram 2912. A first cross-correlation function 2914 shows a high correlation under ideal circumstances. The correlation peak at time difference Δt may in various embodiments be equivalent to the time-of-flight and thus to the distance of the object 100. Furthermore, a second cross-correlation function 2916 shows only very low cross-correlation values which indicates that the received laser pulse train 2908 in this case is very different from the "compared" emitted laser pulse train 2902. This may be due to a very bad transmission channel or due to the fact that the received sensor signals do not belong to the emitted laser pulse train 2902. In other words, only a very low or even no correlation can be determined for received sensor signals which do not belong to the assumed or compared emitted laser pulse train 2902. Thus, in various embodiments, a plurality of light (e.g. laser) sources 42 may emit laser pulse trains with different (e.g. unique) time and/or amplitude encoding (in other words modulation). Thus, it is ensured that the SiPM detector array 2612 and the LIDAR Data Processing System 60, e.g. the FPGA 61 or the host processor 62, can reliably identify received light pulse trains (e.g. laser pulse trains) and the corresponding emitting light (e.g. laser) source 42 and the respectively emitted light pulse train (e.g. emitted laser pulse train 2902).

Thus, in various embodiments, the second LIDAR Sensor System 50 may be coupled to a cross-correlation circuit (which may be implemented by the FPGA 61, the host processor 62 or an individual circuit, e.g. an individual processor) configured to apply a cross-correlation function to a first signal and a second signal. The first signal represents a signal emitted by a light source, and the second signal is a signal provided by at least one photo diode of a plurality of photo diodes (which may be part of an SiPM detector array (e.g. SiPM detector array 2612). A time difference between the first signal and the second signal indicated by the resulting cross-correlation function may be determined as a time-of-flight value if the determined cross-correlation value for the first signal and the second signal at the time difference is equal to or exceeds a predefined cross-correlation threshold.

Figure 30:
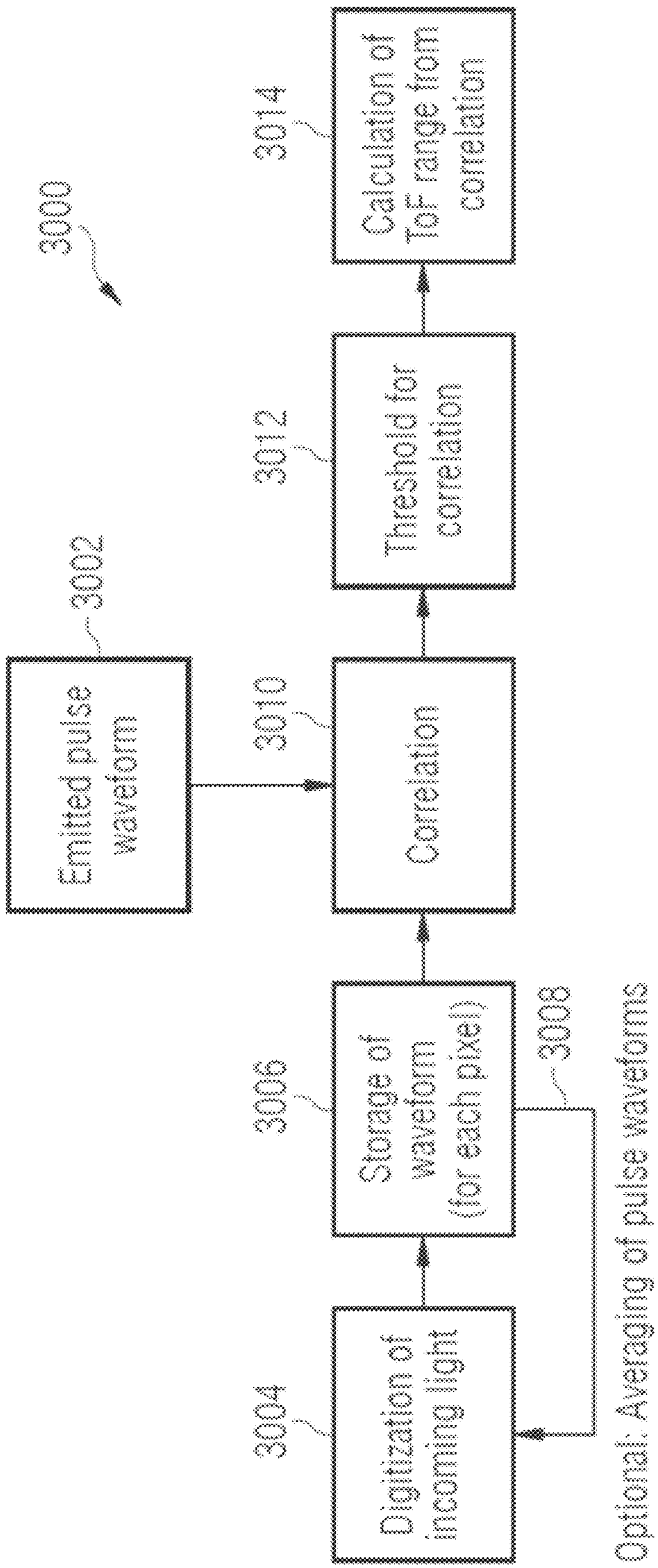
FIG. 30 shows a block diagram illustrating a method in accordance with various embodiments.

FIG. 30 shows a block diagram illustrating a method, e.g. the previously described cross-correlation method 3000 in accordance with various embodiments in more detail.

As shown in FIG. 30 and as described above, in 3002, one or more light (e.g. laser) sources 42 may emit a pulse waveform, which may include a plurality of light (e.g. laser) pulses (e.g. 80).

In various embodiments, various options for the origin of the emitted pulse reference waveform may be provided, such as:

a) the emitted pulse waveform may be generated by a LIDAR electrooptic simulation model at design time (in this case, a simulation model may be provided, which mathematically models the electrical and optical components of the light (e.g. laser) source—the LIDAR pulses would then not be measured but simulated using the device parameters);

b) the emitted pulse waveform may be generated by a LIDAR electrooptic simulation model, modified using calibration values for each LIDAR sensor gathered during production;

c) similar to b), with a modification of internal housekeeping parameters (such as e.g. temperature, laser aging);

d) the emitted pulse waveform may be recorded during the production of an individual LIDAR unit;

e) similar to d), with a modification of internal housekeeping parameters (such as e.g. temperature, laser aging);

f) the emitted pulse waveform may be determined from actual light emitted, measured e.g. using a monitor photodiode in the emitter path; and/or g) the emitted pulse waveform may be determined from actual light emitted, measured e.g. on the actual detector using a coupling device (mirror, optical fiber, . . . ).

It should be noted that the emitted pulse waveform of the emitted light pulse train may be generated based on a theoretical model or based on a measurement.

As described above, in 3004, the second LIDAR Sensor System 50 may digitize the incoming light, more accurately, the light detected by the sensor pixels 2602, e.g. by the SiPM detector array 2612 and may store the digital (e.g. voltage) values in a memory (not shown) of the second LIDAR Sensor System or the digital backend in 3006. Thus, a digital representation of the received waveform is stored in the memory, e.g. for each (e.g. selected) sensor pixel 2602. As an option, a suitable averaging of the received and digitized pulse waveforms may be provided in 3008.

Then, in 3010, a correlation process may be performed, e.g. by the digital backend on the stored digital waveforms. The correlation process may include applying a cross-correlation function to the stored (received) digital waveforms and the corresponding emitted pulse waveform. Furthermore, in 3012, it may be determined as to whether the calculated cross-correlation value(s) exceed a predefined threshold for correlation. In case the calculated cross-correlation value(s) exceed the threshold for correlation, then, in 3014, the ToF value (range) may be calculated from the calculated cross-correlation value(s) as described above.

Figures 31A, 31B:
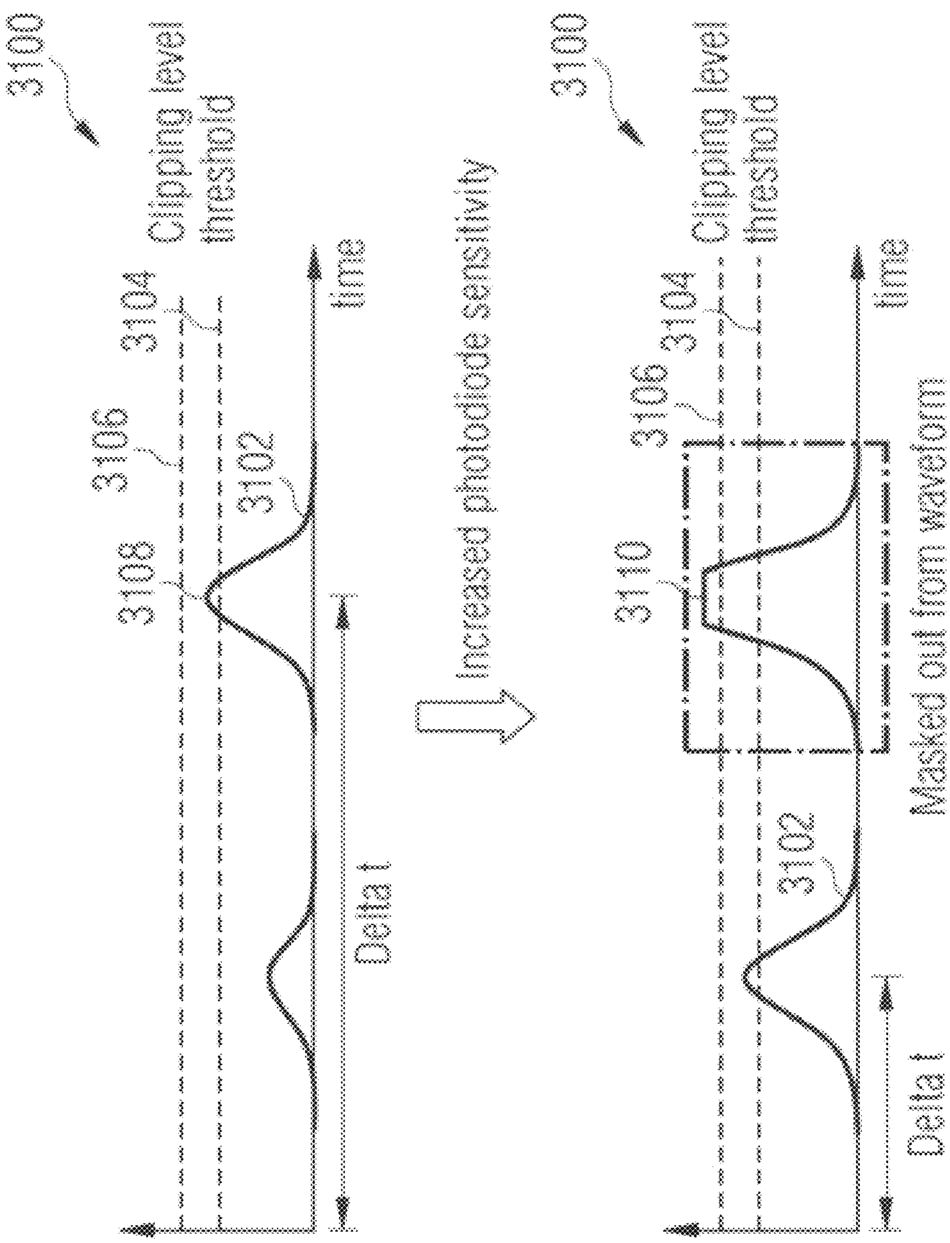
FIGS. 31A and 31B show time diagrams illustrating a method in accordance with various embodiments.
Figure 32:
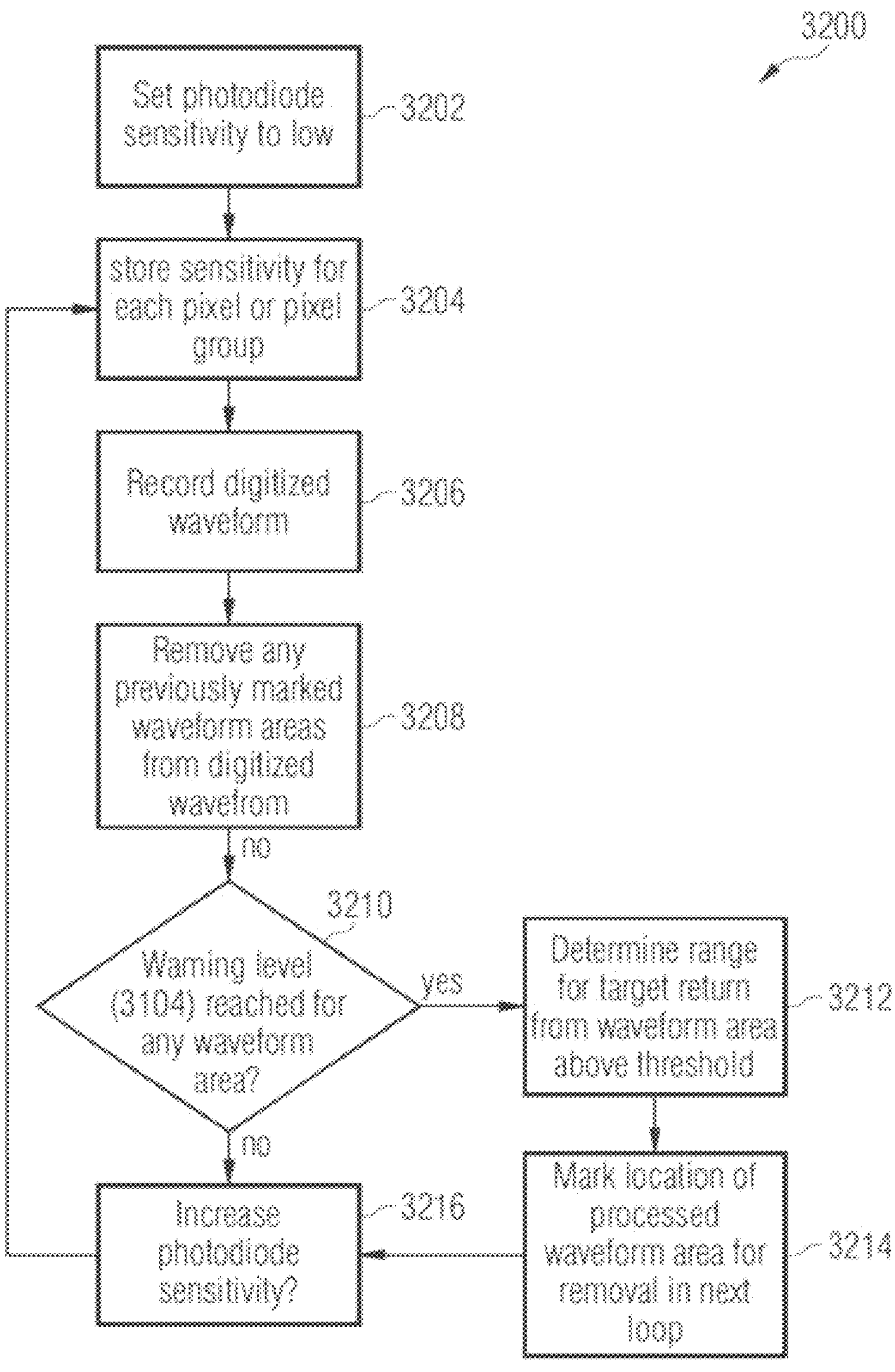
FIG. 32 shows a flow diagram illustrating a method in accordance with various embodiments.

FIGS. 31A and 31B show time diagrams illustrating a method in accordance with various embodiments. FIG. 32 shows a flow diagram 3200 illustrating a method in accordance with various embodiments.

It should be noted that the aspects of this disclosure may be provided as independent embodiments (i.e. independent from the selection and combination of a plurality of sensor pixels for a common signal evaluation and/or independent from the cross-correlation aspects, for example) or in combination with the above-described aspects.

Reference is now made to FIG. 31A which shows a portion of an exemplary sensor signal 3102 provided by one or more sensor pixels 2602 of the SiPM detector array 2612 in a signal intensity/time diagram 3100. Furthermore, a sensitivity warning threshold 3104 and a signal clipping level 3106 are provided. The signal clipping level 3106 may be higher than the sensitivity warning threshold 3104. In the example shown in FIG. 31A, a first portion 3108 of the sensor signal 3102 has a signal energy (or amplitude) higher than the sensitivity warning threshold 3104 and lower than the signal clipping level 3106. As will be explained in more detail below, this may result in triggering e.g. the sensor controller 53, to increase the sensitivity of the photo diode(s) in the detector array.

Referring now to FIG. 31B which shows the portion of the exemplary sensor signal 3102 provided by the one or more sensor pixels 2602, e.g. by one or more sensor pixels of the SiPM detector array 2612 in the signal energy/time diagram 3100. FIG. 31B shows the same portion as FIG. 31A, however, changed by an increased sensitivity of the photo diode and clipping. In the example shown in FIG. 31B, a second portion 3110 of the sensor signal 3102 has a signal energy (or amplitude) higher than the sensitivity warning threshold 3104 and also higher than the signal clipping level 3106. As will be explained in more detail below, this may result in triggering e.g. the sensor controller 53, to stop increasing the sensitivity of the photo diode with respect to this second portion from the analysed waveform in the detection process. This process allows a more reliable detection scheme in the LIDAR detection process.

FIG. 32 shows the method in a flow diagram 3200 in more detail. The method may be performed by the sensor controller 53 or any other desired correspondingly configured logic.

In 3202, the sensor controller 53 may set the photo diode(s) to an initial (e.g. low or lowest possible) sensitivity, which may be predefined, e.g. during a calibration phase. The sensitivity may be set differently for each photo diode or for different groups of photo diodes. As an alternative, all photo diodes could be assigned with the same sensitivity. Furthermore, in 3204, the sensitivity set for a sensor (in other words sensor pixel) or for a sensor group (in other words sensor pixel group) may be stored for each sensor or sensor group as corresponding sensitivity value(s). Then, in 3206, a digital waveform may be recorded from the received digital sensor (voltage) values from a selected sensor pixel (e.g. 2602). Moreover, in 3208, any area or portion of the digital waveform may have been subjected to a stop of an increase of sensitivity of the associated photo diode when the signal was equal to or exceeded the predefined sensitivity warning threshold 3104 in a previous iteration. Such an area or portion (which may also be referred to as marked area or marked portion) may be removed from the digitized waveform. Then, in 3210, the method checks whether any area or portion of the (not yet marked) digital waveform reaches or exceeds the sensitivity warning threshold 3104. If it is determined that an area or portion of the (not yet marked) digital waveform reaches or exceeds the sensitivity warning threshold 3104 ("Yes" in 3210), the method continues in 3212 by determining a range for a target return from the waveform area which reaches or exceeds the sensitivity warning threshold 3104. Then, in 3214, the method further includes marking the location (i.e. area or region) of the processed digitized waveform for a removal in 3208 of the next iteration of the method. Moreover, the method further includes, in 3216, increasing the sensitivity of the photo diode(s). Then, the method continues in a next iteration in 3204. If it is determined that no area or portion of the (not yet marked) digital waveform reaches or exceeds the sensitivity warning threshold 3104 ("No" in 3210), the method continues in 3216.

Illustratively, in various embodiments, the sensitivity of one or more photo diodes will iteratively be increased until a predetermined threshold (also referred to as sensitivity warning threshold) is reached or exceeded. The predetermined threshold is lower than the clipping level so that the signals may still be well represented/scanned. Those regions of the waveform which exceed the predetermined threshold will not be considered anymore at future measurements with further increased sensitivity. Alternatively, those regions of the waveform which exceed the predetermined threshold may be extrapolated mathematically, since those regions would reach or exceed the clipping level.

In various embodiments, the signal may be averaged with a factor depending on photo diode sensitivity. Regions of the signal to which clipping is applied will not be added to the averaging anymore.

In various embodiments, the LIDAR sensor system as described with reference to FIG. 26 to FIG. 32 may, in addition or as an alternative to the increase of the sensitivity of the plurality of photo diodes, be configured to control the emission power of the light source (e.g. the emission power of the laser light source).

In the following, various aspects of this disclosure will be illustrated:

Example 1 b is a LIDAR Sensor System. The LIDAR Sensor System includes a silicon photo multiplier array including a plurality of photo diodes arranged in a plurality of rows and a plurality of columns, at least one row multiplexer upstream coupled to the photo diodes arranged in the plurality of rows, at least one column multiplexer upstream coupled to the photo diodes arranged in the plurality of columns, and a photo diode selector configured to control the at least one row multiplexer and the at least one column multiplexer to select a plurality of photo diodes of the silicon photo multiplier array to be at least at some time commonly evaluated during a read-out process.

In Example 2b, the subject matter of Example 1b can optionally include that at least some photo diodes of the plurality of photo diodes are avalanche photo diodes.

In Example 3b, the subject matter of any one of Examples 1b or 2b can optionally include that at least some avalanche photo diodes of the plurality of photo diodes are single-photon avalanche photo diodes.

In Example 4b, the subject matter of any one of Examples 1b to 3b can optionally include that the photo diode selector is further configured to control the at least one row multiplexer and the at least one column multiplexer to select a plurality of photo diodes of the silicon photo multiplier array to be at least at some time commonly evaluated during a read-out process based on an angle information of beam deflection applied to light emitted by a light source of an associated LIDAR Sensor System.

In Example 5b, the subject matter of any one of Examples 1b to 4b can optionally include that the photo diode selector is further configured to control the at least one row multiplexer and the at least one column multiplexer to select a plurality of photo diodes of one row and a plurality of photo diodes of one column to be at least at some time commonly evaluated during a read-out process based on an angle information of beam deflection applied to light emitted by a light source of an associated LIDAR Sensor System.

In Example 6b, the subject matter of any one of Examples 1b to 5b can optionally include that the LIDAR Sensor System further includes an amplifier configured to amplify a signal provided by the selected plurality of photo diodes of the silicon photo multiplier array to be at least at some time commonly evaluated during the read-out process.

In Example 7b, the subject matter of Example 6b can optionally include that the amplifier is a transimpedance amplifier.

In Example 8b, the subject matter of any one of Examples 6b or 7b can optionally include that the LIDAR Sensor System further includes an analog-to-digital converter coupled downstream of the amplifier to convert an analog signal provided by the amplifier into a digitized signal.

In Example 9b, the subject matter of any one of Examples 1b to 8b can optionally include that the LIDAR Sensor System further includes a cross-correlation circuit configured to apply a cross-correlation function to a first signal and a second signal. The first signal represents a signal emitted by a light source, and the second signal is a signal provided by the selected plurality of photo diodes of the silicon photo multiplier array to be at least at some time commonly evaluated during the read-out process. A time difference between the first signal and the second signal is determined as a time-of-flight value if the determined cross-correlation value for the first signal and the second signal at the time difference is equal to or exceeds a predefined cross-correlation threshold.

In Example 10b, the subject matter of any one of Examples 1b to 9b can optionally include that the LIDAR Sensor System further includes a memory configured to store a sensitivity value representing the sensitivity of the plurality of photo diodes, and one or more digitized waveforms of a signal received by the plurality of photo diodes. The LIDAR Sensor System may further include a sensitivity warning circuit configured to determine a portion of the stored one or more digitized waveforms which portion is equal to or exceeds a sensitivity warning threshold and to adapt the sensitivity value in case an amplitude of a received signal is equal to or exceeds the sensitivity warning threshold.

In Example 11b, the subject matter of any one of Examples 1 b to 10b can optionally include that the LIDAR Sensor System further includes a beam steering arrangement configured to scan a scene.

Example 12b is a LIDAR Sensor System. The LIDAR Sensor System may include a plurality of photo diodes, a cross-correlation circuit configured to apply a cross-correlation function to a first signal and a second signal, wherein the first signal represents a signal emitted by a light source, and wherein the second signal is a signal provided by at least one photo diode of the plurality of photo diodes. A time difference between the first signal and the second signal is determined as a time-of-flight value if the determined cross-correlation value for the first signal and the second signal at the time difference is equal to or exceeds a predefined cross-correlation threshold.

In Example 13b, the subject matter of Example 12b can optionally include that at least some photo diodes of the plurality of photo diodes are avalanche photo diodes.

In Example 14b, the subject matter of any one of Examples 12b or 13b can optionally include that at least some avalanche photo diodes of the plurality of photo diodes are single-photon avalanche photo diodes.

In Example 15b, the subject matter of any one of Examples 12b to 14b can optionally include that the LIDAR Sensor System further includes a beam steering arrangement configured to scan a scene.

In Example 16b, the subject matter of any one of Examples 12b to 15b can optionally include that the LIDAR Sensor System further includes an amplifier configured to amplify a signal provided by one or more photo diodes of the plurality of photo diodes.

In Example 17b, the subject matter of Example 16b can optionally include that the amplifier is a transimpedance amplifier.

In Example 18b, the subject matter of any one of Examples 16b or 17b can optionally include that the LIDAR Sensor System further includes an analog-to-digital converter coupled downstream of the amplifier to convert an analog signal provided by the amplifier into a digitized signal.

Example 19b is a LIDAR Sensor System. The LIDAR Sensor System may include a plurality of photo diodes, and a memory configured to store a sensitivity value representing the sensitivity of the plurality of photo diodes, and one or more digitized waveforms of a signal received by the plurality of photo diodes. The LIDAR Sensor System may further include a sensitivity warning circuit configured to determine a portion of the stored one or more digitized waveforms which portion is equal to or exceeds a sensitivity warning threshold and to adapt the sensitivity value in case an amplitude of a received signal is equal to or exceeds the sensitivity warning threshold.

In Example 20b, the subject matter of Example 19b can optionally include that at least some photo diodes of the plurality of photo diodes are avalanche photo diodes.

In Example 21b, the subject matter of any one of Examples 19b or 20b can optionally include that at least some avalanche photo diodes of the plurality of photo diodes are single-photon avalanche photo diodes.

In Example 22b, the subject matter of any one of Examples 19b or 21b can optionally include that the LIDAR Sensor System further includes a beam steering arrangement configured to scan a scene.

In Example 23b, the subject matter of any one of Examples 19b to 22b can optionally include that the LIDAR Sensor System further includes an amplifier configured to amplify a signal provided by one or more photo diodes of the plurality of photo diodes.

In Example 24b, the subject matter of Example 23b can optionally include that the amplifier is a transimpedance amplifier.

In Example 25b, the subject matter of any one of Examples 23b or 24b can optionally include that the LIDAR Sensor System further includes an analog-to-digital converter coupled downstream of the amplifier to convert an analog signal provided by the amplifier into a digitized signal.

Example 26b is a LIDAR Sensor System. The LIDAR Sensor System may include a plurality of light sources, and a light source controller configured to control the plurality of light sources to emit light with a light source specific time and/or amplitude encoding scheme.

In Example 27b, the subject matter of Example 26b can optionally include that at least one light source of the plurality of light sources includes a laser.

In Example 28b, the subject matter of Example 27b can optionally include that at least one light source of the plurality of light sources includes a pulsed laser.

In Example 29b, the subject matter of Example 28b can optionally include that the at least one pulsed laser is configured to emit a laser pulse train comprising a plurality of laser pulses.

In Example 30b, the subject matter of any one of Examples 26b to 29b can optionally include that at least one light source of the plurality of light sources is configured to generate light based on a model of the light is source or based on a measurement.

Example 31b is a method for a LIDAR Sensor System. The LIDAR Sensor System may include a silicon photo multiplier array including a plurality of photo diodes arranged in a plurality of rows and a plurality of columns, at least one row multiplexer upstream coupled to the photo diodes arranged in the plurality of rows, and at least one column multiplexer upstream coupled to the photo diodes arranged in the plurality of columns. The method may include controlling the at least one row multiplexer and the at least one column multiplexer to select a plurality of photo diodes of the silicon photo multiplier array to be at least at some time commonly evaluated during a read-out process.

In Example 32b, the subject matter of Example 31b can optionally include that the selected plurality of photo diodes of the silicon photo multiplier array are at least at some time commonly evaluated during the read-out process.

In Example 33b, the subject matter of any one of Examples 31b or 32b can optionally include that at least some photo diodes of the plurality of photo diodes are avalanche photo diodes.

In Example 34b, the subject matter of any one of Examples 31b to 33b can optionally include that at least some avalanche photo diodes of the plurality of photo diodes are single-photon avalanche photo diodes.

In Example 35b, the subject matter of any one of Examples 31b to 34b can optionally include that the method further includes controlling the at least one row multiplexer and the at least one column multiplexer to select a plurality of photo diodes of the silicon photo multiplier array to be at least at some time commonly evaluated during a read-out process based on an angle information of beam deflection applied to light emitted by a light source of an associated LIDAR Sensor System.

In Example 36b, the subject matter of any one of Examples 31b to 35b can optionally include that the method further includes controlling the at least one row multiplexer and the at least one column multiplexer to select a plurality of photo diodes of one row and a plurality of photo diodes of one column to be at least at some time commonly evaluated during a readout process based on an angle information of beam deflection applied to light emitted by a light source of an associated LIDAR Sensor System.

In Example 37b, the subject matter of any one of Examples 31b to 36b can optionally include that the method further includes amplifying a signal provided by the selected plurality of photo diodes of the silicon photo multiplier array to be at least at some time commonly evaluated during the read-out process.

In Example 38b, the subject matter of Example 37b can optionally include that the amplifier is a transimpedance amplifier.

In Example 39b, the subject matter of any one of Examples 37b or 38b can optionally include that the method further includes converting an analog signal provided by the amplifier into a digitized signal.

In Example 40b, the subject matter of any one of Examples 31b to 39b can optionally include that the method further includes applying a cross-correlation function to a first signal and a second signal. The first signal represents a signal emitted by a light source. The second signal is a signal provided by the selected plurality of photo diodes of the silicon photo multiplier array to be at least at some time commonly evaluated during the readout process. The method may further include determining a time difference between the first signal and the second signal as a time-of-flight value if the determined cross-correlation value for the first signal and the second signal at the time difference is equal to or exceeds a predefined cross-correlation threshold.

In Example 41b, the subject matter of any one of Examples 31b to 40b can optionally include that the method further includes storing a sensitivity value representing the sensitivity of the plurality of photo diodes, storing one or more digitized waveforms of a signal received by the plurality of photo diodes, determining a portion of the stored one or more digitized waveforms which portion is equal to or exceeds a sensitivity warning threshold, and adapting the sensitivity value in case an amplitude of a received signal is equal to or exceeds the sensitivity warning threshold.

In Example 42b, the subject matter of any one of Examples 31b to 41b can optionally include that the method further includes scanning a scene using a beam steering arrangement.

Example 43b is a method for a LIDAR Sensor System. The LIDAR Sensor System may include a plurality of photo diodes. The method may include applying a cross-correlation function to a first signal and a second signal. The first signal represents a signal emitted by a light source. The second signal is a signal provided by at least one photo diode of the plurality of photo diodes. The method may further include determining a time difference between the first signal and the second signal as a time-of-flight value if the determined cross-correlation value for the first signal and the second signal at the time difference is equal to or exceeds a predefined cross-correlation threshold.

In Example 44b, the subject matter of Example 43b can optionally include that at least some photo diodes of the plurality of photo diodes are avalanche photo diodes.

In Example 45b, the subject matter of Example 44b can optionally include that at least some avalanche photo diodes of the plurality of photo diodes are single-photon avalanche photo diodes.

In Example 46b, the subject matter of any one of Examples 43b to 45b can optionally include that the method further includes scanning a scene using a beam steering arrangement.

In Example 47b, the subject matter of any one of Examples 43b to 46b can optionally include that the method further includes amplifying a signal provided by the select plurality of photo diodes of the silicon photo multiplier array to be at least at some time commonly evaluated during the read-out process.

In Example 48b, the subject matter of Example 47b can optionally include that the amplifier is a transimpedance amplifier.

In Example 49b, the subject matter of any one of Examples 43b or 48b can optionally include that the method further includes converting an analog signal provided by the amplifier into a digitized signal.

In Example 50b, the subject matter of any one of Examples 43b to 49b can optionally include that the method further includes storing a sensitivity value representing the sensitivity of the plurality of photo diodes, storing one or more digitized waveforms of a signal received by the plurality of photo diodes, determining a portion of the stored one or more digitized waveforms which portion is equal to or exceeds a sensitivity warning threshold, and adapting the sensitivity value in case an amplitude of a received signal is equal to or exceeds the sensitivity warning threshold.

In Example 51b, the subject matter of any one of Examples 43b to 50b can optionally include that the method further includes scanning a scene using a beam steering arrangement.

Example 52b is a method for a LIDAR Sensor System. The LIDAR Sensor System may include a plurality of photo diodes, a memory configured to store a sensitivity value representing the sensitivity of the plurality of photo diodes, and one or more digitized waveforms of a signal received by the plurality of photo diodes. The method may include determining a portion of the stored one or more digitized waveforms which portion is equal to or exceeds a sensitivity warning threshold, and adapting the sensitivity value in case an amplitude of a received signal is equal to or exceeds the sensitivity warning threshold.

Example 53b is a method for a LIDAR Sensor System. The LIDAR Sensor System may include a plurality of light sources, and a light source controller. The method may include light source controller controlling the plurality of light sources to emit light with a light source specific time and/or amplitude encoding scheme.

In Example 54b, the subject matter of Example 53b can optionally include that at least one light source of the plurality of light sources comprises a laser.

In Example 55b, the subject matter of Example 54b can optionally include that at least one light source of the plurality of light sources comprises a pulsed laser.

In Example 56b, the subject matter of Example 55b can optionally include that the at least one pulsed laser is emitting a laser pulse train comprising a plurality of laser pulses.

In Example 57b, the subject matter of any one of Examples 53b to 56b can optionally include that at least one light source of the plurality of light sources generates light based on a model of the light source or based on a measurement.

Example 58b is a computer program product, which may include a plurality of program instructions that may be embodied in non-transitory computer readable medium, which when executed by a computer program device of a LIDAR Sensor System according to any one of examples 1b to 30b, cause the LIDAR Sensor System to execute the method according to any one of the examples 31b to 57b.

Example 59b is a data storage device with a computer program that may be embodied in non-transitory computer readable medium, adapted to execute at least one of a method for LIDAR Sensor System according to any one of the above method examples, an LIDAR Sensor System according to any one of the above LIDAR Sensor System examples.

The LIDAR Sensor System according to the present disclosure may be combined with a LIDAR Sensor Device connected to a light control unit for illumination of an environmental space.

As already described in this disclosure, various types of photo diodes may be used for the detection of light or light pulses in a respective sensor pixel, e.g. one or more of the following types of photo diodes:

- pin photo diode;
- passive and active pixel sensors (APS), like CCD or CMOS;
- avalanche photo diode operated in a linear mode (APD);
- avalanche photo diode operated in the Geiger mode to detect single photons (single-photon avalanche photo diode, SPAD).

It should be noted that in the context of this disclosure, photo diodes are understood to be of different photo diode types even though the structure of the photo diodes is the same (e.g. the photo diodes are all pin photo diodes), but the photo diodes are of different size or shape or orientation and/or may have different sensitivities (e.g. due to the application of different reverse-bias voltages to the photo diodes). Illustratively, a photo diode type in the context of this disclosure is not only defined by the type of construction of the photo diode, but also by their sizes, shapes, orientation and/or ways of operation, and the like.

A two-dimensional array of sensor pixels (and thus a two-dimensional array of photo diodes) may be provided for an imaging of two-dimensional images. In this case, an optical signal converted into an electronic signal may be read-out individually per sensor pixel, comparable with a CCD or CMOS image sensor. However, it may be provided to interconnect a plurality of sensor pixels in order to achieve a higher sensitivity by achieving a higher signal strength. This principle may be applied, but is not limited, to the principle of the "silicon photomultiplier" (SiPM) as described with respect to FIG. 26 to FIG. 28. In this case, a plurality (in the order of 10 to 1000 or even more) of individual SPADs are connected in parallel. Although each single SPAD reacts to the first incoming photon (taking into consideration the detection probability), the sum of a lot of SPAD signals results in a quasi analog signal, which may be used to derive the incoming optical signal.

In contrast to the so-called Flash LIDAR Sensor System, in which the entire sensor array (which may also be referred to as detector array) is illuminated at once, there are several LIDAR concepts which use a combination of a one-dimensional beam deflection or a two-dimensional beam deflection with a two-dimensional detector array. In such a case, a circular or linear (straight or curved) laser beam may be transmitted and may be imaged via a separate, fixedly mounted receiver optics onto the sensor array (detector array). In this case, only predefined pixels of the sensor array are illuminated, dependent on the transmitter/receiver optics and the position of the beam deflection device. The illuminated pixels are read out and, the non-illuminated pixels are not read out. Thus, unwanted signals (e.g. background light) e.g. coming from the non-illuminated and therefore not read out pixels are suppressed. Depending on the dimensions of the transmitter/receiver optics it may be feasible to illuminate more pixels or less pixels, e.g. by de-focusing of the receiver optics. The de-focusing process may be adjusted adaptively, for example, depending on the illuminated scene and signal response of backscattered light. The most suitable size of the illumination spot on the surface of the sensor 52 does not necessarily need to coincide with the geometric layout of the pixels on the sensor array. By way of example, if the spot is positioned between two (or four) pixels, then two (or four) pixels will only be partially illuminated. This may also result in a bad signal-to-noise ratio due to the non-illuminated pixel regions.

In various embodiments, control lines (e.g. column select lines carrying the column select signals and row select lines carrying the row select signals) may be provided to selectively interconnect a plurality of photo diodes to define a "virtual pixel", which may be optimally adapted to the respective application scenario and the size of the laser spot on the sensor array. This may be implemented by row selection lines and column selection lines, similar to the access and control of memory cells of a DRAM memory. Furthermore, various types of photo diodes (in other words, various photo diode types) may be implemented (e.g. monolithically integrated) on one common sensor 52 and may be driven, accessed and read out separately, for example.

Moreover, in combination or independent from the interconnection of a plurality of pixels, the sensor may include several pixels including different types of photo diodes. In other words, various photo diode types may be monolithically integrated on the sensor 52 and may be accessed, controlled, or driven separately or the sensor pixel signals from pixels having the same or different photo diode types may be combined and analysed as one common signal.

By way of example, different photo diode types may be provided and individually controlled and read out, for example:

- one or more pixels may have a single-photon avalanche photo diode for LIDAR applications;
- one or more pixels may have a pin photo diode for camera applications (e.g. for the detection of the taillight or a headlight of a vehicle, or for thermal imaging using infrared sensitive sensors); and/or
- one or more pixels may have an avalanche photo diode for LIDAR applications.

Depending on the respective application, a photo diode of a pixel may be provided with an additional optical bandpass filter and/or polarization filter on pixel level connected upstream.

In general, a plurality of pixels of the sensor 52 may be interconnected.

There are many options as to how the pixels having the same or different photo diode types may be interconnected, such as:

- pixels may have different photo diode types, such as photo diode of the same physical structure, but have different sizes of their respective sensor surface regions;
- pixels may have different photo diode types, such as photo diode of the same physical structure, but have different sensitivities (e.g. due to different operation modes such as the application of different reverse-bias voltages); or
- pixels may have different photo diode types, such as photo diodes of different physical structures such as e.g. one or more pixels having a pin photo diode and/or one or more pixels having an avalanche photo diode and/or one or more pixels having a SPAD.

The interconnecting of pixels and thus the interconnecting of photo diodes (e.g. of pin photo diodes) may be provided based on the illumination conditions (in other words lighting conditions) of both, camera and/or LIDAR. With improving lighting conditions a smaller number of sensor pixels of the plurality of sensor pixels may be selected and combined. In other words, in case of good lighting conditions fewer pixels may be interconnected. This results in a lower light sensitivity, but it may achieve a higher resolution. In case of bad lighting conditions, e.g. when driving at night, more pixels may be interconnected. This results in a higher light sensitivity, but may suffer from a lower resolution.

In various embodiments, the sensor controller may be configured to control the selection network (see below for further explanation) based on the level of illuminance of the LIDAR Sensor System such that the better the lighting conditions (visible and/or infrared spectral range) are, the fewer selected sensor pixels of the plurality of sensor pixels will be combined.

The interconnecting of the individual pixels and thus of the individual photo diodes to a "virtual sensor pixel" allows an accurate adaptation of the size of the sensor pixel to the demands of the entire system such as e.g. the entire LIDAR Sensing System. This may occur e.g. in a scenario in which it is to be expected that the non-illuminated regions of the photo diodes provide a significant noise contribution to the wanted signal. By way of example, a variable definition (selection) of the size of a "pixel" ("virtual pixel") may be provided e.g. with avalanche photo diodes and/or silicon photomultipliers (SiPM), where the sensor 52 includes a large number of individual pixels including SPADs. In order to increase the dynamic region of a sensor having a distinct saturation effect (e.g. SiPM), the following interconnection may be implemented: the laser beam has a beam profile of decreasing intensity with increasing distance from the center of the laser beam. In principle, laser beam profiles can have different shapes, for example a Gaussian or a flat top shape. It is also to be noted that for a LIDAR measurement function, infrared as well as visible laser diodes and respectively suited sensor elements may be used.

If pixels were interconnected in the sensor array in the form of rings, for example circular or elliptical rings, around the expected center of the impinging (e.g. laser) beam, the center may, as a result, be saturated. However, the sensor pixels located in one or more rings further outside the sensor array may operate in the linear (non-saturated) mode due to the decreasing intensity and the signal intensity may be estimated. In various embodiments, the pixels of a ring may be interconnected to provide a plurality of pixel rings or pixel ring segments. The pixel rings may further be interconnect in a timely successive manner, e.g. in case only one sum signal output is available for the interconnected sensor pixels). In alternative embodiments, a plurality of sum signal outputs may be provided or implemented in the sensor array which may be coupled to different groups of sensor pixels. In general, the pixels may be grouped in an arbitrary manner dependent on the respective requirements. The combination of different types of sensor pixels within one sensor 52 e.g. allows combining the functionality of a LIDAR sensor with the functionality of a camera in one common optics arrangement without the risk that a deviation will occur with respect to adjustment and calibration between the LIDAR and camera. This may reduce costs for a combined LIDAR/camera sensor and may further improve the data fusion of LIDAR data and camera data. As already mentioned above, camera sensors may be sensitive in the visible and/or infrared spectral range (thermographic camera).

Furthermore, the sensor controller 53 may control the sensor to pixels taking into consideration the integration time (read out time) required by the respective photo diode of a pixel. The integration time may be dependent on the size of the photo diode. Thus, the clocking to control the read out process e.g. provided by the sensor controller 53, may be different for the different types of pixels and may change depending on the configuration of the is pixel selection network.

FIG. 38 shows a portion 3800 of the sensor 52 in accordance with various embodiments. It is to be noted that the sensor 52 does not need to be a SiPM detector array as shown in FIG. 26 or FIG. 27. The sensor 52 includes a plurality of pixels 3802. Each pixel 3802 includes a photo diode. A light (laser) spot 3804 impinging on the surface of the portion 3800 of the sensor 52 is symbolized in FIG. 38 by a circle 3806. The light (laser) spot 3804 covers a plurality of sensor pixels 3802. A selection network may be provided which may be configured to selectively combine some pixels 3802 of the plurality of pixels 3802 to form an enlarged sensor pixel. The electrical signals provided by the photo diodes of the combined sensor pixels are accumulated. A read-out circuit may be provided which may be configured to read-out the accumulated electrical signals from the combined sensor pixels as one common signal.

The selection network may be configured to apply a plurality of row select signals 3808, 3810, 3812 (the number of row select signals may be equal to the number of rows of the sensor 52) to select the sensor pixels 3802 of the respectively selected row. To do this, the selection network may include a row multiplexer (not shown in FIG. 38). Furthermore, the selection network may be configured to apply a plurality of column select signals 3814, 3816, 3818 (the number of column select signals may be equal to the number of columns of the sensor 52) to select the pixels of the respectively selected column. To do this, the selection network may include a column multiplexer (not shown in FIG. 38).

FIG. 38 illustrates nine selected sensor pixels 3802 selected by the plurality of row select signals 3808, 3810, 3812 and the plurality of column select signals 3814, 3816, 3818. The light (laser) spot 3804 fully covers the nine selected sensor pixels 3820. Furthermore, the sensor controller 53 may provide a supply voltage 3822 to the sensor 52. The sensor signals 3824 provided by the selected sensor pixels 3820 are read out from the sensor 52 and supplied to one or more amplifiers via the selection network. It is to be noted that a light (laser) spot 3804 do not need to fully cover a selected sensor pixel 3820.

The individual selectability of each sensor pixel 3802 of the sensor 52 in a manner comparable with a selection mechanism of memory cells in a Dynamic Random Access Memory (DRAM) allows a simple and thus cost efficient sensor circuit architecture to quickly and reliably select one or more sensor pixels 3802 to achieve an evaluation of a plurality of sensor pixels at the same time. This may improve the reliability of the sensor signal evaluation of the second LIDAR sensor system 50.

FIG. 39 shows a portion 3900 of the sensor 52 in accordance with various embodiments in more detail.

The sensor 52 may include a plurality of row selection lines 3902, each row selection line 3902 being coupled to an input of the selection network, e.g. to an input of a row multiplexer of the selection network. The sensor 52 may further include a plurality of column selection lines 3904, each column selection line 3904 being coupled to another input of the selection network, e.g. to an input of a column multiplexer of the selection network. A respective column switch 3906 is coupled respectively to one of the column selection lines 3904 and is connected to couple the electrical supply voltage 3908 present on a supply voltage line 3910 to the sensor pixels 3802 coupled to the respective column selection line 3904 or to decouple the electrical supply voltage 3908 therefrom. Each sensor pixel 3802 may be coupled to a column read out line 3912, which is in turn coupled to a collection read out line 3914 via a respective column read out switch 3916. The column read out switches 3916 may be part of the column multiplexer. The sum of the current of the selected sensor pixels 3802, in other words the sensor signals 3824, may be provided on the collection read out line 3914. Each sensor pixel 3802 may further be coupled downstream of an associated column selection line 3904 via a respective column pixel switch 3918 (in other words, a respective column pixel switch 3918 is connected between a respective associated column selection line 3904 and an associated sensor pixel 3802). Moreover, each sensor pixel 3802 may further be coupled upstream of an associated column read out line 3912 via a respective column pixel read out switch 3920 (in other words, a respective column pixel read out switch 3920 is connected between a respective associated column read out line 3912 and an associated sensor pixel 3802). Each switch in the sensor 52 may be implemented by a transistor such as e.g. a field effect transistor (FET), e.g. a MOSFET. A control input (e.g. the gate terminal of a MOSFET) of each column pixel switch 3918 and of each column pixel read out switch 3920 may be electrically conductively coupled to an associated one of the plurality of row selection lines 3902. Thus, the row multiplexer may "activate" the column pixel switches 3918 and the pixel read out switches 3920 via an associated row selection line 3902. In case a respective column pixel switch 3918 and the associated pixel read out switch 3920 are activated, the associated column switch 3906 finally activates the respective sensor pixel 3802 by applying the supply voltage 3908 e.g. to the source of the MOSFET and (since e.g. the associated column pixel switch 3918 is closed) the supply voltage 3908 is also applied to the respective sensor pixel 3802. A sensor signal detected by the "activated" selected sensor pixel 3802 can be forwarded to the associated column read out line 3912 (since e.g. the associated column pixel read out switch 3920 is also closed), and, if also the associated column read out switch 3920 is closed, the respective sensor signal is transmitted to the collection read out line 3914 and finally to an associated amplifier (such as an associated TIA).

By way of example and as shown in FIG. 40, the column switch 3906 may be implemented by a column switch MOSFET 4002;

the column read out switch 3916 may be implemented by a column read out switch MOSFET 4004 the column pixel switch 3918 may be implemented by a column pixel switch MOSFET 4006; and the column pixel read out switch 3920 may be implemented by a column pixel read out switch MOSFET 4008.

FIG. 41 shows a portion 4100 of the sensor 52 in accordance with various embodiments in more detail.

In various embodiments, the column pixel read out switch 3920 may be dispensed with in a respective sensor pixel 3802. The embodiments shown in FIG. 41 may e.g. be applied to a SiPM as a sensor 52. Thus, the pixels 3802 may in this case be implemented as SPADs 3802. The sensor 52 further includes a first summation output 4102 for fast sensor signals. The first summation output 4102 may be coupled to the anode of each SPAD via a respective coupling capacitor 4104. The sensor 52 in this example further includes a second summation output 4106 for slow sensor signals. The second summation output 4106 may be coupled to the anode of each SPAD via a respective coupling resistor (which in the case of an SPAD as the photo diode of the pixel may also be referred to as quenching resistor) 4108.

FIG. 42 shows a recorded scene 4200 and the sensor pixels used to detect the scene in accordance with various embodiments in more detail.

As described above, the sensor 52 may have sensor pixels 3802 with photo diodes having different sensitivities. In various embodiments, an edge region 4204 may at least partially surround a center region 4202. In various embodiments, the center region 4202 may be provided for a larger operating range of the LIDAR Sensor System and the edge region 4204 may be provided for a shorter operating range. The center region 4202 may represent the main moving (driving, flying or swimming) direction of a vehicle and thus usually needs a far view to recognize an object at a far distance. The edge region 4204 may represent the edge region of the scene and usually, in a scenario where a vehicle (e.g. a car) is moving, objects 100, which may be detected, are usually nearer than in the main moving direction in which the vehicle is moving. The larger operating range means that the target object 100 return signal has a rather low signal intensity. Thus, sensor pixels 3802 with photo diodes having a higher sensitivity may be provided in the center region 4202. The shorter operating range means that the target object 100 return signal has a rather high (strong) signal intensity. Thus, sensor pixels 3802 with photo diodes having a lower sensitivity may be provided in the edge region 4204. In principle, however, the patterning of the sensor pixels (type, size, and sensitivity) may be configured for specific driving scenarios and vehicle types (bus, car, truck, construction vehicles, drones, and the like). This means that, for example, the sensor pixels 3802 of the edge regions 4204 may have a high sensitivity. It should also be stated that, if a vehicle uses a variety of LIDAR/Camera sensor systems, these may be configured differently, even when illuminating and detecting the same Field-of-View.

FIG. 43 shows a recorded scene 4300 and the sensor pixels 3802 used to detect the scene 4300 in accordance with various embodiments in more detail.

In various embodiments, a row-wise arrangement of the sensor pixels of the same photo diode type may be provided. By way of example, a first row 4302 may include pixels having APDs for a Flash LIDAR Sensor System and a second row 4304 may include pixels having pin photo diodes for a camera. The two respectively adjacent pixel rows may be provided repeatedly so that the rows of different pixels are provided, for example, in an alternating manner. However, the sequence and number of pixels rows of the same photo diode type could vary and likewise the grouping into specific selection networks. It is also to be noted that a row of pixels or columns may employ different photo diode types. Also, a row or column must not be completely filled up with photo diodes. The own motion of a vehicle may compensate for the reduced resolution of the sensor array ("push-broom scanning" principle).

The different rows may include various photo diode types, such as for example:

first row: pixels having APDs (LIDAR)

second row: pixels having pin photo diodes (camera).

first row: pixels having first polarization plane second row: pixels having different second polarization plane.

This may allow the differentiation between directly incoming light beams and reflected light beams (e.g. vehicle, different surfaces of an object).

first row: pixels having first pin photo diodes (configured to detect light having wavelengths in the visible spectrum)

second row: pixels having second pin photo diodes (configured to detect light having wavelengths in the near infrared (NIR) spectrum).

This may allow the detection of taillights as well as an infrared (IR) illumination.

The sensor controller 53 may be configured to select the respective pixels 3802 in accordance with the desired photo diode type in a current application.

FIG. 44 shows a flow diagram illustrating a method 4400 for a LIDAR Sensor System in accordance with various embodiments in more detail.

The LIDAR Sensor System may include a plurality of sensor pixels. Each sensor pixel includes at least one photo diode. The LIDAR Sensor System may further include a selection network, and a read-out circuit. The method 4400 may include, in 4402, the selection network selectively combining some sensor pixels of the plurality of sensor pixels to form an enlarged sensor pixel. The electrical signals provided by the photo diodes of the combined sensor pixels are accumulated. The method 4400 may further include, in 4404, the read-out circuit reading-out the accumulated electrical signals from the combined sensor pixels as one common signal.

FIG. 45 shows a flow diagram illustrating another method 4500 for a LIDAR Sensor System in accordance with various embodiments in more detail.

The LIDAR Sensor System may include a plurality of a plurality of pixels. A first pixel of the plurality of pixels includes a photo diode of a first photo diode type, and a second pixel of the plurality of pixels includes a photo diode of a second photo diode type. The second photo diode type is different from the first photo diode type. The LIDAR Sensor System may further include a pixel sensor selector and a sensor controller. The method 4500 may include, in 4502, the pixel sensor selector selecting at least one of the first pixel including a photo diode of the first photo diode type and/or at least one of the second pixel including a photo diode of the second photo diode to type, and, in 4504, the sensor controller controlling the pixel selector to select at least one first pixel and/or at least one second pixel.

Moreover, it is to be noted that the light (laser) emission (e.g. provided by a plurality of light (laser) sources, which may be operated in a group-wise manner) may be adapted in its light intensity pattern to the pixel is distribution or arrangement of the sensor 52, e.g. it may be adapted such that larger pixels may be charged with light having a higher intensity than smaller pixels. This may be provided in an analog manner with respect to photo diodes having a higher and lower sensitivity, respectively.

In various embodiments, in the LIDAR sensor system as described with reference to FIG. 38 to FIG. 45, a first sensor pixel may include a photo diode of a first photo diode type and a second pixel of the plurality of pixels may include a photo diode of a second photo diode type. The second photo diode type is different from the first photo diode type. In various embodiments, the both photo diodes may be stacked one above the other in a way as generally described in the embodiments as described with reference to FIG. 51 to FIG. 58.

In the following, various aspects of this disclosure will be illustrated:

Example 1d is a LIDAR Sensor System. The LIDAR Sensor System includes a plurality of sensor pixels, each sensor pixel including at least one photo diode. The LIDAR Sensor System further includes a selection network configured to selectively combine some sensor pixels of the plurality of sensor pixels to form an enlarged sensor pixel. The electrical signals provided by the photo diodes of the combined sensor pixels are accumulated. The LIDAR Sensor System further includes a read-out circuit configured to read-out the accumulated electrical signals from the combined sensor pixels as one common signal.

In Example 2d, the subject matter of Example 1d can optionally include that the at least one photo diode includes at least one pin diode.

In Example 3d, the subject matter of Example 1 d can optionally include that the at least one photo diode includes at least one avalanche photo diode.

In Example 4d, the subject matter of Example 3d can optionally include that the at least one avalanche photo diode includes at least one single-photon avalanche photo diode.

In Example 5d, the subject matter of any one of Examples 1 d to 4d can optionally include that the plurality of sensor pixels are arranged in a sensor matrix in rows and columns.

In Example 6d, the subject matter of any one of Examples 1 d to 5d can optionally include that the selection network includes a plurality of row selection lines, each row selection line being electrically conductively coupled to at least some sensor pixels of the same row, a plurality of column selection lines, each column selection line being electrically conductively coupled to at least some sensor pixels of the same column, and a plurality of read-out lines, each read-out line being electrically conductively coupled to at least some sensor pixels of the same column or the same row to accumulate the electrical signals provided by the combined sensor pixels.

In Example 7d, the subject matter of any one of Examples 1 d to 6d can optionally include that each sensor pixel of at least some of the sensor pixels includes a first switch connected between the selection network and a first terminal of the sensor pixel, and/or a second switch connected between a second terminal of the sensor pixel and the selection network.

In Example 8d, the subject matter of Examples 6d and 7d can optionally include that the first switch is connected between a column selection line of the plurality of column selection lines and the first terminal of the sensor pixel, wherein a control terminal of the first switch is coupled to a row selection line of the plurality of row selection lines. The second switch is connected between the second terminal of the sensor pixel and a read-out line of the plurality of read-out lines. A control terminal of the second switch is is coupled to a row selection line of the plurality of row selection lines.

In Example 9d, the subject matter of any one of Examples 7d or 8d can optionally include that at least one first switch and/or at least one second switch includes a field effect transistor.

In Example 10d, the subject matter of any one of Examples 1d to 9d can optionally include that the LIDAR Sensor System further includes a sensor controller configured to control the selection network to selectively combine some sensor pixels of the plurality of sensor pixels to form the enlarged sensor pixel.

In Example 11d, the subject matter of Example 10d can optionally include that the sensor controller is configured to control the selection network based on the level of illuminance of the LIDAR Sensor System such that with improving lighting conditions a smaller number of sensor pixels of the plurality of sensor pixels will be selected and combined.

In Example 12d, the subject matter of any one of Examples 1d to 11d can optionally include that the LIDAR Sensor System further includes a plurality of read-out amplifiers, each read-out amplifier coupled to an associated read-out line of the plurality of read-out lines.

In Example 13d, the subject matter of Example 12d can optionally include that the common signal is an electrical current. The plurality of read-out amplifiers includes a plurality of transimpedance amplifiers, each transimpedance amplifier configured to convert the associated electrical current into an electrical voltage.

Example 14d is a LIDAR Sensor System. The LIDAR Sensor System may include a plurality of pixels. A first pixel of the plurality of pixels includes a photo diode of a first photo diode type, and a second pixel of the plurality of pixels includes a photo diode of a second photo diode type. The second photo diode type is different from the first photo diode type. The LIDAR Sensor System may further include a pixel selector configured to select at least one of the first pixel including a photo diode of the first photo diode type and/or at least one of the second pixel including the photo diode of the second photo diode type, and a sensor controller configured to control the pixel selector to select at least one first pixel and/or at least one second pixel.

In Example 15d, the subject matter of Example 14d can optionally include that the sensor controller and the pixels are configured to individually read-out the photo diode of the first photo diode type and the photo diode of the second photo diode type.

In Example 16d, the subject matter of any one of Examples 14d or 15d can optionally include that the sensor controller and the pixels are configured to read-out the photo diode of the first photo diode type and the photo diode of the second photo diode type as one combined signal.

In Example 17d, the subject matter of any one of Examples 14d to 16d can optionally include that the photo diode of a first photo diode type and/or the photo diode of a second photo diode type are/is selected from a group consisting of: a pin photo diode; an avalanche photo diode; or a single-photon photo diode.

In Example 18d, the subject matter of any one of Examples 14d to 17d can optionally include that the LIDAR Sensor System further includes a selection network configured to selectively combine some pixels of the plurality of pixels to form an enlarged pixel, wherein the electrical signals provided by the photo diodes of the combined pixels are accumulated, and a read-out circuit configured to read-out the accumulated electrical signals from the combined pixels as one common signal.

In Example 19d, the subject matter of any one of Examples 14d to 18d can optionally include that the plurality of pixels are arranged in a sensor matrix in rows and columns.

In Example 20d, the subject matter of any one of Examples 14d to 19d can optionally include that the selection network includes a plurality of row selection lines, each row selection line being electrically conductively coupled to at least some pixels of the same row, a plurality of column selection lines, each column selection line being electrically conductively coupled to at least some pixels of the same column, and a plurality of read-out lines, each read-out line being electrically conductively coupled to at least some pixels of the same column or the same row to accumulate the electrical signals provided by the combined pixels.

In Example 21d, the subject matter of any one of Examples 14d to 20d can optionally include that each pixel of at least some of the pixels includes a first switch connected between the selection network and a first terminal of the pixel, and/or a second switch connected between a second terminal of the pixel and the selection network.

In Example 22d, the subject matter of Examples 20d and 21d can optionally include that the first switch is connected between a column selection line of the plurality of column selection lines and the first terminal of the pixel. A control terminal of the first switch is coupled to a row selection line of the plurality of row selection lines. The second switch is connected between the second terminal of the pixel and a read-out line of the plurality of read-out lines. A control terminal of the second switch is coupled to a row selection line of the plurality of row selection lines.

In Example 23d, the subject matter of any one of Examples 21d or 22d can optionally include that at least one first switch and/or at least one second switch comprises a field effect transistor.

In Example 24d, the subject matter of any one of Examples 14d to 23d can optionally include that the sensor controller is further configured to control the selection network to selectively combine some pixels of the plurality of pixels to form the enlarged pixel.

In Example 25d, the subject matter of Example 22d can optionally include that the sensor controller is configured to control the selection network based on the level of illuminance of the LIDAR Sensor System such that with improving lighting conditions a smaller number of sensor pixels of the plurality of sensor pixels will be selected and combined.

In Example 26d, the subject matter of any one of Examples 14d to 25d can optionally include that the LIDAR Sensor System further includes a plurality of read-out amplifiers, each read-out amplifier coupled to an associated read-out line of the plurality of read-out lines.

In Example 27d, the subject matter of Example 26d can optionally include that the common signal is an electrical current. The plurality of read-out amplifiers includes a plurality of transimpedance amplifiers, each transimpedance amplifier configured to convert the associated electrical current into an electrical voltage.

Example 28d is a method for a LIDAR Sensor System. The LIDAR Sensor System may include a plurality of sensor pixels. Each sensor pixel includes at least one photo diode. The LIDAR Sensor System may further include a selection network, and a read-out circuit. The method may include the selection network selectively combining some sensor pixels of the plurality of sensor pixels to form an enlarged sensor pixel, wherein the electrical signals provided by the photo diodes of the combined sensor pixels are accumulated, and the read-out circuit reading-out the accumulated electrical signals from the combined sensor pixels as one common signal.

In Example 29d, the subject matter of Example 28d can optionally include that the at least one photo diode includes at least one pin diode.

In Example 30d, the subject matter of Example 28d can optionally include that the at least one photo diode includes at least one avalanche photo diode.

In Example 31d, the subject matter of Example 30d can optionally include that the at least one avalanche photo diode includes at least one single-photon avalanche photo diode.

In Example 32d, the subject matter of any one of Examples 28d to 31d can optionally include that the plurality of sensors are arranged in a sensor matrix in rows and columns.

In Example 33d, the subject matter of any one of Examples 28d to 32d can optionally include that the selection network includes a plurality of row selection lines, each row selection line being electrically conductively coupled to at least some sensor pixels of the same row, a plurality of column selection lines, each column selection line being electrically conductively coupled to at least some sensor pixels of the same column, and a plurality of read-out lines, each read-out line being electrically conductively coupled to at least some sensor pixels of the same column or the same row to accumulate the electrical signals provided by the combined sensor pixels.

In Example 34d, the subject matter of any one of Examples 28d to 33d can optionally include that each sensor pixel of at least some of the sensor pixels includes a first switch connected between the selection network and a first terminal of the sensor pixel, and/or a second switch connected between a second terminal of the sensor pixel and the selection network.

In Example 35d, the subject matter of Example 33d and Example 34d can optionally include that the first switch is connected between a column selection line of the plurality of column selection lines and the first terminal of the sensor pixel. A control terminal of the first switch is controlled via a row selection line of the plurality of row selection lines. The second switch is connected between the second terminal of the sensor pixel and a read-out line of the plurality of read-out lines. A control terminal of the second switch is controlled via a row selection line of the plurality of row selection lines.

In Example 36d, the subject matter of any one of Examples 34d or 35d can optionally include that at least one first switch and/or at least one second switch comprises a field effect transistor.

In Example 37d, the subject matter of any one of Examples 28d to 36d can optionally include that the method further includes a sensor controller controlling the selection network to selectively combine some sensor pixels of the plurality of sensor pixels to form the enlarged sensor pixel.

In Example 38d, the subject matter of Example 37d can optionally include that the sensor controller controls the selection network based on the level of illuminance of the LIDAR Sensor System such that with improving lighting conditions a smaller number of sensor pixels of the plurality of sensor pixels will be selected and combined.

In Example 39d, the subject matter of any one of Examples 28d to 38d can optionally include that the LIDAR Sensor System further includes a plurality of read-out amplifiers, each read-out amplifier coupled to an associated read-out line of the plurality of read-out lines.

In Example 40d, the subject matter of Example 39d can optionally include that the common signal is an electrical current. The plurality of read-out amplifiers includes a plurality of transimpedance amplifiers. Each transimpedance amplifier converts the associated electrical current into an electrical voltage.

Example 41d is a method for a LIDAR Sensor System. The LIDAR Sensor System may include a plurality of a plurality of pixels. A first pixel of the plurality of pixels includes a photo diode of a first photo diode type, and a second pixel of the plurality of pixels includes a photo diode of a second photo diode type. The second photo diode type is different from the first photo diode type. The LIDAR Sensor System may further include a pixel sensor selector and a sensor controller. The method may include the pixel sensor selector selecting at least one of the first pixel including photo diode of the first photo diode type and/or at least one of the second pixel including the photo diode of the second photo diode type, and the sensor controller controlling the pixel selector to select at least one first pixel and/or at least one second pixel.

In Example 42d, the subject matter of Example 41d can optionally include that the photo diode of a first photo diode type and/or the photo diode of a second photo diode type are/is selected from a group consisting of: a pin photo diode, an avalanche photo diode, and/or a single-photon photo diode.

In Example 43d, the subject matter of any one of Examples 41d or 42d can optionally include that the method further includes a selection network selectively combining some sensors of the plurality of pixels to form an enlarged pixel, wherein the electrical signals provided by the photo diodes of the combined pixels are accumulated, and a read-out circuit reading out the accumulated electrical signals from the combined pixels as one common signal.

In Example 44d, the subject matter of any one of Examples 41d to 43d can optionally include that the plurality of pixels are arranged in a sensor matrix in rows and columns.

In Example 45d, the subject matter of any one of Examples 41d to 44d can optionally include that the selection network includes a plurality of row selection lines, each row selection line being electrically conductively coupled to at least some pixels of the same row, a plurality of column selection lines, each column selection line being electrically conductively coupled to at least some pixels of the same column, and a plurality of read-out lines, each read-out line being electrically conductively coupled to at least some pixels of the same column or the same row to accumulate the electrical signals provided by the combined pixels.

In Example 46d, the subject matter of any one of Examples 41d to 45d can optionally include that each pixel of at least some of the pixels includes a first switch connected between the selection network and a first terminal of the pixel, and/or a second switch connected between a second terminal of the pixel and the selection network.

In Example 47d, the subject matter of Example 45d and Example 46d can optionally include that the first switch is connected between a column selection line of the plurality of column selection lines and the first terminal of the pixel. A control terminal of the first switch is controlled via a row selection line of the plurality of row selection lines, and the second switch is connected between the second terminal of the pixel and a read-out line of the plurality of read-out lines.

A control terminal of the second switch is controlled via a row selection line of the plurality of row selection lines.

In Example 48d, the subject matter of any one of Examples 46d or 47d can optionally include that at least one first switch and/or at least one second switch includes a field effect transistor.

In Example 49d, the subject matter of any one of Examples 41d to 48d can optionally include that the sensor controller is controlling the selection network to selectively combine some pixels of the plurality of pixels to form the enlarged pixel.

In Example 50d, the subject matter of Example 49d can optionally include that the sensor controller controls the selection network based on the level of illuminance of the LIDAR Sensor System such that with improving lighting conditions a smaller number of sensor pixels of the plurality of sensor pixels will be selected and combined.

In Example 51d, the subject matter of any one of Examples 41d to 50d can optionally include that the LIDAR Sensor System further includes a plurality of read-out amplifiers, each read-out amplifier coupled to an associated read-out line of the plurality of read-out lines.

In Example 52d, the subject matter of Example 51d can optionally include that the common signal is an electrical current. The plurality of read-out amplifiers includes a plurality of transimpedance amplifiers, each transimpedance amplifier converts the associated electrical current into an electrical voltage.

Example 53d is a computer program product. The computer program product may include a plurality of program instructions that may be embodied in non-transitory computer readable medium, which when executed by a computer program device of a LIDAR Sensor System according to any one of examples 1d to 27d, cause the LIDAR Sensor System to execute the method according to any one of the examples 28d to 52d.

Example 54d is a data storage device with a computer program that may be embodied in non-transitory computer readable medium, adapted to execute at least one of a method for LIDAR Sensor System according to any one of the above method examples or a LIDAR Sensor System according to any one of the above LIDAR Sensor System examples.

The LIDAR Sensor System according to the present disclosure may be combined with a LIDAR Sensor Device connected to a light control unit for illumination of an environmental space.

In LIDAR applications, there are often provided a lot of photo diodes in the sensor. The receiver currents of these photo diodes (photo currents) are usually converted into voltage signals by means of a transimpedance amplifier (TIA) as already described above. Since not all signals of all the photo diodes have to be read out at once, it may be desirable to forward the photo current provided by one or more selected photo diodes out of a set of N photo diodes to only exactly one TIA. Thus, the number of required TIAs may be reduced. The photo diode(s) often has/have an avalanche-type photo current amplifier (APD, SiPM, MPPC, SPAD) monolithically integrated. The amplification of such a photo diode is dependent on the applied reverse bias voltage, for example.

Usually, electronic multiplexers are used to forward the photo currents to a TIA. The electronic multiplexers, however, always add capacitances to the signal lines. Due to the higher capacitances, TIAs having a higher gain-bandwidth-product are required for a TIA circuit having the same bandwidth. These TIAs are usually more expensive.

As will be explained in more detail below, the outputs of the N photo diodes (N being an integer greater than 1) may be merged to be connected to a TIA (in general, to one common read-out circuit via one common electrically conductive signal line). Thus, the photo currents are summed up on that electrically conductive signal line. Those photo currents, which should not be amplified at a specific period of time (photo currents except for the desired or selected photo current) may be amplified less than the photo current(s) of the selected photo diode(s) by one or more orders of magnitude e.g. by means of a decrease of the reverse bias voltage, which is responsible for the avalanche amplification. To do this, a pixel selection circuit may be provided. The pixel selection circuit of a respective sensor pixel 3802 may be configured to select or suppress the sensor pixel 3802 by controlling the amplification within the associated photo diode or the transfer of photo electrons within the associated photo diode.

The amplification of the avalanche effect may often be decreased by one or more orders of magnitude already by changing the reverse bias voltage by only a few volts. Since the photo currents are small and the receiving times are short, the voltages may be decreased using a simple circuit (see enclosed drawing). The usually provided multiplexers may be omitted and the critical signal paths become shorter and thus less noise prone.

FIG. 46 shows a portion 4600 of the LIDAR Sensor System 10 in accordance with various embodiments. The portion 4600 illustrates some components of the first LIDAR Sensing System 40 and some components of the second LIDAR Sensing System 50.

The components of the first LIDAR Sensing System 40 shown in FIG. 46 include a light source 42. The light source 42 may include a plurality of laser diodes 4602 configured to emit laser beams 4604 of one or more desired wavelengths. Furthermore, an emitter optics arrangement 4606 and (in case of a scanning LIDAR Sensing System) a movable mirror 4608 or other suitable beam steering devices may be provided. The emitter optics arrangement 4606 of the first LIDAR Sensing System 40 may be configured to deflect the laser beams 4604 to illuminate a column 4610 of a Field-of-View 4612 of the LIDAR Sensing System at a specific period of time (as an alternative, a row 4614 of a Field-of-View 4612 of the LIDAR Sensing System may be illuminated by the laser beams 4604 at a time). The row resolution (or in the alternative implementation the column resolution) is realised by a sensor 52 which may include a sensor pixel array including a plurality of sensor pixels 3802. The detection optics arrangement 51 is arranged upstream the sensor 52 to deflect the received light onto the surface of the sensor pixels 3802 of the sensor 52. The detection optics arrangement 51 and the sensor 52 are components of the second LIDAR Sensing System 50.

Since, as already described above, each sensor pixel 3802 receives the entire scattered light of a row (or a column), the rows of the sensor 52 may be split and a conventional one-dimensional sensor pixel array may be replaced by a two-dimensional matrix of sensor pixels 3802. In this case, the photo current of only one or a few (two, three, four or even more) sensor pixels 3802 is forwarded to the amplifier. This is conventionally done by multiplexers which are complex and add a capacitance to the entire system which eventually reduces the bandwidth of the LIDAR Sensor System 10.

In various embodiments, the second LIDAR Sensing System 50 may include a plurality 4802 of sensor pixels 3802 (cf. circuit 4800 in FIG. 48). Each sensor pixel 3802 includes a (exactly one) photo diode 4804. Each sensor pixel 3802 further includes a pixel selection circuit 4806 configured to select or suppress the sensor pixel 3802 (illustratively the photo current generated by the sensor pixel 3802) by controlling the amplification within the associated photo diode 4804 (e.g. based on avalanche effects) or the transfer of photo electrons within the associated photo diode 4804 (e.g. in the case of pin photo diodes 4804), and at least one read-out circuit 4810 having an input 4812 and an output 4814 and configured to provide an electric variable 4820 at the output 4814 based on an electrical signal 4816 applied to the input 4812 via a common signal line 4818. Illustratively, the outputs of all pixel sensors (e.g. of one row or of one column) are directly coupled to a common node 4808, which is part of the common signal line 4818. At least some photo diodes of the plurality of sensor pixels are electrically (e.g. electrically conductively) coupled to the input 4812 of the at least one read-out circuit 4810. Exactly one read-out circuit 4810 (and thus e.g. exactly one amplifier) may be provided for each row (or each column) of the sensor array. As an alternative, exactly one read-out circuit 4810 (and thus e.g. exactly one amplifier) may be provided for the entire sensor array. It is to be noted that the pixel selection circuit 4806 may also be provided as a separate component outside the sensor pixel 3802.

In general, an arbitrary number of sensor pixels 3802 may be provided which may all have the same components (i.e. the same photo diode 4804 and the same pixel selection circuit 4806). In various embodiments, at least some of the sensor pixels 3802 may have different components (i.e. different photo diode types or different types of pixel selection circuits 4806). Each photo diode 4804 may be a pin photo diode or an avalanche-type photo diode such as e.g. an avalanche photo diode (APD) or a single photon avalanche photo diode (SPAD) or an MPPC/SiPM. Different mechanisms may be provided to implement the selection or suppression of the respective sensor pixels 3802 in the pixel selection circuits 4806. By way of example, each sensor pixel 3802 may include a switch in the signal path (by way of example, the switch may be implemented as a field effect transistor switch). The switch may be connected between the reverse bias voltage input 4822 and the photo diode 4804. If the switch is closed, the photo current is forwarded to the common signal line 4818. If the switch is open, the respective photo diode 4804 of the sensor pixel 3802 is electrically decoupled from the common signal line 4818. In various embodiments, the pixel selection circuits 4806 may be configured to select or suppress the sensor pixel 3802 (illustratively, the photo current generated by the sensor pixel 3802) by controlling the amplification within the associated photo diode 4804. To do this, the pixel selection circuits 4806 may temporarily apply a suppression voltage to the cathode (or the anode) of the photo diode to suppress the amplification within the associated photo diode 4804, e.g. the avalanche amplification within the associated photo diode 4804. The electrical signal 4816 applied to the input 4812 via a common signal line 4818 may be the sum of all photo currents provided by the photo diodes of all sensor pixels 3802 connected to the common signal line 4818. The read-out circuit 4810 may be configured to convert the electrical (current) signal to a voltage signal as the electric variable 4820 provided at the output 4814. A voltage generator circuit (not shown) is configured to generate a voltage (e.g. $U_{RB}$) and to apply the same to each photo diode 4804, e.g. to the cathode (positive voltage $U_{RB}$) or to the anode (negative voltage $U_{RB}$) of each photo diode 4804. In various embodiments, the voltage may be a reverse bias voltage $U_{RB}$ of the respective photo diode 4804. In various embodiments, the voltage generator circuit or another voltage generator circuit may be configured to generate the suppression voltage and apply the same to the cathode (or anode) of the respective photo diode 4804, as will be described in more detail below. It is to be noted that all sensor pixels 3802 may be connected to the common signal line 4818. The voltage generator circuit as well as the optional further voltage generator circuit may be part of the sensor controller 53.

FIG. 49 shows a circuit 4900 in accordance with various embodiments in more detail.

In various embodiments, the photo diodes 4804 of the sensor pixels 3802 may be avalanche photo diodes (in FIG. 49 also referred to as $APD_1$, $APD_2$, . . . , $APD_N$). Furthermore, each pixel selection circuit 4806 (the sensor pixels 3802 of the embodiments as shown in FIG. 49 all have the same structure and components) includes a resistor $R_{PD1}$ 4902, a capacitor $C_{amp1}$ 4904 and a Schottky diode $D_1$ 4906. The resistor $R_{PD1}$ 4902 may be connected between the voltage input 4822 and the cathode of the photo diode 4804. The capacitor $C_{amp1}$ 4904 may be connected between a suppression voltage input 4908 and the cathode of the photo diode 4804. The Schottky diode $D_1$ 4906 may be connected in parallel to the resistor $R_{PD1}$ 4902 and thus may also be connected between the voltage input 4822 and the cathode of the photo diode 4804. During normal operation, the reverse bias voltage $U_{RB}$ is applied to the cathode of the photo diode 4804. It should be noted that in general, it is provided by the voltage applied to the voltage input 4822, referring to ground potential, that the photo diode 4804 is operated in reverse direction. This means that the reverse bias voltage $U_{RB}$ may be applied to the cathode of the photo diode 4804, in which case the reverse bias voltage $U_{RB}$ is a positive voltage ($U_{RB}>0V$). As an alternative, the reverse bias voltage $U_{RB}$ may be applied to the anode of the photo diode 4804, in which case the reverse bias voltage $U_{RB}$ is a negative voltage ($U_{RB}<0V$). A step (in other words voltage pulse 4912) in the voltage waveform 4914 of the suppression voltage $U_{Amp1}$ 4910 over time t 4932, the reverse bias voltage $U_{RB}$ may be temporarily reduced by at least some volts. The resistor $R_{PD1}$ 4902 illustratively serves as a low pass filter together with capacitor $C_{Amp1}$ 4904 (thus, the suppression voltage $U_{Amp1}$ 4910 is capacitively coupled into the anode node of the photo diode 4804). The Schottky diode $D_1$ 4906 ensures that the voltage at the cathode of the photo diode $APD_1$ 4804 does not exceed the reverse bias voltage $U_{RB}$ after switching on again the suppression voltage $U_{Amp1}$ 4910.

The read-out circuit 4810 may include an amplifier 4916, e.g. an operational amplifier, e.g. a transimpedance amplifier, e.g. having an inverting input 4918 and a non-inverting input 4920. The inverting input 4918 may be coupled with the common signal line 4818 and the non-inverting input 4920 may be coupled to a reference potential such as ground potential 4922. The read-out circuit 4810 may further include a feedback resistor $R_{FB}$ 4924 and a feedback capacitor $C_{FB}$ 4926 connected in parallel, both being connected between the inverting input 4918 of the amplifier 4916 and an output 4928 of the amplifier 4916. Thus, the output 4928 of the amplifier 4916 is fed back via e.g. the trans-impedance amplification feedback resistor $R_{FB}$ 4924 and the low pass filter feedback capacitor $C_{FB}$ 4926 (which serves for the stabilisation of the circuit). An output voltage $U_{PD}$ 4930 provided at the output 4814 of the read-out circuit 4810 (which is on the same electrical potential as the output 4928 of the amplifier 4916) is approximately proportional to the photo current of the selected photo diode 4804 which is selected by means of the suppression voltages $U_{Amp1 \ldots N}$ 4910. The circuit portion being identified with index "1" (e.g. $APD_1$) in FIG. 49 is repeated for each of the N photo diodes.

In various embodiments, the pixels 3802 and thus the photo diodes 4804 of the pixels 3802 of a row (or of a column) may all be directly coupled (or alternatively via a filter circuit such as a low pass filter) to the common signal line 4818. The common signal line 4818 carries the sum of all photo currents and applies the same to the input 4812 of the read-out circuit 4810 (illustratively, all photo currents of pixels 3802 of a row (or a column) are summed up and are forwarded to a common amplifier in parallel). Each is pixel selection circuit 4806 may be configured to suppress the photo current of the photo diode of its respective pixel 3802 which is not selected to be read out by the read-out circuit 4810 by illustratively reducing the reverse bias voltage of the APD sensor array (in other words the sensor matrix). FIG. 47 shows a diagram 4700 illustrating an influence of a reverse bias voltage 4702 applied to an avalanche-type photo diode on the avalanche effect, in other words to the amplification (also referred to as multiplication) 4704 within the photo diode. A characteristic 4706 e.g. shows two regions in which the amplification is comparably high, e.g. a first region 4708 (e.g. following the threshold of the avalanche effect, in this example at about 40 V) and a second region 4710 (e.g. at the breakdown of the avalanche photo diode, in this example at about 280 V).

Thus, in order to suppress a respective pixel 3802, each pixel selection circuit 4806 may be configured to suppress the amplification of the photo diode 4804 of the respective pixel 3802. In order to do this, each pixel selection circuit 4806 may be configured to apply a total voltage at a non-selected pixel in a region where the amplification is as low as possible, ideally about zero. This is e.g. achieved if the total reverse bias voltage applied to a respective photo diode is in a third region 4712 of the characteristic 4706, e.g. a region below the threshold of the avalanche effect, e.g. below 25 V. It is to be noted that it may already be sufficient to reduce the total reverse bias voltage by a few volts to sufficiently reduce the contribution (noise) of the non-selected photo diode(s). In order to do this, each pixel selection circuit 4806 may be configured to provide the suppression voltage (at least) during a time when the associated pixel 3802 is not selected, so that the following applies:

$$U_{tRB}=U_{RB}-U_{SUP}<A_{th}, \qquad \text{Eq. 5}$$

wherein

- $U_{tRB}$ designates the total reverse bias voltage of a respective pixel 3802;
- $U_{RB}$ designates the reverse bias voltage of a respective pixel 3802;
- $U_{SUP}$ designates the suppression voltage of a respective pixel 3802; and
- $A_{th}$ designates the threshold of the avalanche effect of a respective pixel 3802.

Illustratively, as already described above, each pixel selection circuit 4806 may be configured to provide a negative voltage pulse of the suppression voltage $U_{SUP}$ (e.g. negative voltage pulse 4912 of the suppression voltage $U_{Amp1}$ 4910) to temporarily reduce the reverse bias voltage $U_{RB}$ at specific periods of time (e.g. based on a respective scan process), which is usually in a region to trigger the avalanche effect (e.g. above the threshold of the avalanche effect $A_{th}$).

In the selected pixel 3802, the pixel selection circuit 4806 may control the voltages so that the total reverse bias voltage $U_{tRB}$ is sufficiently high to trigger the avalanche effect (e.g. above the threshold of the avalanche effect $A_{th}$). This may be achieved if the pixel selection circuit 4806 of the selected pixel 3802 does not provide a suppression voltage (e.g. $U_{SUP}$=0 V).

The sensor controller 53 may be configured to control the pixel selection circuits 4806 to select or suppress each individual pixel 3802, e.g. in accordance with information provided by the First LIDAR Sensing System 40, which indicates which pixel 3802 in a respective sensor array row should be active (read out) at a specific period of time. This is dependent on the respective scan process. To do this, the First LIDAR Sensing System 40 provides corresponding scanning information about the scanning process to the sensor controller 53 to let it know which pixel(s) are illuminated at what time so that the sensor controller 53 controls the read-out circuit 4810 as well as the pixel selection circuits 4806 (e.g. of a specific row or of a specific column) accordingly.

FIG. 50 shows a flow diagram illustrating a method 5000 in accordance with various embodiments.

The method 5000 includes, in 5002, the pixel selection circuit selecting or suppressing the sensor pixel by controlling the amplification within the associated photo diode, and, in 5004, the at least one read-out circuit providing the electric variable at the output based on the electrical signal applied to the input.

It is to be noted that any type of two-dimensional sensor array may be used in the LIDAR Sensor System as described with reference to FIG. 46 to FIG. 50 above.

Furthermore, a circuit may be provided to synchronize the detected voltage signal with the MEMS mirror of the LIDAR Sensor System.

Moreover, it should be noted that the selection of one or more rows and/or one or more columns by means of a multiplexer may be provided using a mechanism as described with reference to FIG. 46 to FIG. 50 above. In general, the mechanism as described with reference to FIG. 46 to FIG. 50 above may be applied to any multiplexer disclosed herein.

The embodiments as described with reference to FIG. 46 to FIG. 50 above may be provided in a Flash LIDAR Sensor System as well as in a scanning LIDAR Sensor System.

In the following, various aspects of this disclosure will be illustrated:

Example 1e is a LIDAR Sensor System. The LIDAR Sensor System includes a plurality of sensor pixels. Each sensor pixel includes a photo diode. Each sensor pixel further includes a pixel selection circuit configured to select or suppress the sensor pixel by controlling the amplification within the associated photo diode or the transfer of photo electrons within the associated photo diode, and at least one read-out circuit having an input and an output and configured to provide an electric variable at the output based on an electrical signal applied to the input. At least some photo diodes of the plurality of sensor pixels are electrically (e.g. electrically conductively) coupled to the input of the at least one read-out circuit.

In Example 2e, the subject matter of Example 1e can optionally include that the pixel selection circuit is configured to select or suppress the sensor pixel only at specific periods of time.

In Example 3e, the subject matter of Example 2e can optionally include that the specific periods of time are associated with a LIDAR scanning process.

In Example 4e, the subject matter of any one of Examples 1e to 3e can optionally include that the photo diode is a pin diode.

In Example 5e, the subject matter of any one of Examples 1e to 3e can optionally include that the photo diode is a photo diode based on avalanche amplification.

In Example 6e, the subject matter of Example 5e can optionally include that the photo diode includes an avalanche photo diode. The pixel selection circuit is configured to select or suppress the sensor pixel by controlling the avalanche amplification within the associated photo diode.

In Example 7e, the subject matter of any one of Examples 5e or 6e can optionally include that the avalanche photo diode includes a single photon avalanche photo diode.

In Example 8e, the subject matter of Example 7e can optionally include that the LIDAR Sensor System further includes a silicon photomultiplier including the plurality of sensor pixels having single photon avalanche photo diodes.

In Example 9e, the subject matter of any one of Examples 1e to 8e can optionally include that the pixel selection circuit includes a reverse bias voltage input configured to receive a reverse bias voltage. The reverse bias voltage input is coupled to the cathode of the photo diode. The pixel selection circuit is configured to select or suppress the sensor pixel by controlling the reverse bias voltage supplied to the cathode of the photo diode.

In Example 10e, the subject matter of Example 9e can optionally include that the pixel selection circuit further includes a switch, e.g. a field effect transistor switch, connected between the reverse bias voltage input and the cathode of the photo diode.

In Example 11e, the subject matter of Example 9e can optionally include that the pixel selection circuit further includes a suppression voltage input configured to receive a suppression voltage. The suppression voltage input is coupled to the cathode of the photo diode. The pixel selection circuit is configured to select or suppress the pixel by controlling the suppression voltage.

In Example 12e, the subject matter of Example 11e can optionally include that the pixel selection circuit further includes a capacitor connected between the suppression voltage input and the cathode of the photo diode to capacitively couple the suppression voltage to the cathode of the photo diode.

In Example 13e, the subject matter of Example 12e can optionally include that the pixel selection circuit further includes a resistor connected between the reverse bias voltage input and the cathode of the photo diode such that the resistor and the capacitor form a low pass filter.

In Example 14e, the subject matter of Example 13e can optionally include that the pixel selection circuit further includes a Schottky diode connected between the reverse bias voltage input and the cathode of the photo diode and in parallel to the resistor.

In Example 15e, the subject matter of any one of Examples 1e to 8e can optionally include that the pixel selection circuit includes a negative bias voltage input configured to receive a negative bias voltage. The negative bias voltage input is coupled to the anode of the photo diode. The pixel selection circuit is configured to select or suppress the sensor pixel by controlling the negative bias voltage supplied to the anode of the photo diode.

In Example 16e, the subject matter of Example 15e can optionally include that the pixel selection circuit further includes a switch, e.g. a field effect transistor switch, connected between the negative bias voltage input and the anode of the photo diode.

In Example 17e, the subject matter of Example 15e can optionally include that the pixel selection circuit further includes a suppression voltage input configured to receive a suppression voltage. The suppression voltage input is coupled to the anode of the photo diode. The pixel selection circuit is configured to select or suppress the pixel by controlling the suppression voltage.

In Example 18e, the subject matter of Example 17e can optionally include that the pixel selection circuit further includes a capacitor connected between the suppression voltage input and the anode of the photo diode to capacitively couple the suppression voltage to the anode of the photo diode.

In Example 19e, the subject matter of Example 18e can optionally include that the pixel selection circuit further includes a resistor connected between the negative bias voltage input and the anode of the photo diode such that the resistor and the capacitor form a low pass filter.

In Example 20e, the subject matter of Example 19e can optionally include that the pixel selection circuit further includes a Schottky diode connected between the negative bias voltage input and the anode of the photo diode and in parallel to the resistor.

In Example 21e, the subject matter of any one of Examples 1e to 20e can optionally include that the plurality of sensor pixels are arranged in a matrix including a plurality of rows and a plurality of columns. All sensor pixels of a respective row or a respective column are connected to one common read-out circuit.

In Example 22e, the subject matter of any one of Examples 1e to 21e can optionally include that the at least one read-out circuit includes an amplifier circuit configured to amplify the electrical signal applied to the input to provide the electric variable at the output.

In Example 23e, the subject matter of Example 22e can optionally include that the amplifier circuit is a transimpedance amplifier configured to amplify an electrical current signal applied to the input to provide an electric voltage at the output.

In Example 24e, the subject matter of Example 23e can optionally include that the input of the transimpedance amplifier is the inverting input of the transimpedance amplifier. The transimpedance amplifier further includes a non-inverting input coupled to a reference potential.

In Example 25e, the subject matter of Example 24e can optionally include that the at least one read-out circuit further includes a low pass capacitor connected between the output of the transimpedance amplifier and the inverting input of the transimpedance amplifier.

In Example 26e, the subject matter of any one of Examples 1e to 25e can optionally include that the LIDAR Sensor System further includes an emitter optics arrangement configured to deflect light beams to illuminate a column of a Field-of-View of the LIDAR Sensor System at a specific period of time.

Example 27e is a method for any one of examples 1e to 26e. The method includes the pixel selection circuit selecting or suppressing the sensor pixel by controlling the amplification within the associated photo diode, and the at least one read-out circuit providing the electric variable at the output based on the electrical signal applied to the input.

In Example 28e, the subject matter of Example 27e can optionally include that the photo diode includes an avalanche photo diode. The pixel selection circuit selects or suppresses the sensor pixel by controlling the avalanche amplification within the associated photo diode.

In Example 29e, the subject matter of any one of Examples 27e or 28e can optionally include that the pixel selection circuit receives a reverse bias voltage. The reverse bias voltage input is coupled to the cathode of the photo diode. The pixel selection circuit selects or suppresses the pixel by controlling the reverse bias voltage supplied to the cathode of the photo diode.

In Example 30e, the subject matter of Example 29e can optionally include that the pixel selection circuit connects or disconnects the reverse bias voltage with or from the cathode of the photo diode using a switch, e.g. a field effect transistor switch, connected between the reverse bias voltage input and the cathode of the photo diode.

In Example 31e, the subject matter of Example 29e can optionally include that the pixel selection circuit receives a suppression voltage. The suppression voltage input is coupled to the cathode of the photo diode. The pixel selection circuit selects or suppresses the sensor pixel by controlling the suppression voltage.

In Example 32e, the subject matter of any one of Examples 30e or 31e can optionally include that the pixel selection circuit receives a negative bias voltage. The negative bias voltage input is coupled to the anode of the photo diode. The pixel selection circuit selects or suppresses the sensor pixel by controlling the negative bias voltage supplied to the anode of the photo diode.

In Example 33e, the subject matter of Example 32e can optionally include that the pixel selection circuit connects or disconnects the negative bias voltage with or from the anode of the photo diode using a switch, e.g. a field effect transistor switch, connected between the negative bias voltage input and the anode of the photo diode.

In Example 34e, the subject matter of Example 33e can optionally include that the pixel selection circuit receives a suppression voltage. The suppression voltage input is coupled to the anode of the photo diode. The pixel selection circuit selects or suppresses the sensor pixel by controlling the suppression voltage.

In Example 35e, the subject matter of any one of Examples 27e to 34e can optionally include that the at least one read-out circuit amplifies the electrical signal applied to the input to provide the electric variable at the output.

In Example 36e, the subject matter of Example 35e can optionally include that the amplifier circuit amplifies an electrical current signal applied to the input to provide an electric voltage at the output.

Example 37e is a computer program product. The computer program product includes a plurality of program instructions that may be embodied in non-transitory computer readable medium, which when executed by a computer program device of a LIDAR Sensor System according to any one of Examples 1e to 26e, cause the LIDAR Sensor System to execute the method according to any one of the Examples 27e to 36e.

Example 38e is a data storage device with a computer program that may be embodied in non-transitory computer readable medium, adapted to execute at least one of a method for LIDAR Sensor System according to any one of the above method examples, a LIDAR Sensor System (50) according to any one of the above LIDAR Sensor System examples.

In a row detector (also referred to as row sensor) 52 having a plurality of photo diodes (in other words sensor pixels) 2602 arranged in series, there are cases that neighboring groups of photo diodes 2602 are to be read out. In order to save subsequent amplifier stages, one can merge several photo diodes 2602 via a multiplexer to an amplifier. The photo diodes 2602 that are merged through a multiplexer may then all belong to different groups of photo diodes, i.e. these photo diodes are generally not adjacent to each other, but are scattered far across the detector 52.

In order to keep the wiring paths short and to prevent crossovers of low capacitive signal paths on the circuit board, connections between photo diodes scattered far across the detector 52 to a multiplexer should be avoided. Usually, adjacent or every other photo diode 2602 is routed to a multiplexer. The latter e.g. when every second photo diode 2602 is led out to one side of the detector 52 housing and the others to the other (opposite) side.

Various aspects of this disclosure are based on crossings of the signal paths already inside the detector (housing) and not leading them out of the detector (housing) in the same order in which the photo diodes 2602 are arranged, but instead mixing them in such a way that adjacent pins on the detector (housing) belong to widely spaced photo diodes 2602. By way of example, the photo current of the photo diode 2602 with the position x is guided onto the output pin y, so that x corresponds in binary representation to the number y in binary representation if read from behind.

By a suitable wiring within the detector (housing), signal paths can be crossed, without a significant lengthening of the signal paths and with significantly lower capacitive coupling, because the dimensions of the corresponding signal tracks are significantly smaller on the photo diode chip than on a printed circuit board (PCB). For example, if a detector 52 with 32 photo diodes 2602 is to be grouped into eight groups of four photo diodes 2602, since it is desired to implement only eight amplifier circuits, one may lead the photo current of each of the photo diodes 2602 at the locations i, 8+i, 16+i, 24+i for i from 1 to 8 directly via a multiplexer to the i-th amplifier. This allows to illuminate groups of adjacent photodiodes separately in LIDAR applications, which in turn reduces the required output power of the transmitter laser diodes, since only a part of the scene has to be illuminated.

As will be described further below, a LIDAR Sensor System may include an amplifier stage connected downstream of one or more photo diodes. In the case of a row detector 52 having a plurality of photo diodes 2602 arranged in a row, it may occur that groups of neighboring photo diodes 2602 should be read out. In order to reduce the number of required downstream connected amplifiers (which are rather expensive) a plurality of photo diodes 2602 may be brought together and connected to one common amplifier via a multiplexer. The photo diodes 2602 brought together via a respective multiplexer should in such a case all belong to different groups of photo to diodes 2602. Thus, those photo diodes 2602 should not be arranged adjacent to one another but rather widely distributed over the detector area.

To keep the wiring paths between the photo diodes 2602 short and to avoid or at least reduce the number of crossings of low capacity signal paths on a carrier such as a printed circuit board (PCB), it may be is avoided to guide signals which are widely distributed over the detector area to one multiplexer. Usually, adjacent or every second photo diode 2602 may be guided to one common multiplexer. This may be provided e.g. in case of a detector housing leading through every first photo diode 2602 to a first side of the detector housing and every second photo diode 2602 to a second side of the detector housing opposite to the first side.

[0001000] The photo diodes 2602 may be arranged on a common carrier. The photo diodes 2602 may be free of encapsulation material, e.g. in case of so called chip-on board (CoB) photo diodes 2602. As an alternative, the photo diodes 2602 may be encapsulated, e.g. using encapsulation materials which are well suited for a temperature range between about −40° C. up to about 85° C. Moreover, in any of the alternatives mentioned before, the photo diodes 2602 may be all arranged in a common detector housing. In all these embodiments, each photo diode 2602 is coupled to exactly one detector connecting structure 6904. The detector connecting structures 6904 may be provided, e.g. fixedly mounted on the common carrier or on the optional encapsulation. The detector connecting structures 6904 in this case may be implemented as detector connecting pads (e.g. detector connecting metal pads). In various embodiments, the detector connecting structures 6904 may be provided in the detector housing, e.g. extending through a wall of the detector housing. The detector connecting structures 6904 in this case may be implemented as detector connecting pins (e.g. detector connecting metal pins).

As will be described in more detail below, various embodiments may provide a signal path layout such that the signal paths already cross each other within the detector housing (if it exists) or e.g. on or within the common carrier or common encapsulation of the plurality of photo diodes 2602 and are not led out of the detector housing or from the common carrier or the common encapsulation in accordance with the order in which the photo diodes 2602 are arranged on the common carrier. In other words, various embodiments may provide a signal path layout such that the signal paths already cross each other in the signal paths between the photo diode contact pad of each respective photo diode 2602 of the plurality of photo diodes 2602 and the detector connecting structures 6904 (e.g. connecting pads or connecting pins). These connections provided by a first connection network may form a first connecting scheme. In general, the first connection network may be configured to couple the plurality of photo diodes with the detector connecting structures 6904 in accordance with a first connecting scheme.

Furthermore, various embodiments may provide the signal path layout such that the signal paths from the detector housing (if it exists) or e.g. from the common carrier or from the common encapsulation of the plurality of photo diodes 2602 towards further (downstream) electronic components have a lower number of crossings as compared with the signal paths in accordance with the first connecting scheme as described above. In other words, various embodiments may provide a signal path layout such that the signal paths have a lower number of signal path crossings between the detector connecting structures 6904 (e.g. connecting pads or connecting pins) and the inputs of downstream connected multiplexers, which in turn are further connected with amplifiers. Exactly one amplifier may be connected downstream of an associated exactly one multiplexer. These connections provided by a second connection network may form a second connecting scheme. In general, the second connection network may be configured to couple the detector connecting structures 6904 with the multiplexer inputs in accordance with a second connecting scheme. The first connection network includes a larger number of crossing connections than the second connection network. Thus, by way of example, adjacent detector connecting structures 6904 are associated with photo diode contact pads of photo diodes which are arranged at a rather large distance from each other on the common carrier.

In various embodiments, a unique diode location number may be assigned to the location of each photo diode 2602 of the plurality of photo diodes 2602 and thus indirectly to each photo diode 2602. The diode location numbers may be assigned to the location of each photo diode 2602 of the plurality of photo diodes 2602 such that the diode location number is increasing along a diode placement orientation along which the plurality of photo diodes are arranged, e.g. along a row (or column) of a one-dimensional detector array. Furthermore, the photo diodes are grouped into a plurality of diode groups in accordance with their location. The photo diodes within a diode group are arranged closest together along the diode placement orientation. In various embodiments, all the photo diodes of a diode group are each located adjacent to another one of the photo diodes of the same diode group. Illustratively, there may be no photo diode 2602 assigned to one diode group and being arranged between two photo diodes 2602 of another diode group. As will be described below, the number of photo diodes within each diode group may be equal to the number of provided multiplexers.

Moreover, in various embodiments, a unique structure location number may be assigned to the location of each detector connecting structure 6904 of the plurality of detector connecting structures 6904 and thus indirectly to each detector connecting structure 6904. The structure location numbers may be assigned to the location of each detector connecting structure 6904 of the plurality of detector connecting structures 6904 such that the structure location number is increasing along a detector connecting structure 6904 placement orientation along which the plurality of detector connecting structures 6904 are arranged. The detector connecting structures 6904 may be grouped into a plurality of structure groups in accordance with their location. The detector connecting structures 6904 within a structure group may be arranged closest together along a structure placement orientation along which the plurality of detector connecting structures 6904 are arranged. The number of detector connecting structures 6904 within each is structure group is equal to the number of photo diodes 2602 in the receiver photo diode array 7002 divided by the number of multiplexers 6814.

Illustratively, there may be no detector connecting structure 6904 assigned to one structure group and being arranged between two detector connecting structures 6904 of another structure group. As will be described below, the number of detector connecting structures 6904 within each structure group may be equal to the number of provided photo diodes divided by the number of multiplexers.

The first connecting scheme is configured such that a detector connecting structure 6904 (which is associated with a structure location number in binary representation) is coupled to that photo diode of the plurality of photo diodes (which is associated with the diode location number) having the reverse of the diode location number in binary representation as the structure location number.

Thus, in various embodiments, if a photo diode having a diode location number×(in other words, being located at a position x) is connected to a detector connecting structure 6904 having a structure location number y (in other words, being located at a position y) in such a way that the diode location number x in binary number representation corresponds to the binary representation of the structure location number y read from the other direction ("read from behind", i.e. read from right-side to left-side). In other words, the first connecting scheme is determined such that a structure location number y in binary number representation is the reverse of the diode location number x in binary number representation for each connection pair (in other words for each couple) (photo diode contact pad—detector connecting structure 6904), thus implementing a mathematical concept of bit-reversed order or bit-reversal permutation, respectively.

FIG. 68 shows an overview of a portion 6800 of the LIDAR Sensor System. In these embodiments, the LIDAR Sensor System is configured as a scanning LIDAR Sensor System.

The light source 42 emits an emitted light beam 6802 through a transmitter optics 6804. The emitted light beam 6802 is reflected by a target object 100 and may be scanned column 6806 by column 6806 (i.e., the LIDAR Sensor System presented in FIG. 68 illuminates the target scene column-wise). A correspondingly reflected light beam 6808 is received by the sensor 52 via the detection optics 51 in a row-wise manner. The resolution of the rows may be implemented by a receiver photo diode array 6810. Each of the s rows 6812 (s may be any integer number equal to or larger than "1") of the target scene may be imaged (mapped) to (exactly) one photo diode 2602 of the plurality of photo diodes 2602. A plurality of multiplexers 6814 (e.g. a plurality of the row multiplexers 6814) is connected downstream of the receiver photo diode array 6810. Furthermore, FIG. 68 shows a plurality of the amplifiers 2626 (e.g. transimpedance amplifiers 2626). Exactly one amplifier 2626 is connected downstream of a respectively associated multiplexer 6814. A plurality of analog-to-digital converters 2630 are provided. Exactly one analog-to-digital converter 2630 is connected downstream of a respectively associated amplifier 2626. Each analog-to-digital converter 2630 is configured to provide a respective digitized voltage value 2632 of a respective voltage signal 2628 supplied by the associated amplifier 2626.

In various embodiments, not all rows of the scene are received at the same time, but q (q is an integer number equal to or larger than "1") photo diode signals are forwarded to m amplifiers 2626 and q analog-to-digital converters 2630. The selection of the forwarded photo diode signals 6816 provided by the photo diodes 2602 and supplied to the inputs of the multiplexers 2814 is performed by a respective multiplexer 2814 of the plurality of multiplexers 2814. A controller (not shown) may be configured to control the multiplexers 2814 to select the respectively associated and thus to be forwarded photo diode signals 6816. The controller may e.g. be a controller of the light source driver. Thus, in various embodiments, the control signal provided by the controller to control the multiplexers 6814 may be the same signal which may be provided to select one or more associated photo diodes 2602.

In an example of s=64 rows of the receiver photo diode array 6810 and q=16 amplifiers 2626 and analog-to-digital-converters 2630, each column 6806 is illuminated at least s/q=4 times in order to detect all channels. In order to avoid an unnecessary illumination of (1−q/s)=% of a respective column 6806, it may be provided to illuminate only those regions, which are also detected. To achieve this, the detected rows of the receiver photo diode array 6810 are selected to be located adjacent to one another. This means that each amplifier 2626 can be connected (switched) to respectively one channel out of each structure group.

In order to keep the length of the wiring e.g. on the PCB as short as possible, in various embodiments, the crossing connections are mainly provided within the detector between the photo diode contact pads and the associated detector connecting structure 6904. In various embodiments, one or more CMOS metallization layers of the detector chip may be provided to implement the majority of the crossing connections, since there exists a high demand with respect to the crosstalking between the channels and the capacities for the subsequent circuit(s). The input capacitances of the amplifiers 2626 should be in the lower pF range to provide a circuit having a sufficiently large bandwidth. Wirings on the PCB are larger in size and thus have a higher capacitance and inductivity, which has a negative effect on the bandwidth of the circuit. In order to forward an arbitrary number of b=2^k photo diodes 2602 to the amplifiers 2626 without crossing the inputs of the multiplexers 6814, the connections within the receiver photo diode array 6810 may be led out of the receiver photo diode array 6810 in bit-reversed order (in other words with bit-reversal permutation).

FIG. 69 illustrates a wiring scheme of a portion 6900 of a LIDAR Sensor System in which the majority of crossing connections is between detector connecting structures 6904 of the receiver photo diode array 6810 and inputs of the multiplexers 6814. The receiver photo diode array 6810 includes a plurality of photo diodes 2602, which are arranged along a line (symbolized in FIG. 69 by means of an arrow 6906). A unique diode location number is assigned to each photo diode 2602 to identify the photo diode and its location within the receiver photo diode array 6810. In this example, the topmost photo diode 2602 is assigned a diode location number "0" and the bottommost photo diode 2602 is assigned a diode location number "31". Thus, 32 photo diodes 2602 are provided in this example. Each photo diode 2602 has a photo diode contact pad (not shown) electrically coupled (not shown) to a respective detector connecting structure 6904. The coupling in this conventional wiring scheme is determined such that:

the topmost photo diode 2602 with the assigned diode location number "0" is coupled to the detector connecting structure 6904 number "0";

the photo diode 2602 with the assigned diode location number "1" is coupled to the detector connecting structure 6904 number "1";

the photo diode 2602 with the assigned diode location number "2" is coupled to the detector connecting structure 6904 number "2";

. . . ; and the bottommost photo diode 2602 with the assigned diode location number "31" is coupled to the detector connecting structure 6904 number "31".

With this wiring scheme, there are usually no crossing connections in the wiring between the photo diode connecting pads and the detector connecting structures 6904.

However, as shown in FIG. 69, the wiring scheme between the detector connecting structures 6904 and the inputs of the multiplexers 6814 includes a high number of crossing connections 6902. Furthermore, transimpedance amplifiers 2626 are connected downstream to the multiplexers 6814. The receiver photo diode array 6810 and the multiplexers 6814 and the amplifiers 2626 are usually mounted on a common carrier such as a PCB.

This conventional wiring of the photo diode contact pads through the housing of the receiver photo diode array 6810 and the resulting crossings of the signal paths on the common carrier, usually a PCB, results in a high level of interference. The resulting increase of noise and crosstalking makes such an implementation very difficult.

FIG. 70 shows an overview of a portion 7000 of the LIDAR Sensor System illustrating a wiring scheme in accordance with various embodiments.

The LIDAR Sensor system may include:

a receiver photo diode array 7002;

a plurality of multiplexers 6814 downstream connected to the receiver photo diode array 7002; and a plurality of amplifiers 2626 downstream connected to the plurality of multiplexers 6814.

The receiver photo diode array 7002 may include a plurality of photo diodes 2602

The receiver photo diode array 7002 may be implemented in various different ways. By way of example, the receiver photo diode array 7002 may be implemented as a Chip on Board array, which will be described in more detail below. Furthermore, the receiver photo diode array 7002 may be implemented having a housing.

In any embodiment described herein, the receiver photo diode array 7002 may include a plurality of photo diodes 2602. The plurality of photo diodes 2602 may be arranged in accordance with a predefined manner, e.g. linearly along a diode placement orientation (symbolized in FIG. 70 by means of a further arrow 7014). A (e.g. unique) diode location number may be assigned to the location of a photo diode 2602 of the plurality of photo diodes 2602 within the receiver photo diode array 7002. Each photo diode 2602 includes at least two photo diode contact structures (such as e.g. two photo diode contact pins or two photo diode contact pads) to mechanically and electrically contact the respective photo diode 2602. In various embodiments, a first photo diode contact structure of the two photo diode contact structures of each photo diode 2602 may be coupled to a reference potential such as e.g. ground potential. In various embodiments, a first photo diode contact pad may be provided at the front side of each photo diode 2602 and a second photo diode contact pad may be provided at the opposing back side of each photo diode 2602. Furthermore, the dimensions of a first photo diode contact pad and a corresponding second photo diode contact pad may be different. By way of example, the first photo diode contact pad may be implemented as a contact strip which may be broader than the second photo diode contact pad. Moreover even a plurality of photo diode contact pads may be provided on the front side and/or on the back side of each photo diode 2602 (at least some photo diode contact pads at each side may be electrically coupled to each other).

The plurality of photo diodes 2602 may be arranged such that the value of the diode location number is increasing along the diode placement orientation along which the plurality of photo diodes 2602 are arranged.

By way of example,

- a first photo diode PD00 may be located at the topmost position within the receiver photo diode array 7002 and the diode location number (in binary number representation) "00000" may be assigned to the first photo diode PD00;
- a second photo diode PD01 may be located at the second topmost position within the receiver photo diode array 7002 and the diode location number (in binary number representation) "00001" may be assigned to the second photo diode PD01;
- a third photo diode PD02 may be located at the third topmost position within the receiver photo diode array 7002 and the diode location number (in binary number representation) "00010" may be assigned to the third photo diode PD02;
- . . . ; and
- a thirty-first photo diode PD30 may be located at the second bottommost position within the receiver photo diode array 7002 and the diode location number (in binary number representation) "11110" may be assigned to the thirty-first photo diode PD30; and
- a thirty-second photo diode PD31 may be located at the bottommost position within the receiver photo diode array 7002 and the diode location number (in binary number representation) "11111" may be assigned to the thirty-second photo diode PD31.

The following table 1 summarizes a possible assignment of the diode location numbers (in binary number representation) to the photo diodes 2602 PDxx within the receiver photo diode array 7002 with reference to FIG. 70 in accordance with various embodiments:

TABLE 1

| Photo diode PDxx (xx decimal) | Diode location number (binary) |
|---|---|
| PD00 | 00000 |
| PD01 | 00001 |
| PD02 | 00010 |
| PD03 | 00011 |
| PD04 | 00100 |
| PD05 | 00101 |
| PD06 | 00110 |
| PD07 | 00111 |
| PD08 | 01000 |
| PD09 | 01001 |
| PD10 | 01010 |
| PD11 | 01011 |
| PD12 | 01100 |
| PD13 | 01101 |
| PD14 | 01110 |
| PD15 | 01111 |
| PD16 | 10000 |
| PD17 | 10001 |
| PD18 | 10010 |
| PD19 | 10011 |
| PD20 | 10100 |
| PD21 | 10101 |
| PD22 | 10110 |
| PD23 | 10111 |
| PD24 | 11000 |
| PD25 | 11001 |
| PD26 | 11010 |
| PD27 | 11011 |
| PD28 | 11100 |
| PD29 | 11101 |
| PD30 | 11110 |
| PD31 | 11111 |

In any embodiment described herein, the receiver photo diode array 7002 may include detector connecting structures 6904 (such as e.g. detector connecting pads or detector connecting pins) 7004. The detector connecting structures 7004 may be a part of an interface or may form the interface of the receiver photo diode array 7002. Illustratively, the detector connecting structures 7004 are provided to allow a mechanical and electrical contact of the photo diodes 2602 with one or more components external from the receiver photo diode array 7002, e.g. with the multiplexers 6814.

The plurality of detector connecting structures 7004 may be arranged in accordance with a predefined manner, e.g. linearly along a structure placement orientation. The detector connecting structures 7004 may be arranged in a symmetrical manner on two opposite sides of the receiver photo diode array 7002. A (e.g. unique) structure location number may be assigned to the location of a detector connecting structure 7004 of the plurality of detector connecting structures 7004 within the receiver photo diode array 7002.

The plurality of detector connecting structures 7004 may be arranged such that the value of the structure location number is increasing along the structure placement orientation along which the plurality of detector connecting structures 7004 are arranged. If the detector connecting structures 7004 are arranged on a plurality of sides, the structure location number is increasing along the structure placement orientation on a first side and then further increases along the structure placement orientation on a second side, starting at the same position of the plurality of detector connecting structures 7004 at the second side at which it started at the first side.

By way of example,

- a first detector connecting structure CS00 may be located at the topmost position at a first side (left side in FIG. 70) within the receiver photo diode array 7002 and the structure location number (in binary number representation) "00000" may be assigned to the first detector connecting structure CS00;
- a second detector connecting structure CS01 may be located at the second topmost position at the first side within the receiver photo diode array 7002 and the structure location number (in binary number representation) "10000" may be assigned to the second detector connecting structure CS01;
- a third detector connecting structure CS02 may be located at the third topmost position at the first side within the receiver photo diode array 7002 and the structure location number (in binary number representation) "01000" may be assigned to the third detector connecting structure CS02; . . . (and so on) . . . ;
- a sixteenth detector connecting structure CS15 may be located at the bottommost position at the first side within the receiver photo diode array 7002 and the structure location number (in binary number representation) "11110" may be assigned to the sixteenth detector connecting structure CS15;
- a seventeenth detector connecting structure CS16 may be located at the topmost position at a second side opposite to the first side (right side in FIG. 70) within the receiver photo diode array 7002 and the structure location number (in binary number representation) "00001" may be assigned to the seventeenth detector connecting structure CS16;
- an eighteenth detector connecting structure CS17 may be located at the second topmost position at the second side within the receiver photo diode array 7002 and the structure location number (in binary number representation) "10001" may be assigned to the eighteenth detector connecting structure CS17;
- a nineteenth detector connecting structure CS18 may be located at the third topmost position at the second side within the receiver photo diode array 7002 and the structure location number (in binary number representation) "01001" may be assigned to the nineteenth detector connecting structure CS18; . . . (and so on) . . . ;
- a thirty-first detector connecting structure CS30 may be located at the second bottommost position at the second side within the receiver photo diode array 7002 and the structure location number (in binary number representation) "01111" may be assigned to the thirty-first detector connecting structure CS30; and
- a thirty-second detector connecting structure CS31 may be located at the bottommost position at the second side within the receiver photo diode array 7002 and the structure location number (in binary number representation) "11111" may be assigned to the thirty-second detector connecting structure CS31.

The following Table 2 summarizes a possible assignment of the structure location numbers (in binary number representation) to the detector connecting structures 7004 CSyy (in decimal number representation) and to the detector connecting structures 7004 CSzzzzz (in binary number representation) within the receiver photo diode array 7002 with reference to FIG. 70 in accordance with various embodiments:

TABLE 2

| Connecting structure CSyy (yy decimal) | Connecting structure CSzzzzz (zzzzz binary) | Structure location number (binary) |
|---|---|---|
| CS00 | CS00000 | 00000 |
| CS01 | CS00001 | 10000 |
| CS02 | CS00010 | 01000 |
| CS03 | CS00011 | 11000 |
| CS04 | CS00100 | 00100 |
| CS05 | CS00101 | 10100 |
| CS06 | CS00110 | 01100 |
| CS07 | CS00111 | 11100 |
| CS08 | CS01000 | 00010 |
| CS09 | CS01001 | 10010 |
| CS10 | CS01010 | 01010 |
| CS11 | CS01011 | 11010 |
| CS12 | CS01100 | 00110 |
| CS13 | CS01101 | 10110 |
| CS14 | CS01110 | 01110 |
| CS15 | CS01111 | 11110 |
| CS16 | CS10000 | 00001 |
| CS17 | CS10001 | 10001 |
| CS18 | CS10010 | 01001 |
| CS19 | CS10011 | 11001 |
| CS20 | CS10100 | 00101 |
| CS21 | CS10101 | 10101 |
| CS22 | CS10110 | 01101 |
| CS23 | CS10111 | 11101 |
| CS24 | CS11000 | 00011 |
| CS25 | CS11001 | 10011 |
| CS26 | CS11010 | 01011 |
| CS27 | CS11011 | 11011 |
| CS28 | CS11100 | 00111 |
| CS29 | CS11101 | 10111 |
| CS30 | CS11110 | 01111 |
| CS31 | CS11111 | 11111 |

In various embodiments, the value of the structure location number assigned to the detector connecting structures CSyy may be selected to be the binary reverse value of the number of the detector connecting structures CSyy (in binary number representation).

A first connection network 7006 may be provided to electrically couple the plurality of photo diodes 2602 with the detector connecting structures 7004. In more detail, a respective second photo diode contact structure of the two photo diode contact structures of each photo diode 2602 may be coupled to an (e.g. exactly one) associated detector connecting structure 7004 of the plurality of detector connecting structures 7004. The first connection network 7006 is configured to couple the plurality of photo diodes 2602 with the detector connecting structures 7006 in accordance with a first connecting scheme.

The first connecting scheme may couple the respective second photo diode contact structure of the two photo diode contact structures of a respective photo diode 2602 having an assigned binary diode location number value with a respective detector connecting structure 7006 having assigned the binary structure location number value having the reversed (binary) order number of the respective binary diode location number.

The following Table 3 summarizes a possible first connecting scheme within the receiver photo diode array 7002 with reference to FIG. 70 in accordance with various embodiments:

TABLE 3

| Photo diode PDxx (xx decimal) | Diode location number (binary) | Reverse order of diode location number (binary) | Corresponding connecting structure CSzzzzz (zzzzz binary) | Corresponding connecting structure CSyy (yy decimal) |
|---|---|---|---|---|
| PD00 | 00000 | 00000 | CS00000 | CS00 |
| PD01 | 00001 | 10000 | CS10000 | CS16 |
| PD02 | 00010 | 01000 | CS01000 | CS08 |
| PD03 | 00011 | 11000 | CS11000 | CS24 |
| PD04 | 00100 | 00100 | CS00100 | CS04 |
| PD05 | 00101 | 10100 | CS10100 | CS20 |
| PD06 | 00110 | 01100 | CS01100 | CS12 |
| PD07 | 00111 | 11100 | CS11100 | CS28 |
| PD08 | 01000 | 00010 | CS00010 | CS02 |
| PD09 | 01001 | 10010 | CS10010 | CS18 |
| PD10 | 01010 | 01010 | CS01010 | CS10 |
| PD11 | 01011 | 11010 | CS11010 | CS26 |
| PD12 | 01100 | 00110 | CS00110 | CS06 |
| PD13 | 01101 | 10110 | CS10110 | CS22 |
| PD14 | 01110 | 01110 | CS01110 | CS14 |
| PD15 | 01111 | 11110 | CS11110 | CS30 |
| PD16 | 10000 | 00001 | CS00001 | CS01 |
| PD17 | 10001 | 10001 | CS10001 | CS17 |
| PD18 | 10010 | 01001 | CS01001 | CS09 |
| PD19 | 10011 | 11001 | CS11001 | CS25 |
| PD20 | 10100 | 00101 | CS00101 | CS05 |
| PD21 | 10101 | 10101 | CS10101 | CS21 |
| PD22 | 10110 | 01101 | CS01101 | CS13 |
| PD23 | 10111 | 11101 | CS11101 | CS29 |
| PD24 | 11000 | 00011 | CS00011 | CS03 |
| PD25 | 11001 | 10011 | CS10011 | CS19 |
| PD26 | 11010 | 01011 | CS01011 | CS11 |
| PD27 | 11011 | 11011 | CS11011 | CS27 |
| PD28 | 11100 | 00111 | CS00111 | CS07 |
| PD29 | 11101 | 10111 | CS10111 | CS23 |
| PD30 | 11110 | 01111 | CS01111 | CS15 |
| PD31 | 11111 | 11111 | CS11111 | CS31 |

By way of example, in accordance with the first connecting scheme,

- the first photo diode PD00 may be coupled to the first detector connecting structure CS00;
- the second photo diode PD01 may be coupled to the seventeenth detector connecting structure CS16;
- the third photo diode PD02 may be coupled to the ninth detector connecting structure CS08; . . . (and so on) . . . ;
- the twentieth photo diode PD19 may be coupled to the twenty-sixth detector connecting structure CS25; . . . (and so on) . . . ;
- the thirty-first photo diode PD30 may be coupled to the sixteenth detector connecting structure CS15; and
- the thirty-second photo diode PD31 may be coupled to the thirty-second detector connecting structure CS31.

The first connection network 7006 may be implemented in one or more metallization layers of the receiver photo diode array 7002. In various embodiments, the first connection network 7006 may be implemented using one or more lines or one or more cables and/or electrically conductive tracks within the receiver photo diode array 7002, e.g. within the encapsulation material encapsulating the photo diodes 2602 of the receiver photo diode array 7002.

Furthermore, a second connection network 7008 may be provided to couple the detector connecting structures 7004 with the plurality of multiplexer inputs 7010. In various embodiments, each multiplexer 6814 may have a number n of multiplexer inputs 7010 that are determined by the number m of photo diodes 2602 divided by the number p of provided multiplexers 6814 (n=m/p). In the exemplary case of 32 photo diodes 2602 and eight multiplexers 6814, each multiplexer 6814 may have four inputs 7010 (n=32/8=4). In various embodiments, the number of inputs 7010 of the multiplexers 6814 may be different and some multiplexers 6814 of the plurality of multiplexer 6814 may have a different number of inputs 7010 than other multiplexers 6814 of the plurality of multiplexer 6814.

The second connection network 7008 may be configured to couple the detector connecting structures 7004 with the plurality of multiplexer inputs 7010 in accordance with a second connecting scheme. In various embodiments, the first connection network 7006 includes a larger number of crossing connections than the second connection network 7010.

Since the connections of the first connection network 7004 are smaller and shorter, the interference between crossing connections of the first connection network 7004 is potentially smaller than between crossing connections of the second connection network 7008, and the capacitance of the whole wiring is potentially smaller in case of the crossings being realized in the connection network 7004 as if the crossings would be realized in the second connection network 7008.

By way of example, the second connection network 7008 may be configured such that there are no crossing connections between the detector connecting structures 7004 and the multiplexer inputs 7010. Thus, the signal paths provided by the second connection network 7008 in accordance with the second connecting scheme are short and have no or almost no crossings.

Each multiplexer 6814 has at least one multiplexer output, which is electrically connected to a respectively associated amplifier 2626, e.g. a transimpedance amplifier (TIA) 2626. In various embodiments, exactly one amplifier 2626 may be connected downstream to an associated multiplexer 6814 to provide an analog voltage for an input analog photo current signal 7012 provided a photo diode 2602 of the receiver photo diode array 7002 and selected by the associated multiplexer 6814.

Furthermore, a plurality of analog-to-digital converters 2630 are provided. Exactly one analog-to-digital converter 2630 is connected downstream of a respectively associated amplifier 2626. Each analog-to-digital converter 2630 is configured to provide a respective digitized voltage value 2632 of a respective analog voltage signal 2628 supplied by the associated amplifier 2626.

In more general terms, the location of the detector connecting structures may be associated with a structure location number. The plurality of detector connecting structures may be arranged such that the structure location number is increasing along the structure placement orientation along which the plurality of detector connecting structure are arranged. The photo diodes may be grouped into a plurality of diode groups 7016 in accordance with their location. The photo diodes within a diode group 7016 are arranged closest together along the diode placement orientation. The number of photo diodes within each diode group 7016 may be equal to the number of multiplexers 6814. The detector connecting structures are grouped into a plurality of structure groups in accordance with their location. The detector connecting structures within a structure group are arranged closest together along a structure placement orientation along which the plurality of detector connecting structures are arranged. The number of detector connecting structures within each structure group is equal to the number of photo diodes 2602 in the receiver photo diode array 7002 divided by the number of multiplexers 6814.

The first connection network 7006 and the second connection network 7008 are configured such that the photo diodes 2602 coupled to the same multiplexer 6814 of the plurality of multiplexers 6814 are from different diode groups 7016.

FIG. 71 shows an overview of a portion 7100 of the LIDAR Sensor System illustrating a wiring scheme in accordance with various embodiments in more detail. FIG. 71 shows the first connecting scheme implemented by the first connection network 7006 in accordance with Table 3 described above. Furthermore, the second connecting scheme implemented by the second connection network 7008 may be provided without any crossing connections.

Illustratively, the large number of crossing connections is moved from the signal paths suffering from a high capacity and crosstalking (e.g. on the PCB) to signal paths having a lower capacity and thus less crosstalking (e.g. within the receiver photo diode array 7002).

FIG. 72 shows a receiver photo diode array implemented as a chip-on-board photo diode array 7200.

The chip-on-board photo diode array 7200 may be formed by a semiconductor substrate 7202 such as a silicon substrate 7202, in which the photo diodes 2602 are formed. The semiconductor substrate 7202 may be mounted on a carrier 7204 such as a PCB 7204. In addition to the semiconductor substrate 7202, various electronic components such as the multiplexers 6814, the amplifiers 2626 and the analog-to-digital converters 2630 may be mounted on the carrier 7204 (not shown in FIG. 72). It is to be noted that some or all of the electronic components may also be arranged separately, e.g. mounted on one or more other carriers, e.g. on one or more further PCBs. Furthermore, wire bonds 7206 may be provided. Each wire bond 7206 may couple a respective detector connecting structure 7004 to a carrier contact structure 7208 of the carrier 7204, which in turn is electrically conductively coupled to a multiplexer input (e.g. multiplexer input 7010).

In summary, providing a suitable wiring scheme within a detector array, e.g. within the detector housing (if applicable), the signal paths may be crossed with each other without significantly lengthening the signal paths and with a substantially lower capacitive coupling, since the dimensions of the conductive lines on the photo diode array chip are substantially smaller than the dimensions of the conductive lines on the PCB. By way of example, if a detector 52 including 32 photo diode 2602 should be grouped together to eight diode groups 7016, each diode group 7016 having four photo diodes 2602, since an implementation of only eight amplifier circuits or amplifiers 2626 are desired, it is possible to connect the photo diodes 2602 at the locations i, 8+i, 16+i, and 24+i via one respective multiplexer 6814 to the i-th amplifier 2626. Thus, it is possible to separately illuminate the diode groups 7016 in a LIDAR application which may reduce the number of required transmitter light source(s) 42, e.g. transmitter laser source(s) 42.

In various embodiments, the light source 42 and therein e.g. the plurality of laser diodes is controlled by a controller in such a way that not all laser diodes are emitting light all the time, but only one laser diode (or group of laser diodes) is active at a time to emit a light spot, the reflection of which is received by respective photo diodes 2602 of the plurality of photo diodes 2602, more accurately, photo diodes of a predefined diode group 7016 as described above.

Various embodiments as described with reference to FIG. 68 to FIG. 72 may be used together with the multi-lens array as described with reference to FIG. 89 to FIG. 97.

Furthermore, in various embodiments, the one or more multiplexers of the embodiments as described with reference to FIG. 68 to FIG. 72 may be replaced a suppression mechanism circuit as described with reference to FIG. 46 to FIG. 50. In this case, a multiplexer input may correspond to an APD sensor pin as described with reference to FIG. 46 to FIG. 50.

In various embodiments, a traffic signal provided by a digital map (e.g. a digital traffic map) may be used to an adapted control of the multiplexers. By way of example, certain sensor pixels may be skipped during the read-out process.

In the following, various aspects of this disclosure will be illustrated:

Example 1h is a LIDAR Sensor System. The LIDAR Sensor System may include a plurality of photo diodes, an interface including detector connecting structures, and a first connection network electrically coupling the plurality of photo diodes with the detector connecting structures. The first connection network is configured to couple the plurality of photo diodes with the detector connecting structures in accordance with a first connecting scheme. The LIDAR Sensor System may further include a plurality of multiplexers, each multiplexer including a plurality of multiplexer inputs and at least one multiplexer output, and a second connection network electrically coupling the detector connecting structures with the plurality of multiplexer inputs. The second connection network is configured to couple the detector connecting structures with the plurality of multiplexer inputs in accordance with a second connecting scheme. The first connection network includes a larger number of crossing connections than the second connection network.

In Example 2h, the subject matter of Example 1 h can optionally include that the location of a photo diode of the plurality of photo diodes is associated with a diode location number. The plurality of photo diodes may be arranged such that the diode location number is increasing along a diode placement orientation along which the plurality of photo diodes are arranged. The location of the detector connecting structures is associated with a structure location number, wherein the plurality of detector connecting structures are arranged such that the structure location number is increasing along a structure placement orientation along which the plurality of detector connecting structure are arranged. The photo diodes are grouped into a plurality of diode groups in accordance with their location. The photo diodes within a diode group are arranged closest together along a diode placement orientation. The number of photo diodes within each diode group may be equal to the number of multiplexers. The detector connecting structures are grouped into a plurality of structure groups in accordance with their location. The detector connecting structures within a structure group are arranged closest together along a structure placement orientation along which the plurality of detector connecting structures are arranged. The number of detector connecting structures within each structure group is equal to the number of photo diodes in the receiver photo diode array divided by the number of multiplexers.

In Example 3h, the subject matter of any one of Examples 1 h or 2h can optionally include that the first connection network and the second connection network are configured such that the photo diodes coupled to the same multiplexer of the plurality of multiplexers are from different diode groups.

In Example 4h, the subject matter of Example 3h can optionally include that the location of a photo diode of the plurality of photo diodes is associated with a diode location number. The plurality of photo diodes are arranged such that the diode location number is increasing along a diode placement orientation along which the plurality of photo diodes are arranged. The photo diodes are grouped into a plurality of diode groups in accordance with their location. The photo diodes within a diode group are arranged closest together along the diode placement orientation. The location of the detector connecting structures is associated with a structure location. The plurality of detector connecting structures are arranged such that the structure location number is increasing along a structure placement orientation along which the plurality of detector connecting structures are arranged. The first connecting scheme is configured such that a detector connecting structure associated with a structure location number in binary representation is coupled with that photo diode of the plurality of photo diodes which is associated with the diode location number having the reverse of the diode location number in binary representation as the structure location number.

In Example 5h, the subject matter of any one of Examples 1 h to 4h can optionally include that the LIDAR Sensor System further includes a detector housing, and a plurality of photo diodes arranged in the detector housing.

In Example 6h, the subject matter of any one of Examples 1 h to 4h can optionally include that the plurality of photo diodes are mounted as chip-on-board photo diodes.

In Example 7h, the subject matter of any one of Examples 1 h to 6h can optionally include that the connecting structures are connecting pins or connecting pads.

In Example 8h, the subject matter of any one of Examples 1 h to 7h can optionally include that the LIDAR Sensor System further includes encapsulating material at least partially encapsulating the plurality of photo diodes.

In Example 9h, the subject matter of Example 8h can optionally include that the first connection network is at least partially formed in the encapsulating material.

In Example 10h, the subject matter of any one of Examples 1 h to 9h can optionally include that the number of photo diodes within each diode group may be equal to the number of multiplexers.

In Example 11h, the subject matter of any one of Examples 1 h to 10h can optionally include that the first connection network is formed in a plurality of metallization planes within the receiver photo diode array.

In Example 12h, the subject matter of any one of Examples 1 h to 11h can optionally include that the LIDAR Sensor System further includes a printed circuit board. The second connection network is formed on the printed circuit board.

In Example 13h, the subject matter of any one of Examples 1h to 12h can optionally include that the LIDAR Sensor System further includes a plurality of amplifiers downstream coupled to the plurality of multiplexers.

In Example 14h, the subject matter of Example 13h can optionally include that the plurality of amplifiers comprises a plurality of transimpedance amplifiers.

In Example 15h, the subject matter of any one of Examples 1h to 14h can optionally include that the diode placement orientation is a linear orientation. The structure placement orientation is a linear orientation.

In Example 16h, the subject matter of any one of Examples 1h to 15h can optionally include that the plurality of multiplexers include at least four multiplexers.

In Example 17h, the subject matter of Example 16h can optionally include that the plurality of multiplexers include at least six multiplexers.

In Example 18h, the subject matter of Example 17h can optionally include that the plurality of multiplexers include at least eight multiplexers.

In Example 19h, the subject matter of Example 18h can optionally include that the plurality of multiplexers comprise at least sixteen multiplexers.

In Example 20h, the subject matter of any one of Examples 1h to 19h can optionally include that the LIDAR Sensor System further includes a light source configured to emit a light beam to be received by a photo diode of a diode group of a plurality of diode groups, and a sensor controller configured to control a read out of the photo current of the photo diodes (2602).

In Example 21h, the subject matter of Example 20h can optionally include that the light source includes or essentially consists of a laser source configured to emit one or more laser beams.

In Example 22h, the subject matter of Example 21h can optionally include that the laser source includes a plurality of laser diodes configured to emit a light beam to be received by all photo diodes of one diode group of a plurality of diode groups.

The LIDAR Sensor System according to the present disclosure may be combined with a LIDAR Sensor Device for illumination of an environmental space connected to a light control unit.

In the LIDAR Sensor System, a combination of a LIDAR sensor and a camera sensor may be desired e.g. in order to identify an object or characteristics of an object by means of data fusion. Furthermore, depending on the situation, either a three dimensional measurement by means of a LIDAR sensor or a two dimensional mapping by means of a camera sensor may be desired. By way of example, a LIDAR sensor alone usually cannot determine whether taillights of a vehicle are switched on or switched off.

In a conventional combination of a LIDAR sensor and a camera sensor, two separate image sensors are provided and these are combined by means of a suitable optics arrangement (e.g. semitransparent mirrors, prisms, and the like). As a consequence, a rather large LIDAR sensor space is required and both partial optics arrangements of the optics arrangement and both sensors (LIDAR sensor and camera sensor) have to be aligned to each other with high accuracy. As an alternative, in the case of two separate mapping systems and thus two sensors, the relative positions of the optical axes of the two sensors to each other have to be determined with high accuracy to be able to take into consideration effects resulting from the geometric distance of the sensors from each other in a subsequent image processing to accurately match the images provided by the sensors. Furthermore, deviations of the relative orientation of the optical axes of the sensors should also be taken into consideration, since they have an effect on the calibration state. This may also incorporate the fact that the fields of view of both sensors do not necessarily coincide with each other and that regions possibly exist in a region in close proximity to the sensors in which an object cannot be detected by all sensors of the one or more other sensors simultaneously.

Various aspects of this disclosure may provide a LIDAR functionality at two different wavelengths or the combination of a LIDAR function and a camera function in a visible wavelength region or the combination of a LIDAR function and a camera function in a wavelength region of the thermal infrared as will be described in more detail below.

In a conventional LIDAR Sensor System, a combination of a LIDAR function with a camera function is usually implemented by means of two separate sensor systems and the relative position of the sensor systems to each other is taken into consideration in the image processing. In the context of a (movie or video) camera, there is an approach to use three individual image sensors instead of a CCD/CMOS image sensor array with color filters (Bayer pattern). The incoming light may be distributed over the three image sensors by means of an optics arrangement having full faced color filters (e.g. a trichroic beam splitter prism). In the context of a conventional photo camera efforts have been made to avoid the disadvantageous effects of the Bayer-Pattern-Color filter by providing a CMOS image sensor which uses the wavelength-dependent absorption of silicon in order to register different spectral colors in different depths of penetration.

Illustratively, the physical principle of the wavelength dependent depth of penetration of light into a carrier such as a semiconductor (e.g. silicon) substrate, which has (up to now) only been used in photo applications, is used in the field of the integration of a LIDAR sensor and a camera sensor in accordance with various embodiments.

To achieve this, two or more different types of photo diodes may be stacked above one another, i.e. one type of photo diode is placed over another type of photodiode. This may be implemented e.g. by a monolithic integration of the different types of photo diodes in one common process of manufacturing (or other types of integration processes such as wafer bonding or other three-dimensional processes). In various embodiments, a pin photo diode for the detection of visible light (e.g. red spectral region for the detection of car taillights) may be provided near to the surface of the carrier (e.g. substrate). In a deeper region of the carrier (e.g. in a deeper region of the substrate), there may be provided an avalanche photo diode (APD), which may be configured to detect light emitted by a laser emitter and having a wavelength in the near infrared region (NIR). The red light may in this case be detected near the surface of the pin photo diode due to its smaller depth of penetration. Substantially fewer portions of the light of the visible spectrum (VIS) may penetrate into the deeper region (e.g. deeper layers) in this case, so that the avalanche photo diode which is implemented there is primarily sensitive to NIR light.

The stacking of the photo diodes one above the other may be useful in that:

- the sensor functions of pin photo diodes (camera) and APD (LIDAR) are always accurately aligned with respect to each other and only one receiving optical arrangement is required—in various embodiments, CCD or CMOS sensors may be provided—moreover, the camera may be configured as an infrared (IR) camera, as a camera for visible light or as a thermal camera or a combination thereof;
- the incoming light is efficiently used.

FIG. 51 shows schematically in a cross sectional view an optical component 5100 for a LIDAR Sensor System in accordance with various embodiments.

The optical component 5100 may include a carrier, which may include a substrate, e.g. including a semiconductor material and/or a semiconductor compound material. Examples of materials that may be used for the carrier and/or the semiconductor structure include one or more of the following materials: GaAs, AlGaInP, GaP, AlP, AlGaAs, GaAsP, GaInN, GaN, Si, SiGe, Ge, HgCdTe, InSb, InAs, GaInSb, GaSb, CdSe, HgSe, AlSb, CdS, ZnS, ZnSb, ZnTe. The substrate may optionally include a device layer 5102. One or more electronic devices 5104 such as (field effect) transistors 5104 or other electronic devices (resistors, capacitors, inductors, and the like) 5104 may be completely or partially formed in the device layer 5102. The one or more electronic devices 5104 may be configured to process signals generated by the first photo diode 5110 and the second photo diode 5120, which will be described in more detail below. The substrate may optionally include a bottom interconnect layer 5106. Alternatively, the interconnect layer 5106 may be configured as a separate layer, e.g. as a separate layer arranged above the device layer 5102 (like shown in FIG. 51). The carrier may have a thickness in the range from about 100 μm to about 3000 μm.

One or more electronic contacts 5108 configured to contact the electronic devices 5104 or an anode or a cathode of a first photo diode 5110, in other words a first portion of the first photo diode 5110 (which will be described in more detail below), may be connected to an electronic contact 5108 of the bottom interconnect layer 5106. Furthermore, one or more contact vias 5112 may be formed in the bottom interconnect layer 5106. The one or more contact vias 5112 extend through the entire layer structure implementing the first photo diode 5110 into an intermediate interconnect/device layer 5114. The one or more electronic contacts 5108 as well as the one or more contact vias 5112 may be made of electrically conductive material such as a metal (e.g. Cu or Al) or any other suitable electrically conductive material. The one or more electronic contacts 5108 and the one or more contact vias 5112 may form an electrically conductive connection network in the bottom interconnect layer 5106.

The first photo diode 5110 may be an avalanche type photo diode such as an avalanche photo diode (APD) or a single-photon photo diode (SPAD). The first photo diode 5110 may be operated in the linear mode/in the Geiger mode. Illustratively, the first photo diode 5110 implements a LIDAR sensor pixel in a first semiconductor structure over the carrier. The first photo diode 5110 is configured to absorb received light in a first wavelength region. The first photo diode 5110 and thus the first semiconductor structure may have a layer thickness in the range from about 500 nm to about 50 μm.

One or more further electronic devices 5116 such as (field effect) transistors 5116 or other further electronic devices (resistors, capacitors, inductors, and the like) 5116 may be completely or partially formed in the intermediate interconnect/device layer 5114. One or more further electronic contacts 5118 configured to contact the further electronic devices 5116 or an anode or a cathode of the first photo diode 5110, in other words a second portion of the first photo diode 5110, may be connected to a further electronic contact 5118 of the intermediate interconnect/device layer 5114. The one or more further electronic contacts 5118 and the one or more contact vias 5112 may form an electrically conductive connection network (electrically conductive structure configured to electrically contact the first photo diode 5110 and the second photo diode 5120) in the intermediate interconnect/device layer 5114. Illustratively, the intermediate interconnect/device layer 5114 (which may also be referred to as interconnect layer 5114) is arranged between the first semiconductor structure and the second semiconductor structure.

One or more further electronic contacts 5118 and/or one or more contact vias 5112 may be configured to contact the further electronic devices 5116 or an anode or a cathode of a second photo diode 5120, in other words a first portion of the second photo diode 5120 (which will be described in more detail below) may be connected to a further electronic contact 5118 of the intermediate interconnect/device layer 5114.

The second photo diode 5120 may be arranged over (e.g. in direct physical contact with) the intermediate interconnect/device layer 5114. The second photo diode 5120 might be a pin photo diode (e.g. configured to receive light of the visible spectrum). Illustratively, the second photo diode 5120 implements a camera sensor pixel in a second semiconductor structure over the intermediate interconnect/device layer 5114 and thus also over the first semiconductor structure. In other words, the second photo diode 5120 is vertically stacked over the first photo diode. The second photo diode 5120 is configured to absorb received light in a second wavelength region. The received light of the second wavelength region has a shorter wavelength than the predominantly received light of the first wavelength region.

FIGS. 52A and 52B show schematically in a cross sectional view an optical component 5200 for a LIDAR Sensor System (FIG. 52A) and a corresponding wavelength/transmission diagram 5250 (FIG. 52B) in accordance with various embodiments.

The optical component 5200 of FIG. 52A is substantially similar to the optical component 5100 of FIG. 51 as described above. Therefore, only the main differences of the optical component 5200 of FIG. 52A with respect to the optical component 5100 of FIG. 51 will be described in more detail below.

The optical component 5200 of FIG. 52A may further optionally include one or more microlenses 5202, which may be arranged over the second photo diode 5120 (e.g. directly above, in other words in physical contact with the second photo diode 5120). The one or more microlenses 5202 may be embedded in or at least partially surrounded by a suitable filler material 5204 such as silicone. The one or more microlenses 5202 together with the filler material 5204 may, for a layer structure, have a layer thickness in the range from about 1 μm to about 500 μm.

Furthermore, a filter layer 5206, which may be configured to implement a bandpass filter, may be arranged over the optional one or more microlenses 5202 or the second photo diode 5120 (e.g. directly above, in other words in physical contact with the optional filler material 5204 or with the second photo diode 5120). The filter layer 5206 may have a layer thickness in the range from about 1 μm to about 500 μm.

As shown in FIG. 52A, light impinges on the upper (exposed) surface 5208 of the filter layer 5206. The light may include various wavelengths, such as e.g. a first wavelength range $\lambda_1$ (e.g. in the ultra-violet spectral region), a second wavelength range $\lambda_2$ (e.g. in the visible spectral region), and a third wavelength range $\lambda_3$ (e.g. in the near-infrared spectral region). Light having the first wavelength $\lambda_1$ is symbolized in FIG. 52A by a first arrow 5210. Light having the second wavelength $\lambda_2$ is symbolized in FIG. 52A by a second arrow 5212. Light having the third wavelength $\lambda_3$ is symbolized in FIG. 52A by a third arrow 5214.

The wavelength/transmission diagram 5250 as shown in FIG. 52B illustrates the wavelength-dependent transmission characteristic of the filter layer 5206. As illustrated, the filter layer 5206 has a bandpass filter characteristic. In more detail, the filter layer 5206 has a low, ideally negligible transmission for light having the first wavelength range $\lambda_1$. In other words, the filter layer 5206 may completely block the light portions having the first wavelength range $\lambda_1$ impinging on the upper (exposed) surface 5208 of the filter layer 5206. Furthermore, the transmission characteristic 5252 shows that the filter layer 5206 is substantially fully transparent (transmission factor close to "1") for light having the second wavelength range $\lambda_2$ and for light having the third wavelength range $\lambda_3$.

In various embodiments, the second photo diode 5120 may include or be a pin photo diode (configured to detect light of the visible spectrum) and the first photo diode 5110 may include or be an avalanche photo diode (in the linear mode/in the Geiger mode) (configured to detect light of the near infrared (NIR) spectrum or in the infrared (IR) spectrum).

FIGS. 53A and 53B show schematically in a cross sectional view an optical component 5300 for a LIDAR Sensor System (FIG. 53A) and a corresponding wavelength/transmission diagram 5250 (FIG. 53B) in accordance with various embodiments.

The optical component 5300 of FIG. 53A is substantially similar to the optical component 5200 of FIG. 52A as described above. Therefore, only the main differences of the optical component 5300 of FIG. 53A from the optical component 5200 of FIG. 52A will be described in more detail below.

The optical component 5300 of FIG. 53A may further optionally include a mirror structure (e.g. a Bragg mirror structure). The second photo diode 5120 may be arranged (in other words sandwiched) between the two mirrors (e.g. two Bragg mirrors) 5302, 5304 of the mirror structure. In other words, the optical component 5300 of FIG. 53A may further optionally include a bottom mirror (e.g. a bottom Bragg mirror) 5302. The bottom mirror (e.g. the bottom Bragg mirror) 5302 may be arranged over (e.g. in direct physical contact with) the intermediate interconnect/device layer 5114. In this case, the second photo diode 5120 may be arranged over (e.g. in direct physical contact with) the bottom mirror 5302. Furthermore, a top mirror (e.g. a top Bragg mirror) 5304 may be arranged over (e.g. in direct physical contact with) the second photo diode 5120. In this case, the optional one or more microlenses 5202 or the filter layer 5206 may be arranged over (e.g. in direct physical contact with) the top mirror 5304.

In various embodiments, the second photo diode 5120 may include or be a pin photo diode (configured to detect light of the visible spectrum) and the first photo diode 5110 may include or be an avalanche photo diode (in the linear mode/in the Geiger mode) (configured to detect light of the near infrared (NIR) spectrum or in the infrared (IR) spectrum).

FIG. 54 shows schematically a cross sectional view 5400 of a sensor 52 for a LIDAR Sensor System in accordance with various embodiments. As shown in FIG. 54, the sensor 52 may include a plurality of optical components (e.g. a plurality of optical components 5100 as shown in FIG. 51) in accordance with any one of the embodiments as described above or as will be described further below. The optical components may be arranged in an array, e.g. in a matrix arrangement, e.g. in rows and columns. In various embodiments, more than 10, or more than 100, or more than 1000, or more than 10000, and even more optical components may be provided.

FIG. 55 shows a top view 5500 of the sensor 52 of FIG. 54 for a LIDAR Sensor System in accordance with various embodiments. The top view 5500 illustrates a plurality of color filter portions (each color filter may be implemented as a filter layer 5206). The different color filter portions may be configured to transmit (transfer) light of different wavelengths in the visible spectrum (to be detected by the second photo diode 5120) and light of one or more wavelengths to be absorbed or detected by the first photo diode 5110 for LIDAR detection. By way of example, a red pixel filter portion 5502 may be configured to transmit light having a wavelength to represent red color (to be detected by the second photo diode 5120) and light of one or more wavelengths to be absorbed or detected by the first photo diode 5110 to for LIDAR detection and to block light outside these wavelength regions. Furthermore, a green pixel filter portion 5504 may be configured to transmit light having a wavelength to represent green color (to be detected by the second photo diode 5120) and light of one or more wavelengths to be absorbed or detected by the first photo diode 5110 for LIDAR detection and to block light is outside these wavelength regions. Moreover, a blue pixel filter portion 5506 may be configured to transmit light having a wavelength to represent blue color (to be detected by the second photo diode 5120) and light of one or more wavelengths to be absorbed or detected by the first photo diode 5110 for LIDAR detection and to block light outside these wavelength regions. The color filter portions 5502, 5504, 5506 may each have the lateral size corresponding to a sensor pixel, in this case a size similar to the lateral sizes of the second photo diodes 5120. In these embodiments, the second photo diodes 5110 may have the same lateral size as the second photo diodes 5120. The color filter portions 5502, 5504, 5506 may be arranged in accordance with a Bayer pattern.

FIG. 56 shows a top view 5600 of a sensor 52 for a LIDAR Sensor System in accordance with various embodiments.

The sensor of FIG. 56 is substantially similar to the sensor of FIG. 55 as described above. Therefore, only the main difference of the sensor of FIG. 56 from the sensor of FIG. 55 will be described in more detail below.

In various embodiments, the color filter portions 5502, 5504, 5506 may each have a lateral size corresponding to a sensor pixel, in this case a size similar to the lateral size of the second photo diodes 5120. In these embodiments, the first photo diodes 5110 may have a larger lateral size than the second photo diodes 5120. By way of example, the surface area of the first photo diodes 5110 may be larger than the surface area of the second photo diodes 5120. In one implementation, the surface area of the first photo diodes 5110 may be larger than the surface area of the second photo diodes 5120 by a factor of two, or by a factor of four, or by a factor of eight, or by a factor of sixteen. The larger size of the first photo diodes 5110 is symbolized by rectangles 5602 in FIG. 56. The color filter portions 5502, 5504, 5506 may also be arranged in accordance with a Bayer pattern. In these examples, the resolution of the first photo diodes 5110 may not be of high importance, but the sensitivity of the first photo diodes 5110 may be important.

FIG. 57 shows a top view 5700 of a sensor 52 for a LIDAR Sensor System in accordance with various embodiments.

The sensor of FIG. 57 is substantially similar to the sensor of FIG. 55 as described above. Therefore, only the main difference of the sensor of FIG. 57 from the sensor of FIG. 55 will be described in more detail below.

The top view 5700 illustrates a plurality of color filter portions (each color filter may be implemented as a filter layer 5206) different from the color filter portions of the sensor as shown in FIG. 55 or FIG. 56. In these examples, a red pixel filter portion 5702 may be configured to transmit light having a wavelength to represent red color (to be detected by the second photo diode 5120 in order to detect a taillight of a vehicle) and light of one or more wavelengths to be absorbed or detected by the first photo diode 5110 for LIDAR detection and to block light outside these wavelength regions. Furthermore, a yellow (or orange) pixel filter portion 5704 may be configured to transmit light having a wavelength to represent yellow (or orange) color (to be detected by the second photo diode 5120 in order to detect a warning light or a blinking light of a vehicle) and light of one or more wavelengths to be absorbed or detected by the first photo diode 5110 for LIDAR detection and to block light outside these wavelength regions. In these embodiments, the first photo diodes 5110 may have a larger lateral size than the second photo diodes 5120. By way of example, the surface area of the first photo diodes 5110 may be larger than the surface area of the second photo diodes 5120. In one implementation, the surface area of the first photo diodes 5110 may be larger than the surface area of the second photo diodes 5120 by a factor of two, or by a factor of four, or by a factor of eight, or by a factor of sixteen. The larger size of the first photo diodes 5110 is symbolized by rectangles 5602 in FIG. 57. The color filter portions 5702 and 5704 may be arranged in accordance with checkerboard pattern. In these examples, the resolution of the first photo diodes 5110 may not be of high importance, but the sensitivity of the first photo diodes 5110 may be important.

It is to be noted that the structure and the transmission characteristics of the color filter portions may vary as a function of the desired color space. In the above described embodiments, an RGB color space was considered. Other possible color spaces that may be provided are CYMG (cyan, yellow, magenta and green), RGBE (red, green, blue, and emerald), CMYW (cyan, magenta, yellow, and white), and the like. The color filter portions would be adapted accordingly. Optional further color filter types may mimic the scotopic sensitivity curve of the human eye.

FIG. 58 shows an optical component 5800 for a LIDAR Sensor System in accordance with various embodiments.

The optical component 5800 of FIG. 58 is substantially similar to the optical component 5200 of FIG. 52A as described above. Therefore, the main differences of the optical component 5800 of FIG. 58 from the optical component 5200 of FIG. 52A will be described in more detail below.

To begin with, the optical component 5800 may have or may not have the optional one or more microlenses 5202 and the filler material 5204. Furthermore, a reflector layer 5802 may be arranged over (e.g. in direct physical contact with) the filter layer 5206. The reflector layer 5802 may be configured to reflect light in a wavelength region of a fourth wavelength $\lambda_4$. The fourth wavelength range $\lambda_4$ may have larger wavelengths than the first wavelength range $\lambda_1$, the second wavelength range $\lambda_2$, and the third wavelength range $\lambda_3$. A light portion of the fourth wavelength $\lambda_4$ is symbolized in FIG. 58 by a fourth arrow 5804. This light impinges on the reflector layer 5802 and is reflected by the same. The light portion that is reflected by the reflector layer 5802 is symbolized in FIG. 58 by a fifth arrow 5806. The reflector layer 5802 may be configured to reflect light in the wavelength region of thermal infrared light or infrared light. The reflector layer 5802 may include a Bragg stack of layers configured to reflect light of a desired wavelength or wavelength region. The optical component 5800 may further include a micromechanically defined IR absorber structure 5808 arranged over the reflector layer 5802. The IR absorber structure 5808 may be provided for a temperature-dependent resistivity measurement (based on the so called Microbolometer principle). To electrically contact the IR absorber structure 5808 for the resistivity measurement, one or more conductor lines may be provided, e.g. in the intermediate interconnect/device layer 5114. The reflector layer 5802 may be configured to reflect thermal infrared radiation having a wavelength greater than approximately 2 μm.-

Various embodiments such as e.g. the embodiments illustrated above may include a stack of different photo diodes, such as:

- a stack of a pin photo diode (configured to detect light of the visible spectrum) over a pin photo diode (configured to detect light of the near infrared (NIR) spectrum);
- a stack of a pin photo diode (configured to detect light of the visible spectrum) over an avalanche photo diode (in the linear mode/in the Geiger mode) (configured to detect light of the near infrared (NIR) spectrum);
- a stack of a resonant cavity photo diode (configured to detect light of the visible spectrum) over an avalanche photo diode (in the linear mode/in the Geiger mode) (configured to detect light of the near infrared (NIR) spectrum);
- a stack of a pin photo diode (configured to detect light of the visible spectrum) over a further photo diode configured to provide indirect ToF measurements by means of phase differences (e.g. PMD approach);
- a stack of a resonant cavity photo diode (configured to detect light of the visible spectrum) over a further photo diode configured to provide indirect ToF measurements by means of phase differences (e.g. PMD approach);

As described above, the above mentioned embodiments may be complemented by a filter, e.g. a bandpass filter, which is configured to transmit portions of the light which should be detected by the photo diode near to the surface of the carrier (e.g. of the visible spectrum) such as e.g. red light for vehicle taillights as well as portions of the light having the wavelength of the used LIDAR source (e.g. laser source).

The above mentioned embodiments may further be complemented by a (one or more) microlens per pixel to increase the fill factor (a reduced fill factor may occur due to circuit regions of an image sensor pixel required by the manufacturing process). The fill factor is to be understood as the area ratio between the optically active area and the total area of the pixel. The optically active area may be reduced e.g. by electronic components. A micro lens may extend over the entire area of the pixel and may guide the light to the optically active area. This would increase the fill factor.

In various embodiments, a front-side illuminated image sensor or a back-side illuminated image sensor may be provided. In a front-side illuminated image sensor, the device layer is positioned in a layer facing the light impinging the sensor 52. In a back-side illuminated image sensor, the device layer is positioned in a layer facing away from the light impinging the sensor 52.

In various embodiments, two APD photo diodes may be provided which are configured to detect light in different NIR wavelengths and which may be stacked over each other, e.g. to use the wavelength-dependent absorption characteristics of water (vapor) and to obtain information about the amount of water present in the atmosphere and/or an surfaces such as the roadway of a surface by the comparison of the intensities of the light detected at different wavelengths.

Depending on the desired wavelengths, the detector may be implemented in a semiconductor material such as silicon or in semiconductor compound material such as silicon germanium, III-V semiconductor compound material, or II-VI semiconductor compound material, individually or in combination with each other.

Various embodiments may allow the manufacturing of a miniaturized and/or cost-efficient sensor system which may combine a camera sensor and a LIDAR sensor with each other in one common carrier (e.g. substrate). Such a sensor system may be provided for pattern recognition, or object recognition, or face recognition. The sensor system may be implemented in a mobile device such as a mobile phone or smartphone.

Furthermore, various embodiments may allow the manufacturing of a compact and/or cost-efficient sensor system for a vehicle. Such a sensor system may be configured to detect active taillights of one or more other vehicles and at the same time to perform a three-dimensional measurement of objects by means of the LIDAR sensor portion of the sensor system.

Moreover, various embodiments allow the combination of two LIDAR wavelengths in one common detector e.g. to obtain information about the surface characteristic of a reflecting target object by means of a comparison of the respectively reflected light.

Various embodiments, may allow the combination of a LIDAR sensor, a camera sensor (configured to detect light of the visible spectrum (VIS)) and a camera sensor (configured to detect light of the thermal infrared spectrum), in one common sensor (e.g. monolithically integrated on one common carrier, e.g. one common substrate, e.g. one common wafer).

Various embodiments may reduce adjustment variations between different image sensors for camera and LIDAR.

In various embodiments, even more than two photo diodes may be stacked one above the other.

It is to be noted that in various embodiments, the lateral size (and/or shape) of the one, two or even more photo diodes and the color filter portions of the filter layer (e.g. filter layer 5206) may be the same.

Furthermore, in various embodiments, the lateral size (and/or shape) of the one, two, or even more photo diodes may be the same, and the lateral size (and/or shape) of the color filter portions of the filter layer (e.g. filter layer 5206) may be different from each other and/or from the lateral size (and/or shape) of the one, two or even more photo diodes.

Moreover, in various embodiments, the lateral size (and/or shape) of the one, two, or even more photo diodes may be different from each other and/or from the lateral size (and/or shape) of the color filter portions, and the lateral size (and/or shape) of the color filter portions of the filter layer (e.g. filter layer 5206) may be the same.

Moreover, in various embodiments, the lateral size (and/or shape) of the one, two, or even more photo diodes may be different from each other and the lateral size (and/or shape) of the color filter portions of the filter layer (e.g. filter layer 5206) may be different from each other and/or from the lateral size (and/or shape) of the one, two or even more photo diodes.

In addition, as already described above, other types of color filter combinations, like CYMG (cyan, yellow, green and magenta), RGBE (red, green, blue, and emerald), CMYW (cyan, magenta, yellow, and white) may be used as well. The color filters may have a bandwidth (FWHM) in the range from about 50 nm to about 200 nm. However, also monochrome filters (black/white) may be provided.

It is to be noted that standard color value components and luminance factors for retroreflective traffic signs are specified in accordance with DIN EN 12899-1 and DIN 6171-1. The color coordinates of vehicle headlamps (dipped and high beam, daytime running lights) are defined by the ECE white field (CIE-Diagram) of the automotive industry. The same applies to signal colors, whose color coordinates are defined, for example, by ECE color boundaries. See also CIE No. 2.2 (TC-1.6) 1975, or also BGBI. II—Issued on 12 Aug. 2005—No. 248). Other national or regional specification standards may apply as well. All these components may be implemented in various embodiments.

Accordingly, the transmission curves of the used sensor pixel color filters should comply with the respective color-related traffic regulations. Sensor elements having sensor pixels with color-filter need not only be arranged in a Bayer-Pattern, but other pattern configurations may be used as well, for example an X-trans-Matrix pixel-filter configuration.

A sensor as described with respect to FIGS. 51 to 58 may e.g. be implemented in a photon mixing device (e.g. for an indirect measurement or in a consumer electronic device in which a front camera of a smartphone may, e.g. at the same time, generate a three-dimensional image).

A sensor as described with respect to FIGS. 51 to 58 may e.g. also be implemented in a sensor to detect the characteristic of a surface, for example whether a street is dry or wet, since the surface usually has different light reflection characteristics depending on its state (e.g. dry state or wet state), and the like.

As previously described with reference to FIG. 38 to FIG. 45, a stacked photo diode in accordance with various embodiments as described with reference to FIG. 51 to FIG. 58 may implement a first sensor pixel including a photo diode of a first photo diode type and a second pixel of the plurality of pixels including a photo diode of a second photo diode type.

By way of example, such a stacked optical component including a plurality of photo diodes of different photo diode types (e.g. two, three, four or more photo diodes stacked above one another). The stacked optical component may be substantially similar to the optical component 5100 of FIG. 51 as described above. Therefore, only the main differences of the stacked optical component with respect to the optical component 5100 of FIG. 51 will be described in more detail below.

The stacked optical component may optionally include one or more microlenses, which may be arranged over the second photo diode (e.g. directly above, in other words in physical contact with the second photo diode). The one or more microlenses may be embedded in or at least partially surrounded by a suitable filler material such as silicone. The one or more microlenses together with the filler material may, for a layer structure, have a layer thickness in the range from about 1 μm to about 500 μm.

Furthermore, a filter layer, which may be configured to implement a bandpass filter, may be arranged over the optional one or more microlenses or the second photo diode (e.g. directly above, in other words in physical contact with the optional filler material or with the second photo diode). The filter layer may have a layer thickness in the range from about 1 μm to about 500 μm. The filter layer may have a filter characteristic in accordance with the respective application.

In various embodiments, the second photo diode may include or be a pin photo diode (configured to detect light of the visible spectrum) and the first photo diode may include or be an avalanche photo diode (in the linear mode/in the Geiger mode) (configured to detect light of the near infrared (NIR) spectrum or in the infrared (IR) spectrum).

In various embodiments, a multiplexer may be provided to individually select the sensor signals provided e.g. by the pin photo diode or by the avalanche photo diode. Thus, the multiplexer may select e.g. either the pin photo diode (and thus provides only the sensor signals provided by the pin photo diode) or the avalanche photo diode (and thus provides only the sensor signals provided by the avalanche photo diode).

In the following, various aspects of this disclosure will be illustrated: Example if is an optical component for a LIDAR Sensor System. The optical component includes a first photo diode implementing a LIDAR sensor pixel in a first semiconductor structure and configured to absorb received light in a first wavelength region, a second photo diode implementing a camera sensor pixel in a second semiconductor structure over the first semiconductor structure and configured to absorb received light in a second wavelength region, and an interconnect layer (e.g. between the first semiconductor structure and the second semiconductor structure) including an electrically conductive structure configured to electrically contact the second photo diode. The received light of the second wavelength region has a shorter wavelength than the received light of the first wavelength region.

In Example 2f, the subject matter of Example 1f can optionally include that the second photo diode is vertically stacked over the first photo diode.

In Example 3f, the subject matter of any one of Examples 1f or 2f can optionally include that the first photo diode is a first vertical photo diode, and/or that the second photo diode is a second vertical photo diode.

In Example 4f, the subject matter of any one of Examples 1f to 3f can optionally include that the optical component further includes a further interconnect layer (e.g. between the carrier and the first semiconductor structure) including an electrically conductive structure configured to electrically contact the second vertical photo diode and/or the first vertical photo diode.

In Example 5f, the subject matter of any one of Examples 1f to 4f can optionally include that the optical component further includes a microlens over the second semiconductor structure that laterally substantially covers the first vertical photo diode and/or the second vertical photo diode.

In Example 6f, the subject matter of any one of Examples 1f to 5f can optionally include that the optical component further includes a filter layer over the second semiconductor structure that laterally substantially covers the first vertical photo diode and/or the second vertical photo diode and is configured to transmit received light having a wavelength within the first wavelength region and within the second wavelength region, and block light that is outside of the first wavelength region and the second wavelength region.

In Example 7f, the subject matter of any one of Examples 1f to 6f can optionally include that the received light of the first wavelength region has a wavelength in the range from about 800 nm to about 1800 nm, and/or that the received light of the second wavelength region has a wavelength in the range from about 380 nm to about 780 nm.

In Example 8f, the subject matter of any one of Examples 1f to 6f can optionally include that the received light of the first wavelength region has a wavelength in the range from about 800 nm to about 1800 nm, and/or that the received light of the second wavelength region has a wavelength in the range from about 800 nm to about 1750 nm.

In Example 9f, the subject matter of any one of Examples 1f to 8f can optionally include that the received light of the second wavelength region has a shorter wavelength than any received light of the first wavelength region by at least 50 nm, for example at least 100 nm.

In Example 10f, the subject matter of any one of Examples 1f to 7f or 9f can optionally include that the received light of the first wavelength region has a wavelength in an infrared spectrum wavelength region, and/or that the received light of the second wavelength region has a wavelength in the visible spectrum wavelength region.

In Example 11f, the subject matter of any one of Examples 1f to 10f can optionally include that the optical component further includes a mirror structure including a bottom mirror and a top mirror. The second semiconductor structure is arranged between the bottom mirror and the top mirror. The bottom mirror is arranged between the interconnect layer and the second semiconductor structure.

In Example 12f, the subject matter of Example 11f can optionally include that the mirror structure includes a Bragg mirror structure.

In Example 13f, the subject matter of any one of Examples 11f or 12f can optionally include that the mirror structure and the second vertical photo diode are configured so that the second vertical photo diode forms a resonant cavity photo diode.

In Example 14f, the subject matter of any one of Examples 1f to 13f can optionally include that the optical component further includes a reflector layer over the second semiconductor structure.

In Example 15f, the subject matter of Example 14f can optionally include that the reflector layer is configured as a thermal reflector layer configured to reflect radiation having a wavelength equal to or greater than approximately 2 μm, and/or that the reflector layer is configured as an infrared reflector layer.

In Example 16f, the subject matter of any one of Examples 1f to 15f can optionally include that the first photo diode is a pin photo diode, and that the second photo diode is a pin photo diode.

In Example 17f, the subject matter of any one of Examples 1f to 15f can optionally include that the first photo diode is an avalanche photo diode, and that the second photo diode is a pin photo diode.

In Example 18f, the subject matter of any one of Examples 1f to 15f can optionally include that the first photo diode is an avalanche photo diode, and that the second photo diode is a resonant cavity photo diode.

In Example 19f, the subject matter of any one of Examples 1f to 15f can optionally include that the first photo diode is a single-photon avalanche photo diode, and that the second photo diode is a resonant cavity photo diode.

In Example 20f, the subject matter of any one of Examples 1f to 15f can optionally include that the first photo diode is an avalanche photo diode, and that the second photo diode is an avalanche photo diode.

In Example 21f, the subject matter of any one of Examples 2f to 20f can optionally include that the optical component further includes an array of a plurality of photo diode stacks, each photo diode stack comprising a second photo diode vertically stacked over a first photo diode.

In Example 22f, the subject matter of any one of Examples 1f to 21f can optionally include that at least one photo diode stack of the plurality of photo diode stacks comprises at least one further second photo diode in the second semiconductor structure adjacent to the second photo diode, and that the first photo diode of the at least one photo diode stack of the plurality of photo diode stacks has a larger lateral extension than the second photo diode and the at least one further second photo diode of the at least one photo diode stack so that the second photo diode and the at least one further second photo diode are arranged laterally within the lateral extension of the first vertical photo diode.

In Example 23f, the subject matter of any one of Examples 1f to 22f can optionally include that the carrier is a semiconductor substrate. Example 24f is a sensor for a LIDAR Sensor System. The sensor may include a plurality of optical components according to any one of Examples 1f to 23f. The plurality of optical components are monolithically integrated on the carrier as a common carrier.

In Example 25f, the subject matter of Example 24f can optionally include that the sensor is configured as a front-side illuminated sensor.

In Example 26f, the subject matter of Example 24f can optionally include that the sensor is configured as a back-side illuminated sensor.

In Example 27f, the subject matter of any one of Examples 24f to 26f can optionally include that the sensor further includes a color filter layer covering at least some optical components of the plurality of optical components.

In Example 28f, the subject matter of Example 27f can optionally include that the color filter layer includes a first color filter sublayer and a second color filter sublayer. The first color filter sublayer is configured to transmit received light having a wavelength within the first wavelength region and within the second wavelength region, and to block light outside the first wavelength region and outside the second wavelength region. The second color filter sublayer is configured to block received light having a wavelength outside the second wavelength region.

In Example 29f, the subject matter of Example 28f can optionally include that the first color filter sublayer and/or the second color filter sublayer includes a plurality of second sublayer pixels.

In Example 30f, the subject matter of Example 29f can optionally include that the first color filter sublayer and/or the second color filter sublayer includes a plurality of second sublayer pixels in accordance with a Bayer pattern.

In Example 31f, the subject matter of any one of Examples 27f to 30f can optionally include that the first color filter sublayer includes a plurality of first sublayer pixels having the same size as the second sublayer pixels. The first sublayer pixels and the second sublayer pixels coincide with each other.

In Example 32f, the subject matter of any one of Examples 27f to 30f can optionally include that the first color filter sublayer comprises a plurality of first sublayer pixels having a size larger than the size of the second sublayer pixels. One first sublayer pixels laterally substantially overlaps with a plurality of the second sublayer pixels.

Example 33f is a LIDAR Sensor System, including a sensor according to any one of Examples 24f to 32f, and a sensor controller configured to control the sensor.

Example 34f is a method for a LIDAR Sensor System according to example 33f, wherein the LIDAR Sensor System is integrated into a LIDAR Sensor Device, and communicates with a second Sensor System and uses the object classification and/or the Probability Factors and/or Traffic Relevance factors measured by the second Sensor System for evaluation of current and future measurements and derived LIDAR Sensor Device control parameters as a function of these factors.

In a conventional (e.g., fast) optical sensor, for example in a photo-sensor array, there may be a conflict between two different aspects. On the one hand, it may be desirable to have a high degree of filling of the optically active area with respect to the optically inactive area (e.g., it may be desirable to have a high fill factor), for which purpose the sensor pixels should be arranged close to one another (e.g., a distance between adjacent sensor pixels should be small).

On the other hand, it may be desirable to have a low or negligible crosstalk (also referred to as "sensor crosstalk") between adjacent sensor pixels (e.g., between two adjacent sensor pixels), which would benefit from a large distance between neighboring sensor pixels. The crosstalk may be understood as a phenomenon by which a signal transmitted on or received by one circuit or channel (e.g., a sensor pixel) creates an undesired effect in another circuit or channel (e.g., in another sensor pixel).

By way of example, the crosstalk may be due to electromagnetic phenomena(e.g., to inductive coupling and/or capacitive coupling, for example to a combination of inductive and capacitive coupling). In case that electrical conductors are arranged close to one another, a rapidly varying current flowing in one conductor may generate a rapidly varying magnetic field that induces a current flow in an adjacent conductor. Due to the fact that photo-electrons and the corresponding avalanche-electrons generated in a sensor pixel (e.g., in a photo-sensor pixel) are rapidly transferred to the evaluation electronics (e.g., to one or more processors or processing units), rapidly varying currents may flow in the sensor pixels and in the corresponding signal lines. Such rapidly varying currents may generate in the adjacent sensor pixels and signal lines a signal, which may be erroneously interpreted by the evaluation electronics as a photo-current signal coming from such sensor pixels. Illustratively, said signal may be interpreted as a signal due to light being detected (e.g., received) by a sensor pixel, whereas the signal may be due to crosstalk with another adjacent sensor pixel or signal line. The crosstalk may increase for decreasing distance between adjacent signal lines and/or adjacent sensor pixels. The crosstalk may also increase for increasing length of the portion(s) in which the sensor pixels and/or the signal lines are densely arranged next to one another.

In a conventional sensor, a (e.g., conventional) sensor pixel may have a rectangular shape, and a distance between adjacent sensor pixels may be constant (e.g., over an entire array of sensor pixels). The distance (e.g., sensor pixel-to-sensor pixel distance) may be selected such that a tradeoff between the two above-mentioned effects may be achieved. Illustratively, the distance may be selected such that an efficiency (e.g., a light collection efficiency) as high as possible may be provided, while keeping a crosstalk as low as possible at the same time. Hence, both efficiency and crosstalk are sub-optimal.

A quality criterion may be the signal-to-noise ratio (SNR). The smaller a sensor pixel is, the smaller the signal becomes. In case of noise contributions determined mainly via the electronics, a smaller signal may correspond to a lower (e.g., worse) SNR. In case the sensor pixels are arranged close to one another, the crosstalk may increase. An increase in the crosstalk may be considered as an increase in the noise, and thus the SNR may decrease. In case the two effects are substantially equally relevant (which may depend on the specific scenario), the total SNR may be typically optimized, e.g. reduced or minimized as much as possible.

In various embodiments, a sensor (e.g., the sensor 52) including one or more sensor pixels may be provided. The sensor may be for use in a LIDAR system (e.g., in the LIDAR Sensor System 10). A sensor pixel may be configured such that a distance to one or more adjacent (in other words, neighboring) sensor pixels varies along a predefined direction (e.g., a direction parallel or perpendicular to a scanning direction of the LIDAR system, for example over at least one direction of extension of the sensor pixel, such as over the width or the height of the sensor pixel). The sensor pixel (e.g., the size and/or the shape of the sensor pixel) may be configured such that the distance to the one or more adjacent sensor pixels is low in the region(s) where a high fill factor and a high efficiency are desirable. By way of example, said distance may be less than 10% of the width/height of a sensor pixel, for example less than 5%, for example less than 1%. The sensor pixel may be configured such that the distance to the one or more adjacent sensor pixels increases (e.g., to more than 10% of the width/height of the sensor pixel, for example to more than 50%) outside from said regions. Illustratively, the sensor pixel may be configured such that a crosstalk with adjacent sensor pixels is reduced in at least one region of the sensor pixel (e.g., the crosstalk may be lower in a certain region with respect to another region).

As an example, in case the sensor is used in a LIDAR system (e.g., in the receiver path of a LIDAR system), a high fill factor may be desirable in the central region of the field of view (e.g., in a region around the optical axis of the LIDAR system). This may provide the effect of achieving a high efficiency and thus a long range (e.g., a long detection range). In the edge regions of the field of view, achieving a long detection range may be less relevant. The sensor pixels may be configured (e.g., shaped and/or dimensioned) such that a distance between adjacent sensor pixels is smaller in the central region of the sensor (e.g., to achieve a higher fill factor) than in an edge region or in the edge regions of the sensor (e.g., to reduce crosstalk in those regions). A reduced crosstalk between adjacent sensor pixels, e.g. in a region of the sensor pixels, may provide the effect of a reduction of an overall crosstalk-related signal contribution. Illustratively, the overall crosstalk-related signal contribution may be seen as a combination (e.g., a sum) of the crosstalk-related signal contributions from individual sensor pixels and/or sensor pixel regions and/or signal lines (e.g., from individual pairs of sensor pixels and/or signal lines), such that reducing the crosstalk between adjacent sensor pixels may reduce the overall (e.g., combined) crosstalk effect.

In various embodiments, a sensor pixel may be configured such that in a first region (e.g., in a central region of the sensor, e.g. in a central region of the sensor pixel) the distance to one or more adjacent sensor pixels has a first value. The distance may be, for example, an edge-to-edge distance between the sensor pixel and the one or more adjacent sensor pixels. The sensor pixel may be configured such that in a second region (e.g., in an edge region or peripheral region of the sensor and/or of the sensor pixel) the distance with one or more adjacent sensor pixels has a second value. The first value may be smaller than the second value (e.g., it may be 2-times smaller, 5-times smaller, or 10-times smaller). As an example, a sensor pixel may have a rectangular shape in the first region (e.g., the sensor pixel may be shaped as a rectangle having a first extension, such as a first height or a first width). The sensor pixel may have a rectangular shape in the second region (e.g., the sensor pixel may be shaped as a rectangle having a second extension, such as a second height or a second width, smaller than the first extension).

Additionally or alternatively, a sensor pixel may be configured such that in the second region the distance with the one or more adjacent sensor pixels increases for increasing distance from the first region. As an example, the sensor pixel may have a tapered shape in the second region, for example a polygonal shape, such as a triangular shape or a trapezoidal shape. Illustratively, the active sensor pixel area may decrease moving from the center of the sensor pixel towards the edge(s) of the sensor pixel. The distance with the adjacent sensor pixels may increase accordingly.

It is understood that the possible shapes of the sensor pixel are not limited to the exemplary shapes described above. Furthermore, a sensor pixel may be configured according to a combination of the above-mentioned configurations. For example, a sensor pixel may be configured asymmetrically.

Illustratively, a sensor pixel may be configured such that in a second region the distance with the one or more adjacent sensor pixels has a constant value. The sensor pixel may be configured such that in another second region the distance with the one or more adjacent sensor pixels increases for increasing distance from the first region. By way of example, a sensor pixel may have a rectangular shape in a second region and a triangular shape or a trapezoidal shape in another second region.

In various embodiments, the sensor pixels may be arranged in a two-dimensional sensor pixel array. The sensor pixels may be configured such that a distance (e.g., an edge-to-edge distance) between central sensor pixels (e.g., between sensor pixels in a first region of the array, for example in a central array region) has a first value. The sensor pixels may be configured such that a distance between edge sensor pixels (e.g., between sensor pixels in a second region of the array, for example in an edge array region) has a second value. The first value may be smaller than the second value (e.g., it may be 2-times smaller, 5-times smaller, or 10-times smaller). The active sensor pixel area of the sensor pixels in the second region may be smaller than the active sensor pixel area of the sensor pixels in the first region. The active sensor pixel area of the sensor pixels may decrease for increasing distance from the first region (e.g., a sensor pixel arranged closer to the first region may have a greater active sensor pixel area than a sensor pixel arranged farther away from the first region). Illustratively, the two-dimensional sensor pixel array may be configured such that the central sensor pixels are arranged closely together and such that the edge pixels have a to smaller active sensor pixel area and are arranged further apart from one another with respect to the central sensor pixels. This configuration may further provide the effect that it may be easier to provide signal lines. Illustratively, the signal lines associated with the central sensor pixels may pass through the regions where the edge pixels are arranged, and thus a greater distance is between adjacent edge sensor pixels may simplify the arrangement (e.g., the deposition) of said signal lines.

In various embodiments, the receiver optics arrangement of the embodiments as described with reference to FIG. 33 to FIG. 37F may be used within the embodiments as described with reference to FIG. 120 to FIG. 122. The receiver optics arrangement may be configured to provide the desired de-focus effect into the direction to the edge of the image.

The optics in the receiver path of the LIDAR system (e.g., the receiver optics, e.g. a receiver optics arrangement) may be configured such that the imaging is sharper in the central region than at the edge(s). Illustratively, the receiver optics may be configured such that an object in the central region of the field of view (e.g., close to the optical axis of the LIDAR system) is imaged more sharply than an object at the edge of the field of view (e.g., farther away from the optical axis). This may reduce or substantially eliminate the risk of having light (e.g., reflected from an object in the field view) impinging between two sensor pixels (e.g., onto the space between adjacent sensor pixels, e.g. onto an optically inactive area), which light would not be detected. A receiver optics with such properties may be provided based on an effect same or similar to the field curvature of an optical system (illustratively, the receiver optics may be configured to provide an effect same or similar to the field curvature of the optical system). By way of example, the receiver optics may be configured as the LIDAR receiver optics arrangement described in relation to FIG. 33 to FIG. 37F.

In various embodiments, the first region may be a first edge region (in other words, a first peripheral region). The second region may be a second edge region. Illustratively, the first region may extend from a certain location in the sensor pixel (e.g., from the center of the sensor pixel) towards a first edge (e.g., a first border) of the sensor pixel. The second region may extend from that location towards a second edge, opposite to the first edge. The sensor pixel may thus be configured such that the portion(s), in which the distance to the one or more adjacent sensor pixels is reduced, is/are asymmetrically shifted to one side of the sensor pixel. This configuration may be implemented, for example, in a LIDAR system in which a higher (e.g., optimal) resolution is desirable in a region other than the central region.

By way of example, this asymmetric configuration may be implemented in a vehicle including more than one LIDAR system (e.g., including not only a central forward-facing LIDAR system). The field of view of the LIDAR systems may overlap (e.g., at least partially). The main emphasis of each of these LIDAR systems (e.g., a region having higher efficiency) may for example be shifted towards one of the edges. As an example, a LIDAR system may be arranged in the left head lamp (also referred to as headlight) of a vehicle and another LIDAR system may be arranged in the right head lamp of the vehicle. As another example, two frontal (e.g., front-facing) LIDAR systems may be arranged in one head lamp of the vehicle, e.g. on the right side and on the left side of the head lamp. The respective field of view of the LIDAR systems may overlap in the center (e.g., the center of the vehicle or the center of the head lamp). Since the overlapping region may be more relevant than the other regions, the sensor pixel areas with the higher efficiency (e.g., with the lower distance between adjacent sensor pixels) may be shifted towards the center (e.g., of the vehicle or of the head lamp).

Another example may be a corner LIDAR system, in which the more relevant region(s) may be located off-center.

The sensor may be any suitable type of sensor commonly used for LIDAR applications. As an example, the sensor may be a photo-sensor, for example including one or more avalanche photo diodes and/or one or more single photon avalanche photo diodes. In such photo diodes high avalanche currents may be generated in a short time. The sensor may also be a pn-photo diode or a pin-photo diode.

In various embodiments, a high fill factor and a low crosstalk may be achieved in the critical region(s) (e.g., in the one or more regions that are more relevant for the detection of LIDAR light). This effect may be provided by a reduction in the size, e.g. the length of the portion in which the sensor pixels are closely spaced with respect to one another and in which the sensor pixels are more densely arranged together.

FIG. 120 shows a top view of a LIDAR system 12000 in a schematic view, in accordance with various embodiments.

The LIDAR system 12000 may be configured as a scanning LIDAR system. By way of example, the LIDAR system 12000 may be or may be configured as the LIDAR Sensor System 10 (e.g., as a scanning LIDAR Sensor System 10). Alternatively, the LIDAR system 12000 may be configured as a Flash LIDAR system.

The LIDAR system 12000 may include an optics arrangement 12002. The optics arrangement 12002 may be configured to receive (e.g., collect) light from the area surrounding or in front of the LIDAR system 12000. The optics arrangement 12002 may be configured to direct (e.g., to focus or to collimate) the received light towards a sensor 52 of the LIDAR system 12000. The optics arrangement 12002 may have or may define a field of view 12004 of the optics arrangement 12002. The field of view 12004 of the optics arrangement 12002 may coincide with the field of view of the LIDAR system 12000. The field of view 12004 may define or may represent an area (or a solid angle) through (or from) which the optics arrangement 12002 may receive light (e.g., an area visible through the optics arrangement 12002).

The field of view 12004 may have a first angular extent in a first direction (e.g., the direction 12054 in FIG. 120, for example the horizontal direction). By way of example, the field of view 12004 of the optics arrangement 12002 may be about 60° in the horizontal direction, for example about 50°, for example about 70°, for example about 100°. The field of view 12004 may have a second angular extent in a second direction (e.g., the direction 12056 in FIG. 120, for example the vertical direction, illustratively coming out from the plane). By way of example, the field of view 12004 of the optics arrangement 12002 may be about 10° in the vertical direction, for example about 5°, for example about 20°, for example about 30°. The first direction and the second direction may be perpendicular to an optical axis 12006 of the optics arrangement 12002 (illustratively, the optical axis 12006 may be directed or aligned along the direction 12052 in FIG. 120). The first direction may be perpendicular to the second direction. The definition of first direction and second direction (e.g., of horizontal direction and vertical direction) may be selected arbitrarily, e.g. depending on the chosen coordinate (e.g. reference) system. The optical axis 12006 of the optics arrangement 12002 may coincide with the optical axis of the LIDAR system 12000.

The LIDAR system 12000 may include at least one light source 42. The light source 42 may be configured to emit light, e.g. a light signal (e.g., to generate a light beam 12008). The light source 42 may be configured to emit light having a predefined wavelength, e.g. in a predefined wavelength range. For example, the light source 42 may be configured to emit light in the infra-red and/or near infra-red range (for example in the range from about 700 nm to about 5000 nm, for example in the range from about 860 nm to about 2000 nm, for example 905 nm). The light source 42 may be configured to emit LIDAR light (e.g., the light signal may be LIDAR light). The light source 42 may include a light source and/or optics for emitting light in a directional manner, for example for emitting collimated light (e.g., for emitting laser light). The light source 42 may be configured to emit light in a continuous manner and/or it may be configured to emit light in a pulsed manner (e.g., to emit a sequence of light pulses, such as a sequence of laser pulses).

The LIDAR system 12000 may include a scanning unit 12010 (e.g., a beam steering unit). The scanning unit 12010 may be configured to receive the light beam 12008 emitted by the light source 42. The scanning unit 12010 may be configured to direct the received light beam 12010 towards the field of view 12004 of the optics arrangement 12002. In the context of the present application, the light signal output from (or by) the scanning unit 12010 (e.g., the light signal directed from the scanning unit 12010 towards the field of view 12004) may be referred to as light signal 12012 or as emitted light 12012 or as emitted light signal 12012.

The scanning unit 12010 may be configured to control the emitted light signal 12012 such that a region of the field of view 12004 is illuminated by the emitted light signal 12012. The illuminated region may extend over the entire field of view 12004 in at least one direction (e.g., the illuminated region may be seen as a line extending along the entire field of view 12004 in the horizontal or in the vertical direction). Alternatively, the illuminated region may be a spot (e.g., a circular region) in the field of view 12004.

The scanning unit 12010 may be configured to control the emission of the light signal 12012 to scan the field of view 12004 with the emitted light signal 12012 (e.g., to sequentially illuminate different portions of the field view 12004 with the emitted light signal 12012). The scan may be performed along a scanning direction (e.g., a scanning direction of the LIDAR system 12000). The scanning direction may be a direction perpendicular to the direction along which the illuminated region extends. The scanning direction may be the horizontal direction or the vertical direction (by way of example, in FIG. 120 the scanning direction may be the direction 12054, as illustrated by the arrows).

The scanning unit 12010 may include a suitable (e.g., controllable) component or a suitable configuration for scanning the field of view 12004 with the emitted light 12012. As an example, the scanning unit 12010 may include one or more of a 1D MEMS mirror, a 2D MEMS mirror, a rotating polygon mirror, an optical phased array, a beam steering element based on meta materials, or the like. As another example, the scanning unit 12010 may is include a controllable light emitter, e.g. a light emitter including a plurality of light emitting elements whose emission may be controlled (for example, column wise or pixel wise) such that scanning of the emitted light 12012 may be performed. As an example of controllable light emitter, the scanning unit 12010 may include a vertical cavity surface emitting laser (VCSEL) array, or the like.

The LIDAR system 12000 may include at least one sensor 52 (e.g., a light sensor, e.g. a LIDAR sensor). The sensor 52 may be configured to receive light from the optics arrangement 12002 (e.g., the sensor 52 may be arranged in the focal plane of the optics arrangement 12002). The sensor 52 may be configured to operate in a predefined range of wavelengths, for example in the infra-red range and/or in the near infra-red range (e.g., from about 860 nm to about 2000 nm, for example from about 860 nm to about 1600 nm).

The sensor 52 may include one or more sensor pixels. The one or more sensor pixels may be configured to generate a signal, e.g. one or more sensor pixel signals. The one or more sensor pixel signals may be or may include an analog signal (e.g. an electrical signal, such as a current). The one or more sensor pixel signals may be proportional to the amount of light collected by the sensor 52 (e.g., to the amount of light arriving on the respective sensor pixel). By way of example, the sensor 52 may include one or more photo diodes. Illustratively, each sensor pixel 12020 may include or may be associated with a respective photo diode (e.g., of the same type or of different types). By way of example, at least one photo diode may be based on avalanche amplification. At least one photo diode (e.g., at least some to photo diodes or all photo diodes) may be an avalanche photo diode. The avalanche photo diode may be a single-photon avalanche photo diode. As another example, at least one photo diode may be a pin photo diode. As another example, at least one photo diode may be a pn-photo diode.

The LIDAR system 12000 may include a signal converter, is such as a time-to-digital converter. By way of example, a read-out circuitry of the LIDAR system 12000 may include the time-to-digital converter (e.g., a timer circuit of the read-out circuitry may include the time-to-digital converter). The signal converter may be coupled to at least one photo diode (e.g., to the at least one avalanche photo diode, e.g. to the at least one single-photon avalanche photo diode). The signal converter may be configured to convert the signal provided by the at least one photo diode into a digitized signal (e.g., into a signal that may be understood or processed by one or more processors or processing units of the LIDAR system 12000). The LIDAR system 12000 may include an amplifier (e.g., a transimpedance amplifier). By way of example, an energy storage circuit of the LIDAR system 12000 may include the transimpedance amplifier. The amplifier may be configured to amplify a signal provided by the one or more photo diodes (e.g., to amplify a signal provided by each of the photo diodes). The LIDAR system 12000 may include a further signal converter, such as an analog-to-digital converter. By way of example, the read-out circuitry of the LIDAR system 12000 may include the analog-to-digital converter. The further signal converter may be coupled downstream to the amplifier. The further signal converter may be configured to convert a signal (e.g., an analog signal) provided by the amplifier into a digitized signal (in other words, into a digital signal). Additionally or alternatively, the sensor 52 may include a time-to-digital converter and/or an amplifier (e.g., a transimpedance amplifier) and/or an analog-to-digital converter configured as described herein.

The sensor 52 may include one or more signal lines. Each signal line may be coupled to at least one sensor pixel (e.g., a signal line may be coupled to one or more respective sensor pixels). The one or more signal lines may be configured to transport the signal provided by the sensor pixel(s) coupled thereto. The one or more signal lines may be configured to transport the signal provided by the sensor pixel(s) to one or more processors (e.g., one or more processing units) of the LIDAR system 12000.

The LIDAR system 12000 may be installed (or retrofitted) in a vehicle. The sensor 52 may, for example, be installed (or retrofitted) in the vehicle, such as in a head lamp of the vehicle. By way of example, a head lamp may include the sensor 52 (e.g., each head lamp of the vehicle may include a sensor 52). A head lamp may also include more than one sensor 52 (e.g., a plurality of sensors 52 with a same configuration or with different configurations). As an example, the right head lamp and the left head lamp of a vehicle may each include a respective sensor 52. The LIDAR system 12000 may include a pixel signal selection circuit 11624 to evaluate the signal generated from each sensor 52 (as described, for example, in relation to FIG. 116A to FIG. 119).

The sensor 52 (e.g., the one or more sensor pixels and/or the one or more signal lines) may be configured to reduce or substantially eliminate the crosstalk between adjacent sensor pixels, while maintaining high efficiency (e.g., light collection efficiency). The configuration of the sensor 52 will be explained in further detail below, for example in relation to FIG. 121A to FIG. 122.

Figure 121A:
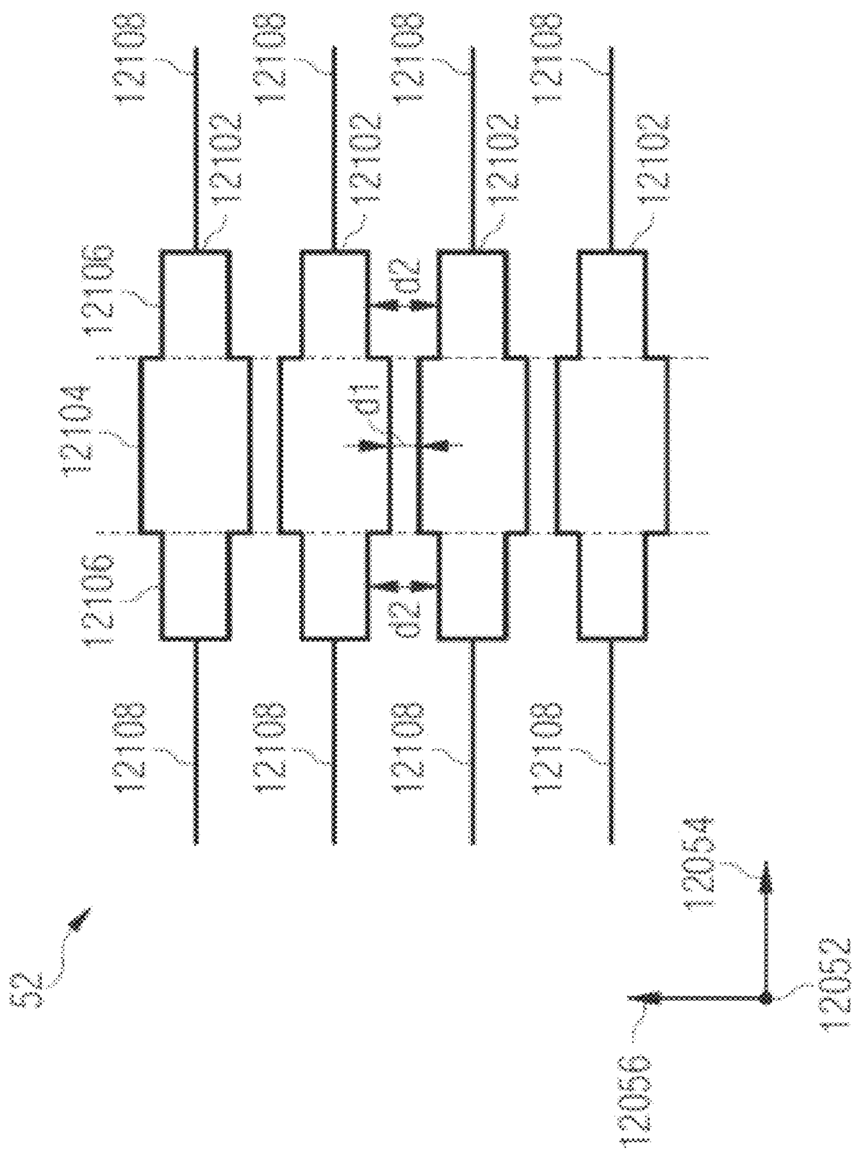
Figure 121B:
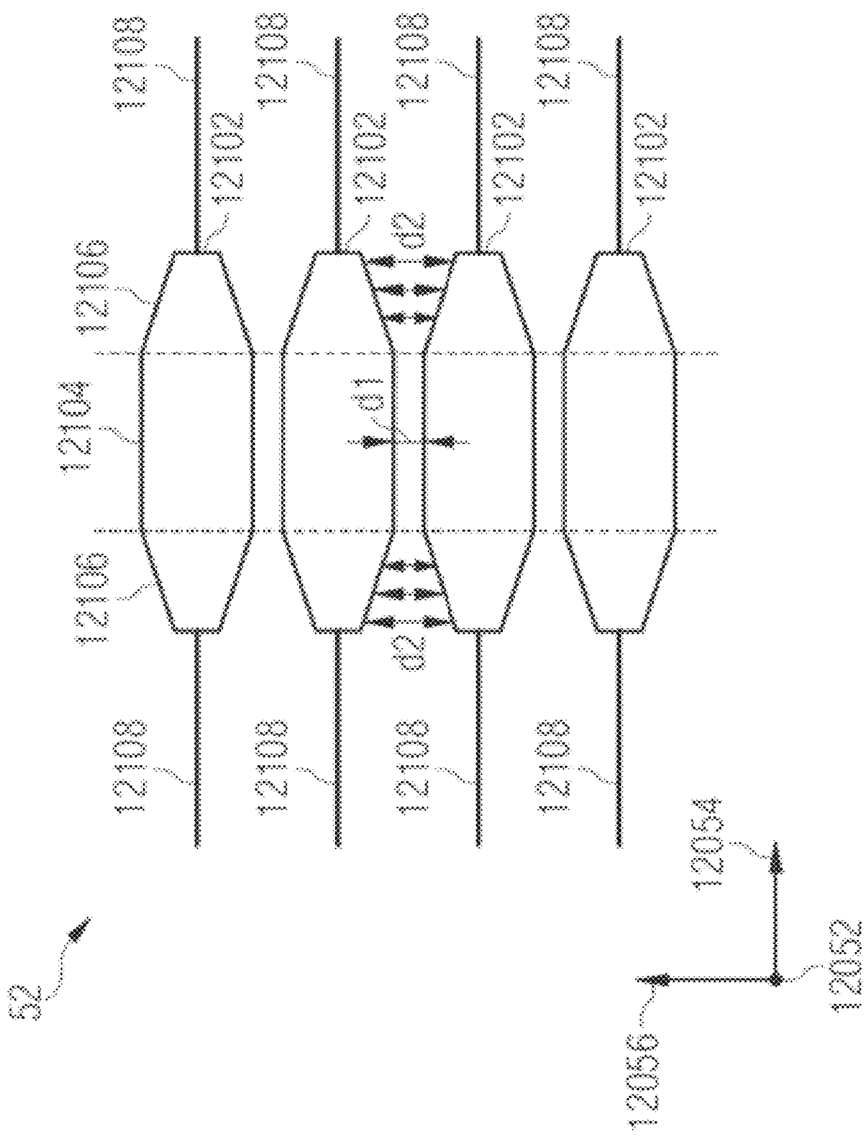

FIG. 121A and FIG. 121B show each a sensor 52 including one or more sensor pixels 12102 and one or more signal lines 12108 in a schematic view, in accordance with various embodiments.

The sensor 52 may be configured as a sensor array. By way of example, the sensor 52 may be configured as a 1D-sensor array (e.g., a one-dimensional sensor array). Illustratively, the one or more sensor pixels 12102 may be arranged (e.g., aligned) along a same line (e.g., along a same direction). By way of example, the one or more sensor pixels 12102 may be aligned along a direction perpendicular to the scanning direction of the LIDAR system 12000. The one or more sensor pixels 12102 may be aligned, for example, along the vertical direction (e.g., the direction 12056), e.g. the sensor 52 may include a column of sensor pixels 12102, as illustrated for example in FIG. 121A and FIG. 121B. Alternatively, the one or more sensor pixels 12102 may be aligned, for example, along the horizontal direction (e.g., the direction 12054), e.g. the sensor 52 may include a row of sensor pixels 12102. As another example, the sensor 52 may be configured as a 2D-sensor array (e.g., a two-dimensional sensor array), as it will be explained in further detail below, for example in relation to FIG. 122.

A sensor pixel 12102 (e.g., each sensor pixel 12102) may include a first region 12104. The first region 12104 may be a central region, e.g. the first region 12104 may be arranged in a central portion of the respective sensor pixel 12102 (e.g., in a central portion of the sensor 52). Illustratively, the first region 12104 may be arranged in a region of the sensor 52 (e.g., of a sensor pixel 12102) onto which it may be expected that light coming from an object relevant for the LIDAR detection will impinge. As an example, the first region 12104 may be arranged such that light coming from an object located close (e.g., at a distance less than 5 m or less than 1 m) to the optical axis 12006 of the LIDAR system 12000 may impinge onto the first region 12104. The first region 12104 may be arranged such that light coming from the center of the field of view 12004 may impinge onto the first region 12104.

A sensor pixel 12102 (e.g., each sensor pixel 12102) may include a second region 12106. The second region 12106 may be an edge region, e.g. the second region 12106 may be arranged in an edge portion (in other words, a peripheral portion) of the respective sensor pixel 12102 (e.g., of the sensor 52). Illustratively, the second region 12106 may be arranged in a region of the sensor 52 (e.g., of a sensor pixel 12102) onto which it may be expected that light coming from an object less relevant for the LIDAR detection will impinge. As an example, the second region 12106 may be arranged such that light coming from an object located farther away (e.g., at a distance greater than 5 m or greater than 10 m) from the optical axis 12006 of the LIDAR system 12000 may impinge onto the second region 12106. The second region 12106 may be arranged such that light coming from the edge(s) of the field of view 12004 may impinge onto the second region 12106.

The second region 12106 may be arranged next to the first region 12104 (e.g., immediately adjacent to the first region 12104). Illustratively, the first region 12104 and the second region 12106 may be seen as two adjacent portions of a sensor pixel 12102. The second region 12106 may be arranged next to the first region 12104 in a direction parallel to the scanning direction of the LIDAR system 12000. By way of example, the second region 12106 may be next to the first region 12104 in the horizontal direction (as illustrated, for example, in FIG. 121A and FIG. 121B). Alternatively, the second region 12106 may be next to the first region 12104 in the vertical direction. The second region 12106 may also at least partially surround the first region 12104 (e.g., the second region 12106 may be arranged around two sides or more of the first region 12104, e.g. around three sides or more of the first region 12104).

A sensor pixel 12102 may have more than one second region 12106 (e.g., two second regions 12106 as illustrated, for example, in FIG. 121A and FIG. 121B). The plurality of second regions 12106 may be edge regions of the sensor pixel 12102. By way of example, one of the second regions 12106 may be arranged at a first edge (e.g., a first border) of the sensor pixel 12102. Another one of the second regions 12106 may be arranged at a second edge (e.g., a second border) of the sensor pixel 12102. The second edge may be opposite the first edge. The extension (e.g., the length or the width) and/or the area of the second regions 12106 may be the same. Alternatively, the second regions 12106 may have a different extension and/or area (e.g., the sensor pixel 12106 may be configured or shaped asymmetrically). The first region 12104 may be arranged between the second regions 12106. Illustratively, the first (e.g., central) region 12104 may be sandwiched between two second (e.g., edge) regions 12106.

A sensor pixel 12102 may be configured such that a distance (e.g., an edge-to-edge distance) between the sensor pixel 12102 and one or more adjacent sensor pixels 12102 varies along at least one direction of extension of the sensor pixel 12102. The sensor pixel 12102 may be configured such that said distance varies along a direction parallel to the scanning direction of the LIDAR system 12000. By way of example, said distance may vary along the horizontal direction (e.g., along a width or a length of the sensor pixel 12102). Alternatively, said distance may vary along the vertical direction (e.g., along a height of the sensor pixel 12102).

A sensor pixel 12102 may be configured such that the distance between the sensor pixel 12102 and one or more adjacent sensor pixels 12102 has a first value $d_1$ in the first region (e.g., in the portion where the first region of the sensor pixel 12102 and the first region of the adjacent sensor pixels 12102 overlap). The sensor pixel 12102 may be configured such that said distance has a second value $d_2$ in the second region (e.g., in the portion where the second region of the sensor pixel 12102 and the second region of the adjacent sensor pixels 12102 overlap). The second value $d_2$ may be smaller (e.g., 2-times smaller, 5-times smaller, or 10-times smaller) than the first value $d_1$. This may provide the effect that in the first region a high fill factor may be achieved (e.g., a large optically active area may be provided). At the same time, in the second region the crosstalk between the sensor pixel 12102 and the adjacent sensor pixels 12102 may be reduced or substantially eliminated.

A sensor pixel 12102 may have a larger extension (e.g., a larger lateral extension) in the first region 12104 than in the second region 12106. The sensor pixel 12102 may have a larger extension in a direction perpendicular to the scanning direction of the LIDAR system 12000 in the first region 12104 than in the second region 12106. By way of example, the sensor pixel 12102 may have a larger extension in the vertical direction in the first region 12104 than in the second region 12106. Illustratively, the sensor pixel 12102 may have a first height in the first region 12104 and a second height in the second region 12106, wherein the second height may be smaller than the first height.

A same or similar configuration may be provided for a sensor pixel 12102 having more than one second region 12106. The sensor pixel 12102 may be configured such that the distance between the sensor pixel 12102 and one or more adjacent sensor pixels 12102 has the second value $d_2$ in the second regions 12106 (or a respective value smaller than $d_1$ in each of the second regions 12106). The sensor pixel 12102 may have a larger extension in the first region 12104 than in the second regions 12106. The sensor pixel 12102 may have a larger extension in a direction perpendicular to the scanning direction of the LIDAR system 12000 in the first region 12104 than in the second regions 12106. By way of example, the sensor pixel 12102 may have a larger extension in the vertical direction in the first region 12104 than in the second region 12106. Illustratively, the sensor pixel 12102 may have a first height in the first region 12104 and a second height in the second regions 12106 (or a respective height smaller than the first height in each of the second regions 12106), wherein the second height may be smaller than the first height.

The shape of the one or more sensor pixels 12102 (e.g., of the first region 12104 and/or of the second region(s) 12106) may be adjusted to increase the optically active area in the relevant (e.g., central) region and to decrease the crosstalk in the other (e.g., edge) regions.

A sensor pixel 12102 may be configured such that the distance to one or more adjacent sensor pixels 12102 has a (substantially) constant value in the first region (e.g., the first value $d_1$). By way of example, the first region 12104 may have a rectangular shape or a square shape.

The sensor pixel 12102 may be configured such that the distance to one or more adjacent sensor pixels 12102 has a (substantially) constant value in the second region (e.g., the second value $d_2$). By way of example, the second region 12106 may have a rectangular shape or a square shape. Illustratively, the sensor pixel 12102 may be configured (e.g., shaped) with a sudden (in other words, step-wise) variation in the height of the sensor pixel 12102 (as illustrated, for example, in FIG. 121A).

Additionally or alternatively, a sensor pixel 12102 may be configured such that the distance to one or more adjacent sensor pixels 12102 varies over the second region 12106 (as illustrated, for example, in FIG. 121B). The sensor pixel 12102 may have a tapered shape in the second region 12106. Illustratively, the height of the sensor pixel 12102 may decrease (e.g., gradually or step-wise) from an initial value at the beginning of the second region 12106 (e.g., at the interface with the first region 12104) to a final value at the end of the second region 12106 (e.g., at the edge of the sensor pixel 12102). By way of example, the second region 12106 may have a polygonal shape, such as a triangular shape or a trapezoidal shape. Correspondingly, the distance to the one or more adjacent sensor pixels 12102 may decrease from an initial value at the beginning of the second region 12106 to a final value at the end of the second region 12106 in a gradual or step-wise manner.

Described differently, the one or more sensor pixels 12102 may be configured such that a sensor pixel active area (e.g., a total sensor pixel active area) decreases for increasing distance from the center of the sensor 52. The distance may be a distance along a direction parallel to the scanning direction of the LIDAR system 12000 (e.g., along the direction 12054). The sensor pixel active area may be understood as an optically active area, e.g. an area configured such that when light (e.g., reflected LIDAR light) impinges onto said area a signal is generated.

A sensor pixel 12102 may be configured (e.g., dimensioned and/or shaped) such that an active sensor pixel area is smaller in the second region 12106 than in the first region 12104. Illustratively, the one or more sensor pixels 12102 may be configured such that an active sensor pixel area (e.g., a total active sensor pixel area) is smaller in the second region 12106 (e.g., in a region of the sensor 52 including the one or more second regions 12106 of the one or more sensor pixels 12102) than in the first region 12104 (e.g., in a region of the sensor 52 including the one or more first regions 12106 of the one or more sensor pixels 12102). The total active sensor pixel area may be seen as the sum of the active sensor pixel areas of the individual sensor pixels 12102.

The transition between the active sensor pixel area in the first region 12104 and in the second region 12106 may occur step-wise. A sensor pixel 12102 may be configured such that the active sensor pixel area has a first value in the first region 12104 and a second value in the second region 12106. The first value may be smaller than the second value. Illustratively, the one or more sensor pixels 12102 may be configured such that the total active sensor pixel area has a first value in the first region 12104 and a second value in the second region 12106.

The transition between the active sensor pixel area in the first region 12104 and in the second region 12106 may occur gradually. A sensor pixel 12102 may be configured such that the active sensor pixel area decreases in the second region 12106 for increasing distance from the first region 12104 (e.g., from the interface between the first region 12104 and the second region 12106). The decrement of the active sensor pixel area may occur along the direction along which the first region 12104 and the second region 12106 are arranged next to each other (e.g., along a direction parallel to the scanning direction of the LIDAR system 12000). Illustratively, the one or more sensor pixels 12102 may be configured such that the total active sensor pixel area decreases in the second region 12106 for increasing distance from the first region 12104.

Figure 121C:
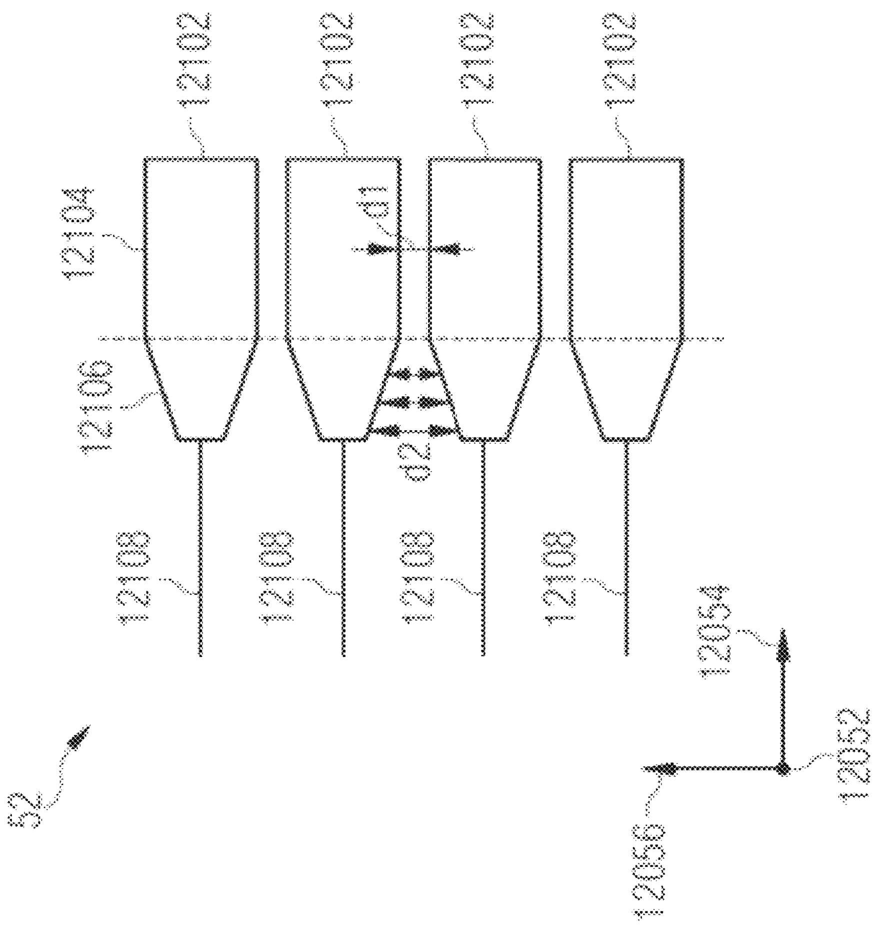
Figure 121D:
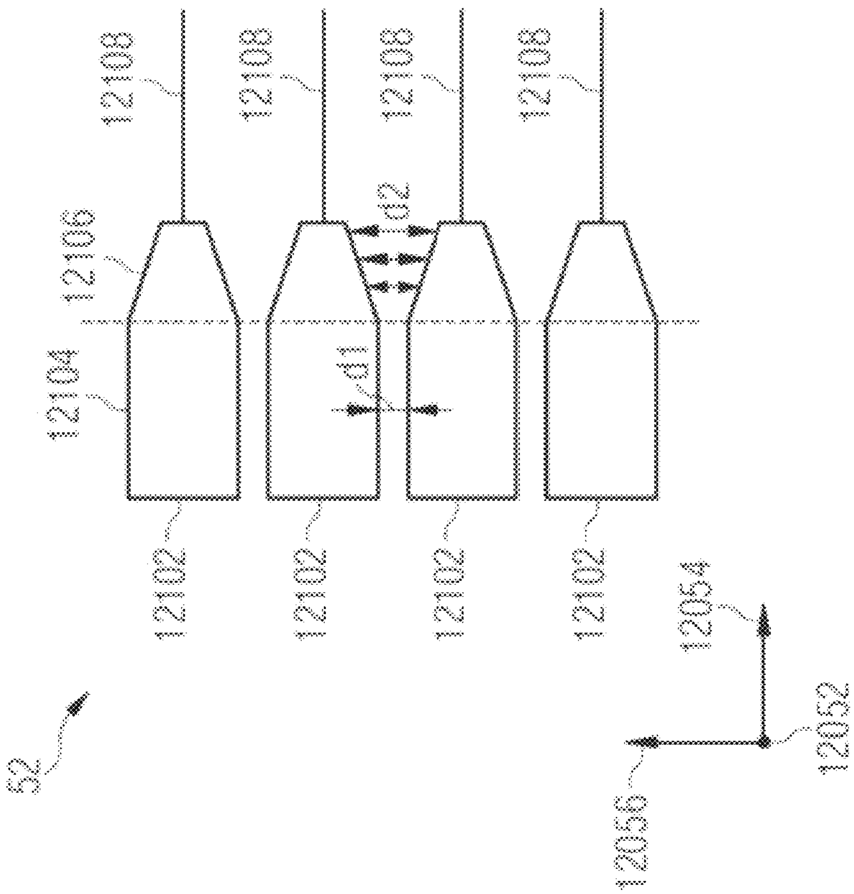

FIG. 121C and FIG. 121D show each a sensor 52 including one or more sensor pixels 12102 in a schematic view, in accordance with is various embodiments.

The first region 12104 may be an edge region, e.g. the first region 12104 may be arranged in an edge portion of the respective sensor pixel 12102. Illustratively, the first region 12104 may be arranged in an edge portion of the sensor pixel 12102 and the second region 12106 may be arranged in another (e.g., opposite) edge portion of the sensor pixel 12102. In this configuration, the portion(s) in which the distance between adjacent sensor pixels 12102 is increased (e.g., the second regions 12106 with smaller extension) may be shifted towards one side of the sensor pixels 12102 (e.g., towards one side of the sensor 52).

This configuration may be beneficial in case the portion of the sensor 52 in which a greater sensor pixel active area is desirable (e.g., an area onto which light more relevant for the LIDAR detection may be expected to impinge) is shifted towards one side of the sensor 52 (illustratively, the side comprising the first regions 12104 of the one or more sensor pixels 12102).

By way of example, this configuration may be beneficial in case the sensor 52 is included in a head lamp of a vehicle. The sensor 52 (e.g., the one or more sensor pixels 12102) may be configured such that a greater (e.g., total) sensor pixel active area is provided in the side of the sensor 52 arranged closer to the center of the vehicle. A smaller sensor pixel active area may be provided in the side of the sensor 52 arranged farther away from the center of the vehicle, so as to reduce the crosstalk. Illustratively, the sensor 52 shown in FIG. 121C may be included in the left head lamp of a vehicle (e.g., when looking along the longitudinal axis of the vehicle in forward driving direction). The sensor 52 shown in FIG. 121D may be included in the left head lamp of a vehicle. In this configuration, the LIDAR system 12000 may include one or more processors configured to evaluate the signal provided by each sensor 52. By way of example, the one or more processors may be configured to evaluate the fulfillment of a coincidence criterion between the different signals. As another example, the one or more processors may be configured to evaluate the signals based on the direction of the incoming light (e.g., based on which sensor 52 generated the signal).

It is intended that at least one sensor pixel 12102 or a plurality of sensor pixels 12102 or each sensor pixel 12102 may be configured as described above in relation to FIG. 121A to FIG. 121D. The sensor pixels 12102 may also be configured differently from one another. As an example, a sensor pixel 12102 may be configured as described in relation to FIG. 121A and another sensor pixel 12102 may be configured as described in relation to FIG. 121B. As another example, a sensor pixel 12102 may have one second region 12106 configured such that the distance with the adjacent sensor pixels remains constant over the second region 12106, and another second region 12106 configured such that said distance increases for increasing distance from the first region 12104.

FIG. 122 shows a sensor 52 including a plurality of sensor pixels 12202 and one or more signal lines 12208 in a schematic view, in accordance with various embodiments.

The sensor 52 may be configured as a 2D-sensor array. The plurality of sensor pixels 12202 may be arranged in a two-dimensional sensor pixel array. The 2D-sensor array may include a plurality of columns and a plurality of rows. In the exemplary representation in FIG. 122 a sensor pixel array including five columns of sensor pixels 12202 and three rows of sensor pixels 12202 is illustrated. It is understood that the sensor pixel array may include any suitable number of columns and/or rows of sensor pixels 12202. The sensor pixels 12202 (e.g., at least one sensor pixel 12202 of the plurality of sensor pixels 12202) may be configured as described above in relation to FIG. 121A to FIG. 121D.

The sensor pixel array may include a first array region 12204. The first array region 12204 may include one or more sensor pixels 12202 (e.g., one or more central sensor pixels 12202). The first array region 12204 may be a central region, e.g. the first array region 12204 may be arranged in a central portion of the sensor pixel array. Illustratively, the first array region 12204 may be arranged in a region of the sensor 52 (e.g., of the sensor pixel array) onto which it may be expected that light coming from an object relevant for the LIDAR detection will impinge. As an example, the first array region 12204 may be arranged such that light coming from an object located close to the optical axis 12006 of the LIDAR system 12000 may impinge onto the first array region 12204 (e.g., onto the sensor pixels 12202 arranged in the first array region 12204). The first array region 12204 may be arranged such that light coming from the center of the field of view 12004 may impinge onto the first array region 12204.

The sensor pixel array may include a second array region 12206. The second array region 12206 may include one or more sensor pixels 12202 (e.g., one or more edge sensor pixels 12202). The second array region 12206 may be an edge region, e.g. the second array region 12206 may be arranged in an edge portion (in other words, a peripheral portion) of the sensor pixel array. Illustratively, the second array region 12206 may be arranged in a region of the sensor 52 (e.g., of the sensor pixel array) onto which it may be expected that light coming from an object less relevant for the LIDAR detection will impinge. As an example, the second array region 12206 may be arranged such that light coming from an object located farther away from the optical axis 12006 of the LIDAR system 12000 may impinge onto the second array region 12206. The second array region 12206 may be arranged such that light coming from the edge(s) of the field of view 12004 may impinge onto second array region 12206.

Alternatively, the first array region 12204 may be an edge region of the sensor pixel array (e.g., a first edge region, arranged in an edge portion of the sensor pixel array). The second array region 12206 may be a second edge region of the sensor pixel array (e.g., the second array region 12206 may be arranged in another edge portion of the sensor pixel array). This configuration may be beneficial in case the portion of the sensor pixel array in which a greater sensor pixel active area is desirable (e.g., an area onto which light more relevant for the LIDAR detection may be expected to impinge) is shifted towards one side of the sensor pixel array (illustratively, the side comprising the first array region 12204). By way of example, this configuration may be beneficial in case the sensor pixel array is included in a head lamp of a vehicle (e.g., in the left head lamp of a vehicle).

The second array region 12206 may be arranged next to the first array region 12204 (e.g., immediately adjacent to the first array region 12204). Illustratively, the first array region 12204 and the second array region 12206 may be seen as two adjacent portions of a sensor pixel array. The second array region 12206 may be arranged next to the first array region 12204 in a direction parallel to the scanning direction of the LIDAR system 12000. By way of example, the second array region 12206 may be next to the first array region 12204 in the horizontal direction (as illustrated, for example, in FIG. 122). Alternatively, the second array region 12206 may be next to the first array region 12204 in the vertical direction. The second array region 12206 may also be next to the first array region 12204 in both the horizontal direction and the vertical direction. Illustratively, the sensor pixel array may include one or more second regions 12206 next to the first array region 12204 in the horizontal direction and one or more other second regions 12206 next to the first array region 12204 in the vertical direction (e.g., forming a cross-like arrangement).

The sensor pixel array may have more than one second array region 12206 (e.g., two array second regions 12206 as illustrated, for example, in FIG. 122). The plurality of second array regions 12206 may be edge regions of the sensor pixel array. By way of example, one of the second array regions 12206 may be arranged at a first edge (e.g., a first border) of the sensor pixel array. Another one of the second array regions 12206 may be arranged at a second edge (e.g., a second border) of the sensor pixel array. The second edge may be opposite the first edge. The number of sensor pixels 12202 of the second regions 12106 may be the same. Alternatively, the second regions 12106 may include a different number of sensor pixels 12202. The first array region 12204 may be arranged between the second array regions 12206. Illustratively, the first (e.g., central) array region 12204 may be sandwiched between two second (e.g., edge) array regions 12206.

The sensor pixel array may be configured such that an active sensor pixel area decreases moving towards the edge(s) of the sensor pixel array. The active sensor pixel area may have a larger extension in the first array region 12204 than in the second array region 12206. The larger extension may be in a direction perpendicular to the scanning direction of the LIDAR system 12000. The direction may be perpendicular to the direction along which the first array region 12204 and the second array region 12206 are arranged next to each other. By way of example, the direction may be the vertical direction (as illustrated, for example, in FIG. 122). In case the sensor pixel array includes a plurality (e.g., two) second array regions 12206, the active sensor pixel area may have a larger extension in the first array region 12204 than in the second array regions 12206 (e.g., than in each second array region 12206).

The sensor pixels 12202 may be configured (e.g., shaped) such that the active sensor pixel area has a larger extension in the first array region 12204 than in the second array region 12206. As an example, the sensor pixels 12202 may have a rectangular shape. As another example, the sensor pixels 12202 may have a non-rectangular shape, for example a circular shape or a polygonal shape (e.g., a triangular shape, a trapezoidal shape, or a hexagonal shape). The sensor pixels 12202 arranged along the same line with respect to the direction perpendicular to the scanning direction of the LIDAR system 12000 may have the same shape and/or size. By way of example, the sensor pixels 12202 in a same column of sensor pixels 12202 may have the same shape and/or size (e.g., the same width and the same height, or the same diameter). The sensor pixels 12202 arranged along the same line with respect to a direction parallel to the scanning direction of the LIDAR system 12000 may have a smaller size (e.g., a smaller width and/or a smaller height, or a smaller diameter) in the second array region 12206 than in the first array region 12204. Additionally or alternatively, the sensor pixels 12202 arranged along the same line with respect to a direction parallel to the scanning direction of the LIDAR system 12000 may have a different shape in the second array region 12206 with respect to the first array region 12204. By way of example, the size of the sensor pixels 12202 in a same row may be smaller in the second array region 12206 than in the first array region 12204.

Illustratively, the size of the sensor pixels 12202 may decrease for increasing distance of the sensor pixels 12202 from the first array region 12204. By way of example, the sensor pixels 12202 in a first column of the second array region 12206 may have a smaller size with respect to the sensor pixels 12202 in the first array region 12204. The sensor pixels 12202 in the first column may have larger size with respect to the sensor pixels 12202 in a second column of the second array region 12206 arranged farther away from the first array region 12204 than the first column.

Additionally or alternatively, the shape of the sensor pixels 12202 in the second array region 12206 may be different from the shape of the sensor pixels 12202 in the first array region 12204. The shape of the sensor pixels 12202 in the second array region 12206 may be selected such that the active sensor pixel area has a larger extension in the first array region 12204 than in the second array region 12206. By way of example, the sensor pixels 12202 may have a rectangular shape in the first array region 12204 and a hexagonal shape in the second array region 12206 (e.g., a symmetrical hexagonal shape or an asymmetrical hexagonal shape, for example larger in the horizontal direction than in the vertical direction).

Further illustratively, the distance (e.g., edge-to-edge distance) between adjacent sensor pixels 12202 may increase for increasing distance of the sensor pixels 12202 from the first array region 12204. The distance between adjacent sensor pixels 12202 in the first array region 12204 may have a first value $d_1$. The distance between adjacent sensor pixels 12202 in the first column in the second array region 12206 may have a second value $d_2$. The distance between adjacent sensor pixels 12202 in the second column in the second array region 12206 may have a third value $d_3$. The first value d1 may be greater than the second value $d_2$ and the third value $d_3$. The second value $d_2$ may be greater than the third value $d_3$.

By way of example, in a two-dimensional APD sensor array, since each photo diode is contacted individually, in various embodiments, the layout of the lines contacting the photo diode (e.g. the wiring of the front side (row wiring) of the sensor pixels) may be more relaxed. The column wiring is no problem anyway, since it is provided on the rear side of the sensor pixels.

In various embodiments, one portion (e.g. a left half portion) of the array may be contacted by a left row line arranged on the left side of the array and another portion (e.g. a right half portion) of the array may be contacted by a right row line arranged on the right side of the array.

Various embodiments may provide for an increase of the fill factor e.g. in the middle portion (e.g. in the first array region 12204) of the sensor array.

In the following, various aspects of this disclosure will be illustrated:

Example 1s is a LIDAR sensor for use in a LIDAR Sensor System. The LIDAR sensor may include one or more sensor pixels and one or more signal lines. Each signal line may be coupled to at least one sensor pixel. Each sensor pixel may have a first region and a second region. At least one sensor pixel of the one or more sensor pixels may have a larger extension into a first direction in the first region than in the second region.

In Example 2s, the subject-matter of example 1s can optionally include that the first direction is a direction perpendicular to a scanning direction of the LIDAR Sensor System.

In Example 3s, the subject-matter of any one of examples 1s or 2s can optionally include that the first direction is a direction perpendicular to a horizontal field of view of the LIDAR Sensor System.

In Example 4s, the subject-matter of any one of examples 1s to 3s can optionally include that the second region is next to the first region in a second direction parallel to the scanning direction of the LIDAR Sensor System.

In Example 5s, the subject-matter of any one of examples 1s to 4s can optionally include that the first region is arranged in a central portion of the at least one sensor pixel and the second region is arranged in an edge portion of the at least one sensor pixel.

In Example 6s, the subject-matter of any one of examples 1s to 4s can optionally include that the first region is arranged in a first edge portion of the at least one sensor pixel. The second region may be arranged in a second edge portion of the at least one sensor pixel. The first edge portion may be different from the second edge portion.

In Example 7s, the subject-matter of any one of examples 1s to 5s can optionally include that the at least one sensor pixel has two second regions. The first region may be arranged between the second regions. The at least one sensor pixel may have a larger extension into the first direction in the first region than in the second regions.

In Example 8s, the subject-matter of any one of examples 1s to 7s can optionally include that the first direction is the vertical direction.

In Example 9s, the subject-matter of any one of examples 4s to 8s can optionally include that the second direction is the horizontal direction.

In Example 10s, the subject-matter of any one of examples 1s to 9s can optionally include that the first region has a rectangular shape.

In Example 11s, the subject-matter of any one of examples 1s to 10s can optionally include that the second region has a rectangular shape.

In Example 12s, the subject-matter of any one of examples 1s to 10s can optionally include that the second region has a polygonal shape or a triangular shape or a trapezoidal shape.

In Example 13s, the subject-matter of any one of examples 1s to 12s can optionally include that an active sensor pixel area may be smaller in the second region than in the first region.

In Example 14s, the subject-matter of any one of examples 2s to 13s can optionally include that the active sensor pixel area in the second region decreases for increasing distance from the first region along the second direction.

In Example 15s, the subject-matter of any one of examples 1s to 14s can optionally include that each sensor pixel includes a photo diode.

In Example 16s, the subject-matter of example 15s can optionally include that at least one photo diode is an avalanche photo diode.

In Example 17s, the subject-matter of example 16s can optionally include that at least one avalanche photo diode is a single-photon avalanche photo diode.

In Example 18s, the subject-matter of any one of examples 15s to 17s can optionally include that the LIDAR sensor further includes a time-to-digital converter coupled to at least one photo diode.

In Example 19s, the subject-matter of any one of examples 15s to 18s can optionally include that the LIDAR sensor further includes an amplifier configured to amplify a signal provided by the plurality of photo diodes.

In Example 20s, the subject-matter of example 19s can optionally include that the amplifier is a transimpedance amplifier.

In Example 21s, the subject-matter of any one of examples 19s or 20s can optionally include that the LIDAR sensor further includes an analog-to-digital converter coupled downstream to the amplifier to convert an analog signal provided by the amplifier into a digitized signal.

Example 22s is a LIDAR sensor for use in a LIDAR Sensor System. The LIDAR sensor may include a plurality of sensor pixels arranged in a two-dimensional sensor pixel array. The two-dimensional sensor pixel array may have a first array region and a second array region. The LIDAR sensor may include one or more signal lines. Each signal line may be coupled to at least one sensor pixel. The active sensor pixel area may have a larger extension into a first direction in the first array region than in the second array region.

In Example 23s, the subject-matter of example 21s can optionally include that the first direction is a direction perpendicular to a scanning direction of the LIDAR Sensor System.

In Example 24s, the subject-matter of any one of examples 22s or 23s can optionally include that the first direction is a direction perpendicular to a horizontal field of view of the LIDAR Sensor System.

In Example 25s, the subject-matter of any one of examples 22s to 24s can optionally include that the second array region is next to the first array region in a second direction parallel to the scanning direction of the LIDAR Sensor System.

In Example 26s, the subject-matter of any one of examples 22s to 25s can optionally include that the first array region is arranged in a central portion of the two-dimensional sensor pixel array and the second region is arranged in an edge portion of the two-dimensional sensor pixel array.

In Example 27s, the subject-matter of any one of examples 22s to 26s can optionally include that the sensor pixels have a rectangular shape.

In Example 28s, the subject-matter of any one of examples 22s to 27s can optionally include that the sensor pixels arranged along the same line with respect to the first direction have the same shape and/or size.

In Example 29s, the subject-matter of any one of examples 22s to 28s can optionally include that the sensor pixels arranged along the same line with respect to the second direction have a smaller size in the second array region than in the first array region.

In Example 30s, the subject-matter of any one of examples 22s to 29s can optionally include that the two-dimensional sensor pixel array has two second array regions. The first array region may be arranged between the second array regions. The active sensor pixel area may have a larger extension into the first direction in the first array region than in the second array regions.

In Example 31s, the subject-matter of any one of examples 22s to 30s can optionally include that the first direction is the vertical direction.

In Example 32s, the subject-matter of any one of examples 22s to 31s can optionally include that the second direction is the horizontal direction.

In Example 33s, the subject-matter of any one of examples 22s to 32s can optionally include that each sensor pixel includes a photo diode.

In Example 34s, the subject-matter of example 33s can optionally include that at least one photo diode is an avalanche photo diode.

In Example 35s, the subject-matter of example 34s can optionally include that at least one avalanche photo diode is a single-photon avalanche photo diode.

In Example 36s, the subject-matter of any one of examples 33s to 35s can optionally include that the LIDAR sensor further includes a time-to-digital converter coupled to at least one photo diode.

In Example 37s, the subject-matter of any one of examples 33s to 36s can optionally include that the LIDAR sensor further includes an amplifier configured to amplify a signal provided by the plurality of photo diodes.

In Example 38s, the subject-matter of example 37s can optionally include that the amplifier is a transimpedance amplifier.

In Example 39s, the subject-matter of any one of examples 37s or 38s can optionally include that the LIDAR sensor further includes an analog-to-digital converter coupled downstream to the amplifier to convert an analog signal provided by the amplifier into a digitized signal.

Example 40s is a head lamp including a LIDAR sensor of is any one of examples is to 39s.

It may be desirable for a sensor (e.g. the sensor 52), for example for a LIDAR sensor or a sensor for a LIDAR system, to have a large field of view, high resolution, and a large (e.g. detection or sensing) range. However, in case that a sensor has a large field of view and high resolution, only a small sensor area of a pixel (e.g. of an image pixel) may effectively be used. Illustratively, a large sensor (e.g. at least in one lateral dimension, for example the width and/or the length) may be required in order to image a large field of view, such that light coming from different directions can impinge on the sensor (e.g. can be collected or picked up by the sensor). Such a large sensor is only poorly illuminated for each angle at which the light impinges on the sensor. For example, the sensor pixels may be only partially illuminated. This may lead to a bad (e.g. low) SNR and/or to the provision of employing a large and thus expensive sensor.

In a rotating LIDAR system (also referred to as scanning LIDAR system), a sensor faces at all times only a small solid angle range in the horizontal direction (e.g. the field of view of the system may be small), thus reducing or substantially eliminating the worsening of the SNR mentioned above. A similar effect may be achieved in a system in which the detected light is collected by means of a movable mirror or another similar (e.g. movable) component. However, such a system requires movable parts, thus leading to increased complexity and increased costs. Different types of sensors may be used, for example a 1D sensor array (e.g. a column sensor) or a 2D sensor array.

In various aspects, an optics arrangement is described. The optics arrangement may be configured for use in a system, e.g. in a sensor system, for example in a LIDAR Sensor System (illustratively, in a system including at least one sensor, such as a LIDAR sensor). The optics arrangement may be configured such that a large range (stated differently, a long range) and a large field of view of the system may be provided at the same time, while maintaining a good (e.g. high) SNR and/or a high resolution. In various aspects the optics arrangement may be configured for use in a LIDAR Sensor System with a large (e.g. detection) range, for example larger than 50 m or larger than 100 m.

In the context of the present application, for example in relation to FIG. 98 to FIG. 102B, the term "sensor" may be used interchangeably with the term "detector" (e.g. a sensor may be understood as a detector, or it may be intended as part of a detector, for example together with other components, such as optical or electronic components). For example, a sensor may be configured to detect light or a sensor-external object.

In various embodiments, light (e.g. infrared light) reflected by objects disposed near to the optical axis of the system may impinge on the system (e.g. on the optics arrangement) at a small angle (e.g. smaller than 20° or smaller than 5°). The optics arrangement may be configured such that light impinging at such small angle may be collected with an (e.g. effective) aperture that ensures that substantially the entire sensor surface of a sensor pixel is used. As a clarification, the optics arrangement may be configured such that substantially the entire surface (e.g. sensitive) area of a sensor pixel is used for detection of objects disposed near to the optical axis of the system. This may offer the effect that detection of objects disposed near to the optical axis of the system may be performed with a large field of view, a large range, and good SNR. This may also offer the effect that detection of objects disposed near to the optical of the system may be performed with high resolution and high sensitivity. In various aspects, the optical axis of the system (e.g. of the sensor system) may coincide with the optical axis of the optics arrangement.

In various aspects, the étendue limit for the available sensor surface may be substantially exhausted (stated differently, used) for light impinging on the sensor at small angles. Nevertheless, the sensor optics (e.g. the optics arrangement) may be configured such that also light impinging at larger angles can be collected (e.g. light reflected from objects disposed farther away from the optical axis of the system). The efficiency of the sensor when collecting (and detecting) light at large angles (e.g. larger than 30° or larger than 50°) may be reduced or smaller with respect to the efficiency of the sensor when collecting (and detecting) light at small angles. Illustratively, only a small portion of the sensor surface of the sensor pixel may be illuminated in the case that light reflected from objects disposed farther away from the optical axis of the system is collected.

In various embodiments, it may be considered that light coming from objects located far away from the sensor impinges on the system (e.g. on the optics arrangement) as approximately parallel rays (e.g. as approximately parallel beams). It may thus be considered that the angle at which light impinges on the system increases for increasing distance between the optical axis of the system and the object from which the (e.g. reflected) light is coming. Thus, light coming from objects located near to the optical axis of the system may impinge on the system at small angles with respect to the optical axis of the system. Light coming from objects located farther away from the optical axis of the system may impinge on the system at large angles with respect to the optical axis of the system.

In various embodiments, the optics arrangement may be configured to have non-imaging characteristics, e.g. it may be configured as non-imaging optics. For example, the optics arrangement may be configured to have non-imaging characteristics at least in one direction (e.g. the horizontal direction). By means of non-imaging optics it may be possible to adjust the sensitivity of the system (e.g. of the sensor) at a desired level depending on the angle of view (e.g. depending on the field of view). An optics arrangement configured to have non-imaging characteristics may for example include one or more non-imaging concentrators, such as one or more compound parabolic concentrators (CPC). As another example an optics arrangement configured to have non-imaging characteristics may include one or more lens systems, for example lens systems including total internal reflection lenses and/or reflectors. In various aspects, the optics arrangement may include a combination of a lens and a CPC. The combination of a lens and a CPC may be configured in a same or similar way a LED-system is configured for illumination.

In various embodiments, the system may be configured to have imaging characteristics in at least one direction (e.g. the vertical direction). For example, the optics arrangement may be configured such that light is directed to individual sensor pixels of the sensor for vertical resolution (e.g. of an image of an object). As an example, the combination of a lens and a CPC may be configured to provide non-imaging characteristics in one direction and imaging characteristics in another (e.g. different) direction.

The system (illustratively, the optics arrangement and the sensor) may include a first resolution in a first (e.g. horizontal) direction and a second resolution in a second (e.g. vertical) direction. Depending on the architecture of the system (e.g. on the architecture of the LIDAR), the emphasis on the central portion (e.g. the emphasis on the portion of space near to the optical axis) can take place in one or two spatial directions. For example, with a 2D scanning mirror a sensor cell (e.g. one or more sensor pixels) may be illuminated in both directions.

The dependency of the sensitivity on the angle of view may be set up asymmetrically (e.g. different configurations may be implemented for different sensor systems). This may be useful, for example, in the case that two or more sensor systems are used (e.g. two or more LIDAR Sensor systems), for example one sensor system for each headlight of a vehicle. As a numerical example, the sensitivity may be high for light coming at an angle from −30° to 0° with respect to the optical axis (e.g. it may increase from −30° to 0°), and then the sensitivity may slowly decrease for angles up to +30°.

In various aspects, an effective aperture (also referred to as photosensitive aperture) of the system (e.g. of the field of view of the system) may be larger for small angles of view than for large angles of view. The effective aperture may be, for example, a measure of how effective the system is at receiving (e.g. collecting) light. Illustratively, a larger effective aperture may correspond to a larger amount of light (e.g. of light energy) collected by the system (e.g. picked up by the sensor). The effective aperture may define, for example, the portion of the sensor surface of the sensor pixel that is illuminated by the collected light. The optics arrangement may be configured such that a larger amount of light is collected for light impinging on the system at a small angle with respect the optical axis of the system than for light impinging on the system at a large angle with respect to the optical axis of the system.

In case that a sensor array (e.g. a sensor having a plurality of sensor pixels) is provided, it may be possible to include pixels having pixel areas of different size. A sensor array may be provided for spatial resolution, for example in the vertical direction. The sensor pixels may be arranged in a regular disposition, for example in a row of pixels, or in a column of pixels, or in a matrix. For example, the size (e.g. the surface area) of a sensor pixel may decrease for increasing distance of the sensor pixel from the optical axis of the system (e.g. from the center of the sensor). In this configuration, the image may be mapped "barrel distorted" on the sensor. This may be similar to the distortion produced by a Fish-Eye component (e.g. by a Fish-Eye objective). The light rays coming onto the sensor at smaller angles may be subject to a larger distortion (and to a larger magnification) compared to light rays coming onto the sensor at larger angles, and can be imaged on a larger sensor area (e.g. on a larger chip area). Illustratively, an object may be imagined as formed by a plurality of pixels in the object plane. An object may be imaged through the sensor optics (e.g. through the optics arrangement) onto areas of different size in the image plane, depending on the (e.g. relative) distance from the optical axis (e.g. depending on the distance of the object pixels from the optical axis). The optical magnification may vary over the image region. This way more reflected light is collected from objects (e.g. from object pixels) disposed near to the optical axis, than from objects located at the edge(s) of the field of view. This may offer the effect of providing a larger field of view and a larger detection range for objects disposed near to the optical axis of the system.

In the image plane the inner pixels (e.g. the sensor pixels closer to the optical axis) may be larger (e.g. have larger surface area) than the outer pixels (e.g. the pixels farther away from the optical axis). In the object plane all the portions or areas of an object (figuratively, all the pixels forming the object) may have the same size. Thus, object areas having the same size may be imaged on sensor pixel areas of different size.

In various aspects, as an addition or an alternative to sensor pixels of different size it may be possible to electrically interconnect sensor pixels (for example sensor pixels having the same size or sensor pixels having different size) to form units (e.g. pixel units) of larger size. This process may also take place dynamically, for example depending on stray light and/or on a driving situation (e.g. in the case that the system is part of or mounted on a vehicle). For example sensor pixels may initially be (e.g. electrically) interconnected, in order to reach a large (e.g. maximal) detection range, and as soon an object is detected the resolution may be increased (e.g. the sensor pixels may be disconnected or may be no longer interconnected) to improve a classification (e.g. an identification) of the object.

In various aspects, one or more adaptable (e.g. controllable) components, such as lenses (e.g. movable lenses, liquid lenses, and the like), may be used in the receiver path to dynamically adjust the angle of view and/or the aperture of the system (e.g. of the sensor). As an example, in a system including two liquid lenses it may be possible to adjust the angle of view of the sensor by adjusting the focal lengths of both lenses. Illustratively, the focal length of a first lens may adjust the angle, and a second lens (e.g. disposed downstream with respect to the first lens) may readjust the focus of the mapping of the image onto the sensor. The modification of the optical system by means of the liquid lenses may provide a modification of the viewing direction of the receiver optics similar to that provided by a movable mirror in the detector path. Illustratively, the adaptation of the viewing direction of the sensor by liquid lenses with variable focal length in the receiver path may be similar to implementing beam steering (e.g. by means of a movable mirror) in the emitter path.

Additionally or alternatively, other methods may be provided to increase the range of detection for objects disposed near to the optical axis. As an example, multiple laser pulses for each position of a (e.g. MEMS) mirror may be provided at small angles, thus providing more averaging with better SNR and a longer range. As a further example, in case that the system includes multiple laser diodes, a larger number of laser diodes may be provided simultaneously for detection at small angles, without increasing the total number of laser diodes, and thus without increasing the costs of the system.

The optics arrangement described herein may ensure that a large range and a large field of view of a LIDAR system may be provided at the same time (e.g. while maintaining a high SNR). This may be of particular relevance, for example, under daylight conditions (e.g. in the case that the system is mounted in or on a vehicle that is traveling in daylight) with stray light from the sun. In various aspects, the reduced range for objects located at a large distance from the optical axis may be tolerated in many cases of application, since a large angle of view is needed e.g. for nearby objects, for example vehicles that are overtaking or cutting in (e.g. going into a lane).

Using one or more controllable components (e.g. liquid lenses) may ensure that for each angle in the field of view the entire sensor (e.g. the entire sensor surface) may be used. This may, in principle, replace a is movable mirror in the detector path. For example, instead of having large mechanical portions or components that need to be moved, only a small movement of a portion of a lens (e.g. of a membrane of a liquid lens) may be used.

FIG. 98 shows a top view of a system 9800 including an optics arrangement 9802 and a sensor 52 in a schematic view in accordance with various aspects.

The system 9800 may be a sensor system. By way of example, the system 9800 may be or may be configured as the LIDAR Sensor System 10. The LIDAR Sensor System 10 may have any suitable configuration. For example, the LIDAR Sensor System 10 may be configured as a Flash-LIDAR Sensor System, or as a 1D-Scanning-LIDAR Sensor System, or as a 2D-Scanning LIDAR Sensor System, or as a Hybrid-Flash-LIDAR Sensor System.

The system 9800 may include at least one sensor 52. The sensor 52 may be configured to detect system-external objects 9804, 9806. As an example, the detection may be performed by taking and analyzing images of the objects 9804, 9806. As another example, the detection may be performed by collecting light (e.g. infrared light or near infrared light) reflected from the objects 9804, 9806. For example, the sensor 52 may include a LIDAR sensor. Furthermore, additional sensors such as a camera and/or infrared sensitive photodiodes may be provided. The sensor 52 may be configured to operate in a predefined range of wavelengths, for example in the infrared range and/or in the near infrared range.

The sensor 52 may include one or more sensor pixels configured to generate a signal (e.g. an electrical signal, such as a current) when light impinges on the one or more sensor pixels. The generated signal may be proportional to the amount of light collected by the sensor 52 (e.g. the is amount of light arriving on the sensor). As an example, the sensor 52 may include one or more photodiodes. For example, the sensor 52 may include one or a plurality of sensor pixels, and each sensor pixel may be associated with a respective photodiode. At least some of the photodiodes may be avalanche photodiodes. At least some of the avalanche photo diodes may be single photon avalanche photo diodes.

In various aspects, the system 9800 may include a component configured to process the signal generated by the sensor 52. As an example, the system 9800 may include a component to generate a digital signal from the (e.g. electrical) signal generated by the sensor 52. The system 9800 may include at least one converter. By way of example, the system 9800 may include at least one time to digital converter coupled to the sensor 52 (e.g. coupled to at least one of the photodiodes, e.g. to at least one of the single photon avalanche photo diodes). Moreover, the system 9800 may include a component configured to enhance the signal generated by the sensor 52. For example, the system 9800 may include at least one amplifier (e.g. a transimpedance amplifier) configured to amplify a signal provided by the sensor 52 (e.g. the signal provided by at least one of the photo diodes). The system 9800 may further include an analog to digital converter coupled downstream to the amplifier to convert an analog signal provided by the amplifier into a digitized signal (e.g. into a digital signal).

In various aspects, the system 9800 may include at least one light source 42. The light source 42 may be configured to emit light. Light emitted by the light source 42 may irradiate system-external objects 9804, 9806 (e.g. it may be reflected by system-external objects 9804, 9806). Illustratively, the light source 42 may be used to interrogate the area surrounding or in front of the system 9800. The light source 42 may be configured to emit light having a wavelength in a region of interest, e.g. in a wavelength range that can be detected by the sensor 52. For example, the light source 42 may be configured to emit light in the infrared and/or near infrared range. The light is source 42 may be or may include any suitable light source and/or optics for emitting light in a directional manner, for example for emitting collimated light. The light source 42 may be configured to emit light in a continuous manner or it may be configured to emit light in a pulsed manner (e.g. to emit a sequence of light pulses). The system 9800 may also include more than one light source 42, for example configured to emit light in different wavelength ranges and/or at different (e.g. pulse) rates.

As an example, the at least one light source 42 may be or may include a laser source 5902. The laser source 5902 may include at least one laser diode, e.g. the laser source 5902 may include a plurality of laser diodes, e.g. a multiplicity, for example more than two, more than five, more than ten, more than fifty, or more than one hundred laser diodes. The laser source 5902 may be configured to emit a laser beam having a wavelength in the infrared and/or near infrared wavelength region.

The system 9800 may include at least one optics arrangement 9802. The optics arrangement 9802 may be configured to provide light to the sensor 52. For example, the optics arrangement 9802 may be configured to collect light and direct it onto the surfaces of the sensor pixels of the sensor 52. The optics arrangement 9802 may be disposed in the receiving path of the system 9800. The optics arrangement 9802 may be an optics arrangement for the LIDAR Sensor System 10. For example, the optics arrangement 9802 may be retrofitted in an existing LIDAR Sensor System 10 (e.g. it may be mounted on a vehicle already equipped with a LIDAR Sensor System 10). In case that the system 9800 includes more than one sensor 52, each sensor 52 may be associated with a respective optics arrangement 9802. Alternatively, the same optics arrangement 9802 may be used to direct light onto more than one sensor 52. It may also be possible to configure more than one optics arrangement 9802 (for example, optics arrangements 9802 having different optical properties) to direct light onto a same sensor 52.

The sensor 52 may include one or more sensor pixels. A sensor pixel may be configured to be illuminated by the light arriving at the sensor 52 (e.g. impinging on the optics arrangement 9802). Illustratively, the sensor pixel may be configured to detect light provided by (in other words, through) the optics arrangement 9802. The number of sensor pixels that are illuminated by the light arriving on the sensor 52 may determine the quality of a signal generated by the sensor pixels. By way of example, the number of illuminated sensor pixels may determine the intensity of the generated signal (e.g. the amplitude or the magnitude of a generated current). The portion of sensor surface of a sensor pixel that is illuminated by the light impinging on the sensor 52 may influence, for example, the SNR. In case that only a small portion (e.g. less than 30% or less than 10%) of the sensor surface of a sensor pixel is illuminated, then the SNR may be low. The sensor 52 will be described in more detail below, for example in relation to FIG. 102A and FIG. 102B.

Light coming from an object 9804, 9806 disposed far away from the system 9800 (e.g. at a distance larger than 50 cm from the system 9800, larger than 1 m, larger than 5 m, etc.) may impinge on the system 9800 (e.g. on the optics arrangement 9802) as substantially parallel rays 9814, 9816. Thus, it may be considered that light coming from an object 9804 disposed near to an optical axis 9808 of the system 9800 (e.g. at a distance from the optical axis 9808 smaller than 50 cm, for example smaller than 1 m, for example smaller than 5 m) impinges on the system 9800 at a small angle with respect to the optical axis 9808 (e.g. at an angle smaller than 20° or smaller than 5°, depending on the distance from the optical axis 9808). It may be considered that light coming from an object 9806 disposed farther away from the optical axis 9808 (e.g. at a distance from the optical axis 9808 larger than 3 m, for example larger than 5 m, for example larger than 10 m) impinges on the system 9800 at a large angle with respect to the optical axis 9808 (e.g. larger than 30° or larger than 50°, depending on the distance from the optical axis 9808). The optical axis 9808 of the system 9800 may coincide with the optical axis of the optics arrangement 9802.

Illustratively, a first object 9804 may be disposed closer (in other words, nearer) to the optical axis 9808 of the system 9800 with respect to a second object 9806. Light coming from the first object 9804 may impinge on the optics arrangement 9802 at a first angle α with respect to the optical axis 9808. Light coming from the second object 9806 may impinge on the optics arrangement 9802 at a second angle β with respect to the optical axis 9808. For example the first object 9804 may be considered more relevant than the second object 9806, e.g. in a driving situation (for example it may be an obstacle in front of a vehicle in or on which the system 9800 is mounted). The second angle β may be larger than the first angle α. Only as a numerical example, the angle α may be in the range between 0° and 25°, for example between 5° and 20°, and the angle β may be larger than 30°, for example larger than 50°, for example in the range between 30° and 70°.

System components may be provided (e.g. the optics arrangement 9802 and/or the sensor 52 and/or the light source 42), which may be configured such that a large portion of a sensor surface of a sensor pixel 52 (e.g. of many sensor pixels or of all sensor pixels) is illuminated (in other words, covered) by light arriving on the system 9800 (e.g. on the optics arrangement 9802) at a small angle with respect to the optical axis 9808 of the system. For example, the optics arrangement 9802 and/or the sensor 52 may be configured such that more than 30% of the sensor surface (e.g. of a surface area, e.g. of a sensitive area) of the sensor pixel is illuminated, for example more than 50%, for example more than 70%, for example more than 90%, for example substantially the 100%. For example, the optics arrangement 9802 and/or the sensor 52 may be configured such that substantially the entire sensor surface of the sensor pixel is illuminated by light arriving on the system 9800 (e.g. on the optics arrangement 9802) at a small angle with respect to the optical axis 9808 of the system. In various aspects, the optics arrangement 9802 and/or the sensor 52 may be configured such that a large portion of the sensor surface of the sensor pixel is covered in the case that light is coming (e.g. reflected) from an object 9804 disposed near to the optical axis 9808 of the system 9800.

This may offer the effect that a field of view and/or a detection range of the system 9800 (e.g. of a LIDAR Sensor System 10) are/is increased for the detection of objects 9804 disposed near to the optical axis 9808 of the system 9800, e.g. while maintaining a high SNR and/or high resolution. Illustratively, the sensor 52 and/or the optics arrangement 9802 may be configured such that it may be possible to detect the object 9804 disposed near to the optical axis 9808 with a larger range and higher SNR with respect to the object 9806 disposed farther away from the optical axis 9808. The detection range may be described as the range of distances between an object and the system 9800 within which the object may be detected.

In various aspects, the optics arrangement 9802 may be configured to provide a first effective aperture 9810 for a field of view of the system 9800. As an example, the optics arrangement 9802 may include a first portion 9802*a* configured to provide the first effective aperture 9810 for the field of view of the system 9800. In various aspects, the optics arrangement 9802 may be configured to provide a second effective aperture 9812 for the field of view of the system 9800. As an example, the optics arrangement 9802 may include a second portion 9802*b* configured to provide the second effective aperture 9812 for the field of view of the system 9800.

In various aspects, the optics arrangement 9802 may be configured to provide a detection range of at least 50 m, for example larger than 70 m or larger than 100 m, for light impinging on a surface 9802*s* of the optics arrangement 9802 at a small angle with respect to the optical axis 9808. For example, the first portion 9802*a* may be configured to provide a detection range of at least 50 m, for example larger than 70 m or larger than 100 m, for light impinging on a surface of the first portion 9802*a* at a small angle with respect to the optical axis 9808.

In various aspects, the optics arrangement 9802 may be configured asymmetrically. For example, the first portion 9802*a* and the second portion 9802*b* may be configured to have different optical properties. The first portion 9802*a* and the second portion 9802*b* may be monolithically integrated in one common optical component. The first portion 9802*a* and the second portion 9802*b* may also be separate optical components of the optics arrangement 9802.

In various aspects, the first effective aperture 9810 may be provided for light impinging on a surface 9802*s* of the optics arrangement 9802 at (or from) the first angle α. The second effective aperture 9812 may be provided for light impinging on the surface 9802s of the optics arrangement 9802 at (or from) the second angle β. The second effective aperture 9812 may be smaller than the first effective aperture 9810. This may offer the effect that the system 9800 may collect (e.g. receive) more light in the case that light impinges on the optics arrangement 9802 at a small angle with respect to the optical axis 9808, thus enhancing the detection of an object 9804 disposed near to the optical axis 9808. Illustratively, more light may be collected in the case that light is coming from an object 9804 disposed near to the optical axis 9808 than from an object 9806 disposed farther away from the optical axis 9808.

In various aspects, the optics arrangement 9802 may be configured to deflect light impinging on the surface 9802s of the optics arrangement 9802 at the first angle α (as illustrated, for example, by the deflected light rays 9814). The optics arrangement 9802 may be configured such that by deflecting the light impinging at the first angle α substantially the entire sensor surface of a sensor pixel 52 is covered (e.g. a large portion of the sensor surface of the sensor pixel 52 is covered). As a clarification, the optics arrangement 9802 may be configured such that light impinging on the surface 9802s of the optics arrangement 9802 at the first angle α illuminates substantially the entire sensor surface of the sensor pixel 52 (as illustratively represented by the fully illuminated pixel 9818). As an example, the first portion 9802a may be configured to deflect light impinging on a surface of the first portion 9802a at the first angle α, to substantially cover the entire sensor surface of the sensor pixel 52. The first portion 9802a may be configured to deflect light into a first deflection direction.

In various aspects, the optics arrangement 9802 may be configured to deflect light impinging on the surface 9802s of the optics arrangement 9802 at the second angle β (as illustrated, for example, by the deflected light rays 9816). The optics arrangement 9802 may be configured such that light impinging on the surface of the optics arrangement 9802s at the second angle is deflected such that it illuminates only partially the sensor surface of a sensor pixel 52 (e.g. only a small portion of the sensor surface of the sensor pixel 52), as illustratively represented by the partially illuminated pixel 9820. As an example, the second portion 9802b may be configured to deflect light into a second deflection direction. The second deflection direction may be different from the first deflection direction. As an example, light impinging at the second angle β may be deflected by a smaller angle than light impinging at the first angle α.

In various aspects, an angular threshold (also referred to as angle threshold) may be defined. The angular threshold may be configured such that for light impinging on the surface 9802s of the optics arrangement 9802 at an angle with respect to the optical axis 9808 smaller than the angular threshold substantially the entire sensor surface of the sensor pixel is illuminated. Illustratively, the first effective aperture 9810 may be provided for light impinging on the surface 9802s of the optics arrangement 9802 (e.g. on the surface of the first portion 9802a) at an angle smaller than the angular threshold. The second effective aperture 9812 may be provided for light impinging on the surface 9802s of the optics arrangement 9802 (e.g. on the surface of the second portion 9802b) at an angle larger than the angular threshold. As a numerical example, the angular threshold may be in the range from about 0° to about 25° with respect to the optical axis 9808, e.g. in the range from about 5° to about 20°, e.g. in the range from about 7° to 18°, e.g. in the range from about 9° to about 16°, e.g. in the range from about 11° to about 14°. The first angle α may be smaller than the angular threshold. The second angle β may be larger than the angular threshold.

In various aspects, the angular threshold may define a range of angles with respect to the optical axis 9808 (e.g. from 0° up to the angular threshold) over which the field of view and the range of the system 9800 may be increased. Illustratively, the angular threshold may define a range of distances between an object and the optical axis 9808 over which the field of view and the range of the system 9800 may be increased. The optics arrangement 9802 and/or the sensor 52 may be configured based on a desired angular threshold. As an example, the first portion 9802a may be configured to deflect light impinging on the surface of the first portion 9802a at an angle smaller than the angular threshold to substantially cover the entire sensor surface of the sensor pixel.

In various aspects, the optics arrangement 9802 may be configured such that for light impinging on the surface 9802s of the optics arrangement 9802 at the first angle α (e.g. smaller than the angular threshold), the étendue limit (e.g. the maximum achievable étendue) for the sensor surface of the sensor 52 may be substantially used (e.g. exhausted). As an example, the first portion 9802a may be configured to deflect light impinging on the surface of the first portion 9802a at the first angle α to substantially use the étendue limit for the sensor surface of the sensor 52. The étendue limit may depend (e.g. it may be proportional), for example, on the area of a pixel (e.g. on the sensor area) and/or on the number of sensor pixels and/or on the refractive index of the medium (e.g. air) surrounding the sensor surface of the sensor 52. Illustratively, for light impinging at the first angle α, substantially all the light that the sensor 52 may be capable of receiving (e.g. picking up) is effectively received (e.g. picked up) by the sensor 52. For example, more than 50% of the light that the sensor 52 may be capable of receiving is effectively received on the sensor 52, for example more than 70%, for example more than 90%, for example substantially the 100%. In various aspects, for light impinging at the first angle α substantially the entire sensor surface of the sensor 52 may be illuminated.

In various aspects, the optics arrangement 9802 may be configured such that for light impinging at the second angle β, the étendue limit for the sensor surface of the sensor 52 may not be exhausted. Illustratively, for light impinging at the second angle β, not all the light that the sensor 52 may be capable of receiving is effectively received by the sensor 52. For example, less than 50% of the light that the sensor 52 may be capable of receiving is effectively received on the sensor 52, for example less than 30%, for example less than 10%.

In various aspects, a first (e.g. horizontal) and a second (e.g. vertical) direction may be defined. The first direction may be perpendicular to the second direction. The first direction and/or the second direction may be perpendicular to the optical axis 9808 (e.g. they may be defined in a plane perpendicular to the optical axis 9808). As shown for example in FIG. 98, the optical axis 9808 may be along a direction 9852. The first direction may be the direction 9854, e.g. perpendicular to the optical axis 9808. The second direction may be the direction 9856 perpendicular to both the first direction 9854 and the optical axis 9808 (illustratively, it may be a direction coming out from the plane of the FIG. 98). The definition of first and second direction (e.g. of horizontal and vertical direction) may be selected arbitrarily, e.g. depending on the chosen coordinate (e.g. reference) system.

In various aspects, the optics arrangement 9802 may be configured to deflect light impinging on the surface 9802*s* of the optics arrangement 9802 at the first angle α with respect to the optical axis 9808 to substantially cover the entire sensor surface of the sensor pixel 52, at least with respect to one direction (for example, at least with respect to the first direction 9854). As an example, the first portion 9802*a* may be configured to deflect light impinging on the surface of the first portion 9802*a* at the first angle α to substantially cover the entire sensor surface of the sensor pixel, at least with respect to one direction (for example, at least with respect to the first direction 9854)

In various aspects, the optics arrangement 9802 may be configured to have non-imaging characteristics (e.g. it may be configured as non-imaging optics). The optics arrangement 9802 may be configured to have non-imaging characteristics in at least one direction. For example, it may be configured to have non-imaging characteristics in the first (e.g. horizontal) direction 9854. Illustratively, the optics arrangement 9802 may be configured such that, at least in one direction (e.g. in the first direction), light is transferred from an object to the sensor 52 (e.g. through the optics arrangement 9802) without forming an image of the object on the sensor 52 (e.g. in that direction). As an example of non-imaging optics, the optics arrangement 9802 may include or it may be configured as a total internal reflection lens (as illustrated, for example, in FIG. 99). An optics arrangement 9802 configured as total internal reflectance lens may be particularly suited for collecting (e.g. detecting) light having a directionality (e.g. not omnidirectional light). As another example of non-imaging optics, the optics arrangement 9802 may include at least one non-imaging concentrator (e.g. a compound parabolic concentrator as illustrated, for example, in FIG. 100A and FIG. 100B).

FIG. 99 shows a top view of a system 9900 including an optics arrangement 9902 configured as a total internal reflectance lens and a sensor 52 in accordance with various aspects.

In various aspects, the first portion and the second portion of the optics arrangement 9902 may be configured asymmetrically. As an example, the first portion may have a different shape and/or a different size (e.g. a different thickness) with respect to the second portion. As another example, the first portion may have a different radius of curvature with respect to the second portion.

As an example, the second portion 9902*b* may have a convex shape with respect to the optical axis 9908 of the optics arrangement 9902. The first portion 9902*a* may have a non-convex shape. Alternatively, the first portion 9902*a* may have a convex shape having a smaller curvature than the second portion 9902*b*, for example with respect to the direction into which the second portion 9902*b* deflects the light into the direction towards the surface of the sensor 52.

As another example, the thickness of the second portion 9902*b* may be smaller than the thickness of the first portion 9902*a*. For example, the thickness of the second portion 9902*b* having the convex shape may be smaller than the thickness of the first portion 9902*a.*

FIG. 100A shows a top view of a system 10000 including an optics arrangement 10002 including a compound parabolic concentrator and an additional optical element 10010 in a schematic view in accordance with various aspects.

FIG. 1006 shows a side view of a system 10000 including an optics arrangement 10002 including a compound parabolic concentrator and an additional optical element 10010 in a schematic view in accordance with various aspects.

In various aspects, the optics arrangement may include at least one non-imaging concentrator. For example, the first portion and the second portion may be formed by at least one non-imaging concentrator (e.g. by at least one compound parabolic concentrator). The non-imaging concentrator may be configured to reflect towards the sensor 52 all of the incident radiation collected over an acceptance angle of the non-imaging concentrator.

In various aspects, the non-imaging concentrator may be configured such that the first effective aperture may be provided for light impinging on the non-imaging concentrator at the first angle with respect to the optical axis 10008 (e.g. at an angle with respect to the optical axis 10008 within the acceptance angle and smaller than the angular threshold). Illustratively, for light impinging on the non-imaging concentrator at an angle within the acceptance angle and smaller than the angular threshold substantially the entire sensor surface of the sensor pixel 52 may be illuminated. The non-imaging concentrator may be configured such that the second effective aperture may be provided for light impinging on the non-imaging concentrator at the second angle with respect to the optical axis 10008 (e.g. at an angle with respect to the optical axis 10008 within the acceptance angle and larger than the angular threshold).

In various aspects, the system may include an (e.g. additional) optical element 10010. The additional optical element 10010 may be included in the optics arrangement, or it may be a separate component. The optical element 10010 may be configured to have imaging characteristics in at least one direction. For example, the optical element 10010 may be configured to have imaging characteristics in a direction different from the direction in which the optics arrangement (e.g. the non-imaging concentrator 10002) may be configured to have non-imaging characteristics.

As an example, the optics arrangement may be configured to have non-imaging characteristics in the horizontal direction (e.g. in the direction 9854). The optical element 10010 may be configured to have imaging characteristics in the vertical direction (e.g. in the direction 9856). As an example, the optical element 10010 may be a fish-eye optical element or it may be configured as a fish-eye optical element.

Illustratively, the optical element 10010 may be configured such that an image of an object is formed on the sensor 52 in the at least one direction (e.g. in the direction in which the optical element 10010 has imaging characteristics, for example in the vertical direction). This may be helpful, for example, in the case that the sensor 52 includes one or more pixels 52 along that direction. As an example, the sensor 52 may include one or more pixels 52 along the vertical direction (for example the sensor 52 may include one or more pixel columns), and an image of a detected object may be formed (e.g. through the optical element 10010) on the sensor 52 in the vertical direction. The number of pixels in the vertical direction may determine the vertical resolution of the sensor 52.

FIG. 101A and FIG. 101B show a top view of a system 10100 including an optics arrangement 10102 including a first controllable component 10108 and a second controllable component 10110 in accordance with various aspects.

In various aspects, the optics arrangement may include one or more controllable (e.g. optical) components. For example, the optics arrangement may include one or more components whose optical properties (e.g. the focal length) may be controlled (in other words, adjusted), for example dynamically. The optical properties of the one or more controllable components may be adjusted to control the pattern of light mapped onto the sensor 52. For example, the one or more controllable components may be configured such that for each angle in the field of view of the system substantially the entire sensor surface of the sensor 52 is used (e.g. substantially the entire surface of the sensor 52 is illuminated by the incoming light). Illustratively, the one or more controllable components may be controlled to adjust the angular threshold. In various aspects, the system may include one or more processors and/or controllers coupled with the one or more controllable elements and configured to control the controllable elements.

In various aspects, the optics arrangement 10102 may include a first controllable component 10108. The optics arrangement 10102 may further include a second controllable component 10110. The second controllable 10110 component may be located downstream of the first controllable component 10108 (e.g. with respect to a direction of the light impinging on the optics arrangement 10102). For example, the second controllable component 10110 may be configured to receive light from the first controllable component 10108. The second controllable 10110 component may be configured to deflect the received light into the direction of the surface of the sensor 52. The first controllable component 10108 may be configured to control an angle of view of the sensor 52, e.g. to control the angle of view of the light mapped onto the surface of the sensor 52 by controlling an optical property (e.g. the focal length) of the first controllable component 10108. The second controllable component 10110 may be configured to adjust the focus of the mapping of the light mapped onto the surface of the sensor 52. It is understood that the number and the configuration of the controllable components is not limited to the example shown in FIG. 101A and FIG. 101B. The system (e.g. the optics arrangement) may include any suitable number of controllable components, configured in any suitable manner for achieving the desired effect.

As an example, the first controllable element 10108 may be a first liquid lens, and the second controllable element 10110 may be a second liquid lens. A liquid lens may have a controllable element (e.g. a membrane), which may be controlled to modify the focal length of the liquid lens. For example, the deflection of the membranes of the liquid lenses may be controlled such that the field of view imaged on the sensor 52 may be adapted by changing the focal length of the liquid lenses.

As illustrated, for example, in FIG. 101A, for light impinging on the optics arrangement 10102 at a first angle γ (as a numerical example) 1.2° the membrane 10108*m* of the first liquid lens 10108 may be in a first state. For example, the membrane 10108*m* of the first liquid lens 10108 may is have a first deflection (e.g. it may have a maximum deformation displacement in the range between 0 mm and 1 mm). The membrane 10110*m* of the second liquid lens 10110 may be in a second state. For example, the membrane 10110*m* of the second liquid lens 10110 may have a second deflection larger than the first deflection (e.g. it may have a maximum deformation displacement in the range between 0.5 mm and 3 mm). Illustratively, the membrane 10110*m* of the second liquid lens 10110 may be more deflected than the membrane 10108*m* of the first liquid lens 10108. The light may be coming from an object 10104 disposed at a first distance from the optical axis of the system 10100.

As illustrated, for example, in FIG. 101B, for light impinging on the optics arrangement 10102 at a second angle δ (e.g. larger than the first angle γ, as a numerical example, 4.5°) the membrane 10108*m* of the first liquid lens 10108 may have a larger deflection than in the previous state. For example, the membrane 10108*m* of the first liquid lens 10108 may be in the second state. The membrane 10110*m* of the second liquid lens 10110 may have a smaller deflection than in the previous state. For example, the membrane 10110*m* of the second liquid lens 10110 may be in the first state. Illustratively, the membrane 10110*m* of the second liquid lens 10110 may be less deflected than the membrane 10108*m* of the first liquid lens 10108. The light may be coming from an object 10106 disposed at a second distance (e.g. larger than the first distance) from the optical axis of the system 10100. It is understood that the first state and the second state for the membranes of the liquid lenses are shown just as an example, and other combinations and other states may be possible.

In various aspects, in addition or in alternative to an optics arrangement configured as described above, the sensor 52 may be configured such that a large field of view and a large range may be provided for detection of light impinging on the system at a small angle with respect to the optical axis of the system (e.g. for detection of objects disposed near to the optical axis), while maintaining a high SNR.

FIG. 102A shows a sensor 52 including sensor pixels having different pixel sizes, in accordance with various aspects.

In various aspects, the configuration of the sensor 52 (e.g. the arrangement of sensor pixels 52) may be chosen freely, for example based on the intended application of the sensor and/or of the system including the sensor. For example, the sensor 52 may include a plurality of sensor pixels 52. The pixels 52 of the sensor 52 may be arranged along a desired sensing direction (for example the first direction 9854 or second direction 9856 described above).

As an example, the sensor may be a one-dimensional sensor array. The sensor may include a plurality of sensor pixels arranged along the sensing direction. The sensing direction may be, for example, the horizontal direction (e.g. the sensor may include a row of pixels) or the vertical direction (e.g. the sensor may include a column of pixels). As another example, the sensor may be a two-dimensional sensor array. The senor may include a plurality of sensor pixels arranged in a matrix architecture, e.g. it may include a (first) plurality of sensor pixels arranged along a first array direction (e.g. the horizontal direction) and a (second) plurality of sensor pixels arranged along a second array direction (e.g. the vertical direction). The second array direction may be different from the first array direction. The first plurality of sensor pixels may include the same number of pixels as the second plurality (e.g. the pixels may be arranged in a square matrix). The first plurality of sensor pixels may also include more or less sensor pixels than the second plurality (e.g. the pixels may be arranged in a matrix having more rows than columns or more columns than rows).

In various aspects, the sensitivity of the sensor 52 may be uniform over the sensor surface (e.g. each sensor pixel 52 may provide or may have the same sensitivity). For example, each photodiode of the sensor 52 may have the same sensitivity. In various aspects, the sensitivity of the sensor 52 may be non-uniform over the sensor surface. Sensor pixels 52 may have different sensitivity depending on their location (e.g. on their distance with respect to the center of the sensor 52). As an example, sensor pixels 52 disposed near to the center of the sensor 52 may have higher sensitivity than sensor pixels 52 disposed farther away from the center of the sensor 52.

In various aspects, the geometric properties of the sensor pixels 52 may be uniform. For example, all the sensor pixels 52 may have the same size and/or the same shape (e.g. a square shape, a rectangular shape, or the like).

In various aspects, the geometric properties of the sensor pixels 52 may vary. For example, the sensor pixels 52 may have different sensor pixel sizes (as illustrated, for example, in FIG. 102A). A sensor pixel 52 arranged closer to the optical axis of the system in which the sensor 52 may be included (illustratively, a sensor pixel 52 arranged closer to the center of the sensor 52) may have a different (e.g. larger, for example 10% larger, 20% larger or 50% larger) pixel size than a sensor pixel 52 arranged farther away from the optical axis of the system (e.g. arranged farther away from the center of the sensor 52). The size may be different in at least one (e.g. array) direction. For example, the size may be different in at least the first (e.g. horizontal) direction 9854 (e.g. in the first array direction), e.g. the width of the pixels may be different. For example, the size may be different in at least the second (e.g. vertical) direction 9856 (e.g. in the second array direction), e.g. the height of the pixels 52 may be different. The size may also be different in both the first and the second directions (e.g. in the first and in the second array directions). A sensor pixel 52 arranged closer to the optical axis of the system may have a larger surface area than a sensor pixel 52 arranged farther away from the optical axis of the system.

As an example, as shown in FIG. 102A a sensor pixel 10202 (or all sensor pixels) in a first region 10204 (enclosed by the dotted line in FIG. 102A) may have a first size. A sensor pixel 10206 (or all sensor pixels) in a second region 10208 (enclosed by the dotted line in FIG. 102A) may have a second size. A sensor pixel 10210 (or all sensor pixels) in a third region 10212 (enclosed by the dotted line in FIG. 102A) may have a third size. The pixels 10202 in the second region 10208 may be farther away from the optical axis of the system (e.g. from the center of the sensor 52) than the pixels 10202 in the first region 10204. The pixels 10210 in the third region 10212 may be farther away from the center of the sensor than the pixels 10206 in the second region 10208. Thus, the first size may be larger than the second size and the third size. The second size may be larger than the third size. The configuration shown in FIG. 102A is illustrated, as an example, for a 2D array of pixels. It is understood that a same or similar configuration may be implemented in a 1D array of pixels (as shown, for example, in FIG. 102B).

In various aspects, the size change between regions may be constant in proportion. For example, a ratio between the second size and the first size may be substantially the same as a ratio between the third size and the second size. Alternatively, the size may vary by a larger or smaller amount for increasing distance from the center of the sensor 52. For example, a ratio between the second size and the first size may be larger or smaller than a ratio between the third size and the second size.

This configuration may offer an effect similar to a barrel distortion (e.g. similar to the effect provided by a Fish-Eye objective). Illustratively, the sensor 52 may be configured such that light arriving on the sensor 52 at a small angle with respect to the optical axis of the system (e.g. impinging closer to the center of the sensor 52) may experience a larger magnification with respect to light rays impinging on the sensor 52 at a larger angle with respect to the optical axis of the system (impinging farther away from the center of the sensor 52, illustratively in a different region). Light rays impinging on the sensor 52 at a small angle may be imaged (e.g. mapped) on a larger sensor surface (as shown, for example, in FIG. 102B). This way a larger field of view and a larger range may be provided for objects that reflect light arriving on the sensor 52 at a small angle with respect to the optical axis of the system.

FIG. 102B shows an imaging process performed with a sensor 52 including sensor pixels having different pixel size in a schematic view, in accordance with various aspects.

Illustratively or figuratively, an object may be seen as formed by a plurality of (e.g. object) pixels 10214, e.g. a plurality of pixels in the object plane. The object pixels 10214 may all have the same size and/or the same shape. An object pixel 10214 may be imaged on a sensor pixel (e.g. a pixel in the image plane).

In various aspects, the size of a sensor pixel on which an object pixel 10214 is imaged may be dependent on the angle at which light comes from the object pixel 10214 onto the sensor 52. Illustratively, the size of a sensor pixel on which an object pixel 10214 is imaged may be dependent on the distance between the object pixel 10214 and the optical axis 10216 of the system in which the sensor 52 may be included (e.g. on the vertical displacement between the object pixel 10214 and the center of the sensor 52).

As an example, a first object pixel 10214 disposed near to the optical axis 10216 (e.g. centered around the optical axis 10216) may be imaged on a first sensor pixel 10202 (e.g. on a sensor pixel in a first region 10204) having a first size (e.g. a first surface area). A second object pixel 10214 disposed farther away from the optical axis 10216 with respect to the first object pixel 10214 may be imaged on a second sensor pixel 10206 (e.g. on a sensor pixel in a second region 10208) having a second size (e.g. a second surface area). A third object pixel 10214 disposed farther away from the optical axis 10216 with respect to the first and second object pixels may be imaged on a third sensor pixel 10210 (e.g. on a sensor pixel in a third region 10212) having a third size (e.g. a third surface area). The first object pixel 10214 may have the same size as the second object pixel 10214 and as the third object pixel 10214. The first size of the first sensor pixel 10202 may be larger than the second size and of the third size. The second size of the second sensor pixel 10206 may be larger than the third size.

In this configuration, the system may include an optical element 10218 (e.g. a lens, an objective, or the like) configured to image the object (e.g. the object pixels 10214) onto the sensor 52 (e.g. onto the sensor pixels).

This configuration may offer the effect that an object (e.g. object pixels) disposed near to the optical axis 10216 of the system may be detected with a larger field of view and a larger range than an object disposed farther away from the optical axis 10216, while maintaining a high SNR.

In the following, various aspects of this disclosure will be illustrated:

Example 1o is an optics arrangement for a LIDAR Sensor System. The optics arrangement may include a first portion configured to provide a first effective aperture for a field of view of the LIDAR Sensor System, and a second portion configured to provide a second effective aperture for the field of view of the LIDAR Sensor System. The first portion is configured to deflect light impinging on a surface of the first portion at a first angle with respect to an optical axis of the optics arrangement to substantially cover the entire sensor surface of a sensor pixel. The second effective aperture is smaller than the first effective aperture for light impinging on a surface of the second portion from a second angle with respect to the optical axis of the optics arrangement that is larger than the first angle.

In Example 2o, the subject matter of Example 1o can optionally include that the first portion is configured to deflect light impinging on the surface of the first portion at the first angle with respect to the optical axis of the optics arrangement to substantially cover the entire sensor surface of the sensor pixel, at least with respect to a first direction.

In Example 3o, the subject matter of Example 2o can optionally include that the first direction is the horizontal direction.

In Example 4o, the subject matter of any one of Examples 1o to 3o can optionally include that the first portion is configured to deflect light impinging on the surface of the first portion at an angle with respect to the optical axis of the optics arrangement that is smaller than an angular threshold to substantially cover the entire sensor surface of the sensor pixel, at least with respect to the first direction. The second effective aperture is smaller than the first effective aperture for light impinging on a surface of the second portion from an angle with respect to an optical axis of the optics arrangement that is larger than the angular threshold.

In Example 5o, the subject matter of Example 4o can optionally include that the angular threshold is in the range from about 5° to about 20° with respect to the optical axis of the optics arrangement, e.g. in the range from about 7° to 18°, e.g. in the range from about 9° to about 16°, e.g. in the range from about 11° to about 14°.

In Example 6o, the subject matter of any one of Examples 2o to 5o can optionally include that the optics arrangement is configured to have non-imaging characteristics in the first direction.

In Example 7o, the subject matter of any one of Examples 10 to 6o can optionally include that the first portion is configured to provide a detection range of at least 50 m for light impinging on a surface of the first portion with the first angle with respect to the optical axis of the optics arrangement.

In Example 8o, the subject matter of any one of Examples 10 to 7o can optionally include that the first portion and the second portion are monolithically integrated in one common optical component.

In Example 9o, the subject matter of Example 8o can optionally include that the optics arrangement is configured as a total internal reflection lens.

In Example 10o, the subject matter of Example 90 can optionally include that the second portion has a convex shape with respect to the optical axis of the optics arrangement.

In Example 11o, the subject matter of Example 10o can optionally include that the thickness of the second portion having the convex shape is smaller than the thickness of the first portion.

In Example 12o, the subject matter of any one of Examples 10o or 110 can optionally include that the first portion has a non-convex shape or a convex shape having a smaller curvature than the second portion with respect to the direction into which the second portion deflects light into the direction towards the surface of the sensor.

In Example 13o, the subject matter of any one of Examples 1o to 12o can optionally include that the first portion and the second portion are formed by at least one compound parabolic concentrator.

In Example 14o, the subject matter of Example 13o can optionally include that the optics arrangement further includes an optical element having imaging characteristics in a second direction. The second direction is different from the first direction.

In Example 15o, the subject matter of Example 14o can optionally include that the second direction is the vertical direction.

In Example 16o, the subject matter of any one of Examples 14o or 15o can optionally include that the optical element is a fish-eye optical element.

In Example 17o, the subject matter of any one of Examples 10 to 16o can optionally include that the first portion is configured to deflect the light impinging on the surface of the first portion at an angle with respect to an optical axis of the optics arrangement that is smaller than an angular threshold to substantially use the étendue limit for the sensor surface of the sensor.

In Example 18o, the subject matter of any one of Examples 10 to 17o can optionally include that the first portion and/or the second portion are/is configured to deflect the light impinging on the first portion and/or the second portion into a first deflection direction and/or into a second deflection direction different from the first direction.

Example 190 is an optics arrangement for a LIDAR Sensor System. The optics arrangement may be configured to provide a first effective aperture for a field of view of the LIDAR Sensor System, to provide a second effective aperture for the field of view of the LIDAR Sensor System, and to deflect light impinging on a surface of the optics arrangement at a first angle with respect to an optical axis of the optics arrangement to substantially cover the entire sensor surface of a sensor pixel. The second effective aperture is smaller than the first effective aperture for light impinging on the surface of the optics arrangement from a second angle with respect to the optical axis of the optics arrangement that is larger than the first angle.

In Example 20o, the subject matter of Example 190 can optionally include that the optics arrangement is configured to deflect light impinging on the surface of the optics arrangement at the first angle with respect to the optical axis of the optics arrangement to substantially cover the entire sensor surface of the sensor pixel, at least with respect to a first direction.

In Example 21o, the subject matter of Example 20o can optionally include that the first direction is the horizontal direction.

In Example 22o, the subject matter of any one of Examples 20o or 210 can optionally include that the optics arrangement is configured to have non-imaging characteristics in the first direction.

In Example 23o, the subject matter of any one of Examples 190 to 22o can optionally include that the optics arrangement is configured as a total internal reflection lens.

In Example 24o, the subject matter of any one of Examples 190 to 23o can optionally include that the optics arrangement further includes an optical element having imaging characteristics in a second direction. The second direction is different from the first direction.

In Example 25o, the subject matter of Example 24o can optionally include that the second direction is the vertical direction.

In Example 26o, the subject matter of Example 24o or 25o can optionally include that the optical element is a fish-eye optical element.

Example 27o is a LIDAR Sensor System. The LIDAR Sensor System may include an optics arrangement of any one of Examples 10 to 26o, and a sensor including the sensor pixel configured to detect light provided by the optics arrangement.

In Example 28o, the subject matter of Example 27o can optionally include that the sensor is a one-dimensional sensor array including a plurality of sensor pixels arranged along a sensing direction.

In Example 29o, the subject matter of Example 28o can optionally include that the sensing direction is the vertical direction or the horizontal direction.

In Example 30o, the subject matter of any one of Examples 27o to 290 can optionally include that the LIDAR Sensor System is configured as one of the following LIDAR Sensor Systems: a Flash-LIDAR Sensor System, a 1D-Scanning-LIDAR Sensor System, a 2D-Scanning-LIDAR Sensor System, and a Hybrid-Flash-LIDAR Sensor System.

In Example 31o, the subject matter of any one of Examples 27o to 30o can optionally include that the sensor is a two-dimensional sensor array including a plurality of sensor pixels arranged along a first array direction and a plurality of sensor pixels arranged along a second array direction different from the first array direction.

In Example 32o, the subject matter of Example 310 can optionally include that the sensor pixels have different sensor pixel sizes. A sensor pixel arranged closer to the optical axis of the LIDAR Sensor System has a larger sensor pixel size at least with respect to the second array direction than a sensor pixel arranged farther away from the optical axis of the LIDAR Sensor System.

In Example 33o, the subject matter of any one of Examples 27o to 32o can optionally include that the LIDAR Sensor System further includes a laser source.

In Example 34o, the subject matter of Example 33o can optionally include that the laser source includes at least one laser diode.

In Example 35o, the subject matter of Example 34o can optionally include that the laser source includes a plurality of laser diodes.

In Example 36o, the subject matter of any one of Examples 33o to 35o can optionally include that the at least one laser source is configured to emit a laser beam having a wavelength in the infrared wavelength region.

In Example 37o, the subject matter of any one of Examples 27o to 36o can optionally include that the sensor includes a plurality of photo diodes.

In Example 38o, the subject matter of Example 37o can optionally include that at least some photo diodes of the plurality of photo diodes are avalanche photo diodes.

In Example 39o, the subject matter of Example 38o can optionally include that at least some avalanche photo diodes of the plurality of photo diodes are single-photon avalanche photo diodes.

In Example 40o, the subject matter of Example 390 can optionally include that the LIDAR Sensor System further includes a time-to-digital converter coupled to at least one of the single-photon avalanche photo diodes.

In Example 41o, the subject matter of any one of Examples 37o to 40o can optionally include that the LIDAR Sensor System further includes an amplifier configured to amplify a signal provided by the plurality of photo diodes.

In Example 42o, the subject matter of Example 410 can optionally include that the amplifier is a transimpedance amplifier.

In Example 43o, the subject matter of any one of Examples 410 or 42o can optionally include that the LIDAR Sensor System further includes an analog-to-digital converter coupled downstream to the amplifier to convert an analog signal provided by the amplifier into a digitized signal.

Example 44o is a sensor for a LIDAR Sensor System. The sensor may include a plurality of sensor pixels. The sensor pixels have different sensor pixel sizes. A sensor pixel arranged closer to the optical axis of the LIDAR Sensor System has a larger sensor pixel size than a sensor pixel arranged farther away from the optical axis of the LIDAR Sensor System.

Example 45o is an optics arrangement for a LIDAR Sensor System. The optics arrangement may include a first liquid lens, and a second liquid lens located downstream of the first liquid lens and configured to receive light from the first liquid lens and to deflect the received light into the direction of a surface of a sensor of the LIDAR Sensor System.

In Example 46o, the subject matter of Example 45o can optionally include that the first liquid lens is configured to control the angle of view of the light mapped onto the surface of the sensor by controlling the focal length of the first liquid lens.

In Example 47o, the subject matter of Example 46o can optionally include that the second liquid lens is configured to adjust the focus of the mapping of the light mapped onto the surface of the sensor.

Example 48o is a LIDAR Sensor System. The LIDAR Sensor System may include an optics arrangement of any one of Examples 45o to 47o, and the sensor configured to detect light provided by the optics arrangement.

In Example 49o, the subject matter of Example 48o can optionally include that the optics arrangement is located in the receiving path of the LIDAR Sensor System.

In Example 50o, the subject matter of any one of Examples 48o or 490 can optionally include that the sensor is a one-dimensional sensor array including a plurality of sensor pixels arranged along a sensing direction.

In Example 51o, the subject matter of Example 50o can optionally include that the sensing direction is the vertical direction or the horizontal direction.

In Example 52o, the subject matter of any one of Examples 48o to 510 can optionally include that the LIDAR Sensor System is configured as one of the following LIDAR Sensor Systems: a Flash-LIDAR Sensor System, a 1D-Scanning-LIDAR Sensor System, a 2D-Scanning-LIDAR Sensor System, and a Hybrid-Flash-LIDAR Sensor System.

In Example 53o, the subject matter of any one of Examples 48o to 52o can optionally include that the sensor is a two-dimensional sensor array including a plurality of sensor pixels arranged along a first array direction and a plurality of sensor pixels arranged along a second array direction different from the first array direction.

In Example 54o, the subject matter of Example 53o can optionally include that the sensor pixels have different sensor pixel sizes. A sensor pixel arranged nearer to the optical axis of the LIDAR Sensor System has a larger sensor pixel size at least with respect to the second array direction than a sensor pixel arranged further away from the optical axis of the LIDAR Sensor System.

In Example 55o, the subject matter of Example 54o can optionally include that the first array direction is the horizontal direction and the second array direction is the vertical direction.

In Example 56o, the subject matter of any one of Examples 48o to 55o can optionally include that the LIDAR Sensor System further includes a laser source.

In Example 57o, the subject matter of Example 56o can optionally include that the laser source includes at least one laser diode.

In Example 58o, the subject matter of Example 57o can optionally include that the laser source includes a plurality of laser diodes.

In Example 59o, the subject matter of any one of Examples 56o to 58o can optionally include that the at least one laser source is configured to emit the laser beam having a wavelength in the infrared wavelength region.

In Example 60o, the subject matter of any one of Examples 48o to 590 can optionally include that the sensor includes a plurality of photo diodes.

In Example 61o, the subject matter of Example 60o can optionally include that at least some photo diodes of the plurality of photo diodes are avalanche photo diodes.

In Example 62o, the subject matter of Example 610 can optionally include that at least some avalanche photo diodes of the plurality of photo diodes are single-photon avalanche photo diodes.

In Example 63o, the subject matter of Example 62o can optionally include that the LIDAR Sensor System further includes a time-to-digital converter coupled to at least one of the single-photon avalanche photo diodes.

In Example 64o, the subject matter of any one of Examples 60o to 63o can optionally include that the LIDAR Sensor System further includes an amplifier configured to amplify a signal provided by the plurality of photo diodes.

In Example 65o, the subject matter of Example 64o can optionally include that the amplifier is a transimpedance amplifier.

In Example 66o, the subject matter of any one of Examples 64o or 65o can optionally include that the LIDAR Sensor System further includes an analog-to-digital converter coupled downstream to the amplifier to convert an analog signal provided by the amplifier into a digitized signal.

Example 67o is a method of operating an optics arrangement for a LIDAR Sensor System. The method may include a first portion providing a first effective aperture for a field of view of the LIDAR Sensor System, and a second portion providing a second effective aperture for the field of view of the LIDAR Sensor System. The first portion is deflecting light impinging on a surface of the first portion at a first angle with respect to an optical axis of the optics arrangement to substantially cover the entire sensor surface of a sensor pixel, at least with respect to a first direction. The second effective aperture is smaller than the first effective aperture for light impinging on a surface of the second portion from a second angle with respect to the optical axis of the optics arrangement that is larger than the first angle.

Example 68o is a method of operating a LIDAR Sensor System. The method may include a first portion of an optics arrangement providing a first effective aperture for a field of view of the LIDAR Sensor System, and a second portion of the optics arrangement providing a second effective aperture for the field of view of the LIDAR Sensor System. The first portion is deflecting light impinging on a surface of the first portion at a first angle with respect to an optical axis of the optics arrangement to substantially cover the entire sensor surface of a sensor pixel, at least with respect to a first direction. The second effective aperture is smaller than the first effective aperture for light impinging on a surface of the second portion from a second angle with respect to the optical axis of the optics arrangement that is larger than the first angle. The sensor may detect light provided by the optics arrangement.

Example 690 is a method of operating a LIDAR Sensor System. The method may include providing a first effective aperture for a field of view of the LIDAR Sensor System, providing a second effective aperture for the field of view of the LIDAR Sensor System, and deflecting light impinging on a surface of an optics arrangement at a first angle with respect to an optical axis of the optics arrangement to substantially cover the entire sensor surface of a sensor pixel. The second effective aperture is smaller than the first effective aperture for light impinging on the surface of the optics arrangement from a second angle with respect to the optical axis of the optics arrangement that is larger than the first angle.

Example 70o is a method of operating a LIDAR Sensor System. The method may include providing a first effective aperture for a field of view of the LIDAR Sensor System, providing a second effective aperture for the field of view of the LIDAR Sensor System, and deflecting light impinging on a surface of an optics arrangement at a first angle with respect to an optical axis of the optics arrangement to substantially cover the entire sensor surface of a sensor pixel. The second effective aperture is smaller than the first effective aperture for light impinging on the surface of the optics arrangement from a second angle with respect to the optical axis of the optics arrangement that is larger than the first angle. The sensor may detect light provided by the optics arrangement.

Example 710 is a method of operating an optics arrangement for a LIDAR Sensor System. The method may include arranging a second liquid lens located downstream of a first liquid lens, and the second liquid lens receiving light from the first liquid lens and deflecting the received light into the direction of a surface of a sensor pixel of the LIDAR Sensor System.

Example 72o is a method of operating a LIDAR Sensor System. The method may include arranging a second liquid lens located downstream of a first liquid lens, the second liquid lens receiving light from the first liquid lens and deflecting the received light into the direction of a surface of a sensor of the LIDAR Sensor System, and the sensor detecting light provided by the second liquid lens.

Example 73o is a computer program product. The computer program product may include a plurality of program instructions that may be embodied in non-transitory computer readable medium, which when executed by a computer program device of a LIDAR Sensor System according to any one of Examples 27o to 43o or 48o to 66o, cause the LIDAR Sensor System to execute the method according to any one of the Examples 67o to 72o.

Example 74o is a data storage device with a computer program that may be embodied in non-transitory computer readable medium, adapted to execute at least one of a method for LIDAR Sensor System according to any one of the above method Examples, the LIDAR Sensor System according to any one of the above LIDAR Sensor System Examples.

A conventional scanning LIDAR system may be systematically limited in terms of SNR. This may be due to the fact that, although a beam steering unit (e.g., a 1D MEMS mirror) in the LIDAR emitter path may be highly angle-selective (illustratively, the LIDAR emitter may be able to emit light into a narrow, well-known angular segment), the optical system in the LIDAR receiver path normally does not provide angular selectivity. The receiver optics is instead usually configured such that it may be capable of imaging light from all angular segments (e.g. all angular directions) within the FOV onto the LIDAR sensor. As an example, the FOV may be 10° in the vertical direction and 60° in the horizontal direction.

Thus, in a conventional scanning LIDAR system the LIDAR emitter path may provide a high level of angular control, whereas the LIDAR receiver path may typically not provide any means for angular control. Consequently, any light emitted from the FOV into the opening aperture of the LIDAR sensor optics may be imaged towards the LIDAR sensor and may lead to the generation of a corresponding signal. This may have the effect that a signal may be generated even in the case that light is coming from a direction into which no LIDAR light had been emitted at a specific point in time (e.g., even in the case that light is coming from a direction into which the beam steering unit did not direct or is not directing LIDAR light). Therefore, ambient light sources, such as a LIDAR emitter from an oncoming vehicle, solar background light (e.g. stray light), or reflections from solar background light may lead to unwanted (e.g. noise) signals at any time during the scanning process.

In a scanning LIDAR system the emitted (e.g., laser) light may be described as vertical (e.g., laser) line that is scanned along the horizontal direction (e.g. a vertical laser line that is moving from left to right, and vice versa, in the field of view of the system). The light may be reflected by an object and may be imaged by the receiver optics onto the LIDAR sensor of the scanning LIDAR system (e.g., a 1D sensor array). The imaged light may appear on the LIDAR sensor as a vertical line. The vertical line may move over the LIDAR sensor (e.g., over the front side of the LIDAR sensor) from one side of the LIDAR sensor towards the other side of the LIDAR sensor (e.g., in the horizontal direction) depending on the direction into which the beam steering unit directs the emitted light.

Illustratively, in the case that the LIDAR light is emitted into the direction of one side of the FOV, the imaged line on the LIDAR sensor may appear at the opposite side on the LIDAR sensor. This may be the case since the imaging process may usually involve a transformation with a point symmetry. As an example, in the case the vertical laser line is emitted into the far-right side of the FOV (e.g., at an angle of +30°), the imaged line may be at the far-left side of the LIDAR sensor (e.g., looking at the LIDAR sensor from the back side). The imaged vertical line may then move from the far-left side of the LIDAR sensor towards the center of the LIDAR sensor (and then towards the right side) following the movement of the beam steering unit from the far-right position towards the center position (and then towards the left or far-left position, e.g. light emitted at an angle of)−30°.

In addition to the vertical laser line, also light coming from an ambient light source (e.g., the sun, a vehicle, etc.) may be focused by the receiver optics towards the LIDAR sensor (e.g., it may be imaged onto the LIDAR sensor or onto a portion of the LIDAR sensor). The light coming from the ambient light source may be imaged onto one or more sensor pixels of the LIDAR sensor. Consequently the one or more sensor pixels onto which the light coming from the ambient light source is imaged may measure a signal (e.g., a photo current) generated by both the contribution of the vertical laser line (e.g., the light effectively emitted by the LIDAR system) and the contribution of the ambient light source. Therefore, the SNR for the one or more sensor pixels affected by the ambient light (e.g., the light coming from the ambient light source) may be decreased. This may also have a negative influence on signal characteristics that may be critical for reliable object detection, such as signal height, signal width, and signal form. Additional unwanted complications may arise depending on the specific architecture of the LIDAR sensor (for example, pin-diode, avalanche photodiode, single photon avalanche diode, etc.) due to phenomena like signal overflow, quenching, spillover, crosstalk, and the like.

A possible solution to the above described problem may be to use as LIDAR sensor a 2D-sensor array (e.g., instead of a 1D-sensor array). In a 2D-sensor array it may be possible to activate (e.g., by supplying a corresponding bias voltage) only those sensor pixels disposed along the column (s) into which a signal from the LIDAR emitter is expected (e.g., the column(s) onto which the emitted vertical line is expected to be imaged). The activation may be based on the known emission angle set by the beam steering unit. As the vertical line moves over the 2D-sensor array, different columns of sensor pixels may be activated. However, a 2D-sensor array may be rather expensive and may require a complex control circuitry. Furthermore, a 2D-sensor array may have a low filling factor, since each sensor pixel may be connected with corresponding voltage wires and signal wires. Typically, rather wide trenches may be necessary between the pixel columns. Consequently, a 2D-sensor array may have a rather low sensitivity as compared, for example, to a 1D-sensor array. In addition, it may also happen that small reflection spots from the FOV are missed (e.g., not detected) in the case that the signal falls in a region in-between the light sensitive areas (e.g., in-between the light sensitive pixel areas).

Another possible solution may be to provide a rotating LIDAR system. In a rotating LIDAR system the light emitter(s) (e.g., the laser emitter) and the light receiver(s) may be arranged on a common platform (e.g., a common movable support), which may typically rotate 360°. In such a system, the light receiver sees at each time point the same direction into which the light emitter has emitted light (e.g., LIDAR light). Therefore, the sensor always sees at one time point only a small horizontal solid angle range. This may reduce or prevent the above-described problem. The same may be true for a system in which the detected light is captured by means of a movable mirror (e.g., an additional MEMS mirror in the receiver path) or another similar (e.g., movable) component. However, a rotating LIDAR system and/or a system including an additional movable mirror require comparatively large movable components (e.g., movable portions). This may increase the complexity, the susceptibility to mechanical instabilities and the cost of the system.

Another possible solution may be to use a spatial light modulator in the receiver path, such as a Digital Mirror Device (DMD). The DMD may be configured to reflect light coming from the emitted vertical LIDAR line towards the LIDAR sensor (e.g., towards the sensor array), and to reflect away from the LIDAR sensor (e.g., towards a beam dump) light coming from other directions (e.g., coming from other angular segments). Also in this configuration, the information about the current emission angle may be provided from the beam steering unit to the DMD controller, such that the corresponding DMD mirrors may be tilted into the desired position. However, a DMD is an expensive device, originally developed for other types of applications, such as video projection. A DMD device may usually include a huge number of tiny mirrors (e.g., from several thousands of mirrors up to several millions of mirrors), which may be tilted at very high frequencies (e.g., in the kHz-regime), and independently from each other. A DMD device may thus be capable of projecting an image with high resolution (e.g., 4 K resolution with 4096×2160 pixel), and of providing a broad range of grey levels (e.g., 10-bit corresponding to 1024 gray levels). However, such features may not be required in LIDAR applications. Thus, a DMD device may be overly complicated (e.g. over-engineered), and thus unnecessarily expensive, for applications in a LIDAR system, e.g., in a context in which resolutions may be much smaller and grey levels may not be required.

Various embodiments of the present application may be based on controlling the movement of one or more (e.g., optical) components configured for detecting light in a LIDAR system (e.g., in the LIDAR Sensor System 10), such that the impinging of undesired (e.g., noise) light onto a sensor of the LIDAR system (e.g., the sensor 52) may be substantially avoided. In various embodiments, components may be provided that are configured such that the amount of light from an ambient light source arriving onto the sensor (e.g., onto the sensor pixels) may be greatly reduced (e.g., substantially to zero). This may offer the effect that the emitted light (e.g., the emitted LIDAR light) may be detected with high SNR. A reliable object detection may thus be provided.

In various embodiments, the FOV of the LIDAR system may be imaged not directly onto the sensor but rather onto an optical device (also referred to as mirror device). Illustratively, the optical device may be arranged substantially in the position in the LIDAR system in which the sensor would normally be located. The optical device may include a carrier (e.g., a mirror support plate) that may include a light-absorbing material. Additionally or alternatively, the carrier may be covered by a light-absorbing layer (e.g., by a layer including a light-absorbing material). In particular, the carrier may be configured to absorb light in a predefined wavelength range, for example in the infra-red wavelength range (e.g., from about 860 nm to about 2000 nm, for example from about 860 nm to about 1000 nm). The carrier may be configured to essentially absorb all the light impinging onto the carrier.

The LIDAR system may be configured as a scanning LIDAR system. For example, the scanning LIDAR system may include a beam steering unit for scanning emitted LIDAR light over the FOV of the scanning LIDAR system (e.g., across the horizontal FOV).

One or more mirrors (e.g., one or more 1D-mirrors) may be mounted on the carrier. The carrier may include one or more tracks (e.g. mirror tracks). The one or more tracks may be disposed substantially parallel to the direction into which the emitted LIDAR light is scanned (e.g., parallel to the horizontal FOV of the scanning LIDAR system). The optical device may be configured such that the one or more mirrors may be moved along the one or more tracks, e.g. in the direction parallel to the direction in which the emitted LIDAR light is scanned. The one or more mirrors may be disposed such that the LIDAR light impinging on the mirror(s) (e.g., infra-red light, for example light having a wavelength of about 905 nm) may be reflected towards the sensor. The sensor may be disposed in a position (and with an orientation) where the sensor may receive the LIDAR light reflected from the optical device towards the sensor. The sensor may be a 1D-sensor array, a 2D-sensor array, or the like. The sensor may be included in the optical device or it may be separate from the optical device.

In various embodiments, the optical device may be disposed in the focal plane of the receiver optics of the LIDAR system (e.g., it may be arranged in the plane in which the receiver optics focuses or collimates the collected light). One or more optical elements (e.g. a converging optical element, such as a converging lens, an objective, and the like) may be arranged between the optical device and the sensor. Alternatively, the sensor may be disposed in its original position (e.g., it may be disposed in the focal plane of the receiver optics). In this configuration, the optical device may be disposed between the receiver optics and the sensor.

The optical device may include one or more actors (also referred to as actuators) configured to move the one or more mirrors. As an example, the optical device may include one or more piezo actors. The movement of the one or more mirrors may be a continuous movement. By way of example, the movement of the one or more mirrors may be an oscillating movement, for example with a sinusoidal character. The movement of the one or more mirrors may be controlled by a displacement in the range from about 0.5 mm to about 3.0 mm, for example from about 1 mm to about 2 mm. The movement (e.g., the oscillation) of the one or more mirrors may be in accordance with the movement of the beam steering unit of the LIDAR system. By way of example, the movement of the one or more mirrors may be synchronized with the movement of the beam steering unit of the LIDAR system (as an example, with the movement of a scanning mirror, such as a 1D-scanning MEMS mirror). The movement (e.g., the oscillation) of the one or more mirrors may be in accordance (e.g., synchronized) with the generation of a light beam by a light source of the LIDAR system.

LIDAR light reflected from an object in the FOV may be imaged onto the one or more mirrors of the optical device. In view of the synchronization with the beam steering unit, the one or more mirrors may be disposed at a position where the LIDAR light may be reflected towards the sensor. Ambient light may be (e.g., mostly) imaged onto the light-absorbing carrier (e.g., onto the infra-red absorbing mirror support plate). The ambient light may thus not be reflected towards the sensor. This may offer the effect that the SNR for the detection of the LIDAR light (e.g., for object detection) increases, since the ambient light signal(s) may substantially be suppressed.

The (e.g. lateral) dimensions of the one or more mirrors may be selected based on the dimensions of the emitted LIDAR light (e.g., on the dimensions of an emitted line, such as an emitted laser line) and/or on the dimensions of the sensor. Illustratively, a first lateral dimension (e.g. the width) of the one or more mirrors may be correlated with a first lateral dimension of the emitted line (e.g., of the laser beam spot). As an example, the width of the emitted line may be in the range from about 300 μm to about 400 μm. A second lateral dimension (e.g., a length or a height) of the one or more mirrors may be correlated with a second lateral dimension of the sensor. As an example, a sensor (e.g., including a column of pixels, for example 64 pixels) may have a total length of about 15 mm, for example of about 10 mm, for example of about 20 mm. The one or more mirrors may have a first lateral dimension in the range from about 0.25 mm to about 1 mm, for example 0.5 mm. The one or more mirrors may have a second lateral dimension in the range from about 5 mm to about 20 mm, for example 15 mm.

In various embodiments, a plurality of (e.g. smaller) mirrors may be included in the optical device, illustratively instead of a single larger mirror. This may provide the effect that the mass (e.g. the mirror mass) which is moved by the actuators may be smaller (and thus easier to move). In addition, the mirrors of the plurality of mirrors may be moved independently from each other. This may offer the possibility to split up the emitted line into sub-lines (e.g., to split the emitted laser line into laser sub-lines). This may be advantageous, for example, in terms of eye safety. The mirrors of the plurality of mirrors may be moved with the same frequency. Alternatively, individual mirrors of the plurality of mirrors may be moved with different frequencies. As an example, a ratio between the frequencies of individual mirrors may be an integer number (e.g., 1, 2, 3, etc.). The ratio may also be a non-integer number (e.g., 0.5, 1.5, 2.8, 3.7, etc.).

The one or more mirrors of the optical device may have a flat surface (e.g., a simple flat mirror surface). The surface(s) of the one or more mirrors may be configured for reflecting light in the wavelength range of interest. As an example, the surface(s) of the one or more mirrors may include a coating for reflecting the LIDAR wavelength (e.g., 905 nm). The surface(s) of the one or more mirrors may be tilted with respect to the carrier (e.g., with respect to the surface of the carrier), for example by an angle in the range from about 20° to about 75°, for example in the range from about 30° to about 65°.

The one or more mirrors of the optical device may have a curved surface (e.g., in an elliptical manner, in a parabolic manner, in an aspherical manner, or the like). The curved surface(s) may be configured to focus the impinging LIDAR light upon reflecting it towards the sensor. This may offer the effect that the movement of the one or more mirrors may be reduced without modifying the dimensions of the sensor. As an example, a length of the movement may be reduced. Alternatively or additionally, the surface(s) of the one or more mirrors may include focusing structures and/or wavelength-dependent structures, for example based on diffractive optical elements.

In the case that the optical device includes a plurality of mirrors, the mirrors may have surfaces configured in a different manner. As an example, a first mirror of the plurality of mirrors may have a flat surface and a second mirror of the plurality of mirrors may have a curved surface. As another example, a first mirror of the plurality of mirrors may have a surface curved in a first manner (e.g., elliptical) and a second mirror of the plurality of mirrors may have a surface curved in a second manner (e.g., parabolic), different from the first manner. As a yet another example, a first mirror of the plurality of mirrors may include on its surface focusing structures, and the surface of a second mirror of the plurality of mirrors may be free from such focusing structures.

In various embodiments, the optical device may be configured to rotate (e.g., it may be configured as a rotating disk device). As an example, the carrier may be configured to rotate. The rotation (e.g., the rotational movement) may be around an axis of rotation. The axis of rotation may be perpendicular to the direction into which the emitted LIDAR light is scanned (e.g., perpendicular to the horizontal FOV of the scanning LIDAR system). The optical device may be disposed with an offset with respect to the optical axis of the receiver optics (e.g., it may be disposed not along the optical axis of the receiver optics but slightly misaligned). Illustratively, the rotation axis may have an angle that is slightly inclined with respect to the optical axis of the receiver optics. In this configuration, the carrier may include at least one reflecting surface (e.g., at least a portion of the surface of the carrier may be reflecting). As an example, the carrier may include at least one reflecting strip (e.g., a vertical strip) along its surface. The reflecting strips may be configured to reflect light in the infra-red range. The carrier may have any suitable shape. By way of example, the carrier may be shaped as a cylinder or as a prism (for example, a prism with a triangular base, a prism with a polygonal base, such as a pentagonal base, etc.). As an example, the carrier may be a prism with a triangular base, and at least one of the three side surfaces (or at least a portion of at least one of the three side surfaces) may be reflecting. As another example, the reflecting strips may be disposed along the surface of the carrier (e.g., along the side surface of the cylinder or along the side surfaces of the prism). The optical device may be configured such that the rotation may be in accordance (e.g., synchronized) with the beam steering unit of the LIDAR system. The optical device may be configured such that the rotation may be in accordance (e.g., synchronized) with the generation of a light beam by a light source of the LIDAR system.

The optical device may include a plurality of rotating disks. From an optical point of view the working principle may be the same as described above. Illustratively, the optical device may include a plurality of (e.g., separate) carriers. Each carrier of the plurality of carriers may include at least one reflecting surface (e.g., at least one reflecting strip) and at least one light-absorbing portion (e.g., one light-absorbing face). The carriers of the plurality of carriers may be configured to rotate independently from each other. The optical device may be configured such that not all the carriers of the plurality of carriers rotate at the same time. The optical device may be configured to rotate only the carrier(s) onto which the emitted line is imaged (e.g., only the carrier(s) onto which the emitted LIDAR light is expected to be imaged). The optical device may be configured to rotate the carriers of the plurality of carriers at different frequencies and/or at different phases. Such configurations with a plurality of rotating disks may offer the effect that lower masses (e.g., mirror masses) are moved. A same or similar effect may be achieved by splitting a carrier into multiple portions and controlling each portion to rotate independently.

In various embodiments, the optical device may be configured as a band-like device. The carrier may be configured to move along a direction substantially parallel to the direction into which the emitted LIDAR light is scanned (e.g., parallel to the horizontal FOV of the scanning LIDAR system). The carrier may be configured to move (e.g., to continuously move) or oscillate along such direction (e.g., to move back and forth along such direction or to move continuously along one direction). Illustratively, the carrier may be configured as a conveyor belt moving (e.g., circulating) around a holding frame. The optical device may be configured to move or oscillate the carrier in accordance (e.g., synchronized) with the beam steering unit of the LIDAR system. The optical device may be configured to move or oscillate the carrier in accordance (e.g., synchronized) with the generation of a light beam is by a light source of the LIDAR system. In this configuration, the carrier may include one or more reflecting surfaces (e.g., one or more reflecting portions, such as one or more reflecting strips). The reflecting surfaces may be configured to reflect light in the infra-red range. The band-like device (or the carrier) may be disposed (e.g., oriented) such that LIDAR light imaged from the FOV and impinging onto at least one of the reflecting strips may be reflected towards the sensor. The band-like device may be configured such that ambient light which does not impinge onto the vertical strips is absorbed by carrier (e.g., by the band-material).

In various embodiments, one or more movable sensor pixel elements may be implemented. The movable sensor pixel elements may include light sensitive semiconductor chips mounted on a lightweight substrate. As an example, one or more (e.g., movable) sensor pixels may be mounted on the carrier of the optical device (e.g., on the light-absorbing surface of the carrier). Illustratively, the one or more movable sensor pixels may be included in the optical device as an alternative to the one or more mirrors. In this case, the optical device may be referred to as a sensor device. The movement of the sensor pixels (e.g., along tracks) may be controlled such that LIDAR light may be imaged onto one or more sensor pixels. The movement of the sensor pixels may be controlled such that light from an ambient light source may be imaged onto the light-absorbing carrier. The sensor structure may further include flexible contact elements and/or sliding contact elements configured to transmit measured electrical signal towards the corresponding receiver electronics. The sensor device may be configured to move the sensor pixels in accordance (e.g., synchronized) with the beam steering unit of the LIDAR system. The sensor device may be configured to move the sensor pixels in accordance (e.g., synchronized) with the generation of a light beam by a light source of the LIDAR system.

In various embodiments, the scanning of the emitted LIDAR light may be performed in one direction (e.g., it may be a 1D-scanning). The scanning of the emitted LIDAR light may also be performed in more than one direction (e.g., it may be a 2D-scanning). The beam steering unit may include a suitable component or a suitable configuration for performing the beam steering function, e.g. for scanning the emitted LIDAR light into a desired direction. As an example, the beam steering unit may include one or more of a 1D-MEMS mirror, a 2D-MEMS mirror, a rotating polygon mirror, an optical phased array, a beam steering element based on meta-materials, or the like. As another example, the beam steering unit may include a controllable light emitter, e.g. a light emitter including a plurality of light emitting elements whose emission may be controlled (for example, column-wise or pixel-wise) such that scanning of the emitted light may be performed. As an example of controllable light emitter, the beam steering unit may include a vertical-cavity surface-emitting laser (VCSEL) array, or the like. The sensor may have a suitable configuration for detecting the LIDAR light. As an example, the sensor may include a 1D-array of sensor pixels (e.g., it may be a 1D-sensor array). The sensor may also include a 2D-array of sensor pixels (e.g., it may be a 2D-sensor array). The sensor may also be configured as a 0D-sensor (for example it may be a graphene-based sensor).

FIG. 103 shows a system 10300 including an optical device 10302 in a schematic view in accordance with various embodiments.

The system 10300 may be a LIDAR system. The system 10300 may be configured as a LIDAR scanning system. By way of example, the system 10300 may be or may be configured as the LIDAR Sensor System 10 (e.g., as a scanning LIDAR Sensor System 10). The system 10300 may include an emitter path, e.g., one or more components of the system configured to emit (e.g. LIDAR) light. The emitted light may be provided to illuminate (e.g., interrogate) the area surrounding or in front of the system 10300. The system 10300 may include a receiver path, e.g., one or more components configured to receive light (e.g., reflected) from the area surrounding or in front of the system 10300 (e.g., facing the system 10300).

The system 10300 may include an optics arrangement 10304 (also referred to as receiver optics arrangement or sensor optics). The optics arrangement 10304 may be configured to receive (e.g., collect) light from the area surrounding or in front of the system 10300. The optics arrangement 10304 may be configured to direct or focus the collected light onto a focal plane of the optics arrangement 10304. Illustratively, the optics arrangement 10304 may be configured to collimate the received light towards the optical device 10302. By way of example, the optics arrangement 10304 may include one or more optical components (such as one or more lenses, one or more objectives, one or more mirrors, and the like) configured to receive light and focus it onto a focal plane of the optics arrangement 10304.

The optics arrangement 10304 may have or may define a field of view 10306 of the optics arrangement 10304. The field of view 10306 of the optics arrangement 10304 may coincide with the field of view of the system 10300. The field of view 10306 may define or may represent an area (or a solid angle) through (or from) which the optics arrangement 10304 may receive light (e.g., an area visible through the optics arrangement 10304). The optics arrangement 10304 may be configured to receive light from the field of view 10306. Illustratively, the optics arrangement 10304 may be configured to receive light (e.g., emitted and/or reflected) from a source or an object (or many objects, or all objects) present in the field of view 10306.

The field of view 10306 may be expressed in terms of angular extent that may be imaged through the optics arrangement 10304. The angular extent may be the same in a first direction (e.g., the horizontal direction, for example the direction 10354 in FIG. 103) and in a second direction (e.g., the vertical direction, for example the direction 10356 in FIG. 103). The angular extent may be different in the first direction with respect to the second direction. The first direction and the second direction may be perpendicular to an optical axis (illustratively, lying along the direction 10352 in FIG. 103) of the optics arrangement 10354. The first direction may be perpendicular to the second direction. By way of example, the field of view of the optics arrangement 10304 may be about 60° in the horizontal direction (e.g., from about −30° to about +30° with respect to the optical axis in the horizontal direction), for example about 50°, for example about 70°, for example about 100°. By way of example, the field of view 10306 of the optics arrangement 10304 may be about 10° in the vertical direction (e.g., from about −5° to about +5° with respect to the optical axis in the vertical direction), for example about 5°, for example about 20°, for example about 30°. The definition of first direction and second direction (e.g., of horizontal direction and vertical direction) may be selected arbitrarily, e.g. depending on the chosen coordinate (e.g. reference) system.

The system 10300 may include at least one light source 42. The light source 42 may be configured to emit light (e.g., to generate a light beam 10308). The light source 42 may be configured to emit light having a predefined wavelength, e.g. in a predefined wavelength range. For example, the light source 42 may be configured to emit light in the infra-red and/or near infra-red range (for example in the range from about 700 nm to about 5000 nm, for example in the range from about 860 nm to about 2000 nm, for example 905 nm). The light source 42 may be configured to emit LIDAR light. The light source 42 may include a light source and/or optics for emitting light in a directional manner, for example for emitting collimated light (e.g., for emitting laser light). The light source 42 may be configured to emit light in a continuous manner or it may be configured to emit light in a pulsed manner (e.g., to emit a sequence of light pulses, such as a sequence of laser pulses). As an example, the light source 42 may be configured to generate a plurality of light pulses as the light beam 10308. The system 10300 may also include more than one light source 42, for example configured to emit light in different wavelength ranges and/or at different rates (e.g., pulse rates).

By way of example, the at least one light source 42 may be is configured as a laser light source. The laser light source may include a laser source 5902. The laser source 5902 may include at least one laser diode, e.g. the laser source 5902 may include a plurality of laser diodes, e.g. a multiplicity, for example more than two, more than five, more than ten, more than fifty, or more than one hundred laser diodes. The laser source 5902 may be configured to emit a laser beam having a wavelength in the infra-red and/or near infra-red wavelength range.

The system 10300 may include a beam steering unit 10310. The beam steering unit 10310 may be configured to receive light emitted by the light source 42. The beam steering unit 10310 may be configured to direct the received light towards the field of view 10306 of the optics arrangement 10304. In the context of the present application, the light output from (or by) the beam steering unit 10310 (e.g., the light directed from the beam steering unit 10310 towards the field of view 10306) may be referred to as emitted light 10312. The beam steering unit 10306 may be configured to scan the field of view 10306 with the emitted light 10312 (e.g., to sequentially illuminate different portions of the field view 10306 with the emitted light 10312). By way of example, the beam steering unit 10310 may be configured to direct the emitted light 10312 such that a region of the field of view is illuminated. The beam steering unit 10310 may be configured to control the emitted light 10312 such that the illuminated region moves over the entire field of view 10306 (e.g., it may be configured to scan the entire field of view 10306 with the emitted light 10312). A scanning (e.g., a scanning movement) of the beam steering unit 10310 may be continuous. Illustratively, the beam steering unit 10310 may be configured such that the emitted light moves continuously over the field of view 10306.

The illuminated region may have any shape and/or extension (e.g., area). Illustratively, the shape and/or extension of the illuminated region may be selected to ensure a spatially selective and time efficient interrogation of the field of view 10306. The beam steering unit 10310 may be configured to direct the emitted light 10312 such that the illuminated region extends along the entire field of view 10306 into a first direction. Illustratively, the illuminated region may illuminate the entire field of view 10306 along a first direction, e.g., it may cover the entire angular extent of the field of view 10306 in that direction. The beam steering unit 10310 may be configured to direct the emitted light 10312 such that the illuminated region extends along a smaller portion of the field of view 10306 into a second direction (e.g., 0.5% of the extension of the field of view 10306 in that direction, for example 1%, for example 5%). The illuminated region may cover a smaller angular extent of the field of view 10306 in the second direction (e.g., 0.5°, 1°, 2° or 5°).

By way of example, the beam steering unit 10310 may be configured such that the emitted light 10312 illuminates a region extending along the (e.g., entire) vertical extension of the field of view 10306. Illustratively, the illuminated region may be seen as a vertical line 10314 extending through the entire field of view 10306 in the vertical direction (e.g., the direction 10356). The beam steering unit 10310 may be configured to direct the emitted light 10312 such that the vertical line 10314 moves over the entire field of view 10306 along the horizontal direction (e.g., along the direction 10354, as illustrated by the arrows in FIG. 103).

The beam steering unit 10310 may include a suitable (e.g., controllable) component or a suitable configuration for performing the beam steering function, e.g. for scanning the field of view 10306 with the emitted light 10312. As an example, the beam steering 10310 unit may include one or more of a 1D-MEMS mirror, a 2D-MEMS mirror, a rotating polygon mirror, an optical phase array, a beam steering element based on meta-materials, a VCSEL array, or the like.

The emitted light 10312 may be reflected (e.g., back towards the system 10300) by one or more (e.g., system-external) objects present in the field of view 10306 (illustratively, in the illuminated region of the field of view 10306). The optics arrangement 10304 may be configured to receive the reflected emitted light (e.g., the reflected LIDAR light, e.g. the LIDAR light reflected by one or more objects in the field of view 10306) and to image the received light onto the optical device 10302 (e.g., to collimate the received light towards the optical device 10302). The optical device 10302 may be disposed in the focal plane of the optics arrangement 10304.

The optical device 10302 may be configured to enable a detection of the light collimated towards the optical device 10302. The optical device 10302 may include one or more optical components (e.g., a plurality of optical components). The plurality of optical components may include one or more (e.g., optical) elements configured to direct light (e.g., the received light) towards a sensor 52 (e.g., a light sensor 52). The one or more elements may be configured to reflect the received light towards the sensor 52. By way of example, the one or more reflecting elements may include or may be configured as one or more mirrors (e.g., as a mirror structure including one or more mirrors). Alternatively or additionally, the one or more reflecting elements may be a reflecting portion of a surface of a carrier of the optical device 10302 (e.g., a reflecting surface of the carrier). As an example, the one or more reflecting elements may be or may be configured as one or more reflecting strips disposed on the surface of the carrier.

The sensor 52 may be a sensor 52 of the LIDAR system 10300 (e.g., separate from the optical device 10302). Alternatively, the optical device 10302 may include the sensor 52 (e.g., the one or more optical components of the optical device 10302 may include the sensor 52 in addition or in alternative to the one or more reflecting elements). The sensor 52 may include one or more sensor pixels. The sensor pixels may be configured to generate a signal (e.g. an electrical signal, such as a current) when light impinges onto the one or more sensor pixels. The generated signal may be proportional to the amount of light received by the sensor 52 (e.g. the amount of light arriving on the sensor pixels). By way of example, the sensor 52 may include one or more photo diodes. The sensor 52 may include one or a plurality of sensor pixels, and each sensor pixel may be associated with a respective photodiode. At least some of the photo diodes may be avalanche photodiodes. At least some of the avalanche photo diodes may be single photon avalanche photo diodes. The sensor 52 may be configured to operate in a predefined range of wavelengths (e.g., to generate a signal when light in the predefined wavelength range impinges onto the sensor 52), for example in the infra-red range (and/or in the near infra-red range).

However, one or more ambient light sources 10316 may be present in the field of view 10306. As an example, the ambient light source 10316 may be another LIDAR system emitting light within the field of view 10306, or it may be the sun, or it may be an object reflecting light from the sun, etc. Illustratively, the ambient light source 10316 may be a source of light external to the system 10300, which is disposed within the field of view 10306, and which is emitting light that may be received by the optics arrangement 10304. Thus, also light coming from the ambient light source 10316 may be directed towards the optical device 10302. The light coming from the ambient light source 10316 may be a source of noise for the detection of the reflected LIDAR light.

The optical device 10302 may be configured such that the noise due to an ambient light source 10316 may be reduced or substantially eliminated. The optical device 10302 may be configured such that light coming from an ambient light source 10316 does not lead to the generation of any signal or it leads to the generation of a signal having a much smaller amplitude than a signal generated by the reflected LIDAR light (also referred to as the LIDAR signal). As an example, the amplitude of the signal due to the ambient light source 10316 may be less than the 10% of the amplitude of the LIDAR signal, for example less than 5%, for example less than 1%. Illustratively, the optical device 10302 may be configured such that the LIDAR light may be directed towards the sensor 52 (e.g., the LIDAR light may impinge onto the sensor 52, e.g., onto the sensor pixels), whereas light coming from an ambient light source 10316 substantially does not impinge onto the sensor 52.

The optical device 10302 may be configured to have light-absorbing characteristics. The optical device may include a carrier. The carrier may be configured to absorb light. The carrier may include at least one light-absorbing surface (illustratively, at least the surface of the carrier facing the optics arrangement 10304 may be configured to absorb light). The light-absorbing surface may be configured to be absorbent for light in a predefined wavelength range. The light-absorbing surface may be configured to absorb light that would lead to the generation of a signal if impinging onto the sensor 52. The predefined wavelength range for light absorption may be same or similar to the wavelength range in which the sensor 52 may operate. By way of example, the predefined wavelength range may be the infra-red range (and/or in the near infra-red range).

The optical device 10302 may be configured such that the reflected LIDAR light may impinge onto one or more optical components of the plurality of optical components (e.g., onto one or more of the reflecting elements and/or onto the sensor 52). The optical device 10302 may be configured such that light coming from the ambient light source 10316 may impinge onto the light-absorbing carrier (e.g., onto the light-absorbing surface of the carrier). The ambient light may thus be absorbed without leading to the generation of a noise signal. Illustratively, any portion of the optical device 10302 and/or any portion of the carrier that is not configured to reflect light (e.g., towards the sensor 52) may be considered a light-absorbing portion (e.g., a light-absorbing portion of the carrier).

The optical device 10302 may include a controller (e.g., the sensor controller 53). The sensor controller 53 may be configured to control a movement (e.g., a continuous movement) of one or more optical components of the plurality of optical components. The sensor controller 53 may be configured to control the movement in accordance with a scanning movement of the beam steering unit 10310 of the LIDAR system 10300. This may offer the effect that the one or more controlled optical components may be moved into a position to receive the reflected LIDAR light (e.g., into a position in which the LIDAR light may be expected). The one or more controlled optical components may also be moved away from a position in which they may receive ambient light. By way of example, the sensor controller 53 may be configured to move one or more optical components (illustratively, one or more optical components not used for receiving the LIDAR light) into a position where the one or more optical components may not receive any light. This may further ensure that substantially no ambient light is directed towards the sensor 52. The quality of the detection, e.g. the SNR, may thus be increased.

The movement of the (e.g., controlled) one or more optical components of the plurality of optical components may be a continuous movement. Illustratively, the sensor controller 53 may be configured to control the continuous movement of the one or more optical components such that the one or more optical components are not stationary in one position (e.g., when in operation they do not reside in the same position for more than 500 ns or for more than 1 ms). The controlled movement may be a linear movement (e.g., a linear continuous movement), e.g. a movement along one direction (for example, the horizontal direction and/or the vertical direction). The controlled movement may be a rotational movement (e.g., a rotational continuous movement), e.g. a movement around an axis of rotation (for example, a movement around an axis oriented (in other words, aligned) in the vertical direction).

The sensor controller 53 may be configured to control the movement of the one or more optical components of the plurality of optical components with a same time dependency (e.g., a same time structure, e.g., a same relationship between time and movement or displacement) as the scanning movement of the beam steering unit 10310. The sensor controller 53 may be configured to control the continuous movement of the one or more optical components of the plurality of optical components in synchronization with the scanning movement of the beam steering unit 10310. The scanning movement of the beam steering unit 10310 may have a predefined time characteristics (e.g., it may have a linear character, a sinusoidal character, or the like). By way of example, the movement or the oscillation of a scanning mirror of the beam steering unit 10310 may have a sinusoidal character. The sensor controller 53 may be configured such that the movement of the one or more optical components has the same (e.g., linear or sinusoidal) time characteristics as the scanning movement of the scanning mirror of the beam steering unit 10310.

Additionally or alternatively, the sensor controller 53 may be configured to control the movement of the one or more optical components of the plurality of optical components in accordance with the generation of the light beam 10308 by the light source 42 of the LIDAR system 10300. The sensor controller 53 may be configured to control the movement of the one or more optical components in synchronization with the generation of the light beam 10308 by the light source 42. Illustratively, the sensor controller 53 may be configured to control the movement of the one or more optical components based on a knowledge of the time points (e.g., of the pulse rate, e.g. of the distance between pulses) at which the light beam 10308 is generated.

FIG. 104A and FIG. 104B show an optical device 10302 in a schematic view in accordance with various embodiments.

The carrier 10402 of the optical device 10302 may include or may consist of a light-absorbing material. The carrier 10402 may include a carrier body of a light-absorbing material. The surface of the carrier body may form the light-absorbing surface 10402*s* (e.g., absorbing light in the infra-red wavelength range, for example from about 700 nm to about 5000 nm, for example from about 860 nm to about 2000 nm). Additionally or alternatively, the carrier 10402 may include a light-absorbing layer (at least partially) over the carrier body (e.g., deposited over the carrier body, painted over the carrier body, etc.). The light-absorbing layer may form (at least partially) the light-absorbing surface 10402*s*.

The plurality of optical components may include a mirror structure. The mirror structure may include one or more mirrors 10404 (e.g., at least one mirror 10404 as shown, for example, in FIG. 104A or a plurality of mirrors 10404 as shown, for example, in FIG. 104B). The one or more mirrors 10404 may be disposed on the light-absorbing surface 10402*s* of the carrier 10402. The mirror structure (e.g., the one or more mirrors 10404) may partially cover the light-absorbing surface 10402*s*. Illustratively, the mirror structure may be disposed such that at least a portion (e.g., a certain percentage of a total area) of the light-absorbing surface 10402*s* is free from the mirror structure. This may enable the absorbing of the ambient light 10408 (e.g., impinging onto the light-absorbing surface 10402*s*). By way of example, the mirror structure may cover a portion of about 60% (e.g., at maximum 60%, e.g., less than 60%) of the light-absorbing surface 10402*s* (e.g., the 60% of a surface area of the light-absorbing surface 10402*s*), for example of about 50%, for example of about 40%, for example of about 30%, for example of about 20%, for example of about 10%.

The one or more mirrors 10404 (e.g., a reflecting surface of the one or more mirrors 10404) may extend into a first (e.g., lateral) direction (e.g., the one or more mirrors 10404 may have a certain width). The one or more mirrors 10404 may extend into a second (e.g., lateral) direction (e.g., the one or more mirrors 10404 may have a certain height), different from the first direction. The one or more mirrors 10404 may extend by a predefined amount of a total extension along the direction of the LIDAR light emitted from the LIDAR system 10300 (e.g., in a direction perpendicular to the light beam scanning direction, e.g. along the direction 10356). The total extension may be the sum of the extension in the first direction and the extension in the second direction (e.g., the sum of the width and the height of a mirror 10404). The one or more mirrors 10404 may extend by a predefined percentage of the total extension (e.g., by a fraction of the total extension) along the direction of the emitted light line 10314 (e.g., perpendicular to the direction 10354 along which the emitted light line 10314 is scanned). Illustratively, such percentage may be or may represent a ratio between the height and the width of a mirror 10404. By way of example, the one or more mirrors 10404 may extend at least about 50% along the light-absorbing surface 10402*s* of the carrier 10404 in a direction substantially perpendicular to the light beam scanning direction of the LIDAR system 10300, for example at least about 60%, for example at least about 70%, for example at least about 75%, for example at least about 80%.

The one or more mirrors 10404 may be configured (e.g., disposed and/or oriented) to direct light towards the sensor 52 (e.g., the LIDAR light 10406). The mirror structure and the sensor 52 may be positioned relative to each other. The mirror structure and the sensor 52 may be configured (e.g., disposed and/or oriented) such that the one or more mirrors 10404 may reflect light 10406 impinging onto the one or more mirrors 10404 towards the sensor 52 (e.g., towards the sensor pixels).

The optical device 10302 may include one or more elements for directing the movement of the optical components (for example, of the one or more mirrors 10404). The carrier 10402 may include one or more tracks 10410 (e.g., on the light-absorbing surface 10402*s*). The optical components of the optical device 10302 may be movably mounted on the one or more tracks 10410. Illustratively, the optical components may be moved along the one or more tracks 10410. By way of example, the one or more tracks 10410 may be mirror tracks, and the one or more mirrors 10404 of the mirror structure may be movably mounted on the mirror tracks 10410.

The one or more tracks 10410 may be oriented (e.g., they may extend) along a first direction and/or along a second direction (e.g., perpendicular to the first direction). By way of example, the one or more tracks 10410 may be oriented substantially parallel to the beam scanning direction of the LIDAR system 10300 (e.g., substantially parallel to the direction 10354). Additionally or alternatively, the one or more tracks 10410 may be oriented substantially perpendicular to the beam scanning direction of the LIDAR system 10300 (e.g., substantially parallel to the direction 10356). Illustratively, a first track may be oriented along the first direction and a second track may be oriented along the second direction.

The one or more tracks 10410 may include or may consist of a light-absorbing material. Additionally or alternatively, the one or more tracks 10410 may be covered with a light-absorbing layer. Thus, also ambient light 10408 impinging onto one or more tracks 10410 may be absorbed (e.g., not directed or reflected towards the sensor 52). Illustratively, the one or more tracks 10410 may be considered part of the light-absorbing surface 10402*s* of the carrier 10402.

The optical device 10302 may include one or more elements for implementing the movement of the optical components (for example, of the one or more mirrors 10404). The optical device 10302 may include one or more actors (e.g., one or more piezo actors). The one or more actors may be configured to move the one or more optical components. As an example, the one or more actors may be configured to move the one or more mirrors 10404 of the mirror structure.

The sensor controller 53 may be configured to control the movement of the one or more mirrors 10404 of the mirror structure. The movement of the one or more mirrors 10404 may be continuous. By way of example, the one or more mirrors 10404 and/or the sensor controller 53 may be configured such that in operation the one or more mirrors 10404 do not reside in a same position (e.g., in a same position along the direction of movement, e.g. along the direction 10354 or the direction 10356) for more than 500 ns or for more than 1 ms. The movement of the one or more mirrors 10404 may also occur step-wise. By way of example, the sensor controller 53 may be configured to control the movement of the one or more mirrors 10404 such that the one or more mirrors 10404 move for a first period of time, and reside in a certain position for a second period of time.

The movement of the one or more mirrors 10404 may be linear (e.g., along a linear trajectory). By way of example the one or more mirrors 10404 may be configured to move in linear trajectory along one or more tracks 10410 (e.g., along one or more mirror tracks 10410 oriented along the horizontal direction and/or along one or more mirror tracks 10410 oriented along the vertical direction). The movement of the one or more mirrors 10404 may be rotational (e.g., around an axis of rotation). By way of example, the one or more mirrors 10404 may be configured to rotate (or oscillate, e.g. back and forth) around one or more tracks 10410 (e.g., around one track 10410 oriented along the horizontal direction and/or along one track 10410 oriented along the vertical direction).

The sensor controller 53 may be configured to control the movement of the one or more mirrors 10404 (e.g., the continuous movement, such as the linear continuous movement and/or the rotational continuous movement) in accordance with the scanning movement of the beam steering unit 10310 of the LIDAR system 10300. Additionally or alternatively, the sensor controller 53 may be configured to control the movement of the one or more mirrors 10404 in accordance with the light source 42 of the LIDAR system 10300 (e.g., in accordance with the generation of the light beam 10308 by the light source 42). This may offer the effect that the movement of the one or more mirrors 10404 may be controlled such that the one or more mirrors 10404 may be in a position (and/or at an orientation) to receive the reflected LIDAR light 10406.

By way of example, the sensor controller 53 may be configured to control the movement of the one or more mirrors 10404 in synchronization with the scanning movement of the beam steering unit 10310. By way of example, in synchronization with the scanning movement of a scanning mirror of the LIDAR system 10300. Illustratively, the sensor controller 53 may be configured to control the movement of the one or more mirrors 10404 such that the movement of the mirrors 10404 (e.g., the trajectory, for example a linear trajectory) may follow a same (or similar) temporal evolution as the movement of a scanning mirror of the LIDAR system 10300. By way of example, the movement of the one or more mirrors 10404 may have a sinusoidal character.

Additionally or alternatively, the sensor controller 53 may be configured to control the movement of the one or more mirrors 10404 in synchronization with the light source 42 (e.g., in synchronization with the generation of the light beam 10308 by the light source 42). By way of example, the light source 42 may emit light (e.g., the light beam 10308) in a pulsed manner. The sensor controller 53 may be configured to synchronize the movement of the one or more mirrors 10404 with the pulse rate of the light source 42 (e.g., to control the movement of the one or more mirrors 10404 based on the pulse rate of the light source 42).

The sensor controller 53 may be configured to control the movement (e.g., the continuous movement, such as the linear continuous movement and/or the rotational continuous movement) of the one or more mirrors 10404 by a predefined displacement. The predefined displacement may be in a range selected based on the field of view 10306 of the LIDAR system 10300. Illustratively, the displacement range may be selected based on the range scanned by the beam steering unit 10310 (e.g., based on a displacement of a scanning mirror of the LIDAR system 10300). By way of example the displacement may be in the range from about 0.1 mm to about 5 mm, for example from about 0.5 mm to about 3 mm.

As shown, for example, in FIG. 104B the mirror structure may include a plurality of mirrors 10404 (e.g., the one or more mirrors 10404 may be a plurality of mirrors 10404).

The mirrors 10404 of the plurality of mirrors 10404 may be configured such that they are movable independent from each other. By way of example, the mirrors 10404 of the plurality of mirrors 10404 may be arranged on respective (e.g., separate) mirror tracks 10410. This configuration may offer the effect that only one mirror 10404 (or only a subset of mirrors 10404) of the plurality of mirrors 10404 may be moved, illustratively, only the mirror(s) 10404 relevant for the detection of LIDAR light. This way, the mass (e.g., the mirror mass) that is moved may be reduced, thus reducing the energy consumption of the optical device 10302.

The mirrors 10404 of the plurality of mirrors 10404 may have all the same shape and/or the same dimensions. Alternatively, the mirrors 10404 of the plurality of mirrors 10404 may have different shapes and/or dimensions. By way of example, a first mirror 10404 may have a surface curved in a first manner (e.g., elliptical) and a second mirror 10404 may have a surface curved in a second manner (e.g., parabolic), different from the first manner. By way of example, a first mirror 10404 may have a first height and/or width (e.g., 5 mm), and a second mirror may have a second height and/or width (e.g., 3 mm or 7 mm), different from the first height and/or width (e.g., smaller or greater than the first height and/or width).

The sensor controller 53 may be configured to individually control the movement of the mirrors 10404 of the plurality of mirrors 10404. The sensor controller 53 may be configured to control the mirrors 10404 of the plurality of mirrors 10404 to be moved at the same frequency (for example, 1 kHz or 5 kHz). The sensor controller 53 may be configured to control the mirrors 10404 of the plurality of mirrors 10404 with a predefined displacement (e.g., at the same frequency but with a predefined displacement). The predefined displacement may be along the direction of movement. Alternatively, the sensor controller 53 may be configured to control the mirrors 10404 of the plurality of mirrors 10404 to be moved at different frequencies. A first mirror 10404 may be moved at a first frequency and a second mirror 10404 may be moved at a second frequency. The second frequency may be equal to the first frequency, or the second frequency may be different from the first frequency (e.g., smaller or greater than the first frequency). As an example, a ratio between the first frequency and the second frequency may be an integer number (e.g., 1, 2, 3, etc.). The ratio may also be a non integer number (e.g., 0.5, 1.5, 2.8, 3.7, etc.).

The extent of the displacement may be fixed or it may be adapted (e.g., selected) in accordance with the light emission (e.g., in accordance with the emitted light 10312). The extent of the displacement may be adapted in accordance (e.g., in synchronization) with the light source 42 and/or with the beam steering unit 10310. As an example, the extent of the displacement may be adapted in accordance with the activation of one or more light sources 42 (e.g., with the activation of one or more laser sources). As illustrated in FIG. 104B, the sensor controller 53 may be configured to control one or more first mirrors 10404 of the plurality of mirrors 10404 in accordance with the generation of a first emitted light (e.g., with the generation of a first laser pulse, e.g. with the activation of a first laser source). The sensor controller 53 may be configured to adapt the extent of the displacement of the one or more first mirrors 10404 in accordance with the generation of the first emitted light. Such one or more first mirrors 10404 may be configured (e.g., controlled) to receive the reflected first emitted light **10406*a* (e.g., the reflected first LIDAR light 10406*a*). The sensor controller 53 may be configured to control one or more second mirrors 10404 of the plurality of mirrors 10404 in accordance with the generation of a second emitted light (e.g., with the activation of a second laser source). The sensor controller 53 may be configured to adapt the extent of the displacement of the one or more second mirrors 10404 in accordance with the generation of the second emitted light. Such one or more second mirrors 10404 may be configured (e.g., controlled) to receive the reflected second emitted light 10406*b* (e.g., the reflected second LIDAR light 10406*b***).

By way of example, the extent of the displacement may be adapted in accordance with a time displacement (e.g., a time difference) between the emitted lights (e.g., between the activation of the laser sources). The second emitted light may be emitted after the first emitted light (e.g., the second laser source may be activated at a later time point). As another example, the extent of the displacement may be adapted in accordance with a spatial displacement between the emitted lights. The first light source (e.g., the first laser source) may have a first orientation with respect to the beam steering unit 10310. The second light source (e.g., the second laser source) may have a second orientation with respect to the beam steering unit 10310. The first orientation may be different from the second orientation, so that the first emitted light may be reflected in a different direction with respect to the second emitted light (e.g., the first emitted light may be directed towards a different region of the field of view 10306 with respect to the second emitted light).

The optical device 10302 may optionally include one or more optical elements 10412 (e.g., one or more lenses) disposed between the carrier 10402 and the sensor 52. The one or more optical elements 10412 may be configured to focus or collimate onto the sensor 52 the light directed towards the sensor 52 (e.g., from the mirror structure).

FIG. 105A shows an optical device 10302 in a schematic view in accordance with various embodiments.

FIG. 105B and FIG. 105C each show a part of a system 10300 including an optical device 10302 in a schematic view in accordance with various embodiments.

Alternatively or additionally to the mirror structure, the carrier 10402 may include one or more reflecting surfaces 10502. One or more portions of a surface of the carrier 10402 may be configured to reflect light (e.g., towards the sensor 52). One or more portions of the light-absorbing surface 10402*s* may be configured to reflect light. Illustratively, any portion of the carrier 10402 (e.g., of the surface 10402*s* of the carrier 10402) which is not configured to absorb light may be configured to reflect light. The one or more reflecting surfaces 10502 may be configured to reflect light in a predefined wavelength range. As an example, the one or more reflecting surfaces 10502 may be configured to reflect light in the infra-red range (and/or in the near infra-red range). The one or more reflecting surfaces 10502 may extend along a direction substantially perpendicular to the scanning direction of the beam steering unit 10310 (e.g., along the vertical direction).

The optical device 10302 may include one or more reflecting strips disposed on the carrier 10402 (e.g., the one or more reflecting surfaces 10502 may be one or more reflecting strips). One or more reflecting strips may be disposed on the carrier 10402 such that one or more portions of the surface (e.g., of the light-absorbing surface 10402*s*) of the carrier 10402 may be reflecting.

The one or more reflecting surfaces 10502 may be disposed on the carrier 10402 such that at least a portion of the surface (or of each side surface) of the carrier 10402 may be light-absorbent. By way of example, the one or more reflecting surfaces 10502 may extend over the 10% of the surface (e.g., of each side surface) of the carrier 10402, for example over the 30%, for example over the 50%. A light-reflecting surface may have a first lateral dimension (e.g., a width) in the range from about 0.1 mm to about 2 mm, for example from about 0.25 mm to about 1 mm. A light-reflecting surface may have a second lateral dimension (e.g., a length or a height) in the to range from about 5 mm to about 30 mm, for example from about 10 mm to about 20 mm.

By way of example, the carrier 10402 may have a cylindrical shape (as shown, for example, in FIG. 105A). The outer surface of the cylinder may be configured to absorb light. One or more portions 10502 of the is outer surface may be configured to reflect light. As another example, the carrier 10402 may have a prism shape (as shown, for example, in FIG. 105B and FIG. 105C). One or more of the side surfaces of the prism may be configured to absorb light. One or more of the side surfaces (or one or more portions of the side surfaces) of the prism may be configured to reflect light. By way of example, the one or more reflecting surfaces 10502 may be arranged on one or more side surfaces (e.g., on one or more portions of the side surfaces), which would otherwise be light-absorbing. As an example, each side surface may include at least one reflecting surface 10502.

The carrier 10402 may be configured to rotate. The carrier 10402 may be movably arranged around an axis of rotation 10504. The axis of rotation 10504 may be perpendicular to the scanning direction of the LIDAR system 10300 (e.g., the axis of rotation 10504 may be lying in the direction 10356, e.g., the vertical direction). By way of example, the carrier 10402 may be mounted on a support and/or on a frame that is configured to rotate.

The sensor controller 53 may be configured to control a rotational (e.g. continuous) movement of the carrier 10402. This way, at least one of the one or more reflecting surfaces 10502 may be in a position to reflect light (e.g., the LIDAR light 10406) towards the sensor 52. Moreover, the ambient light 10408 may be impinging onto a light-absorbing surface 10402*s* of the carrier 10402 (e.g., onto a portion of the surface not configured to reflect light). The sensor controller 53 may be configured to control the rotational movement of the carrier 10402 in a same or similar manner as described above for the one or more mirrors 10404. By way of example, the sensor controller 53 may be configured to control the rotational movement of the carrier 10402, in accordance (e.g., in synchronization) with a scanning movement of the beam steering unit 10310 and/or with the generation of the light beam 10308 by the light source 42.

FIG. 105D shows a part of a system 10300 including an optical device 10302 in a schematic view in accordance with various embodiments.

FIG. 105E and FIG. 105F show each a part of an optical device 10302 in a schematic view in accordance with various embodiments.

The optical device 10302 may also include a plurality of carriers 10402 (e.g., two, five, ten, or more than ten carriers 10402), as illustrated, for example, in FIG. 105D. Additionally or alternatively, the carrier 10402 may be split into a plurality of carrier portions (as illustrated, for example, in FIG. 105E and FIG. 105F). At least a portion of the surface of each carrier 10402 and/or at least a portion of the surface of each carrier portion may be configured to reflect light. At least a portion of the surface of each carrier 10402 and/or at least a portion of the surface of each carrier portion may be configured to absorb light.

This configuration may offer the effect of a finer control over the operation of the optical device 10302. Illustratively, the sensor controller 53 may individually control the movement of the carrier(s) 10402 and/or the carrier portion(s) relevant for directing light towards the sensor 52 based on the emitted LIDAR light 10312. This may provide a more energy efficient operation of the optical device 10302.

The carriers 10402 of the plurality of carriers 10402 may be arranged in a regular pattern. By way of example, the carriers 10402 may form a line of carriers 10402 (as illustrated, for example, in FIG. 105D), e.g., the carriers 10402 may be disposed next to each other along a direction parallel to the scanning direction of the beam steering unit 10310. The carriers 10402 of the plurality of carriers 10402 may also be arranged at an angle with respect to one another (e.g., the carriers 10402 may not or not all be disposed along a same line).

The carriers 10402 of the plurality of carriers 10402 and/or the portions of the plurality of carrier portions may be configured to move (e.g., to rotate) independent from each other. The sensor controller 53 may be configured to control the carriers 10402 of the plurality of carriers 10402 and/or the portions of the plurality of carrier portions to be moved at the same frequency or to be moved at different frequencies.

The axis of rotation of the carriers 10402 of the plurality of carriers 10402 may be oriented along a direction perpendicular to the scanning direction of the beam steering unit 10310. The carriers 10402 of the plurality of carriers 10402 may be arranged such that the light 10406 reflected towards the system may impinge (e.g., sequentially) onto the carriers 10402, depending on the direction into which the light 10312 is emitted (e.g., in accordance with an emission angle of the emitted light 10312). The carriers 10402 of the plurality of carriers 10402 may thus be configured (e.g., arranged) to receive the reflected LIDAR light 10406 in accordance with an emission angle of the emitted light 10312. Illustratively, the reflected light 10406 may impinge on a (e.g., different) carrier 10402 depending on the direction from which the reflected light 10406 is coming (e.g., from the position in the field of view 10306 from which the light 10406 is reflected). By way of example, the reflected light 10406 may impinge onto a first carrier 10402 at a first time point, onto a second carrier 10402 at a second time point, subsequent to the first time point, onto a third carrier 10402 at a third time point, subsequent to the second time point, etc. In the exemplary configuration shown in FIG. 105D, the reflected light 10406 may move from the topmost carrier 10402 to the lowermost carrier 10402 during the scanning, and then move back to the topmost carrier 10402.

FIG. 106A and FIG. 106B show each a part of an optical device 10302 in a schematic view in accordance with various embodiments. FIG. 106A shows a front view of a carrier 10402. FIG. 106B shows a top view of the carrier 10402.

The carrier 10402 may be or may be configured as a band-like carrier. The band-like carrier 10402 may extend along a direction is substantially parallel to the scanning direction of the beam steering unit 10310 (e.g., along the horizontal direction). Illustratively, the band-like carrier 10402 may have a lateral dimension along the (e.g., horizontal) direction 10354 greater than a lateral dimension along the (e.g., vertical) direction 10356.

The band-like carrier 10402 may include one or more reflecting surfaces 10502 (e.g., one or more reflecting strips). One or more portions of the (e.g., light-absorbing) surface **10402*s* of the band-like carrier 10402 may be configured to reflect light (e.g., towards the sensor 52). The one or more reflecting surfaces 10502 may extend along a direction substantially perpendicular to the scanning direction of the beam steering unit 10310 (e.g., along the vertical direction). The one or more reflecting surfaces 10502 may have a lateral dimension along the (e.g., vertical) direction 10356 greater than a lateral dimension along the (e.g., horizontal) direction 10354. Illustratively, the one or more reflecting surfaces 10502 may extend along the height (e.g., the entire height) of the band-like carrier 10402**.

The carrier 10402 may be configured to move (e.g., to continuously move along one direction or to oscillate back and forth) along the direction substantially parallel to the scanning direction of the beam steering unit 10310 (e.g., the carrier 10402 may be configured to move along the direction 10354, e.g. the horizontal direction). This way the one or more reflecting surfaces 10502 may be in a position to reflect light (e.g., the LIDAR light 10406) towards the sensor 52. The ambient light may be absorbed on the light-absorbing portions of the surface **10402*s* of the band-like carrier 10402**.

The carrier 10402 may be mounted on a (e.g., holding) frame that enables the movement of the carrier 10402. By way of example, the frame may include one or more rotating components 10602 (e.g., one or more rollers). The one or more rotating components 10602 may be configured to rotate. The rotation of the one or more rotating components 10602 (e.g., in the clockwise or counter-clockwise direction) may define the (e.g., linear) movement of the carrier 10402 along the horizontal direction.

Illustratively, the carrier 10402 may be configured as a conveyor belt, continuously moving around the one or more rollers 10602. The carrier 10402 may include or may be configured as a (e.g., thin) film or layer. The sensor controller 53 may be configured to control the rollers 10602 such that the film continuously moves around the rollers 10602 (as schematically illustrated by the arrows in FIG. 106B). As an example, a portion of the carrier surface (e.g., a portion of the light-absorbing surface **10402*s* or a reflecting surface 10502) may move along a linear trajectory on a first side of the carrier 10402. The surface portion may then move around a first roller 10602, e.g., towards a second side of the carrier 10402 (e.g., opposite to the first side). The surface portion may then move along a linear trajectory on a second side of the carrier 10402. The surface portion may then move around a second roller 10602 and go back to the first side of the carrier 10402**.

The sensor controller 53 may be configured to control the linear (e.g., continuous) movement of the carrier 10402 in a same or similar manner as described above for the one or more mirrors 10404 and/or for the rotational movement of the carrier 10402. By way of example, the sensor controller 53 may be configured to control the linear movement of the carrier 10402, in accordance (e.g., in synchronization) with a scanning movement of the beam steering unit 10310 and/or with the generation of the light beam 10308 by the light source 42.

FIG. 107 shows a sensor device 10702 in a schematic view in accordance with various embodiments.

The sensor 52 may be disposed on the carrier 10402. The to sensor 52 may include one or more sensor pixels 10704 mounted on the carrier 10402. The one or more sensor pixels 10704 may be mounted on the light-absorbing surface **10402*s* of the carrier 10402. In this configuration, the optical device 10302 may be referred to as sensor device 10702. The carrier 10402 may be configured in any of the configurations described above, for is example in relation to FIG. 104A to FIG. 106**B.

Illustratively, the one or more sensor pixels 10704 may be disposed on the carrier 10402 in a similar manner as the one or more mirrors 10404 of the mirror structure. The one or more sensor pixels 10704 may be (e.g., movably) mounted on the one or more tacks 10410 of the carrier 10402. The movement of the one or more sensor pixels 10704 may be linear (e.g., along a linear trajectory). By way of example the one or more sensor pixels 10704 may be configured to move in linear trajectory along one or more tracks 10410 (e.g., along one or more tracks 10410 oriented along the horizontal direction 10354 and/or along one or more tracks 10410 oriented along the vertical direction 10356). The movement of the one or more sensor pixels 10704 may be rotational (e.g., around an axis of rotation). By way of example, the one or more sensor pixels 10704 may be configured to rotate (or oscillate, e.g. back and forth) around one or more tracks 10410 (e.g., around one track 10410 oriented along the horizontal direction 10354 and/or along one track 10410 oriented along the vertical direction 10356). One or more actors (e.g., piezo actors) of the sensor device 10702 may be configured to move the one or more sensor pixels 10704 of the sensor 52.

The sensor 52 (e.g., the one or more sensor pixels 10704) may partially cover the light-absorbing surface 10402*s*. Illustratively, the sensor 52 may be disposed such that at least a portion (e.g., a certain percentage of a total area) of the light-absorbing surface 10402*s* is free from the sensor pixels 10704. By way of example, the sensor 52 may cover a portion of about 60% (e.g., at maximum 60%, e.g., less than 60%) of the light-absorbing surface 10402*s* (e.g., the 60% of a surface area of the light-absorbing surface 10402*s*), for example of about 50%, for example of about 40%, for example of about 30%, for example of about 20%, for example of about 10%.

The sensor 52 may extend along a predefined direction along the light-absorbing surface 10402*s* of the carrier 10402. Illustratively, the one or more sensor pixels 10704 may be disposed along a predefined direction along the light-absorbing surface 10402*s* of the carrier 10402. The one or more pixels 10704 may extend along the light-absorbing surface 10402*s* of the carrier 10402 in a direction substantially perpendicular to the scanning direction of the LIDAR system 10300. Illustratively, the one or more sensor pixels 10704 may be disposed as a column of pixels along the vertical direction. By way of example, the one or more sensor pixels 10704 may extend at least about the 50% along the light-absorbing surface 10402*s* of the carrier 10404 in a direction substantially perpendicular to the light beam scanning direction of the LIDAR system 10300, for example at least about 60%, for example at least about 70%, for example at least about 75%, for example at least about 80%.

The one or more sensor pixels 10704 may extend along a direction perpendicular to the scanning direction of the LIDAR system 10300 (e.g., in a direction along which the emitted light 10312 extends). By way of example, the one or more sensor pixels 10704 may have a dimension (e.g., a height or a length) along a direction perpendicular to the scanning direction greater than a dimension (e.g., a width) along a direction parallel to the scanning direction. The one or more sensor pixels 10704 may be arranged such that the one or more sensor pixels 10704 cover substantially the entire light-absorbing surface 10402*s* of the carrier 10402 in the direction perpendicular to the scanning direction. Illustratively, the one or more sensor pixels 10704 may be arranged such that substantially all the LIDAR light arriving onto the sensor 52 may be captured. By way of example, the one or more sensor pixels 10704 may be arranged such that a distance between adjacent sensor pixels 10704 in the direction perpendicular to the scanning direction is less than 1 mm, for example less than 0.5 mm, for example less than 0.1 mm (e.g., such that substantially no gap is present between adjacent sensor pixels 10704 along that direction). The dimension of the one or more sensor pixels 10704 along the direction parallel to the scanning direction may be selected to minimize the amount of ambient light 10408 received by the one or more sensor pixels 10704. Illustratively, the dimension of the one or more sensor pixels 10704 along that direction may be slightly greater (e.g., 2% greater or 5% greater) than the dimension of the emitted line in that direction. By way of example, the width of the one or more sensor pixels 10704 may be selected to be slightly greater than the width of the emitted vertical line 10314.

The one or more sensor pixels 10704 may be configured to receive light from the LIDAR system 10300 (e.g., from the optics arrangement 10304 of the LIDAR system 10300). The movement of the one or more sensor pixels 10704 may be controlled such that at least one (or many, or all) sensor pixel 10704 may be in a position to receive the LIDAR light 10406. The movement of the one or more sensor pixels 10704 may be controlled such that the ambient light 10408 does not impinge on a sensor pixel 10704 (but rather on the light-absorbing surface 10402*s* of the carrier 10402).

The one or more sensor pixels 10704 may be movably configured in a similar manner as the one or more mirrors 10404. The sensor controller 53 may be configured to control the (e.g., continuous) movement of the one or more sensor pixels 10704 in a same or similar manner as described above for the one or more mirrors 10404. The movement of the one or more sensor pixels 10704 may be continuous. By way of example, the one or more sensor pixels 10704 and/or the sensor controller 53 may be configured such that in operation the one or more sensor pixels 10704 do not reside in a same position (e.g., in a same position along the direction of movement, e.g. along the direction 10354 or the direction 10356) for more than 500 ns or for more than 1 ms. The movement of the one or more sensor pixels 10704 may also occur step-wise. The sensor controller 53 may be configured to control the movement of the one or more sensor pixels 10704 by a predefined displacement. By way of example the displacement may be in the range from about 0.1 mm to about 5 mm, for example from about 0.5 mm to about 3 mm.

The sensor controller 53 may be configured to control the movement (e.g., the continuous movement, such as the linear continuous movement and/or the rotational continuous movement) of the one or more sensor pixels 10704 in accordance (e.g., in synchronization) with a scanning movement of the beam steering unit 10310 of the LIDAR system 10300. Additionally or alternatively, the sensor controller 53 may be configured to control the movement of the one or more sensor pixels 10704 in accordance (e.g., in synchronization) with the generation of the light beam 10308 by the light source 42 of the LIDAR system 10300.

In the case that the sensor 52 includes a plurality of sensor pixels 10704 (e.g., two, five, ten, fifty, or more than fifty sensor pixels 10704), the sensor pixels 10704 may be configured to be movable independent from each other. The sensor controller 53 may be configured to individually control the movement of the sensor pixels 10704 of the plurality of sensor pixels 107044. The sensor controller 53 may be configured to control the sensor pixels 10704 to be moved at the same frequency (for example, 1 kHz or 5 kHz). Alternatively, the sensor controller 53 may be configured to control the sensor pixels 10704 to be moved at different frequencies. A first sensor pixel 10704 may be moved at a first frequency and a second sensor pixel 10704 may be moved at a second frequency. The second frequency may be equal to the first frequency, or the second frequency may be different from the first frequency (e.g., smaller or greater than the first frequency). As an example, a ratio between the first frequency and the second frequency may be an integer number (e.g., 1, 2, 3, etc.). The ratio may also be a non integer number (e.g., 0.5, 1.5, 2.8, 3.7, etc.).

In the following, various aspects of this disclosure will be illustrated:

Example 1p is an optical device for a LIDAR Sensor System. The optical device may include a carrier having a light-absorbing surface for light in a predefined wavelength range and a plurality of optical components. The plurality of optical components may include a mirror structure including one or more mirrors on the light-absorbing surface of the carrier and/or a sensor including one or more sensor pixels. The optical device may further include a sensor controller configured to control a continuous movement of one or more optical components from the plurality of optical components in accordance with a scanning movement of a beam steering unit of the LIDAR Sensor System.

In Example 2p, the subject matter of Example 1p can optionally include that the sensor controller is further configured to control the continuous movement of one or more optical components from the plurality of optical components in synchronization with the scanning movement of the beam steering unit of the LIDAR Sensor System.

In Example 3p, the subject matter of any one of Examples 1p or 2p can optionally include that the sensor controller is further configured to control the continuous movement of one or more optical components from the plurality of optical components in synchronization with a generation of a light beam by a light source of the LIDAR Sensor System.

In Example 4p, the subject matter of any one of Examples 1p to 3p can optionally include that the plurality of optical components includes a mirror structure including one or more mirrors on the light-absorbing surface of the carrier, and a sensor including one or more sensor pixels. The sensor and the mirror structure may be positioned relative to each other and may be configured such that the one or more mirrors reflect light impinging thereon towards the one or more sensor pixels of the sensor.

In Example 5p, the subject matter of Example 4p can optionally include that the sensor controller is configured to control the continuous is movement of the one or more mirrors of the mirror structure in synchronization with a scanning movement of a scanning mirror of the LIDAR Sensor System and in synchronization with a generation of a light beam by a light source of the LIDAR Sensor System.

In Example 6p, the subject matter of Example 5p can optionally include that the sensor controller is configured to control a linear continuous movement of the one or more mirrors of the mirror structure in synchronization with a scanning movement of a scanning mirror of the LIDAR Sensor System and in synchronization with a generation of a light beam by a light source of the LIDAR Sensor System.

In Example 7p, the subject matter of Example 6p can optionally include that the sensor controller is configured to control the linear continuous movement of the one or more mirrors of the mirror structure by a displacement in the range from about 0.5 mm to about 3 mm.

In Example 8p, the subject matter of any one of Examples 5p to 7p can optionally include that the carrier includes mirror tracks in on which the one or more mirrors of the mirror structure are movably mounted. The mirror tracks may be oriented substantially parallel to the light beam scanning direction of the LIDAR Sensor System.

In Example 9p, the subject matter of Example 1p can optionally include that the sensor controller is configured to control a rotational continuous movement of the one or more optical components of the plurality of optical components in accordance with a scanning movement of the beam steering unit of the LIDAR Sensor System.

In Example 10p, the subject matter of Example 9p can optionally include that the sensor controller is further configured to control the rotational continuous movement of one or more optical components from the plurality of optical components in synchronization with the scanning movement of the beam steering unit of the LIDAR Sensor System.

In Example 11p, the subject matter of any one of Examples 9p or 10p can optionally include that the sensor controller is further configured to control the rotational continuous movement of one or more optical components from the plurality of optical components in synchronization with a generation of a light beam by a light source of the LIDAR Sensor System.

In Example 12p, the subject matter of Example 1p can optionally include that the carrier is a band-like carrier.

In Example 13p, the subject matter of any one of Examples 1p to 12p can optionally include that the plurality of optical components includes a mirror structure including one or more mirrors on the light-absorbing surface of the carrier. The mirror structure may cover at maximum a portion of about 60% of the light-absorbing surface of the carrier, optionally at maximum a portion of about 50%, optionally at maximum a portion of about 40%, optionally at maximum a portion of about 30%, optionally at maximum a portion of about 20%, optionally at maximum a portion of about 10%.

In Example 14p, the subject matter of any one of Examples 1p to 13p can optionally include that the plurality of optical components includes a mirror structure including one or more mirrors on the light-absorbing surface of the carrier. The one or more mirrors of the mirror structure may extend at least about 50% along the light-absorbing surface of the carrier in a direction substantially perpendicular to a light beam scanning direction of the LIDAR Sensor System, optionally at least about 60%, optionally at least about 70%, optionally at least about 75%, optionally at least about 80%.

In Example 15p, the subject matter of any one of Examples 1p to 14p can optionally include that the plurality of optical components includes a mirror structure including one or more mirrors on the light-absorbing surface of the carrier. The mirror structure may include a plurality of mirrors which are movable independent from each other.

In Example 16p, the subject matter of Example 15p can optionally include that the sensor controller is configured to control the mirrors of the plurality of mirrors to be moved at the same frequency.

In Example 17p, the subject matter of Example 15p can optionally include that the sensor controller is configured to control the mirrors of the plurality of mirrors to be moved at different frequencies.

In Example 18p, the subject matter of any one of Examples 1p to 17p can optionally include that the plurality of optical components includes a mirror structure including one or more mirrors on the light-absorbing surface of the carrier. The optical device may further include one or more piezo actors configured to move the one or more mirrors of the mirror structure.

In Example 19p, the subject matter of any one of Examples 1p to 18p can optionally include that the carrier further includes a light-reflecting surface. The light-reflecting surface may have a width in the range from about 0.25 mm to about 1 mm and a length in the range from about 10 mm to about 20 mm.

In Example 20p, the subject matter of any one of Examples 1p to 19p can optionally include that the carrier includes a carrier body and a light-absorbing layer over the carrier body forming the light-absorbing surface.

In Example 21p, the subject matter of any one of Examples 1p to 19p can optionally include that the carrier includes a carrier body of a light-absorbing material, the surface of which forms the light-absorbing surface.

In Example 22p, the subject matter of any one of Examples 1p to 21p can optionally include that the predefined wavelength range is infra-red wavelength range.

In Example 23p, the subject matter of Example 22p can optionally include that the infra-red wavelength range is a wavelength range from about 860 nm to about 2000 nm.

Example 24p is a sensor device for a LIDAR Sensor System. The sensor device may include a carrier having a light-absorbing surface for light in a predefined wavelength range. The sensor device may include a sensor including one or more sensor pixels mounted on the light-absorbing surface of the carrier. The one or more sensor pixels may be configured to receive light received by the LIDAR Sensor System. The sensor device may include a sensor controller configured to control a continuous movement of the one or more sensor pixels of the sensor in accordance with a scanning movement of a beam steering unit of the LIDAR Sensor System.

In Example 25p, the subject-matter of Example 24p can optionally include that the sensor controller is further configured to control the continuous movement of the one or more sensor pixels of the sensor in synchronization with a scanning movement of the beam steering unit of the LIDAR Sensor System.

In Example 26p, the subject-matter of any one of Examples 24p or 25p can optionally include that the sensor controller is further configured to control the continuous movement of the one or more sensor pixels of the sensor in synchronization with a generation of a light beam by a light source of the LIDAR Sensor System.

In Example 27p, the subject-matter of any one of Examples 24p to 26p can optionally include that the sensor controller is further configured to control a continuous movement of the one or more sensor pixels of the sensor in synchronization with a scanning movement of the beam steering unit of the LIDAR Sensor System and in synchronization with a generation of a light beam by a light source of the LIDAR Sensor System.

In Example 28p, the subject-matter of Example 27p can optionally include that the sensor controller is configured to control a linear continuous movement of the one or more sensor pixels of the sensor in synchronization with a scanning movement of the beam steering unit of the LIDAR Sensor System and in synchronization with a generation of a light beam by a light source of the LIDAR Sensor System.

In Example 29p, the subject-matter of Example 28p can optionally include that the sensor controller is configured to control the linear continuous movement of the one or more sensor pixels of the sensor by a displacement in the range from about 0.5 mm to about 3 mm.

In Example 30p, the subject-matter of any one of Examples 24p to 29p can optionally include that the carrier includes tracks on which the one or more sensor pixels of the sensor are movably mounted. The tracks may be oriented substantially parallel to the light beam scanning direction of the LIDAR Sensor System.

In Example 31p, the subject-matter of Example 24p can optionally include that the sensor controller is configured to control a rotational continuous movement of the one or more sensor pixels of the sensor in accordance with a scanning movement of a beam steering unit of the LIDAR Sensor System.

In Example 32p, the subject-matter of Example 31p can optionally include that the sensor controller is configured to control a rotational continuous movement of the one or more sensor pixels of the sensor in synchronization with a scanning movement of the beam steering unit of the LIDAR Sensor System.

In Example 33p, the subject-matter of Example 32p can optionally include that the sensor controller is further configured to control a rotational continuous movement of the one or more sensor pixels of the sensor in synchronization with a generation of a light beam by a light source of the LIDAR Sensor System.

In Example 34p, the subject-matter of Example 24p can optionally include that the carrier is a band-like carrier.

In Example 35p, the subject-matter of any one of Examples 24p to 34p can optionally include that the sensor covers at maximum a portion of about 60% of the light-absorbing surface of the carrier, optionally at maximum a portion of about 50%, optionally at maximum a portion of about 40%, optionally at maximum a portion of about 30%, optionally at maximum a portion of about 20%, optionally at maximum a portion of about 10%.

In Example 36p, the subject-matter of any one of Examples 24p to 35p can optionally include that the one or more sensor pixels of the sensor extend at least about 50% along the light-absorbing surface of the carrier in a direction substantially perpendicular to a light beam scanning direction of the LIDAR Sensor System, optionally at least about 60%, optionally at least about 70%, optionally at least about 75%, optionally at least about 80%.

In Example 37p, the subject-matter of any one of Examples 24p to 36p can optionally include that the sensor includes a plurality of sensor pixels which are movable independent from each other.

In Example 38p, the subject-matter of Example 37p can optionally include that the sensor controller is configured to control the sensor pixels of the plurality of sensor pixels to be moved at the same frequency.

In Example 39p, the subject-matter of Example 37p can optionally include that the sensor controller is configured to control the sensor pixels of the plurality of sensor pixels to be moved at different frequencies.

In Example 40p, the subject-matter of any one of Examples 24p to 39p can optionally include that the sensor device further includes one or more piezo actors configured to move the one or more sensor pixels of the sensor.

In Example 41p, the subject-matter of any one of Examples 24p to 40p can optionally include that the carrier further includes a light-reflecting surface. The light-reflecting surface may have a width in the range from about 0.25 mm to about 1 mm and a length in the range from about 10 mm to about 20 mm.

In Example 42p, the subject-matter of any one of Examples 24p to 41p can optionally include that the carrier includes a carrier body and a light-absorbing layer over the carrier body forming the light-absorbing surface.

In Example 43p, the subject-matter of any one of Examples 24p to 42p can optionally include that the carrier includes a carrier body of a light-absorbing material, the surface of which forms the light-absorbing surface.

In Example 44p, the subject-matter of any one of Examples 24p to 43p can optionally include that the predefined wavelength range is infra-red wavelength range.

In Example 45p, the subject-matter of Example 44p can optionally include that the infra-red wavelength range is a wavelength range from about 860 nm to about 2000 nm.

Example 46 is a LIDAR Sensor System, including: an optical device according to any one of Examples 1p to 23p or a sensor device according to any one of Examples 24p to 45p; and a receiver optics arrangement to collimate received light towards the optical device or towards the sensor device.

In Example 47p, the subject-matter of Example 46p can optionally include that the LIDAR Sensor System further includes a light source configured to generate the light beam.

In Example 48p, the subject-matter of Example 47p can optionally include that the light source is configured as a laser light source.

In Example 49p, the subject-matter of any one of Examples 47p or 48p can optionally include that the light source is configured to generate a plurality of light pulses as the light beam.

In Example 50p, the subject-matter of any one of Examples 47p to 49p can optionally include that the LIDAR Sensor System is configured as a scanning LIDAR Sensor System.

In a conventional LIDAR system, the light detection may be based on a classical optical concept. The field of view of the LIDAR system may be imaged onto a sensor surface (e.g., onto a flat photodetector sensor surface) by means of thick lenses. The lenses may be optical surfaces that require substantial complexity in order to remove aberrations and other undesired optical effects on the sensor surface. Additionally, complex and expensive multi-lens optical systems may be required in view of the unfavorable aspect ratio of sensor arrays commonly employed in a LIDAR system. By way of example, a conventional optical system (e.g., conventional corrective optics) may typically include 4 to 8 (e.g., thick) lenses. A curved sensor may be a possible solution for reducing or removing optical aberrations. However, a curved sensor may be extremely complicated or almost impossible to manufacture with satisfying quality and production yields due to the limitations of the fabrication process (e.g., of the lithographical fabrication process).

Ideally, in a conventional LIDAR system (e.g., in a scanning LIDAR system), where a vertical laser line is emitted to scan the scene (e.g., to scan the field of view of the LIDAR system), only a specific vertical line on the sensor should be detected. The vertical line on the sensor may be provided by the reflection of the emitted light (e.g., the emitted light pulses) from objects within the field of view. Illustratively, only a relevant portion of the sensor should be activated (e.g., the row or column of sensor pixels onto which the light to be detected is impinging). However, a conventional sensor, for example including one or more avalanche photo diodes, may either be completely activated or completely deactivated (e.g., all the sensor pixels may be activated or no sensor pixel may be activated). Consequently, during detection of the LIDAR light, also stray light and background light may be collected and impinge onto the sensor. This may lead to the generation of a noise signal, and to a lower SNR.

In addition, in a conventional LIDAR system the intensity of the collected light may typically be very low. Amplification of the collected light may thus be required. Amplification may be done electrically in the sensor and electronically by means of one or more amplifiers (e.g., one or more analog amplifiers). However, this may lead to a considerable amount of noise being introduced into the signal, and thus to a deterioration of the measurement.

Various aspects of the present application may be directed to improving or substantially eliminating the shortcomings of the LIDAR detection channel(s). The detection channel(s) may also be referred to as receiver path(s). In various embodiments, one or more elements may be provided in a LIDAR system (e.g., in the receiver path of a LIDAR system) and may be configured such that optical aberrations and other undesired optical effects may be reduced or substantially eliminated. In various embodiments, one or more elements may be provided that enable a simplification of the receiver optics (e.g., of a receiver optics arrangement) of the LIDAR system, e.g. a simple and inexpensive lens systems may be provided as receiver optics. One or more elements may be provided that enable a reduction of noise (e.g., of noise signal) in the detection of LIDAR light. The receiver path of the LIDAR system may thus be improved.

The LIDAR system may be a scanning LIDAR system (e.g., a 1D beam scanning LIDAR system or a 2D beam scanning LIDAR system). The emitted light (e.g., an emitted laser spot or an emitted laser line, such as a vertical laser line) may be scanned across the field of view of the LIDAR system. The field of view may be a two-dimensional field of view. The emitted light may be scanned along a first (e.g., horizontal) direction and/or along a second (e.g., vertical) direction across the field of view. The LIDAR system may also be a Flash LIDAR system.

The light detection principle may be based on a time-of-flight principle. One or more light pulses (e.g., one or more laser pulses, such as short laser pulses) may be emitted and a corresponding echo-signal (e.g., LIDAR echo-signal) may be detected. Illustratively, the echo-signal may be understood as light reflected back towards the LIDAR system by objects onto which the emitted light has impinged. The echo-signal may be digitalized by an electronic circuit. The electronic circuit may include one or more amplifiers (e.g., an analog amplifier, such as a transimpedance amplifier) and/or one or more converters (e.g., an analog-to-digital converter, a time-to-digital converter, and the like). Alternatively, the detection principle of the LIDAR system may be based on a continuous wave (e.g., a frequency modulated continuous wave).

Various embodiments may be based on providing at least one waveguiding component for use in a LIDAR system. The waveguiding component may be arranged between a receiver optics arrangement and a sensor arrangement (e.g., one or more sensors) of the LIDAR system. The waveguiding component may be configured to guide (in other words, to transport) light received by the receiver optics arrangement to the sensor arrangement (e.g., to a sensor, e.g. to one or more sensor pixels of one or more sensors). Illustratively, the light coming from the field of view may be captured (e.g., received) by means of the waveguiding component instead of being imaged directly onto the sensor(s). The waveguiding component may include one or more waveguiding components (e.g., one or more light-guiding elements). The waveguiding component may be or may include one waveguiding component (e.g., one light-guiding element) or a plurality of waveguiding components (e.g., a plurality of light-guiding elements). By way of example, the waveguiding component may include one or more (e.g., optical) waveguides (e.g., one or more waveguides, such as channel waveguides or planar waveguides, arranged or integrated in a chip, e.g. in and/or on a block or a substrate). As another example, the waveguiding component may include one or more optical fibers (e.g., photonic fibers, photonic-crystal fibers, etc.). The waveguiding component may also include a combination of waveguiding components of different types.

The waveguiding component may include a first portion and a second portion. The first portion may be configured to receive light from the receiver optics arrangement. The second portion may be configured to guide the received light towards the sensor arrangement. The first portion may include a first type of waveguiding components (e.g., one or more optical fibers, a monolithic waveguide block, one or more channel waveguides, or the like). The second portion may include a second type of waveguiding components. The second portion may be configured to receive light from the first portion (e.g., the waveguiding components of the second portion may be coupled with the waveguiding components of the first portion). The first type of waveguiding components may be the same as the second type of waveguiding components. Alternatively, the first type of waveguiding components may be different from the second type of waveguiding components.

By way of example, the waveguiding component may include one or more optical fibers. The waveguiding component may include a plurality of optical fibers. The plurality of optical fibers may be grouped in a fiber bundle or in a plurality of fiber bundles. The field of view may be imaged onto the surface of one or more fiber ends (e.g., onto the respective input port of one or more optical fibers). Illustratively, one or more optical fibers and/or one or more optical fiber bundles may be provided to capture (e.g., to image) the field of view. An optical fiber may be configured to guide light in an arbitrary way (e.g., the shape and the outline of an optical fiber may be selected in an arbitrary manner). An optical fiber may include an out-coupling region at its end (e.g., at its output port). The out-coupling region may be configured to bring the light from the optical fiber onto a respective sensor (e.g., onto a respective sensor pixel). The out-coupling region may be aligned with the respective sensor (e.g., the respective sensor pixel), in order to enable efficient (e.g., without losses or with minimized losses) light transfer. By way of example, in order to further reduce or minimize light losses, a round sensor pixel (e.g., a pixel having a circular surface area) may be provided instead of a rectangular sensor pixel. A round sensor pixel may match an optical mode of the optical fiber assigned thereto.

By way of example, the waveguiding component may include one or more waveguides (e.g., channel waveguides). The one or more waveguides may be configured to collect light from the field of view (e.g., from the receiver optics). The one or more waveguides may be provided in addition or alternatively to the one or more optical fibers. The one or more waveguides may be fabricated by means of a lithographic process (e.g., etching and/or deposition). The one or more waveguides may be arranged on or (e.g., monolithically) integrated in and/or on a chip. As an example, the one or more waveguides may be integrated in a block, such as a monolithic waveguide block. As another example, the one or more waveguides may be arranged on or integrated in and/or on a substrate (e.g., a silicon substrate, such as a silicon wafer, a titanium oxide substrate, a silicon nitride substrate, or the like). Illustratively, the monolithic waveguide block may include a waveguide chip. The one or more waveguides may be arranged along the substrate (e.g., they may extend in a direction substantially parallel to the surface of the substrate, e.g. the surface of the chip). The one or more waveguides may have a thickness (e.g., a flat thickness) in the range from about 50 nm to about 10 μm, for example from about 100 nm to about 5 μm. The one or more waveguides may have a width greater than the respective thickness.

A (e.g., photonic) chip approach may be compact and may provide a high degree of integration. This may also provide the possibility to combine the chip with a complementary metal-oxide-semiconductor (CMOS) sensor and/or with an avalanche photo diode photodetector. The one or more waveguides may be routed within the chip (e.g., within the block or within substrate) to different locations on the chip. By way of example, a waveguide may be configured (e.g., arranged) to transport light towards a respective sensor (e.g., a respective sensor pixel). As another example, a waveguide may be configured to transport light to a detection region (e.g., a detector region) of the chip. As yet another example, a waveguide may be configured to transport light towards one or more optical fibers. Light may be coupled (e.g., out-coupled) into one or more optical fibers (e.g., external or non-integrated into the substrate). Illustratively, the chip may be configured to enable collection of light at or through the side (e.g., the side surface) of the chip. The light may be collected by direct fiber-end to waveguide coupling (e.g., the light may be focused directly into an optical fiber). The chip may also be configured to provide dynamic switching possibilities, thus enabling complex functionalities.

The use of optical fibers and/or photonic chip technology in addition or in alternative to conventional optics in the receiver path of a LIDAR system may be beneficial in multiple ways. By way of example, the receiver optics arrangement may be simplified, and thus may be less expensive than in a conventional LIDAR system. As another example, the size and the cost of the sensor (e.g., a photodetector) may be reduced. As yet another example, the background light (e.g., solar background light) may be reduced. As yet another example, amplification of the detected light may be provided in a simple manner (e.g., in-fiber). As yet another example, the light may be routed in a flexible manner (e.g., along a curved and/or looping path). As yet another example, the signal-to-noise ratio may be increased. As yet another example, the range (e.g., the detection range) of the sensor may be increased.

In various embodiments, a sensor pixel may have a waveguiding component associated therewith (e.g., a sensor pixel may be configured to receive the light captured by one waveguiding component). Additionally or alternatively, a sensor pixel may also have more than one waveguiding component associated therewith. Illustratively, one or more waveguiding components may be assigned to a respective one sensor pixel. The assignment of more than one waveguiding component to one sensor pixel may enable parallel measurements on (or with) the sensor pixel, such as correlation measurements or noise determination measurements. By way of example, a sensor pixel may have one optical fiber associated therewith. As another example, a sensor pixel may have an optical fiber bundle associated therewith (e.g., one sensor pixel may be configured to receive the light captured by the fiber bundle). The captured light may be distributed into the optical fibers of the fiber bundle.

A waveguiding component may be configured to guide light in an arbitrary way. A waveguiding component may be configured to transport light along a straight path (e.g., a straight line). Additionally or alternatively, a waveguiding component may be configured to transport light along a winding or meandering path (e.g., along a curved and/or looping path). As an example, an optical fiber may be configured to be bent or curved. As another example, a channel waveguide may be configured to have one or more bends. Additionally or alternatively, a channel waveguide may be arranged in and/or on a flexible substrate. Thus, an unevenly or non-planar routing (e.g., of the light) may be provided. This may provide flexibility in the arrangement of the sensor(s) (e.g., in the arrangement of the sensor pixels).

The geometry of the sensor(s) may be freely adjusted or selectable, e.g. the sensor may be arbitrarily shaped and/or arbitrarily arranged. This may provide the effect that the sensor may be simplified with respect to a conventional LIDAR system. The sensor may be, for example, a linear array (e.g., it may include an array of sensor pixels). As another example, the sensor may be a single cell. As a yet another example, the sensor may be a 2D-array (it may include a two-dimensional array of sensor pixels). The sensor surface may be flat (e.g., all sensor pixels may be disposed in the same plane) or it may be separated into a plurality of regions (e.g., the sensor pixels may be disposed and/or oriented away from the optical axis, e.g. of the sensor or of the LIDAR system).

The sensor pixels may be disposed separated from one another and/or may be merged together. As an example, the sensor pixels may be rotated (e.g., tilted at different angles, for example with respect to an optical axis of the LIDAR system). As another example, the sensor pixels may be shifted with respect to one another (e.g., disposed on different planes, e.g. at a different distance from a surface of the respective sensor). This may not be possible in the case that direct imaging is used. This may provide the effect that less material may be needed for fabricating the sensor. This may also reduce cross talk between two (e.g., adjacent) sensor pixels, thanks to the physical separation of the sensor pixels (e.g., of respective photo detectors associated with the sensor pixels). This may also allow to provide sensor pixels with a larger sensor area (e.g., a larger sensor pixel active area), which may provide advantages with respect to an improved signal-to-noise ratio (SNR).

In various embodiments, the light-guiding effect (e.g., the waveguiding effect) may be provided by the total internal reflection inside a material. A waveguiding component may include a first region and a second region. The second region may at least partially surround the first region. The first region may have a refractive index greater than the refractive index of the first region. The optical mode(s) may be centered around the first region (e.g., the intensity of the optical mode(s) may be higher in the first region than in the second region). As an example, an optical fiber may have a core (e.g., a high refractive index core) surrounded by a cladding (e.g., a low refractive index cladding). As another example, a channel waveguide may have a waveguiding material (e.g., a core including a material with high refractive index) at least partially surrounded by a substrate (e.g., a material with low refractive index) and/or by air. Illustratively, the waveguiding material may be buried (e.g., surrounded on at least three sides or more) in a layer (e.g., a substrate layer, e.g. an insulating layer) with lower refractive index than the waveguiding material.

The light impinging onto the LIDAR system from the field of view may be adapted or converted in a way to efficiently match the optical mode(s) of the waveguiding component(s) (e.g., to match the optical mode(s) that may be transported in the waveguiding component(s)). The LIDAR system may include collection optics (e.g., one or more light-transfer elements) configured to efficiently transfer light (e.g., without losses or with reduced losses) from the field of view (e.g., from the receiver optics) into a waveguiding component (e.g., into the core of a waveguiding component). The collection optics may be configured to focus light onto the core of a waveguiding component.

By way of example, the LIDAR system (e.g., the waveguiding component) may include a lens (e.g., a micro-lens) disposed in front of the input port of an optical fiber. Additionally or alternatively a tip of an optical fiber (illustratively, the portion facing the receiver optics) may be configured to focus into the core the light impinging on the fiber (e.g., the tip may be configured as lens, for example the tip may be molten into a lens).

By way of example, the LIDAR system (e.g., the waveguiding component) may include a coupling structure (e.g., a grating coupler, such as a vertical grating coupler). The coupling structure may be configured to convert a light spot (e.g., a large focus spot, e.g. of light focused by the receiver optics onto the coupling structure) into a confined optical mode (e.g., into a confined waveguide mode). The coupling structure may be configured to direct the confined optical mode to a (e.g., channel) waveguide. A coupling structure may be particularly well suited for use in a LIDAR system since only a single wavelength may typically be detected (e.g., it may be possible to configure a grating structure, for example its geometry, based on the wavelength to be detected, for example 905 nm).

Illustratively, one or more coupling structures may be arranged or integrated in and/or on a chip including one or more waveguides. The one or more coupling structures may be fabricated or integrated in and/or on a substrate. As an example, the one or more coupling structures may be integrated on the surface of a substrate (e.g., a silicon substrate). The one or more coupling structures may have a corrugated pattern (e.g., a grating). Each corrugated pattern may be configured (e.g., its properties, such as its geometry, may be matched) to diffract incident light into a respective waveguide (e.g., to receive light and direct it towards a respective waveguide). The features of a grating may be selected based on the properties of the incident light (e.g., according to the grating equation). As an example, a pitch of the grating may be about half of the wavelength of the incident light. The one or more waveguides may be arranged at an angle (e.g., a tilted or vertical angle) with respect to the angle of incidence. Illustratively, the one or more waveguides may extend along a direction that is tilted with respect to the direction of the light impinging onto the chip (e.g., onto the one or more coupling structures).

In various embodiments, the receiver optics of the LIDAR system may be configured to have a curved focal plane (e.g., to focus the collected light into a curved focal plane). The focal plane may be spherically curved. By way of example, the receiver optics may be or may be configured as a ball lens (or as a cylinder lens, spherical lens, aspherical lens, ellipsoidal lens, or the like). The waveguiding component may be arranged along the focal plane (or a portion of the focal plane) of the receiver optics. The waveguiding component may be arranged along a curved surface, e.g. the curved focal plane (e.g., the input port(s) of the waveguiding component(s) may be arranged along a curved surface). The waveguiding component(s) may be aligned with the (e.g., curved) focal plane (e.g., the respective input(s) or input port(s) may be disposed in the focal plane). The field of view may be segmented into a plurality of (e.g., angular) sections (illustratively, one section for each waveguiding component). Each waveguiding component may collect light from a distinct angular section (e.g., from a distinct direction). This configuration may provide the effect that aberrations (e.g., spherical aberrations) of the collection lens (e.g., of the ball lens) may be compensated by the curvature (e.g., the disposition along a curved surface) of the waveguiding component(s).

In one or more embodiments, a waveguiding component may be configured to provide additional functionalities. A waveguiding component may include (or may sub-divided in) one or more segments (in other words, one or more regions). The one or more segments may be configured to provide a desired functionality (e.g., to provide amplification of the light being transported in the waveguiding component, to enable vertical coupling with a sensor pixel, etc.). Illustratively, passive and/or active photonic elements may be included in a waveguiding component to improve the performance and/or the integration (e.g., a tighter integration between signal and sensor may be provided).

By way of example, a waveguiding component may be doped (e.g., a segment may be doped, such as an optical fiber segment or a channel waveguide segment). The doped waveguiding component may be configured for optical amplification of the signal (e.g., it may be configured to amplify the light transported in the waveguiding component). The LIDAR echo-signal(s) may be collected by the receiver optics and guided through the doped waveguiding component where it may be amplified. A doped waveguiding component may include rare earth atoms inside its core (e.g., inside the core material). The associated atomic transitions may provide a level structure (e.g., the energy levels) similar to the energy levels typically provided for lasers (e.g., for stimulated light emission). The level structure may include a strongly absorbing pump band at short wavelengths with a fast decay into a laser-like transition state. Excited atoms may reside for a long period of time in this transition state, until an incoming photon stimulates the decay into a lower state, e.g. the ground state. The dopant(s) may be selected, for example, based on a pumping light (e.g., on the wavelength of the light used for exciting the dopant atoms) and/or on a desired wavelength band within which light may be amplified. As an example, Erbium may be used as dopant. Erbium may have strong absorption of light at a wavelength of 980 nm. Erbium may also have a broad gain spectrum, resulting for example into an emission wavelength band from about 1400 nm to about 1600 nm. Within this wavelength band, incoming light may be enhanced (e.g., amplified) through stimulated emission. Other dopant materials may also be used, which may provide different wavelength bands. As an example, Ytterbium may have (e.g., strong) absorption of light at a wavelength of 980 nm and gain at around 1000 nm.

Illustratively, the operation may be seen as follows. The LIDAR light may enter (e.g., it may be transported) in a first waveguiding component. One or more additional input ports may be provided. Pumping light may be introduced via the additional input port(s). As an example, with each LIDAR light pulse (e.g., each LIDAR laser pulse), a pumping light driver (e.g., an excitation laser) may be configured to flash (illustratively, to emit a pumping light pulse). The pumping light may be coupled (e.g., it may be transported) in a second, e.g. pumping, waveguiding component. One or more coupling regions may also be provided to merge the pumping light with the signal light. As an example, a coupler (e.g., a fiber coupler) may combine both light sources (e.g., the first waveguiding component and the second waveguiding component) into a single waveguiding component (e.g., a third waveguiding component). The third waveguiding component may have a doped segment. The pumping light may be configured to excite the dopant atoms. The lifetime of these excited states may be long compared to the time-of-flight of the LIDAR light (e.g., the lifetime may be of some milliseconds). This may provide the effect that the LIDAR signal may be amplified by the stimulated emission of the excited atoms. The third waveguiding component may be configured to guide the amplified signal and the pump signal towards the sensor. A filter (e.g., an optical filter, such as an optical long pass filter) may be disposed between the output port of the third waveguiding component and the sensor. The filter may be configured such that the pump light is rejected (e.g., blocked, e.g. reflected away) by means of the filter. The filter may be configured such that the amplified signal may pass through the filter (and enter or arrive onto the sensor).

By way of example, a waveguiding component may be configured as a grating coupler (e.g., a segment may be configured as a grating coupler), such as a passive grating coupler. The waveguiding component may have a corrugated (e.g., outer) surface (e.g., a segment of a waveguiding component may have a corrugated surface). The corrugated surface may be configured for out-coupling or for connecting the waveguiding component with a sensor (e.g., with a sensor pixel). As an example, the corrugated surface may enable vertical exit of the guided light (e.g., of the guided signal).

In various embodiments, the waveguiding component may include a first plurality of waveguiding components and a second plurality of waveguiding components. The LIDAR system (e.g., the waveguiding component) may include collection optics configured to image the vertical and horizontal field of view onto the waveguiding components of the first plurality of waveguiding components. The waveguiding components of the first plurality of waveguiding components may extend along a first direction (e.g., the horizontal direction). Illustratively, the waveguiding components of the first plurality of waveguiding components may have the input ports directed (e.g., aligned) to the first direction to receive light. The waveguiding components of the second plurality of waveguiding components may extend along a second direction (e.g., the vertical direction). The second direction may be different from the first direction (e.g., the second direction may be substantially perpendicular to the first direction). Each waveguiding component of the first plurality of waveguiding components may be coupled (e.g., in a switchable manner) with a waveguiding component of the second plurality of waveguiding components (e.g., it may be configured to transfer light to a waveguiding component of the second plurality of waveguiding components). Each waveguiding component of the second plurality of waveguiding components may include one or more coupling regions for coupling with one or more waveguiding components of the first plurality of waveguiding components. The waveguiding components of the second plurality of waveguiding components may be configured to guide the received light to a respective sensor (e.g., a respective sensor pixel).

The coupling regions may be selectively activated (e.g., by means of one or more couplers, such as waveguide couplers). The LIDAR system may include a controller (e.g., coupled with the waveguiding component) configured to control the coupling regions (e.g., to selectively activate or deactivate one or more of the coupling regions). This may provide the effect of a selective activation of the waveguiding components of the first plurality of waveguiding components. Illustratively, only the waveguiding components of the first plurality of waveguiding components associated with an active coupling region may transfer light to the respectively coupled waveguiding component of the second plurality of waveguiding components. The activation may be in accordance (e.g., synchronized) with the scanning of the emitted LIDAR light (e.g., with the scanning of the vertical laser line). This may provide the effect that the waveguiding components of the first plurality of waveguiding components which receive the LIDAR light may be enabled to transfer it to the respectively coupled waveguiding component of the second plurality of waveguiding components. The waveguiding components of the first plurality of waveguiding components which receive light from other (e.g., noise) sources may be prevented from transferring it to the respectively coupled waveguiding component of the second plurality of waveguiding components. This may lead to an improved SNR of the detection.

By way of example, the waveguiding component may include an array of optical fibers (e.g., a two-dimensional array, e.g. a two-dimensional fiber bundle, a three-dimensional array). The LIDAR system may include an array of lenses (e.g., micro-lenses) configured to image the vertical and horizontal field of view onto the optical fibers. The optical fibers may have respective input ports directed or aligned to a first direction. The first direction may be a direction parallel to the optical axis of the LIDAR system (e.g., to the optical axis of the receiver optics). Illustratively, the optical fibers may have respective input ports facing (e.g., frontally) the field of view of the LIDAR system. The waveguiding component may further include one or more waveguides. The waveguides may be arranged along a second direction. The second direction may be perpendicular to the first direction. Each channel waveguide may include one or more coupling regions. The optical fibers may be configured to route the received signal to a respective (e.g., switchable) coupling region. The output port of each optical fiber may be coupled to the respective coupling region (e.g., by means of a coupler). An optical fiber line (e.g., a line of optical fibers of the array of optical fibers) may be activated selectively. The activation of the optical fiber line may be performed by activating the respective coupling region (e.g., the respective coupler). The activated coupler(s) may be configured to transfer the guided light from the optical fiber to the (e.g., main) waveguide. The waveguide(s) may be configured to guide the signal received from the active optical fibers onto an associated sensor pixel (e.g., a sensor pixel of a 1D-sensor array). By way of example, the sensor pixels may be aligned in a direction parallel to a vertical field of view of the LIDAR system (e.g., the sensor may include a column of sensor pixels). As another example, the sensor pixels may be aligned in a direction parallel to a horizontal field of view of the LIDAR system (e.g., the sensor may include a row of sensor pixels). The sensor pixels may also be arranged freely (e.g., not in an array-like structure), in view of the flexibility of the optical fibers. Illustratively, past the coupling region(s) the signal may be guided onto the sensor pixel associated with the waveguide.

The (e.g., optical) switching of the couplers may be implemented by any suitable means. By way of example, mechanical switches or spatial optical switches may be realized by micro-mechanical mirrors (e.g., MEMS mirrors) or directional optical couplers (e.g. Mach-Zehnder-Interferometers with phase delay arms). The micro-mechanical mirrors may be configured to reroute the signal between the waveguiding components. Illustratively, from a source waveguiding component (e.g., a source optical fiber) the signal may be directed (e.g., collimated) onto a MEMS mirror. The MEMS mirror may be configured to steer the signal (e.g., the light beam) into a range of angles. One or more target waveguiding components (e.g., target waveguides) may be placed at each selectable angle. The signal may be focused into at least one target waveguiding component. Illustratively, the interference coupling region may be mechanically tuned to achieve the transfer of a mode (e.g., of an optical mode).

As another example, an interference switch may be provided. The interference switch may be configured to switch the signal between two waveguiding components (e.g. between an optical fiber and a to waveguide). A plurality of switches may be serialized to switch the signal between more than two waveguiding components (e.g., between a waveguide and a plurality of optical fibers associated therewith). An interference switch may include a first coupling region. In the first coupling region two waveguiding components may be arranged relative to one another such that the is guided optical modes may overlap (e.g., the distance between the two waveguiding components may be such that the guided optical modes may overlap). The two waveguiding components may be arranged parallel to each other. In this configuration, the two guided optical modes may interfere with each other. The energy of the two guided optical modes may thus be transferred (e.g., back and forth) between the two waveguiding components over the length of the first coupling region. The energy transfer may occur, for example, in a sinusoidal fashion. The interference switch may include a separation region. The separation region may be disposed next to (e.g., after) the first coupling region. In the separation region, the two waveguiding components may be arranged relative to one another such that the guided optical modes do not overlap (e.g., the distance between the two waveguiding components may be increased such that the guided optical modes do not overlap, e.g. energy is not transferred). The interference switch may include a second coupling region. The second coupling region may be disposed next to (e.g., after) the separation region. In the second coupling region, the two waveguiding components may be brought back together, e.g. they may be arranged relative to one another such that the guided optical modes may (again) overlap. In the second coupling region the mode is transferred back into the original waveguiding component. The interference switch may include a switchable element (such as a thermal element) disposed in the separation region (e.g., between the first coupling region and the second coupling region). The switchable element may be configured to act on one of the waveguiding components such that the phase of the mode shifts by a predefined amount (e.g., by 7c). By way of example, a thermal element may heat one of the waveguiding components, such that the phase of the mode shifts by TC. This way, destructive interference may occur in the second coupling region, and the mode may remain in the waveguiding component.

The components described herein may provide improved performance and reduced costs with respect to a conventional LIDAR system. By way of example, an arrangement of optical fibers along a spherically bent focal plane allows the usage of simple and cheap spherical lenses. This may also provide the effect that the receiver optics may be optimized for large apertures thus providing high light collection efficiency. Additionally, the components described herein may improve the detection capabilities of the LIDAR echo-signals. The components described herein may also provide additional flexibility to the system. By way of example, separate sensors or separable sensor pixels may be provided. This may provide a better yield as compared to a single large sensor and a better aspect ratio of the sensor pixels (e.g., of avalanche photo diode pixels). Moreover, the arranging of the sensor pixels may be selected arbitrarily. As an example, arbitrarily large gaps or spacing between sensor pixels may be provided (e.g., both in the horizontal direction and in the vertical direction). The approach described herein may also enable the combination with telecommunications technology, such as light amplification and light routing.

This may improve the performance of a LIDAR system, for example with an increased detection range, and reduced background light. The implementation of simpler receiver optics and separable sensors may also reduce the cost of the LIDAR system. The components described herein may be combined together or may be included separately in a LIDAR system (e.g., in a LIDAR device).

FIG. 108 shows a portion of a LIDAR system 10800 including a waveguiding component 10802 in a schematic view, in accordance with various embodiments.

The LIDAR system 10800 may be configured as a LIDAR scanning system. By way of example, the LIDAR system 10800 may be or may be configured as the LIDAR Sensor System 10 (e.g., as a scanning LIDAR Sensor System 10). The LIDAR system 10800 may include an emitter path, e.g., one or more components of the system configured to emit (e.g. LIDAR) light (e.g., a light source 42, a beam steering unit, and the like). The LIDAR system 10800 may include a receiver path, e.g., one or more components configured to receive light (e.g., reflected from objects in the area surrounding or in front of the LIDAR system 10800). For the sake of clarity of representation, FIG. 108 illustrates only a portion of the LIDAR system 10800, e.g. only a portion of the receiver path of the LIDAR system 10800. The illustrated portion may be configured as the second LIDAR Sensor System 50.

The LIDAR system 10800 may include a receiver optics arrangement 10804 (also referred to as optics arrangement). The receiver optics arrangement 10804 may be configured to receive (e.g., collect) light from the area surrounding or in front of the LIDAR system 10800. The receiver optics arrangement 10804 may be configured to direct or focus the collected light onto a focal plane of the receiver optics arrangement 10804. The receiver optics arrangement 10804 may include one or more optical components configured to receive light and focus or collimate it onto a focal plane of the receiver optics arrangement 10804. By way of example, the receiver optics arrangement 10804 may include a condenser optics (e.g., a condenser). As another example, the receiver optics arrangement 10804 may include a cylinder lens. As a yet another example, the receiver optics arrangement 10804 may include a ball lens.

The receiver optics arrangement 10804 may have or may define a field of view 10806 of the receiver optics arrangement 10804. The field of view 10806 of the receiver optics arrangement 10804 may coincide with the field of view of the LIDAR system 10800. The field of view 10806 may define or may represent an area (or a solid angle) through (or from) which the receiver optics arrangement 10804 may receive light (e.g., an area visible through the receiver optics arrangement 10804).

Illustratively, light (e.g., LIDAR light) emitted by the LIDAR system 10800 may be reflected (e.g., back towards the LIDAR system 10800) by one or more (e.g., system-external) objects present in the field of view 10806. The receiver optics arrangement 10804 may be configured to receive the reflected emitted light (e.g., the reflected LIDAR light) and to image the received light onto the waveguiding component 10802 (e.g., to collimate the received light towards the waveguiding component 10802).

The waveguiding component 10802 may be arranged downstream the receiver optics arrangement 10804 (e.g., with respect to the direction of light impinging onto the receiver optics arrangement 10804). The waveguiding component 10802 may be arranged upstream a sensor 52 of the LIDAR system 10800. Illustratively, the waveguiding component 10802 may be arranged between the receiver optics arrangement 10804 and the sensor 52.

The waveguiding component 10802 may be configured (e.g., arranged and/or oriented) to receive light from the receiver optics arrangement 10804. The waveguiding component 10802 may be configured to guide (e.g., transport) the light received by the receiver optics arrangement 10804 to the sensor 52 (e.g., to one or more sensor pixels 10808 of the sensor 52). The LIDAR system 10800 may include at least one waveguiding component 10802. The LIDAR system 10800 may also include a plurality of waveguiding components 10802 (e.g., the waveguiding component 10802 may include a plurality of waveguiding components 10802). By way of example, each waveguiding component 10802 of the plurality of waveguiding components 10802 may be configured to guide the light received by the receiver optics arrangement 10804 to a respective sensor 52 (or a respective sensor pixel 10808) associated with the waveguiding component 10802.

The sensor 52 may include one or more sensor pixels 10808 (e.g., it may include a plurality of sensor pixels 10808). The sensor pixels 10808 may be configured to generate a signal (e.g. an electrical signal, such as a current) when light impinges onto the one or more sensor pixels 10808. The generated signal may be proportional to the amount of light received by the sensor 52 (e.g. the amount of light arriving on the sensor pixels 10808). The sensor 52 may be configured to operate in a predefined range of wavelengths (e.g., to generate a signal when light in the predefined wavelength range impinges onto the sensor 52), for example in the infra-red range (e.g., from about 860 nm to about 2000 nm, for example from about 860 nm to about 1000 nm).

By way of example, the sensor 52 may include one or more photo diodes. Illustratively, each sensor pixel 10808 may include a photo diode (e.g., of the same type or of different types). At least some of the photo diodes may be pin photo diodes (e.g., each photo diode may be a pin photo diode). At least some of the photo diodes may be based on avalanche amplification (e.g., each photo diode may be based on avalanche amplification). As an example, at least some of the photo diodes may include an avalanche photo diode (e.g., each photo diode may include an avalanche photo diode). At least some of the avalanche photo diodes may be or may include a single photon avalanche photo diode (each avalanche photo diode may be or may include a single photon avalanche photo diode). The sensor 52 may be or may be configured as a silicon photomultiplier including a plurality of sensor pixels 10808 having single photon avalanche photo diodes.

At least some of the sensor pixels 10808 may be arranged at a distance (e.g., from one another). The distance may be a distance parallel to a sensor surface 10810 (e.g., a main surface of the sensor 52, e.g. the surface of the sensor 52 onto which the waveguiding component 10802 guides the light) and/or a distance perpendicular to the sensor surface 10810. Illustratively, the sensor pixels 10808 may be arranged shifted or separated from one another.

By way of example, a first sensor pixel 10808 may be disposed at a first distance $d_1$ from a second sensor pixel 10808. The first distance $d_1$ may be perpendicular to the sensor surface 10810. Illustratively, the sensor surface 10810 may extend in (or may be parallel to) a plane perpendicular to an optical axis of the receiver optics arrangement 10804 (e.g., the optical axis may be lying along the direction 10852). The first distance $d_1$ may be parallel to the optical axis (e.g., it may be a distance measured in a direction parallel to the optical axis). As an example, the first distance $d_1$ may be a center-to-center distance between the first sensor pixel 10808 and the second sensor pixel 10808 measured in a direction perpendicular to the sensor surface 10810 (e.g., in a direction parallel to the optical axis). As another example, the first distance $d_1$ may be an edge-to-edge distance (e.g., a pitch or a gap) between the first sensor pixel 10808 and the second sensor pixel 10808 measured in a direction perpendicular to the sensor surface 10810.

By way of example, a first sensor pixel 10808 may be disposed at a second distance $d_2$ from a second sensor pixel 10808. The second distance $d_2$ may be parallel to the sensor surface 10810. Illustratively, the second distance $d_2$ may be perpendicular to the optical axis of the receiver optics arrangement 10804 (e.g., it may be a distance measured in a direction perpendicular to the optical axis). As an example, the second distance $d_2$ may be a center-to-center distance between the first sensor pixel 10808 and the second sensor pixel 10808 measured in a direction parallel to the sensor surface 10810 (e.g., in a direction perpendicular to the optical axis). As another example, the second distance $d_2$ may be an edge-to-edge distance (e.g., a pitch or a gap) between the first sensor pixel 10808 and the second sensor pixel 10808 measured in a direction parallel to the sensor surface 10810.

Illustratively, a first sensor pixel 10808 may be shifted with respect to a second sensor pixel 10808 in a first direction (e.g., a direction perpendicular to the sensor surface 10810) and/or in a second direction (e.g., to a direction parallel to the sensor surface 10810). The first sensor pixel 10808 may be shifted diagonally with respect to the second sensor pixel 10808. The distance may be a diagonal distance, e.g. a distance measured along a diagonal direction, for example along an axis (e.g., a line) passing through the center of the first sensor pixel 10808 and the center of the second sensor is pixel 10808.

Stated in a different fashion, a sensor pixel 10808 may be arranged at a set of (e.g., x-y-z) coordinates. A sensor pixel 10808 may have a first coordinate in a first direction (e.g., the direction 10852). A sensor pixel 10808 may have a second coordinate in a second direction (e.g., the direction 10854, e.g. the horizontal direction). A sensor pixel 10808 may have a third coordinate in a third direction (e.g., the direction 10856, e.g. the vertical direction). A first sensor pixel 10808 may have a first set of coordinates. A second sensor pixel 10808 may have a second set of coordinates. Each coordinate of the first set of coordinates may be different from the respective coordinate of the second set of coordinates.

A distance between two sensor pixels 10808 may have a minimum value. As an example, in the case that two sensor pixels 10808 are spaced from one another, they may be spaced from each other by at least a minimum distance (e.g., a minimum distance parallel and/or perpendicular to 3o the sensor surface 10810). As another example, each sensor pixel 10808 may be spaced from any other sensor pixel 10808 by at least a minimum distance. The minimum distance may be selected, for example, based on the size of the sensor pixels 10808 (e.g., based on a lateral dimension of the sensor pixels 10808, such as the width or the height). As an example, the minimum distance may be 5% of the width of a sensor pixel 10808, for example it may be 10% of the width, for example it may be 25% of the width.

FIG. 109 shows a portion of a LIDAR system 10800 including one or more optical fibers 10902 in a schematic view, in accordance with various embodiments.

The waveguiding component 10802 may include one or more optical fibers 10902. At least one optical fiber 10902 (or each optical fiber 10902) may be or may be configured as a single-mode optical fiber. At least one optical fiber 10902 (or each optical fiber 10902) may be or may be configured as a multi-mode optical fiber.

Each optical fiber 10902 may include an input port **10902*i* (also referred to as input). The input port(s) 10902*i* may be configured to receive light. As an example, the input port(s) 10902*i* may be configured to receive light from the receiver optics arrangement 10804 (e.g., the input port(s) 10902*i* may be facing the receiver optics arrangement 10804 and/or may be oriented to receive light from the receiver optics arrangement 10804). The one or more optical fibers 10902 may be arranged such that each input port 10902*i* is located (e.g., aligned) substantially in the focal plane of the receiver optics arrangement 10804. Illustratively, the one or more optical fibers 10902 may be arranged such that the receiver optics arrangement 10804 may focus or collimate light into the respective core(s) of the one or more optical fibers 10902. Each optical fiber 10902 may include an output port 10902*o* (also referred to as output). The output port(s) 10902*o* may be configured to output light (e.g., signal), e.g. light being transported by the respective optical fiber 10902**.

The one or more optical fibers 10902 may have a same diameter (e.g., the respective input ports **10902*i* and/or output ports 10902*o* may have a same diameter). Alternatively, the one or more optical fibers 10902 may have different diameters (e.g., the respective input ports 10902*i* and/or output ports 10902*o* may have a different diameter). By way of example, a first optical fiber 10902 may have a first diameter and a second optical fiber 10902** may have a second diameter. The first diameter may be equal to the second diameter or it may be different from the second diameter.

An optical fiber 10902 may include one or more light-transporting fibers (e.g., one or more light-transporting filaments). By way of example, an optical fiber 10902 may be configured as a fiber bundle, e.g. an optical fiber 10902 may include a plurality of light-transporting fibers. The light-transporting fibers of the plurality of light-transporting fibers may have the respective input ports aligned to the same direction (e.g., they may be is configured to receive light from a same direction). The light-transporting fibers of the plurality of light-transporting fibers may have the respective output ports aligned to the same direction (e.g., they may be configured to transport and output light into a same direction).

The one or more optical fibers 10902 may be arranged in an ordered fashion. The one or more optical fibers 10902 may form (e.g., may be arranged in) an array (e.g., a group) of optical fibers 10902. As an example, the one or more optical fibers 10902 may be arranged in a 1D-array (e.g., in a column or in a row or a line). As another example, the one or more optical fibers 10902 may be arranged in a 2D-array (e.g., in a matrix). Illustratively, the one or more optical fibers 10902 may be arranged such that the respective input ports **10902*i* are disposed in a same plane (e.g., in a same plane perpendicular to the optical axis of the receiver optics arrangement 10804, e.g. at a same coordinate along the direction 10852). Additionally or alternatively, the one or more optical fibers 10902 may be arranged in a non-ordered fashion. As an example, a first optical fiber 10902 may have its input port 10902*i* disposed in a different plane (e.g., along the direction 10852) with respect to the input port 10902*i* of a second optical fiber 10902 (or of all the other optical fibers 10902). Illustratively, the input port 10902*i* of the first optical fiber 10902 may be arranged closer to or further away from the receiver optics arrangement 10804 than the input port 10902***i* of the second optical fiber 10902.

The LIDAR system 10800 may include a collection optics. The collection optics may be arranged between the receiver optics arrangement 10804 and the one or more optical fibers 10902. The collection optics may be configured to convert the light focused or collimated by the receiver optics arrangement 10804 such that the light may match the mode(s) of the one or more optical fibers 10902 (e.g., may match the path along which the light may travel in the one or more optical fibers 10902). Illustratively, the collection optics may be configured to convert the light focused or collimated by the receiver optics arrangement 10804 such that the light may be transported by the one or more optical fibers 10902. As an example, as illustrated in the inset 10904, the LIDAR system 10800 (e.g., the wave-guiding component 10802) may include at least one lens 10906 (e.g., the collection optics may be or may include at least one lens 10906). The at least one lens 10906 may be arranged in front of at least one optical fiber 10902. The at least one lens 10906 may be configured as a micro-lens or as a micro-lens array. As an example, exactly one lens 10906 may be located in front of exactly one associated optical fiber 10902. Illustratively, the LIDAR system 10800 may include one or more lenses 10906, and each lens 10906 may be located in front of exactly one optical fiber 10902 associated therewith.

At least one optical fiber 10902 may extend along a linear (e.g., straight) path (e.g., the light transported in the optical fiber 10902 may follow a linear path, e.g. substantially without any curvature). At least one optical fiber 10902 may extend along a path including at least a curvature (e.g., a bend or a loop). The light transported in the optical fiber 10902 may follow a path including at least a curvature. As an example, at least one optical fiber 10902 may be arranged such that its input port 10902*i* is at a different height (e.g., at a different coordinate along the direction 10856, e.g. a different vertical coordinate) than its output port 10902*o*. As another example, at least one optical fiber 10902 may be arranged such that its input port 10902*i* is at a different coordinate along the direction 10854 (e.g. a different vertical coordinate) than its output port 10902*o*. The flexibility of the one or more optical fibers 10902 may provide the effect that the sensor 52 (e.g., the sensor pixels 10808) may be arranged in an arbitrary manner.

One or more optical fibers 10902 may be assigned to a respective one sensor pixel 10808 (e.g., one or more optical fibers 10902 may be configured to transfer light to a respective one sensor pixel 10808, e.g. one or more optical fibers 10902 may have the output port 10902*o* coupled or aligned with a respective one sensor pixel 10808). Illustratively, one sensor is pixel 10808 (e.g., including one photo diode) may have one optical fiber 10902 assigned thereto, or one sensor pixel 10808 may have a plurality of optical fibers 10902 assigned thereto (e.g., a subset of the array of optical fibers 10902). Additionally or alternatively, one or more optical fibers 10902 may be assigned to a respective one sensor 52. The LIDAR system 10800 may include a plurality of sensors 52, and each sensor 52 may have one optical fiber 10902 or a plurality of optical fibers 10902 assigned thereto (e.g. one or more optical fibers 10902 for each sensor pixel 10808).

As an example, the one or more optical fibers 10902 may be configured to receive light from a same direction (e.g., from a same portion or segment of the field of view 10806). Illustratively, the one or more optical fibers 10902 may have the respective input ports 10902*i* arranged such that the one or more optical fibers 10902 receive light from a same direction. As another example, the one or more optical fibers 10902 may be configured to receive light from different directions (e.g., from different portions or segments of the field of view 10806). Illustratively, the one or more optical fibers 10902 may have the respective input ports 10902*i* arranged such that each optical fiber 10902 receives light from a respective direction (e.g., from a respective segment of the field of view). It is understood that also a combination of the two configurations may be possible. A first subset (e.g., a first plurality) of optical fibers 10902 may be configured to receive light from a first direction. A second subset of optical fibers 10902 may be configured to receive light from a second direction, different from the first direction.

By way of example, in case the one or more optical fibers 10902 are configured to receive light from a same direction, each optical fiber 10902 may be assigned to a respective one sensor pixel 10808. In case the one or more optical fibers 10902 are configured to receive light from different directions, more than one optical fiber 10902 may be assigned to the same sensor pixel 10808 (e.g., to the same sensor 52).

In the case that a plurality of optical fibers 10902 (e.g., configured to receive light from different segments of the field of view) are assigned to one sensor pixel 10808, the LIDAR system 10800 (e.g., the sensor 52) may be configured to determine (e.g., additional) spatial and/or temporal information based on the light received on the sensor pixel 10808. As an example, the LIDAR system 10800 may be configured to process the light received onto the sensor pixel 10808 from the plurality of optical fibers 10902 simultaneously (e.g., the light coming from the plurality of optical fibers 10902 may generate a signal given by the sum of the individual signals). As another example, the LIDAR system 10800 may be configured to process the light received onto the sensor pixel 10808 from the plurality of optical fibers 10902 with a time-shift (in other words, within different measurement time windows). Illustratively, in case a plurality of optical fibers 10902 is assigned to one sensor 52 (e.g., to one sensor pixel 10808), all incoming light pulses may be measured within the same (e.g., first) measurement time window. Alternatively, at least one of the incoming light pulses from at least one the plurality of optical fibers 10902 may be measured within a second measurement time window different from the first measurement time window (e.g., it may be shifted in time). The light received from a first optical fiber 10902 may generate a first signal at a first time point and the light received from a second optical fiber 10902 may generate a second signal at a second time point, different from the first time point (e.g., after 100 ns or after 1 ms).

FIG. 110 shows a portion of a LIDAR system 10800 including one or more optical fibers 10902 in a schematic view, in accordance with various embodiments.

The one or more optical fibers 10902 may include a plurality of optical fibers 10902. The input ports 10902*i* of the plurality of optical fibers 10902 may be arranged along a curved surface 11002. The input ports 10902*i* of the plurality of optical fibers 10902 may be arranged at least partially around the receiver optics arrangement 10804. The curved surface 11002 may be a spherically curved surface. Illustratively, the input port 10902*i* of a first optical fiber 10902 may be aligned along a first direction. The input port 10902*i* of a second optical fiber 10902 may be aligned along a second direction. The first direction may be tilted with respect to the second direction (e.g., by an angle of about ±5°, of about ±10°, of about ±20°, etc.).

This configuration of the plurality of optical fibers 10902 may be provided, in particular, in the case that the receiver optics arrangement 10804 has a curved focal plane. Illustratively, the input ports 10902*i* of the plurality of optical fibers 10902 may be arranged on or along the curved focal plane of the receiver optics arrangement 10804 (e.g., the curved surface 11002 may coincide at least partially with the focal plane of the receiver optics arrangement 10804). This may provide the effect that aberrations (e.g., spherical aberrations) of the receiver optics arrangement 10804 may be corrected by means of the disposition of the plurality of optical fibers 10902.

The receiver optics arrangement 10804 may be configured to receive light from a plurality of angular segments of the field of view 10806. The receiver optics arrangement 10804 may be configured to direct light from each angular segment to a respective optical fiber 10902 of the plurality of optical fibers 10902 (e.g., an optical fiber 10902 associated with the angular segment). By way of example, the receiver optics arrangement 10804 may include or may be configured as a ball lens 11004. The input ports 10902*i* of the plurality of optical fibers 10902 may be arranged at least partially around the ball lens 11004. The ball lens 11004 may be configured to receive light from a plurality of angular segments 11006 of the field of view and to direct light from each angular segment 11006 to a respective optical fiber 10902 of the plurality of optical fibers 10902. As another example, the receiver optics arrangement 10804 may include or may be configured as a circular lens.

FIG. 111 shows a portion of a LIDAR system 10800 including a waveguide block 11102 in a schematic view, in accordance with various embodiments.

The waveguiding component 10802 may include a waveguide block 11102 (e.g., a monolithic waveguide block). The waveguide block 11102 may include one or more waveguides 11104 (e.g., one or more channel waveguides). Illustratively, the waveguide block 11102 may include one or more waveguides 11104 formed or integrated (e.g., monolithically integrated, e.g. buried) in a single optical component. The one or more waveguides 11104 may be arranged in an orderly fashion (e.g., they may be arranged as a 1D-array, such as a column or a row, or they may be arranged as a 2D-array, such as a matrix). At least one waveguide 11104 may be a single-mode waveguide. At least one waveguide 11104 may be a multi-mode waveguide.

The waveguide block 11102 may include or may be made of a suitable material for implementing waveguiding. As an example, the waveguide block 11102 may include or may be made of glass (e.g., silica glass, amorphous silica). The one or more waveguides 11104 may be formed in the glass. By way of example, the one or more waveguides may include a (e.g., waveguiding) material having a refractive index higher than the refractive index of the material of the block (e.g., of the refractive index of glass). Additionally or alternatively, the one or more waveguides 11004 may be formed by locally altering (e.g., increasing) the refractive index of the glass block (e.g., by means of a thermal treatment). As another example, the waveguide block 11102 may include or may be made of diamond.

The waveguide block 11102 may be or may be configured as a waveguide chip. The waveguide chip may include one or more waveguides 11104 arranged in and/or on a substrate. Illustratively, the waveguide chip may include a waveguiding material arranged in and/or on a substrate. The refractive index of the waveguiding material may be higher than the refractive index of the substrate.

Each waveguide 11104 may include an input port 11104*i* (also referred to as input). The input port(s) 11104*i* may be configured to receive light. As an example, the input port(s) may be configured to receive light from the receiver optics arrangement 10804. The one or more waveguides 11104 may be arranged such that each input port 11104*i* is located (e.g., aligned) substantially in the focal plane of the receiver optics arrangement 10804. Illustratively, the one or more waveguides 11104 may be arranged such that the receiver optics arrangement 10804 may focus or collimate light into the respective core(s) of the one or more waveguides 11104. Each waveguide 11104 may include an output port 111040 (also referred to as output). The output port(s) 11104*o* may be configured to output light (e.g., signal), e.g. light being transported by the respective waveguide 11104.

At least one waveguide 11104 of the one or more waveguides 11104 (e.g., all waveguides 11104) may be configured to output light to a sensor 52 (e.g., to a sensor pixels 10808). One or more waveguides 11104 may be assigned to a respective one sensor pixel 11108. Illustratively, the output(s) 111040 of one or more waveguides 11104 may be coupled with a respective sensor pixel 11108. Additionally or alternatively, at least one waveguide 11104 of the one or more waveguides 11104 may be configured to output light to an optical fiber 10902. Illustratively, the output 11104*o* of a waveguide 11104 may be coupled with the input 10902*i* of an optical fiber 10902. One or more optical fibers 10902 may be arranged between the waveguide block 11102 and the sensor 52. The one or more optical fibers 10902 may be configured to receive light from the waveguide block 11102 (e.g., from a respective waveguide 11104). The one or more optical fibers 10902 may be configured to guide the received light to the sensor 52 (e.g., to a respective sensor pixel 10808).

Collection optics may be arranged between the receiver optics arrangement 10804 and the waveguide block 11102. The collection optics may be configured to convert the light which is focused or collimated by the receiver optics arrangement 10804 such that the light may match the mode(s), e.g. the propagation modes(s) of the one or more waveguides 11104. By way of example, the LIDAR system 10800 may include a light coupler, such as a grating coupler (as illustrated, for example, in FIG. 112). The light coupler may be configured to receive light (e.g., from the receiver optics arrangement 10804). The light coupler may be configured to couple the received light into the one or more waveguides 11104. Additionally or alternatively, collection optics may be arranged between the waveguide block 11102 and the sensor 52. The collection optics may be configured to convert the light output from the one or more waveguides 11104 such that the light may impinge onto the sensor 52 (e.g., onto one or more sensor pixels 10808). By way of example, the LIDAR system 10800 may include a grating coupler configured to couple light from the one or more waveguides 11104 to a sensor pixel 10808 (e.g., to one or more sensor pixels 10808). The LIDAR system 10800 may also include a plurality of light couplers (e.g., of grating couplers), arranged between the receiver optics arrangement 10804 and the waveguide block 11102 and/or between the waveguide block 11102 and the sensor 52. As an example, the LIDAR system 10800 may include one grating coupler associated with each waveguide 11104.

FIG. 112A and FIG. 112B show a waveguiding component 10802 including a substrate 11202 and one or more waveguides 11204 in and/or on the substrate 11202 in a schematic view, in accordance with various embodiments.

The waveguiding component 10802 may include a substrate 11202. The waveguiding component 10802 may include one or more waveguides 11204 in and/or on the substrate 11202. Illustratively, the one or more waveguides 11204 (e.g., the waveguiding material) may be deposited on the substrate 11202, for example on a surface of the substrate 11202. The one or more waveguides 11204 (e.g., the waveguiding material) may be buried in the substrate 11202 (e.g., the one or more waveguides 11204 may be surrounded on three sides or more by the substrate 11202). A first waveguide 11204 may be arranged on the substrate 11202. A second waveguide 11204 may be arranged in the substrate 11202. The one or more waveguides 11204 may have a thickness in the range from about 50 nm to about 10 μm, for example from about 100 nm to about 5 μm. The one or more waveguides 11204 may have a width greater than the respective thickness.

The substrate 11202 may include a semiconductor material. As an example, the substrate 11202 may include silicon (e.g., it may be a silicon substrate, such as a silicon wafer). Additionally or alternatively, the substrate 11202 may include an oxide (e.g., titanium oxide). Additionally or alternatively, the substrate 11202 may include a nitride (e.g., silicon nitride). The substrate 11202 may include a first layer **11202*s* and a second layer 11202*i*. The second layer 11202*i* may be disposed on the first layer 11202*s*. The one or more waveguides may be arranged on the second layer 11202*i* (as illustrated, for example, in FIG. 112A). The one or more waveguides may be arranged in the first layer 11202*s* and/or in the second layer 11202*i* (as illustrated, for example, in FIG. 112B). The first layer 11202*s* may be a semiconductor layer (e.g., a silicon layer, or a silicon substrate). The second layer 11202*i*** may be an insulating layer (e.g., an oxide layer, such as a silicon oxide or titanium oxide layer).

The substrate 11202 may be a flexible substrate. As an example, the substrate 11202 may include one or more polymeric materials. The flexible substrate 11202 may be curved at least partially around the receiver optics arrangement 10804 of the LIDAR system 10800. Illustratively, the one or more waveguides 11204 may be arranged in a similar manner as the optical fibers 10902 shown in FIG. 110. The flexible substrate 11202 may be curved along a spherical surface (e.g., at least partially along a curved focal plane of the receiver optics arrangement 10804). By way of example, the flexible substrate 11202 may be curved at least partially around a cylinder lens or around a ball lens.

The waveguiding component 10802 may include one or more light couplers 11206 (e.g., grating couplers) arranged in and/or on the substrate 11202. The one or more light couplers 11206 may be configured to couple the light received thereon into one or more waveguides 11204 (e.g., into a respective waveguide 11204). The one or more light couplers 11206 may be configured to receive a large light spot and to convert it such that it may match the mode of the one or more waveguides 11204 (e.g., of a respective waveguide 11204). The one or more waveguides 11204 may be oriented (e.g., they may extend) along a direction tilted with respect to the direction of the light impinging on the waveguiding component 10802 (e.g., with respect to the direction of the light impinging on the one or more light couplers 11206).

The one or more waveguides 11204 may be arbitrarily shaped. Illustratively, a waveguide 11204 may have a shape that enables light-guiding for the entire extension (e.g., the entire length) of the waveguide 11204. The one or more waveguides 11204 may be shaped to direct the received light to desired areas of the substrate 11202. As an example, at least one waveguide 11204 may be configured (e.g., shaped) to transport the received light to a detection region 11208 of the substrate 11202. The substrate 11202 (e.g., the detection region) may include a sensor 52 or a component configured to generate a signal upon receiving light from the waveguide 11204. As another example, at least one waveguide 11204 may be configured (e.g., shaped) to transport the received light to a border of the substrate 11202 (e.g., to an out-coupling region located at a border of the substrate 11202). At least one waveguide 11204 may be coupled (e.g., out-coupled) with a sensor 52 or with a sensor pixel 10808 (e.g., external to the substrate). At least one waveguide 11204 may be coupled (e.g., out-coupled) with an optical fiber 10902. Also this configuration may provide the effect that the sensor pixels 10808 may be arbitrarily arranged.

The one or more waveguides 11204 may be configured to transfer light between each other. A first waveguide 11204 may be configured to transfer the received light to a second waveguide 11204. One or more coupling regions 11210 may be provided. In the one or more coupling regions 11210 two waveguides may be arranged relative to one another such that light may be transferred from a first waveguide 11204 to a second waveguide 11204 (e.g., a distance between the waveguides 11204 may be such that light may be transferred from the first waveguide 11204 to the second waveguide 11204).

FIG. 113 shows a portion of a LIDAR system 10800 including one or more optical fibers 10902 in a schematic view, in accordance with various embodiments.

The one or more optical fibers 10902 (or the waveguides 11104 11204) may be configured to provide additional functionalities. Illustratively, one or more segments of an optical fiber 10902 may be configured to provide additional functionalities.

An optical fiber 10902 may be configured to amplify light transported in the optical fiber 10902 (e.g., to enhance the transported signal). By way of example, an optical fiber 10902 may be doped (e.g., an optical fiber 10902 may include a doped segment 11302, e.g. a doped portion). Illustratively, the optical fiber 10902 may include a dopant (e.g., dopant atoms, such as Erbium) in its core.

An optical fiber 10902 may be configured to out-couple light transported in the optical fiber 10902 into a direction at an angle (e.g., substantially perpendicular) with respect to the direction along which the light is transported in the optical fiber 10902. Illustratively, an optical fiber 10902 may be configured to out-couple light into the vertical direction (e.g., to a sensor 52 or a sensor pixel 10808 arranged perpendicular to the output port **10902*i* of the optical fiber 10902). By way of example, an optical fiber 10902 may include an (e.g., additional) out-coupling segment 11304 (e.g., an out-coupling portion). The out-coupling segment 11304 may include or may be configured as a corrugated surface (e.g., one or more layers surrounding the core of the optical fiber 10902 may include a corrugated portion). The out-coupling segment 11304** may include or may be configured as a grating coupler (e.g., a passive corrugated grating coupler).

FIG. 114 shows a portion of a LIDAR system 10800 including a waveguiding component 10802 including a coupling element 11402 in a schematic view, in accordance with various embodiments.

The waveguiding component 10802 may include a first waveguiding component and a second waveguiding component. The waveguiding component 10802 may include a coupling element 11402. The coupling element 11402 may be configured to optically couple the first waveguiding component with the second waveguiding component. Illustratively, the coupling element 11402 may be configured to merge the light (e.g., the signal) transported in (or by) the first waveguiding component with the light transported in the second waveguiding component. The coupling element 11402 may be configured to guide the merged light to a third waveguiding component.

By way of example, the waveguiding component 10802 may include a first optical fiber 10902 and a second optical fiber 10902. The waveguiding component 10802 may include a fiber coupler configured to optically couple the first optical fiber 10902 with the second optical fiber 10902. The fiber coupler may be configured to guide the merged light to a third optical fiber 10902. This configuration may be provided, in particular, for implementing light amplification, as described in further detail below.

The LIDAR system 10800 (e.g., the waveguiding component 10802) may include a pumping light source. By way of example, the first waveguiding component (e.g., the first optical fiber 10902) may be or may be configured as the pumping light source. The first waveguiding component may be configured to receive and transport pumping light. The second waveguiding component (e.g., the second optical fiber 10902) may be or may be configured as signal light source. The second waveguiding component may be configured to receive and transport signal light (e.g., LIDAR light). The pumping light may be configured to amplify the signal light (e.g., when merged together, e.g. in the third waveguiding component).

The coupling element 11402 may be configured to provide pumping light to the pumping light source (e.g., to the first waveguiding component). By way of example, the coupling element 11402 may include a laser 11404 (e.g., an excitation laser). The laser 11404 may be configured to emit laser light (e.g., excitation light). The laser 11404 may be configured to emit laser light into the first waveguiding component (e.g., the output of the laser 11404 may be collected at the input port of the first waveguiding component). The LIDAR system 10800 (e.g., the waveguiding component) may include a controller 11406 (e.g., a laser controller). The controller 11406 may be configured to control the laser 11404. The controller 11406 may be configured to control the laser 11404 in accordance (e.g., in synchronization) with the generation of LIDAR light (e.g., with the generation of a LIDAR light pulse, such as a LIDAR laser pulse). Illustratively, the controller 11406 may be configured to control the laser 11404 such that with the generation of each LIDAR light pulse the laser 11404 generates excitation light (e.g., an excitation laser pulse).

The third waveguiding component may be doped (e.g., it may have a doped segment). By way of example, the third optical fiber 10902 may be doped (e.g., it may have a doped segment 11302). The pumping light may be configured to excite the dopant atoms, such that the LIDAR signal may be amplified by the stimulated emission of the excited atoms. The third waveguiding component may be configured to guide the amplified signal and to the pump signal towards a sensor pixel 10808 (or towards a sensor 52).

The LIDAR system 10800 (e.g., the waveguiding component 10802) may include a filter 11408 (e.g., an optical filter, such as an optical long pass filter). The filter 11408 may be disposed between the output of the third waveguiding component and the sensor pixel 10808. The filter 11408 is may be configured to block (e.g., reject) the pumping light. The filter 11408 may be configured to allow the signal light (e.g., the amplified LIDAR light) to travel through the filter 11408 (and impinge onto the sensor pixel 10808).

FIG. 115 shows a portion of a LIDAR system 10800 including a plurality of optical fibers 10902 and a waveguide 11502 in a schematic view, in accordance with various embodiments.

The waveguiding component 10802 may include a plurality of optical fibers 10902. The input ports **10902*i* of the optical fibers 10902 may be directed to a first direction to receive light. As an example, the input ports 10902*i* may be directed towards a direction parallel to the optical axis of the receiver optics arrangement 10804 (e.g., the first direction may be the direction 10852). Illustratively, the plurality of optical fibers 10902 may be arranged such that the input ports 10902*i* are facing the receiver optics arrangement 10804**.

The plurality of optical fibers 10902 (e.g., the respective input ports **10902*i*) may be arranged in a 1D-array (e.g., in a column or in a row). Illustratively, the optical fibers 10902 of the plurality of optical fibers 10902 may be arranged along a direction perpendicular to the optical axis of the optics arrangement (e.g., along the direction 10854 or the direction 10856). The plurality of optical fibers 10902 may be arranged in a 2D-array (e.g., in a matrix). Illustratively, the optical fibers 10902 of the plurality of optical fibers 10902 may be arranged along a first direction and a second direction. The first direction and the second direction may be perpendicular to the optical axis of the optics arrangement (e.g., the plurality of optical fibers 10902 may be arranged along the direction 10854 and along the direction 10856**).

The LIDAR system may include collection optics arranged upstream the plurality of optical fibers 10902 (e.g., with respect to the direction from which the LIDAR light is impinging on the LIDAR system 10800). Illustratively, the collection optics may be arranged between the receiver optics arrangement 10804 and the plurality of optical fibers 10902. By way of example, the collection optics may be or may include an array of lenses 11508 (e.g., an array of micro-lenses, e.g. a micro-lens array). The array of lenses 11508 may include one lens for each optical fiber 10902 of the plurality of optical fibers 10902 (e.g., each optical fiber 10902 may have a lens, e.g. exactly one lens, assigned thereto).

The waveguiding component 10802 may include a waveguide 11502 (e.g., a monolithic waveguide). The waveguide 11502 may include a plurality of waveguides 11504. As an example, the waveguide 11502 may be or may be configured as a waveguide block. As another example, the waveguide 11502 may be or may be configured as a substrate in and/or on which a plurality of waveguides 11504 are arranged or integrated. Each waveguide 11504 may include one or more coupling regions 11506. The waveguides 11504 of the plurality of waveguides 11504 may be arranged (e.g., may extend) along a second direction. The second direction may be different from the first direction. The second direction may be at an angle with respect to the first direction (e.g., 30°, 45°, 60°, or 90°). The second direction may be substantially perpendicular to the first direction (e.g., the second direction may be the direction 10856, e.g. the vertical direction, or the second direction may be the direction 10854, the horizontal direction).

One or more optical fibers 10902 (e.g. a plurality of optical fibers 10902 or a subset of optical fibers 10902) may be coupled to (or with) a respective waveguide 11504 of the plurality of waveguides 11504. Illustratively, a waveguide 11504 of the plurality of waveguides 11504 may have a plurality of optical fibers 10902 coupled thereto (e.g., at a respective coupling region 10506). The output port **10902*o* of each optical fiber 10902 may be coupled to one of the coupling regions 10506. Additionally or alternatively, an end portion of each optical fiber 10902 may be coupled to one of the coupling regions 10506. In case an end portion of an optical fiber 10902 is coupled to a coupling region 10506, the respective output port 10902***o* may include or may be configured as a mirror. Each optical fiber 10902 may be configured to couple (e.g., to transfer) light from the optical fiber 10902 into the respectively coupled waveguide 11504. Illustratively, a coupler or a coupler arrangement may be provided for each coupling region 10506.

The LIDAR system 10800 (e.g., the waveguiding component 10802) may include switching means for controlling (e.g., selectively activating) the coupling between the optical fibers 10902 and the waveguides 11504. The switching means may be configured to select an optical fiber 10902 to couple light into the respectively coupled waveguide 11504 (e.g., to activate the respective coupler). Illustratively, switching means may be provided for each waveguide 11504 (e.g., for each coupling region 11506). As an example, a waveguide 11504 may have a first optical fiber 11902 (e.g., the output port 10902*o* of a first optical fiber 10902) coupled to a first coupling region 11506*a*, a second optical fiber 11902 coupled to a second coupling region 11506*b*, and a third optical fiber 11902 coupled to a third coupling region 11506*c*. The switching means may be configured such that the first coupling region 11506*a* may be activated (e.g., the first optical fiber 10902 may be allowed to transfer light into the waveguide 11504). The switching means may be configured such that the second coupling region 11506*b* and the third coupling region 11506*c* may be de-activated (e.g., the second optical fiber 10902 and the third optical fiber 10902 may be prevented from transferring light into the waveguide 11504). The switching means may be configured such that a waveguide 11504 may receive light from a single optical fiber 10902 of the plurality of optical fibers 10902 coupled with the waveguide 11504. As an example, the switching means may be an optical switch (e.g., a mechanical optical switch, an interference switch, and the like).

The waveguides 11504 of the plurality of waveguides 11504 may be configured to guide light towards one or more sensor pixels 10808 (or towards one or more sensors 52). One or more waveguides 11504 may be assigned to a respective one sensor pixel 10808.

The LIDAR system 10800 (e.g., the waveguiding component 10802) may include a controller 11510 (e.g., a coupling controller) configured to control the switching means. The controller 11510 may be configured to control the switching means such that a subset of the plurality of optical fibers 10902 may be activated (e.g., may be allowed to transfer light to the respectively coupled waveguide 11504). By way of example, the controller 11510 may be configured to control the switching means such that a line of optical fibers 10902 may be activated (e.g., a column or a row, as illustrated by the striped lenses in FIG. 115). The controller 11510 may be configured to control the switching means in accordance (e.g., in synchronization) with a beam steering unit of the LIDAR system 10800. The controller 11510 may be configured to control the switching means in accordance (e.g., in synchronization) with the generation of LIDAR light. Illustratively, the controller 11510 may be configured to control the switching means such that those optical fibers 10902 may be activated, onto which the LIDAR light is expected to impinge (e.g., the optical fibers 10902 that may receive LIDAR light based on the angle of emission). The controller 11510 may be configured to de-activate the other optical fibers 10902, such that any noise light impinging onto them may not lead to the generation of a signal. Thus, the SNR of the detection may be improved without activating or de-activating the sensor 52 or the sensor pixels 10808.

The configuration of the waveguiding component 10802, e.g., the arrangement of the optical fibers 10902 and of the waveguide 11502, may also be interchanged. Illustratively, the waveguides 11504 may be arranged along the first direction and the optical fibers 10902 may be arranged (or extending) along the second direction. The waveguides 11504 may have the respective input ports directed to the first direction. The optical fibers 10902 may have the respective output ports 10902*o* directed towards the second direction. The optical fibers 10902 may be configured to guide light towards the one or more sensor pixels 10808 (or towards one or more sensors 52). One or more optical fibers 10902 may be assigned to a respective one sensor pixel 10808.

It is to be noted that one or more of the waveguides (or one or more of the optical fibers) may be selected dependent on information provided by a digital map (e.g. any digital map as disclosed herein) and/or dependent on a previous/current/estimated driving status of a vehicle (e.g. any vehicle as disclosed herein).

Moreover, a plurality of optical fibers 10902 may be provided per sensor pixel. A switch may be provided to select one or more optical fibers 10902 of the plurality of optical fibers 10902.

In various embodiments, one or more additional light sources may be provided. A controller may be provided configured to individually and selectively switch on or switch off, e.g. dependent on information provided by a digital map (e.g. any digital map as disclosed herein) and/or dependent on the power consumption of the LIDAR Sensor System.

In the following, various aspects of this disclosure will be illustrated:

Example 1q is a LIDAR Sensor System. The LIDAR Sensor System may include a receiver optics arrangement configured to receive light, a sensor including one or more sensor pixels, and at least one waveguiding component. The at least one waveguiding component may be arranged between the receiver optics arrangement and the sensor. The at least one waveguiding component may be configured to guide light received by the receiver optics arrangement to the one or more sensor pixels.

In Example 2q, the subject-matter of Example 1q can optionally include that the receiver optics arrangement includes a condenser optics or a cylinder lens or a ball lens.

In Example 3q, the subject-matter of any one of Examples 1q or 2q can optionally include that the at least one waveguiding component includes one or more optical fibers.

In Example 4q, the subject-matter of Example 3q can optionally include that the LIDAR Sensor System may further include at least one lens in front of at least one optical fiber of the one or more optical fibers.

In Example 5q, the subject-matter of Example 4q can optionally include that the at least one lens is configured as a micro-lens or a microlens array.

In Example 6q, the subject-matter of any one of Examples 3q to 5q can optionally include that exactly one lens is located in front of exactly one associated optical fiber of the one or more optical fibers.

In Example 7q, the subject-matter of any one of Examples 1q to 6q can optionally include that one or more optical fibers are assigned to a respective one sensor pixel of the one or more sensor pixels.

In Example 8q, the subject-matter of Example 7q can optionally include that one or more optical fibers include a plurality of optical fibers, each optical fiber having an input to receive light. The inputs of the plurality of optical fibers may be arranged along a curved surface at least partially around the receiver optics arrangement.

In Example 9q, the subject-matter of any one of Examples 1q to 8q can optionally include that the one or more optical fibers include a first optical fiber and a second optical fiber.

In Example 10q, the subject-matter of Example 9q can optionally include that the first optical fiber and the second optical fiber are configured to receive light from a same direction.

In Example 11q, the subject-matter of example 10q can optionally include that the first optical fiber is assigned to a first sensor pixel. The second optical fiber may be assigned to a second sensor pixel.

In Example 12q, the subject-matter of Example 9q can optionally include that the first optical fiber is configured to receive light from a first direction and the second optical fiber is configured to receive light from a second direction, different from the first direction.

In Example 13q, the subject-matter of Example 12q can optionally include that the first optical fiber and the second optical fiber are assigned to a same sensor pixel.

In Example 14q, the subject-matter of Example 13q can optionally include that the LIDAR Sensor System is configured to measure light coming from the first optical fiber in a first time window. The LIDAR Sensor System may be configured to measure light coming from the second optical fiber in a second time window. The first time window may correspond to the second time window. Alternatively, the first time window may be different from the second time window.

In Example 15q, the subject-matter of any one of Examples 1q to 14q can optionally include that the one or more sensor pixels include a plurality of sensor pixels. At least some sensor pixels of the plurality of sensor pixels may be arranged at a distance.

In Example 16q, the subject-matter of Example 15q can optionally include that the distance is a distance parallel to the sensor surface and/or a distance perpendicular to the sensor surface.

In Example 17q, the subject-matter of any one of Examples 1q to 16q can optionally include that the at least one waveguiding component includes a monolithic waveguide block including one or more waveguides.

In Example 18q, the subject-matter of Example 17q can optionally include that the LIDAR Sensor System further includes a grating coupler to couple light received by the grating coupler into the one or more waveguides and/or a grating coupler to couple light from the one or more waveguides to a sensor pixel.

In Example 19q, the subject-matter of any one of Examples 17q or 18q can optionally include that the monolithic waveguide block is made from glass.

In Example 20q, the subject-matter of any one of Examples 17q to 19q can optionally include that the monolithic waveguide block includes a waveguide chip including a waveguiding material arranged in and/or on a substrate. The refractive index of the waveguiding material may be higher than the refractive index of the substrate.

In Example 21q, the subject-matter of any one of Examples 17q to 20q can optionally include that the at least one waveguiding component includes a substrate and one or more waveguides in and/or on the substrate.

In Example 22q, the subject-matter of Example 21q can optionally include that the substrate is a flexible substrate.

In Example 23q, the subject-matter of Example 22q can optionally include that the flexible substrate is curved at least partially around the receiver optics arrangement.

In Example 24q, the subject-matter of any one of Examples 2q and 22q or 23q can optionally include that, the flexible substrate is curved at least partially around the cylinder lens or the ball lens.

In Example 25q, the subject-matter of any one of Examples 1q to 24q can optionally include that the at least one waveguiding component is includes a first waveguiding component, a second waveguiding component, and an coupling element which is configured to optically couple the first waveguiding component with the second waveguiding component.

In Example 26q, the subject-matter of Example 25q can optionally include that the LIDAR Sensor System further includes a pumping light source. The coupling element may be configured to provide pumping light to the pumping light source.

In Example 27q, the subject-matter of any one of Examples 25q or 26q can optionally include that the coupling element includes an excitation laser.

In Example 28q, the subject-matter of Example 27q can optionally include that the LIDAR Sensor System further includes a laser controller configured to activate the excitation laser in accordance with the generation of a LIDAR laser pulse.

In Example 29q, the subject-matter of any one of Examples 1q to 28q can optionally include that the at least one waveguiding component includes a plurality of optical fibers and a waveguide including a plurality of waveguides. Each optical fiber may include an input port and an output port. The input ports may be directed to a first direction to receive light. Each waveguide may include one or more coupling regions. The output port of each optical fiber may be coupled to one of the coupling regions to couple light from a respective optical fiber into the coupled waveguide.

In Example 30q, the subject-matter of Example 29q can optionally include that the waveguide is a monolithic waveguide.

In Example 31q, the subject-matter of any one of Examples 29q or 30q can optionally include that the waveguides are arranged along a second direction different from the first direction.

In Example 32q, the subject-matter of Example 31q can optionally include that the second direction is substantially perpendicular to the first direction.

In Example 33q, the subject-matter of any one of Examples 29q to 32q can optionally include that the LIDAR Sensor System further includes a micro-lens array arranged upstream the plurality of optical fibers.

In Example 34q, the subject-matter of any one of Examples 29q to 33q can optionally include that a plurality of optical fibers are coupled to a respective waveguide of the plurality of waveguides.

In Example 35q, the subject-matter of Example 34q can optionally include that the LIDAR Sensor System further includes at least one optical switch configured to select an optical fiber of the plurality of optical fibers to couple light into the respectively coupled waveguide of the plurality of waveguides.

In Example 36q, the subject-matter of any one of Examples 1q to 35q can optionally include that each sensor pixel includes a photo diode.

In Example 37q, the subject-matter of Example 36q can optionally include that the photo diode is a pin photo diode.

In Example 38q, the subject-matter of Example 36q can optionally include that the photo diode is a photo diode based on avalanche amplification.

In Example 39q, the subject-matter of Example 38q can optionally include that the photo diode includes an avalanche photo diode.

In Example 40q the subject-matter of any one of Examples 38q or 39q can optionally include that the avalanche photo diode includes a single photon avalanche photo diode.

In Example 41q, the subject-matter of Example 40q can optionally include that the LIDAR Sensor System further includes a silicon photomultiplier including the plurality of sensor pixels having single photon avalanche photo diodes.

In a LIDAR system in which the scene is illuminated column-wise and is received row-wise (in other words with a row resolution), it may be required to map a broadly scanned scene to a narrow photo detector array (which will also be referred to as detector or sensor (e.g. sensor 52)). This results in an anamorphic optics arrangement having a short focal length in horizontal direction and having a long focal length in vertical direction. The detector is usually rather small in the horizontal direction in order to keep crosstalk between individual photo diodes as low as possible. This may result in that also the light from each illuminated column impinging onto the sensor surface fits through a narrow aperture which has approximately the same order of size as the horizontal focal length of the optical system.

The aperture may generally have an arbitrary shape, it may e.g. have a round shape (e.g. elliptical shape or circular shape), a rectangular shape (e.g. square shape or the shape of a slit), a polygon shape with an arbitrary number of edges, and the like.

A conventional LIDAR receiver optics arrangement may be designed such that the imaging optics arrangement (imaging in vertical direction and usually having the longer focal length), is formed around the sensor in an azimuthal manner (for example as a toroidal lens). The viewing angle for such an embodiment usually corresponds to the angle of the horizontal Field of View. The optics arrangement for the horizontal direction (usually having a short focal length) is usually implemented by a cylinder lens arranged directly in front of the sensor. The angles for the horizontal field of view may be in the range of approximately 60° and the focal length for the vertical direction may be in the range of a few centimeters, as a result of which the first lens conventionally has a dimension of several square centimeters. And this is the case even though the aperture for each individually illuminated column is significantly smaller.

One aspect of this disclosure may be seen in that the light reflected from a scene first meets (impinges on) an optics arrangement having e.g. a negative focal length in horizontal direction. This may have as a consequence that the light that is imaged onto the sensor and comes from a large angular range, has a remarkably smaller angular range after the optics arrangement. Furthermore, an optics arrangement having a positive focal length in horizontal direction is provided in front of the sensor to focus the light onto the sensor.

Due to the substantially reduced horizontal angular range of the light beams, which are imaged onto the sensor, the imaging optics arrangement in vertical direction may be dimensioned or configured for substantially smaller horizontal angular ranges. Thus, a conventional cylinder (or acylinder) optics arrangement may be used. Various effects of various embodiments may be seen in the substantially smaller aperture, which allows to keep the inlet aperture small and achieves a smaller required geometrical extension for the optical system. Furthermore, the lenses are cheaper since they do not have such a large volume/mass and not such large surfaces and since they exhibit smaller volumes.

Figure 33:
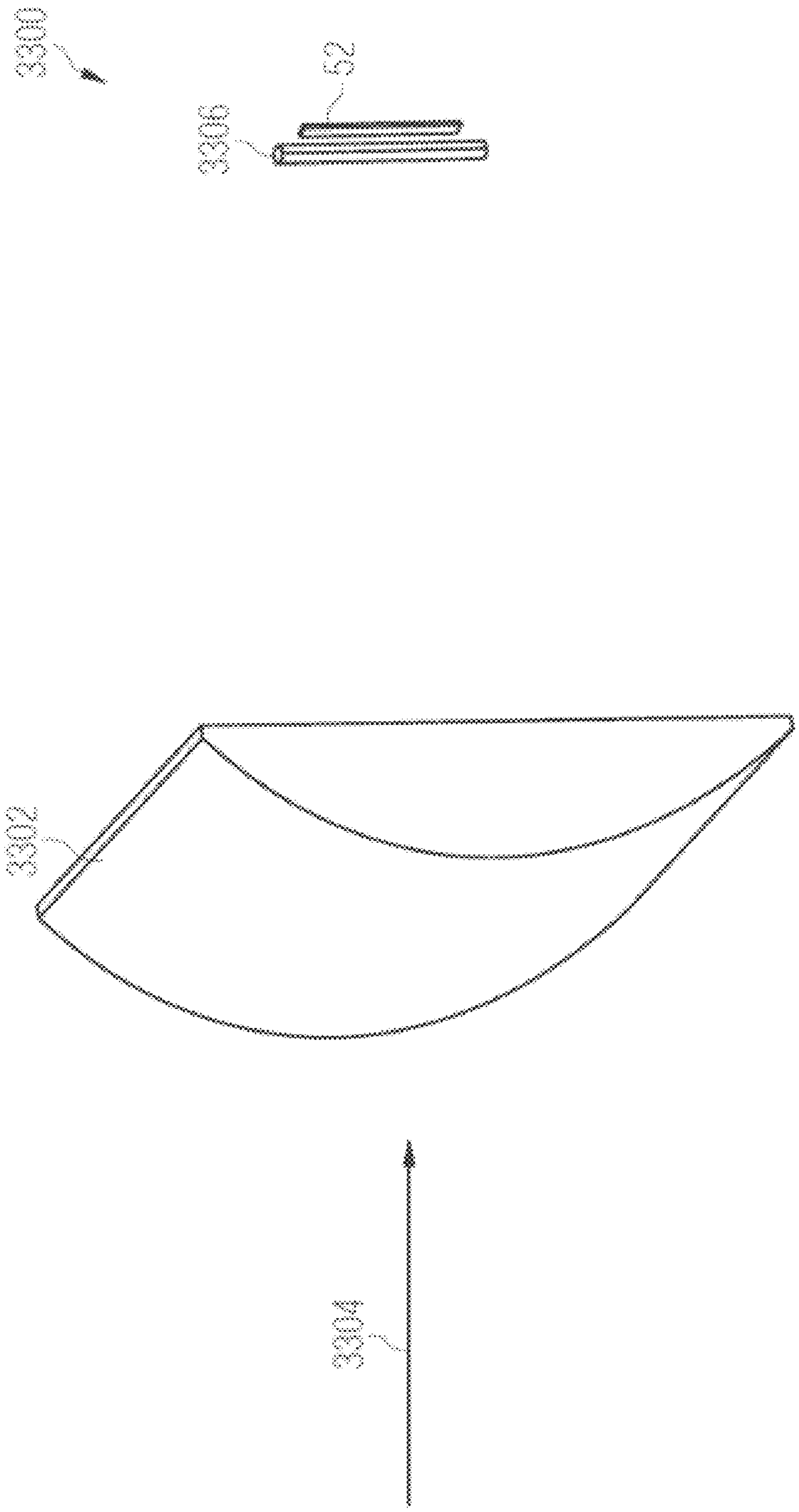
FIG. 33 shows a conventional optical system for a LIDAR Sensor System.

Referring now to FIG. 33 which shows a conventional optical system 3300 for a LIDAR Sensor System. The optical system 3300 includes a wide acylinder lens 3302 configured to provide a vertical imaging. The optical system 3300 further includes, in the direction of the optical path of incoming light 3304 from the acylinder lens 3302 to the sensor 52, a horizontal collecting lens 3306, followed by the sensor 52.

The sensor may be implemented in accordance with any one of the embodiments as provided in this disclosure.

Figure 34A:
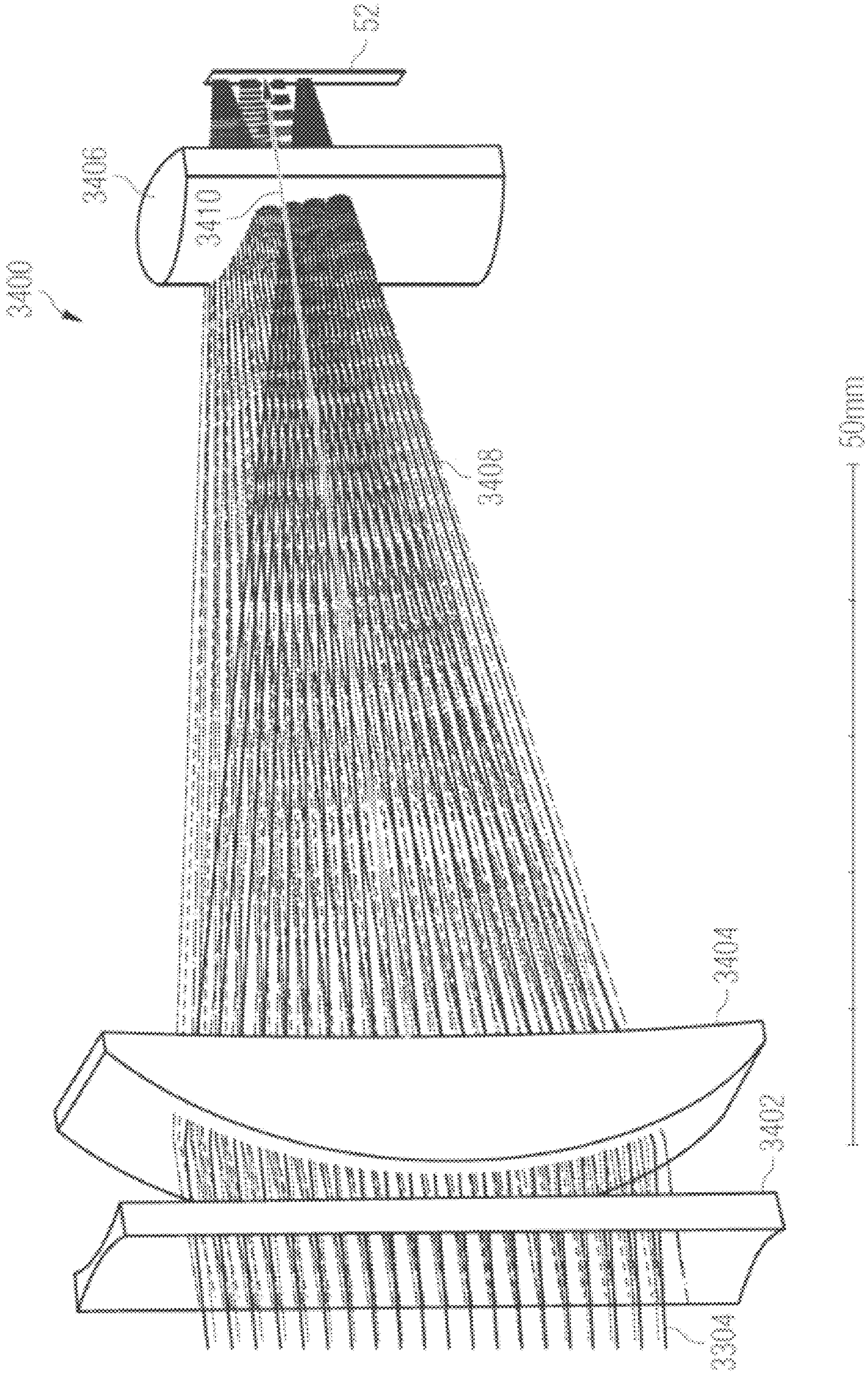
FIG. 34A shows a three-dimensional view of an optical system for a LIDAR Sensor System in accordance with various embodiments.

FIG. 34A shows a three-dimensional view of an optical system 3400 for a LIDAR Sensor System in accordance with various embodiments. The optical system 3400 includes an optics arrangement 3402 having a negative focal length in a first direction or a positive focal length in the first direction (not shown in FIG. 34A), an imaging optics arrangement 3404 configured to refract light in a second direction. The second direction forms a predefined angle with the first direction in a plane perpendicular to the optical axis 3410 of the optical system 3400. The optical system 3400 further includes a collector optics arrangement 3406 downstream in the optical path 3304 of the optics arrangement 3402 and the imaging optics arrangement 3404 and is configured to focus a light beam 3408 coming from the optics arrangement 3402 and the imaging optics arrangement 3404 along the first direction towards a predetermined detector region (e.g. the sensor 52). The following examples are illustrated using the horizontal direction as the first direction and the vertical direction as the second direction. However, it should be noted that any other relationship with respect to the angle between the first direction and the second direction may be provided in various embodiments. By way of example, in various embodiments, the entire optical system 3400 may be rotated by an arbitrary angle around the optical axis 3410 in the plane perpendicular to the optical axis 3410 of the optical system 3400, e.g. by 90°, in which case the vertical direction would be the first direction and the horizontal direction would be the second direction. The predefined angle may be in the range from about 80° to about 100°, e.g. in the range from about 85° to about 95°, e.g. in the range from about 88° to about 92°, e.g. approximately 90°.

The optical system 3400 in accordance with various embodiments may achieve a reduction of the required total space as well as a reduction of the surface area of the lenses as compared with a conventional optical system (such as e.g. compared with the optical system 3300 in FIG. 33) by a factor of two or even more. The optical system 3400 may be configured to operate in the near infrared (NIR) region (i.e. in the range of approximately 905 nm), and may have a field of view (FoV) in horizontal direction in the range from about 30° to about 60° and a field of view in vertical direction of approximately 10°. The optical system 3400 may be implemented in an automotive device or any kind of vehicle or flying object such as e.g. an unmanned (autonomous) flying object (e.g. a drone). The acylinder lens 3302 of the conventional optical system as shown in FIG. 33 usually has a width in the range from about 30 mm to about 100 mm and in comparison to this, the imaging optics arrangement 3404 of the optical system 3400 of FIG. 34 may have a width e.g. in the range from about 2 mm to about 25 mm, e.g. in the range from about 5 mm to about 20 mm. The height of the optical system 3400 as shown in FIG. 34 may be in the range of several cm. Some or all of the optical components of the optical system 3400, such as the optics arrangement 3402, the imaging optics arrangement 3404, and the collector optics arrangement 3406 may be made of glass. As an alternative, some or all of the optical components of the optical system 3400, such as the optics arrangement 3402, the imaging optics arrangement 3404, and the collector optics arrangement 3406 may be made of plastic such as poly(methyl methacrylate (PMMA) or polycarbonate (PC).

Figure 34B:
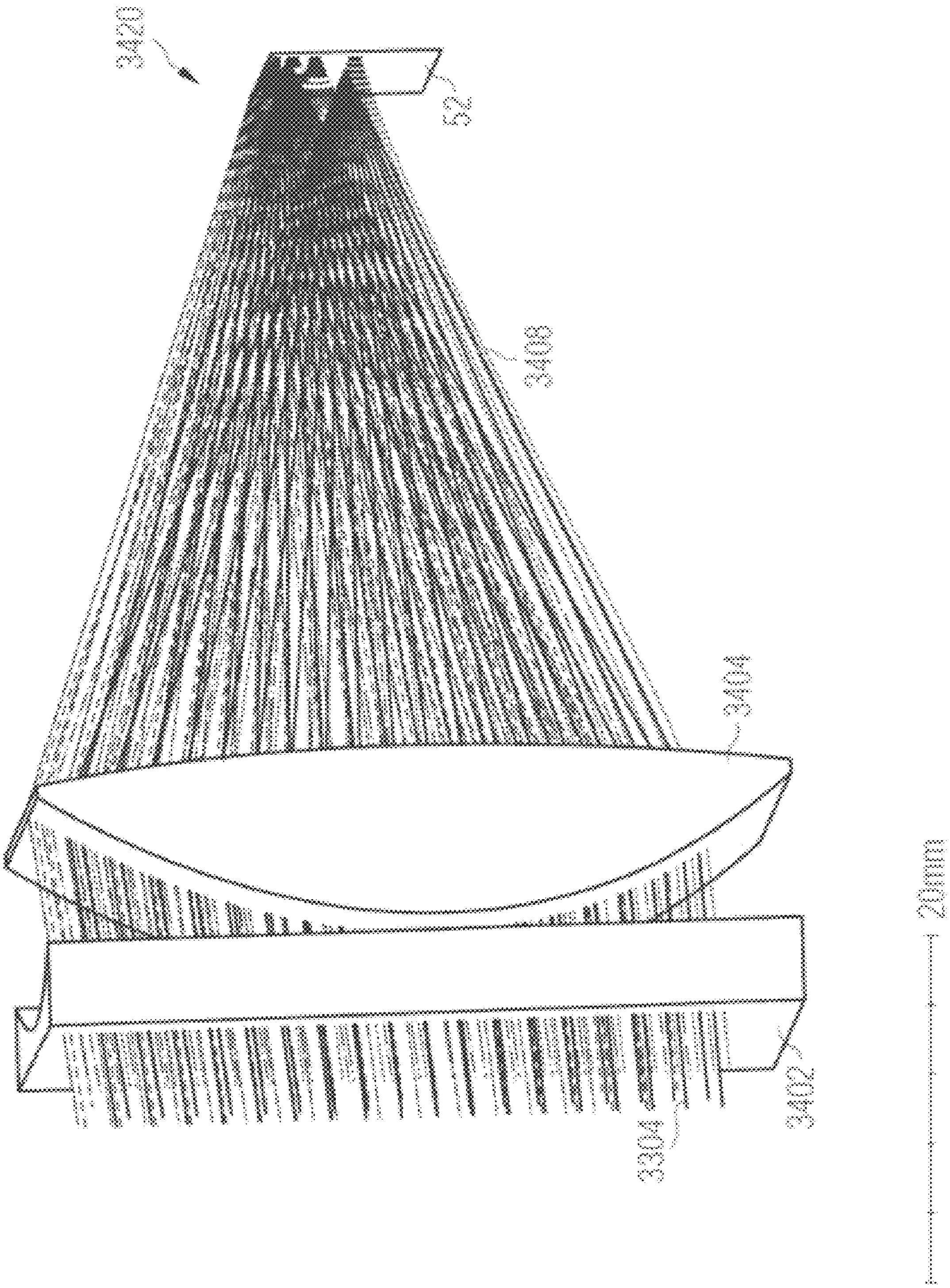
FIG. 34B shows a three-dimensional view of an optical system for a LIDAR Sensor System in accordance with various embodiments without a collector optics arrangement.
Figure 34D:
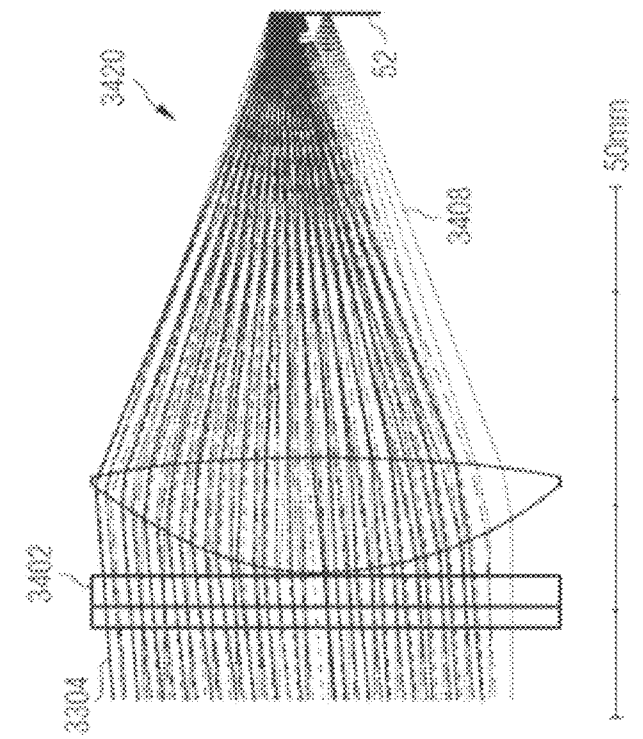
FIG. 34D shows a side view of an optical system for a LIDAR Sensor System in accordance with various embodiments without a collector optics arrangement.
Figure 34C:
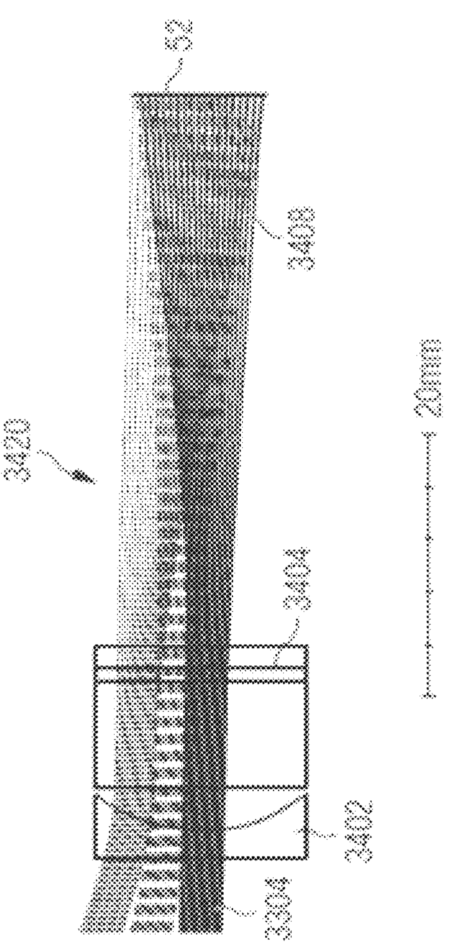
FIG. 34C shows a top view of an optical system for a LIDAR Sensor System in accordance with various embodiments without a collector optics arrangement.

FIG. 34B shows a three-dimensional view of an optical system 3420 for a LIDAR Sensor System in accordance with various embodiments without a collector optics arrangement. FIG. 34C shows a top view of the optical system of FIG. 34B and FIG. 34D shows a side view of the optical system of FIG. 34B.

Compared with the optical system 3400 as shown in FIG. 34A, the optical system 3420 of FIG. 34B does not have the collector optics arrangement 3406. The collector optics arrangement 3406 is optional, e.g. in case that a horizontal focussing is not required. The optical system 3420 as shown in FIG. 34B allows for a simpler and thus cheaper design for a mapping in vertical direction.

Figure 35:
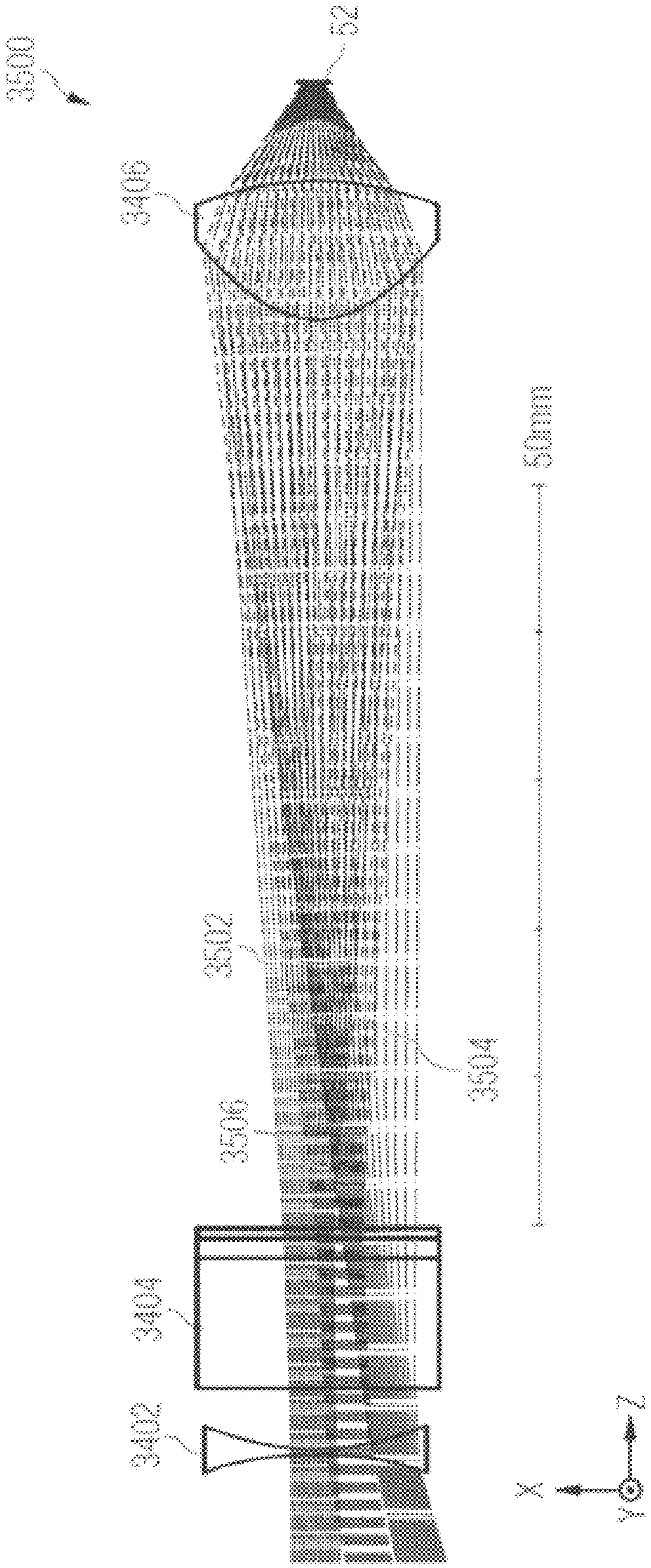
FIG. 35 shows a top view of an optical system for a LIDAR Sensor System in accordance with various embodiments.
Figure 36:
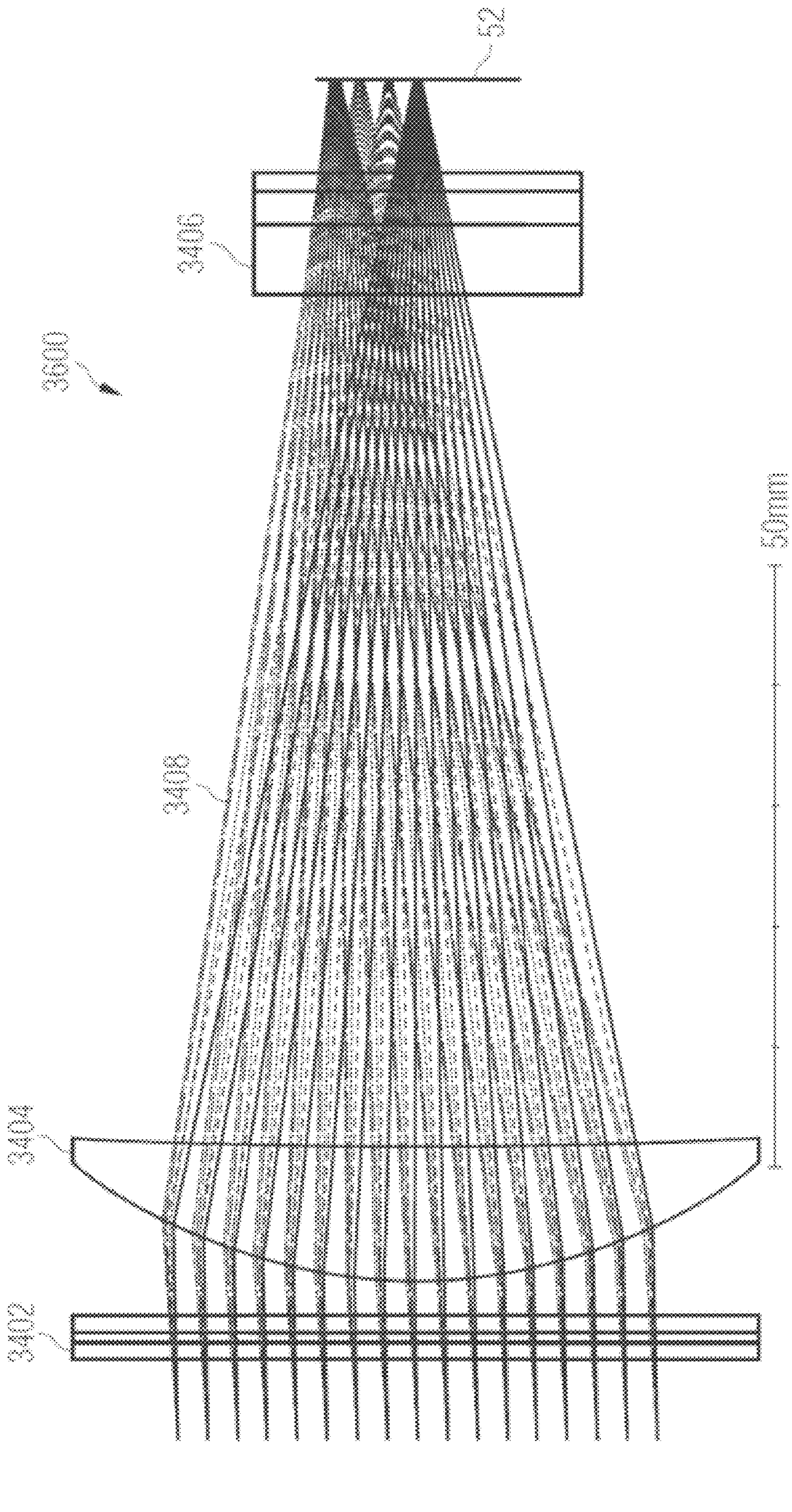
FIG. 36 shows a side view of an optical system for a LIDAR Sensor System in accordance with various embodiments.

FIG. 35 shows a top view 3500 of the optical system 3400 for a LIDAR Sensor System in accordance with various embodiments. FIG. 36 shows a side view 3600 of the optical system 3400 for a LIDAR Sensor System in accordance with various embodiments. As shown in FIG. 35, light beams 3504 being imaged to the sensor and coming through an entrance opening, such as for example a window (not shown) under a rather large side angle (e.g. first light beams 3504 as shown in FIG. 35) are refracted towards the direction of the optical axis 3410 of the optical system 3400. In other words, light beams 3504 coming through the window under a rather large angle with respect to the optical axis 3410 (e.g. first light beams 3504 as shown in FIG. 35) are refracted towards the direction of the optical axis 3410 of the optical system 3400.

Light beams 3502, 3506 coming through the window under a smaller side angle, e.g. even under a side angle of almost 0° (e.g. second light beams 3506 or third light beams 3502 as shown in FIG. 35) are less refracted into the direction of the optical axis 3410 of the optical system 3400. Due to the refraction provided by the optics arrangement 3402 having e.g. a negative focal length in the horizontal direction, the imaging optics arrangement 3404 may be designed for substantially smaller horizontal angles. Thus, the imaging optics arrangement 3404 may be implemented as a cylinder lens or as an acylinder lens (i.e. an aspherical cylinder lens). As shown in FIG. 35, the imaging optics arrangement 3404 may be located downstream (with respect to the light path) with respect to the optics arrangement 3402. The collector optics arrangement 3406 may be located downstream (with respect to the light path) with respect to the imaging optics arrangement 3404. The collector optics arrangement 3406 may be configured to focus the first and second light beams 3504, 3506 in the direction of the sensor 52 so that as much light as possible of the first and second light beams 3504, 3506 hits the surface of the sensor 52 and its sensor pixels.

As shown in FIG. 36, the light beams 3502, 3504, 3506 (the entirety of the light beams 3502, 3504, 3506 will be referred to as light beams 3408) are deflected towards the surface of the sensor 52. Thus, illustratively, the imaging optics arrangement 3404 is configured to focus the light beams 3502, 3504, 3506 towards the sensor 52 with respect to the vertical direction.

As already described above, the light beams 3504 coming through the window 3502 under a rather large side angle (e.g. first light beams 3504 as shown in FIG. 35) are refracted into the direction of the optical axis of the optical system 3400 by the optics arrangement 3402. Illustratively, the optics arrangement 3402 refracts light beams from a large field of view to smaller angles to the collector optics arrangement 3406 arranged in front of the sensor 52. This allows to design the imaging optics arrangement 3404 for substantially smaller angular ranges. This results in various embodiments in a reduction of the width of the optical system 3400 by a factor of for example seven as compared with the conventional optical system 3300 as shown in FIG. 33.

FIG. 37A shows a top view 3700 of an optical system for a LIDAR Sensor System in accordance with various embodiments. FIG. 37B shows a side view 3706 of an optical system for a LIDAR Sensor System in accordance with various embodiments.

As an alternative, as shown in FIG. 37B and FIG. 37C, an optical system 3700 may include an optics arrangement 3702 having a positive focal length in the horizontal direction (e.g. implemented as a collecting lens 3702). Also in this case, the imaging optics arrangement 3404 may be designed for substantially smaller horizontal angles. Thus, the imaging optics arrangement 3404 may be implemented as a cylinder lens or as an acylinder lens (i.e. an aspherical cylinder lens). In this example, a virtual image 3704 is generated in front of the collector optics arrangement 3406 (only in the horizontal plane). The collector optics arrangement 3406 provides an imaging of the virtual image 3704 onto the sensor 52. It is to be noted that the function of the optics arrangement 3702 having a positive focal length in the horizontal direction is the same as the optics arrangement 3402 having a negative focal length in the horizontal direction: the light beams are widened so that the collector optics arrangement 3406 is illuminated as much as possible (e.g. substantially completely) and the angle between the light beams of interest and the optical axis 3410 is reduced. One effect of these embodiments may be seen in that the light fits through a very narrow aperture (having a width of only a few mm) in front of the optics arrangement 3702. Furthermore, the aperture planes in horizontal direction and in vertical direction may be positioned very close to each other, which may be efficient with respect to the blocking of disturbing light beams. FIG. 37B shows, similar to FIG. 36, how the light beams are focused towards the sensor (52) with respect to the vertical direction.

FIG. 37C shows a three-dimensional view 3710 of an optical system for a LIDAR Sensor System in accordance with various embodiments including an optics arrangement 3704 having a positive focal length in the horizontal direction.

It is to be noted that the optics arrangement 3402 may also be located downstream with respect to the imaging optics arrangement 3404 but upstream with respect to the collector optics arrangement 3406. In these embodiments, the effect of the design of some optical components for a smaller angular ranges may apply only to those optical components which are located between the optics arrangement 3402 and the collector optics arrangement 3406.

Furthermore, all the optics arrangements provided in the optical system may be implemented as one or more mirrors or as one or more optical components other than the one or more lenses.

As already indicated above, the optics arrangement may have a positive focal length in the first direction, e.g. in the horizontal direction. In this case, a real intermediate image is generated between the optics arrangement 3402 and the collector optics arrangement 3406. The collector optics arrangement 3406 may then map the real intermediate image to the sensor 52.

FIG. 37D shows a three-dimensional view 3720 of an optical system for a LIDAR Sensor System in accordance with various embodiments including a freeform optics arrangement 3722 being implemented as a freeform lens 3722. FIG. 37E shows a top view of the optical system of FIG. 37D and FIG. 37F shows a side view of the optical system of FIG. 37D.

Illustratively, the optics arrangement 3402 and the imaging optics arrangement 3404 may be implemented by exactly one freeform lens 3722 (or a plurality of freeform lenses). As an alternative, the optics arrangement 3402 and the imaging optics arrangement 3404 may be implemented by exactly one single refracting surface (or a plurality of refracting surfaces) and/or by exactly one single reflective surface (or a plurality of reflective surfaces).

Various embodiments are suitable for all anamorphic optics arrangements. The effects are becoming stronger the larger the differences of the focal lengths in the different planes are.

The optical system 3400 may be part of the second LIDAR sensing system 50. The second LIDAR sensing system 50 may further include a detector (in other words sensor) 52 arranged downstream in the optical path of the optical system 3400. The sensor 52 may include a plurality of sensor pixels and thus a plurality of photo diodes. As described above, the photo diodes may be PIN photo diodes, avalanche photo diodes, and/or single-photon avalanche photo diodes. The second LIDAR sensing system 50 is may further include an amplifier (e.g. a transimpedance amplifier) configured to amplify a signal provided by the plurality of photo diodes and optionally an analog-to-digital converter coupled downstream to the amplifier to convert an analog signal provided by the amplifier into a digitized signal. In various embodiments, the first LIDAR sensing system 40 may include a scanning mirror arrangement configured to scan a scene. The scanning mirror arrangement may for example be configured to scan the scene by a laser strip extending in the second (e.g. vertical) direction in the object space.

In all the embodiments described above, a first ratio of a field of view of the optical system in the horizontal direction and a field of view of the optical system in the vertical direction may be greater than a second ratio of a width of the detector region and a height of the detector region. By way of example, the first ratio may be greater than the second ratio by at least a factor of two, e.g. by at least a factor of five, e.g. by at least a factor of ten, e.g. by at least a factor of twenty. In an implementation, the field of view of the optical system in the horizontal direction may be about 60° and the field of view of the optical system in the vertical direction may be about 12°. Furthermore, in an implementation, a width of the detector region may be about 2.5 mm and/or a height of the detector region may be about 14 mm.

Various embodiments as described with reference to FIG. 33 to FIG. 37 may be combined with the embodiments as described with reference to FIG. 120 to FIG. 122.

In the following, various aspects of this disclosure will be illustrated:

Example 1c is an optical system for a LIDAR Sensor System. The optical system includes an optics arrangement having a negative focal length in a first direction or a positive focal length in the first direction, an imaging optics arrangement configured to refract light in a second direction. The second direction forms a predefined angle with the first direction in a plane substantially perpendicular to the optical axis of the optical system.

In Example 2c, the subject matter of Example 1c can optionally include that the optical system includes a collector optics arrangement downstream in the optical path of the optics arrangement and the imaging optics arrangement and configured to focus a light beam coming from the optics arrangement and the imaging optics arrangement in the first direction towards a predetermined detector region.

In Example 3c, the subject matter of any one of Examples 1c or 2c can optionally include that the predefined angle is selected to be in a range from about 80° to about 100°.

In Example 4c, the subject matter of Example 3c can optionally include that the predefined angle is selected to be approximately 90°.

In Example 5c, the subject matter of any one of Examples 1c to 4c can optionally include that a first ratio of a field of view of the optical system in the horizontal direction and a field of view of the optical system in the vertical direction is greater than a second ratio of a width of the detector region and a height of the detector region.

In Example 6c, the subject matter of Example 5c can optionally include that the first ratio is greater than the second ratio by at least a factor of two, e.g. by at least a factor of five, e.g. by at least a factor of ten, e.g. by at least a factor of twenty.

In Example 7c, the subject matter of any one of Examples 1c to 6c can optionally include that the predetermined detector region is larger along the second direction than in the first direction. The field of view of the optics arrangement has a larger extension in the first direction than in the second direction so that the optics arrangement has an anamorphic character.

In Example 8c, the subject matter of any one of Examples 1c to 7c can optionally include that the first direction is the horizontal direction of the optical system. The second direction is the vertical direction of the optical system.

In Example 9c, the subject matter of any one of Examples 1c to 8c can optionally include that the first direction is the vertical direction of the optical system. The second direction is the horizontal direction of the optical system.

In Example 10c, the subject matter of any one of Examples 1c to 9c can optionally include that the optics arrangement is configured to refract light in direction of the optical axis of the optical system.

In Example 11c, the subject matter of any one of Examples 1c to 10c can optionally include that the imaging optics arrangement includes or essentially consists of a cylinder lens or an acylinder lens.

In Example 12c, the subject matter of any one of Examples 1c to 11c can optionally include that the imaging optics arrangement has a width in the range from about 2 mm to about 25 mm.

In Example 13c, the subject matter of any one of Examples 1c to 12c can optionally include that the imaging optics arrangement has a width in the range from about 5 mm to about 20 mm.

In Example 14c, the subject matter of any one of Examples 1c to 13c can optionally include that the optical system has a height in the range from about 1 cm to about 8 cm.

In Example 15c, the subject matter of any one of Examples 1c to 14c can optionally include that the optics arrangement and/or the imaging optics arrangement is made from at least one material selected from a group consisting of: glass; polycarbonate; and poly(methyl methacrylate).

In Example 16c, the subject matter of any one of Examples 2c to 15c can optionally include that the collector optics arrangement is made from at least one material selected from a group consisting of: glass; polycarbonate; and poly(methyl methacrylate).

In Example 17c, the subject matter of any one of Examples 1c to 16c can optionally include that the optics arrangement is located upstream the imaging optics arrangement in the optical path of the optics arrangement.

In Example 18c, the subject matter of any one of Examples 1c to 17c can optionally include that the optics arrangement is located downstream the imaging optics arrangement and upstream the collector optics arrangement in the optical path of the optics arrangement.

In Example 19c, the subject matter of any one of Examples 1c to 18c can optionally include that the optics arrangement and/or the imaging optics arrangement is made from at least one mirror and/or at least one lens.

In Example 20c, the subject matter of any one of Examples 2c to 19c can optionally include that the collector optics arrangement is made from at least one mirror and/or at least one lens.

In Example 21c, the subject matter of any one of Examples 1c to 20c can optionally include that the optics arrangement and the imaging optics arrangement are integrated in one single free-form optics arrangement.

In Example 22c, the subject matter of any one of Examples 1c to 21c can optionally include that the optics arrangement and the imaging optics arrangement are integrated in one single refracting surface and/or in one single reflecting surface.

In Example 23c, the subject matter of any one of Examples 1c to 22c can optionally include that the optical system is configured as an anamorphic optical system.

Example 24c is a LIDAR Sensor System. The LIDAR Sensor System includes an optical system according to any one of the Examples 1c to 23c, and a detector arranged downstream in the optical path of the optical system in the detector region.

In Example 25c, the subject matter of Example 24c can optionally include that the detector includes a plurality of photo diodes.

In Example 26c, the subject matter of any one of Examples 24c or 25c can optionally include that at least some photo diodes of the plurality of photo diodes are avalanche photo diodes.

In Example 27c, the subject matter of Example 26c can optionally include that at least some avalanche photo diodes of the plurality of photo diodes are single-photon avalanche photo diodes.

In Example 28c, the subject matter of any one of Examples 27c can optionally include that the LIDAR Sensor System further includes a time-to-digital converter coupled to at least one of the single-photon avalanche photo diodes.

In Example 29c, the subject matter of any one of Examples 24c to 28c can optionally include that the LIDAR Sensor System further includes an amplifier configured to amplify a signal provided by the plurality of photo diodes.

In Example 30c, the subject matter of Example 29c can optionally include that the amplifier is a transimpedance amplifier.

In Example 31c, the subject matter of any one of Examples 29c or 30c can optionally include that the LIDAR Sensor System further includes an analog-to-digital converter coupled downstream to the amplifier to convert an analog signal provided by the amplifier into a digitized signal.

In Example 32c, the subject matter of any one of Examples 25c to 31c can optionally include that the LIDAR Sensor System further includes a scanning mirror arrangement configured to scan a scene.

In Example 33c, the subject matter of Example 32c can optionally include that the scanning mirror arrangement is configured to scan the scene by a laser strip extending in the second direction in the object space.

In Example 34c, the subject matter of Example 33c can optionally include that the scanning mirror arrangement is configured to scan the scene by a laser strip extending in the vertical direction in the object space.

The LIDAR Sensor System according to the present disclosure may be combined with a LIDAR Sensor Device for illumination of an environmental space connected to a light control unit.

LIDAR systems may be used to ascertain the surroundings of a LIDAR device. Unlike passive light receptacles, such as CMOS cameras or other passive sensing devices, LIDAR devices emit a beam of light, generally laser light, which is reflected and scattered by an object and detected as the reflected light that travels back to a LIDAR system detector.

The light emitted by the LIDAR system in the form of a beam of light or a laser does not always have a uniform or ideal profile. For example, the optical power output of a LIDAR system may vary from laser diode to laser diode or may change based upon diode driving conditions. Additionally, aging LIDAR systems may emit varying optical power profiles when compared to new LIDAR systems.

Present LIDAR systems may struggle to maintain a safe and consistent optical power output while still obtaining a precise detection with a good signal to noise ratio. Mathematically, the optical laser power is reduced by one over the square of distance. Therefore, an object that is twice the distance as another object will return an optical power profile one fourth the optical power profile of the nearer object.

It may, therefore, be provided to increase the power output of the LIDAR system to detect an object twice the distance of another object. Thus, increasing the signal to noise ratio. However, this may not be feasible without exposing the nearer object to potentially undesirable laser energies.

Present LIDAR systems may lack the ability to compensate for nonuniformities within the laser output of a LIDAR system or incongruities within the laser beam signal that is detected by the LIDAR detector. These incongruities may be a result of non-ideal optics, the age of the laser diode, the environmental conditions surrounding the LIDAR system, or the objects at varying distances from the LIDAR system.

In various embodiments, a LIDAR system may be improved by incorporating a spatial light modulator to modulate the laser power output. This allows to generate a well-defined and adaptable laser beam profile. The spatial light modulator can be situated optically downstream of the laser diode or origin of the laser output.

In various embodiments, the spatial light modulator may modulate the laser power output on a pixel-by-pixel basis. In this way the laser power output may be modified, shaped, or contoured to achieve an ideal or uniform power output distribution. In other various embodiments the laser power output may be intentionally distorted in order to compensate or be adjusted for proper illumination of objects in the LIDAR field of view.

The LIDAR system may be configured to monitor and regulate the laser power output in real-time. This may be accomplished via a feedback loop from the LIDAR optical sensor to a spatial light modulator. The real-time laser output modulation may occur on a pixel-by-pixel basis via a spatial light modulator controller.

The regulation of the laser power output may be used not only to shape and normalize the laser power output, but it also may be used in instances when a laser diode wears out, fails, or doesn't function according to the specifications. For example, a lifetime of laser diodes or several diodes may be included within a LIDAR system package such that when a laser diode wears out, fails, or misfunctions, a new laser diode may be present to simultaneously replace the non-compliant diode with a new diode. As such, the laser output of the new laser diode may be modified by the spatial light modulator such that it corresponds to an ideal laser power output or, alternatively, the power output of the previous laser diode before it misbehaved.

In various embodiments, the spatial light modulator may be used to shape a LIDAR field of view, such that the signal to noise ratio is optimized. Therefore, in the case of an object that is twice the distance from the LIDAR system as another object, the laser power output may be adjusted such that the power output is lower in the region of the field of view where the nearer object is located and the power output would be higher in the field of view where the object farther away is located.

Furthermore, where a bystander may be detected through the LIDAR sensor system via an object classification system, the laser output may be attenuated in that region of the LIDAR system field of view such as to reduce the energy exposure to the bystanders or other traffic participants, and thus reduce any potential unwanted exposure of higher-energy laser output. This may act as a fail-safe and increase the safety characteristics of the LIDAR system, e.g. regarding its eye-safety characteristics.

Finally, the spatial light modulator may be employed to linearly polarize the light emitted by the LIDAR system according to various embodiments. Therefore, the light emitted and reflected back to the LIDAR system sensor (in other words the light in the emitter path or the light in the receiver path) may be linearly polarized or circularly polarized. In such an embodiment, the LIDAR system sensor may be configured, e.g. by use of polarization filters, to detect only the plane-polarized or circularly polarized light, which may increase signal-to-noise ratio, as various other polarizations of environmental light may be filtered out before the light is incident on or is sensed by the LIDAR system sensor.

FIG. 59 shows a LIDAR sensor system 5900 according to various embodiments. In various embodiments, the LIDAR sensor system is a Flash LIDAR system. In various embodiments, the LIDAR system is a Scanning LIDAR system. The LIDAR sensor system 5900 may include a laser source 5902 which has at least one laser diode for the production of light, a first optics arrangement 5906, a spatial light modulator 5910, a second optics arrangement 5908, and a spatial light modulator controller 5914. It is to be noted that the signal processing and/or the generating of control signals to control the spatial light modulator 5910 (e.g. by the spatial light modulator controller 5914) may be implemented using Artificial Intelligence, e.g. Deep Learning algorithms (e.g. using one or more neural networks). In combination, the components of the LIDAR sensor system 5900 create a field of view 5912 of the LIDAR system 5900. The LIDAR sensor system 5900 may include additional components such as are necessary to detect an optical profile with a clear signal and a high intensity contrast or high signal to noise ratio.

In various embodiments, the laser source 5902 emits a laser beam having a wavelength in the infrared wavelength region and directs the laser light into a laser path 5904 towards the field of view 5912. As such, the first optics arrangement 5906 may be situated optically downstream of the laser source 5902. Thereafter, the spatial light modulator 5910 may be situated optically downstream of the first optics arrangement 5906. The second optics arrangement may be situated optically downstream of the spatial light modulator 5910.

The first optics arrangement 5906 and the second optics arrangement 5908 may serve the purpose of refracting the light before and after the spatial light modulator 5910. Where the spatial light modulator 5910 is divided into pixilated regions, the first optics arrangement 5906 may serve to direct the light through those pixelated regions such that the light is transmitted through the spatial light modulator 5910. The second optics arrangement 5908 may serve to refract the light downstream of the spatial light modulator 5910. Therefore, light may be directed into various regions of the field of view 5912. In various embodiments the second optics arrangement 5908 may serve to refract the light such that it expands into the field of view 5912.

In various embodiments, there may be one or more lenses within the first optics arrangement 5906. Alternatively or additionally, the first optics arrangement 5906 may include diffractive optical elements (DOE) and/or holographic optical elements (HOE). Furthermore, there may be one or more lenses within the second optics arrangement 5908. The first optics arrangement 5906 may be a convex lens. The second optics arrangement 5908 also may be a convex lens. According to various embodiments, the first optics arrangement 5906 and the second optics arrangement 5908 may be configured to possess an angle of curvature ideal for the size and shape of the spatial light modulator 5910 and the field of view 5912. The first optics arrangement 5906 may be configured to have an angle of curvature such that light may be collimated into the spatial light modulator. Furthermore, the second optics arrangement 5908 may be configured to refract light into the optimal dimensions of the field of view 5912.

As discussed previously, the spatial light modulator 5910 may be pixelated, such that the length and width of the spatial light modulator 5910 are segmented into regions with controllable properties. This pixelation may take the form of rectangular or square regions assignable as a "pixel" of the spatial light modulator 5910. However, the pixels may take any shape necessary to segment the spatial light modulator 5910.

The spatial light modulator 5910 may take the form of a liquid crystal display (LCD), a liquid crystal on silicon device (LCoS) or a liquid crystal device panel including a liquid crystal pixel array. In various embodiments, the LCD may be comprised of metamaterials. In various embodiments, the spatial light modulator 5910 may include a liquid crystal metasurface (LCM). In various embodiments, the spatial light modulator 5910 may include liquid crystal polarization gratings (LCPG), or the spatial light modulator 5910 may include one or more digital mirror devices (DMD).

The spatial light modulator 5910 is configured to regulate the laser power output. By way of example, it may be used to regulate the laser output on a pixel-by-pixel basis. The spatial light modulator 5910 may include hundreds, thousands, millions, or billions of pixels, but is not limited in numbers of pixels assignable to regions of the spatial light modulator 5910. The pixels of the spatial light modulator 5910 may be mechanically defined or theoretically defined. The pixels themselves may be regions of a continuous and uniform display region assignable as a pixel.

The spatial light modulator controller 5914 may control the spatial light modulator 5910 in real time, although it may be foreseeable that the spatial light modulator 5910 could be calibrated periodically instead of real-time modulation, such as in the case of a non-ideal power output profile due to ageing. Therefore, the spatial light modulator 5910 may be calibrated periodically as the LIDAR sensor system 5900 and LIDAR diodes age. Furthermore, the spatial light modulator 5910 may be initially calibrated before the LIDAR sensor system 5900, which incorporates it, is put into use. From time to time, the LIDAR sensor system may additionally be upgraded with upgrade parameters loaded into the firmware of the LIDAR sensor system 5900. These upgrade parameters may modify the field of view 5912 or laser beam profile, or they may upgrade the configuration of the spatial light modulator 5910. As such, the spatial light modulator 5910 may be optimized from time to time in order to achieve an optimal laser beam profile.

Real-time control of the spatial light modulator 5910 by the spatial light modulator controller 5914 may happen in the order of seconds, milliseconds, microseconds, or nanoseconds. For example, control and real-time modulation of a liquid crystal metasurface operating as a spatial light modulator 5910 may occur on a timescale of 1 to 100 microseconds or 500 nanoseconds to 1 microsecond as may be required by metasurface relaxation time. Control and real-time modulation of a digital mirror device operating as a spatial light modulator 5910 may occur in the order of 1 to 100 microseconds or 900 nanoseconds to 20 microseconds as may be required by mirror relaxation time.

In various embodiments, control of the individual pixels occurs via electromagnetic signals. For example, control of the spatial light modulator 5910 pixels may occur via an applied voltage difference to individual pixels. It may additionally occur as a function of current to the individual pixels.

In various embodiments, it may be desirable to add monitoring sensor circuitry to the LIDAR sensor system 5900 such that the monitoring sensor circuitry can evaluate, in real-time, the percentage of optical power being absorbed or blocked by a spatial light modulator.

In various embodiments, the field of view 5912 of the LIDAR sensor system 5900 corresponds to the aperture of the second optics arrangement 5908. In various embodiments, it corresponds with the aperture of the spatial light modulator 5910. It may correspond with the aperture of the LIDAR system sensor 5916 (e.g. the sensor 52), which at least detects light reflected by objects within the field of view of the LIDAR sensor system 5900 aperture.

FIG. 60 shows the high spatial distribution variance of the optical power of the laser emission at a distance of 1.5 m without the use of any lenses, hereinafter also termed as optical power grid 6000. This grid is divided into various pixels, which may be segmented along the x-axis distance 6004 and the y-axis distance 6006. The grid may include various low optical power pixels, such as low optical power pixel 6008, and high optical power pixels, such as high optical power pixel 6010. The optical power grid 6000 contains an optical power gradient 6002 which corresponds to high optical power values (for example 250-400) and low optical power usage (for example 0-200). A heat map, such as seen when viewing the optical power grid 6000 along the x-axis distance 6004 and the y-axis distance 6006, may be used to assess which pixels correspond to high optical power usage and low optical power usage. Such a heat map may represent the varying optical power transmitted to the spatial light modulator in a pixel-by-pixel basis and may correspond to various dimensional characteristics of a liquid crystal pixel array. In various embodiments, the optical power may range from a high peak of about 480 $mW/m^2$ to a low peak of about 150 $mW/m^2$.

Such an optical power grid 6000 may represent the optical power which is transmitted into the FOV and which therefore has a direct influence on the optical power incident upon the LIDAR system sensor 5916 as to a result of the reflected laser 5918. Such a heat map may symbolize that the optical power received by the LIDAR system sensor 5916 is highly non-uniform. For example, regions of peak power vary from laser diode to laser diode or as a result of laser diode driving conditions. For example, there may be up to or exceed a 30% difference between the optical power detected at is varying pixels. Variations in optical power may be present at the spatial light modulator 5910, where the laser diode is aging for example, or the power variations may be ultimately observed at the LIDAR system sensor 5916. Furthermore, it is to be noted that the signal incident on the LIDAR system sensor 5916 may in addition be influenced by the scattering properties of the objects from which the laser light is reflected towards the LIDAR system sensor 5916.

The variations in optical power, such as those shown in the optical power grid 6000 can be applied to a feedback loop according to various embodiments. For example, the LIDAR system sensor 5916, or a processor connected to the LIDAR system sensor 5916, may send a feedback loop through spatial light modulator controller 5914 to control the pixels of the spatial light modulator 5910 so that the laser power output downstream of the spatial light modulator 5910 is altered. This altering may be a normalization of the optical power distribution, a shaping of the optical power distribution, or some other uniform or non-uniform modification of the optical power output. The modified light optically downstream of the spatial light modulator 5910 may be described as a laser beam profile, which will be discussed later. In various embodiments, a first laser beam profile may describe the laser before being transmitted through the spatial light modulator 5910 and a second laser beam profile may refer to the laser after being transmitted through the spatial light modulator 5910. Unless specifically referenced as a first laser beam profile, a "laser beam profile" refers to the second laser beam profile.

In various embodiments there may be a first predefined laser beam profile and a second predefined laser beam profile. The first predefined to laser beam profile may be horizontal and the second laser beam profile may be vertical. The first or second predefined laser beam profile may have a uniform or non-uniform distribution and the other of the first or second predefined laser beam profile may have a uniform or non-uniform distribution. Alternatively, both the first and second predefined laser beam profiles may is have uniform or non-uniform distributions.

The first predefined laser beam profile may correspond to a far-field distribution parallel to the p-n junction of the laser diode or a far-field distribution perpendicular to the p-n junction of the laser diode. The second predefined laser beam profile may alternatively correspond to a far-field distribution parallel to the p-n junction of the laser diode or a far-field distribution perpendicular to the p-n junction of the laser diode.

FIG. 61 shows a liquid crystal device 6100 according to various embodiments. For example, this liquid crystal device can perform a modulation of the laser output pixel by pixel so as to contour the desired laser beam profile, whether it be a normalization or otherwise.

Within the liquid crystal device 6100 there are liquid crystals 6102. Such liquid crystals may alter the polarization or intensity of the laser beam, such as by responding to an applied voltage 6106 across the liquid crystal device 6100. An applied voltage 6106 may be controlled pixel-by-pixel such that various regions of the liquid crystal device 6100 can modify the optical power output in real time.

The optical axis 6104 of light is shown as passing through the liquid crystal device 6100. This may correspond to the laser path 5904 as the laser beam passes through the first optics arrangement 5906, spatial light modulator 5910, and second optics arrangement 5908 optically downstream of the laser source 5902. The optical properties of light or a laser output can be altered as the light passes through the liquid crystal device 6100. For example, as a result of the orientation of the liquid crystals 6102 due to the applied voltage 6106, the laser beam may be linearly polarized. Portions of the light may be reflected or absorbed due to various properties of the liquid crystals 6102. It is to be noted that the liquid crystals 6102 themselves do not generate a specific polarization state. Instead they can change the orientation, e.g. of linearly polarized light.

FIG. 62 shows a liquid crystal device 6200 according to various embodiments. The polarization device, as shown in this figure, may contain a polarization filter 6202. This polarization filter 6202 can operate to filter out up to one-half of unpolarized light that is directed through the filter. Or in other words, where unpolarized light is thought of as an average of half its vibrations in the horizontal plane and half of its vibrations in a vertical plane, a vertical polarization filter 6202 would filter out all vibrations in the horizontal plane. Hence, a vertical filter would remove one-half of unpolarized light that is directed through it. Or in other words, polarization filter 6202 allows only light with a specific linear polarization to pass through it.

Furthermore, a variety of liquid crystal orientations 6210 could serve to change the polarization orientation or attenuate the light directed through the polarization device 6200, for example, where the liquid crystals are oriented at an initial point 6204 that is parallel to the polarization filter 6202. The change of orientation of the liquid crystals 6206 results in a change of the polarization orientation of the light passing the liquid crystal device 6200 from a vertical polarization orientation at the initial point 6204 to a horizontal polarization orientation at an endpoint 6208 position that is perpendicular to the polarization filter 6202.

FIG. 63 shows various optical power distributions according to various embodiments. A non-normalized power distribution 6302 is shown (on the left side of FIG. 63) having an angle axis 6312, where the center of the distribution may be equal to an angle of zero, and an optical power axis 6314. A normalized optical power distribution 6304 is shown (on the right side of FIG. 63) also having an angle axis 6312 and an optical power axis 6314. The normalized optical power distribution 6304 shows a region differing from the non-normalized optical power distribution 6302 because it is characterized by an attenuated optical power zone 6306, which is contained inside the dotted line. This attenuated optical power zone 6306 is a result of the spatial light modulator 5910 normalizing the optical power output. An additional line is shown as the attenuation threshold 6308, to which the optical power is normalized. Finally, a first region and a second region which are on both sides arranged outside the attenuated optical power zone 6306 are regions in which the optical power is below the attenuation threshold 6308 and may be referred to as sub-threshold optical power 6310 (un-attenuated). The normalized optical power distribution 6304 resembles a so-called flat-hat design.

A normalized laser beam profile may be accomplished as shown in FIG. 63, where power output is attenuated above an attenuation threshold 6308, or a normalized laser beam profile may have a shape that appears convex, concave, or Gaussian. As such, a normalized laser beam profile can be generally adapted to a specific situation or application.

FIG. 64 shows laser beam profile shaping according to various embodiments. The figure shows a LIDAR system similar to FIG. 59, showing a laser source 5902, a first optics arrangement 5906, a second optics arrangement 5908, and a spatial light modulator 5910. The field of view 5912 is shown with two additional segments including a lower power region 6406 and a high power region 6408.

After the laser source 5902 and before the spatial light modulator 5910 there is an unshaped optical power distribution 6402. In other words, the shown profile 6402 represents, for example, an unshaped power distribution in a horizontal plane in the optical axis, and may vary for different horizontal planes. After the spatial light modulator 5910, there is a shaped optical power distribution 6404. In other words, the shown profile 6404 represents, for example, a shaped power distribution in a horizontal plane in the optical axis, and may vary for different horizontal planes. Each of those optical power distributions may correspond to the optical power before the spatial light modulator 5910, represented by the unshaped optical power distribution 6402, and the optical power after the spatial light modulator 5910, represented by the shaped optical power distribution 6404. The shaped optical is power distribution 6404 has a shaped portion 6412 and an unshaped portion 6410. The terms 'shaped' and 'unshaped' describe the attenuation of a laser beam in a certain angular direction in a respective horizontal plane.

According to an embodiment where the optical power distribution is shaped, the shaped portion 6412 may correspond to optical power attenuation in the low power region 6406 of the field of view 5912, and the unshaped portion 6410 may correspond to the high power region 6408 of the field of view 5912. Shaping in the field of view 5912 may be beneficial when objects have varied distances from the LIDAR system such that an essentially uniform laser power is detected by the LIDAR system sensor 5916. Shaping may also occur where a bystander is detected within the field of view, as will be discussed later.

FIG. 65 shows a vehicle and a field of view. Shown within the figure is a LIDAR vehicle 6502 that generally is a car, but could be a boat, airplane, motorbike, or the like. Within the field of view 5912 are arrows representing an intensity along an intensity distribution pattern 6504 from the LIDAR vehicle 6502. As in FIG. 64 there is a shaped portion 6412 and an unshaped portion 6410 of the laser beam profile in the field of view 5912. The shaped portion 6412 may correspond to a low power region 6406 and the unshaped 6410 may correspond to a high power region 6408. It is to be noted that FIG. 65 shows an exemplary cross-section through an intensity distribution pattern along a horizontal direction (e.g. a direction parallel to the surface of a roadway). Along a vertical direction (e.g. a direction perpendicular to the surface of a roadway) further cross-sectional planes may be envisioned, with intensity distribution patterns that can be shaped in the same way like explained above, i.e. the intensities emitted along specific directions of the field of view can be attenuated (or not attenuated) in order to generate corresponding shaped (or unshaped) portions along these directions.

For example, and according to various embodiments, when another vehicle is within a short distance 6504 of the LIDAR vehicle 6502 the laser beam profile would be shaped so that a low power region 6406 corresponds to its location. However, when another vehicle is at a distance 6504 farther away from the LIDAR vehicle 6502, the laser beam profile would be shaped so that a high power region 6408 corresponds to its location. This may be performed in order to account for the reduction of laser power by one over the square of the distance 6504 another vehicle is located from the LIDAR vehicle 6502.

When non-uniform or undesirable laser power outputs are normalized or shaped by a spatial light modulator 5910, this may reduce the distortion or variance in light received at the LIDAR system sensor 5916. Such contouring, normalization, or shaping of the laser beam profile allows the LIDAR sensor system 5900 to accurately and optimally view objects at varying distances. This minimizes the effect of laser power being reduced by one over the square of the distance 6504 another vehicle is away from the LIDAR vehicle 6502.

Another illustrative example of laser beam profile shaping may be found in FIG. 66. In this example, there is a first vehicle 6602 within a shorter distance from the LIDAR vehicle 6502, a second vehicle 6604 at a larger distance from the LIDAR vehicle 6502, and bystanders 6606 within the field of view 5912 of the LIDAR sensor system 5900. Similar to FIG. 65, the laser beam profile would be shaped (with respect to a horizontal direction of the FOV) such that a low power region 6406 corresponds to the first vehicle 6602 that is nearer to the LIDAR vehicle 6502 and a high power region 6408 corresponds to the second vehicle 6604 that is farther away from the vehicle. The laser beam profile may be further shaped so that in the region of the bystanders 6606, there may be an attenuation zone 6610, such that the optical power may be attenuated or that the attenuation zone 6610 may model the lower power region 6406. This attenuation zone 6610 may be contoured such that any potentially unwanted radiation will not be directed towards the bystanders 6606. The attenuation zone 6610 may at times be a zone where laser emission is completely disabled. A delineation 6608 may mark the outer contours of the attenuation zone 6610. An object classification may be employed to classify objects in the field of view 5912 such as bystanders, vehicles, buildings, etc.

This information, such as the location of the bystanders 6606, first vehicle 6602, and second vehicle 6604 may be mapped in a grid-like fashion that may correspond with the pixels in the spatial light modulator 5910. This grid view, or spatial light modulator matrix 6612, could correspond pixel for pixel with the spatial light modulator 5910 pixels, or it could correspond to a conglomerate of groups of pixels of the spatial light modulator 5910 into larger regions.

FIG. 67 shows light vibrations and polarizations. As an illustration, we can see that environmental light 6702 may have light vibrations in various directions, such as in a vertical optical axis 6708, horizontal optical axis 6706, or angled optical axes 6710 and 6712. However, plane-polarized light 6704 may have a net or average vector sum of vibrations in one axis, such as the horizontal optical axis 6706 shown here. A reflection point 6714 may be a location where the environmental light 6702 becomes linearly polarized according to various properties of the reflection surface (e.g. a nonmetallic surface such as the asphalt of a roadway, a painted vehicle's surface, or water of a pond, as illustrated). In other words, FIG. 67 shows how unpolarized light, for example sunlight, becomes polarized with a polarization that is parallel with the plane of the reflecting surface.

The average vector sum of polarized light can be explained in one or more ways. One way to interpret the average vector sum of vibrations of polarization in the horizontal optical axis 6706 is to look at angled optical axes 6710 and 6712. Both angled optical axes, as shown in FIG. 67, are perpendicular or orthogonal to each other, although these angled axes may be a variety of angles between the horizontal optical axis 6706 and the vertical optical axis 6708. However, when the two angled optical axes 6710 and 6712 are orthogonal or perpendicular to each other, the average vector vibration may be in the horizontal optical axis 6706 or in the vertical optical axis 6708.

For example, where the light vibration of angled axis 6710 is 45 degrees in the coordinate of the negative x-axis/positive y-axis and the light vibration of the angled axis 6712 is 45 degrees in the coordinate of the positive x-axis/positive y-axis, the sum of the vectors of their vibrations lies in the positive y-axis. Correspondingly, as their vibrations oscillate according to their wave-like nature, the light vibration of angled axis 6710 would lie 45 degrees in the coordinate of the positive x-axis/negative y-axis and the light vibration of the angled axis 6712 would be 45 degrees in the coordinate of the negative x-axis/negative y-axis such that the sum of the vectors of their vibrations would lie in the negative y-axis. As such, the light may be said to be polarized along the vertical optical axis 6708, because the sum of the vector vibrations occurs along the y-axis.

In various embodiments, the sum of the vector vibrations in angled axis 6710 and angled axis 6712 may be a first direction. In various embodiments, the sum of the vector vibrations in angled axis 6710 and angled axis 6712 may be a second direction. In various embodiments, the sum of the vector vibrations in the horizontal optical axis 6706 and the vertical optical axis 6708 may be labeled as a first or second direction. In various embodiments, a first direction or second direction may only be referred to in terms of the sum of the vector vibrations and not the vector vibrations themselves, thus it may not be necessary to discuss the two orthogonal vibrations that are averaged together.

Environmental light 6702 is naturally unpolarized, or at most weakly polarized. Polarization may be imparted to the environmental light 6702 when it interacts with materials, particles, or surfaces. For example, when environmental light 6702 is reflected off particular surfaces, such as smooth, dielectric surfaces, the reflection produces plane-polarized light. For example, when the environmental light 6702 strikes a surface at a Brewster's angle, the reflected light would be polarized parallel to the surface. For example, a puddle of water may produce a reflection of light that is plane polarized in the horizontal optical axis 6706. Such interactions may be some of the most common polarization events for environmental light 6702. Environmental light 6702 may additionally be polarized by scattering. For example, when an angle of scattering is orthogonal to the axis of the ray being scattered, polarized light may be generated.

Such natural phenomenon may be advantageously engineered in various embodiments. For example, the light projected into the field of view 5912 of the LIDAR sensor system 5900 may have optical properties imparted to the light that differ from environmental light 6702. Furthermore, the light projected into the field of view 5912 of the LIDAR sensor system 5900 may be configured such that the polarization axis of the projected light would be the opposite of reflected sunlight.

In various embodiments, the laser beam profile may be polarized in the horizontal optical axis 6706 or the vertical optical axis 6708 by the spatial light modulator 5910 or the spatial light modulator 5910 and one or more filters placed optically upstream or downstream of the spatial light modulator 5910. Such polarization may increase the signal to noise ratio of the signal received at the LIDAR system sensor 5916, as various light vibrations or polarizations of environmental light 6702 may be filtered out of the signal before it is incident upon the LIDAR system sensor 5916. For example, in various embodiments, the laser beam profile may have a polarization in the vertical optical axis 6708, such that any environmental light that is plane polarized in the horizontal optical axis 6708 may be filtered out before it is incident upon the LIDAR system sensor 5916. This may filter out signal noise due to reflected environmental light 6702.

Further in various embodiments, the LIDAR sensor system 5900 may be configured such that environmental light 6702 may be filtered out by a filter when its optical axis or the average of vector sum vibrations of its optical axis is orthogonal or perpendicular to the optical axis or the average of the vector sum vibrations of the optical axis of the laser beam profile.

Furthermore, the light projected into the field of view 5912 as a laser beam profile may have a circular polarization imparted to it by the spatial light modulator 5910. The spatial light modulator 5910 and one or more filters or layers placed optically upstream or downstream of the spatial light modulator 5910 may impart this circularly polarized light. Environmental light is rarely circularly polarized, which may allow the filtering out of a large portion of extraneous environmental light 6702 before the signal is incident upon the LIDAR system sensor 5916.

Various other polarizations or combinations of polarizations may be imparted to the laser beam profile to increase the signal-to-noise ratio of the signal received by the LIDAR sensor system 5900. In various embodiments, predetermined portions of the laser beam profile may be polarized or the entire laser beam profile may be polarized.

For the purposes of referencing the LIDAR sensor system 5900 and the use of a spatial light modulator 5910 to shape the field of view 5912 of the LIDAR sensor system 5900 "light" may be interpreted as laser light.

According to example A, the spatial light modulator 5910 is able to actively and dynamically correct, normalize, and adapt the emitted optical power of a laser, or the received optical power incident on a detector, in changing conditions such as changes in the illuminated scene, temperature, external humidity and aging of the laser properties. The changes in the illuminated scene may be determined e.g. by means of a camera (VIS, IR), and/or by means of the LIDAR sensor system 5900, and/or using digital map material, and the like.

According to example B, the spatial light modulator 5910 is able to absorb a precise percentage of laser output power in a defined area of the field-of-view by means of pixels on the liquid crystal panel as a function of time.

According to example C, the spatial light modulator is able to reduce the ambient or background light incident on a detector by the means of controlling the field-of-view accessible to a receiver or detector.

In the following, various aspects of this disclosure may be illustrated:

Example 1g is a LIDAR Sensor System, including a laser source configured to emit at least one laser beam; a spatial light modulator arranged in the laser path of the laser source and including a plurality of pixel modulators; and a modulator controller configured to control the spatial light modulator to modulate laser light impinging onto the spatial light modulator on a pixel-by-pixel basis to generate a predefined laser beam profile in the field of view of the LIDAR Sensor System.

In Example 2g, the subject matter of Example 1g can optionally include that the spatial light modulator includes a liquid crystal device panel including a plurality of liquid crystal pixels of a liquid crystal pixel array. The liquid crystal pixels are individually controllable by the modulator controller.

In Example 3g, the subject matter of Example 2g can optionally include that the liquid crystal device panel includes a liquid crystal on silicon panel.

In Example 4g, the subject matter of any one of Examples 1 g to 3g can optionally include that the spatial light modulator includes or essentially consists of metamaterials.

In Example 5g, the subject matter of Example 4g can optionally include that the spatial light modulator includes or essentially consists of liquid crystal metasurface (LCM).

In Example 6g, the subject matter of any one of Examples 1 g to 3g can optionally include that the spatial light modulator includes or essentially consists of liquid crystal polarization gratings (LCPG).

In Example 7g, the subject matter of Example 1g can optionally include that the spatial light modulator includes or essentially consists of one or more digital mirror devices (DMD).

In Example 8g, the subject matter of any one of Examples 1 g to 7g can optionally include that the spatial light modulator controller is configured to control the spatial light modulator to modulate laser light impinging onto the spatial light modulator on a pixel-by-pixel basis to generate a first predefined laser beam profile in a first direction and a second predefined laser beam profile in a second direction in the field of view of the LIDAR Sensor System.

In Example 9g, the subject matter of Example 8g can optionally include that the second direction is perpendicular to the first direction.

In Example 10g, the subject matter of any one of Examples 8g or 9g can optionally include that the first direction is the horizontal direction and the second direction is the vertical direction.

In Example 11g, the subject matter of any one of Examples 1g to 10g can optionally include that the spatial light modulator is arranged at to a distance from the laser source in the range from about 1 cm to about 10 cm.

In Example 12g, the subject matter of any one of Examples 1g to 11g can optionally include that the LIDAR Sensor System further comprises an optics arrangement between the laser source and the spatial light is modulator.

In Example 13g, the subject matter of any one of Examples 1g to 12g can optionally include that the spatial light modulator controller is configured to control the spatial light modulator to provide linearly polarized light with a polarization plane that is approximately perpendicular to the polarization plane of a horizontal reflection surface.

In Example 14g, the subject matter of any one of Examples 8g to 13g can optionally include that the first predefined laser beam profile has a non-uniform power distribution, and that the second predefined laser beam profile has a normalized power distribution.

In Example 15g, the subject matter of any one of Examples 1g to 14g can optionally include that the laser source includes at least one laser diode.

In Example 16g, the subject matter of Example 15g can optionally include that the laser source includes a plurality of laser diodes.

In Example 17g, the subject matter of any one of Examples 1g to 16g can optionally include that the at least one laser source is configured to emit the laser beam having a wavelength in the infrared region.

In Example 18g, the subject matter of any one of Examples 1g to 17g can optionally include that the LIDAR Sensor System is configured as a Flash LIDAR Sensor System.

In Example 19g, the subject matter of any one of Examples 1g to 17g can optionally include that the LIDAR Sensor System is configured as a Scanning LIDAR Sensor System.

In Example 20g, the subject matter of Example 19g can optionally include that the LIDAR Sensor System further includes a scanning mirror arranged between the laser source and the spatial light modulator.

In Example 21g, the subject matter of any one of Examples 1g to 20g can optionally include that the spatial light modulator linearly polarizes the at least one laser beam.

Example 22g is a method of operating a LIDAR Sensor System. The method may include emitting at least one laser beam via a laser source, and controlling a spatial light modulator to modulate laser light impinging onto the spatial light modulator on a pixel-by-pixel basis to generate a predefined laser beam profile in the field of view of the LIDAR Sensor System, wherein the spatial light modulator is arranged in the laser path of the laser source and comprises a plurality of pixel modulators.

In Example 23g, the subject matter of Example 22g can optionally include that the spatial light modulator includes a liquid crystal device panel including a plurality of liquid crystal pixels of a liquid crystal pixel array. The modulator controller individually controls the liquid crystal pixels.

In Example 24g, the subject matter of Example 23g can optionally include that the liquid crystal device panel includes a liquid crystal on silicon panel.

In Example 25g, the subject matter of any one of Examples 22g to 24g can optionally include that the spatial light modulator includes or essentially consists of metamaterials.

In Example 26g, the subject matter of Example 25g can optionally include that the spatial light modulator includes or essentially consists of liquid crystal metasurface (LCM).

In Example 27g, the subject matter of any one of Examples 22g to 24g can optionally include that the spatial light modulator includes or essentially consists of liquid crystal polarization gratings (LCPG).

In Example 28g, the subject matter of any one of Examples 22g to 24g can optionally include that the spatial light modulator includes or essentially consists of one or more digital mirror devices (DMD).

In Example 29g, the subject matter of any one of Examples 22g to 28g can optionally include that controlling the spatial light modulator includes controlling the spatial light modulator to modulate laser light impinging onto the spatial light modulator on a pixel-by-pixel basis to generate a first predefined laser beam profile in a first direction and a second predefined laser beam profile in a second direction in the field of view of the LIDAR Sensor System.

In Example 30g, the subject matter of Example 29g can optionally include that the second direction is perpendicular to the first direction.

In Example 31g, the subject matter of any one of Examples 29g or 30g can optionally include that the first direction is the horizontal direction and the second direction is the vertical direction.

In Example 32g, the subject matter of any one of Examples 22g to 31g can optionally include that the spatial light modulator is arranged at a distance from the laser source in the range from about 1 cm to about 10 cm.

In Example 33g, the subject matter of any one of Examples 22g to 32g can optionally include that the spatial light modulator is controlled to provide linearly polarized light with a polarization plane that is approximately perpendicular to the polarization plane of a horizontal reflection surface.

In Example 34g, the subject matter of any one of Examples 29g to 33g can optionally include that the first predefined laser beam profile has a non-uniform power distribution, and that the second predefined laser beam profile has a normalized power distribution.

In Example 35g, the subject matter of any one of Examples 22g to 34g can optionally include that the laser source includes at least one laser diode.

In Example 36g, the subject matter of Example 35g can optionally include that the laser source includes a plurality of laser diodes.

In Example 37g, the subject matter of any one of Examples 22g to 36g can optionally include that the at least one laser source is emitting the laser beam having a wavelength in the infrared wavelength region.

In Example 38g, the subject matter of any one of Examples 22g to 37g can optionally include that the LIDAR Sensor System is configured as a Flash LIDAR Sensor System.

In Example 39g, the subject matter of any one of Examples 22g to 37g can optionally include that the LIDAR Sensor System is configured as a Scanning LIDAR Sensor System.

In Example 40g, the subject matter of any one of Examples 22g to 38g can optionally include that the spatial light modulator circularly polarizes the at least one laser beam.

Example 41g is a method for a LIDAR Sensor System according to any one of Examples 22g to 40g. The LIDAR Sensor System is integrated into a LIDAR Sensor Device, and communicates with a second Sensor System and uses the object classification and/or the Probability Factors and/or Traffic Relevance factors measured by the second Sensor System for evaluation of current and future measurements and derived LIDAR Sensor Device control parameters as a function of these factors.

Example 42g is a computer program product. The computer program product may include a plurality of program instructions that may be embodied in a non-transitory computer readable medium, which when executed by a computer program device of a LIDAR Sensor System according to any one of examples 1g to 21g, causes the LIDAR Sensor System to execute the method according to any one of the examples 22g to 41g.

Example 43g is a data storage device with a computer program that may be embodied in a non-transitory computer readable medium, adapted to execute at least one method for a LIDAR Sensor System according to any one of the above method Examples, or LIDAR Sensor System according to any one of the above LIDAR Sensor System Examples.

As already described above, a LIDAR sensor system may have an emitter unit and a receiver unit. Various embodiments provide features for an emitter unit. This emitter unit projects a vertical line into the field-of-view (FOV) that scans horizontally over the targeted region.

When looking back into the source from within the illuminated region, the visible apparent source (virtual source) needs to be substantially larger than a typical scanning mirror. This can help to achieve a low LASER class.

For some system architectures it can be advantageous if segments of the projected line can be switched on and off independently from each other.

Scanning mirrors may be used in combination with scattering elements in order to achieve the above mentioned enlargement of the apparent size of the LIDAR emitter source. This results in projected lines with Gaussian radiant intensity profiles which, however, also causes a spillage of light above and below the targeted region. Since this light is lost for the application, spillage of light leads to a significant reduction of LIDAR system efficiency.

For many applications, it may be provided to have an emitter source which is able to emit light into different vertical segment. It is self-evident, that the segments that should then be switched on and off separately should receive light from different laser emitters that can be switched on and off separately. However, a scattering device would prohibit a sharp separation of segments of the laser line.

FIG. 89 shows an optical component 8900 in accordance with various embodiments. The optical component 8900 may be provided as an optical component 8900 of the First LIDAR Sensing System 40. In case of a scanning system, the First LIDAR Sensing System 40 may include a scanning mirror.

As will be described in more detail below, the optical component 8900 may include an optical element 8902 (e.g. a body 8902—the optical element 8902, however, may include one or more separate elements) having a first main surface 8904 and a second main surface 8906 opposite to the first main surface 8904. The optical component 8900 may include a first lens array 8908 formed on the first main surface 8904 and/or a second lens array 8910 formed on the second main surface 8906. Thus, the optical component 8900 may be provided with a lens array on one main side (on a side of one main surface 8904, 8906) or on both main sides (on the sides of both main surfaces 8904, 8906). In various embodiments, the optical component 8900 may have a curved shape in a first direction (symbolized in FIG. 89 by means of an arrow 8912) of the LIDAR Sensor System 10 (e.g. the horizontal to direction, e.g. the scanning direction of the LIDAR Sensor System 10).

Illustratively, the optical component 8900 is provided having a single-sided or double-sided lens array (e.g. micro-lens array (MLA)). The optical component 8900 may contain cylindrical lenslets 8914 on both sides.

As described above, the optical component 8900 as a whole is may have a curved shape (e.g. bent along a circular radius) so that each lenslet 8914 has the same distance or substantially the same distance to an oscillating MEMS mirror of the LIDAR Sensor System 10. For typical LIDAR applications with a strongly asymmetric aspect ratio of the field-of-view (FOV) (e.g. approximately 10° in vertical direction and approximately 60° in horizontal direction), the curvature may be provided only along e.g. the horizontal direction (e.g. scanning direction), i.e. the optical component 8900 may have an axis of rotational symmetry which is vertically oriented with respect to the FOV. Typical materials for the optical component 8900 may include polycarbonate (PC), polymethyl metacrylate (PMMA), silicone, or glass. It is to be noted that in general, any material that is transparent at the respectively used wavelength and that can be processed may be used in various embodiments.

FIG. 90 shows a top view 9000 (along a vertical direction of the FOV) of a LIDAR emitter unit 40 (in other words the First LIDAR Sensing System) with a plurality of laser diodes as the light source 42, a fast axis collimation lens (FAC) 9002 for all laser diodes together (in this specific example), a slow axis collimation lens (SAC) 9006 for all laser diodes together (in this specific example), a 1D-scanning MEMS (which is an example of the moving mirror 4608) and a double-sided micro-lens array (MLA) 9004 (which is one example of the optical component 8900). A scanning direction (in this example the horizontal direction) of the moving mirror 4608 is symbolized by a scanning arrow 9008. Light produced by the emitters is directed onto the scanning mirror (e.g. by means of collimating lenses) 4608 and passes through the micro-lens array 9004 after being deflected by the scanning (moving) mirror 4608. Depending on the tilt of the moving mirror 4608, light is scanned across the horizontal direction and therefore passes through different regions of the micro-lens array 9004. The axis of rotation of the scanning mirror 4608 should be (approximately) coincident with the axis of rotational symmetry of the MLA 9004. Thus, the effect of the micro-lens array 9004 is practically the same for different tilt positions of the moving mirror 4608 due to the rotational symmetry.

The micro-lenses illustratively divide the light distribution into a plurality of micro light sources which together result in a larger profile vertically (in order to form a vertical laser line) and thus increase the apparent size of the (virtual) source. In the horizontal direction, in various embodiments, the light beam 9010 is not shaped in order to achieve a narrow laser line. Therefore, the above mentioned lenslets 8914 have a cylindrical shape along the horizontal direction. In addition, the micro-lenses may homogenize the laser line of the emitted laser light beam, i.e. generate a uniform intensity distribution along the vertical direction.

FIG. 90 further shows an enlarged top view of a portion 9012 of the MLA 9004 and the light beam 9010. FIG. 90 shows that the light beam 9010 is not deflected in horizontal direction while passing through the MLA 9004.

FIG. 91 shows a side view 9100 of the First LIDAR Sensing System 40 in accordance with various embodiments. In more detail, FIG. 91 shows a side view of the LIDAR emitter unit according to FIG. 90.

To provide the possibility that segments of the projected line (FIG. 91 shows corresponding segments along the vertical direction in the MLA 9004—by way of example, four segments are shown, namely a first segment 9102, a second segment 9104, a third segment 9106 and a fourth segment 9108) can be switched separately, the micro-lenses 9110 may be functionally grouped along the vertical direction. It is to be noted that any number of segments of the projected line and corresponding segments in the MLA 9004 may be provided. Each of the segments of the projected line corresponds to one group of micro-lenses 9110 on the input side of the microlens array 9004 (one example of the first lens array 8908) and one group of micro-lenses 9110 on the output side of the micro-lens array 9004 (one example of the second lens array 8910). FIG. 91 shows an enlarged side view of the first segment 9102 of the MLA 9004 including a first input group 9112 of micro-lenses 9110 and a corresponding first output group 9114 of microlenses 9110. FIG.

91 also shows an enlarged side view of the second segment 9104 of the MLA 9004 including a second input group 9116 of microlenses 9110 and a corresponding second output group 9118 of micro-lenses 9110. The two groups (input group 9112, 9116 and corresponding output group 9114, 9118) that correspond to the same line segment 9102, 9104, 9106, 9108 are opposite of each other. To each segment of the projected line corresponds a group of one laser emitter source. Each laser emitter may include one or more laser diodes or one or more laser VCSELs. Each group of micro-lenses provides light mainly to one of the line segments that can be therefore switched separately by selecting the laser emitter targeting the micro-lens group 9112, 9116. Each segment or zone 9102, 9104, 9106, 9108 of the MLA 9004 corresponds to a first set of micro-lenses (e.g. the input groups 9112, 9116) and a second set of the micro-lenses (e.g. the output groups 9114, 9118) located, for example, on a same common substrate 9120. In the example of FIG. 91, the first set of micro-lenses (e.g. the input groups 9112, 9116) and the second set of micro-lenses (e.g. the output groups 9114, 9118) are provided on different sides of the substrate 9120 (based on the direction of light propagation).

In addition, in FIG. 91 shows a schematic view of a cross section of the micro-lens array 9004 is shown. For clarity, only few groups and lenses per group are shown. In various embodiments, there may e.g. be four to eight groups 9112, 9114, 9116, 9118 of micro-lenses 9110 on either side of the substrate 9120 and e.g. 20 to 200 micro-lenses 9110 per group 9112, 9114, 9116, 9118. The micro-lens array 9004, also called micro-lens plate, can for example be 30 mm (vertical)×150 mm (horizontal)×3 mm (thickness). In various embodiments, the vertical extension of the micro-lens array 9004 may be in the range from about 10 mm to about 50 mm, e.g. in the range from about 20 mm to about 40 mm, e.g. in the range from about 25 mm to about 35 mm. In various embodiments, the horizontal extension of the micro-lens array 9004 may be in the range from about 50 mm to about 300 mm, e.g. in the range from about 100 mm to about 200 mm, e.g. in the range from about 125 mm to about 175 mm. In various embodiments, the thickness of the micro-lens array 9004 may be in the range from about 1 mm to about 5 mm, e.g. in the range from about 2 mm to about 4 mm, e.g. in the range from about 2.5 mm to about 3.5 mm.

A pitch 9122 (see FIG. 91, right side) may be in the range from about 0.01 mm to about 2 mm, e.g. in the range from about 0.05 mm to about 1.5 mm, e.g. in the range from about 0.1 mm to about 1 mm, for example 0.11 mm. The pitch 9122 may be understood to be the vertical extension of one lens, e.g. the vertical extension of one micro-lens 9110). A (micro-)lens radius r of curvature may be in the range from about 0.25 mm to about 5 mm, e.g. in the range from about 0.5 mm to about 3 mm, for example 1 mm. A (vertical) shift 9124 (in other words displacement) between a (micro-) lens 9110 of an input group 9112, 9116 and a corresponding (micro-)lens 9110 of an output group 9114, 9118 may be in the range from about 20% to about 90%, e.g. in the range from about 30% to about 80% of the pitch, for example 50%. In various embodiments, the (vertical) shift 9124 (in other words displacement) between a (micro-)lens 9110 of an input group 9112, 9116 and a corresponding (micro-)lens 9110 of an output group 9114, 9118 may be in the range from about 0 mm to about twice the pitch of the (micro-) lenses 9110 of an output group 9114, 9118.

In various embodiments, the number of (micro-)lenses 9110 or lenslets 8914 of an input group 9112, 9116 and the number of (micro-) lenses 9110 or lenslets 8914 of a corresponding output group 9114, 9118 may be equal. The number of lenslets 8914 within a single group 9112,9114, 9116, 9118 is a design choice and may depend on fabrication capabilities.

The groups 9112, 9114, 9116, 9118 of micro-lenses 9110 can differ in their defining parameters, e.g. micro-lens pitch 9122 and curvature. The focal length of the micro-lenses 9110 may approximately be equal to the thickness of the micro-lens plate 9004. The pitch 9122 of the microlenses 9110 determines the vertical angular divergence of the light beam passing through a certain group 9112, 9114, 9116, 9118 of micro-lenses 9110. Within each group 9112, 9114, 9116, 9118 of micro-lenses 9110, the pitch 9122 may be constant. A vertical shift 9124 between input lenses and output lenses determines the direction of the light beam. The shift 9124 is also shown in FIG. 91. Both together, pitch 9122 and shift 9124, allow to control the vertical segment angular size and vertical segment direction. By way of example, the four vertical zones 9102, 9104, 9106, 9108 can all possess a different shift 9124 to position all four resulting segments 9102, 9104, 9106, 9108 in a vertical line.

FIG. 92 shows a side view 9200 of a portion of the First LIDAR Sensing System 40 in accordance with various embodiments.

In this exemplary implementation, the full vertical field of view (FOV) 9202 may be 12° and may be segmented into four segments 9204, 9206, 9208, 9210 of 3° each. For each segment 9204, 9206, 9208, 9210, there exists one MLA group. Each MLA group receives light from one laser emitter source which in this example includes or consists of two laser diodes. The outgoing angular segment divergence is determined by the pitch 9122 between each lenslet 8914, the material refractive index, and the curvature.

FIGS. 93A to 93D show the angular intensity distribution for the double-sided MLA 9004 with four zones.

Figure 93B:
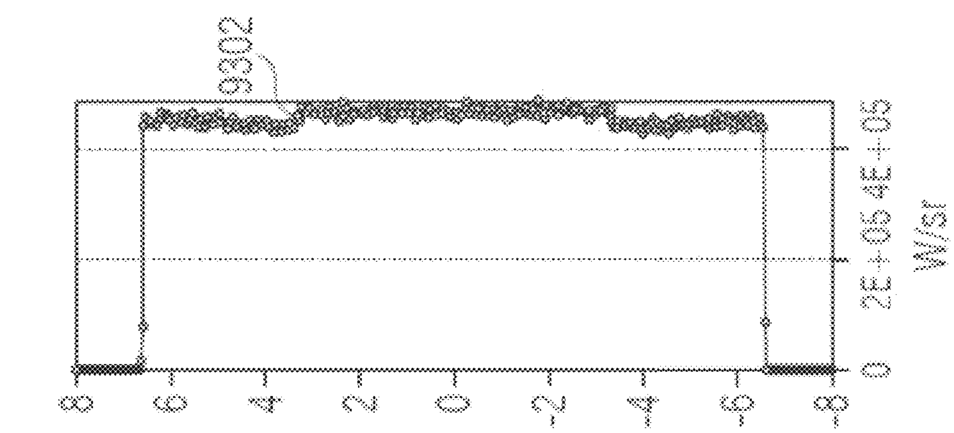
Figure 93A:
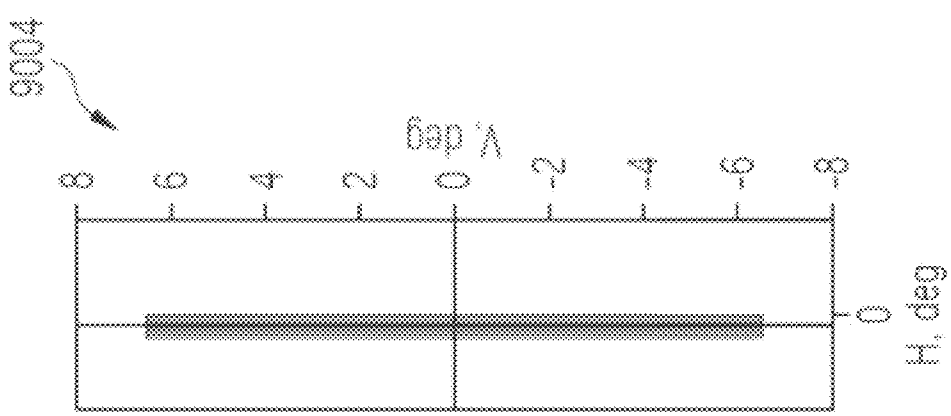

In more detail, FIG. 93A shows results of a simulation with LightTools for the angular intensity distribution of an exemplary MLA 9004 having four MLA segments and FIG. 93B shows a cross-sectional cut 9302 along the vertical direction through the angular intensity distribution of FIG. 93A in case that all zones of the MLA 9004 of FIG. 93A are illuminated. In this case, the resulting angular intensity distribution is an almost perfectly homogenized field-of-view 9212. Illustratively, all four zones in the field-of-view 9212 overlap to one vertical line without a gap.

Furthermore, FIG. 93C shows simulation results for the exemplary MLA 9004 having four MLA segments and FIG. 93D shows a resulting angular intensity distribution 9304 in case only the topmost zone of the MLA 9004 of FIG. 93C is illuminated. In this case, the resulting angular intensity distribution 9302 shows a very distinct zone in the field-of-view 9212. Almost no crosstalk into another zone in the field-of-view 9212 exists in this case.

In various embodiments, the optical component 8900 may be curved in more than one direction, e.g. the horizontal direction and in the vertical direction. The curvature in horizontal direction may be provided due to the scanning motion of the beam steering device (e.g. MEMS mirror 4608). The horizontal angular motion typically exceeds the vertical divergence. However, if the vertical divergence is rather large to achieve a large FOV in both axes, a curvature in vertical direction of the MLA 9004 might be provided to keep the optical effect equal across a group and/or to realize other beam shape patterns.

In various embodiments, a flat multi-group MLA 9004 (i.e. an MLA 9004 without the above explained curved shape) might be used to keep the fabrication cost lower, but also to exploit deviating optical effects in the horizontal direction, which change the beam shape as the beam steers across the FOV 9212 in horizontal direction.

A horizontal curvature of the (micro-) lenses 9110 can be used to alter the beam shape in horizontal direction. The (micro-) lenses 9110 are not cylindrical in such a case, but toroidal or with an adapting vertical radius. This design offers multiple exploitable designs.

Each group of (micro-) lenses 9110 or lenslets 8914 may have differing design parameters (e.g. radius, pitch, shift):

- Different pitches and/or radii of (micro-) lenses 9110 or lenslets 8914 may lead to different vertical divergences, e.g. 4° for both outer groups and 2° for both inner groups. Finally, this may lead to different segment sizes in the FOV.
- Different shifts of (micro-) lenses 9110 or lenslets 8914 may lead to different directions out of each group. This means the segments may be separated or overlapped in the field-of-view (FOV) 9212.

FIG. 94 shows a side view of a portion 9400 of the First LIDAR Sensing System 40 in accordance with various embodiments.

For example, in a design with two groups of (micro-) lenses 9110 or lenslets 8914, where each group of (micro-) lenses 9110 or lenslets 8914 has a different pitch 9122 and a different shift 9124, the vertical segments can have different sizes. This means that a different vertical FOV segment is illuminated by emitter group one and a second smaller vertical FOV segment by emitter group two. Due to different pitches 9122 per group of (micro-) lenses 9110 or lenslets 8914, the vertical divergences may be different.

Additionally, the pitch 9122 can be altered in the horizontal axis of the MLA 9004. The segments 9402, 9404, 9406, 9408 change in such a case across the horizontal FOV to changed segments 9410, 9412, 9414, 9416. The micro-lens array includes or consists of two (or more) regions that are arranged side by side. Each region is constructed as described above. For example, a middle region that directs light into a certain vertical angular range is complemented by a horizontal side region that directs light into a larger vertical angular range. This allows the LIDAR Sensor System 10 to emit adjusted laser power into each horizontal region within the FOV, enabling longer range with a smaller vertical FOV in the central region and shorter range, but a larger vertical FOV on the sides.

Instead of a double-sided MLA 9004 a single-sided MLA 9004 can be used. FIG. 95A, FIG. 95B and FIG. 95C show three examples 9500, 9510, 9520 of a single-sided MLA 9004.

FIG. 95A shows the working principle of the MLA 9004 with reference to the first example 9500 of the single-sided MLA 9004. Similar to the double-sided MLA 9004 a certain divergence of the exit light beam 9502 can be reached depending on the pitch 9122 and radius of each lenslet 8914. FIG. 95B shows a second example 9510 of the single-sided MLA 9004 with a convex input surface 9512 to operate the MLA 9004 with an already divergent light beam 9514. FIG. 95C shows a third example 9520 of the single-sided MLA 9004 which is doing the same as the second example 9510 of FIG. 95B, by means of a Fresnel lens surface 9522 instead of a convex lens surface 9514 at the entrance side.

One effect of such a single-sided MLA is the lower complexity and therefore lower costs. Furthermore, the light beam is no longer focused onto the outer surface as for the double-sided MLA 9004 (compare FIG. 91). This will decrease the power density onto the surface which may be advantageous for very high laser powers.

FIGS. 96A and 96B show various examples of a combination of respective single-sided MLA to form a two piece double-sided MLA in accordance with various embodiments.

Instead of a double-sided MLA 9004 that is made of one piece, it can be split in two single-sided MLAs.

FIG. 96A shows a first example 9600 of a double-sided MLA including a first piece 9602 of a single-sided MLA. The light entry side 9604 of the first piece 9602 includes the (micro-) lenses 9110 or lenslets 8914 and the light output side of the first piece 9602 may have a flat surface 9606. The first example 9600 of the double-sided MLA may further include a second piece 9608 of a single-sided MLA. The light entry side of the second piece 9608 may have a flat surface 9610 and the light output side of the second piece 9608 may include the (micro-) lenses 9110 or lenslets 8914.

By this, both elements (in other words pieces 9602, 9608) can be shifted to each other by means of e.g. a piezo-electric device. This allows an active steering of the direction of the light beam according to different situations.

FIG. 96B shows a second example 9650 of a double-sided MLA including a first piece 9652 of a single-sided MLA. The light entry side 9654 of the first piece 9652 includes the (micro-) lenses 9110 or lenslets 8914 and the light output side of the first piece 9652 may have a flat surface 9656. The second example 9650 of the double-sided MLA may further include a second piece 9658 of a single-sided MLA. The light entry side of the second piece 9658 may have a flat surface 9660 and the light output side of the second piece 9658 may include the (micro-) lenses 9110 or lenslets 8914. The (micro-) lenses 9110 or lenslets 8914 of the first piece 9652 and the (micro-) lenses 9110 or lenslets 8914 of the second piece 9658 may be shifted to each other by a predefined shift 9662.

To provide different radiant intensities to different segments of the laser line, the emitters (in other words the elements of the light source 42) can be driven with different powers. If those emitters that provide light to a certain sub-region (segment) of the target region are dimmed, other emitters can be driven with higher power without increasing the average thermal load. Thus, the range of the LIDAR device can be increased for certain important parts of the target region.

A further option is to split a single laser pulse (that is emitted into one segment) into two (or more: N) timewise subsequent laser pulses is with a predefined time delay and where each pulse has one half (or 1/N) of the optical power as comparted to the situation with an overlapped single pulse. In various embodiments, the maximum range will be reduced. However, by means of analyzing the time delay between two (or more) received pulses, one can distinguish between pulses from the own LiDAR system and from other external systems.

In various embodiments, it may be provided that the vertical order of regions is also designed for different wavelengths. Two laser sources may be used which are directed towards the MLA surface in the center and top part. The MLA may be designed to achieve the same segmentation of the vertical FOV as described above, but this time, each region has to be adapted for a different laser source wavelength, which alters the lenslet curvature, pitch and shift. This could allow the parallel illumination of a vertical FOV by two different wavelengths. A corresponding receiver path, comprised of either two different detector paths or optical filters in front of the same detector, can read out the return signals from the segments in parallel.

FIG. 97 shows a portion 9700 of the Second LIDAR Sensing System 50 in accordance with various embodiments.

The segmentation of the vertical FOV can be combined with a corresponding segmentation (e.g. with respect to four input segments 9702, 9704, 9706, 9708) in the receiver path in the Second LIDAR Sensing System 50. Here, the vertical FOV is imaged onto a vertically aligned photo-detector comprised of several pixels. It is to be noted that these embodiments may be combined with the examples as described in association with FIG. 68 to FIG. 72 and with the examples 1 h to 22h. The analog signals detected by each pixel are amplified and digitalized by a TIA 9714 and ADC 9716, respectively. A multiplexer 9712 reduces the necessary number of TIAs 9714 and ADCs 9716 (which are the most costly parts) and connects the detector pixels, whose FOV coincides with the illuminated vertical segment of the above mentioned optical emitter system. For example (as shown in FIG. 97), a 16 channel APD array 9710 may be segmented into four 4 channels, by using a four channel multiplexer 9712, which sequentially connects 4 TIA+ADC channels. This allows to reduce the number of electronics and generated data, which has to be processed in subsequent processes.

It should be noted that these aspects described above are applicable for various other LIDAR types. The gained design freedom allows to optimize the FOV shape for many other applications.

Furthermore, it is to be noted that the First Sensing System 40 may in these embodiments also include a two-dimensional emitter array, e.g. including VCSELs.

Various embodiments may achieve sharp ends in the projected line, which may reduce spillage of light above and below the target region. In addition, the device may increase the visible apparent source size (virtual source) and thus can help to achieve eye safety even at high laser output powers. Furthermore, a rather sharp separation between segments of the laser line that can be switched on and off separately can be achieved.

Various embodiments as described with reference to FIG. 89 to FIG. 97 above may be combined with the embodiments as described with reference to FIG. 68 to FIG. 72.

In the following, various aspects of this disclosure will be illustrated:

Example 1n is an optical component for a LIDAR Sensor System. The optical component may include an optical element having a first main surface and a second main surface opposite to the first main surface, a first lens array formed on the first main surface, and/or a second lens array formed on the second main surface. The optical element has a curved shape in a first direction of the LIDAR Sensor System.

In Example 2n, the subject matter of Example 1n can optionally include that the first direction is a scanning direction of the LIDAR Sensor System.

In Example 3n, the subject matter of any one of Examples 1n or 2n can optionally include that the optical element has a curved shape in a second direction perpendicular to the first direction of the LIDAR Sensor System.

In Example 4n, the subject matter of any one of Examples 1n to 3n can optionally include that the first lens array includes a first micro-lens array, and/or that the second lens array includes a second micro-lens array.

In Example 5n, the subject matter of any one of Examples 1n to 4n can optionally include that the first lens array includes a first plurality of cylindrical lenslets arranged along the scanning direction of the LIDAR Sensor System, and/or that the second lens array includes a second plurality of cylindrical lenslets arranged along the scanning direction of the LIDAR Sensor System.

In Example 6n, the subject matter of any one of Examples 1n to 5n can optionally include that the first lens array includes a plurality of first lenses and that the second lens array includes a plurality of second lenses. At least some of the second lenses have the same pitch along a direction perpendicular to the scanning direction of the LIDAR Sensor System with respect to at least some of the first lenses.

In Example 7n, the subject matter of any one of Examples 1n to 6n can optionally include that the first lens array includes a first plurality of lenses which are grouped into a plurality of first groups along a predefined direction, and that the second lens array includes a second plurality of lenses which are grouped into a plurality of second groups along the predefined direction.

In Example 8n, the subject matter of any one of Examples 1n to 7n can optionally include that the first lens array includes a plurality of first lenses, and that the second lens array includes a plurality of second lenses. At least some of the second lenses are shifted along a direction perpendicular to the scanning direction of the LIDAR Sensor System with respect to at least some of the first lenses.

In Example 9n, the subject matter of Example 7n can optionally include that at least some of the second lenses of at least one group of the plurality of second groups are shifted along a direction perpendicular to the scanning direction of the LIDAR Sensor System with respect to at least some of the first lenses of at least one group of the plurality of first groups.

Example 10n is an optical component for a LIDAR Sensor System. The optical component may include an optical element having a first main surface and a second main surface opposite to the first main surface, a micro-lens array formed on the first main surface, and/or a micro-lens second lens array formed on the second main surface.

In Example 11n, the subject matter of Example 10n can optionally include that the optical element has a curved shape in a scanning direction of the LIDAR Sensor System.

In Example 12n, the subject matter of any one of Examples 10n or 11 n can optionally include that the optical element has a curved shape in a direction perpendicular to the scanning direction of the LIDAR Sensor System.

In Example 13n, the subject matter of any one of Examples 10n to 12n can optionally include that the first micro-lens array includes a first plurality of cylindrical lenslets arranged along the scanning direction of the LIDAR Sensor System, and/or that the second micro-lens array includes a second plurality of cylindrical lenslets arranged along the scanning direction of the LIDAR Sensor System.

In Example 14n, the subject matter of any one of Examples 10n to 13n can optionally include that the first micro-lens array includes a plurality of first lenses, and that the second micro-lens array includes a plurality of second lenses. At least some of the second lenses have the same pitch along a direction perpendicular to the scanning direction of the LIDAR Sensor System with respect to at least some of the first lenses.

In Example 15n, the subject matter of any one of Examples 10n to 14n can optionally include that the first micro-lens array includes a first plurality of micro-lenses which are grouped into a plurality of first groups along a predefined direction, and/or that the second micro-lens array comprises a second plurality of micro-lenses which are grouped into a plurality of second groups along the predefined direction.

In Example 16n, the subject matter of any one of Examples 10n to 15n can optionally include that the first micro-lens array includes a plurality of first micro-lenses, and/or that the second micro-lens array includes a plurality of second micro-lenses. At least some of the second lenses are shifted along a direction perpendicular to the scanning direction of the LIDAR Sensor System with respect to at least some of the first lenses.

In Example 17n, the subject matter of Example 15n can optionally include that at least some of the second lenses of at least one group of the plurality of second groups are shifted along a direction perpendicular to the scanning direction of the LIDAR Sensor System with respect to at least some of the first lenses of at least one group of the plurality of first groups.

Example 18n is a LIDAR Sensor System. The LIDAR Sensor System may include an optical component of one of Examples 1 n to 17n, and a light source.

In Example 19n, the subject matter of Example 18n can optionally include that the light source includes a plurality of laser light sources.

In Example 20n, the subject matter of Example 19n can optionally include that the plurality of laser light sources includes a plurality of laser diodes.

In Example 21n, the subject matter of Example 20n can optionally include that the plurality of laser diodes includes a plurality of edge-emitting laser diodes.

In Example 22n, the subject matter of any one of Examples 20n or 21n can optionally include that the plurality of laser diodes includes a plurality of vertical-cavity surface-emitting laser diodes.

In Example 23n, the subject matter of any one of Examples 18n to 22n can optionally include that the LIDAR Sensor System further includes a scanning micro-electrical mechanical system (MEMS) arranged between the light source and the optical component.

In Example 24n, the subject matter of Example 23n can optionally include that the LIDAR Sensor System further includes a fast axis collimation lens arranged between the light source and the MEMS.

In Example 25n, the subject matter of any one of Examples 18n to 24n can optionally include that the optical component has a shape having a rotational symmetry. The MEMS and the optical component are arranged with respect to each other so that the axis of rotation of the MEMS is associated with the axis of a rotational symmetry of the optical component.

In Example 26n, the subject matter of any one of Examples 18n to 25n can optionally include that the light source is configured to emit light to generate a projected line in a field-of-view of the LIDAR Sensor System.

In Example 27n, the subject matter of Example 26n can optionally include that a projected line of light emitted by the light source includes a plurality of line segments. The projected line is perpendicular to a scanning direction of the MEMS. The first lens array includes a first plurality of lenses which are grouped into a plurality of first groups along a predefined direction. The second lens array includes a second plurality of lenses which are grouped into a plurality of second groups along the predefined direction. Each segment is associated with at least one first group of the plurality of first groups and with at least one second group of the plurality of second groups.

In Example 28n, the subject matter of Example 27n can optionally include that the predefined direction is the vertical direction.

In Example 29n, the subject matter of any one of Examples 1 n to 2n can optionally include that at least one light source of the plurality of light sources is associated with at least one line segment of the plurality of line segments.

Pulsed laser sources may have various applications. An important field of application for pulsed laser sources may be time-of-flight LIDAR sensors or LIDAR systems. In a time-of-flight LIDAR system, a laser pulse may be emitted, the laser pulse may be reflected by a target object, and the reflected pulse may be received again by the LIDAR system. A distance to the object may be calculated by measuring the time that has elapsed between sending out the laser pulse and receiving the reflected pulse. Various types of lasers or laser sources may be used for a LIDAR application (e.g., in a LIDAR system). By way of example, a LIDAR system may include an edge-emitting diode laser, a vertical cavity surface-emitting laser (VCSEL), a fiber laser, or a solid state laser (e.g., a Nd:YAG diode pumped crystal laser, a disc laser, and the like). An edge-emitting diode laser or a VCSEL may be provided, for example, for low-cost applications.

A special driver circuit may be provided for a laser diode to operate in pulsed mode. A relatively high electrical current pulse may be sent through the laser diode within a short period of time (usually on the order of a few picoseconds up to a few microseconds) to achieve a short and intense optical laser pulse. The driver circuit may include a storage capacitor for supplying the electrical charge for the current pulse. The driver circuit may include a switching device (e.g., one or more transistors) for generating the current pulse. A direct connection between the laser source and a current source may provide an excessive current (illustratively, a much too large current). Silicon-based capacitors (e.g., trench capacitors or stacked capacitors) may be integrated into a hybrid or system-in-package for providing higher integration of laser drivers. The switching device for activating the current pulse through the laser diode may be a separate element from the capacitor.

The storage capacitor and the switching may be located at a certain distance away from the laser diode. This may be related to the dimensions of the various electrical components included in the capacitor and in the switching device. Illustratively, with discrete components a minimum distance of the order of millimeters may be present. The soldering of the discrete components on a printed circuit board (PCB) and the circuit lanes connecting the components on the printed circuit board (PCB) may prevent said minimum distance to be reduced further. This may increase the parasitic capacitances and inductances in the system.

Various embodiments may be based on integrating in a common substrate one or more charge storage capacitors, one or more switching devices (also referred to as switches), and one or more laser light emitters (e.g., one or more laser diodes). Illustratively, a system including a plurality of capacitors, a plurality of switching devices (e.g., a switching device for each capacitor), and one or more laser diodes integrated in or on a common substrate may be provided. The arrangement of the capacitors and the switching is devices in close proximity to the one or more laser diodes (e.g., in the same substrate) may provide reduced parasitic inductances and capacitances (e.g., of an electrical path for a drive current flow). This may provide improved pulse characteristics (e.g., a reduced minimum pulse width, an increased maximum current at a certain pulse width, a higher degree of influence on the actual pulse shape, or a more uniform shape of the pulse).

In various embodiments, an optical package may be provided (also referred to as laser diode system). The optical package may include a substrate (e.g., a semiconductor substrate, such as a compound semiconductor material substrate). The substrate may include an array of a plurality of capacitors formed in the substrate. The substrate may include a plurality of switches. Each switch may be connected between at least one capacitor and at least one laser diode. The optical package may include the at least one laser diode mounted on the substrate. The optical package may include a processor (e.g., a laser driver control circuit or part of a laser driver control circuit) configured to control the plurality of switches to control a first current flow to charge the plurality of capacitors. The processor may be configured to control the plurality of switches to control a second current flow to drive the at least one laser diode with a current discharged from at least one capacitor (e.g., a current pulse through the laser diode). Illustratively, the processor may be configured to control the plurality of switches to control the second current flow to discharge the plurality of capacitors. The optical package may be provided, for example, for LIDAR applications. Illustratively, the optical package may be based on an array-distributed approach for the capacitors and the switches.

The first current flow may be the same as the second current flow. Illustratively, the current used for charging the capacitors may be the same as the current discharged from the capacitors. Alternatively, the first current flow may be different from the second current flow (for example, in case part of the charge stored in the capacitors has dissipated, as described in further detail below).

The arrangement of the components of the optical package (e.g., the capacitors, the switches, and the at least one laser diode) may be similar to the arrangement of the components of a dynamic random-access memory (DRAM). By way of example, each switch may be assigned to exactly one respective capacitor. A switch-capacitor pair (e.g., in combination with the associated laser diode) may be similar to a memory cell of a DRAM array (e.g., a memory cell may include, for example a storage capacitor, a transistor, and electrical connections).

The plurality of capacitors and the plurality of switches may be understood as a driver circuit (illustratively, as part of a driver circuit, for example of a DRAM-like driver circuit) of the at least one laser diode. The laser diode may partially cover the driver circuit (e.g., at least a portion of the array of capacitors). Illustratively, the driver circuit may be arranged underneath the laser diode. The driver circuit may be electrically connected with the laser diode (e.g., by means of a method of 3D-integration of integrated circuits, such as bump bonding). The capacitors (e.g., DRAM-like capacitors) may have sufficient capacity to provide enough current to the laser diode for high-power laser emission, illustratively for emission in time-of-flight LIDAR applications. In an exemplary arrangement, about 500000 capacitors (for example, each having a capacitance of about 100 fF) may be assigned to the laser diode (e.g., to a VCSEL, for example having a diameter of about 100 μm). The arrangement of the capacitors directly underneath the laser diode may provide small parasitic inductances and capacitances. This may simplify the generation of a short and powerful laser pulse (e.g., based on a current pulse of about 40 A in the exemplary arrangement). By way of example, a connection (e.g., an electrical path) between a capacitor (and/or a switch) and the laser diode may have an inductivity lower than 100 pH.

The charge stored in the capacitors may dissipate in case the charge is not used, e.g. after a certain period of time. A regular re-charging (illustratively, a refreshment) of the capacitors may be provided (e.g., at predefined time intervals). The charge dissipation may reduce the risk of unintentional emission of a laser pulse. The optical package may be provided or may operate without a high-resistivity resistor configured to discharge the storage capacitors over time periods larger than the laser pulse rate.

The driver circuit may be fabricated using DRAM manufacturing methods, e.g. CMOS technology methods. The capacitors may be deep trench capacitors or stacked capacitors (illustratively, at least one capacitor may be a deep trench capacitor and/or at least one capacitor may be a stacked capacitor). Each switch may include a transistor, e.g., a field effect transistor (e.g., a metal oxide semiconductor field effect transistor, such as a complementary metal oxide semiconductor field effect transistor). The driver circuit may be provided (and fabricated) in a cost-efficient manner (e.g., without expensive, high-performance high-speed power transistors, such as without GaN FET).

The laser diode may include a III-V semiconductor material as active material (e.g. from the AlGaAs or GaN family of semiconductors). By way of example, the laser diode may include an edge-emitting laser diode. As another example, the laser diode may include a vertical cavity surface-emitting laser diode (e.g., the optical package may be a VCSEL package).

In various embodiments, the processor may be configured to individually control the plurality of switches to control the first current flow to charge the plurality of capacitors.

In various embodiments, the processor may be configured to control the amount of charge to be delivered to the laser diode. The processor may be configured to individually control the plurality of switches to control the second current flow to drive the at least one laser diode with a current discharged from at least one capacitor. Illustratively, the processor may be is configured to individually control the switches such that a variable number of capacitors associated with the laser diode may be discharged (illustratively, at a specific time) to drive the laser diode (e.g., only one capacitor, or some capacitors, or all capacitors). This may provide control over the total current for the current pulse and over the intensity of the outgoing laser pulse. Variable laser output power may be provided, e.g. based on a precisely adjusted current waveform.

By way of example, the optical package may include one or more access lines (e.g., similar to a DRAM circuit) for selectively charging and/or selectively discharging the capacitors (e.g., for charging and/or discharging a subset or a sub-array of capacitors).

In various embodiments, the optical package may include a plurality of laser diodes, for example arranged as a one-dimensional array (e.g., a line array) or as a two-dimensional array (e.g., a matrix array). By way of example, the optical package may include a VCSEL array. Each laser diode may be associated with (e.g., driven by) a corresponding portion of the driver circuit (e.g., corresponding capacitors and switches, for example corresponding 500000 capacitors).

In various embodiments, the optical package may include one or more heat dissipation components, such as one or more through vias, e.g. through-silicon vias (TSV), one or more metal layers, and/or one or more heat sink devices. By way of example, the optical package may include one or more heat sink devices arranged underneath the substrate (for example, in direct physical contact with the substrate). As another example, the optical package may include one or more through-silicon vias arranged outside and/or inside an area of the substrate including the switches and the capacitors. The one or more through-silicon vias may provide an improved (e.g., greater) heat conduction from the laser diode to a bottom surface of the substrate (illustratively, the mounting surface below the capacitor/switch array). As a further example, the optical package may include a metal layer arranged between the capacitors and the switches. The metal layer may improve heat transfer towards the sides of the optical package. The metal layer may have an additional electrical functionality, such as electrically contacting some of the capacitors with the sides of the optical package. The heat dissipation components may be provided to dissipate the thermal load related to the high-density integration of the components of the optical package (e.g., laser diode and driver circuit).

FIG. 155A shows an optical package 15500 in a schematic side view in accordance with various embodiments.

The optical package 15500 may include a substrate 15502.

The substrate 15502 may be a semiconductor substrate. By way of example, the substrate 15502 may include silicon or may essentially consist of silicon. As another example, the substrate 15502 may include or essentially consist of a compound semiconductor material (e.g., GaAs, InP, GaN, or the like).

The substrate 15502 may include a plurality of capacitors 15504. The capacitors 15504 may be formed in the substrate 15502, e.g. the capacitors 15504 may be monolithically integrated in the substrate 15502. Illustratively, a capacitor 15504 may be surrounded on three sides or more by the substrate 15502 (e.g., by the substrate material). The capacitors 15504 may be fabricated, for example, by means of DRAM-manufacturing processes.

By way of example, at least one capacitor 15504 (or more than one capacitor 15504, or all capacitors 15504) may be a deep trench capacitor. Illustratively, a trench (or a plurality of trenches) may be formed into the substrate 15502 (e.g., via etching). A dielectric material may be deposited in the trench. A plate may be formed surrounding a lower portion of the trench. The plate may be or may serve as first electrode for the deep trench capacitor. The plate may be, for example, a doped region (e.g., an n-doped region) in the substrate 15502. A metal (e.g., a p-type metal) may be deposited on top of the dielectric layer. The metal may be or may serve as second electrode for the deep trench capacitor.

As another example, at least one capacitor 15504 (or more than one capacitor 15504, or all capacitors 15504) may be a stacked capacitor. Illustratively, an active area (or a plurality of separate active areas) may be formed in the substrate. A gate dielectric layer may be deposited on top of the active area (e.g., on top of each active area). A sequence of conductive layers and dielectric layers may be deposited on top of the gate dielectric layer. Electrical contacts may be formed, for example, via a masking and etching process followed by metal deposition.

The capacitors 15504 may be arranged in an ordered fashion in the substrate 15502, e.g. the plurality of capacitors 15504 may form an array. By way of example, the capacitors 15504 may be arranged in one direction to form a one-dimensional capacitor array. As another example, the capacitors 15504 may be arranged in two directions to form a two-dimensional capacitor array. Illustratively, the capacitors 15504 of the array of capacitors 15504 may be arranged in rows and columns (e.g., a number N of rows and a number M of columns, wherein N may be equal to M or may be different from M). It is understood that the plurality of capacitors 15504 may include capacitors 15504 of the same type or of different types (e.g., one or more deep trench capacitors and one or more stacked capacitors), for example different types of capacitors 15504 in different portions of the array (e.g., in different sub-arrays).

The substrate 15502 may include a plurality of switches 15506. The switches 15506 may be formed in the substrate 15502, e.g. the switches 15506 may be monolithically integrated in the substrate 15502. Each switch 15506 may be connected between at least one capacitor 15504 and at least one laser diode 15508 (e.g., each switch 15506 may be electrically coupled with at least one capacitor 15504 and at least one laser diode 15508). Illustratively, a switch 15506 may be arranged along an electrical path connecting a capacitor 15504 with the laser diode 15508.

A switch 15506 may be controlled (e.g., opened or closed) to control a current flow from the associated capacitor 15504 to the laser diode 15508. By way of example, each switch 15506 may include a transistor. At least one transistor (or more than one transistor, or all transistors) may be a field effect transistor, such as a metal oxide semiconductor field transistor (e.g., a complementary metal oxide semiconductor field transistor). It is understood that the plurality of switches 15506 may include switches 15506 of the same type or of different types.

A switch 15506 may be assigned to more than one capacitor 15504 (e.g., a switch 15506 may be controlled to control a current flow between more than one capacitor 15504 and the laser diode 15508). Alternatively, each switch 15506 may be assigned to exactly one respective capacitor 15504. Illustratively, the substrate 15502 may include a plurality of switch-capacitor pairs (e.g., similar to a plurality of DRAM cells). This may be illustrated by the circuit equivalents shown, for example, in FIG. 155B and FIG. 155C. A switch 15506*s* may be controlled (e.g., via a control terminal 15506*g*, such as a gate terminal) to allow or prevent a current flow from the assigned capacitor 15504*c* to the laser diode 15508*d* (or to an associated laser diode, as shown in FIG. 155C).

The switches 15506 may have a same or similar arrangement as the capacitors 15504 (e.g., the substrate 15502 may include an array of switches 15506, such as a one-dimensional array or a two-dimensional array).

The optical package 15500 may include the at least one laser diode 15508. The laser diode 15508 may be mounted on the substrate 15502 (e.g., the laser diode 15508 may be arranged on a surface of the substrate 15502, such as a top surface, for example on an insulating layer of the substrate 15502). The laser diode 15508 may laterally cover at least a portion of the plurality of capacitors 15504. Illustratively, the laser diode 15508 may be mounted on the substrate 15502 in correspondence (e.g., directly above) of the plurality of capacitors 15504 or of at least a portion of the plurality of capacitors 15504. This may provide a low inductivity for an electrical path between a capacitor 15504 (or a switch 15506) and the laser diode 15508. The electrical path (e.g., between a capacitor 15504 and the laser diode 15508 and/or between a switch 15502 and the laser diode 15508) may have an inductivity in a range between 70 pH and 200 pH, for example lower than 100 pH.

The laser diode 15508 may be a laser diode suitable for LIDAR applications (e.g., the optical package 15500 may be included in a LIDAR system, for example in the LIDAR Sensor System 10). By way of example, the laser diode 15508 may be or may include an edge-emitting laser diode. As another example, the laser diode 15508 may be or may include a vertical cavity surface-emitting laser diode.

The laser diode 15508 may be configured to receive current discharged from the capacitors 15504. By way of example, the substrate 15502 may include a plurality of electrical contacts (e.g., each electrical contact may be connected with a respective capacitor 15504, for example via the respective switch 15506). The laser diode 15508 may be mounted on the electrical contacts or may be electrically connected with the electrical contacts. By way of example, a first terminal of the laser diode 15508 may be electrically connected to the electrical contacts, for example via an electrically conductive common line 15510, as described in further detail below (e.g., the first terminal of the laser diode 15508 may be electrically coupled to the common line 15510). A second terminal of the laser diode 15508 may be electrically connected to a second potential, e.g., to ground.

The laser diode 15508 may be associated with a number of capacitors 15504 for providing a predefined laser output power. By way of example, the laser diode 15508 may be configured to receive current discharged from a number of capacitors 15504 such that a predefined laser output power may be provided, for example above a predefined threshold. Stated in another fashion, the laser diode 15508 may be configured to receive current discharged from a number of capacitors 15504 such that a predefined current may flow in or through the laser diode 15508, for example a current above a current threshold. By way of example, the laser diode 15508 may be associated with a number of capacitors 15504 in the range from a few hundreds capacitors 15504 to a few millions capacitors 15504, for example in the range from about 100000 capacitors 15504 to about 1000000 capacitors 15504, for example in the range from about 400000 capacitors 15504 to about 600000 capacitors 15504, for example about 500000 capacitors 15504. Each capacitor 15504 may have a capacitance in the femtofarad range, for example in the range from about 50 fF to about 200 fF, for example about 100 fF. The capacitance of a capacitor 15504 may be selected or adjusted depending on the number of capacitors 15504 associated with the laser diode 15508 (illustratively, the capacitance may increase for decreasing number of associated capacitors 15504 and may decrease for increasing number of associated capacitors 15504). The capacitance of a capacitor 15504 may be selected or adjusted depending on the current flow to drive the laser diode 15508 (e.g., in combination with the number of associated capacitors 15504). At least one capacitor 15504, or some capacitors 15504, or all capacitors 15504 associated with the laser diode 15508 may be discharged (e.g., for each laser pulse emission). This may provide control over the emitted laser pulse, as described in further detail below.

The optical package 15500 may include more than one laser diode 15508 (e.g., a plurality of laser diodes), of the same type or of different types. Each laser diode may be associated with a corresponding plurality of capacitors 15504 (e.g., with a corresponding number of capacitors, for example in the range from about 400000 to about 60000, for example about 500000).

The laser diode 15508 may be configured to emit light (e.g., a laser pulse) in case the current discharged from the associated capacitors 15504 flows in the laser diode 15508. The laser diode may be configured to emit light in a predefined wavelength range, e.g. in the near infra-red or in the infra-red wavelength range (e.g., in the range from about 800 nm to about 1600 nm, for example at about 905 nm or at about 1550 nm). The duration of an emitted laser pulse may be dependent on a time constant of the capacitors 15504. By way of example, an emitted laser pulse may have a pulse duration (in other words, a pulse width) in the range from below 1 ns to several nanoseconds, for example in the range from about 5 ns to about 20 ns, for example about 10 ns.

The optical package 15500 may include an electrically conductive common line 15510 (e.g., a metal line). The common line 15510 may connect at least some capacitors 15504 of the plurality of capacitors 15504. Illustratively, the common line 15510 may connect (e.g., may be electrically connected with) the electrical contacts of at least some capacitors 15504 of the plurality of capacitors 15504. By way of example, the common line 15510 may connect all capacitors 15504 of the plurality of capacitors 15504. As another example, the optical package 15500 may include a plurality of common lines 15510, each connecting at least some capacitors 15504 of the plurality of capacitors 15504.

The optical package 15500 may include a power source 15512 (e.g., a source configured to provide a current, for example a battery). The power source 15512 may be electrically connected to the common line 15512 (or to each common line). The power source 15512 may be configured to provide power to charge the plurality of capacitors 15504 (e.g., the capacitors 15504 connected to the common line 15510).

The optical package 15500 may include a processor 15514. By way of example, the processor 15514 may be mounted on the substrate 15502. As another example, the processor 15514 may be monolithically integrated in the substrate 15502. Alternatively, the processor 15514 may be mounted on the printed circuit board 15602 (see FIG. 156). The processor may be configured to control the plurality of switches 15506 (e.g., to open or close the plurality of switches). As an example, the optical package 15500 (or the substrate 15502) may include a plurality of access lines electrically connected with control terminals of the switches 15506 (e.g., similar to word-lines in a DRAM). The processor 15514 may be configured to control the switches 15506 by providing a control signal (e.g., a voltage, such as a control voltage, or an electric potential) to the plurality of access lines (or to some access lines, or to a single access line). The processor 15514 may be configured to individually control the switches 15506, e.g. by providing individual control signals to the access line or lines connected to the switch 15506 or the switches 15506 to be controlled. By way of example, the processor 15514 may include or may be configured to control a voltage supply circuit used for supplying control voltages to the access lines (not shown).

The processor 15514 may be configured to control (e.g., to individually control) the plurality of switches 15506 to control a first current flow to charge the plurality of capacitors 15504. Illustratively, the processor 15514 may be configured to open the plurality of switches 15506 such that current may flow from the common line 15510 (illustratively, from the power source 15512) into the capacitors 15504.

The processor 15514 may be configured to control (e.g., to individually control) the plurality of switches 15506 to control a second current flow to discharge the plurality of capacitors 15504. Illustratively, the processor 15514 may be configured to open the plurality of switches 15506 such that the capacitors 15504 may be discharged (e.g., current may flow from the capacitors 15504 to the laser diode 15508). The first current flow may be the same as the second current flow or different from the second current flow (e.g., the first current flow may be greater than the second current flow).

The processor 15514 may be configured to control (e.g., to individually control) the plurality of switches 15506 to control the second current flow to drive the laser diode 15508 with current discharged from at least one capacitor 15504. The processor 15514 may be configured to adjust a current flow through the laser diode 15508 (e.g., to adjust a laser output power) by controlling (e.g., opening) the switches 15506 (e.g., by discharging a certain number of the capacitors 15504 associated with the laser diode 15508). Illustratively, the second current flow to drive the at least one laser diode 15508 may include a current proportional to the number of discharged capacitors 15504 (e.g., a current in the range from a few milliamperes up about 100 A, for example in the range from about 10 mA to about 100 A, for example from about 1 A to about 50 A, for example about 40 A).

The processor 15514 may be configured to control an emitted light pulse. The processor may be configured to control or select the properties of an emitted light pulse (e.g., a shape, a duration, and an amplitude of an emitted light pulse) by controlling the arrangement and/or the number of capacitors 15504 to be discharged (e.g., of discharged capacitors 15504). By way of example, a shape of the emitted light pulse may be controlled by discharging capacitors 15504 arranged in different locations within an array of capacitors 15504. As another example, an amplitude of the emitted light pulse may be increased (or decreased) by discharging a higher (or lower) number of capacitors 15504.

The processor 15514 may be configured to control the plurality of switches 15506 to discharge at least some capacitors 15504 to drive the laser diode 15508 to emit a light pulse (e.g., a laser pulse) of a predefined pulse shape (in other words, a light pulse having a certain waveform). By way of example, the processor 15514 may be configured to encode data in the emitted light pulse (e.g., to select a shape associated with data to be transmitted). Illustratively, the emitted light pulse may be modulated (e.g., electrically modulated) such that data may be encoded in the light pulse. The processor 15514 may be configured to control the discharge of the capacitors 15504 to modulate an amplitude of the emitted light pulse, for example to include one or more hump-like structure elements in the emitted light pulse (as described, for example, in relation to FIG. 145A to FIG. 149E). The processor 15514 may have access to a memory storing data (e.g., to be transmitted) associated with a corresponding pulse shape (e.g., storing a codebook mapping data with a corresponding pulse shape).

The processor 15514 may be configured to control the plurality of switches 15506 to discharge at least some capacitors 15504 to drive the laser diode 15508 to emit a light pulse dependent on a light emission scheme. By way of example, the processor 15514 may be configured to control the discharge of the capacitors 15504 to drive the laser diode 15508 to emit a sequence of light pulses, for example structured as a frame (illustratively, the temporal arrangement of the emitted light pulses may encode or describe data), as described, for example, in relation to FIG. 131A to FIG. 137 and/or in relation to FIG. 138 to FIG. 144.

The optical package 15500 may include one or more further components, not illustrated in FIG. 155A. By way of example, the optical package 15500 (e.g., the substrate 15502) may include one or more additional switches (e.g., as illustrated for example in the circuit equivalent in FIG. 155C). A first additional switch (or a plurality of first additional switches) may be controlled (e.g., opened or closed) to selectively provide a path from the power source 15512 to the capacitors 15504. A second additional switch (or a plurality of second additional switches) may be controlled to selectively provide a path from the laser diode 15508 to an electrical contact (described in further detail below).

As illustrated in FIG. 155C, an exemplary operation of the optical package 15500 may be as follows. A first additional switch $SW_B$ may be opened to disconnect the power source from the capacitors 11504*c* (illustratively, the power source may be coupled with the node B, e.g. the terminal B, in FIG. 155B and FIG. 155C). The node A, e.g. the terminal A, in FIG. 155B and FIG. 155C may indicate the substrate (e.g., may be coupled with the substrate). A second additional switch $SW_C$ may be opened to disconnect the laser diode 15508*d* from the associated electrical contact (illustratively, the electrical contact may be coupled with the node C, e.g. the terminal C, in FIG. 155B and FIG. 155C). As an example, the second additional switch $SW_C$ may be opened to disconnect each laser diode 15508*d* from the associated electrical contact. As another example, each laser diode 15508*d* may have a respective additional switch and/or a respective electrical contact associated thereto. The capacitors 15504*c* to be charged may be selected by providing a corresponding control signal to the respective access line (e.g., applying a control voltage to the control terminal of the associated switch 15506*s*), illustratively coupled with the node D, e.g. the terminal D, in FIG. 155B and FIG. 155C. The first additional switch $SW_B$ may be closed to charge the selected capacitors. The access lines (e.g., control lines) may be deactivated after charging has been performed. The first additional switch $SW_B$ may be opened. The second additional switch $SW_C$ may be closed to provide an electrical path from the laser diode 15508*d* (e.g., from each laser diode 15508*d*) to the associated electrical contact. The capacitors 15504*c* to be discharged may be selected by providing a corresponding control signal to the respective access line. The selected capacitors 15504*c* may be discharged via the associated laser diode 15508*d*.

FIG. 156 shows a top view of the optical package 15500 in a schematic representation in accordance with various embodiments.

The optical package 15500 may include a base support, e.g. a printed circuit board 15602. The substrate 15502 may be mounted on the printed circuit board 15602 (e.g., integrated in the printed circuit board 15602). The processor 15514 may be mounted on the printed circuit board 15602.

The printed circuit board 15602 may include a first electrical contact 15604. The first electrical contact 15604 may be connected (e.g., electrically coupled) to the common line 15510 of the substrate 15502 (in other words, to the common line 15510 of the optical package 15500), as shown, for example, in FIG. 155A. By way of example, the first electrical contact 15604 may be wire bonded to the common line 15510. Power to charge the capacitors 15504 may be provided via the first electrical contact 15604 of the printed circuit board 15602. By way of example, a power source may be mounted on the printed circuit board 15602 and electrically coupled with the first electrical contact 15604.

The printed circuit board 15602 may include a second electrical contact 15606. The second terminal 15608 of the laser diode 15508 may be electrically coupled to the second electrical contact 15606 of the printed circuit board 15602. By way of example, the second electrical contact 15606 of the printed circuit board 15602 may be wire bonded to the second terminal 15608 of the laser diode 15508. The second electrical contact 15606 may provide a path for the current to flow through the laser diode 15508.

It is understood that the arrangement shown in FIG. 156 is illustrated as an example, and other configurations of the optical package 15500 may be provided. By way of example, the optical package 15500 may include a plurality of laser diodes 15508, for example arranged in a one-dimensional array or in a two-dimensional array (e.g., in a matrix array) over the base support. The optical package 15500 may include a plurality of first electrical contacts 15604 and/or a plurality of second electrical contacts 15606. As an example, the optical package 15500 may include a first electrical contact 15604 and a second electrical contact 15606 associated with each laser diode 15508. As another example, the optical package 15500 may include a first electrical contact 15604 for each line in an array of laser diodes 15508.

FIG. 157A and FIG. 157B show a side view and a top view, respectively, of an optical package 15700 in a schematic representation in accordance with various embodiments. In FIG. 157B, components of the optical package 15700 that may be arranged at different levels are illustrated, e.g. at different vertical positions within the optical package 15700 or within the substrate, according to the representation in FIG. 157A.

The optical package 15700 may be configured as the optical package 15500 described, for example, in relation to FIG. 155A to FIG. 156. Illustratively, the optical package 15700 may be an exemplary realization of the optical package 15500.

The optical package 15700 may include a substrate 15702. The optical package 15700 may include a plurality of storage capacitors 15704 formed (e.g., monolithically integrated) in the substrate 15702 (e.g., an array of storage capacitors 15704, for example a two-dimensional array). The optical package 15700 may include a plurality of switches 15706 formed (e.g., monolithically integrated) in the substrate, for example a plurality of transistors (e.g., field effect transistors). Each switch 15706 may be connected between at least one capacitor 15704 (e.g., exactly one capacitor 15704) and a laser diode 15708. The substrate 15702 may include a base 15702*s*, e.g. including or essentially consisting of silicon. The substrate 15702 may include an insulating layer 15702*i*, for example including an oxide, such as silicon oxide.

The laser diode 15708 may be a vertical cavity surface-emitting laser diode (e.g., emitting light from a top surface of the laser diode 15708), for example having a pyramid shape. The laser diode 15708 may be mounted on the substrate 15702 (e.g., on the insulating layer 15702*i*). The laser diode 15708 may include an active layer 15708*a* (illustratively, a layer of active material).

The laser diode 15708 may include one or more optical structures 15708*o*, arranged above and/or underneath the active layer 15708*a*. By way of example, the laser diode 15708 may include a first optical structure 15708*o* arranged on top of the active layer 15708*a* (e.g., in direct is physical contact with the active layer 15708*a*). The first optical structure 15708*o* may be a top Bragg mirror (e.g., a sequence of alternating thin layers of dielectric materials having high and low refractive index). The laser diode 15708 may include a second optical structure 15708*o* arranged underneath the active layer 15708*a* (e.g., in direct physical contact with the active layer 15708*a*). The second optical structure 15708*o* may be a bottom Bragg mirror.

The optical package 15700 may include a printed circuit board 15710. The substrate 15702 may be mounted on the printed circuit board 15710. The laser diode 15708 may be electrically connected to the printed circuit board 15710 (e.g., to an electrical contact of the printed circuit board 15710), for example via one or more bond wires 15712. By way of example, the laser diode 15708 may include a (e.g., second) terminal 15714 arranged on top of the laser diode 15708 (e.g., a top contact). The terminal 15714 may be a ring-like mesa structure (e.g., to allow emission of the laser light), as illustrated, for example, in FIG. 157B. The one or more bond wires 15712 may be connected to the terminal 15714.

The laser diode 15708 may include another (e.g., first) terminal 15716 arranged at a bottom surface of the laser diode 15708 (e.g., a bottom contact). The terminal 15716 may be electrically coupled with a connector structure 15718 (e.g., a connector structure 15718 formed in the substrate 15702). The connector structure 15718 may provide electrical coupling (e.g., an electrical path) with the switches 15706 and the capacitors 15704 (e.g., between the terminal 15716 and the switches 15706 and the capacitors 15704). By way of example, the connector structure 15718 may include a plurality of electrical contacts 15718*c*, e.g. a grid-structure with individual pin-like elements. Each electrical contact 15718*c* may be connected with a respective capacitor 15704, for example via the respective switch 15706. Illustratively, the connector structure 15718 may be selectively coupled to the plurality of storage capacitors 15706 (e.g., pin-like storage capacitors) by the plurality of switching devices 15706. The connector structure 15718 may be an example for the common line 15510.

The connector structure 15718 may be used to charge the plurality of capacitors 15704. By way of example the connector structure 15718 may be electrically coupled with a power source. As another example, the connector structure 15718 may be electrically coupled with the printed circuit board 15710, for example via one or more bond wires 15720. The connector structure 15718 may be electrically coupled with an electrical terminal of the printed circuit board 15710. A power source may be electrically coupled with the electrical terminal of the printed circuit board 15710. Illustratively, the connector structure 15718 may have a comb-like arrangement including a plurality of connector lines (as shown in FIG. 157B). Each connector line may optionally include or be associated with a respective switch (e.g., a field effect transistor) for providing additional control over the selection of the capacitors to be charged (e.g., in addition to the selection by means of the access lines 15722).

The substrate 15702 may include a plurality of access lines 15722 (illustratively, a plurality of word-lines). Each access line may be electrically coupled with one or more switches 15706 (e.g., with respective control terminals, e.g. gate terminals, of one or more switches 15706). The access lines 15722 may be used to control (e.g., open or close) the one or more switches 15706 coupled thereto.

The optical package 15700 may include a processor configured as the processor 15514 described above, for example in relation to FIG. 155A to FIG. 156. The processor may be configured to control the switches 15706 by supplying a control signal (e.g., a plurality of control signals) via the plurality of access lines 15522.

The optical package 15700 (e.g., the substrate 15702) may include one or more through-vias 15724 (e.g., through-silicon vias), as an example of heat dissipation component. By way of example, a through-via 15724 may extend through the substrate in the vertical direction (e.g., through the base 15702*s* and through the insulating layer 15702*i*). The through-via 15724 may be filled with a heat dissipation or heat conducting material, such as a metal (e.g., deposited or grown in the through-via 15724). The through-via 15724 may be arranged outside the area in which the plurality of capacitors 15704 and/or the plurality of switches 15706 are formed in the substrate 15702.

In the following, various aspects of this disclosure will be illustrated:

Example 1 ad is an optical package. The optical package may include a substrate. The substrate may include an array of a plurality of capacitors formed in the substrate. The substrate may include a plurality of switches formed in the substrate. Each switch may be connected between at least one laser diode and at least one capacitor of the plurality of capacitors. The optical package may include the at least one laser diode mounted on the substrate. The optical package may include a processor configured to control the plurality of switches to control a first current flow to charge the plurality of capacitors. The processor may be configured to control the plurality of switches to control a second current flow to drive the at least one laser diode with current discharged from at least one capacitor of the plurality of capacitors.

In example 2ad, the subject-matter of example 1 ad can optionally include that the plurality of capacitors and the plurality of switches are monolithically integrated in the substrate.

In example 3ad, the subject-matter of any one of examples 1 ad or 2ad can optionally include that each switch of the plurality of switches is assigned to exactly one respective capacitor of the plurality of capacitors.

In example 4ad, the subject-matter of example 3ad can optionally include that the processor is configured to individually control the plurality of switches to control the first current flow to charge the plurality of capacitors. The processor may be configured to individually control the plurality of switches to control the second current flow to drive the at least one laser diode with current discharged from at least one capacitor of the plurality of capacitors.

In example 5ad, the subject-matter of any one of examples 1 ad to 4ad can optionally include that each switch of the plurality of switches includes a transistor.

In example 6ad, the subject-matter of example 5ad can optionally include that at least one transistor of the plurality of transistors is a field effect transistor.

In example 7ad, the subject-matter of example 6ad can optionally include that at least one field effect transistor of the plurality of transistors is a metal oxide semiconductor field effect transistor.

In example 8ad, the subject-matter of example 7ad can optionally include that at least one metal oxide semiconductor field effect transistor of the plurality of transistors is a complementary metal oxide semiconductor field effect transistor.

In example 9ad, the subject-matter of any one of examples 1 ad to 8ad can optionally include that the array of capacitors includes a number of capacitors in the range from about 400000 capacitors to about 600000 capacitors associated with the at least one laser diode.

In example 10ad, the subject-matter of any one of examples 1 ad to 9ad can optionally include that at least one capacitor of the array of capacitors has a capacitance in the range from about 50 fF to about 200 fF.

In example 11 ad, the subject-matter of any one of examples 1 ad to 10ad can optionally include that the current flow to drive the at least one laser diode includes a current in the range from about 10 mA to about 100 A.

In example 12ad, the subject-matter of any one of examples 1 ad to 11 ad can optionally include that an electrical path between a capacitor and the at least one laser diode has an inductivity lower than 100 pH.

In example 13ad, the subject-matter of any one of examples 1ad to 12ad can optionally include that at least one capacitor of the array of capacitors is a deep trench capacitor.

In example 14ad, the subject-matter of any one of examples 1 ad to 13ad can optionally include that at least one capacitor of the array of capacitors is a stacked capacitor.

In example 15ad, the subject-matter of any one of examples 1 ad to 14ad can optionally include that the capacitors of the array of capacitors are arranged in rows and columns.

In example 16ad, the subject-matter of any one of examples lad to 15ad can optionally include an electrically conductive common line connecting at least some capacitors of the plurality of capacitors.

In example 17ad, the subject-matter of example 16ad can optionally include a power source electrically connected to the common line and configured to provide the power to charge the plurality of capacitors.

In example 18ad, the subject-matter of any one of examples lad to 17ad can optionally include a printed circuit board. The substrate may be mounted on the printed circuit board.

In example 19ad, the subject-matter of any one of examples 16ad or 17ad can optionally include a printed circuit board. The substrate may be mounted on the printed circuit board. The printed circuit board may include an electrical contact electrically coupled to the common line of the substrate.

In example 20ad, the subject-matter of example 19ad can optionally include that the electrical contact of the printed circuit board is wire bonded to the common line of the substrate.

In example 21ad, the subject-matter of any one of examples 16ad to 20ad can optionally include a printed circuit board. The substrate may be mounted on the printed circuit board. A first terminal of the at least one laser diode may be electrically coupled to the common line. A second terminal of the at least one laser diode may be electrically coupled to an electrical contact of the printed circuit board.

In example 22ad, the subject-matter of example 21ad can optionally include that the electrical contact of the printed circuit board is wire bonded to the second terminal of the at least one laser diode.

In example 23ad, the subject-matter of any one of examples 1 ad to 22ad can optionally include the substrate includes or essentially consists of silicon.

In example 24ad, the subject-matter of any one of examples 1 ad to 23ad can optionally include that the at least one laser diode laterally covers at least a portion of the plurality of capacitors.

In example 25ad, the subject-matter of any one of examples 1 ad to 24ad can optionally include that the at least one laser diode includes an edge emitting laser diode.

In example 26ad, the subject-matter of any one of examples 1 ad to 24ad can optionally include that the at least one laser diode includes a vertical cavity surface-emitting laser diode.

In example 27ad, the subject-matter of any one of examples 1 ad to 26ad can optionally include that the processor is monolithically integrated in the substrate.

In example 28ad, the subject-matter of any one of examples 19ad to 26ad can optionally include that the processor is mounted on the printed circuit board.

In example 29ad, the subject-matter of any one of examples 19ad to 28ad can optionally include that the processor is configured to control the plurality of switches to discharge at least some capacitors of the plurality of capacitors to drive the at least one laser diode to emit a laser pulse of a predefined pulse shape.

In example 30ad, the subject-matter of example 29ad can optionally include that the laser pulse has a pulse duration of about 10 ns.

In example 31ad, the subject-matter of any one of examples 29ad or 30ad can optionally include that the processor is configured to control the plurality of switches to discharge at least some capacitors of the plurality of capacitors to drive the at least one laser diode to emit a laser pulse dependent on a light emission scheme.

In example 32ad, the subject-matter of any one of examples 29ad to 31ad can optionally include that the processor is configured to control the plurality of switches to discharge at least some capacitors of the plurality of capacitors to drive the at least one laser diode to emit a laser pulse of a predefined pulse shape.

Example 33ad is a LIDAR Sensor System including an optical package of any one of examples 1 ad to 32ad.

A scanning LIDAR system (e.g., a one-dimensional scanning LIDAR system) may be limited in how small the illumination angle provided by the system may be. Illustratively, there may be a minimum achievable value for the angle at which the LIDAR light may be emitted by the LIDAR system. Such minimum value may be, for example, in the range from about 10° to about 20°. The limitation may be related to the components at the emitter side of the LIDAR system, illustratively to the size of the components provided for emitting the scanning LIDAR light (e.g., the size of a light source and/or the size of a beam steering element, for example of a micro-electro-mechanical system (MEMS) mirror). Smaller illumination angles may be provided, for example, by employing smaller light sources or by blocking a portion of the light emitted by the light source (e.g., by means of an aperture), which however may induce losses in the emitted light.

Various embodiments may be related to configuring or adapting an optics arrangement for a LIDAR system (e.g., for the LIDAR Sensor System 10) to provide a small illumination angle (e.g., smaller than 10°, for example smaller than 5° or smaller than 3°). The optics arrangement described herein may provide emitting light at a small angle without cutting or blocking part of the light emitted by a light source of the optics arrangement. The small illumination angle may provide a greater (e.g., longer) detection range for a LIDAR system including the optics arrangement described herein.

FIG. 170 shows a side view of an optics arrangement 17000 for a (e.g., scanning) LIDAR system in a schematic representation in accordance with various embodiments. The optics arrangement 17000 may be included (e.g., integrated or embedded) in the LIDAR Sensor System 10 (for example, in a scanning LIDAR Sensor System 10).

In various embodiments, the optics arrangement 17000 may include focusing optics (e.g., to direct or collimate or focus the light emitted by a light source onto an actuator, as described in further detail below). The optics arrangement 17000 may include a collimator lens 17002, for example a cylindrical lens. The collimator lens 17002 may map (in other words, converge) a plurality of input light beams **17004*i* entering at a plurality of input angles to a plurality of output light beams 17004*o* at a plurality of output angles. Illustratively, the collimator lens 17002 may receive a plurality of input light beams 17004*i* each at a respective input angle (e.g., at a respective incidence angle the input light beam 17004*i* makes with a perpendicular to the surface of the collimator lens 17002). The collimator lens 17002 may be configured such that each received input light beam 17004*i* is output by the collimator lens 17002 as an output light beam 17004*o* making a respective output angle with the perpendicular to the surface of the collimator lens 17002**.

In various embodiments, the optics arrangement 17000 may include an actuator 17006. The actuator 17006 may be arranged downstream of the collimator lens 17002 (e.g., with respect to the direction in which the light beams propagate, for example with respect to a first direction 17052, e.g. along which an optical axis 17008 of the optics arrangement 17000 may be aligned). The actuator 17006 may be configured to redirect the plurality of output light beams **17004*o* from the collimator lens 17002 into a field of emission 17010. A redirected light beam 17004*r* may be redirected with a first output angle with respect to the optical axis 17008 of the optics arrangement 17000 (only as an example, a first output angle with respect to an oscillation axis of the actuator 17006, as described in further detail below). Additionally, the actuator 17006 may be configured or controlled to scan the field of emission 17010 with the redirected light beams 17004*r* along a scanning direction, for example aligned along a second direction 17054, perpendicular to the first direction 17052**, e.g. a horizontal direction.

The actuator 17006 may have a lateral extension, e.g. a height M (e.g., a diameter), along the direction of the axis of the actuator 17006 (e.g., along the vertical direction, e.g. the height M may be the height of a MEMS mirror). By way of example, the actuator axis may be a MEMS axis, e.g. an axis around which a MEMS mirror oscillates, as described in further detail below. The actuator 17006 may have a second lateral extension, e.g. a width M' (e.g., a diameter), along a direction perpendicular to the axis of the actuator 17006 (e.g., along the horizontal direction), as illustrated in FIG. 171B.

The field of emission 17010 may also be referred to as field of view of the optics arrangement 17000. Illustratively, the field of emission 17010 may be a field of view into which light may be emitted by the optics arrangement 17000. The field of emission 17010 may be or substantially correspond to a field of view of the LIDAR Sensor System 10, in case the LIDAR Sensor System 10 includes the optics arrangement 17000.

In FIG. 170 (as well as in FIG. 171A and FIG. 171B, and in FIG. 172A to FIG. 172C described in further detail below), for reasons of readability of the representation, the actuator 17006 is illustrated as transmitting or redirecting (e.g., refracting or diffracting) the light beams away from the light source 42 (and away from the collimator lens 17002), e.g. the actuator 17006 is illustrated arranged between the light source 42 and the field of emission 17010. It is understood that the actuator 17006 may additionally or alternatively be configured to reflect or redirect the light beams towards a field of emission located at an opposite side compared to the field of emission 17010, e.g. a field of emission illustratively located at the same side as the light source 42. It may also be possible to have an actuator (or a plurality of actuators) partially redirecting the light beams towards the field of emission 17010 and partially redirecting the light beams towards a field of emission arranged at an opposite location compared to the field of emission 17010.

In various embodiments, the actuator 17006 may be an angle steering element (also referred to as beam steering element). The angle steering element may be configured or controlled to control (e.g., to vary) the angle of the redirected light beams 17004*r*. As an example, the actuator 17006 may be a fine angle steering element, illustratively an angle steering element providing fine resolution (e.g., resolution in providing an output angle for a redirected light beam 17004*r*, for example a resolution of about 0.5° or about 1°).

By way of example, the actuator 17006 may be or include a micro-electro-mechanical system, e.g. the actuator 17006 may be a MEMS actuator. As an example, the micro-electro-mechanical system may be an optical phased array. As another example, the micro-electro-mechanical system may be a metamaterial surface, e.g. the micro-electro-mechanical system may include a metamaterial. As a further example, the micro-electro-mechanical system may be a mirror (also referred to as MEMS mirror). The MEMS mirror may have an oscillation axis, illustratively an axis around which the MEMS mirror oscillates, for example an axis substantially perpendicular to the optical axis 17008 of the optics arrangement 17000 (e.g., an oscillation axis substantially along the third direction 17056, e.g. an axis not exactly perpendicular to the optical axis to prevent back-reflection towards the light source 42 of beams reflected by the MEMS mirror). The MEMS mirror may be configured to be tilted around one axis (1D-MEMS) or around two axes (2D-MEMS).

In various embodiments, the optics arrangement 17000 may include a light source (e.g., a semiconductor light source), e.g. the light source 42. The light source 42 may emit a plurality of light beams to the collimator lens 17002 as the plurality of input light beams 17004*i*. Illustratively, the light source 42 may be configured to emit light, for example in the visible wavelength range or in the infrared wavelength range (for example in the range from about 700 nm to about 2000 nm, for example in the range from about 860 nm to about 1600 nm, for example at about 905 nm). The light source 42 may be configured or arranged to emit light towards the collimator lens 17002 (illustratively, the collimator lens 17002 may be arranged downstream of the light source 42, e.g. along the first direction 17052). In case the light source 42 is an infrared light source, the optical components (e.g., the collimator lens 17002 and other components described in further detail below) of the optics arrangement 17000 may be configured to operate in the infrared wavelength range (e.g., in the range from about 700 nm to about 2000 nm).

In various embodiments, the light source 42 may be configured to emit laser light (e.g., infrared laser light). The light source 42 may include one or more laser light sources (e.g., configured as the laser source 5902 described, for example, in relation to FIG. 59). By way of example, the one or more laser light sources may include at least one laser diode, e.g. one or more laser diodes (e.g., one or more edge emitting laser diodes and/or one or more vertical cavity surface emitting laser diodes). As an example, the light source 42 may be or include an array (e.g., a one-dimensional array or a two-dimensional array) of laser diodes, for example the light source 42 may be or include a laser bar.

The light source 42 may have a lateral dimension or extension, e.g. a length L, (e.g., a dimension along a direction perpendicular to the optical axis 17008 of the optics arrangement 17000, for example along a third direction 17056 parallel to an actuation axis of the actuator 17006, e.g. along a vertical direction perpendicular to the first direction 17052 and to the second direction 17054). Illustratively, the lateral extension may be a length of the light source 42, e.g. of an emitting surface of the light source 42. By way of example, the light source 42 may include a plurality of laser sources arranged along the length L (e.g., the laser source 42 may be a laser bar of length L).

In various embodiments, the focal length (also referred to as focal distance) of the focusing optics, e.g. the focal length of the collimator lens 17002 (e.g., denoted as focal length $f_1$), may be dependent on the size of the actuator 17006 (e.g., the size of a MEMS mirror) and on the radiation angle of the light source 42 (denoted with the symbol a, also referred to as divergence angle), e.g. the angle at which a light beam is emitted by the light source 42. The angle α may be the divergence angle along the slow axis of the light source 42, e.g., the radiation angle along the slow axis of a laser bar), as described in further detail below. Illustratively, the slow axis of the light source 42 may be aligned along the third direction 17056.

The focal length $f_1$ of the collimator lens 17002 may be selected in accordance with the other components of the optics arrangement 17000. The focal length $f_1$ of the collimator lens 17002 may describe (e.g., correspond to) the distance from the collimator lens 17002 at which the light is focused, for example focused along an axis of the actuator 17006 (e.g., along a MEMS-axis, for example parallel to the slow axis of the light source 42). The collimator lens 17002 may be arranged downstream of the light source 42 at a first distance l along the first direction 17052. The actuator 17006 may be arranged downstream of the collimator lens 17002 at a second distance m along the first direction 17052. The focal length $f_1$ of the collimator lens 17002 may be equal to the first distance l and to the second distance m, as described below.

The description and the calculations below may be provided for the plane defined by the direction of the light (e.g., the first direction 17052, along which an optical axis 17008 of the optics arrangement 17000 may be aligned) and the actuator axis (e.g., the axis around which the actuator 17006 oscillates, for example aligned along the third direction 17056).

The following relationships may be determined, $$f_1=l=m \tag{12ak}$$

$$f_1=m=L/(2*\tan(\beta/2)) \tag{13ak}$$

$$M=2*l*\tan(\alpha/2), \tag{14ak}$$

$$f_1=l=M/(2*\tan(\alpha/2)) \tag{15ak}$$

wherein the angle beta β may be or correspond to the angle with which the to light departs from the actuator 17006 (e.g., the output beam angle behind the actuator 17006, e.g. behind the MEMS mirror). The angle β may be the angle with respect to the optical axis 17008 (in the plane defined above) at which a redirected light beam 17004*r* is output by the actuator 17006. In the configuration illustrated in FIG. 170, the angle beta β may be the illumination angle is provided by the optics arrangement 17000 (e.g., the illumination angle of a LIDAR system including the optics arrangement 17000 at the emitter side).

As a numerical example, the lateral extension of the light source 42 (e.g., the length L, e.g. the length of a laser bar) may be in the range from about 1 mm to about 10 mm. As another numerical example, the radiation angle α may be in the range from about 5° to about 45°. As a further numerical example, the lateral extension of the actuator 17006 (e.g., the height M) may be in the range from about 1 mm to about 3 mm. According to such exemplary numerical values, the focal length $f_1$ of the collimator lens 17002 may be in the range from about 3 mm to about 10 mm.

As described by the equations (12ak) to (15ak) above, the focal length $f_1$ of the collimator lens 17002 may be defined by or dependent on the illumination angle β and the dimension of the light source 42, e.g. the length L. The dimension of the actuator 17006, e.g. the height M (illustratively, the required height to collect the light emitted by the laser bar 17002) may be defined by the radiation angle α of the light source 42. In case the actuator 17006 is smaller (e.g., shorter) than the required height, a portion of the (e.g., laser) light may be blocked, for example by means of an aperture. Illustratively, a portion of the light emitted by the light source 42 at larger angles may be blocked since such portion would not impinge onto the actuator 17006. In principle, in the optics arrangement 17000 shown in FIG. 170, the étendue of the light source 42 in the plane described above (e.g., L*α) should be equal to (or smaller than) the étendue of the actuator 17006 (e.g., M*β). The étendue limit may prevent providing small illumination angles (e.g., smaller than 10°).

As described above, the actuator 17006 may have a lateral extension (e.g., the height M, e.g. a diameter) in the millimeter range. The dimension of the actuator 17006 should be in such millimeter range, for example, in case the actuator 17006 is operated quickly (e.g., with a scanning rate greater than 1 kHz), such that the applied forces may be kept low. Thus, in is view of this limitation and in view of the equations (12ak) to (15ak) above, a small illumination angle β (e.g., in the range from about 1° to about 5°, for example smaller than 3°, e.g. an angle to be provided in case the optics arrangement includes a liquid crystal polarization grating (LCPG)), a length L of a light source greater than 4 mm, and a divergence angle α of about 15° may not be realized without any inherent losses. Illustratively, such small illumination angle may not be realized without incurring in high losses in the emitted light (e.g., high power losses), for example by blocking a portion of the light. Alternatively, small light sources with small radiation angles may be employed (e.g., small or short laser bars), which however may provide light with low power or may provide losses at the emitter side. Furthermore, a laser bar may be too large for operating with a LCPG, illustratively the radiation angle achievable with a laser bar may be too large for operating with a LCPG. Various embodiments described herein may provide overcoming such limitation in the illumination angle and may provide an optics arrangement capable to provide a small illumination angle, as described below in further detail.

FIG. 171A shows a side view of the optics arrangement 17000 in a schematic representation in accordance with various embodiments. FIG. 171B shows a top view of the optics arrangement 17000 in a schematic representation in accordance with various embodiments.

The optics arrangement 17000 illustrated in FIG. 171A and FIG. 171B may include an additional optical component (and optionally further additional components) with respect to the configuration illustrated in FIG. 170, e.g. to provide a smaller illumination angle, as described in further detail below. The description of the components already described in relation to FIG. 170 will be omitted.

In various embodiments, the optics arrangement 17000 may include a correction lens 17102. The correction lens 17102 may be arranged downstream of the actuator 17006 (e.g., along the first direction 17052, illustratively with respect to the direction into which the plurality of redirected light beams **17004*r* travel, e.g. along a direction along which the optical axis 17008 of the optics arrangement 17000 may be aligned). The correction lens 17102 may be configured to reduce the first output angle of a (e.g., redirected) light beam 17004*r* downstream of the actuator 17006 entering the correction lens 17102 to direct the light beam 17004*r* into the field of emission 170010 with a second output angle with respect to the optical axis 17008 of the optics arrangement 17000. Illustratively, the correction lens 17102 may receive the light beams output downstream of the actuator 17006 towards the field of emission 17010 (e.g., each at a respective incidence angle). The correction lens 17102 may be configured such that each received light beam 17004*r* is output by the correction lens 17102 as an output light beam making a respective (e.g., second) output angle with the perpendicular to the surface of the correction lens 17102 (illustratively, the perpendicular to the surface may be aligned along the first direction 17052). The (second) output angle from the correction lens 17102 may be the (e.g., adapted or reduced) illumination angle of the optics arrangement 17000 (e.g., of the LIDAR Sensor System 10). The (second) output angle from the correction lens 17102 may be smaller than the (first) output angle from the actuator 17006**.

In various embodiments, the correction lens 17102 (e.g., its optical properties, such as the focal length $f_2$) may be configured according to an output angle to be provided (e.g., in accordance with an illumination angle to be achieved), as described in further detail below. It is understood that the correction lens 17102 is represented in FIG. 171A, FIG. 171B and FIG. 171C as a single lens only as an example. The correction lens 17102 may be or include a plurality of optical elements, e.g. the correction lens 17102 may be an optical system including or consisting of a plurality of optical elements (e.g., a plurality of lenses).

The correction lens 17102 may have a focal length, e.g. denoted as focal length $f_2$. The correction lens 17102 may be arranged downstream of the actuator 17006 at a third distance a along the first direction 17052. A distance b (e.g., indicated by the symbol b) may be a fourth distance between the correction lens 17102 and the point in the field of emission 17010 to which a light beam is directed, e.g. at which the light beam is focused. The focal length $f_2$ of the correction lens 17102 may be equal to the third distance a and to the fourth distance b.

The following additional relationships between the properties of the components of the optics arrangement 17000 may be determined (e.g., used to arrange or configure the components, e.g. to configure the correction lens 17102), $$a=b=f_2, \tag{16ak}$$

$$f_2=M/(2*\tan(\gamma/2)). \tag{17ak}$$

The angle γ may indicate the angle with respect to the optical axis 17008 at which a light beam is output by the correction lens 17102 (illustratively, the angle γ may be the second output angle, e.g. the angle of illumination, e.g. a desired or predefined output angle).

As mentioned above, the angles α, β, and γ may be angles in the plane formed by the first direction 17052 into which the light beams travel towards the field of emission 17010 (e.g., the first direction 17052 along which the optical axis 17008 may be aligned), and the third direction 17056 along which the actuation axis of the actuator 17006 may be aligned. By way of example, the angles α, β, and γ described above may be symmetric around the optical axis 17008.

The optics arrangement 17000 described herein, illustratively the correction lens 17102, may provide realizing emitter optics (illustratively, without blocking emitted light) even in case the product of the lateral dimension L of the light source 42 with the emission angle α is greater than the product of the lateral dimension M of the actuator 17006 and the illumination angle γ (e.g., the angle at the far field). Illustratively, the étendue limit may be satisfied, and a smaller illumination angle γ may be provided by means of the correction lens 17102. Furthermore, the optics arrangement 17000 described herein may provide the effect that the virtual size of the emitting surface of the light source 42 is enlarged, which may increase the allowable radiated power (e.g., the allowable radiated laser power for compliance with a certain laser class).

The output angle γ from the correction lens 17102 (e.g., any desired angle) may be selected by providing a correction lens 17102 with a respective focal length $f_2$ (taking into consideration the other parameters). The aperture of the correction lens 17102 may increase for decreasing output angle γ. However, increasing the aperture of the correction lens 17102 may not be physically limited, as it would instead be the case for the size of a MEMS in a MEMS-only optics arrangement.

In various embodiments, the optics arrangement 17000 (e.g., the correction lens 17102) may be configured to reduce the first output angle of a light beam from the actuator 17006 entering the correction lens 17102 with respect to the optical axis 17008 to an angle (e.g., a first angle, e.g. a first corrected angle) of approximately 5° at a maximum. Illustratively, the correction lens 17102 (and the other components) may be configured or arranged to provide an output angle of about 5°, e.g. an illumination angle of about 5°.

In various embodiments, the optics arrangement 17000 (e.g., the correction lens 17102) may be configured to reduce the first output angle of a light beam from the actuator 17006 entering the correction lens 17102 with respect to the optical axis 17008 to an angle of approximately 3° at a maximum (e.g., to a second angle smaller than the first angle, e.g. a second corrected angle smaller than the first corrected angle). Illustratively, the correction lens 17102 (and the other components) may be configured or arranged to provide an output angle of about 3°, e.g. an illumination angle of about 3°.

In various embodiments, as illustrated in FIG. 171B and FIG. 171C (showing a correction lens 17102 in a schematic representation), the correction lens 17102 may have cylindrical symmetry around the axis of the actuator 17006 (only as an example, around the oscillation axis of a MEMS mirror). By way of example, the correction lens 17102 may have a curved surface 17102*s* (e.g., a first curved surface and a second curved surface, opposite to one another along the first direction 17052).

The correction lens 17102 may provide a mapping of the actuator 17006 at infinity, e.g. the correction lens 17102 may be configured to image the actuator 17006 (illustratively, along the direction of the axis of the actuator 17006) at infinity. This may provide the effect that the angular distribution of the radiation at the far field may substantially correspond to the intensity distribution at the actuator 17006 (only as an example, on the MEMS).

In various embodiments, the collimator lens 17002 may be a slow axis collimator lens, for example a cylindrical lens. The slow axis collimator lens may be configured or provided to collimate the smaller divergence angle (illustratively, the angle α) of the light beams emitted by the light source 42 (illustratively, to collimate the angle in the plane of the slow axis of the light source 42, for example of an edge emitting laser diode). As described above, in the exemplary configuration shown in FIG. 171A and FIG. 171B, the slow axis of the light source 42 may be oriented along the third direction 17056, e.g. the vertical direction. The fast axis of the light source 42 may be oriented along the second direction 17054, e.g. the horizontal direction. The angle δ in FIG. 171B may indicate the divergence angle of the fast axis of the light source 42 (e.g., in a plane formed by the first direction 17052 and the second direction 17054), which fast axis may be aligned along the second direction 17054.

Illustratively, the collimator lens 17002 may have imaging properties in relation to a direction parallel to the slow axis of the light source 42 (e.g., the third direction 17056). The collimator lens 17002 may have no imaging properties (e.g., may be non-imaging optics) in a direction parallel to the fast axis of the light source 42 (e.g., the second direction 17054).

It is understood, that the alignment of the slow axis and the fast axis of the light source 42 illustrated herein is provided as an exemplary configuration. The light source 42 may also be rotated, e.g. by 90°, such that the slow axis of the light source 42 is aligned along the second direction 17054 (e.g., along the scanning direction of the actuator) and the fast axis is aligned along the third direction 17056. As an example, in case the light source 42 is or includes a single mode laser, the alignment of the slow axis and fast axis (e.g., the alignment of the laser) may be selected arbitrarily.

In various embodiments, the optics arrangement 17000 may optionally include a further collimator lens 17104, for example a cylindrical lens. The further collimator lens 17104 may be arranged downstream of the light source 42 and upstream of the collimator lens 17002 (illustratively, between the light source 42 and the collimator lens 17002). The further collimator lens 17104 may be configured or provided to collimate the light beams emitted by the light source 42 onto the collimator lens 17002 (illustratively, as the one or more input light beams 17004*i*).

By way of example, the further collimator lens 17104 may be a fast axis collimator lens. The fast axis collimator lens may be configured to collimate the larger divergence angle (illustratively, the angle δ) of the light beams emitted by the light source 42 (illustratively, to collimate the angle in the plane of the fast axis of the light source 42).

FIG. 172A to FIG. 172C show the optics arrangement 17000 in a schematic representation in accordance with various embodiments.

In various embodiments, the optics arrangement 17000 may include a coarse angle steering element. The coarse angle steering element may provide a variation in the angle (e.g., mainly around an axis close to the second direction 17054) of light beams output by the coarse angle steering element with a coarse resolution (e.g., with lower resolution than the fine angle steering element, for example 3° or 5°).

The coarse angle steering element may be arranged downstream of the correction lens 17102. The coarse angle steering element may provide an output angle for the light output from the coarse angle steering element larger than the output angle γ of the correction lens 17102, for example in case the correction lens 17102 provides an output angle smaller than a desired output angle (e.g., smaller than a desired illumination angle).

In various embodiments, the optics arrangement 17000 may include a multi-lens array 17202, the multi-lens array 17202 may be or may be configured for example as the multi-lens array described in relation to FIG. 89 to FIG. 97. The multi-lens array 17202 may be arranged downstream of the correction lens 17102 (e.g., between the correction lens 17102 and the field of emission 17010), as shown in FIG. 172A. In this configuration, the multi-lens array 17202 may have an acceptance angle substantially corresponding to the output angle γ of the correction lens 17102.

Additionally or alternatively, the multi-lens array 17202 (e.g., a further multi-lens array) may be arranged between the light source 42 and the collimator lens 17002, as shown in FIG. 172B (e.g., between the slow axis collimator and the fast axis collimator). Illustratively, the multi-lens array 17202 may create a plurality of virtual light sources emitting light towards a respective portion or segment of the field of emission 17010 or a respective portion or segment of the collimator lens 17002.

By way of example, the multi-lens array 17202 may include a plurality of lenses (e.g., micro-lenses) each shaped (e.g., curved) as the correction lens 17102 shown in FIG. 171C. In case the light source 42 emits infrared light, the multi-lens array 17202 may be configured to operate in the infrared light range.

The multi-lens array 17202 arranged downstream of the correction lens 17102 may be provided, for example, in case a substantially rectangular angular distribution of the intensity of the emitted light is provided (e.g., along the third direction 17056), as illustrated by the graph 17204. The graph 17204 may include a first axis 17204*a* associated with the emission angle, and a second axis 17204*i* associated with the light intensity. The graph 17204 may include a curve 17204*d* representing the angular distribution of the intensity of the emitted light. It may also be possible to provide a rectangular intensity profile directly on the actuator 17006 by means of a beam shaping lens.

In case the multi-lens array 17202 is arranged between the light source 42 and the collimator lens 17002, the multi-lens array 17202 may be made smaller than in the case the multi-lens array 17202 is arranged downstream of the correction lens 17102 (e.g., the multi-lens array 17202 may include a smaller number of micro-lenses).

In various embodiments, additionally or alternatively, the optics arrangement 17000 may optionally include a diffusive element 17206, as illustrated in FIG. 172C. The diffusive element 17206 may be arranged downstream of the correction lens 17102 (e.g., between the correction lens 17102 and the field of emission 17010). The diffusive element 17206 may homogenize the angular distribution of the intensity of the emitted light (e.g., mainly along the third direction 17056), as illustrated in the graph 17208. The graph 17208 may include a first axis 17208*a* associated with the emission angle, and a second axis 17208*i* associated with the light intensity. The graph 17208 may include a curve 17208*d* representing the angular distribution of the intensity of the emitted light provided by a diffusive element, e.g. by the diffusive element 17206. The diffusive element 17206 may be a one-dimensional diffusing element, for example a diffusing disc or a diffusing screen. In case the light source 42 emits infrared light, the diffusive element 17206 may be configured to operate in the infrared light range.

In various embodiments, the optics arrangement 17000 may optionally include a liquid crystal polarization grating 17210. The liquid crystal polarization grating 17210 may be arranged downstream of the correction lens 17102, as illustrated in FIG. 172C (e.g., downstream of the diffusive element 17206 in case such element is present). The liquid crystal polarization grating 17210 may be configured to deflect the light towards the field of emission 17010, e.g. in discrete steps. In case the light source 42 emits infrared light, the liquid crystal polarization grating 17210 may be configured to operate in the infrared light range.

In the following, various aspects of this disclosure will be illustrated:

Example 1 ak is an optics arrangement for a LIDAR Sensor System. The optics arrangement may include a collimator lens mapping a plurality of input light beams entering at a plurality of input angles to a plurality of output light beams at a plurality of output angles. The optics arrangement may include an actuator arranged downstream of the collimator lens and configured to redirect the plurality of output light beams from the collimator lens into a field of emission. A redirected light beam may be redirected with a first output angle with respect to an optical axis of the optics arrangement. The optics arrangement may include a correction lens arranged downstream of the actuator and configured to reduce the first output angle of a light beam downstream of the actuator entering the correction lens to direct the light beam into the field of emission with a second output angle with respect to the optical axis of the optics arrangement.

In Example 2ak, the subject-matter of example 1ak can optionally include a light source to emit a plurality of light beams to the collimator lens as the plurality of input light beams.

In Example 3ak, the subject-matter of example 2ak can optionally include that the light source includes one or more laser light sources.

In Example 4ak, the subject-matter of example 3ak can optionally include that the light source includes one or more laser diodes.

In Example 5ak, the subject-matter of any one of examples 1ak to 4ak can optionally include that the collimator lens is a slow axis collimator lens.

In Example 6ak, the subject-matter of any one of examples 1ak to 5ak can optionally include a further collimator lens.

In Example 7ak, the subject-matter of example 6ak can optionally include that the further collimator lens is a fast axis collimator lens.

In Example 8ak, the subject-matter of any one of examples 1ak to 7ak can optionally include that the actuator is an angle steering element. As an example, the angle steering element may be a fine angle steering element.

In Example 9ak, the subject-matter of example 8ak can optionally include that the angle steering element is a micro-electro-mechanical system.

In Example 10ak, the subject-matter of example 9ak can optionally include that the micro-electro-mechanical system is one of an optical to phased array, a metamaterial surface, or a mirror.

In Example 11ak, the subject-matter of any one of examples 1ak to 10ak can optionally include a coarse angle steering element arranged downstream of the correction lens.

In Example 12ak, the subject-matter of example 11ak can is optionally include a liquid crystal polarization grating arranged downstream of the correction lens.

In Example 13ak, the subject-matter of any one of examples 1ak to 12ak can optionally include a multi-lens array and/or a diffusive element.

In Example 14ak, the subject-matter of example 13ak can optionally include that the multi-lens array is arranged between the light source and the collimator lens.

In Example 15ak, the subject-matter of any one of examples 13ak or 14ak can optionally include that the multi-lens array and/or the diffusion disc are/is arranged downstream of the correction lens.

In Example 16ak, the subject-matter of any one of examples 1ak to 15ak can optionally include that the optics arrangement is configured to reduce the first output angle of a light beam from the actuator entering the correction lens with respect to the optical axis of the optics arrangement to a first angle. The first angle may be for example about 5° at maximum.

In Example 17ak, the subject-matter of example 16ak can optionally include that the optics arrangement is configured to reduce the first output angle of a light beam from the actuator entering the correction lens with respect to the optical axis of the optics arrangement to a second angle smaller than the first angle. The second angle may be for example about 3°.

Example 18ak is a LIDAR Sensor System including one or more optics arrangements of any one of examples 1ak to 17ak.

Chapter "Detection Systems"

LIDAR Sensor Systems need to provide accurate and timely Feedback Signals (Feedback System) in order to allow for fast and reliable object recognition for vehicle (LIDAR Sensor Device) control as well as for other vehicle-based Applications (Use Cases). LIDAR Data Analysis necessitates sufficient Signal/Noise-Ratios (SNR) for efficient calculation (Computer Program Device, Data Storage Device, Soft- and Hardware) of information about the observed object, e.g. point clouds (Point Cloud), and recognition of objects (Data Analysis, Object Recognition, Object Classification) that are detected within the Field of View (FOV).

In order to fulfill these requirements, particularly in order to increase the SNR, it can be beneficial to not only use one LIDAR laser beam for scanning purposes but more than one, for example three of four, possibly up to 10 or 20, or higher.

In combination with a MEMS mirror system, a first (infrared) laser emits a pulse (and then also subsequent pulses) at a first point in time via reflection at the MEMS mirror system into a first solid angle which is within a first FOV angular range, and a second laser emits a laser pulse (and subsequently other pulses) towards the MEMS mirror system at a slightly shifted angle (with respect to the MEMS-surface), for example with an angular difference of less than 0,24°, in such a way that the reflected (second) laser beam pulse (radiation) is still within the first FOV angular range. The difference in the angular orientation between two laser diodes can be 2-dimensional value, that is, in all angular directions.

Laser wavelengths, but also pulse shapes and intensities, can be identical or different, whereby the wavelengths in some implementations lie between 800 nm and 1600 nm.

Both laser diodes can emit their pulses simultaneously or at slightly different times (ns to μs time scale).

The advantage is that the combined pulse strength, when simultaneously emitted, is higher than a single one thus leading to an increased SNR value, or, when emitted at slightly different points in time, lead to reflected laser pulses whose sensor signals can be time-correlated so that the combined sensor signal can be differentiated from other external infrared radiation (noise), and thus also improve the SNR value. Of course, a higher number of laser diodes can be used in a similar way.

This means that a LIDAR Sensor Systems for object recognition is equipped with a plurality of laser emission systems (minimum two/First LIDAR Sensing Systems), with at least one sensor unit (Second LIDAR Sensing System) to measure object-reflected LIDAR pulses, with a spatially adjustable mirror system, whereby a first laser sequentially emits laser pulses via the mirror system into a first, second, and so on, solid angle and at least a second laser that emits, simultaneously or sequentially to the first laser pulse, a laser pulse via the mirror system into one of the solid angles of the first laser beam. Depending on the methods of emission, a sensor system can be configured to measure reflected laser pulses with spatial and/or angular resolution.

As already described, it is important for a LIDAR Sensor System to allow fast and reliable object detection. It can be advantageous to have more than one laser emit their radiation, simultaneously or sequentially, into the same solid angle (angular pixel) thus improving the SNR-value. The detector (Second LIDAR Sensing System, Sensor System, Optics), in some implementations a CCD- or CMOS-array, is configured to resolve backscattered LIDAR pulses from different solid angles (angular pixels, angular resolution) of the Field of View (FOV). The LIDAR Sensor System can emit the radiation into the entire Field of View (FOV) or just into angular segments of it.

Depending on the methods of emission, a sensor system (Second LIDAR Sensing System) can be configured to measure reflected laser pulses with spatial and/or angular resolution.

A combination of detecting the entire FOV as well as additionally an angular segment of it can lead to an improved SNR value. The position and size of the angular segments can be adjusted, for example depending on vehicle-external or vehicle-internal conditions (LIDAR Sensor Device conditions), like vehicle road density, critical environmental conditions, driver alertness, and the like, as well as depending on methods of signal processing.

The First LIDAR Sensing System can be permanently mounted in a fixed position in regard to a LIDAR Sensor Device (e.g. vehicle), or it can be attached in a moveable, tiltable, and rotatable manner. The First LIDAR Sensing System can use mirror systems, for example a MEMS or DMD mirror system.

Such a First LIDAR Sensing System can time-sequentially emit laser pulses in an ordered, predefined, and structured way or stochastically. Alternatively or in combination/addition, the laser pulses can vary their pulse intensities and pulse forms (shapes) thus allowing a signal coding and, via the detection system, signal decoding, thus improving the SNR ratio. Laser wavelengths, but also pulse shapes and intensities, can be identical or different, whereby the wavelengths in some implementations lie between 800 nm and 1600 nm.

This means that a LIDAR Sensor Systems for object recognition is equipped with a plurality of First LIDAR Sensing Systems (at least two), with at least one angular-sensitive sensor unit to measure the object-reflected LIDAR pulses (Second LIDAR Sensing System), whereby at least two of the plurality of laser emitter (Light Source) emit radiation into at least two solid angles (angular pixels) that are different in their angular orientation and/or size and whereby the laser pulses are emitted simultaneously or sequentially. The laser pulses can differ in the intensity, pulse shape or any other physical features, as well as in regard to their emission time and timing-sequence, thus providing coded signals in order to improve the SNR ratio.

As already stated above, it is important for a LIDAR Sensor System to provide a high Signal-to-Noise-Ratio (SNR) in order to allow for fast and reliable object detection. This is especially important when cars that are equipped with LIDAR systems approach each other thus leading to a situation where the respective LIDAR systems can disturb each other in so far as a vehicle's LIDAR detectors can receive laser pulses from other vehicles within their usual waiting time (Measurement Window), typically in the range of 2 μs, after an own laser pulse was sent out thus leading to false recognition of an (non-existent) object.

One solution for this problem is to have a LIDAR laser system emit laser pulses in a time-stochastic manner and correlate the respective detector (sensor) signal with the pulse emission time stamp. A stochastic time stamp can be generated using known mathematical (for example based on Fibonacci sequences) or physical (for example based on thermal noise provided by a semiconductor device) methods.

It can be advantageous that the emission points in time (time stamps) of two subsequent pulses have a defined (minimum) time difference. This helps to identify the individually emitted laser pulses (no time overlap) but also not to overpower a used laser diode (distributed power load). It can be advantageous that the emission points (time stamps) of two subsequent laser pulses have a defined (preselected, minimum) time difference that is greater than the delay time between two Detection Time Windows (Measurement Windows) thus further avoiding a laser overpowering condition.

It can be advantageous that the emission points (time stamps) of two subsequent laser pulses vary within a minimum and a maximum time difference value (Variation Amplitude) of the Detection Window (Measurement Window) but otherwise fulfilling the above described timing conditions. It can be especially advantageous when the Variation Amplitude (as defined before) is a function of a quality indication parameter such as a resolution measure of a feedback signal or a SNR-value. Another method is to track the time stamps of incoming laser pulses as a function of the (known) emission points of the own laser pulses in a kind of histogram analysis.

It can further be advantageous when the Variation Amplitude (as defined before) has a value that is greater than the average (mean) value of the above mentioned own-pulse-correlated or own-pulse-uncorrelated time stamps (or the equivalent of a mean value of the related Fourier transformed frequency). Other advantageous methods use histogram analysis of a series of subsequent pulses and/or of only pulses that are only counted when they exceed a pre-defined or calculated threshold value.

This means that a LIDAR Sensor Systems for object recognition is configured to vary the time difference between subsequent Detection Time Windows (Measurement Windows). The timing between two subsequent laser pulses can be stochastic and/or greater than a defined minim value variation, which can be greater than a Detection Time Window. The amount of variation can be greater than a reference value, for example a SNR-value and/or a defined threshold value.

A LIDAR Sensor System where the angular information (object recognition) about the environment is gained by using an angularly sensitive detector is called a Flash LIDAR Sensor System, in contrast to a Scanning LIDAR Sensor System where the angular information is gained by using a moveable mirror for scanning (angularly emitting) the laser beam across the Field of View (FOV) and thus having an angular reference for the emitted and the reflected laser beam.

A Flash laser system uses an array or matrix of detectors (detection segments, sensor pixels) that are employed with optics that provide an angular resolution. It is advantageous if the various detector segments (sensor pixels) do not have gaps between them because this would reduce overall image resolution. On the other hand, using sensor pixels with increased sensing area are costly.

An advantageous solution to this problem is using a sensor system that has at least one moveable component, for example, an optical component such as a lens or a lens system. Another solution is to have a LIDAR Sensor System where the sensor pixels are moveable. Of course, both embodiments can be combined. For example, the sensor pixels are (laterally or diagonally) moved in such a way that the moving distance corresponds to half of a sensor pixel length or smaller.

Another way is to move an optical component, like a lens or lens system, (laterally or diagonally) relative to the sensor matrix (sensor pixel). Lateral or diagonal movement in the above described way helps reduce dead sensor spaces and improve image resolution. LIDAR measurements will then be done in a first position (i.e. a first geometrical relationship between sensor pixel and optical components) and then in a second position different from the first one. The two detection signals are then (mathematically) combined and/or correlated leading to an increased SNR-ratio and higher image resolution. In some embodiments, the lateral movements can be done in such way that the corresponding angular sections within the FOV (also called voxels) are different from each other but may have some angular overlap.

Another preferred method is to employ a movement with a moving direction that has perpendicular component in regard to the before mentioned lateral movement.

It is also advantageous to employ a condition where a moving distance and/or a minimum moving distance and/or a maximum moving distance are selected in each a stochastic manner.

This means that a LIDAR Sensor Systems for object recognition is equipped with a pixelated detection unit (Sensor System) and an optical component or multiple components that are laterally and/or diagonally moved relative to each other in order to perform LIDAR measurement at each of these positions. A sensor data analysis system (LIDAR Data Processing System) can then combine and/or correlate these measurement signals leading to a higher image resolution and improved SNR-ratio.

It is important that LIDAR Sensor Systems emitting from the own LIDAR Sensor Device (e.g. vehicle) as well as such emitting from other LIDAR Sensor Devices (e.g. vehicles) do not disturb each other because this could lead to a false (positive) recognition of a (non-existent) object.

This advantageous method describes a system of at least two LIDAR Sensor Systems of the same vehicle that are synchronized with each other so that they emit and detect laser pulses in different measurement time windows that do not overlap with each other. This measurement technique is applicable to more than two LIDAR Sensor Systems, for example, to 8, or to 20 LIDAR Sensor Systems.

In order to employ such a measurement system it is necessary that the at least two LIDAR Sensor Systems are time-synchronized with each other. This can be done, for example, when a vehicle is started, or during certain times when the vehicle is driving.

It is advantageous when each of the at least two LIDAR Sensor Systems has a communication interface that allows bidirectional communication and when a high accuracy internal clock (internal timer) communicates synchronization signals so that the at least two LIDAR Sensor Systems work in a synchronized manner.

Synchronization can also be done optically, for example, when a LIDAR Sensor System emits a coded LIDAR laser pulse, or LIDAR laser pulses that are time sequentially coded, that then is/are detected by the other of the at least two LIDAR Sensor Systems and, decoding the pulse information, can adjust the synchronization.

It is also advantageous when the individual starting points of the respective time measurement windows occur in a statistical manner, but under the condition that the same LIDAR Sensor System should not measure in time windows that immediately follow each other. Mathematical processing of measurement signals coming from measurement windows that have such stochastic time setting increases the SNR-value thus leading to a better (and probably faster) object detection.

It is also advantageous when the subsequent starting times of a laser's time measurement window show a delay time that is much longer than the time measurement window itself, for example by a factor of 5, or 10, or 20, or longer. A factor of 5 means that 5 LIDAR Sensor System can be used that emit and measure pulses within a time measurement window of 2 μs. This corresponds well with a laser pulse frequency of 100 kHz.

It is also advantageous when a length of the measurement time window is dynamically adjusted as a function of vehicle velocity. If, for example, a close object is detected and a scanning LIDAR mirror system is used, the length of the measurement time windows can be shortened and thus the time difference between subsequent pulses increased, thus further avoiding confusion with not corresponding incoming LIDAR pulses from other LIDAR Sensor Systems.

Another advantage when using dynamically adjustable measurement time windows is that, for example, in order to measure an object that is 300 m away and a 100 kHz laser is used, 5 different LIDAR Laser Sensor Systems can be used, and that, for example, for an object that is only 150 m away, 10 different LIDAR Laser Sensor Systems can be used. This allows to increase image resolution and SNR-values for short object distances. Another advantage of such a synchronized LIDAR measurement system is that since the sensor measurement time windows and the timing of the emission of the different laser pulse systems are known, a specific measurement time windows can be used to measure the pulse of another LIDAR Sensor System of the same LIDAR Sensor System array.

A sequence for example is that the first laser emits a pulse that is detected within the first measurement time window correlated to this laser, and a second laser emits a laser pulse that is detected within the second and the first extended measurement time windows thus increasing the effective sensor area and thus the SNR-value and the robustness of a LIDAR Sensor System, especially when it comes to a reflection from specular or mostly specular reflecting object surfaces due to the fact that the original laser beam may not be reflected back to the corresponding sensor measurement time window but may instead be detected within the sensing corresponding sensor measurement time window.

This advantageous method describes a system of at least two LIDAR Sensor Systems that are synchronized with each other so that they emit and measure laser pulses in different time windows that do not overlap with each other and whose measurement time windows and/or the delay time between subsequent measurement time windows are dynamically adjusted and even allow that a first measurement time windows can measure synchronized laser pulses stemming from a second laser system that emits during a subsequently following second measurement time window. Furthermore, this advantageous method allows to adjust the amount of used laser sensor systems as a function of object distance thus further increasing image resolution and SNR-value.

As already described in other aspects of this disclosure, it is important that a LIDAR Sensor System is able to detect an object quickly and reliably. Problems doing this are, for example, aliasing-artefacts that occur when a sampling rate is less than the twofold of the highest frequency of a signal (Nyquist-Shannon-Sampling Theorem), or when stroboscopic effects lead to a distorted signal detection.

The advantageous solution applies stochastic emission and/or stochastic detection method, or a combination of both of them. A stochastic sequence can be generated employing known mathematical (for example based on Fibonacci sequences) or physical (for example based on thermal noise provided by a semiconductor device) methods, as is standard knowledge.

LIDAR Sensor Systems can use a so-called Flash-Pulse-System, or a Scan-Pulse-System, or a combination of both (Hybrid-LIDAR). The advantageous method is applicable to all of them.

Scanning systems usually employ MEMS-mirrors systems that oscillate with a defined frequency in the range of kHz to Mhz.

A scanning LIDAR Sensor System employing this advantageous method emits laser pulses in a time-stochastic manner. This leads to the fact that laser pulses are emitted in various 'stochastic' directions within the Field-of-View (FOV) thus scanning the FOV in an angle-stochastic manner. This method reduces the aliasing effects based on the Nyquist-Shannon-Sampling Theorem. One effect of this measurement method is that objects are more likely to be detected quicker than with the usual non-stochastic pulse method.

A variant of the stochastic method is to use a determined laser pulse trigger function that is overlaid with a stochastic time variation. This variant reduces the possibility that stochastic laser pulse are unluckily emitted in the same direction within the FOV.

Another variant is when a laser pulse, stochastically or regularly, is emitted in such a way that it falls randomly on one of many mirror elements (MEMS or DMD) that reflect the laser beam into the FOV thus leading to a stochastic scanning process.

Another variant is when either the Light Source or the scanning system (Light Scanner), or both, are laterally or spatially moved in respect to each other in a stochastic manner thus leading to a stochastic scanning process within the FOV. This variant can be combined with all aforementioned stochastic emission methods.

Further variants are possible when two such LIDAR Sensor is Systems are combined, for example, in such a way that the first (stochastic) LIDAR Sensors System detects an object with the FOV, and a second LIDAR Sensor System then scans within the object-related angular space with a finer spatial resolution. The two LIDAR Sensors Systems can communicate with each other. They need not to be employed within one and the same vehicle, they can be employed in different vehicles, but need to be configured to communicate with each other. For all above mentioned embodiments it is advantageous to use a LIDAR detector system and a data analysis system that transforms the detector pixel information by using a data deconvolution method or other suited methods that are known in imaging and signal processing methods, including neuronal and deep learning techniques.

Sensor system and related method for operating a scanning LIDAR Sensor System that employs stochastic variation of either time-based laser emission, angle-based laser emission, spatial relation between emitter and detector, or a combination of all of them.

As already described in other aspects of this disclosure, it is important that a LIDAR Sensor System is able to detect an object quickly and reliably and that LIDAR pulses from different LIDAR Sensor Systems can be discriminated from each other in order to avoid false positive object recognition. The advantageous method of a reliable LIDAR pulse discrimination is to vary or modulate, including stochastic modulation, LIDAR laser pulse shapes, for example Gaussian, Lorentzian or saw-tooth, pulse rise times, pulse fall times, pulse widths, including stochastic modulations of a combination of some or all these parameters.

Furthermore, this method can be combined with a variation, especially a stochastic variation, of pulse length, pulse distance and distance of subsequent measurement windows. All laser pulse parameters as well as all other parameters as described above are recorded and can be analyzed, for example using standard cross-relation analysis functions, in order to allow a reliable correlating of reflected pulses with the corresponding emitted pulses.

An advantageous LIDAR Sensor Unit emits laser pulses whose pulse shapes, forms, rise times, fall times or a combination of some or all of these parameters are modulated, especially in a stochastic manner.

As already described in other aspects of the description, MEMS or DMD mirror systems can be used as scanning elements and/or for specific angular distribution of a laser beam. A DMD micro mirror array can have a multitude of matrix-like arranged tiny mirror pixels, for example 854×480, or 1920×1080 or 4096×2160.

In an advantageous embodiment, both MEMS and DMD, can be used, at least in one mirror position, to reflect object-reflected LIDAR radiation onto a sensor system. This means that optical systems like MEMS or DMD can play a double role as they do not only reflect laser beams into the Field-of-View (FOV) but can also be used to reflect, at least in one mirror position, backscattered laser beam pulses onto a sensor, preferred onto a sensor array having multiple sensor segments.

In other words, each of the DMD mirrors can assume three angular positions (ON, flat, OFF) and be configured to reflect laser radiation into a FOV when in an ON state, and reflect backscattered radiation into a beam dump when in an OFF state, and to reflect backscattered laser pulses onto a sensor when in a Flat state.

Another aspect is the use of a mirror device (MEMS, DMD) to steer both, visible light (White, RGB) as well as laser infrared light (850 nm to 1600 nm), into the same Field-of-View (FOV) in a time sequential manner and where the infrared laser beam emission is followed by a measurement time window during that no visible radiation is reflected from the mirror device. This allows the use of the same mirror device for projection of white or colored light, for example for projection of signs and messages onto a street, as well as laser radiation, preferred infrared LIDAR pulses for object detection, in a time sequential manner. The backscattered LIDAR pulses are then measured by a sensor device, for example an APD. The mirror system is adaptive, that is, each mirror pixel can be steered individually and assume one of three mirror positions (ON, flat, OFF) according to the actual task and purpose.

Another aspect is that the mirror pixels of the used DMD can be combined into groups and subgroups that can be steered simultaneously in either one of the operation modes visible light and infrared LIDAR light.

Another aspect is to provide means so that the point in time of a LIDAR pulse emission is communicated to a sensor system as this allows for an accurate time basis for the sensor measurement time window necessary for an improved SNR-value and emitter/sensor calibration. In order to achieve this goal, a part of the emitted laser beam is split or refracted by an optical system, for example a lens or a separate mirror, and then, directly, or indirectly via reflection on an reflective surface, brought to the sensor. This optical coupling has no delay time as the laser beam spreads with the velocity of light, thus allowing a correct synchronization of laser emission time and the start time of the of measurement time window of the sensor element.

Another aspect is the use of a multi-spectral approach where a LIDAR Sensor System emits and measures laser pulses that have different wavelengths and are emitted and measured simultaneously or time sequentially. This allows for better object recognition because the object reflectivity may be a function of the laser wavelength thus allowing better object recognition.

Another aspect is the use of a fish-eye-shaped optical component, for example a lens or a lens system that projects the various spatial segments of the Field-of-View (FOV) onto a 1-dimensional or 2-dimensional or 3-dimensional sensor image plane. The sensor image plane may include of fixed-sized sensor elements and/or of sensor pixels that can be adaptively grouped into larger or smaller sensor areas. The spatial segments can be equal or unequal in their size and/or shape and/or distance, measured in a plane that is perpendicular to the optical axis of a sensor array. Depending on the optical characteristics of the fish-eye lens system, the various spatial segments (FOV) can be projected equally or unequally onto the image plane, that is, their images can be equal in size and/or shape or not.

In an unequal projection, equal spatial segments become distorted (fish-eye-lens effect) and thus their image on the image plan (sensor) is different in size and/or shape. In some embodiments, some of the equal spatial segments are projected onto the image plane having a larger image size, whereby the correlated sensor surface area (for example the compound of various sensor pixels) matches the image size and/or shape. It is especially advantageous to project the vertically oriented outer spatial segments (FOV) onto smaller sensor areas, as would be the case for spatial segments that lie closer to the middle of the vertical FOV. By this, the central spatial segments are related to larger sensor surface areas leading to signals with better SNR-values.

In a preferred embodiment, the shape and/or diffractive properties of the fish-eye is adaptable, for example as a function of vehicle speed, environmental conditions, incoming infrared noise, regular SNR, and detected objects. The term adaptable includes lens form shaping, at least partially, and/or rotation of the fish-eye-lens around an optical or any other axis, and/or by moving and/or tilting the lens in regard to the sensor area. It is then advantageous to correlate the actual lens characteristic with the effective surface of a sensor field, in particular by grouping distinct sensors pixels to a larger sensor area.

A fish eye lens can have segments that have distortion-less characteristics and other that have pincushion or barrel distortion characteristics.

Furthermore, different parts of the fish-eye-lens can be effective only within a defined wavelength range (for example 905 nm), other parts can be optimized for other laser wavelengths, for example 1550 nm.

It is further advantageous to combine the two LIDAR Sensor Systems with two scanning mirror (MEMS) devices.

In one aspect, the mirror systems can oscillate synchronously so that two laser beams are scanned synchronously with each other and hit the same spot on an object. Therefore, two measurement signals are generated thus improving signal strength and Signal-to-Noise ratio.

Another aspect is that the two LIDAR lasers can emit infrared laser pulses with different wavelengths, but, via the mirror system, still fall synchronously on the same object spot. The two back-scattered laser pulses are then directed onto two sensing elements each sensitive to the corresponding laser wavelength. Proper analysis of the measured signals lead to better object detection since the two different wavelengths, infrared or visible, for example blue, are reflected differently.

In another aspect, the two laser pulses can differentiate in terms of laser wavelength, pulse shape, pulse length, beam polarization and the like thus offering even more options for a combined signal measurement. In another aspect, when employing at least two lasers with different wavelengths, the two (or more) mirror systems can be scanned with a phase delay, or even opposite to each other, that is one mirror from left to right and the other vice versa.

It is advantageous to combine sensor data of different sensing systems, like Radar, Camera, Ultrasound, in order to derive a more reliable object information. This is called sensor fusion.

For a vehicle, as a LIDAR Sensor Device, it is especially advantageous when driving at night, because then the camera sensing system can detect the vehicle's (car, motorbike, bicycle) headlights very easily and can now work together with a LIDAR Sensor System. A camera can detect a headlight based on its brightness, also in contrast to the adjacent brightness conditions, as well as with respect to its light color and/or light modulation. Detection means that a camera sensor (CCD, CMOS) measures certain pixel signal data.

In one aspect, the camera system can input the signal data into a subsequent camera data analysis and object recognition device allowing object classification, which can, in a subsequent step, be used for vehicle control.

At night, a camera sensor would measure two illumination hot spots coming from the two vehicle headlights and relay this information in an indirect way, via camera data analysis and camera object recognition, to the LIDAR Sensor System, or in a direct way, that is without first going through the camera analytics tools. It is advantageous to provide the camera sensor data directly to the LIDAR controller without first going through both the camera and/or the LIDAR data analytics devices and thus allowing the controller to immediately act on this input. It is especially advantageous, if a camera sensor (CCD, CMOS) is directly hardwired to the LIDAR data analytics device and/or a LIDAR sensor array that can, especially during night driving conditions, use this information as direct input for its own analytical functions. Instead of using camera sensor pixel brightness, the output data from each of the camera sensor color pixels (RGB) can be used. This allows influencing LIDAR measurement and/or LIDAR object recognition based on camera color image data. This method is also applicable to measuring rear lights other front lights like Daytime Running Light (DRL), or light indicators.

It is known that autonomously driving vehicles need to rely on more than one sensor technology in order to perform reliable object recognition and steering control and therefore there is a need to perform the fusion of the various data streams from multiple sensors as quickly and reliably as possible. It is particularly helpful if a camera's image recognizing system correlates with LIDAR Sensor System generated data and assists in quick and reliable data analysis, including object detection and recognition.

FIG. 1 describes the components as well as data and information flow connections of a LIDAR sensor system 10 in order to enable the proposed data analysis method and vehicle steering control by the Control and Communication System 70.

The LIDAR sensor system 10 includes a first LIDAR Sensor System 40 and a second LIDAR Sensor System 50. Furthermore, one or more circuits and/or one or more processors may be included in the LIDAR sensor system 10 to provide subsequent Data and Signal Processing 60, 61.

The generation of meaningful Sensor Data by the first LIDAR Sensor System 40 and the second LIDAR Sensor System 50 together with subsequent Data and Signal Processing 60, 61 as well as any subsequent information analysis 62 that allows reliable vehicle steering should be performed as quickly and as reliably as possible.

All this should be accomplished on a time scale of milliseconds (ms) or faster and furthermore should be reliable in order to reduce the level of uncertainty in object recognition and also in order to compensate for each sensor's inherent imprecisions and technical limitations. Furthermore, synchronization of various sensor data processing should be addressed.

Any combined sensor approach should be able to better detect objects and assess the driving and environmental situations more quickly and reliably—even under inclement weather conditions (e.g. fog, rain, snow, etc.), and also during various day and night situations, e.g. strong glare due to near-horizon position of the sun, upcoming traffic during night, etc.

In other words, both, LIDAR sensor elements (also referred to as LIDAR sensors or sensors) 52 and Camera sensors, perform their respective Field-of-View (FoV) analysis independent from each other and come to separate (individual) measurement and analysis results, for example, two different point clouds (three-dimensional (3D) for LIDAR, two-dimensional (2D) for a regular camera, or 3D for a stereo camera), and separate object recognition and/or classification data. This leads to Results A (LIDAR) and Results B (Camera) for a system comprised of the LIDAR First Sensor System 40 and the Second LIDAR Sensor System 50, as well as a Camera sensor system 81. In various embodiments, more than one LIDAR Sensor System 10 and more than one Camera sensor system 81, for example a stereo camera system, may be provided. The camera 81 may be located somewhere on a vehicle or in the same module or device as the first LIDAR Sensor System 40 or the second LIDAR Sensor System 50 or even be embedded in or jointly manufactured with the LIDAR sensing element 52. It is also possible that the LIDAR sensing elements and Camera sensing elements are the same. Depending on the used sensor systems and mathematical models, sensor point clouds may have the same or different dimensionality. The hereinafter used term 'multi-dimensional' should encompass all such combinations of point cloud dimensionalities.

After each sensor 52 and subsequent Data Analysis Processing 60, 61 have accomplished object recognition (2D or 3D point cloud) and/or object classification, both results (Camera and LIDAR) are compared with each other, for example by the LIDAR Data Processing System 60, and a joint analysis result (e.g. Result C=Result A*Result B) is generated, for example based on mathematical procedures, pattern recognition methods, and the use of prediction methods like a Bayesian inference method.

In other words, the first LIDAR Sensing System 40 (i.e. the emission device) and the second LIDAR Sensing System 50 (i.e. the detection device) generate a point cloud that represents the scanned/probed environment. Subsequently, Signal Processing 61, Data analysis and Computing 62 may take place in order to perform Object Recognition and Classification, leading to a LIDAR Data Set (LDS). Similarly, the Camera system 81 is configured to output its data to the Camera's Data Processing and Analysis Device, leading to a corresponding Camera Data Set (CDS).

Both, LIDAR and Camera sensor signals usually need, at one point in time, a digitalization.

Camera Sensor Pixel Layout and Color-Coding Filter

Electronic cameras that use optical filters for color cut-off and transmission of the residual wavelengths are known, for example as CCD or CMOS cameras employed in Smartphones. It is also known to optimize the color filters of such CCD-Cameras in order to better detect white car headlights or read car taillights.

Standard color value components and luminance factors for retroreflective traffic signs are specified in accordance with DIN EN 12899-1 and DIN 6171-1. The color coordinates of vehicle headlamps (dipped and high beam, daytime running lights) are defined by the ECE white field (CIE-Diagram) of the automotive industry. The same applies to signal colors, whose color coordinates are defined, for example, by ECE color boundaries. See also CIE No. 2.2 (TC-1.6) 1975, or also BGBI. II—Issued on 12 Aug. 2005—No. 248). Other national or regional specification standards may apply as well.

Accordingly, the transmission curves of the used sensor pixel color filters should comply with the respective color-related traffic regulations. Sensor elements having sensor pixels with color-filter need not only be arranged in a Bayer-Pattern, but other pattern configurations may be used as well, for example an X-trans-Matrix pixel-filter configuration.

In addition, other types of color filter combinations, like CYMG (cyan, yellow, green and magenta), RGBE (red, green, blue, and emerald), CMYW (cyan, magenta, yellow, and white) may be used as well. The color filters may have a bandwidth (FWHM) in the range from about 50 nm to about 200 nm.

In the following, various approaches to solve this problem or improve technical solutions are described.

Processing of Pre-Analyzed Camera Data

FIG. 73 shows a portion 7300 of the LIDAR Sensor System 10 in accordance with various embodiments.

Various embodiments may be applied with advantage to night driving conditions. The reason is that headlights and other lights (tail lights, brake lights, signalling lights) of vehicles driving ahead and vehicles driving in the opposite (on-coming) direction are illuminated and thus can be easily recognized by a camera system, while for a LIDAR system there is not much difference between daylight and nightlight situations. Therefore, since background (noise) illumination levels are usually much dimmer than a car's headlight (or a car's brake, tail and signalling lamps, or street lamps, roadside posts, traffic lights or reflections from road signs), a camera's respective signal processing and SNR-optimization can be done more easily.

This means that when the camera pixel signals are processed through the camera data analysis system, these two bright light spots, or generally any bright light spot (for example coming from road signs or traffic lights), can easily be identified (more information about this method is provided below) as a car or another vehicle (motorcycle, bicycle) or any other light emitting or reflecting traffic object, e.g. by comparing with and matching to an object database (containing geometrical information of a vehicle's light fixtures, as well as traffic lights, motorcycles, bicycles, etc.).

Since the pairs of vehicle lights are distanced from each other, also the activated camera pixels, or respective groups of camera pixels, will be distanced from each other. It is suggested to use such a color-coded pixel distance as indication for a pair of vehicle lights and thus a vehicle. A post-processing process can then be used to calculate the center of the respective pixel groups and their center-to-center pixel distance. Furthermore, color-coded distance values could be compared with a data base that keeps such information per car type. Post-processing can be done, for example, by the camera's data processing unit and data storage and handling system.

In principle, various embodiments are also applicable for daylight-sensitive cameras since they also employ color filters in front of their sensors or use, for example, a Foveon color depth method, and therefore all measured light spots usually also generate color-correlated signals. This means that this method in accordance with various embodiments may be applied as well for daytime driving conditions, for example, in order to recognize the pairs of Daytime Running Light (DRL) light sources.

All this leads to a differentiated Camera Data Set (DCDS) that contains the measurement data together with the assessment-information of the respective vehicles or other illuminated and identified traffic objects and thus enables an advantageous method.

Both data sets (LDS and DCDS) may be sent to the LIDAR's Data Processing and Analysis Device 60, that is configured to compare the provided information and, based on mathematical methods, may perform a combined Object Recognition and Classification processing or just relies on the Camera object detection and assessment and only matches it with the LIDAR generated measurement data.

This data set may again be tested if it meets certain requirements, e.g. pixel comparison, edge and shape comparison, in order to be considered reliable, and if not, a new measurement and/or a new calculation, or a new sensing method may be carried out.

As already pointed out, both camera and LIDAR Sensor System perform data measurement and analysis on their own. However, as will be described below, a camera system that is optimized for vehicle recognition under night driving conditions will improve object recognition and subsequent vehicle control.

LIDAR measurements generate 3D Point Cloud Data that can be used for object recognition and classification. Camera measurements generate a 2D, or in the case of a stereo camera, a 3D color-coded data set that can also be used for object recognition and classification. Subsequent sensor data fusion may improve object recognition.

When driving at night (including dusk and dawn) it may be beneficial to implement the disclosure of the above-cited Prior Art. It is possible to decrease the color-coded pixel sensitivity or the sensitivity of the subsequent read out process so that only stronger signals will be measured. This means that only (or mainly) the strong signals coming, for example, from the two white light emitting headlights, or from the two bright red light emitting tail lights or from the two bright yellow light emitting indicator lights, or the signals coming from light backscattered from red-reflecting or white-reflecting parts of a street sign etc. are measured since only they exceed the applied color-coded signal detection threshold.

On the other hand, it is also possible to increase the color-coded pixel sensitivity or the sensitivity of the subsequent read out process due to the fact, that background illumination is reduced during nighttime conditions.

As already explained above, it is provided to use such a color-coded pixel distance as indication for a pair of vehicle lights and thus a is vehicle.

The color-coded pixel sensitivity and/or the sensitivity of the subsequent read out procedure can be adjusted as function of the ambient lighting situation, which may be assessed by the camera itself or by a separate ambient light sensor, which is in communication with the camera, but also as a function of vehicle driving velocity and vehicle-to-vehicle distance.

The camera 81 may be part of the first LIDAR Sensing System 40 and/or the second LIDAR Sensing System 50, or may be a standalone device, but then still connected to LIDAR Sensing Systems 40, 50 and/or to other components, such as the sensor 52, the sensor controller 53, the Data Processing and Analysis Device 60, and functions of the LIDAR Sensor System 10 and may be part of the Controlled LIDAR Sensor System 20. The camera 81 may be connected to the sensor 52 and/or to the sensor controller 53 and/or to the LIDAR Data Processing System 60 and/or to a LIDAR Sensor Management System 90.

In various embodiments, the camera 81 may be optimized with respect to night vision conditions. Cameras that are optimized for night vision operation may have sensor pixel with sufficient (adjustable) sensitivity in the infrared and thermal wavelength range. Furthermore, such cameras may include IR cut-off filters that may be removed from the camera imaging system in case of low ambient light levels. By way of example, the pixel read out thresholds may be set in accordance with night vision conditions (night operation) or in accordance with twilight conditions (twilight operation). By way of example, a night vision equipment of the camera 81 may be active in to this case.

In various embodiments, the camera 81 detects (block 7302 in FIG. 73) color-coded pixel sensor signals 7304 and forwards the same to a camera-internal pixel analysis component 7306. The camera-internal pixel analysis component 7306 is configured to analyze the received color-coded is pixel sensor signals 7304 (e.g. performs a solely camera-based preliminary object recognition and/or object segmentation) and to supply the camera analysis result 7308 to the Data Processing and Analysis Device 60 of the LIDAR Sensor System 10. Furthermore, the second LIDAR sensor system 50 may be configured to detect LIDAR sensor signals 7310 and provide the detected LIDAR sensor signals 7310 to the Data Processing and Analysis Device 60. The Data Processing and Analysis Device 60 may be configured to perform a LIDAR data analysis (block 7312) of the received LIDAR sensor signals 7310 and to supply the LIDAR analysis result 7314 to a LIDAR-internal data fusion and analysis component 7316 (e.g. performs a solely LIDAR-based preliminary object recognition and/or object segmentation). The LIDAR-internal data fusion and analysis component 7316 may be configured to provide a data fusion and analysis of the received camera analysis result 7308 and the LIDAR analysis result 7314 and to provide a data fusion analysis result 7318 to the Control and Communication System 70 and the LIDAR Sensor Management System 90. The Control and Communication System 70 and the LIDAR Sensor Management System 90 may be configured to control a vehicle and/or the LIDAR sensor system 10 based on the received fusion analysis result 7318.

Processing of Camera Data by the LIDAR Data Processing System or the LIDAR Data Management System FIG. 74 shows a portion 7400 of the LIDAR Sensor System 10 in accordance with various embodiments.

In various embodiments, the camera 81 may be optimized with respect to night vision conditions. By way of example, the pixel read out thresholds may be set in accordance with night vision conditions (night operation) or in accordance with twilight conditions (twilight operation). By way of example, a night vision equipment of the camera 81 may be active in this case.

In various embodiments, the data provided by the camera 81 are not further processed (further to the mere signal processing such as analog-to-digital-converting) and/or analyzed by means of any electronic components of the camera 81. To the contrary, electronic components of the LIDAR Sensor System 10 such as of the LIDAR Data Processing System 60 and/or of the LIDAR Sensor Management System 90 may be used to perform the digital signal processing and/or analysis of the camera signals provided by the camera 81. These embodiments are particularly interesting in case of the camera 81 being optimized with respect to night vision conditions. In such a case, a specific night vision signal processing and/or analysis may be provided. The camera 81 may transmit (hard-wired or wireless) color-coded pixel data (digital or analog) to the LIDAR Data Processing System 60 and/or to the LIDAR Sensor Management System 90. The LIDAR Data Processing System 60 and/or the LIDAR Sensor Management System 90 analyzes the "raw" color-coded camera data and then may provide a sensor data fusion with the sensor data received by the LIDAR sensor 52. In various embodiments, the camera 81 may include a housing and a camera interface (not shown). The camera 81 may be configured to transmit the "raw" color-coded camera data via the camera interface to the LIDAR Data Processing System 60 and/or to the LIDAR Sensor Management System 90 for further processing and/or analysis. One or more components (e.g. one or more processors) of the LIDAR Data Processing System 60 and/or the LIDAR Sensor Management System 90 are configured to further process and/or analyze the received "raw" color-coded camera data. By way of example, the one or more components may be configured to perform object recognition based on the "raw" color-coded camera data (in other words, the RGB values or the CMY values assigned to the respective pixels—or other values depending on the used color space). The one or more components may determine camera-pixel-distance data from the "raw" color-coded camera data and may use these camera-pixel-distance data as a basis for the object recognition.

In other words, in various embodiments, the camera sensor is (which may be or include a CCD array and/or CMOS array) outputs its signal data, with or without prior digitalization, directly to the LIDAR Data Processing System 60 and/or to the LIDAR Sensor Management System 90 without being first processed by the camera's own data analysis system. This data transfer can, for example, be done by a multiplexed read out of the camera pixels.

This information flow may be gated by the LIDAR sensor controller 53 or the LIDAR Data Processing System 60, so that the camera 81 and LIDAR read outs can be differentiated in a time sequential manner. Time sequential can mean that the read out frequencies of the two sensor signals (first sensor signal provided by the LIDAR sensor 51 and second sensor signal provided by the camera 81) are different on a time scale of, for example, micro-seconds (μs) for a LIDAR pulse, followed by a brief time interval that allows for camera pixel read out (pixel read out timescale of ns/GHz to ps/THz; total camera frame read out in the order of 10 ms with a frame rate of 100 fps). This (or any other) time-differentiated signal treatment ensures data identity and synchronicity. In principle, the camera and LIDAR signal processing can also be done in parallel, if the systems are such configured.

The LIDAR's Data Processing and Analysis Device 60 may be configured to compare the provided information from the camera 81 and the LIDAR sensor 52 and, based on mathematical methods, performs a combined Object Recognition and Classification. This may include the already described pixel center-center distance measuring method. If the object-recognizing data meet certain requirements, e.g. pixel comparison, edge and shape comparison, they are considered to be reliable, if not, a new measurement and/or a new calculation, or a new sensing method have to be carried out.

The LIDAR Data Processing System 60 may then, based on either the camera results (B) or the LIDAR results (A) or the combined results (C=A*B) provide feedback to the LIDAR Sensor Management System 90 in order to influence the scanning process, e.g. repeating a scanning or scan a certain FoV-region with higher intensity or accuracy).

Both, LIDAR sensor signals and camera sensor signals, usually need, at one point in time, a digitalization.

The above-described procedure will now be explained in more detail.

Camera pixel mapping:

For a given camera-optic-combination, the relationship between any color-coded camera sensor pixel and its associated Angular Camera Field-of-View (ACV) is known. The pixel-related ACV-value corresponds to the Field-of-View solid angle that is projected onto a given CCD pixel. If a camera-optic-combination (lens, aperture, focus) changes, because they are adjusted in the process of measurement, these angular relationship are known as well and can be represented by a new $ACV_i$-value, with index i=actual camera configuration.

Mapping of camera CCD pixels with respective angular of view and storing data:

Such (constant or changing) pixel-ACV relations can be mapped by generating a Camera-Sensor-Pixel-ACV-Relationship-Matrix (CSPACVM). The storage medium for such a matrix or matrices can be located inside the camera 81, or, as part of the below described aspects of this disclosure, transferred and stored somewhere else in the vehicle, for example in the sensor controller 53 or the LIDAR Data Processing System 60.

Mapping of LIDAR sensor pixels with respective angular of view:

Furthermore, since, for a given LIDAR sensor optic, the relationship between any LIDAR sensor pixel and its Angular LIDAR Field-of-View values (ALV) at a certain time is also known, these relations can be likewise stored into a LIDAR-Sensor-Pixel-ALV-Relationship-Matrix (LSPALVM).

For Flash device or scanning device:

For a LIDAR flash measurement method, this LSPALVM-relationship does not change over time, since the LIDAR sensor optics arrangement(s) do(es) not change. For a LIDAR scan method, the angular relationships are known for any measurement instant and can again be stored as time-dependent LIDAR-Sensor-Pixel-ALV-Relationship-Matrices (LSPALVM). Like above, such a matrix or matrices may be transferred and stored, for example, in the LIDAR sensor controller 53 or the LIDAR Data Processing System 60.

LIDAR voxel matrix:

The LIDAR Time-of-Flight method measures the distance to detected objects, i.e. each detected object, or part of an object, may be assigned a distance value. These distance values together with the LIDAR-Sensor-Pixel-ALV-Relationship-Matrices (LSPALVM) define a grid point in a 3-dimensional space, also called a voxel, whose coordinates in space can then be calculated. Then, these relational data can be stored into a LIDAR-Sensor-Pixel-Voxel-Relationship-Matrix (LSPVM).

The Camera-Sensor-Pixel-ACV-Relationship-Matrix (CSPACVM) and the LIDAR-Sensor-Pixel-Voxel-Relationship-Matrix (LCPVM) can be set in relation to each other and these relational values can be stored into a Camera-LIDAR-Voxel-Relationship-Matrix (CLVRM).

It is to be noted that such Camera pixel to LIDAR voxel relationships might not be a 1:1 relationship, as there are usually different numbers of Camera sensor pixels and LIDAR sensor pixels or voxels. Therefore, by way of example, at least a one-time pixel to voxel mapping needs to be done, but the mapping can be adjusted in the course of a measurement.

In any case, some of the below described aspects of this disclosure are based upon such relational data matrices.

It is to be noted that cameras might be designed just for night vision applications, or for daylight and night vision applications, although then with different color sensitivities.

It is also possible to use pixel-filter patterns that are optimized for recognition of headlight radiation, stop light radiation, yellow indicator or signalling lighting, etc. For example, the pixel-filter-pattern may have a higher percentage of red- or yellow-filtered pixels, for example, 25% green, 50% red and 25% yellow, or 25% green, 25% red and 50% yellow, and/or an optimized pattern of color-coded pixels, like a grouping of same-color-coded pixels.

It is also understood that camera and LIDAR pixels need to be read out, for example using ND-Converter and bit-resolved digitalization.

To summarize the process flow as shown in FIG. 74, in various embodiments, the camera 81 detects color-coded pixel sensor signals 7304 and forwards the same to an analysis component 7402 of the Data Processing and Analysis Device 60 of the LIDAR Sensor System 10. Furthermore, the second LIDAR sensor system 50 may be configured to detect LIDAR sensor signals 7310 and to provide the detected LIDAR sensor signals 7310 to the analysis component 7402 of the Data Processing and Analysis Device 60 of the LIDAR Sensor System 10. The analysis component 7402 is configured to analyze the received color-coded pixel sensor signals 7304 (e.g. performs a solely camera-based preliminary object recognition and/or object segmentation) and to supply the camera analysis result 7308 to the LIDAR-internal data fusion and analysis component 7316. The analysis component 7402 of the Data Processing and Analysis Device 60 may further be configured to perform a LIDAR data analysis of the received LIDAR sensor signals 7310 (e.g. performs a solely LIDAR-based preliminary object recognition and/or object segmentation) and to supply the LIDAR analysis result 7314 to the LIDAR-internal data fusion and analysis component 7316. The LIDAR-internal data fusion and analysis component 7316 may be configured to provide a data fusion and analysis of the received camera analysis result 7308 and the LIDAR analysis result 7314 and to provide a data fusion analysis result 7318 to the Control and Communication System 70 and the LIDAR Sensor Management System 90. The Control and Communication System 70 and the LIDAR Sensor Management System 90 may be configured to control a vehicle and/or the LIDAR sensor system 10 based on the received fusion analysis result 7318.

Processing of Camera Data by the Second LIDAR Sensor System

FIG. 75 shows a portion 7500 of the LIDAR Sensor System 10 in accordance with various embodiments.

In various embodiments, the camera 81 may be optimized with respect to night vision conditions. By way of example, the pixel read out thresholds may be set in accordance with night vision conditions (night operation) or in accordance with twilight conditions (twilight operation). Here, the term night vision shall encompass the entire lighting conditions between dusk and dawn encompassing natural and artificial lighting scenarios. By way of example, a night vision equipment of the camera 81 may be active in this case.

In various embodiments, no data analysis may be provided neither in the LIDAR sensor 52 nor in the camera 81. The "raw" camera data may be further processed and/or analyzed by one or more components (e.g. one or more processors) of the second LIDAR sensor system 50. This may be advantageous in an example in which the camera 81 is optimized for night vision operation mode as described above. The camera 81 may transmit the color-coded pixel data (digital or analog pixel data) directly to the read out connection of the LIDAR sensor pixel 52. In this case, it is assumed that the LIDAR sensor pixel read out process is controlled and carried out by the LIDAR sensor controller 53. To achieve this, one or more camera switches may be provided in the LIDAR sensor system 10 to directly connect the camera sensor with e.g. the LIDAR sensor controller 53 or the LIDAR Data Processing System 60 and/or the LIDAR Sensor Management System 90.

In case of a LIDAR measurement, the LIDAR switch is closed and the camera switch is open so that only the LIDAR sensor signals are read out.

In case of a camera measurement, the LIDAR switch is open and the camera switch is closed so that only the (possibly pre-processed) camera sensor signals are read out and further processed by the components of the second LIDAR sensor system 50.

The second LIDAR sensor system 50 may amend one or more subsequent LIDAR measurements based on the camera sensor data.

In various embodiments, a plurality of switches are provided to directly connect a camera sensor pixel with an associated LIDAR sensor pixel 52. To achieve this, a camera pixel-to-LIDAR pixel-mapping is provided which may be predetermined e.g. in a design phase of the circuits.

In the night vision operating mode (e.g. during a night drive) and thus at night vision conditions, the camera pixel read out sensitivity may be substantially reduced at the camera measurement or the camera pixel read out process. In this case, only the strong signals of head lights of a vehicle (e.g. white light), of tail lights of a vehicle (e.g. red light), of signalling lights of a vehicle (e.g. yellow light). This may simplify the signal analysis and evaluation. The camera pixel read out sensitivity may be set as a function of the degree of twilight. Illustratively, a camera sensor pixel may be read out (e.g. by the second LIDAR sensor system 50) in case the camera sensor pixel signal exceeds the respectively associated read out threshold.

In various embodiments, a direct wiring and data transfer of camera pixel read out to the mapped LIDAR sensor pixels may be provided. A use of a one-time mapping, for example, for a Flash LIDAR, will be described in more detail below.

The camera color-coded pixels, or group of such pixels, are mapped to the sensor pixels of the LIDAR sensor element 52 that are acting on the same Field-of-View segments or voxels, and electrically connected (hard-wiring or monolithically). For mapping, one of the above described (constant) relational matrices can be used. For this, it is convenient if camera and LIDAR sensor elements are positioned as close as possible, for example, located on the same substrate or even monolithically manufactured so that hard-wiring is simplified. Such a pixel-voxel mapping may be done once when the camera-LIDAR-system (i.e. the LIDAR sensor system 10) is designed and implemented. Electrically connected is to be understood that the camera sensor pixels, or group of camera sensor pixels, are connected to the respective LIDAR sensor read out connections, though not directly but via an electronic switch. Thus, the signals from the camera sensor pixels do not interfere with an ongoing LIDAR measurement (LIDAR switch closed, camera switch open), but are only used within the Camera Measurement Time window (camera switch closed, LIDAR switch open) and can then be processed by the LIDAR Data and Signal Processing 60 and/or the LIDAR Sensor Management System 90.

The camera sensor system 81 and the first LIDAR Sensing System 40 as well as the second LIDAR Sensing System 50 may work sequentially, i.e. after a certain number of LIDAR measurements, one (or some) time slot(s) will be reserved for camera measurement and read outs, also called frame rate. For a camera 81 with 100 fps (Frames per second), each frame, containing thousands of sensor pixels, may be captured at 1/100 seconds or 10 ms. A higher camera frame rate may lead to a shorter read out interval. If the color-coded camera sensor pixels are measuring a signal, their mapped sensor signals are transferred to the respectively connected LIDAR sensor pixels (i.e. photo diodes, e.g. photo diodes 2602), while the first LIDAR Sensing System 40 is not emitting a laser pulse, and can then be measured with the LIDAR read out device of the LIDAR sensor controller 53 and then further processed with the LIDAR Data Processing System 60 and/or the LIDAR Sensor Management System 90.

During the camera read out time or after a first camera read out time, the LIDAR sensor controller 53 may modify the settings of the LIDAR sensors 52 or the LIDAR sensor read out device. This means that in a subsequent LIDAR measurement period, the LIDAR sensor controller 53 may, for example, increase the sensitivity of the related LIDAR sensor pixel read out, and/or apply a higher gain factor to the related sensor pixels and/or reduce the gain factor of other pixel elements that are not correlated to the camera-identified colored Fields-of-View Voxels, all this in order to improve latency and accuracy of object detection.

The camera signals may be preprocessed in order to fit them to the LIDAR sensor detection capabilities of the second LIDAR Sensing System 50.

In various embodiments, as already explained, a camera sensor 81 (CCD, CMOS) outputs signal data, with or without prior digitalization, directly to the LIDAR sensor element 52, for example by directly wiring the camera sensor chips to the LIDAR sensor chips 52, and/or directly to the sensor controller 53 of the second LIDAR sensor system 50, in order to be used without having first to go through the camera's own, usually advanced, analysis procedure, thus leading to quicker results.

In other words, instead of feeding the camera sensor data through a camera data processing and analysis device or to the LIDAR Data Processing System 60, they are directly sent to the LIDAR sensor element 52 or to the LIDAR sensor controller 53, so that its data can be used in combination with sequentially obtained LIDAR signal data in providing a (joint) point cloud. This method has the advantage of allowing direct and immediate use of camera data.

The data transfer from the camera sensor 81 to a LIDAR sensor chip 52 and/or to the LIDAR sensor controller 53 may, for example, be done by multiplexed read out of the camera sensor pixels. This information flow can also be gated by the Lidar sensor controller 53 so that the camera and LIDAR read outs can be distinguished from each other.

In either case, the Lidar sensor controller 53 can then perform a time-sequential measurement of LIDAR sensor information and the camera sensor information. Time sequential can mean, that the read out frequencies of the two sensor signals are different on a time scale of, for example, micro-seconds (μs) for a LIDAR pulse, followed by a brief time interval that allows for camera pixel read out (timescale of ns/GHz to ps/THz) or frame read outs (ms).

The LIDAR and camera data may then be sent to the LIDAR Data Processing System 60 which includes the Sensor Fusion function 63, and be processed on different time-scales, for example, micro-seconds (μs) for a LIDAR pulse measurement, followed by a brief time interval that allows for camera pixel read out (timescale of ns/GHz to ps/THz) or frame read outs (ms)—unless the Data Analysis and Computing unit 62 is able to perform parallel data analysis. This time-differentiated signal treatment ensures data identity and synchronicity.

The Lidar Data Processing System 60 may then, based on either the camera results (B) or the LIDAR results (A) or the combined results (C=A*B) provide feedback to the LIDAR Sensor Management System 90 in order to influence the scanning process, e.g. repeating a scanning process or scan a certain FoV-region with higher intensity and better accuracy.

To summarize the process flow as shown in FIG. 75, in various embodiments, the camera 81 detects color-coded pixel sensor signals 7304 and forwards the same to the second LIDAR sensor system 50, e.g. directly to the LIDAR sensor pixels (with a 1-to-1 mapping (in general with an n-to-m mapping) of the camera sensor pixels and the LIDAR sensor pixels). The sensor controller 53 may be configured to sequentially read out either the camera color-coded pixel sensor signals 7304 (in a first read out mode) (block 7502) or the detected LIDAR sensor signals 7310 detected and provided by the LIDAR sensor 52 (in a second read out mode) (block 7504). The LIDAR sensor 52 does not detect LIDAR signals in case the sensor controller 52 operates the second LIDAR sensor system 50 in the first read out mode. In other words, in the first read out mode, the color-coded pixel signals are forwarded from the camera 81 directly to the LIDAR-internal data fusion and analysis component 7316. The second LIDAR sensor system 50 may be configured to send the read out signals to the LIDAR-internal data fusion and analysis component 7316. The LIDAR-internal data fusion and analysis component 7316 may be configured to provide a data fusion and analysis of the received camera color-coded pixel sensor signals 7304 and the detected LIDAR sensor signals 7310 and to provide a data fusion analysis result 7318 to the Control and Communication System 70 and the LIDAR Sensor Management System 90. The Control and Communication System 70 and the LIDAR Sensor Management System 90 may be configured to control a vehicle and/or the LIDAR sensor system 10 based on the received fusion analysis result 7318.

As described in various embodiments, a basic pre-processing by the camera's own Data Processing and Analysis Device, such as filtering, smoothing and merging of data signals to meta-data, may be provided. In this case, the LIDAR sensor controller 53 may treat the camera signals differently.

In various embodiments, the camera sensor system and the LIDAR sensor system may use the same sensing element, for example for a blue LIDAR beam.

In various embodiments, the camera sensor system and the LIDAR sensor system have may the same detector (sensing element) layout and/or the same geometrical and/or functional architecture.

In various embodiments, the camera sensor system and the LIDAR sensor system may have the same detector (sensing element) layout and/or geometrical and/or functional architecture, but may differentiate in regard to their sensitivity for a certain wavelength (e.g. 850 nm vs. 905 nm).

In various embodiments, the information flow and data analysis process can be reversed, e.g. based on pre-defined prioritization settings, so that (unprocessed or pre-processed) LIDAR pixel information is fed to a camera sensor controller in order to influence pixel read out.

Both, LIDAR sensor signals and camera sensor signals usually need, at one point in time, a digitalization.

All of the above described embodiments and methods are suited to especially deal with night driving conditions. The reason is that head lights and other lights (tail, brake, signalling) of vehicles driving ahead and vehicles driving in the opposite direction are illuminated and thus can be easily recognized by a camera system, while for a LIDAR system there is not much difference between daylight and nightlight situations. Therefore, since background (noise) illumination levels are usually much dimmer than a car's head light (or a car's brake, tail and signalling lamps, or street lamps, roadside posts, traffic lights or reflections from road signs), a camera's respective signal processing and SNR-optimization can be done more easily.

Of course, these methods may also be used with advantage during day when cars drive with illuminated headlights or with DRL, fog, tail, rear and indication lamps, because a camera sensor the basically sees one or two bright spots.

It is of course also possible to also use an infrared sensitive camera that, in a similar way, will then detect one or two bright infrared spots. In dual use of visible and infrared camera functions, the respective Field-of-Views might be different.

Of course, in a second (parallel) route, camera data may as well be processed conventionally.

This direct one- or bi-directional (see below) data exchange is referenced as data connections 82*a* and 82*b*.

All of the described embodiments can be applied to and used for the control and steering of a vehicle.

In order to enable the above described approaches, the following descriptions and method details are to be understood and followed.

Components of a CCD/CMOS Camera:

The camera 81 employs a CCD or CMOS sensor array.

Filter: usually, on top of the sensor array are color or infrared filters (in different layouts, e.g. various Bayer Filter configuration). Alternatively or additionally, a camera may employ a Foveon color sensing method.

A micro lens array may be placed on top of a color filter pixel array, e.g. in such a way that each micro lens of the micro lens array corresponds to at least one color filter pixel of the color filter pixel array.

In front of all of that, a camera lens (possibly adjustable) may be placed.

Pixel signals (Active Pixel Sensor (APS)) can also be digitized using an analog-to-digital-converter (ADC).

Alignment of Camera Field-of-View and LIDAR Field-of-View

In order to enable the some of the proposed embodiments, the relationship between camera pixels and their respective Field-of-View should be known. This can be done by a onetime calibration, resulting in a known relationship between a camera pixel (number xy of a pixel array) or a camera meta-pixel group, and the correlated FoV.

In case of deviating pixel resolutions, as the resolution of a camera system is usually significantly higher than that of a LIDAR system, the pixels of the one sensor system, e.g. the camera 81, may be merged to larger super-pixels (meta-pixels) in order to achieve an identical resolution like the other sensor system, e.g. the LIDAR sensor system. Since a LIDAR sensor (Flash or Scan) is also time-correlated to a voxel, a correlation can be established between camera and LIDAR voxel (as described above).

In various embodiments, a stereo camera and/or many cameras can be used to further establish correct LIDAR-Camera voxel-relationship.

There could even be a continuous adaptive adjustment of optical camera components (lens, mirrors, filter), e.g. using voice coils to move, for example vibrate, the mentioned optical parts, and the LIDAR sensor system that communicates with and influences the Camera sensor system for example in regard to the distance/range of detected objects and/or as a function of car speed, thus initiating an adjustment of optical camera parts so that LIDAR voxel and Camera FoV-values are correlated and adaptively optimized for a current driving or measurement situation.

Signal Read Out

As described in various embodiments, the signals of the camera sensor pixels (or meta-pixels) may be directly fed to the LIDAR sensor element 52 and/or to the LIDAR sensor controller 53 and/or to the LIDAR Data Processing Device 60. This may be done in a sequential manner by a camera multiplexer read out device. This means that the LIDAR sensor controller 53 and/or the LIDAR Data Processing Device 60 receive(s) identifiable (FoV-correlated) pixel-related signals from the camera 81.

LIDAR Sensor Controller and/or the LIDAR Data Processing Device

Upon receiving the camera pixel signals, either one of these devices can assess the pixel pulse height or pixel intensity. In addition, these devices also know, due to the above mentioned pre-calibration, the related camera FoV and LIDAR voxel relationships and can then superpose (superimpose) these camera pixel signals on top of the voxel-correlated LIDAR pixel signals. Superposing may include a 1:1 summation, as well as summations with other, for example weighted, relations in order to emphasize certain aspects or in order to prioritize the signals from the one or the other sensor. As a result of this superposition, the combined signals (CS) exhibit superior data quality, e.g. in terms of SNR (signal-to-noise ratio) and contrast (e.g. ratio between bright pixels and dark pixels).

Furthermore, either the camera signals or, in various embodiments, the combined signals can be fed to the LIDAR Sensor Management System that then can decide how to react on this. For example, this can lead to a more precise scanning/probing of the indicated vehicle voxel, e.g. with a higher angular resolution, or to a scanning/probing with higher LIDAR pulse intensity (or with an alternative or additional wavelength).

Another effect is that the camera easily spots the headlights (low and high beam) of oppositely approaching vehicles, and feed this information (as described above) directly to the LIDAR Sensor Controller and/or the LIDAR Data Processing Device. Since the correlated camera FoV-values are known and since they may lay either inside or outside of the LIDAR FoV, respective actions can be taken.

In various embodiments, the camera read out may be performed (e.g. time-sequentially) as a function of color-filtered sensor signal. This allows further signal processing since certain objects (like a cars headlight, a street lamp, a brake light, a traffic sign) emit (or reflect) white/yellow/red light with a certain color temperature or color point. This means that the camera can sent color-filtered, for example in a time-sequential manner, pixel-signals to the LIDAR sensor.

In addition, infrared radiation that is associated with the illumination of a headlight or any other illuminating device may be used in the same way.

Transmission of Camera Signals

The camera pixel signals can be transmitted to the LIDAR Sensor Controller and/or the LIDAR Data Processing Device via the vehicle's Electronic Control Unit (ECU) or, if camera and LIDAR are placed next to each other or otherwise combined, via direct hardwiring. Also wireless Communication is possible. In one embodiment, a LIDAR sensor pixel and an IR-camera sensor pixel can be the same and/or on the same substrate.

Prioritization

In an ideal setting, both, camera sensor pixel signals and LIDAR sensor pixel signals can be processed with the same priority by the (central or edge) data analysis and communication system (computing system) 60 or by the LIDAR Sensor Management System 90. However it could be the case that there is not enough computing power, or there are otherwise limited resources, leading to a data processing and/or analysis bottleneck situation. Thus, a prioritization of data processing may be provided. For example, different sensor results could be taken into account and/or weighted in different (time-sequential) order for the construction of a 3D-point cloud and subsequent data analysis in order to generate a reliable mapping of the environment. Again, in general terms, such sensor point clouds may be multi-dimensional.

Depending on external conditions such as weather, time of day, ambient light, but also speed (because of range), different prioritization methods could be optimal (Prioritization Matrix). For example, in rain and low speed at night, a radar could have the highest priority, while during the day in good weather and at medium speed, the camera sensor data could have higher priority, or a LIDAR sensor system at high speed or strong glare (e.g. due to visible light).

It is to be understood that aspects of this disclosure may be combined, in any order and any combination, in particular, FoV-correlated Camera sensor pixel data can be communicated directly to the LIDAR sensor element 52 and to the LIDAR sensor controller 53 thus increasing the likeliness of reliable object recognition. Another combination is when voxel-correlated camera sensor pixel data are directly sent to the LIDAR sensor controller 53 and to the LIDAR Data Processing device 60.

It is to be understood that embodiments described in this disclosure may be embodied in a non-transitory computer readable medium.

Basic Description of the LIDAR Sensor System

The LIDAR Sensor System 10 may include the first LIDAR Sensing System 40 that may include a Light Source 42 configured to emit electro-magnetic or other radiation 120, e.g. a continuous-wave or pulsed laser radiation in the blue and/or infrared wavelength range, a Light Source Controller 43 and related Software, Beam Steering and Modulation Devices 41, e.g. light steering and reflection devices, for example Micro-Mechanical Mirror Systems (MEMS), with a related control unit 150, Optical components 80, for example lenses and/or holographic elements and/or camera sensors, and a LIDAR Sensor Management System 90 configured to manage input and output data that are required for the proper operation of the First LIDAR Sensing System.

The first LIDAR Sensing System 40 may be connected to other LIDAR Sensor System devices, for example to a Control and Communication System 70 that is configured to manage input and output data that are required for the proper operation of the first LIDAR Sensor System 40.

The LIDAR Sensor System 10 may further include the second LIDAR Sensing System 50 that is configured to receive and measure electromagnetic or other radiation, using a variety of Sensing Elements 52 and the Sensor Controller 53.

The second LIDAR Sensing System 50 may include Detection Optics 82, as well as Actuators for Beam Steering and Control 51.

The LIDAR Sensor System 10 may further include the LIDAR Data Processing System 60 that performs Signal Processing 61, Data Analysis and Computing 62, Sensor Fusion and other sensing Functions 63.

The LIDAR Sensor System 10 may further include the Control and Communication System 70 that receives and outputs a variety of signal and control data 160 and serves as a Gateway between various functions and devices of the LIDAR Sensor System 10.

The LIDAR Sensor System 10 may further include one or a is plurality of Camera Systems 80, either stand-alone or combined with another Lidar Sensor System 10 component or embedded into another Lidar Sensor System 10 component, and data-connected to various other devices like to components of the second LIDAR Sensing System 50 or to components of the LIDAR Data Processing System 60 or to the Control and Communication System 70.

The LIDAR Sensor System 10 may be integrated or embedded into a LIDAR Sensor Device 30, for example a housing, a vehicle, a vehicle headlight.

The Controlled LIDAR Sensor System 20 may be configured to control the LIDAR Sensor System 10 and its various components and devices, and performs or at least assists in the navigation of the LIDAR Sensor Device 30. The Controlled LIDAR Sensor System 20 may be further configured to communicate for example with another vehicle or a communication network and thus assists in navigating the LIDAR Sensor Device 30.

As explained above, the LIDAR Sensor System 10 is configured to emit electro-magnetic or other radiation in order to probe the environment 100 for other objects, like cars, pedestrians, road signs, and road obstacles. The LIDAR Sensor System 10 is further configured to receive and measure electromagnetic or other types of object-reflected or object-emitted radiation 130, but also other wanted or unwanted electromagnetic radiation 140, in order to generate signals 110 that can be used for the environmental mapping process, usually generating a point cloud that is representative of the detected objects.

Various components of the Controlled LIDAR Sensor System 20 use Other Components or Software 150 to accomplish signal recognition and processing as well as signal analysis. This process may include the use of signal information that come from other sensor devices.

In various embodiments, a LIDAR Sensor System 10 is provided, including at least one first LIDAR Sensing System 40, the at least one first LIDAR Sensing System includes at least one light source and at least one driver connected to the at least one light source, at least one interface connected to the at least one first LIDAR Sensing System 40, and configured to receive and/or emit and/or store data signals.

In various embodiments, a LIDAR Sensor System 10 may further include at least one second LIDAR Sensing System 50, for example resistive, capacitive, inductive, magnetic, optical, chemical.

In various embodiments, a LIDAR Sensor System 10 may further include a camera sensor 81 that is configured to directly output it signals to either of the following devices: LIDAR Sensor element 52, LIDAR Sensor Controller 53, and LIDAR Data Processing System 60.

In various embodiments, a LIDAR Sensor System 10 may further include a camera sensor 81 whose sensor pixels are voxel-correlated with the LIDAR sensing element 52.

In various embodiments, a Controlled LIDAR Sensor System 10 may include: at least one LIDAR Sensor System 10 according to one or more of the preceding embodiments, a LIDAR Data Processing System 60 configured to perform a light control software for controlling the at least one LIDAR Sensor System 40, 50, at least one hardware interface 90, connected with the LIDAR Data Processing System 60 and/or the Light Source Controller 43 and/or the Sensor Controller 53 and/or the Control and Communication System 70.

In various embodiments, a LIDAR Sensor Device 10 with at least one Controlled LIDAR Sensor System 20 may be provided.

In various embodiments, a Method for a LIDAR Sensor System is provided. The method may include: at least one Controlled LIDAR Sensor System 20, and the processes of controlling the light emitted by the at least one LIDAR Sensor System by providing encrypted or non-encrypted light control data to the hardware interface of the LIDAR Sensor System 10 and/or sensing the sensors and/or controlling the actuators of the LIDAR Sensor System via the LIDAR Sensor Management System 90.

In various embodiments, a Computer program product is provided. The Computer program product may include: a plurality of program instructions, which when executed by a computer program device of a LIDAR Sensor System according to any one of the preceding embodiments, cause the Controlled LIDAR Sensor System to execute the method for a LIDAR Sensor System.

In various embodiments, a Data Storage Device with a computer program is provided, adapted to execute at least one of a method for LIDAR Sensor System according to any one of the above method embodiments, an LIDAR Sensor System according to any one of the above Controlled LIDAR Sensor System embodiments.

In various embodiments, a LIDAR Sensor Device 30 may be configured to operate a camera 81 according to any of the preceding embodiments or examples.

Various embodiments as described with reference to FIG. 73 to FIG. 75 may be combined with the embodiments as described with reference to FIG. 51 to FIG. 58. This combination may provide the effect that both systems share the same FOV and that the sensor pixels are substantially identical.

In the following, various aspects of this disclosure will be illustrated:

Example 1i is a LIDAR Sensor System. The LIDAR Sensor is System may include a LIDAR sensor, a camera, and a memory device storing a Camera-LIDAR-Relationship-Matrix (e.g. a Camera-LIDAR-Voxel-Relationship-Matrix) describing a mapping of a predetermined Camera-Sensor-Pixel-ACV-Relationship-Matrix of the camera and a predetermined LIDAR-Sensor-Relationship-Matrix (e.g. a predetermined LIDAR-Sensor-Pixel-Voxel-Relationship-Matrix) of the LIDAR sensor. Such a memory device may be any physical device capable of storing information temporarily like RAM (random access memory), or permanently, like ROM (read-only memory). Memory devices utilize integrated circuits and are used by operating systems, software, and hardware. The predetermined Camera-Sensor-Pixel-ACV-Relationship-Matrix describes a relationship between each sensor pixel of the camera and its associated Angular Camera Field-of-View. The predetermined LIDAR-Sensor-Relationship-Matrix describes a grid in a multi-dimensional space and may include objects and for each voxel of the grid a distance from the LIDAR sensor to the object.

In Example 2i, the subject matter of Example 1i can optionally include that the camera includes a two-dimensional camera and/or a three-dimensional camera.

In Example 3i, the subject matter of Example 1i can optionally include that the camera includes a two-dimensional camera and the LIDAR sensor includes a two-dimensional LIDAR sensor.

In Example 4i, the subject matter of Example 1i can optionally include that the camera includes a two-dimensional camera and the LIDAR sensor includes a three-dimensional LIDAR sensor.

In Example 5i, the subject matter of Example 1i can optionally include that the camera includes a three-dimensional camera and the LIDAR sensor includes a two-dimensional LIDAR sensor.

In Example 6i, the subject matter of Example 1i can optionally include that the camera includes a three-dimensional camera and the LIDAR sensor includes a three-dimensional LIDAR sensor.

In Example 7i, the subject matter of any one of Examples 1i to 6i can optionally include that the camera is operated in night vision operation mode.

In Example 8i, the subject matter of Example 7i can optionally include that pixel read out thresholds of the camera are set in accordance with night vision conditions.

In Example 9i, the subject matter of any one of Examples 1i to 8i can optionally include that the camera is configured to analyze detected camera signals.

In Example 10i, the subject matter of Example 9i can optionally include that the camera is configured to detect color information from a vehicle, and to determine vehicle identifying information based on the detected color information.

In Example 11i, the subject matter of Example 10i can optionally include that the color information includes information about a distance between a pair of two functionally similar vehicle lights.

In Example 12i, the subject matter of Example 11i can optionally include that the pair of two functionally similar vehicle lights is selected from a group consisting of: a pair of tail lights; a pair of head lights; a pair of brake lights; and a pair of signalling lights.

In Example 13i, the subject matter of any one of Examples 1i to 8i can optionally include that the LIDAR Sensor System further includes a LIDAR Data Processing System and/or a LIDAR Sensor Management System. The camera is configured to forward detected camera signals to the LIDAR Data Processing System and/or the LIDAR Sensor Management System for further processing.

In Example 14i, the subject matter of Example 13i can optionally include that the camera is configured to detect color information from a vehicle. The LIDAR Data Processing System and/or the LIDAR Sensor Management System are/is configured to determine vehicle identifying information based on the detected color information.

In Example 15i, the subject matter of Example 14i can optionally include that the color information includes information about a distance between a pair of two functionally similar vehicle lights.

In Example 16i, the subject matter of Example 15i can optionally include that the pair of two functionally similar vehicle lights is selected from a group consisting of: a pair of tail lights; a pair of head lights; a pair of brake lights; and a pair of signalling lights.

In Example 17i, the subject matter of any one of Examples 1i to 11i can optionally include that the LIDAR Sensor System further includes a LIDAR Data Processing System and/or a LIDAR Sensor Management System. The camera is configured to forward detected camera signals to the sensor. The sensor controller is configured to, either, in a first read out mode, read out the detected camera signals, or, in a second read out mode, read out detected LIDAR sensor signal, and to forward the read out signals to the LIDAR Data Processing System and/or the LIDAR Sensor Management System for further processing.

In Example 18i, the subject matter of Example 17i can optionally include that the camera is configured to detect color information from a vehicle. The LIDAR Data Processing System and/or the LIDAR Sensor Management System are/is configured to determine vehicle identifying information based on the detected color information.

In Example 19i, the subject matter of Example 18i can optionally include that the color information includes information about a distance between a pair of two functionally similar vehicle lights.

In Example 20i, the subject matter of Example 19i can optionally include that the pair of two functionally similar vehicle lights is selected from a group consisting of: a pair of tail lights; a pair of head lights; a pair of brake lights; and a pair of signalling lights.

In Example 21i, the subject matter of any one of Examples 1i to 20i can optionally include that the sensor is configured to detect light beams in the blue wavelength region. The camera and the second LIDAR sensor system share the sensor to detect either camera sensor signals or LIDAR sensor signals.

In Example 22i, the subject matter of any one of Examples 1i to 21i can optionally include that the camera includes a camera sensor pixel array. The sensor includes a LIDAR sensor pixel array. The camera sensor pixel array and the LIDAR sensor pixel array have the same circuit layout and/or the same geometrical architecture and/or the same functional architecture.

In Example 23i, the subject matter of Example 22i can optionally include that the camera sensor pixel array and the LIDAR sensor pixel array have different sensitivities in at least one wavelength range, e.g. in the range from about 850 nm to about 905 nm.

Especially with the advent of partially or fully autonomously driving vehicles, there is a need for fast and reliable vehicle recognition and identification. It would be desirable if a vehicle could identify itself and therefore be recognized in an easy and unambiguous manner. For the same reason, this would also be desirable for regular (non-autonomous) vehicles.

Various aspects add a functionality with respect to a transmission of (coded) information from one vehicle to another traffic participant in order to enable easy, reliable and fast object recognition. The system components are similar to the ones described with reference to FIG. 73 to FIG. 75 with the exception that various embodiments additionally provide active infrared light emitting light sources and vehicle surfaces. The aspects which will be described with reference to FIG. 81 to FIG. 84 may be combined with any one of the aspects which are described with reference to FIG. 73 to FIG. 75.

In various embodiments, it is suggested to use cabin-installed infrared light sources and related infrared light emitting surfaces and/or infrared light emitting light sources and related emitting surfaces that are on the exterior of a vehicle for better vehicle recognition. The emitted infrared light can be emitted continuously or in time intervals (fixed or adjustable). Optionally, the emitted infrared light may carry encoded signals.

Once transmitted, the emitted infrared light and, if used, its signal-encoded information, can then be detected by another vehicle or any other suited detection device and used for vehicle and traffic control.

A signal-encoded light transmission may include vehicle identification data such as vehicle type, speed, occupancy, driving trajectory, travel history and the like. Such car identification data may be generated by a suited vehicle data processing device based on car sensor data, and any other accessible information (like GPS signals, acceleration and orientation sensors, vehicle BCU data or meta-data).

Also a user of such vehicle can generate and input meaningful data into such a data processing device for signal encoding.

A vehicle cabin may be equipped with infrared lights sources. These light sources can be positioned at various places inside a vehicle, for example remotely behind the front window or in the vicinity of side and rear windows, or somewhere inside the passenger compartment or attached to a transparent roof. The light sources may as well be placed at the edge of a windowpane or be partially integrated into a glass pane thus illuminating its interior. A suited electrical connection is provided between a respective light source and one or more processors (which may act as light source controllers), at least when a windowpane is closed, but it is also possible for a partially open car window by using side contacts on the frame, or embedded conductive coatings (like ITO-stripes), and the like. For proper light out-coupling, such windowpanes or exterior translucent parts or even transparent parts may have embedded or attached optical structures that reflect backlit or side-lit radiation to the exterior.

It is understood that in the infrared wavelength range, the transmissivity of commonly used automotive certified glass types, possibly with an added color tint (foil or coating), is limited towards longer wavelengths.

As already mentioned, alternatively or additionally, at least one light source of the one or more light sources may be placed on the exterior of a vehicle (which will be described in more detail below). In these embodiments, no wavelength transmission restrictions apply.

The placement and orientation (in general the configuration) of the one or more light sources is such that their infrared radiation (in other words the emitted light) is directed to translucent (or even transparent) vehicle parts and transmitted through them so that these parts (i.e. their IR-radiation) become recognizable or discernable from the outside, i.e. by other (exterior) traffic participants or other vehicle-external sensor devices.

Such illuminated (and therefore infrared light emitting) parts could be, for example, a windowpane, a transparent roof, an exterior translucent (or even transparent) chassis frame part, an exterior translucent (or even transparent) decorative part, a translucent (or even transparent) spoiler frame, as well as external mirror devices, and the like. These parts should be (e.g. fully) translucent (or even transparent), for they can also function as a frame for such translucent (or even transparent) parts.

The term 'directed' includes radiating light onto a plane or a surface, e.g. by using optical components like lenses, as well as light conductance within a material, for example using light guide propagation and front or side-emission techniques.

A light emitting surface (interior or exterior) should have a rather large extent in order to make it easily detectable. Such a rather large light emitting surface is configured to emit infrared radiation into a wide exterior Field-of-Illumination. This offers the effect that such radiation, non-coded or as a sequence of infrared light pulses and/or as a modulated infrared radiation, are easily detectable by vehicle-external infrared sensors as are used, for example, in night vision cameras or other devices employing CCD, CMOS, APD, SPAD etc. sensors, this means, also LIDAR sensors devices are included.

In various embodiments, it is provided that a vehicle uses such a (rather large) infrared light emitting surface to make itself easily detectable. The light emitting surface should cover an area of at least 100 $cm^2$, e.g. at least 400 $cm^2$, e.g. at least 2500 $cm^2$ or e.g. even up to 10.000 $cm^2$. It should be noted that such surfaces need not be plane but can be shaped and formed in any desired way.

Automotive applications require that light sources function within a rather large temperature range, e.g. in the range from about −40° C. up to about 120° C., or even higher. If temperatures get too high, proper cooling will be provided in various embodiments.

The term infrared (IR) radiation (or infrared light emission) extends from a wavelength range of approximately 780 nm into the wavelength range of approximately 1 mm to 2 mm, possibly further extending into the adjacent microwave range. In various embodiments, a light source of the one or more light sources may include for example: IR-LED, IR-Laser Diodes, IR-VCSEL Laser, LARP-infrared emitting Phosphor-conversion based light sources and the like. LED light sources may have emission lines with a FWHM of about 20 to 100 nm, whereas Laser IR diodes typically show smaller FWHM bandwidth values. For example, OSRAM OSLON Black Series LEDs are configured to emit about 1.8 W of 850 nm radiation. Each emitting surface might use several of such IR-emitting LEDs. Due to safety concerns, IR-LED-light sources may be provided instead of infrared laser diodes.

In one aspect, the IR-emitter radiation is operated steady state, i.e. continuously. In another aspect, the IR-emitter radiation is pulsed, i.e. emitting trains of pulses. In another aspect, the IR-emitter radiation is PWM-modulated in order to carry a signal. In another aspect, the IR-emitter radiation is emitted stochastically.

In one aspect, the emitted infrared radiation may be switched from one emitting surface (surface 1 ON) to a second, adjacent one (surface 2 ON), whereby Surface 1 can be switched OFF or stay ON, or have some time overlap. In addition, several of such surfaces might even form symbols, numerals, signs, logos, or be used for animations (e.g. like flowing or sweeping arrows), when switched on in certain time-sequential manner; all of such embodiments can be used for depicting information that can be read by exterior infrared detectors.

In a similar way, the infrared radiation can be switched from one emitting surface to one or to many others (either in parallel or sequentially). A cyclical switching from one emitting surface to another can be done clockwise or counter-clockwise (in regard to the vehicle). The various emitting surfaces can transmit different information.

In various embodiments, two emitting surfaces can be on arranged opposite sides of the vehicle, e.g. a car, and operated synchronously or alternatingly. In various embodiments, the infrared light sources that are mounted within the vehicle's, e.g. the car's interior are operated in regard to infrared emitters installed on the outside, for example alternatingly. In various embodiments, all vehicle surfaces may be configured to emit the same type of radiation (wavelength, pulse trains and/or modulating) and thus form light emitting surfaces. In various embodiments, the various vehicle light emitting surfaces may be configured to emit different types of radiation (wavelength, pulse trains and/or modulating).

The signal strength of the emitted light may vary depending on the location of the emission, for example with higher power towards the front and the rear, and with lower power sideways. Also, the left and right sides of a vehicle may use light sources with different wavelengths, intensities, blinking frequencies and the like, thus facilitating easy recognition of driving direction (forward and backward) if such settings are somewhat standardized.

Again, depending on the design and need, many options and variations are possible. The signal strength of the emitted light may be a function of signal information, vehicle movement, vehicle position, vehicle control data and the like. The signal strength may be a function of an established vehicle-to vehicle communication, e.g. car-to-car communication, or vehicle-to-environment communication, e.g. car-to-environment communication.

The used infrared emitters (in other words, the one or more light sources) may be configured to emit light having the same or different wavelengths, beam angles and other optical properties. Some or all of the one or more light sources may be configured to work with near-infrared wavelengths, some or all of the one or more light sources may be configured to work with far-infrared wavelengths. Some or all of the one or more light sources may be configured to work with infrared wavelengths that coincide or overlap with typically used LIDAR IR wavelengths, for example 850 nm, 905 nm or 1550 nm. This has the effect that also a LIDAR sensor can recognize the emitted infrared radiation. Some or all of the one or more light sources may be configured to work with infrared wavelengths that do not coincide or overlap with typically used LIDAR IR wavelengths, for example they are outside of the 850 nm, 905 nm or 1550 nm range, for example with a minimum wavelength distance of 20 nm. This has the effect that a LIDAR sensor is not affected by the emitted infrared radiation A vehicle may be equipped with a plurality, e.g. a multiplicity of at least five, e.g. at least ten, e.g. at least twenty, e.g. at least fifty, e.g. at least seventy-five, e.g. at least 100 or even more of such infrared emitters (light sources) with different emission characteristics. In regard to the emitted wavelength, some or all emitters (light sources) with a specific emission wavelength may be operated synchronously, or alternatingly with emitters (light sources) of different wavelengths. An arrangement of infrared emitters (light sources) with different wavelengths can be operated in a (adjustable) frequency sweeping mode, i.e. switching from emitters (light sources) with infrared frequency 1 to others with infrared frequency 2, and so on. Such a frequency sweeping arrangement will further increase reliability of object recognition since data processing can filter out these frequencies and not be negatively affected by infrared noise background radiation.

Different vehicle types may use wavelengths, pulse trains, switching emission surfaces etc. (as described above) according to vehicle type, for example light or heavy vehicle, brand, model, size (width, height) etc. The emitted infrared signals may just work as 'presence beacon' i.e. mark an object (either standing or driving) with a pulse of repetitive signals without any further signal encoding. The emitted infrared signals may be used for general or specific communication purposes. The emitted infrared signals may carry information about: vehicle number plate, vehicle identification or registration number, insurance data, (personal) driver data (name, health status, experience), passenger occupancy data, driver, vehicle history (how many accidents), SAE-driving level (0 to 5), and many more. Transmitted data can be encrypted and the encryption keys transferred via different transmission channels. All data to be transmitted can be pre-set, for example one time by the vehicle owner, or by the driver, or by the manufacturer, or they can be selected and adjusted by a user (for example via a graphical user interface)

The vehicle may be any type of vehicle as described above. The suggested products, configurations and methods might also be used as retrofit solutions for vehicles.

Furthermore, radiation intensity and direction of emission should comply with all applicable safety and/or standardization standards. It is suggested that the emitted infrared radiation, as described above, is detected with another vehicles' sensors, like a LIDAR detector or a camera or just by a simple infrared sensitive photo-diode. The detecting vehicle (or any external detector) needs to have a signal storing and processing unit that can discern the presented signal information. Depending on the complexity of such a detector, only one, or some or many of the presented information and radiation characteristics can be detected and processed. These values may be adapted or adjusted for day or night driving conditions.

The emitted infrared radiation can be sensed with infrared-sensitive photo-detectors, for example used in one or more night vision cameras. The camera detector (CCN, CMOS) may be equipped with an infrared band-path filter that cuts off unwanted visible wavelengths. The infrared radiation could also be sensed with LIDAR detectors (if the emitted wavelengths are within the LIDAR sensor sensitivity range).

After detection and data processing, a computational unit can use such information for (easy) object detection and recognition. As described with reference to FIG. 73 to FIG. 75, camera and LIDAR information processing systems can work in various ways in order to prepare for the calculation of proper control signals for vehicle steering and control.

The suggested method improves sensor fusion and reduces object detection and recognition time. After detection and data processing, a computational unit can use such information for (easy) object detection and recognition. As described with reference to FIG. 73 to FIG. 75, camera and LIDAR information processing systems can work in various ways in order to prepare for the calculation of proper control signals for vehicle steering and control. The suggested method improves sensor fusion and reduces object detection and recognition time.

Once another vehicle (e.g. car) has received the information of the emitting car, it can feedback response signals to the emitting vehicle via Radio, Bluetooth, WiFi etc.

System components may include: Infrared emitter; infrared emitting surfaces; control units (in other words one or more processors and/or one or more controllers) for calculating required coding signals and applying them as operational settings for the light emitting devices; one or more light source drivers; photo detectors; signal measuring and analyzing devices; sensor fusion devices; vehicle control devices; and/or one or more user interfaces.

The vehicle may be equipped (or retrofitted) with a variety of (similar or different) infrared emitter (and sensors) that are configured to emit (coded) infrared radiation to the outside in order to be recognized by other traffic participants or traffic relevant objects (e.g. elements of road infrastructure) and/or to carry informational data to them. The light emitting surfaces to can be addressed in various ways (no specific coding at all, pre-set coding, adjustable coding, dynamically addressable surfaces, pattern building etc.). Further signal coding (wavelength, pulses, signal time, etc.) helps identify the vehicle, driver, etc.

The disclosed aspects may be helpful for large vehicles with is extended IR-light emitting surfaces and for cars whose reflectivity for Infrared (LIDAR) or Radar radiation is somewhat reduced thus making them less visible for those methods. The suggested method uses actively emitting surfaces that are advantageous under normal and inclement weather conditions.

A vehicle equipped with suited infrared sensors (LIDAR, camera, Photodiodes) as well as hard- and software (computational units, data storage, software programs, etc.) can benefit from easy signal recognition, subsequent object recognition, and subsequent vehicle control functions.

FIG. 81 shows a side view of a vehicle 8100 in accordance with various embodiments. FIG. 82 shows a top view of the vehicle 8100 of FIG. 81.

The vehicle 8100 may include a vehicle body 8102 and wheels 8104. Furthermore, the vehicle 8100 may include a plurality of e.g. two or four side windows 8106, a front window 8202 and a rear window 8204.

The vehicle 8100 may further include one or more light sources 8108 mounted on an outer surface 8112 of the vehicle body 8102 and/or within the vehicle body 8102 (in other words in the vehicle cabin) and configured to emit light in the infrared or near infrared wavelength range, and/or one or more light emitting surface structures 8110 over the outer surface 8112 of the vehicle body 8102 and configured to emit light in the infrared or near infrared wavelength range. The light sources 8108 that are located within the vehicle's body 8102 may be mounted on a frame portion thereof or on any other component of the vehicle 8100 such as e.g. on a vehicle dashboard 8206. The respective light source 8108 may be mounted such that the emitted light is emitted in a main emission direction that hits a translucent or transparent portion of the vehicle, e.g. one of the vehicle's windows 8106, 8202, 8204. The light sources 8108 may be configured as active light sources such laser diodes, light emitting diodes, and/or organic light emitting diodes. Furthermore, the one or more light emitting surface structures 8110 may be configured as passive or active light sources configured to (e.g. indirectly) emit light e.g. via the outer surface 8112 of the vehicle body 8102.

The vehicle 8100 may further include one or more light sensors 52, 81 mounted on the outer surface 8112 of the vehicle body 8102 and configured to detect light in the infrared or near infrared wavelength range. The one or more light sensors 52, 81 may include one or more LIDAR sensors 52 and/or one or more camera sensors 81 and/or infrared sensitive photo diodes 81.

The vehicle 8100 may further include one or more processors 8208 and/or one or more controllers 8208. The one or more processors 8208 and the one or more controllers 8208 may be implemented as separate hardware and/or software units or they may be implemented as one common hardware and/or software unit.

The one or more processors 8208 may be configured to generate vehicle identification data (e.g. the vehicle identification data as described above) and to add the vehicle identification data to the emitted light of a respective light source 8108 and/or of a respective light emitting surface structure 8110 as a portion of the encoded signal. The one or more controllers 8208 may be configured to control the one or more light sources 8108 and/or the one or more light emitting surface structures 8110. The one or more processors 8208 and/or the one or more controllers 8208 may be electrically coupled to the one or more light sources 8108 and/or to the one or more light emitting surface structures 8110.

The one or more processors 8208 may be configured to implement a portion of or the entire LIDAR Data Processing System 60 configured to perform signal processing 61, and/or data analysis and/or computing 62, and/or sensor signal fusion.

FIG. 83 shows a flow diagram 8300 illustrating a process performed in the First LIDAR Sensor System (i.e. in the emission path) 40 in accordance with various embodiments.

In 8302, a user may preset or adjust IR emission configurations of the one or more light sources 8108 and/or the one or more light emitting surface structures 8110, e.g.

- various characteristics 8304 of radiating (emitting) one or more light sources 8108;
- a type of information and data communication 8306; and/or
- a selection of one or more of the one or more light emitting surface structures 8110 and their emission characteristics 8308.

In 8310, the one or more controllers 8208 may control the emitters (in other words the one or more light sources 8108 and/or the one or more light emitting surface structures 8110) to emit light in the IR and/or NIR wavelength range. The emitted light may include encoded information (encoded signal) which may be modulated onto a carrier signal. The encoded information may include vehicle identification data such as vehicle type, speed, occupancy, driving trajectory, travel history and the like. Such car identification data may be generated by a suited vehicle data processing device based on car sensor data, and any other accessible information (like GPS signals, acceleration and orientation sensors, vehicle BCU data or meta-data).

The light may be emitted directly into the environment (block 8312) and/or via the emitting surfaces (i.e. the one or more light emitting surface structures 8110) into the environment (block 8314).

FIG. 84 shows a flow diagram 8400 illustrating a process performed in the Second LIDAR Sensor System (i.e. in the detection path) 50 in accordance with various embodiments.

In various embodiments, in 8402, the LIDAR sensors 52 and/or the camera sensors 81 and/or infrared sensitive photo diodes 81 may detect light signals, e.g. light that may be emitted by another vehicle in the same way as described above. Furthermore, in 8404, a signal analysis and/or object detection and/or object recognition may be performed. Moreover, a sensor fusion and/or vehicle control may be performed (e.g. by the one or more processors 8208) in 8406. In 8408, a response signal may be generated (e.g. as a signal modulated onto a light signal in a similar manner as described above), modulated onto a light signal and emitted, e.g. transmitted to the vehicle from which the detected signal was emitted.

Various embodiments as described with reference to FIG. 81 to FIG. 84 above may control the emitter points to blink with a frequency equal to the resonance frequency of the MEMS mirror and may be used to separate the own LIDAR Sensor System from another LIDAR Sensor System or even to change the emitter frequency of the own LIDAR Sensor System.

In the following, various aspects of this disclosure will be illustrated:

Example 1k is a vehicle. The vehicle may include a vehicle body, and one or more light sources mounted on an outer surface of the vehicle body and/or within the vehicle body and configured to emit light in the infrared or near infrared wavelength range, and/or one or more light emitting surface structures distributed over the outer surface of the vehicle body and configured to emit light in the infrared or near infrared wavelength range.

In Example 2k, the subject matter of Example 1k can optionally include that the one or more light sources and/or the one or more light emitting surfaces are configured to continuously emit light.

In Example 3k, the subject matter of Example 1k can optionally include that the one or more light sources and/or the one or more light emitting surfaces are configured to emit light in a plurality of non-continuous time intervals.

In Example 4k, the subject matter of Example 3k can optionally include that the one or more light sources and/or the one or more light emitting surfaces are configured to emit light in a plurality of non-continuous time intervals. The time intervals are fixed.

In Example 5k, the subject matter of Example 3k can optionally include that the one or more light sources and/or the one or more light emitting surfaces are configured to emit light in a plurality of non-continuous time intervals. The time intervals are changeable.

In Example 6k, the subject matter of any one of Examples 1k to 5k can optionally include that the one or more light sources and/or the one or more light emitting surfaces are configured to emit light. The emitted light includes an encoded signal.

In Example 7k, the subject matter of any one of Examples 1k to 6k can optionally include that the vehicle further includes one or more light sensors mounted on an outer surface of the vehicle body and configured to detect light in the infrared or near infrared wavelength range.

In Example 8k, the subject matter of Example 7k can optionally include that the one or more light sensors include at least one LIDAR sensor (52).

In Example 9k, the subject matter of any one of Examples 7k or 8k can optionally include that the one or more light sensors include at least one camera sensor (81).

In Example 10k, the subject matter of any one of Examples 6k to 9k can optionally include that the vehicle further includes one or more processors configured to generate vehicle identification data and to add the vehicle identification data to the emitted light as a portion of the encoded signal.

In Example 11k, the subject matter of any one of Examples 1k to 10k can optionally include that the vehicle further includes one or more controllers configured to control the one or more light sources and/or the one or more light emitting surface structures.

In Example 12k, the subject matter of any one of Examples 1k to 11k can optionally include that the one or more light sources and/or the one or more light emitting surface structures are configured to emit light in a wavelength range that is at least partially also provided for LIDAR.

In Example 13k, the subject matter of any one of Examples 1k to 11k can optionally include that the one or more light sources and/or the one or more light emitting surface structures are configured to emit light in a wavelength range that is outside a wavelength range provided for LIDAR.

In Example 14k, the subject matter of any one of Examples 1k to 13k can optionally include that at least one light source of the one or more light sources is arranged behind a front window of the vehicle and is configured to emit the light through the front window of the vehicle.

In Example 15k, the subject matter of any one of Examples 1k to 14k can optionally include that at least one light source of the one or more light sources is arranged behind a side window of the vehicle and is configured to emit the light through the side window of the vehicle.

In Example 16k, the subject matter of any one of Examples 1k to 15k can optionally include that at least one light source of the one or more light sources is arranged behind a rear window of the vehicle and is configured to emit the light through the rear window of the vehicle.

In Example 17k, the subject matter of any one of Examples 1k to 16k can optionally include that the vehicle further includes a LIDAR Data Processing System (60) configured to perform signal processing (61), and/or data analysis and/or computing (62), and/or sensor signal fusion.

In Example 18k, the subject matter of any one of Examples 1k to 17k can optionally include that at least one light source of the one or more light sources includes a laser diode and/or a light emitting diode.

In Example 19k, the subject matter of Example 18k can optionally include that at least one light source of the one or more light sources includes a pulsed laser diode and/or a pulsed light emitting diode.

In Example 20k, the subject matter of Example 19k can optionally include that the pulsed laser diode and/or the pulsed light emitting diode is configured to emit a pulse train including a plurality of laser pulses.

Example 21k is a vehicle. The vehicle may include a vehicle body, and one or more light sensors mounted on an outer surface of the vehicle body and configured to detect light in the infrared or near infrared wavelength range.

In Example 22k, the subject matter of Example 21k can optionally include that the one or more light sensors include at least one LIDAR sensor (52).

In Example 23k, the subject matter of any one of Examples 21k or 22k can optionally include that the one or more light sensors include at least one camera sensor (81).

In Example 24k, the subject matter of any one of Examples 21k to 23k can optionally include that the vehicle further includes a LIDAR Data Processing System (60) configured to perform signal processing (61), and/or data analysis and/or computing (62), and/or sensor signal fusion.

Example 25k is a method. The method may include one or more light sources mounted on an outer surface of a vehicle body and/or within the vehicle body and/or one or more light emitting surface structures distributed over the outer surface of the vehicle body emitting light in the infrared or near infrared wavelength range, and one or more controllers controlling the one or more light sources and/or the one or more light emitting surface structures to emit light with a light source specific timing scheme and/or amplitude encoding scheme.

In Example 26k, the subject matter of Example 25k can optionally include that the one or more light sources and/or the one or more light emitting surface structures include a laser diode and/or a light emitting diode.

In Example 27k, the subject matter of Example 26k can optionally include that the one or more light sources and/or the one or more light emitting surface structures include a pulsed laser diode and/or a pulsed light emitting diode.

In Example 28k, the subject matter of Example 27k can optionally include that the at least one pulsed laser diode and/or the pulsed light emitting diode is emitting a laser pulse train comprising a plurality of laser pulses.

Example 29k is a computer program product. The computer program product may include a plurality of program instructions that may be embodied in non-transitory computer readable medium, which when executed by a computer program device of a vehicle according to any one of Examples 1k to 24k, cause the vehicle to execute the method according to any one of the Examples 25k to 28k.

Example 30k is a data storage device with a computer program that may be embodied in non-transitory computer readable medium, adapted to execute at least one of a method for a vehicle according to any one of the above method Examples, a vehicle according to any one of the above vehicle Examples.

As already mentioned above, a LIDAR Sensor System uses electromagnetic radiation (visible, infrared) emitted from a light source (for example IR Laser diode, IR-VCSEL) in order to determine information about objects in the environment of the LIDAR Sensor System. In an exemplary application, such LIDAR Sensor Systems are arranged at a vehicle (LIDAR Sensor Device) to determine information about objects on a roadway or in the vicinity of a roadway.

Such objects may include other road users (e.g. vehicles, pedestrians, cyclists, etc.), elements of road infrastructure (e.g. traffic signs, traffic lights, roadway markings, guardrails, traffic islands, sidewalks, bridge piers, etc.) and generally all kinds of objects which may be found on a roadway or in the vicinity of a roadway, either intentionally or unintentionally. The information derived via such a LIDAR Sensor System may include the distance, the velocity, the acceleration, the direction of movement, the trajectory, the pose and/or other physical or chemical properties of these objects.

Alternatively, the LIDAR Sensor System may be installed inside the driver cabin in order to perform driver monitoring functionalities, such as occupancy-detection, eye-tracking, face recognition, drowsiness detection, access authorization, gesture control, etc.).

To derive such information, the LIDAR Sensor System may determine the Time-of-Flight (TOF) of the emitted electromagnetic radiation or variations of physical properties such as phase, amplitude, frequency, polarization, etc. of the electromagnetic radiation emitted by at least one light source and after the emitted radiation was reflected or scattered by at least one object in the Field of Illumination (FOI)/Field of Emission (FOE) and detected by a photodetector and/or a LIDAR Sensor System may emit a predefined dot pattern that may get distorted when reflected from a curved surface (or not, when the surface is flat) and measured by a camera and/or a LIDAR Sensor System may determine information about above mentioned objects via triangulation-based methods.

In order to detect far-away objects (e.g. objects in a distance of more than 200 m), the at least one light source of the LIDAR Sensor System may be able to emit radiation with high radiant power. A LIDAR Sensor System therefore may be equipped with a set of laser emitters (one or more light sources) each capable to emit radiation with an optical power of 100 W or more. Typically, such LIDAR Sensor Systems are operated in a pulsed mode, e.g. with pulse duration lengths in the range of a few nanoseconds up to a few tens of nanoseconds and pulse repetition times, i.e. laser OFF-times, in the range of a few hundred nanoseconds to a few microseconds.

Since the exposure time to hazardous radiation is one of the critical factors regarding eye safety, pulsed light sources with pulse duration lengths in a nanosecond regime may generally represent a comparatively low risk in terms of eye safety, despite their high optical output capabilities. However, many LIDAR Sensor Systems make use of beam steering units in which an oscillating element is used to scan the light beam over the Field of Illumination (FOI), e.g. a MEMS systems operated in an oscillation mode with sinusoidal characteristics (resonant or non-resonant mode). Typical mirror oscillation frequencies are in the kHz regime, i.e. that intense laser radiation is directed into one and the same angular sector as often as every few milliseconds (or less).

This situation is particularly critical at the periphery of the Field of Illumination (FOI) since scanning mirrors with a sinusoidal oscillation behavior are characterized by a non-constant scanning velocity. Scanning velocity is highest close to the zero position (or flat-state position) and lowest at the reversal points. This means that the mirror remains significantly longer in positions close to the reversal point and therefore higher amounts of radiation are emitted close to the periphery of the FOI.

This can lead to considerable eye safety issues since it is often the periphery of the FOI where objects with particular eye safety requirements may be located, e.g. pedestrians on a sidewalk or cyclists close to the roadside. It also should be considered that safety regulations may depend on the use of LIDAR Sensor Systems for front, rear, corner and side vehicle monitoring, or if a LIDAR Sensor System is integrated into a headlight or any other vehicle light fixture.

It is an object of the present disclosure to provide a method for increased eye safety, e.g. in periphery regions of the Field of View (FOV) or Field of Illumination (FOI) of scanning mirror LIDAR Sensor Systems, which is adjustable depending on various external or internal conditions. Furthermore, it is an object of the present disclosure to provide means to ensure a reliable operation of the safety method under real operation conditions and to ensure a high Signal/Noise-ratio.

In order to fulfill these requirements, a LIDAR Sensor System is proposed in which the angular emission characteristics of a scanning mirror beam steering device can be adapted dynamically.

Dynamic adaption may include an aperture device whose area of open passage (opening of the aperture) can be changed by supplying a corresponding control voltage. From a fundamental point of view, such an aperture device may resemble a dynamic iris aperture device, used for example for dynamic dimming operations in video projection systems. However, while in projection systems the light beam might be changed by an iris aperture with a round shape, the situation might be quite different in a scanning mirror LIDAR Sensor System, e.g. in a 1-dimensional scanning system where one or two MEMS mirror is/are oscillating around one/two axis.

In this case, it might be sufficient to limit the FOI via-aperture elements, which are arranged on both sides of the oscillating mirror and which are movable along directions oriented predominantly perpendicular to a center line of the FOI. With the movable aperture elements, it is possible to change the opening of the dynamic aperture. The aperture elements may have for example rectangular or quadratic shapes. They might have flat or curved surfaces, e.g. with spherical, elliptical or parabolic contours. In terms of optical properties, the aperture elements may have absorbing properties (with respect to the wavelength of the LIDAR light source) in order to effectively shield all radiation emitted close to the FOI borderlines. Alternatively, the aperture elements may have reflecting or partially reflecting optical properties (e.g. dichroic elements or layers).

The aperture elements may be configured such that specular reflectance takes place at their surface or they may exhibit diffusive structures or structures similar to microlenses. Alternatively, they may also exhibit micro-holes or cut-outs to let through some of the radiation. Furthermore, the aperture elements may include doping materials or other materials which are used to modify the optical properties of the reflected (out-coupled) light. As an example, phosphor materials or wavelength-conversion materials may be added in order to change the wavelength of the impinging light, either via Upconversion (e.g. into the VIS regime) or Downconversion (e.g. from 850 nm or 905 nm to a wavelength in the range of 1500 nm).

In various embodiments, this may be used together with detectors, which are sensitive in different wavelength regimes. Actuators such as piezo-electric elements or voice coil (with frequencies in the Hundreds of Hz, but also up to 2 kHz or even 20 kHz) systems may be used in order to is move the elements of the dynamic aperture device. The opening the dynamic aperture can be changed by activating an actuator that provides a positional change of the aperture elements. It is also possible to change the open passage of the dynamic aperture by supplying a corresponding control voltage that provides a positional change of the aperture elements.

Besides the above mentioned mechanical change of the area of open passage (opening of the dynamic aperture device), the dynamic aperture device may include electrochromic materials for which the ratio between optical transmission and reflection of the dynamic aperture device can be changed by supplying a corresponding control voltage. Alternatively, the dynamic aperture device may be configured such that an angle of orientation be adapted in order to change the ratio between optical transmission and reflection of the elements. Such aperture devices may permanently extend into the FOI, while their properties may still be dynamically changeable.

In various embodiments/implementations, the dynamic aperture device may include one or more aperture elements. In various embodiments, the aperture element may include identical and/or different aperture elements, which can be a plate like element, shield like element or the like.

In various embodiments, the dynamic aperture device is configured as a liquid crystal device (e.g. liquid crystal device 6100, 6200) or as a spatial light modulator (e.g. spatial light modulator 5910), as described with respect to FIG. 59 to FIG. 67.

Depending on the exact embodiment of the dynamic aperture device (see paragraph above), the shielded radiation can be used for further purposes. For example, the light which is reflected by the aperture from the LIDAR Light Source can be:

- reflected towards a detector (e.g. a simple photodiode) to monitor at least qualitatively whether the dynamic aperture is in a position where it shields part of the FOI or not. This helps to increase system reliability, e.g. regarding the above mentioned eye safety functionality. Such a setup would allow for example to detect deviations from an expected behavior and to compensate possible deviations, e.g. by an overall reduction of LIDAR pulse height, maybe also as a function of vehicle speed or distance to objects.
- reflected towards the LIDAR main detector, thus allowing for more quantitative analyses. As an example, the reflected light might be used for reference purposes (timing or clocking synchronization). Apart from such monitoring & reliability tasks, the reflected light might be used as well to derive information about the status of both the LIDAR light source and the LIDAR beam steering unit. For such purposes, the dynamic aperture may be closed for example at regular time intervals, independently or additionally to the above mentioned eye safety functionalities (for example at times, when the outermost periphery of the Field of Illumination is illuminated (max. vertical and horizontal angle) which may be a less interesting region of the Field of Illumination, at least in certain situations). This way, it can be detected whether the light source still emits light pulses with the expected properties (which may vary e.g. as a function of temperature or aging) and whether the beam steering unit sill operates like expected (deviations might occur e.g. due to mechanical vibrations and shocks or due to aging phenomena).
- reflected towards other optical elements such as light guides which may transfer the light towards other light-based applications. Such other light-based applications may comprise systems for driver monitoring (e.g. occupancy-detection, eye-tracking, face recognition, drowsiness detection, access authorization, gesture control, etc.) or systems for light-based communication (which allow to communicate either with internal or external partners, based for example on a signal encoding via sequences of pulses with different pulse heights and/or pulse lengths and/or pulse shapes).

Further functionalities are conceivable in the specific case is where the aperture elements have partially reflecting and partially transmitting optical properties, e.g. through dichroic elements. Such elements may be used in combination with a light source, which is capable to emit at least two different wavelengths. As an example, the light source may include light emitters with a shorter wavelength (e.g. close to 900 nm) and a larger wavelength (e.g. above 1000 nm or above 1500 nm). The dichroic aperture element may then be configured to reflect the shorter wavelength (which is known to be more critical in terms of eye safety), whereas the longer wavelength is transmitted (and which is known to be less critical in terms of eye safety).

This way, there will be always a certain amount of radiation available at the periphery of the FOI for an early detection of vulnerable objects, at least radiation with the higher wavelength in case that the dynamic aperture is closed. Apart from eye safety considerations, employing light emitters with a higher wavelength may allow improvements in system reliability in case of adverse weather conditions, such as fog, snow, rain, etc. Depending on the wavelength difference between the higher and the shorter wavelength, only one LIDAR detector may be enough to detect signals from both types of emitters (although with different sensitivities). In case of larger wavelength differences, two different types of detectors might be used. Both wavelengths can either illuminate the same FOI or different parts of the total FOI, whereas for example the higher wavelength may only illuminate the blocking region of the dynamic, dichroic aperture.

There are various external or internal conditions and factors, which may be used as input parameters for an adjustment of the dynamic aperture device. External conditions in this context describes conditions which are present outside the LIDAR Sensor System, whereas internal conditions are conditions present inside the LIDAR Sensor System.

Examples for internal conditions may include:

temperature conditions (e.g. untypically low temperatures may lead to untypically high laser outputs and thus to an increased likelihood for eye safety issues);

vibrations (e.g. vibrations with large amplitudes or with frequencies known to be critical for the beam steering system);

sudden accelerations (potholes in the street);

light source parameters (e.g. an output power close to the maximum rated laser power).

External conditions may be related to the device (e.g. the vehicle) to which the LIDAR Sensor System belongs to or may be related to conditions which are present outside the LIDAR Sensor Device (e.g. the vehicle) to which the LIDAR Sensor System belongs to.

Examples for external conditions related to the LIDAR Sensor Device (e.g. the vehicle) may include:

vehicle conditions such as velocity, acceleration, vibrations;

driver conditions (e.g. opening size of the drivers pupil (also considering the wearing of eye glasses or contact lenses) which is known to depend on ambient lighting but also on personal characteristics); such factors are relevant in case that the LIDAR system is used for detection functionalities inside the driver cabin (e.g. driver monitoring functionalities such as occupancy-detection, eye-tracking, face recognition, drowsiness detection, access authorization, gesture control, etc.).

Examples for external conditions, which are present outside the LIDAR Sensor Device (e.g. the vehicle) to which, the LIDAR Sensor System belongs to:

Vehicle environment (motorway, inside city limits, close to pedestrian zones, close to parking places, inside parking houses, etc.). Depending on the specific environment, it is more or less likely that vulnerable object are entering the periphery of the FOI. Information input about such environment may be received from various other devices (e.g. other sensors such as RADAR, Ultrasonic, Cameras, etc., as well as from other LIDAR sensors available at the vehicle, communication systems (C2C, C2X), map-material or navigation systems, etc.

Object classification, i.e. information about the type of objects which are located nearby. Such information may be derived from data analysis of other sensors (see above), as well as information derived from data analysis of the LIDAR Sensor System itself.

Environmental parameters such as ambient light conditions (which have an effect on the size of people's pupils) and weather conditions (which are known to have an effect on optical properties such as reflection and scattering of the light emitted by the LIDAR light source), for example ice or rain drops on a car surface.

Data which have been collected, recorded and evaluated in previous journeys along the same route and which may include information about static road structures (such as buildings, trees, infrastructure elements such as anti-noise barriers, etc.) which are non-critical in terms of eye-safety, as well as information about road structures (such as crosswalks, pedestrian lights, etc.) with increased likelihood for critical situations in terms of eye-safety.

The dynamic aperture of the disclosed LIDAR Sensor System is controlled by a Sensor Controller that may receive steering commands from a LIDAR Data Processing System and/or from a LIDAR Sensor Management System.

As already mentioned above, one effect of the present disclosure is to improve eye-safety while keeping the system adaptive to internal and external conditions related to situations with different levels of eye-safety requirements. Another effect is that options are provided for further use of the shielded light for alternative or additional light-based applications and functionalities.

Figure 2:
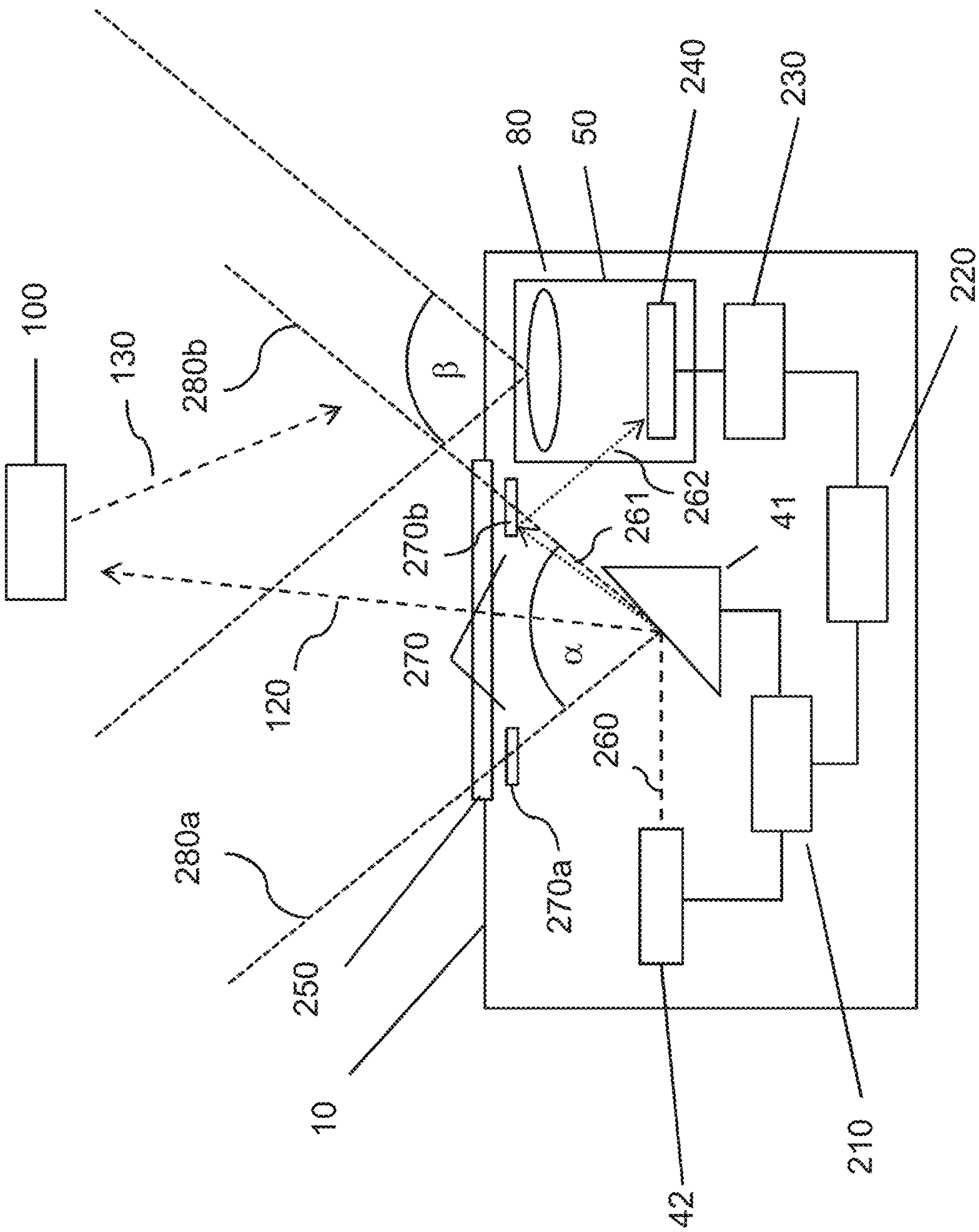
FIG. 2 shows an embodiment of the proposed LIDAR Sensor System with a dynamic aperture device

FIG. 2 shows an embodiment [B_1] of the proposed LIDAR Sensor System with a dynamic aperture device The LIDAR Sensor System 10 includes a Light Source 42 which emits a light beam 260 that can be directed and/or transmitted via beam steering device 41 (for example MEMS, LCD) and window 250 (entrance and exit opening) into the FOI (solid angle sector with opening angle α, limited by dashed lines 280*a* & 280*b*). The directed and/or transmitted light beam 120 can then be reflected at an object 100 in the FOI, leading to a backscattered light beam 130. If the backscattered light beam 130 emerges from a solid angle sector within the opening angle β, the scattered light beam 130 can be collected via receiver optics (e.g. lens) 80 and focused onto detector 240 (Photodiode, APD, SPAD, SiPM, etc.).

Electronics device 230 is configured to receive and process signals from detector 240. Signal processing may include amplifying, attenuating, filtering, comparing, storing or otherwise handling electric or electronic signals. For these purposes, device 230 may comprise an Application-Specific Integrated Circuit (ASIC). Electronics device 230 is controlled by controlling device 220 which may include a processor unit and which controls driver 210 as well (driver for light source 42 and scanner 41).

Based on the embodiment, a dynamic aperture device 270 is positioned downstream of beam steering unit 41 and upstream or in the vicinity of sensor window 250. In various embodiments, dynamic aperture device 270 includes two plate-like elements 270*a* & 270*b*. In the situation, where FIG. 2 is displayed, both plate-like elements are positioned such that they partly overlap with the maximum FOI (represented by dashed lines 280*a* & 280*b*) accessible via beam steering unit 41 (a one-dimensional scanning MEMS). At this position, dynamic aperture element 270 shields part of the light emitted from beam steering unit 41 thus limiting the effective FOI to an angular sector which is smaller than the maximum accessible angular sector with opening angle α. As shown in FIG. 2, light beam 261, which is shielded by dynamic aperture element 270, is reflected at plate-like element 270*b* and directed and/or transmitted as light beam 262 towards LIDAR detector 240. As described above, reflected signal 262 can be used as a reference signal (for timing and clocking synchronization). Alternatively or additionally, it can be used to derive information about the current status of LIDAR light source 42 and/or LIDAR beam steering unit 41, as well as about the aperture frame itself. Alternatively or additionally, the dynamic aperture device 270 can be integrated into the window 250 of the LIDAR Sensor System 10. The dynamic aperture device 270 can therefore be arranged within or outside the window 250 of the LIDAR Sensor System 10.

As already explained in the general part of the description, various embodiments are conceivable regarding the shape of the elements which make up the dynamic aperture device, their optical properties and the options for which radiation hitting these elements can be used. There are also various positions at which the dynamic aperture may be positioned. In some implementations, it is positioned inside LIDAR Sensor System 10 (to keep it protected from impurities and the like). However, it is conceivable also to place it outside of the LIDAR Sensor System 10. It may as well be integrated into sensor window 250, either as mechanical device or as material with electro-chromic properties. Furthermore, aperture elements 270*a* & 270*b* may be operated independently of each other, thus leading to an asymmetric shielding of the FOI. As described above, also a round diaphragm (Iris) can be used for concentric beam blocking or alteration.

Figure 3:
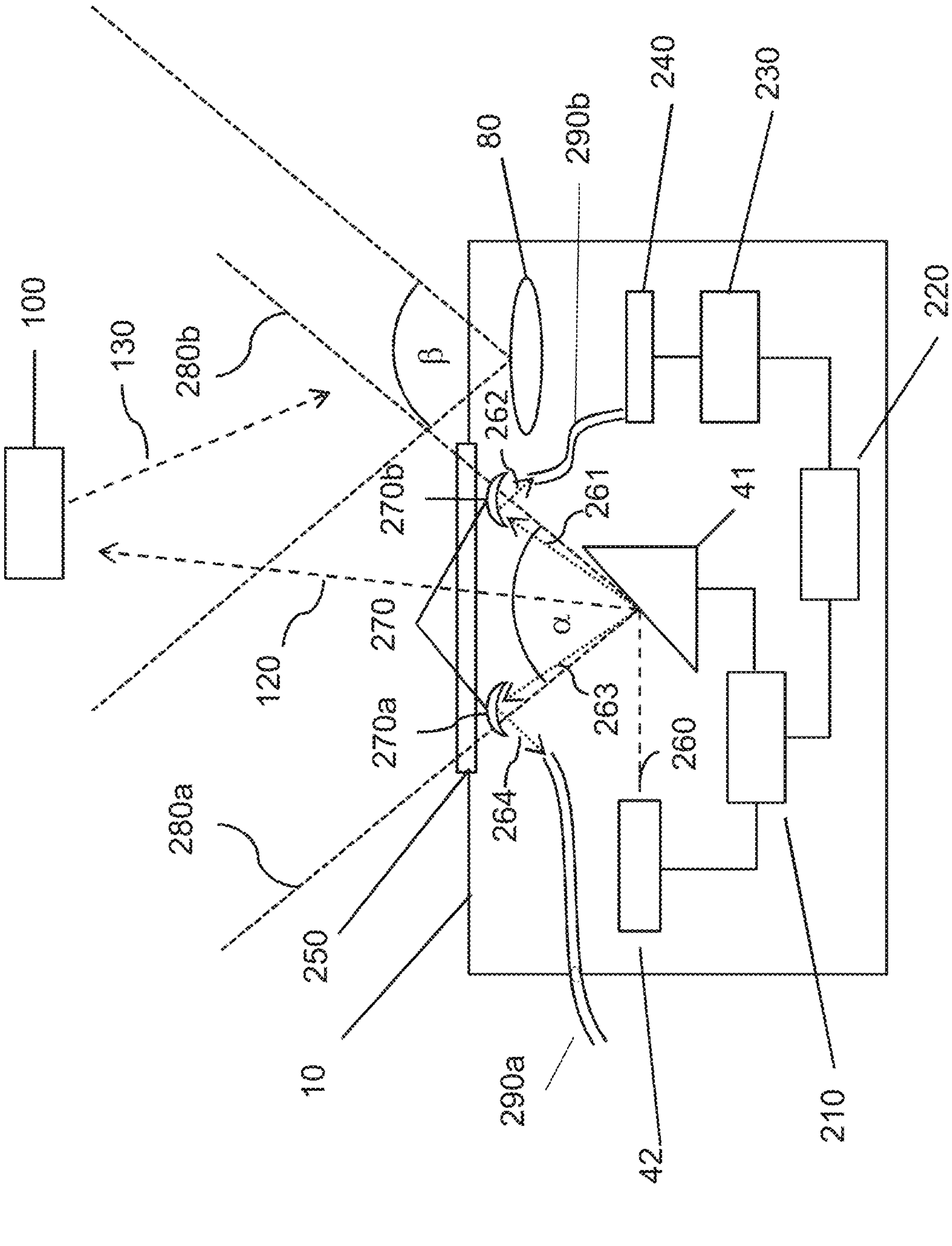
FIG. 3 shows an embodiment of the proposed LIDAR Sensor is System with a dynamic aperture device

FIG. 3 shows an embodiment [B_2] of the proposed LIDAR Sensor System with a dynamic aperture device In the embodiment [B_2], the light-shielding elements 270*a* & 270*b* of the dynamic aperture device 270 have a curved, reflector-like shape. Light beams 261 and 263 which are shielded by these elements are reflected and focused as beams 262 and 264 into light guide elements 290*a* & 290*b*. While light guide 290*b* transmits light beam 262 towards LIDAR detector 240 (similar to the above embodiment [B_1]), light guide 290*a* transmits light beam 264 towards alternative light-based applications which are provided outside of LIDAR Sensor System 10 or to a second detector that is located inside of the LIDAR Sensor System 10.

As already explained in the general part of the description, there are various options for which light beam 264 can be used. Furthermore, embodiments of the embodiment [B_1] can be combined with embodiments of the embodiment [B_2].

It is to be noted that various embodiments as described with reference to FIG. 2 and FIG. 3 above may be provided to implement the "dynamic aperture" of various embodiments as described with reference to FIG. 59 to FIG. 67.

In the following, various aspects of this disclosure will be illustrated:

Example 1z is a LIDAR Sensor System. The LIDAR Sensor

System may include

- at least one light source wherein the light source is configured to emit a light beam,
- at least one actuator wherein the actuator is configured to direct sensing light into a field of illumination,
- at least one second sensing system comprising an optic and a detector, wherein the optic and the detector are configured to receive a light beam scattered from an object. The lidar sensor system may further include a dynamic aperture device.

In Example 2z, the subject matter of Example 1z can optionally include that the dynamic aperture device includes an aperture element and the aperture element is configured to change an opening of the dynamic aperture device.

In Example 3z, the subject matter of Example 2z can optionally include that the aperture element includes a flat or curved surface.

In Example 4z, the subject matter of any one of Examples 2z or 3z can optionally include that the surface of the aperture element includes specular and/or diffuse reflective characteristics.

In Example 5z, the subject matter of any one of Examples 2z to 4z can optionally include that the aperture element includes micro-holes.

In Example 6z, the subject matter of any one of Examples 2z to 5z can optionally include that the aperture element includes a wavelength-conversion material to modify the optical properties of the reflected light.

In Example 7z, the subject matter of any one of Examples 2z to 6z can optionally include that the aperture element and a second aperture element are configured to be operated independently of each other.

In Example 8z, the subject matter of any one of Examples 2z to 7z can optionally include that the opening of the dynamic aperture device can be changed by activating an actuator that provides a positional change of the aperture element and/or by supplying a corresponding control voltage that provides a positional change of the aperture element.

In Example 9z, the subject matter of any one of Examples 1z to 8z can optionally include that the dynamic aperture device includes an electrochromic material.

In Example 10z, the subject matter of Example 9z can optionally include that the ratio between optical transmission and reflection of the dynamic aperture device can be changed by supplying a corresponding control voltage.

In Example 11z, the subject matter of any one of Examples 1 z to 10z can optionally include that the LIDAR Sensor System further includes at least one window, wherein the dynamic aperture device is arranged within or outside the window of the LIDAR Sensor System.

In Example 12z, the subject matter of any one of Examples 1z to 11z can optionally include that the LIDAR Sensor System further includes a detector arranged to capture radiation reflected at the dynamic aperture device, wherein the reflected radiation of the dynamic aperture device is used to monitor the function of the LIDAR Sensor System and/or to increase the reliability of the LIDAR Sensor System.

In Example 13z, the subject matter of any one of Examples 1 z to 12z can optionally include that the LIDAR Sensor System further includes a light guide arranged to capture radiation reflected at the dynamic aperture device, wherein the reflected radiation of the dynamic aperture device is used to monitor the function of the LIDAR Sensor System and/or to increase the reliability of the LIDAR Sensor System.

In Example 14z, the subject matter of any one of Examples 1z to 13z can optionally include that the reflected radiation of the dynamic aperture device is configured for use in other light-based applications.

Another aspect of the LIDAR Sensor System relates to a LIDAR Sensor Device (e.g. vehicle) equipped with a LIDAR Sensor System (and most likely also with other sensor devices like radar, camera, ultrasound, inertial measurement units (IMU) and others) that constantly has the task to monitor the environment (front, corner, side, back, top) and influence the driving behavior and traffic-related decision making accordingly, either semi-autonomously via ADAS or via direct Information to the driver, or fully automated (SAE levels 4, 5). All vehicle-related sensors (e.g. LIDAR) as well as their interactions and data fusion are termed vehicle sensor system (VS).

One problem is that e.g. at critical points (intersections, confusing streets, heavy pedestrian traffic, non-mapped areas or insufficiently mapped areas, off-road conditions), the sensor systems must work reliably, that is, among other things, carry out fast object recognition and assess whether the detected object plays a relevant role in relation to the existing traffic situation and the planned travel route.

Thereby, the following scenarios can occur:

a) Driver or vehicle drive a route for the first time.

b) Driver or vehicle drive a route that was previously driven (referenced by a time stamp or many time stamps), for example, once or several times or very often (for example the way to work or repetitive professional driving to transport people or goods). The sensor system has to reevaluate the complete driving situation each time, including static objects such as houses, trees, infrastructure elements (such as traffic lights, traffic signs) and the like, which were already detected and classified earlier.

c) Driver changes a vehicle and drives according to a) or b) with another ("new") vehicle but may want to still use previously (by the former vehicle) generated (GNSS/GPS-coded) time stamps and Presence Probability Factors (PPF), see below.

One problem in these scenarios is that each time energy- and time-consuming calculations have to be made of objects that are with a high probability permanently static.

In various aspects, road junctions, critical points, etc. are equipped with vehicle-external sensor devices. These devices are, for example, arranged on traffic infrastructure elements (e.g., traffic lights, traffic signs, street lights, etc.) and are stationary with respect to their GNSS/GPS-coordinates, but may be nevertheless mobile to a certain extent, for example with respect to orientation and/or tilt and/or zoom and include, for example, LIDAR Sensor Systems and other sensors (such as cameras). Of course, mobile LIDAR Sensor Systems may also be used (e.g., portable LIDAR reference systems and otherwise mobile systems mounted on cars, drones, automatic guided vehicles along a roadway) which may currently have changing GNSS/GPS coordinates. These vehicle-external devices are referred to here as Monitoring Devices (MD). They may include or essentially consist of an object detection sensor unit, an evaluation unit, a memory unit, a communication transmission/reception unit (CU), a GNSS/GPS communication unit.

The monitoring device (MD) but also the vehicle sensor system (VS) can perform the following tasks:

a) Detection and classification of fixed or static objects (like houses, trees). These objects may then carry a time-stamp, i.e. each time an object is detected, a GNSS/GPS-coded time stamp may be created and locally or externally stored (e.g. in a non-transitory computer-readable Digital Map), and the MD can also calculate the time period between subsequent time stamps. It may be preferred that time stamps are GNSS/GPS-coded. The more frequently a measurement confirms the presence (e.g. GNSS/GPS-coded time stamps) of an object, the higher is a calculated or referenced GNSS/GPS-coded presence probability factor (PPF) assigned to the object. A digital map is a collection of data that may be used to be formatted into a virtual image. The primary function of a digital map is to provide accurate representations of measured data values. Digital mapping also allows the calculation of geometrical distances from one object, as represented by its data set, to another object. A digital map may also be called a virtual map.

b) Presence probability factors (PPF) can take a scale of (freely definable) values, e.g. of 1=moving object (e.g. other vehicle) that carries only one (GNSS/GPS-coded) time stamp, 2=static, but measured for the first time (e.g. parked vehicle);

3=static and over a certain period of time (for example minutes or hours) measured as static (hours, e.g. construction crane, road constriction due to a construction site); such an object will carry more than 1 or many (GNSS/GPS-coded) time stamps 4=static and measured over a long period of time as static (days, weeks); such an object will carry many (GNSS/GPS-coded) time stamps 5=measured over very long periods of time (like months, years) as static (like houses), such an object will carry more than 1 or many (GNSS/GPS-coded) time stamps.

Sub criteria can be: static but shape-modifiable (like trees); static, but color changeable (billboards, house facades). One special case could be objects that move very slowly and are considered to be quasistatic (e.g. Transport of a bridge, surface deformation of a street). Such an object will carry more than 1 or many (GNSS/GPS-coded) time stamps.

c) Calculation of the distance and the viewing angle between the measuring system and the static object (TOF), possibly using triangulation methods (possibly also with other MD), cameras or stereo cameras, camera analysis of distortions from a projected pattern onto the static object Matrix (VCSEL).

d) The detected static object can also be detected by other sensors.

e) Merging the sensor data and evaluation. It is also possible to compare with a database in which, for example, PPF factors for known static and non-static objects are stored. The database may be locally available in the MD on a memory chip or be accessible via a cloud connection (via wired or wireless communication).

f) determination of the object data (outline, color, line shapes, absolute GNSS/GPS data, relative location data, etc.)

g) Measurement of a moving object (vehicle, pedestrian, etc.) by means of the MD in the relevant environment. Detecting the location and the trajectories (speed, acceleration, etc.) of the measured moving object.

h) Calculation of the visual object data of the above-mentioned static objects from the viewpoint of the vehicle (the objects) (point transformation).

i) Communication with a vehicle which can communicate with the MD by means of its own communication device (CU). Notification from MD to CU of the primarily measured original data (object, location) and/or the already converted (transformed) data as well as the respective object-related presence probability factors.

j) Approaching vehicle may receive and use this information, store it and use it for later purposes.

In various aspects, a vehicle communicating with the MD (with its own sensor system, but theoretically also without its own sensor system), can store and evaluate the data (own, foreign), and (at later times) transmit to other MDs and CUs of other vehicles, or, when changing the vehicle, data can be transferred via IoT or cloud services to the new vehicle or make it available to another driver/vehicle. In various embodiments, a vehicle without its own sensor system can also record and process data via a CU, and thus, for example, give a driver a warning (Head-up-Display HUD, signal display, etc.).

In various aspects, a vehicle itself makes the measurements, object classifications, and assignments of presence probability factors, and can access that data again on a later trip. In this case, a PPF value and a location coordinate are also assigned to each object (calculated, for example, from the GNSS/GPS position or triangulation method of the vehicle at a time t and the distances and angle values measured at that time). Furthermore, TR values can be assigned to each object (TR=traffic relevance), which indicate via a scale of values whether a high influence on the traffic situation is to be expected for an object (for example a traffic light or an obstacle which protrudes into the roadway, e.g. a traffic island, or a construction site marking with lane constriction) or whether an object is likely to have a lower impact on the traffic (e.g. a tree, a house).

In various aspects, a vehicle itself performs the measurements, object classifications and assignment of presence probability factors and can access these data later on. In addition, in a not fully autonomously driving vehicle, the viewing direction, duration of the viewing direction of the driver is detected and assigned via the viewing angle to the objects located in the field of view. In addition, a measuring device arranged in the vehicle interior is used (LIDAR, eye tracking, camera). The objects get an indexing (direction of view, duration of consideration). Since the position of the vehicle is known (GNSS/GPS or via a local referencing, that is to say via an exchange of the CU with MDs or other infrastructure elements or vehicles), the indexing can also be carried out in the case of a moving vehicle. Again, objects are assigned presence probability factors and/or traffic relevance values. As already described above, a comparison with a database is possible in order to avoid incorrect assignments.

In various aspects, a vehicle can thus decide (via a default setting) on the basis of the correlation of objects detected or communicated e.g. by an MD with the respective presence probability factors:

a) Whether a measurement should be partly or completely re-executed.

b) Whether the vehicle control should continue without remeasurement.

c) Whether to perform a measurement with reduced requirements (e.g., lower resolution, shorter averaging time, etc.).

In various aspects, increased caution may be provided if an object equipped with a high presence probability factor (PPF) is now assigned a reduced PPF value due to new measurements or information (VS), or by means of recorded external information. A control system causes a remeasurement. A vehicle with CU will then also be informed that the PPF value has changed (e.g. has reduced) and will be asked for a self-measurement.

In various aspects, a vehicle equipped with a VS records object-related data (LIDAR, ultrasound, (stereo) camera, radar, etc.) with each trip, possibly also the externally transmitted PPF values. In the case of driving along a same road train that has been used several times or very often, the recorded data is fed to an analysis program (e.g. using Artificial Intelligence AI), which then can achieve (with each renewed record) improved object recognition and object classification and calculation of the PPF value. Furthermore, each object may be assigned a value indicating the traffic relevance (TR) of the object, e.g. Road sign=high, tree next to road=medium, house far from the road=low). A billboard next to the street may e.g. categorized as not primarily traffic-relevant.

In various aspects, if a vehicle is equipped with an eye tracking system for the driver, the eye position and thus the angle of view and the duration of the eye can be recorded. Attention correlations can then be determined in cooperation with the external object recognition. The objects have an assigned TR value. This is especially useful and feasible for repeat trips. For example, the VS may then give higher priority to sensor acquisition of objects that have been assigned high TR values or high attention correlations on previous trips (e.g., earlier temporal priority, higher resolution, longer averaging, higher laser power, etc.).

If the driver's eye focus (>1 sec) falls on an object that is unimportant for road safety (or too long), the vehicle monitoring system (VS, MD) can inform the vehicle of an increased danger level and trigger sensible actions (more precise measurement in the field of vision; reduce driving speed; activation of an early warning system). This is especially the case when the view for a long time (>1 sec) falls on known non-traffic-related objects (such as billboards).

In various aspects, static objects, e.g. traffic infrastructure elements (traffic lights, construction site markings, etc.) have installed a simpler information system instead of a complex MD, in which their properties (object class, location, PPF value, TR value, etc.) are stored and, for example, can be transmitted to vehicles via CU (disadvantage: power supply necessary). Alternatively, it is also conceivable that the information is only passively available (comparable, for example, to a bar code or QR code or holographic pattern) and can be read out by the VS (e.g. by means of a camera or via an NFC communication).

In various aspects, the measurement method also allows to combine, average, supply to an AI, or the like, the measurements and value determination obtained from many vehicles. As a result, the driving safety can be further increased.

In various aspects, the measurement method allows to avoid or at least reduce unnecessary computational efforts since not all of the usually required environmental analysis procedures have to be carried out every time a vehicle passes by an object with the same depth level and/or can be limited. This helps reduce computational effort and therefore power consumption. This is necessary because energy consumption may impose a limiting factor especially for autonomously driving electrical vehicles since there are quite a number of energy consuming devices like sensors, for example RADAR, LIDAR, camera, ultrasound, Global Navigation Satellite System (GNNS/GPS), sensor fusion equipment, processing power, mobile entertainment equipment, heater, fans, Heating, Ventilation and Air Conditioning (HVAC), Car-to-Car (C2C) and Car-to-Environment (C2X) communication, data encryption and decryption, and many more, all leading up to a high power consumption. Especially data processing units are very power hungry. Therefore, it is necessary to optimize all equipment and data analysis methods and use such devices and methods in intelligent ways so that a high battery mileage can be sustained.

Therefore, if a Vehicle drives a route for the first time, measurement and object recognition and classification is carried out with the vehicle sensor system (VS) and data communication (CU) with the vehicle's monitoring device (MD). The traffic objects are assigned a presence probability factor (PPF) and a traffic relevance values (TR).

Suggested is a method that when a vehicle has traveled a route several times or oftentimes, measurement and object determination are carried out with a vehicle sensor system (VS) including data communication (CU) with various components of the LIDAR Sensor System taking into consideration previously determined PPF and TR values. These data are then submitted to a vehicle control system and/or a driver.

FIG. 85 shows a system 8500 including a vehicle 8502, one or more monitoring devices (MD) 8506, and an external object 8512 (to be detected) in accordance with various embodiments in a traffic situation.

The vehicle 8502 may include a vehicle sensor system 8504. The vehicle sensor system 8504 may include one or more (e.g. different types) of sensors, such as e.g. one or more LIDAR sensors 52 as well as one or more sensor controllers 53. The vehicle may further include a communication unit 8510 (which may also be referred to as second communication unit 8510).

The system 8500 may further include one or more vehicle-external monitoring devices (MD) 8506 (as described above), which may also be equipped with a communication unit 8508 (which may also be referred to as first communication unit 8508). Each MD 8506 may include one or more processors (e.g. programmable processors or microcontrollers) configured to implement one or more of the above described functions. The communication units 8508, 8510 may provide a (radio) communication connection between the MD 8506 and the vehicle 8502, e.g. to exchange information regarding a detected object 8512 (e.g. by the vehicle sensor system 8504) and a recognized or classified object 8512 (e.g. by the MD 8506) and/or the above described presence probability factor and/or the above described traffic relevance value for the recognized or classified object 8512 and/or control information to control the vehicle 8502 or any component (such as e.g. a warning light or a driver assistance system) of the vehicle 8502.

FIG. 86 shows a method 8600 in accordance with various embodiments in a flow diagram. The method 8600 may include, in 8602, detecting an object, in 8604, determining a location of the object, in 8606, determining a presence probability factor for the object, the presence probability factor describing a probability of the presence of the object at the determined location over time, and, in 8608, assigning the presence probability factor to the object.

FIG. 87 shows a method 8700 in accordance with various embodiments in more detail.

In this method 8700, it is assumed that the vehicle 8502 drives along a route for the first time (block 8702). In this case, in 8704, the vehicle sensor system 8504 measures the vehicle's environment to detect any objects located therein. In case one or more objects are determined in the reach of the vehicle sensor system 8504, the vehicle sensor system 8504 or any other suitable component determines the (e.g. global or local) location of the detected object(s), e.g. using the devices as described above, such as e.g. GPS (in 8706). The method 8700 may further include, in 8708, the vehicle 8502 and/or the monitoring device 8506 (e.g. together e.g. using communication units 8508, 8510 of the vehicle 8502 and the monitoring device 8506) recognize the detected object(s) 8512, e.g. classify the detected object(s) 8512. In 8710, the vehicle 8502 and/or the monitoring device 8506 may determine a presence probability factor and optionally also a traffic relevance value for each detected and recognized object 8512. Furthermore, in 8712, the method 8700 may include to control the vehicle 8502 taking into consideration the determined presence probability factor(s) and optionally the determined traffic relevance value(s) for the recognized object(s) 8512. The control may include simply warning the driver of the vehicle 8502 about a possibly upcoming dangerous traffic scenario or even control the driving of the vehicle 8502 (control, e.g. change driving direction or speed of the vehicle 8502).

FIG. 88 shows a method 8800 in accordance with various embodiments in more detail.

In this method 8800, it is assumed that the vehicle 8502 drives along a route which it has already driven before (block 8802). In this case, in 8804, the vehicle sensor system 8504 measures the vehicle's environment to detect any objects located therein. In various embodiments, the measurement may be performed taking into consideration previous measurements, previously detected and recognized object(s) 8512 and the respectively assigned presence probability factor(s) and/or traffic relevance factor(s), e.g. by measuring specific locations with higher or lower accuracy. For each detected object 8512, in 8806, the vehicle 8502 and/or the monitoring device 8506 may determine the location of the detected object(s). In various embodiments, the location may be determined newly only for those detected object(s), which have not been detected previously and/or for which the assigned presence probability factor(s) are not sufficiently high and/or the assigned traffic relevance factor(s) are sufficiently high. Furthermore, in 8808, the vehicle 8502 and/or the monitoring device 8506 (e.g. together e.g. using communication units 8508, 8510 of the vehicle 8502 and the monitoring device 8506) recognize the detected object(s) 8512, e.g. classify the detected object(s) 8512 taking into consideration previously determined and assigned presence probability factor(s) and/or traffic relevance factor(s). Furthermore, in 8810, the method 8800 may include to control the vehicle 8502 taking into consideration the determined presence probability factor(s) and optionally the determined traffic relevance value(s) for the recognized object(s) 8512. The control may include simply warning the driver of the vehicle 8502 about a possibly upcoming dangerous traffic scenario or even control the driving of the vehicle 8502 (control, e.g. change driving direction or speed of the vehicle 8502).

Various embodiments as described with reference to FIG. 85 to FIG. 88 may be applied to the "dynamic aperture" of the embodiments as described with reference to FIG. 59 to FIG. 67, e.g. to set and/or adapt the setting of the aperture.

Furthermore, various embodiments as described with reference to FIG. 85 to FIG. 88 may be applied to the digital maps (e.g. traffic maps) of the embodiments as described with reference to FIG. 127 to FIG. 130 and or FIG. 123.

Furthermore, various embodiments as described with reference to FIG. 85 to FIG. 88 may be used to control a spatial light modulator (SLM), e.g. the SLM in the embodiments as described with reference to FIG. 59 to FIG. 67.

In the following, various aspects of this disclosure will be illustrated:

Example 1m is a method. The method may include detecting an object, determining a location of the object, determining a presence probability factor for the object, the presence probability factor describing a probability of the presence of the object at the determined location, and assigning the presence probability factor to the object.

In Example 2m, the subject matter of Example 1m can optionally include that the presence probability factor describes a probability of the presence of the object at the determined location over time.

In Example 3m, the subject matter of any one of Examples 1m or 2 m can optionally include that the method further includes storing the presence probability factor and information describing its assignment to the object.

In Example 4m, the subject matter of any one of Examples 1m to 3 m can optionally include that the method further includes transmitting the presence probability factor and information describing its assignment to the object to another device.

In Example 5m, the subject matter of any one of Examples 1m to 4 m can optionally include that the method further includes storing the object in a digital map and adding the determined location of the object to the digital map.

In Example 6m, the subject matter of any one of Examples 1m to 5 m can optionally include that the method further includes storing the presence probability factor together with the object in a digital map.

In Example 7m, the subject matter of any one of Examples 1m to 6 m can optionally include that the method further includes determining further characteristics describing the object, and assigning the further characteristics to the object.

In Example 8m, the subject matter of any one of Examples 1m to 7 m can optionally include that the method further includes determining a traffic relevance value for the object, the traffic relevance value describing the relevance of the object within a traffic situation, and assigning the traffic relevance value to the object.

In Example 9m, the subject matter of any one of Examples 1m to 8 m can optionally include that the method further includes transmitting information about the object, the location of the object and the presence probability factor to another communication device.

In Example 10m, the subject matter of any one of Examples 8m to 6 m can optionally include that the method further includes controlling a vehicle taking into consideration the object, the location of the object and the presence probability factor.

In Example 11m, the subject matter of any one of Examples 1m to 10 m can optionally include that the presence probability factor is determined taking into consideration one or more of the following aspects: whether the object is moving; speed of the object; number of times the object has previously been detected at the same location; and number of times the object has previously been detected at the same location within a predefined period of time.

In Example 12m, the subject matter of any one of Examples 1m to 11 m can optionally include that the method further includes determining whether further determining the object should be started.

In Example 13m, the subject matter of any one of Examples 1m to 12 m can optionally include that further determining of the object should be started includes at least one of the following: determining whether a measurement should be partly or completely re-executed, determining whether a control should continue without re-measurement, determining whether to perform a measurement with reduced requirements.

In Example 14m, the subject matter of any one of Examples 5m to 9 m can optionally include that the method further includes using the digital 1map in a computer implemented navigation system.

Example 15m is a device. The device may include one or more processors configured to perform a method of any one of Examples 1m to 10 m.

Example 16m is a vehicle. The vehicle may include a device of Example 15m.

Example 17m is a computer program. The computer program may include instructions which, when executed by one or more processors, implement a method of any one of Examples 1m to 14 m.

Another aspect of the LIDAR Sensor System deals with light detection and light ranging. In such systems, electromagnetic radiation (visible, infrared) emitted from a light source or light source, respectively, is used to derive information about objects in the environment of the LIDAR Sensor System. In an exemplary application, such LIDAR Sensor Systems are arranged at a vehicle (LIDAR Sensor Device) to derive information about objects on a roadway or in the vicinity of a roadway. Such objects may include other road users (e.g. vehicles, pedestrians, cyclists, etc.), elements of road infrastructure (e.g. traffic signs, traffic lights, roadway markings, guardrails, traffic islands, sidewalks, bridge piers, etc.) and generally all kind of objects which may be found on a roadway or in the vicinity of a roadway, either intentionally or unintentionally. The information derived via such a LIDAR Sensor System may include the distance, the velocity, the direction of movement, the trajectory, the pose and/or other physical or chemical properties of these objects. To derive this information, the LIDAR Sensor System may determine the Time-of-Flight (TOF) or variations of physical properties such as phase, amplitude, frequency, polarization, etc. of the electromagnetic radiation emitted by a light source after the emitted radiation was reflected or scattered by at least one object in the Field of Illumination (FOI) and detected by a photo-detector.

Apart from the above described LIDAR Sensor System functions, there is generally a great need for light-based functionalities in modern vehicles, e.g. in autonomous or semi-autonomous driving vehicles (e.g. SAE Automation Levels 1-5). A conventional system may use for each of these applications a separate LIDAR Sensor System, each equipped with a corresponding light source. However, it turns out that high power light sources are very expensive and therefore contribute a large fraction to the overall system costs.

In current LIDAR Sensor Systems, the light of the light source is typically used exclusively to derive the above described information about objects in the LIDAR environment. No dedicated multiple usage scenarios are known.

The proposed LIDAR Sensor System is based on the observation that the light source of a LIDAR Sensor System is, on the one hand, one of the most expensive components in a LIDAR Sensor System, while on to the other hand, there are many more situations in which light-based functionalities would help to further improve safety and reliability of autonomous or semi-autonomous driving vehicles.

The basic idea behind the proposed LIDAR Sensor System is to use the light emitted by the light source of "LIDAR Sensor System A" not is only for the detection and ranging purposes related to "LIDAR Sensor System A" but to use this light at least partially for other purposes (i.e. for alternative functions or additional use cases). The term "partially" shall comprise in this context both of the following aspects: "part of the time" as well as a "part of the light beam". Both types of usage may be performed together or consecutively, i.e. independent of each other.

The following is a list of light-based functions which may be operated by "partially" using the light of the "LIDAR Sensor System A":

- Light-based reference signals (e.g. for the photodetector of the same "LIDAR Sensor System A" as the light source or for a different "LIDAR sensor B").

- Other laser based applications, e.g. systems for driver monitoring, systems for passenger monitoring.
- Light-based communication signals either with internal or external communication devices/partners (e.g. based on a signal encoding via sequences of pulses with different pulse heights and/or pulse lengths and/or pulse shapes).
- Other LIDAR Sensor Systems, e.g. "LIDAR Sensor System B", "LIDAR Sensor System C", etc.

The "partial" light of "LIDAR Sensor System A" may be used exclusively to operate one or more of these alternative or additional light-based functions or the "partial" light of "LIDAR Sensor System A" may be used temporarily to assist or boost one or more of these alternative or additional light-based functions.

To allow these multiple usage cases, "LIDAR Sensor System A" includes one or more optical elements which are a) provided in such a way or which b) can be adapted in such a way that light can be "partially" coupled out of the main beam of "LIDAR Sensor System A". Examples for such elements are lenses, mirrors, light guides, etc. Further details are described in below.

The light source for "LIDAR Sensor System A" applications provides, generally speaking, electromagnetic radiation or light, respectively, which is used to derive information about objects in the environment of the LIDAR Sensor System. In various embodiments, the light source emits radiation in a non-visible wavelength range, e.g. infrared radiation (IR, 850-1600 nm). In various embodiments, the light source emits radiation in a narrow bandwidth range. The light source may emit pulsed radiation comprising individual pulses of the same pulse height or trains of multiple pulses with uniform pulse height or with varying pulse heights. Typical pulse duration lengths may include 2 ns to 50 ns, where the pulses are repeated after a typical OFF-time (e.g. due to thermal limitations) in the range of 500 ns to 2 μs. In order to improve signal-to-noise ratio (SNR), several measurement results (e.g. of the order of 10-100) may be averaged.

The pulses may have a symmetric pulse shape, e.g. a rectangular pulse shape. Alternatively, the pulses may have asymmetric pulse shapes, with differences in their respective rising and falling edges. The plurality of pulses may also overlap with each other, at least partially. Apart from such a pulsed operation, the light source may be operated also in a continuous wave operation mode, at least temporarily. In continuous wave operation mode, the light source may be adapted to vary phase, amplitude, frequency, to polarization, etc. of the emitted radiation. The light source may include solid-state light sources (e.g. edge-emitting lasers, surface-emitting lasers, semiconductor lasers, VCSEL, VECSEL, LEDs, super-luminescent LEDs, etc.). The light source may include one or more light emitting elements (of the same type or of different types) which may be arranged in linear stripes or in is two- or 3-dimensional arrays. The light source may further include active or passive heat dissipation elements. The light source may have several interfaces, which facilitate electrical connections to a variety of electronic devices such as power sources, drivers, controllers, processors, etc.

One effect is the efficient use of expensive laser light sources. Further effects depend on the specific use case. Details please see below together with the general description of the different use cases.

Figure 4:
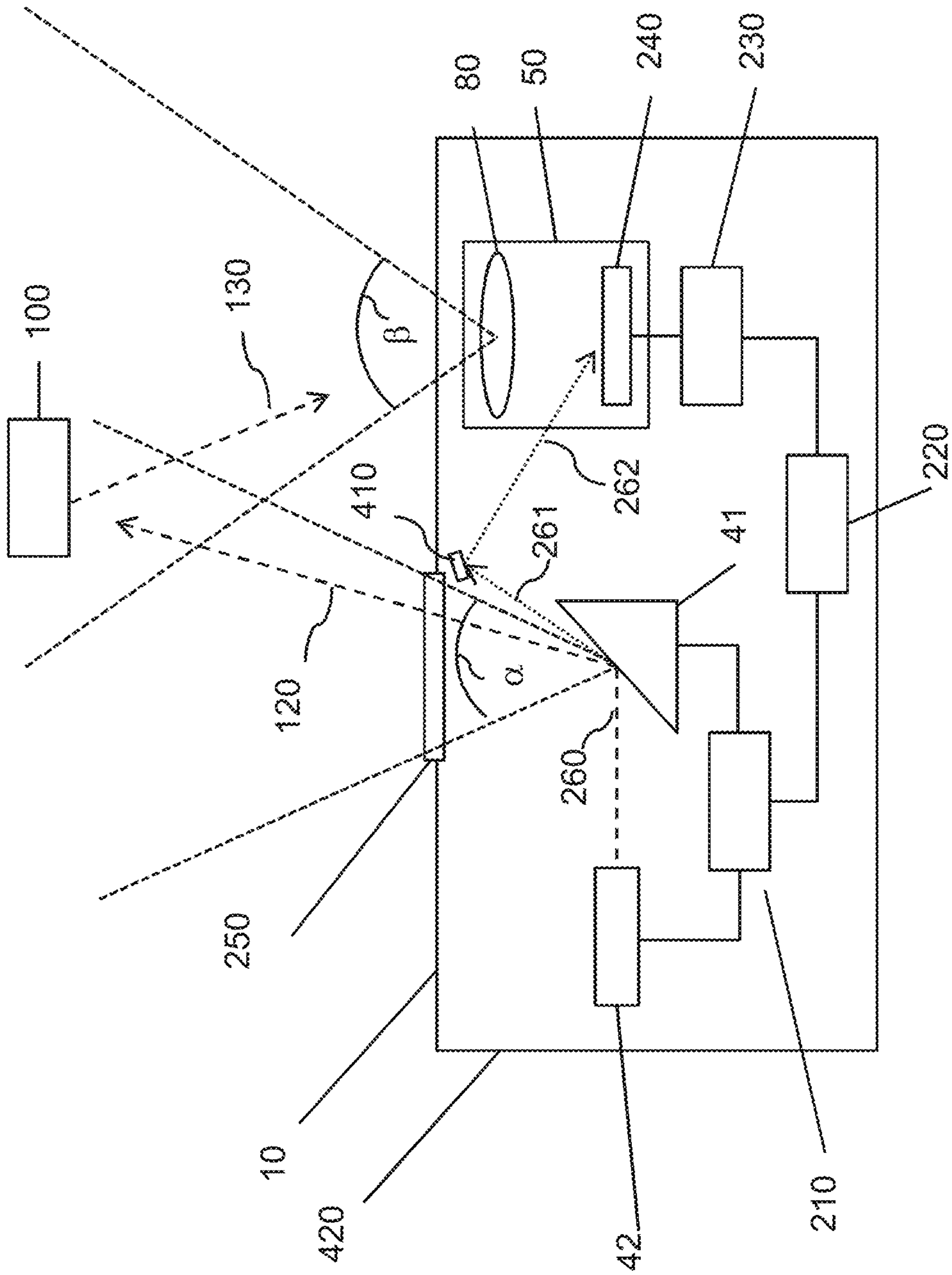
FIG. 4 shows an embodiment of the proposed LIDAR Sensor System with partial beam extraction

In an embodiment [C_1/FIG. 4], the light of "LIDAR Sensor System A" is partially extracted and transmitted to the photodetector of "LIDAR A" to provide an optical reference signal. "LIDAR Sensor System A" in this example is a scanning LIDAR system with a 1D-MEMS scanner which directs and/or transmits light into the so-called Field of Illumination (FOI), i.e. a solid angle sector inside which objects may be detected. The FOI is limited along a horizontal direction to an opening angle $\alpha_H$ and along a vertical direction to an opening angle $\beta_V$. Suitable optical elements are placed outside of this solid angle sector, but in close vicinity to the solid angle boundaries. In various embodiments, these optical elements are located close to the scanning mirror. Such optical elements may include:

- light guides;
- light guides together with focusing lenses;
- reflectors (e.g. a plane mirror or elliptical or parabolic reflectors); and/or
- reflecting structures at the sensor housing.

In various embodiments/implementations, the optical element includes a doping material to modify the optical properties of the partially extracted and transmitted light.

The embodiment [C_1] shows a LIDAR Sensor System includes light source which emits a light beam that can be directed and/or transmitted via beam steering device and window into the FOI (limited by dashed lines for the solid angle sector with opening angle α). The transmitted light beam can then be reflected at an object in the FOI, leading to a backscattered light beam. If the backscattered light beam emerges from a solid angle sector with opening angle β, the scattered light beam can be collected via receiver optics (e.g. lens) and focused onto detector (e.g. photodetector). In various embodiments/implementations, the beam steering device includes an optical phased array or a scanning fiber.

Electronics device is configured to receive and process signals from detector. Signal processing may include amplifying, attenuating, filtering, comparing, storing or otherwise handling electric or electronic signals. For these purposes, device may include an Application-Specific Integrated Circuit (ASIC). Electronics device is controlled by controlling device which may include a processor unit and which controls driver as well (driver for light source and scanner).

Based on the proposed embodiment, beam steering device can be controlled such that at certain times (e.g. regular intervals such as every 1 ms or every 1 s or every 10 s) the mirror is tilted farther than in a standard operation mode in order to extract light along beam direction. Light beam will then be reflected at mirror (with a planar geometry in this specific example) and directed as light beam towards the detector.

This way, a reference signal can be provided at "certain times" to the detector. The reference signal may be used to check for deviations in the timing or clocking system. It may also be used to check the light output of the light source in order to be able to compensate for unexpected deviations (e.g. lifetime dependent decay, temperature dependent efficiency, etc.). In other words, the reference signal may be used for a functional control system.

The above mentioned "certain times" can be predefined, regular time intervals. Alternatively, the timing intervals can also be chosen depending on other parameters such as vehicle velocity, object classification (e.g. pedestrians, increased attention to eye safety), etc.

Figure 5:
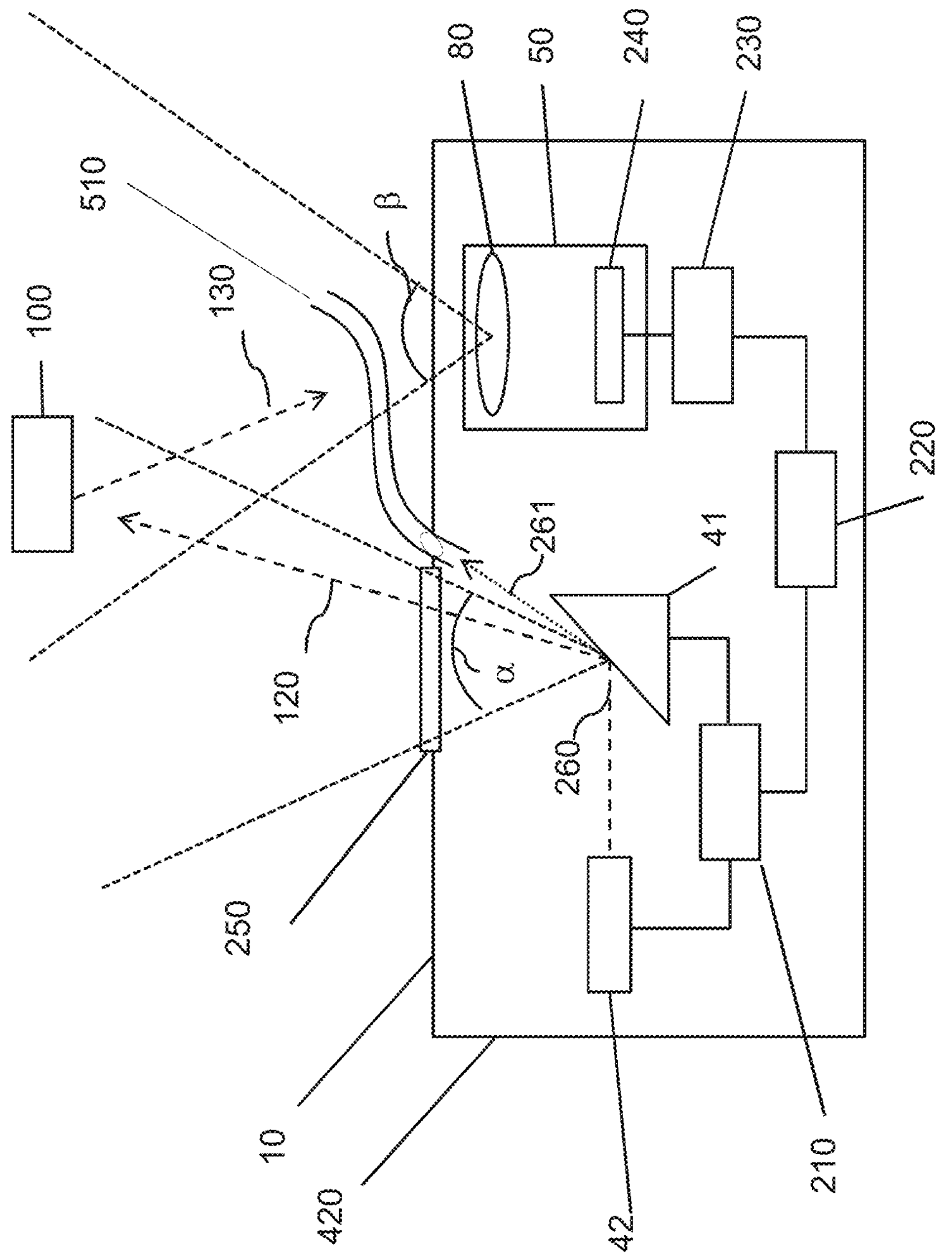
FIG. 5 shows an embodiment of the proposed LIDAR Sensor System with partial beam extraction

In another embodiment [C_2/FIG. 5], part of the light of "LIDAR Sensor System A" is coupled out via light guide and transmitted to another light-based application. The light guide may also be provided at other positions outside the FOI. In general, the light guide may also be provided inside the FOI (close to the dashed borderline). In such a case, a fraction of light would be extracted once during each scan and may result in an asymmetric FOI. To facilitate a good coupling efficiency, focusing elements such as converging lenses in front of the light guide may be used. Light guides may have diameters in the range from ca. 10 μm up to several 100 μm or even 1000 μm and larger, using materials including or essentially consisting of for example glass-based materials, polymer-based materials, silica-based or sapphire-based materials. In addition, doping materials may be used to modify the optical properties of the out-coupled light. As an example, phosphor materials or wavelength-conversion materials may be added in order to change the wavelength of the extracted light, either via Up-conversion or Down-conversion (e.g. from 850 nm or 905 nm to a wavelength in the range of 1500 nm). In various embodiments, this may be used together with detectors, which are sensitive in different wavelength regimes.

"Other light-based applications" may include driver monitoring systems or occupancy-detection systems, which observe the driver inside the passenger area, e.g. based on methods such as eye-tracking, face recognition (evaluation of head rotation or tilting), measurement of eye-blinking events, etc. The same methods can also be used to monitor passenger. Alternatively, the light extracted by the light guide may also be transmitted to the photodetector of "other LIDAR Sensor Systems B" in order to provide a signal for reference and timing synchronization purposes. Alternatively, the light extracted by the light guide may be used for light-based communication either with internal or external communication devices/partners. Communication signals may use encoding techniques based on sequences of pulses with different pulse heights and/or pulse lengths and/or pulse shapes).

It is also possible that the partial extracted light is configured as a light source (8108) or as a light source for the light emitting surface structures (8110), as described with respect to FIG. 81 to FIG. 84.

In various embodiments, the "other light-based application" does not need to be supplied constantly with light from "LIDAR Sensor System A" but only at certain times (see also corresponding description under embodiment [C_1]).

Figure 6:
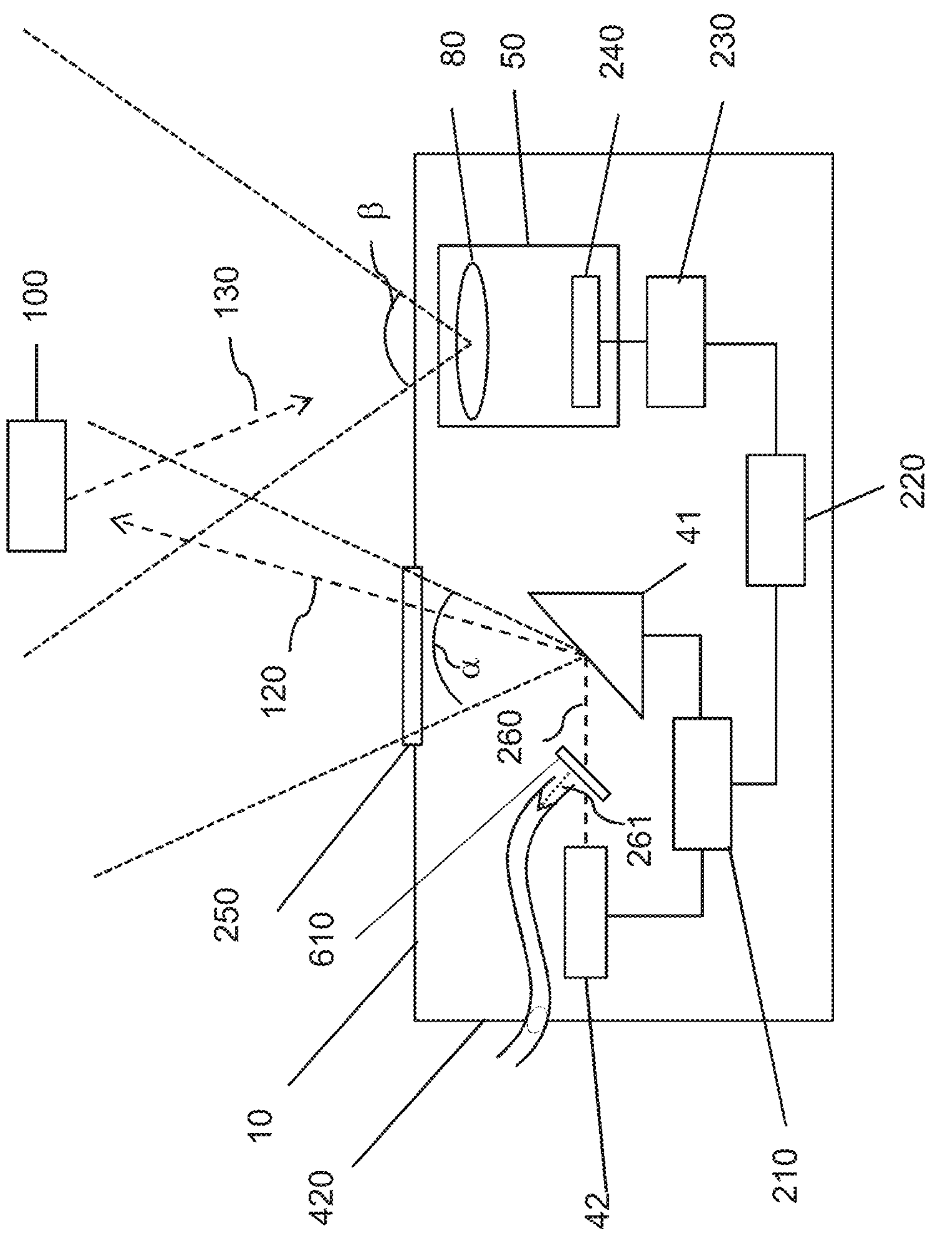
FIG. 6 shows an embodiment of the proposed LIDAR Sensor System with partial beam extraction

In another embodiment [C_3/FIG. 6], optical element is placed between light source and beam steering unit (which might be a scanning mirror or other beam deflecting elements). In one embodiment, the optical element may be a mirror with partly transmitting and partly reflecting properties, with a preset ratio between transmission and reflection. In another embodiment, optical element may be an electrochromic mirror for which the ratio between transmission and reflection can be changed when supplying a corresponding control voltage. In further embodiments, the optical element might include rotatable elements (e.g. a chopper wheel), tiltable elements (e.g. single mirrors or multi-mirror devices such as DMDs) or elements which can be linearly moved along at least one direction. Such elements may mirrors, lenses, transparent wedges, transparent plates, etc. Depending on the optical properties of element, the orientation between light source and scanner should be adapted.

As compared to embodiment [C_1] and [C_2], embodiments of embodiment [C_3] allow a complete switching between "LIDAR Sensor System A" and the "other light-based application". This means that at time intervals where "LIDAR Sensor System A" is not needed, the whole light of "LIDAR Sensor System A" can be used for other applications, e.g. "LIDAR Sensor System B" which may be operated only in certain specific situations (e.g. LIDAR on rear side for parking). Or the "LIDAR Sensor System A" and "LIDAR Sensor System B" may have different use scenarios in which they need larger and smaller amounts of light. For example "LIDAR Sensor System A" may be used at the vehicle front, e.g. for long range purposes at high vehicle velocities on motorways, whereas "LIDAR Sensor System B" may be used at a side-position of the vehicle where the higher fractions of light are needed only at smaller velocities, e.g. within cities or pedestrian areas.

Figure 7:
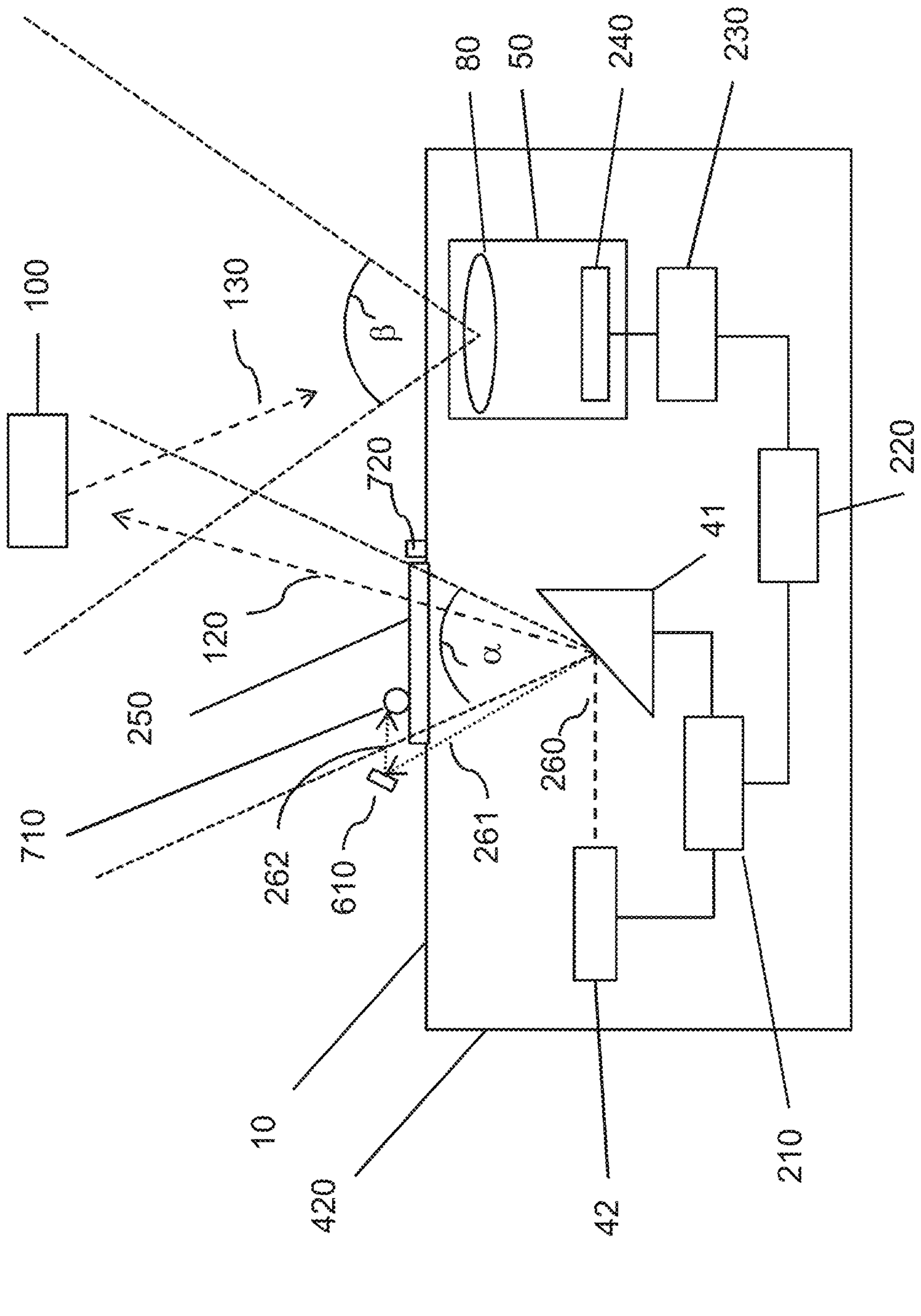
FIG. 7 shows an embodiment of the proposed LIDAR Sensor System with partial beam extraction

In another embodiment [C_4/FIG. 7], light beam is extracted reflected via optical element (e.g. a planar mirror) as light beam towards sensor window. In various embodiments, the light beam is guided under gracing incidence over sensor window. In case that impurity particles (e.g. dust, dirt) are present at the outer surface of window, light beam is scattered by these impurity particles, basically in all directions. Part of this scattered light can be used as indication for such impurities. In one embodiment, that part of the scattered light which enters window is transmitted through total internal reflection (TIR) towards detector. Detector can be a simple IR-sensitive detector which may thus detect impurities, both qualitatively and quantitatively. In another embodiment, light scattered from the impurity particles is collected and transmitted via suitable optical elements (mirror, reflector, light guide) towards detector of LIDAR Sensor System. In this example, detector is configured such that during specific times (i.e. when the light beam is extracted), the detector is active for a short measurement window of less than about 30 ns during which light scattered by impurity particles may be detected. In a further embodiment, the optical element might be placed inside LIDAR Sensor System with the effect that the impurity detection system itself is protected from impurities. In this case, light beam may transmit window and is the scattered at impurity particles. Scattering light can be detected again using different detection setups (see above). In a further embodiment, light scattered from the light beam (which is periodically scanned over sensor window) is used directly as detection signal for possible impurities. In this case, it is possible also to get information about the location of possible impurity particles.

FIG. 4 shows an embodiment [C_1] of the proposed LIDAR Sensor System with partial beam extraction.

The LIDAR Sensor System 10 includes light source 42 which emits a light beam 260 that can be directed and/or transmitted via beam steering device 41 and window 250 into the FOI (limited by dashed lines for the solid angle sector with opening angle α). The transmitted light beam 120 can then be reflected at an object 100 in the FOI, leading to a backscattered light beam 130. If the backscattered light beam 130 emerges from a solid angle sector with opening angle β, the scattered light beam 130 can be collected via receiver optics (e.g. lens 80) and focused onto detector 240.

Electronics device 230 is configured to receive and process signals from detector 240. Signal processing may include amplifying, attenusting, filtering, comparing, storing or otherwise handling electric or electronic signals. For these purposes, device 230 may include an Application-Specific Integrated Circuit (ASIC). Electronics device 230 is controlled by controlling device 220 which may include a processor unit and which controls driver 210 as well (driver for light source 42 and scanner 41).

Based on the proposed embodiment, beam steering device 41 can be controlled such that at certain times (e.g. regular intervals such as every 1 ms or every 1s or every 10s) the optical element 410 is tilted farther than in a standard operation mode in order to extract light along beam direction 261. Light beam 261 will then be reflected at the optical element 410 (mirror with a planar geometry in this specific example) and directed as light beam 262 towards the detector 240.

This way, a reference signal can be provided at "certain times" to the detector 240. The reference signal may be used to check for deviations in the timing or clocking system. It may also be used to check the light output of the light source 42 in order to be able to compensate for unexpected deviations (e.g. lifetime dependent decay, temperature dependent efficiency, etc.). In other words, the reference signal may be used for a functional control system.

The above mentioned "certain times" can be predefined, regular time intervals. Alternatively, the timing intervals can also be chosen depending on other parameters such as vehicle velocity, object classification (e.g. pedestrians, increased attention to eye safety), etc.

FIG. 5 shows an embodiment [C_2] of the proposed LIDAR Sensor System with partial beam extraction In the embodiment [C_2], part of the light of "LIDAR Sensor System A" is coupled out via optical element 510 (light guide in this specific example) and transmitted to another light-based application. The light guide 510 may also be provided at other positions outside the FOI. In general, the light guide 510 may also be provided inside the FOI (close to the dashed borderline). In such a case, a fraction of light would be extracted once during each scan and may result in an asymmetric FOI. To facilitate a good coupling efficiency, focusing elements such as converging lenses in front of the light guide may be used. Light guides may have diameters in the range from ca. 10 μm up to several 100 μm or even 1000 μm and larger, using materials including for example glass-based materials, polymer-based materials, silica-based or sapphire-based materials. In addition, doping materials may be used to modify the optical properties of the out-coupled light. As an example, phosphor materials or wavelength-conversion materials may be added in order to change the wavelength of the extracted light, either via Up-conversion or Down-conversion (e.g. from 850 nm or 905 nm to a wavelength in the range of 1500 nm). In some implementations, this may be used together with detectors, which are sensitive in different wavelength regimes.

Other light-based applications" may include driver monitoring systems or occupancy-detection systems, which observe the driver inside the passenger area, e.g. based on methods such as eye-tracking, face recognition (evaluation of head rotation or tilting), measurement of eye-blinking events, etc. The same methods can also be used to monitor passenger. Alternatively, the light extracted by the light guide may also be transmitted to the photodetector of "other LIDAR Sensor Systems B" in order to provide a signal for reference and timing synchronization purposes. Alternatively, the light extracted by the light guide may be used for light-based communication either with internal or external communication devices/partners. Communication signals may use encoding techniques based on sequences of pulses with different pulse heights and/or pulse lengths and/or pulse shapes).

It is also possible, that the partial extracted light is configured as a light source (8108) or as a light source for the light emitting surface structures (8110), as described with respect to FIG. 81 to FIG. 84.

In some implementations, the "other light-based application" does not need to be supplied constantly with light from "LIDAR Sensor System A" but only at certain times (see also corresponding description under FIG. 4).

FIG. 6 shows an embodiment [C_3] of the proposed LIDAR Sensor System with partial beam extraction In the embodiment [C_3], optical element 610 is placed between light source 42 and beam steering unit 41 (which might be a scanning mirror 41 or other beam deflecting elements). In one embodiment, the optical element 610 may be a mirror with partly transmitting and partly reflecting properties, with a preset ratio between transmission and reflection. In another embodiment, optical element 610 may be an electrochromic mirror for which the ratio between transmission and reflection can be changed when supplying a corresponding control voltage. In further embodiments, the optical element 610 might comprise rotatable elements (e.g. a chopper wheel), tiltable elements (e.g. single mirrors or multi-mirror devices such as DMDs) or elements which can be linearly moved along at least one direction. Such elements may mirrors, lenses, transparent wedges, transparent plates, etc. Depending on the optical properties of optical element 610, the orientation between light source 42 and scanner 41 should be adapted.

As compared to the embodiment [C_1/FIG. 4] and the embodiment [C_2/FIG. 5], the third embodiment [C_3/FIG. 6] allow a complete switching between "LIDAR Sensor System A" and the "other light-based application". This means that at time intervals where "LIDAR Sensor System A" is not needed, the whole light of "LIDAR Sensor System A" can be used for other applications, e.g. "LIDAR Sensor System B" which may be operated only in certain specific situations (e.g. LIDAR on rear side for parking). Or the "LIDAR Sensor System A" and "LIDAR Sensor System B" may have different use scenarios in which they need larger and smaller amounts of light. For example "LIDAR Sensor System A" may be used at the vehicle front, e.g. for long range purposes at high vehicle velocities on motorways, whereas "LIDAR Sensor System B" may be used at a side-position of the vehicle where the higher fractions of light are needed only at smaller velocities, e.g. within cities or pedestrian areas.

FIG. 7 shows an embodiment [C_4] of the proposed LIDAR Sensor System with partial beam extraction In the embodiment [C_4], light beam 261 is extracted reflected via optical element 610 (e.g. a planar mirror) as light beam 262 towards sensor window 250. In some implementations, the light beam 262 is guided under gracing incidence over sensor window 250. In case that impurity particles (e.g. dust, dirt) are present at the outer surface of window 250, light beam 262 is scattered by these impurity particles, basically in all directions. Part of this scattered light can be used as indication for such impurities. In one embodiment, that part of the scattered light which enters window 250 is transmitted through total internal reflection (TIR) towards detector 720. Detector 720 can be a simple IR-sensitive detector which may thus detect impurities, both qualitatively and quantitatively. In another embodiment, light scattered from the impurity particles is collected and transmitted via suitable optical elements (mirror, reflector, light guide) towards detector 720 of LIDAR Sensor System 10. In this example, detector 720 is configured such that during specific times (i.e. when the light beam 261 is extracted), the detector is active for a short measurement window of less than ca. 30 ns during which light scattered by impurity particles 710 may be detected. In a further embodiment, the optical element 610 might be placed inside LIDAR Sensor System 10 with the effect that the impurity detection system itself is protected from impurities. In this case, light beam 261 may transmit window 250 and is the scattered at impurity particles 710. Scattering light can be detected again using different detection setups (see above). In a further embodiment, light scattered from the light beam 260 (which is periodically scanned over sensor window 250) is used directly as detection signal for possible impurities. In this case, it is possible also to get information about the location of possible impurity particles.

It should be noted that in various embodiments as described with reference to FIG. 4 to FIG. 7, partial extracted light may be guided to emitter points of various embodiments as described with reference to FIG. 81 to FIG. 84. Thus, illustratively, the partial extracted light may serve as a light source.

In the following, various aspects of this disclosure will be illustrated:

Example 1y is a LIDAR Sensor System. The LIDAR Sensor

System may include:

at least one light source wherein the light source is configured to emit a light beam, at least one actuator wherein the actuator is configured to direct sensing light into a field of Illumination, at least one second sensing system including an optic and a detector wherein the optic and the detector are configured to receive a light beam scattered from an object, at least one optical element, arranged to receive at least partially the light beam emitted from the light source and/or directed by the actuator in order to supply the received light beam portion to an alternative light-based function and/or an additional light-based application.

In Example 2y, the subject matter of Example 1y can optionally include that the at least one optical element is arranged in the light beam path before or after being directed by the actuator.

In Example 3y, the subject matter of any one of Examples 1y or 2y can optionally include that the at least one optical element is arranged moveably.

In Example 4y, the subject matter of any one of Examples 1y to 3y can optionally include that the at least one optical element is formed in one piece or includes a plurality of elements.

In Example 5y, the subject matter of Example 4y can optionally include that the plurality of elements are arranged moveably towards each other.

In Example 6y, the subject matter of any one of Examples 1y to 5y can optionally include that the at least one optical element includes an optical mirror and/or an electrochromic mirror.

In Example 7y, the subject matter of any one of Examples 1y to 5y can optionally include that the at least one optical element includes a light guide and/or a light guide with a focusing lens.

In Example 8y, the subject matter of any one of Examples 1y to 5y can optionally include that the at least one optical element includes a reflector.

In Example 9y, the subject matter of any one of Examples 1y to 8y can optionally include that the at least one optical element includes a doping material to modify the optical properties of the at least partially received light beam.

In Example 10y, the subject matter of any one of Examples 1y to 9y can optionally include that the light beam emitted from the light source and/or directed by the actuator is at least partially extracted by the at least one optical element at a specific time interval and/or as a fraction of the beam intensity.

In Example 11y, the subject matter of Example 10y can optionally include that the time interval is predefined or adapted based on at least one input parameter of the LIDAR Sensor System.

In Example 12y, the subject matter of Example 10y can optionally include that the fraction of the beam intensity is predefined or adapted based on at least one input parameter of the LIDAR Sensor System.

In Example 13y, the subject matter of any one of Examples 1y to 12y can optionally include that the at least one actuator including a MEMS (Micro-Electro-Mechanical System) and/or optical phased array and/or scanning fiber.

In Example 14y, the subject matter of any one of Examples 1y to 13y can optionally include that the alternative light-based function and/or additional light-based application includes the generation of a reference signal for the LIDAR Sensor System and/or for an additional LIDAR Sensor System and/or a functional control system.

In Example 15y, the subject matter of any one of Examples 1y to 13y can optionally include that the alternative light-based function and/or additional light-based application includes a driver monitoring and/or a passenger monitoring and/or an occupancy-detection.

In Example 16y, the subject matter of any one of Examples 1y to 13y can optionally include that the alternative light-based function and/or additional light-based application includes a light-based communication with an internal and/or external communication device.

In Example 17y, the subject matter of any one of Examples 1y to 13y can optionally include that the alternative light-based function and/or additional light-based application include a usage of the at least partially extracted beam for an additional lidar sensor system.

In Example 18y, the subject matter of any one of Examples 1y to 5y can optionally include that the LIDAR Sensor System further includes a LIDAR Sensor System housing wherein the at least one optical element includes a reflecting structure at the LIDAR Sensor System housing.

In a LIDAR sensing device, the optical system placed in the receiving path is typically the largest element due to the requirements of the imaging and collection capabilities of the LIDAR sensor 52.

Various embodiments may improve the LIDAR sensor optical performance by replacing a conventional bulky, erroneous LIDAR lens system with a computationally optimized optics arrangement with flat so-called meta-surfaces. In addition, further LIDAR ranging system functionalities can be added to the system when using such meta-surfaces. Various embodiments can be envisioned, since the meta-surfaces allow creative, functionally improved and cost-effective designs.

An optical meta-surface may be understood as one or more sub-wavelength patterned layers that interact with light, thus providing the ability to alter certain light properties over a sub-wavelength thickness. A conventional optics arrangement relies on light refraction and propagation. An optical meta-surface offers a method of light manipulation based on scattering from small nanostructures or nano-waveguides. Such nanostructures or nano-waveguides may resonantly interact with the light thus altering certain light properties, such as phase, polarization and propagation of the light, thus allowing the forming of light waves with unprecedented accuracy. The size of the nanostructures or nano-waveguides is smaller than the wavelength of the light impinging on the optical meta-surface. The nanostructures or nano-waveguides are configured to alter the properties of the light impinging on the optical meta-surface. An optical meta-surface has similarities to frequency selective surfaces and high-contrast gratings. The nanostructures or nano-waveguides may have a size in the range from about 1 nm to about 100 nm, depending on structure shapes. They may provide a phase shift of the light up to two Tr. The microscopic surface structure is designed to achieve a desired macroscopic wavefront composition for light passing the structure. In various embodiments, the design of the optical meta-surface may be provided using so-called finite element methods. The respective individual nanostructure and/or nano-waveguides may have different lengths and/or different materials and/or different structures and/or different thicknesses and/or different orientations and/or different spacings between two nanostructures.

A conventional LIDAR receiving path optics arrangement may exhibit one or more of the following disadvantages:

- a LIDAR receiving path optics arrangement is usually large and heavy which is a disadvantage in terms of final product size (footprint, volume, weight) and which may have negative impacts also in terms of mechanical stability;
- a slow performance due to single pulse serial measurements; and
- an asymmetrical optics arrangement in order to limit aberration errors, which demands a costly design and manufacturing process of lenses.

Current LIDAR development efforts are using a classical optical concept, where thick lenses are used to image the field of view (FOV) of the LIDAR onto a photodetector, in other words, the LIDAR sensor 52. The lenses are unpolarized optics with a single focal length. In a time-of-flight system, a single light pulse at a single wavelength is emitted into the FOV and then collected by the optics arrangement and detected by the LIDAR sensor 52. The travel time of the echo pulse sets the duration of a single measurement and naturally limits the repetition rate of LIDAR measurements. Various system architectures may be employed to reach a desired resolution (number of individual distance measurements) of a LIDAR sensor, like flash LIDAR, line scan LIDAR, and point scan LIDAR. Additionally, only multiple echoes from the same object give a statistically significant distance measurement, which further constrains the number of achievable distance measurements with a single LIDAR sensor. A tradeoff between distance accuracy and measurement speed appears in all systems and considerable engineering effort is conducted to bypass these physical limits. The wavelength may be in the infrared (IR) range, e.g. in the near infrared range (NIR).

In order to still achieve the needed measurement accuracy and resolution, a hybrid LIDAR system between flash LIDAR and point scanning architectures may be designed. However, the usually needed large-area high-pixel count detectors and single beam LIDAR systems are utilized at the expense of complexity and system cost. Current LIDAR solutions are limited due to these reasons to resolutions of typically 256*64 pixels, far below what even the cheapest modern camera system can easily achieve.

In order to further increase the number of individual measurements, parallelization of measurements is desirable, where more than one laser pulse can be emitted at the same time into the FOV and detected independently.

Utilizing the physical properties "wavelength" and/or "polarization" of the emitted light, they usually cannot be accessed due to the optics of the sensor, which are inapt to discriminate between these properties.

In various embodiments, a LIDAR Sensor System is provided. The LIDAR Sensor System may include an optics arrangement located in the receiving path of the LIDAR Sensor System. The optics arrangement illustratively includes a carrier having at least one region being configured as a meta-surface.

In various embodiments, a "region" in the context of this disclosure may be understood to be a surface of an object or a layer, a portion of a surface of an object or a layer, an object, a layer, an intermediate layer within a layer structure having a plurality of layers, and the like.

In contrast to the above-mentioned traditional optics arrangement, a meta-surface can be designed to show transmission characteristics that are vastly different for different polarizations and wavelengths of incoming light. A meta-surface is a thin diffractive optical structure which is configured to manipulate the optical wavefront of incoming light at a sub-wavelength level. High-refractive index materials, like $TiO_2$, may be shaped into nanostructures or nano-waveguides that exhibit a resonance for only a single matching optical field. Only this part of the optical field couples to the nanostructure or nano-waveguides and is subsequently scattered into the direction of propagation. By using computer models for the optical response at a small scale, large-scale patterns of such nano-structures or nano-waveguides can be designed to exhibit a collective response for light with a matching property, like polarization, propagation direction, wavelength, angle of incidence, etc. The scattering strength and direction is spatially dependent, but also wavelength and polarization dependent. Traditional dielectric lenses were successfully replaced by such flat structures and even surpassed in optical imaging properties. Much more complex lenses have been designed that are capable of focusing light with different properties independently, e.g. left-circular polarized light shows a focus spot above the optical axis of the metasurface while right-circular polarized light shows a focus spot below the optical axis of the meta-surface. This allows for very complex functional optical elements, which may be provided in various embodiments. The feature to computationally design the shape and properties of such a surface allows for a variety of new LIDAR system architectures in accordance with various embodiments, which have increased performance compared to current solutions. The polarization may be linear or circular.

Typical design wavelengths are in the range from about 450 nm up to about 1100 nm, e.g. in the range from about 600 nm up to about 950 nm. This range is wide enough to support multiple laser wavelength regimes and also allows the usage of standard silicon detectors (e.g. silicon photo diodes). A design for a wavelength of about 1550 nm may require the use of different detector materials.

Various embodiments propose to use engineered, (highly) non-linear meta-surfaces to overcome the limits of being constraint to a single wavelength and polarization. The laser system may be capable of emitting light with multiple properties, either in polarization or wavelength, but also combinations thereof. The meta-surface of the carrier of an optics arrangement in the detector (receiving) path may be designed to show a matched response to the used laser sources. Several realizations of this are provided in various embodiments, but generally this combination adds functionality to the detector optics, that may improve the LIDAR sensor system.

Two use cases are considered in various embodiments:

Using the meta-surface as a classical detection optics:

The flat optics reduce the weight and cost of the optical components in a LIDAR device.

The flat optics can be designed to exceed the optical performance of traditional optics, in terms of optical aberrations and numerical aperture, thereby collecting more light with better imaging qualities, in a smaller assembly space.

Using meta-surfaces to add functionality to the sensor (receiving) path:

The added functionality may improve sensor performance and measurement precision by increasing the number of measurements through parallel illumination.

FIG. 76 shows a portion 7600 of a LIDAR Sensor System in accordance with various embodiments.

In various embodiments, a multi-wavelength/multi-polarization multi-focus flat optics arrangement is provided.

As shown in FIG. 76, the portion 7600 of a LIDAR Sensor System may include a first laser source 7602 and a second laser source 7604 which are configured to emit laser light with different wavelengths and/or different polarizations. In other words, the first laser source 7602 may be configured to emit first laser light 7606 having a first wavelength and/or a first polarization. The second laser source 7604 may be configured to emit second laser light 7608 having a second wavelength and/or a second polarization. The second wavelength may be different from the first wavelength and/or the second polarization may be different from the first polarization.

As shown in FIG. 76, the laser sources 7602 and 7604 may be tilted with respect to each other in such a way that the respective emissions of the laser light beams 7606, 7608 are directed by a beam steering unit 7610 into different angular sections of the FOV 7612 of the LIDAR Sensor System. In other words, the first laser source 7602 may be configured to have a first optical axis and the second laser source 7604 may be configured to have a second optical axis different from the first optical axis. An optical axis may be understood to represent a direction into which light is predominantly emitted. Thus, illustratively, the first optical axis and the second optical axis enclose an angle $\alpha$ (e.g. of less than 90°, e.g in the range from about 5° to about 80°, e.g in the range from about 15° to about 70°, e.g in the range from about 25° to about 60°, e.g in the range from about 35° to about 50°).

In case of the two lasers sources 7602 and 7604, the tilting angle may be chosen such that each of the laser light emissions covers half of the horizontal FOV 7612 during the scanning process, i.e. each laser light beam 7606, 7608 scans half of the FOV (e.g. the emission of the first laser light beam 7606 may cover a first half of the horizontal FOV 7612 and the emission of the second laser light beam 7608 may cover a second half of the horizontal FOV 7612, so that the entire FOV 7612 is covered). The first laser source 7602 may be configured to emit a first laser beam 7606 having a first wavelength and/or a first polarization. The second laser source 7604 may be configured to emit a second laser beam 7608 having a second wavelength and/or a second polarization. The second wavelength may be different from the first wavelength and/or the second polarization may be different from the first polarization. In various embodiments, the second polarization may be orthogonal to the first polarisation. The beam steering system 7610 may be provided to scan the first laser beam 7606 and the second laser beam 7608 from the laser sources 7602, 7604 into the FOV 7612. A first scanned laser beam 7614 (e.g. scanned into a first half of the FOV 7612) including first laser pulses may be reflected by a first object 7616 as a first reflected laser beam 7618. A second scanned laser beam 7620 (e.g. scanned into a second half of the FOV 7612) including second laser pulses may be reflected by a second object 7622 as a second reflected laser beam 7624. The laser sources 7602 and 7604 and the beam steering system 7610 may be part of the First LIDAR Sensing System 40. The first reflected laser beam 7618 and the second reflected laser beam 7624 are received by the optics arrangements of the receiver path of the LIDAR Sensor System 10, in other words by the Second LIDAR Sensing System 50.

The Second LIDAR Sensing System 50 may include an optional collection lens 7626 (either classical optic or meta-surface) configured to collimate light coming from the FOV 7612 onto an optical component 7628 (as an example of a carrier) which may have one or more surface regions (which are in the receiving light path) configured as one or more nanostructure regions, each nanostructure region including a plurality of nanostructures or nano-waveguides provided on at least one side of the carrier. The size of the nanostructures or nano-waveguides is smaller than the wavelength of light emitted by the first light source and smaller than the wavelength of light emitted by the second light source. The nanostructures or nano-waveguides are configured to alter the properties of the light emitted by the light sources. By way of example, the optical component 7628 may have one or more surface regions (which are in the receiving light path) configured as one or more meta-surfaces. In various embodiments, the optical component 7628 may have one or more surface regions (which are in the receiving light path) configured as a dual focus meta surface, which focusses the light echoes wavelength-dependent and/or polarization-dependent onto each one of a first sensor 7630 and a second sensor 7632. Alternatively, the optical component 7628 having one or more (e.g. multi-focus) meta-surface may be configured to focus the light echoes polarization-dependent onto each one of the first sensor 7630 and the second sensor 7632.

In various embodiments, more than two tilted laser sources 7602, 7604 may be provided. The respective tilt angles could vary dependent on system setup and the desired coverage of a specific FOV 7612 with a certain wavelength and/or polarization laser beam or any other beam characteristic (like beam intensity). This means that the individual tilt angles must not be (but may be) equal. In various embodiments, more than two detectors may be provided.

A meta-surface optics arrangement with separate foci for separate wavelengths and/or polarizations may be provided. This may allow the usage of two laser sources 7602, 7604 with different wavelengths, which scan the FOV 7612 at the same time. The measurement time of a LIDAR system may be decreased by a factor of the respective number of laser sources 7602, 7604 used, since two (or more, respectively) distance measurements can be conducted at the same time as a normal LIDAR system.

Alternatively, there might be an adjustable and/or stochastically varied time difference between the emissions of the two laser sources 7602, 7604 which can be used for example for an alternating read out of the respective sensors 7630, 7632 (using the same read out and signal processing devices such as TIA, ADC, TDC (Time-to-Digital Converter), etc.

In such an arrangement, the scene can be scanned by two (or more) laser beams 7606, 7608 simultaneously, which decreases the measurement time of a full scan, which can be either used to increase the frame rate of a LIDAR scan or the precision by using the time gain for additional averaging. For example, in this case, two laser sources 7602, 7604 with 100 kHz repetition rate each can be used in parallel, each covering half of the total FOV 7612. Whereas in a conventional configuration, a single laser had to cover the full FOV 7612 with a certain averaging over each pixel, now half of the FOV 7612 needs to be completed in the same time. The gained time can be used to increase resolution, frame rate or averaging/precision.

FIG. 77 shows a portion 7700 of a LIDAR Sensor System in accordance with various embodiments.

In various embodiments, as shown in FIG. 77, the laser sources 7602, 7604 may be configured to generate laser light beams 7606, 7608 in the emitting path that are directed to one or more dichroic mirrors 7702 or polarized beam splitters (PBS), such that the two laser light beams 7602, 7604 will be emitted into the FOV 7612 as two parallel and at least partially overlapping laser light beams 7704, 7706. In other words, the two parallel laser light beams 7704, 7706 are predominantly emitted into the same direction, i.e. follow the same path and hit the same target (not shown in FIG. 77). The collection optics and the meta-surface in the receiving path would then split the respective echoes onto the sensors. Two independent measurements can be extracted from this in the same time span of a single laser pulse.

The detected echoes may then be used to increase the SNR by averaging the measurements, which again may increase the measurement time/frame rate of the LIDAR. Furthermore, it may be provided to employ wavelengths which are optimized for different environmental conditions, such as for example atmospheric or weather conditions. A wavelength in the range from about 850 nm to about 1000 nm shows only little atmospheric interactions in case of adverse weather conditions (rain, snow, fog), whereas a wavelength in the range from about 1200 nm to about 1600 nm shows more intense interactions in case of adverse weather conditions (rain, snow, fog).

FIG. 78 shows a portion 7800 of a LIDAR Sensor System in accordance with various embodiments.

In various embodiments, an angle-convergent multi-layer collection lens is provided.

In various embodiments, the meta-surface provided on one or more surfaces (e.g. on two opposing surfaces) of an optical component of the Second LIDAR Sensing System 50 (in other words of an optical component in the receiver path of the LIDAR Sensor System 10) is provided to collect the echoes (reflected laser beam(s)) from a wide FOV 7612 onto a LIDAR sensor 52 with a small size for example with respect to a horizontal direction (in case of a typical LIDAR system for automotive applications with a wide FOV 7612 in horizontal direction).

In case of a LIDAR system with conventional optics arrangements and an FOV 7612 of e.g. 12° in vertical direction and 60° in horizontal direction, typical sensor elements may have a size of 0.3 mm in vertical direction and 2.5 mm in horizontal direction, i.e. exhibiting a large aspect ratio of 8,33. In case of an angle-convergent multi-layer collection lens, the FOV 7612 may be focussed on a sensor element 52 with a much smaller aspect ratio, e.g at least smaller than 5, down to an aspect ratio of 1, e.g. a quadratic sensor element 52. This may allow for a smaller sensor and may avoid the loss of optical efficiency in the corners of the FOV 7612. Such a meta lens can be designed by providing a first surface of an optical component and a second surface of the optical component (opposite to the first surface) as a meta-surface.

As shown in FIG. 78, which only shows one laser source, e.g. the first laser source 7602 is configured to emit the first laser beam 7606 directed onto a beam steering device 7802. The deflected laser beam 7804 exits the First LIDAR Sensing System 40 and enters the FOV 7612 and sensing region 7812 of a meta-lens 7812 and hit a target object 7806 located therein. The echoes from the target object 7806 (in other words a reflected laser beam 7808) may be collected by the meta-lens 7812 (e.g. an optical component having a carrier, two opposing surfaces of which are configured as meta-surfaces) onto a small sensor area 7814 of the sensor 52. The size of the sensor 52 can be reduced, which may improve the response time and sensitivity of the sensor 52.

A meta-lens 7812 for various embodiments may exhibit more than one layer with meta-material structures, e.g. it may exhibit more than two layers, e.g. more than three layers, e.g. in the range from about three layers to about five layers. With such a configuration it is possible to focus echo light which comes from different incident angular segments onto the same focus point.

FIG. 79 shows a setup 7900 of a dual lens with two meta-surfaces in accordance with various embodiments.

In various embodiments, a double-sided meta-lens 7902 is provided to change the FOV of a single detector for different light rays (e.g. different laser beams).

The double-sided meta-lens 7902 may include an (optically transparent or translucent) carrier 7904, a first surface 7906 of which being configured as a first meta-surface 7906, and a second surface 7908 of which being configured as a second meta-surface 7908. The second surface 7908 is opposite the first surface 7906. The second surface 7908 and the first surface 7906 are both in the light path of the received light rays (e.g. received laser beam(s)). The first meta-surface 7906 is configured to diffract light of different character (e.g. with respect to wavelength and/or polarization) convergently and divergently towards the second meta-surface 7908. By way of example, first received light rays 7910 having a first wavelength and a first polarization are diffracted by the first meta-surface 7906 by a first diffraction angle into a direction away from a single focal point 7916 of a single focal plane 7914 to form first diffracted light rays 7918 within the carrier 7904. Furthermore, second received light rays 7912 having a second wavelength and a second polarization are diffracted by the first meta-surface 7906 by a second diffraction angle into a direction towards the single focal point 7916 of the focal plane 7914 to form second diffracted light rays 7920 within the carrier 7904. The first and second diffracted light rays 7918, 7920 are transmitted from the first meta-surface 7906 through the carrier 7904 and finally towards the second meta-surface 7908.

The second meta-surface 7908 is configured to diffract light of different character (e.g. wavelength, polarization) convergently and divergently towards the single focal point 7916 of the focal plane 7914. By way of example, the first diffracted light rays 7918 hitting the second meta-surface 7908 from inside the carrier 7904 are diffracted by the second meta-surface 7908 by a third diffraction angle into a direction towards the single focal point 7916 of the focal plane 7914 to form third diffracted light rays 7922 outside the carrier 7904. Furthermore, the second diffracted light rays 7920 hitting the second meta-surface 7908 from inside the carrier 7904 are diffracted by the second meta-surface 7908 by a fourth diffraction angle into a direction towards the single focal point 7916 of the focal plane 7914 to form fourth diffracted light rays 7924 outside the carrier 7904.

In other words, at the second surface 7908, light is diffracted and collimated into a single focal plane. Illustratively, the first meta-surface 7906 forms a first optical lens and the second meta-surface 7908 forms a second optical lens with an optical axis 7936. In the example of FIG. 79, the first meta-surface 7906 is configured to diffract light with a first optical property (e.g. first wavelength and/or first polarization) in a divergent manner (with respect to the optical axis 7936) towards the second meta-surface 7908 and to diffract light with a second optical property (e.g. second wavelength and/or second polarization) in a convergent manner (with respect to the optical axis 7936) towards the second meta-surface 7906. The second meta-surface 7908 is configured to collimate light with both optical properties (first optical property and second optical property) towards the same focal plane 7914, and even towards the same single focal point 7916.

FIG. 79 further shows an entry aperture D 7928 for the incoming light rays 7910 and 7912. A Graph 7930 shows a top-half cross-section of such a Dual Focus Lens, extending along z-direction 7932 and x-direction 7934. Along the z-direction 7932, the meta-material structures of the first meta-surface 7906 may be extended only to the point D/2, whereas the meta-material structures of the second meta-surface 7908 may be extended beyond the point D/2. Based on the above described embodiments, light of the two different light (laser) sources 7602, 7604 may therefore be imaged is with a different magnification onto the sensor 52 which allows for selective zooming. This could be used to dynamically switch the FOV 7612 of the sensor 52 between different magnifications by selectively operating the light (laser) sources 7602, 7604.

Various embodiments may thus be used to achieve a zoom effect, since different wavelengths may be provided to achieve different FOVs. It is to be noted that in order to be able to use the same base material for the sensor 52 (for Si or GaAs), the wavelengths of the light emitted by the light sources (e.g. light sources 7602, 7604) should not differ too much. By way of example, the first light source 7602 may be configured to emit (laser) light having a wavelength of about 900 nm and the second light source 7604 may be configured to emit (laser) light having a wavelength of about 800 nm.

FIG. 80 shows a portion 8000 of a LIDAR Sensor System in accordance with various embodiments.

FIG. 80 shows the LIDAR Sensor System with the first laser source 7602 with first optical properties (e.g. the first wavelength and the first polarization) and the second laser source 7604 with second optical property (e.g. the second wavelength and the second polarization). The emission (i.e. the first laser beam 7606 and the second laser beam 7608) of both laser sources 7602, 7604 may be spatially overlapped, e.g. using a technique as shown in FIG. 77. Alternatively, the laser sources 7602, 7604 may also be tilted with respect to each other.

As shown in FIG. 80, the laser sources 7602 and 7604 are scanning the FOV 7612, where only one laser source (e.g. the first laser source 7602) of the two laser sources 7602, 7604 is activated and the other laser source of the two laser sources 7602, 7604 is muted. One laser beam 8002, 8004 of the first laser beam 7606 and the second laser beam 7608 is reflected towards the object 7806 and the echo (reflected laser beam 8006, 8008) is collected by the dual FOV meta-lens 7910, such that a large FOV (denoted by the dashed first lines 7810 in FIG. 80 and corresponding to the light rays having the first optical property in FIG. 79) is imaged on the sensor 52.

In various embodiments, the second laser source 7604 may be switched on while the first laser 7602 is switched off and a smaller FOV (denoted by second lines 8010 in FIG. 80, and corresponding to the light rays having the second optical property in FIG. 79) is imaged in this case on the same sensor 52 using the same sensor area. This allows for zooming effects, i.e. the smaller FOV (grey lines) are imaged with a larger magnification.

In various embodiments, the scanning process may be unchanged for both laser sources 7602, 7604, i.e. the FOV has the same angular width in both cases. Alternatively, the scanning process may be reduced by reducing the scanning angle of the second laser source 7604 in case of the first laser source 7602 having the first optical property in the above example. The collection optics arrangement images inherently a smaller FOV and the target object 7806 is imaged larger on the LIDAR sensor 52.

It is to be noted that the nanostructure region or the metasurface does not necessarily need to be provided at an exposed surface. There may also be provided a multi-layer structure, in which the nanostructure region or the meta-surface is provided at an interface between two layers of the multi-layer structure. This may of course be combined with an additional nanostructure region or meta-surface provided at an exposed surface of the multi-layer structure.

Furthermore, in various embodiments, there may be an additional optics arrangement including a carrier and at least one nanostructure region or a meta-surface in the transmitter path of the LIDAR Sensor System 10, i.e. for example in the first LIDAR Sensor System 40. The additional optics arrangement may be arranged in front of the beam steering device or beam steering component, such as 7802. Moreover, even the beam steering device or beam steering component may include at least one nanostructure region or a meta-surface.

Furthermore, it is to be mentioned that the embodiments described in association with FIG. 76 and the embodiments described in association with FIG. 78 may be combined with each other.

Downstream connected to the sensor 52 or to each sensor 7632, 7630 of the plurality of sensors, there may be provided an amplifier (e.g. a transimpedance amplifier) configured to amplify a signal provided by the one or more sensors. Further downstream connected, there may be provided an analog-to-digital converter (ADC) and/or a time-to-digital converter (TDC).

In the following, various aspects of this disclosure will be illustrated:

Example 1j is a LIDAR Sensor System. The LIDAR Sensor System may include a first light source and a second light source, and an optics arrangement located in the receiving path of the LIDAR Sensor System. The optics arrangement includes a carrier and at least one nanostructure region including a plurality of nanostructures or nano-waveguides provided on at least one side of the carrier. The size of the nanostructures or nano-waveguides is smaller than the wavelength of light emitted by the first light source and smaller than the wavelength of light emitted by the second light source. The nanostructures or nano-waveguides are configured to alter the properties of the light emitted by the light sources.

In Example 2j, the subject matter of Example 1j can optionally include that the nanostructures or nano-waveguides are configured to alter the properties of the light emitted by the light sources by exhibiting a resonance with light emitted by the first light source and/or with light emitted by the second light source and/or by exhibiting waveguiding effects for both sources.

In Example 3j, the subject matter of any one of Examples 1j or 2j can optionally include that the at least one nanostructure region forms at least one meta-surface provided on at least one side of the carrier. It is to be noted that a meta-surface may be provided or used for a transmission scenario as well as a reflection scenario (in other words, a meta-surface may exhibit a resonance with light or may transmit light with a predefined specific characteristic).

In Example 4j, the subject matter of any one of Examples 1j to 3j can optionally include that the LIDAR Sensor System further includes at least one sensor. The plurality of nanostructures or nano-waveguides are configured to deflect light emitted by the first light source into the direction of the at least one sensor.

In Example 5j, the subject matter of Example 4j can optionally include that the at least one sensor includes a first sensor and a second sensor. The plurality of nanostructures or nano-waveguides are configured to deflect light emitted by the first light source into the direction of the first sensor. The plurality of nanostructures or nano-waveguides are configured to deflect light emitted by the second light source into the direction of the second sensor.

In Example 6j, the subject matter of any one of Examples 1j to 5j can optionally include that the LIDAR Sensor System further includes a light source controller configured to control the first light source and the second light source to emit light during different time periods.

In Example 7j, the subject matter of any one of Examples 1j to 5j can optionally include that the LIDAR Sensor System further includes a light source controller configured to control the first light source and the second light source to emit light during at least partially overlapping time periods.

In Example 8j, the subject matter of any one of Examples 1j to 7j can optionally include that the LIDAR Sensor System further includes a collecting optics arrangement positioned upstream of the optics arrangement and configured to deflect received light into the direction of the optics arrangement.

In Example 9j, the subject matter of any one of Examples 1j to 8j can optionally include that the first light source includes at least a first laser source and/or that the second light source includes at least a second laser source.

In Example 10j, the subject matter of any one of Examples 1j to 9j can optionally include that the first light source and the second light source are configured to emit light of different wavelengths and/or different polarizations.

In Example 11j, the subject matter of any one of Examples 1j to 10j can optionally include that the first light source having a first optical axis and the second light source having a second optical axis are tilted with respect to each other so that the first optical axis and the second optical axis are non-parallel to each other.

In Example 12j, the subject matter of any one of Examples 1j to 10j can optionally include that the first light source and the second light source are configured to emit light in directions which are substantially parallel to each other. The LIDAR Sensor System includes a beam steering component configured to deflect light from the first light source into a first direction and to deflect light from the second light source into a second direction different from the first direction.

In Example 13j, the subject matter of any one of Examples 1j to 12j can optionally include that a further optics arrangement located in the transmitting path of the LIDAR Sensor System, wherein the optics arrangement includes a carrier and at least one nanostructure region including a plurality of nanostructures or nano-waveguides provided on at least one side of the carrier, the size of the nanostructures or nano-waveguides being smaller than the wavelength of light emitted by the first light source and smaller than the wavelength of light emitted by the second light source, and wherein the nanostructures or nano-waveguides are configured to alter the properties of the light emitted by the light sources.

In Example 14j, the subject matter of any one of Examples 4j to 13j can optionally include that the at least one sensor includes a plurality of photo diodes.

In Example 15j, the subject matter of Example 14j can optionally include that at least some photo diodes of the plurality of photo diodes are avalanche photo diodes.

In Example 16j, the subject matter of Example 15j can optionally include that at least some avalanche photo diodes of the plurality of photo diodes are single-photon avalanche photo diodes. In various embodiments, the plurality of photo diodes may include a silicon photo multiplier (SiPM). As another alternative, the sensor may include multi-pixel photon counters (MPPC), one or more charge-coupled devices (CCD). Moreover, the photo diodes may be implemented using CMOS (complementary metal oxide semiconductor) technology.

In Example 17j, the subject matter of any one of Examples 14j to 16j can optionally include that the LIDAR Sensor System further includes an amplifier configured to amplify a signal provided by the plurality of photo diodes.

In Example 18j, the subject matter of Example 17j can optionally include that the amplifier is a transimpedance amplifier.

In Example 19j, the subject matter of any one of Examples 17j or 18j can optionally include that the LIDAR Sensor System further includes an analog-to-digital converter coupled downstream to the amplifier to convert an analog signal provided by the amplifier into a digitized signal. Furthermore, the LIDAR Sensor System may further include a time-to-digital converter coupled downstream to the amplifier to convert a analog pulse edge signal provided by the amplifier into a digital timer value.

In Example 20j, the subject matter of any one of Examples 17j to 19j can optionally include that the LIDAR Sensor System further includes a time-to-digital converter coupled downstream to the amplifier to convert an analog pulse edge signal provided by the amplifier into a digital time value.

In Example 21j, the subject matter of any one of Examples 1j to 20j can optionally include that the LIDAR Sensor System further includes a scanning mirror arrangement configured to scan a scene.

Example 22j is a LIDAR Sensor System. The LIDAR Sensor System may include at least one light source and an optics arrangement located in the receiving path of the LIDAR Sensor System. The optics arrangement includes a carrier and at least a first nanostructure region and a second nanostructure region provided on at least one side of the carrier, each nanostructure region including a plurality of nanostructures or nano-waveguides, the size of the nanostructures or nano-waveguides being smaller than the wavelength of light emitted by the light source. The nanostructures or nano-waveguides are configured to exhibit a resonance with light emitted by the light source.

In Example 23j, the subject matter of Example 22j can optionally include that the first nanostructure region forms a first meta-surface. The second nanostructure region forms a second meta-surface.

In Example 24j, the subject matter of any one of Examples 22j or 23j can optionally include that the first nanostructure region and the second nanostructure region are provided on the same side of the carrier.

In Example 25j, the subject matter of any one of Examples 22j to 24j can optionally include that the LIDAR Sensor System further includes at least one sensor. The first nanostructure region is configured to deflect light received via a first receiving angle into the direction of the at least one sensor. The second nanostructure region is configured to deflect light received via a second receiving angle different from the first receiving angle into the direction of the at least one sensor.

In Example 26j, the subject matter of any one of Examples 22j or 23j can optionally include that the first nanostructure region and the second nanostructure region are provided on different sides of the carrier. In this context, it is to be noted that the entire structure formed inter alia by the first nanostructure region and the second nanostructure region provides a first focal point for the first light source. At the same time, the entire structure formed inter alia by the first nanostructure region and the second nanostructure region provides a second focal point, which may be different from the first focal point, for the first light source.

In Example 27j, the subject matter of Example 26j can optionally include that the LIDAR Sensor System further includes at least one sensor. The first nanostructure region is configured to deflect light of a first wavelength and/or a first polarization into the direction of the at least one sensor and to deflect light of a second wavelength different from the first wavelength and/or a second polarization different from the first polarization into another direction away from the at least one sensor. The second nanostructure region is configured to deflect light of the second wavelength and/or the second polarization into the direction of the at least one sensor.

In Example 28j, the subject matter of Example 27j can optionally include that the first nanostructure region is configured to deflect light of a first wavelength and/or a first polarization towards an optical axis which is perpendicular to a surface of the at least one sensor and to deflect light of a second wavelength different from the first wavelength and/or a second polarization different from the first polarization away from the optical axis which is perpendicular to the surface of the at least one sensor.

In Example 29j, the subject matter of Example 28j can optionally include that the first nanostructure region is configured to deflect light of the first wavelength and/or the first polarization to a predefined first focal point. The second nanostructure region is configured to deflect light of the second wavelength and/or the second polarization to a predefined second focal point.

In Example 30j, the subject matter of any one of Examples 22j or 29j can optionally include that the at least one light source includes a first light source configured to emit light of the first wavelength and/or the first polarization and a second light source configured to emit light of the second wavelength and/or the second polarization.

In Example 31j, the subject matter of Example 30j can optionally include that the LIDAR Sensor System further includes a light source controller configured to control the first light source and the second light source to emit light during different time periods.

In Example 32j, the subject matter of any one of Examples 30j or 31j can optionally include that the first light source includes at least a first laser source and/or wherein the second light source includes at least a second laser source.

In Example 33j, the subject matter of any one of Examples 30j to 32j can optionally include that the first light source and the second light source are tilted with respect to each other so that they are configured to emit light at different angles.

In Example 34j, the subject matter of any one of Examples 30j to 32j can optionally include that the first light source and the second light source are configured to emit light in directions which are parallel with each other. The LIDAR Sensor System includes a beam steering component configured to deflect light from the first light source into a first direction and to deflect light from the second light source into a second direction different from the first direction.

In Example 35j, the subject matter of any one of Examples 27j to 34j can optionally include that the at least one sensor includes a plurality of photo diodes.

In Example 36j, the subject matter of Example 35j can optionally include that at least some photo diodes of the plurality of photo diodes are avalanche photo diodes.

In Example 37j, the subject matter of Example 36j can optionally include that at least some avalanche photo diodes of the plurality of photo diodes are single-photon avalanche photo diodes.

In Example 38j, the subject matter of any one of Examples 35j to 37j can optionally include that the LIDAR Sensor System further includes an amplifier configured to amplify a signal provided by the plurality of photo diodes.

In Example 39j, the subject matter of Example 38j can optionally include that the amplifier is a transimpedance amplifier.

In Example 40j, the subject matter of any one of Examples 38j or 39j can optionally include that the LIDAR Sensor System further includes an analog-to-digital converter coupled downstream to the amplifier to convert an analog signal provided by the amplifier into a digitized signal. Furthermore, the LIDAR Sensor System may further include a time-to-digital converter coupled downstream to the amplifier to convert a analog pulse edge signal provided by the amplifier into a digital timer value.

In Example 41j, the subject matter of any one of Examples 38j to 40j can optionally include that the LIDAR Sensor System further includes a time-to-digital converter coupled downstream to the amplifier to convert an analog pulse edge signal provided by the amplifier into a digital time value.

In Example 42j, the subject matter of any one of Examples 22j to 41j can optionally include that the LIDAR Sensor System further includes a scanning mirror arrangement configured to scan a scene.

Example 43j is a LIDAR Sensor System. The LIDAR Sensor System may include a light source and an optics arrangement located in the receiving path of the LIDAR Sensor System. The optics arrangement includes a carrier and at least a nanostructure region provided on at least one side of the carrier, each nanostructure region including a plurality of nanostructures or nano-waveguides, the size of the nanostructures or nano-waveguides being smaller than the wavelength of light emitted by the light source. The nanostructures or nano-waveguides are configured to exhibit a resonance with light emitted by the light source.

Example 44j is a method of operating a LIDAR Sensor System of any one of Examples 1j to 21j. The method may include controlling the first light source and the second light source to emit light at different time periods.

Example 45j is a method of operating a LIDAR Sensor System of any one of Examples 1j to 21j. The method may include controlling the first light source and the second light source to emit light at at least partially overlapping time periods.

Example 46j is a method of operating a LIDAR Sensor System of any one of Examples 31j to 42j. The method may include controlling the first light source and the second light source to emit light at different time periods.

Example 47j is a computer program product, which may include a plurality of program instructions that may be embodied in non-transitory computer readable medium, which when executed by a computer program device of a LIDAR Sensor System according to any one of Examples 1j to 21j, cause the LIDAR Sensor System to execute the method according to any one of the Examples 44j or 45j.

Example 48j is a computer program product, which may include a plurality of program instructions that may be embodied in non-transitory computer readable medium, which when executed by a computer program device of a LIDAR Sensor System according to any one of Examples 31j to 42j, cause the LIDAR Sensor System to execute the method according to Example 46j.

Example 49j is a data storage device with a computer program that may be embodied in non-transitory computer readable medium, adapted to execute at least one of a method for a LIDAR Sensor System according to any one of the above method Examples, a LIDAR Sensor System according to any one of the above LIDAR Sensor System Examples.

In a conventional (e.g., scanning) LIDAR system, a scanning mirror (e.g., a 1D MEMS mirror) may be combined with a sensor array (e.g., a 1D sensor array, such as a column sensor). It may be desirable for a sensor of the LIDAR system (e.g., the sensor 52) to have a large field of view (e.g., 60° or more than 60° in the scanning direction, e.g. in the horizontal direction), high resolution (e.g., 0.1° or 0.05° in the horizontal direction and/or in the vertical direction) and long range (e.g., at least 100 m or at least 200 m). In case that a sensor has a large field of view and high resolution in the horizontal direction, the individual sensor pixels may have a proportionally large extension in the horizontal direction (e.g., greater than in the vertical direction, for example 5 times greater or 10 times greater). By way of example, a pixel may have a dimension along the vertical direction (e.g., a height) of about 0.2 mm, and a dimension along the horizontal direction (e.g., a width) of about 2.5 mm.

During the scanning process, the laser spot (or the laser line) that is reflected by an object and captured (in other words, received) by the sensor may move over the sensor pixel(s) along the same direction along which the laser spot is scanned (e.g., along the horizontal direction). Accordingly, only a small sensor surface (in other words, a small sensor area) of an individual sensor pixel may be effectively used for each spatially resolved time-of-flight measurement, thus leading to an insufficient (e.g., low) Signal-to-Noise Ratio (SNR). Illustratively, for a fixed (e.g., horizontal) solid angle range only a small portion of the sensor surface may be used (e.g., illuminated by the reflected LIDAR light), while the remaining sensor surface may collect ambient light or stray light (e.g., light coming from system-external light sources, such as, for example, sunlight or LIDAR light from other vehicles). Moreover, a large and thus expensive sensor may be required. Illustratively, a large sensor may be required for imaging a large field of view (e.g., light coming from different directions may impinge at different positions on the sensor), but for each angle the sensor may be poorly (e.g., only partially) illuminated. In addition, above a certain sensor pixel size the capacitance may become too high, and as a consequence the speed of the measurement may be reduced and the crosstalk between adjacent sensor pixels may become worse.

A possible solution to improve the above-mentioned situation may be to provide a rotating LIDAR system. In a rotating LIDAR system the light emitter(s) (e.g., the laser emitter) and the light receiver(s) (e.g., the sensor) may be arranged on a common platform (e.g., a common movable support), which may typically rotate 360°. In such a system, the light receiver sees (in other words, faces) at each time point the same direction into which the light emitter has emitted light (e.g., LIDAR light). Therefore, the sensor always detects at one time instant only a small horizontal solid angle range. This may reduce or prevent the above-described problem. The same may be true for a system in which the detected light is captured by means of a movable mirror (e.g., an additional MEMS mirror in the receiver path) or another similar (e.g., movable) component. However, a rotating LIDAR system and/or a system including an additional movable mirror require movable components (e.g., movable portions). This may increase the complexity, the susceptibility to mechanical instabilities and the cost of the system.

Another possible solution may be to provide a receiver optics arrangement for a LIDAR system as described, for example, in relation to FIG. 98 to FIG. 102B.

Various embodiments may be based on separating the ambient light or stray light (e.g., noise light) from the useful light. The useful light may be understood as the light signal (e.g., LIDAR light) emitted by the system and reflected back towards the system (e.g., by an object in the field of view of the system). One or more components may be provided that are configured to detect the light signal and to discard the ambient light or stray light. Illustratively, one or more components may be provided and configured such that a (e.g., detection) signal is generated (e.g., a time-of-flight may be determined) in case that the (e.g., reflected or scattered) light signal impinges on a sensor of the LIDAR system, and no signal is generated in case that ambient light or stray light impinges on the sensor.

In various embodiments, the sensor may include one or more sensor pixels (e.g., a plurality of sensor pixels). A first sensor pixel (e.g. a first photo diode associated with the first sensor pixel) may be arranged at a distance from a second sensor pixel (e.g. a second photo diode associated with the second sensor pixel). The light signal reflected (or scattered) from an object may travel a first distance to impinge onto the first sensor pixel and a second distance to impinge onto the second sensor pixel. Illustratively, the first sensor pixel and the second sensor pixel may each receive a portion of the light reflected (or scattered) from an object. Consequently, it may take a first time for the light signal to travel from the object to the first sensor pixel and a second time to travel from the object to the second sensor pixel. For each emission angle different from 0°, the first distance may be different from the second distance (e.g., greater or smaller, depending on the emission angle). Thus, also the first time may be different from the second time (e.g., longer or shorter, depending on the emission angle). There may be a time difference between the reception of the light signal at the first sensor pixel and the reception of the light signal at the second sensor pixel (e.g., there may be a time difference between a first signal generated by the first sensor pixel and a second signal generated by the second sensor pixel). The first sensor pixel may be arranged at a distance from the second sensor pixel in a first direction (e.g., the horizontal direction).

The sensor may include one or more sensors, e.g. one or more sub-sensors. A sub-sensor may include one or more sensor pixels. A sub-sensor may be a one-dimensional sensor array (e.g., a sub-sensor may include one or more sensor pixels arranged along a single line, such as a column of sensor pixels). Alternatively, a sub-sensor may be a two-dimensional sensor array (e.g., a sub-sensor may include a plurality of sensor pixels arranged in a matrix configuration, e.g. in one or more rows and one or more columns). A first sub-sensor may include the first sensor pixel and a second sub-sensor may include the second sensor pixel. Illustratively, the first sensor is pixel and the second sensor pixel may be arranged in the same position within the respective sub-sensor (e.g., in the same position within the respective one-dimensional array or two-dimensional array). A distance between the first sensor pixel and the second sensor pixel may be understood as a distance between the first sub-sensor and the second sub-sensor.

The first sub-sensor may be arranged at a distance from the second sub-sensor in the first direction. The first sub-sensor may include a plurality of first sensor pixels. The second sub-sensor may include a plurality of second sensor pixels. The plurality of first sensor pixels may be arranged along a second direction, different from the first direction (e.g., along the vertical direction). The plurality of second sensor pixels may be arranged along the second direction. Each sensor pixel of the first plurality of sensor pixels may be arranged at a distance from a respective second sensor pixel of the plurality of second sensor pixels. The distance may be the same for each pair of sensor pixels. Alternatively, the distance may be different for different pairs of sensor pixels.

Alternatively, the first sensor pixel and the second sensor pixel may be arranged in a same (e.g., 1D- or 2D-) sensor array (for example, in a same sub sensor). The first sensor pixel and the second sensor pixel may be arranged at a distance within the sensor array. By way of example, the first sensor pixel and the second sensor pixel may be arranged in different columns (or rows) of the sensor array.

In various embodiments, the emission angle may be known (or determined). The emission angle may be described, for example, as the angle between the direction into which light is emitted (e.g., the direction into which one or more individual light pulses are emitted, such as one or more individual laser pulses) and the optical axis of the LIDAR system (e.g., of the scanning LIDAR system). The emission angle may be determined with respect to a predetermined direction (e.g., the horizontal direction or the vertical direction).

A circuit (e.g., a pixel signal selection circuit) may be provided. The circuit may be configured to determine the time difference between a first signal generated by the first sensor pixel and a second signal generated by the second sensor pixel. The circuit may be configured to classify the signals as “authentic” or “relevant” (e.g., as LIDAR signals, e.g. as non-noise signals). The classification may be based on verifying whether the time difference fulfills a predefined criterion (e.g., a predefined coincidence criterion). The predefined criterion may be dependent on the current emission angle. The circuit may be configured to classify the signals as “authentic” in case that the time difference is in agreement with the current emission angle (e.g., in case that the time difference is in a predetermined relationship with the current emission angle). Illustratively, the circuit may be configured to determine whether the first signal and the second signal have been generated due to LIDAR light impinging onto the first sensor pixel and onto the second sensor pixel, based on the time difference between the first signal and the second signal. In case that the time difference fulfills the predefined criterion, the circuit may be configured to determine that the first signal and the second signal have been generated due to LIDAR light, e.g. due to the light signal (e.g. due to LIDAR light emitted by the system and reflected back towards the system). By way of example, in case the time difference fulfills the predefined criterion, the circuit may be configured to determine that the first signal and the second signal have been generated due to LIDAR light emitted by a vehicles own First LIDAR Sensing system. Illustratively, the circuit may be configured to distinguish between system-emitted LIDAR light and externally-emitted LIDAR light (e.g., LIDAR light emitted from another system, for example from another vehicle), based on the fulfillment of the coincidence criterion. In case that the time difference does not fulfill the predefined criterion, the circuit may be configured to determine that the first signal and/or the second signal is/are noise signal(s).

The time difference may be independent or essentially independent from the distance between the object and the LIDAR system. This may be true in case that such distance is significantly large (e.g., larger than 50 cm, larger than 1 m, larger than 5 m, or larger than 20 m). By way of example, this may be true in case that such distance is greater than the distance between the first sensor pixel and the second sensor pixel (e.g., more than 5 times greater, for example more than 10 times greater, for example more than 100 times greater). By way of example, this may be true in case that the LIDAR system is mounted on a vehicle (e.g., the distance between an object and the vehicle may be greater than the distance between the first sensor pixel and the second sensor pixel).

The distance between the object and the first sensor pixel may be denoted with the symbol d. The distance between the object and the second sensor pixel may be determined by the distance, d, between the object and the first sensor pixel, plus an additional distance, x. The distance (e.g., the horizontal distance) between the first sensor pixel and the second sensor pixel may be denoted with the symbol b (e.g., assuming that the first sensor pixel and the second sensor pixel are aligned along a first direction, e.g. along the horizontal direction). The emission angle (e.g., the angle between the emission direction and the optical axis of the LIDAR system) may be denoted with the symbol a.

The following equation (1r) may be determined, $$(d+x)^2=d^2+b^2-2bd\cos(90°+\alpha)=d^2+b^2+2bd\sin(\alpha). \tag{1r}$$

Then, it may be determined that, $$x=\sqrt{d^2+b^2+2bd\sin(\alpha)}-d=d\sqrt{1+\frac{b^2}{d^2}+\frac{2b}{d}\sin\alpha}-d. \tag{2r}$$

In case that d>>b, it may be true that $$\sqrt{1+y}\approx 1+\frac{y}{2}.$$

There-fore, assuming that it $$\frac{b^2}{d^2}\sim 0,$$

may be determined that, $$x \approx d\left(1+\frac{b}{d}\sin(\alpha)\right)-d=b\sin\alpha. \tag{3r}$$

The additional time that it may take for the light to travel the additional distance x (e.g., the time difference) may be denoted with the symbol $t_x$. From the above equations, it may be determined that, $$t_x(\alpha)=\frac{b\sin\alpha}{c}. \tag{4r}$$

The symbol c in equation (4r) may represent the speed of light (e.g., 299792458 m/s). Thus the time difference, $t_x$, may be dependent on the emission angle, α. The time difference, $t_x$, may be independent on the distance, d. The time difference, $t_x$, may be in the range from about 10 ps to about 5000 ps, for example from about 20 ps to about 1000 ps, for example from about 50 ps to about 200 ps. Illustratively, the time difference, $t_x$, may be an expected (e.g., reference) time difference (e.g., known or determined based on the emission angle, α, and the distance between sensor pixels, b).

The time difference, $t_x$, may be proportional (e.g., linearly proportional) to the distance, b, between sensor pixels (e.g., between the first sensor pixel and the second sensor pixel). The time difference, $t_x$, may increase for increasing distance, b. From the point of view of the measurement of the time difference, $t_x$, it may be desirable to have the distance, b, as large as possible. By way of example, in a vehicle the first sensor pixel may be arranged in a first headlight or head lamp (e.g., the left headlight), and the second sensor pixel may be arranged in a second headlight (e.g., the right headlight).

As an example, in case that the distance, b, between the first sensor pixel and the second sensor pixel is 10 cm and the emission angle, α, is 10°, the time difference, $t_x$, may be about 58 ps. As another example, in case that the distance, b, is 1 m and the emission angle, α, is 10°, the time difference, $t_x$, may be about 580 ps. As another example, in case that the distance, b, is 10 cm and the emission angle, α, is 20°, the time difference, $t_x$, may be about 114 ps. As another example, in case that the distance, b, is 1 m and the emission angle, α, is 20°, the time difference, $t_x$, may be about 1140 ps. As another example, in case that the distance, b, is 10 cm and the emission angle, α, is 30°, the time difference, $t_x$, may be about 167 ps. As another example, in case that the distance, b, is 1 m and the emission angle, α, is 30°, the time difference, $t_x$, may be about 1670 ps. The same values may be obtained also in case that the angle α is negative (e.g., in case that the direction of emission is mirrored along the horizontal direction with respect to the optical axis). In case that the angle α is negative the reflected light may impinge first onto the second sensor pixel and then onto the first sensor pixel (e.g., the distance between the object and the second sensor pixel may be smaller than the distance between the object and the first sensor pixel).

In various embodiments, the circuit may include a comparator stage (e.g., an analog comparator stage, e.g. one or more analog comparators). The comparator stage may be coupled to the sensor pixels. By way of example, one or more analog comparators may be coupled (e.g., downstream coupled) to respective one or more sensor pixels. The comparator stage may be configured to receive (e.g., as one or more input signals) one or more signals output by the sensor pixels (e.g., one or more sensor pixel signals, for example output from one or more sub-sensors). The comparator stage may be configured to output one or more signals (e.g., one or more comparator outputs) based on a relationship between the one or more input signals and a predefined value (e.g., a threshold value). The comparator stage may be configured to compare the one or more input signals with a is respective threshold value. By way of example, the comparator stage may be configured to output a signal in the case (or as soon as) an input signal of the one or more input signals exceeds the respective threshold value. The threshold value may be selected based on a noise level. As an example, the threshold value may be predefined based on a known (e.g., predefined) noise level. As another example, the threshold value may be defined based on a determined (e.g., measured) noise level. The precision of the circuit may be increased by varying (e.g., by decreasing) the threshold value. The presence of the comparator stage may provide the effect that a digitalization of the (e.g., raw) signal output from the sensor pixel(s) (e.g., from avalanche photo diode(s)) may be avoided. Such digitalization and the further digital signal processing may be elaborate and costly (e.g., in terms of system resources), due to the necessary bandwidth, which may be greater than 10 GHz in case that the time difference is smaller than 100 ps.

The circuit may include a converter stage (e.g., one or more time-to-digital converters). The converter stage may be coupled (e.g., downstream coupled) to the comparator stage. The converter stage may be configured to receive as a first input (e.g., as one or more first inputs) the one or more comparator outputs of the comparator stage. By way of example, the converter stage may include one or more time-to-digital converters coupled to a respective analog comparator of the one or more analog comparators. The one or more time-to-digital converters may be configured to receive as a first input the output of the respective analog comparator. The converter stage may be configured to receive as a second input a signal that may represent or may indicate that the light signal has been generated (e.g., that a light pulse, such as a laser pulse, has been emitted). The second input may be or may represent a trigger signal (e.g., a laser trigger signal). The one or more time-to-digital converters may be configured to receive the trigger signal as a second input. The second input may be provided to the converter stage, for example, by a controller and/or a processor coupled with a light source of the LIDAR system. The converter stage may be configured to provide a digital output (e.g., one or more digital outputs, e.g. for each time-to-digital converter). By way of example, the one or more time-to-digital converters may be included in a timer circuit of the LIDAR system, as described, for example, in relation to FIG. 19A to FIG. 19C.

The first input and the second input may determine the running time of the converter stage (e.g., the running time of a respective time-to-digital converter). By way of example, the second input may be or may define a start (e.g., an activation) of the converter stage (e.g., of the one or more time-to-digital converters). The first input may be or may define a stop (e.g., a deactivation) of the converter stage (e.g., the one or more first inputs may define a stop of the respective time-to-digital-converter). Illustratively, a time-to-digital converter (or each time-to-digital converter) may be configured to start measuring a time interval as soon as it receives the second input and may be configured to stop measuring the time interval as soon as it receives the first input from the respective analog comparator.

In various embodiments, the circuit may include one or more processors (e.g., one or more controllers, such as one or more microcontrollers). The one or more processors may be coupled (e.g., downstream coupled) to the converter stage. The one or more processors may be configured to receive one or more signals (e.g., one or more digital or digitized signals) signal from the converter stage (e.g., one or more digital outputs of the converter stage). The one or more signals from the converter stage may be or may represent the running time of the converter stage (e.g., the respective running times of the one or more time-to-digital converters, e.g. the respective measured time intervals). The running time may be or may represent the duration of the period of time in which the converter stage (e.g., the respective time-to-digital converter) was active (e.g., the period of time between the reception of the second input and the reception of the first input). By way of example, a microcontroller may be configured to receive a first signal from a first time-to-digital converter representing the running time of the first time-to-digital converter. The microcontroller may be configured to receive a second signal from a second time-to-digital converter representing the running time of the second time-to-digital converter. Illustratively, the running time may correlate with or represent the Time-of-Flight (TOF) of a laser pulse from a laser source to an object and, after reflection at the object, from the object to a sensor (e.g., to a sub-sensor) or sensor pixel.

The one or more processors may be configured to determine (e.g., to calculate) the running time (e.g., the individual running times) from the received one or more signals. The one or more processors may be configured to determine (e.g., to calculate) one or more time differences between the individual running times. By way of example, the microcontroller may be configured to determine a time difference between the running time of the first time-to-digital converter and the running time of the second time-to-digital converter (e.g., a time difference between a first time-of-flight and a second time-of-flight).

The one or more processors may be configured to evaluate whether the determined one or more time differences are in agreement with the (e.g., current) emission angle, $\alpha$, (e.g., the emission angle at the time point of the transmission of the trigger signal). Illustratively, the one or more processors may be configured to evaluate whether the determined one or more time differences satisfy a predetermined relationship with the emission angle, a. The one or more processors may be configured to determine whether the determined one or more time differences substantially correspond to the expected time difference. The one or more processors may be configured to evaluate whether the determined time difference is in agreement with the emission angle $\alpha$ in terms of absolute value and/or sign. Illustratively, the one or more processors may be configured to evaluate whether the determined time difference is compatible with the first signal from the first sensor pixel and the second signal from the second sensor pixel being both generated by the LIDAR light (e.g., by the light signal, e.g. the emitted LIDAR light reflected back towards the LIDAR system).

The one or more processors may be configured to determine (e.g., to calculate) a distance (e.g., a distance value, e.g. a valid distance value) between an object (illustratively, the object that reflected the LIDAR light) and at least one of the sensor pixels (e.g., the first sensor pixel and/or the second sensor pixel). The one or more processors may be configured to determine such distance in case that the one or more processors determine a time difference in agreement with the emission angle, $\alpha$, (e.g., in the case the one or more processors determine a valid time difference, e.g. a time difference below a predetermined threshold, such as below 50 ps or below 10 ps). The one or more processors may be configured to determine such distance based on the respective determined running time (e.g., based on the running time of the time-to-digital converter associated with a sensor pixel). By way of example, the one or more processors may be configured to determine a first distance, d, between the object and the first sensor pixel. The one or more processors may be configured to determine a second distance, d+x, between the object and the second sensor pixel.

The one or more processors may be configured to classify the first signal from the first sensor pixel and/or the second signal from the second sensor pixel as “non-valid” signal(s) (e.g., as noise signal(s)). The one or more processors may be configured to provide such classification in case that the determined time difference is not in agreement with the emission angle, a (e.g., in case that the determined time difference does not satisfy the predetermined relationship). As an example, the one or more processors may be configured to provide such classification in case that the determined time difference differs from the expected time difference (e.g., by more than 10 ps or more than 50 ps). The one or more processors may be configured to provide such classification in case that the determined time difference is above a threshold value, such as above 10 ps or above 50 ps. Such a “non-valid” time difference (e.g., such “non-valid” first signal and/or second signal from the sensor pixels) may be provided by noise signal(s) such as ambient light signal(s) and/or stray light signal(s) (e.g., direct solar light, reflected solar light, laser pulses emitted from another vehicle, etc.). The noise signal(s) may be impinging onto the LIDAR system from other angle ranges. The noise light may be such that upon impinging on a sensor pixel a (e.g., noise) signal is generated that include a signal amplitude above the threshold value of the comparator stage.

Illustratively, the measurement principle described herein may be based on a conditional coincidence circuit (e.g., on a coincidence criterion). A temporal distance of the signals (e.g., generated by the sensor pixels) may be determined and evaluated, rather than a contemporaneity of the signals. It may be determined whether the temporal distance fulfills an emission angle-dependent relationship ($t=t_x(\alpha)$). Figuratively, the measurement principle described herein may be described as a type of “directional hearing”.

The determined time difference may be shorter as the pulse duration of the signal (e.g., of the measured signal, e.g. of the signal generated by a sensor pixel). This may be the case, in particular, for short time differences (e.g., shorter than 20 ps or shorter than 15 ps). This however does not modify nor impair the measurement principle. The comparator stage (e.g., the one or more analog comparators) may be configured to be sensitive to the rising flank (in other words, the rising edge) of a signal (e.g., of the signal coming from a respective sensor pixel). The comparator stage may be configured to record the signal as soon as the signal exceeds the predetermined value (e.g., the respective threshold).

In various embodiments, the circuit may include one or more peak detectors (also referred to as “peak detector and hold circuits”). The one or more peak detectors may be configured to receive one or more signal outputs from the one or more sensor pixels (e.g., output from one or more sub-sensors). The one or more peak detectors may be configured to determine the signal amplitude (e.g., the amplitude of the first signal from the first sensor pixel and/or the amplitude of the second signal from the second sensor pixel). The circuit may further include one or more analogto-digital converters coupled (e.g., downstream coupled) the one or more peak detectors. The one or more analog-to-digital converters may be configured to receive the signal output from a respective peak detector. The one or more analog-to-digital converters may be configured to digitize (in other words, digitalize) the received signal. The one or more analog-to-digital converters may be configured to provide one or more digital output signals (e.g., one or more digital amplitudes) to the one or more processors. The one or more processors (e.g., the microcontroller) may be configured to reset the one or more peak detectors (e.g., after each detected signal or signal pulse pulse). The one or more processors may be configured to determine the fulfillment of the predefined criterion based on the received one or more signal amplitudes.

In various embodiments, the measurement may be performed over (or with) a plurality of light pulses (e.g., a plurality of laser pulses). This may provide an improved (e.g., greater) SNR. The one or more processors may be configured to determine a histogram (e.g., a distribution, for example a frequency distribution) of the determined running times. Illustratively, the one or more processors may be configured to group the determined running times (e.g., to create a histogram based on the grouping of the determined running times). The one or more processors may be configured to classify the one or more sensor pixel signals based on the determined histogram. The one or more processors may be configured to determine that a running time is associated with an emitted light pulse in case that an accumulation (e.g., a frequency accumulation) exist for that running time. Illustratively, the one or more processors may be configured to determine that a running time is associated with the light signal (e.g., with the plurality of emitted light pulses, such as laser pulses) in case that a plurality of running times have substantially the same value. Such running times may be associated with a real object (e.g., with reflection of LIDAR light from an object).

The measurement principle described herein may be extended to more than two sensor pixels (e.g., more than two sensors, more than two sub-sensors, more than two photo diodes). This may further reduce the sensitivity to stray light or ambient light. In case that the LIDAR system is a 2D scanning LIDAR system or is configured as a 2D scanning LIDAR system, the sensor pixels may be arranged at a distance in a first direction and/or in a second direction (e.g., in the horizontal direction and/or in the vertical direction). As an example, the measurement principle described herein may be provided for two separate LIDAR systems (e.g., with separate receiver paths) communicatively coupled to each other.

In various embodiments the LIDAR system may include a 2D-emitter array (for example, a VCSEL-array). The 2D-emitter array may be configured to emit light. The 2D-emitter array may be configured to emit light in a known (or predetermined) angular range. The 2D-emitter array may be configured such that at least two emitters of the array (e.g., all the emitters in a column or in a row of the array) may emit light at the same time. An angle dependent time difference may be determined also in this configuration. Additionally or alternatively, the 2D-emitter array may be configured such that at least two emitters (e.g., a first emitter and a second emitter) of the array emit light at different time points (e.g., with a known or predetermined time difference). The one or more processors may be configured to evaluate the signals from the sensor pixels also based on the time difference between the emission of light from the first emitter and the second emitter.

In various embodiments the LIDAR system may include a plurality of light sources (e.g., a first light source and a second light source). The plurality of light sources may be configured to emit light at different wavelengths. The one or more sensor pixels (e.g., the one or more sub-sensors) may be configured to operate in different wavelength ranges (e.g., to detect different wavelengths, or to detect wavelengths in different ranges).

By way of example, the first light source may be configured to emit light having a first wavelength. The second light source may be configured to emit light having a second wavelength. The first wavelength may be different from the first wavelength. The first sensor pixel (e.g., the first sub-sensor) may be configured to operate in a wavelength range including the first wavelength (e.g., it may be configured to generate a signal in case that light having substantially the first wavelength impinges onto the sensor pixel). The second sensor pixel (e.g., the second sub-sensor) may be configured to operate in a wavelength range including the second wavelength (e.g., it may be configured to generate a signal in case that light having substantially the second wavelength impinges onto the sensor pixel).

A LIDAR system as described herein (e.g., including a circuit as described herein) may have a long range (e.g., detection range) and a large field of view. The long range and the large field of view may be provided even in daylight conditions (e.g., even in the presence of ambient light and/or stray light, for example sunlight).

FIG. 116 shows a LIDAR system 11600 in a schematic view, in accordance with various embodiments.

The LIDAR system 11600 may be configured as a LIDAR scanning system. By way of example, the LIDAR system 11600 may be or may be configured as the LIDAR Sensor System 10 (e.g., as a scanning LIDAR Sensor System 10). The LIDAR system 11600 may include an emitter path, e.g., one or more components of the LIDAR system 11600 configured to emit (e.g. LIDAR) light. The emitted light may be provided to illuminate (e.g., interrogate) the area surrounding or in front of the LIDAR system 11600. The LIDAR system 11600 may include a receiver path, e.g., one or more components configured to receive light from the area surrounding or in front of the LIDAR system 11600 (e.g., light reflected or scattered from objects in that area). The LIDAR system 11600 may also be or may be configured as a Flash LIDAR system.

The LIDAR system 11600 may include an optics arrangement 11602 (also referred to as receiver optics arrangement or sensor optics). The optics arrangement 11602 may be configured to receive (e.g., collect) light from the area surrounding or in front of the LIDAR system 11600. The optics arrangement 11602 may be configured to direct (e.g., to focus or to collimate) the received light towards a sensor 52 of the LIDAR system 11600. The optics arrangement 11602 may include one or more optical components (such as one or more lenses, one or more objectives, one or more mirrors, and the like) configured to receive light and focus it onto a focal plane of the optics arrangement 11602. By way of example, the optics arrangement 11602 may be or may be configured as the optics arrangement 9802 described in relation to FIG. 98 to FIG. 102B.

The optics arrangement 11602 may have or may define a field of view 11604 of the optics arrangement 11602. The field of view 11604 of the optics arrangement 11602 may coincide with the field of view of the LIDAR system 11600. The field of view 11604 may define or may represent an area (or a solid angle) through (or from) which the optics arrangement 11602 may receive light (e.g., an area visible through the optics arrangement 11602). The optics arrangement 11602 may be configured to receive light from the field of view 11604. Illustratively, the optics arrangement 11602 may be configured to receive light (e.g., emitted, reflected, scattered, etc.) from a source or an object (or many objects, or all objects) present in the field of view 11604.

The field of view 11604 may have a first angular extent in a first direction (e.g., the horizontal direction, for example the direction 11654 in FIG. 116). By way of example, the field of view 11604 of the optics arrangement 11602 may be about 60° in the horizontal direction (e.g., from about −30° to about +30° with respect to an optical axis 11606 of the optics arrangement 11602 in the horizontal direction), for example about 50°, for example about 70°, for example about 100°. The field of view 11604 may have a second angular extent in a second direction (e.g., the vertical direction, for example the direction 11656 in FIG. 116). By way of example, the field of view 11604 of the optics arrangement 11602 may be about 10° in the vertical direction (e.g., from about −5° to about +5° with respect to the optical axis 11606 in the vertical direction), for example about 5°, for example about 20°, for example about 30°. The first direction and the second direction may be perpendicular to the optical axis 11606 of the optics arrangement 11602 (illustratively, the optical axis 11606 may be aligned or oriented along the direction 11652 in FIG. 116). The first direction may be perpendicular to the second direction. The definition of first direction and second direction (e.g., of horizontal direction and vertical direction) may be selected arbitrarily, e.g. depending on the chosen coordinate (e.g. reference) system. The optical axis 11606 of the optics arrangement 11602 may coincide with the optical axis of the LIDAR system 11600.

The LIDAR system 11600 may include at least one light source 42. The light source 42 may be configured to emit light, e.g. a light signal (e.g., to generate a light beam 11608). The light source 42 may be configured to emit light having a predefined wavelength, e.g. in a predefined wavelength range. For example, the light source 42 may be configured to emit light in the infra-red and/or near infra-red range (for example in the range from about 700 nm to about 5000 nm, for example in the range from about 860 nm to about 2000 nm, for example 905 nm). The light source 42 may be configured to emit LIDAR light (e.g., the light signal may be LIDAR light). The light source 42 may include a light source and/or optics for emitting light in a directional manner, for example for emitting collimated light (e.g., for emitting laser light). The light source 42 may be configured to emit light in a continuous manner or it may be configured to emit light in a pulsed manner (e.g., to emit a sequence of light pulses, such as a sequence of laser pulses). As an example, the light source 42 may be configured to emit the light signal including a plurality of light pulses. The LIDAR system 11600 may also include more than one light source 42, for example configured to emit light in different wavelength ranges and/or at different rates (e.g., pulse rates).

By way of example, the light source 42 may be configured as a laser light source. The light source 42 may include at least one laser source 5902 (e.g., configured as described, for example, in relation to FIG. 59). The laser source 5902 may include at least one laser diode, e.g. the laser source 5902 may include a plurality of laser diodes, e.g. a multiplicity, for example more than two, more than five, more than ten, more than fifty, or more than one hundred laser diodes. The laser source 5902 may be configured to emit a laser beam having a wavelength in the infra-red and/or near infra-red wavelength range.

The LIDAR system 11600 may include a scanning unit 11610 (e.g., a beam steering unit). The scanning unit 11610 may be configured to receive the light signal emitted by the light source 42. The scanning unit 11610 may be configured to direct the received light signal towards the field of view 11604 of the optics arrangement 11602. In the context of the present application, the light signal output from (or by) the scanning unit 11610 (e.g., the light signal directed from the scanning unit 11610 towards the field of view 11604) may be referred to as light signal 11612 or as emitted light signal 11612.

The scanning unit 11610 may be configured to control the emitted light signal 11612 such that a region of the field of view 11604 is illuminated by the emitted light signal 11612. The illuminated region may extend over the entire field of view 11604 in at least one direction (e.g., the illuminated region may be seen as a line extending along the entire field of view 11604 in the horizontal or in the vertical direction). Alternatively, the illuminated region may be a spot (e.g., a circular region) in the field of view 11604.

The scanning unit 11610 may be configured to control the emitted light signal 11612 to scan the field of view 11604 with the emitted light signal 11612 (e.g., to sequentially illuminate different portions of the field view 11604 with the emitted light signal 11612). The scan may be performed along a scanning direction (e.g., a scanning direction of the LIDAR system 11600). The scanning direction may be a direction perpendicular to the direction along which the illuminated region extends. The scanning direction may be the horizontal direction or the vertical direction. Illustratively, the scanning unit 11610 may be configured to control an emission angle, α, of the emitted light signal 11612 to scan the field of view 11604 (e.g., the scanning unit 11610 may be configured to vary the emission angle over a range of angles). The emission angle, α, may be an angle between the direction into which the light signal is emitted and the optical axis 11606 of the optics arrangement 11602. The emission angle, α, may be an angle with respect to a predefined direction. The predefined direction may be the scanning direction. The predefined direction may be the horizontal direction or the vertical direction.

The scanning unit 11610 may include a suitable (e.g., controllable) component or a suitable configuration for scanning the field of view 11604 with the emitted light 11612. As an example, the scanning unit 11610 may include one or more of a 1D MEMS mirror, a 2D MEMS mirror, a rotating polygon mirror, an optical phased array, a beam steering element based on meta materials, or the like.

Additionally or alternatively, the scanning unit 11610 may include an emitter array, such as a 2D-emitter array (for example, a VCSEL-array). The scanning unit 11610 may include one or more optical components arranged in front of the emitter array (e.g., configured to receive light from the emitter array and to direct it towards the field of view). As an example, an optical component may be arranged in front of a respective column of a VCSEL-array. The one or more optical components may be configured such that different portions of the emitter array are assigned to different portions of the field of view 11604. By way of example, the one or more optical components may be configured such that each column of the VCSEL array is associated with a respective angular range (e.g., each column directs light in an angular portion of the field of view 11604 assigned thereto). The emitter array may be configured such that different portions of the emitter array (e.g., different columns of the VCSEL array) emit light at different wavelengths.

This way, different wavelengths may be associated with different angular portions of the field of view 11604.

One or more objects 11614, 11616 may be located in the field of view 11604. Illustratively, an object in the field of view 11604 may be seen as a light source directing or emitting light towards the LIDAR system 11600. As an example, a first object 11614 may reflect or scatter the emitted light signal 11612 back towards the LIDAR system 11600 (e.g., the optics arrangement 11602 may receive from the first object 11614 a reflected light signal 11612*r*, e.g. echo light, e.g. an echo signal or LIDAR echo signal). As another example, a second object 11616 may direct or emit stray light or ambient light 11618 towards the LIDAR system 11600 (e.g., the second object 11616 may be a source of noise). The second object 11618 may be the sun, or a surface reflecting solar light, or a vehicle emitting light (e.g., LIDAR light), etc.

The LIDAR system 11600 may be configured to detect an object in the field of view 11604. The LIDAR system 11600 may be configured to identify an object in the field of view 11604 (e.g., to assign a predefined category to the object). The LIDAR system 11600 may be configured to determine a distance between an object in the field of view 11604 and the LIDAR system 11600 (illustratively, how far away from the LIDAR system 11600 the object is located). The LIDAR system 11600 may be configured for detection based on a time-of-flight (TOF) principle. Illustratively, the distance is between an object and the LIDAR system 11600 may be determined based on the time between the emission of the light signal 11612 and the reception (e.g., the detection) of the echo signal 11612*r* (e.g., the reflected light corresponding to or associated with the emitted light signal 11612).

The system 11600 may include at least one sensor 52 (e.g., a light sensor, e.g. a LIDAR sensor). The sensor 52 may be configured to receive light from the optics arrangement 11602 (e.g., the sensor 52 may be arranged in the focal plane of the optics arrangement 11602). The sensor 52 may be configured to detect system external objects (e.g., objects in the field of view 11604). The sensor 52 may be configured to operate in a predefined range of wavelengths, for example in the infrared range and/or in the near infrared range (e.g., from about 860 nm to about 2000 nm, for example from about 860 nm to about 1000 nm).

The sensor 52 may include one or more sensor pixels 11620 (e.g., a first sensor pixel 11620-1 and a second sensor pixel 11620-2). The one or more sensor pixels 11620 may be configured to generate a signal, e.g. one or more sensor pixel signals 11622 (e.g., the first sensor pixel 11620-1 may be configured to generate a first sensor pixel signal 11622-1, the second sensor pixel 11620-2 may be configured to generate a second sensor pixel signal 11622-2). The one or more sensor pixel signals 11622 may be or may include an analog signal (e.g. an electrical signal, such as a current). The one or more sensor pixel signals 11622 may be proportional to the amount of light collected by the sensor 52 (e.g., to the amount of light arriving on the respective sensor pixel 11620). By way of example, the sensor 52 may include one or more photo diodes. Illustratively, each sensor pixel 11620 may include or may be associated with a respective photo diode (e.g., of the same type or of different types). At least some of the photo diodes may be pin photo diodes (e.g., each photo diode may be a pin photo diode). At least some of the photo diodes may be based on avalanche amplification (e.g., each photo diode may be based on avalanche amplification). As an example, at least some of the photo diodes may include an avalanche photo diode (e.g., each photo diode may include an avalanche photo diode). At least some of the avalanche photo diodes may be or may include a single photon avalanche photo diode (e.g., each avalanche photo diode may be or may include a single photon avalanche photo diode).

The one or more sensor pixels 11620 may have a same shape and/or a same size. Alternatively, the one or more sensor pixels 11620 may have a different shape and/or a different size (e.g., the first sensor pixel 11620-1 may have a different shape and/or size with respect to the second sensor pixel 11620-2). As an example, the one or more sensor pixels 11620 may have a rectangular shape (for example, with a lateral dimension greater in a direction parallel to a scanning direction of the LIDAR system 11600). As another example, the one or more sensor pixels 11620 may be configured (e.g., shaped) such that a crosstalk between the one or more sensor pixels 11620 (e.g., between adjacent sensor pixels 11620, e.g. between the first sensor pixel 11620-1 and the second sensor pixel 11620-2) is reduced. By way of example, at least one sensor pixel 11620 (e.g., the first sensor pixel 11620-1 and/or the second sensor pixel 11620-2) may have a larger extension into a direction perpendicular to the scanning direction of the LIDAR system 11600 (e.g., a larger height) in a first (e.g., central) region than in a second (e.g., edge) region. Illustratively, at least one sensor pixel 11620 (e.g., the first sensor pixel 11620-1 and/or the second sensor pixel 11620-2) may be configured as discussed in further detail below, for example in relation to FIG. 120 to FIG. 122.

The first sensor pixel 11620-1 and the second sensor pixel 11620-2 may be part of a same sensing unit, or the first sensor pixel 11620-1 and the second sensor pixel 11620-2 may constitute or may be part of separate (e.g., independent) sensing units.

The sensor 52 may include one or more sub-sensors, for example a first sub-sensor 52-1 and a second sub-sensor 52-2 (as illustrated in FIG. 116C). The first sub-sensor 52-1 may include the first sensor pixel 11620-1 (or a plurality of first sensor pixels 11620-1, such as 32 or 64 first sensor pixels 11620-1). The second sub-sensor 52-2 may include the second sensor pixel 11620-2 (or a plurality of second sensor pixels 11620-2, such as 32 or 64 second sensor pixels 11620-2). The first sensor pixel 11620-1 and the second sensor pixel 11620-2 may be arranged in a same position within the respective sub-sensor. By way of example, the first sub-sensor 52-1 and the second sub-sensor 52-2 may be one-dimensional sensor arrays. Alternatively, the first sub-sensor 52-1 and the second sub-sensor 52-2 may be two-dimensional sensor arrays (for example, including two columns of sensor pixels). The first sensor pixel 11620-1 and the second sensor pixel 11620-2 may be arranged in the same position within the respective array. As an example, the first sensor pixel 11620-1 and the second sensor pixel 11620-2 may both be the n-th element of the respective one-dimensional array (e.g., the first element, the second element, etc.). As another example, the first sensor pixel 11620-1 and the second sensor pixel 11620-2 may both be at the same matrix coordinates within the respective two-dimensional array (as illustrated in FIG. 116C).

Even in case the first sensor pixel 11620-1 and the second sensor pixel 11620-2 are included in a respective sub-sensor 52-1, 52-2, they may still be considered as included in the sensor 52. Illustratively, the sensor 52 may be understood as a sensing unit including one or more (e.g., independent) sub-sensors. By way of example, the sensor 52 may include a (e.g., central) processing unit configured to process the one or more signals provided by the one or more sub-sensors.

The first sensor pixel 11620-1 and the second sensor pixel 11620-2 may be part of a same sensor array (as illustrated, for example, in FIG. 116D). By way of example, the sensor 52 may be configured as a two-dimensional sensor array (e.g., the sensor 52 may include a matrix of sensor pixels 11620, for example including two columns of sensor pixels 11620). The first sensor pixel 11620-1 and the second sensor pixel 11620-2 may be arranged next to one another within the sensor array (e.g., immediately adjacent to one another). As an example, the first sensor pixel 11620-1 and the second sensor pixel 11620-2 may be arranged in a same row and in adjacent columns within the sensor array. Alternatively, the first sensor pixel 11620-1 and the second sensor pixel 11620-2 may be arranged not adjacent to one another (for example, in a same row and in different columns of sensor pixels not adjacent to one another).

A sensor pixel 11620 may be configured to generate a sensor pixel signal 11622 in case that an event at the sensor pixel 11620 triggers the sensor pixel 11620. By way of example, a sensor pixel 11620 may be configured to generate a sensor pixel signal 11622 in case that a certain amount of light (e.g., an amount of light above a predetermined threshold) impinges onto the sensor pixel 11620. Illustratively, a sensor pixel signal 11622 may include one or more sensor pixel signal pulses (e.g., a plurality of sensor pixel signal pulses). A sensor pixel signal pulse may represent a different event at the sensor pixel 11620. As an example, a sensor pixel signal pulse may represent the impinging onto the sensor pixel 11620 of echo light 11612*r* reflected from the first object 11614. As another example, a sensor pixel signal pulse may represent the impinging onto the sensor pixel 11620 of stray light 11618 coming from the second object 11616.

The sensor 52 (or the LIDAR system 11600) may be configured to determine whether the light received from an object in the field of view 11604 is the reflected light signal 11612*r* or stray light 11618 (e.g., noise light). The sensor 52 may include a pixel signal selection circuit 11624. Alternatively, the LIDAR system 11600 may include the pixel signal selection circuit 11624 coupled (e.g., communicatively coupled) with the sensor 52. In the following, the pixel signal selection circuit 11624 may be referred to as circuit 11624.

The circuit 11624 may be configured to receive the one or more sensor pixel signal 11622 (e.g., to receive the first sensor pixel signal 11622-1 and the second sensor pixel signal 11622-2). The circuit 11624 may be configured to determine the time-of-flight of the emitted light signal 11612. Determining the time-of-flight may correspond to determining the distance between an object and the LIDAR system 11600. The determination of the time-of-flight may be based on the received one or more sensor pixel signals 11622. Illustratively, the time-of-flight may be determined from the time point at which the LIDAR light is emitted and the time point at which the one or more sensor pixel signals 11622 (e.g., one or more sensor pixel signal pulses) is/are generated.

The circuit 11624 may be configured to determine one or more values from the received one or more sensor pixel signals 11622 (illustratively, it may be configured to determine one value for each individual sensor pixel signal 11622 and/or for each individual sensor pixel signal pulse). The one or more values may be or may represent one or more candidates time-of-flight of the light signal 11612 received at the respective sensor pixel 11620. By way of example, the circuit 11624 may be configured to determine at least one first value from the first sensor pixel signal 11622-1. The first value may be or may represent at least one first candidate time-of-flight of the emitted light signal 11612 received at the first sensor pixel 11620-1 (e.g., at the first sub-sensor 52-1). The circuit 11624 may be configured to determine at least one second value from the second sensor pixel signal 11622-2. The second value may be or may represent at least one second candidate time-of-flight of the emitted light signal 11612 received at the second sensor pixel 11620-2 (e.g., at the second sub-sensor 52-2).

The time-of-flight of the emitted light 11612 may be determined from one or more of the sensor pixel signals 11622 (e.g., one or more of the sensor pixel signal pulses) that are generated in response to the echo light 11612*r*. Sensor pixel signal(s) 11622 that is/are generated in response to ambient light or stray light 11618 may not be used for determining the time-of-flight. A predefined criterion (e.g., a predefined coincidence criterion) may be provided to determine whether a sensor pixel signal 11622 (e.g., a sensor pixel signal pulse) is associated with echo light 11612*r* or with ambient light or stray light 11618. The predefined criterion may describe the difference between events (e.g., sensor events) at different sensor pixels 11620 (e.g., the difference between a first event at the first sensor pixel 11620-1 triggering the first sensor pixel signal 11622-1 and a second event at the second sensor pixel 11620-2 triggering the second sensor pixel signal 11622-2). The predefined criterion may describe a time difference between events at different sensor pixels 11620 (e.g., at different sub-sensors). By way of example, the predefined criterion may describe a time difference between a first sensor signal pulse of the first sensor signal 11620-1 and a second sensor signal pulse of the second sensor signal 11620-2.

The circuit 11624 may be configured to evaluate whether the one or more values (e.g., the one or more candidates time-of-flight) may represent a valid time-of-flight. Illustratively, the circuit 11624 may be configured to evaluate which of the one or more candidates time-of-flight may be or may represent a valid time-of-flight. The circuit 11624 may be configured to verify whether the one or more values fulfill the predefined criterion (e.g., to verify whether the at least one first value and the at least one second value fulfill the predefined coincidence criterion). By way of example, the circuit 11624 may be configured to classify the received light (e.g., at the first sensor pixel 11620-1 and/or at the second sensor pixel 11620-2) as echo light or light signal in case that the predefined criterion is fulfilled. The circuit 11624 may be configured to classify the received light as stray light or ambient light in case that the predefined criterion is not fulfilled. The circuit 11624 may be configured to determine the time-of-flight of the emitted light signal 11612 in case that the received light is the echo light 11612*r*. By way of example, the circuit 11624 may be configured to determine a time-of-flight value based on the at least one first value and the at least one second value and the verification result.

The circuit 11624 may be configured to evaluate (e.g., to verify) the fulfillment of the predefined criterion for each possible combination of the one or more sensor pixel signals 11622, e.g. for each combination of the sensor pixel signal pulses of the one or more sensor pixel signals 11622. Illustratively, a sensor pixel signal pulse of a sensor pixel signal 11622 may be evaluated in combination with all the signal pulses of another sensor pixel signal 11622 (e.g., generated from another sensor pixel 11620). Subsequently, another sensor pixel signal pulse of the sensor pixel signal 11622 (if present) may be evaluated in combination with all the signal pulses of the other sensor pixel signal 11622, etc. (e.g., until all the combinations have been evaluated).

By way of example, the first sensor pixel signal 11622-1 may include one or more first sensor signal pulses (e.g., a plurality of first sensor signal pulses). The second sensor pixel signal 11622-2 may include one or more second sensor signal pulses (e.g., a plurality of second sensor signal pulses). The circuit 11624 may be configured to evaluate the fulfillment of the predefined criterion for each possible combination of the one or more first sensor signal pulses with the one or more second sensor signal pulses. The circuit 11624 may be configured to determine a first value (e.g., a first candidate time-of-flight) for each first sensor pixel signal pulse. The circuit 11624 may be configured to determine a second value (e.g., a second candidate time-of-flight) for each second sensor pixel signal pulse. The circuit 11624 may be configured to verify whether the at least one first value and the at least one second value fulfill the predefined criterion by comparing a respective first value with the one or more second values (e.g., with the plurality of second values). Additionally or alternatively, the circuit 11624 may be configured to verify whether the at least one first value and the at least one second value fulfill the predefined criterion by comparing a respective second value with the one or more first values (e.g., with the plurality of first values).

The predefined criterion may be defined according to geometric considerations. The predefined criterion may be defined taking into consideration the emission angle, $\alpha$, of the light signal 11612. The predefined criterion may be defined taking into consideration the arrangement of the one or more sensor pixels 11620 (e.g, of the one or more sub-sensors 52-1, 52-2). The one or more sensor pixels 11620 may be arranged such that it may be possible to determine whether the light impinging onto the sensor 52 (e.g., onto the sensor pixels 11620) is echo light 11612*r* or stray light 11618 (or ambient light). The one or more sensor pixels 11620 may be arranged at a distance from one another. By way of example, the second sensor pixel 11620-2 may be arranged at a distance, b, from the first sensor pixel 11620-1 (e.g., the distance, b, may also be referred to as sensor pixel distance).

The distance, b, may be a lateral distance. By way of example, the distance, b, may be a distance along a direction parallel to the scanning direction of the LIDAR system 11600. The first sensor pixel 11620-1 and the second sensor pixel 11620-2 may be aligned with respect to one another in a first direction (e.g., the first sensor pixel 11620-1 and the second sensor pixel 11620-2 may be arranged substantially at a same coordinate in the horizontal direction or in the vertical direction). The distance, b, may be a distance along a second direction perpendicular to the first direction (e.g., the distance, b, may be a distance along the vertical direction or along the horizontal direction). Illustratively, the second sensor pixel 11620-2 may be shifted with respect to the first sensor pixel 11620-1 in the horizontal direction or in the vertical direction. The distance, b, may be a center-to-center distance between the first sensor pixel 11620-1 and the second sensor pixel 11620-2. The distance, b, may be such that the detection scheme described herein may be implemented. As an example, the distance, b, may be at least 5 cm, for example at least 50 cm, for example at least 1 m, for example at least 5 m.

In case the first sensor pixel 11620-1 and the second sensor is pixel 11620-2 are included in a respective sub-sensor 52-1, 52-2, the distance b may be larger than an extension of the sensor pixels (e.g., it may be larger than a width or a height of the sensor pixels). Illustratively, the distance b may include a gap between the first sub-sensor 52-1 and the second sub-sensor 52-2. In case the first sensor pixel 11620-1 and the second sensor pixel 11620-2 are included in a same sensor array, the distance, b, may substantially correspond to an extension of a sensor pixel (e.g., to a width of a sensor pixel) or to a multiple of the extension of a sensor pixel.

A maximum value for the distance, b, may be determined based on a desired range. Illustratively, the above described equations (1r) to (4r) are valid in case a distance between an object and the LIDAR system 11600 (e.g., the distance d) is greater (e.g., at least 10 times greater or 20 times greater) than the distance, b. Thus, a maximum distance, b, may be a maximum distance for which the above described equations are still valid (e.g., a distance for which the relationship d>>b is still satisfied). As an example, the distance, b, may be less than 50 m, for example less than 20 m, for example less than 10 m.

The arrangement of the one or more sensor pixels 11620 at a distance from one another may provide the effect that light coming from an object in the field of view 11604 may impinge onto different sensor pixels 11620 (e.g., onto different sub-sensors) at different time points. Illustratively, the light coming from an object may travel different distances for impinging onto different sensor pixels 11620 (e.g., greater or smaller distances, illustratively depending on the position of the object in the field of view, e.g. depending on the emission angle $\alpha$).

As illustrated, for example, in FIG. 116A the light coming from the first object 11614 may travel a first distance, $d_1$, for impinging onto the first sensor pixel 11620-1, and a second distance, $d_2$, for impinging onto the second sensor pixel 11620-2. The first distance, $d_1$, may be different from the second distance, $d_2$ (e.g., the first distance, $d_1$, may be smaller than the second distance, $d_2$). Similarly, the light coming from the second object 11616 may travel a third distance, $d_3$, for impinging onto the first sensor pixel 11620-1, and a fourth distance, $d_4$, for impinging onto the second sensor pixel 11620-2. The fourth distance, $d_4$, may be smaller than the third distance, $d_3$.

Thus, in response to light coming from a same object, sensor pixel signals 11622 (e.g., sensor pixel signal pulses) may be generated at different time points by different sensor pixels 11620. The predefined criterion may be based on a time difference between sensor pixel signals 11622 generated by different sensor pixels 11620.

FIG. 116B shows a portion of the LIDAR system 11600 in a schematic view, in accordance with various embodiments. For the sake of clarity of representation, only some of the elements of FIG. 116A are illustrated in FIG. 116B.

The time it takes for light to travel from an object (e.g., the first object 11614) to a sensor pixel 11620 (e.g., to the first sensor pixel 11620-1 and/or to the second sensor pixel 11620-2) may be determined based on trigonometric considerations.

By way of example, the second distance, $d_2$, between the first object 11614 and the second sensor pixel 11620-2 may be seen as a sum of the first distance, $d_1$, between the first object 11614 and the first sensor pixel 11620-1 plus an additional distance, x. Similarly, the third distance, $d_3$, between the second object 11616 and the first sensor pixel 11620-1 may be seen as a sum of the fourth distance, $d_4$, between the first object 11614 and the second sensor pixel 11620-2 plus an additional distance, w.

The time it takes for the light to travel from an object to a sensor pixel 11620 may be determined by the distance from the object to the sensor pixel 11620, divided by the speed of light. Thus, a first time, $t_{d1}=d_1/c$, and a second time, $t_{d2}=d_2/c$, may be defined. Similarly, a third time, $t_{d3}=d_3/c$, and a fourth time, $t_{d4}=d_4/c$, may be defined. The time it takes for the light to travel from an object to a sensor pixel 11620 may differ from the time it takes for the light to travel from the object to another sensor pixel 11620. The time difference may be determined by the amount of time it takes for the light to travel an additional distance between the object and the sensor pixel 11620. By way of example, the first time, $t_{d1}$, may differ from the second time, $t_{d2}$, by the (e.g., additional) amount of the time, $t_x$, the light takes to travel the additional distance, x. The third time, $t_{d3}$, may differ from the fourth time, $t_{d4}$, by the (e.g., additional) amount of the time, $t_w$, the light takes to travel the additional distance, w.

The additional time may be or may represent a time difference between an event on a sensor pixel 11620 and an event on another sensor pixel 11620. The additional time may be or may represent a time difference between the generation of the sensor pixel signal 11622 from a sensor pixel 11620 and the generation of the sensor pixel signal 11622 from another sensor pixel 11620.

As described by equation (4r), the additional time(s) (e.g., the time difference(s)) may be used to determine whether the received light is the light signal 11612 (e.g., echo light 11612*r*) or stray light 11618. In case that the received light is the light signal 11612 the additional time may be proportional to the sensor pixel distance, b, and the sine of the emission angle, a. Illustratively, an expected additional time (e.g., the expected time difference) may be determined based on the sensor pixel distance, b, and the emission angle, a. The circuit 11624 may be configured to determine that the received light is light signal 11612 in case that the determined (e.g., measured) additional time, $t_x$, substantially corresponds to the expected additional time (e.g., based on the current emission angle, $\alpha$). The circuit 11624 may be configured to determine that the received light is stray light 11618 (or ambient light) in case that the determined additional time, $t_w$, does not correspond to the expected additional time. By way of example, the determined additional time may be considered to substantially correspond to the expected additional time in case that a time difference between the determined additional time and the expected additional time is less than 30 ps, for example less than 20 ps, for example less than 10 ps.

FIG. 117 shows the pixel signal selection circuit 11624 in a schematic representation, in accordance with various embodiments.

The circuit 11624 may include a comparator stage 11702. The comparator stage 11702 may be coupled to the one or more sensor pixels 11620 (e.g., to the one or more sub-sensors). The comparator stage 11702 may be configured to receive the one or more sensor pixel signals 11622. The comparator stage 11702 may be configured to compare the received one or more sensor pixel signals 11622 with a respective predefined threshold value, L (e.g., a threshold current, a threshold voltage, etc.). The comparator stage 11702 may be configured to provide a comparator output (e.g., one or more comparator outputs) associated with a received sensor pixel signal 11622 based on the comparison (for example, in case that the received sensor pixel signal 11622 exceeds the respective predefined threshold value, L).

The comparator stage 11702 may include one or more comparator circuits (e.g., one or more analog comparators). Each comparator circuit may be coupled to a respective sensor pixel 11620 (e.g., each comparator circuit may be configured to receive the sensor pixel signal 11622 from a sensor pixel 11620 coupled thereto). Each comparator circuit may be configured to compare the received sensor pixel signal 11622 with a predefined threshold value, L (e.g., associated with the comparator circuit). The predefined threshold value, L, may be the same for each comparator circuit. Alternatively, different comparator circuits may have different predefined threshold values (for example, depending on the position and/or the sensitivity of the respective sensor pixel 11620 coupled with the comparator circuit). Each comparator circuit may be configured to provide a comparator output value based on the comparison.

By way of example, the circuit 11624 may include a first comparator circuit 11702-1. The first comparator circuit 11702-1 may be coupled to the first sensor pixel 11620-1. The first comparator circuit 11702-1 may be configured to compare the first sensor pixel signal 11622-1 with a predefined threshold value, L, to provide a first comparator output value 11702-1*o*. The circuit 11624 may include a second comparator circuit 11702-2. The second comparator circuit 11702-2 may be coupled to the second sensor pixel 11620-2. The second comparator circuit 11702-2 may be configured to compare the second sensor pixel signal 11622-2 with a predefined threshold value, L, to provide a second comparator output value 11702-2*o*.

The circuit 11624 may include a converter stage 11704. The converter stage 11704 may be coupled to the comparator stage 11702. The converter stage 11704 may be configured to receive as a first input the output of the comparator stage 11702 (e.g., as one or more first inputs the one or more comparator outputs). The converter stage 11704 may be synchronized with the emission of the light signal 11612. The converter stage 11704 may be configured to receive as a second input a (e.g., trigger) signal indicating the emission of the light signal 11612. By way of example, the second input may be provided by the light source 42 and/or by the scanning unit 11610 (e.g., by one or more processors coupled with the light source 42 and/or with the scanning unit 11610). The converter stage 11704 (e.g., one or more converters) may be configured to start upon reception of the trigger signal. The converter stage may be configured to stop upon reception of the comparator output value. The converter stage 11704 may be configured to provide one or more output values (e.g., one or more converter output values, for example one or more digital values). The converter output value may be or may represent a time difference between the first input and the second input. Illustratively, the start and stop of the converter stage may be understood as a series of one or more (e.g., partial) measurements. The converter stage initiates (starts) a measurement upon reception of the trigger signal and provides one or more results based on the one or more first inputs. For each received first input, an output value may be provided, representing the time difference between the trigger signal and the respective first input. Figuratively, this may be seen as a series of stopwatch measurements starting from the reception of the trigger signal.

By way of example, the circuit 11624 may include a first time-to-digital converter 11704-1. The first time-to-digital converter 11704-1 may be coupled to the first comparator circuit 11702-1. The first time-to-digital converter 11704-1 may be synchronized with the emission of the light signal 11612. The first time-to-digital converter 11704-1 may be configured to provide a first output value 11704-1*o*. The circuit 11624 may include a second time-to-digital converter 11704-2. The second time-to-digital converter 11704-2 may be coupled to the second comparator circuit 11702-2. The second time-to-digital converter 11704-2 may be synchronized with the emission of the light signal 11612. The second time-to-digital converter 11704-2 may be configured provide a second output value 11704-2*o*. Illustratively, the first output value 11704-10 may be or may represent a time difference between the generation of the light signal 11612 and the generation of the first sensor pixel signal 11622-1 (e.g., between the generation of the light signal and a sensor pixel signal pulse of the first sensor pixel signal 11622-1). The second output value 11704-2*o* may be or may represent a time difference between the generation of the light signal 11612 and the second sensor pixel signal 11622-2 (e.g., between the generation of the light signal and a sensor pixel signal pulse of the second sensor pixel signal 11622-2).

The output of the comparator stage 11702 and/or the output of the converter stage 11704 may be used to determine the one or more values for the candidates time-of-flight. The circuit 11624 may include a processor 11706 (e.g., a controller, such as a microcontroller). The processor 11706 may be configured to determine the one or more values based on the one or more comparator output values. By way of example, the processor 11706 may be configured to determine the first value based on the first comparator output value 11702-1*o*. The processor 11706 may be configured to determine the second value based on the second comparator output value 11702-2*o*. The processor 11706 may be configured to determine the one or more values based on the one or more converter output values. By way of example, the processor 11706 may be configured to determine the first value based on the first converter output value 11704-1*o*. The processor 11706 may be configured to determine the second value based on the second converter output value 11704-2*o*.

The processor 11706 may be configured to receive information on the emission of the light signal 11612. The processor 11706 may be configured to receive the value of the emission angle, a (e.g., the absolute value and the sign of the emission angle, $\alpha$). By way of example, the processor 11706 may be communicatively coupled with the light source 42 and/or with the scanning unit 11610 (e.g., with one or more processors coupled with the light source 42 and/or with the scanning unit 11610).

The circuit 11624 may be configured to determine an amplitude of the one or more sensor pixel signals 11622 (e.g., a current amplitude). The circuit 11624 may include one or more peak detector circuits. Each peak detector circuit may be associated with (e.g., coupled to) a respective sensor pixel 11620. Each peak detector circuit may be configured to determine an amplitude of the sensor pixel signal 11622 generated by the sensor pixel 11620 coupled thereto (e.g., an amplitude of one or more sensor pixel signal pulses of a sensor pixel signal 11622). The processor 11706 may be configured to control (e.g., to activate and/or reset) the one or more peak detector circuits. The processor 11706 may be configured to activate the one or more peak detector circuits based on the fulfillment of the predefined criterion. The processor 11706 may be configured to reset the one or more peak detector circuits after each respective sensor pixel signal 11622.

By way of example, the circuit 11624 may include a first peak detector circuit 11708-1. The first peak detector circuit 11708-1 may be coupled to the first sensor pixel 11620-1. The first peak detector circuit 11708-1 may be configured to determine an amplitude of the first sensor pixel signal 11622-1. The circuit 11624 may include a second peak detector circuit 11708-2. The second peak detector circuit 11708-2 may be coupled to the second sensor pixel 11620-2. The second peak detector circuit 11708-2 may be configured to determine an amplitude of the second sensor pixel signal 11622-2. The processor 11706 may be configured to activate the first peak detector circuit 11708-1 and/or the second peak detector circuit 11708-2 in case that the predefined criterion is fulfilled (e.g., in case that the first value and the second value fulfill the predefined criterion).

The circuit 11624 may include one or more converters (e.g., one or more analog-to-digital converters) configured to convert the output of the one or more peak detector circuits into a digital output. This way the output of the one or more peak detector circuits may be provided to the processor 11706. The processor 11706 may be configured to activate the one or more converters based on the fulfillment of the predefined criterion.

By way of example, the circuit 11624 may include a first analog-to-digital converter 11710-1. The first analog-to-digital converter 11710-1 may be coupled to the first peak detector circuit 11708-1 (e.g., the first analog-to-digital converter 11710-1 may be configured to receive the output of the first peak detector circuit 11708-1). The first analog-to-digital converter 11710-1 may be configured to provide a first digital amplitude value to the processor 11706. The circuit 11624 may include a second analog-to-digital converter 11710-2. The second analog-to-digital converter 11710-2 may be coupled to the second peak detector circuit 11708-2. The second analog-to-digital converter 11710-2 may be configured to provide a second digital is amplitude value to the processor 11706. The processor 11706 may be configured to activate the first analog-to-digital converter 11710-1 and/or the second analog-to-digital converter 11710-2 in case that the predefined criterion is fulfilled.

The (e.g., determined) signal amplitude (e.g., the digital amplitude) may be used to determine the candidate(s) time-of-flight. The processor 11706 may be configured to determine the one or more values for the candidates time-of-flight based on the one or more digital amplitude values. By way of example, the processor 11706 may be configured to determine the first value based on the first digital amplitude value. The processor 11706 may be configured to determine the second value based on the second digital amplitude value.

FIG. 118 shows processing of the first sensor pixel signal 11622-1 and of the second sensor pixel signal 11622-2 in a schematic representation, in accordance with various embodiments.

By way of example, the first sensor pixel signal 11622-1 may include a plurality of sensor pixel signal pulses. A first sensor pixel signal pulse 11802-1 and a second sensor pixel signal pulse 11802-2 may exceed the predefined threshold, L. A corresponding first comparator output 11702-10 may be provided in correspondence of the first sensor pixel signal pulse 11802-1 and of the second sensor pixel signal pulse 11802-2. By way of example, the first comparator output 11702-10 may change from a base level to a predefined level in correspondence of the first sensor pixel signal pulse 11802-1 and of the second sensor pixel signal pulse 11802-2 (e.g., as to soon as and until the first sensor pixel signal 11622-1 exceeds the predefined threshold, L). The other portions of the first sensor pixel signal 11622-1 (e.g., other sensor pixel signal pulses, noise, etc.) may be below the threshold, L, and thus may not lead to a corresponding comparator output.

By way of example, the second sensor pixel signal 11622-2 is may include a plurality of sensor pixel signal pulses. A third sensor pixel signal pulse 11802-3, a fourth sensor pixel signal pulse 11802-4, and a fifth sensor pixel signal pulse 11802-5 may exceed the predefined threshold, L. A corresponding second comparator output **11702-2*o*** may be provided in correspondence of these sensor pixel signal pulses.

The time-to-digital converters may determine a time for each of the first to fifth sensor pixel signal pulses. The first time-to-digital converter 11704-1 may determine a first time in correspondence of the first sensor pixel signal pulse 11802-1 (e.g., 6 in arbitrary units) and a second time in correspondence of the second sensor pixel signal pulse 11802-2 (e.g., 14). The second time-to-digital converter 11704-1 may determine a third time in correspondence of the third sensor pixel signal pulse 11802-3 (e.g., 5), a fourth time in correspondence of the fourth sensor pixel signal pulse 11802-4 (e.g., 10) and a fifth time in correspondence of the fifth sensor pixel signal pulse 11802-5 (e.g., 17).

The processor 11624 may be configured to compare each sensor pixel signal pulse of the first sensor pixel signal 11622-1 with each sensor pixel signal pulse of the second sensor pixel signal 11622-2. The processor 11624 may be configured to determine (e.g., calculate) the time difference between the first sensor pixel signal pulse 11802-1 and each of the sensor pixel signal pulses of the second sensor pixel signal 11622-2. The processor 11624 may be configured to determine the time difference between the second sensor pixel signal pulse 11802-2 and each of the sensor pixel signal pulses of the second sensor pixel signal 11622-2. The processor 11624 may be configured to determine whether two sensor pixel signal pulses (e.g., one of the first sensor pixel signal 11622-1 and one of the second sensor pixel signal 11622-2) may be associated with the light signal 11612 (e.g., with the echo light **11612*r***) based on the respective time difference.

By way of example, the first sensor pixel signal pulse 11802-1 may be associated with stray light 11618 or ambient light (e.g., it may be noise signal). The first sensor pixel signal pulse 11802-1 (e.g., the value determined from the first sensor pixel signal pulse 11802-1) may thus not fulfill the predefined criterion (e.g., any time difference determined based on the first sensor pixel signal pulse 11802-1 may differ from the expected time difference). The processor 11624 may thus be configured to classify the first sensor pixel signal pulse 11802-1 as "non-relevant" or "noise".

By way of example, the second sensor pixel signal pulse 11802-2 may be associated with the light signal 11612. The third sensor pixel signal pulse 11802-3 and the fourth sensor pixel signal pulse 11802-4 may be associated with stray light 11618. The fifth sensor pixel signal pulse 11802-5 may be associated with the light signal 11612.

The second sensor pixel signal pulse 11802-2 may thus not fulfill the predefined criterion when evaluated in combination with the third sensor pixel signal pulse 11802-3 and/or the fourth sensor pixel signal pulse 11802-4. The respective time differences may differ from the expected time difference. The second sensor pixel signal pulse 11802-2 may fulfill the predefined criterion in combination with the fifth sensor pixel signal pulse 11802-5. The time difference between the second sensor pixel signal pulse 11802-2 and the fifth sensor pixel signal pulse 11802-5 may substantially correspond to the expected time difference, $t_x$, (e.g., based on the emission angle, a). The processor 11624 may thus be configured to classify the second sensor pixel signal pulse 11802-2 as "relevant" or "authentic". The processor 11624 may be configured to determine a time-of-flight based on the second sensor pixel signal pulse 11802-2. A similar process may be performed starting the comparison from the second sensor pixel signal 11622-2 (e.g., it may be possible to determine a time-of-flight based on the fifth sensor pixel signal pulse 11802-5).

FIG. 119 shows a chart 11900 related to signal processing, in accordance with various embodiments.

The processor 11624 may be configured to perform the determination (e.g., the verification) over a plurality of light pulses (e.g., the light signal 11612 may include a plurality of light pulses, e.g. of laser pulses). For each light pulse a corresponding event at a sensor pixel 11620 may be triggered. Illustratively, for each light pulse a corresponding sensor pixel signal pulse may be generated (e.g., a plurality of sensor pixel signal pulses in the first sensor pixel signal 11622-1 and/or in the second sensor pixel signal 11622-2). The processor 11624 may thus be configured to determine a plurality of times (e.g., a plurality of time-of-flight) and/or a plurality of time differences. The processor 11624 may be configured to associate the time(s) or the time difference(s) with the highest occurrence (e.g., the highest frequency) with the light signal 11612 (e.g., the time 5, in arbitrary units, in the chart 11900). Illustratively, in case that the light signal 11612 includes a plurality of light pulses, it may be expected that many "relevant" times or time differences may be measured (e.g., more than for sensor pixel signal pulses associated with stray light). The processor 11624 may be configured to classify the sensor pixel signals 11622 (e.g., the sensor pixel signal pulses) based on the frequency of the result of a comparison between a respective first value and a respective second value. The first value may be for each sensor pixel signal pulse of the plurality of first sensor pixel signal pulses (e.g., of the first sensor pixel signal 11622-1). The second value may be for each sensor pixel signal pulse of the plurality of second sensor pixel signal pulses (e.g., of the second sensor pixel signal 11622-2).

In the following, various aspects of this disclosure will be illustrated:

Example 1 r is a LIDAR Sensor System. The LIDAR Sensor System may include a sensor. The sensor may include a first sensor pixel configured to provide a first sensor pixel signal. The sensor may include a second sensor pixel arranged at a distance from the first sensor pixel and is configured to provide a second sensor pixel signal. The sensor may include a pixel signal selection circuit configured to determine at least one first value from the first sensor pixel signal representing at least one first candidate time-of-flight of a light signal emitted by a light source and received by the first sensor pixel. The pixel signal selection circuit may be configured to determine at least one second value from the second sensor pixel signal representing at least one second candidate time-of-flight of the light signal emitted by the light source and received by the second sensor pixel. The pixel signal selection circuit may be configured to verify whether the at least one first value and the at least one second value fulfill a predefined coincidence criterion.

In Example 2r, the subject-matter of example 1 r can optionally include that the second sensor pixel is arranged at a lateral distance from the first sensor pixel.

In Example 3r, the subject-matter of any one of examples 1 r or 2r can optionally include that the first sensor pixel signal includes a plurality of first sensor pixel signal pulses. The second sensor pixel signal may include a plurality of second sensor pixel signal pulses. The pixel signal selection circuit may be further configured to determine a first value for each first sensor pixel signal pulse of the plurality of first sensor pixel signal pulses and/or determine a second value for each second sensor pixel signal pulse of the plurality of second sensor pixel signal pulses. The pixel signal selection circuit may be further configured to verify whether the at least one first value and the at least one second value fulfill a predefined coincidence criterion by comparing a respective first value with a plurality of second values and/or by comparing a respective second value with a plurality of first values.

In Example 4r, the subject-matter of any one of examples 1 r to 3r can optionally include that the predefined coincidence criterion describes the difference between a first event at the first sensor pixel triggering the first sensor pixel signal and a second event at the second sensor pixel triggering the second sensor pixel signal.

In Example 5r, the subject-matter of any one of examples 3r or 4r can optionally include that the predefined coincidence criterion describes the time difference between a first sensor pixel signal pulse and a second sensor pixel signal pulse.

In Example 6r, the subject-matter of any one of examples 1 r to 5r can optionally include that the first value is the first candidate time-off-light of the light signal emitted by the light source and received by the first sensor pixel. The second value may be the second candidate time-of-flight of the light signal emitted by the light source and received by the second sensor pixel.

In Example 7r, the subject-matter of any one of examples 1 r to 6r can optionally include that the distance is at least 5 cm.

In Example 8r, the subject-matter of any one of examples 1 r to 7r can optionally include that the pixel signal selection circuit includes a first comparator circuit coupled to the first sensor pixel and configured to compare the first sensor pixel signal with a predefined first threshold value to provide a first comparator output value. The pixel signal selection circuit may further include a second comparator circuit coupled to the second sensor pixel and configured to compare the second sensor pixel signal with a predefined second threshold value to provide a second comparator output value. The processor may be configured to determine the first value based on the to first comparator output value. The processor may be configured to determine the second value based on the second comparator output value.

In Example 9r, the subject-matter of example 8r can optionally include that the pixel signal selection circuit further includes a first time-to-digital-converter downstream coupled to the first comparator circuit and is synchronized with the emission of the light signal and configured to provide a first output value. The pixel signal selection circuit may further include a second time-to-digital-converter downstream coupled to the second comparator circuit and synchronized with the emission of the light signal and configured to provide a second output value. The pixel signal selection circuit may further include a processor configured to determine the first value based on the first output value. The processor may be configured to determine the second value based on the second output value.

In Example 10r, the subject-matter of any one of examples 8r or 9r can optionally include that the first threshold value is equal to the second threshold value.

In Example 11r, the subject-matter of any one of examples 1 r to 10r can optionally include that the predefined coincidence criterion is defined taking into consideration an emission angle of the light signal with respect to a predefined direction.

In Example 12r, the subject-matter of example 11r can optionally include that the predefined direction is the horizontal direction or the vertical direction.

In Example 13r, the subject-matter of any one of examples 8r to 12r can optionally include that the pixel signal selection circuit further includes a first peak detector circuit coupled to the first sensor pixel and configured to determine an amplitude of the first sensor pixel signal. The pixel signal selection circuit may further include a second peak detector circuit coupled to the second sensor pixel and configured to determine an amplitude of the second sensor pixel signal.

In Example 14r, the subject-matter of example 13r can optionally include that the processor is configured to activate the first peak detector circuit and/or the second peak detector circuit if the predefined coincidence criterion is fulfilled.

In Example 15r, the subject-matter of any one of examples 9r to 14r can optionally include that the pixel signal selection circuit further includes a first analog-to-digital converter downstream coupled to the first peak detector circuit to provide a first digital amplitude value to the processor. The pixel signal selection circuit may further include a second analog-to-digital converter downstream coupled to the second peak detector circuit to provide a second digital amplitude value to the processor.

In Example 16r, the subject-matter of example 15r can optionally include that the processor is configured to activate the first analog-to-digital converter and/or the second analog-to-digital converter if the predefined coincidence criterion is fulfilled.

In Example 17r, the subject-matter of any one of examples 15r or 16r can optionally include that the processor is configured to determine the first value based on the first digital amplitude value. The processor may be configured to determine the second value based on the second digital amplitude value.

In Example 18r, the subject-matter of any one of examples 1r to 17r can optionally include that the LIDAR Sensor System further includes the light source configured to emit the light signal.

In Example 19r, the subject-matter of example 18r can optionally include that the light source includes at least one laser light source.

In Example 20r, the subject-matter of any one of examples 18r or 19r can optionally include that the light source is configured to emit the light signal including a plurality of light pulses. The processor may be further configured to determine a time-of-flight value based on the at least one first value and the at least one second value and on the verification result.

In Example 21r, the subject-matter of any one of examples 1 r to 20r can optionally include that the LIDAR Sensor System is configured as a scanning LIDAR Sensor System.

In Example 22r, the subject-matter of any one of examples 11r to 21r can optionally include that the predefined direction is the scanning direction of the LIDAR Sensor System.

In Example 23r, the subject-matter of any one of examples 1r to 22r can optionally include that the first sensor pixel includes a first photo diode. The second sensor pixel may include a second photo diode.

In Example 24r, the subject-matter of example 23r can optionally include that the first photo diode is a first pin photo diode. The second photo diode may be a second pin photo diode.

In Example 25r, the subject-matter of example 23r can optionally include that the first photo diode is a first photo diode based on avalanche amplification. The second photo diode may be a second photo diode based on avalanche amplification In Example 26r, the subject-matter of example 25r can optionally include that the first photo diode includes a first avalanche photo diode. The second photo diode may include a second avalanche photo diode.

In Example 27r, the subject-matter of example 26r can optionally include that the first avalanche photo diode includes a first single photon avalanche photo diode. The second avalanche photo diode may include a second single photon avalanche photo diode.

Example 28r is a method of operating LIDAR Sensor System. The method may include a first sensor pixel providing a first sensor pixel signal. The method may include a second sensor pixel, arranged at a distance from the first sensor pixel, the second sensor pixel providing a second sensor pixel signal. The method may include determining at least one first is value from the first sensor pixel signal representing at least one first candidate time-of-flight of a light signal emitted by a light source and received by the first sensor pixel. The method may include determining at least one second value from the second sensor pixel signal representing at least one second candidate time-of-flight of the light signal emitted by the light source and received by the second sensor pixel. The method may include verifying whether the at least one first value and the at least one second value fulfill a predefined coincidence criterion.

In Example 29r, the subject-matter of example 28r can optionally include that the second sensor pixel is arranged at a lateral distance from the first sensor pixel.

In Example 30r, the subject-matter of any one of examples 28r or 29r can optionally include that the first sensor pixel signal includes a plurality of first sensor pixel signal pulses. The second sensor pixel signal may include a plurality of second sensor pixel signal pulses. The method may further include determining a first value for each first sensor pixel signal pulse of the plurality of first sensor pixel signal pulses and/or determining a second value for each second sensor pixel signal pulse of the plurality of second sensor pixel signal pulses. The method may further include verifying whether the at least one first value and the at least one second value fulfill a predefined coincidence criterion by comparing a respective first value with a plurality of second values and/or by comparing a respective second value with a plurality of first values.

In Example 31r, the subject-matter of any one of examples 28r to 30r can optionally include that the predefined coincidence criterion describes a difference between a first event at the first sensor pixel triggering the first sensor pixel signal and a second event at the second sensor pixel triggering the second sensor pixel signal.

In Example 32r, the subject-matter of any one of examples 30r or 31 can optionally include that the predefined coincidence criterion describes the time difference between a first sensor pixel signal pulse and a second sensor pixel signal pulse.

In Example 33r, the subject-matter of any one of examples 28r to 32r can optionally include that the first value is the first candidate time-of-flight of the light signal emitted by the light source and received by the first sensor pixel. The second value may be the second candidate time-of-flight of the light signal emitted by the light source and received by the second sensor pixel.

In Example 34r, the subject-matter of any one of examples 28r to 33r can optionally include that the distance is at least 5 cm.

In Example 35r, the subject-matter of any one of examples 28r to 34r can optionally include that the predefined coincidence criterion is predefined taking into consideration an emission angle of the light signal with respect to a predefined direction.

In Example 36r, the subject-matter of example 35r can optionally include that the predefined direction is the horizontal direction or the vertical direction.

In Example 37r, the subject-matter of any one of examples 35r or 36r can optionally include that the light source emits the light signal including a plurality of light pulses. The processor may determine a time-off-light value based on the at least one first value and the at least one second value and on the verification result.

Example 38r is a computer program product, including a plurality of program instructions that may be embodied in non-transitory computer readable medium, which when executed by a computer program device of a LIDAR Sensor System of any one of examples 1 r to 27r, cause the LIDAR Sensor System to execute the method of any one of the examples 28r to 37r.

Example 39r is a data storage device with a computer program that may be embodied in non-transitory computer readable medium, adapted to execute at least one of a method for LIDAR Sensor System of any one of the above method examples, a LIDAR Sensor System of any one of the above LIDAR Sensor System examples.

The LIDAR Sensor System according to the present disclosure may be combined with a LIDAR Sensor Device for illumination of an environmental space connected to a light control unit.

There are about 1 billion cars, trucks and buses on the road with a yearly worldwide production of new vehicles between 70 and 90 million. However, only a tiny fraction is equipped with a LIDAR Sensor Device meaning that all other cars cannot enjoy the enhanced safety resulting from such Distance Measurement Devices, for example based on Time-of-Flight (ToF) measurement.

Therefore, there is a need for a LIDAR Sensor System that could be easily mounted to a vehicle and easily operated, for example in a plug-and-play manner. Such a LIDAR Sensor System may be denoted as Retrofit LIDAR Sensor System. In addition, such a system could even allow a customer to personalize it according to the personal requirements.

Of course, it is understood that certain standards, e.g. safety standards and other regulations must be obeyed, for example, that the den vice must reliably function within a certain temperature range and mounted in a safe way.

It is further understood that such a Retrofit LIDAR Sensor Device may work as a portable device, which may be configured (with respect to its shape and weight) as a handheld device, and thus e.g. as a stand-alone device and not be connected to or make use of any support function a car may offer. The portable device may e.g. have a weight in the range from about 100 g to about 1 kg, e.g. in the range from about 150 g to about 500 g, e.g. in the range from about 200 g to about 300 g. The portable device may e.g. have a size (width*length*thickness) in the range from about 3 cm to about 20 cm (width)*about 3 cm to about 20 cm (length) *about 0.5 cm to about 5 cm (thickness). Otherwise, severe restrictions would have to be imposed on the system in order to avoid compatibility issues when connecting such a Retrofit LIDAR Sensor Device with a wide range of different car sensor and safety architectures provided by different carmakers. In addition, modifications in future generations of car sensor and safety architectures, like new hardware, new software or just a software update, might undermine a previous compatibility.

It is also understood that vehicle regulation may prohibit mounting of such system on the exterior, and that mounting on the inside, for example behind the windscreen (windshield) or on top of the dashboard, may be advantageous mounting positons. The mounting position may be selected so that the LIDAR Sensor Device benefits from a clean window, that is, it may be positioned on a spot where the windscreen can be cleaned with a windshield wiper or by heating elements (window defroster). Mounting itself may be easily done by using a mounting bracket or other know mounting devices which can be attached to the car. Depending on car type, for example in regard to windscreen inclination or then length of the bonnet, specific mounting instruction may be provided.

Standard car windshields are usually made from laminated or tempered glass materials that are transmissive for visible light (from about 380 nm to about 780 nm) and at least in the very near infrared wavelength range (form about 780 nm up to approximately 1100 nm), possibly extending beyond that range. A windscreen may be partially colored in order to deflect is unwanted solar heat radiation.

Therefore, visible and infrared LIDAR Sensor Devices can be mounted behind a windshield (inside the car) and operated with specific wavelengths like 805 nm, 905 nm, and 940 nm. Some frequencies may be preferred in order to comply with laser safety classes, for example according to IEC 825.

It is also understood that such a Retrofit LIDAR sensor device may not be equipped to provide all functions of a regular, full-blown, LIDAR system, since the demand for a stand-alone operation at low cost may put limitations on the device. However, such a Retrofit LIDAR sensor device may be configured to allow and/or execute an initial calibrating routine, either initiated by a user or by system default, in order to check, for example, proper mechanical installation, proper orientation, laser power setting, function of a scanning system, communication ports (Bluetooth, Wi-Fi), GPS function, Graphical User Interface (GUI), proper operation of a user's smartphone APP, and the like.

This means that such a Retrofit LIDAR sensor device may mainly serve as a distance measurement device, and in particular a Time-of-Flight measurement device, within a certain (limited) Field-of-Illumination (FOI) and Field of View (FoV), for example, within an azimuthal angular range of 1° to 6°, maybe up to 15° or 30° and within a certain elevation angle, for example between 3° and 10°. This would still sufficiently allow to track the distance to the preceding vehicle which may be provided to employ driver alert and proper warning functions. It is also conceivable that the Retrofit LIDAR sensor device may be configured to perform micro-scanning, for example within an azimuthal range of 0.5°, and with a frequency of 2 Hz, thus allowing distance measurements within a range from about 1 m up to about 200 m.

In order to track preceding cars, the Retrofit LIDAR Sensor Device should be able to measure distances within a range of a about 10 m to 50 m, possibly also beyond, like up to 100 m or 150 m.

As already mentioned, the suggested Retrofit LIDAR Sensor Device should work on a stand-alone basis, at least with respect to performing a ToF-function.

LIDAR sensor devices may employ a variety of detection and measuring techniques, like flash, scan and hybrid sensing systems. Beam steering may be done, for example, by techniques like: scanning mirror systems, scanning fiber systems, Optical Phase Array (OPA) systems, the use of Liquid Crystal Meta-Surfaces (LCM) and others. As sensors for visible and infrared radiation, photo diodes like Avalanche Photo Diodes (APD), Single Photon Avalanche Diodes (SPAD), Silicon Photomultipliers (SiPM) and the like can be used.

It might be beneficial if a stand-alone Retrofit LIDAR sensor device could also provide information about its own travel velocity, however, this might necessitate measurement of car velocity relative to a fixed object, for example a sign-post. Though in principle possible, and therefore not excluded from the scope of this disclosure, this feature might only be doable in a more sophisticated Retrofit LIDAR sensor device that can measure both, distance and speed of a preceding car and speed of its own car.

However, the suggested Retrofit LIDAR Sensor Device may be configured to measure not just the distance to a preceding car, but also its speed and acceleration, for example, if the measured distance data are compared with the own vehicle's GPS locations, and use this information for car steering and travel advice.

It is also conceivable that the Retrofit LIDAR sensor device is configured to also measure the distance to fixed objects on the sidelines, for example, street-posts or sign-posts, and use this information to calculate the speed and/or acceleration of the own vehicle, since it is equipped with such a Retrofit LIDAR Sensor Device.

It is further conceivable that the Retrofit LIDAR Sensor Device receives information from an external source about its location, speed and acceleration, because mounted inside a vehicle, and use this information for further calculations and derived actions as described in this disclosure. Various aspects of what kind of information may be transferred and how is described in more detail herein.

A convenient way to measure vehicle speed is to employ a GPS signal connection to an exterior device, like a GPS station or a GPS-satellite that can provide vehicle position, change of vehicle position and therefore vehicle speed and/or acceleration based on triangulation or other methods. This information may be combined with accelerometer sensors, as are usually integrated into smartphones. In various embodiments, it is suggested that the disclosed Retrofit LIDAR sensor device is employed with GPS communication functions, and optionally also with an accelerometer sensor. All this may be embedded into a Communication Unit (CU).

In order to communicate with other equipment, the Retrofit LIDAR sensor device may be further equipped with BLUETOOTH functions and/or Wi-Fi functions. By this, communication to external devices like a Smartphone or a car radio may be established. Through such (bi-directional) communication channels, the Retrofit LIDAR sensor device can obtain access to additional information provided by these external devices, for example regarding weather conditions, traffic conditions and the like. Since the Retrofit LIDAR sensor device can communicate with a driver's smartphone, the camera picture as well as all relevant tilt (azimuth and elevation) and yaw angles can be transmitted and displayed.

The Retrofit LIDAR sensor device may be equipped with other sensors as well, like a temperature sensor, an ambient light sensor, an inclination sensor for measuring its tilt angle, and a camera system, including integrated LIDAR-camera systems, e.g. having one or more stacked photo diodes as also described herein. As already mentioned, the Retrofit LIDAR sensor device can communicate with a driver's smartphone and display camera pictures as well as all relevant tilt (azimuth and elevation) and yaw angles. In principle, it may be beneficial to provide a holder for a smartphone directly attached to the Retrofit LIDAR sensor device in order to establish a known positional relationship between Smartphone and the Retrofit LIDAR sensor device.

A driver's and vehicle passenger's smartphone would have an application software installed (thereafter also called APP), especially as downloaded by a user to a mobile device, that functions as Graphical User Interface (GUI).

As already described, the Retrofit LIDAR sensor device measures distance, and possibly also velocity and acceleration, of a preceding car. In one embodiment, the Retrofit LIDAR sensor device only provides information about the measured distance values, for example, displayed on the display of a connected smartphone, for example as color and/or text and/or symbol. In another embodiment, the measured distance values are evaluated by the Computer System (see below) based on a Safety Regulation System which puts the measured distance values in relationship to other measured or calculated data or to stored data, all relevant for driver safety. Of course, in order to derive proper actions from such a measurement, a Safety Regulation System may be applied first. The Safety Regulation System would have to get an initial setting, that may be adapted over time or during driving, that enables the Safety Regulation System to perform proper warning actions.

Therefore, the Retrofit LIDAR sensor device is equipped with a user interface, for example, a graphical user interface (GUI), a keypad, a microphone for voice control, a loudspeaker, and a display than can display colors, symbols and text.

Such an interface allows a user to input safety relevant data of the vehicle that is using the Retrofit LIDAR sensor device and/or personal data. Vehicle data may include, for example, vehicle type and age, mileage, summer or winter tires, road conditions, Off-Road settings, time and geographical setting. The latter ones may also be needed in order differentiate between right and left side driving. It is understood that time and geographical data may also be obtained via GPS information exchange. Personal data of the driver may comprise age, driving history, driving experience, medical or health related data, and the like.

Such data may be keyed in, transferred by voice, or by upload of a data file. The Retrofit LIDAR sensor device is configured to handle this information using its Software Management System that is also configured to bi-directionally communicate with the installed APP on the user's smartphone. Such an APP could be provided by the seller of the Retrofit LIDAR sensor device, either by purchase or as a license, or by Third Parties, for example, by a certified traffic Management Organization or a Federal Motor Transport Authority (FMTA) thus ensuring that the same safety standards are commonly applied.

As already mentioned, the Retrofit LIDAR sensor device may be equipped with data input and output connections, data storage and retrieval system, a Computer Program Device operating a suited software for data analysis and data handling, and that may also be configured to bi-directionally communicate with the provided Smartphone Software APP. All this can be part of a Control and Communication System that may be configured to perform Data Analytics. Such Data Analytics may be performed by the to Compute Unit of the Retrofit LIDAR Sensor Device and/or by the user's smartphone CPU (Central Processing Unit), at least in a supportive way. Since a user's smartphone can communicate its own measured values about location, speed, acceleration (positive or negative) and device orientation to the Retrofit LIDAR Sensor Device, the latter can use these data as well for its is own calculations. The Smartphone APP can facilitate such a communication and data transfer.

Data Analytics would also allow to see if a car has a negative acceleration (breaking) and/or if a car has not exceeded a minimum velocity threshold, and then decide that no LIDAR functions may be performed (adjustable by safety settings) or performed but not displayed or communicated by sound (as described above).

The Software Management System is configured to receive input provided by the ToF-Measurement System of the Retrofit LIDAR sensor device. This input may comprise the distance to the preceding vehicle and optionally also its speed and/or the speed of its own car.

The Software Management System is then configured (Soft- and Hardware) to calculate a proper safety distance to the preceding car as a function of the received above described vehicle, environmental and personal input data, at least as far as they are pertinent to official safety regulations. Additionally, if the Retrofit LIDAR sensor device is equipped with a speed measurement device, also the car's own velocity may serve as input data.

Calculation of a proper safety distance may include to perform a comparison between the actual distances and/or vehicle speed and/or acceleration as well as other user input data (see above) with the safety regulations stored in a data bank of the Retrofit LIDAR sensor device or as communicated by the User APP and/or by other input data.

For ease, a driver may just key in a safety level value (setting), either into the user's APP or directly into the Retrofit LIDAR Sensor Device.

If a condition is met, for example, the distance to the preceding car is adequate, the Retrofit LIDAR Sensor Device may, directly on its GUI or via the user's APP, provide a symbol or color code to a display, for example a color code for a green color, that signals that everything is OK.

In case of danger, that is when the calculated or selected safety level setting is not fulfilled, a warning color code (like yellow or red) may be presented, optionally also with a warning sound, for example directly via a loudspeaker of the Retrofit LIDAR sensor device, or via the smartphone or the car radio system, thus alerting the driver of a dangerous situation. The displayed color codes may be flashed with increasing frequency as the dangerous situation builds up. The display of proper warning settings may be part of a regulation. For example, a yellow color may indicate that a legal requirement is not met, and a flashing red color may indicate that a user's personal (stricter) safety settings are violated, possibly leading to a life threatening situation.

The Retrofit LIDAR sensor device may also be equipped with a sonar sensor system, for example based on ultrasound waves, and similar measuring and detecting techniques as well as warning settings may be applied.

It is also conceivable that the Retrofit LIDAR sensor device includes an authentication device, like a fingerprint sensor or a visual (eye, face) recognition system. This would allow proper identification of the driver and easy retrieval of already stored information, like personal input data, preferred security settings, selected ethical codes and the like.

It is understood that all data handling may involve proper encryption methods.

Since operation of such a suggested Retrofit LIDAR sensor device needs electrical power, the Retrofit LIDAR sensor device may be equipped with rechargeable batteries, be connectable to power banks, be connectable to a car's charging outlet (12V, 24V) or the like.

Of course, it would be the aim to make the suggested Retrofit LIDAR sensor device as lightweight and energy efficient as possible, and for example, use similar techniques as already employed for Retrofit LIDAR sensor device used in drones or other Unmanned Aerial Vehicles (UAV) or transportable robotic systems.

Energy consumption may impose a limiting factor for autonomously driving electrical vehicles. There are quite a number of energy consuming devices like sensors, for example RADAR, LIDAR, camera, ultrasound, Global Navigation Satellite System (GNSS/GPS), sensor fusion equipment, processing power, mobile entertainment equipment, heater, fans, Heating, Ventilation and Air Conditioning (HVAC), Car-to-Car (C2C) and Car-to-Environment (C2X) communication, data encryption and decryption, and many more, all leading up to a high power consumption. Especially data processing units are very power hungry. Therefore, it may be provided to optimize all equipment and use such devices in intelligent ways so that a higher battery mileage can be sustained.

FIG. 1 shows schematically an embodiment of the proposed Retrofit LIDAR Sensor System, Controlled Retrofit LIDAR Sensor System and Retrofit LIDAR Sensor Device.

The Retrofit LIDAR sensor system 10 may include a First LIDAR Sensing System 40 that may include a light source 42 configured to emit electro-magnetic or other radiation 120, e.g. a continuous-wave or pulsed laser radiation in the visible and/or infrared wavelength range, a light source controller 43 and related software, beam steering and modulation devices 41, e.g. light steering and reflection devices, for example Micro-Mechanical Mirror Systems MEMS, with a related control unit 150, optical components 80, for example lenses and/or holographic elements, a LIDAR sensor management system 90 configured to manage input and output data that are required for the proper operation of the First LIDAR Sensing System 40.

The First LIDAR Sensing System 40 may be connected to other LIDAR Sensor System devices, for example to a Control and Communication System 70 that is configured to manage input and output data that are required for the proper operation of the First LIDAR Sensor System 40.

The Retrofit LIDAR sensor system 10 may include a Second LIDAR Sensing System 50 that is configured to receive and measure electromagnetic or other radiation, using a variety of sensors 52 and sensor controller 53.

The Second LIDAR Sensing System may include detection optics 82, as well as actuators for beam steering and control 51.

The Retrofit LIDAR sensor system 10 may further include a LIDAR Data Processing System 60 that performs signal processing 61, data analysis and computing 62, sensor fusion and other sensing functions 63. Again, as already described before, data processing, data analysis and computing may be done by using, at least in a supportive way, the connected smartphone's CPU or that of any other suitable and connected device including any cloud based services.

The Retrofit LIDAR sensor system 10 may further include a control and communication system 70 that receives and outputs a variety of signal and control data 160 and serves as a Gateway between various functions and devices of the LIDAR sensor system 10 and/or to other eternal devices, like a smartphone, a GPS signal transmitter and receiver, a radio system, and the like.

The Retrofit LIDAR sensor system 10 may further include one or many camera systems 81, either integrated into the LIDAR sensor 52, stand-alone or combined with another Lidar sensor system 10 component or embedded into another Lidar sensor system 10 component, and data-connected to various other devices like to components of the Second LIDAR Sensing System 50 or to components of the LIDAR data processing system 60 or to the control and communication system 70.

The Retrofit LIDAR sensor system 10 may be integrated or embedded into a LIDAR Sensor Device 30, for example a housing, a vehicle, a vehicle headlight.

The Controlled LIDAR Sensor System 20 is configured to control the LIDAR Sensor System 10 and its various components and devices, and performs or at least assists in the navigation of the LIDAR Sensor Device 30. The Controlled LIDAR Sensor System 20 may be further configured to communicate for example with another vehicle or a communication networks and thus assists in navigating the LIDAR Sensor Device 30.

As explained above, the Retrofit LIDAR sensor system 10 is configured to emit electro-magnetic or other radiation in order to probe the environment 100 for other objects, like cars, pedestrians, road signs, and road obstacles. The LIDAR Sensor System 10 is further configured to receive and measure electromagnetic or other types of object-reflected or object-emitted radiation 130, but also other wanted or unwanted electromagnetic radiation 140, in order to generate signals 110 that can be used for the environmental mapping process, usually generating a point cloud that is representative of the detected objects.

Various components of the Controlled LIDAR Sensor System 20 use Other Components or Software 150 to accomplish signal recognition and processing as well as signal analysis. This process may include the use of signal information that come from other sensor devices. These sensors may be internal sensors of the suggested Retrofit LIDAR Sensor System or external, for example, the sensors of a connected smartphone or that of the vehicle.

In the following, various aspects of this disclosure will be illustrated:

Example 1l is a LIDAR sensor device. The LIDAR sensor device may include a portable housing, a LIDAR transmitting portion, a LIDAR receiving portion, and an interface configured to connect the LIDAR sensor device to a control and communication system of a LIDAR sensor system and to provide a communication connection with the control and communication system.

In Example 2l, the subject matter of Example 1l can optionally include that the portable housing is configured as a handheld housing.

In Example 3l, the subject matter of any one of Examples 1l or 2l can optionally include that the interface includes a user interface.

In Example 4l, the subject matter of Example 3l can optionally include that the user interface includes a graphical user interface.

In Example 5l, the subject matter of any one of Examples 1l to 4l can optionally include that the control and communication system includes a graphical user interface configured to communicate via the user interface with the LIDAR sensor device.

In Example 6l, the subject matter of any one of Examples 1l to 5l can optionally include that the control and communication system includes a communication terminal device. The communication terminal device includes a graphical user interface configured to communicate via the user interface with the LIDAR sensor device.

In Example 7l, the subject matter of any one of Examples 1l to 6l can optionally include that the LIDAR sensor device is configured as a stand-alone device.

In Example 8l, the subject matter of any one of Examples 1l to 7l can optionally include that the LIDAR sensor device further includes a is communication interface configured to provide a communication with a vehicle.

In Example 9l, the subject matter of any one of Examples 1l to 8l can optionally include that the control and communication system is configured to implement a calibrating routine configured to calibrate the LIDAR transmitting portion and/or the LIDAR receiving portion.

In Example 10l, the subject matter of any one of Examples 1l to 9l can optionally include that the LIDAR receiving portion includes a sensor and a sensor controller configured to control the sensor.

In Example 11l, the subject matter of Example 10l can optionally include that the sensor includes at least one photo diode.

In Example 12l, the subject matter of any one of Examples 1l to 11l can optionally include that the LIDAR control and communication system is configured to generate one or more warning alert signals in response to the occurrence of a predefined event.

Example 13l is a LIDAR sensor system. The LIDAR sensor system may include a LIDAR sensor device of any one of Examples 1l to 12l, and a LIDAR control and communication system coupled to the LIDAR sensor device.

In Example 14l, the subject matter of Example 13l can optionally include that the LIDAR sensor system further includes a communication terminal device configured to implement the LIDAR control and communication system.

In Example 15l, the subject matter of Example 14l can optionally include that the communication terminal device includes a mobile communication terminal device.

In Example 16l, the subject matter of Example 15l can optionally include that the mobile communication terminal device includes a smartphone.

In Example 17l, the subject matter of any one of Examples 13l to 16l can optionally include that the LIDAR sensor system further includes a data base storing safety settings of the LIDAR sensor system.

Example 18l is a method of controlling a LIDAR sensor device. The LIDAR sensor device may include a portable housing, a LIDAR transmitting portion, a LIDAR receiving portion, and an interface configured to connect the LIDAR sensor device to a control and communication system of a LIDAR sensor system and to provide a communication connection with the control and communication system. The method may include the control and communication system controlling the LIDAR transmitting portion and/or the LIDAR receiving portion via the user interface.

In Example 19l, the subject matter of Example 18l can optionally include that the portable housing is configured as a handheld housing.

In Example 20l, the subject matter of any one of Examples 18l or 19l can optionally include that the interface includes a user interface.

In Example 21l, the subject matter of Example 20l can optionally include that the user interface includes a graphical user interface.

In Example 22l, the subject matter of any one of Examples 18l to 21l can optionally include that the control and communication system includes a graphical user interface configured to communicate via the user interface with the LIDAR sensor device.

In Example 23l, the subject matter of any one of Examples 18l to 22l can optionally include that the control and communication system includes a communication terminal device. A graphical user interface of the is communication terminal device communicates via the user interface with the LIDAR sensor device.

In Example 24l, the subject matter of any one of Examples 18l to 23l can optionally include that the method further includes a communication interface providing a communication with a vehicle.

In Example 25l, the subject matter of any one of Examples 18l to 24l can optionally include that the control and communication system performs a calibrating routine configured to calibrate the LIDAR transmitting portion and/or the LIDAR receiving portion.

In Example 26l, the subject matter of any one of Examples 18l to 25l can optionally include that the LIDAR receiving portion includes a sensor and a sensor controller controlling the sensor.

In Example 27l, the subject matter of Example 26l can optionally include that the sensor includes at least one photo diode.

In Example 28l, the subject matter of any one of Examples 18l to 27l can optionally include that the LIDAR control and communication system generates one or more warning alert signals in response to the occurrence of a predefined event.

Example 29l is a method of operating a LIDAR sensor system. The method may include a method of any one of Examples 18l to 28l, and a LIDAR control and communication system controlling the LIDAR sensor device.

In Example 30l, the subject matter of Example 29l can optionally include that the method further includes a communication terminal device implementing the LIDAR control and communication system.

In Example 31l, the subject matter of Example 30l can optionally include that the communication terminal device includes a mobile communication terminal device.

In Example 32l, the subject matter of Example 3l can optionally include that the mobile communication terminal device includes a smartphone.

In Example 33l, the subject matter of any one of Examples 29l to 32l can optionally include that the method further includes a data base storing safety settings of the LIDAR sensor system.

Example 34l is a computer program product. The computer program product may include a plurality of program instructions that may be embodied in non-transitory computer readable medium, which when executed by a computer program device of a LIDAR sensor device according to any one of Examples 1l to 12l, cause the LIDAR sensor device to execute the method according to any one of the claims **18*l* to 28*l***.

Example 35l is a computer program product. The computer program product may include a plurality of program instructions that may be embodied in non-transitory computer readable medium, which when executed by a computer program device of a LIDAR sensor system according to any one of Examples 13l to 17l, cause the LIDAR sensor system to execute the method according to any one of the claims **29*l* to 33*l***.

Example 36l is a data storage device with a computer program that may be embodied in non-transitory computer readable medium, adapted to execute at least one of a method for LIDAR sensor device according to any one of the above method Examples, a LIDAR sensor device according to any one of the above LIDAR sensor device Examples.

Example 37l is a data storage device with a computer program that may be embodied in non-transitory computer readable medium, adapted to execute at least one of a method for LIDAR Sensor System according to any one of the above method Examples, a LIDAR Sensor System according to any one of the above LIDAR Sensor System Examples.

An optical ranging sensor or an optical ranging system may be based on direct time-of-flight measurements. The time-of-flight may be measured directly, for example by considering (e.g., measuring) the timing between an emitted pulse and a received pulse associated thereto. The time-of-flight may be measured indirectly, wherein some intermediate measure (e.g., a phase shift of a modulated signal) may be used to measure or to calculate the time-of-flight. A direct time-of-flight sensor or a direct time-of-flight system (e.g., a sensor system) may be realized according to a predefined scanning scheme. By way of example, an optical ranging system may be a Flash-LIDAR with diffusive emission or multi-beam emission. As another example, an optical ranging system may be a scanning LIDAR. The scanning LIDAR may include, for example, a mechanically spinning head. A scanning LIDAR including a mechanically spinning head may include a plurality of moving components, thus providing a rather large, expensive, and slow system. Additionally or alternatively, the scanning LIDAR may include a MEMS mirror, for example a 1D or 2D scanning mirror. A scanning LIDAR including a MEMS mirror may be cheaper than a scanning LIDAR including a mechanically spinning head, but it may still be rather slow. As a further example, an optical ranging system may be based on a hybrid approach, e.g. it may be configured as a hybrid-Flash system, where the scanning may be performed column-wise or row-wise.

A conventional optical ranging sensor or a conventional optical ranging system may be not very flexible and one or more relevant parameters may not be adaptable, for example based on a current driving situation (e.g., driving scene, traffic density, environmental conditions, and the like). Such parameters may include, for example, the image acquisition rate, which may be defined by the MEMS mirror resonance frequency, the resolution, which may be defined by the detector resolution, and the Signal-to-Noise Ratio (SNR), which may be defined by the detector pixel size. Such parameters may not be adapted during runtime. In addition, such parameters may not be adapted locally over the field of view (FOV) of the optical ranging system.

A conventional detector may include a 1D-array or a 2D-array with a given number of detector pixels. The signal from each detector pixel may be individually amplified and digitized. Alternatively, the signals from the various detector pixels may be multiplexed. The multiplexing may lead to noise and other crosstalk impairments. A detector array for high resolution may be expensive and may be associated with complex electronics. Furthermore, a detector array may exhibit crosstalk impairments and/or low efficiency due to a filling factor lower than 1. Specific imaging optics may be provided (illustratively, to direct light onto the detector). Such specific imaging optics may be expensive due to the size and the required precision assembly.

On the emitter side, a conventional optical ranging system may include an edge emitting laser, such as a single laser diode or a line array. The edge emitting laser may be combined with some scanning mechanism. Alternatively, an optical ranging system may include a vertical cavity surface emitting laser (VCSEL), for example an optical ranging system may be a VCSEL-based LIDAR performing a simple column scan.

A VCSEL-array may be manufactured from a single die to with individual control (e.g., a 2D-VCSEL-array may be easily fabricated). VCSEL-pixel may be monolithically grown on one common substrate, thus allowing for high lateral accuracies. Illustratively, as compared to an edge-emitting laser, a VCSEL-array may be manufactured without a pick-and-place process. A VCSEL-array may be manufactured without alignment between is individual laser points. Cheap intermediate testing and/or testing during the production may be provided for manufacturing a VCSEL-array. A VCSEL (e.g., a single-mode or a multi-mode VCSEL) may produce a narrow linewidth (e.g., a full-width half-maximum spectral width smaller than 1 nm) with very low temperature shifting (e.g., about 1.4 nm per 20° C.). The emission of a VCSEL may be more stable than the emission of an edge emitting laser. The narrow linewidth emission may enable narrowband filtering. This may provide the effect of reducing ambient light and/or shot noise, thus improving the SNR. The optical output power of the individual pixels of a VCSEL may be lower than the optical output power of an edge emitting laser.

Single-pixel imaging (also referred to as computational imaging) may be described as an imaging approach that uses the concept of compressed sensing. The underlying principle of a single-pixel camera may be described as providing a camera with two-dimensional resolution using only one photodetector (illustratively, a single-pixel detector). By way of example, a Digital Mirror Device (DMD) may be provided. The DMD may be a 2D-array of micro-mirrors, each of which may be independently tilted (in other words, individually tilted). The micro-mirrors may be controlled in such a way that the light from a scene may be (or not) directed to the single-pixel detector.

In a so-called raster-scan method, only one micro-mirror may be controlled to direct the light from the scene to the detector at each measurement cycle. By sequentially controlling all the micro-mirrors in the DMD device, a full two-dimensional image may be captured. In case the DMD device has N micro-mirrors (e.g., arranged in a 2D array), the captured image may have a resolution of N pixels obtained after N measurements. This approach may be time consuming.

In a so-called compressed sensing (CS) method, the micro-mirrors may be tilted in a random pattern. Illustratively, the micro-mirrors may be seen as a (e.g., random) pattern of dark and bright pixels (e.g., mirror pixels), e.g. according to a random pattern of 0s and 1s. In this configuration, the light from about 50% of the pixels (illustratively, 50% of the micro-mirrors) may be directed to the detector. At the detector, the sum of the incoming light may be measured within a single measurement cycle. For the next measurement, a different random pattern may be selected. The process may be repeated M-times. Illustratively, M random patterns may be generated and M sum signals may be measured over M measurement cycles.

The random pattern of the micro-mirrors may be determined in different ways. By way of example, the random pattern may be drawn as independent and identically distributed (i.i.d.)+/−1 random variables from a uniform Bernoulli distribution. As another example, the random pattern may be drawn from an i.i.d. zero-mean, 1/N variance Gaussian distribution. As a further example, the random pattern may be drawn from randomly permuted vectors, e.g. from standard orthonormal bases or random subsets of basis vectors, such as Fourier, Walsh-Hadamard, or Noiselet bases.

The compressed sensing method may provide a same or similar result as the raster scanning method with a smaller number of measurement cycles (illustratively, M may be smaller than N). The compressed sensing method may be about 5 times faster or about 50 times faster as compared to a raster scanning method for image acquisition (e.g., in case the detected signals may be measured and processed at a high resolution in time).

The operation of the compressed sensing method may be related to the property of most natural images of being expressible in terms of orthonormal basis vectors using sparse coefficient vectors (illustratively, coefficient vectors with only a small number of nonzero coefficients). By way of example, a base may be selected from cosines, wavelets, or curvelets. Functions that represent random tilting of the micro-mirrors (illustratively, the 0s and 1s) may be mathematically incoherent with said orthonormal bases. This may provide the effect of an automatic compression at the detector level (illustratively, the compressed sensing measurement may already represent a compressed version of the original image). An additional computational step may be performed to obtain (e.g., to reconstruct) the actual image from the compressed sensing measurement. The computational step may be performed by software, e.g. software configured to solve mathematical equations (e.g., a solver). An optimization method may be implemented for reconstructing the image from the random measurements, for example a VI-optimization method. The optimization problem may be described as a convex optimization problem (e.g., solvable by means of a linear program, such as basis pursuit). Additionally or alternatively, the image reconstruction may be performed by means of a greedy stochastic algorithm and/or a variational algorithm.

In the compressed scanning method, with respect to the raster scanning method, only one detector pixel (e.g., with larger dynamic range) may be used. This may provide the possibility of employing a highly sophisticated detector without an excessive increase in the cost of the system. In addition, in the compressed scanning method about 50% of the mirrors may be tilted (e.g., at each cycle). This may provide a greater amount of emitted light with respect to the raster scanning method. This may provide a greater SNR.

An imaging method using structured light may also be provided. Such process may be illustratively described as reciprocal to the compressed sensing method (illustratively, such process may be carried out by controlling the light emission rather than the light detection, e.g. by controlling the emitter side rather than the receiver side). The scene may be illuminated by using a projector that displays a sequence of random patterns. The back-scattered light from the scene may be collected by a receiver. The receiver may include or consist of a single lens and a single photodetector (e.g., without the DMD device). The structured light setup may be provided in case the light source may be controlled, for example in a pixel-wise manner. This may be combined with 3D-imaging techniques.

By way of example, a 3D single-pixel camera may be provided by combining structured light emission with a high-speed detector configured to resolve the received signal components. The detector may further be configured to measure individual components of the light as they arrive at the detector. The measurement results may be used for the reconstruction process. This may reduce the number of random patterns M used for the reconstruction (e.g., M may be 50 times smaller than N), thus speeding up the image acquisition.

Various embodiments may be related to a LIDAR system having single-pixel imaging capabilities. Illustratively, the LIDAR system may include one or more components configured for structured illumination. The LIDAR system may include a light emitting system including one or more light emitters, for example a two-dimensional laser array (e.g., VCSEL based). The LIDAR system may include a sensor, for example a single-pixel detector. The LIDAR system may be configured to flexibly adapt (e.g., to reconfigure, for example individually or simultaneously) one or more imaging parameters during runtime (illustratively, during an operation of the LIDAR system). The one or more parameters may include effective resolution, framerate, optical power per effective pixel, spatially resolved Signal-to-Noise Ratio (SNR) and/or processing time. Illustratively, a LIDAR 3D imaging system may be provided (e.g., for direct time-of-flight measurements).

In various embodiments, the LIDAR system may include a light emitting system. The light emitting system may include one or more light emitters. The light emitting system may include a plurality of light emitters, for example arranged in a two-dimensional array. By way of example, the one or more light emitters may include a 2D-laser array, e.g. a pulsed 2D-laser array, such as a VCSEL array. The 2D-laser array may include a plurality of laser emitters, such as vertical cavity surface emitting lasers. The light emitting system may be controlled (e.g., by a light emitting controller) to emit a plurality of structured illumination patterns (also referred to as illumination patterns or emission patterns) towards a scene. The structured illumination patterns may be emitted in accordance with a compressed sensing algorithm (e.g., as a function of a compressed algorithm, for example as a function of an image reconstruction algorithm). A scene may be understood as an environment in front of or in the surrounding of the LIDAR system, e.g. a scene may be understood as the field of view of the LIDAR system. The field of view of the LIDAR system may be or may correspond to the field of view of the light emitting system (also referred to as field of emission) and/or to the field of view of a sensor of the LIDAR system. The field of emission may substantially correspond to the field of view of the sensor.

One or more subsets (in other words, groups) of light emitters (e.g., subsets of VCSEL pixels) may fire (in other words, emit light) at the same time to emit an emission pattern. Illustratively, a first group may include one or more first light emitters that emit light and a second group may include one or more second light emitters that do not emit light. The control of the light emitters to emit or not emit light may be an example of emission of a structured illumination pattern. The emission pattern (e.g., a pixel activation pattern) may be provided from the outside, for example by one or more processors (e.g., a pattern generation system). The light emitting controller (e.g., a VCSEL driver circuit) may generate (and supply) corresponding on/off commands for the light emitters (e.g., pixel on/off commands) based on the illumination pattern to be emitted.

As another example, the light emitting system may include an optical pattern generation component. The optical pattern generation component may be configured to receive the light emitted by the one or more light emitters (e.g., by one or more edge emitting laser chips). The optical pattern generation component may be configured to control (e.g., to modulate or to redirect) the received light to emit a structured illumination pattern is towards the scene. The optical pattern generation component may be, for example, a spatial light modulator (SLM), such as a digital micro-mirror device (DMD), a liquid crystal display (LCD), a liquid crystal on silicon device (LCoS) or a liquid crystal device panel including a liquid crystal pixel array. The optical pattern generation component may be or may be configured as the spatial light modulator 5910 described, for example, in relation to FIG. 59 to FIG. 67. In addition or as an alternative to the generation of emission patterns in accordance with the concept of compressed sensing, a SLM device may also be used to shape and/or normalize the light output provided by the light emitting system.

The one or more light emitters may be configured to emit light in a near infra-red wavelength region and/or in an infra-red wavelength region (e.g., in a range from about 800 nm to about 2000 nm, for example at about 905 nm or at about 1550 nm). By way of example, a 2D-laser array may be configured to create essentially parallel laser beams in the near infra-red wavelength range (e.g., 850 nm, 905 nm, 940 nm).

The light emitting system may include a collimation optical component (also referred to as transmitter optics) configured to collimate the emitted light. The light emitting system may include a collimation optical component (e.g., a micro-lens array) arranged downstream of the one or more light emitters to collimate the light emitted by the one or more light emitters. By way of example, the light emitting system may include a micro-lens array assembled on top of a 2D-laser array to collimate the laser beams emitted by the laser emitters (e.g., on top of the VCSEL, illustratively in a same package).

Each light emitter (e.g., each VCSEL pixel) may be individually controlled. By way of example, the individual control of the one or more light emitters may be provided by appropriate electronics on-chip solution (e.g., via flip-chip bonding on the same package) and/or by means of discrete electronics on a printed circuit board.

In various embodiments, the LIDAR system may include a sensor (e.g., on the receiver side). The sensor may be configured to receive (e.g., collect) light from the scene (e.g., the back-reflected or back-scattered light from the scene). The sensor may include at least one sensor pixel. By way of example, the sensor may consist of exactly one sensor pixel (e.g., the sensor may be a single-pixel photodetector, such as a high speed single-pixel photodetector). The sensor may include at least one photo diode (e.g., the at least one sensor pixel may include at least one photo diode). By way of example, the photo diode may be based on avalanche amplification (e.g., the photo diode may include an avalanche photo diode, such as a single photon avalanche photo diode). Additionally or alternatively, the sensor may include a (e.g., ultra-sensitive) silicon photomultiplier (e.g., the sensor pixel may be a silicon photomultiplier cell).

The LIDAR system (e.g., the sensor) may include a first stage circuit (e.g., a high-frequency circuit) for signal conditioning. By way of example, the LIDAR system may include an amplifier (e.g., a transimpedance amplifier, such as a sensitive high-speed transimpedance amplifier) configured to amplify a signal generated by the sensor. Additionally or alternatively, the LIDAR system may include a capacity compensated first stage transistor stage.

The LIDAR system (e.g., the sensor) may include a converter, e.g., an analog-to-digital converter (ADC), such as a high-speed analog-to-digital converter, for example a high-speed ADC with a sample rate of about 1 GSamples/s or higher. The converter may be configured to convert (e.g., to sample) the signal generated by the sensor (for example, the signal amplified by the amplifier). The converter may be arranged in close proximity to the sensor (e.g., the converter may be coupled downstream to the amplifier). The close proximity may reduce or minimize noise impairments from the outside (e.g., from the light emitting controller, e.g. from the laser driver).

The first stage circuit and/or the converter may be arranged on a printed circuit board (e.g., may be fabricated on a printed circuit board). The printed circuit board layout design may provide high-frequency capabilities and/or electromagnetic compatibility.

The sensor may include an optical filter. The optical filter may be configured to block light outside a predefined wavelength range, or to block light not having a predefined wavelength. By way of example, the optical filter may allow (e.g., let through) light having a wavelength in the near-infrared or infra-red range, for example light having a wavelength of about 850 nm and/or of about 905 nm and/or of about 940 nm. The optical filter may be a narrowband filter, for example in case the one or more light emitters include a single-mode laser (e.g., VCSEL) and/or in case the sensor includes an ultra-sensitive detector (e.g., a silicon photomultiplier or a single photon avalanche photo diode).

The LIDAR system may include detector optics (also referred to as collection optics or receiver optics) configured to direct light towards the sensor. Illustratively, the detector optics may be configured to collect light from the field of view of the LIDAR system (e.g., the field of view of the sensor) and direct the light towards the sensor. The detector optics may be configured for light collection and homogenization. The detector optics may be configured to transfer the light onto a single area (e.g., onto the sensitive surface of a single-pixel detector). The detector optics may be or may be configured as non-imaging optics (e.g., as a compound parabolic concentrator, for example integrated in a single element). By way of example, the detector optics may be the optics arrangement 9802 or may be configured as the optics arrangement 9802 described, for example, in relation to FIG. 98 to FIG. 102B. The detector optics may include an optical coating for wavelength filtering.

In various embodiments, the sensor may include or consist of a plurality of sensor pixels. The sensor pixels may be arranged in one direction to form a one-dimensional pixel array. Alternatively, the sensor pixels may be arranged in two directions to form a two-dimensional pixel array. By way of example, the sensor may include an array (e.g., two-dimensional) of single photon avalanche photo diodes.

The sensor may be configured such that the plurality of sensor pixels provide a single output signal (illustratively, such that the plurality of sensor pixels provide a single-pixel output). The sensor may be configured such that the signals of all active sensor pixels are summed up to provide the single output signal. The converter may be configured to convert the sum (e.g., a weighted sum) of the plurality of signals (illustratively, the plurality of analog sensor signals) into a digital signal (e.g., into a digital sum signal). The single output signal may be digitized and further processed.

The sensor (e.g., a sensor controller) may be configured to activate (e.g., switch "on") or deactivate (e.g., switch "off") one or more sensor pixels. An active sensor pixel may react to incoming light (e.g., generate a signal) and an inactive sensor pixel may not react to incoming light. The sensor may be configured to activate or deactivate the sensor pixels in accordance with the emitted structured illumination pattern (illustratively, in synchronization with the emitter pattern). This may provide the effect that noise related to ambient light may be reduced. Illustratively, the sensor may be configured to deactivate sensor pixels receiving light (e.g., ambient light) from areas of the field of view that are not relevant or not participating in the current compressed sensing measurement. This may reduce the shot noise and improve the SNR of the detected signal. A better ranging performance may be provided.

Such activation or deactivation of the sensor pixels may be related to the geometrical alignment between the field of view of the sensor and the field of view of the emitter (e.g., the field of emission of the emitter). By way of example, the sensor pixels (e.g., of the sensor array) may be geometrically aligned to the light emitters (e.g., to the emitter array, such as the VCSEL array). In this case, the sensor may follow the same pattern as the emitter, e.g., the sensor may be sensitive only in areas where the emitter emits light and/or the sensor may be sensitive only for the time period relevant for the measurement. As another example, the sensor pixels may be not aligned to the light emitters (e.g., not geometrically aligned and/or not aligned in time, illustratively the sensor may have a slower response compared to the emitter). Even in this case a reduction of the noise may be provided (e.g., areas in the field of view that are not relevant for refinement shots may be spared-out, as described in further detail below).

In various embodiments, the LIDAR system (e.g., the sensor) may include a receiver optical component. The receiver optical component may be configured to collimate received light. The receiver optical component may be configured to transmit light (e.g., to let light through) in accordance (e.g., in synchronization) with the emitter pattern. Illustratively, the receiver optical component may be a controllable aperture (e.g., a two-dimensional aperture) disposed in the optical receiver path upstream to the sensor (e.g., before the light is focused onto the single-pixel detector). By means of the receiver optical component the ambient light from non-relevant parts in the field of view may be spared-out (illustratively, blocked before impinging onto the sensor). By way of example, the receiver optical component may include a spatial light modulator, such as a liquid crystal device, a liquid crystal polarization grating, a liquid crystal on silicon device, or a digital micro-mirror device. The configuration of the receiver optical component may be selected according to the pulsing speed and/or acquisition speed of the LIDAR system.

The receiver optical component may include an optical filter to filter the received light. The optical filter may be configured to block light outside a predefined wavelength range, or to block light not having a predefined wavelength. By way of example, the optical filter may allow (e.g., let pass) light having a wavelength in the near-infrared or infra-red range. The receiver optical component may be configured to dynamically adapt (e.g., to dynamically control the optical filter), for example depending on the current ambient light condition (e.g., the receiver optical component may react in case a vehicle comes out of a tunnel into bright sunlight). By way of example, the receiver optical component (e.g., the controllable aperture) may be included in a control circuit or in a closed loop control. The receiver optical component may be controlled depending on a measurement output of an ambient light sensor (e.g., a photo diode). The optical filtering (e.g., narrowband optical filtering) may provide the effect of reducing an impact of ambient light. This may reduce or prevent saturation or an unnecessary amount of shot noise.

The receiver optical component (e.g., the controllable aperture, for example based on liquid crystal technology) may act as a single-pixel optical attenuator. Alternatively, the receiver optical component may act according to a pixel wise approach. The receiver optical component may include a plurality of pixels. The pixels may be individually controlled to selectively act on individual areas within the field of view of the sensor. The pixel wise approach may be provided, for example, in glare situations (e.g., strong solar reflex in a certain region), or in situations with high amounts of reflected LIDAR radiation (e.g., short distance and/or high IR-reflectivity). Additionally or alternatively, the LIDAR system may include a controllable optical attenuator.

Additionally or alternatively, the sensor gain may be to controlled to reduce the impact of ambient light. Illustratively, the sensor gain may be adjusted depending on an ambient light level (e.g., depending on the output of the ambient light sensor). By way of example, the gain (and/or other sensor parameters) may be adjusted in a control loop configuration.

In various embodiments, the LIDAR system may be is configured to provide a segmentation of the field of view. Illustratively, the field of view may be divided into segments (or areas). The division may be overlapping (e.g., up to 100% overlap) or non-overlapping (e.g., the field of view segments may not overlap with one another). This may reduce the impact of ambient light. This may increase redundancy, for example with respect to functional safety. By way of example, on the emitter side, the LIDAR system may include separate light emitting systems. As another example, a light emitting system may emit separate emission patterns. As another example, on the receiver side, the LIDAR system may include more than one sensor. As a further example, a sensor may include a plurality of pixels, each associated with one or more segments of the field of view.

In various embodiments, the LIDAR system may include one or more processors configured for image reconstruction and/or pattern generation (e.g., a compressed sensing computational system, e.g. including a pattern generation system and an image reconstruction system).

The one or more processors may be configured to reconstruct an image based on the sensor signals detected by the sensor. The reconstruction may be in accordance with the compressed sensing algorithm. Illustratively, a compressed sensing algorithm may include a pattern generation algorithm and an image reconstruction algorithm. The reconstruction may be performed as a function of the image reconstruction algorithm (e.g., a 3D image reconstruction algorithm).

By way of example, the one or more processors may be configured to receive the signal from the converter (e.g., the digitized signal or sampled signal from the analog-to-digital converter). The one or more processors may be configured to perform basic signal conditioning (e.g., filtering) on the received signal. The one or more processors may be configured to reconstruct the image (e.g., to implement the image reconstruction algorithm) according to a structural knowledge of the previously emitted illumination pattern or patterns (e.g., knowledge of which emission pattern or patterns generated the image under processing). The knowledge of the previously emitted illumination pattern may include timing information, e.g. a timestamp describing the time point at which the pattern was emitted, for example an absolute time point or a relative time point with respect to a reference clock (e.g., a common reference clock). The one or more processors may be configured to reconstruct the image from the measured signal components and the corresponding timing information for the individual measurements. Illustratively, the one or more processors may be configured to reconstruct the image from the time varying back-scattered intensities (e.g., sampled at the analog-to-digital converter) together with the previously emitted illumination pattern. The one or more processors may be configured to reconstruct depth and/or reflectivity images of the scene (e.g., by using principles from compressive sampling theory, such as a I1-optimization method, a greedy stochastic algorithm, or a variational algorithm, for example the one or more processors may implement a linear program, such as basis pursuit).

The one or more processors may be configured to generate the plurality of different emission patterns. Illustratively, each image acquisition may include the emission of a plurality of illumination patterns (e.g., a number M of patterns). The one or more processors may be configured to provide a corresponding emission pattern (e.g., a corresponding signal) of the plurality of different emission patterns to the light emitting controller (e.g., to the driver circuit of the emitter array). The one or more processors may be configured to provide the M emission patterns, e.g. to repeat M times for each image acquisition the generation of a pattern and the provision of the generated pattern to the light emitting controller (illustratively, until M patterns have been generated and provided). The number of emission patterns may be dependent on a desired resolution (e.g., on a desired resolution level for the reconstructed image). By way of example, the number of patterns may have a linear dependency on the number of light emitters (e.g., the number of emission patterns may be equal to the number of light emitters). As another example, the number of emission patterns may have a non-linear dependency on the number of light emitters (e.g., a square-root dependency). By way of example, the one or more processors may be configured to generate a first emission pattern and a second emission pattern, wherein the second emission pattern may be the inverse of the first emission pattern (illustratively, the first emission pattern and the second emission pattern may be differential signals). The one or more processors may be configured to provide the second emission pattern to the light emitting controller immediately after the first emission pattern. The one or more processors may be configured to process the sensor signals taking into consideration the first emission pattern and the second emission pattern. As an example, the one or more processors may be configured to subtract the sensor signals associated with the second emission pattern from the sensor signals associated with the first emission pattern (e.g., may be configured to determine the difference in the measured intensities). This may reduce or eliminate impairments caused by ambient light.

The one or more processors may be configured to generate the plurality of different emission patterns randomly or pseudo-randomly. By way of example, the one or more processors may be configured to generate the plurality of different emission patterns using random number generators (e.g., using Bernoulli or Gaussian distributions). As another example, the one or more processors may be configured to generate the plurality of different emission patterns using randomly permuted vectors from standard orthonormal bases. As another example, the one or more processors may be configured to generate the plurality of different emission patterns using random subsets of basis vectors, such as Fourier, Walsh-Hadamard, or Noiselet bases. As a further example, the one or more processors may be configured to generate the plurality of different emission patterns in a partially random and partially deterministic manner (e.g., to enhance desired areas of the field of view).

In various embodiments, the one or more processors may be configured to provide an adaptive compressed sensing algorithm (also referred to as pattern adaptation algorithm). Illustratively the one or more processors (e.g., the adaptive algorithm) may be configured to update the emission patterns based on results or intermediate results of the image reconstruction. The update of the emission patterns may be provided to image regions of interest in the scene (e.g., to dedicatedly image areas of interest in the scene). By way of example, the emission patterns may be updated by modifying the effective resolution and/or the acquisition time and/or the achievable SNR for such regions of interest. Illustratively, the one or more processors may serve as a pattern adaptation system.

The pattern adaptation algorithm may include various parts. The pattern adaptation algorithm may be executed in an iterative fashion (e.g., the various parts may be sequentially performed and repeated iteratively over time or handled according to a scheduling scheme). A clock (e.g., a watchdog timer) may be provided to determine a repetition rate of the pattern adaptation algorithm (e.g., a minimum repetition rate for taking overview shots, as described in further detail below).

The pattern adaptation algorithm may include (e.g., in a first part) taking an overview shot of the scene (e.g., controlling the light emits ting system and the sensor to take an overview shot of the scene). The overview shot may have an intermediate resolution or a low resolution (e.g., lower than a maximum resolution of the LIDAR system, e.g. lower than a maximum resolution achievable with the light emitting system and the sensor). The overview shot may be taken faster than a high-resolution shot. Illustratively, a lower number of emission patterns may be provided or used for a low-resolution shot as compared to a high-resolution shot. A less energy- and/or time-consuming signal processing may be provided for a low-resolution shot as compared to a high-resolution shot. The overview shot may be described as a medium to low resolution shot and/or as a medium to high SNR shot.

The overview shot may be generated with a small number of emission patterns (e.g., less than ten or less than five). A coarse depth and intensity map may be generated (e.g., a coarse point cloud). The emission patterns used for the overview shot may be random-generated patterns covering the entire field of view.

For taking the overview shot (or in general a low resolution image), light emitters may be grouped together. This may provide a greater macro-emitter (e.g., a macro-pixel). A desired resolution may be achieved by binning a corresponding number of light emitters, e.g. by combining individual pixels to a larger "super pixel" or "virtual pixel". Illustratively, binning or combining light emitters may be described as controlling a number of light emitters (e.g., arranged next to one another) such that such light emitters emit light together (illustratively, simultaneously). By way of example, a plurality of pixels of a VCSEL array may be binned. Illustratively, a first (e.g., high) resolution may be achieved using the pixels of the VCSEL array, e.g. without binning. A second (e.g., medium) resolution may be achieved in case 2×2 pixels of the VCSEL array are binned together. A third (e.g., low or coarse) resolution may be achieved in case 3×3 pixels of the VCSEL array are binned together. Illustratively, by using pixel binning, N emitter arrays with "virtually" N different resolutions may be provided. This scheme (e.g., pixel binning on the emitter side) may provide a flexible trade-off between frame-rate, resolution, and SNR.

The pattern adaptation algorithm may include (e.g., in a second part) analyzing the overview shot (e.g., the one or more processors may be configured to analyze the overview shot). The overview shot may be analyzed or used to classify (e.g., identify and classify) one or more regions of interest in the scene (e.g., regions of interest may be identified based on the coarse depth and intensity map). The second part of the pattern adaptation algorithm may, additionally or alternatively, be implemented in or executed by a LIDAR system-external device or processor, for example in a sensor fusion system (e.g., a sensor fusion box) of a vehicle including the LIDAR system.

The regions of interest may be classified according to one or more relevance criteria (e.g., one or more criteria defining a relevance of a region of interest for the LIDAR system or for a vehicle including the LIDAR system). By way of example, regions of interest may be classified according to their distance (e.g., from a predefined location, such as from the LIDAR system). Illustratively, a close region may potentially be more critical (e.g., more relevant) than a far away region. As another example, regions of interest may be classified according to the signal level (e.g., a low signal level region may be a region in which the signal is poor or includes dark spots, compared to a high signal level region). As a further example, regions of interest may be classified according to their uncertainty. As a further example, regions of interest may be classified according to a combination (e.g., a weighted sum) of distance, signal level, and/or uncertainty. The combination may include one or more factors (e.g., weighing factors). The one or more factors may be a function of system-internal or system-external conditions (e.g., vehicle-internal or vehicle-external conditions), such as vehicle speed, intended trajectory (straight, left/right curve), ambient light level, weather conditions, and the like. As a further example, regions of interest may be classified according to a relevance of the respective content. Illustratively, an object recognition process and/or an object classification process may be provided (e.g., by the one or more processors and/or by a sensor fusion system) to identify and/or classify one or more objects in the scene. A region of interest including a traffic-relevant object or a safety-critical object (e.g., a pedestrian, a bicycle, a vehicle, a wheelchair, and the like) may be classified as more relevant than a region of interest not including any of such objects or including less safety-critical objects. A classification of the regions of interest may be provided, for example, in or by a traffic map describing one or more traffic-related conditions, for example associated with the location of the vehicle including the LIDAR system, as described in relation to FIG. 127 to FIG. 130.

One or more bounding boxes may be created according to the identified regions of interest (e.g., each region of interest may be associated with a corresponding bounding box). Illustratively, a bounding box (e.g., a rectangular bounding box) may enclose the associated region of interest. A corresponding priority may be assigned to each region of interest (e.g., to each bounding box). The priority may be assigned according to the classification. The one or more regions of interest (e.g., the one or more bounding boxes) may be ranked according to their priority. The priority may be a predefined priority (e.g., predefined based on the relevance criteria associated with the region of interest) or may be an adaptively updated priority (e.g., updated based on system-external or system-internal conditions).

A bounding box may be described as a subset of pixels (e.g., a sub-array of pixels) in the overview shot enclosing the associated region of interest. The bounding box may describe or define a corresponding subset of light emitters and/or sensor pixels (e.g., a sub-array of light emitters and/or a sub-array of sensor pixels). Illustratively, in case the region of interest includes X columns of pixels and Y rows of pixels in the overview shot, X columns and Y rows of light emitters and/or sensor pixels may be associated with that region of interest. A corresponding priority may be assigned to the light emitters and/or sensor pixels based on the priority of the associated region of interest.

The pattern adaptation algorithm may include (e.g., in a third part) generating an adapted emission pattern (e.g., the one or more processors may be configured to generate an adapted emission pattern, illustratively based on the analysis). The adapted emission pattern may provide an adapted resolution for the regions of interest of the scene (e.g., for each identified region of interest a refinement shot with an optimized resolution may be taken). Illustratively, for each identified bounding box a high-resolution, or intermediate-resolution, or low-resolution emission pattern may be provided for a refinement shot covering such region. The adaptation of the resolution may be in accordance with a target resolution and/or the above-mentioned relevance criteria (e.g., identified during the analysis of the overview shot). The adaptation of the resolution may be based on a knowledge of a position of the corresponding region of interest within the field of view. Illustratively, the adaptation of the resolution for the refinement shot may include binning together the light emitters associated with the bounding box according to the desired resolution.

The generation of the adapted emission pattern may include intersecting the area of a bounding box with a grid covering the entire field of view at the identified target resolution (e.g., a target resolution for that region of interest based on the classification, e.g. high, intermediate, or low). As an example, a first target resolution may be provided for a short-distance refinement shot and a second (e.g., lower) resolution may be provided for a long-distance refinement shot. This may provide a virtual array, e.g. an array covering a virtual field of view and having a virtual resolution (e.g., with a predefined number of lines and columns). A virtual array may be created for each bounding box.

The generation of the adapted emission pattern may include generating a virtual emission pattern (illustratively, associated with a virtual array), e.g. a plurality of virtual emission patterns. The virtual emission pattern may include the identified number of lines and columns (e.g., of the virtual array). The virtual emission pattern may be generated according to the compressed sensing algorithm (e.g., to the pattern generation algorithm). By way of example, the virtual emission pattern may be generated using random number generators (e.g., using Bernoulli or Gaussian distributions). As another example, the virtual emission pattern may be generated using randomly permuted vectors from standard orthonormal bases. As another example, the virtual emission pattern may be generated using random subsets of basis vectors, such as Fourier, Walsh-Hadamard, or Noiselet bases. As a further example, the virtual emission pattern may be generated in an at least partially deterministic manner.

The generation of the adapted emission pattern may include mapping the virtual emission pattern onto the one or more light emitters (e.g., onto the emitter array). The virtual emission pattern may be mapped onto the one or more light emitters using the virtual field of view (e.g., associated with the virtual array). Illustratively, the generation of the adapted emission pattern may include configuring (and/or controlling) the light emitting system to emit light to emit the adapted emission pattern. By way of example, the mapped emission pattern may be provided to the VCSEL driver circuit in a one-to-one fashion to be emitted into the scene (e.g., each pixel in the array may be assigned).

A refinement shot may include a plurality of refinement shots (e.g., a combination of refinement shots associated with different regions of interest, for example having non-overlapping bounding boxes). This may reduce the total number of emission patterns to be emitted. Illustratively, the virtual emission patterns for non-overlapping regions of interest (e.g., non-overlapping bounding boxes) may be mapped into the same emission pattern. This may speed up the acquisition of the refinement shot.

The refinement shots may be taken (in other words, executed) in accordance with the priority assigned to the regions of interest. Additionally or alternatively, the refinement shots may be taken in accordance with a data processing characteristic associated with each region of interest, as described, for example, in relation to FIG. 162A to FIG. 164E. The emission patterns associated with higher priority regions of interest may be emitted prior to the emission patterns associated with lower priority regions of interest. The sensor signals associated with different regions of interest may be analyzed according to the priority assigned to the respective region of interest. By way of example, faster results may be provided for close-by objects, whereas far-away objects may be treated at a subsequent time point, e.g. with lower priority. As another example, objects outside the vehicle boundaries (e.g., left, right, top) may be measured later or with a lower initial resolution with respect to objects located such that they may hit the vehicle based on the planned trajectory. As a further example, objects that are not relevant or less relevant for the driving of the vehicle (e.g., not critical or less critical for the safety of the driving) may be measured or processed later with respect to traffic-relevant or safety-relevant objects. As a further example, dark spots in the intermediately acquired scene may be eliminated by optimizing the emission pattern to get information about these dark regions. As a further example, the priority may be determined according to the signal uncertainty and/or the noise level.

In various embodiments, the LIDAR system may include a thermal management circuit. The thermal management circuit may be configured to control the LIDAR system in accordance with a measured temperature of the one or more light emitters. Illustratively, the thermal management circuit may be provided to select an output power of the light emitters as high as possible or as high as required (for example, depending on a traffic situation, a weather condition, and the like) while avoiding permanent damage or performance degradation of the light emitters (by way of example, the thermal management circuit may be provided to operate VCSEL pixels at an optimum output power).

The thermal management circuit may be configured to determine temperature data. The thermal management circuit may be configured to receive a temperature input from the light emitting system (e.g., from to the VCSEL chip). The thermal management circuit may be configured to receive additional monitoring information from the light emitting system (e.g., an internal thermal model of the light emitting system). The thermal management circuit may be configured to analyze the thermal conditions of the light emitting system (e.g., of the light emitters). The thermal management circuit is may be configured to determine the presence of critical peaks in the thermal distribution of the light emitters (e.g., of the VCSEL), e.g. based on the received input and/or information. Illustratively, the temperature data may describe the presence of critical peaks in the thermal distribution of the light emitters.

The thermal management circuit may be configured to provide constraints or other parameters to the one or more processors (and/or to the light emitting controller) in case critical peaks are present (e.g., in areas where nearby pixels are switched "ON" often). The temperature data may further describe or include such constraints or other parameters. The one or more processors may be configured to generate the plurality of emission patterns taking into consideration the temperature data. By way of example, the one or more processors may be configured to find an optimized order of the emission patterns to eliminate or reduce the critical temperature peaks among the light emitters (e.g., a pattern in which neighboring light emitters are not emitting light simultaneously). As another example, additionally or alternatively, the thermal management circuit may be configured to control the light emitting controller to lower the output power of the one or more light emitters (e.g., globally or on a per-emitter basis, e.g. on a pixel basis).

The LIDAR system described herein may provide a reliable and versatile imaging process (e.g., the loss of single acquisition may be tolerated and reconfiguration via software may be implemented). The imaging may be performed without mechanical components (as compared, for example, to MEMS or rotating mirror approaches). A tradeoff between update rate, resolution, and SNR may be provided. The tradeoff (e.g., the respective parameters) may be adapted during runtime, e.g. based on the currently detected objects and/or the currently detected scene.

FIG. 150A to FIG. 150F show various aspects of a LIDAR system 15000 in a schematic representation in accordance with various embodiments.

The LIDAR system 15000 may be configured as a Flash LIDAR system. By way of example, the LIDAR system 15000 may be or may be configured as the LIDAR Sensor System 10 (e.g., as a Flash LIDAR Sensor System 10). The LIDAR system 15000 may include an emitter path, e.g., one or more components of the LIDAR system 15000 configured to emit (e.g. LIDAR) light. The emitted light may be provided to illuminate (e.g., interrogate) the area surrounding or in front of the LIDAR system 15000 (illustratively, a scene). The LIDAR system 15000 may include a receiver path, e.g., one or more components configured to receive light from the scene (e.g., light reflected or scattered from objects in that area). The LIDAR system 15000 may be included, for example, in a vehicle.

The LIDAR system 15000 may include a light emitting system 15002. The light emitting system 15002 may be configured (e.g., controlled) to emit light towards the scene (e.g., towards a field of view of the LIDAR system 15000). The light emitting system 15002 may include one or more light emitters 15004, for example the light emitting system 15002 may include a plurality of light emitters 15004. By way of example, the light emitting system 15002 may include an array including a plurality of light emitters 15004 arranged in a one-dimensional or a two-dimensional manner (e.g., a one-dimensional array of light emitters 15004 or a two-dimensional array of light emitters 15004).

The one or more light emitters 15004 may be configured to emit light (e.g., a light emitter 15004 may be a light source, such as the light source 42). The emitted light may be in a predefined wavelength region. By way of example, at least one light emitter 15004 (or more than one light emitter 15004 or all light emitters 15004) may be configured to emit light in the near infra-red and/or in the infra-red wavelength region. By way of example, at least one light emitter 15004 may be configured to emit light in a wavelength range from about 800 nm to about 2000 nm, for example at about 905 nm or at about 1550 nm. The one or more light emitters 15004 may be configured or controlled to emit light in a continuous manner or in a pulsed manner (e.g., to emit a sequence of light pulses).

By way of example, the one or more light emitters 15004 may be configured to emit laser light, e.g. the one or more light emitters 15004 may be laser emitters. The one or more light emitters 15004 may include a laser array including a plurality of laser emitters arranged in a one-dimensional or a two-dimensional manner (e.g., a one-dimensional array of laser emitters or a two-dimensional array of laser emitters). At least one laser emitter (or some laser emitters or all laser emitters) may be a vertical cavity surface emitting laser (e.g., the array may be a VCSEL array). Additionally or alternatively, at least one laser emitter may be an edge emitting laser.

The light emitting system 15002 may include one or more optical components 15006, e.g. for adjusting or tuning the light emission. By way of example, the light emitting system 15002 may include a collimation optical component configured to collimate the emitted light (e.g., the one or more optical components 15006 may be or may include a collimation optical component). The collimation optical component may be arranged downstream of the one or more light emitters 15004. The collimation optical component may be a micro-lens or a micro-lens array (illustratively, each light emitter 15004 may be associated with a corresponding micro-lens, for example each laser pixel of a VCSEL array may be associated with a corresponding micro-lens). As another example, the light emitting system 15002 may include an optical pattern generation component (e.g., the one or more optical components 15006 may be or may include an optical pattern generation component). The optical pattern generation component may be configured to receive the light emitted by the one or more light emitters 15004. The optical pattern generation component may be configured to control (e.g., to is modulate) the received light to emit a structured illumination pattern towards the scene. The optical pattern generation component may be, for example, a spatial light modulator (SLM), such as a digital micro-mirror device (DMD), a liquid crystal display (LCD), a liquid crystal on silicon device (LCoS) or a liquid crystal device panel including a liquid crystal pixel array.

The LIDAR system 15000 may include a light emitting controller 15008. The light emitting controller 15008 may be configured to control the light emitting system 15002 (e.g., to provide individual driving signals for the one or more light emitters 15004 and/or for the one or more optical components 15006). The light emitting controller 15008 may be configured to control the light emitting system 15002 to emit light to emit a plurality of different emission patterns. An emission pattern may be described as a pattern of emitted light illuminating certain areas (e.g., certain spots) in the scene (and not illuminating other areas or other spots). Illustratively, different emission patterns may illuminate different areas in the scene.

An example of emitted emission pattern is illustrated in FIG. 150B. A plurality of light emitters 15004 may be controlled such that some light emitters 15004 emit light and some other light emitters 15004 do not emit light. Illustratively, an emission pattern may include one or more first light emitters 15004 each emitting light (illustratively, the darker pixels in the array in FIG. 150B) and one or more second light emitters 15004 each not emitting light (illustratively, the lighter pixels in the array in FIG. 150B). The pattern of light emitters 15004 emitting or not emitting light may define corresponding illuminated (or not illuminated) regions in the field of view 15010, e.g. in the field of emission 15010 (illustratively, the darker regions A to G in FIG. 150B). Illustratively, the light emitting controller 15008 may be configured to individually control the light emitters 15004 to emit light to emit the emission pattern (e.g., the plurality of different emission patterns). By way of example, the light emitting controller 15008 may be configured to individually control the laser emitters of a two-dimensional laser array to emit laser pulses to emit the plurality of different emission patterns. In this configuration, the one or more optical components 15006 may include the collimation optical component.

The light emitting controller 15008 may be configured to control the light emitting system 15002 to emit light in a pulsed fashion to emit the plurality of different emission patterns in a pulsed fashion. Illustratively, the light emitting controller 15008 may be configured to control the light emitting system 15002 to emit a sequence of different emission patters (e.g., to sequentially illuminate different areas of the field of emission). The sequence of emission patterns may define an imaging process (e.g., an image acquisition). The light emitting controller 15008 may be configured to control the light emitting system 15002 to emit a different emission pattern at predefined time intervals. The length of the time intervals (illustratively, the repetition rate) may be dependent on the resolution and/or on the detection range (e.g., on the maximum time-of-flight) of the LIDAR system 15000. By way of example, the length of a time interval may be in the range from about 1 ps to about 100 ps, for example from about 200 ns to about 500 ns, for example from about 10 ns to about 100 ns.

The emission of the plurality of different emission patterns may be a function of a compressed sensing algorithm (in other words, may be controlled by a compressed sensing algorithm). The plurality of different emission patterns to be emitted may be selected such that an image of the scene may be reconstructed (e.g., with a desired resolution). The plurality of different emission patterns may include a number of emission patterns, e.g. M, that provides a reconstruction of the image (illustratively, the number M may be a minimum number of emission patterns to be provided for reconstructing the image). Illustratively, the compressed sensing algorithm may determine or define the number and the configuration of emission patterns to be emitted. The emission of the plurality of different emission patterns may be a function of an image reconstruction algorithm.

As shown, for example, in FIG. 150A, the LIDAR system 15000 may include a sensor 52. (e.g., a LIDAR sensor). The sensor 52 may include at least one sensor pixel 15012 (e.g., one or more sensor pixels 15012). The sensor 52 may include at least one photo diode (e.g., one or more photo diodes). Illustratively, each sensor pixel 15012 may include or may be associated with a respective photo diode (e.g., of the same type or of different types). By way of example, a photo diode may be based on avalanche amplification (e.g., a photo diode may include an avalanche photo diode, such as a single photon avalanche photo diode). Additionally or alternatively, the sensor 52 may include a (e.g., ultra-sensitive) silicon photomultiplier (e.g., a sensor pixel 15012 may be a silicon photomultiplier cell).

The sensor 52 may consist of exactly one sensor pixel 15012. Stated in another fashion, the sensor 52 may include a single sensor pixel 15012 (e.g., the sensor 52 may be a single-pixel sensor or a single-pixel detector, as illustrated, for example, in FIG. 150A). Alternatively, the sensor 52 may include a plurality of sensor pixels 15012. The plurality of sensor pixels 15012 may be arranged in an ordered fashion, e.g. to form an array. By way of example, the sensor 52 may include or consist of a plurality of sensor pixels 15012 arranged in one direction (e.g., vertical or horizontal) to form a one-dimensional sensor pixel array (illustratively, to form a column sensor or a line sensor). As another example, the sensor 52 may consist of a plurality of sensor pixels 15012 arranged in two directions to form a two-dimensional sensor pixel array (illustratively, a matrix or a grid of sensor pixels 15012), as illustrated, for example, in FIG. 150D. The sensor 52 (e.g., a sensor controller) may be configured to activate or deactivate the sensor pixels 15012 in the array in accordance (e.g., in synchronization) with the emission pattern (e.g., in accordance with the light emitters 15004 emitting or not emitting light). Illustratively, the sensor 52 may be configured to activate one or more first sensor pixels 15012 (e.g., that may receive the emitted light, e.g. reflected back, based on the emitted emission pattern, e.g. the darker sensor is pixels 15012 in FIG. 150D). The sensor 52 may be configured to deactivate one or more second sensor pixels 15012 (e.g., that may not receive the emitted light based on the emitted emission pattern, e.g. the lighter sensor pixels 15012 in FIG. 150D).

The sensor 52 may be configured to detect or to provide a sensor signal (e.g., an analog signal, such as a current). Illustratively, each sensor pixel 15012 (e.g., each photo diode) may be configured to generate a signal in case light impinges onto the sensor 52 (illustratively, onto the respective sensor pixel 15012). The sensor 52 may be configured to provide, as an output, a sensor signal including the signals generated by each sensor pixel 15012. By way of example, the sensor signal may include the signal from a single sensor pixel 15012. As another example, the sensor signal may include a plurality of signals from a plurality of sensor pixels 15012 (e.g., the sensor signal may be or may include a sum or a weighted sum of a plurality of sensor signals), as illustrated, for example, in FIG. 150D. Illustratively, the sensor 52 may be configured to provide a sensor signal for each emission pattern emitted by the light emitting system 15002.

An example of the operation of the sensor 52 in relation to an emitted emission pattern is illustrated in FIG. 150B and FIG. 150C. The emission pattern emitted by the light emitting system 15002 (e.g., by the array of light emitters 15004) may be reflected by an object 15014 (e.g., a vehicle) in the field of view 15010. The light may be reflected by the object 15014 towards the LIDAR system 15000. The reflected light may be collected by the sensor 52. The reflected light may have a pattern in accordance with the emission pattern and with the reflection from the object 15014. Illustratively, a collected field of view 15010 (e.g., a field of view including the reflected light) may have illuminated areas (e.g., the areas D to G in FIG. 150B) in correspondence with portions of the object 15014 illuminated by the emission pattern. The collected field of view 15010 may have non-illuminated areas (e.g., the areas A to C in FIG. 1506) in correspondence of portions of the object 15014 not illuminated by the emission pattern.

As illustrated, for example, in FIG. 150C, the sensor 52 may receive one or more reflected pulses (e.g., one or more reflected light pulses). The one or more reflected pulses may impinge onto the sensor 52 at different time points (illustratively, depending on the distance between the sensor 52 and the portion of the object 15014 reflecting the light pulse), e.g. the reflected pulses may each have a different time-of-flight. Considering, as an example, the emission pattern in FIG. 150B (e.g., with illuminated areas A to G), a light pulse may be emitted at the same time for each illuminated area, as shown for example in the graph 15016-1. The sensor 52 may not receive any reflected pulse associated with the illuminated areas A to C (e.g., associated with the pixels A to C), as shown for example in the graph 15016-2. The sensor 52 may receive a reflected pulse associated with each illuminated areas D to G, at different time points and/or with different intensities, depending on the reflection from the object 15014. This may be illustrated, for example, in graph 15016-3 for the area D, in graph 15016-4 for the area E, in graph 15016-5 for the area F, and in graph 15016-6 for the area G. The sensor signal may describe the received reflected light pulses as shown, for example, in graph 15016-7. The sensor signal may be a superposition of partial signals generated in correspondence of the individual reflected light pulses impinging onto the sensor 52. The superposition may occur, as an example, at the sensor level (illustratively, a superposition of partial signals generated in correspondence of light pulses impinging onto a single sensor pixel). The superposition may occur, as another example, at the signal processing level (illustratively, the signals from multiple sensor pixels may be combined in a sum signal, as shown for example in FIG. 150D).

The LIDAR system 15000 may include one or more processors 15018. The one or more processors 15018 may be configured to receive the sensor signals detected by the sensor 52 (e.g., a plurality of different sensor signals for the plurality of different emission patterns). The one or more processors 15018 may be configured to reconstruct an image (e.g., of the scene) based on the sensor signals (illustratively, using the sensor signals). The reconstruction may be in accordance with the compressed sensing algorithm (e.g., with the image reconstruction algorithm). Illustratively, the compressed sensing algorithm may define how to process (e.g., how to combine) the sensor signals (e.g., taking into account the associated emission pattern) to reconstruct the image.

The one or more processors 15018 may be configured to generate the plurality of different emission patterns. The one or more processors may be configured to provide a corresponding emission pattern of the plurality of different emission patterns to the light emitting controller 15008. Illustratively, the one or more processors 15018 may provide a number M of emission patterns to the light emitting controller 15008 for each imaging process (in other words, for each image acquisition). The one or more processors 15018 may be configured to generate the plurality of different emission patterns randomly or pseudo-randomly. The one or more processors 15018 may be configured to generate the plurality of different emission patterns in accordance with the compressed sensing algorithm (e.g., as a function of a pattern generation algorithm). The one or more processors 15018 may be configured to generate the plurality of different emission patterns taking into consideration temperature data describing a temperature of the one or more light emitters 15004, as described in further detail below.

The LIDAR system 15000 may include a thermal management circuit 15028. The thermal management circuit 15028 may be configured to receive a temperature input from the light emitting system 15004 (e.g., a measured temperature of the one or more light emitters 15002, for example the light emitting system 15004 may include on or more temperature sensors). The thermal management circuit 15028 may be configured to receive additional monitoring information from the light emitting system 15004 (e.g., an internal thermal model of the light emitting system 15004). The thermal management circuit 15028 may be configured to control the LIDAR system 15000 (e.g., the light emitting controller 15008 and/or the one or more processors 15018) in accordance with the temperature input and/or the monitoring information, e.g. in accordance with the measured temperature of the one or more light emitters 15002.

The thermal management circuit 15028 may be configured to determine temperature data. The temperature data may describe an individual temperature of each light emitter 15004. The temperature data may describe the individual temperatures in accordance with the monitoring information, e.g. in accordance with the temperature model of the light emitting system 15002. By way of example, the temperature data may describe the presence of critical temperature peaks (illustratively, of overheated light emitters 15004). The thermal management circuit 15028 may be configured to determine constraints and/or instructions based on the individual temperatures of the light emitters 15004. Illustratively, the temperature data may include such constraints and/or instructions. The thermal management circuit 15028 may be configured to associate the temperature data with a respective emission pattern of the plurality of emission patterns. Illustratively, the thermal management circuit 15028 may be configured to associate a thermal distribution of the light emitters 15004 (and respective constraints or instructions) with the emission pattern emitted with that thermal distribution (e.g., with that configuration of the light emitters 15004).

The thermal management circuit 15028 may be configured to provide the temperature data to the light emitting controller 15008. The light emitting controller 15008 may be configured to control the light emitting system 15002 to adjust an output power of the one or more light emitter 15004 (illustratively, to decrease an output power of overheated light emitters 15004). By way of example, the overall output power may be reduced. As another example, the individual output power of one or more of the light emitters 15004 may be reduced.

The thermal management circuit 15028 may be configured to provide the temperature data to the one or more processors 15018. The one or more processors 15018 may be configured to generate the plurality of emission patterns taking into consideration the temperature data. By way of example, the one or more processors 15018 may be configured to generate the emission patterns such that an individual temperature of the light emitters 15004 does not exceed a predetermined threshold. As an example, the one or more processors 15018 may be configured to generate the emission patterns such that a light emitter 15004 may emit light for a small number of consecutive emission patterns, for example less than three or less than two consecutive emission patterns.

The LIDAR system 15000 may include an analog-to-digital converter 15020. The analog-to-digital converter 15020 may be configured to convert the analog sensor signals into a digital (or digitized) sensor signals. The analog-to-digital converter 15020 may be configured to provide the digital sensor signals to the one or more processors 15018. The analog-to-digital converter 15020 may be configured to convert a sum (e.g., a weighted sum) of a plurality of analog sensor signals into a digital sum signal, as illustrated for example in FIG. 150D. The plurality of analog sensor signals may be provided at the same time to the analog-to-digital converter 15020 (e.g., a sensor signal for each sensor pixel 15012 of an array of sensor pixels 15012). The analog-to-digital converter 15020 may be configured to provide the digital sum signal to the one or more processors 15018.

The components of the LIDAR system 15000 (e.g., the one or more processors 15018, the light emitting controller 15008, the analog-to-digital converter 15020, the thermal management circuit 15028) may have access to a common reference clock. This may provide synchronicity to the operation of the various components.

The LIDAR system 15000 may include detector optics 15022 (e.g., one or more optical components) configured to direct light towards the sensor 52. Illustratively, the detector optics 15022 may be configured to collect light from the field of view 15010 and direct the light towards the sensor 52. The detector optics 15022 may be configured to transfer (e.g., to focus) the light onto a single area (e.g., onto a single sensor pixel 15012, as illustrated for example in FIG. 150B). The detector optics 15022 may be or may be configured as non-imaging optics (e.g., a compound parabolic concentrator), as illustrated for example in FIG. 150D. The detector optics 15022 may include an optical coating for wavelength filtering (e.g., to filter light outside the infra-red or near infra-red wavelength range or outside the wavelength range emitted by the light source 42).

The LIDAR system 15000 may include a receiver optical component 15024, as illustrated for example in FIG. 150E. The receiver optical component 15024 may be configured to collimate received light (e.g., light coming from the field of view 15010 or light coming from the detector optics 15022). The receiver optical component 15024 may be configured to transmit light in accordance (e.g., in synchronization) with the emitted emission pattern. The receiver optical component 15024 may be a controllable two-dimensional aperture. By way of example, as illustrated in FIG. 150E, the receiver optical component 15024 may include a plurality of pixels. The receiver optical component 15024 may be configured to control a transmission factor for each pixel in accordance with the emitted emission pattern. Illustratively, the receiver optical component 15024 may be configured to individually control the pixels such that the pixels that may receive reflected light (e.g., light associated with the emitted pattern) may let pass light or direct light towards the sensor 52 (e.g., may have a high transmission, for example substantially 1, or may have a high reflectivity, for example substantially 1). The receiver optical component 15024 may be configured to individually control the pixels such that the pixels that may not receive reflected light (e.g., may not receive the reflected emitted light, but for example only ambient light) may block light or deflect light away (e.g., may have a low transmission, for example substantially 0). By way of example, the receiver optical component 15024 may include a liquid crystal display, or a liquid crystal on silicon device, or a digital micro-mirror device. The receiver optical component 15024 may include an optical filter to filter the received light. The optical filter may be configured to block light outside a predefined wavelength range, for example outside the infra-red or near infra-red wavelength range, e.g. outside the wavelength range emitted by the light source 42.

The LIDAR system 15000 may include a controllable optical attenuator 15026 (e.g., the receiver optical component 15024 may be configured as controllable optical attenuator), as illustrated in FIG. 150F. The controllable optical attenuator 15026 may be configured to controllably attenuate received light (e.g., light coming from the field of view 15010 or light coming from the detector optics 15022). The controllable optical attenuator 15026 may be configured to dynamically adapt to the ambient conditions (e.g., to the current ambient light condition, for example based on an input from an ambient light sensor). Illustratively, the controllable optical attenuator 15026 may be configured to increase light attenuation (e.g., reduce transmission) in case of high level of ambient light (e.g., above a predefined threshold). The controllable optical attenuator 15026 may be configured to reduce light attenuation (e.g., increase transmission) in case of low level of ambient light (e.g., below the predefined threshold). The controllable optical attenuator 15026 may provide light attenuation globally or pixel-wise. By way of example, the controllable optical attenuator 15026 may include a plurality of pixels. The controllable optical attenuator 15026 may be configured to individually control the pixels to provide a pattern of light attenuation.

FIG. 151A to FIG. 151D show a segmentation of the field of view 15010 in a schematic representation in accordance with various embodiments.

Figure 151B:
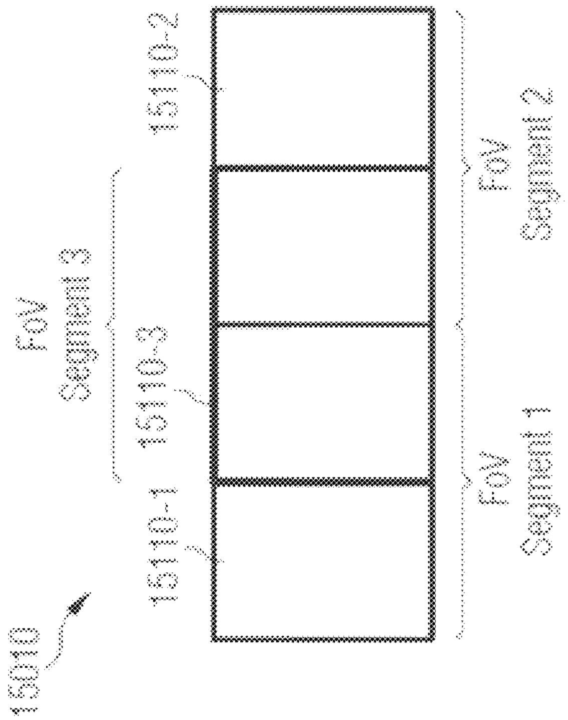
Figure 151A:
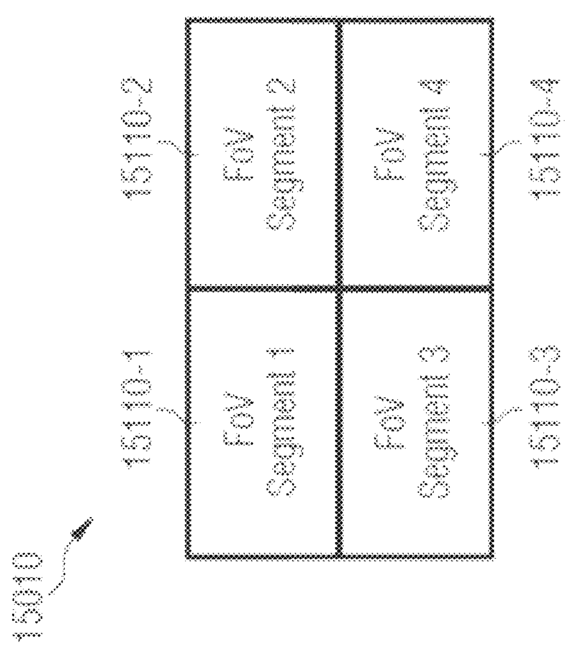
Figure 151C:
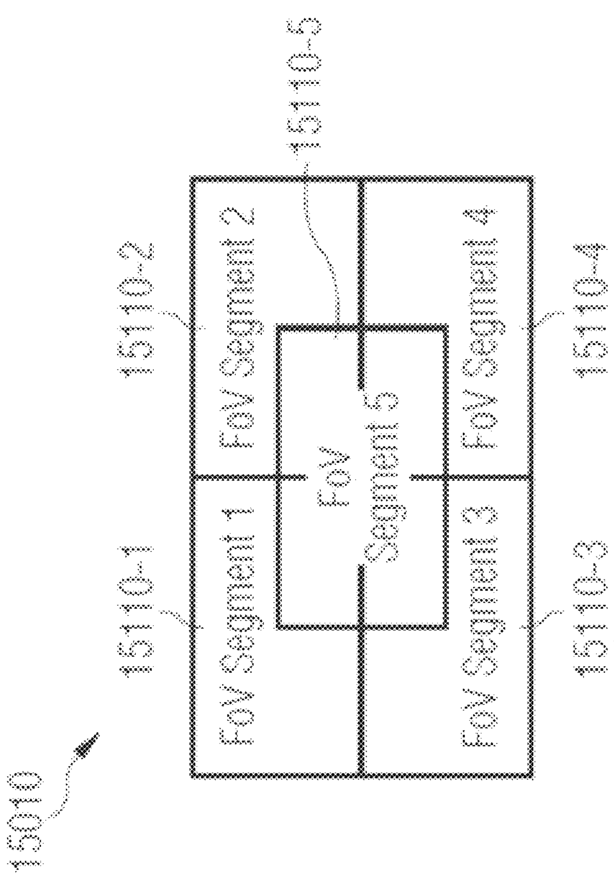

The LIDAR system 15000 may be configured to provide a segmentation of the field of view 15010. Illustratively, the field of view 15010 may be divided into segments (or areas). The field of view segments may be separate, e.g. non-overlapping, as illustrated in FIG. 151A (e.g., a first field of view segment 15110-1, a second field of view segment 15110-2, a third field of view segment 15110-3, and a fourth field of view segment 15110-4 may be non-overlapping). Alternatively, at least some field of view segments may overlap (e.g., at least partially) with one another, as illustrated in FIG. 151B and FIG. 151C. By way of example, the third field of view segment 15110-3 may overlap (e.g., may have a 50% overlap) with the first field of view segment 15110-1 and with the second field of view segment 15110-2. As another example, a fifth field of view segment 15110-5 may overlap (e.g., may have a 25% overlap) with the first to fourth field of view segments.

Figure 151D:
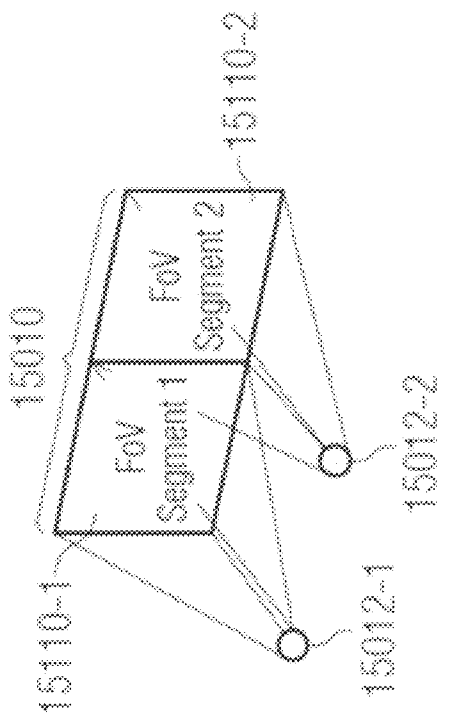

By way of example, the sensor 52 may include physically separated sensor pixels 15012, as illustrated in FIG. 151D. The sensor 52 may include a first sensor pixel 15012-1 and a second sensor pixel 15012-2. The first sensor pixel 15012-1 may be physically separated from the second sensor pixel 15012-2. Each sensor pixel 15012 may be associated with a respective field of view segment (e.g., may receive light from the respective field of view segment). The first sensor pixel 15012-1 may receive light from the first field of view segment 15110-1. The second sensor pixel 15012-2 may receive light from the second field of view segment 15110-2. The first sensor pixel 15012-1 and the second sensor pixel 15012-2 may be included in the same sensor 52 or in different sensors 52 (e.g., in different sub-sensors of the sensor 52, for example single-pixel sub-sensors).

As another example, the LIDAR system 15000 may include a plurality of LIDAR systems (or LIDAR subsystems), associated with different segments of the field of view. The LIDAR system 15000 may include a further (or a plurality of further) light emitting system including one or more further light emitters. The LIDAR system 15000 may include a further (or a plurality of further) light emitting controller configured to control the further light emitting system to emit light to emit a further plurality of different emission patterns as a function of a further compressed sensing algorithm. The LIDAR system 15000 may include a further (or a plurality of further) sensor 52 including at least one photo diode. The LIDAR system 15000 may include one or more further processors configured to reconstruct a further image based on sensor signals detected by the further sensor in accordance with the further compressed sensing algorithm.

FIG. 152A to FIG. 152K describe various aspects of a pattern adaptation process in a schematic representation in accordance with various embodiments.

The one or more processors 15018 may be configured to dynamically adapt the emission patterns to be emitted (e.g., the one or more processors 15018 may be configured to implement an adaptive compression sensing algorithm). Illustratively, the adaptive compression sensing algorithm may update the emission patterns to image regions of interest in the scene, based on results or intermediate results (or intermediate results) of the image reconstruction. The one or more processors 15018 may be configured to classify one or more regions of interest in the field of view 15010 of the LIDAR system 15000. The one or more processors 15018 may be configured to generate the plurality of different emission patterns individually for the one or more regions of interest (illustratively, according to the classification).

The one or more processors 15018 may be configured to provide an adaptation input to the light emitting controller 15008. The light emitting controller 15008 may be configured to control the light emitting system 15002 to take an overview shot 15204 of the scene, e.g. an overview shot 15204 of the field of view 15010. The overview shot 15204 may represent or may be an image of the scene taken at a low resolution, e.g. at a resolution lower than a maximum resolution of the LIDAR system 15000. By way of example, the overview shot 15204 may be taken (e.g., the image may be generated) with a small number of emission patterns, e.g. smaller than a default imaging process.

The light emitting controller 15008 may be configured to control the light emitting system 15002 to group together the emission of one or more subsets of light emitters 15004 (e.g., to perform binning of the light emitters 15004), as illustrated for example in FIG. 152A and FIG. 152B. Illustratively, light emitters 15004 in an array of light emitters 15004 may be grouped together to emit light as a greater light emitter. The light emitting controller 15008 may be configured to define the groups according to the desired resolution for the overview shot 15204. By way of example, a first (e.g., high) resolution may be provided by the individual light emitters 15004 (e.g., by creating one or more first groups 15202-1 each including a single light emitter 15004). The first resolution may correspond to the physical resolution of the array of light emitters 15004. A second (e.g., medium, illustratively lower than the first) resolution may be provided by creating one or more second groups 15202-2 (e.g., including more light emitters 15004 than the first groups 15202-1), for example each including four light emitters 15004 (e.g., in a two by two sub-array). A third (e.g., low, illustratively lower than the first and than the second) resolution may be provided by creating one or more third groups 15202-3 (e.g., including more light emitters 15004 than the first groups 15202-1 and second groups 15202-2), for example each including nine light emitters 15004 (e.g., in a three by three sub-array). Illustratively, as shown in FIG. 152B, light emitter arrays (e.g., laser grids) with different spatial resolution may be provided with the different groups. It is understood that the groups illustrated in FIG. 152A are shown as an example, and different groupings are possible, e.g. depending on the desired resolution.

The one or more processors 15018 may be configured to analyze the overview shot 15204, as illustrated in FIG. 152C to FIG. 152E. The one or more processors 15018 may be configured to classify (e.g., identify) the regions of interest in the field of view 15010 of the LIDAR system 15000 by analyzing the overview shot 15204 (e.g., to classify the regions of interest by using the overview shot 15204).

The one or more processors 15018 may be configured to classify the regions of interest according to one or more relevance criteria. By way of example, regions of interest may be classified according to their distance. A first region of interest 15204-1 may be located further away from the LIDAR system with respect to a second region of interest

15204-2 (e.g., the objects, for example pedestrians, in the second region of interest 15204-2 may be closer to the LIDAR system 15000). Alternatively or additionally, the first region of interest 15204-1 may comprise objects with lower relevance (e.g., less critical, for example in relation to driving safety) with respect to the second region of interest 15204-2 (e.g., the objects, for example pedestrians, in the second region of interest 15204-2 may be considered more relevant or more critical). Illustratively, the second region of interest 15204-2 may be classified as more relevant than the first region of interest 15204-1.

The one or more processors 15018 may be configured to create one or more bounding boxes according to the identified regions of interest. Each region of interest may be associated with a corresponding bounding box. A bounding box may enclose the associated region of interest (e.g., the first region of interest 15204-1 may be enclosed by a first bounding box 15206-1 and the second region of interest 15204-2 may be enclosed by a second bounding box 15206-2). Illustratively, a bounding box may include or represent a group of pixels in the overview shot 15204 associated with the respective region of interest. A bounding box may define a group of sensor pixels 15012 and/or or a group of light emitters 15004, for example in an emitter array, associated with the respective region of interest.

The one or more processors 15018 may be configured to assign a priority value to each region of interest (e.g., to each bounding to box). The priority may be assigned according to the classification, e.g. according to the relevance criteria for the respective region of interest. By way of example, the second region of interest 15204-2 may have a higher priority value (e.g., a higher priority ranking) than the first region of interest 15204-1. Accordingly, the second bounding box 15206-2 may have a higher priority is value than the first bounding box 15206-1.

The one or more processors 15018 may be configured to generate the plurality emission patterns individually for the one or more regions of interest having different spatial resolutions, as illustrated for example in FIG. 152F. The one or more processors 15018 may be configured to generate the plurality emission patterns according to the priority of the respective region of interest (e.g., according to the relevance of the respective region of interest and to be emitted and/or analyzed according to the respective priority, as described in further detail below). Illustratively, for each identified region of interest (e.g., each bounding box) a high resolution, or intermediate resolution, or low resolution emission pattern may be provided (e.g., different binning of the light emitters 15004).

By way of example, the one or more processors 15018 may be configured to generate an emission pattern for a region of interest having a higher assigned priority value, e.g. higher than another region of interest, having higher spatial resolution than the emission pattern for the other region of interest. As another example, the one or more processors 15018 may be configured to generate an emission pattern for a region of interest having a lower assigned priority value, e.g. lower than another region of interest, having higher spatial resolution than the emission pattern for the other region of interest. Different groupings of light emitters 15004 may be provided for different regions of interest having different priority. Illustratively, the light emitters 15004 associated with a region of interest (e.g., emitting light towards that region) may be grouped together according to a desired resolution for that region of interest. By way of example, a three by three binning 15202-3 of the light emitters 15004 may be provided for the first region of interest 15204-1, and an individual binning 15202-1 of the light emitters 15004 may be provided for the second region of interest 15204-1.

The one or more processors 15018 may be configured to generate a plurality of virtual emission patterns associated with a region of interest based on the desired resolution. Illustratively, a virtual emission pattern may describe or include a number (and a grouping) of light emitters 15004 to image the associated region of interest at the desired resolution. By way of example, a plurality of first virtual emission patterns 15208-1 may be generated for the first region of interest 15204-1 and a plurality of second virtual emission patterns 15208-2 (illustratively, with higher resolution) may be generated for the second region of interest 15204-2 (as shown in FIG. 152G and FIG. 152H).

The one or more processors 15018 may be configured to generate an emission pattern for a region of interest by mapping the corresponding virtual emission pattern onto the light emitters 15004. Illustratively, the mapping may be understood as determining the light emitters 15004 to be controlled (e.g., their location in the array of light emitters 15004) for imaging the respective region of interest at the desired resolution. Stated in another fashion, the mapping may be understood as determining the light emitters 15004 to be controlled for imaging the portion of field of view 15010 associated with the region of interest at the desired resolution. By way of example, a plurality of emission patterns 15210-1 may be generated for the first region of interest 15204-1 and a plurality of second emission patterns 15210-2 may be generated for the second region of interest 15204-2 (as shown in FIG. 152I and FIG. 152J).

A combined emission pattern may be generated for a plurality of regions of interest, for example in case the regions of interest (e.g., the corresponding bounding boxes) do not overlap with one another. Illustratively, an emission pattern for a region of interest and an emission pattern for another region of interest (e.g., having same or different priority) may be included in a same emission pattern in case the regions of interest does not overlap with one another. Further illustratively, a combined emission pattern may be generated by mapping the virtual emission patterns associated with different regions of interest onto the light emitters 15004. By way of example, a combined emission pattern 15210-3 may be generated for the first region of interest 15204-1 and the second region of interest 15204-2 (e.g., combining the first virtual emission patterns 15208-1 and the second virtual emission patterns 15208-2), as illustrated for example in FIG. 152K.

The adapted emission patterns may be used to take refinement shots (e.g., shots at the adapted resolution) for the different regions of interest. The refinement shots may be taken in accordance with the priority assigned to the regions of interest. The sensor signals associated with different regions of interest may be analyzed according to the priority assigned to the respective region of interest. By way of example, faster results may be provided for close by objects, whereas far away objects may be treated at a subsequent time point, e.g. with lower priority. Illustratively, the one or more processors 15018 may be configured to process a signal generated by the sensor 52 and associated with a region of interest having a higher assigned priority value than another region of interest prior to processing a signal generated by the sensor and associated with the other region of interest. By way of example, sensor signals associated with the second region of interest 15204-2 may be processed prior to processing sensor signals associated with the first region of interest 15204-1.

FIG. 153 shows a flow diagram for a pattern adaptation algorithm 15300 in accordance with various embodiments.

The algorithm 15300 may include a "start", in 15302. The algorithm 15300 may include, in 15304, taking the overview shot (e.g., at medium resolution or low resolution), for example using a predefined emission pattern sequence (e.g., including a small number of patterns).

The algorithm 15300 may include, in 15306, analyzing and classifying pixels in the overview shot, for example according to the distance (e.g., close/far), to the signal quality (e.g., good signal/bad signal), and other relevance criteria.

The algorithm 15300 may include, in 15308, determining regions of interest (e.g., a dark area, a close object, and the like), and determine and assign priorities to the regions of interest.

The algorithm 15300 may include, in 15310, create a list of bounding boxes sorted (in other words, ranked) according to their priorities. The first entry in the list may have the highest priority.

The algorithm 15300 may include, in 15312, selecting an entry in the list (e.g., the first entry in the list) and resetting a watchdog timer.

The algorithm 15300 may include, in 15314 determining whether the selected entry exists (e.g., whether the list includes that element, e.g. it is not empty) and whether the watchdog timer is not fired. In case it is false, the algorithm 15300 may re-start. In case it is true, the algorithm 15300 may proceed further to the next step, e.g. 15316.

The algorithm 15300 may include, in 15316, creating an emission pattern sequence for the current bounding box (e.g., the selected entry of the list).

The algorithm 15300 may include, in 15318, taking a refinement shot (illustratively, using the previously created emission pattern).

The algorithm 15300 may include, in 15320, selecting the next entry in the list and go back to 15314.

FIG. 154A and FIG. 154B show each a LIDAR system 15400 in a schematic representation in accordance with various embodiments.

The LIDAR system 15400 may be an exemplary realization of the LIDAR system 15000. Illustratively, the components of the LIDAR system 15400 may be an exemplary realization of the components of the LIDAR system 15000.

The LIDAR system 15400 may include an emitter array 15402, e.g. an array of light emitters (e.g., an array of laser emitters, such as a VCSEL array). The emitter array 15402 may be an example of light emitting system 15002.

The LIDAR system 15400 may include a driver 15404 (e.g., a VCSEL driver). The driver 15404 may be configured to control the emitter array 15402, e.g. to individually control the light emitters of the emitter array 15402. The driver 15404 may be configured to control the emitter array 15402 to emit light to emit a plurality of different emission patterns as a function of a compressed sensing algorithm. The driver 15404 may be an example of light emitting controller 15008.

The LIDAR system 15400 may include a single-pixel detector 15406. The single-pixel detector 15406 may be configured to generate a signal (e.g., an analog signal) in response to light impinging onto the single-pixel detector 15406. The single-pixel detector 15406 may be an example of sensor 52.

The LIDAR system 15400 may include an analog-to-digital converter 15408. The analog-to-digital converter 15408 may be configured to convert the analog signal provided by the single-pixel detector 15406 into a digital signal. The analog-to-digital converter 15408 may be configured to provide the digital signal to a compressed processing computational system 15410. The analog-to-digital converter 15408 may be configured to sample the analog signal provided by the single-pixel detector 15406, e.g. according to a trigger signal received by the compressed processing computational system 15410.

The compressed processing computational system 15410 may be configured to reconstruct an image based on sensor signals detected by the single-pixel detector 15406. The reconstruction may be in accordance with the compressed sensing algorithm. By way of example, the compressed processing computational system 15410 may include an image reconstruction system 15410-1. The image reconstruction system 15410-1 may be configured to implement an image reconstruction algorithm. The image reconstruction system 15410-1 may be configured to provide, as an output, the reconstructed image.

The compressed processing computational system 15410 may be configured to generate the plurality of different emission patterns (e.g., randomly or pseudo-randomly). The compressed processing computational system 15410 may be configured to provide a corresponding emission pattern to the driver 15404. The generation of the emission patterns may be in accordance with the compressed sensing algorithm. By way of example, the compressed processing computational system 15410 may include a pattern generation system 15410-2. The pattern generation system 15410-2 may be configured to implement pattern generation algorithm. The pattern generation system 15410-2 may be configured to provide the generated patterns to the driver 15204 and to the image reconstruction system 15410-1. The pattern generation system 15410-2 may be configured to provide a trigger signal to the driver 15404 and to the image reconstruction system 15410-1.

The compressed processing computational system 15410 may be configured to update the emission patterns, e.g. to provide an adaptive compressed sensing algorithm. By way of example, the compressed processing computational system 1410 may include a pattern adaptation system 15410-3. The pattern adaptation system 15410-3 may be configured to implement the pattern adaptation algorithm. The pattern adaptation system 15410-3 may be configured to receive the output of the image reconstruction system 15410-1. The pattern adaptation system 15410-3 may be configured to provide the updated or adapted patterns to the pattern generation system 15410-2. The pattern adaptation system 15410-3 may be configured to provide a trigger signal to the pattern generation system 15410-2. The pattern adaptation system 15410-3 may be configured to receive system-external inputs, for example data from a sensor fusion system. The external data may describe or include object detection, object recognition (and/or object classification), object tracking, a classification algorithm, and the like. As an example, the external data may include a traffic map as described, for example, in relation to FIG. 127 to FIG. 130.

The LIDAR system 15400 may include a thermal management circuit 15412. The thermal management circuit 15412 may be configured to receive a temperature input and additional monitoring parameters from the emitter array 15402. The thermal management circuit 15412 may be configured to provide constraints and other parameters to the compressed processing computational system 15410 (illustratively, thermal pattern constraints and parameters). The thermal management circuit 15412 may be configured to provide control parameters (e.g., constraints) to the driver 15404 (illustratively, thermal driver control parameters).

The thermal management circuit 15412 may be configured to receive the emission patterns from the pattern generation system 15410-2 (e.g., for association with the temperature of the light emitters).

In the following, various aspects of this disclosure will be illustrated:

Example 1 ac is a LIDAR Sensor System. The LIDAR Sensor System may include a light emitting system including one or more light emitters. The LIDAR Sensor System may include a light emitting controller configured to control the light emitting system to emit light to emit a plurality of different emission patterns as a function of a compressed sensing algorithm. The LIDAR Sensor System may include a sensor including at least one photo diode. The LIDAR Sensor System may include one or more processors configured to reconstruct an image based on sensor signals detected by the sensor in accordance with the compressed sensing algorithm.

In Example 2ac, the subject-matter of example 1 ac can optionally include that the light emitting controller is configured to control the light emitting system to emit light in a pulsed fashion to emit the plurality of different emission patterns in a pulsed fashion.

In Example 3ac, the subject-matter of any one of examples 1ac or 2ac can optionally include that at least one light emitter of the one or more light emitters is configured to emit light in an infrared wavelength region.

In Example 4ac, the subject-matter of any one of examples 1ac to 3ac can optionally include that at least one light emitter of the one or more light emitters is configured to emit light having a wavelength of about 905 nm and/or that at least one light emitter of the one or more light emitters is configured to emit light having a wavelength of about 1550 nm.

In Example 5ac, the subject-matter of any one of examples 1 ac to 4ac can optionally include that the light emitting system includes a plurality of light emitters. At least one emission pattern may include one or more first light emitters each emitting light and one or more second light emitters each not emitting light.

In Example 6ac, the subject-matter of any one of examples 1 ac to 5ac can optionally include that the light emitting system further includes a micro-lens array arranged downstream of the one or more light emitters to collimate the light emitted by the one or more light emitters.

In Example 7ac, the subject-matter of any one of examples 1 ac to 6ac can optionally include that the one or more light emitters include a two dimensional laser array including a plurality of laser emitters arranged in a two dimensional manner.

In Example 8ac, the subject-matter of example 7ac can is optionally include that at least some laser emitters of the plurality of laser emitters are vertical cavity surface emitting lasers.

In Example 9ac, the subject-matter of any one of examples 7ac or 8ac can optionally include that the light emitting controller is configured to individually control the laser emitters of the two dimensional laser array to emit laser pulses to emit the plurality of different emission patterns as a function of the compressed sensed algorithm.

In Example 10ac, the subject-matter of any one of examples 1 ac to 9ac can optionally include an analog-to-digital converter to convert the analog sensor signals into digital sensor signals which are provided to the one or more processors.

In Example 11 ac, the subject-matter of example 10ac can optionally include that the analog-to-digital converter is configured to convert a sum or a weighted sum of a plurality of analog sensor signals provided at the same time into a digital sum signal and to provide the digital sum signal to the one or more processors.

In Example 12ac, the subject-matter of any one of examples 1ac to 11ac can optionally include that the at least one photo diode is an avalanche photo diode.

In Example 13ac, the subject-matter of example 12ac can optionally include that the at least one avalanche photo diode is a single-photon avalanche photo diode.

In Example 14ac, the subject-matter of any one of examples 1ac to 13ac can optionally include that the sensor includes a Silicon Photomultiplier.

In Example 15ac, the subject-matter of any one of examples 1ac to 14ac can optionally include that the one or more processors are configured to generate the plurality of different emission patterns and to is provide a corresponding emission pattern of the plurality of different emission patterns to the light emitting controller.

In Example 16ac, the subject-matter of example 15ac can optionally include that the one or more processors are configured to generate the plurality of different emission patterns randomly or pseudo-randomly.

In Example 17ac, the subject-matter of any one of examples 1ac to 16ac can optionally include that the one or more processors are configured to provide an adaptive compressed sensing algorithm that, based on results or intermediate results or intermediate results of the image reconstruction, updates the emission patterns to image regions of interest in the scene.

In Example 18ac, the subject-matter of any one of examples 1ac to 17ac can optionally include that the one or more processors are configured to classify one or more regions of interest in the field-of-view of the LIDAR Sensor System. The one or more processors may be configured to generate the plurality of different emission patterns individually for the one or more regions of interest of the field-of-view of the LIDAR Sensor System.

In Example 19ac, the subject-matter of example 18ac can optionally include that the one or more processors are configured to classify the one or more regions of interest in the field-of-view of the LIDAR Sensor System by using an overview shot. The overview shot may represent an image of the scene at a resolution lower than a maximum resolution of the LIDAR Sensor System.

In Example 20ac, the subject-matter of any one of examples 18ac or 19ac can optionally include that each region of interest is associated with a corresponding bounding box.

In Example 21ac, the subject-matter of any one of examples 18ac to 20ac can optionally include that the one or more processors are configured to classify the one or more regions of interest in the field-of-view of the LIDAR Sensor System according to one or more relevance criteria.

In Example 22ac, the subject-matter of any one of examples 18ac to 21ac can optionally include that the one or more processors are configured to generate the plurality of different emission patterns individually for the one or more regions of interest having different spatial resolutions.

In Example 23ac, the subject-matter of any one of examples 18ac to 22ac can optionally include that the one or more processors are configured to assign a priority value to each region of interest according to the classification.

In Example 24ac, the subject-matter of example 23ac can optionally include that the one or more processors are configured to generate an emission pattern for a region of interest having a higher assigned priority value than another region of interest, the emission pattern having higher spatial resolution than an emission pattern for the other region of interest.

In Example 25ac, the subject-matter of example 24ac can optionally include that an emission pattern for the region of interest and an emission pattern for the other region of interest are included in a same emission pattern in case the region of interest does not overlap with the other region of interest.

In Example 26ac, the subject-matter of any one of examples 24ac or 25ac can optionally include that the one or more processors are configured to process a signal generated by the sensor and associated with a region of interest having a higher assigned priority value than another region of interest prior to processing a signal generated by the sensor and associated with the other region of interest.

In Example 27ac, the subject-matter of any one of examples 1 ac to 26ac can optionally include that the sensor consists of exactly one sensor pixel.

In Example 28ac, the subject-matter of any one of examples 1 ac to 26ac can optionally include that the sensor includes a first sensor pixel and a second sensor pixel, the first sensor pixel being physically separated from the second sensor pixel.

In Example 29ac, the subject-matter of any one of examples 1 ac to 26ac can optionally include that the sensor consists of a plurality of sensor pixels arranged in one direction to form a one-dimensional sensor pixel array.

In Example 30ac, the subject-matter of any one of examples 1 ac to 26ac can optionally include that the sensor consists of a plurality of sensor pixels arranged in two directions to form a two-dimensional sensor pixel array.

In Example 31ac, the subject-matter of any one of examples 1 ac to 30ac can optionally include a receiver optical component to collimate received light.

In Example 32ac, the subject-matter of example 31ac can optionally include that the receiver optical component includes a digital micro-mirror device or a liquid crystal on silicon device or a liquid crystal display.

In Example 33ac, the subject-matter of any one of examples 31ac or 32ac can optionally include that the receiver optical component includes an optical filter to filter the received light.

In Example 34ac, the subject-matter of any one of examples 1 ac to 33ac can optionally include a controllable optical attenuator to controllably attenuate received light.

In Example 35ac, the subject-matter of any one of examples 1 ac to 34ac can optionally include a further light emitting system including one or more further light emitters; a further light emitting controller configured to control the further light emitting system to emit light to emit a further plurality of different emission patterns as a function of a further compressed sensing algorithm; a further sensor including at least one photo diode; and one or more further processors configured to reconstruct a further image based on sensor signals detected by the further sensor in accordance with the further compressed sensing algorithm.

In Example 36ac, the subject-matter of any one of examples 1 ac to 35ac can optionally include a thermal management circuit configured to control the LIDAR Sensor System in accordance with a measured temperature of the one or more light emitters.

In Example 37ac, the subject-matter of example 36ac can optionally include that the thermal management circuit is configured to provide temperature data to the light emitting controller. The temperature data may describe an individual temperature of each light emitter of the one or more light emitters.

In Example 38ac, the subject-matter of example 37ac can optionally include that the thermal management circuit is configured to associate the temperature data with a respective emission pattern of the plurality of emission patterns.

In Example 39ac, the subject-matter of any one of examples 37ac or 38ac can optionally include that the one or more processors are further configured to generate the plurality of emission patterns taking into consideration the temperature data.

Example 40ac is a method for operating a LIDAR Sensor System. The LIDAR Sensor System may include a light emitting system including one or more light emitters. The LIDAR Sensor System may include a sensor including at least one photo diode. The method may include controlling the light emitting system to emit light to emit a plurality of different emission patterns as a function of a compressed sensing algorithm. The method may include reconstructing an image based on sensor signals detected by the sensor in accordance with the compressed sensing algorithm.

In Example 41ac, the subject-matter of example 40ac can optionally include controlling the light emitting system to emit light in a pulsed fashion to emit the plurality of different emission patterns in a pulsed fashion.

In Example 42ac, the subject-matter of any one of examples 40ac or 41ac can optionally include that at least one light emitter of the one or more light emitters is configured to emit light in an infrared wavelength region.

In Example 43ac, the subject-matter of any one of examples 40ac to 42ac can optionally include that at least one light emitter of the one or more light emitters is configured to emit light having a wavelength of about 905 nm and/or wherein at least one light emitter of the one or more light emitters is configured to emit light having a wavelength of about 1550 nm.

In Example 44ac, the subject-matter of any one of examples 40ac to 43ac can optionally include that the light emitting system includes a plurality of light emitters. At least one emission pattern may include one or more first light emitters each emitting light and one or more second light emitters each not emitting light.

In Example 45ac, the subject-matter of any one of examples 40ac to 44ac can optionally include that the light emitting system further includes a micro-lens array arranged downstream of the one or more light emitters to collimate the light emitted by the one or more light emitters.

In Example 46ac, the subject-matter of any one of examples 40ac to 45ac can optionally include that the one or more light emitters include a two-dimensional laser array including a plurality of laser emitters arranged in a two dimensional manner.

In Example 47ac, the subject-matter of example 46ac can optionally include that at least some laser emitters of the plurality of laser emitters are vertical cavity surface emitting lasers.

In Example 48ac, the subject-matter of any one of examples 46ac or 47ac can optionally include individually controlling the laser emitters of the two-dimensional laser array to emit laser pulses to emit the plurality of different emission patterns as a function of the compressed sensed algorithm.

In Example 49ac, the subject-matter of any one of examples 40ac to 48ac can optionally include converting the analog sensor signals into digital sensor signals.

In Example 50ac, the subject-matter of example 49ac can optionally include converting a sum or a weighted sum of a plurality of analog sensor signals provided at the same time into a digital sum signal.

In Example 51ac, the subject-matter of any one of examples 40ac to 50ac can optionally include that the at least one photo diode is an avalanche photo diode.

In Example 52ac, the subject-matter of example 51ac can optionally include that the at least one avalanche photo diode is a single-photon avalanche photo diode.

In Example 53ac, the subject-matter of any one of examples 40ac to 52ac can optionally include that the sensor includes a Silicon Photomultiplier.

In Example 54ac, the subject-matter of any one of examples 40ac to 53ac can optionally include generating the plurality of different emission patterns and providing a corresponding emission pattern of the plurality of different emission patterns to a light emitting controller.

In Example 55ac, the subject-matter of example 54ac can optionally include that the plurality of different emission patterns are generated randomly or pseudo-randomly.

In Example 56ac, the subject-matter of any one of examples 40ac to 55ac can optionally include providing an adaptive compressed sensing algorithm that, based on results or intermediate results or intermediate results of the image reconstruction, updates the emission patterns to image regions of interest in the scene.

In Example 57ac, the subject-matter of any one of examples 40ac to 56ac can optionally include classifying one or more regions of interest in the field-of-view of the LIDAR Sensor System. The method may include generating the plurality of different emission patterns individually for the one or more regions of interest of the field-of-view of the LIDAR Sensor System.

In Example 58ac, the subject-matter of example 57ac can optionally include that the one or more regions of interest in the field-of-view of the LIDAR Sensor System are classified by using an overview shot. The overview shot may represent an image of the scene at a resolution lower than a maximum resolution of the LIDAR Sensor System.

In Example 59ac, the subject-matter of any one of examples 57ac or 58ac can optionally include associating each region of interest with a corresponding bounding box.

In Example 60ac, the subject-matter of any one of examples 57ac to 59ac can optionally include that the one or more regions of interest in the field-of-view of the LIDAR Sensor System are classified according to one or more relevance criteria.

In Example 61ac, the subject-matter of any one of examples 57ac to 60ac can optionally include generating the plurality of different emission patterns individually for the one or more regions of interest having different spatial resolutions.

In Example 62ac, the subject-matter of any one of examples 57ac to 61ac can optionally include assigning a priority value to each region of interest according to the classification.

In Example 63ac, the subject-matter of example 62ac can optionally include that an emission pattern for a region of interest having a higher assigned priority value than another region of interest is generated having higher spatial resolution than an emission pattern for the other region of interest.

In Example 64ac, the subject-matter of example 63ac can optionally include including an emission pattern for the region of interest and an emission pattern for the other region of interest in a same emission pattern in case the region of interest does not overlap with the other region of interest.

In Example 65ac, the subject-matter of any one of examples 63ac or 64ac can optionally include processing a signal generated by the sensor and associated with a region of interest having a higher assigned priority value than another region of interest prior to processing a signal generated by the sensor and associated with the other region of interest.

In Example 66ac, the subject-matter of any one of examples 40ac to 65ac can optionally include that the sensor consists of exactly one sensor pixel.

In Example 67ac, the subject-matter of any one of examples 40ac to 65ac can optionally include that the sensor includes a first sensor pixel and a second sensor pixel, the first sensor pixel being physically separated from the second sensor pixel.

In Example 68ac, the subject-matter of any one of examples 40ac to 65ac can optionally include that the sensor consists of a plurality of sensor pixels arranged in one direction to form a one-dimensional sensor pixel array.

In Example 69ac, the subject-matter of any one of examples 40ac to 65ac can optionally include that the sensor consists of a plurality of sensor pixels arranged in two directions to form a two-dimensional sensor pixel array.

In Example 70ac, the subject-matter of any one of examples 40ac to 69ac can optionally include a receiver optical component collimating received light.

In Example 71ac, the subject-matter of example 70ac can optionally include that the receiver optical component includes a digital micro-mirror device or a liquid crystal on silicon device or a liquid crystal display.

In Example 72ac, the subject-matter of any one of examples 70ac or 71ac can optionally include that the receiver optical component includes an optical filter to filter the received light.

In Example 73ac, the subject-matter of any one of examples 40ac to 72ac can optionally include a controllable optical attenuator controllably attenuating received light.

In Example 74ac, the subject-matter of any one of examples 40ac to 73ac can optionally include a further light emitting system including one or more further light emitters; a further light emitting controller controlling the further light emitting system to emit light to emit a further plurality of different emission patterns as a function of a further compressed sensing algorithm; a further sensor including at least one photo diode; one or more further processors reconstructing a further image based on sensor signals detected by the further sensor in accordance with the further compressed sensing algorithm.

In Example 75ac, the subject-matter of any one of examples 40ac to 74ac can optionally include a thermal management circuit controlling the LIDAR Sensor System in accordance with a measured temperature of the one or more light emitters.

In Example 76ac, the subject-matter of example 75ac can optionally include the thermal management circuit providing temperature data to a light emitting controller, the temperature data describing an individual temperature of each light emitter of the one or more light emitters.

In Example 77ac, the subject-matter of example 76ac can optionally include the thermal management circuit associating the temperature data with a respective emission pattern of the plurality of emission patterns.

In Example 78ac, the subject-matter of any one of examples 76ac or 77ac can optionally include generating the plurality of emission patterns taking into consideration the temperature data.

Example 79ac is a computer program product, including a plurality of program instructions that may be embodied in non-transitory computer readable medium, which when executed by a computer program device of a LIDAR Sensor System according to any one of examples 1ac to 39ac, cause the LIDAR Sensor System to execute the method according to any one of the examples 40ac to 78ac.

Example 80ac is a data storage device with a computer program that may be embodied in non-transitory computer readable medium, adapted to execute at least one of a method for LIDAR Sensor System according to any one of the above method examples, the LIDAR Sensor System according to any one of the above LIDAR Sensor System examples.

A conventional LIDAR system (e.g., a solid-state LIDAR system) may include a complex optical stack and a moving mirror (e.g., a MEMS mirror) for laser scanning. In such a conventional LIDAR system, a strict coordination scheme may be implemented for laser pulsing and detection. Alternatively, another conventional LIDAR architecture may include a laser array (e.g., a VCSEL array) on the emitter side to achieve high resolution. In this case, the LIDAR system may include a large detector array to match the intended resolution.

In such conventional LIDAR systems, the crosstalk (e.g. optical crosstalk) from adjacent emitter pixels that pulse simultaneously may disturb or interfere with the detection (in other words, the discerning) of the received light. Furthermore, the detection of the received light between subsequent pulses may include waiting for the time-of-flight of the LIDAR system (illustratively, the LIDAR system may pulse slower than a maximum time-of-flight of the LIDAR system).

A possible solution to the above-mentioned problems may is include modulating a small AC signal on top of a constant DC illumination. This approach may partially solve the crosstalk problem. However, said approach may be limited in resolution and in range, for example due to Laser Safety Standards. A scanning (e.g., MEMS) based LIDAR system may employ such modulation scheme per pulse. However, such scheme may still be limited in the resolution that is free of crosstalk. Illustratively, pulsing in the X-direction and capturing the reflection in the Y-direction may suffer from crosstalk in the Y-direction.

Various embodiments may be related to a light emission scheme for a LIDAR system and to a LIDAR system configured to implement the light emission scheme. The LIDAR system may be configured to superimpose a modulation on the emitted light (e.g., on the emitted light signals, such as on emitted light pulses), such that crosstalk in the whole image resolution may be reduced or substantially eliminated. Illustratively, the crosstalk may be reduced or substantially eliminated both in the horizontal and in the vertical direction. The light emission scheme may include emitting light (e.g., pulsing) at a rate faster than the time-of-flight (e.g., faster than a maximum time-of-flight of the LIDAR system). By way of example, the LIDAR system may be configured as Flash LIDAR system or as a scanning LIDAR system (e.g., including one or more scanning elements, such as one or more scanning mirrors).

In various embodiments, the LIDAR system may include a transmitter (e.g., a light source). The transmitter may be configured to transmit a LIDAR signal. The transmitter may include a plurality (e.g., a number N) of emitter pixels (e.g., a plurality of partial light sources). Each emitter pixel may be configured to emit light, e.g. a light signal.

The emitter pixels may form or may be arranged in an array. As an example, the emitter pixels may be arranged in a one-dimensional array (e.g., the emitter pixels may be arranged into one direction to form the one-dimensional array). The emitter pixels may be arranged in the one-dimensional array in a row or in a column. In case the emitter pixels are arranged in a one-dimensional array (e.g., eight emitter pixels stacked on top of one another, for example eight edge-emitting pixels), the LIDAR system (e.g., the transmitter) may include a scanning element (e.g., a beam steering element), such as a scanning mirror (e.g., a MEMS mirror). As another example, the emitter pixels may be arranged in a two-dimensional array (e.g., the emitter pixels may be arranged into two directions to form the two-dimensional array). The emitter pixels may be arranged in the two-dimensional array in rows and columns. Illustratively, the emitter array may include rows and columns, e.g. a number i of rows and a number j of columns (e.g., the emitter array may include $i \times j$ emitter pixels).

The emitter pixels may include a light emitting diode (LED), e.g. at least one emitter pixel or some emitter pixels or all emitter pixels may include a light emitting diode (LED). Additionally or alternatively, the emitter pixels may include a laser diode (e.g., an edge emitting laser diode or a vertical cavity surface emitting laser), e.g. at least one emitter pixel or some emitter pixels or all emitter pixels may include a laser diode.

Each emitter pixel may have its own field of view (e.g., its own field of emission) at near-field (e.g., a part of the whole field of view of the LIDAR system). Illustratively, each emitter pixel may be assigned to a portion or a segment of the field of view of the LIDAR system (e.g., the field of emission of each emitter pixel may be smaller than the field of view of the LIDAR system). The emitter pixels aggregated may cover the entire scene in the far-field (e.g., a superposition of the individual fields of emission of the emitter pixels may cover or correspond to the field of view of the LIDAR system). Illustratively, the individual fields of emission of the emitter pixels may overlap and may cover the field of view of the LIDAR system in the far-field.

The emitter pixels may be grouped into a plurality of disjunct transmitter groups (e.g., including a first transmitter group and a second transmitter group). Each emitter pixel may be part of exactly one transmitter group. Illustratively, disjunct transmitter groups may be understood as logically distinct groups of emitter pixels (e.g., groups of emitter pixels that may be controlled independently from one another). The number of emitter pixels in different transmitter groups may be the same (e.g., the number of emitter pixels of the first transmitter group and the number of emitter pixels of the second transmitter group may be equal). Alternatively, the number of emitter pixels in different transmitter groups may be different (e.g., the first transmitter group may have a greater or smaller number of emitter pixels than the second transmitter group).

In various embodiments, the LIDAR system may include a transmitter controller (e.g., a light source controller). The transmitter controller may be configured to individually control each emitter pixel (e.g., each emitter pixel may be individually addressable) to emit a plurality of light signals. Illustratively, the transmitter controller may be configured to control the emitter pixels such that at least some of the emitter pixels each emit a respective light signal (e.g., a continuous wave, a light pulse, or a plurality of light pulses).

Different emitter pixels may emit light signals of different type (e.g., a first emitter pixel may emit a continuous wave and a second emitter pixel may emit a plurality of light pulses). Alternatively, the emitter pixels may all emit the same type of light signal.

By way of example, the transmitter controller may be configured to individually control the emitter pixels to emit a plurality of light signal sequence frames (e.g., a plurality of light signals each structured as a frame). Illustratively, the transmitter controller may be configured as the light source controller 13312 described, for example, in relation to FIG. 131A to FIG. 137. As another example, the transmitter controller may be configured to individually control the emitter pixels to emit the plurality of light signals dependent on whether a sensor of the LIDAR system receives a light signal (e.g., an echo light signal or an alien light signal). Illustratively, the transmitter controller may be configured as the light source controller 13804 described, for example, in relation to FIG. 138 to FIG. 144. As a further example, the transmitter controller may be configured to modulate the emitter pixels to modify the waveform of at least one emitted light signal (e.g., one emitted light pulse). Illustratively, the transmitter controller may be configured as the light source controller 14506 described, for example, in relation to FIG. 145A to FIG. 149E.

Each emitter pixel (e.g., in an emitter array) may be modulated with a specific modulation characteristic (e.g., a modulation amplitude, a modulation frequency, a modulation phase, and the like). The transmitter controller may be configured to modulate each emitter pixel such that each emitter pixel may emit a light signal modulated with a respective modulation characteristic. Illustratively, in case the emitter pixels are arranged in a two-dimensional array, a matrix of modulation characteristics (e.g., a matrix of modulation frequencies) may be provided. The matrix of modulation characteristics may be referred to as modulation matrix. A light signal emitted by an emitter pixel may include a modulation superimposed on a main signal (e.g., an emitted light pulse may include a main pulse with a superimposed modulation). As an example, the transmitter controller may be configured to control a signal modulator configured to modify the waveform of the emitted light signals (e.g., the signal modulator may be or may be configured as the signal modulator described in relation to FIG. 145A to FIG. 149E). The transmitter controller and the signal modulator may also be combined in a single device (e.g., in a single module). Illustratively, the LIDAR system may include a device including the signal modulator and the transmitter controller. Further illustratively, the device may be configured as the signal modulator and the transmitter controller, e.g. the device may be configured to operate as the signal modulator and the transmitter controller.

By way of example, the transmitter controller may be configured to frequency modulate each emitter pixel such that each emitter pixel emits a light signal modulated with a respective modulation frequency. As an example, the transmitter controller may be configured to implement an enhanced modulation scheme (e.g., the transmitter controller may be configured to frequency modulate at least some light signals in accordance with Orthogonal Frequency Division Multiplex). As another example, the transmitter controller may be configured to implement a simple modulation scheme (e.g., the transmitter controller may be configured to frequency modulate at least some light signals with a constant tone modulation superimposed on a main signal).

The transmitter controller may be configured to select the modulation characteristics from a set of predefined modulation characteristics. As an example, the modulation characteristics may be selected according to a distribution function (e.g., using a linear distribution function or a nonlinear distribution function, such as a logarithmic distribution function). As another example, the modulation characteristics may be retrieved from a memory (e.g., from a table stored in a memory), for example in a predetermined order or in random order (e.g., no specific order may be defined a priori).

By way of example, the transmitter controller may be configured to select the different modulation frequencies from a set of predefined modulation frequencies. The set of predefined modulation frequencies may include a discrete number Ω of modulation frequencies (e.g., a first frequency $f_1$, a second frequency $f_2$, . . . , an Ω-th frequency $f_\Omega$). The set of predefined modulation frequencies may cover a modulation bandwidth in the range from about 1 MHz to about 10 GHz, for example from about 10 MHz to about 1 GHz, for example from about 100 MHz to about 500 MHz. The modulation bandwidth may be adapted or selected in accordance with the duration of an emitted light signal (e.g., of an emitted light pulse). As an example, in case of a light signal having short duration (e.g., about 10 ns), the modulation bandwidth may be in the range from about 100 MHz (e.g., a period of about 10 ns) to about 10 GHz (e.g., a period of about 0.1 ns). As another example, in case of a light signal having medium duration (e.g., about 100 ns), the modulation bandwidth may be in the range from about 10 MHz (e.g., a period of about 100 ns) to about 1 GHz (e.g., a period of about 1 ns). As a further example, in case of a light signal having long duration (e.g., about 1 ps, in other words about 1000 ns), the modulation bandwidth may be in the range from about 1 MHz (e.g., a period of about 1 µs, e.g. similar to a maximum time-of-flight of the LIDAR system) to about 100 MHz (e.g., a period of about 10 ns). Illustratively, the emitter pixels (e.g., the array of emitter pixels) may cover the modulation bandwidth (e.g., the emitted light signals may be modulated with modulation frequencies covering the modulation bandwidth). The modulation bandwidth may be selected or adjusted depending on the operation of the LIDAR system.

Only as a numerical example, the transmitter may include an array with 8 lines and 25 emitter pixels per line (200 emitter pixels in total). Each emitter pixel may be modulated with a unique frequency. The total number of emitter pixels may be equal the total number of modulation frequencies (N=Ω). In case a minimum modulation frequency of 101 MHz and a maximum modulation frequency of 300 MHz are selected, the modulation frequencies for the emitter pixels may be $f_{pixel1}$=101.0 MHz, $f_{pixel2}$=102.0 MHz, . . . , $f_{pixel200}=f_{pixelN}$=300.0 MHz.

The transmitter controller may be configured to control (e.g., to modulate) the emitter pixels to emit the plurality of light signals according to a light emission scheme.

In various embodiments, the transmitter controller may be configured to control the emitter pixels such that all the emitter pixels emit the respective light signal simultaneously (e.g., at a same time point). Illustratively, the transmitter controller may be configured to control the emitter pixels such that all the emitter pixels fire as full measurement signal (e.g., all the emitter pixels pulse at once). Further illustratively, the transmitter controller may be configured to control the emitter pixels to emit a LIDAR measurement signal by emitting the respective light signals simultaneously.

A LIDAR measurement signal may be described as a LIDAR signal (e.g., a LIDAR pulse) provided for an individual measurement (e.g., an individual LIDAR measurement, such as an individual time-of-flight measurement). Illustratively, a LIDAR measurement signal may include one or more light signals (e.g., one or more light pulses) emitted by one or more emitter pixels (e.g., at a same time point or at different time points, as described in further detail below). Further illustratively, a LIDAR measurement signal may include one or more modulated light signals (e.g., one or more modulated light pulses).

The transmitter controller may be configured to modulate each emitter pixel with a respective (e.g., unique) modulation characteristic. The modulation characteristic may be the same for each emitter pixel. Illustratively, a LIDAR measurement signal may include each emitter pixel (e.g., each emitter pixel in each group of emitter pixels) being modulated with the same modulation characteristic. Alternatively, different emitter pixels may be modulated with different modulation characteristics (e.g., in a same LIDAR measurement signal, illustratively, within a same time period or time window), as described in further detail below.

The transmitter controller may be configured to modulate each emitter pixel with a different modulation characteristic for the emission of different (e.g., subsequent) LIDAR measurement signals (e.g., all emitter pixels may be modulated with a same modulation characteristic which varies among different LIDAR measurement signals). Illustratively, the transmitter controller may be configured to modulate each emitter pixel with a different modulation characteristic in different (e.g., subsequent) time periods. By way of example, the transmitter controller may be configured to modulate all emitter pixels using a first modulation characteristic during a first time period, and to modulate all emitter pixels using a second modulation characteristic during a second time period. The second time period may be subsequent to the first time period. The second modulation characteristic may be different from the first modulation characteristic.

The transmitter controller may be configured to repeat the modulation with different modulation characteristics during different time periods for a total time period (in other words, a total time window) that is similar to a maximum time-of-flight of the LIDAR system (e.g., substantially equal to the maximum time-of-flight of the LIDAR system). By way of example, the transmitter controller may be configured to modulate all emitter pixels using a third modulation characteristic during a third time period. The third time period may be subsequent to the second time period. The third modulation characteristic may be different from the second modulation characteristic and from the first modulation characteristic.

The maximum time-of-flight may be determined from a maximum detection range for the LIDAR system. The maximum time-of-flight may be twice the time it takes for the LIDAR measurement signal (e.g., light signals emitted by the emitter pixels) to travel the maximum detection range. Illustratively, the transmitter controller may be configured to control the emitter pixels to emit a plurality of LIDAR measurement signals (e.g., each with a different modulation) within a time window that is similar to a maximum time-of-flight of the LIDAR system. Only as a numerical example, in case of a maximum detection range of 300 m for the LIDAR system, the maximum time-of-flight of the LIDAR system may correspond to about 2 ps.

The transmitter controller may be configured to then start a to new iteration of modulation (illustratively, after a time period similar to the time-of-flight has elapsed). The transmitter controller may be configured to start the new iteration with one of the previously used modulation characteristics. Illustratively, the transmitter controller may be configured to control the emitter pixels to emit a plurality of LIDAR measurement signals (e.g., each is with a different modulation) within a second time window, using the modulation characteristics used in the previous time window. By way of example, the transmitter controller may be configured to start the new iteration starting with the first time period using one of the modulation characteristics, such as the first modulation characteristic.

This modulation scheme may provide the effect of an increased pulse repetition rate (e.g., in the kHz range). Illustratively, multiple pulses may be shot within the time-of-flight window (e.g., multiple LIDAR measurement signals may be emitted within such window). The increased pulse repetition (e.g., the increase rate of emission of LIDAR measurement signals) rate may provide an increased framerate. Crosstalk between LIDAR measurement signals may be reduced or eliminated by the different modulation characteristics for the different LIDAR measurement signals. Illustratively, the pulse repetition rate may be independent from (e.g., not limited by) the maximum time-of-flight of the LIDAR system. A conventional LIDAR system may wait for the return reflection of an emitted pulse (e.g., an emitted LIDAR measurement signal) before emitting the next pulse. The pulse repetition rate of a conventional LIDAR system may be limited by the detection range of the LIDAR system (e.g., a longer range may correspond to a decrease in the pulse repetition rate).

In various embodiments, the transmitter controller may be configured to control the emitter pixels such that the emitter pixels or groups of emitter pixels emit light in a sequence. Illustratively, only a portion of the emitter pixels (e.g., only a group of emitter pixels) illuminating only a portion of the field of view may emit light (e.g., may be pulsed). The portions of the emitter pixels (e.g., the transmitter groups) may be fired in a sequence. The sequence may be modified by an overall control on the fly, for example the sequence may be adapted based on previous images or partial images (e.g., on what has been detected in such images or partial images). This emission scheme may be referred to as hybrid-flash scheme, or as intelligent Flash scheme (e.g., "iFlash").

The emitter pixels in a transmitter group may be modulated with a respective modulation characteristic. The modulation characteristic of an emitter pixel may be different from the modulation characteristic of each other emitter pixel within the same transmitter group. This may reduce or substantially eliminate crosstalk between emitter pixels in a transmitter group (illustratively, crosstalk from nearby emitter pixels). By way of example, the transmitter controller may be configured to modulate each emitter pixel of a first transmitter group, so that light signals emitted by different partial emitter pixels of the first transmitter group are modulated with different modulation characteristics.

The modulation matrix associated with a transmitter group may be at least partially repeated in other transmitter groups (e.g., in some or all the other transmitter groups fired afterwards). By way of example, the transmitter controller may be configured to modulate each emitter pixel of a second transmitter group, so that light signals emitted by different partial emitter pixels of the second transmitter group are modulated with different modulation characteristics. At least one modulation characteristic used for modulating an emitter pixel of the first transmitter group may be the same modulation characteristic used for modulating an emitter pixel of the second transmitter group. Only as an example, the first transmitter group may include four emitter pixels modulated with four different modulation frequencies $f_1$, $f_2$, $f_3$, and $f_4$, and the second transmitter group may include four emitter pixels modulated with the same four modulation frequencies $f_1$, $f_2$, $f_3$, and $f_4$.

The transmitter controller may be configured to repeat the control of emitter pixels of different transmitter groups within a time window that is similar to a maximum time-of-flight of the LIDAR system. Illustratively, the transmitter controller may be configured to sequentially control the emitter pixels of different transmitter groups to emit the respective light signals (e.g., with the respective modulation matrix) until a time similar to the maximum time-of-flight is reached. A LIDAR measurement signal may include the light signals sequentially emitted by all the transmitter groups. The transmitter controller may be configured to start a new iteration of the modulation (illustratively, to emit a new LIDAR measurement signal) after the time window has elapsed (e.g., with a different modulation matrix, only as an example with modulation frequencies $f_5$, $f_6$, $f_7$, and $f_8$).

In various embodiments, the transmitter controller may be configured to control the emitter pixels to emit the respective light signals according to a combination of the emission schemes described above. The transmitter controller may be configured to control the emitter pixels such that a LIDAR measurement signal may be generated by different transmitter groups sequentially emitting the respective light signals (e.g., each transmitter group may be sequentially modulated with a same modulation matrix). The transmitter controller may be configured to control the emitter pixels such that a plurality of LIDAR measurement signals may be emitted within a time window that is similar to the maximum time-of-flight of the LIDAR system (e.g., each LIDAR measurement signal may be associated with a different modulation matrix for the transmitter groups). The transmitter controller may be configured to then start a new iteration of modulation after the time window has elapsed. The transmitter controller may be configured to start the new iteration with one of the previously used modulation matrices.

By way of example, the transmitter controller may be configured to select first modulation characteristics for modulating of emitter pixels of a first transmitter group and for modulating of emitter pixels of a second transmitter group during a first time period from a first set of modulation characteristics (e.g., a first modulation matrix). The transmitter controller may be configured to select second modulation characteristics for modulating of emitter pixels of the first transmitter group and for modulating of emitter pixels of the second transmitter group during a second time period which is subsequent to the first time period from a second set of modulation characteristics (e.g., a second modulation matrix). All modulation characteristics of the second set of modulation characteristics may be different from the modulation characteristics of the first set of modulation characteristics.

The transmitter controller may be configured to select the modulation matrix such that adjacent emitter pixels (e.g., in different transmitter groups) may be modulated with a different modulation characteristic. Illustratively, the transmitter controller may be configured to select the modulation matrix such that a crosstalk (e.g., in the far-field) between adjacent emitter pixels (e.g., emitter pixels within a same transmitter group and emitter pixels in different, e.g. adjacent, transmitter groups) may be reduced. By way of example, the transmitter controller may be configured to select different modulation characteristics for modulating of emitter pixels of the first transmitter group and adjacent emitter pixels of the second transmitter group. This emission scheme may provide an increased pulse repetition rate and a reduction of crosstalk-related effects.

The emission schemes described herein (e.g., the modulation of the light emitters with respective modulation characteristics) may provide the effect of a reduced probability of false positives created by alien light signals (e.g., light signals originating from another LIDAR system, for example of a same vehicle or of another vehicle in the vicinity). The emission schemes described herein may provide the possibility of installing a plurality of LIDAR systems in physically close location (illustratively, with a short distance between the systems). By way of example, the emission schemes described herein may reduce or substantially eliminate interference among different LIDAR systems or subsystems of a same vehicle.

In various embodiments, the LIDAR system may include a sensor (e.g., the LIDAR sensor 52). The sensor may include a plurality of photo diodes. By way of example, the sensor may include at least one avalanche photo diode (e.g., a single-photon avalanche photo diode). As another example, the sensor may include at least one silicon photomultiplier. Illustratively, the sensor may include a plurality sensor pixels (e.g., a number R of sensor pixels, equal to the number of emitter pixels or different from the number of emitter pixels, as described in further detail below). Each sensor pixel may include or may be associated with a respective photo diode. The sensor may be configured to provide a sensor signal (e.g., an electrical signal, such as a current) representing a received light signal (e.g., a main signal and a superimposed modulation). The LIDAR system may include at least one analog-to-digital converter configured to convert the plurality of received analog light signals (e.g., analog light pulses) to a plurality of received digitized light signals (e.g. digitized light pulses). Illustratively, the analog-to-digital converter may be configured to convert the sensor signal into a digitized signal (e.g., a plurality of sensor signals into a plurality of digitized signals).

The plurality of photo diodes (e.g., the plurality of sensor pixels) may form an array (also referred to as detector array). As an example, the photo diodes may be arranged in a one-dimensional array (e.g., the photo diodes may be arranged into one direction to form the one-dimensional array). The photo diodes may be arranged in the one-dimensional array in a row or in a column. As another example, the photo diodes may be arranged in a two-dimensional array (e.g., the photo diodes may be arranged into two directions to form the two-dimensional array). The photo diodes may be arranged in the two-dimensional array in rows and columns. Illustratively, the detector array may include rows and columns, e.g. a number k of rows and a number l of columns (e.g., the detector array may include k×l sensor pixels).

By way of example, the detector array may have the same resolution as the emitter array (e.g., the number of photo diodes may be equal to the number of emitter pixels). Each photo diode (illustratively, each sensor pixel of the detector array) may have its own field of view matching the field of emission of a respective emitter pixel of the emitter array. The field of view of the LIDAR system may be or may correspond to the field of is view of the emitter array (e.g., the superposition of the fields of emission of the emitter pixels) and/or to the field of view of the detector array (e.g., the superposition of the fields of view of the sensor pixels). The field of emission of the emitter array may substantially correspond to the field of view of the detector array.

As another example, the detector array may have a lower resolution than the emitter array (e.g., the number of photo diodes may be smaller than the number of emitter pixels). Each photo diode may have a field of view greater (e.g., wider in the horizontal and/or vertical direction) than the field of view of each emitter pixel. An overall field of view of the detector array may be substantially the same as the field of view of the emitter array (e.g., the sum or the superposition of the fields of view of the individual photo diodes may be substantially equal to the sum of the fields of view of the individual emitter pixels).

As a further example, the detector array may have a higher resolution than the emitter array (e.g., the number of photo diodes may be greater than the number of emitter pixels). Each photo diode may have a field of view smaller (e.g., narrower in the horizontal and/or vertical direction) than the field of view of each emitter pixel. An overall field of view of the detector array may be substantially the same as the field of view of the emitter array.

The LIDAR system described herein may include a lower resolution sensor to recreate a higher resolution scene. This may provide a cost-optimized design while maintaining high system performance (e.g., costs may be reduced on the detector side while using a high resolution transmitter, such as a VCSEL array). By way of example, the transmitter may be provided with a miniaturized design (e.g., chip stacking of a VCSEL array chip bonded to a driver chip, for example in a single optical package, as described in relation to FIG. 155A to FIG. 157B).

The sensor (or the LIDAR system) may include a scanning element (e.g., a moving mirror) configured to raster the field of view. By way of example, the scanning element may be used in combination with a one-dimensional detector array (e.g., a single line or single column of photo diodes). The scanning element may be configured to project the field of view onto the sensor, for example line by line or column by column. In this configuration, a reduced number of photo diodes may be provided.

The plurality of photo diodes may be grouped into a plurality of disjunct photo diode groups (e.g., including a first photo diode group and a second photo diode group). The number of photo diodes in different photo diode groups may be the same. Alternatively, the number of photo diodes in different photo diode groups may be different.

In various embodiments, the LIDAR system may include one or more processors. The one or more processors may be configured to individually control the plurality of photo diodes to receive a plurality of light signals. Illustratively, the photo diodes may be individually addressable. By way of example, the one or more processors may be configured to control the plurality of photo diodes such that the signal of all photo diodes is acquired at the same time (e.g., the signal acquisition of all photo diodes is made all at once). Alternatively, the one or more processors may be configured to control the plurality of photo diodes such that the signal is acquired in a sequence (e.g., the signal of different photo diodes or different photo diode groups may be acquired sequentially). By way of example, the one or more processors may be configured to control the plurality of photo diodes such that a signal generated by the photo diodes of the second photo diode group is acquired at a subsequent time point with respect to a signal generated by the photo diodes of the first photo diode group.

The one or more processors may be configured to process the received plurality of light signals (e.g., to decode or demodulate the received plurality of light signals). By way of example, the one or more processors may be configured as the one or more processors 13324 described in relation to FIG. 131A to FIG. 137. As another example, the one or more processors may be configured as the one or more processors 13802 described in relation to FIG. 138 to FIG. 144. As a further example, the one or more processors may be configured as the one or more processors 14514 described in relation to FIG. 145A to FIG. 149E.

The one or more processors may be configured to identify the received plurality of light signals. Illustratively, the one or more processors may be configured to determine (e.g., to identify or to extract) individual light signals from the received plurality of light signals. By way of example, the one or more processors may be configured to identify the received plurality of light signals by performing at least one identification process, such as full-waveform detection, time-to-digital-converting process, and/or threshold-based signal detection. Full-waveform detection may be described as a complete waveform digitalization and analysis. The analysis may include a curve fitting, for example a Gaussian fit. As another example, the one or more processors may be configured to identify the received plurality of light signals by analyzing a correlation of the received light signals (e.g., each received light signal) with the emitted light signals (e.g., with each emitted light signal). Illustratively, the one or more processors may be configured to evaluate a correlation (e.g., a cross-correlation) between a received light signal and each emitted light signal to identify the emitted light signal associated with the received light signal, as described, for example, in relation to FIG. 131A to FIG. 137.

By way of example, the one or more processors may include or may be configured as one or more correlation receivers configured to perform such correlation operation, as described, for example, in relation to FIG. 131A to FIG. 137. The one or more processors (e.g., the one or more correlation receivers) may be configured to determine (e.g., to calculate) from the correlation result a time lag between a received light signal and the corresponding emitted light signal. The time lag may be or correspond to the time-of-flight of the emitted light signal. The determination may be performed considering the distinct peak(s) present in the correlation result, as described in relation to FIG. 131A to FIG. 137.

As an example, the one or more processors may be configured to distinguish between light signals received at a same photo diode by using a knowledge of a time duration of the light signals. Illustratively, a first light signal and a second light signal may be emitted at the same time. The first light signal and the second light signal may be reflected at different distances (e.g., may travel different distances). The first light signal and the second light signal may be collected by the same photo diode at the sensor (e.g., with a time delay proportional to the difference in the travelled distance). The one or more processors may be configured to distinguish the first light signal from the second light signal by determining an end of the first light signal based on a knowledge of the duration of the first light signal. Illustratively, the end of the first light signal (or of the sensor signal associated with the first light signal) may be determined based on a knowledge of the arrival time at the sensor and the duration of the light signal. Alternatively, the one or more processors may be configured to distinguish the first light signal from the second light signal by determining a beginning of the first light signal (e.g., of the sensor signal associated with the first light signal). Illustratively, the beginning of the first light signal may be determined based on a knowledge of the end time of the light signal and the duration of the light signal.

The one or more processors may be configured to determine at least one modulation characteristic component of each light signal of the received plurality of light signals (e.g., at least one component in a domain different from the time-domain). Illustratively, the one or more processors 15812 may be configured to determine (e.g., identify) one or more modulation characteristic components of each received light signal (e.g., a plurality of modulation characteristic components of each received light signal). By way of example, the one or more processors may be configured to determine at least one modulation frequency component of each received light signal (e.g., a component in the frequency-domain). The one or more processors may be configured to determine the at least one modulation characteristic component of each received light signal using one or more different methods. By way of example, the one or more processors may be configured to determine the at least one frequency component of each received light signal using one or more processes. As an example, the one or more processors may be configured to determine the modulation frequency component by implementing Frequency Modulation (FM) demodulation techniques or Frequency Shift Keying (FSK) demodulation techniques. As another example, the one or more processors may be configured to determine the modulation frequency component by performing bandpass filtering and envelope detection. As a further example, the one or more processors may be configured to determine the modulation frequency component by applying chaotic oscillators to weak signal detection. As another example, the one or more processors may be configured to determine the modulation frequency component by performing linear frequency-modulated signal detection, for example using random-ambiguity transform. As a further example, the one or more processors may be configured to determine the modulation frequency component by performing a spectral transform process (e.g., FFT), for example a spectral transform process for single tone detection and frequency estimation (illustratively, frequency determination). As a further example, the one or more processors may be configured to determine the modulation frequency component by applying Orthogonal Frequency Division Multiplex decoding techniques. As another example, the one or more processors may be configured to determine the modulation frequency component by applying correlation receiver concepts taking into account the correlation (e.g., cross-correlation) between the received light signals and the emitted light signals (e.g., between each received light signal and each emitted light signal), as described above.

A received light signal may include a single modulation characteristic component, for example, in case a photo diode receives a light signal emitted by a single emitter pixel (e.g., the emitter pixel emitting light towards the portion of the field of view covered by the photo diode). Illustratively, the single modulation characteristic component may be present in case the received light signal includes a single emitted light signal (e.g., without overlap with additional light signals).

Alternatively, a received light signal may include a plurality of modulation characteristic components. The plurality of modulation characteristic components may be present, for example, in case a received light signal includes a plurality of (e.g., overlapping) emitted light signals (e.g., emitted by a plurality of emitter pixels, for example in accordance with one of the emission schemes described above). Illustratively, the received light signal provided by a photo diode may include a light signal emitted by the emitter pixel associated with the photo diode providing the received light signal, and one or more additional light signals emitted by other (e.g., neighboring) emitter pixels (e.g., associated with neighboring photo diodes).

The one or more processors may be configured to evaluate the at least one modulation characteristic component of each received light signal based on modulation characteristics used for modulating the plurality of light signals that have been emitted by the plurality of emitter pixels. Illustratively, the one or more processors may be configured to associate each received light signal with an emitted light signal. By way of example, the one or more processors may be configured to evaluate the at least one modulation characteristic component by comparing the determined modulation characteristic component with the modulation characteristics used for modulating to the plurality of emitted light signals. Illustratively, the used modulation characteristics (e.g., the used frequency values) may be known, for example the one or more processors may have access to a memory storing the used modulation characteristics. The association (e.g., the correlation) between emitted and received signals at the pixel level may provide high precision and is accuracy.

The one or more processors may be configured to rank a determined plurality of modulation characteristic components to determine one or more main modulation characteristic components of the received light signal (e.g., of at least one received light signal, e.g. of each received light signal). Illustratively, the one or more processors may be configured to evaluate and rank the contribution from the light signals of nearby (e.g., overlapping) photo diodes, for example based on the relative strengths (e.g., amplitudes) of the associated modulation characteristic components, to determine one or more main modulation characteristic components.

The LIDAR system described herein may be configured or provided for different types of application, such as long range LIDAR, short range LIDAR, and/or interior LIDAR. By way of example, in a short range application, the transmitter may include LED technology (e.g., instead of laser technology). This may reduce the cost of the system.

In various embodiments, a vehicle (e.g., an automatic guided vehicle) may include the LIDAR system described herein (e.g., the vehicle may be equipped or retrofitted with the LIDAR system). The crosstalk resistance may provide an increased level of confidence of the sensor due to higher accuracy and precision. The pulse repetition rate (e.g., the rate of emission of LIDAR measurement signals) may be increased with respect to a traditional time-of-flight approach. The increased pulse repetition rate may provide improved performances, for example in environments in which the vehicle may be traveling at high speed (e.g., a train, or an automobile in a highway). As an example, the increased pulse repetition rate may provide an increased framerate. Illustratively, the LIDAR system may provide the ability to measure the surrounding environment. In an automatic guided vehicle this may enable, for example, on the spot assessment and independent corrections from the predefined route (illustratively, without using extra hardware for guidance). By way of example, the LIDAR system may divide the scene (e.g., the field of view) in a plurality of individual sections (in other words, individual segments). Each section of the field of view may be addressed via a separate emitter array to gain a greater field of view. The received signals may be collected in a single detector array with a lower resolution than the combination of the emitter arrays.

In various embodiments, an indoor detection system (e.g., a sensor for interior use) may include the LIDAR system described herein. The LIDAR system may provide object and/or people detection with substantially no privacy issues. The LIDAR system may provide a detection defined in space (e.g., 3D imaging) with a higher degree of precision and trustfulness than other types of sensors, such as a vision camera sensor (illustratively, the LIDAR system may provide a direct measurement whereas the vision camera sensor may provide an indirect calculation). The indoor detection system may be installed in a public space or in a public mobility vehicle (e.g., the lobby of a building, a bus, a train, an elevator, a plane, and the like). By way of example the indoor detection system may be an advanced proximity sensor configured to define the intention of a person (e.g., entering an elevator or a building or just passing by, moving towards or away from a door, and the like). As another example, the indoor detection system may provide people detection, localization, and counting, for example in a building (e.g., in a room of a building), or in a public transport vehicle (e.g., a bus, or a train). As a further example, the indoor detection system may be installed in a factory, e.g. the indoor detection system may provide precision 3D imaging for accurate inspection and measurement (e.g., for component manufacturing, for automated or robotized assembly lines, for logistics such as placing and organizing a cargo, and the like).

FIG. 158 shows a LIDAR system 15800 in a schematic representation in accordance with various embodiments.

The LIDAR system 15800 may be or may be configured as the LIDAR Sensor System 10. By way of example, the LIDAR system 15800 is may be configured as a Flash LIDAR system (e.g., as a Flash LIDAR Sensor System 10). As another example, the LIDAR system 15800 may be configured as a scanning LIDAR system (e.g., as a Scanning LIDAR Sensor System 10). The scanning LIDAR system may include a scanning component configured to scan the field of view of the scanning LIDAR system (illustratively, configured to sequentially direct the emitted light towards different portions of the field of view). By way of example, the scanning LIDAR system may include a scanning mirror (e.g., a MEMS mirror). It is understood that in FIG. 158 only a portion of the elements of the LIDAR system 15800 are illustrated and that the LIDAR system 15800 may include additional elements (e.g., one or more optical arrangements) as described, for example, in relation to the LIDAR Sensor System 10.

The LIDAR system 15800 may include a light source 42 (e.g., the light source 42 may be an example for a transmitter). The light source 42 may include a plurality of partial light sources 15802 (e.g., a partial light source 15802 may be an example for an emitter pixel). The partial light sources 15802 may form an array (e.g., an emitter array). By way of example, the partial light sources 15802 may be arranged in a one-dimensional array. The partial light sources 15802 may be arranged in the one-dimensional array in a row or in a column (e.g., as a line array or as a column array). As another example, as illustrated in FIG. 158, the partial light sources 15802 may be arranged in a two-dimensional array. Illustratively, the partial light sources 15802 may be disposed along two directions, e.g., a first (e.g., horizontal) direction 15854 and a second (e.g., vertical) direction 15856 (e.g., perpendicular to the first direction). As an example, the partial light sources 15802 may be disposed along a horizontal direction and a vertical direction of the field of view of the LIDAR system 15800 (e.g., both perpendicular to an optical axis of the LIDAR system 15800, for example aligned along a third direction 15852). The partial light sources 15802 may be arranged in the two-dimensional array in rows and columns. The number of rows may be is equal to the number of columns (e.g., the array may be a square array, as illustrated, as an example, in FIG. 158). Alternatively, the number of rows may be different from the number of columns (e.g., the array may be a rectangular array).

The light source 42 (illustratively, each partial light source 15802) may be configured to emit light (e.g., a light signal, such as a continuous wave or one or more light pulses). The light source 42 may be configured to emit light having a predefined wavelength (illustratively, to emit light in a predefined wavelength range). By way of example, the light source 42 may be configured to emit light in the infra-red and/or near infra-red range (for example in the range from about 700 nm to about 5000 nm, for example in the range from about 860 nm to about 2000 nm, for example about 905 nm or about 1550 nm). As an example, the light source 42 may include at least one light emitting diode (e.g., the plurality of partial light sources 15802 may include a light emitting diode, illustratively at least one partial light source 15082 may be a light emitting diode). As another example, the light source 42 may include at least one laser diode (illustratively, the light source 42 may be configured to emit laser light), such as a VCSEL diode. Illustratively, the plurality of partial light sources 15802 may include a laser diode, e.g. at least one partial light source 15802 may be a laser diode, such as a VCSEL pixel. Only as an example, the array of partial light sources 15802 may be a VCSEL array. The plurality of partial light sources 15802 may be of the same type or of different types.

The light source 42 may include a collimation optical component (e.g., a micro-lens array) configured to collimate the emitted light. The collimation optical component may be arranged downstream of the plurality of partial light sources 15802 to collimate the light emitted by the partial light sources 15802 (e.g., each partial light source 15802 may be associated with a respective micro-lens).

The plurality of partial light sources 15802 may be grouped into a plurality of light source groups 15804 (e.g., including a first light source is group 15804-1 and a second light source group 15804-2, and optionally a third light source group 15804-3 and a fourth light source group 15804-4). The plurality of light source groups 15804 may be disjunct (e.g., logically disjunct). Illustratively, the partial light sources 15802 in a light source group 15804 (e.g., in the first light source group 15804-1) may be controlled independently from the partial light sources 15802 in another light source group 15804 (e.g., in the second light source group 15804-2). A light source group 15804 may be an example of transmitter group.

Each light source group 15804 may include one or more partial light sources 15802 (e.g., a plurality of partial light sources 15802). The plurality of light source groups 15804 may each include a same number of partial light sources 15802, e.g. the number of partial light sources 15802 of the first light source group 15804-1 may be equal to the number of partial light sources 15802 of the second light source group 15804-2. Alternatively, different light source groups 15804 may include a different number of partial light sources 15802. Each partial light source 15802 may be assigned to a single light source group 15804 (e.g., each partial light source 15802 may be part of one respective light source group 15804). In the exemplary arrangement shown in FIG. 158, each light source group 15804 may include four partial light sources 15802, arranged in a two-dimensional array.

The LIDAR system 15800 may include at least one light source controller 15806 (illustratively, the light source controller 15806 may be an example of transmitter controller). The light source controller 15806 may be configured to control the light source 42 to emit light, e.g. the light source controller 15806 may be configured to individually control the plurality of partial light sources 15802 to emit a plurality of light pulses (and/or different types of light signals). Illustratively, the light source controller 15806 may be configured to individually control the plurality of partial light sources 15802 such that one or more of the partial light sources 15802 (e.g., all the partial light sources 15802) each emit one or more light pulses, for example within a predefined time window. By way of example, the light source controller 15806 may be configured to individually control the plurality of partial light sources 15802 such that at least a first partial light source 15802 emits one or more light pulses and at least a second partial light source 15802 emits a continuous wave, for example within a same time period.

The light source controller 15806 may be configured to frequency modulate the partial light sources 15802, such that the respective light pulses emitted by the plurality of partial light sources 15802 are modulated with a respective modulation frequency. The light source controller 15806 may be configured to frequency modulate the partial light sources 15802 according to one or more light emission schemes (e.g., modulation schemes), as described in further detail below, for example in relation to FIG. 159 to FIG. 160F. By way of example, the light source controller 15806 may include a signal modulator or may be configured to control a signal modulator. The signal modulator may be configured to modulate (e.g., electrically modulate) the plurality of partial light sources 15802 (e.g., individually).

The LIDAR system 15800 may include a sensor 52. The sensor 52 may include a plurality of photo diodes 15808 (e.g., a plurality of sensor pixels each including or associated with a photo diode 15808). The photo diodes 15808 may be of the same type or of different types (e.g., the plurality of photo diodes 15808 may include one or more avalanche photo diodes, one or more single-photon avalanche photo diodes, and/or one or more silicon photo multipliers). The photo diodes 15808 may form an array (e.g., a detector array). By way of example, the photo diodes 15808 may be arranged in a one-dimensional array (for example, in case the LIDAR system 15800 includes a scanning component configured to sequentially direct light from different portions of the field of view onto the sensor 52). As another example, as illustrated in FIG. 158, the photo diodes 15808 may be arranged in a two-dimensional array (e.g., the photo diodes 15808 may be disposed along a first direction 15854 and a second direction 15856).

The photo diodes 15808 may be arranged in the one-dimensional array in a row or in a column (e.g., the detector array may be a line detector or a column detector).

The photo diodes 15808 may be arranged in the two-dimensional array in rows and columns (e.g., the detector array may include a plurality of rows and a plurality columns, e.g. a same number of rows and columns or a different number of rows and columns).

The detector array may have a same number of rows and columns as the emitter array. Illustratively, the plurality of photo diodes 15808 may include a number of photo diodes 15808 equal to a number of partial light sources 15802 included in the plurality of partial light sources 15802. By way of example, this arrangement may be provided in case each photo diode 15808 has a same field of view as a partial light source 15802 associated therewith (illustratively, the partial light source 15802 emitting light in the portion of the field of view of the LIDAR system 15800 covered by the photo diode 15808). In the exemplary arrangement shown in FIG. 158, the detector array may include a number of photo diodes 15808 equal to the number of partial light sources 15802, arranged in a same manner.

Alternatively, the detector array may have a different number of rows and columns with respect to the emitter array. By way of example, the detector array may have a smaller number of rows and/or columns. Illustratively, the plurality of photo diodes 15808 may include a number of photo diodes 15808 smaller than a number of partial light sources 15802 included in the plurality of partial light sources 15802. This arrangement may be provided, for example, in case each photo diode 15808 has a larger field of view than each partial light source 15802. As another example, the detector array may have a greater number of rows and/or columns. Illustratively, the plurality of photo diodes 15808 may include a number of photo diodes 15808 greater than a number of partial light sources 15802 included in the plurality of partial light sources 15802. This arrangement may be provided, for example, in case each photo diode 15808 has a smaller field of view than each partial light source 15802.

The photo diodes 15808 may be grouped into a plurality of photo diode groups 15810 (e.g., including a first photo diode group 15810-1 and a second photo diode group 15810-2, and optionally a third photo diode group 15810-3 and a fourth photo diode group 15810-4). The plurality of photo diode groups 15804 may be disjunct. Illustratively, the photo diodes 15808 in a photo diode group 15810 (e.g., the first photo diode group 15810-1) may be controlled independently from the photo diodes 15808 in another photo diode group 15810 (e.g., the second photo diode group 15810-2).

Each photo diode group 15810 may include one or more photo diodes 15808. The plurality of photo diode groups 15810 may each include a same number of photo diodes 15808, e.g. the number of photo diodes 15808 of the first photo diode group 15810-1 may be equal to the number of photo diodes 15808 of the second photo diode group 15810-2. Alternatively, different photo diode groups 15810 may include a different number of photo diodes 15808. Each photo diode 15808 may be assigned to a single photo diode group 15810 (e.g., each photo diode 15808 may be part of one respective photo diode group 15810). In the exemplary arrangement shown in FIG. 158, each photo diode group 15810 may include four photo diodes 15808, arranged in a two-dimensional array.

The LIDAR system 15800 may include one or more processors 15812. The one or more processors 15812 may be configured to control the sensor 52 (e.g., to control the photo diodes 15808). The one or more processors 15812 may be configured to individually control each photo diode 15808 to receive a plurality of light pulses. Each photo diode 15808 may be configured to provide a signal (e.g., an analog signal, such as a current) in response to receiving a light pulse, as described, for example, in relation to FIG. 145A to FIG. 149E. Illustratively, the plurality of photo diodes 15808 is may be configured to provide a received light signal, as described, for example, in relation to FIG. 138 to FIG. 144 or a received light signal sequence, as described, for example, in relation to FIG. 131A to FIG. 137.

The one or more processors 15812 may be configured to individually control each photo diode 15808 to provide one or more received light pulses (e.g., one or more signals associated with the received light pulses). Illustratively, the one or more processors 15812 may be configured to individually activate or de-activate each photo diode 15808. The one or more processors 15812 may be configured to control the photo diodes 15808 such that each photo diode 15808 may be individually allowed to provide a signal in response to receiving a light pulse or prevented from providing a signal in response to receiving a light pulse.

By way of example, the one or more processors 15812 may be configured to control the photo diodes 15808 in accordance (e.g., in synchronization) with the control of the partial light sources 15802 by the light source controller 15806. Illustratively, the one or more processors 15812 may be configured to control to receive a plurality of light pulses the one or more photo diodes 15808 (or photo diode groups 15810) imaging the portion of field of view illuminated by the one or more partial light sources 15802 (or light source groups 15804) emitting light.

The one or more processors 15812 may be configured to receive the signals provided by the photo diodes 15808 (e.g., the one or more processors 15812 may be configured to receive the plurality of received light pulses). By way of example, the LIDAR system 15800 may include at least one analog-to-digital converter 15814. The analog-to-digital converter 15814 may be configured to convert the plurality of received analog light pulses into a plurality of received digitized light pulses. The analog-to-digital converter 15814 may be configured to provide the received digitized light pulses to the one or more processors 15812. Illustratively, the analog-to-digital converter 15814 may be coupled to the sensor 52 and to the one or more processors 15812.

The one or more processors 15812 may be configured to process the received light signal pulses, as described in further detail below, for example in relation to FIG. 161A to FIG. 161C.

FIG. 159 shows a light emission scheme in a schematic representation in accordance with various embodiments.

The light source controller 15806 may be configured to individually control each partial light source 15802 to emit a plurality of light pulses with a same modulation frequency. Illustratively, the light source controller 15806 may be configured to individually control each partial light source 15802 such that all the partial light sources 15802 emit simultaneously a respective light pulse each modulated with a same modulation frequency. Further illustratively, the light source controller 15806 may be configured to individually control each partial light source 15802 to emit a LIDAR measurement signal using a modulation matrix in which each partial light source 15802 is modulated with a same modulation frequency.

The light source controller 15806 may be configured to frequency modulate all partial light sources 15802 using different modulation frequencies in different time periods (e.g., a same modulation frequency within a time period and different modulation frequencies in subsequent time periods). Illustratively, a time period may correspond to the duration of a LIDAR measurement signal (e.g., of a modulated light pulse), for example in the range from about 50 ns to about 1 ps, for example about 500 ns. The light source controller 15806 may be configured to repeat the frequency modulation with different modulation frequencies during different time periods for a total time period (in other words, a total time window) that is similar to a maximum time-of-flight of the LIDAR system 15800. Illustratively, the light source controller 15806 may be configured to individually control each partial light source 15802 to emit a plurality of LIDAR measurement signals (e.g., each having a respective modulation frequency) within a time window similar to a maximum time-of-flight of the LIDAR system 15800. The different modulation frequencies may be part of a set of predefined modulation frequencies.

As shown, for example, in FIG. 159, the light source controller 15806 may be configured to frequency modulate all partial light sources 15802 using a first modulation frequency $f_1$ during a first time period. Illustratively, the light source controller 15806 may be configured to use a first modulation matrix M1 to emit a first LIDAR measurement signal, e.g. a first modulated pulse, (e.g., starting at a first time point $t_{M1}$). The first modulation matrix M1 may include a same frequency $f_1$ for each partial light source 15802. The light source controller 15806 may be configured to frequency modulate all partial light sources 15802 using a second modulation frequency $f_2$ during a second time period (e.g., to use a second modulation matrix M2 to emit a second LIDAR measurement signal, e.g. a second modulated pulse, at a second time point $t_{M2}$). The second time period may be different from the first time period. By way of example, the second time period may be subsequent to the first time period (e.g., within the same total time period). The second modulation frequency $f_2$ may be different from the first modulation frequency $f_1$.

The light source controller 15806 may be configured to frequency modulate all partial light sources 15802 using a third modulation frequency during a third time period (e.g., using an n-th modulation frequency $f_n$ during an n-th time period). Illustratively, the light source controller 15806 may be configured to use a third modulation matrix to emit a third LIDAR measurement signal, e.g. a third modulated pulse, (e.g., to use an n-th modulation matrix Mn to emit an n-th LIDAR measurement signal, e.g. an n-th modulated pulse, at an n-th time point $t_{Mn}$). The third time period may be different from the first time period and the second time period. By way of example, the third time period may be subsequent to the second time period (e.g., is within the same total time period). The third modulation frequency may be different from the second modulation frequency $f_2$ and from the first modulation frequency The light source controller 15806 may be configured to then start a new iteration of frequency modulation (illustratively, after the total time period has elapsed). A new iteration may be understood as further frequency modulating all partial light sources 15802 using further modulation frequencies in further time periods (e.g., for a further total time period). The light source controller 15806 may be configured to then start a new iteration of frequency modulation starting with the first time period (e.g., a new first time period). The light source controller 15806 may be configured to start the new iteration with one of the modulation frequencies used in the previous iteration (e.g., the first modulation frequency $f_1$, or the second modulation frequency $f_2$, . . . , or the n-th modulation frequency $f_n$). Illustratively, the light source controller 15806 may use the same set of predefined modulation frequencies. Alternatively, the light source controller 15806 may be configured to start the new iteration with a modulation frequency different from all the modulation frequencies used in the previous iteration. Illustratively, the light source controller 15806 may use a different set of predefined modulation frequencies.

FIG. 160A to FIG. 160D show various aspects of a light emission scheme in a schematic representation in accordance with various embodiments.

FIG. 160E and FIG. 160F show light pulses emitted in accordance with a light emission scheme in a schematic representation in accordance with various embodiments.

The light source controller 15806 may be configured to frequency modulate each partial light source 15802 within a same light source group 15804 with a different modulation frequency. Illustratively, the light source controller 15806 may be configured to frequency modulate each partial light source 15802 of a light source group 15804 such that light pulses emitted by different partial light sources 15802 of such light source group 15804 are frequency modulated with different modulation frequencies. Further illustratively, the light source controller 15806 may be configured to individually control each partial light source 15802 to emit a LIDAR measurement signal using a modulation matrix including different modulation frequencies for each partial light source 15802 in a same light source group 15804.

The light source controller 15806 may be configured to select the different modulation frequencies from a set of predefined modulation frequencies. Illustratively, the light source controller 15806 may be configured to select a different modulation frequency for each partial light source 15802 in a same light source group 15804 from a plurality of predefined modulation frequencies. The set of predefined modulation frequencies may cover a modulation bandwidth in the range from about 1 MHz to about 10 GHz, for example from about 10 MHz to about 1 GHz, for example from about 100 MHz to about 500 MHz. The modulation bandwidth may be adapted or selected in accordance with the duration of an emitted light emitted light pulse (e.g., of a modulated light pulse). As an example, in case of a light pulse having short duration (e.g., about 10 ns), the modulation bandwidth may be in the range from about 100 MHz to about 10 GHz. As another example, in case of a light pulse having medium duration (e.g., about 100 ns), the modulation bandwidth may be in the range from about 10 MHz to about 1 GHz. As a further example, in case of a light pulse having long duration (e.g., about 1 μs), the modulation bandwidth may be in the range from about 1 MHz to about 100 MHz.

The light source controller 15806 may be configured to frequency modulate at least some light pulses in accordance with an enhanced modulation scheme, such as Orthogonal Frequency Division Multiplex. Illustratively, the light source controller 15806 may be configured to frequency modulate at least some of the partial light sources 15802 in accordance with the enhanced modulation scheme. Alternatively, the light source controller 15806 may be configured to frequency modulate at least some light pulses in accordance with a simple modulation scheme.

As illustrated, for example, in FIG. 160A and FIG. 160B, the light source controller 15806 may be configured to frequency modulate each partial light source 15802 of the first light source group 15804-1 such that light pulses emitted by different partial light sources 15802 of the first light source group 15804-1 are frequency modulated with different modulation frequencies. Illustratively, the light source controller 15806 may be configured to select first modulation frequencies for frequency modulating the partial light sources 15802 of the first light source group 15804-1 (e.g., first to fourth modulation frequencies in case the first light source group 15804-1 includes four partial light sources 15802). The light source controller 15806 may be configured to frequency modulate the partial light sources 15802 of the first light source group 15804-1 each with one of the selected first modulation frequencies.

The light source controller 15806 may be configured to frequency modulate each partial light source 15802 of the second light source group 15804-2 such that light pulses emitted by different partial light sources 15802 of the second light source group 15804-2 are frequency modulated with different modulation frequencies. Optionally, the light source controller 15806 may be configured to frequency modulate each partial light source 15802 of the third light source group 15804-3 and/or the fourth light source group 15804-4 such that light pulses emitted by different partial light sources 15802 of such light source groups are frequency modulated with different modulation frequencies.

The light source controller 15806 may be configured to use one or more same modulation frequencies for frequency modulating partial light sources 15802 of different light source groups 15804. As illustrated, for example, in FIG. 160A, at least one modulation frequency used for modulating a partial light source 15802 of the first light source group 15804-1 may be the same modulation frequency used for modulating a partial light source 15802 of the second light source group 15804-2 (and/or of the third light source group 15804-3 and/or the fourth light source group 15804-4).

Illustratively, the light source controller 15806 may be configured to select same modulation frequencies for frequency modulating partial light sources 15802 of different light source groups 15804. By way of example, the light source controller 15804 may be configured to select at least the first modulation frequencies for frequency modulating the partial light sources 15802 of the second light source group 15804-2 (e.g., the same first modulation frequencies in case the first light source group 15804-1 and the second light source group 15804-2 include a same number of partial light sources 15802).

As illustrated, for example, in FIG. 160C and FIG. 160D, the light source controller 15806 may be configured to select different modulation frequencies for frequency modulating of adjacent partial light sources 15802 of different light source groups 15804. The light source controller 15806 may be configured to select different modulation frequencies for frequency modulating of partial light sources 15802 having an overlapping field of view (e.g., in the far-field). Illustratively, the light source controller 15806 may be configured to select the modulation frequencies such that each partial light source 15802 emits a light pulse modulated with a different modulation frequency than any other adjacent (e.g., directly adjacent) partial light source 15802. This may provide separation of (e.g., overlapping) light pulses by means of the different modulation frequencies. This may reduce crosstalk related effects (e.g., related to overlapping of the emitted light pulses in the far-field).

By way of example, the light source controller 15806 may be configured to select different modulation frequencies for frequency modulating of partial light sources 15802 of the first light source group 15804-1 and adjacent partial light sources 15802 of the second light source group 15804-2. Similarly, the light source controller 15806 may be configured to select different modulation frequencies for frequency modulating of partial light sources 15802 of the first light source group 15804-1 and adjacent partial light sources 15802 of the fourth light source group 15804-4.

The light source controller 15806 may be configured to individually control each partial light source 15802 such that partial light sources 15802 of different light source groups 15804 emit light pulses at different time points (e.g., spaced by a predetermined time interval). By way of example, the light source controller 15806 may be configured to control the partial light sources 15802 such that the partial light sources 15802 of different light source groups 15804 emit light pulses in a sequential fashion. Illustratively, the light source controller 15806 may be configured to use at each time point only a portion of a modulation matrix. A LIDAR measurement signal may be provided by the superposition of the light pulses sequentially emitted by the different light source groups 15804. Illustratively, the light source controller 15806 may be configured to individually control each partial light source 15802 to emit a LIDAR measurement signal using a modulation matrix including different modulation frequencies for each partial light source 15802 in a same light source group 15804 and same modulation frequencies for partial light sources 15802 in different light source groups 15804.

As illustrated, for example, in FIG. 160A, the light source controller 15806 may be configured to control the partial light sources 15802 of the first light source group 15804-1 to emit light pulses at a first time point $t_{g1}$ (e.g., at a time point defining the beginning of a LIDAR measurement signal). The light source controller 15806 may be configured to control the partial light sources 15802 of the second light source group 15804-2 to emit light pulses at a second time point $t_{g2}$, subsequent to the first time point $t_{g1}$ (e.g., spaced from the first time point $t_{g1}$ by a time interval $\Delta t$, for example by 500 ns). The light source controller 15806 may be configured to control the partial light sources 15802 of the third light source group 15804-3 to emit light is pulses at a third time point $t_{g3}$, subsequent to the second time point $t_{g2}$. The light source controller 15806 may be configured to control the partial light sources 15802 of the fourth light source group 15804-4 to emit light pulses at a fourth time point $t_{g4}$, subsequent to the third time point $t_{g3}$.

As illustrated, for example, in FIG. 160A, the light source controller 15806 may be configured to control the partial light sources 15802 to emit one LIDAR measurement signal within a time window similar to a maximum time-of-flight of the LIDAR system 15800.

Alternatively, as illustrated for example in FIG. 160B, the light source controller 15806 may be configured to select different sets of modulation frequencies for different time periods (e.g., at different time points) to emit a plurality of LIDAR measurement signals. Illustratively, the light source controller may be configured to repeat the frequency modulation with different modulation frequencies during different time periods for a total time period that is similar to a maximum time-of-flight of the LIDAR system 15800. The light source controller may be configured to then start a new iteration of frequency modulation starting with the modulation frequencies of one of the sets of modulation frequencies (e.g., using in a new first time period the modulation frequencies of one of the sets used in the previous iteration).

As illustrated, for example, in FIG. 160B, the light source controller 15806 may be configured to select first modulation frequencies for frequency modulating of partial light sources 15802 of the first light source group 15804-1 and for frequency modulating of partial light sources 15802 of the second light source group 15804-2 during a first time period from a first to set of modulation frequencies. Optionally, the light source controller 15806 may be configured to select the first modulation frequencies for frequency modulating of partial light sources 15802 of the third light source group 15804-3 and fourth light source group 15804-4 during the first time period. Illustratively, the light source controller 15806 may be configured to use a first is modulation matrix M1 for frequency modulating the partial light sources 15802 during the first time period (e.g., to sequentially use portions of the first modulation matrix M1 during the first time period). The first time period may substantially correspond to the duration of a first LIDAR measurement signal (e.g., starting at a time $t_{M1}$), e.g. of a first modulated pulse.

The light source controller 15806 may be configured to select second modulation frequencies for frequency modulating of partial light sources 15802 of the first light source group 15804-1 and for frequency modulating of partial light sources 15802 of the second light source group 15804-2 during a second time period from a second set of modulation frequencies. The second time period may be subsequent to the first time period. All modulation frequencies of the second set of modulation frequencies may be different from the modulation frequencies of the first set of modulation frequencies. By way of example, the first set may include first to fourth modulation frequencies and the second set may include fifth to eighth modulation frequencies. Optionally, the light source controller 15806 may be configured to select the second modulation frequencies for frequency modulating of partial light sources 15802 of the third light source group 15804-3 and fourth light source group 15804-4 during the second time period. Illustratively, the light source controller 15806 may be configured to use a second modulation matrix M2 for frequency modulating the partial light sources 15802 during the second time period (e.g., to sequentially use portions of the second modulation matrix M2 during the second time period). The second time period may substantially correspond to the duration of a second LIDAR measurement signal (e.g., starting at a time $t_{M2}$), e.g. of a second modulated pulse.

The light source controller 15806 may be configured to select third (e.g., n-th) modulation frequencies for frequency modulating of partial light sources 15802 of the first light source group 15804-1 and for frequency modulating of partial light sources 15802 of the second light source group 15804-2 during a third (e.g., n-th) time period from a third (e.g., n-th) set of modulation frequencies. The third time period may be subsequent to the second time period. All modulation frequencies of the third set of modulation frequencies may be different from the modulation frequencies of the first set of modulation frequencies and from the modulation frequencies of the second set of modulation frequencies. By way of example, the third set may include ninth to eleventh modulation frequencies. Optionally, the light source controller 15806 may be configured to select the third modulation frequencies for frequency modulating of partial light sources 15802 of the third light source group 15804-3 and fourth light source group 15804-4 during the third time period. Illustratively, the light source controller 15806 may be configured to use a third (e.g., n-th) modulation matrix for frequency modulating the partial light sources 15802 during the third time period. The third time period may substantially correspond to the duration of a third LIDAR measurement signal, e.g. of a third modulated pulse.

The light source controller 15806 may be configured to then start a new iteration of frequency modulation starting with the first time period (e.g., a new first time period). The new iteration may start after the total time period has elapsed. The light source controller 15806 may be configured to then start the new iteration with the modulation frequencies of one of the previously used sets modulation frequencies. As an example, the light source controller 15806 may be configured to start the new iteration with the modulation frequencies of the first set of modulation frequencies (e.g., the first modulation matrix M1). Alternatively, the light source controller 15806 may be configured to then start the new iteration with the modulation frequencies of another set of modulation frequencies (e.g., another modulation matrix).

As illustrated, for example, in FIG. 160E, the light pulses emitted by partial light sources 15802 of different light source groups 15804 may arrive at an object 16002 (e.g., a target) in the field of view of the LIDAR system (and be reflected back) at different time points. Illustratively, the light pulses emitted by partial light sources 15802 of the first light source group 15804-1 may arrive at the object 16002 before the light pulses emitted by the partial light sources 15802 of the other light source groups 15804. As illustrated, for example, in FIG. 160F the light pulses emitted by the partial light sources 15802 of the first light source group 15804-1 may partially overlap at the object 16002. The frequency modulation with different frequencies may provide separation of the different light pulses (as described in further detail below, for example in relation to FIG. 161A to FIG. 161C).

It is understood that a same light source controller 15806 may be configured to implement one or more of the light emission schemes described herein (e.g., the light source controller 15806 may be configured to implement the light emission scheme described in relation to FIG. 159 and/or the light emission scheme described in relation to FIG. 160A to FIG. 160F).

FIG. 161A to FIG. 161C describe various aspects related to the operation of the one or more processors 15812 in a schematic representation in accordance with various embodiments.

The one or more processors 15812 may be configured to identify the received plurality of light pulses. Illustratively, the one or more processors 15812 may be configured to distinguish the plurality of received light pulses from one another. By way of example, the one or more processors 15812 may be configured to identify the received plurality of light pulses by performing a full-waveform detection. As another example, the one or more processors 15812 may be configured to identify the received plurality of light pulses by performing a time-to-digital converting process. As a further example, the one or more processors 15812 may be configured to identify the received plurality of light pulses by performing a threshold-based signal detection. As a further example, the one or more processors 15812 may be configured to identify the received plurality of light pulses by analyzing the correlation of the received light pulses with the emitted light pulses (e.g., of each received light pulse with each emitted light pulse).

The one or more processors 15812 may be configured to identify the received plurality of light pulses by determining (e.g., calculating) a start time or an end time associated with each received light pulse (e.g., by using a known duration of each light pulse). Only as an example, as illustrated in FIG. 161A, the one or more processors 15812 may be configured to distinguish a first received light pulse 16102-1 from a second received light pulse 16102-2. The first light pulse 16102-1 and the second light pulse 16102-2 may be received at a same photo diode 15808. The first light pulse 16102-1 and the second light pulse 16102-2 may, for example, have been emitted at the same time (e.g., by the partial light sources 15802 of a same light source group 15804). The first light pulse 16102-1 may have a first modulation frequency $f_1$. The second light pulse 16102-2 may have a second modulation frequency $f_2$. The first light pulse 16102-1 and the second light pulse 16102-2 may impinge onto the photo diode 15808 at different time points, e.g. there may be a delay between the first light pulse 16102-1 and the second light pulse 16102-2, for example related to the pulses being reflected by objects at different distances. The duration of the light pulses may be known (e.g., predetermined). The one or more processors 15812 may be configured to distinguish the light pulses by determining a start time $t_{1\_i}$ for the first received light pulse 16102-1 and calculating a corresponding end time $t_{1\_f}$ using the known pulse duration (or vice versa, e.g. determining the end time $t_{1\_f}$ and calculating the start time $t_{1\_i}$). Additionally or alternatively, the one or more processors 15812 may be configured to distinguish the light pulses by determining a start time $t_{2\_i}$ for the second received light pulse 15816-2 and calculating a corresponding end time $t_{2\_f}$ using the known pulse duration (or vice versa).

The one or more processors 15812 may be configured to determine at least one modulation frequency component (or a plurality of modulation frequency components) of each received light pulse (as illustrated, for example, in FIG. 161C). Illustratively, the one or more processors 15812 may be configured to determine at least one component (e.g., at least one peak) of each received light pulse in the frequency-domain (e.g., via a FFT). By way of example, the one or more processors 15812 may be configured to carry out a frequency determination process, as described above.

As shown, for example, in FIG. 161C, a received light pulse 16104 (e.g., provided by a photo diode 15808) may include a plurality of modulation frequency components. As an example, considering the photo diode 15808 in position (1,4) in the array in FIG. 161B, a received light pulse 16104 may include a first component at a first modulation frequency $f_1$, a second component at a second modulation frequency $f_2$, a third component at a third modulation frequency $f_3$, and a fourth component at a fourth modulation frequency $f_4$. Illustratively, the received light pulse 16104 may include a plurality of light pulses emitted by different partial light sources 15802. By way of example, the received light pulse 16104 may include a first light pulse 16104-1 modulated with the first modulation frequency $f_1$, a second light pulse 16104-2 modulated with the second modulation frequency $f_2$, a third light pulse 16104-3 modulated with the third modulation frequency $f_3$, and a fourth light pulse 16104-4 modulated with the fourth modulation frequency $f_4$.

The one or more processors 15812 may be configured to evaluate the at least one frequency component of each light pulse of the received plurality of light pulses based on modulation frequencies used for frequency modulating the plurality of light pulses that have been emitted by the plurality partial of light sources 15802. Illustratively, the one or more processors 15812 may be configured to evaluate whether a component in the frequency domain of the received light pulse 16104 may be associated with a frequency used to modulate an emitted light pulse.

As an example the one or more processors 15812 may be configured to evaluate the at least one modulation frequency component by comparing the determined modulation frequency component with the modulation frequencies used for modulating the plurality of light pulses that have been emitted by the plurality partial of light sources 15802. Illustratively, the one or more processors 15812 may be configured to compare the modulation frequency component (or each modulation frequency component) of a received light pulse with known values of the modulation frequencies used for modulating the emitted light pulses. As illustrated in FIG. 161C, for example, the one or more processors 15812 may be configured compare the first to fourth frequency components of the received light pulse 16104 with the modulation frequencies used to modulate the partial light sources 15802 (e.g., the modulation frequencies of the used modulation matrices).

The one or more processors 15812 may be configured to associate each determined modulation frequency component of the received light signal 16104 with a corresponding partial light source 15802 (e.g., based on the frequency at which the component is present and on the knowledge of the modulation frequency used for that partial light source 15802). By way of example, considering the photo diode 15808 in position (1,4), the one or more processors 15812 may be configured to associate the light pulse modulated with the second modulation frequency $f_2$ with the partial light source 15802 associated with said photo diode 15808 (e.g., the partial light source 15802 in a same position in the emitter array).

As a further example, the one or more processors 15812 may be configured to rank the determined plurality of modulation frequency components to determine one or more main modulation frequencies of the received light pulse 16104 (e.g., of at least one received light pulse 16104, e.g. of each received light pulse). As illustrated, as an example, in FIG. 161C, the one or more processors 15812 may be configured to identify one or more to main modulation frequencies of the received light 16104 pulse by comparing the modulation frequency components with one another. As an example, the one or more processors 15812 may be configured to rank the plurality modulation frequency components according to the respective amplitude. The one or more processors 15812 may be configured to identify as main modulation is frequency (e.g., associated with a signal provided by a photo diode 15808) the modulation frequency at which the modulation frequency component with the greatest amplitude is located. Considering, as an example, the photo diode 15808 in position (1,4), the one or more processors 15812 may be configured to determine the second modulation frequency $f_2$ as main modulation frequency. Illustratively, the term "main modulation frequency" may be understood as the frequency associated with the largest signal component in the frequency diagram (e.g., the diagram shown in FIG. 161C) other than the signal component associated to the main pulse itself (illustratively, denoted with the symbol P in the diagram). As shown in FIG. 161C, the frequency component associated with the main pulse may be at lower frequencies, and it may be neglected for ranking the frequencies.

In the following, various aspects of this disclosure will be illustrated:

Example 1ae is a LIDAR Sensor System. The LIDAR Sensor System may include a light source including a plurality of partial light sources. The plurality of partial light sources may be grouped into a plurality of disjunct light source groups including a first light source group and a second light source group. The LIDAR Sensor System may include at least one light source controller configured to individually control each partial light source of the plurality of partial light sources to emit a plurality of light signals. The at least one light source controller may be configured to modulate each partial light source of the plurality of partial light sources of the first light source group, so that light signals emitted by different partial light sources of the first light source group are modulated with different modulation characteristics. The at least one light source controller may be configured to modulate each partial light source of the plurality of partial light sources of the second light source group, so that light signals emitted by different partial light sources of the second light source group are modulated with different modulation characteristics. At least one modulation characteristic used for modulating a partial light source of the first light source group may be the same modulation characteristic used for modulating a partial light source of the second light source group.

In Example 2ae, the subject-matter of example 1 ae can optionally include that the at least one source controller is further configured to individually control each partial light source of the plurality of partial light sources to emit a plurality of light pulses. The at least one source controller may be further configured to frequency modulate each partial light source of the plurality of partial light sources of the first light source group, so that light pulses emitted by different partial light sources of the first light source group are frequency modulated with different modulation frequencies. The at least one source controller may be further configured to frequency modulate each partial light source of the plurality of partial light sources of the second light source group, so that light pulses emitted by different partial light sources of the second light source group are frequency modulated with different modulation frequencies. At least one modulation frequency used for frequency modulating a partial light source of the first light source group may be the same modulation frequency used for frequency modulating a partial light source of the second light source group.

In Example 3ae, the subject-matter of example 2ae can optionally include that the at least one light source controller is further configured to select first modulation frequencies for frequency modulating the partial light sources of the first light source group; and select at least the first modulation frequencies for frequency modulating the partial light sources of the second light source group.

In Example 4ae, the subject-matter of any one of examples 2ae or 3ae can optionally include that the number of partial light sources of the first light source group and the number of partial light sources of the second light source group is equal.

In Example 5ae, the subject-matter of any one of examples 2ae to 4ae can optionally include that the at least one light source controller is further configured to select different modulation frequencies for frequency modulating of partial light sources of the first light source group and adjacent partial light sources of the second light source group.

In Example 6ae, the subject-matter of any one of examples 2ae to 5ae can optionally include that the partial light sources of the plurality of partial light sources are arranged in a one-dimensional array or in a two-dimensional array.

In Example 7ae, the subject-matter of example 6ae can optionally include that the partial light sources are arranged in the one-dimensional array in a row or in a column. Alternatively, the partial light sources may be arranged in the two-dimensional array in rows and columns.

In Example 8ae, the subject-matter of any one of examples 2ae to 7ae can optionally include that the at least one light source controller is configured to frequency modulate at least some light pulses of the plurality of light pulses in accordance with Orthogonal Frequency Division Multiplex.

In Example 9ae, the subject-matter of any one of examples 2ae to 8ae can optionally include that the plurality of partial light sources includes a light emitting diode.

In Example 10ae, the subject-matter of any one of examples 2ae to 9ae can optionally include that the plurality of partial light sources includes a laser diode.

In Example 11 ae, the subject-matter of any one of examples 2ae to 10ae can optionally include that the at least one light source controller is configured to select the different modulation frequencies from a set of predefined modulation frequencies.

In Example 12ae, the subject-matter of example 11ae can optionally include that the set of predefined modulation frequencies covers a modulation bandwidth in the range from about 1 MHz to about 10 GHz.

In Example 13ae, the subject-matter of any one of examples 2ae to 12ae can optionally include that the at least one light source controller is further configured to select first modulation frequencies for frequency modulating of partial light sources of the first light source group and for frequency modulating of partial light sources of the second light source group during a first time period from a first set of modulation frequencies; and select second modulation frequencies for frequency modulating of partial light sources of the first light source group and for frequency modulating of partial light sources of the second light source group during a second time period which is subsequent to the first time period from a second set of modulation frequencies, wherein all modulation frequencies of the second set of modulation frequencies are different from the modulation frequencies of the first set of modulation frequencies.

In Example 14ae, the subject-matter of example 13ae can optionally include that the at least one light source controller is further configured to select third modulation frequencies for frequency modulating of partial light sources of the first light source group and for frequency modulating of partial light sources of the second light source group during a third time period which is subsequent to the second time period from a third set of modulation frequencies, wherein all modulation frequencies of the third set of modulation frequencies are different from the modulation frequencies of the first set of modulation frequencies and from the modulation frequencies of the second set of modulation frequencies.

In Example 15ae, the subject-matter of any one of examples 13ae or 14ae can optionally include that the at least one light source controller is further configured to repeat the frequency modulation with different modulation frequencies during different time periods for a total time period that is similar to a maximum time-of-flight of the LIDAR Sensor System and then start a new iteration of frequency modulation starting with the modulation frequencies of one of the sets of modulation frequencies.

Example 16ae is a LIDAR Sensor System. The LIDAR Sensor System may include a light source including a plurality of partial light sources. The LIDAR Sensor System may include at least one light source controller configured to individually control each partial light source of the plurality of partial light sources to emit a plurality of light signals. The at least one light source controller may be configured to modulate all partial light sources of the plurality of partial light sources using a first modulation characteristic during a first time period. The at least one light source controller may be configured to modulate all partial light sources of the plurality of partial light sources using a second modulation characteristic during a second time period which is subsequent to the first time period. The second modulation characteristic may be different from the first modulation characteristic.

In Example 17ae, the subject-matter of example 16ae can optionally include that the at least one light source controller is further configured to individually control each partial light source of the plurality of partial light sources to emit a plurality of light pulses. The at least one light source controller may be further configured to frequency modulate all partial light sources of the plurality of partial light sources using a first modulation frequency during a first time period. The at least one light source controller may be further configured to frequency modulate all partial light sources of the plurality of partial light sources using a second modulation frequency during a second time period which is subsequent to the first time period. The second modulation frequency may be different from the first modulation frequency.

In Example 18ae, the subject-matter of example 17ae can optionally include that the at least one light source controller is further configured to frequency modulate all partial light sources of the plurality of partial light sources using a third modulation frequency during a third time period which is subsequent to the second time period, wherein the third modulation frequency is different from the second modulation frequency and from the first modulation frequency.

In Example 19ae, the subject-matter of any one of examples 17ae or 18ae can optionally include that the at least one light source controller is further configured to repeat the frequency modulation with different modulation frequencies during different time periods for a total time period that is similar to a maximum time-of-flight of the LIDAR Sensor System and then start a new iteration of frequency modulation.

In Example 20ae, the subject-matter of any one of examples 17ae to 19ae can optionally include that the partial light sources of the plurality of partial light sources are arranged in a one-dimensional array or in a two-dimensional array.

Example 21ae is a LIDAR Sensor System. The LIDAR Sensor System may include a sensor including a plurality of photo diodes, wherein the plurality of photo diodes are grouped into a plurality of disjunct photo diode groups including a first photo diode group and a second photo diode group. The LIDAR Sensor System may include one or more processors configured to individually control each photo diode of the plurality of photo diodes to receive a plurality of light signals. The one or more processors may be configured to identify the received plurality of light signals. The one or more processors may be configured to determine at least one modulation characteristic component of each light signal of the received plurality of light signals. The one or more processors may be configured to evaluate the at least one modulation characteristic component of each light signal of the received plurality of light signals based on modulation characteristics used for modulating the plurality of light signals that have been emitted by a plurality of partial light sources of the LIDAR Sensor System.

In Example 22ae, the subject-matter of example 21ae can optionally include that the one or more processors are further configured to individually control each photo diode of the plurality of photo diodes to receive a plurality of light pulses. The one or more processors may be further configured to identify the received plurality of light pulses. The one or more processors may be further configured to determine at least one frequency component of each light pulse of the received plurality of light pulses. The one or more processors may be further configured to evaluate the at least one frequency component of each light pulse of the received plurality of light pulses based on modulation frequencies used for frequency modulating the plurality of light pulses that have been emitted by a plurality partial of light sources of the LIDAR Sensor System.

In Example 23ae, the subject-matter of example 22ae can optionally include that the photo diodes of the plurality of photo diodes are arranged in a one-dimensional array or in a two-dimensional array.

In Example 24ae, the subject-matter of example 23ae can optionally include that the photo diodes are arranged in the one-dimensional array in a row or in a column. Alternatively, the photo diodes may be arranged in the two-dimensional array in rows and columns.

In Example 25ae, the subject-matter of any one of examples 22ae to 24ae can optionally include at least one analog-to-digital converter configured to convert the plurality of received analog light pulses to a plurality of received digitized light pulses.

In Example 26ae, the subject-matter of any one of examples 22ae to 25ae can optionally include that the one or more processors are further configured to identify the received plurality of light pulses by performing at least one of the following processes: full-waveform detection; time-to-digital-converting process; threshold-based signal detection; and/or analyzing the correlation between the plurality of received light pulses and the plurality of emitted light pulses.

In Example 27ae, the subject-matter of any one of examples 22ae to 26ae can optionally include that the one or more processors are further configured to determine at least one frequency component of each light pulse of the received plurality of light pulses by performing at least one of the following processes: Frequency Modulation (FM) demodulation techniques or Frequency Shift Keying (FSK) demodulation techniques; bandpass filtering and envelope detection; applying chaotic oscillators to weak signal detection; linear frequency-modulated signal detection using random-ambiguity transform; and/or spectral transform process for single tone detection and frequency estimation; applying Orthogonal Frequency Division Multiplex decoding techniques; and/or applying correlation receiver concepts taking into account the correlation between the plurality of received light pulses and the plurality of emitted light pulses.

In Example 28ae, the subject-matter of any one of examples 22ae to 27ae can optionally include that the one or more processors are further configured to evaluate the at least one frequency component by comparing the determined at least one frequency component with the modulation frequencies used for frequency modulating the plurality of light pulses that have been emitted by a plurality of partial light sources of the LIDAR Sensor System.

In Example 29ae, the subject-matter of example 28ae can optionally include that the one or more processors are further configured to determine a plurality of frequency components; and rank the determined plurality of frequency components to determine one or more main modulation frequencies of at least one received light pulse.

In Example 30ae, the subject-matter of any one of examples 1ae to 29ae can optionally include that the LIDAR Sensor System is configured as a Flash LIDAR Sensor System.

In Example 31ae, the subject-matter of any one of examples 1ae to 29ae can optionally include that the LIDAR Sensor System is configured as a Scanning LIDAR Sensor System including a scanning mirror.

Example 32ae is a method of operating a LIDAR Sensor System. The LIDAR Sensor System may include a light source including a plurality of partial light sources, wherein the plurality of partial light sources are grouped into a plurality of disjunct light source groups including a first light source group and a second light source group. The method may include individually controlling each partial light source of the plurality of partial light sources to emit a plurality of light signals; and modulating each partial light source of the plurality of partial light sources of the first light source group, so that light signals emitted by different partial light sources of the first light source group are modulated with different modulation characteristics; modulating each partial light source of the plurality of partial light sources of the second light source group, so that light signals emitted by different partial light sources of the second light source group are modulated with different modulation characteristics. At least one modulation characteristic used for modulating a partial light source of the first light source group may be the same modulation characteristic used for modulating a partial light source of the second light source group.

In Example 33ae, the subject-matter of example 32ae can optionally include individually controlling each partial light source of the plurality of partial light sources to emit a plurality of light pulses; and frequency modulating each partial light source of the plurality of partial light sources of the first light source group, so that light pulses emitted by different partial light sources of the first light source group are modulated with different modulation frequencies; frequency modulating each partial light source of the plurality of partial light sources of the second light source group, so that light pulses emitted by different partial light sources of the second light source group are modulated with different modulation frequencies. At least one modulation frequency used for frequency modulating a frequency light source of the first light source group may be the same modulation characteristic used for modulating a partial light source of the second light source group.

In Example 34ae, the subject-matter of example 33ae can optionally include selecting first modulation frequencies for frequency modulating the partial light sources of the first light source group; and selecting at least the first modulation frequencies for frequency modulating the partial light sources of the second light source group.

In Example 35ae, the subject-matter of any one of examples 33ae or 34ae can optionally include that the number of partial light sources of the first light source group and the number of partial light sources of the second light source group is equal.

In Example 36ae, the subject-matter of any one of examples 33ae to 35ae can optionally include that different modulation frequencies are selected for frequency modulating of partial light sources of the first light source group and adjacent partial light sources of the second light source group.

In Example 37ae, the subject-matter of any one of examples 33ae to 36ae can optionally include that the plurality of partial light sources are arranged in a one-dimensional array or in a two-dimensional array.

In Example 38ae, the subject-matter of example 37ae can optionally include that the partial light sources are arranged in the one-dimensional array in a row or in a column. Alternatively, the partial light sources may be arranged in the two-dimensional array in rows and columns.

In Example 39ae, the subject-matter of any one of examples 33ae to 38ae can optionally include that at least some light pulses of the plurality of light pulses are frequency modulated in accordance with Orthogonal Frequency Division Multiplex.

In Example 40ae, the subject-matter of any one of examples 33ae to 39ae can optionally include that the plurality of partial light sources includes a light emitting diode.

In Example 41ae, the subject-matter of any one of examples 33ae to 40ae can optionally include that the plurality of partial light sources includes a laser diode.

In Example 42ae, the subject-matter of any one of examples 33ae to 41ae can optionally include that the different modulation frequencies are selected from a set of predefined modulation frequencies.

In Example 43ae, the subject-matter of example 42ae can optionally include that the set of predefined modulation frequencies covers a modulation bandwidth in the range from about 1 MHz to about 10 GHz.

In Example 44ae, the subject-matter of any one of examples 33ae to 43ae can optionally include selecting first modulation frequencies for frequency modulating of partial light sources of the first light source group and for frequency modulating of partial light sources of the second light source group during a first time period from a first set of modulation frequencies; and selecting second modulation frequencies for frequency modulating of partial light sources of the first light source group and for frequency modulating of partial light sources of the second light source group during a second time period which is subsequent to the first time period from a second set of modulation frequencies. All modulation frequencies of the second set of modulation frequencies may be different from the modulation frequencies of the first set of modulation frequencies.

In Example 45ae, the subject-matter of example 44ae can optionally include selecting third modulation frequencies for frequency modulating of partial light sources of the first light source group and for frequency modulating of partial light sources of the second light source group during a third time period which is subsequent to the second time period from a third set of modulation frequencies. All modulation frequencies of the third set of modulation frequencies may be different from the modulation frequencies of the first set of modulation frequencies and from the modulation frequencies of the second set of modulation frequencies.

In Example 46ae, the subject-matter of any one of examples 44ae or 45ae can optionally include repeating the frequency modulation with different modulation frequencies during different time periods for a total time period that is similar to a maximum time-of-flight of the method and then start a new iteration of frequency modulation starting with the modulation frequencies of one of the sets of modulation frequencies.

Example 47ae is a method of operating a LIDAR Sensor System. The LIDAR Sensor System may include a light source including a plurality of partial light sources. The method may include individually controlling each partial light source of the plurality of partial light sources to emit a plurality of light signals; and modulating all partial light sources of the plurality of partial light sources using a first modulation characteristic during a first time period; modulating all partial light sources of the plurality of partial light sources using a second modulation characteristic during a second time period which is subsequent to the first time period. The second modulation characteristic may be different from the first modulation characteristic.

In Example 48ae, the subject-matter of example 47ae can optionally include individually controlling each partial light source of the plurality of partial light sources to emit a plurality of light pulses; and frequency modulating all partial light sources of the plurality of partial light sources using a first modulation frequency during a first time period; frequency modulating all partial light sources of the plurality of partial light sources using a second modulation frequency during a second time period which is subsequent to the first time period. The second modulation frequency may be different from the first modulation frequency In Example 49ae, the subject-matter of example 48ae can optionally include that all partial light sources of the plurality of partial light sources are frequency modulated using a third modulation frequency during a third time period which is subsequent to the second time period, wherein the third modulation frequency is different from the second modulation frequency and from the first modulation frequency.

In Example 50ae, the subject-matter of any one of examples 48ae or 49ae can optionally include that the frequency modulation is repeated with different modulation frequencies during different time periods for a total time period that is similar to a maximum time-of-flight of the method and then start a new iteration of frequency modulation.

In Example 51ae, the subject-matter of any one of examples 48ae to 50ae can optionally include that the plurality of partial light sources are arranged in a one-dimensional array or in a two-dimensional array.

Example 52ae is a method of operating a LIDAR Sensor System. The LIDAR Sensor System may include a sensor including a plurality of photo diodes, wherein the plurality of photo diodes are grouped into a plurality of disjunct photo diode groups including a first photo diode group and a second photo diode group. The method may include individually controlling each photo diode of the plurality of photo diodes to receive a plurality of light signals; identifying the received plurality of light signals; determining at least one modulation characteristic component of each light signal of the received plurality of light signals; evaluating the at least one modulation characteristic component of each light signal of the received plurality of light signals based on modulation characteristics used for modulating the plurality of light signals that have been emitted by a plurality of partial light sources of the LIDAR Sensor System.

In Example 53ae, the subject-matter of example 52ae can optionally include individually controlling each photo diode of the plurality of photo diodes to receive a plurality of light pulses; identifying the received plurality of light pulses; determining at least one frequency component of each light pulse of the received plurality of light pulses; evaluating the at least one frequency component of each light pulse of the received plurality of light pulses based on modulation frequencies used for frequency modulating the plurality of light pulses that have been emitted by a plurality of partial light sources of the LIDAR Sensor System.

In Example 54ae, the subject-matter of example 53ae can optionally include that the photo diodes of the plurality of photo diodes are arranged in a one-dimensional array or in a two-dimensional array.

In Example 55ae, the subject-matter of example 54ae can optionally include that the photo diodes are arranged in the one-dimensional array in a row or in a column. Alternatively, the photo diodes may be arranged in the two-dimensional array in rows and columns.

In Example 56ae, the subject-matter of any one of examples 54ae or 55ae can optionally include analog-to-digital converting the plurality of received analog light pulses to a plurality of received digitized light pulses.

In Example 57ae, the subject-matter of any one of examples 54ae to 56ae can optionally include that the received plurality of light pulses are identified by performing at least one of the following processes: full-waveform detection; time-to-digital-converting process; threshold-based signal detection; and/or by analyzing the correlation between the plurality of received light pulses and the plurality of emitted light pulses.

In Example 58ae, the subject-matter of any one of examples 54ae to 57ae can optionally include that the at least one frequency component of each light pulse of the received plurality of light pulses is determined by performing at least one of the following processes: Frequency Modulation (FM) demodulation techniques or Frequency Shift Keying (FSK) demodulation techniques; bandpass filtering and envelope detection; applying chaotic oscillators to weak signal detection; linear frequency-modulated signal detection using random-ambiguity transform; spectral transform process for single tone detection and frequency estimation; applying Orthogonal Frequency Division Multiplex decoding techniques; and/or applying correlation receiver concepts taking into account the correlation between the plurality of received light pulses and the plurality of emitted light pulses.

In Example 59ae, the subject-matter of any one of examples 54ae to 58ae can optionally include that the at least one frequency component is evaluated by comparing the determined at least one frequency component with the modulation frequencies used for frequency modulating the plurality of light pulses that have been emitted by a plurality of light sources of the LIDAR Sensor System.

In Example 60ae, the subject-matter of example 59ae can optionally include determining a plurality of frequency components; and ranking the determined plurality of frequency components to determine one or more main modulation frequencies of at least one received light pulse.

In Example 61ae, the subject-matter of any one of examples 32ae to 60ae can optionally include that the LIDAR Sensor System is configured as a Flash LIDAR Sensor System.

In Example 62ae, the subject-matter of any one of examples 32ae to 60ae can optionally include that the LIDAR Sensor System is configured as a Scanning LIDAR Sensor System including a scanning mirror.

Example 63ae is a computer program product, including a plurality of program instructions that may be embodied in non-transitory computer readable medium, which when executed by a computer program device of a LIDAR Sensor System the subject-matter of any one of examples 1 ae to 31ae can optionally include that cause the LIDAR Sensor System to execute the method the subject-matter of any one of the examples 32ae to 62ae.

Example 64ae is a data storage device with a computer program that may be embodied in non-transitory computer readable medium, adapted to execute at least one of a method for LIDAR Sensor System according to any one of the above method examples, a LIDAR Sensor System according to any one of the above LIDAR Sensor System examples.

In the field of signal and data processing various concepts and algorithms may be employed and implemented for data compression.

From a general point of view, lossless and lossy data compression algorithms may be distinguished.

In case of lossless data compression, the underlying algorithm may try to identify redundant information which may then be extracted from the data stream without data loss. Run-length Encoding (RLE) may be an example of a lossless data compression algorithm. In the Run-length Encoding algorithm, identical and consecutive information symbols may be compressed by using the respective symbol only once, together with the number of identified repetitions. Further examples of lossless data compression algorithms may include variable length coding or entropy coding algorithms, such as Huffman-Code, Arithmetic coding, and the like.

In case of lossy data compression, the underlying algorithm may try to identify non-relevant or less-relevant information which may be extracted from the data stream with only minor effects on the later derived results (e.g., results from data analysis, from object recognition calculations, and the like). Examples of lossy compression algorithms may include rather simple procedures such as quantization, rounding, and discretization. More complex examples of lossy compression algorithms may include computationally intensive transform algorithms, such as Discrete Cosine Transforms (DCT), as an example. In the DCT algorithm, raw data streams may be transformed into another domain, which may provide a more targeted quantization (e.g., MP3 for audio compression, JPEG for image compression, and MPEG for video compression). Additionally or alternatively, an estimation- or prediction-based algorithm may be employed. In such algorithm, data streams may be analyzed to predict next symbols, for example to predict (at least in part) contents of an image based on analyzed neighboring image parts. Such estimation- or prediction-based algorithm may include ranking methods to set up a context-specific probability estimation function.

A lossy data compression algorithm may provide higher data compression rate compared to a lossless data compression algorithm. However, in case of safety-related applications, such as autonomous driving, willfully accepted data loss may be risky. Illustratively, there may be a certain trade-off between the achievable level of data reduction rate and the tolerable level of information accuracy loss.

In LIDAR applications, for example for LIDAR-based three-dimensional imaging, the amount of data with respect to the field of view may undergo an increase by the power of 3 compared to conventional two-dimensional imaging (n=2), depending on the representation. Thus, efficient data compression schemes may be of high value in the LIDAR framework.

Various embodiments may be related to a compression method for a LIDAR system (e.g., for the LIDAR Sensor System10), and to a LIDAR system configured to implement the method. The method described herein may provide compressing a LIDAR signal to enable fast data transfer from the sensor frontend to the backend system for subsequent signal processing and data analysis.

The method described herein may include providing a compressed representation of a received LIDAR signal (e.g., measured or detected by the LIDAR sensor, e.g. the sensor 52), e.g. the method may include describing a received LIDAR signal by means of a concise set of appropriate features. The descriptive features may (e.g., after transmission to the backend) be used for reconstructing the original LIDAR signal (illustratively, the features may allow for precise and accurate reconstruction of the original signal). The representation of the (e.g., received) LIDAR signal by the feature set may be more compact than the entire sequence (e.g., the entire time series) of signal samples. This may provide data compression, e.g. a reduction in the amount of data (illustratively, at the first interface, e.g. at sensor level), as described in further detail below. The method may be illustratively described as a data compression method.

FIG. 176 shows a LIDAR system 17600 in a schematic representation in accordance with various embodiments.

The LIDAR system 17600 may be or may be configured as the LIDAR Sensor System 10. By way of example, the LIDAR system 17600 may be configured as a Flash LIDAR system (e.g., as a Flash LIDAR Sensor System 10). As another example, the LIDAR system 17600 may be configured as a scanning LIDAR system (e.g., as a Scanning LIDAR Sensor System 10). The scanning LIDAR system may include a scanning component configured to scan the field of view of the scanning LIDAR system (illustratively, configured to sequentially direct light towards different portions of the field of view of the scanning LIDAR system). By way of example, the scanning LIDAR system may include a scanning mirror (e.g., a MEMS mirror).

The LIDAR system 17600 may be included (e.g., integrated or embedded) in a sensor device, e.g. in the LIDAR Sensor Device 30, for example in a vehicle or in a headlamp of a vehicle. As an example, the LIDAR system 17600 may be included in a vehicle with automated driving capabilities, e.g. a vehicle capable of driving at SAE-level 3 or higher.

The LIDAR system 17600 may include one or more processors 17602 (e.g., associated with or included in the LIDAR Data Processing System 60). The one or more processors 17602 may be configured to compress a time series of a received LIDAR signal to a compressed LIDAR signal using a feature extraction process using a priori knowledge about structural properties of a typical LIDAR signal.

A LIDAR signal may be described as a signal (e.g., a digital signal or an analog signal, such as a light signal, a current signal, or a voltage signal) including or transporting information that may be processed to provide a LIDAR measurement result (e.g., to provide a time-of-flight and/or an intensity value, or to provide a point cloud). By way of example, a (e.g., received) LIDAR signal may be a light signal detected or measured by a sensor 52 of the LIDAR system 17600. As another example, a (e.g., received) LIDAR signal may be a current signal provided by the sensor 52 in response to a received light signal. As a further example, a (e.g., received) LIDAR signal may be a voltage signal provided by a transimpedance amplifier (TIA) in response to a current signal provided by the sensor 52 (e.g., a transimpedance amplifier included in the sensor 52, e.g., a transimpedance amplifier included in the Second LIDAR Sensing System 50). As a further example, a (e.g., received) LIDAR signal may be a digital signal provided to the one or more processors 17602 of the system 17600, for example provided by an analog-to-digital converter (e.g., an analog-to-digital converter included in the sensor 52, e.g. an analog-to-digital converter included in the Second LIDAR Sensing System 50, for example the analog-to-digital converter 17604) or provided by a LIDAR system-external system or device (e.g., via a communication interface).

A typical LIDAR signal may be described as a LIDAR signal having properties (e.g., structural properties) typically or usually included in a LIDAR signal, as described in further detail below. Illustratively, a typical LIDAR signal may be described as a (e.g., reference) LIDAR signal whose properties or behavior are known (for example, whose properties or behavior have been measured, or whose properties or behavior have been determined by simulation), or a typical LIDAR signal may be described based on a (e.g., reference) LIDAR signal whose properties or behavior are known.

A "time series" of a (e.g., received) LIDAR signal may be a series of values describing the LIDAR signal over time. Illustratively, a LIDAR signal may be divided in a plurality of portions, each having a time duration (e.g., a predefined time duration, for example same for each portion, or a variable time duration). A time series of a LIDAR signal may include such plurality of portions (e.g., a time-ordered sequence of such portions), e.g. a time series of a LIDAR signal may be or may include a series of signal values (e.g., analog or digital), each describing the LIDAR signal at a different time point or in a different time period. Illustratively, a time series may include a sequence of signal samples, as described in further detail below.

An "a priori knowledge" may be described as information (e.g., describing a typical LIDAR signal) already available prior to carrying out the method described herein (e.g., information already available to the one or more processors 17602). Illustratively, an "a priori knowledge" may be described as data or information already determined (e.g., already defined) prior to carrying out the method described herein (e.g., prior to compressing a time series of a received LIDAR signal).

A feature extraction process may be described as a process to extract (e.g., to identify) one or more features, for example from or in a received LIDAR signal (e.g., in a time series of a received LIDAR signal), as described in further detail below.

In various embodiments, the LIDAR system 17600 may optionally include a sensor 52. The sensor 52 may be included in the LIDAR system 17600, for example, in case the received LIDAR signal to be compressed is a signal detected or measured by the LIDAR system 17600 (e.g., by the sensor 52). The sensor 52 may be configured to detect a light signal (e.g., to receive a light signal from the field of view of the LIDAR system 17600 and generate a corresponding signal). As an example, the sensor 52 may include at least one photo diode (e.g., a plurality of photo diodes). The photo diode may be configured to generate a signal (e.g., an electrical signal, such as a current) in response to light impinging onto the sensor 52.

By way of example, the photo diode may be or include a pin-photo diode. As another example, the photo diode may be or include an avalanche photo diode (APD). As a further example, the photo diode may be or include a single-photon avalanche photo diode (SPAD). As a further example, the photo diode may be or include a Silicon Photomultiplier (SiPM). As a further example, the photo diode may be or include a complementary metal oxide semiconductor (CMOS) sensor. As a further example, the photo diode may be or include a charge-coupled device (CCD). As a further example, the photo diode may be or include a stacked multilayer photo diode (e.g., the photo diode may include the optical component 5100, or the optical component 5200, or the optical component 5300 described in relation to FIG. 51 to FIG. 58).

In various embodiments, the LIDAR system 17600 may optionally include an analog-to-digital converter 17604 (e.g., the analog-to-digital converter 17604 may be included in the sensor 52, e.g. the analog-to-digital converter 17604 may be included in the second LIDAR Sensing System 50). The analog-to-digital converter 17604 may be included in the LIDAR system 17600, for example, in case the received LIDAR signal to be compressed is a signal detected or measured by the LIDAR system 17600.

The analog-to-digital converter 17604 may be configured to convert the received LIDAR signal (e.g., an analog current signal provided by the sensor 52, e.g. by the photo diode, or an analog voltage signal provided by a transimpedance amplifier (TIA)) into a digitized received LIDAR signal, e.g. into a time series of digital values representing a digitized received LIDAR signal. Illustratively, the analog-to-digital converter 17604 may be configured to convert an analog representation of the received LIDAR signal (e.g., of a time series of the received LIDAR signal) into a digital representation of the received LIDAR signal (e.g., of the time series of the received LIDAR signal). By way of example, the analog-to-digital converter 17604 may be or may be configured as the analog-to-digital converter 1932, 1934, 1936, 1938, 1940 described in relation to FIG. 11 to FIG. 25B. The analog-to-digital converter 17604 may be configured to provide the digitized signal to the one or more processors 17602.

In various embodiments, the one or more processors 17602 may be configured to compress a time series of a received LIDAR signal by identifying one or more event time series within the received LIDAR signal. Illustratively, the one or more processors 17602 may be configured to compress a time series of a received LIDAR signal by identifying one or more events within the received LIDAR signal. Exemplary implementations of the event identification process will be described in further detail below in relation to FIG. 177A and FIG. 177C.

An event time series may be a portion of the received LIDAR signal, e.g. a portion of the time series of the received LIDAR signal, including one or more events (e.g., including at least one event). An event may be described as a portion of the LIDAR signal (e.g., of the time series) carrying relevant information. By way of example, an event may be a portion of the LIDAR signal that may be associated with an object in the field of view of the LIDAR system 17600 (e.g., with a reflection of light from such object). As another example, an event may be a portion of the LIDAR signal that may be associated with another LIDAR system (e.g., transmitting information via an own light signal). The method may include identifying such portions of the received LIDAR signal.

The identification of relevant portions of the LIDAR signal is may allow for data compression. Illustratively, a trace of a typical LIDAR signal may be of sparse form with a small amount of relevant information and a large amount of less relevant information in the data stream (e.g., there may be less than 3 backscattered echoes from a single spotlet of a real scene; a spotlet may be described as an area in the illuminated far-field corresponding to exactly one pixel in a LIDAR image). As an example, a measurement trace may cover a temporal range of about 2 μs, including three backscattered echo signals each covering a temporal range of about 10 ns.

In various embodiments, the events may be selected from a group of events including or consisting of one or more peaks within the received LIDAR signal, and/or one or more LIDAR echo signals within the received LIDAR signal. Illustratively, the method described herein may include (e.g., in a first stage) taking a sequence (illustratively, a time series) of LIDAR signal samples (for example collected in a vector, as described below) and identify events within the signal (e.g., the measured signal), for example peaks or returning LIDAR echoes within the signal. An echo signal may be described as a signal emitted by the LIDAR system 17600 and returning to the LIDAR system 17600 (e.g., reflected back towards the LIDAR system 17600, for example by an object in the field of view).

In various embodiments, an event time series may be a portion of the LIDAR signal (e.g., of the received LIDAR signal) having a signal value (e.g., a series of signal values) different from a value of a background signal (e.g., a signal value higher than a value of a background signal, e.g. a time series of signal values each higher than a background signal). Illustratively, an event time series may be a portion of the LIDAR signal having a to signal value above a threshold value (e.g., a predefined or adjustable threshold value, as described in further detail below). A signal value above a threshold value may be, for example, a current above a threshold current, a voltage above a threshold voltage, a light intensity above a threshold intensity, or a digital value above a digital threshold value. As an example, a peak is may be a portion of a LIDAR signal having a signal level above a predefined threshold value (e.g., with a rising portion and a falling portion). Generally, the peak value and position of an analog LIDAR signal may be detected by means of various methods (e.g., implemented by one or more processors, e.g. by the one or more processors 17602), e.g. via leading-edge-analysis, constant fraction analysis (CFD), and the like.

The one or more processors 17602 may be configured to identify one or more event time series (e.g., one or more events) within the received LIDAR signal by identifying one or more corresponding portions having a signal value above a threshold value. The threshold value may be dynamically adapted (e.g., by the one or more processors, or by a LIDAR system-external system or device, for example by a sensor fusion box). By way of example, the threshold value may be defined or adjusted via software.

A peak may include one or more peaks. Illustratively, a peak may be or include a peak structure (e.g., a multi-peak structure) including one or more peaks (e.g., a plurality of peaks). The one or more peaks may at least partially overlap with one another (e.g., a peak may at least partially overlap with one or more neighboring or immediately adjacent peaks in the peak structure).

An event time series may include a (possibly predefined) number of signal values (e.g., a plurality of signal samples, e.g. a sequence of signal samples) associated with a respective event (e.g., with a respective peak or peak structure, or with a respective echo signal). The number of signal values may be within a time duration associated with the respective event (illustratively, an event time series may have a time duration corresponding to a time duration of the associated event, for example corresponding to the width of a peak or the width of a multi-peak structure, e.g. to a combined width of the peaks of the peak structure). As an example, an event time series of a digitized received LIDAR signal may include a number of digital values within the associated time duration. The time duration may be a predefined time duration. Illustratively, an event time series may be a time series of a predefined duration. An event time series may have a predefined duration, for example, in case the associated event is known or already characterized (e.g., in case the event is controlled by the LIDAR system 17600, for example in case the event is an echo signal of an emitted light signal having a known or predefined duration).

In various embodiments, the threshold value may be defined in accordance with one or more LIDAR system-internal conditions (e.g., parameters or criteria) and/or one or more LIDAR system-external conditions. As an example, the threshold value may be defined in accordance with a traffic situation or a driving situation (e.g., a current speed of the vehicle, a planned or predicted trajectory of the vehicle, a specific traffic environment, such as inside a city, on a rural road, or on a highway). As another example, the threshold value may be defined in accordance with an ambient light level (e.g., the threshold value may be increased for increasing ambient light level, e.g. the threshold value may vary for day- or night-time driving). As another example, the threshold value may be defined in accordance with an atmospheric condition (e.g., a weather condition, such as rain, fog, or snow). Illustratively, the definition or the adaptation of the threshold value may provide defining the sensitivity of the system for event detection (e.g., for event identification).

The adaptation of the threshold may provide a pre-classification of the events (e.g., of the event time series), e.g. a pre-filtering. The threshold value may be increased, for example, in case a data bandwidth for the transfer of information (e.g., transfer of the compressed LIDAR signal) is to temporarily low. Illustratively, a high rate of events (e.g., of peaks) may require a higher data bandwidth for the transfer to the backend as well as higher computational power in the backend (e.g., for analysis, for example for software-based peak validity analysis).

In various embodiments, the one or more processors 17602 is may be configured to determine a temporal arrival time for at least some of the one or more identified event time series (e.g., for at least one identified event time series, e.g. for each identified event time series). The temporal arrival time may define a starting time for the event time series, e.g. for the portion of the LIDAR signal including the event, e.g. a starting time of the event associated with the event time series. An event time series may be defined around the associated temporal arrival time, as described in further detail below. Illustratively, the one or more processors 17602 may be configured to determine (e.g., to evaluate or to calculate) a time (e.g., an absolute or relative time point) at which an identified event has been determined (e.g., a time at which a peak or peak structure, or an echo signal have been detected). The one or more processors 17602 may be configured to associate the determined temporal arrival time with the respective identified event time series (e.g., with the respective event).

An exemplary realization of the event identification and time association process will be described in relation to FIG. 177A. Another exemplary realization of the event identification and time association process will be described in relation to FIG. 177C.

FIG. 177A shows a processing entity 17700 in a schematic representation in accordance with various embodiments. FIG. 177C shows a further processing entity 17730 in a schematic representation in accordance with various embodiments. The processing entity 17700 and the further processing entity 17730 may each be an exemplary implementation of the one or more processors 17602 of the LIDAR system 17600. Illustratively, the processing entity 17700 and the further processing entity 17730 may be configured to carry out the data compression method described herein. It is understood that the arrangement and the configuration shown in FIG. 177A and FIG. 177C are chosen only as an example, and other implementations of the one or more processors may be provided. It is further understood that the components of the processing entity 17700 and the components of the further processing entity 17730 may also be provided in combination with additional components or with other components not shown in FIG. 177A and FIG. 177C. Illustratively, each components of the processing entity 17700 and the components of the further processing entity 17730 may be isolated or extracted from the respective arrangement, and provided as a stand-alone component or combined with other components.

The event identification may be provided on a received LIDAR signal, e.g. on a serial signal 17704 (e.g., a time series signal S(t)) shown in the graph 17702 in FIG. 177A and FIG. 177C. The graph 17702 may include a first axis 17702*s* associated with a signal value, and a second axis 17702*t* associated with the time. The received LIDAR signal, e.g. the serial signal 17704, may include one or more events, for example a first event 17704-1 and a second event 17704-2 (e.g., a first peak and a second peak, e.g. a first peak structure and a second peak structure).

The temporal arrival-times of the LIDAR signal portions associated with an event (also referred to as event detection times), may be determined during runtime. The event detection times may be determined in different ways.

As an example, as illustrated in FIG. 177A, considering a block of signal samples as input (e.g., as provided by a sliding window mechanism or by serial-to-parallel conversion by using a shift register), peaks (e.g., peak structures) or local maxima may be identified in the signal to determine the event detection time.

The processing entity 17700 may include a serial-to-parallel conversion stage 17706. The serial signal 17704, for example signal samples of the serial signal 17704 arriving from an analog-to-digital converter (e.g., from the analog-to-digital converter 17604), may be buffered and serially-to-parallel converted by a buffer 17708 (e.g., a signal sample buffer, for example a shift register, also referred to as waveform buffer). Illustratively, the sequential signal samples (e.g., the serially arriving signal samples), e.g. the time series, may be collected in the buffer 17708 (e.g., the buffer 17708 may be a sample vector). As an example, the signal samples may be serially arriving from a LIDAR sensor, for example the sensor 52, or from an analog-to-digital converter, e.g., from the analog-to-digital converter 17604.

The buffer 17708 may have a predefined length, e.g. a length N_S (for example a length corresponding to 2 μs). Illustratively, the buffer 17708 may be configured to receive (and store) a maximum number of signal samples equal to the length, e.g. N_S, of the buffer 17708.

After an internal trigger signal 17710, and optionally further pre-processing, the signal samples may be transferred to an event time detection stage 17712 of the processing entity 17700. The signal may optionally be pre-processed or undergo a signal conditioning phase before being transferred to the event time detection stage 17712. By way of example, the signal may be low-, high-, or bandpass-filtered, e.g. smoothed, an averaging operation may be applied over time, e.g. in case the signal is periodic, or the samples may be re-quantized or re-scaled. It may be possible to configure the signal pre-processing and conditioning process (e.g., to configure a signal pre-processing and conditioning stage) from the outside, e.g. it may be configured by a LIDAR-system external device (e.g., by a sensor fusion box). The signal pre-processing and conditioning process may be configured during runtime, for example using intermediate results of subsequent stages or results from a sensor fusion box. The resulting signal may be input to the following (e.g., downstream) stages. The trigger signal 17710 may be generated in case the buffer 17708 is full. Following the trigger signal 17710, the signal samples stored in the buffer 17708 may be transferred (e.g., loaded, e.g. via a load gate 17706*g*) as a signal sample block of length N_S.

The events (e.g. peaks, e.g. peak structures, or echoes in the signal) may be detected (e.g., identified) in the signal sample block (illustratively, event blocks or time series may be identified in the signal sample block). The temporal location (e.g., the time position, e.g. the event detection times) of the events within the sequence, t_1, t_2, . . . , t_K, may also be determined at the event time detection stage 17712. The event detection times, as an example, may be expressed by a time offset t_k with respect to a reference sample. Assuming, only as an example, that K events are detected, the event detection stage may provide event detection times t_1, t_2, . . . . , t_K (e.g., t_1 for the first event 17704-1, t_2 for the second event 17704-2, and t_K for a K-th event).

The event detection may be threshold adjusted. Illustratively, an event may be detected or determined in case a signal sample of the sequence has a value above a threshold value (e.g., in case on or more signal samples have a value above the threshold). The threshold may be adjusted or configured in accordance with one or more parameters and constraints, as mentioned above. Illustratively, the adjustment of the threshold value (e.g., a software-based adjustment) may define a signal level to be surpassed by the signal (e.g., by the signal sample) to be recognized as an event. The event detection stage 17712 may be configured from the outside, e.g. may be configured by a LIDAR system-external device, for example by a sensor fusion box. Additionally or alternatively, constraints may be provided (e.g., from the outside) that for example limit the maximum number of events that may be detected by the system (e.g., in relation to bandwidth limitations).

By way of example, the threshold and/or the configuration parameters may be adjusted and adapted to the demands of the current driving and traffic situation. As another example, the threshold and/or the configuration parameters may be adjusted taking into account environmental conditions, like the current weather conditions. As a further example, the threshold and/or the configuration parameters may be adjusted to accommodate for a component-specific behavior in different environmental conditions.

The detected events (e.g., the associated portions of the signal) and the associated event detection times may be provided to a subsequent stage, e.g. a signal feature extraction stage 17714 of the processing entity 17700, whose operation will be described in further detail below.

Another example for the event identification and time association process is illustrated in FIG. 177C. Considering an analog signal or a signal of serially arriving time discrete samples (illustratively, a time series), e.g. the signal 17704, the event detection times may be determined on a per-sample basis by an event detection trigger stage 17732 (e.g., including a Leading-Edge trigger or a constant fraction discriminator). The exemplary implementation shown in FIG. 177C may use hardware-based event trigger to identify events in the signal 17704, as described in relation to FIG. 11 to FIG. 25B. Illustratively, an analog-to-digital converter (e.g., the analog-to-digital converter 17604) may be switched on and off in accordance with the arrival of an event (e.g., "on" upon arrival of an event, and "off" upon termination of the event).

In this configuration, a buffer 17734 (e.g., a signal sample buffer) may continuously receive signal samples. The buffer 17734 may be read upon the generation of a trigger signal 17736. Illustratively, the buffer 17734 may be configured as a FIFO memory (e.g., according to a first-in-first-out architecture), and the content of the buffer 17734 may be transferred to the subsequent stage (e.g., loaded, e.g. via a load gate 17742) in accordance with the trigger signal 17736. Further illustratively, the reading of the content of the buffer 17734 may be initiated by the trigger signal 17736 (e.g., in real-time, e.g. while the event is being received). An event signal vector, U_k, (e.g., a vector including signal samples associated with an event time series, e.g. associated with an event), may be stored in real-time upon the appearance of the trigger signal for immediate signal compression. An event signal vector may also be referred to as signal event vector, or extracted event signal vector.

The buffer 17734 may be smaller than the buffer 17708 of the processing entity 17700 described in FIG. 177A (e.g., the buffer 17734 may have a length, N_U, smaller than the length, N_S, of the buffer 17708 described in FIG. 177A). The hardware-based trigger may provide reducing or minimizing the memory provided for waveform storage. Illustratively, the length, N_U, of the buffer 17734 may correspond to an expected length of the signal event vector, U_k.

The signal event vector, U_k, and the associated event detection time, t_k, may be provided to a subsequent stage, e.g. a signal feature extraction stage 17738 of the further processing entity 17730, whose operation will be described in further detail below.

In various embodiments, the one or more processors 17602 may be configured to compress an event time series of a received LIDAR signal by comparing the at least one event time series of the received LIDAR signal with one or more reference LIDAR signals. Illustratively, the one or more processors 17602 may be configured to compare at least one event time series (e.g., some event time series, e.g. each event time series) with one or more reference LIDAR signals (e.g., with each reference LIDAR signal) to provide a compressed representation of the event time series.

A reference LIDAR signal may be described as a LIDAR signal having known properties, e.g. predetermined properties. A reference LIDAR signal may be a representation of a LIDAR signal having known properties. A reference LIDAR signal may be represented or stored in different forms, as described in further detail below. By way of example, a reference LIDAR signal may be stored or represented as a time series (e.g., as a normalized time series or as basis-transformed time series). As another example, a reference LIDAR signal may be stored or represented as a signal in the frequency-domain, e.g. as frequency-domain-transformed reference signal. As an example, as illustrated in FIG. 178A to FIG. 178F, a reference LIDAR signal may be stored as a table of vectors (e.g., each reference signal may be stored as a vector, e.g. as a learning vector, L_0, L_1, . . . , L_{M−1}), e.g. a table including signal values associated with a respective time or time point. As another example, as illustrated in FIG. 180A to FIG. 180G, a reference LIDAR signal may be stored as a transformed learning vector (e.g., P_0, P_1, . . . , P_{M−1}), e.g. to be used in combination with a machine learning approach.

In various embodiments, the LIDAR system 17600 may include a memory (not shown). The memory may store feature extraction information. Illustratively, the memory may store a table including feature extraction information. Further illustratively, the memory may store the one or more reference LIDAR signals, e.g. a representation of the one or more reference LIDAR signals (e.g., a table of learning vectors or transformed learning vectors).

The reference LIDAR signals may be predefined (e.g., static). Additionally or alternatively, the reference LIDAR signals may be dynamically configured or updated, e.g. from the inside (e.g., triggered by a training procedure conducted in the background) or from the outside (e.g., triggered by the sensor fusion box). Illustratively, the learning vectors or transformed learning vectors may be static or dynamically configured or updated.

The one or more reference LIDAR signals may be associated with respective LIDAR system-internal or LIDAR system-external conditions, e.g. with a respective scene or situation (e.g., a respective traffic or driving situation, e.g. a respective weather condition). Illustratively, the one or more reference LIDAR signals may be categorized (e.g., grouped or labeled) according to a respective scene or situation. Further illustratively, a reference LIDAR signal may be associated with one or more categories (e.g., one or more groups or labels) describing one or more respective LIDAR system-internal or LIDAR system-external conditions. By way of example a plurality (e.g., a set) of reference tables may be provided. The reference LIDAR signals to be used (e.g., the reference table or a subset of the reference table to be used) may be selected taking into consideration the actual condition of the system (e.g., of the LIDAR system 17600), e.g., taking into account the current driving situation.

The selection of the reference LIDAR signals may provide, as an example, addressing events (e.g., objects) with a specific signature that may be typical for a given driving situation (e.g., driving on a highway, driving in a city, driving in a parking lot). The selection of the reference LIDAR signals may provide, as another example, taking into account environmental conditions with specific signatures, e.g. a current weather condition (rain, fog, snow, and the like). The selection of the reference LIDAR signals may provide, as a further example, accommodating for component-specific properties that may be dependent on environmental conditions (e.g., a detector with different characteristics during day- or at night-time).

In various embodiments, the number of (e.g., stored) reference LIDAR signals may be determined (e.g., selected) according to one or more factors. Illustratively, the number of reference LIDAR signals, e.g. a number M of table entries (e.g., a number M of learning vectors or transformed learning vectors) may be selected to provide accurate representation of an identified event (e.g., a representation with a level of accuracy above a threshold level, illustratively a representation with sufficient fidelity). The number of reference LIDAR signals may also be selected to reduce the impact on memory requirements and computational resources during runtime.

The number of reference LIDAR signals may be, as an example, related to the length, N_U, of an extracted event signal vector, U_k. Only as an example, the number of reference LIDAR signals (e.g., the number M) may be about 0.5*N_U. As an example, the number of reference LIDAR signals may be in the range from about 0.1*N_U to about 0.5*N_U (e.g., 0.1*N_U<=M<=0.5*N_U), or in the range from about 0.1*N_U to about 2*N_U (e.g., 0.1*N_U<=M<=2*N_U, e.g. in an extended configuration), for example in case of a table-based feature extraction using a distance spectrum or in case of a machine learning-based feature extraction. As another example, the number of reference LIDAR signals may be in the range from about 1 to about 0.5*N_U (e.g., 1<=M<=0.5*N_U), or in the range from about 1 to about 2*N_U (e.g., 1<=M<=2*N_U, e.g. in an extended configuration), for example in case of a simple table-based feature extraction (illustratively, in this configuration it may be possible to use a single reference LIDAR signal, for example a Gaussian pulse).

In various embodiments, the one or more processors 17602 may be configured to compress at least one event time series of a received LIDAR signal to a compressed LIDAR signal feature set. Illustratively, the one or more processors 17602 may be configured to provide a compressed representation of at least one event time series (e.g., of some event time series, e.g. of each event time series) by associating it with a compressed LIDAR signal feature set (e.g., one or more features, e.g. descriptive of the event time series).

The one or more processors 17702 may be configured to extract at least one event time series from the time series of the received LIDAR signal. Illustratively, based on the identified events, the corresponding portions in the LIDAR signal may be extracted from the time series of the LIDAR signal. The extracted event time series (e.g. the extracted events, illustratively the extracted event signal vectors) may be represented by a set of features (e.g., by a compressed LIDAR signal feature set).

The a priori knowledge about structural properties of a typical LIDAR signal (e.g., a reference LIDAR signal) may be used to analyze the structure (e.g., the internal structure, e.g. the structural properties) of the identified portions and to describe them by a reduced set of adequate features.

The compressed LIDAR signal feature set and the arrival time associated with an event time series may provide a more compact representation compared to the LIDAR signal (e.g., compared to the event time series). This may provide data compression, e.g. a reduction in the amount of data. Illustratively, the temporal location and the features of the identified signal portion (e.g., of each identified signal portion) within the signal sequence may be represented in a more compact form than the entire sequence. In an exemplary scenario and as described in further detail below, an identified signal portion represented by the respective set of features, and the associated temporal location (e.g., the associated arrival time) may be transmitted from the LIDAR frontend to the backend for subsequent signal processing and data analysis (e.g., the extracted feature values and the corresponding signal time tag may be transmitted from the frontend to the backend). Data compression may be important for reducing the amount of data that needs to be communicated in order to relax system requirements and allow for a faster and more efficient information exchange (e.g., without bottleneck or latency issues). This may be important for partially or fully automated driving vehicles. As an example, communication methods based on high-speed Ethernet connection may be used.

As illustrated in the exemplary arrangement of FIG. 177A, a possible implementation of the assignment of the respective compressed LIDAR signal feature set to an event time series may be performed subsequently to the event time detection, e.g. in a signal feature extraction stage 17714. Illustratively, following the event time detection, signal portions (e.g., event signal vectors) of a defined length around the event detection times (e.g., t_1, t_2, . . . , t_K) may be extracted (e.g., in an event signal vector extraction stage 17714-1).

The sequence of signal samples 17704 (illustratively, stored in the buffer 17708) together with the event detection times (t_1, t_2, . . . , t_K) may be provided as an input for the event signal vector extraction. In the event signal vector extraction stage 11714-1, the event signal portions corresponding to an event at a respective time (t_k, k=1, 2, . . . , K), may be identified. The corresponding samples may be copied into a vector, e.g. an event signal vector (U_k, k=1, 2, . . . , K), e.g. a vector including the signal samples describing the event (e.g., the pulse) at the respective temporal location (e.g., at position t_k). An event signal vector may have a length, N_U, smaller than a length of the buffer 17708, N_S. This is illustrated, as an example, in FIG. 177B, in which the portions of the buffer 17708 around the arrival time (t_1 and t_2) of a respective event (e.g., the first event 17704-1 or the second event 17704_2) may be extracted from the buffer 17708. This may provide a first event signal vector 17708-1 (U_1, associated with the first event 17704-1), and a second event signal vector 17708-2 (U_2, associated with the second event 17704-2). The length of the extracted portion, e.g. the length (e.g., N_U) of an event signal vector may be predefined (e.g., an event signal vector may be associated with a predefined time duration, for example in accordance with a duration of a typical LIDAR event, e.g. in the range from about 10 ns to about 20 ns). Alternatively, the length of the extracted portion may be adjustable, e.g. dynamically adjusted (for example in run-time, for example by means of a software-based adjustment), as described above.

The extracted portions may be represented by a respective feature set (e.g., f_1, f_2, . . . , f_K), e.g. in a feature extraction stage 17714-2 (illustratively, the extracted signal vectors may be provided to the feature extraction stage 17714-2). The features associated to an event (e.g., to an event time series, e.g. to an extracted event signal vector) may be derived using a prior known set of reference signals (e.g., learning vectors, as illustrated in FIG. 178A to FIG. 178F, or transformed learning vectors, as illustrated in FIG. 180A to FIG. 180G, and as discussed in further detail below). Illustratively, depending on the adopted feature extraction strategy, the feature extraction stage 17714-2 may have access to a number of reference signals, for example stored as a table of learning vectors L_0, L_1, . . . , L_{M−1}, or as a table of transformed learning vectors P_0, P_1, . . . , P_{M−1}, where M denotes the number of table entries, e.g. M may represent the table length.

Based on the inputs, the feature extraction stage 17704-2 may determine (e.g., generate) for at least some events (e.g., for each event) a respective feature set (e.g., a feature set f_1 for a first event 17704-1 at time t_1, a second feature set f_2 for a second event 17704-2 at time t_2, . . . , a feature set f_K for a K-th event at time t_K). Illustratively, as an example, the table of reference signals (e.g., learning vectors) L_0, L_1, . . . , L_{M−1} or transformed learning vectors P_0, P_1, . . . , P_{M−1} may be used to represent an event signal vector U_k by a corresponding feature set f_k. The feature extraction may provide representing the signal 17704, e.g. the signal samples, of length N_S with a list of event detection times and feature sets (((t_1, f_1), (t_2, f_2), . . . , (t_k, f_K)), e.g. a list that may represent the signal sequence 17704 in a compressed fashion. Illustratively, an output 17716 of the processing entity 17700 may be a list of event detection times and feature sets associated with one another (e.g., detection times output from the event time detection stage 17712 and feature sets output from the signal feature extraction stage 17714).

The signal feature extraction stage 17738 of the further processing entity 17730 illustrated in FIG. 177C may operate in a similar manner as the signal feature extraction stage 17714 of the processing entity 17700 illustrated in FIG. 177A, with the difference that one event at a time may be processed (e.g., based on a table of learning vectors L_0, L_1, . . . , L_{M−1}, or on a table of transformed learning vectors P_0, P_1, . . . , P_{M−1}). Illustratively, the trigger-based event detection implemented in the further processing entity 17730 may provide an output 17740 including a compressed representation of one event, e.g. of one event time series, e.g. including a detection time t_k and a feature set f_k associated with one another (e.g., a detection time output from the event detection trigger stage 17732 and a feature set output from the signal feature extraction stage 17738). A list may be is provided by combining a plurality of outputs 17740.

The output of the one or more processors 17702 (e.g., the output 17716 of the processing entity 17700, e.g. the output 17740 of the further processing entity 17730) may be provided for further processing (e.g., at the backend), as described in further detail below. The output of the one or more processors 17702 may optionally include a scaling factor (e.g., a normalization factor) associated with an event, e.g. with each event, as described in further detail below. Illustratively, the signal associated with an event may be normalized for comparing the signal with the one or more reference LIDAR signals.

In various embodiments, the LIDAR system 17600 may include a transmitter (not shown). The transmitter may be configured to transmit the output of the compression method. Illustratively, the transmitter may be configured to transmit the determined temporal arrival time together with the compressed LIDAR signal feature set associated with the identified event time series (e.g., with at least some identified event time series, e.g. with each identified event time series) to a further processor for further signal processing and/or data analysis.

In various embodiments, the further processor may be associated with a sensor fusion box (e.g., of the vehicle). Illustratively, the further processor may be associated with or included in a LIDAR system-external device or system, e.g. a processing system of the vehicle including the LIDAR system 17600.

In various embodiments, the further processor may be configured to perform a signal reconstruction process. Illustratively, the further processor may be configured to reconstruct the (e.g., received) LIDAR signal based on the associated compressed LIDAR signal feature set (and the associated temporal arrival time).

By way of example, the signal reconstruction process may be based on a reverse LIDAR signal compression. The signal reconstruction process may depend on the used feature extraction method, as described in further detail below. Exemplary signal reconstruction processes (e.g., associated with a corresponding feature extraction method) will be described below in relation to FIG. 179A to FIG. 179D and FIG. 181A to FIG. 181D. The further processor may have access to the (e.g., used) reference LIDAR signals (e.g., to the table of learning vectors or transformed learning vectors).

By way of example, the signal reconstruction process may be described as follows. The output of the signal compression stage may be a list in the form (t_1, f_1), (t_2, f_2), . . . , (t_K, f_K), e.g. a list of arrival times and corresponding feature sets. The list may be provided to the backend for further signal processing and data analysis. At the backend, it may be possible to reverse the compression process and form a reconstructed version S_rec(t) of the original signal S(t), e.g. of the signal 17704. The reconstruction may illustratively be described as performing the compression scheme in the reverse order. The reconstruction may start with an all-zero sample sequence S_rec(t). Then, the following process may be provided for an extracted event signal vector, U_k (e.g., for some or each extracted event signal vector, e.g. k=1, 2, . . . , K):

a reconstructed version, U_{rec,k}, of the event signal vector U_k may be determined for the given feature set f_k (e.g., a reconstructed signal vector, U_{rec,k}, may be determined);

the entries of the reconstructed vector, U_{rec,k} may be copied or added into the sequence of reconstructed signal samples S_rec(t) in correspondence to the associated temporal event position t_k (illustratively, the operation may be performed in reverse order).

After completion, the sequence of reconstructed signal samples S_rec(t) may include a number (e.g., a total of K) of reconstructed pulse vectors (e.g., one for each reconstructed event, e.g. one for each identified event in the original signal, e.g. in the signal 17704).

The feature set associated with an event time series, e.g. the features included in the feature set, may describe different types of information, for example in accordance with the used feature extraction method, as described in further detail below. Illustratively, different types of reference LIDAR signals may be provided, for example in accordance with the used feature extraction method. An example of feature extraction method, e.g. a table-based feature extraction method, will be described in relation to FIG. 178A to FIG. 179D. Another example of feature extraction method, e.g. based on a machine learning approach, will be described in relation to FIG. 180A to FIG. 181C. By way of example, the compressed LIDAR signal feature set may include an index and a scaling factor associated with each feature of the one or more features. As another example, the compressed LIDAR signal feature set may include a plurality of index-scaling factor pairs. As a further example, the compressed LIDAR signal feature set may include a vector including an ordered sequence of similarity score values. Exemplary configurations or contents for the compressed LIDAR signal feature set will be described in further detail below.

In various embodiments, a compressed LIDAR signal feature set may include one or more features describing the shape of at least a portion of the at least one event time series based on the one or more reference LIDAR signals. Illustratively, the one or more features may describe the shape of the at least one event (e.g., of at least a portion of the at least one event) in relation to the respective shape of the one or more reference LIDAR signals (e.g., in terms of a difference between the shape of the event and the respective shape of one or more of the reference LIDAR signals).

In various embodiments, the compressed LIDAR signal feature set may include one or more features describing the shape of at least a portion of the at least one event time series based on a plurality of reference LIDAR signals taken from different types of scenes. Illustratively, as described above, the reference LIDAR signals used for providing the compressed LIDAR signal feature set associated with an event time series may be selected in accordance with an actual situation of the system (e.g., of the LIDAR system 17600).

Each reference LIDAR signal of the plurality of reference LIDAR signals may be associated with one or more LIDAR system-external parameters (e.g., including a driving situation, a traffic situation, or an environmental situation). Additionally or alternatively, each reference LIDAR signal of the plurality of reference LIDAR signals may be associated with one or more LIDAR system-internal parameters (e.g., associated with one or more components of the system, e.g. of the LIDAR system 17600).

Illustratively, the identified signal portions may be represented by a set of features describing the shape of the signal in terms of a predefined set of typical reference signals. The set of reference LIDAR signals may be taken from different types of scenes covering a wide variety of objects and object-light interactions, including for example diffuse reflection, reflection on tilted surfaces, reflection on edges, and the like. The feature extraction may be described as a classification at the signal level. The results of the feature extraction may be used by the subsequent signal processing stages for profound scene understanding on deep learning level (e.g., object detection and classification), as described above.

An exemplary feature extraction method may be a first table-based method. The method may include a table of reference signals (e.g., known a priori). The reference signals may be used as a basis for representing a received LIDAR signal (e.g., a measured or captured LIDAR signal).

An exemplary table 17802 is illustrated in FIG. 178A. A table, e.g. the table 17802, may include a number M of entries, e.g. a number M of reference signals (only as an example, six reference signals in the table 17802). A reference signal may be described by a respective set of parameters, for example by a vector. In the following, only as an example, the set of elementary pulses may be represented by a set of (e.g., learning) vectors L_0, L_1, L_{M−1}, e.g. six vectors (e.g., a first learning vector 17802-1, a second learning vector 17802-2, a third learning vector 17802-3, a fourth learning vector 17802-4, a fifth learning vector 17802-5, a sixth learning vector 17802-6). A learning vector may include signal values (e.g., vector values or vector entries, e.g. in the range from 0 to 1000 in the exemplary case illustrated in FIG. 178A). Each signal value may be associated with a respective vector index 17802*v* (e.g., 8, 9, . . . , 22 in the exemplary case illustrated in FIG. 178A), illustratively representing or being associated with a time value or a time point.

The reference LIDAR signals stored in the table may be normalized. As an example, the normalization may be carried out using the signal amplitude for normalization, e.g. a reference signal may have a normalized amplitude. As another example, normalization may be carried out using the area or the energy of the signal. A normalization constant, e.g. l_norm, may be provided. The table entries may be normalized with respect to such normalization constant. The normalization constant may also be used to normalize the signal associated with an event (e.g., with an event time series). Only as a numerical example, the normalization constant, l_norm, may be 1000.

The table entries, e.g. the vectors, may have a respective length. As an example, the vectors may have a length, N_U, equal to the length of an extracted event signal vector, U_k, described above. Only as a numerical example, the vectors may have a length of N_U=30 samples.

A visual representation of the learning vectors is provided in FIG. 178B to FIG. 178G. A first graph 17804-1 in FIG. 178B may represent the first learning vector 17802-1 (e.g., the first graph 17804-1 may include a first curve 17806-1 representing the first learning vector 17802-1). A second graph 17804-2 in FIG. 178C may represent the second learning vector 17802-2 (e.g., the second graph 17804-2 may include a second curve 17806-2 representing the second learning vector 17802-2). A third graph 17804-3 in FIG. 178D may represent the third learning vector 17802-3 (e.g., the third graph 17804-3 may include a third curve 17806-3 representing the third learning vector 17802-3). A fourth graph 17804-4 in FIG. 178E may represent the fourth learning vector 17802-4 (e.g., the fourth graph 17804-4 may include a fourth curve 17806-4 representing the fourth learning vector 17802-4). A fifth graph 17804-5 in FIG. 178F may represent the fifth learning vector 17802-5 (e.g., the fifth graph 17804-5 may include a fifth curve 17806-5 representing the fifth learning vector 17802-5). A sixth graph 17804-6 in FIG. 178G may represent the sixth learning vector 17802-6 (e.g., the sixth graph 17804-6 may include a sixth curve 17806-6 representing the sixth learning vector 17802-6). Each graph may include a first axis 17804*s* associated with a vector value (e.g., a signal value, expressed in arbitrary units), and a second axis 17804*t* associated with a vector index, e.g. associated with the time, e.g. with a time value or a time point (expressed in arbitrary units).

Illustratively, each learning vector may describe a different situation or scenario. As an example, the second learning vector 17802-2 may describe a small peak, e.g. after reflection. As another example, the third learning vector 17802-3 may describe two peaks (e.g., two pulses) together, for example corresponding to a reflection from a border region.

An exemplary event signal vector 17902, U_k, is illustrated in FIG. 179A. The event signal vector 17902 may include signal values (e.g., vector values or vector entries, e.g. in the range from 0 to 909 in the exemplary case illustrated in FIG. 179A). Each signal value may be associated with a respective vector index 17902*v* (e.g., 8, 9, . . . , 22 in the exemplary case illustrated in FIG. 179A), illustratively representing or being associated with a time value or a time point. In this exemplary representation, the event signal vector 17902 may have a length, N_U, equal to the length of the learning vectors of the table 17802, e.g. N_U=30 samples. The graph 17904 in FIG. 179A may represent the event signal vector 17902 (e.g., the graph 17904 may include a curve 17904*v* representing the event signal vector 17902). The graph 17904 may include a first axis 17904*s* associated with a vector value (e.g., a signal value, expressed in arbitrary units), and a second axis 17904*t* associated with a vector index, e.g. associated with the time, e.g. with a time value or a time point (expressed in arbitrary units).

A first possibility for a table-based feature extraction may include a search (e.g., a simple search) through the table of reference signals, e.g. through the table 17802.

Starting from an event signal vector (e.g., from the event signal vector 17902), the method may include going through the table and determine (e.g., quantify or assess) a deviation between the event signal vector and the table entries, e.g. one by one (e.g., a deviation between the event signal vector 17902 and each learning vector stored in the table 17802).

The deviation may be determined (e.g., calculated or quantified) in different ways. As an example, the deviation of an event signal vector, U_k, from a reference signal, e.g. a learning vector L_m, may be as follows, $$\mathrm{var}_{k,m}(U_k, L_m) = \sum_{n=0}^{N_U-1}\left[\left(\frac{l_{norm}}{u_{norm,k}}\cdot U_{k,n}\right) - L_{m,n}\right]^2 \quad (20am)$$

the normalization constant l_norm may be the same used to normalize the reference signals within the table, e.g. within the table 17702. A scaling factor u_{norm,k}, may be provided, such that the event signal vector (e.g., the vector 17902) may be normalized with respect to the normalization constant l_norm.

The deviations of the event signal vector U_k to the table entries (L_0, L_1, . . . , L_{M−1}) may be collected in the deviation vector var_k=(var_{k,0}, var_{k,1}, . . . , var_{k, M−1})$^T$, where T may indicate the transpose operation. The deviation vector var_k may have length equal to the number of table entries, e.g. length M.

Considering, as an example, a normalization with respect to the signal amplitude and a normalization constant of l_norm=1000, the scaling factor, u_{norm,k}, may be determined as $$u\_\{norm,k\}=\max(U\_k) \quad (21am)$$

considering the exemplary event signal vector 17902 illustrated in FIG. 179A, the scaling factor, u_{norm,k}, may be 909.

Considering the exemplary learning vectors illustrated in FIG. 178A and the exemplary event signal vector 17902 illustrated in FIG. 179A, the deviation vector var_k may be var_k$^T$=(1798176, 1, 581601, 1180002, 480671, 1233006), where T may indicate the transpose operation.

The first table-based method may include identifying the index of the table entry providing the lowest deviation. The index may be denoted, for example, as μ_k. Considering the exemplary case described above, the table entry with the index m=1 (e.g., considering the first element as having index m=0) may provide the lowest deviation, and the index may be μ_k=1.

The identified index, μ_k, together with the corresponding scaling factor, u_{norm,k}, may represent the features of the event signal vector U_k, e.g. of the event signal vector 17902.

The feature set f_k representing the event signal vector U_k, may be defined as follows, $$f\_k=(w\_k,\mu\_k), \quad (22am)$$

where w_k=u_{norm,k}/l_norm. The feature set f_k may be transmitted to the backend as a compressed representation of the event vector signal U_k (e.g., of a detected event vector signal, e.g. the event vector signal 17902). In the exemplary case described above, the feature set may be f_k=(0.909, 1).

At the backend, the (e.g., original) event signal vector may be reconstructed, e.g. in accordance with the table of reference signals (e.g., the table 17802) and with the feature set, f_k, associated with the event signal vector, U_k.

The reconstructed event signal vector, U_{rec,k}, may be obtained by taking the reference signal with index μ_k and multiplying it by the scaling factor w_k, $$U\_\{rec,k\}=w\_k*L\_m, \text{ where } m=\mu\_k. \quad (23am)$$

A reconstructed signal associated with the event signal vector 17902 is illustrated in the graph 17906 in FIG. 179B. Illustratively, the graph 17906 may include a visual representation of a reconstructed event signal vector associated with the event signal vector 17902. The curve 17906*v* may represent the (e.g., original) signal vector (e.g., the curve 17906*v* may correspond to the curve 17904*v* in the graph 17904 illustrated in FIG. 179A), and the (e.g., dotted) curve 17906*r* may represent the reconstructed signal vector. The graph 17906 may include a first axis 17906*s* associated with a vector value (e.g., a signal value, expressed in arbitrary units), and a second axis 17906*t* associated with a vector index, e.g. associated with the time, e.g. with a time value or a time point (expressed in arbitrary units).

A second possibility for a table-based feature extraction may include a similarity score with respect to the table of reference signals (e.g., with respect to the table 17802). Illustratively, a second possibility may be a table-based feature extraction using a distance spectrum.

As described for the first table-based feature extraction method, the deviation of an event signal vector, U_k, e.g., the event signal vector 17902, to (e.g., all) the table entries L_0, L_1, . . . , L_{M−1} may be calculated. The result may be collected in the deviation vector var_k=(var_{k,0}, var_{k,1}, var_{k,M−1})$^T$, for example having length M. Considering the exemplary learning vectors illustrated in FIG. 178A and the exemplary event signal vector 17902 illustrated in FIG. 179A, the deviation vector var_k may be var_k$^T$=(1798176, 1, 581601, 1180002, 480671, 1233006).

In addition with respect to the first table-based method described above, a so-called distance spectrum f_{k,m} of the event signal vector U_k may be calculated, as follows, $$f_{k,m} = \left(\frac{u_{norm,k}}{l_{norm}}\right) \cdot \left( \frac{\frac{1}{\mathrm{var}_{k,m}}}{\sum_{n=0}^{M-1} \left(\frac{1}{\mathrm{var}_{k,n}}\right)} \right) \tag{24am}$$

The distance spectrum of an event signal vector U_k to all table entries L_0, L_1, L_{M−1} may be collected in the distance spectrum vector f_k=(f_{k,0}, f_{k,1}, f_{k,M−1})T, for example having length M. Considering the exemplary learning vectors illustrated in FIG. 178A and the exemplary event signal vector 17902 illustrated in FIG. 179A, the distance spectrum vector f_k may be $f\_k^T$= (0.000001, 0.909084, 0.000002, 0.000001, 0.000002, 0.000001). In this exemplary case, the distance spectrum for the second learning vector 17802-2 (e.g., the second entry) provides the highest value. The distance spectrum vector f_k for this exemplary case is illustrated in the graph 17908 in FIG. 179C, e.g. the graph 17908 may show the values of the elements of the distance spectrum vector f_k. The graph 17908 may include a plurality of data points 17908*f* describing the elements of the distance spectrum vector f_k (e.g., the respective values). The graph 17908 may include a first axis 17908*e* associated with the element value (expressed in arbitrary units), and a second axis 17908*m* associated with an element index (e.g., a vector index in the distance spectrum vector f_k). Illustratively, the distance spectrum values may each describe a similarity score of the actual LIDAR signal (e.g., of the extracted event signal vector) in relation to the typical LIDAR signatures stored in the table.

The calculated distance spectrum vector f_k may describe the shape of the pulse U_k. The calculated distance spectrum vector f_k may be used directly as feature set, e.g. transmitted to the backend as a compressed representation of the event signal vector U_k (e.g., of the event signal vector 17902).

At the backend, the (e.g., original) event signal vector may be reconstructed, e.g. in accordance with the table of reference signals and with the feature set, f_k, associated with the event signal vector, U_k. The reconstructed event signal vector, U_{rec,k}, may be obtained, as follows $$U_{k,rec} = \Sigma_{m=0}^{M-1} f_{k,m} \cdot L_m \tag{25am}$$

A reconstructed signal associated with the event signal vector 17902 is illustrated in the graph 17910 in FIG. 179D. Illustratively, the graph 17910 may include a visual representation of a reconstructed event signal vector associated with the event signal vector 17902 according to the second table-based feature extraction. The curve 17910*v* may represent the (e.g., original) signal vector (e.g., the curve 17910*v* may correspond to the curve 17904*v* in the graph 17904 illustrated in FIG. 179A), and the (e.g., dotted) curve 17910*r* may represent the reconstructed signal vector. The graph 17910 may include a first axis 17910*s* associated with a vector value (e.g., a signal value, expressed in arbitrary units), and a second axis 17910*t* associated with a vector index, e.g. associated with the time, e.g. with a time value or a time point (expressed in arbitrary units).

Another possible feature extraction method may be based on a machine learning approach.

In various embodiments, the one or more processors 17602 may be configured to implement one or more machine learning processes to generate the compressed LIDAR signal. Illustratively, the one or more processors 17602 may be configured to implement one or more machine learning processes to generate the compressed LIDAR signal feature set.

The one or more machine learning processes may be selected from a group including or consisting of: one or more neural network based processes; and one or more probabilistic machine learning processes.

As an example the one or more neural network based processes may be based on a general artificial intelligence network configuration. As another example, the one or more neural network based processes may be based on a deep learning network configuration. As a further example, the one or more neural network based processes may be based on a convolutional neural network configuration. As a further example, the one or more neural network based processes may be based on a random-forest configuration. As a further example, the one or more neural network based processes may be based on a principal component analysis configuration.

The machine learning approaches described above may provide a type of compact feature vector that may provide the reconstruction of the original signal. Other machine learning approaches may be provided, for example based on a histogram of oriented gradients or support-vector machine, which may provide compact feature vectors that provide a stereotypical signal-understanding (e.g., a classification).

In case of a neural network based approach, the training of the neural network may be carried out offline, e.g. not during runtime but in advance, for example on a LIDAR system-external system or device (e.g., a separate computer station). The trained algorithm may be used for real time feature extraction (e.g., inference) and signal compression (e.g., the execution of the algorithm may be associated with a lower computational effort).

The extraction of the relevant features of the actual LIDAR signal may be based on extracting the relevant similarity values with respect to the (e.g., predefined) set of reference LIDAR signals. The appropriate algorithm parameters may be defined in advance in the offline learning phase. The subsequent real-time application of the well-configured algorithm may provide fast and effective extraction of the relevant feature values for representing the measured signal in a compressed manner. The extracted similarity features from the received LIDAR signal may be used to represent the signal in a compressed form of limited values.

In a machine learning approach, transformed learning vectors may be provided. Illustratively, the learning vectors described above in relation to the table-based approach (e.g., the first to sixth learning vectors shown in FIG. 178A) may be used as training data for configuring a machine learning-based feature extraction method. The set of training data may be collected in a deviation matrix, D (also referred to as covariance matrix). The deviation matrix may include the structural information about the learning vectors and may provide a base matrix for determining an alternative set of characteristic time series of higher mathematical distinctiveness for improved similarity analysis.

An exemplary deviation matrix 18002 is illustrated in FIG. 180A, considering as learning vectors the first to sixth learning vectors shown in FIG. 178A. Illustratively, each column of the deviation matrix 18002 may be associated with or correspond to a learning vector (e.g., one of the first to sixth learning vectors illustrated in FIG. 178A). The deviation matrix may include signal values associated with a respective learning vector (e.g., indexed by a column index 18002*c*, e.g. from 0 to 5 in the exemplary case in FIG. 180A). The signal values may be associated with a respective row index 18002*r* (e.g., from 7 to 24 in the exemplary case in FIG. 180A), illustratively representing or being associated with a time value or a time point (e.g., associated with a vector index of the corresponding learning vector).

A new set of transformed learning vectors (P_0, P_1, . . . , P_{M−1}) may be provided. The set of transformed learning vectors may be calculated by means of a linear eigenvector analysis of the deviation matrix D. Such analysis may provide an orthogonal vector system of most appropriate orientation with respect to the structural pattern of the given learning vectors L_0, L_1, . . . , L_{M−1}. The calculation of the orthogonal signal components may be performed offline on a separate computer station, thus not influencing the real time inference process.

Exemplary transformed learning vectors are illustrated in FIG. 1806. A number M of transformed learning vectors may be provided, e.g. equal to the number M of initial learning vectors, e.g. the number M of reference signals (only as an example, six transformed learning vectors, e.g., a first transformed learning vector 18004-1, a second transformed learning vector 18004-2, a third transformed learning vector 18004-3, a fourth transformed learning vector 18004-4, a fifth transformed learning vector 18004-5, a sixth transformed learning vector 18004-6). A transformed learning vector may include signal values (e.g., vector values or vector entries). Each signal value may be associated with a respective vector index 18004*v* (e.g., from 8 to 29 in the exemplary case in FIG. 180B), illustratively representing or being associated with a time value or a time point.

Figure 180G:
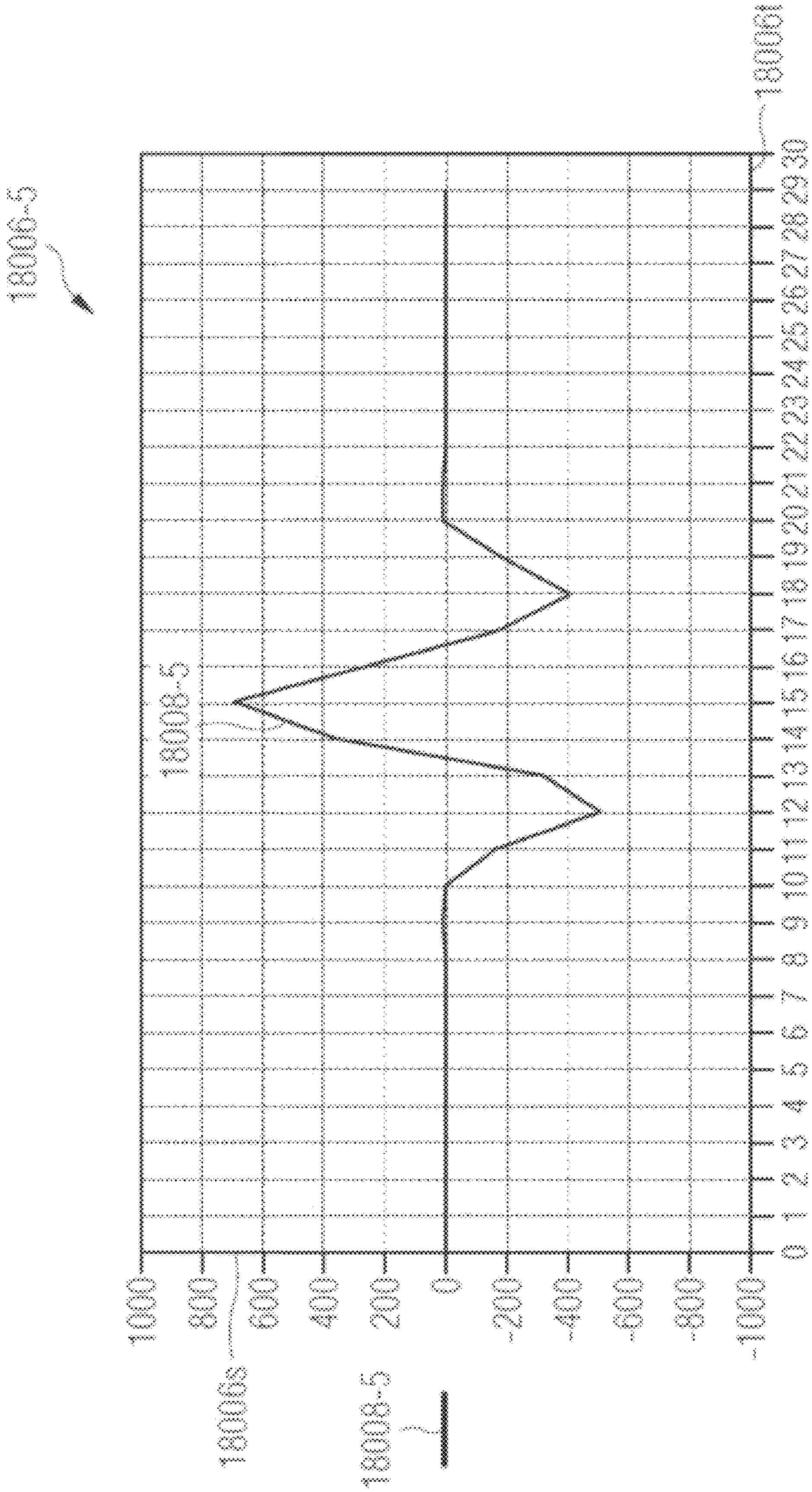
Figure 180H:
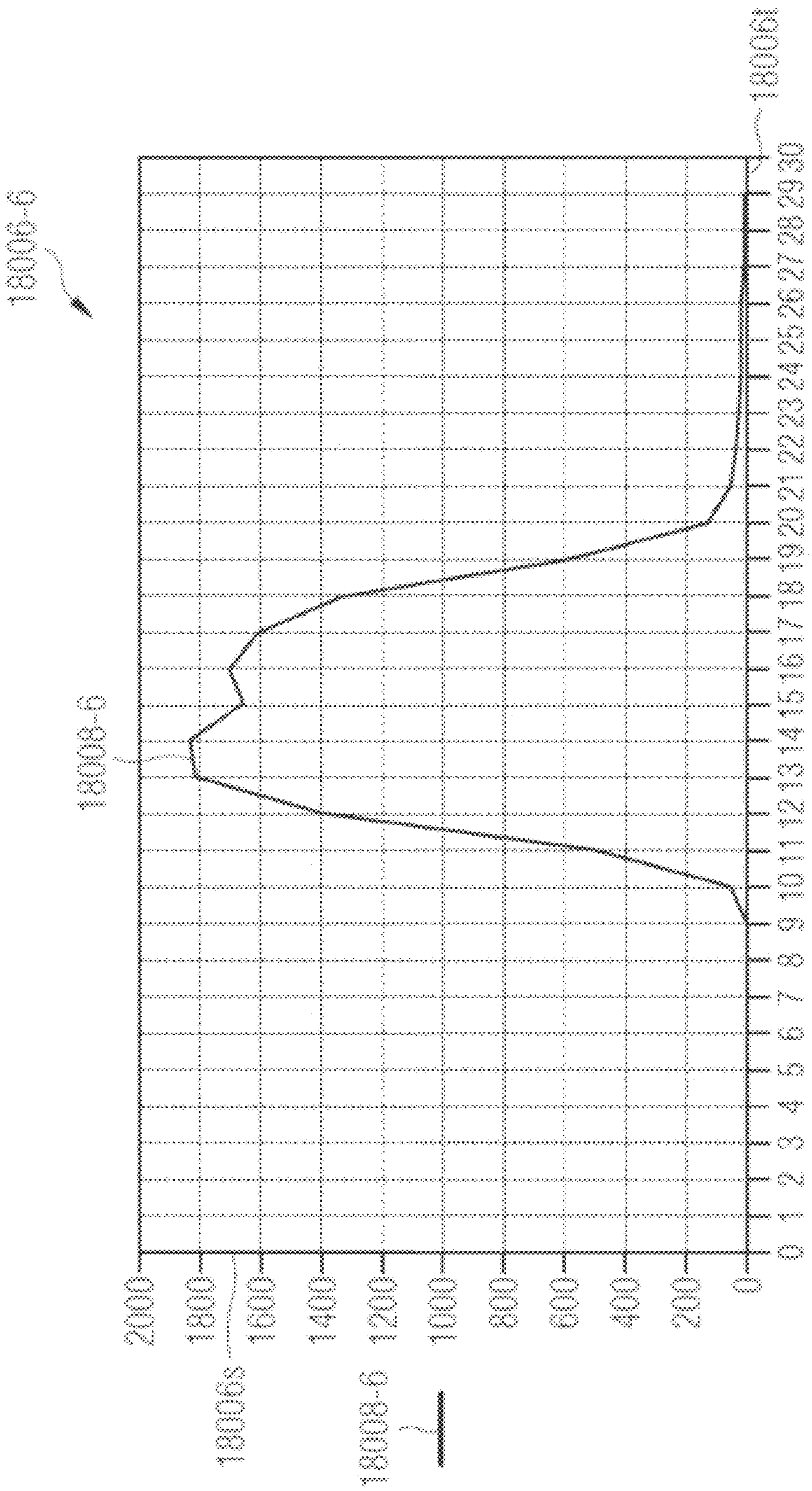

A visual representation of the transformed learning vectors is provided in FIG. 180C to FIG. 180H. A first graph 18006-1 in FIG. 180C may represent the first transformed learning vector 18004-1 (e.g., the first graph 18006-1 may include a first curve 18008-1 representing the first transformed learning vector 18004-1). A second graph 18006-2 in FIG. 180D may represent the second transformed learning vector 18004-2 (e.g., the second graph 18006-2 may include a second curve 18008-2 representing the second transformed learning vector 18002-2). A third graph 18006-3 in FIG. 180E may represent the third transformed learning vector 18002-3 (e.g., the third graph 18006-3 may include a third curve 18008-3 representing the third transformed learning vector 18002-3). A fourth graph 18006-4 in FIG. 180F may represent the fourth transformed learning vector 18002-4 (e.g., the fourth graph 18006-4 may include a fourth curve 18008-4 representing the fourth transformed learning vector 18002-4). A fifth graph 18006-5 in FIG. 180G is may represent the fifth transformed learning vector 18008-5 (e.g., the fifth graph 18006-5 may include a fifth curve 18008-5 representing the fifth transformed learning vector 18002-5). A sixth graph 18006-6 in FIG. 180H may represent the sixth transformed learning vector 18002-6 (e.g., the sixth graph 18006-6 may include a sixth curve 18008-6 representing the sixth transformed learning vector 18002-6). Each graph may include a first axis 18006*s* associated with a vector value (e.g., a signal value, expressed in arbitrary units), and a second axis 18006*t* associated with a vector index, e.g. associated with the time, e.g. with a time value or a time point (expressed in arbitrary units).

The transformed learning vectors may provide an orthogonally transformed alternative set of mathematically calculated time series. The transformed learning vectors may provide a high distinctiveness for extracting efficiently the similarity features describing an extracted event signal vector U_k. The transformed learning vectors (e.g., the first to sixth learning vectors in FIG. 180B) may include structural variations with respect to the associated reference LIDAR signal. A transformed learning vector may hold the information about the typical amplitude strength.

The knowledge of the orthogonal signal components P_0, P_1, . . . , P_{M−1} (e.g., with M=6) may provide extraction of the relevant features f_k=(f_{k,0},f_{k,1}, . . . , f_{k, M−1})T from an event signal vector U_k. The elements of the feature vector f_k may be calculated as follows (e.g., an inference formula may be as follows):

$$f_{k,m} = \frac{P_m}{|P_m|} \cdot U_k \tag{26am}$$

Considering the exemplary transformed learning vectors illustrated in FIG. 180B and the exemplary event signal vector represented in the graph 18102 illustrated in FIG. 181A, the feature vector f_k may be determined as $f\_k^T$= (101, −77, 91, 372, −17, 854). The graph 18102 in FIG. 181A may represent the event signal vector (e.g., the graph 18102 may include a curve 18102*v* representing the event signal vector). The graph 18102 may include a first axis 18102*s* associated with a vector value (e.g., a signal value, expressed in arbitrary units), and a second axis 18102 *t* associated with a vector index, e.g. associated with the time, e.g. with a time value or a time point (expressed in arbitrary units). The feature values included in the feature vector may each describe a similarity score of the LIDAR signal (e.g., of the event vector signal, U_k) in relation to the reference signals (e.g., in relation to the learning vectors and/or in relation to the transformed learning vectors). The limited number of score values may represent the entire LIDAR signal in a compressed form. Signal reconstruction may be performed correspondingly, e.g. in a reverse manner. The feature vector f_k for this exemplary case may be illustrated in the graph 18104 in FIG. 181C, e.g. the graph 18104 may show the values of the elements of the feature vector f_k. The graph 18104 may include a plurality of data points 18104*f* describing the values of the elements of the feature vector f_k. The graph 18104 may include a first axis 18104*e* associated with the element value (expressed in arbitrary units), and a second axis 18104*m* associated with an element index (e.g., a vector index in the feature vector f_k).

After receiving the feature vector f_k for each of the k events (e.g., each of the k event time series), the real event signature U_k may be reconstructed as follows (e.g., a reconstructed signature U_k,rec may be provided by a reconstruction algorithm in the backend), $$U_{k,rec} = \sum_{m=0}^{M-1} f_{k,m} \cdot \frac{P_m}{|P_m|} \tag{27am}$$

A reconstructed signal associated with the event signal vector shown in FIG. 181A is illustrated in the graph 18106 in FIG. 181C. Illustratively, the graph 18106 may include a visual representation of a reconstructed event signal vector associated with the event signal vector shown in FIG. 181A. The curve 18106*v* may represent the (e.g., original) signal vector (e.g., the curve 18106*v* may correspond to the curve 18102*v* illustrated in the graph 18102 in FIG. 181A), and the (e.g., dotted) curve 18106*r* may represent the reconstructed signal vector. The graph 18106 may include a first axis 18106*s* associated with a vector value (e.g., a signal value, expressed in arbitrary units), and a second axis 18106*t* associated with a vector index, e.g. associated with the time, e.g. with a time value or a time point (expressed in arbitrary units).

In the following, various aspects of this disclosure will be illustrated:

Example 1am is a LIDAR Sensor System. The LIDAR Sensor System may include one or more processors configured to compress a time series of a received LIDAR signal to a compressed LIDAR signal using a feature extraction process using a priori knowledge about structural properties of a typical LIDAR signal.

In Example 2am, the subject-matter of example 1am can optionally include that the one or more processors are configured to compress a time series of a received LIDAR signal by identifying one or more event time series within the received LIDAR signal.

In Example 3am, the subject-matter of example 2am can optionally include that an event time series is a portion of the time series of the received LIDAR signal including one or more events.

In Example 4am, the subject-matter of example 3am can optionally include that the events are selected from a group of events consisting of: one or more peaks within the received LIDAR signal; and/or one or more LIDAR echo signals within the received LIDAR signal.

In Example 5am, the subject-matter of any one of examples 2am to 4am can optionally include that an event time series is a portion of the time series of the received LIDAR signal having a signal level above a threshold value. For example the threshold value may be defined in accordance with one or more LIDAR Sensor System-internal conditions and/or one or more LIDAR Sensor System external-conditions.

In Example 6am, the subject-matter of any one of examples 1am to 5am can optionally include that the one or more processors are configured to compress at least one event time series of a received LIDAR signal by comparing the at least one event time series of the received LIDAR signal with one or more reference LIDAR signals.

In Example 7am, the subject-matter of any one of examples 1am to 6am can optionally include that the one or more processors are configured to compress at least one event time series of a received LIDAR signal to a compressed LIDAR signal feature set.

In Example 8am, the subject-matter of example 7am can optionally include that the compressed LIDAR signal feature set includes one or more features describing the shape of at least a portion of the at least one event time series based on the one or more reference LIDAR signals.

In Example 9am, the subject-matter of example 7am can optionally include that the compressed LIDAR signal feature set includes an index and a scaling factor associated with each feature of the one or more features.

In Example 10am, the subject-matter of example 7am can optionally include that the compressed LIDAR signal feature set includes a plurality of index-scaling factor pairs.

In Example 11am, the subject-matter of example 7am can optionally include that the compressed LIDAR signal feature set includes a vector including an ordered sequence of similarity score values.

In Example 12am, the subject-matter of any one of examples 6am to 11am can optionally include that the compressed LIDAR signal feature set includes one or more features describing the shape of at least a portion of the at least one event time series based on a plurality of reference LIDAR signals taken from different types of scenes.

In Example 13am, the subject-matter of example 12am can optionally include that each reference LIDAR signal of the plurality of reference LIDAR signals is associated with one or more LIDAR Sensor System external-parameters. For example the one or more LIDAR Sensor System-external parameters may include a driving situation, a traffic situation, or an environmental situation.

In Example 14am, the subject-matter of any one of examples 1am to 13am can optionally include that the one or more processors are further configured to determine a temporal arrival time for at least some of one or more identified events. The one or more processors may be further configured to associate the determined temporal arrival time with the respective identified event.

In Example 15am, the subject-matter of any one of examples 1am to 14am can optionally include a memory storing a table including feature extraction information.

In Example 16am, the subject-matter of any one of examples 1am to 15am can optionally include that the one or more processors are configured to implement one or more machine learning processes to generate the compressed LIDAR signal.

In Example 17am, the subject-matter of example 16am can optionally include that the one or more machine learning processes are selected from a group consisting of: one or more neural network based processes; and/or one or more probabilistic machine learning processes.

In Example 18am, the subject-matter of any one of examples 14am to 17am can optionally include a transmitter configured to transmit the determined temporal arrival time together with the compressed LIDAR signal is feature set associated with the identified event time series to a further processor for further signal processing and/or data analysis.

In Example 19am, the subject-matter of example 18am can optionally include that the further processor is associated with a sensor fusion box.

In Example 20am, the subject-matter of any one of examples 18am or 19am can optionally include that the further processor is configured to perform a signal reconstruction process. For example the signal reconstruction process may be based on a reverse LIDAR signal compression.

In Example 21am, the subject-matter of any one of examples 1am to 20am can optionally include a sensor configured to detect a light signal.

In Example 22am, the subject-matter of example 21am can optionally include that the sensor includes at least one photo diode.

In Example 23am, the subject-matter of example 22am can optionally include that the at least one photo diode includes a pin-photo diode and/or an avalanche photo diode (APD) and/or a single-photon avalanche diode (SPAD) and/or a Silicon Photomultiplier (SiPM) and/or a Complementary metal-oxide-semiconductor (CMOS) sensor, and/or a Charge Coupled Device (CCD) and/or a stacked multilayer photodiode.

In Example 24am, the subject-matter of any one of examples 1am to 23am can optionally include an analog-to-digital converter configured to convert the analog received LIDAR signal into a time series of digital values representing a digitized received LIDAR signal.

In Example 25am, the subject-matter of example 24am can optionally include that an event time series of the digitized received LIDAR signal includes a predefined number of digital values within an associated time duration.

Example 26am is a method of operating a LIDAR Sensor System. The method may include compressing a time series of a received LIDAR signal to a compressed LIDAR signal using a feature extraction process using a priori knowledge about structural properties of a typical LIDAR signal.

In Example 27am, the subject-matter of example 26am can optionally include compressing a time series of a received LIDAR signal by identifying one or more event time series within the received LIDAR signal.

In Example 28am, the subject-matter of example 27am can optionally include that an event time series is a portion of the time series of the received LIDAR signal including one or more events.

In Example 29am, the subject-matter of example 28am can optionally include that the events are selected from a group of events consisting of: one or more peaks within the received LIDAR signal; and/or one or more LIDAR echo signals within the received LIDAR signal.

In Example 30am, the subject-matter of any one of examples 27am to 29am can optionally include that an event time series is a portion of the time series of the received LIDAR signal having a signal level above a threshold value. For example the threshold value may be defined in accordance with one or more LIDAR Sensor System internal conditions and/or one or more LIDAR Sensor System external conditions.

In Example 31am, the subject-matter of any one of examples 26am to 30am can optionally include compressing at least one event time series of a received LIDAR signal by comparing the at least one event time series of the received LIDAR signal with one or more reference LIDAR signals.

In Example 32am, the subject-matter of any one of examples 26am to 31am can optionally include compressing at least one event time series of a received LIDAR signal to a compressed LIDAR signal feature set.

In Example 33am, the subject-matter of example 32am can optionally include that the compressed LIDAR signal feature set includes one or more features describing the shape of at least a portion of the at least one event time series based on the one or more reference LIDAR signals.

In Example 34am, the subject-matter of example 33am can optionally include that the compressed LIDAR signal feature set includes an index and a scaling factor associated with each feature of the one or more features.

In Example 35am, the subject-matter of example 33am can optionally include that the compressed LIDAR signal feature set includes a plurality of index-scaling factor pairs.

In Example 36am, the subject-matter of example 33am can optionally include that the compressed LIDAR signal feature set includes a vector including an ordered sequence of similarity score values.

In Example 37am, the subject-matter of any one of examples 31am to 36am can optionally include that the compressed LIDAR signal feature set includes one or more features describing the shape of at least a portion of the at least one event time series based on a plurality of reference LIDAR signals taken from different types of scenes.

In Example 38am, the subject-matter of example 37am can optionally include that each reference LIDAR signal of the plurality of reference LIDAR signals is associated with one or more LIDAR Sensor System external parameters. For example the one or more LIDAR Sensor System-external parameters may include a driving situation, a traffic situation, or an environmental situation.

In Example 39am, the subject-matter of any one of examples 26am to 38am can optionally include determining a temporal arrival time for at least some of one or more identified events. The method may further include associating the determined temporal arrival time with the respective identified event.

In Example 40am, the subject-matter of any one of examples 26am to 39am can optionally include a memory storing a table including feature extraction information.

In Example 41am, the subject-matter of any one of examples 26am to 40am can optionally include implementing one or more machine learning processes to generate the compressed LIDAR signal.

In Example 42am, the subject-matter of example 41am can optionally include that the one or more machine learning processes are selected from a group consisting of: one or more neural network based processes; and/or one or more probabilistic machine learning processes.

In Example 43am, the subject-matter of any one of examples 39am to 42am can optionally include a transmitter transmitting the determined temporal arrival time together with the compressed LIDAR signal feature set associated with the identified event time series for further signal processing and/or data analysis.

In Example 44am, the subject-matter of example 43am can optionally include performing a signal reconstruction process. For example to the signal reconstruction process may be based on a reverse LIDAR signal compression.

In Example 45am, the subject-matter of any one of examples 26am to 44am can optionally include a sensor detecting a light signal.

In Example 46am, the subject-matter of example 45am can is optionally include that the sensor includes at least one photo diode.

In Example 47am, the subject-matter of example 46am can optionally include that the at least one photo diode includes a pin-photo diode and/or an avalanche photo diode (APD) and/or a single-photon avalanche diode (SPAD) and/or a Silicon Photomultiplier (SiPM) and/or a Complementary metal-oxide-semiconductor (CMOS) sensor, and/or a Charge Coupled Device (CCD) and/or a stacked multilayer photodiode.

In Example 48am, the subject-matter of any one of examples 26am to 47am can optionally include an analog-to-digital converter converting the analog received LIDAR signal into a time series of digital values representing a digitized received LIDAR signal.

In Example 49am, the subject-matter of example 48am can optionally include that an event time series of the digitized received LIDAR signal includes a predefined number of digital values within an associated time duration.

Example 50am is a computer program product, including a plurality of program instructions that may be embodied in non-transitory computer readable medium, which when executed by a computer program device of a LIDAR Sensor System according to any one of examples 1am to 25am, cause the LIDAR Sensor System to execute the method according to any one of the examples 26am to 49am.

Example 51am is a data storage device with a computer program that may be embodied in non-transitory computer readable medium, adapted to execute at least one of a method for LIDAR Sensor System according to any one of the above method examples, a LIDAR Sensor System according to any one of the above LIDAR Sensor System examples.

A partially or fully automated vehicle may include and employ a multitude of sensor systems and devices (e.g., navigation and communication devices, as well as data processing and storage devices) to perceive and interpret the surrounding environment in great detail, with high accuracy, and in a timely manner. Sensor systems may include, for example, sensors such as a LIDAR sensor, a Radar sensor, a Camera sensor, an Ultrasound sensor and/or an Inertial Measurement sensor (IMU). Navigation and communication systems may include, for example, a Global Positioning System (GNSS/GPS), a Vehicle-to-Vehicle (V2V) communication system, and/or a Vehicle-to-Infrastructure (V2I) communication system.

A vehicle capable of partly autonomous driving, (e.g., a vehicle capable of operating at an SAE level 3 or higher), may employ more than one of each sensor type. By way of example, a vehicle may include 4 LIDAR systems, 2 RADAR systems, 10 Camera systems, and 6 Ultrasound systems. Such vehicle may generate a data stream up to about 40 Gbit/s of data (or about 19 Tbit/h). Taking into account typical (e.g., average) driving times per day and year, a data stream of about 300 TB per year (or even higher) may be estimated.

A great amount of computer processing power may be required to collect, process, and store such data. In addition, sensor data may be encoded and transmitted to a superordinate entity, for example a sensor fusion box, in order to determine (e.g., calculate) a consolidated and consistent scene understanding which may be used for taking real-time decisions, even in complex traffic situations. A sensor fusion box may use sensor data from various sensors of the same type (e.g. LIDAR System A, LIDAR System B, etc.) and/or various sensor types (LIDAR system, Camera system, Radar system, Vehicle sensors, and the like). Safe and secure sensing and decision making may further necessitate backup and fallback solutions, thus increasing redundancy (and complexity) of equipment and processes.

In the field of signal and data processing, various concepts and algorithms may be employed and implemented for data compression. From a general point of view, lossless and lossy data compression algorithms may be distinguished.

In case of lossless data compression, the underlying algorithm may try to identify redundant information which may then be extracted from the data stream without data loss. Run-length Encoding (RLE) may be an example of a lossless data compression algorithm. In the Run-length Encoding algorithm, identical and consecutive information symbols may be compressed by using the respective symbol only once, together with the number of identified repetitions. Further examples of lossless data compression algorithms may include variable length coding or entropy coding algorithms, such as Huffman-Code, Arithmetic coding, and the like.

In case of lossy data compression, the underlying algorithm may try to identify non-relevant or less-relevant information which may be extracted from the data stream with only minor effects on the later derived results (e.g., results from data analysis, from object recognition calculations, from object classification calculations, and the like). Examples of lossy compression algorithms may include rather simple procedures such as quantization, rounding, and discretization. More complex examples of lossy compression algorithms may include computationally intensive transform algorithms, such as Discrete Cosine Transforms (DCT), as an example. In the DCT algorithm, raw data streams may be transformed into another domain, which may provide a more targeted quantization (e.g., MP3 audio compression, JPEG for image compression, and MPEG for video compression). Additionally or alternatively, an estimation- or prediction-based algorithm may be employed. In such algorithms, data streams may be analyzed to predict next symbols, for example to predict (at least in part) contents of an image based on analyzed neighboring image parts. Such estimation- or prediction-based algorithm may include ranking methods to set up a context-specific probability estimation is function.

By way of example, in LIDAR applications, point cloud compression techniques, point cloud simplification techniques, and mesh compression techniques may be employed to generate compressed point cloud data at different precision levels and/or different compression rates. With regard to point cloud compression and simplification concepts, so-called 1D traversal approaches, 2D image and/or video coding techniques, or approaches directly operating on the 3D data may be used to achieve data compression. Said approaches may be lossless or lossy.

A lossy data compression algorithm may provide higher data compression rate compared to a lossless data compression algorithm. Furthermore, the earlier the data compression is executed, the higher the achievable data compression rate may be, as described in further detail below. However, in case of safety-related applications, such as autonomous driving, willfully accepted data loss may be risky. It may prove difficult to foresee which consequences such data loss may have, for example in a specific, complex, and maybe confusing traffic situation. Illustratively, there may be a certain trade-off between the achievable level of data reduction rate and the tolerable level of information accuracy loss. Therefore, the implementation of lossy compression algorithms in applications involving safety-critical aspects, such as in the field of autonomously driving vehicles, may present great concerns, since it may not be clear how the optimum trade-off may be assessed.

Data compression, in particular in case lossy compression algorithms are employed, may lead in some cases to an incomplete or faulty scene understanding and semantic mapping. By way of example, inconsistencies may arise due to the data loss. An example of such inconsistencies may be that an object is present in the field of view data set of one sensor (e.g., of a first sensor module) but is not present in the, at least partly overlapping, field of view data set of another sensor (e.g., of a second sensor module). A further example of inconsistency may be that data sets of different sensors or sensor modules may provide or encode different properties for a same object, such as different size, location, orientation, velocity, or acceleration. Furthermore, an excessively low level of data quality (e.g., in terms of data resolution, image pixelation or signal-to-noise ratio) may hamper object recognition and classification. A conventional system may not be configured or capable to react to such inconsistencies in an appropriate manner, e.g. in an efficient manner.

Various embodiments may be related to a method (and a system) for data compression providing an open and dynamically re-adjustable trade-off assessment between the theoretically achievable data reduction rate and the tolerable level of information accuracy. The method described herein may provide a highly efficient and effective data compression, and may provide an improvement of data quality in case the achieved level of data accuracy is not sufficient (for example, in a data fusion and object recognition process). The method described herein may overcome the fixed and static trade-off assessment of a conventional system. Illustratively, the method described herein may include compressing a portion of the acquired sensor data for further processing, and storing an uncompressed portion of the acquired sensor data (e.g., data blocks extracted from the original data stream before or during the process of compressing the other sensor data) to be provided upon request (e.g., in case additional data are to be used to remove inconsistencies in the results of the data processing). Illustratively, the method described herein may include routing acquired sensor data stemming from a specific part of the Field-of-Illumination (FOI) or Field-of-View (FOV) through a data compression module in order to be stored uncompressed in an intermediate storage device (e.g., an intermediate storage memory), and routing acquired sensor data stemming from another (e.g., different) segment of the FOV or FOI through the data compression module in order to be treated with various compression techniques as described below in further detail. Further illustratively, the method described herein may provide reducing or substantially eliminating faulty scene understanding, or at least reacting to determined data inconsistencies (e.g., in an object recognition process or in an object classification process).

The method described herein may provide well-adapted and sophisticated data compression to reduce the amount of data that is processed, stored, and transmitted (e.g., to a sensor fusion box and/or to a vehicle steering control system). The data compression may provide an overall reduction in power consumption. Illustratively, even though data compression may involve power-intensive computations, a reduction in power consumption may be provided by the reduced amount of data to be encoded, transmitted, decoded, transformed and analyzed (e.g., in later data fusion and object recognition processes). A reduction in power consumption may be provided, for example, in relation to a vehicle condition, as described for example in relation to FIG. 123.

In various embodiments, a system including one or more devices and one or more data processing modules, for example for classifying an object starting from a raw data sensor signal, may be provided. The system may include a sensor module configured to generate sensor data, for example a LIDAR sensor module, or a RADAR sensor module, or a Camera sensor module, or an Ultrasonic sensor module. The system may include a plurality of (e.g., additional) sensor modules, each configured to generate sensor data. The system may include a plurality of sensor modules of the same type (e.g., the system may include a plurality of LIDAR sensor modules), for example arranged at different locations, e.g. different vehicle locations (illustratively, front, corner, side, rear, or roof LIDAR sensor modules). Additionally or alternatively, the system may include a plurality of sensor modules of different types.

The system may include a sensor module, a data compression module, and a sender and receiver module. The sensor module may include a sensor. Considering, as an example, a LIDAR sensor module, the sensor may include one or more photo diodes configured to receive infra-red light signals and convert the received light signals into associated photo-current signals. The sensor module may include additional electronics elements configured to provide basic signal and raw data processing. In a LIDAR sensor module, in subsequent processing steps, time-of-flight (TOF) data points may be derived from the raw data signals, and a 3D point cloud may be generated from the individual time-of-flight data points.

The sensor may be continuously capturing signals, for example within dedicated measurement time windows. Thus, there may be an essentially continuous stream of data produced by the sensor and provided to further downstream data processing modules. Each data point or each group of data points may be labeled with a time stamp to provide a clear data assignment.

The data compression module may be used to reduce the amount of data to be stored and further processed. The data compression module may be configured to implement one or more data compression algorithms (e.g., including lossy data compression algorithms) to reduce the amount of data. Data compression may be carried out at different steps during the data processing process, e.g. at different steps during the raw data processing processes and/or at different steps of the time-of-flight calculations or 3D point cloud generation. Illustratively, the data compression module may involve several separate data compression steps and may be implemented via different electronics and/or software parts or software programs.

After the completion of signal generation, data processing, and data compression, the generated data may be encoded to be sent via pre-defined data packages to a central data processing system. The data compression and intermediate storage method described herein (as already outlined above and as described below in more detail) may reduce the amount of data communication and provide fast information exchange, which may be important for partially or fully automated driving vehicles. By way of example, communication methods based on high-speed Ethernet connection may be used, as described in further detail below. The central data processing system may be, for example, a sensor fusion box, e.g. of a vehicle. The sensor fusion box may be communicatively connected to the sensor module (e.g., to each sensor module), for example via a vehicle sender and receiver system configured to receive and decode the encoded sensor module data packages. The vehicle sender and receiver system may further be configured to receive data from additional information providing systems, such as a Global Positioning System (GNSS/GPS), an Inertial Measurement sensor, a Vehicle-to-Vehicle (V2V) system, or a Vehicle-to-Infrastructure (V2I) system. The various data streams may be collected and consolidated in the sensor fusion box. Redundant data may be compared and further reduced, as long as information consistency is ascertained. Alternatively, in case that inconsistent redundant data are detected, such data may be balanced or weighted against each other and/or prioritization decisions may be executed. This may lead to a concise semantic scene understanding based on object recognition, object classification, and object tracking.

In various embodiments, signal and data processing procedures may include an extended series of individual process steps in order to come from a raw data signal to useful and usable information (e.g., to object classification and identification). Illustratively, starting from the signal acquisition itself, basic signal processing may be performed (e.g., current-to-voltage conversion, signal amplification, analog-to-digital conversion, signal filtering, signal averaging, histogram allocation, and the like). Subsequently, basic signal analysis processes may include or employ techniques for baseline subtraction, noise reduction, peak and amplitude detection, various calculations (e.g. time-of-flight calculation), and the like. The obtained (e.g., processed) data may be further processed using techniques for data transformation (e.g., with respect to data format, data resolution and angle of view, as an example), data encoding, basic or advanced object classification (e.g., assignment of bounding boxes or object heading), object recognition, and the like.

During the data processing steps, data compression may be employed or implemented to reduce the effort in the upcoming (in other words, downstream) process steps, e.g. with respect to power consumption and/or need for data storage memory. The relevance of the effects of the data compression may be dependent on when (e.g., at which processing step) the data compression is implemented. As an example, the reduction in power consumption and/or in memory requirements may be the higher the earlier data compression is employed in the above described data processing procedure. However, in case of lossy data compression techniques, the earlier the data compression is executed, the more possible performance losses may occur. Thus, not only the extent of data compression (lossless versus lossy compression) may be taken into account for the above-mentioned prioritization and optimization decisions, but also the timing within the signal and data processing procedure.

In various embodiments, a sensor system may be provided. The sensor system may be included, as an example, in a vehicle, e.g. a vehicle with partially or fully automated driving capabilities. Illustratively, the vehicle may include one or more sensor systems as described herein.

The sensor system may include a (e.g., first) sensor module configured to provide sensor data. The configuration of the sensor module may be selected according to the desired type of sensor data. The sensor module may be configured as a sensor type selected from a group of sensor types including or consisting of a LIDAR sensor, a RADAR sensor, a Camera sensor, an Ultrasound sensor, and an Inertial Measurement sensor. The sensor system may include a plurality of sensor modules (illustratively, the sensor system may include the sensor module and one or more further sensor modules). The sensor modules may be of the same type or of different types. By way of example, at least one further sensor module (e.g., a second sensor module) may be of the same sensor type as the sensor module. As another example, at least one further sensor module may be of a different sensor type as compared to the sensor module.

The sensor system may include a data compression module (also referred to as data compressor). The data compression module may be configured to compress data. The data compression module may be configured to compress at least a portion (e.g., a first portion) of the sensor data provided by the sensor module to generate compressed sensor data. Illustratively, the compressed sensor data may be or include a portion of the sensor data, of which portion of sensor data at least a part is compressed (e.g., the compressed sensor data may include compressed data and optionally non-compressed data). The compressed sensor data (e.g., at least a part of the compressed sensor data) may be used for further processing, (e.g., for scene mapping, object recognition, object classification, and the like), as described in further detail below. Additionally or alternatively, the compressed sensor data (e.g., another part of the compressed sensor data) may be stored, as described in further detail below. By way of example, the data compression module may be included in the sensor module (e.g., each sensor module may include a respective data compression module). As another example, the data compression module may be communicatively coupled with the sensor module (e.g., with one or more sensor modules, e.g. with each sensor module), e.g. the data compression module may be external to the sensor module.

In various embodiments, the data compression module may be configured to carry out various types of data compression, for example lossless and/or lossy data compression. By way of example, the data compression module may be configured to implement at least one lossy compression algorithm (e.g., to carry out at least one lossy compression method), such as quantization, rounding, discretization, transform algorithm, estimation-based algorithm, or prediction-based algorithm. As another example, additionally or alternatively, the data compression module may be configured to implement at least one lossless compression algorithm (e.g., to carry out at least one lossless compression method), such as Run-length Encoding, Variable Length Coding, or Entropy Coding Algorithm. The compression algorithms (e.g., the algorithm methods) may be stored (e.g., permanently) in a non-transient computer device (e.g., in a non-volatile memory), for example in the data compression module itself and/or in a sender and receiver module described in further detail below.

The sensor system may be configured to adapt a data processing characteristic associated with the sensor data, as described, for example, in relation to FIG. 162A to FIG. 164D. As an example, the sensor system may be configured to adapt a resolution and/or a framerate of the sensor data. The sensor system may be configured to provide the sensor data having the adapted resolution and/or the adapted frame rate to the data compression module, for example for lossless data compression. Illustratively, the sensor system may be configured to determine (e.g., evaluate) a relevance of different portions of the field of view. The sensor system may be configured to assign to each portion a respective data processing characteristic. By way of example, the sensor system may be configured to determine one or more portions of field of view to be processed with higher (or lower) resolution and/or higher (or lower) framerate (e.g., portions including safety-critical objects may be processed with higher data processing characteristics, e.g. with a lower compression rate).

In various embodiments, the sensor system may include a memory (also referred to as intermediate memory, intermediate data storage memory, or memory for intermediate data storage). The memory may store (e.g., may be configured to store or used to store) at least a portion of the sensor data not included in the compressed sensor data (illustratively, a second portion different from the first portion, e.g. a portion of uncompressed sensor data, also referred to as non-compressed sensor data). Additionally or alternatively, the memory may store at least a portion of the compressed sensor data. The memory may store data elements (e.g., data blocks) extracted from the original data stream before, during or after the data compression. Illustratively, the memory may store a portion of the raw (e.g., uncompressed) sensor data and/or a portion of pre-compressed sensor data and/or a portion of sensor data compressed by the data compression module, but not included in the compressed sensor data, e.g. not included in the data delivered to a data processing side of the sensor system (e.g., delivered to the sensor fusion box). In contrast to a conventional compression process, the extracted data may be stored (e.g., temporarily) in the intermediate memory (illustratively, rather than being discarded). Such extracted data may include, for example, redundant, non-relevant, or less relevant data elements. Only as an example, every other data point of a 3D point cloud may be extracted and stored in the intermediate memory. This may reduce the data stream which is to be further processed, e.g. by a factor of two. By way of example, the memory may be included in the sensor module (e.g., each sensor module may include a respective intermediate data storage memory). As another example, the memory may be communicatively coupled with the sensor module (e.g., with one or more sensor modules, e.g. with each sensor module), e.g. the memory may be external to the sensor module.

The intermediate data storage memory may be a self-contained memory storage device (e.g., dedicated to intermediate data storage). By way of example, the memory may be or include a non-volatile memory. As another example, the memory may be or include a volatile memory. Alternatively, the memory may be a dedicated part of a larger memory device provided by a storage device (e.g., for processing the original sensor data stream). The sensor system (e.g., one or more processors or a sender and receiver module, described in further detail below) may be configured to pre-define or set the actually useable storage capacity of the larger memory device for intermediate data storage (e.g., which portion of the memory device may be dedicated to intermediate data storage).

By way of example, the memory may be a ring memory. The intermediate buffer of the intermediate data storage memory may be organized according to a so-called ring buffer (also referred to as circular buffer or circular queue). Such organization may provide a data structure including one single memory area with a fixed or adjustable memory size. In such configuration, the operation of the memory may be based on a first-in first-out concept. Illustratively, data (e.g., sensor data) may be subsequently recorded in the ring buffer. As soon as the memory area is completely filled with data, those parts of the data which first have entered the buffer may be overwritten. Based on the memory dimension (e.g., the storage capacity of the ring memory) and the quantity of data which typically enter the ring buffer, the retention time (e.g., a time setting) of a typical data set may be calculated. The ring memory may have, for example, a storage capacity of at least 10 MB, for example 1 GB.

In various embodiments, identification information may be assigned to the sensor data (e.g., the compressed data and the extracted uncompressed and/or compressed data). The sensor system may be configured to associate an identifier with the compressed sensor data and with the extracted data (e.g., compressed or uncompressed). Illustratively, the sensor system may be configured to associate an identifier with the portion of sensor data that is included in the compressed sensor data (e.g., the compressed sensor data to be delivered to the data processing side and/or to be delivered to the memory), and with the portion of sensor data that is not included in the compressed sensor data (e.g., with the uncompressed portion that is stored in the memory, e.g. with the uncompressed sensor data delivered to the data processing side, as described below in further detail). The identifier may include, as an example, a time stamp (e.g., describing an absolute or relative time point at which the sensor data were generated). The identifier may include, as another example, a sensor-specific or sensor module-specific code identifying the sensor or sensor module that provided the data. The extracted data may be stored with the associated identifier.

As an example, in case a lossy compression algorithm is implemented, a difference value may be calculated. Such difference value may enable the reconstruction and the re-encoding of the original data set in case the difference value is added to the compressed data set (e.g., to the respective compressed sensor data). The difference value may be extracted and stored in the intermediate data storage memory together with the identifier of the respective compressed sensor data (e.g., with the associated time stamps and/or unique identification tags). The difference value may be used on demand to reconstruct the original data set (e.g., may be part of the response to the request of one or more processors, as described in further detail below). Alternatively, the difference value may be released (e.g., deleted), in case it is no-longer relevant, as described in further detail below. This compression and reconstructing method may provide a flexible solution with good fidelity for subsequently re-compressed data (e.g., newly compressed data), and thus increase processing and prediction accuracy at the sensor fusion level.

In various embodiments, the sensor system may include a bidirectional communication interface, for example an Ethernet-based communication interface (e.g., based on high-speed Ethernet connection). The bidirectional communication interface may be configured to provide the compressed sensor data (e.g., the compressed sensor data, or at least a portion of the compressed sensor data, may be transmitted via the bidirectional communication interface, for example to one or more processors, as described in further detail below). Illustratively, the compressed sensor data (e.g., the compressed portion of the original data sets, illustratively without the extracted data) may be provided via the bidirectional communication interface (e.g., may be transferred to a sender and receiver module and transmitted by the sender and receiver module). The compressed sensor data may be provided via the bidirectional communication interface after the (e.g., lossy) data compression has been carried out and after the extracted data parts are stored in the intermediate data storage memory.

Additionally or alternatively, the bidirectional communication interface may be configured to provide uncompressed sensor data. Illustratively, the bidirectional communication interface may be configured to transmit sensor data not compressed by the data compression module (e.g., raw data from a sensor, or uncompressed sensor data stored in the intermediate memory).

The bidirectional communication interface may provide a communication interface between the sensor side (e.g., the sensor module, the data compression module, and the memory) and a data processing side (e.g., the one or more processors) of the sensor system. The bidirectional communication interface may include at least one transmitter and at least one receiver. By way of example, the bidirectional communication interface may include a first sender and receiver module (e.g., included in the sensor module or associated with the sensor module, e.g. with the sensor side). The bidirectional communication interface may include a second sender and receiver module (e.g., associated with the one or more processors, illustratively associated with the processing side, for example a vehicle sender and receiver module). Illustratively, the bidirectional communication interface may include a sender and receiver module on the sensor side and a sender and receiver module on the data processing side.

The bidirectional communication interface may be configured to receive a request to provide additional sensor data. Illustratively, the bidirectional communication interface may be configured to receive a request to further provide at least a part of the sensor data which is not included in the (e.g., provided) uncompressed and/or compressed sensor data and which is stored in the memory (e.g., the bidirectional communication interface may be configured to receive a request to further provide the extracted sensor data or at least a portion of the extracted sensor data). Additionally or alternatively, the bidirectional communication interface may be configured to receive a request to further provide at least a part of the compressed sensor data which is stored in the memory (e.g., a part of the compressed sensor data not yet provided or delivered to the data processing side). By way of example, the bidirectional communication interface may be included in the sensor module (e.g., each sensor module may include a respective sender and receiver module). As another example, the bidirectional communication interface (e.g., the sender and receiver module) may be communicatively coupled with the sensor module (e.g., with one or more sensor modules, e.g. with each sensor module), e.g. the sender and receiver module may be external to the sensor module.

In various embodiments, the bidirectional communication interface may be configured to provide the identifier associated with the uncompressed and/or compressed sensor data (e.g., to transmit the compressed sensor data and the associated identifier, e.g. to the data processing side, and/or to transmit the uncompressed sensor data and the associated identifier). The bidirectional communication interface may be configured to provide the identifier associated with the sensor module (e.g., to transmit the identifier associated with the sensor data, e.g. compressed or uncompressed, stored in the memory). Illustratively, the data stream packages may be encoded in the sender and receiver module, for example with associated time stamps or otherwise unique identification tags.

In various embodiments, the sensor system may include one or more processors (e.g., a data processing system), e.g. at the data processing side. The one or more processors may be configured to process data, e.g. sensor data (e.g., compressed sensor data and/or uncompressed sensor data). Illustratively, the one or more processors may be configured to process compressed sensor data provided by the sensor module (e.g., compressed sensor data associated with the sensor module, e.g. compressed sensor data associated with sensor data provided by the sensor module). Additionally or alternatively, the one or more processors may be configured to process uncompressed sensor data provided by the sensor module. By way of example, the one or more processors may be associated with (or included in) a sensor fusion box (e.g., of the vehicle). Illustratively, the one or more processors may be configured to receive the compressed sensor data (and/or uncompressed sensor data, or other sensor data) via the bidirectional communication interface (e.g., via the vehicle sender and receiver module in which the data may be decoded and transferred to the sensor fusion box).

The one or more processors may be configured to process further data, for example Vehicle-to-Vehicle (V2V) data, from Vehicle-to-Infrastructure (V2I) data, Global Positioning (GNSS/GPS) data, or Inertial Measurement sensor (IMU) data. Illustratively, the one or more processors may be configured to process (e.g., further) sensor data provided by at least one further sensor module (e.g., by a plurality of further sensor modules). By way of example, the one or more processors may be configured to process the compressed sensor data in combination with the further sensor data (e.g., further raw sensor data, e.g. further uncompressed sensor data, or further compressed sensor data). Additionally or alternatively, the one or more processors may be configured to process the uncompressed sensor data in combination with the further sensor data.

In various embodiments, the one or more processors may be configured to implement different types of data processing (e.g., including artificial intelligence methods and/or machine learning methods). The one or more processors may be configured to process data to provide a scene understanding (e.g., an analysis of an environment surrounding the vehicle). By way of example, the one or more processors may be configured to implement one or more object recognition processes (e.g., providing a list of one or more objects with one or more properties associated thereto). As another example, the one or more processors may be configured to implement one or more object classification processes (e.g., providing a list of classified objects, e.g. a list of objects with a class or a type associated thereto; illustratively, each object may have a class or a type associated thereto, such as car, truck, bicycle, pedestrian, and the like). As a further example, the one or more processors may be configured to implement one or more object tracking processes (e.g., providing a list of objects with an identifier and/or a velocity and/or a direction of motion associated thereto).

The one or more processors may be configured to determine whether some additional data related to the (e.g., received) compressed sensor data should be requested (e.g., from the sensor module, e.g. from the memory). Additionally or alternatively, the one or more processors may be configured to determine whether some additional data related to the (e.g., received) uncompressed sensor data should be requested. Illustratively, the one or more processors may be configured to determine whether some additional data related to the sensor data provided by the sensor module should be requested (e.g., retrieved from the memory). Further illustratively, the one or more processors may be configured to determine whether additional data with respect to the received (uncompressed and/or compressed) sensor data should be requested (e.g., with respect to the sensor data provided to the one or more processors). By way of example, the one or more processors may be configured to determine that additional data related to the uncompressed and/or compressed sensor data should be requested in case the one or more processors determine an inconsistency or ambiguity in the results of data processing including (at least in part) the uncompressed and/or compressed sensor data, as described in further detail below. The one or more processors may be configured to determine whether additional data related to the compressed sensor data and/or to the uncompressed sensor data should be requested taking into consideration the further sensor data (e.g., comparing results obtained with the uncompressed and/or compressed sensor data with results obtained with the further sensor data). Illustratively, the one or more processors may be configured to determine whether additional data related to the compressed sensor data and/or to the uncompressed sensor data should be requested based on the compressed sensor data and/or the uncompressed sensor data and the sensor data provided by the further sensor module.

The one or more processors may be configured to determine whether an inconsistency or ambiguity is present in the results of at least one of the processes described above. Illustratively, the one or more processors may be configured to determine whether an inconsistency or ambiguity is present in the results of a process carried out using, at least in part, the uncompressed and/or compressed sensor data (for example, in combination with sensor data provided by the further sensor module). An inconsistency may be, for example, a difference between the results of a process carried out with the uncompressed and/or compressed sensor data and the results of a process carried out with the further sensor data (e.g., an object being present and absent, an object being big and small, an object being in motion or not in motion, and the like). An inconsistency may be, as another example, a difference between a level of accuracy (e.g., a confidence level, such as a recognition confidence level or a classification confidence level, described for example in relation to FIG. 162A to FIG. 164E) obtained by processing the uncompressed and/or compressed sensor data and a predefined level of accuracy (e.g., a threshold accuracy level, for example a threshold confidence level).

By way of example, the one or more processors may be configured to determine whether an inconsistency or ambiguity is present in the results of at least one object recognition process carried out at least in part on (or with) the uncompressed and/or compressed sensor data. As another example, the one or more processors may be configured to determine whether an inconsistency or ambiguity is present in the results of at least one object classification process carried out at least in part on (or with) the uncompressed and/or compressed sensor data. As a further example, the one or more processors may be configured to determine whether an inconsistency or ambiguity is present in the results of at least one object tracking process carried out at least in part on (or with) the uncompressed and/or compressed sensor data. The one or more processors may be configured to determine that some additional data related to the uncompressed and/or compressed sensor data should be requested, in case an inconsistency or ambiguity is determined to be present. Illustratively, the one or more processors may be configured to determine that the provided data (e.g., uncompressed and/or compressed sensor data) are not sufficient to provide a predefined level of accuracy (e.g., of an object recognition process, of an object classification process, or of an object tracking process).

In various embodiments, the one or more processors may be configured to generate the request to further provide at least a part of the sensor data not included in the provided compressed sensor data and transmit the request to the sensor module (e.g., via the bidirectional communication interface associated with the sensor module), in case it has been determined that some additional data related to the compressed sensor data should be requested (e.g., from the sensor module). Additionally or alternatively, the one or more processors may be configured to generate the request to further provide at least a part of the sensor data not included in the provided uncompressed sensor data and transmit the request to the sensor module, in case it has been determined that some additional data related to the uncompressed sensor data should be requested. Illustratively, the one or more processors may be configured to transmit the request via the bidirectional communication interface (e.g., associated with or included in that sensor module) such that additional data (e.g., compressed or not compressed) provided by the sensor module may be retrieved from the intermediate data storage memory. The bidirectional communication interface may be configured to receive the request. The bidirectional communication interface may be further configured to receive the identifier (e.g., associated with the sensor data to be provided, e.g. to be retrieved). By way of example, the additional data may be raw data (e.g., non-compressed sensor data). As another example, the additional data may be pre-compressed sensor data, as described in further detail below. As another example, the additional data may be less-compressed data (e.g. data compressed with a lower compression rate). As yet another example, the additional data may be data which have been extracted by the compression module in a preceding compression step (e.g., difference values). The sensor module may be configured to provide the additional data upon receipt of the request. Illustratively, the data compression module may be configured to provide the additional data upon receipt of the request, e.g. to retrieve the additional sensor data from the memory and provide additional uncompressed and/or compressed sensor data.

In an exemplary case, all data streams (e.g., identifiable for example via sensor-specific identification tags/codes and time stamps) may come together in the sensor fusion box and may be further processed, for example with respect to object recognition and classification. The processing may include or use, for example, (e.g., extended) Artificial Intelligence (AI) and Machine Learning (ML) methods. The sensor fusion box (e.g., a control system of the sensor fusion box) may send a command (e.g., via the sender and receiver system of the vehicle) to request sending all or part of the extracted data stored in the intermediate data storage memory in case data inconsistencies or ambiguities are recognized (e.g., in case the sensor fusion box has not met target settings). The requested data may belong to (e.g., may be associated with) a specific time stamp, an interval of time stamps, or unique identification tags (e.g., coded using a blockchain technique). The command may be received by the bidirectional communication interface associated with the sensor module and forwarded to the intermediate data storage memory. The corresponding data may be localized and transmitted to the sensor fusion box.

In various embodiments, the procedure described above may be carried out with an already compressed data set (out from raw data). In a first step, all sensor data may be compressed. Only certain compressed data points or data sets (e.g., a portion of the compressed sensor data, for example, 50% of the data points or data sets) may be transferred into the intermediate memory. The other compressed data sets (e.g., the remaining portion of the compressed sensor data) may be provided via the bidirectional communication interface (e.g., may be transferred to the sender and receiver module). This method may provide a flexible solution with good data fidelity for subsequently compressed data, and minimum processing demands at the sensor side.

In various embodiments, the memory may store the sensor data. Illustratively, the complete set of sensor data may be stored in the intermediate memory (e.g., the original data set may be completely stored inside such memory). The raw data and/or pre-compressed data provided by the sensor module (e.g., generated by a sensor of the sensor module and illustratively considered as generic sensor data) may be transmitted (e.g., all) to the intermediate data storage memory.

The data compression module may be further configured to compress the sensor data stored in the memory with different compression rates. Illustratively, the data compression module may be configured to generate first compressed sensor data using a first compression rate and to generate second compressed sensor data using a second compression rate (e.g., lower than the first compression rate). By way of example, the data compression module may be further configured to compress the sensor data stored in the memory using different compression algorithms. Illustratively, the data compression module may be configured to generate first compressed sensor data using a first compression algorithm and to generate second compressed sensor data using a second compression algorithm (e.g., with a lower compression rate than the first compression algorithm, for example the first compression algorithm may be a lossy compression algorithm and the second compression algorithm may be a lossless compression algorithm). As an example, a compression of waveform shape parameters of LIDAR Data with different compression rates may be used for such purposes.

The data compression module may be further configured to compress the sensor data stored in the memory with different compression rates (e.g., using the second compression rate) upon receipt of the request. Illustratively, the bidirectional communication interface may be configured to provide the request for additional data to the data compression module to provide sensor data compressed with a different (e.g., lower) compression rate.

By way of example, the original data set may be compressed with a high compression rate (e.g., using an algorithm with a high compression rate). The highly compressed data set may be provided to the one or more processors (illustratively, of the data processing side). The original data set may still be stored in the memory. In case the one or more processors meet their target using the highly compressed sensor data (e.g., non-ambiguous object detection, recognition, and semantic scene interpretation), the original data sets may be deleted from the intermediate memory. In case the one or more processors do not successfully complete their task, a trigger signal may be issued to the intermediate memory to release the original data set (illustratively, to make the original data set available for the data compression module). Another trigger signal may be issued via the bidirectional communication interface (e.g., by the sender and receiver module) to apply a compressing algorithm with a lower compression rate to the original data sets. The newly compressed data set may then be used (and transmitted to the one or more processors), while keeping the original data in the intermediate memory. This procedure may be repeated with further algorithms with subsequently lower data compression rates until finally the original data set may be released (e.g., until the one or more processors meet their target). Alternatively, the original data set may already be transmitted upon reception of a first request or trigger signal.

This method may be described as "compression on demand" method. Such method may provide, for example, high flexibility and high data is fidelity for the subsequently compressed data. Furthermore, the method may impose comparatively low demands on the processing capabilities at the sensor side.

In various embodiments, the sensor system may include a further data compression module. The further data compression module may be configured to compress the sensor data provided by the sensor module to generate pre-compressed sensor data. Illustratively, the sensor data (e.g., the raw sensor data (generic data), for example generated by the sensor) may be processed by the further data compression module prior to being transmitted to (and stored in) the intermediate data storage memory. The further data compression module may be configured to perform a high-definition data compression, illustratively a data compression which generates compressed data with a high level of quality. By way of example, the further data compression module may be configured to implement a lossless data compression algorithm.

The intermediate memory may store the pre-compressed sensor data. The pre-compression of raw data prior to the data storing process may offer the effect that lower demands are imposed on the data storing capabilities (memory size) at the sensor side.

The data compression module may be configured to de-compress at least a portion of the pre-compressed sensor data (e.g., to decode the high-definition data) to provide de-compressed sensor data. The data compression module may be configured to provide the de-compressed sensor data (e.g., at least a portion of the de-compressed sensor data). As an example, the data compression module may be configured to de-compress at least a portion of the pre-compressed sensor data and compress the de-compressed portion to generate other compressed sensor data (e.g., second compressed sensor data). Illustratively, the data compression module may be configured to re-compress the pre-compressed sensor data (e.g., the de-compressed sensor data) with a higher or lower data compression rate to provide re-compressed sensor data. As an example, the data compression module may be configured to re-compress the sensor data (e.g., pre-compressed or de-compressed) using a different compression algorithm with respect to the further data compression module (e.g., an algorithm with a higher compression rate, e.g. a lossy compression algorithm). Further illustratively, the de-compressed sensor data may be or include compressed sensor data being compressed with a different (e.g., higher or lower) compression rate with respect to the pre-compressed sensor data. The data compression module may be configured to provide the re-compressed sensor data (e.g., at least a portion of the re-compressed sensor data). Additionally or alternatively, the data compression module may be configured to transmit at least a portion of the pre-compressed sensor data (e.g., to de-compress and provide a portion of the pre-compressed sensor data, without re-compressing the data).

The data compression module may be configured to receive a request to further provide at least a part of the pre-compressed sensor data which is not included in the (e.g., provided) de-compressed or re-compressed sensor data and which is stored in the memory.

This configuration may provide a refinement of the compression on demand method described above.

In various embodiments, a multi-resolution technique may be implemented. A multi-resolution technique may be a compression technique in which a raw data set is processed by a compression algorithm in such a way that a plurality of compressed data sets may be generated (illustratively, a plurality of sets of compressed sensor data from the same raw sensor data). The plurality of compressed data sets may differ from one another with respect to the level of data quality (e.g. data resolution, data loss, etc.).

The intermediate data storage memory may store the plurality of compressed data sets (e.g., for intermediate storage of multi-resolution data). By way of example, the data compression module may be configured to provide three compressed data sets (e.g., three sets of compressed sensor data) with low, medium and high data resolution, respectively. The three compressed data sets may be stored in the memory. The one or more processors may be configured to request one (or more) of the sets of compressed sensor data in accordance with one or more processing requirements, for example in accordance with a required level of data quality.

In various embodiments, the data compression module may be configured to provide intermediate compressed sensor data. The data compression module may be configured to provide a sequence of intermediate compressed sensor data, each compressed with a higher compression rate with respect to the preceding set of sensor data in the sequence. Illustratively, the compression algorithm may be configured such that intermediate compression results (e.g., compressed data sets with a low to medium compression rate) may be generated in the process of generating a data set with a high level of data compression.

The memory may store the intermediate compressed sensor data (e.g., up to the generation of compressed sensor data with highest level of data compression). Illustratively, the intermediate compression results may be progressively stored in the intermediate data storage memory until a data set with the highest level of data compression rate achievable with the associated compression algorithm may be generated. The data set generated with the highest level of data compression rate may be stored in the memory. This method may be described as "progressive data compression and data read out on demand". This method may provide a reduction in the processing power at the sensor module as data sets at progressively increasing compression levels may be generated in one pass taking full advantage of intermediate results. Progressive data compression may be implemented, as an example, by means of a progressive encoding technique (e.g., as used in the encoding of point cloud data).

In various embodiments, a successive refinement technique may be implemented. The data compression module may be configured to provide compression of sensor data in subsequent layers (illustratively, in subsequent process steps) with increasing data quality. Illustratively, a data compression algorithm may be implemented, in which the point cloud may be represented by several layers. Starting, for example, from a basic layer with a comparatively low data quality (e.g., low data resolution) each further layer may lead to a further improvement of the data quality (e.g., of the data resolution). The intermediate data storage memory may store such (e.g., intermediate) layers. This method may be described as "successive refinement data compression and readout on demand". The successive refinement compression approach may provide a reduction of the amount of data that are transmitted from the sensor module to the one or more processors (e.g., to the sensor fusion box). Successive refinement data compression may be implemented, as an example, by means of data compression techniques that allow for progressive transmission (e.g., considering the exemplary case of 3D point cloud data).

In various embodiments, the sensor system may include a memory controller. The memory controller may be configured to delete a portion of the memory in accordance with an instruction received via the bidirectional communication interface. Illustratively, the extracted data may be stored until a point in time is reached when the data is not needed any more. By way of example, the extracted data may be outdated and not required any longer for the processes described above (e.g., object recognition, scene understanding, and the like). Such data may be then considered non-relevant.

The one or more processors (e.g., the sensor fusion box), may define or identify a point in time associated with a positive fulfillment (e.g., a completion) of a process carried out by the one or more processors (e.g., a positive fulfillment of sensor data handling, object recognition, semantic scene understanding, and the like). Said point in time may be or represent a trigger point used to signal the intermediate data storage memory to release the stored but no longer useful or needed sensor data (e.g., raw, compressed, or pre-compressed). The intermediate data storage memory may store sensor data (e.g., compressed or uncompressed) until a release signal or a default trigger command is provided. By way of example, a release signal may be generated or triggered at said time point to initiate a delete command. As another example, a default or pre-programmed (e.g., adjustable) time setting may be provided (e.g., via the bidirectional communication interface), after which the delete command may be automatically triggered by a default trigger command. Illustratively, the time setting may define or represent a maximum amount of time for which sensor data may be stored in the intermediate memory.

In various embodiments, the sensor system may include one or more additional information providing interfaces and/or communication interfaces. By way of example, the sensor system may include at least one Global Positioning System interface to receive Global Positioning information (e.g., describing a position of the vehicle, e.g. GPS coordinates of the vehicle). As another example, the sensor system may include at least one Vehicle-to-Vehicle communication interface. As a further example, the sensor system may include at least one Vehicle-to-Infrastructure communication interface. The one or more processors may be configured to receive data and/or information via such additional interfaces (e.g., via the vehicle sender and receiver module). The one or more processors may be configured to process the data received via such interfaces, e.g. to determine whether some additional data related to the uncompressed and/or compressed sensor data should be requested based on the compressed sensor data and the data received via such interfaces.

FIG. 165A to FIG. 165C show each a sensor system 16500 in a schematic representation in accordance with various embodiments.

The sensor system 16500 may include a sensor module 16502. The sensor module 16502 may be configured to provide sensor data. By way of example, the sensor module 16502 may include a sensor 16504 configured to generate a sensor signal (e.g., a plurality of sensor signals). The sensor module 16502 may be configured to convert the (e.g., analog) sensor signal into (e.g., digital) sensor data (e.g., the sensor module 16502 may include an analog-to-digital converter coupled with the sensor).

The sensor module 16502 may be of a predefined sensor type (e.g., may include a sensor 16504 of a predefined type). The sensor module 16502 may be configured as a sensor type selected from a group of sensor types including or consisting of a LIDAR sensor, a RADAR sensor, a Camera sensor, an Ultrasound sensor, and an Inertial Measurement sensor. By way of example, the sensor system 16500 or the sensor module 16502 may be or may be configured as a LIDAR system, e.g. as the LIDAR Sensor System 10, and the sensor 16504 may be or may be configured as the LIDAR sensor 52.

The sensor system 16500 may include one or more further sensor modules 16502*b* (e.g., a plurality of further sensor modules 16502*b*). The one or more further sensor modules 16502*b* may be of a predefined sensor type (e.g., each further sensor module may include a respective sensor 16504*b* of a predefined type). By way of example, at least one further sensor module 16502*b* of the one or more further sensor modules 16502*b* may be of the same sensor type as the sensor module 16502 (e.g., the sensor module 16502 may be a first LIDAR system and at least one further sensor module 16502*b* may be a second LIDAR system). As another example, at least one further sensor module 16502*b* of the one or more further sensor modules 16502*b* may be of a different sensor type with respect to the sensor module 16502.

The sensor system 16500 may include a data compression module 16506. The data compression module 16506 may be configured to compress data (e.g., sensor data). Additionally or alternatively, the data compression module 16506 may be configured to transmit uncompressed or pre-compressed sensor data. Additionally or alternatively, the data compression module 16506 may be configured to transmit and/or de-compress data, as described in further detail below. Illustratively, the data compression module 16506 may include one or more components, e.g. hardware components (e.g., one or more processors), configured to implement data compression (e.g., to execute software instructions providing data compression).

The data compression module 16506 may be configured to compress data with a desired compression rate, e.g. the data compression module 16506 may be configured to implement or execute different compression algorithms (e.g., having different compression rate). By way of example, the data compression module 16506 may be configured to compress data according to a multi-resolution technique or a successive refinement technique. As another example, the data compression module 16506 may be configured to implement at least one lossy compression algorithm (e.g., to use a lossy compression algorithm to compress the sensor data, or a portion of the sensor data), such as an algorithm selected from quantization, rounding, discretization, transform algorithm, estimation-based algorithm, and prediction-based algorithm. As a further example, the data compression module 16506 may be configured to implement at least one lossless compression algorithm (e.g., to use a lossless compression algorithm to compress the sensor data, or a portion of the sensor data), such as an algorithm selected from Run-length Encoding, Variable Length Coding, and Entropy Coding Algorithm.

The sensor system 16500 may be configured to adapt a data processing characteristic associated with the sensor data prior to the sensor data being provided to the data compression module 16506. As an example, the sensor system 16500 may be configured to adapt a resolution and/or a framerate of the sensor data. The sensor system 16500 may be configured to provide the sensor data having the adapted resolution and/or the adapted frame rate to the data compression module 16500, for example for lossless data compression. By way of example, the sensor system 16500 may be configured to determine portions of the field of view (e.g., of the sensor module 16502, e.g. portions of the scene) to be processed with high quality (e.g., high resolution and/or high framerate, and low compression rate).

The data compression module 16506 may be configured to compress at least a (e.g., first) portion of the sensor data provided by the sensor module 16502 to generate compressed sensor data. The compression of a portion of the sensor data provided by the sensor module 16502 may be described, for example, as the data compression module 16506 being configured to receive a (e.g., continuous) stream of sensor data and to compress at least some of the received sensor data. As an example, as illustrated in FIG. 165A, the data compression module 16506 may be configured to receive the (e.g., raw) sensor data from the sensor module 16502. Illustratively, the data compression module 16506 may be communicatively coupled with the sensor module 16502 (e.g., with the sensor 16504 or with the analog-to-digital converter).

The sensor system 16500 may include a memory 16508 (illustratively, an intermediate data storage memory). The memory 16508 may store at least a (e.g., second) portion of the sensor data not included in the compressed sensor data (e.g., may store uncompressed sensor data not included in the compressed sensor data, e.g. a portion of uncompressed sensor data may be stored in the memory 16508 and another portion of uncompressed sensor data may be provided for further processing). Additionally or alternatively, the memory 16508 may store at least a portion of the compressed sensor data (illustratively, a portion of the compressed sensor data may be stored in the memory 16508 and another portion of the compressed sensor data may be provided for further processing).

The memory 16508 may be or may include a volatile (illustratively, transient) memory. Alternatively, the memory 16508 may be or may include a non-volatile (illustratively, non-transient) memory. The storage capacity of the memory 16508 may be selected in accordance with desired operation parameters (e.g., speed of operation, storage time, and the like). By way of example, the memory 16508 may have a storage capacity in the range from about 1 MB to about 10 GB, for example from about 100 MB to about 1 GB. As an example, the memory may be a ring memory. The ring memory may have, for example, a storage capacity of at least 10 MB, for example 1 GB.

The sensor system 16500 may be configured to associate an identifier with (e.g., assign an identifier to) the uncompressed and/or compressed sensor data and with the portion of sensor data that is not included in the uncompressed and/or compressed sensor data and that is stored in the memory 16508. Illustratively, the sensor system 16500 may be configured to associate an identifier with the provided uncompressed and/or compressed sensor data (e.g., provided to one or more processors of the sensor system), and to associate an identifier with the portion of sensor data that is not included in the provided uncompressed and/or compressed sensor data and that is stored in the memory 16508. The identifier may be or include, for example, a time stamp. The identifier may be or include, for example, an identifier associated with the sensor module 16502 (e.g., an identification code). Illustratively, the identifier may provide identification information for identifying the sensor data stored in the memory 16508 (and for retrieving the sensor data from the memory 16508).

The sensor system 16500 may include a bidirectional communication interface 16510. The bidirectional communication interface 16510 may be configured to provide (e.g., to transmit) uncompressed sensor data and/or compressed sensor data (e.g., at least a portion of the uncompressed and/or compressed sensor data), e.g. the uncompressed sensor data and/or the compressed sensor data associated with the sensor module 16502. The bidirectional communication interface 16510 may be configured to receive the uncompressed and/or compressed sensor data from the data compression module 16506 (e.g., the bidirectional communication interface 16510 may be communicatively coupled with the data communication module 16506). The bidirectional communication interface 16510 may be configured to transmit the uncompressed and/or compressed sensor data to a processing side of the sensor system 16500 (e.g., to one or more processors, as described in further detail below).

The bidirectional communication interface 16510 may be configured to provide the identifier associated with the uncompressed and/or compressed data. The bidirectional communication interface 16510 may be configured to provide the identifier associated with the sensor data stored in the memory 16508. Illustratively, the bidirectional communication interface 16510 may be configured to transmit the identifying information to be used for requesting and retrieving additional sensor data (e.g., compressed or uncompressed).

The bidirectional communication interface 16510 may be configured to receive a request to further provide at least a part of the sensor data which is not included in the (e.g., provided) uncompressed and/or compressed sensor data and which is stored in the memory 16508. Illustratively, the bidirectional communication interface 16510 may be configured to receive a request to further provide at least a part of the sensor data which is not included in the uncompressed and/or compressed sensor data provided to the one or more processors, and which is stored in the memory 16508. The bidirectional communication interface 16510 may be configured to receive such request from the processing side of the sensor system 16500 (e.g., from one or more processors, as described in further detail below). Illustratively, the bidirectional communication interface 16510 may be configured to provide the received request (e.g., to generate and provide a corresponding control signal) to the data compression module 16506 (or to the memory 16508) to provide additional (e.g., compressed and/or uncompressed) sensor data. The bidirectional communication interface 16510 may be configured to receive the request and the identifier (e.g., associated with the sensor data to be retrieved, e.g. associated with the uncompressed and/or compressed sensor data).

The bidirectional communication interface 16510 may include at least one transmitter 16510*t* and at least one receiver 16510*r* (e.g., on the sensor side, e.g. associated with the provision of sensor data from the sensor module 16502). By way of example, the bidirectional communication interface 16510 may include a first sender and receiver module (e.g., including a first transmitter and a first receiver) associated with the sensor module 16502 (e.g., associated with providing sensor data and receiving the request). The bidirectional communication interface 16510 may include a second sender and receiver module (e.g., a vehicle sender and receiver module, e.g. including a second transmitter and a second receiver) associated with the processing side (e.g., with receiving sensor data and transmitting the request, e.g. with the one or more processors).

The data compression module 16506, the memory 16508, and the bidirectional communication interface 16510 (e.g., a part of the bidirectional communication interface 16510, e.g. the first sender and receiver module) may be associated with or assigned to the sensor module 16502. By way of example the data compression module 16506, the memory 16508, and the bidirectional communication interface 16510 (e.g. the first sender and receiver module) may be included or be part of the sensor module 16502. Illustratively, the sensor module 16502 may be described as a system configured to carry out the operations described herein in relation to the data compression module 16506, the memory 16508, and (at least in part) the bidirectional communication interface 16510. Each of the one or more further sensor modules 16502*b* may be associated with (e.g., include) a respective data compression module, a respective memory, and a respective bidirectional communication interface (e.g., a respective sender and receiver module).

Alternatively, the data compression module 16506, the memory 16508, and the bidirectional communication interface 16510 may be associated with or assigned to more than one sensor module, e.g. may be communicatively coupled with more than one sensor module (e.g., with the sensor module 16502 and at least one further sensor module 16502*b*).

The sensor system 16500 may include a memory controller 16518. The memory controller 16518 may be configured to control the memory 16508 (e.g., to control a write operation of the memory 16508, such as an erase operation and/or a programming operation). The memory controller 16518 may be configured to delete a portion of the memory 16508 in accordance with an instruction received via the bidirectional communication interface 16510 (e.g., an instruction provided from the processing side of the sensor system 16500, e.g. from the one or more processors described in further detail below). Illustratively, the instruction may indicate that the sensor data stored in the portion of the memory 16508 to be deleted are no longer needed for data processing.

The sensor system 16500 may include one or more processors 16512. The one or more processors 16512 may be configured to process data, e.g. sensor data (e.g., compressed and/or uncompressed sensor data). The one or more processors 16512 may be configured to process the uncompressed and/or compressed sensor data provided by the sensor module 16502 (illustratively, uncompressed and/or compressed sensor data provided or generated from sensor data provided by the sensor module 16502 and received by the one or more processors 16512). Illustratively, the one or more processors 16512 may be configured to receive the uncompressed and/or compressed sensor data via the bidirectional communication interface 16510 (e.g., via the vehicle sender and receiver module). The one or more processors 16512 may be configured to process the received uncompressed and/or compressed sensor data.

The one or more processors 16512 may be further configured to process sensor data provided by the one or more further sensor modules 16502*b* (e.g., by at least one further sensor module 16502*b*). By way of example, the one or more processors 16512 may be configured to receive the sensor data (e.g., raw, compressed, or pre-compressed) from the one or more further sensor modules 16502*b* via a respective bidirectional communication interface. Illustratively, the one or more processors 16512 may be associated with a sensor fusion box (e.g., of the vehicle). By way of example, the one or more processors 16512 may be included in a sensor fusion box (e.g., of a vehicle).

The one or more processors 16512 may be configured to implement different types of data processing (e.g., using the uncompressed and/or compressed sensor data and, optionally, further sensor data), e.g. to evaluate a scene (e.g., the field of view). By way of example, the one or more processors 16512 may be configured to implement one or more object recognition processes. As another example, the one or more processors 16512 may be configured to implement one or more object classification processes (e.g., based on the result of the object recognition process). As a further example, the one or more processors 16512 may be configured to implement one or more object tracking processes.

The one or more processors 16512 may be configured to determine whether some additional data related to the received sensor data (e.g., uncompressed and/or compressed sensor data) should be requested (e.g., from the sensor module 16502, e.g. from the memory 16508). As an example, the one or more processors 16512 may be configured to determine whether additional data related to the compressed sensor data should be requested based on the compressed sensor data and the sensor data provided by a (e.g., at least one) further sensor module 16502*b*. Additionally or alternatively, the one or more processors 16512 may be configured to determine whether additional data related to the uncompressed sensor data should be requested based on the uncompressed sensor data and the sensor data provided by a further sensor module 16502*b*. Illustratively, the one or more processors 16512 may be configured to evaluate whether data processing using the received uncompressed and/or compressed sensor data provides results satisfying one or more predefined acceptance criteria (e.g., a predefined level of accuracy, or a predefined level of agreement with other sensor data). The one or more processors 16512 may be configured to determine that some additional data related to the received data, e.g. related to the uncompressed and/or to the compressed sensor data, should be requested in case the acceptance criteria are not satisfied.

As a further example, the one or more processors 16512 may be configured to determine whether additional data related to the compressed sensor data should be requested based on the compressed sensor data and data provided by one or more further communication interfaces 16514 of the sensor system 16500 (e.g., one or more further information-providing interfaces). Additionally or alternatively, the one or more processors 16512 may be configured to determine whether additional data related to the uncompressed sensor data should be requested based on the uncompressed sensor data and data provided by one or more further communication interfaces 16514 of the sensor system 16500. The sensor system 16500 (e.g., the further communication interfaces 16514) may include at least one Global Positioning System interface 16514*a* configured to receive Global Positioning Information. The sensor system 16500 may include at least one Vehicle-to-Vehicle communication interface 16514*b*. The sensor system 16500 may include at least one Vehicle-to-Infrastructure (e.g., Vehicle-to-Environment) communication interface 16514*c*. The further communication interfaces 16514 may be configured to provide further data to the one or more processors 16512.

The one or more processors 16512 may be configured to determine that additional data related to the compressed sensor data should be requested in case the one or more processors 16512 determine an inconsistency or ambiguity in the results of data processing performed (at least in part) with the compressed sensor data. Additionally or alternatively, the or more processors 16512 may be configured to determine that additional data related to the uncompressed sensor data should be requested in case the one or more processors 16512 determine an inconsistency or ambiguity in the results of data processing performed (at least in part) with the uncompressed sensor data.

By way of example, the one or more processors 16512 may be configured to determine that some additional data related to the compressed sensor data should be requested, in case an inconsistency or ambiguity is present in the results of at least one object recognition process carried out at least in part with the compressed sensor data. As another example, the one or more processors 16512 may be configured to determine that some additional data related to the compressed sensor data should be requested, in case an inconsistency is present in the results of at least one object classification process carried out at least in part with the compressed sensor data. As a further example, the one or more processors 16512 may be configured to determine that some additional data related to the compressed sensor data should be requested, in case an inconsistency is present in the results of at least one object tracking process carried out at least in part with the compressed sensor data.

By way of example, additionally or alternatively, the one or more processors 16512 may be configured to determine that some additional data related to the uncompressed sensor data should be requested, in case an inconsistency or ambiguity is present in the results of at least one object recognition process carried out at least in part with the uncompressed sensor data. As another example, the one or more processors 16512 may be configured to determine that some additional data related to the uncompressed sensor data should be requested, in case an inconsistency is present in the results of at least one object classification process carried out at least in part with the uncompressed sensor data. As a further example, the one or more processors 16512 may be configured to determine that some additional data related to the uncompressed sensor data should be requested, in case an inconsistency is present in the results of at least one object tracking process carried out at least in part with the uncompressed sensor data.

The one or more processors 16512 may be configured to generate a completion signal (e.g., representing or indicating a successful completion of the current data processing process), in case it has been determined that additional data related to the uncompressed and/or compressed sensor data are not to be requested (e.g., are not needed). The one or more processors 16512 may be configured to provide an instruction for the memory controller 16518 to delete the portion of the memory 16508 associated with the sensor data (e.g., related to the uncompressed and/or compressed sensor data), in case it has been determined that additional data related to the sensor data (compressed and/or uncompressed) are not to be requested.

The one or more processors 16512 may be configured to generate the request to further provide at least a part of the sensor data not included in the compressed sensor data (e.g., in the received compressed sensor data), in case it has been determined that some additional data related to the compressed sensor data should be requested (e.g., from the sensor module 16502, e.g. from the memory 16508). Additionally or alternatively, the one or more processors 16512 may be configured to generate the request to further provide at least a part of the sensor data not included in the uncompressed sensor data (e.g., in the received uncompressed sensor data), in case it has been determined that some additional data related to the uncompressed sensor data should be requested. Illustratively, the one or more processors 16512 may be configured to generate the request to further provide at least a part of the sensor data provided by the sensor module 16502, which sensor data have not yet been received by the one or more processors 16512. The one or more processors 16512 may be configured to transmit the request to the sensor module 16502 (illustratively, to the data compression module 16506 and/or to the memory 16508 associated with the sensor module 16502). Illustratively, the one or more processors 16512 may be configured to transmit the request via the bidirectional communication interface 16510 (e.g., via the vehicle sender and receiver module). The one or more processors 16512 may be configured to transmit an identifier associated with the additional sensor data. The additional data may be raw data (e.g., raw sensor data) and/or pre-compressed data (e.g., pre-compressed sensor data, e.g. compressed sensor data). The type of additional data may be related to the type of data stored in the memory 16508, as described in further detail below.

As an example, as illustrated in FIG. 165A, the data compression module 16506 may be configured to provide to the memory 16508 the portion of sensor data not included in the compressed sensor data (e.g., to transmit to the memory a portion of the received sensor data, e.g. raw sensor data or sensor data compressed but not included in the compressed sensor data provided for further processing). Illustratively, the memory 16508 may store a portion of the raw (e.g., not compressed) sensor data (and/or a portion of compressed sensor data not included in the compressed sensor data).

As another example, as illustrated in FIG. 165B, the memory 16508 may store the sensor data. Illustratively, the memory 16508 may be configured to receive the (e.g., raw) sensor data from the sensor module 16502. Further illustratively, the memory 16508 may be communicatively coupled with the sensor module 16502 (e.g., with the sensor 16504 or with the analog-to-digital converter).

A portion of the sensor data stored in the memory 16508 may be provided to the data compression module 16506 to be compressed. The data compression module 16506 may be configured to compress the (e.g., raw) sensor data stored in the memory 16508 with different compression rates (e.g., with increasingly lower compression rate each time a request related to the compressed sensor data is received). Illustratively, the data compression module 16506 may be configured to generate first compressed sensor data using a first compression rate and to generate (illustratively, upon receipt of the request) second compressed sensor data using a second compression rate (e.g., lower than the first compression rate).

As a further example, as illustrated in FIG. 165C, the memory 16508 may store pre-compressed sensor data. The sensor system 16500 may include a further data compression module 16516. The further data compression module 16516 may be configured to compress the sensor data provided by the sensor module 16502 to generate pre-compressed sensor data (e.g., with a high-definition data compression, e.g. a lossless data compression). The memory 16508 may store the pre-compressed sensor data. Illustratively, the further data compression module 16516 may be communicatively coupled with the sensor module 16502 (e.g., it may be included in the sensor module 16502, e.g. it may be communicatively coupled with the sensor 16504) and with the memory 16508.

The data compression module 16502 may be configured to de-compress at least a portion of the pre-compressed sensor data to generate (e.g., to provide) de-compressed sensor data (e.g., a first portion of the pre-compressed sensor data). The data compression module 16502 may be configured to provide the de-compressed sensor data (e.g., the bidirectional communication interface 16510 may be configured to provide the de-compressed sensor data, e.g. to transmit the de-compressed sensor data to the one or more processors 16512). The data compression module 16506 may be configured to receive a request to further provide at least a part of the pre-compressed sensor data which is not included in the (e.g., provided) de-compressed sensor data and which is stored in the memory 16508. Illustratively, the additional data requested by the one or more processors 16512 may be another (e.g., second) portion of the pre-compressed sensor data.

Additionally or alternatively, the data compression module 16506 may be configured to re-compress the pre-compressed sensor data (e.g., at least a portion of the pre-compressed sensor data) with a higher or lower data compression rate (e.g., with a data compression rate different compared to the further data compression module 16516) to generate re-compressed sensor data. The data compression module may be configured to provide the re-compressed sensor data (e.g., the bidirectional communication interface 16510 may be configured to provide the re-compressed sensor data, e.g. to transmit the re-compressed sensor data to the one or more processors 16512). The data compression module 16506 may be configured to receive a request to further provide at least a part of the pre-compressed sensor data which is not included in the (e.g., provided) re-compressed sensor data and which is stored in the memory 16508.

FIG. 166A to FIG. 166D show each a sensor system 16600 in a schematic representation in accordance with various embodiments.

The sensor system 16600 may be an exemplary implementation of the sensor system 16500, e.g. an exemplary realization and configuration of the components of the sensor system 16500. It is understood that other configurations and components may be provided.

The sensor system 16600 may include a sensor module 16602 configured to provide sensor data (e.g., configured to transmit sensor data, e.g. compressed sensor data). The sensor module 16602 may include a sensor 16604 configured to provide or generate a sensor signal (e.g., an analog sensor signal). The sensor module 16602 may be configured as the sensor module 16502 described above. The sensor 16604 may be configured as the sensor 16504 described above. The sensor module 16602 may be configured to provide sensor data from the sensor signal (e.g., from the plurality of sensor signals). By way of example, the sensor module 16602 may include an analog-to-digital converter to convert the analog sensor signal (e.g., a current, such as a photo current) into digital or digitized sensor data.

The sensor system 16600 may include one or more further sensor modules 16602*b*. The one or more further sensor modules 16602*b* may be configured as the one or more further sensor modules 16502*b* described above.

The sensor system 16600 may include a compression module 16606. The compression module 16606 may be configured as the data compression module 16506 described above (e.g., the compression module 16606 may be configured to generate compressed sensor data). In the exemplary configuration illustrated in FIG. 166A to FIG. 166D, the sensor module 16602 may include the compression module 16606. The operation of the compression module 16606 will be described in further detail below.

The sensor system 16600 may include a memory 16608. The memory 16608 may be configured as the memory 16508 described above (e.g., the memory 16608 may store data, e.g. sensor data (e.g., raw, compressed or pre-compressed)). In the exemplary configuration illustrated in FIG. 166A to FIG. 166D, the sensor module 16602 may include the memory 16608. The operation of the memory 16608 will be described in further detail below.

The sensor system 16600 may include a bidirectional communication interface 16610. The bidirectional communication interface 16610 may be configured as the bidirectional communication interface 16510 described above. The bidirectional communication interface 16610 may include a sender and receiver module 16610*s* associated with the sensor module 16602 (e.g., included in the sensor module 16602, in the exemplary configuration illustrated in FIG. 166A to FIG. 166D). The bidirectional communication interface 16610 may include a vehicle sender and receiver module 16610*v*.

The sensor system 16600 may include a fusion box 16612, e.g. a sensor fusion box. The fusion box 16612 may be configured as the one or more processors 16512 described above. The fusion box 16612 may be configured to receive data via the vehicle sender and receiver module 16610*v* (and to transmit data and/or instructions via the vehicle sender and receiver module 16610*v*). The fusion box 16612 may be configured to receive data from each sensor module (e.g., from the sensor module 16602 and each further sensor module 16602*b*).

The sensor system 16600 may include one or more (e.g., further) communication interfaces 16614, such as at least one Global Positioning System interface, and/or at least one Vehicle-to-Vehicle communication interface, and/or at least one Vehicle-to-Infrastructure communication interface. The one or more communication interfaces 16614 may be configured as the one or more further communication interfaces 16514 described above. The fusion box 16612 may be configured to receive data from the one or more communication interfaces 16614 (e.g., via the vehicle sender and receiver module 16610*v*).

Figure 166A:
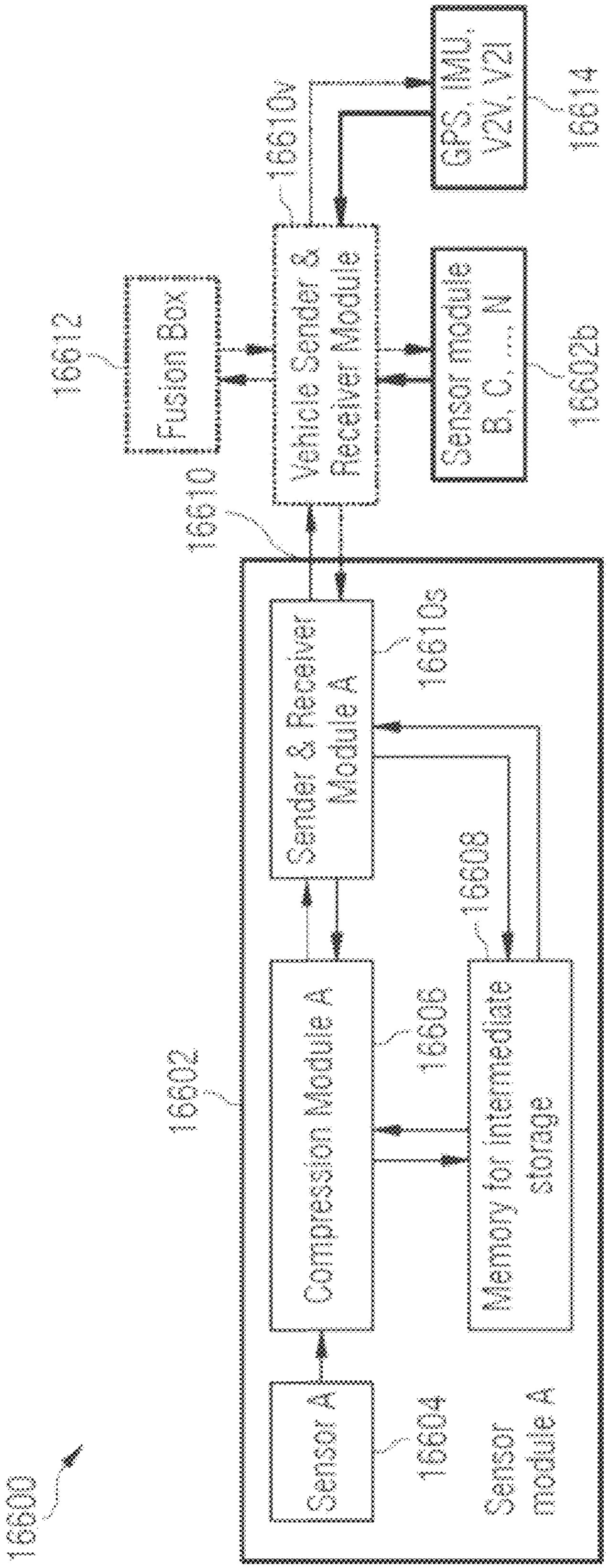

As illustrated in FIG. 166A, the compression module 16606 may be configured to compress the sensor data, e.g. at least a portion of the sensor data, to generate compressed sensor data. The compression module 16606 may be configured to provide another portion of the sensor data to the memory 16608. Illustratively, the compression module 16606 may be configured to receive the sensor data from the sensor 16604 (e.g., digitized sensor data from the analog-to-digital converter).

Figure 166B:
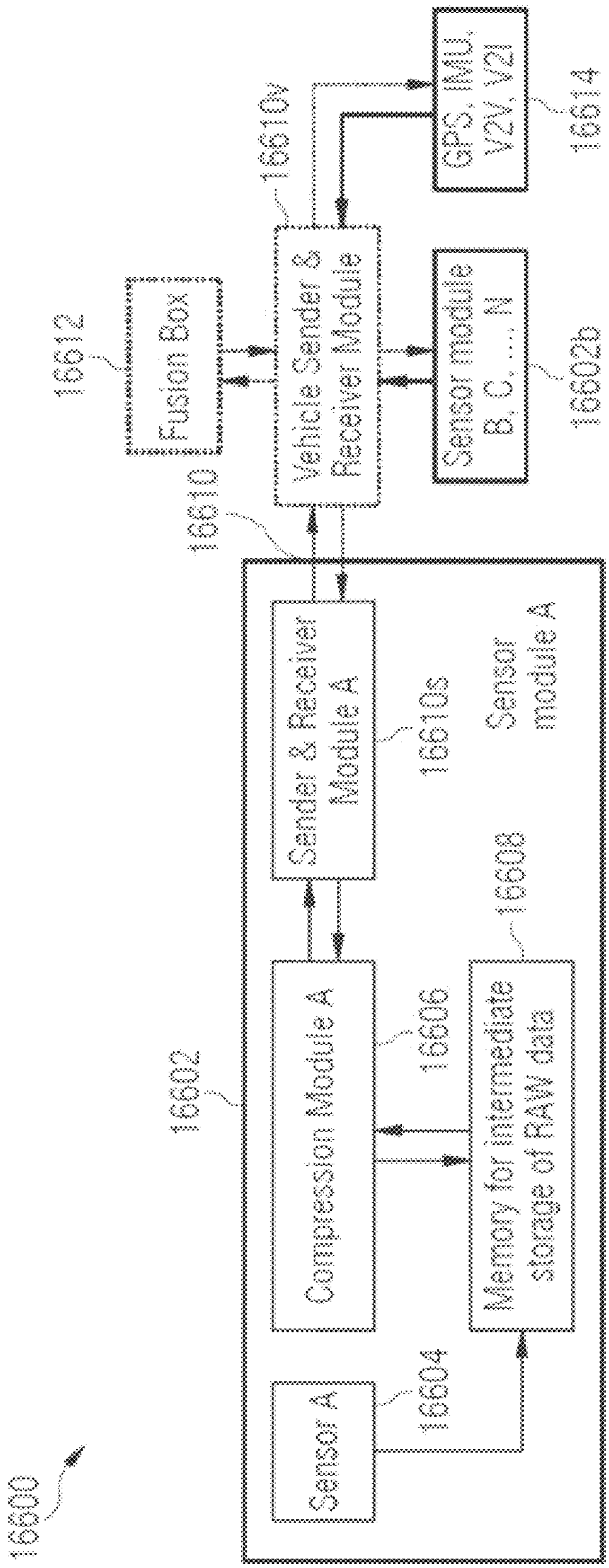

As illustrated in FIG. 166B, the compression module 16606 is may be configured to compress (e.g., raw) sensor data stored in the memory 16608. Illustratively, the memory 16608 may store the sensor data (e.g., raw sensor data). The memory 16608 may be a memory for intermediate storage of raw data. The compression module 16606 be configured to receive the sensor data from the memory 16608 (e.g., may be communicatively coupled with the memory 16608 and not with the sensor 16604). The compression module 16606 may be configured to compress the (e.g., raw) sensor data stored in the memory 16608 with different compression rates (e.g., with increasingly lower compression rate each time a request related to the compressed sensor data is received).

Figure 166C:
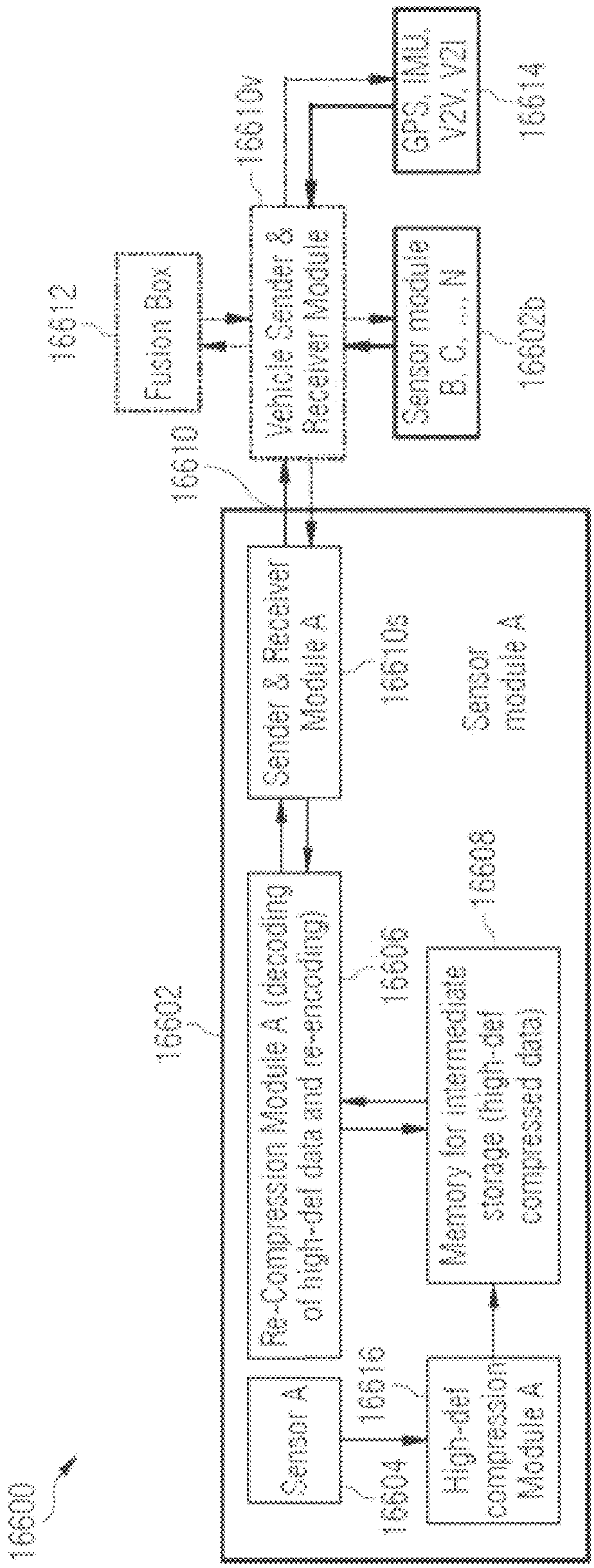

As illustrated in FIG. 166C, the sensor system 16600 (e.g., the sensor module 16602) may include a further compression module 16616, e.g. a high-definition compression module. The further compression module 16616 may be configured as the further data compression module 16516 described above. In this configuration, the memory 16608 may store pre-compressed sensor data (e.g., sensor data pre-compressed by the further compression module 16616). The memory 16608 may be a memory for intermediate storage of high-definition compressed data.

The compression module 16606 may be configured to de-compress at least a portion of the pre-compressed sensor data. The compression module 16606 may be configured to compress the de-compressed sensor data, e.g. with a lower compression rate with respect to the further compression module 16616. Illustratively, the compression module 16606 may be configured to decode and re-encode at least a portion of the pre-compressed (e.g., high-definition) sensor data stored in the memory 16608. The compression module 16606 may be a re-compression module.

Figure 166D:
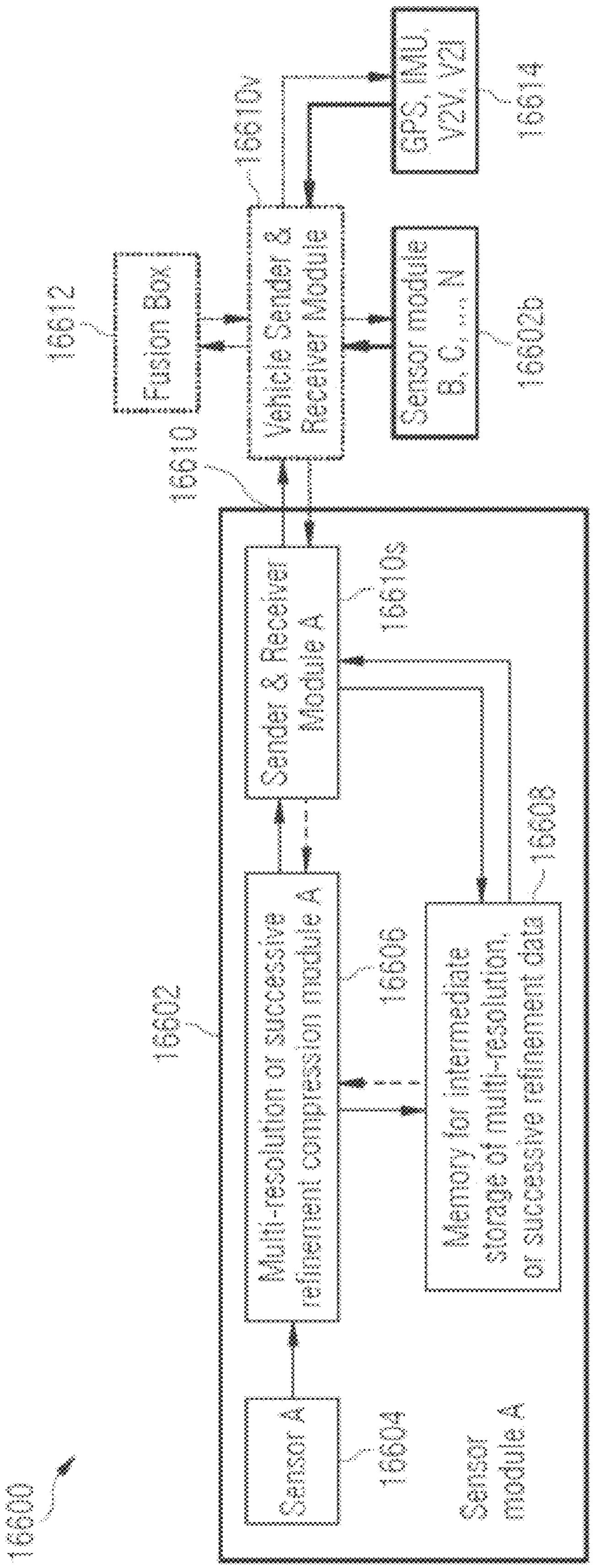

As illustrated in FIG. 166D, the compression module 16606 may be configured to implement a multi-resolution technique and/or a successive refinement technique. The compression module 16606 may be a multi-resolution or successive refinement compression module.

Illustratively, the compression module 16606 may be configured to provide a plurality of compressed sensor data (e.g., in a multi-resolution technique, e.g. compressed sensor data with different quality levels). The compression module 16606 may be configured to provide intermediate compressed sensor data. Additionally or alternatively, the compression module 16606 may be configured to provide compression of sensor data in subsequent layers with increasing data quality.

The memory 16608 may store the plurality of compressed sensor data. Additionally or alternatively, the memory 16608 may store the intermediate compressed sensor data. Additionally or alternatively, the memory 16608 may store the subsequent layers of sensor data. Illustratively, the memory 16608 may be a memory for intermediate storage of multi-resolution, or successive refinement data.

In the following, various aspects of this disclosure will be illustrated:

Example 1ag is a Sensor System. The Sensor System may include a sensor module configured to provide sensor data. The Sensor System may include a data compression module configured to compress at least a portion of the sensor data provided by the sensor module to generate compressed sensor data. The Sensor System may include a memory to store at least a portion of the compressed sensor data and/or to store at least a portion of the sensor data not included in the compressed sensor data. The Sensor System may include a bidirectional communication interface configured to provide the compressed sensor data and/or uncompressed sensor data; and receive a request to further provide at least a part of the compressed sensor data which is stored in the memory and/or to further provide at least a part of the sensor data which is not included in the uncompressed and/or compressed sensor data and which is stored in the memory.

In Example 2ag, the subject-matter of example 1ag can optionally include that the bidirectional communication interface includes at least one transmitter and at least one receiver.

In Example 3ag, the subject-matter of any one of examples 1ag or 2ag can optionally include that the Sensor System is further configured to associate an identifier with the uncompressed and/or compressed sensor data and with the portion of the sensor data which is not included in the uncompressed and/or compressed sensor data and which is stored in the memory. The bidirectional communication interface may be configured to further provide the identifier associated with the uncompressed and/or compressed sensor data and/or to receive the request and the identifier.

In Example 4ag, the subject-matter of any one of examples 1ag to 3ag can optionally include that the memory stores the sensor data. The data compression module may be further configured to compress the sensor data stored in the memory with different compression rates to generate first compressed sensor data using a first compression rate and generate second compressed sensor data using a second compression rate. The second compression rate may be lower than the first compression rate.

In Example 5ag, the subject-matter of example 4ag can optionally include that the data compression module is further configured to compress the sensor data stored in the memory using the second compression rate upon receipt of the request.

In Example 6ag, the subject-matter of any one of examples 1ag to 4ag can optionally include a further data compression module configured to compress the sensor data provided by the sensor module to generate pre-compressed sensor data. The memory may store the pre-compressed sensor data. The data compression module may be further configured to decompress at least a portion of the pre-compressed sensor data to generate de-compressed sensor data and/or to re-compress at least a portion of the pre-compressed sensor data with a higher or lower data compression rate to generate re-compressed sensor data. The data compression module may be further configured to provide the de-compressed sensor data and/or the re-compressed sensor data. The data compression module may be further configured to receive a request to further provide at least a part of the pre-compressed sensor data which is not included in the de-compressed or re-compressed sensor data and which is stored in the memory.

In Example 7ag, the subject-matter of any one of examples 1ag to 6ag can optionally include that the data compression module is configured to implement at least one lossy compression algorithm.

In Example 8ag, the subject-matter of example 7ag can optionally include that the at least one lossy compression algorithm includes at least one algorithm selected from: quantization; rounding; discretization; transform algorithm; estimation-based algorithm; and prediction-based algorithm.

In Example 9ag, the subject-matter of any one of examples 1ag to 8ag can optionally include that the data compression module is configured to implement at least one lossless compression algorithm.

In Example 10ag, the subject-matter of example 9ag can optionally include that the Sensor System is configured to adapt a resolution and/or a framerate of the sensor data and to supply the sensor data having the adapted resolution and/or the adapted frame rate to the data compression module for lossless data sensor compression.

In Example 11 ag, the subject-matter of any one of examples 9ag or 10ag can optionally include that the at least one lossless compression algorithm includes at least one algorithm selected from: Run-length Encoding; Variable Length Coding; and Entropy Coding Algorithm.

In Example 12ag, the subject-matter of any one of examples 1ag to 11 ag can optionally include that the sensor module is configured as a sensor type selected from a group of sensor types consisting of: LIDAR sensor; RADAR sensor; Camera sensor; Ultrasound sensor; and Inertial Measurement sensor.

In Example 13ag, the subject-matter of any one of examples 1ag to 12ag can optionally include at least one Global Positioning System interface to receive Global Positioning information.

In Example 14ag, the subject-matter of any one of examples 1ag to 13ag can optionally include at least one Vehicle-to-Vehicle communication interface.

In Example 15ag, the subject-matter of any one of examples 1ag to 14ag can optionally include at least one Vehicle-to-Infrastructure communication interface.

In Example 16ag, the subject-matter of any one of examples 1ag to 15ag can optionally include one or more further sensor modules.

In Example 17ag, the subject-matter of example 16ag can optionally include that at least one further sensor module of the one or more further sensor modules is of the same sensor type as the sensor module.

In Example 18ag, the subject-matter of any one of examples 1ag to 17ag can optionally include one or more processors configured to process uncompressed and/or compressed sensor data provided by the sensor module; determine whether some additional data related to the uncompressed and/or compressed sensor data should be requested from the sensor module; and generate the request to further provide at least a part of the sensor data not included in the uncompressed and/or compressed sensor data and transmit the same to the sensor module, in case it has been determined that some additional data related to the uncompressed and/or compressed sensor data should be requested from the sensor module.

In Example 19ag, the subject-matter of any one of examples 1 to 18ag can optionally include one or more processors configured to process uncompressed and/or compressed sensor data provided by the sensor module as well as sensor data provided by at least one further sensor module; determine, based on the uncompressed and/or compressed sensor data and the sensor data provided by the at least one further sensor module, whether some additional data related to the uncompressed and/or compressed sensor data should be requested from the sensor module; and generate the request to further provide at least a part of the sensor data not included in the uncompressed and/or compressed sensor data and transmit the same to the sensor module, in case it has been determined that some additional data related to the uncompressed and/or compressed sensor data should be requested from the sensor module.

In Example 20ag, the subject-matter of any one of examples 18ag or 19ag can optionally include that the additional data are raw sensor data or pre-compressed sensor data, or sensor data compressed with a lower data compression rate.

In Example 21ag, the subject-matter of any one of examples 18ag to 20ag can optionally include that the one or more processors are further configured to implement one or more object recognition processes; and/or implement one or more object classification processes; and/or implement one or more object tracking processes.

In Example 22ag, the subject-matter of example 21ag can optionally include that the one or more processors are further configured to: determine whether an inconsistency or ambiguity is present in the result of at least one object recognition process carried out at least in part on the uncompressed and/or compressed sensor data and/or in the in the result of at least one object classification process carried out at least in part on the uncompressed and/or compressed sensor data and/or in the result of at least one object tracking process carried out at least in part on the uncompressed and/or compressed sensor data; and to determine that some additional data related to the uncompressed and/or compressed sensor data should be requested from the sensor module, in case the inconsistency or ambiguity is determined to be present.

In Example 23ag, the subject-matter of any one of examples 18ag to 22ag can optionally include that the one or more processors are associated with a sensor fusion box.

In Example 24ag, the subject-matter of any one of examples 1ag to 23ag can optionally include that the memory is a ring memory.

In Example 25ag, the subject-matter of example 24ag can optionally include that the ring memory has a storage capacity of at least 10 MB.

In Example 26ag, the subject-matter of any one of examples 1ag to 25ag can optionally include that the memory includes or is a non-volatile memory.

In Example 27ag, the subject-matter of any one of examples 1ag to 25ag can optionally include that the memory includes or is a volatile memory.

In Example 28ag, the subject-matter of any one of examples 1ag to 27ag can optionally include a memory controller configured to delete a portion of the memory in accordance with an instruction received via the bidirectional communication interface.

Example 29ag is a vehicle, including one or more Sensor is Systems according to any one of examples 1ag to 28ag.

Example 30ag is a method of operating a Sensor System. The method may include a sensor module providing sensor data. The method may include compressing at least a portion of the sensor data provided by the sensor module to generate compressed sensor data. The method may include a memory storing at least a portion of the compressed sensor data and/or at least a portion of the sensor data not included in the compressed sensor data. The method may include providing the compressed sensor data and/or uncompressed sensor data. The method may include receiving a request to further provide at least a part of the compressed sensor data which is stored in the memory and/or to further provide at least a part of the sensor data which is not included in the uncompressed and/or compressed sensor data and which is stored in the memory.

In Example 31ag, the subject-matter of example 30ag can optionally further include associating an identifier with the uncompressed and/or compressed sensor data and with the portion of the sensor data which is not included in the uncompressed and/or compressed sensor data and which is stored in the memory. The method may further include providing the identifier associated with the uncompressed and/or compressed sensor data and/or receiving the request and the identifier.

In Example 32ag, the subject-matter of any one of examples 30ag or 31ag can optionally include that the memory stores the sensor data. The data compressing may include compressing the sensor data stored in the memory with different compression rates to generate first compressed sensor data using a first compression rate, and to generate second compressed sensor data using a second compression rate. The second compression rate may be lower than the first compression rate.

In Example 33ag, the subject-matter of example 32ag can optionally include that the data compressing further includes compressing the sensor data stored in the memory using the second compression rate upon receipt of the request.

In Example 34ag, the subject-matter of any one of examples 30ag to 33ag can optionally further include further data compressing the sensor data provided by the sensor module to generate pre-compressed sensor data. The memory may store the pre-compressed sensor data. The method may further include data de-compressing at least a portion of the pre-compressed sensor data to generate de-compressed sensor data and/or re-compressing at least a portion of the pre-compressed sensor data with a higher or lower data compression rate to generate re-compressed sensor data. The method may further include providing the de-compressed or re-compressed sensor data to a data compression module. The method may further include receiving a request to further provide at least a part of the pre-compressed sensor data which is not included in the de-compressed or re-compressed sensor data and which is stored in the memory.

In Example 35ag, the subject-matter of any one of examples 30ag to 34ag can optionally include that the data compressing includes performing at least one lossy compression algorithm.

In Example 36ag, the subject-matter of example 35ag can optionally include that the at least one lossy compression algorithm includes at least one algorithm selected from: quantization; rounding; discretization; transform algorithm; estimation-based algorithm; and prediction-based algorithm.

In Example 37ag, the subject-matter of any one of examples 30ag to 36ag can optionally include that the data compressing includes performing at least one lossless compression algorithm.

In Example 38ag, the subject-matter of example 37ag can is optionally further include adapting a resolution and/or a framerate of the sensor data and supplying the sensor data having the adapted resolution and/or the adapted framerate for lossless data sensor compression.

In Example 39ag, the subject-matter of any one of examples 37ag or 38ag can optionally include that the at least one lossless compression algorithm includes at least one algorithm selected from: Run-length Encoding; Variable Length Coding; and Entropy Coding Algorithm.

In Example 40ag, the subject-matter of any one of examples 30ag to 39ag can optionally include that the sensor module is configured as a sensor type selected from a group of sensor types consisting of: LIDAR sensor; RADAR sensor; Camera sensor; Ultrasound sensor; and Inertial Measurement sensor.

In Example 41ag, the subject-matter of any one of examples 30ag to 40ag can optionally further include receiving Global Positioning information.

In Example 42ag, the subject-matter of any one of examples 30ag to 41ag can optionally include that the Sensor System further includes one or more further sensor modules.

In Example 43ag, the subject-matter of example 42ag can optionally include that at least one further sensor module of the one or more further sensor modules is of the same sensor type as the sensor module.

In Example 44ag, the subject-matter of any one of examples 30ag to 43ag can optionally further include processing uncompressed and/or compressed sensor data provided by the sensor module; determining whether some additional data related to the uncompressed and/or compressed sensor data should be requested from the sensor module; and generating the request to further provide at least a part of the sensor data not included in the uncompressed and/or compressed sensor data and transmitting the same to the sensor module, in case it has been determined that some additional data related to the uncompressed and/or compressed sensor data should be requested from the sensor module.

In Example 45ag, the subject-matter of any one of examples 30ag to 44ag can optionally further include processing uncompressed and/or compressed sensor data provided by the sensor module as well as sensor data provided by at least one further sensor module; determining, based on the uncompressed and/or compressed sensor data and the sensor data provided by the at least one further sensor module, whether some additional data related to the uncompressed and/or compressed sensor data should be requested from the sensor module; and generating the request to further provide at least a part of the sensor data not included in the uncompressed and/or compressed sensor data and transmitting the same to the sensor module, in case it has been determined that some additional data related to the uncompressed and/or compressed sensor data should be requested from the sensor module.

In Example 46ag, the subject-matter of any one of examples 44ag or 45ag can optionally include that the additional data are raw sensor data or pre-compressed sensor data, or sensor data compressed with a lower data compression rate.

In Example 47ag, the subject-matter of any one of examples 44ag to 46ag can optionally further include implementing one or more object recognition processes; and/or implementing one or more object classification processes; and/or implementing one or more object tracking processes.

In Example 48ag, the subject-matter of example 47ag can optionally further include determining whether an inconsistency or ambiguity is present in the result of at least one object recognition process carried out at least in part on the uncompressed and/or compressed sensor data and/or in the in the result of at least one object classification process carried out at least in part on the uncompressed and/or compressed sensor data and/or in the result of at least one object tracking process carried out at least in part on the uncompressed and/or compressed sensor data; and determining that some additional data related to the uncompressed and/or compressed sensor data should be requested from the sensor module, in case the inconsistency or ambiguity is determined to be present.

In Example 49ag, the subject-matter of any one of examples 30ag to 48ag can optionally include that the memory is a ring memory.

In Example 50ag, the subject-matter of example 49ag can optionally include that the ring memory has a storage capacity of at least 10 MB.

In Example 51ag, the subject-matter of any one of examples 30ag to 50ag can optionally include that the memory includes or is a non-volatile memory.

In Example 52ag, the subject-matter of any one of examples 30ag to 50ag can optionally include that the memory includes or is a volatile memory.

In Example 53ag, the subject-matter of any one of examples 30ag to 52ag can optionally include controlling the memory to delete a portion of the memory in accordance with an instruction received via a bidirectional communication interface.

Example 54ag is a computer program product, including a plurality of program instructions that may be embodied in non-transitory computer readable medium, which when executed by a computer program device of a Sensor System according to any one of examples 1ag to 28ag cause the Sensor System to execute the method according to any one of the examples 30ag to 53ag.

Example 55ag is a data storage device with a computer program that may be embodied in non-transitory computer readable medium, adapted to execute at least one of a method for Sensor System according to any one of the above method examples, a Sensor System according to any one of the above Sensor System examples.

A partially or fully automated vehicle may include and employ a multitude of sensor systems and devices (e.g., navigation and communication devices, as well as data processing and storage devices) to perceive and interpret the surrounding environment in great detail, with high accuracy, and in a timely manner. Sensor systems may include, for example, sensors such as a LIDAR sensor, a RADAR sensor, a Camera sensor, an Ultrasound sensor and/or an Inertial Measurement sensor (IMU). Navigation and communication systems may include, for example, a Global Positioning System (GNSS/GPS), a Vehicle-to-Vehicle (V2V) communication system, and/or a Vehicle-to-Infrastructure (V2I) communication system.

A vehicle capable of partly autonomous driving, (e.g., a vehicle capable of operating at an SAE level 3 or higher), may employ more than one of each sensor type. By way of example, a vehicle may include 4 LIDAR systems, 2 RADAR systems, 10 Camera systems, and 6 Ultrasound systems. Such vehicle may generate a data stream up to about 40 Gbit/s of data (or about 19 Tbit/h). Taking into account typical (e.g., average) driving times to per day and year, a data stream of about 300 TB per year (or even higher) may be estimated.

A great amount of computer processing power may be required to collect, process, and store such data. In addition, sensor data may be encoded and transmitted to a superordinate entity, for example a sensor is fusion box, in order to determine (e.g., calculate) a consolidated and consistent scene understanding which may be used for taking real-time decisions, even in complex traffic situations. Safe and secure sensing and decision making may further employ back-up and fallback solutions, thus increasing redundancy (and complexity) of equipment and processes.

In the field of signal and data processing, various concepts and algorithms may be employed and implemented for data compression. From a general point of view, lossless and lossy data compression algorithms may be distinguished. In case of lossless data compression, the underlying algorithm may try to identify redundant information which may then be extracted from the data stream without data loss. In case of lossy data compression, the underlying algorithm may try to identify non-relevant or less-relevant information which may be extracted from the data stream with only minor effects on the later derived results (e.g., results from data analysis, from object recognition calculations, and the like). A lossy data compression algorithm may provide a higher data compression rate compared to a lossless data compression algorithm. Furthermore, the earlier the data compression is executed, the higher the achievable data compression rate may be.

In the context of safety related applications, such as autonomous driving, willfully accepted data loss may be risky. It may prove difficult to foresee which consequences such data loss may have, for example in a specific, complex, and maybe confusing traffic situation. Illustratively, there may be a certain trade-off between the achievable level of data reduction rate and the tolerable level of information accuracy loss. Therefore, the implementation of lossy compression algorithms in applications involving safety critical aspects, such as in the field of autonomously driving vehicles, may present great concerns, since it may not be clear how the optimum trade-off may be assessed. Furthermore, a conventional system may implement a data compression algorithm with rather static settings. Illustratively, a specific data compression algorithm with a predetermined data compression rate and a predetermined level of data loss may be chosen (e.g., a priori) for each sensor or sensor type.

Various embodiments may be related to a method (and a sensor system) for adaptive data compression (also referred to as adaptive data compression method). The adaptive data compression method may provide dynamic adaptation of a data compression characteristic (e.g., of a data compression rate used for compressing sensor data, a type of compression algorithm, a data compression and/or re-compression method, or a level of data loss). The method described herein may provide an open and dynamically re-adjustable trade-off assessment between the theoretically achievable data reduction rate and the tolerable level of information accuracy.

The adaptive data compression method may provide a highly efficient and effective data compression (illustratively, a data compression having a data compression characteristic suitably selected for a current situation), which may be adapted in accordance with dynamically varying factors, such as a current traffic and/or driving situation. Illustratively, the adaptive data compression concept described herein may take levels of complexity and dynamics into account. The method described herein may overcome the conventional fixed and static trade-off assessment provided in a conventional system. The adaptive data compression method may include concepts of sensor prioritization and concepts of event-based vision, as described in further detail below. As an example, only a portion of sensor data, e.g. of a 3D point cloud, may be required from and delivered by a sensor module in an "on-demand" fashion.

The method described herein may provide well-adapted and sophisticated data compression techniques to reduce the amount of data that is processed, stored, and transmitted (e.g., to a sensor fusion box and/or to a vehicle steering control system). The data compression may provide an overall reduction in power consumption. Illustratively, even though data compression may involve power-intensive computations, a reduction in power consumption may be provided by the reduced amount of data to be processed (e.g., encoded, transmitted, decoded, transformed and analyzed, for example in later data fusion and object recognition processes). A reduction in power consumption may be provided, for example, in relation to a vehicle condition, as described in relation to FIG. 123.

In various embodiments, a system including one or more devices and one or more data processing modules, for example for classifying an object starting from a raw data sensor signal, may be provided. The system may include a sensor module configured to generate sensor data, for example a LIDAR sensor module, or a RADAR sensor module, or a Camera sensor module, or an Ultrasonic sensor module. The system may include a plurality of (e.g., additional) sensor modules, each configured to generate sensor data. The system may include a plurality of sensor modules of the same type (e.g., the system may include a plurality of LIDAR sensor modules), for example arranged at different locations, e.g. different vehicle locations (illustratively, front, corner, side, rear, or roof LIDAR sensor modules). Additionally or alternatively, the system may include a plurality of sensor modules of different types.

The system may include a sensor module, a data compression module, and a sender and receiver module. The sensor module may include a sensor. Considering, as an example, a LIDAR sensor module, the sensor may include one or more photo diodes configured to receive infra-red light signals and to convert the received light signals into associated photocurrent signals. The sensor module may include additional electronics elements configured to provide basic signal and raw data processing. In a LIDAR sensor module, in subsequent processing steps time-of-flight (TOF) data points may be derived from the raw data signals, and a 3D point cloud may be generated from the individual time-of-flight data points.

The sensor may be continuously capturing signals, for example within dedicated measurement time windows. Thus, there may be an essentially continuous stream of data produced by the sensor and provided to further downstream data processing modules or systems. Each data point or each group of data points may be labeled with a time stamp to provide a clear data assignment.

The data compression module may be used to reduce the amount of data to be stored and further processed. The data compression module may be configured to implement one or more data compression algorithms (e.g., including lossy data compression algorithms) to reduce the amount of data. Data compression may be carried out at different steps during the data processing process, e.g. at different steps during the raw data processing processes and/or at different steps of the time-of-flight calculations or 3D point cloud generation. Illustratively, the data compression module may involve several separate data compression steps and may be implemented via different electronics and/or software parts or software programs.

After the completion of signal generation, data processing, and data compression, the generated data may be encoded to be sent via pre-defined data packages to a central data processing system. The suggested data compression method (as already outlined above and described below in more detail) may reduce the amount of data communication and provide fast information exchange, which may be important, as an example, for partially or fully automated driving vehicles. It is suggested to use communication methods based on high-speed Ethernet connection). The central data processing system may be, for example, a sensor fusion box, e.g. of a vehicle. The sensor fusion box may be communicatively connected to the sensor module (e.g., to each sensor module), for example via a vehicle sender and receiver system (also referred to as vehicle sender and receiver module) configured to receive and decode the encoded sensor module data packages. The vehicle sender and receiver system may be configured to receive data from additional information providing systems, such as a Global Positioning System (GNSS/GPS), an Inertial Measurement sensor, a Vehicle-to-Vehicle (V2V) system, or a Vehicle-to-Infrastructure (V2I) system. The various data streams may be collected and consolidated in the sensor fusion box. Redundant data may be compared and further reduced, as long as information consistency is ascertained. Alternatively, in case that inconsistent redundant data are detected, such data may be balanced or weighted against each other and/or prioritization decisions may be executed. This may lead to a concise semantic scene understanding based on object recognition, object classification, and object tracking.

In various embodiments, a sensor system may be provided. The sensor system may be configured to implement the adaptive data compression method. The sensor system may be included, as an example, in a vehicle, e.g. a vehicle with automated driving capabilities. Illustratively, the vehicle may include one or more sensor systems as described herein. The sensor system may be or may be configured as the sensor system 16500 described, for example, in relation to FIG. 165A to FIG. 166D.

The sensor system may include a sensor side and a data processing side. The sensor system may include one or more systems or modules configured to provide data (e.g., sensor data) and one or more systems or modules configured to process the data (e.g., to provide a scene understanding or mapping based on the data). Illustratively, the sensor system may include one or more sensor modules and one or more processors, as described in further detail below.

The sensor system may include a bidirectional communication interface between the sensor side and the data processing side. The bidirectional communication interface may be configured to provide communication from the sensor side to the data processing side, and vice versa. Data and information may be exchanged between the sensor side and the data processing side via the bidirectional communication interface. Illustratively, the sensor system (e.g., the bidirectional communication interface) may include one or more communication modules. By way of example, the bidirectional communication interface may include a first sender and receiver module (e.g., included in or associated with the sensor side, for example included in a sensor module or in each sensor module). As another example, additionally or alternatively, the bidirectional communication interface may include a second sender and receiver module (e.g., associated with the data processing side, for example a vehicle sender and receiver module). Illustratively, the bidirectional communication interface may include at least one transmitter and at least one receiver (e.g., on the sensor side and/or on the data processing side).

In the sensor system described herein, the communication channel via the bidirectional communication interface (illustratively, such back-channel communication) may be used not only to send messages informing about the "sensor side-to-data processing side" communication process (e.g., an acknowledgment message) but also to send information messages and/or command messages from the data processing side to the sensor side (e.g., from a sensor fusion box and/or a vehicle electronic control module towards one or more sensor modules), as described in further detail below. In a conventional system, for example, back-channel communication between a vehicle sender and receiver module and a sensor sender and receiver module may play only a minor role and may be mainly used to send short information messages, such as reception acknowledgment messages (e.g., to confirm that the data provided by a sensor or sensor module towards a consecutive central data processing system, such as a sensor fusion box, has been received).

In various embodiments, the sensor system may include a (e.g., first) sensor module configured to provide sensor data. The configuration of the sensor module may be selected according to the desired type of sensor data. The sensor module may be configured as a sensor type selected from a group of sensor types including or consisting of a LIDAR sensor, a RADAR sensor, a Camera sensor, an Ultrasound sensor, and an Inertial Measurement sensor. In various embodiments, the sensor system may include a plurality of sensor modules (illustratively, the sensor system may include the sensor module and one or more further sensor modules). The sensor modules may be of the same type or of different types. By way of example, at least one further sensor module (e.g., a second sensor module) may be of the same sensor type as the first sensor module. As another example, at least one further sensor module may be of a different sensor type as compared to the first sensor module. The sensor module may be or may be configured as the sensor module 16502 described, for example, in relation to FIG. 165 and FIG. 166. The one or more further sensor modules may be or may be configured as the one or more further sensor modules 16502*b* described, for example, in relation to FIG. 165A to FIG. 166D.

In various embodiments, the sensor system may include a data compression module. The data compression module may be configured to compress data. The data compression module may be configured to compress at least a portion of the sensor data provided by the (e.g., first) sensor module to generate compressed sensor data. Illustratively, the compressed sensor data may be or include a portion of the sensor data (or all sensor data), of which portion of sensor data (or of which sensor data) at least a part is compressed. The compressed sensor data may be used for further processing, (e.g., for scene mapping, object recognition, object classification, and the like), as described in further detail below. By way of example, the data compression module may be included in the sensor module (e.g., each sensor module may include a respective data compression module). As another example, the data compression module may be communicatively coupled with the sensor module (e.g., with one or more sensor modules, e.g. with each sensor module), e.g. the data compression module may be external to the sensor module. The data compression module may be or may be configured as the data compression module 16506 described, for example, in relation to FIG. 165A to FIG. 166D.

The data compression module may be configured to carry out various types of data compression, for example lossless and/or lossy data compression. By way of example, the data compression module may be configured to implement at least one lossy compression algorithm (e.g., to carry out at least one lossy compression method), such as quantization, rounding, discretization, transform algorithm, estimation-based algorithm, or prediction-based algorithm. As another example, additionally or alternatively, the data compression module may be configured to implement at least one lossless compression algorithm (e.g., to carry out at least one lossless compression method), such as Run-length Encoding, Variable Length Coding, or Entropy Coding Algorithm. The compression algorithms (e.g., the algorithm methods) may be stored (e.g., permanently) in a non-transient computer device (e.g., in a non-volatile memory), for example in a sender and receiver module associated with or included in the sensor module.

In various embodiments, the sensor system may include one or more processors (e.g., a data processing system), e.g. at the data processing side. The one or more processors may be configured to process data, e.g. sensor data (e.g., compressed sensor data and/or uncompressed sensor data). Illustratively, the one or more processors may be configured to process compressed sensor data provided by the sensor module (e.g., compressed sensor data associated with the sensor module, e.g. compressed sensor data associated with sensor data provided by the sensor module). By way of example, the one or more processors may be associated with (or included in) a sensor fusion box (e.g., of the vehicle) and/or with a vehicle electronic control system. Illustratively, the one or more processors may be configured to receive the compressed sensor data (or other sensor data) via the bidirectional communication interface (e.g., via the vehicle sender and receiver module in which the data may be decoded and transferred to the sensor fusion box). The one or more processors may be or may be configured as the one or more processors 16512 described, for example, in relation to FIG. 165A to FIG. 166D.

The one or more processors may be configured to implement different types of data processing (e.g., including artificial intelligence methods and/or machine learning methods). The one or more processors may be configured to process data to provide a scene understanding (e.g., an analysis of an environment surrounding the vehicle). By way of example, the one or more processors may be configured to implement one or more object recognition processes (e.g., providing a list of one or more objects with one or more properties associated thereto). As another example, the one or more processors may be configured to implement one or more object classification processes (e.g., providing a list of classified objects, e.g. a list of objects with a class or a type associated thereto). As a further example, the one or more processors may be configured to implement one or more object tracking processes (e.g., providing a list of objects with a velocity and/or a direction of motion associated thereto).

The one or more processors may be configured to process further data. Illustratively, the one or more processors may be configured to process (e.g., further) sensor data provided by at least one further sensor module (e.g., by a plurality of further sensor modules). By way of example, the one or more processors may be configured to process the compressed sensor data in combination with the further sensor data (e.g., further raw sensor data or further compressed sensor data).

In various embodiments, the sensor system may include a memory (also referred to as intermediate memory, intermediate data storage memory, or memory for intermediate data storage). The memory may store (e.g., may be configured to store or used to store) at least a portion of the sensor data not included in the compressed sensor data (illustratively, a second portion different from the first portion). The memory may store data elements (e.g., data blocks) extracted from the original data stream during the data compression (illustratively, the memory may store a portion of the raw sensor data and/or a portion of sensor data compressed by the data compression module, not included in the compressed sensor data). The extracted data may be stored (e.g., temporarily) in the intermediate memory, illustratively, rather than being discarded. As an example, the memory may store sensor data not included in the compressed sensor data in case a lossy data compression algorithm is implemented (e.g., used to compress the sensor data). By way of example, the memory may be included in the sensor module (e.g., each sensor module may include a respective intermediate data storage memory). As another example, the memory may be communicatively coupled with the sensor module (e.g., with one or more sensor modules, e.g. with each sensor module), e.g. the memory may be external to the sensor module. The memory may be or may be configured as the memory 16508 described, for example, in relation to FIG. 165A to FIG. 166D.

The additional data stored in the memory may be retrieved, in case it is determined that additional data should be requested from the sensor module (e.g., for further data processing or for providing more accurate result for the data processing). The additional data may be provided upon request, e.g. upon request from the data processing side (e.g., from the one or more processors). The additional data may be provided, for example, in case a level of accuracy of the result of data processing is not sufficient for an unambiguous scene interpretation (e.g., in case the accuracy is below a threshold accuracy level). The bidirectional communication interface may be configured to receive the request to provide additional sensor data. Illustratively, the bidirectional communication interface may be configured to receive a request to further provide at least a part of the sensor data which is not included in the (e.g., provided) compressed sensor data and which is stored in the memory.

In various embodiments, identification information may be assigned to the sensor data (e.g., to the compressed data and to the extracted data). The sensor system may be configured to associate an identifier with the compressed sensor data and with the extracted data. Illustratively, the sensor system may be configured to associate an identifier with the portion of sensor data that is included in the compressed sensor data and with the portion of sensor data that is not included in the compressed sensor data (e.g., with the portion that is stored in the memory). The identifier may include, as an example, a time stamp (e.g., describing an absolute or relative time point at which the sensor data were generated). The identifier may include, as another example, a unique identification tag, for example a sensor-specific or sensor module-specific code identifying the sensor or sensor module that provided the data. The extracted data may be stored with the associated identifier.

In various embodiments, the bidirectional communication interface may be configured to provide the compressed sensor data (e.g., the compressed sensor data may be transmitted via the bidirectional communication interface, for example to one or more processors, described in further detail below). Illustratively, the compressed sensor data (e.g., the compressed portion of the original data sets) may be provided via the bidirectional communication interface (e.g., may be transferred to a sender and receiver module and transmitted by the sender and receiver module).

The bidirectional communication interface may be configured to receive information (e.g., data) defining a data quality (e.g., a level of data quality) associated with the compressed sensor data. Illustratively, the bidirectional communication interface may be configured to receive information from which a data quality to be provided for the compressed sensor data may be determined (e.g., calculated or evaluated, for example by the data compression module or one or more processors associated with the data compression module). Further illustratively, the bidirectional communication interface may be configured to receive information defining a data quality assigned to the compressed sensor data (e.g., a data quality to be provided by the compressed sensor data). The one or more processors (e.g., at the data processing side) may be configured to determine (e.g., to generate or provide) the information defining the data quality associated (e.g., to be associated) with the compressed sensor data. The one or more processors may be configured to provide (e.g., to transmit) such information to the sensor module (illustratively, via the bidirectional communication interface). The one or more processors may be configured to provide such information to the data compression module (e.g., included in or associated with the sensor module).

A data quality (or a level of data quality) may describe or include one or more data properties (e.g., one or more properties of the compressed sensor data). As an example, the data quality may describe a data resolution, e.g. a number of data points provided for describing a scene or an object, or it may describe a sampling rate (bit depth) and therefore the maximum available resolution. As another example, the data quality may describe a data loss, e.g. information no longer included in or described by the data (e.g., following data compression). As a further example, the data quality may describe a level of accuracy or unambiguity (e.g., a confidence level) of a process carried out with the data (e.g., an object recognition or classification process). Illustratively, the data quality may describe one or more properties that data (e.g., the compressed sensor data) may have or should have.

In various embodiments, the data compression module may be further configured to select (e.g., to modify or to adapt) a data compression characteristic (e.g., a data compression rate, or another characteristic, as described above) used for generating the compressed sensor data in accordance with the received information. Illustratively, the data compression module may be configured to determine (e.g., calculate) a data quality for the compressed sensor data based on the received information (e.g., a data quality to be provided for the compressed sensor data). The data compression module may be configured to select the data compression characteristic in accordance with the determined data quality. Further illustratively, the data compression module may be configured to provide dynamic adaptation of the data compression characteristic based on the information received via the bidirectional communication interface.

By way of example, the data compression module may be configured to reduce the data compression rate (e.g., to select a lower data compression rate, for example to implement a lossless compression algorithm) in case the received information define a data quality higher than a current data quality associated with the compressed sensor data. As another example, the data compression module may be configured to increase the data compression rate (e.g., to select a higher data compression rate, for example to implement a lossy compression algorithm) in case the received information define a data quality lower than a current data quality associated with the compressed sensor data.

In various embodiments, the received information may include a complexity score (also referred to as complexity level or complexity score value). The complexity score may describe a level of complexity (e.g., a degree of complexity) that defines, at least in part, how to process the compressed sensor data (e.g., a level of complexity to be resolved, at least in part, by processing the compressed sensor data). Illustratively, the complexity score may describe a complexity or a level of complexity of a scene, associated for example with a specific traffic and/or driving situation, which is detected, at least in part, by the sensor module providing the compressed sensor data (e.g., a scene to be analyzed, at least in part, by processing the compressed sensor data). Further illustratively, the complexity score may describe a complexity of a data processing to be carried out, at least in part, with the compressed sensor data (e.g., the complexity of an object recognition process, of an object classification process, or of an object tracking process).

The complexity score value may range from a minimum value (e.g., 0) to a maximum value (e.g., 10), e.g. the complexity score may be an integer number in such range. The minimum value may indicate or represent a low complexity (e.g., associated with a traffic and driving situation with low complexity). The maximum value may indicate or represent a high complexity (e.g., associated with a traffic and driving situation with high complexity). A high complexity score may define (e.g., require) a high data quality (e.g., higher than a current data quality). A low complexity score may define a low data quality (e.g., lower than a current data quality). Illustratively, a high complexity score may define or be associated with a less lossy compression algorithm (e.g., a less lossy compression rate) compared to a low complexity score. The data compression module may be configured to select a high data compression rate (e.g., to select a lossy data compression algorithm, e.g. to allow a higher data loss) in case the received information include a low complexity score level. The data compression module may be configured to select a low data compression rate (e.g., to select a lossless data compression algorithm, e.g. to provide a lower data loss) in case the received information include a high complexity score level.

By way of example, the data compression module may be configured to select a data compression rate greater than 70%, in case the complexity score is equal to or lower than 30% of the maximum complexity score. As another example, the data compression module may be configured to select a data compression rate lower than 30%, in case the complexity score is equal to or higher than 70% of the maximum complexity score.

Complexity may be described, for example, as a measure of the total number of properties detected by an observer (e.g., by the sensor system). The collection of properties may be referred to as a state. Illustratively, in a physical system, complexity may be a measure for the probability with which the system is in a state which can be described by a state vector belonging to a plurality of state vectors (out of the entirety of state vectors describing the system) that are associated with a complex system state. As another example, complexity may be described as a property characterizing the is behavior of a system or model whose components interact in multiple ways and follow local rules (illustratively, without a reasonable higher instruction to define the various possible interactions).

In various embodiments, the complexity score value may be determined (e.g., calculated) at the data processing side (e.g., by one or more processors of the sensor system, for example associated with a sensor fusion box and/or with a vehicle electronic control module). The complexity score value may be provided from the data processing side (e.g., from the one or more processors) to the sensor side (e.g., to the sensor module, e.g. to each sensor module). The complexity score value may be determined in accordance with one or more complexity criteria, e.g. may be calculated based on a combination of one or more complexity criteria. The current (e.g. associated with a certain time point) complexity score value may be determined by combining, for example in a weighted or non-weighted manner, the one or more complexity criteria that are currently relevant (e.g., relevant at that time point). By way of example, a look-up table may be provided including the one or more complexity criteria each associated with a corresponding complexity score value.

The one or more complexity criteria may include or be based on one or more sensor system-internal and/or sensor system-external conditions (e.g., one or more vehicle-internal and/or vehicle-external conditions). Each complexity criterion may be associated with a high or low complexity score value (e.g., high may be a value equal to or greater than 50% of the maximum complexity score value, and low may be a value lower than 50% of the maximum complexity score value). By way of example, a complexity level and associated data compression rate (and data compression method) may be defined and regulated by traffic regulations.

A complexity criterion may be a level of autonomous driving (e.g. an SAE-level, e.g., as defined by the Society of Automotive Engineers (SAE), for example in SAE J3016-2018: Taxonomy and definitions for terms related to driving automation systems for on-road motor vehicles). By way of example, a higher required and/or applied SAE-level may be associated with a higher complexity value compared to a low or lower SAE-level, e.g. may be associated with a lower data compression rate. Illustratively, a driver may choose in each traffic situation between different levels of autonomous driving. Alternatively, a vehicle currently driving in a high autonomous driving level, e.g. SAE-level 3 or 4, may request the driver to take over control in a complex and confusing traffic situation. As an example, a geo-fenced SAE-level 4 driving situation with speed limit and where the vehicle may be still equipped with a human driver, functional driving wheel, gas pedal, and brake may be associated with a low complexity value.

A complexity criterion may be a vehicle condition, for example a driving scenario (also referred to as driving situation) and/or a traffic condition (also referred to as traffic situation), as described in relation to FIG. 123. Illustratively, a partially or fully automated vehicle may be exposed to a variety of traffic and/or driving situations involving different levels of complexity and dynamics. The data compression module may be configured to select a data compression algorithm suitable for the current traffic and driving situation. A low complexity situation may include, for example, driving on a straight rural road with only a small number of intersections, or driving for longer time intervals on a motorway behind the same preceding vehicle(s) (e.g., similar to a platooning-arrangement), or driving with a lower speed. A high complexity situation may include, for example, driving in a larger city with high traffic load and with frequent lane change and road turning maneuvers or driving with higher speed. As another example, off-road driving may be associated with a high complexity value. As another example, driving in a parking lot may be associated with a low complexity value. As a further example, driving in 'autonomous only' areas may be associated with a low or medium complexity value. As a further example, vehicle movement with changes in velocity, acceleration and direction (e.g., lane changes) within a short time frame may be associated with a high complexity value. As a further example, a traffic situation with many road intersections and/or with high traffic dynamics and traffic density may be associated with a high complexity value. As a further example, a traffic situation including mixed traffic participants (e.g., traffic participants of different types, such as vehicles and pedestrians) may be associated with a high complexity value. Risk assessment may be based, for example, on information provided by a traffic map (e.g., on historic traffic conditions), as described in relation to FIG. 127 to FIG. 130. Illustratively, in case the current traffic and/or driving situation, has a high complexity (e.g. due to neuralgic spots known from the traffic map), a compression algorithm with a low compression rate may be selected.

A complexity criterion may be a weather condition (e.g., as part of the vehicle condition). By way of example, driving in inclement weather may be associated with a higher complexity score value compared to driving in a good-visibility condition.

A complexity criterion may be the level of available artificial intelligence assistance (e.g., to driving). As an example, a high level of availability (e.g., a high level of resources available for implementing artificial intelligence assistance) may be associated with a low complexity value. As a further example, a low level of availability may be associated with a high complexity value.

A complexity criterion may be a sensor configuration or sensor module configuration. Illustratively, the complexity score value may be dependent on the number of sensor modules that may be used or are to be used. As an example, a situation in which a plurality of sensors are to be used for proper and unambiguous scene understanding may be associated with a high complexity score value (e.g., a situation including a high number of conflicts among different sensors). As another example, a situation in which only some sensors or sensor types may be used (e.g., only infrared-sensitive cameras or sensors in a night driving situation) may be associated with a low complexity score value.

In various embodiments, the one or more processors may be configured to determine (e.g., adapt) the complexity score value taking into consideration the sensor module (e.g., the type of sensor module) to which the complexity score value may be provided. Illustratively, the complexity score value may be adapted depending on the type of sensor data compressed (e.g., to be compressed) in accordance with the complexity score value. Individual complexity score values may be determined (e.g., processed) separately.

As an example, different sensor modules may be provided with a different score value depending on the respective data processing and/or data storing capabilities. Illustratively, a sensor module having higher data processing capabilities than another sensor module may be provided with a higher complexity score value compared to the other sensor module and/or with a higher priority compared to the other sensor modules. As a further example, different sensor modules (e.g., of different types and/or imaging different portions of a scene) may have a different relevance, e.g. in a specific situation. A more relevant sensor module may be provided with a higher complexity score value than a less relevant sensor module (e.g., compressed sensor data associated with the more relevant sensor module may have or be required to have a better data quality) and/or with a higher priority compared to the other sensor modules. By way of example, a relevance of a sensor module (and of the respective sensor data) may be dependent on a traffic and/or driving situation. As an example, in a parking lot situation, ultrasound sensor data and/or camera data may be more relevant than LIDAR data and/or RADAR data. As another example, RADAR data and/or LIDAR data fusion may more relevant than ultrasound sensor data and/or camera data in a motorway or interstate condition.

An overall complexity score value may be a combination of is individual complexity score values (e.g., of subsets of complexity score values), for example, in case a complexity score value is calculated or defined for individual sensor modules. Illustratively, the overall complexity score value may be a sum (e.g., a weighted sum) of the individual complexity score values of the sensor modules. Further illustratively, the overall complexity score value may be a sum (e.g., a weighted sum) of individual complexity score values determined for different portions of the scene (e.g., different portions of the field of view of the sensor system). The information received by a sensor module may include the overall complexity score value or the respective complexity score value (e.g., determined based on the type of the sensor module and/or on the covered portion of the scene).

In various embodiments, additionally or alternatively, the received information may include information about a vehicle condition (e.g., about the traffic and/or driving situation, such as driving in a city, on a rural road, on a motorway, high/low traffic density, at high/low velocity, etc.). The received information may include a qualitative and/or quantitative description of the current vehicle condition (e.g., of the vehicle in which the sensor system is included). The data compression module may be configured to select a data compression characteristic (e.g., a data compression rate, or another characteristic as described above) in accordance with the vehicle condition. Illustratively, additionally or alternatively to receiving the complexity score value, the data compression module may be configured to determine a data compression characteristic to be used based on the vehicle condition (e.g., based on the traffic and/or driving situation). In an exemplary scenario, the information about the vehicle condition may be provided by a sensor fusion box and transmitted to the sender and receiver module of the sensor module (e.g., of each sensor module).

In various embodiments, additionally or alternatively, the received information may include an SAE-level. The SAE-level may be associated with an autonomous driving that defines, at least in part, how to process the compressed sensor data (e.g., an autonomous driving carried out, at least in part, by processing the compressed sensor data, illustratively, the compressed sensor data provided by the sensor module). The SAE-level may be associated with an autonomous driving performed based on processing data including the compressed sensor data (e.g., in combination with other data, for example further sensor data from further sensor modules). In an exemplary scenario, the SAE-level may be provided by a vehicle electronic control system and transmitted to the sender and receiver module of the sensor module (e.g., of each sensor module).

Such information may be used by the data compression module to select a compression algorithm suitable for the currently activated SAE-level. In case of low SAE-level (e.g. SAE-level 0-2) the data compression module may be configured to select a high data compression rate, e.g. a lossy data compression algorithm (e.g., with a data compression rate greater than 60%). In case of high SAE-level (e.g., 3 or higher), the data compression module may be configured to select a low data compression rate, e.g. a lossless data compression algorithm (e.g., with a data compression rate lower than 30%). By way of example, a low SAE-level may be associated with a driving situation in which the main control activities are performed by a human driver, such that the focus of the vehicle sensor system may be mainly on advanced driver-assistance systems (ADAS) functionalities, such as lane keeping, cruise control, emergency braking assistance, and the like. As another example, a high SAE-level may be associated with a driving situation in which the vehicle sensor system may take over more and more vehicle control functions, thus placing higher requirements on the data quality provided by the vehicle sensor system (e.g., on the data quality provided by each sensor module).

In various embodiments, additionally or alternatively, the received information may include an instruction describing a data quality of the compressed sensor data to be provided (e.g., a request for compressed sensor data having a specified data quality). The data compression module may be configured to select the data compression characteristic (e.g., a data compression rate, or another characteristic as described above) in accordance with the received instruction (e.g., in accordance with the received request). Illustratively, the data compression module may be configured to execute the received instruction (e.g., the instruction may describe or specify the data compression characteristic to be selected).

The one or more processors (e.g., at the data processing side) may be configured to determine (e.g., evaluate or calculate) the data quality to be associated with the compressed sensor data provided by the sensor module (e.g., for the compressed sensor data generated from sensor data provided by the sensor module). Illustratively, the one or more processors may be configured to determine the data quality that the compressed sensor data provided by the sensor module should have (e.g., a data quality to be requested for the compressed sensor data provided by the sensor module). The one or more processors may be configured to generate an instruction (e.g., a request) to provide compressed sensor data having the determined data quality. The one or more processors may be configured to transmit such instruction (e.g., such request) to the sensor module (e.g., via the bidirectional communication interface).

In various embodiments, the one or more processors may be configured to determine (e.g., to measure or calculate) the data quality to be associated with the compressed sensor data provided by the sensor module based on further sensor data (e.g., raw or compressed) provided by at least one further sensor module. Illustratively, the one or more processors may be configured to determine the data quality to be associated with the compressed sensor data based on whether (or not) sufficient data are already available (e.g., provided by a further sensor module or a plurality of further sensor modules). Further illustratively, the one or more processors may be configured to determine (e.g. to define or to request) the data quality to be associated with the compressed sensor data based on the result of data processing performed with sensor data provided by at least one further sensor module. By way of example, the one or more processors may be configured to determine a low data quality to be associated with the compressed sensor data in case the data processing with the further sensor data provides results with high accuracy (e.g., above a threshold accuracy level, e.g. above a threshold confidence level). As another example, the one or more processors may be configured to determine a high data quality to be associated with the compressed sensor data in case the data processing with the further sensor data provides results with low accuracy (e.g., below the threshold accuracy level).

This operation may be related to redundancy requirements to be fulfilled at the processing level (e.g., at the level of the one or more processors, e.g. at the level of the sensor fusion box), which requirements may influence the tolerable compression rate for the sensor module (e.g., may lead to further dynamics with respect to the maximum tolerable compression rate for the sensor module). In an exemplary scenario, unambiguous data from at least two separate sensors or sensor modules (e.g., with at least partially overlapping field of view) may be required for a proper scene understanding in a specific direction (e.g. the vehicle driving direction). In case a first sensor module and a second sensor module are able to provide such data (e.g., in a current traffic and driving situation), only low quality data may be requested from a third (e.g., partially overlapping) sensor module. The sensor data from the third sensor module may be compressed with a high compression rate. In case the first sensor module and the second sensor module are not able to provide data with suitable accuracy (e.g., in case of sensor failure, in case of excessive signal-to-noise ratio, in view of the weather or other environmental conditions, and the like), high-quality data from the third sensor module may be requested. An algorithm with a low data compression rate may be applied in this case for the third sensor module.

In various embodiments, the one or more processors may be configured to assign a priority level (e.g., a priority value) to the compressed sensor data provided by the sensor module (e.g., to assign a priority level to the sensor module and/or to the sensor data provided by the sensor module). The one or more processors may be configured to determine (e.g. to define, to measure, to calculate, or to request) the data quality to be associated with the compressed sensor data in accordance with the priority level assigned to the compressed sensor data (e.g., to the sensor module). The complexity score values may be included in such sensor prioritization, as described above. Illustratively, the one or more processors may be configured to determine a relevance of the sensor module (e.g., with respect to other sensor modules, for example in a current situation). The one or more processors may be configured to assign the priority level based on the relevance of the sensor module (e.g., of the sensor data provided by the sensor module). The one or more processors may be configured to determine the priority level to be assigned to the compressed sensor data provided by the sensor module based on the field of view of the sensor module. Illustratively, the one or more processors may be configured to assign the priority level to the sensor module based on the portion of the scene covered by the sensor module.

Sensor prioritization may be employed to reduce the amount of data which is generated from the sensor system. In an exemplary scenario, in case the vehicle drives along a straight road without intersections in the vicinity, the vehicle sensor system may focus on data from a front LIDAR system, illustratively the highest priority value may be assigned to the front LIDAR system. A lower priority, e.g. a medium-ranked priority, may be assigned to other front-facing sensor systems, such as RADAR and Camera systems. An even lower priority may be assigned to side and/or rear sensor systems (LIDAR, RADAR, Camera). In this scenario, the front LIDAR system may receive a command message (e.g. an instruction) requesting high-quality data with no or only low data compression. The front RADAR and Camera systems may receive a command message requesting data with a higher data compression rate compared to the front LIDAR system. The side- and/or rear-facing sensor systems may receive a command message requesting data with a high or even maximum data compression rate.

In various embodiments, the received information may define a field of view dependent data quality. The received information may define different data qualities for compressed sensor data associated with different portions of the field of view. By way of example, the received information may define a first data quality for a first portion (e.g., a first subset) of the compressed sensor data and a second data quality for a second portion (e.g., a first subset) of the compressed sensor data. The first portion of the compressed sensor data may be associated with a first portion (e.g., a first segment) of the field of view of the sensor module (e.g., with a first portion of the scene). The second portion of the compressed sensor data may be associated with a second portion (e.g., a second segment) of the field of view of the sensor module (e.g., with a second portion of the scene). The first segment of the field of view may be different from the second segment of the field of view (e.g., not overlapping or only partially overlapping).

In various embodiments, the data compression module may be configured to select different data compression characteristics (e.g., different data compression rates, or other characteristics as described above) to compress different portions of sensor data (e.g., associated with different segments of the field of view of the sensor module, e.g. generated by detecting different portions of the field of view). By way of example, the data compression module may be configured to select a first data compression characteristic (e.g., a first data compression rate) to generate first compressed data and to select a second data compression characteristic (e.g., a second data compression rate) to generate second compressed data. The first compressed data may be associated with the first segment of the field of view of the sensor module and the second compressed data may be associated with the second segment of the field of view of the sensor module. The first data compression characteristic may be different from the second data compression characteristic. As an example, a lower compression rate may be selected for more relevant segments or regions of the field of view (e.g., a region along the path of the vehicle or a region including a safety-critical object, such as another vehicle). In addition, various object parameters may be taken into consideration, such as object size, location, orientation, velocity, or acceleration. An assignment of different data compression rates to different portions of the field of view may be performed, for example, as described in relation to FIG. 162A to FIG. 164E.

The one or more processors may be configured to generate an instruction to provide compressed sensor data having different data quality depending on the portion of field of view associated thereto. By way of example, those sub-portions of a 3D point cloud may be requested with high quality level by the one or more processors (e.g., by the sensor fusion box), which portions may be expected to deliver relevant data. The other parts of the field of view (e.g., of the field of view of the sensor system, e.g. covered by one or more sensor modules) may be requested only with a lower level of precision (allowing for example a higher level of data compression) and/or may be requested only at a later point in time or may not be requested at all.

The field of view based prioritization may provide a reduction of the amount of data which is generated by the sensor system. The one or more processors may be configured to divide or partition the field of view (e.g., of the sensor system, e.g. the superposition of the field of views of the sensor modules) into different parts. The one or more processors may be configured to process the individual parts in a different way, for example with respect to data compression. By way of example, concepts of event-based vision may be used where only sub-portions of a 3D-point cloud may requested (e.g., with high quality level) by the one or more processors in an "on-demand" fashion. In an exemplary scenario, in case a vehicle drives around a left turning road, only those portions of 3D point cloud data generated by a front-facing sensor module may be used, which belong to the left part of the field of view of the sensor module. In this case, the sensor module may receive a command message requesting high-quality data with no or only low data compression for that portion(s) of the 3D point cloud data associated with the left part of the field of view. The portion(s) associated with the center part of the field of view may be compressed with a higher compression rate. The data associated with the right part of the field of view may be compressed with an even higher or maximum data compression rate.

Different methods may be provided (e.g., carried out by the one or more processors) for partitioning the field of view (e.g., of the sensor system). As an example, in a simple method, the field of view may be partitioned into sub-portions of simple geometry, e.g. partitioned along straight vertical and/or horizontal planes dividing the field of view into a plurality of angular sections. By way of example, the field of view may be divided along two vertical planes into three equally large angular sections, such as a center section, a left-side section and a right-side section.

As another example, in a more sophisticated method, the field of view may be partitioned based on a preliminary analysis with respect to a clustering of 3D points in the field of view. The field of view may be analyzed based on an evaluation of histogram data. Histogram data may be determined for a predefined number of bins along the z-axis (illustratively, an axis parallel to the direction along which an optical axis of the sensor system may be aligned). As an example, a maximum range along the z-axis of 300 m may be divided into 60 bins of 5 m length along the z-axis. In the range from 0 m to 5 m all 3D points may be counted and summed up, independent of their x and y values. All 3D points in the range bins from 5 m to 10 m, from 10 m to 15 m, . . . , from 295 m to 300 m may be counted and summed up. Based on this analysis, z-bins with a cumulative value higher than a predefined threshold value may be further analyzed with respect to histogram data for a predefined number of bins along the x-axis and/or the y-axis (e.g., along a first axis and/or a second axis perpendicular to one another and perpendicular to the z-axis). Taking all information together, areas in the field of view with a clustering of 3D points may be determined by this analysis. Based on the clustering, a corresponding (adaptive) mesh or grid may be defined separating clustered areas with many 3D points from areas with no 3D points or only a small amount of 3D points. Such a partitioning of the point cloud may be similar to the creation of so-called bounding boxes described, for example, in relation to FIG. 162A to FIG. 164E.

In various embodiments, the one or more processors may be configured to determine the data quality to be associated with the compressed sensor data based on available data transmission resources and/or memory resources associated with the one or more processors. Illustratively, in case a high (or higher) amount of resources are available, a high (or higher) data quality may be determined (and requested), e.g. a low (or lower) data compression rate. By way of example, the data compression rate may be adjusted as a function of available data transmission rates, e.g. intra-vehicular data transmission rates, V2V or V2I Data Transmission Rates, for example when using (or not) a 5G net. Better communication infrastructure may result in a lower compression rate. As another example, the data compression characteristic may be adjusted as a function of available memory resources of a LIDAR data processing system.

In various embodiments, the sensor system may include one or more additional information providing interfaces and/or communication interfaces. By way of example, the sensor system may include at least one Global Positioning System interface to receive Global Positioning information (e.g., describing a position of the vehicle, e.g. GPS coordinates of the vehicle). As another example, the sensor system may include at least one Vehicle-to-Vehicle communication interface. As a further example, the sensor is system may include at least one Vehicle-to-Infrastructure communication interface. The one or more processors may be configured to receive data and/or information via such additional interfaces (e.g., via the vehicle sender and receiver module). The one or more processors may be configured to process the data received via such interfaces. The one or more processors may be configured to determine (e.g., to generate) information defining a data quality associated with the compressed sensor data based on the information or data received via such information providing interfaces and/or communication interfaces.

In various embodiments, additionally or alternatively, data processing may be provided at the sensor side of the sensor system. Illustratively, a distributed data processing architecture may be provided. Data processing (e.g., data analysis, one or more object recognition processes, or one or more object classification processes) may be carried out, at least in part, at the level of the sensor module (e.g., at the level of each individual sensor or sensor module). This may provide a different structure compared to the data processing structure describe above, which may be based on a centralized data processing architecture. Illustratively, in the centralized architecture described above the sensor data (e.g., compressed or non-compressed) provided by a sensor module (e.g., by each sensor module, e.g. by each sensor) may be transmitted towards a central system for further analysis, object recognition and the like (e.g., towards the one or more processors on the data processing side, e.g. towards a central sensor fusion box).

The sensor module (e.g., each sensor module) may be configured to implement one or more object-recognition processes using the sensor data to provide object-related data. Additionally or alternatively, the sensor module (e.g., each sensor module) may be configured to implement one or more object-classification processes using the sensor data to provide classified object-related data. Illustratively, the sensor module may include one or more processors and/or may have one or more processors associated thereto (e.g., on the sensor side).

In this configuration, only a limited number of object-related data (and/or classified object-related data) may be transmitted towards the data processing side (e.g., towards an object fusion module). By way of example, each sensor module may be configured to transmit data related to so-called bounding boxes surrounding the objects recognized in the field of view. Such data may include, for example, the position of each bounding box in the field of view (e.g. x, y, z coordinates), the orientation of each bounding box (e.g. u, v, w directions with respect to the x, y, z coordinate system) and the size of each bounding box (e.g. length L, width W and height H). Optionally, additional values related to each bounding box may be transmitted, such as reflectivity values, confidence values and the like.

The operation of the sensor system in relation to the object-related data and/or the classified object-related data may be configured as the operation of the sensor system in relation to the sensor data described above.

The data compression module may be configured to compress at least a portion of the object-related data to provide compressed object-related data. Additionally or alternatively, the data compression module may be configured to compress at least a portion of the classified object-related data to provide compressed classified object-related data.

The one or more processors may be configured to process the object-related data and/or the classified object-related data (e.g., the compressed object-related data and/or the compressed classified object-related data). By way of example, the one or more processors may be configured to carry out an object classification process using the object-related data (or a combination of object-related data provided by a plurality of sensor modules).

The received information may define a data quality associated (e.g., to be associated) with the compressed object-related data and/or with the compressed classified object-related data. The data compression module may be configured to select a data compression characteristic (e.g., a data compression rate or another characteristic, as described above) used for generating the compressed object-related data and/or compressed classified object-related data in accordance with the received information. The one or more processors may be configured to generate such information defining the data quality associated (e.g., to be associated) with the compressed object-related data and/or with the compressed classified object-related data. The one or more processors may be configured to transmit such information to the sensor module (e.g., to each sensor module). The determination (e.g., the generation) of such information may be carried out as described above in relation to the compressed sensor data.

In a distributed architecture, a trade-off may be provided between fast data processing and/or efficient data processing and/or power-saving data processing on the one hand and reliable object recognition (and/or classification) on the other hand. By way of example, data may be prioritized from specific regions of the field of view to speed up object recognition (e.g., processing may be focused on specific regions of the field of view). From such regions, data of high quality may be requested (e.g., with no compression or only lossless compression). Data from other regions may be requested with lower data quality (e.g., allowing a lossy data compression algorithm), or may be ignored in first instance. In a later downstream object fusion process, inconsistencies or discrepancies may be recognized with respect to some or all of the sensors providing object-related data. In this case, similar to the above described scenario with respect to a centralized data processing architecture, data of higher quality may be requested (on demand) from the upstream entities. Illustratively, data which entered the object recognition process in a sensor module with low data quality may be re-processed in order to provide higher quality data.

FIG. 167 shows a sensor system 16700 in a schematic representation in accordance with various embodiments. The sensor system 16700 may include, illustratively, a sensor side and a data processing side communicating with one another via a bidirectional communication interface 16710, as described in further detail below.

The sensor system 16700 may include (e.g., on the sensor side) a sensor module 16702. The sensor module 16702 may be configured to provide sensor data. By way of example, the sensor module 16702 may include a sensor 16704 configured to generate a sensor signal (e.g., a plurality of sensor signals). The sensor module 16702 may be configured to convert the (e.g., analog) sensor signal into (e.g., digital) sensor data (e.g., the sensor module 16702 may include an analog-to-digital converter coupled with the sensor).

The sensor module 16702 may be of a predefined sensor type (e.g., may include a sensor 16704 of a predefined type). The sensor module 16702 may be configured as a sensor type selected from a group of sensor types including or consisting of a LIDAR sensor, a RADAR sensor, a Camera sensor, an Ultrasound sensor, and an Inertial Measurement sensor. By way of example, the sensor system 16700 or the sensor module 16702 may be or may be configured as a LIDAR system, e.g. as the LIDAR Sensor System 10, and the sensor 16704 may be or may be configured as the LIDAR sensor 52 (e.g., including one or more photo diodes).

The sensor system 16700 may include, optionally, one or more further sensor modules 16702*b* (e.g., a plurality of further sensor modules 16702*b*). The one or more further sensor modules 16702*b* may be of a predefined sensor type (e.g., each further sensor module may include a respective sensor 16704*b* of a predefined type). By way of example, at least one further sensor module 16702*b* of the one or more further sensor modules 16702*b* may be of the same sensor type as the sensor module 16702 (e.g., the sensor module 16702 and the at least one further sensor module 16702*b* may be LIDAR sensor modules arranged in different positions or covering different portions of the field of view of the sensor system 16700). As another example, at least one further sensor module 16702*b* of the one or more further sensor modules 16702*b* may be of a different sensor type with respect to the sensor module 16702. As an example, the sensor module 16702 may be a LIDAR sensor module and the further sensor module 16702*b* may be a Camera sensor module (e.g., including a camera).

The sensor system 16700 may include (e.g., on the sensor side) a data compression module 16706. The data compression module 16706 may be configured to compress data (e.g., sensor data). Additionally, the data compression module 16706 may be configured to transmit and/or de-compress data. Illustratively, the data compression module 16706 may include one or more components, e.g. hardware components (e.g., one or more processors), configured to implement data compression (e.g., to execute software instructions providing data compression).

The data compression module 16706 may be configured to compress data with various data compression characteristics, e.g. various data compression rates, e.g. the data compression module 16706 may be configured to implement or execute different compression algorithms (e.g., having different compression rate). By way of example, the data compression module 16706 may be configured to implement at least one lossy compression algorithm (e.g., to use a lossy compression algorithm to compress the sensor data, or a portion of the sensor data), such as an algorithm selected from quantization, rounding, discretization, transform algorithm, estimation-based algorithm, and prediction-based algorithm. As another example, the data compression module 16706 may be configured to implement at least one lossless compression algorithm (e.g., to use a lossless compression algorithm to compress the sensor data, or a portion of the sensor data), such as an algorithm selected from Run-length Encoding, Variable Length Coding, and Entropy Coding Algorithm.

The data compression module 16706 may be configured to compress at least a (e.g., first) portion of the sensor data provided by the sensor module 16702 to generate compressed sensor data. The compression of a portion of the sensor data provided by the sensor module 16702 may be described, for example, as the data compression module 16706 being configured to receive a (e.g., continuous) stream of sensor data and to compress at least some of the received sensor data. As an example, as illustrated in FIG. 167, the data compression module 16706 may be configured to receive the (e.g., raw) sensor data from the sensor module 16702. Illustratively, the data compression module 16706 may be communicatively coupled with the sensor module 16702 (e.g., with the sensor 16704 or with the analog-to-digital converter).

The sensor system 16700 may include (e.g., on the sensor side) a memory 16708 (illustratively, an intermediate data storage memory). The memory 16708 may store at least a (e.g., second) portion of the sensor data not included in the compressed sensor data. The memory 16708 may be or may include a volatile (illustratively, transient) memory. Alternatively, the memory 16708 may be or may include a non-volatile (illustratively, non-transient) memory. The storage capacity of the memory 16708 may be selected in accordance with desired operation parameters (e.g., speed of operation, storage time, and the like). By way of example, the memory 16708 may have a storage capacity in the range from about 1 MB to about 10 GB, for example from about 100 MB to about 1 GB. As an example, the memory may be a ring memory. The ring memory may have, for example, a storage capacity of at least 10 MB, for example of at least 100 MB, for example 1 GB.

The sensor system 16700 may be configured to associate an identifier (e.g., a time stamp, or an identification code of the sensor module 16702) with the compressed sensor data and with the portion of sensor data that is not included in the compressed sensor data and that is stored in the memory 16708. Illustratively, the identifier may provide identification information for identifying the sensor data stored in the memory 16708 (and for retrieving the sensor data from the memory 16708).

The bidirectional communication interface 16710 may be configured to provide (e.g., to transmit) the compressed sensor data. The bidirectional communication interface 16710 may be configured to receive the compressed sensor data from the data compression module 16706 (e.g., the bidirectional communication interface 16710 may be communicatively coupled with the data communication module 16706). The bidirectional communication interface 16710 may be configured to transmit the compressed sensor data to the data processing side of the sensor system 16700 (e.g., to one or more processors 16714, as described in further detail below).

The bidirectional communication interface 16710 may include at least one transmitter 16712*t* and at least one receiver 16712*r* (e.g., on the sensor side, e.g. associated with the provision of sensor data from the sensor module 16702). By way of example, the bidirectional communication interface 16710 may include a first sender and receiver module 16712 (e.g., including the transmitter 16712*t* and the receiver 16712*r*) associated with the sensor module 16702 (e.g., associated with providing sensor data and receiving the request). Optionally, the bidirectional communication interface 16710 may include a second sender and receiver module (e.g., a vehicle sender and receiver module, e.g. including a second transmitter and a second receiver) associated with the data processing side (e.g., with the one or more processors 16714).

The data compression module 16706, the memory 16708, and the bidirectional communication interface 16710 (e.g., a part of the bidirectional communication interface 16710, e.g. the first sender and receiver module 16712) may be associated with or assigned to the sensor module 16702. By way of example the data compression module 16706, the memory 16708, and the bidirectional communication interface 16710 (e.g. the first sender and receiver module 16712) may be included or be part of the sensor module 16702. Illustratively, the sensor module 16702 may be described as a system configured to carry out the operations described herein in relation to the data compression module 16706, the memory 16708, and (at least in part) the bidirectional communication interface 16710. Each of the one or more further sensor modules 16702*b* may be associated with (e.g., include) a respective data compression module, a respective memory, and a respective bidirectional communication interface (e.g., a respective sender and receiver module).

Alternatively, the data compression module 16706, the memory 16708, and the bidirectional communication interface 16710 may be associated with or assigned to more than one sensor module, e.g. may be communicatively coupled with more than one sensor module (e.g., with the sensor module 16702 and at least one further sensor module 16702*b*).

The one or more processors 16714 may be configured to process data, e.g. sensor data. The one or more processors 16714 may be configured to process the compressed sensor data provided by the sensor module 16702 (illustratively, compressed sensor data provided or generated from sensor data provided by the sensor module 16702). Illustratively, the one or more processors 16714 may be configured to receive the compressed sensor data via the bidirectional communication interface 16710 (e.g., via the second sender and receiver module). The one or more processors 16714 may be configured to process the received compressed sensor data.

The one or more processors 16714 may be configured to process (e.g., further) sensor data provided by the one or more further sensor modules 16702*b* (e.g., by at least one further sensor module 16702*b*). By way of example, the one or more processors 16714 may be configured to receive the sensor data (e.g., raw, compressed, or pre-compressed) from the one or more further sensor modules 16702*b* via a respective bidirectional communication interface. Illustratively, the one or more processors 16714 may be associated with a sensor fusion box (e.g., of the vehicle) and/or with a vehicle electronic control system. By way of example, the one or more processors 16714 may be included in a sensor fusion box (e.g., of a vehicle).

The one or more processors 16714 may be configured to implement different types of data processing (e.g., using the compressed sensor data and, optionally, the further sensor data), e.g. to evaluate a scene (e.g., the field of view). By way of example, the one or more processors 16714 may be configured to implement one or more object recognition processes. As another example, the one or more processors 16714 may be configured to implement one or more object classification processes (e.g., based on the result of the object recognition process). As a further example, the one or more processors 16714 may be configured to implement one or more object tracking processes.

The bidirectional communication interface 16710 may be configured to receive information (e.g., from the data processing side, illustratively from the one or more processors 16714) defining a data quality associated with the compressed sensor data (e.g., provided by the sensor module 16702). Illustratively, the bidirectional communication interface may be configured to receive information associated with a data quality of the compressed sensor data (e.g., information from which a data quality of the compressed sensor data may be determined). The data quality may be described as one or more properties (e.g., data-related properties) that the compressed sensor data may have or should have, such as a resolution, a data loss, a signal-to-noise ratio, or an accuracy.

The data compression module 16706 may be configured to select (e.g., to modify) a data compression characteristic (e.g., a data compression rate or other characteristic, as described above) used for generating the compressed sensor data in accordance with the received information. Illustratively, the data compression module 16706 may be configured to determine a data compression characteristic (e.g., a data compression rate) to be used for compressing the sensor data based on the received information. By way of example, the data compression module 16706 may be configured to process the received information to determine the data quality (e.g., the one or more properties) to be provided for the compressed sensor data and to select a data compression rate accordingly. The data compression module 16706 may be configured to compress the sensor data with the selected data compression characteristic to provide compressed sensor data (e.g., other compressed sensor data, e.g. adapted compressed sensor data).

The data compression module 16706 may be configured to select a data compression characteristic adapted to provide the data quality defined by the received information. By way of example, the data compression module 16706 may be configured to select a data compression rate adapted to provide the defined resolution and/or data loss. As another example, the data compression module 16706 may be configured to select a data compression rate adapted to provide the defined signal-to-noise ratio and/or accuracy. Illustratively, the selected data compression rate may increase for decreasing data quality (e.g., for decreasing resolution and/or accuracy to be provided, or for increasing data loss and/or signal-to-noise ratio). The selected data compression rate may decrease for increasing data quality (e.g., for increasing resolution and/or accuracy to be provided, or for decreasing data loss and/or signal-to-noise ratio).

The received information (e.g., determined and/or transmitted at the data processing side, e.g. by the one or more processors 16714) may include various type of information and/or data associated with the data qualify of the compressed sensor data.

By way of example, the received information may include a complexity score value. The complexity score value may describe a level of complexity that defines, at least in part, how to process the compressed sensor data. Illustratively, the complexity score value may describe a level of complexity of a scenario to be analyzed, at least in part, by processing the compressed sensor data as a function of such complexity value.

The complexity score value may be determined (e.g., by the one or more processors 16714) in accordance with one or more complexity criteria (e.g., an SAE-level, a traffic situation, a driving situation, an atmospheric condition, a level of available artificial intelligence assistance, or a configuration of the sensor module 16702 and/or of the further sensor modules 16702*b*). Illustratively, the complexity score value may include a sum (e.g., a weighted sum) of individual complexity score values associated with the one or more complexity criteria (e.g., relevant in a current scenario). The calculation of the complexity score value may be implemented, for example, via software (e.g., via software instructions). This may provide a flexible adaptation of the complexity criteria (e.g., of the respectively associated complexity score value).

The complexity score value may be determined or adapted according to one or more properties of the sensor module 16702. By way of example, the complexity score value may be determined in accordance with the type of the sensor module 16702. Illustratively, the complexity score value may be determined in accordance with the relevance of sensor data provided by a sensor module of that type in a current situation (e.g., the complexity score value may increase for increasing relevance). As another example, the complexity score value may be determined in accordance with the field of view of the sensor module 16702 (e.g., with the portion(s) of the field of view of the sensor system 16700 covered by the sensor module 16702). Illustratively, the complexity score value may be determined in accordance with the relevance of sensor data describing the portion(s) of the field of view of the sensor system 16700 covered by the sensor module 16702 (e.g., in a current situation). Different sensor modules may receive different complexity score values in a same situation in accordance with the respective properties.

The data compression module 16706 may be configured to select the data compression characteristic (e.g., a data compression rate or other characteristic, as described above) in accordance with the complexity score value (e.g., to increase the data compression rate 16706 for decreasing complexity score values or to decrease the data compression rate 16706 for increasing complexity score values). Illustratively, an increasing complexity score value may be associated with increasing data quality for the compressed sensor data (e.g., increasing data quality to be provided with the compressed sensor data). A decreasing complexity score value may be associated with decreasing data quality for the compressed sensor data.

Additionally or alternatively, the received information may include an SAE-level. The SAE-level may be associated with an autonomous driving that defines, at least in part, how to process the compressed sensor data (e.g., an autonomous driving carried out, at least in part, by processing the compressed sensor data). Illustratively, the SAE-level may be associated with driving commands generated, at least in part, in accordance with data processing carried out on the compressed sensor data. The data compression module 16706 may be configured to select the data compression characteristic in accordance with the SAE-level (e.g., to increase the data compression rate 16706 for decreasing SAE-level or to decrease the data compression rate 16706 for increasing SAE-level). Illustratively, an increasing SAE-level may be associated with increasing data quality for the compressed sensor data and a decreasing SAE-level may be associated with decreasing data quality for the compressed sensor data.

Additionally or alternatively, the received information may include an instruction describing a data quality of the compressed sensor data to be provided (e.g., a request for compressed sensor data having a specified data quality). The received information may include (e.g., specify) a data compression characteristic (e.g., a data compression rate or other characteristic, as described above) to be used by the data compression module 16706 for generating the compressed sensor data.

The one or more processors 16714 may be configured to determine the data quality to be associated with the compressed sensor data provided by the sensor module 16702 (e.g., a data quality to be requested for the compressed sensor data provided by the sensor module 16702). The one or more processors 16714 may be configured to generate an instruction (e.g., a request) to provide compressed sensor data having the determined data quality. The one or more processors 16714 may be configured to transmit such instruction (e.g., such request) to the sensor module 16702 (and/or to the data compression module 16706).

As an example, the one or more processors 16714 may be configured to determine the data quality for compressed sensor data in accordance with the complexity score value associated with the sensor module 16702. Illustratively, the one or more processors 16714 may be configured to determine the data quality for the compressed sensor data in accordance with one or more of the complexity criteria.

As another example, the one or more processors 16714 may be configured to determine the data quality to be associated with the compressed sensor data provided by the sensor module 16702 based on further sensor data (e.g., raw or compressed), e.g. on sensor data provided by at least one further sensor module 16702*b*. Illustratively, the data quality for the compressed sensor data may be determined in accordance with the result of data processing carried out with further sensor data (illustratively, data not provided by the sensor module 16702). By way of example, the data quality for the compressed sensor data may be determined in accordance with a confidence level of an object recognition process and/or an object classification process carried out with further sensor data (e.g., with a recognition confidence level and/or a threshold confidence level, as described in relation to FIG. 162A to FIG. 164E). The data quality may increase for decreasing confidence level and may decrease for increasing confidence level (illustratively, a high confidence level may indicate that the further sensor data suffice for a proper object recognition or classification).

As a further example, the one or more processors 16714 may be configured to assign a priority level (e.g., a priority value) to the compressed sensor data provided by the sensor module 16702 (e.g., to assign a priority level to the sensor module 16702). The one or more processors 16714 may be configured to determine the data quality to be associated with the compressed sensor data in accordance with the priority level assigned to the compressed sensor data (e.g., to the sensor module 16712). Illustratively, the data quality may increase for increasing priority level (e.g., the data compression rate may decrease for increasing priority level).

The priority level may indicate or be based on a relevance of the compressed sensor data, e.g. a relevance of the sensor module 16702, for example relative or compared to other data or data sources (e.g., compared to a further sensor module 16702*b*). By way of example, the priority level for the sensor module 16702 (e.g., for each sensor module) may be included or specified in a traffic map received by the one or more processors 16714 (e.g., via a Vehicle-to-Infrastructure communication interface 16716*c*, described in further detail below). The priority level (e.g., the relevance of the sensor module 16702) may be determined in accordance with a current traffic and/or driving situation (e.g., with a weather condition). As an example, in a parking lot, a camera sensor module may have higher priority level than a LIDAR sensor module. As a further example, a RADAR sensor module may have higher priority than an Ultrasound sensor module during inclement weather.

The priority level may be determined in accordance with the field of view of the sensor module 16702. Illustratively, the priority level may be determined in accordance with the portions of the field of view of the sensor system 16700 described by the compressed sensor data. Different portions (e.g., regions) of the field of view of the sensor system 16700 may be classified according to a respective relevance (e.g., according to one or more relevance criteria, as described in relation to FIG. 150A to FIG. 1546 and to FIG. 162A to FIG. 164E). As an example, a region including a safety-critical object (or many objects), such as a fast moving vehicle, may be more relevant than a region not including such object. As a further example, a region close to a predefined location (e.g., close to the sensor system 16700 or close to the vehicle including the sensor system 16700) may be more relevant than a farther away region. An increasing priority level may be determined for the sensor module 1670 for increasing relevance of the regions covered by the sensor module 16702.

As a further example, the one or more processors 16712 may be configured to determine the data quality to be associated with the compressed sensor data based on available data transmission resources and/or memory resources associated with the one or more processors 16712. Illustratively, the data quality for the compressed sensor data may be determined based on the resources that may be dedicated to processing the compressed sensor data (and/or to storing the compressed sensor data or the processing results). The data quality may increase for increasing amount of available resources (e.g., increasing available processing power or storage space), e.g. the data compression rate may decrease.

The one or more processors 16714 may be configured to generate an instruction to provide compressed sensor data having different data quality depending on the portion of field of view associated thereto. Illustratively, the information received by the sensor module 16702 (e.g., by the data compression module 16706) may define or include different data qualities for different portions of the field of view of the sensor module 16702 (e.g., different compression rates for compressing sensor data associated with different portions of the field of view of the sensor module 16702). This may be illustratively described as a field of view prioritization at the sensor module level. The field of view of the sensor module 16702 may be partitioned into regions (e.g., segments) according to a respective relevance, as described above. The data quality associated with a region may increase for increasing relevance of that region.

The data compression module 16706 may be configured to select different data compression characteristics to compress the different portions of sensor data (e.g., associated with different segments of the field of view of the sensor module 16702), e.g. in accordance with the received instruction or information. A first data compression characteristic (e.g., a first data compression rate) may be selected to generate first compressed data. A second data compression characteristic (e.g., a second data compression rate) may be selected to generate second compressed data. The first compressed data may be associated with a first segment of the field of view of the sensor module 16702. The second compressed data may be associated with a second segment of the field of view of the sensor module 16702. The first data compression characteristic may be different from the second data compression characteristic. As an example, a data compression rate may increase for decreasing relevance of the associated segment of the field of view.

The one or more processors 16714 may be configured to determine the data quality for the compressed sensor data and/or the information defining the data qualify for the compressed sensor data based, at least in part, on data provided by one or more further communication interfaces 16716 of the sensor system 16700 (e.g., one or more further information-providing interfaces). The sensor system 16700 (e.g., the further communication interfaces 16716) may include at least one Global Positioning System interface **16716*a* configured to receive Global Positioning Information. The sensor system 16700 may include at least one Vehicle-to-Vehicle communication interface 16716*b*. The sensor system 16700 may include at least one Vehicle-to-Infrastructure (e.g., Vehicle-to-Environment) communication interface 16716*c*. The further communication interfaces 16716 may be configured to provide further data to the one or more processors 16714** (e.g., a traffic map may be provided via such interfaces).

The sensor system 16700 may be configured according to a distributed data architecture. Illustratively, data processing may be provided, at least in part, also at the sensor side. The sensor module 16702 (e.g., and the one or more further sensor modules **16702*b*) may be configured to implement one or more object recognition processes and/or one or more object classification processes. By way of example, the sensor module 16702 may include or be associated with a processor 16718 configured to process the sensor data provided by the sensor module (e.g., each further sensor module 16702*b* may include or be associated with a respective processor 16718*b***).

Illustratively, the sensor data (e.g., the compressed sensor data) provided to the data processing side may be processed or pre-processed sensor data. The sensor module 16702 may be configured to provide object-related data and/or classified object-related data based on the sensor data. By way of example, the sensor module 16702 may be configured to provide a list of objects (e.g., classified objects) with one or more properties associated thereto (e.g., location, size, distance from a predefined location, a type, etc.).

The data compression module 16706 may be configured to compress at least a portion of the object-related data (and/or of the classified object-related data) to provide compressed object-related data (and/or compressed classified object-related data). The data compression characteristic (e.g., the data compression rate or other characteristic) used for compressing the object-related data (and/or the classified object-related data) may be selected in accordance with the received information (e.g., defining a respective data quality for the object-related data and/or the classified object-related data).

FIG. 168A shows a sensor system 16800 in a schematic representation in accordance with various embodiments.

FIG. 168B and FIG. 168C show each a possible configuration of the sensor system 16800 in a schematic representation in accordance with various embodiments.

The sensor system 16800 may be an exemplary implementation of the sensor system 16700, e.g. an exemplary realization and configuration of the components of the sensor system 16700. It is understood that other configurations and components may be provided. The sensor system 16800 may be included, for example, in a vehicle (e.g., with automated driving capabilities).

The sensor system 16800 may include a sensor module 16802 configured to provide sensor data (e.g., configured to transmit sensor data, e.g. compressed sensor data). The sensor module 16802 may include a sensor 16804 configured to provide or generate a sensor signal (e.g., an analog sensor signal). The sensor module 16802 may be configured as the sensor module 16702 described above. The sensor 16804 may be configured as the sensor 16704 described above. The sensor module 16802 may be configured to provide sensor data from the sensor signal (e.g., from the plurality of sensor signals). By way of example, the sensor module 16802 may include an analog-to-digital converter to convert the analog sensor signal (e.g., a current, such as a photo current) into digital or digitized sensor data.

The sensor system 16800 may include one or more further sensor modules **16802*b*. The one or more further sensor modules 16802*b* may be configured as the one or more further sensor modules 16702*b*** described above.

The sensor system 16800 may include a compression module 16806. The compression module 16806 may be configured as the data compression module 16706 described above (e.g., the compression module 16806 may be configured to generate compressed sensor data). In the exemplary configuration illustrated in FIG. 168A, the sensor module 16802 may include the compression module 16806.

The sensor system 16800 may include a memory 16808. The memory 16808 may be configured as the memory 16708 described above (e.g., the memory 16808 may store data, e.g. sensor data (e.g., raw, compressed or pre-compressed)). In the exemplary configuration illustrated in FIG. 168A, the sensor module 16802 may include the memory 16808.

The sensor system 16800 may include a bidirectional communication interface 16810. The bidirectional communication interface 16810 may be configured as the bidirectional communication interface 16710 described above. The bidirectional communication interface 16810 may include a sender and receiver module 16812*s* associated with the sensor module 16802 (e.g., included in the sensor module 16802, in the exemplary configuration illustrated in FIG. 168A). The bidirectional communication interface 16810 may include a vehicle sender and receiver module 16812*v*.

The sensor system 16800 may include a fusion box 16814, e.g. a sensor fusion box. The fusion box 16814 may be configured as the one or more processors 16714 described above. The fusion box 16814 may be configured to receive data via the vehicle sender and receiver module 16810*v* (and to transmit data and/or instructions via the vehicle sender and receiver module 16810*v*). The fusion box 16814 may be configured to receive data from each sensor module (e.g., from the sensor module 16802 and each further sensor module 16802*b*).

The sensor system 16800 may include or be communicatively coupled with a vehicle electrical control system 16820. The vehicle electrical control system 16820 may be configured to carry out at least some of the operations carried out by the one or more processors 16714. The vehicle electrical control system 16820 may be configured to receive data via the vehicle sender and receiver module 16810*v* (and to transmit data and/or instructions via the vehicle sender and receiver module 16810*v*).

By way of example, the sensor fusion box 16814 and/or the vehicle electrical control system 16820 may be configured to determine a complexity score, for example by implementing or executing software instructions 16822 (e.g., stored in a further memory).

The sensor system 16800 may include one or more (e.g., further) communication interfaces 16816, such as at least one Global Positioning System interface, and/or at least one Vehicle-to-Vehicle communication interface, and/or at least one Vehicle-to-Infrastructure communication interface. The one or more communication interfaces 16816 may be configured as the one or more further communication interfaces 16716 described above. The fusion box 16814 and/or the vehicle electrical control system 16820 may be configured to receive data from the one or more communication interfaces 16816 (e.g., via the vehicle sender and receiver module 16810*v*).

As illustrated in FIG. 168A, the compression module 16806 may be configured to compress the sensor data, e.g. at least a portion of the sensor data, to generate compressed sensor data. The compression module 16806 may be configured to provide another portion of the sensor data to the memory 16808. Illustratively, the compression module 16806 may be configured to receive the sensor data from the sensor 16804 (e.g., digitized sensor data from the analog-to-digital converter).

The sensor system 16800 may be configured according to a centralized architecture (as illustrated in FIG. 168B) and/or according to a distributed architecture (as illustrated in FIG. 168C).

In a centralized architecture, as illustrated in FIG. 168B, the data provided by the various sensors or sensor modules (e.g., by a first sensor 16804-1, a second sensor 16804-2, and a third sensor 16804-3) may be transmitted to the data processing side of the sensor system 16800 (e.g., to the sensor fusion box 16814 and/or the vehicle electrical control system 16820) without being pre-processed (e.g., as raw data, optionally compressed). The data may be transmitted via the bidirectional communication interface 16810, e.g. an Ethernet interface.

The data processing may be performed at the data processing side. The data provided by the various sensor modules may be combined (e.g., fused) together (e.g., in the sensor fusion box 16814). One or more object recognition processes (and/or one or more object classification and/or tracking processes) may be carried out on the combined data. Instructions to control a driving of the vehicle may be calculated based on the results of data processing (e.g., a path or a route to be followed by the vehicle may be computed, e.g. by the vehicle electrical control system 16820).

In a distributed architecture, as illustrated in FIG. 168C, the data provided by the various sensors or sensor modules may be transmitted to the data processing side of the sensor system 16800 after an initial processing (e.g., pre-processing). By way of example, each sensor module may be configured to implement one or more object recognition processes. Illustratively, each sensor module may include or be associated with a respective processor (e.g., a first processor 16818-1, a second processor 16818-2, and a third processor 16818-3). Each processor may receive sensor data from a respective sensor.

Additional data processing may be performed at the data processing side. The processed data provided by the various sensor modules may be combined (e.g., fused) together (e.g., in the sensor fusion box 16814). Instructions to control a driving of the vehicle may be calculated based on the results of data processing (e.g., a path or a route to be followed is by the vehicle may be computed, e.g. by the vehicle electrical control system 16820).

In the following, various aspects of this disclosure will be illustrated:

Example 1ah is a sensor system. The sensor system may include a sensor module configured to provide sensor data. The sensor system may include a data compression module configured to compress at least a portion of the sensor data provided by the sensor module to generate compressed sensor data. The sensor system may include a bidirectional communication interface configured to provide the compressed sensor data. The bidirectional communication interface may be further configured to receive information defining a data quality associated with the compressed sensor data. The data compression module may be further configured to select a data compression characteristic used for generating the compressed sensor data in accordance with the received information.

In Example 2ah, the subject-matter of example 1ah can optionally include that the bidirectional communication interface includes at least one transmitter and at least one receiver.

In Example 3ah, the subject-matter of any one of examples 1ah or 2ah can optionally include that the received information includes a complexity score describing a level of complexity that defines, at least in part, how to process the compressed sensor data.

In Example 4ah, the subject-matter of any one of examples 1ah to 3ah can optionally include that the received information includes an SAE level associated with an autonomous driving that defines, at least in part, how to process the compressed sensor data.

In Example 5ah, the subject-matter of any one of examples 1ah to 4ah can optionally include that the received information includes an instruction describing a data quality of the compressed sensor data to be provided. The data compression module may be configured to select the data compression characteristic in accordance with the received instruction.

In Example 6ah, the subject-matter of any one of examples 1ah to 5ah can optionally include that the data compression module is further configured to select a first data compression characteristic to generate first compressed data and to select a second data compression characteristic to generate second compressed data. The first compressed data may be associated with a first portion of the field of view of the sensor module and the second compressed data may be associated with a second portion of the field of view of the sensor module. The first portion of the field of view may be different from the second portion of the field of view. The first data compression characteristic may be different from the second data compression characteristic.

In Example 7ah, the subject-matter of any one of examples 1ah to 6ah can optionally include a memory to store at least a portion of the sensor data not included in the compressed sensor data. The bidirectional communication interface may be further configured to receive a request to further provide at least a part of the sensor data which is not included in the compressed sensor data and which is stored in the memory.

In Example 8ah, the subject-matter of any one of examples 1ah to 7ah can optionally include that the sensor module is further configured to implement one or more object recognition processes using the sensor data to provide object-related data. The data compression module may be further configured to compress at least a portion of the object-related data to provide compressed object-related data. The received information may define a data quality associated with the compressed object-related data. The data compression module may be further configured to select a data compression characteristic used for generating the compressed object-related data in accordance with the received information.

In Example 9ah, the subject-matter of any one of examples 1ah to 8ah can optionally include that the data compression module is configured to implement at least one lossy compression algorithm.

In Example 10ah, the subject-matter of example 9ah can optionally include that the at least one lossy compression algorithm includes at least one algorithm selected from: quantization; rounding; discretization; transform algorithm; estimation-based algorithm; and prediction-based algorithm.

In Example 11ah, the subject-matter of any one of examples 1ah to 10ah can optionally include that the data compression module is configured to implement at least one lossless compression algorithm.

In Example 12ah, the subject-matter of example 11ah can optionally include that the at least one lossless compression algorithm includes at least one algorithm selected from: Run-length Encoding; Variable Length Coding; and Entropy Coding Algorithm.

In Example 13ah, the subject-matter of any one of examples 1ah to 12ah can optionally include that the sensor module is configured as a sensor type selected from a group of sensor types consisting of: LIDAR sensor; RADAR sensor; Camera sensor; Ultrasound sensor; and Inertial Measurement sensor.

In Example 14ah, the subject-matter of any one of examples 1ah to 13ah can optionally include at least one Global Positioning System interface to receive Global Positioning information.

In Example 15ah, the subject-matter of any one of examples 1ah to 14ah can optionally include at least one Vehicle-to-Vehicle communication interface.

In Example 16ah, the subject-matter of any one of examples 1ah to 15ah can optionally include at least one Vehicle-to-Infrastructure communication interface.

In Example 17ah, the subject-matter of any one of examples 1ah to 16ah can optionally include one or more processors configured to process compressed sensor data provided by the sensor module. The one or more processors may be further configured to generate information defining a data quality associated with the compressed sensor data and transmit the same to the sensor module.

In Example 18ah, the subject-matter of example 17ah can optionally include that the one or more processors are associated with a sensor fusion box.

In Example 19ah, the subject-matter of any one of examples 17ah or 18ah can optionally include that the one or more processors are further configured to implement one or more object recognition processes; and/or implement one or more object classification processes; and/or implement one or more object tracking processes.

In Example 20ah, the subject-matter of any one of examples 17ah to 19ah can optionally include that the one or more processors are further configured to determine a data quality to be associated with the compressed sensor data provided by the sensor module. The one or more processors may be further configured to generate an instruction to provide compressed sensor data having the determined data quality and transmit the same to the sensor module.

In Example 21ah, the subject-matter of any one of examples 17ah to 20ah can optionally include that the sensor system includes one or more further sensor modules. The one or more processors may be further configured to process sensor data provided by at least one further sensor module of the one or more sensor modules. The one or more processors may be further configured to determine the data quality to be associated with the compressed sensor data based on the sensor data provided by the at least one further sensor module.

In Example 22ah, the subject-matter of example 21ah can optionally include that at least one further sensor module of the one or more further sensor modules is of the same sensor type as the sensor module.

In Example 23ah, the subject-matter of any one of examples 17ah to 22ah can optionally include that the one or more processors are configured to assign a priority level to the compressed sensor data provided by the sensor module. The one or more processors may be further configured to determine the data quality to be associated with the compressed sensor data in accordance with the priority level assigned to the compressed sensor data.

In Example 24ah, the subject-matter of example 23ah can optionally include that the one or more processors are configured to determine the priority level to be assigned to the compressed sensor data provided by the sensor module based on the field of view of the sensor module.

In Example 25ah, the subject-matter of any one of examples 23ah or 24ah can optionally include that the one or more processors are configured to determine the data quality to be associated with the compressed sensor data based on available data transmission resources and/or memory resources associated with the one or more processors.

In Example 26ah, the subject-matter of example 8ah and any one of examples 17ah to 25ah can optionally include that the one or more processors are configured to process compressed object-related data provided by the sensor module. The one or more processors may be further configured to generate information defining a data quality associated with the compressed object-related data and transmit the same to the sensor module.

Example 27ah is a Vehicle, including one or more sensor systems according to any one of examples 1ah to 26ah.

Example 28ah is a method of operating a sensor system. The method may include a sensor module providing sensor data. The method may include compressing at least a portion of the sensor data provided by the sensor module to generate compressed sensor data. The method may include providing the compressed sensor data. The method may include receiving information defining a data quality associated with the compressed sensor data. The method may include selecting a data compression characteristic used for generating the compressed sensor data in accordance with the received information.

In Example 29ah, the subject-matter of example 28ah can optionally include that the received information includes a complexity score describing a level of complexity that defines, at least in part, how to process the compressed sensor data.

In Example 30ah, the subject-matter of any one of examples 28ah or 29ah can optionally include that the received information includes an SAE level associated with an autonomous driving that defines, at least in part, how to process the compressed sensor data.

In Example 31ah, the subject-matter of any one of examples 28ah to 30ah can optionally include that the received information includes an instruction describing a data quality of the compressed sensor data to be provided. The method may further include selecting the data compression characteristic in accordance with the received instruction.

In Example 32ah, the subject-matter of any one of examples 28ah to 31ah can optionally include selecting a first data compression characteristic to generate first compressed data and selecting a second data compression characteristic to generate second compressed data. The first compressed data may be associated with a first portion of the field of view of the sensor module and the second compressed data may be associated with a second portion of the field of view of the sensor module. The first portion of the field of view may be different from the second portion of the field of view. The first data compression characteristic may be different from the second data compression characteristic.

In Example 33ah, the subject-matter of any one of examples 28ah to 32ah can optionally include a memory storing at least a portion of the sensor data not included in the compressed sensor data. The method may further include receiving a request to further provide at least a part of the sensor data which is not included in the compressed sensor data and which is stored in the memory.

In Example 34ah, the subject-matter of any one of examples 28ah to 33ah can optionally include the sensor module implementing one or more object recognition processes using the sensor data to provide object-related data. The method may further include compressing at least a portion of the object-related data to provide compressed object related data. The received information may define a data quality associated with the compressed object related data. The method may further include selecting a data compression characteristic used for generating the compressed object related data in accordance with the received information.

In Example 35ah, the subject-matter of any one of examples 28ah to 34ah can optionally include that the data compressing includes at least one lossy compression algorithm.

In Example 36ah, the subject-matter of example 35ah can optionally include that the at least one lossy compression algorithm includes at least one algorithm selected from: quantization; rounding; discretization; transform algorithm; estimation-based algorithm; and prediction-based algorithm.

In Example 37ah, the subject-matter of any one of examples 28ah to 36ah can optionally include that the data compressing includes at least one lossless compression algorithm.

In Example 38ah, the subject-matter of example 37ah can optionally include that the at least one lossless compression algorithm includes at least one algorithm selected from: Run-length Encoding; Variable Length Coding; and Entropy Coding Algorithm.

In Example 39ah, the subject-matter of any one of examples 28ah to 38ah can optionally include that the sensor module is configured as a sensor type selected from a group of sensor types consisting of: LIDAR sensor; RADAR sensor; Camera sensor; Ultrasound sensor; and Inertial Measurement sensor.

In Example 40ah, the subject-matter of any one of examples 28ah to 39ah can optionally include at least one Global Positioning System interface receiving Global Positioning information.

In Example 41ah, the subject-matter of any one of examples 28ah to 40ah can optionally include at least one Vehicle-to-Vehicle communication interface.

In Example 42ah, the subject-matter of any one of examples 28ah to 41ah can optionally include at least one Vehicle-to-Infrastructure communication interface.

In Example 43ah, the subject-matter of any one of examples 28ah to 41ah can optionally include processing compressed sensor data provided by the sensor module. The method may further include generating information defining a data quality associated with the compressed sensor data and transmitting the same to the sensor module.

In Example 44ah, the subject-matter of example 43ah can optionally include implementing one or more object recognition processes; and/or implementing one or more object classification processes; and/or implementing one or more object tracking processes.

In Example 45ah, the subject-matter of any one of examples 43ah or 44ah can optionally include determining a data quality to be associated with the compressed sensor data provided by the sensor module. The method may further include generating an instruction to provide compressed sensor data having the determined data quality and transmitting the same to the sensor module.

In Example 46ah, the subject-matter of any one of examples 43ah to 45ah can optionally include one or more further sensor modules. The method may further include processing sensor data provided by at least one further sensor module of the one or more sensor modules. The method may further include determining the data quality to be associated with the compressed sensor data based on the sensor data provided by the at least one further sensor module.

In Example 47ah, the subject-matter of example 46ah can optionally include that at least one further sensor module of the one or more further sensor modules is of the same sensor type as the sensor module.

In Example 48ah, the subject-matter of any one of examples 43ah to 47ah can optionally include assigning a priority level to the compressed sensor data provided by the sensor module. The method may further include determining the data quality to be associated with the compressed sensor data in accordance with the priority level assigned to the compressed sensor data.

In Example 49ah, the subject-matter of example 48ah can optionally include determining the priority level to be assigned to the compressed sensor data provided by the sensor module based on the field of view of the sensor module.

In Example 50ah, the subject-matter of any one of examples 48ah or 49ah can optionally include determining the data quality to be associated with the compressed sensor data based on available data transmission resources and/or memory resources.

In Example 51ah, the subject-matter of example 34ah and any one of examples 43ah to 50ah can optionally include processing compressed object related data provided by the sensor module. The method may further include generating information defining a data quality associated with the compressed object related data and transmitting the same to the sensor module.

Example 52ah is a computer program product, including a plurality of program instructions that may be embodied in non-transitory computer readable medium, which when executed by a computer program device of a sensor system according to any one of examples 1ah to 26ah, cause the sensor system to execute the method according to any one of the examples 28ah to 51ah.

Example 53ah is a data storage device with a computer program that may be embodied in non-transitory computer readable medium, adapted to execute at least one of a method for sensor system according to any one of the above method examples, a sensor system according to any one of the above sensor system examples.

A conventional LIDAR system may be designed to operate is with the highest possible resolution and framerate allowed by the optoelectronic architecture for achieving the desired functionality. Such design may require a significant amount of digital signal processing (DSP). This may increase the power consumption, the data load which has to be handled, and the cost of the system. A high power consumption may also influence the thermal design, which in turn may limit the physical volume of the LIDAR system. A high data load may require the implementation of a sophisticated data compression algorithm.

In a conventional LIDAR system, a lower power consumption at the digital signal processing level may be achieved by compromising the performance, which may negatively impact the functionality of the LIDAR system. By way of example, the resolution and the framerate of a LIDAR measurement may be decreased. The resolution may be manipulated, for example, by omitting lines or columns in a scanning system or in a 2D-emitter array (e.g. a 2D VCSEL-array). A lower resolution frame may be obtained via an overview light emission mode or scanning mode. The field of view or the detection range may be reduced via the distribution of the emitted laser power.

Various embodiments may be related to adjusting the operation of a LIDAR system (e.g., of one or more components of the LIDAR system) to reduce or minimize a power consumption associated with digital signal processing while minimizing the negative effects on the performance or the functionality of the LIDAR system. Illustratively, this may be described as an optimization problem to be solved (e.g., in real time). A power consumption of the LIDAR system may be reduced while minimizing additional risks or dangers that may be related to the adjusted (e.g., reduced) operation of the LIDAR system. An adaptive process may be carried out (e.g., by one or more processors of the LIDAR system) to adjust one or more characteristics or parameters of the LIDAR system, which may be associated (e.g., directly or indirectly) with the power consumption of the LIDAR system. The process may include identifying one or more regions (also referred to as zones or areas) in the field of view of the LIDAR system that may be processed (e.g., detected and/or analyzed) with reduced parameters. The region-based approach may provide a reduction in the power consumption (and/or in the time required for imaging and/or analysis) while maintaining a desired level of reliability for the operation of the LIDAR system (e.g., a desired level of safety related to the driving of a vehicle including the LIDAR system).

In the context of the present application, for example in relation to FIG. 162 to FIG. 164E, the term "pixelation" may be used to describe an effect associated with the resolution, e.g. of an image. "Pixelation" may be an effect of low-resolution, e.g. of an image, which may result in unnatural appearances, such as sharp edges for a curved object and diagonal lines.

In the context of the present application, for example in relation to FIG. 162 to FIG. 164E, the term "blurriness" may be used to describe an effect associated with the framerate (illustratively, the rate at which subsequent frames or images are acquired). "Blurriness" may be an effect of low-framerate, which may result in a visual effect on sequences of images preventing an object to be perceived clearly or sharply. Illustratively, an object may appear hazy or indistinct in a blurred image.

In the context of the present application, for example in relation to FIG. 162 to FIG. 164E, the term "confidence level" may be used to describe a parameter, e.g. a statistical parameter, representing an evaluation of a correct identification and/or classification of an object, for example in an image. Illustratively, a confidence level may represent an estimate for a correct identification and/or classification of an object. The confidence level may be related to the accuracy and precision of an algorithm, as described in further detail below.

In various embodiments, a LIDAR system may be provided (e.g., the LIDAR Sensor System 10). The LIDAR system may be configured or equipped to provide a useful representation of its surroundings (illustratively, a representation of the environment in front of or surrounding the LIDAR system). Such representation may be of different types, as described in further detail below. By way of example, the LIDAR system may be included in a vehicle (e.g., a vehicle having automated driving capabilities). The LIDAR system may provide a representation of the surroundings of the vehicle.

The LIDAR system may include a sensor (e.g., the LIDAR sensor 52). The sensor may be configured to provide one or more sensor data representations (e.g., a plurality of sensor data representations). A sensor data representation may be a first type of representation of the surroundings of the LIDAR system. Illustratively, a sensor data representation may include a plurality of sensor data (e.g., of sensor signals) describing the surroundings of the LIDAR system (e.g., the field of view of the LIDAR system). By way of example, a sensor data representation may be or may include a point cloud, e.g. a LIDAR point cloud, such as a three-dimensional point cloud or a multi-dimensional point cloud (e.g., a four-dimensional point cloud). A three-dimensional point cloud (e.g., a raw three-dimensional point cloud) may include measured points of distance (e.g., a measured time-of-flight for each point), for example each with an associated timestamp. The three-dimensional point cloud may be provided without additional corrections (e.g., without corrections for the own vehicle properties). A multi-dimensional point cloud may include further measurement data, for example a four-dimensional point cloud may additionally include intensity data. A sensor data representation may be also referred to as sensor data image.

A sensor data representation may have a resolution. The resolution may represent or describe the number of sensor pixels (e.g., a number of photo diodes) used to detect the field of view (or a portion of the field of view). Illustratively, the resolution may represent or describe the number of sensor pixels used to generate the sensor data representation or a portion of the sensor data representation. Different portions of a sensor data representation may have different resolutions, as described in further detail below.

The LIDAR system may include one or more processors (e.g., a digital signal processing system). The one or more processors may be configured to process (e.g., to analyze) the sensor data representations. The one or more processors may be configured to determine (e.g., to identify or select) one or more regions in the sensor data representations (e.g., in at least one sensor data representation, for example in at least one measured three-dimensional point cloud). Illustratively, a region may be or may include a portion of a sensor data representation. By way of example, the one or more processors may be configured to determine a first region and a second region in at least one sensor data representation (e.g., in some or in each sensor data representation, for example in parallel).

Each region may have a data processing characteristic associated therewith. The data processing characteristics may be different for different regions. As an example, a first data processing characteristic may be associated with the first region and a second data processing characteristic may be associated with the second region. The second data processing characteristic may be different from the first data processing characteristic. Illustratively, the one or more processors may be configured to assign a respective data processing characteristic to each portion of a sensor data representation (illustratively, to each portion of the field of view of the LIDAR system). A region may be described as a portion or a group of portions of a sensor data representation each having the same data processing characteristic associated therewith. Illustratively, the one or more processors may be configured to determine a region in a sensor data representation by assigning a data processing characteristic to one or more portions of the sensor data representation.

A data processing characteristic may include or may represent a characteristic or a parameter to be used for processing the associated region of the sensor data representation (illustratively, the associated region of the field of view). Processing a region may be understood as processing the sensor data associated with that region and/or as detecting that region (e.g., generating the portion of sensor data representation including that region). By way of example, a data processing characteristic may represent a resolution to be used for processing the associated region or for detecting the associated region (e.g., a further sensor data representation may be acquired or generated having the assigned resolution for that region). As another example, a data processing characteristic may represent a framerate for detecting (e.g., for imaging) the associated region. As a further example, a data processing characteristic may represent a power consumption to be used for processing the associated region and/or for detecting the associated region (e.g., a power consumption associated with a light source of the LIDAR system, and/or with one or more electrical components of the LIDAR system, as described in further detail below). It is understood that a data processing characteristic may include or represent a combination of different data processing characteristics. Illustratively, a data processing characteristic associated with a region of a sensor data representation may represent or describe a resolution and/or a framerate and/or a power consumption to be used for processing that region. A data processing characteristic may also represent or describe other parameters related to processing.

The one or more processors may be configured to control the LIDAR system (e.g., at least one component of the LIDAR system) in accordance with the data processing characteristics of the determined regions (e.g., to process each region in accordance with the respective data processing characteristic). Illustratively, the one or more processors may be configured to adjust or adapt the operation (e.g., one or more operational parameters) of the LIDAR system in accordance with the assigned data processing characteristics. By way of example, the one or more processors may be configured to control at least one component of the LIDAR system to process the first region in accordance with the first data processing characteristic and to process the second region in accordance with the second data processing characteristic.

By way of example, the one or more processors may be configured to control at least one component to result in (e.g., to exhibit) different power consumptions for processing the different regions (e.g., to exhibit a first power consumption for processing the first region and a second power consumption for processing the second region). This may reduce a thermal load of the LIDAR system. A reduced thermal load may provide a more compact volume of the LIDAR system. As an example, the one or more processors may be configured to control a light source of the LIDAR system (e.g., to result in a target power consumption). Illustratively, the light source may be controlled to emit light (e.g., laser light) having different power into different regions (e.g., a first power in the first region and a second power in the second region, the second power being for example lower than the first power). This may increase the safety (e.g., laser safety) of the LIDAR system. As a further example, the one or more processors may be configured to control an electrical component of the LIDAR system (e.g., to result in a target power consumption). The electrical component may be selected from a group of electrical components consisting of one or more amplifiers, such as one or more transimpedance amplifiers, one or more analog-to-digital converters, and one or more time-to-digital converters. Illustratively, the electrical component may be controlled to exhibit different power consumption for performing operations associated with different regions (e.g., an amplifier may be controlled to exhibit a first power consumption for amplifying sensor signals associated with the first region and a second, e.g. lower, power consumption for amplifying sensor signals associated with the second region). This may reduce electromagnetic interference among various components (illustratively, this may provide electromagnetic interference compatibility). As a further example, the one or more processors may be configured to select a configuration for one or more other sensor systems (e.g., included in the vehicle, as described, for example, in relation to FIG. 123), e.g. a different configuration to be applied for processing different regions.

As another example, the one or more processors may be configured to control the LIDAR system to detect sensor data using different resolution and/or different framerate in different regions. The one or more processors may be configured to control emitter and/or receiver components (e.g., the light source, a scanning component, and/or a sensor) to detect sensor using different resolution and/or different framerate in different regions. Illustratively, the one or more processors may be configured to control the sensor to generate a sensor data representation having different resolution and/or different framerate in different regions. By way of example, the one or more processors may be configured to control the LIDAR system to detect sensor data in the first region using a first resolution and/or a first framerate and to detect sensor data in the second region using a second resolution and/or a second framerate. The first resolution may be different from the second resolution (e.g., higher or lower depending on the assigned data processing characteristic). Additionally or alternatively, the first framerate may be different from the second framerate. Illustratively, the resolution may be selected or assigned depending on the pixelation of a portion of the sensor data representation (e.g., of an object included in that portion, and/or on its properties and danger level, as described in further detail below). The framerate may be, for example, selected or assigned depending on a potential danger an object represents and may be assessed via blurriness and/or object type (illustratively, based on blurriness and/or object type), as described in further detail below.

In various embodiments, the one or more processors may be further configured to determine a region according to a relevance of that region (e.g., according to one or more relevance criteria, as described, for example, in relation to FIG. 150A to FIG. 154B). Illustratively, the one or more processors may be configured to assess or evaluate a relevance of one or more portions of a sensor data representation (e.g., one or more portions of the field of view of the LIDAR system), and assign the respective data processing characteristic (e.g., determine the respective region) accordingly, as described in further detail below. A more relevant region may be associated with a high data processing characteristic (e.g., higher than a less relevant region). A more relevant region may be processed, for example, with higher resolution and/or higher framerate and/or higher power consumption than a less relevant region. Only as an example, the one or more processors may select a core-zone (e.g., a core-region) of the field of view to process at high resolution. The exact shape and aspect-ratio of the core-zone at high-resolution may be dependent on system requirements and/or external factors (e.g., the velocity of the vehicle, weather conditions or traffic conditions, such as traffic densities and driving environments (city, motorway, off-road, and the like)). The core-zone may be, for example a zone or a region directly in front of the vehicle including the LIDAR system (e.g., a central portion of the field of view). The remaining area (e.g., the non-core zones, e.g. a peripheral portion) of the field of view may be processed at lower resolution. By way of example, the one or more processors may be configured to determine the first region as a core region and the second region as non-core region (e.g., a background region). A core zone may be fixed or it may be dynamically adjusted, as described in further detail below.

The one or more processors may be further configured to determine a region (e.g., the relevance of a portion of the field of view) according to information on the vehicle in which the LIDAR system may be included. As an example, the one or more processors may be configured to determine a region (e.g., a core zone) based on a planned trajectory or route of the vehicle. The information on the planned trajectory may be provided to the LIDAR system (e.g., to the one or more processors), for example by a sensor fusion system. The information on the planned trajectory may be determined or predicted from navigation information (e.g., from the steering of the vehicle, e.g. from a positioning system and the wheels direction). Illustratively, the one or more processors may be configured to superimpose the planned trajectory with the field of view of the LIDAR system to define a core zone (illustratively, a core region of interest) where the vehicle is expected to move.

By way of example, the LIDAR system may operate at full performance at the hardware level. Illustratively, the emitter and receiver components (e.g., the light source and the sensor) may operate at high resolution to generate high-resolution sensor data representations (e.g., a high-density three-dimensional point cloud). The frequency at which the sensor data representations are generated may be the maximum achievable by the hardware. Illustratively, the LIDAR system may operate at maximum framerate. A frame (e.g., a LIDAR frame) may be a single sensor data representation (e.g., a single three-dimensional or multi-dimensional point cloud). A frame may be generated with a timestamp. The one or more processors may be configured to process (e.g., analyze), the sensor data representations (e.g., a whole three-dimensional point cloud image) with low resolution and low framerate, e.g. as a default operation. The one or more processors may be configured to adapt the processing of the core region with higher resolution and framerate to increase the confidence level (e.g., associated with recognition and/or classification of objects in such region). The increase of resolution and framerate may be defined in discrete steps. As an example, the increase of resolution and framerate may be dependent on the velocity of the vehicle. In parallel, the one or more processors may process object detection in the whole field of view. In case one or more detected objects present a danger (e.g., to the vehicle), the one or more processors may be configured to create a region (e.g., a core zone) for each object and, for example, increase resolution and/or framerate according to an algorithm, as described in further detail below. In case the objects do not present a danger, the one or more processors may be configured to run those zones of the field of view in default operational mode (e.g., low resolution and low framerate). This may reduce the overall power consumption.

In various embodiments, the one or more processors may be configured to implement or to execute an object recognition process. Additionally or alternatively, the one or more processors may receive information related to an object recognition provided, for example, by a sensor fusion system of the vehicle (e.g., by a sensor fusion box). The one or more processors (and/or the senor fusion system) may be configured to apply the object recognition process to the sensor data representations (e.g., to at least one sensor data representation, e.g. to some or each sensor data representation, for example in parallel). The object recognition process may be applied to determine (e.g., to identify or select) the different regions (e.g., the first region and the second region). Illustratively, the object recognition process may be applied to determine the data processing characteristic to be associated with each portion of a sensor data representation (e.g., to each portion of the field of view).

The object recognition process may provide a list of one or more objects (illustratively, present or recognized in the respective sensor data representation). The list of objects may be a second type of representation of the surroundings of the LIDAR system. Each object may have one or more properties associated thereto, such as a position, a size, an orientation, or a distance (e.g., from a predefined location, such as from the LIDAR system or from the vehicle). Illustratively, the list of objects may be the result of processing (e.g., image processing) of the sensor data representation (e.g., of a three-dimensional point cloud). Each object may also have one or more additional properties or parameters associated thereto, such as a velocity (for example calculated via object tracking, e.g. by a sensor fusion system of the vehicle). Each object may have a timestamp associated thereto (e.g., representing an absolute or relative time point at which the object was detected, e.g. at which the sensor data representation including the object was generated).

Applying the object recognition process may include providing a recognition confidence level (e.g., for a sensor data representation as a whole or for each recognized object in a sensor data representation). The recognition confidence level may describe or represent an estimate for a correct identification of an object (e.g., of each object) in a sensor data representation. By way of example, the object recognition process may include a machine learning algorithm (e.g., the object recognition process may be implemented by a machine learning algorithm, for example by a neural network). The recognition confidence level may indicate a probability for the correct identification of the object (illustratively, a probability that an object has been correctly recognized).

In various embodiments, the one or more processors may be configured to implement or to execute an object classification process. Additionally or alternatively, the one or more processors may receive information related to an object classification provided, for example, by a sensor fusion system of the vehicle. The one or more processors (and/or the senor fusion system) may be configured to apply an object classification process to the sensor data representations (e.g., to at least one sensor data representation, e.g. to some or each sensor data representation, for example in parallel). The object classification process may be applied to determine (e.g., to identify or select) the different regions (e.g., the first region and the second region). Illustratively, the object classification process may be applied to determine the data processing characteristic to be associated with each portion of a sensor data representation (e.g., to each portion of the field of view). The object classification process may be applied subsequently to the object recognition process (e.g., based on the results of the object recognition process).

The object classification process may provide a list of one or more classified objects (illustratively, present in the respective sensor data representation and/or in the respective list of recognized objects). The list of classified objects may be a third type of representation of the surroundings of the LIDAR system. Each object may have a type (e.g., a class) associated thereto, such as car, truck, bicycle, pedestrian, and the like. Illustratively, the list of classified objects may be provided in a further processing stage on the list of objects provided with the image recognition process.

Applying the object classification process may include providing a classification confidence level (e.g., for a sensor data representation as a whole or for each classified object in a sensor data representation). The classification confidence level may describe or represent an estimate for a correct classification of an object (e.g., of each object) in a sensor data representation. By way of example, the object classification process may include a machine learning algorithm (e.g., the object classification process may be implemented by a machine learning algorithm, for example by a neural network). The classification confidence level may indicate a probability of the correct classification of the object (illustratively, a probability that an object has been correctly classified).

In various embodiments, the one or more processors may be configured to implement or to execute a danger identification process. Additionally or alternatively, the one or more processors may receive information related to danger identification provided, for example, by a sensor fusion system of the vehicle. The one or more processors (and/or the sensor fusion system) may be configured to apply a danger identification process to the sensor data representations (e.g., to at least one sensor data representation, e.g. to some or each sensor data representation, for example in parallel). The danger identification process may be applied to determine (e.g., to identify or select) the different regions (e.g., the first region and the second region). Illustratively, the danger identification process may determine (e.g., calculate or evaluate) a potential danger associated with each region (e.g., with the content of each region). Further illustratively, the danger identification process may be applied to determine the data processing characteristic to be associated with each portion of a sensor data representation (e.g., to each portion of the field of view). The one or more processors may be configured to adjust a range of acceptance for the confidence levels according to the result of the danger identification process, e.g., for the recognition confidence level and/or for the classification confidence level, as described in further detail below.

Applying the danger identification process may include determining (e.g., measuring or calculating) one or more characteristics of the content of the sensor data representations. The one or more characteristics may describe or may represent the content of a region and/or the behavior of the content of a region (e.g., of the first region and/or the second region). The content of a region may be, for example, an object. The one or more characteristics may include a distance of the content of a region from a predefined location (e.g., from the LIDAR system, or from the vehicle or a trajectory of the vehicle). The one or more characteristics may include a speed of the content of a region. The one or more characteristics may include a moving direction of the content of a region. The one or more characteristics may include a size of the content of a region. The one or more characteristics may include a type of the content of a region. The one or more characteristics may include a material and/or a weight and/or an orientation of the content of a region. Illustratively, applying the danger identification process may include providing a danger score value. The danger score value may represent (e.g., quantify) a potential danger (e.g., associated with an object or with a region). Applying the danger identification process may include combining at least some of the one or more characteristics with one another, for example directly or using weighting factors. The weighting factors may be static or may be dynamic, for example the weighting factors may be dependent on one or more LIDAR system-internal and/or LIDAR system-external factors (e.g., vehicle-internal and/or vehicle-external factors), such as weather condition, driving condition, and the like. By way of example, vehicle-internal factors (e.g., vehicle-specific parameters) may be derived from vehicle data as discrete and independent values or from a central sensor fusion system of the vehicle.

The danger identification process may provide a list of potential dangers, such as a car approaching a crossroads, a pedestrian running in front, a truck changing lane, and the like. Illustratively, the danger identification process may provide a list of one or more objects each associated with a respective danger level. The list of potential dangers may be a fourth type of representation of the surroundings of the LIDAR system.

The one or more processors (and/or a central sensor fusion system of the vehicle) may be configured to determine a potential danger associated with an object by using (e.g., by combining) the associated type with the associated one or more properties. Illustratively, the list of potential dangers may be provided in a further processing stage on the list of classified objects. By way of example, a high-danger may be associated with a pedestrian running in front of the vehicle. As another example, a mid-danger may be associated with a truck changing lane. As a further example, a low-danger may be associated with a vehicle moving away on a different lane, for example with a vehicle moving at a constant or a higher relative speed.

In various embodiments, the one or more processors may be configured to provide a dynamic adaptation of the regions. Illustratively, the one or more processors may be configured to modify the regions (e.g., the size, the number, or the location) according to the analysis of the sensor data representations (e.g., according to the object recognition, object classification, and/or danger identification). Further illustratively, the one or more processors may be configured to dynamically adapt the assignment of the respective data processing characteristic to portions of a sensor data representation (e.g., portions of the field of view) according to the result of one or more of the processes described above. By way of example, the core-zone for higher-resolution may be expanded to include a recognized or classified object or an additional core-zone may be created.

The adjustment (illustratively, the adaptation) may be performed according to the danger identification and/or to the confidence levels. One or more portions or zones within the field of view may be temporally resolved with a higher performance than in standard operation. By way of example, the resolution and/or framerate within portions or zones of the received point cloud may be dynamically adjusted in real-time.

In an exemplary scenario, a low-resolution zone may cover non-core areas of the field of view of the LIDAR system. A high-resolution zone may cover the core areas of the field of view. One or more objects may be detected as moving and potentially dangerous. Such objects may be annexed to the high-resolution zone in subsequent frames (e.g., subsequently generated sensor data representations) for further processing with a higher data quality (e.g., a new core zone may be determined). A non-moving object (e.g., outside the trajectory of the vehicle) may be considered as a low danger situation. Such object may not require a high-resolution zone (e.g., such object may be left out from the high-resolution zone).

In a further exemplary scenario, a first object (e.g., a first vehicle) may present a lower danger score than another second object (e.g., a second vehicle). The first object may be, for example, out of the planned route. The first object may be located closer (e.g., with respect to the second vehicle) to a predefined location (e.g., closer to the vehicle including the LIDAR system). A higher resolution may be provided for the first object in light of the closer proximity for object classification and for providing better-quality information (e.g., to be supplied to a sensor fusion system). The second object may be, for example, farther away but moving towards the direction and planned route. A higher resolution and a higher (e.g., faster) framerate may be provided for the second object to obtain more samples of the movement in time.

The resolution and/or the framerate of a sensor data representation may be decoupled from the resolution and/or the framerate for a specific object. Such decoupling may provide, for example, a focusing of the digital signal processing resources on zones that present a higher danger score. This may provide, for example, reducing the specifications for digital signal processing. This may provide, for example, cost savings in the bill of materials.

In various embodiments, the one or more processors may be configured to implement or follow an algorithm (e.g., a process flow) for determining the regions in a sensor data representation. As an example, in a first (e.g., simple) algorithm, blurriness and speed (e.g., of an object) may be used as main evaluation parameters. Illustratively, the algorithm may include object recognition. The algorithm may be applied (e.g., executed or repeated) per object, e.g. for each object in a sensor data representation (e.g., each object in the field of view). As another example, in a second (e.g., advanced) algorithm, object type and associated danger may be included as decision factors (e.g., for adjusting the framerate for that object, e.g. for the portion including that object). Illustratively, the algorithm may include (e.g., additionally) object classification. The algorithm may be applied per object or per classified object.

The one or more processors may be configured to evaluate the recognition confidence level (e.g., for an object, e.g. for each object or for each object type) with respect to predefined threshold levels. Illustratively, the one or more processors may be configured to evaluate each recognition confidence level associated with a sensor data representation. The one or more processors may be configured to determine whether the recognition confidence level is below a first predefined recognition confidence threshold. The one or more processors may be configured to determine whether a blurriness in the region of the sensor data representation including the object (illustratively, associated with the evaluated recognition confidence level) increases faster than a pixelation in that region, in case the recognition confidence level is below the first predefined recognition confidence threshold. Illustratively, the one or more processors may be configured to determine the effect that is preventing the object from being recognized with a satisfactory confidence level. The one or more processors may be configured to increase the framerate of that region in case the blurriness increases faster than the pixelation. The one or more processors may be configured to increase the resolution of that region in case the pixelation increases faster than the blurriness. Illustratively, the one or more processors may be configured to determine a region with a suitable data processing characteristic (or to include that region in another region with a suitable data processing characteristic) to increase the recognition confidence level.

Additionally or alternatively, the one or more processors may be configured to determine whether the recognition confidence level is below a second predefined recognition confidence threshold. The second predefined recognition confidence threshold may be greater than the first predefined recognition confidence threshold. The one or more processors may be configured to determine whether the recognition confidence level is within a predefined threshold acceptance range, in case the recognition confidence level is equal to or above the first predefined recognition confidence threshold and below the second predefined recognition confidence threshold.

The threshold acceptance range may be defined by or dependent on a potential danger associated with the object being evaluated (e.g., with a danger score for that object). Illustratively, a lower threshold (and/or a wider acceptance range) for the confidence level may be provided for a low-danger object (e.g., an object with a low-danger score) than for a high-danger object (e.g., an object with a high-danger score). The acceptance range may decrease (e.g., may be narrower) for a high-danger object. Further illustratively, a low-danger object may be recognized (and/or classified) with a lower confidence level than a high-danger object. The threshold acceptance range may be different for each object. The threshold acceptance range may vary over time, e.g. for an object. Illustratively, the threshold acceptance range may vary according to the behavior of the object (e.g., moving faster or slower, moving closer or farther away, etc.).

The one or more processors may be configured to maintain the data processing characteristic of the region in which the recognized object is included unchanged, in case the recognition confidence level is within the predefined threshold acceptance range. Illustratively, the one or more processors may be configured determine that the object is being processed with a proper data processing characteristic (e.g., a proper resolution, framerate, and/or processing power) in relation to its danger level.

The one or more processors may be configured to determine whether a blurriness in the region of the sensor data representation including the object is greater than a pixelation in that region, in case the recognition confidence level is not within the predefined threshold acceptance range and/or in case the recognition confidence level is equal to or above the second predefined recognition confidence threshold. The one or more processors may be configured to reduce the resolution of the region in which the recognized object is included, in case the blurriness is greater than the pixelation. The one or more processors may be configured to reduce the framerate of the region in which the recognized object is included, in case the pixelation is greater than the blurriness.

Illustratively, the recognition confidence level being equal to or above the second predefined recognition confidence threshold and/or the recognition confidence level being not within the predefined threshold acceptance range (e.g., higher than a maximum threshold) may indicate that the sensor data representation is processed (e.g., analyzed or generated) with unnecessarily high data processing characteristics (illustratively, it may indicate that the image is too good). The one or more processors may be configured to determine a region with a suitable (e.g., reduced) data processing characteristic (or to include that region in another region with a suitable data processing characteristic) to decrease the recognition confidence level (e.g., to bring the recognition confidence level within the threshold acceptance range).

Additionally or alternatively, the one or more processors may be configured to apply an object classification process to the sensor data representation providing a classification confidence level, in case the recognition confidence level is not below the first predefined recognition confidence threshold. The one or more processors may be configured to determine whether the classification confidence level is below a first predefined classification confidence threshold. The one or more processors may be configured to determine whether a blurriness in the region of the sensor data representation including the object increases faster than a pixelation in that region, in case the classification confidence level is below the first predefined classification confidence threshold. The one or more processors may be configured to increase the framerate of that region in case the blurriness increases faster than the pixelation. The one or more processors may be configured to increase the resolution of that region in case the pixelation increases faster than the blurriness.

Additionally or alternatively, the one or more processors may be configured to determine whether the classification confidence level is below a second predefined classification confidence threshold. The second predefined classification confidence threshold may be greater than the first predefined classification confidence threshold. The one or more processors may be configured to determine whether the classification confidence level is within a predefined classification threshold acceptance range, in case the classification confidence level is equal to or above the first predefined classification confidence threshold and below the second predefined classification confidence threshold.

The one or more processors may be configured to maintain the data processing characteristic of the region in which the recognized (and/or classified) object is included unchanged, in case the classification confidence level is within the predefined classification threshold acceptance range.

The one or more processors may be configured to determine whether a blurriness in the region of the sensor data representation including the object is greater than a pixelation in that region, in case the classification confidence level is not within the predefined threshold acceptance range and/or in case the classification confidence level is equal to or above the second predefined classification confidence threshold. The one or more processors may be configured to reduce the resolution of the region in which the recognized object is included, in case the blurriness is greater than the pixelation. The one or more processors may be configured to reduce the framerate of the region in which the recognized object is included, in case the pixelation is greater than the blurriness.

The algorithms controlling the adaptive determination of the regions (e.g., the adaptive resolution and framerate) may be configured such that the confidence levels are kept within the respective acceptable range (illustratively, within a predefined range of confidence values acceptable or required for a desired functionality). Illustratively, the acceptable range may be a property that provides operation of the LIDAR system at a lower power consumption for the desired functionality. The threshold acceptance range (e.g., a minimum threshold and a maximum threshold) may be varied depending on the LIDAR system and/or on the desired operation of the LIDAR system. A minimum threshold value (also referred to as low threshold value) may be, for example, in the range from about 60% to about 80%. A maximum threshold value (also referred to as high threshold value) may be, for example, in the range from about 80% to about 95%. A difference between the minimum threshold value and the maximum threshold value (e.g., a delta high-low) may be in range from about 10% to about 20%.

The threshold values and/or the acceptance range may be modified via software, e.g. in real-time. Illustratively, the operation of the LIDAR system may be controlled by means of software (e.g., the performance may be scaled up or down via software performance settings). This may provide flexibility to the LIDAR system and its operation. This may provide the LIDAR system to be applicable for various applications, such as passenger vehicles, robo-taxis, trucks, trains, and the like.

In various embodiments, the LIDAR system described herein may be included in a vehicle. The vehicle may include one or more processors (e.g., a control system) configured to control the vehicle in accordance with information provided by the LIDAR system. By way of example, an automated guided vehicle (AGV) may process its environment independently without a large power consumption penalty.

As another example, the LIDAR system described herein may be applied in logistics applications, such as cargo loading situations, movement of large vehicles at logistic centers and ports, equipping trucks or cranes, and the like.

As a further example, the LIDAR system described herein may be applied for automatic door control, for example for buildings and elevators. The LIDAR system may be configured to detect the presence of persons in a large field of view with low digital signal processing resources. The LIDAR system may be configured or able to focus resources on the detected persons and infer intention to decide on opening and closing doors. This may reduce opening and closing waiting times. This may optimize energy efficiency of the building by reducing the average time of thermal transfer between inside and outside air.

As a further example, the LIDAR system described herein may be applied or included in a traffic management system (e.g., included in a traffic light, a gate, a bridge, and the like). The system may be configured to detect the presence and type of vehicles and pedestrians and optimize the traffic flow, independently of the vehicles' automation. The system may be is configured to automatically re-route the traffic flow in case of accidents or other events.

FIG. 162A shows a LIDAR system 16200 in a schematic representation in accordance with various embodiments. FIG. 162B and FIG. 162C show each a sensor data representation 16204 in a schematic representation in accordance with various embodiments.

The LIDAR system 16200 may be or may be configured as the LIDAR Sensor System 10. By way of example, the LIDAR system 16200 may be configured as a Flash LIDAR system (e.g., as a Flash LIDAR Sensor System 10). As another example, the LIDAR system 16200 may be configured as a scanning LIDAR system (e.g., as a Scanning LIDAR Sensor System 10). The scanning LIDAR system may include a scanning component configured to scan the field of view of the scanning LIDAR system (illustratively, configured to sequentially direct the emitted light towards different portions of the field of view). By way of example, the scanning LIDAR system may include a scanning mirror (e.g., a MEMS mirror). It is understood that in FIG. 162 only some of the elements of the LIDAR system 16200 are illustrated and that the LIDAR system 16200 may include additional elements (e.g., one or more optical arrangements) as described, for example, in relation to the LIDAR Sensor System 10.

The LIDAR system 16200 may include a light source 42. The light source 42 may be configured to emit light (e.g., a light signal, such as a laser signal). Illustratively, the light source 42 may be configured to emit light to be detected by a sensor 52 of the LIDAR system 16200 (e.g., light emitted and reflected back towards the LIDAR system 16200). The light source 42 may configured to emit light in the infra-red or near infra-red range. By way of example, the light source 42 may configured to emit light having a wavelength in the range from about 800 nm to about 1600 nm, for example of about 905 nm. The light source 42 may include a laser source. As an example, the light source 42 may include one or more laser diodes (e.g., one or more edge-emitting laser diodes and/or one or more vertical cavity surface emitting laser diodes, for example arranged in a two-dimensional array).

By way of example, the light source 42 may include one or more light emitters (e.g., one or more emitter pixels), illustratively one or more partial light sources. The one or more light emitters may be arranged in an array, e.g. a one-dimensional array or a two-dimensional array.

The LIDAR system 16200 may include a sensor 52. The sensor 52 may include one or more photo diodes (illustratively, one or more sensor pixels each including or associated with a photo diode). The photo diodes may be of the same type or of different types (e.g., the one or more photo diodes may include one or more avalanche photo diodes, one or more single-photon avalanche photo diodes, and/or one or more silicon photo multipliers). The sensor 52 may include a plurality of photo diodes. The photo diodes may form an array (e.g., a detector array). By way of example, the photo diodes may be arranged in a one-dimensional array. Illustratively, the photo diodes may disposed along one direction (e.g., a vertical direction or a horizontal direction). As another example, the photo diodes may be arranged in a two-dimensional array. Illustratively, the photo diodes may disposed along two directions, e.g. a first (e.g., horizontal) direction and a second (e.g., vertical) direction, for example perpendicular to the first direction.

The sensor 52 may be configured to provide a plurality of sensor data representations 16204, e.g. a plurality of images or a plurality of point clouds (e.g., three-dimensional or multi-dimensional). By way of example, at least one sensor data representation 16204 (or some or all sensor data representations) may include a LIDAR point cloud (e.g., provided by the sensor 52). A sensor data representation 16204 may represent or describe the field of view of the LIDAR system 16200. The field of view may extend along a first direction 16254 (e.g., a horizontal direction) and along a second direction 16256 (e.g., a vertical direction), for example perpendicular to one another and each perpendicular to a third direction 16252 (e.g., along which an optical axis of the LIDAR system 16200 may be aligned). Illustratively, each photo diode (e.g., each sensor pixel) may be configured to provide a signal in response to light impinging onto the photo diode. A sensor data representation 16204 may be or may include the signals provided by some or all of the photo diodes (e.g., at a specific time point). The signals may be processed, e.g. a sensor data representation 16204 may include the processed signals. By way of example, the sensor 52 may include or be coupled with one or more sensor processors configured to process the signals provided by the one or more photo diodes. The one or more sensor processors may be configured to process the signals to provide one or more distance measurements (e.g., one or more time-of-flight measurements). Illustratively, the one or more sensor processors may be configured to process the signals to generate the plurality of sensor data representations 16204.

The LIDAR system 16200 (e.g., the sensor 52) may include one or more electrical components. The LIDAR system 16200 may include one or more signal converters, such as one or more time-to-digital converters and/or one or more analog-to digital converters By way of example, a time-to-digital converter may be coupled to a photo diode and configured to convert the signal provided by the coupled photo diode into a digitized signal. The digitized signal may be is related to the time point at which the photo diode signal was provided (e.g., observed, detected or captured). The LIDAR system 16200 may include one or more amplifiers (e.g., one or more transimpedance amplifiers). The one or more amplifiers may be configured to amplify a signal provided by the one or more photo diodes (e.g., to amplify a signal provided by each of the photo diodes). As an example, an analog-to-digital converter may be coupled downstream to an amplifier. The analog-to-digital converter may be configured to convert a signal (e.g., an analog signal) provided by the amplifier into a digitized signal.

The LIDAR system 16200 may include one or more processors 16202. The one or more processors 16202 may be configured to process (e.g., analyze) the sensor data representations 16204. Illustratively, the one or more processors 16202 may be coupled (e.g., communicatively) with the sensor 52. The one or more processors 16202 may be configured to determine a first region 16204-1 and a second region 16204-2 in at least one sensor data representation 16204. By way of example, the one or more processors 16202 may be configured to process in parallel one or more of the sensor data representations 16204 and to determine in each of the processed sensor data representations 16204 a respective first region 16204-1 and a respective second region 16204-2.

A first data processing characteristic may be associated with the first region 16204-1. A second data processing characteristic may be associated with the second region 16204-2. Illustratively, the one or more processors 16202 may be configured to assign the first data processing characteristic to a first portion of the sensor data representation 16204 (illustratively, to a first portion of the field of view of the LIDAR system 16200) to determine (e.g., select or define) the first region 16204-1. The one or more processors 16202 may be configured to assign the second data processing characteristic to a second portion of the sensor data representation 16204 (e.g., a second portion of the field of view) to determine the second region 16204-2. The first data processing characteristic may be different from the second data processing characteristic.

By way of example, the first region 16204-1 may have a first resolution and/or a first framerate associated therewith. The second region 16204-2 may have a second resolution and/or a second framerate associated therewith (e.g., different from the first resolution and/or from the first framerate). As another example, the first region 16204-1 may have a first power consumption associated therewith and the second region 16204-2 may have a second power consumption associated therewith (e.g., different from the first power consumption).

The one or more processors 16202 may be configured to assign the respective data processing characteristic to a portion (or more than one portion) of the sensor data representation 16204 according to a relevance of such portion. By way of example, the one or more processors 16202 may be configured to assign the first data processing characteristic (e.g., a high data processing characteristic, such as a high resolution and/or a high framerate) to a central portion of the sensor data representation 16204 (e.g., representing a central portion of the field of view of the LIDAR system 16200). Illustratively, the first region 16204-1 may correspond to a central portion of the field of view, as shown, as an example, in FIG. 162B. The one or more processors 16202 may be configured to assign the second data processing characteristic (e.g., a lower than the first data processing characteristic, such as a lower resolution and/or a lower framerate) to a peripheral portion of the sensor data representation 16204 (e.g., representing a peripheral portion of the field of view of the LIDAR system 16200). Illustratively, the second region 16204-2 may correspond to a peripheral portion of the field of view.

The shape of a region may be determined or selected according to a desired operation of the LIDAR system 16200, as described in further detail below. A region may have a regular shape or an irregular shape. By way of example, a region may have a symmetric shape, for example a polygonal shape or rectangular shape (as illustrated, for example, in FIG. 162B). As another example, a region may have an asymmetric shape (as illustrated, for example, in FIG. 162C).

The one or more processors 16202 may be configured to apply an object recognition process to the sensor data representations 16204 (e.g., to at least one sensor data representation 16204) to determine the respective first region 16204-1 and second region 16204-2 (and/or other, e.g. additional, regions). Illustratively, the object recognition process may provide a recognition of one or more objects in a sensor data representation 16204 (e.g., in the field of view of the LIDAR system 16200). The respective data processing characteristics may be assigned to the one or more portions of the sensor data representation 16204 including the one or more objects according to the respective properties of the objects. By way of example, a higher processing characteristic (e.g., a higher resolution and/or a higher framerate) may be assigned to a portion including an object which is closer to the LIDAR system 16200 compared to a portion including a more distant object. As another example, a lower data processing characteristic (e.g., a lower resolution and/or a lower framerate) may be assigned to a portion including an object farther away from the LIDAR system 16200 compared to a portion including a closer object. The object recognition process may provide a recognition confidence level (e.g., for an object or each object in a sensor data representation 16204). By way of example, the object recognition process may include a machine learning algorithm and the recognition confidence level may indicate a probability of the correct identification of the object (e.g., the recognition confidence level may be a score value of a neural network). Additionally or alternatively, the object recognition process may be executed in or by a LIDAR system-external device or processor, for example by a sensor fusion box of the vehicle including the LIDAR system 16200.

Additionally or alternatively, the one or more processors 16202 may be configured to apply an object classification process to the sensor data representations 16204 (e.g., to at least one sensor data representation 16204) to determine the respective first region 16204-1 and second region 16204-2 (and/or other, e.g. additional, regions). Illustratively, the object classification process may provide a classification of one or more objects in a sensor data representation 16204 (e.g., in the field of view of the LIDAR system 16200). The respective data processing characteristics may be assigned to the one or more portions of the sensor data representation 16204 including the one or more classified objects according to the respective type and properties of the objects. By way of example, a higher data processing characteristic (e.g., a higher resolution and/or a higher framerate) may be assigned to a portion including a moving car compared to a portion including a bystander. As another example, a lower data processing characteristic (e.g., a lower resolution and/or a lower framerate) may be assigned to a portion including a car compared to a portion including a truck. The object classification process may provide a classification confidence level (e.g., for an object or each object in a sensor data representation 16204). By way of example, the object classification process may include a machine learning algorithm and the classification confidence level may indicate a probability of the correct classification of the object (e.g., the recognition confidence level may be a score value of a neural network). Additionally or alternatively, the object classification process may be executed in or by a LIDAR system-external device or processor, for example by a sensor fusion box of the vehicle including the LIDAR system 16200.

Additionally or alternatively, the one or more processors 16202 may be configured to apply a danger identification process to the sensor data representations 16204 (e.g., to at least one sensor data representation 16204) to determine the respective first region 16204-1 and second region 16204-2 (and/or other, e.g. additional, regions). The danger identification process may determine a potential danger associated with the first region 16204-1 and/or associated with the second region 16204-2. Illustratively, the danger identification process may provide an evaluation of a danger or potential danger associated with a portion of the sensor data representation 16204 (e.g., with a portion of the field of view). The respective data processing characteristics may be assigned to the one or more portions of the sensor data representation 16204 according to the respective determined potential danger. By way of example, a higher data processing characteristic may be assigned to a portion including a car moving towards the LIDAR system 16200 (e.g., towards the vehicle) compared to a portion including a car moving away from the LIDAR system 16200. Additionally or alternatively, the danger identification process may be executed in or by a LIDAR system-external device or processor, for example by a sensor fusion box of the vehicle including the LIDAR system 16200.

The danger identification process may include determining at least one (e.g., one or more) characteristic of the content of the sensor data representations 16204 (e.g., of at least one sensor data representation 16204). Illustratively, the danger identification process may include determining at least one characteristic of one or more objects included in the sensor data representations 16204.

As an example, the danger identification process may include determining the distance of the content of the first region 16204-1 and/or the second region 16204-2 from a predefined location (e.g., from the LIDAR system 16200, or from the vehicle or a trajectory or planned trajectory of the vehicle). Illustratively, the danger identification process may include assigning a data processing characteristic to a portion of a sensor data representation 16204 according to a distance of the content of that portion from a predefined location. By way of example, a higher data processing characteristic may be assigned to a portion including an object located closer to the trajectory of the vehicle compared to a portion including an object located farther away.

As another example, the danger identification process may include determining the speed of the content of the first region 16204-1 and/or the second region 16204-2. Illustratively, the danger identification process may include assigning a data processing characteristic to a portion of a sensor data representation 16204 according to a speed of the content of that portion. By way of example, a higher data processing characteristic may be assigned to a portion including an object moving at a fast speed compared to a portion including an object moving at slow or slower speed.

As a further example, the danger identification process may include determining the moving direction of the content of the first region 16204-1 and/or the second region 16204-2. Illustratively, the danger identification process may include assigning a data processing characteristic to a portion of a sensor data representation 16204 according to the moving direction of the content of that portion. By way of example, a higher data processing characteristic may be assigned to a portion including an object moving towards the vehicle or towards the planned trajectory of the vehicle compared to a portion including an object moving away in a parallel direction or in another direction.

As a further example, the danger identification process may include determining the size of the content of the first region 16204-1 and/or the second region 16204-2. Illustratively, the danger identification process may include assigning a data processing characteristic to a portion of a sensor data representation 16204 according to the size of the content of that portion. By way of example, a higher data processing characteristic may be assigned to a portion including a large object (e.g., a bus or a truck) compared to a portion including a small or smaller object.

As a further example, the danger identification process may include determining the type of the content of the first region 16204-1 and/or the second region 16204-2. Illustratively, the danger identification process may include assigning a data processing characteristic to a portion of a sensor data representation 16204 according to the type of the content of that portion (for example, according to the output of the object classification process). By way of example, a higher or different data processing characteristic may be assigned to a portion including a motorized object (e.g., a car) compared to a portion including a non-motorized object (e.g., a bicycle).

The one or more processors 16202 may be configured to control at least one component of the LIDAR system 16200 in accordance with the data processing characteristics of the first region 16204-1 and of the second region 16204-2 (e.g., in accordance with the first data processing characteristic and with the second data processing characteristic). Illustratively, the one or more processors 16202 may be configured to control at least one component of the LIDAR system 16200 to process the first region 16204-1 and/or the second region 16204-2 with the respective data processing characteristic.

By way of example, the one or more processors 16202 may be configured to control the least one component to result in a first power consumption for processing the first region 16204-1 and in a second power consumption for processing the second region 16204-2. As an example, the one or more processors 16202 may be configured to control the light source 42, e.g. to have a first power consumption for illuminating the first region 16204-1 and a second (e.g., different, for example lower) power consumption for illuminating the second region 16204-2. Illustratively, the one or more processors 16202 may be configured to control the light source 42 to result in a target power consumption (e.g., in a first power consumption for emitting light towards the first region 16204-1 and in a second power consumption for emitting light towards the second region 16204-2). As another example, the one or more processors 16202 may be configured to control at least one electrical component (e.g., selected from a group consisting of one or more amplifiers, such as one or more transimpedance amplifiers, one or more analog-to-digital converters, and one or more time-to-digital converters), e.g. to result in a target power consumption. Illustratively, the one or more processors 16202 may be configured to control the electrical component to result in a first power consumption to process (e.g., to convert or amplify) a signal associated with the first region 16204-1 and in a second (e.g., different, for example lower) power consumption to process a signal associated with the second region 16204-2. As an example, an analog-to-digital converter (e.g., one or more analog-to-digital converters) may be controlled to provide a smaller sampling rate for a region having a lower data processing characteristic associated therewith.

As another example, the one or more processors 16202 may be configured to control the LIDAR system 16200 to detect sensor data in the first region 16204-1 using a first resolution and/or a first framerate and to detect sensor data in the second region 16204-2 using a second resolution and/or a second framerate. The second resolution may be different from the first resolution and/or the second framerate may be different from the first framerate. Illustratively, the one or more processors 16202 may be configured to control emitter and/or receiver components (e.g., the light source 42, the scanning component, and/or the sensor 52) to image the first region 16204-1 at the first resolution and/or at the first framerate and the second region 16204-2 at the second resolution and/or at the second framerate. The photo diodes (e.g., the sensor pixels) and/or the light emitters (e.g., the emitter pixels) may be, for example, binned together to provide the different resolutions (e.g., as described, for example, in relation to FIG. 150A to FIG. 154B). Some of the photo diodes may be turned off to provide a reduced framerate for a region (e.g., turned on and off according to the desired framerate).

As another example, the one or more processors 16202 may be configured to process the sensor data associated with first region 16204-1 using a first resolution and/or a first framerate and to process the sensor data associated with the second region 16204-2 using a second resolution and/or a second framerate. Only some of the sensor data associated with a region of the field of view may be processed to provide a reduced resolution (e.g., 70% of the sensor data or 50% of the sensor data). The sensor data associated with a region may be processed not for each sensor data representation 16204 to provide a reduced framerate (e.g., the sensor data associated with a region may be processed for a first sensor data representation 16204 but not for a second sensor data representation 16204, for example subsequent to the first sensor data representation 16204).

Figure 163A:
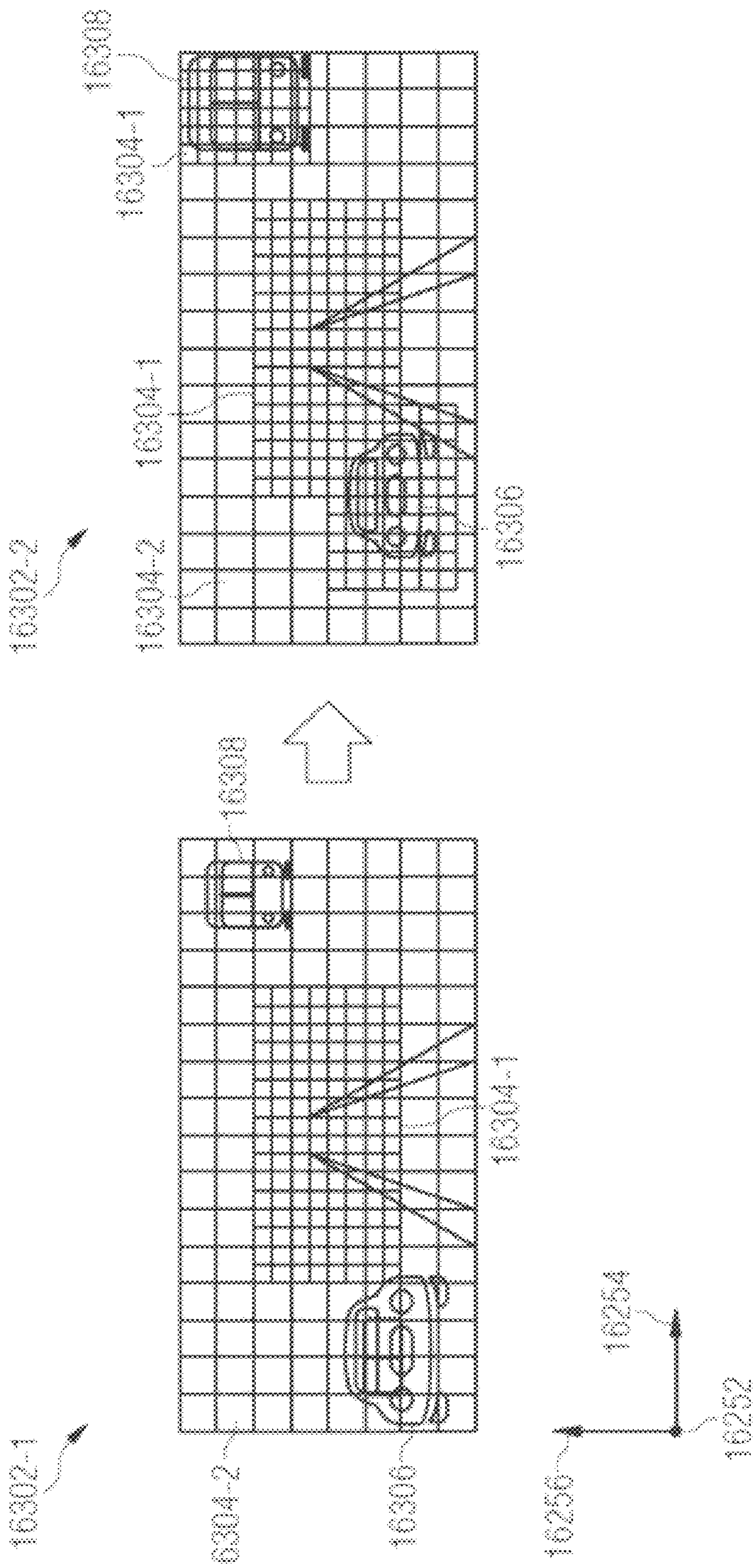
Figure 163B:
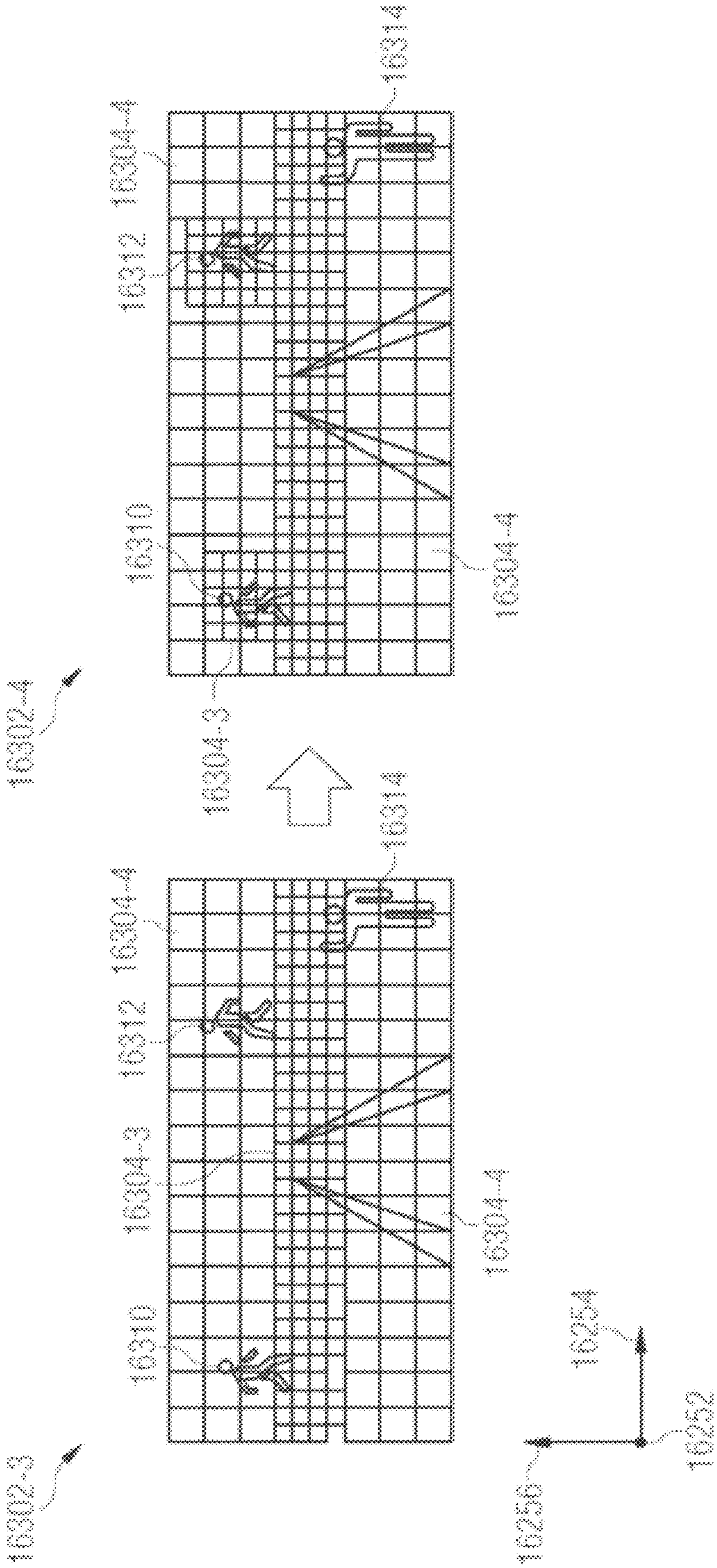
Figure 163D:
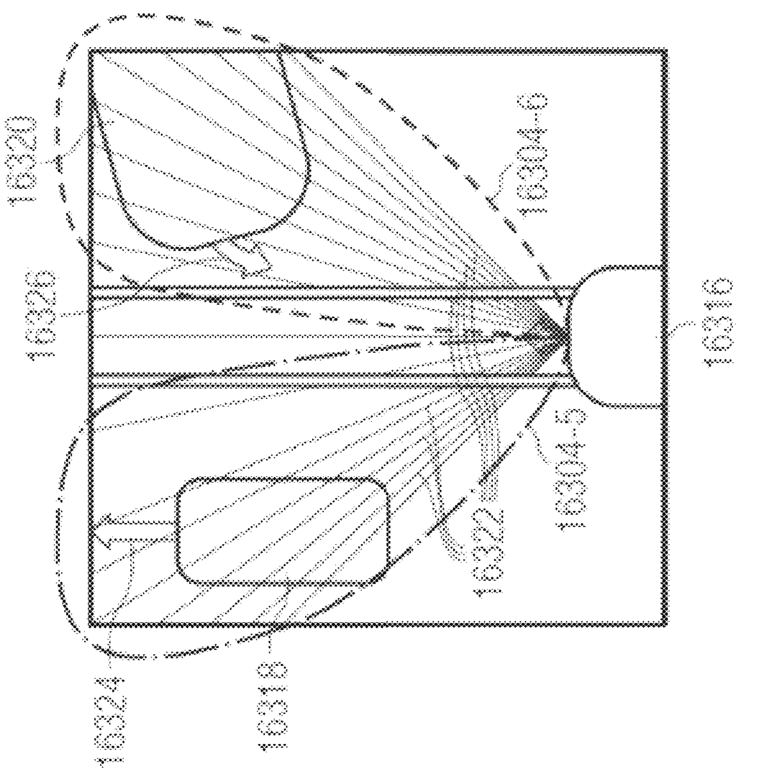
Figure 163C:
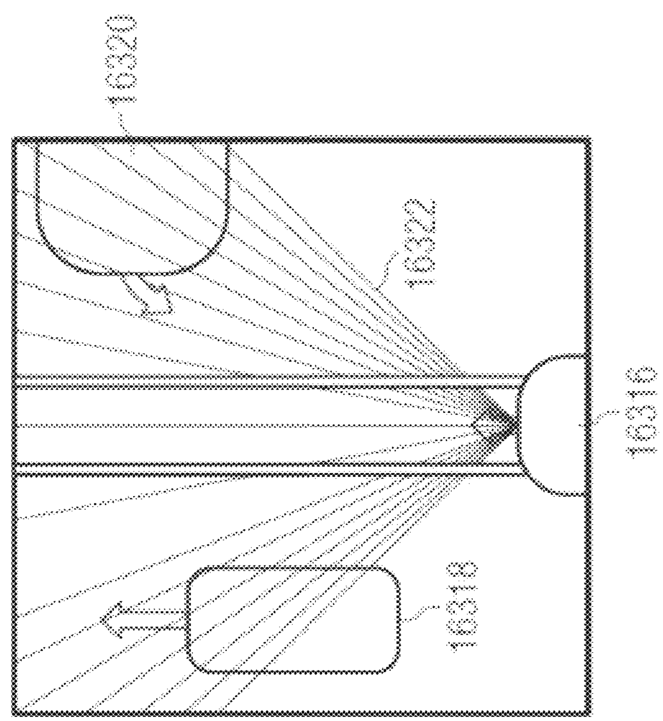

FIG. 163A to FIG. 163C show each a determination of the regions in a sensor data representation in a schematic representation in accordance with various embodiments. Each square of the grid (e.g., in FIG. 163A and FIG. 163B) may correspond or indicate a single element of the respective sensor data representation (e.g., a single element or a single point of the point cloud). It is understood that FIG. 163A to FIG. 163C illustrate cases or scenarios chosen only as examples to describe the operation of the LIDAR system 16200.

As illustrated, for example, in FIG. 163A and FIG. 163B, core areas of a sensor representation, e.g. core areas of the field of view, may be covered by a high-resolution zone (e.g., a first high-resolution zone 16304-1 and a third high-resolution zone 16304-3). The non-core areas of a sensor representation may be covered by a low-resolution zone (e.g., a second low-resolution zone 16304-2 and a fourth low-resolution zone 16304-4).

As illustrated, for example, in FIG. 163A, in a first sensor data representation 16302-1, the high-resolution zone 16304-1 may cover a central portion of the field of view of the LIDAR system 16200 and the low resolution zone 16304-2 may cover a peripheral portion (or all the peripheral portions) of the field of view.

A first object 16306 (e.g., a car) and a second object 16308 (e.g., a bus) may be present or appear in the field of view. The car 16306 and the bus 16308 may be detected as moving and potentially dangerous (e.g., according to their type and their speed and/or movement direction).

In a second sensor data representation 16302-2, the car 16302 and the bus 16304 may be annexed to the high-resolution zone 16304-1, e.g. to the first region 16204-1. The second sensor data representation 16302-2 may be subsequent to the first sensor data representation 16302-1 (e.g., captured and/or processed at a subsequent time point). Illustratively, in the second sensor data representation 16302-2 the high-resolution zone 16304-1 may be enlarged and/or a new (e.g., additional) high-resolution zone 16304-1 may be created to enclose the portions of the field of is view including the car 16306 and the bus 16308.

As illustrated, for example, in FIG. 163B, in a third sensor data representation 16302-3, a high-resolution zone 16304-3 may cover a central portion of the sensor data representation 16302-3, e.g. of the field of view of the LIDAR system 16200 (for example, extending along the entire horizontal direction of the field of view). A low-resolution zone 16304-4 may cover a peripheral portion of the sensor data representation 16302-3.

A third object 16310 (e.g., a first pedestrian) and a fourth object 16312 (e.g., a second pedestrian) and a fifth object 16314 (e.g., a bystander) may be present or appear in the field of view. The first pedestrian 16310 and the second pedestrian 16312 may be detected as moving and potentially dangerous (e.g., according to their type and movement direction, for example towards the center of the field of view). The bystander 16314 may be detected as not moving (and/or outside a trajectory of the vehicle). The bystander 16314 may be determined as a low-danger situation. In a fourth sensor data representation 16302-4 (e.g., subsequent to the third sensor data representation 16302-3), the first pedestrian 16310 and the second pedestrian 16312 may be annexed to the high-resolution zone 16304-3. The bystander 16314 may be left outside from the high-resolution zone 16304-3 (or only partially included in the high-resolution zone 16304-3).

FIG. 163C and FIG. 163D, shows a top view of an exemplary scenario including a vehicle 16316 equipped with the LIDAR system 16200 and two other objects in its field of view (e.g., a first vehicle 16318 and a second vehicle 16320). Initially, e.g. at a first time point t1, the LIDAR system 16200 is imaging the field of view at a first (e.g., low) resolution, e.g. with a first number of light rays or pulses 16322.

The first vehicle 16318 may present a lower danger score than the second vehicle 16320. The first vehicle 16318 may be, for example, outside of the planned route of the vehicle 16316 (and not moving towards the planned route, as indicated by the arrow 16324 pointing from the vehicle 16318). Illustratively, the first vehicle 16318 may be moving away from the vehicle 16316 at high speed, thus resulting in a low-danger situation.

The first vehicle 16318 may be located closer (e.g., with respect to the second vehicle 16320) to a predefined location, e.g., closer to the vehicle 16316 equipped with the LIDAR system 16200. A high resolution may be provided for the first vehicle 16318 in light of the closer proximity for object classification and for providing better-quality information (e.g., to be supplied to a sensor fusion system). Illustratively, a high-resolution zone 16304-5 may be determined in the portion of the field of view including the first vehicle 16318 (e.g., an increased number of light rays 16322 may be emitted). The representation in FIG. 163C and FIG. 163D may be described as a representation in polar coordinates (illustratively, with emphasis on the emission angle of the light emission). The representation in FIG. 163A and FIG. 163B may be described as a representation in Cartesian coordinates (illustratively, with emphasis on the division of the field of view in individual portions).

The second vehicle 16320 may be, for example, farther away but moving towards the direction and planned route of the vehicle 16316 (e.g., as indicated by the arrow 16326 pointing from the vehicle 16320). Illustratively, the second vehicle 16320 may be moving towards the vehicle 16316, for example at slow speed, thus resulting in a high-danger situation (e.g., the first vehicle 16318 may have a lower danger score than the second vehicle 16320). A high-resolution and a high-framerate zone 16304-6 may be provided for the second vehicle 16320 to obtain more samples of the movement in time. A high framerate may not be necessary for the first vehicle 16318 (e.g., the high-resolution zone 16304-5 may be a low framerate zone).

FIG. 164A and FIG. 164B show each a flow diagram of an algorithm in accordance with various embodiments.

As illustrated, for example, in FIG. 164A, a first (e.g., simple) algorithm 16400 may be based on object recognition. The one or more processors 16202 may execute more instances of the algorithm 16400 in parallel (e.g., to process multiple sensor data representations in parallel). The algorithm 16400 may include a start, in 16402, for example triggered or delayed via a timer.

The algorithm 16400 may include, in 16404, capturing an image (illustratively, generating a sensor data representation 16204).

The algorithm 16400 may include, in 16406, running object detection (illustratively, applying an object recognition process to the image). The object detection may provide a list of objects with the associated confidence levels. The object recognition process may be applied by the one or more processors 16202 and/or by a sensor fusion system in communication with the one or more processors 16202.

The following algorithm steps may be executed for each object in the list of objects. As an example, the following algorithm steps may be executed in parallel for some or all of the objects in the image.

The algorithm 16400 may include, in 16408, determining whether the object confidence level (illustratively, the recognition confidence level for an object) is low or high.

The algorithm 16400 may include, in 16410, determining whether a blurriness in the region of the image including the object increases faster than a pixelation in that region, in case the object confidence level is low (e.g., below a first predefined recognition confidence threshold). The algorithm 16400 may include, in 16412, increasing the framerate of that region in case the blurriness increases faster than the pixelation. The algorithm 16400 may include, in 16414, increasing the resolution of that region in case the blurriness does not increase faster than the pixelation. The algorithm 16400 may then include re-starting the process for the next image (e.g., capturing the next image with the adapted resolution or framerate). Illustratively, the algorithm 16400 may include capturing the next image, e.g. in a new step 16404, for example after a predefined delay.

The algorithm 16400 may include, in 16416, determining whether the object confidence level is within a predefined threshold acceptance range, in case the object confidence level is high (e.g., equal to or above the first predefined recognition confidence threshold and below a second predefined recognition confidence threshold). In case the object confidence level is within the predefined threshold acceptance range, the algorithm 16400 may include re-starting the process for the next image (e.g., capturing the next image without modifying the resolution or the framerate). Illustratively, the algorithm 16400 may include capturing the next image, e.g. in a new step 16404, for example after a predefined delay.

The algorithm 16400 may include, in 16418, determining whether a blurriness in the region of the image including the object is greater than a pixelation in that region, in case the object confidence level is not within the threshold acceptance range and/or in case the object confidence level is too high (e.g., above the second predefined recognition confidence threshold). The algorithm 16400 may include, in 16420, reducing the resolution of that region in case the blurriness is greater than the pixelation. The algorithm 16400 may include, in 16422, reducing the framerate of that region in case the blurriness is not greater than the pixelation. The algorithm 16400 may then include re-starting the process for the next image (e.g., capturing the next image with the adapted resolution or framerate). Illustratively, the algorithm 16400 may include capturing the next image, e.g. in a new step 16404, for example after a predefined delay.

As illustrated, for example, in FIG. 164B, a first (e.g., advanced) algorithm 16430 may be based on object classification. The one or more processors 16202 may execute more instances of the algorithm 16430 in parallel (e.g., to process multiple sensor data representations in parallel). The algorithm 16430 may include a start, in 16432, for example triggered or delayed via a timer.

The algorithm 16430 may include, in 16434, capturing an image (illustratively, generating a sensor data representation 16204).

The algorithm 16430 may include, in 16436, running object detection (illustratively, applying an object recognition process to the image). The object detection may provide a list of objects with the associated confidence levels. The object recognition process may be applied by the one or more processors 16202 and/or by a sensor fusion system in communication with the one or more processors 16202.

The following algorithm steps may be executed for each object in the list of objects. As an example, the following algorithm steps may be executed in parallel for some or all of the objects in the image.

The algorithm 16430 may include, in 16438, determining whether the object confidence level (illustratively, the recognition confidence level for an object) is low or high.

The algorithm 16430 may include, in 16440, determining whether a blurriness in the region of the image including the object increases faster than a pixelation in that region, in case the object confidence level is low (e.g., below a first predefined recognition confidence threshold). The algorithm 16430 may include, in 16442, increasing the framerate of that region in case the blurriness increases faster than the pixelation. The algorithm 16430 may include, in 16444, increasing the resolution of that region in case the blurriness does not increase faster than the pixelation. The algorithm 16430 may then include re-starting the process for the next image (e.g., capturing the next image with the adapted resolution or framerate). Illustratively, the algorithm 16430 may include capturing the next image, e.g. in a new step 16434, for example after a predefined delay.

The algorithm 16430 may include, in 16446, running a classifier (e.g., applying an object classification process to the image, e.g. for the object or each object), in case the object confidence level is high (e.g., not below the first predefined recognition confidence threshold). The classifier may provide a confidence level (e.g., a classification confidence level) for an object (e.g., for each object in the image, for example the classifier may provide a list of objects with the associated confidence levels).

The algorithm 16430 may include, in 16448, determining whether the classifier confidence level (illustratively, the classification confidence level for an object) is low or high. The algorithm 16430 may include proceeding to the algorithm step 16440 described above (and the associated algorithm steps 16442 or 16444, respectively) in case the classifier confidence level is low (e.g., below a first predefined classification confidence threshold).

The algorithm 16430 may include, in 16450, determining whether the classifier confidence level is within a predefined threshold acceptance range, in case the classifier confidence level is high (e.g., equal to or above the first predefined classification confidence threshold and below a second classification recognition confidence threshold). In case the classifier confidence level is within the predefined threshold acceptance range, the algorithm 16430 may include restarting the process for the next image (e.g., capturing the next image without modifying the resolution or the framerate). Illustratively, the algorithm 16430 may include capturing the next image, e.g. in a new step 16434, for example after a predefined delay.

The algorithm 16430 may include, in 16452, determining is whether a blurriness in the region of the image including the object is greater than a pixelation in that region, in case the classifier confidence level is not within the threshold acceptance range and/or in case the classifier confidence level is too high (e.g., above the second predefined classification confidence threshold). The algorithm 16430 may include, in 16454, reducing the resolution of that region in case the blurriness is greater than the pixelation. The algorithm 16430 may include, in 16456, reducing the framerate of that region in case the blurriness is not greater than the pixelation. The algorithm 16430 may then include re-starting the process for the next image (e.g., capturing the next image with the adapted resolution or framerate). Illustratively, the algorithm 16430 may include capturing the next image, e.g. in a new step 16434, for example after a predefined delay.

A processing according to the algorithm 16400 or according to the algorithm 16430 may illustratively correspond to determining (e.g., recognizing or classifying) one or more objects and determining the one or more regions accordingly (e.g., one region assigned to each object or associated with each object). The one or more regions may overlap, at least partially. This type of processing may be an alternative (or an addition) to a processing in which the field of view of the LIDAR system 16200 is divided into a core-area (e.g., a central region) and a non-core area (e.g., every other portion of the field of view), as described above. It is understood that the processing may also be carried out with a combination of the two approaches described above.

FIG. 164C shows a graph 16458 describing a confidence level varying over time in accordance with various embodiments. FIG. 164D shows a graph 16460 describing a threshold acceptance range varying over time in accordance with various embodiments. FIG. 164E shows a determination of the threshold acceptance range in a schematic representation in accordance with various embodiments.

The first algorithm 16400 and the second algorithm 16430 is may be configured to maintain a confidence level (e.g., the object confidence level and/or the classifier confidence level, illustratively the recognition confidence level and/or the classification confidence level) within the predefined acceptance range.

As shown, for example, in the graph 16458 in FIG. 164C, a confidence level (e.g., associated with a sensor data representation of an object) may vary as a function of time, as represented by the star symbol in the graph 16458. The confidence level may vary as a result of the adjustments implemented with one of the algorithms (e.g., as a result of the adapted resolution and/or framerate). The confidence level may vary as a result of varying properties of the associated object (or sensor data representation). Illustratively, the confidence level may vary in case the object varies its speed or its location (e.g., the confidence level may decrease in case the object moves faster or farther away). The algorithms may provide adjustments to bring the confidence level within the acceptance range 16462 (e.g., between a threshold low-level 164621 and a threshold high-level **16462*h***) in case the confidence level becomes too high or too low.

As shown, for example, in the graph 16460 in FIG. 164D, the acceptance range 16462 for a confidence level (e.g., associated with a sensor data representation of with an object) may vary as a function of time (and/or as a function of a danger score associated with the sensor data representation or the object). By way of example, a first (e.g., wide) acceptance range 16462-1 may be provided at a first time point (and/or for a first danger score) and a second (e.g., different, for example narrower) acceptance range 16462-2 may be provided at a second time point (and/or for a second danger score). Illustratively, the acceptance range 16462 (e.g., the values for the threshold low-level 164621 and/or threshold high-level **16462*h*) may vary as a result of varying properties of the associated object (or sensor data representation). As an example, an acceptance range 16462 may vary in case an object varies its motion direction or its speed (e.g., the acceptance range 16462** may become narrower in case the object starts moving towards the vehicle or the trajectory of the vehicle).

The adaptation of the acceptance range 16462 may be carried out, for example, by the one or more processors 16202 (and/or by a sensor fusion system), as illustrated in FIG. 164E. Illustratively, the adaptation of the acceptance range 16462 may be implemented via software. The threshold low-level 164621 (e.g., a minimum threshold value) and the threshold high-level **16462*h*** (e.g., a maximum threshold value) may be determined (e.g., calculated) based on the results of the danger identification process.

The threshold low-level 164621 and the threshold high-level **16462*h* associated with an object may be determined as a function of the danger score associated with that object. The danger score may be determined (e.g., calculated) for each recognized object and/or each classified object. The danger score may be determined taking into consideration a first input 16464-1 describing a list of recognized objects with the associated confidence levels. Additionally or alternatively, the danger score may be determined taking into consideration a second input 16464-2 describing a list of classified objects with the associated confidence levels. Additionally or alternatively, the danger score may, optionally, be determined taking into consideration the vehicle's own velocity, e.g. taking into consideration an input 16464-3** describing the vehicle's own velocity (illustratively, higher threshold values may be provided in case the vehicle is moving at a faster speed). The danger score for an object may be determined taking into consideration (e.g., combining) one or more properties of the object (e.g., distance, velocity, size). The parameters or the properties used for determining the danger score may be combined with one another, for example with respective weighting factors (e.g., weighting parameters).

In the following, various aspects of this disclosure will be illustrated:

Example 1af is a LIDAR Sensor System. The LIDAR Sensor System may include a sensor including one or more photo diodes and configured to provide a plurality of sensor data representations. The LIDAR Sensor System may include one or more processors configured to determine a first region and a second region in at least one sensor data representation of the plurality of sensor data representations. A first data processing characteristic may be associated with the first region and a second data processing characteristic may be associated with the second region. The one or more processors may be configured to control at least one component of the LIDAR Sensor System in accordance with the first data processing characteristic and with the second data processing characteristic.

In Example 2af, the subject-matter of example 1af can optionally include that controlling at least one component of the LIDAR Sensor System includes controlling the least one component of the LIDAR Sensor System to result in a first power consumption for processing the first region and in a second power consumption for processing the second region.

In Example 3af, the subject-matter of any one of examples 1af or 2af can optionally include that controlling at least one component of the LIDAR Sensor System includes controlling the one or more processors to result in a first power consumption for processing the first region and in a second power consumption for processing the second region.

In Example 4af, the subject-matter of any one of examples 1af to 3af can optionally include a light source configured to emit light to be detected by the sensor. Controlling at least one component of the LIDAR Sensor System may include controlling the light source.

In Example 5af, the subject-matter of example 4af can optionally include that the light source includes one or more laser diodes.

In Example 6af, the subject-matter of any one of examples 1af to 5af can optionally include that controlling at least one component of the LIDAR Sensor System includes controlling a power consumption of at least one electrical component selected from a group of electrical components consisting of: one or more amplifiers; one or more analog-to-digital converters; and one or more time-to-digital converters.

In Example 7af, the subject-matter of any one of examples 1af to 6af can optionally include that controlling at least one component of the LIDAR Sensor System includes controlling the LIDAR Sensor System to detect sensor data in the first region using a first resolution and/or a first framerate and to detect sensor data in the second region using a second resolution and/or a second framerate. The second resolution may be different from the first resolution and/or the second framerate may be different from the first framerate.

In Example 8af, the subject-matter of any one of examples 1af to 7af can optionally include that the one or more processors are further configured to assign the first data processing characteristic to a first portion of the at least one sensor data representation to determine the first region and to assign the second data processing characteristic to a second portion of the sensor data representation to determine the second region.

In Example 9af, the subject-matter of any one of examples 1af to 8af can optionally include that determining the first region and the second region includes applying an object recognition process to the at least one sensor data representation of the plurality of sensor data representations.

In Example 10af, the subject-matter of example 9af can optionally include that applying an object recognition process includes providing a recognition confidence level representing an estimate for a correct identification of an object in the at least one sensor data representation of the plurality of sensor data representations.

In Example 11 af, the subject-matter of example 10af can optionally include that the object recognition process includes a machine learning algorithm. The recognition confidence level may indicate a probability of the correct identification of the object.

In Example 12af, the subject-matter of any one of examples 10af or 11 of can optionally include that the one or more processors are further configured to determine whether the recognition confidence level is below a first predefined recognition confidence threshold; and in case the recognition confidence level is below the first predefined recognition confidence threshold, determine whether a blurriness in a region of the at least one sensor data representation of the plurality of sensor data representations in which the recognized object is included increases faster than a pixelation in said region; in case the blurriness increases faster than the pixelation, increase the framerate of the region in which the recognized object is included; and in case the blurriness does not increase faster than the pixelation, increase the resolution of the region in which the recognized object is included.

In Example 13af, the subject-matter of any one of examples 10af to 12af can optionally include that the one or more processors are further configured to determine whether the recognition confidence level is below a second predefined recognition confidence threshold, wherein the second predefined recognition confidence threshold is greater than a first predefined recognition confidence threshold; in case the recognition confidence level is equal to or above the first predefined recognition confidence threshold and below the second predefined recognition confidence threshold, determine whether the recognition confidence level is within a predefined threshold acceptance range; in case the recognition confidence level is within the predefined threshold acceptance range, maintain the data processing characteristic of the region in which the recognized object is included unchanged; and in case the recognition confidence level is not within the predefined threshold acceptance range, determine whether a blurriness in a region of the at least one sensor data representation of the plurality of sensor data representations in which the recognized object is included is greater than a pixelation in said region; in case the blurriness is greater than the pixelation, reduce the resolution of the region in which the recognized object is included; and in case the blurriness is not greater than the pixelation, reduce the framerate of the region in which the recognized object is included.

In Example 14af, the subject-matter of any one of examples 10af to 13af can optionally include that the one or more processors are further configured to determine whether the recognition confidence level is below a second predefined recognition confidence threshold, wherein the second predefined recognition confidence threshold is greater than a first predefined recognition confidence threshold; and in case the recognition confidence level is equal to or above the second predefined recognition confidence threshold, determine whether a blurriness in a region of the at least one sensor data representation of the plurality of sensor data representations in which the recognized object is included is greater than a pixelation in said region; in case the blurriness is greater than the pixelation, reduce the resolution of the region in which the recognized object is included; and in case the blurriness is not greater than the pixelation, reduce the framerate of the region in which the recognized object is included.

In Example 15af, the subject-matter of any one of examples 10af to 14af can optionally include that the one or more processors are further configured to determine whether the recognition confidence level is below a first predefined recognition confidence threshold; and in case the recognition confidence level is not below the first predefined recognition confidence threshold, apply an object classification process to the at least one to sensor data representation of the plurality of sensor data representations providing a classification confidence level representing an estimate for a correct classification of an object in a region of the at least one sensor data representation of the plurality of sensor data representations in which the recognized object is included; and determine whether the classification confidence is level is below a first predefined classification confidence threshold; in case the classification confidence level is below the first predefined classification confidence threshold, determine whether a blurriness in the region of the at least one sensor data representation of the plurality of sensor data representations including the recognized object increases faster than a pixelation in said region; in case the blurriness increases faster than the pixelation, increase the framerate of the region in which the recognized object is included; and in case the blurriness does not increase faster than the pixelation, increase the resolution of the region in which the recognized object is included.

In Example 16af, the subject-matter of example 15af can optionally include that the one or more processors are further configured to determine whether the classification confidence level is below a second predefined classification confidence threshold, wherein the second predefined classification confidence threshold is greater than the first predefined classification confidence threshold; and in case the classification confidence level is equal to or above the first predefined classification confidence threshold and below the second predefined classification confidence threshold, determine whether the classification confidence level is within a predefined classification threshold acceptance range; in case the classification confidence level is within the predefined classification threshold acceptance range, maintain a data processing characteristic of the region, in which the recognized object is included, unchanged; and in case the classification confidence level is not within the predefined classification threshold acceptance range, determine whether a blurriness in the region of the at least one sensor data representation of the plurality of sensor data representations in which the recognized object is included is greater than a pixelation in said region; in case the blurriness is greater than the pixelation, reduce the resolution of the region in which the recognized object is included; and in case the blurriness is not greater than the pixelation, reduce the framerate of the region in which the recognized object is included.

In Example 17af, the subject-matter of any one of examples 15af or 16af can optionally include that the one or more processors are further configured to determine whether the classification confidence level is below a second predefined classification confidence threshold, wherein the second predefined classification confidence threshold is greater than the first predefined classification confidence threshold; and in case the classification confidence level is equal to or above the second predefined classification confidence threshold, determine whether a blurriness in a region of the at least one sensor data representation of the plurality of sensor data representations in which the recognized object is included is greater than a pixelation in said region; in case the blurriness is greater than the pixelation, reduce the resolution of the region in which the recognized object is included; and in case the blurriness is not greater than the pixelation, reduce the framerate of the region in which the recognized object is included.

In Example 18af, the subject-matter of any one of examples 1 af to 17af can optionally include that determining the first region and the second region includes applying an object classification process to the at least one sensor data representation of the plurality of sensor data representations.

In Example 19af, the subject-matter of example 18af can optionally include that applying an object classification process to the at least one sensor data representation of the plurality of sensor data representations includes providing a classification confidence level representing an estimate for a correct classification of an object in the at least one sensor data representation of the plurality of sensor data representations.

In Example 20af, the subject-matter of example 19af can optionally include that the object classification process includes a machine learning algorithm. The classification confidence level may indicate a probability of the correct classification of the object.

In Example 21af, the subject-matter of any one of examples 1af to 20af can optionally include that determining the first region and the second region includes applying a danger identification process determining a potential danger associated with the first region and/or associated with the second region.

In Example 22af, the subject-matter of example 21af can optionally include that applying a danger identification process includes determining at least one of the following characteristics of the content of the at least one sensor data representation of the plurality of sensor data representations: distance of the content of the first region and/or the second region from a predefined location; speed of the content of the first region and/or the second region; moving direction of the content of the first region and/or the second region; size of the content of the first region and/or the second region; and type of the content of the first region and/or the second region.

In Example 23af, the subject-matter of any one of examples 1af to 22af can optionally include that at least one sensor data representation of the plurality of sensor data representations includes a LIDAR point cloud received by the sensor.

Example 24af is a vehicle, including a LIDAR Sensor System of any one of examples 1af to 23af. The vehicle may include one or more processors configured to control the vehicle in accordance with information provided by the LIDAR Sensor System.

Example 25af is a method of operating a LIDAR Sensor System. The method may include a sensor including one or more photo diodes providing a plurality of sensor data representations. The method may include determining a first region and a second region in at least one sensor data representation of the plurality of sensor data representations. A first data processing characteristic may be associated with the first region and a second data processing characteristic may be associated with the second region. The method may include controlling at least one component of the LIDAR Sensor System in accordance with the first data processing characteristic and with the second data processing characteristic.

In Example 26af, the subject-matter of example 25af can optionally include that controlling at least one component of the LIDAR Sensor System includes controlling the least one component of the LIDAR Sensor System to result in a first power consumption for processing the first region and in a second power consumption for processing the second region.

In Example 27af, the subject-matter of any one of examples 25af or 26af can optionally include that controlling at least one component of the LIDAR Sensor System includes controlling one or more processors to result in a first power consumption for processing the first region and in a second power consumption for processing the second region.

In Example 28af, the subject-matter of any one of examples 25af to 27af can optionally include a light source emitting light to be detected by the sensor. Controlling at least one component of the LIDAR Sensor System may include controlling the light source.

In Example 29af, the subject-matter of example 28af can optionally include that the light source includes one or more laser diodes.

In Example 30af, the subject-matter of any one of examples 25af to 29af can optionally include that controlling at least one component of the LIDAR Sensor System includes controlling at least one electrical component selected from a group of electrical components consisting of: one or more amplifiers; one or more analog-to-digital converters; and one or more time-to-digital converters.

In Example 31af, the subject-matter of any one of examples 25af to 30af can optionally include that controlling at least one component of the LIDAR Sensor System includes controlling the LIDAR Sensor System to detect sensor data in the first region using a first resolution and/or a first framerate and to detect sensor data in the second region using a second resolution and/or a second framerate. The second resolution may be different from the first resolution and/or the second framerate may be different from the first framerate.

In Example 32af, the subject-matter of any one of examples 25af to 31af can optionally include assigning the first data processing characteristic to a first portion of the at least one sensor data representation to determine the first region and assigning the second data processing characteristic to a second portion of the sensor data representation to determine the second region.

In Example 33af, the subject-matter of any one of examples 25af to 32af can optionally include that determining the first region and the second region includes applying an object recognition process to the at least one sensor data representation of the plurality of sensor data representations.

In Example 34af, the subject-matter of example 33af can optionally include that applying an object recognition process to the at least one sensor data representation of the plurality of sensor data representations includes providing a recognition confidence level representing an estimate for a correct identification of an object in the at least one sensor data representation of the plurality of sensor data representations.

In Example 35af, the subject-matter of example 34af can optionally include that the object recognition process includes a machine learning algorithm. The recognition confidence level may indicate a probability of the correct identification of the object.

In Example 36af, the subject-matter of any one of examples 34af or 35af can optionally include determining whether the recognition confidence level is below a first predefined recognition confidence threshold; and in case the recognition confidence level is below the first predefined recognition confidence threshold, determining whether a blurriness in a region of the at least one sensor data representation of the plurality of sensor data representations in which the recognized object is included increases faster than a pixelation in said region; in case the blurriness increases faster than the pixelation, increasing the framerate of the region in which the recognized object is included; and in case the blurriness does not increase faster than the pixelation, increasing the resolution of the region in which the recognized object is included.

In Example 37af, the subject-matter of any one of examples 34af to 36af can optionally include determining whether the recognition confidence level is below a second predefined recognition confidence threshold, wherein the second predefined recognition confidence threshold is greater than a first predefined recognition confidence threshold; and in case the recognition confidence level is equal to or above the first predefined recognition confidence threshold and below the second predefined recognition confidence threshold, determining whether the recognition confidence level is within a predefined threshold acceptance range; in case the recognition confidence level is within the predefined threshold acceptance range, maintain the data processing characteristic of the region in which the recognized object is included unchanged; and in case the recognition confidence level is not within the predefined threshold acceptance range, determining whether a blurriness in a region of the at least one sensor data representation of the plurality of sensor data representations in which the recognized object is included is greater than a pixelation in said region; in case the blurriness is greater than the pixelation, reducing the resolution of the region in which the recognized object is included; and in case the blurriness is not greater than the pixelation, reducing the framerate of the region in which the recognized object is included.

In Example 38af, the subject-matter of any one of examples 34af to 37af can optionally include determining whether the recognition confidence level is below a second predefined recognition confidence threshold, wherein the second predefined recognition confidence threshold is greater than a first predefined recognition confidence threshold; and in case the recognition confidence level is equal to or above the second predefined recognition confidence threshold, determining whether a blurriness in a region of the at least one sensor data representation of the plurality of sensor data representations is greater than a pixelation in said region; in case the blurriness is greater than the pixelation, reducing the resolution of the region in which the recognized object is included; and in case the blurriness is not greater than the pixelation, reducing the framerate of the region in which the recognized object is included.

In Example 39af, the subject-matter of any one of examples 25af to 38af can optionally include determining whether the recognition confidence level is below a first predefined recognition confidence threshold; and in case the recognition confidence level is not below the first predefined recognition confidence threshold, applying an object classification process to the at least one sensor data representation of the plurality of sensor data representations providing a classification confidence level representing an estimate for a correct classification of an object in a region of the at least one sensor data representation of the plurality of sensor data representations in which the recognized object is included; and determining whether the classification confidence level is below a first predefined classification confidence threshold; in case the classification confidence level is below the first predefined classification confidence threshold, determining whether a blurriness in the region of the at least one sensor data representation of the plurality of sensor data representations including the recognized object increases faster than a pixelation in said region; in case the blurriness increases faster than the pixelation, increasing the framerate of the region in which the recognized object is included; and in case the blurriness does not increase faster than the pixelation, increasing the resolution of the region in which the recognized object is included.

In Example 40af, the subject-matter of example 39af can optionally include determining whether the classification confidence level is below a second predefined classification confidence threshold, wherein the second predefined classification confidence threshold is greater than the first predefined classification confidence threshold; and in case the classification confidence level is equal to or above the first predefined classification confidence threshold and below the second predefined classification confidence threshold, determining whether the classification confidence level is within a predefined classification threshold acceptance range; in case the classification confidence level is within the predefined classification threshold acceptance range, maintain a data processing characteristic of the region, in which the recognized object is included, unchanged; and in case the classification confidence level is not within the predefined classification threshold acceptance range, determining whether a blurriness in the region of the at least one sensor data representation of the plurality of sensor data representations in which the recognized object is included is greater than a pixelation in said region; in case the blurriness is greater than the pixelation, reducing the resolution of the region in which the recognized object is included; and in case the blurriness is not greater than the pixelation, reducing the framerate of the region in which the recognized object is included.

In Example 41af, the subject-matter of any one of examples 39af or 40af can optionally include determining whether the classification confidence level is below a second predefined classification confidence threshold, wherein the second predefined classification confidence threshold is greater than the first predefined classification confidence threshold; and in case the classification confidence level is equal to or above the second predefined classification confidence threshold, determining whether a blurriness in a region of the at least one sensor data representation of the plurality of sensor data representations in which the recognized object is included is greater than a pixelation in said region; in case the blurriness is greater than the pixelation, reducing the resolution of the region in which the recognized object is included; and in case the blurriness is not greater than the pixelation, reducing the framerate of the region in which the recognized object is included.

In Example 42af, the subject-matter of any one of examples 25af to 41af can optionally include that determining the first region and the second region includes applying an object classification process to the at least one sensor data representation of the plurality of sensor data representations.

In Example 43af, the subject-matter of example 42af can optionally include that applying an object classification process to the at least one sensor data representation of the plurality of sensor data representations includes providing a classification confidence level representing an estimate for a correct classification of an object in the at least one sensor data representation of the plurality of sensor data representations.

In Example 44af, the subject-matter of example 43af can optionally include that the object classification process includes a machine learning algorithm. The classification confidence level may indicate a probability of the correct classification of the object.

In Example 45af, the subject-matter of any one of examples 25af to 44af can optionally include that determining the first region and the second region includes applying a danger identification process determining a potential danger associated with the first region and/or associated with the second region.

In Example 46af, the subject-matter of example 45af can optionally include that applying a danger identification process includes determining at least one of the following characteristics of the content of the at least one sensor data representation of the plurality of sensor data representations: distance of the content of the first region and/or the second region from a predefined location; speed of the content of the first region and/or the second region; moving direction of the content of the first region and/or the second region; size of the content of the first region and/or the second region; and type of the content of the first region and/or the second region.

In Example 47af, the subject-matter of any one of examples 25af to 46af can optionally include that at least one sensor data representation of the plurality of sensor data representations includes a LIDAR point cloud received by the sensor.

Example 48af is a method of operating a vehicle. The method may include operating a LIDAR Sensor System of any one of examples 25af to 47af. The method may include controlling the vehicle in accordance with information provided by the LIDAR Sensor System.

Example 49af is a computer program product, including a plurality of program instructions that may be embodied in non-transitory computer readable medium, which when executed by a computer program device of a LIDAR Sensor System of any one of examples 1af to 23af or a vehicle of example 24af cause the LIDAR Sensor System or the vehicle to execute the method of any one of the examples 25af to 48af.

Example 50af is a data storage device with a computer program that may be embodied in non-transitory computer readable medium, adapted to execute at least one of a method for LIDAR Sensor System or a vehicle of any one of the above method examples, a LIDAR Sensor System or a vehicle of any one of the above LIDAR Sensor System or vehicle examples.

Chapter "Data Usage"

It is advantageous for better object recognition if the object located in the field of view (FOV) is provided with a marker. This marker is excited or activated by the pulses of the distance measuring unit (LIDAR Sensor System) and then emits a marker radiation. In this marker radiation, object information for the detection of the object is deposited. The marker radiation is then detected by a radiation detector, which may or may not be part of the distance measuring unit of a LIDAR Sensor Device, and the object information is assigned to the object.

The distance measuring unit can be integrated into a LIDAR Sensor Device (e.g. motor vehicle), in particular to support a partially or fully autonomous driving function. The object provided with the marker may be, for example, another road user, such as another motor vehicle or a pedestrian or cyclist, but also, for example, a road sign or the like may be provided with the marker, or a bridge with a certain maximum permissible load capacity, or a passage with a certain maximum permissible height.

As soon as the object is located in the object field, i.e. in the field of view (FOV), of the distance measuring unit, the marker is excited or activated in some implementations by the electromagnetic distance measuring radiation and in turn emits the marker radiation. This is detected by the radiation detector, which in this example is part of the motor vehicle (which has the emitting distance measuring unit), and an evaluation unit of the motor vehicle can associate the object information with the object. The object can be assigned to a specific object class, which can be displayed to the vehicle driver or taken into account internally in the course of the partially or fully autonomous driving function. Depending on whether it is, for example, a pedestrian at the roadside or a lamppost, the driving strategy can be adapted accordingly (for example greater safety distance in the case of the pedestrian).

By contrast, with the object information stored or embedded in the marker radiation, a reliable classification is possible if objects which fall into different classes of objects are provided with markers which differ in the respective object information stored in the marker radiation. For example, in comparison to the above-mentioned image evaluation methods, the markers can shorten the recognition times. Other object recognition methods, such as, for example, the evaluation of point clouds, are of course still possible, the marker-based recognition can also represent an advantageous supplement.

The way in which the object information is evaluated or derived from the detector signal of the radiation detector or read out can also depend in detail on the structure of the radiation detector itself. If the object information is, for example, frequency-coded, i.e. emit markers with different wavelengths assigned to different object classes, an assignment to the respective marker can already be created by a corresponding filtering of a respective sensor surface. With a respective sensor surface, the respective marker radiation can then only be detected if it has the "suitable" wavelength, namely passes through the filter onto the sensor surface. In that regard, the fact that a detection signal is output at all can indicate that a certain marker is emitting, that is, whose object information is present. On the other hand, however, the object information of the marker radiation can also be modulated, for example (see below in detail), so it can then be read out, for example, by a corresponding signal processing.

As already mentioned above, the marker radiation emitted by the marker (M) is different from any distance measuring radiation which is merely reflected at a Purely Reflective Marker (MPR). Therefore, in contrast to a purely reflected distance measurement radiation that allows information processing with respect to the location or the position of the marker in the object space, the emitted marker (M) radiation contains additional or supplemental information usable for quick and reliable object detection. The marker (M) radiation may differ in its frequency (wavelength) from the employed distance measuring radiation, alternatively or additionally, the object information may be modulated on the marker (M) radiation.

In a preferred embodiment, the marker (M) is a passive marker (PM). This emits the passive marker radiation (MPRA) upon excitation with the distance measuring radiation, for example due to photo-physical processes in the marker material. The marker radiation (MPRA) has in some embodiments a different wavelength than the distance measuring radiation, wherein the wavelength difference may result as an energy difference between different states of occupation. In general, the marker radiation (MPRA) can have a higher energy than the distance measurement radiation (so-called up-conversion), i.e. have a shorter wavelength. In some embodiments, in a down-conversion process the marker radiation (MPRA) has a lower energy and, accordingly, a longer wavelength than the distance measuring radiation.

In a preferred embodiment, the passive marker is a fluorescence marker (in general, however, a phosphorescence marker would also be conceivable, for example). It can be particularly advantageous to use nano-scale quantum dots (for example from CdTe, ZnS, ZnSe, o ZnO), because their emission properties are easily adjustable, that is to say that specific wavelengths can be defined. This also makes it possible to determine a best wavelength for a particular object class.

In another preferred embodiment, the marker is an active marker (MA). This has a photo-electrical radiation receiver and a photo-electrical radiation transmitter, the latter emitting the active marker radiation (MAR) upon activation of the marker by irradiation of the radiation receiver with the distance measuring radiation. The receiver can be, for example, a photodiode, as a transmitter, for example, a light-emitting diode (LED) can be provided. An LED typically emits relatively wide-angle (usually lambertsch), which may be advantageous in that then the probability is high that a portion of the radiation falls on the radiation detector (of the distance measuring system).

A corresponding active marker (MA) may further include, for example, a driver electronics for the radiation transmitter and/or also signal evaluation and logic functions. The transmitter can, for example, be powered by an integrated energy source (battery, disposable or rechargeable). Depending on the location or application, transmitter and receiver, and if available other components, may be assembled and housed together. Alternatively or additionally, however, a receiver can also be assigned to, for example, one or more decentralized transmitters.

The marker (MA, MP) may, for example, be integrated into a garment, such as a jacket. The garment as a whole can then be equipped, for example, with several markers which either function independently of one another as decentralized units (in some embodiments housed separately) or share certain functionalities with one another (e.g. the power supply and/or the receiver or a certain logic, etc.). Irrespective of this in detail, the present approach, that is to say the marking by means of marker radiation, can even make extensive differentiation possible in that, for example, not the entire item of clothing is provided with the same object information. Related to the person wearing the garment then, for example, arms and/or legs other than the torso may be marked, which may open up further evaluation possibilities. On the other hand, however, it may also be preferred that, as soon as an object is provided with a plurality of markers, they carry the same object information, in particular of identical construction.

In a preferred embodiment, the marker radiation of the active marker (MA) modulates the object information. Though an exclusively wavelength-coded back-signal may be used (Passive Marker MP) with benefit, the modulation of the active (MA) marker radiation can, for example, help to increase the transferable wealth of information. For example, additional data on position and/or movement trajectories may be underlaid. Additionally or alternatively, the modulation may be combined with wavelength coding. The distance measuring radiation and the modulated marker radiation may have in some embodiments the same wavelength. Insofar as spectral intensity distributions are generally compared in this case (that is to say of “the same” or “different” wavelengths), this concerns a comparison of the dominant wavelengths, that is to say that this does not imply discrete spectra (which are possible, but not mandatory).

The object information can be stored, for example, via an amplitude modulation. The marker radiation can also be emitted as a continuous signal, the information then results from the variation of its amplitude over time. In general, the information can be transmitted with the modulation, for example, Morse code-like, it can be used based on common communication standards or a separate protocol can be defined.

In a preferred embodiment, the marker radiation is emitted as a discrete-time signal, that is, the information is stored in a pulse sequence. In this case, a combination with an amplitude modulation is generally possible, it is in some implementations an alternative. The information can then result, in particular, from the pulse sequence, that is, its number and/or the time offset between the individual pulses.

As already mentioned, the marker radiation in a preferred embodiment has at least one spectral overlap with the distance measurement radiation, that is, the intensity distributions have at least one common subset. In some embodiments, it may be radiation of the same wavelength. This can result in an advantageous integration to the effect that the detector with which the marker radiation is received is part of the distance measuring unit. The same detector then detects the marker radiation on the one hand and the distance measurement radiation reflected back from the object space on the other hand.

A further embodiment relates to a situation in which a part of the distance measurement radiation is reflected on the object as an echo pulse back to the distance measuring unit. The active marker then emits the marker radiation in a preferred embodiment such that this echo pulse is amplified; in other words, the apparent reflectivity is increased. Alternatively or in addition to the coding of the object category, the detection range of the emitting distance measuring unit can therefore also be increased.

It is described a method and a distance measuring system for detecting an object located in an object space in which method a distance measuring pulse is emitted into the object space with a signal delay-based distance measuring unit, wherein the object is provided with a marker which, upon the action of the distance measuring pulse, generates an electromagnetic marker. Radiation emitted in which an object information for object detection is stored, wherein the marker radiation detected with an electric radiation detector and the object information for object recognition is assigned to the object. The marker radiation may differ in its spectral properties from the distance measuring radiation, since the object information can be wavelength-coded. Between the activation by irradiation and the emission of the radiation emitter may be a time offset which is at most 100 ns.

In modern road traffic, an increasing discrepancy is emerging between “intelligent” vehicles equipped with a variety of communication tools, sensor technologies and assistance systems and “conventional” or technically less equipped road users like pedestrians and cyclists depending on their own human senses, i.e. substantially registering optical and acoustic signals by their eyes and ears, for orientation and associating risks of danger. Further, pedestrians and cyclists are facing increasing difficulties in early recognition of warning signals by their own senses due to the ongoing development on the vehicle side like battery powered vehicles and autonomous driving. As a popular example, battery powered vehicles emit significant less noise as vehicles with combustion engines. Consequently, electric vehicles may be already too close before being detected by a pedestrian or cyclist to react proper.

On the other hand, conventional road users like pedestrians and cyclists also de-pend on being detected correctly by vehicles driving autonomously. Further, the software controlling the autonomous driving sequence and the vehicle has to provide an adequate procedure in response to the detection of other traffic participants, including conventional road users like pedestrians and cyclist as well as others, e.g. motorcyclists and third party vehicles. Possible scenarios may be e.g. adapting the speed of the vehicle or maintaining a distance when passing or decelerate to avoid a collision or initiating an avoidance maneuver or others. In the event of twilight or darkness, further requirements arise for autonomous vehicles. Another challenge are the individual characteristics of traffic participants not following distinct patterns making it exceedingly difficult to be taken into account and managed by mathematical algorithms and artificial intelligence methods.

Pedestrians and cyclists are currently used to traditional non-autonomously driving vehicles with combustion engines and are able to usually recognize an upcoming risk intuitively and without significant attentiveness, at least as long as they are not distracted. Such distraction is increasing due to the omnipresence of smartphones and their respective use causing optical and mental distraction or the use of acoustic media devices overlaying surrounding sounds. Further, the established ways of non-verbal communication between traffic participants by eye contact, mimic and gestures cannot be implemented in autonomous vehicles without enormous efforts, if at all.

Different approaches to enable the communication between autonomous vehicles and other traffic participants are under discussion, e.g. lightbars, displays on the exterior of the vehicle or vehicles projecting symbols onto the road.

However, there’s still the problem of detecting the presence of other traffic participants, in particular pedestrians and cyclists, by an autonomous vehicle or a vehicle driving in an at least partially autonomous mode in a secure and reliable manner and to initiate an adequate subsequent procedure. Further, it is also a requirement to enable the other traffic participants, in particular pedestrians and cyclists, to notice autonomous vehicles or vehicles driving in an at least partially autonomous mode and/or electric vehicles driven by batteries at times.

Detailed Disclosure of the Disclosure “System to detect and/or communicate with a traffic participant”.

Accordingly, it is an object of the disclosure to propose a system and method to detect and/or communicate with a traffic participant which increases the safety in road traffic and improves the reliability of mutual perception.

The object is solved by a system to detect and/or to communicate with a traffic participant representing a first object according to Example 1x, a respective method according to Example 15x and a computer program product according to Example 16x. Further aspects of the disclosure are given in the dependent Examples.

The disclosure is based on a system to detect and/or communicate with a traffic participant representing first object, comprising a distance measurement unit intended to be allocated to the first object and configured to determine a distance to a second object representing a further traffic participant, based on a run-time of a signal pulse emitted by an first emission unit, reflected from the second object and detected by a detection unit of the distance measurement unit to enable the traffic participant to orient in road traffic. Allocated in the context of this disclosure means that any part of a distance measurement unit may be functionally connected with and/or physically attached to or entirely embedded into an object or parts of an object. According to the disclosure, the system further comprises an acquisition and information unit intended to be allocated to the second object and configured to detect the signal pulse emitted by the first emission unit and to output an information signal noticeable by human senses (e.g. touch, sight, hearing, smelling, tasting, temperature sensing, feeling of inaudible acoustic frequencies, balance, magnetic sensing and the like) depending on the detection result.

A traffic participant may be a person participating in road traffic or a corresponding vehicle used by such person. In regards to a vehicle as traffic participant, the inventive system can also be used without the vehicle being actively driven, e.g. to detect the vehicle as an obstacle. Thus, the inventive system may also provide bene-fits even if the traffic participants in general do not move.

The first and second object representing a traffic participant is may be an object that is mobile but still provides a representation of the traffic participant when used. A respective mobile object can be used by different traffic participants, e.g. a person owning different cars does not need to provide each car with such object. Examples for mobile objects are portable electronic devices, garments as explained later, accessories, like canes, or other articles associated with traffic participants. Alternatively, the object may be incorporated in a vehicle, e.g. an automobile, a motorbike, a bike, a wheel chair, a rollator or the like. The incorporation of the object provides a continuous availability of the object when using the vehicle. In other words, the object is not prone of being forgotten or lost. Further, incorporating or at least connecting the first and/or second object with a vehicle used by a traffic participant may al-low to use the already existing power supply of the vehicle, like a battery or dynamo, to ensure operational readiness.

The distance measurement unit intended to be allocated to the first object and the acquisition and information unit intended to be allocated to the second object may be separate units to be affixed or connected otherwise to the respective object to provide a positional relationship. Alternatively, the units may be incorporated in the respective objects. Similar to the description of mobile or incorporated objects, separate or incorporated units each providing their own benefits.

In some embodiments, the distance measurement unit is a LIDAR Sensor Device and the first emission unit is a First LIDAR Sensing System comprising a LIDAR light source and is configured to emit electromagnetic signal pulses, in some implementations in an infrared wavelength range, in particular in a wavelength range of 850 nm up to 8100 nm, and the acquisition and information unit provides an optical detector adapted to detect the electromagnetic signal pulses, and/or the distance measurement unit is a ultrasonic system and the first emission unit is configured to emit acoustic signal pulses, in some embodiments in an ultrasonic range, and the acquisition and information unit provides an ultrasonic detector adapted to detect the acoustic signal pulses. In this context, the term ‘optical’ refers to the entire electromagnetic wavelength range, i.e. from the ultraviolet to the infrared to the micro-wave range and beyond. In some embodiments the optical detector may comprise a detection optic, a sensor element and a sensor controller.

The LIDAR Sensor Device allows to measure distances and/or velocities and/or trajectories. Awareness of a velocity of another traffic participant due to the velocity of the second object may support the initiation of an adequate subsequent procedure. In this regard, the distance measurement unit may be configured to consider the velocity of the second object, the velocity of itself and moving directions for risk assessment in terms of a potential collision. Alternatively, those considerations may be performed by a separate control unit of the first object or otherwise associated with the traffic participant based on the distance and velocity information provided by the distance measurement unit.

According to the disclosure, a LIDAR Sensor Device may include a distance measurement unit and may include a detector. A LIDAR Sensor System may include a LIDAR Sensor Management Software for use in a LIDAR Sensor Management System and may also include a LIDAR Data Processing System.

The LIDAR Sensor Device is in some embodiments adapted to provide measurements within a three dimensional detection space for a more reliable detection of traffic participants. With a two dimensional detection emitting signal pulses in a substantially horizontal orientation to each other, second objects may not be detected due to obstacles being in front of the second object in a propagation direction of the signal pulses. The advantages of a three-dimensional detection space are not restricted on the use of a LIDAR sensing device but also applies to other distance measurement technologies, independent of the signal emitted being optical or acoustic.

The emission of optical pulses in an infrared wavelength range by the first emission unit avoids the disturbance of road traffic by visible light signals not intended to pro-vide any information but used for measurement purposes only.

Similarly, the use of an ultrasonic system as distance measurement unit to emit acoustic signal pulses, in some implementations in an ultrasonic range, provides the advantage of using signal pulses usually not being heard by humans and as such not disturbing traffic participants. The selection of a specific ultrasonic range may also take the hearing abilities of animals into account. As a result, it’s not only to protect pets in general but in particular “functional animals”, like guide dogs for blinds or police horses from being irritated in an already noisy environment.

An ultrasonic system is in some embodiments used for short ranges of a few meters. A system providing an ultrasonic system combined with a LIDAR sensing device is suitable to cover short and long ranges with sufficient precision.

The acquisition and information unit provides a detector adapted to detect the respective signal pulses, e.g. in the event of the use of an emission unit emitting optical signal pulses an optical detector or in the event of the use of an emission unit emitting acoustic signal pulses an acoustic detector. The detection of optical signal pulses in an infrared wavelength range may be implemented by one or more photo diodes as detector of the acquisition and information unit of the allocated to the second object.

To avoid the detection of signal pulses from other emitters than first objects to be detected, the detectors may be designed to receive only selected signals. Respective filters, like band filters, adapted to receive signals in a specified range may be used advantageously. As an example, an optical detector provides a band filter to only transmit wavelengths typically emitted by LIDAR sensing device, like 905 nm and/or 1050 nm and/or 1550 nm. The same principle applies to acoustic detectors.

The system may also provide a distance measurement unit configured to emit both, optical and acoustic, signal pulse types by one or a plurality of emission units. Emit-ting different types of signal pulses may provide redundancy if the detector of the acquisition and information unit is configured to detect both signal pulse types or the acquisition and information unit provides both respective detector types in the event of signal disturbances. Further, two signal types may allow the detection of the first object independent of the type of detector of the acquisition and information unit of the second object, here being an optical or acoustic detector.

In principle, the detector or detectors of the acquisition and information unit may be point detectors or area detectors, like a CCD-array. Single detectors may form an array of detectors in a line or areal arrangement.

Advantageously, the acquisition and information unit provides a or the detector, respectively, to detect optical or acoustic signal pulses, wherein the detector provides an arrangement of a plurality of detector elements with acceptance angles each opening in different directions, wherein the acceptance angles overlap, to enable a 360°-all-round detection in a horizontal direction when allocated to the second object.

The acceptance angles provide an overlap region in a distance from the detector elements depending of the respective acceptance angles of the detector elements, the number of detector elements and their spacing. A minimum distance may be selected to reduce the number of detector elements. The minimum distance may be defined as a distance threshold which can be assumed as not providing a significant reduction in risk by a warning if the distance of the detected first object falls be-low the threshold. As an example, if the detector of the acquisition and information unit detects the first object in a distance less than 30 cm, any warning may already be too late. In a variant, the minimum distance may be selected depending on the actual velocity of the first and/or second object or a relative velocity between the objects. The minimum distance increases with an increase in velocity. As the number of detectors may not be reduced as they have to cover lower as well as higher velocities, at least not all of the detectors have to be operated positively affecting the power consumption.

A 360°-all-round detection does not only allow an earlier warning but also provides more flexibility in positioning the acquisition and information unit or the second object.

According to an embodiment of the disclosure, the information signal noticeable by human senses outputted by the acquisition and information unit is a light optical signal with light in a wavelength range of 380 nm to 780 nm and/or an acoustic signal with tones in a frequency range of 16 Hz to 20.000 Hz and/or a mechanical vibration signal with vibrations in a frequency range of 1 Hz to 500 Hz. The acoustic frequency range may be selectable according to the age or the hearing abilities of a person or animal.

The information signal is advantageously selected such that it differs from other signals that may be noticeable in a traffic participant's environment. As an example, an acoustic signal of the acquisition and information unit should differ from a signal provided by a telephone device for incoming calls. Further, light optical signals may be selected such that users suffering from red-green colorblindness are not confronted with problems resulting from their deficiency. A mechanical vibration signal may provide an information signal noticeable independently from surrounding noise and light conditions. However, physical contact or at least a transmission path has to be established. Further, if a vibration signal may be difficult to be interpreted by a traffic participant, if more than one information, in particular quantitative information, shall be provided. As one predetermined setting may not fit for every individual traffic participant or every second object, the acquisition and information unit may provide a selection option to allow selection of at least one signal type and/or of at least one signal parameter within a signal type range. Independent of the individual traffic participant or the second object, light optical signals cannot only be used to inform the traffic participant represented by the second object but also supports the traffic participant and information recognition by others if the light optical signals are respectively designed.

The signal generating device may not be restricted to the output of one type of in-formation signal but may also be capable of providing different types of information signals in parallel and/or in series. As an example, smart glasses may display a passing direction and passing side of a first object by light optical signals, while the side piece or glass frame on the passing side emits a mechanical vibration and/or acoustic signal in parallel. When the first object changes its relative position to the second object, the visible or audible signals may change their position on their respective device, e.g. the display of a smartphone or the frame of a smart glass.

The information signal noticeable by human senses outputted by the acquisition and information unit may be continuous or pulsed. Light optical signals may be white or colored light or a series of different colors, e.g. changing with increasing risk from green to red. In some embodiments, light optical signals are emitted in a line of sight of the traffic participant represented by the second object to ensure perception by the traffic participant. Further, light optical signals may also be emitted in lateral or rearward directions to be recognized by other traffic participants to receive an information related to the detection of a first object and/or that the traffic participant represented by the second object may react in short term, e.g. initiating a sudden braking. The same principles may apply for acoustic signals.

In some embodiments, the acquisition and information unit comprises a or the detector, respectively, to detect optical or acoustic signal pulses and a control device and a signal generating device connected to each other and the detector, wherein the control device is configured to interpret the signal detected by the detector and to control the signal generating device such that the outputted information signal is outputted in a quality, in particular frequency or wavelength, respectively, and/or pulse duration and their change over time, noticeable by human senses depending on the detection result.

A detection result may be a velocity in general and/or a velocity of a distance reduction and/or a distance and/or a direction of a detected traffic participant represented by a first object. The frequency may, for example, be increased with a decreasing distance. The term frequency in this context is directed to a change in tone or color and/or the repetition rate of the information signal. In general, the quality of the out-putted information signal may represent the risk of a present situation in road traffic by increasing perception parameters to be noticed with increasing risk.

In an embodiment the signal generating device, in the event of outputting a light optical signal with light in a wavelength range of 380 nm to 780 nm, provides a number of light sources, in some implementations LEDs, mini-LEDs or micro-LEDs, arranged to display a two or three-dimensional information.

LEDs are easy to implement and usually provide a long lifetime and therefore reliability, in particular important for safety applications.

As a variant or additionally, the signal generating device, in the event of outputting a light optical signal with light in a wavelength range of 380 nm to 780 nm, comprises a rigid or flexible flat screen display device and/or a smartphone, a smart watch, a motor cycle helmet, a visor or an augmented reality device.

A display device may not only provide a light optical signal as such but may also provide a light optical signal in form of a predetermined is display element, like an arrow indication an approaching direction of a first object, or an icon, like an exclamation mark, both representing a particular road traffic situation or associated risk. Further, the display element may show further information, e.g. the quantitative value of a distance and/or a velocity.

As a further variant or additionally, the signal generating device, in the event of out-putting a light optical signal with light in a wavelength range of 380 nm to 780 nm, comprises one or more light sources each providing one or more optical waveguides coupled to the respective light source and capable of emitting light over the length of the optical waveguide, and/or the signal generating device, in the event of output-ting a light optical signal with light in a wavelength range of 380 nm to 780 nm, comprises one or more self-luminous fibers.

Optical waveguides allow flexible guidance of a light optical signal to a target location by total reflection. Optical waveguides may also be designed to output light over their length or defined areas. Self-luminous fibers or yarn may emit light passively or actively. Accordingly, light optical signals may be distributed over larger and/or multiple areas to be better noticed. Depending on the design, waveguides and/or self-luminous fibers may be arranged to provide light optical signals of a predetermined shape and/or different colors or shades.

Alternatively or in addition the use of waveguides or self-luminous fibers, light optical signals may be coupled into planar areal segments to be outputted at least one output surface after being scattered and homogenized within the segment.

In a further aspect of the disclosure, the system comprises a garment, in some implementations a textile garment, intended to be allocated to the second object, to provide the second object with the acquisition and information unit.

Examples of a garment are jackets, vests, in particular safety vests, trousers, belts, helmets, back bags or satchels. The acquisition and information unit may be incorporated or affixed to the garment or may be disposed in a pocket or similar receiving part of such garment. In the event of using waveguides or self-luminous fibers, the waveguides or fibers may be woven in textile garments or textile parts of a garments. Alternatively, the waveguides or fibers form the textile garments or parts thereof respectively.

As textile garments are usually subject to be washed, the acquisition and information unit and it components waterproof or provided with a waterproof enclosure. Alternatively, the acquisition and information unit or at least sensitive parts thereof are detachable, e.g. to exclude them from any washing procedures.

According to a further aspect of this aspect, the system comprises a device for cur-rent and voltage supply connected to the acquisition and information unit, and in some embodiments a power source to be coupled thereto, in particular a battery or a rechargeable accumulator.

The connection provides easy exchange of current and power supplies, like batteries, power banks and other portable power sources, or removal. Further, an interface to connect a current and power supply may provide access to current and power supplies of other systems and reduces the number of power sources accordingly.

In some embodiments, the first emission unit of the distance measurement unit of the first object to be detected is configured to transmit an information of a position, a distance, a velocity and/or an acceleration of the first object to be detected by the signal pulses or a series of signal pulses, respectively, by frequency modulation or pulse modulation or a pulse code, wherein the control device of the acquisition and information unit interprets the additional information provided by the signal puls(es) detected by the detector and compares the additional information with the position, velocity and/or acceleration of the belonging second object, and outputs the information signal depending on said comparison.

This kind of comparison does not only consider the position and moving characteristics of the traffic participant representing first object but also their relation to the second object. The position and moving characteristics of the first object in terms of frequency modulation may provide, for example, a distance value according to the frequency of the signal pulses. A pulse modulation may provide the same information by way of using different signal pulses or signal pulse amplitudes. A pulse code may provide such information similar to the use of Morse signals.

According to a further aspect of this aspect, the acquisition and information unit pro-vides a second emission unit configured to transmit a signal pulse or a series of signal pulses to a detector of the first object to be detected via an optical or acoustic transmission path, in some embodiments the same transmission path used by the detector of the acquisition and information unit to receive the signal pulse or the signal pulses of the first emission unit of the first object to be detected, wherein the control device is configured to determine a position, a distance, a velocity and/or an acceleration of its own and to transmit this information to the detector of the first object to be detected by frequency modulation or pulse modulation or a pulse code of the signal pulse or signal pulses.

The bilateral communication between the first and second object allows the first object to receive the same or similar information about the second object as already described in the context of the second object detecting the first object. As various examples of providing noticeable information are described, the Term "similar" relates to at least one of the examples, while the second object may use other ways of providing information. The information itself as well as the type of outputting such information is "similar" in term of a detection information but may vary in its specific implementation. As an example, a second object representing a pedestrian may receive a distance signal of a first object outputted as light optical signal while a first object representing a driver of an automobile receives an acoustic signal of a distance and moving direction of the second object.

Alternatively or in addition, the second emission unit emits a signal comprising in-formation about the traffic participant represented by the second object. Such information may be the type of traffic participant, like being a pedestrian or cyclist, his/her age, like below or above a certain threshold, disabilities important to be considered in road traffic, and/or a unique identity to allocate information signals emitted from the second emission unit to the identity.

The detector of the first object to detect the signal puls(es) emitted from the second emission unit may be a detector of the detection unit of the distance measurement unit or a separate detector.

In some embodiments, the acquisition and information unit comprises a storage unit and an input unit, wherein thresholds for positions, distances, velocities, accelerations and/or combinations thereof can be set in the storage unit via the input unit, wherein no or restricted information from the second emission unit is transmitted to the first object to be detected in the event that a corresponding value provided by the detected signal pulse or series of signal pulses exceeds or falls below a set thresh-old or combinations thereof.

The setting of thresholds prevents the output of information by the second emission unit of the acquisition and information unit for every detected signal pulse. In particular in an environment with lots of traffic participants, the number of transmitted in-formation by second emission units to the first object may otherwise create undistinguishable information sequences reducing the ability to identify most important warnings. This would rather be irritating than supporting orientation and increasing safety in road traffic. Further, it can be assumed that a user gets used to a more or less constantly blinking or beeping device without paying attention anymore, if not even turning off such device or a respective functionality. Accordingly, the output of information may be limited to the ones required or desired by the use of thresholds.

Thresholds may not only be quantitative values but may also comprise qualitative properties, like only transmitting information if a second object is moving. The thresholds may also consider reciprocal relationships, e.g. if a second object is moving in a direction x with a velocity y, a position signal is transmitted to the first object, when the measured distance falls below z. As another example considering basic principles, an information is not transmitted by the second emission unit if a velocity of the first object is below a certain threshold. However, the second emission unit may still transmit other information signals not depending on thresholds. Further, the detected information signals may also be prioritized. Accordingly, the second emission unit may only emit one information representing highest risk based on a defined ranking or underlying algorithm.

The same principles of setting thresholds may apply to the signal generating device of the acquisition and information unit with respect to the output of an information signal noticeable by human senses depending on the detection result. In particular, the control device of the acquisition and information unit may control thresholds and/or prioritization of signal pulses detected from a plurality of first objects. The control device controls the signal generating device such that, for example, only a first object with the closest distance and/or a first object with the highest velocity and/or first objects with a moving direction potentially crossing path of the second object cause the generation of an information signal. To interpret a detected signal pulse in terms of a potential crossing of moving paths, the signal pulse may be accompanied by a path information, e.g. based on an activated turn signal or a routing by a navigation system.

In a further aspect, the acquisition and information unit comprises a radio communication unit. The radio communication unit may be part of the second emission unit or separate and transmits information signals as electrical signal or radio signal, in particular a Bluetooth signal, to a further signal generating device. The further signal generating device may be allocated to the traffic participant represented by the second object or to other traffic participants. With respect to the traffic participant represented by the second object, the second object may be placed in a position for better detection of the signal pulses emitted by the first emission unit while having inferior capabilities to provide a traffic participant with respective information signals. Further, other traffic participants not equipped with an acquisition and information unit may receive information about the traffic situation and potential risks nearby. The further signal generating device may be a smart device, like smart phones, smart watches or augmented reality devices, e.g. smart glasses or a head mounted display.

The disclosure is also directed to a method to detect and/or communicate with a traffic participant representing first object, comprising:

Emitting a signal pulse intended to determine a distance by a first emission unit of a distance measurement unit allocated to a the first object, reflecting the signal pulse at a second object representing a further traffic participant, detecting the reflected signal by a detection unit of the distance measurement unit and determination of the distance based on the measured run-time, further detecting the signal pulse emitted by the first emission unit by an acquisition and information unit allocated to the second object, and outputting an information signal noticeable by human senses by the acquisition and information unit depending on the detection result.

The method provides the same advantages as already described for the disclosed system and respective aspects.

In another aspect, the method may include further steps with respect to the described system embodiments. As an example, the method may include emitting a signal pulse or a series of signal pulses to a detector of the first object or another object representing another traffic participant or traffic control system via an optical or acoustic transmission path, in some implementations the same transmission path used by the acquisition and information unit to receive the signal pulse or signal pulses of the first emission unit. Alternatively or in addition, radio signal pulses may be transmit-ted. In some implementations the signal pulse or signal pulses may be encrypted. The signal pulse or signal pulses may transmit information signals, like a position, a distance, a velocity and/or an acceleration of the second object or acquisition and information unit, respectively, or the control device representing the acquisition and information unit and therefore the second object. Further information may comprise but is not limited to personal information about the traffic participant represented by the second object, e.g. his or her age, disabilities or other indicators that may influence the individual performance in road traffic. In some implementations particularly personal information may be subject to encryption.

The disclosure is also directed to a computer program product embodied in a non-transitory computer readable medium comprising a plurality of instructions to exe-cute the method as described and/or to be implemented in the disclosed system.

The medium may be comprised by a component of the system or a superior provider, e.g. a cloud service. The computer program product or parts thereof may be subject to be downloaded on a smart device as an app. The computer program product or parts thereof may allow and/or facilitate access to the internet and cloud-based services.

Further advantages, aspects and details of the disclosure are subject to the claims (Example 1x, 2x, 3x . . . ), the following description of preferred embodiments applying the principles of the disclosure and drawings. In the figures, identical reference signs denote identical features and functions.

Figure 8:
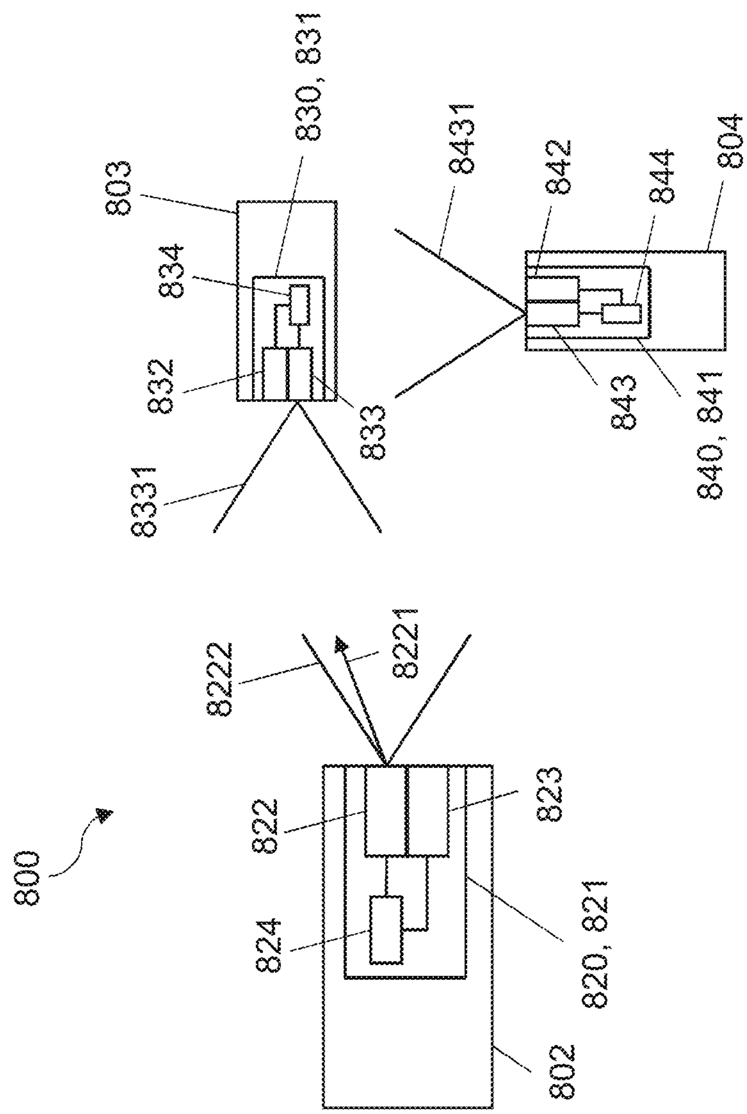
FIG. 8 is a top view on a typical road traffic situation in a schematic form showing the principles of the disclosure for a system to detect and/or communicate with a traffic participant.

FIG. 8 shows an explanatory road traffic situation with an autonomously driven electric car as traffic participant 802 represented by a first object 820, a pedestrian as traffic participant 803 represented by a second object 830 and a cyclist as traffic participant 804 represented by a further second object 840. The system 800 to detect traffic participant 802 represented by a first object 820 comprises a first object 820 incorporated in the car, in some embodiments as part of a general monitoring system, to represent the car as traffic participant 802 by the first object 820. The first object 820 provides a distance measurement unit 821 to determine a distance to a second object 830, 840 representing further traffic participants 803, 804 as described later. Here, the distance measurement unit 821 is a LIDAR sensing device measuring a distance based on a run time of a signal pulse 8221 emitted by a first emission unit 822, here a LIDAR light source, reflected from a second object 803, 804 and detected by a detection unit 823 of the distance measurement unit 821. Even though only one signal pulse 8221 is shown, the LIDAR sensing device provides a plurality of signal pulses 8221 within an emitting space 8222 based on the technical configuration of the LIDAR sensing device and/or respective settings. Traffic participants 802, 803, 804 may be mobile or immobile, ground based or aerial.

Further, the pedestrian as traffic participant 803 and the cyclist as traffic participant 804 are each represented by a second object 830 and 840, respectively. As an ex-ample, the second object 830 representing the pedestrian as traffic participant 803 is a garment 930 as described later with reference to FIG. 9 and the second object 840 representing the cyclist as traffic participant 804 is affixed to the handlebar of the bike. Each of the second objects 830, 840 comprises an acquisition and information unit 831, 841. The respective acquisition and information unit 831, 841 may be incorporated in the second object 830, 840 or otherwise affixed or connected to the second object to be allocated to the second object 830, 840. The acquisition and information unit 831, 841 is configured to detect a signal pulse 8221 emitted by the first emission unit 822, here by a detector 833, 843. Instead of a single detector, multiple detectors may be provided to enhance the detection space. The detection of the signal pulse 8221 by one detector 833, 843 is given as an example to describe the basic principle. The detectors 833, 843 each providing an acceptance angle 8331, 8431 for the detection of the signal pulse 8221, depending of the technical configuration or an individual setting option. If a signal pulse 8221 is detected by a detector 8331, 8431, an information signal noticeable by human senses depending on the detection result is outputted. In the explanatory embodiment shown in FIG. 8, the acquisition and information units 831, 841 each providing a control device 834, 844 controlling a signal generating device 832, 842 depending on different threshold settings.

As an example for different threshold settings, the control device 833 of the acquisition and information unit 831 causes the signal generating device 832 to output an information signal only, if the detected signal pulse 8221 indicates a distance less than 10 m. As a pedestrian as traffic participant 803 represented by the second object 830 is relatively slow, such distance should be sufficient to provide the pedestrian with enough time to react. Other settings can be selected, e.g. if the pedestrian goes for a jog anticipated with higher moving velocities. To allow an automatic setting of thresholds, the control device 834 may be configured to adapt thresholds depending on sensed motion characteristics of the pedestrian or the first object. On the other hand, a cyclist as traffic participant 804 usually moves with much fast speed, so the control device 844 causes the signal generating device 842 to output an in-formation signal already, if the detected signal pulse 8221 indicates a distance less than 20 m. The control device 844 may also be configured to provide different and/or automatic settings as described for the control device 834.

The acquisition and information units 831, 841 each providing detectors 833, 843 configured to detect infrared optical signal pulses by one or multiple photodiodes.

Here, each detector 833, 843 comprises multiple photodiodes arranged horizontally with overlapping acceptance angles around each of the acquisition and information unit 831, 841 to provide a detection space for the signal puls(es) emitted by the LI-DAR sensing device approaching a 360°-all-round detection to the extent possible.

The detectors 833, 843 each comprising band filters to reduce the detection to the main LIDAR wavelength(s) to exclude noise signals. Here, the band filter only transmits wavelength substantially equal to 1050 nm. The term "substantially" takes usual technical tolerances with respect to the emitted signal and the band filter into account. Further, the wavelength(s) to be transmitted may be selected as individual settings or according to a measurement of a signal strength.

The signal generating devices 832, 842 output different information signals. The signal generating device 832 outputs a light optical signal and the signal generating device 842 outputs an acoustic signal. However, the signal generating devices 832, 842 may also be configured to output another information signal or multiple types of information signals which may depend on a detection result, on an individual selection by the respective traffic participant or automatically set depending on surrounding conditions, e.g. light optical signals if noise exceeding a particular threshold is sensed or acoustic signals if a sensed surrounding illumination may impede easy recognition of light optical signals.

Further, the acquisition and information units 831, 841 each comprising a second emission unit (not shown) to transmit a signal pulse or a series of signal pulses to the detection unit 823 of the distance measurement unit 821 or another detector of the first object 820. The signal pulses may comprise object identification codes, for example object type and classification, object velocity and trajectory, and the method of movement. The signal puls(es) provide(s) the control device 824 with information in addition to the measured distance, in particular with regards to a position in term of the orientation of the second object 830, 840 with respect to the first object 820, a distance for verification purposes, a velocity of the second object 830, 840 and/or an acceleration of the second object 830, 840. The respective information is provided by the control device 834, 844 of the second object 830, 840.

In the embodiment shown in FIG. 8, the second emission unit of the acquisition and information unit 831 comprises a radio communication unit to transmit the in-formation signals as electrical signal to a further signal generating device. The signals may be transmitted directly or via a further control device to process the received signals before controlling the signal generating device accordingly. Here, a Bluetooth protocol is used to provide a smart phone of the pedestrian 803 with respective information. Further, the Bluetooth signals may be received by other traffic participants. Accordingly, a communication network is established to extend the detection space virtually or to provide traffic participants that are either equipped or not equipped with a system 800 to detect a traffic participant 802 representing first object 820 with respective information. Parts of the communication network may work, at least during certain time periods, in a unilateral mode, other parts of the communication network may work in bilateral or multilateral modes. Access rights, information signals and other setting may be administered by an app, IoT or cloud services and may be displayed graphically, i.e. in pictures, symbols or words, on a suited device, for example a smartphone, a smartwatch or a smart glass (spectacles).

With respect to interaction of traffic participants and the output of information signals, a further explanatory application is the control of the signal generating devices by the respective control devices of the acquisition and information units based on the electrical signals transmitted by the radio communication units. As an example, several pedestrians walk at a distance of 50 m behind each other. A LIDAR sensing device as distance measurement unit would detect all of the pedestrians and the acquisition and information units of the detected pedestrians would output an in-formation signal, if no further measure is taken. The plurality of information signals would be rather confusion as they don't provide any further indication of the detected traffic participant represented by a first object as the information signal appear over a long distance range. To provide better guidance, the first emission unit may be configured to transmit a distance information to the acquisition and information units, so that the signal generating devices may be controlled according to set distance thresholds and/or a moving direction. Alternatively or in addition, the radio communication units may be used to transmit information about the traffic participant represented by the first object. The control devices of the acquisition and information units may judge whether the received information is prioritized according to an underlying algorithm and if so, the control device does not cause the signal generating device to output an information signal. The underlying algorithm may prioritize distance signals, such that only the acquisition and information unit allocated to the traffic participant closest to the first object outputs an information signal. In a further variant, still all or at least a plurality of the acquisition and information units out-put an information signal. However, the information signals provide a different quality. In the event of light optical signals, the signals generated by the signal generating device closest to the first object appear brighter than the ones in a farer distance. Such visual "approaching effect" may also be achieved by the setting of distance depending thresholds for the quality of the quality of the outputted information signals. As an example, if an electrically operated car comes close to a detected pedestrian, it may switch on or increase audible noise. In another aspect, an approaching battery powered vehicle may switch on a sound generating device and/or vary or modulate an acoustical frequency.

Figure 9:
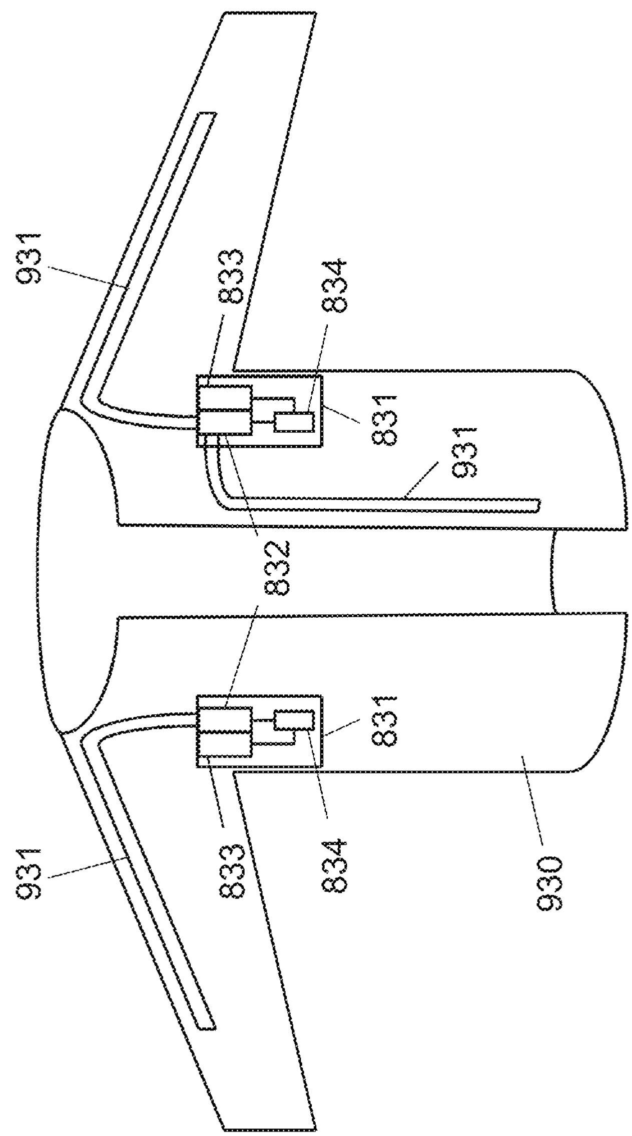
FIG. 9 is a perspective view of a garment as an explanatory second object in a system to detect and/or communicate with a traffic participant according to FIG. 8.

FIG. 9 shows a garment 930, here a jacket as explanatory embodiment, that may be worn by a pedestrian or cyclist. The garment 930 provides two acquisition and information units 831 each comprising a detector 833, a signal generating device 832 and a control device 834. The acquisition and information units 831 are incorporated in the garment 930 but may be at least partially removable, in particular with regards to the power supply and/or smart devices, e.g. smart phones or the like, for washing procedures.

In this embodiment, the signal generating unit 832 is a light module for generating light optical signals to be coupled into waveguides 931. The waveguides successively output the light optical signals over their length. In principle, the light module comprises one or more LEDs, in particular LEDs providing different colors. Each LED couples light in one or more waveguides 931 separately. Alternatively, one or more waveguides 931 may guide the light of several LEDs.

To protect the waveguides 931 and the light module against moisture and to ease the assembly to the garment 930, the waveguides 931 and the light module may be molded together. Alternatively or in addition, other components, like the detector 833 and/or the control device 834, may also form part of an or the molded configuration, respectively.

The waveguide 931 is in some implementations made of a thermoplastic and flexible material, e.g. polymethylmethacrylate (PMMA) or to thermoplastic polyurethan (TPU).

The garment 930 may provide further acquisition and information units 831 in lateral areas, like shoulder sections or sleeves, or on the back.

The acquisition and information units 831 are provided with a is power supply (not shown), like a battery, accumulator and/or an interface to be coupled to a power bank or smart phone. The power supply may be coupled to the acquisition and in-formation unit 831 or incorporated in the acquisition and information unit 831. Further, each acquisition and information unit 831 may provide its own power supply or at least some of the acquisition and information units 831 are coupled to one power supply.

Figure 10:
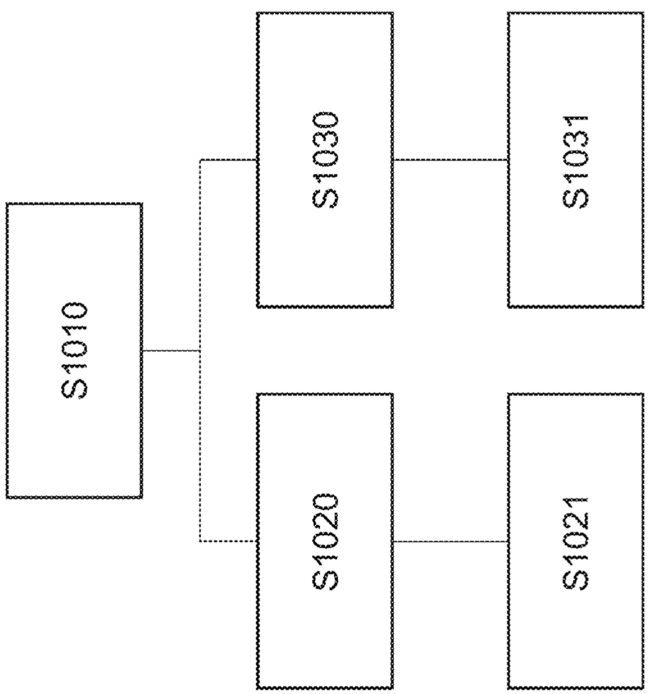
FIG. 10 is a scheme of the disclosed method for a system to detect and/or communicate with a traffic participant.

The basic principle of the inventive method to detect a traffic participant 802 representing first object 820 is shown in FIG. 10. In step S1010 a signal pulse 8221 in-tended to determine a distance by a first emission unit 822 of a distance measurement unit 821 allocated to a the first object 820 is emitted. The emitted signal pulse 8221 is then reflected at a second object 830, 840 representing a further traffic participant 803, 804 in accordance with step S1020. The reflected signal is detected by a detection unit 823 of the distance measurement unit 821 and a distance is determined based on the measured run-time in step S1021.

Further, the signal pulse 8221 emitted by the first emission unit 822 is detected by an acquisition and information unit 831, 841 allocated to the second object 830, 840 in accordance with step S1030. In step S1031, an information signal noticeable by human senses is outputted by the acquisition and information unit 831, 841 de-pending on the detection result.

Even though FIG. 10 shows the steps S1020 and S1021 in parallel to steps S1030 and S1031, the method may also be applied in series, e.g. if the acquisition and information unit 831, 841 should also be provided with a distance information by the first emission unit 822. Further, the acquisition and information unit 831, 841 may also emit a signal pulse or a series of signal pulses to a detector of the first object or another object representing another traffic participant or traffic control system via an optical or is acoustic transmission path, in some implementations the same transmission path used by the acquisition and information unit to receive the signal pulse or signal pulses of the first emission unit. Alternatively or in addition, radio signal pulses may be transmitted.

It is to be noted that the given examples are specific embodiments and not intended to restrict the scope of protection given in the claims (Example 1x, 2x, 3x . . . ). In particular, single features of one embodiment may be combined with another embodiment. As an example, the garment does not have to provide a light module as signal generating device but may be equipped with an acoustic signal generating device. Further, instead of waveguides, self-luminous fibers may be used. The disclosure is also not limited to specific kinds of traffic participants. In particular, the traffic participant represented by the first object does not have to be a driver of a motor vehicle or the traffic participants represented by the second object are not necessarily non-motorized. The traffic participants may also be of the same type.

Various embodiments as described with reference to FIG. 8 to FIG. 10 above may be combined with a smart (in other words intelligent) street lighting. The control of the street lighting thus may take into account the information received by the traffic participants.

In the following, various aspects of this disclosure will be illustrated:

Example 1x is a system to detect and/or communicate with a traffic participant representing a first object. The advantageous system comprising: a distance measurement unit intended to be allocated to the first object and configured to determine a distance to a second object representing a further traffic participant based on a run-time of a signal pulse emitted by a first emission unit, reflected from the second object and detected by a detection unit of the distance measurement unit to enable the traffic participant to orient in road traffic, an acquisition and information unit intended to be allocated to the second object and configured to detect the signal pulse emitted by the first emission unit and to output an information signal noticeable by human senses depending on the detection result.

In Example 2x, the subject matter of Example 1x can optionally include that the distance measurement unit is a LIDAR Sensor Device and the first emission unit is a First LIDAR Sensing System comprising a LIDAR light source and is configured to emit optical signal pulses, for example in an infrared wavelength range, in particular in a wavelength range of 850 nm up to 8100 nm, and the acquisition and information unit provides an optical detector adapted to detect the optical signal pulses, and/or the distance measurement unit is an ultrasonic system and the first emission unit is con-figured to emit acoustic signal pulses, for example in an ultrasonic range, and the acquisition and information unit provides an ultrasonic detector adapted to detect the acoustic signal pulses.

In Example 3x, the subject matter of any one of Example 1x or 2x can optionally include that the acquisition and information unit provides a or the detector, respectively, to detect optical or acoustic signal pulses, wherein the detector provides an arrangement of a plurality of detector elements with acceptance angles each opening in different directions, wherein the acceptance angles overlap, to enable a 360°-all-round detection in a horizontal direction when allocated to the second object.

In Example 4x, the subject matter of any one of Example 1x to 3x can optionally include that the information signal noticeable by human senses outputted by the acquisition and in-formation unit is a light optical signal with light in a wavelength range of 380 nm to 780 nm and/or an acoustic signal with tones in a frequency range of 16 Hz to 20.000 Hz and/or a mechanical vibration signal with vibrations in a frequency range of 1 Hz to 500 Hz.

In Example 5x, the subject matter of any one of Example 1x to 4x can optionally include that the acquisition and information unit comprises a or the detector, respectively, to detect optical or acoustic signal pulses and a control device and a signal generating device connected to each other and the detector, wherein the control device is configured to interpret the signal detected by the detector and to control the signal generating device such that the outputted information signal is outputted in a quality, in particular frequency or wavelength, respectively, and/or pulse duration and their change over time, noticeable by human senses depending on the detection result.

In Example 6x, the subject matter of Example 5x can optionally include that the signal generating device, in the event of outputting a light optical signal with light in a wavelength range of 380 nm to 780 nm, provides a number of light sources, for example LEDs, mini-LEDs or micro-LEDs, arranged to display a two or three-dimensional information.

In Example 7x, the subject matter of Example 5x can optionally include that the signal generating device, in the event of outputting a light optical signal with light in a wavelength range of 380 nm to 780 nm, comprises a rigid or flexible flat screen display device and/or a smartphone, a smart watch or an augmented reality device.

In Example 8x, the subject matter of Example 5x can optionally include that the signal generating device, in the event of outputting a light optical signal with light in a wavelength range of 380 nm to 780 nm, comprises one or more light sources each providing one or more optical waveguides (300.1) coupled to the respective light source and capable of emitting light over the length of the optical waveguide (300.1), and/or the signal generating device, in the event of outputting a light optical signal with light in a wavelength range of 380 nm to 780 nm, comprises one or more self-luminous fibers.

In Example 9x, the subject matter of any one of Example 5x to 8x can optionally include that the system further includes a garment, for example a textile garment, intended to be allocated to the second object, to provide the second object with the acquisition and information unit.

In Example 10x, the subject matter of Example 9x can optionally include that the system further includes a device for current and voltage supply connected to the acquisition and information unit, and for example a power source to be coupled thereto, in particular a battery or a rechargeable accumulator.

In Example 11x, the subject matter of any one of Example 5x to 10x can optionally include that the first emission unit of the distance measurement unit of the first object to be detected is configured to transmit an information of a position, a distance, a velocity and/or an acceleration of the first object to be detected by the signal pulses or a series of signal pulses, respectively, by frequency modulation or pulse modulation or a pulse code, wherein the control device of the acquisition and information unit interprets the additional information provided by the signal puls(es) detected by the detector and compares the additional information with the position, velocity and/or acceleration of the belonging second object, and outputs the information signal depending on said comparison.

In Example 12x, the subject matter of any one of Example 5x to 11x can optionally include that the acquisition and information unit provides a second emission unit configured to transmit a signal pulse or a series of signal pulses to a detector of the first object to be detected via an optical or acoustic transmission path, in some implementations the same transmission path used by the detector of the acquisition and information unit to receive the signal pulse or the signal pulses of the first emission unit of the first object to be detected, wherein the control device is configured to determine a position, a distance, a velocity and/or an acceleration of its own and to transmit this information to the detector of the first object to be detected by frequency modulation or pulse modulation or a pulse code of the signal pulse or signal pulses.

In Example 13x, the subject matter of Example 12x can optionally include that the acquisition and information unit comprises a storage unit and an input unit, wherein thresholds for positions, distances, velocities, accelerations and/or combinations thereof can be set in the storage unit via the input unit, wherein no or restricted information from the second emission unit is transmitted to the first object to be detected in the event that a corresponding value provided by the detected signal pulse or series of signal pulses exceeds or falls below a set threshold or combinations thereof.

In Example 14x, the subject matter of any one of Example 1x to 13x can optionally include that the acquisition and information unit comprises a radio communication unit.

Example 15x is a method to detect and/or communicate with a traffic participant representing a first object. The method includes: Emitting a signal pulse intended to determine a distance by a first emission unit of a distance measurement unit allocated to the first object, reflecting the signal pulse at a second object representing a further traffic participant, detecting the reflected signal by a detection unit of the distance measurement unit and determination of the distance based on the measured run-time, further detecting the signal pulse emitted by the first emission unit by an acquisition and information unit allocated to the second object, outputting an information signal noticeable by human senses by the acquisition and in-formation unit depending on the detection result.

Example 16x is a computer program product. The computer program product includes a plurality of instructions that may be embodied in a non-transitory computer readable medium to execute the method according to Example 15x and/or to be implemented in a system according to any of the Examples 1x to 14x.

In the conventional automotive application area (e.g., in a conventional automotive system), vehicle-to-vehicle (V2V) communication may be provided by means of radio-frequency communication. In a typical system, the same radio-frequency channel may be provided for authentication and data transfer. The communication may be altered and/or interrupted, for example in case said radio-frequency channel is jammed or intersected. Encryption on the radio communication signal may be provided, and the system may be designed according to safety standards (e.g., the design may be provided to comply with the Automotive Safety Integrity Level (ASIL) depending on the risk posed by a system malfunction). A conventional automotive system may include independent systems for ranging and communication.

Various embodiments may be related to a ranging system (e.g., a LIDAR system, such as a Flash LIDAR system or a scanning LIDAR system) including ranging and communication capabilities. The additional communication functionality may be provided to the ranging system by a light pulsing mechanism (e.g., a laser pulsing mechanism). The ranging system (e.g., a signal modulator of the ranging system, also referred to as electrical modulator) may be configured to encode data into a LIDAR signal (e.g., into a light pulse). Illustratively, a LIDAR signal described herein may include a ranging signal (e.g., may be configured to have ranging capabilities) and/or a communication signal (e.g., may be configured to have data communication capabilities). A configuration as described herein may provide communication between different objects (e.g., between ranging systems, between vehicles, between a vehicle and a traffic control station, etc.) in an application area in which ranging is implemented (e.g., light detection and ranging, such as LIDAR).

In the context of the present application, for example in relation to FIG. 145A to FIG. 149E, the term "signal modulation" (also referred to as "electrical modulation") may be used to describe a modulation of a signal for encoding data in such signal (e.g., a light signal or an electrical signal, for example a LIDAR signal). By way of example, a light signal (e.g., a light pulse) may be electrically modulated such that the light signal carries or transmits data or information. Analogously, the term "signal demodulation" (also referred to as "electrical demodulation") may be used to describe a decoding of data from a signal (e.g., from a light signal, such as a light pulse). Electrical modulation may be referred to in the following as modulation, where appropriate. Electrical demodulation may be referred to in the following as demodulation, where appropriate. Illustratively, in the context of the present application, the modulation performed by a signal modulator may be a signal modulation (e.g., an electrical modulation), and a demodulation performed by one or more processors may be a signal demodulation (e.g., an electrical demodulation).

An optical communication channel (also referred to as optical data channel) may be provided. The optical communication channel may be used in alternative or in combination with a main data transfer channel (e.g., a main radio-based channel). As an example, the optical communication channel may be used in case radio communication is unavailable, for example for exchanging critical information (e.g., between vehicles). Illustratively, a communication system (e.g., of a vehicle) may include one or more components configured for radio communication (e.g., a radio communication device), and one or more components configured for optical communication (e.g., a ranging system, such as a LIDAR system, configured as described herein). Further illustratively, a communication system may include one or more components configured for in-band communication and one or more components configured for out-of-band communication.

The optical communication channel may be used for exchange of any type of data or information (e.g., the channel may be provided for exchange of different type of data depending on a data bandwidth of the optical communication channel). By way of example, the optical communication channel may be used for exchange of sensitive information (e.g. key exchange or safety critical information, for example authentication data), e.g. the optical communication channel may be used in conjunction with the radio-based channel for authentication and key exchange. This may increase the security of the communication, similar to a 2-factor-authentication (illustratively, communication over two different media). As an example scenario, in case of automotive LIDAR the optical communication channel may provide secure authentication between neighboring vehicles in addition to the main data transfer channel (illustratively, the in-band channel). The (e.g., additional) optical data channel (illustratively, the out-of-band channel, OOB) may be directional and/or based on direct line of sight. This may provide the effect that the optical data channel may be more difficult to jam or intersect compared to the radio-based channel. This may be related, for example, to radio waves and light being electromagnetic waves at different frequencies.

In various embodiments, a ranging system may be configured to superimpose a modulation (e.g., a time-domain modulation) on a ranging pulse (e.g., a laser pulse), for example to encode data (illustratively, to superimpose a modulation on a LIDAR pulse with ranging capabilities to encode data in the LIDAR pulse). The modulation may have a time duration dependent on the duration of the pulse. The pulse may have a pulse duration, $t_{pulse}$, (also referred to as pulse width) in the range from about 500 ps to about 1 μs, for example from about 1 ns to about 500 ns, for example from about 2 ns to about 50 ns. The ranging system (e.g., a light detection and ranging system) may be included in a sensor device (e.g., a vehicle). The data (e.g., encoded and/or sent) may include various types of information, for example sensitive information (e.g., the data may include safety-related data and/or security-related data). By way of example, the data may include safety critical communication. As another example, the data may include one or more encryption key to secure communication of sensitive data (e.g., communication only with the one or more systems or objects that are in the field of view of the ranging system, for example in the line of sight of the ranging system). As a further example, the data may include Automotive Safety Integrity Level data and/or the data may comply (in other words, may be in accordance) with Automotive Safety Integrity Level regulations, for example as defined by the ISO 26262 "Road vehicles—Functional safety".

In various embodiments, a pulse (e.g., a LIDAR pulse, such as a light pulse, for example a laser pulse) may have a predefined waveform (e.g., a predefined first waveform, for example sinusoidal or Gauss shaped). The ranging system (e.g., the signal modulator) may be configured to modify (in other words, to change) the predefined waveform of a pulse to a modified waveform, e.g. a modified second waveform (e.g., to modify one or more portions or one or more properties of the predefined waveform of a pulse such that the pulse has the modified waveform). Illustratively, the signal modulator may be configured to modify the predefined waveform of a light pulse (illustratively, the predefined waveform to be used for emitting a light pulse) such that the light pulse (e.g., the emitted light pulse) has a modified waveform different from the predefined waveform (illustratively, the modified second waveform may be different from the predefined first waveform). The pulse may be modulated in the time-domain with one or more complete or partial waveforms. The modulation may be within the pulse duration $t_{pulse}$ (also referred to as signal time $t_{signal}$). The modification of the waveform (illustratively, the generation of the modified waveform) may provide modulating (in other words, encoding) data onto the pulse. By way of example, the signal modulator may be configured to modify the amplitude of the predefined waveform of the pulse, e.g. the modified waveform may have a different amplitude compared to the predefined waveform. As another example, the signal modulator may be configured to introduce one or more hump-like structure elements in the predefined waveform of the pulse (e.g., one or more humps or peaks), e.g. the modified waveform may include one or more hump-like structure elements. The signal modulator may be configured to modulate the shape of the individual hump-like structure elements, e.g. while keeping a total pulse width constant. As a further example, the signal modulator may be configured to modify the duration of the predefined waveform of the pulse (e.g., the signal modulator may be configured to modulate the time width or pulse width of the waveform of the pulse, for example by modifying or shifting the rise time and/or the fall time of the pulse), e.g. the modified waveform may have a different duration compared to the predefined waveform.

In the following, various properties or aspects are described in relation to "a waveform". It is intended that "a waveform" may describe the predefined waveform and/or the modified waveform, unless stated otherwise. Illustratively, the properties or aspects described in relation to a waveform may apply to the predefined waveform and/or the modified waveform. A waveform (e.g., in a ranging system) may be determined by the components provided for generating the pulse (e.g., the LIDAR pulse, such as a laser pulse for a LIDAR), illustratively by the response of such components. By way of example, a waveform (or a partial waveform) may be linear, sinusoidal, exponential, and/or Gaussian (in other words, a waveform or partial waveform may have a linear shape, sinusoidal shape, exponential shape, and/or Gaussian shape). Each waveform may have one or more characteristic properties associated therewith. The one or more characteristic properties may depend, for example, on the shape of the waveform (e.g., on a shape characteristic of the waveform). In an exemplary case, a laser pulse for a LIDAR may be a high-power pulse, e.g. the laser pulse may include high peak laser power for a short duration (e.g., less than 20 ns or less than 10 ns). Said laser pulse may be generated by the charge and/or discharge of to electronic components on a solid-state laser, illustratively by supplying a suited current pulse to the solid-state laser. A response of such electronic components may be linear, sinusoidal, exponential, and/or Gaussian.

The modulation in the time-domain may provide a corresponding effect in the frequency-domain. The properties of the signal in the is frequency-domain may depend on the properties of the signal (e.g., the pulse) in the time-domain. Each complete or partial waveform may generate a unique signature in the frequency-domain. In the frequency-domain, a characteristic of the waveform may be represented by one or more frequency components of the frequency-domain signal (illustratively, a characteristic of the waveform may be found in terms of sets of frequency peaks). Illustratively, each complete or partial waveform may generate one or more frequency-domain components in the frequency-domain (e.g., peaks, also referred to as response peaks). The one or more frequency-domain components may be different for each waveform (illustratively, each waveform or partial waveform may be associated with a frequency-domain signal including different peaks, e.g. a different number of peaks, peaks with different amplitude, and/or peaks at different frequencies). By way of example, a sinusoidal waveform may be associated with a different set of peaks as compared to an exponential waveform or to a linear waveform or to a Gaussian waveform.

By way of example, the frequency at which one or more components of a frequency-domain signal occur may depend on the signal time $t_{signal}$ and/or on the type of complete or partial waveform. Illustratively, a waveform that compresses a pulse (e.g., an exponential waveform, illustratively a waveform with exponential waveform portions, such as with exponential edges) may generate or may be associated with higher frequency peaks (e.g., one or more peaks at higher frequency). A waveform that distends a pulse (e.g., a sinusoidal waveform) may generate lower frequency peaks. As another example, the amplitude (also referred to as the magnitude) of a component may be dependent on how often the associated waveform (or partial waveform) is repeated within the pulse (e.g., on the number of repetitions of the same waveform or partial waveform along the pulse). Illustratively, a specific signature (e.g., peak signature) may be stronger than the background in the frequency-domain in case the pulse contains the same waveform (e.g., the associated waveform) more than once.

As another example, the shape characteristic may affect the differences in time for each amplitude level among different waveforms. Illustratively, a time at which a waveform (e.g., a pulse having that waveform) reaches a certain amplitude level (e.g. a peak level) may be dependent on the shape characteristic. The differences in time may provide a corresponding difference in the frequency-domain (illustratively, a different response in the frequency). As an exemplary case, a time difference between the 50% point for the rise and the 50% point for the decay may be higher for a pulse having a sinusoidal shape characteristic for the rise and the decay than for a pulse having a sinusoidal shape for the rise and an exponential shape for the decay. The 50% point for the rise (decay) may be understood as the time point at which the waveform reaches the 50% of its maximum amplitude during the rise (decay).

As a further example, a waveform (e.g., a light pulse) may include a first portion (e.g., a rise portion) and a second portion (e.g., a decay portion, also referred to as fall portion). The portions of the waveform may be or may have a partial waveform (e.g., a partial sinusoidal waveform, a partial linear waveform, a partial exponential waveform, or a partial Gaussian waveform). The first portion may have the same partial waveform as the second portion, or the first portion may have a different partial waveform as compared to the second portion. The type of the partial waveforms, e.g. a slope of the waveform (e.g., in the first portion and/or in the second portion, e.g., the rise slope and/or decay slope) may determine the position of one or more frequency-domain components associated with the waveform. By way of example, a waveform having a fast exponential decay (e.g., a second portion having an exponential partial waveform) may be associated with peaks in a higher frequency region with respect to a waveform having sinusoidal decay or linear decay (illustratively, slower decay).

The different frequency-domain response or output provided is by different waveforms may provide means for using a pulse for various purposes in addition to ranging, for example for encoding and/or decoding data (e.g., for modulating data onto a light pulse). The encoding may be based on waveform modulation (e.g., waveform shape modulation). Illustratively, a change in the waveform (e.g., in the waveform shape) may be used to encode data on the transmitter (e.g., on the emitter side or encoder side of a ranging system). Further illustratively, changing the predefined waveform of a light pulse to the modified waveform may be used to encode data on the light pulse. A first waveform may represent a first type of data (e.g., a first bit or group of bits) and a second waveform may represent a second type of data (e.g., a second bit or group of bits). By way of example, the predefined waveform may represent a first type of data and the modified waveform may represent a second type of data. As another example, a modified waveform may represent a first type of data and another modified waveform may represent a second type of data. A receiver (e.g., the receiver side or decoder side of a ranging system or any other system which is sensitive to the wavelength of the transmitted light signal) may be configured to interpret the pulse (e.g., to decode the data) by the frequency-domain signal associated with the waveform. Illustratively, the receiver may be configured to observe the effect of the change (e.g., the effect of the different properties of different waveforms) as signature peaks of the waveform e.g., of the waveform shape) in the frequency-domain to decode the data. Such decoding method (illustratively, based on the frequency-domain signature) may be independent from amplitude information (e.g., it may not rely on the amplitude information). The decoding method may be provided for small signal recovery with high levels of noise.

The ranging system (or a vehicle) may have access to a database. By way of example, the database may be stored in a memory of the ranging system (or the vehicle) or it may be stored in a system-external device (e.g., the ranging system may be communicatively coupled with the device). The database may store a plurality of waveforms (e.g., of current waveforms which may be supplied by a signal modulator to generate respective light pulses) associated with corresponding information (e.g., corresponding data, such as corresponding bits). Illustratively, the database may store a plurality of commands and/or properties (e.g., sets of parameters) associated with the generation of a respective waveform. The database may store commands and/or properties to be provided to a driver circuit (e.g., a light source controller), e.g. an analog driver circuit. As an example, the database may store a predefined signal (e.g. a predefined pulse-width modulated (PWM) signal) for charging a capacitor to be used for generating a waveform (or partial waveform). As another example, the database may store a configuration for controlling a plurality of switches to discharge at least some capacitors of a plurality of capacitors to drive a laser diode to emit a light pulse having a certain waveform, as described in relation to FIG. 155B to FIG. 157B. As another example, the database may store instructions to be interpreted by a current source (e.g., a programmable current source), illustratively the current source may determine a plurality of current values to be provided for generating a waveform from the associated instructions. A combined approach (e.g., with analog parameters and with instructions) may also be provided.

The database may store or may be a codebook, for example including a table with waveforms which are mapped to corresponding bit sequences. Illustratively, each waveform may be associated with a corresponding bit value or with a corresponding sequence of bit values. A ranging system may be configured to encode/decode (e.g., modulate/demodulate) a light pulse according to the codebook (illustratively, retrieving the associated waveform or data from the codebook). The codebook may be standardized among different traffic participants (e.g., among different ranging systems, for example provided by different manufacturers).

The frequency-domain signal may be determined (e.g., retrieved or calculated) from the time-domain signal, for example via Fast Fourier Transform (FFT). The ranging system (e.g., one or more processors) may be configured to distinguish different waveforms according to the respective frequency-domain components (e.g., to the position of the respective peaks). The reliability of such distinction may depend on the number of different frequency-domain components in the frequency-domain signals associated with different waveforms. The reliability of such distinction may also depend on the magnitude of the frequency-domain components (e.g., on the relative magnitude of frequency-domain components in the frequency-domain signals associated with different waveforms). The data encoding and/or decoding capabilities may be related to the ability of distinguishing different waveforms (illustratively, the more waveforms may be distinguished, the more bits may be encoded).

In various embodiments, a waveform may include one or more hump-like structure elements (e.g., one or more humps or peaks). Illustratively, a light pulse may be modulated in the time-domain with one or more humps (for example, a main pulse with duration $t_{signal}$=182 ns may be modulated in the time-domain with three humps). It is understood that the value of 182 ns used herein is chosen only as an example (illustratively, for representation purposes), and that the light pulse may also have a different duration, for example a shorter duration (e.g., from about 10 ns to about 20 ns, for example 18 ns). This may be referred to as coded hump (e.g., coded hump pulse). A hump-like structure element may be understood as a part (or sub-part) of the waveform (or pulse) having a first portion (e.g., rise) and a second portion (e.g., decay). Illustratively, each hump-like structure element may include a rise and decay that follow the response of the electronic components. The first portion and the second portion of a hump-like structure element may have a same partial waveform (e.g., same type) or different partial waveforms. By way of example a hump may have a sinusoidal rise and a linear decay.

Illustratively, a pulse including one or more hump-like structure elements may be divided into one or more parts or sub-parts. By way of example, a pulse including three humps may be divided in a total of six parts. An amplitude (e.g., a depth) of a hump-like structure (illustratively, the extent of the respective rise and decay) may be dependent on specifics of the application, for example on signal-to-noise ratio considerations. By way of example, the signal modulator may be configured to provide a modulation depth for a hump-like structure in a range from about 10% of the maximum amplitude (e.g., of the hump-like structure) to about 50% of the maximum amplitude. Such modulation depth may provide demodulation, e.g. decoding of the data. Such selection of the range of modulation depth may be related to the encoding/decoding method not using amplitude information. Illustratively, a partial modulation may be provided (e.g., the amplitude is not reduced to substantially 0). This may provide the effect of a simplified circuit topology.

The properties of the one or more hump-like structure elements (e.g., the type of partial waveforms, the modulation depth, the number of hump-like structure elements) may have a corresponding effect in the frequency-domain. By way of example, a waveform including one or more humps each having sinusoidal shape characteristic (e.g., sinusoidal rise and sinusoidal decay) may be associated with a different frequency-domain signal with respect to a waveform including one or more humps having at least one linear partial waveform and/or at least one exponential partial waveform (e.g., linear rise and/or exponential decay).

The different waveforms (illustratively, including the different hump-like structure elements) may provide different frequency-domain responses (e.g., different frequencies may be identified from the FFT). As an example, a waveform including humps having an exponential decay may be associated with higher frequency peaks (e.g., above 20 MHz in case of a light pulse with a pulse duration of 182 ns and including three hump-like structure elements) with respect to the waveform including humps having a sinusoidal decay. As another example, a waveform including humps having a linear rise and an exponential decay may be associated with higher frequency peaks (e.g., at around 35 MHz in case of a light pulse with a pulse duration of 182 ns and including three hump-like structure elements) with respect to the waveform including humps having a sinusoidal rise and a sinusoidal decay. The higher frequency components may be provided by a higher compression of the waveform provided by the combination of linear and exponential responses with respect to the sinusoidal rise.

A hump-like structure element may be configured independently from the other hump-like structure elements. A waveform may include a plurality of hump-like structure elements, and each hump-like structure may have different properties (e.g., portions with different partial waveforms) with respect to each other hump-like structure. Alternatively, one or more first hump-like structure elements (e.g., a first subset) may have different properties from one or more second hump-like structure elements (e.g., a second subset). Illustratively, a waveform may include a multiplex of partial waveforms (e.g., a multiplex of rise and decay responses).

A waveform including a plurality of humps (e.g., three humps) may have a plurality of different configurations. By way of example, in a reference waveform all the humps may have a sinusoidal rise and decay. Various configurations may be provided by modifying the reference waveform. The first rise and last decay may be kept to a sinusoidal response for all the possible waveforms (illustratively, the first rise and last decay may have or keep a sinusoidal character for all possible waveforms). This may reduce the complexity of high-power discharge of multiple electronic components. This may also simplify the possible combinations for the coded hump. As an example, at least one of the humps may have a linear decay (this may provide the absence of one or more frequency-domain peaks with respect to the reference waveform). As another example, at least one of the humps may have an exponential decay (this may provide higher frequency components). As another example, at least one of the humps may have a linear decay and at least one of the humps may have an exponential decay (this may provide different frequency-domain peaks with respect to the previous example). As another example, at least one of the humps may have a linear rise, at least one of the humps may have a linear decay and at least one of the humps may have an exponential decay (this may provide a distinctive frequency component, e.g. not associated with any of the other waveforms). As another example, at least one of the humps may have an exponential rise, at least one of the humps may have a linear decay and at least one of the humps may have an exponential decay (this waveform may provide a rarefaction of the last rise response, and may provide different frequency-domain peaks with respect to the previous example). As a further example, at least one of the humps may have a Gaussian rise, and/or at least one of the humps may have a Gaussian decay.

The independent configuration of the hump-like structure elements may provide encoding of a plurality of bits in a single waveform (e.g., in a single pulse). Illustratively, a portion of the waveform and/or of a hump-like structure (e.g., each partial waveform) may represent or may be associated with a type of information, e.g. with a bit.

By way of example, a three-hump pulse for LIDAR may have a total of six signal portions, illustratively three rises and three decays, each of which may be used to encode data. Assuming, as an example, that two distinct rises may be available for encoding (e.g., a sinusoidal rise and a linear rise), and assuming that two distinct decays may be available for encoding (e.g., a sinusoidal decay and an exponential decay), then log 2(2)=1 bit may be encoded onto each rise, and log 2(2)=1 bit may be encoded onto each decay. In total, this may correspond to 6*1 bit that may be encoded onto the six signal portions of a three-hump pulse. The number of bits per rise/decay may be increased via a larger variety of waveforms.

A bitrate may be calculated (e.g., a maximum number of bits transmitted per second assuming zero errors and single transmission). The bitrate may be calculated as $$\text{Bitrate[bit/s]}=\text{Bits}_{pulse}*\text{Pulse}_{rate}, \tag{8ab}$$

where $\text{Bits}_{pulse}$ [bit/pulse] may be or describe the number of bits that may be encoded onto one pulse, and $\text{Pulse}_{rate}$ [pulse/s] may be or describe the number of pulses that are emitted per second. The number of pulses that are emitted per second may be estimated as $$Pulse_{rate}[\text{pulse/s}] = \frac{\text{Duty Cycle}}{t_{pulse}}, \tag{9ab}$$

using the system duty cycle (which may be a laser constraint), and the pulse duration $t_{pulse}$. Referring to the previous example, and assuming that the duty cycle is 0.1% and that the pulse duration $t_{pulse}$ is 10 ns, the following values may be calculated for a three-hump pulse, $$Pulse_{rate} = \frac{0.001}{10^{-9}} = 10^5 \text{ pulse/s},$$

$$Bits_{pulse} = 6 \text{ bit/pulse},$$

$$\text{bitrate} = 6*10^5 = 600*10^3 \text{ bit/s, or } 600 \text{ kbit/s.}$$

In various embodiments, a peak detection algorithm may be implemented (e.g., by the one or more processors). Illustratively, one or more conditions may be provided for a frequency-domain component to be considered for demodulation (e.g., for data decoding). By way of example, a frequency-domain component having an amplitude below a predefined amplitude threshold may be neglected (e.g., below an amplitude threshold of 30% the maximum amplitude of the signal). As another example, frequency-domain components having a frequency separation below a predefined separation threshold (e.g., 2 MHz) may be neglected. Such one or more conditions may be provided for directly processing a frequency-domain response with a higher level of noise (e.g. in a situation where the signal power is low or the noise is higher than expected). The high level of noise may degrade the signal quality, e.g. the signal-to-noise ratio (SNR). Illustratively, the one or more conditions may be provided for reducing a large noise floor. Subsequent analysis may be performed on the processed (e.g., cleaned) frequency-domain signal.

In various embodiments, the encoding may be based on a shift of the waveform in the time-domain (e.g., on a time-shift of the hump-like structure elements, for example with respect to a predefined waveform or reference waveform). Illustratively, the encoding may be based on a modulation of the pulse width, e.g. of the rise time and/or fall time (e.g., different waveforms or different pulses may rise and/or decay at different time points, e.g. shifted time points). Such encoding may provide resiliency to noise. The decoding may be performed according to a total signal time (e.g., the total pulse width). Illustratively, a pulse width may represent or may be associated with one or more bits. Additionally or alternatively, the decoding may be performed according to the signature of the signal in the frequency-domain. The total signal time may be modified without affecting the ranging of the system (e.g., without affecting the ranging capabilities of a LIDAR system).

The total signal time (e.g., of the pulse) may be modulated (e.g., the signal modulator may be configured to modify the duration of the predefined waveform). Such modulation may be performed in addition or in alternative to the modulation described above (e.g., in addition or in alternative to modulating the partial waveforms of the one or more hump-like structure elements). Thus, the two modulations may be applied independently or simultaneously. This may provide an increase in the bitrate and/or it may provide separation of the quality of information to be transmitted.

The modulation of the signal time may be implemented in various ways. By way of example, the full width at half maximum of the pulse may be increased. As another example the rise and/or decay times may be increased (e.g., the first sinusoidal rise time and/or the last sinusoidal decay time of the reference waveform). The shift in the rise and/or decay time may be detected (e.g., waveforms or pulses may be distinguished from one another according to the corresponding time-shift). A threshold for the time-shift may be defined. The threshold may be dependent on the signal time (illustratively, a maximum time-shift for which different waveforms may be distinguished may be provided as a maximum percentage of the total signal time, for example the threshold may be 25% of the signal time). Above the threshold time-shift a saturation behavior may occur. Illustratively, a linear region and a saturation (e.g., non-linear) region may be determined in a graph showing the demodulated signal time in relation to the modulated time-shift.

A bitrate may be calculated (e.g., a maximum number of bits transmitted per second in the linear region). The bitrate may be dependent on a step size (e.g., on a difference between adjacent time-shifts). By way of example, the step size may be 5% of the signal time. The bitrate (assuming a $\text{Pulse}_{rate}$ as described above) may be calculated as, $$\sum \text{steps} = \left\lfloor \frac{\text{threshold time-shift}}{\text{step size}} \right\rfloor + 1 = \left\lfloor \frac{25\%}{5\%} \right\rfloor + 1 = 6, \tag{10ab}$$

$$Bits_{pulse}[\text{bit/pulse}] = \log 2\left(\sum \text{steps}\right) \tag{11ab}$$

$$\text{bit} = \log 2(6)$$

$$\text{bit} = 2.58 \text{ bit},$$

$$\text{Bitrate} = 2.58*10^5 \text{ bit/s} = 258*10^3 \text{ bit/s, or } 258 \text{ kbit/s.}$$

The bitrate may be increased, for example, by decreasing the step size. As an example, with a step size of 2%, the bitrate may be calculated as, $$\sum \text{steps} = \left\lfloor \frac{25\%}{2\%} \right\rfloor + 1 = 13,$$

$$Bits_{pulse}[\text{bit/pulse}] = \log 2\left(\sum \text{steps}\right)$$

$$\text{bit} = \log 2(13)$$

$$\text{bit} = 3.70 \text{ bit},$$

$$\text{Bitrate} = 3.70*10^5 = 370*10^3 \text{ bit/s, or } 370 \text{ kbit/s.}$$

The bitrate may be dependent on the step size. Illustratively, the bitrate may be dependent on the ability to see (e.g., to distinguish) a time difference between a time-shift of a received signal.

In various embodiments, a modulation may be provided according to a combination of one or more of the above-described aspects. Illustratively, a modulation may be provided according to a combination of modulating the inner shape response of a hump-based pulse, for example with sinusoidal rise and decay, and of modulating (e.g., time shifting) the rise and/or decay time of the hump-based pulse. A modulation of the pulse width is may provide a corresponding effect in the frequency-domain (e.g., a greater pulse width may be associated with stronger peaks in the lower frequency side of the frequency-domain signal). The demodulation of a pulse having modulated inner shape may be based on a pattern of pulse frequencies in the frequency-domain (e.g., a pattern that fits a previous calibration, for example a difference with respect to a predefined or reference pattern). The demodulation of a pulse having modulated rise and/or decay time may be based on the total signal time of the whole pulse. Thus, independent modulation and/or demodulation processes may be provided. The combination may increase the bitrate (illustratively, via channel aggregation). The combination may provide qualitatively dividing into separate streams the data to be transmitted (e.g. a first stream may broadcast a vehicle identification number (VIN), and a second stream may broadcast an encryption key).

The ranging system and/or the method described herein may provide additional capabilities to the ranging system (e.g., data communication capabilities). Two independent data communication streams via two independent methods of modulation may be provided independently or in combination. The combination of the modulation methods may provide an increased data rate, redundancy and/or a decreased error rate (e.g., higher reliability). The modulation methods described herein may not interfere or degrade the ranging capabilities of the ranging system, e.g. for time-of-flight measurements (for example in a time-of-flight LIDAR). The modulation methods described herein may not interfere with a radio-based system and may not suffer interference from a radio-based system (e.g., radar, mobile communications, Wi-Fi).

The modulation methods described herein may be implemented in already existing ranging systems. Illustratively, an existing ranging system (e.g., the components) may be adapted to provide the desired pulse modulation. Illustratively, a laser pulsing scheme of the ranging system may be adapted for encoding data for transmission, and an additional signal processing step may be provided to decode data from the receiver. Thus, the modulation methods described herein may be provided with a relatively low implementation effort.

A ranging system configured as described herein may not interfere with other ranging systems (e.g., LIDAR systems, for example of other vehicles), for example with ranging systems not configured as described herein or not compatible with such configuration.

A configuration as described herein may provide increased safety (e.g., in automotive application). By way of example, by means of one or more additional optical communication channels vehicles may communicate safety critical information even in case radio communication is not working. A configuration as described herein may provide increased security. By way of example, secure authentication between neighboring vehicles may be provided that is more resilient to hacking due to the necessary condition of line of sight to detect the signal (similar to two-factor authentication). In addition, a signal with the authentication data may be contained within the vicinity of the vehicle and may follow the same properties of a ranging system. Illustratively, only the vehicles detected by the ranging system may be able to receive the signal and/or the vehicles detected may be the ones in nearby vicinity and thus with a main interest to enable a communication channel.

FIG. 145A and FIG. 145B show each a portion of a ranging system 14500 in a schematic representation in accordance with various embodiments.

The ranging system 14500 may be or may be configured as a LIDAR system (e.g., as the LIDAR Sensor System 10, for example as a Flash LIDAR Sensor System 10 or as a Scanning LIDAR Sensor System 10). The ranging system 14500 may be included, for example, in a sensor device, such as a vehicle (e.g., a car, such as an electric car). The ranging system 14500 may be or may be configured as the ranging system 13300 described, for example, in relation to FIG. 131 to FIG. 137 and/or as the ranging system 13800 described, for example, in relation to FIG. 138 to FIG. 144. It is understood that in FIG. 145A and FIG. 145B only some of the components of the ranging system 14500 may be illustrated. The ranging system 14500 may include any other component as described, for example, in relation to the LIDAR Sensor System 10 and/or in relation to the ranging system 13300 and/or in relation to the ranging system 13800.

FIG. 145A shows a portion of an emitter side 14502 (also referred to as encoder side) of the ranging system 14500 in a schematic representation in accordance with various embodiments.

The ranging system 14500 may include a light source 42. The light source 42 may be configured to emit light, e.g. a light signal. The light source 42 may be configured to emit light having a predefined wavelength, e.g. in a predefined wavelength range. For example, the light source 42 may be configured to emit light in the infra-red and/or near infra-red range (for example in the range from about 700 nm to about 5000 nm, for example in the range from about 860 nm to about 1600 nm, for example 905 nm). The light source 42 may be configured to emit light in a continuous manner or it may be configured to emit light in a pulsed manner (e.g., to emit one or more light pulses, such as a sequence of laser pulses). By way of example, the light source 42 may be configured as a laser light source. The light source 42 may include at least one laser light source (e.g., configured as the laser source described, for example, in relation to FIG. 59). The laser light source may include at least one laser diode. As an example, the light source 42 may include an array of light emitters (e.g., a VCSEL array). As another example, the light source 42 (or the ranging system 14500) may include a beam steering system (e.g., a system with a MEMS mirror).

The ranging system 14500 may also include more than one light source 42, for example configured to emit light in different wavelength ranges and/or with different polarization orientations and/or at different rates (e.g., pulse rates). By way of example, a first light source may be configured or dedicated for ranging operations, and a second light source may be configured or dedicated for data transmission.

The ranging system 14500 may include a light source controller 14506. The light source controller 14506 may be or may be configured as the light source controller 13312 described, for example, in relation to FIG. 131 to FIG. 137; and/or as the light source controller 13804 described, for example, in relation to FIG. 138 to FIG. 144. The light source controller 14506 may be configured to control the light source 42 (e.g., to control an emission of light by the light source 42).

The light source controller 14506 may be configured to control the light source 42 to emit at least one light pulse 14508 (e.g., one or more light pulses 14508, such as a sequence of light pulses 14508). A light pulse 14508 (e.g., each light pulse 14508) may have a predefined waveform (e.g., a predefined first waveform). Illustratively, the light source 42 may be configured such that a light pulse (e.g., a laser pulse) emitted by the light source 42 may have the predefined waveform. By way of example, the predefined waveform may be a sinusoidal waveform, e.g. a light pulse may have a sinusoidal shape (e.g., a laser pulse may have a sinusoidal shape).

A light pulse 14508 may have a pulse duration in the range from about 500 ps to about 1 μs, for example from about 1 ns to about 500 ns, for example from about 2 ns to about 50 ns, for example 182 ns (only as an exemplary case). A light pulse 14508 may include one or more portions. By way of example, a light pulse 14508 may have a first portion, e.g. a rise portion. The light pulse 14508 may have a second portion, e.g. a decay to portion (also referred to as fall portion). Illustratively, the light pulse 14508 may be configured such that an amplitude (in other words, a pulse height) of the light pulse 14508 increases in the first portion (e.g., from an initial value, such as substantially 0, up to a predefined value, such as a maximum amplitude value of the light pulse 14508). The light pulse 14508 may be configured is such that the amplitude decreases in the second portion (e.g., from the predefined value, such as the maximum value, down to the initial value, such as substantially 0).

A portion of the light pulse 14508 may have a predefined waveform or partial waveform. Illustratively, a portion of the light pulse 14508 may have a shape corresponding to a portion of a waveform (e.g., of the predefined waveform). The first portion of the light pulse 14508 may have a (e.g., first) partial waveform (for example, corresponding to a rise portion of a sinusoidal waveform). The second portion of the light pulse 14508 may have a (e.g., second) partial waveform (for example, corresponding to a decay portion of a sinusoidal waveform). The first partial waveform may be the same as the second partial waveform (illustratively, a light pulse 14508 may have a same type of rise and decay). By way of example, a light pulse 14508 having the predefined waveform may have a first portion and a second portion having the same partial waveform (e.g., sinusoidal rise and sinusoidal decay). The first partial waveform may be different from the second partial waveform (illustratively, a light pulse 14508 may have different type of rise and decay), as described in further detail below.

A portion of the light pulse 14508 may have a slope or an edge (e.g., a rise slope or a decay slope). The properties of the slope (e.g., the steepness, the curvature or the length) may be defined by the shape of the portion (e.g., by the partial waveform of the portion). By way of example, a portion having a sinusoidal partial waveform may have a slope less steep than a portion having an exponential partial waveform. Illustratively, the light pulse 14508 may have a first slope in the first portion and a second slope in the second portion. The first slope may be the same as the second slope or may be different from the second slope (e.g., more steep or less steep).

A portion of the light pulse 14508 may have a time duration (e.g., a rise time or a decay time). The time duration may be defined by the shape of the portion. By way of example, the first portion may have approximately the same duration as the second portion (illustratively, a light pulse 14508 may have approximately the same rise time and decay time). As another example, the first portion and the second portion may have different time duration (e.g., a pulse may have rise time different from the decay time).

The ranging system 14500 may include a signal modulator 14510. The signal modulator 14510 may be configured to modify the predefined waveform of at least one light pulse 14508 to a modified waveform (e.g., a modified second waveform), such that the at least one light pulse 14508 has the modified waveform (e.g., such as at least a first portion or a second portion of the light pulse 14508 has a modified partial waveform different from the predefined waveform). The predefined waveform of the at least one light pulse 14508 may be or describe the waveform that would be used to emit the light pulse 14508 in case no modification was carried out (e.g., the waveform that would be associated with the light pulse 14508 or the waveform that the light pulse 14508 would have in case no modification was carried out). The modified (e.g., second) waveform may be different from the predefined (e.g., first) waveform. Illustratively, the signal modulator 14510 may be configured to electrically modulate at least one light pulse 14508 such that the at least one light pulse 14508 has a modified waveform different from the predefined waveform. The signal modulator 14510 may be configured to generate a modulation in the time-domain onto the at least one light pulse 14508. By way of example, the signal modulator 14510 may be configured to generate a modulated signal (e.g., a modulated electrical signal). The signal modulator 14510 may be configured to provide the modulated signal to the light source 42 (and/or to the light source controller 14506). The light source 42 may emit the at least one light pulse 14508 in accordance with the modulated signal. Illustratively, the signal modulator 14510 may be configured to electrically modulate the light source 42 such that at least one light pulse 14508 is emitted having the modified waveform.

The signal modulator 14510 and the light source controller 14506 may also be combined in a single device (e.g., in a single module). Illustratively, the ranging system 14500 may include a device including the signal modulator 14510 and the light source controller 14506. Further illustratively, the device may be configured as the signal modulator 14510 and the light source controller 14506, e.g. the device may be configured to operate as the signal modulator 14510 and the light source controller 14506 (illustratively, to control the light source 42 and to modify the predefined waveform of at least one light pulse 14508).

The signal modulator 14510 may be configured to modify the predefined waveform of the at least one light pulse 14508 (illustratively, to modify the predefined waveform to be used for emitting the at least one light pulse 14508) to enhance the capabilities of the at least one light pulse 14508 (illustratively, such that the at least one light pulse 14508 may be used for ranging measurements and/or for other applications). By way of example, the signal modulator 14510 may be configured to modulate data (in other words, to encode data) onto the at least one light pulse 14508. Illustratively, the modification of the predefined waveform may provide means for encoding data (e.g., the modified waveform may represent or encode data, for example according to one or more differences between the modified waveform and the predefined waveform). As an example, the signal modulator may be configured to modulate safety-related data onto the at least one light pulse 14508. The safety-related data may include Automotive Safety Integrity Level (ASIL) data and/or may be in accordance with ASIL regulations (in other words, the safety-related data may comply with ASIL regulations). Additionally or alternatively, the signal modulator 14510 may be configured to modulate security-related data onto the at least one light pulse 14508. The security-related data may include cryptographic information (e.g., one or more cryptographic keys and/or authentication data, such as a vehicle identification number).

It is understood that the signal modulator 14510 may be configured to modulate a plurality of light pulses 14508 (e.g., to modify the predefined waveform of a plurality of light pulses 14508 to a respective modified waveform). By way of example, the signal modulator 14510 may be configured to modify the predefined waveform of a first light pulse and of a second light pulse, such that the first light pulse and the second light pulse have a respective modified waveform (illustratively, each different from the predefined waveform). The first light pulse may have a different modified waveform with respect to the second light pulse (illustratively, the first light pulse and the second light pulse may encode or carry different type of data, such as different one or more bits). Alternatively, the first light pulse may have the same modified waveform as the second light pulse (illustratively, the first light pulse and the second light pulse may encode or carry the same type of data, such as the same one or more bits).

The signal modulator 14510 may be configured to modify (e.g., to modulate) an amplitude of the predefined waveform of the at least one light pulse 14508 (illustratively, an amplitude of the at least one light pulse 14508). The amplitude (e.g., a maximum amplitude) of the modified waveform may be greater or smaller than the amplitude (e.g., the maximum amplitude) of the predefined waveform. The amplitude of the modified waveform may vary (e.g., oscillate) within the duration of the modified waveform (e.g., within the duration of the light pulse 14508).

By way of example, the signal modulator 14510 may be configured to modify the predefined waveform of the at least one light pulse 14508 such that the modified waveform of the at least one light pulse 14508 includes one or more hump-like structure elements (e.g., a plurality of hump-like structure elements). A hump-like structure (e.g., a hump or a peak) may be understood as a part of a waveform in which the amplitude of the waveform varies from a local minimum (or the absolute minimum) to a local maximum (or the absolute maximum) and back to the local minimum. Illustratively, a sinusoidal waveform may be understood as a waveform having a single hump-like structure, e.g. a single hump (as shown, for example, in FIG. 147A). An example of a waveform including a plurality of hump-like structure elements (e.g., three) is shown, for example, in FIG. 147D.

Different hump-like structure elements may have different modulation depths (e.g., different local maximum and/or different local minimum). A hump-like structure element may have one or more portions, similarly to the description above for the light pulse 14508. Illustratively, a hump-like structure may have a first portion (e.g., rise portion). A hump-like structure element may have a second portion (e.g., a decay portion). The first portion may have a (e.g., first) shape or shape characteristic, e.g. a (first) partial waveform. The second portion may have a (e.g., second) shape or shape characteristic, e.g. a (second) partial waveform. The first partial waveform may be the same as the second partial waveform (e.g., a hump-like structure element may have the same type of rise and decay, for example sinusoidal rise and sinusoidal decay). The first partial waveform may be different from the second partial waveform (e.g., a hump-like structure element may have different type of rise and decay, for example linear rise and sinusoidal decay). The first portion may have a first slope. The second portion may have a second slope. The first slope may be the same as the second slope or may be different from the second slope. The first portion and the second portion may have approximately the same duration, or the first portion and the second portion may have different time duration.

The signal modulator 14510 may be configured to modify one or more properties of the one or more hump-like structure elements (e.g., of at least one hump-like structure element, or more than one hump-like structure element, or all the hump-like structure elements). Illustratively, the signal modulator 14510 may be configured to modify the predefined waveform of the at least one light pulse 14508 in accordance with one or more desired properties of the hump-like structure elements to be included in the modified waveform. By way of example, the signal modulator 14510 may be configured to modify the position of the one or more hump-like structure elements (illustratively, the center position of a hump-like structure element, e.g. the starting time of the first portion and/or the end time of the second portion). Illustratively, the signal modulator 14510 may be configured to modify the predefined waveform of the at least one light pulse 14508 to select or define a respective position of the one or more hump-like structure elements of the modified waveform. As another example, the signal modulator 14510 may be configured to modify the first portion and/or the second portion of a hump-like structure element (e.g., the slope and/or the time duration, e.g. such that a portion has a steeper or less steep slope, or that a portion has a longer or shorter time duration). Illustratively, the signal modulator 14510 may be configured to modify the rise slope and/or the decay slope of a hump-like structure element. Further illustratively, the signal modulator 14510 may be configured to modify the predefined waveform of the at least one light pulse 14508 to select or define a respective first portion and/or second portion of the one or more hump-like structure elements of the modified waveform.

The signal modulator 14510 may be configured to modify the duration (in other words, the pulse width) of the predefined waveform of the at least one light pulse 14508. Illustratively, the signal modulator 14510 may be configured to modify the predefined waveform such that the modified waveform (illustratively, the at least one light pulse 14508) has a longer or shorter duration with respect to the predefined waveform.

The modification of the predefined waveform (illustratively, of the at least one light pulse 14508) in the time-domain may have or generate a corresponding effect in the frequency-domain. Illustratively, as described above, a waveform may be associated with a corresponding signal in the frequency-domain (e.g., generated or obtained by doing a Fast Fourier Transform of the waveform). A waveform may be associated with one or more frequency-domain components (e.g., peaks, illustratively, the frequency-domain signal may have one or more peaks, also referred to as frequency components). The properties of the waveform in the time-domain may define the frequency-domain signal (e.g., the amplitude of the peaks, the number of peaks, and/or the frequency position of the peaks). By way of example, the slope of a portion of a light pulse 14508 (e.g., of the associated waveform) may determine the presence (or absence) of frequency-domain components at higher (e.g., above 20 MHz, for example for a pulse with duration 182 ns and including three hump-like structure elements) or lower frequencies (e.g., below 5 MHz, for example for a pulse with duration 182 ns and including three hump-like structure elements). Illustratively, the shape or shape characteristic of a portion (e.g., of the rise or the decay) may determine the presence (or absence) of frequency-domain components at certain frequencies.

The signal modulator 14510 may be configured to modify the predefined waveform of the at least one light pulse 14508 such that the first portion and the second portion of the light pulse 14508 (illustratively, of the modified waveform) are associated with (e.g., generate) frequency-domain components at different frequencies.

The signal modulator 14510 may be configured to modify the predefined waveform of the at least one light pulse 14508 such that the second portion is associated with higher frequency-domain components with respect to the first portion. Illustratively, the signal modulator 14510 may be configured to modify the predefined waveform of the at least one light pulse 14508 such that the second portion is associated with a higher frequency component in the frequency domain with respect to any frequency component in the frequency domain associated with the first portion. By way of example, the signal modulator 14510 may be configured to modify the predefined waveform of the at least one light pulse 14508 such that the second portion has a steeper slope with respect to the first portion. Illustratively, the signal modulator 14510 may be configured to generate a slope in the second portion of the at least one light pulse 14508 that is steeper than any slope in the first portion. As an example, the first portion may have a linear partial waveform or a sinusoidal partial waveform and the second portion may have an exponential partial waveform (or a Gaussian partial waveform). As another example, the first portion may have a sinusoidal partial waveform and the second portion may have a linear partial waveform.

Additionally or alternatively, the signal modulator 14510 may be configured to modify the predefined waveform of the at least one light pulse 14508 such that the second portion is associated with lower frequency-domain components with respect to the first portion. Illustratively, the signal modulator 14510 may be configured to modify the predefined waveform of the at least one light pulse 14508 such that the second portion is associated with a lower frequency component in the frequency domain with respect to any frequency component in the frequency domain associated with the first portion. By way of example, the signal modulator 14510 may be configured to modify the predefined waveform of the at least one light pulse 14508 such that the second portion has a less steep slope with respect to the first portion. Stated in another fashion, the signal modulator 14510 may be configured to generate a slope in the second portion of the at least one light pulse 14508 that is less steep than any slope in the first portion. As an example, the second portion may have a linear partial waveform or a sinusoidal partial waveform and the first portion may have an exponential partial waveform (or a Gaussian partial waveform). As another example, the second portion may have a sinusoidal partial waveform and the first portion may have a linear partial waveform.

It is understood that the frequency-domain components at higher (or lower) frequency associated with the first portion and/or with the second portion may be frequency-domain components having an amplitude above a certain threshold, as described in further detail below. Illustratively, the frequency-domain components at higher (or lower) frequency may not be associated with noise, but with one or more properties of the first portion and/or the second portion.

FIG. 145B shows a portion of a receiver side 14504 (also referred to as encoder side) of the ranging system 14500 in a schematic representation in accordance with various embodiments.

The ranging system 14500 may include a sensor 52 (e.g., a LIDAR sensor). The sensor 52 may include one or more sensor pixels. The sensor 52 may include one or more photo diodes. Illustratively, each sensor pixel may include or may be associated with a respective photo diode (e.g., of the same type or of different types). The one or more photo diodes may be configured to provide a received signal (e.g., an electrical signal, such as a current) in response to receiving a light pulse 14512 (e.g., in response to a light pulse 14512 impinging onto the sensor 52). Illustratively, the received signal may represent the received light pulse 14512 (e.g., the received signal may have one or more properties, e.g. a shape or a shape characteristic, associated with one or more properties of the received light pulse 14512).

The ranging system 14500 may also include more than one sensor 52. By way of example, a first sensor may be configured or dedicated for ranging operations, and a second sensor may be configured or dedicated for data communication (e.g., for receiving data).

A received light pulse 14512 may be light pulse associated with the ranging system 14500 (e.g., an echo signal, such as a light pulse emitted by the ranging system 14500 and reflected back towards the ranging system), e.g. the received light pulse 14512 may be an own light pulse. Alternatively, the received light pulse 14512 may be light pulse associated with another source (e.g., another ranging system, such as another LIDAR Sensor System), e.g. the received light pulse 14512 may be an alien light pulse. The received light pulse 14512 may have the same properties and/or a same configuration as a light pulse 14508 (e.g., as an emitted light pulse). The received light pulse 14512 may have a pulse duration in the range from about 500 ps to about 1 μs, for example from about 1 ns to about 500 ns, for example from about 2 ns to about 50 ns, for example 182 ns (only as an example).

The ranging system 14500 may include one or more processors 14514. The one or more processors 14514 may be configured to demodulate (e.g., to decode or to interpret) the received signal. The demodulation may determine (e.g., provide) a demodulated signal. Illustratively, one or more processors 14514 may be configured to extract data from the received signal (or from the received light pulse 14512). As an example, the received signal may include safety-related data. The safety-related data may include Automotive Safety Integrity Level (ASIL) data and/or may be in accordance with ASIL regulations. Additionally or alternatively, the received signal may include security-related data. The security-related data may include cryptographic information (e.g., one or more cryptographic keys and/or authentication data).

The one or more processors 14514 may be configured to analyze the received signal, e.g. to determine one or more properties of the received signal (e.g., of a waveform of the received signal). Illustratively, the one or more processors 14514 may be configured to demodulate the received signal to determine the demodulated signal by determining (e.g., calculating) a difference of a waveform of the received signal (e.g., a modified waveform of the received signal) with respect to a predefined waveform. The difference may be provided, for example, by a modification of a waveform of the received light pulse performed by a signal modulator of another ranging system (e.g., another LIDAR Sensor System). By way of example, the one or more processors 14514 may be configured to carry out an analysis of the received signal in the frequency—domain, e.g. to perform a Fast Fourier Transform on the received signal. Illustratively, the one or more processors 14514 may be configured to demodulate the received signal by determining a frequency-domain signal associated with the waveform of the received signal. The one or more processors 14514 may be configured to determine a difference between the frequency-domain signal associated with the received signal (illustratively, with the waveform of the received signal, e.g. the waveform of the received light pulse 14512) and the frequency-domain signal associated with the predefined waveform.

The one or more processors 14514 may be configured to demodulate the received signal by determining one or more properties of the received signal.

The one or more processors 14514 may be configured to demodulate the received signal by determining an amplitude of the (e.g., modified) waveform of the received signal (illustratively, an amplitude of the received light pulse 14512). The one or more processors 14514 may be configured to determine the amplitude of the waveform of the received signal with respect to the predefined waveform (e.g., a difference between the amplitude of the waveform of the received signal and the amplitude of the predefined waveform).

By way of example, the one or more processors 14514 may be configured to demodulate the received signal by determining (e.g., identifying and/or characterizing) one or more hump-like structure elements in the waveform of the received signal (e.g., of at least one hump-like structure element, or more than one hump-like structure element, or all the hump-like structure elements). Illustratively, the one or more processors 14514 may be configured to demodulate the received signal by determining the presence and/or the properties (e.g., shape characteristics, partial waveforms, rise slope, decay slope, depth) of the one or more hump-like structure elements. As an example, the one or more processors 14514 may be configured to demodulate the received signal by determining a position (e.g., a center position) of the one or more hump-like structure elements. As another example, to the one or more processors 14514 may be configured to demodulate the received signal by determining the first portion and/or the second portion of a hump-like structure element (e.g., the slope and/or the time duration). Illustratively, the one or more processors 14514 may be configured to demodulate the received signal by determining a rise slope and/or a decay slope of a is hump-like structure element.

The one or more processors 14514 may be configured to demodulate the received signal by determining a duration (e.g., a pulse width) of the waveform of the received signal. The one or more processors 14514 may be configured to determine the duration of the waveform of the received signal with respect to the predefined waveform (e.g., a difference between the duration of the waveform of the received signal and the duration of the predefined waveform).

The one or more processors 14514 may be configured to demodulate the received signal by determining one or more properties of a first portion and/or a second portion of the received signal (illustratively, of the received light pulse 14512, e.g. of the waveform of the received signal or light pulse 14512). The first portion and the second portion may have approximately the same time duration. Alternatively, the first portion and the second portion may have different time duration.

By way of example, the one or more processors 14514 may be configured to perform the demodulation (illustratively, to demodulate the received signal) by determining the waveform of the received signal to determine (e.g., identify or calculate) higher frequency-domain components associated with the second portion than with the first portion.

The one or more processors 14514 may be configured to determine a higher frequency component in the frequency-domain associated with the second portion than any frequency component in the frequency-domain associated with the first portion. By way of example, the second portion may have a steeper slope with respect to the first portion. Stated in another fashion, the slope in the second portion of the received signal may be steeper than any slope in the first portion of the received signal. As an example, the first portion may have a linear partial waveform or a sinusoidal partial waveform and the second portion may have an exponential partial waveform (or a Gaussian partial waveform). As another example, the first portion may have a sinusoidal partial waveform and the second portion may have a linear partial waveform.

Additionally or alternatively, the one or more processors 14514 may be configured to determine a lower frequency component in the frequency-domain associated with the second portion than any frequency component in the frequency-domain associated with the first portion. By way of example, the second portion may have a less steep slope with respect to the first portion. Stated in another fashion, the slope in the second portion of the received signal may be less steep than any slope in the first portion of the received signal. As an example, the second portion may have a linear partial waveform or a sinusoidal partial waveform and the first portion may have an exponential partial waveform (or a Gaussian partial waveform). As another example, the second portion may have a sinusoidal partial waveform and the first portion may have a linear partial waveform.

FIG. 145C shows a graph 14516 including a plurality of waveforms. For the sake of clarity of representation, the second waveform 14520 and the fourth waveform 14524 are represented with a shift (e.g., 10 ns) with respect to the first waveform 14518 and the third waveform 14522. It is understood that the waveforms or the combinations of partial waveforms illustrated in FIG. 145C are chosen only as an example, and also other waveforms or combinations of waveforms may be provided.

A waveform (or a partial waveform) may be any waveform (illustratively, may have any shape or shape characteristics) that may be generated by the ranging system 14500 (e.g., by the components of the ranging system 14500, such as by a charge/discharge device coupled with the light source 42).

A waveform may have a first portion and a second portion having a same shape characteristics. As an example, a (e.g., first) waveform is may be a sinusoidal waveform 14518, e.g. a waveform may have a sinusoidal first portion and a sinusoidal second portion. As another example, a (e.g., third) waveform may be an exponential waveform 14522, e.g. a waveform may have an exponential first portion and an exponential second portion.

A waveform may have a first portion and a second portion having different shape characteristics. As an example, a (e.g., second) waveform 14520 may have a sinusoidal first portion and an exponential second portion. As another example, a (e.g., fourth) waveform 14524 may have a linear first portion and a sinusoidal second portion.

The predefined waveform may be selected among the possible waveforms for the ranging system 14500. By way of example, the predefined waveform may be the sinusoidal waveform 14518.

FIG. 145D shows a communication system 14526 in a schematic representation in accordance with various embodiments.

The ranging system 14500 may be included in a communication system 14526, e.g. may be used for optical communication in the communication system 14526.

The communication system 14526 may include a radio communication device 14528 (also referred to as radio mobile device). The radio communication device 14528 may include a data encoder 14530. The data encoder 14530 may be configured to encode data to be transmitted in accordance with a mobile radio communication protocol. The radio communication device 14528 may include a radio transmitter 14532 (e.g., a mobile radio transmitter). The radio transmitter 14532 may be configured to transmit the encoded data in accordance with the mobile radio communication protocol (e.g., in accordance with a standardized mobile radio communication protocol). The encoded data may be encrypted and/or digitally signed using one or more cryptographic keys transmitted via the ranging system 14500 (illustratively, similar to a two-factor authentication).

FIG. 145E shows an electrical diagram of a possible circuit for creating a current waveform leading to a laser light pulse with shapes as shown for example in FIG. 145C, FIG. 147A, FIG. 147D, FIG. 147G, FIG. 148A, FIG. 148B, FIG. 149A, FIG. 149B, and FIG. 149D and as described herein. The laser pulse may be emitted by the laser diode 14550. The energy of such laser pulse may be mainly provided by a capacitor 14552. The capacitor 14552 may be discharged into the laser diode through a controllable resistor 14560. The controllable resistor 14560 may be controlled via a waveshape control 14564 (also referred to as waveshape controller). The waveshape control 14564 may be configured to modulate the voltage provided to a control input 14560*g* of the controllable resistor 14560, thereby shaping the current through the laser diode and hence the emitted laser light pulse. The capacitor 14552 may be charged by a charging circuit 14570 (also referred to as capacitor charging circuit 14570). There may be numerous ways to implement a capacitor charging circuit. A very simple one consisting of a controllable DC source 14574 and a charging resistor 14572 is shown in FIG. 145E, only as an example. More advanced and energy efficient charging circuits, e.g. based on switch mode power conversion may be employed instead. The voltage of the DC source 14574 may be controlled by the waveshape control 14564 (not shown in FIG. 145E). Depending on the desired amplitude of the laser light pulse the voltage of the controllable DC source may be set. The higher the amplitude of the light the higher may be the voltage set by the waveshape control. A lookup-table may be employed as part of the waveshape control translating the desired light amplitude into the respective set voltage in accordance to the individual components used in the respective implementation.

FIG. 145F shows specific implementation of the basic circuit shown in FIG. 145E, as another example, in which the controlled resistor may be implemented by a MOSFET (Metal-oxide field effect transistor) which may be based on Si (silicon), GaN (gallium-nitrite) or SiC (silicon carbide) semiconductor technology. The laser diode 14550 may include a structure in which the cathode may be electrically connected with the metal housing of the device which may be mounted on a heatsink. To achieve very good thermal properties allowing for good cooling of the laser diode 14550, the cathode of the laser diode may be not only thermally but also electrically connected to a metal heatsink. As the heatsink may be connected to ground 14554, the waveshape control 14564 providing a controlled voltage between a gate terminal 14562*g* and a source terminal 14562*s* of the transistor 14562 may be implemented as electrically isolated circuit, also known as "floating gate driver", thereby avoiding any electrical ground loops.

FIG. 145G shows another example of a circuit for creating a current waveform leading to a laser light pulse with shapes as shown for example in FIG. 145C, FIG. 147A, FIG. 147D, FIG. 147G, FIG. 148A, FIG. 148B, FIG. 149A, FIG. 149B, and FIG. 149D and as described herein. The circuit may be similar in construction and working principle with the circuit shown in FIG. 145F. However, instead of a single capacitor-transistor-pair, the circuit may include multiple transistors 14562*a*, 14562*b*, 14562*c*, etc. and multiple capacitors 14552*a*, 14552*b*, 14552*c*, etc. forming transistor-capacitor pairs. The transistor-capacitor pairs may be all connected in parallel and may be all able to individually provide electric power to the laser diode 14550. While the i-th transistor 14562*i* is conducting, energy may be provided to the laser diode 14550 and the respective i-th capacitor 14552*i* may be discharged. The charging of the capacitors may be performed by the charging circuits 14570*a*, 14570*b*, 14570*c*, etc. each consisting of a controllable DC source 14574*a*, 14574*b*, 14574*c*, etc. and respective charging resistors 14572*a*, 14572*b*, 14572*c*, and so on. The charging voltage for each capacitor 14570*i* may be individually set through the respective controllable DC source 14574*i* by the waveshape control 14564 (not shown in FIG. 145G).

The control of i-th transistor 14562*i* by the waveshape control may be done in the same way as for the circuit shown in FIG. 145F, where the gate-source-voltage may be modulated in a way to create a laser diode current waveform leading to the desired laser pulse light waveform. However here any gate-source control pattern may be a valid gate-source control pattern (consisting of a particular gate-source voltage waveform a for the transistor 14562*a*, a particular gate-source voltage waveform b for the transistor 14562*b*, a particular gate-source voltage waveform c for the transistor 14562*c*, etc.), wherein the sum of the drain currents of all the transistors 14562*a*, 14562*b*, 14562*c*, creating the laser diode current waveform may lead to the desired laser pulse light waveform. An "obvious" gate-source control pattern, which may also be referred to as "standard control pattern", may be the one pattern where each of the i transistors carries the i-th fraction of the laser diode current, which in case of identical variable DC sources 14570*i*, identical set voltages of the respective DC voltage sources, identical capacitors 14552*i*, and identical transistors 14562*i* may be or correspond to identical gate-source voltage waveforms being in phase which each other (no time differences/delays between the different-gate source voltages from a transistor to any other transistor).

The described standard control pattern (and/or other conceivable control patterns) may utilize the transistors 14562*a*, 14562*b*, 14562*c*, etc. as controllable resistors, in accordance to the basic function described in relation to FIG. 145E. In other conceivable control patterns, referred to as "additive control patterns", however, the transistors 14562*a*, 14562*b*, 14562*c*, etc. may be used as switches and turned either fully ON or fully OFF. This may provide that the energy held in the capacitors may be completely "added" into the laser pulse. This may be different as compared to the standard control pattern and other conceivable control patterns, referred to as "subtractive control patterns", which may utilize the transistors 14562*a*, 14562*b*, 14562*c*, etc. as controllable resistors, wherein a part of the energy stored in the capacitors may be "subtracted" by the transistors and only the remainder may be added into the laser pulse.

Additive control patterns may provide the advantage of utilizing the circuit in a more energy efficient way compared to the subtractive control patterns. However the laser pulse waveforms which can be created by additive control patterns may not generate any arbitrary waveform of the laser pulse. However, an additive control pattern may be used which creates a laser pulse waveform that comes close to the desired waveform. Selecting the settings of the DC voltage sources as well as waveforms for the individual transistors' gate-source voltages may be implemented in the waveshape control 14564, e.g. based on lookup-tables.

As mentioned, the circuit shown in FIG. 145G employing an additive control pattern may provide the advantage of being more energy efficient compared to the same circuit employing a subtractive control pattern. The circuit shown in FIG. 145G employing an additive control may also be more energy efficient compared to circuits shown in FIG. 145E and FIG. 145F; however, it may include more components and the control implemented in the waveshape control circuit 14564 may be more complex. Depending on the application needs it may be possible to choose a circuit according to the FIG. 145E and FIG. 145F featuring the "subtractive" pulse shaping method or the "additive" pulse shaping method according to FIG. 145G.

It is understood that the circuit diagrams shown in FIG. 145E to FIG. 145G are provided only as an example of possible circuit configurations for providing a light pulse (e.g., a laser pulse) as described herein (e.g., only as an exemplary implementation of light source 42, light source controller 14506, and signal modulator 14510). Other circuit configurations, e.g. including other components and/or designed in a different manner, may also be provided.

FIG. 146 shows a system 14600 including a first vehicle 14602 and a second vehicle 14604 in a schematic representation in accordance with various embodiments.

The first vehicle 14602 may be an example of a first sensor device. The second vehicle 14604 may be an example of a second sensor device.

The first vehicle 14602 and/or the second vehicle 14602 may include a LIDAR Sensor System (e.g., as an example of ranging system 14500). Illustratively, FIG. 146 may show the emitter side and the receiver side of the LIDAR Sensor System of the first vehicle 14602, and the receiver side of the LIDAR Sensor System of the second vehicle 14604.

The LIDAR Sensor System of the first vehicle 14602 may include, on the emitter side, a LIDAR trigger 14606 (the LIDAR trigger 14608 may be an example of the light source controller 14506). The LIDAR Sensor System may include a pulse generator 14608 (the pulse generator 14608 may be an example of the signal modulator 14510). The LIDAR Sensor System may include a laser source 14610 (the laser source 14610 may be an example of the light source 42). The LIDAR Sensor System may include a data bank 14612 (the data bank 14612 may be an example of a memory to which the LIDAR Sensor System may have access).

The LIDAR Sensor System of the first vehicle 14602 may be configured to emit one or more laser pulses 14614 having a predefined waveform. The pulse generator 14608 may be configured to modify the predefined waveform of at least one laser pulse 14614 such that the at least one laser pulse 14614 has a modified waveform different from the predefined waveform. By way of example, the pulse generator 14608 may retrieve from the data bank a modulation to be applied to the predefined waveform of the at least one laser pulse 14614 to encode desired data or information on the at least one laser pulse 14614 (e.g., corresponding instructions and/or parameters to be used to modify the predefined waveform of the at least one laser pulse 14614). Illustratively, the first vehicle 14602 may transmit data or information to the second vehicle 14604 by encoding (e.g., modulating) data onto the at least one laser pulse 14614.

The LIDAR Sensor System of the second vehicle 14604 may be configured to receive one or more laser pulses 14614, e.g., emitted by the first vehicle 14602. The LIDAR Sensor System may include a photo detector 14616 (the photo detector 14616 may be an example of the sensor 52). The LIDAR Sensor System may include a demodulator 14620 (the demodulator 14620 may be an example of the one or more processors 14514). The demodulator 14620 may be configured to perform data retrieval. Illustratively, the demodulator 14620 may be configured to demodulate a received signal generated by the photo detector 14616 to extract data 14620 from the received laser pulses 14614 (e.g., safety-related data or security-related data, for example a vehicle identification number or an encryption key).

The LIDAR Sensor System of the first vehicle 14602 may have same or similar components on the receiver side as the LIDAR Sensor System of the second vehicle 14604. By way of example, the LIDAR Sensor System of the first vehicle 14602 may include a photo detector 14622 and a demodulator 14624. The demodulator 14624 may be configured to determine one or more data 14626 from a received laser pulse. By way of example, the demodulator 14624 may be configured to determine a time-of-flight from a received laser pulse, e.g. in case the received laser pulse is an echo signal (illustratively, an emitted laser pulse 14614 reflected back towards the vehicle 14602). The demodulator 14624 may be configured to determine a distance to an object from the determined time-of-flight (for example, a distance from the second vehicle 14604). Illustratively, the first vehicle 14602 may use the emitted laser pulses 14614 for ranging measurements and/or for data communication.

FIG. 147A to FIG. 147C show a modulation and demodulation process in accordance with various embodiments.

FIG. 147A shows a graph 14702 in the time-domain. The graph 14702 may include, in this exemplary case, four different waveforms having a time duration, $t_{signal}$, of 182 ns (e.g., with different shape characteristics in the first portion and/or in the second portion). A first waveform 14704 may have a sinusoidal rise and a sinusoidal decay. A second waveform 14706 may have a sinusoidal rise and an exponential decay. A third waveform 14708 may have a linear rise and a sinusoidal decay. A fourth waveform 14710 may have an exponential rise and an exponential decay.

FIG. 147B shows a graph 14712 in the frequency-domain (e.g., obtained via FFT). For the sake of clarity of representation, frequency-domain components (e.g., peaks) below 5% of the maximum frequency-domain component are not shown in the graph 14712. The graph 14712 may include four different frequency-domain signals. Each frequency-domain signal may be associated with a corresponding waveform shown in the graph 14702. Illustratively, each waveform may have corresponding peaks (e.g., a unique set of peaks) associated therewith. By way of example, the peaks at low frequency may be associated with the waveforms having sinusoidal and linear partial waveforms. The peaks at intermediate frequency may be associated with the waveforms having sinusoidal partial waveform but no linear partial waveform. The peaks at high frequency may be associated with the waveforms having exponential partial waveforms.

FIG. 147C shows a table 14714 describing the presence or absence of a peak at a certain frequency for each waveform shown in FIG. 147A. A "Y" in the table 14714 may describe a presence of a peak at the respective frequency. An "N" in the table 14714 may describe an absence of a peak at the respective frequency.

By way of example, the waveform 14704 may be considered as the predefined waveform (e.g., as reference waveform). The other waveforms 14706 14708 14710 may be distinguished from the reference waveform 14704 (e.g., from the different peaks), e.g. may be respective modified waveforms, for example the waveform 14708 may be distinguishable via the absence of two frequencies (e.g., via the absence of a peak at 10.99 MHz and at 12.21 MHz). The waveform 14708 may be distinguished from the waveform 14710 based on the peak at 12.21 MHz for waveform 14710. The ability to distinguish the three waveforms may allow to encode 3 bits.

FIG. 147D to FIG. 147I show a modulation and demodulation process in accordance with various embodiments.

FIG. 147D shows a graph 14716 in the time-domain. The graph 14716 may include, in this exemplary case, four different waveforms having a time duration, $t_{signal}$, of 182 ns. Each waveform may include three humps. A first waveform 14718 may include humps each having a sinusoidal rise and a sinusoidal decay. A second waveform 14720 may include humps each having a sinusoidal rise and an exponential decay. A third waveform 14722 may include humps each having a linear rise and a sinusoidal decay. A fourth waveform 14724 may include humps each having a linear rise and an exponential decay.

FIG. 147E shows a graph 14726 in the frequency-domain (e.g., obtained via FFT). For the sake of clarity of representation, frequency-domain components (e.g., peaks) below 5% of the maximum frequency-domain component are not shown in the graph 14726. The graph 14726 may include four different frequency-domain signals, each associated with a corresponding waveform shown in the graph 14716.

FIG. 147F shows a table 14728 describing the presence or absence of a peak at a certain frequency for each waveform shown in FIG. 147D. The exponential decay of the second waveform 14720 may be distinguished from the sinusoidal decay of the first waveform 14718 based on the higher frequency components associated with the second waveform 14720 (e.g., above 20 MHz in this case). For the fourth waveform 14724, the higher frequencies may be associated with the exponential response, e.g. the exponential decay (e.g., including an additional peak at frequency 34.18 MHz). The additional peak associated with the fourth waveform 14724 may be related to higher compression of the waveform provided by the combination of linear and exponential responses with respect to the sinusoidal rise of the second waveform 14720.

FIG. 147G to FIG. 147I show a modulation and demodulation process in accordance with various embodiments.

FIG. 147G shows a graph 14730 in the time-domain. The graph 14730 may include, in this exemplary case, six different waveforms having a time duration, $t_{signal}$, of 182 ns. Each waveform may include three humps. The first rise and the last decay may be sinusoidal for each waveform (illustratively, the first rise and the last decay may be kept to a sinusoidal response). A first waveform 14732 may include humps having a sinusoidal rise and a sinusoidal decay. A second waveform 14734 may include humps having a sinusoidal rise and a linear decay. A third waveform 14736 may include humps having a sinusoidal rise and an exponential decay. A fourth waveform 14738 may include humps having one linear decay and one exponential decay. A fifth waveform 14740 may include humps having one linear decay, one exponential decay, and one linear rise. A sixth waveform 14742 may include humps having one linear decay, one exponential decay, and one exponential rise.

FIG. 147H shows a graph 14744 in the frequency-domain (e.g., obtained via FFT). For the sake of clarity of representation, frequency-domain components (e.g., peaks) below 5% of the maximum frequency-domain component are not shown in the graph 14744. The graph 14744 may include six different frequency-domain signals, each associated with a corresponding waveform shown in the graph 14730.

FIG. 147I shows a table 14746 describing the presence or absence of a peak at a certain frequency for each waveform shown in FIG. 147H. The first waveform 14732 may be considered as reference waveform. The second waveform 14734 may be distinguished from the waveform 14732 by the absence of two additional frequencies. The third waveform 14736 may be distinguished by the presence at 12.21 MHz and higher frequencies at 21.97 MHz and 23.19 MHz and the absence at 10.99 MHz. The fourth waveform 14738 (illustratively, a combination of the second waveform 14734 and the third waveform 14736) may be distinguished from the third waveform 14736 with the absence of the peaks at 12.21 MHz and 23.19 MHz, and with the presence of the peak at 10.99 MHz. The fifth waveform 14740 may add a linear rise response. The linear response may represent a compression and may generate response peaks in all frequencies except 20.75 MHz. The signal associated with the fifth waveform 14740 may be different from all other signals. In the sixth waveform 14742 the linear rise of the fifth waveform 14740 may be substituted with an exponential rise. This may create a rarefaction of the last rise response which may eliminate three peaks and may add an additional peak at 20.75 MHz with respect to the fifth waveform 14740.

The table 14746 may illustrate that six bits may be coded on a single 3-hump pulse (e.g., a single 3-hump waveform). In this example a maximum of three rises/decays, out of total of four may be used to modulate the signal versus the reference. The additional rise/decay available may be further modulated with the same response to deepen the frequency peaks. This may increase the detection reliability. Alternatively, the additional rise/decay available may be further modulated to increase the number of bits from three to four for a 3-hump pulse.

FIG. 148A to FIG. 148E show a modulation and demodulation process in accordance with various embodiments.

FIG. 148A shows a graph 14802 including the six waveforms illustrated in the graph 14730 in FIG. 147G, in which noise was introduced (illustratively, the six waveforms in the graph 14802 correspond to a noisy version of the six waveforms illustrated in the graph 14730). FIG. 148B shows an oscilloscope image 14804 of the noisy signal of the sixth waveform 14742.

The frequency-domain response with a higher level of noise may be directly processed (e.g., with a RF spectrum analyzer). FIG. 148C shows a graph 14806 in the frequency-domain including six signals associated with the six waveforms shown in FIG. 148A and including a large noise floor. A peak detection algorithm may be used to process the frequency-domain response. By way of example, a peak detection algorithm may include an amplitude threshold of 30% the maximum amplitude of the signal and a minimum frequency separation of 2 MHz. The peak detection algorithm may remove the peaks not fulfilling the desired criteria (illustratively, the algorithm may ignore all peaks that do not fit the conditions). FIG. 148D shows a graph 14808 in the frequency-domain after the peak detection algorithm has been applied. Illustratively, the graph 14808 may correspond to a processed (e.g., cleaned) version of the graph 14806.

FIG. 148E shows a table 14810 describing the presence or absence of a peak at a certain frequency for each waveform shown in FIG. 148A. The first waveform 14732 may differ from the second waveform 14734 by a single peak. Similarly, the fourth waveform 14738 may differ from the fifth waveform 14740 by a single peak.

FIG. 149A to FIG. 149E show a modulation and demodulation process in accordance with various embodiments.

FIG. 149A shows a graph 14902 in the time-domain showing the noisy first waveform 14732 (e.g., reference waveform) illustrated in graph 14802 in FIG. 148A. The graph 14902 may include nine waveforms, each corresponding to the noisy first waveform 14732 with a different time shift (e.g., with a time shift corresponding to a different percentage of the total duration of the waveform, e.g. from 0% to 40% with a step size of 5%). FIG. 149B shows an oscilloscope image 14904 of the noisy signal of the first waveform 14732.

FIG. 149C shows a graph 14906 in the frequency-domain showing nine signals associated with the nine waveforms illustrated in the graph 14902 in FIG. 149A. The frequency peaks associated with the different waveforms may be similar in nature.

FIG. 149D shows a graph 14908 including, as an example, two shifted waveforms and corresponding Gaussian fit. The graph 14908 may include the first waveform 14732-0 with a 0% time shift and a corresponding basic Gaussian Fit 14910. The graph 14908 may include the first waveform 14732-1 with a 40% time shift and a corresponding basic Gaussian Fit 14912.

FIG. 149E shows a graph 14914 including a comparison between the correlation of the modulated time shift and the demodulated signal time. The comparison may be illustrated by a first curve 14916 for the non-noisy first waveform 14732 and by a second curve 14918 for the noisy first waveform 14732. The graph 14914 may illustrate a linear correlation for a time shift up to 25% and a saturation behavior thereafter.

Waveforms having different time shifts may represent or be associated with different type of data or information, e.g. with one or more different bits.

Various embodiments as described with reference to FIG. 155B to FIG. 157B may be configured to generate a time modulated laser pulse, e.g. to generate a clean and/or smooth waveform.

Various embodiments as described with reference to FIG. 155B to FIG. 157B may be combined with the embodiments as described with reference to FIG. 145A to FIG. 149E.

Furthermore, various embodiments as described with reference to FIG. 145A to FIG. 149E may include transmitting an identification information of a vehicle using LIDAR, and optionally in addition a velocity of a LIDAR object, in which case the association between the vehicle and the velocity of the LIDAR object is already achieved. This mechanism may also enable a smart contract environment e.g. between two vehicles. This may e.g. allow a temporary prioritization of vehicle within the traffic, e.g. a prioritization of police and/or ambulance over “normal” traffic participants.

In the following, various aspects of this disclosure will be illustrated:

Example 1 ab is a LIDAR Sensor System. The LIDAR Sensor System may include a light source. The LIDAR Sensor System may include a light source controller. The light source controller may be configured to control the light source to emit one or more light pulses each having a predefined first waveform. The LIDAR Sensor System may include a signal modulator. The signal modulator may be configured to modify the predefined first waveform of at least one light pulse to a modified second waveform such that the at least one emitted light pulse has the modified second waveform.

In Example 2ab, the subject-matter of example 1 ab can optionally include that the signal modulator is configured to modify the amplitude and/or the duration of the predefined first waveform of the at least one light pulse.

In Example 3ab, the subject-matter of any one of examples 1 ab or 2ab can optionally include that the signal modulator is configured to modify the shape of the predefined first waveform of the at least one light pulse.

In Example 4ab, the subject-matter of example 3ab can optionally include that the signal modulator is configured to modify the predefined first waveform of the at least one light pulse such that the modified second waveform of the at least one light pulse includes one or more hump-like structure elements.

In Example 5ab, the subject-matter of example 4ab can optionally include that the signal modulator is configured to modify the position of the one or more hump-like structure elements.

In Example 6ab, the subject-matter of any one of examples 4ab or 5ab can optionally include that the signal modulator is configured to modify the rise slope and/or the decay slope of at least one hump-like structure element.

In Example 7ab, the subject-matter of any one of examples 1 ab to 6ab can optionally include that the at least one light pulse has a pulse duration in the range from about 500 ps to about 1 μs, for example from about 1 ns to about 500 ns, for example from about 2 ns to about 50 ns.

In Example 8ab, the subject-matter of any one of examples 1 ab to 7ab can optionally include that the at least one light pulse includes a first portion and a second portion. The signal modulator may be configured to modify the predefined first waveform of the at least one light pulse such that the second portion is associated with a higher frequency component in the frequency-domain with respect to any frequency component in the frequency-domain associated with the first portion.

In Example 9ab, the subject-matter of any one of examples 1 ab to 8ab can optionally include that the at least one light pulse includes a first portion and a second portion. The signal modulator may be configured to generate a slope in the second portion of the at least one light pulse that is steeper than any slope in the first portion of the at least one light pulse.

In Example 10ab, the subject-matter of any one of examples 8ab or 9ab can optionally include that the first portion has a linear partial waveform or a sinusoidal partial waveform. The second portion may have an exponential partial waveform.

In Example 11 ab, the subject-matter of any one of examples 8ab to 10ab can optionally include that the first portion and the second portion have approximately the same time duration.

In Example 12ab, the subject-matter of any one of examples 1 ab to 11 ab can optionally include that the light source includes at least one laser light source.

In Example 13ab, the subject-matter of example 12ab can optionally include that the at least one laser light source includes at least one laser diode.

In Example 14ab, the subject-matter of any one of examples 1ab to 13ab can optionally include that the signal modulator is configured to modulate data onto the at least one light pulse.

In Example 15ab, the subject-matter of any one of examples 1ab to 14ab can optionally include that the signal modulator is configured to modulate safety-related data and/or security-related data onto the at least one light pulse.

In Example 16ab, the subject-matter of any one of examples 1ab to 15ab can optionally include that the signal modulator is configured to to modulate safety-related data onto the at least one light pulse. The safety-related data may be in accordance with Automotive Safety Integrity Level regulations.

In Example 17ab, the subject-matter of any one of examples 1ab to 16ab can optionally include that the signal modulator is configured to is modulate security-related data onto the at least one light pulse. The security-related data may include cryptographic information.

In Example 18ab, the subject-matter of example 17ab can optionally include that the cryptographic information includes one or more cryptographic keys and/or authentication data.

Example 19ab is a LIDAR Sensor System. The LIDAR Sensor System may include a sensor including one or more photo diodes configured to provide a received signal in response to receiving a light pulse. The LIDAR Sensor System may include one or more processors configured to demodulate the received signal to determine a demodulated signal by determining a difference of a waveform of the received signal with respect to a predefined waveform.

In Example 20ab, the subject-matter of example 19ab can optionally include that the difference is provided by a modification of a waveform of the received light pulse performed by a signal modulator of another LIDAR Sensor System.

In Example 21ab, the subject-matter of any one of examples 19ab or 20ab can optionally include that the one or more processors are configured to demodulate the signal by determining an amplitude and/or a duration of the waveform of the received signal with respect to the predefined waveform.

In Example 22ab, the subject-matter of any one of examples 19ab to 21ab can optionally include that the one or more processors are configured to demodulate the signal by determining one or more hump-like structure elements in the waveform of the received signal.

In Example 23ab, the subject-matter of example 22ab can optionally include that the one or more processors are configured to demodulate the signal by determining a position of the one or more hump-like structure elements.

In Example 24ab, the subject-matter of any one of examples 22ab or 23ab can optionally include that the one or more processors are configured to demodulate the signal by determining a rise slope and/or a decay slope of at least one hump-like structure element.

In Example 25ab, the subject-matter of any one of examples 19ab to 24ab can optionally include that the one or more processors are configured to demodulate the received signal by determining a frequency-domain signal associated with the waveform of the received signal.

In Example 26ab, the subject-matter of any one of examples 19ab to 25ab can optionally include that the received light pulse has a pulse duration in the range from about 500 ps to about 1 μs, for example from about 1 ns to about 500 ns, for example from about 2 ns to about 50 ns.

In Example 27ab, the subject-matter of any one of examples 19ab to 26ab can optionally include that the received signal includes a first portion and a second portion. The one or more processors may be configured to perform the demodulation by determining the waveform of the received signal to determine a higher frequency component in the frequency-domain associated with the second portion than any frequency component in the frequency-domain associated with the first portion.

In Example 28ab, the subject-matter of any one of examples 19ab to 27ab can optionally include that the received signal includes a first to portion and a second portion. A slope in the second portion of the received signal may be steeper than any slope in the first portion of the received signal.

In Example 29ab, the subject-matter of any one of examples 27ab or 28ab can optionally include that the first portion has a linear partial is waveform or a sinusoidal partial waveform. The second portion may have an exponential partial waveform.

In Example 30ab, the subject-matter of any one of examples 27ab to 29ab can optionally include that the first portion and the second portion have approximately a same time duration.

In Example 31ab, the subject-matter of any one of examples 19ab to 30ab can optionally include that the received signal includes safety-related data and/or security-related data.

In Example 32ab, the subject-matter of any one of examples 19ab to 31ab can optionally include that the received signal includes safety-related data. The safety-related data may be in accordance with Automotive Safety Integrity Level regulations.

In Example 33ab, the subject-matter of any one of examples 19ab to 32ab can optionally include that the received signal includes security-related data. The security-related data may include cryptographic information.

In Example 34ab, the subject-matter of example 33ab can optionally include that the cryptographic information includes one or more cryptographic keys and/or authentication data.

Example 35ab is a communication system. The communication system may include a radio communication device. The radio communication device may include a data encoder configured to encode data to be transmitted in accordance with a mobile radio communication protocol and a mobile radio transmitter configured to transmit the encoded data in accordance with the mobile radio communication protocol. The communication system may include a LIDAR Sensor System. The LIDAR Sensor System may include a light source, a light source controller configured to control the light source to emit at least one light pulse, and a signal modulator configured to modulate safety-related data and/or security-related data onto the at least one light pulse.

In Example 36ab, the subject-matter of example 35ab can optionally include that the safety-related data are in accordance with Automotive Safety Integrity Level regulations.

In Example 37ab, the subject-matter of any one of examples 35ab or 36ab can optionally include that the security-related data includes cryptographic information.

In Example 38ab, the subject-matter of example 37ab can optionally include that the cryptographic information includes one or more cryptographic keys and/or authentication data.

In Example 39ab, the subject-matter of any one of examples 35ab to 38ab can optionally include that the encoded data are encrypted or digitally signed using one or more cryptographic keys transmitted via the LIDAR Sensor System.

Example 40ab is a method of operating a LIDAR Sensor System. The method may include emitting one or more light pulses having a predefined first waveform. The method may include modifying the predefined first waveform of at least one light pulse such that the at least one light pulse has a modified second waveform.

In Example 41ab, the subject-matter of example 40ab can optionally include that modifying the predefined first waveform includes modifying the amplitude and/or the duration of the predefined first waveform of the at least one light pulse.

In Example 42ab, the subject-matter of any one of examples 40ab or 41ab can optionally include that modifying the predefined first waveform includes modifying the shape of the predefined first waveform of the at least one light pulse.

In Example 43ab, the subject-matter of example 42ab can optionally include that modifying the predefined first waveform includes introducing one or more hump-like structure elements in the predefined first waveform of the at least one light pulse.

In Example 44ab, the subject-matter of example 43ab can optionally include that modifying the predefined first waveform includes modifying the position of the one or more hump-like structure elements.

In Example 45ab, the subject-matter of any one of examples 43ab or 44ab can optionally include that modifying the predefined first waveform includes modifying the rise slope and/or the decay slope of at least one hump-like structure element.

In Example 46ab, the subject-matter of any one of examples 40ab to 45ab can optionally include that the at least one light pulse is emitted having a pulse duration in the range from about 500 ps to about 1 μs, for example from about 1 ns to about 500 ns, for example from about 2 ns to about 50 ns.

In Example 47ab, the subject-matter of any one of examples 40ab to 46ab can optionally include that the at least one light pulse includes a first portion and a second portion. The predefined first waveform of the at least one light pulse may be modified such that the second portion is associated with a higher frequency component in the frequency domain with respect to any frequency component in the frequency domain associated with the first portion.

In Example 48ab, the subject-matter of any one of examples 40ab to 47ab can optionally include that the at least one light pulse includes a first portion and a second portion. A slope may be generated in the second portion of the at least one light pulse that is steeper than any slope in the first portion of the at least one light pulse.

In Example 49ab, the subject-matter of any one of examples 47ab or 48ab can optionally include that the first portion has a linear partial waveform or a sinusoidal partial waveform. The second portion may have an exponential partial waveform.

In Example 50ab, the subject-matter of any one of examples 47ab to 49ab can optionally include that the first portion and the second portion have approximately a same time duration.

In Example 51ab, the subject-matter of any one of examples 40ab to 50ab can optionally include that the at least one light pulse is emitted as at least one laser light pulse.

In Example 52ab, the subject-matter of example 51ab can optionally include that the at least one laser light pulse is emitted as at least one laser diode light pulse.

In Example 53ab, the subject-matter of any one of examples 40ab to 52ab can optionally include modulating data onto the at least one light pulse.

In Example 54ab, the subject-matter of any one of examples 40ab to 53ab can optionally include modulating safety-related data and/or security-related data onto the at least one light pulse.

In Example 55ab, the subject-matter of any one of examples 40ab to 54ab can optionally include modulating safety-related data onto the at least one light pulse. The safety-related data may be in accordance with Automotive Safety Integrity Level regulations.

In Example 56ab, the subject-matter of any one of examples 40ab to 55ab can optionally include modulating security-related data onto the at least one light pulse. The security-related data may include cryptographic information.

In Example 57ab, the subject-matter of example 56ab can optionally include that the cryptographic information includes one or more cryptographic keys and/or authentication data.

Example 58ab is a method of operating a LIDAR Sensor System. The method may include a sensor including one or more photo diodes providing a received signal in response to receiving a light pulse. The method may include demodulating the received signal to determine a demodulated signal by determining a difference of a waveform of the received signal with respect to a predefined waveform.

In Example 59ab, the subject-matter of example 58ab can optionally include that the difference is provided by a modification of a waveform of the received light pulse performed by a signal modulator of another LIDAR Sensor System.

In Example 60ab, the subject-matter of example any one of examples 58ab or 59ab can optionally include that demodulating the signal includes determining an amplitude and/or a duration of the waveform of the received signal with respect to the predefined waveform.

In Example 61ab, the subject-matter of any one of examples 58ab to 60ab can optionally include that demodulating the signal includes determining one or more hump-like structure elements in the waveform.

In Example 62ab, the subject-matter of example 61ab can optionally include that demodulating the signal includes determining the position of the one or more hump-like structure elements.

In Example 63ab, the subject-matter of any one of examples 61ab or 62ab can optionally include that demodulating the signal includes determining the rise slope and/or the decay slope of at least one hump like structure element.

In Example 64ab, the subject-matter of any one of examples 58ab to 63ab can optionally include that demodulating the signal includes determining a frequency-domain signal associated with the waveform of the received signal.

In Example 65ab, the subject-matter of any one of examples 58ab to 64ab can optionally include that the received light pulse has a pulse duration in the range from about 500 ps to about 1 μs, for example from about 1 ns to about 500 ns, for example from about 2 ns to about 50 ns.

In Example 66ab, the subject-matter of any one of examples 58ab to 65ab can optionally include that the received signal includes a first portion and a second portion. The demodulation may be performed by determining the waveform of the received signal to determine a higher frequency component in the frequency domain associated with the second portion than any frequency component in the frequency domain associated with the first portion.

In Example 67ab, the subject-matter of any one of examples 58ab to 66ab can optionally include that the received signal includes a first to portion and a second portion. A slope in the second portion of the received signal may be steeper than any slope in the first portion of the received signal.

In Example 68ab, the subject-matter of any one of examples 66ab or 67ab can optionally include that the first portion has a linear partial is waveform or a sinusoidal partial waveform. The second portion may have an exponential partial waveform.

In Example 69ab, the subject-matter of any one of examples 66ab to 68ab can optionally include that the first portion and the second portion have approximately a same time duration.

In Example 70ab, the subject-matter of any one of examples 58ab to 69ab can optionally include that the received signal includes safety-related data and/or security-related data.

In Example 71ab, the subject-matter of any one of examples 58ab to 70ab can optionally include that the received signal includes safety-related data. The safety-related data may be in accordance with Automotive Safety Integrity Level regulations.

In Example 72ab, the subject-matter of any one of examples 58ab to 71ab can optionally include that the received signal includes security-related data. The security-related data may include cryptographic information.

In Example 73ab, the subject-matter of example 72ab can optionally include that the cryptographic information includes one or more cryptographic keys and/or authentication data.

Example 74ab is a method of operating a communication system. The method may include a first method of operating a radio communication device. The first method may include encoding data to be transmitted in accordance with a mobile radio communication protocol. The first method may include transmitting the encoded data in accordance with the mobile radio communication protocol. The method may include a second method of operating a LIDAR Sensor System. The second method may include emitting at least one light pulse. The second method may include modulating safety-related data and/or security-related data onto the at least one light pulse.

In Example 75ab, the subject-matter of example 74ab can optionally include that the safety-related data are in accordance with Automotive Safety Integrity Level regulations.

In Example 76ab, the subject-matter of any one of examples 74ab or 75ab can optionally include that the security-related data includes cryptographic information.

In Example 77ab, the subject-matter of example 76ab can optionally include that the cryptographic information includes one or more cryptographic keys and/or authentication data.

In Example 78ab, the subject-matter of any one of examples 74ab to 77ab can optionally include that the encoded data are encrypted or digitally signed using one or more cryptographic keys transmitted the LIDAR Sensor System.

Example 79ab is a computer program product including a plurality of program instructions that may be embodied in non-transitory computer readable medium, which when executed by a computer program device of a LIDAR Sensor System of any one of examples 1 ab to 34ab cause the LIDAR Sensor System to execute the method of any one of the examples 40ab to 73ab.

Example 80ab is a data storage device with a computer program that may be embodied in non-transitory computer readable medium, adapted to execute at least one of a method for a LIDAR Sensor System of any one of the above method examples, a LIDAR Sensor System of any one of the above LIDAR Sensor System examples.

Example 81ab is a computer program product, including a plurality of program instructions that may be embodied in non-transitory computer readable medium, which when executed by a computer program device of a communication system of any one of examples 35ab to 39ab cause the communication system to execute the method of any one of the examples 74ab to 78ab.

Example 82ab is a data storage device with a computer program that may be embodied in non-transitory computer readable medium, adapted to execute at least one of a method for communication system of any one of the above method examples, a communication system of any one of the above communication system examples.

An optical ranging sensor or an optical ranging system may be based on direct time-of-flight measurements. The time-of-flight may be measured directly, for example by considering (e.g., measuring) the timing between an emitted pulse and a received pulse associated thereto. The time-of-flight may be measured indirectly, wherein some intermediate measure (e.g., a phase shift of a modulated signal) may be used to measure or to calculate the time-of-flight. A direct time-of-flight sensor or a direct time-of-flight system (e.g., a sensor system) may be realized according to a predefined scanning scheme. By way of example, the predefined scanning scheme may be a Flash-LIDAR with diffusive emission or multi-beam emission. As another example, the predefined scanning scheme may be or may include scanning using a two-dimensional emitter array. As a further example, the predefined scanning scheme may be a scanning LIDAR. The scanning LIDAR may include, for example, a mechanically spinning head and/or a two-dimensional MEMS mirror. The scanning LIDAR may be based on a hybrid approach, e.g. the scanning LIDAR may be configured as a hybrid-Flash system, where the scanning may be performed column-wise or row-wise.

Crosstalk may negatively affect ranging and/or ranging performance. The crosstalk may be understood as a phenomenon by which a signal transmitted on one circuit or channel creates an undesired effect in another circuit or channel. Alternatively, crosstalk-related signals may also be referred to as interfering signals or conflicting signals. By way of example, crosstalk may occur between LIDAR systems (e.g., between LIDAR systems of different traffic participants, for example of different vehicles). Such crosstalk may have the effect that a system (e.g., a LIDAR system of a vehicle) may not identify as "alien" or "extraneous" signal the signal from another system (e.g., from a LIDAR system of another vehicle, such as another car). Furthermore, such crosstalk may cause impairments, for example due to signal collision. A single-pulse direct time-of-flight LIDAR system may be particularly affected from such crosstalk.

As another example, crosstalk may occur between concurrently operating LIDAR systems and sub-systems (e.g., included or arranged in a same vehicle). The crosstalk between the systems may negatively affect ranging performance. By way of example, parallel firing LIDAR systems may not be distinguished. As another example, LIDAR sub-systems or even individual sensor pixels may not be distinguished. Additional coordination may mitigate or substantially prevent such crosstalk. However, such coordination may increase system complexity and cause overheads or other drawbacks (for example by introducing idle times or "blackout" times).

In addition, the update rate of a LIDAR system may be negatively impacted by one or more usually fixed parameters, such as fixed ranging intervals and/or waiting times or "blackout" times (e.g., a LIDAR system may usually incorporate some waiting time for a time-of-flight signal to return). A blackout time may be understood as a time between the completion of a measurement window and the start of the next measurement window. During the blackout time no (e.g., new) time-of-flight signal may be emitted (illustratively, no LIDAR signal may be emitted while waiting for the previous LIDAR signal to return). Thus, a LIDAR system may usually have a fixed update rate.

Various embodiments may be based on configuring a light signal (e.g., a LIDAR signal, for example including a ranging signal) such that crosstalk-related effects may be reduced or substantially eliminated. The light signal may be configured (e.g., it may have a frame structure) such that a ranging system (e.g., a LIDAR system, such as the LIDAR Sensor System 10) may distinguish between an own light signal (e.g., a light signal emitted by the ranging system) and an alien light signal (e.g., a light signal emitted by another ranging system).

In various embodiments, data communication may be added on-top of or in addition to the light signal (e.g., in the light signal having the frame structure). The light signal may be configured (e.g., modulated or encoded) to carry data (illustratively, to transmit information). The light signal may be configured such that the data communication does not impact ranging performance and does not introduce additional crosstalk. The added data communication may be configured to transport a meaningful amount of data in a short time (e.g., in view of the high mobility of traffic participants). By way of example, the data may include one or more instructions or commands directed to another ranging system. The data communication may be implemented, for example, by means of a synergetic usage of one or more hardware components of the ranging system. The data communication may be computationally tractable at the decoder side (e.g., it may be decoded by the ranging system receiving the data). The receiving ranging system may be configured to test the data integrity.

In various embodiments, one or more concepts related to digital communication may be applied to a ranging system. Illustratively, from a system and component perspective a ranging system may also be used for data transmission.

Digital communication may be described as the transfer of data (e.g., a digital bit-stream or a digitized analog signal) over a point-to-point communication channel or point-to-multipoint communication channel. By way of example, digital communication may include transmitting data represented as a light signal (e.g., infrared light or visible light) over an optical wireless channels (e.g., over the air). The data to be transmitted may be mapped onto a signal and/or onto a sequence of pulses (e.g., of time-domain baseband pulses). Such mapping may be referred to as line coding or digital modulation. Illustratively, the data (e.g., a message to be transmitted) may be represented by a sequence of pulses. The mapping may define the shape of the pulse in the time-domain, for example in combination with a pulse shaping filter. An example of digital communication may be Optical Wireless Communication (OWC) (also referred to as Visible Light Communication (VLC)), in which the light generated (e.g., emitted) by a light emitting component (e.g., a light-emitting diode or a laser) may be modulated for transmitting data. Different modulation schemes may be implemented, for example a pulsed scheme (e.g., pulse position modulation (PPM) or pulse amplitude modulation (PAM)), or a non-pulsed scheme (e.g., Orthogonal Frequency Division Multiplexing (OFDM)).

In various embodiments, line coding schemes or modulation schemes similar to those provided in optical communication and/or in impulse radio schemes may be used to encode (illustratively, to electrically modulate) a light signal of the ranging system. By way of example, said line coding schemes or modulation schemes may include On-Off Keying (OOK), Pulse Amplitude Modulation (PAM), and Pulse Position Modulation (PPM). Illustratively, a scheme similar to Optical Wireless Communication may be implemented for vehicle-to-vehicle (V2V) communication and/or vehicle-to-environment (V2X) communication (also referred to as vehicle-to-everything communication).

A communication system may be configured according to an Open System Interconnection (OSI) layer design. The OSI model may characterize and standardize the communication functions of a communication system (e.g., of a telecommunication system). Such standardization may be independent from the internal structure and technology of the communication system. Illustratively, the OSI model partitions a communication system into abstraction layers. A layer may serve the layer above it, and a layer may be served by the layer below it. An example of OSI model including seven layers is provided in Table 4w. A Data Link Layer may be divided into a Logical Link Control (LCC) sublayer and into a Medium Accesso Control (MAC) sublayer. The LCC sublayer may be closer to the Physical layer than the MAC sublayer.

TABLE 4w

OSI model

| Layer | | Protocol data unit (PDU) | Function |
|---|---|---|---|
| Host layers | 7 Application | Data | High-level APIs, including resource sharing, remote file access |
| | 6 Presentation | | Translation of data between a networking service and an application; including character encoding, data compression and encryption/decryption |
| | 5 Session | | Managing communication sessions, e.g. continuous exchange of information in the form of multiple back-and-forth transmissions between two nodes |
| | 4 Transport | Segment, Datagram | Reliable transmission of data segments between points on a network, including segmentation, acknowledgement and multiplexing |
| Media layers | 3 Network | Packet | Structuring and managing a multi-node network, including addressing, routing and traffic control |
| | 2 Data link | Frame | Reliable transmission of data frames between two nodes connected by a physical layer |
| | 1 Physical | Symbol | Transmission and reception of raw bit streams over a physical medium |

Code Division Multiple Access (CDMA) may be described as a multiple access scheme, in which a plurality of transmitters send information simultaneously over a single communication channel. Such scheme may allow several users to share the medium (illustratively, the single communication channel). To permit this without undue interference between the users, CDMA may employ spread spectrum technology and a special coding scheme (e.g., a code may be assigned to each transmitter). Illustratively, the bandwidth of the data may be spread (e.g., uniformly) for the same transmitted power. Data for transmission may be combined (e.g., by bitwise XOR) with a spreading code. The spreading code may be a pseudo-random code having a narrow ambiguity function. The spreading code may run at a higher rate than the data to be transmitted.

In the CDMA scheme, each user may use a different spreading code for modulating the respective signal (illustratively, for encoding the respective transmitted data). The performance (e.g., the quality) of the data transmission may depend on the separation between the signals (e.g., between the signal of an intended user and the signals of one or more other users). Signal separation may be achieved by correlating the received signal with the locally generated code associated with the intended user. A CDMA-based system may be configured to extract the signal in case of matching correlation (e.g., in case of high correlation function).

The CDMA scheme may be a synchronous CDMA, in which each user is provided with a code orthogonal (illustratively, with zero cross-correlation) to the codes associated with other users to modulate the respective signal. The CDMA scheme may be an asynchronous CDMA. Asynchronous CDMA may also be provided (e.g., as in an automotive context) in case large numbers of transmitters each generate a relatively small amount of traffic at irregular intervals.

In the context of the present application, for example in relation to FIG. 131A to FIG. 137, the term "signal modulation" (also referred to as "electrical modulation") may be used to describe a modulation of a signal for encoding data in such signal (e.g., a light signal or an electrical signal, for example a LIDAR signal). By way of example, a light source may be electrically modulated such that the light signal carries or transmits data or information. Illustratively, an electrically modulated light signal may include a sequence of light pulses arranged (e.g., temporally spaced) such that data may be extracted or interpreted according to the arrangement of the light pulses. Analogously, the term "signal demodulation" (also referred to as "electrical demodulation") may be used to describe a decoding of data from a signal (e.g., from a light signal, such as a sequence of light pulses).

In various embodiments a plurality of different signal modulation codes may be used to encode and/or decode a light signal (illustratively, to adapt a light signal for carrying data). The plurality of different signal modulation codes may be CDMA codes (e.g., codes same or similar to the spreading codes provided in a CDMA scheme). By way of example, the plurality of signal modulation codes may include Walsh Codes, Hadamard matrices, Gold code construction schemes, and "pseudo-noise" (PN) sequences.

In various embodiments, a frame-based signaling scheme for a ranging system may be provided. The light signal emitted by the ranging system may be configured or structured as a frame. Illustratively, the light signal may include one or more portions (e.g., frame portions), and each portion may be associated with a content type (e.g., each portion may carry a certain type of information). The frame-based signaling scheme may include a predefined frame structure (e.g., adapted for being harmonized and/or standardized). One or more coding schemes (also referred to as signal modulation schemes, or electrical modulation schemes, or encoding schemes) may be provided to build-up a frame (illustratively, to generate a frame).

In the context of the present application, for example in relation to FIG. 131A to FIG. 137, the term "frame" may be used to describe a logical structure of a signal (e.g., a light signal or an electrical signal). Illustratively, the term "frame" may describe or define an arrangement (e.g., a structure) for the content of the frame (e.g., for the signal or the signal components). The arrangement of the content of the frame within the frame may be configured to provide data or information. A frame may include a sequence of symbols or symbol representations. A symbol or a symbol representation may have a different meaning (e.g., it may represent different type of data) depending on its position within the frame. A frame may have a predefined time duration. Illustratively, a frame may define a time window, within which a signal may have a predefined meaning. By way of example, a light signal configured to have a frame structure may include a sequence of light pulses representing (or carrying) data or information. A frame may be defined by a code (e.g., a signal modulation code), which code may define the arrangement of the symbols within the frame.

The symbols may be drawn from a predefined alphabet (e.g., from a binary alphabet with symbols in {0; 1}, from a ternary alphabet, or from an alphabet with higher order). Illustratively, a symbol may represent one or more bits. A symbol included in a frame or in a frame portion may be represented by a signal representation of that symbol. A signal representation of a symbol may be, for example, an analog signal (e.g., a current or a voltage) onto which that symbol is mapped. A signal representation of a symbol may be, for example, a time-domain signal (e.g., a light pulse, in the following also referred to as pulse) onto which that symbol may be mapped. Illustratively, a frame may be understood as a sequence of one or more symbols (e.g., "0" and "1") represented or stored as a sequence of one or more signal representations of those symbols (e.g., one or more currents or current levels, one or more pulses, etc.). Thus, a same frame may be implemented in different ways. By way of example, a same frame may be stored as one or more electrical signals and may be emitted or transmitted as one or more light pulses.

A symbol may be mapped onto a signal representation of the symbol, such as onto a time-domain symbol (illustratively, each symbol may be associated with a respective time-domain symbol). The time-domain symbol may have a symbol duration Ts. Each time-domain symbol may have the to same symbol duration Ts, or time-domain symbols associated with different symbols may have different symbol durations, $T_{S1}$, $T_{S2}$, . . . , $T_{Sn}$.

An example of a signal representation may be a pulse (e.g., a Gaussian pulse) having a symbol amplitude (e.g., a pulse amplitude) and a symbol duration Ts (e.g., a pulse duration). Time-domain symbols associated is with different symbols may have different symbol amplitudes (and same or different symbol durations), or time-domain symbols associated with different symbols may have the same symbol amplitude (and different symbol durations). By way of example, in case a binary alphabet (e.g., a unipolar binary alphabet) is used, the "1"-symbol may be mapped onto a Gaussian pulse of a certain amplitude and a certain symbol duration, and the "0"-symbol may be mapped onto a Gaussian pulse with zero amplitude and the same symbol duration.

A frame may have a length, e.g. N (N may describe, for example, the number of symbols included in the frame). The length of a frame may be predefined (e.g., fixed) or variable.

By way of example, the length of a frame may be variable with (or between) a minimum length and a maximum length.

In the context of the present application, a frame may be, for example, a light signal sequence frame, a reference light signal sequence frame, a correlation result frame, or a signal sequence frame, as described in further detail below.

Illustratively, a ranging system may be configured to generate and/or emit a frame (e.g., to emit a light signal sequence frame, for example a sequence of pulses). The ranging system may be configured to receive a light signal, e.g. a light signal sequence. The ranging system may be configured to determine whether a frame is included in a received light signal sequence. The ranging system may be configured to interpret a frame in a received light signal sequence (e.g., to decode data, such as communication data bits, included in such frame).

The ranging system may be configured to emit one or more frames (for example one or more light pulse sequences). The ranging system may be configured to emit the frames with a time spacing (e.g., a time delay) between consecutive frames. The time spacing may be selected from a range between a minimum time spacing $T_{min}$ and a maximum time spacing $T_{max}$. The one or more frames may have same or different length and/or composition. The one or more frames may be of the same type or of different types. The ranging system may be configured to emit the one or more frames in accordance with a medium access scheme (e.g., a ranging medium access scheme or LIDAR medium access scheme), as described, for example, in relation to FIG. 138 to FIG. 144. Illustratively, the ranging system may be configured for activity sensing.

A frame may include a predefined structure. The frame may include one or more (e.g., predefined) frame portions (e.g., one or more fields). Each portion may be associated with a predefined usage and/or function (e.g., ranging, data encoding, and the like). By way of example, a frame may include a single portion (e.g., only a preamble portion, only a payload portion, etc.). A portion may have a variable length (e.g., a block-wise variable length). A special portion or a set of portions (e.g., of the same type) may also be provided (e.g., a special preamble and/or a set of preambles, for example for signaling).

The structure of a frame may be configured to be identifiable (and decodable). Illustratively, a vehicle (e.g., a ranging system of the vehicle) may be configured (or capable) to identify the frame-structure of each light signal or light signal sequence the vehicle receives (e.g., of each light signal having a frame structure). This may provide the effect of a reduced crosstalk, for example in case different vehicles emit different frames or frames having different structure (e.g., a ranging system may be configured to distinguish between an own signal and a signal emitted by another ranging system). Thus, several ranging systems (e.g., included in several vehicles) may be operated in a same area. As a further example, this may be provided for data communication. Illustratively, identification data and/or various types of data and signaling information may be encoded and decoded on the frame. As a further example, this may provide an improved reliability for the data transmission (e.g., a consistency check may be implemented).

A frame and/or a portion of a frame may include one or more blocks (e.g., symbol blocks). Illustratively, a frame may be subdivided into one or more frame portions, and each frame portion may be subdivided into one or more blocks. A symbol block may include one or more symbols. Different blocks may include symbols from different alphabets (e.g., a first block may include symbols from a binary alphabet and a second block may include symbols from a ternary alphabet). A block may be an example of a symbol representation portion.

In various embodiments, one or more rules may be defined in relation to the construction of a frame. By way of example, the one or more rules may define or determine the frame length (and/or whether the frame length is predefined or variable). As another example, the one or more rules may define the frame structure and/or the one or more portions included in a frame (e.g., a predefined structure, one or more mandatory portions, one or more optional portions). As another example, the one or more rules may define the length of the portions (and/or whether the length is predefined or variable). As a further example, the one or more rules may define the respective function of the portions (e.g., predefined encoding, reserved, or future use).

The one or more portions (e.g., the number of portions and/or the respective function) may be configured (e.g., selected) depending on the intended application of the frame.

A (e.g., generic) frame may include a preamble frame portion (also referred to as preamble field or preamble). The preamble may be conic) figured to provide signal acquisition and/or signal synchronization functionalities. Illustratively, the preamble frame portion may include acquisition signals and/or ranging signals and/or synchronization signals.

The generic frame may (optionally) include a payload frame portion (also referred to as payload field, payload, or PHY payload, wherein PHY stands for physical layer). The payload frame portion may be configured to provide and/or manage various type of information, such as identification information, data, signaling information, and/or control information.

The generic frame may (optionally) include a header frame portion (also referred to as header field, header, or PHY header). The header frame portion may include control data. The header may provide flexibility on how data and/or information may be arranged in the payload and/or in the footer. The header frame portion may be configured to encode various type of information (e.g., about one or more other frame portions).

By way of example, the header frame portion may be configured to encode information about the payload frame portion, such as payload-specific parameters, type of payload, payload type-specific parameters, protocol version, and the like. Payload-specific parameters may include, for example, payload length, payload configuration, payload encoding scheme and/or a codebook used for encoding (e.g., the number of additional ranging sequences contained in the payload, the number of data symbols encoded in the payload, the codebook used to encode data, the codebook used to encode signaling and control information, and the like). The type of payload may include, for example, ranging information, data transmission, signaling and/or control information, or other type of information (e.g., management frame). The payload type-specific parameters may include, for example the used ranging scheme, the used data encoding scheme (e.g., the used mapping and/or the used codebook), or the used signaling scheme and/or control scheme.

As another example, the header frame portion may encode information about a footer frame portion (described in further detail below), such as information describing that no footer is present, information describing that the footer is filled with "dummy bits" to reach a certain (e.g., minimum) frame length, information describing that the footer includes payload error detection information and/or error correction information (e.g., including information about the used error detection and/or error correction scheme), and the like. As a further example, the header frame portion may encode information about the protocol version (e.g., the version number). The information about the protocol version may allow for future extensions.

The generic frame may (optionally) include a footer frame portion (also referred to as footer field, footer, or PHY footer). The footer may be configured to provide frame consistency check functionalities (e.g., frame integrity test and/or collision detection). As an example, the footer frame portion may include frame integrity test signals and/or collision detection signals. As a further example, the footer frame portion may include symbols and/or sequences of symbols for error detection and/or error correction (e.g., payload error detection and/or correction). Additionally or alternatively, the footer frame portion may include dummy symbols and/or sequences of dummy symbols (e.g., "dummy bits"). Such dummy symbols and/or sequences may serve to reach a certain (e.g., minimum) frame length.

The physical layer may describe the physical communication medium (similar to data communication, where PHY may be part of the OSI model). Illustratively, for a ranging system the physical communication medium may be air (e.g., where light pulses may be emitted).

Illustratively, each frame portion may be or may include a sequence of symbols (or signal representations). The sequence of symbols may be defined by an associated portion code (e.g., a preamble code, a payload code, a footer code, and a header code). The code may be drawn from the binary alphabet {0,1}, or from a different type of alphabet, e.g. higher order coding schemes may be provided. The sequence of symbols may be dependent on the type of frame in which the portion is included.

Each frame portion may have an adjustable length. Illustratively, the length of a frame portion (e.g., of a preamble) may be adapted or selected depending on the frame type. Frame portions of different lengths might be defined (e.g., default, short, medium, long). This may provide flexibility, for example during runtime. Illustratively, the length of a frame portion (e.g., the length of a preamble) may influence or determine the performance of the ranging system. The dynamic adaptation of the length may allow dynamically adjusting the performance parameters. By way of example, the ranging system may be configured to select different lengths for one or more portions of a frame (e.g., during operation).

A (e.g., specific) frame may be derived from the structure of the generic frame described above. Illustratively, a specific (or dedicated) frame may include one or more frame portions of the generic frame (e.g., a preamble and/or a payload and/or a header and/or a footer). By way of example, a frame may be a Ranging frame (e.g., used for a ranging operation). As another example, a frame may be a Data frame (e.g., used for data transmission). As a further example, a frame may be a Signaling and Control frame (also referred to as Short Acknowledgment (ACK) frame). Illustratively one or more of the frame portions may be optional (e.g., may be omitted) depending on the frame type.

By way of example, in a Ranging frame the header and/or the payload and/or the footer may be optional portions (e.g., one or more of such fields may be omitted). A Ranging frame may include a single portion (e.g., the preamble). In a Ranging frame, the preamble may for example be used for ranging (e.g., by itself, or together with one or more other portions or together with one or more other (e.g., subsequent) Ranging frames). By varying the preamble length, specific performance parameters may be adjusted (e.g., optimized), such as detection-range and update-rate. Illustratively, long-distance ranging may require a certain minimum preamble length in order to obtain measurements at low signal to noise ratios (SNRs). The system's update rate may be inversely proportional to the preamble length. In a Ranging frame additional ranging symbols and/or sequences of symbols may be encoded in the payload. This may improve the ranging performance (e.g., the quality of the detection).

As another example, in a Data frame the payload and/or the footer may be optional. Alternatively, a Data frame may include a single portion (e.g., the payload, illustratively, only the payload may be used for data transmission). The Data frame including the single payload may include (optionally) an additional field (e.g., the footer). In a Data frame the preamble may serve, for example, as a "marker" for timing acquisition and synchronization, e.g. the preamble may indicate the start of the data transmission (for example, the start of the payload and/or of the footer). In a Data frame data symbols and/or sequences of data symbols may be encoded in the payload. Such data symbols and/or sequences may encode various type of data, such as data for communication, identification information (e.g., a vehicle identification number, car type, car ID, car serial number, corner ID (left, right, front, back), pixel ID, sub-system ID, and the like), security data (e.g., information for security key exchange, for authentication, for two-factor authentication, and the like), telemetry data (e.g., GPS-coordinates, speed, break status, and the like), a traffic-related warning message and/or alert (e.g., indicating an obstacle being detected), transmission token to coordinate communication, and information to manage the handover to RF communication.

As a further example, in a Signaling and Control frame the payload and/or the footer may be optional. A Signaling and Control frame may include a single portion (e.g., the preamble). Illustratively one or more designated preambles may be used for signaling and/or controlling (e.g., for sending a warning beacon, a short ACK, and the like). In a Signaling and Control frame the preamble may serve, for example, as a "marker" for timing acquisition and synchronization (e.g., the preamble may indicate the start of the signaling and control information, such as the start of the payload and/or the footer). Additionally or alternatively, in a Signaling and Control frame the preamble may serve as the signaling and control information itself, e.g. in case a warning beacon and/or a short ACK is transmitted. In a Signaling and Control frame, symbols and/or sequences of symbols for signaling and control purposes may be encoded in the payload. Such symbols and/or sequences may describe or include, for example, beacons, acknowledgment messages (ACK messages), and other type of information.

A preamble frame portion may also be configured for channel estimation. A set of predefined preambles (e.g., of predefined preamble codes) may be defined. A preamble codebook may be provided (e.g., the ranging system may have access to the preamble codebook). The preamble codebook may describe or include the predefined preambles (e.g., a union, a collection, or a list of all the predefined preambles). Each preamble in the preamble codebook may be used to define a number of "virtual" channels. A virtual channel may be dedicated to an associated function (e.g., for ranging-, data-, signaling- and control-information). The preamble code may be configured to have good auto-correlation properties. The preamble codes in the preamble codebook may be configured to have good cross-correlation properties. Good auto-correlation properties may improve timing resolution and/or timing precision (e.g., in case the preamble is used for ranging), and good cross-correlation properties may be provided for distinguishing an own signal from an alien signal. A participant (e.g., a traffic participant, such as a vehicle or a ranging system of a vehicle) may select on which channel to subscribe to (illustratively, which channel to talk on and/or listen to) depending on the selected preamble. Such channel-based approach may also be provided in case special purpose frames and/or messages are conveyed (e.g., special frames for broadcasting notifications or alerts). A preamble codebook may be specific for a ranging system (or vehicle-specific). Illustratively, different manufacturers may provide "non-overlapping" preamble codebooks. This may offer the effect that a system may be decoupled from other systems (e.g., provided by other manufacturers), thus reducing the impairments caused by the equipment of the other manufacturers.

In the context of the present application, good auto-correlation properties may be used to describe a signal, which provides an auto-correlation below a predefined auto-correlation threshold in case the signal is correlated with a shifted (e.g., time-shifted or delayed, illustratively with a time-shift other than 0) version of itself. The auto-correlation threshold may be selected depending on the intended application. By way of example, the auto-correlation threshold may be smaller than 0.5, for example smaller than 0.1, for example substantially 0. In the context of the present application, good cross-correlation properties may be used to describe a signal, which provides a cross-correlation below a predefined cross-correlation threshold in case the signal is cross-correlated with another signal (illustratively, a different signal). The cross-correlation threshold may be selected depending on the intended application. By way of example, the cross-correlation threshold may be smaller than 0.5, for example smaller than 0.1, for example substantially 0. The signal may be, for example, a frame or a frame portion, such as a light signal sequence frame or a reference light signal sequence frame.

In various embodiments, a coding scheme (also referred to as coding process) may be provided. The coding scheme may have good auto-correlation and/or cross-correlation properties (illustratively, the coding scheme may provide encoding and/or decoding of signals having good auto-correlation and/or cross-correlation properties). The provided coding scheme may offer the effect of a reduced crosstalk between a ranging system and other ranging systems (or between sub-systems of a ranging system), thus allowing concurrent operation of several ranging systems. As a further example, the provided coding scheme may reduce a "blackout" time. As a further example, the provided coding scheme may enable data encoding.

The coding scheme may be configured to provide block-wise composition and/or decomposition of a symbol sequence (e.g., of a large block of symbols). Illustratively, a block-wise coding strategy may be provided (e.g., a block-wise coding process). A symbol sequence may be included, for example, in a frame or in a frame portion. The composition and/or decomposition may be performed using smaller sub-blocks of symbols (e.g., small blocks of symbols). The scheme may be provided for variable block length coding and/or for concurrent operation and/or for data coding. A corresponding encoder and/or decoder may be provided, as described in further detail below. The block-wise operation may reduce the computational effort associated with the data transmission (illustratively, the block-wise operation may be a computationally tractable implementation).

The block-wise coding process may include dividing a frame (or frame portion) into one or more symbol blocks (e.g., a frame or a frame portion to be encoded or decoded). The block-wise coding process may include encoding each symbol block onto a corresponding pulse sequence block (illustratively, the symbol blocks may be mapped into a one-to-one fashion onto pulse sequence blocks). A pulse sequence may be a sequence of light pulses. A pulse sequence block may be a sub-set of light pulses of a pulse sequence. A pulse sequence may be an example of a light signal sequence or of a light signal sequence frame.

The block-wise coding process may include transmitting the one or more pulse sequence blocks (illustratively, the combination of all pulse sequence blocks may represent the original frame or frame portion). The block-wise coding strategy may allow employing pulses with larger pulse duration, thus reducing the complexity of the related electronics. The block-wise coding strategy may also reduce the computational effort at the receiver side (e.g., data decoding may be easier). Illustratively, the block-wise coding strategy may overcome some of the shortcomings of a conventional CDMA coding scheme.

In various embodiments, the coding process may include an encoding process (also referred to as signal modulation process). The encoding process may be for encoding (in other words, mapping) a frame onto a signal representation of the frame (e.g., a physical time-domain signal). The encoding may be performed on individual symbols of a frame or frame portion, on symbol blocks within the frame, or on the entire frame. By way of example, the encoding process in combination with a pulse shaping filter may define the shape of a pulse in the time-domain (e.g., of one or more pulses associated with a frame, e.g. with one or more symbols included in the frame). By way of example, the encoding process may include one or more signal modulation schemes, such as on-off keying (OOK), pulse amplitude modulation (PAM), pulse position modulation (PPM), and the like. The one or more signal modulation schemes may be used in combination with a pulse shaping filter (e.g., Gauss shaped) for encoding the symbols of a frame, symbol blocks within the frame, or the entire frame into a time-domain signal. The encoding process may have good auto-correlation and/or cross-correlation properties. By way of example, in case a frame has good auto-correlation properties, the entire frame may be provided for ranging. As another example, in case a frame has good cross-correlation properties, the frame may be provided for reducing alien crosstalk and/or frame errors.

By way of example, an approach similar to CDMA (e.g., asynchronous CDMA) may be adopted. The encoding process may include (or use) one or more signal modulation codes (e.g., spreading codes) for encoding (e.g., electrically modulating) the frame, such as Walsh codes, Hadamard matrices, Gold code construction schemes, and PN sequences. The encoding process may include a XOR operation between a code (e.g., a signal modulation code) and one or more symbols of a frame (e.g., a sequence of symbols, for example a binary symbol sequence). The XOR operation may provide an encoded representation of the one or more input symbols (e.g., a CDMA-encoded representation of the input sequence). The encoding process may include converting the encoded representation of the one or more input symbols into a sequence of pulses (for example Gauss shaped).

The encoding of a symbol block onto the associated pulse sequence block may be performed by accessing a memory or a database (e.g., retrieving the pulse block to be associated with the symbol block from a memory or database). The ranging system may have access to such memory and/or database. By way of example a ranging system may store such information locally (e.g., in a memory of the ranging system and/or of a vehicle). As another example, a ranging system (or all ranging systems) may have access to a system-external (e.g., centralized) database or databank storing such information (e.g., standardized information).

The memory and/or the database may include or store each possible symbol block mapped onto a corresponding pulse sequence block. Illustratively, the memory and/or the database may include or store a codebook (e.g. a lookup table). The codebook may store a corresponding (e.g., reference) pulse sequence (e.g., in the time-domain) for each possible sequence of symbols in a frame or frame portion. The use of a codebook may be enabled by selecting an appropriate size (e.g., length) for the pulse sequence blocks (e.g., a small size, for example a pulse sequence and/or a pulse sequence block may include only a limited number of pulses, for example less than ten pulses, for example less than five pulses). A pulse sequence and/or a pulse sequence block may be configured to have good (e.g., favorable) auto-correlation and/or cross-correlation properties. By way of example, a pulse sequence of a pulse sequence block may be stored (e.g., represented) as Analog/Digital-(A/D-) samples with a given amplitude and time-resolution (e.g., 8-bit amplitude resolution, corresponding to 256 values, 25 samples-per-pulse sequence block defining the time resolution).

In various embodiments, the coding process may include a decoding process (also referred to as signal demodulation process). The decoding process may be configured to decode a frame (e.g., to decode a frame including or being represented by one or more pulses or pulse sequences). Illustratively, the decoding process may determine a sequence of symbols (e.g., communication data bits) from the sequence of pulses. The decoding process may be implemented using correlation receiver concepts (e.g., the ranging system may include one or more correlation receivers, also referred to as cross-correlation functional blocks), analogous to CDMA or pulsed radio systems. The decoding process may also be configured to determine (e.g., to measure or to calculate) a time lag (in other words, a time difference) between emission and reception of a signal. The time difference may represent the time-of-flight (ToF). The decoding process may be performed both on long pulse sequences or pulse sequence blocks (e.g., including more than five pulses or more than ten pulses) and on short pulse sequences or pulse sequence blocks (e.g., including five or less pulses).

By way of example, an operation of the ranging system may be as follows. The ranging system may emit a chosen pulse sequence x1 (illustratively, the pulse sequence to be emitted may be represented by an indicator vector, for example stored in a register). The ranging system may repeat the emission of the same pulse sequence x1 to perform consecutive ranging operations. The pulse sequence x1 may travel into the "scene" (e.g., the environment surrounding or in front of the ranging system, for example in front of a vehicle). The pulse sequence may be reflected by some target (e.g., an object in the field of view of the ranging system, such as another vehicle, a tree, or the like). The reflected pulse sequence may travel back to the ranging system (e.g., to a sensor of the ranging system). The detected pulse sequence y1 may be provided to a correlation receiver. The correlation receiver may be configured to correlate the detected pulse sequence y1 with the emitted pulse sequence x1 (e.g., to evaluate a cross-correlation between the detected pulse sequence y1 and the emitted pulse sequence x1, or to perform a cross-correlation operation on the detected pulse sequence y1 and the emitted pulse sequence x1). The correlation receiver may be configured to determine from the correlation result z1a time lag (e.g., the ToF). The determination may be performed considering the distinct peak provided at the output of the correlation receiver.

In various embodiments, the ranging system may include one or more components configured to perform the encoding process, the block-wise coding process, and/or the decoding process. The ranging system may include an encoder side (also referred to as emitter side) and a decoder side (also referred to as receiver side or detector side).

The ranging system may include (e.g., at the encoder side) a register (e.g., a shift register). The register (also referred to as init register) may be configured to store an indicator vector (also referred to as index vector) representing the chosen pulse sequence (illustratively, the pulse sequence to be emitted). The indicator vector may have a certain length, e.g. N (e.g., representing the number of elements of the vector). The init register may have a length (e.g., M) greater than the length of the indicator vector.

The ranging system may include a Tx Buffer (e.g., a circular shift register). The Tx Buffer may have a length (e.g., M, same or different with respect to the init register) greater than the length of the indicator vector. The Tx Buffer may be configured to receive the indicator vector from the init register (e.g., after initialization, for example indicated by an init signal, the indicator vector may be loaded element-by-element into the Tx buffer). The init register and the Tx Buffer may be clocked by a common clock signal (e.g., a common reference clock). The init register and the Tx Buffer may be configured such that with each clock cycle the init register content (e.g., the indicator vector) is shifted one position to the right. This way the indicator vector representing the sequence may be loaded clock-by-clock into the Tx Buffer. The Tx Buffer may be configured such that the indicator vector is circled (in other words, repeated) over time (for example, infinitely or until a stop signal is provided).

The ranging system may include a Transmission Block (also referred to as Tx Block). The Tx Buffer and the Transmission Block may be configured such that the first element of the Tx Buffer is used as an input for the Transmission Block. The Transmission Block may be configured to create a signal representation (e.g., a pulse) according to the current element of the indicator vector (e.g., according to the input received from the Tx Buffer). By way of example, the Transmission Block may be configured to create a pulse in case the entry of the register is "1", and the Transmission Block may be configured to not create a pulse in case the entry of the register is "0".

The ranging system may include a symbol shaping stage. The symbol shaping stage may be configured to determine (e.g., create) the pulse shape. By way of example, the symbol shaping stage may be configured to create a pulse shape based on a pulse shape filter. As another example, the symbol shaping stage may be configured to create a pulse shape using a digitized pulse shape.

The ranging system may include a driver (e.g., an analog driver). The driver may be configured to receive the pulse or pulse sequence (e.g., the sequence of shaped pulses) from the symbol shaping stage. The driver may be coupled (e.g., communicatively coupled) with a light emitter (e.g., a light source, such as a laser). The driver may be configured to control the light emitter to emit light in accordance with the received pulse or pulse sequence.

The ranging system may include (e.g., at the decoder side) a Rx Block. The Rx Block may be configured to capture a received pulse sequence. The Rx Block may include a sensor (e.g., an opto-electronic detector, for example including a photo diode (PD), or an avalanche photo diode (APD)). The Rx Block may include an amplifier (e.g., a Transimpedance Amplifier (TIA)). The amplifier may be configured to amplify the received signal. The Rx Block may include a signal converter (e.g., an Analog-to-Digital Converter (ADC)). The signal converter may be configured to convert the signal into a digitized signal. The Rx Block may be configured to output an indicator vector representing the detection (e.g., representing the received pulse sequence). The output may have a predefined A/D resolution.

The ranging system may include a Rx Buffer (e.g., a shift register). The Rx Buffer may be configured to receive the output of the Rx Block. Illustratively, the output of the Rx Block may be loaded element-by-element into the Rx Buffer, for example clocked by a common reference clock (e.g., a same reference clock as for the emitter side, or a different reference clock).

The ranging system may include a correlation receiver (also referred to as cross-correlation functional block). The correlation receiver may have access to both the Tx Buffer and the Rx Buffer. The correlation receiver may be configured to determine the cross-correlation between the content of both registers.

Additionally or alternatively, the correlation receiver may be configured to receive measured and/or sampled data as input. This may enable taking into account an actual pulse shape of the emitted signal when performing the correlation operation at the receiver-side. This may improve the decoding performance, and may be relevant, as an example, when addressing functional safety aspects.

Additionally or alternatively, the correlation receiver may be configured to receive tapped sampled data as input. This may enable taking into account an actual pulse shape of the emitted signal when performing the correlation operation at the receiver-side. This may improve the decoding performance.

The ranging system may include a peak detection system. The peak detection system may be configured to receive the output (also referred to as cross-correlation output) of the correlation receiver (e.g., a signal is including one or more peaks representing the cross-correlation between the content of the registers). The peak detection system may be configured to determine (e.g., calculate) the time lag based on one or more identified peaks in the cross-correlation. The determined lag (illustratively, between the emitted signal and the received signal) may represent the ToF. The peak detection system may be configured to provide a confidence measure or a validity signal for the current output (e.g., based on the height of the detected peak, or based on the height of the detected peak with respect to other peaks, or based on the height of the detected peak with respect to previous results, or based on a combination of these approaches). A peak detection system may be an example of one or more processors, or it may include one or more processors.

In various embodiments, the ranging system may be configured to perform the ranging operation using a plurality of pulse sequence blocks (e.g., two or more pulse sequence blocks). The ranging system may be configured to use the plurality of pulse sequence blocks in unison. This may provide the effect of a better (e.g., more accurate or more computationally efficient) decoding performance. By way of example, pulse sequence blocks may be time-varying random pulse sequence blocks (e.g., the data stream may be not known a priori to the ranging system).

By way of example, an operation of the ranging system may be as follows. The ranging system may be configured to emit two pulse sequence blocks (e.g., consecutively). The decoder may be configured to operate on the first sequence alone and/or on the second sequence alone (e.g., to individually decode the sequences). This may provide the effect that an update rate (e.g., a refresh rate) for the ranging system may be increased (e.g., doubled in the case with two pulse sequence blocks). Illustratively, each decoding (e.g., on the first sequence or on the second sequence) may provide an update. Additionally or alternatively, the decoder may be configured to operate on both sequences jointly (illustratively, with half the update rate as compared to the previous approach). This may provide the effect that a longer sequence and more signal power may be captured, thus improving the Signal-to-Noise Ratio (SNR) and increasing the operating range (e.g., the detection range). The ranging system may be configured to switch the decoder between the two modes of operation (e.g., during runtime). The switch may be implemented in software. Thus a flexible adaptation and reconfiguration may be provided, e.g. based on the current conditions. The two modes of the detector may be operated together. Illustratively, the detector may be configured to implement both modes in parallel.

The emission of the pulse sequence blocks may be configured according to a"—blackout-free" firing concept. Illustratively, the ranging system may be configured to emit the sequences directly one after another (e.g., with substantially no waiting time, or with substantially zero padding after each sequence). Illustratively, the ranging system may be configured to emit the sequences faster than ToF updates.

For this type of operation (e.g., including a plurality of emitted pulse sequences), the ranging system (and the various components) may be configured in a similar manner as described above (e.g., when operating with a single pulse sequence). The relevant differences are described in further detail below.

The init register may be configured to store two (or more) signal sequence frames (e.g., a sequence A and a sequence B), for example in a concatenated fashion. The concatenation of the two sequences may form a longer sequence (e.g., a concatenated sequence AB).

The ranging system may include additional Tx Buffers, for example three Tx Buffers. Each Tx Buffer may have a same length, e.g. M. A first Tx Buffer may be configured to contain the currently shifted version of the concatenated sequence AB (e.g., to receive sequence AB from the init register). A second Tx Buffer may be configured to contain the currently shifted version of sequence A (e.g., to receive sequence A from the init register). A third Tx Buffer may be configured to contain the currently shifted version of sequence B (e.g., to receive sequence B from the init register). After initialization (init signal) the Tx Block may be configured to emit the concatenated sequence AB, for example in a repetitive fashion.

The Rx Block may be configured to receive the concatenated sequence AB. The Rx Buffer may be configured to store (e.g., to receive) the received concatenated sequence AB.

The ranging system may include additional correlation receivers (e.g., a plurality of correlation receivers, for example three). The correlation receivers may be arranged in parallel. The Rx Block may be configured to provide the Rx Block output to the plurality (e.g., three) of correlation receivers. Each correlation receiver may be configured to determine the cross-correlation between the Rx Buffer (e.g., the received concatenated sequence AB stored in the Rx Buffer) and a respective Tx Buffer (e.g., storing the emitted concatenated sequence AB, the sequence A, and the sequence B, respectively).

Each correlation receiver may be configured to provide the output (e.g., the cross-correlation output) to the peak detection system. The peak detection system may be configured to determine the time lag based on the identified one or more peaks in the corresponding cross-correlation (e.g., in the three cross-correlations provided by the three correlation receivers). The determined lag may represent the ToF of the concatenated sequence AB, of the sequence A, and of the sequence B, respectively.

In various embodiments, the ranging system (e.g., the one or more correlation receivers) may be configured such that a crosstalk with another ranging system may be reduced or substantially eliminated.

Whenever more than one ranging system (e.g., more than one LIDAR system) are operated in close vicinity, crosstalk or conflicting signals between the ranging systems may occur. By way of example, a first ranging system may emit a first pulse sequence x1, but it may detect (e.g., receive) not only its own reflected signal y1 but also some signal y2 originally emitted by a second ranging system (e.g., an alien system). Thus, the signal detected by the first ranging system may be a superposition of y1 and y2. This may lead to detection errors (e.g., errors in point cloud), false detections, or even system disruptions.

A correlation receiver may be configured to distinguish between an own pulse sequence (e.g., a sequence emitted by the ranging system including the correlation receiver) and an alien pulse sequence (e.g., emitted by an alien ranging system). Illustratively, the correlation receiver may be configured to perform the cross-correlation operation based on a knowledge of an own pulse sequence (e.g., it may be configured to search for a particular sequence, such as the own pulse sequence). The correlation receiver may be configured to filter out an alien pulse sequence. This may enable determining the ToF even in the presence of strong alien crosstalk.

This operation may be performed in case the ranging system and the alien ranging system operate according to a pulse sequence-based ranging approach. By way of example, a sequence may be uniquely assigned. Illustratively, at any time point there may be only one pulse sequence associated to a single ranging system, ranging sub-system, or an individual pixel (e.g. an individual pixel in a group of pixels), such as a partial light source (e.g., in a light source group, as described, for example, in relation to FIG. 158 to FIG. 161C). This type of operation or approach may enable the operation of a plurality of ranging system in close vicinity and/or in a concurrent fashion with a low mutual interference. Illustratively, different ranging systems, ranging sub-systems, or individual pixels may emit an allocated pulse sequence all at the same time. The different ranging system may be not coordinated (e.g., at the detector side the signals may be decoupled purely based on the knowledge about the emitted sequence). The sequences emitted by different ranging systems may be configured to have mutually good cross-correlation properties (e.g., a subset of sequences with favorable properties may be pre-assigned to different ranging systems, ranging subsystems, or individual pixels). The ranging system for this type of operation may be configured in a similar manner as described above in relation to a single sequence and/or in relation to a plurality of sequences.

In various embodiments, for implementing data communication capabilities in the ranging system, a data encoding scheme may be provided in combination with the pulse sequence blocks, for example in a frame-like structure.

The data (e.g., telemetry data, car identifier, security key, some warning message, signaling information, and the like) may be represented by a sequence of symbols (e.g., a sequence of bits, for example CDMA-encoded). This sequence of symbols may be divided into a sequence of symbol blocks (e.g., a sequence of frame symbol blocks). The symbol blocks may be mapped onto an entire pulse sequence, for example in a block-wise fashion. "Block-wise" may be used to describe that one block of input data also yields one "block" of output data. The mapping may be fully deterministic (e.g., known a priori, for example pre-assigned or chosen during runtime), or the mapping may contain some random component.

By way of example, the memory or the database (illustratively, a codebook) may store information mapping a pulse sequence (or sequence block) with corresponding data (illustratively, with a corresponding meaning). Illustratively, in case a number of X different input blocks is provided, the codebook may provide Y>=X output sequences, also referred to as code sequences. By way of example, in case of a look-up table implementation, the look-up table may include a total of Y code sequences. The code sequences in the look-up table may be labelled (for example associated with an integer number), for example as code sequence #1, code sequence #2, code sequence # Y. A look-up table implementation may provide a fast operation in case X is sufficiently small (e.g., less than 100 input blocks, or less than 50 input blocks). Each code sequence may have a length. The length of a code sequence may be associated with a number of time slots (e.g., 16 time slots).

At the encoder side, the Tx Buffer may be configured to receive the code sequences. The Tx Block may be configured to emit the code sequences. An overall (or combined) pulse sequence may have a length corresponding to the sum of the lengths of the individual signal representation sequences (e.g., 128 time slots in case of 8 pulse sequences each being 16 time slots long.).

At the detector side, the Rx Block (e.g., the Rx Buffer) may be configured to receive the detected signal. The content of the Rx Buffer may be used for decoding. By way of example, the detected pulse sequence may be an attenuated version of the emitted pulse sequence.

At the detector side (illustratively, a first decoder stage), the ranging system may include a bank of parallel correlation receivers. Each correlation receiver may be configured to receive the input signal (e.g., an input sequence, e.g. the content or the output of Rx Buffer). Each correlation receiver may be configured to correlate the received input with a code sequence in the codebook (e.g., a particular code sequence, associated with that correlation receiver, also referred to as reference code sequence). By way of example, the ranging system may include one correlation receiver for each sequence stored in the codebook (e.g., Y correlation receivers, also referred to as correlation receiver blocks or correlation receiver stages).

In this configuration, the output of a correlation receiver may include at most one (in other words, zero or one) significant peak. The presence of at most one significant peak may be related to good auto-correlation properties of the codes sequences in the codebook. As an example, in case the input signal has a length of N time slots and in case the reference code sequence also has a length of N time slots, then the output of the correlation receiver may include 2N−1 output values, and the significant peak (if present), may be one of those values.

A correlation receiver may be configured to provide an output including a significant peak in case the input signal is encoded (or was originally encoded) by the reference code sequence (illustratively, using a code sequence corresponding to the reference code sequence for that correlation receiver). A correlation receiver may be configured to provide an output not including any significant peak in case the input signal is encoded by a code sequence different from the reference code sequence for that correlation receiver (e.g., in case the encoding code sequence and the reference code sequence have good mutual cross-correlation properties).

Each correlation receiver may be configured to provide the output to the peak detection system (illustratively, a second decoder stage, e.g. the decision stage). Illustratively, the cross-correlation output of all correlation receiver stages may be fed in parallel to the peak detection system. The peak detection system may be configured to search for peaks in the received output of all correlation receivers in parallel. The peak detection system may be configured to perform inverse mapping (e.g., decoding). Illustratively, based on the found peaks (e.g., significant peaks), the peak detection system may be configured to perform inverse mapping back to the data symbols. The peak detection system may be configured to output the (e.g., decoded) data symbols, e.g. as decoding result.

In various embodiments, the ranging system may be configured to decode a plurality of pulse sequence blocks together (e.g., at the same time, or in parallel). Illustratively, the ranging system may be configured to collect (e.g., store, or accumulate) a plurality of sequence blocks (illustratively, the ranging system may be configured to take several subsequent sequence blocks over time), and to decode them together. This may be provided in a frame-based approach, where each frame may include (e.g., may be divided into) a predefined number of pulse sequence blocks.

Only as an example, a frame may be divided into B=8 blocks. Each block may be encoded onto a code sequence of a certain length, for example a code sequence having a length of 16 time slots. The frame may have a frame length of 8×16=128 time slots. The 8 blocks, illustratively corresponding to a transmitted pulse sequence of length 128 time slots, may be decoded together.

As described above, each correlation receiver may be configured to correlate a received input sequence with a reference sequence associated to the correlation receiver (e.g., with one of the reference sequences stored in the memory or in the database). The input sequence may usually include or consist of a plurality of sequence blocks. The (respective) reference sequence may include a single block (e.g., the reference sequence may be only one block long). Illustratively, the reference sequence may be shorter than the input sequence. By way of example, the input sequence may have a length of 128 time slots, and the reference sequence used for cross-correlation may have a length of 16 time slots. The size of the Tx Buffer (also referred to as input buffer) may be selected accordingly (e.g., such that the Tx Buffer may accommodate an entire pulse sequence, e.g. an indicator vector representing the pulse sequence). By way of example, in case of an input sequence having a length of 128 time slots, the Tx Buffer may be at least of length 128, for example of length 168.

Each correlation receiver may be configured to take the input buffer (e.g., to receive the content of the Tx Buffer, e.g. to receive the input sequence from the Tx Buffer). Each correlation receiver may be configured to correlate the received input sequence with the corresponding reference code sequence. The length of the output of a correlation receiver (e.g., the length of a cross-correlation result) may be dependent on the length of the input sequence (and/or of the input buffer). By way of example, the length of the cross-correlation result may be (2×input buffer length)−1 (for example, 2×168−1=335). Illustratively, (2×input sequence length)−1 values may be stored.

A memory (e.g., of the ranging system, or of a vehicle) may be configured to store, at least, a number of values (e.g., cross-correlation results) corresponding to the number of code sequences stored in the codebook (e.g., Y, e.g. the number of correlation receivers) multiplied by the input buffer length. The memory may be configured as an array (e.g., a two-dimensional array). By way of example, the array may include a number of lines (or columns) corresponding to the number of code sequences (e.g., Y) and a number of columns (or lines) corresponding to the input buffer length. By way of example, in case Y=64 code sequences, the results of all correlation receivers may be stored in a numerical array with 64 lines and 335 columns.

The correlation receivers may be configured such that in the memory (e.g., in the array) there may be at most one significant peak in each column (or line, depending on the arrangement of the array). This may be related, for example, to the good mutual cross-correlation properties of the sequences in the codebook and/or to a neglectable noise. The peak detection system may be configured to consider (e.g., to identify) as significant peak the maximum value in a correlation receiver output (e.g., in case more than one significant peak is present in the cross-correlation result). This may be a first decision criterion.

The maximum values (e.g., derived over all correlation receiver outputs) may have a periodicity. The periodicity may be based (e.g., proportional) on the time difference between subsequent blocks. The periodicity may be present, for example, in case the code sequences have good auto-correlation properties. The periodicity may be present, for example, in case the blocks are sent right after each other, (e.g., with substantially no gap between consecutive blocks), or in case the blocks are sent with a defined (e.g., constant) gap between consecutive blocks. The gap may be a is multiple of the duration of a time slot in the signal representation sequence. By way of example, in case the pulse sequence blocks are repeated directly after each other (e.g., no gap), the length of the pulse sequence blocks may be 16 time slots. In this case, in the maximum values there may be a periodicity corresponding to 16 time slots.

The peak detection system may be configured to perform the decoding process taking into consideration the periodicity in the maximum values. This may provide more reliable decoding decisions. Illustratively, the peak detection system may be configured to search for a significant peak in the correlation receiver output taking into consideration the periodicity of the signal (e.g., based on the time difference between subsequent blocks). By way of example, the maximum values may be rearranged (in other words, reshaped), for example into a two-dimensional array. The first dimension of the array in one direction may be determined (e.g., selected) according to the signal periodicity. The second dimension may be derived by the reshaping of the data points into the array. By way of example, in case the signal periodicity corresponds to 16 time slots, one dimension of the array (e.g., the number of lines) may be chosen to be 16. The number of columns may be determined by the rearrangement of the data into the array.

The peak detection system may be configured to perform joint decoding using the rearranged array. Illustratively, knowing the number of blocks (e.g., B blocks) that are encoded and sent together, and in case the time difference between the individual blocks is equal, the peak detection system may be configured to search for B subsequent values in the array. Such values may be in the same row (in other words, in the same line), thus resulting in the largest sum (illustratively, the sum of values from that row may be larger than the sum of values from any other row of the array). This may be a second decision criterion.

In various embodiments, the codebook may be "standardized" among participants (e.g., participants that intend to communicate with one another, for example using a vendor-specific standard, or a global standard).

In various embodiments, the ranging system may be configured according to a combination of the approaches (e.g., the operations) described above. Illustratively, a single system setup with synergetic use of the components may be provided. The ranging system may be configured to provide multi-block ranging and data transmission (e.g., the emitter side and the decoder side may be configured for multi-block ranging and data transmission). The pulse sequences and/or pulse sequence blocks may be configured (e.g., selected), such that parallel and independent operation of variable update-rate and data transmission may be provided.

In various embodiments, the pulse sequences and/or the pulse sequence blocks may be configured (e.g., selected) according to one or more predefined conditions. The pulse sequences and/or the pulse sequence blocks may have good auto- and/or mutual cross-correlation properties. The pulse sequences and/or the pulse sequence blocks may have a small maximum auto-correlation. Illustratively, a pulse sequence may be configured such that the auto-correlation between the pulse sequence and its (time-) shifted version may be as small as possible (e.g., less than 0.1 or less than 0.05). All possible shifts between the sequences may be determined, and the maximum auto-correlation over all possible shifts may be considered as a quality measure of a particular sequence. The pulse sequences and/or the pulse sequence blocks may be selected such that a small maximum cross-correlation between a reference sequence and one or more relevant test sequences may be provided. A test sequence may be a sequence used for concurrent ranging systems, or used to encode different data symbols. Considering all possible test sequences, and all possible shifts, the maximum cross-correlation may be considered as a quality measure. The pulse sequences and/or the pulse sequence blocks may include a small number of pulses, such as less than ten or less than five. By way of example, this may enable concentrating the emitted light on a few pulses for a better SNR performance.

In various embodiments, a pulse train coding scheme may be provided. The pulse train coding scheme may be configured as a block-wise pulse train coding scheme. Preferred or less preferred configurations may be determined by means of statistical and numerical analysis. The pulse train coding scheme may be configured to satisfy one or more of the conditions described above.

An indicator vector (also referred to as vector) may be used to describe a pulse sequence (e.g., to define the configuration of a pulse sequence). Illustratively, each element of the vector may correspond to a timeslot. The vectors value (e.g., the element value) may define a pulse amplitude for the respective time slot. By way of example, the indicator vector may be a binary indicator with elements in $\{0,1\}$. The length of the indicator vector (illustratively, the number of elements or time slots) may be described by an integer number, e.g. N. The number of vector entries that are set to 1 may be described by another integer number, e.g. K. K may be smaller than N. The number of vector entries that are set to 0 may be N-K. A pulse sequence corresponding to the entries in the indicator vector may be provided.

An overlap between two indicator vectors (e.g., of a same length) may be described by an integer number, e.g. E. The overlap E may described or represent the number of vector elements that are set to 1 in both vectors at the same position (e.g., in case the two vectors are aligned, e.g. synchronized in time). A shift between two indicator vectors may be described by an integer number, e.g. S. The shift S may describe how far to equal the indicator vectors are shifted, illustratively by how many elements the indicator vectors are shifted. A shift S may be defined also for circular shifts, similar as with circular shift registers. The overlap E may be defined for two shifted indicator vectors. By way of example, the overlap E may be defined between a vector and its shifted version. As another example, the overlap E may be defined between a vector and the shifted version of another vector (e.g., in case the vectors have the same length N).

In relation to the conditions described above for the pulse sequences and/or the pulse sequence blocks, the indicator vectors may be configured according to one or more of the aspects described in further detail below.

An indicator vector may be configured such that the maximum overlap E of the vector with itself is minimized for all possible circular shifts that are non-zero. This may ensure good auto-correlation properties. An indicator vector may be configured such that the maximum overlap E of the vector with the other reference vector is minimized for all possible circular shifts. This may ensure good cross-correlation properties. An indicator vector may be configured such that K<<N. This may correspond to a small number of pulses in the corresponding pulse sequence.

A threshold T may be defined as a quality criterion (e.g., of an indicator vector, e.g. of a code sequence). The threshold T may be a threshold value for the overlap E (e.g., for a maximum acceptable overlap E associated with an indicator vector). Illustratively, the threshold T may represent an upper bound on the maximum overlap, over all possible circular shifts. A sequence may be considered to have "good" properties in case the maximum overlap is smaller than the threshold T. A sequence may be considered to have "bad" properties in case the maximum overlap is greater than or equal the threshold T.

The threshold T may be specific for each indicator vector (e.g., a different threshold may be associated with different indicator vectors). By way of example, the threshold T may be determined (e.g., set) based on the number of ones in an indicator vector (e.g., T may be a fraction of K). As an example, T may be defined as T=floor (K/2). T may be a quality threshold. The quality threshold may be used to test for auto-correlation properties. The corresponding test may be referred to as "auto-correlation test".

A same or similar approach may be provided for testing the cross-correlation properties of an indicator vector. In this case, the maximum overlap may be determined considering a given set of sequences and/or indicator vectors. Illustratively, the maximum overlap may be determined for all possible sequences and/or indicator vectors in the set and over all possible circular shifts. The corresponding test may be referred to as "cross-correlation test".

In various embodiments, an algorithm may be provided for testing the indicator vectors (e.g., for identifying one or more indicator vectors that all satisfy the properties described above). Illustratively, the algorithm may be configured to generate a set of indicator vectors.

By way of example, the algorithm may be configured to start with an empty set of indicator vectors (also referred to as test set). The algorithm may be configured to add indicator vectors to the test set (illustratively, step-by-step). The algorithm may be configured to add a candidate indicator vector to the test set in case the candidate indicator vector passes the auto-correlation test and the cross-correlation test. In case the candidate indicator vector fails one of the tests, a new candidate vector may be randomly generated. The algorithm may be configured to repeat the process with the newly generated candidate vector. The algorithm may be configured to repeat the process until the test set has reached a desired size (e.g., until the test set includes a desired number of indicator vectors).

In various embodiments, one or more conditions may be provided for selecting the number N (e.g., the length of an indicator vector) and/or the number K (e.g., the number of 1 in an indicator vector). Based on combinatorics, the number of possible indicator vectors of length N with K ones may be calculated using the binominal coefficients, as described by equation 7w, $$\binom{N}{K} = \frac{N!}{K!\,(N-1)!} \tag{7w}$$

The number of possible indicator vectors of length N with K ones and a certain overlap E may be calculated in a similar manner. Based on such results (and by summing up of partial results), the number of indicator vectors with an overlap E smaller than a certain threshold (e.g., the threshold T, for example T=floor(K/2)) may be calculated. This may provide indications about the auto- and cross-correlation properties of vectors according to the conditions described above. Illustratively, such results may describe the probability that a certain sequence fails (or passes) the quality test (e.g., the auto-correlation test and the cross-correlation test). The calculations may be performed for vectors that are aligned and/or for shifted vectors (e.g., by using numerical simulation to derive the relative frequency for certain vector configurations in order to account for circular shifts between vectors).

Based on the calculations, a configuration of K that minimizes the probability of a randomly chosen sequence to fail the quality test may be provided (e.g., identified). This may provide an indication on preferred and less preferred configurations of K relative to the vector length N. By way of example, in the preferred configuration K may be chosen to be in the range 0.1*N<=K<=0.17*N. As another example, in the less preferred configuration K may be chosen to be in the range 0.06*N<=K<=0.28*N.

In various embodiments, the ranging system and/or the coding process described herein may be configured to provide one or more of the following functionalities and/or aspects.

The frame-based encoding scheme may allow for both ranging, data communication, signaling. Furthermore, the frame-based encoding scheme may allow to include further features like a frame consistency check. The frame-based approach may provide flexibility and may be the basis for a standard to harmonize LIDAR signaling schemes among LIDAR vendors. A frame may have a known structure that may be identified and "decoded" by everyone (e.g., by any participant). Signals from different (e.g., alien) LIDAR systems may be identified and discarded (if needed), thus partially eliminating "alien" crosstalk. Identification data and different kinds of data and signaling information may be encoded and decoded on the frame (thus providing data communication capabilities). Consistency checks may be included.

The coding scheme with good auto- and cross-correlation properties may reduce crosstalk and may allow for concurrent operation (e.g., of several LIDAR systems). A block-wise encoding scheme may reduce the "blackout" time (illustratively, update can be faster than the ToF of distant objects). A block-wise encoding scheme may provide efficient data encoding. Frame consistency check codes may enable checking for frame integrity and identifying potential collisions (it may also provide a means to check for data consistency). By way of example, the ranging system may be configured to emit one or more frames according to a LIDAR medium access scheme including collision avoidance, as described, for example, in relation to FIG. 138 to FIG. 144. Block-wise schemes may provide a computationally tractable implementation. A pulse train coding scheme may be easy to implement and parameterize. The pulse train coding scheme may allow for good auto- and cross-correlation properties. The pulse train coding scheme may be block-wise and allow to build-up frames. The pulse train coding scheme may allow for efficient implementations.

The various embodiments may be combined together (illustratively, the partial solutions may be combined for a unified solution).

FIG. 131A to FIG. 131G show a frame 13100 including one or more frame portions in a schematic representation, in accordance with various embodiments.

The frame 13100 may be, for example, a light signal sequence frame, a reference light signal sequence frame, a correlation result frame, or a signal sequence frame, as described in further detail below.

The frame 13100 may include one or more frame portions (e.g., predefined frame portions). Each frame portion may have a predefined content type (e.g., signal content type). Illustratively, each frame portion may include different type of data and/or may have a different functionality. The frame 13100 (e.g., each frame portion) may include one or more symbols (e.g., a sequence of symbols).

The frame 13100 may include a preamble frame portion 13102. The preamble frame portion 13102 may include acquisition signals and/or ranging signals and/or synchronization signals.

The frame 13100 may include a header frame portion 13104. The header frame portion 13104 may include control data.

The frame 13100 may include a payload frame portion 13106. The payload frame portion 13106 may include identification signals and/or control signals.

The frame 13100 may include a footer frame portion 13108. The footer frame portion 13108 may include frame integrity test signals and/or collision detection signals.

Additionally or alternatively, the frame 13100 (or each frame portion) may include one or more (e.g., a plurality) symbol representation portions. Illustratively, the frame 13100 (or each frame portion) may be subdivided into a plurality of symbol representation portions (e.g., a plurality of blocks). Each symbol representation portion may include a signal representation of a symbol or may include a plurality of signal representations each representing a symbol (e.g., one or more bits). The division of the frame 13100 into a plurality of symbol representation portions may simplify the encoding and decoding process (e.g., it may be performed block-wise).

The frame 13100 may have a length (illustratively, representing a number of symbols included in the frame). The frame length may be a predefined (e.g., fixed) length. Alternatively, the frame length may be variable. By way of example, the frame length may be variable between (or with) a minimum length and a maximum length.

The type and the number of frame portions of a frame 13100 may be selected depending on the frame type (e.g., on the intended application of the frame.

Figure 131A:
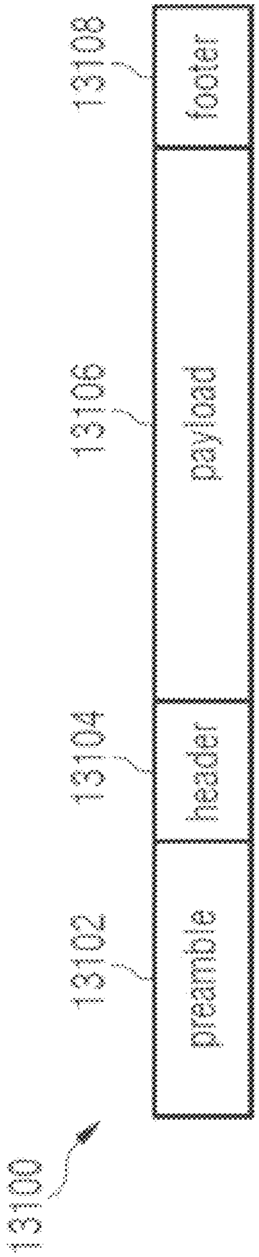
Figure 131B:
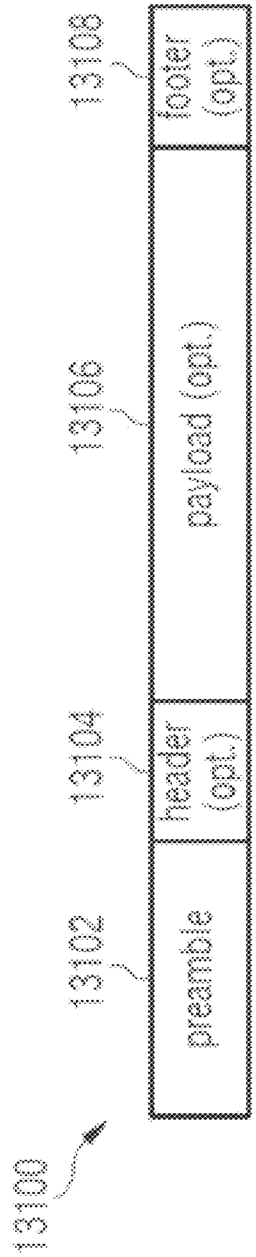
Figure 131C:
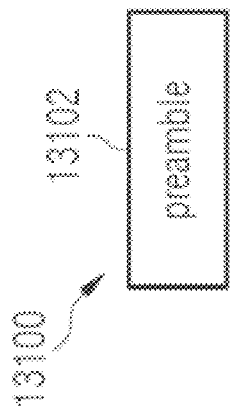

By way of example, a frame 13100 may be configured as a ranging frame (as illustrated, for example, in FIG. 131B and FIG. 131C). In a ranging frame, the header frame portion 13104 and/or the payload frame portion 13106 may be optional (e.g., may be omitted from the frame). A ranging frame may include, for example, a single frame portion, e.g. the preamble frame portion 13102.

Figure 131D:
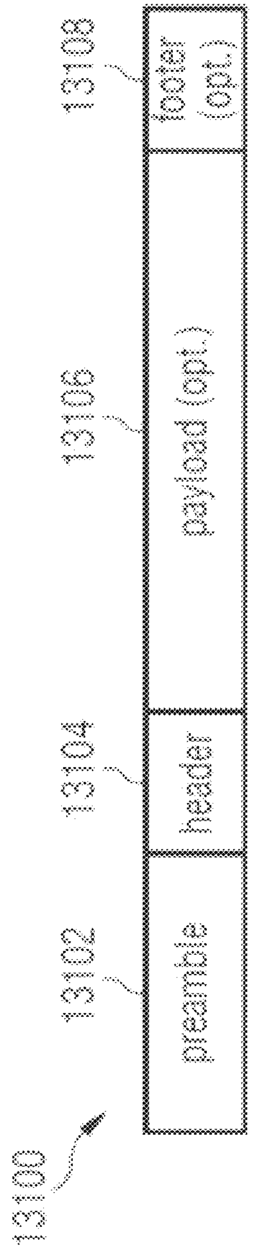
Figure 131E:
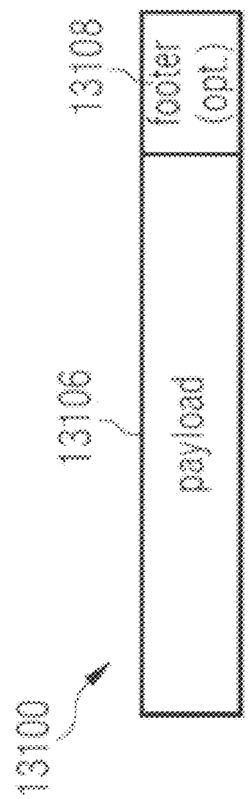

As another example, a frame 13100 may be configured as a data frame (as illustrated, for example, in FIG. 131D and FIG. 131E). In a data frame, the payload frame portion 13106 and/or the footer frame portion 13108 may be optional (as shown in FIG. 131D). A data frame may include a single frame portion, e.g. the payload frame portion 13106 (as shown in FIG. 131E). Optionally, the data frame may include the footer frame portion 13108 in addition to the payload frame portion 13106.

Figure 131F:
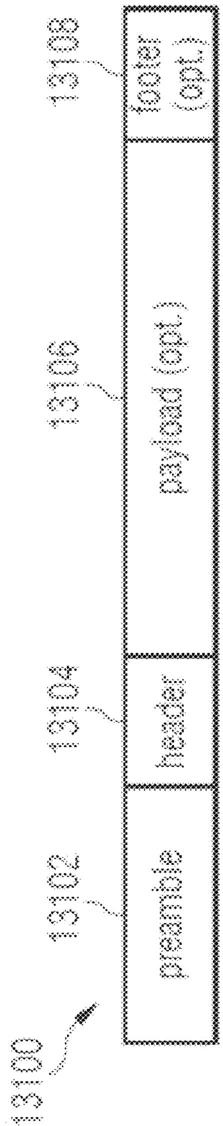
Figure 131G:
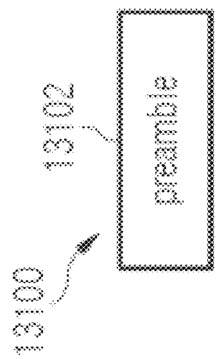

As a further example, a frame 13100 may be configured as a signaling and control frame (as illustrated, for example, in FIG. 131F and FIG. 131G). In a signaling and control frame, the payload frame portion 13106 and/or the footer frame portion 13108 may be optional. A signaling and control frame may include, for example, a single frame portion, e.g. the preamble frame portion 13102.

FIG. 132A to FIG. 132C show the mapping of a frame 13100 onto a time-domain signal 13200, in a schematic representation in accordance with various embodiments.

The frame 13100 may be mapped onto a time-domain signal 13200. Illustratively, each symbol in the frame 13100 may be associated with a corresponding signal in the time-domain (e.g., with a signal representation of the symbol, such as a pulse). The mapping (in other words, the association or the encoding) may be performed block-wise. Illustratively, each symbol block of the frame may be mapped onto a corresponding pulse sequence block of the time-domain signal 13200. The block-wise approach may simplify the encoding of the frame 13100.

The time-domain signal 13200 (illustratively, the combination of the time-domain blocks) may be considered as a frame (e.g., a light signal sequence frame) and/or it may represent the frame 13100.

By way of example, the time-domain signal 13200 may include one or more (e.g., light) pulses (e.g., a sequence of pulses, e.g. one or more pulse sequence blocks). A pulse may provide a representation of a symbol. Illustratively, depending on its amplitude and/or its duration, a pulse may represent or be associated with a different symbol. By way of example, a pulse 13102-1 with substantially zero amplitude may represent the “0”-symbol (as illustrated, for example, in FIG. 132B). As another example, a pulse 13102-2 with an amplitude greater than zero may represent the “1”-symbol (as illustrated, for example, in FIG. 132C). A pulse may have a pulse duration Ts. The pulse duration may be fixed or variable. By way of example, the duration of a pulse may be 10 ns, for example 20 ns.

FIG. 133A to FIG. 133F show a ranging system 13300 and various aspects of an operation of the ranging system 13300 in a schematic representation, in accordance with various embodiments.

The ranging system 13300 may be or may be configured as a LIDAR system (e.g., as the LIDAR Sensor System 10, for example as a Flash LIDAR Sensor System 10 or as a Scanning LIDAR Sensor System 10). The ranging system 13300 may be included, for example, in a sensor device, such as a vehicle 13326, as illustrated in FIG. 133D and FIG. 133F (e.g., a car, such as an electric car).

The ranging system 13300 may include a memory 13302. Additionally or alternatively, the ranging system 13300 may have access to the memory 13302 (e.g., the memory 13302 may be external to the ranging system), e.g. the ranging system 13300 may be communicatively coupled with the memory 13302 (e.g., the memory 13302 may be a centralized database), for example via a wireless connection.

The memory 13302 (e.g., a shift register) may store one or more reference light signal sequence frames 13304 (for example, a plurality of reference light signal sequence frames). Each reference light signal sequence frame 13304 may include one or more predefined frame portions, each having a predefined signal content type. Illustratively, the one or more reference light signal sequence frames 13304 stored in the memory 13302 may be used by the ranging system 13300 to generate a signal to be emitted (e.g., a light signal sequence to be emitted) and/or to determine whether a received signal is an own signal or an alien signal.

The one or more (e.g., the plurality of) reference light signal sequence frames 13304 stored in the memory 13302 may be encoded in accordance with a plurality of different signal modulation codes. Illustratively, a light signal sequence to be emitted by the ranging system 13300 may be stored in the memory 13302 as a reference light signal sequence frame 13304 encoded (in other words, modulated) in accordance with a signal modulation code. The plurality of signal modulation codes may be Code Division Multiple Access codes.

The one or more reference light signal sequence frames 13304 may have good auto- and/or cross-correlation properties (e.g., mutual cross-correlation properties). Illustratively, the predefined frame portions of a reference light signal sequence frame 13304 (e.g., of each of the reference light signal sequence frames 13304) may be configured such that an auto-correlation of a frame portion with a time-shifted version of that frame portion (illustratively, shifted by a time-shift other than 0) may be below a predefined auto-correlation threshold. Additionally or alternatively, the predefined frame portions of a reference light signal sequence frame 13304 (e.g., of each of the reference light signal sequence frames 13304) may be configured such that a cross-correlation of a frame portion with another (e.g., different) frame portion may be below a cross-correlation threshold.

The memory 13302 (or another memory of the ranging system 13300) may store a plurality of symbol codes 13306. The symbol codes 13306 may be used for generating (e.g., encoding) a signal sequence frame 13310, as will be described in further detail below. The plurality of symbol codes 13306 may be a plurality of different signal modulation codes, for example of Code Division Multiple Access codes.

The ranging system 13300 may include (e.g., on an emitter side) a light source 42. The light source 42 may be configured to emit light (e.g., a light signal, such as a laser signal). By way of example, the light source 42 may configured to emit light having a wavelength in the range from about 800 nm to about 1600 nm. The light source 42 may include a laser source. As an example, the light source 42 may include an array of light emitters (e.g., a VCSEL array). As another example, the light source 42 (or the ranging system 13300) may include a beam steering system (e.g., a system with a MEMS mirror).

The ranging system 13300 may include a signal generator 13308. The signal generator 13308 may be configured to generate a signal sequence frame 13310. The signal sequence frame 13310 may include one or more predefined frame portions having a predefined signal content type.

The signal sequence frame 13310 may include a plurality of symbol representation portions. Each symbol representation portion may include a signal representation of a symbol (or a plurality of signal representations, each representing a symbol). Illustratively, a signal representation in the signal sequence frame 13310 may be understood as an analog signal (e.g., a current or a voltage) representing a symbol. By way of example a first current may represent the symbol “1”, and a second current (e.g., lower than the first current) may represent the symbol “0”.

The signal generator 13308 may be configured to generate the signal sequence frame 13310 in accordance with at least one symbol code 13306 of the plurality of symbol codes 13306 stored in the memory 13302. Illustratively, the signal generator 13308 may use the symbol code 13306 to encode the symbol representation portions of the signal sequence frame 13310 (e.g., to determine the arrangement of the signal representations within the signal sequence frame 13310, e.g. within each symbol representation portion). Each symbol representation portion may be encoded individually. Alternatively, the symbol representation portions may be jointly encoded (e.g., in parallel).

The signal generator 13308 may be configured to generate the signal sequence frame 13310 in accordance with one reference light signal sequence frame 13304. Illustratively, the signal generator 13308 may be configured to generate the signal sequence frame 13310 by encoding the reference light signal sequence frame 13304 (illustratively, by applying the symbol code 13306 onto the reference light signal sequence frame 13304).

The ranging system 13300 may include a light source controller 13312 configured to control the light source 42. The light source controller 13312 may be configured to control the light source 42 to emit a light signal sequence frame 13314 in accordance with the signal sequence frame 13310. The light signal sequence frame 13314 may include one or more predefined frame portions having a predefined content type.

Illustratively, the light source controller 13312 may be configured to control the light source 42 to emit a sequence of pulses (e.g., a light signal sequence 13316) in accordance with the signal sequence frame 13310 (e.g., in accordance with the symbols represented in the signal sequence frame 13310). The light signal sequence 13316 may be understood as the light signal sequence frame 13314 or as a (e.g., time-domain) representation of the light signal sequence frame 13314. The light signal sequence 13316 may include one or more light signal sequence portions (illustratively, corresponding to the one or more frame portions of the light signal sequence frame 13314).

The light source controller 13312 may be configured to control the light source 42 to emit a single light signal sequence frame 13314 (e.g., a single light signal sequence 13316), as illustrated, for example, in FIG. 133B. Additionally, or alternatively, the light source controller 13312 may be configured to control the light source 42 to emit a plurality of light signal sequence frames 13314 (e.g., a plurality of light signal sequences 13316), as illustrated, for example, in FIG. 133C. By way of example, the ranging system may be configured to emit a first light signal sequence frame 13314-1, a second light signal sequence frame 13314-2, a third light signal sequence frame 13314-3, and a fourth light signal sequence frame 13314-4. The light signal sequence frames 13314 may be emitted with a time spacing (e.g., fixed or varying) between consecutive light signal sequence frames 13314.

The ranging system 13300 may include (e.g., on a receiver side) a sensor 52 (e.g., the LIDAR sensor 52). The sensor 52 may include one or more photo diodes (e.g., one or more avalanche photo diodes). The one or more photo diodes may be arranged in an array (e.g., a 1D-photo diode array, a 2D-photo diode array, or even a single photo diode). The one or more photo diodes may be configured to provide a received light signal sequence **13316*r* (illustratively, a received light signal sequence frame 13314*r*, in case the received light signal sequence 13316*r*** has a frame structure).

Illustratively, light may impinge onto the sensor 52 (e.g., LIDAR light, for example own ranging light or alien ranging light). The light impinging onto the sensor 52 may be, for example, the light emitted by the ranging system 13300 being reflected back towards the ranging system 13300 by an object 13328 (e.g., a tree) in the field of view of the ranging system 13300, as illustrated in FIG. 133D and FIG. 133F.

The ranging system 13300 may include one or more correlation receivers 13318. Each correlation receiver 13318 may be configured to correlate (illustratively, to evaluate a cross-correlation or to perform a cross-correlation operation) the one or more portions of the received light signal sequence **13316*r* (e.g., the one or more frame portions of a received light signal sequence frame 13314*r*) with the one or more frame portions of a reference light signal sequence frame 13304 to provide a correlation output 13320**.

Each correlation receiver 13318 may be associated with (or assigned to) one reference light signal sequence frame 13304 (e.g., different for each correlation receiver 13318). Each correlation receiver 13318 may be configured to correlate the one or more portions of the received light signal sequence **13316*r* with the one or more frame portions of the reference light signal sequence frame 13304 associated with that correlation receiver 13318 to provide the correlation result output 13320**.

The correlation result output 13320 may describe whether (or at what level of correlation) the received light signal sequence **13316*r* is correlated with the reference light signal sequence frame 13304. Illustratively, in case the received light signal sequence 13316*r* corresponds to or at least include the emitted light signal sequence 13316, the correlation result output 13320 may describe a positive match (e.g., high correlation). Otherwise, the correlation result output 13320 may describe a negative match (e.g., low correlation), for example in case the received light signal sequence 13316*r*** had been generated from another ranging system.

As illustrated, for example, in FIG. 133F, the received light signal sequence **13316*r* may be a superposition of the light signal sequence 13314-1 (or light signal sequence frame 13316-1) emitted by the ranging system 13300 (e.g., by the vehicle 13326 including the ranging system 13326) and of an alien light signal sequence 13314-2 (or light signal sequence frame 13316-2) emitted by another ranging system (e.g., by another vehicle 13330). Illustratively, the received light signal sequence 13316*r* may include a received own light signal sequence 13314-1*r* (or light signal sequence frame 13316-1*r*) and an alien light signal sequence 13314-2*r* (or light signal sequence frame 13316-2*r***).

By way of example, the own light signal and the alien light signal may also be generated by the same ranging system 13300, for example by different sub-systems of the ranging system 13300, such as different light emitters or different pixels of a light emitter of the ranging system 13300.

An example of correlation result output 13320 is illustrated in FIG. 133E. The emitted light signal sequence 13314 or light signal sequence frame 13316 may be repeated multiple times (e.g., five). The signal(s) detected at the ranging system 13300, e.g. the received light signal sequence **13314*r* or light signal sequence frame 13316*r*, may be correlated with the emitted signal(s). The correlation output 13320** may describe or include one or more (e.g., five) peaks (e.g., significant peaks) describing the presence of a cross-correlation between the emitted signal and the received signal.

Another example of correlation result output 13320 is illustrated in FIG. 133G. The emitted own light signal sequence 13314-1 or light signal sequence frame 13316-1 may be repeated multiple times (e.g., five). An emitted alien light signal sequence 13314-2 or light signal sequence frame 13316-2 may also be repeated multiple times (e.g., five). The signal(s) detected at the ranging system 13300, e.g. the received light signal sequence **13314*r* or light signal sequence frame 13316*r*, may be a superposition of the own signal and the alien signal. The correlation output 13320 may describe or include one or more (e.g., five) peaks (e.g., significant peaks) describing the presence of a cross-correlation between the emitted signal and the received signal (e.g., for the own emitted signal but not for the alien emitted signal). As an example, the alien emitted signal may be encoded with a different code, or may be generated by a different reference light signal sequence frame. Thus a crosstalk between concurrently operating ranging systems (or sub-systems of the ranging system 13300**) may be reduced or substantially eliminated.

Additionally or alternatively, the correlation output 13320 may include a correlation result frame 13322 including one or more predefined frame portions having the predefined signal content type. The correlation result frame 13322 may be or may represent the received light signal sequence **13316*r* or the received light signal sequence frame 13314*r*, for example in case of positive correlation. The correlation result frame 13322 may correspond to the reference light signal sequence frame 13304 (e.g., associated with that correlation receiver 13308**).

The correlation result frame 13322 may include a plurality of symbol representation portions. Each symbol representation portion may include a signal representation of a symbol (or a plurality of signal representations, each representing a symbol). Illustratively, a signal representation in the correlation result frame 13322 may be understood as an analog signal (e.g., a current or a voltage) representing a symbol.

The ranging system 13300 (e.g., one or more processors 13324 of the ranging system 13300) may be configured to decode the symbol representation portions of the correlation result frame 13322. Illustratively, the one or more processors 13324 may extract or interpret data carried by the correlation result frame 13322 by decoding the symbol representation portions (e.g., the signal representations) included therein. Stated in a different fashion, the one or more processors 13324 may be configured to determine one or more communication data bits using the content of the correlation result output 13320 (e.g., the correlation result frame 13322). Illustratively, the communication data bits may describe or represent the information and/or the signals included in each frame portion of the correlation result frame 13322. Each symbol representation portion may be decoded individually. Alternatively, the symbol representation portions may be jointly decoded (e.g., in parallel).

The one or more processors 13324 may be configured to determine one or more time-of-flight values using the content of the correlation result output 13320. Illustratively, the one or more processors 13324 may be configured to calculate one or more time-of-flight values from the one or more peaks included in the correlation result output 13320 (e.g., the time at which a peak is generated may correspond to a time-of-flight for the associated light signal sequence 13316).

FIG. 134A to FIG. 134C show each a ranging system 13400 in a schematic representation, in accordance with various embodiments.

The ranging system 13400 may be configured as the ranging system 13300. Illustratively, the ranging system 13400 may describe an exemplary realization of the ranging system 13300.

The ranging system 13400 may include (e.g., at the encoder side) a shift register 13402 (also referred to as init register) configured to store an indicator vector representing a reference light signal sequence frame. The shift register 13402 may be an example of the memory 13302.

The ranging system 13400 may include a Tx buffer 13404 (e.g., a circular shift register). The Tx Buffer 13404 may be configured to receive the indicator vector from the init register 13402 (e.g., after initialization, for example indicated by an init signal). The init register 13402 and the Tx Buffer 13406 may be clocked by a common clock signal (e.g., a common reference clock 13406). The Tx Buffer 13404 may be configured such that the indicator vector is circled over time.

The ranging system 13400 may include a Tx Block 13408. The Tx Block 13408 may be configured to create a signal representation (e.g., a pulse) according to the current element of the indicator vector (e.g., according to an input received from the Tx Buffer 13404).

The ranging system 13400 (e.g., the Tx Block 13408) may include a symbol shaping stage 13410. The symbol shaping stage 13410 may be configured to determine the pulse shape, for example based on a pulse shape filter or using a digitized pulse shape.

A combination of the Tx Buffer 13404 and the symbol shaping stage 13410 may be an example of the signal generator 13308.

The ranging system 13400 (e.g., the Tx Block 13408) may include a driver 13412 (e.g., an analog driver). The driver 13412 may be coupled with a light emitter 13414 (e.g., the light source 42, such as a laser). The driver 13412 may be configured to control the light emitter 13414 to emit light in accordance with the received signal representation or signal representation sequence. The driver 13412 may be an example of the light source controller 13312.

The ranging system 13400 may include (e.g., at the detector side) a Rx Block 13416. The Rx Block 13416 may be configured to capture a received light pulse sequence. The Rx Block 13416 may include an opto electronic detector 13418, for example including a photo diode (PD), or an avalanche photo diode (APD). The Rx Block 13416 may include an amplifier 13420 (e.g., a Transimpedance Amplifier (TIA)), configured to amplify the received signal. The Rx Block 13416 may include a signal converter 13422 (e.g., an Analog-to-Digital Converter (ADC)), configured to convert the signal into a digitized signal. The Rx Block 13416 may be configured to output an indicator vector representing the detection (e.g., representing the received pulse sequence). The Rx Block 13416 may be an example for the sensor 52 (e.g., for one or more components included in the sensor 52).

The ranging system 13400 may include a Rx Buffer 13424 (e.g., a shift register), configured to receive the output of the Rx Block 13416 (e.g., loaded element by element).

The ranging system 13400 may include a correlation receiver 13426. The correlation receiver 13426 may have access to both the Tx Buffer 13404 and the Rx Buffer 13424. The correlation receiver 13426 may be configured to determine the correlation between the content of both registers.

Additionally or alternatively, the correlation receiver 13426 may be configured to receive measured and/or sampled data as input (as illustrated, for example, in FIG. 134B), for example by means of an additional Rx Block 13428 on the emitter side and a Tx Sample Buffer 13430.

Additionally or alternatively, the correlation receiver 13426 may be configured to receive tapped sampled data as input (as illustrated, for example, in FIG. 134C), for example by means of a Tx Sample Buffer 13430.

The ranging system 13400 may include a peak detection system 13432. The peak detection system 13432 may be configured to receive the output 13434 of the correlation receiver 13426. The peak detection system 13432 may be configured to determine a time-of-flight based on one or more identified peaks in the correlation output 13434. The peak detection system 13432 may be configured to determine one or more communication data bits from the correlation output 13434. The peak detection system 13432 may be an example for the one or more processors 13324. The correlation output 13434 may be an example for the correlation result output 13320.

FIG. 135A to FIG. 135F show each one or more portions of the ranging system 13400 in a schematic representation, in accordance with various embodiments.

FIG. 135G shows a codebook 13508 in a schematic representation, in accordance with various embodiments.

As illustrated in FIG. 135A and FIG. 135B, the ranging system 13400 may be configured to emit a plurality of pulse sequences directly one after another. In this configuration, the init register 13402 may be configured to store two (or more) signal sequence frames (e.g., a sequence A and a sequence B), for example in a concatenated fashion. The concatenation of the two sequences may form concatenated sequence AB. The ranging system 13402 may include additional Tx Buffers 13404. A first Tx Buffer 13502-1 may be configured to contain the currently shifted version of the concatenated sequence AB. A second Tx Buffer 13502-2 may be configured to contain the currently shifted version of sequence A. A third Tx Buffer 13502-3 may be configured to contain the currently shifted version of sequence B. After initialization (init signal) the Tx Block 13408 may be configured to emit the concatenated sequence AB. The Rx Block 13402 may be configured to receive the concatenated sequence AB. The Rx Buffer 13424 may be configured to store the received concatenated sequence AB.

The ranging system 13400 may include additional correlation receivers, for example arranged in parallel. The Rx Block 13402 may be configured to provide its output to the plurality of correlation receivers. Each correlation receiver may be configured to determine the correlation between the Rx Buffer and a respective Tx Buffer, and provide an output to the peak detection system 13432. By way of example, the ranging system 13400 may include a first correlation receiver 13504-1 associated with the first Tx Buffer 13502-1, and providing a first correlation output 13506-1. The ranging system 13400 may include a second correlation receiver 13504-2 associated with the second Tx Buffer 13502-2, and providing a second correlation output 13506-2. The ranging system 13400 may include a third correlation receiver 13504-3 associated with the third Tx Buffer 13502-3, and providing a third correlation output 13506-3.

Each correlation receiver may be configured to provide the output (e.g., the cross-correlation output) to the peak detection system 13432. The peak detection system 13432 may be configured to determine the time lag based on the identified one or more peaks in the correlation results provided by the correlation receivers. The determined lag may represent the ToF of the concatenated sequence AB, of the sequence A, and of the sequence B, respectively.

As illustrated in FIG. 135C and FIG. 135D the ranging system 13400 may have data communication capabilities. Illustratively, a data encoding scheme may be implemented in combination with the frame-like structure of the emitted light signal.

A memory of the ranging system 13400 (e.g., the memory 13302) or a database may store information mapping a pulse sequence (e.g., a light signal sequence) with corresponding data (e.g., with corresponding code sequences, e.g. symbol sequences). The memory may for example be or store a codebook (an exemplary codebook 13508 is illustrated, for example, in FIG. 135G). The codebook 13508 may provide an output sequence (e.g., a pulse sequence) for each possible input sequence (e.g., code sequence). Illustratively, for encoding certain data in a pulse sequence, the ranging system 13400 may retrieve (and use) the corresponding code sequence from the codebook 13508. The codebook 13508 may be "standardized" among participants (e.g., participants that intend to communicate with one another).

At the encoder side, the Tx Buffer 13404 may be configured to receive code sequences. The Tx Block 13408 may be configured to emit the code sequences. At the decoder side, the Rx Block 13416 (e.g., the Rx Buffer 13424) may be configured to receive the detected signal. The content of the Rx Buffer 13424 may be used for decoding. By way of example, the detected signal (e.g., the detected sequence) may be an attenuated version of the emitted signal (e.g., the emitted sequence).

At the decoder side, the ranging system 13400 may include a bank of parallel correlation receivers 13504-1, 13504-2, . . . , 13504-*n*. Each correlation receiver may be configured to receive the input signal (e.g., an input sequence, e.g. the content or the output of Rx Buffer 13424). Each correlation receiver may be configured to correlate the received input with a code sequence in the codebook (e.g., a reference code sequence associated with that correlation receiver). By way of example, the ranging system 13400 may include one correlation receiver for each sequence stored in the codebook.

In this configuration, the output of a correlation receiver may include at most one (in other words, zero or one) significant peak. A correlation receiver may be configured to provide an output including a significant peak in case the input signal is encoded (or was originally encoded) by means of the reference code sequence.

Each correlation receiver may be configured to provide the respective correlation result output to the peak detection system 13432. The peak detection system 13432 may be configured to perform inverse mapping (e.g., decoding). Illustratively, based on the found peaks (e.g., significant peaks), the peak detection system 13432 may be configured to perform inverse mapping back to the data encoded in the pulse sequence. The peak detection system 13432 may be configured to output the (e.g., decoded) data symbols, e.g. as decoding result.

Figure 136A:
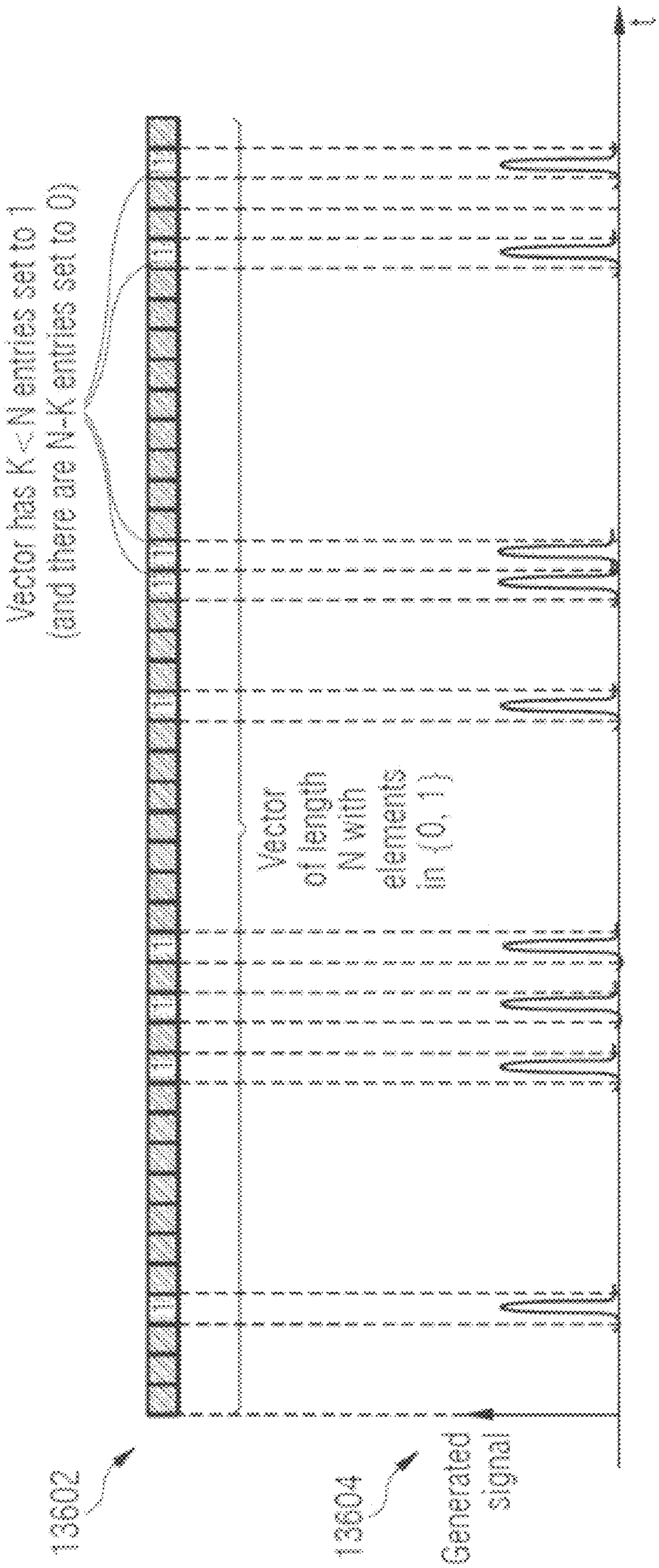
Figure 136B:
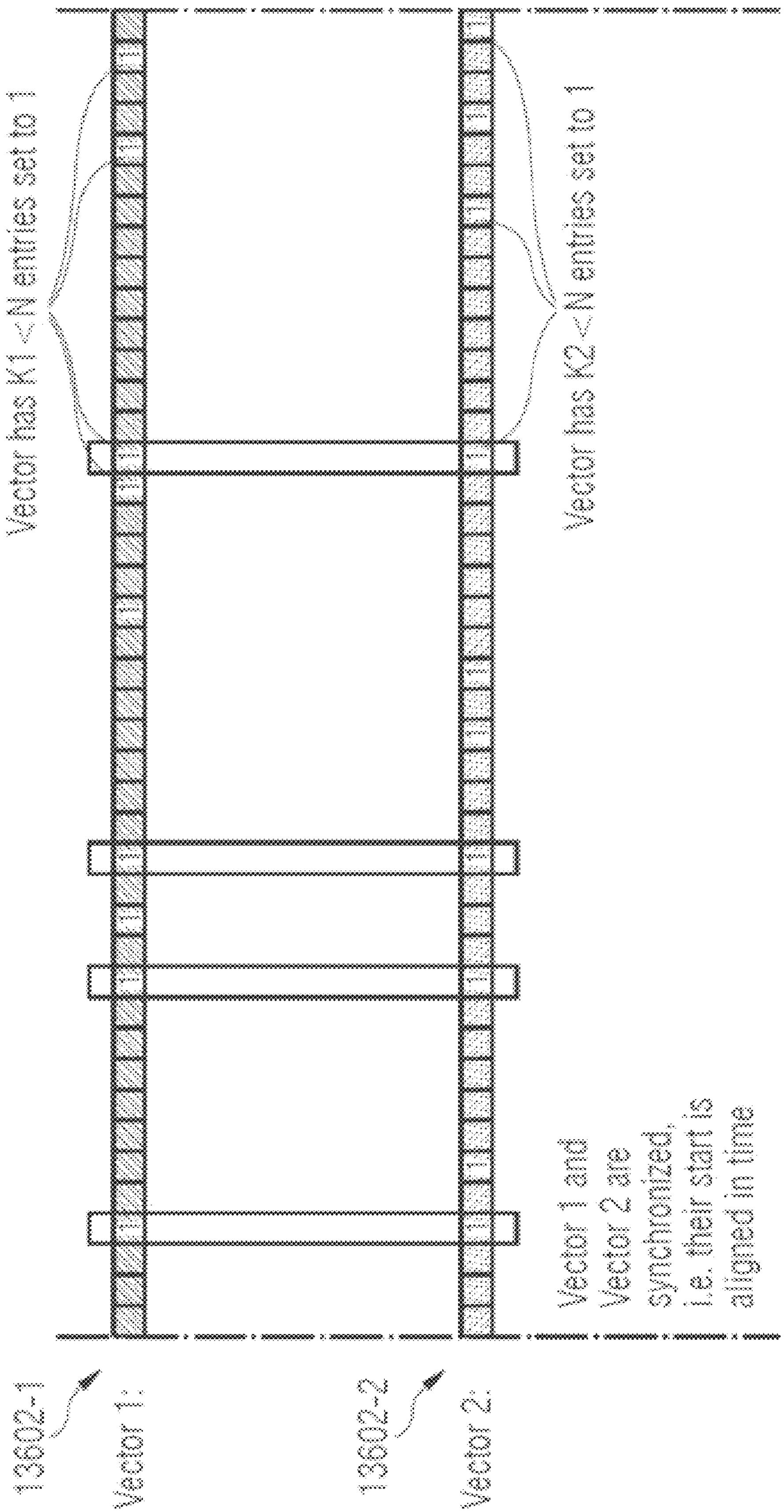

As illustrated in FIG. 135E and FIG. 135F, the ranging system 13400 may be configured according to a combination of the approaches (e.g., the operations) described above (e.g., in relation to FIG. 135A to FIG. 135B, and to FIG. 136 A to FIG. 136B). Illustratively, the various components of the ranging system 13400 may be used (and configured) for implementing ranging detection and data transmission.

FIG. 136A to FIG. 136D show various properties associated with an indicator vector 13602 in accordance with various embodiments.

An indicator vector (e.g., a reference light signal sequence frame) 13602 may include N elements. The indicator vector 13602 may include K elements set to 1 and N-K elements set to 0. A pulse sequence 13604 may be generated in accordance with the indicator vector 13602

An overlap, E, between a first indicator vector 13602-1 and a second indicator vector 13602-2 may represent the number of vector elements that are set to 1 in both vectors at the same position (as illustrated, for example, in FIG. 136B).

Figure 136C:
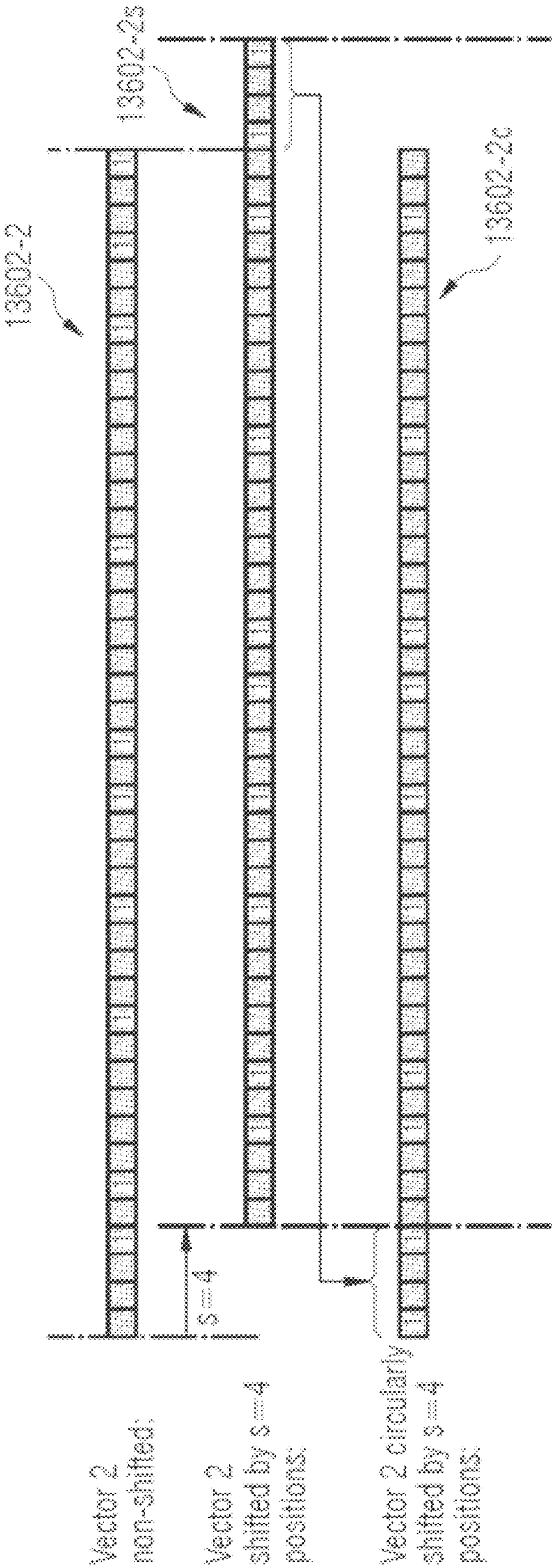

A shift, S, between two indicator vectors may describe how far to equal the indicator vectors are shifted. FIG. 136C shows, for example, a shift S=4 between the second indicator vector 13602-2 and its shifted version 13602-2*s* or its circularly shifted version 13602-2*c*.

Figure 136D:
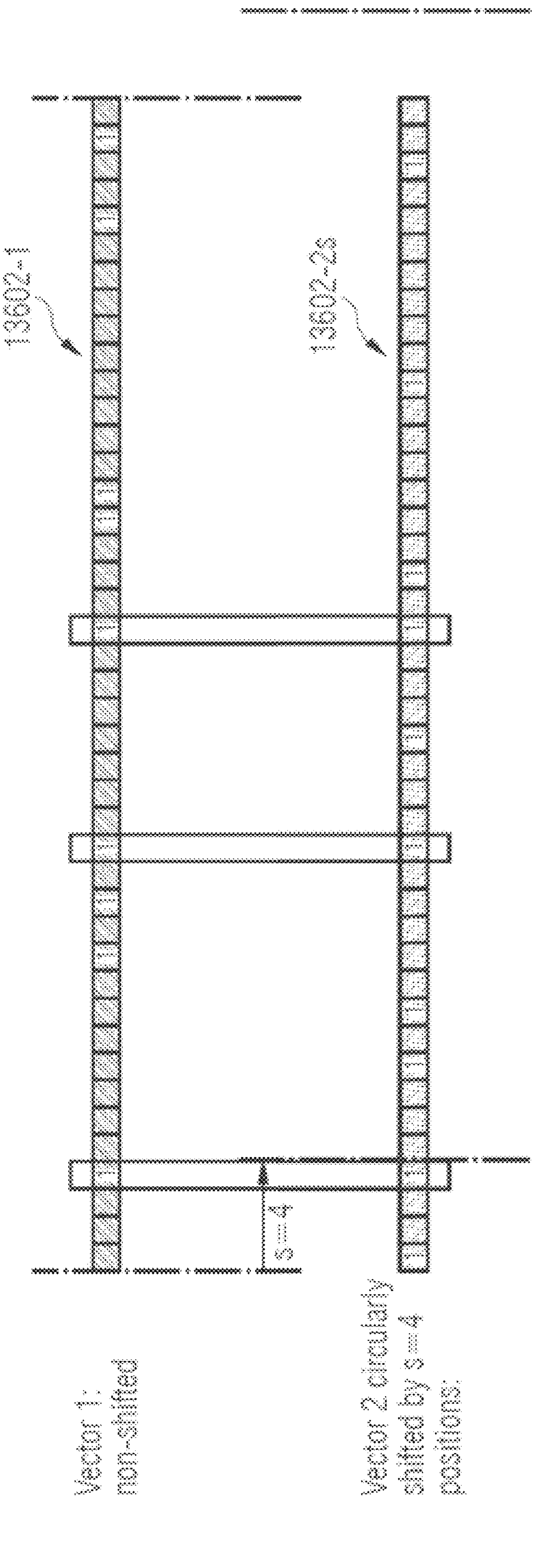

The overlap E may be defined between a vector and the shifted version of another vector, as illustrated, for example, in FIG. 136D between the first vector 13602-1 and the shifted second vector 13602-2.

FIG. 137 shows a flow diagram an algorithm 13700 for choosing one or more indicator vectors 13602.

The algorithm 13700 may be configured to generate a set of indicator vectors.

The algorithm 13700 may include a "start", in 13702. The algorithm may include, in 13704, creating an empty set of indicator vectors (also referred to as test set).

The algorithm 13700 may include, in 13706, creating a candidate indicator vector (e.g., randomly constructing a candidate vector of length N containing K ones).

The algorithm 13700 may include, in 13708, determining a maximum overlap of the candidate vector with itself (e.g., over all possible shifts).

The algorithm 13700 may include, in 13710, determining whether the candidate indicator vector has passed an autocorrelation test (e.g., based on the results obtained in 13708). If not, the algorithm 13700 may discard the indicator vector and create a new candidate indicator vector (e.g., go back to 13706).

The algorithm may include, in 13712, determining a maximum overlap of the candidate vector with all the other vectors in the test set (if present) and over all possible shifts.

The algorithm 13700 may include determining, in 13714, whether the candidate indicator vector has passed a cross-correlation test (e.g., based on the results obtained in 13712). The algorithm 13700 may include discarding the indicator vector and creating a new candidate indicator vector (e.g., go back to 13706) in case the candidate indicator vector has failed the cross-correlation test.

The algorithm 13700 may include, in 13716, adding the indicator vector to the test set (illustratively, in case the candidate indicator vector has passed both tests).

The algorithm 13700 may include, in 13718, determining whether the test set has reached a desired size. The algorithm may include a stop, in 13720, in case the test set has reached the desired size. The process may be repeated with a new candidate indicator vector (e.g., the algorithm may go back to 13706) in case the test set has not reached the desired size.

In the following, various aspects of this disclosure will be illustrated:

Example 1w is a LIDAR Sensor System. The LIDAR Sensor System may include a memory storing one or more reference light signal sequence frames. Each reference light signal sequence frame may include one or more predefined frame portions. Each predefined frame portion may have a predefined signal content type. The LIDAR Sensor System may include a sensor including one or more photo diodes configured to provide a received light signal sequence. The received light signal sequence may include one or more light signal sequence portions. The LIDAR Sensor System may include one or more correlation receivers. Each correlation receiver may be associated with at least one reference light signal sequence frame. Each correlation receiver may be configured to correlate the one or more light signal sequence portions of the received light signal sequence with the one or more predefined frame portions of the associated reference light signal sequence frame to generate a correlation result output.

In Example 2w, the subject-matter of example 1w can optionally include that the correlation result output includes a correlation result frame including one or more predefined frame portions having the predefined signal content type.

In Example 3w, the subject-matter of example 2w can optionally include that the correlation result frame corresponds to the reference light signal sequence frame associated with the respective correlation receiver.

In Example 4w, the subject-matter of any one of examples 2w or 3w can optionally include that the correlation result frame includes a plurality of symbol representation portions, each symbol representation portion including a signal representation of a symbol, each symbol representing one or more bits.

In Example 5w, the subject-matter of any one of examples 2w to 4w can optionally include that the correlation result frame includes a plurality of symbol representation portions, each symbol representation portion including a plurality of signal representations, each signal representation being a signal representation of a symbol, each symbol representing one or more bits.

In Example 6w, the subject-matter of example 5w can optionally include that each symbol representation portions is individually decoded.

In Example 7w, the subject-matter of example 5w can optionally include that the symbol representation portions are jointly decoded.

In Example 8w, the subject-matter of any one of examples 2w to 7w can optionally include that the correlation result frame includes a preamble frame portion including acquisition signals and/or ranging signals and/or synchronization signals.

In Example 9w, the subject-matter of any one of examples 2w to 8w can optionally include that the correlation result frame includes a header frame portion including control data.

In Example 10w, the subject-matter of any one of examples 2w to 9w can optionally include that the correlation result frame includes a is payload frame portion including identification signals and/or control signals.

In Example 11w, the subject-matter of any one of examples 2w to 10w can optionally include that the correlation result frame includes a footer frame portion including frame integrity test signals and/or collision detection signals.

In Example 12w, the subject-matter of any one of examples 2w to 11w can optionally include that the correlation result frame has a predefined length or a variable length with a minimum length and a maximum length.

In Example 13w, the subject-matter of any one of examples 1w to 12w can optionally include that the memory stores a plurality of reference light signal sequence frames, each including one or more predefined frame portions.

In Example 14w, the subject-matter of any one of examples 1w to 13w can optionally include that the memory stores a plurality of reference light signal sequence frames being encoded in accordance with a plurality of different signal modulation codes.

In Example 15w, the subject-matter of example 14w can optionally include that the plurality of different signal modulation codes are Code Division Multiple Access codes.

In Example 16w, the subject-matter of any one of examples 1w to 15w further can optionally include one or more processors configured to determine one or more time-of-flight values using the content of the correlation result output.

In Example 17w, the subject-matter of any one of examples 1 to 16 can optionally include one or more processors configured to determine one or more communication data bits using the content of the correlation result output.

In Example 18w, the subject-matter of any one of examples 1w to 17w, can optionally include that the predefined frame portions of the one or more reference light signal sequence frames include a sequence of pulses.

In Example 19w, the subject-matter of any one of examples 1w to 18w can optionally include that the predefined frame portions of the one or more reference light signal sequence frames are configured such that an auto-correlation of a frame portion with a time-shifted version of the frame portion is below a predefined auto-correlation threshold.

In Example 20w, the subject-matter of any one of examples 1w to 19w can optionally include that the predefined frame portions of the one or more reference light signal sequence frames are configured such that a cross-correlation of a frame portion with another frame portion is below a predefined cross-correlation threshold.

In Example 21w, the subject-matter of any one of examples 1w to 20w can optionally include that the LIDAR Sensor System is configured as a Flash LIDAR Sensor System.

In Example 22w, the subject-matter of any one of examples 1w to 21w can optionally include that the LIDAR Sensor System is configured as a Scanning LIDAR Sensor System.

Example 23w is a LIDAR Sensor System. The LIDAR Sensor System may include a light source configured to emit a light signal. The LIDAR Sensor System may include a signal generator configured to generate a signal sequence frame including one or more predefined frame portions having a predefined signal content type. The LIDAR Sensor System may include a light source controller configured to control the light source to emit a light signal sequence frame in accordance with the signal sequence frame, the light signal sequence frame including one or more predefined frame portions having the predefined signal content type.

In Example 24w, the subject-matter of example 23w can optionally include that the light signal sequence frame includes a plurality of symbol representation portions, each symbol representation portion including a signal representation of a symbol, each symbol representing one or more bits.

In Example 25w, the subject-matter of any one of examples 23w or 24w can optionally include that the light signal sequence frame includes a plurality of symbol representation portions, each symbol representation portion including a plurality of signal representations, each symbol representation representing a symbol, each symbol representing one or more bits.

In Example 26w, the subject-matter of example 25w can optionally include that each symbol representation portion is individually encoded.

In Example 27w, the subject-matter of example 26w can optionally include that the symbol representation portions are jointly encoded.

In Example 28w, the subject-matter of any one of examples 23w to 27w can optionally include that the light signal sequence frame includes a preamble frame portion including acquisition signals and/or synchronization signals.

In Example 29w, the subject-matter of any one of examples 23w to 28w can optionally include that the light signal sequence frame includes a header frame portion including control data.

In Example 30w, the subject-matter of any one of examples 23w to 29w can optionally include that the light signal sequence frame includes a payload frame portion including identification signals and/or control signals.

In Example 31w, the subject-matter of any one of examples 23w to 30w can optionally include that the light signal sequence frame includes a footer frame portion including frame integrity test signals and/or collision detection signals.

In Example 32w, the subject-matter of any one of examples 23w to 31w can optionally include that the light signal sequence frame has a predefined length or a variable length with a minimum length and a maximum length.

In Example 33w, the subject-matter of any one of examples 23w to 32w can optionally include a memory storing a plurality of symbol codes. The signal generator may be configured to generate the signal sequence frame in accordance with at least one symbol code of the plurality of symbol codes.

In Example 34w, the subject-matter of example 33w can optionally include that the plurality of symbol codes is a plurality of different signal modulation codes.

In Example 35w, the subject-matter of example 34w can optionally include that the plurality of different signal modulation codes are Code Division Multiple Access codes.

In Example 36w, the subject-matter of any one of examples 23w to 35w can optionally include that the LIDAR Sensor System is configured as a Flash LIDAR Sensor System.

In Example 37w, the subject-matter of any one of examples 23w to 36w can optionally include that the LIDAR Sensor System is configured as a Scanning LIDAR Sensor System.

Example 38w is a vehicle, including one or more LIDAR Sensor Systems according to any one of examples 1w to 37w.

In Example 39w, the subject-matter of example 38w can optionally include a plurality of LIDAR Sensor Systems according to any one of examples 1w to 37w. A signal generator of a LIDAR Sensor System may be configured to generate a signal sequence frame at least partially different from a signal sequence frame generated by a signal generator of another LIDAR Sensor System.

In Example 40w, the subject-matter of example 39w can optionally include that each signal generator is configured to generate a signal sequence frame such that an auto-correlation of the signal sequence frame with a time-shifted version of the signal sequence frame is below a predefined auto-correlation threshold.

In Example 41w, the subject-matter of any one of examples 39w or 40w can optionally include that each signal generator is configured to generate a signal sequence frame such that a correlation of the signal sequence frame with a signal sequence frame generated by another signal generator is below a predefined cross-correlation threshold.

Example 42w is a method of operating a LIDAR Sensor System. The method may include a memory storing one or more reference light signal sequence frames, each reference light signal sequence frame including one or more predefined frame portions having a predefined signal content type. The method may include a sensor including one or more photo diodes and providing a received light signal sequence, the received light signal sequence including one or more light signal sequence portions. The method may include correlating the one or more light signal sequence portions of the received light signal sequence with the one or more predefined frame portions of the one or more reference light signal sequence frames to generate a correlation result output.

In Example 43w, the subject-matter of example 42w can optionally include that the correlation result output includes a correlation result frame including one or more predefined frame portions having the predefined signal content type.

In Example 44w, the subject-matter of example 43w can optionally include that the correlation result frame includes a plurality of symbol representation portions, each symbol representation portion including a signal representation of a symbol, each symbol representing one or more bits.

In Example 45w, the subject-matter of any one of examples 43w or 44w can optionally include that the correlation result frame includes a plurality of symbol representation portions, each symbol representation portion including a plurality of signal representations, each symbol representation representing a symbol, each symbol representing one or more bits.

In Example 46w, the subject-matter of example 45w can optionally include that each symbol representation portion is individually decoded.

In Example 47w, the subject-matter of example 45w can optionally include that the symbol representation portions are jointly decoded.

In Example 48w, the subject-matter of any one of examples 43w to 47w can optionally include that the correlation result frame includes a preamble frame portion including acquisition signals and/or ranging signals and/or synchronization signals.

In Example 49w, the subject-matter of any one of examples 43w to 48w can optionally include that the correlation result frame includes a header frame portion including control data.

In Example 50w, the subject-matter of any one of examples 43w to 49w can optionally include that the correlation result frame includes a is payload frame portion including identification signals and/or control signals.

In Example 51w, the subject-matter of any one of examples 43w to 50w can optionally include that the correlation result frame includes a footer frame portion including frame integrity test signals and/or collision detection signals.

In Example 52w, the subject-matter of any one of examples 43w to 51w can optionally include that the correlation result frame has a predefined length or a variable length with a minimum length and a maximum length.

In Example 53w, the subject-matter of any one of examples 42w to 52w can optionally include that the memory stores a plurality of reference light signal sequence frames, each including one or more predefined frame portions.

In Example 54w, the subject-matter of any one of examples 42w to 53w can optionally include that the memory stores a plurality of reference light signal sequence frames being encoded in accordance with a plurality of different signal modulation codes.

In Example 55w, the subject-matter of example 54w can optionally include that the plurality of different signal modulation codes are Code Division Multiple Access codes.

In Example 56w, the subject-matter of any one of examples 42w to 55w can optionally include determining one or more time-of-flight values using the content of the correlation result output.

In Example 57w, the subject-matter of any one of examples 42w to 56w can optionally include determining one or more communication data bits using the content of the correlation result output.

In Example 58w, the subject-matter of any one of examples 42w to 57w can optionally include the predefined frame portions of the one or more reference light signal sequence frames include a sequence of pulses.

In Example 59w, the subject-matter of any one of examples 42w to 58w can optionally include that the predefined frame portions of the one or more reference light signal sequence frames are configured such that an auto-correlation of a frame portion with a time-shifted version of the frame portion is below a predefined auto-correlation threshold.

In Example 60w, the subject-matter of any one of examples 42w to 59w can optionally include that the predefined frame portions of the one or more reference light signal sequence frames are configured such that a cross-correlation of a frame portion with another frame portion is below a predefined cross-correlation threshold.

In Example 61w, the subject-matter of any one of examples 42w to 60w can optionally include that the LIDAR Sensor System is configured as a Flash LIDAR Sensor System.

In Example 62w, the subject-matter of any one of examples 42w to 61w can optionally include that the LIDAR Sensor System is configured as a Scanning LIDAR Sensor System.

Example 63w is a method of operating a LIDAR Sensor System. The method may include emitting a light signal. The method may include generating a signal sequence frame including one or more predefined frame portions having a predefined signal content type. The method may include controlling the emission of a light signal sequence frame in accordance with the signal sequence frame, the light signal sequence frame including one or more predefined frame portions having the predefined signal content type.

In Example 64w, the subject-matter of example 63w can optionally include that the light signal sequence frame includes a plurality of symbol representation portions, each symbol representation portion including a signal representation of a symbol, each symbol representing one or more bits.

In Example 65w, the subject-matter of any one of examples 63w or 64w can optionally include that the light signal sequence frame includes a plurality of symbol representation portions, each symbol representation portion including a plurality of signal representations, each symbol representation representing a symbol, each symbol representing one or more bits.

In Example 66w, the subject-matter of example 65w can optionally include that each symbol representation portion is individually encoded.

In Example 67w, the subject-matter of example 65w can optionally include that the symbol representation portions are jointly encoded.

In Example 68w, the subject-matter of any one of examples 63w to 67w can optionally include that the light signal sequence frame includes a preamble frame portion including acquisition signals and/or synchronization signals.

In Example 69w, the subject-matter of any one of examples 63w to 68w can optionally include that the light signal sequence frame includes a header frame portion including control data.

In Example 70w, the subject-matter of any one of examples 63w to 69w can optionally include that the light signal sequence frame includes a payload frame portion including identification signals and/or control signals.

In Example 71w, the subject-matter of any one of examples 63w to 70w can optionally include that the light signal sequence frame includes a footer frame portion including frame integrity test signals and/or collision detection signals.

In Example 72w, the subject-matter of any one of examples 63w to 71w can optionally include that the light signal sequence frame has a predefined length or a variable length with a minimum length and a maximum length.

In Example 73w, the subject-matter of any one of examples 63w to 72w can optionally include a memory storing a plurality of symbol codes. The signal sequence frame may be generated in accordance with at least one symbol code of the plurality of symbol codes.

In Example 74w, the subject-matter of example 73w can optionally include that the plurality of symbol codes is a plurality of different signal modulation codes.

In Example 75w, the subject-matter of example 74w can optionally include that the plurality of different signal modulation codes are Code Division Multiple Access codes.

In Example 76w, the subject-matter of any one of examples 63w to 75w can optionally include that the LIDAR Sensor System is configured as a Flash LIDAR Sensor System.

In Example 77w, the subject-matter of any one of examples 63w to 76w can optionally include that the LIDAR Sensor System is configured as a Scanning LIDAR Sensor System.

Example 78w is a method of operating a LIDAR Sensor System within a vehicle, the method including a method of operating a LIDAR Sensor Systems of any one of examples 43w to 77w.

Various embodiments may be based on the implementation of digital communication concepts into a ranging system (e.g., into a LIDAR system, such as the LIDAR Sensor System 10). Illustratively, from a system and component perspective a ranging system may be used for data transmission. The data may be encoded in a LIDAR signal (e.g., a light signal). Stated in a different fashion, the LIDAR signal may be configured to carry data or information (e.g., in addition to the ranging capabilities of the LIDAR signal). The data (e.g., the information) may be transmitted in a unicast, multicast, or broadcast fashion. Illustratively, a LIDAR signal described herein may include a ranging signal (e.g., may be configured to have ranging capabilities) and/or a communication signal (e.g., may be configured to have data communication capabilities).

Conventional ranging systems may be not-coordinated (e.g., ranging systems of different participants, such as traffic participants, for example different vehicles, such as different cars). The same may be true for the respective conventional ranging schemes. Illustratively, each participant or each ranging system may operate without taking into consideration the other participants (e.g., in the same area). There may be no harmonized standard for medium access (e.g., LIDAR medium access) and/or error-control. This may lead to signal collisions (e.g., ranging signal collisions, illustratively interference or noise generated by multiple ranging signals being emitted/received substantially at the same time) The signal collisions may negatively affect ranging performance (e.g., object detection) or may even lead to system "black-outs". The lack of coordination may affect the reliability of an exchange of data or signaling and control information (e.g., among ranging systems).

In various embodiments, a medium access scheme for a ranging system (e.g., a LIDAR system) may be provided. The medium access scheme described herein (also referred to as ranging medium access scheme, LIDAR medium access scheme, or light emission scheme) may be provided for controlling the operation of a ranging system. The emission of a LIDAR signal from a ranging system may be controlled such that collision with other signals from system-external sources may be reduced or substantially eliminated (e.g., with other LIDAR signals from other ranging systems, or with other types of signals). The LIDAR signal may be configured (e.g., encoded or electrically modulated) such that error control on the content of the LIDAR signal may be provided.

The ranging medium access scheme may be or may be configured as a persistency scheme (illustratively, similar to a persistent CSMA scheme, e.g. a p-persistent CSMA scheme). The medium access scheme described herein may be configured to coordinate the access to the medium (illustratively, to the ranging channel, e.g. the LIDAR channel) among several participants. This may reduce or minimize the number of collisions of LIDAR signals on the medium, and/or may provide as many non-interfering transmissions as possible. Such effect may be provided for any type of signal, e.g. a ranging signal, a signal used for data communication, or a signal for conveying signaling information or control messages. The medium access scheme described herein may be configured to be fully distributed (e.g., to be implemented without a local or centralized coordination entity). Thus, the medium access scheme described herein may be suitable for the automotive context (e.g., the scheme may provide for high vehicular mobility).

According to the ranging medium access scheme, activity sensing on the medium (e.g., with randomized waiting times) and/or distributed coordination may be provided in a ranging system. Activity sensing and/or distributed coordination may be provided for collision avoidance (e.g., for reducing or eliminating signal collision, for example in ranging, data communication, and signaling).

The ranging system may be configured for activity sensing. Illustratively, the ranging system may be configured to take into account the presence of one or more other signals (e.g., an alien or extraneous LIDAR signal emitted by another ranging system) before or during the emission of its own LIDAR signal. Activity sensing may provide the effect of proactively preventing signal collisions from happening when accessing the medium (e.g., it may be less probable that the own LIDAR signal will disturb the signal of another participant).

A contention-based back-off mechanism may be provided for distributed coordination. The distributed coordination scheme described herein may increase the probability of a successful distance measurement (illustratively, a successful transmission of one or more LIDAR signals, e.g. with ranging capabilities). The distributed coordination scheme may provide lower latency and/or shorter waiting times for all participants as a whole. This effect may be provided also in case data communication and/or signaling information is added on-top of the ranging operation (e.g., by configuring the emitted LIDAR signal as a frame, as described in further detail below).

Illustratively, the medium access scheme for a ranging system may be similar to one or more digital communication schemes, such as carrier sense multiple access (CSMA) and distributed coordination function (DCF), e.g. as adopted in the IEEE 802.11 standard. By way of example, a ranging system configured according to the medium access scheme described herein may be configured to listen on the medium to determine (e.g., to evaluate) whether there is activity before (and/or during) emitting a LIDAR signal (e.g., to determine whether other signals are or may be present on the medium, e.g. in the air). Thus, the ranging system may be configured to identify crosstalk (and/or the presence of conflicting signals) or other possible sources of crosstalk in the medium, e.g. from other ranging systems.

In various embodiments, the ranging system may be configured to listen to the ranging channel until the channel is sensed idle (e.g., to keep determining whether there is activity on the medium until no activity is detected). The ranging system may be configured to transmit (e.g., emit light, e.g. a light signal) as soon as the channel is sensed idle (e.g., to immediately start transmitting data). Such configuration may be referred to as 1-persistent scheme. Illustratively, the ranging system may be configured in a similar manner as 1-persistent CSMA (also referred to as 1-persistent CSMA scheme) for a communication system (e.g., a station). The 1-persistent CSMA scheme may be described as a selfish scheme (illustratively transmission may start immediately in case or as soon as the medium is free). However, the 1-persistent CSMA scheme may be prone to signal collisions (illustratively, crosstalk) in case two or more 1-persistent participants are waiting (illustratively, the waiting participants will start transmitting approximately at the same time). Furthermore, the 1-persistent CSMA scheme may be prone to signal collisions due to the fact that a signal emitted by a waiting system may be within the measurement of the system that was previously using the medium (thus affecting its measurement).

In various embodiments, the ranging system may be configured to wait with the transmission (illustratively, to postpone the transmission) for an amount of time (e.g., a random amount of time) drawn from a probability distribution in case the medium is busy (e.g., in case the ranging system determines activity on the medium). The ranging system may be configured to transmit in case the medium is idle after the waiting time has passed, or to wait for another amount of time in case the medium is still busy. The use of random delays (e.g., random waiting times) may reduce the probability of collisions. Illustratively, the ranging system may be configured in a similar manner as non-persistent CSMA (also referred to as non-persistent CSMA scheme) for a communication system. However, in the non-persistent CSMA scheme, the medium may remain unused following the end of the transmission, even in case one or more participants are waiting to transmit. Illustratively, there may be unnecessary waiting times.

In various embodiments, the ranging system may be configured to transmit with a probability P, in case the medium is idle (and/or to postpone the transmission by one time slot with probability 1−P). The time slot may be chosen to be a multiple of the propagation delay (e.g., the time slot may be chosen to be equal to the maximum propagation delay). Illustratively, the ranging system may be configured to determine whether the medium is busy and to continue listening until the medium is idle. The ranging system may be configured to transmit with probability P and/or to delay one time slot with probability 1−P as soon as the medium is idle. Illustratively, the ranging system may be configured in a similar manner as p-persistent CSMA (also referred to as p-persistent CSMA scheme), e.g. may combine aspects of the 1-persistent CSMA and of the non-persistent CSMA.

The ranging system may be configured to determine (e.g., to generate or to select) a probability outcome, X (e.g., a random number). The ranging system may be configured to compare the probability outcome X with the probability P. The ranging system may be configured to transmit in case the probability outcome is equal to or smaller than the probability (X<=P). The ranging system may be configured not to transmit (e.g., to wait, for example a time slot) in case the probability outcome is greater than the probability (X>P). A new probability outcome may be determined at each cycle (e.g., for each decision).

In various embodiments, the ranging system may be configured (Step 1) to determine whether the medium is busy. The ranging system may be configured to continue listening until the medium is idle. The ranging system may be configured (Step 2) to wait one time slot in case the medium is idle (e.g., to delay transmission for the duration of one time slot). The ranging system may be configured (Step 3*a*) to determine whether the medium is still idle after the time slot has passed (illustratively, to determine whether the is medium has become busy again). In case the ranging system determines that the medium is (still) idle, the ranging system may be configured (Step 3*b*) to transmit (e.g., to emit a LIDAR signal, for example including a ranging signal and/or a communication signal) with probability P, and/or to delay (e.g., wait) one time slot with probability 1−P. In case transmission is (again) delayed, the ranging system may be configured to repeat determining the availability of the medium and the transmission with probability P and/or the waiting with probability 1−P, illustratively, the ranging system may be configured to repeat the Step 3*a* and Step 3*b*. This may be referred to as enforced waiting persistent scheme.

An enforced waiting time (illustratively, an enforced waiting for at least one time slot) may be provided, for example by modifying the probability outcome. Illustratively, after the medium becomes idle, the probability outcome X may be configured such that waiting may be enforced. By way of example, X may be pre-assigned and may be greater than P (for example X may be equal to 2).

The time slot (illustratively, the minimum waiting time) may be determined or selected according to one or more properties of the ranging system. By way of example, the time slot may be selected in accordance with the time it takes for the LIDAR signal to propagate to an object and back (illustratively, in accordance with a maximum time-of-flight of the ranging system). A maximum time $t_{dmax}$ may be determined for the LIDAR signal to propagate a maximum detection range $d_{max}$ (e.g., an object at a distance $d_{max}$ may be detected) of the ranging system. The time $t_{dmax}$ may be the time it takes for the LIDAR signal to travel the distance $d_{max}$ (illustratively, $t_{max}=d_{max}/v$, where v is the velocity of the LIDAR signal). A time slot for the ranging medium access scheme may be defined or selected in a range from about $2*t_{dmax}$ to about $4*t_{dmax}$. A longer time slot (e.g., greater than $2*t_{dmax}$) may be provided or selected (e.g., dynamically), for example, in case data communication or signaling are implemented in the LIDAR signal.

The probability P may be determined (e.g., selected) depending on the extent of medium utilization. By way of example, in case of ranging systems (e.g., LIDAR systems) not many participants may share the medium at the same time, and the utilization may be rather low as compared to conventional communication systems (in which P, for example in p-persistent CSMA, may be selected to be equal to 0.1 as load of the medium may be high). This may be related to the very directed or limited field of emission (FOE) and field of view (FOV) of a ranging system, and to the use in fast moving environments (e.g., as with automotive LIDAR sensors). In the ranging medium access scheme, P may be selected to be in the range $1<=P<=0.1$ (equal or smaller than 1 and equal or greater than 0.1). The value of 1 may be included for allowing immediate transmission after the waiting time has passed.

In various embodiments, the ranging system may be configured to implement the ranging medium access scheme (e.g., to initiate a procedure according to the ranging system) before the LIDAR signal is to be emitted (e.g., before the emission of the LIDAR signal would actually be due). By way of example, the ranging system may be configured to initiate the ranging medium access scheme one time slot prior to a desired or intended emission time (e.g., prior to a targeted time at which the LIDAR signal is to be emitted). This implementation may provide a compensation for the waiting time associated with the ranging medium access scheme. Initiating the ranging medium access scheme in advance may be related with the correlation of crosstalk between subsequently scanned and measured pixels. Illustratively, in case crosstalk is detected in the measurement of a given pixel, then the measurement of a subsequently measured pixel may also be affected by crosstalk. This may occur, for example in a ranging system in which the detector collects the light from a larger portion of the field of view (e.g., in which the detector covers a portion of the field of view that contains several pixels in the field of emission). Initiating the ranging medium access scheme in advance may also be related with the emission of frames, which in ranging applications may be same or similar to one another.

One or more additional aspects of the ranging medium access scheme may be provided, which may be similar to aspects related to digital communication, for example as described in the IEEE 802.11 DCF protocol used in digital communication implementing CSMA/CA for broadcast (e.g., without feedback mechanisms using acknowledgement (ACK)).

In various embodiments, the ranging medium access scheme may include a back-off scheme. The ranging medium access scheme may be configured such that participants (e.g., ranging systems) that are (or have been) waiting to access the medium for a longer time may have a higher probability to access the medium (e.g., with respect to other participants). Illustratively, the ranging medium access scheme may be configured such that fairness may be ensured among the participants (illustratively, by taking into account the waiting time previously spent). A so-called back-off algorithm may be provided. A back-off algorithm may be described as a collision resolution mechanism for calculating or taking into consideration the waiting time for which a participant waits before transmitting the data. An implementation according to the back-off algorithm may reduce or minimize signal collisions.

A ranging system with a frame (e.g., a LIDAR signal) to transmit may be configured to sense the medium. The ranging system may be configured to wait for a time equal to a predefined delay (also referred to as interframe space, IFS) in case the medium is idle. The ranging system may be configured to determine whether the medium remains idle during to such predefined delay (e.g., to determine whether the medium is idle after the IFS has elapsed). The ranging system may be configured to transmit immediately after the IFS has elapsed (in other words, passed) in case the medium is (still) idle. The ranging system may be configured to defer (in other words, postpone) transmission in case the medium is busy (either initially is busy or becoming busy during the IFS). The ranging system may be configured to continue monitoring the medium until the current transmission (e.g., the transmission currently occupying the medium) is over. The ranging system may be configured to delay another IFS (illustratively, to wait for another IFS) once the current transmission is over. The ranging system may be configured to back-off a random amount of time in case the medium remains idle during the IFS (e.g., in case the medium is still idle after the IFS has elapsed). Illustratively, the ranging system may be configured to postpone transmission by an additional amount of time (also referred to as back-off time). The ranging system may be configured to sense the medium after the back-off time has elapsed. The ranging system may be configured to transmit in case the medium is idle. The ranging system may include a back-off timer configured to track the back-off time (e.g., to monitor the elapsing of the back-off time). The back-off timer may be halted in case the medium becomes busy during the back-off time. The back-off timer may be resumed in case or as soon as the medium becomes idle. The ranging system may be configured to initiate the ranging medium access scheme one IFS prior to the targeted time of emission. Illustratively, such operation may be similar to the operation of a station according to the in the IEEE 802.11 DCF protocol, in which the Distributed Coordination Function (DCF) may include a set of delays that amounts to a priority scheme.

The back-off time may be determined (e.g., calculated) in accordance with a contention window. The contention window may be described as a series of integer numbers. The length of the series may be varied. The back-off time may include a number of time slots determined according to a number selected (e.g., at random) from the contention window (illustratively, the back-off time may include N time slots, where N is a number selected from the contention window).

In various embodiments, the ranging medium access scheme may be configured to be adaptable to different load conditions on the medium. Illustratively, the ranging medium access scheme may be configured to remain efficient and stable under varying load conditions on the medium. By way of example, the size of the contention window may be adapted (e.g., the back-off time may be adapted). In case the contention window is chosen to be very short, then the random waiting times of several participants may be close to one another (illustratively, different ranging systems may select the same number from the contention window). This may lead to an increased amount of signal collisions. In case the contention window is chosen to be long, then the delays due to waiting may increase (e.g., they may be too long). Thus, a ranging system may be configured to modify the size of the contention window in an adaptive fashion.

The ranging medium access scheme may include one or more predefined contention window sizes. By way of example, the ranging medium access scheme may include the contention window sizes 3, 7, 15, 31, 63, 127, and 255 (illustratively, approximately doubling the size in each step in an exponential fashion, e.g. $2^2$-1, $2^3$-1, $2^4$-1, $2^5$-1, etc.). The value 255 may be a maximal value (e.g., a maximum allowable value). The contention window may include a series of integer numbers in the range from 0 to the contention window size−1. The ranging system may be configured to select a first collection window size (e.g., of length 3), illustratively when initiating the ranging medium access scheme. The ranging system may be configured to select a second window size (e.g., greater, e.g. the next higher value to the first window size, for example 7) in case the medium access fails. Illustratively, such operation may be similar to the operation of a station according to a binary exponential back-off as described the in the IEEE 802.11 DCF protocol, in which contention window sizes 7, 15, 31, 63, 127, and 255 are described. A smaller window size (e.g., 3) may be implemented for a ranging system with respect to digital communication in view of the expected lower occupancy of the medium.

In various embodiments, the ranging medium access scheme may be configured for prioritization of data. Illustratively, the ranging medium access scheme may provide prioritization (or de-prioritization) of one or more types of emitted signal or information (e.g., ranging, data, and signaling information) by adjusting the respective delays accordingly (illustratively, by varying the length of the IFS depending on the type of data to be transmitted). The ranging medium access scheme may include a first interframe spacing, e.g. a short interframe spacing (SIFS). The SIFS may be used for or associated with all immediate or high-priority response actions, such as warning messages in a data communication or signaling setting. The ranging medium access scheme may include a second interframe spacing, e.g. a distributed coordination interframe spacing (DIFS). The DIFS may be used for or associated with normal priority contending for access, e.g. for standard ranging information or for the dissemination of low-priority telemetry data. The SIFS and/or DIFS values may be selected as waiting time (e.g., as IFS) depending on the type of operation to be carried out by the ranging system (e.g., the type of data or frame to be transmitted). The SIFS may be shorter than the DIFS. The SIFS may be equal or proportional to the time slot, e.g., SIFS=1*time slot. The DIFS may be equal or proportional to the time slot, e.g. DIFS=2*time slot. Illustratively, in the IEEE 802.11 DCF protocol, a prioritization scheme may be provided to implement a priority-based access by using different values (e.g., three) for the inter frame spacing (IFS).

A conventional ranging system may have limited capabilities to determine the validity of the measurements on a per-measurement basis (illustratively, without considering neighboring pixels and/or without considering temporal dependencies between the pixels). In a conventional ranging system there may be no dedicated means for a signal consistency check.

In various embodiments, a frame-based signaling scheme for a ranging system may be provided. The LIDAR signal (e.g., the light signal) emitted by a ranging system may be configured or structured as a frame. Illustratively, the LIDAR signal may include one or more portions (e.g., frame portions), and each portion may be associated with a content type (e.g., each portion may carry a certain type of information). The frame-based signaling scheme may include a predefined frame structure (e.g., adapted for being harmonized and/or standardized). One or more coding schemes (also referred to as modulation schemes or encoding schemes) may be provided to build-up a frame (illustratively, to generate a frame).

In the context of the present application, for example in relation to FIG. 138 to FIG. 144, the term "frame" may be used to describe a logical structure of a signal (e.g., an electrical signal or a LIDAR signal, such as a light signal). Illustratively, the term "frame" may describe or define an arrangement (e.g., a structure) for the content of the frame (e.g., for the signal or the signal components). The arrangement of content within the frame may be configured to provide data or information. A frame may include a sequence of symbols or symbol representations. A symbol or a symbol representation may have a different meaning (e.g., it may represent different type of data) depending on its position within the frame. A frame may have a predefined time duration. Illustratively, a frame may define a time window, within which a signal may have a predefined meaning. By way of example, a light signal configured to have a frame structure may include a sequence of light pulses representing (or carrying) data or information. A frame may be defined by a code (e.g., a signal modulation code), which code may define the arrangement of the symbols within the frame. A symbol included in a frame or in a frame portion may be represented by a signal representation of that symbol. A signal representation of a symbol may be, for example, an analog signal (e.g., a current or a voltage) onto which that symbol is mapped. A signal representation of a symbol may be, for example, a time-domain signal (e.g., a pulse, such as a light pulse) onto which that symbol is mapped. Illustratively, a frame may be understood as a sequence of one or more symbols (e.g., "0" and "1") represented or stored as a sequence of one or more signal representations of those symbols (e.g., one or more currents or current levels, one or more pulses, etc.).

The symbols may be drawn from a predefined alphabet (e.g., from a binary alphabet with symbols in {0; 1}, from a ternary alphabet, or from an alphabet with higher order). Illustratively, a symbol may represent one or more bits. A symbol included in a frame or in a frame portion may be represented by a signal representation of that symbol. A signal representation of a symbol may be, for example, an analog signal (e.g., a current or a voltage) onto which that symbol is mapped. A signal representation of a symbol may be, for example, a time-domain signal (e.g., a light pulse, in the following also referred to as pulse) onto which that symbol is mapped. A same frame may be implemented in different ways. By way of example, a same frame may be stored as one or more electrical signals and may be emitted or transmitted as one or more light pulses. A frame may have a length, e.g. N (N may describe, for example, the number of symbols included in the frame). The length of a frame may be predefined (e.g., fixed) or variable. By way of example, the length of a frame may be variable with (or between) a minimum length and a maximum length.

A time-domain symbol may have a symbol duration Ts. Each time-domain symbol may have the same symbol duration Ts, or time-domain symbols associated with different symbols may have different symbol durations, $T_{S1}$, $T_{S2}$, . . . , $T_{Sn}$. Time-domain symbols associated with different symbols may have different symbol amplitudes (and same or different symbol durations), or time-domain symbols associated with different symbols may have the same symbol amplitude (and different symbol durations). By way of example, in case a binary alphabet (e.g., a unipolar binary alphabet) is used, the “1” symbol may be mapped onto a Gaussian pulse of a certain amplitude to and a certain symbol duration, and the “0” symbol may be mapped onto a Gaussian pulse with zero amplitude and the same symbol duration.

The ranging system may be configured to emit one or more frames (e.g., one or more light signals configured or structured as a frame, such as one or more light pulse sequences). The ranging system may be is configured to emit the frames with a time spacing (e.g., a time delay) between consecutive frames. The time spacing may be selected from a range between a minimum time spacing $T_{min}$ and a maximum time spacing $T_{max}$. The one or more frames may have same or different length and/or composition. The one or more frames may be of the same type or of different types.

A frame may include a predefined structure. The frame may include one or more (e.g., predefined) frame portions (e.g., one or more fields). Each portion may be associated with a predefined usage and/or function (e.g., ranging, data encoding, and the like). By way of example, a frame may include a single portion (e.g., only a preamble portion, only a payload portion, etc.). A portion may have a variable length (e.g., a block-wise variable length). The one or more portions (e.g., the number of portions and/or the respective function) may be configured (e.g., selected) depending on the intended application of the frame (e.g., depending on the frame type, such as ranging frame, data frame, or signaling and control frame).

A (e.g., generic) frame may include a preamble frame portion (also referred to as preamble field, preamble portion, or preamble). The preamble may be configured to provide signal acquisition and/or signal synchronization functionalities. Illustratively, the preamble frame portion may include acquisition signals and/or ranging signals and/or synchronization signals.

The generic frame may (optionally) include a payload frame portion (also referred to as payload field, payload portion, payload, or PHY payload, wherein PHY stands for physical layer). The payload frame portion may be configured to provide and/or manage various type of information, such as identification information, data, signaling information, and/or control information.

The generic frame may (optionally) include a header frame portion (also referred to as header field, header portion header, or PHY header). The header frame portion may include control data. The header may is provide flexibility on how data and/or information may be arranged in the payload and/or in the footer. The header frame portion may be configured to encode various type of information (e.g., about one or more other frame portions).

By way of example, the header frame portion may be configured to encode information about the payload frame portion, such as payload-specific parameters, type of payload, payload type-specific parameters, protocol version, and the like. Payload-specific parameters may include, for example, payload length, payload configuration, payload encoding scheme and/or a codebook used for encoding (e.g., the number of additional ranging sequences contained in the payload, the number of data symbols encoded in the payload, the codebook used to encode data, the codebook used to encode signaling and control information, and the like). The type of payload may include, for example, ranging information, data transmission, signaling and/or control information, or other type of information (e.g., management frame). The payload type-specific parameters may include, for example the used ranging scheme, the used data encoding scheme (e.g., the used mapping and/or the used codebook), or the used signaling scheme and/or control scheme.

As another example, the header frame portion may encode information about a footer frame portion (described in further detail below), such as information describing that no footer is present, information describing that the footer is filled with “dummy bits” to reach a certain (e.g., minimum) frame length, information describing that the footer includes payload error detection information and/or error correction information (e.g., including information about the used error detection and/or error correction scheme), and the like. As a further example, the header frame portion may encode information about the protocol version (e.g., the version number). The information about the protocol version may allow for future extensions.

The generic frame may (optionally) include a footer frame portion (also referred to as footer field, footer portion, footer, or PHY footer). The footer may be configured to provide frame consistency check functionalities (e.g., frame integrity test and/or collision detection). As an example, the footer frame portion may include frame integrity test signals and/or collision detection signals. As a further example, the footer frame portion may include symbols and/or sequences of symbols for error detection and/or error correction (e.g., payload error detection and/or correction). Additionally or alternatively, the footer frame portion may include dummy symbols and/or sequences of dummy symbols (e.g., “dummy bits”). Such dummy symbols and/or sequences may serve to reach a certain (e.g., minimum) frame length.

The physical layer may describe the physical communication medium (similar to data communication, where PHY may be part of the OSI model).

A (e.g., specific) frame may be derived from the structure of the generic frame described above. Illustratively, a specific (or dedicated) frame may include one or more frame portions of the generic frame (e.g., a preamble and/or a payload and/or a header and/or a footer). By way of example, a frame may be a Ranging frame (e.g., used for a ranging operation). As another example, a frame may be a Data frame (e.g., used for data transmission). As a further example, a frame may be a Signaling and Control frame (also referred to as Short Acknowledgment (ACK) frame). Illustratively one or more of the frame portions may be optional (e.g., may be omitted) depending on the frame type.

By way of example, in a Ranging frame the header and/or the payload and/or the footer may be optional portions (e.g., one or more of such fields may be omitted). A Ranging frame may include a single portion (e.g., the preamble). In a Ranging frame, the preamble may for example be used for ranging (e.g., by itself, or together with one or more other portions or together with one or more other (e.g., subsequent) Ranging frames). By varying the preamble length, specific performance parameters may be adjusted (e.g., optimized), such as detection-range and update-rate. Illustratively, long-distance ranging may require a certain minimum preamble length in order to obtain measurements at low signal to noise ratios (SNRs). The system's update rate may be inversely proportional to the preamble length. In a Ranging frame additional ranging symbols and/or sequences of symbols may be encoded in the payload. This may improve the ranging performance (e.g., the quality of the detection).

As another example, in a Data frame the payload and/or the footer may be optional. Alternatively, a Data frame may include a single portion (e.g., the payload, illustratively, only the payload may be used for data transmission). The Data frame including the single payload may include (optionally) an additional field (e.g., the footer). In a Data frame the preamble may serve, for example, as a "marker" for timing acquisition and synchronization, e.g. the preamble may indicate the start of the data transmission (for example, the start of the payload and/or of the footer). In a Data frame data symbols and/or sequences of data symbols may be encoded in the payload. Such data symbols and/or sequences may encode various type of data, such as data for communication, identification information (e.g., a vehicle identification number, car type, car ID, car serial number, corner ID (left, right, front, back), pixel ID, sub-system ID, and the like), security data (e.g., information for security key exchange, for authentication, for two-factor authentication, and the like), telemetry data (e.g., GPS-coordinates, speed, break status, and the like), a traffic-related warning message and/or alert (e.g., indicating an obstacle being detected), transmission token to coordinate communication, and information to manage the handover to RF communication.

As a further example, in a Signaling and Control frame the payload and/or the footer may be optional. A Signaling and Control frame may include a single portion (e.g., the preamble). Illustratively one or more designated preambles may be used for signaling and/or controlling (e.g., for sending a warning beacon, a short ACK, and the like). In a Signaling and Control frame the preamble may serve, for example, as a "marker" for timing acquisition and synchronization (e.g., the preamble may indicate the start of the signaling and control information, such as the start of the payload and/or the footer). Additionally or alternatively, in a Signaling and Control frame the preamble may serve as the signaling and control information itself, e.g. in case a warning beacon and/or a short ACK is transmitted. In a Signaling and Control frame, symbols and/or sequences of symbols for signaling and control purposes may be encoded in the payload. Such symbols and/or sequences may describe or include, for example, beacons, acknowledgment messages (ACK messages), and other type of information.

A preamble frame portion may also be configured for channel estimation. A set of predefined preambles (e.g., of predefined preamble codes) may be defined. A preamble codebook may be provided (e.g., the ranging system may have access to the preamble codebook). The preamble codebook may describe or include the predefined preambles (e.g., a union, a collection, or a list of all the predefined preambles). Each preamble in the preamble codebook may be used to define a number of "virtual" channels. A virtual channel may be dedicated to an associated function (e.g., for ranging-, data-, signaling- and control-information). The preamble code may be configured to have good auto-correlation properties. The preamble codes in the preamble codebook may be configured to have good cross-correlation properties. Good auto-correlation properties may improve timing resolution and/or timing precision (e.g., in case the preamble is used for ranging), and good auto-correlation properties may be provided for distinguishing an own signal from an alien signal. A participant (e.g., a traffic participant, such as a vehicle or a ranging system of a vehicle) may select on which channel to subscribe to (illustratively, which channel to talk on and/or listen to) depending on the selected preamble. Such channel-based approach may also be provided in case special purpose frames and/or messages are conveyed (e.g., special frames for broadcasting notifications or alerts). A preamble codebook may be specific for a ranging system (or vehicle-specific). By way of example, different manufacturers may provide "non-overlapping" preamble codebooks. As another example, "non-overlapping" preamble codebooks may be provided for special types or classes of vehicles (or traffic participants), such as police vehicles or emergency vehicles (e.g., an ambulance). This may offer the effect that a system may be decoupled from other systems (e.g., provided by other manufacturers), thus reducing the impairments caused by the equipment of the other manufacturers.

In the context of the present application, good auto-correlation properties may be used to describe a signal, which provides an auto-correlation below a predefined auto-correlation threshold in case the signal is correlated with a shifted (e.g., time-shifted or delayed, illustratively with a time-shift other than 0) version of itself. The auto-correlation threshold may be selected depending on the intended application. By way of example, the auto-correlation threshold may be smaller than 0.5, for example smaller than 0.1, for example substantially 0. In the context of the present application, good cross-correlation properties may be used to describe a signal, which provides a cross-correlation below a predefined cross-correlation threshold in case the signal is cross-correlated with another signal (illustratively, a different signal). The cross-correlation threshold may be selected depending on the intended application. By way of example, the cross-correlation threshold may be smaller than 0.5, for example smaller than 0.1, for example substantially 0. The signal may be, for example, a frame or a frame portion.

In various embodiments, a coding scheme (also referred to as coding process) may be provided. The coding scheme may be configured to encode a symbol (illustratively, a time-discrete symbol) of a frame onto a physical time-domain signal. The coding scheme may include or may be configured as a line coding scheme or modulation scheme similar to those provided in optical communication and/or in impulse radio schemes. By way of example, the coding scheme may include On-Off Keying (OOK), Pulse Amplitude Modulation (PAM), and/or Pulse Position Modulation (PPM). By way of example, the coding process in combination with a pulse shaping filter may define the shape of a pulse in the time-domain (e.g., of one or more pulses associated with a frame, e.g. with one or more symbols included in the frame). Illustratively, the one or more modulation schemes may be used in combination with a pulse shaping filter (e.g., Gauss shaped) for encoding the symbols of a frame, symbol blocks within the frame, or the entire frame into a time-domain signal.

In various embodiments, a frame consistency check scheme for error detection may be provided (e.g., a frame consistency check code may be included in a LIDAR signal structured as a frame). The frame consistency check may allow checking for frame integrity and/or to identify potential collisions. Illustratively, the configuration of a LIDAR signal as a frame may provide checking for data consistency and/or signal consistency.

A frame consistency check code may be included in a frame (e.g., for example in the footer frame portion, e.g. in the PHY footer). A frame consistency check (code) may provide checking the frame integrity and/or identifying potential errors in the frame, for example due to frame collisions (e.g. caused by the superposition of signals or frames from different LIDAR systems on the medium, or other crosstalk related effects). Additionally or alternatively, a frame consistency check (code) may provide means to check for data consistency (e.g., the transmitted data may be corrupted by noise or crosstalk from other systems).

The coding process may be configured such that a frame is encoded in a redundant way. The redundancy may allow the receiver (e.g., a receiver side of the ranging system, also referred to as decoder side) to detect a limited number of errors that may occur anywhere in the message. Additionally, the redundancy may allow the receiver to correct one or more errors. Illustratively, this may be similar to error detecting codes employed in communication systems, such as Cyclic Redundancy Check (CRC) codes, and Forward Error Correction (FEC) codes.

The ranging system may be configured to add the frame consistency check code to the frame. By way of example, the ranging system may include a frame consistency check code generation stage (e.g., at the encoder side, also referred to as emitter side). The frame consistency check code generation stage may be configured to receive a frame as input (e.g., an entire frame, for example including a preamble, a header, and a payload). The input may be, for example, digital data or a bit-stream (illustratively, representing the data to be encoded, e.g. describing the preamble, and/or the header, and/or the payload, or components thereof). As another example, the input may be a sequence of data symbol blocks (e.g., blocks that represent the entire frame, or parts of the frame). As a further example, the input may be pulse sequences themselves, which may be generated for subsequent emission. The frame consistency check code generation stage may be configured to add the frame consistency check code to the received frame.

Illustratively, the ranging system may include a frame data buffer. The frame data buffer may include (e.g., may be configured to receive) input data (e.g., a bit-stream) describing the frame structure, illustratively as a data block. The content of the frame data buffer may be mapped onto the symbols (or symbol blocks) that comprise the frame (for example, with the exception of the footer frame portion, e.g. of the PHY footer). This operation may be performed, for example, by a signal generator of the ranging system (e.g., as described, for example, in relation to FIG. 131A to FIG. 137). Additionally, the frame data buffer may be configured to provide the content of the data block as input to a frame consistency check code generator. The output of the frame consistency check code generator may be mapped onto the symbols (or symbol blocks) of the footer frame portion of the frame. The final frame may include both components together, illustratively, the frame without footer frame portion and the footer frame portion. The ranging system may be configured to map the final frame (e.g., the frame blocks) onto a pulse sequence or pulse sequence blocks (as described, for example, in relation to FIG. 131A to FIG. 137).

The frame consistency check code may be an error detecting and correcting block code, such as a Reed-Solomon code, Hamming code, Hadamard code, Expander code, Golay code, and Reed-Muller code.

In a conventional ranging system no effective means for error control may be provided or implemented.

In various embodiments, a feedback mechanism (also referred to as error control mechanism or error protocol) may be provided for a ranging system. The feedback mechanism may be based on harmonized signals (e.g., for data communication and/or signaling). The feedback mechanism may provide implementation of error control. The error control may increase the reliability of a ranging operation, for example in case data communication is added on-top of the ranging operation. Additionally or alternatively, a harmonized Medium Access Control (MAC) frame structure may be provided for a LIDAR signal. Said harmonized MAC frame structure may facilitate the implementation of error control.

The error control protocol may provide reliable transmission (e.g., for data communication and/or signaling). Illustratively, the error control protocol may be provided for increasing the reliability of data communication and/or of the exchange of signaling information.

The error control mechanism may provide retransmitting frames that have not been acknowledged or for which the other side requests a retransmission. The error control mechanism may be provided, for example, in case detecting an error is not sufficient, for example when transmitting information, like data or signaling and control information.

By way of example, the error control mechanism may include error detection. As another example, the error control mechanism may include unicast requiring an acknowledgement. The error control mechanism is may include positive acknowledgment (ACK). Illustratively, the destination (e.g., a receiving ranging system) may be configured to return a positive acknowledgement in relation to successfully received frames (e.g., error-free frames). As a further example, the error control mechanism may include retransmission after timeout. Illustratively, the source (e.g., the emitting ranging system) may be configured to retransmit a frame that has not been acknowledged (e.g., after a predefined amount of time). As a further example, the error control mechanism may include negative acknowledgement and retransmission. Illustratively, the destination may be configured to return (e.g., transmit) a negative acknowledgement in relation to frames in which an error is detected. The source may be configured to retransmit such frames. These mechanisms may transform an unreliable link into a reliable one. Illustratively, the ranging medium access scheme may include or may be configured according to a protocol similar to the standard version of the IEEE 802.11 DCF protocol.

The error control mechanism(s) may be implemented, for example, by encoding the relevant Medium Access Control (MAC) information into a frame (e.g., into a LIDAR signal). Illustratively, the ACK may be a part of some MAC protocols that are of relevance for medium access coordination, e.g. as used in the IEEE 802.11 DCF MAC or in the IEEE 802.11p protocols.

The MAC information may be included in any suitable fashion in a frame. By way of example, a MAC frame may be included in the payload frame portion (e.g., in the PHY payload) of a frame (e.g., similar as in communication systems following the OSI model). The MAC frame may include a header frame portion (e.g., a MAC header), and/or a payload frame portion (e.g., a MAC payload), and/or a footer frame portion (e.g., a MAC footer), some of which portions may be optional. Relevant information for error control may be encoded in such MAC frame structure.

The MAC header may include various type of information related to the MAC frame (e.g., it may include data signals describing the MAC frame). The information may include, for example, destination address, source address, stream ID, sequence number, type and configuration of the MAC frame (frame type, payload configuration, such as length and/or protocol version). The MAC header may have a fixed length.

The MAC payload may include various type of information related to individual frame types (e.g., it may include data signals describing individual frame types). The MAC payload may have a fixed length.

The MAC footer may include integrity check data signals (or codes). The MAC footer may be configured for integrity check of the MAC header and/or of the MAC payload. The MAC footer may have a fixed length.

Illustratively, the ranging medium access scheme may include MAC protocols similar to those defined in the IEEE 802.11p standard for Dedicated Short Range Communication (DSRC). Such MAC protocols may be provided for Vehicle to Vehicle (V2V), as well as Vehicle to Infrastructure (V2I) communication. Illustratively, in the ranging medium access scheme a MAC layer may be provided for the exchange of data and signaling information. A network layer may be provided on top of the MAC layer. The network layer may be provided for realizing sophisticated communication systems.

In various embodiments, the ranging medium access scheme may include collision detection (CD), e.g. a collision detection mechanism. Collision detection may be understood as the capability of the system (e.g., of the ranging system) to listen on the medium while transmitting (illustratively, not only before transmitting). The collision detection capabilities may be added to any configuration of the ranging medium access scheme described herein (e.g., the described persistency schemes, the scheme with ACK, etc.).

A ranging system may include an emitting/transmitting part of the electrical and optical frontend (e.g., an emitter side). The ranging system may include a detecting/receiving part of the electrical and optical frontend (e.g., a detector side). The emitting/transmitting part may be decoupled (illustratively, independent) from the detecting/receiving part. The decoupling may provide the implementation of collision detection in the ranging system. Illustratively, crosstalk impairments from the emitter to the detector may be neglected. In RF-based wireless communication, on the other hand, the dynamic range of the signals on the medium may be very large, so that a transmitting participant may not effectively distinguish incoming weak signals from noise and crosstalk caused by its own transmission. Thus, collision detection may be unpractical for conventional wireless networks.

The ranging system may be configured to continue listening to the medium while transmitting. The ranging system may be configured to cease transmission in case (e.g., as soon as) the ranging system detects a collision (illustratively, the ranging system may be configured to determine whether another signal, e.g. LIDAR signal, is present, and to cease transmission accordingly). This may reduce the amount of wasted capacity on the medium. Illustratively, in case two frames collide, the medium may remain unusable for the duration of transmission of both damaged frames. For long frames (e.g., long with respect to the propagation time) the amount of wasted capacity on the medium may be high. The collision detection principle described herein may be similar to the principle used in the CSMA/CD scheme as described in the IEEE 802.3 standard (e.g., for wireline LAN networks).

FIG. 138 shows a portion of a ranging system 13800 in a schematic view in accordance with various embodiments.

The ranging system 13800 may be or may be configured as a LIDAR system (e.g., as the LIDAR Sensor System 10, for example as a Flash LIDAR Sensor System 10 or as a Scanning LIDAR Sensor System 10). The ranging system 13800 may be included, for example, in a sensor device, such as a vehicle (e.g., a car, such as an electric car). The ranging system 13800 may be or may be configured as the ranging system 13300 described, for example, in relation to FIG. 131 to FIG. 137. It is understood that in FIG. 138 only some of the components of the ranging system 13800 may be illustrated. The ranging system 13800 may include any other component as described, for example, in relation to the LIDAR Sensor System 10 and/or to the ranging system 13300.

The ranging system 13800 may include a light source 42. The light source 42 may be configured to emit light, e.g. a light signal. The light source 42 may be configured to emit light having a predefined wavelength, e.g. in a predefined wavelength range. For example, the light source 42 may be configured to emit light in the infra-red and/or near infra red range (for example in the range from about 700 nm to about 5000 nm, for example in the range from about 860 nm to about 1600 nm, for example 905 nm). The light source 42 may be configured to emit light in a continuous manner or it may be configured to emit light in a pulsed manner (e.g., to emit a sequence of light pulses, such as a sequence of laser pulses). The ranging system 13800 may also include more than one light source 42, for example configured to emit light in different wavelength ranges and/or at different rates (e.g., pulse rates). By way of example, the light source 42 may be configured as a laser light source. The light source 42 may include a laser light source (e.g., configured as the laser source described, for example, in relation to FIG. 59). As an example, the light source 42 may include an array of light emitters (e.g., a VCSEL array). As another example, the light source 42 (or the ranging system 13300) may include a beam steering system (e.g., a system with a MEMS mirror).

The ranging system 13800 may include a sensor 52 (e.g., the LIDAR sensor 52). The sensor 52 may include one or more photo diodes (e.g., one or more avalanche photo diodes). The one or more photo diodes is may be arranged in an array (e.g., a 1D-photo diode array, a 2D-photo diode array, or even a single photo diode). The one or more photo diodes may be configured to provide a received light signal (e.g., a received light signal sequence, e.g. one or more received light pulses). Illustratively, the one or more photo diodes may be configured to generate a signal (e.g., an electrical signal, such as a current) in response to light impinging onto the sensor 52.

The light signal impinging onto the sensor 52 (e.g., the received light signal) may be associated with a light signal emitted by the ranging system 13800 (illustratively, the received light signal may be an own light signal). The received light signal may be an echo light signal. Illustratively, the received light signal may be a light signal emitted by the ranging system 13800 and reflected (or scattered) back towards the ranging system 13800 (e.g., onto the sensor 52) by an object in the field of view of the ranging system 13800 (e.g., a vehicle, a tree, a traffic sign, a pedestrian, and the like).

Additionally or alternatively, the light signal impinging onto the sensor 52 may be associated with a source different from the ranging system 13800 (e.g., the received light signal may be associated with another ranging system). By way of example, the received light signal may be a light signal emitted by another ranging system, or may be a reflected or scattered light signal emitted by another ranging system. Illustratively, the received light signal may be an alien light signal.

The ranging system 13800 may include one or more processors 13802. The one or more processors 13802 may be configured to determine (e.g., to evaluate) whether the sensor 52 receives a light signal (e.g., whether the sensor 52 is currently receiving a light signal). By way of example, the one or more processors 13802 may be configured to receive a signal generated by the one or more photo diodes (e.g., the one or more processors 13802 may be communicatively coupled with the sensor 52). The one or more processors 13802 may be configured to determine whether the sensor 52 receives a light signal in accordance with the signal generated by the one or more photo diodes. Illustratively, the one or more processors 13802 may be configured to determine that the sensor 52 receives a light signal in case the signal generated by the one or more photo diodes is above a predefined threshold (e.g., a current threshold). The one or more processors 13802 may be configured to determine that the sensor 52 does not receive a light signal in case the signal generated by the one or more photo diodes is below the predefined threshold.

The one or more processors 13802 may be configured to determine whether the sensor 52 receives a light signal in a continuous manner (e.g., continuously). Illustratively, the one or more processors 13802 may be configured to continuously compare the signal generated by the one or more photo diodes with the predefined threshold. Additionally or alternatively, the one or more processors 13802 may be configured to determine whether the sensor 52 receives a light signal at certain time intervals (e.g., regularly spaced or randomly spaced time intervals). Illustratively, the one or more processors 13802 may be configured to compare the signal generated by the one or more photo diodes with the predefined threshold at certain time intervals.

Whether the sensor 52 receives a light signal may be an indication on whether the medium (e.g., the air, e.g. the environment in the field of view of the ranging system 13800) is busy (or idle). Illustratively, a light signal received by the sensor 52 (e.g., an alien light signal) may indicate that the medium is busy (e.g., used by another ranging system).

The one or more processors 13802 may be configured to determine a time-of-flight value for a received light signal. Illustratively, the one or more processors 13802 may be configured to determine whether the received light signal is an echo signal (e.g., a light signal associated with a light signal emitted by the ranging system 13800). The one or more processors 13802 may be configured to determine a time-of-flight value in case the received light signal is an echo signal.

The ranging system 13800 may include a light source controller 13804. The light source controller 13804 may be or may be configured as the light source controller 13312 described, for example, in relation to FIG. 131 to FIG. 137. The light source controller 13804 may be configured to control the light source 42 (e.g., to control an emission of light by the light source 42). The light source controller 13804 may be configured to control the light source 42 to emit a light signal sequence in accordance with a predefined frame (e.g., a predefined frame structure, e.g. the light source 42 may be controlled to emit a light signal sequence frame). The light signal sequence (e.g., a sequence of light pulses) may represent a plurality of bits of the frame. The frame structure and the light sequence will be described in further detail below, for example in relation to FIG. 139A to FIG. 140C. The ranging system 13800 may include a frame consistency check code generation stage 13806 (e.g., a frame data buffer 13808 and a frame consistency check code generator 13810). The configuration of the frame consistency check code generation stage 13806 will be described in further detail below, for example in relation to FIG. 139A to FIG. 140C.

The light source controller 13804 may be configured to control the light source 42 to emit light dependent on whether the sensor 52 receives a light signal (illustratively, dependent on whether the medium is busy or idle). By way of example, the light source controller 13804 may be coupled with the one or more processors 13802, e.g., the light source controller 13804 may be configured to receive as an input a signal from the one or more processors 13802. The input from the one or more processors 13802 may indicate whether the sensor 52 receives a light signal.

The light source controller 13804 may be configured to control the light source 42 to stop an ongoing emission of light in case the sensor 52 receives a light signal (e.g., an alien light signal). Illustratively, the one or more processors 13802 may determine whether the sensor 52 receives a light signal during emission of light by the light source 42. The light source controller 13804 may be configured to control the light source 42 to stop emitting light in case such (e.g., alien) light signal is received by the sensor 52. Illustratively, the one or more processors 13802 and/or the light source controller 13804 may be configured according to a collision detection mechanism.

The light source controller 13804 may be configured to control or adjust a starting time for the light emission (in other words, a starting time of emitting light). The light source controller 13804 may be configured to control the light source 42 to control a starting time of emitting light dependent on whether the sensor 52 receives a light signal. Illustratively, the light source controller 13804 may be configured to control the light source 42 to start or to delay an emission of light.

The light source controller 13804 may be configured to control the light source 42 to emit light dependent on a light emission scheme (illustratively, according to a light emission scheme). The light emission scheme may define the starting time for emitting light. Illustratively, the starting time of emitting light may be dependent on the light emission scheme (e.g., the starting time may be defined by the adopted light emission scheme). The starting time may be adapted in case the sensor 52 receives a light signal. The light emission scheme may include or define one or more rules or parameters defining the starting time. The light emission scheme may be varied (e.g., dynamically). Illustratively, the light source controller 13804 may operate according to different light emission schemes, or according to different configurations of the light emission scheme (e.g., 1-persistent, non-persistent, p-persistent, enforced waiting persistent, with acknowledgment, with collision detection).

The light source controller 13804 may be configured to control the light source 42 to emit light in case the sensor 52 does not receive a light signal (illustratively, in case the medium is idle). The light source controller 13804 may be configured to control the light source 42 to emit light in case the sensor 52 does not receive a light signal for a predefined time period. Illustratively, the light source controller 13804 may be configured to control the light source 42 to emit light in case the medium is idle for the predefined time period.

By way of example, the light source controller 13804 may be configured to control the light source 42 to emit light immediately (e.g., to set the current time as the starting time). Illustratively, the light source controller 13804 may be configured to control the light source 42 to emit light as soon as the sensor 52 does not receive a light signal (e.g., as soon as the one or more processors 13802 determine that the sensor 52 does not receive a light signal). As another example, the light source controller 13804 may be configured to control the light source 42 to delay (in other words, postpone) the light emission (e.g., to move the time period), as described in further detail below.

The light source controller 13804 may be configured to move the starting time by a time period (illustratively, a time period may correspond to or may include one or more time slots). By way of example, the light source controller 13804 may be configured to force the light source 42 to wait a time period before emitting light (e.g., the time period may be an enforced time period). The light source controller 13804 may be configured to control the light source 42 to emit light after the time period (e.g., in case the sensor 52 does not receive a light signal). The light source controller 13804 may be configured to move the starting time by a time period one or more times. As an example, the light source controller 13804 may be configured to move the starting time by a time period each time that at the end of a time period the sensor 52 receives a light signal (illustratively, each time the medium is busy at the end of the time period).

The time period may be a fixed time period. The light emission scheme may define a fixed duration for the time period (e.g., the duration of a time slot may be selected in a range from about $2*t_{dmax}$ to about $4*t_{dmax}$, the duration of a time period may be a fixed number of time slots, e.g. 1 time slot).

The time period may be a variable time period (e.g., the time period may include a variable number of time slots). The time period may be selected (e.g., by the one or more processors 13802 or the light source controller 13804) depending on the type of signal to be transmitted (e.g., the type of frame). A shorter time period may be selected for a signal with higher priority. By way of example, the time period may be or may include a short interframe spacing (SIFS) for higher priority data. The time period may be or may include a distributed coordination interframe spacing (DIFS) for normal priority or lower priority data. As another example, the time period may be or may include a back-off time. The back-off time may be determined according to a contention window (e.g., a binary exponential back-off contention window). The contention window may be of variable length (e.g., the size of the contention window may be 3, 7, 15, 31, 63, 127, or 255 time slots). Illustratively, the time period (e.g., the back-off time) may include a number of time slots selected (e.g., at random) from the contention window (e.g., selected in a range from 0 to the contention window size-1). The size of the contention system may be varied in an adaptive fashion (e.g., it may be increased in case of failed transmission, for example to the next higher size).

The time period may be a randomly determined time period. By way of example, a light emission probability may be associated with the light emission. The time period may be randomly determined in accordance with the light emission probability.

The light source controller 13804 (and/or the one or more processors 13802) may be configured to determine (e.g., to monitor) whether the time period (e.g., the back-off time) has elapsed. The light source controller 13804 may be configured to determine whether the time period has elapsed over one or more time intervals. Illustratively, the light source controller 13804 may be configured to pause the determination of the elapsing of the time period. By way of example the light source controller 13804 may be configured to pause the determination in case the sensor 52 receives a light signal during the time period. The light source controller 13804 may be configured to re-start the determination of the elapsing of the time period in case the sensor 52 does not receive a light signal. The one or more intervals may be determined by whether the sensor 52 receives a light signal during the time period.

FIG. 139A and FIG. 139B show each the structure of a frame 13900 in a schematic representation in accordance with various embodiments.

FIG. 139C shows an operation of the ranging system 13800 in relation to a frame 13900 in a schematic representation in accordance with various embodiments.

The structure (e.g., the composition) of the frame 13900 shown in FIG. 139A may be an example of a generic frame structure, e.g. of one or more frame portions (also referred to as fields) that may be present in a frame 13900. The type and the number of frame portions of a frame 13900 may be selected depending on the frame type (e.g., on the intended application of the frame, such as ranging frame, data frame, or signaling and control frame).

The frame 13900 may include one or more frame portions (e.g., predefined frame portions). Each frame portion may have a predefined content type (e.g., signal content type). Illustratively, each frame portion may include different type of data and/or may have a different functionality. The frame 13900 (e.g., each frame portion) may include one or more symbols (e.g., a sequence of symbols). The frame 13900 may have a length (illustratively, representing a number of symbols included in the frame). The frame length may be a predefined (e.g., fixed) length. Alternatively, the frame length may be variable. By way of example, the frame length may be variable between (or with) a minimum length and a maximum length.

The frame 13900 may include a preamble frame portion 13902. The preamble frame portion 13902 may include acquisition signals and/or ranging signals and/or synchronization signals. The frame 13900 may include a header frame portion 13904. The header frame portion 13904 may include control data. The frame 13900 may include a payload frame portion 13906. The payload frame portion 13906 may include identification signals and/or control signals. The frame 13900 may include a footer frame portion 13908. The footer frame portion 13908 may include error detection and/or error correction information. The footer frame portion 13908 may include a frame consistency check code, as illustrated in FIG. 139C.

The frame (e.g., a predefined frame of the ranging system 13800) may be or may include a physical layer (PHY) frame **13900*p* (e.g., including a PHY preamble 13902*p* and/or a PHY header 13904*p* and/or a PHY payload 13906*p* and/or a PHY footer 13908*p*). The predefined frame may be or may include a medium access control (MAC) frame 13900*m* (e.g., including a MAC header 13904*m* and/or a MAC payload 13906*m* and/or a MAC footer 13908*m*). The MAC frame 13900*m* may be, for example, included in the payload frame portion 13906*p* of a PHY frame 13900*p*, as illustrated in FIG. 139**B.

The ranging system 13800 may be configured to introduce the frame consistency check code in the frame 13900. By way of example, the ranging system 13800 may include a frame consistency check code generation stage 13806. The frame consistency check code generation stage 13806 may be configured to receive input data 13910, e.g. a frame, such as an entire frame, for example including a preamble, a header, and a payload. The input data 13910 (e.g., a bit stream) may describe the frame structure. The frame consistency check code generation stage 13806 may be configured to add the frame consistency check code to the received frame.

The frame consistency check code generation stage 13806 may include a frame data buffer 13808. The frame data buffer 13808 may include (e.g., may be configured to receive) the input data 13910. The content of the frame data buffer 13910 may be mapped onto the symbols (or symbol blocks) that define the frame (for example, with the exception of the footer frame portion). Illustratively, the frame data buffer 13808 may provide a mapped representation 13912 of the input data 13910. Additionally, the frame data buffer 13808 may be configured to provide the content of the data as input to a frame consistency check code generator 13810. The frame consistency check code generator 13810 may be configured to generate a frame consistency check code in accordance with the received input. The output of the frame consistency check code generator 13810 may be mapped onto the symbols (or symbol blocks) of the footer frame portion of the frame. Illustratively, the frame consistency check code generator 13810 may provide a mapped representation 13914 of the frame portion including the frame consistency check code.

The data frame buffer may provide mapping of a first frame section 13900-1 (e.g., including the preamble frame portion and/or header frame portion and/or payload frame portion). The frame consistency check code generator 13810 may provide mapping of a second frame section 13900-2 (e.g., including the footer frame portion). The final frame 13900 may include both the first frame section 13900-1 and the second frame section 13900-2, illustratively, the frame without footer frame portion and the footer frame portion.

FIG. 140A shows a time-domain representation of a frame 13900 in a schematic view in accordance with various embodiments. FIG. 140B and FIG. 140C show each a time-domain representation of a frame symbol in a schematic view in accordance with various embodiments. FIG. 140D shows a time-domain representation of multiple frames 13900 in a schematic view in accordance with various embodiments.

The frame structure described in relation the frame 13900 may be applied to a time-domain signal, e.g. a LIDAR signal emitted by a ranging system. Illustratively, the ranging system 13800 may be configured to emit a LIDAR signal (e.g., a light signal) having a frame structure.

The ranging system 13800 may be configured to emit a light signal sequence frame 14002, (e.g., the light source controller 13804 may be configured to control the light source 42 to emit the light signal sequence frame 14002). Illustratively, the ranging system may be configured to emit a light signal sequence (e.g., a sequence of light pulses, for example Gauss shaped). The light signal sequence may be structured according to the structure of the frame 13900. Illustratively, the light pulses in the sequence may be arranged (e.g., temporally spaced from one another) according to the structure of the frame 13900. The light signal sequence frame 14002 may include a sequence of light pulses or may be represented by the sequence of light pulses (e.g., a light pulse may be a signal representation of a symbol, such as of one or more bits). The light signal sequence frame 14002 may be configured to carry data or information according to the structure of the sequence of light pulses.

Illustratively, a symbol (e.g., drawn from a binary alphabet including symbols in {0; 1}) may be mapped onto (illustratively, represented by) a time-domain signal, e.g. a light pulse. Depending on its amplitude and/or its duration, a light pulse may represent or be associated with a different symbol. By way of example, a pulse 14004-1 with substantially zero amplitude may represent the "0"-symbol (as illustrated, for example, in FIG. 140B). As another example, a pulse 14004-2 with an amplitude greater than zero may represent the "1"-symbol (as illustrated, for example, in FIG. 140C). A pulse may have a pulse duration Ts. The pulse duration may be fixed or variable. By way of example, the duration of a pulse may be 10 ns, for example 20 ns.

The ranging system 13800 may be configured to emit a plurality of light signal sequence frames 14002 (e.g., a plurality of light signal sequences), as illustrated, for example, in FIG. 140D. By way of example, the ranging system may be configured to emit a first light signal sequence frame 14002-1, a second light signal sequence frame 14002-2, a third light signal sequence frame 14002-3, and a fourth light signal sequence frame 14002-4. The light signal sequence frames 14002 may be emitted with a time spacing (e.g., fixed or varying) between consecutive light signal sequence frames 14002. The light signal sequence frames 14002 may have the same length or different length.

Various aspects of the light emission scheme (e.g., of the configuration of the ranging system 13800) are described in further detail below, for example in relation to FIG. 141A to FIG. 144. It is understood that the various aspects or features may be combined with each other (e.g., the ranging system 13800 may be configured according to a combination of one or more the various aspects).

FIG. 141A to FIG. 141H show each various aspects (e.g., graphs and/or flow diagrams) of the light emission scheme in accordance with various embodiments.

The light emission scheme may be configured as a 1-persistent scheme, as illustrated, for example, in FIG. 141A and FIG. 141B.

The ranging system 13800 may be configured to listen to the channel until the channel is sensed idle (illustratively, as long as the medium is busy), as shown in the graph 14102 in FIG. 141A. Illustratively, the one or more processors 13802 may be configured to continuously determine whether the sensor 52 receives a light signal until the sensor 52 does not receive a light signal (stated in another fashion, until the sensor 52 no longer receives a light signal). The light source controller 13804 may be configured to control the light source 42 to emit light as soon as the channel is sensed idle (e.g., as soon as the sensor 52 does not receive a light signal).

The 1-persistent scheme may be described by the flow diagram 14104 shown in FIG. 141B. The ranging system 13800 (e.g., the one or more processors 13802) may be configured to determine (e.g., evaluate) whether the medium is idle (or busy). The ranging system 13800 may be configured to repeat the evaluation in case the medium is busy. The ranging system 13800 may be configured to transmit (e.g., emit light, e.g. a light signal) in case the medium is idle.

The light emission scheme may be configured as a non-persistent scheme, as illustrated, for example, in FIG. 141C and FIG. 141D.

The ranging system 13800 may be configured to wait with the transmission for an amount of time (e.g., waiting time or time delay) drawn from a probability distribution in case the medium is busy, as shown in the graph 14106 in FIG. 141C. Illustratively, the one or more processors 13802 may be configured to determine whether the sensor 52 receives a light signal at certain (e.g., random) time points defined by a probability distribution. At each time point, the ranging system 13800 may be configured to transmit in case the medium is idle (e.g., the light source controller 13804 may be configured to control the light source 42 to emit light at that time point). Alternatively, the ranging system 13800 may be configured to wait for another (e.g., random) amount of time in case the medium is still busy.

The non-persistent scheme may be described by the flow diagram 14108 shown in FIG. 141D. The ranging system 13800 may be configured to determine whether the medium is idle (or busy). The ranging system 13800 may be configured to wait a random amount of time before performing the next evaluation in case the medium is busy. The ranging system 13800 may be configured to transmit In case the medium is idle.

The light emission scheme may be configured as a p-persistent scheme, as illustrated, for example, in FIG. 141E and FIG. 141F.

The ranging system 13800 may be configured to continuously sense the medium to determine whether the medium is busy, as shown in the graph 14110 in FIG. 141E. The ranging system 13800 may be configured to transmit in accordance with a probability outcome, X (e.g., a randomly generated number) in case (or as soon as) the medium is idle. The ranging system 13800 may be configured not to transmit in case the probability outcome X is greater than a probability P (where 0<=P<=1 or 0.1<=P<=1). In such case, the ranging system 13800 may be configured to postpone transmission by one time slot. After the time slot, the ranging system 13800 may be configured to determine a new probability outcome X (e.g., to generate a new random number) in case the medium is still idle. The ranging system 13800 may be configured to transmit in case (or as soon as) the probability outcome X is equal to or smaller than P.

The non-persistent scheme may be described by the flow diagram 14112 shown in FIG. 141F. The ranging system 13800 may be configured to determine whether the medium is idle (or busy). The ranging system 13800 may be configured to repeat the evaluation in case (e.g., as long as) the medium is busy. The ranging system 13800 may be configured to determine (e.g., generate or pick) a random number X (e.g., in a same range as a probability P, for example 0<=X<=1 or 0.1<=X<=1) in case the medium is idle. The ranging system 13800 may be configured not to transmit in case X is greater than P. In such case, the ranging system 13800 may be configured to wait a time slot. The ranging system 13800 may be configured to determine whether the medium is still idle after the time slot has passed (or has become busy during the time slot). The ranging system 13800 may be configured to re-start the process (or to implement a back-off process, e.g. wait for a current transmission to be over and wait a back-off time) in case the medium is busy. The ranging system 13800 may be configured to determine another random number X in case the medium is idle. The ranging system 13800 may be configured to repeat the evaluation of the medium and the selection of X until an X equal to or smaller than P is generated. The ranging system 13800 may be configured to transmit in case X is equal to or smaller than P.

The light emission scheme may be configured as an enforced waiting persistent scheme, as illustrated, for example, in FIG. 141G and FIG. 141H.

With respect to the p-persistent scheme described in relation to FIG. 141E and FIG. 141F, the ranging system 13800 may be configured such that the first value of X is (always) greater than P. By way of example, the ranging system 13800 may include a pre-assigned value of X greater than P that is selected as first value as soon as the medium is idle. Illustratively, the ranging system 13800 may be configured such that transmission is always postponed by at least one time slot, as shown in the graph 14114 in FIG. 141G.

The enforced waiting persistent scheme may be described by the flow diagram 14116 shown in FIG. 141F. With respect to the flow diagram 14112 related to the p-persistent scheme, the ranging system 13800 may be configured to set a probability outcome X greater than P, e.g. greater than 1 (for example X=2), as first probability outcome.

FIG. 142A and FIG. 142B show a graph 14202 and a flow diagram 14204 related to a light emission scheme including a back-off time in accordance with various embodiments, respectively.

The light emission scheme may include collision avoidance. The light emission scheme may include prioritization (e.g., priority based access) for different types of data. By way of example, the light emission scheme may include a back-off time (e.g., may include a back-off algorithm or may be configured according to a back-off algorithm).

The ranging system 13800 may be configured to transmit in case the medium is idle (e.g., free) for a predetermined time period (e.g., for a time period longer than the DIFS), as illustrated in the in the graph 14202 in FIG. 142A.

The ranging system 13800 may be configured to determine whether the medium is busy (e.g., in case the ranging system 13800 has a frame to transmit). The ranging system 13800 may be configured to wait for a time period (e.g., an interframe spacing, IFS) in case the medium is idle (e.g., before transmitting). The duration of the IFS may be varied depending on the frame to be transmitted (by way of example, the IFS may include a SIFS in case of high priority data or a DIFS in case of normal or low priority data).

The ranging system 13800 may be configured to wait (illustratively, after the IFS has elapsed) for a number of time slots determined according to a contention window (e.g., a contention window having size determined using a binary exponential back-off). The number of time slots may determine or represent a back-off time (e.g., the back-off time may include a number of time slots randomly determined according to a number included in the contention window). The ranging system 13800 may be configured to transmit in case the medium is (still) idle after the IFS and the back-off time have elapsed.

Such light emission scheme may be described by the flow diagram 14204 in FIG. 142B. The ranging system 13800 may include a frame to transmit (e.g., a light signal to be transmitted, e.g. a light signal sequence frame). The ranging system 13800 may be configured to determine whether the medium is idle. The ranging system 13800 may be configured to wait for a time period defined by the IFS in case the medium is idle. The ranging system 13800 may be configured to transmit in case the medium is (still) idle after the IFS has elapsed. The ranging system 13800 may be configured to wait until a current transmission ends (e.g., to wait until the medium becomes idle) in case the medium is busy after the IFS (and/or in case the medium was initially busy). The ranging system 13800 may be configured to wait for a time period defined by the IFS after the end of the current transmission. The ranging system 13800 may be configured to determine whether the medium is idle after the IFS has elapsed. The ranging system 13800 may be configured to back-off (e.g., to delay transmission) for a back-off time in case the medium is idle. The ranging system 13800 may be configured to transmit after the back-off time has elapsed. The ranging system 13800 may be configured to wait until a current transmission ends in case the medium is busy after the IFS. The ranging system 13800 may be configured to pause a back-off counter (e.g., the evaluation of the elapsing of the back-off time) in case the medium becomes busy during the back-off time.

FIG. 143A and FIG. 143B show each a flow diagram 14302 14304 related to a light emission scheme including a back-off time and collision detection in accordance with various embodiments.

The light emission scheme may include collision detection, as illustrated in the flow diagram 14302 in FIG. 143A. The collision detection (e.g., the related steps and/or the related configuration of the ranging system 13800) may be implemented (e.g., introduced) in any configuration of the light emission scheme (illustratively, in any of the other flow diagrams 14104, 14108, 14112, 14116, 14204).

The collision detection steps may be added at the end of the process (e.g., at the end of the respective flow chart). The collision detection may replace (or introduce additional steps to) the transmission by the ranging system 13800. Illustratively, the ranging system 13800 may be configured to evaluate collision detection any time the ranging system 13800 would transmit (e.g., at any time the ranging system 13800 is eligible for transmission). The ranging system 13800 may be configured to repeat the transmission until the transmission is done and/or in case no collision is detected. The ranging system 13800 may be configured to re-start the process (illustratively, to move back to the start of the respective flow diagram) in case a collision is detected. The ranging system 13800 may be configured to terminate the current operation in case transmission is done and no collision is detected (e.g., a success may be determined for the current operation).

As an example, the flow diagram 14304 in FIG. 143B may illustrate the collision detection introduced in the back-off scheme described in relation to FIG. 142A and FIG. 142B. Illustratively, the flow diagram 14304 may correspond to the flow diagram 14204 in which collision detection is introduced.

FIG. 144 shows a flow diagram 14402 related to a light emission scheme including an error detection protocol in accordance with various embodiments.

The light emission scheme may include a protocol with error detection and/or error control. The light emission scheme may include (e.g., require) an acknowledgment. Illustratively, the ranging system 13800 may be configured to wait for an acknowledgment from another system (e.g., another ranging system), illustratively from the system to which the frame was transmitted.

The ranging system 13800 may be configured to set a counter to 0 at the start of the scheme (e.g., K=0). The ranging system 13800 may be configured to continuously determine whether the channel is idle until the channel becomes idle. The ranging system 13800 may be configured to wait for an IFS (e.g., before transmitting) in case the channel is idle. The ranging is system 13800 may be configured to repeat the determination in case the channel is no longer idle after the IFS has elapsed. The ranging system 13800 may be configured to choose a random number, R, between 0 and $2^K-1$ in case the channel is still idle (illustratively, a number R within the contention window). The ranging system 13800 may be configured to wait for a number of time slots equal to R (illustratively, a back-off time). The ranging system 13800 may be configured to pause the counter of time slots in case the medium becomes busy during such waiting time. The ranging system 13800 may be configured to send a frame after the R time slots have elapsed. The ranging system 13800 may be configured to wait for an acknowledgment after the frame has been transmitted. The ranging system 13800 may be configured to determine whether an acknowledgment has been received after a predefined amount of time (e.g., a time-out) has passed. The ranging system 13800 may be configured to terminate the current operation in case the acknowledgment is received (e.g., a success may be determined for the current operation). The ranging system 13800 may be configured to increase the counter (e.g., K=K+1) in case the ranging system 13800 does not receive the acknowledgment. The ranging system 13800 may be configured to repeat the process in case K is equal to or below a predefined threshold (e.g., K<=15). The ranging system 13800 may be configured to abort the current operation in case K is above the threshold.

In the following, various aspects of this disclosure will be illustrated:

Example 1aa is a LIDAR Sensor System. The LIDAR Sensor System may include a light source. The LIDAR Sensor System may include a sensor including one or more photo diodes configured to provide a received light signal. The LIDAR Sensor System may include one or more processors configured to determine whether the sensor receives a light signal. The LIDAR Sensor System may include a light source controller configured to control the light source to emit light dependent on whether the sensor receives a light signal.

In Example 2aa, the subject-matter of example 1aa can optionally include that the light source controller is further configured to control the light source to control a starting time of emitting light dependent on whether the sensor receives a light signal.

In Example 3aa, the subject-matter of any one of examples 1aa or 2aa can optionally include that the light source controller is further configured to control the light source to emit light dependent on a light emission scheme. The starting time of emitting light dependent on the light emission scheme may be adapted in case the sensor receives a light signal.

In Example 4aa, the subject-matter of any one of examples 1aa to 3aa can optionally include that the light source controller is further configured to move the starting time by a time period.

In Example 5aa, the subject-matter of example 4aa can optionally include that the time period is one of a fixed time period, a variable time period, a randomly determined time period.

In Example 6aa, the subject-matter of any one of examples 1aa to 5aa can optionally include that the light source controller is further configured to determine whether the time period has elapsed over one or more time intervals.

In Example 7aa, the subject-matter of any one of examples 1aa to 6aa can optionally include that the light source controller is further configured to control the light source to emit light in case the sensor does not receive a light signal.

In Example 8aa, the subject-matter of example 7aa can optionally include that the light source controller is further configured to control the light source to emit light in case the sensor does not receive a light signal for a predefined time period.

In Example 9aa, the subject-matter of any one of examples 1aa to 8aa can optionally include that the light source controller is further configured to control the light source to stop an ongoing emission of light in case the sensor receives a light signal.

In Example 10aa, the subject-matter of any one of examples 7aa to 9aa can optionally include that the light signal is associated with a light signal emitted by another LIDAR Sensor System.

In Example 11 aa, the subject-matter of any one of examples 1aa to 9aa can optionally include that the one or more processors are configured to determine a time-of-flight value for a received light signal.

In Example 12aa, the subject-matter of example 11aa can optionally include that the received light signal is associated with a light signal emitted by the LIDAR Sensor System.

In Example 13aa, the subject-matter of any one of examples 1aa to 12aa can optionally include that the light source controller is further configured to control the light source to emit a light signal sequence in accordance with a predefined frame. The light signal sequence may represent a plurality of bits of the frame.

In Example 14aa, the subject-matter of example 13aa can optionally include that the predefined frame is a Medium Access Control (MAC) frame.

In Example 15aa, the subject-matter of any one of examples 13aa or 14aa can optionally include that the predefined frame includes a header portion and a payload portion.

In Example 16aa, the subject-matter of example 15aa can optionally include that the predefined frame further includes a footer frame portion including error detection and/or error correction information.

In Example 17aa, the subject-matter of any one of examples 1aa to 16aa can optionally include that the LIDAR Sensor System is configured as a Flash LIDAR Sensor System.

In Example 18aa, the subject-matter of any one of examples 1aa to 16aa can optionally include that the LIDAR Sensor System is configured as a Scanning LIDAR Sensor System.

In Example 19aa, the subject-matter of any one of examples 1aa to 18aa can optionally include that the light source includes a laser light source.

Example 20aa is a method of operating a LIDAR Sensor System. The method may include providing a light source. The method may include providing a sensor including one or more photo diodes configured to provide a received light signal. The method may include determining whether the sensor receives a light signal. The method may include controlling the light source to emit light dependent on whether the sensor receives a light signal.

In Example 21aa, the subject-matter of example 20aa can optionally include controlling a starting time of emitting light dependent on whether the sensor receives a light signal.

In Example 22aa, the subject-matter of any one of examples 20aa or 21aa can optionally include controlling the light source to emit light dependent on a light emission scheme. The starting time of emitting light dependent on the light emission scheme may be adapted in case the sensor receives a light signal.

In Example 23aa, the subject-matter of any one of examples 20aa to 22aa can optionally include moving the starting time by a time period.

In Example 24aa, the subject-matter of example 23aa can optionally include that the time period is one of a fixed time period, a variable time period, a randomly determined time period.

In Example 25aa, the subject-matter of any one of examples 20aa to 24aa can optionally include determining whether the time period has elapsed over one or more time intervals.

In Example 26aa, the subject-matter of any one of examples 20aa to 25aa can optionally include controlling source to emit light in case the sensor does not receive a light signal.

In Example 27aa, the subject-matter of example 26aa can optionally include controlling the light source to emit light in case the sensor does not receive a light signal for a predefined time period.

In Example 28aa, the subject-matter of any one of examples 20aa to 27aa can optionally include controlling the light source to stop an ongoing emission of light in case the sensor receives a light signal.

In Example 29aa, the subject-matter of any one of examples 26aa to 28aa can optionally include that the light signal is associated with a light signal emitted by another LIDAR Sensor System.

In Example 30aa, the subject-matter of any one of examples 20aa to 28aa can optionally include determining a time-of-flight value for a received light signal.

In Example 31aa, the subject-matter of example 30aa can optionally include that the received light signal is associated with a light signal emitted by the LIDAR Sensor System.

In Example 32aa, the subject-matter of any one of examples 20aa to 31aa can optionally include controlling the light source to emit a light signal sequence in accordance with a predefined frame. The light signal sequence may represent a plurality of bits of the frame.

In Example 33aa, the subject-matter of example 32aa can optionally include that the predefined frame is a Medium Access Control (MAC) frame.

In Example 34aa, the subject-matter of any one of examples 32aa or 33aa can optionally include that the predefined frame includes a header portion and a payload portion.

In Example 35aa, the subject-matter of example 34aa can optionally include that the predefined frame further includes a footer frame portion including error detection and/or error correction information.

In Example 36aa, the subject-matter of any one of examples 20aa to 35aa can optionally include that the LIDAR Sensor System is configured as a Flash LIDAR Sensor System.

In Example 37aa, the subject-matter of any one of examples 20aa to 35aa can optionally include that the LIDAR Sensor System is configured as a Scanning LIDAR Sensor System.

In Example 38aa, the subject-matter of any one of examples 20aa to 37aa can optionally include that the light source includes a laser light source.

Example 39aa is a computer program product. The computer program product may include a plurality of program instructions that may be embodied in a non-transitory computer readable medium, which when executed by a computer program device of a LIDAR Sensor System of any one of examples 1aa to 19aa cause the controlled LIDAR Sensor System to execute the method of any one of the examples 20aa to 38aa.

Example 40aa is a data storage device with a computer program that may be embodied in non-transitory computer readable medium, adapted to execute at least one of a method for LIDAR Sensor System of any one of the above method examples, a LIDAR Sensor System of any one of the above LIDAR Sensor System examples.

Over the last years, the automotive industry and various technology companies have made significant steps forward to render self-driving vehicles a reality. Autonomous vehicles (AV) are capable of identifying relevant signals and obstacles, analyzing traffic conditions and generating appropriate navigation paths to deliver passengers to destinations without any intervention from humans. As a consequence AVs have the great potential to fundamentally alter transportation systems by increasing personal safety, enhancing user satisfaction, decreasing environmental interruption, reducing infrastructure cost, and saving time for drivers.

Autonomous driving (or semi-autonomous driving), however, comes with very high requirements including sophisticated sensing and communication capabilities.

Sophisticated sensors include cameras and other ranging sensors for perceiving the environment. By way of example, LIDAR sensors due to their advanced 3D sensing capabilities and large range may be provided in this technical context.

Furthermore, advanced communication capabilities are prerequirement. The vehicles are usually assumed to have network connectivity (e.g. LTE- or 5G-connectivity) and in many cases dedicated Vehicle-to-Vehicle (V2V) or Vehicle-to-infrastructure (V2I) communication are assumed.

With this many new use cases become feasible. Viable first step towards autonomous driving includes use cases like platooning, where vehicles form convoys controlled by the first vehicle in the convoy to increase road utilization, or valet parking, where the vehicle is dropped at the parking lot and it then fully automatically performing the manoeuvres needed for the vehicle to reach its parking space.

Despite the appealing effects that attract great efforts from both global automakers and technology companies, it also brings new and challenging security threats towards both AVs and users. First of all, due to the exposure of remote control interface, AV is facing with a broad range of cyber attacks, which may result in the safety issues to drivers, passengers and pedestrians.

To secure vehicle control, single-factor authentication based on physical key or biometric is usually implemented on a vehicle, which results in endless vehicle theft accidents nowadays. However, a remote vehicle control offers large automotive attack surfaces to adversaries, such that identity authentication with higher security guarantee is necessary for vehicles, e.g. AVs. Multi-factor authentication with the integration of multiple authentication factors, e.g. login and password, secret data, secure devices, and biometric, may be provided for identity verification between a smartphone and a vehicle, e.g. an AV. n-factor authentication upgrades the security of single-factor authentication that even any $n-1$ factors are disclosed accidently, security guarantee would not be degenerated.

In various embodiments, a mechanism is provided that allows to include a verified location as an additional factor for authentication.

Various embodiments may provide a LIDAR sensor as part of an out-of-band (OOB) communication mechanism that—due to the line-of-sight (LOS) properties and the limited range of the LIDAR emission and reception—allows to verify the presence at a specific location. OOB in this context means that the communication is not happening over the main in-band (radio) channel (e.g. an existing LTE- or 5G-link) that may be used to establish the first factor (e.g. login and password combination) but on another independent link.

Possible scenarios for V2V and V2I authentication using a LIDAR-based OOB channel are illustrated in FIG. 182 and FIG. 183 below.

FIG. 182 shows a communication system 18200 including a first vehicle 18202 and a second vehicle 18204 and two established communication channels in accordance with various embodiments.

The first vehicle 18202 has a mobile radio communication circuit and a mobile radio communication interface including a first antenna 18206. The second vehicle 18204 may also have a mobile radio communication circuit and a mobile radio communication interface including a second antenna 18208. The mobile radio communication circuits and mobile radio communication interfaces may be configured according to any desired mobile radio communication standard such as UMTS (Universal Mobile Telecommunications System), LTE (Long Term Evolution), CDMA2000 (Code Division Multiple Access 2000), 5G, and the like. The system 18200 may further include a mobile radio communication core network 18210 (the also provided Radio Access Networks (RANs) including corresponding Base stations are not shown in the figures for reasons of simplicity). A first communication connection (also referred to as first communication channel or main in-band channel) 18212 may be established between the first vehicle 18202 and the second vehicle 18204 via the RANs and the core network 18210.

Furthermore, the first vehicle 18202 may have at least one first LIDAR Sensor System 10 and the second vehicle 18204 may have at least one second LIDAR Sensor System 10. By way of example, the first vehicle 18202 may have one first LIDAR Sensor System 10 arranged at the front side of the first vehicle 18202 and another one first LIDAR Sensor System 10 arranged at the rear side of the first vehicle 18202. Furthermore, the second vehicle 18204 may have one second LIDAR Sensor System 10 arranged at the front side of the second vehicle 18204 and another one second LIDAR Sensor System 10 arranged at the rear side of the second vehicle 18204.

A second communication connection (also referred to as second communication channel or (LIDAR-based) out-of-band (OOB) channel) 18214 may be established between the first vehicle 18202 and the second vehicle 18204 via e.g. the first LIDAR Sensor System 10 arranged at the front side of the first vehicle 18202 and the second LIDAR Sensor System 10 arranged at the rear side of the second vehicle 18204.

Each LIDAR Sensor System 10 may include a sensor 52 including one or more photo diodes; and one or more processors configured to decode digital data from a light signal received by the one or more photo diodes.

In other words, FIG. 182 shows a possible scenario for a vehicle-to-vehicle (V2V) authentication using a LIDAR-based OOB channel as will be described in more detail below.

FIG. 183 shows a communication system 18300 including a vehicle 18302 and a traffic infrastructure 18304 (e.g. a parking lot infrastructure or a traffic post or a traffic light, or the like) and two established communication channels in accordance with various embodiments.

The vehicle 18302 has a mobile radio communication circuit and a mobile radio communication interface including an antenna 18306. The traffic infrastructure 18304 may also have a mobile radio communication circuit and a mobile radio communication interface including an antenna 18308. The mobile radio communication circuits and mobile radio communication interfaces may be configured according to any desired mobile radio communication standard such as UMTS (Universal Mobile Telecommunications System), LTE (Long Term Evolution), CDMA2000 (Code Division Multiple Access 2000), 5G, and the like. The communication system 18300 may further include a mobile radio communication core network 18310 (the also provided Radio Access Networks (RANs) including corresponding Base stations are not shown in the figures for reasons of simplicity). A first communication connection (also referred to as first communication channel or main in-band channel)

18312 may be established between the vehicle 18302 and the traffic infrastructure 18304 via the RANs and the core network 18310.

Furthermore, the vehicle 18302 may have at least one first LIDAR Sensor System 10 and the traffic infrastructure 18304 may have at least one second LIDAR Sensor System 10. By way of example, the vehicle 18302 may have one first LIDAR Sensor System 10 arranged at the front side of the vehicle 18302 and another one first LIDAR Sensor System 10 arranged at the rear side of the vehicle 18302. Furthermore, the traffic infrastructure 18304 may have one second LIDAR Sensor System 10 arranged at the front side of the traffic infrastructure 18304 (the side directed to the street from where the vehicles are expected to approach the traffic infrastructure 18304) and optionally further second LIDAR Sensor System 10 arranged at another side of the traffic infrastructure 18304. Each LIDAR Sensor System 10, e.g. each second LIDAR Sensor System 10 may include a LIDAR compatible interface including a LIDAR emitter and a LIDAR detector.

A second communication connection (also referred to as second communication channel or (LIDAR-based) out-of-band (OOB) channel) 18314 may be established between the vehicle 18302 and the traffic infrastructure 18304 via e.g. the first LIDAR Sensor System 10 arranged at the front side of the vehicle 18302 and the second LIDAR Sensor System 10 arranged at the traffic infrastructure 18304.

Each LIDAR Sensor System 10 may include a sensor 52 including one or more photo diodes; and one or more processors configured to decode digital data from a light signal received by the one or more photo diodes.

In other words, FIG. 183 shows a possible scenario for a vehicle-to-infrastructure (V2I) authentication using a LIDAR-based OOB channel as will be described in more detail below.

It is to be noted that although a LIDAR Sensor System is not a communication device by nature, it essentially includes all the necessary components that are needed for communication e.g. if the amount of data to be transmitted per time duration is not too high.

Due to the LOS (line of sight) properties and the limited range of the LIDAR Sensor System 10, a light signal transmission happening over the OOB channel 18214, 18314 is hard to inject, hard to eavesdrop, and hard to intercept. Furthermore, by its nature, the LIDAR Sensor System 10 offers the means for establishing a truly independent communication link.

In various embodiments, a two-factor authentication scheme is provided that allows for the usage of a constrained OOB channel 18214, 18314 making it possible to use the LIDAR Sensor Systems 10 for the exchange of OOB messages provided to verify the location of the associated object, such as a vehicle or a traffic infrastructure. In various embodiments, the messages may be encoded in a way such that the LIDAR Sensor Systems 10 can be used for conveying the OOB messages.

It is also to be noted that the method according to various embodiments, although presented for two-factor authentication only, can be extended to allow multi-factor authentication in a straightforward fashion.

In the following, a two-factor authentication using a constrained out-of-band channel will be described in more detail.

Various embodiments provide both one-way and mutual authentications for different use cases requiring different security level.

As authentication factors, the scheme according to various embodiments utilizes a token transmitted over mobile radio (e.g. LTE- or 5G-) based in band communication channel 18212, 18312 and a random number transmitted over Lidar-based out of band channel 18214, 18314. In various embodiments, the communication peers are assumed that they have preshared (cryptographic) key(s), and in band (mobile radio) communication channel 18212, 18312 supporting basic mobile network security such as data confidentiality.

Since various embodiments are leveraging security characteristic of HMAC (Hash Message Authentication Code) for authentication message generation and LIDAR as an 00B channel 18214, 18314, it is suitable where a lightweight and fast authentication scheme is desired. Additionally, taking into account the LOS properties and the limited range of the LIDAR sensor, it also allows for location-based authentication in the vicinity of the LIDAR sensor.

Various aspects of this disclosure are presented in the following. A first scheme presented is for a one-way authentication scenario. This is e.g. relevant in scenarios as described where a vehicle (e.g. a car) needs to determine another entity's authenticity before handover its control. A second scheme described is for mutual authentication scenarios where strong authentication among the communication peers is desired. Various embodiments can be easily extended from one-way authentication to mutual is authentication scheme.

In the following, a one-way two factor authentication will be described in more detail.

Considering a scenario as shown in FIG. 183, a message flow to perform one-way two factor authentication is shown in a message flow diagram 18400 in FIG. 184. In this example, the 'car/vehicle' and the 'parking lot' (as one example of a traffic infrastructure 18304) are considered as communication peers. In a different use case, it can be any which wants to perform two factor authentication. In the message flow, the parking lot (as an example of a traffic infrastructure 18304) is authenticated by a vehicle (e.g. vehicle 18302, e.g. a car).

The details of each message in the message flow diagram 18400 exchanged between the vehicle 18302 and the traffic infrastructure 18304 (e.g. the parking lot) and the associated process are described further below:

Parking notification message 18402:

When the vehicle 18302 (e.g. a car) is heading to the parking lot 18304, the mobile radio communication circuitry of the vehicle 18302 generates and sends (e.g. via the antenna 18306) a parking notification 18402 via the in-band communication channel 18312 to the parking lot 18304 to check the availability of a parking lot. During this process it also sends a Token value via the in-band communication channel 18312, also referred to as Token_A.

Confirmation message 18404:

Mobile radio communication circuitry of the parking lot 18304 receives and decodes the parking notification 18402 and then checks the availability of the parking lots within the parking infrastructure (providing a plurality of vehicle parking spots) the parking lot 18304 is associated with. Then, the parking lot 18304 gives information about an available parking spot of the parking infrastructure by encoding, generating a confirmation message 18404 and sending the same to the vehicle 18302 via the in-band communication channel 18312.

OOB challenge message 18406:

After having received and decoded the confirmation message 18404, the LIDAR Sensor System 10 of the vehicle 18302 encodes and thus generates an OOB challenge message 18406. The OOB challenge message 18406 may include a Random Number of Car (RN_C). The OOB challenge message 18406 is delivered to the parking lot 18304 via the Lidar-based OOB channel 18314. The size of the random number can flexibly be changed depending on the capability of the LIDAR Sensor Systems 10. To prevent a replay attack, the random number is only valid for a certain (e.g. predefined time).

Authentication message 18408:

After having received and decoded the OOB challenge message 18406, the LIDAR Sensor System 10 of the parking lot 18304 or another entity of the parking lot 18304 encodes and thus generates a authentication message 18408 to be authenticated using the Token_A received via the in-band communication channel 18312 and the RN_C received via the OOB channel 18314. The parking lot 18304 transmits the authentication message 18408 via the in-band communication channel 18312 to the vehicle 18302. After having received and decoded the authentication message 18408, the vehicle 18302 verifies the authentication message 18408 in 18410.

The authentication message 18408 may have the following content:

$$H(H(PSK \oplus RN_c) \| \text{Token}_A)$$

The authentication message 18408 includes a concatenation of two hashed results and the token (Token_A) transmitted from the vehicle 18302 (e.g. the car) to the parking lot 18304 via the in-band channel 18312. The random number RN_C is used as ipad and opad of HMAC for padding. When the random numbers are not long enough for padding, the respective random number is repeated until it has sufficient length for padding.

Finished message 18412:

After the vehicle 18302 (e.g. the car) has received and decoded the authentication message 18408, as mentioned above, it verifies (in 18410) the authentication message 18408 by generating the same value and comparing it with the authentication message 18408. Through the verification process 18410, the vehicle 18302 (e.g. the car) can verify the authenticity of the parking lot 18304 (which illustratively represents a communication peer of the vehicle 18302):

- If the communication peer who wants to be authenticated has a pre-shared (cryptographic, e.g. symmetric) key.
- If the communication peer having a pre-shared (cryptographic, e.g. symmetric) key is the same communication peer and has received the token via the in-band communication channel 18312.
- If the communication peer having a pre-shared (cryptographic, e.g. symmetric) key and token is physically presented at the parking lot (location factor) and has received the random number via the OOB communication channel 18314.

When the verification process 18410 is successfully finished, the vehicle 18302 (e.g. the car) generates and sends the finished message 18412 to the parking lot 18304 via the in-band communication channel 18312 to notify the parking lot 18304 that the authentication process has been successfully completed.

Thus, illustratively, FIG. 184 shows a one-way authentication process using a mobile radio in-band communication channel 18312 and a LIDAR-based OOB communication channel 18314.

In the following, a mutual two factor authentication will be described in more detail.

FIG. 185 shows a flow diagram 18500 illustrating a mutual two factor authentication process in accordance with various embodiments.

A mutual authentication process is similar to the one-way authentication as described with reference to FIG. 184 above.

FIG. 185 describes the process order of an authentication initiator (by way of example, the vehicle 18302 (e.g. the car) may be the initiator in the exemplary scenario). After starting the process in 18502, the vehicle 18302 (e.g. the car) checks in 18504 if it has a pre-shared (cryptographic, e.g. symmetric) key. If the vehicle 18302 (e.g. the car) does not have the preshared (cryptographic, e.g. symmetric) key ("No" in 18504), the authentication has failed and the process is finished (e.g. by generating and sending a corresponding failure message to the parking lot 18304) in 18506. If the vehicle 18302 (e.g. the car) has the pre-shared (cryptographic, e.g. symmetric) key ("Yes" in 18504), the vehicle 18302 (e.g. the car) may generate a random number RN_C and further generates a random number message including the random number RN_C and sends the random number message via the OBB communication channel 18314 to the parking lot 18304 in 18508. In case the vehicle 18302 (e.g. the car) does not receive a further random number RN_P from the parking lot 18304 via the OBB communication channel 18314 (see FIG. 184) (this is checked in 18510)—"No" in 18510—the vehicle 18302 (e.g. the car) assumes that the parking lot 18304 (communication peer) does not require mutual authentication and performs the authentication process as described further below continuing in 18514 In case the vehicle 18302 (e.g. the car) receives and decodes the further random number RN_P from the parking lot 18304 via the Lidar-based OOB communication channel 18314 ("Yes" in 18510), the vehicle 18302 (e.g. the car) assumes that the parking lot 18304 requires mutual authentication and generates and sends a first authentication message 1 to the parking lot 18304 via the in-band communication channel 18312 (in 18512). After having received and decoded a second authentication message 2 from the parking lot 18304 via in-band communication channel 18312 (in 18514), the vehicle 18302 (e.g. the car) may verify the second authentication message 2 in 18516. If the verification fails ("No" in 18516), the authentication has failed and the process is finished (e.g. by generating and sending a corresponding failure message to the parking lot 18304) in 18506. If the verification was successful ("Yes" in 18516), the vehicle 18302 allows a requested resource access by the parking lot 18304 (in general by the authenticated communication peer) in 18518. Then, the authentication process is successfully finished in 18520.

A corresponding message flow diagram 18600 will now be described with reference to FIG. 186.

Parking notification message 18602:

When the vehicle 18302 (e.g. a car) is heading to the parking lot 18304, the mobile radio communication circuitry of the vehicle 18302 generates and sends (e.g. via the antenna 18306) a parking notification 18402 via the in-band communication channel 18312 to the parking lot 18304 to check the availability of a parking lot with a Token value, also referred to as Token_A.

Confirmation message 18604:

Mobile radio communication circuitry of the parking lot 18304 receives and decodes the parking notification 18402 and then checks the availability of the parking lots within the parking infrastructure (providing a plurality of vehicle parking spots) the parking lot 18304 is associated with. Then, the parking lot 18304 gives information about an available parking spot of the parking infrastructure by encoding, generating a confirmation message 18404 and sending the same to the vehicle 18302 via the in-band communication channel 18312.

OOB challenge A message 18606:

After having received and decoded the confirmation message 18604, the vehicle 18302 may generate the OOB challenge A message 18606 and transmits the same to the parking lot 18304 via the LIDAR-based OOB communication channel 18314. The OOB challenge A message 18606 may include a first Random Number of the vehicle 18302 (e.g. the car) (RN_C). Depending on the capability of the LIDAR Sensor System 10 of the vehicle 18302 and of the parking lot 18304, the size of the first random number RN_C can flexibly be changed.

OOB challenge B message 18608:

Furthermore, the parking lot 18304 may generate the OOB challenge B message 18608 and transmit the same to the vehicle 18302 via the LIDAR-based OOB communication channel 18314. The OOB challenge B message 18608 may include a second Random Number of the Parking lot 18304 (RN_P). Depending on the capability of the LIDAR Sensor System 10 of the vehicle 18302 and of the parking lot 18304, the size of the second random number RN_P can flexibly be changed.

First authentication message A 18610:

After having received and decoded the OOB challenge B message 18608, the vehicle may generate the first authentication message A 18610 and transmit the same to the parking lot 18304 via the in-band communication channel 18312. The first authentication message A 18610 may be used for authentication of the vehicle 18302 (e.g. the car) and is verified on a communication peer, e.g. the parking lot 18304. The first authentication message A 18610 may include random numbers to prove that the vehicle 18302 (e.g. the car) is the same communication peer who requested the parking (by sending the parking notification message 18602), received the token, and who was physically presented at the parking lot 18304 and received the second random number RN_P via the LIDAR-based OOB communication channel 18314.

The first authentication message A 18610 may have the following content:

$$H(H(PSK \oplus RN_C) \| H(PSK \oplus RN_P) \| \text{Token}_B)$$

First authentication message A 18610 verification 18612:

After having received and decoded the first authentication message A 18610, the parking lot 18304 may generate the same message and may compare the generated one with the one the parking lot 18304 has received via the in-band communication channel 18312 (first authentication message A 18610 verification process 18612). Through the first authentication message A 18610 verification process 18612, the parking lot 18304 can authenticate the vehicle 18302 (e.g. the car).

Second authentication message B 18614:

If the first authentication message A 18610 verification process 18612 was successful, the parking lot 18304 may generate the second authentication message B 18614 and transmit the same to the vehicle 18302 via the in-band communication channel 18312. The second authentication message B 18614 may be used for authentication of the parking lot 18304 and is verified on a communication peer, e.g. the vehicle 18302. The second authentication message B 18614 may include random numbers to proof that the parking lot 18304 is the same communication peer who sent the confirmation message 18604. The second authentication message B 18614 may be generated by the parking lot and include Token_A the parking lot 18304 received from the vehicle 18302 when it sent the parking notification message 18602.

The second authentication message B 18614 may have the following content:

$$H(H(PSK \oplus RN_C) \| H(PSK \oplus RN_P) \| \text{Token}_A)$$

Second authentication message B 18614 verification 18616:

After having received and decoded the second authentication message B 18614, the vehicle 18302 may generate the same message and may compare the generated one with the one the vehicle 18302 has received via the in-band communication channel 18312 (second authentication message B 18614 verification process 18616). Through the second authentication message B 18614 verification process 18616, the vehicle 18302 can authenticate the parking lot 18304.

In the following, a usage of LIDAR-Sensors for OOB Communication will be described in more detail.

The following section describes how the LIDAR Sensor System 10 can be used for OOB communication. From a hardware perspective, the LIDAR Sensor System 10 has all components required for data communication: It has an emitter portion that can be used as a transmitter during a communication session in a communication connection; and it has a detector portion that can be used as a receiver during a communication session in a communication connection.

Various embodiments provide the format and the encoding/decoding of various OOB messages including the data to be transmitted by the LIDAR Sensor System 10.

A list of possibilities is provided in the following:

1. Directly encode the respective OOB message (or parts thereof) onto the LIDAR signal, e.g. using adequate pulse modulation schemes, using pulse train/frame encoding and correlation receiver concepts, or using other adequate signal coding schemes, e.g. such as described in this disclosure with reference to FIG. 131 to FIG. 144.

2. Activity modulation:

a) Encode the OOB message (or parts thereof) in terms of a "time gap" between individual LIDAR measurements, possibly quantified by a multiple of a pre-defined "time slots". In this case, the random OOB message (or parts thereof) could correspond to the number of time slots that are counted in between a first measurement and a second measurement.

b) Same as above where the OOB message is encoded in terms of a "time duration" of LIDAR activity, possibly quantified by a multiple of a pre-defined "time slots".

c) Combination of a) and b).

3. Encoding by the number of subsequently performed measurements:

a) Encode the OOB message (or parts thereof) into the number of subsequently performed measurements before there is a pause between the measurements.

b) Or alternatively, encode the OOB message (or parts thereof) into the number of subsequently performed measurements per time duration.

c) Combination of a) and b).

4. Bit-wise challenge-response exchange/bitwise transmission schemes similar used in RFID systems 5. Modulation of the LIDAR's output power on a larger time scale (small modulation frequency as compared to the LIDAR pulse/measurement repetition frequency) using any SoA modulation scheme (analog or digital).

6. A combination of one or more of the possibilities 2. to 5. as described above.

Which of these methods is (or can be) used for data transmission may depend on several factors including the technical possibilities offered by the respective LIDAR Sensor System 10, or the amount of interdependence that is acceptable without impacting the ranging functionality. Sophisticated LIDAR Sensor Systems 10 may allow for a direct encoding of the OOB message onto the ranging signals (possibility 1.). This may increase the capacity of the OOB communication channel 18314, or decrease the total time that is needed for the information exchange. However, if the respective LIDAR Sensor System 10 does not allow for this possibility, and the OOB communication is lightweight enough, then the other schemes (possibility 2. to 6.) can be employed for OOB message exchange.

In the following, a various characteristics of the scheme of various embodiments will be described in more detail.

The schemes according to various embodiments may have certain characteristics making it suitable for challenging automotive applications using a LIDAR-based OOB communication channel 18314.

- In various embodiments, a scheme may provide an effective means for two factor authentication adding a confirmed location as a second factor for an increased level of security.
- In various embodiments, a scheme may be based on the well-established HMAC scheme with a proven security:
  - Secure against Man in the middle attacks.
  - Secure against replay attacks.
  - Fast computation speed by using hash function.
  - Depending on a required security level, different algorithm such as SHA-1, SHA-256, SHA-384 and SHA-512 can be used, and its cryptographic strength is proven.
- In various embodiments, a scheme may be able to leverage a constrained OOB channel making it possible to use LIDAR sensors 52, or possibly other active sensors/actuators and passive sensors, as part of an OOB communication link (in other words OOB communication channel) in order to provide a confirmed location as the second factor.
  - This may be provided as future cars will have a large number of sophisticated sensors implemented capable of performing such tasks.
  - LIDAR sensors and radar sensors contain an emitter and a detector essentially providing half of a communication link. In scenarios where two vehicles have matching sensors (matching type and FOE/FOV of the sensor) a communication link can be established easily. In scenarios where vehicles communicate with infrastructure the corresponding emitter and detector can be integrated easily with the infrastructure unit.
  - Potentially also the front light of the vehicle can be used as the emitter for a unidirectional OOB channel transmission.
- As sensors with a limited range and a LOS-type of characteristic are used for OOB communication it is very hard to inject/to eavesdrop/to intercept messages on the LIDAR communication link.

In the following, various possible use cases and applications and thus various embodiments will be described in more detail.

Secure and multi-factor authentication is a challenging but highly relevant problem that captures many use cases in the context of Vehicle-to-vehicle (V2V) or Vehicle-to-Infrastructure (V2I) communication that are directly or indirectly related to vehicular mobility. Even more so in the view of future applications including ADAS as well as autonomous driving applications.

Possible application scenarios and use cases include:

Valet parking:

This means that parking manoeuvres are carried out fully automatically by the vehicle (e.g. vehicle 18302). The driver may place the vehicle (e.g. vehicle 18302) in the entry area of the parking facility and activates the function of valet parking (e.g. via a smartphone). As soon as they is wish to continue their journey, they recall the vehicle and take charge of it in the exit area.

Task:

Valet parking facility needs to authenticate itself towards the vehicle, before the vehicle hands over its control towards the valet parking facility.

Platooning:

In transportation, platooning is a method for driving a group of vehicles together. It is meant to increase the capacity of roads via an automated highway system. Platoons decrease the distances between vehicles such as cars or trucks using electronic, and possibly mechanical, coupling. This capability would allow many vehicles such as cars or trucks to accelerate or brake simultaneously. This system also allows for a closer headway between vehicles by eliminating reacting distance needed for human reaction.

Task:

Vehicle platoon needs to authenticate itself towards the vehicle, before the vehicle hands over its control towards the platoon.

Service point, car workshop, vehicle test facility:

Task:

Facility to authenticate itself towards the vehicle, before the vehicle hands over extended access to its internal system to the facility (e.g. vehicle allows extended access to diagnosis functions or configurations, vehicle allows for a firmware update through the facility).

Vehicle access, garage door:

Task:

Vehicle authenticates itself towards some access control mechanism in order to obtain access (e.g. garage door/parking lot access gate only opens after vehicle authenticates itself).

In the following, various possible communication scenarios will be described in more detail.

Various Vehicle-to-vehicle (V2V) or Vehicle-to-Infrastructure (V2I) communication scenarios are covered by the schemes according to various embodiments. In the previous section, an example was provided where the in-band communication was realized over the mobile radio communication network (like LTE, or 5G). However, the schemes according to various embodiments equally works assuming direct V2V or V2I communication, e.g. using radio-frequency-based DSRC (dedicated short range communication)/IEEE 802.11p.

The authentication scheme according to various embodiments are based on a so-called HMAC scheme which is modified and partially extended, in order to leverage a potentially capacity constrained OOB communication channel, e.g. based on a LIDAR Sensor System 10, for secure two-factor authentication.

Various additional embodiments will be provided further below.

In the following, a platoon authentication will be described in more detail.

Platooning is a method for driving a group of vehicles together. The platoon leader (i.e. the vehicle leading the platoon) leads the way and the vehicles (e.g. cars) behind follow the leader. Since the leader control speed and direction, and the following vehicles response to the lead vehicle's decision, if there is a malicious vehicle (e.g. car) in the members of a platooning group, this can cause serious threats, e.g. a malicious vehicle may intentionally cause an accident. Thus, strong mutual authentication solution is required:

- Authenticating the leader: When a vehicle joins the platoon it needs to trust the leader.
- Authenticating the joiner: The leader needs to trust the vehicle that joins the platoon.

For this scenario, two authentication schemes are presented below. In a first exemplary scheme, leader and the joiner perform a mutual authentication via forwarded OOB messages within the platoon. In a second exemplary scheme, the mutual authentication is performed pair-wise between neighbouring vehicles as the platoon grows building up a network of trust (and no additional OOB message forwarding is required).

Mutual Authentication between Leader and Joiner using OOB Message Forwarding:

A first solution provides mutual authentication between the leader and the joiner.

The solution provides the following:

- The vehicles in the platoon may need the capability to forward OOB messages, e.g. messages that are received at a front sensor (sensor arranged at the front side of the vehicle) can be re-emitted at a back sensor (sensor arranged at the rear side of the vehicle); and vice versa. (Remark: The forwarding vehicle is allowed to read these messages without compromising the authentication scheme).
- We also assume that the leader and the joiner can hold pre-shared (e.g. predefined) keys. The leader obtains several keys by some central entity/server in advance (the number of keys is limited by the maximum platoon size, e.g. a hash keychain of the corresponding length). The joiner obtains one key by the same central entity/server when joining. For is key sharing, well known-key distribution schemes can be used.

FIG. 187 describes a service scenario 18700 and a message flow diagram 18750.

FIG. 187 a vehicle platoon 18702 formed e.g. by three vehicles 18704, 18706, 18708 which have LIDAR-based OOB communication capabilities 18710, 18712.

A mutual authentication process starts with a joiner vehicle (a vehicle which wants to join the vehicle platoon 18702) 18714 sending a platooning joining notification message 18752 to the leader vehicle 18704 of the vehicle platoon 18702 via the in-band communication channel 18716 via a mobile radio communication core network 18718 (configured in accordance with a mobile radio communication standard such as 5G or LTE, or the like).

Then, the leader vehicle 18704 of the vehicle platoon 18702 may generate and send a confirmation message 18754 to the joiner vehicle 18714 via the same in-band communication channel 18716.

Then the leader vehicle 18704 of the vehicle platoon 18702 and the joiner vehicle 18714 may exchange its random numbers for mutual authentication (as described above) using LIDAR as an OOB communication channel. The vehicles 18706, 18708 that are in between of the leader vehicle 18704 and the joiner vehicle 18714 in the vehicle platoon 18702, forward the random numbers received on the LIDAR Sensor Systems 10 of the vehicles 18706, 18708 via OOB communication.

In more detail, the leader vehicle 18704 of the vehicle platoon 18702 may generate and transmit a first OOB challenge A message 18756 including a first random number RN_1 also generated and/or stored by the leader vehicle 18704 of the vehicle platoon 18702 to a second vehicle 18706 of the vehicle platoon 18702 via a first LIDAR-based OOB communication connection 18710 between the leader vehicle 18704 and the second vehicle 18706. The second vehicle 18706 receives the OOB challenge A message 18756 and forwards the same in a first forwarding message 18758 via a second LIDAR-based OOB communication connection 18712 between the second vehicle 18706 and the third vehicle 18708 of the vehicle platoon 18702 to the third vehicle 18708. Upon receipt of the first forwarding message 18758 the third vehicle 18708 establishes a third OOB communication connection 18718 to the joiner vehicle 18714. Furthermore, the third vehicle 18708 generates and transmits a second forwarding message 18760 also including the first random number RN_1 to the joiner vehicle 18714 via the third OOB communication connection 18718. The joiner vehicle 18714 may generate a second random number RN_2 and may generate and transmit a second OOB challenge B message 18762 including the second random number RN_2 via the third OOB communication connection 18718 to the third vehicle 18708. The third vehicle 18708 receives the second OOB challenge B message 18762 and forwards the same in a third forwarding message 18764 via the second LIDAR-based OOB communication connection 18712 between the third vehicle 18708 and the second vehicle 18706 of the vehicle platoon 18702 to the second vehicle 18706. The second vehicle 18706 receives the third forwarding message 18764 and forwards the same in a fourth forwarding message 18766 also including the second random number RN_2 via the first LIDAR-based OOB communication connection 18710 between the second vehicle 18706 and the leader vehicle 18704 of the vehicle platoon 18702 to the leader vehicle 18704.

After having received and decoded the fourth forwarding message 18766 including the second random number RN_2, the leader vehicle 18704 may generate a first authentication message A 18768 and transmit the same to the joiner vehicle 18714 via the in-band mobile radio communication channel 18716. The first authentication message A 18768 may be used for authentication of the leader vehicle 18704 and may be verified on a communication peer, e.g. the joiner vehicle 18714. The first authentication message A 18768 may include random numbers to proof that the leader vehicle 18704 is the same communication peer who claims to be the leader vehicle 18704 of the vehicle platoon 18702 (by sending the platoon joining notification message 18752), received the token, and who received the second random number RN_2 via the LIDAR-based OOB communication channels 18718, 18712, and 18710.

The first authentication message A 18768 may have the following content:

$$H(H(PSK \oplus RN\_1) \| H(PSK \oplus RN\_2) \| \text{Token}_B)$$

After having received and decoded the first authentication message A 18768, the joiner vehicle 18714 may generate the same message and may compare the generated one with the one the joiner vehicle 18714 has received via the in-band communication channel 18312 (first authentication message A 18768 verification process 18770). Through the first authentication message A 18768 verification process 18770, the joiner vehicle 18714 can authenticate the leader vehicle 18704.

If the first authentication message A 18768 verification process 18770 was successful, the joiner vehicle 18714 may generate a second authentication message B 18772 and transmit the same to the leader vehicle 18704 via the in-band communication channel 18312. The second authentication message B 18772 may be used for authentication of the joiner vehicle 18714 and is verified on a communication peer, e.g. the leader vehicle 18704. The second authentication message B 18772 may include random numbers to proof that the joiner vehicle 18714 is the same communication peer who sent the confirmation message 18754. The second authentication message B 18772 may be generated by the joiner vehicle 18714 and may include Token_A the joiner vehicle 18714 received from the leader vehicle 18704 when it sent the platooning joining notification message 18752.

The second authentication message B 18772 may have the following content:

$$H(H(PSK \oplus R\_1) \| H(PSK \oplus RN\_2) \| \text{Token}_A)$$

After having received and decoded the second authentication message B 18772, the leader vehicle 18704 may generate the same message and may compare the generated one with the one the leader vehicle 18704 has received via the in-band communication channel 18312 (second authentication message B 18772 verification process 18774). Through the second authentication message B 18772 verification process 18774, the leader vehicle 18704 can authenticate the joining vehicle 18714.

Through the second authentication message B 18772 verification process 18774, the leader vehicle 18704 can verify the authenticity of the joining vehicle 18714 (which illustratively represents a communication peer of the leader vehicle 18704):

- If the communication peer who wants to be authenticated has a pre-shared (cryptographic, e.g. symmetric) key.
- If the communication peer having a pre-shared (cryptographic, e.g. symmetric) key is the same communication peer and has received the token via the in-band communication channel 18312.
- If the communication peer having a pre-shared (cryptographic, e.g. symmetric) key and token is physically presented at the joining vehicle 18714 (location factor) and has received the random number via any OOB communication channel 18314.

When the verification process 18774 is successfully finished, the leader vehicle 18704 generates and sends a finished message 18776 to the parking lot 18304 via the in-band communication channel 18312 to notify the parking lot 18304 that the authentication process has been successfully completed.

This process may provide one or more of the following effects:

- Giving information to the leader vehicle 18704 that the joiner vehicle 18714 who requested joining the vehicle platoon 18702 is physically presented.
- No encryption: All data transferred over the LIDAR-based OOB communication channel does not need to be encrypted. It increases authentication process speed.
- No Man-in-the-middle attack: In case malicious vehicle in the middle of the leader vehicle 18704 and the joiner vehicle 18714 changes random number, both authentication communication peers (the leader vehicle 18704 and the joiner vehicle 18714) can notice. Thus man-in-the-middle attack is thus not possible.
- No replay attack: since random number is only valid during a certain time, a replay attack is not possible.

In various embodiments, the best attack scenario malicious vehicle in the middle of the platooning group can take is not forwarding the random number it received. When the random number is not sent because of the malicious vehicle or channel instability, the joiner vehicle tries sending LIDAR signals directly to the leader vehicle by driving next to the leader vehicle.

Authentication building up a Network of Trust:

A second scheme relies on pair-wise mutual authentications as the platoon grows. In this solution the leader vehicle and the joiner vehicle are not directly authenticated to each other, but rather indirectly using the vehicles within the vehicle platoon to build-up a network of trust.

The concept is as follows:

- From the joiner vehicle's 18714 perspective: The joiner vehicle 18714 trusts the vehicle platoon 18702 leader vehicle 18704, because the leader vehicle 18704 (e.g. car) in front also trusts it. This was also the assumption when the leader vehicle 18704 (e.g. car) in front joined the vehicle platoon 18702 at an earlier point in time. And so on. And thus, by induction, the newly joining vehicle 18714 can trust the leader vehicle 18704 without directly authenticating to it.
- From the leader vehicle's 18704 perspective: The leader vehicle 18704 trusts the vehicle platoon 18702 joiner vehicle 18714, because the vehicle at the back also trusts it. This was also the assumption when the vehicle at the back decided whether the joining vehicle 18714 is allowed to join the vehicle platoon 18702. And so on. And thus, by induction, the leader vehicle 18704 can trust the newly joining vehicle 18704 without directly authenticating to it.

By establishing authenticity in a purely pair-wise fashion no OOB message forwarding is required for various embodiments.

In the following, an authentication using radar, ultrasound, and other sensors for OOB communication will be described in more detail.

The proposed authentication scheme is very lightweight in the sense that the communication on the OOB communication channel only requires small amounts of data to be transmitted (i.e. the proposed OOB communication scheme only requires very low data rates are required). Furthermore, some of the LIDAR encoding schemes presented above (e.g. the possibilities 2. to 6.) have very low hardware and system requirements. This eventually makes the proposed solution suitable for applications using sensors different from LIDAR as well.

By way of example, the following sensors can be used:

- Radar: Similar as a LIDAR sensor 52, a radar sensor has emitting and receiving antennas and circuits that allow for the emission and the reception of electromagnetic pulses. These pulses may be used to transport lightweight OOB messages, using the schemes presented above.
- Ultrasound distance sensor: As with LIDAR and radar, an ultrasound distance sensor has an ultrasound emitter and receiver that could be used for data communication. As the speed of sound is significantly low than the speed of light, less data can be transmitted. However, as the OOB messaging scheme in this work is very lightweight, they are suitable for the proposed authentication scheme.

Front light and simple photodetector:

Besides the ranging sensors presented above, even slow signaling devices (e.g. like the car front light) and simple photo detectors that are cheap, and easy to integrate into cars or infrastructure could be used for one-way OOB communication.

It is to be noted that also a combination of above sensors, also including a LIDAR sensor, could be used to improve security (e.g. several OOB channels can be used jointly to makes attacks more difficult), to improve reliability (e.g. several OOB communication channels can be used for redundancy if one channel fails), or to make the scheme more versatile (e.g. where a communication partner has no LIDAR sensor, an available radar sensor could be used instead).

In the following, a region- or angle-selective emission of OOB messages will be described in more detail.

Due to the line-of-sight (LOS) nature of the LIDAR Sensor System's emission, the communication via the OOB communication channel is inherently secure against injecting/eavesdropping/intercepting of messages (all of which would require an attacker to be positioned within the LOS between the authentication partners, which would arguably be hard to achieve). This effect is valid for both, flash and scanning LIDAR systems.

Since a LIDAR sensor is essentially an imaging sensor where the field-of-view (FoV) is partitioned into pixels/differential angles, the scheme according to various embodiments can be further secured. One aspect is to only emit the OOB messages in certain regions or angular sections of the FoV by making the emission of the OOB messages region-selective and/or scanning angle-selective.

By way of example, the LIDAR Sensor System 10 may be coupled with an object detection stage (which is usually the case with LIDAR, camera, or possibly other sensing devices). In this case, the output of the detection stage can be used to identify portions within the FoV where an intended communication partner (e.g. a vehicle or an infrastructure unit with certain features) is located. Of course, if there are multiple traffic participants, they can be recognized as well as possible targets of authentication-related information exchange (each with individual authentication).

Based on this information, the emission pattern can be adopted and the security-relevant OOB messages are only emitted in the defined region(s) making it harder for an attacker to interject/to eavesdrop/or to intercept messages. The region-selective or angular-selective emission of OOB messages is illustrated in FIG. 188 (for one traffic participant). In order to facilitate this method, the LIDAR Sensor System 10 may use such FOV-related or angular information to trigger the emission of such authentication-related information into the defined FoV (or more than one FoV if there are more traffic objects).

The regions for the OOB communication may be adopted dynamically during runtime, also taking the relative motion of both authentication partners into account.

Furthermore, this process may be facilitated or strengthened by using measurements from other sensor systems, like radar, ultrasound, or camera systems. By way of example, if the data from several systems agree on the validity of an identified object (i.e. of an identified communication partner) including the recognition and the positioning of such an object, then the LIDAR system will send out OOB authentication messages only into that particular FoV.

FIG. 188 shows a FoV 18800 of an exemplary LIDAR Sensor System 10 illustrated by a grid 18802 including an identified intended communication partner (e.g. vehicle 18804 shown in FIG. 188) in accordance with various embodiments.

FIG. 188 illustrates a region-selective emission of OOB messages. After identifying the intended communication partner 18804 within the FoV (black grid) 18802, the corresponding region is identified (illustrated by box 18806) and the security-relevant OOB messages are only emitted in the identified region.

The LIDAR Sensor System 10 may determine the location of the object (e.g. the vehicle) 18804 carrying the other LIDAR Sensor System 10. A controller of the LIDAR Sensor System 10 may control an emitter arrangement taking into consideration the location of the object (e.g. the vehicle) 18804. Illustratively, the controller of the LIDAR Sensor System 10 may control the emitter arrangement to emit the light beam(s) only in direction of the determined location of the determined object (e.g. vehicle) 18804.

Combination with measurement-based Authentication Schemes

The LIDAR Sensor System 10 is a measurement device that is primarily used to obtain depth images of the environment.

Besides LIDAR measurement data, also measurement data from other sensors (radar, ultrasound, camera, etc.) may be used for authentication as described above.

Furthermore, a combination of LIDAR-based measurements with one or more measurements obtained by other means (like measurements obtained by a radar, ultrasound and/or camera system) may be used for authentication.

All of the above measurement-based approaches can be combined with the OOB authentication scheme presented in this disclosure. Depending on the details of the realization, the LIDAR measurements may be used as additional factors to extend the proposed two-factor authentication scheme to three, or more, factors. Alternatively, the combination of the LIDAR measurements together with the OOB challenge may be used to jointly form a single, but stronger, factor within the proposed two-factor authentication scheme.

Authentication Expiration and Renewal Mechanism: In one aspect, the authentication process may include carrying a time stamp (e.g. a token with a time stamp) that is only valid for a pre-defined or per use case defined time period and may have to be renewed after the expiration time. Such renewal can be done automatically by the system or actively triggered by a user.

Further Mobility Use Cases and Applications: In another aspect, the suggested methods can be applied to vehicles (cars, trains, motorbikes, etc.) but also to flying objects (like drones). In the latter case, a vehicle (e.g. a police car) that is equipped with a drone, can release it and conduct authenticated communication via the described methods. In a further embodiment, autonomously driving vehicles, for example in a city environment (so-called city-cars) can couple and de-couple to each other thereby using the described methods for mutual authentication. The same would apply for autonomously driving vehicles that are constructed in a way so that they can split into two sub-vehicles that later can recombine based on the suggested authentication process.

Expanding the Authentication (e.g. towards the Car Interior): In yet a further embodiment, once a vehicle is authenticated, it can relay such authentication to the vehicle interior (passenger cabin) either by Light Based Communication, also called Visual Light Communication (VLC, for both visible or infrared radiation), using (fixedly) vehicle installed interior light fixtures, or via a (short-range) communication means (Bluetooth, Ultrasound). This may enable that communication equipment like Smartphones or Tablets can also be authenticated ($2^{nd}$ level authentication). In order to do so, such equipment may first communicate their identification data via the described communications means to the LIDAR system that then can add such information to the authentication process and relay back the confirmation to the registered equipment. Of course, such second level authentication is not as secure as a first level authentication.

Situation-dependent Adjustment of the Hashing Method: In another aspect, the hashing method (like using certain hash functions like SHA-1, SHA-256, SHA-512 etc.) can be adjusted as a function of vehicle distance (to other objects), or vehicle speed, or vehicle relative speed (in relation to other traffic objects). For example, a vehicle with a lower relative speed in regard to another traffic participant may use stronger hash function since there is more time for computation and data transmission and maybe a need for decreasing the hash-collision possibility. In another aspect, the strength of hash function may be set to a higher standard when, for example, changing from one SAE level (like 4) to another one (like SAE 5 level).

It is to be noted that the determination of the location of the object carrying the other LIDAR Sensor System may be performed by other sensor(s). In principle, the determination of the location of an object may also be performed by other types of sensors associated with (e.g. fixed to) a vehicle (camera, radar, ultrasound, and the like) or in cooperation of a plurality of sensors.

In various aspects of this disclosure, a LIDAR emitter arrangement of the LIDAR Sensor System 10 may be understood to include:

a) that the light source(s) 42 (e.g. the laser diodes) transmit an encoded signal only in direction of the previously determined "object location";

b) the beam steering unit is controlled by a controller the that only the previously determined "object location" is covered by the light beam.

In the following, various aspects of this disclosure will be illustrated:

Example 1an is a LIDAR Sensor System. The LIDAR Sensor System may include a sensor including one or more photo diodes; and one or more processors configured to decode digital data from a light signal received by the one or more photo diodes, the digital data including authentication data to authenticate another LIDAR Sensor System; to authenticate the other LIDAR Sensor System using the authentication data of the digital data; to determine the location of an object carrying the other LIDAR Sensor System; and to control an emitter arrangement taking into consideration the location of the object.

In Example 2an, the subject-matter of example 1an can optionally include that the LIDAR Sensor System further includes a further sensor configured to detect sensor data. The one or more processors are further configured to determine the location of an object carrying the other LIDAR Sensor System using the detected sensor data.

In Example 3an, the subject-matter of example 2an can optionally include that the further sensor is of a sensor type selected from a group of sensor types consisting of: a camera sensor; a radar sensor; and a ultrasonic sound sensor.

In Example 4an, the subject-matter of any one of examples 1 an to 3an can optionally include that the LIDAR Sensor System further includes a light source. The one or more processors are configured to control the light source to emit light in direction of the determined location of the object.

In Example 5an, the subject-matter of example 4an can optionally include that the LIDAR Sensor System further includes a light source. The one or more processors are configured to control the light source to emit light representing an encoded signal in direction of the determined location of the object.

In Example 6an, the subject-matter of any one of examples 1an to 5an can optionally include that the LIDAR Sensor System further includes a beam steering unit; and a beam steering controller configured to control the beam steering unit to cover substantially only the determined location of the object.

In Example 7an, the subject-matter of any one of examples 1an to 6an can optionally include that the LIDAR Sensor System further includes a mobile radio communication transceiver to transmit and/or receive information in accordance with a standardized mobile radio communication protocol.

In Example 8an, the subject-matter of any one of examples 1an to 7an can optionally include that the authentication data include a cryptographic hash value calculated over at least a portion of authentication initializing data provided by the LIDAR Sensor System. The one or more processors are further configured to verify the digital data by checking the cryptographic hash value.

In Example 9an, the subject-matter of example 8an can optionally include that the one or more processors are further configured to verify the digital data by checking the cryptographic hash value using a shared key which is shared by the LIDAR Sensor System and the other LIDAR Sensor System.

In Example 10an, the subject-matter of any one of examples 8an or 9an can optionally include that the authentication initialization data include one or more random numbers.

In Example 11 an, the subject-matter of any one of examples 3an to 10an can optionally include that the one or more processors are further configured to select a hash function for checking the cryptographic hash value in accordance with one or more selection criteria.

In Example 12an, the subject-matter of any one of examples 1an to 11an can optionally include that the one or more selection criteria are selected from a group of selection criteria consisting of: a speed of the vehicle; an SAE level; and an importance level.

In Example 13an, the subject-matter of any one of examples 1an to 12an can optionally include that the one or more processors are further configured to verify the digital data using a shared key selected from a set of a plurality of shared keys.

In Example 14an, the subject-matter of any one of examples 1an to 13an can optionally include that the one or more processors are further configured to generate a session key; and to encrypt data using the session key.

In Example 15an, the subject-matter of any one of examples 1an to 14an can optionally include that the one or more processors are further configured to generate a session key; and to decrypt encrypted data using the session key.

In Example 16an, the subject-matter of any one of examples 1an to 15an can optionally include that the LIDAR Sensor System further includes one or more further sensors being of a different type than the sensor.

In Example 17an, the subject-matter of example 16an can optionally include that the one or more further sensors include one or more sensors selected from a group consisting of: an ultrasound sensor; a radar sensor; and a short range mobile radio sensor.

In Example 18an, the subject-matter of any one of examples 16an or 17an can optionally include that the one or more processors are configured to select one or more further sensors to receive sensor data signals; and to decode digital data from the sensor data signals received by the selected one or more further sensors.

Example 19an is a LIDAR Sensor System. The LIDAR Sensor System may include one or more processors configured to encode digital data including authentication data to authenticate the LIDAR Sensor System; a light source configured to emit a light signal; a light source controller configured to control the light source to emit the light signal, wherein the light signal includes the encoded digital data, and an optical component configured to control an angle of emission of the emitted light signal. The light source controller is further configured to control the optical component to select the angle of emission such that the light signal is emitted towards another LIDAR Sensor System. The selected angle of emission of the emitted light signal covers a portion of a field of view of the LIDAR Sensor System.

In Example 20an, the subject-matter of example 19an can optionally include that the LIDAR Sensor System further includes a mobile radio communication transceiver to transmit and/or receive information in accordance with a standardized mobile radio communication protocol.

In Example 21an, the subject-matter of any one of examples 19an or 20an can optionally include that the LIDAR Sensor System further includes a random number generator to generate one or more random numbers. The one or more processors are configured to insert the generated one or more random numbers to the encoded digital data.

In Example 22an, the subject-matter of any one of examples 19an to 21an can optionally include that the one or more processors are configured to generate a first message including the encoded digital data and authentication initialization data for the other LIDAR Sensor System.

In Example 23an, the subject-matter of any one of examples 19an to 22an can optionally include that the one or more processors are further configured to receive an authentication response message from the other LIDAR Sensor System; and to authenticate the other LIDAR Sensor System using the content of the received authentication response message.

In Example 24an, the subject-matter of example 23an can optionally include that the authentication response message includes a cryptographic hash value calculated over at least a portion of the received authentication data.

In Example 25an, the subject-matter of example 24an can optionally include that the cryptographic hash value is calculated using a cryptographic key shared by the LIDAR Sensor System and the other LIDAR Sensor System.

In Example 26an, the subject-matter of any one of examples 24an or 25an can optionally include that the one or more processors are further configured to select a hash function for calculating the hash value in accordance with one or more selection criteria.

In Example 27an, the subject-matter of any one of examples 23an to 26an can optionally include that the LIDAR Sensor System further includes a mobile radio communication transceiver to transmit and/or receive information in accordance with a standardized mobile radio communication protocol. The one or more processors are further configured to receive the authentication response message via the mobile radio communication transceiver.

In Example 28an, the subject-matter of any one of examples 19an to 27an can optionally include that the one or more processors are further configured to generate a session key; and to encrypt data using the session key.

In Example 29an, the subject-matter of any one of examples 19an to 28an can optionally include that the one or more processors are further configured to generate a session key; and to decrypt encrypted data using the session key.

In Example 30an, the subject-matter of any one of examples 19an to 29an can optionally include that the LIDAR Sensor System further includes one or more further sensors being of a different type than the sensor.

In Example 31an, the subject-matter of example 30an can optionally include that the one or more further sensors include one or more sensors selected from a group consisting of: an ultrasound sensor; a radar sensor; and a short range mobile radio sensor.

In Example 32an, the subject-matter of any one of examples 30an or 31an can optionally include that the one or more processors are configured to select one or more further sensors to receive sensor data signals; and to decode digital data from the sensor data signals received by the selected one or more further sensors.

Example 33an is a LIDAR Sensor System. The LIDAR Sensor System may include a sensor including one or more photo diodes; one or more processors configured to decode digital data from a light signal received by the one or more photo diodes, the digital data including a request for authentication and authentication initializing data transmitted by another LIDAR Sensor System; to generate an authentication response message including authentication data calculated using at least a portion of the authentication initialization data; to determine the location of an object carrying the other LIDAR Sensor System; and to control a receiver optics arrangement taking into consideration the location of the object.

In Example 34an, the subject-matter of example 33an can optionally include that the LIDAR Sensor System further includes a mobile radio communication transceiver to transmit and/or receive information in accordance with a standardized mobile radio communication protocol.

In Example 35an, the subject-matter of any one of examples 33an or 34an can optionally include that the one or more processors are configured to calculate a cryptographic hash value over at least a portion of the received authentication initialization data.

In Example 36an, the subject-matter of example 35an can optionally include that the cryptographic hash value is calculated using a cryptographic shared key shared by the LIDAR Sensor System and the other LIDAR Sensor System.

In Example 37an, the subject-matter of any one of examples 35an or 36an can optionally include that the authentication initialization data include one or more random numbers. The one or more processors are further configured to calculate the cryptographic hash value over at least a portion of the received one or more random numbers.

In Example 38an, the subject-matter of any one of examples 35an to 37an can optionally include that the one or more processors are further configured to select a hash function for calculating the cryptographic hash value in accordance with one or more selection criteria.

In Example 39an, the subject-matter of any one of examples 33an to 38an can optionally include that the LIDAR Sensor System further includes a mobile radio communication transceiver to transmit and/or receive information in accordance with a standardized mobile radio communication protocol. The one or more processors are further configured to transmit the authentication response message via the mobile radio communication transceiver.

In Example 40an, the subject-matter of any one of examples 33an to 39an can optionally include that the one or more processors are further configured to generate a session key; and to encrypt data using the session key.

In Example 41an, the subject-matter of any one of examples 33an to 40an can optionally include that the one or more processors are further configured to generate a session key; and to decrypt encrypted data using the session key.

In Example 42an, the subject-matter of any one of examples 33an to 41an can optionally include that the LIDAR Sensor System further includes one or more further sensors being of a different type than the sensor.

In Example 43an, the subject-matter of example 42an can optionally include that the one or more further sensors include one or more sensors selected from a group consisting of: an ultrasound sensor; a radar sensor; and a short range mobile radio sensor.

In Example 44an, the subject-matter of any one of examples 42an or 43an can optionally include that the one or more processors are configured to select one or more further sensors to receive sensor data signals; and to decode digital data from the sensor data signals received by the selected one or more further sensors.

Example 45an is a vehicle. The vehicle may include a LIDAR Sensor System of any one of Examples 1an to 44an.

Example 46an is a vehicle group controller. The vehicle group controller may include a LIDAR Sensor System of any one of Examples Ian to 44an; a group controller configured to form a group of authenticated vehicles; and to commonly control the vehicles of the group.

Example 47an is a method of operating a LIDAR Sensor System. The method may include a sensor comprising one or more photo diodes receiving a light signal; decoding digital data from the light signal received by the one or more photo diodes, the digital data comprising authentication data to authenticate another LIDAR Sensor System; authenticating the other LIDAR Sensor System using the authentication data of the digital data; determining the location of an object carrying the other LIDAR Sensor System; and controlling a receiver optics arrangement taking into consideration the location of the object.

In Example 48an, the subject-matter of example 47an can optionally include that the method further includes a mobile radio communication transceiver transmitting and/or receiving information in accordance with a standardized mobile radio communication protocol.

In Example 49an, the subject-matter of any one of examples 47an or 48an can optionally include that the authentication data include a cryptographic hash value calculated over at least a portion of authentication initialization data provided by the LIDAR Sensor System. The method may further include decoding the digital data by checking the cryptographic hash value.

In Example 50an, the subject-matter of example 49an can optionally include that decoding the digital data includes checking the cryptographic hash value using a shared key shared by the LIDAR Sensor System and the other LIDAR Sensor System.

In Example 51an, the subject-matter of any one of examples 49an or 50an can optionally include that the authentication initialization data include one or more random numbers.

In Example 52an, the subject-matter of any one of examples 49an to 51an can optionally include that a hash function for checking the cryptographic hash value is selected in accordance with one or more selection criteria.

In Example 53an, the subject-matter of any one of examples 47an to 52an can optionally include that the digital data are decoded using a shared key selected from a set of a plurality of shared keys.

In Example 54an, the subject-matter of any one of examples 47an to 53an can optionally include that the method further includes generating a session key; and encrypting data using the session key.

In Example 55an, the subject-matter of any one of examples 47an to 54an can optionally include that the method further includes generating a session key; and decrypting encrypted data using the session key.

In Example 56an, the subject-matter of any one of examples 47an to 55an can optionally include that the LIDAR Sensor System further includes one or more further sensors being of a different type than the sensor.

In Example 57an, the subject-matter of example 56an can optionally include that the one or more further sensors include one or more sensors selected from a group consisting of: an ultrasound sensor; a radar sensor; and a short range mobile radio sensor.

In Example 58an, the subject-matter of any one of examples 56an or 57an can optionally include that the method further includes selecting one or more further sensors to receive sensor data signals; and decoding digital data from the sensor data signals received by the selected one or more further sensors.

Example 59an is a method of operating a LIDAR Sensor System. The method may include encoding digital data including authentication data to authenticate the LIDAR Sensor System; emitting a light signal; and controlling the emission of the light signal. The light signal includes the encoded digital data. Controlling the emission of the light signal includes selecting an angle of emission such that the light signal is emitted towards another LIDAR Sensor System. The selected angle of emission of the emitted light signal covers a portion of a field of view of the LIDAR Sensor System.

In Example 60an, the subject-matter of example 59an can optionally include that the method further includes a mobile radio communication transceiver transmits and/or receives information in accordance with a standardized mobile radio communication protocol.

In Example 61an, the subject-matter of any one of examples 59an or 60an can optionally include that the method further includes generating one or more random numbers; and inserting the generated one or more random numbers to the encoded digital data.

In Example 62an, the subject-matter of any one of examples 59an to 61an can optionally include that the method further includes generating a first message comprising the encoded digital data and authentication initialization data for the other LIDAR Sensor System.

In Example 63an, the subject-matter of any one of examples 59an to 62an can optionally include that the method further includes receiving an authentication response message from the other LIDAR Sensor System; and authenticating the other LIDAR Sensor System using the content of the received authentication response message.

In Example 64an, the subject-matter of example 63an can optionally include that the authentication response message includes a cryptographic hash value calculated over at least a portion of the received authentication data.

In Example 65an, the subject-matter of example 64an can optionally include that the cryptographic hash value is calculated using a cryptographic key shared by the LIDAR Sensor System and the other LIDAR Sensor System.

In Example 66an, the subject-matter of any one of examples 64an or 65an can optionally include that a hash function for checking the cryptographic hash value is selected in accordance with one or more selection criteria.

In Example 67an, the subject-matter of any one of examples 63an to 66an can optionally include that the method further includes a mobile radio communication transceiver transmitting and/or receiving information in accordance with a standardized mobile radio communication protocol; and receiving the authentication response message via the mobile radio communication transceiver.

In Example 68an, the subject-matter of any one of examples 59an to 67an can optionally include that the method further includes generating a session key; and encrypting data using the session key.

In Example 69an, the subject-matter of any one of examples 59an to 68an can optionally include that the method further includes generating a session key; and decrypting encrypted data using the session key.

In Example 70an, the subject-matter of any one of examples 59an to 69an can optionally include that the LIDAR Sensor System further includes one or more further sensors being of a different type than the sensor.

In Example 71an, the subject-matter of example 70an can optionally include that the one or more further sensors include one or more sensors selected from a group consisting of: an ultrasound sensor; a radar sensor; and a short range mobile radio sensor.

In Example 72an, the subject-matter of any one of examples 70an or 71an can optionally include that the method further includes selecting one or more further sensors to receive sensor data signals; and decoding digital data from the sensor data signals received by the selected one or more further sensors.

Example 73an is a method of operating a LIDAR Sensor System. The method may include a sensor including one or more photo diodes receiving a light signal; decoding digital data from the light signal received by the one or more photo diodes, the digital data including a request for authentication and authentication initialization data transmitted by another LIDAR Sensor System; generating an authentication response message including authentication data calculated using at least a portion of the authentication initialization data; determining the location of an object carrying the other LIDAR Sensor System; and controlling a receiver optics arrangement taking into consideration the location of the object.

In Example 74an, the subject-matter of example 73an can optionally include that the method further includes a mobile radio communication transceiver transmitting and/or receiving information in accordance with a standardized mobile radio communication protocol.

In Example 75an, the subject-matter of any one of examples 73an or 74an can optionally include that the method further includes calculating a cryptographic hash value over at least a portion of the received authentication initialization data.

In Example 76an, the subject-matter of example 75an can optionally include that the cryptographic hash value is calculated using a cryptographic shared key shared by the LIDAR Sensor System and the other LIDAR Sensor System.

In Example 77an, the subject-matter of any one of examples 75an or 76an can optionally include that the authentication initialization data include one or more random numbers. The cryptographic hash value is calculated over at least a portion of the received one or more random numbers.

In Example 78an, the subject-matter of any one of examples 75an to 77an can optionally include that a hash function for checking the cryptographic hash value is selected in accordance with one or more selection criteria.

In Example 79an, the subject-matter of any one of examples 75an to 78an can optionally include that the method further includes a mobile radio communication transceiver transmitting and/or receiving information in accordance with a standardized mobile radio communication protocol. The one or more processors are further configured to transmit the authentication response message via the mobile radio communication transceiver.

In Example 80an, the subject-matter of any one of examples 73an to 79an can optionally include that the method further includes generating a session key; and encrypting data using the session key.

In Example 81an, the subject-matter of any one of examples 73an to 80an can optionally include that the method further includes generating a session key; and decrypting encrypted data using the session key.

In Example 82an, the subject-matter of any one of examples 73an to 81an can optionally include that the LIDAR Sensor System further includes one or more further sensors being of a different type than the sensor.

In Example 83an, the subject-matter of example 82an can is optionally include that the one or more further sensors include one or more sensors selected from a group consisting of: an ultrasound sensor; a radar sensor; and a short range mobile radio sensor.

In Example 84an, the subject-matter of any one of examples 82an or 83an can optionally include that the one or more processors are configured to select one or more further sensors to receive sensor data signals;

and to decode digital data from the sensor data signals received by the selected one or more further sensors.

Example 85an is a computer program product. The computer program product may include a plurality of program instructions that may be embodied in non-transitory computer readable medium, which when executed by a computer program device of a LIDAR Sensor System according to any one of Examples 1an to 44an, cause the LIDAR Sensor System to execute the method according to any one of the Examples 47an to 84an.

Example 86an is a data storage device with a computer program that may be embodied in non-transitory computer readable medium, adapted to execute at least one of a method for LIDAR Sensor System according to any one of the above method Examples, a LIDAR Sensor System according to any one of the above LIDAR Sensor System Examples.

Vehicles (e.g., automobiles) are becoming more and more autonomous or automated (e.g., capable of performing various functions, such as driving, with minimal human assistance). A vehicle may be or will be configured to navigate an environment with little or finally without any direct or indirect human assistance. For implementing the desired autonomous functions a plurality of sensors and/or sensor systems may be provided in a vehicle, such as cameras (e.g., night and day vision cameras), ultrasound sensors (e.g., ultrasound emitting and sensing systems), inertial sensors, LIDAR and/or RADAR environmental scanning and detection systems, and the like.

The output of the sensors may be fused (e.g., data from different sensors may be merged together) and analyzed. The sensor signals may be preprocessed by a sensor device itself (e.g., by a sensor system itself), or the sensor signals may be processed by one or more systems or devices of the vehicle (e.g., a data processing system, a body control system, a board computer, a data analysis, handling and storage device, and the like).

A sensor data analysis system may be assisted by intelligent sensor fusion and camera image recognition with subsequent object classification analysis. The object classification analysis may lead to data points that may be used to define and execute proper vehicle control commands (e.g., vehicle steering). Non-autonomous or partly-autonomous vehicles (e.g., non-autonomously or partly-autonomously driving vehicles) may benefit from such measurements and analysis procedures.

Sensing and data analysis may be, however, quite cumbersome and may require (and consume) many resources, e.g. computing power and data storage. In addition, there may be traffic situations in which the computations associated with the scene analysis may require an excessive amount of time, or a mathematical solution may not exist. In such situations, proper and time-critical vehicle control may not be provided.

In a conventional system (e.g., in a conventional vehicle or in a conventional traffic control device), various methods and functionalities may be provided or implemented in view of the above-mentioned problem. A traffic density map may be used for traffic flow control. Such a traffic density map may be updated from time to time by using a vehicle's radar scanning measurement system. A method may be provided for forecasting traffic flow conditions at selected locations and at selected days and times. A method may be provided for circumventing obstacles, for example based on GPS-based navigation. A method may be realized for displaying traffic flow conditions on a display. A method may be provided for decelerating a vehicle if many traffic signals are on the route. A method may be implemented for focusing a driver's attention if, based on environmental mapping data, inclement weather conditions are to be expected. Risk associated with travelling a route along navigable paths may be assessed, and such information may be used for proper vehicle guidance. A database may be generated and used that contains historic traffic law enforcement data as well as crowd sourced records, and predictive processing means for proper vehicle guidance based on said database may be implemented. Route optimization based on user selectable thematic maps may be achieved. It may also be possible to monitor vehicle trajectories and traffic densities based on Smartphone GPS data. Furthermore, car manufactures may utilize other techniques using automatically submitted vehicle meta-data. It may also be possible to use a vehicle's close-range ultrasound detection system to measure and characterize an environment in the vicinity and, if done with many vehicles driving the same road, to generate an object map.

However, a conventional system may be limited to a specific scenario, e.g. to small-scale traffic security or to large-scale route planning situation. A conventional system may also not provide a regular or continuous update and aggregation of traffic maps.

In various embodiments, a method configured to assist one or more actions associated with vehicle control may be provided. The method may be configured to adapt (e.g., to optimize) the generation of sensor data and/or the generation of vehicle commands (e.g., vehicle control commands) based on one or more (e.g., GPS-coded) traffic-related conditions relevant for the vehicle.

In various embodiments, a method configured to assist one or more actions associated with determining (e.g., monitoring and/or predicting) one or more traffic-related conditions may be provided. The method may be configured to modify or update data (e.g., traffic map data) describing one or more traffic-related conditions based on data provided by one or more sources (e.g., sensor data provided by one or more vehicles and/or traffic control data provided by one or more traffic control devices).

In a complex scenario (e.g., a complex traffic scenario), for example high traffic density, confusing traffic routings, high number of lanes and intersections, and the like, the sensor data from one's own vehicle (e.g., provided by one or more sensor systems of one's own vehicle) may not be sufficient for a safe (e.g., hazard-free) vehicle control. Additional data (e.g., additional instructions and/or commands) provided from outside one's own vehicle (e.g., provided by a vehicle-external device or system) may be used in such cases for improved traffic security. Additional data may also be used for providing predictions about one or more traffic-related conditions, for example for route planning predictions. Illustratively, such additional data may be used for efficient route planning on a large (e.g., distance) scale, for example on the km-scale.

Various embodiments may be directed to providing fast and reliable vehicle control (e.g., fast and reliable ways to steer a vehicle) through a known or unknown environment. The method (and/or the device) described herein may be applicable both on a small scale (e.g., from a few meters up to tens of meters, for example from about 1 m up to about 100 m) and on a large scale (from several hundreds of meters up to a few kilometers, for example from about 200 m up to about 10 km).

In various embodiments, a traffic map (TRM) may be provided. The traffic map may describe or may include information that may be used for vehicle control (e.g., vehicle guidance control) and/or environmental sensing. Illustratively, the traffic map may describe one or more traffic-related conditions (e.g., one or more traffic scenarios). The information or the data described or included in a traffic map may be referred to as traffic map data.

The traffic map may include one or more sets or subsets of information (e.g., sets or subsets of traffic map data). The traffic map may include one or more traffic density maps (TDM) (illustratively, one or more maps describing one or more determined or measured traffic-related conditions, such as density of vehicles, visibility, weather, and the like). The traffic map may include one or more traffic density probability maps (TDPM) (illustratively, one or more maps describing one or more predicted or forecasted traffic-related conditions). The traffic map may include one or more traffic event maps (TEM) (illustratively, one or more maps describing one or more traffic-related events, such as an accident, the occurrence of street damage, and the like). A traffic-related condition may be same or similar to a traffic condition and/or to an environmental setting, as described, for example, in relation to FIG. 123 and FIG. 124 to FIG. 126, respectively. Additionally or alternatively, a traffic map may include information determined according to the method described, for example, in relation to FIG. 85 to FIG. 88.

The traffic map may be GPS-coded (e.g., the traffic density map and/or the traffic density probability map and/or the traffic event map may be GPS-coded). Illustratively, the traffic map data (e.g., each set or subset of traffic map data) may be associated with a GPS-position or GPS-coordinates (in other words, the traffic map data may be GPS-coded). The traffic map data may further describe or include identification information, such as time and space correlated data. By way of example, a set of traffic map data may include a time stamp and/or location data, for example associated with one or more reference devices such as a road infrastructure element, a traffic control device, and the like. Illustratively, the one or more traffic-related conditions may be GPS-coded, e.g. they may be associated with a location of a vehicle (e.g., with the GPS-coordinates of a vehicle).

In various embodiments, a traffic map (e.g., the traffic map data) may include one or more (e.g., GPS-coded) commands for a vehicle's sensor system (e.g., one or more instructions for one or more sensor systems of a vehicle). As an example, a traffic map may include one or more instructions for a LIDAR sensor system. A vehicle (e.g., a sensor device) configured to use (in other words, to receive and to interpret) such traffic map may (e.g., automatically) perform sensing measurements which are optimized based on said commands. Illustratively, a vehicle may be configured to control (e.g., to configure) the one or more sensor systems based on the one or more instructions included in the traffic map. This may provide the effect of an improved environmental scanning (e.g., of an improved sensing of the environment surrounding the vehicle). By way of example, environmental scanning may be performed with focused Field-of-View (FoV) sensing (e.g., with a narrower or reduced FoV), and/or with optimized sensor alignment and orientation, and/or with higher measurement sensitivity and accuracy (e.g., with higher resolution), and/or with lower LIDAR laser emitting power, at least for one or more parts of the FoV. A reduced light emitting power (e.g., LIDAR laser emitting power) may be beneficial for reducing safety related concerns, for example for detecting and measuring an object at short distances without posing any risk to bystanders or pedestrians. Illustratively, the traffic map data may include one or more instructions for one or more sensor systems of a vehicle, which instructions are adapted according to the one or more traffic-conditions relevant for the vehicle (e.g., based on the location and/or the route of the vehicle). The one or more sensor systems may thus generate or provide sensor data in the adapted (e.g., modified) configuration.

In various embodiments, the traffic map data may be provided (e.g., directly fed) to a vehicle control system and/or sensor control system (e.g., a sensor management system). The vehicle may be configured to use the provided data (e.g., information and/or instructions) for vehicle control and/or sensor control (e.g., for route planning, adjustment of travel speed, and sensing purposes). The sensor control system (e.g., a LIDAR Sensor Management System) may be configured to act on (e.g., to control) one or more sensors or sensor systems (e.g., on a LIDAR sensing device) according to the received instructions. This way, GPS-coded sensor measurements may be performed (and GPS-coded sensor data may be generated).

Illustratively, in case a vehicle approaches a problematic zone, as communicated by the traffic map information, one or more sensor systems of the vehicle (e.g., a camera system, a LIDAR system, a RADAR system, an ultrasound system, and the like) may be instructed to (e.g., automatically) start to measure the environment with higher accuracy or sensitivity (e.g., with higher resolution). Such optimized sensor data sets may be transmitted to the traffic map provider. Further illustratively, a traffic map (e.g., a traffic density probability map) may include GPS-coded information (and/or instructions) describing which sensor system or which combinations of sensor systems may be selected for the specific (e.g., determined or predicted) traffic-related condition(s) (e.g., which sensor system would be best suited for a required relevant measurement). Said GPS-coded information may thus have the effect that improved sensor data (e.g., measurement data) may be provided. Stated in a different fashion, a traffic map (e.g., a traffic density probability map) may be GPS-coded by the traffic map provider, such that the traffic map includes executable GPS-coded commands or command inputs for vehicle sensor control and/or sensor data reporting.

The traffic map may be provided taking into consideration the specific sensors or sensor systems of a vehicle. Illustratively, the traffic map data (e.g., the instructions described by the traffic map data) may be adjusted (in other words, tailored) based on a sensor configuration of the vehicle (e.g., on a configuration of one or more sensor systems of the vehicle). The configuration may describe information on the sensor systems (and/or on the sensors) of the vehicle, such as type, number, location, orientation, and the like. Illustratively, the sensor configuration may be taken into account such that the provided instructions may be implemented by the vehicle receiving the traffic map. By way of example, the vehicle may be configured to transmit sensor configuration data (e.g., included or stored in a Sensor Information Matrix) to the traffic map provider. The sensor configuration data may describe the configuration of one or more sensor systems of the vehicle. The vehicle may be configured to transmit the sensor configuration data to the traffic map provider only once, for example at the beginning of a journey. Additionally or alternatively, the vehicle may be configured to transmit a vehicle-identification code (e.g., a univocal vehicle code) to the traffic map provider. The vehicle-identification code may be associated with the sensor configuration of the vehicle (illustratively, the traffic map provider may be configured to determine or retrieve the sensor configuration of the vehicle based on the vehicle-identification code). By way of example, the sensor configuration and/or the vehicle-identification code may be included in the sensor data.

A sensor system may be controlled (e.g., adjusted and/or optimized), at least temporarily, based on commands provided by the vehicle control system (or by a sensor control system) generated according to input data from the traffic map (or the traffic density probability map). By way of example, for a LIDAR sensor system, a LIDAR beam wavelength, an intensity, and a radiation into a certain segment of the Field-of-View may be modified according to the instructions. As a further example, a sensitivity of a sensor system may be increased at a certain traffic location or in association with a certain traffic-related condition. As another example, in case a vehicle includes a plurality of sensor systems of a same type (e.g., a plurality of LIDAR sensor systems), only some (e.g., a subset) or all may be operated according to the instructions (e.g., only some or all may be active).

In various embodiments, the instructions (e.g., the GPS-coded input data) provided by the traffic map may include information to be emitted by a sensor system (e.g., to be encoded in an output of the sensor system, for example in a beam used to interrogate the environment). By way of example, the GPS-coded input data as provided by the traffic map information may trigger a LIDAR sensor system to encode certain information and distribute it to the environment (e.g., to transmit information to another LIDAR system, for example to another vehicle), for example by using variations of pulse shapes and/or lengths and/or pulse timings and/or pulse positions and/or pulse amplitude modulations, or by emitting laser pulses in a stochastic manner.

Additionally or alternatively, the instructions (e.g., the GPS-coded input data) provided by the traffic map may include datasets and/or commands useful for other vehicle functions (e.g., not only for the sensor systems). By way of example, instructions for control of lighting functions (e.g., of the headlights), control of displays (e.g., interior and/or exterior), control of interior ambient lighting, control of acoustic signals, and the like.

In various embodiments, the vehicle may be configured to transmit the sensor data to a vehicle-external device (for example, the vehicle may include a control and communication system). The sensor data may be transmitted (e.g., provided) to the device or the system that provided (e.g., transmitted) the traffic map to the vehicle (e.g., to a traffic map provider, also referred to as traffic control station). The sensor data may be GPS-coded (e.g., the vehicle or the traffic map provider may be configured to label or associate the sensor data with the GPS-coordinates where the sensor data were generated). Illustratively, the sensor data may be generated by the one or more sensor systems being controlled according to the (e.g., GPS-coded) instructions included in the traffic map. By way of example, the GPS-coded sensor data may be provided by means of GPS-coded LIDAR sensing device control, which may be adjusted and optimized based on the traffic map data. The sensor data may be transmitted as raw data or as preprocessed data. By way of example, preprocessing may include performing (e.g., GPS-based) object recognition and classification.

The vehicle may be configured to interact (e.g., to communicate) with the traffic map provider. Illustratively, a vehicle using (e.g., receiving) a traffic map may actively interact with the traffic map database. The vehicle may be configured to contribute additional GPS-coded input about a past or current (e.g., problematic) traffic situation and/or location. The vehicle may be configured to use the traffic map information for sensor control, for example based on the correlated (e.g., embedded) GPS-coded commands. By way of example, a vehicle may be configured (e.g., instructed) to measure a neuralgic traffic location with increased sensitivity and accuracy, using one or more (e.g., of same or different) sensor systems. The vehicle may be configured (e.g., instructed) to provide such data (e.g., sensor data) back to the provider of the corresponding traffic map (e.g., the traffic map including the corresponding instructions), for example to the provider of such traffic density probability map. The back-reported data (or data sets) may be raw data (e.g., generic data) or the data may be already preprocessed, for example by a LIDAR Control and Communication System.

Various embodiments may be directed to providing a regular or continuous update and aggregation of traffic maps based on collection and analysis of (e.g., GPS-coded) data from one or more sources. The traffic map provider may be configured to receive sensor data from one or more vehicles (e.g., provided by one or more sensor systems or sensors of a vehicle, such as LIDAR sensors, cameras, and the like). The traffic map provider may be configured to receive additional data (e.g., traffic control data, for example GPS-coded) from one or more other devices (e.g., traffic-monitoring devices), such as one or more traffic control devices. The traffic map provider may be remote (e.g., not located at the location of a vehicle or of a traffic control device). The traffic map provider may be or may include a network of traffic map providers (e.g., a network of traffic control stations). Each traffic map provider may be assigned to a certain area or region (e.g., it may be configured to receive data from vehicles and/or traffic control devices in that area). The traffic map providers may be configured to communicate with each other, e.g. to exchange the received data.

A traffic control device may be positioned at a traffic-relevant location (e.g., at a point of interest for determining one or more traffic-related conditions, e.g. at a neuralgic traffic point). By way of example, a traffic control device may be installed (e.g., located) at a large intersection, at a junction, in a pedestrian zone, at a tunnel, at a bridge, and the like. A traffic control device may be configured to determine (e.g., to monitor, or to measure) one or more traffic-related conditions and/or events (e.g., traffic flow, weather condition, an accident, and the like). The traffic control device may be configured to generate corresponding traffic control data describing the determined traffic-related conditions/events. The traffic control device may be configured to send (e.g., to distribute) the traffic control data to one or more traffic map providers.

The traffic map provider may be configured to receive sensor data from a vehicle (or from a plurality of vehicles, or a plurality of traffic participants) and/or traffic control data from one or more traffic control devices. The (e.g., transmitted and/or received) data may be encrypted. The data encryption may provide anonymity and data reliability. Illustratively, the traffic map provider may be understood as a distributed system (e.g., a distributed network) that collects, aggregates, and analyzes the received data. The traffic map provider may be configured to determine a traffic map (e.g., one or more traffic maps, each associated with a respective location). By way of example, the traffic map provider may be configured to generate a traffic map based on (e.g., aggregating) the received sensor data and/or the received traffic control data. As another example, the traffic map provider may be configured to update (e.g., to adjust) a traffic map based on the received sensor data and/or the received traffic control data. Illustratively, point clouds may be generated in a traffic map, for example in a traffic density map, which point clouds reflect (in other words, describe) historic traffic-related conditions (e.g., time-integrated or averaged data for specific week days, calendar days or day times). Additionally or alternatively, the point clouds may reflect current (in other words, actual) traffic-related conditions (e.g., current vehicle and pedestrian density, vehicle speed and trajectory, pedestrian location and direction of movement, and the like). The point clouds may also be used to generate forward looking (in other words, predicted or forecasted) traffic-related condition probabilities, e.g. the point clouds may be used for traffic anticipation. Illustratively, the traffic map provider may be configured to determine (e.g., predict) one or more probabilities associated with one or more traffic-related conditions (e.g., the likelihood of a traffic-related condition to occur, for example at a specific time during a day or a month).

Each traffic map information may be associated with a respective location, e.g. it may be GPS-coded. This may provide the effect that the location where a traffic-related condition (or event) was determined may be known (e.g., exactly or with a reasonable degree of approximation). By way of example, a GPS-radius (e.g., a few meters or hundreds of meters, for example from about 1 m to about 500 m) may be provided in association with a recorded traffic-related condition. The GPS-radius may describe the area or circumference around a recorded traffic-related condition. The GPS-coding may enable providing to a vehicle accurate traffic information and/or anticipation of traffic events in a timely manner based on its current GPS-location. By way of example, the information provided to the vehicle may include information on anticipated events (e.g., a diversion route, a traffic jam, and the like) that may occur along a selected travel route at a certain time point (e.g., in a certain day or at a certain period during a day). The travel route may be transmitted to the traffic map provider (e.g., it may be known by the traffic map provider).

In various embodiments, the traffic map provider may be configured to continuously update (e.g., improve) the traffic map based on the GPS-coded environment scanning and/or object detection and classification. Thus, the accuracy of traffic analysis, traffic forecast and situational awareness may be continuously refined, thus leading to improved vehicle guidance and therefore to increased traffic safety.

In various embodiments, the traffic map provider may be configured to perform the mapping at various intervals, e.g. the traffic map is provider may be configured to generate and/or update a traffic map at various time intervals (e.g., every day, every hour, every 30 minutes, every 10 minutes or every 5 minutes). The individual mappings (e.g., the individual traffic maps corresponding to different time points) may be used to generate (e.g., to calculate) a combined traffic map, e.g. a time-integrated traffic map. The traffic map provider may be configured to determine time-based predictions (e.g., probabilities) of (e.g., anticipated) traffic-related conditions and/or events based on the time-integrated traffic map (e.g., based on a time-integrated traffic density map). The traffic map provider may employ Machine Learning (ML) methods and/or Artificial Intelligence (AI) methods, for example including or based on a Neural Network (e.g., a Convoluted or Convolutional Neural Network). Said Machine Learning (ML) methods and/or Artificial Intelligence (AI) methods may assist the prediction and/or anticipation of traffic-related conditions and/or events. The traffic map provider may also employ different (e.g., predictive) methods, such as Bayesian reasoning methods.

In various embodiments, the one or more traffic-related conditions (e.g., the traffic-related information) described by a traffic map may be of various nature. By way of example, a traffic map (e.g., the traffic map data) may describe aerial information (e.g., provided by a data provider, such as Google Maps or Nokia's Here). The aerial information may provide coordinates (e.g., GPS-coordinates) of different traffic-relevant objects and/or locations, such as streets, intersections, rail road crossings, dead-end streets, bridges, lakes, and the like.

As another example, a traffic map may provide information on a location of one or more traffic-related objects (e.g., coordinates of one or more traffic-related objects), such as intersections, houses, bridges, construction sites, traffic lights, traffic signs, gas stations, battery recharge stations (e.g., charging stations), repair shops, and the like. A traffic map may be tailored on a specific environment, such a major city, an urban area, an off-road area, and the like.

As another example, a traffic map may provide information describing traffic-related objects or events of a special nature, such as fixed or temporary installed speed checking devices, areas prone to theft or burglary, places with a high accident rate, and the like. Special data maps or data banks may provide such type of data (e.g., the traffic map provider may have access to such type of data), for example a police accident data map. Such type of data (e.g., such special data maps) may also include additional (e.g., more specific) information on the traffic-related objects or events. By way of example, information on number and type of accident-involved vehicles (e.g., cars, truck, bicyclists, pedestrians, children, elderly people, and the like), seriousness of accident, types of injury, types of emergency transportation (e.g., car, helicopter), accident scenarios (e.g., accidents happening on a straight lane, on a right or left turn lane, on a crosswalk, on a 4-way-stop, on or nearby street crossings, due to a red traffic light violation, due to a turn-right-on-red crossing, due to priority-to-the-right rule violations, due to high velocity or to a speed limit violation, and the like). As another example, information on accident-relevant parameters, such as estimated vehicle speed, day and night time, weather conditions, vehicle occupancy, and the like.

As a further example, a traffic map may provide information describing dangerous situations (e.g., a situation of potential danger or a situation in which an accident almost occurred), for example due to speeding, tailgating, emergency breaking, strange vehicle steering, lane changing, and the like.

As a further example, a traffic map may include vehicle-specific data, for example provided by a car manufacturer (e.g., by the manufacturer of the vehicle), such as wheel position, use of lane or break assistant, display of ignored warning messages (e.g., due to a distracted driver), driver position, biofeedback signals, and the like.

As a further example, a traffic map may include information on locations including specific hazards or sources of danger (e.g., areas with a high hazardous profile), such as about the type of source of danger (e.g., due to aquaplaning, dust, usually expected strong winds, flooding, sudden temperature drops, a high level of glare, such as sunlight, flares from construction sites, and the like), and/or about vehicle-specific data (e.g., motor type, horse powers, age) and/or about driver data (e.g. age, profile of accidents etc.). A traffic or municipal authority, as an example, may provide such information.

As a further example, a traffic map may include temporary relevant traffic-related information, such as detour advises, danger of congestion due to a public mass event (e.g., a soccer game or a demonstration), increased likelihood of a traffic jam due to a construction site or a temporary road blocking, increased likelihood of accidents with pedestrians (e.g., due to insufficient lighting, for example in a rural village). A traffic map may be (e.g., continuously) updated on the occurrence of traffic-relevant disruptions, such as street potholes and other street damages, debris on the street, broken-down vehicles, traffic jams, and the like.

The traffic map (e.g., the traffic map data) may be tailored (e.g., adjusted) according to vehicle-specific information describing the vehicle to which the traffic map is provided (e.g., the vehicle receiving the traffic map). A vehicle may transmit such vehicle-specific information to the traffic map provider. The traffic map provider may be configured to adjust the traffic map to be transmitted to the vehicle according to the received information. By way of example, the traffic map may be adjusted depending on the vehicle type (e.g., car, truck, trailer, long-haul vehicle, train, tram, motor bike, bicycle, coupled city-cars, platooning truck, and the like) and/or on vehicle motor type (e.g., combustion, battery, gas). Illustratively, the vehicle-specific information may determine what type of information may be relevant for the vehicle. As an example, for an electric car may be of particular relevance to avoid a long-lasting traffic jam or a long detour due to battery status considerations. Additionally, the tailoring of the traffic map may take into consideration the relevance or the effects of the vehicle on other traffic participants (e.g., the effects of the behavior the vehicle may have after receiving the traffic map).

It is understood that a traffic map may include on or more (e.g., a combination) of the above mentioned types of information (e.g., types of traffic-related conditions).

In various embodiments, one or more types of traffic map information may be compiled and integrated into a traffic density probability map. The traffic density probability map may be updated at certain time intervals. By way of example, the traffic map provider may be configured to determine (e.g., generate and/or update) a traffic density probability map based on one or more types of traffic map information. The traffic map provider may be configured to provide the traffic density probability map to a vehicle (e.g., the traffic density probability map may be included in the traffic map). By way of example the traffic density probability map may be downloaded by a vehicle and stored in the vehicle's data storage system. The vehicle control system may be configured to use the traffic density probability map for vehicle control. A vehicle may deal with the information described by the traffic density probability map based on its current location (e.g., based on its current GPS-coordinates). As an example, the vehicle may download the relevant information (e.g., the GPS-coded events and event forecasts) step by step (e.g., while traveling).

The information described by the traffic density probability map may enable a driver and/or an autonomously driving vehicle to adjust its route, for example to reduce the incidence of or to avoid a risky situation or a risky area (e.g., a location with an excessive vehicle density or an excessive accident rate). The traffic density probability map may be displayed to a driver, e.g. visualized by means of a Head-up Display (HUD) or any other means of 2D or 3D visualization, and/or the traffic density probability map may be signaled to a driver by different signaling means, such as acoustic information (e.g., warning sounds and read text messages).

In various embodiments, a method may be provided. The method may include a vehicle sending its GPS-location to a traffic map provider. The method may include the traffic map provider sending a GPS-coded traffic map (or one or more GPS-coded traffic maps) to the vehicle for vehicle guidance, sensor control and other vehicle functions. The method may include the vehicle using the GPS-coded commands (included in the traffic map) for vehicle sensor control. The method may include the vehicle transmitting raw or preprocessed sensor data back to the traffic map provider. The method may include the traffic map provider updating the traffic map for further distribution.

FIG. 127 shows a method 12700 in accordance with various embodiments.

The method 12700 may include, in 12702, determining a location of a vehicle. By way of example, a vehicle may include a position module (e.g., a GNSS and/or GPS module), configured to determine the position (e.g., the coordinates) of the vehicle. The vehicle (e.g., a communication system of the vehicle) may be configured transmit its location (e.g., the determined coordinates) to the traffic map provider.

The method 12700 may include, in 12704, determining a configuration of one or more sensor systems of the vehicle (e.g., information on the sensors or sensor systems of the vehicle, such as type, number, location, orientation, and the like).

By way of example, the vehicle may be configured to transmit sensor configuration data describing a sensor configuration of the vehicle (e.g., a Sensor Information Matrix) to the traffic map provider. The vehicle may be configured to transmit the sensor configuration data to the traffic map provider, for example, at the beginning of a trip (e.g., at the beginning of each trip). Alternatively, the vehicle may be configured to transmit the sensor configuration data to the traffic map provider at periodic intervals (e.g., during a trip).

As another example, the vehicle may be configured to transit a vehicle-identification code to the traffic map provider. The vehicle-identification code may identify the sensor configuration of the vehicle (e.g., may be univocally associated with the sensor configuration of the vehicle identified by the code). The traffic map provider may be configured to determine the sensor configuration of the vehicle from the vehicle-identification code (e.g., by interrogating a database).

The method 12700 may include, in 12706, receiving a traffic map associated with the location of the vehicle (or a plurality of traffic maps each associated with the location of the vehicle). Illustratively, the method 12700 may include determining (e.g., generating) a traffic map associated with (or based on) the location of the vehicle. By way of example, a vehicle-external device or system (e.g., the traffic map provider) may be configured to generate (or retrieve from a database) a traffic map based on the location of the vehicle. The vehicle-external device or system may be configured to transmit the traffic map to the vehicle. As another example, the vehicle (e.g., one or more processors of the vehicle) may be configured to determine (e.g., to generate) a traffic map associated with the location of the vehicle (for example by receiving data from other vehicles and/or traffic control devices). As another example, the traffic map may be stored in a data storage system (e.g., in a memory) of the vehicle. The vehicle may be configured to retrieve the traffic map from the data storage system, e.g. it may be configured to retrieve the traffic map associated with its location. The traffic map may be GPS-coded, e.g. the traffic map (e.g., the traffic map data) may be associated with GPS-coordinates.

The traffic map may be associated with the configuration of the one or more sensor systems of the vehicle. Illustratively, the traffic map data may be adjusted based on the sensor configuration of the vehicle (e.g., the traffic map data may provide information that the vehicle may interpret or implement, based on the sensor configuration of the vehicle). Illustratively, the method 12700 may include determining (e.g., generating) a traffic map associated with (or based on) the sensor configuration of the vehicle. By way of example, a vehicle external device or system (e.g., the traffic map provider) may be configured to generate (or retrieve from a database) a traffic map based on the sensor configuration of the vehicle. As another example, the vehicle (e.g., one or more processors of the vehicle) may be configured to determine (e.g., to generate) a traffic map associated with the sensor configuration of the vehicle.

The traffic map (e.g., traffic map data) may describe one or more traffic-related conditions (or events) associated with the location of the vehicle (e.g., relevant for the vehicle). By way of example, the one or more traffic-related conditions may include (e.g., describe) a current traffic situation (e.g., a vehicle density, a traffic flow, the presence of a detour, and the like). As another example, the one or more traffic-related conditions may include a forecasted (in other words, predicted or estimated) traffic situation (e.g., a vehicle density along the route of the vehicle, a probability of a traffic jam to be formed, and the like). As another example, the one or more traffic-related conditions may describe one or more traffic-related objects (e.g., an intersection, a bridge, a crossing, and the like). As another example, the one or more traffic-related conditions may describe one or more traffic participants (e.g., other vehicles, pedestrians, cyclists, and the like). Illustratively, the one or more traffic-related conditions may describe information relevant for vehicle control and/or sensing control.

The traffic map may include a traffic density map (or a plurality of traffic density maps). The traffic density map (e.g., traffic density map data) may describe one or more traffic-related conditions at the location of the vehicle. Illustratively, the traffic density map may describe one or more actual (in other words, current) traffic-related conditions (e.g., a current vehicle density, a current traffic flow, current weather, current visibility, and the like).

The traffic map may include a traffic density probability map (or a plurality of traffic density probability maps). The traffic density probability map (e.g., traffic density probability map data) may describe one or more forecasted traffic-related conditions associated with the location of the vehicle. The traffic density probability map may describe one or more probabilities associated with one or more traffic-related conditions. The one or more probabilities may be based on the location of the vehicle (e.g., may be determined in accordance with the location of the vehicle). Illustratively, the traffic density probability map may describe one or more probabilities for one or more traffic-related conditions to occur (e.g., to be present or to happen) at the location of the vehicle (or along the route of the vehicle).

The traffic map may include a traffic events map (or a plurality of traffic events maps). The traffic events map (e.g., traffic events map data) may describe one or more traffic-related events associated with the location of the vehicle (and/or with the route of the vehicle). The traffic-related events may include, for example, an accident, a road disruption, an emergency situation, and the like.

The traffic map (e.g., traffic map data) may include one or more sensor instructions. The sensor instructions may be for one or more sensor systems of the vehicle (e.g., the sensor instructions may provide information for controlling the one or more sensor systems). The sensor instructions may be associated with the one or more traffic-related conditions. Illustratively, the sensor instructions may be determined (e.g., adjusted) based on the one or more (e.g., current and/or forecasted) traffic-related conditions. Additionally or alternatively, the sensor instructions may be adjusted based on the sensor configuration of the vehicle (e.g., based on the capabilities and on the properties of one or more sensor systems of the vehicle). The sensor instructions may provide a configuration of the one or more sensor systems adapted (e.g., optimized) to the one or more traffic-related conditions. The sensor instructions may be GPS-coded, e.g. tailored to or associated with GPS-coordinates (e.g., of the vehicle).

The one or more sensor systems may include one or more RADAR sensor systems, one or more LIDAR sensor system (e.g., a LIDAR Sensor System 10), one or more camera systems, one or more ultrasound systems, and the like.

The method 12700 may include, in 12708, controlling the one or more sensor systems taking into consideration the one or more sensor instructions. By way of example, the sensor instructions may include commands and/or configuration settings for the one or more sensor systems. The vehicle (e.g., a sensor control system of the vehicle) may be configured to execute or implement the commands and/or the configuration settings. As another example, the vehicle (e.g., the sensor control system) may be configured to generate corresponding commands for the one or more sensors and/or to determine configuration settings to be implemented based on the received sensor instructions.

By way of example, the sensor instructions may include (or describe) a sensor system or a combination of sensor systems to use. The sensor instructions may include a number of sensor systems to be deactivated (or deprioritized). The sensor instructions may include a number of sensor systems to be activated (or prioritized). Illustratively, the sensor instructions may indicate which sensor system or which combination may be suited (e.g., optimal) for environmental sensing in light of the one or more traffic-related conditions. By way of example, in an off-road condition, camera sensor data and LIDAR sensor data may be preferred (e.g., the respective sensor systems may be activated). As another example, in a motorway or interstate condition RADAR and LIDAR sensor data may be preferred.

As a further example, the sensor instructions may include a change in one or more properties or parameters of at least one sensor system. The sensor instructions may include a change in the resolution of at least one sensor system (e.g., may include changing the resolution, for example increasing the resolution). The sensor instructions may include a change in the field of view of at least one sensor system (e.g., narrowing or widening the field of view). The sensor instructions may include a change in the sensitivity of at least one sensor system (e.g., increasing or decreasing the sensitivity). Illustratively, the modified properties or parameters may provide improved sensing in view of the determined traffic-related conditions. By way of example, in case the vehicle is in a potentially dangerous situation (or is approaching a potentially dangerous situation), the sensitivity of a sensor system (e.g., a LIDAR sensor system) may be increased, or the field of view may be narrowed (e.g., to focus on more relevant portions of the path followed by the vehicle).

As a further example, the sensor instructions may include information to be emitted by at least one sensor system. Illustratively, the sensor instructions may describe that at least one sensor system should transmit information and may describe the information to be transmitted. The information may be encoded in a signal emitted by the at least one sensor system. The information may be encoded, for example, in the LIDAR light emitted by a LIDAR sensor system. The information may be encoded, for example, in the ultrasound signal emitted by an ultrasound system. The emitted information may describe, for example, information relevant for other traffic participants (e.g., other vehicles), such as information on a traffic event (e.g., an accident). The emitted information may describe, for example, information relevant for a traffic control device, such as information on the traffic flow.

The method 12700 may include generating sensor data. Illustratively, the method 12700 may include controlling the one or more sensor systems according to the sensor instructions to generate sensor data. The generation of the sensor data may thus be tailored (e.g., optimized) in light of the one or more traffic-related conditions (e.g., in light of the location of the vehicle). The sensor data may include, for example, RADAR sensor data, camera sensor data, LIDAR sensor data, ultrasound sensor data, and the like. The sensor data may be associated with the location of the vehicle (e.g., the sensor data may be GPS-coded). Illustratively, the sensor data may provide information on an environment surrounding the vehicle (e.g., may provide information on one or more traffic-related conditions, for example on other traffic participants, on the weather, on the visibility, etc.).

The method 12700 may include transmitting the generated sensor data to a vehicle-external device (e.g., to the traffic map provider). The vehicle (e.g., a communication system of the vehicle) may be configured to transmit the generated sensor data. The sensor data may be used to modify (e.g., update) the traffic map and/or to generate a (e.g., new) traffic map. By way of example, the vehicle may be configured to modify the (e.g., received or determined) traffic map based on the generated sensor data (e.g., the method 12700 may include modifying the traffic map based on the generated sensor data). As another example, the traffic map provider may be configured to modify the traffic map based on the received sensor data, as it will be described in further detail below.

The traffic map (e.g., the traffic map data) may include one or more driving instructions. The driving instructions may be configured for controlling the vehicle (e.g., the driving instructions may provide information for vehicle control, for example they may be directed to a vehicle control system). The driving instructions may be associated with the one or more traffic-related conditions. Illustratively, the driving instructions may be determined based on the one or more (e.g., current and/or forecasted) traffic-related conditions. By way of example, the driving instructions may indicate to reduce the velocity of the vehicle in correspondence of (or in proximity of) a traffic jam or an accident. As another example, the driving instructions may indicate to direct the vehicle along a different route due to a road disruption.

The method 12700 may include controlling the vehicle taking into consideration the one or more driving instructions (illustratively, in 12706 and 12708 the method may include receiving the driving instructions and controlling the vehicle accordingly). By way of example, the driving instructions may include commands (e.g., steering commands) for the vehicle. The vehicle (e.g., the vehicle control system) may be configured to execute the commands. As another example, the vehicle (e.g., the vehicle control system) may be configured to generate corresponding commands based on the received driving instructions.

FIG. 128 shows a method 12800 in accordance with various embodiments.

The method 12800 may include, in 12802, receiving a location of a vehicle. By way of example, a traffic map provider may be configured to receive position data (e.g., GPS-data) from a vehicle, the position data describing the location of the vehicle. Additionally or alternatively, the method 12800 may include receiving sensor configuration data (e.g., a Sensor Information Matrix). By way of example, a traffic map provider may be configured to receive a Sensor Information Matrix from a vehicle. Illustratively, the method 12800 may include receiving a configuration (e.g., a sensor configuration) of one or more sensor systems of the vehicle.

The method 12800 may include, in 12804, receiving sensor data from the vehicle. By way of example, the traffic map provider may be configured to receive the sensor data. The sensor data may be associated with the location of the vehicle (e.g., may describe an environment or one or more traffic-related conditions at the location of the vehicle). The sensor data may be GPS-coded. The sensor data may be in accordance with one or more sensor instructions included in a traffic map. Illustratively, the sensor data may be generated (or may have been generated) by controlling (e.g., configuring) one or more sensor systems of the vehicle based on the sensor instructions. The sensor data may include, for example, RADAR sensor data, camera sensor data, LIDAR sensor data, ultrasound sensor data, and the like. The sensor data may include the sensor configuration data.

The method 12800 may include, in 12806, modifying (e.g., updating) the traffic map (e.g., the traffic map data) based on the received sensor data and on the received location of the vehicle. By way of example, the traffic map provider may be configured to implement such modification. Illustratively, the (e.g., GPS-coded) traffic map which provided the sensor instructions to the vehicle may be modified based on the correspondingly generated sensor data. By way of example, the description of the one or more traffic-related conditions provided by the traffic map may be modified in view of the newly received sensor data. As another example, sensor instructions and/or driving instructions included in the traffic map may be modified according to the newly received sensor data.

Modifying the traffic map may include modifying a traffic density map (e.g., included in the traffic map) and/or modifying the traffic map may include modifying a traffic density probability map (e.g., included in the traffic map). Illustratively, modifying the traffic map may include modifying (e.g., updating) one or more actual traffic-related conditions and/or one or more forecasted traffic-related conditions (e.g., one or more probabilities associated with one or more traffic-related conditions).

The location and/or the sensor data may be provided by more than one vehicle (e.g., by one or more other vehicles). Illustratively, the traffic map provider may be configured to receive location and/or sensor data from one or more (e.g., other) vehicles. The method 12800 may include receiving a location of one or more (e.g., other) vehicles. The method 12800 may include receiving (e.g., additional) sensor data from the one or more vehicles. The sensor data may be generated by the same sensor systems (e.g., the same types of sensor systems) or by different sensor systems. Illustratively, the one or more vehicles may have received the same sensor instructions or each vehicle may have received different (e.g., specific or respective) sensor instructions. The method 12800 may include modifying the traffic map based on the received additional sensor data and the received location of the one or more (e.g., other) vehicles.

Additionally or alternatively, the modification (e.g., the update) of the sensor map may be based on data received from other devices, e.g. from one or more traffic control devices. The method 12800 may include receiving a location of one or more traffic control devices. The method 12800 may include receiving traffic control data from the one or more traffic control devices. The traffic control data may describe one or more traffic-related conditions at the location of the respective traffic control device. Illustratively, the traffic map provider may be configured to receive the location and/or the traffic control data from the one or more traffic control devices. The method 12800 may include modifying the traffic map based on the received traffic control data and the received location of the one or more traffic control devices.

The method 12800 may include transmitting the modified (e.g., updated) traffic map to the vehicle (or to the one or more vehicles). Illustratively, the traffic map provider may be configured to transmit the updated traffic map to the vehicle (e.g., the vehicle that provided the sensor data used to modify the traffic map). The traffic map provider may be configured to store the modified traffic map for further distribution (e.g., to other vehicles).

FIG. 129A and FIG. 129B show each a system in a schematic view in accordance with various embodiments.

The system illustrated in FIG. 129A and FIG. 129B may be an exemplary representation of a system configured to implement the method 12700 described in relation to FIG. 127 and/or the method 12800 described in relation to FIG. 128 (or at least part of the method 12700 and/or of the method 12800).

The system may include a sensor device (e.g., the LIDAR Sensor device 30, for example a housing, a vehicle, or a vehicle headlight). The sensor device may include a sensor system, e.g. the LIDAR Sensor System 10 (e.g., the Retrofit LIDAR sensor system 10) described, for example, in relation to FIG. 1. It is intended that the system illustrated in FIG. 129A and FIG. 129B may include one or more of the components (e.g., all the components) described, for example, in relation to FIG. 1.

The sensor device be configured to determine a position of the sensor device. The sensor device may include a position module 12902 (e.g., a GPS module, e.g. a GPS sensor). The position module 12902 may be configured to generate position data (or to receive position data, for example from an external device, such as from a traffic control station).

The sensor device may include a data processing system (e.g., the LIDAR data processing system 60). The data processing system may be configured to perform signal processing 61, data analysis and computing 62, sensor fusion and other sensing functions 63. The sensor device may include a sensor management system (e.g., the LIDAR sensor management system 90) configured to manage input and output data for the sensor system (e.g., the one or more sensor instructions). The sensor device may include a communication system (e.g., the control and communication system 70), configured to manage input and output data (e.g., configured to communicate with sensor device-external, e.g. vehicle-external, devices).

The sensor device (e.g., the communication system) may be configured to interact with a sensor device-external device or system 12904 (e.g., a vehicle-external device or system, e.g. the traffic map provider). The sensor device may be configured to receive data (e.g., the traffic map 12904*a*) from the system-external device 12904. The sensor device may be configured to transmit data (e.g., sensor data) to the sensor device-external device 12904.

FIG. 130 shows a system and a signal path in a schematic view in accordance with various embodiments.

The sensor device 30 may transmit position data 13002 (e.g., its location, as determined by the position module 12902) to the traffic provider 12904. The sensor device 30 (e.g., the communication system) may further be configured to transmit to the traffic map provider 12904 sensor configuration data, e.g. a Sensor Information Matrix (for example stored in a memory of the sensor device 30). Additionally or alternatively, the sensor device 30 may be configured to transmit an identification code to the traffic map provider 12904 (e.g., a univocal code identifying the sensor device 30). The traffic provider 12904 may transmit the traffic map 12904*a* associated with the position data to the sensor device 30 (e.g., it may transmit GPS-coded input data 13004 including the traffic map, e.g. traffic map data). The traffic map 12904*a* may also be associated with the sensor configuration data (e.g., with a configuration of the sensor device 30, or with a configuration of one or more sensor systems of the sensor device 30).

The sensor device may provide sensor instructions 13006 included in the traffic map 12904*a* to the sensor device system (e.g., the LIDAR sensor management system 90). The system may also provide driving instructions to a vehicle control system.

The sensor device may generate sensor data 13008 according to the received sensor instructions. The generated sensor data 13008 may be transmitted by the communication system (e.g., the control and communication system 70) back to the traffic map provider 12904. The traffic map provider 12904 may receive the transmitted sensor data 13010. The traffic map provider 12904 may update the traffic map 12904*a* (e.g., it may generate and/or store an updated traffic map 13012). The traffic map provider 12904 may transmit the updated traffic map 13012 to the sensor device (e.g., to the vehicle).

Various embodiments as described with reference to FIG. 127 to FIG. 130 may be combined with the intelligent navigation embodiments as described with reference to FIG. 85 to FIG. 88.

In the following, various aspects of this disclosure will be illustrated:

Example 1v is a method. The method may include determining a location of a vehicle. The method may include determining a configuration of one or more sensor systems of the vehicle. The method may include receiving a traffic map associated with the location of the vehicle. The traffic map may be associated with the configuration of the one or more sensor systems of the vehicle. The traffic map may describe one or more traffic-related conditions associated with the location of the vehicle. The traffic map may include one or more sensor instructions for the one or more sensor systems of the vehicle. The one or more sensor instructions may be associated with the one or more traffic-related conditions. The method may include controlling the one or more sensor systems taking into consideration the one or more sensor instructions.

In Example 2v, the subject-matter of example 1v can optionally include that the traffic map further includes one or more driving instructions. The one or more driving instructions may be associated with the one or more traffic-related conditions. The method may further include controlling the vehicle taking into consideration the one or more driving instructions.

In Example 3v, the subject-matter of any one of examples 1v or 2v can optionally include that the one or more sensor instructions are one or more GPS-coded sensor instructions and/or the one or more driving instructions are one or more GPS-coded driving instructions.

In Example 4v, the subject-matter of any one of examples 1v to 3v, can optionally include that the traffic map is a GPS-coded traffic map.

In Example 5v, the subject-matter of any one of examples 1v to 4v can optionally include that the one or more traffic-related conditions include a current traffic situation and/or a forecasted traffic situation and/or information on one or more traffic-related objects and/or information on one or more traffic participants.

In Example 6v, the subject-matter of any one of examples 1v to 5v can optionally include that the one or more sensor instructions include a number of sensor systems to be activated and/or a number of sensor systems to be deactivated and/or deprioritized.

In Example 7v, the subject-matter of any one of examples 1v to 6v can optionally include that the one or more sensor instructions include a change in a resolution and/or in a field of view and/or in a sensitivity of at least one sensor system of the one or more sensor systems.

In Example 8v, the subject-matter of any one of examples 1v to 7v can optionally include that the one or more sensor instructions include information to be emitted by at least one sensor system of the one or more sensor systems.

In Example 9v, the subject-matter of any one of examples 1v to 8v can optionally include that receiving the traffic map includes receiving the traffic map from a vehicle-external device.

In Example 10v, the subject-matter of any one of examples 1v to 8v can optionally include that the traffic map is stored in a data storage system of the vehicle.

In Example 11v, the subject-matter of any one of examples 1v to 10v can optionally include that the traffic map includes a traffic density map. The traffic density map may describe one or more traffic-related conditions at the location of the vehicle.

In Example 12v, the subject-matter of any one of examples 1v to 11v can optionally include that the traffic map includes a traffic density probability map. The traffic density probability map may describe one or more probabilities associated with one or more traffic-related conditions based on the location of the vehicle.

In Example 13v, the subject-matter of any one of examples 1v to 12v can optionally include that the one or more sensor systems include at least a LIDAR Sensor System.

In Example 14v, the subject-matter of any one of examples 1v to 13v can optionally include generating sensor data. The generated sensor data may be associated with the location of the vehicle.

In Example 15v, the subject-matter of example 14v can optionally include transmitting the generated sensor data to a vehicle-external device.

In Example 16v, the subject-matter of any one of examples 8v or 15v can optionally include that the vehicle-external device is a traffic map provider.

In Example 17v, the subject-matter of any one of examples 14v to 16v can optionally include that the sensor data include LIDAR sensor data.

In Example 18v, the subject-matter of any one of examples 14v to 17v can optionally include that the sensor data are GPS-coded sensor data.

Example 19v is a method. The method may include receiving a location of a vehicle. The method may include receiving sensor data from the vehicle. The sensor data may be associated with the location of the vehicle. The sensor data may be in accordance with one or more sensor instructions included in a traffic map. The method may include modifying the traffic map based on the received sensor data and the received location of the vehicle.

In Example 20v, the subject-matter of example 19v can optionally include that the sensor data are GPS-coded sensor data and/or the traffic map is a GPS-coded traffic map.

In Example 21v, the subject-matter of any one of examples 19v or 20v can optionally include that modifying the traffic map includes modifying a traffic density map. The traffic density map may describe one or more traffic-related conditions at the location of the vehicle.

In Example 22v, the subject-matter of any one of examples 19v to 21v can optionally include that modifying the traffic map includes modifying a traffic density probability map. The traffic density probability map may describe one or more probabilities associated with one or more traffic-related conditions based on the location of the vehicle.

In Example 23v, the subject-matter of any one of examples 19v to 22v can optionally include that the sensor data include LIDAR sensor data.

In Example 24v, the subject-matter of any one of examples 19v to 23v can optionally include receiving a location of one or more other vehicles. The method may further include receiving additional sensor data from the one or more other vehicles. The method may further include modifying the traffic map based on the received additional sensor data and the received location of the one or more other vehicles.

In Example 25v, the subject-matter of any one of examples 19v to 24v can optionally include providing the modified traffic map to the vehicle.

Example 26v is a device, including one or more processors configured to perform a method of any one of examples 1v to 18v.

Example 27v is a device, including one or more processors configured to perform a method of any one of examples 19v to 26v.

Example 28v is a vehicle, including the device of example 26v and/or the device of example 27v.

Example 29v is a computer program including instructions which, when executed by one or more processors, implement a method of any one of examples 1v to 19v and/or implement a method of any one of examples 19v to 25v.

Vehicles (e.g., automobiles) are becoming more and more autonomous or automated (e.g., capable of performing various functions, such as driving, with minimal human assistance). A vehicle may be or will be configured to navigate an environment with little or finally without any direct or indirect human assistance. The level of autonomy of a vehicle may be described or determined by the SAE-level of the vehicle (e.g., as defined by the Society of Automotive Engineers (SAE), for example in SAE J3016-2018: Taxonomy and definitions for terms related to driving automation systems for on-road motor vehicles). The SAE-level may have a value ranging from level 0 (e.g., substantially no driving automation) to level 5 (e.g., full driving automation).

For implementing the desired autonomous or automated functions a plurality of sensors may be provided (e.g., in a vehicle), such as cameras (e.g., night and day vision cameras), ultrasound sensors (e.g., ultrasound emitting and sensing systems), inertial sensors, LIDAR and/or RADAR environmental scanning and detection systems, and the like. The sensor data (e.g., output data from the sensors or sensor systems) may be analyzed in an intelligent way. By way of example, sensor signals may be pre-processed by the respective sensor system (e.g., by the respective sensor device). Additionally or alternatively, sensor signals may be processed by one or more systems or devices (e.g., one or more processors) of the vehicle, such as a Board-Control-System (BCU), a Board Computer, Data Analysis, Handling and Storage Devices, and the like. Illustratively, sensor data may be determined by the (e.g., processed) sensor signals.

Sensor data analysis may be assisted by intelligent sensor fusion (e.g., by merging data from multiple sensors or sensor systems). Sensor data may also be analyzed with respect to object recognition and object classification. Camera image recognition and classification analysis, for example, may also play an important role, leading to data points that may subsequently be used to define and execute proper vehicle control commands. These are areas where Artificial Intelligence Methods may be applied.

Traffic safety may rely on both safety and security aspects. The safety and security aspects may be related to an accurate and reliable operation of the above-mentioned sensor and data analysis systems. Safety aspects may be (e.g., negatively) influenced by passive adversaries, such as functional system safety features. Functional system safety features may include, for example, breakdown, failure, or any other abnormality of a system component (e.g. due to production issues or adverse conditions during runtime, such as mechanical shocks, thermal load and the like). Security aspects may be (e.g., negatively) influenced by active adversaries, for example by third parties. Security aspects may be influenced, for example, by cyber-attacks targeting Data Integrity, Data Authenticity, Data Availability and/or Data Confidentiality. It may be desirable to coordinate the development of safety and security design frameworks, such that they may complement each other.

Such complex tasks and such complex measurement and analysis procedures may be prone to errors, malfunctions and/or adversarial attacks (e.g., sophisticated and/or brute force adversarial attacks).

Various embodiments may be related to a method and various embodiments may be related to a device for providing reliable and robust sensor data. The method and/or the device may be configured to provide sensor data that are robust against sensor malfunctions, in particular against adversarial attacks (e.g., to remedy or at least reduce the impact of adversarial attacks). Illustratively, the method and/or the device may be configured to provide reliable (e.g., safe) and robust control of a vehicle (e.g., a vehicle with autonomous driving capabilities).

In the context of the present application, for example in relation to FIG. 124 to FIG. 126, the term "sensor system" may be used to describe a system configured to provide (e.g., to generate) sensor data. A sensor system may be a system including one or more sensors configured to generate one or more sensor signals. The sensor data may be provided from the one or more sensor signals. The features and/or the actions described herein in relation to a sensor system may apply accordingly also to a sensor, e.g. to the one or more sensors of a sensor system.

An example of adversarial attack (e.g., a possible attack to mode) may be a brute force attack on a sensor system (e.g., on the emitting and/or sensing parts, e.g. on the emitter and/or receiver path). By way of example, a camera system may be negatively affected by a visible or infra-red light (e.g., a laser flash) pointed towards a camera. A camera system (e.g., including a night vision camera) may also be affected by overexposure to a is white light flash or infra-red flash. As another example, an ultrasound system (e.g., an ultrasound sensing system) may be negatively affected by a pointed ultrasonic distortion signal, leading for example to jamming and spoofing effects. An ultrasound system may also be prone to errors or attacks due to ultrasound absorbing materials, which may lead to false negatives (e.g., to wrong or failed detection or identification of an object). As a further example, a RADAR system may be attacked by means of a RADAR distortion beam (e.g., a mm-wave RADAR distortion beam) directed onto a RADAR sensor (e.g., onto a RADAR sensing module). As a further example, a LIDAR system may be induced into error in case an adversarial system (e.g., a preceding vehicle) sprays a disturbing agent (e.g., water mist or smoke) in the surroundings of the LIDAR system. A LIDAR system may also be negatively affected by infra-red light (e.g., a laser flash) or an overexposure to infra-red light (e.g., a laser flash). A LIDAR system may also be induced into error in case an object (e.g., a vehicle or a traffic object, such as a traffic sign) is covered (e.g., painted) with a coating or a material configured to reflect or absorb infra-red light (e.g., a highly reflecting or absorbing infra-red reflective coating or material). Such coating or material may cause the LIDAR system to detect and/or identify an uncommon object, due to the increased or suppressed signal strength with respect to a standard object (e.g., a non-altered vehicle or traffic object).

Another possible type of brute force attack may be a drone attack. A drone or another controllable moving object may move (e.g., fly) intentionally in the proximity of a sensor system (e.g., in the proximity of a vehicle, for example in front of the vehicle, or at the rear, or at the sides, or on top of the vehicle). The sudden appearance of the drone may lead to an abrupt (and potentially dangerous) vehicle reaction.

A brute force attack may thus lead to false positives (e.g., the detection or identification of an object not actually present), false negatives (e.g., the failed detection or identification of an object), or system malfunctions. A brute force attack may thus affect a broad variety of functions of an Advanced Driver Assistance System (ADAS), such as adaptive cruise control, collision avoidance, blind spot detection, lane departure warning, traffic sign recognition, parking assistance, and the like. A brute force attack may also affect vehicle control functions in (e.g., fully or partially) autonomous driving situations, such as route planning, route adaption emergency maneuvers, and the like.

Effects same or similar to the effects provided by a brute force attack may also be caused by natural events (in other words, by natural or ambient conditions). Such natural events may lead to system malfunctions (e.g., to system fail functions). As an example, a camera system or a LIDAR system may be exposed to too much sun light or to an excessive level of scattered infra-red radiation.

Another example of adversarial attack may be a sophisticated adversarial attack (or attack method). Such attack may be based, for example, on object recognition, image recognition and manipulations. Methods of sophisticated attack may be, for example, image perturbation and lenticular lens effects. This may be the case, in particular, for sensor systems using Machine Learning (ML) or Artificial Intelligence (AI) methods that rely on supervised or unsupervised learning algorithms (e.g., deep neural learning algorithms). Such underlying algorithms may be prone to such intentional (e.g., sophisticated) attack.

A sophisticated adversarial attack may be defined or described as White Box attack or as Black Box attack. In a White Box attack (also referred to as White Box attack mode), the system (e.g., the sensor system) to be attacked and its functionalities is/are known and the behavior studied (for example, by reverse engineering and testing). Thus, the adversarial attack may be "custom-made" and tailored towards a specific attack scenario. In a Black Box attack (also referred to as Black Box attack mode), the inner functioning of a system to be attacked (e.g., of a used Machine Learning (ML) system) is not known and the attack may be based, for example, on trial-and-error attempts, trying to cause perturbations that lead to misdetection of images or to misleading object identification (e.g., categorization).

By way of example, a camera image recognition system may analyze an image including a captured text message or symbol. The text message or symbol may be, for example, exhibited by a preceding vehicle (e.g., word or visual messages like STOP, Follow Me, Do Not Follow Me, BREAK, Hazardous Goods, and the like). The text message or symbol may be or may represent, for example, a road sign (e.g., a traffic sign), such as a STOP sign, a Crossing Sign, and the like. The text message or symbol may be associated with specific road users, such as a logo of a wheelchair, pedestrians and the like. In case of an adversarial attack, the picture analyzing part (e.g., the image analyzing part) of a camera image processing system may be led to falsely interpret an intentionally modified text message and/or symbol (e.g., to falsely interpret a false text or symbol as being authentic). This incorrect interpretation may lead to wrong or even dangerous vehicle control actions.

As another example, a vehicle (e.g., a preceding car, a bicycle, etc.) or another object may light up its exterior (e.g., the chassis or the windows of the vehicle) with signals using traffic-coded colors (e.g., red, yellow, green). Said vehicle or object may also emit a blinking light signal to resemble, for example, a yellow indicator signal, or a (e.g., changing) traffic light, or a police warning flash. Said vehicle or object may perform said actions with the intention of fooling a camera image processing system (e.g., a camera picture interpreting system). Additionally or alternatively, said vehicle or object may flash a coded signal that may be understood by a sensor system, e.g. by the vehicle image recognition system, and may lead to an aberrant behavior.

As another example, another traffic participant (e.g., a vehicle or a pedestrian) may project visual indications onto the road (e.g., a symbol, a text message, traffic-specific information, and the like). Said visual indications may lead to an erroneous vehicle behavior if taken (e.g., interpreted) as reliable input (e.g., as authentic input).

As another example, a manipulated image may be used for a sophisticated adversarial attack. Such manipulated image may be, for example, attached to a traffic sign, or to a non-traffic sign, or it may replace a traffic sign. By way of example, an object (e.g., a street sign or a traffic sign) may be plastered with misleading stickers that may cause only minor perturbations in the real world, but that may lead to wrong object identification (e.g., when using conventional, non-optimized, neural networks). As another example, a preceding vehicle may display pixel patterns of an otherwise benign image, manipulated to fool the image recognition system of another vehicle.

Thus, Advanced Driver Assistance System (ADAS) functionalities and other assisting vehicle or self-driving functions may be affected or compromised by a variety of factors. Such factors may include hardware defects, software malfunctions, contradicting information, no solution situations (e.g., in case computing takes too long, or in case a problem may be mathematically unsolvable), adversarial attacks (software, hardware, (multi)-sensor attacks), and the like. In this context, a vehicle with automated driving capabilities may be especially vulnerable to such factors and scenarios, thus leading to situations potentially detrimental to traffic safety.

A possible approach to the above-mentioned problems may include the use of Bayesian belief networks using rule-based inferencing to mechanisms configured to interpret retrieved data within the situational context to support event and alert generation for cyber threat assessment and prediction. However, such an approach may be difficult to handle (due to the high complexity) and may not secure a system against designed (e.g., tailored) adversarial attacks. Another approach may include using forward and is backward processing techniques of an attack image leading to a self-learning image classification network. However, such an approach may require high computing power and may have limitations related to the required computing time. Another approach may include providing a system used in an autonomous vehicle that detects an erroneously working vehicle control system, neutralizes its output, isolates such device from the vehicle's communication system and replaces it with another (e.g., uncompromised) vehicle control system. However, such an approach may be quite complex and may require a redundancy of control elements. Another approach may include comparing aggregated sensor data by performing encoding-decoding processes and comparing statistical deviation leading to contextual aggregated sensor data representation. Such sensor data representations may be compared with scene mapping information provided by a scene contextualizer. However, such an approach may require a massive use of computing power and data communication between cloud and edge computing devices leading to high system latencies making it practically unusable for real world requirements for safe autonomous driving.

Various embodiments may be directed to a method and various embodiments may be directed to a device provided to remedy or at least reduce the effects of various factors that may affect a vehicle, for example a vehicle with automated driving capabilities (e.g., the effects of the factors that may affect one or more sensor systems of the vehicle or of a sensor device, e.g. that may affect the reliability of sensor data). As an example, the method and/or the device may be provided to overcome or at least counteract and remedy some of the adversarial effects caused by an undesired or targeted adversarial attack. An adversarial attack may be understood as an action performed by an external entity (e.g., vehicle-external or sensor system-external, such as another vehicle, a pedestrian, a drone, a static object, etc.). Said action may be configured to negatively influence (or at least to attempt to negatively influence) the generation and/or analysis of sensor data (e.g., provided by an attacked sensor systems or in an attacked vehicle).

In various embodiments, a vehicle (e.g., an autonomously driving vehicle) may have access to or it may be provided with position data (in other words, location data). The position data may describe or represent information about the current position (in other words, the current location or the current coordinates, e.g. GNSS/GPS coordinates) of the vehicle, and/or about the relative position of the vehicle with respect to another (e.g., static or moving) object. As an example, the vehicle may include or may have access to a Global Navigation Satellite System (GNSS) and/or a Global Positioning System (GPS) (e.g., it may include or have access to a GNSS and/or GPS communication system or module). Additionally or alternatively, the vehicle may have access to traffic and environment mapping data and/or data provider. By way of example, the vehicle may have access to GPS-coded Traffic Maps (TRM), Traffic Density Maps (TDM) and/or Traffic Density Probability Maps (TDPM) and/or Traffic Event Maps (TEM) as described, for example, in relation to FIG. 127 to FIG. 130. Illustratively, the position data may be GPS-data. By way of example, the vehicle may have access to intelligent driving methods (e.g., to the intelligent navigation system described, for example, in relation to FIG. 85 to FIG. 88), e.g. information derived from previous vehicle trips along the same roads or areas.

The vehicle (e.g., a data processing system of the vehicle, for example including one or more processors) may be configured to determine (e.g., derive or calculate) positively known reference data from said position data. The vehicle may be configured to determine position-coded data or position-coded information (also referred to as GPS-coded data, or GPS-coded information) from the position data. Illustratively, based on the knowledge of the (e.g., current) location, the vehicle may be configured to determine (or make predictions on) the environment surrounding the vehicle (for example, an expected traffic or driving situation, e.g. based on whether the vehicle is located in a city or in the countryside).

In various embodiments, the vehicle (e.g., the data processing system of the vehicle or of a sensor device) may be configured to assign the position-coded information to predefined location selective categories (LSC), e.g. described by or associated with an integer number (e.g., LSCa, a=1, 2, . . . , m). The predefined location selective categories (LSC) may describe or represent a location where the vehicle is (e.g., currently) located, such as a parking lot, an urban environment, a motorway, an interstate, an off-road and the like. The predefined location selective categories (LSC) may also describe or represent information related to the location where the vehicle is located (e.g., a speed limit, an expected behavior of other vehicles, and the like).

In various embodiments, the vehicle (e.g., the data processing system) may be configured to assign the position-coded information to predefined environmental settings (ES), e.g. described by or associated with an integer number (e.g., ESb, b=1, 2, . . . , n). The environmental settings (ES) may be same or similar to the "traffic condition" described, for example, in relation to FIG. 123. The environmental settings (ES) may include, for example, current day and time, time zone, weather, road conditions, other location-based traffic map information, (e.g., expected) traffic density and the like. Illustratively, the environmental settings (ES) may describe or represent information related to factors (e.g., vehicle-external factors) that may affect the driving of a vehicle.

In various embodiments, the vehicle (e.g., the data processing system) may have access to vehicle-specific (e.g., vehicle-related or vehicle-internal) information, e.g. positively known information about one or more properties or features of the vehicle. Said vehicle-specific information may be referred to as Driving Status (DS) or Driving Status data, e.g. described by or associated with an integer number (e.g., DSc, c=1, 2, . . . , p). The Driving Status (DS) may be same or similar to the "driving scenario" described, for example, in relation to FIG. 123. The Driving Status (DS) may include, for example, an occupancy of the vehicle (e.g., the current number of occupants), vehicle loading, vehicle type, driving history, autonomy level (e.g., SAE level, for example from level 0 to level 5), driver identification data, driver biofeedback data, and the like. The Driving Status (DS) may be position-coded (e.g., GPS-coded). As an example, the driver biofeedback data may be GPS-coded (e.g., the behavior of the driver may be expected to vary depending on the location of the vehicle). Illustratively, the Driving Status (DS) may describe or represent information related to other factors (e.g., vehicle-internal factors) that may affect the driving of a vehicle.

The combination of one or more of the settings and/or status information (e.g., the location selective categories, the environmental settings, and the driving status) may be referred to as a vehicle condition (or vehicle scenario). Illustratively, a vehicle condition may describe one or more factors (e.g., location related, vehicle related, and/or environment related factors) that may affect the driving of a vehicle (and/or that may affect or be relevant for the functioning of one or more sensor systems).

In various embodiments, the various settings, e.g. the various information describing the current vehicle condition or scenario, may be combined (e.g., stored) in a General Setting Matrix (GSM). The General Setting Matrix (GSM) may be stored into and retrieved from a non-transitory storage medium (e.g., a memory). The non-transitory storage medium may be included in the vehicle, or the vehicle (e.g., the data processing system) may have access to the non-transitory storage medium, for example via a communication interface. Illustratively, the General Setting Matrix may be included in the data processing system.

The General Setting Matrix (GSM) may store predefined information for each of these settings (or combination of settings) about which to sensor data are to be prioritized (in what order), for example in case of sensor malfunction or aberrant behavior. The General Setting Matrix (GSM) may store a configuration for one or more sensors or sensor systems (e.g., included in the vehicle) associated with a respective vehicle condition (e.g., with the respective settings, e.g. with respective location selective categories, is environmental settings, and driving status, and/or with a respective combination thereof). The General Setting Matrix (GSM) may store a hierarchy (e.g., a level of relevance) for the one or more sensor systems associated with a respective vehicle condition. Illustratively, the General Setting Matrix (GSM) may store data (e.g., setting data) describing which sensor systems (or which combination) to use (or to prioritize) for each vehicle condition.

In various embodiments, the General Setting Matrix (GSM) may store a sensor fusion priority associated with each vehicle condition, e.g. the General Setting Matrix (GSM) may store a plurality of sensor fusion priorities, each associated with a respective vehicle condition. Illustratively, for each vehicle condition (e.g., for each setting), a preferred sensor fusion approach may be specified. The sensor fusion priority may describe which sensor systems (or which combination) to use (e.g., together) in the respective vehicle condition. By way of example, in an off-road condition, camera sensor data and LIDAR sensor data may be prioritized. As another example, RADAR and LIDAR sensor data fusion may be prioritized in a motorway or interstate condition. As a further example, in a parking lot situation, ultrasound sensor data in combination with camera data may be prioritized (e.g., it may be the preferred input for sensor fusion). As a further example, during inclement weather, LIDAR and RADAR sensor data may be the preferred input data for sensor fusion. The prioritized sensor data may then be used for subsequent processing (e.g., image recognition) and vehicle control (e.g., vehicle steering). The number of sensor systems used (e.g., how many LIDAR sensing devices, how many RADAR systems, etc.) and their combination may be adjusted depending on the actual vehicle condition. A vehicle may then be configured to use the (at least partially GPS-coded) sensor data for vehicle guidance.

In various embodiments, the coherence (e.g., the correlation) of the sensor data with expected sensor data (e.g., with an expected value and/or an expected range of the sensor data) may be determined. Illustratively, it may be determined whether a sensor signal is coherent with an expected sensor signal (e.g., whether a sensor output is coherent with an expected sensor output). Based on the determined coherence (e.g., on a determined signal reliability factor) a decision about whether to use or disregard (in other words, discard) the sensor data may be taken.

By way of example, a sensor system (e.g., prioritized or not prioritized) may receive a measurement signal (e.g., may generate a sensor signal and/or sensor data) that does not correlate with an expected output and/or with a predefined or expected range for the output. In this case, the output data (e.g., the incoherent sensor data) may be disregarded. Sensor data (e.g., reference sensor data) to be used may be specified (e.g., stored) in the General Setting Matrix (and retrieved therefrom). Illustratively, the General Setting Matrix (GSM) may store sensor data that may be used to replace the incoherent sensor data (e.g., in that specific vehicle condition).

The expected output and/or output range may be based (e.g., determined), for example, on immediately preceding data (e.g., on a sensor signal or sensor data generated at a previous time point, e.g. thirty seconds before, one minute before, etc.). The immediately preceding data may be the sensor data generated by the same sensor system immediately before the sensor data that are being evaluated.

As another example, a sensor system (e.g., prioritized or not prioritized) may provide no measurement signal (e.g., no sensor signal or no sensor data), e.g. due to malfunction. Illustratively, a sensor system may output a measurement signal (e.g., a sensor signal or sensor data) that does not correlate with the expected output and/or output range in such a way that no measurement signal is provided, e.g. because of malfunction. In this case, the output data ("zero values", indicating for example that no object is present in an evaluated angular segment) may be disregarded. Sensor data may be used as specified by the General Setting Matrix (GSM).

As a further example, a combination of sensor systems (e.g., is prioritized or not prioritized) may provide a measurement signal (e.g., may generate a sensor signal and/or sensor data) that does not correlate with an expected output and/or output range. In this case, the output data may be disregarded. Sensor data (e.g., associated with that combination of sensor systems) may be used as specified by the General Setting Matrix (GSM).

In various embodiments, in case the General Setting Matrix (GSM) does not store (e.g., does not list) further specifications or instructions (e.g., further or alternative sensor data to be used), an emergency signal (or warning signal) may be generated (e.g., the General Setting Matrix (GSM) may provide a GSM-specific emergency signal). The emergency signal may describe one or more emergency actions or commands to be undertaken or executed. Illustratively, the emergency signal may be used for further vehicle guidance. By way of example, in a parking lot situation, an immediate brake-signal may be provided. As another example, in a motorway situation a warning light may be flashed while the vehicle is cautiously steered towards the emergency lane. Thus, situations that may lead to sensor malfunction and/or to aberrant (e.g., incoherent) sensor data (e.g., output data), for example caused by an adversarial (e.g., brute force) attack, may be handled.

In various embodiments, the coherence of (e.g., first) sensor data generated by a first sensor system may be determined (e.g., evaluated) in relation with (e.g., second) sensor data generated by a second sensor system (e.g., an expected value for the first sensor data may be determined based on the second sensor data). Illustratively, sensor data from at least two sensor systems (e.g., from at least two sensors) may be combined, and their synchronicity and logical coherence may be compared. This approach may be effective, for example, to remedy or reduce the effect of a sophisticated attack. A sophisticated attack may not disturb the sensor measurement process per se but may manipulate it in such a way that a sensor receives input data (e.g., corrupted or perturbed input data) that lead to a different result (e.g., to different sensor data) compared with an unperturbed sensor input situation. As an example, a traffic road sign may be manipulated to show a STOP sign instead of an intended speed limit. A sophisticated attack (or attacker) may intentionally display a visual indication (e.g., a text message, a sign or a logo) that does not reflect the current traffic situation properly. The visual indication may be displayed, for example, on the back of a preceding vehicle, or projected onto the street. As an example, a STOP sign or a traffic jam warning message may be projected onto the street, while the traffic is actually flowing smoothly. Thus, determining the coherence of sensor data from at least two sensor systems may provide the effect of determining whether one of the sensor system has been attacked (e.g., fooled).

In various embodiments, the coherence of the sensor data may be determined based on one or more position-coded rulings data (e.g., on GPS-coded rulings). Illustratively, the expected value for the sensor data may be determined (e.g., predicted) based on the position-coded rulings. The position-coded rulings may be included in (or may be described by) the location selective category. Logical coherence may be based on GPS-coded data sets. Additionally or alternatively, the coherence of the sensor data may be determined according to one or more Bayesian rulings.

By way of example, in case the vehicle is on an interstate, the current position data may specify parameters for the 'interstate' condition (e.g., the current location selective category may describe an 'interstate' condition). In this setting (e.g., in this vehicle condition), certain combinations of traffic signs or other traffic regulations may be determined as admissible or not admissible. As an example, it may be determined that a traffic speed sign (wrongly) displays a way too high speed limit. As another example, it may be determined that a TURN RIGHT sign is placed in a location where no right turn can be made (e.g., as indicated by the position data, e.g. by a GPS map). As another example, a camera may interpret a STOP sign but another sensor system (or all other sensor systems) indicate a smoothly flowing traffic situation or an otherwise undisturbed environment. As a further example, a camera may not recognize any pedestrian (e.g., during the day) in a city downtown area (e.g., due to the effect of an adversarial attack). In these cases, another prioritization (or other sensor data) may be determined (and used), e.g. based on the data stored in the General Setting Matrix. Illustratively, a prioritization (e.g., an instant prioritization) of other preferred sensor data (e.g., sensor data sets) or other default values (e.g., enter into safety mode) may be provided.

Illustratively, one or more position-coded (e.g., GPS-coded) rulings may be provided or determined (e.g., from or associated with the location selective category (LSC)). The one or more position-coded rulings may describe certain combinations of commands (e.g., traffic commands) that are allowed or allowable in the current scenario (e.g., in the current vehicle condition). Sensor data that are not consistent (e.g., coherent) with said one or more rulings may be disregarded (e.g., the individual or combined sensor inputs may be disregarded) or at least questioned. A confidentiality value for the sensor system (or the sensor data) may be determined, for example ranging from 0 to 1, wherein 0 may indicate that it may be very unlikely that an attack has occurred, for example a sophisticated attack, and 1 may indicated that it may be very likely that an attack has occurred.

In various embodiments, the determination of the (e.g., logical) coherence of the sensor data may be provided by a module of the vehicle or of a sensor device (e.g., a Logical Coherence Module, LCM). The Logical Coherence Module (LCM) may be configured to determine a signal reliability factor for the sensor data. The signal reliability factor may describe the (e.g., determined) coherence (or level of coherence) of the sensor data with to the respective expected value. The signal reliability factor may range, for example, from 0 to 1, wherein 0 may indicate substantially no coherence (or no correlation) and 1 may indicate a substantially perfect match (e.g., a high level of coherence or correlation).

The Logical Coherence Module (LCM) may be configured to is provide the (e.g., position coded) signal reliability factor to the General Setting Matrix (e.g., the LCM may be configured to output coherence data (e.g., coherence value (s) into the GSM). Based on the LCM-data, a corresponding configuration for the sensor systems (e.g., corresponding sensor data) may be determined (e.g., retrieved from the GSM). By way of example, the Global Setting Matrix (GSM) may be configured (e.g., programmed) to determine, based on the signal reliability factor (e.g., on the probability), whether to keep the normal procedure or to change to another sensor system or sensor system combination or to output default emergency values. The default emergency values may be used for further vehicle guidance.

In various embodiments, the Logical Coherence Module (LCM) may be configured (e.g., programmed and/or trained) to evaluate (misleading) combined sensor signals (e.g., combined sensor data), for example in case of a multiple sensor attack. The Logical Coherence Module (LCM) may be configured to perform said evaluation by comparison of the sensor data with other data sets (e.g., vehicle-internal and/or vehicle-external data sets).

A Logical Coherence Module (LCM) may be configured to evaluate the occurrence of an attack in case sensor data suddenly indicate an opposite situation or scenario with respect to immediately previous sensor data. As an example, the Logical Coherence Module (LCM) may be configured to evaluate the occurrence of an attack in case a previously detected and registered object suddenly vanishes (false negative) or suddenly appears (false positive). In this case, the Logical Coherence Module (LCM) may be configured to evaluate and to take into consideration whether the object may be a rapidly moving object (e.g., a drone, such as a flying drone).

In various embodiments, the Logical Coherence Module (LCM) may include Deep Learning and/or Artificial Intelligence (AI) methods, e.g. based on neural networks. Illustratively, the Logical Coherence Module (LCM) may employ (or may at least be assisted by) Deep Learning and/or Artificial Intelligence (AI) methods for evaluating the coherence of the sensor data.

In various embodiments, information on the signal reliability factor (e.g., on the coherence of the sensor data) and/or on its determination (e.g., its assignment to the sensor data) may be provided to another device (e.g., to a vehicle-internal or vehicle-external device). As an example, the Logical Coherence Module (LCM) and/or the Global Setting Matrix (GSM) may be configured to provide the respective output signal to a (e.g., individual or combined) sensor control system. The sensor control system may be configured to initiate a change of sensor settings (e.g., camera focus, LIDAR beam intensity, Field-of-View angles, data compression, and the like). The data compression may include, for example, the use of a memory for intermediate data storage, as discussed in further detail below. As another example, the Logical Coherence Module (LCM) and/or the Global Setting Matrix (GSM) may be configured to generate a report and to send it to a traffic control station and/or to Traffic Authorities (e.g., indicating the location and the nature of the determined attack).

FIG. 124 shows a method 12400 in accordance with various embodiments.

The method 12400 may include, in 12402, receiving sensor data. The (e.g., received) sensor data may be generated (e.g., provided) by one or more sensor systems. As an example, the one or more sensor systems may include one or more RADAR systems, and/or one or more camera systems, and/or one or more LIDAR systems (e.g., the LIDAR Sensing System 10), and/or one or more ultrasound systems. The one or more sensor systems may include one or more respective sensors (e.g., a LIDAR system may include a LIDAR sensor 52). The one or more sensor systems may be included in a vehicle (e.g., a vehicle with automated driving capabilities, e.g. an automated vehicle). The one or more sensor systems may be included in a sensor device. Illustratively, a sensor device may be a vehicle, or a sensor device may be included in a vehicle. The sensor data may be provided to a data processing system (e.g., of the vehicle or of a sensor device), for example the sensor data may be provided a Logical Coherence Module (LCM) of the data processing system.

The sensor data may describe, for example, an environment surrounding the one or more sensor systems (e.g., an environment surrounding the vehicle). As an example, the sensor data may describe driving related or traffic related information (e.g., the presence of other vehicles, the presence and the meaning of a traffic sign, the presence of an obstacle, and the like). As another example, the sensor data may describe an atmospheric condition (e.g., surrounding the vehicle).

The method 12400 may further include, in 12404, determining a signal reliability factor for the received sensor data (e.g., the Logical Coherence Module may be configured to determine the signal reliability factor). The signal reliability factor may describe or represent a coherence (e.g., a correlation or an agreement) of the received sensor data with an expected value for the received sensor data (e.g., with expected or predicted sensor data, for example with a range of expected values for the received sensor data). The signal reliability factor may be a numerical value representing the coherence (or the level of coherence), for example ranging from 0 (non-coherent) to 1 (fully coherent). Illustratively, the signal reliability factor may provide an indication whether the received sensor data are reliable (e.g., credible) or not (e.g., whether the received sensor data make sense or not, for example in a specific vehicle condition). Further illustratively, the signal reliability factor may describe a deviation (in other words, a difference) of the received sensor data from the expected value for the received sensor data.

The expected value for the received sensor data may be determined based on previous sensor data. Stated differently, the coherence of the received sensor data may be determined based on previous sensor data (e.g., the signal reliability factor for the received sensor data may be determined based on previous sensor data). The previous sensor data may have been received (e.g., by the Logical Coherence Module) at an antecedent (in other words, previous) time point with respect to the (e.g., newly received) sensor data. A time difference between the previous sensor data and the newly received sensor data (e.g., a time difference between the reception of the previous sensor data and the reception of the sensor data) may be less than 5 minutes, for example less than 1 minute, for example less than 30 seconds. The previous sensor data may have been generated by the same sensor system or the same combination of sensor systems that provided the newly received sensor data. Additionally or alternatively, the previous sensor data may have been generated by another sensor system or another combination of sensor systems. A signal reliability factor for the previous sensor data may have been determined, which may indicate that the previous sensor data are reliable. As an example, in case a camera system or a LIDAR sensor system indicates the sudden appearance (or disappearance) of an object (e.g., absent (or present) according to the immediately previous sensor data), a low coherence with the previous sensor data may be determined (and the reliability of the measurement may be questioned).

The expected value for the received sensor data may be determined based on other sensor data (e.g., the method may include receiving other sensor data, for example the Logical Coherence Module may be configured to receive other sensor data). The received sensor data may be (e.g., first) sensor data generated by a first sensor system or a first combination of sensor systems. The expected value for the first sensor data may be determined based on (e.g., second) sensor data generated by a second sensor system or a second combination of sensor systems (e.g., the coherence of the first sensor data may be determined based on the second sensor data). Stated differently, the signal reliability factor for the received sensor data may be determined based on sensor data generated by another sensor system or another combination of sensor systems. Illustratively, the coherence of the received sensor data may be determined by means of a combination of sensor data from different sources. As an example, the reliability of sensor data generated by an ultrasound system may be determined (e.g., confirmed) by taking into account sensor data generated by a camera system, and vice versa (e.g., by checking the correspondence between the respective sensor data).

The expected value for the received sensor data may be determined based on a vehicle condition. Stated differently, the coherence of the received sensor data may be determined based on the vehicle condition (e.g., the signal reliability factor for the received sensor data may be determined based on the vehicle condition). A vehicle condition may describe a condition (e.g., a scenario) in which a vehicle is residing. The vehicle condition may include (e.g., describe or represent) position-coded information (e.g., information related to a location or coordinates of the vehicle). The vehicle condition (e.g., the position-coded information) may be determined, at least in part, on position data (e.g., GPS data). Illustratively, the method 12400 may include receiving position data (e.g., from a GNSS Module or a GPS Module). The method 12400 may include determining the vehicle condition (e.g., one or more factors defining the vehicle condition) based, at least in part, on the received position data (e.g., the Logical Coherence Module may be configured to determine the vehicle condition based on the received position data).

The vehicle condition may include (e.g., describe or represent) a location selective category (LSC) (or a plurality of location selective categories). The location selective category (LSC) may describe location-specific (e.g., position-specific) information, e.g. information related to a current location (e.g., current coordinates) of a vehicle. The location selective category (LSC) may describe a location of the vehicle and/or information related to the location (e.g., one or more position-coded rulings). As an example, the location selective category (LSC) may describe that the vehicle is located in a parking lot, and may describe information related to the parking lot (e.g., speed limit, exits, direction of travel within the parking lot, etc.).

The vehicle condition may include an environmental setting (ES) (or a plurality of environmental settings). The environmental setting (ES) may describe one or more vehicle-external conditions, e.g. conditions that may affect a vehicle but that are not under direct control of the vehicle or of an occupant of the vehicle. The environmental setting (ES) may include, for example, weather, traffic density and the like, e.g. determined based on the current location of the vehicle.

The vehicle condition may include a driving status (DS) (or a plurality of driving statuses). The driving status (DS) may describe one or more vehicle-internal conditions, e.g. conditions that may affect a vehicle and that may be controllable (or defined) by the vehicle or by an occupant of the vehicle. The driving status (DS) may include, for example, vehicle type and autonomy level of the vehicle, e.g. determined based on the current location of the vehicle (for example, for a vehicle traveling in a city the autonomy level may be different than for a vehicle traveling on a highway).

The vehicle condition may include one of the above mentioned factors, or more than one of said factors, e.g. a combination of one or more of said factors.

The vehicle condition may be determined by means of sensor data (e.g., other sensor data with respect to the sensor data to be evaluated, for example by means of previous sensor data). The method 12400 may include determining the vehicle condition based, at least in part, on other sensor data (e.g., the Logical Coherence Module may be configured to perform such determination). Illustratively, the various factors may be determined based on (e.g., other) sensor data. As an example, a location specific category may be determined from or based on sensor data from a camera system. As another example, a traffic density may be determined based on RADAR and/or LIDAR measurements. As a further example, driver identification data may be known or may be determined from a camera system (e.g., imaging the inside of the vehicle).

A plurality of datasets (e.g., a database storing a plurality of datasets, e.g. a Global Setting Matrix) may be provided. The plurality of datasets may describe reference sensor data (a plurality of reference sensor data). The reference sensor data (e.g., each reference sensor data) may be associated with a respective vehicle condition. The reference sensor data may describe sensor data to be expected in the vehicle condition associated therewith. Illustratively, for each vehicle condition (e.g., each factor or combination of factors) respective expected sensor data may be stored (e.g., in the Global Setting Matrix). The method 12400 may include determining the expected value for the received sensor data from the reference sensor data (e.g., to determine a coherence of the received sensor data from the reference sensor data). Illustratively, the method 12400 may include retrieving reference sensor data associated with the current vehicle condition from a plurality of reference sensor data (e.g., from the Global Setting Matrix). By way of example, the Logical Coherence Module may be configured to perform such determination (and/or such retrieval).

It is intended that the various approaches to determine the coherence of the received sensor data described herein (e.g., the various approaches to determine the expected value of the received sensor data) may be used independently or may combined with one another (e.g., depending on a specific vehicle condition).

The method 12400 may include, in 12406, assigning the determined signal reliability factor to the received sensor data (e.g., associating the received sensor data with the determined signal reliability factor). Illustratively, the method 12400 may include generating information on the reliability of the received sensor data (and providing said information to a control system of the vehicle or of a sensor device, e.g. a sensor control system). By is way of example, the Logical Coherence Module may be configured to perform such association of the signal reliability factor with the received sensor data.

Based on the determined (and assigned) signal reliability factor, various actions may be performed and/or various decisions may be taken. The method 12400 may include controlling a vehicle taking into consideration (in other words, according to) the received sensor data and the signal reliability factor. Illustratively, one or more vehicle commands (e.g., vehicle steering) may be generated based on the received sensor data and the signal reliability factor.

As an example, in case the signal reliability factor is below a predefined threshold, the vehicle may be controlled ignoring the received sensor data (e.g., in case the signal reliability factor is particularly low, for example lower than 0.25 or lower than 0.1). As another example, the vehicle may be controlled in a way that ensures a safe operation of the vehicle in the assumption that the sensor data may be unreliable (e.g., an emergency command may be provided). The emergency command may be provided, for example, in case the signal reliability factor is between a lower threshold and an upper threshold (e.g., lower than 0.75 or lower than 0.5 and greater than 0.25 or greater than 0.1). The method 12400 may include controlling the vehicle based on the reference sensor data associated with the (e.g., current) vehicle condition. Illustratively, reference (e.g., expected) sensor data may be retrieved from the General Setting Matrix and may be used to control the vehicle. As another example, in case the signal reliability factor is above a predefined threshold (for example greater than 0.75 or greater than 0.9), the vehicle may be controlled according to the received sensor data. One or more vehicle commands may be generated that take into account the information provided by the sensor data (for example, the presence of an obstacle or a speed limit to be observed). Illustratively, the method 12400 may include disregarding the received sensor data or using the received sensor data to generate one or more vehicle commands depending on the assigned signal reliability factor. By way of example, a central control system of the vehicle may be configured to perform such control actions (e.g., after receiving the signal probability factor and the sensor data, for example from the Logical Coherence Module).

The method 12400 may include changing a configuration of one or more sensor systems based on the determined (and assigned) signal reliability factor. The configuration of one or more sensor systems that generated the received sensor data (e.g., individually or in combination) may be changed. Additionally or alternatively, the configuration of one or more other sensor systems (e.g., that did not generate the evaluated sensor data) may be changed. A sensor control system (e.g., a sensor setting system) may be configured to implement such configuration change. By way of example, the configuration may include one or more sensor systems to be deactivated (or deprioritized). Illustratively, in case the signal reliability factor is below a predetermined threshold, the one or more sensor systems that generated the received (e.g., unreliable) sensor data may be deactivated (e.g., at least temporarily). One or more other sensor systems may be used instead, e.g. may be activated or prioritized with respect to the one or more sensor systems that generated the received sensor data. Illustratively, the configuration may include a number (or a combination) of sensor systems to be deactivated (or deprioritized) and/or a number (or a combination) of sensor systems to be activated (or prioritized). As another example, in case the signal reliability factor is below the predefined threshold, the one or more sensor systems that generated the received sensor data may be controlled to repeat the measurement (e.g., the respective data acquisition rate may be increased), to perform further evaluation of the reliability of the sensor data. As a further example, in case the signal reliability factor is below the predefined threshold, data may be retrieved from a memory for intermediate data storage (e.g., redundant and/or less relevant data may be used for assessing the reliability of the sensor data). As a further example, one or more other sensor systems may be controlled to perform a measurement in the area (e.g., in the angular segment) that had been interrogated by the one or more sensor systems that generated the received sensor data.

The method 12400 may include selecting the configuration from a plurality of configurations. Each configuration may be associated with a respective vehicle condition. Illustratively, based on the (e.g., determined) vehicle condition, a corresponding (e.g., optimized) configuration for the one or more sensors may be selected (or an alternative configuration in case of low signal reliability factor). The configurations may be stored, for example, in the Global Setting Matrix.

The method 12400 may include storing the signal reliability factor. Additionally or alternatively, the method 12400 may include storing information describing the assignment of the reliability factor to the received sensor data (e.g., information on the vehicle condition, information on how the sensor data deviate from the expected sensor data, information on a possible cause for the deviation, and the like). The signal reliability factor and the related information may be stored, for example, in a memory of the vehicle or of the Logical Coherence Module (LCM). Additionally or alternatively, the reliability factor and the related information may be stored in the Global Setting Matrix.

The method 12400 may include transmitting the signal reliability factor to another device (e.g., a vehicle-external device). Additionally or alternatively, the method 12400 may include transmitting information describing the assignment of the reliability factor to the received sensor data to the other device. The other device may be, for example, a traffic control station or another vehicle (for example, to indicate a potential source of disturbance for the sensor systems). The other device may be Traffic Authorities (e.g., it may be a communication interface with the Traffic Authorities). Illustratively, the method 12400 may include determining based on the signal reliability factor whether the received sensor data have been corrupted due to an adversarial attack. The signal reliability factor may describe a probability of the received sensor data being affected by an adversarial attack (or by natural causes). As an example, in case the signal reliability factor is below a predetermined threshold, it may be determined that an adversarial attach has occurred. Corresponding information may be sent to the Traffic Authorities.

FIG. 125A and FIG. 125B show each a system in a schematic view in accordance with various embodiments.

The system may be configured to implement the method 12400 described in relation to FIG. 124. The system may be or may be configured as the LIDAR Sensing System 10 (e.g., the Retrofit LIDAR sensor system 10) described, for example, in relation to FIG. 1. It is intended that the system illustrated in FIG. 125A and FIG. 125B may include one or more of the components (e.g., all the components) of the LIDAR Sensing System 10 as described, for example, in relation to FIG. 1. The system may be integrated or embedded in a sensor device (e.g., in the LIDAR Sensor Device 30), for example a housing, a vehicle, a vehicle headlight.

The system may be configured to receive and measure electromagnetic or other types of object-reflected or object-emitted radiation 130, but also other wanted or unwanted electromagnetic radiation 140 (e.g., one or more attack inputs, e.g. one or more inputs manipulated to fool the system, as illustrated for example in FIG. 125B).

The system may be configured to determine a position of the system (e.g., of the sensor device, e.g. of the vehicle). The system may include a position module 12502 (e.g., a GPS module, e.g. a GPS sensor). The position module 12502 may be configured to generate position data (or to receive position data, for example from an external device, such as a traffic control station).

The system may include a data processing system (e.g., the LIDAR data processing system 60). The data processing system may be configured to perform signal processing 61, data analysis and computing 62, sensor fusion and other sensing functions 63. The data processing system may be configured to check (e.g., to evaluate) the coherence of the sensor data (e.g., generated by a sensor of the system, e.g. the LIDAR sensor 52, or provided from a sensor signal generated by the sensor). The data processing system may include a logical coherence module 12504 (e.g., a coherence checking system), configured as described above. Illustratively, the logical coherence module 12504 may be configured to perform the method 12400 (or at least part of the method 12400). The data processing system may include the Global Setting Matrix 12506, configured as described above. The system may include a data management system (e.g., the LIDAR sensor management system 90) configured to manage input and output data (e.g., to communicate with system-external or vehicle-external devices). The data processing system (e.g., the logical coherence module 12504) may employ, at least in a supportive way, any other suitable and connected device including any cloud based services.

FIG. 126 shows a system and a signal path in a schematic view in accordance with various embodiments. Illustratively, FIG. 126 shows a flow chart related to the reception and processing of a signal input (e.g., of an adversarial signal).

An input provider 12602 may provide an input signal 12604 to the system (e.g., to the sensor device 30). The input provider 12602 may be, for example, an object (e.g., a vehicle or a traffic sign) in the field of view of the system. The input signal 12604 may be a genuine input signal or it may be an adversarial signal, e.g. a manipulated signal (e.g., the input provider 12602 may be a provider of adversarial signals, e.g. a manipulated traffic sign, or a vehicle emitting light or displaying a manipulated image).

The system (e.g., the sensor device 30) may be configured to provide sensor data 12606 generated according to the input signal 12604 to the data processing system (e.g., to the LIDAR data processing system 60). The data processing system may be configured to provide the sensor data 12608 (e.g., after an initial pre-processing) to the logical coherence module 12504. The logical coherence module 12504 may be configured to evaluate the coherence of the sensor data 12608 and to provide coherence data 12610 as an output. The coherence data 12610 may include or may describe the signal reliability factor assigned to the sensor data 12608, and/or information related to its assignment. The logical coherence module 12504 may be configured to provide the coherence data 12610 to the Global Setting Matrix 12506. Additionally or alternatively, the Global Setting Matrix 12506 may be configured to provide data to the logical coherence module 12504 (e.g., data for evaluating the reliability of the sensor data 12608, such as data describing the expected value for the sensor data 12608, for example location selective categories, environmental settings, and driving scenarios). Based on the received coherence data 12610, the Global Setting Matrix 12506 may be configured to provide an input 12612 (e.g., input data) to the data management system (e.g., the LIDAR sensor management system 90). Additionally or alternatively, the Global Setting Matrix 12506 may be configured to provide the input data to Traffic Authorities. The data management system may be configured to store the received input data and/or to transmit the received input data to a system-external device.

Various embodiments as described with reference to FIG. 124 to FIG. 126 may be combined with the intelligent navigation embodiments as described with reference to FIG. 85 to FIG. 88.

Various embodiments as described with reference to FIG. 124 to FIG. 126 may be combined with the intelligent navigation embodiments as described with reference to FIG. 127 to FIG. 130.

In the following, various aspects of this disclosure will be illustrated:

Example 1u is a method. The method may include receiving sensor data. The method may include determining a signal reliability factor for the received sensor data. The signal reliability factor may describe a coherence of the received sensor data with an expected value for the received sensor data. The method may include assigning the determined signal reliability factor to the received sensor data.

In Example 2u, the subject-matter of example 1u can optionally include controlling a vehicle taking into consideration the received sensor data and the assigned signal reliability factor.

In Example 3u, the subject-matter of any one of examples 1u or 2u can optionally include that disregarding the received sensor data or using the received sensor data to generate one or more vehicle commands depending on the assigned signal reliability factor.

In Example 4u, the subject-matter of any one of examples 1u to 3u can optionally include that the signal reliability factor describes a deviation of the received sensor data from the expected value for the sensor data.

In Example 5u, the subject-matter of any one of examples 1u to 4u can optionally include that the expected value for the received sensor data is determined based on previous sensor data received at an antecedent time point with respect to the sensor data.

In Example 6u, the subject-matter of any one of examples 1u to 5u can optionally include that the received sensor data are first sensor data generated by a first sensor system. The method may further include receiving second sensor data generated by a second sensor system. The method may further include determining the expected value for the first sensor data based on the received second sensor data.

In Example 7u, the subject-matter of any one of examples 1u to 6u can optionally include that the expected value for the received sensor data is determined based on a vehicle condition.

In Example 8u, the subject-matter of example 7u can optionally include that the vehicle condition includes a location selective category, and/or an environmental setting, and/or a driving status.

In Example 9u, the subject-matter of any one of examples 7u or 8u, can optionally include receiving position data. The position data may describe a position of a vehicle. The method may further include determining the vehicle condition based at least in part on the received position data.

In Example 10u, the subject-matter of any one of examples 7u to 9u can optionally include determining the vehicle condition based on other sensor data.

In Example 11u, the subject-matter of any one of examples 7u to 10u can optionally include determining the expected value for the received sensor data from reference sensor data. The reference sensor data may be associated with a respective vehicle condition.

In Example 12u, the subject-matter of any one of examples 1u to 11u can optionally include changing a configuration of one or more sensor systems based on the determined signal reliability factor.

In Example 13u, the subject-matter of example 12u can optionally include selecting the configuration for the one or more sensor systems from a plurality of configurations each associated with a respective vehicle condition.

In Example 14u, the subject-matter of example 13u can optionally include that the configuration includes a number of sensor systems to be deactivated and/or deprioritized.

In Example 15u, the subject-matter of any one of examples 1u to 14u can optionally include storing the signal reliability factor and information describing its assignment to the received sensor data.

In Example 16u, the subject-matter of any one of examples 1u to 15u can optionally include transmitting the signal reliability factor and information describing its assignment to the received sensor data to another device.

In Example 17u, the subject-matter of any one of examples 1u to 16u can optionally include that the signal reliability factor describes a probability of the received sensor data being affected by an adversarial attack.

Example 18u is a device, including one or more processors configured to perform a method of any one of examples 1u to 17u.

Example 19u is a vehicle, including the device of example 18u.

Example 20u is a computer program including instructions which, when executed by one or more processors, implement a method of any one of examples 1u to 17u.

An automated (in other words, autonomous) vehicle (e.g., a vehicle including a driving automation system, an advanced driver-assistance system, or the like) may require a multitude of sensors and vast computer processing power in order to perceive (in other words, to sense) the surrounding environment in great detail and take real time decisions (e.g., based on the sensed environment), even in complex traffic situations. Safe and secure sensing and decision making may also require back-up and fallback solutions, thus increasing redundancy of equipment (e.g., sensors) and processes. These operations may also require an elevated energy consumption and/or power consumption, which may reduce the (e.g., available) mileage of the automated vehicle, for example of a battery-operated electric vehicle operating in a fully autonomous or partially autonomous driving mode.

Illustratively, a vehicle with automated driving capabilities may require and include a multitude of sensor systems (e.g., of sensor devices). Such automated vehicle may also require and include other equipment for data generation and processing. By way of example, the automated vehicle may include equipment for data compression, data fusion, and data management (such as data storing, retrieving, encoding, compiling, and the like). The automated vehicle may also require and include one or more computing devices configured to determine (e.g., to calculate) and select suitable commands, e.g. driving commands for the vehicle, such as vehicle steering commands. In particular, computing devices may be required in case the driving is assisted by Deep Learning or other Artificial Intelligence methods (e.g., based on neural networks, convolutional neural networks, and the like). In addition, power is needed for all kinds of (e.g., internal or external) communication, such as vehicle-to-vehicle (V2V), vehicle-to-environment (V2X), and intra-vehicle communication, as well as for various display functions.

By way of example, sensor systems in an automated vehicle may include one or more sensors for RADAR detection, one or more sensors for LIDAR detection, one or more cameras, one or more ultrasound sensors, an inertial measurement system (IMU), a global positioning system (GNSS/GPS), and the like. A sensor system may include an emitter path and a receiver path. The sensor systems or the vehicle may include additional components or processors for data compression, sensor fusion, and data management. A vehicle may include more than one of each sensor types (or sensor system types). By way of example, an automated vehicle may include 4 LIDAR systems, 2 RADAR systems, 10 camera systems, and 6 ultrasound systems.

The computing power (in other words, the computational power) required for dealing with the amount of data generated by the various sensor systems may be immense. Illustratively, in a conventional automated vehicle a power consumption of about 100 W may be assumed. The power consumption may be dependent on the processor hardware included in the vehicle and/or on the software used for the computations (e.g., on the computational method, e.g. on the Artificial Intelligence method). Depending on the quality (and on the cost) of the equipment of the vehicle, the power consumption may be even higher than 100 W. Furthermore, additional power may be required for data encryption and decryption.

Additional equipment and/or functionalities of the vehicle may further increase the power consumption. By way of example, the vehicle may include one or more devices for vehicle-to-vehicle (V2V) and/or vehicle-to-environment (V2X) communication. As another example, the vehicle may include one or more displays (such as a head-up display, a holographic display, a monitor, or the like) and/or one or more infotainment devices together with the respective data communication channels. As a further example, the vehicle may include amenities like heating, ventilation, and air conditioning (HVAC), including for example seat heating during winter time, which amenities may consume a lot of energy. Additionally, an automated vehicle (e.g., even a fully automated vehicle) may include recognition and tracking of an occupant's face, eyes, body position and gestures as well as occupancy presence monitoring (e.g., after each vehicle stop), and measures against burglary, all leading up to the need for sustained electrical power. Lighting and signaling functions may also be required and included.

As discussed above, particularly demanding in terms of power consumption may be the on-board computing system suitable for processing the sensor data streams, providing sensor fusion data (e.g., using artificial intelligence methods), and finally generating and outputting vehicle commands (e.g., steering commands) and/or indications to an occupant of the vehicle. Even in the case cloud computing was implemented, big data streams and additional calculations may still need to be processed and performed locally at the vehicle. By way of example, it may be estimated that 4 to 6 RADAR systems generate data streams of up to about 15 Mbit/s, 1 to 5 LIDAR systems generate data streams of up to about 200 Mbit/s, 6 to 12 cameras generate data streams of up to about 3500 Mbit/s. Thus, a data stream up to about 40 Gbit/s (or about 19 Tbit/h) may be estimated for an automated vehicle. Taking into account typical (e.g., average) driving times per day and year a data stream of about 300 TB per year (or even higher) may be estimated.

Therefore, considering the various aspects discussed above, the power load of a vehicle with automated driving capabilities (e.g., of an autonomously driving electric car) may be from about 200 W to about 1 kW, or even higher depending on the type of technology implemented in the vehicle.

Various embodiments may provide a vehicle (e.g., an electric vehicle, for example a vehicle with automated driving capabilities) with optimized power consumption (e.g., optimized energy consumption). The vehicle may include one or more sensor systems. The mode of operation of the one or more sensor systems may be controlled such that a power consumption (e.g., an individual power consumption and/or a total power consumption associated with the one or more sensor systems) may be optimized for a condition (e.g., a scenario) the vehicle is residing in. Illustratively, the mode of operation may be selected that requires a power consumption as low as possible while still providing a suitable functioning of the vehicle (e.g., a safe driving) for the actual condition of the vehicle (e.g., the current driving and/or traffic scenario).

In the context of the present application, for example in relation to FIG. 123, the terms "energy", "power", "energy consumption", and "power consumption" may be used to describe what is provided to or used by a component of the vehicle (e.g., a sensor system or sensor device). In the context of the present application a reduced (or increased) energy or energy consumption may correspond to a reduced (or increased) power or power consumption, and vice versa.

The vehicle may include an energy source configured to provide energy (e.g., electrical energy) to the one or more sensor systems. As an example, the vehicle may include a battery, e.g. a battery suitable for use in a vehicle (such as in an electric vehicle). The energy source may be re-chargeable, e.g. by connecting the energy source to a charging device (e.g., by connecting the vehicle to a charging station). The function or the operation of an energy source (e.g., battery functions) may be dependent on one or more properties of the energy source (e.g., on a state of the energy source, for example (strongly) temperature-dependent. Thus, the vehicle (e.g., one or more processors of the vehicle) may be configured to operate (e.g., to control the one or more sensor systems) based on said one or more properties of the energy source, such as the temperature, the remaining capacity, the charging history, or other similar properties.

By way of example, the energy source may include or may be equipped with a status sensor (e.g., a battery status sensor). The status sensor may be configured to sense a state (in other words, a status) of the energy source (e.g., to sense a temperature, a remaining capacity, and the like). The status sensor may be configured to report the sensed state (e.g., to provide status data, e.g. one or more signals representing the sensed state or the sensed properties) to a vehicle control system (e.g., a vehicle control module). The vehicle (e.g., a processor of the vehicle or of the vehicle control system) may be configured to determine (e.g., to calculate) one or more properties of the energy source (e.g., based on the status data). By way of example, one or more processors may be configured to determine an actual and/or average usage of the energy source (e.g., an actual and/or average battery usage) and/or a charging history of the energy source. The vehicle (e.g., the vehicle control system) may also be configured to receive charging data (e.g., data representing a charging or a charging history) associated with the energy source from a vehicle-external charging device (e.g., a charging station), for example via W-LAN, Bluetooth, and the like.

Additionally or alternatively, the vehicle control system may be provided with (e.g., it may be configured to receive) information about one or more predefined properties of the energy source, such as hardware settings associated with the energy source (e.g., battery hardware settings). The one or more predefined properties may be, for example, stored in a memory of the vehicle control system or in a memory of the vehicle. The one or more predefined properties may include, for example, operational boundaries, allowed charging cycles, and the like.

In various embodiments, the vehicle control system may also be provided with (e.g., it may be configured to receive) vehicle target data. The vehicle target data may describe or represent information that may be used to estimate (or predict) a condition of the vehicle (e.g., at a subsequent time point). As an example, the vehicle target data may describe the amount of time for which the vehicle is expected to be operated (e.g., before the next charging). As another example, the vehicle target data may describe the amount of energy that is estimated to be required for the operation of the vehicle (e.g., during the expected amount of time). Illustratively, the vehicle target data may describe or represent driving instructions (e.g., a target destination and/or a route to the destination), time-to-destination, energy-to-destination, availability of charging stations, emergency situations, and the like. The vehicle target data may be, for example, stored in a memory of the vehicle control system or in a memory of the vehicle, or accessible via a communication interface of the vehicle control system or of the vehicle.

Various embodiments may be based on consuming as less power as possible for controlling the vehicle (e.g., for vehicle control) in order to reduce the $CO_2$-equivalent and prolong the life of the energy source (e.g., to prolong battery mileage for a partially or fully autonomously driving vehicle). Furthermore, a reduced power consumption may enable an Eco-mode in a vehicle, e.g. also in a non-electrical vehicle.

A reduction in energy consumption (e.g., a reduction of the $CO_2$-footprint) may be achieved via priority and optimization settings. The priority and optimization settings may regard factors related to energy consumption. The priority and optimization settings may regard factors related to the performance of certain functionalities (e.g., vehicle functionalities). The priority and optimization settings may describe the relevance or the relative importance of a reduced energy consumption with respect to other functionalities, in a current condition (e.g., vehicle condition). Illustratively, the priority and optimization settings may describe the relevance of a preservation of the battery with respect to the detection capabilities of the sensor systems in a current driving or traffic scenario. In some cases, the priority settings may be substantially fixed or unalterable (e.g., in cases where comfort-related aspects are involved). In other cases, for example in (uncritical) standard (e.g., driving) situations or in (more critical) safety-related cases, the priority settings may be dynamic and may depend on various vehicle-external factors (e.g., traffic density, driving situation, weather conditions, ambient light conditions, and the like). By way of example, the priority settings may be included or specified in a traffic map received by the vehicle, as described in further detail below, for example in relation to FIG. 127 to FIG. 130. Illustratively, the priority settings may be described by one or more sensor instructions included in the traffic map (e.g., in traffic map data). The instructions may take into consideration, as an example, the traffic relevance of an object and/or a presence probability factor of an object as described, for example, in relation to FIG. 85 to FIG. 88.

By way of example, in a vehicle, auxiliary equipment (e.g., auxiliary devices, such as entertainment devices, seat heating, HVAC, interior lighting, wireless communication, and the like) may be reduced (e.g., at least partially turned off) to reduce the power load for the vehicle. Power saying may also affect the settings of the vehicle lighting (e.g., external vehicle lighting).

Various embodiments may be based on controlling (e.g., selecting) the functionality (in other words, the operation) of the one or more sensor systems (e.g., sensor functionality) and/or the combination of used sensor systems to reduce a power load of the vehicle.

Illustratively, a configuration of the one or more sensor systems may be selected (e.g., controlled or changed) to reach a lower overall power consumption. A selection of sensor systems (or sensors) to be used may be provided, and/or sensor system settings (or sensor settings) may be changed. As an example a sensor or a sensor system may be switched off (e.g., at least temporarily). As another example, redundant sensor measurements may be reduced or waived completely (e.g., angular segments monitored by two sensors or sensor systems may be monitored by only one sensor or sensor system). The selection (or the change) may be performed in accordance with a condition the vehicle is residing in. By way of example, the selection may be dependent on traffic density and/or traffic behavior of other vehicles. As a further example, the selection may be performed in accordance with environmental conditions, such as weather and ambient lighting conditions. As a further example, the selection may be performed in accordance with SAE-levels (e.g., as defined by the Society of Automotive Engineers (SAE), for example in SAE J3016-2018: Taxonomy and definitions for terms related to driving automation systems for on-road motor vehicles).

Various embodiments may be based on reducing or minimizing the power load by choosing a best-selected sensor scenario (e.g., sensor type, sensor combination and/or sensor operation). The selected sensor scenario may allow data processing with less energy consumption (for example taking into consideration subsequent computing power for processing the sensor data generated in the sensor scenario). The selected sensor scenario may also have the effect of shortening the calculation time for vehicle control commands.

By way of example, a RADAR system may be controlled to use (e.g., to require) reduced power, while still maintaining an acceptable detection range. A LIDAR system may be controlled to reduce or limit its Field-of-View (FoV) and/or its laser power (e.g., the power of the emitted light). A LIDAR system may also be controlled to reduce its resolution, for example by reducing laser pulse rate, signal sampling rate, and/or frame rate, and/or by using more efficient data compression mechanisms (e.g., data compression algorithms) or by allowing for more lossy (and less energy-consuming) data compression mechanisms.

The change in the sensor system properties (e.g., a reduced resolution, a reduced frame rate, and a reduced emitted power) may be applied for the entire field of view of that sensor system or for one or more specific segments (in other words, portion) of the field of view of that sensor system. Illustratively, a sensor system may be controlled (e.g., configured) to operate with a reduced resolution in a first segment of the field of view, and to operate with the standard (e.g., default) resolution in a second segment of the field of view. By way of example, based on the traffic map data (e.g., on the sensor instructions included therein) one or more segments of the field of view may be selected as less (or more) relevant in view of the current driving or traffic scenario. In such selected segments, the sensor system properties may accordingly be reduced (or augmented). The selection of the segments may be based, for example, on an assessment of a potential danger associated with an object in that segment (or in those segments), e.g. on a danger identification, as will be described in further detail below.

The data compression mechanism may include the use of a memory for intermediate data storage, as will be described in further detail below. Such memory for intermediate data storage may be configured to store data from the original data stream, which stored data may include redundant or less relevant (or non-relevant) data elements.

A camera (e.g., a camera system) may be controlled to reduce its picture frame rate and image resolution in order to save energy. As another example, one or more cameras may be used instead of RADAR sensors or LIDAR sensors (for example, in case a vehicle is driving at low speed and/or under good viewing conditions). As a further example, a number of used (e.g., active) sensor systems (e.g., sensor devices) may be reduced. By way of example, two LIDAR systems (e.g., front and back) may be used instead of four LIDAR systems (e.g., corner and side).

In various embodiments, data compression may be implemented (e.g., data compression may be applied to compress sensor data provided by the one or more sensors). The selection of the configuration of the one or more sensor systems may be performed in accordance with available data compression mechanisms (illustratively, different sensor scenarios may allow for different data compression mechanisms or different extent of data compression, thus resulting in different power load).

Signal and data processing procedures may include an extended series of individual process steps in order to come from a raw data signal to useful and usable information (e.g., to object classification and identification). Illustratively, starting from the signal acquisition itself, basic signal processing may be performed (e.g., current-to-voltage conversion, signal amplification, analog-to-digital conversion, signal filtering, signal averaging, histogram allocation, and the like). Subsequently, basic signal analysis processes may include or employ techniques for baseline subtraction, noise reduction, peak and amplitude detection, various calculations (e.g. time-of-flight (TOF) calculation), and the like. The obtained (e.g., processed) date may be further processed using techniques for data transformation (e.g., with respect to data format, data resolution and angle of view, as an example), data encoding, basic or advanced object classification (e.g., assignment of bounding boxes or object heading), object recognition, and the like.

During the data processing steps, data compression may be employed or implemented to reduce the effort in the upcoming (in other words, downstream) process steps, e.g. with respect to power consumption and/or need for data storage memory. The relevance of the effects of the data compression may be dependent on when (e.g., at which processing step) the data compression is implemented. As an example, the reduction in power consumption and/or in memory requirements may be higher the earlier data compression is employed in the above described data processing procedure. However, in case of lossy data compression techniques, the earlier the data compression is executed, the greater possible performance losses may occur. Thus, not only the extent of data compression (lossless versus lossy compression) may be taken into account for the above-mentioned prioritization and optimization decisions, but also the timing within the signal and data processing procedure.

Various vehicle conditions (e.g., different driving and/or traffic scenarios) may allow for special configurations of the sensor systems with less power consumption of a standard (e.g., default) configuration or setting. Driving and/or traffic scenarios may include or may describe, for example, traffic conditions, weather, type of the vehicle, occupancy of the vehicle, and the like. A special configuration may include or may refer to Sensor Adjustment Settings (SAS), e.g. a change in the operation of one or more sensor systems or one or more sensors. Additionally or alternatively, a special configuration may include or may refer to a (e.g., changed) Sensor Combination (SC), e.g. on the activation or deactivation of one or more of the sensors or sensor systems.

By way of example, in case of high traffic density or in case of platooning-like driving situations, in which one vehicle follows one or more other vehicles at an essentially constant distance (at least for part of the intended route), the field of view and/or the detection range of a LIDAR system may be reduced, e.g. using reduced laser power (this may be an example of Sensor Adjustment Settings). As another example, a vehicle may not need to employ all of the LIDAR systems (e.g., all of the LIDAR sensing devices), but for example the ones in the rear of a vehicle may be switched off, or those employed as corner or side LIDAR systems may be switched off (this may be an example of Sensor Combination). As a further example, during rain and snow precipitation, a LIDAR system may be shut off or put on stand-by for some time interval since it may be less reliable under such conditions, and other sensor types (e.g., RADAR) may provide more reliable data (this may be a further example of Sensor Combination). In case of driving on a highway at night, a camera (for example, operating in the visible wavelength range or in the infra-red wavelength range) may be mostly needed for detection of vehicle headlights and taillights, and for detection of traffic lights. The camera (or a sensor array including camera pixel) may also include a filter (e.g., an optical bandpass filter and/or a polarization filter) configured to select a wavelength (e.g., a color) of light transmitted to the camera, for example the filter may be configured to transmit light having a color relevant for driving (e.g., red, yellow/orange, and the like). However, in case a road is empty, the camera frame rate may be reduced or the camera may be switched off, at least temporarily, e.g. for some time interval (this may be a further example of Sensor Adjustment Settings). A combination of, for example, one RADAR system, one LIDAR system, and one camera may be sufficient for safe travelling under certain conditions, e.g. the platooning situation, thus saving power consumption (this may be a further example of Sensor Combination).

In various embodiments configuration selection data may be provided. The configuration selection data may be stored (e.g., included) in a Sensor Function Matrix (SFM). The configuration selection data may describe or represent an association (in other words, a relationship) between a configuration of the one or more sensor systems and a respective vehicle condition. Illustratively, the configuration selection data may describe or may include an optimized configuration for the one or more sensor systems associated with a respective vehicle condition (e.g., the allowable configuration is providing the lowest power consumption for each vehicle condition). By way of example, the Sensor Function Matrix may include Sensor Adjustment Settings and Sensor Combinations (and/or the individual and combined power consumptions associated thereto) stored as a function of a vehicle driving scenario and overall traffic conditions (e.g., traffic density, types of vehicles driving, weather and temperature, day or night, off-road, driving on a mapped or unmapped area, GPS data available, and the like).

Illustratively, the Sensor Function Matrix may be seen as a database including a plurality of combined datasets (e.g., a plurality of possible configurations for the sensor systems associated with a respective vehicle condition). The combined datasets may be referred to as driving sensor scenario (DSS). The Sensor Function Matrix may include a broad variety of such Driving Sensor Scenarios. The datasets may be obtained, for example, from sensor data (e.g., real driving and sensing data) stored as a function of the vehicle condition in which the sensor data were generated. Additionally or alternatively, the datasets may be obtained by means of simulations based on sensor use models. Both approaches for obtaining the datasets may include or may be assisted by artificial intelligence techniques (e.g., neural networks). The generation of the datasets may include combining data from a plurality of vehicles (e.g., data obtained from a multitude of vehicles under various driving and traffic conditions, vehicle loads, vehicle target data, battery status, etc.).

The vehicle may include one or more processors (e.g., a computing device, also referred to as compute device or configuration system). The one or more processors may be configured to access the Sensor Function Matrix (SFM) database containing the Driving Sensor Scenarios. The one or more processors may be configured to receive information on a state of the energy source (e.g., the one or more processors may be configured to access battery status data via a battery management system).

The one or more processors may be configured to receive sensor data (e.g., to receive one or more inputs from the currently used sensor systems). The computing device may be configured to define (e.g., to calculate) an actual (in other words, current) vehicle condition based on the received sensor data (e.g., to determine a current Driving Scenario and overall Traffic Condition). Illustratively, the computing device may be configured to determine the association between the current configuration of the one or more sensor systems and the current vehicle condition (e.g., the computing device may be configured to determine the current Driving Sensor Scenario).

The one or more processors may be configured to select a configuration for the one or more sensor systems. Illustratively, the configuration may be selected to reduce a (e.g., individual and/or combined) power consumption of the one or more sensor systems. one or more processors may be configured to select the configuration based on the accessed, received, and/or determined information and data. By way of example, the one or more processors may be configured to select the configuration based on the state of the energy source. Additionally or alternatively, the one or more processors may be configured to select the configuration based on the (e.g., actual) vehicle condition. The one or more processors may be configured to select a configuration that fulfills one or more predefined conditions or criteria (e.g., driving and ethical settings, such as safety requirements, ethical requirements, driving regulations, and the like). Illustratively, the one or more processors may be configured to select the configuration with the lower power consumption that still fulfills the one or more predefined criteria (e.g., predefined settings).

By way of example, the one or more processors may be configured to select a Driving Sensor Scenario that has a lower power consumption than the current one and is still acceptable for the current vehicle condition (e.g., for the current driving conditions as per predefined settings or ongoing software calculations). The one or more processors may be configured to retrieve available or continuously calculated or adjusted basic ethical settings (e.g., driving safety, driving behavior, national regulations, and the like). The selection of the Driving Sensor Scenario may be based on battery status, the actual Driving Sensor Scenario, the current vehicle Driving Scenario, and/or the overall Traffic Conditions.

Illustratively, the one or more processors may be configured to perform the selection of the Driving Sensor Scenario with a lower power consumption, in case in a given situation this aspect has been assigned a high priority level. The Driving Sensor Scenario may still be allowable under the predefined conditions (e.g., under driving and ethical settings). The one or more processors may be configured to repeat the process (e.g., at periodic time intervals, e.g. adjustable depending on the vehicle condition). This way a configuration with even lower power consumption may be determined and selected. In case the one or more processors may not determine or find a (e.g., allowable) Driving Sensor Scenario with lower power consumption, the configuration of the one or more sensor systems may remain unchanged.

In various embodiments, the one or more processors may be configured to determine a power consumption associated with sensor data processing in a configuration of the one or more sensor systems. As an example, the one or more processors may be configured to determine a power consumption associated with the sensor data management system and with the subsequent computing processor calculations, for example including neuronal algorithms.

The one or more processors may be configured to measure the power consumption associated with sensor data processing in the current configuration of the one or more sensor systems (e.g., in association with the current vehicle condition). Illustratively, the one or more processors may be configured to measure the power consumption associated with sensor data processing in the current Driving Sensor Scenario.

The one or more processors may be configured to estimate (or simulate) the power consumption associated with sensor data processing in the selected configuration or in a configuration to be selected of the one or more sensor systems (e.g., in association with a new or estimated vehicle condition). Illustratively, the one or more processors may be configured to measure the power consumption associated with sensor data processing in the selected or to be selected Driving Sensor Scenario.

Thus, the one or more processors may be configured to measure or estimate (or simulate) a power load for a given Driving Sensor Scenario plus subsequent processing power (e.g., computational power). The one or more processors may be configured to select a different configuration (e.g., a different Driving Sensor Scenario), as a function of the measured or estimated processing power. Illustratively, the one or more processors may be configured to find and/or select a configuration providing a lower power load (e.g., in case the computational power exceeds a predefined threshold, such as 10% of the power consumption of the one or more sensor systems, for example 20%). This may provide the effect of reducing a total power load.

In various embodiments, the one or more processors may be configured to receive information and/or data from a system-external (e.g., vehicle-external) device (for example, a traffic control device, a traffic map provider, another vehicle, and the like). The received information may include a suggestion on a configuration to be selected (e.g., it may include a suggestion of best Driving Sensor Scenarios). The one or more processors may thus use externally provided (and certified) instructions (e.g., driving instructions) rather than using the self-generated instructions. This may include the use of intelligent driving methods (e.g., of the intelligent navigation system described, for example, in relation to FIG. 85 to FIG. 88), e.g. information derived from previous vehicle trips along the same roads or areas. Additionally or alternatively, this may include the use of multi-dimensional traffic mapping (e.g., GPS-coded traffic maps, such as traffic density maps and/or traffic density probability maps, and/or traffic event maps), as described in further detail below in relation, for example, to FIG. 127 to FIG. 130.

In various embodiments, the one or more processors may be configured to implement additional measures to reduce the power consumption. The one or more processors may be configured to determine (and output) one or more commands or configurations for other devices or components of the vehicle. Illustratively, the one or more processors may be configured to employ other Vehicle Control Options (VCO). As an example, the one or more processors may be configured to change vehicle driveway, e.g. from highway to motorway, or from off-road to a more urban traffic setting. As another example, the one or more processors may be configured to reduce the vehicle speed (actual or for planned control actions), and/or to reduce the number of lane changes and/or to overtake maneuvers to bypass other vehicles. As another example, the one or more processors may be configured to switch vehicle driving from a higher SAE level to a lower SAE level (e.g., a less automated or less autonomous driving). As another example, the one or more processors may be configured to use vehicle platooning in order to save energy. As another example, the one or more processors may be configured to modify vehicle steering as a function of vehicle load. As another example, the one or more processors may be configured to reduce vehicle speed and minimize acceleration levels. As another example, the one or more processors may be configured to change an artificial intelligence method to another one with a lower energy consumption. As another example, the one or more processors may be configured to change ethical codes or settings (e.g., choosing between very safe, standard, less aggressive, more aggressive).

FIG. 123 shows a vehicle 12300 in a schematic view, in accordance with various embodiments.

The vehicle 12300 may be configured as described, for example, in relation to FIG. 81 to FIG. 84 (e.g., the vehicle 12300 may be or may be configured as the vehicle 8100). The vehicle 12300 may include a vehicle body (e.g., the vehicle body 8102). The vehicle 12300 may be an autonomous or automated vehicle (e.g., the vehicle 12300 may have autonomous driving capabilities). By way of example, the vehicle 12300 may include a driving automation system. The driving automation system may be configured to implement fully or partially autonomous driving of the vehicle 12300. The vehicle 12300 may be an electric vehicle.

The vehicle 12300 may include one or more sensor systems 12302. The vehicle 12300 may include a plurality of sensor systems 12302. The one or more sensor systems 12302 may be configured to generate sensor data. The one or more sensor systems 12302 may be configured to sense an environment surrounding the vehicle 12300 (e.g., the sensor data may describe the environment surrounding the vehicle

12300). By way of example, the one or more sensor systems 12302 may include one or more RADAR systems, one or more camera systems (e.g., one or more cameras), one or more LIDAR systems (e.g., the LIDAR Sensing System 10), or one or more ultrasound systems. Each sensor system 12302 may include one or more sensors. As an example, a LIDAR system may include a LIDAR sensor 52.

The sensor data may also include or describe sensor system-specific information. By way of example, the sensor data generated by a sensor system 12302 may include or describe a power consumption (and/or an energy consumption) associated with the respective sensor system 12302. As another example, the sensor data may include or describe the status of the one or more sensors of the respective sensor system 12302 (e.g., how many sensors are active, the power consumption associated with each sensor, any malfunctioning of the one or more sensors, etc.). The sensor data may describe an individual power consumption associated with the one or more sensor systems 12302 (e.g., of each sensor system 12302) and/or a total (in other words, combined) power consumption associated with the one or more sensor systems 12302.

The vehicle 12300 may include at least one energy source 12304. The energy source 12304 may be configured (e.g., it may be used) to provide energy (e.g., electrical energy) to the one or more sensor systems 12302. The energy source 12304 may be re-chargeable. The energy source 12304 may be or may include a battery (or a plurality of batteries or battery cells). The energy source 12304 may be configured to provide energy to the vehicle 12300 (e.g., to other components or devices of the vehicle 12300).

The vehicle 12300 may include an energy source management system 12306 (e.g., a battery management system). The energy source management system 12306 may be configured determine (e.g., to sense) a state (in other words, a status) of the energy source 12304. The energy source management system 12306 may be configured determine energy source data describing the state of the energy source 12304. The energy source management system 12306 (or the energy source 12304 itself) may include one or more sensors (e.g., battery sensors) configured to generate one or more signals based on the state of the energy source 12304. As an example, the energy source management system 12306 may include a temperature sensor and/or a charging sensor.

The state of the energy source 12304 may describe one or more properties of the energy source 12304 (e.g., one or more current properties and/or one or more predetermined properties). By way of example, the state of the energy source 12304 may describe a temperature of the energy source 12304. As another example, the state of the energy source 12304 may describe a charging state of the energy source 12304 (e.g., for example expressed as a percentage of an energy storing capacity of the energy source 12304). As another example, the state of the energy source 12304 may describe a remaining capacity of the energy source 12304. As another example, the state of the energy source 12304 may describe a charging history of the energy source 12304 (e.g., how many charge cycles and/or discharge cycles have been performed for the energy source 12304).

The vehicle 12300 may include one or more processors 12308 (also referred to as computing device or configuration system). The one or more processors 12308 may be configured to receive the sensor data generated by the one or more sensor systems 12302. The one or more processors 12308 may be configured to receive the energy source data describing the state of the energy source 12304.

By way of example, the one or more processors 12308 may be communicatively coupled with the one or more sensors 12302 (e.g., the one or more sensors 12302 may be configured to provide the sensor data to the one or more processors 12308). The one or more processors 12308 may be communicatively coupled with the energy source management system 12306 (e.g., the energy source management system 12306 may be configured to provide the energy source data to the one or more processors 12308).

As another example, the vehicle 12300 may include a vehicle control system 12310. The vehicle control system 12310 may provide or may be an interface between the one or more processors 12308 and the one or more sensors 12302 and/or the energy source management system 12306. Illustratively, the vehicle control system 12310 may be configured to receive the sensor data and/or the energy source data, and to provide the received data to the one or more processors 12308.

The vehicle control system 12310 may be configured to provide other (e.g., additional) data to the one or more processors 12308. The to vehicle control system 12310 may be configured to provide vehicle target data to the one or more processors 12308. The vehicle target data may describe predefined or predicted information related to the vehicle 12300. By way of example, the vehicle target data may describe driving instructions, time-to-destination, energy-to-destination, availability of charging stations, or is emergency situations (e.g., along the current route of the vehicle). The vehicle target data may be stored in a memory 12312 of the vehicle 12300 or of the vehicle control system 12310. The vehicle target data may be provided to the vehicle control system 12310 by another device or system of the vehicle 12300 (for example, a driving system or a central control system).

The one or more processors 12308 may be configured to select a configuration for (or of) the one or more sensor systems 12302. Illustratively, the one or more processors 12308 may be configured to determine (e.g., to control) the mode of operation of the one or more sensor systems 12302. The one or more processors 12308 may be configured to control the one or more sensor systems 12302 such that the one or more sensor systems 12302 operate in the selected configuration.

The one or more processors 12308 may be configured to select the configuration for the one or more sensor systems 12302 to reduce a power consumption (e.g., an energy consumption) of the one or more sensor systems 12302. The power consumption may be an individual power consumption or a combined power consumption of the one or more sensor systems 12302. Illustratively the one or more sensor systems 12302 operating in the selected (e.g., new) configuration may have a lower power consumption (individual and/or combined) with respect to the one or more sensor systems 12302 operating in the previous configuration (e.g., a standard or default configuration).

The one or more processors 12308 may be configured to select the configuration based on the state of the energy source 12304 (e.g., based on the temperature of the energy source 12304 and/or based on the remaining capacity of the energy source). As an example, the one or more processors 12308 may be configured to select the (e.g., new) configuration in case the temperature of the energy source 12304 is too high (e.g., above a predetermined threshold). The selected configuration may ensure that the temperature of the energy source 12304 is reduced. As another example, the one or more processors 12308 may be configured to select the configuration in case the remaining capacity of the energy source 12304 may be insufficient to reach a target destination.

The one or more processors 12308 may be configured to select the configuration based on a vehicle condition (e.g., on a condition or a scenario the vehicle 12300 is residing in, e.g. a current or actual condition).

The vehicle condition may include a driving scenario (also referred to as driving status). The driving scenario may describe or represent one or more vehicle-specific conditions (e.g., one or more vehicle-related or vehicle-internal conditions). Illustratively, the driving scenario may describe or represent one or more conditions that may be controllable by the vehicle 12300 or by an occupant of the vehicle 12300. As an example, the driving scenario may describe (e.g., the one or more conditions may include) the speed of the vehicle 12300 (e.g., the speed at which the vehicle 12300 is currently traveling). As another example, the driving scenario may describe the occupancy of the vehicle 12300 (e.g., how many occupants are currently in the vehicle 12300). As a further example, the driving scenario may describe the driving mode or driving settings of the vehicle 12300 (e.g., a platooning mode).

The vehicle condition may include a traffic condition (e.g., an overall traffic condition, also referred to as environmental settings). The traffic condition may describe or represent one or more vehicle-external conditions (e.g., one or more conditions related to the environment surrounding the vehicle 12300). Illustratively, the traffic condition may describe one or more conditions that are not controllable (or not directly under control) by the vehicle 12300 or by an occupant of the vehicle 12300. As an example, the traffic condition may describe (e.g., the one or more conditions may include) a traffic density and/or an obstacle density (e.g., a number of vehicle-external objects located in a field of view of at least one of the one or more sensor systems 12302). As another example, the traffic condition may describe a behavior of other vehicles (e.g., the speed of other vehicles and/or the distance between the vehicle 12300 and one or more other vehicles). The traffic condition may describe, for example, a distance between the vehicle 12300 and a vehicle-external object located in a field of view of at least one of the one or more sensor systems 12302. As a further example, the traffic condition may describe an atmospheric condition (e.g., the current weather). As a further example, the traffic condition may describe a lighting condition (e.g., daylight conditions or night conditions).

The one or more processors 12308 may be configured to select the configuration for the one or more sensor systems 12302 in case the driving scenario and the traffic condition indicate that reduced sensing capabilities may be sufficient in the current vehicle condition (e.g., in case the vehicle is traveling at low speed, or in a dense traffic situation, or in good visibility conditions, etc.).

The configuration may include a Sensor Combination. The Sensor Combination may describe (e.g., the configuration may include) which sensor systems 12302 should remain active (e.g., which sensor systems 12302 may be sufficient in the current vehicle condition). The Sensor Combination may describe a number of sensor systems 12302 to be deactivated (e.g., to be turned off). Illustratively, the Sensor Combination may describe a first number of sensor systems 12302 to remain active (e.g., to continue generating sensor data). The Sensor Combination may describe a second number of sensor systems 12302 to become inactive (e.g., to stop generating sensor data).

The Sensor Combination may describe a number of sensor systems 12302 to be deprioritized (e.g., the priority associated with such sensor systems 12302 may be reduced with respect to other sensor systems 12302). Illustratively, the Sensor Combination may describe a first number of sensor systems 12302 to be deprioritized. The Sensor Combination may describe a second number of sensor systems 12302 to be prioritized. The change in prioritization may provide the effect of a reduced power consumption (e.g., related to a consumption of computing power associated with data processing). For example, in rain and low speed at night, a radar could have the highest priority, while during the day in good weather and at medium speed, the camera sensor data could have higher priority. The properties (e.g., resolution, frame rate, and/or emitted power) of a deprioritized sensor system may be more strongly reduced with respect to the properties of a prioritized sensor system.

The configuration may include Sensor Adjustment Settings. The Sensor Adjustment Settings may describe (e.g., the configuration may include) one or more (e.g., reduced) sensor settings for the one or more sensor systems 12302 (e.g., for a sensor system 12302, or for more than one sensor system 12302, or for all sensor systems 12302). As an example, the sensor settings may include a (e.g., reduced) data acquisition rate of the one or more sensor systems 12302 (e.g., a reduced data acquisition rate with respect to the current data acquisition rate). As another example, the sensor settings may include a (e.g., reduced) resolution of the one or more sensor systems 12302. As a further example, the sensor settings may include a (e.g., reduced) light emission power of the one or more sensor systems 12302.

The one or more processors 12308 may be configured to determine the vehicle condition based, at least in part, on the (e.g., generated) sensor data. The one or more processors 12308 may be configured to determine the driving scenario and/or the traffic condition based, at least in part, on the sensor data. As an example, the one or more processors 12308 may be configured to determine a traffic density based on the sensor data from a LIDAR system and/or from a camera system. As another example, the one or more processors 12308 may be configured to determine a behavior of other vehicles from time-of-flight measurements of a LIDAR system. As a further example, the one or more processors 12308 may be configured to determine a speed of the vehicle 12300 from RADAR and/or LIDAR measurements. Additionally or alternatively, the one or more processors 12308 may be configured to determine the vehicle condition based on additional information or data (e.g., based on the vehicle target data or on other data provided by other systems or devices of the vehicle 12300).

The one or more processors 12308 may be communicatively coupled with a Sensor Function Matrix database 12314. The Sensor Function Matrix database 12314 may be stored, for example, in a memory of the vehicle 12300 or of the one or more processors 12308. The Sensor Function Matrix database 12314 may store (e.g., include) a plurality of configurations for the one or more sensor systems 12302. Each configuration may be associated with a respective vehicle condition (e.g., each configuration may be stored as a function of a vehicle condition associated thereto). Illustratively, the Sensor Function Matrix database 12314 may include a plurality of datasets (e.g., of configuration selection data) describing a relationship between a vehicle condition and a configuration of the one or more sensor systems 12302 to be selected for that specific vehicle condition. The associated configuration may be the configuration of the one or more sensor systems 12302 that provides the lowest power consumption for that specific vehicle condition, while still providing satisfactory sensing capabilities.

The one or more processors 12308 may be configured to select the configuration for the one or more sensor systems 12302 from the plurality configurations stored in the Sensor Function Matrix database 12314. The selection may be based on the determined vehicle condition. Illustratively, the one or more processors 12308 may be configured to determine the vehicle condition, and then retrieve the associated configuration from the Sensor Function Matrix database 12314.

The one or more processors 12308 may be configured to implement data compression (e.g., a data compression mechanism or algorithm) to the sensor data. Data compression may further reduce the power consumption of the one or more sensor systems 12302 (e.g., the associated computational power). The configuration may include a data compression mechanism to compress the sensor data generated by the one or more sensor systems 12302 (illustratively, for the one or more sensor systems 12302 active in the selected configuration).

The one or more processors 12308 may be configured to determine (e.g., to measure or to predict) a computational energy consumption (e.g., a computational power consumption) associated with the generation of the sensor data in the selected configuration. The one or more processors 12308 may be configured to select a different configuration in case the determined computational energy consumption exceeds a predefined threshold.

Illustratively, the one or more processors 12308 may be configured to determine whether the power load provided by the one or more (e.g., active) sensor systems 12302 and the associated computations may be reduced (for example, in a different configuration in which other sensor systems 12302 are active and thus with different associated computations).

The one or more processors 12308 may be configured to determine whether the selected configuration fulfills one or more predefined criteria. The one or more predefined criteria may include or may describe driving and/or ethical settings (e.g., related to driving regulations, safety regulations, and the like). Illustratively, the one or more processors 12308 may be configured to determine whether the selected configuration is allowable according to driving and/or ethical standards (e.g., whether the sensing capabilities provided in the selected configuration ensure compliance with said standards). The one or more processors 12308 may be configured to select a different configuration in case the selected configuration does not fulfill the one or more predefined criteria. As an example, the one or more processors 12308 may be configured to select a different configuration providing a same or similar (e.g., even higher) power consumption as the (e.g., previously) selected configuration, but that fulfills the one or more predefined criteria. The predefined criteria may be stored in a memory 12316 of the vehicle 12300 or of the vehicle control system 12310. The predefined criteria may be provided to the vehicle control system 12310 by another device or system of the vehicle 12300 (for example, a central control system).

The one or more processors 12308 may be configured to repeat the selection of the configuration at periodic time intervals (e.g., every 30 seconds, every minute, or every ten minutes). By repeating the selection of the configuration, it may be ensured that a configuration with lower power consumption for the actual (e.g., updated) vehicle condition may be provided. The time intervals may be adjusted, for example based on the vehicle condition. As an example, in case of a rapidly changing scenario (e.g., a road with many curves, many other vehicles, etc.), the time intervals may be short (e.g., lower than one minute, or lower than 30 seconds). As another example, in case of a more static scenario (e.g., an empty road, a traffic congestion, etc.) the time intervals may be long (e.g., greater than one minute or greater than five minutes).

The one or more processors 12308 may be configured to control one or more other devices 12318 (e.g., other vehicle equipment). The one or more other devices 12318 may include vehicle auxiliary equipment, a lighting device, a signaling device, a vehicle-to-vehicle communication device, a vehicle-to-environment communication device, heating and air conditioning, and the like. The one or more processors 12308 may be configured to control (e.g., to turn off or to operate with reduced settings) the one or more other devices 12318 to reduce an overall power consumption of the vehicle 12300.

The one or more processors 12308 may be configured to provide driving commands for (and/or to) the vehicle 12300. The one or more processors 12308 may be configured to control (e.g., adjust) vehicle control options. The one or more processors 12308 may be configured to adjust (e.g., reduce) the speed of the vehicle 12300, to control the vehicle 12300 to change lane, to control the driving mode of the vehicle 12300, and the like. Such driving commands may further contribute to reduce an overall power consumption of the vehicle 12300.

The one or more processors 12308 may be configured to receive data from a vehicle-external device 12320 (e.g., a vehicle-external object), for example via a communication interface 12322 of the vehicle 12300 or of the one or more processors 12308. The one or more processors 12308 may be configured to select the configuration based on the received data. The vehicle-external device 12320 may be, for example, a traffic control system or a traffic control station, e.g., providing information on the current traffic situation. The vehicle-external device 12320 may be, for example, another vehicle. The received data may guide the selection of the configuration (e.g., may describe the vehicle condition). Additionally or alternatively, the received data may include the configuration to be selected.

Various embodiments as described with reference to FIG. 123 may be combined with the intelligent navigation embodiments as described with reference to FIG. 85 to FIG. 88.

Various embodiments as described with reference to FIG. 123 may be combined with the intelligent navigation embodiments as described with reference to FIG. 127 to FIG. 130. By way of example, the information provided by the traffic map(s) of the embodiments as described with reference to FIG. 127 to FIG. 130 may be used as input data (input information) in the embodiments as described with reference to FIG. 123.

In the following, various aspects of this disclosure will be illustrated:

Example 1t is a vehicle including one or more sensor systems configured to generate sensor data. The vehicle may include at least one energy source configured to provide energy to the one or more sensor systems. The vehicle may include one or more processors configured to determine a vehicle condition based at least in part on the generated sensor data. The one or more processors may be configured to select a configuration for the one or more sensor systems based on a state of the at least one energy source and based on the vehicle condition.

In Example 2t, the subject-matter of example 1t can optionally include that the one or more processors are communicatively coupled with a Sensor Function Matrix database. The Sensor Function Matrix database may store a plurality of configurations for the one or more sensor systems, each configuration associated with a respective vehicle condition.

In Example 3t, the subject-matter of example 2t can optionally include that the one or more processors are configured to select the configuration for the one or more sensor systems from the plurality of configurations stored in the Sensor Function Matrix database based on the determined vehicle condition.

In Example 4t, the subject-matter of any one of examples it to 3t can optionally include that the configuration for the one or more sensor systems includes a number of sensor systems to be deactivated and/or deprioritized.

In Example 5t, the subject-matter of any one of examples it to 4t can optionally include that the configuration for the one or more sensor systems includes one or more sensor settings for the one or more sensor systems.

In Example 6t, the subject-matter of example 5t can optionally include that the one or more sensor settings include a data acquisition rate of the one or more sensor systems and/or a resolution of the one or more sensor systems.

In Example 7t, the subject-matter of any one of examples it to 6t can optionally include that the configuration includes a data compression mechanism to compress the sensor data generated by the one or more sensor systems.

In Example 8t, the subject-matter of any one of examples it to 7t can optionally include that the one or more processors are configured to determine whether the selected configuration fulfills one or more predefined criteria.

In Example 9t, the subject-matter of example 8t can optionally include that the one or more processors are configured to select a different configuration in case the selected configuration does not fulfill the one or more predefined criteria.

In Example 10t, the subject-matter of any one of examples 8t or 9t can optionally include that the one or more predefined criteria include driving and ethical settings.

In Example 11 t, the subject-matter of any one of examples 1t to 10t can optionally include that the one or more processors configured to determine a computational energy consumption associated with the sensor data generated by the one or more sensor systems in the selected configuration.

In Example 12t, the subject-matter of example 11t can optionally include that the one or more processors are configured to select a different configuration in case the determined computational energy consumption exceeds a predefined threshold.

In Example 13t, the subject-matter of any one of examples 1t to 12t can optionally include that the one or more processors are configured to select the configuration based on data received from a vehicle-external device.

In Example 14t, the subject-matter of any one of examples 1t to 13t can optionally include that the sensor data include an energy consumption of the one or more sensor systems.

In Example 15t, the subject-matter of any one of examples 1t to 14t can optionally include that the one or more processors are configured to repeat the selection of the configuration for the one or more sensor systems at periodic time intervals.

In Example 16t, the subject-matter of any one of examples 1t to 15t can optionally include that the state of the at least one energy source describes at least one of a temperature, a remaining capacity, and a charging history of the at least one energy source.

In Example 17t, the subject-matter of any one of examples 1t to 16t can optionally include that the at least one energy source includes a battery.

In Example 18t, the subject-matter of any one of examples 1t to 17t can optionally include that the vehicle further includes an energy source management system configured to determine energy source data describing the state of the at least one energy source and to provide the determined energy source data to the one or more processors.

In Example 19t, the subject-matter of any one of examples 1t to 18t can optionally include that the one or more sensor systems include at least one LIDAR Sensor System.

In Example 20t, the subject-matter of any one of examples 1t to 19t can optionally include that the vehicle condition includes a driving scenario, the driving scenario describing one or more vehicle-specific conditions.

In Example 21t, the subject-matter of example 20t can optionally include that the one or more vehicle-specific conditions include at least one of a speed of the vehicle, an occupancy of the vehicle, and a driving mode of the vehicle.

In Example 22t, the subject-matter of any one of examples 1t to 21t can optionally include that the vehicle condition includes a traffic condition, the traffic condition describing one or more vehicle-external conditions.

In Example 23t, the subject-matter of example 22t can optionally include that the one or more vehicle-external conditions include a distance between the vehicle and a vehicle-external object located in a field of view of at least one of the one or more sensor systems, and/or a number of vehicle-external objects located in a field of view of at least one of the one or more sensor systems, and/or an atmospheric condition.

Example 24t is a method for operating a vehicle. The method may include one or more sensor systems generating sensor data. The method may include at least one energy source providing energy to the one or more sensor systems. The method may include determining a vehicle condition based at least in part on the sensor data. The method may include selecting a configuration for the one or more sensor systems based on a state of the at least one energy source and based on the vehicle condition.

In Example 25t, the subject-matter of example 24t can optionally include that the configuration is selected from a Sensor Function Matrix database, the Sensor Function Matrix database including a plurality of configurations for the one or more sensor systems, each configuration associated with a respective vehicle condition.

In Example 26t, the subject-matter of example 25t can optionally include that the configuration for the one or more sensor systems is selected from the plurality of configurations included in the Sensor Function Matrix database based on the determined vehicle condition.

In Example 27t, the subject-matter of any one of examples 24t to 26t can optionally include that the configuration for the one or more sensor systems includes a number of sensor systems to be deactivated and/or deprioritized.

In Example 28t, the subject-matter of any one of examples 24t to 27t can optionally include that the configuration for the one or more sensor systems includes one or more sensor settings for the one or more sensor systems.

In Example 29t, the subject-matter of example 28t can optionally include that the one or more sensor settings include a data acquisition rate of the one or more sensor systems and/or a resolution of the one or more sensor systems.

In Example 30t, the subject-matter of any one of examples 24t to 29t can optionally include that the configuration includes a data compression mechanism to compress the sensor data generated by the one or more sensor systems.

In Example 31t, the subject-matter of any one of examples 24t to 30t can optionally include determining whether the selected configuration fulfills one or more predefined criteria.

In Example 32t, the subject-matter of example 31t can optionally include selecting a different configuration in case the selected configuration does not fulfill the one or more predefined criteria.

In Example 33t, the subject-matter of any one of examples 31t or 32t can optionally include that the one or more predefined criteria include driving and ethical settings.

In Example 34t, the subject-matter of any one of examples 24t to 33t can optionally determining a computational energy consumption associated with the sensor data generated by the one or more sensor systems in the selected configuration.

In Example 35t, the subject-matter of example 34t can optionally include selecting a different configuration in case the determined computational energy consumption exceeds a predefined threshold.

In Example 36t, the subject-matter of any one of examples 24t to 35t can optionally include that the configuration is selected based on data received from a vehicle-external device.

In Example 37t, the subject-matter of any one of examples 24t to 36t can optionally include that the sensor data include an energy consumption of the one or more sensor systems.

In Example 38t, the subject-matter of any one of examples 24t to 37t can optionally include that selecting of the configuration for the one or more sensor systems is repeated at periodic time intervals.

In Example 39t, the subject-matter of any one of examples 24t to 38t can optionally include that the state of the at least one energy source describes at least one of a temperature, a remaining capacity, and a charging history of the at least one energy source.

In Example 40t, the subject-matter of any one of examples 24t to 39t can optionally include that the at least one energy source includes a battery.

In Example 41t, the subject-matter of any one of examples 24t to 40t can optionally include determining energy source data describing the state of the at least one energy source and providing the determined energy source data to at least one or more processors.

In Example 42t, the subject-matter of any one of examples 24t to 41t can optionally include that the one or more sensor systems include at least one LIDAR Sensor System.

In Example 43t, the subject-matter of any one of examples 24t to 42t can optionally include that the vehicle condition includes a driving scenario, the driving scenario describing one or more vehicle specific conditions.

In Example 44t, the subject-matter of example 43t can optionally include that the one or more vehicle specific conditions include at least one of a speed of the vehicle, an occupancy of the vehicle, and a driving mode of the vehicle.

In Example 45t, the subject-matter of any one of examples 24t to 44t can optionally include that the vehicle condition includes a traffic condition, the traffic condition describing one or more vehicle external conditions.

In Example 46t, the subject-matter of example 45t can optionally include that the one or more vehicle external conditions include a distance between the vehicle and a vehicle external object located in a field of view of at least one of the one or more sensor systems, and/or a number of vehicle external objects located in a field of view of at least one of the one or more sensor systems, and/or an atmospheric condition.

Example 47t is a computer program product including a plurality of program instructions that may be embodied in non-transitory computer readable medium, which when executed by a computer program device of a vehicle according to any one of examples 1t to 23t, cause the vehicle to execute the method according to any one of examples 24t to 46t.

Example 48t is a data storage device with a computer program that may be embodied in non-transitory computer readable medium, adapted to execute at least one of a method for a vehicle according to any one of the above method claims, a vehicle according to any one of the above vehicle claims.

A partially or fully automated vehicle may employ a multitude of sensors and sensor systems (also referred to as sensor devices) to provide a proper and reliable scene understanding. Each sensor system may produce a large amount of data that may then be further processed (e.g., stored, transmitted, and analyzed). In addition, a partially or fully automated vehicle may be equipped with headlamps (also referred to as headlights) and other illumination and signaling means. The sensor systems and the illumination devices may require space and electrical power.

A suitable vehicle location may be provided for mounting each sensor system. In the selected vehicle location, the sensor system may have an unrestricted field of view and may be mounted in a safe way. Illustratively, the vehicle location for mounting a sensor system may be an environment where the sensor system may be protected from external factors such as humidity, dust, and dirt. The corner locations of a vehicle may be an example of such vehicle location for mounting a sensor system. A corner location may provide a broad overview both in front (or rear) facing directions and side facing directions.

The corner locations of a vehicle may however be already occupied by a headlamp or another luminaire (e.g., a rear light, a break light, a turn indicator, and the like). A sensor system, or at least a portion of a sensor system may be integrated into the headlamp (or in the luminaire). This may provide an unrestricted field of view and protection against environmental factors, as mentioned above. However, there may be a limited amount of space available in a vehicle corner-side (e.g., inside a typical headlamp). This may pose dimensional constraints on the maximum allowable size of a sensor system integrated in a headlamp.

The miniaturization of a sensor system (e.g., of a LIDAR system) may have a negative impact on the sensor performance, for example a reduced maximum ranging distance due to a decreased collection efficiency of the associated receiver optics. The decreased collection efficiency may also reduce the signal-to-noise ratio of the measurements.

In a conventional system, a headlamp and a sensor system (e.g., integrated in the headlamp) may be operated independently of one another. The headlamp and the sensor system may require the same amount of space and may consume the same amount of energy. This may be true, independently on whether the sensor system is operated as a stand-alone sensor system or as part of a superordinate system. The total space occupied by such conventional system may thus be the sum of the space occupied by the individual devices (illustratively, the headlamp and the sensor system). The power consumption of such conventional system may be the sum of the power consumptions of each of the individual devices. The sensor system and the headlamp may require substantial amounts of electrical power, and thus may generate heat losses. Such heat losses may pose additional constraints on the dimensions of the sensor system.

A (e.g., static) trade-off may be provided between a reduced sensor size and a reduced size of the illumination device (e.g., the size of the light source emitting visual light, for example for low beam and high beam applications), in case of a headlamp-integrated sensor system. At the sensor side, for example, a number of laser diodes (e.g., infra-red laser diodes) may be reduced, a number of detector pixels and/or a lateral size of the detector pixels may be reduced, the size of emitter and/or receiver optics may be reduced, and/or the size of electronic components (e.g., electronic boards) and/or the size of cooling elements may be reduced. At the headlamp side, for example, the number of light sources (e.g., a number of light emitting diodes, LEDs) may be reduced, a size of associated projection optics may be reduced, and/or the size of electronic components (e.g., electronic boards) and/or the size of cooling elements may be reduced.

However, each of the above mentioned options may have a negative impact on the performance of the sensor system or the headlamp (e.g., a negative impact on the respective functionalities). In addition, the selected trade-off may provide sufficient performance only in some specific traffic or driving situations. In other situations, the headlamp performance and/or the sensor performance may be unsatisfying.

Various embodiments may be related to an illumination and sensing system providing a dynamically adapted trade-off between the performance of a sensor system (e.g., a LIDAR system) and a lighting device (e.g., an illumination device, for example a headlamp light source) included in the illumination and sensing system (e.g., integrated in the illumination and sensing system).

A coordinated control of the operation of the sensor system and the lighting device may provide maintaining a heat dissipation of the illumination and sensing system below a predefined threshold level. This may offer the effect that the system may be provided essentially without a reduction (e.g., a miniaturization) of the size of the sensor system and of the lighting device (e.g., without a reduction of the size of the main components). In an exemplary arrangement, the aspects described herein may be provided for a headlight-integrated sensor system.

In various embodiments, an illumination and sensing system may include a LIDAR Sensor System. The LIDAR Sensor System may include a LIDAR light source. The illumination and sensing system may include a further light source. The illumination and sensing system may include a light emission controller configured to operate the LIDAR light source with a first operation power resulting in a first thermal power and to operate the further light source with a second operation power resulting in a second thermal power. A sum of the first thermal power and the second thermal power may be below a predefined threshold thermal power.

The aspects of coordinated (e.g., synchronized) lighting device and sensor system operation described herein may provide reducing the total amount of required operation power, e.g. the amount of required electrical power (e.g., the amount of supplied and/or consumed electrical power). This may provide reducing the amount of heat losses generated during operation (illustratively, the amount of thermal power, e.g. the amount of dissipated electrical power). The aspects described herein may provide overcoming the above-mentioned rather static trade-off considerations and maintaining the size of the main components of both, sensor system and lighting device, essentially unchanged.

The coordinated operation aspects may provide reducing the total space required by the sensor system and/or the lighting device, as described in further detail below. This may be provided, as an example, via a common cooling element of reduced size. The common cooling element may be shared by the sensor system and the lighting device (e.g., by one or more light sources of the lighting device).

The reduced dimensions of the cooling element may provide realizing a sensor-integrated illumination system (e.g., a sensor-integrated headlamp) with unchanged system dimensions and with basically unchanged dimensions of the main components of both the lighting device (e.g., light source and optics) and sensor device (e.g., light source, such as infra-red light source, detector, and optics arrangements). This may provide that both devices may be able to deliver their full, specified performance.

The coordinated control may be based on a wide variety of adaptations in lighting device and sensor operation, for example in accordance with a current traffic or driving situation. A simultaneous full operation of both devices may cause issues in relation to thermal limitations of the system. However, most traffic and driving situations may be handled without both systems being operated at full power (e.g., without both systems emitting light with full optical power). Illustratively, it may be possible to determine a trade-off between lighting and sensor performance. The provided trade-off may be dynamically adjusted depending on the current traffic and driving situation (illustratively, rather than being a static, once-chosen compromise).

FIG. 173A shows an illumination and sensing system 17300 in a schematic representation in accordance with various embodiments.

The illumination and sensing system 17300 may be a system equipped with sensing capabilities and with illumination capabilities. Illustratively, the illumination and sensing system 17300 may include one or more components configured to detect a scene (or at least a portion of a scene), and one or more components configured to illuminate the scene (or at least a portion of the scene). In the following, the illumination and sensing system 17300 may also be referred to as system 17300. The scene may be, for example, the environment surrounding or in front of a vehicle.

The illumination and sensing system 17300 may be a system for a vehicle. Illustratively, a vehicle may include one or more illumination and sensing systems 17300 described herein, for example arranged in different locations in the vehicle. By way of example, the illumination and sensing system 17300 may be a headlamp, e.g. of a vehicle (for example, arranged at one corner of the vehicle). The vehicle may be a vehicle with partially or fully autonomous driving capabilities (e.g., a vehicle capable of operating at a SAE-level 3 or higher, e.g. as defined by the Society of Automotive Engineers (SAE), for example in SAE J3016-2018: Taxonomy and definitions for terms related to driving automation systems for on-road motor vehicles). Illustratively, the illumination and sensing system 17300 may be a headlamp-integrated sensor system. In case a vehicle includes a plurality of illumination and sensing systems 17300 described herein, the vehicle (e.g., a control module or system of the vehicle) may be configured to provide coordinated control of the plurality of illumination and sensing systems 17300, as described in further detail below.

The system 17300 may include a LIDAR system 17302. The LIDAR system 17302 may be or may be configured as the LIDAR Sensor System 10. By way of example, the LIDAR system 17302 may be configured as a scanning LIDAR system (e.g., as a scanning LIDAR Sensor System 10). As another example, the LIDAR system 17302 may be configured as a Flash LIDAR system 17302 (e.g., as a Flash LIDAR Sensor System 10).

It is understood that the LIDAR system 17302 may be an example of a sensor system included in the illumination and sensing system 17300. The concepts and the aspects described herein may be adapted or applied also to other types of sensors or sensor systems that may be included in the illumination and sensing system 17300 (e.g., a RADAR system, a camera system, or an ultrasonic sensor system).

The LIDAR system 17302 may include an emitter side (e.g., a First LIDAR Sensor System 40) and a receiver side (e.g., a Second LIDAR Sensor System 50). The emitter side and the receiver side may include a respective optics arrangement, e.g., an emitter optics arrangement 17304 and a receiver optics arrangement 17306, respectively.

The emitter optics arrangement 17304 may include one or more optical components (e.g., one or more lenses) to collimate or focus light emitted by the LIDAR system 17302.

The receiver optics arrangement 17306, shown in FIG. 173B, may include one or more optical components (e.g. a first optical component 17306-1, a second optical component 17306-2, a third optical component 17306-3, and a fourth optical component 17306-4, e.g., one or more lenses) to collimate or focus light received by the LIDAR system 17302. The receiver optics arrangement 17306 may have an entrance aperture in the range from about 3000 $mm^2$ to about 4000 $mm^2$, for example of about 3500 $mm^2$. Only as a numerical example, the receiver optics arrangement 17306 may include a front lens (e.g., facing the field of view of the LIDAR system 17302) with size of about 50 mm×70 mm. Only as a numerical example, the receiver optics arrangement 17306 may be 60 mm long. By way of example, the receiver optics arrangement 17306 may be or may be configured as the optical system 3400 described in relation to FIG. 33 to FIG. 37F.

The LIDAR system 17302 may include a light source 42 (illustratively, at the emitter side), also referred to as LIDAR light source 42. The light source 42 may be configured to emit light, e.g. a light signal (e.g., towards the scene, illustratively towards a field of view of the LIDAR system 17302). The light source 42 may be configured to emit light having a predefined wavelength, for example to emit light in the infra-red range (for example in the range from about 700 nm to about 2000 nm, for example in the range from about 860 nm to about 1600 nm, for example at about 905 nm or at about 1550 nm). Illustratively, the light source 42 may be an infra-red light source 42. The light source 42 may be configured or controlled to emit light in a continuous manner or it may be configured to emit light in a pulsed manner (e.g., to emit one or more light pulses).

In various embodiments, the light source 42 may be configured to emit laser light (e.g., infra-red laser light). The light source 42 may include one or more laser light sources (e.g., configured as the laser source 5902 described, for example, in relation to FIG. 59). By way of example, the one or more laser light sources may include at least one laser diode, e.g. one or more laser diodes (e.g., one or more edge emitting laser diodes and/or one or more vertical cavity surface emitting laser diodes, VCSEL). As an example, the light source 42 may be or include an array of laser diodes (e.g., a one-dimensional array or a two-dimensional array), e.g. a VCSEL array.

In various embodiments, the LIDAR system 17302 may include a sensor 52 (illustratively, at the receiver side). The sensor 52 may include one or more photo diodes (e.g., one or more sensor pixels each associated with a respective photo diode). The one or more photo diodes may form an array. As an example, the one or more photo diodes may be arranged along one dimension to form a one-dimensional array. As another example, the one or more photo diodes may be arranged along two dimensions (e.g., perpendicular to one another) to form a two-dimensional array. By way of example, at least one photo diode may be based on avalanche amplification. At least one photo diode (e.g., at least some photo diodes or all photo diodes) may be an avalanche photo diode. The avalanche photo diode may be a single photon avalanche photo diode. As another example, at least one photo diode may be a pin photo diode. As another example, at least one photo diode may be a pn-photo diode.

The illumination and sensing system 17300 may include a further light source 17308. Illustratively, the further light source 17308 may be a lighting device or part of a lighting device (e.g., an illumination device or part of an illumination device). The further light source 17308 may be configured to emit light (e.g., towards the scene). The further light source 17308 may be configured to emit light having a predefined wavelength range for example in the visible wavelength range. As another example, the further light source 17308 may be configured to emit light in the infra-red wavelength range. By way of example, the further light source 17308 may be a headlamp light source (e.g., a light source for a headlamp, for example a headlamp of a vehicle).

In various embodiments, the illumination and sensing system 17300 may include a plurality of further light sources 17308 (e.g., the further to light source 17308 may include one or more further light sources, e.g. a plurality of light sources). The plurality of further light sources may be configured to emit light at different wavelengths or in different wavelength ranges. By way of example, the illumination and sensing system 17300 (e.g., the further light source 17308) may include a first further light source configured to emit is visible light and a second further light source configured to emit infra-red light. Alternatively, the illumination and sensing system 17300 (e.g., the further light source 17308) may include a first further light source configured to emit visible light in a first wavelength range (e.g., red light) and a second further light source configured to emit visible light in a second wavelength range (e.g., orange or yellow light).

In various embodiments, the further light source 17308 (e.g., each further light source) may include at least one light emitting diode (LED). By way of example, the further light source 17308 may include a plurality of light emitting diodes. The plurality of light emitting diodes may be arranged to form an array (e.g., a one-dimensional array or a two-dimensional array). Alternatively, the plurality of light emitting diodes may be arranged to form a ring or a portion of a ring (e.g., the plurality of light emitting diodes may be arranged around a circumference).

In various embodiments, the further light source 17308 (e.g., each further light source) may be configured or controlled to emit light in accordance with different light emission schemes (e.g., in accordance with different light emission functionalities, illustratively to emit a predefined light emission pattern). By way of examples, the plurality of light emitting diodes may be controlled to emit light in accordance with different light emission functionalities (e.g., one or more light emitting diodes may be controlled to emit light and one or more light emitting diodes may be controlled not to emit light to provide a predefined light emission pattern).

The further light source 17308 may be configured (e.g., controlled) to provide low beam functionalities (also referred to as dipped beam to functionalities). Illustratively, the further light source 17308 may be configured to emit a low beam, e.g. to emit light in a lateral and/or downward fashion, for example in accordance with regulations regarding a light-dark cutoff (e.g., in the scene, for example with respect to a driving direction of the vehicle).

Additionally or alternatively, the further light source 17308 is may be configured (e.g., controlled) to provide high beam functionalities. Illustratively, the further light source 17308 may be configured to emit a high beam, e.g. to emit light also above the light-dark cutoff.

Additionally or alternatively, the further light source 17308 may be configured (e.g., controlled) to provide adaptive driving beam functionalities (also referred to as adaptive beam functionalities). Illustratively, the further light source 17308 may be configured to emit an adaptive beam, e.g. the further light source 17308 may be configured or controlled to illuminate different portions of the scene depending on a current situation (e.g., on a current traffic and/or driving scenario).

In various embodiments, the illumination and sensing system 17300 may include a light emission controller 17310 (e.g., one or more processors configured to implement light emission control). The light emission controller 17310 may be configured to control the light source 42 and the further light source 17308. As an example, the light emission controller 17310 may be in communication with a light controller of the LIDAR system 17302 (e.g., a driver circuit included in the LIDAR system 17302). The light emission controller 17310 may be configured to control the light source 42 by providing corresponding instructions to the light controller of the LIDAR system 17302. Optionally, the light emission controller 17310 may be configured to control additional light sources (e.g., an additional LIDAR light source and/or an additional further light source), for example in case the illumination and sensing system 17300 includes additional light sources (e.g., arranged in a left-side headlamp and in a right-side headlamp of a vehicle, as described in further to detail below).

The light emission controller 17310 may be configured to operate the light source 42 with a first operation power resulting in a first thermal power. Illustratively, the light emission controller 17310 may be configured to control the light source 42 in such a way that an operation of the light is source 42 results in a first thermal power (also referred to as first heat dissipation power). The light emission controller 17310 may be configured to operate the further light source 17308 with a second operation power resulting in a second thermal power. Illustratively, the light emission controller 17310 may be configured to control the further light source 17308 in such a way that an operation of the further light source 17308 results in a second thermal power (also referred to as second heat dissipation power).

The sum of the first thermal power and the second thermal power may be below a predefined threshold thermal power. Illustratively, a total or combined thermal power may be below the predefined threshold thermal power (e.g., a combined dissipated power may be below the predefined threshold thermal power). Additionally or alternatively, the sum of the first power consumption (associated with the light source 42) and of the second power consumption (associated with the further light source 17308) may be below a predefined threshold power consumption.

The light emission controller 17310 may be configured to operate the light source 42 and the further light source 17308 such that the combined thermal power (or power consumption) of the light source 42 and the further light source 17308 may be kept below a predefined threshold thermal power (or threshold power consumption). Illustratively, the light emission controller 17310 may be configured to assign a first operation power to the operation of the LIDAR system 17302 and a second operation power to the operation of the further light source 17308, such that a resulting combined thermal power (e.g., dissipated power) may be kept below a predefined to threshold thermal power. Further illustratively, the light emission controller 17310 may be configured to provide a first power supply to the light source 42 and a second power supply to the further light source 17308.

In various embodiments, operating the light source 42 with the first operation power may include controlling the light source to emit light is with a first optical power. Operating the further light source 17308 with the second operation power may include controlling the further light source 17308 to emit light with a second optical power.

In various embodiments, a sum of the first optical power and the second optical power may be below a predefined threshold optical power. Illustratively, the light emission controller 17310 may be configured to control the light source 42 and the further light source 17308 such that a combined optical power (e.g., a combined optical power of the emitted light) may be kept below a predefined threshold optical power.

In case the light source 42 is operated with the first operation power (e.g., is operated with a first electrical power, e.g. a received first electrical power), the light source 42 may emit light with a first optical power (e.g., a first optical emission power). Additionally, due to an incomplete conversion of the operation power into optical emission power, part of the supplied operation power may be converted into heat, e.g. into a first thermal power (e.g., a first heat dissipation power). Illustratively, the first operation power may be a sum of the first optical power and the first thermal power. Analogously, in case the further light source 17308 is operated with the second operation power (e.g., is operated with a second electrical power, e.g. a received second electrical power), the further light source 17308 may emit light with a second optical power (e.g., a second optical emission power). Additionally, due to an incomplete conversion of the operation power into optical emission power, part of the supplied operation power may be converted into heat, e.g. into a second thermal power (e.g., a second heat dissipation power). Illustratively, the second operation power may be a sum of the second optical power and the second thermal power.

An operation power associated with the light source 42 (e.g., an operation power selected for operating the light source 42) may result in a corresponding (e.g., first) optical power and in a corresponding (e.g., first) thermal power. An operation power associated with the further light source 17308 (e.g., an operation power selected for operating the further light source 17308) may result in a corresponding (e.g., second) optical power and in a corresponding (e.g., second) thermal power In various embodiments, the predefined threshold thermal power may be a power value lower than a sum of the thermal power that the light source 42 would have (e.g., dissipate) in case of full operation and of the thermal power that the further light source 17308 would have in case of full operation. Illustratively, the predefined threshold thermal power may be a power value lower than a combined thermal power value associated with a full operation of the light source 42 and of the further light source 17308. The predefined threshold thermal power may be a percentage (e.g., a fraction) of such combined power value, for example 75%, for example 50%, for example 25%. By way of example, the predefined threshold thermal power may be in the range from about 30 W to about 100 W, for example in the range from about 40 W to about 60 W, for example about 50 W. The value for the threshold thermal power may be selected in accordance with the heat dissipation capabilities of the system 17300 (e.g., in accordance with the thermal dissipation capabilities of a cooling element 17312 of the system 17300), as described in further detail below.

In various embodiments, the system 17300 may include a cooling element 17312 (e.g., a common or shared cooling element 17312). The cooling element 17312 may be connected to both the further light source 17308 and the LIDAR system 17302. Illustratively, the cooling element 17312 may be configured or arranged to dissipate heat (e.g., thermal power) generated by the further light source 17308 and by the LIDAR system 17302 (e.g., by the light source 42).

By way of example, the cooling element 17312 may have a first side facing the LIDAR system 17302 (e.g., a side in direct physical contact with the LIDAR system 17302, e.g. with a housing of the LIDAR system 17302). Illustratively, there may be a first interface between the cooling element 17312 and the LIDAR system 17302. The cooling element 17312 may have a second side (e.g., opposite to the first side) facing the further light source 17308 (e.g., in direct physical contact with the further light source 17308, e.g. with a housing of the further light source 17308 or with a printed circuit board on which the further light source 17308 is mounted). Illustratively, there may be a second interface between the cooling element 17312 and the further light source 17308. By way of example, the cooling element 17312 may be a heat sink (e.g., with a volume of about 180 $cm^3$, as described in further detail below). As another example, the cooling element 17312 may include one or more channels for transporting a cooling medium (e.g., air or water).

The cooling element 17312 may be configured to dissipate a (e.g., maximum) heat loss substantially equal to the predefined threshold thermal power (e.g., a maximum heat loss in the range from about 30 W to about 100 W, for example in the range from about 40 W to about 60 W, for example a maximum heat loss of about 50 W). As an example, the cooling element 17312 may be selected or configured in accordance with the predefined threshold thermal power (e.g., a threshold thermal power provided for the intended operation of the system 17300). As another example, the predefined threshold thermal power may be selected in accordance with the configuration of the cooling element 17312 (e.g., in accordance with the heat dissipation provided by the cooling element 17312).

As described in further detail below, the coordinated operation of the light source 42 and of the further light source 17308 may offer the effect that a size of the cooling element 17312 (e.g., a volume or at least one lateral dimension of the cooling element 17312) may be reduced (e.g., with respect to a conventional cooling element). Illustratively, the size of the cooling element 17312 may be smaller than a sum of the size of a cooling element that would be provided for operating the LIDAR system 17302 and of the size of a cooling element that would be provided for operating the further light source 17308 (e.g., smaller than a combined size of cooling elements that would be provided for dissipating the respective heat loss in case the LIDAR system and the further light source were operated independently from one another).

FIG. 173C shows a graph 17314 illustrating an exemplary operation of the light emission controller 17310 in accordance with various embodiments.

The graph 17314 may describe the dynamic adaptation by the light emission controller 17310 of the first thermal power and of the second thermal power. Illustratively, the graph 17314 may show the value assigned to the first thermal power and to the second thermal power over time. The first thermal power is represented by a first line 17314-1. The second thermal power is represented by a second line 17314-2. The sum of the first thermal power and the second thermal power is represented by a third (e.g., dotted) line 17314-3. The graph 17314 may include a first axis 17314*t* (e.g., a time axis) associated with the time (expressed in arbitrary units), and a second axis 17314*p* (e.g., a power axis) associated with the thermal power (expressed in W). Illustratively, the power values in a time interval in the graph 17314 may represent the thermal power(s) in that time interval, associated with corresponding operation power(s) and/or optical power(s).

For the operation described in FIG. 173C it is assumed, as an exemplary case, that the predefined threshold thermal power is 50 W. It is also assumed, as an exemplary case, that a thermal power associated with a full operation of the light source 42 may be 15 W (e.g., full LIDAR functionality may correspond to 15 W of power dissipation). It is further assumed, as an exemplary case, that a thermal power associated with a full operation of the further light source 17308 may be 50 W (as an example, 50 W of dissipated power may correspond to a headlamp light source operated for maximum low beam and high beam intensity, 35 W of dissipated power may correspond to providing only low beam functionalities and high beam being switched off). Illustratively, it is assumed, as an example, that in case of separate, non-integrated systems, the lighting functions may generate thermal dissipation losses of 50 W at full performance and the LIDAR system may generate thermal dissipation losses of 15 W at full performance. Without the coordinated operation described above, the system may generate 65 W of heat loss when both functions are operated at the same time at full performance. The coordinated operation may provide reducing such heat loss, for example to 50 W (e.g., providing the implementation of a heatsink with reduced dimension).

As illustrated in the graph 17314, the light emission controller 17310 may be configured to select the first operation power and the second operation power such that the sum of the first thermal power and the second thermal power remains below the predefined threshold thermal power (illustratively, at each time point or substantially each time point, as described in further detail below).

The light emission controller 17310 may be configured to select or to assign different values for the first operation power and the second operation power (e.g., to control the light source 42 to emit light with different first optical power, and to control the further light source 17308 to emit light with different second optical power) at different time points or in different time periods (e.g., over different time windows). Illustratively, the light emission controller 17310 may be configured to dynamically increase (or decrease) the first operation power and to correspondingly decrease (or increase) the second operation power.

In various embodiments, the light emission controller 17310 may be configured to operate (e.g., to control) the light source 42 and the further light source 17308 (illustratively, the respective light emission) in accordance with one or more predefined criteria. The light emission controller 17310 may be configured to operate (e.g., to control) the light source 42 and the further light source 17308 in accordance with one or more system-internal and/or system-external conditions (e.g., vehicle-internal and or vehicle-external conditions). Illustratively, the light emission controller 17310 may be configured to select or assign the first operation power and the second operation power in accordance with one or more situations or scenarios (e.g., traffic or driving situation or scenario). Each situation may be a situation in which the first operation power and the second operation power may have a respective value adapted to the specific scenario (only as an example, sufficient radiation may be provided for an illumination of the scene with visible light and sufficient infra-red radiation may be provided for sensing purposes), while the total thermal power may remain within the maximum limit.

The light emission controller 17310 may be configured to operate (e.g., to control) the light source 42 and the further light source 17308 in accordance with a vehicle condition, as described, for example, in relation to FIG. 123. There may be a variety of factors to be considered when assessing a vehicle condition (e.g., a traffic or driving situation or scenario), such as the ambient light level (day, night), a vehicle environment (city, rural roads, highway), a traffic condition (traffic density, types of traffic participants, other vehicle's velocities and directions of heading), a weather condition, an own vehicle's driving scenario (velocity, acceleration, route planning), own vehicle's level of automated driving (SAE-level), availability of high-quality map-material, vehicle-to-vehicle (V2V) and vehicle-to-everything (V2X) communication, and the like. One or more of such factors may be relevant in a current traffic or driving situation.

By way of example, the light emission controller 17310 may be configured to control the light source 42 and the further light source 17308 in accordance with an ambient light level. The ambient light level may be determined (e.g., measured or calculated), for example, by means of an ambient light sensor of the system 17300. As an example, the first operation power (associated with the LIDAR light source 42) may increase for increasing ambient light level. The second operation power (associated with the further light source 17308) may decrease accordingly. Illustratively, the operation power associated with the illumination of the scene may be reduced for increasing amount of ambient light. In an exemplary scenario, at bright day light, road illumination may be not required or only small amounts of light for Daytime Running Light (DRL) functionalities may be provided. This may be described, for example, by the situation 8 in FIG. 173C, e.g. by the power values in an eighth time window 17316-8. In another exemplary scenario, during night but also in twilight or inclement weather situations (fog, rain, snow), certain amounts of illumination may be provided. The amount of provided illumination may also depend on the current traffic or driving situation, as described in further detail below.

As another example, the light emission controller 17310 may be configured to control the light source 42 and the further light source 17308 in accordance with a SAE-level (e.g., of the vehicle including the system 17300). As an example, the first operation power (associated with the LIDAR light source 42) may increase for increasing SAE-level. Illustratively, a greater amount of power (e.g., operation power and thermal power) may be dedicated to sensing in case a higher level of autonomous driving is selected.

In an exemplary scenario, a vehicle driving in a high SAE-level, for example SAE-level 3 or higher, may dedicate a large amount of power for LIDAR sensing (e.g., scene understanding and vehicle steering), while only a small amount of power may be dedicated for illumination purposes. Illustratively, it may suffice that the vehicle may be safely recognized by other road users, without providing a large field of vision for the driver. As an example, a vehicle driving in SAE-level 4 or 5 may operate the LIDAR to system at full power (e.g., resulting in full dissipated power, e.g. full thermal power, for example 15 W), and may operate the LED for low beam illumination at reduced power (e.g., resulting in reduced dissipated power, e.g. reduced thermal power, for example 35 W). This may be described, for example, by the situation 3 in FIG. 173C, e.g. by the power values in a third time is window 17316-3. Depending on the specific traffic situation (known for example from Traffic Maps or Intelligent Navigation Systems, as described in relation to FIG. 127 to FIG. 130), also lower sensor power settings (e.g., LIDAR-power settings) may be provided.

In a further exemplary scenario, a vehicle driving in a low SAE-level, for example SAE-level 2 or lower, may dedicate a greater amount of power to the illumination (e.g., may consume a greater amount of LED-power) and may dedicate a lower amount of power for sensing purposes. As an example, a vehicle driving in SAE-level 0 at night time and on a rural road may operate the illumination at full power (e.g., resulting in full dissipated power, e.g. full thermal power, for example 50 W) for full low beam and high beam illumination. Such vehicle may be operated by the driver alone and the LIDAR may be turned off. This may be described by the situation 1 in FIG. 173C (e.g., by the power values in a first time window 17316-1). At SAE-Levels 1 or 2, a different balance between illumination-power (e.g., LED-power) and LIDAR-power may be provided (e.g., full low beam functionality and limited high beam and LIDAR functionalities), as described, for example, by the situation 7 in FIG. 173C (e.g., by the power values in a seventh time window 17316-7).

As another example, the light emission controller 17310 may be configured to operate (e.g., to control) the light source 42 and the further light source 17308 in accordance with a traffic scenario and/or a driving scenario. As an example, the first operation power (associated with the LIDAR light source 42) may increase for increasing complexity of a traffic scenario (e.g., more data may be collected, or data may be collected with a higher resolution). Illustratively, a greater amount of power may be dedicated to sensing in case of a complex situation to be analyzed.

In an exemplary scenario, for a vehicle driving in a city there may be different requirements in terms of road illumination than for a vehicle driving on rural roads. Inside cities, the vehicle may avoid using high-beam is functionality (e.g., it may be not allowed to use such functionality). In such case, the illumination-power may be a fraction of the full power, for example resulting in a fraction of the full dissipated power, e.g. 35 W. This may provide operating the LIDAR functionalities over the full range of capabilities, e.g. with full thermal power, e.g. 15 W (e.g., as described by a situation 3 in FIG. 173C). The actual exploitation of such full range may depend on other factors such as on a traffic condition. As an example, in a clear or unambiguous situation and/or in an environment where the field of view for LIDAR sensing may be restricted to specific angular regions, a LIDAR power lower than the full power may be sufficient for a reliable scene understanding (e.g., as described by a situation 2 in FIG. 173C, e.g. by the power values in a second time window 17316-2).

In another exemplary scenario, on rural roads or on a motorway, higher amounts of road illumination may be provided (e.g., full high-beam functionality or partial high-beam functionality), for example in case that the vehicle is driving in a low-SAE level where the driver should recognize objects located at long distances in front of the vehicle. This may also depend on the velocity of the vehicle. At lower velocities, a lower LIDAR power may be provided (e.g., as described by the situation 7 in FIG. 173C). At higher velocities, a higher LIDAR power may be provided (e.g., as described by a situation 5 in FIG. 173C, e.g. by the power values in a fifth time window 17316-5).

In a further exemplary scenario, when driving on rural roads or on a motorway with high SAE-level, more emphasis may be placed on the sensing side. This may be described, for example, by the situation 4 in FIG. 173C (e.g., by the power values in a fourth time window 17316-4). The LIDAR power may be 80% of maximum power (e.g., resulting in a thermal power about 80% of the maximum thermal power) and the power for illumination may correspond to a slightly-dimmed low-beam setting. It is understood that additional factors may play role, such as a traffic environment. As an example, in a clear, unambiguous situation (e.g. straight road, no crossings, or a platooning-like driving situation), only reduced amounts of illumination and/or sensing power may be provided. As another example, in a complex, confusing situation, more power may be used for illumination (e.g., in case of SAE-level 3) and/or for sensing (e.g., in case of SAE-level 5).

It may be possible to briefly overdrive the system 17300, e.g. in complex or confusing situations, leading to a total thermal power exceeding the threshold thermal power (e.g., exceeding the 50 W). This may be described, for example, by the situation 6 in FIG. 173C (e.g., by the power values in a sixth time window 17316-6). A short time overdrive may be tolerable without any damage to the system for a temporal range less than about 20 s or less than about 10 s. Thermal inertia may prevent damages to the system from occurring in case of overdrive in such temporal range. Illustratively, there may be a time delay between a start point of an overdrive and a time point where critical areas in temperature sensitive regions (e.g. a pn-junction in a laser diode) reach a critical temperature increase. An overdrive may also be tolerated for longer temporal ranges, e.g. from about 20 s to about 60 s, since thermally induced damages may be moderate and may lead only to small reductions in overall lifetime. In case the overdrive situation persists for a longer time interval, other factors may be adjusted, for example a SAE-level, a vehicle velocity, and the like. In an exemplary scenario, such short temporal range may correspond to a so-called "vehicle-initiated handover". A vehicle driving at a higher SAE-level (e.g. SAE level 3) may request a human driver to take over control in a confusing situation, and the driver may need a certain amount of time to get familiar with the current traffic.

FIG. 174A shows a first configuration of an illumination and sensing system 17400 in a schematic representation in accordance with various embodiments. FIG. 174B to FIG. 174D show each one or more components of the illumination and sensing system 17400 in a schematic representation in accordance with various embodiments.

The illumination and sensing system 17400 (also referred to as system 17400) may be an exemplary implementation or configuration of the illumination and sensing system 17300 described in relation to FIG. 173A to FIG. 173C. The representation in FIG. 174A may show the illumination and sensing system 17400 as seen from the front. It is understood that the configuration of the first illumination and sensing system 17400 described herein is chosen only as an example, and other configurations (e.g., other arrangements of the components) may be provided.

The system 17400 may include a LIDAR system 17402. The LIDAR system 17402 may include an emitter side (e.g., including an emitter optics arrangement 17404) and a receiver side (e.g., including a receiver optics arrangement 17406), described in further detail below. As an example, shown in FIG. 174A, the emitter optics arrangement 17404 and the receiver optics arrangement 17406 may be arranged one next to the other. The system 17400 may include a lighting device 17408 (e.g., a further light source), for example a LED lighting device. The system 17400 may include a heatsink 17410 (illustrated in FIG. 174B). The heatsink 17410 may be connected to the LIDAR system 17402 and to the lighting device 17408. In the exemplary configuration in FIG. 174A, there may be an interface (e.g., a mechanical interface) between the LIDAR system 17402 and the heatsink 17410 at the bottom of the LIDAR system 17402, and there may be an interface between the lighting device 17408 and the heatsink 17410 at the top of the lighting device 17408. Only as a numerical example, the LIDAR system 17302 (e.g., a housing of the LIDAR system 17302) may have a width of about 80 mm, a length (e.g., a depth) of about 70 mm, and a height of about 60 mm.

By way of example, the heatsink 17410 may be configured to dissipate a maximum heat loss of about 65 W. Illustratively, the LIDAR system 17402 (e.g., a light source 42 of the LIDAR system 17402) may have a dissipated power of about 15 W at full operation, and the lighting device 17408 may have a dissipated power of about 50 W at full operation. Further illustratively, the heatsink 17410 may be configured to dissipate a maximum heat loss of about 65 W in case the coordinated control of the operation of the LIDAR light source 42 and of the lighting device 17408 is not implemented in the system 17400. The implementation of the coordinated control may provide reducing the dimension of the heatsink 17410, as described in further detail below.

Only as a numerical example, the heatsink 17410 may be configured as follows. The heatsink 17410 may have a width of about 80 mm, a length (e.g., a depth) of about 70 mm, and a height of about 50 mm, and may include 27 fins. The volume of the heatsink 17410 may be about 290 $cm^3$. The heatsink 17410 may provide an air flow volume of about 23.5 $m^3$/h and an air pressure drop of about 19.3 Pa, e.g. assuming an air temperature of about 70° C. The heatsink 17410 may be designed to sustain a maximum temperature of about 85° C. in case a thermal power of 65 W is dissipated.

As illustrated in the top view in FIG. 174C, the LIDAR system 17402 may include, at the emitter side, a LIDAR light source 42, a scanning element 17412 (e.g., a MEMS mirror), and the emitter optics arrangement 17404 (e.g., one or more optical components, such as one or more lenses, to collimate or to focus the emitted light). The LIDAR system 17402 may include, at the receiver side, a sensor 52, and the receiver optics arrangement 17406 (e.g., one or more optical components, such as one or more lenses, as illustrated in FIG. 1736) to collimate or to focus the received light onto the sensor 52. The receiver optics arrangement 17406 may have an acceptance aperture, $A_{RX}$. Only as a numerical example, the receiver optics arrangement 17406 may have a lens with size 35 mm×50 mm facing the field of view of the LIDAR system 17402, corresponding to an acceptance aperture of 1750 mm$^2$.

FIG. 174E shows a second configuration of the illumination and sensing system 17400 in a schematic representation in accordance with various embodiments. FIG. 174F and FIG. 174G show each one or more components of the illumination and sensing system 17400 in such second configuration in a schematic representation in accordance with various embodiments. The description of the components described in relation to FIG. 174A to FIG. 174D will be omitted, and emphasis will be placed on the differences between the two configurations.

In the second configuration of the illumination and sensing system 17400, the coordinated control of the operation of the LIDAR system 17402 and of the lighting device 17408 may be implemented, for example with a threshold thermal power of 50 W. The provision of the threshold thermal power may offer the effect that the heat loss of the system 17400 may be lower than the heat loss of the system 17400 in the first configuration described above. In the second configuration, the system 17400 may include a second heatsink 17410-2 (shown in FIG. 174F) smaller than the heatsink 17410. Illustratively, the second heatsink 17410-2 may be configured to dissipate a maximum heat loss lower than a maximum heat loss of the heatsink 17410. The second heatsink 17410-2 may be configured to dissipate a maximum heat loss of about 50 W.

Only as a numerical example, the second heatsink 17410-2 may be configured as follows. The second heatsink 17410-2 may have a width of about 80 mm, a length (e.g., a depth) of about 70 mm, and a height of about 30 mm. The volume of the second heatsink 17410-2 may be about 180 cm$^3$. The second heatsink 17410-2 may include 21 fins. The second heatsink 17410-2 may provide an air flow volume of about 24 m$^3$/h and an air pressure drop of about 19.8 Pa, e.g. assuming an air temperature of about 70° C. The second heatsink 17410-2 may be designed to sustain a maximum temperature of about 85° C., in case a thermal power of 50 W is dissipated.

The second heatsink 17410-2 may have a smaller volume compared to the heatsink 17410 (e.g., the volume may be reduced by about 40%, e.g. by about 110 cm$^3$). The reduction in the volume may be provided by a reduction in at least one lateral dimension compared to the heatsink 17410, e.g. the height of the heatsink 17410-2 may be 20 mm smaller than the height of the heatsink 17410 (30 mm instead of 50 mm, while leaving the other dimensions unchanged). It is understood that the reduction in volume and in lateral dimension illustrated in FIG. 174E and FIG. 174F is shown only as an example, and other types of adaptation may be provided (illustratively, depending on the shape of the heatsink, which shape may be adapted to the design of the system 17400).

The reduced dimension of the heatsink 17410-2 may provide additional space in the system 17400 for the LIDAR system 17402 and/or for the lighting device 17408. Illustratively, the reduction in heatsink-dimension may provide that other dimensions, for example with respect to the LIDAR system 17402, may be increased as compared to a situation where a LIDAR system is integrated together with a lighting device (e.g., in a headlamp) without any heatsink-adaptation. As an example, illustrated in FIG. 174E, the height of the LIDAR system 17402 may be increased by an amount corresponding to the reduction in the height of the heatsink, e.g. by 20 mm.

In the exemplary configuration illustrated in FIG. 174E and FIG. 174G, in this second configuration of the system 17400 the LIDAR system 17402 may include a second receiver optics arrangement 17406-2 having greater dimension (e.g., a greater diameter) compared to the receiver optics arrangement 17406 in the first configuration. Additionally or alternatively, the second receiver optics arrangement 17406-2 may be spaced farther away from the sensor 52 (e.g., from the detector pixels) compared to the first configuration.

The additional volume made available by the smaller heatsink 17410-2 may be used to increase the aperture $A_{RX}$ of the second receiver optics arrangement 17406-2, e.g., to increase the size of the entrance surface of the front lens of the arrangement. By way of example, the entrance surface of the front lens may be increased by a factor of two (e.g., an aperture twice as large may be provided in the second configuration compared to the first configuration). Only as a numerical example, the front lens of the second receiver optics arrangement 17406-2 may have a size of 70 mm×50 mm (compared to the 35 mm×50 mm of the receiver optics arrangement 17406 in the first configuration), corresponding to an acceptance aperture of 3500 mm$^2$.

The increased aperture may provide an increased detection range of the LIDAR system 17402. The achievable range may increase by 20% to 40% depending on the object size, as described in further detail below.

In case of a small object (e.g., smaller than a spot size of the emitted light at the range R, e.g. smaller than the laser spot size) the range, R, may be proportional to the aperture, $A_{RX}$, of the receiver optics, as follows, $$R \sim \sqrt[4]{A_{RX}} \tag{18al}$$

Assuming a factor of 2 of increase in the aperture, $A_{RX}$, the range may increase by a factor $\sqrt[4]{2}=1.2$ for small objects.

In case of a large object (e.g., larger than a spot of the emitted light, e.g. larger than the laser spot) the range, R, may be proportional to the aperture, $A_{RX}$, of the receiver optics, as follows, $$R \sim \sqrt{A_{RX}} \tag{19al}$$

Assuming a factor of 2 of increase in the aperture, $A_{RX}$, the range may increase by a factor $\sqrt{2}=1.4$ for large objects.

FIG. 175 illustrates a vehicle information and control system 17500 in a schematic representation in accordance with various embodiments.

The vehicle information and control system 17500 (also referred to as system 17500) may be an exemplary implementation of a system of a vehicle configured to process information and provide (e.g., generate) instructions or commands. The vehicle information and control system 17500 may be an exemplary implementation of a system of a vehicle configured to implement the coordinated control of a sensor system and an illumination device described above.

The system 17500 may include a first communication module 17502 configured to receive and process information related to a vehicle condition, e.g. related to a traffic or driving situation. As an example, the first module 17502 may be configured to receive and process information related to an ambient light level, a vehicle environment, a traffic condition, a weather condition, a vehicle condition, and a SAE-level.

The system 17500 may include a second communication module 17504 configured to receive and process external information. As an example, the second module 17504 may be configured to receive and process information related to high-quality maps, traffic maps, intelligent navigation system, GPS data, vehicle-to-vehicle (V2V) communication data, vehicle-to-environment (V2X) communication data, and inertial measurement sensor data.

The system 17500 may include a third communication module 17506 configured to receive and process internal information. As an example, the third module 17506 may be configured to receive and process information related to destination and route planning, safety and ethical standards, vehicle loading (e.g., passengers, loading, and the like), and availability of power (e.g., battery, gasoline, and the like).

The system 17500 may include a power management module 17508. The power management module 17508 may be configured to receive and process information related to the power management of the vehicle, and/or to provide instructions related to the power management of the vehicle. As an example, the power management module 17508 may process information and provide instructions in relation to a power train (e.g., to the power provided for vehicle driving), and/or in relation to auxiliary power (e.g., power for auxiliary equipment, such as HVAC, V2V/V2X, lighting and signaling, and the like). The power management module 17508 may determine optimized power levels (e.g., operation power levels and/or thermal power levels) for the vehicle based on information received from various internal and external information sources.

The system 17500 may include a vehicle control module 17510 configured to receive and process information related to the control of the vehicle, and/or to provide instructions related to the control of the vehicle. As an example, the vehicle control module 17510 may process information and provide instructions in relation to driving and steering and/or in relation to other vehicle control functions.

The system 17500 may include a headlight control module 17512 (also referred to as headlamp control module). The headlight control module 17512 may be configured to implement the situation-dependent optimization of power management, as described above (and, for example, provide corresponding instruction to a light emission controller). The headlight control module 17512 (e.g., a computing device of the module 17512) may be configured to determine suitable power level to be supplied to illumination and sensing functionalities. The determination may be based on information received by the power management module 17508. The headlight control module 17512 may control or provide control information in relation to a left-side headlight of the vehicle (including a respective headlamp light source and sensor system), and in relation to a right-side headlight of the vehicle (including a respective headlamp light source and sensor system).

Illustratively, the coordinated control of illumination and sensing functionalities may be extended to the case in which, for example, each of the two headlights has integrated sensor functionalities (e.g., an integrated LIDAR system and/or other sensors). The situation-adaptive control of the headlamp light sources and sensing devices may provide different settings for left-side headlight and right-side headlight. This may provide finding an optimum compromise. As an example, in case of driving on a two-lane motor way on the left lane and with high speed, the settings for the left-side headlight may be set to high power levels (e.g., high operation power levels and/or high thermal power levels) for the headlamp light source (illustratively, to ensure a long viewing distance for the driver) and correspondingly reduced power levels (e.g., reduced operation power levels and/or reduced thermal power levels) for the LIDAR system may be provided (illustratively, to keep the total power within the limit, e.g. below 50 W). For the right-side headlight, higher power setting may be used for the LIDAR system to check for vehicles on the right lane of the motorway, and correspondingly reduced power levels may be used for the headlamp light source to keep the total power within the limit.

In the following, various aspects of this disclosure will be illustrated:

Example 1al is an illumination and sensing system. The illumination and sensing system may include a LIDAR Sensor System. The LIDAR Sensor System may include a LIDAR light source. The illumination and sensing system may include a further light source. The illumination and sensing system may include a light emission controller configured to operate the LIDAR light source with a first operation power resulting in a first thermal power and to operate the further light source with a second operation power resulting in a second thermal power. A sum of the first thermal power and the second thermal power may be below a predefined threshold thermal power.

In Example 2al, the subject-matter of example 1 al can optionally include that operating the LIDAR light source with the first operation power includes controlling the LIDAR light source to emit light with a first optical power. Operating the further light source with the second operation power may include controlling the further light source to emit light with a second optical power.

In Example 3al, the subject-matter of example 2al can optionally include that a sum of the first optical power and the second optical power is below a predefined threshold optical power.

In Example 4al, the subject-matter of any one of examples 2al or 3al can optionally include that the first operation power is a sum of the first optical power and the first thermal power. The second operation power may be a sum of the second optical power and the second thermal power.

In Example 5al, the subject-matter of any one of examples 1al to 4al can optionally include a cooling element connected to both the further light source and the LIDAR Sensor System.

In Example 6al, the subject-matter of example 5al can optionally include that the cooling element is configured to dissipate a heat loss substantially equal to the predefined threshold thermal power.

In Example 7al, the subject-matter of any one of examples 5al or 6al can optionally include that the cooling element is a heat sink having a volume in the range from about 100 $cm^3$ to about 300 $cm^3$.

In Example 8al, the subject-matter of any one of examples 1 al to 7al can optionally include that the predefined threshold thermal power is in the range from about 30 W to about 100 W.

In Example 9al, the subject-matter of any one of examples 1al to 8al can optionally include that the further light source includes at least one light emitting diode.

In Example 10al, the subject-matter of any one of examples 1al to 9al can optionally include that the further light source is configured to is provide low beam functionalities and/or high beam functionalities and/or adaptive driving beam functionalities.

In Example 11al, the subject-matter of any one of examples 1al to 10al can optionally include that the light emission controller is configured to operate the LIDAR light source and the further light source in accordance with an ambient light level.

In Example 12al, the subject-matter of any one of examples 1al to 11al can optionally include that the light emission controller is configured to operate the LIDAR light source and the further light source in accordance with a SAE-level.

In Example 13al, the subject-matter of any one of examples 1al to 12al can optionally include that the light emission controller is configured to operate the LIDAR light source and the further light source in accordance with a traffic scenario and/or a driving scenario.

In Example 14al, the subject-matter of any one of examples 1al to 13al can optionally include that the LIDAR Sensor System is configured as a scanning LIDAR Sensor System.

In Example 15al, the subject-matter of any one of examples 1al to 13al can optionally include that the LIDAR Sensor System is configured as a Flash LIDAR Sensor System.

Example 16al is a vehicle including one or more illumination and sensing systems according to any one of examples 1al to 15al.

Example 17al is a method of operating an illumination and sensing system. The illumination and sensing system may include a LIDAR Sensor System including a LIDAR light source. The illumination and sensing system may include a further light source. The method may include operating the LIDAR light source with a first operation power resulting in a first thermal power, and operating the further light source with a second operation power resulting in a second thermal power. A sum of the first thermal power and the second thermal power may be below a predefined threshold thermal power.

In Example 18al, the subject-matter of example 17al can optionally include that the operating the LIDAR light source with the first operation power includes the LIDAR light source emitting light with a first optical power. Operating the further light source with the second operation power includes the further light source emitting light with a second optical power.

In Example 19al, the subject-matter of example 18al can optionally include that a sum of the first optical power and the second optical power is below a predefined threshold optical power.

In Example 20al, the subject-matter of example 18al or 19al can optionally include that the first operation power is a sum of the first optical power and the first thermal power. The second operation power may be a sum of the second optical power and the second thermal power.

In Example 21al, the subject-matter of any one of examples 17al to 20al can optionally include a cooling element connected to both the further light source and the LIDAR Sensor System.

In Example 22al, the subject-matter of example 21al can optionally include the cooling element dissipating a heat loss substantially equal to the predefined threshold thermal power.

In Example 23al, the subject-matter of any one of examples 21al or 22al can optionally include that the cooling element is a heat sink having a volume in the range from about 100 $cm^3$ to about 300 $cm^3$.

In Example 24al, the subject-matter of any one of examples 17al to 23al can optionally include that the predefined threshold thermal power is in the range from about 30 W to about 100 W.

In Example 25al, the subject-matter of any one of examples 17al to 24al can optionally include that the further light source includes at least one light emitting diode.

In Example 26al, the subject-matter of any one of examples 17al to 25al can optionally include the further light source providing low beam functionalities and/or high beam functionalities and/or adaptive driving beam functionalities.

In Example 27al, the subject-matter of any one of examples 17al to 26al can optionally include operating the LIDAR light source and the further light source in accordance with an ambient light level.

In Example 28al, the subject-matter of any one of examples 17al to 27al can optionally include operating the LIDAR light source and the further light source in accordance with a SAE-level.

In Example 29al, the subject-matter of any one of examples 17al to 28al can optionally include operating the LIDAR light source and the further light source in accordance with a traffic scenario and/or a driving scenario.

In Example 30al, the subject-matter of any one of examples 17al to 29al can optionally include that the LIDAR Sensor System is configured as a scanning LIDAR Sensor System.

In Example 31al, the subject-matter of any one of examples 17al to 29al can optionally include that the LIDAR Sensor System is configured as a Flash LIDAR Sensor System.

Example 32al is a computer program product, including a is plurality of program instructions that may be embodied in non-transitory computer readable medium, which when executed by a computer program device of an illumination and sensing system according to any one of examples 1al to 15al, cause the illumination and sensing system to execute the method according to any one of the examples 17al to 31al.

Example 33al is a data storage device with a computer program that may be embodied in non-transitory computer readable medium, adapted to execute at least one of a method for illumination and sensing system according to any one of the above method examples, an illumination and sensing system according to any one of the above illumination and sensing system examples.

The proper functioning of a LIDAR system may be tested prior to its installation at the intended location (e.g., prior to the installation of the LIDAR system in a vehicle). By way of example, the LIDAR system (and/or other sensors or sensor systems, such as a camera) may be calibrated by means of a super-ordinate system, e.g. a sensor-external system, before being delivered and put into operation. In operation, there may be no simple way to check the correct functioning of the various components (e.g., at the emitter side and/or at the receiver side of the LIDAR system). By way of example, additional sensors may be provided for evaluating the correct functioning of active elements (e.g., of a laser), e.g. with respect to functional safety aspects. As another example, a failure in the functionality may be deduced from the plausibility of the measured data. However, measurements that appear to be valid may be provided even in case of a shift (e.g., a displacement or misalignment) of individual optical components, or even in case of tilting of sub-systems or sub-assemblies of the LIDAR system. In such cases, objects in the scene may be perceived with a lateral offset. As an example, a car driving in front may be perceived as located in a side lane.

Various embodiments may be related to a testing scheme for monitoring a sensor device (e.g., for monitoring a LIDAR system included in a sensor device). The testing procedure described herein may be flexibly applied for checking a LIDAR system already installed at its location of operation (e.g., for checking a LIDAR system included in a sensor device, such as in a LIDAR Sensor Device, for example in a vehicle). A detector may be provided (e.g., in the sensor device) to ensure the correct functioning of a LIDAR system.

The detector may be, for example, external to the LIDAR system. As another example, the detector may be internal to the LIDAR system, e.g. additional to a LIDAR sensor of the LIDAR system. By means of the detector it may be possible to evaluate whether an anomaly in the emission of the LIDAR system may be due to a malfunction or a failure of a component or whether it may be due to an environmental condition. Illustratively, the detector may enable distinguishing between the case in which no reflection is present and the case in which no light is emitted.

The LIDAR system may be configured to emit light (e.g., laser light) in accordance with a predefined configuration (e.g., in accordance with a predefined emission pattern, such as a predefined grid pattern). By way of example, the grid pattern may include vertical lines sequentially emits ted into the field of view, e.g. during a scanning process or as part of a scanning process covering the field of view. Illustratively, the LIDAR system may be configured to project a laser line or at least one laser spot (also referred to as laser dot) into a certain direction (e.g., to project a grid of lines or a pattern comprising a plurality of laser spots into the field of view).

The detector (e.g., a camera-based image recognition system) may be configured to detect the light emitted by the LIDAR system. Illustratively, the detector may be configured to detect or to generate an image of the light emitted by the LIDAR system in the field of view (e.g., an image of an emitted line or an image of the emitted pattern). The detection of the emitted light (e.g., the detection of the projected grid pattern) may enable determining a state of the sensor device (e.g., a state of the LIDAR system) or a state in the environment of the sensor device (e.g., a state in the environment of the LIDAR system), as described in further detail below. By way of example, the detection of the projected grid pattern may provide determining whether the LIDAR emission system works properly (or not). This cannot be fulfilled by the LIDAR system itself, e.g. by the LIDAR receiver, which in this configuration has usually no capability of resolution in this scanning direction (e.g. in case of a 1D detector array).

In various embodiments, one or more processors (e.g., associated with or included in a sensor fusion box, e.g. of the sensor device) may be configured to process the detected image (e.g., the detected line or pattern, e.g. grid pattern). The one or more processors may be configured to determine (e.g., to recognize) irregularities and/or deviations in the detected image (e.g., in the measured image) by comparing the detected image with one or more reference images (illustratively, with one or more computed or simulated images). By way of example, a distortion and/or an offset in the emitted light (e.g., in one or more lines) may be detected. As another example, the absence of one or more illuminated regions (e.g., the absence of one or more lines) may be detected. As a further example, a reduced intensity of the emitted light (e.g., of one or more lines or of one or more dots) may be detected. In case a mismatch is determined between the reference (e.g., the simulation) and the measurement, a failure and correction message may be issued to the LIDAR system (e.g., to a control system of the LIDAR system).

In various embodiments, the one or more processors may be configured to determine the state of the sensor device or the state in the environment of the sensor device taking into consideration the type of irregularity. Illustratively, the one or more processors may be configured to determine (e.g., distinguish) the origin of a malfunction by comparing the detected image with the one or more reference images (e.g., with the one or more calculated reference images). A severity of the failure may also be determined. By way of example, an irregularity may be related to an environmental condition, such as contamination, rain, fog, condensed water, sand, and the like. As another example, an irregularity may be related to a failure in the LIDAR system, such as a non-working laser diode, a non-working MEMS mirror, a broken LIDAR transmit optics, and the like. Illustratively, in case a laser line or a laser dot is not detected at the expected position in the detected image (e.g. in case the line or the dot is detected at an offset position), it may be determined that the LIDAR system is misaligned, e.g. that the LIDAR system and the detector have lost their angular orientation one to the other.

The testing scheme described herein may provide detecting an angular displacement of the LIDAR system or of some optical components during operation. This may provide increased functional safety of the operation of the sensor device. In view of the relative alignment between the LIDAR system and the detector, additional sensors may not be required. A verification of the alignment of the LIDAR system may be provided not only based on assessing the plausibility of the provided data, but also by means of the detector measurement of the emitted LIDAR light (e.g., of the projected laser lines, e.g. of the projected pattern). Such measurement may be less computationally demanding, more precise, and may be carried out even in case of scenes with low contrast. A failure in the emitter path (e.g., in the laser path) may be measured directly and may be evaluated without the need for individually monitoring each component at the emitter side.

In various embodiments, the testing scheme described herein may provide increased functional safety by monitoring whether the LIDAR system is emitting light in the correct direction and/or if the alignment between the laser emission path and the laser detection path is still accurate according to the initial alignment. The detected emitted light may be evaluated taking into consideration the distance of the reflection known by the LIDAR measurement. Illustratively, the position of a laser line (and/or of a laser dot) in the detected image may be determined (e.g., computed or calculated), taking into consideration the time-of-flight determined by means of the LIDAR measurement.

In various embodiments, a calibration may be performed. The LIDAR system and/or the detector may be calibrated by detecting or measuring a known scene (e.g., a scene having known properties, such as known reflectivity properties). The measured or detected values may be evaluated (e.g., compared with the known values). The LIDAR system and/or the detector may be adjusted in accordance with the results of the evaluation.

In various embodiments, the detector may be included in or be part of a camera. The camera may include an infra-red filter configured to block infra-red light (e.g., to block infra-red light other than the used LIDAR laser wavelengths). The infra-red filter may be configured to let through visible light. Illustratively, the infra-red filter may be configured or controlled to allow light (e.g., laser light) emitted by the LIDAR system to pass through (illustratively, to impinge onto the detector). By way of example, the infra-red filter of the camera may be configured to block most of the infra-red light of the surrounding, but significantly less infra-red light of the emitted wavelength (e.g., of the laser wavelength). Illustratively, the infra-red filter may have a bandpass around the emitted wavelengths over the temperatures of operation (e.g., with a bandwidth equal to or smaller than about 50 nm, for example of about 5 nm). The infra-red filter may have a small bandwidth (e.g., as low as 1 nm), especially in case the light source emitting the LIDAR light is temperature stabilized. This configuration may provide that the color measurement of the camera is only minimally affected and at the same time, the detector is significantly sensitive to the emitted LIDAR light.

This configuration may enable using a regular daylight camera (e.g. RGB camera) equipped with such an infra-red filter with a narrow-bandpass band in the infra-red suitable for regular true color visible image recognition, while maintaining a good sensitivity for the emitted infra-red light (e.g., for the projected laser pattern). Illustratively, in various embodiments, the camera may include sensors associated with the detection of different wavelengths or different wavelength regions (e.g., sensors sensitive to different wavelengths). The camera may include one or more RGB-sensors (e.g., one or more sensors associated with RGB-detection), and one or more infra-red sensors (e.g., one or more sensors associated with infra-red detection). The sensors may be of the same type, e.g. with different filters or filter segments associated thereto. By way of example, the camera may include one or more sensors receiving light through a (e.g., bandpass) filter configured to let RGB light pass through, and one or more sensors receiving light through a (e.g., bandpass) filter configured to let IR light pass through. It may be possible to arrange the infra-red-filter (e.g., one or more infra-red filter segments) only on top of infra-red sensitive sensors of the camera.

In various embodiments, a shutter may be provided (e.g., the camera may include a shutter, such as a dynamic aperture or a dynamic filter assembly). A shutter controller may be configured to control the shutter (e.g., to open the shutter) in synchronization with the emission of light by the LIDAR system (e.g., in synchronization with a pattern projection timing). The LIDAR system (e.g., the light source of the LIDAR system) may be configured to provide short light pulses (e.g., short infra-red laser pulses), for example with a pulse duration equal to or lower than about 15 ns. The LIDAR system may be configured to provide high repetition rate (e.g., equal to or higher than a few hundred Hz, or equal to or higher than 1 kHz), e.g. to emit light pulses with a high repetition rate. The exposure time of the detector may be controlled (e.g., by means of the shutter) to correspond to the duration of one or more LIDAR light pulses, illustratively to collect the light from the LIDAR system (e.g., all the emitted light) and very little light from the environment.

FIG. 169A shows a sensor device 16900 in a schematic representation in accordance with various embodiments.

The sensor device 16900 may be or may be configured as the LIDAR Sensor Device 30. By way of example, the sensor device 16900 may be a housing, a vehicle, or a vehicle headlight.

The sensor device 16900 may include a LIDAR system 16902. The LIDAR system 16902 may be or may be configured as the LIDAR Sensor System 10. As an example, the LIDAR system 16902 may be configured as a scanning LIDAR system (e.g., as the scanning LIDAR Sensor System 10). As another example, the LIDAR system 16902 may be configured as a Flash LIDAR System (e.g., as the Flash LIDAR Sensor System 10).

The sensor device 16900 may include a light source 42 (e.g., included in or associated with the LIDAR system 16902). The light source 42 may be configured to emit light, e.g. infra-red light. The light source 42 may be configured to emit light having a predefined wavelength. The light source 42 may be configured to emit light in the infra-red range (for example in the range from about 700 nm to about 2000 nm, for example in the range from about 860 nm to about 1600 nm, for example at about 905 nm or at about 1550 nm). Illustratively, the light source 42 may be an infra-red light source 42. The light source 42 may be configured to emit light in a continuous manner or it may be configured to emit light in a pulsed manner (e.g., to emit one or more light pulses, such as a sequence of laser pulses).

By way of example, the light source 42 may be configured to emit laser light. The (e.g., infra-red) light source 42 may include one or more laser light sources (e.g., configured as the laser source 5902 described, for example, in relation to FIG. 59). The one or more laser light sources may include at least one laser diode, e.g. one or more laser diodes (e.g., one or more edge emitting laser diodes and/or one or more vertical cavity surface emitting laser diodes).

In various embodiments, the light source 42 may be configured to emit light towards a field of view 16904. The field of view 16904 may be a field of emission of the light source 42. The field of view 16904 may be or substantially correspond to a field of view of the LIDAR system 16902 (e.g., an angular range in which the LIDAR system 16902 may emit light and/or from which the LIDAR system 16902 may receive light, e.g. reflected from one or more objects). Illustratively, the field of view 16904 may be a scene detected at least in part by means of the LIDAR system 16902. The field of view 16904 may be or substantially correspond to a field of view of an optical sensor array 16906 of the sensor device 16900, described in further detail below. The field of view 16904 may be or substantially correspond to the field of view of the sensor device 16900, or the field of view 16904 may be a portion of the field of view of the sensor device 16900 (e.g., provided by the superposition of the individual fields of view of one or more sensor systems of the sensor device 16900).

The field of view 16904 may be a two-dimensional field of view. Illustratively, the field of view 16904 may extend along a first direction 16954 and a second direction 16956 (e.g., the field of view 16904 may have a first angular extent in a first direction 16954 and a second angular extent in a second direction 16956). The first direction 16954 may be perpendicular to the second direction 16956 (e.g., the first direction 16954 may be the horizontal direction and the second direction 16956 may be the vertical direction). The first direction 16954 and the second direction 16956 may be perpendicular to a third direction 16952, e.g. in which third direction 16952 an optical axis of the LIDAR system 16902 and/or an optical axis of the optical sensor array 16906 may be aligned.

In various embodiments, the light source 42 (e.g., the LIDAR system 16902) may be configured or controlled to scan the field of view 16904 with the emitted light. The light source 42 may be configured or controlled to emit light in accordance with a predefined emission pattern (e.g., covering the field of view 16904). Illustratively, the light source 42 may be configured or controlled to emit a light according to a pattern (e.g., one-dimensional or two-dimensional, e.g. a pattern into one direction or into two directions). By way of example, the light source 42 may be configured or controlled to emit light in such a way that information or data are encoded in the emitted light (e.g., as described, for example, in relation to FIG. 131A to FIG. 137, and/or in relation to FIG. 138 to FIG. 144, and/or in relation to FIG. 145A to FIG. 149E).

By way of example, the light source 42 may include an array of light sources (e.g., an array of laser sources, such as an array of laser diodes), e.g. a one-dimensional array of light sources or a two-dimensional array of light sources. The emission of the light sources may be controlled (for example, column wise or pixel wise) such that scanning of the field of view 16904 may be carried out.

As another example, the sensor device (e.g., the LIDAR system 16902) may include a scanning system (e.g., a beam steering system), e.g. one or more micro-electro-mechanical systems (MEMS). The scanning system may be configured to receive light from the light source 42. The scanning system may be configured to scan the field of view 16904 with the light received from the light source 42 (e.g., to sequentially direct the light received from the light source 42 towards different portions of the field of view 16904). Illustratively, the scanning system may be configured to control the emitted light such that a region of the field of view 16904 is illuminated by the emitted light. The illuminated region may extend over the entire field of view 16904 in at least one direction (e.g., the illuminated region may be seen as a line extending along the entire field of view 16904 in the horizontal or in the vertical direction). Alternatively, the illuminated region may be a spot (e.g., a circular region) in the field of view 16904. The scanning system may be configured to control the emission of the light to scan the field of view 16904 with the emitted light. By way of example, the scanning system may include a MEMS mirror or an optical grating (e.g., a liquid crystal polarization grating). The MEMS mirror may be configured to be tilted around one axis (1D-MEMS) or around two axes (2D-MEMS). Alternatively, the scanning system may include a plurality of beam steering elements, e.g. two MEMS mirrors (e.g. two 1D-MEMS). The scan may be performed along a scanning direction (e.g., a scanning direction of the LIDAR system 16902). The scanning direction may be a direction perpendicular to the direction along which the illuminated region extends. The scanning direction may be the first (e.g., horizontal) direction 16954 or the second (e.g., vertical) direction 16956 (by way of example, in FIG. 169A the scanning direction may be the horizontal direction).

The sensor device 16900 may include an emitter optics arrangement (e.g., included in or associated with the LIDAR system 16902, e.g. with the light source 42). The emitter optics arrangement may include one or more optical components. The one or more optical components may be configured to collimate the emitted light. By way of example, the emitter optics arrangement may include one or more lenses (e.g., a lens system, e.g. a micro-lens array).

The sensor device 16900 may include a sensor 52 (e.g., included in or associated with the LIDAR system 16902, e.g. a LIDAR sensor 52). The sensor 52 may include one or more photo diodes (e.g., one or more sensor pixels each associated with a respective photo diode). The one or more photo diodes may form an array. The photo diodes may be arranged in a one-dimensional array (e.g., the photo diodes may be arranged into one direction to form the one-dimensional array). The photo diodes may be arranged in the one-dimensional array in a row or in a column. It is understood that the photo diodes may alternatively be arranged in a two-dimensional array (e.g., the photo diodes may be arranged into two directions to form the two-dimensional array). The photo diodes may be arranged in the two-dimensional array in rows and columns.

The sensor device 16900 may include an optical sensor array 16906 (e.g., external or internal to the LIDAR system 16902). The optical sensor array 16906 may be configured to optically detect infra-red light from the field of view 16904. Illustratively, the optical sensor array 16906 may be configured to image the field of view 16904 and to detect the infra-red light present therein (e.g., the optical sensor array 16906 may be configured to simultaneously image the entire field of view 16904). The optical sensor array 16906 may be configured to detect infra-red light from the field of view 16904 to thereby detect one or more infra-red images 16920. Illustratively, the optical sensor array 16906 may be configured to detect infra-red light from the field of view 16904 in such a way that one or more infra-red light lines or infra-red light patterns (e.g., including a plurality of dots) may be detected (e.g., imaged). Further illustratively, the optical sensor array 16906 may be configured to detect infra-red light from the field of view 16904 in such a way that the infra-red light emitted by the light source 42 (e.g., in a scan of the field of view 16904 or in a portion of a scan of the field of view 16904) may be detected. The detected infra-red light may include infra-red light reflected by an object in the field of view 16904 (e.g., light emitted by the light source 42 and reflected back towards the sensor device 16900 by the object).

An infra-red image 16920 may be described as an image of the field of view 16904 including one or more infra-red light lines or a pattern of infra-red light (e.g., a one-dimensional pattern or a two-dimensional pattern). Illustratively, the one or more detected infra-red images 16920 may be one or more two-dimensional infra-red images (e.g., one or more images of the two-dimensional field of view 16904). By way of example, at least one detected infra-red image may be or include a projection of infra-red light onto a two-dimensional surface (e.g., onto a road surface, or onto a side of a vehicle, for example a pattern tagged onto a vehicle).

The detection of infra-red light is illustrated, for example, in FIG. 169B in a schematic representation in accordance with various embodiments. In the exemplary case illustrated in FIG. 169B, the light source 42 (e.g., the LIDAR system 16902) may emit a vertical (e.g., laser) line 16916 in the field of view 16904 (e.g., as part of a scanning of the field of view 16904). Illustratively, the vertical line 16916 may be described as a projection in the two-dimensional field of view 16904 of the light emitted by the light source 42. The optical sensor array 16906 may detect the vertical line 16916 from the field of view 16904 to detect an infra-red image 16920 including the image 16918 of the vertical line 16916.

In various embodiments, the optical sensor array 16906 may be configured to provide two-dimensional resolution (e.g., resolution in the first direction 16954 and in the second direction 16956). The optical sensor array 16906 may be a two-dimensional optical sensor array. By way of example, the optical sensor array 16906 may include one or more detector pixels arranged along two directions to form the two-dimensional array. As another example, the optical sensor array 16906 may include or be formed by a plurality of individual detector pixels (e.g., spatially separated from one another).

Illustratively, the optical sensor array 16906 may include a plurality of optical sensor arrays (e.g., sub-arrays). The plurality of optical sensor arrays may have a same field of view or a different field of view. By way of example, at least a first optical sensor sub-array may have the same field of view as a second optical sensor sub-array. As another example, at least a first optical sensor sub-array may have a field of view different (e.g., non-overlapping, or partially overlapping) from the field of view of a second optical sensor sub-array. The field of view of the optical sensor array 16906 may be the combination (e.g., the superposition) of the individual fields of view of the plurality of optical sensor sub-arrays.

In various embodiments, the optical sensor array 16906 may be or may include an array of photodetectors (e.g., a two-dimensional array of photodetectors), e.g. photodetectors sensitive in the visible wavelength range and in the infra-red wavelength range. By way of example, the optical sensor array 16906 may be or may include a charge-coupled device (CCD), e.g. a charge-coupled sensor array. As another example, the optical sensor array 16906 may be or may include a complementary metal-oxide-semiconductor (CMOS) sensor array. The CMOS sensor array may provide higher sensitivity in the near infra-red wavelength range compared to the CCD sensor array. As a further example, the optical sensor array 16906 may be or may include an array of InGaAs-based sensors (e.g., of InGaAs-based photodetectors). The InGaAs-based sensors may have high sensitivity at 1550 nm (e.g., higher sensitivity than CCD or CMOS at that wavelength). As a further example, the optical sensor array 16906 may be or may be configured as a LIDAR sensor 52 (e.g., included in another LIDAR system different from the LIDAR system 16902).

The optical sensor array 16906 may be a component of a camera 16908 of the sensor device 16900. Illustratively, the sensor device 16900 may include a camera 16908 which includes the optical sensor array 16906. The camera 16908 may be configured to image the field of view 16904 (e.g., the field of view 16904 may be or substantially correspond to a field of view of the camera 16908). By way of example, the camera 16908 may be a CCD camera. As another example, the camera 16908 may be a CMOS camera. The camera 16908 may be external or internal to the LIDAR system 16902. As an example, the camera 16908 may be laterally displaced with respect to the LIDAR system 16902. As an example, the camera 16908 may represent an imaging device which is configured to provide 2D images (e.g. color images) and which is part of the sensor system of a partially or fully automated driving vehicle used for scene understanding (e.g., the camera 16908 may include one or more sensors associated with the detection of color images and one or more sensors associated with the detection of infra-red images, for example with respectively associated filters, as described above). The camera images may be used as part of the object recognition, object classification and scene understanding process, performed by one or more processors of a sensor fusion box. Alternatively, the camera 16908 may be external to the sensor device 16900, e.g. included in another device communicatively coupled with the sensor device 16900 (e.g., included in a smartphone or in a traffic control station).

In various embodiments, the camera 16908 may include an infra-red filter 16910 to block light at least in a portion of the infra-red light wavelength region (e.g., in the wavelength region from about 780 nm to about 2000 nm) from hitting the optical sensor array 16906. Illustratively, the infra-red filter 16910 may be configured or controlled to block infra-red light from impinging onto the optical sensor array 16906 (e.g., to selectively block or allow infra-red light).

By way of example, the infra-red filter 16910 may be dynamically controllable (e.g., may be dynamically activated or de-activated). The camera 16906 (e.g., a camera controller, e.g. one or more processors 16914 of the sensor device 16900 described in further detail below) may be configured to at least temporarily deactivate the infra-red filter 16910 to let infra-red light pass the infra-red filter 16910 to hit the optical sensor array 16906 (e.g., to let infra-red light pass through the infra-red filter 16910 and hit the optical sensor array 16906). The de-activation of the infra-red filter 16910 may be in accordance with the emission of light (e.g., by the light source 42). The camera 16908 may be configured to at least temporarily deactivate the infra-red filter 16910 to let infra-red light pass the infra-red filter 16910 in synchronization with the emission of light (e.g., infra-red light) by the light source 42 (e.g., by the LIDAR system 16902). Illustratively, the camera 16908 may be configured to at least temporarily deactivate the infra-red filter 16910 such that the optical sensor array 16906 may detect the light emitted by the light source 42 within a certain time window (e.g., during a scan of the field of view 16904 or during a portion of a scan of the field of view, for example for a duration of about 2 ms or about 5 ms).

As another example, the infra-red filter 16910 may be a bandpass filter configured in accordance with the wavelength of the emitted light. Illustratively, the infra-red filter 16910 may be configured as a bandpass filter to let the wavelength region of the infra-red light emitted by the light is source (42) pass. The infra-red filter 16910 may be configured as a narrow bandpass filter. By way of example, the infra-red filter may have a bandwidth of at maximum 5 nm around an upper limit and a lower limit of the wavelength region, for example of at maximum 10 nm, for example of at maximum 15 nm. The wavelength region may have a bandwidth of at maximum 50 nm around a center wavelength of the infra-red light emitted by the light source 42 (e.g., around 905 nm), for example of at maximum 100 nm. In this configuration, the infra-red filter 16910 may be or may be configured as a static filter. In this configuration, the optical sensor array 16906 may be always active (e.g., may be continuously detecting light) or may be activated in synchronization with the light emission.

In the exemplary case illustrated in FIG. 169C, the infra-red filter 16910 be configured as a bandpass filter around 905 nm. In this exemplary configuration, the infra-red filter 16910 may have a low absorption and/or a low reflectivity, e.g. substantially 0%, at 905 nm and in a window around 905 nm (e.g., in a window having a width of about 10 nm around 905 nm, for example a width of about 5 nm). The infra-red filter 16910 may have a high absorption and/or a high reflectivity, e.g. substantially 100%, in the remaining portion of the infra-red wavelength range (e.g., from about 700 nm to about 2000 nm). Additionally, the filter 16910 may have a low absorption and/or a low reflectivity in the visible wavelength range, e.g. at wavelength below about 700 nm.

In various embodiments, additionally or alternatively, the sensor device 16900 may include a shutter 16912, e.g. included in the camera 16908. The shutter 16912 may be configured or controlled to control an exposure time of the optical sensor array 16906 (e.g., an exposure time of the camera 16908). The shutter 16912 may be configured to block light (e.g., when closed or when inserted into the optical path) and to allow light to pass (e.g., when open). Illustratively, the shutter 16912 may be controlled to prevent light (e.g., of any wavelength) from hitting the optical sensor array 16906 or to allow light to impinge onto the optical sensor array 16906. The shutter 16912 may be arranged downstream or upstream with respect to the infra-red filter 16910.

The sensor device 16900 (e.g., the camera 16908) may include a shutter controller configured to control the shutter 16912 (e.g., one or more processors of the sensor device may be configured to carry out the control of the shutter 16912). The shutter controller may be configured to open the shutter 16912 in accordance (e.g., in synchronization) with the light emission by the light source 42. The shutter controller may be configured to keep the shutter 16912 open for a predefined time period (e.g., during a scan or a portion of a scan of the field of view 16904 by the light source 42, e.g. for at least 2 ms or at least 5 ms). Illustratively, an amount of collected infra-red light (e.g., a number of detected laser lines in the detected infra-red image) may increase for increasing time in which the shutter is open.

In various embodiments, the sensor device 16900 may include one or more processors 16914 (e.g., associated with or included in a sensor fusion box). The one or more processors 16914 may be configured to compute (e.g., simulate) an image of a projected pattern (e.g., an image of the laser lines, or an image of a pattern of dots) according to the measured distances from the LIDAR system describing how the pattern is expected to occur at the optical sensor, as described in further detail below. The one or more processors 16914 may be configured to process the one or more infra-red images 16920 detected by the optical sensor array 16906. The one or more processors 16914 may be configured to compare the one or more infra-red images 16920 with one or more reference (e.g. computed or predicted) images. The one or more processors 16914 may be configured to determine a state of the sensor device 16900 (e.g., a state of the LIDAR system 16902) and/or a state in the environment of the sensor device 16900 (e.g., a state in the environment of the LIDAR system 16902) based on the comparison (illustratively, in accordance with the results of the comparison). The environment may be described as the space external to the sensor device 16900 (e.g., surrounding the sensor device 16900), for example as the space immediately outside the emitter optics arrangement of the LIDAR system 16902.

Each reference image may describe a (e.g., possible) state of the sensor device 16900 (e.g., a state of the LIDAR system 16902) or a state in the environment of the sensor device 16900 (e.g., in the environment of the LIDAR system 16902). Illustratively, a reference image may describe or include an expected (e.g. computed or predicted) appearance or arrangement of the detected infra-red light (e.g., the detected grid or pattern) associated with the respective state or state in the environment. Further illustratively, a reference image may describe or include an expected pattern of infra-red light associated with the respective state or state in the environment. By way of example, a reference image may include a vertical line at a certain position in the field of view 16904 associated with a state describing a correct functioning of the scanning system. As another example, a reference image may describe infra-red light having a predefined intensity associated with a state describing a correct functioning of the light source 42. As a further example, a reference image may describe infra-red light appearing or projected as a straight line (e.g., a straight vertical line) associated with a state describing a correct functioning of the emitter optics arrangement. As a further example, a reference image may describe an appearance of infra-red light associated with a respective atmospheric condition (e.g., computing an appearance of infra-red light in case of sunlight, e.g. with clear weather).

The one or more reference images may be generated in accordance with the light emission. At least one reference image may be generated or simulated in accordance with the emitted light (e.g., in accordance with the emission pattern carried out by the light source 42). Illustratively, at least one reference image may be the result of a simulation of an expected behavior of the emitted light in a respective state or state of the environment.

In various embodiments, the one or more reference images (e.g. computed reference images) may be stored in a memory (e.g., of the sensor device 16900, or communicatively coupled with the sensor device 16900). The one or more processors 16914 may be configured to retrieve the one or more reference images from the memory. Additionally or alternatively, the one or more processors 16914 may be configured to generate the one or more reference images (or additional reference images). Illustratively, the one or more processors 16914 may be configured to generate (e.g., by means of simulation) a reference image associated with a desired state or state in the environment (e.g., to determine whether the detected infra-red light may be associated with such state or state in the environment).

The state of the sensor device 16900 may be an alignment state of the sensor device 16900 (e.g., an alignment state of the LIDAR system 16902) or a functional state of the sensor device 16900 (e.g., a functional state of the LIDAR system 16902). Illustratively, a state of the sensor device 16900 may describe one or more properties of the sensor device 16900 (e.g., of the LIDAR system 16902), e.g. associated with the emission (and/or detection) of light.

The one or more processors 16914 may be configured to determine whether an error is present in the alignment state of the sensor device 16900 (e.g., of the LIDAR system 16902) based on the comparison between at least one detected infra-red image 16920 and at least one reference image. Illustratively, the one or more processors 16914 may be configured to determine a current alignment state of the sensor device 16900 based on the comparison. As an example, the one or more processors 16914 may be conic) figured to determine that an error is present in case the infra-red light in the detected infra-red image 16920 is tilted with respect to the infra-red light in the reference image or it is at a different angular position with respect to the infra-red light in the reference image.

By way of example, the error in the alignment state may be a is wrong angular orientation between the infra-red light source 42 and the optical sensor array 16906. Illustratively, the error in the alignment state may be an angular orientation between the infra-red light source 42 and the optical sensor array 16906 different from a predefined (e.g., initial or pristine) angular orientation. Further illustratively, the error in the alignment state may be a wrong angular orientation in the direction of emission of light. This may be related, for example, to a tilted or otherwise displaced optical component (e.g., a tilted lens, or a tilted beam steering element, such as a tilted MEMS mirror) or to an optical component having fallen out of position.

In various embodiments, the one or more processors 16914 may be configured to determine (e.g., to calculate) a position of infra-red light in a detected infra-red image 16920 by using the time-of-flight determined with the LIDAR measurement. Illustratively, the one or more processors 16914 may be configured to determine an angular position of the infra-red light in a detected infra-red image 16920 (e.g., of a vertical line, e.g. of a dot) by using the determined distance between the infra-red light and the sensor device 16900 (e.g., between the infra-red light and the LIDAR system 16902).

In various embodiments, the one or more processors 16914 may be configured to determine whether a failure is present in the functional state of the LIDAR Sensor Device 16900 (e.g., in the functional state of the LIDAR system 16902) based on the comparison between at least one detected infra-red image 16920 and at least one reference image. Illustratively, the one or more processors 16914 may be configured to determine a current functional state of the sensor device 16900 based on the comparison.

Figure 169D:
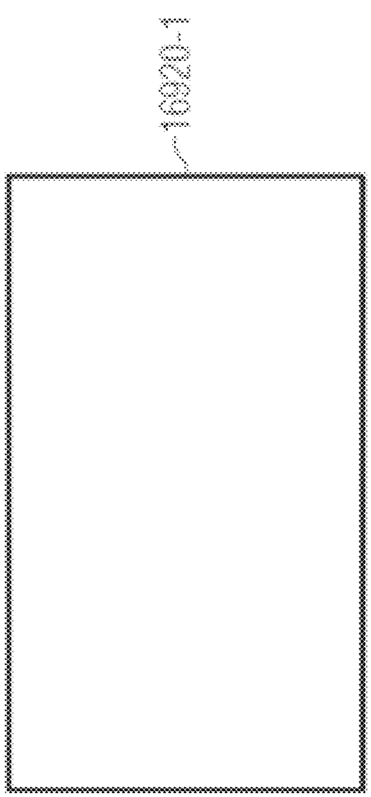
Figure 169E:
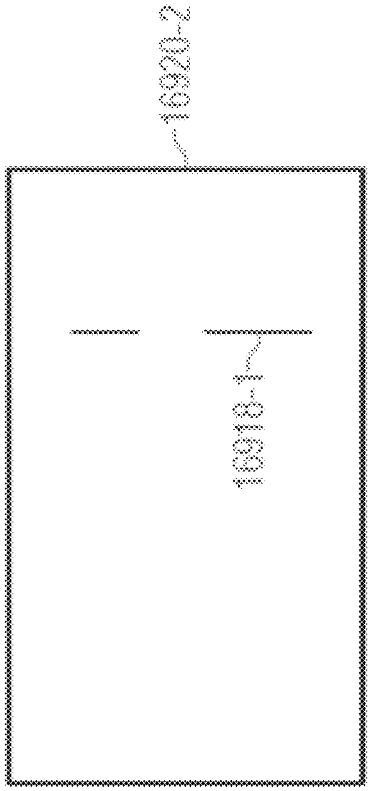

By way of example, the failure may be a failure of the infra-red light source 42. Illustratively, the failure may be the infra-red light source 42 not emitting light properly (or not emitting light at all). As an example, as illustrated in FIG. 169D, the one or more processors 16914 may be configured to determine such failure in case no infra-red light is present in the detected infra-red image 16920-1 (e.g., compared to light being present in the reference image). As another example, as illustrated in FIG. 169E, the one or more processors 16914 may be configured to determine such failure in case a discontinuous pattern of infra-red light is present in the detected infra-red image 16920-2, e.g. a discontinuous vertical line 16918-1 (e.g., compared to a continuous pattern of infra-red light being present in the reference image, e.g. a continuous vertical line). As a further example, the one or more processors 16914 may be configured to determine such failure in case infra-red light having lower intensity than reference infra-red light is present in the detected infra-red image.

The discontinuous line 16918-1 in FIG. 169E may indicate a failure or a malfunction at the emitter side, e.g. in the laser diodes, for example in case only some of the laser diodes (and not all) are emitting light. Alternatively, the discontinuous line 16918-1 in FIG. 169E may indicate a failure or a malfunction at the receiver side, for example in case of dirt on the receiver optics of the receiver side. It may be possible to discern between the case of failure at the emitter side and the case of failure at the receiver side considering a time evolution of the detected (e.g., discontinuous) pattern. Illustratively, in case the failure is occurring in the laser diodes, the discontinuous pattern 16918-1 may be detected over the entire scanning field. In case the failure is occurring in the receiver optics, the discontinuous pattern 16918-1 may be detected only in a portion of the field of view.

Figure 169F:
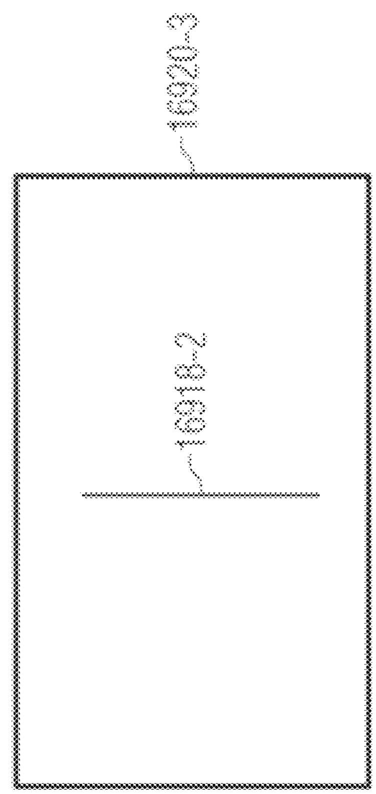

As another example, the failure may be a failure of the scanning system (e.g., a failure of the beam steering element), e.g. of the microelectro-mechanical system. Illustratively, the failure may be the scanning system not scanning the field of view 16904 with the emitted light or scanning the field of view 16904 with a non-predefined emission pattern (e.g., related to the beam steering element being broken, or to a wrong control of the beam steering element). As illustrated in FIG. 169F, the one or more processors 16914 may be configured to determine such failure in case the infra-red light in the detected infra-red image 16920-3 is in a wrong position, e.g. in a different location within the field of view 16904 with respect to the infra-red light in the reference image. Illustratively, a vertical line 16918-2 in the detected infra-red image 16920-3 may be stuck in the center of the field of view 16904 (e.g., in the center of the infra-red image 16920-3), rather than being scanned over the field of view 16904.

As a further example, the failure may be a failure of one or more optical components of the sensor device 16900 (e.g., of the LIDAR system 16902). As an example, the failure may be a failure of the sensor 52. Illustratively, the sensor 52 may not be detecting light properly (or at all). The one or more processors 16914 may be configured to determine such failure in case the detected infra-red image corresponds to the reference image (illustratively, including the expected infra-red light or light pattern) but no signal is generated by the sensor 52 (or in case a signal different from an expected signal is generated by the sensor 52).

Figure 169G:
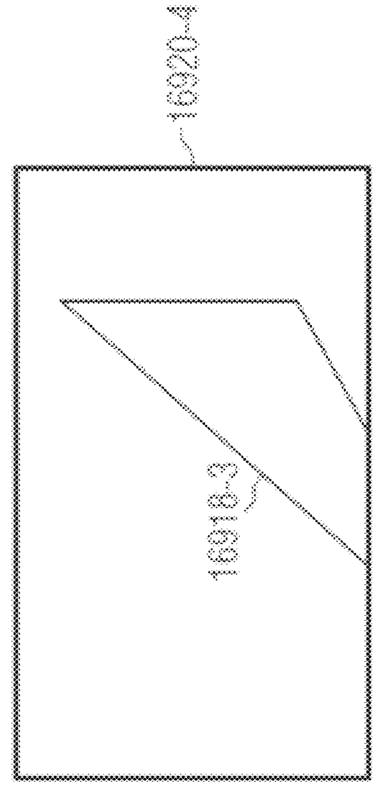

In various embodiments, the one or more processors 16914 may be configured to determine the type of state in the environment of the sensor device 16900 based on the comparison between at least one detected infra-red image 16920 and at least one reference image. The type of state in the environment of the sensor device 16900 may be an atmospheric condition, e.g. one of fog, snow, or rain. Additionally or alternatively, the type of state in the environment of the sensor device 16900 may describe or be related with a visibility condition, e.g., the type of state in the environment of the sensor device 16900 may be a dirt (e.g., being present on the emitter optics arrangement). As an example, as illustrated in FIG. 169G, the one or more processors 16914 may be configured to determine that fog is present in the environment in case the infra-red light 16918-3 in the detected infra-red image 16920-4 appears diffused (e.g., rather than collimated as in the reference image).

In the following, various aspects of this disclosure will be illustrated:

Example 1ai is Example 1ai is a LIDAR Sensor Device. The LIDAR Sensor Device may include an optical sensor array configured to optically detect infra-red light from a field of view to thereby detect one or more infra-red images. The LIDAR Sensor Device may include one or more processors configured to compare the detected one or more infra-red images with one or more reference images, each reference image describing a state of the LIDAR Sensor Device or a state in the environment of the LIDAR Sensor Device, to determine the state of the LIDAR Sensor Device and/or the state in the environment of the LIDAR Sensor Device.

In Example 2ai, the subject-matter of example 1 ai can optionally include that the one or more detected infra-red images are one or more two-dimensional infra-red images.

In Example 3ai, the subject-matter of any one of examples 1ai or 2ai can optionally include that at least one detected infra-red image of the one or more infra-red images is a projection of infra-red light onto a two-dimensional surface.

In Example 4ai, the subject-matter of any one of examples 1ai to 3ai can optionally include that at least one reference image is simulated in accordance with a light emission of an infra-red light source of the LIDAR Sensor Device.

In Example 5ai, the subject-matter of any one of examples 1ai to 4ai can optionally include that the one or more processors are configured to determine the state of the LIDAR Sensor Device and/or the state in the environment of the LIDAR Sensor Device based on the comparison between at least one detected infra-red image and at least one reference image.

In Example 6ai, the subject-matter of any one of examples 1ai to 5ai can optionally include that the state of the LIDAR Sensor Device is an alignment state of the LIDAR Sensor Device or a functional state of the LIDAR Sensor Device.

In Example 7ai, the subject-matter of example 6ai can optionally include that the one or more processors are configured to determine whether an error is present in the alignment state of the LIDAR Sensor Device based on the comparison between at least one detected infra-red image and at least one reference image.

In Example 8ai, the subject-matter of example 7ai can optionally include that the error in the alignment state is a wrong angular orientation between an infra-red light source of the LIDAR Sensor Device and the optical sensor array.

In Example 9ai, the subject-matter of any one of examples 6ai to 8ai can optionally include that the one or more processors are configured to determine whether a failure is present in the functional state of the LIDAR Sensor Device based on the comparison between at least one detected infra-red image and at least one reference image.

In Example 10ai, the subject-matter of example 9ai can optionally include that the failure is one of a failure of an infra-red light source of the LIDAR Sensor Device, a failure of a beam steering element of the LIDAR Sensor Device, or a failure of one or more optical components of the LIDAR Sensor Device.

In Example 11 ai, the subject-matter of any one of examples 1 ai to 10ai can optionally include that the one or more processors are configured to determine the type of state in the environment of the LIDAR Sensor Device based on the comparison between at least one detected infra-red image and at least one reference image.

In Example 12ai, the subject-matter of example 11ai can optionally include that the type of state in the environment of the LIDAR Sensor Device is one of fog, snow, rain, or dirt.

In Example 13ai, the subject-matter of any one of examples tai to 12ai can optionally include that the optical sensor array is a two-dimensional optical sensor array.

In Example 14ai, the subject-matter of any one of examples 1ai to 13ai can optionally include that the optical sensor array includes a charge-coupled sensor array or a complementary metal-oxide-semiconductor sensor array.

In Example 15ai, the subject-matter of any one of examples 1ai to 14ai can optionally include a camera. The optical sensor array may be a component of the camera.

In Example 16ai, the subject-matter of example 15ai can optionally include that the camera includes an infra-red filter to block light at least in a portion of the infra-red light wavelength region from hitting the optical sensor array.

In Example 17ai, the subject-matter of example 16ai can optionally include that the infra-red filter is configured to block light in the wavelength region from about 780 nm to about 2000 nm.

In Example 18ai, the subject-matter of any one of examples 15ai to 17ai can optionally include that the camera is configured to at least temporarily deactivate the infra-red filter to let infra-red light pass the infra-red filter to hit the optical sensor array.

In Example 19ai, the subject-matter of example 18ai can optionally include that the camera is configured to at least temporarily deactivate the infra-red filter to let infra-red light pass the infra-red filter to hit the optical sensor array in synchronization with an emission of light by an infra-red light source of the LIDAR Sensor Device.

In Example 20ai, the subject-matter of any one of examples 16ai to 19ai can optionally include that the infra-red filter is configured as a bandpass filter to let the wavelength region of the infra-red light emitted by an infra-red light source of the LIDAR Sensor Device pass and having a bandwidth of at maximum 5 nm around an upper limit and a lower limit of the wavelength region.

In Example 21ai, the subject-matter of example 20ai can optionally include that the wavelength region has a bandwidth of at maximum 50 nm around a center wavelength of the infra-red light emitted by an infra-red light source of the LIDAR Sensor Device.

In Example 22ai, the subject-matter of any one of examples 15ai to 21ai can optionally include a shutter. The LIDAR Sensor Device may include a shutter controller to open the shutter in synchronization with an emission of light by an infra-red light source of the LIDAR Sensor Device.

In Example 23ai, the subject-matter of any one of examples 1ai to 22ai can optionally include the infra-red light source.

In Example 24ai, the subject-matter of example 23ai can optionally include that the infra-red light source includes one or more laser light sources.

In Example 25ai, the subject-matter of example 24ai can optionally include that the infra-red light source includes one or more laser diodes.

In Example 26ai, the subject-matter of any one of examples 1ai to 25ai can optionally include a scanning LIDAR Sensor System.

In Example 27ai, the subject-matter of any one of examples 1ai to 26ai can optionally include a sensor including one or more photo diodes arranged to form a one dimensional array.

Example 28ai is a method of operating a LIDAR Sensor Device. The method may include an optical sensor array optically detecting infra-red light from a field of view to thereby detect one or more infra-red images. The method may further include comparing the detected one or more infra-red images with one or more reference images, each reference image describing a state of the LIDAR Sensor Device or a state in the environment of the LIDAR Sensor Device, to determine the state of the LIDAR Sensor Device and/or the state in the environment of the LIDAR Sensor Device.

In Example 29ai, the subject-matter of example 28ai can optionally include that the one or more detected infra-red images are one or more two-dimensional infra-red images.

In Example 30ai, the subject-matter of any one of examples 28ai or 29ai can optionally include that at least one detected infra-red image of the one or more infra-red images is a projection of infra-red light onto a two-dimensional surface.

In Example 31ai, the subject-matter of any one of examples 28ai to 30ai can optionally include that at least one reference image is simulated in accordance with a light emission of an infra-red light source of the LIDAR Sensor Device.

In Example 32ai, the subject-matter of any one of examples 28ai to 31ai can optionally include determining the state of the LIDAR Sensor Device and/or the state in the environment of the LIDAR Sensor Device based on the comparison between at least one detected infra-red image and at least one reference image.

In Example 33ai, the subject-matter of any one of examples 28ai to 32ai can optionally include that the state of the LIDAR Sensor Device is an alignment state of the LIDAR Sensor Device or a functional state of the LIDAR Sensor Device.

In Example 34ai, the subject-matter of example 33ai can optionally include determining whether an error is present in the alignment state of the LIDAR Sensor Device based on the comparison between at least one detected infra-red image and at least one reference image.

In Example 35ai, the subject-matter of example 34ai can optionally include that the error in the alignment state is a wrong angular orientation between an infra-red light source of the LIDAR Sensor Device and the optical sensor array.

In Example 36ai, the subject-matter of any one of examples 33ai to 35ai can optionally include determining whether a failure is present in the functional state of the LIDAR Sensor Device based on the comparison between at least one detected infra-red image and at least one reference image.

In Example 37ai, the subject-matter of example 36ai can optionally include that the failure is one of a failure of an infra-red light source of the LIDAR Sensor Device, a failure of a beam steering element of the LIDAR Sensor Device, or a failure of one or more optical components of the LIDAR Sensor Device.

In Example 38ai, the subject-matter of any one of examples 28ai to 37ai can optionally include determining the type of state in the environment of the LIDAR Sensor Device based on the comparison between at least one detected infra-red image and at least one reference image.

In Example 39ai, the subject-matter of example 38ai can optionally include that the type of state in the environment of the LIDAR Sensor Device is one of fog, snow, rain, or dirt.

In Example 40ai, the subject-matter of any one of examples 28ai to 39ai can optionally include that the optical sensor array is a two-dimensional optical sensor array.

In Example 41ai, the subject-matter of any one of examples 28ai to 40ai can optionally include that the optical sensor array includes a charge-coupled sensor array or a complementary metal-oxide-semiconductor sensor array.

In Example 42ai, the subject-matter of any one of examples 28ai to 41ai can optionally include a camera. The optical sensor array may be a component of the camera.

In Example 43ai, the subject-matter of example 42ai can optionally include that the camera includes an infra-red filter blocking light at least in a portion of the infra-red light wavelength region from hitting the optical sensor array.

In Example 44ai, the subject-matter of example 43ai can optionally include that the infra-red filter blocks light in the wavelength region from about 780 nm to about 2000 nm.

In Example 45ai, the subject-matter of any one of examples 43ai or 44ai can optionally include that the camera at least temporarily deactivates the infra-red filter to let infra-red light pass the infra-red filter to hit the optical sensor array.

In Example 46ai, the subject-matter of example 45ai can optionally include that the camera at least temporarily deactivates the infra-red filter to let infra-red light pass the infra-red filter to the optical sensor array in synchronization with an emission of light by an infra-red light source of the LIDAR Sensor Device.

In Example 47ai, the subject-matter of any one of examples 43ai to 46ai can optionally include that the infra-red filter is configured as a bandpass filter letting the wavelength region of the infra-red light emitted by an infra-red light source of the LIDAR Sensor Device pass and having a bandwidth of at maximum 5 nm around an upper limit and a lower limit of the wavelength region.

In Example 48ai, the subject-matter of example 47ai can optionally include that the wavelength region has a bandwidth of at maximum 50 nm around a center wavelength of the infra-red light emitted by an infra-red light source of the LIDAR Sensor System.

In Example 49ai, the subject-matter of any one of examples 42ai to 48ai can optionally include a shutter. The method may further include opening the shutter in synchronization with an emission of light by an infra-red light source of the LIDAR Sensor Device.

In Example 50ai, the subject-matter of any one of examples 28ai to 49ai can optionally include the infra-red light source.

In Example 51ai, the subject-matter of example 50ai can optionally include that the infra-red light source includes one or more laser light sources.

In Example 52ai, the subject-matter of example 51ai can optionally include that the infra-red light source includes one or more laser diodes.

In Example 53ai, the subject-matter of any one of examples 28ai to 52ai can optionally include a scanning LIDAR Sensor System.

In Example 54ai, the subject-matter of any one of examples 28ai to 53ai can optionally include a sensor including one or more photo diodes arranged to form a one dimensional array.

Example 55ai is a computer program product, including a is plurality of program instructions that may be embodied in non-transitory computer readable medium, which when executed by a computer program device of a LIDAR Sensor Device according to any one of examples 1ai to 27ai cause the LIDAR Sensor Device to execute the method according to any one of the examples 28ai to 54ai.

Example 56ai is a data storage device with a computer program that may be embodied in non-transitory computer readable medium, adapted to execute at least one of a method for LIDAR Sensor Device according to any one of the above method examples, a LIDAR Sensor Device according to any one of the above LIDAR Sensor Device examples.

An Advanced Driving Assistant System (ADAS) may rely on accurate recognition and assessment of the traffic environment in order to properly apply vehicle steering commands. The same may also apply for vehicles that drive (or will drive in the future) within the framework of higher SAE levels, such as level 4 (driverless in certain environment) or level 5 (fully autonomously). Detection and assessment of road conditions, traffic participants and other traffic-related objects may thus be required with a high reliability and within a short time frame.

In the framework of driving or autonomous driving, projection of infra-red and/or visible grid patterns on the road surface or onto other object surfaces may be provided for different applications. By way of example, the projected patterns may be used to detect non-uniformities of the road surface and/or to determine distances to other objects. As another example, pattern projection may be used for measuring the evenness of a road surface. In addition, beam steering commands may be provided using a holographic principle for GPS-based car navigation. As a further example visible and/or infra-red laser spots (e.g., point-dots or symbols, e.g. like circles, squares, rectangles, diamond-shaped etc.) may be provided for object recognition in front of a vehicle using standard camera-based triangulation methods. As a further example, structured light pattern may be provided for object recognition. As a further example, light pattern projection may be used for car parking. In some cases, the grid projection may use the same infra-red light that is used as part of a LIDAR collision avoidance system. One or more properties of the projected light patterns may be adjusted. By way of example, the projected patterns may differ in light intensity and/or light pattern (e.g., the projected light patterns may be intensity regulated). As another example, stochastically projected patterns may be employed. The stochastically projected patterns may be intensity regulated to ensure proper detection by a camera.

The pattern of such structured light may be computer generated and changed or adapted to the actual needs and/or generated and projected with stochastic pattern modes. As a further example, the intensity may be operated in a pulse-mode fashion. The projected patterns may be detected, for example, by an infra-red (IR) camera or by a regular camera.

A LIDAR sensing system may be pulsed stochastically or with certain pulse shapes, such that interfering signals or conflicting signals from extraneous light sources may be disregarded by the LIDAR sensing system. In principle, a LIDAR system may emit light in the infra-red wavelength region or in the visible wavelength region. In case a LIDAR system operates with infra-red light (e.g., with specific infra-red wavelengths, for example from about 830 nm to about 1600 nm), infra-red-sensitive LIDAR sensors and/or infra-red-sensitive cameras may be used. Background infra-red radiation, such as sun beams during day or other LIDAR beams, may pose a Signal-to-Noise-Ratio (SNR) problem and may limit the applicability and the accuracy of a LIDAR system. Night time conditions may be easier to handle. A dedicated infra-red-sensitive camera may for example be provided during night time. The infra-red sensitive-camera may provide detection of objects that may not be easily recognizable by means of a non-optimized regular is day-light-optimized camera.

Various embodiments may relate to structuring the infra-red light emitted by a LIDAR Sensor System (e.g., the LIDAR Sensor System 10) to project an infra-red light pattern (e.g., one or more infra-red light patterns). Data (e.g., information) may be encoded into the infra-red light pattern projected by the LIDAR Sensor System. Illustratively, the infra-red light emitted by the LIDAR Sensor System (or at least a portion of the infra-red light emitted by the LIDAR Sensor System) may be structured according to a pattern that encodes data therein. The LIDAR Sensor System may be configured to provide pattern projection in addition to LIDAR measurements (e.g., ranging measurements). A LIDAR signal (e.g., a scanning LIDAR laser beam) may be provided not only for conventional LIDAR functions (e.g., for ranging) but also for infra-red pattern projection. The projected infra-red light pattern may be detected and decoded to determine the data encoded therein. The projected infra-red light pattern may also be referred to as projected pattern or as projected light pattern.

A projected infra-red light pattern in the context of the present application may be described as an arrangement of light elements (e.g., light lines or light dots, such as laser lines or dots) having a structure (for example, a periodicity) in at least one direction (e.g., in at least one dimension). As described in further detail below, a projected infra-red light pattern may be, for example, a grid of vertical lines or a grid of dots. A pattern in the context of the present application may have a regular (e.g., periodic) structure, e.g. with a periodic repetition of a same light element, or a pattern may have an irregular (e.g., non-periodic) structure. As described in further detail below, a projected pattern may be a one-dimensional pattern, illustratively a pattern having a structure or a periodicity along one direction (e.g., along one dimension). A grid of vertical lines may be an example of one-dimensional pattern. Alternatively, a projected pattern may be a two-dimensional pattern, illustratively a pattern having a structure or a periodicity along two directions (e.g., along two dimensions, e.g. perpendicular to one another). A dot pattern, such as a grid of dots, or a QR-code-like pattern, or an image, or a logo may be examples of two-dimensional patterns.

In various embodiments, a LIDAR Sensor System may include a light emitting system configured to emit infra-red light towards a field of view. The LIDAR Sensor System may include one or more processors configured to encode data in a light emission pattern (illustratively, the one or more processors may be configured to provide or generate a signal or an instruction describing a light pattern to be emitted). The LIDAR Sensor System may include a light emitting controller configured to control the light emitting system to project an infra-red light pattern into the field of view in accordance with the data-encoded light emission pattern.

In various embodiments, a LIDAR Sensor System may include an optical sensor array configured to optically detect infra-red light from a field of view to thereby detect an infra-red light pattern. The LIDAR Sensor System may include one or more processors (e.g., one or more further processors) configured to decode the infra-red light pattern to determine data encoded in the infra-red light pattern by determining one or more properties of the infra-red light pattern.

The LIDAR Sensor System 10 shown schematically in FIG. 1 may be an embodiment of the LIDAR Sensor System described herein.

The LIDAR Sensor System 10 may be included (e.g., integrated or embedded) into a LIDAR Sensor Device 30, for example a housing, a vehicle, a vehicle headlight. By way of example, the LIDAR Sensor System 10 may be configured as a scanning LIDAR Sensor System 10.

In various embodiments, one or more processors of a LIDAR system (e.g., of the LIDAR Sensor System 10) may be configured as a data encoder, e.g. the one or more processors may be included in or configured as the LIDAR Data Processing System 60 or the LIDAR Sensor Management System 90. The one or more processors may be configured to generate or to is provide an infra-red light pattern representation (illustratively, a digital signal representing a pattern to be emitted). The infra-red light pattern representation may be generated according to the data to be encoded in the projected pattern. Illustratively, the light emission pattern or the infra-red light pattern representation may describe or define one or more properties of the projected infra-red light pattern (illustratively, of the infra-red light pattern to be projected). The one or more properties may be associated with the data encoded or to be encoded in the projected infra-red light pattern, as described in further detail below.

In various embodiments, a light emitting controller of a LIDAR system (e.g., of the LIDAR Sensor System 10) may be or may be configured as the Light Source Controller 43, or the light emitting controller may be part of the Light Source Controller 43. The light emitting controller may be configured to control one or more components of the light emitting system (e.g., a light source 42 and/or a beam steering element, described in further detail below) to emit light in accordance with the light emission pattern (e.g., with the infra-red light pattern representation). Illustratively, the light emitting controller may be configured to control the light emitting system such that the infra-red light pattern projected by the light emitting system corresponds to the pattern described by the light emission pattern or by the infra-red light pattern representation.

In various embodiments, a light emitting system of a LIDAR system (e.g., of the LIDAR Sensor System 10) may be or may be configured as the First LIDAR Sensing System 40, or the light emitting system may be part or a component of the First LIDAR Sensing System 40.

The light emitting system may be configured or controlled to scan the field of view with the emitted light (e.g., for ranging measurements and for pattern projection). The light emitting system may be configured or controlled to emit light in accordance with a predefined emission pattern, as described in further detail below. Illustratively, the light emitting system may be configured or controlled to emit a light according to a pattern (e.g., one-dimensional or two-dimensional, e.g. a pattern having a periodicity or a structure into one direction or into two directions). The scan may be performed along a scanning direction (e.g., a scanning direction of the LIDAR Sensor System). The scanning direction may be a direction perpendicular to the direction along which an illuminated region extends. The scanning direction may be the horizontal direction or the vertical direction (illustratively, the scanning direction may be perpendicular to a direction along which the optical axis of the LIDAR Sensor System 10 is aligned). By way of example a regular LIDAR sensor measurement may be carried out in one scan sweep.

A LIDAR pattern projection (e.g., a projection of individually recognizable vertical laser lines) may be carried out in another scan sweep, as described in further detail below. The projections may be repeated a plurality of times for providing a reliable LIDAR scanning and a recognizable LIDAR pattern projection (for example of vertical lines or horizontal lines).

The light emitting system may include one or more controllable components for emitting light towards the field of view (e.g., for emitting a ranging signal and/or for projecting a pattern), as described in further detail below.

In various embodiments, the light emitting system may include a (e.g., first) light source, e.g. the light source 42. The light source 42 may be configured to emit light, e.g. infra-red light. The light source 42 may be configured to emit light having a predefined wavelength, for example to emit light in the infra-red range (for example in the range from about 700 nm to about 2000 nm, for example in the range from about 860 nm to about 1600 nm, for example at about 905 nm or at about 1550 nm). Illustratively, the light source 42 may be an infra-red light source 42. The light source 42 may be configured to emit light in a continuous manner or it may be configured to emit light in a pulsed manner (e.g., to emit one or more light pulses, such as a sequence of laser pulses).

By way of example, the light source 42 may be configured to emit laser light. The (e.g., infra-red) light source 42 may include one or more laser light sources (e.g., configured as the laser source 5902 described, for example, in relation to FIG. 59). The one or more laser light sources may include at least one laser diode, e.g. one or more laser diodes (e.g., one or more edge emitting laser diodes and/or one or more vertical cavity surface emitting laser diodes).

By way of example, the light source 42 may include a plurality of partial light sources, illustratively a plurality of individual light sources (e.g., a plurality of light emitting diodes or laser diodes). The plurality of partial light sources may form an array (e.g., one-dimensional or two-dimensional). As an example, the plurality of partial light sources may be arranged along one direction to form a one-dimensional array. As another example, the plurality of partial light sources may be arranged along two directions to form a two-dimensional array. The emission of the light sources may be controlled (for example, column wise or pixel wise) such that scanning of the field of view may be carried out. A two-dimensional array of partial light sources may provide a two-dimensional scan of the field of view (illustratively, a scan along two directions, e.g. perpendicular to one another) and/or the emission of a two-dimensional pattern.

The projection (e.g., the emission) of a light pattern may include controlling one or more partial light sources to emit light and one or more other partial light sources to not emit light. Illustratively, a light pattern may be emitted by defining or selecting a pattern of partial light sources to emit light. Further illustratively, the partial light sources may be switched on and off to create the intended pattern (for example, a line pattern or a dot pattern). The on- and off-cycle may be controlled by the light emitting controller (or by the LIDAR Sensor Management system 90, or by the light emitting controller in communication with the LIDAR Sensor Management system 90), for example in accordance with a corresponding input received from a vehicle management system and/or a camera management system.

As another example, additionally or alternatively, the light emitting system may include a (e.g., first) beam steering element (e.g., the Light scanner 41 or as part of the Light scanner 41), for example a MEMS mirror or an optical phased array. As an example, the LIDAR Sensor System 10 may be configured as a mirror-based scanning LIDAR system, such as a MEMS-based LIDAR system. The beam steering element may be configured or controlled to control a direction of emission towards the field of view of the infra-red light emitted by the light source 42. Illustratively, the beam steering element may be configured (e.g., arranged) to receive light from the light source 42. The beam steering element may be configured or controlled to scan the field of view with the light received from the light source 42 (e.g., to sequentially direct the light received from the light source 42 towards different portions of the field of view). The projection (e.g., the emission) of a light pattern may include controlling the beam steering element to direct the emitted light towards a portion of the field of view for projecting the pattern therein (e.g., to sequentially illuminate parts of the field of view according to the pattern to be projected). The beam steering element may be configured to be tilted around one axis (e.g., the beam steering element may be a 1D-MEMS) or around two axes (e.g., the beam steering element may be a 2D-MEMS).

In various embodiments, the light emitting system may include a plurality of beam steering elements, e.g., the beam steering element and a further beam steering element (e.g., a further MEMS mirror or a further optical phased array), illustratively in a 2-mirror-scan setting. The further beam steering element may be, for example, a further Light scanner 41 or a further part of the Light scanner 41. The plurality of beam steering elements may be controlled to provide a scan and/or a pattern projection in the field of view in more than one direction, for example in two directions (e.g., the horizontal direction and the vertical direction). Illustratively, the further beam steering element may be configured or controlled to control a direction of emission towards the field of view of the infra-red light emitted by the light source 42 in a different direction compared to the (first) beam steering element.

The (first) beam steering element may be configured or controlled to control a direction of emission towards the field of view of the infrared light emitted by the light source 42 in a first direction (e.g., the horizontal direction). The (second) further beam steering element may be configured or controlled to control a direction of emission towards the field of view of the infra-red light emitted by the light source 42 in a second direction (e.g., the vertical direction). The first direction may be different from the second direction (e.g., perpendicular to the first direction). Illustratively, the beam steering element and the further beam steering element may be configured to scan the field of view along different directions. The beam steering element and the further beam steering element may provide a two-dimensional scan of the field of view and/or the emission of a two-dimensional pattern.

In an exemplary configuration, the scanning system may include two MEMS mirrors (e.g., two 1D-MEMS). The two separate MEMS-mirrors may work together to scan the environment (illustratively, the field of view) with a single laser spot or a spot/dot pattern. This configuration may be used for regular LIDAR scan beams and for pattern projection (e.g., subsequently or simultaneously). The two-dimensional scan method may provide the projection of a complex (e.g., two-dimensional) pattern.

In various embodiments, the light emitting system may include a plurality of light sources (e.g., a plurality of different or disjunct LIDAR light sources), e.g., the (e.g., first) light source 42 and a further (e.g., second) light source. The further light source may be used for a different application compared to the light source 42. By way of example, the light source 42 may be used for pattern projection and the further light source may be used for LIDAR measurements, or vice versa. The LIDAR beams provided by different light sources may be directed to a common emitter path. Illustratively, the LIDAR beam for pattern projection may be coupled into the regular optical path by using an optical component, such as a dichroic mirror or a polarized beam splitter (PBS). The same optical system (e.g., the same emitter optics arrangement) may be used for the LIDAR measurement and the pattern projection.

The plurality of light sources may have at least one different property from one another (e.g., a different optical property, e.g. different property or beam characteristic of the emitted light). By way of example, the further light source may have a different configuration compared to the light source 42, e.g. the light source 42 and the further light source may have different optical properties (e.g., the respective emitted light or emitted laser beam may have different properties). The further light source may have at least one property (e.g., at least one beam characteristic) different from the light source 42. By way of example, the different property may be a wavelength (illustratively, the wavelength of the emitted light, for example the light source 42 may emit light at 905 nm and the further light source may emit light at 1550 nm). As another example, the different property may be a polarization (for example the light source 42 may emit light having linear polarization and the further light source may emit light having circular polarization). As a further example, the different property may be an intensity (for example the light source 42 may emit light having higher intensity compared to the light emitted by the further light source). As a further example, the different property may be a beam spread (e.g., the light source 42 may emit more collimated light compared to the further light source). As a further example, the different property may be a beam modulation (e.g., the light source 42 may emit light having a different phase or a different amplitude compared to the further light source). Illustratively, the property may be selected from a group of properties including or consisting of a wavelength, a polarization, an intensity, a beam spread, and a beam modulation.

The light sources having different beam characteristics may provide the sequential or simultaneous emission of regular LIDAR beams for measurement purposes and of LIDAR beams for pattern projection (e.g., image projection). Regular beam emission for measurement purposes may be carried out simultaneously with the beam emission for pattern projection, at least for some use cases. Illustratively, the use of light sources having different properties may provide a reduced crosstalk or interference between the ranging measurement and the pattern projection. By way of example, in case the two LIDAR beams (for ranging and pattern projection) have different wavelength (or different polarization), the detecting optical sensor array (e.g., as part of a detecting camera) may be equipped with an infra-red filter to block the wavelength (or the polarization) of the regular LIDAR beam (e.g., the infra-red wavelength of the regular infra-red beam), as described in further detail below. The infra-red filter may let pass the wavelength (or the polarization) of the pattern projection beam. Additionally or alternatively, optical components in front of the optical sensor array (e.g., at an entrance side of the camera) may also be provided.

In various embodiments, the regular LIDAR pulse measurements (e.g., scans or sweeps) and LIDAR pattern projection may be carried out in the same field of view (e.g., within the same field of illumination). Alternatively, the regular LIDAR pulse measurements and the LIDAR pattern projection may be carried out in separate field of view portions or segments, as described in further detail below.

The field of view into which the light emitting system projects the infra-red light pattern (also referred to as field of view for pattern projection, or pattern projection field of view) may be or correspond to a (e.g., entire) field of illumination of the light emitting system (e.g., of the light source 42). Said field of view may be or substantially correspond to a field of view of the LIDAR Sensor System 10 (e.g., an angular range in which the LIDAR Sensor System 10 may emit light and/or from which the LIDAR Sensor System 10 may receive light, e.g. reflected from one or more objects). The field of view may be a scene detected at least in part by means of the LIDAR Sensor System 10. The field of view may be or substantially correspond to a field of view of an optical sensor array of the LIDAR Sensor System 10, described in further detail below. The vertical and horizontal field of view of the LIDAR Sensor System 10 may fulfill one or more requirements, such that not only distant objects but also nearby traffic participants as well as the road surface in front of a vehicle may be measured and checked.

Alternatively, the field of view for pattern projection may be or correspond to a portion (e.g., a percentage smaller than 100%, for example 70% or 50%) of the entire field of illumination of the light emitting system (e.g., a portion of the field of view of the LIDAR Sensor System 10). For example, in case the pattern projection is on the road in close vicinity of a vehicle, not the entire field of view may be used for such pattern projection, but only a certain percentage of the vertical or horizontal field of view. Illustratively, the field of view for ranging may be or correspond to the entire field of view of the LIDAR Sensor System 10, and the field of view for pattern projection may be a smaller portion of the field of view of the LIDAR Sensor System 10.

The portion of field of view for pattern projection (e.g., its location within the field of view and/or its size) may be adjusted, e.g. dynamically, for example according to a current traffic situation or to the position of one or more objects in the field of view. As an example, the pattern projection field of view may be changed or adapted in accordance with the movement of a marked object (e.g., an object onto which the infra-red light pattern is projected, for example a marked vehicle), as described in further detail below. Illustratively, in case a marked vehicle is leaving the field of view for pattern projection, a feedback may be provided to the light emitting controller (e.g., to the LIDAR Sensor Management system 90, for example by a camera-object-recognition system), to change field of view settings.

In various embodiments, a segmentation of the field of view is may be provided, e.g. the LIDAR Sensor System 10 may be configured as a multi-segmented scanning system as described in relation to FIG. 89 to FIG. 97.

The field of view (e.g., the field of illumination of the light emitting system) may be segmented into a plurality of portions or zones (e.g., a plurality of illumination zones along the horizontal direction and/or along the vertical direction, e.g. along a direction perpendicular to the scanning direction). Illustratively, at a same coordinate in one direction (e.g., the horizontal direction), the field of view may be segmented into a plurality of zones along another direction (e.g., along the vertical direction).

Different zones may be provided or used for different purposes (e.g., for LIDAR measurement or LIDAR pattern projection). Illustratively, at a same coordinate in the first (e.g., horizontal) direction, a regular LIDAR beam may be emitted at a different coordinate in the second (e.g., vertical) direction compared to a coordinate at which LIDAR pattern projection is carried out. This may be carried out, for example, time-sequentially with a regular LIDAR scan, or in a simultaneous sweep scan. In case a simultaneous sweep scan is carried out, the zone that is used for LIDAR pattern projection may be a zone not directly adjacent to a zone segment that is used for a regular LIDAR sweep. As an example, at least one non-used zone may be provided between the two zones. This may provide reducing interference between ranging measurement and pattern projection.

The zones (e.g., the assigned function) may be selected on a stochastic basis. Any combination of zones and segments may be used. For example, the pattern may be projected using the zone placed on top, and the regular LIDAR scan may be provided in one of the zones underneath. As another example, a regular LIDAR scan may be provided in two zones (e.g., the top zone and the bottom zone), and the pattern projection may be provided in the two inner zones. Other combinations may be possible and the use of more than one zone for the same function may also be possible.

The segmentation may be provided, for example, by means of the structural properties of a multi-lens array (MLA). Illustratively, the multi-lens array may create a plurality of virtual light sources emitting light towards a respective portion or segment of the field of view. The light emitting system may include the multi-lens array. The multi-lens array may be arranged downstream of the light source 42, or downstream of the beam steering element (e.g., of the scanning MEMS). As an example, the beam steering element may be arranged between the light source 42 and the multi-lens array. The segmentation may be provided, additionally or alternatively, with a targeted ON/OFF switching of the partial light sources (e.g., laser diodes), e.g. of the partial light sources associated with a respective zone of the multi-lens array (e.g., a respective MLA-zone).

In various embodiments, the projected infra-red pattern may include at least one segmented pattern element (e.g., a plurality of segmented pattern elements), e.g. at least one segmented line (e.g., a segmented vertical line). Illustratively, the projected infra-red pattern may include at least one pattern element including a plurality of segments (e.g., line segments). The light emitting controller may be configured to control the light emitting system to emit light to project one or more of the segments of the segmented pattern element (or of each segmented pattern element).

The segmentation of the field of view may provide a reduced power consumption. Illustratively, light may be emitted or projected only in the relevant illumination zones. Subsequent scans may use different zone segments (e.g., activating another partial light source or group of partial light sources associated with a respective MLA-zone). By way of example, the subsequently activated partial light source or group of partial light sources may be one that is not directly adjacent to the previously used partial light source or group of partial light sources (e.g., the subsequent MLA-zone may be a zone not adjacent to the previously used MLA-zone). This may provide a reduced or eliminated cross-talk at neighboring sensors, and may increase the Signal to Noise (SNR) ratio.

In an exemplary scenario, a vertical laser line may be a continuous (e.g., non-segmented) line or may be a line which is split into a plurality of segments, e.g. four segments. A plurality of individually addressable illumination zones may be used to project the vertical laser line into the field of view. One or more of the segments may be dedicated to pattern projection (e.g., the lowest zone and the respective line segment). In case a segmented vertical scan line is provided, it may be possible that not the entire line is projected and used all the time. For each scan a line segment may be used.

In various embodiments. The regular LIDAR measurement and the LIDAR pattern projection may be carried out in a time sequential manner (e.g., one after the other). Regular LIDAR sensing functions (e.g., the emission of regular vertical scan lines) and LIDAR pattern projection may be performed sequentially using the same light emitting system. Illustratively, LIDAR measurements may be time sequentially interchanged or interlaced with LIDAR pattern projection.

The light emitting controller may be configured to control the light emitting system to project the infra-red light pattern at predefined time intervals (e.g., periodic time intervals). Illustratively, a LIDAR pattern projection may be carried out periodically after a certain time interval (e.g., regularly spaced or irregularly spaced time intervals). The timing of the pattern projection may be in accordance (e.g., in synchronization) with an image acquisition, e.g. with the framerate of the optical sensor array (e.g., of a camera including the optical sensor array). The time intervals assigned to pattern projection (e.g., the start time and the duration) may be synchronized with the framerate of the optical sensor array. The light emitting controller may be configured to control the light emitting system to project the infra-red light pattern in synchronization with the framerate of the optical sensor array. Illustratively, the infra-red light pattern may be projected when the optical sensor array is imaging the field of view to detect the projected pattern. As an example, the infra-red light pattern may be projected for a time duration corresponding to the exposure time of the optical sensor array. By way of example, the frame rate may be in a range from about 30 Hz (e.g., corresponding to a time interval of about 33.3 ms) to about 60 Hz (e.g., corresponding to a time interval of about 16.6 ms). The frame rate may be higher (e.g., up to 1 kHz or higher than 1 kHz) in case more sophisticated equipment is employed.

In various embodiments, the exposure time of the optical sensor array (e.g., of the camera) may be adjusted in accordance with the pattern projection (e.g., the exposure time of the optical sensor array may be controlled in synchronization with the projection of an infra-red light pattern by the light emitting system). As an example, the LIDAR Sensor System 10 may include an optical sensor array controller configured to control the exposure time of the optical sensor array (or the one or more processors may be configured to implement such control function). As a further example, the LIDAR Sensor System 10 (e.g., the camera in which the optical sensor array is included) may include a shutter configured (e.g., controllable) to control the exposure time of the optical sensor array (e.g., controlled by an associated shutter controller).

By way of example, the optical sensor array (e.g., the camera) may have an exposure time equal to the half period used for scanning the field of view, e.g. half the period of a scan of the field of view (e.g., in case ranging and pattern projection are carried out sequentially in the entire field of view of the LIDAR Sensor System 10). Only as a numerical example, an exposure time of 250 μs may be used in case the MEMS scan frequency is 2 kHz. The exposure time may also be shorter than the half period of a used scanning system. In this case, the pattern projection may be distributed over different scan cycles of the beam steering element (e.g., of the MEMS mirror).

As an example, the camera (e.g., in which the optical sensor array may be included) may represent an imaging device configured to provide 2D images (e.g. color images). The camera may be part of the sensor system (e.g., of a LIDAR system) of a partially or fully automated driving vehicle used for scene understanding. The camera images may be used as part of the object recognition, object classification and scene understanding process, e.g. carried out by one or more processors of a sensor fusion box. The camera may include an infra-red filter configured to block infra-red light other than the used LIDAR laser wavelengths, and configured to let through visible light. This configuration may provide that the color measurement of the camera may be only minimally affected and at the same time the detector may be fully sensitive to the emitted LIDAR light. A camera will be described in further detail below.

In a further example, two synchronized camera systems may be used (e.g., two synchronized optical sensor arrays). Each of the camera systems may be configured to detect the projected pattern. The pattern recognition of each camera system may then be combined (e.g., in a sensor fusion box). This configuration may provide an even more reliable pattern detection, for example even under inclement conditions.

The sequential projection method may provide, for example, avoiding unwanted interferences between the LIDAR pattern projecting beams and the LIDAR measurements (e.g., the own LIDAR measurement, for example carried out by a vehicles own LIDAR system). As another example, such a sequential projection method may provide avoiding unwanted interferences (e.g., at the electronics level) between the regular scanning beams and the optical sensor array (e.g., the infra-red camera sensor system). Illustratively, the synchronization described above may provide that the optical sensor array images the field of view when no ranging signal is emitted by the LIDAR Sensor System 10.

In various embodiments, the projected infra-red light pattern may include one or more pattern elements (e.g., one or more lines, such as vertical or horizontal lines, one or more dots). The data-encoded light emission pattern (and/or the light emission pattern representation) may define or describe one or more properties of the pattern elements. As an example, the data-encoded light emission pattern may define an arrangement of the one or more pattern elements (e.g., how the pattern elements may be spatially arranged, for example in one direction or in two directions). As another example, the data-encoded light emission pattern may define an intensity of the one or more pattern elements (only as an example, a low intensity element may correspond to a "0" and a high intensity element may correspond to a "1", analogous to digital communication). As a further example, the data-encoded light emission pattern may define a number of pattern elements (e.g., a pattern including a first number of elements may be associated with a different meaning compared to a pattern including a second number of elements). As a further example, the data-encoded light emission pattern may define a distance between adjacent pattern elements, e.g. a spacing between adjacent pattern elements (only as an example, a small spacing between adjacent elements may correspond to a "0" and a large spacing may correspond to a "1"). Illustratively, the one or more properties may be selected or defined in accordance with the data to be encoded in the projected pattern. The one or more properties may be varied over time, e.g. to encode different data or information. By way of example, varying the intensity may provide a flash mode, or encoding information, or highlighting certain pattern elements (e.g., lines) with higher intensity that may be detected by the optical sensor array (e.g., the optical sensor array have a higher sensitivity in certain parts of the array, for example of the CCD chip array).

The properties of the projected pattern, e.g. the properties of the one or more pattern elements, may be used to decode the data encoded in the pattern. Illustratively, the one or more processors (e.g., or further one or more processors) may be configured to associate a meaning (e.g., data) to the properties of the projected pattern (e.g., detected by means of the optical sensor array, e.g. to a digital signal representing the detected pattern).

By way of example, a projected pattern may be or include a grid pattern of vertical and/or horizontal lines. The grid pattern may have an arbitrary shape. As another example, the projected pattern may be a dot pattern (e.g., including a plurality of dots, for example arranged in a grid like configuration). As a further example, the projected pattern may be a symbol, such as a dot, a circle, a square, a barcode, or a QR-code. The structure of the projected pattern (e.g., the arrangement of the pattern elements) may encode information, e.g. may be a representation of information (e.g., a representation of a sequence of zeros (0) and ones (1), as used in digital communication). By way of example, a barcode like or QR-code like projected pattern (e.g., a pattern having a barcode signature or QR-code signature) may have a high signal content or information content. Illustratively, a barcode like or QR-code like pattern may have a pattern structure that may encode further information (e.g., additional information with respect to a different type of pattern).

In various embodiments, the projected pattern (e.g., the properties of the pattern elements) may be adapted taking into consideration LIDAR Sensor System-external conditions, for example taking into consideration a vehicle condition. By way of example, the projected pattern may be modified (with respect to size, distortion, intensity, spacing between adjacent pattern elements or other characteristics defining the pattern) as a function of the vehicle speed of one's own car, of the speed of another car, of the acceleration, of the direction of movement, of the distance to other objects, of a traffic condition, or of a level of danger.

In an exemplary scenario, the light emitting system (e.g., the LIDAR infra-red laser) may be triggered in such a way that a (e.g., steady) pattern of vertical lines may be projected. The vertical lines may be projected onto a surface (e.g. a substantially flat surface such as the street, or onto a tilted surface like exterior parts of a vehicle or another traffic object) or onto other objects as a pattern of grid lines. The lines may be equidistant or the line to line distance may vary throughout the grid. The line-to-line distance may be adjusted over time, for example for encoding information. The intensity of the line pattern or of certain grid lines may be changed, for example for providing a flash mode, or for encoding information, or to highlight certain lines with higher intensities. Illustratively, the pattern may be projected as to display a barcode-like signature for communicating (digital) information.

In various embodiments, various type of data or information may be encoded in the projected pattern. The encoded information may be recognizable by the LIDAR Sensor System 10 (e.g., by a vehicles own LIDAR system or camera system), but also by another LIDAR system, e.g., by the LIDAR or camera system of another vehicle (illustratively, configured as the LIDAR system or camera system described herein) or of a traffic control station. The other vehicle and/or the traffic control station may also be equipped to provide their own pattern projection. This may provide a communication between various traffic participants. Illustratively, the pattern projection may provide vehicle to vehicle (V2V) and/or vehicle to environment (V2X) communication, for example communication with a preceding car and/or with following cars (e.g., in case a rear LIDAR Sensor System and camera system is provided), for example in a platooning driving arrangement. In an exemplary scenario, the projection of one vehicle may be picked up by the camera of another one and vice versa, in case both vehicles are equipped with a system as described herein. The pattern pickup may be combined with subsequent image recognition, classification and/or encryption processes.

Each projection may include a start-up sequence (e.g. a communication initiating sequence) of predefined images or patterns, e.g. LIDAR Sensor System-specific or vehicle specific projected patterns (illustratively, patterns that are known and may be related to a system default projection). This may provide differentiating between the projected own information and a projected external information.

As an example, the projected pattern may encode vehicle related or traffic related information, such as a current GPS location, a current SAE level, or other useful information. As another example, the projected pattern may encode a traffic related message, e.g. with a standardized meaning, such as STOP or GIVE WAY. As a further example, the projected pattern may encode a color (e.g., a traffic color, such as red, yellow, or green), for example by using a predefined grid line distance or intensity or symbol sequences that provide a color encoding.

In various embodiments, the light emitting controller may be configured to control the light emitting system to project the infra-red light pattern at a predefined location in the field of view. The infra-red light pattern may be projected at a predefined location in the field of view, for example at a predefined distance from the LIDAR Sensor System 10 (e.g., the light emitting controller may be configured to control the light emitting system to project the infra-red light pattern at a predefined location in the field of view). The pattern may be projected, for example, at a distance ranging from a few meters up to about 10 m or 15 m, or even up to longer distances in case of higher laser intensity and/or higher detector sensitivity (e.g., higher camera sensitivity). Illustratively, the projection method may be used to display easily recognizable patterns in the vicinity of a vehicle. The distance from the vehicle at which the pattern is projected may be determined taking into consideration the properties of the system, for example on the LIDAR laser settings (e.g., intensity and focus) and/or the detector settings (e.g., the infra-red camera settings).

In various embodiments, the light emitting controller may be configured to control the light emitting system to project the infra-red light pattern onto a two-dimensional surface. By way of example, the infra-red light pattern may be projected onto the street to display an encoded message therein. As another example, the infra-red light pattern may be projected onto an object (e.g., a moveable object, such as a vehicle, or an immobile object, such as a traffic sign), for example for marking the object, as described in further detail below.

In various embodiments, the pattern projection may be used to assist an object recognition process. The pattern projection described herein may provide or support improved (e.g., quicker or more reliable) object recognition, for example in case a distributed object recognition architecture is implemented (e.g., in case a first object recognition is performed already on sensor-level, as described in relation to FIG. 167 to FIG. 168C).

The one or more processors may be configured to implement one or more object recognition processes (and/or one or more object classification or object tracking processes). Illustratively, the one or more processors may be configured to carry out object recognition of an object detected by means of a regular LIDAR measurement. The LIDAR Sensor System 10 (e.g., the one or more processors) may be configured to provide respective bounding boxes to the recognized objects. The light emitting controller may be configured to control the light emitting system to project the infra-red light pattern onto at least one recognized object. The LIDAR Sensor System 10 may be configured to provide the determined information (e.g., the bounding boxes) to the camera's processing and analyzing devices. The camera's processing and analyzing devices may, for example, run further object classification procedures to distinguish between different classes of objects (e.g. cars, trucks, buses, motorbikes, etc.).

The infra-red light pattern (e.g., a line pattern, such as a vertical line, or a symbol, such as a dot, a square or a bar code) may be projected onto an object (for example, an already recognized object), e.g. onto the surface of another car, such as on the rear surface of a preceding car. The data encoded in the projected infra-red light pattern may include data associated with said object (e.g., may be an identifier for the object, or may describe properties of the object such as velocity or direction of motion). Illustratively, an object may be tagged with an associated pattern (e.g., a car may be tagged with a car-individual symbol). As an example, an object may be tagged with a corresponding bounding box delineating the object position and size (e.g., the projected pattern may be a bounding box, for example adapted to the object properties).

The object position (e.g., the vehicle position) may be determined from LIDAR measurements and/or from camera measurements, for example by processing both sensor data by a sensor fusion system (e.g., part of the LIDAR Data Processing System 60). This may provide proper evaluation of the target object position and its angular position with respect to the LIDAR Sensor System 10 (e.g., the target vehicle position with respect to the information sending vehicle).

A subsequent (e.g., further) object recognition process may identify and track such a marked object (illustratively, such tagged object). The marking may be used to follow the marked object over time. The projected pattern may be changed as a function of the object properties (e.g., varying over time), e.g. vehicle speed (own car, foreign car), distance to other objects, danger level, and the like. Simultaneous marking of multiple objects may be provided.

In various embodiments, the optical sensor array (e.g., the infra-red camera) may pick up the projected identification pattern. The one or more processors may be configured to relate the tagged object unambiguously (e.g., for object tracking), for example a tagged car. In case the tagged object (e.g., the tagged vehicle) changes its position, the optical sensor array may detect the movement of the projected pattern and may provide this information back to the one or more processors (e.g., to the LIDAR Data Processing system 60).

In various embodiments, the light emitting controller may be is configured to control the light emitting system to project the infra-red light pattern in accordance with a movement of the object onto which the pattern is projected. Illustratively, the light emitting controller may be configured to control the light emitting system to follow the object with the projected pattern while the objects move within the field of view. The one or more processors may be configured to carry out one or more object tracking processes to track the movement of the object onto which the infra-red light pattern is projected (e.g., in combination with additional data, such as data from a camera sensor).

The tagging method may be provided for double-checking of proper object identification and/or to steer (e.g., align, move, focus) a moveable and adjustable detection system, e.g. camera system (for example for following the identified object, e.g. vehicle, vehicle over time). Once an object (e.g., a vehicle) is tagged or once a bounding box is allocated to the respective object, the information may be used to enable proper continuation of the tagging process. The one or more processors may be configured to carry out the one or more object recognition processes based, at least in part, on the data encoded in the pattern projected onto the object. Illustratively, the one or more processors may use the projected pattern (e.g., the object identifier or the object properties encoded therein) to confirm the results of an object recognition process, or as starting point for a subsequent object recognition process.

In case, an object may not be properly recognized (e.g., in case the object recognition process does not provide a sufficient level of accuracy, e.g. a confidence level above a predefined threshold), for example in case no clear or unambiguous object recognition may be obtained (e.g., in case of low contrast or bad SNR), the LIDAR Sensor System 10 may project a predefined beam pattern onto such object (e.g., the camera system may request the projection of such pattern). The pattern may be recognized by the optical sensor array and used to identify and classify such an object with higher reliability and accuracy.

In various embodiments, the projected infra-red light pattern may be detected and analyzed, as described above. The information determined by means of the analysis may be used for implementing control functions, for example for vehicle steering. As an example, the information may be provided via a feedback loop to a vehicle control system. The vehicle control system may provide vehicle related information to one or more image processing and control devices (e.g., associated with the camera) to provide control functions (e.g., camera control functions).

At the receiver side, the LIDAR Sensor System 10 may include an optical sensor array (e.g., the optical sensor array 16906 described in relation to FIG. 169A to FIG. 169G). The optical sensor array may be configured to optically detect infra-red light from the field of view (e.g., from the field of view for pattern projection). Illustratively, the optical sensor array may be configured to image the field of view to detect the infra-red light present therein. The optical sensor array may be configured to detect infra-red light from the field of view to thereby detect an infra-red light pattern (e.g., one or more infra-red light patterns). Illustratively, the optical sensor array may be configured to detect infra-red light from the field of view in such a way that one or more infra-red light patterns may be detected (e.g., imaged). Further illustratively, the optical sensor array may be configured to detect infra-red light from the field of view in such a way that the infra-red light pattern projected by the light emitting system (e.g., in a scan of the field of view) may be detected. The infra-red light detected from the field of view may be used to determine the state of the LIDAR Sensor Device (30) and/or the state in the environment of the LIDAR Sensor Device (30).

The optical sensor array may be configured to provide two-dimensional resolution (e.g., resolution in the horizontal direction and in the vertical direction). The optical sensor array may be a two-dimensional optical sensor array. By way of example, the optical sensor array may include one or more detector pixels arranged along two directions to form the two-dimensional array. As another example, the optical sensor array may include or be formed by a plurality of individual detector pixels (e.g., spatially separated from one another).

Illustratively, the optical sensor array may include a plurality of optical sensor arrays (e.g., sub arrays). The plurality of optical sensor arrays may have a same field of view or a different field of view. By way of example, at least a first optical sensor sub array may have the same field of view as a second optical sensor sub array. As another example, at least a first optical sensor sub array may have a field of view different (e.g., non-overlapping, or partially overlapping) from the field of view of a second optical sensor sub array. The field of view of the optical sensor array may be the combination (e.g., the superposition) of the individual fields of view of the plurality of optical sensor sub arrays.

The optical sensor array may be or may include an array of photodetectors (e.g., a two-dimensional array of photodetectors), e.g. photodetectors sensitive in the infra-red wavelength range. By way of example, the optical sensor array may be or may include a charge coupled device (CCD), e.g. a charge coupled sensor array. As another example, the optical sensor array may be or may include a complementary metal oxide semiconductor (CMOS) sensor array. The CMOS sensor array may provide higher sensitivity in the near infra-red wavelength range compared to the CCD sensor array. As a further example, the optical sensor array may be or may include an array of InGaAs based sensors (e.g., of InGaAs based photodetectors). The InGaAs based sensors may have high sensitivity at 1550 nm (e.g., higher sensitivity than CCD or CMOS at that wavelength).

In various embodiments, the optical sensor array may be a component of a camera (e.g., an infra-red camera) of the LIDAR Sensor System 10 (e.g., included in the Camera System 81). Illustratively, the LIDAR Sensor System 10 may include a camera which includes the optical sensor array. The camera may be configured to image the field of view (e.g., the field of view may be or substantially correspond to a field of view of the camera). By way of example, the camera may be a CCD camera. As another example, the camera may be a CMOS camera.

The camera may include an infra-red filter to block light at least in a portion of the infra-red light wavelength region (e.g., in the wavelength region from about 780 nm to about 2000 nm) from hitting the optical sensor array. Illustratively, the infra-red filter may be configured or controlled to block infra-red light used for ranging from impinging onto the optical sensor array (e.g., to block light emitted by the further light source).

By way of example, the infra-red filter may be dynamically controllable (e.g., may be dynamically activated or de activated). The camera (e.g., a camera controller) may be configured to at least temporarily deactivate the infra-red filter to let infra-red light pass the infra-red filter to hit the optical sensor array. The de-activation of the infra-red filter may be in accordance (e.g., in synchronization) with the projection of the infra-red light pattern by the light emitting system. Illustratively, the camera may be configured to at least temporarily deactivate the infra-red filter such that the optical sensor array may detect the light emitted by the light source 42 within a certain time window (e.g., during a scan of the field of view for pattern projection).

As another example, the infra-red filter may be a bandpass filter configured in accordance with the wavelength of the infra-red light used for pattern projection. Illustratively, the infra-red filter may be configured as a bandpass filter to let the wavelength region of the infra-red light used for pattern projection pass.

In the following, various aspects of this disclosure will be illustrated:

Example 1aj is a LIDAR Sensor System. The LIDAR Sensor System may include a light emitting system configured to emit infra-red light towards a field of view. The LIDAR Sensor System may include one or more processors configured to encode data in a light emission pattern. The LIDAR Sensor System may include a light emitting controller configured to control the light emitting system to project an infra-red light pattern into the field of view in accordance with the data encoded light emission pattern.

In Example 2aj, the subject-matter of example 1aj can optionally include that the light emitting controller is configured to control the light emitting system to project the infra-red light pattern at a predefined location in the field of view.

In Example 3aj, the subject-matter of any one of examples 1aj or 2aj can optionally include that the light emitting controller is configured to control the light emitting system to project the infra-red light pattern onto a two-dimensional surface.

In Example 4aj, the subject-matter of any one of examples 1aj to 3aj can optionally include that the projected infra-red light pattern is a one-dimensional infra-red light pattern or a two-dimensional infra-red light pattern.

In Example 5aj, the subject-matter of any one of examples 1aj to 4aj can optionally include that the data-encoded light emission pattern defines one or more properties of one or more pattern elements of the projected infra-red light pattern. The one or more properties may include an arrangement of the one or more pattern elements, an intensity of the one or more pattern elements and/or a number of pattern elements and/or a distance between adjacent pattern elements.

In Example 6aj, the subject-matter of any one of examples 1aj to 5aj can optionally include that the light emitting controller is configured to control the light emitting system to emit the infra-red light pattern at predefined time intervals.

In Example 7aj, the subject-matter of any one of examples 1aj to 6aj can optionally include that the light emitting controller is configured to control the light emitting system to project the infra-red light pattern in synchronization with the framerate of an optical sensor array of the LIDAR Sensor System.

In Example 8aj, the subject-matter of any one of examples 1aj to 7aj can optionally include that the light emitting system includes an infra-red light source configured to emit infra-red light.

In Example 9aj, the subject-matter of example 8aj can optionally include that the infra-red light source includes a plurality of partial light sources arranged to form a one-dimensional array or arranged to form a two-dimensional array.

In Example 10aj, the subject-matter of any one of examples 8aj or 9aj can optionally include that the infra-red light source includes one or more laser diodes.

In Example 11 aj, the subject-matter of any one of examples 8aj to 10aj can optionally include that the light emitting system includes a further light source. The further light source may have at least one property different from the infra-red light source. The property may be selected from a group of properties consisting of a wavelength, a polarization, an intensity, a beam spread, and a beam modulation.

In Example 12aj, the subject-matter of any one of examples 8aj to 11aj can optionally include that the light emitting system includes a beam steering element configured to control a direction of emission towards the field of view of the infra-red light emitted by the infra-red light source.

In Example 13aj, the subject-matter of example 12aj can optionally include that the light emitting system includes a further beam steering element. The beam steering element may be configured to control the direction of emission towards the field of view of the infra-red light emitted by the infra-red light source in a first direction. The further beam steering element may be configured to control the direction of emission towards the field of view of the infra-red light emitted by the infra-red light source in a second direction, different from the first direction.

In Example 14aj, the subject-matter of any one of examples 1aj to 13aj can optionally include that the projected infra-red pattern includes at least one segmented pattern element including a plurality of segments.

In Example 15aj, the subject-matter of any one of examples 1aj to 14aj can optionally include that the light emitting system includes a multi-lens array.

In Example 16aj, the subject-matter of any one of examples 1aj to 15aj can optionally include that the infra-red light pattern is projected onto an object. The data encoded in the projected infra-red light pattern may include data associated with said object.

In Example 17aj, the subject-matter of example 16aj can optionally include that the light emitting controller is configured to control the light emitting system to project the infra-red light pattern in accordance with a movement of the object onto which the pattern is projected.

In Example 18aj, the subject-matter of any one of examples 1aj to 17aj can optionally include that the one or more processors are configured to carry out one or more object recognition processes. The light emitting controller may be configured to control the light emitting system to project the infra-red light pattern onto at least one recognized object.

In Example 19aj, the subject-matter of any one of examples 1aj to 18aj can optionally include that the data encoded in the project infrared light pattern include vehicle-related information and/or traffic-related information.

Example 20aj is a LIDAR Sensor System. The LIDAR Sensor System may include an optical sensor array configured to optically detect infra-red light from a field of view to thereby detect an infra-red light pattern. The LIDAR Sensor System may include one or more processors configured to decode the infra-red light pattern to determine data encoded in the infrared light pattern by determining one or more properties of the infra-red light pattern.

In Example 21aj, the subject-matter of example 20aj can optionally include that the infra-red light pattern includes one or more pattern elements. The one or more properties of the infra-red light pattern may include an arrangement of the one or more pattern elements, an intensity of the one or more pattern elements and/or a number of pattern elements and/or a distance between adjacent pattern elements.

In Example 22aj, the subject-matter of any one of examples 20aj or 21aj can optionally include that the optical sensor array is a two-dimensional optical sensor array.

In Example 23aj, the subject-matter of any one of examples 20aj to 22aj can optionally include that the optical sensor array includes a charge-coupled sensor array or a complementary metal-oxide-semiconductor sensor array.

In Example 24aj, the subject-matter of any one of examples 20aj to 23aj can optionally include an optical sensor array controller configured to control an exposure time of the optical sensor array. The exposure time of the optical sensor array may be controlled in synchronization with a projection of an infra-red light pattern by a light emitting system of the LIDAR Sensor System.

In Example 25aj, the subject-matter of example 24aj can optionally include that the exposure time of the optical sensor array is equal to or smaller than half the period of a scan of the field of view of the LIDAR Sensor System.

In Example 26aj, the subject-matter of any one of examples 20aj to 24aj can optionally include a camera. The optical sensor array may be a component of the camera.

In Example 27aj, the subject-matter of example 26aj can optionally include that the camera includes an infra-red filter to block light at least in a portion of the infra-red light wavelength region from hitting the optical sensor array.

In Example 28aj, the subject-matter of any one of examples 20aj to 27aj can optionally include that the projected infra-red light pattern is a one-dimensional infra-red light pattern or a two-dimensional infra-red light pattern.

In Example 29aj, the subject-matter of any one of examples 20aj to 28aj can optionally include that the emitted infra-red light pattern is projected onto an object. The data encoded in the projected infra-red light pattern may include data associated with said object.

In Example 30aj, the subject-matter of example 29aj can optionally include that the one or more processors are configured to carry out one or more object recognition processes based, at least in part, on the data encoded in the pattern projected onto the object.

In Example 31aj, the subject-matter of any one of examples 29aj or 30aj can optionally include that the one or more processors are configured to carry out one or more object tracking processes to track the movement of the object onto which the infra-red light pattern is projected.

In Example 32aj, the subject-matter of any one of examples 20aj to 31aj can optionally include that the data encoded in the project infrared light pattern include vehicle-related information and/or traffic-related information.

In Example 33aj, the subject-matter of any one of examples 1aj to 32aj can optionally include that the LIDAR Sensor System is configured as a scanning LIDAR Sensor System.

Example 34aj is a vehicle, including a LIDAR Sensor System according to any one of examples 1aj to 33aj.

Example 35aj is a method of operating a LIDAR Sensor System. The method may include a light emitting system emitting infra-red light towards a field of view. The method may include encoding data in a light emission pattern. The method may include projecting an infra-red light pattern into the field of view in accordance with the data encoded light emission pattern.

In Example 36aj, the subject-matter of example 35aj can optionally include projecting the infra-red light pattern at a predefined location in the field of view.

In Example 37aj, the subject-matter of any one of examples 35aj or 36aj can optionally include projecting the infra-red light pattern onto a two-dimensional surface.

In Example 38aj, the subject-matter of any one of examples 35aj to 37aj can optionally include that the projected infra-red light pattern is a one-dimensional infra-red light pattern or a two-dimensional infra-red light pattern.

In Example 39aj, the subject-matter of any one of examples 35aj to 38aj can optionally include that the data-encoded light emission pattern defines one or more properties of one or more pattern elements of the projected infra-red light pattern. The one or more properties may include an arrangement of the one or more pattern elements, an intensity of the one or more pattern elements and/or a number of pattern elements and/or a distance between adjacent pattern elements.

In Example 40aj, the subject-matter of any one of examples 35aj to 39aj can optionally include emitting the infra-red light pattern at predefined time intervals.

In Example 41aj, the subject-matter of any one of examples 35aj to 40aj can optionally include projecting the infra-red light pattern in synchronization with the framerate of an optical sensor array of the LIDAR Sensor System.

In Example 42aj, the subject-matter of any one of examples 35aj to 41aj can optionally include that the light emitting system includes an infra-red light source emitting infra-red light.

In Example 43aj, the subject-matter of example 42aj can optionally include that the infra-red light source includes a plurality of partial light sources arranged to form a one-dimensional array or arranged to form a two-dimensional array.

In Example 44aj, the subject-matter of any one of examples 42aj or 43aj can optionally include that the infra-red light source includes one or more laser diodes.

In Example 45aj, the subject-matter of any one of examples 42aj to 44aj can optionally include that the light emitting system includes a further light source. The further light source may have at least one property different from the infra-red light source. The property may be selected from a group of properties consisting of a wavelength, a polarization, an intensity, a beam spread, and a beam modulation.

In Example 46aj, the subject-matter of any one of examples 42aj to 45aj can optionally include that the light emitting system includes a beam steering element controlling a direction of emission towards the field of view of the infra-red light emitted by the infra-red light source.

In Example 47aj, the subject-matter of example 46aj can optionally include that the light emitting system includes a further beam steering element. The beam steering element may control the direction of emission towards the field of view of the infra-red light emitted by the infra-red light source in a first direction. The further beam steering element may control the direction of emission towards the field of view of the infra-red light emitted by the infra-red light source in a second direction, different from the first direction.

In Example 48aj, the subject-matter of any one of examples 35aj to 47aj can optionally include that the projected infra-red pattern includes at least one segmented pattern element including a plurality of segments.

In Example 49aj, the subject-matter of any one of examples 35aj to 48aj can optionally include that the light emitting system includes a multi-lens array.

In Example 50aj, the subject-matter of any one of examples 35aj to 49aj can optionally include that the infra-red light pattern is projected onto an object. The data encoded in the projected infra-red light pattern include data associated with said object.

In Example 51aj, the subject-matter of example 50aj can optionally include projecting the infra-red light pattern in accordance with a movement of the object onto which the pattern is projected.

In Example 52aj, the subject-matter of any one of examples 35aj to 51aj can optionally include carrying out one or more object recognition processes. The method may further include projecting the infra-red light pattern onto at least one recognized object.

In Example 53aj, the subject-matter of any one of examples 35aj to 52aj can optionally include that the data encoded in the project infrared light pattern include vehicle-related information and/or traffic-related information.

Example 54aj is a method of operating LIDAR Sensor System. The method may include an optical sensor array optically detecting infra-red light from a field of view to thereby detect an infra-red light pattern. The method may include decoding the infra-red light pattern to determine data encoded in the infra-red light pattern by determining one or more properties of the infra-red light pattern.

In Example 55aj, the subject-matter of example 54aj can optionally include that the infra-red light pattern includes one or more pattern elements. The one or more properties of the infra-red light pattern may include an arrangement of the one or more pattern elements, an intensity of the one or more pattern elements and/or a number of pattern elements and/or a distance between adjacent pattern elements.

In Example 56aj, the subject-matter of any one of examples 54aj or 55aj can optionally include that the optical sensor array is a two-dimensional optical sensor array.

In Example 57aj, the subject-matter of any one of examples 54aj to 56aj can optionally include that the optical sensor array includes a charge-coupled sensor array or a complementary metal-oxide-semiconductor sensor array.

In Example 58aj, the subject-matter of any one of examples 54aj to 57aj can optionally include controlling an exposure time of the optical sensor array. The exposure time of the optical sensor array may be controlled in synchronization with a projection of an infra-red light pattern by a light emitting system of the LIDAR Sensor System.

In Example 59aj, the subject-matter of example 58aj can optionally include that the exposure time of the optical sensor array is equal to or smaller than half the period of a scan of the field of view of the LIDAR Sensor System.

In Example 60aj, the subject-matter of any one of examples 54aj to 58aj can optionally include a camera. The optical sensor array may be a component of the camera.

In Example 61aj, the subject-matter of example 60aj can optionally include that the camera includes an infra-red filter blocking light at least in a portion of the infra-red light wavelength region from hitting the optical sensor array.

In Example 62aj, the subject-matter of any one of examples 54aj to 61aj can optionally include that the projected infra-red light pattern is a one-dimensional infra-red light pattern or a two-dimensional infra-red light pattern.

In Example 63aj, the subject-matter of any one of examples 54aj to 62aj can optionally include that the emitted infra-red light pattern is projected onto an object. The data encoded in the projected infra-red light pattern include data associated with said object.

In Example 64aj, the subject-matter of example 63aj can optionally include carrying out one or more object recognition processes based, at least in part, on the data encoded in the pattern projected onto the object.

In Example 65aj, the subject-matter of any one of examples 63aj or 64aj can optionally include carrying out one or more object tracking processes to track the movement of the object onto which the infra-red light pattern is projected.

In Example 66aj, the subject-matter of any one of examples 54aj to 65aj can optionally include that the data encoded in the project infrared light pattern include vehicle-related information and/or traffic-related information.

In Example 67aj, the subject-matter of any one of examples 35aj to 66aj can optionally include that the LIDAR Sensor System is configured as a scanning LIDAR Sensor System.

Example 68aj is a computer program product, including a plurality of program instructions that may be embodied in non-transitory computer readable medium, which when executed by a computer program device of a LIDAR Sensor System according to any one of examples 1aj to 33aj cause the LIDAR Sensor System to execute the method according to any one of the examples 35aj to 67aj.

Example 69aj is a data storage device with a computer pros gram that may be embodied in non-transitory computer readable medium, adapted to execute at least one of a method for LIDAR Sensor System according to any one of the above method examples, a LIDAR Sensor System according to any one of the above LIDAR Sensor System examples.

CONCLUSION

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific advantageous embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The above-described embodiments can be implemented in any of numerous ways. The embodiments may be combined in any order and any combination with other embodiments. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device (e.g. LIDAR Sensor Device) not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various disclosed concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various advantageous concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the disclosure above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the eighth edition as revised in July 2010 of the United States Patent Office Manual of Patent Examining Procedures, Section 2111.03

For the purpose of this disclosure and the claims that follow, the term "connect" has been used to describe how various elements interface or "couple". Such described interfacing or coupling of elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

In the context of this description, the terms "connected" and "coupled" are used to describe both a direct and an indirect connection and a direct or indirect coupling.

Appendix: Explanations and Glossary

This section provides some explanations and descriptions of certain aspects and meanings of the referenced technical terms, but are not limiting in their understanding.

Actuators

Actuators are components or devices which are able to convert energy (e.g. electric, magnetic, photoelectric, hydraulic, pneumatic) into a mechanical movement (e.g. translation, rotation, oscillation, vibration, shock, pull, push, etc.). Actuators may be used for example in order to move and/or change and/or modify components such as mechanical elements, optical elements, electronic elements, detector elements, etc. and/or materials or material components. Actuators can also be suited to emit, for example, ultrasound waves, and so on.

ASIC

An Application-Specific Integrated Circuit (ASIC) is an integrated circuit device, which was designed to perform particular, customized functions. As building blocks, ASICs may comprise a large number of logic gates. In addition, ASICs may comprise further building blocks such as microprocessors and memory blocks, forming so-called Systems-on-Chip (SOC).

Automated Guided Vehicle (AGV)

An automated guided vehicle or automatic guided vehicle (AGV) is a robot that follows markers or wires in the floor, or uses vision, magnets, or lasers for navigation. An AGV can be equipped to operate autonomously.

Autonomous Vehicle (AV)

There are numerous terms, which are currently in use to describe vehicles with a certain extent of automatic driving capability. Such vehicles are capable to perform—without direct human interaction—at least some of the activities, which previously could be performed only by a human driver. According to SAE International (Society of Automotive Engineers), six levels of automation can be defined (SAE J3016), starting with Level 0 (where automated systems issue warnings or may momentarily intervene) up to Level 5 (where no human interaction is required at all).

An increasing number of modern vehicles is already equipped with so-called Advanced Driver-Assistance Systems (ADAS), which are configured to help the driver during the driving process or to intervene in specific driving situations. Such systems may comprise basic features such as anti-lock braking systems (ABS) and electronic stability controls (ESC), which are usually considered as Level 0 features, as well as more complex features, such as lane departure warning, lane keep assistant, lane change support, adaptive cruise control, collision avoidance, emergency break assistant and adaptive high-beam systems (ADB), etc., which may be considered as Level 1 features. Levels 2, 3 and 4 features can be denoted as partial automation, conditional automation and high automation, respectively. Level 5 finally, can be denoted as full automation.

Alternative and widely used terms for Level 5 are driverless cars, self-driving cars or robot cars. In case of industrial applications, the term Automated Guided Vehicle (AGV) is widely used to denote vehicles with partial or full automation for specific tasks like for example material transportation in a manufacturing facility or a warehouse. Furthermore, also Unmanned Aerial Vehicles (UAV) or drones may exhibit different levels of automation. Unless otherwise stated, the term "Autonomous Vehicle (AV)" is considered to comprise, in the context of the present patent application, all the above mentioned embodiments of vehicles with partial, conditional, high or full automation.

Beacon

A Beacon is a device that emits signal data for communication purposes, for example based on Bluetooth or protocols based on DIIA, THREAD, ZIGBee or MDSIG technology. A Beacon can establish a Wireless Local Area Network.

Beam Steering

Generally speaking, the light beam emitted by the light source may be transmitted into the Field of Illumination (FOI) either in a scanning or a non-scanning manner. In case of a non-scanning LIDAR (e.g. Flash LIDAR), the light of the light source is transmitted into the complete FOI in one single instance, i.e. the light beam is broadened (e.g. by a diffusing optical element) in such a way that the whole FOI is illuminated at once.

Alternatively, in case of a scanning illumination, the light beam is directed over the FOI either in a 1-dimensional manner (e.g. by moving a vertical light stripe in a horizontal direction, or vice versa) or in a 2-dimensional manner (e.g. by moving a light spot along a zigzag pattern across the FOI). To perform such beam steering operations both mechanical and non-mechanical solutions are applicable.

Mechanical solutions may comprise rotating mirrors, oscillating mirrors, in particular oscillating micro-electro-mechanical mirrors (MEMS), Digital Mirror Devices (DMD), Galvo-Scanner, etc. The moving mirrors may have plane surface areas (e.g. with circular, oval, rectangular or polygonal shape) and may be tilted or swiveled around one or more axes. Non-mechanical solutions may comprise so called optical phased arrays (OPA) in which the phases of light waves are varied by dynamically controlling the optical properties of an adjustable optical element (e.g. phase modulators, phase shifters, Liquid Crystal Elements (LCD), etc.).

Blurriness

In the context of the present application, the term "blurriness" is may be used to describe an effect associated with the framerate (illustratively, the rate at which subsequent frames or images are acquired). "Blurriness" may be an effect of low-framerate, which may result in a visual effect on sequences of images preventing an object to be perceived clearly or sharply. Illustratively, an object may appear hazy or indistinct in a blurred image.

Communication Interface

Communication interface describes all sorts of interfaces or gateways between two devices, which can be used to exchange signals. Signals in this context may comprise simple voltage or current levels, as well as complex information based on the above described coding or modulation techniques.

In case of a LIDAR Sensor System, communication interfaces may be used to transfer information (signals, data, etc.) between different components of the LIDAR Sensor System. Furthermore, communication interfaces may be used to transfer information (signals, data, etc.) between the LIDAR Sensor System or its components or modules and other devices provided in the vehicle, in particular other sensor systems (LIDAR, RADAR, Ultrasonic, Cameras) in order to allow sensor fusion functionalities.

Communication Unit (CU)

A communication unit is an electronic device, which is configured to transmit and/or receive signals to or from other communication units. Communication units may exchange information in a one-directional, bi-directional or multi-directional manner. Communication signals may be exchanged via electromagnetic waves (including radio or microwave frequencies), light waves (including UV, VIS, IR), acoustic waves (including ultrasonic frequencies). The information may be exchanged using all sorts of coding or modulation techniques e.g. pulse width modulation, pulse code modulation, amplitude modulation, frequency modulation, etc.

The information may be transmitted in an encrypted or non-encrypted manner and distributed in a trusted or distrusted network (for example a Blockchain ledger). As an example, vehicles and elements of road infrastructure may comprise CUs in order to exchange information with each other via so-called C2C (Car-to-Car) or C2X (Car-to-Infrastructure or Car-to-Environment). Furthermore, such communication units may be part of Internet-of-Things (IoT) Systems, i.e. a network of devices, sensors, vehicles, and other appliances, which connect, interact and exchange data with each other.

Component

Component describes the elements, in particular the key elements, which make up the LIDAR System. Such key elements may comprise a light source unit, a beam steering unit, a photodetector unit, ASIC units, processor units, timing clocks, generators of discrete random or stochastic values, and data storage units. Further, components may comprise optical elements related to the light source, optical elements related to the detector unit, electronic devices related to the light source, electronic devices related to the beam steering unit, electronic devices related to the detector unit and electronic devices related to ASIC, processor and data storage and data executing devices. Components of a LIDAR Sensor System may further include a high-precision clock, a Global-Positioning-System (GPS) and an inertial navigation measurement system (IMU).

Computer Program Device

A Computer program device is a device or product, which is able to execute instructions stored in a memory block of the device or which is able to execute instructions that have been transmitted to the device via an input interface. Such computer program products or devices comprise any kind of computer-based system or software-based system, including processors, ASICs or any other electronic device which is capable to execute programmed instructions. Computer program devices may be configured to perform methods, procedures, processes or control activities related to LIDAR Sensor Systems.

Confidence Level

In the context of the present application, the term "confidence level" may be used to describe a parameter, e.g. a statistical parameter, representing an evaluation of a correct identification and/or classification of an object, for example in an image. Illustratively, a confidence level may represent an estimate for a correct identification and/or classification of an object. The confidence level may be related to the accuracy and precision of an algorithm.

Control and Communication System

A Control and Communication System receives input from the LIDAR Data Processing System and communicates with the LIDAR Sensing System, LIDAR Sensor Device and vehicle control and sensing system as well as with other objects/vehicles.

Controlled LIDAR Sensor System

Controlled LIDAR Sensor System comprises one or many controlled "First LIDAR Sensor Systems", and/or one or many controlled "Second LIDAR Sensor Systems", and/or one or many controlled LIDAR Data Processing Systems, and/or one or many controlled LIDAR Sensor Devices, and/or one or many controlled Control and Communication Systems.

Controlled means local or remote checking and fault detection and repair of either of the above-mentioned LIDAR Sensor System components. Controlled can also mean the control of a LIDAR Sensor Device, including a vehicle.

Controlled can also mean the inclusion of industry standards, bio feedbacks, safety regulations, autonomous driving levels (e.g. SAE Levels) and ethical and legal frameworks.

Controlled can also mean the control of more than one LIDAR Sensor System, or more than one LIDAR Sensor Device, or more than one vehicle and/or other objects.

A Controlled LIDAR Sensor System may include the use of artificial intelligent systems, data encryption and decryption, as well as Blockchain technologies using digital records that store a list of transactions (called "blocks") backed by a cryptographic value. Each block contains a link to the previous block, a timestamp, and data about the transactions that it represents. Blocks are immutable, meaning that they can't easily be modified once they're created. And the data of a blockchain are stored non-locally, i.e. on different computers.

A Controlled LIDAR Sensor System may be configured to perform sensor fusion functions, such as collecting, evaluating and consolidating data from different sensor types (e.g. LIDAR, RADAR, Ultrasonic, Cameras). Thus, the Controlled LIDAR Sensor System comprises feedback- and control-loops, i.e. the exchange of signals, data and information between different components, modules and systems which are all employed in order to derive a consistent understanding of the surroundings of a sensor system, e.g. of a sensor system onboard a vehicle.

Crosstalk/Sensor Crosstalk

Crosstalk (also referred to as "sensor crosstalk") may be understood as a phenomenon by which a signal transmitted on or received by one circuit or channel (e.g., a sensor pixel) creates an undesired effect in another circuit or channel (e.g., in another sensor pixel).

Data Analysis

Various components (e.g. detectors, ASIC) and processes (like Signal/Noise measurement and optimization, fusion of various other sensor signals like from other LIDAR Sensors Systems, Radar, Camera or ultrasound measurements)) are provided as being necessary to reliably measure backscattered LIDAR signals and derive information regarding the recognition of point clouds and subsequent object recognition and classification. Signals and data may be processed via Edge-Computing or Cloud-Computing systems, using corresponding Communication Units (CUs). Signals and data may be transmitted for that matter in an encrypted manner.

For increased data security and data permanence, further provisions may be taken such as implementation of methods based on Blockchain or smart contracts. Data security can also be enhanced by a combination of security controls, measures and strategies, singly and/or in combination, applied throughout a system's "layers", including human, physical, endpoint, network, application and data environments.

Data analysis may benefit using data deconvolution methods or other suited methods that are known in imaging and signal processing methods, including neuronal and deep learning techniques.

Data Analytics

Data analytics shall encompass hardware, software and methods to analyze data in order to obtain information like, distance to an object, object classification, object morphology. In LIDAR sensing, an object can be a vehicle, house, bridge, tree, animal, and so on, as described above. Data analytics can be connected to a computerized control system. All data can be encrypted. Data analytics and processing can use Blockchain methods for data persistence, confidence and security.

Data Usage

LIDAR generated data sets can be used for the control and steering of vehicles (e.g. cars, ships, planes, drones), including remote control operations (e.g. parking operations or operations executed for example by an emergency officer in a control room). The data sets can be encrypted and communicated (C2C, C2X), as well as presented to a user (for example by HUD or Virtual/Augmented Reality using wearable glasses or similar designs). LIDAR Systems can also be used for data encryption purposes.

Data Usage may also comprise using methods of Artificial Intelligence (AI), i.e. computer-based systems or computer implemented methods which are configured to interpret transmitted data, to learn from such data based on these interpretations and derive conclusions which can be implemented into actions in order to achieve specific targets. The data input for such AI-based methods may come from LIDAR Sensor Systems, as well as other physical or biofeedback sensors (e.g. Cameras which provide video streams from vehicle exterior or interior environments, evaluating e.g. the line of vision of a human driver). AI-based methods may use algorithms for pattern recognition. Data Usage, in general, may employ mathematical or statistical methods in order to predict future events or scenarios based on available previous data sets (e.g. Bayesian method). Furthermore, Data Usage may include considerations regarding ethical questions (reflecting situations like for example the well-known "trolley dilemma").

Data Storage and Executing Device

A data storage and Executing Device is a device which is able to record information or data, e.g. using binary or hexadecimal codes. Storage devices may comprise semiconductor or solid-state devices which can be configured to store data either in a volatile or in a non-volatile manner. Storage devices may be erasable and reprogrammable.

Storage devices comprise cloud-based, web-based, network-based or local type storage devices, for example in order to enable edge computing. As example, data storage device may comprise hard disks, RAMs or other common data storage units such as USB storage devices, CDs, DVDs, computer memories, floppy discs, optical discs, magnetic tapes, flash memories etc.

Detector

A Detector is a device which is able to provide an output signal (to an evaluation electronics unit) which is qualitatively or quantitatively correlated to the presence or the change of physical (or chemical) properties in its environment. Examples for such physical properties are temperature, pressure, acceleration, brightness of light (UV, VIS, IR), vibrations, electric fields, magnetic fields, electromagnetic fields, acoustic or ultrasound waves, etc. Detector devices may comprise cameras (mono or stereo) using e.g. light-sensitive CCD or CMOS chips or stacked multilayer photodiodes, ultrasound or ultrasonic detectors, detectors for radio waves (RADAR systems), photodiodes, temperature sensors such as NTC-elements (i.e. a thermistor with negative temperature coefficient), acceleration sensors, etc.

A photodetector is a detection device, which is sensitive with respect to the exposure to electromagnetic radiation. Typically, light photons are converted into a current signal upon impingement onto the photosensitive element. Photosensitive elements may comprise semiconductor elements with p-n junction areas, in which photons are absorbed and converted into electron-hole pairs. Many different detector types may be used for LIDAR applications, such as photo diodes, PN-diodes, PIN diodes (positive intrinsic negative diodes), APD (Avalanche Photo-Diodes), SPAD (Single Photon Avalanche Diodes), SiPM (Silicon Photomultipliers), CMOS sensors (Complementary metal-oxide-semiconductor, CCD (Charge-Coupled Device), stacked multilayer photodiodes, etc.

In LIDAR systems, a photodetector is used to detect (qualitatively and/or quantitatively) echo signals from light which was emitted by the light source into the FOI and which was reflected or scattered thereafter from at least one object in the FOI. The photodetector may comprise one or more photosensitive elements (of the same type or of different types) which may be arranged in linear stripes or in two-dimensional arrays. The photosensitive area may have a rectangular, quadratic, polygonal, circular or oval shape. A photodetector may be covered with Bayer-like visible or infrared filter segments.

Digital Map

A digital map is a collection of data that may be used to be formatted into a virtual image. The primary function of a digital map is to provide accurate representations of measured data values. Digital mapping also allows the calculation of geometrical distances from one object, as represented by its data set, to another object. A digital map may also be called a virtual map.

Energy-Efficient Sensor Management

Some LIDAR-related business models may deal with methods of energy-efficient sensor management, which may comprise methods to efficiently generate LIDAR sampling signals as well as methods to efficiently receive, detect and process LIDAR sampling signals. Efficient methods to generate LIDAR sampling signals may include techniques which are configured to minimize the emission of radiation, for example in order to comply with eye-safety standards regarding other road users but also in order to avoid inadvertent disturbances and detriments to animals (which are known to be sensitive to IR radiation and partially also to light polarization).

Efficient methods to receive, detect and process LIDAR sampling signals include efficient methods for data storage and data handling, for example to reduce required storage capacities and computing times. Efficient data storage may also comprise solutions for data backups, data and information security (e.g. limited access authorization), as well as Black-Box Recording. Such solutions may utilize methods such as data encryption, Blockchain, etc. Energy-efficient sensor management further includes methods of sensor fusion, feedback loops, networking and communication (intra-vehicular and extra-vehicular).

Electronic Devices

Electronic devices denotes all kinds of electronics components or electronic modules, which may be used in a LIDAR Sensor System in order to facilitate its function or improve its function. As example, such electronic devices may comprise drivers and controllers for the light source, the beam steering unit or the detector unit. Electronic devices may comprise all sorts of electronics components used in order to supply voltage, current or power. Electronic devices may further comprise all sorts of electronics components used in order to manipulate electric or electronic signals, including receiving, sending, transmitting, amplifying, attenuating, filtering, comparing, storing or otherwise handling electric or electronic signals.

In a LIDAR system, there may be electronic devices related to the light source, electronic devices related to the beam steering unit, electronic devices related to the detector unit and electronic devices related to ASIC and processor units. Electronic devices may comprise also Timing Units, Positioning Units (e.g. actuators), position tracking units (e.g. GPS, Geolocation, Indoor-Positioning Units, Beacons, etc.), communication units (WLAN, radio communication, Bluetooth, BLE, etc.) or further measurement units (e.g. inertia, accelerations, vibrations, temperature, pressure, position, angle, rotation, etc.).

Field of Illumination

The term Field of Illumination (FOI) relates to the solid angle sector into which light can be transmitted by the LIDAR light source (including all corresponding downstream optical elements). The FOI is limited along a horizontal direction to an opening angle $\alpha\alpha_H$ and along a vertical direction to an opening angle $\alpha\alpha_V$. The light of the LIDAR light source may be transmitted into the complete FOI in one single instance (non-scanning LIDAR) or may be transmitted into the FOI in a successive, scanning manner (scanning LIDAR).

Field of View

The term Field of View (FOV) relates to the solid angle sector from which the LIDAR detector (including all corresponding upstream optical elements) can receive light signals. The FOV is limited along a horizontal direction to an opening angle $alpha_H$ and along a vertical direction to an opening angle $alpha_V$.

Flash LIDAR Sensor System

A LIDAR Sensor System where the angular information (object recognition) about the environment is gained by using an angularly sensitive detector is usually called a Flash LIDAR Sensor System.

Frame (Physical Layer)

In the context of the present application the term "frame" may be used to describe a logical structure of a signal (e.g., an electrical signal or a light signal or a LIDAR signal, such as a light signal). Illustratively, the term "frame" may describe or define an arrangement (e.g., a structure) for the content of the frame (e.g., for the signal or the signal components). The arrangement of content within the frame may be configured to provide data or information. A frame may include a sequence of symbols or symbol representations. A symbol or a symbol representation may have a different meaning (e.g., it may represent different type of data) depending on its position within the frame. A frame may have a predefined time duration. Illustratively, a frame may define a time window, within which a signal may have a predefined meaning. By way of example, a light signal configured to have a frame structure may include a sequence of light pulses representing (or carrying) data or information. A frame may be defined by a code (e.g., a signal modulation code), which code may define the arrangement of the symbols within the frame.

Gateway

Gateway means a networking hardware equipped for interfacing with another network. A gateway may contain devices such as protocol translators, impedance matching devices, rate converters, fault isolators, or signal translators as necessary to provide system interoperability. It also requires the establishment of mutually acceptable administrative procedures between both networks. In other words, a gateway is a node on a network that serves as a 'gate' or entrance and exit point to and from the network. In other words, a node is an active redistribution and/or communication point with a unique network address that either creates, receives or transmits data, sometimes referred to as a 'data node'.

Hybrid LIDAR Sensor System

A LIDAR Sensor Systems may use a so-called Flash-Pulse-System or a Scan-Pulse-System. A combination of both systems is usually called a Hybrid LIDAR Sensor System.

Human Machine Interaction (HMI)

For Human-Machine Interactions (HMI), for example the interaction between a vehicle and a driver, it might be necessary to process data and information such that they can be provided as graphical representations or in other forms of visualizations, e.g. HUD or methods of Augmented Reality (AR) or Virtual Reality (VR). Biofeedback systems, which may evaluate biological parameters such as fatigue, dizziness, increased heartbeat, nervousness, etc., may be included into such Human-Machine Interaction systems. As an example, a biofeedback system may detect that the driver of a vehicle shows signs of increased fatigue, which are evaluated by a central control unit, finally leading to a switchover from a lower SAE level to a higher SAE level.

LIDAR-Based Applications (in General)

LIDAR Sensor Systems may be used for a variety of applications, like distance measurement (ranging), object detection and recognition, 3-mapping, automotive applications, driver monitoring, gesture recognition, occupancy sensor, air quality monitoring (gas sensor, interior & exterior), robotics (like Automatic Guided Vehicles), wind velocity measurement, communication, encryption and signal transfer.

LIDAR-Based Applications for Vehicles

LIDAR-generated data sets can be used for the control and to steering of vehicles (e.g. cars, ships, planes, drones), including basic and advanced driver-assistance systems (ADAS), as well as the various levels of autonomous vehicles (AV). Furthermore, LIDAR-systems can be used also for many different functions, which are focused to the interior of a vehicle. Such functions may comprise driver or passenger monitoring functions, as is well as occupancy-detection systems, based for examples on methods such as eye-tracking, face recognition (evaluation of head rotation or tilting), measurement of eye-blinking events, etc. LIDAR Sensor Systems thus can be mounted both externally and internally of a vehicle, and they can be integrated into optical systems like headlights and other vehicle lighting parts which may be found at different locations at a vehicle (front, back, side, corner, interior). LIDAR sensors can also be used for the conversion of IR-radiation into visible light using luminescent or phosphorescent materials.

LIDAR IR-functions and other optical wavelength emitters can be combined electrically, mechanically and optically onto a joint substrate or into a common module and work in conjunction with each other. LIDAR data sets can be encrypted and communicated (C2C, C2X), as well as presented to a user (for example by HUD or Virtual/Augmented Reality using for examples wearable glasses or other suitable devices). LIDAR Systems can also be used for data encryption purposes themselves. LIDAR-generated data sets can be used for route planning purposes, advantageously in combination with other mapping services and devices (GPS, navigation systems, maps).

For route planning applications, communication and data exchange with other roadway users (C2C) or infrastructure elements (C2X) may be applied, including making use of AI-based systems and systems based on swarm intelligence. Examples for such applications may comprise so-called platooning applications where a number of vehicles are grouped together for example for a joint highway ride, as well as various car-sharing models where cars and car users are brought together in an efficient way. Further applications may comprise the efficient localization of free parking lots, e.g. as part of municipal smart city solutions, as well as automated parking operations.

LIDAR DATA Processing System

A LIDAR Data Processing System may comprise functions of signal processing, signal optimization (signal/noise), data analysis, object detection, object recognition, information exchange with edge and cloud computing, data banks, data libraries and other sensing devices (for example other LIDAR Devices, radar, camera, ultrasound, biometrical feedback data, driver control devices, car-to-car (C2C) communication, car-to-environment (C2X) communication, geolocation data (GPS).

A LIDAR Data Processing System may generate point clouds (3D/6D), object location, object movement, environment data, object/vehicle density.

A LIDAR Data Processing System may include feedback control to First LIDAR Sensing System and/or Second LIDAR Sensing System and/or Control and Communication System . . . .

LIDAR Light Module

A LIDAR Light Module comprise at least one LIDAR Light Source and at least one driver connected to the at least one LIDAR Light Source.

LIDAR Sensing System

A LIDAR Sensing System may comprise one or many LIDAR emission modules, here termed as "First LIDAR Sensing, and/or one or many to LIDAR Sensor modules, here termed as "Second LIDAR Sensing.

LIDAR Sensor

Unless otherwise stated, the term sensor or sensor module describes—in the framework of this patent application—a module, which is is configured to function as a LIDAR Sensor System. As such it may comprise a minimum set of LIDAR key components necessary to perform basic LIDAR functions such as a distance measurement.

A LIDAR (light detection and ranging) Sensor is to be understood in particular as meaning a system which, in addition to one or more emitters for emitting light beams, for example in pulsed form, and a detector for detecting any reflected beam components, may have further devices, for example optical elements such as lenses and/or a MEMS mirror. A LIDAR Sensor can therefore also be called a LIDAR System or a LIDAR Sensor System or LIDAR detection system.

LIDAR Sensor Device

A LIDAR Sensor Device is a LIDAR Sensor System either stand alone or integrated into a housing, light fixture, headlight or other vehicle components, furniture, ceiling, textile, etc. and/or combined with other objects (e.g. vehicles, pedestrians, traffic participation objects, . . . ).

LIDAR Sensor Management System

LIDAR Sensor Management System receives input from the LIDAR Data Processing System and/or Control and Communication System and/or any other component of the LIDAR Sensor Device, and outputs control and signaling commands to the First LIDAR Sensing System and/or Second LIDAR Sensing System.

LIDAR Sensor Management Software

LIDAR Sensor Management Software (includes feedback software) for use in a LIDAR Sensor Management System.

LIDAR Sensor Module

A LIDAR Sensor Module comprises at least one LIDAR Light Source, at least one LIDAR Sensing Element, and at least one driver connected to the at least one LIDAR Light Source. It may further include Optical Components and a LIDAR Data Processing System supported by LIDAR signal processing hard- and software.

LIDAR System

A LIDAR System is a system, that may be or may be configured as a LIDAR Sensor System.

LIDAR Sensor System

A LIDAR Sensor System is a system, which uses light or electromagnetic radiation, respectively, to derive information about objects in the environment of the LIDAR system. The acronym LIDAR stands for Light Detection and Ranging. Alternative names may comprise LADAR (laser detection and ranging), LEDDAR (Light-Emitting Diode Detection and Ranging) or laser radar.

LIDAR systems typically comprise of a variety of components as will be described below. In an exemplary application, such LIDAR systems are arranged at a vehicle to derive information about objects on a roadway and in the vicinity of a roadway. Such objects may comprise other road users (e.g. vehicles, pedestrians, cyclists, etc.), elements of road infrastructure (e.g. traffic signs, traffic lights, roadway markings, guardrails, traffic islands, sidewalks, bridge piers, etc.) and generally all kinds of objects which may be found on a roadway or in the vicinity of a roadway, either intentionally or unintentionally.

The information derived via such a LIDAR system may comprise the distance, the velocity, the acceleration, the direction of movement, the trajectory, the pose and/or other physical or chemical properties of these objects. To derive this information, the LIDAR system may determine the Time-of-Flight (TOF) or variations of physical properties such as phase, amplitude, frequency, polarization, structured dot pattern, triangulation-based methods, etc. of the electromagnetic radiation emitted by a light source after the emitted radiation was reflected or scattered by at least one object in the Field of Illumination (FOI) and detected by a photodetector.

LIDAR systems may be configured as Flash LIDAR or Solid-State LIDAR (no moving optics), Scanning LIDAR (1- or 2-MEMS mirror systems, Fiber-Oscillator), Hybrid versions as well as in other configurations.

LiDAR Light as a Service (LLaaS)

Lighting as a Service (LaaS) is a service delivery model in which light service is charged on a subscription basis rather than via a onetime payment. This business model has become more common in commercial and citywide installations of LED lights, specifically in retrofitting buildings and outdoor facilities, with the aim of reducing installation costs. Light vendors have used an LaaS strategy in selling value-added services, such as Internet-connected lighting and energy management. LIDAR Light as a Service (LLaaS) refers to a business model where the installation, use, performance and exchange of a LIDAR Sensor System or any components of it are paid per use case. This is especially important for LIDAR Sensor Systems that are attached to signposts, traffic lights, buildings, wall ceilings, when used in a hired autonomously driving car, or when used in combination with personal equipment. LIDAR Lighting as a Service can be assisted with smart contracts that could be based on blockchain technologies.

LiDAR Platform as a Service (LPaaS)

A Platform as a Service (PaaS) or Application Platform as a Service (aPaaS) or platform-based service is a category of cloud computing services that provides a platform allowing customers to develop, run, and manage applications without the complexity of building and maintaining the infrastructure typically associated with developing and launching an app. A LIDAR Platform as a Service (LPaaS) enables, for example, OEMs, tier-1 customers, soft- and hardware developers etc. to do likewise as described above thus facilitating quicker time to market and higher reliability. A LIDAR Platform as a Service (LPaaS) can be a valued business case for a providing company.

Light Control Unit

The Light Control Unit may be configured to control the at least one First LIDAR Sensing System and/or at least one Second LIDAR Sensing System for operating in at least one operation mode. The Light Control Unit may comprise a light control software. Possible operation modes are e.g.: dimming, pulsed, PWM, boost, irradiation patterns, including illuminating and non-illuminating periods, light communication (including C2C and C2X), synchronization with other elements of the LIDAR Sensor System, such as a second LIDAR Sensor Device.

Light Source

A light source for LIDAR applications provides electromagnetic radiation or light, respectively, which is used to derive information about objects in the environment of the LIDAR system. In some implementations, the light source emits radiation in a non-visible wavelength range, in particular infrared radiation (IR) in the wavelength range from 850 nm up to 8100 nm. In some implementations, the light source emits radiation in a narrow bandwidth range with a Full Width at Half Maximum (FWHM) between 1 ns to 100 ns.

A LIDAR light source may be configured to emit more than one wavelength, visible or invisible, either at the same time or in a time-sequential fashion.

The light source may emit pulsed radiation comprising individual pulses of the same pulse height or trains of multiple pulses with uniform pulse height or with varying pulse heights. The pulses may have a symmetric pulse shape, e.g. a rectangular pulse shape. Alternatively, the pulses may have asymmetric pulse shapes, with differences in their respective rising and falling edges. Pulse length can be in the range of pico-seconds (ps) up to micro-seconds (μs).

The plurality of pulses may also overlap with each other, at least partially. Apart from such a pulsed operation, the light source may be operated also in a continuous wave operation mode, at least temporarily. In continuous wave operation mode, the light source may be adapted to vary phase, amplitude, frequency, polarization, etc. of the emitted radiation. The light source may comprise solid-state light sources (e.g. edge-emitting lasers, surface-emitting lasers, semiconductor lasers, VCSEL, VECSEL, LEDs, superluminescent LEDs, etc.).

The light source may comprise one or more light emitting elements (of the same type or of different types) which may be arranged in linear stripes or in two-dimensional arrays. The light source may further comprise active or passive heat dissipation elements.

The light source may have several interfaces, which facilitate electrical connections to a variety of electronic devices such as power sources, drivers, controllers, processors, etc. Since a vehicle may employ more than one LIDAR system, each of them may have different laser characteristics, for example, regarding laser wavelength, pulse shape and FWHM.

The LIDAR light source may be combined with a regular vehicle lighting function, such as headlight, Daytime Running Light (DRL), Indicator Light, Brake Light, Fog Light etc. so that both light sources (LIDAR and another vehicle light source) are manufactured and/or placed on the same substrate, or integrated into the same housing and/or be combined as a non-separable unit.

Marker

A marker can be any electro-optical unit, for example an array of photodiodes, worn by external objects, in particular pedestrians and bicyclists, that can detect infrared radiation or acoustic waves (infrasound, audible, ultrasound), process the incoming radiation/waves and, as a response, reflect or emit infrared radiation or acoustic waves (infrasound, audible, ultrasound) with the same or different wavelength, and directly or indirectly communicate with other objects, including autonomously driving vehicles.

Method

The term method may describe a procedure, a process, a technique or a series of steps, which are executed in order to accomplish a result or in order to perform a function. Method may for example refer to a series of steps during manufacturing or assembling a device. Method may also refer to a way of using a product or device to achieve a certain result (e.g. measuring a value, storing data, processing a signal, etc.).

Module

Module describes any aggregation of components, which may set up a LIDAR system. As example, a light source module may describe a module, which comprises a light source, several beam forming optical elements and a light source driver as an electronic device, which is configured to supply power to the light source.

Objects

Objects may generally denote all sorts of physical, chemical or biological matter for which information can be derived via a sensor system. With respect to a LIDAR Sensor System, objects may describe other road users (e.g. vehicles, pedestrians, cyclists, etc.), elements of road infrastructure (e.g. traffic signs, traffic lights, roadway markings, guardrails, traffic islands, sidewalks, bridge piers, etc.) and generally all kinds of objects which may be found on a roadway or in the vicinity of a roadway, either intentionally or unintentionally.

Optical Meta-Surface

An optical meta-surface may be understood as one or more sub-wavelength patterned layers that interact with light, thus providing the ability to alter certain light properties over a sub-wavelength thickness. A conventional optics arrangement relies on light refraction and propagation. An optical meta-surface offers a method of light manipulation based on scattering from small nanostructures or nano-waveguides. Such nanostructures or nano-waveguides may resonantly interact with the light thus altering certain light properties, such as phase, polarization and propagation of the light, thus allowing the forming of light waves with unprecedented accuracy. The size of the nanostructures or nano-waveguides is smaller than the wavelength of the light impinging on the optical meta-surface. The nanostructures or nano-waveguides are configured to alter the properties of the light impinging on the optical meta-surface. An optical meta-surface has similarities to frequency selective surfaces and high-contrast gratings. The nanostructures or nano-waveguides may have a size in the range from about 1 nm to about 100 nm, depending on structure shapes. They may provide a phase shift of the light up to two Tr. The microscopic surface structure is designed to achieve a desired macroscopic wavefront composition for light passing the structure.

Periphery Parts

Periphery parts may denote all parts, in particular mechanical parts which are used to house the LIDAR Sensor System, to protect it from the outside environment (e.g. humidity, dust, temperature, etc.) and to mount it to the appliance which is intended to use the LIDAR system (e.g. cars, trucks, drones, vehicles or generally all sorts of land crafts, water crafts or air crafts).

Periphery parts may comprise housings, like headlights or other vehicle lighting parts, containers, caps, windows, frames, cleaning devices (in particular for windows), etc. LIDAR Sensor System can be an integral unit with a vehicle headlamp or headlight.

Pixelation

In the context of the present application, the term "pixelation" may be used to describe an effect associated with the resolution, e.g. of an image. "Pixelation" may be an effect of low-resolution, e.g. of an image, which may result in unnatural appearances, such as sharp edges for a curved object and diagonal lines.

Processor

A processor is an electronic circuit, which performs multipurpose processes based on binary data inputs. Specifically, microprocessors are processing units based on a single integrated circuit (IC). Generally speaking, a processor receives binary data, which may be processed according to instructions stored in a memory block of the processor, and provides binary results as outputs via its interfaces.

Reliable Components and Modules

Some LIDAR-based business models may deal with subjects related to reliable components and modules, including for example the design and manufacturing of components and modules (e.g. light source modules). Reliable components and modules may further comprise reliable assembly methods which ensure, i.a., precise alignment and stable mounting of components, as well as calibration and functional testing of components and modules. Furthermore, such component and module designs are preferred that allow robust, compact and scalable products and that are cost-efficient and usable in a wide range of environments, such as a wide temperature range (e.g. −40° C. to +125° C.).

Projected Infra-Red Light Pattern

In the context of the present application the term "projected infra-red light pattern" may be used to describe an arrangement of light elements (e.g., light lines or light dots, such as laser lines or dots) having a structure (for example, a periodicity) in at least one direction (e.g., in at least one dimension). A projected infra-red light pattern may be, for example, a grid of vertical lines or a grid of dots. A pattern in the context of the present application may have a regular (e.g., periodic) structure, e.g. with a periodic repetition of a same light element, or a pattern may have an irregular (e.g., non-periodic) structure. A projected pattern may be a one-dimensional pattern, illustratively a pattern having a structure or a periodicity along one direction (e.g., along one dimension). A grid of vertical lines may be an example of one-dimensional pattern. Alternatively, a projected pattern may be a two-dimensional pattern, illustratively a pattern having a structure or a periodicity along two directions (e.g., along two dimensions, e.g. perpendicular to one another). A dot pattern, such as a grid of dots, or a QR-code-like pattern, or an image, or a logo may be examples of two-dimensional patterns.

Reliable LIDAR Sensor System

Some LIDAR-based business models may deal with subjects related to reliable sensor systems, including for example the design and manufacturing of a complete LIDAR Sensor System. Reliable LIDAR Sensor Systems further comprise reliable assembly methods which ensure, i.a., precise alignment and stable mounting of components and/or module, as well as calibration and functional testing of components and modules. Sensor designs are preferred which allow robust, compact and scalable products and which are cost-efficient and usable in a wide range of environments, such as a wide temperature range (e.g. −40° C. to +125° C.). Reliable sensor systems are designed to provide 3D-point cloud data with high angular resolution, high precision of ranging values and high signal-to-noise ratio (SNR). 3D point values may be delivered as either ASCII point files or in a Laser File Format (LAS) format.

Furthermore, a reliable sensor system may comprise various interfaces, e.g. communication interfaces in order to exchange data and signals for sensor fusion functions, involving other sensing systems, such as other LIDAR-sensors, RADAR sensors, Ultrasonic sensors, Cameras, etc. In addition, reliability may be further increased via software upload and download functionalities, which allow to read out data stored in the LIDAR Sensor System but also to upload new or updated software versions.

Sampling Signal and Method of Sampling a Sensing Field

Sampling signal generally denotes the signal (and its properties) which is used to sample a sensing field. In case of a LIDAR sampling signal, a laser source is used which may be configured to emit light with a wide range of properties. Generally, the laser light might be emitted in a continuous wave manner (including modulations or adaptions of wavelength, phase, amplitude, frequency, polarization, etc.) or in a pulsed manner (including modulations or adaptions of pulse width, pulse form, pulse spacing, wavelength, etc.).

Such modulations or adaptions may be performed in a predefined, deterministic manner or in a random or stochastic manner. It may be necessary to employ a sampling rate that is higher than the twofold of the highest frequency of a signal (Nyquist-Shannon-Sampling Theorem) in order to avoid aliasing-artefacts. Apart from the light source itself, there might be additional downstream optical elements, which can be used to transmit the sampling signal into the sensing field. Such optical elements may comprise mechanical solutions such as rotating mirrors, oscillating mirrors, MEMS-devices, Digital Mirror Devices (DMD) devices, etc. as well as non-mechanical solutions such as optical phased arrays (OPA) or other devices in which the light emission can be dynamically controlled and/or structured, including phase modulators, phase shifters, projecting devices, Liquid Crystal Elements (LCD), etc. Laser emitter and optical elements may be moved, tilted or otherwise shifted and/or modulated with respect to their distance and orientation.

Scanning LIDAR Sensor System

A LIDAR Sensor System where the angular information is gained by using a moveable mirror for scanning (i.e. angularly emitting) the laser beam across the Field of View (FOV), or any other technique to scan a laser beam across the FOV, is called a Scanning LIDAR Sensor System.

Sensor/Sensor Pixel

A sensor in the context of this disclosure includes one or more sensor pixels (which may also be referred to as pixel). Each sensor pixel includes exactly one photo diode. The sensor pixels may all have the same shape or different shapes. The sensor pixels may all have the same spacing to their respective neighbors or may have different spacings. The sensor pixels may all have the same orientation in space or different orientation in space. The sensor pixels may all be arranged within one plane or is within different planes or other non-planar surfaces. The sensor pixels may include the same material combination or different material combinations. The sensor pixels may all have the same surface structure or may have different surface structures. Sensor pixels may be arranged and/or connected in groups.

In general, each sensor pixel may have an arbitrary shape. The sensor pixels may all have the same size or different sizes. In general, each sensor pixel may have an arbitrary size. Furthermore, the sensor pixels may all include a photo diode of the same photo diode type or of different photo diode types.

A photo diode type may be characterized by one or more of the following features: size of the photo diode; sensitivity of the photo diode regarding conversion of electromagnetic radiation into electrical signals (the variation of the sensitivity may be caused the application of different reverse-bias voltages); sensitivity of the photo diode regarding light wavelengths; voltage class of the photo diode; structure of the photo diode (e.g. pin photo diode, avalanche photo diode, or single-photon avalanche photo diode); and material(s) of the photo diode.

The sensor pixels may be configured to be in functional relationship with color-filter elements and/or optical components.

Sensors

Sensors are devices, modules or subsystems whose purpose it is to detect events or changes in its environment and send the information to other electronics, frequently a computer processor. Nowadays, there is a broad range of sensors available for all kinds of measurement purposes, for example the measurement of touch, temperature, humidity, air pressure and flow, electromagnetic radiation, toxic substances and the like. In other words, a sensor can be an electronic component, module or subsystem that detects events or changes in energy forms in its physical environment (such as motion, light, temperature, sound, etc.) and sends the information to other electronics such as a computer for processing.

Sensors can be used to measure resistive, capacitive, inductive, magnetic, optical or chemical properties.

Sensors include camera sensors, for example CCD or CMOS chips, LIDAR sensors for measurements in the infrared wavelength range, Radar Sensors, and acoustic sensors for measurement in the infrasound, audible and ultrasound frequency range. Ultrasound is radiation with a frequency above 20 kHz.

Sensors can be infrared sensitive and measure for example the presence and location of humans or animals.

Sensor can be grouped into a network of sensors. A vehicle can employ a wide variety of sensors, including camera sensors, LIDAR sensing devices, RADAR, acoustical sensor systems, and the like. These sensors can be mounted inside or outside of a vehicle at various positions (roof, front, rear, side, corner, below, inside a headlight or any other lighting unit) and can furthermore establish a sensor network that may communicate via a hub or several sub-hubs and/or via the vehicle's electronic control unit (ECU).

Sensors can be connected directly or indirectly to data storage, data processing and data communication devices.

Sensors in cameras can be connected to a CCTV (Closed Circuit Television). Light sensors can measure the amount and orientation of reflected light from other objects (reflectivity index).

Sensing Field

The term sensing field describes that surroundings of a sensor system, wherein objects or any other contents can be detected, as well as their physical or chemical properties (or their changes). In case of a LIDAR Sensor System, it describes a solid angle volume into which light is emitted by the LIDAR light source (FOI) and from which light that has been reflected or scattered by an object can be received by the LIDAR detector (FOV). As an example, a LIDAR sensing field may comprise a roadway or the vicinity of a roadway close to a vehicle, but also the interior of a vehicle. For other types of sensors, sensing field may describe the air around the sensor or some objects in direct contact to the sensor.

Sensor Optics

Sensor Optics denotes all kinds of optical elements, which may be used in a LIDAR Sensor System in order to facilitate its function or improve its function. As example, such optical elements may comprise lenses or sets of lenses, filters, diffusors, mirrors, reflectors, light guides, Diffractive Optical Elements (DOE), Holographic Optical Elements and generally all kind of optical elements which may manipulate light (or electromagnetic radiation) via refraction, diffraction, reflection, transmission, absorption, scattering, etc. Sensor Optics may refer to optical elements related to the light source, to the beam steering unit or the detector unit. Laser emitter and optical elements may be moved, tilted or otherwise shifted and/or modulated with respect to their distance and orientation.

Sensor System Optimization

Some LIDAR-related business models may deal with methods of sensor system optimization. Sensor system optimization may rely on a broad range of methods, functions or devices, including for example computing systems utilizing artificial intelligence, sensor fusion (utilizing data and signals from other LIDAR-sensors, RADAR sensors, Ultrasonic sensors, Cameras, Video-streams, etc.), as well as software upload and download functionalities (e.g. for update purposes). Sensor system optimization may further utilize personal data of a vehicle user, for example regarding age, gender, level of fitness, available driving licenses (passenger car, truck) and driving experiences (cross vehicle weight, number of vehicle axes, trailer, horsepower, front-wheel drive/rear-wheel drive). Personal data may further include further details regarding driving experience (e.g. beginners level, experienced level, professional motorist level) and/or driving experiences based on data such as average mileage per year, experience for certain road classes, road environments or driving conditions (e.g. motorway, mountain roads, off-road, high altitude, bridges, tunnels, reversing, parking, etc.), as well as experiences with certain weather conditions or other relevant conditions (snow, ice, fog, day/night, snow tires, snow chains, etc.).

Personal data may further include information about previous accidents, insurance policies, warning tickets, police reports, entries in central traffic registers (e.g. Flensburg in Germany), as well as data from biofeedback systems, other health-related systems (e.g. cardiac pacemakers) and other data (e.g. regarding driving and break times, level of alcohol intake, etc.).

Personal data may be particularly relevant in care sharing scenarios and may include information about the intended ride (starting location, destination, weekday, number of passengers), the type of loading (passengers only, goods, animals, dangerous goods, heavy load, large load, etc.) and personal preferences (time-optimized driving, safety-optimized driving, etc.). Personal data may be provided via smartphone connections (e.g. based on Bluetooth, WiFi, LiFi, etc.). Smartphones or comparable mobile devices may further be utilized as measurement tools (e.g. ambient light, navigation data, traffic density, etc.) and/or as device which may be utilized as assistants, decision-making supports, or the like.

Signal Modulation

In the context of the present application the term "signal modulation" (also referred to as "electrical modulation") may be used to describe a modulation of a signal for encoding data in such signal (e.g., a light signal or an electrical signal, for example a LIDAR signal). By way of example, a light signal (e.g., a light pulse) may be electrically modulated such that the light signal carries or transmits data or information. Illustratively, an electrically modulated light signal may include a sequence of light pulses arranged (e.g., temporally spaced) such that data may be extracted or interpreted according to the arrangement of the light pulses. Analogously, the term "signal demodulation" (also referred to as "electrical demodulation") may be used to describe a decoding of data from a signal (e.g., from a light signal, such as a sequence of light pulses).

Virtual Map

A digital map is a collection of data that may be used to be formatted into a virtual image. The primary function of a digital map is to provide accurate representations of measured data values. Digital mapping also allows the calculation of geometrical distances from one object, as represented by its data set, to another object. A digital map may also be called a virtual map.

Vehicle

A vehicle may be any object or device that either is equipped with a LIDAR Sensor System and/or communicates with a LIDAR Sensor System. In particular a vehicle can be: automotive vehicle, flying vehicle, all other moving vehicles, stationary objects, buildings, ceilings, textiles, traffic control equipment, . . . .

LIST OF ABBREVIATIONS

ABS=Anti-lock Braking Systems
ACV=Angular Camera Field-of-View
ACK=Acknowledgment
ADAS=Advanced Driver-Assistance Systems
ADB=Adaptive high-beam systems
ADC=Analog Digital Converter
ADR=Automatic Diode Reset
AGV=Automatically Guided Vehicles
AI=Artificial Intelligence
APD=Avalanche Photo-Diodes
API=Application Programming Interface
APP=Application software, especially as downloaded by a user to a mobile device
AR=Augmented Reality
ASCII=American Standard Code for Information Interchange
ASIL=Automotive Safety Integrity Level
ASIC=Application-Specific Integrated Circuit
ASSP=Application Specific Standard Product
AV=Autonomous Vehicle
BCU=Board Control System
C2C=Car-to-Car
C2X=Car-to-Infrastructure or Car-to-Environment
CCD=Charge-Coupled Device
CCTV=Closed Circuit Television
CD=Compact Disc
CD=Collision Detection
CDe=Computing Device
CDMA=Code Division Multiple Access
CDS=Camera Data Set
CdTe=Cadmium telluride
CFD=Constant Fraction Discriminator
CIS=CMOS Image Sensor
CLVRM=Camera-LIDAR-Relationship-Matrix
CML=Current Mode Logic
CMOS=Complementary Metal-Oxide-Semiconductor
CMYW=cyan, magenta, yellow, and white
CoB=Chip on Board
CPC=Compound Parabolic Concentrators
CRC=Cyclic Redundancy Check
CS=Compressed Sensing
CSMA=Carrier Sense Multiple Access
CSPACVM=Camera-Sensor-Pixel-ACV-Relationship-Matrix
CU=Communication Unit/Data/Device CYMG=cyan, yellow, green and magenta
DCDS=Differentiated Camera Data Set
DCF=Distributed Coordination Function
DCR=Dark Count Rate
DCT=Discrete Cosine Transform
DIFS=Distributed Coordination Interframe Spacing
DLP=Digital Light Processing
DMD=Digital Mirror Devices
DNL=Deep Neuronal Learning
DNN=Deep Neural Networks
DOE=Diffractive Optical Elements
DRAM=Dynamic Random Access Memory
DRL=Daytime Running Light
DS=Driving Scenario
DS=Driving Status
DSP=Digital Signal Processing
DSRC=Dedicated Short Range Communication
DSS=Driving Sensor Scenario
dTOF=Direct TOF
DVD=Digital Video Disc
ECU=Electronic Control Unit/Vehicle Control Unit
EIC=Electronic-IC
ES=Environment Settings
ESC=Electronic Stability Controls
FAC=Fast Axis Collimation
FEC=Forward Error Correction
FET=Field Effect Transistor
FFT=Fast Fourier Transform
FIFO=First In-First Out
FMTA=Federal Motor Transport Authority
FOI=Field of Illumination
FOE=Field of Emission
FOV=Field of View
FPGA=Field Programmable Gate Array
FWHM=Full Width at Half Maximum
GNSS=Global Navigation Satellite System
GPS=Global-Positioning-System
GSM=General Setting Matrix
GUI=Graphical User Interface
HMAC=Keyed-Hash Message Authentication Code
HMI=Human Machine Interaction
HOE=Holographic Optical Elements
HUD=Head-up-Display
HVAC=Heating, Ventilation and Air Conditioning
IC=Integrated Circuit
ID=Identification
IFS=Interframe Space
IMU=Inertial Measurement Unit (system)
IN=Intelligent Network
IoT=Internet of Things
IR=Infrared Radiation
ITO=Indium Tin Oxide
iTOF=Indirect TOF
LaaS=Lighting as a Service
LADAR=Laser Detection and Ranging
LARP=Laser Activated Remote Phosphor
LAS=Laser File Format
LCC=Logical Link Control
LCD=Liquid Crystal Display
LCM=Liquid Crystal Metasurface
LCM=Logical Coherence Module
LCoS=Liquid Crystal on Silicon
LCPG=Liquid Crystal Polarization Gratings
LDS=LIDAR Data Set
LED=Light-Emitting Diodes
LEDDAR=Light-Emitting Diode Detection and Ranging
LIDAR=Light detection and ranging
LiFi=Light Fidelity
LLaaS=LIDAR Light as a Service
LOS=Line-of-Sight
LPaaS=LiDAR Platform as a Service
LSC=Location Selective Categories
LSPALVM=LIDAR-Sensor-Pixel-ALV-Relationship-Matrix
LTE=Long Term Evolution
M=Marker
MA=Active Marker
MaaS=Mobility-as-a-Service
MAC=Medium Access Control
MAR=Active Marker Radiation
MD=Monitoring Devices
MEMS=Micro-Electro-Mechanical System
ML=Machine Learning
MLA=Micro-Lens Array
MOSFET=Metal-Oxide-Semiconductor Field-Effect Transistor
MP=Passive Marker
MPE=Maximum Permissible Exposure
MPPC=Multi Pixel Photon Counter
MPR=Purely Reflective Marker
MPRA=Passive Marker Radiation
NFC=Near Field Communication
NFU=Neural Processor Units
NIR=Near Infrared
OFDM=Orthogonal Frequency Division Multiplexing
OMs=Optical Metasurfaces
OOB=Out-of-Band
OOK=On Off Keying
OPA=Optical Phased Arrays
OSI=Open System Interconnection
OWC=Optical Wireless Communication
PaaS=Platform as a Service
PAM=Pulse Amplitude Modulation
PBF=Probability Factor
PBS=Polarized Beam Splitter
PC=Polycarbonate
PCo=Power Consumption
PCB=Printed Circuit Board
PD=Photo-Diode
PDU=Protocol Data Unit
PEDOT=Poly-3,4-ethylendioxythiophen
PHY=Physical Layer
PIC=Photonic-IC
PIN=Positive Intrinsic Negative diode
PMMA=Polymethyl Methacrylate
PN=Pseudonoise
PPF=Presence Probability Factor
PPM=Pulse Position Modulation
PW=Processing Power
PWM=Pulse-width Modulation
QR-Code=Quick Response Code
RADAR=Radio Detection And Ranging
RAM=Random Access Memory
RAN=Radio Access Networks
RF=Radio Frequency
RGB=Red Green Blue
RGBE=red, green, blue, and emerald
RLE=Run-length Encoding
ROM=Read only Memory
SAC=Slow Axis Collimation
SAE=Society of Automotive Engineers
SAS=Sensor Adjustment Settings
SC=Sensor Combinations
SFM=Sensor Function Matrix SIFS=Short Interframe Spacing
SIP=System in Package
SiPM=Silicon Photomultipliers
Si-PIN=Silicon pin Diode
Si-PN=Silicon pn-Diode
SLM=Spatial Light Modulator
SNR=Signal-to-Noise Ratio
SOC=Systems-on-Chip
SOI=Silicon on Isolator
SPAD=Single Photon Avalanche Diodes
TaaS=Transportation-as-a-Service
TAC=Time to Analog Converter
TC=Traffic Conditions
TDC=Time to Digital Converter
TDM=Traffic Density Maps
TDPM=Traffic Density Probability Maps
TEM=Traffic Event Maps
TIR=Total Internal Reflection
TIA=Transimpedance Amplifier
TOF=Time of Flight
TPL=Total Power Load
TR=Traffic Relevance (value/factor)
TRM=Traffic Maps
TSV=Through-Silicon-Via
UAV=Unmanned Aerial Vehicles
UI=User Interface
UMTS=Universal Mobile Telecommunications System
USB=Universal Serial Bus
UV=Ultra-Violet radiation
V2I=Vehicle-to-Infrastructure
V2V=Vehicle-to-Vehicle
V2X=Vehicle-to-Environment
VCO=Vehicle Control Options
VCSEL=Vertical Cavity Surface Emitting Laser
VECSEL=Vertical-External-Cavity-Surface-Emitting-Laser
VIN=Vehicle Identification Number
VIS=Visible Spectrum
VLC=Visible Light Communication
VR=Virtual Reality
VS=Vehicle Sensor System
VTD=Vehicle Target Data
WiFi=Wireless Fidelity
WLAN=Wireless Local Area Network
XOR eXclusive OR
ZnS=Zinc Sulphide
ZnSe=Zinc Selenide
ZnO=Zinc Oxide
fC=femto Coulomb
pC=pico Coulomb
fps=frames per second
ms=milli-seconds
ns=nano-seconds
ps=pico-seconds
ps=micro-seconds
i.e. =that is/in other words
e.g.=for example

LIST OF REFERENCE SIGNS

10 LIDAR Sensor System
20 Controlled LIDAR Sensor System
30 LIDAR Sensor Device
40 First LIDAR Sensing System
41 Light scanner/Actuator for Beam Steering and Control
42 Light Source
43 Light Source Controller/Software
50 Second LIDAR Sensing System
51 Detection Optic/Actuator for Beam Steering and Control
52 Sensor or Sensor element
53 Sensor Controller
60 LIDAR Data Processing System
61 Advanced Signal Processing
62 Data Analysis and Computing
63 Sensor Fusion and other Sensing Functions
70 Control and Communication System
80 Optics
81 Camera System and Camera sensors
82 Camera Data and Signal exchange
90 LIDAR Sensor Management System
92 Basic Signal Processing
100 Observed environment and/or object
110 Information about observed environment and/or object
120 Emitted light and communication
130 Object reflected light and communication
140 Additional environmental light/radiation
150 Other Components or Software
160 Data and signal exchange
210 Driver (Light Source/Beam Steering Device)
220 Controlling Device
230 Electronic Device
240 Detector
250 Window
260 Light Beam
261 Light Beam
262 Light Beam
263 Light Beam
264 Light Beam
270 Dynamic Aperture Device
270*a* aperture element
270*b* aperture element
280*a* FOI
280*b* FOI
290*a* Light Guide
290*b* Light Guide
410 Optical Element (Mirror)
420 LIDAR Sensor System housing
510 Optical Element (Light Guide)
610 Optical Element
710 Impurity Particles
720 Detector
800 system to detect and/or communicate with a traffic participant representing first object
802 traffic participant represented by a first object
820 first object
821 distance measurement unit (LIDAR Sensor Device 30)
822 first emission unit (LIDAR Sensing System comprising a LIDAR Light Source/First LIDAR Sensing System 40)
8221 signal pulse
8222 emitting space (FOV or FOI)
823 detection unit (LIDAR Sensor Module/Second LIDAR Sensing System 50)
824 control device (Light Control Unit)
803, 804 traffic participant represented by a second object
830, 840 second object
831, 841 acquisition and information unit (LIDAR Sensing System)
832, 842 signal generating device (LIDAR Light Module 40)
833, 843 detector (LIDAR Sensor Module 50)
8331, 8431 acceptance angle
834, 844 control device (Light Control Unit)
930 garment
931 Waveguide S1010 emitting a signal pulse intended to determine a distance by a first emission unit of a distance measurement unit allocated to a the first object
S1020 reflecting the signal pulse at a second object representing a further traffic participant
S1021 detecting the reflected signal by a detection unit of the distance measurement unit and determination of the distance based on the measured run-time
S1030 detecting the signal pulse emitted by the first emission unit by an acquisition and information unit allocated to the second object
S1031 outputting an information signal by the acquisition and information unit depending on the detection result
1102 Plurality of energy storage circuits
1104 Plurality of read-out circuitries
1106 SPAD signal
1108 TIA signal
1202 SPAD
1204 Falling edge of SPAD signal
1206 SPAD signal
1208 Rising edge of SPAD signal
1210 SPAD signal
1212 Serial resistor
1214 Serial resistor
1300 Detector diagram
1302 Counter signal
1310 Detector diagram
1312 Counter signal
1320 Detector diagram
1322 Counter signal
1330 Detector diagram
1332 Counter signal
1402 Charge diagram
1404 Time gate
1406 Laser pulse
dd Distance
1500 Printed circuit board
1502 TIA chip
1504 ADC circuit
1506 Bond wire
1508 PCB trace
1510 TIA chip
1512 TDC chip
1600 Transducer amplifier
1602 Start_N signal
1604 TIA read-out signal RdTIA
1606 Analog TIA signal analogTIA
1608 Sample-and-hold-signal S&H_N
1610 Reset signal RES_1
M1 Reset MOSFET
M2 Start MOSFET
M7 Imaging MOSFET
M8 Probe MOSFET
M9 Read-out MOSFET
C3 First storage capacitor
C4 second storage capacitor
VSPAD SPAD potential
1702 First time to analog converter
1704 ToF read-out signal RdToF
1706 Analog ToF signal analogToF
M1*a* Further reset MOSFET
M2*a* Event MOSFET
M3*a* First current source MOSFET
M4*a* First current source MOSFET
M5*a* TAC start MOSFET
M6*a* Further probe MOSFET
M7*a* ToF read-out MOSFET C1 Third capacitor
C2 Fourth capacitor
1802 First time to analog converter
M1*b* Reset MOSFET
M3*b* First inverter MOSFET
M4*b* Second inverter MOSFET
M5*b* Ramp MOSFET
1902 First event detector
1904 Second event detector
1906 Third event detector
1908 Fourth event detector
1910 Fifth event detector
1912 First timer circuit
1914 Second timer circuit
1916 Third timer circuit
1918 Fourth timer circuit
1920 Fifth timer circuit
1922 First sample and hold circuit
1924 Second sample and hold circuit
1926 Third sample and hold circuit
1928 Fourth sample and hold circuit
1930 Fifth sample and hold circuit
1932 First analog-to-digital converter
1934 Second analog-to-digital converter
1936 Third analog-to-digital converter
1938 Fourth analog-to-digital converter
1940 Fifth analog-to-digital converter
1942 One or more signal lines
1944 First trigger signal
1946 Second trigger signal
1948 Third trigger signal
1950 Fourth trigger signal
1952 Fifth trigger signal
1954 One or more output lines
1956 First digital ToF value
1958 Digital voltage value
1960 One or more further output lines
1962 First timer circuit output signal
1964 Second digital ToF value
1966 Second digital voltage value
1968 Second timer circuit output signal
1970 Third digital ToF value
1972 Third digital voltage value
1974 Third timer circuit output signal
1976 Fourth digital ToF value
1978 Fourth digital voltage value
1980 Fourth timer circuit output signal
1982 Fifth digital ToF value
1984 Fifth digital voltage value
1986 Communication connection
2002 Main event detector
2004 Main trigger signal
2006 Main timer circuit
2008 Main sample and hold circuit
2010 Main analog-to-digital converter
2012 Digital voltage value
2016 One or more further output lines
2018 Differentiator
2020 Differentiated SPAD signal
2022 High resolution event detector
2024 High resolution timer circuit
2026 High resolution sample and hold circuit
2028 High resolution analog-to-digital converter
2030 Digital high resolution voltage value
2034 One or more further output lines
2036 One or more output lines
2038 High resolution trigger signal

2040 Digital differentiated ToF value
2042 Second differentiator
2044 Second differentiated SPAD signal
2046 Valley event detector
2047 Valley trigger signal
2048 Valley timer circuit
2050 Valley sample and hold circuit
2052 Valley analog-to-digital converter
2054 Digital valley voltage value
2056 Digital differentiated valley ToF value
2058 Valley-event trigger signal
2102 OR-gate
2202 First multiplexer
2302 Second multiplexer
2400 Flow diagram
2402 Partial process
2404 Partial process
2406 Partial process
2408 Partial process
2410 Partial process
2412 Partial process
2414 Partial process
2416 Partial process
2500 Circuit architecture
2502 Sampling analog-to-digital converter
2504 Digitized TIA signal
2506 Time series of TIA voltage values
2550 Energy vs. time diagram
2552 Waveform
2554 Energy
2556 Time
2558 Light pulse
2560 Symbol
2562 Symbol
2564 Symbol
2566 Time period
2602 Sensor pixel
2604 Emitted light pulse
2606 position measurement circuit
2608 Beam deflection LoS data
2610 Reflected light pulse
2612 SiPM detector array
2614 Circle
2616 Row multiplexer
2618 Column multiplexer
2620 Row select signal
2622 Column select signal
2624 SiPM signal
2626 Amplifier
2628 Voltage signal
2630 Analog-to-digital converter
2632 Digitized voltage values
2634 Oscillator
2636 Time basis clock signal
2638 3D point cloud
2640 row selection line
2642 column selection line
2700 Portion SiPM detector array
2702 Light (laser) spot
2704 Row select signal
2706 Row select signal
2708 Row select signal
2710 Column select signal
2712 Column select signal
2714 Column select signal
2716 Selected sensor pixel
2718 Supply voltage
2720 Sensor signal
2800 Portion SiPM detector array
2802 Column switch
2804 Supply voltage line
2806 Column read out line
2808 Collection read out line
2810 Column read out switch
2812 Column pixel switch
2814 Column pixel read out switch
2900 First laser power/time diagram 2900
2902 Emitted laser pulse train
2904 Emitted laser pulse
2906 Second laser power/time diagram
2908 Received laser pulse train
2910 Received laser pulse
2912 Cross-correlation diagram
2914 First cross-correlation function
2916 Second cross-correlation function
3000 Cross-correlation method
3002 Partial process
3004 Partial process
3006 Partial process
3008 Partial process
3010 Partial process
3012 Partial process
3014 Partial process
3100 Signal energy/time diagram
3102 Sensor signal
3104 Sensitivity warning threshold
3106 Signal clipping level
3108 First portion sensor signal
3110 Second portion sensor signal
3200 Flow diagram
3202 Partial process
3204 Partial process
3206 Partial process
3208 Partial process
3210 Partial process
3212 Partial process
3214 Partial process
3300 Conventional optical system for a LIDAR Sensor System
3302 Acylinder lens
3304 Arrow
3306 Horizontal collecting lens
3400 Optical system for a LIDAR Sensor System
3402 Optics arrangement
3404 Imaging optics arrangement
3406 Collector optics arrangement
3408 Light beam
3420 Optical system for a LIDAR Sensor System
3500 Top view of optical system for a LIDAR Sensor System
3502 Third light beams
3504 First light beams
3506 Second light beams
3600 Side view of optical system for a LIDAR Sensor System
3700 Top view of optical system for a LIDAR Sensor System
3702 Optics arrangement
3704 Virtual image in horizontal plane
3706 Side view of optical system for a LIDAR Sensor System
3710 Three-dimensional view optical system for a LIDAR Sensor System

3720 Three-dimensional view optical system for a LIDAR Sensor System
3722 Freeform optics arrangement
3800 Sensor portion
3802 Sensor pixel
3804 Light spot
3806 Circle
3808 Row select signal
3810 Row select signal
3812 Row select signal
3814 Column select signal
3816 Column select signal
3818 Column select signal
3820 Selected sensor pixel
3822 Supply voltage
3900 Sensor portion
3902 Row selection line
3904 Column selection line
3906 Column switch
3908 Supply voltage
3910 Supply voltage line
3912 Column read out line
3914 Collection read out line
3916 Column read out switch
3918 Column pixel switch
3920 Column pixel read out switch
4002 Column switch MOSFET
4004 Column read out switch MOSFET
4006 Column pixel switch MOSFET
4008 Column pixel read out switch MOSFET
4100 Sensor portion
4102 First summation output
4104 Coupling capacitor
4106 Second summation output
4108 Coupling resistor
4200 Recorded scene
4202 Center region
4204 Edge region
4300 Recorded scene
4302 First row
4304 Second row
4400 Method
4402 Partial process
4404 Partial process
4500 Method
4502 Partial process
4504 Partial process
4600 Portion of LIDAR Sensor System
4602 Laser diodes
4604 Laser beams
4606 Emitter optics arrangement
4608 Movable mirror
4610 Column of FOV
4612 FOV Sensor System
4614 Row of FOV
4700 Diagram
4702 Reverse bias voltage
4704 Multiplication
4706 Characteristic curve
4708 First region characteristic curve
4710 Second region characteristic curve
4712 Third region characteristic curve
4800 Circuit in accordance with various embodiments
4802 Plurality of sensor pixels
4804 Photo diode
4806 Pixel selection circuit
4808 Common node
4810 Read-out circuit
4812 Input read-out circuit
4814 Output read-out circuit
4816 Electrical signal applied to input read-out circuit
4818 Common signal line
4820 Electric variable provided at output read-out circuit
4822 Reverse bias voltage input
4900 Circuit in accordance with various embodiments
4902 Resistor $R_{PD1}$
4904 Capacitor $C_{amp1}$
4906 Schottky diode $D_1$
4908 Suppression voltage input
4910 Suppression voltage $U_{Amp1}$
4912 Voltage pulse suppression voltage $U_{Amp1}$
4914 Course suppression voltage $U_{Amp1}$
4916 Amplifier
4918 Inverting input amplifier
4920 Non-inverting input amplifier
4922 Ground potential
4924 Feedback resistor $R_{FB}$
4926 Feedback capacitor $C_{FB}$
4928 Output amplifier
4930 Output voltage $U_{PD}$
4932 Time t
5000 Method
5002 Partial process
5004 Partial process
5100 Optical component for a LIDAR Sensor System
5102 Device layer
5104 One or more electronic devices
5106 Bottom interconnect layer
5108 One or more electronic contacts
5110 First photo diode
5112 One or more contact vias
5114 Intermediate interconnect/device layer
5116 One or more further electronic devices
5118 One or more further electronic contacts
5120 Second photo diode
5200 Optical component for a LIDAR Sensor System
5202 One or more microlenses
5204 Filler material
5206 Filter layer
5208 Upper (exposed) surface of filter layer
5210 First arrow
5212 Second arrow
5214 Third arrow
5250 Wavelength/transmission diagram
5252 Transmission characteristic
5300 Optical component for a LIDAR Sensor System
5302 Bottom mirror
5304 Top mirror
5400 Cross sectional view of a sensor for a LIDAR Sensor System
5500 Top view of a sensor for a LIDAR Sensor System
5502 Red pixel filter portion
5504 Green pixel filter portion
5506 Blue pixel filter portion
5600 Top view of a sensor for a LIDAR Sensor System
5602 Rectangle
5700 Top view of a sensor for a LIDAR Sensor System
5702 Red pixel filter portion
5704 Yellow or orange pixel filter portion
5800 Optical component for a LIDAR Sensor System
5802 Reflector layer
5804 Fourth arrow
5806 Fifth arrow
5808 Micromechanically defined IR absorber structure

5900 LIDAR Sensor System
5902 Laser source
5904 Laser path
5906 First optics arrangement
5908 Second optics arrangement
5910 Spatial light modulator
5912 Field of view
5914 Spatial light modulator controller
5916 LIDAR system sensor
5918 Reflected laser
6000 Optical power grid
6002 Optical power gradient
6004 x-axis distance
6006 y-axis distance
6008 Low optical power pixel
6010 High optical power pixel
6100 Liquid crystal device
6102 Liquid crystals
6104 Optical axis
6106 Applied voltage
6200 Liquid crystal device
6202 Polarization filter
6204 Initial point
6206 Liquid crystal
6208 Endpoint
6210 Liquid crystal orientations
6302 Non-normalized optical power distribution
6304 Normalized optical power distribution
6306 Attenuated optical power zone
6308 Attenuation threshold
6310 Sub-threshold optical power
6312 Angle axis
6314 Optical power axis
6402 Unshaped optical power distribution
6404 Shaped optical power distribution
6406 Low power region
6408 High power region
6410 Shaped portion
6412 Un-shaped portion
6502 LIDAR vehicle
6504 Distance
6600 LIDAR field of view
6602 First vehicle
6604 Second vehicle
6606 Bystander
6608 Delineation
6610 Attenuation zone
6612 Spatial light modulator matrix
6702 Environmental light
6704 Plane-polarized light
6706 Horizontal optical axis
6708 Vertical optical axis
6710 Angled optical axis
6712 Angled optical axis
6714 Reflection point
6800 Portion of LIDAR Sensor System
6802 Emitted light beam
6804 Transmitter optics
6806 Scanned column target object
6808 Reflected light beam
6810 Receiver photo diode array
6812 Scanned rows target object
6814 Multiplexer
6816 Photo diode signal
6900 Portion of LIDAR Sensor System
6902 Crossing connection
6904 Detector connecting structure
6906 Arrow
7000 Portion of LIDAR Sensor System
7002 Receiver photo diode array
7004 Detector connecting structures
7006 First connection network
7008 Second connection network
7010 Multiplexer input
7012 Selected analog photo current signal
7014 Further arrow
7016 Diode group
7100 Portion of LIDAR Sensor System
7200 Chip-on-board photo diode array
7202 Substrate
7204 Carrier
7206 Wire bonds
7208 Carrier contact structure
7300 Portion of LIDAR Sensor System
7302 Camera detects color-coded pixels
7304 Color-coded pixel sensor signals
7306 Camera-internal pixel analysis component
7308 Camera analysis result
7310 LIDAR sensor signals
7312 LIDAR data analysis
7314 LIDAR analysis result
7316 LIDAR-internal data fusion and analysis component
7318 Data fusion analysis result
7400 Portion of LIDAR Sensor System
7402 Analysis component Data Processing and Analysis Device
7500 Portion of LIDAR Sensor System
7502 Block
7504 Block
7600 Portion of LIDAR Sensor System
7602 First laser source
7604 Second laser source
7606 First laser beam
7608 Second laser beam
7610 Beam steering unit
7612 FOV
7614 First scanned laser beam
7616 First object
7618 First reflected laser beam
7620 Second scanned laser beam
7622 Second object
7624 Second reflected laser beam
7626 Collection lens
7628 Optical component
7630 First sensor
7632 Second sensor
7700 Portion of LIDAR Sensor System
7702 One or more dichroic mirrors
7704 First of two parallel laser beams
7706 Second of two parallel laser beams
7800 Portion of LIDAR Sensor System
7802 Beam steering device
7804 Deflected laser beam
7806 Target object
7808 Reflected laser beam
7810 Field of View
7812 Sensing region of meta-lens
7814 Sensor area of sensor
7900 Setup of dual lens with two meta-surfaces
7902 Double-sided meta-lens
7904 Carrier
7906 First surface of carrier
7908 Second surface of carrier
7910 First received light rays

7912 Second received light rays
7914 Focal plane
7916 Focal point
7918 First diffracted light rays
7920 Second diffracted light rays
7922 Third diffracted light rays
7924 Fourth diffracted light rays
7928 Entry aperture D
7930 Graph
7932 z-direction
7934 x-direction
7936 Optical axis
8000 Portion of LIDAR Sensor System
8002 Laser beam
8004 Laser beam
8006 Reflected laser beam
8008 Reflected laser beam
8010 Second lines
8100 Vehicle
8102 Vehicle body
8104 Wheel
8106 Side window
8108 One or more light sources
8110 One or more light emitting surface structures
8112 Outer surface of vehicle body
8202 Front window
8204 Rear window
8206 Vehicle dashboard
8208 One or more processors and/or one or more controllers
8300 Flow diagram
8302 Partial process
8304 Partial process
8306 Partial process
8308 Partial process
8310 Partial process
8312 Partial process
8314 Partial process
8400 Flow diagram
8402 Partial process
8404 Partial process
8406 Partial process
8408 Partial process
8500 System
8502 Vehicle
8504 Vehicle sensor system
8506 Monitoring device
8508 First communication unit
8510 Second communication unit
8512 External object
8600 Method
8602 Method step
8604 Method step
8606 Method step
8608 Method step
8700 Method
8702 Method step
8704 Method step
8706 Method step
8708 Method step
8710 Method step
8712 Method step
8800 Method
8802 Method step
8804 Method step
8806 Method step
8808 Method step
8810 Method step

8900 Optical component
8902 Optical element
8904 First main surface optical element
8906 Second main surface optical element
8908 First lens array
8910 Second lens array
8912 Arrow
8914 Optical lenslets
9000 Top view First LIDAR Sensing System
9002 Fast axis collimation lens
9004 Double-sided micro-lens array
9006 Slow axis collimation lens
9008 Scanning arrow
9010 Light beam
9012 Top view portion double-sided micro-lens array
9100 Side view First LIDAR Sensing System
9102 First segment
9104 Second segment
9106 Third segment
9108 Fourth segment
9110 Micro-lens
9112 First input group micro-lenses
9114 First output group micro-lenses
9116 Second input group micro-lenses
9118 Second output group micro-lenses
9120 Common substrate
9122 Pitch lenses
9124 Shift between input lens and corresponding output lens
9200 Side view of portion of First LIDAR Sensing System
9202 Vertical field of view
9204 Segment vertical field of view
9206 Segment vertical field of view
9208 Segment vertical field of view
9210 Segment vertical field of view
9212 FOV
9302 Intensity distribution
9304 Intensity distribution
9400 Side view of portion of First LIDAR Sensing System
9402 Segment vertical field of view
9404 Segment vertical field of view
9406 Segment vertical field of view
9408 Segment vertical field of view
9410 Changed segment vertical field of view
9412 Changed segment vertical field of view
9414 Changed segment vertical field of view
9416 Changed segment vertical field of view
9500 First example single-sided MLA
9502 Exit light beam
9510 Second example single-sided MLA
9512 Convex input surface
9514 Divergent light beam
9520 Third example single-sided MLA
9522 Fresnel lens surface
9600 First example double-sided MLA with a plurality of pieces
9602 First piece double-sided MLA
9604 Light entry side first piece
9606 Flat surface first piece
9608 Second piece double-sided MLA
9610 Flat surface second piece
9650 First example double-sided MLA with a plurality of pieces
9652 First piece double-sided MLA
9654 Light entry side first piece
9656 Flat surface first piece
9658 Second piece double-sided MLA
9660 Flat surface second piece

9662 Shift
9700 Portion of Second LIDAR Sensing System
9702 Input segment
9704 Input segment
9706 Input segment
9708 Input segment
9710 APD array
9712 Multiplexer
9714 TIA
9716 ADC
9800 Sensor system
9802 Optics arrangement
**9802*a*** First portion of the optics arrangement
**9802*b*** Second portion of the optics arrangement
**9802*s*** Surface of the optics arrangement
9804 Object
9806 Object
9808 Optical axis
9810 Effective aperture
9812 Effective aperture
9814 Light rays
9816 Light rays
9818 Sensor pixel
9820 Sensor pixel
9852 Direction
9854 Direction
9856 Direction
9900 Sensor system
9902 Total internal reflectance lens
**9902*a*** First portion of the total internal reflectance lens
**9902*b*** Second portion of the total internal reflectance lens
9908 Optical axis
10000 Sensor system
10002 Compound parabolic concentrator
10008 Optical axis
10010 Optical element
10100 Sensor system
10102 Optics arrangement
10104 Object
10106 Object
10108 Liquid lens
**10108*m*** Membrane of the liquid lens
10110 Liquid lens
**10110*m*** Membrane of the liquid lens
10202 Pixel
10204 Pixel region
10206 Pixel
10208 Pixel region
10210 Pixel
10212 Pixel region
10214 Object pixel
10216 Optical axis
10218 Optical element
10300 System
10302 Optical device
10304 Optics arrangement
10306 Field of view
10308 Light beam
10310 Beam steering unit
10312 Emitted light
10314 Vertical light line
10316 Ambient light source
10352 Direction
10354 Direction
10356 Direction
10402 Carrier
**10402*s*** Carrier surface
10404 Mirror
10406 LIDAR light
**10406*a*** First LIDAR light
**10406*b*** Second LIDAR light
10408 Light from ambient source
10410 Tracks
10412 Optical element
10502 Reflecting surface
10504 Axis of rotation
10602 Rotating component
10702 Sensor device
10704 Sensor pixel
10800 System
10802 Waveguiding component
10804 Receiver optics arrangement
10806 Field of view
10808 Sensor pixel
10810 Sensor surface
10852 Direction
10854 Direction
10856 Direction
10902 Optical fiber
**10902*i*** Input port
**10902*o*** Output port
10904 Inset
10906 Lens
11002 Curved surface
11004 Ball lens
11006 Angular segment of the field of view
11102 Waveguide block
11104 Waveguide
**11104*i*** Input port
**11104*o*** Output port
11202 Substrate
**11202*s*** First layer
**11202*i*** Second layer
11204 Waveguide
11206 Light coupler
11208 Detection region
11210 Coupling region
11302 Doped segment
11304 Out-coupling segment
11402 Coupling element
11404 Laser source
11406 Controller
11408 Filter
11502 Waveguide
11504 Waveguide
**11506*a*** First coupling region
**11506*b*** Second coupling region
**11506*c*** Third coupling region
11508 Array of lenses
11510 Controller
11600 LIDAR System/LIDAR Sensor System
11602 Optics arrangement
11604 Field of view
11606 Optical axis
11608 Light beam
11610 Scanning unit
11612 Emitted light signal
**11612*r*** Reflected light signal
11614 Object
11616 Object
11618 Stray light
11620 Sensor pixel
11620-1 First sensor pixel
11620-2 Second sensor pixel

11622-1 First sensor pixel signal
11622-2 Second sensor pixel signal
11624 Pixel signal selection circuit
11652 Direction
11654 Direction
11656 Direction
11702 Comparator stage
11702-1 First comparator circuit
11702-10 First comparator output
11702-2 Second comparator circuit
**11702-2*o*** Second comparator output
11704 Converter stage
11704-1 First time-to-digital converter
11704-10 First converter output
11704-2 Second time-to-digital converter
**11704-2*o*** Second converter output
11706 Processor
11708-1 First peak detector circuit
11708-2 Second peak detector circuit
11710-1 First analog-to-digital converter
11710-2 Second analog-to-digital converter
11802-1 First sensor pixel signal pulse
11802-2 Second sensor pixel signal pulse
11802-3 Third sensor pixel signal pulse
11802-4 Fourth sensor pixel signal pulse
11802-5 Fifth sensor pixel signal pulse
11900 Chart
12000 LIDAR system
12002 Optics arrangement
12004 Field of view
12006 Optical axis
12008 Light beam
12010 Scanning unit
12012 Emitted light
12052 Direction
12054 Direction
12056 Direction
12102 Sensor pixel
12104 First region
12106 Second region
12108 Signal line
12202 Sensor pixel
12204 First array region
12206 Second array region
12208 Signal line
12300 Vehicle
12302 Sensor systems
12304 Energy source
12306 Energy source management system
12308 One or more processors
12310 Vehicle control system
12312 Memory
12314 Sensor Function Matrix database
12316 Memory
12318 Vehicle devices
12320 Vehicle-external device
12322 Communication interface
12400 Method
12402 Method step
12404 Method step
12406 Method step
12502 Position module/GPS module
12504 Logical Coherence Module
12506 Global Setting Matrix
12602 Input provider
12604 Input signal
12606 Sensor data
12608 Sensor data
12610 Coherence data
12612 Input data
12700 Method
12702 Method step
12704 Method step
12706 Method step
12708 Method step
12800 Method
12802 Method step
12804 Method step
12806 Method step
12902 Position module/GPS module
12904 Traffic map provider
**12904*a*** Traffic map
13002 Position data/GPS data
13004 Input data/Traffic map data
13006 Sensor instructions/Vehicle instructions
13008 Sensor data
13010 Transmitted sensor data
13012 Updated traffic map
13100 Frame
13102 Preamble frame portion
13104 Header frame portion
13106 Payload frame portion
13108 Footer frame portion
13200 Time-domain signal
13202-1 Pulse
13202-2 Pulse
13300 Ranging system
13302 Memory
13304 Reference light signal sequence frame
13306 Symbol code
13308 Signal generator
13310 Signal sequence frame
13312 Light source controller
13314 Light signal sequence frame
13314-1 Light signal sequence frame
13314-2 Light signal sequence frame
13314-3 Light signal sequence frame
13314-4 Light signal sequence frame
**13314*r*** Received light signal sequence frame
**13314*r*-1** Received light signal sequence frame
**13314*r*-2** Received light signal sequence frame
13316 Light signal sequence
13316-1 Light signal sequence
13316-2 Light signal sequence
**13316*r*** Received light signal sequence
**13316*r*-1** Received light signal sequence
**13316*r*-2** Received light signal sequence
13318 Correlation receiver
13320 Correlation result output
13322 Correlation result frame
13324 Processor
13326 Sensor device/Vehicle
13328 Object/Tree
13330 Sensor device/Vehicle
13400 Ranging system
13402 Init register
13404 Tx Buffer
13406 Reference clock
13408 Tx Block
13410 Pulse shaping stage
13412 Driver
13414 Light emitter
13416 Rx Block
13418 Detector

13420 Transimpedance amplifier
13422 Analog-to-digital converter
13424 Rx Buffer
13426 Correlation receiver
13428 Rx Block
13430 Tx Sample Buffer
13432 Peak detection system
13434 Correlation output
13502-1 Tx Buffer
13502-2 Tx Buffer
13502-3 Tx Buffer
13504-1 Correlation receiver
13504-2 Correlation receiver
13504-3 Correlation receiver
**13504-*n*** Correlation receiver
13506-1 Correlation output
13506-2 Correlation output
13506-3 Correlation output
13508 Codebook
13602 Indicator vector
13602-1 Indicator vector
13602-2 Indicator vector
**13602-2*c*** Circularly shifted indicator vector
**13602-2*s*** Shifted indicator vector
13604 Pulse sequence
13700 Algorithm
13702 Algorithm step
13704 Algorithm step
13706 Algorithm step
13708 Algorithm step
13710 Algorithm step
13712 Algorithm step
13714 Algorithm step
13716 Algorithm step
13718 Algorithm step
13720 Algorithm step
13800 Ranging system
13802 Processor
13804 Light source controller
13806 Frame consistency code generation stage
13808 Data buffer
13810 Frame consistency code generator
13900 Frame
**13900*p*** PHY frame
**13900*m*** MAC frame
13900-1 First frame section
13900-2 Second frame section
13902 Preamble frame portion
**13902*p*** PHY Preamble frame portion
13904 Header frame portion
**13904*p*** PHY Header frame portion
**13904*m*** MAC Header frame portion
13906 Payload frame portion
**13906*p*** PHY Payload frame portion
**13906*m*** MAC Payload frame portion
13908 Footer frame portion
**13908*p*** PHY Footer frame portion
**13908*m*** MAC Footer frame portion
13910 Input data
13912 Mapped input data
13914 Mapped consistency code
14002 Light signal sequence frame
14002-1 Light signal sequence frame
14002-2 Light signal sequence frame
14002-3 Light signal sequence frame
14002-4 Light signal sequence frame
14004-1 Light pulse

14004-2 Light pulse
14102 Graph
14104 Flow diagram
14106 Graph
14108 Flow diagram
14110 Graph
14112 Flow diagram
14114 Graph
14116 Flow diagram
14202 Graph
14204 Flow diagram
14302 Flow diagram
14304 Flow diagram
14402 Flow diagram
14500 Ranging system
14502 Emitter side
14504 Receiver side
14506 Light source controller
14508 Light pulse
14510 Signal modulator
14512 Light pulse
14514 Processor
14516 Graph
14518 Waveform
14520 Waveform
14522 Waveform
14524 Waveform
14526 Communication system
14528 Radio communication device
14530 Data encoder
14532 Radio transmitter
14550 Laser diode
14552 Capacitor
**14552*a*** Capacitor
**14552*b*** Capacitor
**14552*c*** Capacitor
14554 Ground
14560 Controllable resistor
**14560*g*** Control input
14562 Transistor
**14562*g*** Gate terminal
**14562*s*** Source terminal
**14562*a*** Transistor
**14562*b*** Transistor
**14562*c*** Transistor
14564 Waveshape control
14570 Charging circuit
**14570*a*** Charging circuit
**14570*b*** Charging circuit
**14570*c*** Charging circuit
14572 Resistor
**14572*a*** Resistor
**14572*b*** Resistor
**14572*c*** Resistor
14574 Controllable DC source
**14574*a*** Controllable DC source
**14574*b*** Controllable DC source
**14574*c*** Controllable DC source
14600 System
14602 Vehicle
14604 Vehicle
14606 LIDAR trigger
14608 Pulse generator
14610 Laser
14612 Data bank
14614 Laser pulse
14616 Photodetector

14618 Demodulator
14620 Data
14622 Photodetector
14624 Demodulator
14626 Determined data
14702 Graph in the time-domain
14704 Waveform
14706 Waveform
14708 Waveform
14710 Waveform
14712 Graph in the frequency-domain
14714 Table
14716 Graph in the time-domain
14718 Waveform
14720 Waveform
14722 Waveform
14724 Waveform
14726 Graph in the frequency-domain
14728 Table
14730 Graph
14732 Waveform
14732-1 Waveform with 0% time shift
14732-2 Waveform with 40% time shift
14734 Waveform
14736 Waveform
14738 Waveform
14740 Waveform
14742 Waveform
14744 Graph
14746 Table
14802 Graph in the time-domain
14804 Oscilloscope image
14806 Graph in the frequency-domain
14808 Graph in the frequency-domain
14810 Table
14902 Graph in the time-domain
14904 Oscilloscope image
14906 Graph in the frequency-domain
14908 Graph
14910 Gaussian fit
14912 Gaussian fit
14914 Graph
15000 LIDAR system
15002 Light emitting system
15004 Light emitter
15006 Optical component
15008 Light emitting controller
15010 Field of view/Field of emission
15012 Sensor pixel
15012-1 Sensor pixel
15012-2 Sensor pixel
15014 Object
15016-1 Graph
15016-2 Graph
15016-3 Graph
15016-4 Graph
15016-5 Graph
15016-6 Graph
15016-7 Graph
15018 Processor
15020 Analog-to-digital converter
15022 Detector optics
15024 Receiver optical component
15026 Controllable optical attenuator
15028 Thermal management circuit
15110-1 Field of view segment
15110-2 Field of view segment
15110-3 Field of view segment
15110-4 Field of view segment
15110-5 Field of view segment
15202-1 First group
15202-2 Second group
15202-3 Third group
15204 Overview shot
15204-1 First region of interest
15204-2 Second region of interest
15206-1 First bounding box
15206-2 Second bounding box
15208-1 First virtual emission pattern
15208-2 Second virtual emission pattern
15210-1 First emission pattern
15210-2 Second emission pattern
15210-3 Combined emission pattern
15300 Pattern adaptation algorithm
15302 Algorithm step
15304 Algorithm step
15306 Algorithm step
15308 Algorithm step
15310 Algorithm step
15312 Algorithm step
15314 Algorithm step
15316 Algorithm step
15318 Algorithm step
15320 Algorithm step
15400 LIDAR system
15402 Emitter array
15404 Driver
15406 Single-pixel detector
15408 Analog-to-digital converter
15410 Compressed sensing computational system
15410-1 Image reconstruction system
15410-2 Pattern generation system
15410-3 Pattern adaptation system
15412 Thermal management circuit
15500 Optical package
15502 Substrate
15504 Capacitor
15504*c* Capacitor
15506 Switch
15506*g* Control terminal
15506*s* Switch
15508 Laser diode
15508*d* Laser diode
15510 Common line
15512 Power source
15514 Processor
15602 Printed circuit board
15604 First electrical contact
15606 Second electrical contact
15608 Terminal
15700 Optical package
15702 Substrate
15702*i* Insulating layer
15702*s* Base
15704 Capacitor
15706 Switch
15708 Laser diode
15708*a* Active layer
15708*o* Optical structure
15710 Printed circuit board
15712 Bond wire
15714 Terminal
15716 Terminal
15718 Connector structure

15718*c* Electrical contact
15720 Bond wire
15722 Access line
15724 Through via
15800 LIDAR system
15802 Partial light source
15804 Light source group
15804-1 First light source group
15804-2 Second light source group
15806 Light source controller
15808 Photo diode
15810 Photo diode group
15810-1 First photo diode group
15810-2 Second photo diode group
15812 Processor
15814 Analog-to-digital converter
15852 Direction
15854 Direction
15856 Direction
16002 Object
16102-1 First light pulse
16102-2 Second light pulse
16104 Received light pulse
16104-1 First light pulse
16104-2 Second light pulse
16104-3 Third light pulse
16104-4 Fourth light pulse
16200 LIDAR system
16202 Processor
16204 Sensor data representation
16204-1 First region
16204-2 Second region
16252 Direction
16254 Direction
16256 Direction
16302-1 Sensor data representation
16302-2 Sensor data representation
16302-3 Sensor data representation
16302-4 Sensor data representation
16304-1 High-resolution zone
16304-2 Low-resolution zone
16304-3 High-resolution zone
16304-4 Low-resolution zone
16306 Object/Car
16308 Object/Bus
16310 Object/Pedestrian
16312 Object/Pedestrian
16314 Object/Bystander
16316 Vehicle
16318 Object/Vehicle
16320 Object/Vehicle
16322 Light ray
16324 Arrow
16326 Arrow
16400 Algorithm
16402 Algorithm step
16404 Algorithm step
16406 Algorithm step
16408 Algorithm step
16410 Algorithm step
16412 Algorithm step
16414 Algorithm step
16416 Algorithm step
16418 Algorithm step
16420 Algorithm step
16422 Algorithm step
16430 Algorithm
16432 Algorithm step
16434 Algorithm step
16436 Algorithm step
16438 Algorithm step
16440 Algorithm step
16442 Algorithm step
16444 Algorithm step
16446 Algorithm step
16448 Algorithm step
16450 Algorithm step
16452 Algorithm step
16454 Algorithm step
16456 Algorithm step
16458 Graph
16460 Graph
16462 Acceptance range
16462-1 First acceptance range
16462-2 Second acceptance range
Threshold low level
16462*h* Threshold high level
16464-1 First input
16464-2 Second input
16464-3 Third input
16500 Sensor system
16502 Sensor module
16502*b* Sensor module
16504 Sensor
16504*b* Sensor
16506 Data compression module
16508 Memory
16510 Bidirectional communication interface
16510*t* Transmitter
16510*r* Receiver
16512 Processor
16514 Communication interfaces
16514*a* Global Positioning System interface
16514*b* Vehicle-to-Vehicle communication interface
16514*c* Vehicle-to-Infrastructure communication interface
16516 Data compression module
16518 Memory controller
16600 Sensory system
16602 Sensor module
16604 Sensor
16606 Compression module
16608 Memory
16610 Bidirectional communication interface
16610*s* Sender and receiver module
16610*v* Sender and receiver module
16612 Fusion box
16614 Communication interfaces
16616 Compression module
16700 Sensor system
16702 Sensor module
16702*b* Sensor module
16704 Sensor
16704*b* Sensor
16706 Data compression module
16708 Memory
16710 Bidirectional communication interface
16710*t* Transmitter
16710*r* Receiver
16712 Communication module
16714 Processor
16716 Communication interfaces
16716*a* Global Positioning System interface
16716*b* Vehicle-to-Vehicle communication interface
16716*c* Vehicle-to-Infrastructure communication interface

16718 Processor
16718*b* Processor
16800 Sensory system
16802 Sensor module
16802*b* Sensor module
16804 Sensor
16804-1 Sensor
16804-2 Sensor
16804-3 Sensor
16806 Compression module
16808 Memory
16810 Bidirectional communication interface
16812*s* Sender and receiver module
16812*v* Sender and receiver module
16814 Fusion box
16816 Communication interfaces
16818-1 Processor
16818-2 Processor
16818-3 Processor
16820 Vehicle electrical control system
16900 Sensor device
16902 LIDAR system
16904 Field of view
16906 Optical sensor array
16908 Camera
16910 Infra-red filter
16912 Shutter
16914 Processor
16916 Emitted light
16918 Detected light
16918-1 Detected light
16918-2 Detected light
16918-3 Detected light
16920 Detected image
16920-1 Detected image
16920-2 Detected image
16920-3 Detected image
16920-4 Detected image
16922 Graph
16952 Direction
16954 Direction
16956 Direction
17000 Optics arrangement
17002 Collimator Lens
17004*i* Input light beam
17004*o* Output light beam
17004*r* Redirected light beam
17006 Actuator
17008 Optical axis of the optics arrangement
170010 Field of emission
17052 First direction
17054 Second direction
17056 Third direction
17102 Correction lens
17102*s* Lens surface
17104 Collimator lens
17202 Multi-lens array
17204 Graph
17204*a* First axis
17204*d* Curve
17204*i* Second axis
17206 Diffusive element
17208 Graph
17208*a* First axis
17208*d* Curve
17208*i* Second axis
17210 Liquid crystal polarization grating

17300 Illumination and sensing system
17302 LIDAR system
17304 Emitter optics arrangement
17306 Receiver optics arrangement
17306-1 Optical component
17306-2 Optical component
17306-3 Optical component
17306-4 Optical component
17308 Light source
17310 Light emission controller
17312 Cooling element
17314 Graph
17314*t* First axis
17314*p* Second axis
17314-1 LIDAR power
17314-2 Illumination power
17314-3 Total power
17316-1 First time window
17316-2 Second time window
17316-3 Third time window
17316-4 Fourth time window
17316-5 Fifth time window
17316-6 Sixth time window
17316-7 Seventh time window
17316-8 Eighth time window
17400 Illumination and sensing system
17402 LIDAR system
17404 Emitter optics arrangement
17406 Receiver optics arrangement
17406-2 Receiver optics arrangement
17408 Lighting device
17410 Heatsink
17410-2 Heatsink
17412 Scanning element
17500 Vehicle information and control system
17502 Communication module
17504 Communication module
17506 Communication module
17508 Power management module
17510 Vehicle control module
17512 Headlight control module
17600 LIDAR system
17602 One or more processors
17064 Analog-to-digital converter
17700 Processing entity
17702 Graph
17702*s* First axis
17702*t* Second axis
17704 Serial signal
17704-1 First event
17704-2 Second event
17706 Serial-to-parallel conversion stage
17706*g* Load gate
17708 Buffer
17708-1 First event signal vector
17708-2 Second event signal vector
17710 Trigger signal
17712 Event time detection stage
17714 Signal feature extraction stage
17714-1 Event signal vector extraction stage
17714-2 Feature extraction stage
17716 Output
17730 Further processing entity
17732 Event trigger stage
17734 Buffer
17736 Trigger signal
17738 Signal feature extraction stage

17740 Output
17742 Load gate
17802 Table of learning vectors
17802-1 First learning vector
17802-2 Second learning vector
17802-3 Third learning vector
17802-4 Fourth learning vector
17802-5 Fifth learning vector
17802-6 Sixth learning vector
**17802*v*** Vector index
17804-1 First graph associated with the first learning vector
17804-2 Second graph associated with the second learning vector
17804-3 Third graph associated with the third learning vector
17804-4 Fourth graph associated with the fourth learning vector
17804-5 Fifth graph associated with the fifth learning vector
17804-6 Sixth graph associated with the sixth learning vector
**17804*s*** First axis
**17804*t*** Second axis
17806-1 Curve associated with the first learning vector
17806-2 Curve associated with the second learning vector
17806-3 Curve associated with the third learning vector
17806-4 Curve associated with the fourth learning vector
17806-5 Curve associated with the fifth learning vector
17806-6 Curve associated with the sixth learning vector
17902 Event signal vector
**17902*v*** Vector index
17904 Graph associated with the event signal vector
**17904*s*** First axis
**17904*t*** Second axis
**17904*v*** Curve associated with the event signal vector
17906 Graph associated with the reconstructed event signal vector
**17906*r*** Curve associated with the reconstructed event signal vector
**17906*s*** First axis
**17906*t*** Second axis
**17906*v*** Curve associated with the original event signal vector
17908 Graph associated with the distance spectrum vector
**17908*e*** First axis
**17908*f*** Data points associated with the distance spectrum vector
**17908*m*** Second axis
17910 Graph associated with the reconstructed event signal vector
**17910*r*** Curve associated with the reconstructed event signal vector
**17910*s*** First axis
**17910*t*** Second axis
**17910*v*** Curve associated with the original event signal vector
18002 Deviation matrix
**18002*c*** Column index
**18002*r*** Row index
18004-1 First transformed learning vector
18004-2 Second transformed learning vector
18004-3 Third transformed learning vector
18004-4 Fourth transformed learning vector
18004-5 Fifth transformed learning vector
18004-6 Sixth transformed learning vector
18006-1 First graph associated with the first transformed learning vector
18006-2 Second graph associated with the second transformed learning vector
18006-3 Third graph associated with the third transformed learning vector
18006-4 Fourth graph associated with the fourth transformed learning vector
18006-5 Fifth graph associated with the fifth transformed learning vector
18006-6 Sixth graph associated with the sixth transformed learning vector
**18006*s*** First axis
**18006*t*** Second axis
18008-1 Curve associated with the first transformed learning vector
18008-2 Curve associated with the second transformed learning vector
18008-3 Curve associated with the third transformed learning vector
18008-4 Curve associated with the fourth transformed learning vector
18008-5 Curve associated with the fifth transformed learning vector
18008-6 Curve associated with the sixth transformed learning vector
18102 Graph associated with an event signal vector
**18102*s*** First axis
**18102*t*** Second axis
**18102*v*** Curve associated with an event signal vector
18104 Graph associated with the feature vector
**18104*e*** First axis
**18104*f*** Data points
**18104*m*** Second axis
18106 Graph associated with the reconstructed event signal vector
**18106*r*** Curve associated with the reconstructed event signal vector
**18106*s*** First axis
**18106*t*** Second axis
**18106*v*** Curve associated with the original event signal vector
18200 Communication system
18202 First vehicle
18204 Second vehicle
18206 First antenna
18208 Second antenna
18210 Mobile radio communication core network
18212 First communication connection
18214 Second communication connection
18300 Communication system
18302 Vehicle
18304 Traffic infrastructure
18306 Antenna
18308 Antenna
18310 Mobile radio communication core network
18312 First communication connection
18314 Second communication connection
18400 Message flow diagram
18402 Parking notification message
18404 Confirmation message
18406 OOB challenge message
18408 Authentication message
18410 Message verification process
18412 Finished message
18500 Flow diagram
18502 Start
18504 Process
18506 Process 18508 Process
18510 Process
18512 Process
18514 Process
18516 Process
18518 Process
18520 Process
18600 Message flow diagram
18602 Parking notification message
18604 Confirmation message
18606 OOB challenge A message
18608 OOB challenge B message 18608
18610 First authentication message A
18612 First authentication message A verification
18614 Second authentication message B
18616 Second authentication message B verification
18700 Service scenario
18702 Vehicle platoon
18704 Leader vehicle
18706 Second vehicle
18708 Third vehicle
18710 First LIDAR-based OOB communication connection
18712 Second LIDAR-based OOB communication connection
18714 Joiner vehicle
18716 Mobile radio in-band communication channel
18718 Third LIDAR-based OOB communication connection
18750 Message flow diagram
18752 Platooning joining notification message
18754 Confirmation message
18756 First OOB challenge A message
18758 First forwarding message
18760 Second forwarding message
18762 Second OOB challenge B message
18764 Third forwarding message
18766 Fourth forwarding message
18768 First authentication message A
18770 First authentication message A verification process
18772 Second authentication message B
18774 Second authentication message B verification process
18776 Finished message

What is claimed is:

1. An optical component for a LIDAR Sensor System, the optical component comprising:

an optical element having a first main surface and a second main surface opposite to the first main surface;

a first curved array of curved first lenses formed on the first main surface; and/or a second curved array of curved second lenses formed on the second main surface, wherein the first curved array is curved in a first direction of the LIDAR Sensor System and wherein the curved first lenses of the first curved array are curved in a second direction perpendicular to the first direction of the LIDAR Sensor System.

2. The optical component according to claim 1, wherein the first curved array is curved in a scanning direction of the LIDAR Sensor System.

3. The optical component according to claim 1, wherein the first curved array comprises a first micro-lens array; and/or wherein the second curved array comprises a second micro-lens array.

4. The optical component according to claim 1, wherein the first curved array comprises a first plurality of cylindrical lenslets arranged along a scanning direction of the LIDAR Sensor System; and/or wherein the second curved array comprises a second plurality of cylindrical lenslets arranged along the scanning direction of the LIDAR Sensor System.

5. The optical component according to claim 1, wherein at least some of the second lenses have the same pitch along a direction perpendicular to a scanning direction of the LIDAR Sensor System with respect to at least some of the first lenses.

6. The optical component according to claim 1, wherein the first lenses are grouped into a plurality of first groups along a predefined direction;

wherein the second lenses are grouped into a plurality of second groups along the predefined direction.

7. The optical component according to claim 1, wherein at least some of the second lenses are shifted along a direction perpendicular to a scanning direction of the LIDAR Sensor System with respect to at least some of the first lenses.

8. The optical component according to claim 6, wherein at least some of the second lenses of at least one group of the plurality of second groups are shifted along a direction perpendicular to a scanning direction of the LIDAR Sensor System with respect to at least some of the first lenses of at least one group of the plurality of first groups.

9. An optical component for a LIDAR Sensor System, the optical component comprising:

an optical element having a first main surface and a second main surface opposite to the first main surface;

a first array of micro-lenses formed on the first main surface; and a second array of micro-lenses formed on the second main surface, wherein the optical element has a curved shape in a scanning direction of the LIDAR Sensor System, and wherein the optical element also has a curved shape in a direction perpendicular to the scanning direction of the LIDAR Sensor System.

10. The optical component according to claim 9, wherein the first micro-lens array comprises a first plurality of cylindrical lenslets arranged along the scanning direction of the LIDAR Sensor System; and/or wherein the second micro-lens array comprises a second plurality of cylindrical lenslets arranged along the scanning direction of the LIDAR Sensor System.

11. The optical component according to claim 9, wherein the first micro-lens array comprises a plurality of first lenses;

wherein the second micro-lens array comprises a plurality of second lenses; and wherein at least some of the second lenses have the same pitch along a direction perpendicular to the scanning direction of the LIDAR Sensor System with respect to at least some of the first lenses.

12. The optical component according to claim 9, wherein the first micro-lens array comprises a first plurality of lenses which are grouped into a plurality of first groups along a predefined direction; and/or wherein the second micro-lens array comprises a second plurality of lenses which are grouped into a plurality of second groups along the predefined direction.

13. The optical component according to claim 9, wherein the first micro-lens array comprises a plurality of first lenses;

wherein the second micro-lens array comprises a plurality of second lenses; and wherein at least some of the second lenses are shifted along a direction perpendicular to the scanning direction of the LIDAR Sensor System with respect to at least some of the first lenses.

14. The optical component according to claim 12, wherein at least some of the second lenses of at least one group of the plurality of second groups are shifted along a direction perpendicular to the scanning direction of the LIDAR Sensor System with respect to at least some of the first lenses of at least one group of the plurality of first groups.

15. A LIDAR Sensor System, comprising:

an optical component for a LIDAR Sensor System, the optical component comprising:

an optical element having a first main surface and a second main surface opposite to the first main surface;

a first lens array formed on the first main surface; and/or a second lens array formed on the second main surface;

wherein the optical element has a curved shape in a first direction of the LIDAR Sensor System; and a light source configured to emit light to generate a projected line in a field-of-view of the LIDAR Sensor System;

wherein a projected line of light emitted by the light source comprises a plurality of line segments, wherein the projected line is perpendicular to a scanning direction of the LIDAR Sensor System;

wherein the first lens array comprises a first plurality of lenses which are grouped into a plurality of first groups along a predefined direction;

wherein the second lens array comprises a second plurality of lenses which are grouped into a plurality of second groups along the predefined direction;

wherein each segment is associated with at least one first group of the plurality of first groups and with at least one second group of the plurality of second groups.

16. The LIDAR Sensor System according to claim 15, wherein the light source comprises a plurality of laser light sources.

17. The LIDAR Sensor System according to claim 16, wherein the plurality of laser light sources comprises a plurality of laser diodes.

18. The LIDAR Sensor System according to claim 17, wherein the plurality of laser diodes comprises a plurality of edge-emitting laser diodes.

19. The LIDAR Sensor System according to claim 17, wherein the plurality of laser diodes comprises a plurality of vertical-cavity surface-emitting laser diodes.

20. The LIDAR Sensor System according to claim 15, further comprising:

a scanning micro-electrical mechanical system (MEMS) arranged between the light source and the optical component.

21. The LIDAR Sensor System according to claim 20, further comprising:

a fast axis collimation lens arranged between the light source and the MEMS.

22. The LIDAR Sensor System according to claim 20, wherein the optical component has a shape having a rotational symmetry;

wherein the MEMS and the optical component are arranged with respect to each other so that the axis of rotation of the MEMS is associated with the axis of a rotational symmetry of the optical component.

23. The LIDAR Sensor System according to claim 15, wherein the predefined direction is the vertical direction.

24. The LIDAR Sensor System according to claim 16, wherein at least one light source of the plurality of light sources is associated with at least one line segment of the plurality of line segments.

25. The optical component according to claim 1, wherein the first curved array has a different curved shape than the second curved array.

26. The LIDAR Sensor System according to claim 15, wherein at least one of the first lens array and the second lens array is a curved array.

* * * * *